US012310229B2

(12) United States Patent

Hwang et al.

(10) Patent No.: US 12,310,229 B2

(45) Date of Patent: *May 20, 2025

(54) ORGANOMETALLIC COMPOUND, ORGANIC LIGHT-EMITTING DEVICE INCLUDING ORGANOMETALLIC COMPOUND, AND ELECTRONIC APPARATUS INCLUDING ORGANIC LIGHT-EMITTING DEVICE

(71) Applicant: Samsung Electronics Co., Ltd., Suwon-si (KR)

(72) Inventors: Kyuyoung Hwang, Anyang-si (KR); Byungjoon Kang, Seoul (KR); Seungyeon Kwak, Suwon-si (KR); Sangdong Kim, Seongnam-si (KR); Banglin Lee, Suwon-si (KR); Jeoungin Yi, Seoul (KR); Byoungki Choi, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 778 days.

This patent is subject to a terminal disclaimer.

(21) Appl. No.: 17/325,811

(22) Filed: May 20, 2021

(65) Prior Publication Data

US 2023/0011568 A1 Jan. 12, 2023

(30) Foreign Application Priority Data

May 21, 2020 (KR) ........................ 10-2020-0060898
May 18, 2021 (KR) ........................ 10-2021-0064010

(51) Int. Cl.

*H10K 85/30* (2023.01)
*C07F 15/00* (2006.01)

(Continued)

(52) U.S. Cl.

CPC ....... *H10K 85/342* (2023.02); *C07F 15/0033* (2013.01); *C09K 11/06* (2013.01);

(Continued)

(58) Field of Classification Search

CPC .... H10K 85/342; H10K 85/361; H10K 85/40; H10K 50/17; H10K 50/16; H10K 50/18;

(Continued)

(56) References Cited

U.S. PATENT DOCUMENTS

| | | | |
|---|---|---|---|
| 11,758,803 | B2 | 9/2023 | Hwang et al. |
| 12,239,009 | B2 | 2/2025 | Lee et al. |

(Continued)

FOREIGN PATENT DOCUMENTS

| | | | |
|---|---|---|---|
| CN | 107759638 | A | 3/2018 |
| EP | 2730583 | A1 | 5/2014 |

(Continued)

OTHER PUBLICATIONS

Extended EP Search Report mailed Oct. 4, 2021 of EP Patent Application No. 21174468.5.

(Continued)

*Primary Examiner* — Shane Fang

(74) *Attorney, Agent, or Firm* — CANTOR COLBURN LLP

(57) ABSTRACT

An organometallic compound represented by Formula 1:

$$M(L_1)_{n1}(L_2)_{n2} \quad \text{Formula 1}$$

wherein, M is a transition metal, $L_1$ and $L_2$ are ligands as provided herein, n1 and n2 are each independently 1 or 2, the sum of n1 and n2 is 2 or 3, and $L_1$ is different from $L_2$.

19 Claims, 1 Drawing Sheet

(51) Int. Cl.

| | |
|---|---|
| ***C09K 11/06*** | (2006.01) |
| ***H10K 50/11*** | (2023.01) |
| ***H10K 50/15*** | (2023.01) |
| ***H10K 50/16*** | (2023.01) |
| ***H10K 50/17*** | (2023.01) |
| ***H10K 50/18*** | (2023.01) |
| ***H10K 85/40*** | (2023.01) |

(52) U.S. Cl.

CPC ........... *H10K 85/361* (2023.02); *H10K 85/40* (2023.02); *C07B 2200/05* (2013.01); *C09K 2211/1033* (2013.01); *C09K 2211/1037* (2013.01); *C09K 2211/185* (2013.01); *H10K 50/11* (2023.02); *H10K 50/15* (2023.02); *H10K 50/16* (2023.02); *H10K 50/17* (2023.02); *H10K 50/171* (2023.02); *H10K 50/18* (2023.02)

(58) Field of Classification Search

CPC ...... H10K 50/11; H10K 50/171; H10K 50/15; C07F 15/0033; C07F 15/06; C07F 9/587; C09K 11/06; C09K 2211/1033; C09K 2211/1037; C09K 2211/185; C09K 2211/1029; C09K 2211/1044; C09K 2211/187; C07B 2200/05

See application file for complete search history.

(56) References Cited

U.S. PATENT DOCUMENTS

2016/0093814 A1 3/2016 Hwang et al.
2016/0111644 A1* 4/2016 Cho .................... H10K 85/342 257/40
2016/0111663 A1* 4/2016 Kim .................... H10K 85/626 257/40
2016/0111665 A1* 4/2016 Kim .................... H10K 85/633 257/40
2016/0268519 A1* 9/2016 Choi .................. C07F 15/0033
2017/0346025 A1* 11/2017 Hwang ................ C07D 251/24
2018/0237463 A1 8/2018 Zeng et al.
2020/0161563 A1 5/2020 Jang et al.
2020/0181184 A1 6/2020 Hwang et al.
2020/0287144 A1 9/2020 Hwang et al.
2021/0155647 A1 5/2021 Lee et al.
2021/0391548 A1 12/2021 Hwang et al.

FOREIGN PATENT DOCUMENTS

EP 3026056 A1 6/2016
EP 3305796 A1 4/2018
EP 3705483 A1 9/2020
EP 3825320 A1 5/2021
JP 7100676 B2 7/2022
JP 7643851 B2 3/2025
KR 20170134035 A 12/2017
KR 1020180020878 A 2/2018
KR 1020190010350 A 1/2019
KR 1020190106807 A 9/2019
KR 1020200068447 A 6/2020
KR 1020200107830 A 9/2020
KR 1020210063747 A 6/2021
WO 2019132632 A1 7/2019
WO 2019154159 A1 8/2019

OTHER PUBLICATIONS

KR Office Action issued date May 17, 2023 of KR Patent Application No. 10-2021-0064010.
English Translation of Office Action dated Mar. 18, 2025, issued in corresponding JP Patent Application No. 2021-084824, 5 pp.
Office Action dated Mar. 18, 2025, issued in corresponding JP Patent Application No. 2021-084824, 5 pp.

* cited by examiner

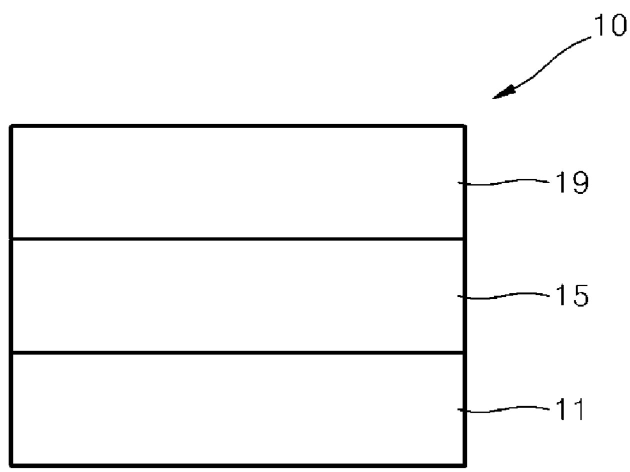
10
19
15
11

ORGANOMETALLIC COMPOUND, ORGANIC LIGHT-EMITTING DEVICE INCLUDING ORGANOMETALLIC COMPOUND, AND ELECTRONIC APPARATUS INCLUDING ORGANIC LIGHT-EMITTING DEVICE

CROSS-REFERENCE TO RELATED APPLICATION

This application claims priority to Korean Patent Application No. 10-2020-0060898, filed on May 21, 2020, and Korean Patent Application No. 10-2021-0064010, filed on May 18, 2021, both in the Korean Intellectual Property Office, and all benefits accruing therefrom under 35 U.S.C. § 119, the entire contents of which are incorporated herein by reference.

BACKGROUND

1. Field

The present disclosure relates to an organometallic compound, an organic light-emitting device including the organometallic compound, and an electronic apparatus including the organic light-emitting device.

2. Description of Related Art

Organic light-emitting devices (OLEDs) are self-emissive devices which produce full-color images. In addition, OLEDs have wide viewing angles and exhibit excellent driving voltage and response speed characteristics.

The structure of an OLED includes an anode, a cathode, and an organic layer located between the anode and the cathode, where the organic layer typically includes an emission layer. A hole transport region may be located between the anode and the emission layer, and an electron transport region may be located between the emission layer and the cathode. Holes provided from the anode may move toward the emission layer through the hole transport region, and electrons provided from the cathode may move toward the emission layer through the electron transport region. The holes and the electrons may recombine in the emission layer to produce excitons. These excitons transit from an excited state to a ground state to thereby generate light, for example, visible light.

SUMMARY

One or more aspects provide an organometallic compound, an organic light-emitting device including at least one of the organometallic compound, and an electronic apparatus including the organic light-emitting device.

Additional aspects will be set forth in part in the detailed description which follows and, in part, will be apparent from the detailed description, or may be learned by practice of the presented exemplary embodiments of the disclosure.

According an aspect of one or more embodiments, an organometallic compound is represented by Formula 1:

$$M(L_1)_{n1}(L_2)_{n2} \quad \text{Formula 1}$$

wherein, in Formula 1,

M may be a transition metal, $L_1$ may be a ligand represented by Formula 2A, $L_2$ may be a ligand represented by Formula 2B, n1 and n2 may each independently be 1 or 2, when n1 is 2, two $L_1$(s) may be identical to or different from each other, and when n2 is 2, two $L_2$(s) may be identical to or different from each other, the sum of n1 and n2 may be 2 or 3, $L_1$ may be different from $L_2$, Formula 2A

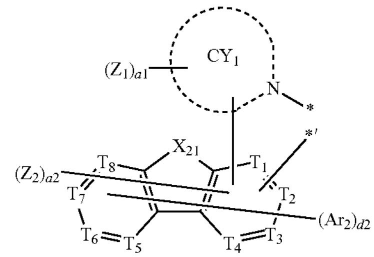

Formula 2B

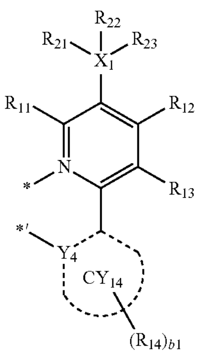

wherein, in Formulae 2A and 2B, $Y_4$ is C or N, $X_1$ is Si or Ge, $X_{21}$ is O, S, S(=O), N($Z_{29}$), C($Z_{29}$)($Z_{30}$), or Si($Z_{29}$)($Z_{30}$), $T_1$ to $T_4$ are each independently C, N, a carbon atom bound to ring $CY_1$, or a carbon atom bound to M in Formula 1, provided that one of $T_1$ to $T_4$ is a carbon atom bound to M in Formula 1, and another one of $T_1$ to $T_4$, which is not bound to M, is a carbon atom bound to ring $CY_1$, $T_5$ to $T_8$ are each independently C or N, a total number of N atoms among $T_1$ to $T_8$ is 0 or 1, ring $CY_1$ and ring $CY_{14}$ re each independently a $C_5$-$C_{30}$ carbocyclic group or a $C_1$-$C_{30}$ heterocyclic group, Are is a ring $CY_2$ unsubstituted or substituted with at least one $Z_0$, wherein ring $CY_2$ is an unsaturated $C_5$-$C_{39}$ carbocyclic group or an unsaturated $C_1$-$C_{30}$ heterocyclic group, $R_{21}$ to $R_{23}$ are each independently a $C_1$-$C_{60}$ alkyl group or a $C_6$-$C_{60}$ aryl group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_3$-$C_{10}$ cycloalkyl group, a phenyl group, or a combination thereof, $Z_0$, $Z_1$, $Z_2$, $Z_{29}$, $Z_{30}$, and $R_{11}$ to $R_{14}$ are each independently hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_7$-$C_{60}$ aryl alkyl group, a substituted or unsubstituted $C_6$-$C_{60}$ aryloxy group, a substituted or unsubstituted $C_8$-$C_{80}$ arylthio group, a substituted or unsubstituted $C_1$-$C_{60}$ heteroaryl group, a substituted or unsubstituted $C_2$-$C_{60}$ heteroaryl alkyl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$Ge(Q_3)(Q_4)(Q_5)$, —$B(Q_6)(Q_7)$, —$P(=O)(Q_8)(Q_9)$, or —$P(Q_8)(Q_9)$, d2 is an integer from 1 to 6, and when d2 is 2 or greater, at least two $Ar_2$(s) are identical to or different from each other, a1 and b1 re each independently an integer from 0 to 20, when a1 is 2 or greater, at least two $Z_1$(s) are identical to or different from each other, and when b1 is 2 or greater, at least two $R_{14}$(s) are identical to or different from each other, a2 is an integer from 0 to 5, and when a2 is 2 or greater, at least two $Z_2$(s) are identical to or different from each other, Condition 1 or Condition 2 is satisfied:

Condition 1

$X_1$ in Formula 2B is Si, $R_{12}$ in Formula 2B is not hydrogen or a methyl group, and each of $T_1$ to $T_8$ in Formula 2A is not N Condition 2 wherein, in Formula 2B, $R_{12}$ is hydrogen, or a group comprising 1 carbon atom at least two of $R_{21}$ to $R_{23}$ are optionally bound to each other to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, at least two of a plurality of $Z_1$(s) are optionally bound to each other to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, at least two of a plurality of $Z_2$(s) re optionally bound to each other to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, $R_{12}$ and $R_{13}$ are optionally bound to each other to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, at least two of a plurality of $R_{14}$(s) are optionally bound to each other to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, at least two of $Z_0$, $Z_1$, $Z_2$, $Z_{29}$, $Z_{30}$, and $R_{11}$ to $R_{14}$ are optionally bound to each other to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, $R_{10a}$ is understood by referring to the description of $R_{14}$ provided herein,

* and *' in Formulae 2A and 2B each indicate a binding site to M in Formula 1, and at least one substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_2$-$C_{10}$ heterocycloalkenyl group, the substituted $C_6$-$C_{60}$ aryl group, the substituted $C_7$-$C_{60}$ alkyl aryl group, the substituted $C_7$-$C_{60}$ aryl alkyl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkyl heteroaryl group, the substituted $C_2$-$C_{60}$ heteroaryl alkyl group, the substituted $C_1$-$C_{60}$ heteroaryloxy group, the substituted $C_1$-$C_{60}$ heteroarylthio group, the substituted monovalent non-aromatic condensed polycyclic group, and the substituted monovalent non-aromatic condensed heteropolycyclic group is:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group;

a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$Ge(Q_{13})(Q_{14})(Q_{15})$, —$B(Q_{16})(Q_{17})$, —$P(=O)(Q_{18})(Q_{19})$, —$P(Q_{18})(Q_{19})$, or a combination thereof;

a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, or a monovalent non-aromatic condensed heteropolycyclic group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_7$-$C_{60}$ alky aryl group, a $C_7$-$C_{60}$ aryl alkyl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_2$-$C_{60}$ heteroaryl alkyl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), —Ge($Q_{23}$)($Q_{24}$)($Q_{25}$), —B($Q_{26}$)($Q_{27}$), —P(=O)($Q_{28}$)($Q_{29}$), —P($Q_{28}$)($Q_{29}$), or a combination thereof;

—N($Q_{31}$)($Q_{32}$), —Si($Q_{33}$)($Q_{34}$)($Q_{35}$), —Ge($Q_{33}$)($Q_{34}$)($Q_{35}$), —B($Q_{36}$)($Q_{37}$), —P(=O)($Q_{38}$)($Q_{39}$), or —P($Q_{38}$)($Q_{39}$), or a combination thereof, wherein $Q_1$ to $Q_9$, $Q_{11}$ to $Q_{19}$, $Q_{21}$ to $Q_{29}$, and $Q_{31}$ to $Q_{39}$ are each independently hydrogen; deuterium; —F; —Cl; —Br; —I; a hydroxyl group; a cyano group; a nitro group; an amino group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group unsubstituted or substituted with deuterium, a $C_1$-$C_{60}$ alkyl group, a $C_6$-$C_{60}$ aryl group, or a combination thereof; a $C_2$-$C_{60}$ alkenyl group; a $C_2$-$C_{60}$ alkynyl group; a $C_1$-$C_{60}$ alkoxy group; a $C_1$-$C_{60}$ alkylthio group; a $C_3$-$C_{10}$ cycloalkyl group; a $C_1$-$C_{10}$ heterocycloalkyl group; a 03-$C_{10}$ cycloalkenyl group; a $C_2$-$C_{10}$ heterocycloalkenyl group; a $C_6$-$C_{60}$ aryl group unsubstituted or substituted with one or more of deuterium, a $C_1$-$C_{60}$ alkyl group, or a $C_6$-$C_{60}$ aryl group; a $C_6$-$C_{60}$ aryloxy group; a $C_6$-$C_{60}$ arylthio group; a $C_1$-$C_{60}$ heteroaryl group; a $C_1$-$C_{60}$ heteroaryloxy group; a $C_1$-$C_{60}$ heteroarylthio group; a monovalent non-aromatic condensed polycyclic group; or a monovalent non-aromatic condensed heteropolycyclic group.

According to an aspect of one or more embodiments, an organic light-emitting device may include a first electrode; a second electrode; and an organic layer located between the first electrode and the second electrode, wherein the organic layer may include an emission layer, and wherein the organic layer may include at least one organometallic compound described herein.

In one or more embodiments, the at least one organometallic compound is included in the emission layer of the organic layer. In one or more embodiments, the organometallic compound included in the emission layer may serve as a dopant.

According to another aspect of one or more embodiments, an electronic apparatus includes the organic light-emitting device.

BRIEF DESCRIPTION OF THE DRAWINGS

The above and other aspects, features, and advantages of one or more exemplary embodiments will be more apparent from the following detailed description taken in conjunction with the accompanying drawing, in which:

FIG. 1 is a schematic cross-sectional view of an organic light-emitting device according to one or more embodiments.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

The terminology used herein is for the purpose of describing one or more exemplary embodiments only and is not intended to be limiting. As used herein, the singular forms "a," "an," and "the" are intended to include the plural forms as well, unless the context clearly indicates otherwise. The term "or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

It will be understood that when an element is referred to as being "on" another element, it can be directly in contact with the other element or intervening elements may be present therebetween. In contrast, when an element is referred to as being "directly on" another element, there are no intervening elements present.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

An organometallic compound represented by Formula 1 is provided herein:

$$M(L_1)_{n1}(L_2)_{n2} \quad \text{Formula 1}$$

wherein, in Formula 1, M is a transition metal.

In one or more embodiments, M may be a first-row transition metal, a second-row transition metal, or a third-row transition metal.

In one or more embodiments, M may be iridium (Ir), platinum (Pt), osmium (Os), titanium (Ti), zirconium (Zr), hafnium (Hf), europium (Eu), terbium (Tb), thulium (Tm), or rhodium (Rh).

In one or more embodiments, M may be Ir, Pt, Os, or Rh.

In Formula 1, $L_1$ is a ligand represented by Formula 2A, n1 in Formula 1 indicates the number of $L_1$(s) in Formula 1, and n1 is 1 or 2. When n1 is 2, two $L_1$(s) are identical to or different from each other.

In Formula 1, $L_2$ is a ligand represented by Formula 2B, n2 in Formula 1 indicates the number of $L_2$(s) in Formula 1, and n2 is 1 or 2. When n2 is 2, two $L_2$(s) are identical to or different from each other.

Formula 2A

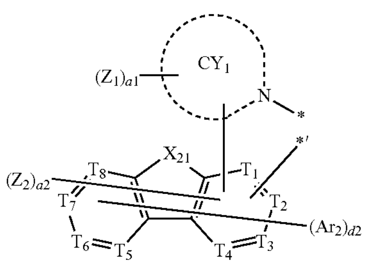

Formula 2B

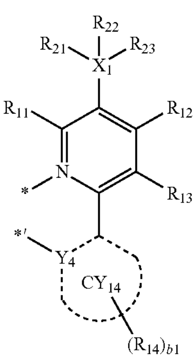

Formulae 2A and 2B may respectively be understood by referring to the descriptions of Formulae 2A and 2B provided herein.

$L_1$ and $L_2$ in Formula 1 may be different from each other. That is, the organometallic compound represented by Formula 1 may be a heteroleptic complex.

In one or more embodiments, M may be Ir, n1+n2=3; or M may be Pt, n1+n2=2.

In one or more embodiments, M may be Ir in Formula 1 and i) n1 may be 1 and n2 may be 2; or ii) n1 may be 2 and n2 may be 1.

In Formula 2B, $Y_4$ may be C or N.

In one or more embodiments, in Formula 2B, $Y_4$ may be C.

In Formula 2B, $X_1$ is Si or Ge.

In Formula 2A, $X_{21}$ is O, S, S(=O), N($Z_{29}$), C($Z_{29}$)($Z_{30}$), or Si($Z_{29}$)($Z_{30}$). $Z_{29}$ and $Z_{30}$ may respectively be understood by referring to the descriptions of $Z_{29}$ and $Z_{30}$ provided herein.

In one or more embodiments, $X_{21}$ in Formula 2A is O or S.

In Formula 2A, $T_1$ to $T_4$ are each independently C, N, a carbon atom bound to ring $CY_1$, or a carbon atom bound to M in Formula 1, provided that one of $T_1$ to $T_4$ is a carbon atom bound to M in Formula 1, and another one of $T_1$ to $T_4$, which is not bound to M, is a carbon atom bound to ring $CY_1$, and $T_5$ to $T_8$ are each independently C or N.

A total number of N atoms among $T_1$ to $T_8$ in Formula 2A is 0 or 1.

In Formulae 2A and 2B, ring $CY_1$ and ring $CY_{14}$ are each independently a $C_5$-$C_{30}$ carbocyclic group or a $C_1$-$C_{30}$ heterocyclic group, Are in Formula 2A is a ring $CY_2$ unsubstituted or substituted with at least one $Z_0$, and the ring $CY_2$ is an unsaturated $C_5$-$C_{30}$ carbocyclic group or an unsaturated $C_1$-$C_{30}$ heterocyclic group. $Z_0$ is understood by referring to the description of $Z_0$ provided herein.

In one or more embodiments, in Formulae 2A and 2B, ring $CY_1$ and ring $CY_{14}$ may each independently be a cyclopentane group, a cyclohexane group, a cycloheptane group, a cyclopentene group, a cyclohexene group, a cycloheptene group, a benzene group, a naphthalene group, an anthracene group, a phenanthrene group, a triphenylene group, a pyrene group, a chrysene group, a cyclopentadiene group, a 1,2,3,4-tetrahydronaphthalene group, a thiophene group, a furan group, a borole group, a phosphole group, a silole group, a germole group, a selenophene group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophenegroup, a dibenzofuran group, a dibenzothiophene 5-oxide group, a 9H-fluorene-9-one group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluoren-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, a 5,6,7,8-tetrahydroquinoline group, an adamantane group, a norbornane group, or a norbornene group.

In one or more embodiments, ring $CY_1$ and ring $CY_{14}$ may each independently be a benzene group, a naphthalene group, a 1,2,3,4-tetrahydronaphthalene group, a phenanthrene group, a pyridine group, a pyrimidine group, a pyrazine group, a triazine group, a benzofuran group, a benzothiophene group, a fluorene group, a carbazole group, a dibenzofuran group, a dibenzothiophene group, a dibenzosilole group, an azafluorene group, an azacarbazole group, an azadibenzofuran group, an azadibenzothiophene group, or an azadibenzosilole group.

In one or more embodiments, in Formula 2A, ring $CY_1$ may be a pyridine group, a 5,6,7,8-tetrahydroisoquinoline group, or a 5,6,7,8-tetrahydroquinoline.

In one or more embodiments, in Formula 2B, ring $CY_{14}$ may be a benzene group, a naphthalene group, a 1,2,3,4-tetrahydronaphthalene group, a phenanthrene group, a dibenzothiophene group, a dibenzofuran group, or a pyridine group.

In one or more embodiments, ring $CY_2$ may be a benzene group, a naphthalene group, an anthracene group, a phenanthrene group, a triphenylene group, a pyrene group, a chrysene group, a cyclopentadiene group, a 1,2,3,4-tetrahydronaphthalene group, a thiophene group, a furan group, a borole group, a phosphole group, a silole group, a germole group, a selenophene group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophenegroup, a dibenzofuran group, a dibenzothiophene 5-oxide group, a 9H-fluorene-9-one group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluoren-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, or a 5,6,7,8-tetrahydroquinoline group.

In Formula 2B, $R_{21}$ to $R_{23}$ may each independently be a $C_1$-$C_{60}$ alkyl group or a $C_6$-$C_{60}$ aryl group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_3$-$C_{10}$ cycloalkyl group, a phenyl group, or a combination thereof.

In one or more embodiments, in Formula 2B, $R_{21}$ to $R_{23}$ may each independently be a methyl group, an ethyl group, an n-propyl group, an iso-propyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, a tert-decyl group, a phenyl group, a biphenyl group, or a naphthyl group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_{20}$ alkyl group, a $C_3$-$C_{10}$ cycloalkyl group, a phenyl group, or a combination thereof.

In one or more embodiments, in Formula 2B, $R_{21}$ to $R_{23}$ may each independently be —$CH_3$, —$CH_2CH_3$, —$CD_3$, —$CD_2H$, —$CDH_2$, —$CH_2CD_3$, or —$CD_2CH_3$.

In one or more embodiments, in Formula 2B, $R_{21}$ to $R_{23}$ may be identical to one another.

In one or more embodiments, in Formula 2B, at least two of $R_{21}$ to $R_{23}$ may be different from each other.

In Formulae 2A and 2B, $Z_0$, $Z_1$, $Z_2$, $Z_{29}$, $Z_{30}$, and $R_{11}$ to $R_{14}$ may each independently be hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_7$-$C_{60}$ aryl alkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_2$-$C_{60}$ heteroaryl alkyl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$Ge(Q_3)(Q_4)(Q_5)$, —$B(Q_6)(Q_7)$, —$P(=O)(Q_9)(Q_9)$, or —$P(Q_9)(Q_9)$, wherein $Q_1$ to $Q_9$ may respectively be understood by referring to the descriptions of $Q_1$ to $Q_9$ provided herein.

In Formula 2A, d2 indicates the number of $Ar_2$(s), and d2 may be an integer from 1 to 6. When d2 is 2 or greater, at least two $Ar_2$(s) may be identical to different from each other. In one or more embodiments, d2 may be 1, 2, or 3. In one or more embodiments, d2 may be 1 or 2.

In Formulae 2A and 2B, a1 and b1 may respectively indicate the number of $Z_1$(s) and $R_{14}$(s), and a1 and b1 may each independently be an integer from 0 to 20. When a1 is 2 or greater, at least two $Z_1$(s) may be identical to or different from each other. When b1 is 2 or greater, at least two $R_{14}$(s) may be identical to or different from each other. In one or more embodiments, a1 and b1 may each independently be an integer from 0 to 10.

In Formula 2A, a2 indicates the number of $Z_2$(s), and a2 may be an integer from 0 to 5. When a2 is 2 or greater, at least two $Z_2$(s) may be identical to different from each other. In one or more embodiments, a2 may be 0, 1, 2, or 3.

In one or more embodiments, $Z_1$ in Formula 2A and $R_{11}$ to $R_{13}$ in Formula 2B may each independently be:

hydrogen, deuterium, —F, or a cyano group;

a $C_1$-$C_{20}$ alkyl group unsubstituted or substituted with deuterium, —F, a cyano group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl)$C_3$-$C_{10}$ cycloalkyl group, a $C_1$-$C_{10}$ heterocycloalkyl group, a deuterated heterocycloalkyl group, a fluorinated $C_1$-$C_{10}$ heterocycloalkyl group, a ($C_1$-$C_{20}$ heterocycloalkyl group, a phenyl group, a deuterated phenyl group, a fluorinated phenyl group, a ($C_1$-$C_{20}$ alkyl)phenyl group, a biphenyl group, a deuterated biphenyl group, a fluorinated biphenyl group, a ($C_1$-$C_{20}$ alkyl)biphenyl group, or a combination thereof; or a $C_3$-$C_{10}$ cycloalkyl group, a $C_1$-$C_{10}$ heterocycloalkyl group, a phenyl group, or a biphenyl group, each unsubstituted or substituted with deuterium, —F, a cyano group, a $C_1$-$C_{20}$ alkyl group, a deuterated $C_1$-$C_{20}$ alkyl group, a fluorinated $C_1$-$C_{20}$ alkyl group, a $C_1$-$C_{20}$ alkoxy group, a deuterated $C_1$-$C_{20}$ alkoxy group, a fluorinated $C_1$-$C_{20}$ alkoxy group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl)$C_3$-$C_{10}$ cycloalkyl group, a $C_1$-$C_{10}$ heterocycloalkyl group, a deuterated heterocycloalkyl group, a fluorinated $C_1$-$C_{10}$ heterocycloalkyl group, a ($C_1$-$C_{20}$ alkyl)$C_1$-$C_{10}$ heterocycloalkyl group, a phenyl group, a deuterated phenyl group, a fluorinated phenyl group, a ($C_1$-$C_{20}$ alkyl)phenyl group, a biphenyl group, a deuterated biphenyl group, a fluorinated a biphenyl group, a ($C_1$-$C_{20}$ alkyl)biphenyl group, or a combination thereof.

In one or more embodiments, $Z_1$ in Formula 2A and $R_{11}$ to $R_{13}$ in Formula 2B may each independently be:

hydrogen or deuterium;

a $C_1$-$C_{20}$ alkyl group unsubstituted or substituted with deuterium, a $C_3$-$C_{10}$ cycloalkyl group, a deuterated $C_3$-$C_{10}$ cycloalkyl group, a ($C_1$-$C_{20}$ alkyl)$C_3$-$C_{10}$ cycloalkyl group, a $C_1$-$C_{10}$ heterocycloalkyl group, a deuterated $C_1$-$C_{10}$ heterocycloalkyl group, a ($C_1$-$C_{20}$ heterocycloalkyl group, a phenyl group, a deuterated phenyl group, a ($C_1$-$C_{20}$ alkyl) phenyl group, a biphenyl group, a deuterated biphenyl group, a ($C_1$-$C_{20}$ alkyl)biphenyl group, or a combination thereof; or a $C_3$-$C_{10}$ cycloalkyl group, a $C_1$-$C_{10}$ heterocycloalkyl group, a phenyl group, or a biphenyl group, each unsubstituted or substituted with deuterium, —F, a cyano group, a $C_1$-$C_{20}$ alkyl group, a deuterated $C_1$-$C_{20}$ alkyl group, a $C_1$-$C_{20}$ alkoxy group, a deuterated $C_1$-$C_{20}$ alkoxy group, a $C_3$-$C_{10}$ cycloalkyl group, a deuterated $C_3$-$C_{10}$ cycloalkyl group, a ($C_1$-$C_{20}$ alkyl)$C_3$-$C_{10}$ cycloalkyl group, a $C_1$-$C_{10}$ heterocycloalkyl group, a deuterated heterocycloalkyl group, a ($C_1$-$C_{20}$ heterocycloalkyl group, a phenyl group, a deuterated phenyl group, a ($C_1$-$C_{20}$ alkyl)phenyl group, a biphenyl group, a deuterated biphenyl group, a ($C_1$-$C_{20}$ alkyl)biphenyl group, or a combination thereof.

In one or more embodiments, $Z_0$ and $Z_2$ in Formula 2A and $R_{14}$ in Formula 2B may each independently be:

hydrogen, deuterium, —F, or a cyano group;

a $C_1$-$C_{20}$ alkyl group unsubstituted or substituted with deuterium, —F, a cyano group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl)$C_3$-$C_{10}$ cycloalkyl group, a $C_1$-$C_{10}$ heterocycloalkyl group, a deuterated heterocycloalkyl group, a fluorinated $C_1$-$C_{10}$ heterocycloalkyl group, a ($C_1$-$C_{20}$ alkyl)$C_1$-$C_{10}$ heterocycloalkyl group, a phenyl group, a deuterated phenyl group, a fluorinated phenyl group, a ($C_1$-$C_{20}$ alkyl)phenyl group, a biphenyl group, a deuterated biphenyl group, a fluorinated biphenyl group, a ($C_1$-$C_{20}$ alkyl)biphenyl group, or a combination thereof;

a $C_3$-$C_{10}$ cycloalkyl group, a $C_1$-$C_{10}$ heterocycloalkyl group, a phenyl group, or a biphenyl group, each unsubstituted or substituted with deuterium, —F, a cyano group, a $C_1$-$C_{20}$ alkyl group, a deuterated $C_1$-$C_{20}$ alkyl group, a fluorinated $C_1$-$C_{20}$ alkyl group, a $C_1$-$C_{20}$ alkoxy group, a deuterated $C_1$-$C_{20}$ alkoxy group, a fluorinated $C_1$-$C_{20}$ alkoxy group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl)$C_3$-$C_{10}$ cycloalkyl group, a $C_1$-$C_{10}$ heterocycloalkyl group, a deuterated heterocycloalkyl group, a fluorinated heterocycloalkyl group, a ($C_1$-$C_{20}$ heterocycloalkyl group, a phenyl group, a deuterated phenyl group, a fluorinated phenyl group, a ($C_1$-$C_{20}$ alkyl)phenyl group, a biphenyl group, a deuterated biphenyl group, a fluorinated a biphenyl group, a ($C_1$-$C_{20}$ alkyl)biphenyl group, or a combination thereof; or —Si($Q_3$)($Q_4$)($Q_5$) or —Ge($Q_3$)($Q_4$)($Q_5$).

In one or more embodiments, in Formulae 2A and 2B, $Z_0$, $Z_1$, $Z_2$, $Z_{29}$, $Z_{30}$, and $R_{11}$ to $R_{14}$ may each independently be:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, a $C_1$-$C_{20}$ alkyl group, a $C_1$-$C_{20}$ alkoxy group, or a $C_1$-$C_{20}$ alkylthio group;

a $C_1$-$C_{20}$ alkyl group, a $C_1$-$C_{20}$ alkoxy group, or a $C_1$-$C_{20}$ alkylthio group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl) cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo [2.2.2]octyl group, a phenyl group, a ($C_1$-$C_{20}$ alkyl)phenyl group, a biphenyl group, a terphenyl group, a naphthyl group, a pyridinyl group, a pyrimidinyl group, or a combination thereof;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1] pentyl group, a bicyclo[2.1.1]hexyl group, a bicyclo[2.2.2] octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzoisothiazolyl group, a benzoxazolyl group, a benzoisoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, or an azadibenzothiophenyl group, each unsubstituted or substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a (phenyl)$C_1$-$C_{10}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl) bicyclo[1.1.1]pentyl group, a ($C_1$-$C_{20}$ alkyl)bicyclo[2.1.1] hexyl group, a ($C_1$-$C_{20}$ alkyl)bicyclo[2.2.2]octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzoisothiazolyl group, a benzoxazolyl group, a benzoisoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, or a combination thereof; or $—N(Q_1)(Q_2)$, $—Si(Q_3)(Q_4)(Q_5)$, $—Ge(Q_3)(Q_4)(Q_5)$, $—B(Q_6)(Q_7)$, $—P(=O)(Q_8)(Q_9)$, or $—P(Q_8)(Q_9)$, wherein $Q_1$ to $Q_9$ may each independently be:

$—CH_3$, $—CD_3$, $—CD_2H$, $—CDH_2$, $—CH_2CH_3$, $—CH_2CD_3$, $—CH_2CD_2H$, $—CH_2CDH_2$, $—CHDCH_3$, $—CHDCD_2H$, $—CHDCDH_2$, $—CHDCD_3$, $—CD_2CD_3$, $—CD_2CD_2H$, or $—CD_2CDH_2$;

an n-propyl group, an iso-propyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with deuterium, a $C_1$-$C_{10}$ alkyl group, a phenyl group, or a combination thereof.

In one or more embodiments, $R_{21}$ to $R_{23}$, $Z_1$, $Z_2$, and $R_{11}$ to $R_{14}$ in Formulae 2A and 2B may not include silicon (Si). Accordingly, an electronic device, e.g., an organic light-emitting device, including the organometallic compound represented by Formula 1 may have improved out-coupling characteristics.

In one or more embodiments, the organometallic compound represented by Formula 1 may satisfy at least one of Conditions A, B, and C:

Condition A wherein, $Z_1$ in Formula 2A may not be hydrogen, and a1 may not be 0

Condition B wherein, $Z_2$ in Formula 2A may not be hydrogen, and a2 may not be 0

Condition C $R_{14}$ in Formula 2B may not be hydrogen, and b1 may not be 0

The organometallic compound represented by Formula 1 satisfies Condition 1 or Condition 2:

Condition 1 wherein $X_1$ in Formula 2B is Si, $R_{12}$ in Formula 2B is not hydrogen or a methyl group, and each of $T_1$ to $T_8$ in Formula 2A is not N Condition 2 wherein, in Formula 2B, $R_{12}$ is hydrogen, or a group comprising 1 carbon atom (for example, $R_{12}$ in Formula 2B may be hydrogen, a methyl group, or a deuterated methyl group (for example, $—CH_2D$, $—CHD_2$ or $—CD_3$)).

In one or more embodiments, the organometallic compound represented by Formula 1 may satisfy Condition 1.

In one or more embodiments, the organometallic compound represented by Formula 1 may satisfy Condition 1 and the number of carbon atoms included in $R_{12}$ of Formula 2B may be 2 or greater.

In one or more embodiments, the organometallic compound represented by Formula 1 may satisfy Condition 1 and $R_{12}$ in Formula 2B may be:

a $C_2$-$C_{20}$ alkyl group or a $C_2$-$C_{20}$ alkoxy group;

a methyl group or a methoxy group, each substituted with a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{14}$ aryl group, a $C_1$-$C_{14}$ heteroaryl group, a monovalent non-aromatic condensed polycyclic group, a monovalent non-aromatic condensed heteropolycyclic group, or a combination thereof;

a $C_2$-$C_{20}$ alkyl group or a $C_2$-$C_{20}$ alkoxy group, each substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{14}$ aryl group, a $C_7$-$C_{14}$ alky aryl group, a $C_7$-$C_{14}$ aryl alkyl group, a $C_1$-$C_{14}$ heteroaryl group, a $C_2$-$C_{60}$ alkyl heteroaryl group, a $C_2$-$C_{60}$ heteroaryl alkyl group, a monovalent non-aromatic condensed polycyclic group, a monovalent non-aromatic condensed heteropolycyclic group, or a combination thereof; or a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{14}$ aryl group, a $C_1$-$C_{14}$ heteroaryl group, a monovalent non-aromatic condensed polycyclic group, or a monovalent non-aromatic condensed heteropolycyclic group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_{20}$ alkyl group, a $C_1$-$C_{20}$ alkoxy group, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{14}$ aryl group, a $C_7$-$C_{14}$ alky aryl group, a $C_7$-$C_{14}$ aryl alkyl group, a $C_1$-$C_{14}$ heteroaryl group, a substituted or unsubstituted $C_2$-$C_{14}$ alkyl heteroaryl group, a substituted or unsubstituted $C_2$-$C_{14}$ heteroaryl alkyl group, a monovalent non-aromatic condensed polycyclic group, a monovalent non-aromatic condensed heteropolycyclic group, or a combination thereof.

In one or more embodiments, the organometallic compound represented by Formula 1 may satisfy Condition 1 and $R_{12}$ in Formula 2B may be:

a methyl group or a methoxy group, substituted with a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl) cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.2]octyl group, a phenyl group, a ($C_1$-$C_{20}$ alkyl)phenyl group, a naphthyl group, a pyridinyl group, a pyrimidinyl group, or a combination thereof;

a methyl group or a methoxy group, substituted with i) a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl) cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.2]octyl group, a phenyl group, a ($C_1$-$C_{20}$ alkyl)phenyl group, a naphthyl group, a pyridinyl group, a pyrimidinyl group, or a combination thereof, and ii) at least one deuterium;

a $C_2$-$C_{20}$ alkyl group or a $C_2$-$C_{20}$ alkoxy group, unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl) cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl) bicyclo[2.1.1]hexyl group, a ($C_1$-$C_{20}$ alkyl)bicyclo[2.2.2] octyl group, a phenyl group, a ($C_1$-$C_{20}$ alkyl)phenyl group, a naphthyl group, a pyridinyl group, a pyrimidinyl group, or a combination thereof; or a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1] pentyl group, a bicyclo[2.1.1]hexyl group, a bicyclo[2.2.2] octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzoisothiazolyl group, a benzoxazolyl group, a benzoisoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group or an azadibenzothiophenyl group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.2]octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzoisothiazolyl group, a benzoxazolyl group, a benzoisoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, or a combination thereof.

In one or more embodiments, the organometallic compound represented by Formula 1 may satisfy Condition 2 as described herein.

In one or more embodiments, the organometallic compound represented by Formula 1 may satisfy Condition 2 as described herein, $X_1$ in Formula 2B may be Si, and the total number of N atoms among $T_1$ to $T_8$ in Formula 2A may be 0.

In one or more embodiments, the organometallic compound represented by Formula 1 may satisfy Condition 2 as described herein, $X_1$ in Formula 2B may be Ge, and the total number of N atoms among $T_1$ to $T_8$ in Formula 2A may be 0.

In one or more embodiments, the organometallic compound represented by Formula 1 may satisfy Condition 2 as described herein, $X_1$ in Formula 2B may be Si, and the total number of N atoms among $T_1$ to $T_8$ in Formula 2A may be 1.

In one or more embodiments, the organometallic compound represented by Formula 1 may satisfy Condition 2 as described herein, $X_1$ in Formula 2B may be Ge, and the total number of N atoms among $T_1$ to $T_8$ in Formula 2A may be 1.

In one or more embodiments, the organometallic compound represented by Formula 1 may satisfy Condition 2 as described herein, and $R_{12}$ in Formula 2B may include at least one deuterium.

In one or more embodiments, the organometallic compound represented by Formula 1 may include at least one deuterium, at least one fluoro group (—F), at least one cyano group (—CN), or a combination thereof.

In one or more embodiments, the organometallic compound represented by Formula 1 may include at least one deuterium.

In one or more embodiments, the organometallic compound represented by Formula 1 may satisfy at least one of Conditions (1A), (2A), or (3) to (6); or the organometallic compound represented by Formula 1 may satisfy Condition (7):

Condition (1A)

wherein, in Formula 2A, a1 may not be 0, and at least one of $Z_1$(s) in the number of a1 may include deuterium Condition (2A)

wherein, in Formula 2A, a2 may not be 0, and at least one of $Z_2$(s) in the number of a2 may include deuterium, a fluoro group (—F), a cyano group, or a combination thereof Condition (3)

wherein, in Formula 2A, at least one of $Ar_2$(s) in the number of d2 may include deuterium, a fluoro group (—F), a cyano group, or a combination thereof Condition (4)

wherein, in Formula 2B, at least one of $R_{21}$ to $R_{23}$ may include deuterium Condition (5)

wherein, in Formula 2B, $R_{12}$ may include at least one deuterium

Condition (6)

wherein, in Formula 2B, b1 may not be 0, and at least one of Ru(s) in the number of b1 may include deuterium, a fluoro group (—F), a cyano group, or a combination thereof Condition (7)

wherein, $Z_1$, $Z_2$, and Are in Formula 2A and $R_{11}$ to Ru and $R_{21}$ to $R_{23}$ in Formula 2B may each consist of carbon and hydrogen In one or more embodiments, in Formulae 2A and 2B, $Z_0$, $Z_1$, $Z_2$, $Z_{29}$, $Z_{30}$, and $R_{11}$ to $R_{14}$ may each independently be hydrogen, deuterium, —F, a cyano group, a nitro group, —$SF_5$, —$CH_3$, —$CD_3$, —$CD_2H$, —$CDH_2$, —$CF_3$, —$CF_2H$, —$CFH_2$, —$OCH_3$, —$OCDH_2$, —$OCD_2H$, —$OCD_3$, —$SCH_3$, —$SCDH_2$, —$SCD_2H$, —$SCD_3$, a group represented by one of Formulae 9-1 to 9-39, a group represented by one of Formulae 9-1 to 9-39 in which at least one hydrogen is substituted with deuterium, a group represented by one of Formulae 9-1 to 9-39 in which at least one hydrogen is substituted with —F, a group represented by one of Formulae 9-201 to 9-230, a group represented by one of Formulae 9-201 to 9-230 in which at least one hydrogen is substituted with deuterium, a group represented by one of Formulae 9-201 to 9-230 in which at least one hydrogen is substituted with —F, a group represented by one of Formulae 10-1 to 10-145, a group represented by one of Formulae 10-1 to 10-145 in which at least one hydrogen is substituted with deuterium, a group represented by one of Formulae 10-1 to 10-145 in which at least one hydrogen is substituted with —F, a group represented by one of Formulae 10-201 to 10-354, a group represented by one of Formulae 10-201 to 10-354 in which at least one hydrogen is substituted with deuterium, a group represented by one of Formulae 10-201 to 10-354 in which at least one hydrogen is substituted with —F, —$Si(Q_3)(Q_4)(Q_5)$, or —$Ge(Q_3)(Q_4)(Q_5)$, wherein $Q_3$ to $Q_5$ may respectively be understood by referring to the descriptions of $Q_3$ to $Q_5$ provided herein.

In one or more embodiments, $Z_1$ in Formula 2A and $R_{11}$ to $R_{13}$ in Formula 2B may each independently be hydrogen, deuterium, —$CH_3$, —$CD_3$, —$CD_2H$, —$CDH_2$, —$OCH_3$, —$OCDH_2$, —$OCD_2H$, —$OCD_3$, —$SCH_3$, —$SCDH_2$, —$SCD_2H$, —$SCD_3$, a group represented by one of Formulae 9-1 to 9-39, a group represented by one of Formulae 9-1 to 9-39 in which at least one hydrogen is substituted with deuterium, a group represented by one of Formulae 9-201 to 9-230, a group represented by one of Formulae 9-201 to 9-230 in which at least one hydrogen is substituted with deuterium, a group represented by one of Formulae 10-1 to 10-138 and 10-145, or a group represented by one of Formulae 10-1 to 10-138 and 10-145 in which at least one hydrogen is substituted with deuterium.

In one or more embodiments, Are in Formula 2A may be a group represented by one of Formulae 10-12 to 10-145, a group represented by one of Formulae 10-12 to 10-145 in which at least hone hydrogen is substituted with deuterium, a group represented by one of Formulae 10-12 to 10-145 in which at least one hydrogen is substituted with —F, a group represented by one of Formulae 10-201 to 10-354, a group represented by one of Formulae 10-201 to 10-354 in which at least one hydrogen is substituted with deuterium, or a group represented by one of Formulae 10-201 to 10-354 in which at least one hydrogen is substituted with —F.

In one or more embodiments, $R_{12}$ in Formula 2B may be hydrogen, $—CH_3$, $—CH_2D$, $—CHD_2$ or $—CD_3$.

In one or more embodiments, $R_{12}$ in Formula 2B may be hydrogen or a methyl group ($—CH_3$).

In one or more embodiments, $R_{12}$ in Formula 2B may be $—CH_2D$, $—CHD_2$ or $—CD_3$.

In one or more embodiments, $R_{12}$ in Formula 2B may be a group represented by one of Formulae 9-1 to 9-39, a group represented by one of Formulae 9-1 to 9-39 in which at least one hydrogen is substituted with deuterium, a group represented by one of Formulae 9-1 to 9-39 in which at least one hydrogen is substituted with —F, a group represented by one of Formulae 9-201 to 9-230, a group represented by one of Formulae 9-201 to 9-230 in which at least one hydrogen is substituted with deuterium, a group represented by one of Formulae 9-201 to 9-230 in which at least one hydrogen is substituted with —F, a group represented by one of Formulae 10-1 to 10-145, a group represented by one of Formulae 10-1 to 10-145 in which at least one hydrogen is substituted with deuterium, a group represented by one of Formulae 10-1 to 10-145 in which at least one hydrogen is substituted with —F, a group represented by one of Formulae 10-201 to 10-354, a group represented by one of Formulae 10-201 to 10-354 in which at least one hydrogen is substituted with deuterium, or a group represented by one of Formulae 10-201 to 10-354 in which at least one hydrogen is substituted with —F.

9-1

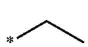

9-2

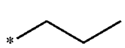

9-3

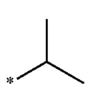

9-4

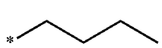

9-5

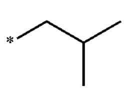

9-6

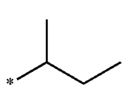

-continued 9-7

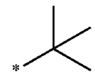

9-8

9-9

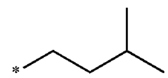

9-10

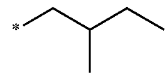

9-11

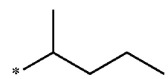

9-12

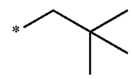

9-13

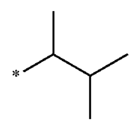

9-14

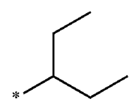

9-15

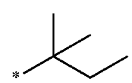

9-16

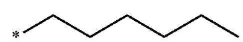

9-17

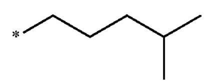

9-18

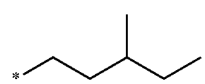

9-19

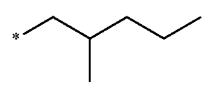

9-20

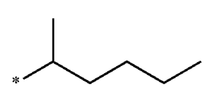

9-21

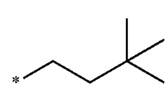

9-22

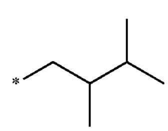

9-23

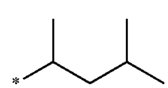

-continued
9-24
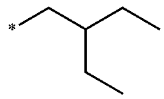
9-25
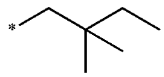
9-26
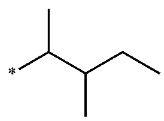
9-27
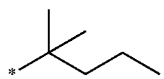
9-28
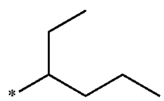
9-29
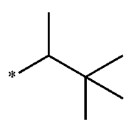
9-30
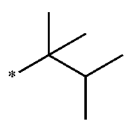
9-31
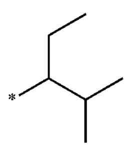
9-32
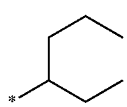
9-33
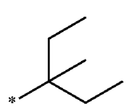
9-34
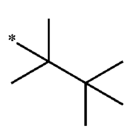
9-35
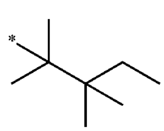
9-36
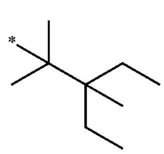
-continued
9-37
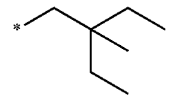
9-38
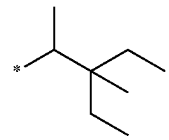
9-39
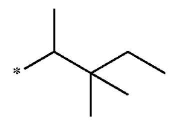
9-201
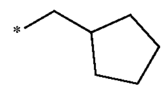
9-202
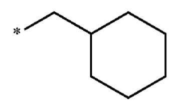
9-203
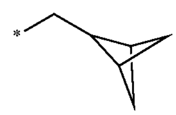
9-204
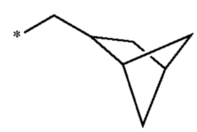
9-205
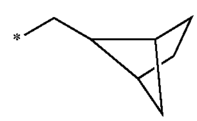
9-206
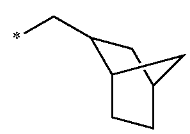
9-207
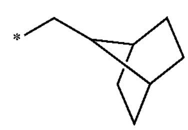
9-208
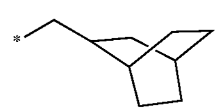
9-209
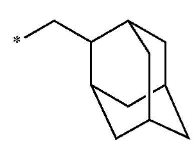
9-210
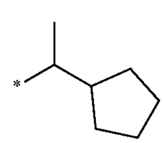

-continued
9-211
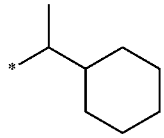
9-212
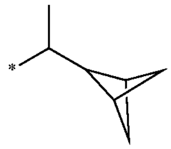
9-213
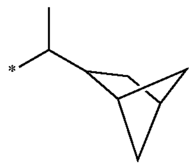
9-214
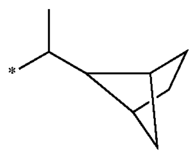
9-215
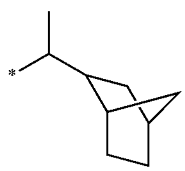
9-216
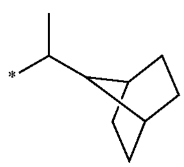
9-217
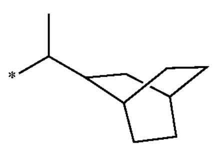
9-218
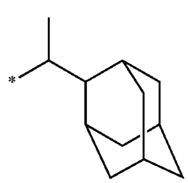
9-219
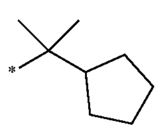
9-220
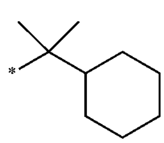
-continued
9-221
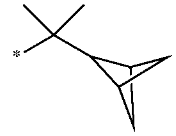
9-222
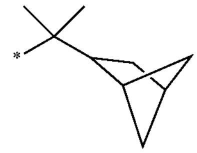
9-223
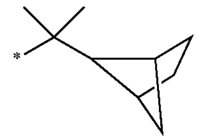
9-224
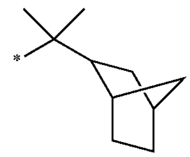
9-225
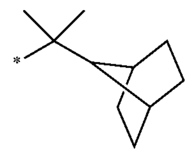
9-226
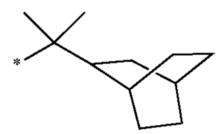
9-227
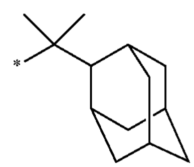
9-228
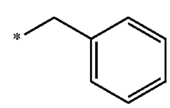
9-229
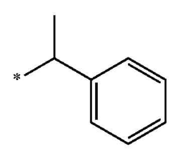
9-230
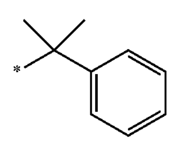
10-1
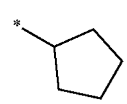

-continued
10-2
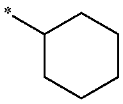
10-3
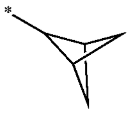
10-4
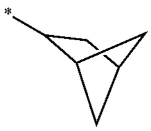
10-5
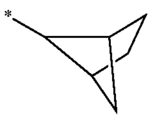
10-6
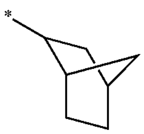
10-7
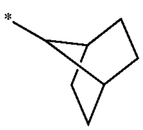
10-8
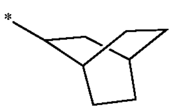
10-9
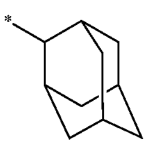
10-10
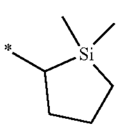
10-11
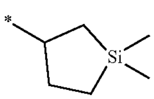
10-12
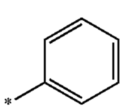
10-13
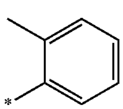
-continued
10-14
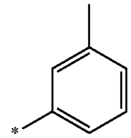
10-15
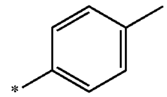
10-16
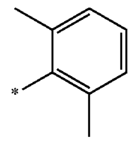
10-17
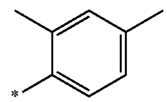
10-18
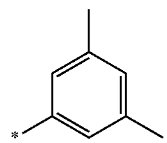
10-19
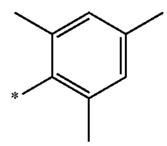
10-20
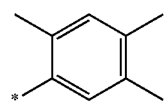
10-21
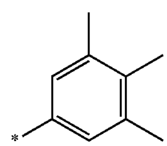
10-22
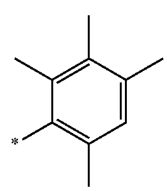
10-23
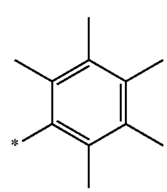
10-24
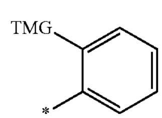

-continued
10-25
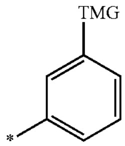
10-26
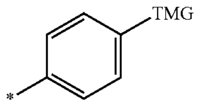
10-27
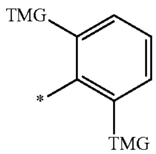
10-28
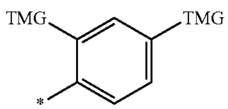
10-29
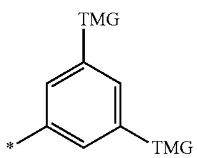
10-30
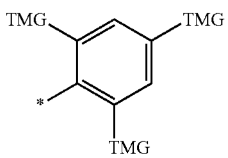
10-31
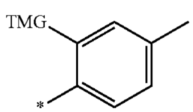
10-32
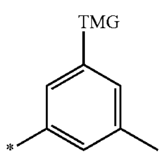
10-33
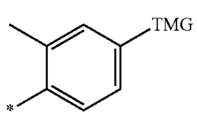
10-34
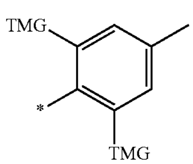
10-35
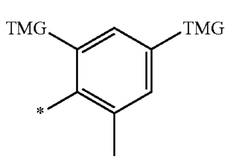
-continued
10-36
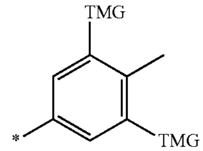
10-37
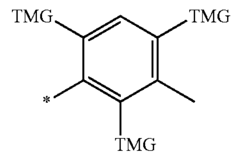
10-38
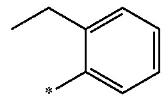
10-39
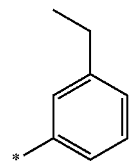
10-40
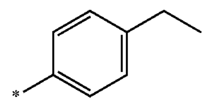
10-41
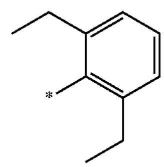
10-42
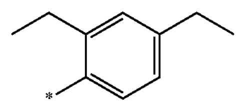
10-43
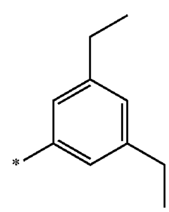
10-44
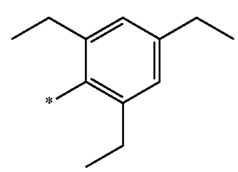
10-45
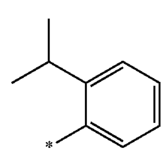

-continued
10-46
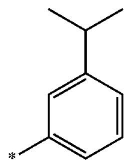
10-47
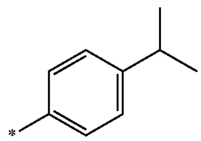
10-48
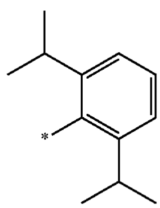
10-49
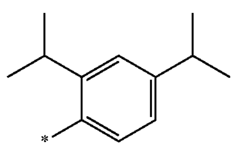
10-50
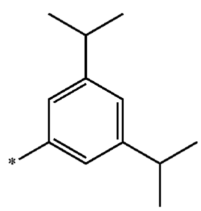
10-51
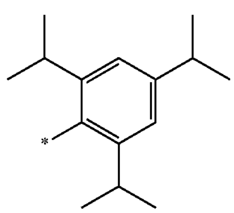
10-52
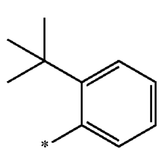
10-53
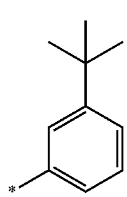
10-54
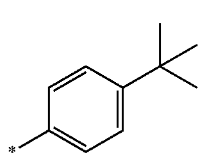
-continued
10-55
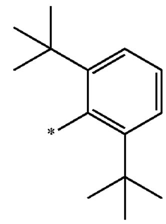
10-56
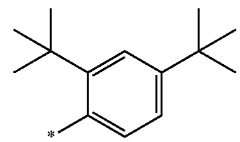
10-57
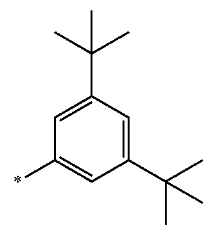
10-58
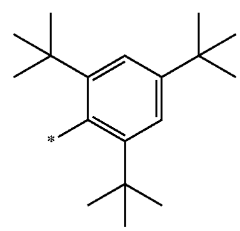
10-59
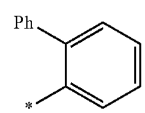
10-60
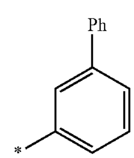
10-61
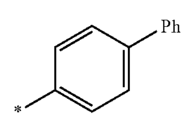
10-62
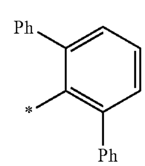
10-63
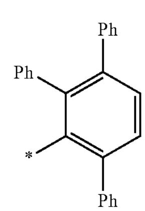

-continued
10-64
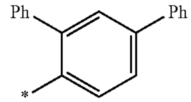
10-65
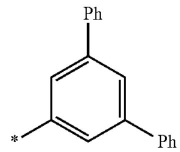
10-66
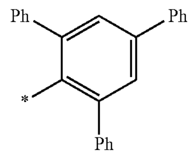
10-67
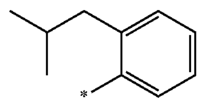
10-68
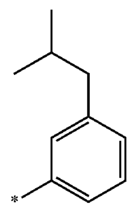
10-69
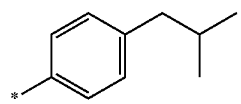
10-70
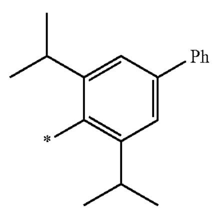
10-71
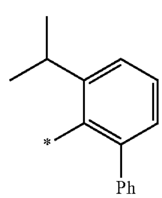
10-72
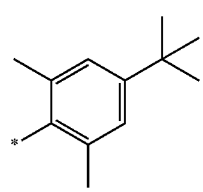
10-73
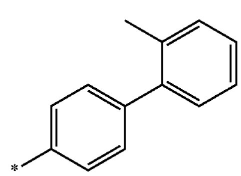
-continued
10-74
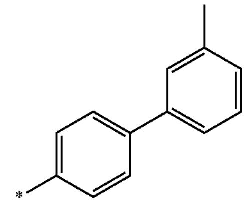
10-75
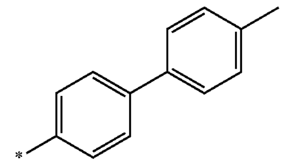
10-76
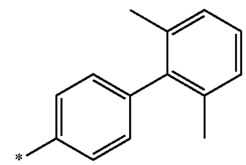
10-77
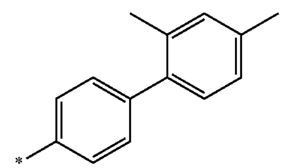
10-78
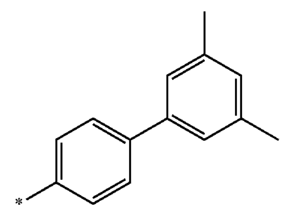
10-79
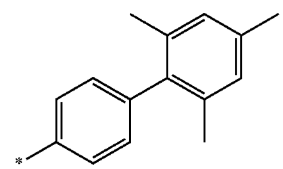
10-80
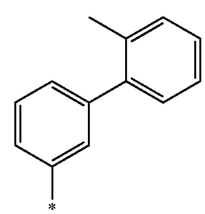
10-81
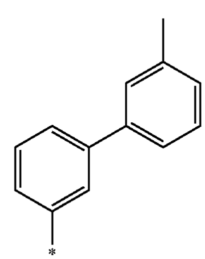

-continued
10-82
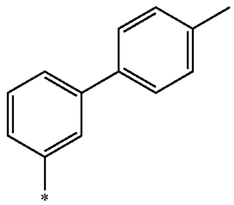
10-83
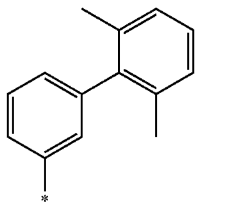
10-84
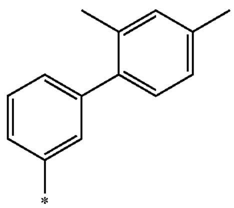
10-85
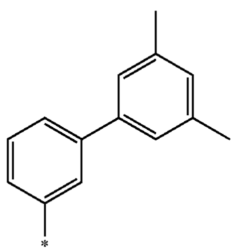
10-86
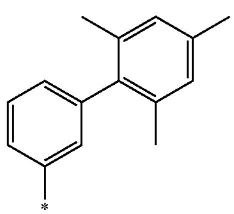
10-87
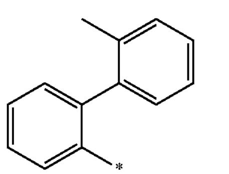
10-88
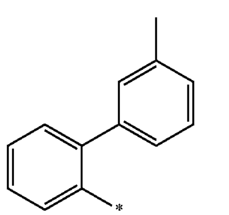
-continued
10-89
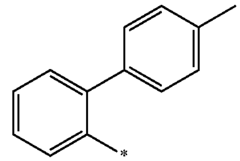
10-90
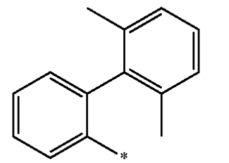
10-91
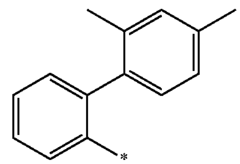
10-92
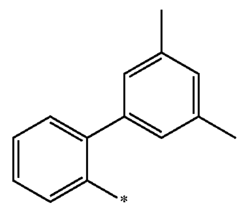
10-93
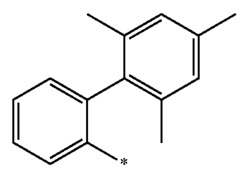
10-94
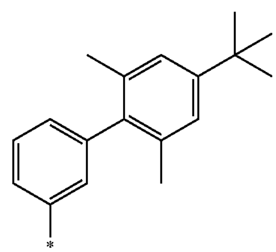
10-95
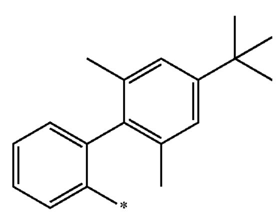
10-96
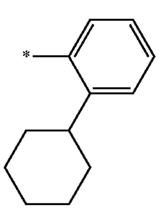

-continued
10-97
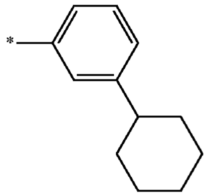
10-98
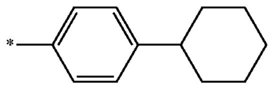
10-99
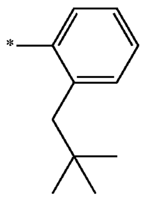
10-100
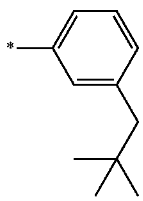
10-101
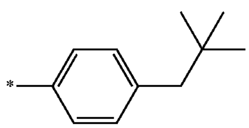
10-102
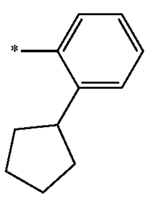
10-103
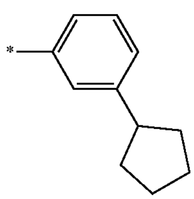
10-104
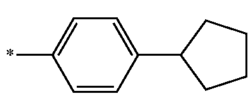
10-105
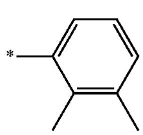
10-106
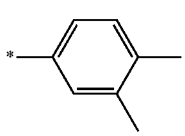
-continued
10-107
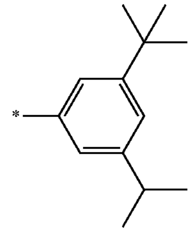
10-108
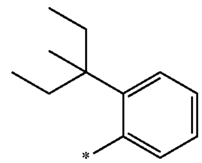
10-109
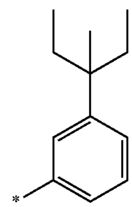
10-110
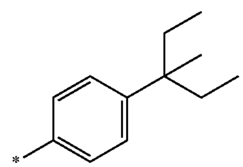
10-111
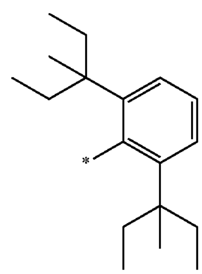
10-112
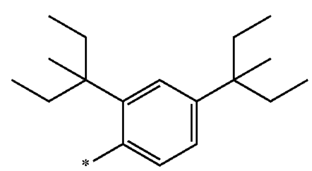
10-113
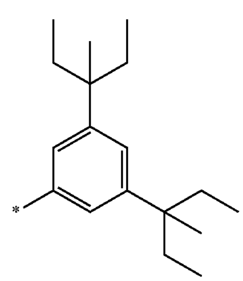

-continued
10-114
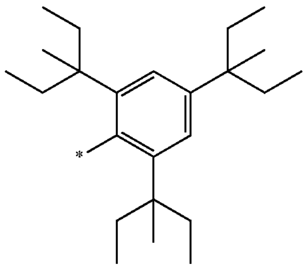
10-115
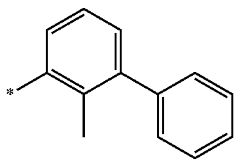
10-116
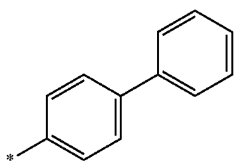
10-117
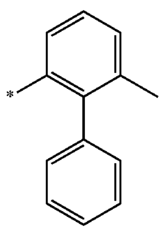
10-118
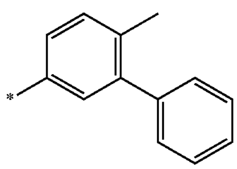
10-119
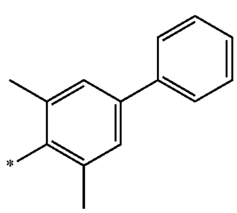
10-120
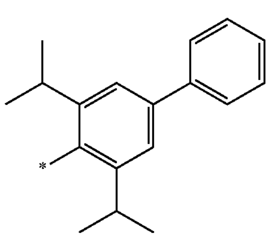
10-121
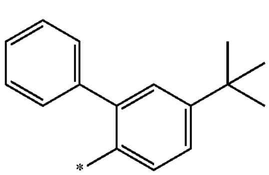
-continued
10-122
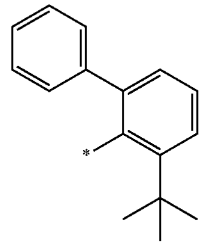
10-123
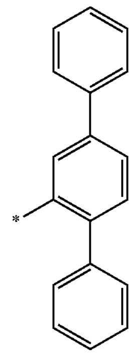
10-124
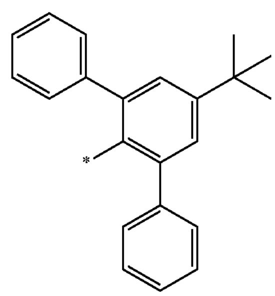
10-125
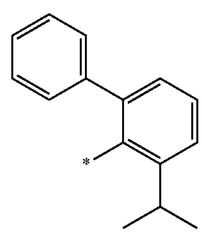
10-126
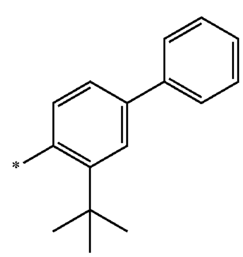
10-127
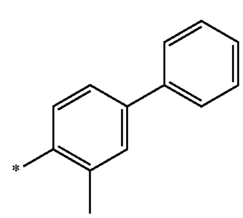

-continued
10-128
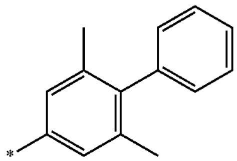
10-129
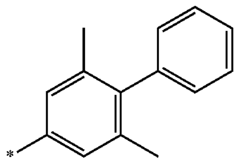
10-130
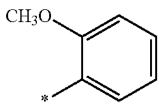
10-131
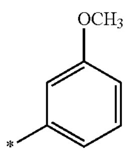
10-132
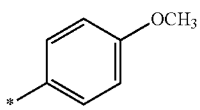
10-133
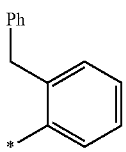
10-134
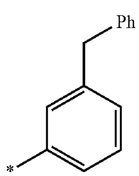
10-135
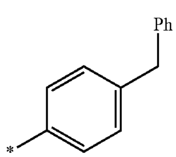
10-136
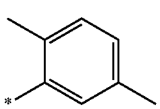
10-137
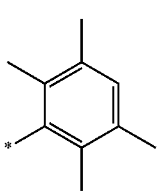
-continued
10-138
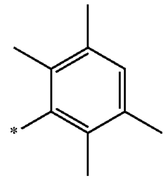
10-139
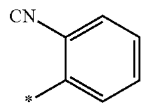
10-140
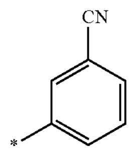
10-141
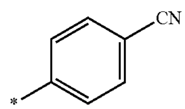
10-142
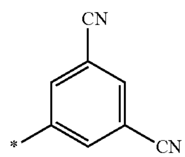
10-143
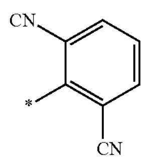
10-144
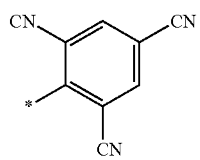
10-145
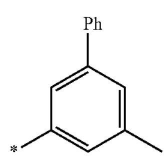
10-201
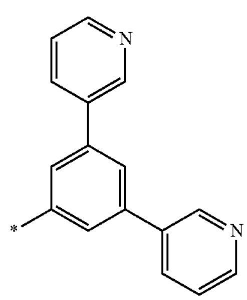

-continued
10-202
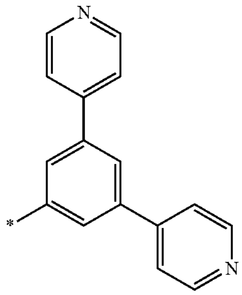
10-203
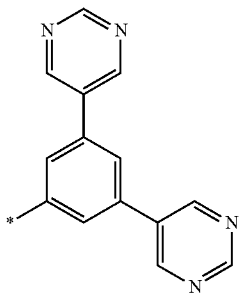
10-204
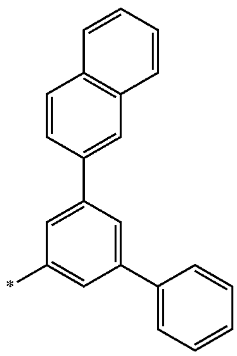
10-205
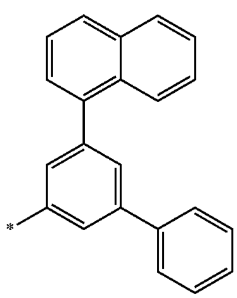
10-206
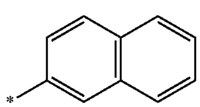
10-207
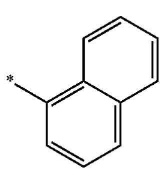
10-208
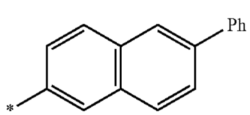
-continued
10-209
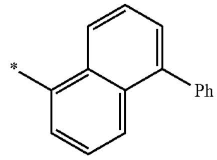
10-210
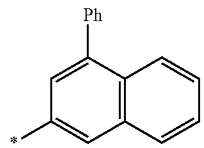
10-211
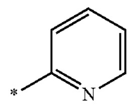
10-212
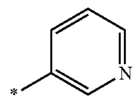
10-213
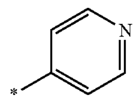
10-214
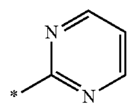
10-215
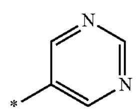
10-216
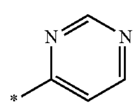
10-217
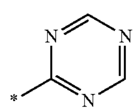
10-218
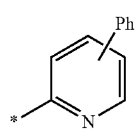
10-219
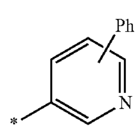
10-220
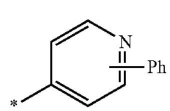
10-221
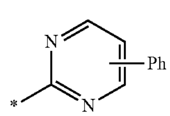

-continued
10-222
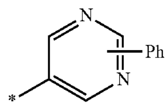
10-223
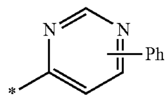
10-224
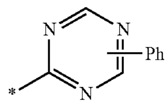
10-225
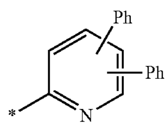
10-226
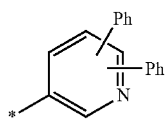
10-227
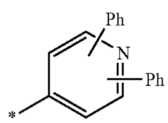
10-228
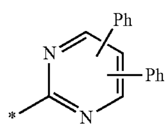
10-229
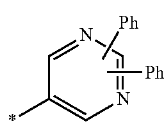
10-230
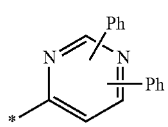
10-231
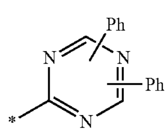
10-232
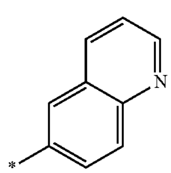
10-233
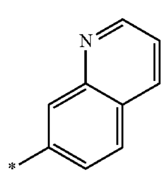
-continued
10-234
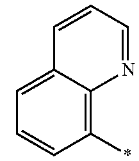
10-235
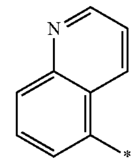
10-236
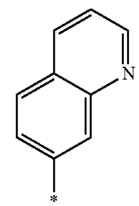
10-237
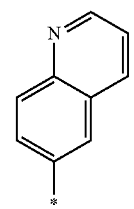
10-238
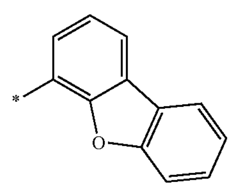
10-239
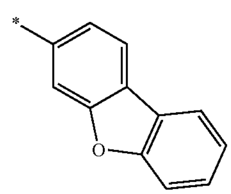
10-240
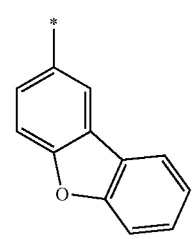
10-241
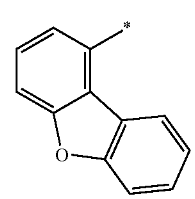

-continued
10-242
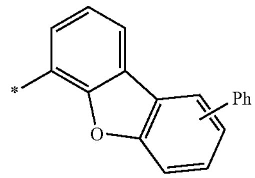
10-243
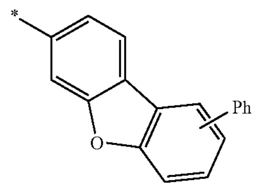
10-244
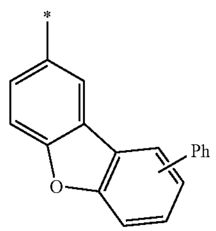
10-245
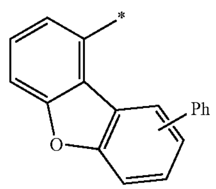
10-246
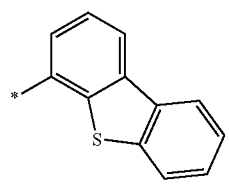
10-247
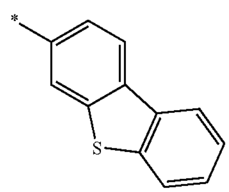
10-248
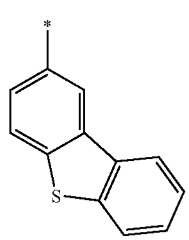
10-249
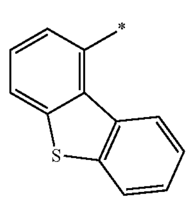
-continued
10-250
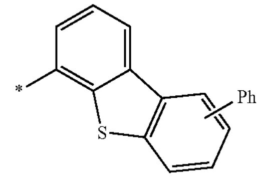
10-251
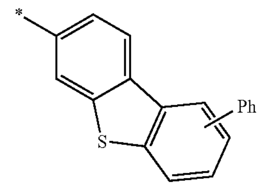
10-252
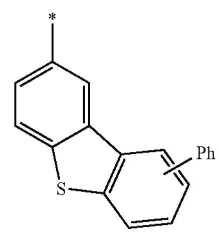
10-253
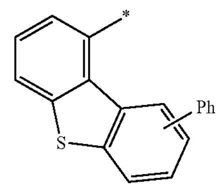
10-254
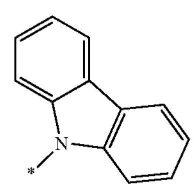
10-255
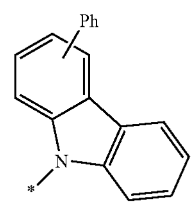
10-256
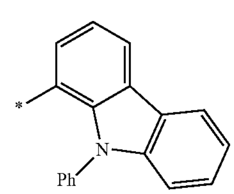
10-257
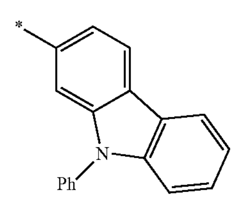

-continued
10-258
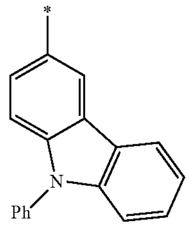
10-259
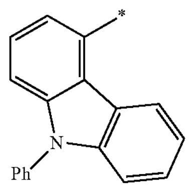
10-260
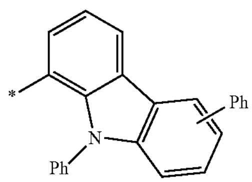
10-261
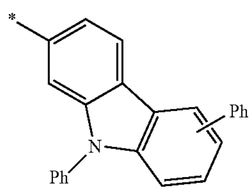
10-262
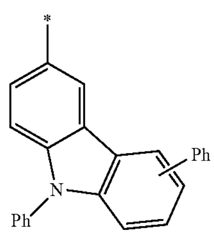
10-263
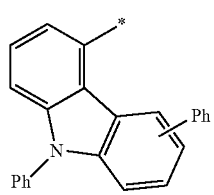
10-264
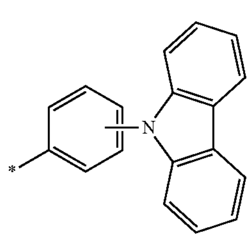
-continued
10-265
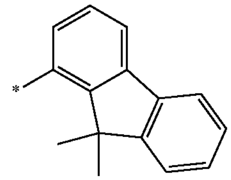
10-266
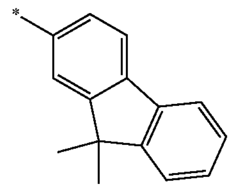
10-267
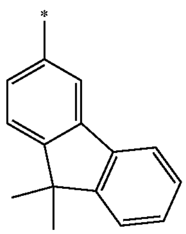
10-268
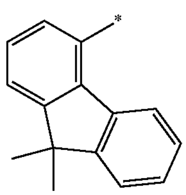
10-269
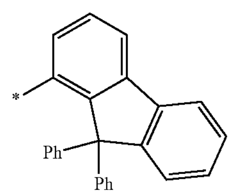
10-270
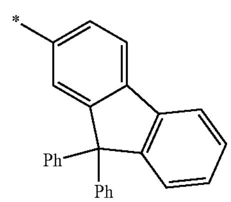
10-271
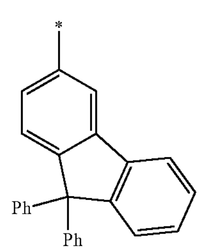

-continued
10-272
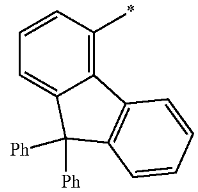
10-273
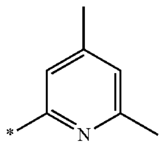
10-274
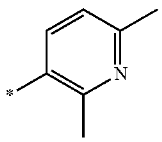
10-275
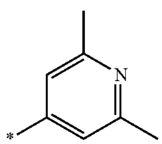
10-276
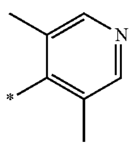
10-277
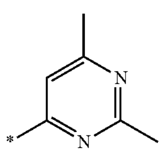
10-278
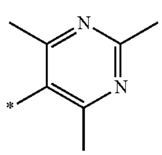
10-279
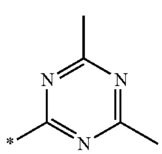
10-280
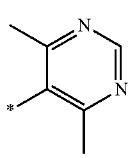
10-281
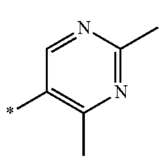
-continued
10-282
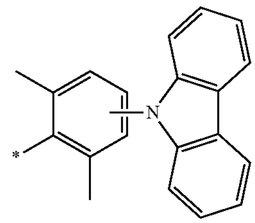
10-283
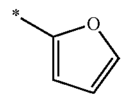
10-284
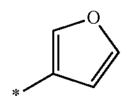
10-285
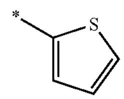
10-286
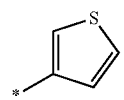
10-287
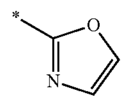
10-288
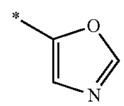
10-289
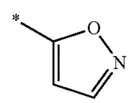
10-290
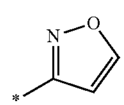
10-291
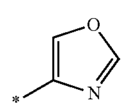
10-292
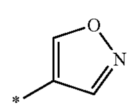
10-293
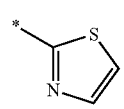
10-294
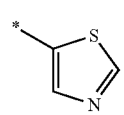

-continued
10-295
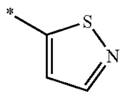
10-296
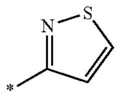
10-297
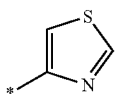
10-298
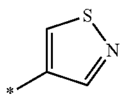
10-299
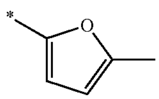
10-300
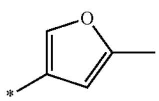
10-301
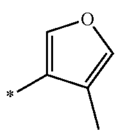
10-302
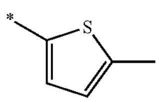
10-303
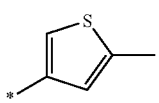
10-304
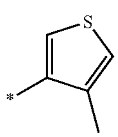
10-305
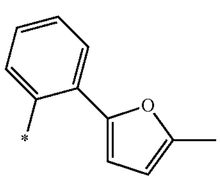
10-306
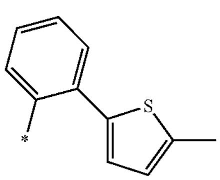
-continued
10-307
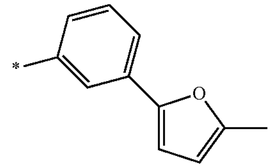
10-308
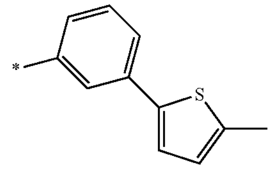
10-309
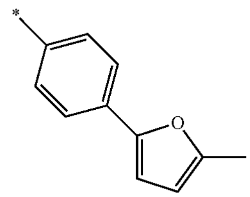
10-310
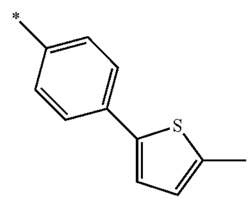
10-311
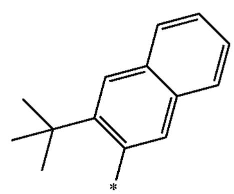
10-312
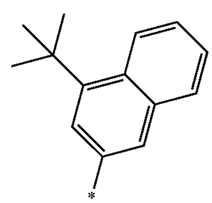
10-313
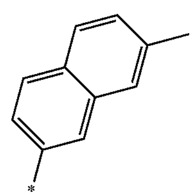
10-314
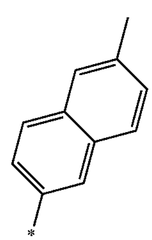

-continued
10-315
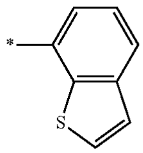
10-316
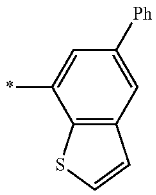
10-317
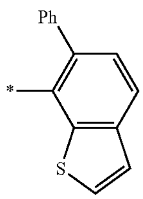
10-318
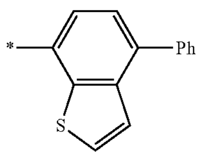
10-319
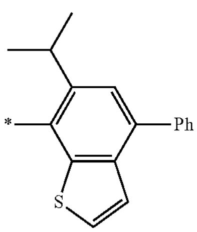
10-320
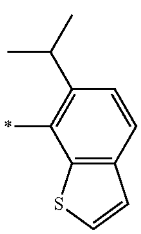
10-321
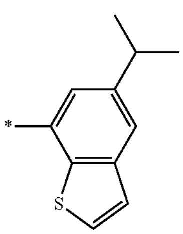
10-322
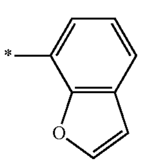
-continued
10-323
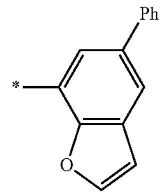
10-324
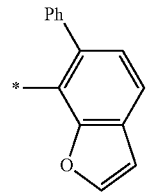
10-325
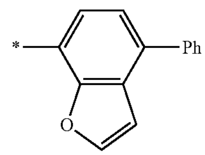
10-326
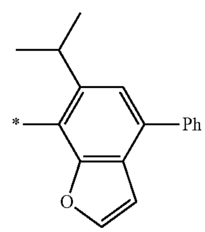
10-327
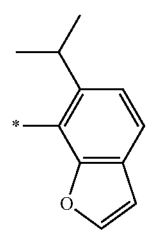
10-328
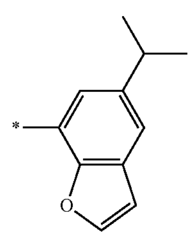
10-329
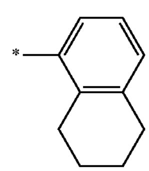

-continued
10-330
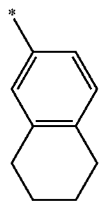
10-331
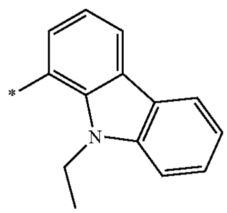
10-332
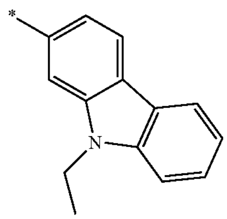
10-333
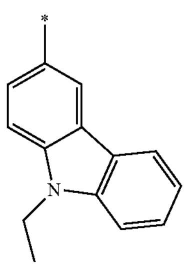
10-334
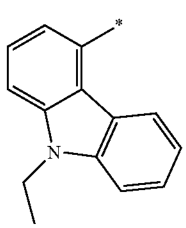
10-335
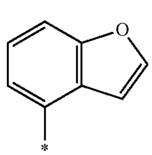
10-336
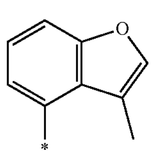
10-337
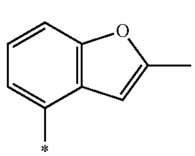
-continued
10-338
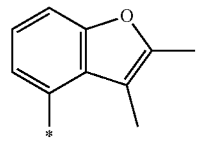
10-339
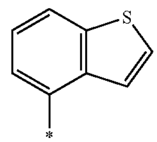
10-340
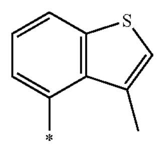
10-341
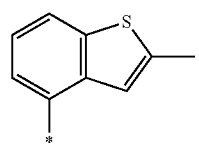
10-342
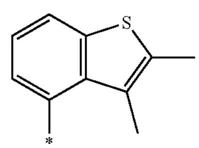
10-343
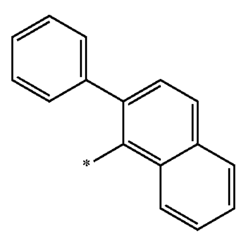
10-344
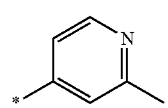
10-345
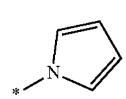
10-346
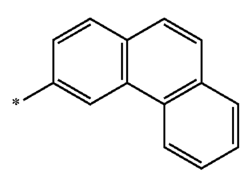
10-347
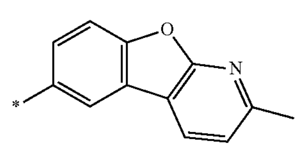

-continued 10-348

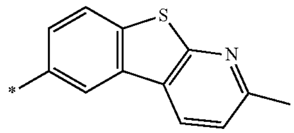

10-349

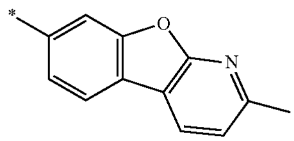

10-350

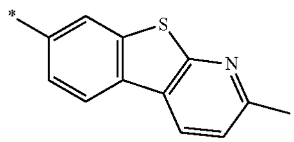

10-351

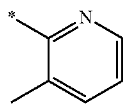

10-352

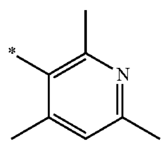

10-353

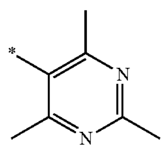

10-354

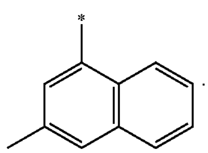

In Formulae 9-1 to 9-39, 9-201 to 9-230, 10-1 to 10-145, and 10-201 to 10-354, * indicates a binding site to an adjacent atom, "Ph" represents a phenyl group, "TMS" represents a trimethylsilyl group, "TMG" represents a trimethylgermyl group, and "OMe" represents a methoxy group.

The "group represented by one of Formulae 9-1 to 9-39 in which at least one hydrogen is substituted with deuterium" and the "group represented by one of Formulae 9-201 to 9-230 in which at least one hydrogen is substituted with deuterium" may each be, for example, a group represented by one of Formulae 9-501 to 9-514 and 9-601 to 9-637:

9-501

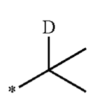

9-502

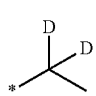

-continued 9-503

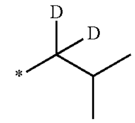

9-504

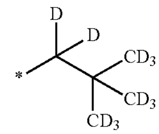

9-505

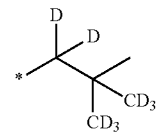

9-506

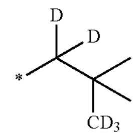

9-507

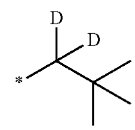

9-508

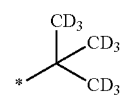

9-509

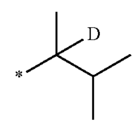

9-510

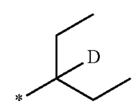

9-511

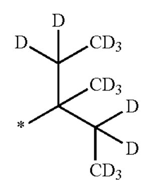

9-512

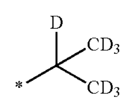

9-513

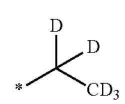

9-514

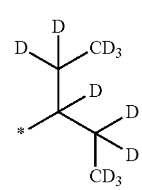

-continued
9-601
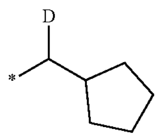
9-602
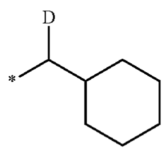
9-603
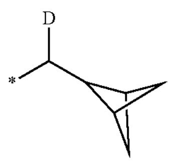
9-604
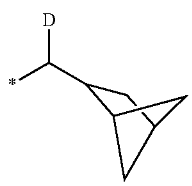
9-605
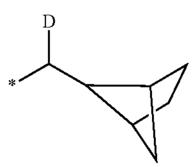
9-606
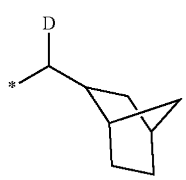
9-607
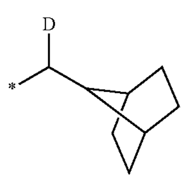
9-608
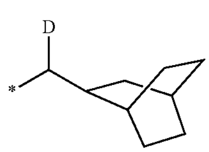
9-609
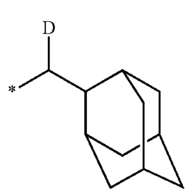
-continued
9-610
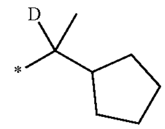
9-611
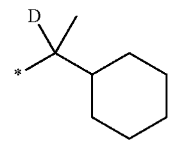
9-612
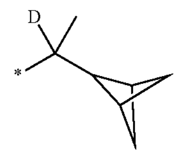
9-613
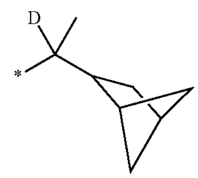
9-614
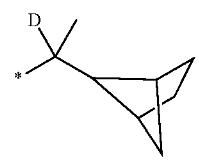
9-615
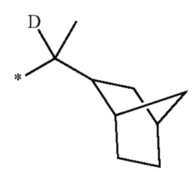
9-616
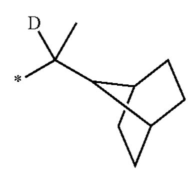
9-617
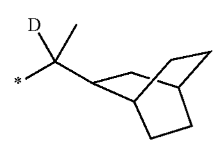
9-618
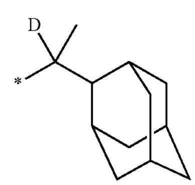
9-619
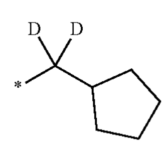

-continued
9-620
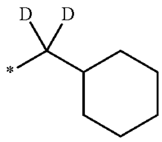
9-621
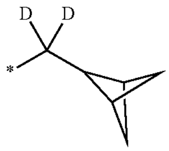
9-622
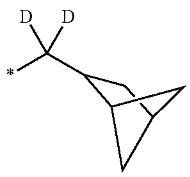
9-623
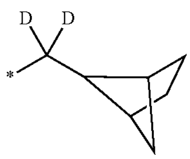
9-624
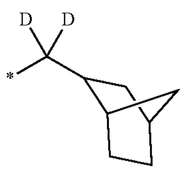
9-625
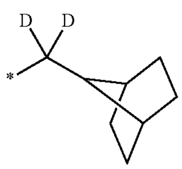
9-626
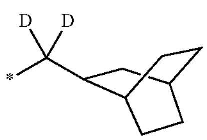
9-627
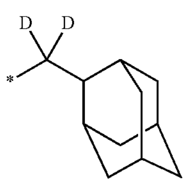
9-628
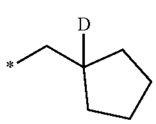
9-629
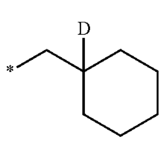
-continued
6-630
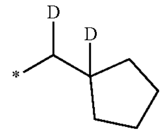
9-631
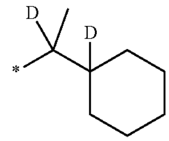
9-632
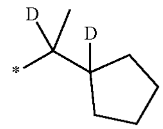
9-633
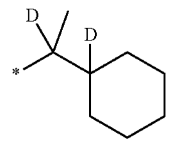
9-634
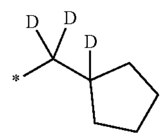
9-635
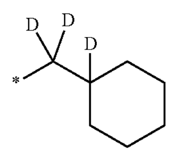
9-636
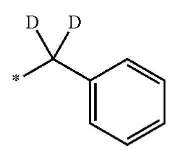
9-637
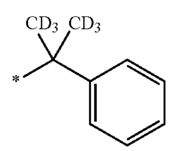
The "group represented by one of Formulae 9-1 to 9-39 in which at least one hydrogen is substituted with —F" and the "group represented by one of Formulae 9-201 to 9-230 in which at least one hydrogen is substituted with —F" may each be, for example, a group represented by one of Formulae 9-701 to 9-710:
9-701
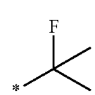
9-702
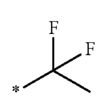

-continued
9-703
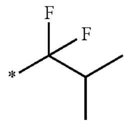
9-704
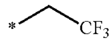
9-705
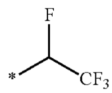
9-706
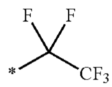
9-707
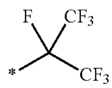
9-708
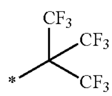
9-709
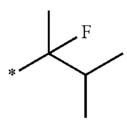
9-710
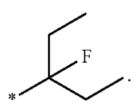
The "group represented by one of Formulae 10-1 to 10-145 in which at least one hydrogen is substituted with a deuterium" and the "group represented by one of Formulae 10-201 to 10-354 in which at least one hydrogen is substituted with deuterium" may each be, for example, a group represented by one of Formulae 10-501 to 10-553:
10-501
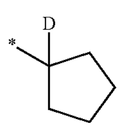
10-502
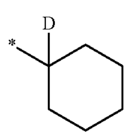
10-503
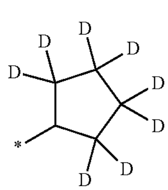
-continued
10-504
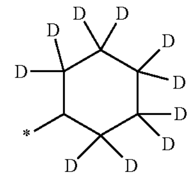
10-505
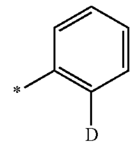
10-506
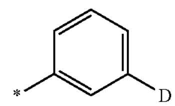
10-507
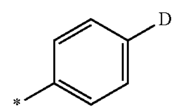
10-508
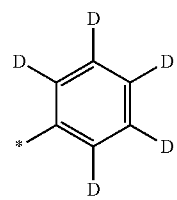
10-509
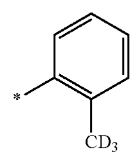
10-510
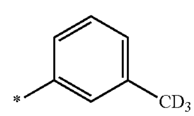
10-511
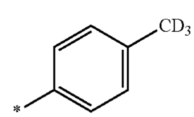
10-512
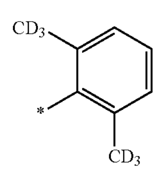
10-513
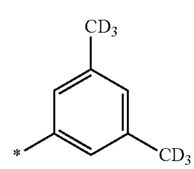

-continued
10-514
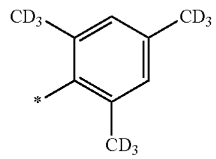
10-515
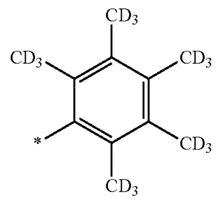
10-516
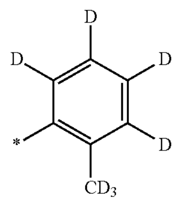
10-517
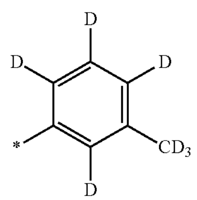
10-518
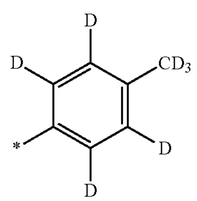
10-519
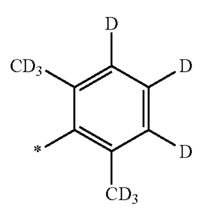
10-520
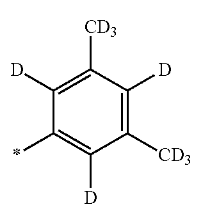
10-521
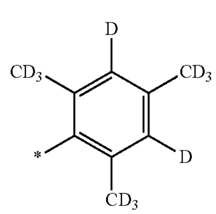
-continued
10-522
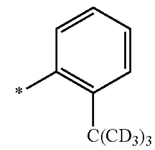
10-523
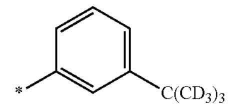
10-524
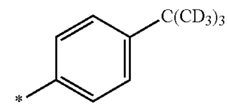
10-525
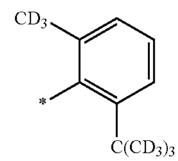
10-526
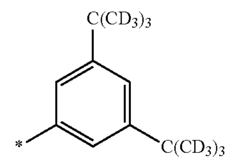
10-527
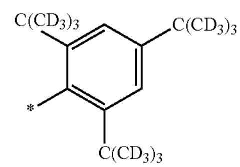
10-528
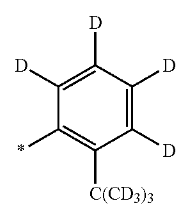
10-529
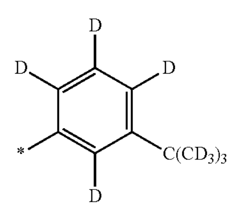
10-530
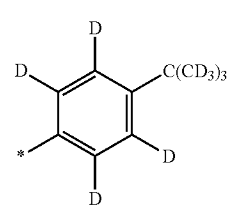

-continued
10-531
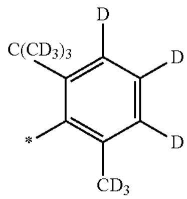
10-532
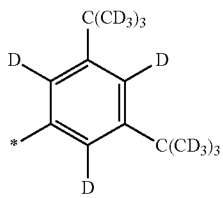
10-533
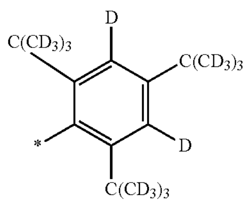
10-534
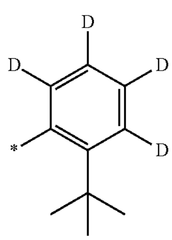
10-535
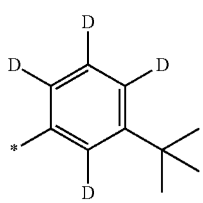
10-536
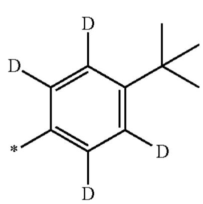
10-537
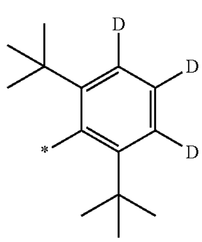
-continued
10-538
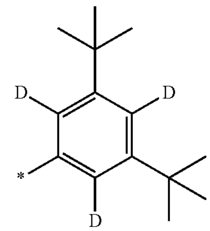
10-540
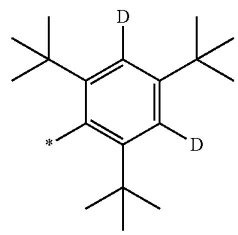
10-541
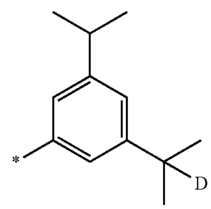
10-542
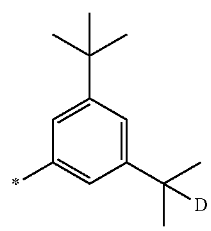
10-543
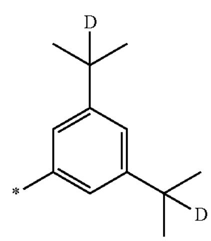
10-544
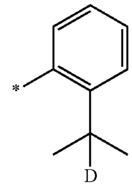
10-545
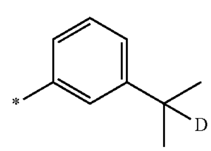

-continued
10-546
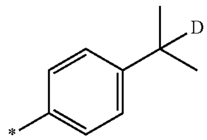
10-547
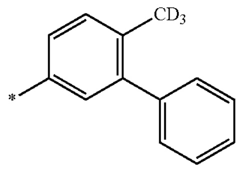
10-548
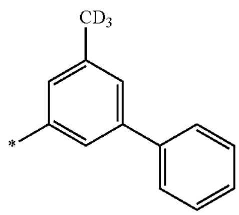
10-549
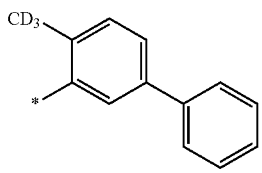
10-550
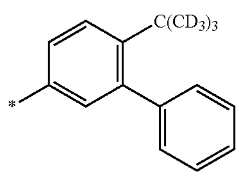
10-551
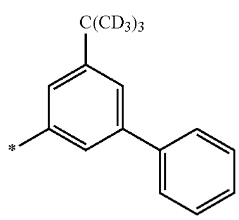
10-552
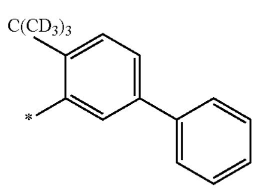
10-553
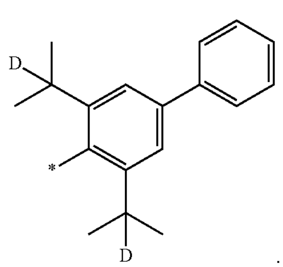
The “group represented by one of Formulae 10-1 to 10-145 in which at least one hydrogen is substituted with —F” and the “group represented by one of Formulae 10-201 to 10-354 in which at least one hydrogen is substituted with —F” may each be, for example, a group represented by one of Formulae 10-601 to 10-636:
10-601
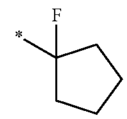
10-602
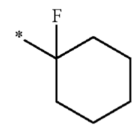
10-603
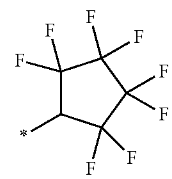
10-604
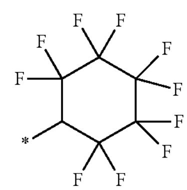
10-605
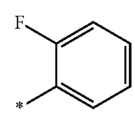
10-606
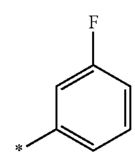
10-607
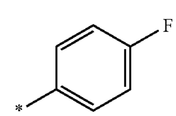
10-608
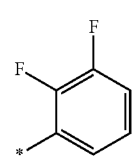
10-609
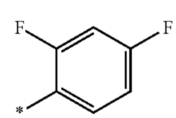
10-610
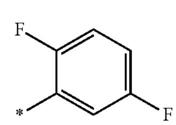

-continued
10-611
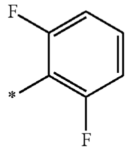
10-612
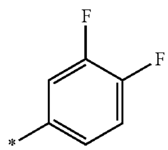
10-613
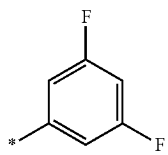
10-614
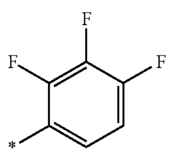
10-615
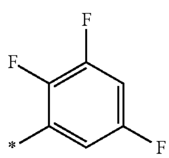
10-616
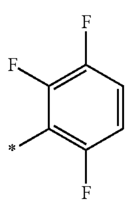
10-617
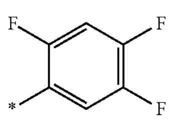
10-618
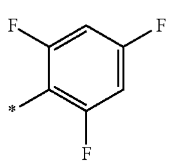
10-619
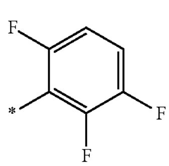
10-620
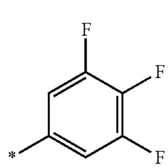
-continued
10-621
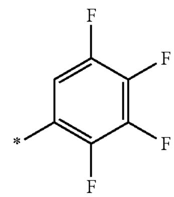
10-622
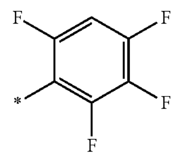
10-623
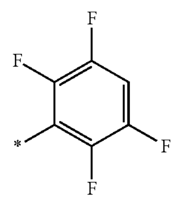
10-624
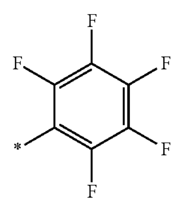
10-625
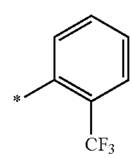
10-626
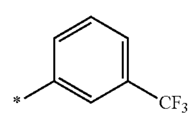
10-627
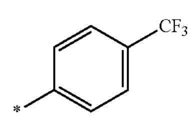
10-628
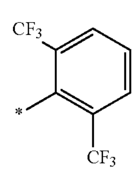
10-629
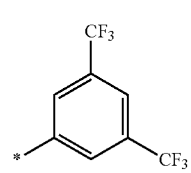

-continued 10-630

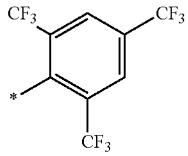

10-631

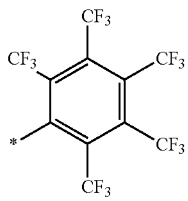

10-632

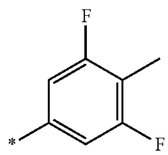

10-633

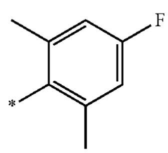

10-634

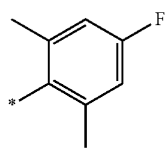

10-635

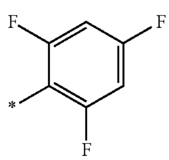

10-636

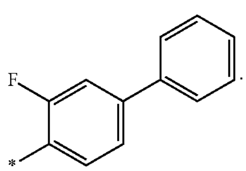

In Formulae 2A and 2B, i) at least two of $R_{21}$ to $R_{23}$ may optionally be bound to each other to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, ii) at least two of a plurality of $Z_1$(s) may optionally be bound to each other to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, iii) at least two of a plurality of $Z_2$(s) may optionally be bound to each other to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, iv) $R_{12}$ and $R_{13}$ may optionally be bound to each other to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, v) at least two of a plurality of $R_{14}$(s) may optionally be bound to each other to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, vi) at least two of $Z_0$, $Z_1$, $Z_2$, $Z_{29}$, $Z_{30}$, and $R_{11}$ to $R_{14}$ may optionally be bound to each other to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$.

$R_{10a}$ as used herein may be understood by referring to the description of $R_{14}$ provided herein.

* and *' in Formulae 2A and 2B each indicate a binding site to M in Formula 1.

In one or more embodiments, in Formula 2A, a group represented by

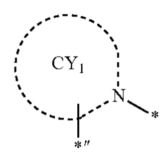

may be a group represented by one of Formulae CY1(1) to CY1(16):

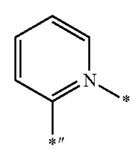

CY1(1)

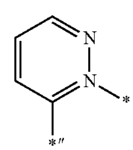

CY1(2)

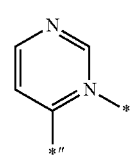

CY1(3)

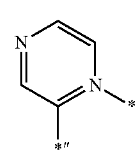

CY1(4)

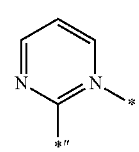

CY1(5)

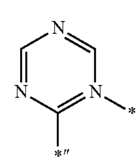

CY1(6)

-continued
CY1(7)
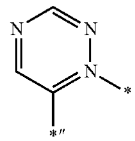
CY1(8)
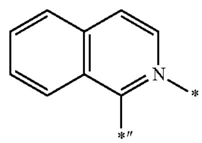
CY1(9)
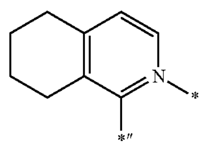
CY1(10)
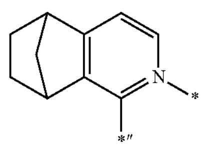
CY1(11)
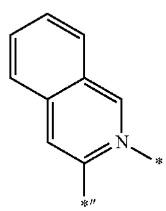
CY1(12)
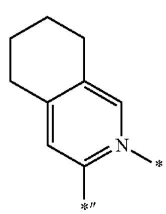
CY1(13)
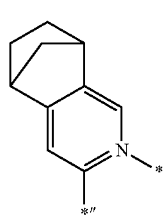
CY1(14)
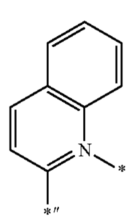
-continued
CY1(15)
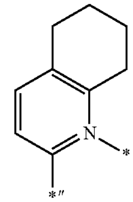
CY1(16)
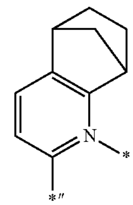
wherein, in Formulae CY1(1) to CY1(16),
* indicates a binding site to M in Formula 1, and
*" indicates a binding site to one of $T_1$ to $T_4$ in Formula 2A.
In one or more embodiments, in Formula 2A, a group represented by
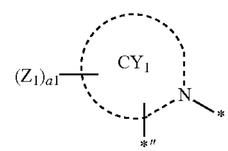
may be a group represented by one of Formulae CY1-1 to CY1-28:
CY1-1
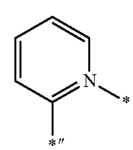
CY1-2
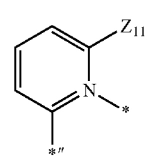
CY1-3
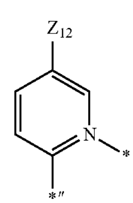
CY1-4
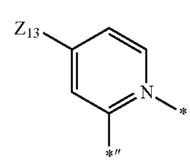

-continued
CY1-5
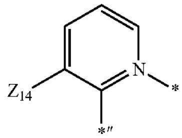
CY1-6
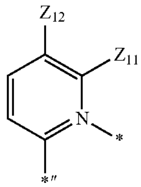
CY1-7
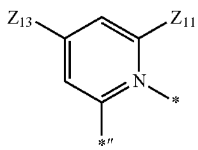
CY1-8
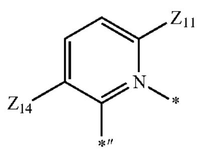
CY1-9
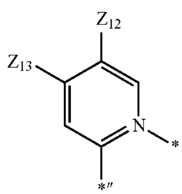
CY1-10
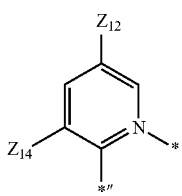
CY1-11
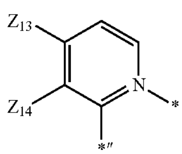
CY1-12
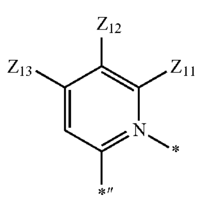
CY1-13
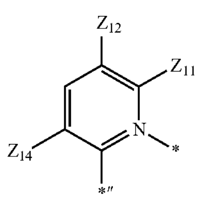
-continued
CY1-14
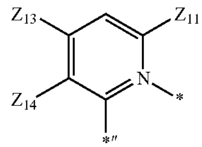
CY1-15
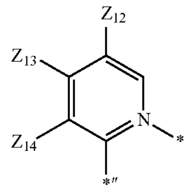
CY1-16
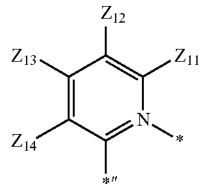
CY1-17
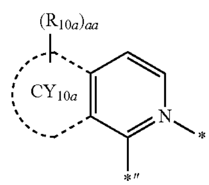
CY1-18
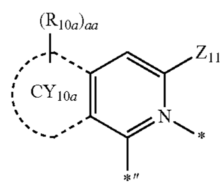
CY1-19
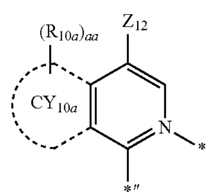
CY1-20
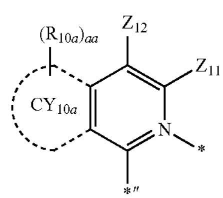
CY1-21
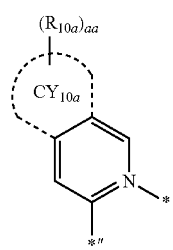

CY1-22

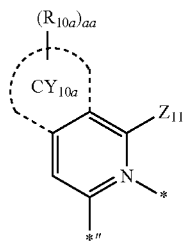

CY1-23

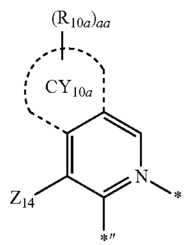

CY1-24

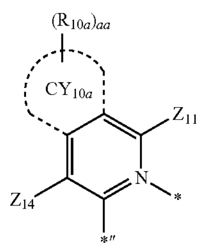

CY1-25

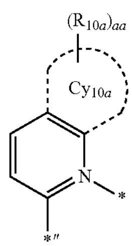

CY1-26

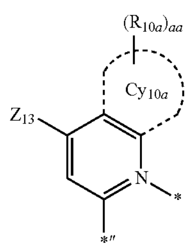

CY1-27

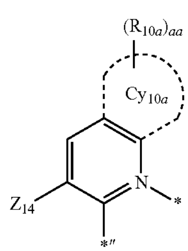

CY1-28

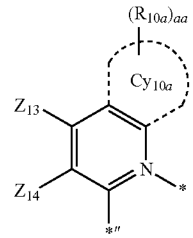

wherein, in Formulae CY1-1 to CY1-28, $Z_{11}$ to $Z_{14}$ may each be same as described in connection with $Z_1$ provided herein, wherein $Z_{11}$ to $Z_{14}$ may not each be hydrogen, ring $CY_{10a}$ may be a $C_5$-$C_{30}$ carbocyclic group or a $C_1$-$C_{30}$ heterocyclic group, $R_{10a}$ may be the same as described herein, aa may be an integer from 0 to 10,

* indicates a binding site to M in Formula 1, and

*" indicates a binding site to one of $T_1$ to $T_4$ in Formula 2A.

In one or more embodiments, ring $CY_{10a}$ may be a cyclohexane group, a norbornane group, a benzene group, or a naphthalene group.

In one or more embodiments, in Formula 2A, a group represented by

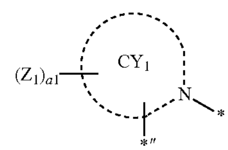

may be a group represented by one of Formulae CY1-1, CY1-4, CY1-7, CY1-9, CY1-11, CY1-12, and CY1-14 to CY1-24.

In one or more embodiments, in Formula 2A, a group represented by

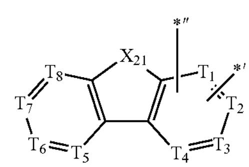

may be a group represented by one of Formulae CY2-1 to CY2-6:

CY2-1

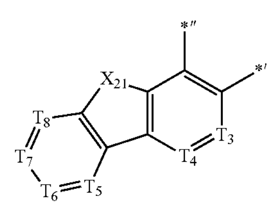

-continued

CY2-2

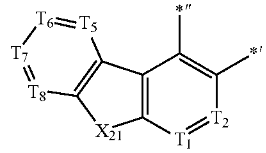

CY2-3

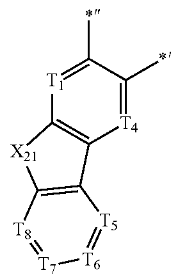

CY2-4

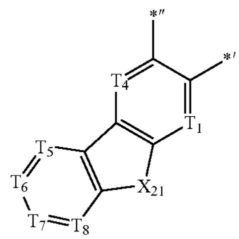

CY2-5

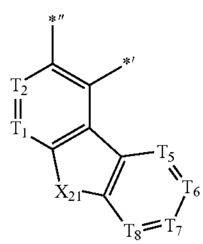

CY2-6

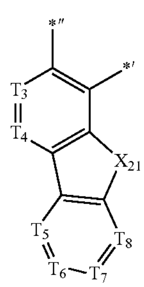

wherein, in Formulae CY2-1 to CY2-6, $T_1$ to $T_8$ may each independently be C or N, the number of N(s) among $T_3$ to $T_8$ in Formulae CY2-1 and CY2-6 may be 0 or 1, the number of N(s) among $T_1$, $T_2$, $T_5$, $T_6$, $T_7$, and $T_8$ in Formulae CY2-2 and CY2-5 may be 0 or 1, the number of N(s) among $T_1$, $T_4$, $T_5$, $T_6$, $T_7$, and $T_8$ in Formulae CY2-3 and CY2-4 may be 0 or 1, $X_{21}$ may be the same as described herein,

*" indicates a binding site to ring $CY_1$ in Formula 2A, and

*' indicates a binding site to M in Formula 1.

In one or more embodiments, a group represented by

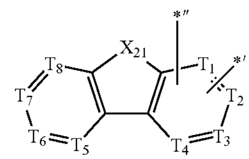

in Formula 2A in the organometallic compound represented by Formula 1 may be a group represented by one of Formulae CY2-1 to CY2-6, a) $X_1$ in Formula 2B may be Si, $R_{12}$ in Formula 2B may not be hydrogen and a methyl group, and the number of N(s) among $T_1$ to $T_8$ in Formulae CY2-1 to CY2-6 may be 0, b) $X_1$ in Formula 2B may be Si or Ge, $R_{12}$ in Formula 2B may be hydrogen, a methyl group, or a deuterated methyl group, and the number of N(s) among $T_1$ to $T_8$ in Formulae CY2-1 to CY2-6 may be 0, c) $X_1$ in Formula 2B may be Si or Ge, $R_{12}$ in Formula 2B may be hydrogen, a methyl group, or a deuterated methyl group, and the number of N(s) among $T_3$ to $T_8$ in Formulae CY2-1 and CY2-6 may be 1, d) $X_1$ in Formula 2B may be Si or Ge, $R_{12}$ in Formula 2B may be hydrogen, a methyl group, or a deuterated methyl group, and the number of N(s) among $T_1$, $T_2$, $T_5$, $T_6$, $T_7$ and $T_8$ in Formulae CY2-2 and CY2-5 may be 1, or e) $X_1$ in Formula 2B may be Si or Ge, $R_{12}$ in Formula 2B may be hydrogen, a methyl group, or a deuterated methyl group, and the number of N(s) among $T_1$, $T_4$, $T_5$, $T_6$, $T_7$ and $T_8$ in Formulae CY2-3 and CY2-4 may be 1.

In one or more embodiments, in Formula 2A, a group represented by

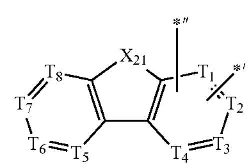

may be a group represented by one of Formulae CY2(1) to CY2(6):

CY2(1)

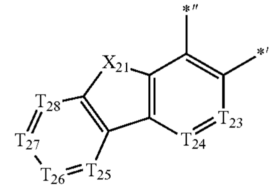

CY2(2)

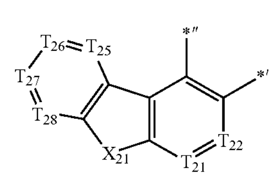

-continued

CY2(3)

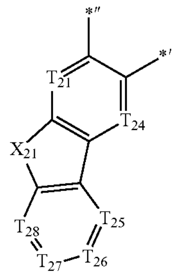

CY2(4)

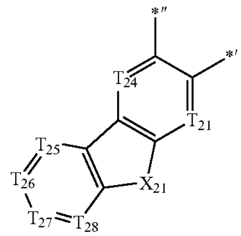

CY2(5)

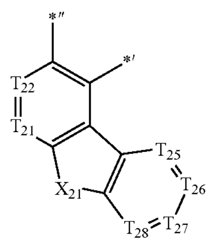

CY2(6)

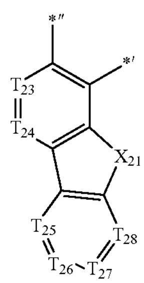

wherein, in Formulae CY2(1) to CY2(6), $T_{21}$ may be N, C($Z_{21}$), or C($Ar_{21}$), $T_{22}$ may be N, ($Z_{22}$), or C($Ar_{22}$), $T_{23}$ may be N, C($Z_{23}$), or C($Ar_{23}$), $T_{24}$ may be N, C($Z_{24}$), or C($Ar_{24}$), $T_{25}$ may be N, C($Z_{25}$), or C($Ar_{25}$), $T_{26}$ may be N, C($Z_{26}$), or C($Ar_{26}$), $T_{27}$ may be N, C($Z_{27}$), or C($Ar_{27}$), and $T_{28}$ may be N, C($Z_{28}$), or C($Ar_{28}$), the number of N(s) among $T_3$ to $T_8$ in Formulae CY2-1 and CY2-6 may be 0 or 1, the number of N(s) among $T_1$, $T_2$, $T_5$, $T_6$, $T_7$, and $T_8$ in Formulae CY2-2 and CY2-5 may be 0 or 1, the number of N(s) among $T_1$, $T_4$, $T_5$, $T_6$, $T_7$, and $T_8$ in Formulae CY2-3 and CY2-4 may be 0 or 1, $X_{21}$ may be the same as described herein, $Z_{21}$ to $Z_{28}$ may each be the same as described in connection with $Z_2$ provided herein, $Ar_{21}$ to $Ar_{28}$ may each be the same as described in connection with Are provided herein, Formulae CY2-1 and CY2-6 may include at least one of $Ar_{23}$ to $Ar_{28}$, Formulae CY2-2 and CY2-5 may include at least one of $Ar_{21}$, $Ar_{22}$, $Ar_{25}$, $Ar_{26}$, $Ar_{27}$, and $Ar_{28}$, and Formulae CY2-3 and CY2-4 may include at least one of $Ar_{21}$, $Ar_{24}$, $Ar_{25}$, $Ar_{26}$, $Ar_{27}$, and $Ar_{28}$,

*" indicates a binding site to ring $CY_1$ in Formula 2A, and *' indicates a binding site to M in Formula 1.

In one or more embodiments, in Formula 2A, a group represented by

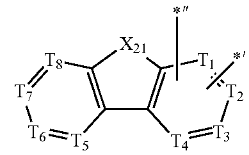

may be a group represented by one of Formulae CY2(1) to CY2(6), and at least one of Conditions 1-1 to 1-8 may be satisfied:

Condition 1-1 wherein, $T_{28}$ in Formulae CY2(1) to CY2(6) may be C($Ar_{28}$)

Condition 1-2 wherein, $T_{27}$ in Formulae CY2(1) to CY2(6) may be C($Ar_{27}$)

Condition 1-3 wherein, $T_{26}$ in Formulae CY2(1) to CY2(6) may be C($Ar_{26}$)

Condition 1-4 wherein, $T_{25}$ in Formulae CY2(1) to CY2(6) may be C($Ar_{25}$)

Condition 1-5 wherein, $T_{24}$ in Formulae CY2(1), CY2(3), CY2(4), and CY2(6) may be C($Ar_{24}$)

Condition 1-6 wherein, $T_{23}$ in Formulae CY2(1) and CY2(6) may be C($Ar_{23}$)

Condition 1-7 wherein, $T_{22}$ in Formulae CY2(2) and CY2(5) may be C($Ar_{22}$)

Condition 1-8 wherein, $T_{21}$ in Formulae CY2(2) to CY2(5) may be C($Ar_2i$)

In one or more embodiments, in Formula 2A, a group represented by

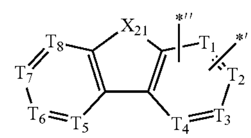

may be a group represented by one of Formulae CY2(1) to CY2(6), and at least one of Conditions 2-1 to 2-8 may be satisfied:

Condition 2-1 wherein, $T_{28}$ in Formulae CY2(1) to CY2(6) may be C($Z_{28}$), and $Z_{28}$ may not be hydrogen Condition 2-2 wherein, $T_{27}$ in Formulae CY2(1) to CY2(6) may be C($Z_{27}$), and $Z_{27}$ may not be hydrogen Condition 2-3 wherein, $T_{26}$ in Formulae CY2(1) to CY2(6) may be C($Z_{26}$), and $Z_{26}$ may not be hydrogen Condition 2-4 wherein, $T_{25}$ in Formulae CY2(1) to CY2(6) may be C($Z_{25}$), and $Z_{25}$ may not be hydrogen, Condition 2-5 wherein, $T_{24}$ in Formulae CY2(1), CY2(3), CY2(4), and CY2(6) may be C($Z_{24}$), and $Z_{24}$ may not be hydrogen Condition 2-6 wherein, $T_{23}$ in Formulae CY2(1) and CY2(6) may be $C(Z_{23})$, and $Z_{23}$ may not be hydrogen Condition 2-7 wherein, $T_{22}$ in Formulae CY2(2) and CY2(5) may be $C(Z_{22})$, and $Z_{22}$ may not be hydrogen Condition 2-8 wherein, $T_{21}$ in Formulae CY2(2) to CY2(5) may be $C(Z_{21})$, and $Z_{21}$ may not be hydrogen In one or more embodiments, in Formula 2A, a group represented by

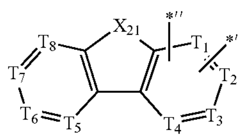

may be a group represented by one of Formulae CY2(1) to CY2(6), and one of Conditions 3-1 to 3-9 may be satisfied:

Condition 3-1

$T_{21}$ to $T_{28}$ in Formulae CY2(1) to CY2(6) may not each be N

Condition 3-2

$T_{28}$ in Formulae CY2(1) to CY2(6) may be N

Condition 3-3

$T_{27}$ in Formulae CY2(1) to CY2(6) may be N

Condition 3-4

$T_{26}$ in Formulae CY2(1) to CY2(6) may be N

Condition 3-5

$T_{26}$ in Formulae CY2(1) to CY2(6) may be N

Condition 3-6 wherein, $T_{24}$ in Formulae CY2(1), CY2(3), CY2(4), and CY2(6) may be N

Condition 3-7

$T_{23}$ in Formulae CY2(1) and CY2(6) may be N

Condition 3-8

$T_{22}$ in Formulae CY2(2) and CY2(5) may be N

Condition 3-9

$T_{21}$ in Formulae CY2(2) to CY2(5) may be N

In one or more embodiments, a group represented by Formula CY2(1) may be a group represented by one of Formulae CY2(1)-1 to CY2(1)-4, a group represented by Formula CY2(2) may be a group represented by one of Formulae CY2(2)-1 to CY2(2)-4, a group represented by Formula CY2(3) may be a group represented by one of Formulae CY2(3)-1 to CY2(3)-3, a group represented by Formula CY2(4) may be a group represented by one of Formulae CY2(4)-1 to CY2(4)-3, a group represented by Formula CY2(5) may be a group represented by one of Formulae CY2(5)-1 to CY2(5)-4, and a group represented by Formula CY2(6) may be a group represented by one of Formulae CY2(6)-1 to CY2(6)-4:

CY2(1)-1

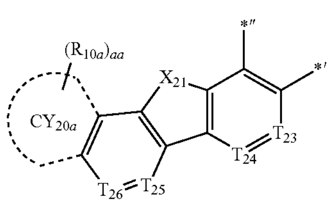

-continued

CY2(1)-2

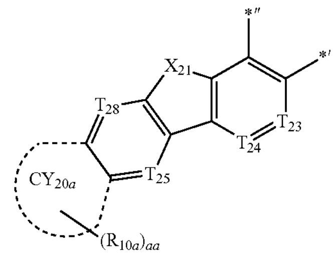

CY2(1)-3

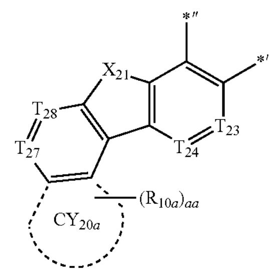

CY2(1)-4

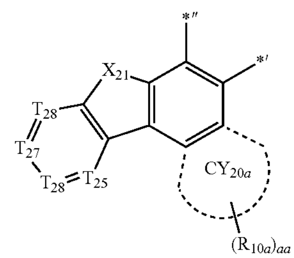

CY2(2)-1

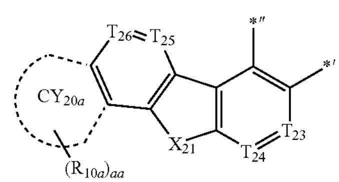

CY2(2)-2

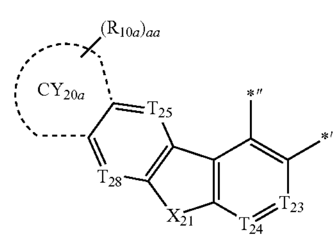

CY2(2)-3

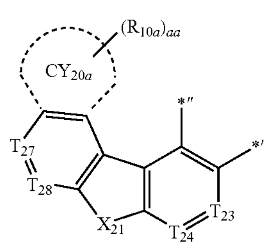

-continued
CY2(2)-4
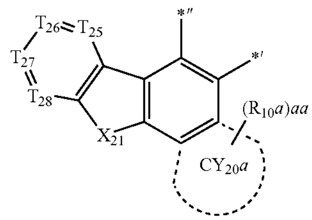
CY2(3)-1
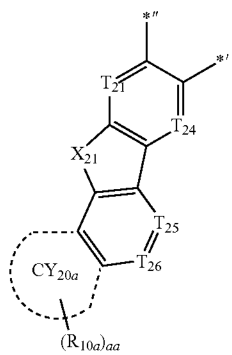
CY2(3)-2
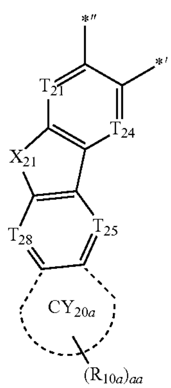
CY2(3)-3
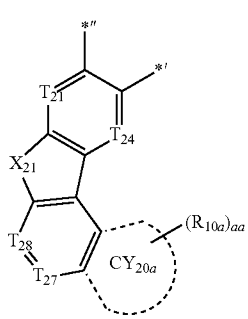
CY2(4)-1
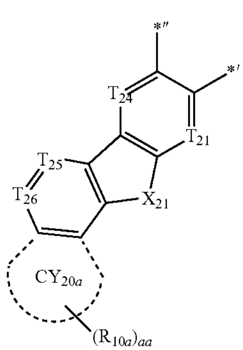
-continued
CY2(4)-2
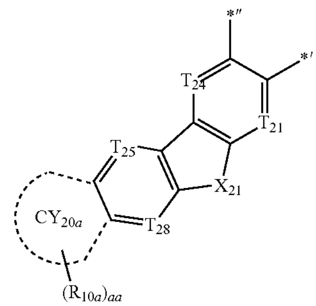
CY2(4)-3
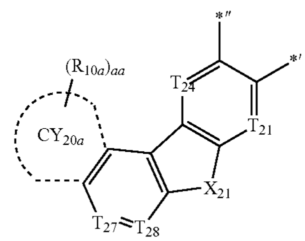
CY2(5)-1
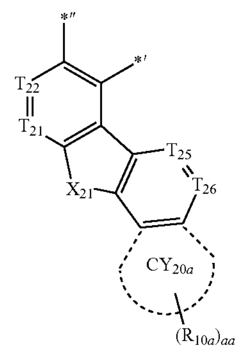
CY2(5)-2
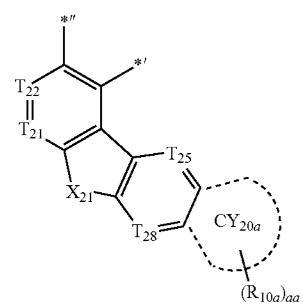
CY2(5)-3
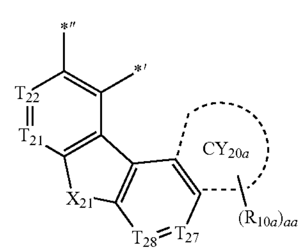

-continued

CY2(5)-4

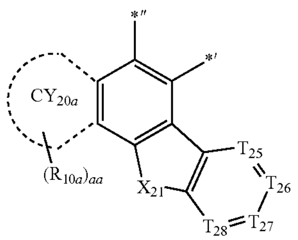

CY2(6)-1

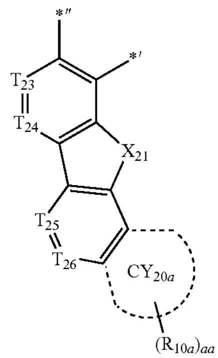

CY2(6)-2

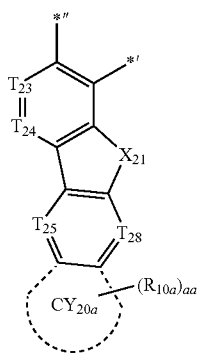

CY2(6)-3

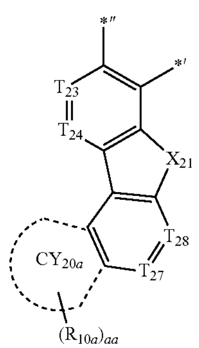

CY2(6)-4

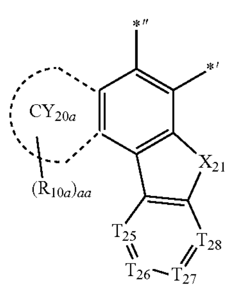

wherein, in Formulae CY2(1)-1 to CY2(1)-4, CY2(2)-1 to CY2(2)-4, CY2(3)-1 to CY2(3)-3, CY2(4)-1 to CY2(4)-3, CY2(5)-1 to CY2(5)-4, and CY2(6)-1 to CY2(6)-4, $T_{21}$ to $T_{28}$, $X_{21}$, *", and *' may respectively be understood by referring to the descriptions of $T_{21}$ to $T_{28}$, $X_{21}$, *", and *' in Formulae CY2(1) to CY2(6) provided herein, ring $CY_{20a}$ may be a $C_5$-$C_{30}$ carbocyclic group or a $C_1$-$C_{30}$ heterocyclic group, $R_{10a}$ may be the same as described herein, and aa may be an integer from 0 to 10.

In one or more embodiments, ring $CY_{20a}$ may be a cyclohexane group, a norbornane group, a benzene group, or a naphthalene group.

In one or more embodiments, in Formula 2A, a group represented by

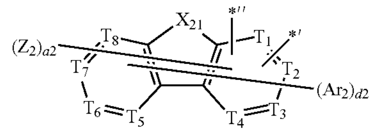

may be a group represented by one of Formulae CY2-1-1 to CY2-1-65, CY2-2-1 to CY2-2-65, CY2-3-1 to CY2-3-65, CY2-4-1 to CY2-4-65, CY2-5-1 to CY2-5-65, and CY2-6-1 to CY2-6-65:

CY2-1-1

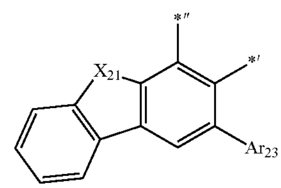

CY2-1-2

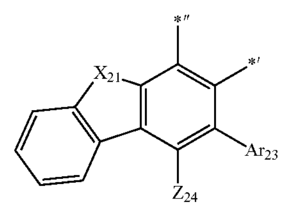

CY2-1-3

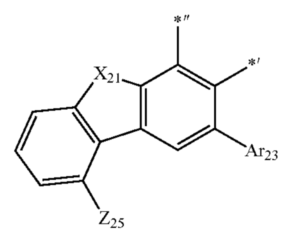

CY2-1-4

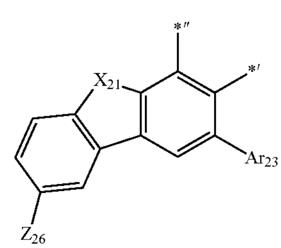

CY2-1-5
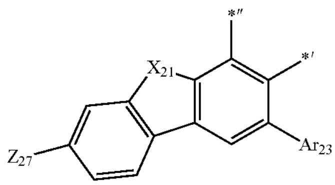
CY2-1-6
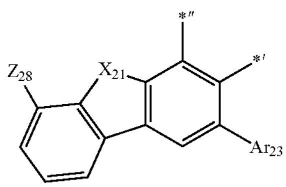
CY2-1-7
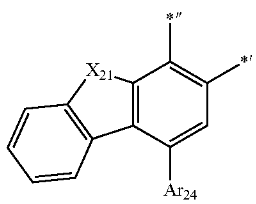
CY2-1-8
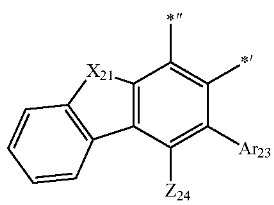
CY2-1-9
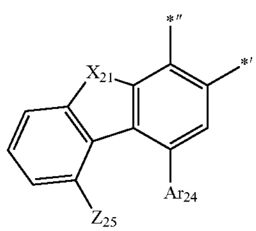
CY2-1-10
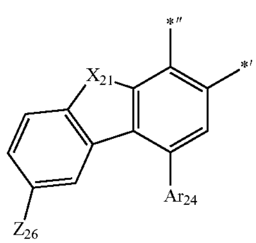
CY2-1-11
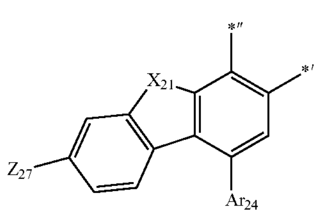
CY2-1-12
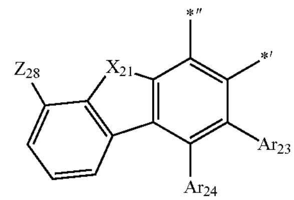
CY2-1-13
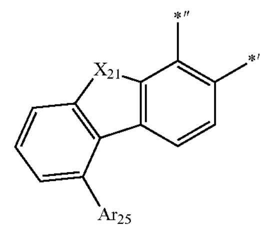
CY2-1-14
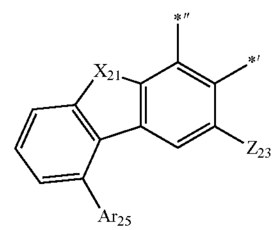
CY2-1-15
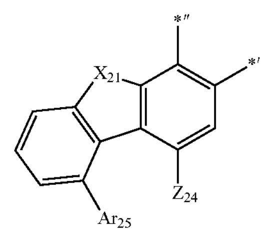
CY2-1-16
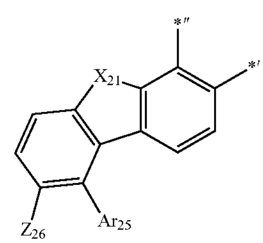
CY2-1-17
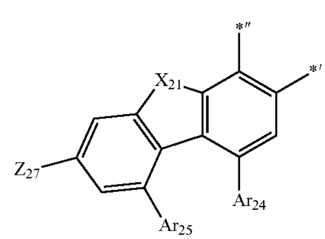
CY2-1-18
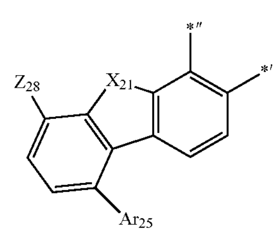

-continued
CY2-1-19
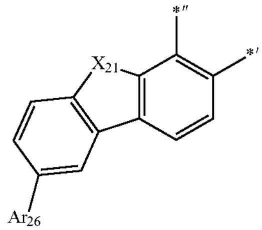
CY2-1-20
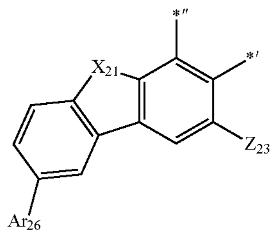
CY2-1-21
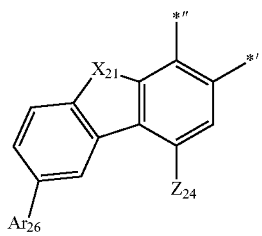
CY2-1-22
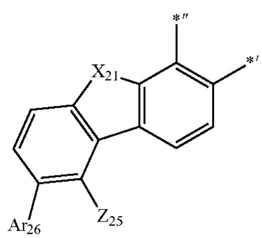
CY2-1-23
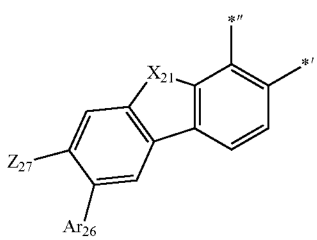
CY2-1-24
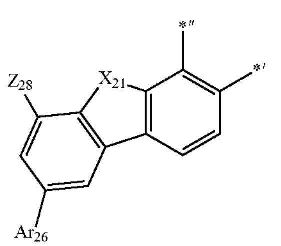
CY2-1-25
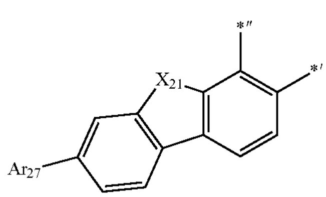
-continued
CY2-1-26
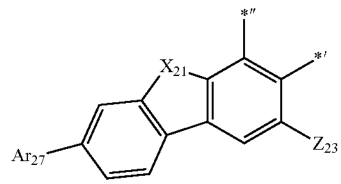
CY2-1-27
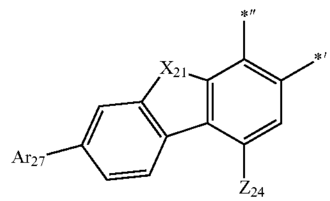
CY2-1-28
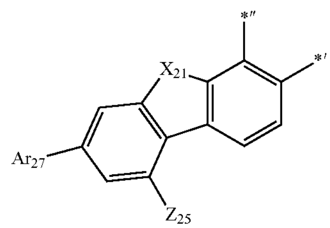
CY2-1-29
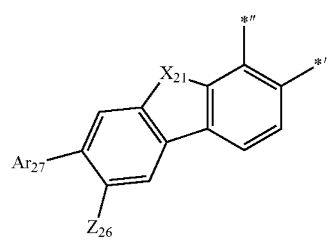
CY2-1-30
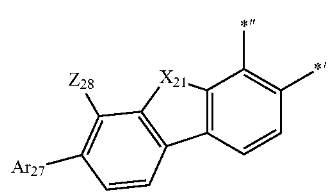
CY2-1-31
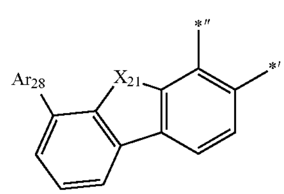
CY2-1-32
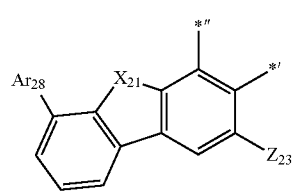

-continued
CY2-1-33
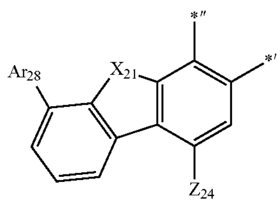
CY2-1-34
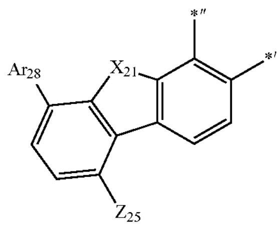
CY2-1-35
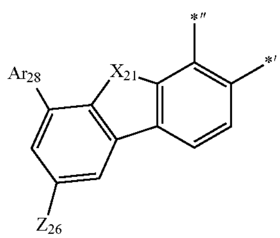
CY2-1-36
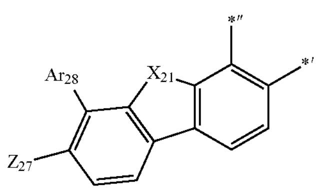
CY2-1-37
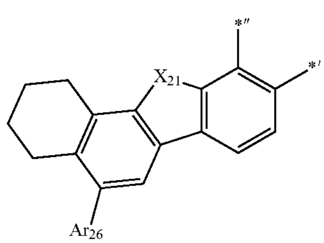
CY2-1-38
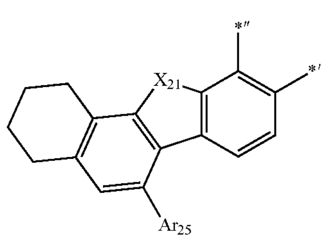
CY2-1-39
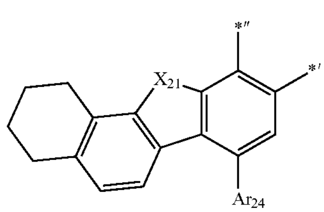
-continued
CY2-1-40
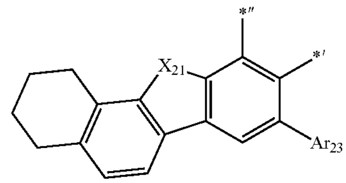
CY2-1-41
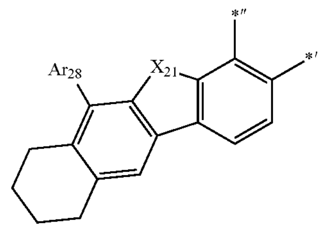
CY2-1-42
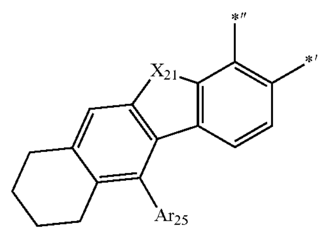
CY2-1-43
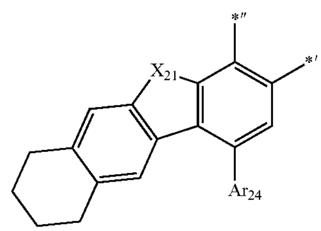
CY2-1-44
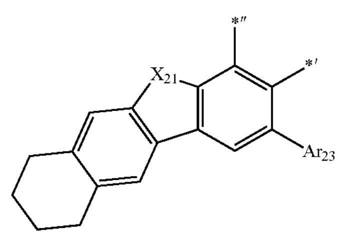
CY2-1-45
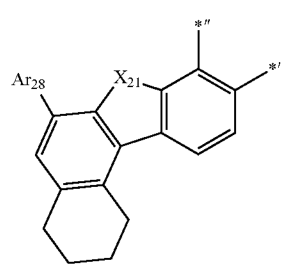
CY2-1-46
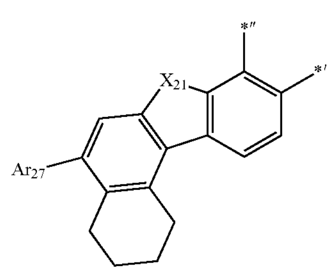

CY2-1-47
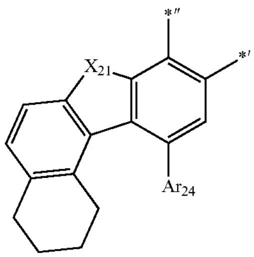
CY2-1-48
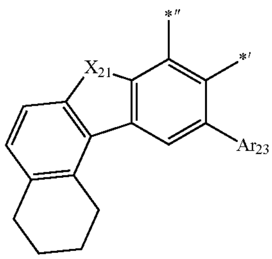
CY2-1-49
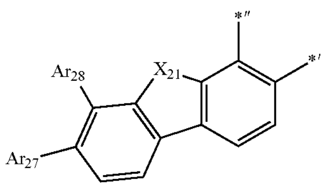
CY2-1-50
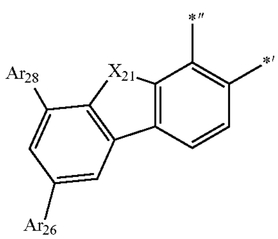
CY2-1-51
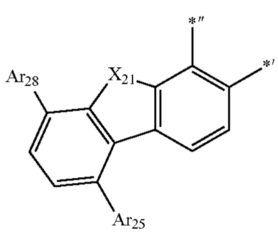
CY2-1-52
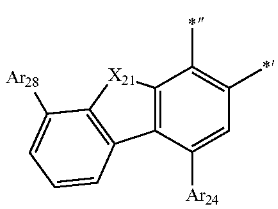
CY2-1-53
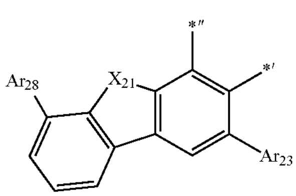
CY2-1-54
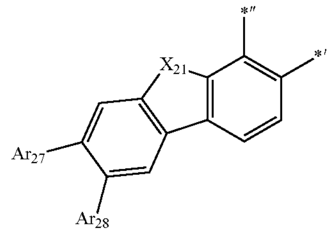
CY2-1-55
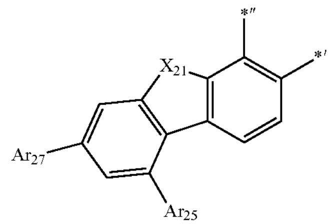
CY2-1-56
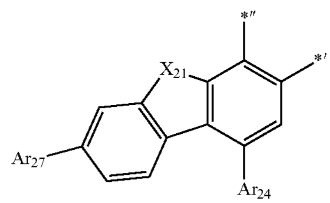
CY2-1-57
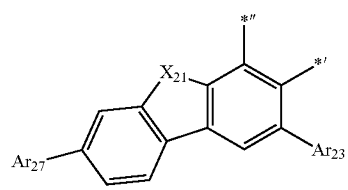
CY2-1-58
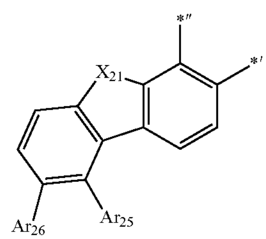
CY2-1-59
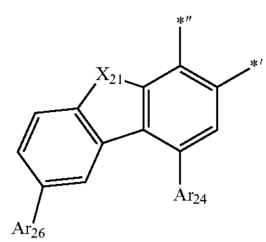
CY2-1-60
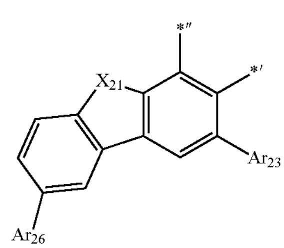

-continued
CY2-1-61
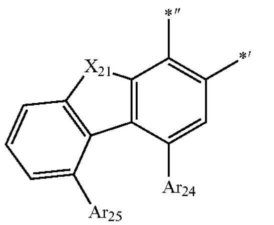
CY2-1-62
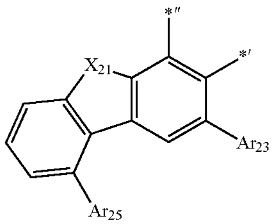
CY2-1-63
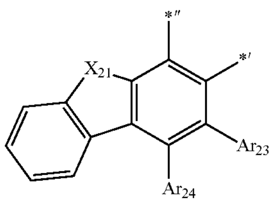
CY2-1-64
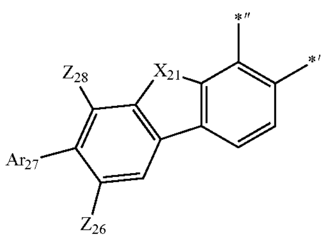
CY2-1-65
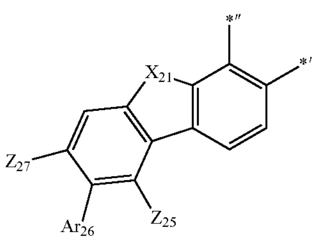
CY2-2-1
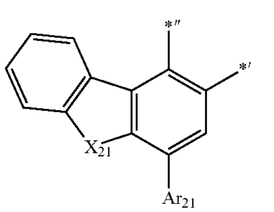
CY2-2-2
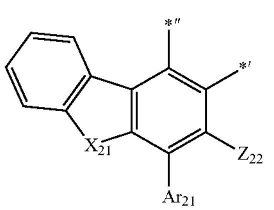
-continued
CY2-2-3
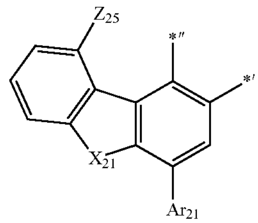
CY2-2-4
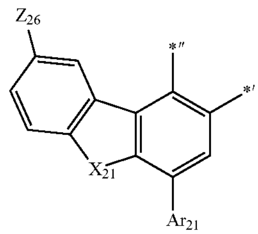
CY2-2-5
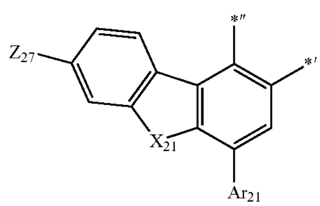
CY2-2-6
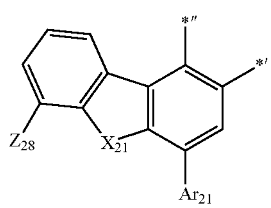
CY2-2-7
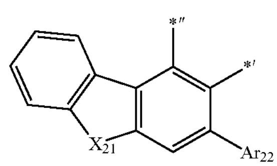
CY2-2-8
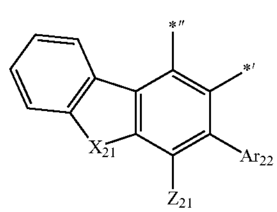
CY2-2-9
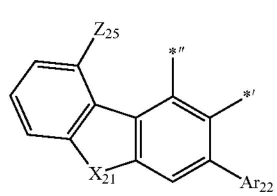

CY2-2-10
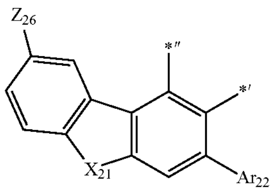
CY2-2-11
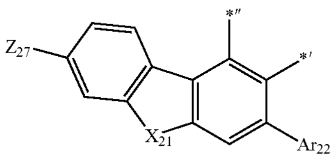
CY2-2-12
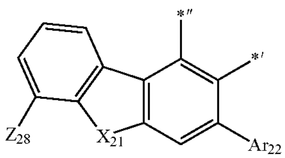
CY2-2-13
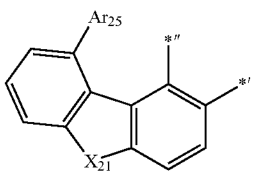
CY2-2-14
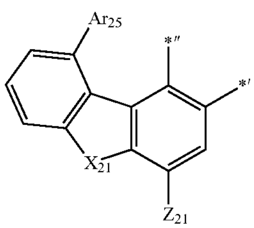
CY2-2-15
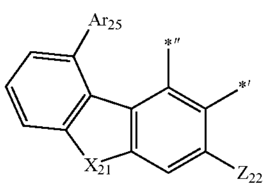
CY2-2-16
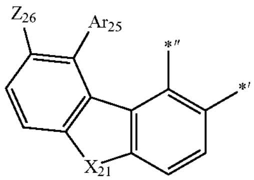
CY2-2-17
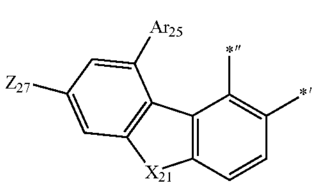
CY2-2-18
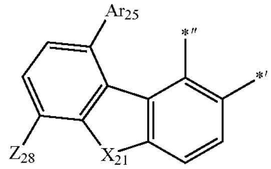
CY2-2-19
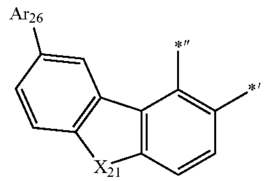
CY2-2-20
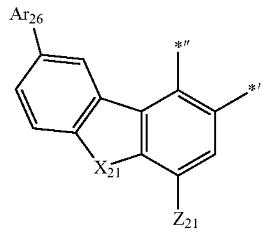
CY2-2-21
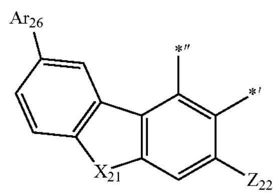
CY2-2-22
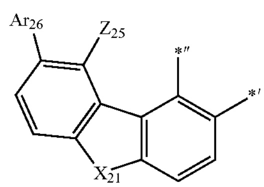
CY2-2-23
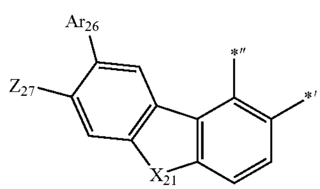
CY2-2-24
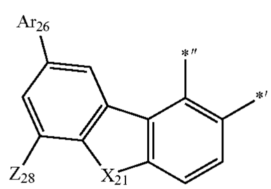
CY2-2-25
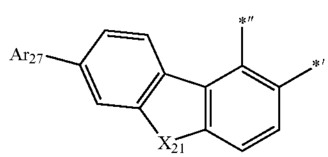

CY2-2-26
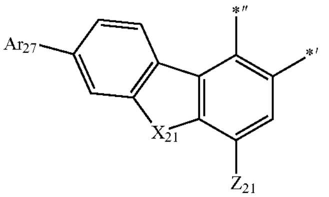
CY2-2-27
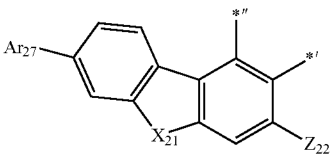
CY2-2-28
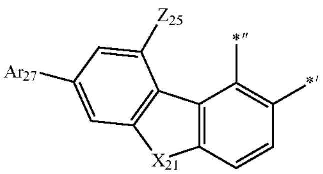
CY2-2-29
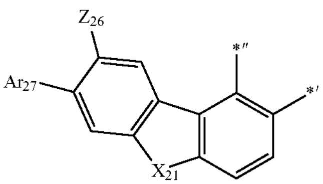
CY2-2-30
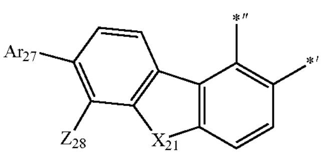
CY2-2-31
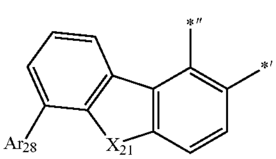
CY2-2-32
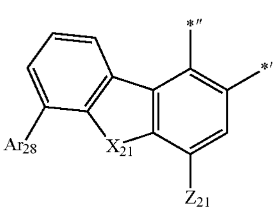
CY2-2-33
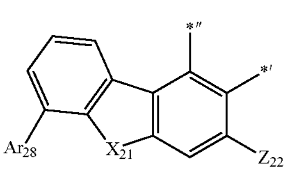
CY2-2-34
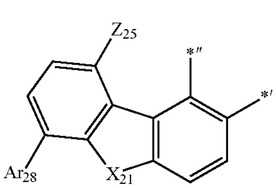
CY2-2-35
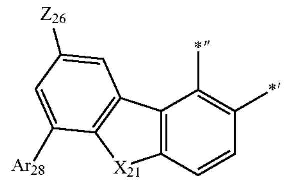
CY2-2-36
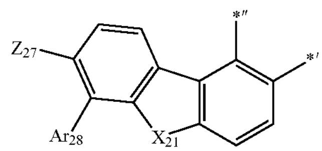
CY2-2-37
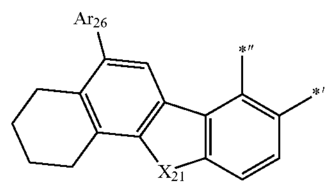
CY2-2-38
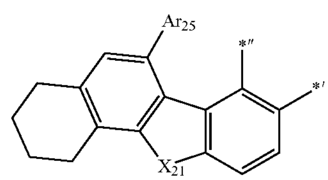
CY2-2-39
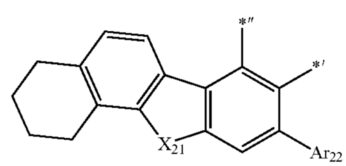
CY2-2-40
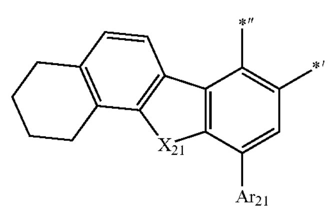
CY2-2-41
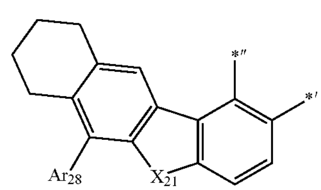
CY2-2-42
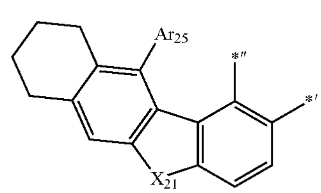

-continued
CY2-2-43
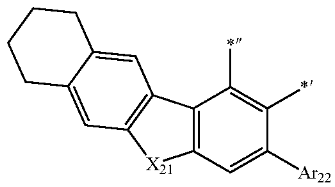
CY2-2-44
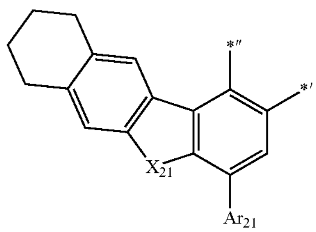
CY2-2-45
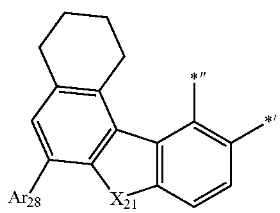
CY2-2-46
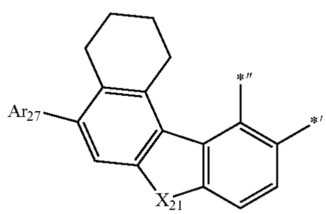
CY2-2-47
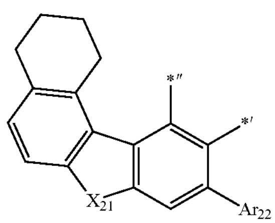
CY2-2-48
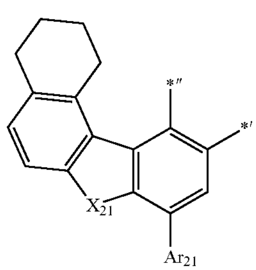
CY2-2-49
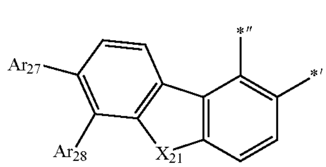
-continued
CY2-2-50
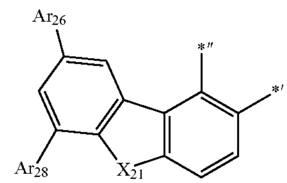
CY2-2-51
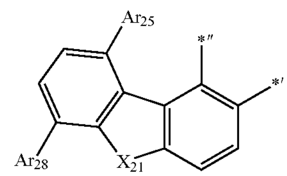
CY2-2-52
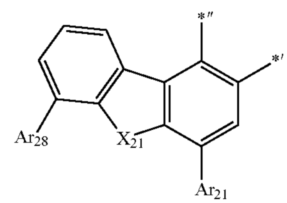
CY2-2-53
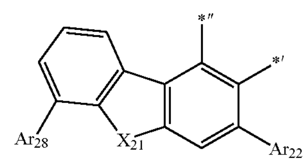
CY2-2-54
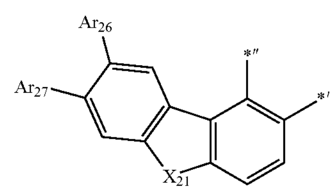
CY2-2-55
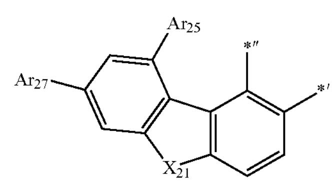
CY2-2-56
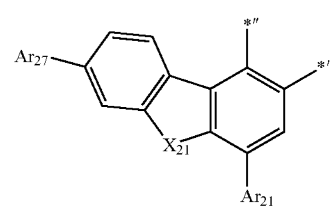
CY2-2-57
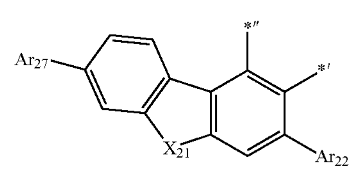

-continued
CY2-2-58
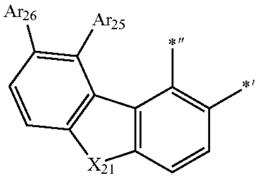
CY2-2-59
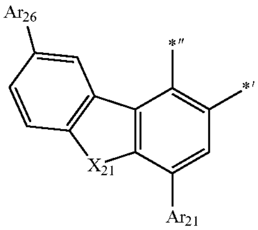
CY2-2-60
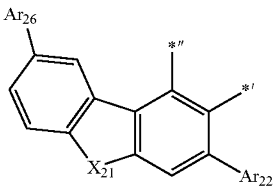
CY2-2-61
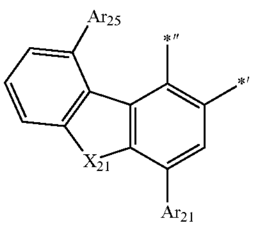
CY2-2-62
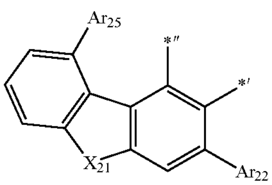
CY2-2-63
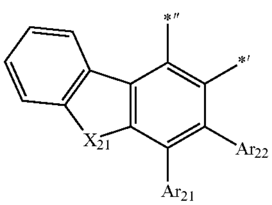
CY2-2-64
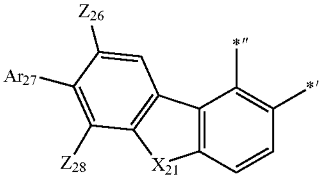
CY2-2-65
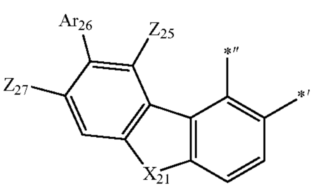
-continued
CY2-3-1
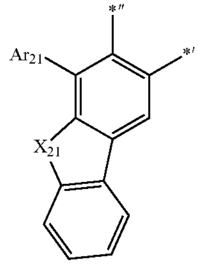
CY2-3-2
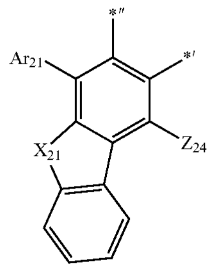
CY2-3-3
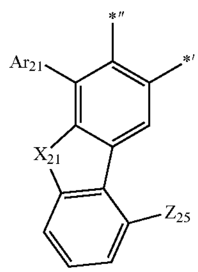
CY2-3-4
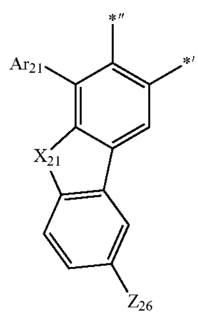
CY2-3-5
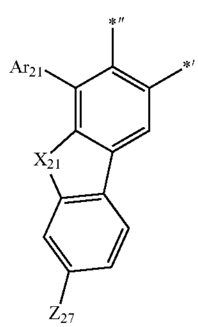

CY2-3-6
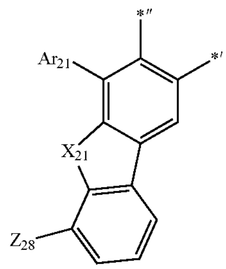
CY2-3-7
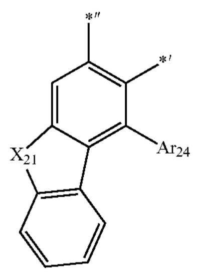
CY2-3-8
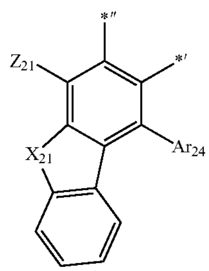
CY2-3-9
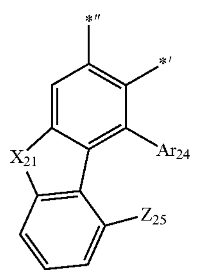
CY2-3-10
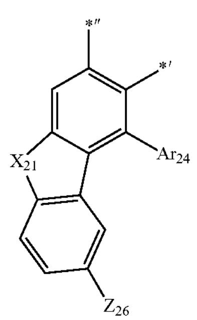
CY2-3-11
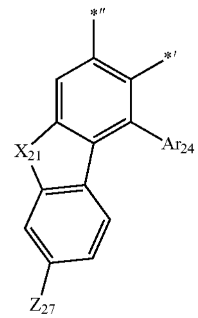
CY2-3-12
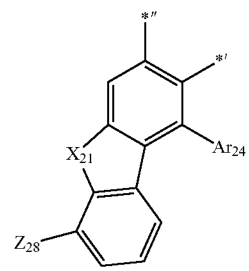
CY2-3-13
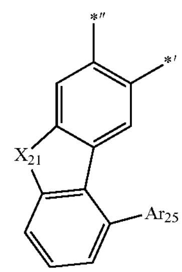
CY2-3-14
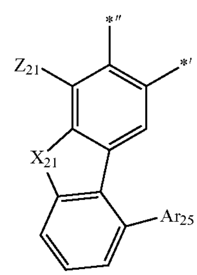
CY2-3-15
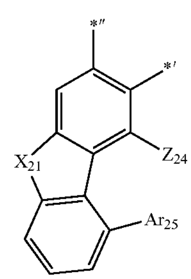

CY2-3-16
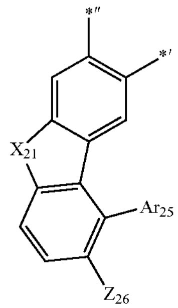
CY2-3-17
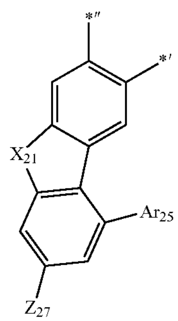
CY2-3-18
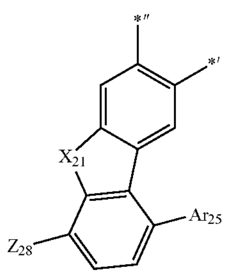
CY2-3-19
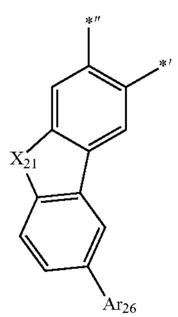
CY2-3-20
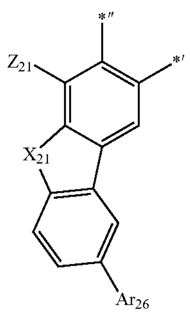
CY2-3-21
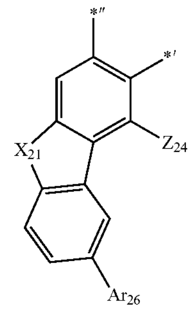
CY2-3-22
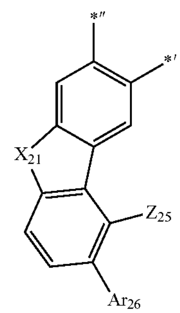
CY2-3-23
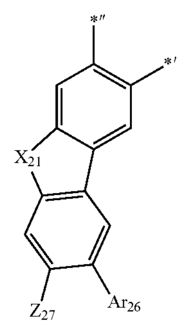
CY2-3-24
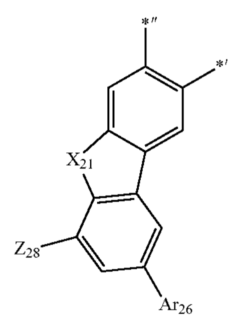
CY2-3-25
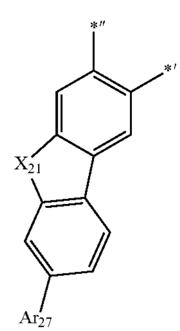

-continued
CY2-3-26
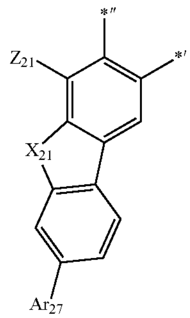
CY2-3-27
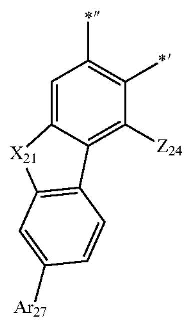
CY2-3-28
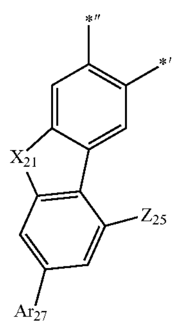
CY2-3-29
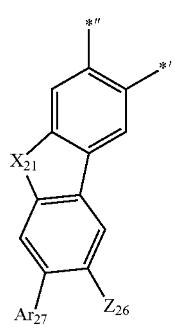
CY2-3-30
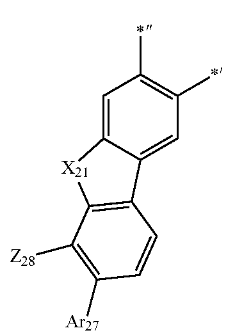
-continued
CY2-3-31
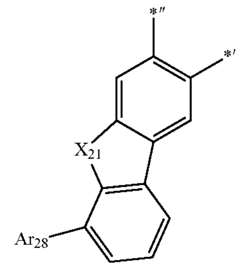
CY2-3-32
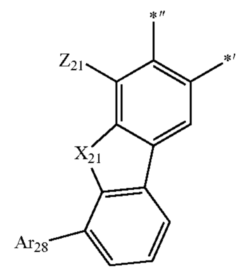
CY2-3-33
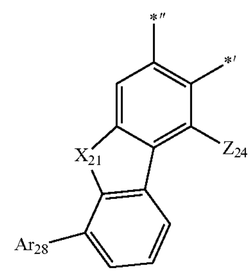
CY2-3-34
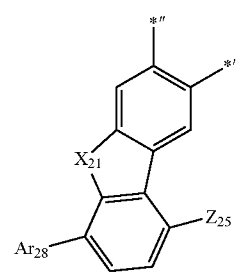
CY2-3-35
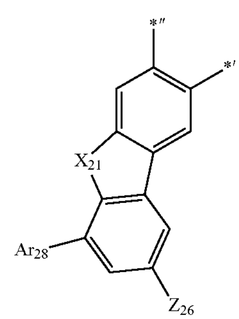

-continued
CY2-3-36
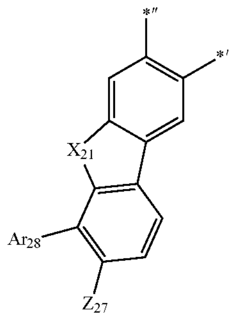
CY2-3-37
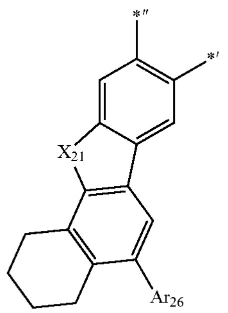
CY2-3-38
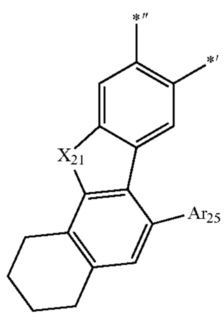
CY2-3-39
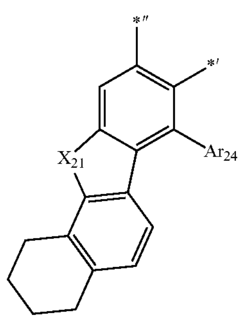
CY2-3-40
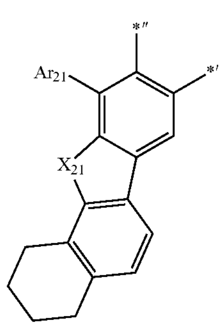
-continued
CY2-3-41
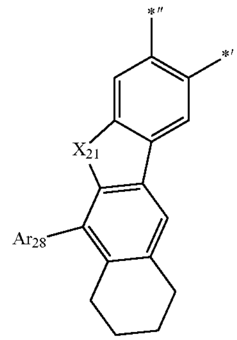
CY2-3-42
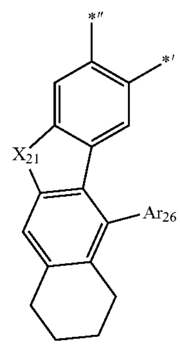
CY2-3-43
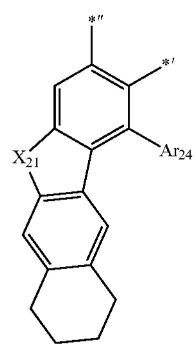
CY2-3-44
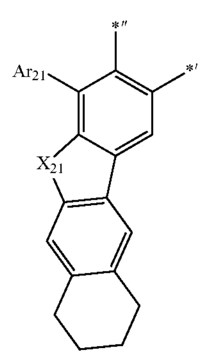

-continued
CY2-3-45
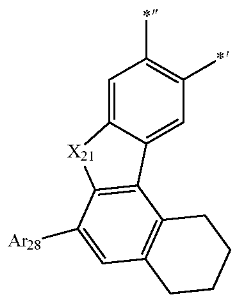
CY2-3-46
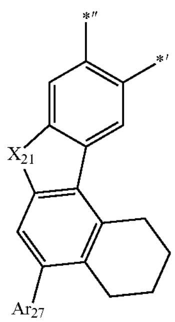
CY2-3-47
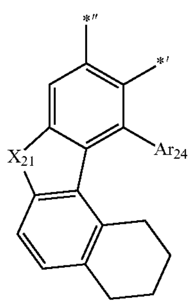
CY2-3-48
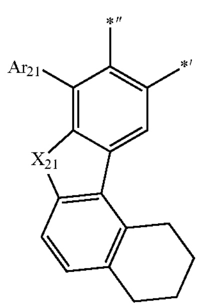
CY2-3-49
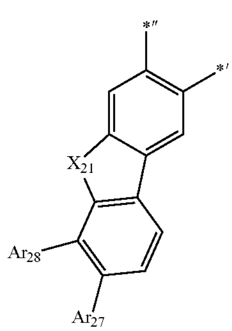
-continued
CY2-3-50
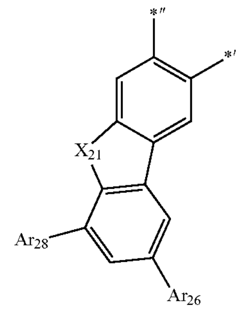
CY2-3-51
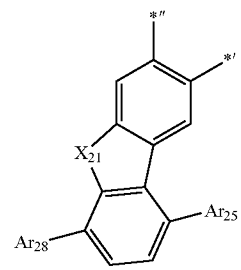
CY2-3-52
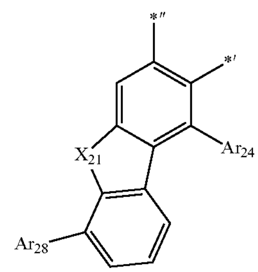
CY2-3-53
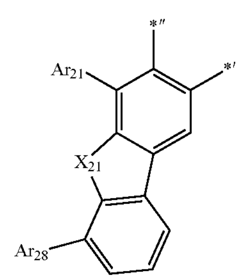
CY2-3-54
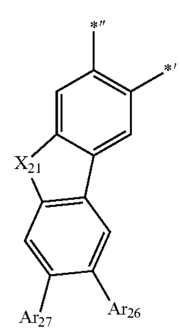

CY2-3-55
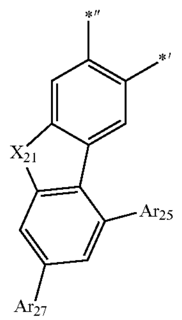
CY2-3-56
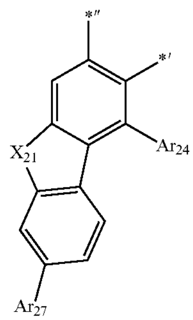
CY2-3-57
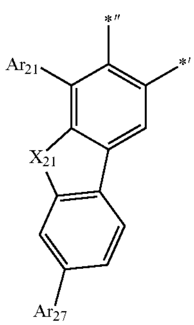
CY2-3-58
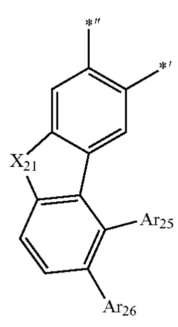
CY2-3-59
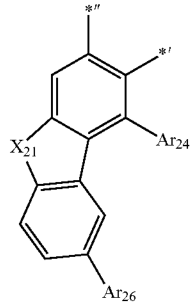
CY2-3-60
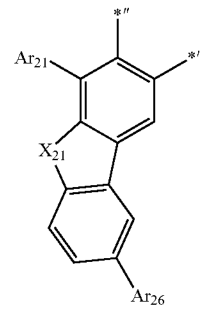
CY2-3-61
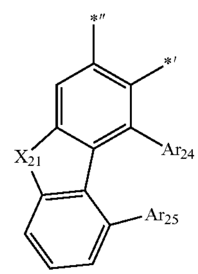
CY2-3-62
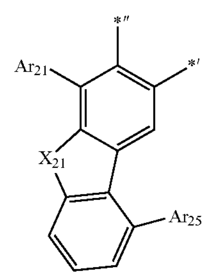
CY2-3-63
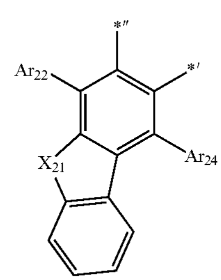
CY2-3-64
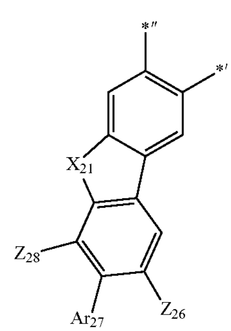

-continued
CY2-3-65
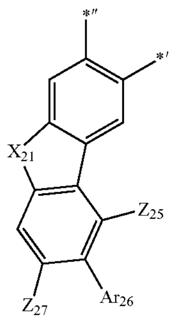
CY2-4-1
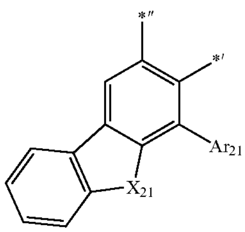
CY2-4-2
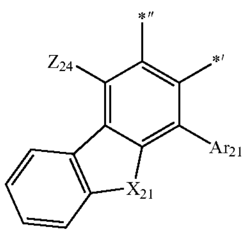
CY2-4-3
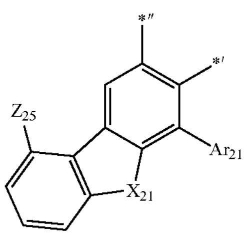
CY2-4-4
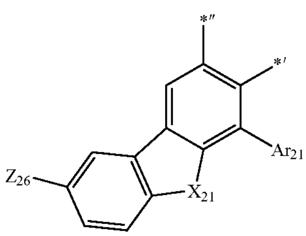
CY2-4-5
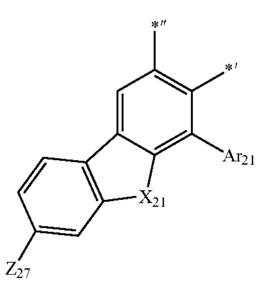
-continued
CY2-4-6
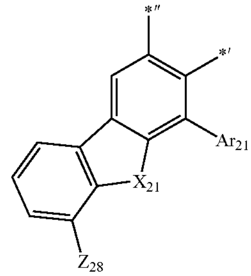
CY2-4-7
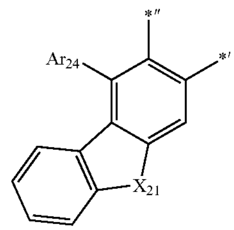
CY2-4-8
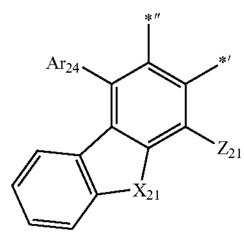
CY2-4-9
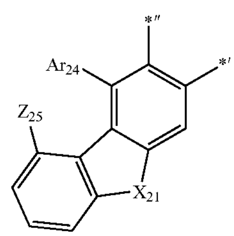
CY2-4-10
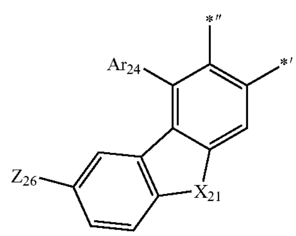
CY2-4-11
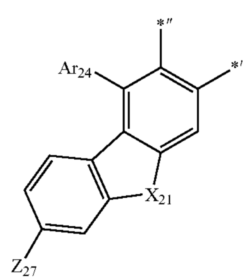

-continued
CY2-4-12
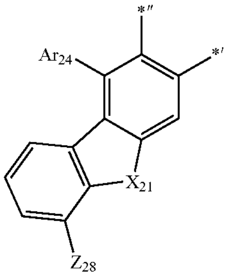
CY2-4-13
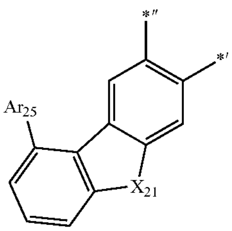
CY2-4-14
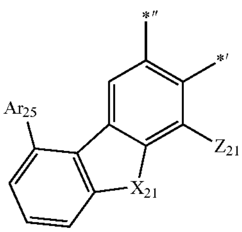
CY2-4-15
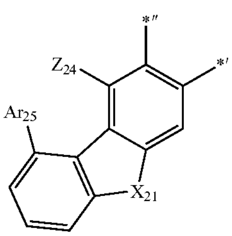
CY2-4-16
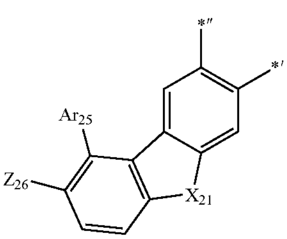
CY2-4-17
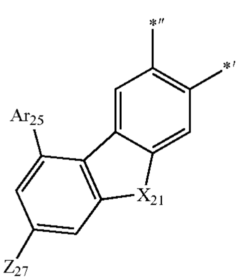
-continued
CY2-4-18
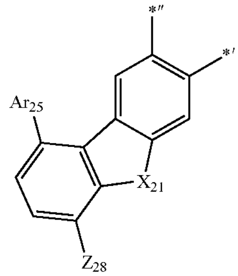
CY2-4-19
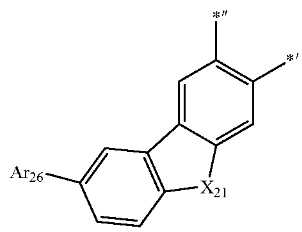
CY2-4-20
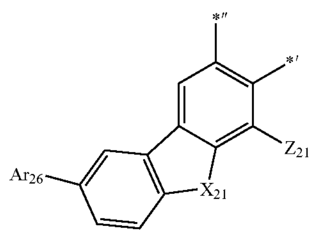
CY2-4-21
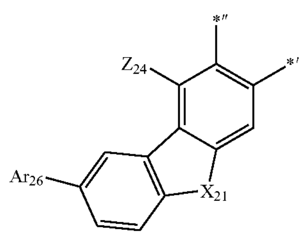
CY2-4-22
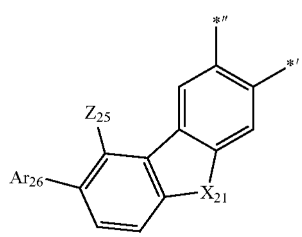
CY2-4-23
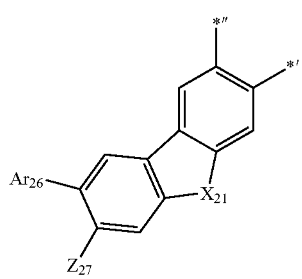

-continued
CY2-4-24
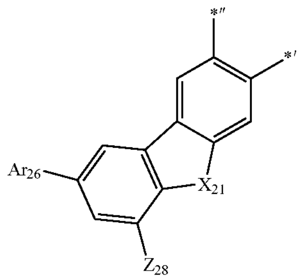
CY2-4-25
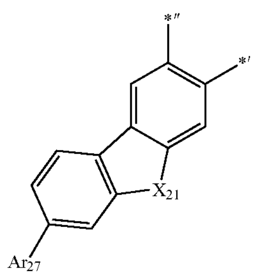
CY2-4-26
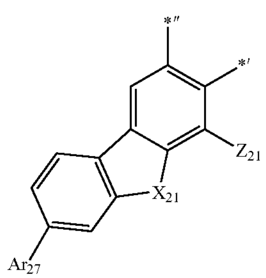
CY2-4-27
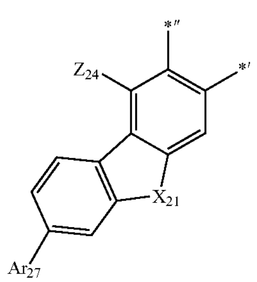
CY2-4-28
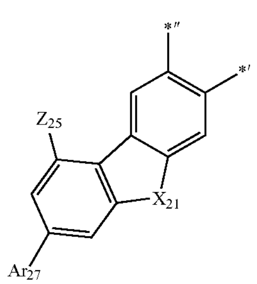
-continued
CY2-4-29
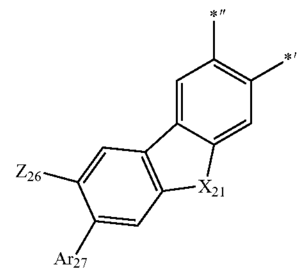
CY2-4-30
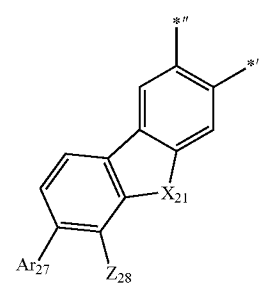
CY2-4-31
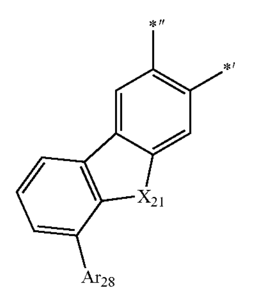
CY2-4-32
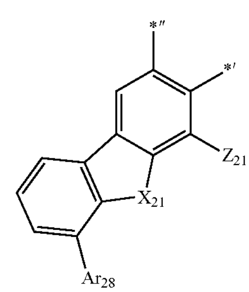
CY2-4-33
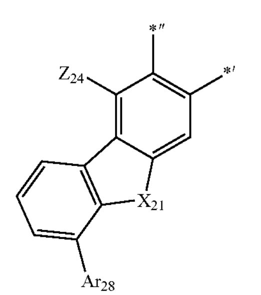

-continued
CY2-4-34
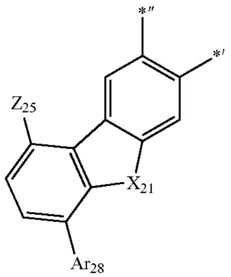
CY2-4-35
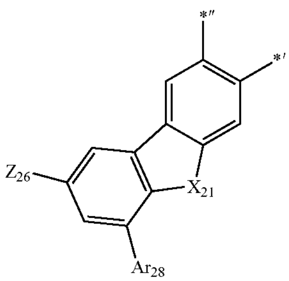
CY2-4-36
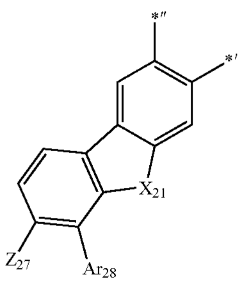
CY2-4-37
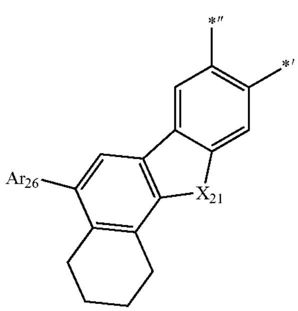
CY2-4-38
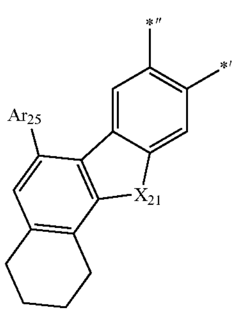
-continued
CY2-4-39
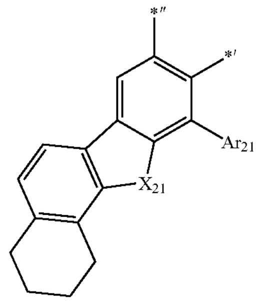
CY2-4-40
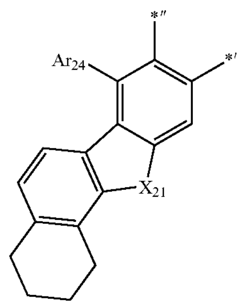
CY2-4-41
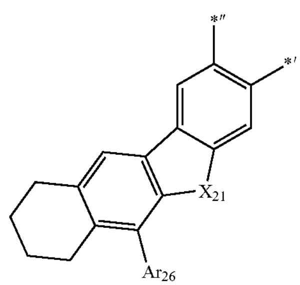
CY2-4-42
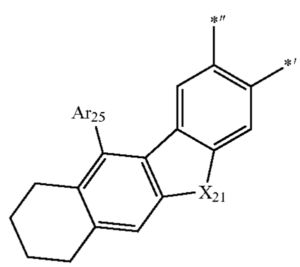
CY2-4-43
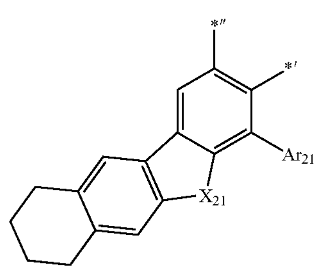

-continued
CY2-4-44
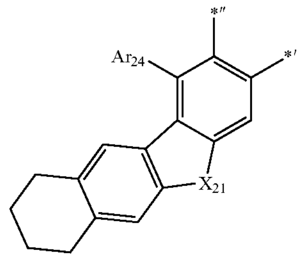
CY2-4-45
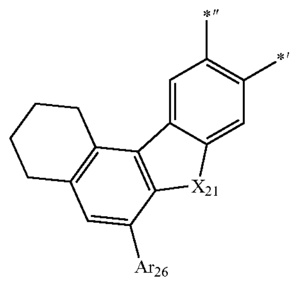
CY2-4-46
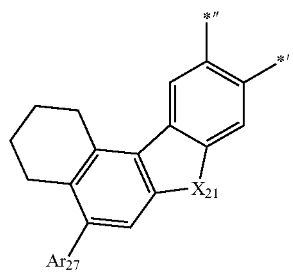
CY2-4-47
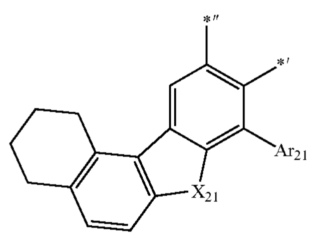
CY2-4-48
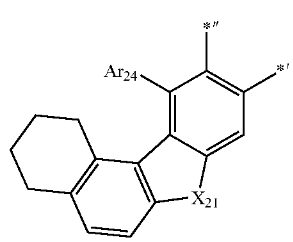
CY2-4-49
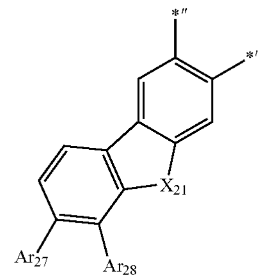
CY2-4-50
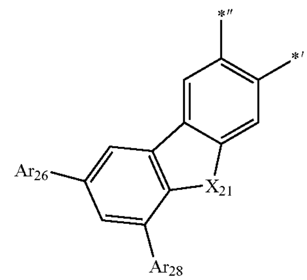
CY2-4-51
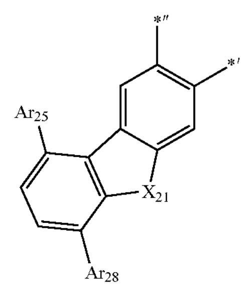
CY2-4-52
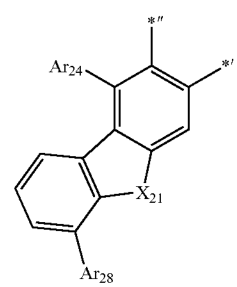
CY2-4-53
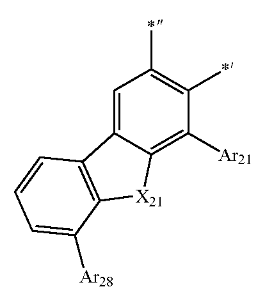

-continued
CY2-4-54
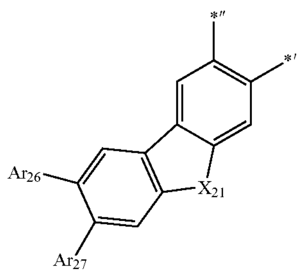
CY2-4-55
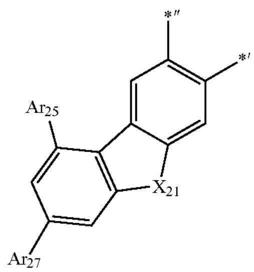
CY2-4-56
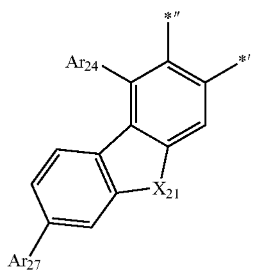
CY2-4-57
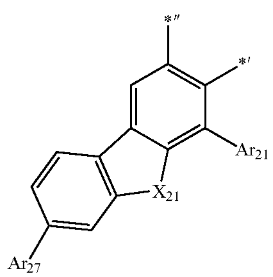
CY2-4-58
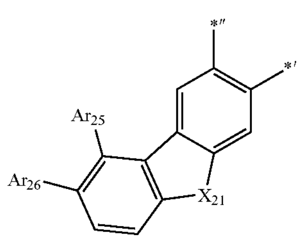
CY2-4-59
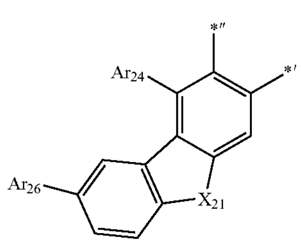
-continued
CY2-4-60
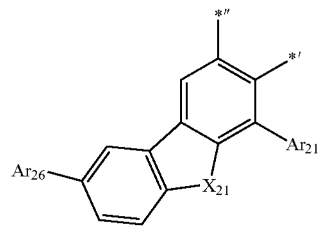
CY2-4-61
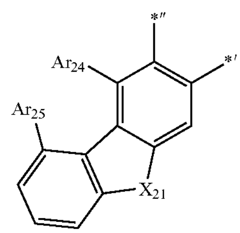
CY2-4-62
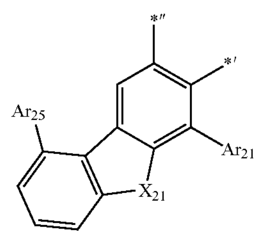
CY2-4-64
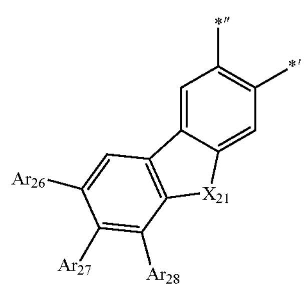
CY2-4-65
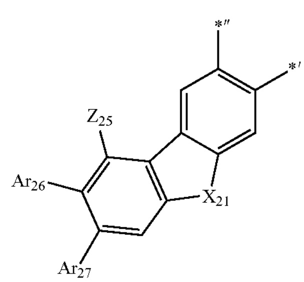
CY2-5-1
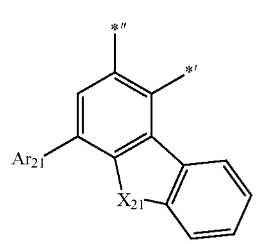

-continued
CY2-5-2
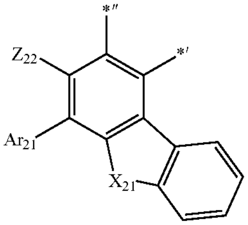
CY2-5-3
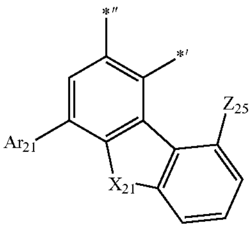
CY2-5-4
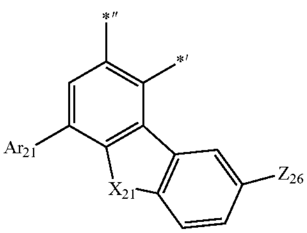
CY2-5-5
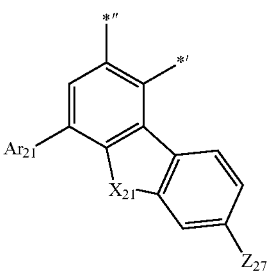
CY2-5-6
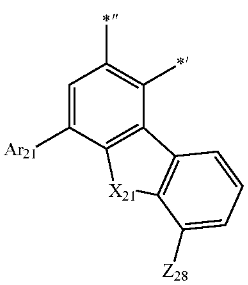
CY2-5-7
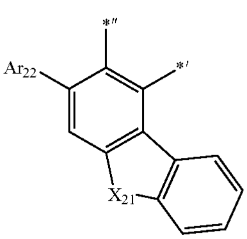
-continued
CY2-5-8
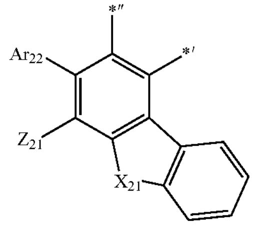
CY2-5-9
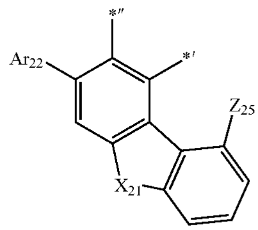
CY2-5-10
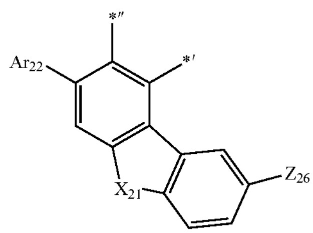
CY2-5-11
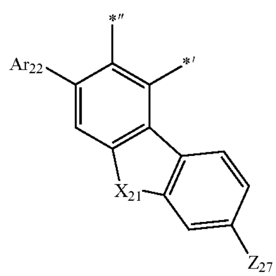
CY2-5-12
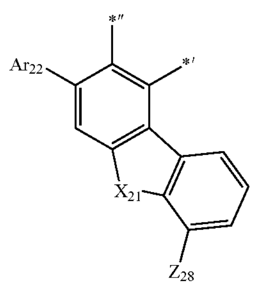
CY2-5-13
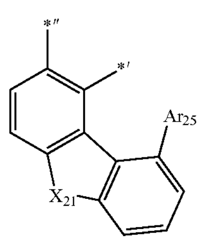

-continued
CY2-5-14
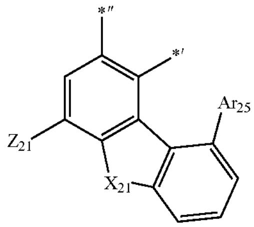
CY2-5-15
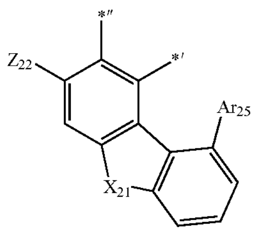
CY2-5-16
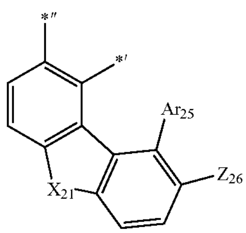
CY2-5-17
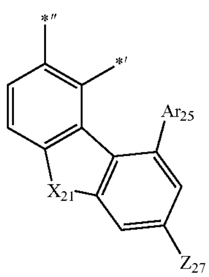
CY2-5-18
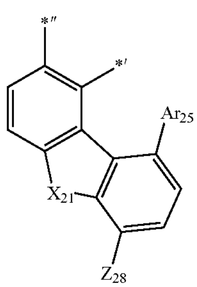
CY2-5-19
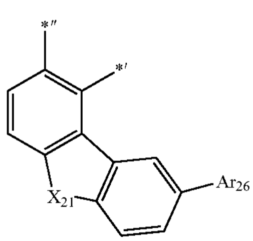
-continued
CY2-5-20
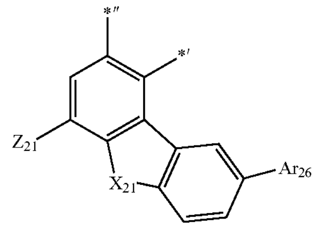
CY2-5-21
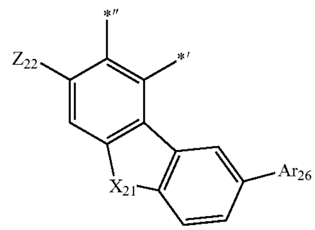
CY2-5-22
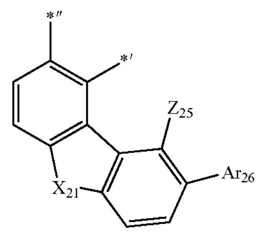
CY2-5-23
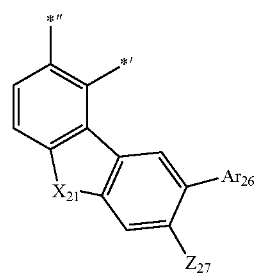
CY2-5-24
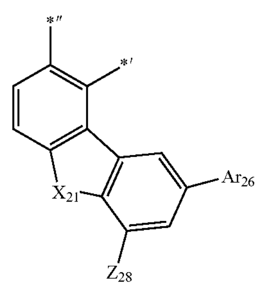
CY2-5-25
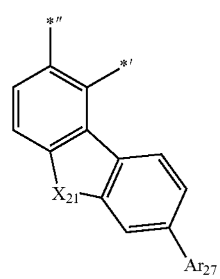

-continued
CY2-5-26
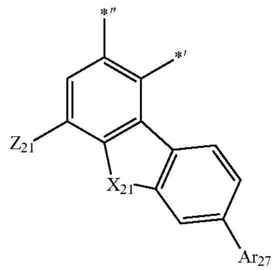
CY2-5-27
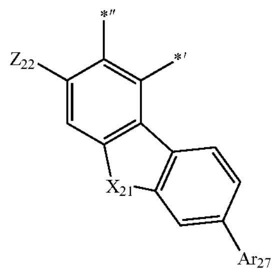
CY2-5-28
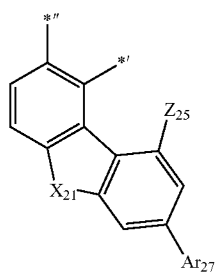
CY2-5-29
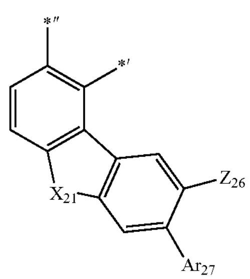
CY2-5-30
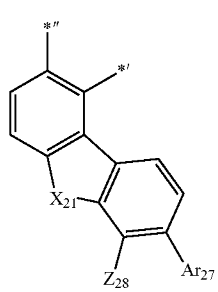
-continued
CY2-5-31
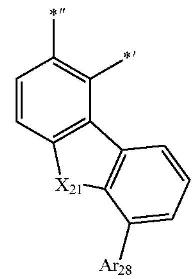
CY2-5-32
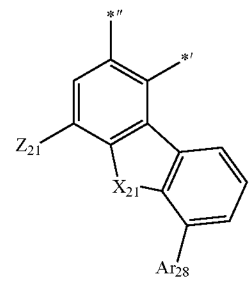
CY2-5-33
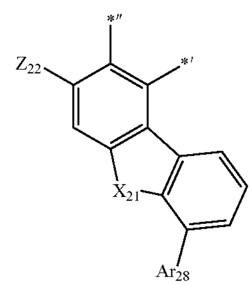
CY2-5-34
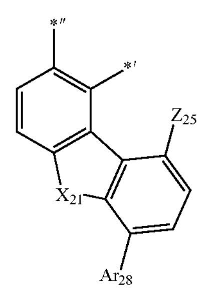
CY2-5-35
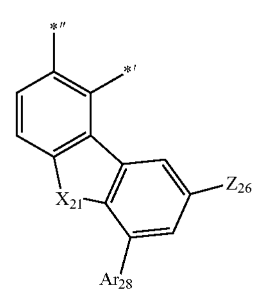

CY2-5-36
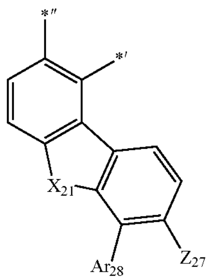
CY2-5-37
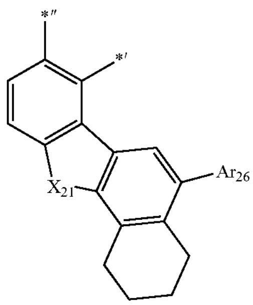
CY2-5-38
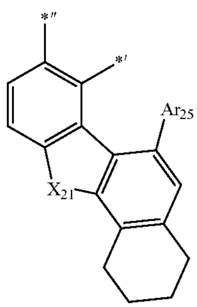
CY2-5-39
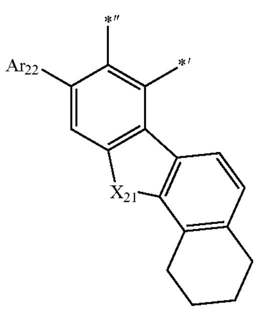
CY2-5-40
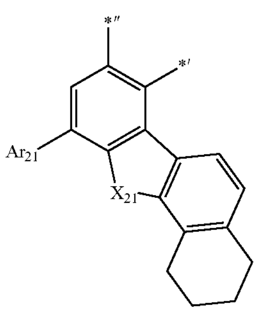
CY2-5-41
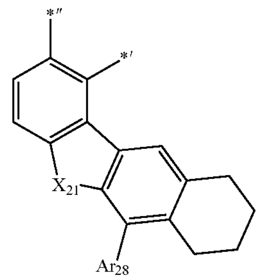
CY2-5-42
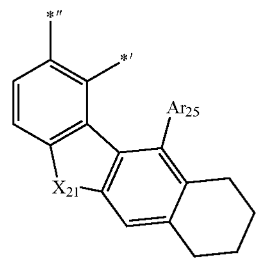
CY2-5-43
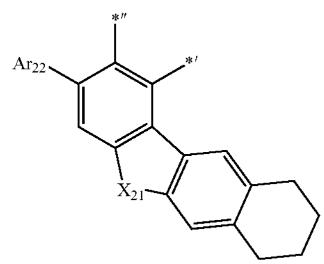
CY2-5-44
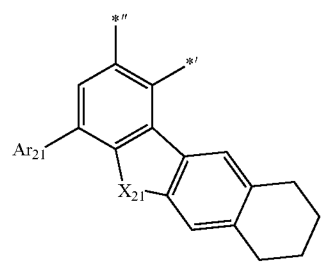
CY2-5-45
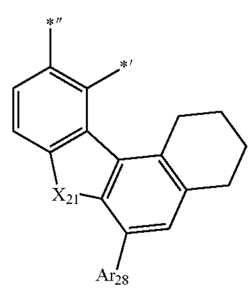
CY2-5-46
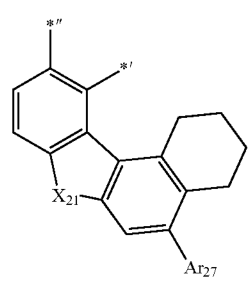

-continued
CY2-5-47
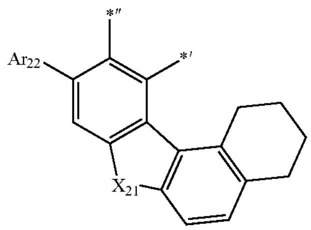
CY2-5-48
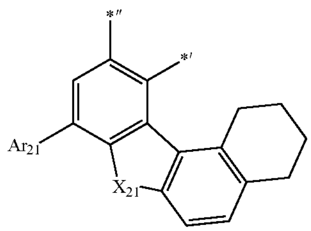
CY2-5-49
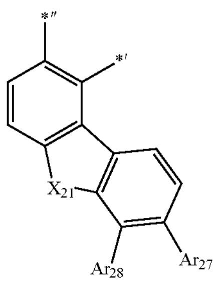
CY2-5-50
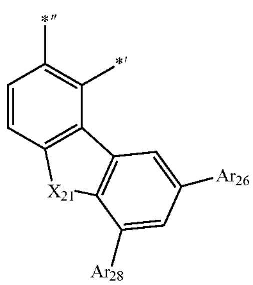
CY2-5-51
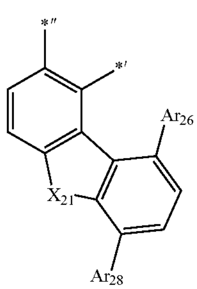
CY2-5-52
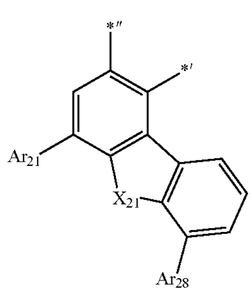
-continued
CY2-5-53
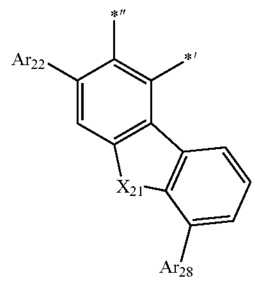
CY2-5-54
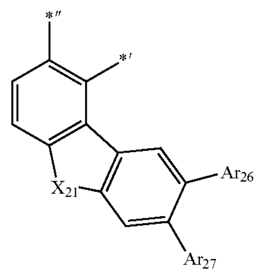
CY2-5-55
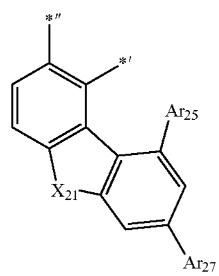
CY2-5-56
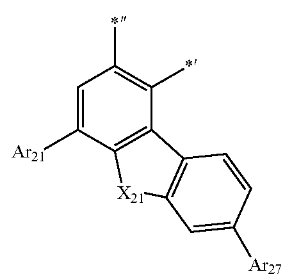
CY2-5-57
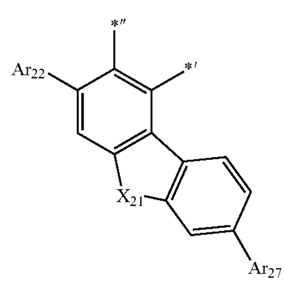
CY2-5-58
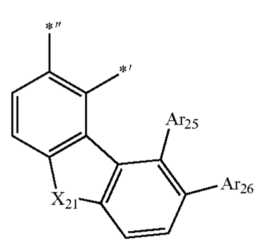

-continued
CY2-5-59
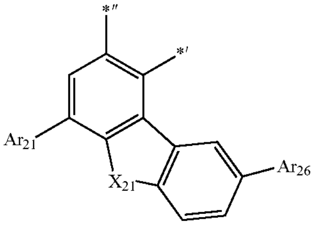
CY2-5-60
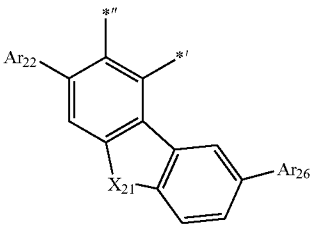
CY2-5-61
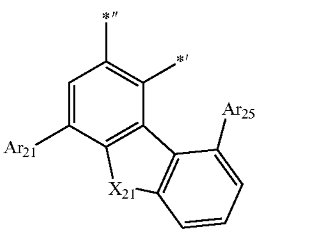
CY2-5-62
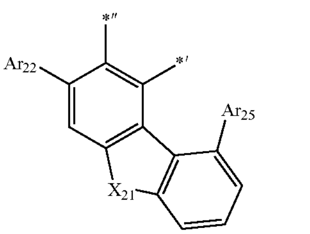
CY2-5-63
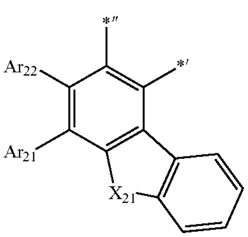
CY2-5-64
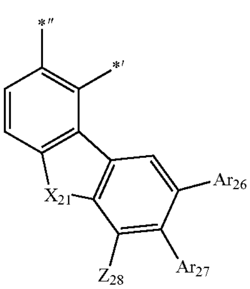
-continued
CY2-5-65
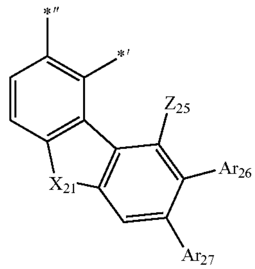
CY2-6-1
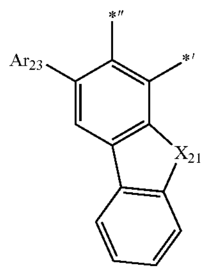
CY2-6-2
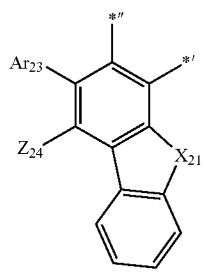
CY2-6-3
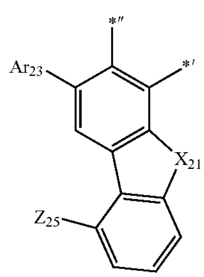
CY2-6-4
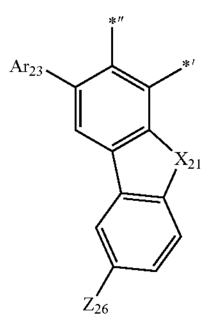

-continued
CY2-6-5
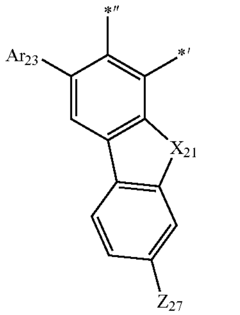
CY2-6-6
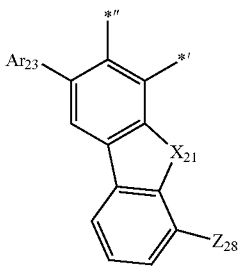
CY2-6-7
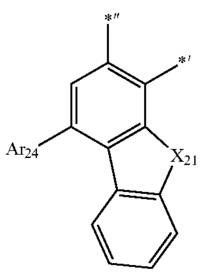
CY2-6-8
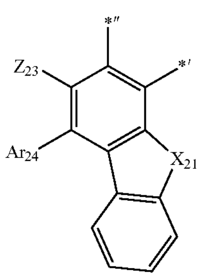
CY2-6-9
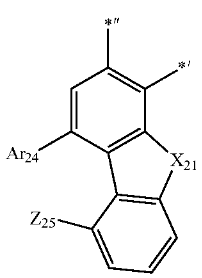
-continued
CY2-6-10
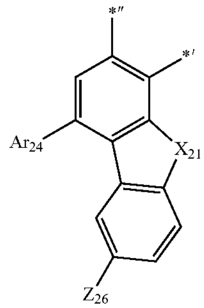
CY2-6-11
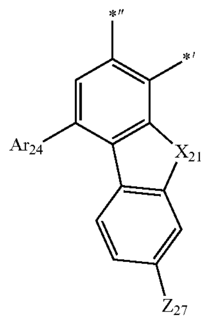
CY2-6-12
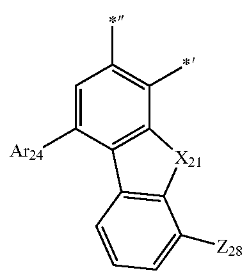
CY2-6-13
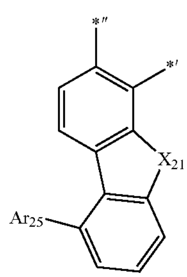
CY2-6-14
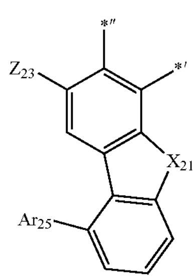

-continued
CY2-6-15
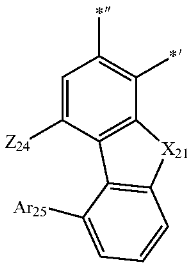
CY2-6-16
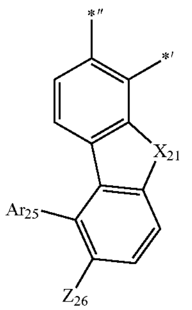
CY2-6-17
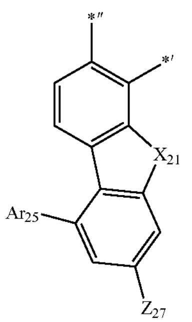
CY2-6-18
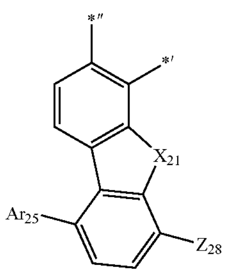
CY2-6-19
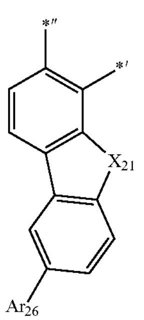
-continued
CY2-6-20
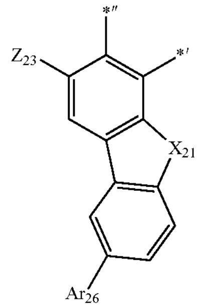
CY2-6-21
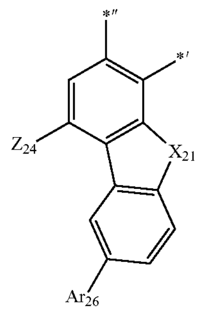
CY2-6-22
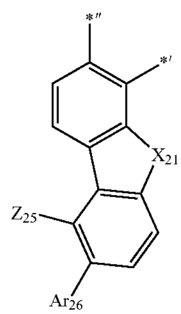
CY2-6-23
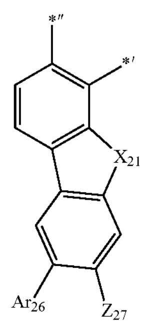
CY2-6-24
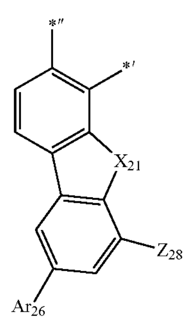

-continued
CY2-6-25
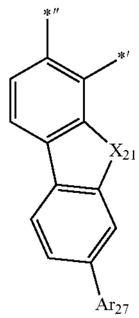
CY2-6-26
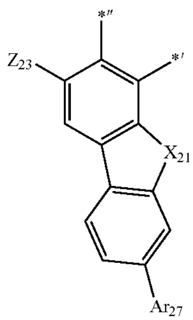
CY2-6-27
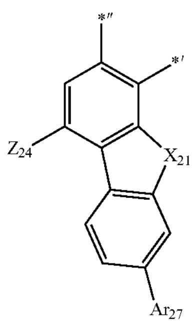
CY2-6-28
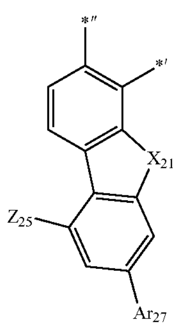
CY2-6-29
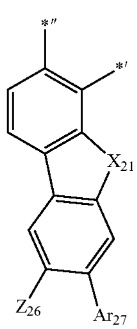
-continued
CY2-6-30
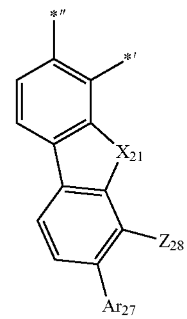
CY2-6-31
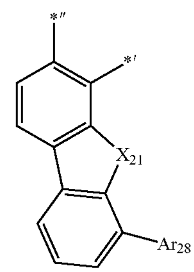
CY2-6-32
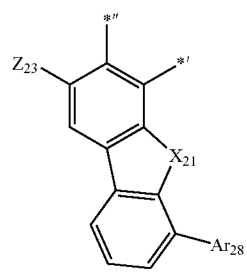
CY2-6-33
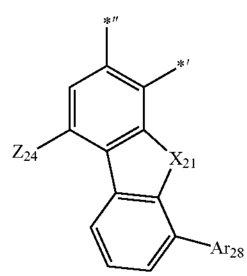
CY2-6-34
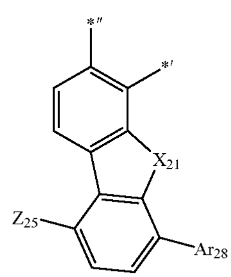

-continued
CY2-6-35
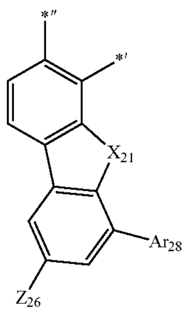
CY2-6-36
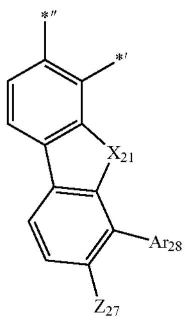
CY2-6-37
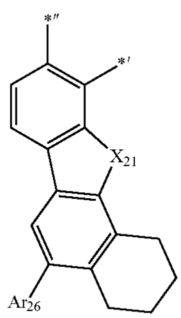
CY2-6-38
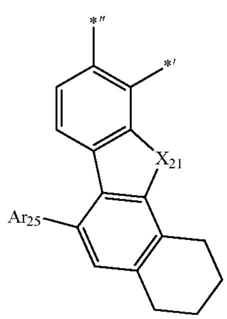
CY2-6-39
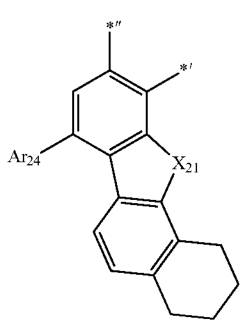
-continued
CY2-6-40
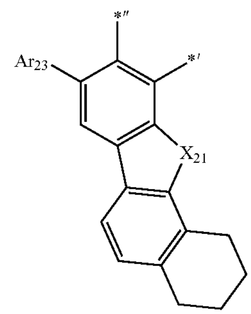
CY2-6-41
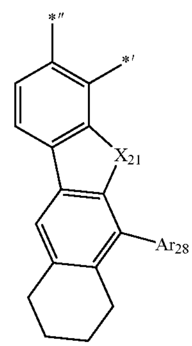
CY2-6-42
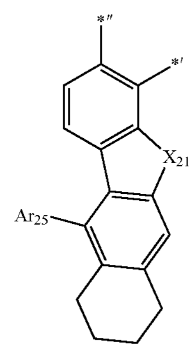
CY2-6-43
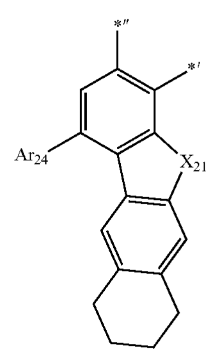

-continued
CY2-6-44
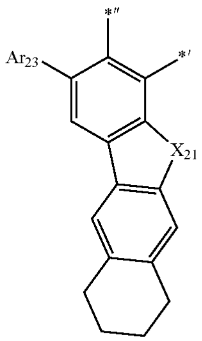
CY2-6-45
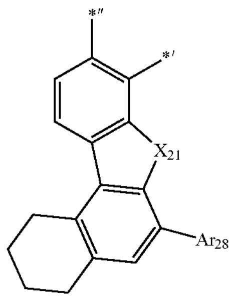
CY2-6-46
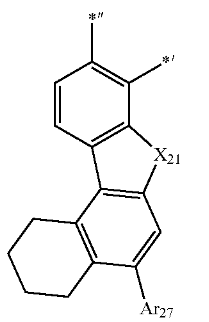
CY2-6-47
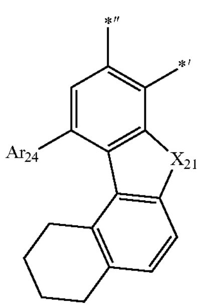
CY2-6-48
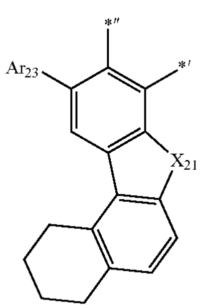
-continued
CY2-6-49
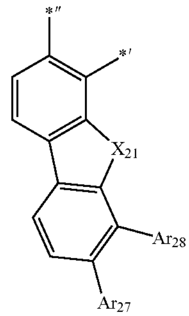
CY2-6-50
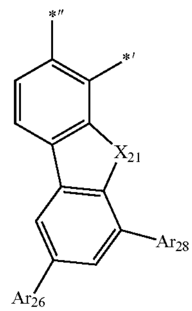
CY2-6-51
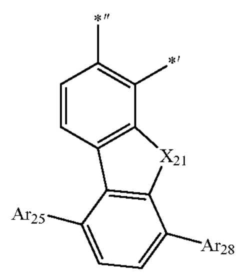
CY2-6-52
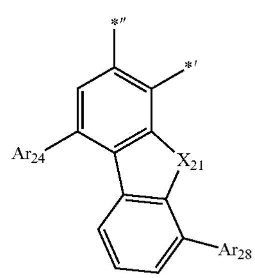
CY2-6-53
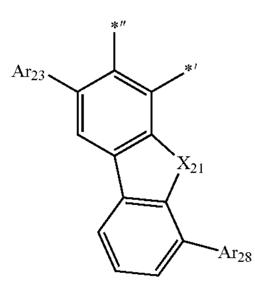

CY2-6-54
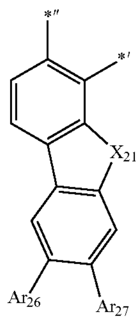
CY2-6-55
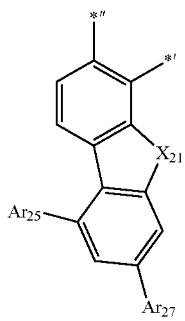
CY2-6-56
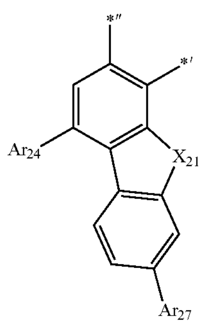
CY2-6-57
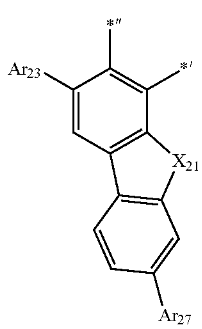
CY2-6-58
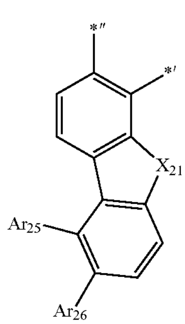
CY2-6-59
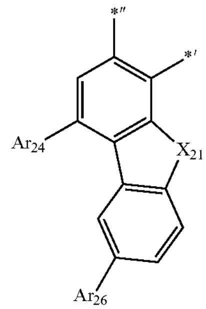
CY2-6-60
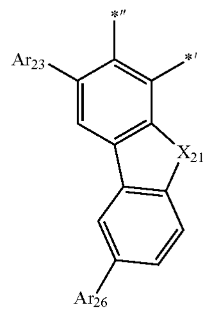
CY2-6-61
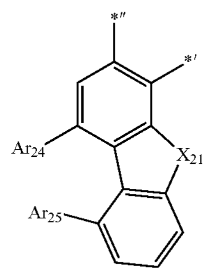
CY2-6-62
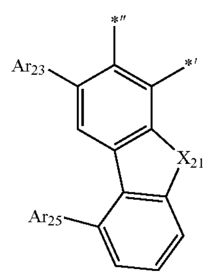
CY2-6-63
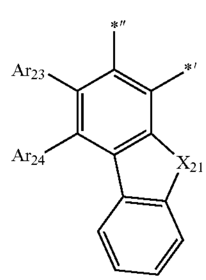

-continued

CY2-6-64

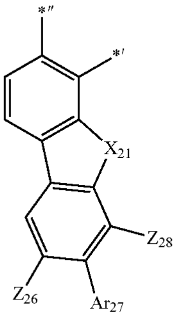

CY2-6-65

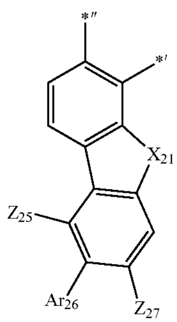

wherein, in Formulae CY2-1-1 to CY2-1-65, CY2-2-1 to CY2-2-65, CY2-3-1 to CY2-3-65, CY2-4-1 to CY2-4-65, CY2-5-1 to CY2-5-65, and CY2-6-1 to CY2-6-65, $X_{21}$ may be the same as described herein, $Z_{21}$ to $Z_{28}$ may each be the same as described in connection with $Z_2$ provided herein, wherein $Z_{21}$ to $Z_{28}$ may not each be hydrogen, $Ar_{21}$ to $Ar_{28}$ may each be the same as described in connection with $Ar_2$ provided herein,

*" indicates a binding site to ring $CY_1$ in Formula 2A, and

*' indicates a binding site to M in Formula 1.

In one or more embodiments, in Formula 2B, a group represented by

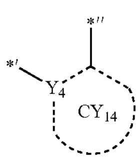

may be a group represented by one of Formulae CY14-1 to CY14-64:

CY14-1

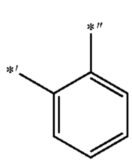

CY14-2

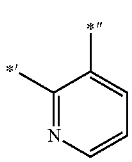

-continued

CY14-3

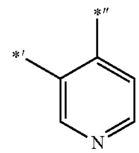

CY14-4

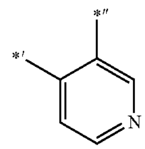

CY14-5

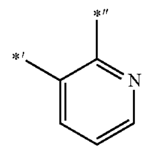

CY14-6

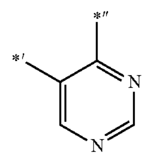

CY14-7

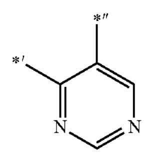

CY14-8

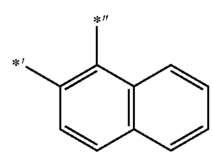

CY14-9

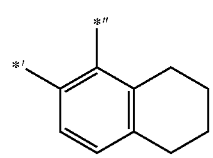

CY14-10

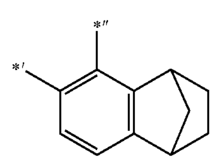

CY14-11

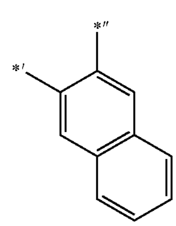

-continued
CY14-12
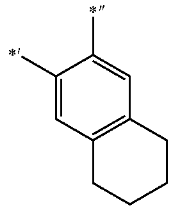
CY14-13
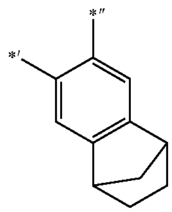
CY14-14
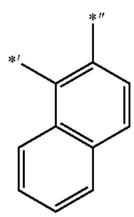
CY14-15
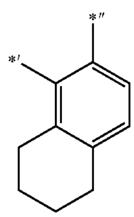
CY14-16
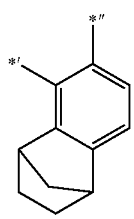
CY14-17
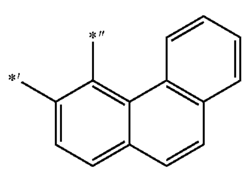
CY14-18
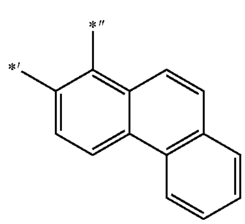
-continued
CY14-19
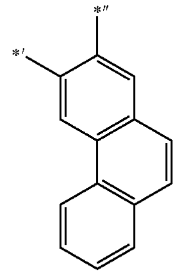
CY14-20
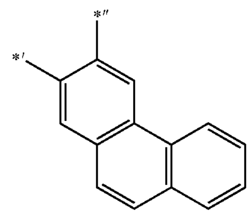
CY14-21
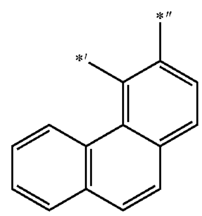
CY14-22
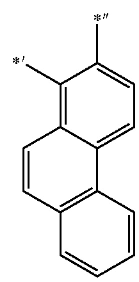
CY14-23
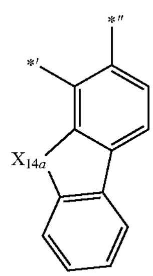
CY14-24
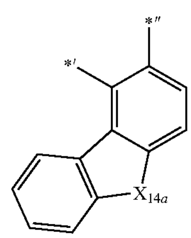

-continued
CY14-25
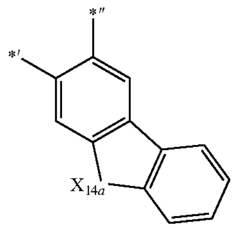
CY14-26
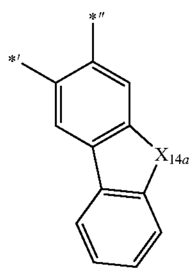
CY14-27
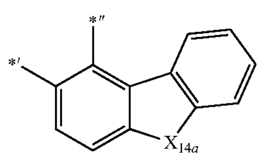
CY14-28
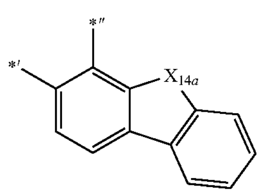
CY14-29
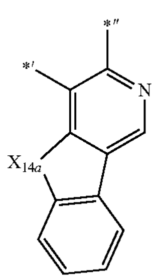
CY14-30
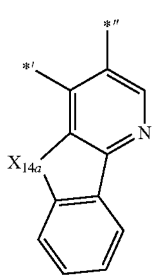
-continued
CY14-31
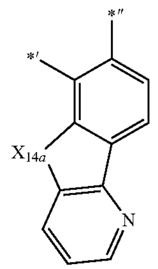
CY14-32
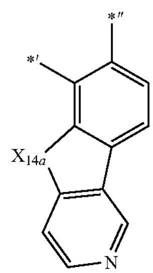
CY14-33
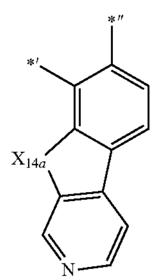
CY14-34
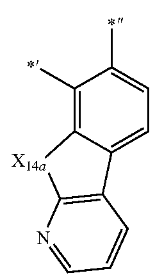
CY14-35
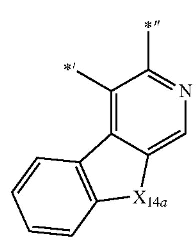
CY14-36
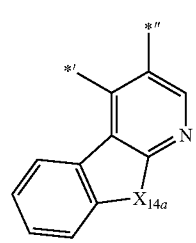

-continued
CY14-37
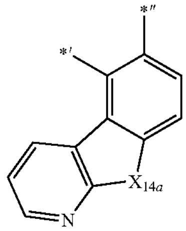
CY14-38
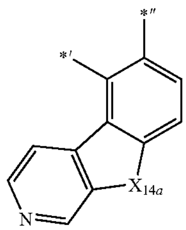
CY14-39
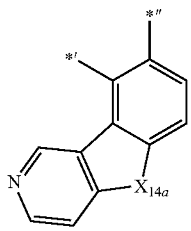
CY14-40
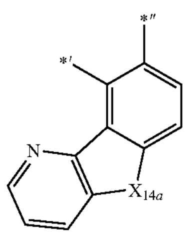
CY14-41
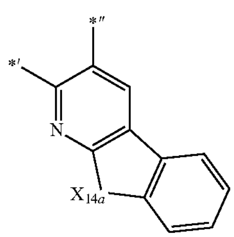
CY14-42
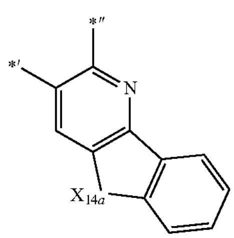
CY14-43
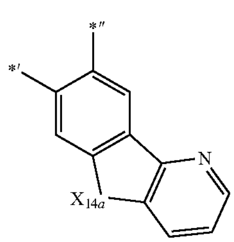
-continued
CY14-44
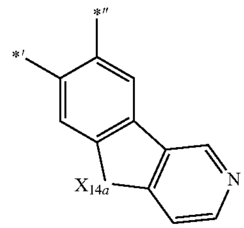
CY14-45
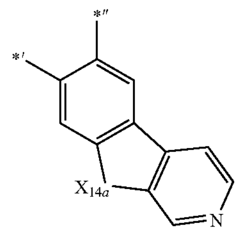
CY14-46
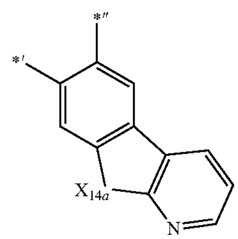
CY14-47
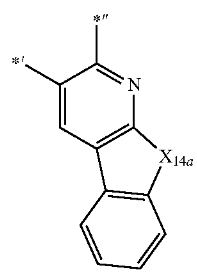
CY14-48
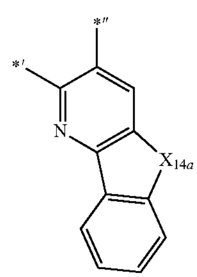
CY14-49
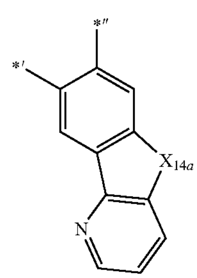

-continued
CY14-50
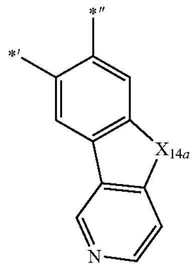
CY14-51
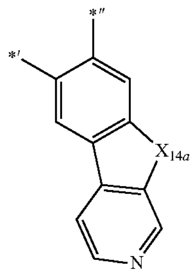
CY14-52
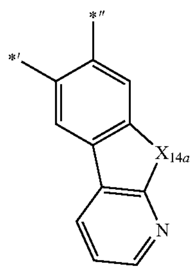
CY14-53
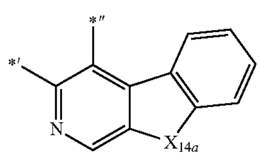
CY14-54
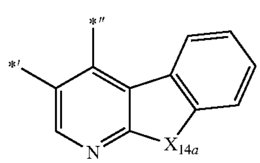
CY14-55
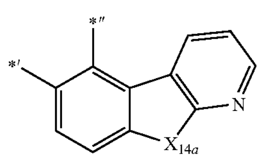
CY14-56
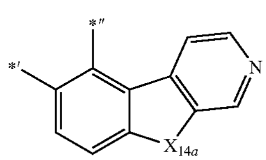
CY14-57
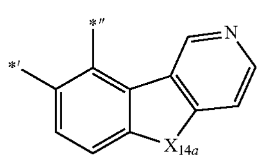
-continued
CY14-58
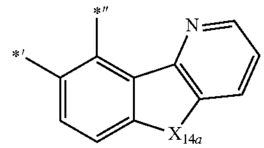
CY14-59
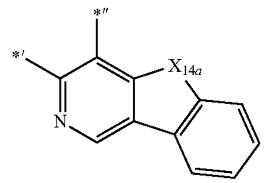
CY14-60
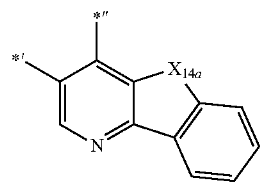
CY14-61
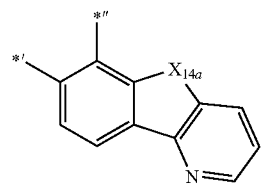
CY14-62
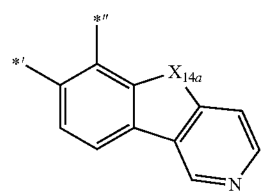
CY14-63
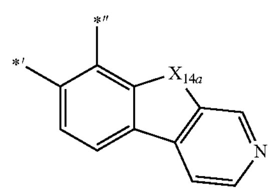
CY14-64
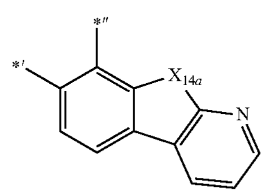
wherein, in Formulae CY14-1 to CY14-64,
$X_{14a}$ may be O, S, N, C, or Si,
*" indicates a binding site to a carbon atom in an adjacent pyridine ring in Formula 2B, and
*' indicates a binding site to M in Formula 1.
Each of a carbon and $X_{14a}$ in Formulae CY14-1 to CY14-64 may be unsubstituted or substituted with $R_{14}$ as described herein.

In one or more embodiments, in Formula 2B, a group represented by
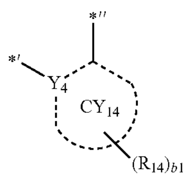
may be a group represented by one of Formulae CY14(1) to CY14(63):
CY14(1)
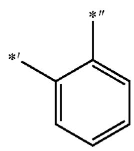
CY14(2)
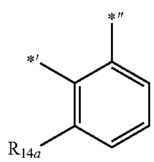
CY14(3)
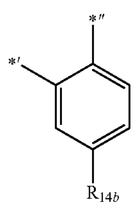
CY14(4)
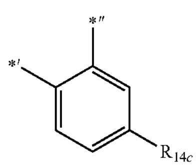
CY14(5)
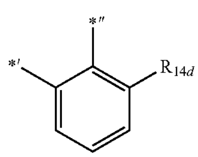
CY14(6)
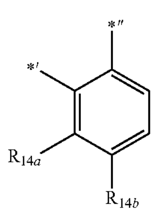
CY14(7)
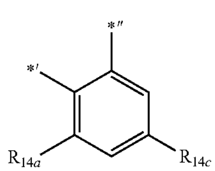
-continued
CY14(8)
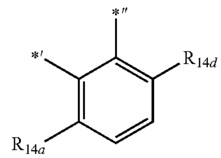
CY14(9)
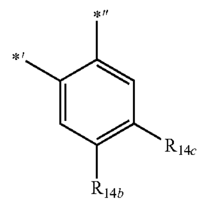
CY14(10)
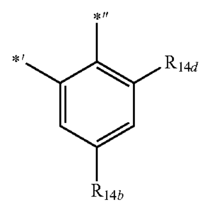
CY14(11)
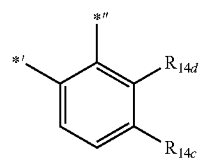
CY14(12)
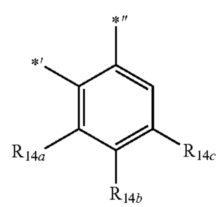
CY14(13)
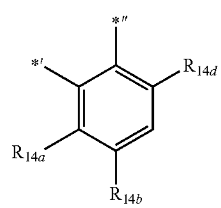
CY14(14)
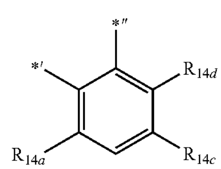
CY14(15)
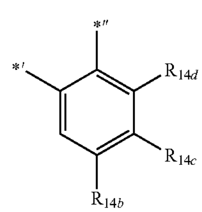

-continued
CY14(16)
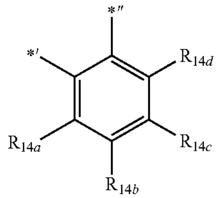
CY14(17)
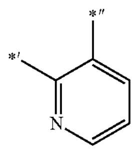
CY14(18)
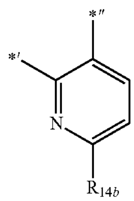
CY14(19)
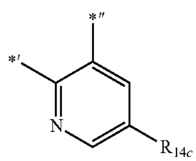
CY14(20)
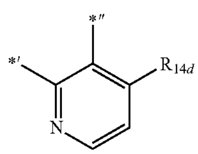
CY14(21)
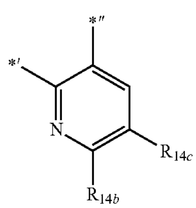
CY14(22)
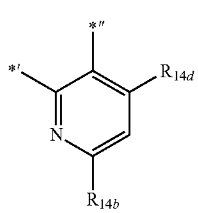
CY14(23)
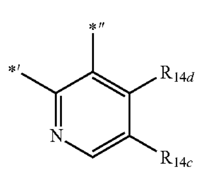
-continued
CY14(24)
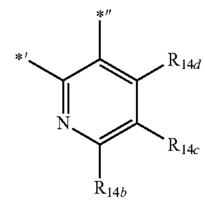
CY14(25)
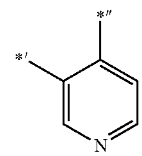
CY14(26)
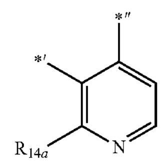
CY14(27)
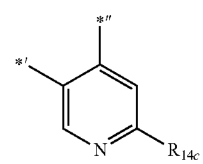
CY14(28)
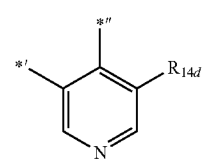
CY14(29)
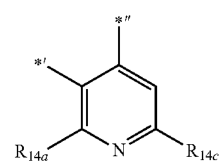
CY14(30)
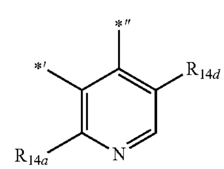
CY14(31)
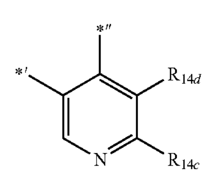
CY14(32)
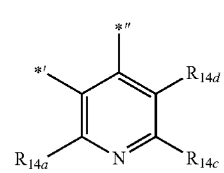

-continued
CY14(33)
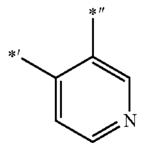
CY14(34)
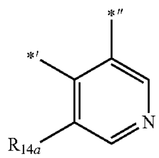
CY14(35)
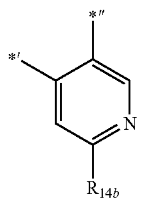
CY14(36)
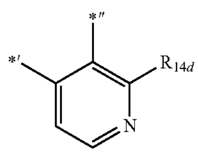
CY14(37)
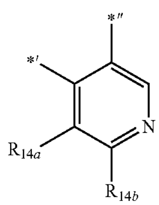
CY14(38)
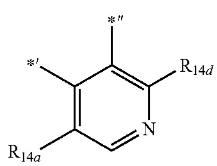
CY14(39)
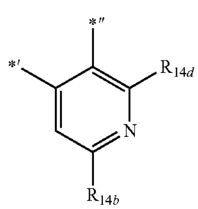
CY14(40)
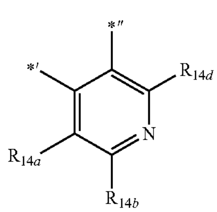
CY14(41)
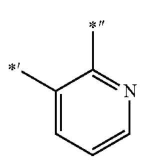
-continued
CY14(42)
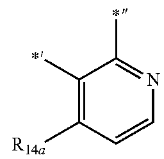
CY14(43)
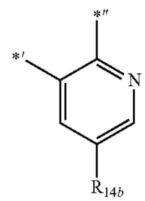
CY14(44)
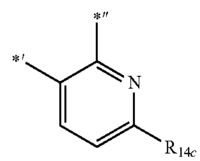
CY14(45)
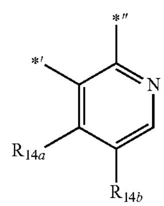
CY14(46)
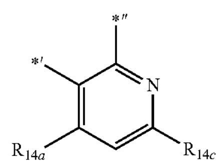
CY14(47)
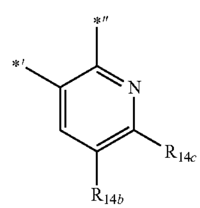
CY14(48)
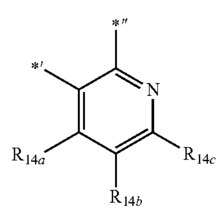
CY14(49)
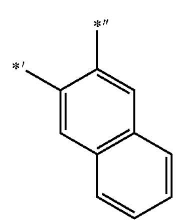

CY14(50)
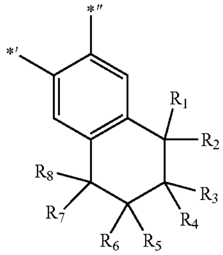
CY14(51)
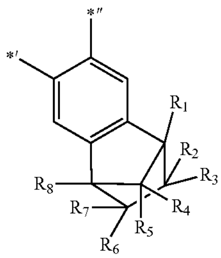
CY14(52)
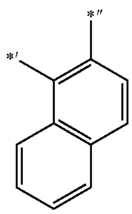
CY14(53)
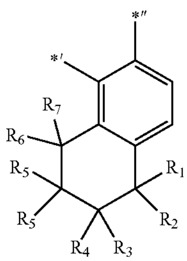
CY14(54)
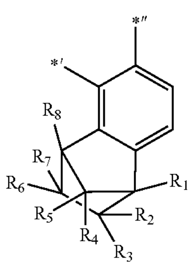
CY14(55)
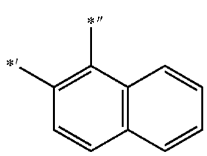
CY14(56)
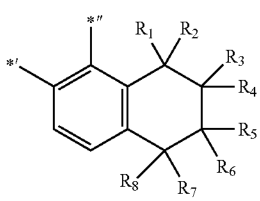
CY14(57)
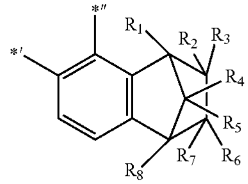
CY14(58)
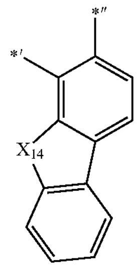
CY14(59)
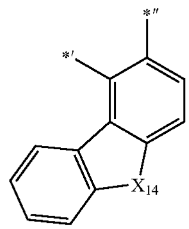
CY14(60)
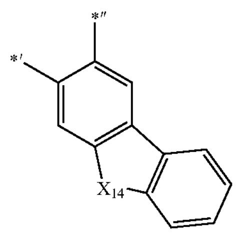
CY14(61)
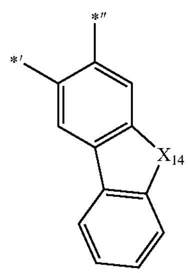
CY14(62)
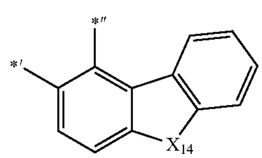
CY14(63)
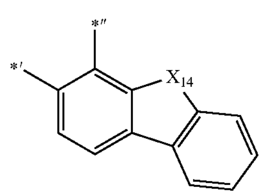

wherein, in Formulae CY14(1) to CY14(63), $R_{14a}$ to $R_{14d}$ may each be the same as described in connection with $R_{14}$ provided herein, wherein $R_{14a}$ to $R_{14d}$ may not each be hydrogen, $X_{14}$ may be $C(R_1)(R_2)$, $N(R_1)$, O, S, or $Si(R_1)(R_2)$, $R_1$ to $R_8$ may each be the same as described in connection with Ru provided herein,

*" indicates a binding site to a carbon atom in an adjacent pyridine ring in Formula 2B, and

*' indicates a binding site to M in Formula 1.

In one or more embodiments, the number of silicon (Si) atoms in the organometallic compound represented by Formula 1 may be 1 or 2.

In one or more embodiments, the organometallic compound may be one of Compounds 1 to 5140:

1

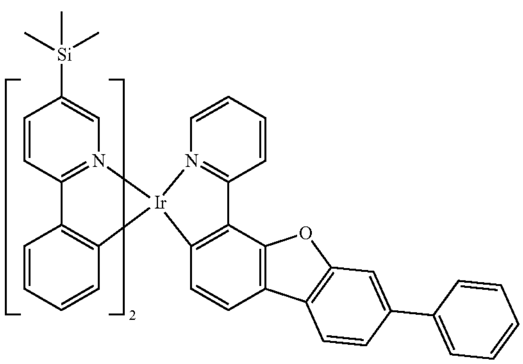

2

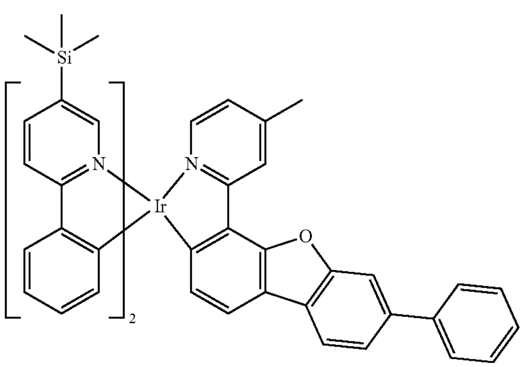

3

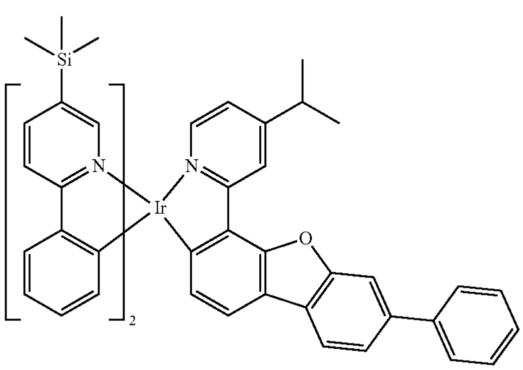

-continued

4

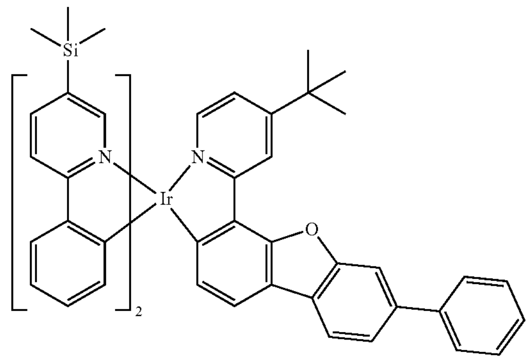

5

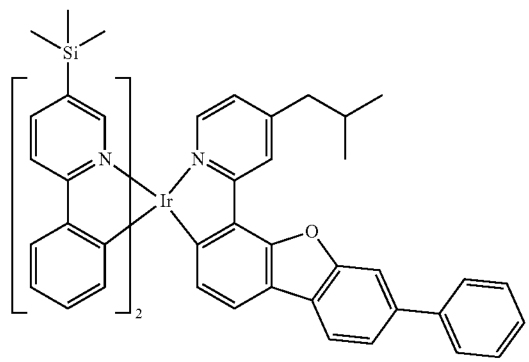

6

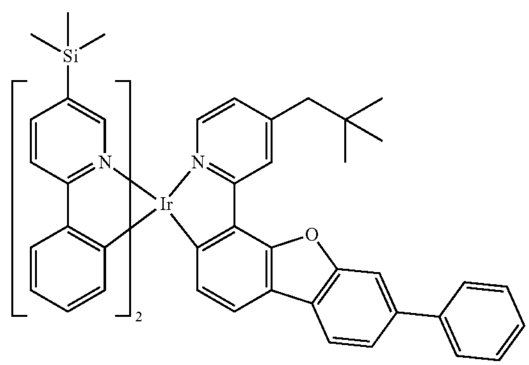

7

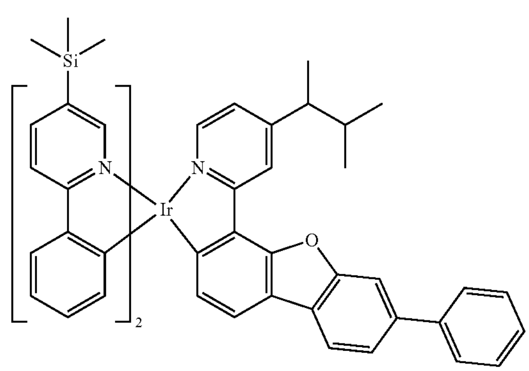

-continued
8
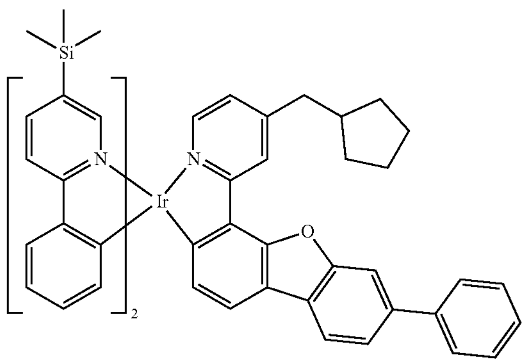
9
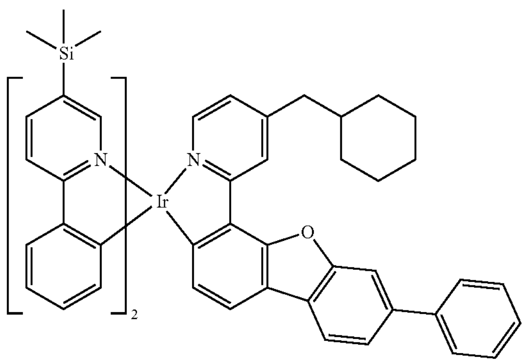
10
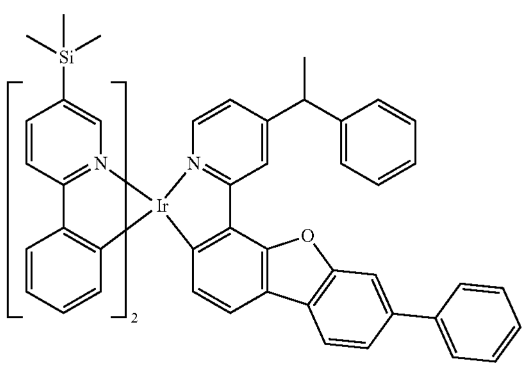
11
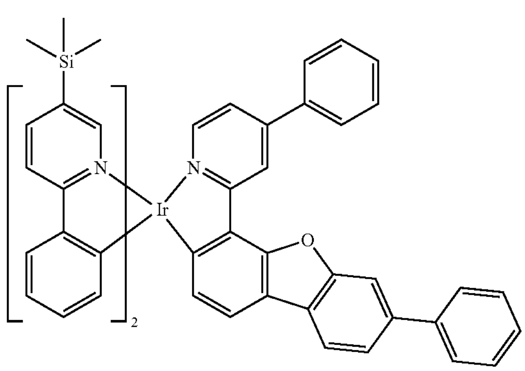
-continued
12
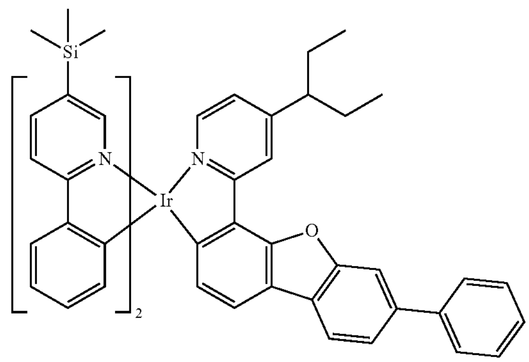
13
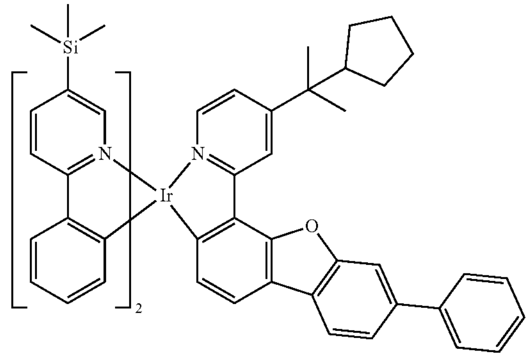
14
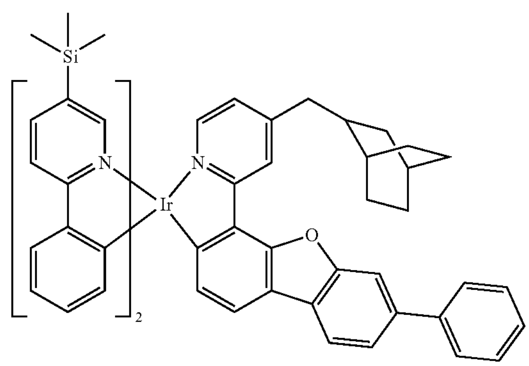
15
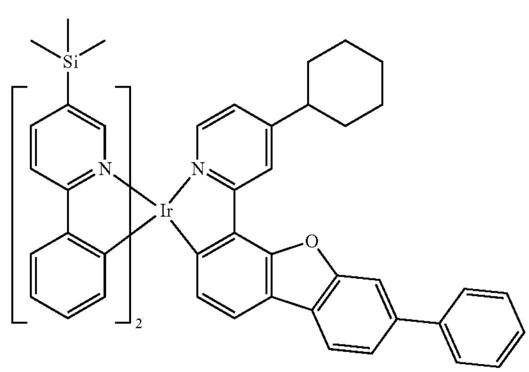

-continued
16
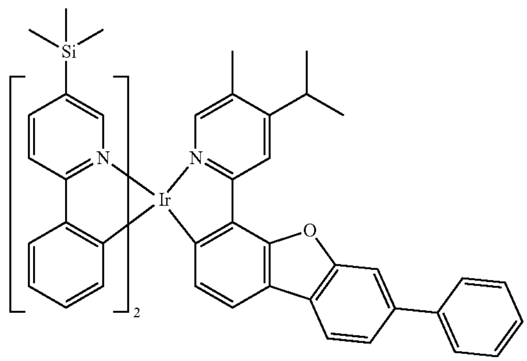
17
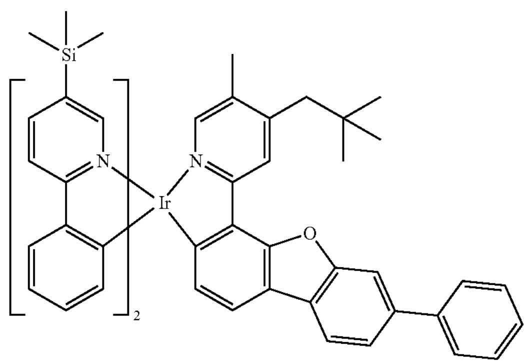
18
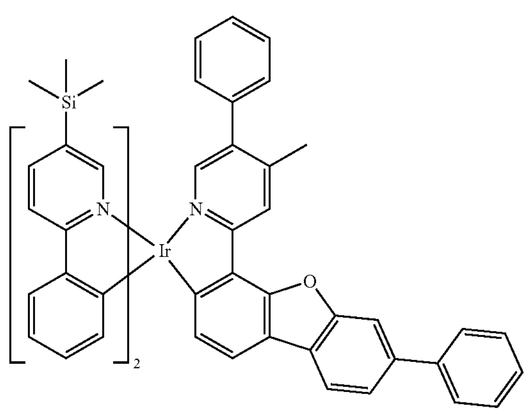
19
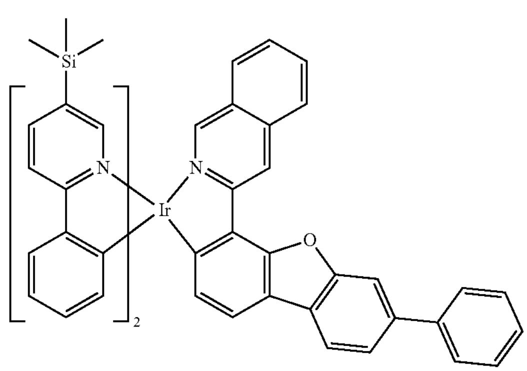
-continued
20
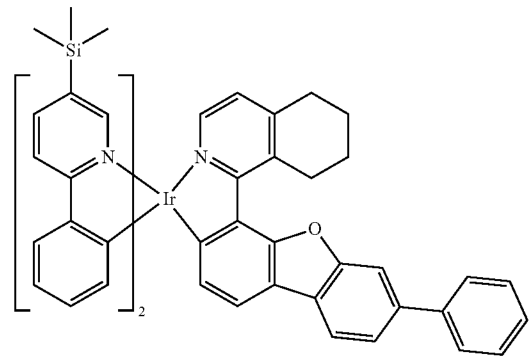
21
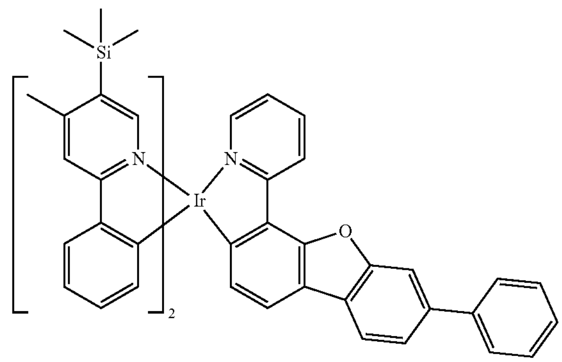
22
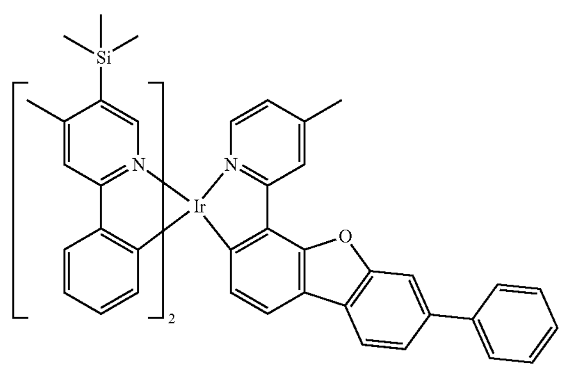
23
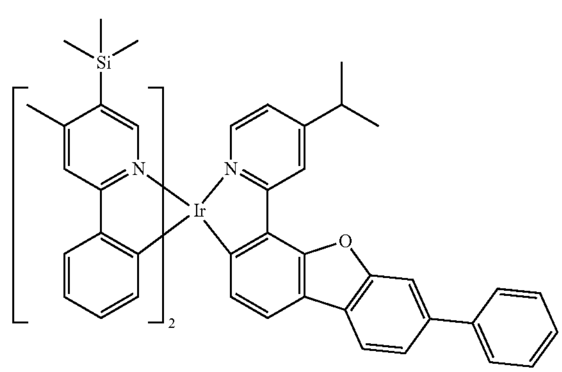

24
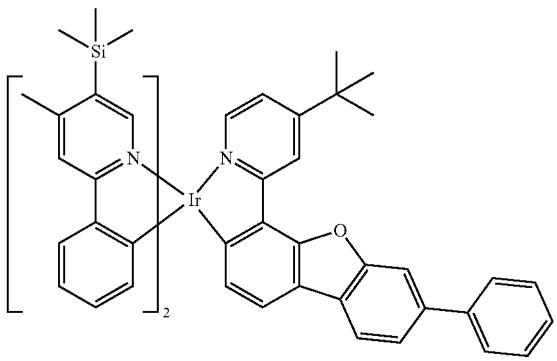
25
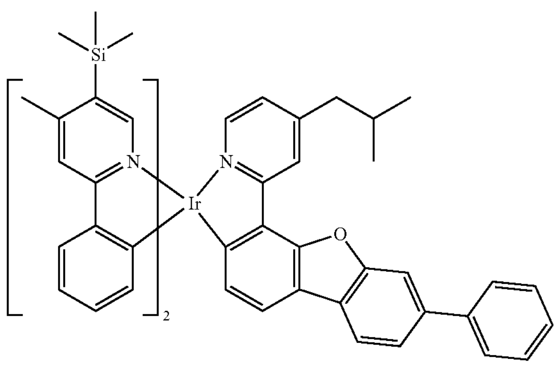
26
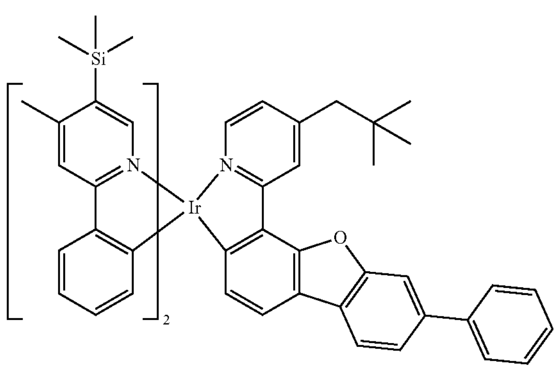
27
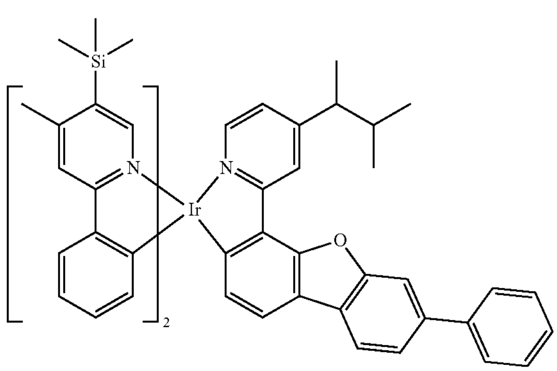
28
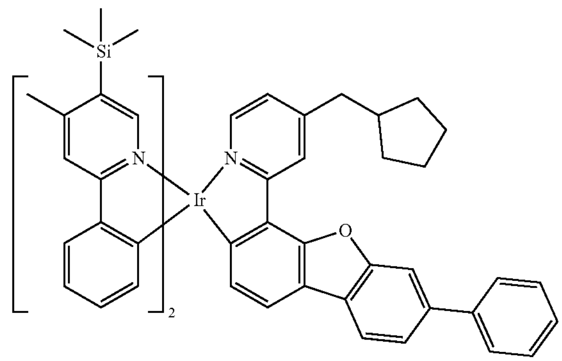
29
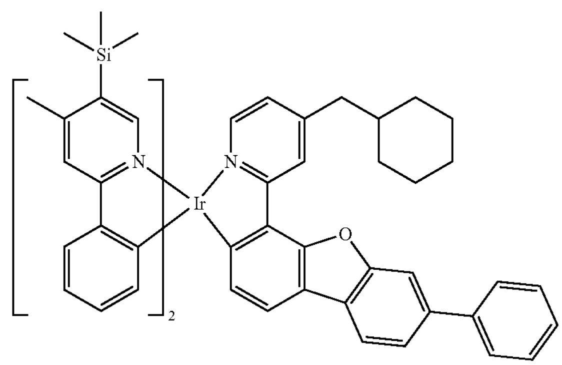
30
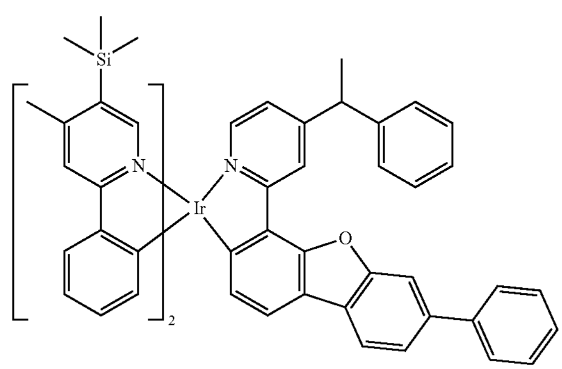
31
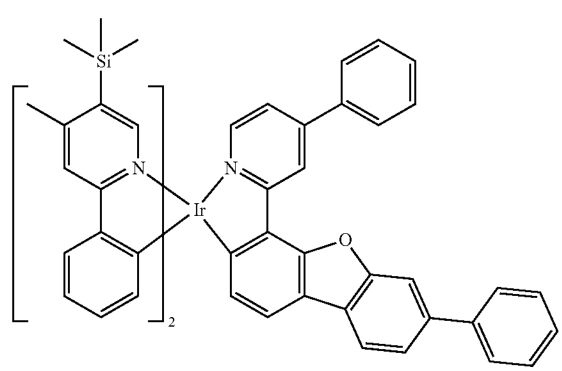

32
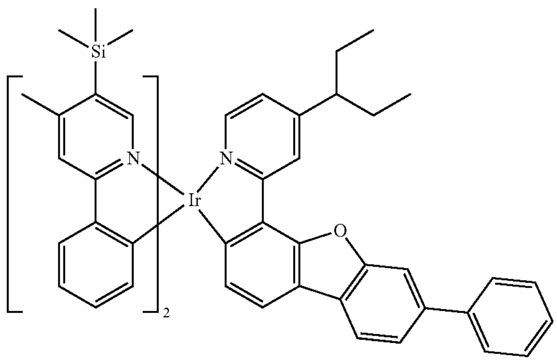
33
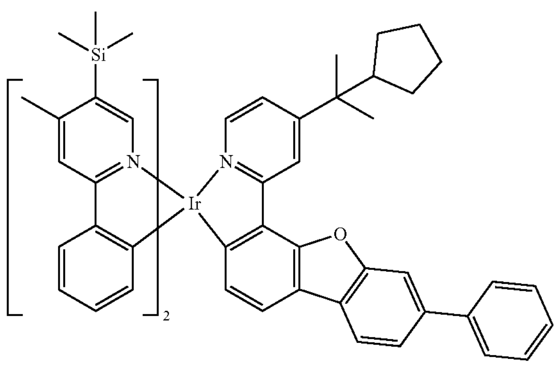
34
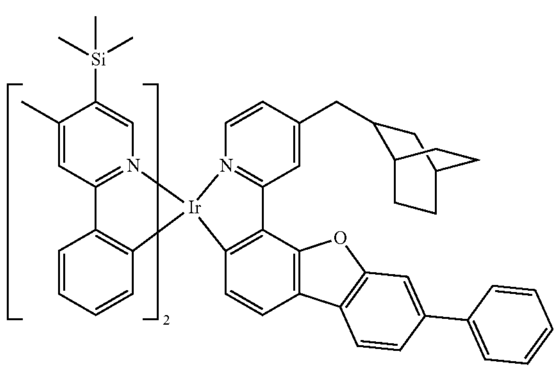
35
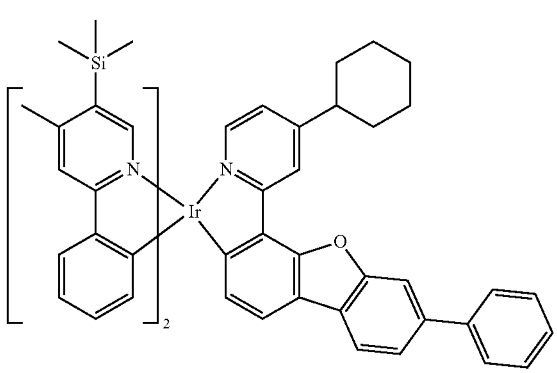
36
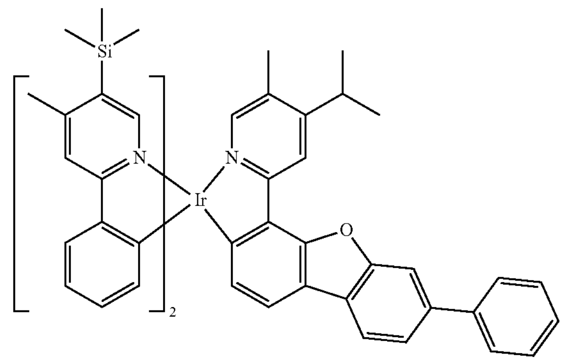
37
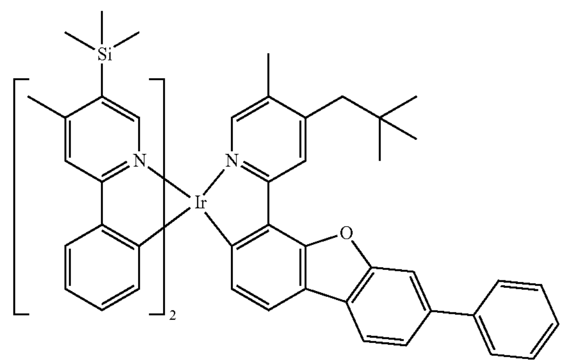
38
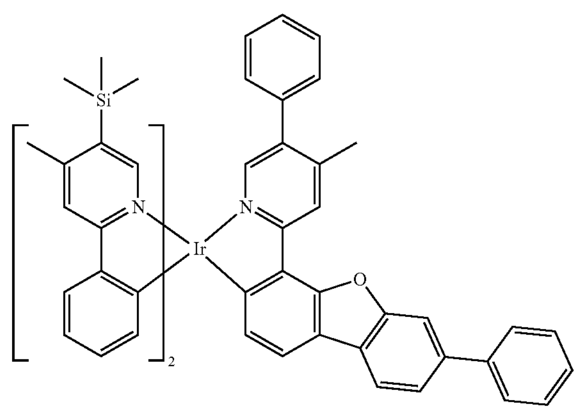
39
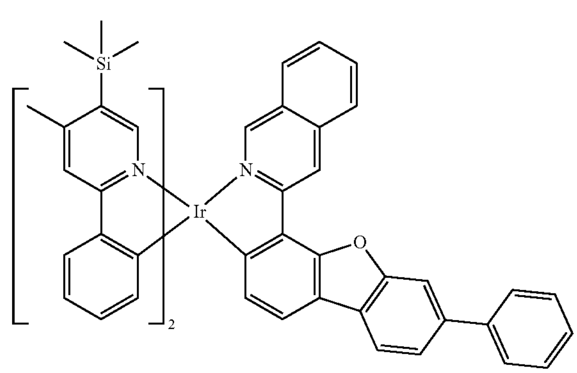

-continued
40
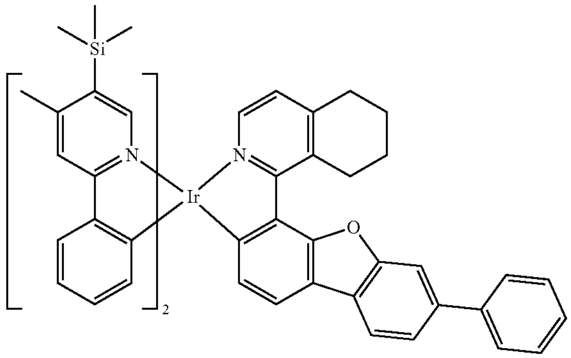
41
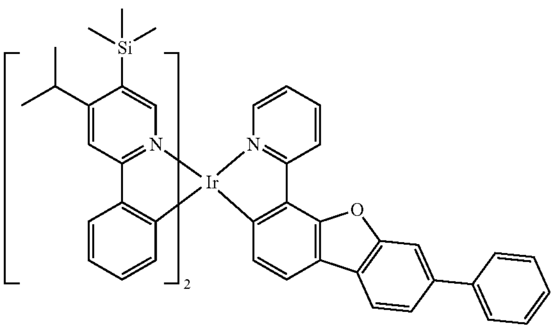
42
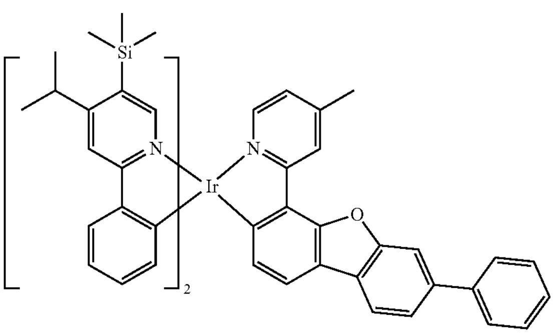
43
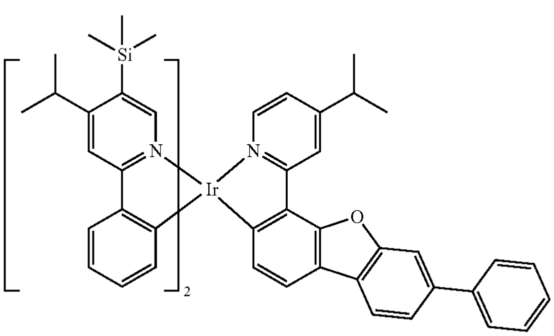
-continued
44
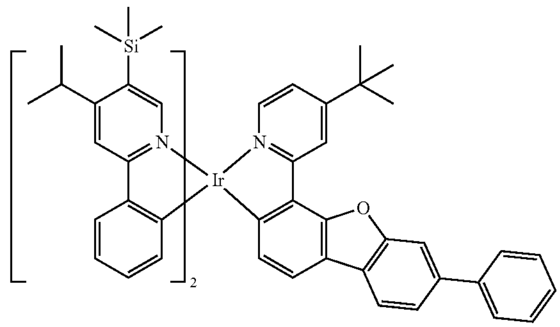
45
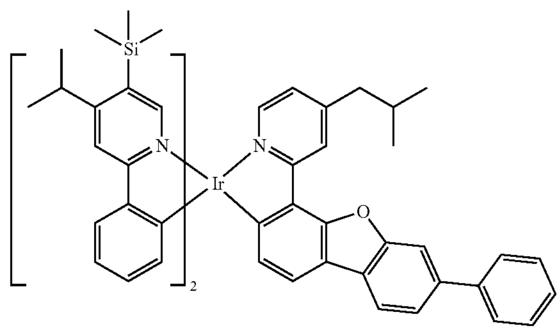
46
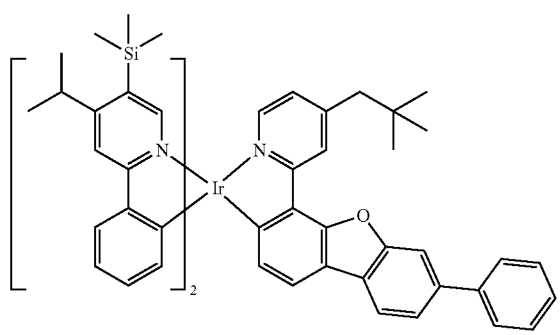
47
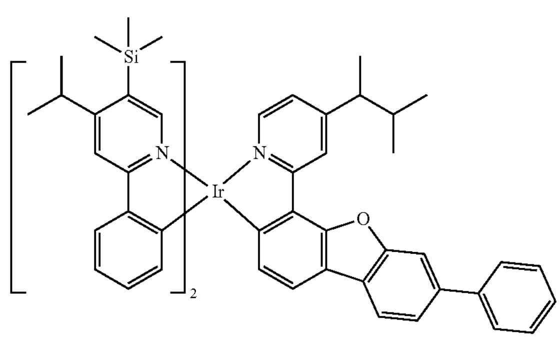

48
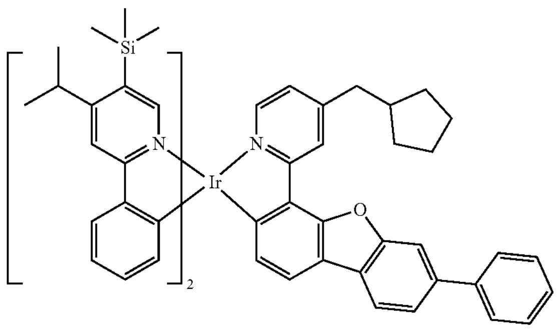
49
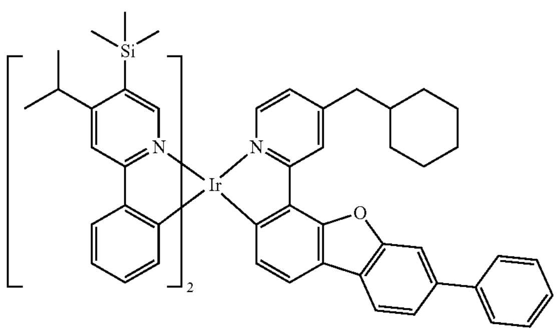
50
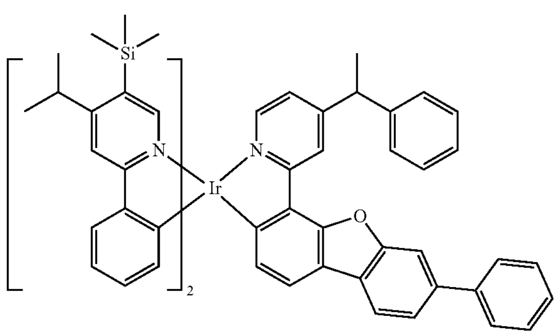
51
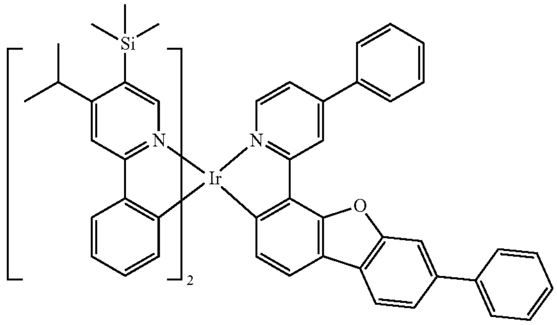
52
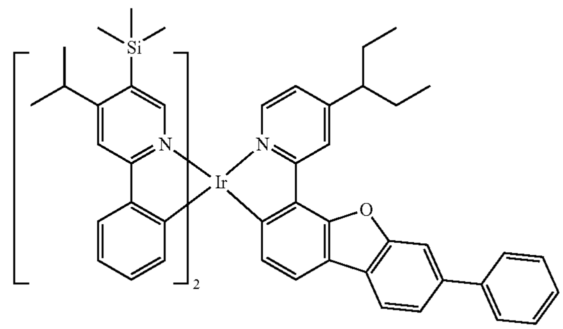
53
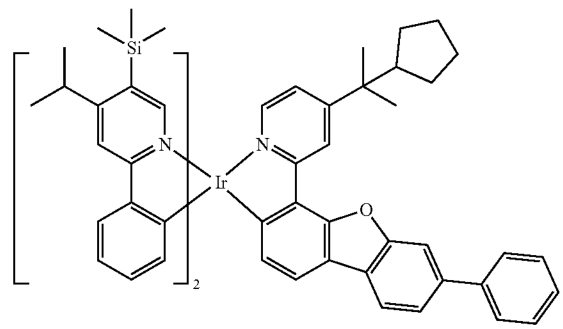
54
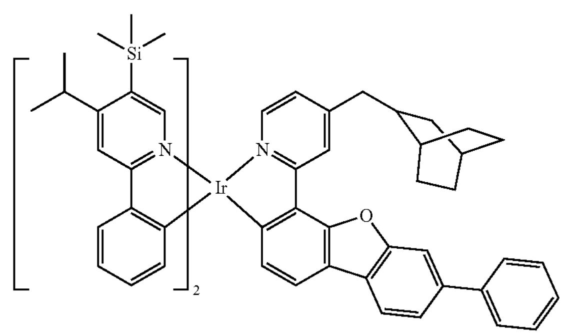
55
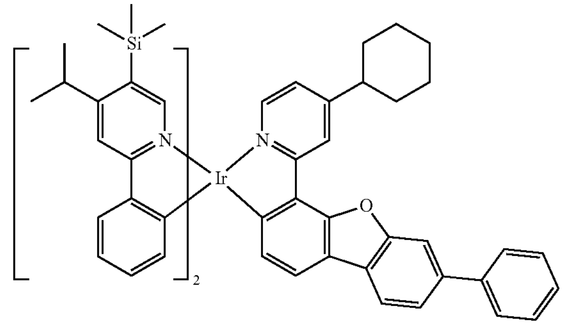

-continued
56
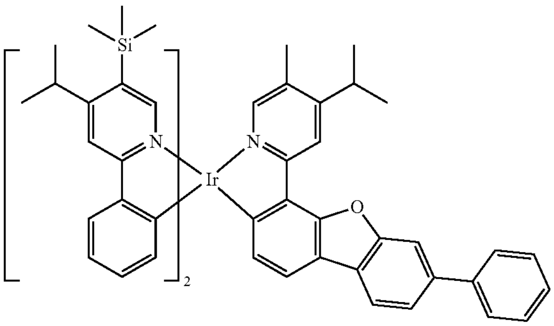
57
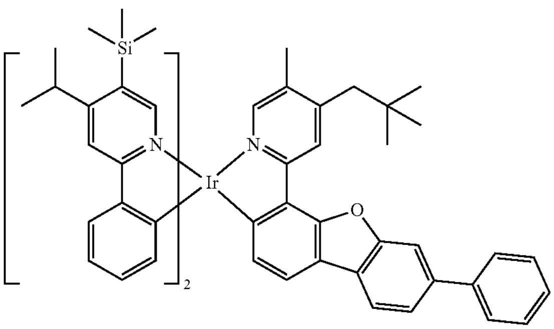
58
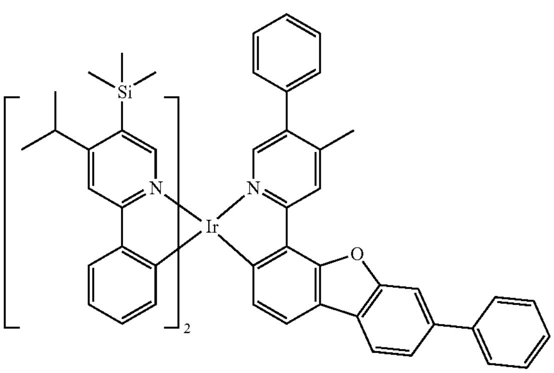
59
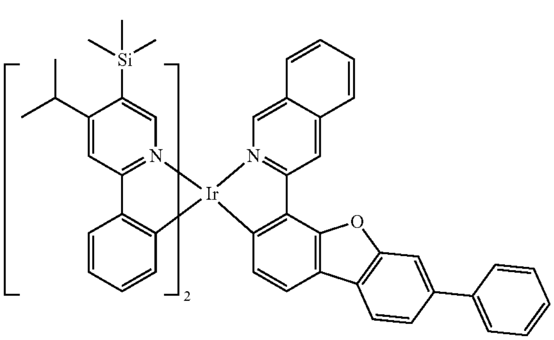
-continued
60
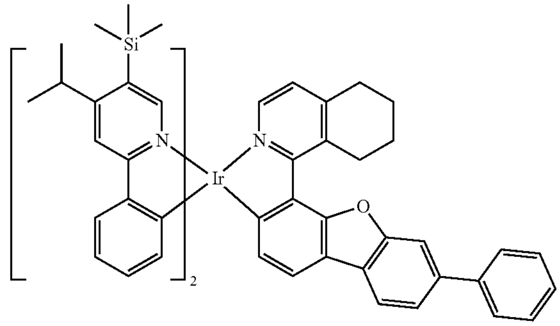
61
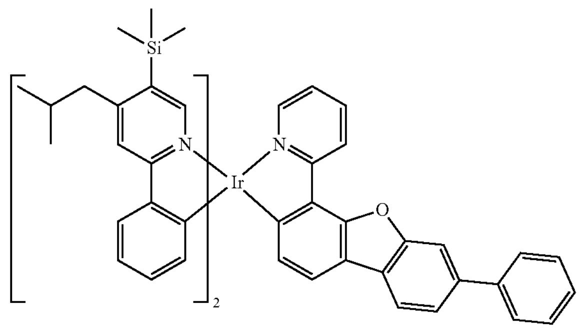
62
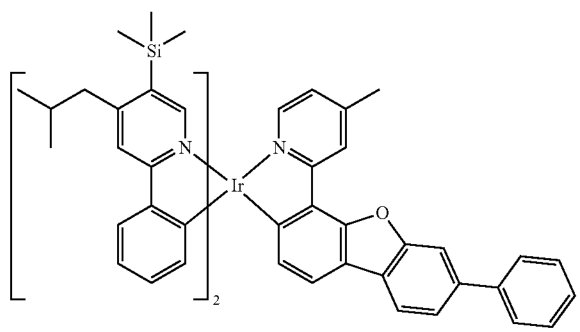
63
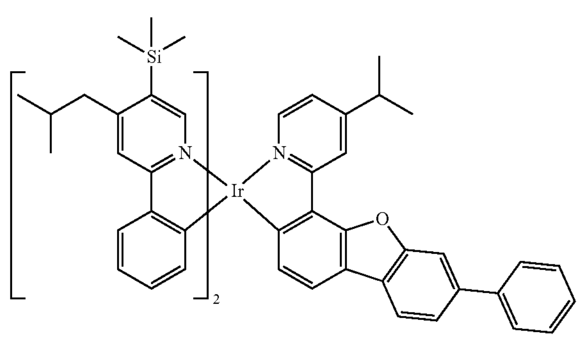

-continued
64
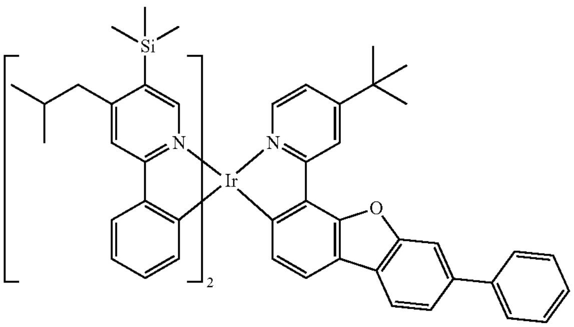
65
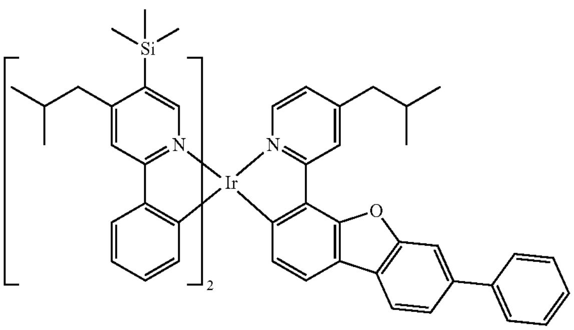
66
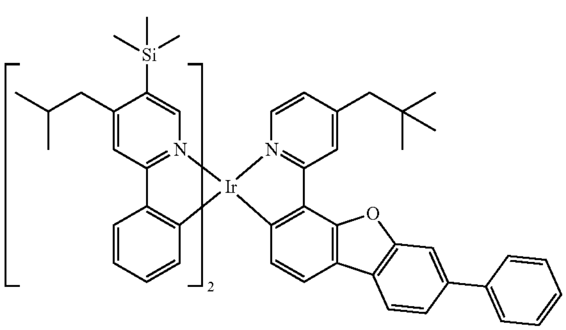
67
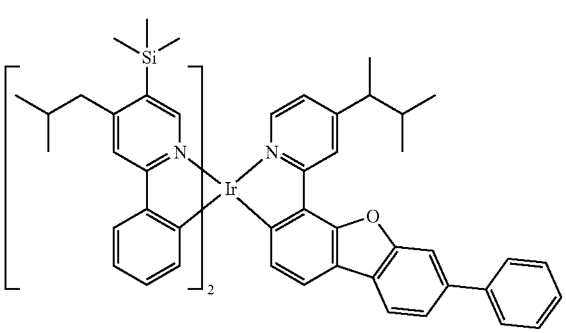
-continued
68
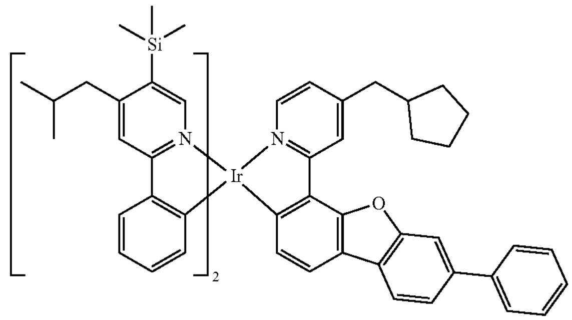
69
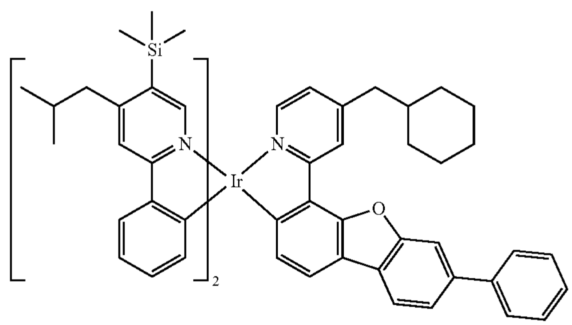
70
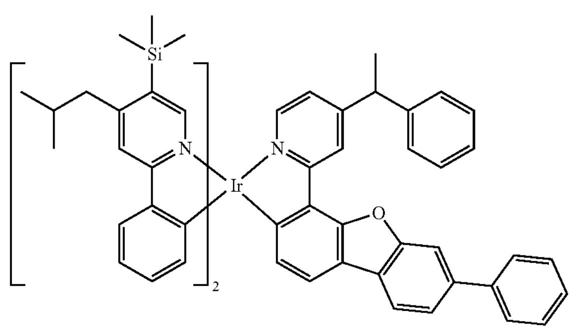
71
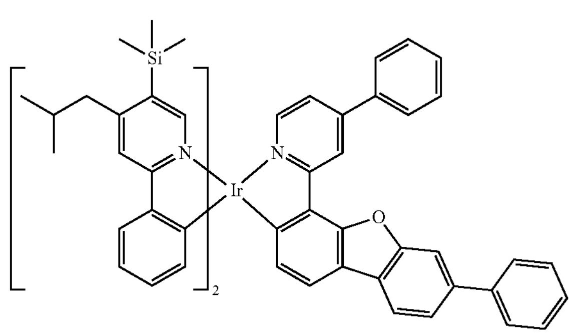

-continued
72
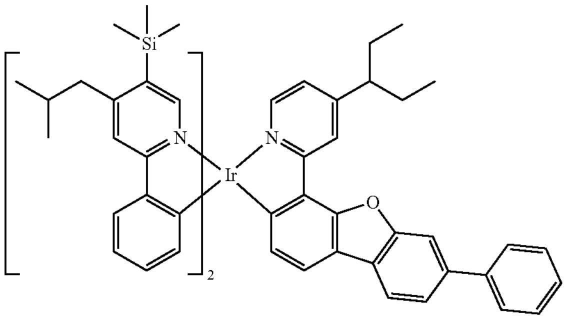
73
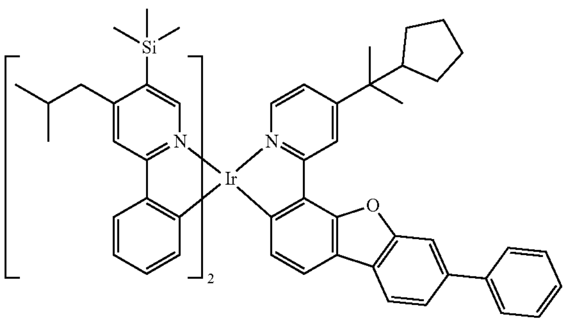
74
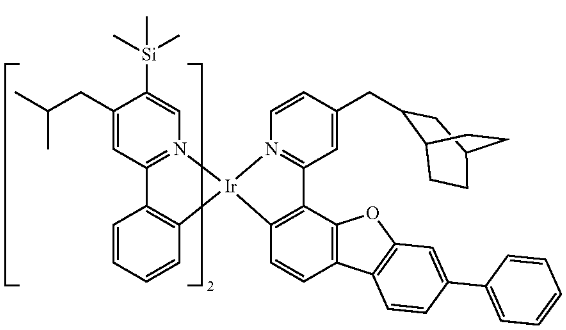
75
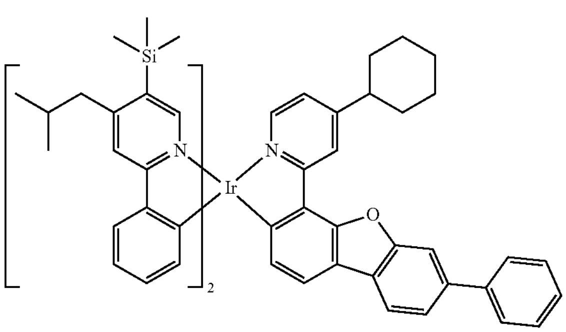
-continued
76
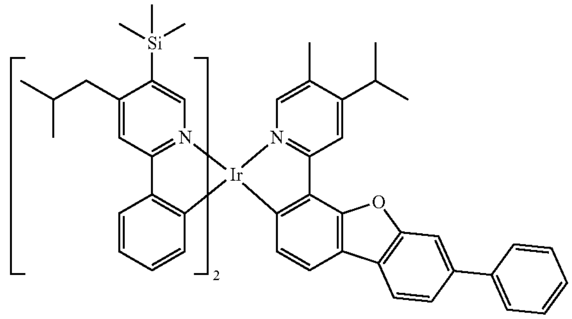
77
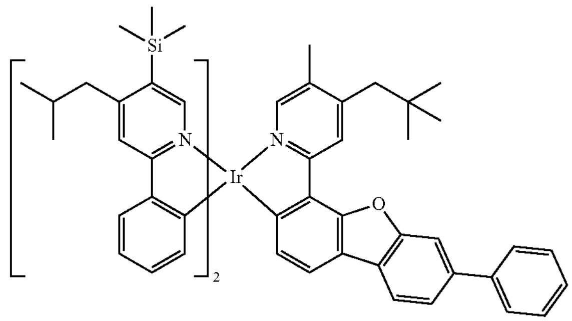
78
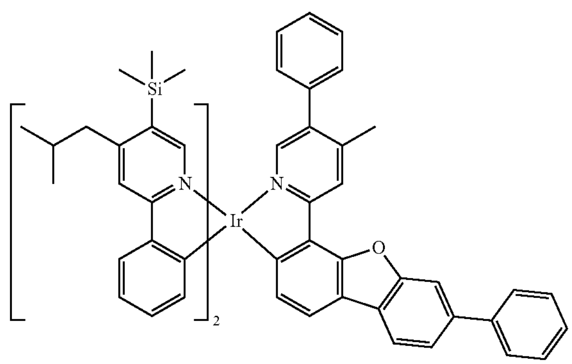
79
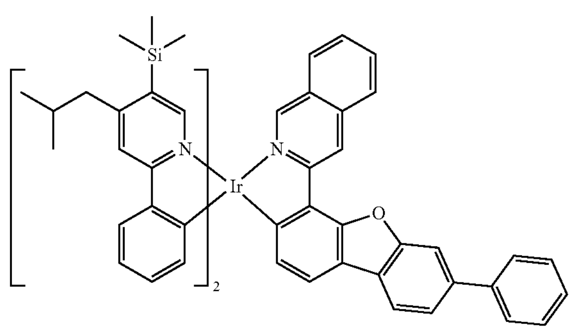

-continued
80
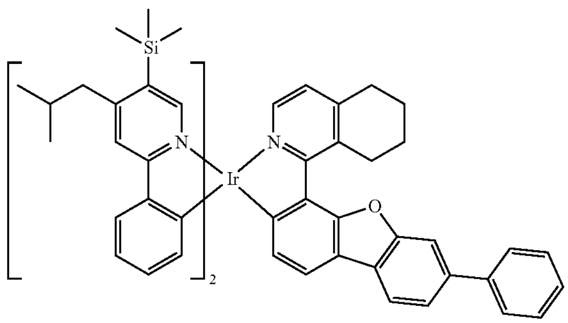
81
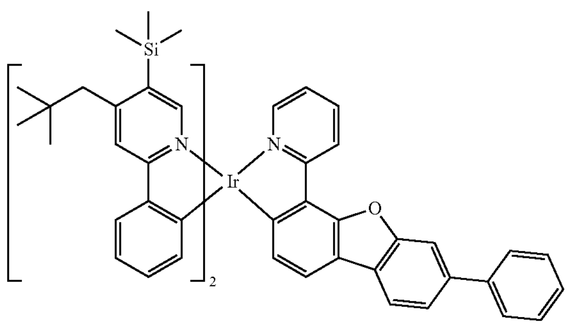
82
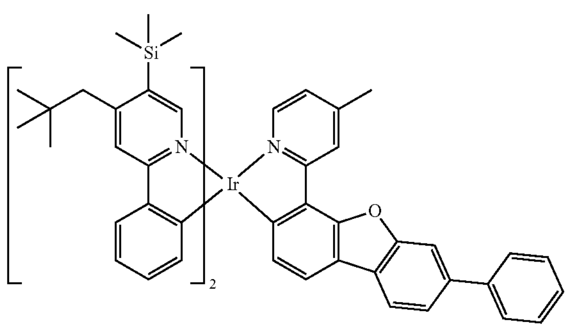
83
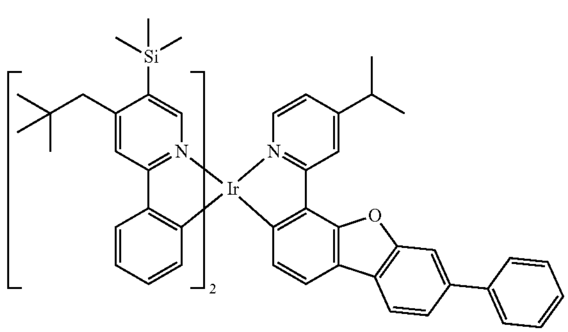
-continued
84
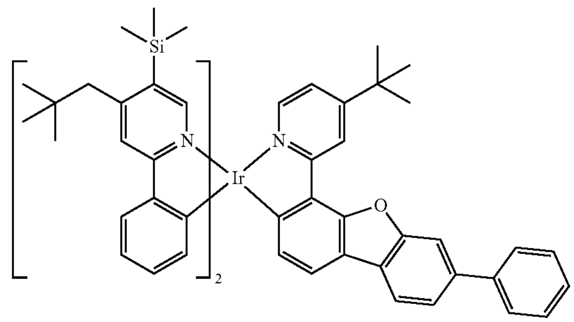
85
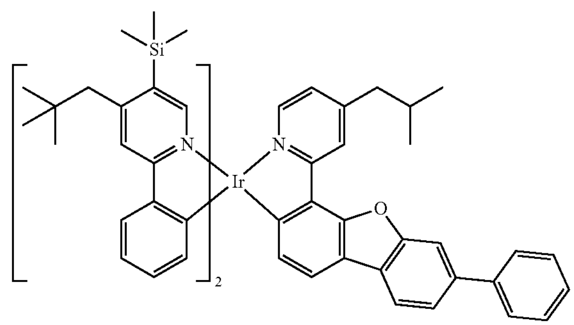
86
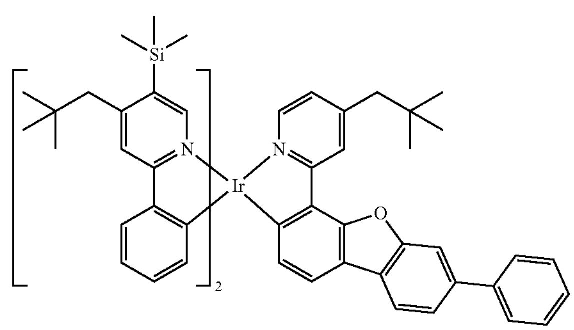
87
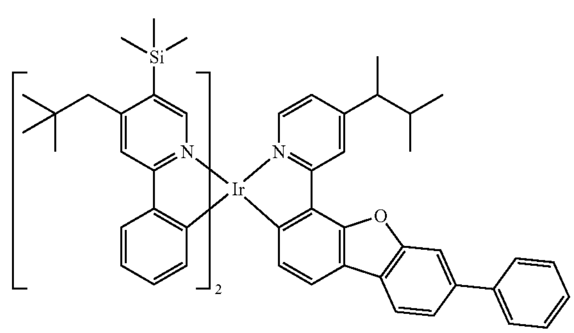

-continued
88
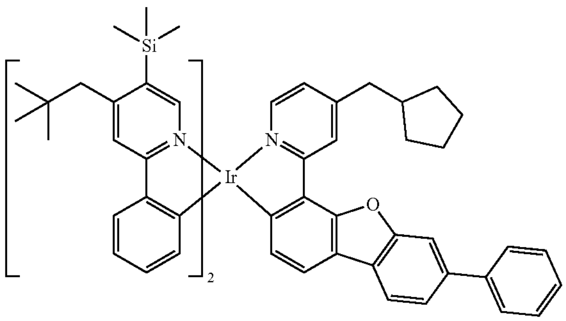
89
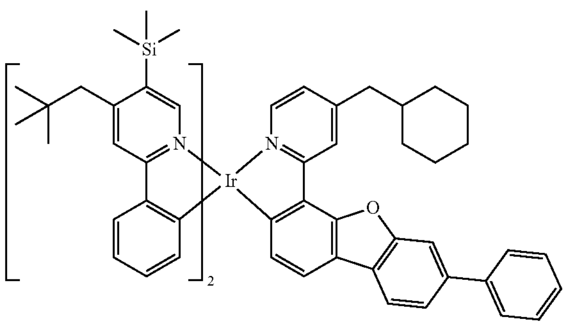
90
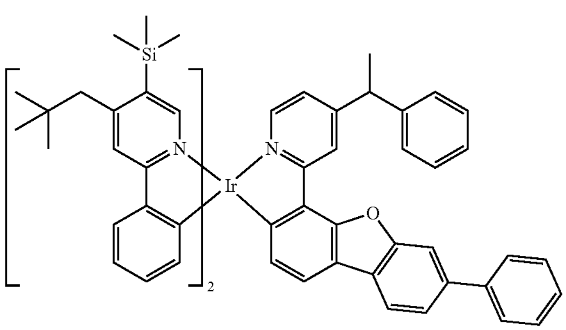
91
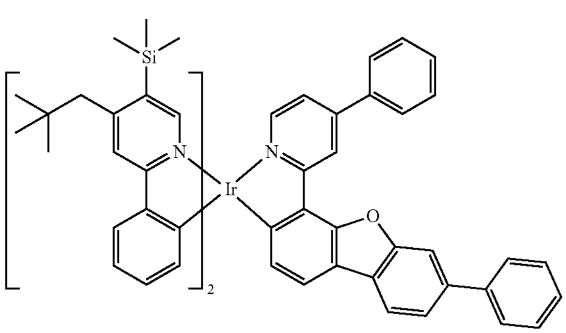
-continued
92
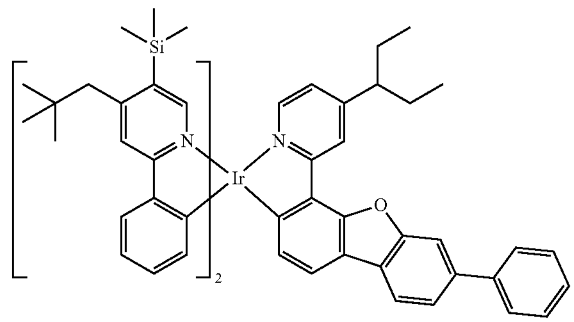
93
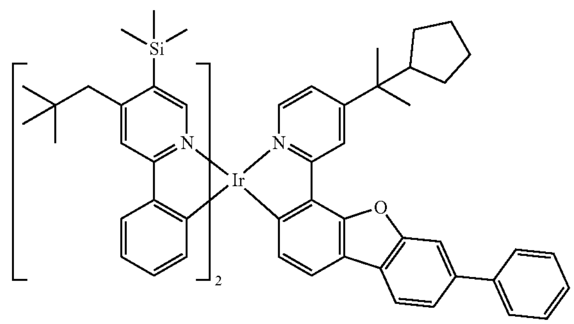
94
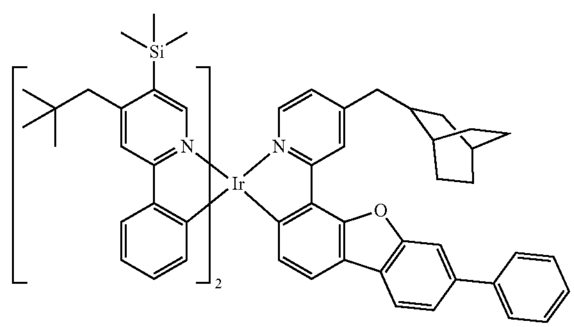
95
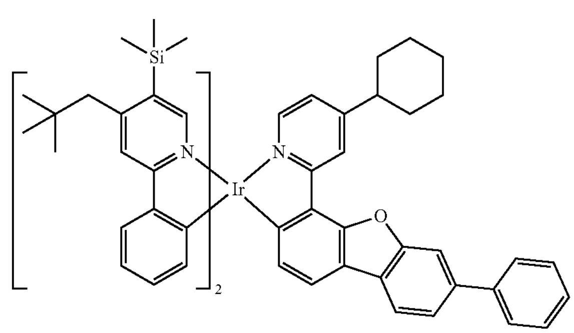

96
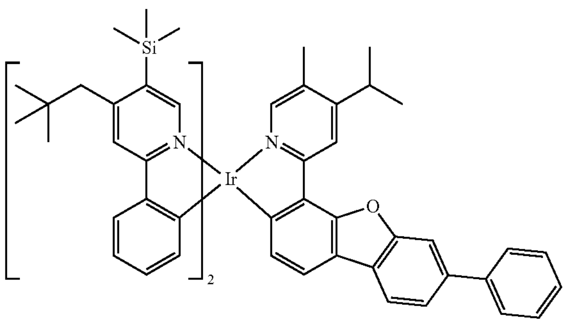
97
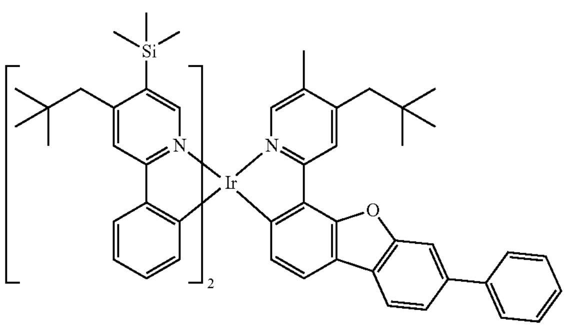
98
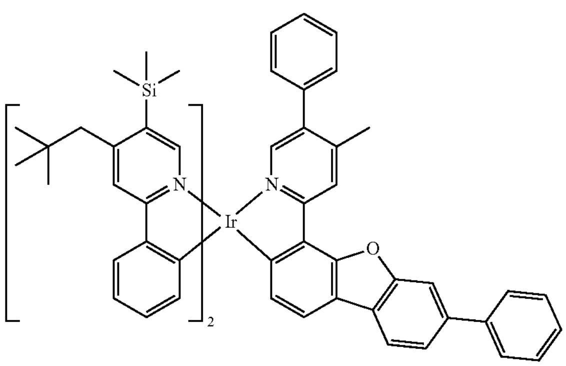
99
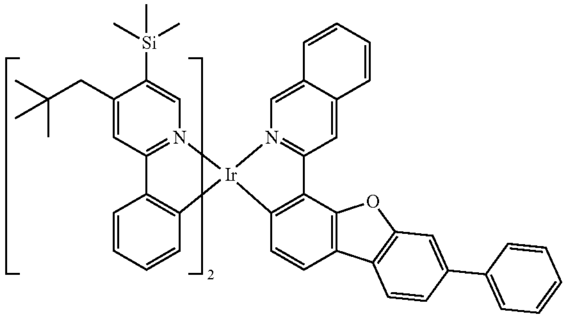
100
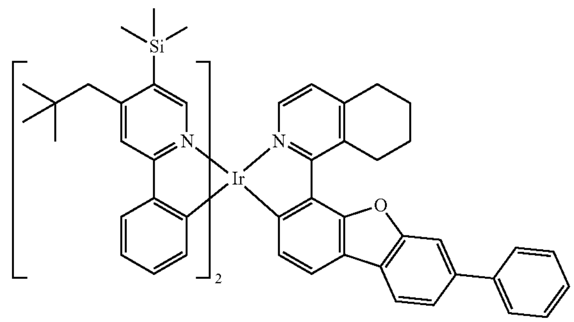
101
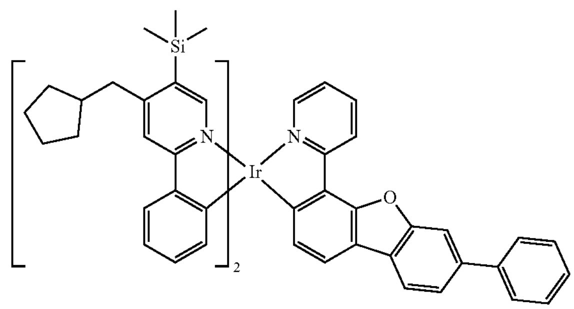
102
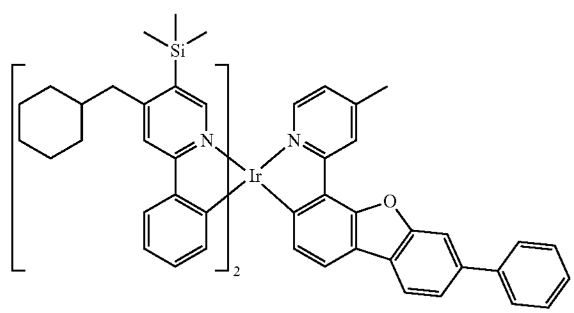
103
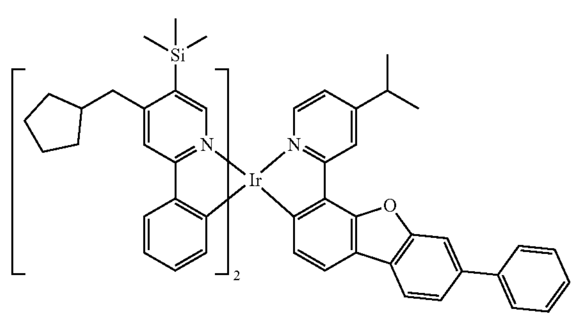
104
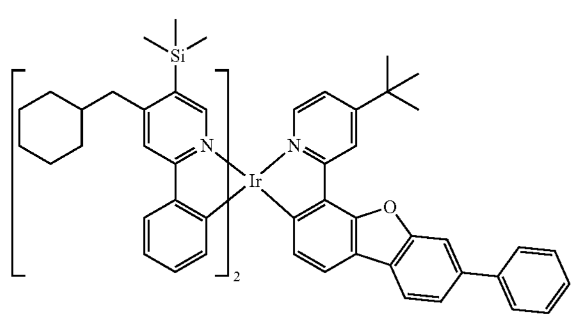

-continued
105
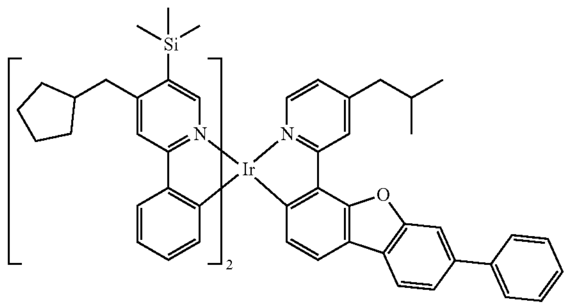
106
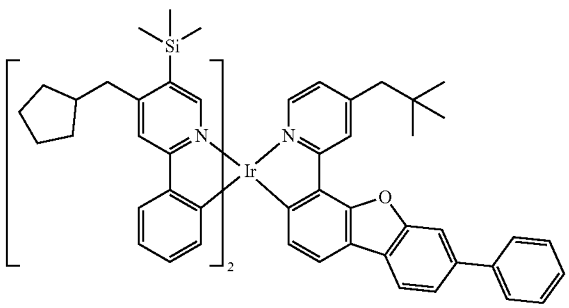
107
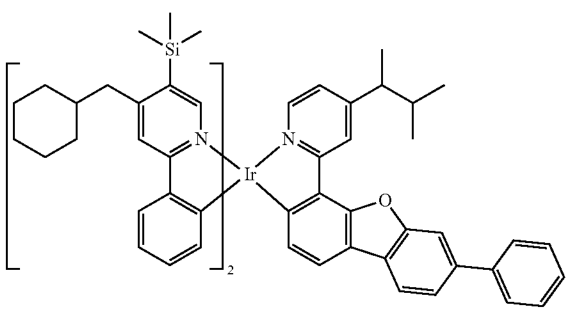
108
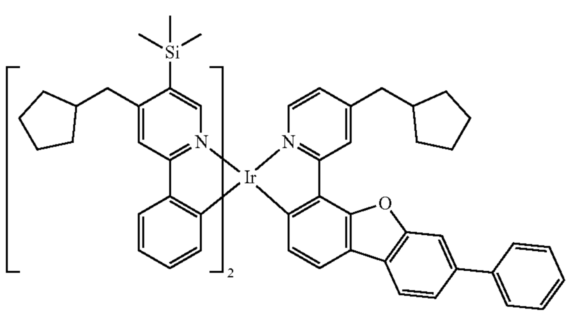
109
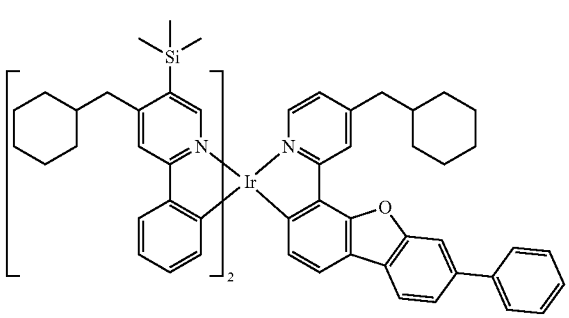
-continued
110
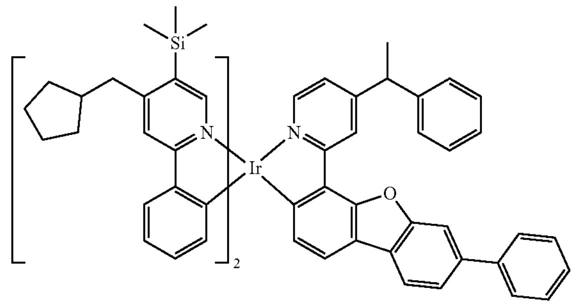
111
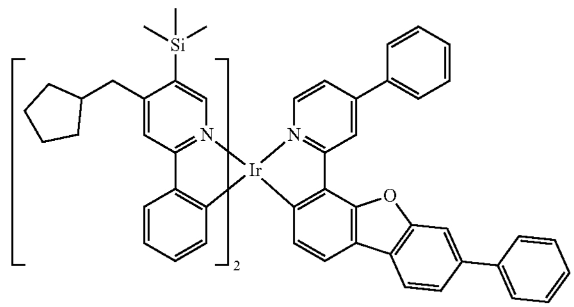
112
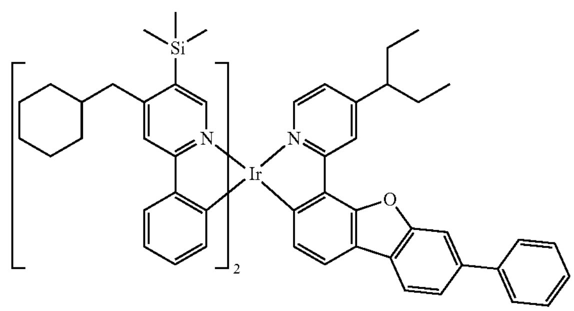
113
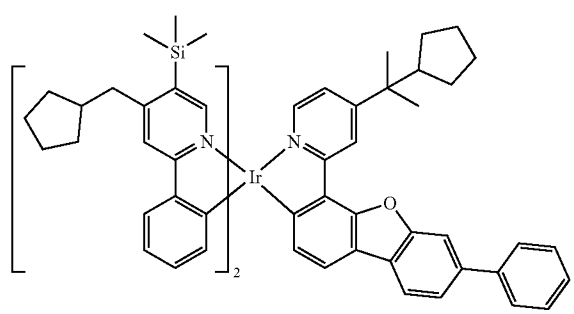
114
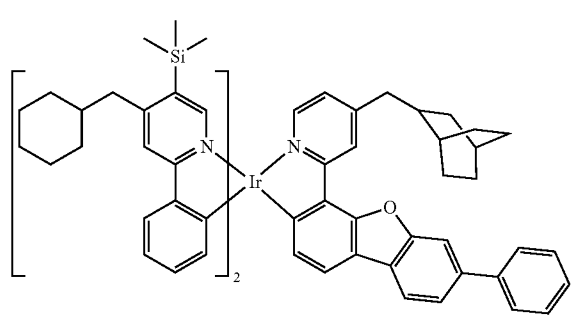

115
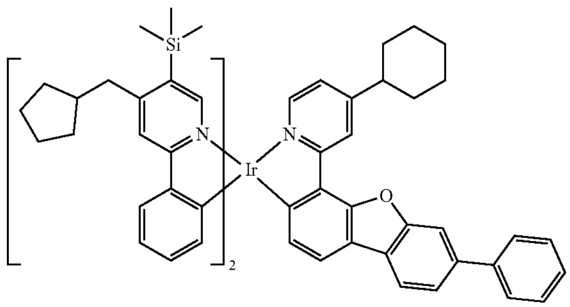
116
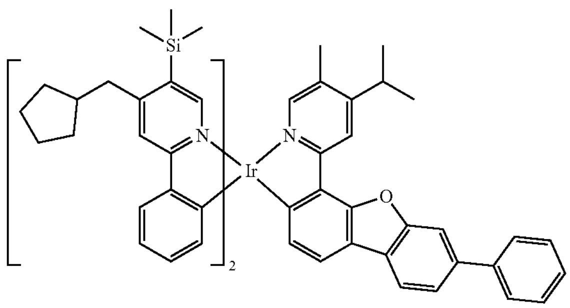
117
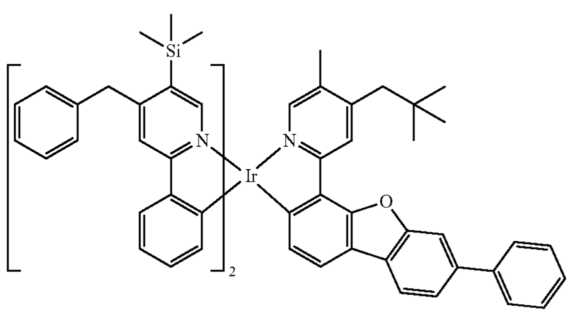
118
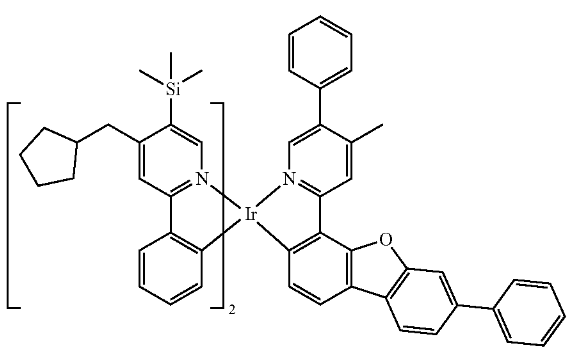
119
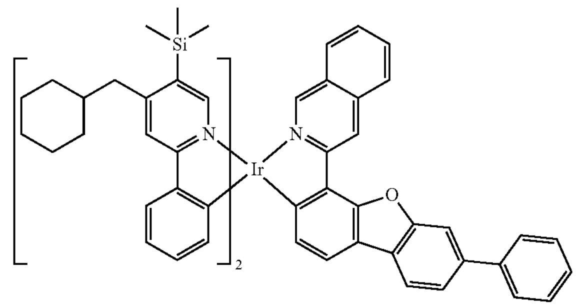
120
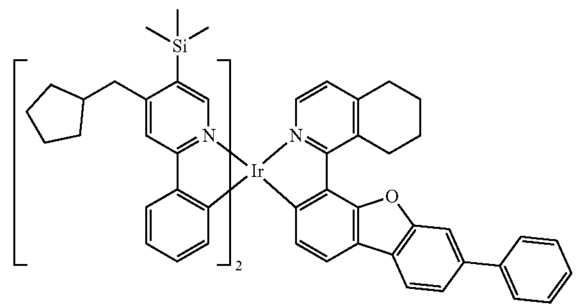
121
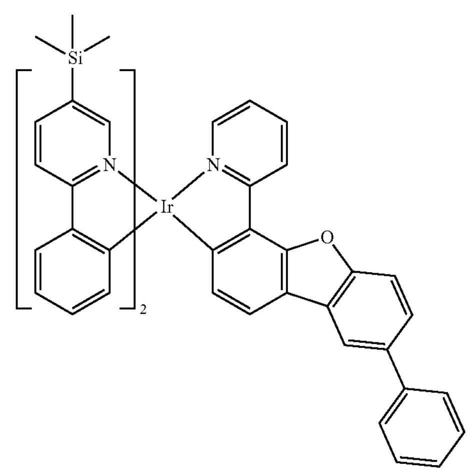
122
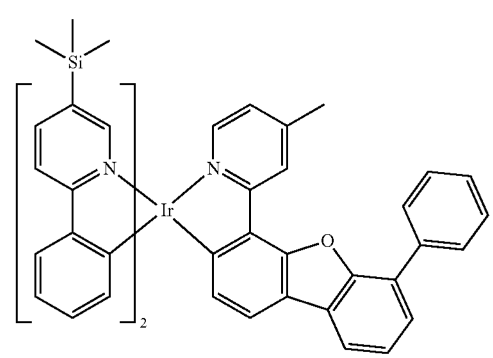

123
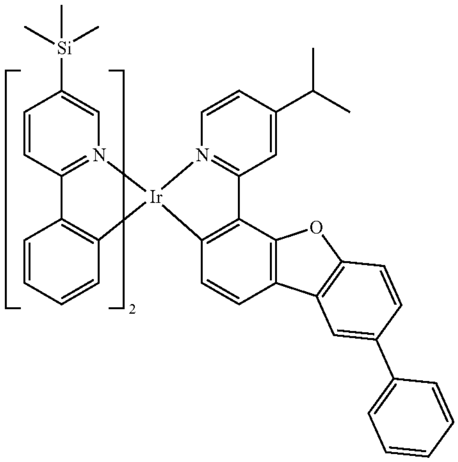
124
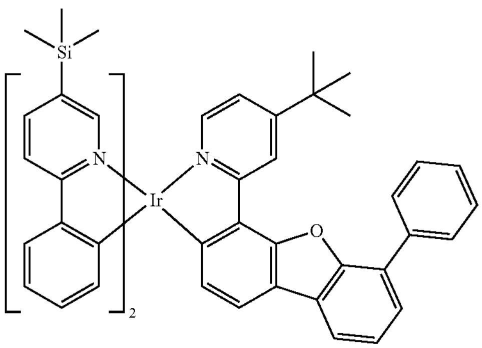
125
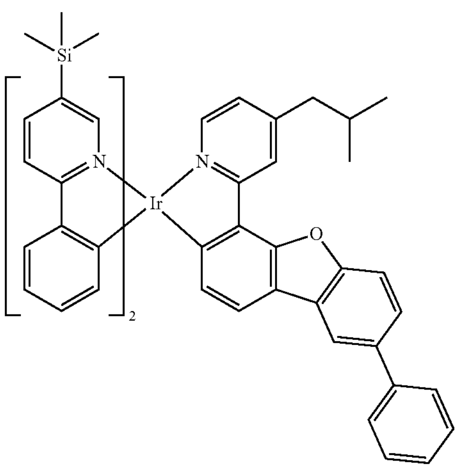
126
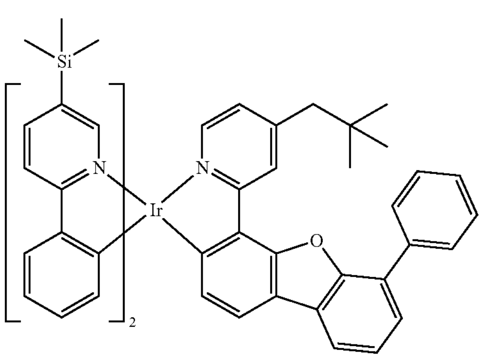
127
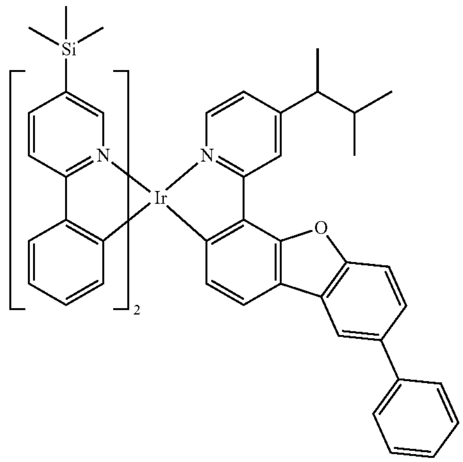
128
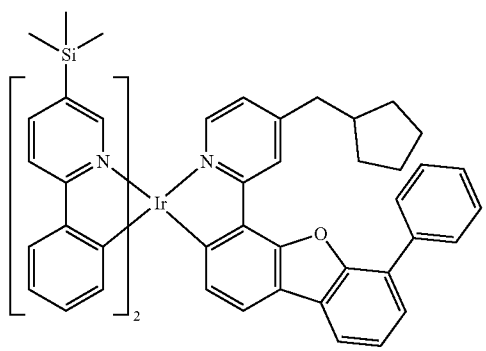
129
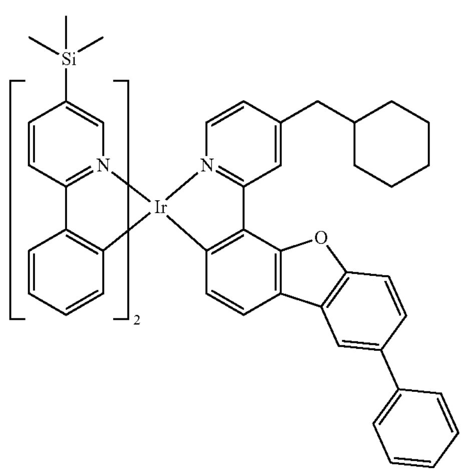

-continued
130
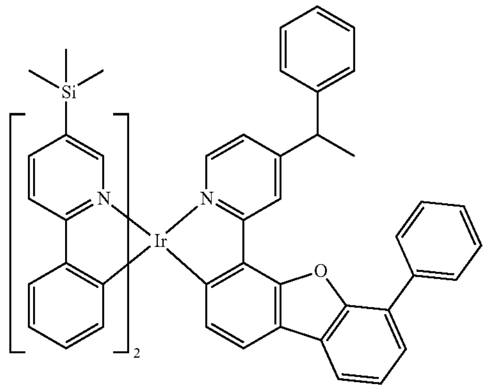
131
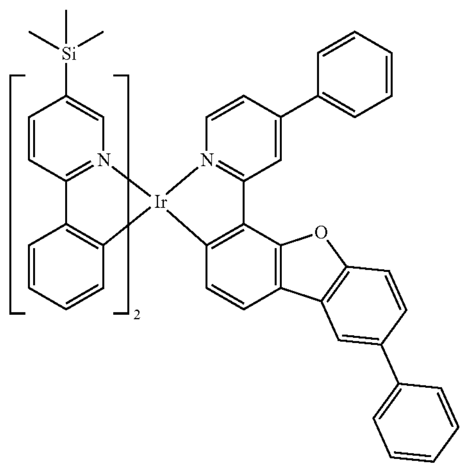
132
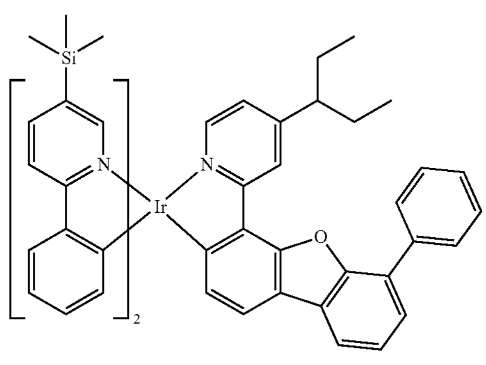
-continued
133
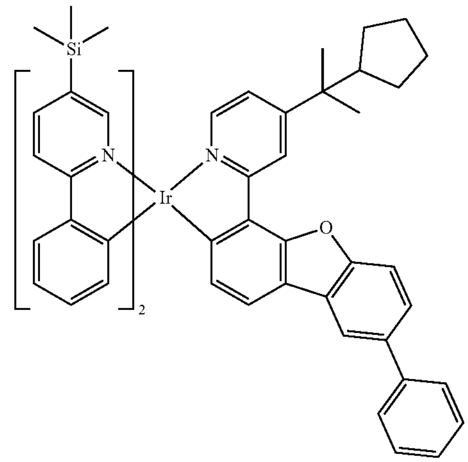
134
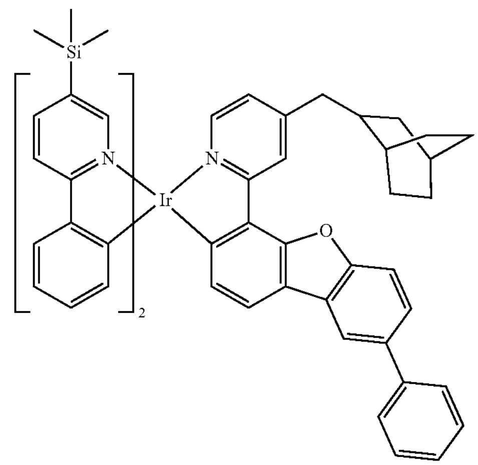
135
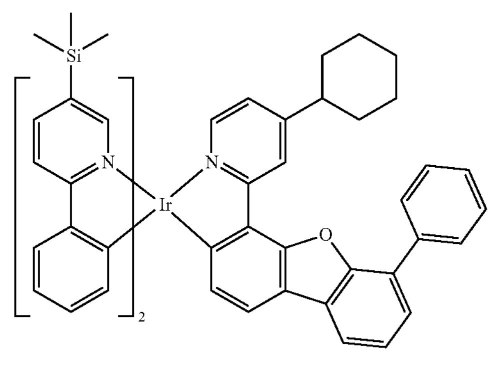

-continued
136
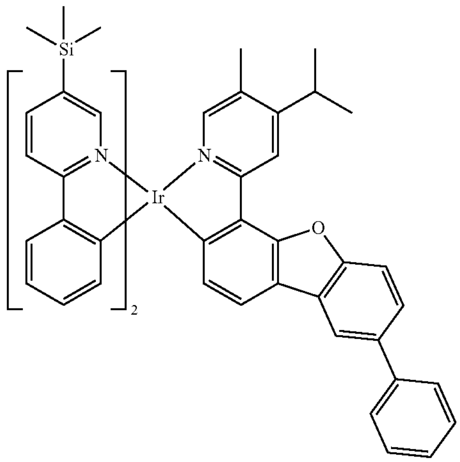
137
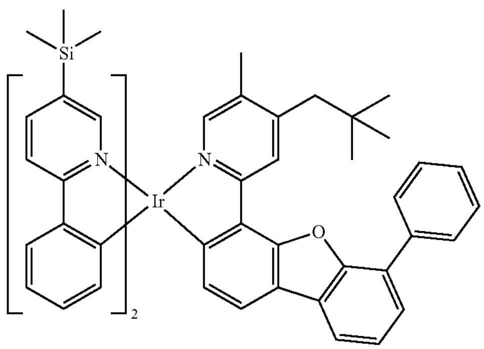
138
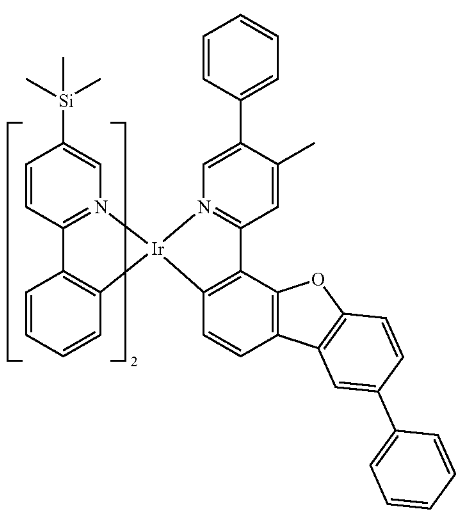
-continued
139
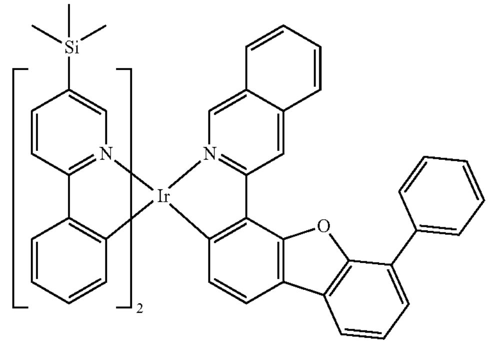
140
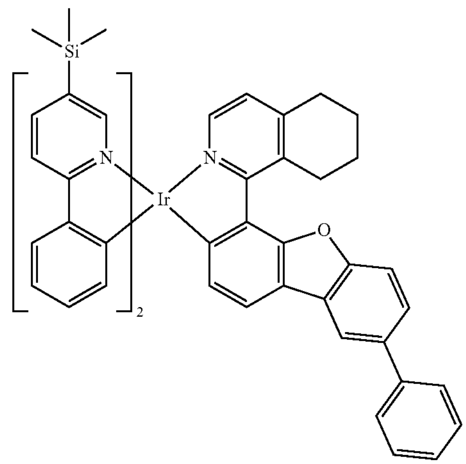
141
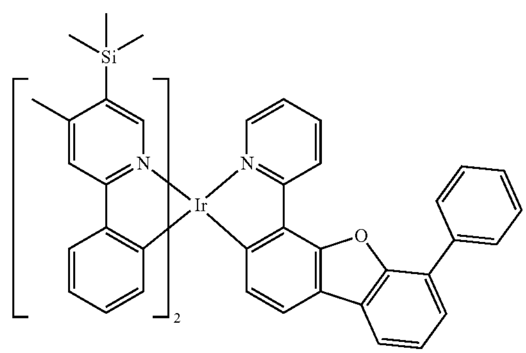
142
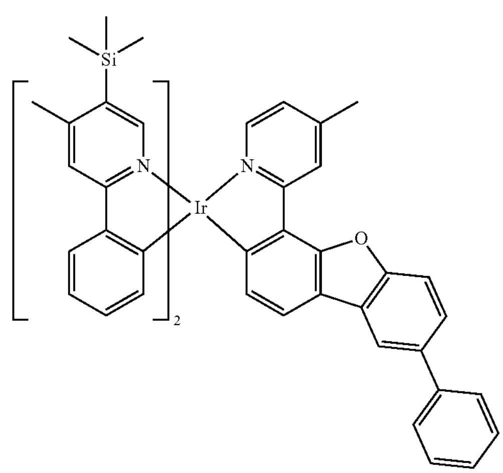

-continued
143
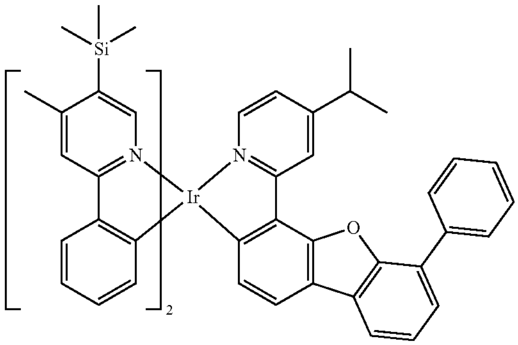
144
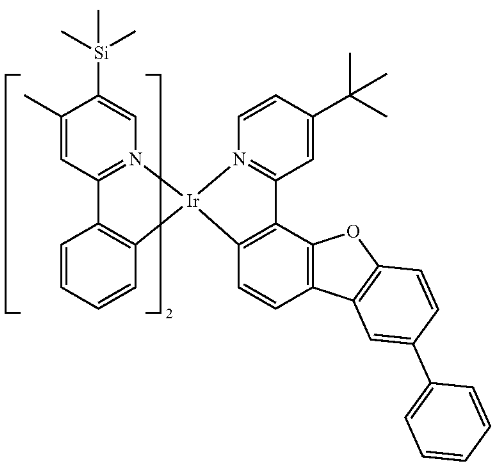
145
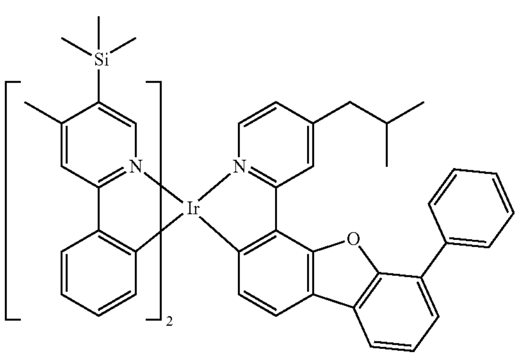
-continued
146
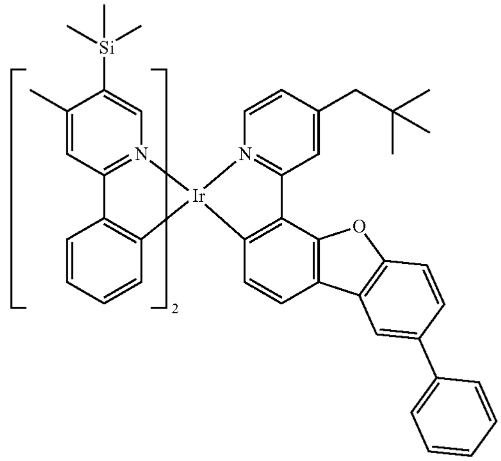
147
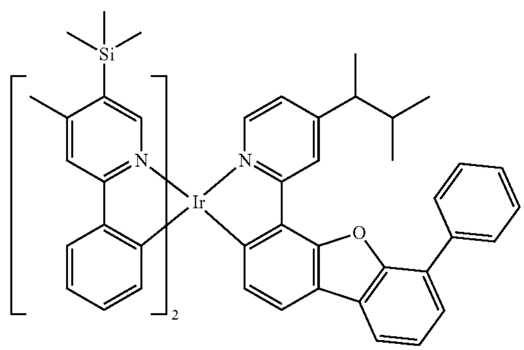
148
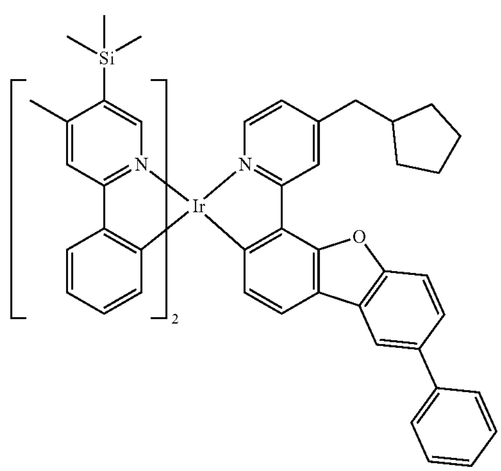

-continued
148
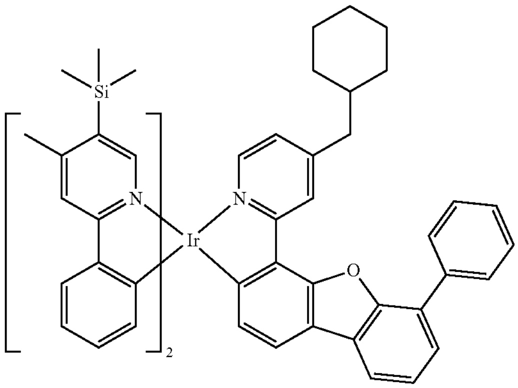
150
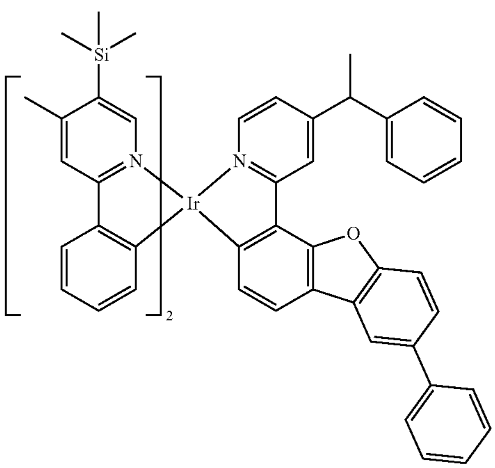
151
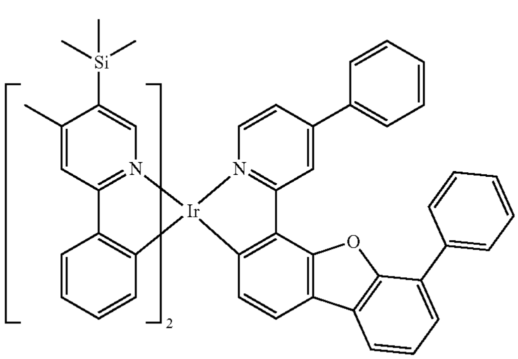
-continued
152
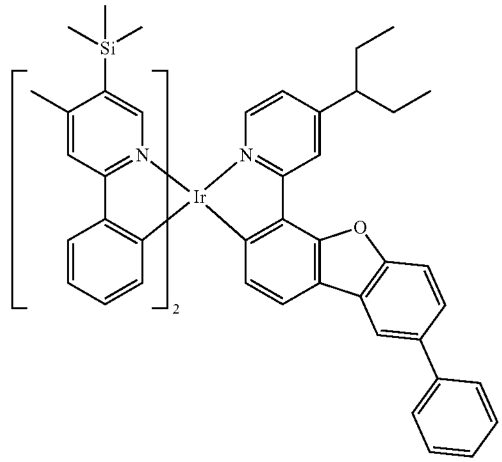
153
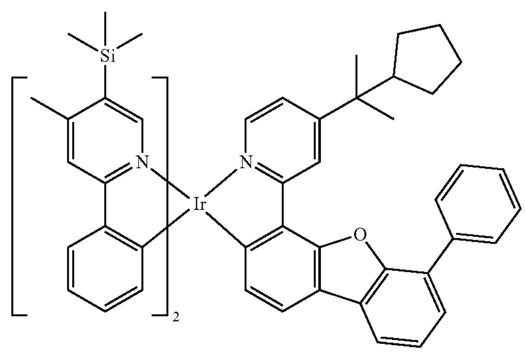
154
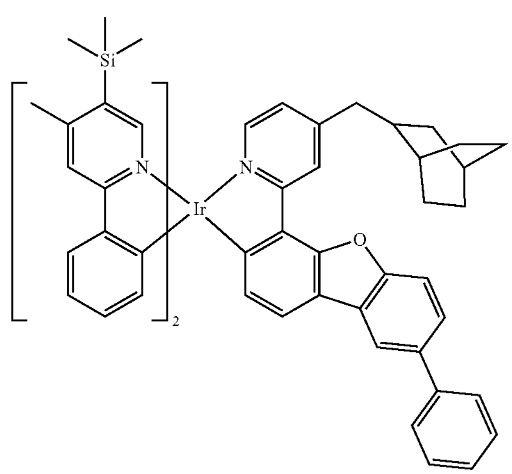

155
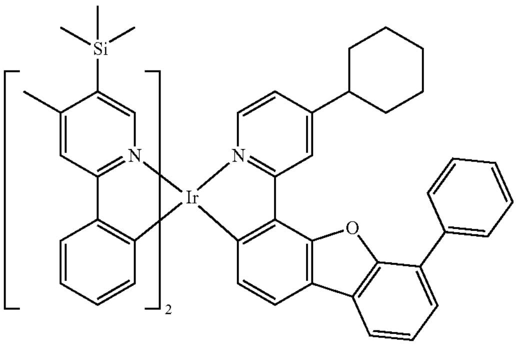
156
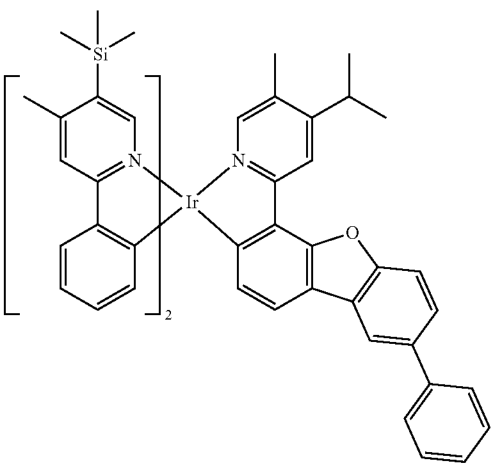
157
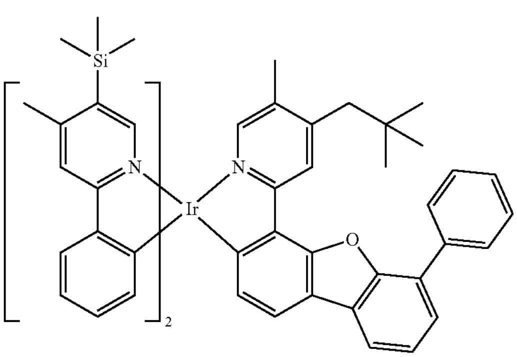
158
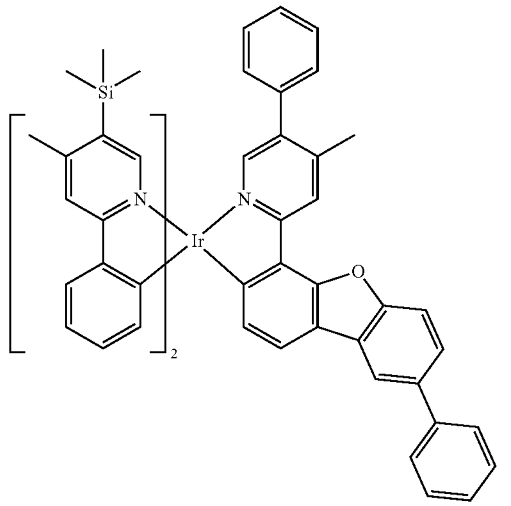
159
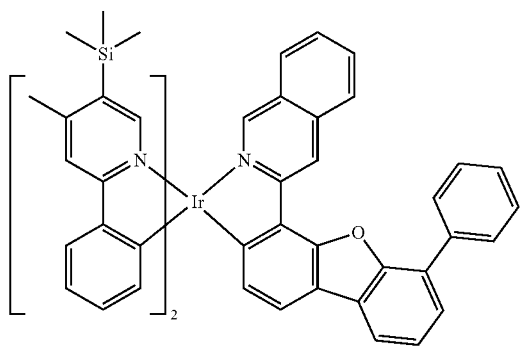
160
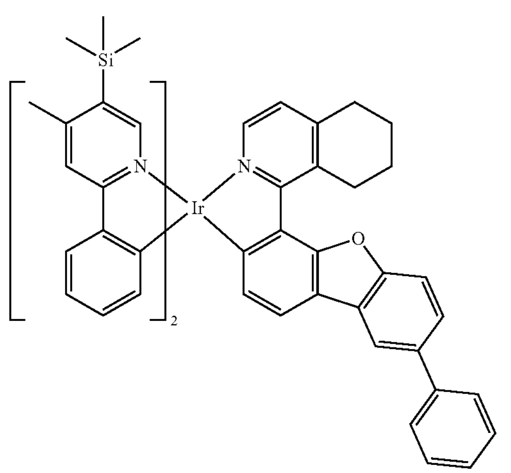

-continued
161
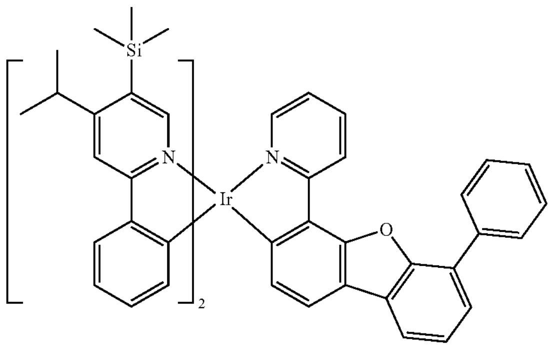
162
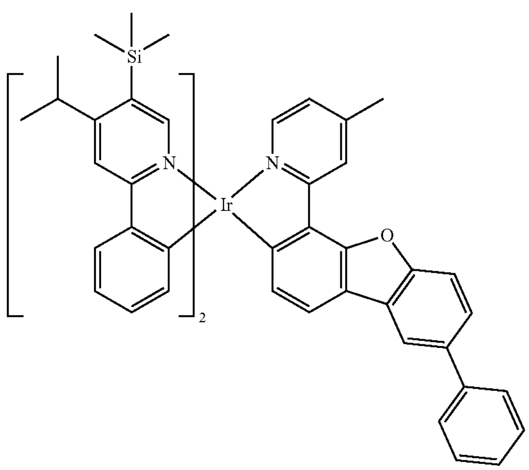
163
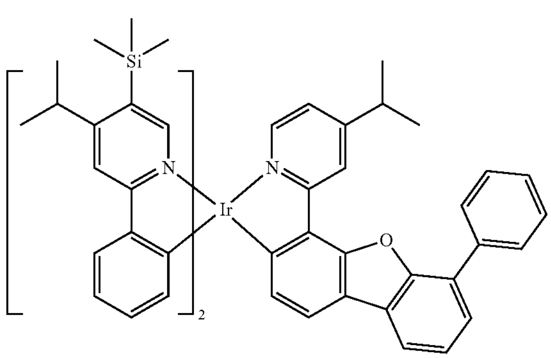
-continued
164
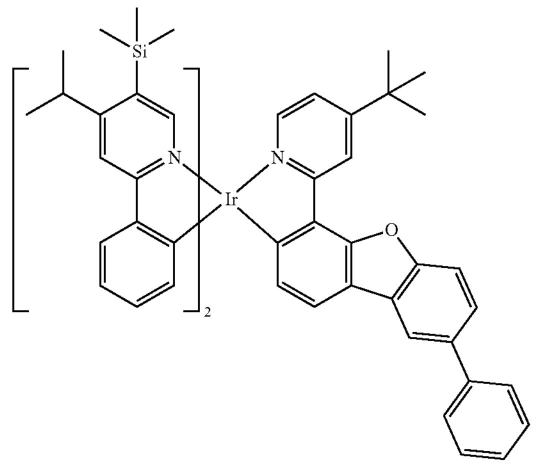
165
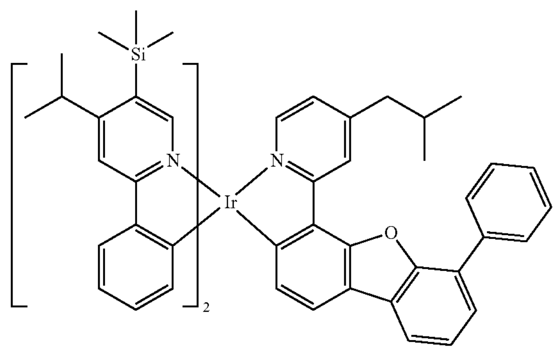
166
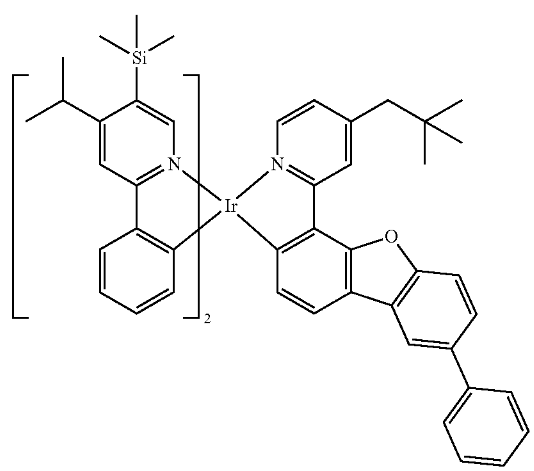

-continued
167
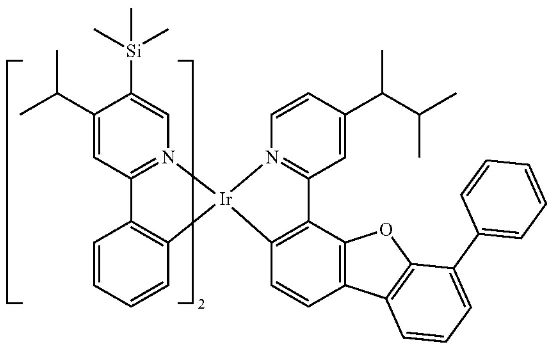
168
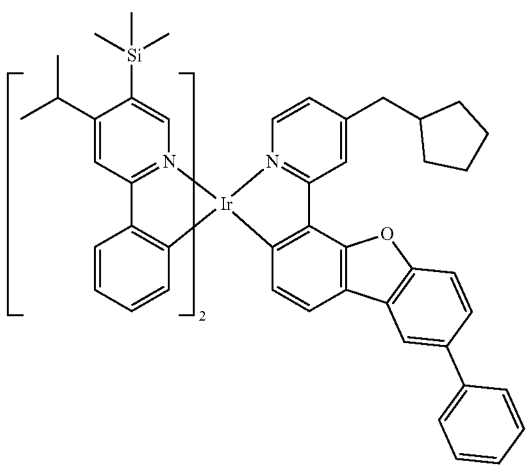
169
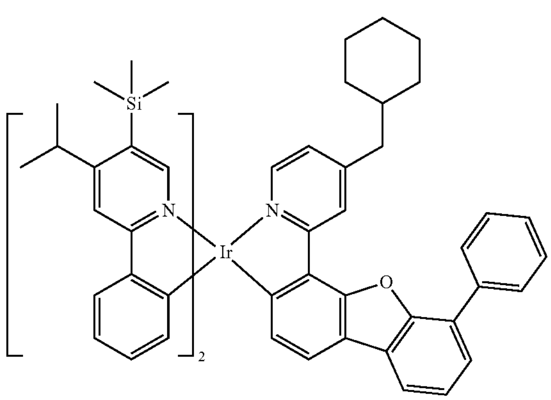
-continued
170
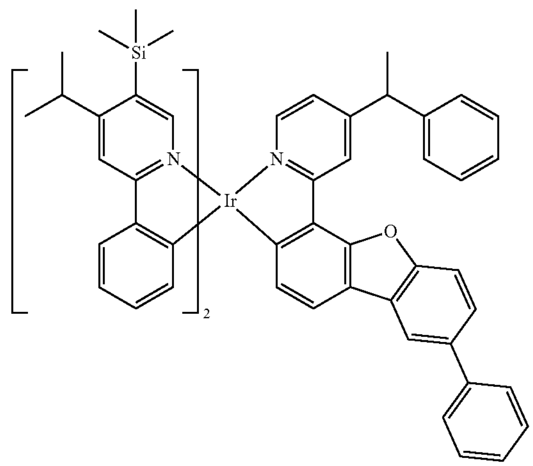
171
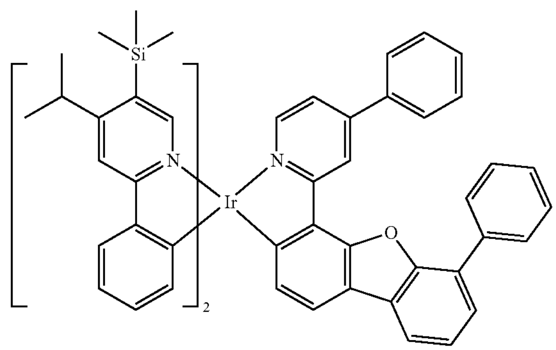
172
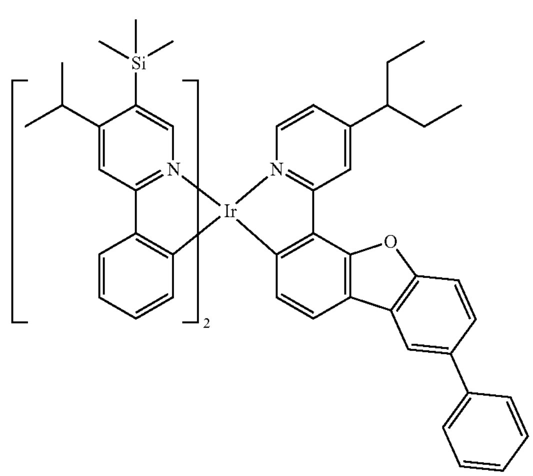

-continued
173
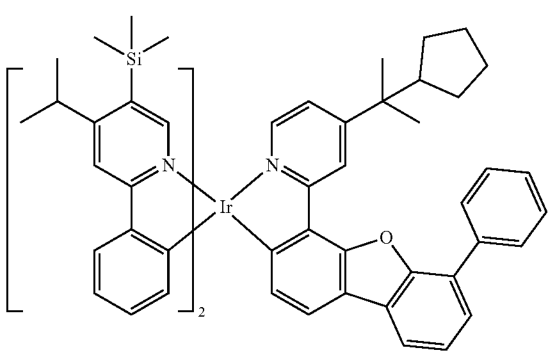
174
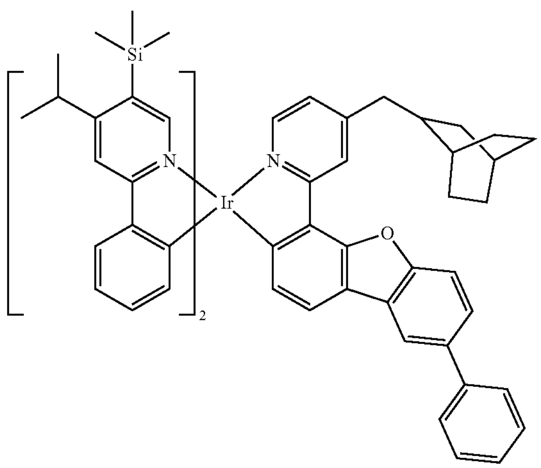
175
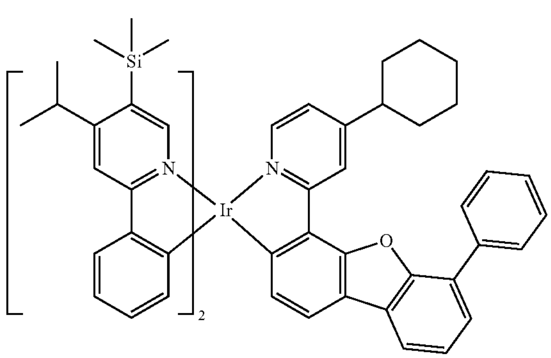
-continued
176
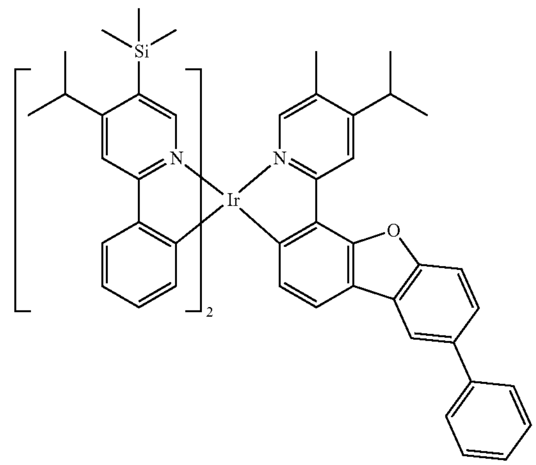
177
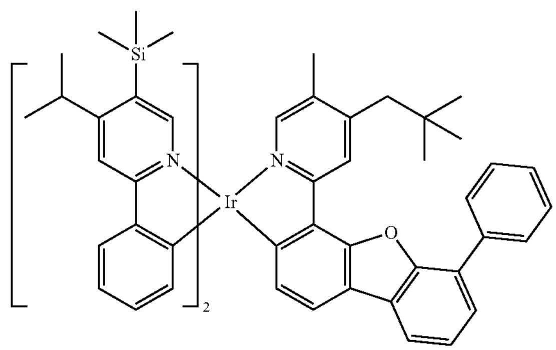
178
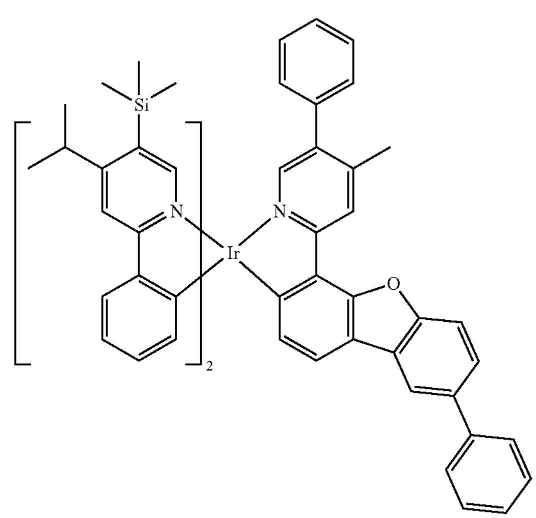

179
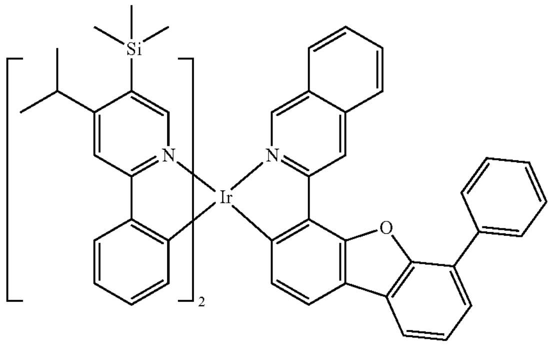
180
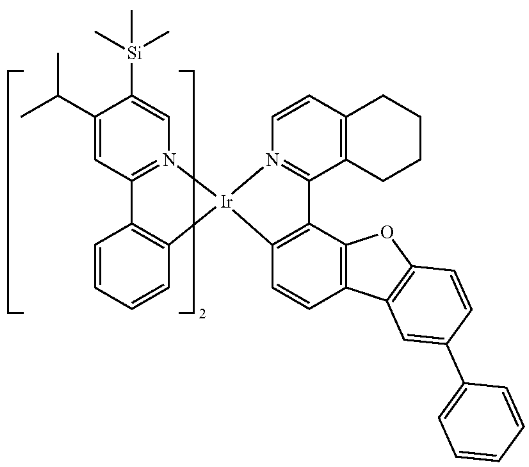
181
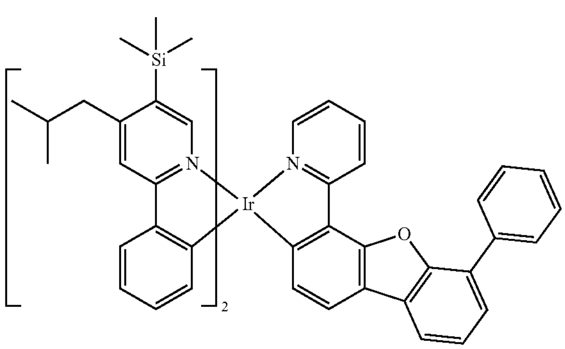
182
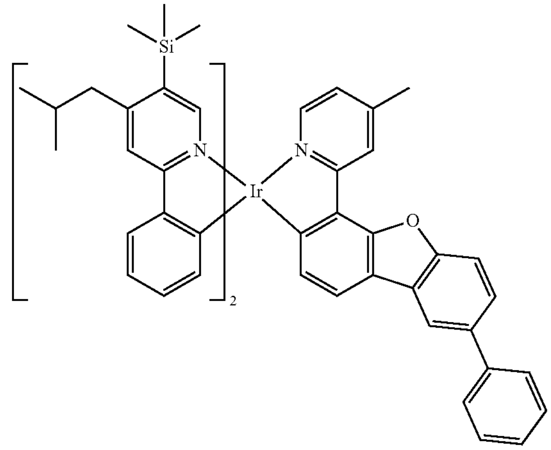
183
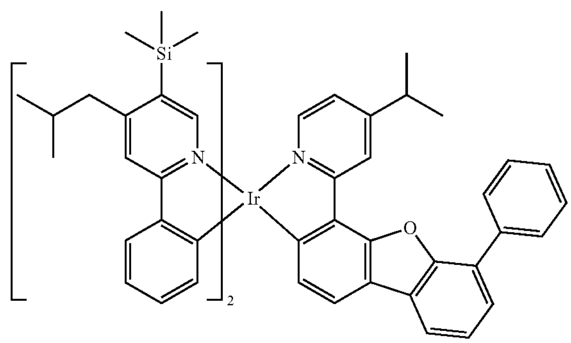
184
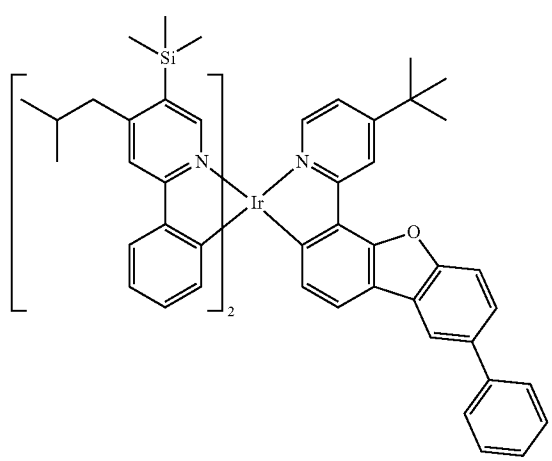

185
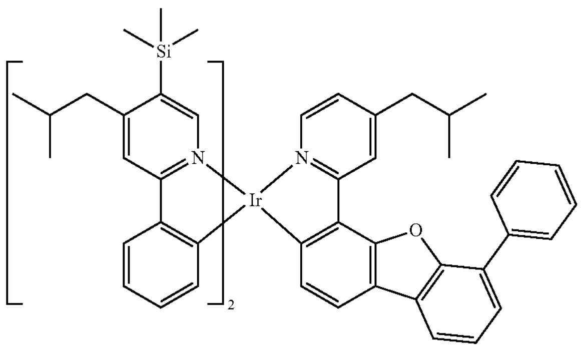
186
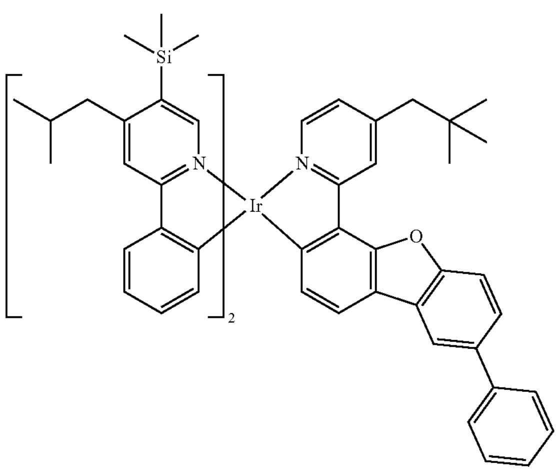
187
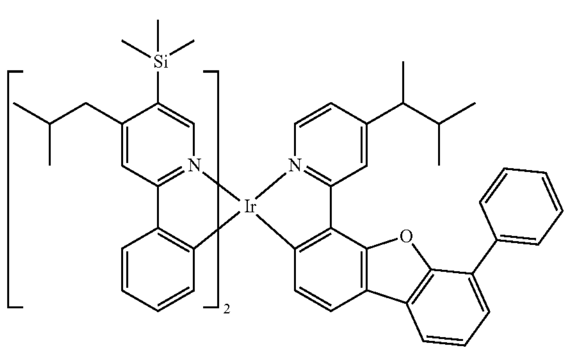
188
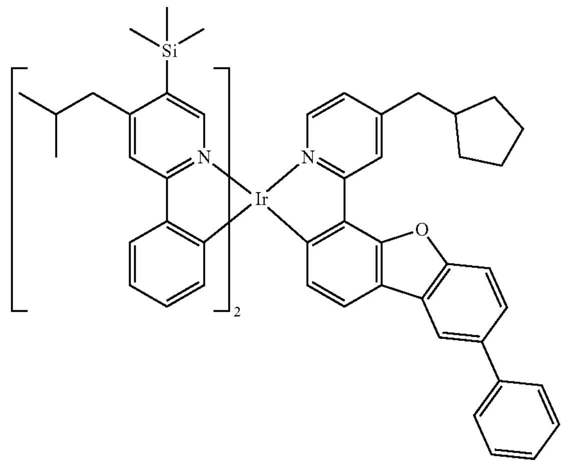
189
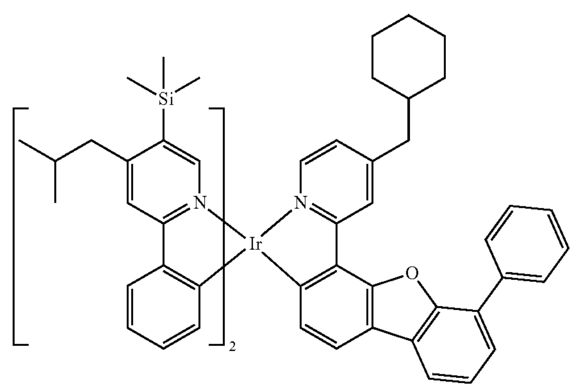
190
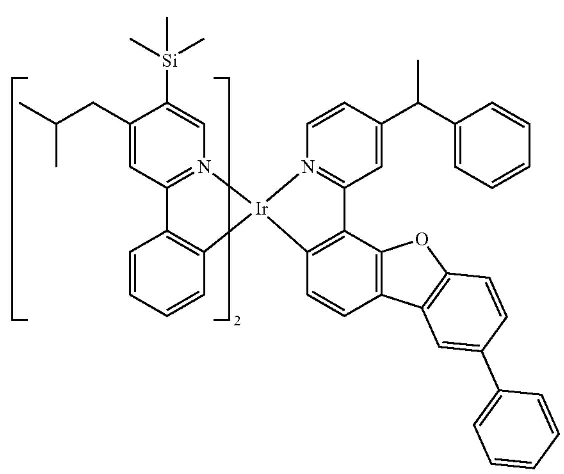

-continued
191
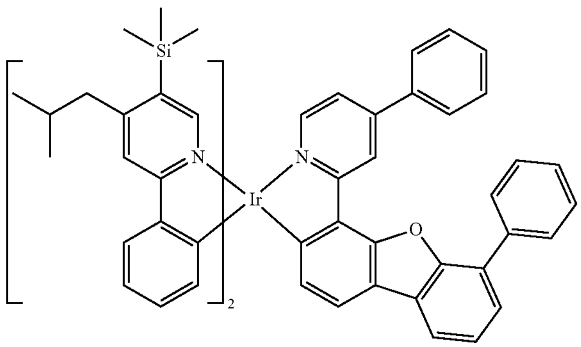
192
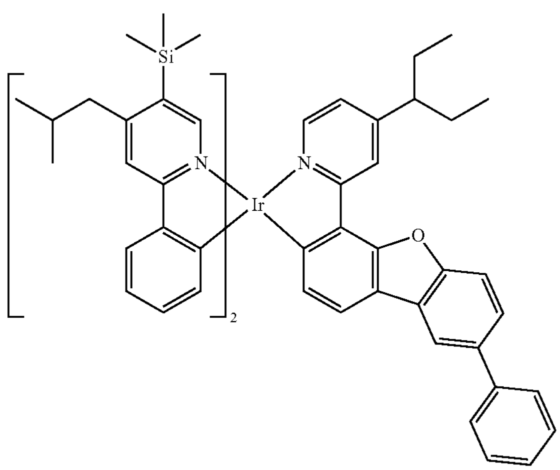
193
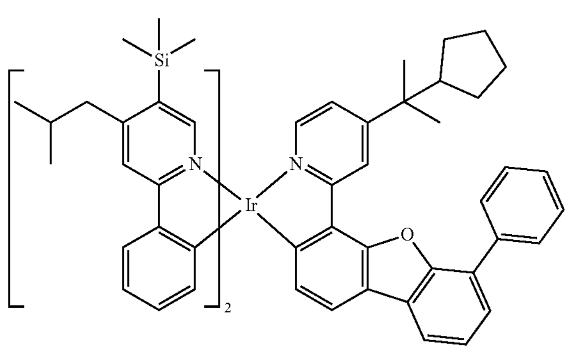
-continued
194
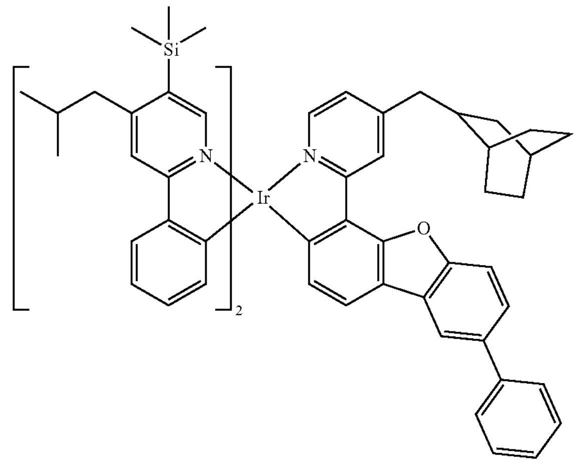
195
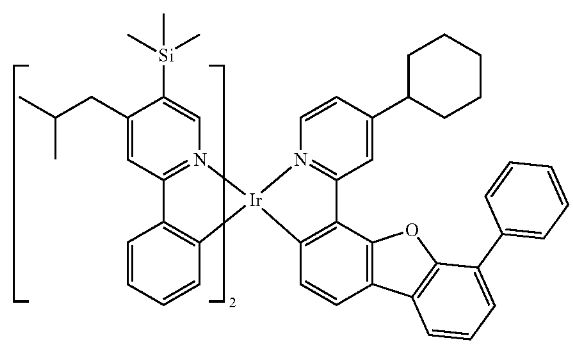
196
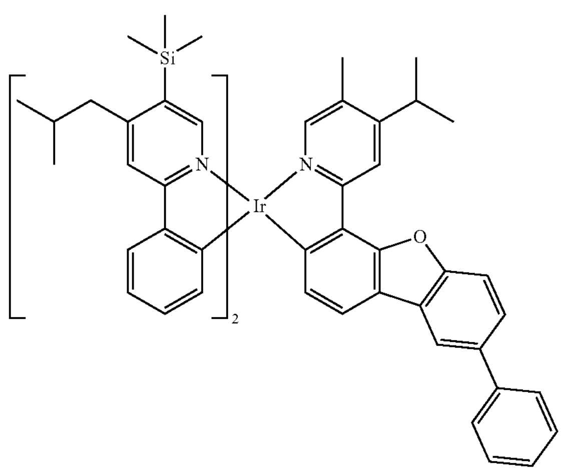

-continued
197
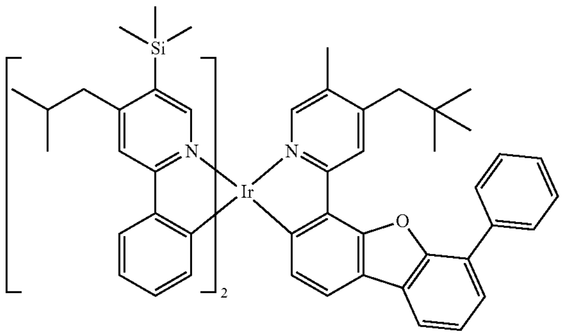
198
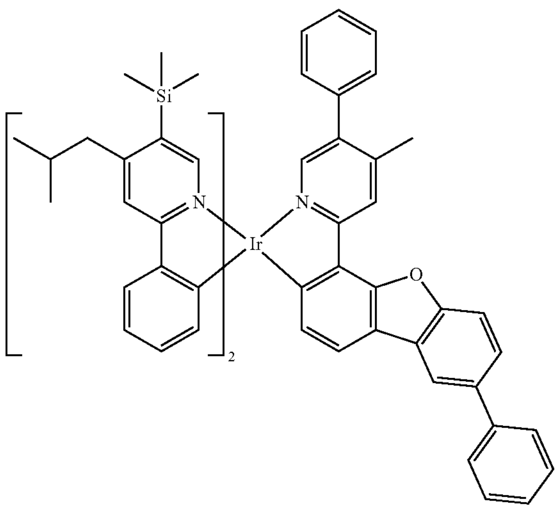
199
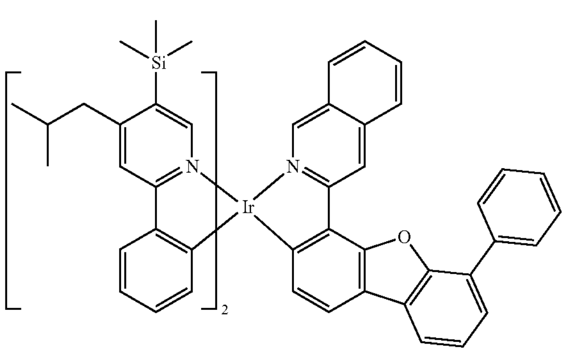
-continued
200
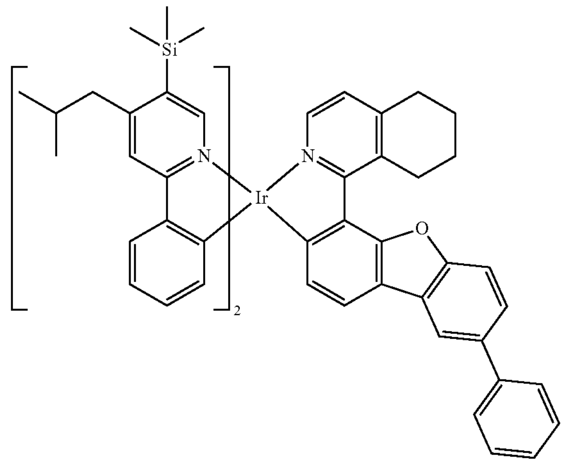
201
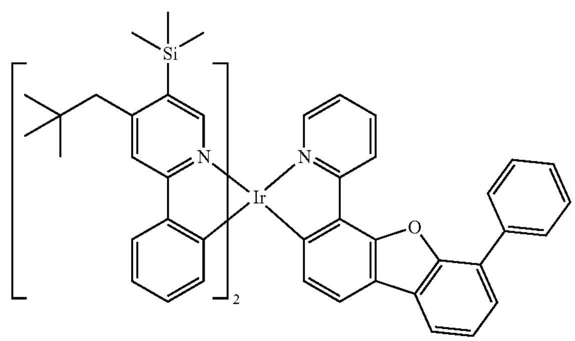
202
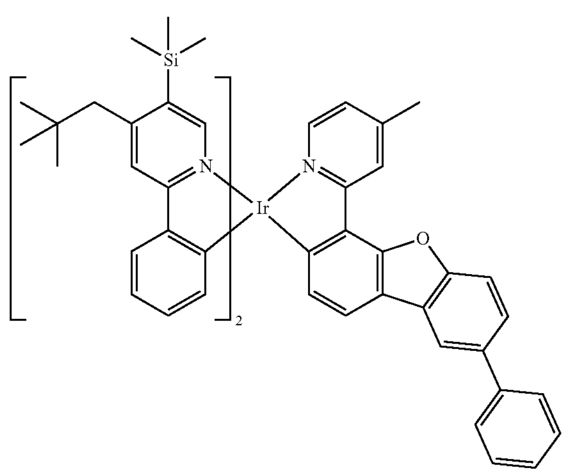

203
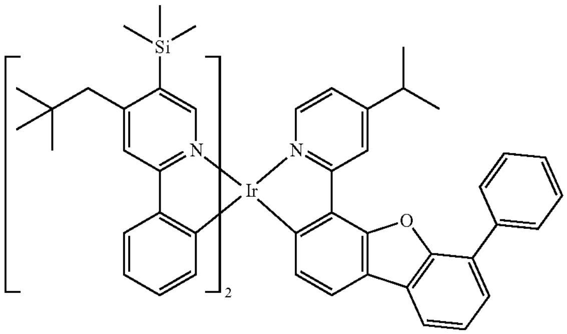
204
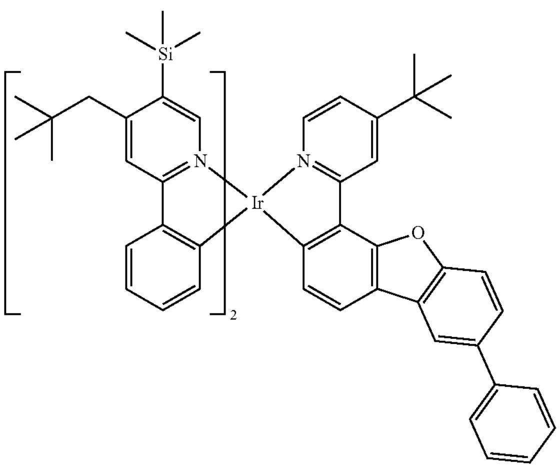
205
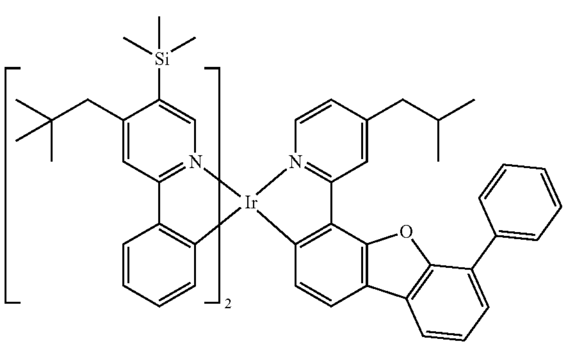
206
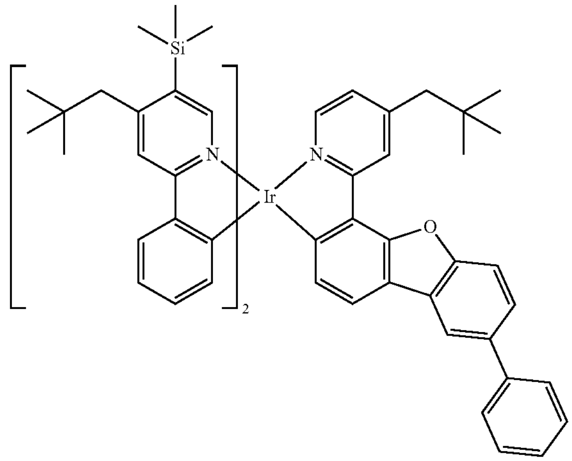
207
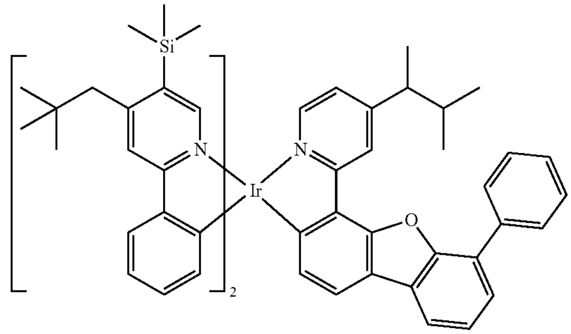
208
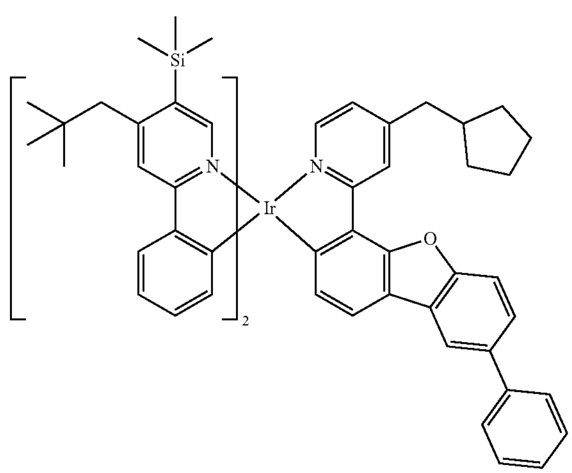

-continued
209
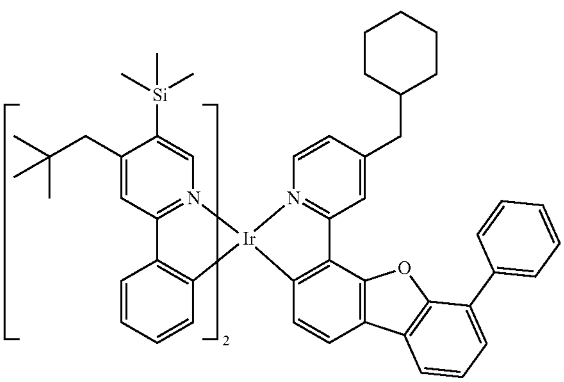
210
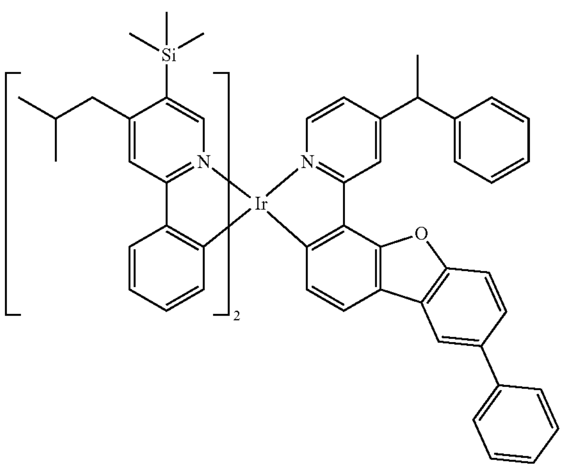
211
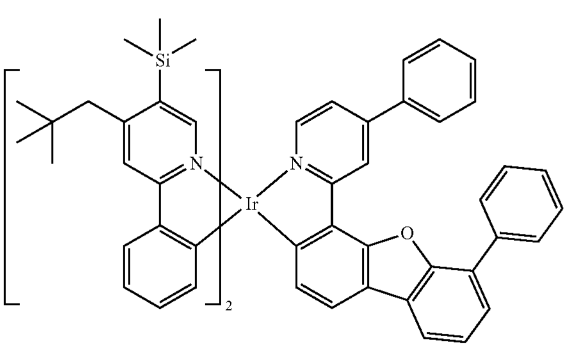
-continued
212
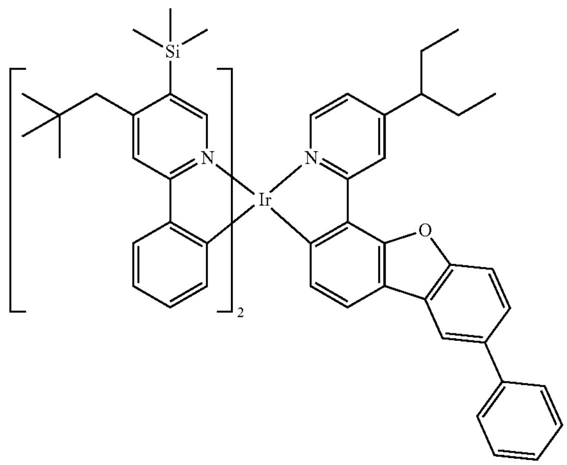
213
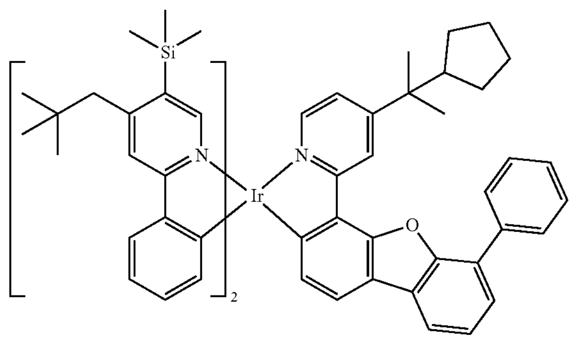
214
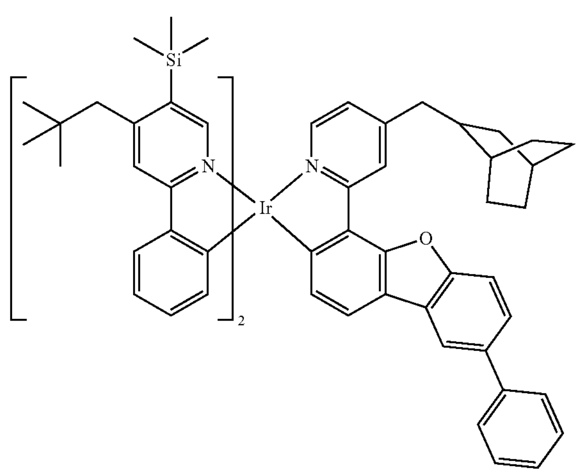

-continued
215
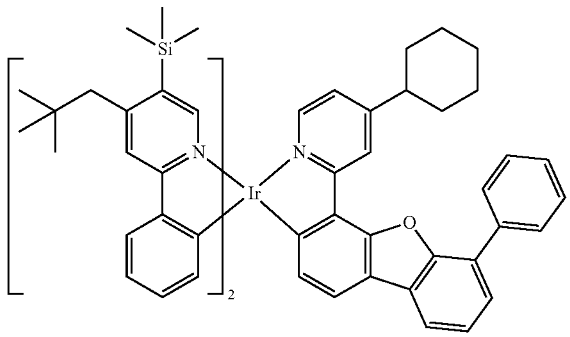
216
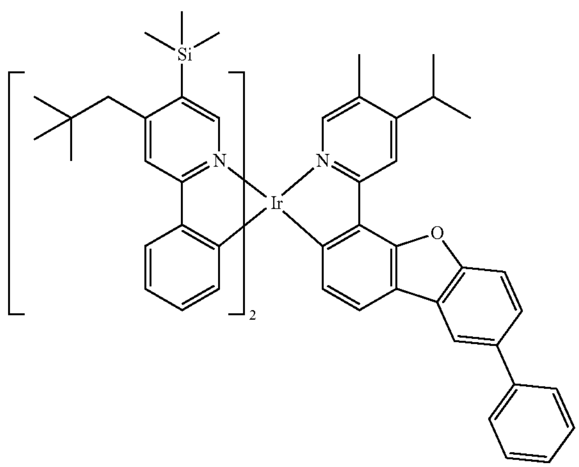
217
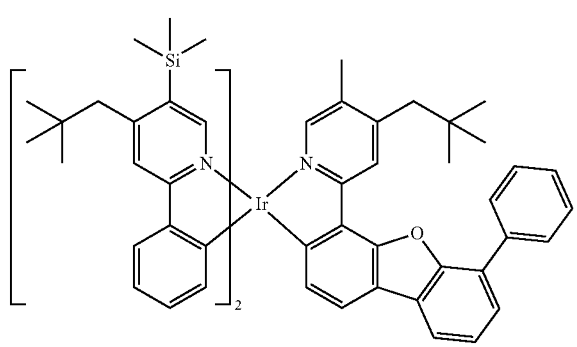
-continued
218
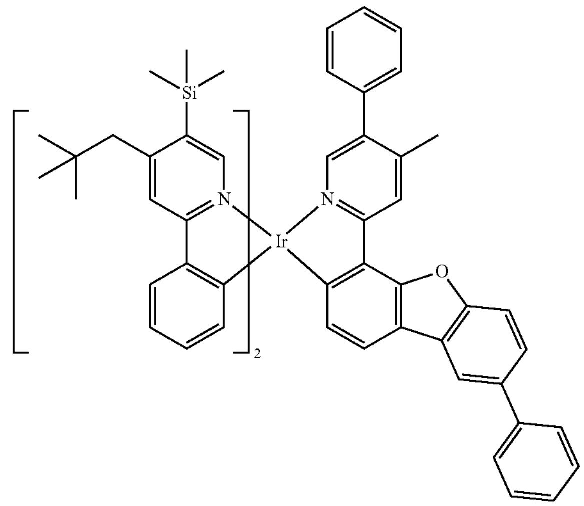
219
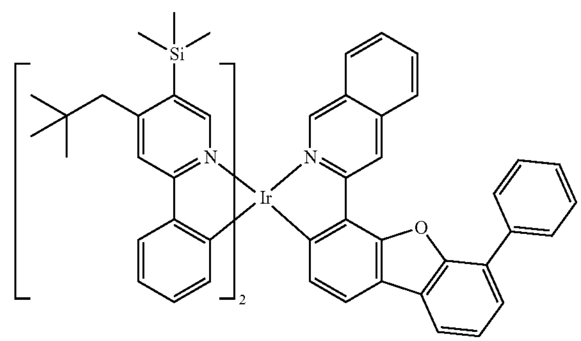
220
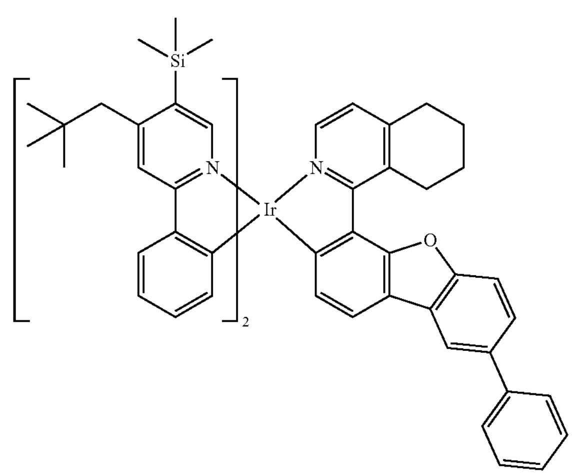

221
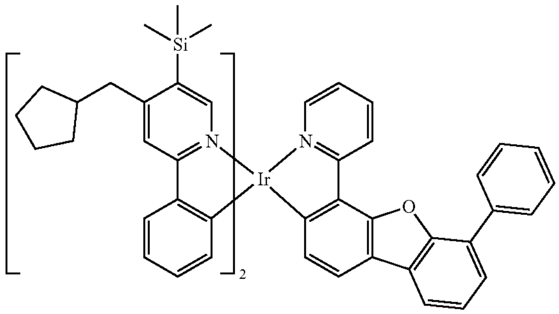
222
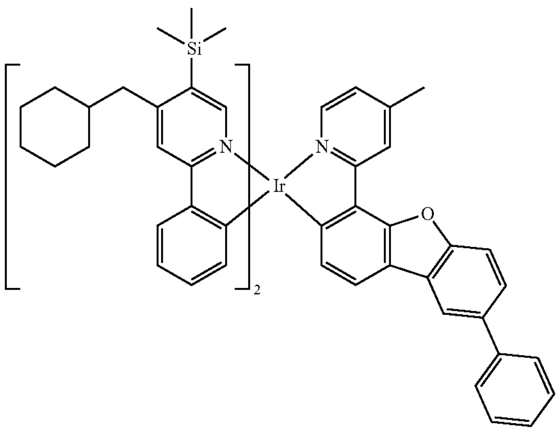
223
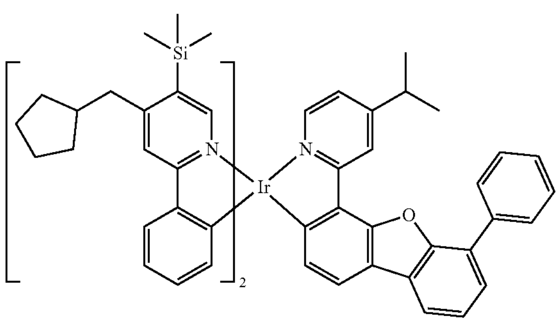
224
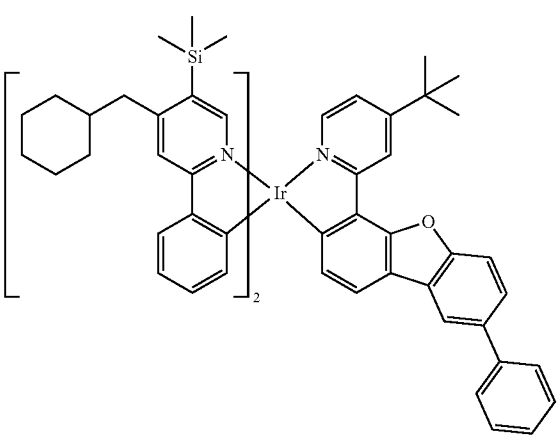
225
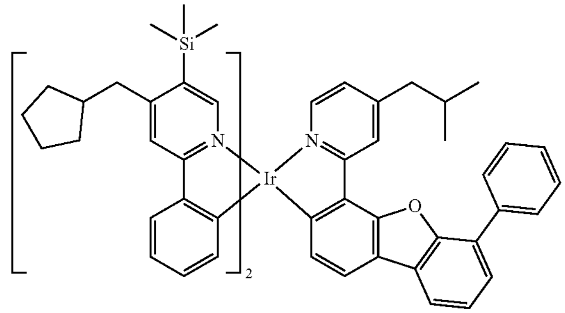
226
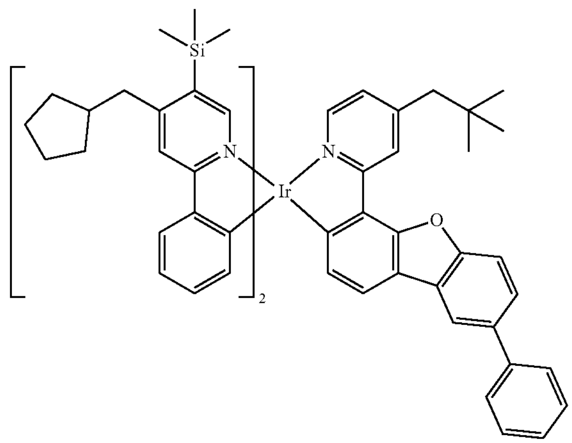
227
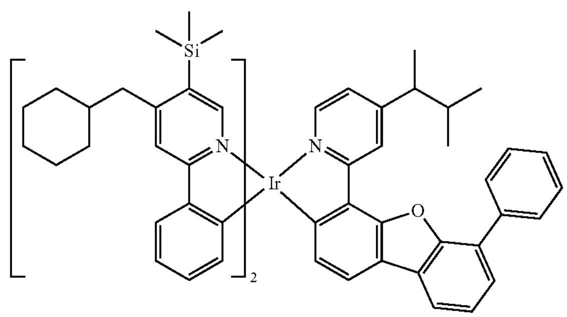
228
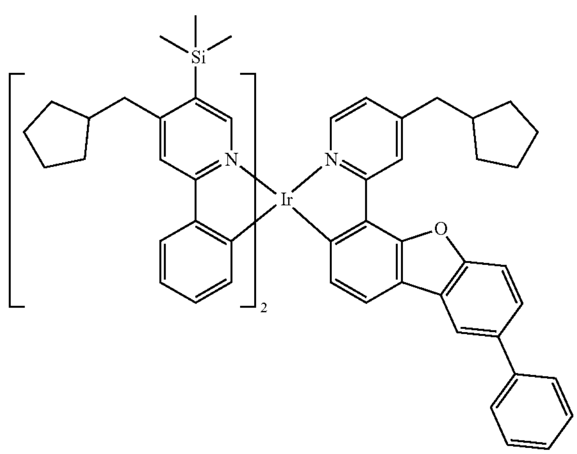

-continued
229
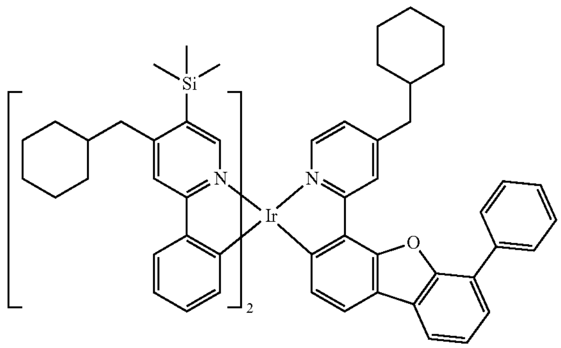
230
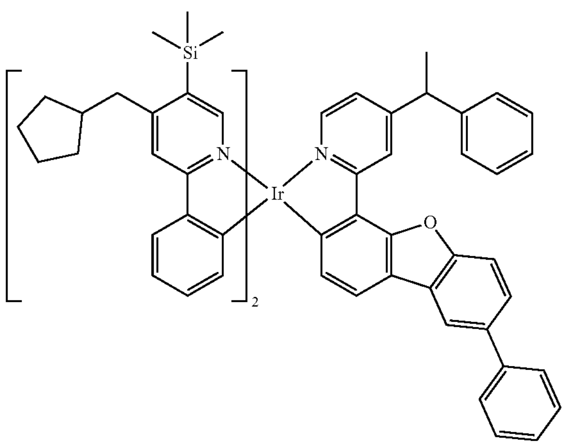
231
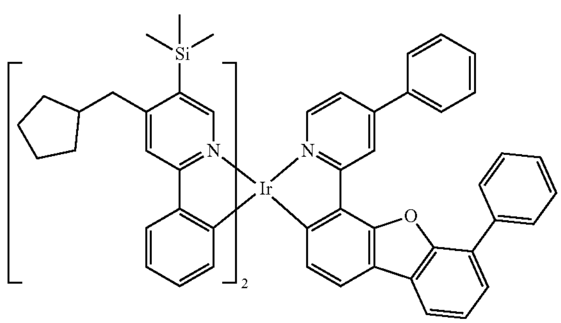
232
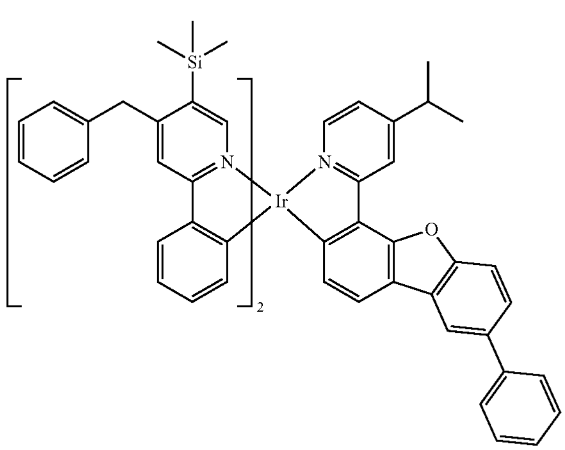
-continued
233
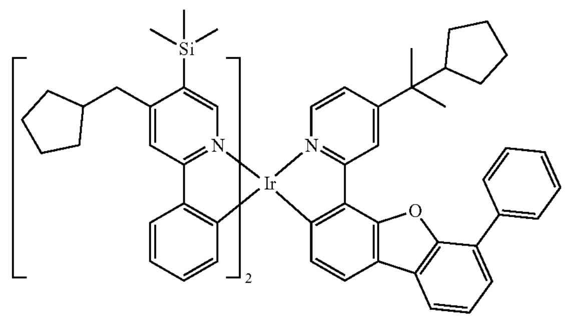
234
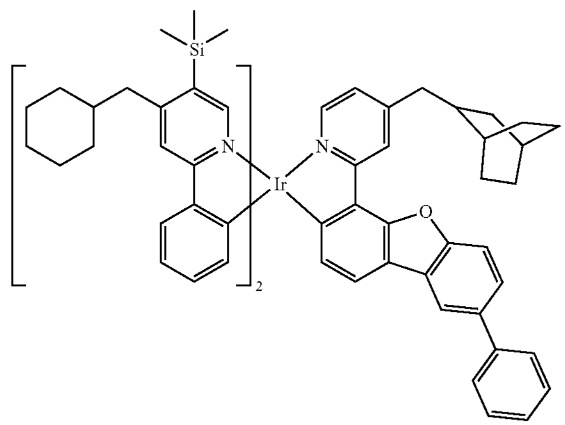
235
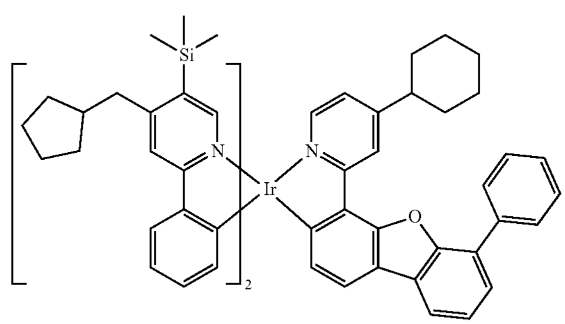
236
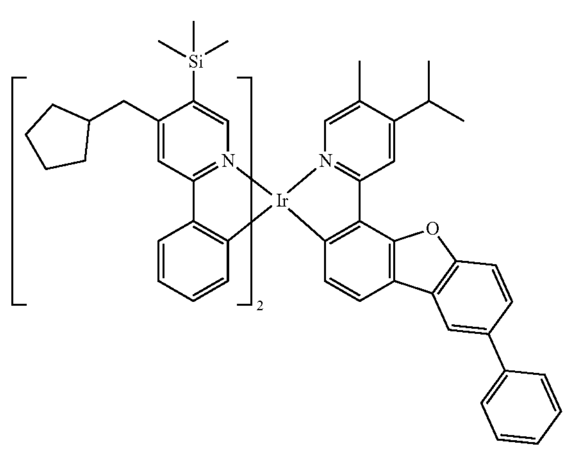

237
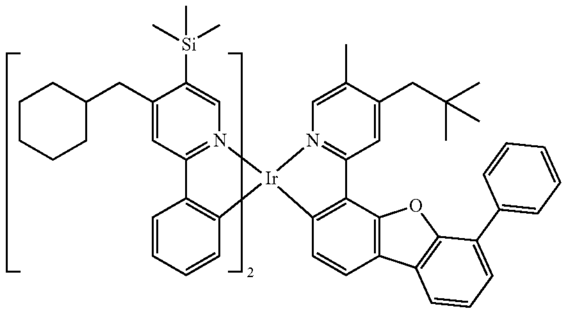
238
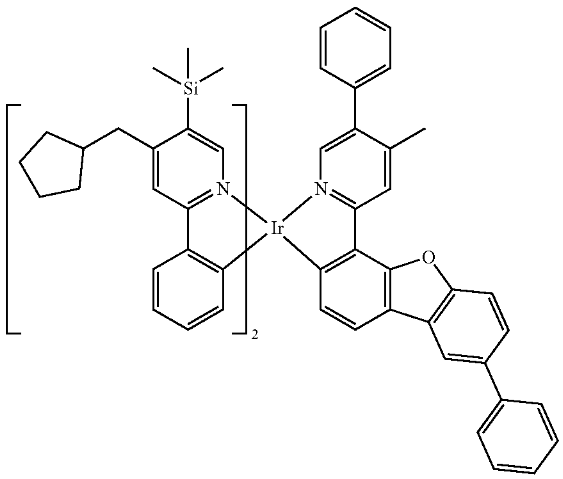
239
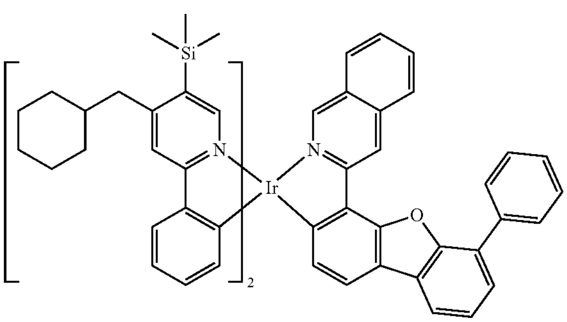
240
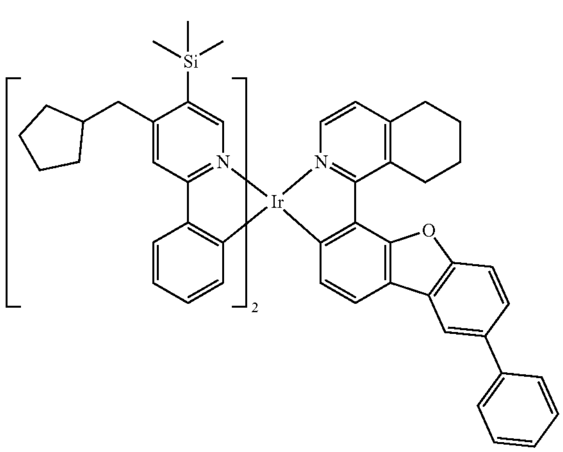
241
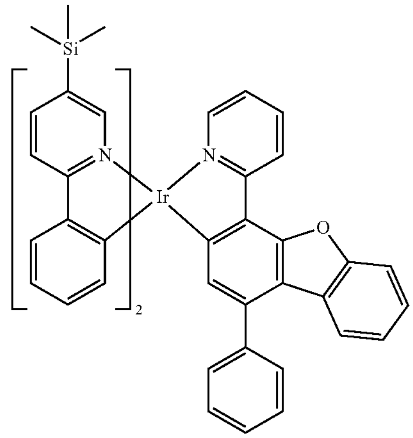
242
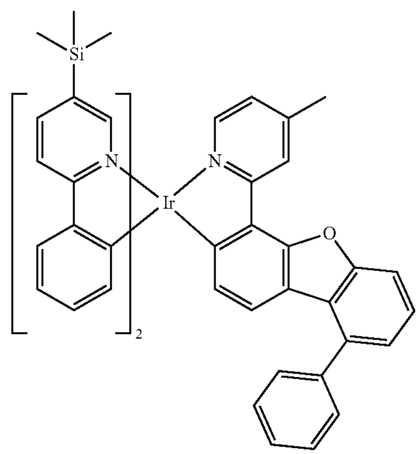
243
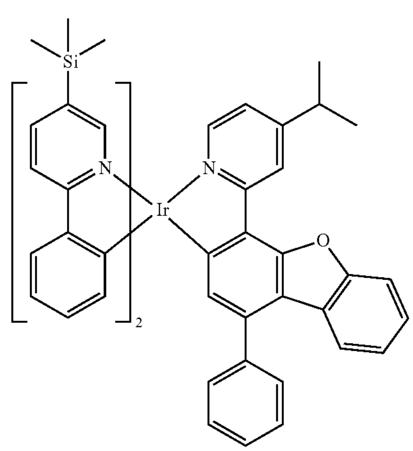

-continued
244
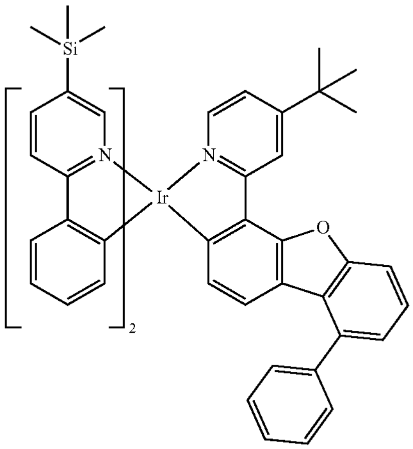
245
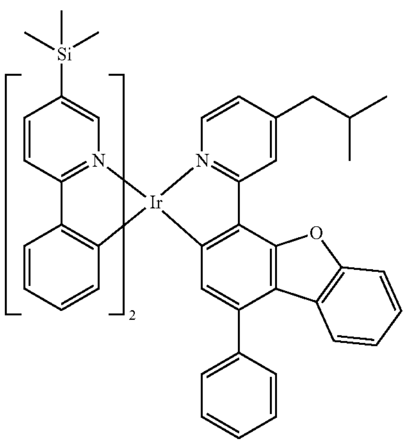
246
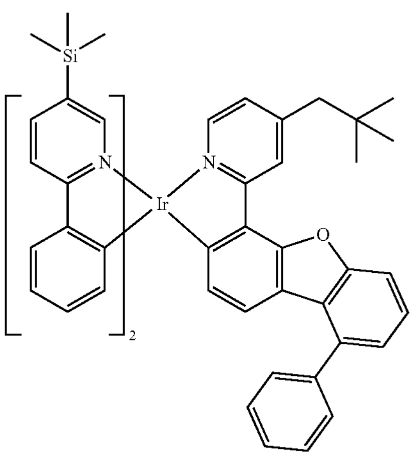
-continued
247
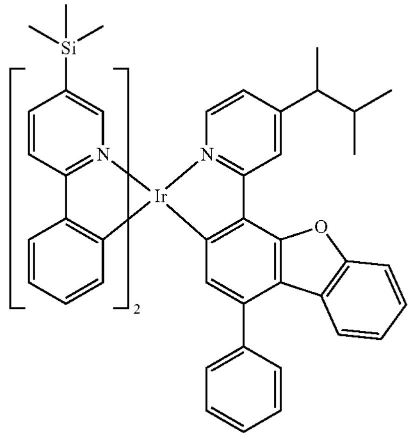
248
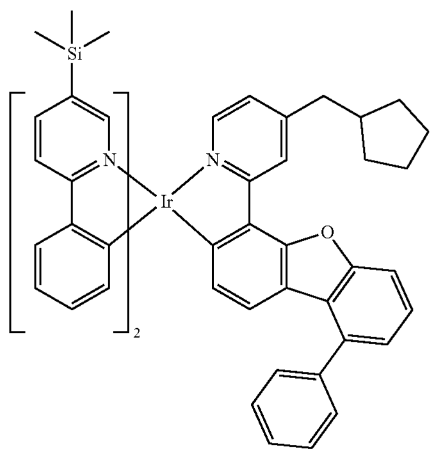
249
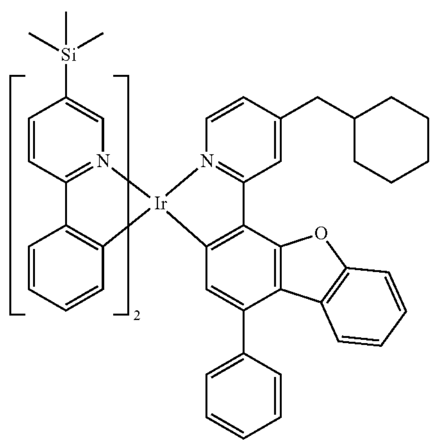

250
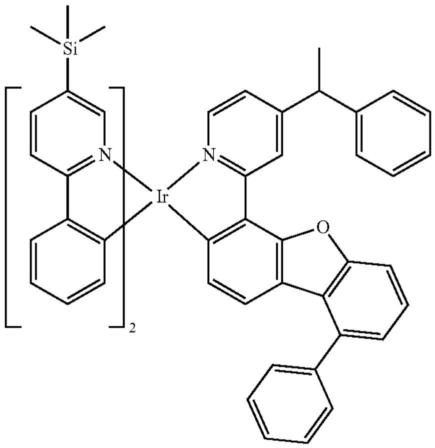
251
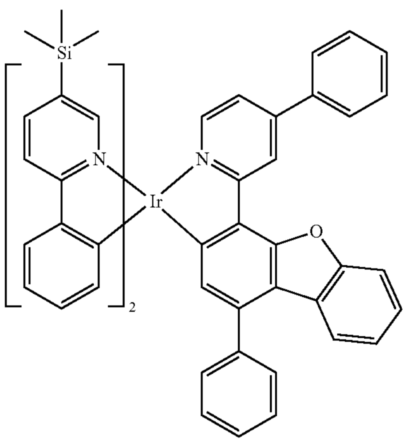
252
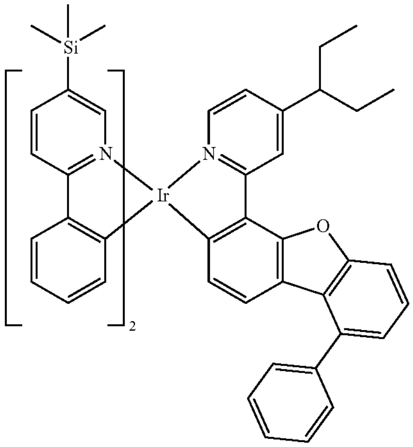
253
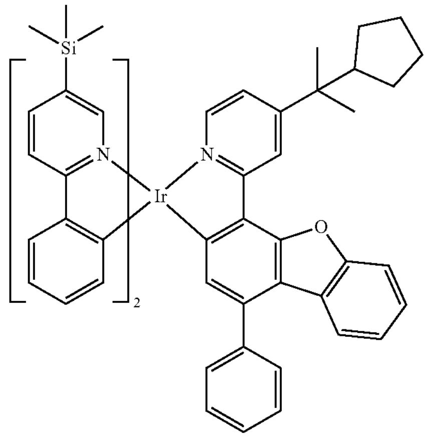
254
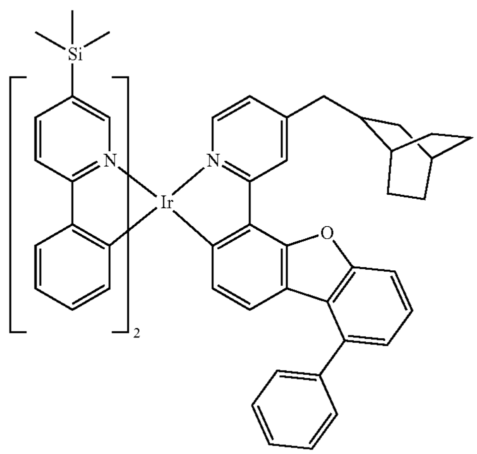
255
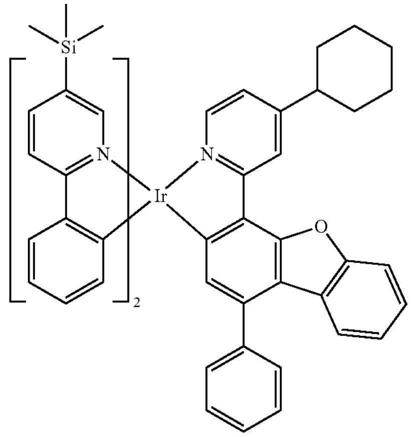

-continued
256
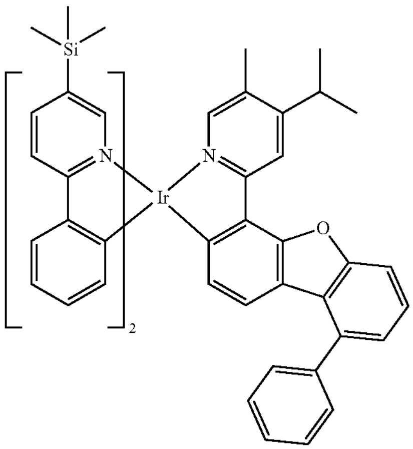
257
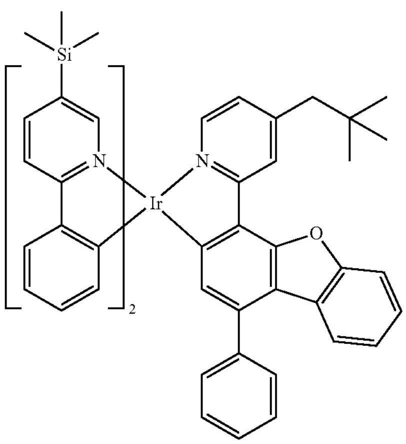
258
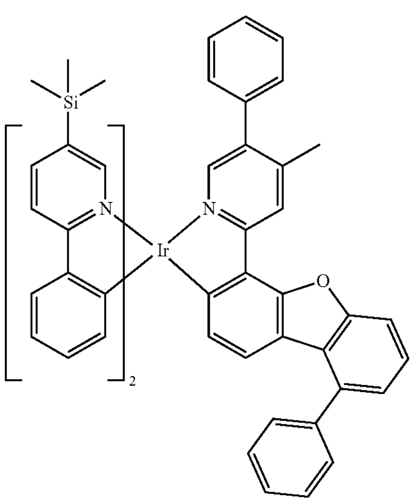
-continued
259
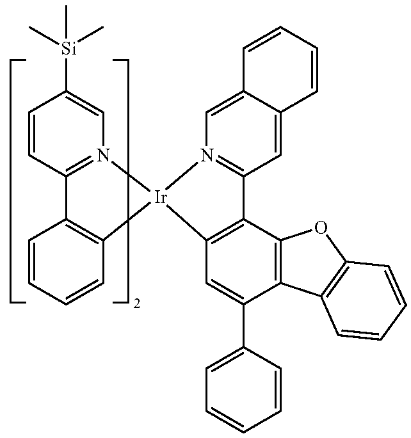
260
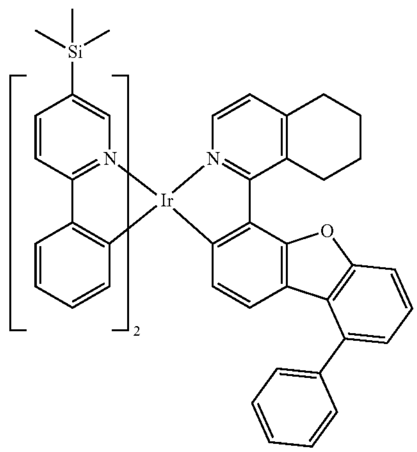
261
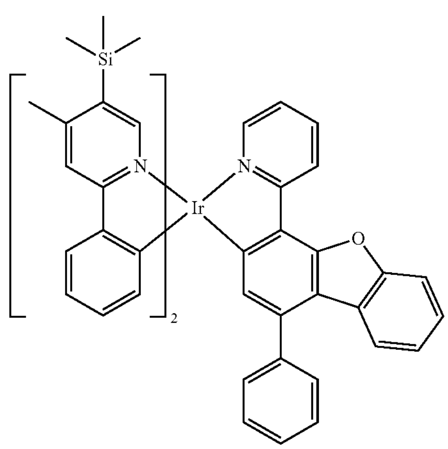

-continued
262
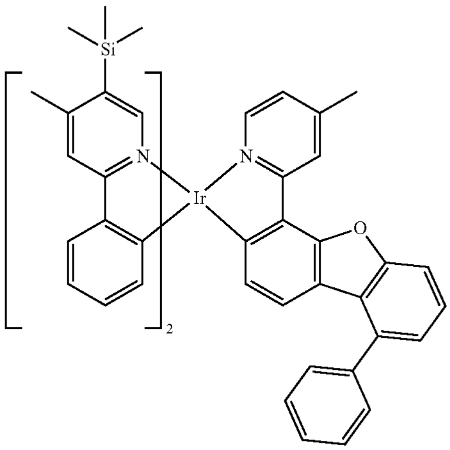
263
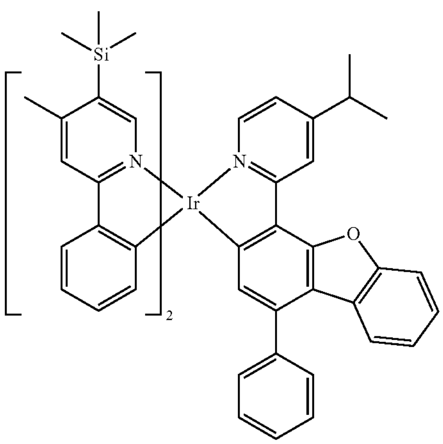
264
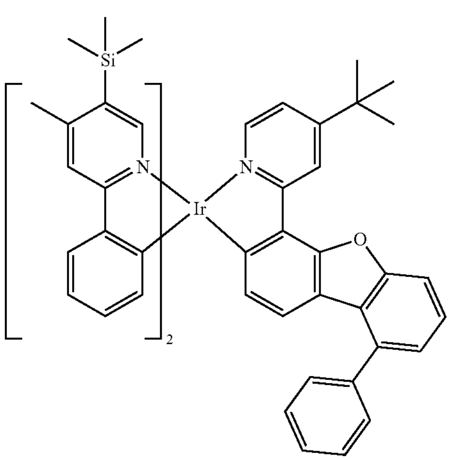
-continued
265
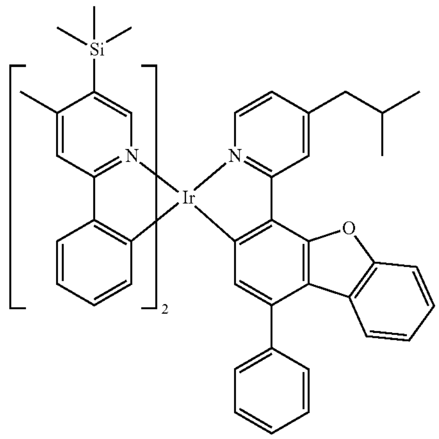
266
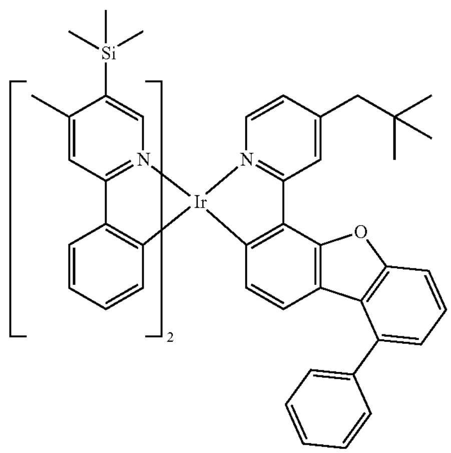
267
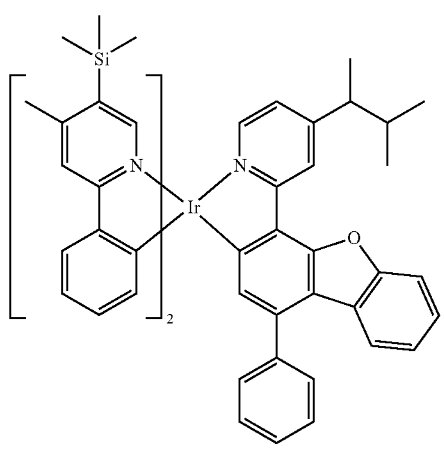

-continued
268
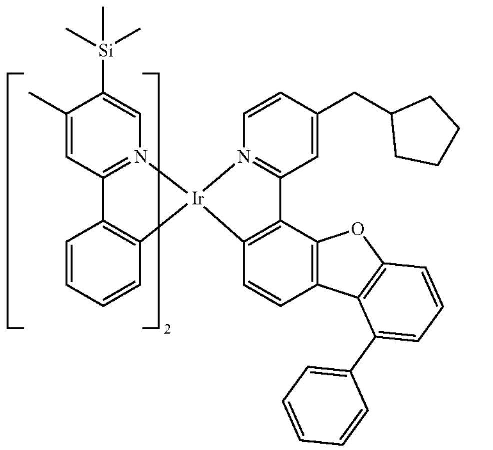
271
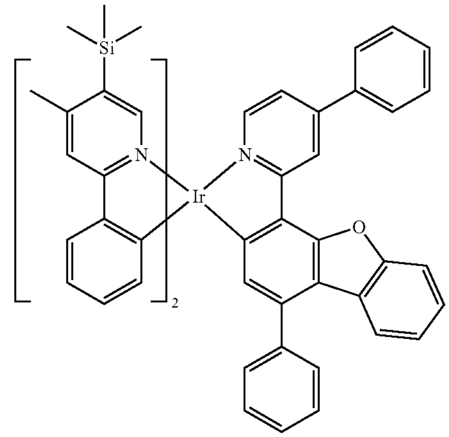
269
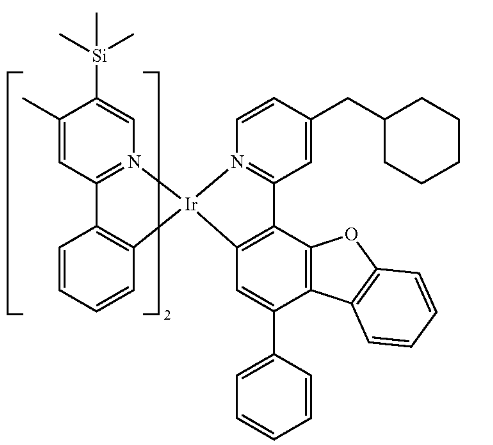
272
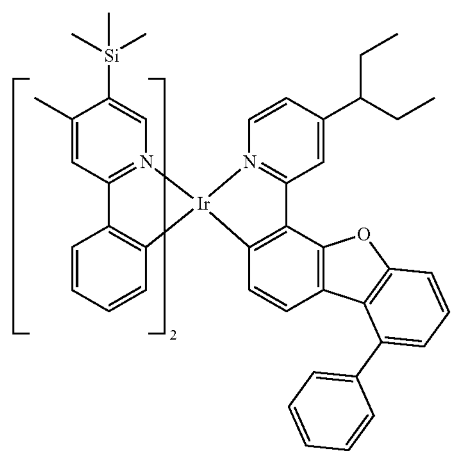
270
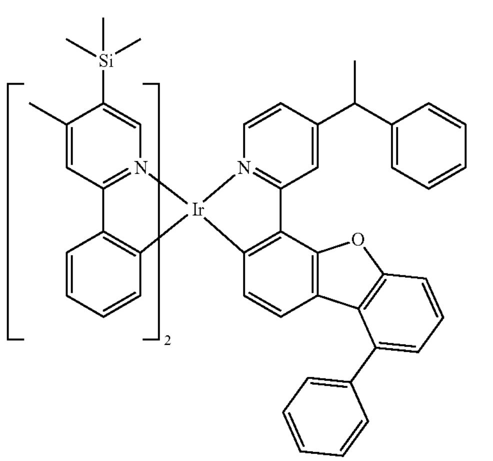
273
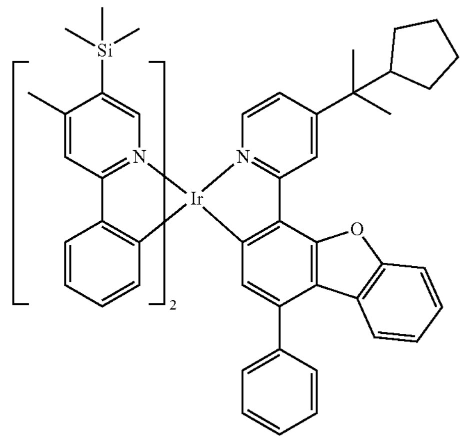

-continued
274
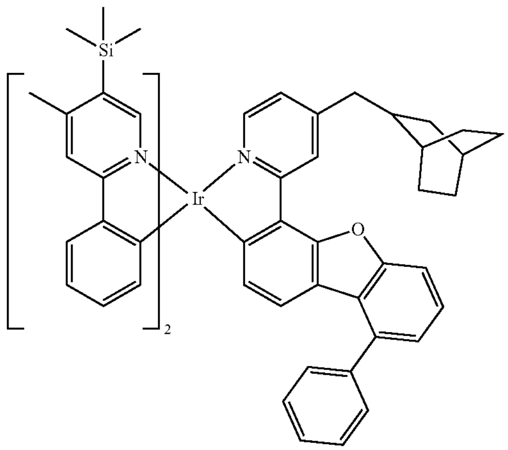
275
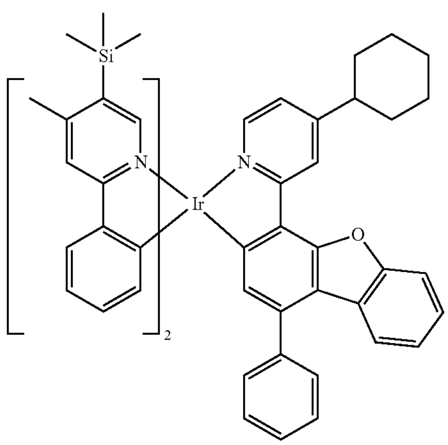
276
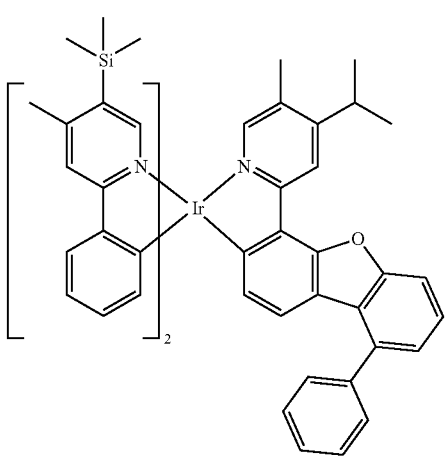
-continued
277
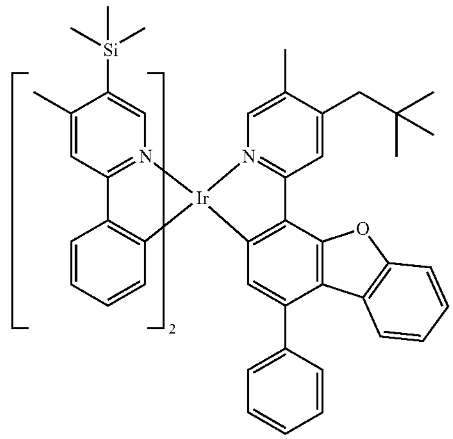
278
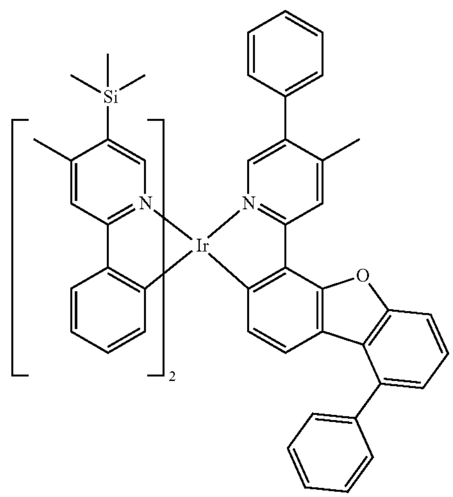
279
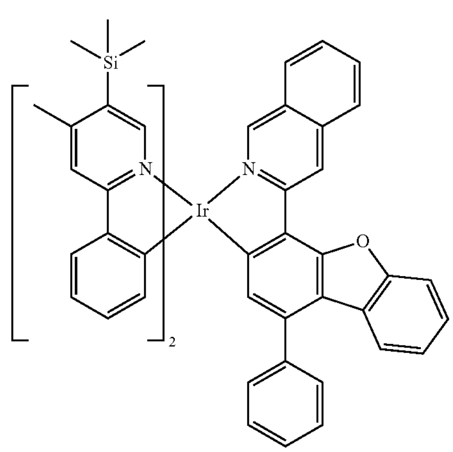

280
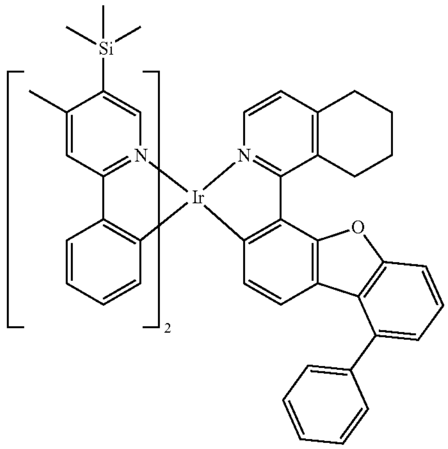
281
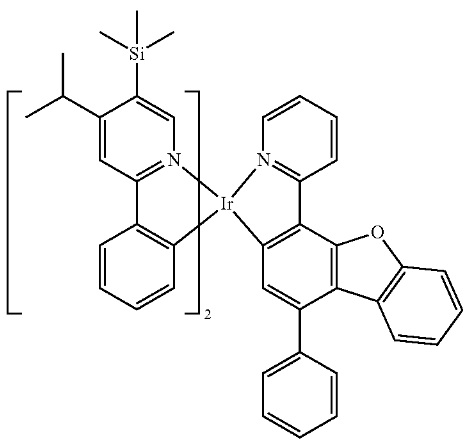
282
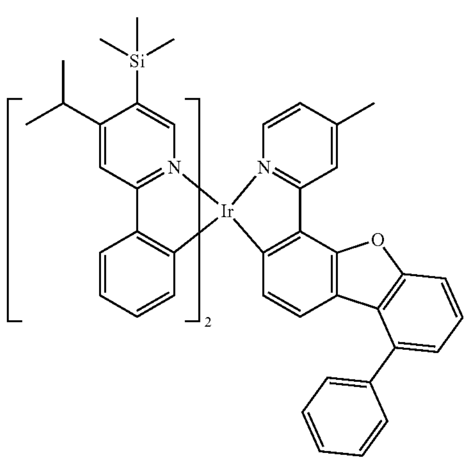
283
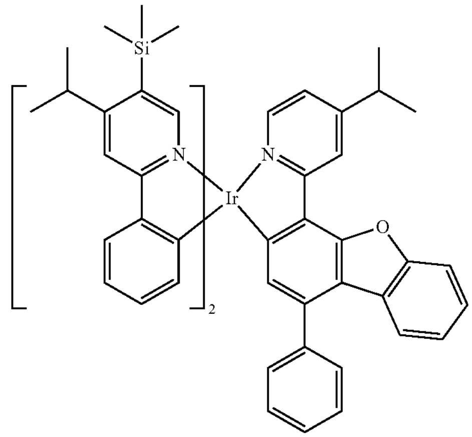
284
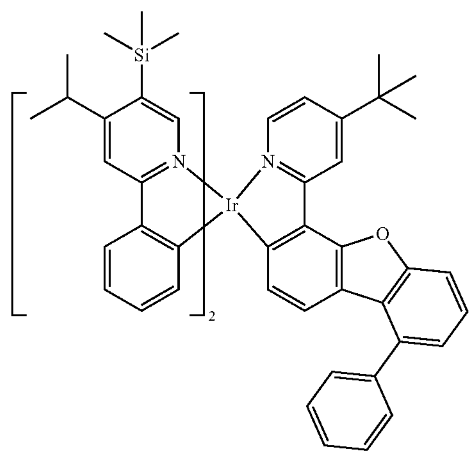
285
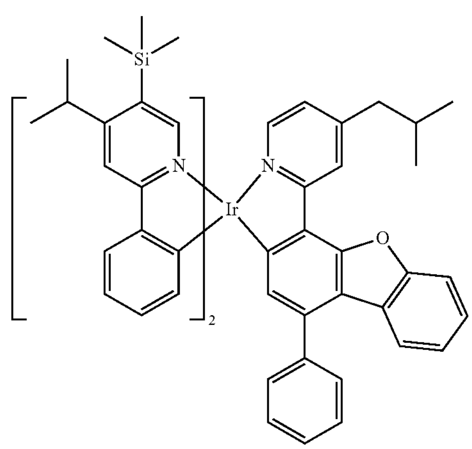

-continued
286
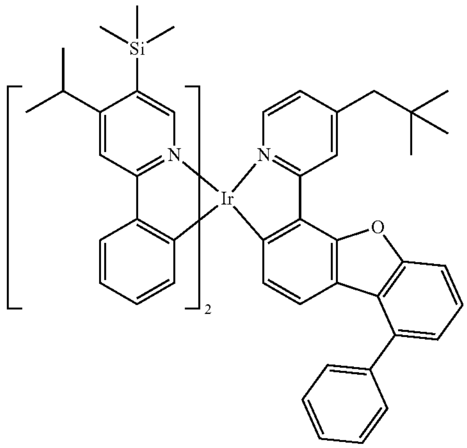
287
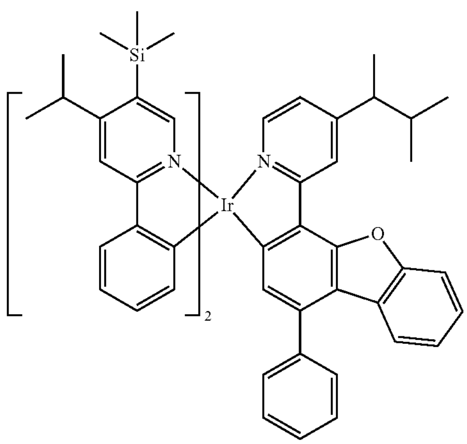
288
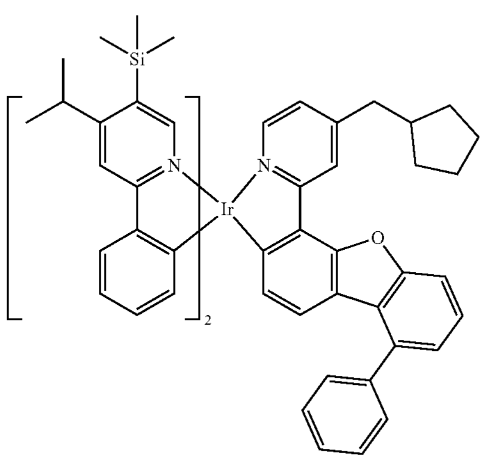
-continued
289
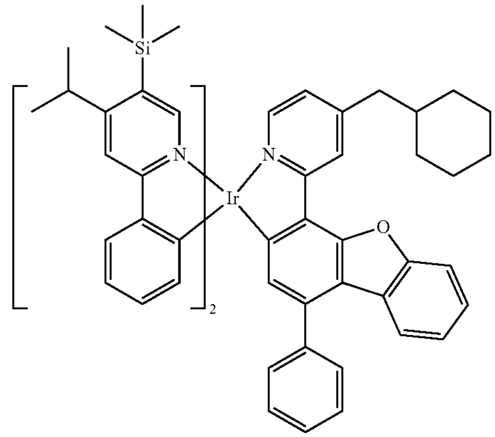
290
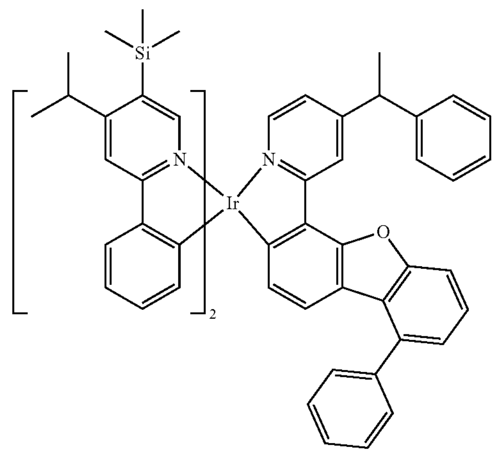
291
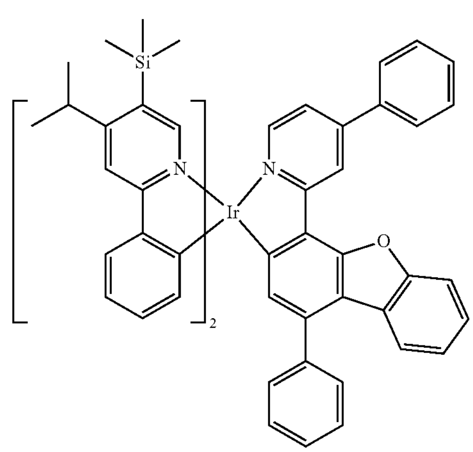

-continued
292
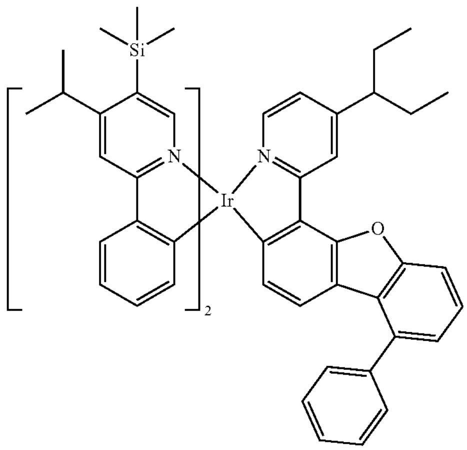
293
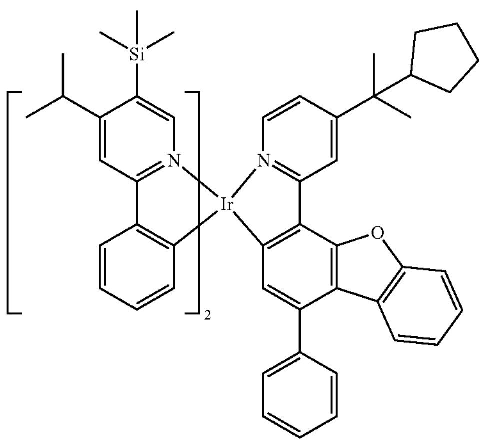
294
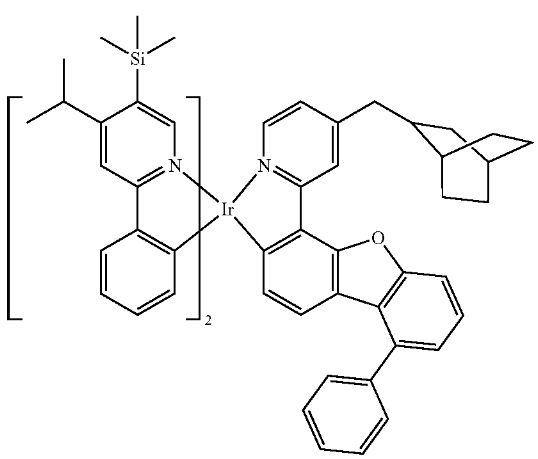
-continued
295
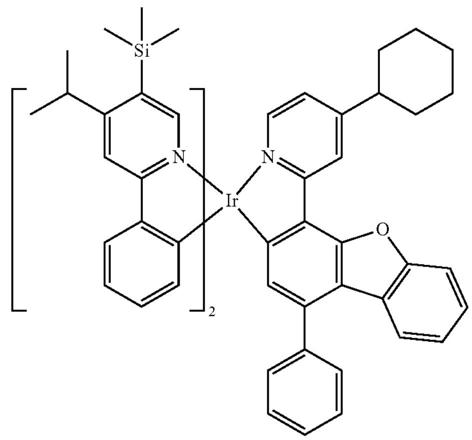
296
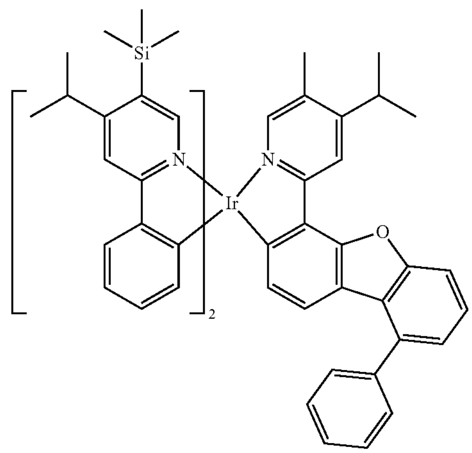
297
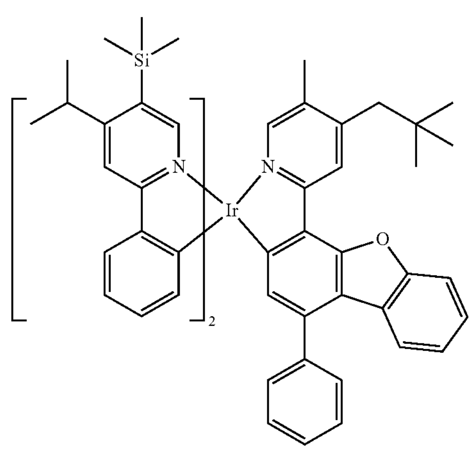

298
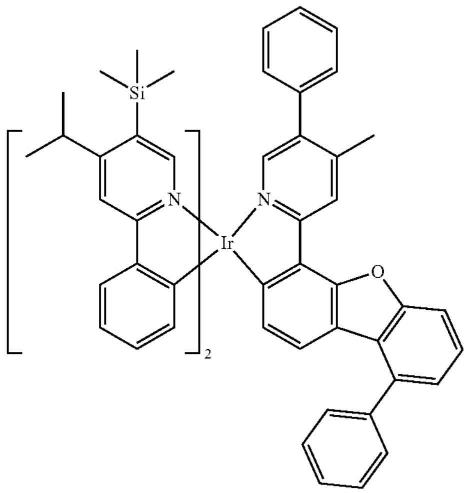
299
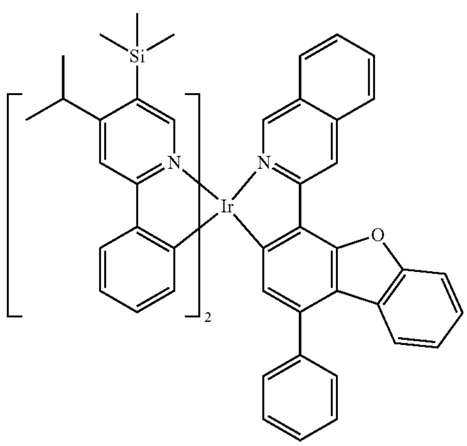
300
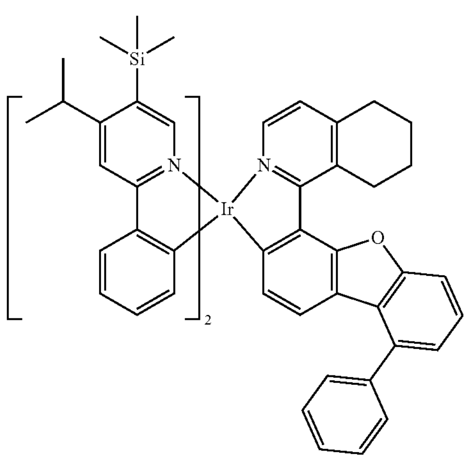
301
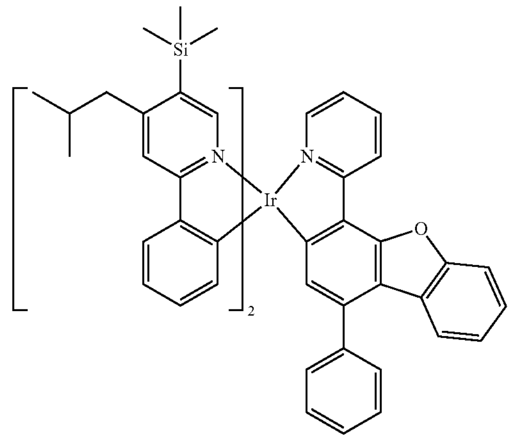
302
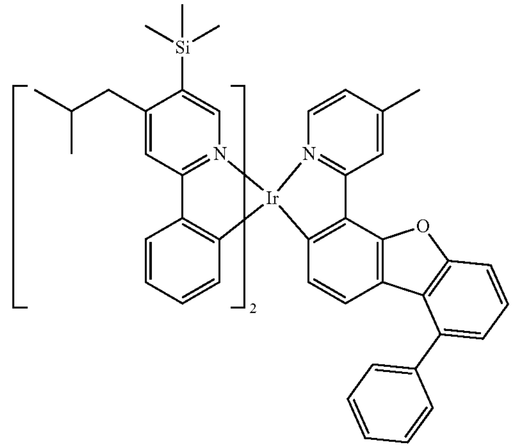
303
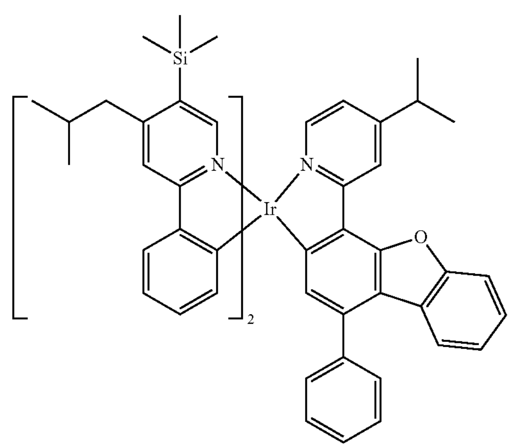

-continued
304
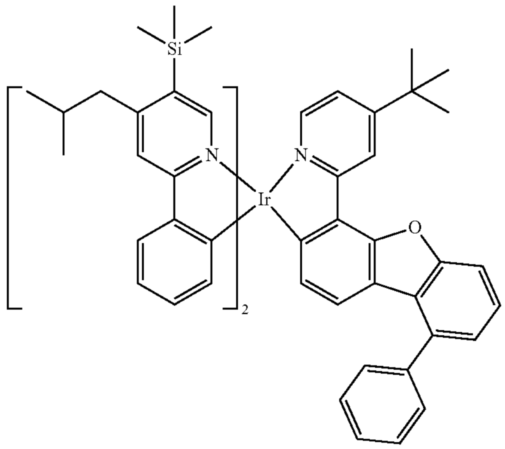
305
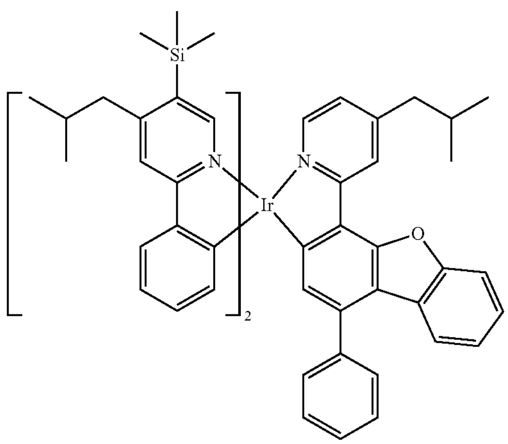
306
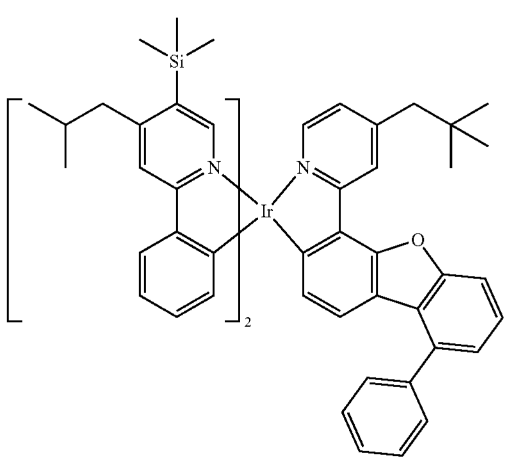
-continued
307
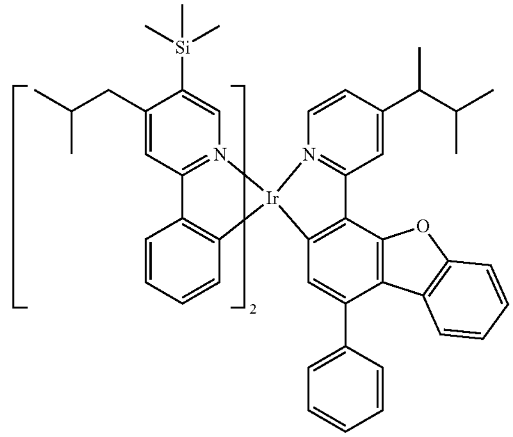
308
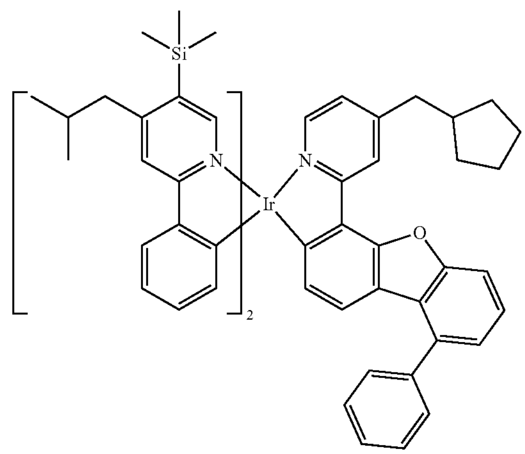
309
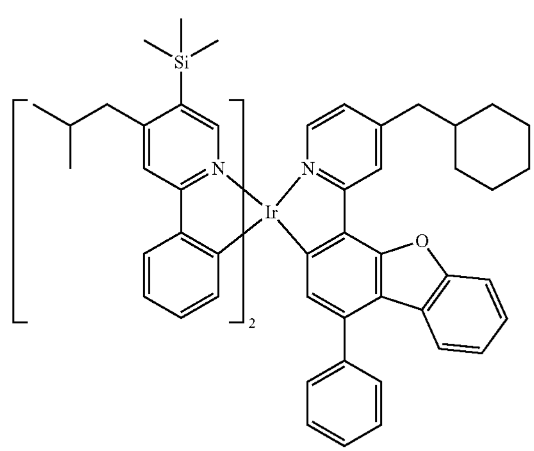

-continued
310
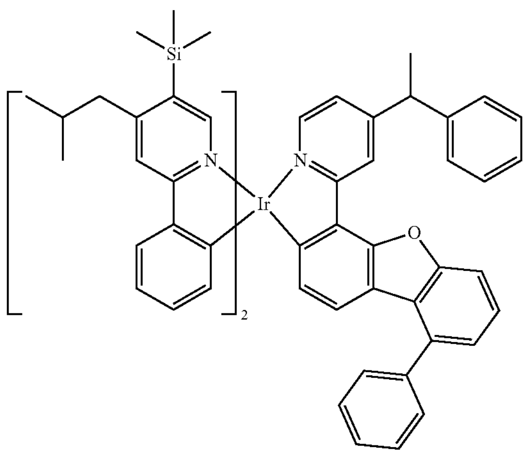
311
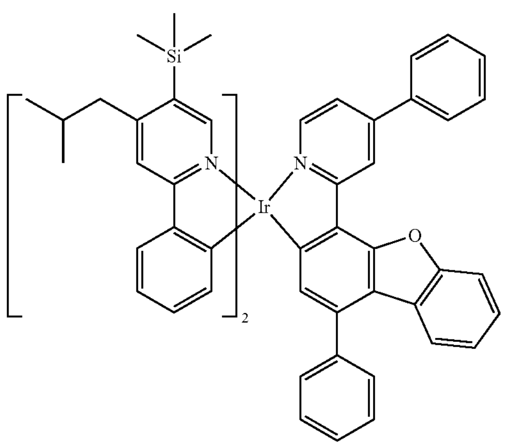
312
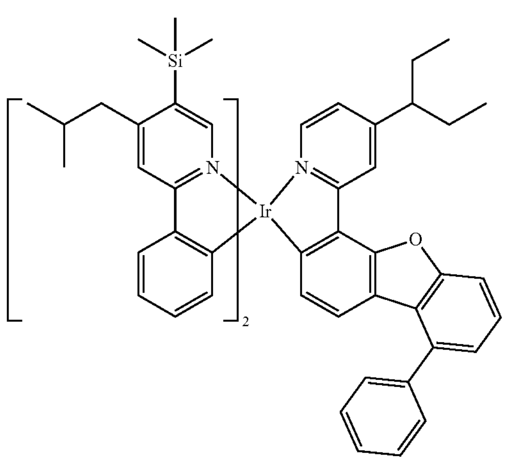
-continued
313
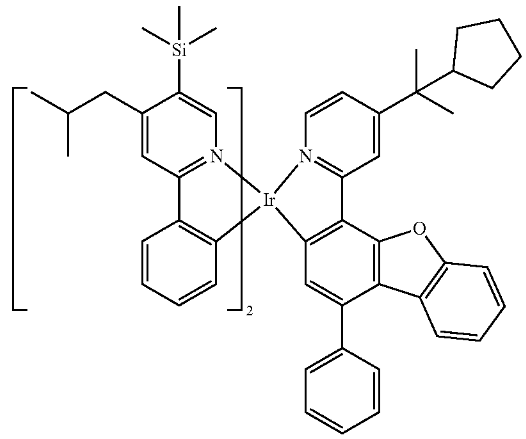
314
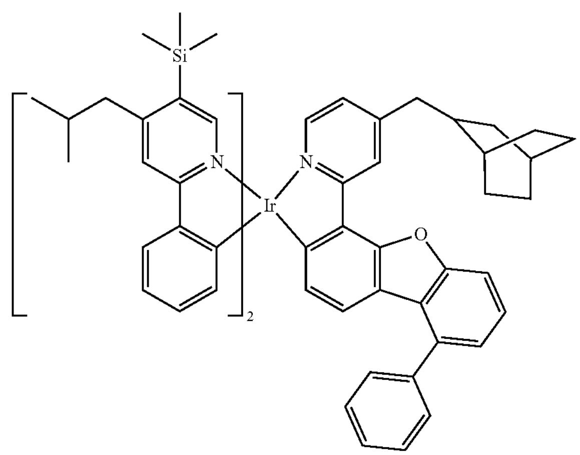
315
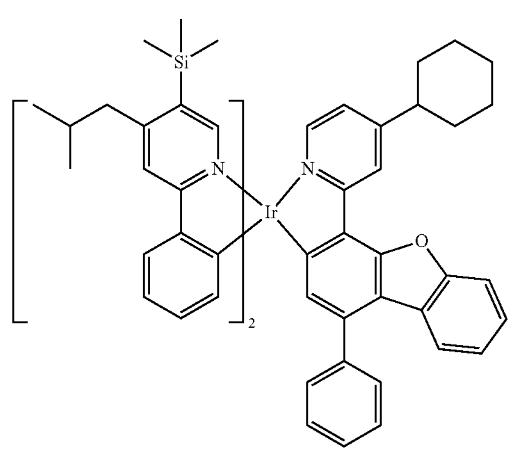

316
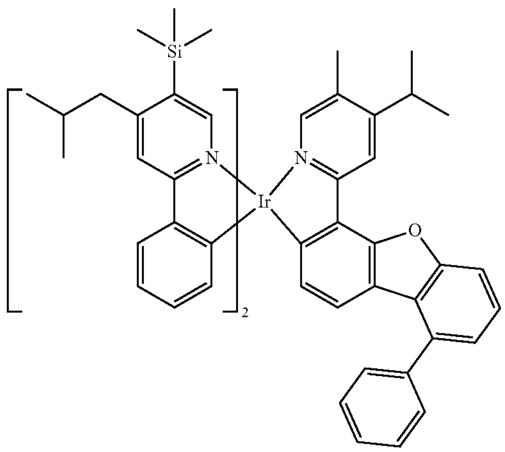
317
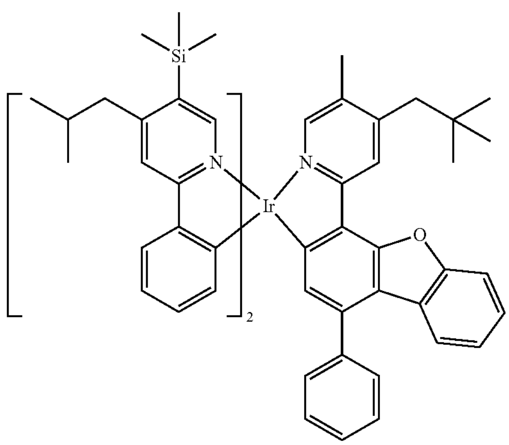
318
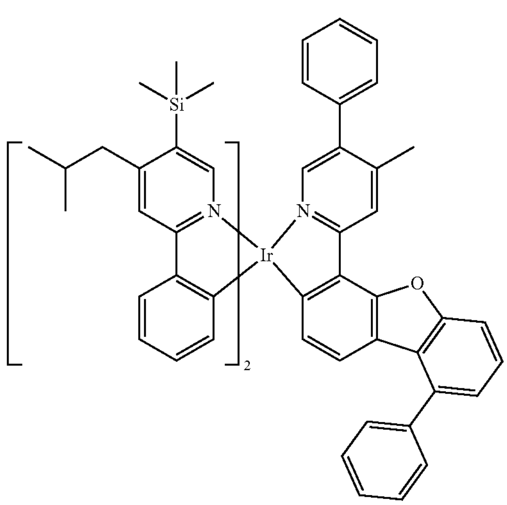
319
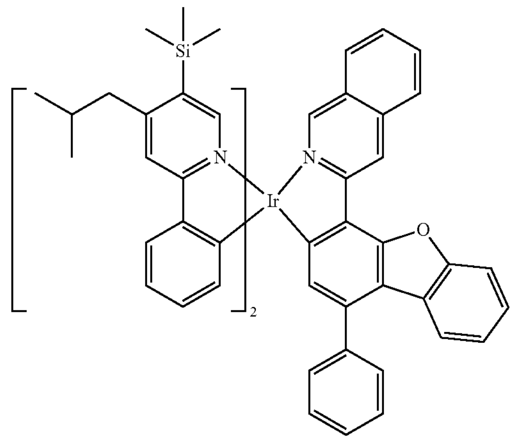
320
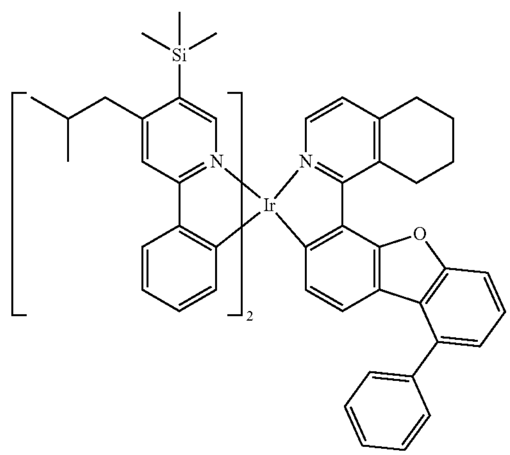
321
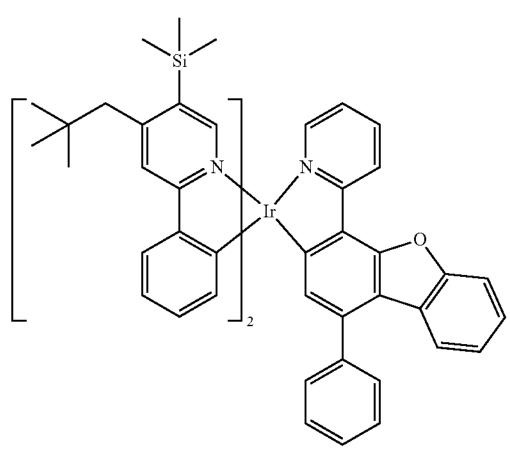

-continued
322
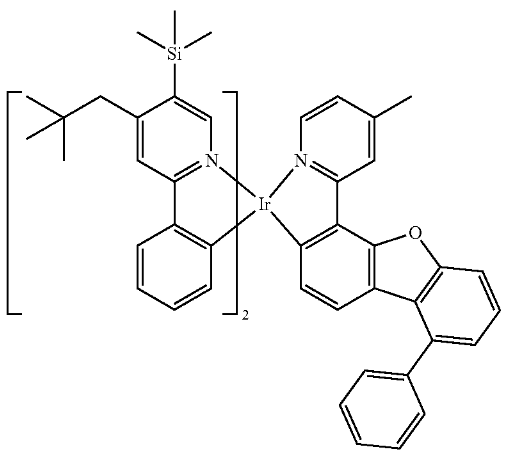
323
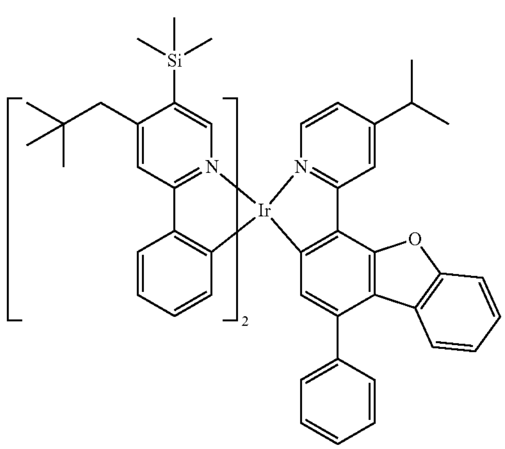
324
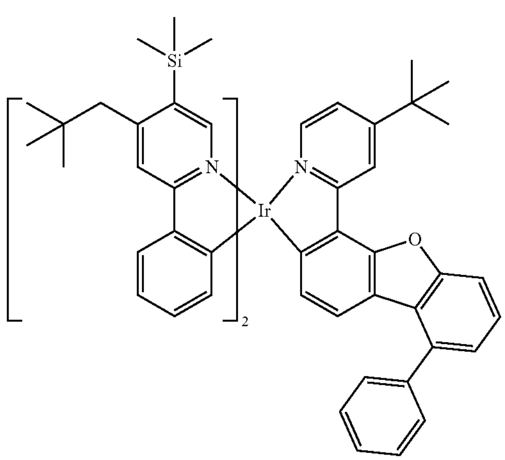
-continued
325
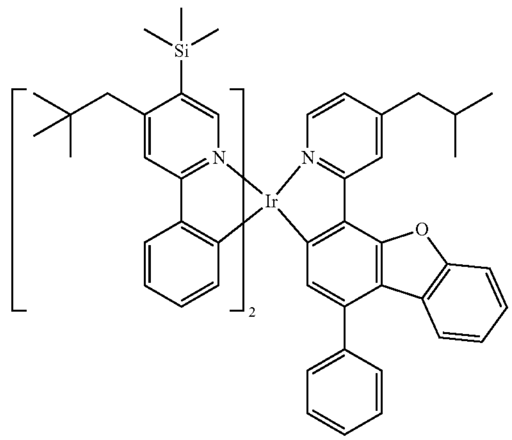
326
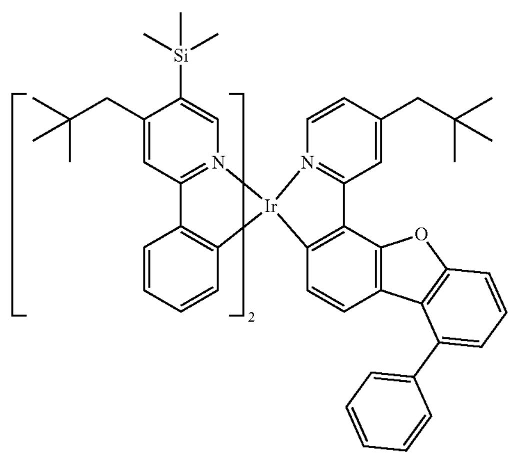
327
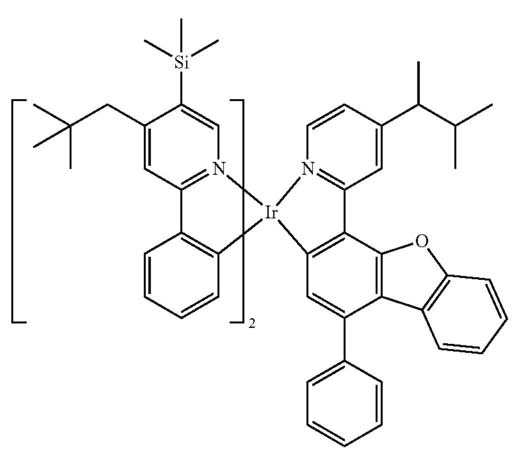

328
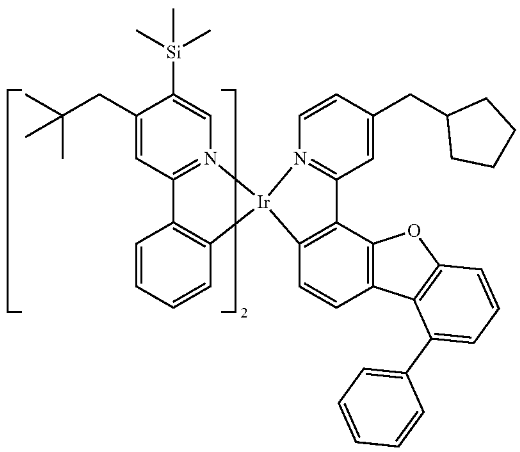
329
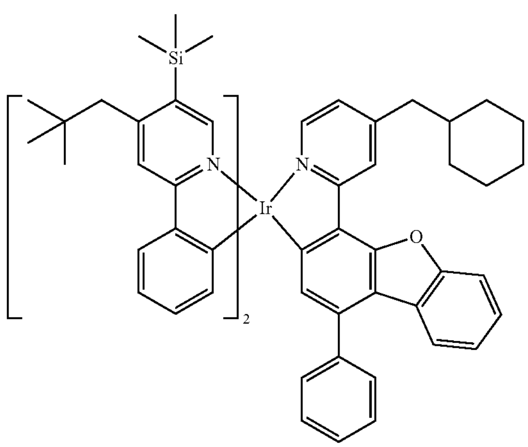
330
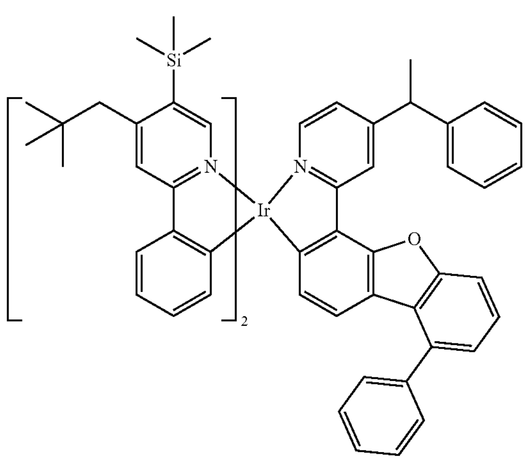
331
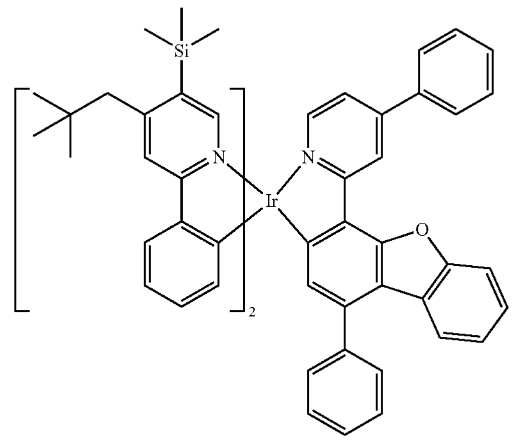
332
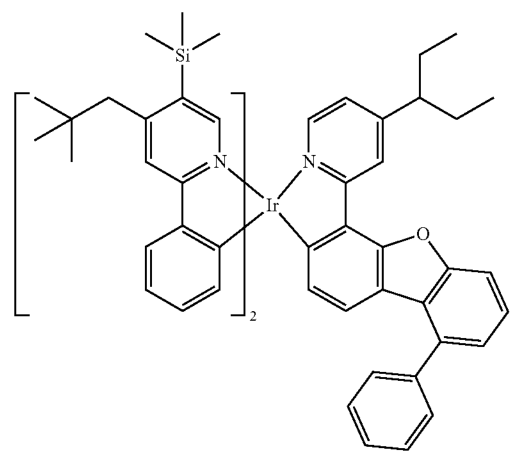
333
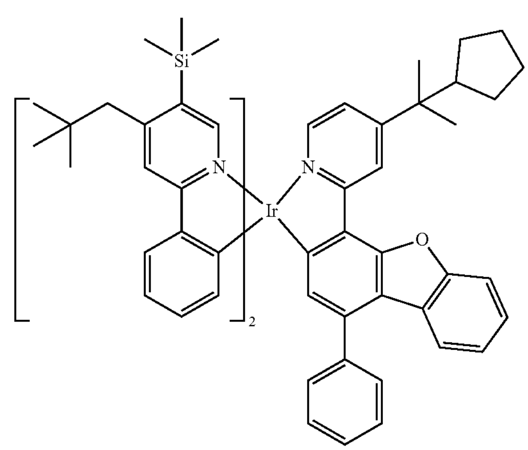

-continued
334
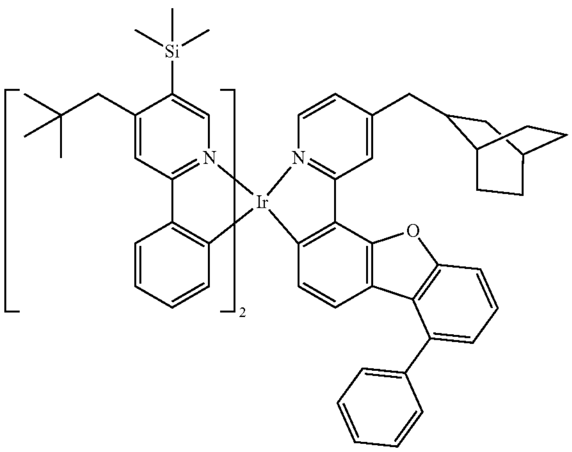
335
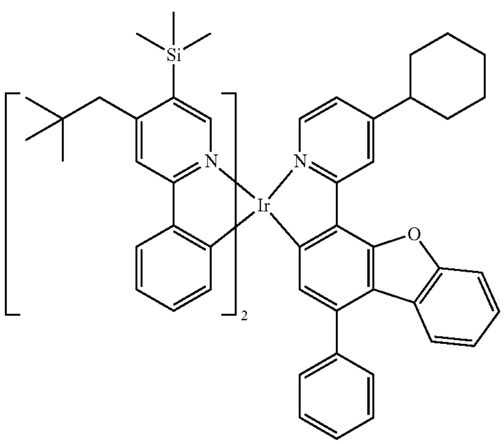
336
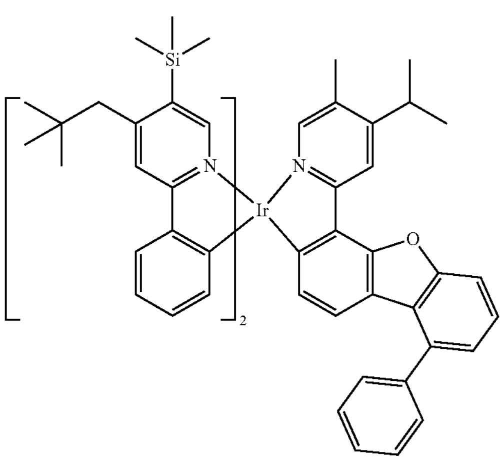
-continued
337
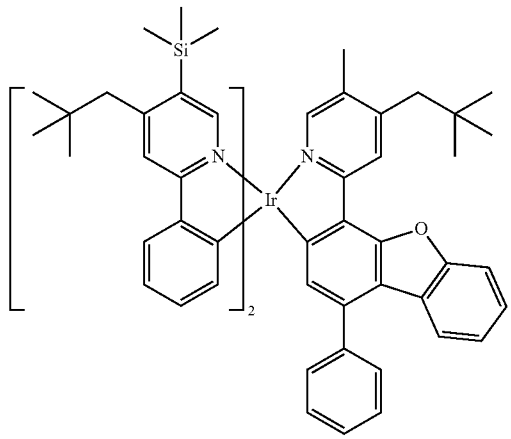
338
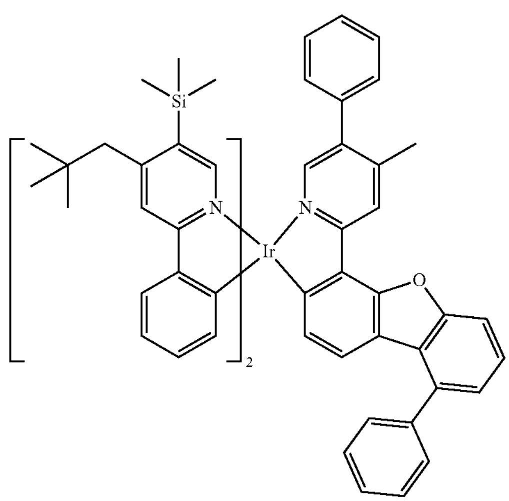
339
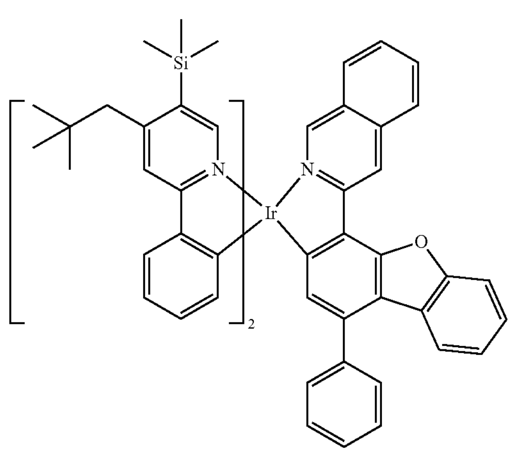

-continued
340
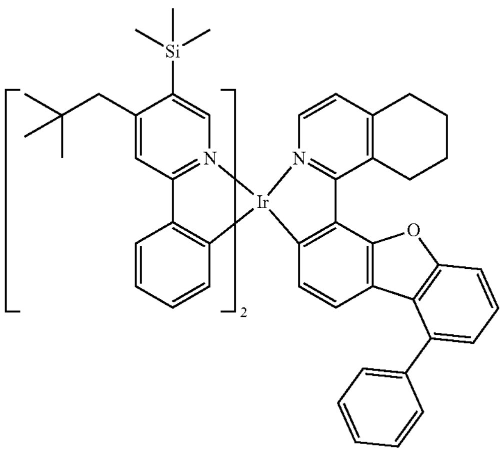
341
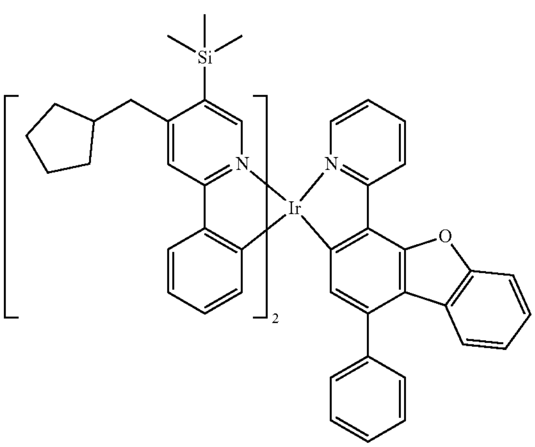
342
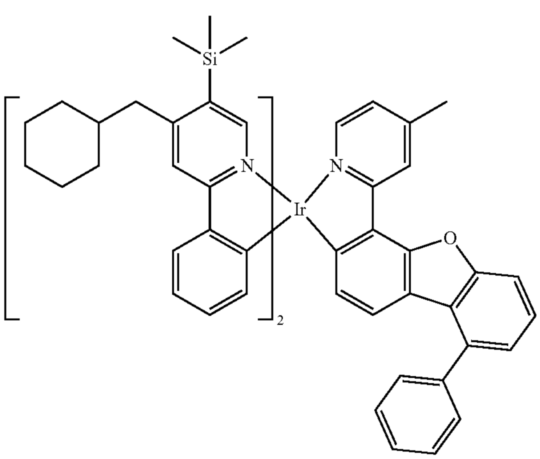
-continued
343
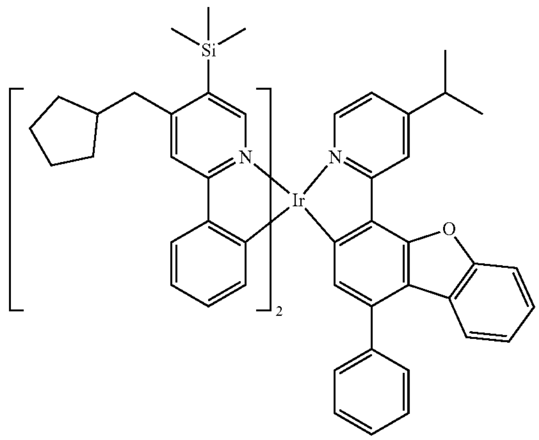
344
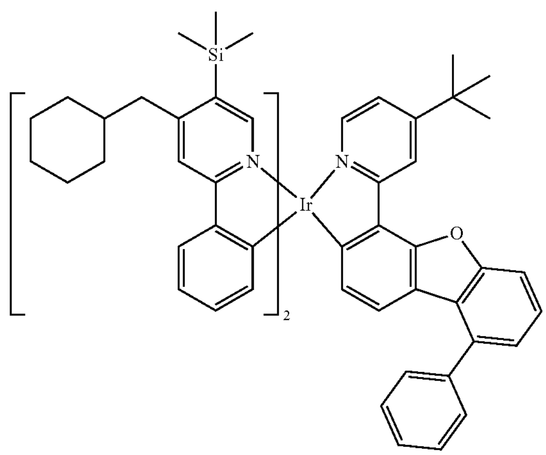
345
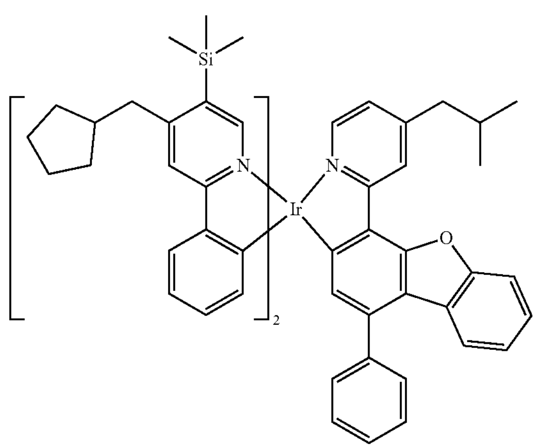

-continued
346
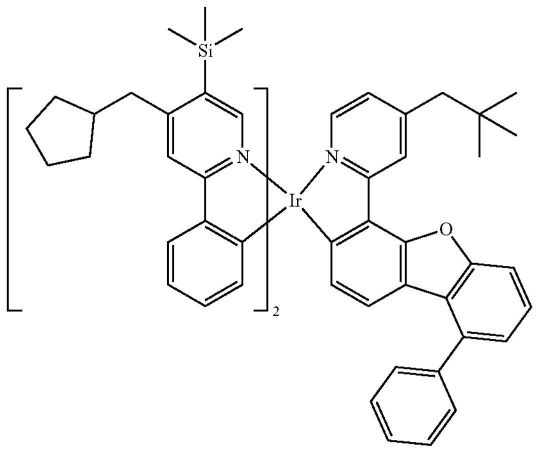
347
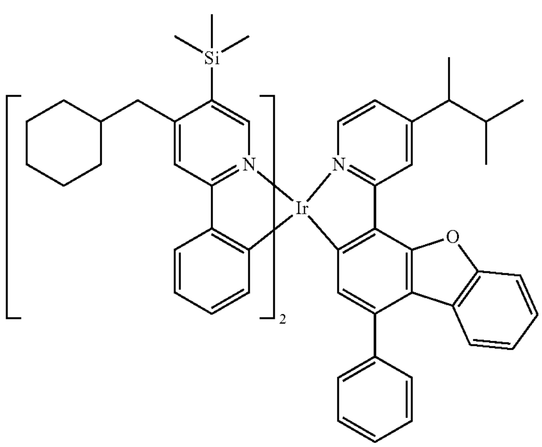
348
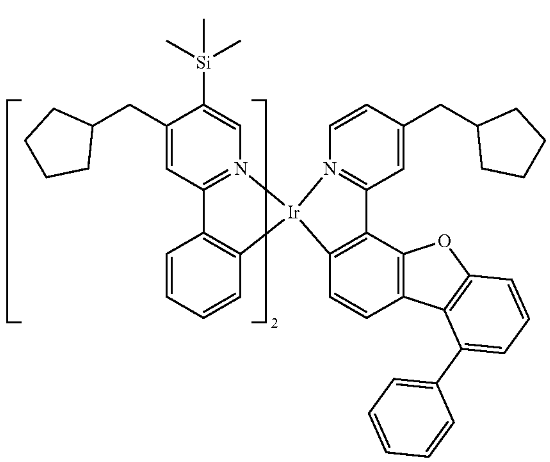
-continued
349
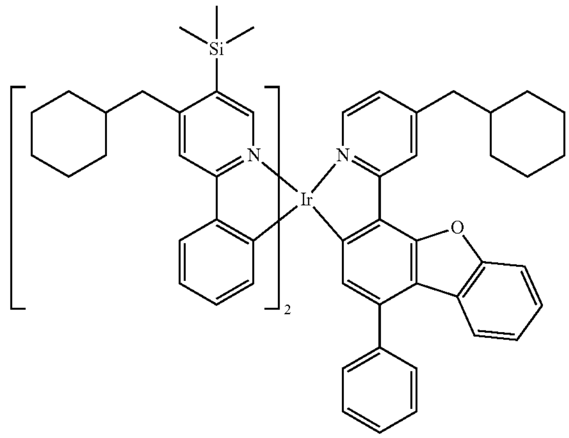
350
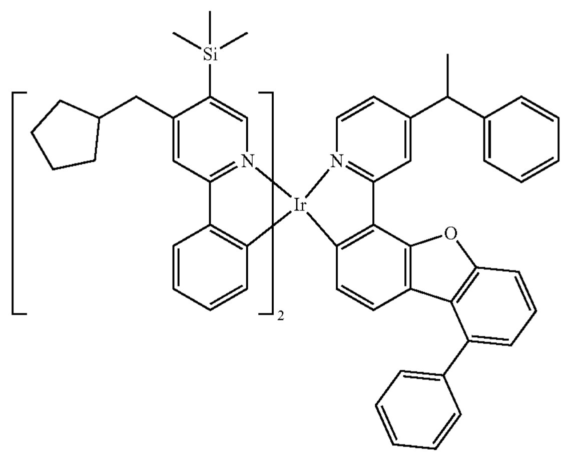
351
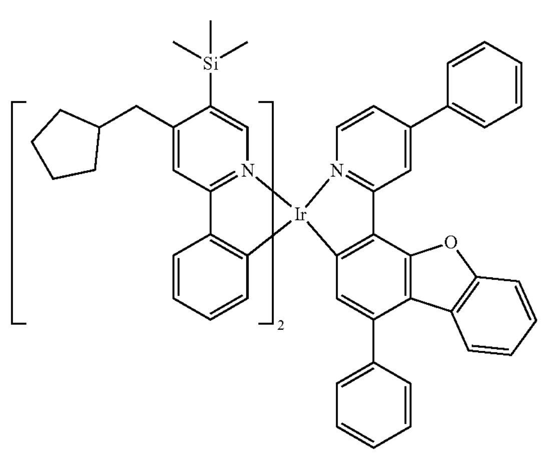

-continued
352
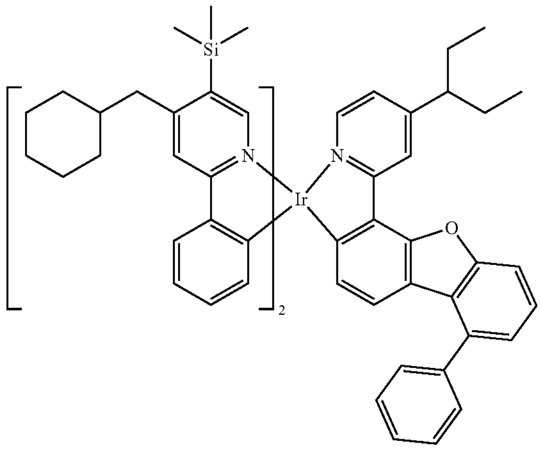
353
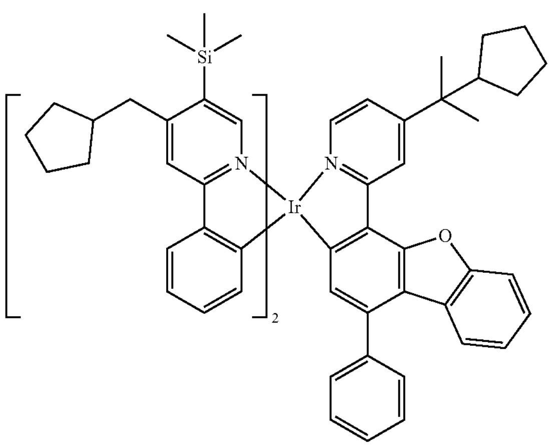
354
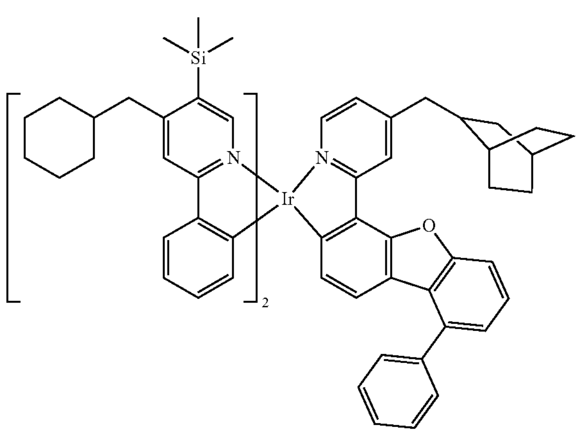
-continued
355
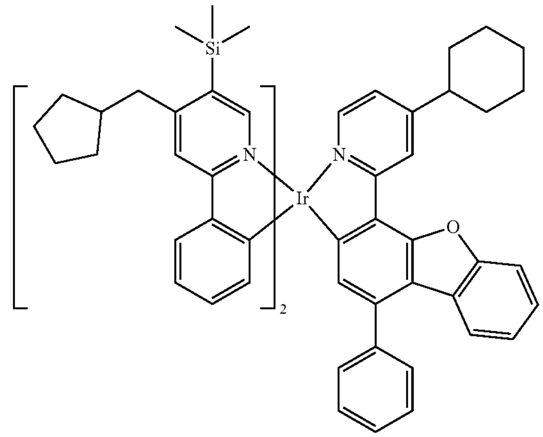
356
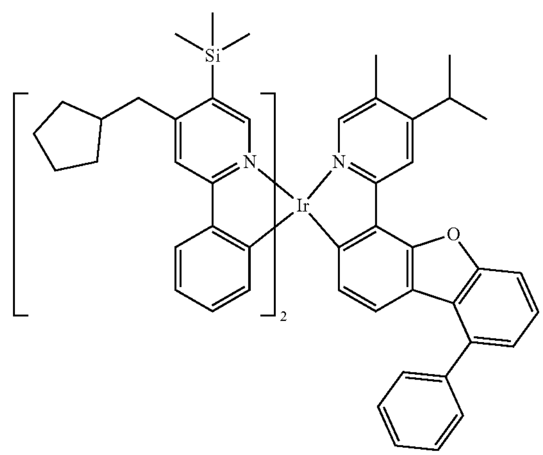
357
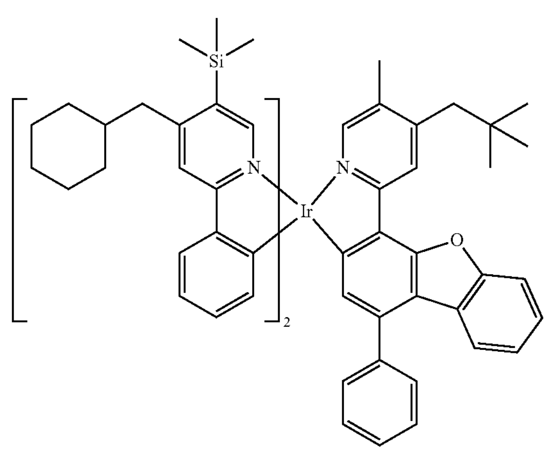

-continued
358
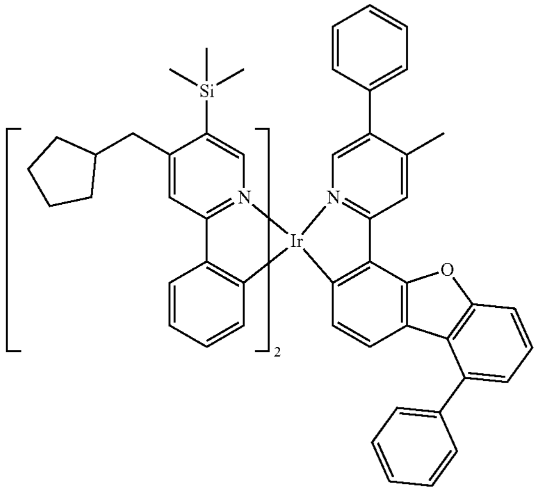
359
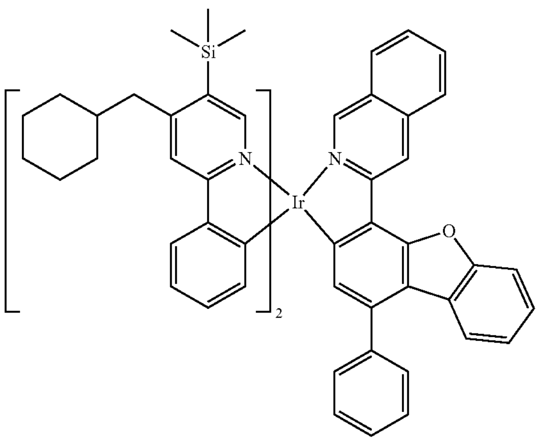
360
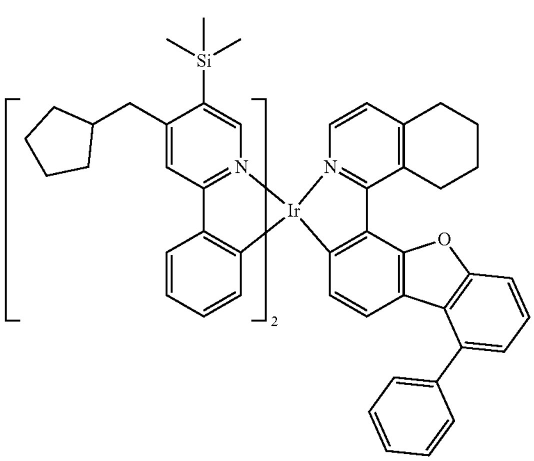
-continued
361
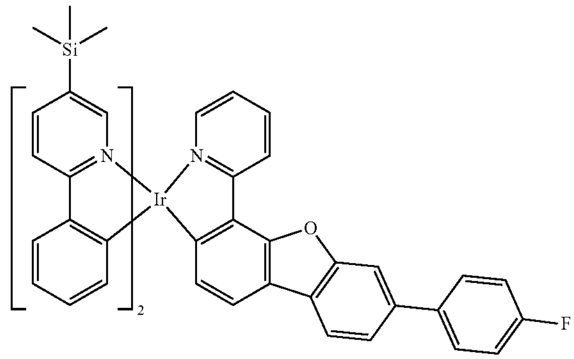
362
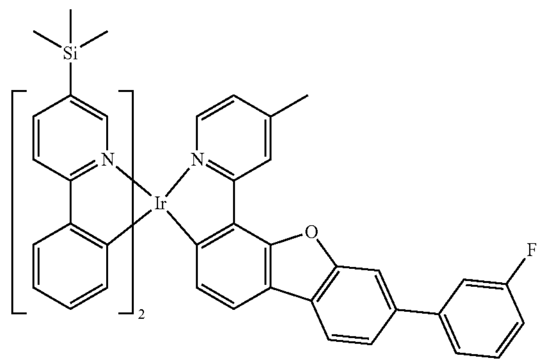
363
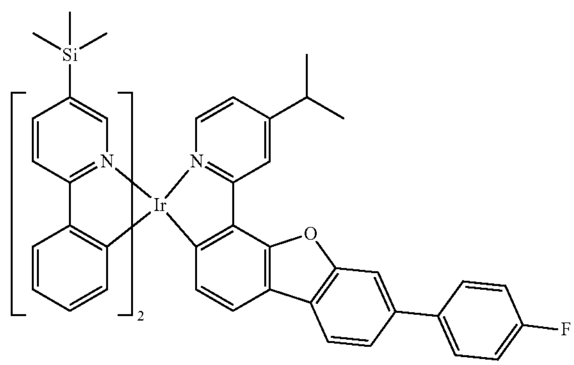
364
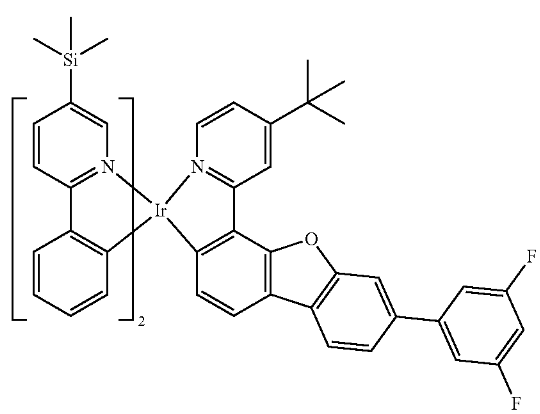

-continued
365
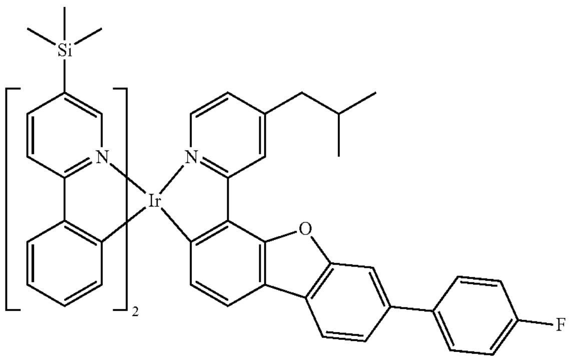
366
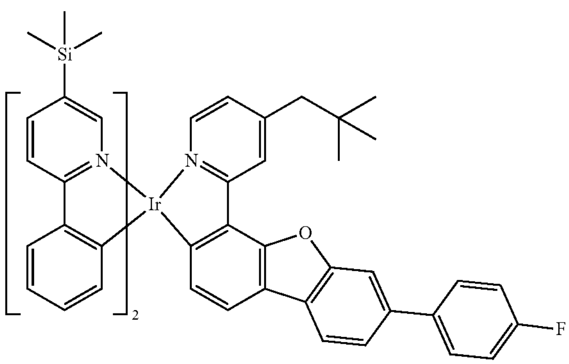
367
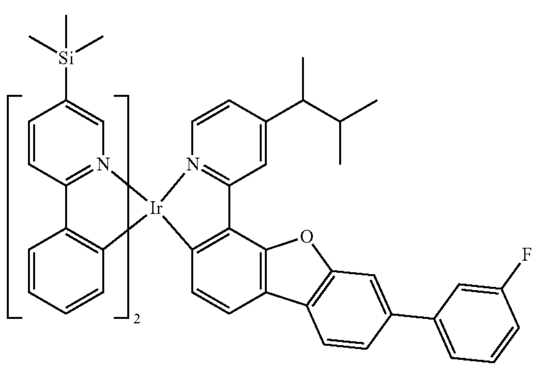
368
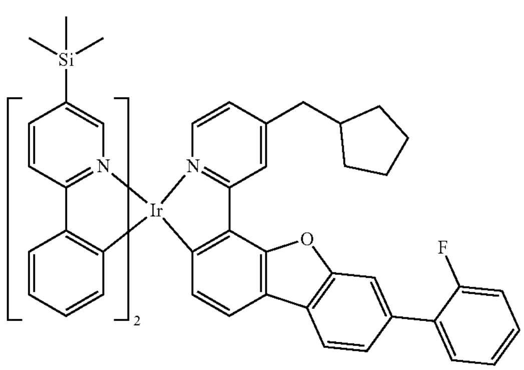
-continued
369
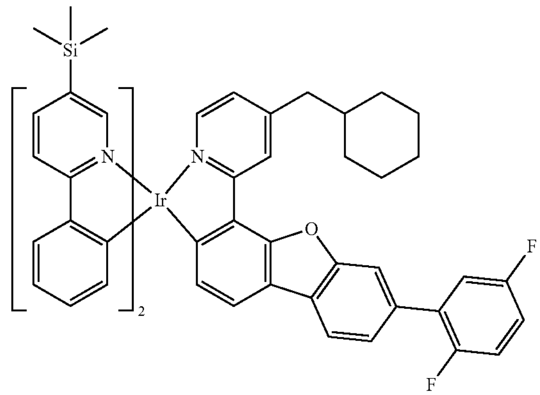
370
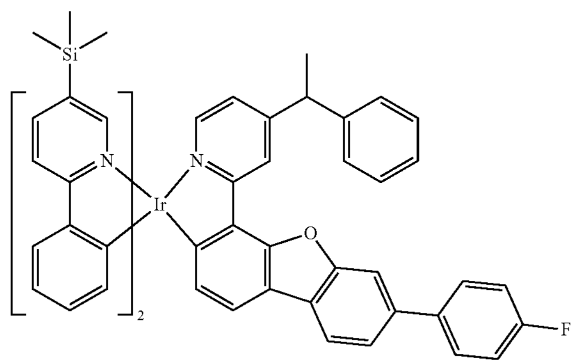
371
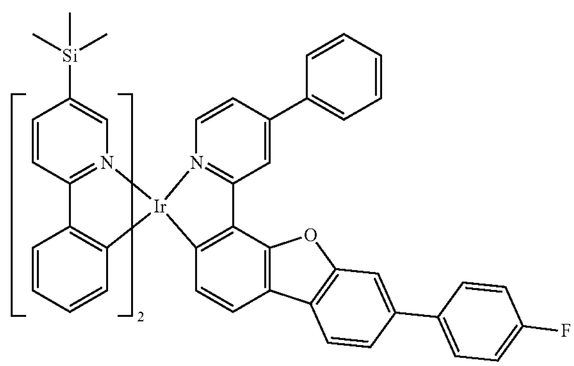
372
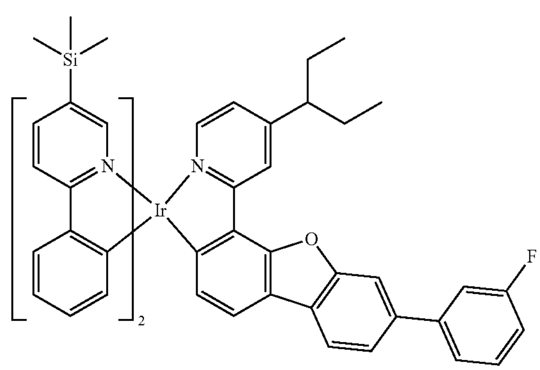

-continued
373
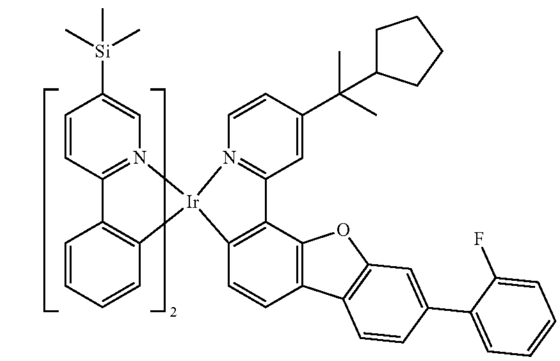
374
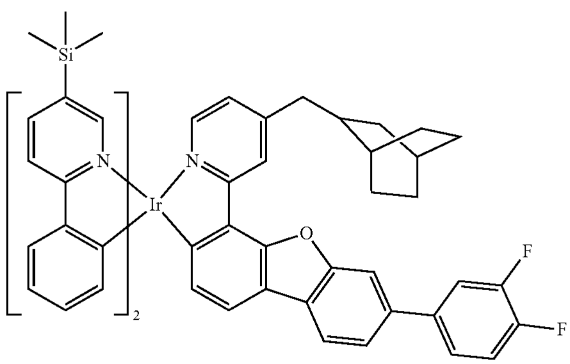
375
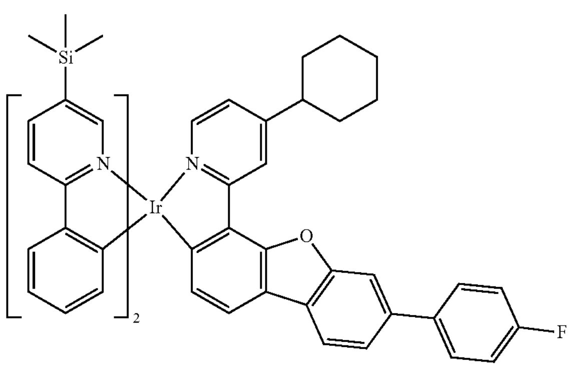
376
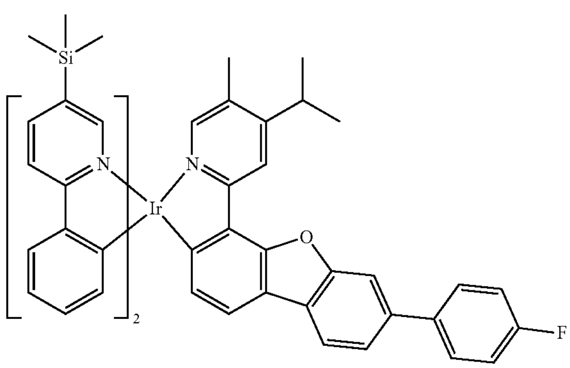
-continued
377
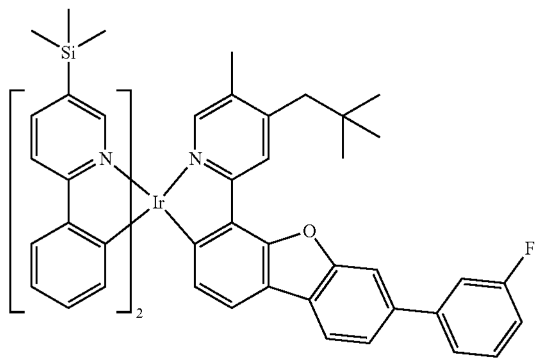
378
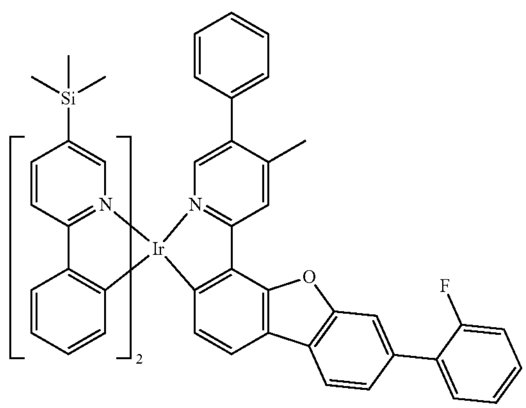
379
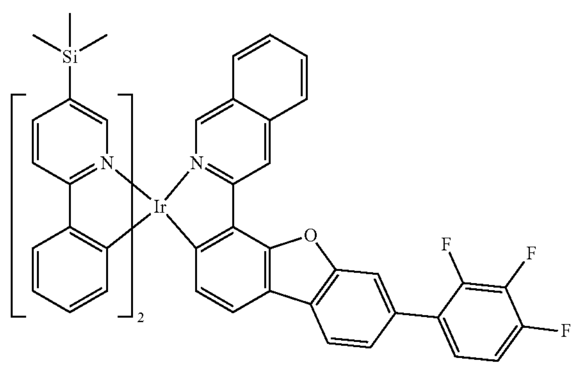
380
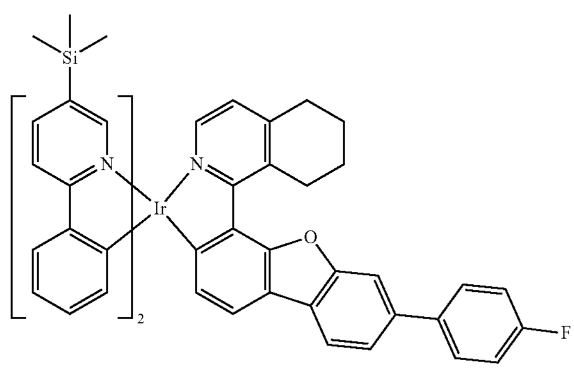

-continued
381
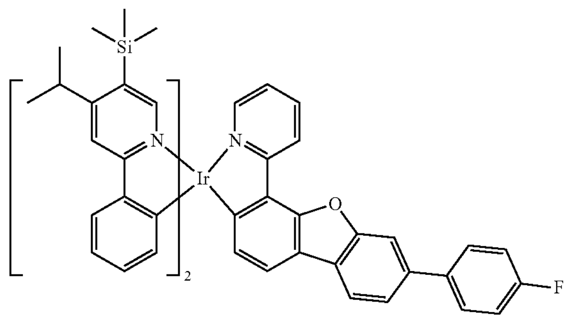
382
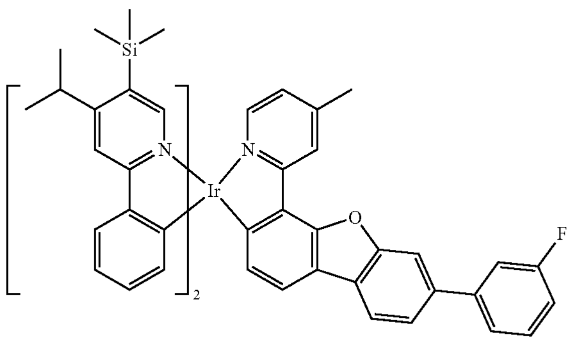
383
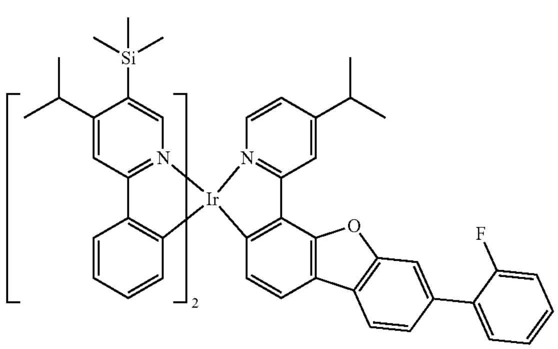
384
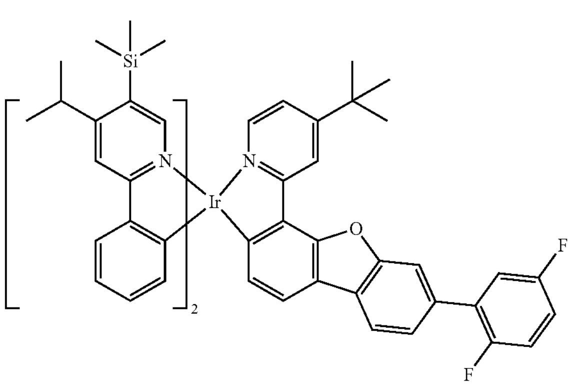
-continued
385
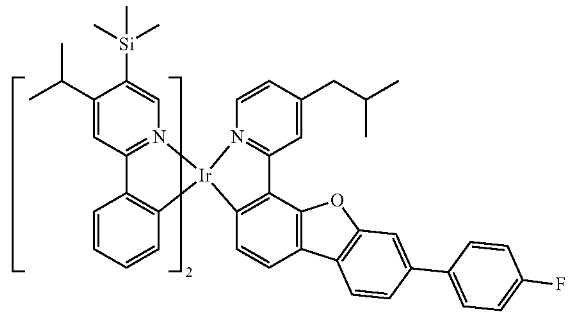
386
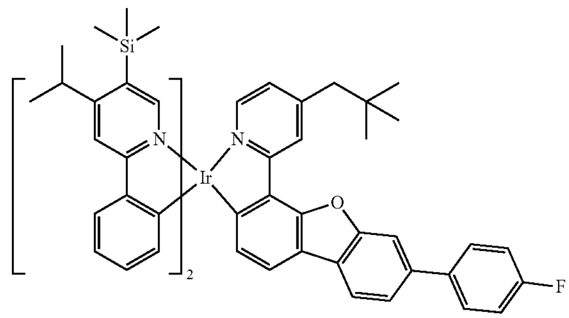
387
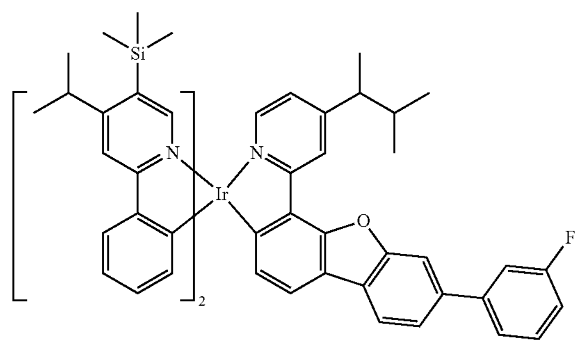
388
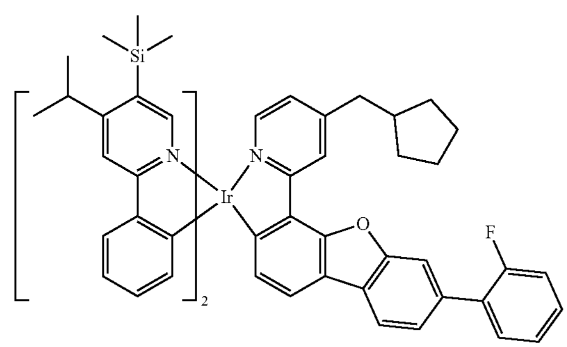

-continued
389
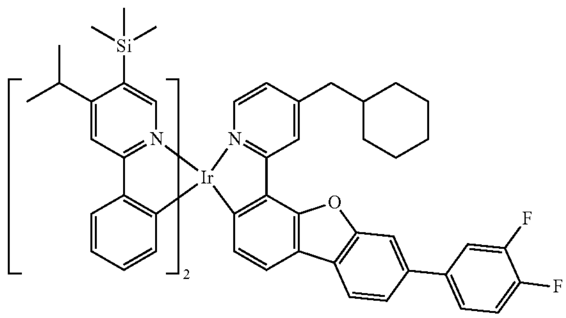
390
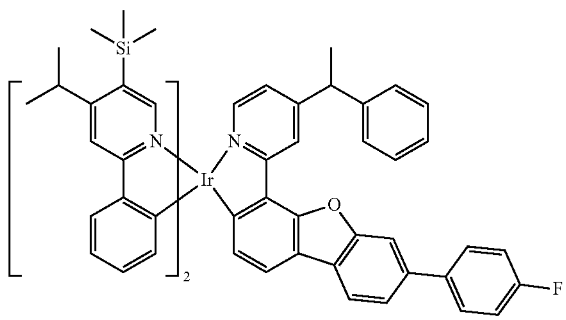
391
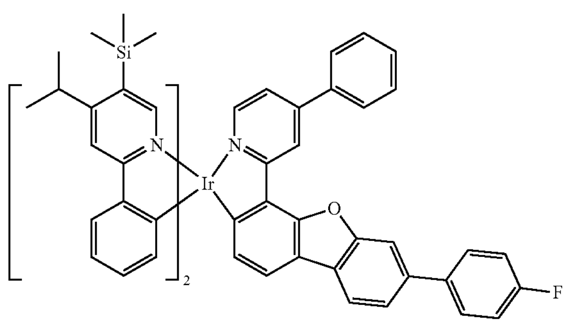
392
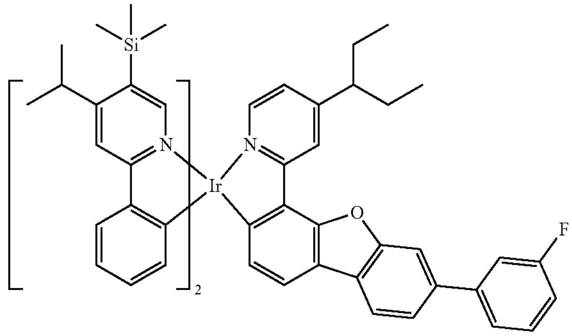
-continued
393
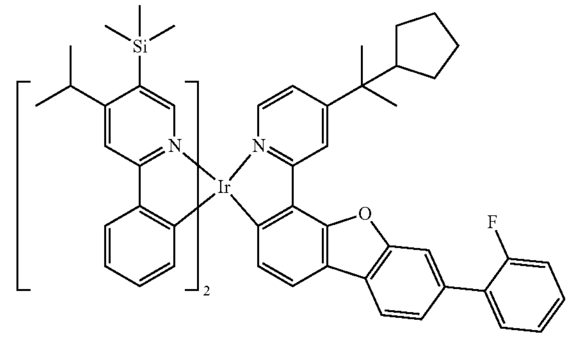
394
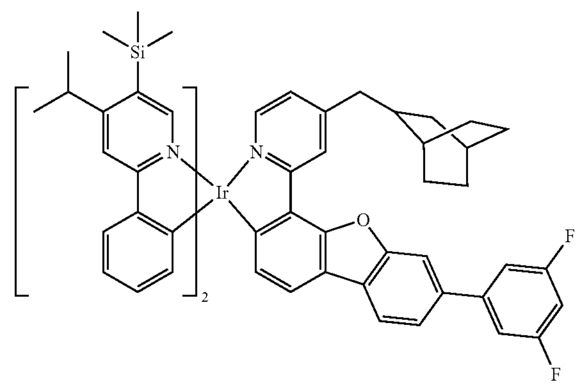
395
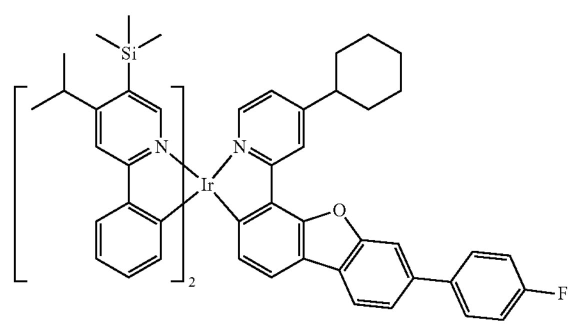
396
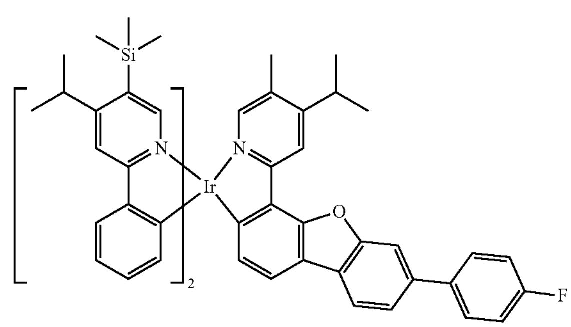

-continued
397
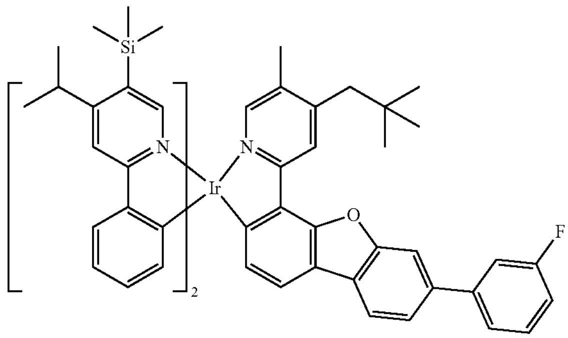
398
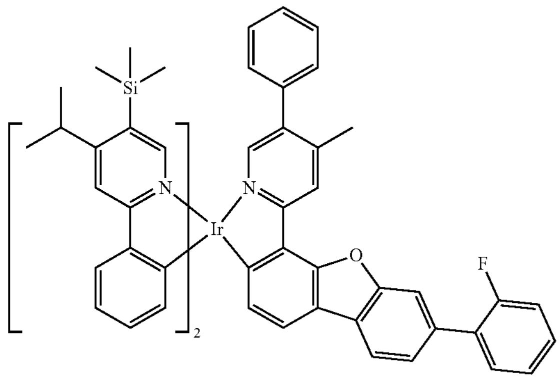
399
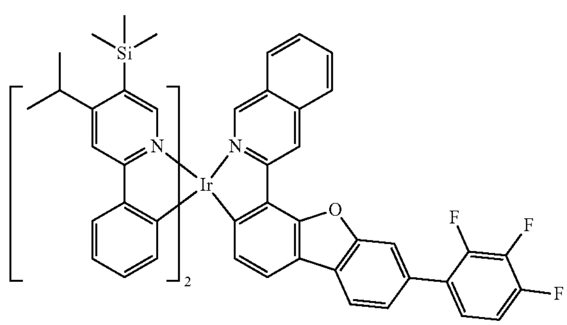
400
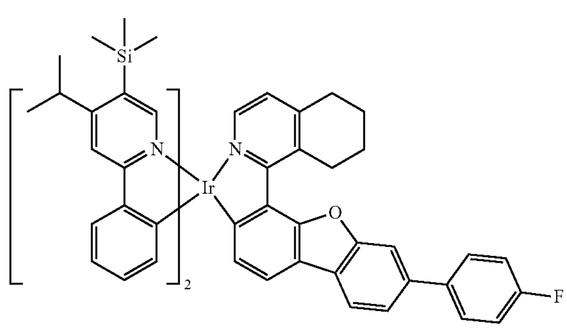
-continued
401
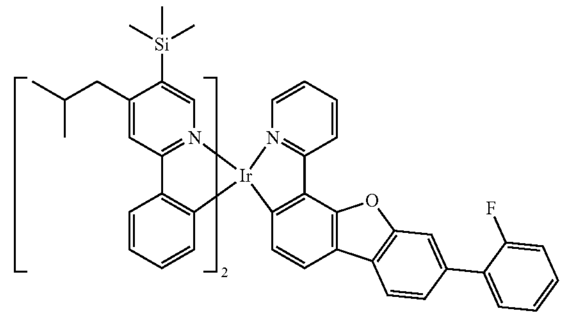
402
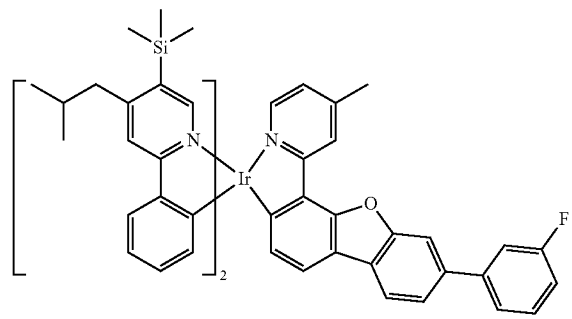
403
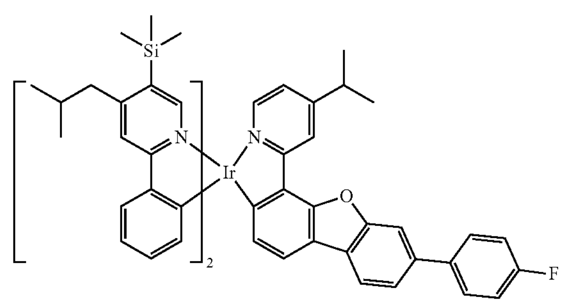
404
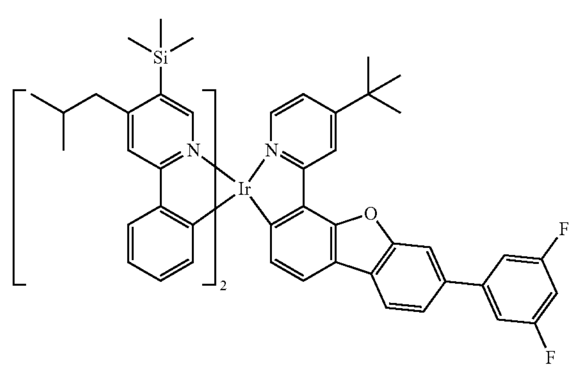

-continued
405
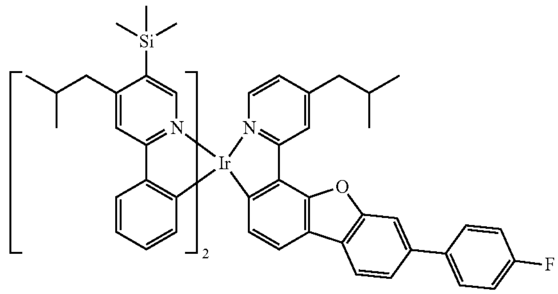
406
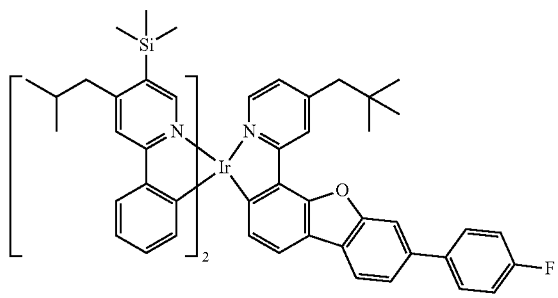
407
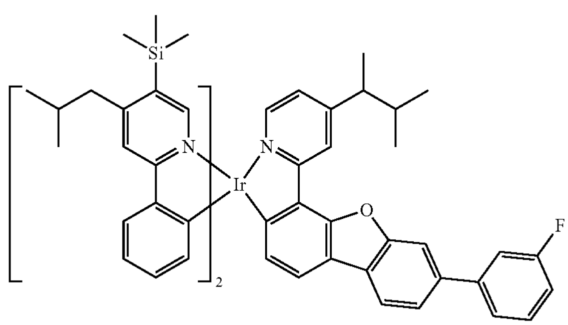
408
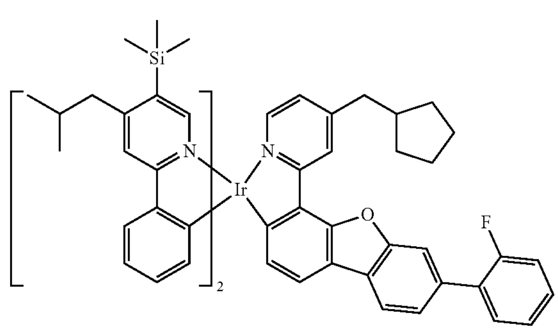
-continued
409
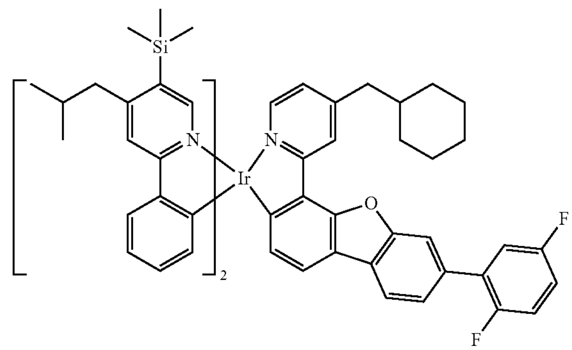
410
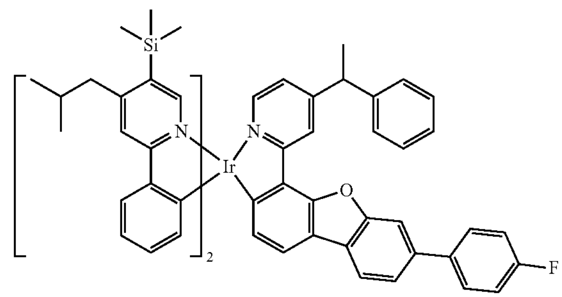
411
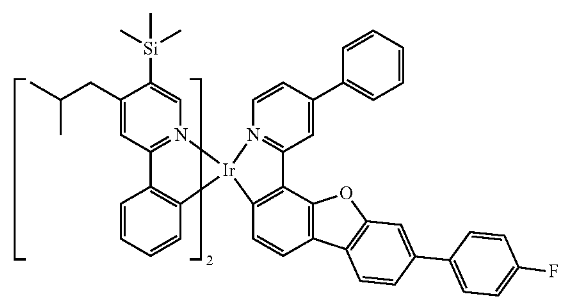
412
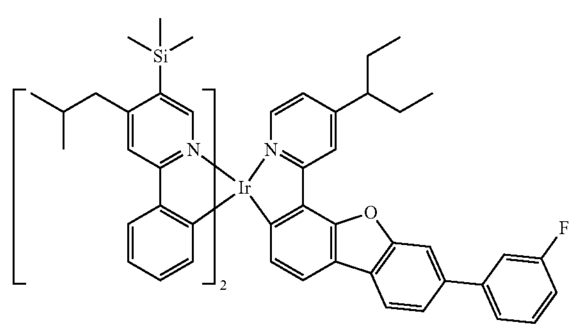

-continued
413
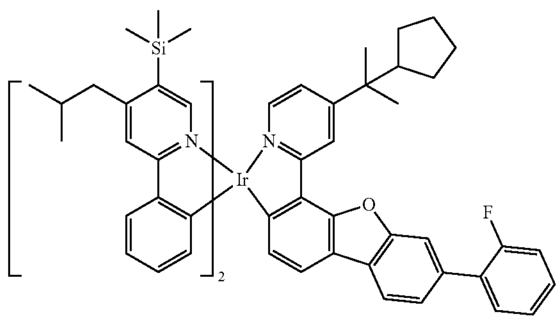
414
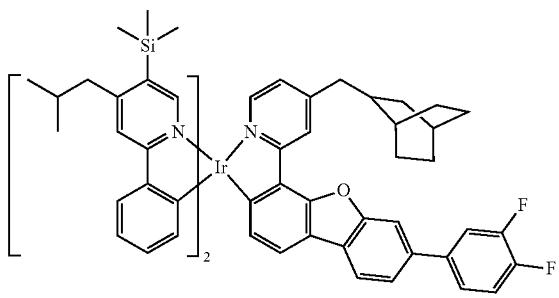
415
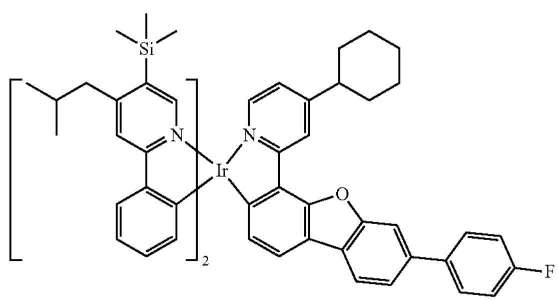
416
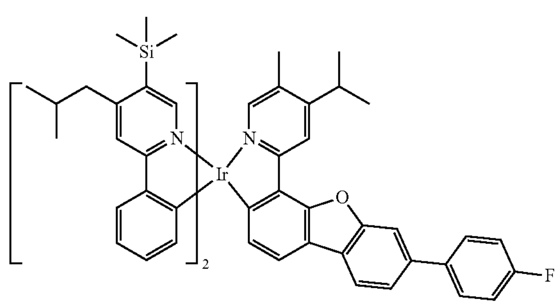
417
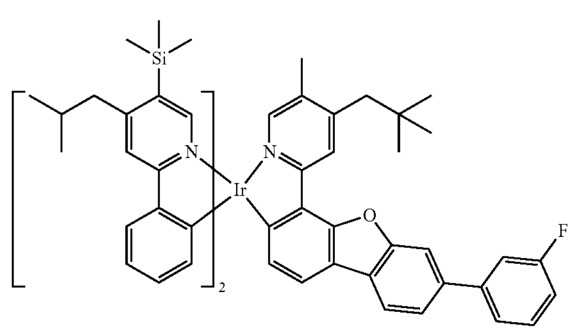
-continued
418
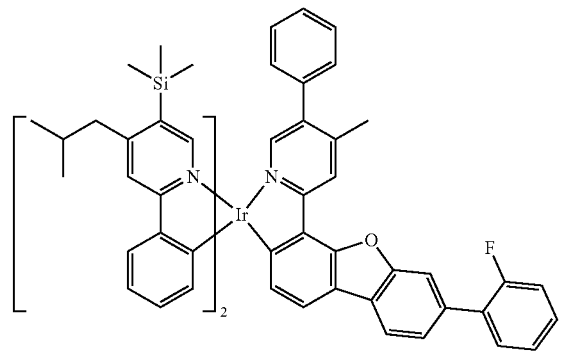
419
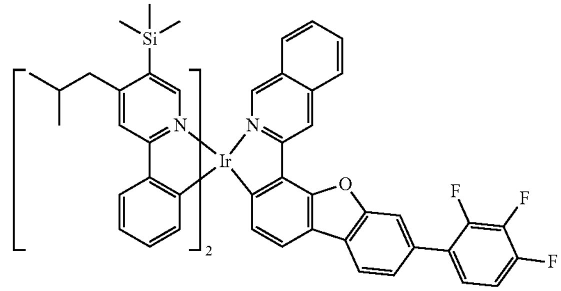
420
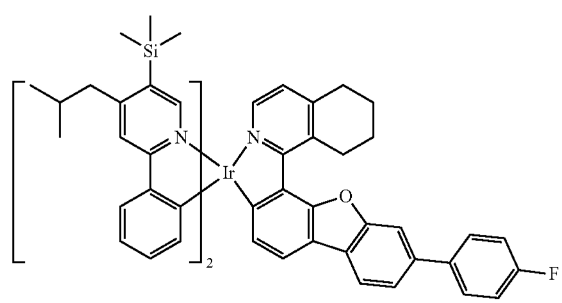
421
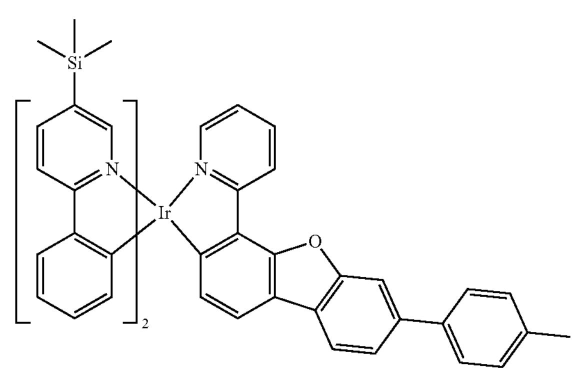

422
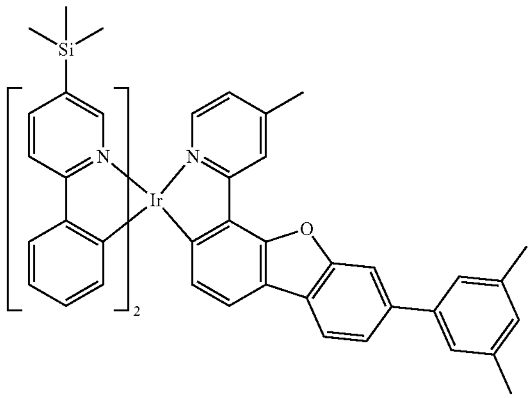
423
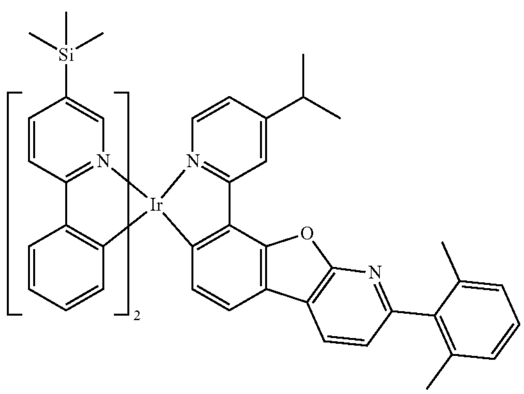
424
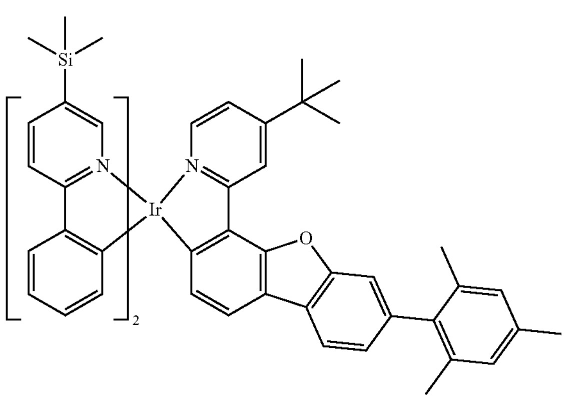
425
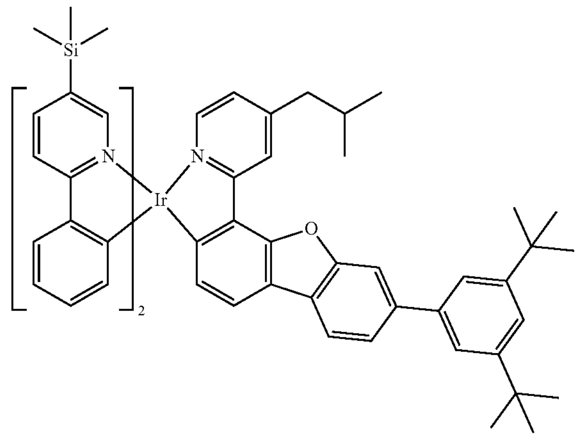
426
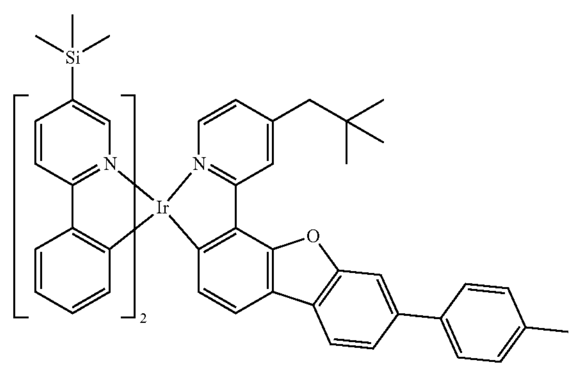
427
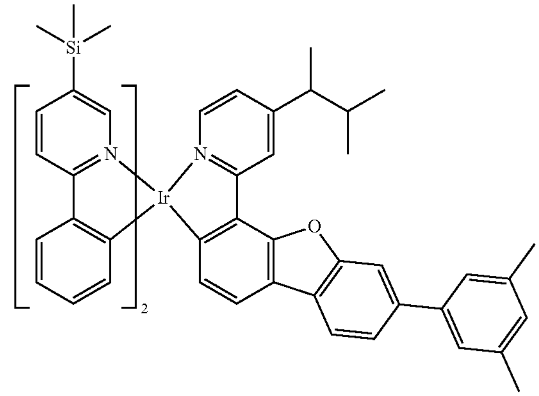

-continued
428
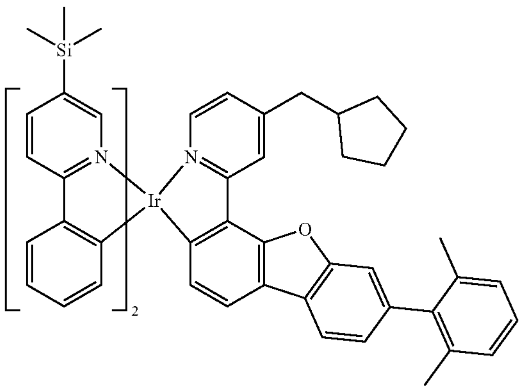
429
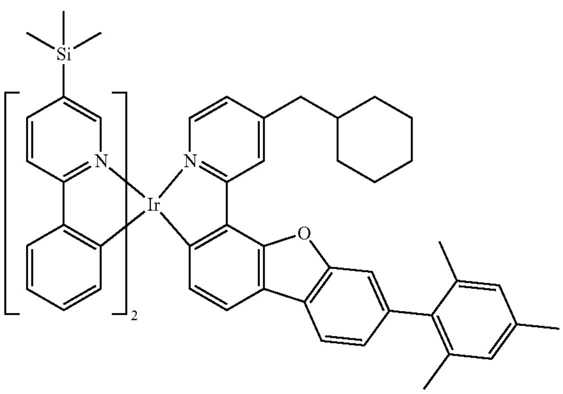
430
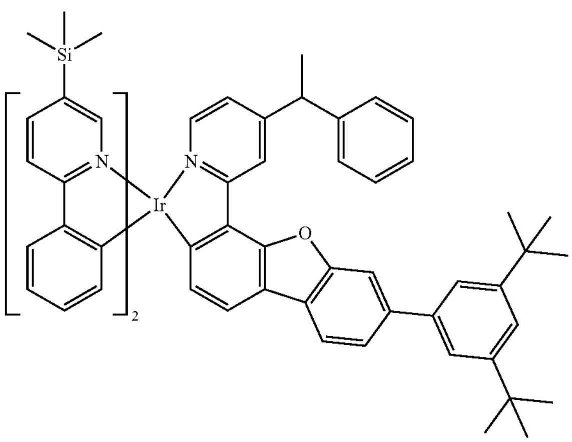
431
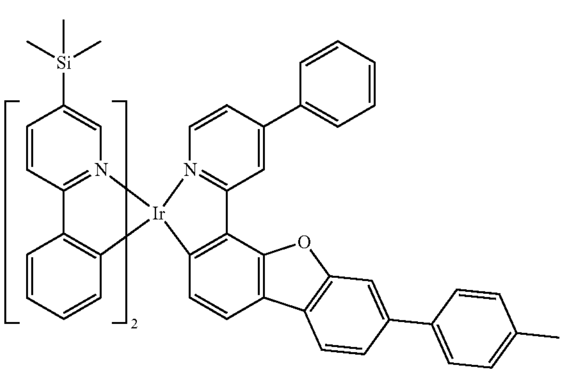
-continued
432
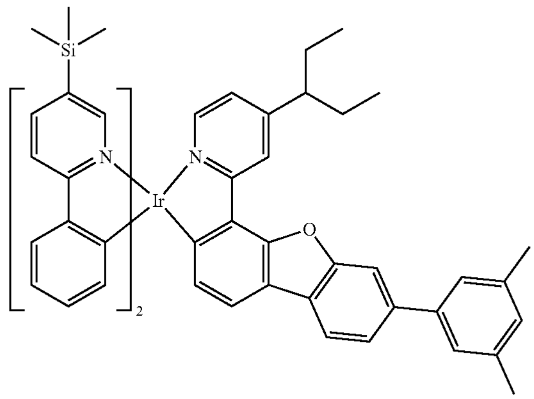
433
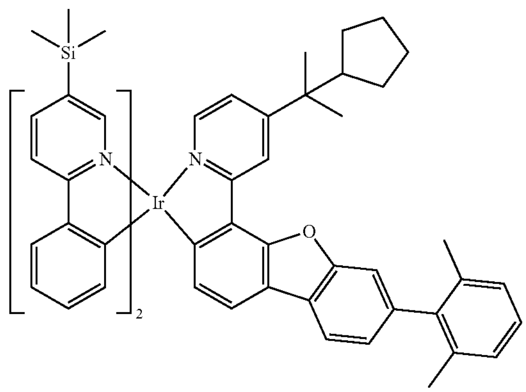
434
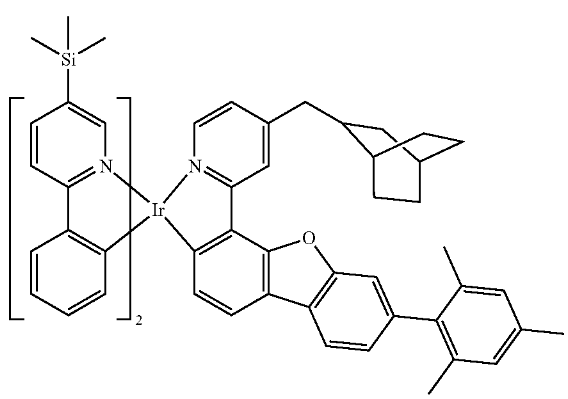

-continued
435
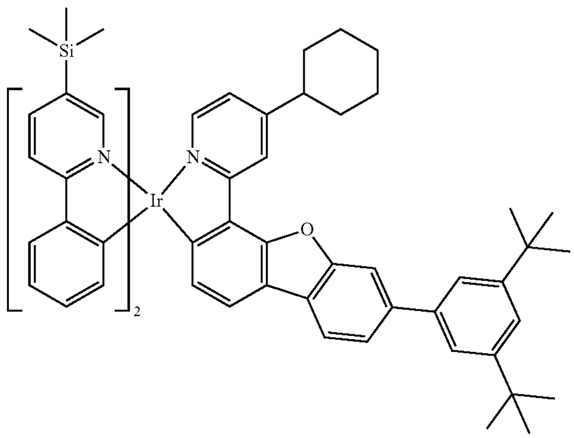
436
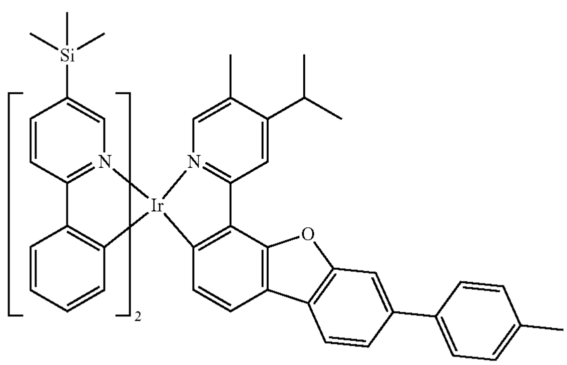
437
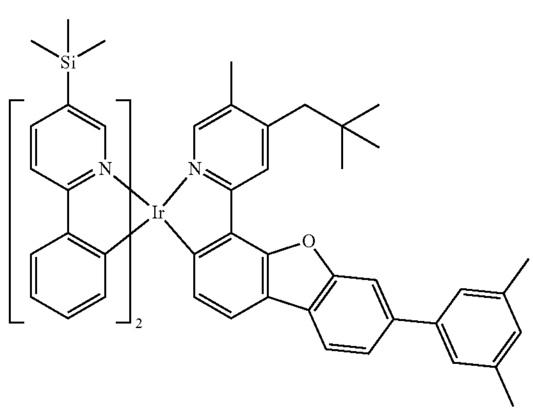
-continued
438
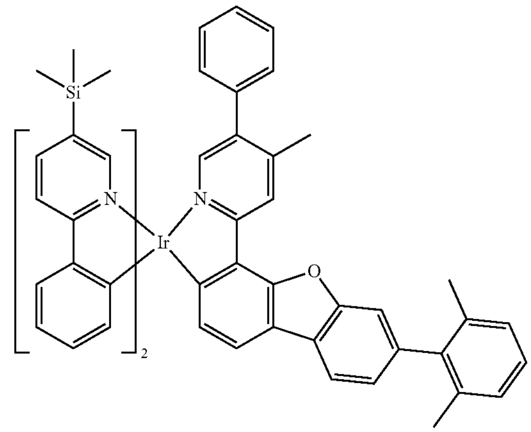
439
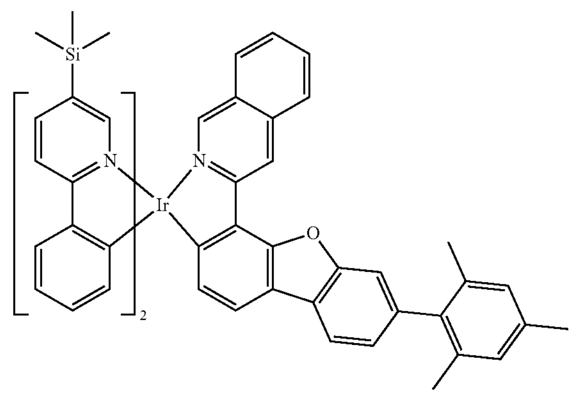
440
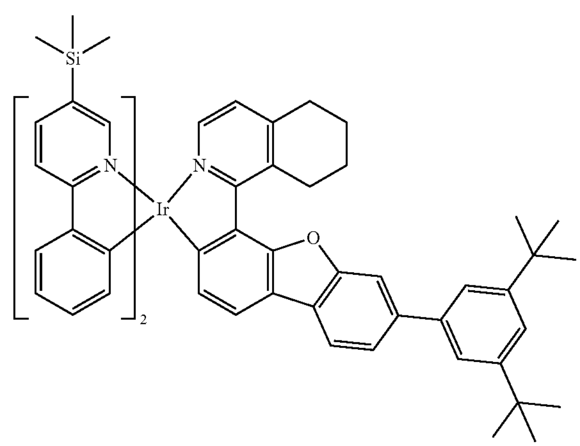
441
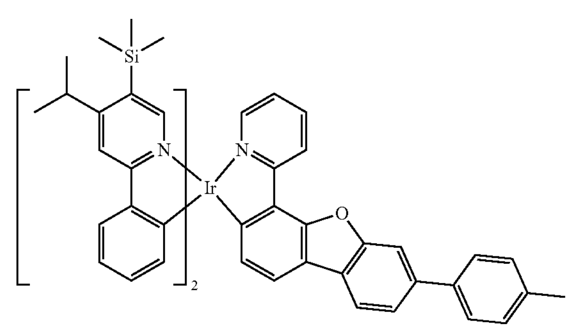

-continued
442
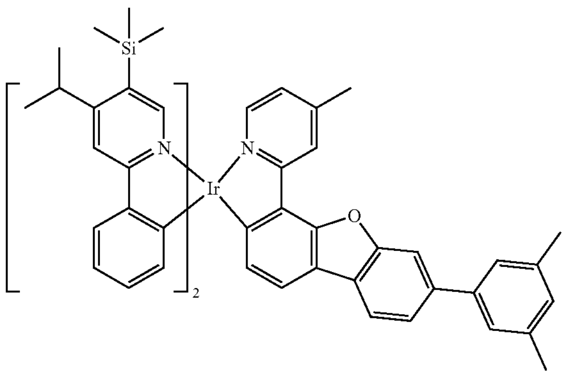
443
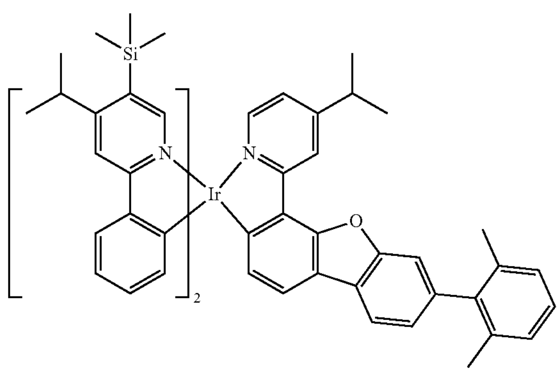
444
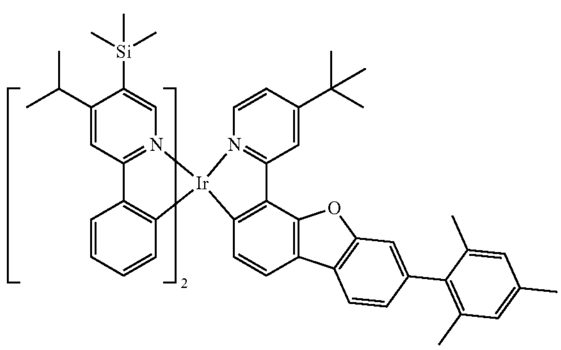
445
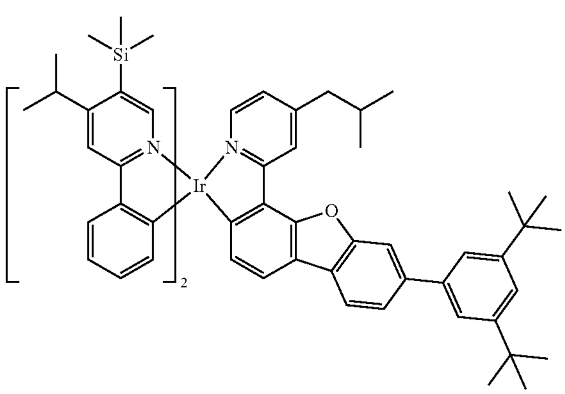
-continued
446
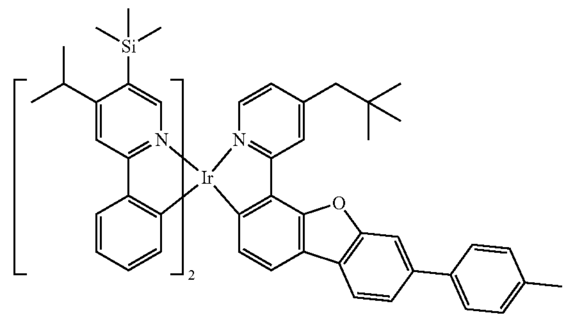
447
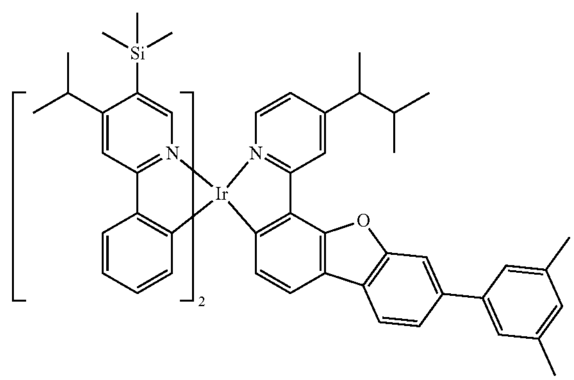
448
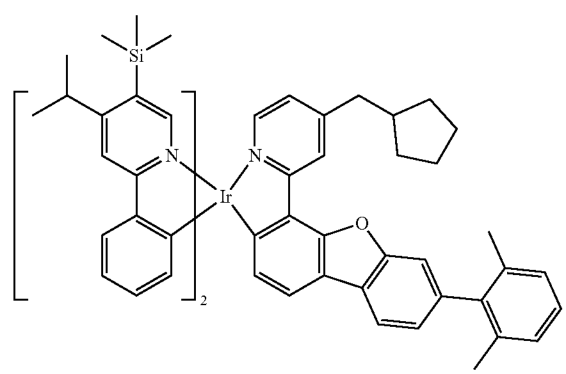
449
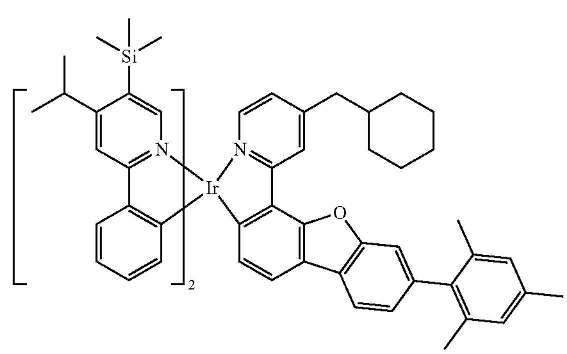

-continued
450
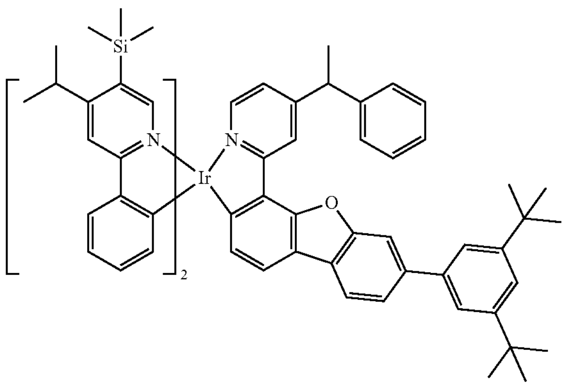
451
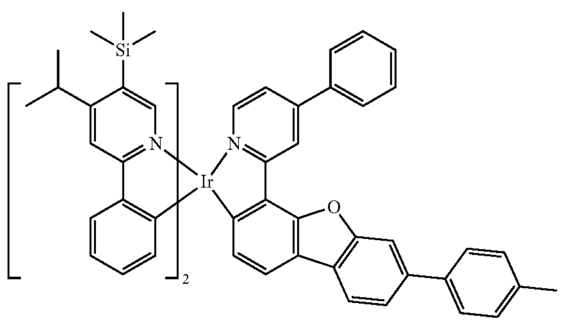
452
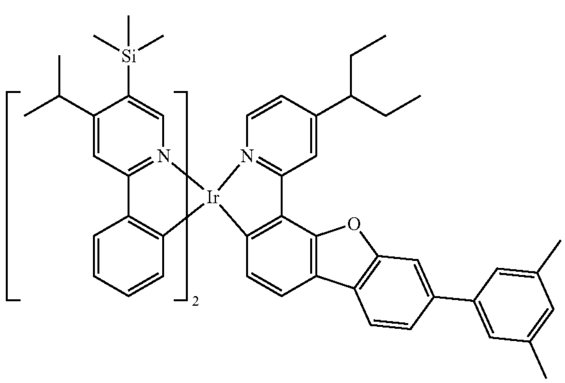
453
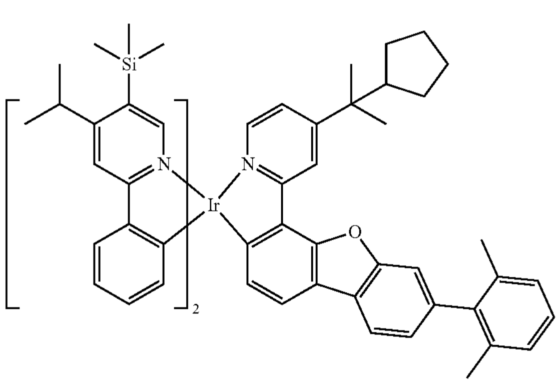
-continued
454
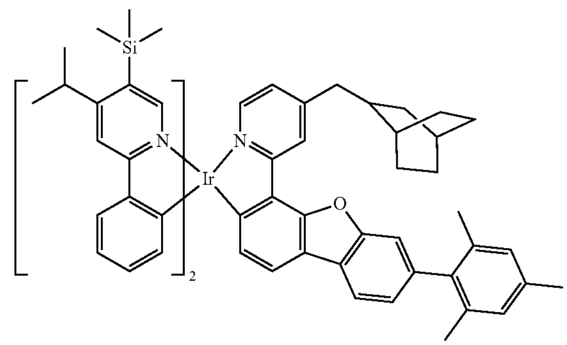
455
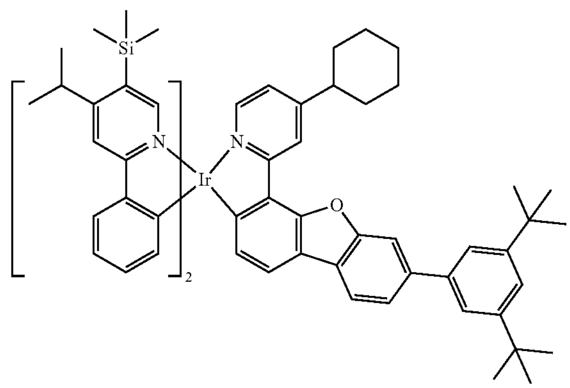
456
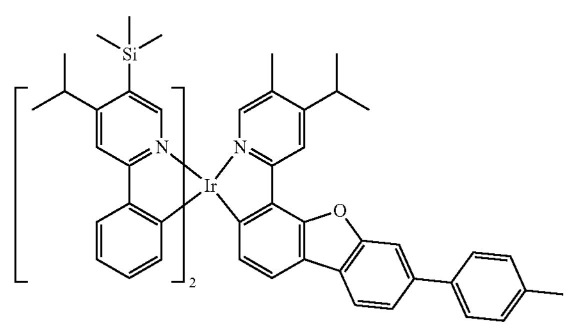
457
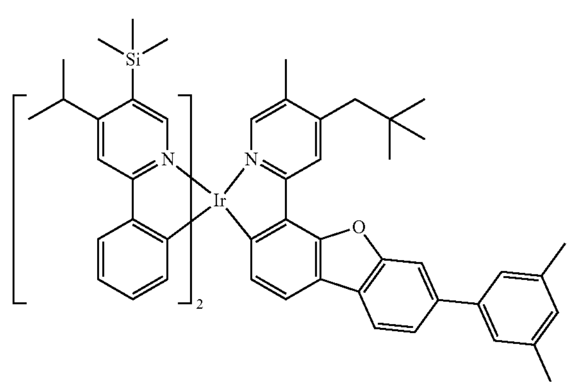

458
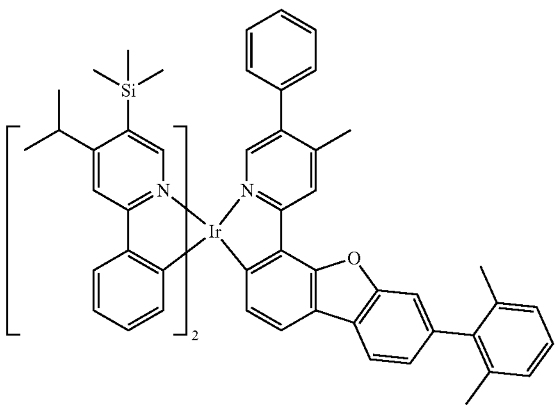
459
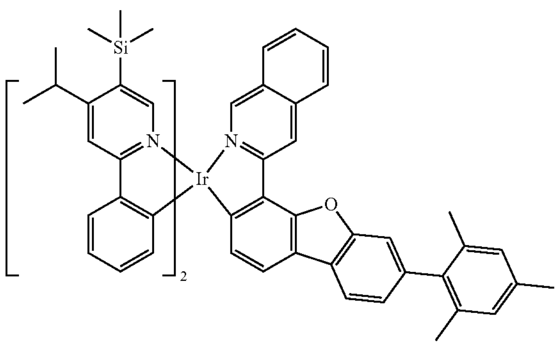
460
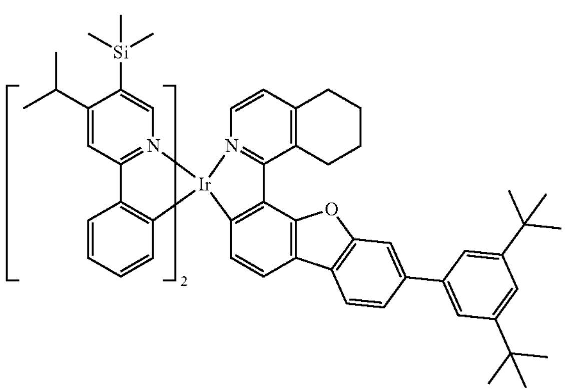
461
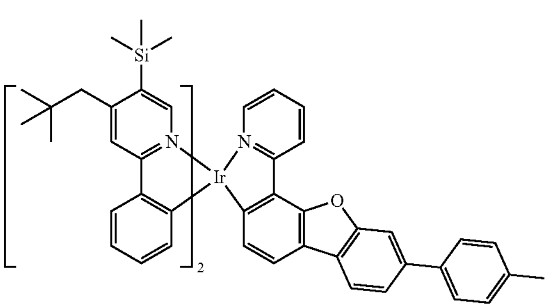
462
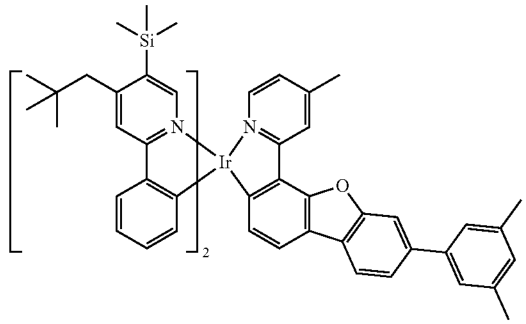
463
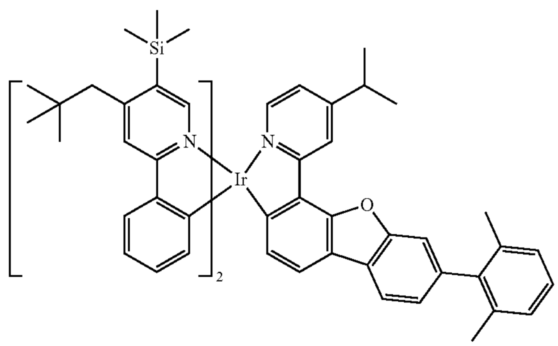
464
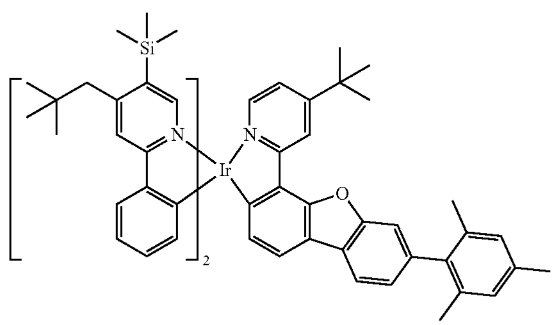
465
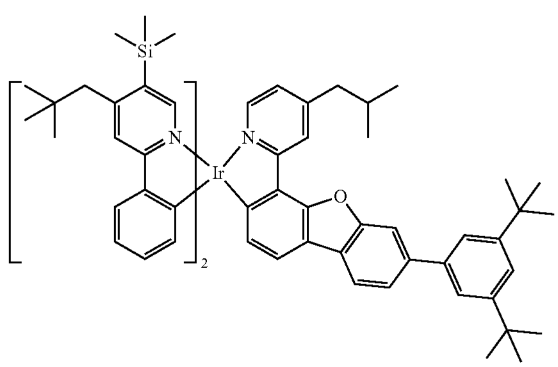

-continued
466
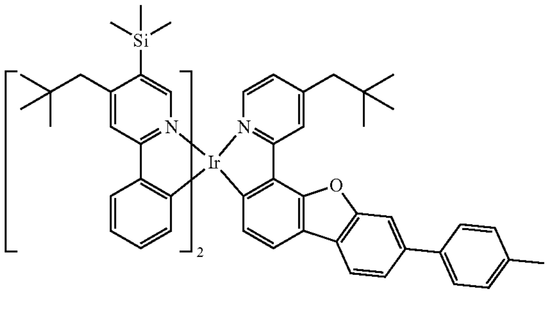
467
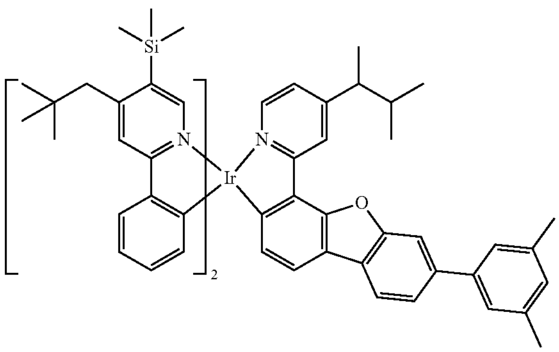
468
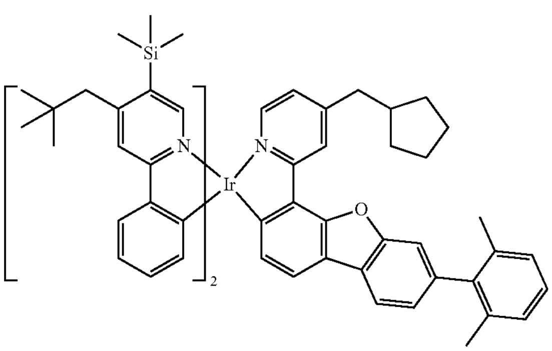
469
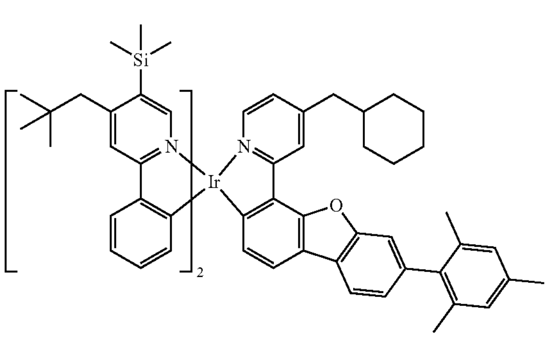
-continued
470
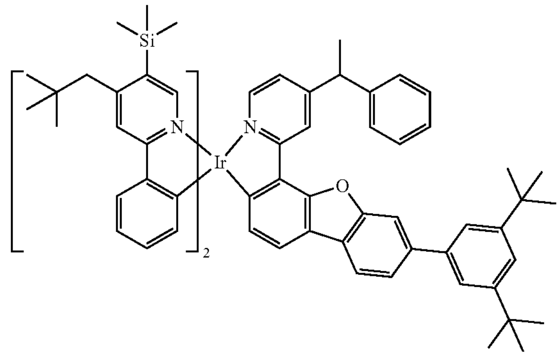
471
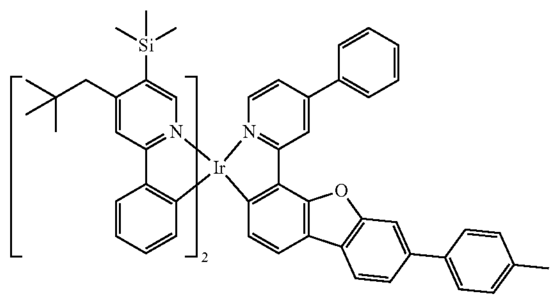
472
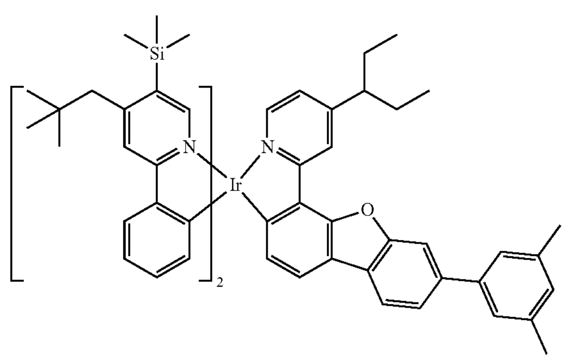
473
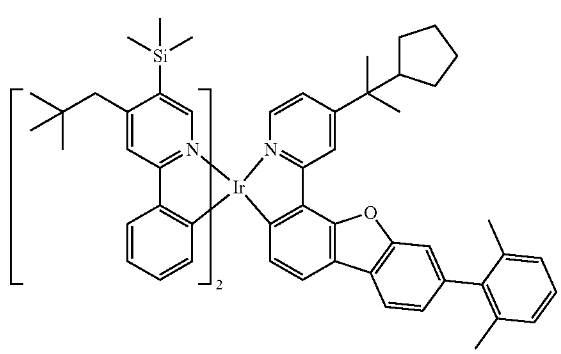

-continued
474
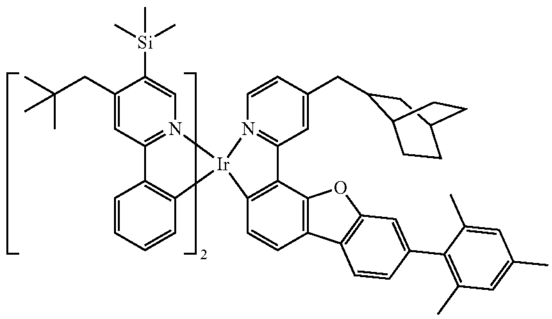
475
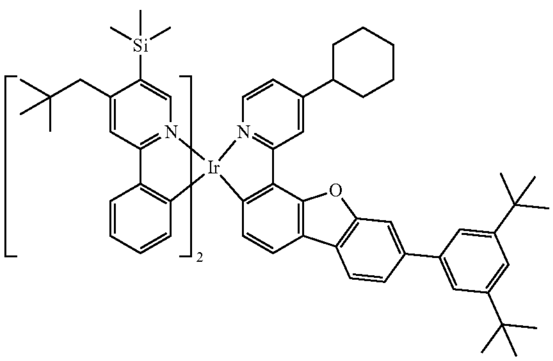
476
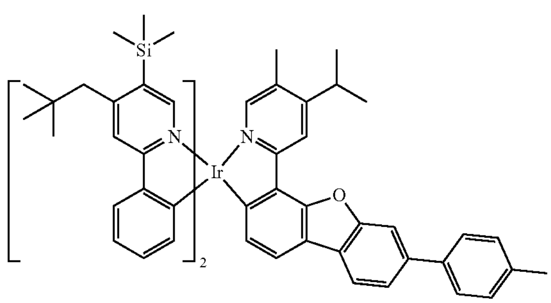
477
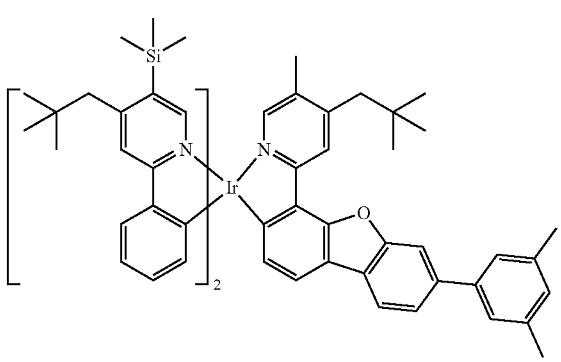
-continued
478
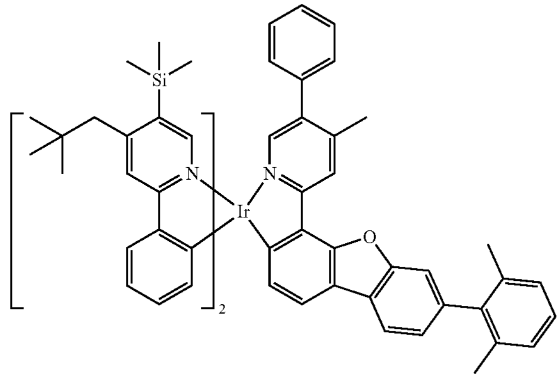
479
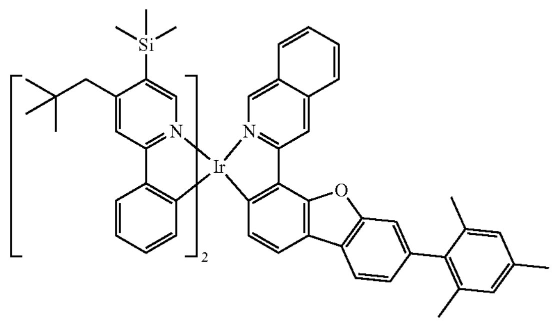
480
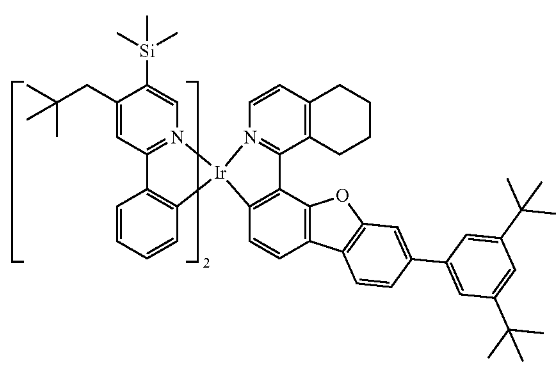
481
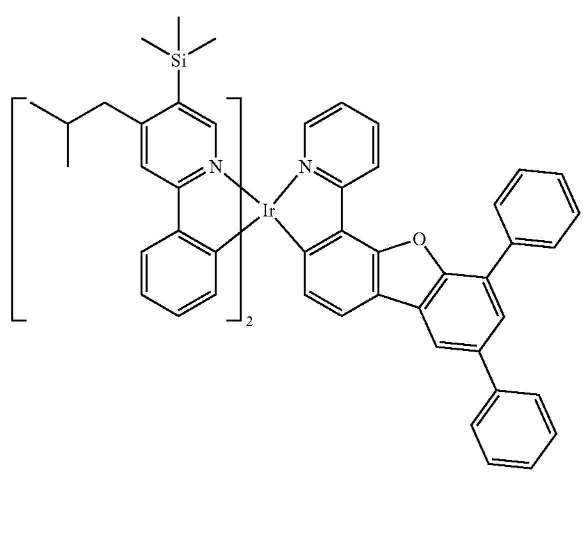

-continued
482
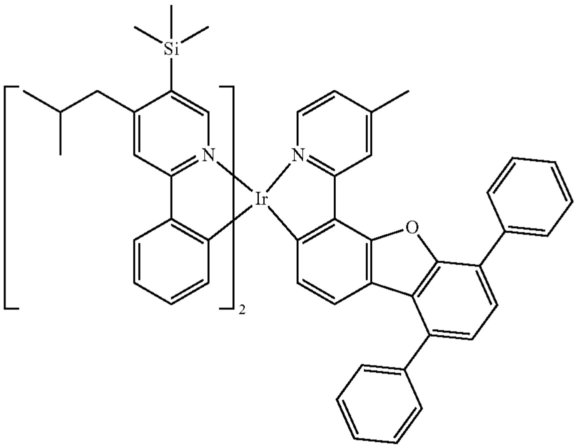
483
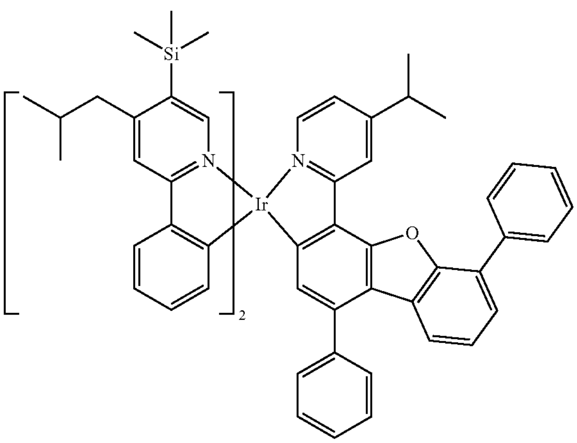
484
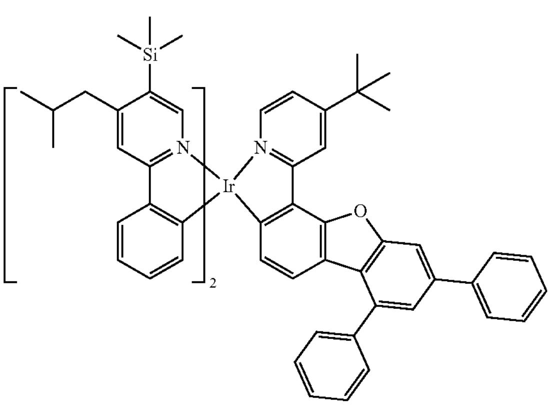
-continued
485
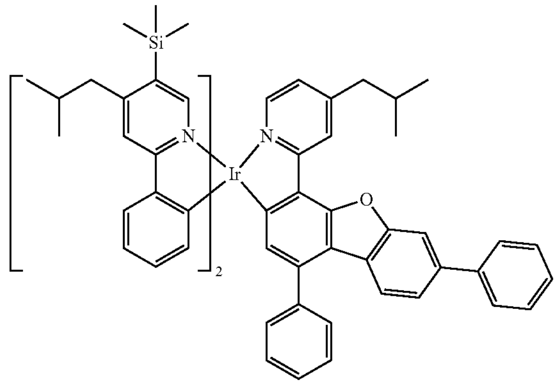
486
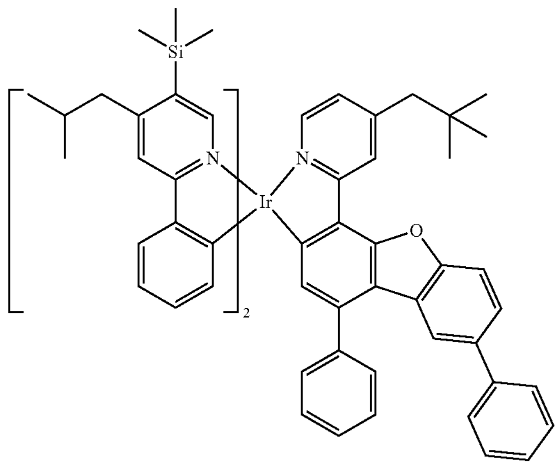
487
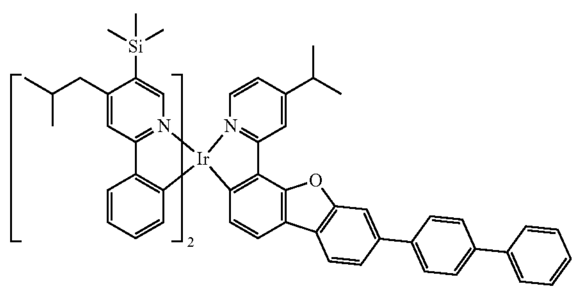
488
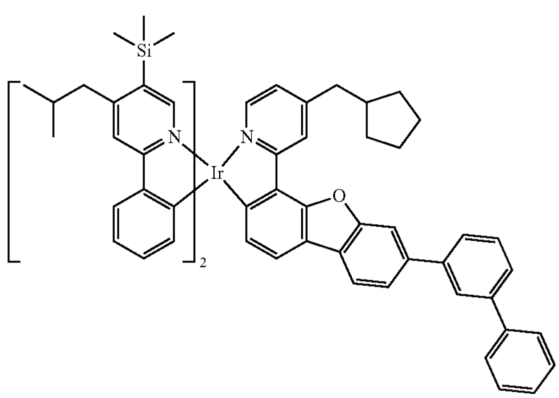

489
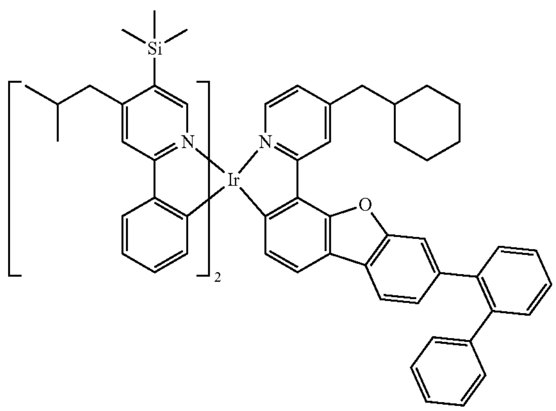
490
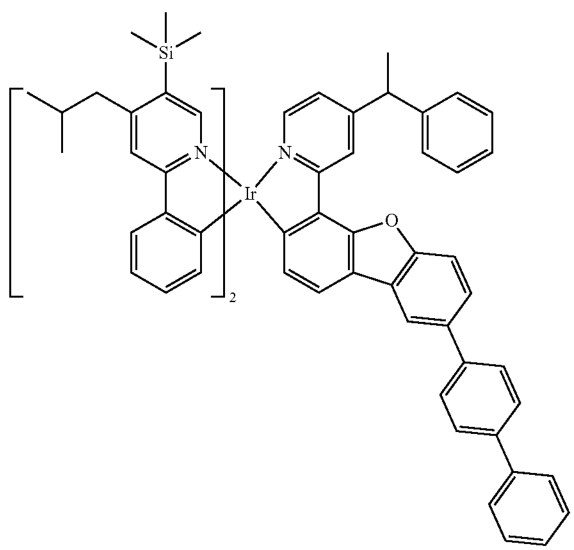
491
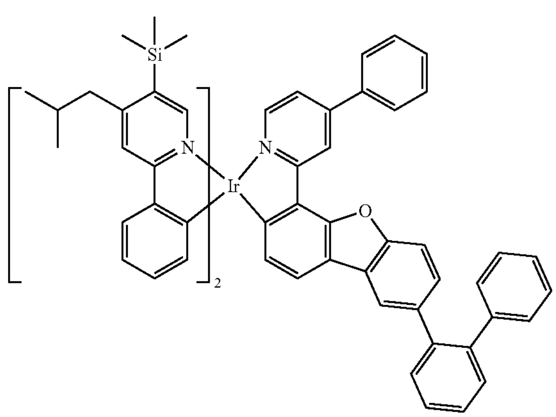
492
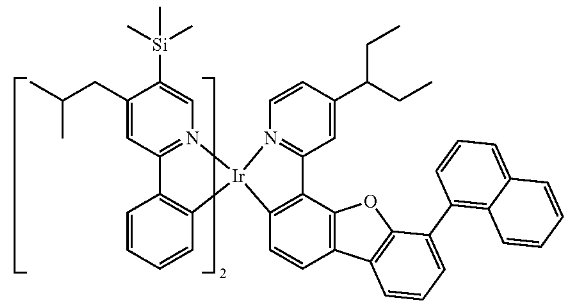
493
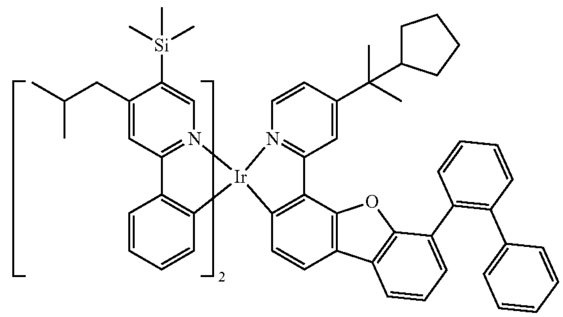
494
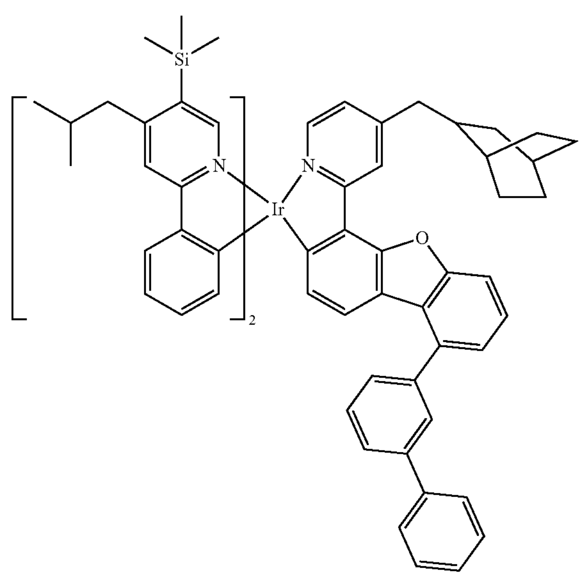

495
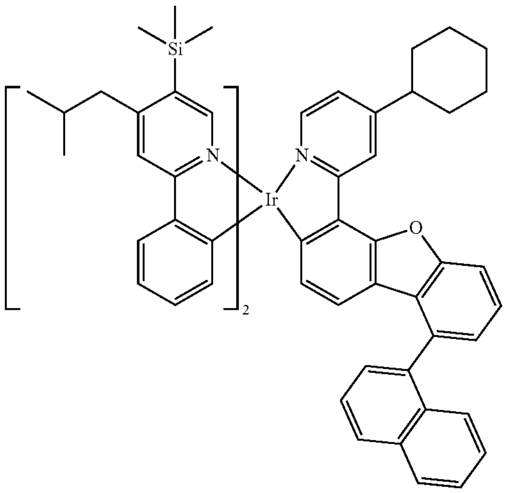
496
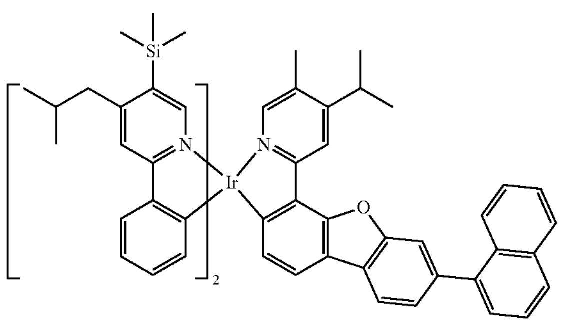
497
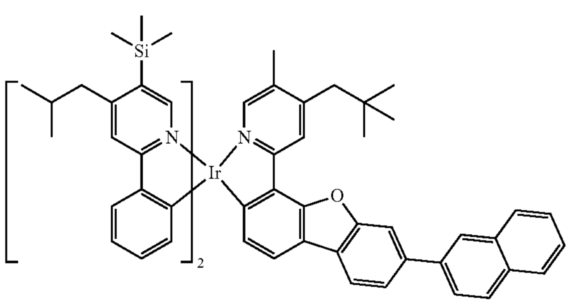
498
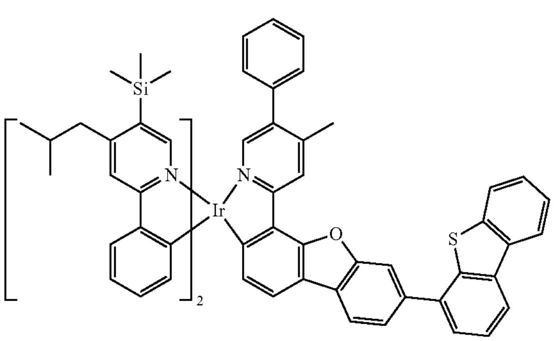
499
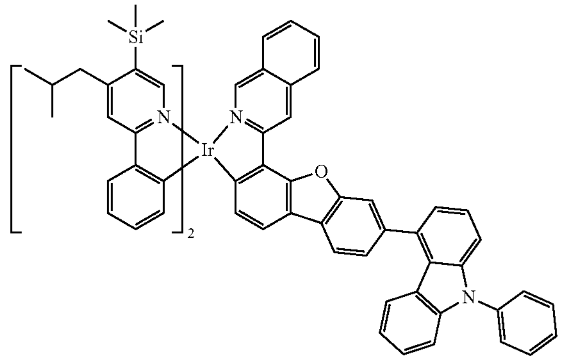
500
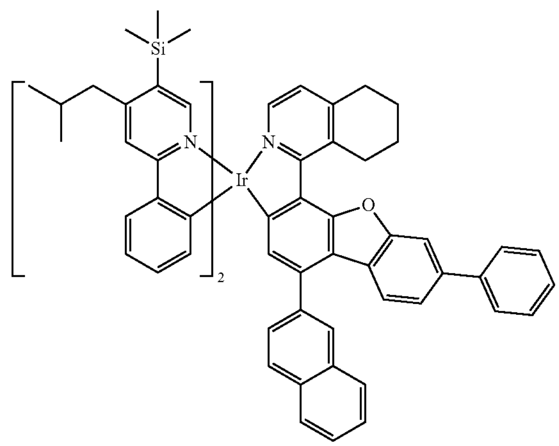
501
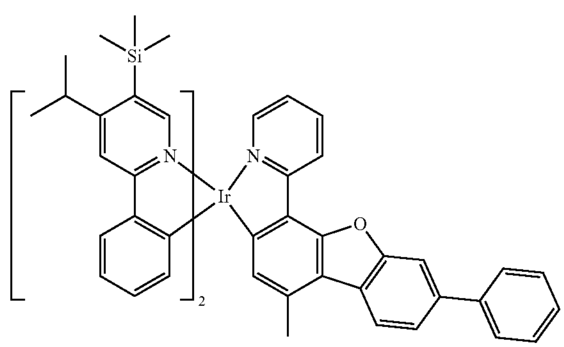
502
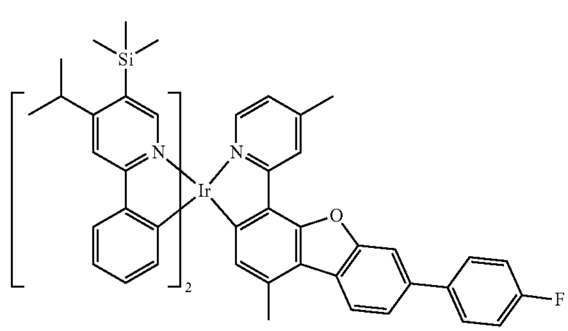

-continued
503
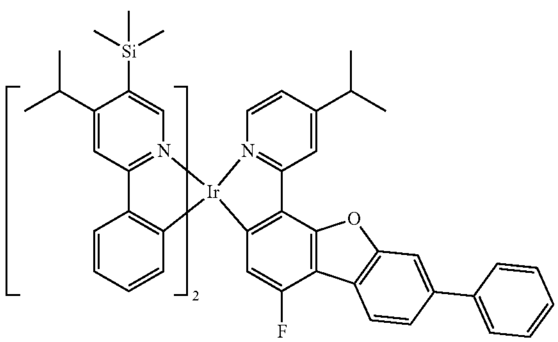
504
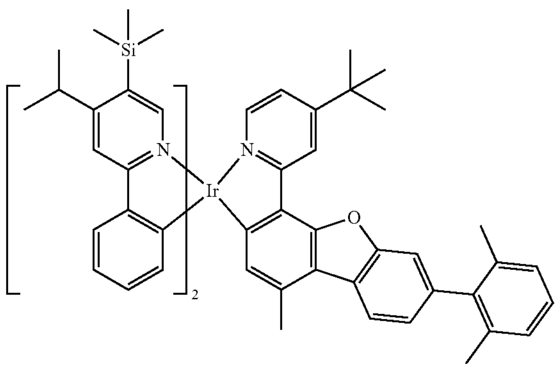
505
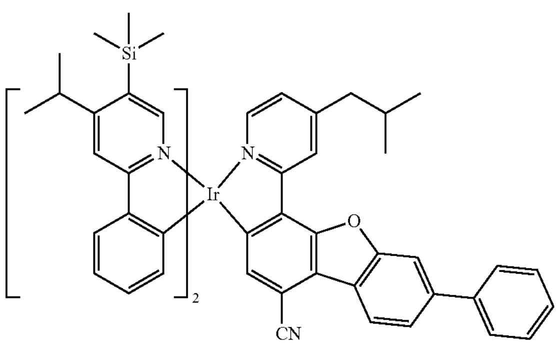
506
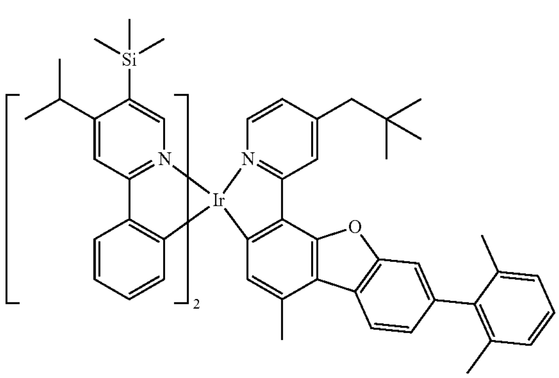
-continued
507
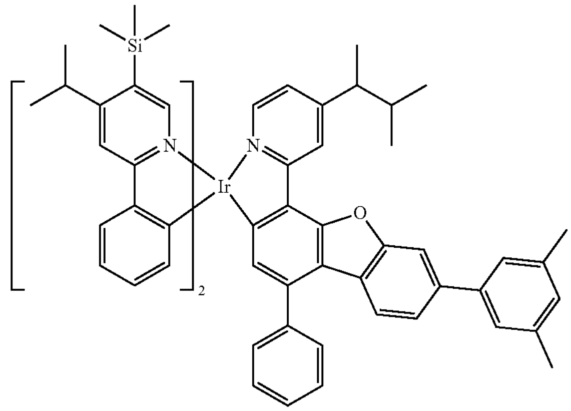
508
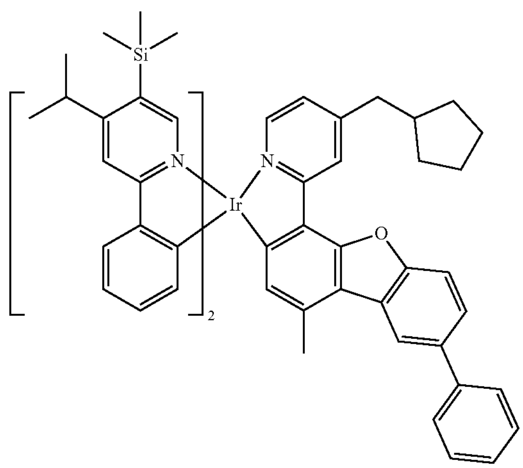
509
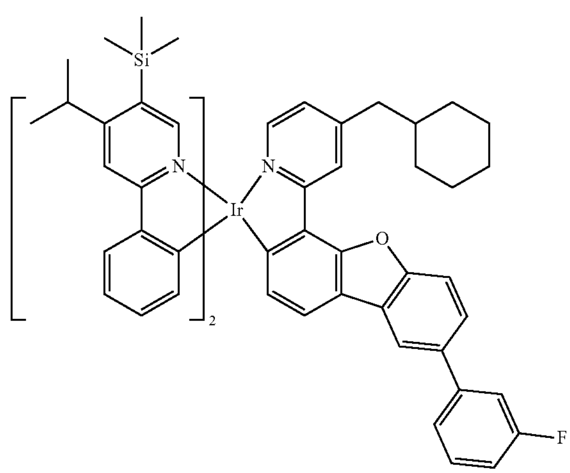

510
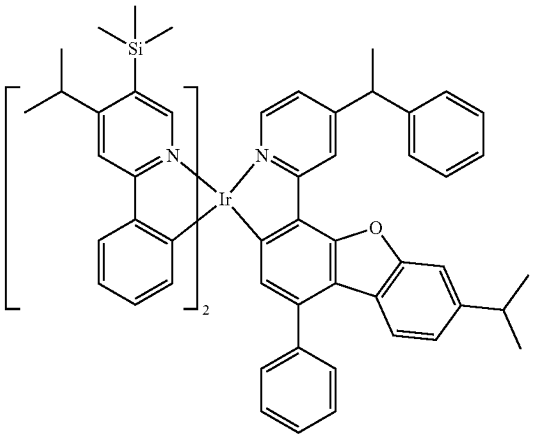
511
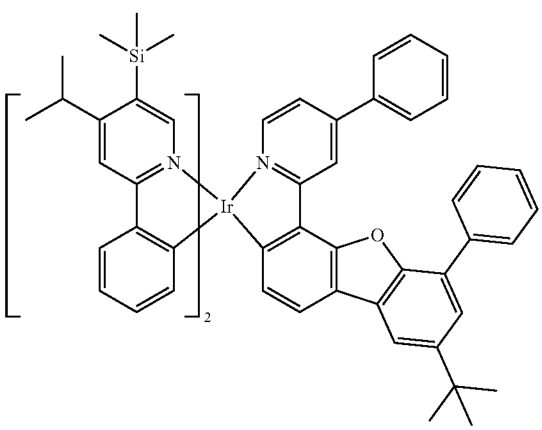
512
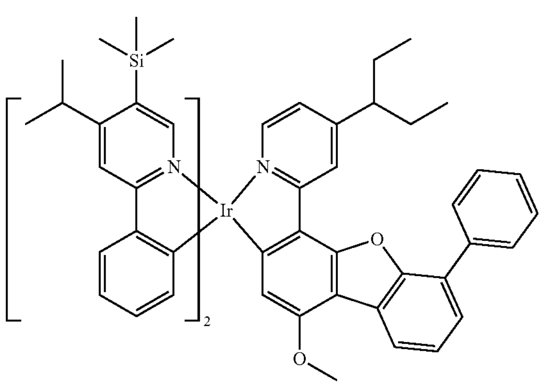
513
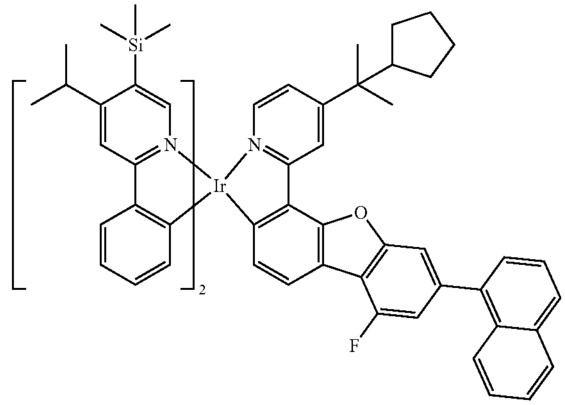
514
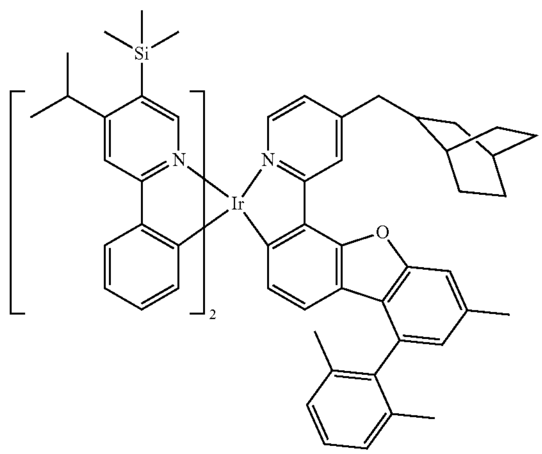
515
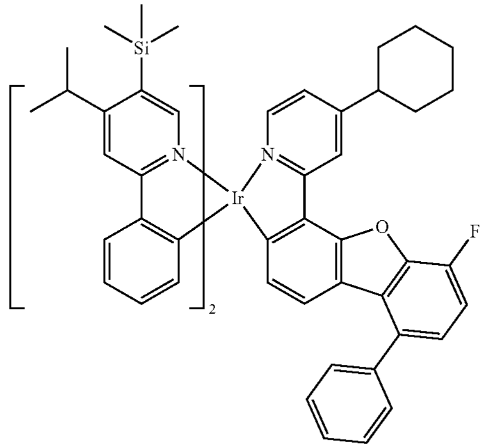

516
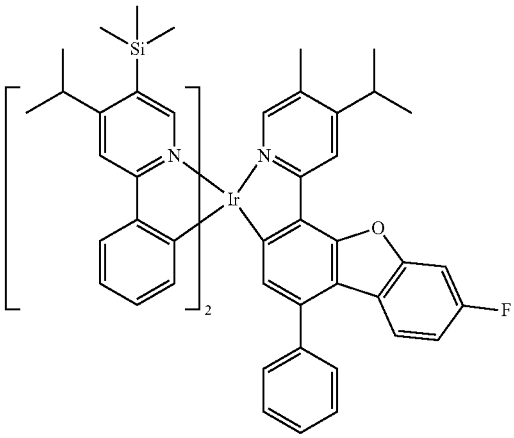
517
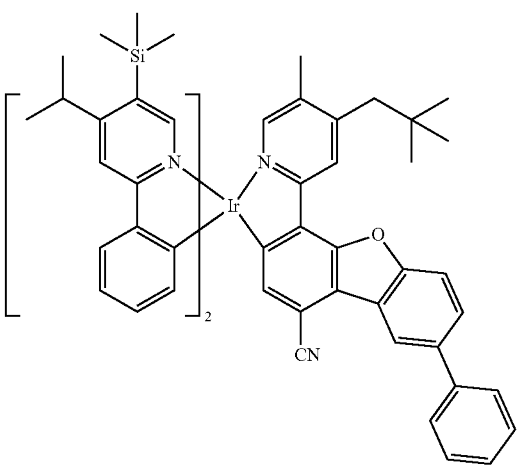
518
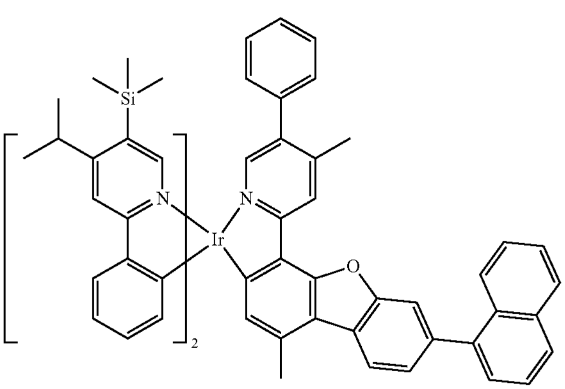
519
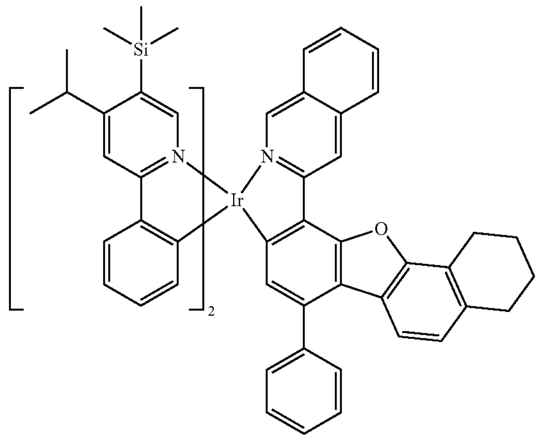
520
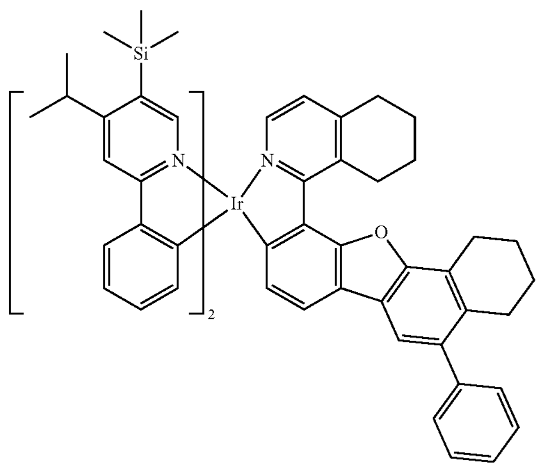
521
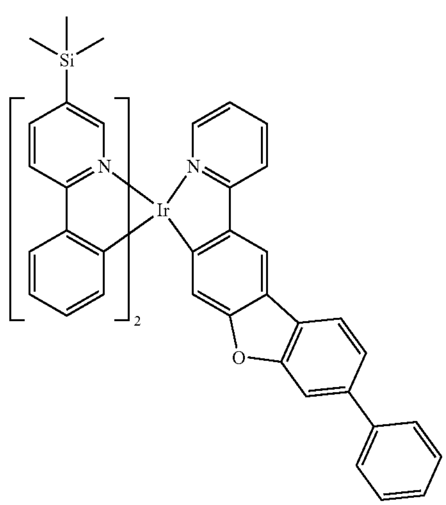

522
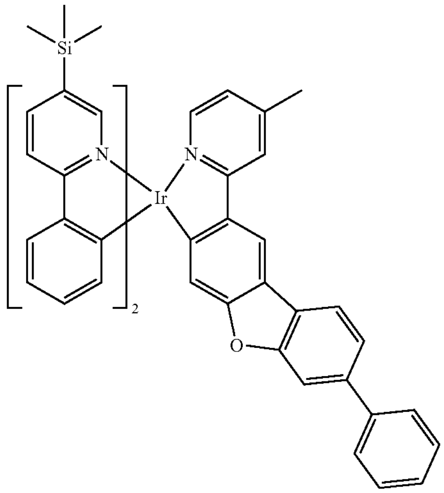
523
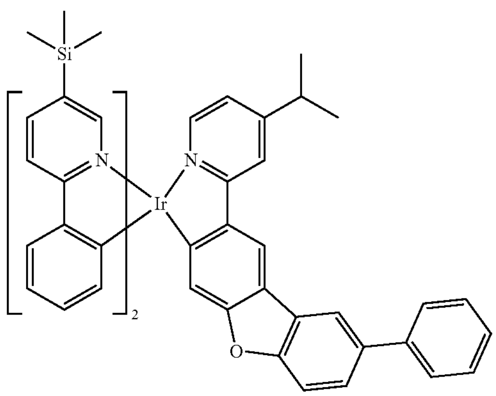
524
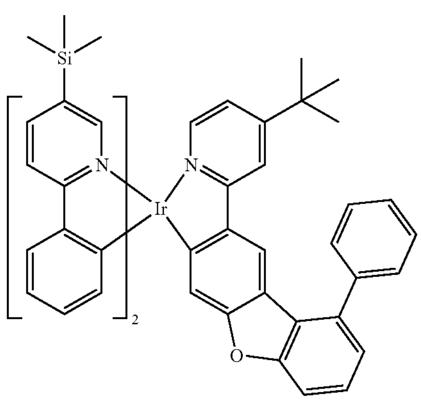
525
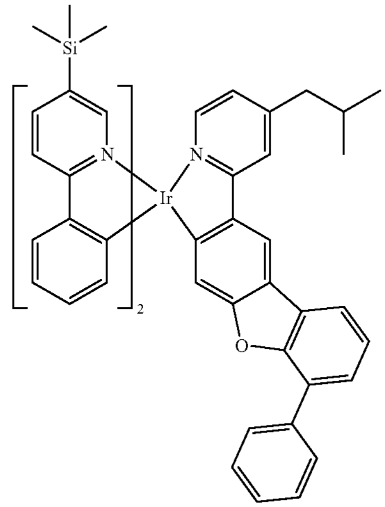
526
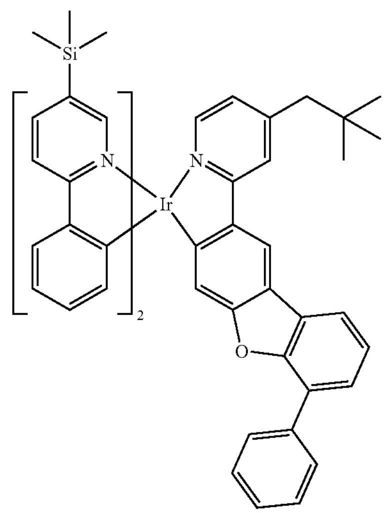
527
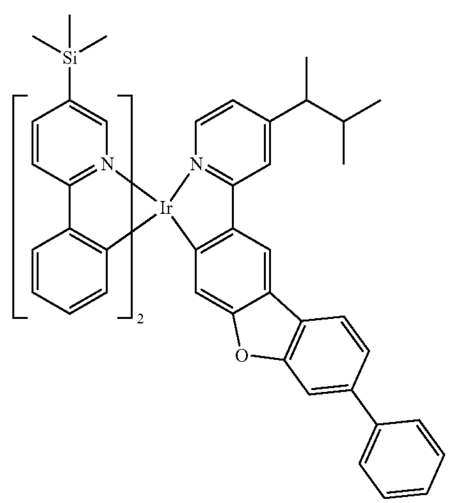

-continued
528
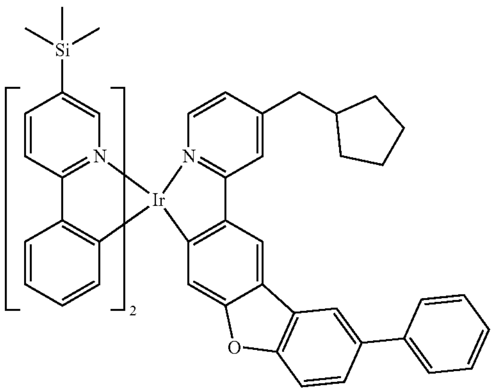
529
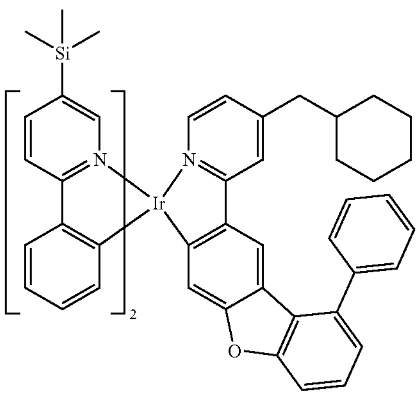
530
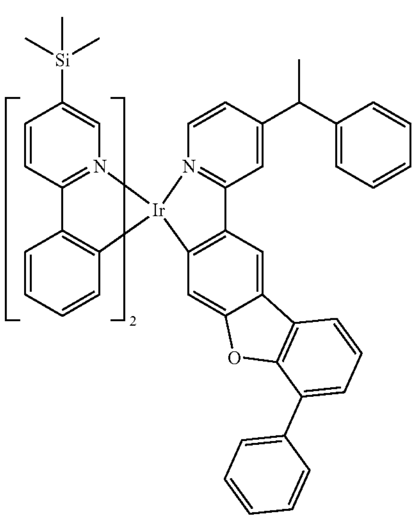
-continued
531
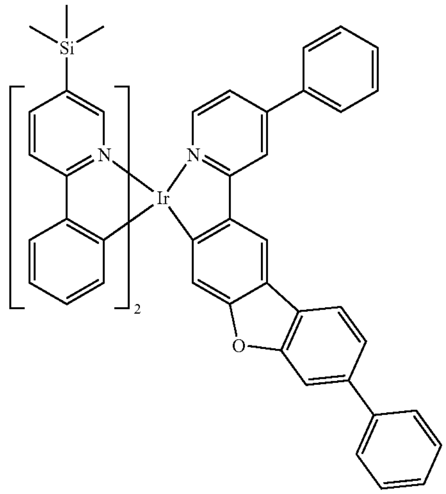
532
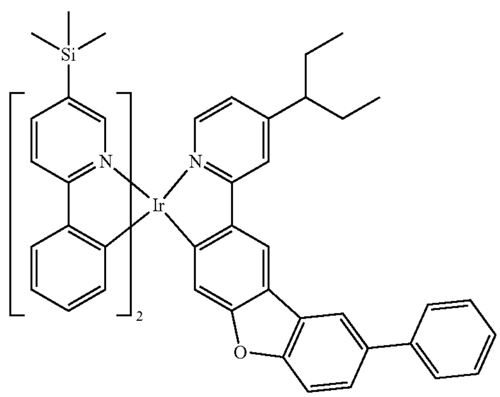
533
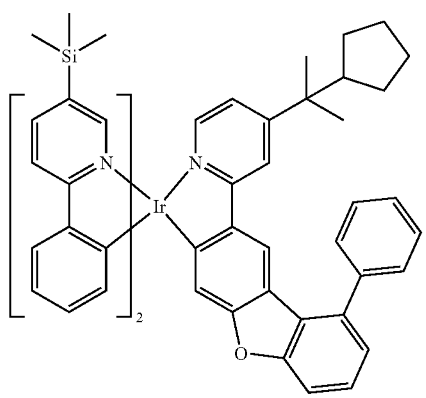

-continued
534
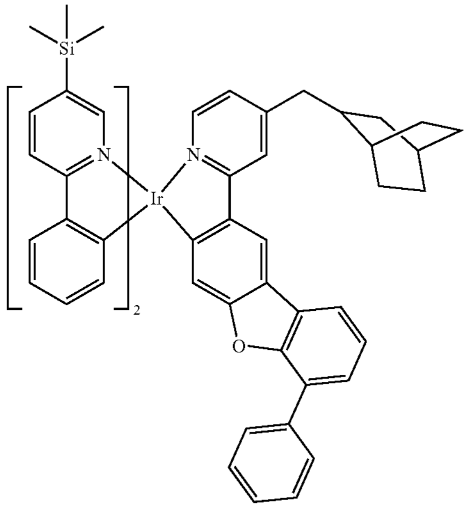
535
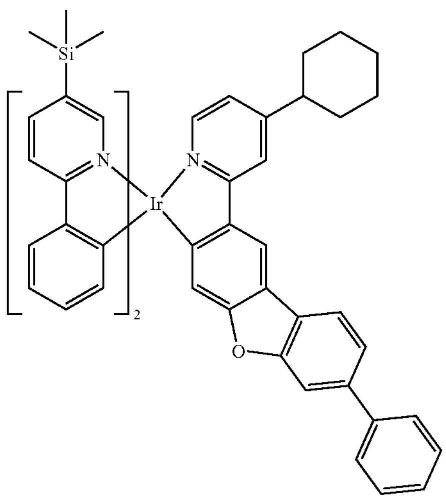
536
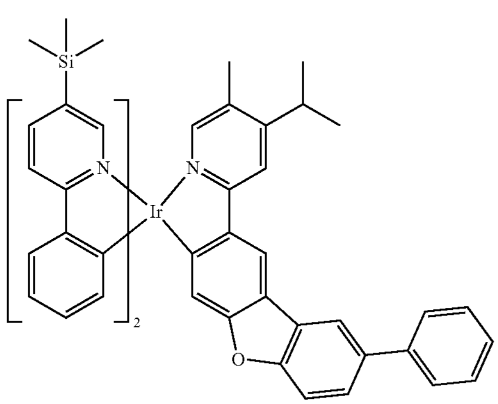
-continued
537
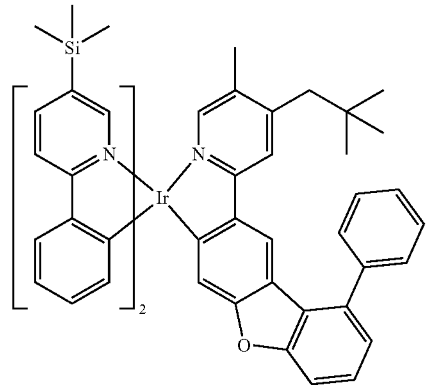
538
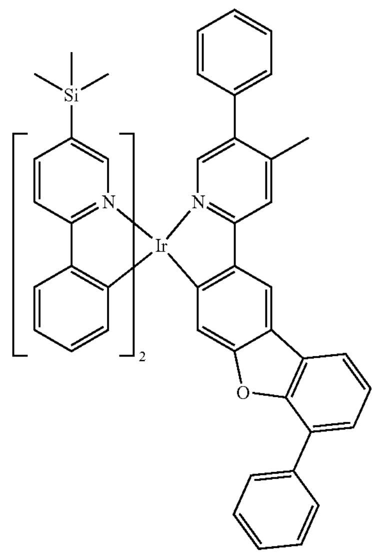
539
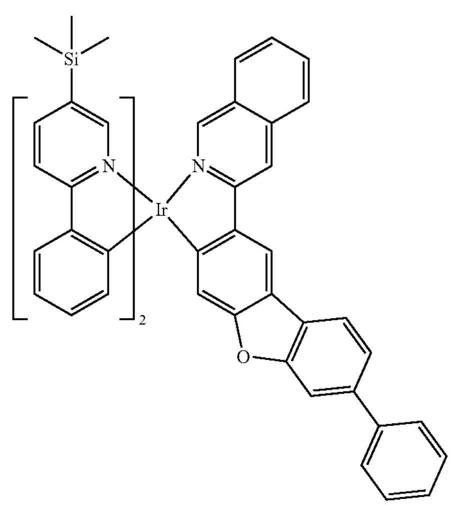

-continued
540
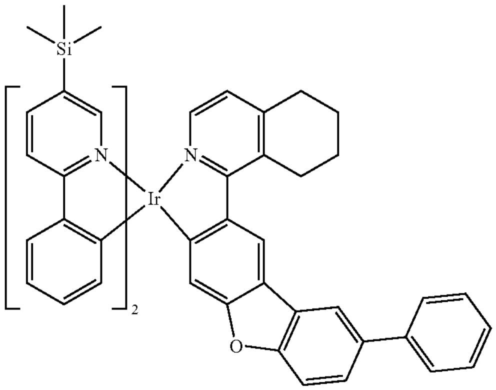
541
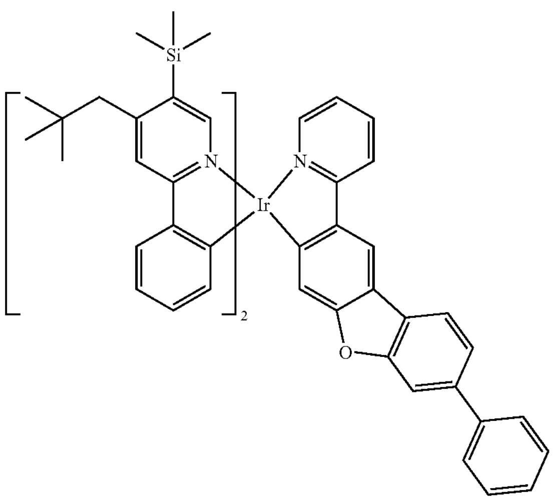
542
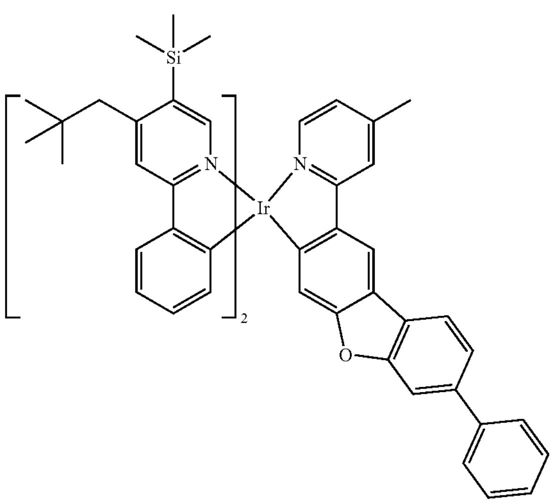
-continued
543
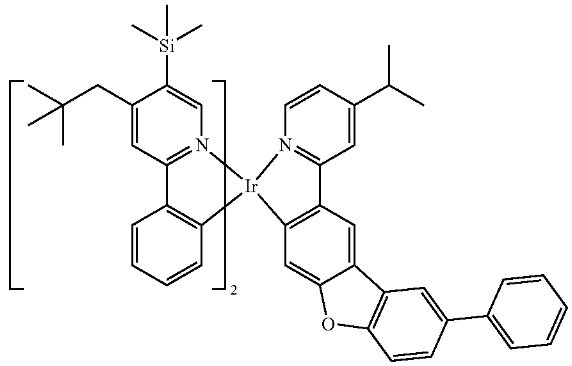
544
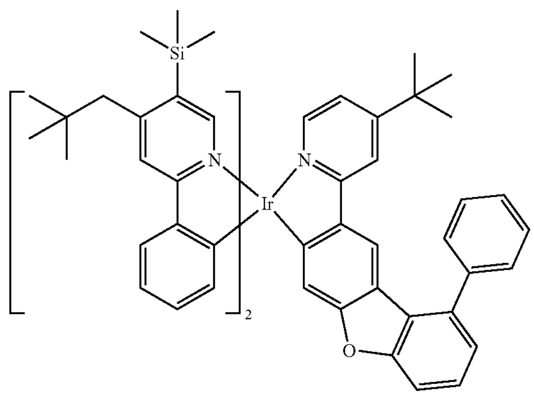
545
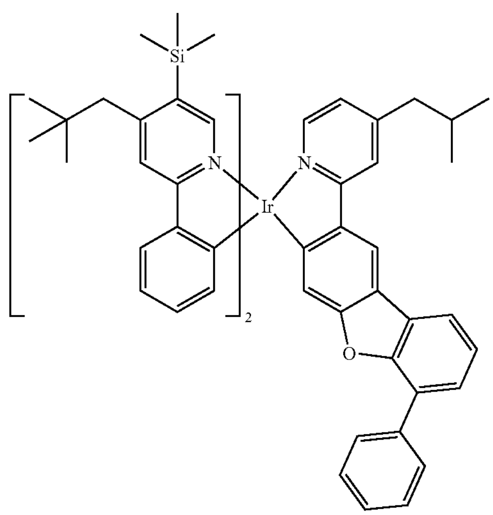

546
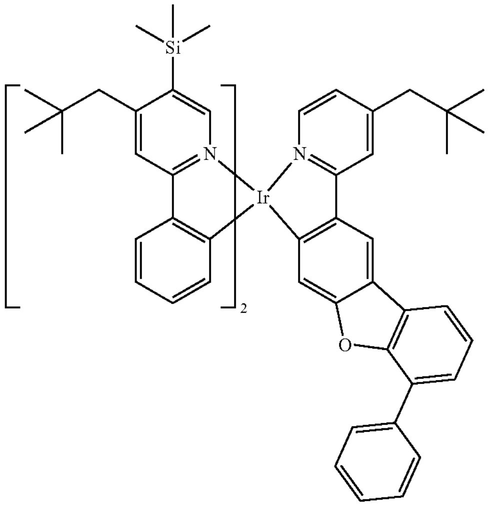
547
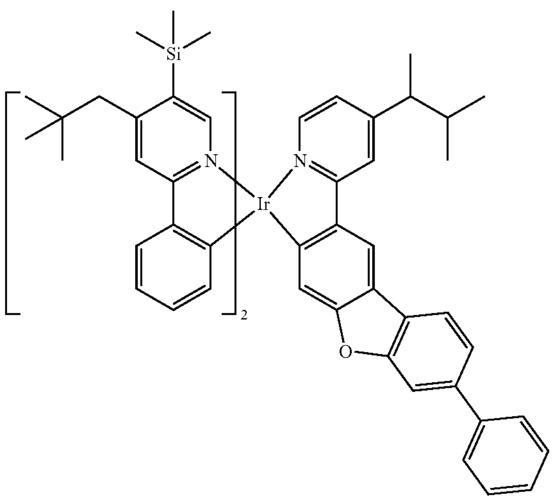
548
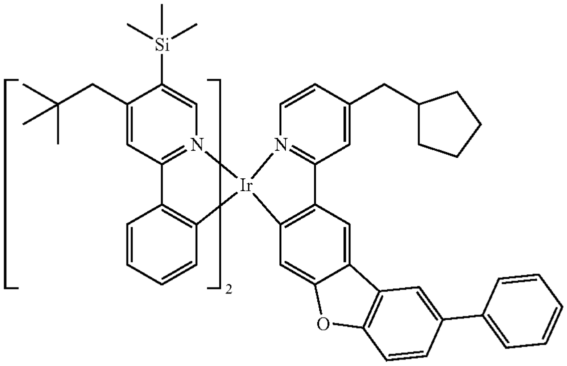
549
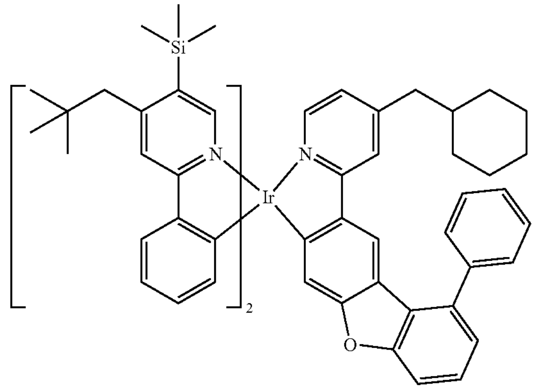
550
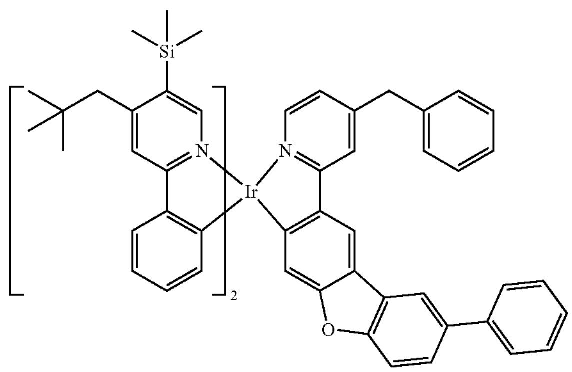
551
551
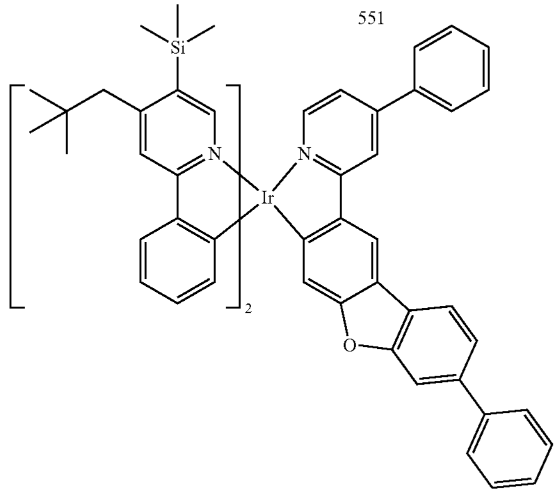

-continued
552
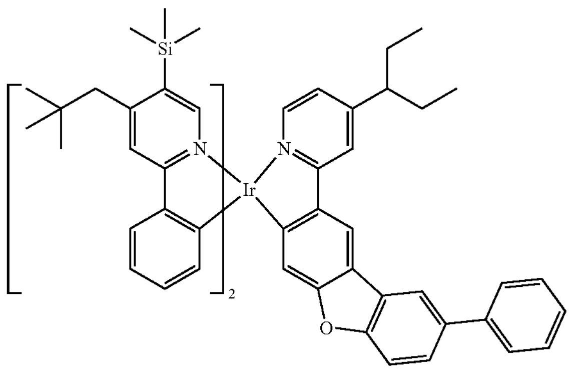
553
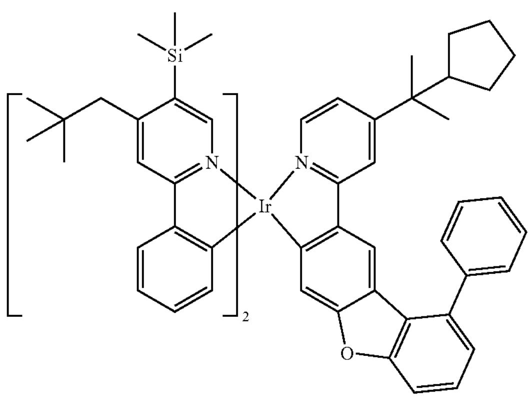
554
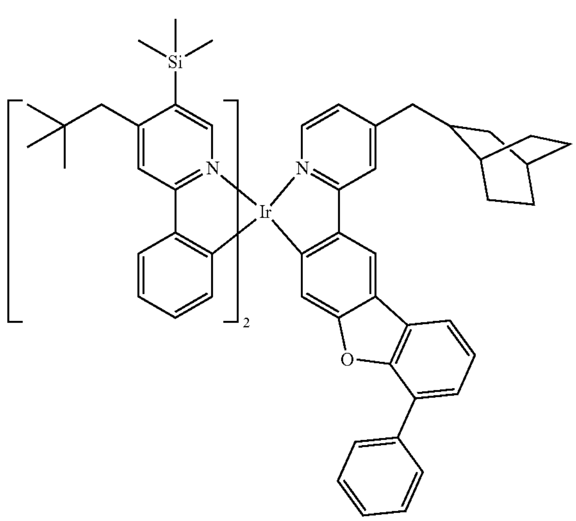
-continued
555
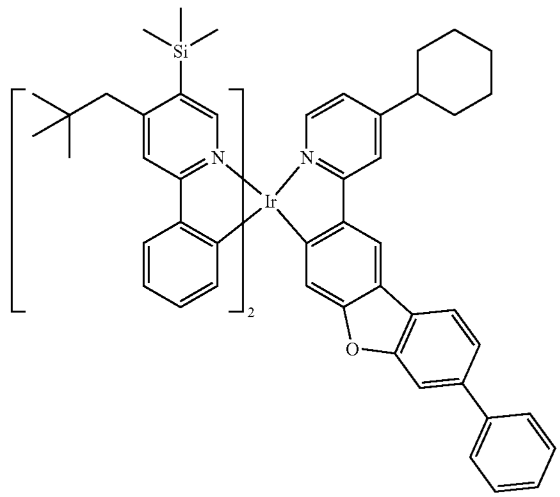
556
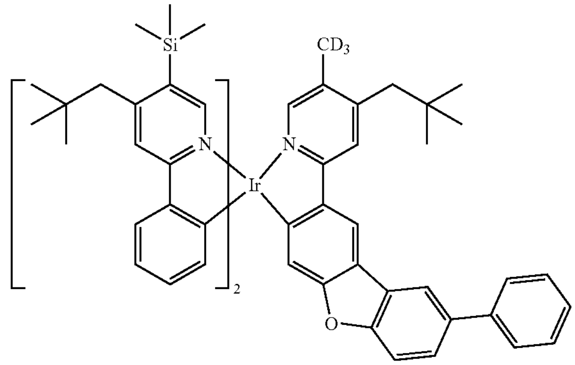
557
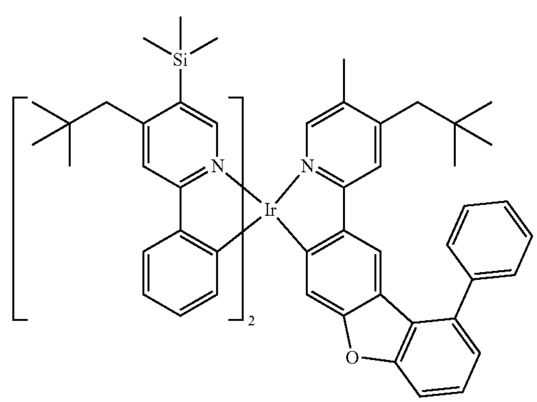

-continued
558
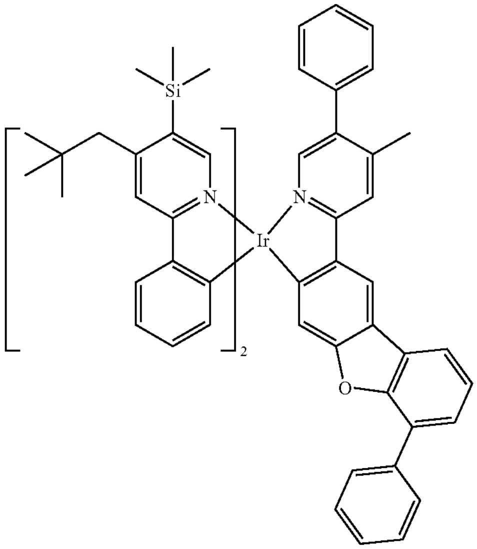
561
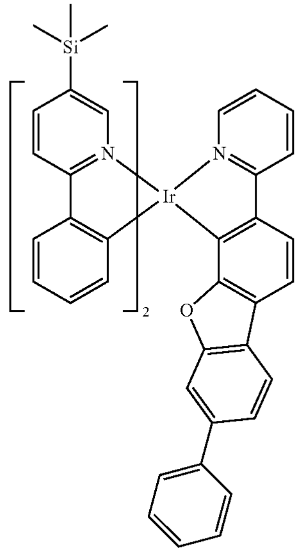
559
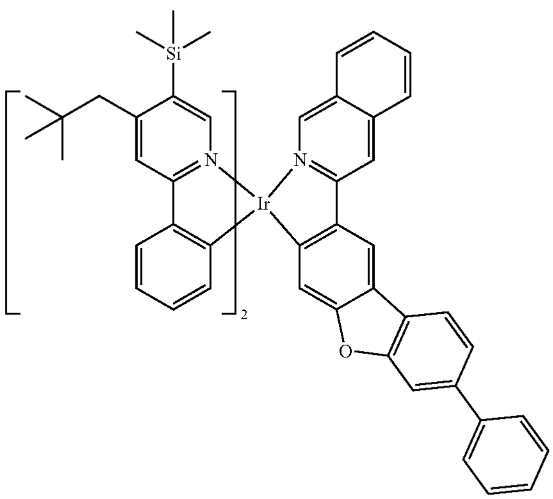
562
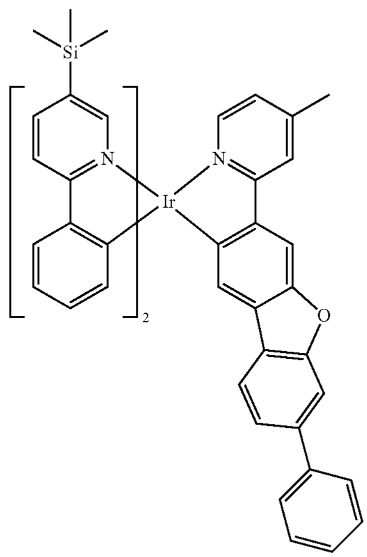
560
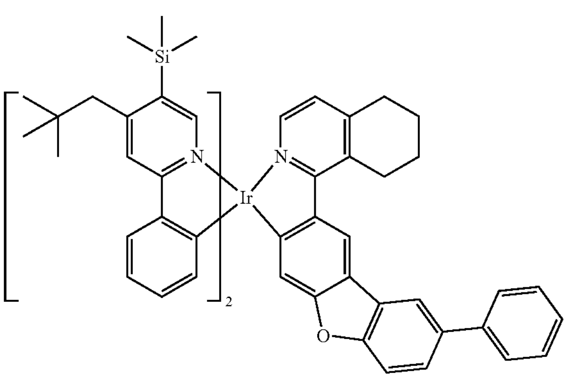
563
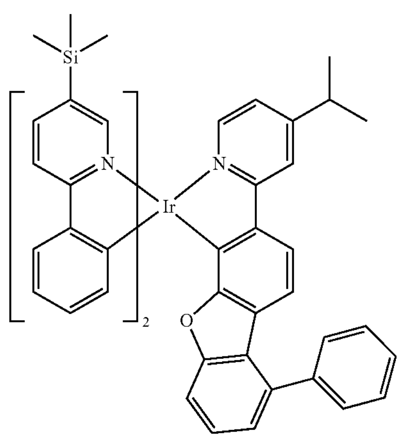

-continued
564
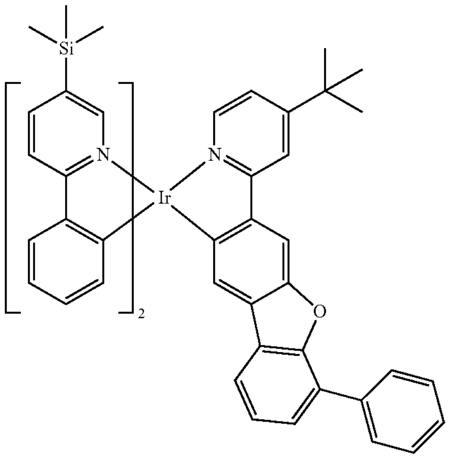
565
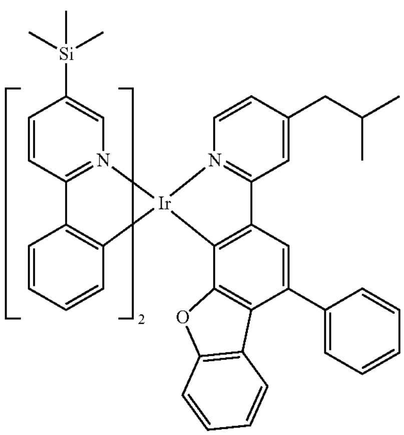
566
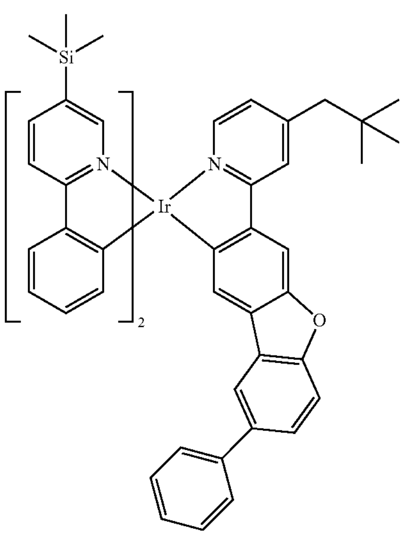
-continued
567
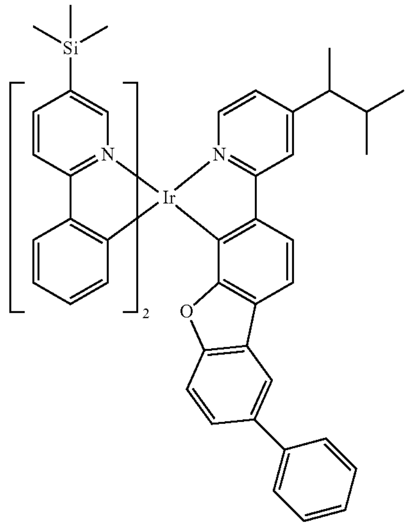
568
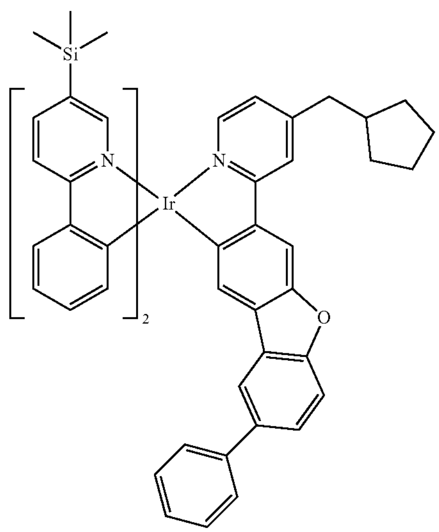
569
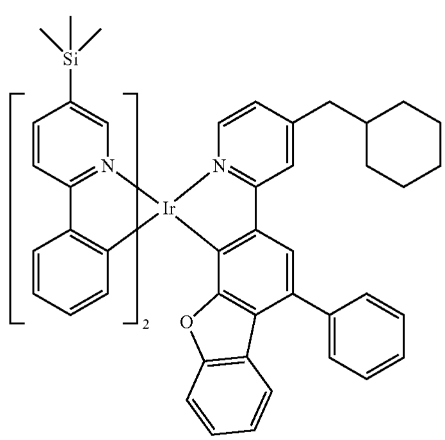

-continued
570
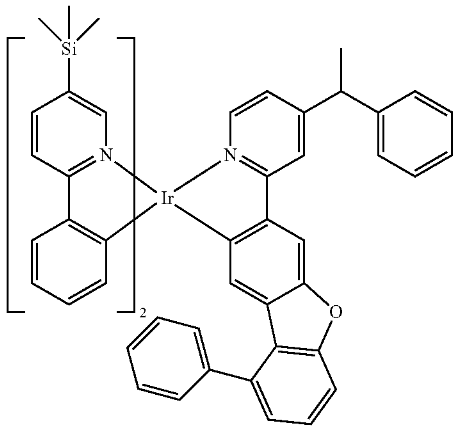
571
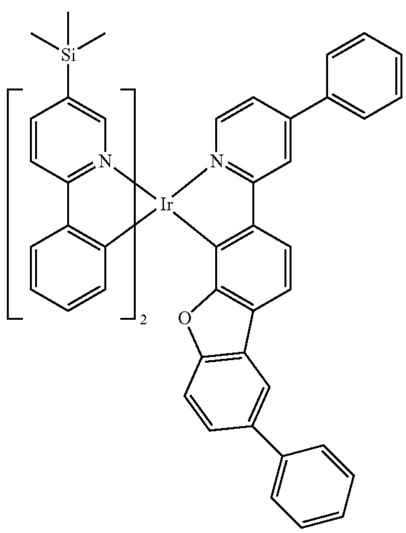
572
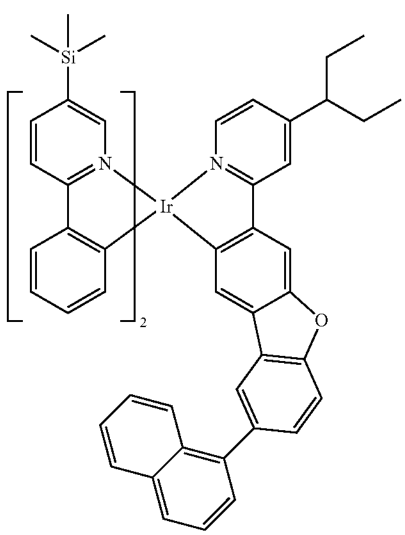
-continued
573
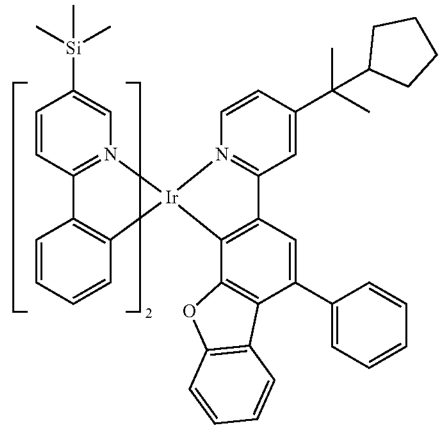
574
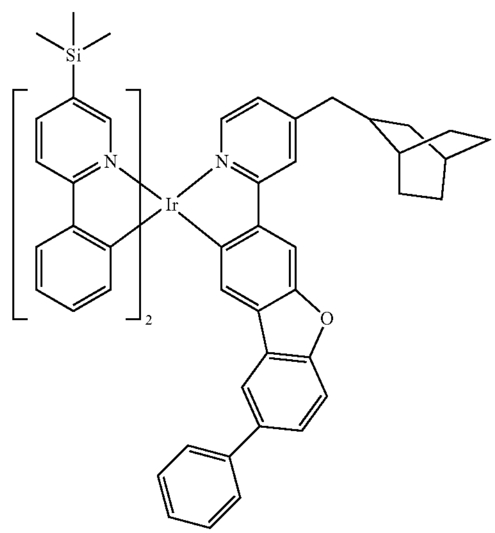
575
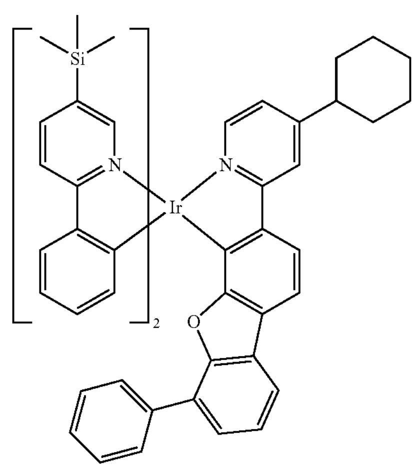

-continued
576
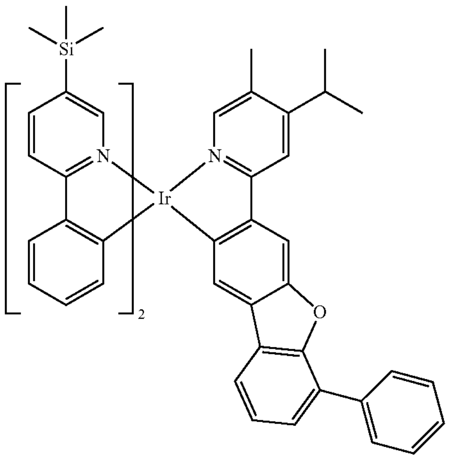
577
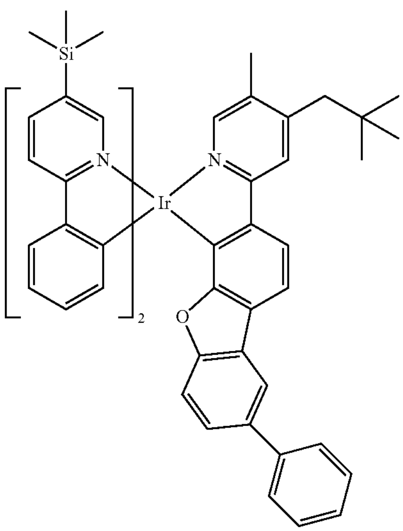
578
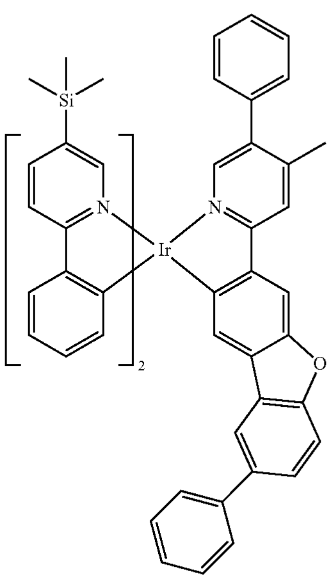
-continued
579
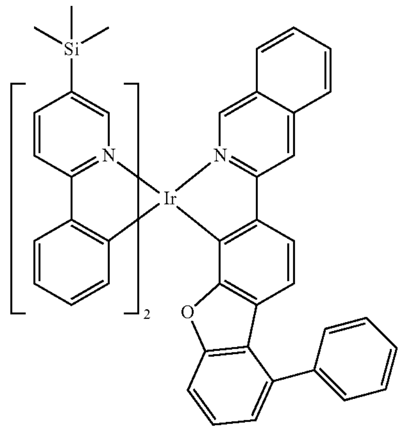
580
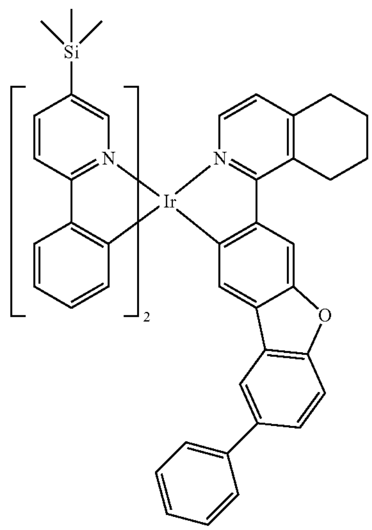
581
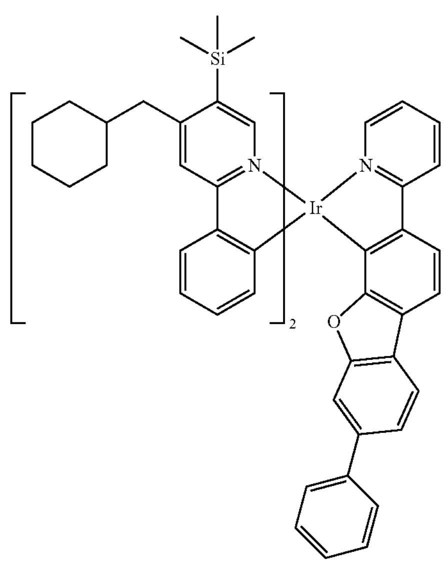

582
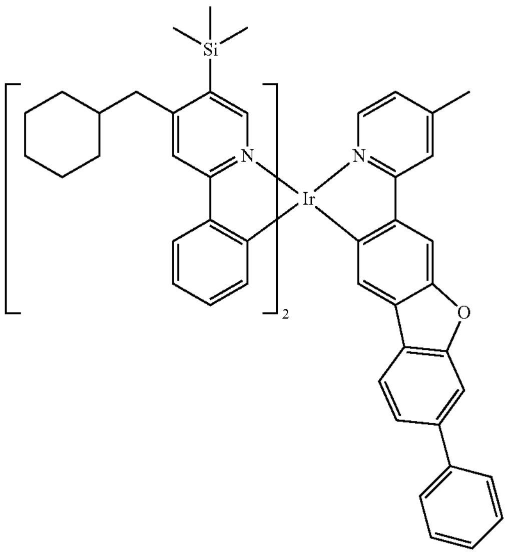
583
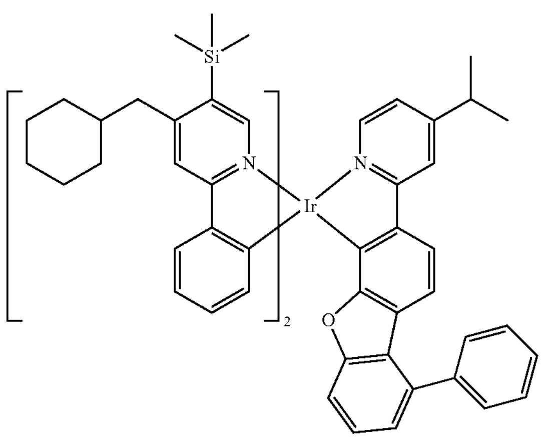
584
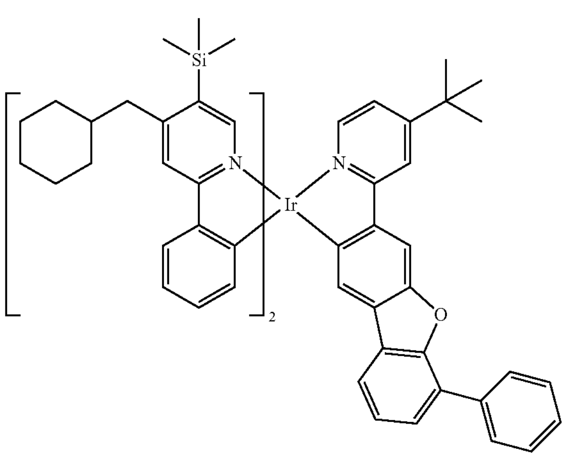
585
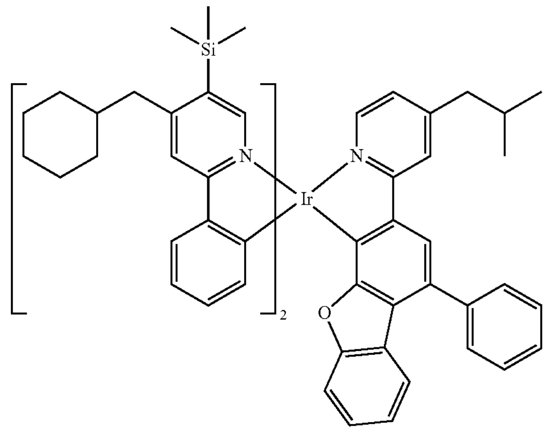
586
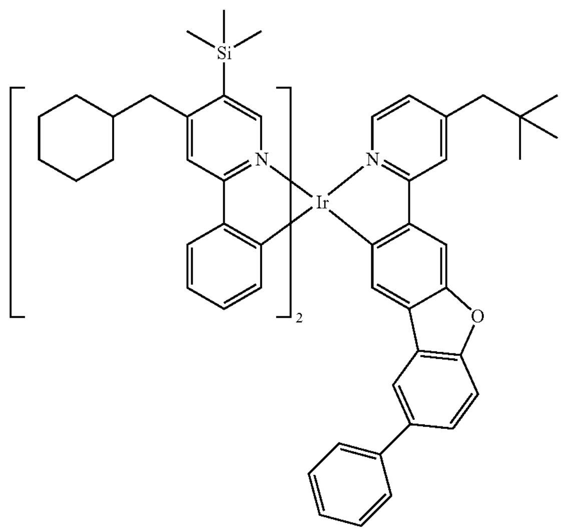
587
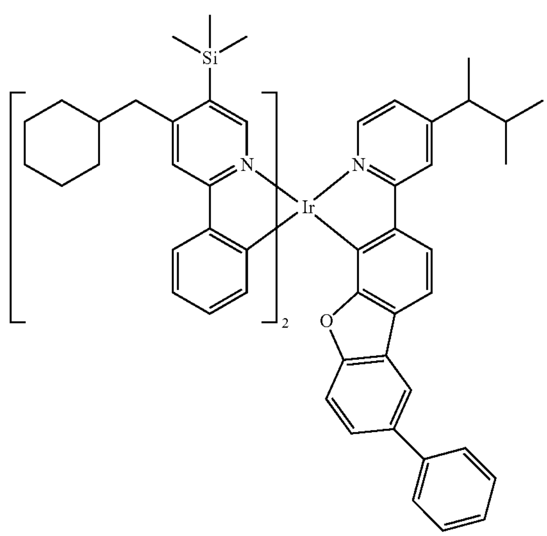

-continued
588
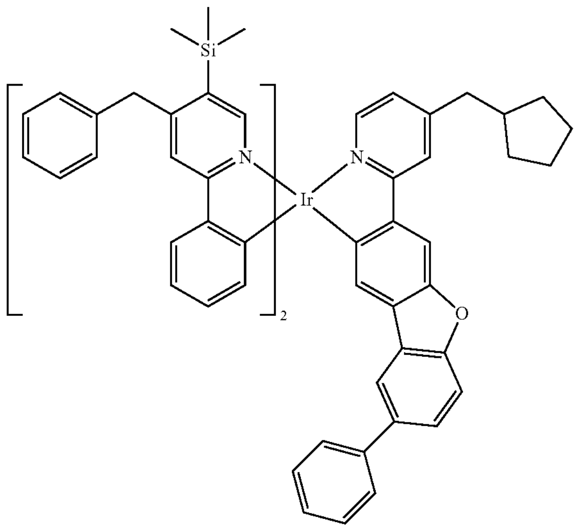
589
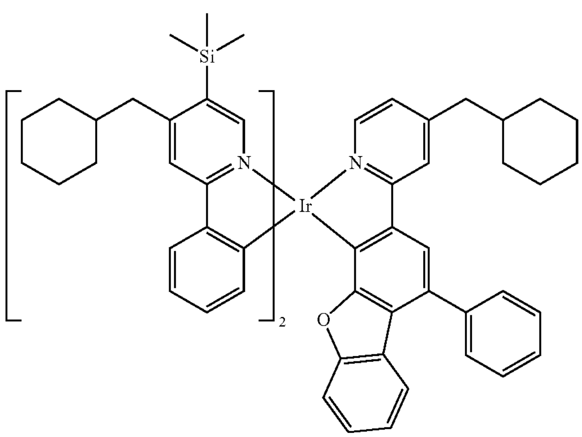
590
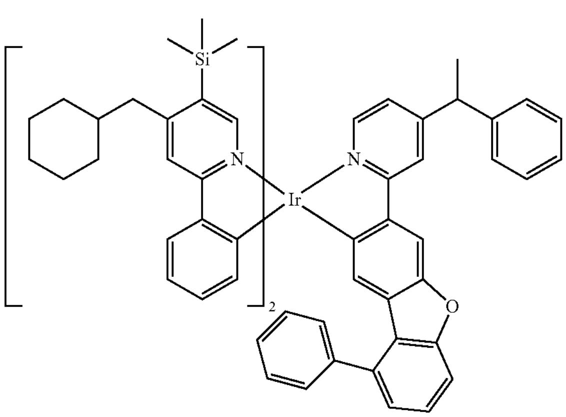
-continued
591
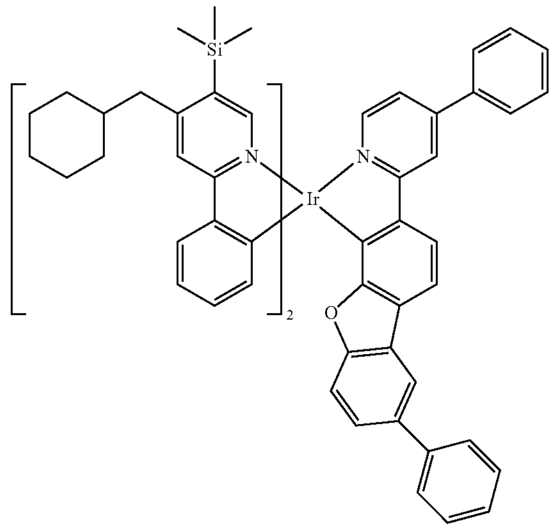
592
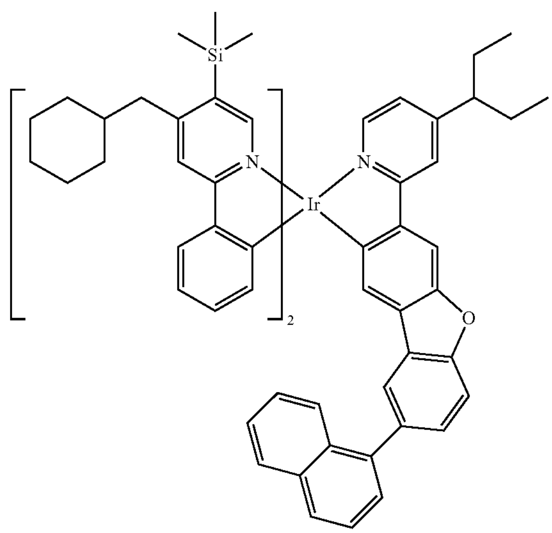
593
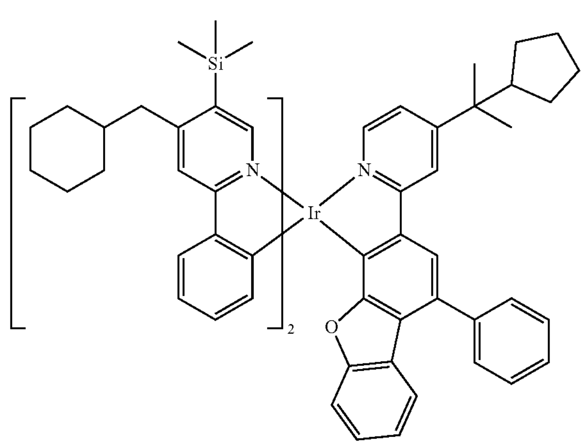

594
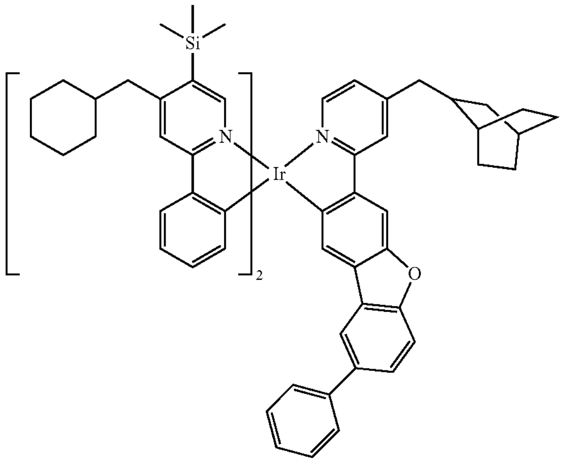
595
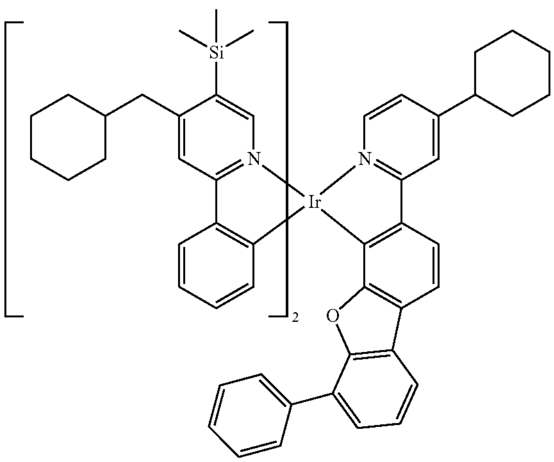
596
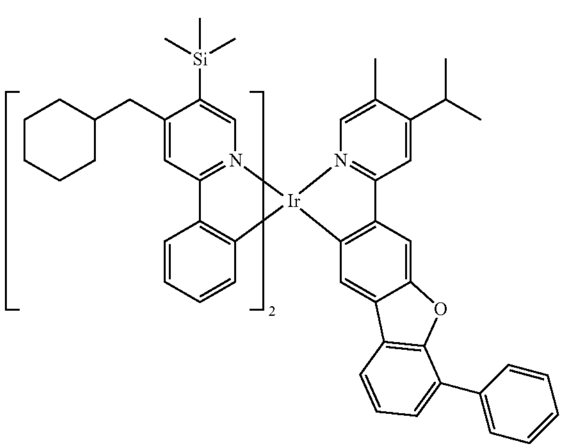
597
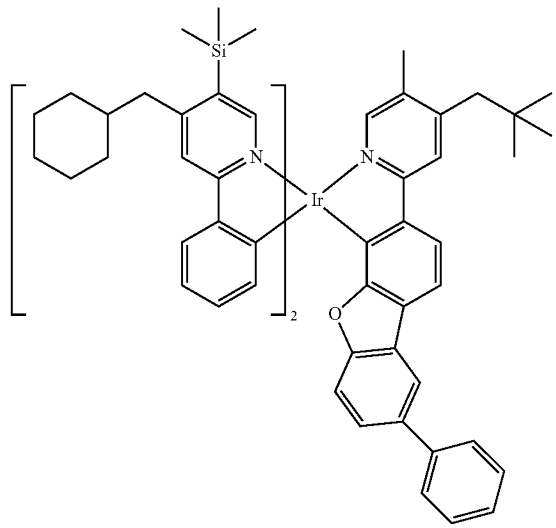
598
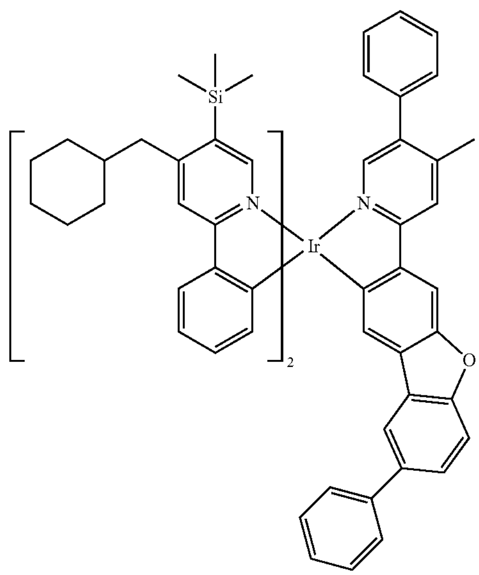
599
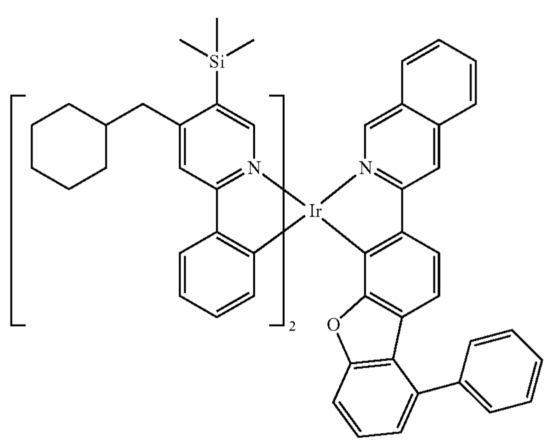

-continued
600
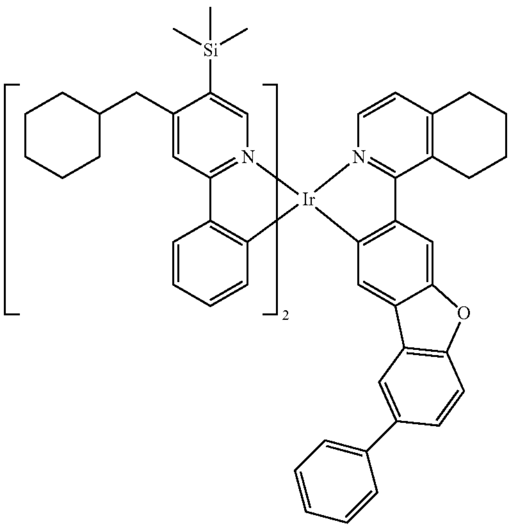
601
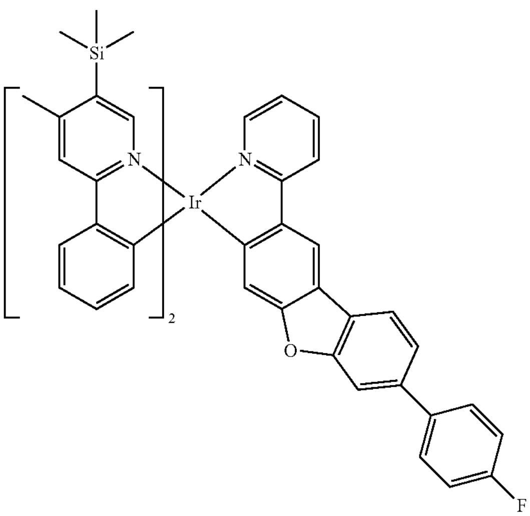
602
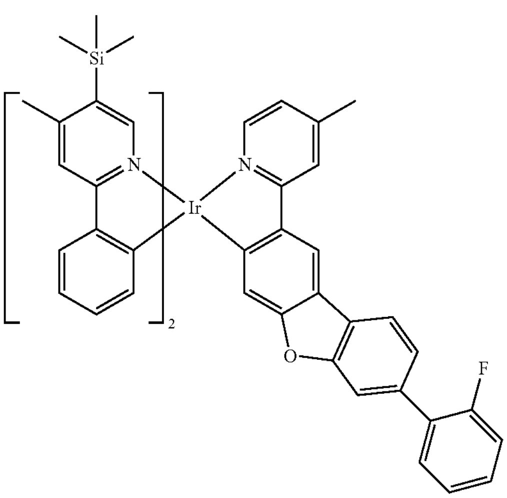
-continued
603
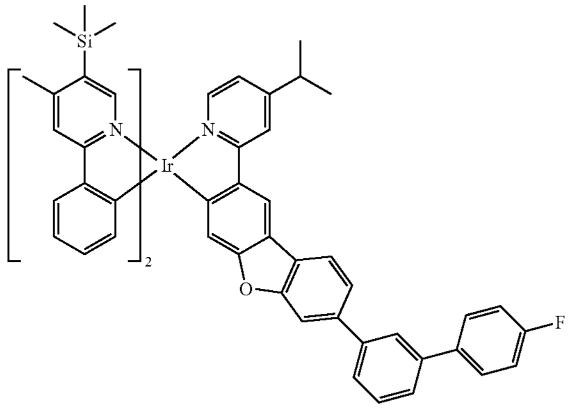
604
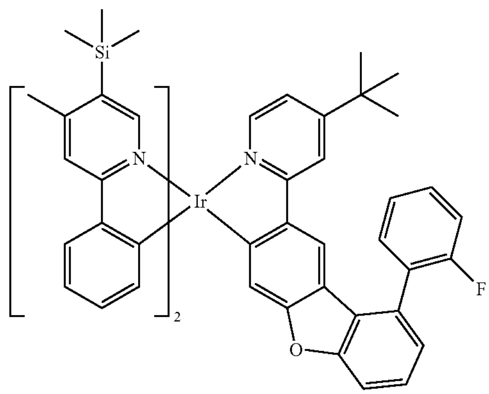
605
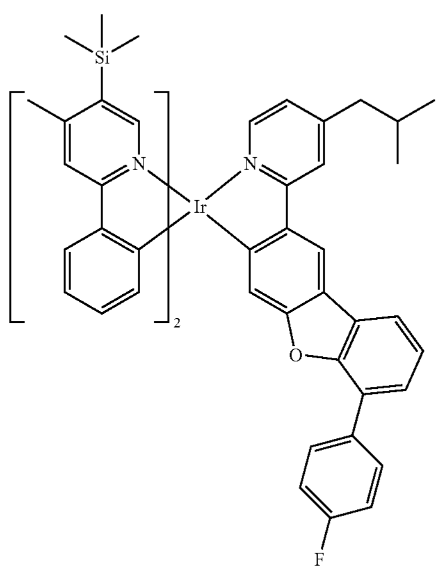

-continued
606
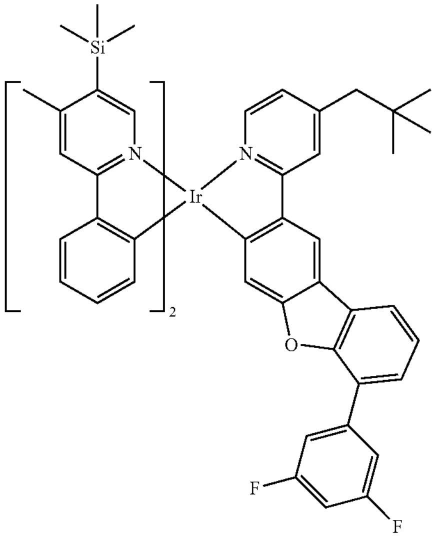
607
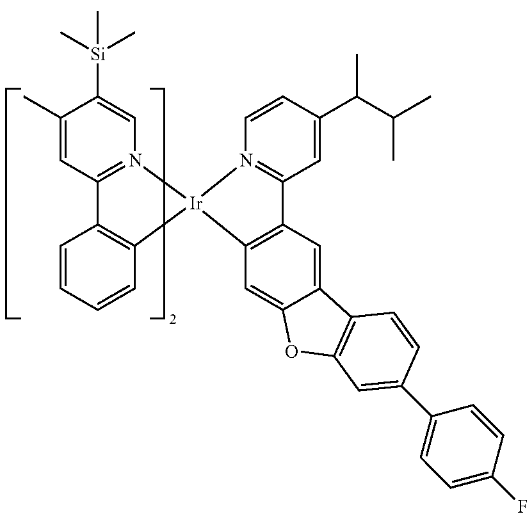
608
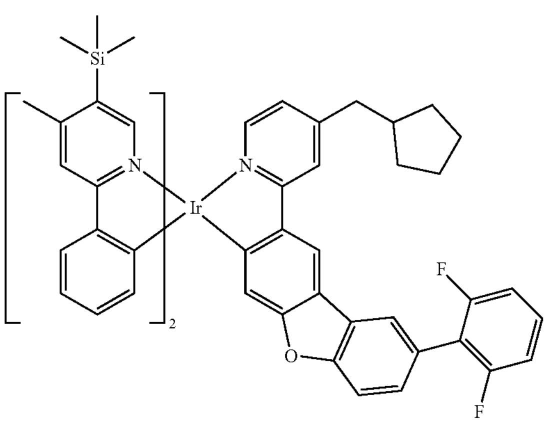
-continued
609
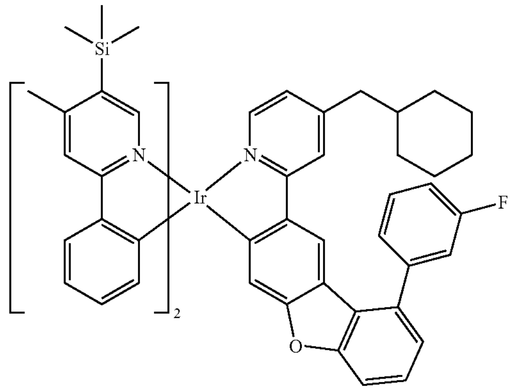
610
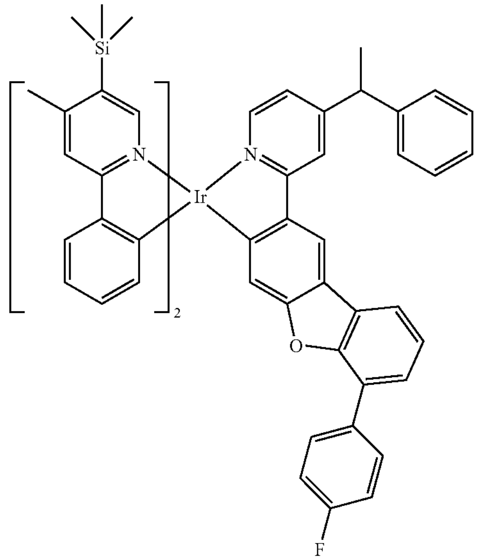
611
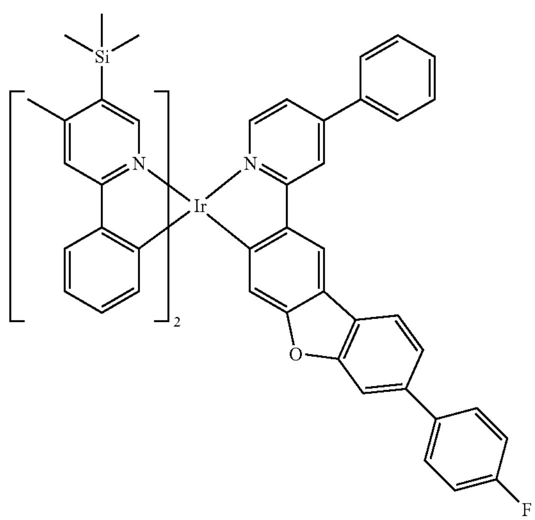

612
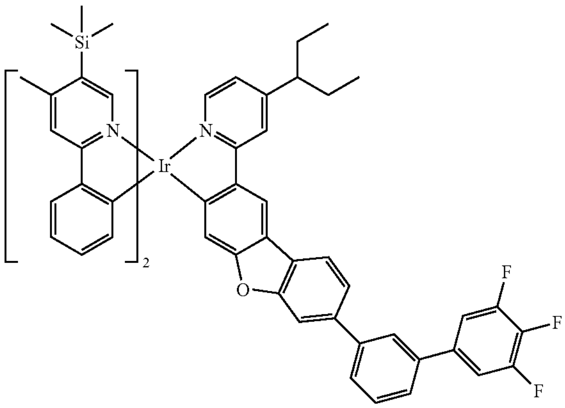
613
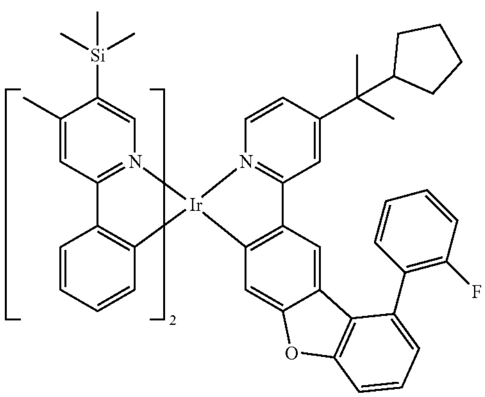
614
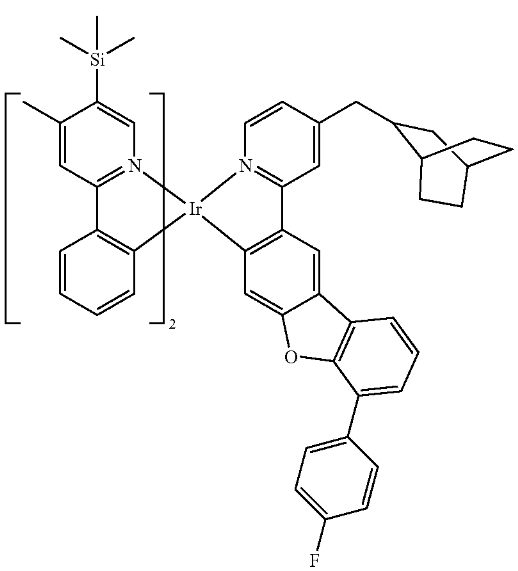
615
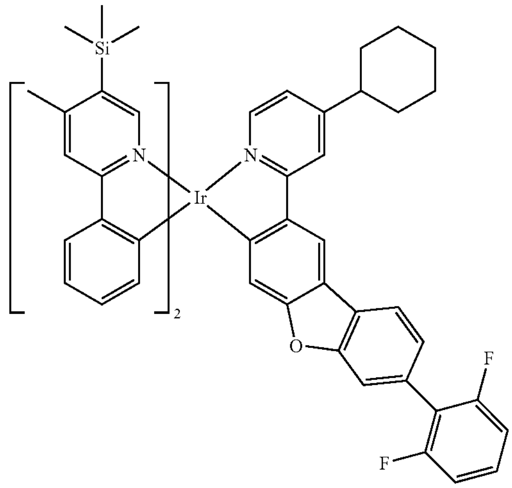
616
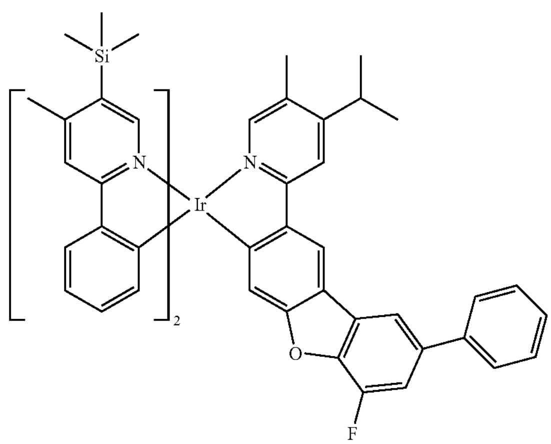
617
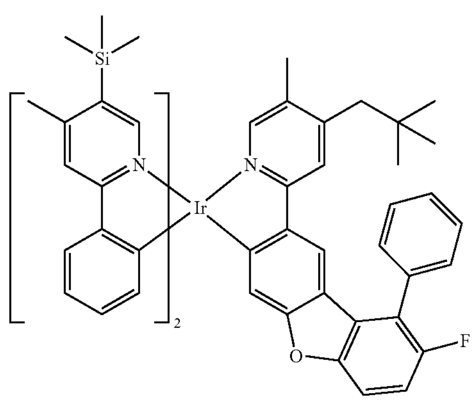

-continued
618
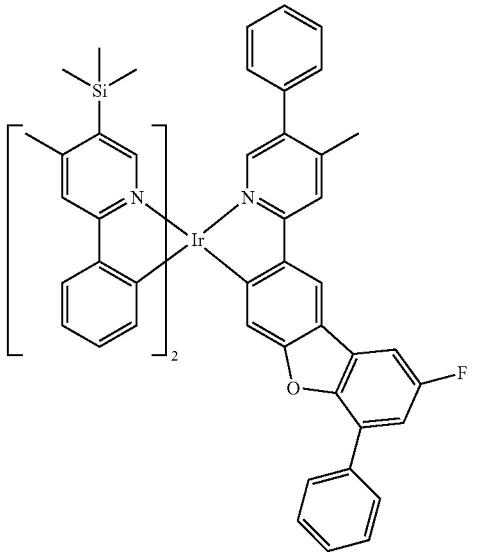
619
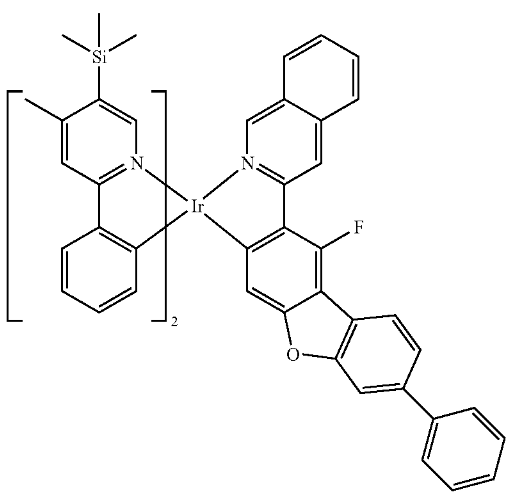
620
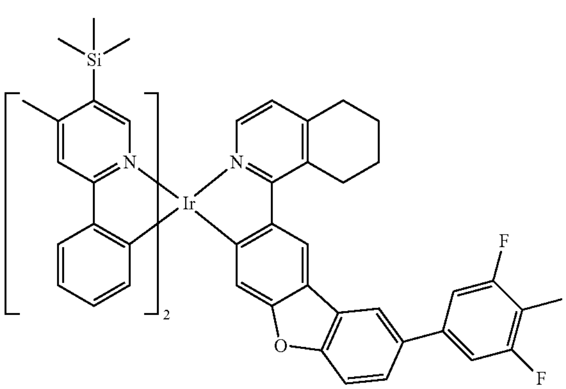
-continued
621
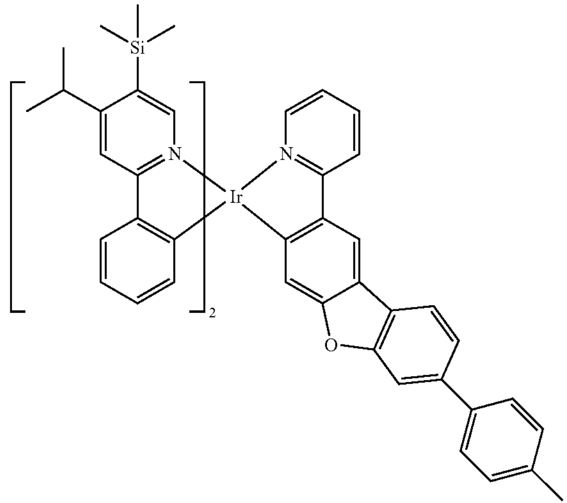
622
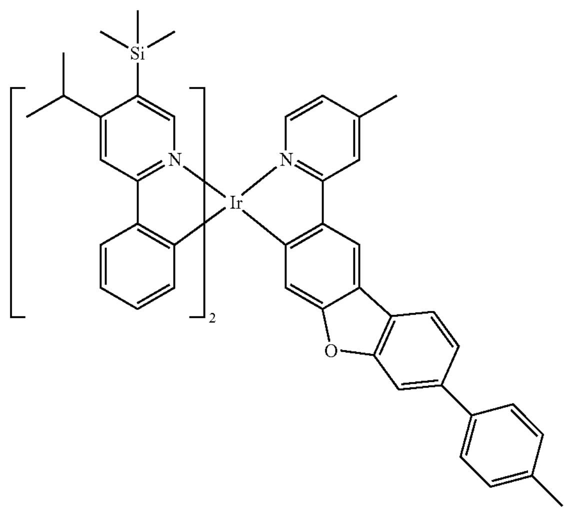
623
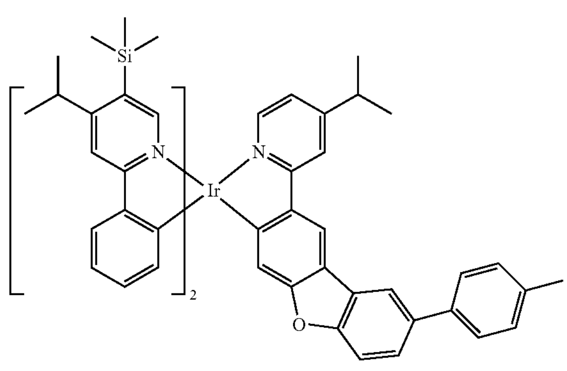

-continued
624
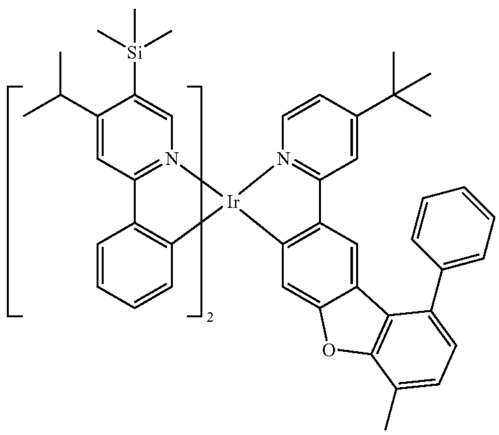
625
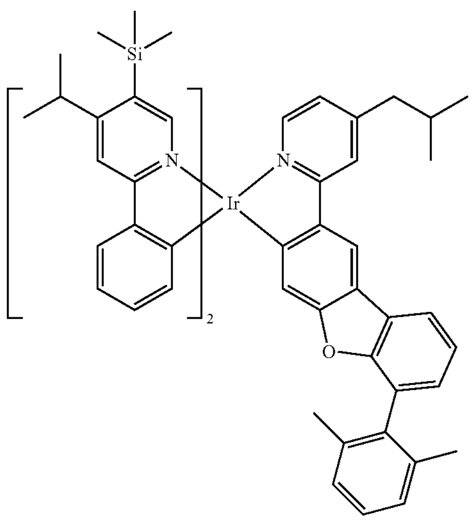
626
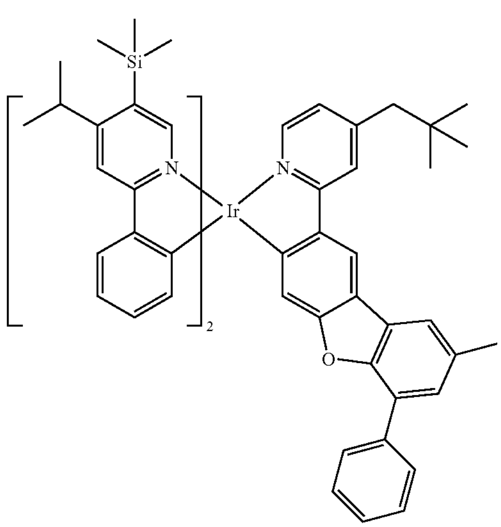
-continued
627
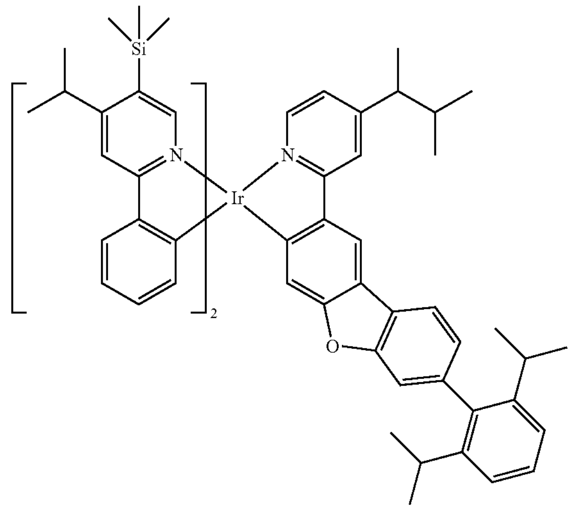
628
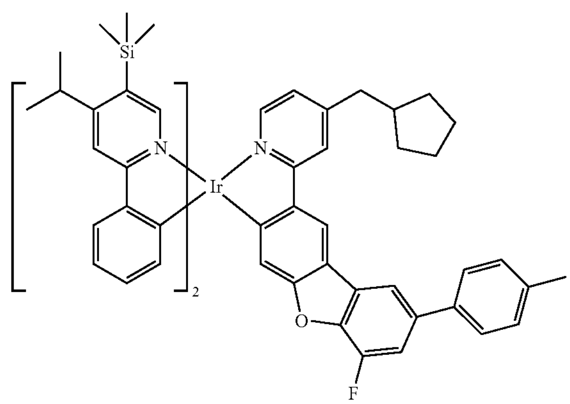
629
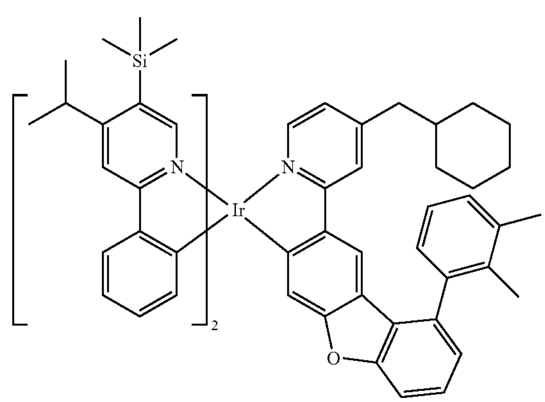

-continued
630
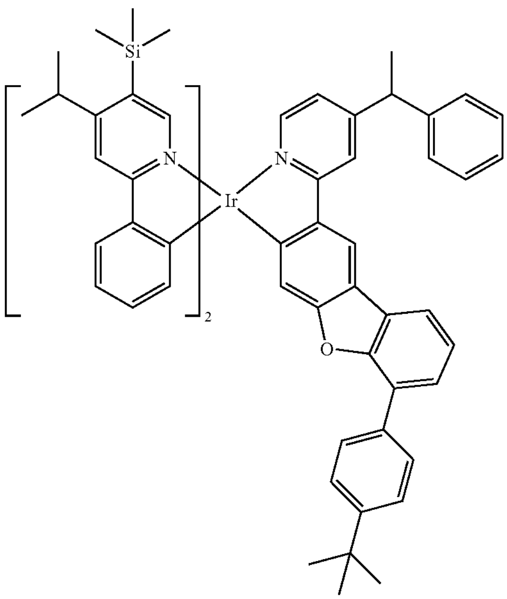
631
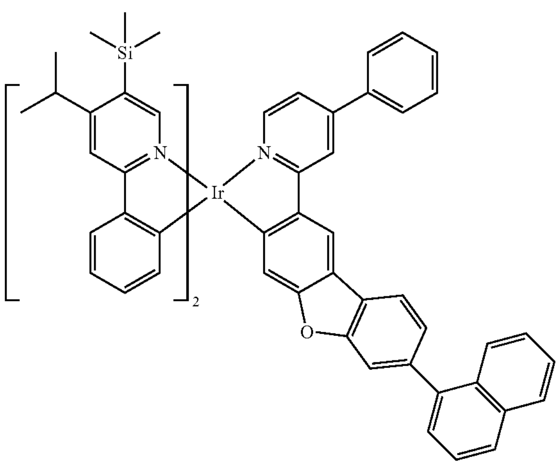
632
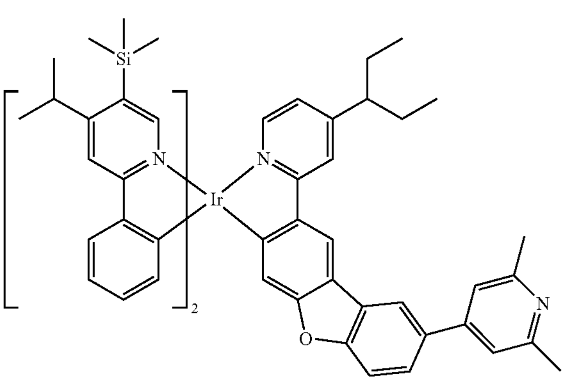
-continued
633
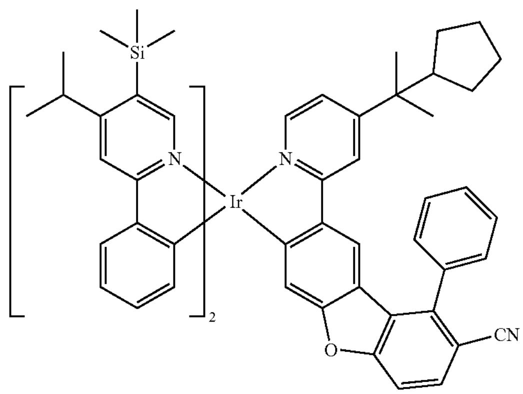
634
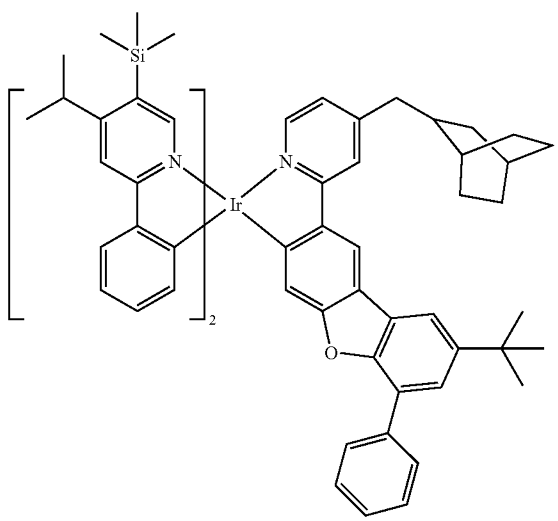
635
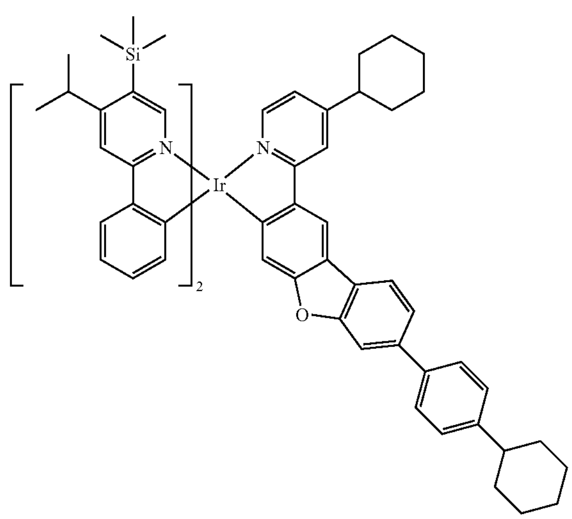

-continued
636
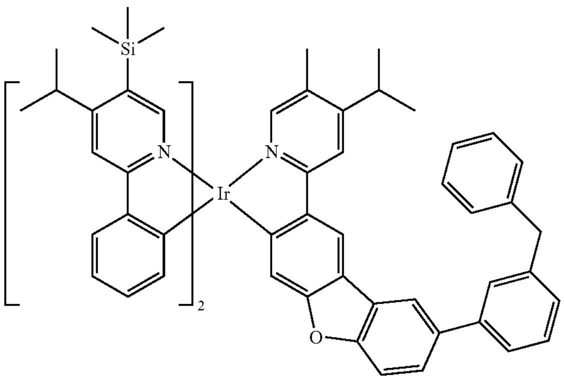
637
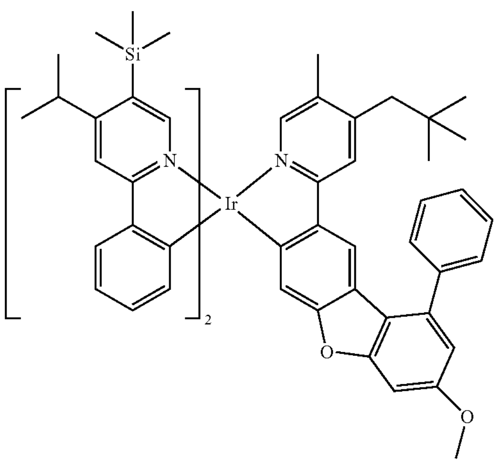
638
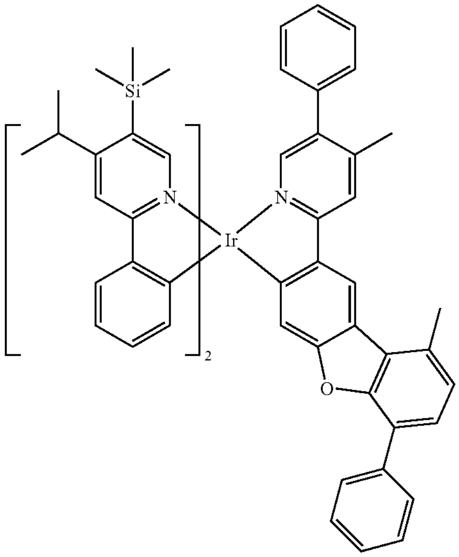
-continued
639
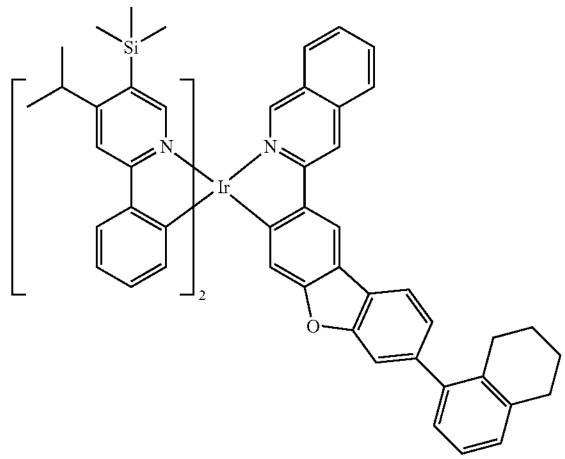
640
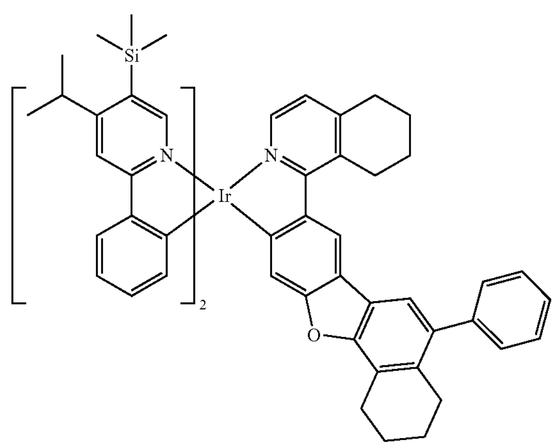
641
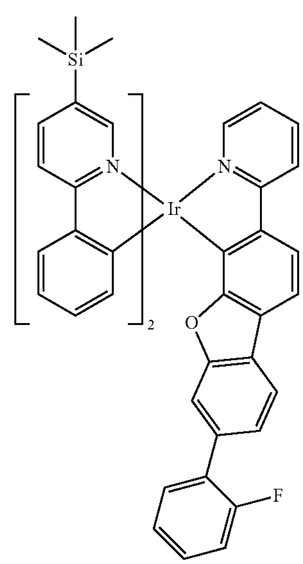

-continued
642
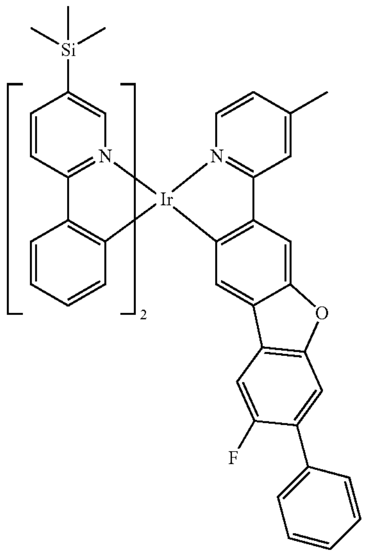
643
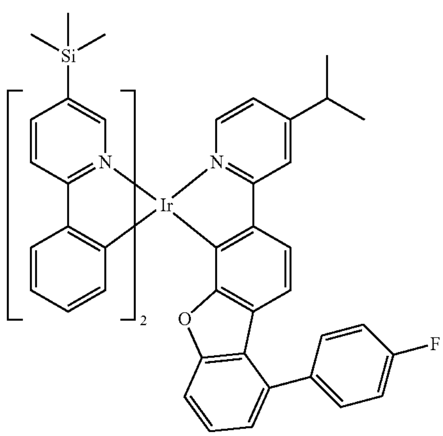
644
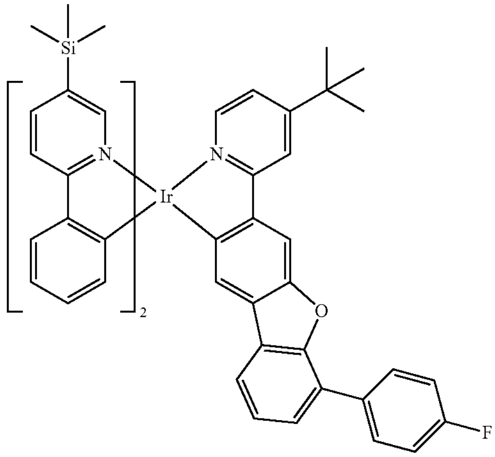
-continued
645
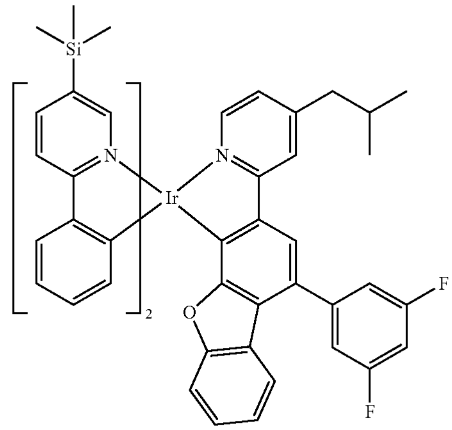
646
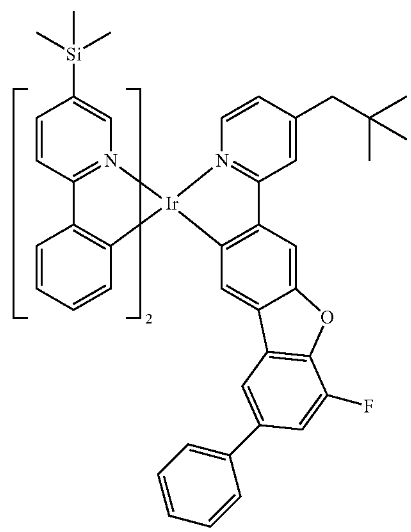
647
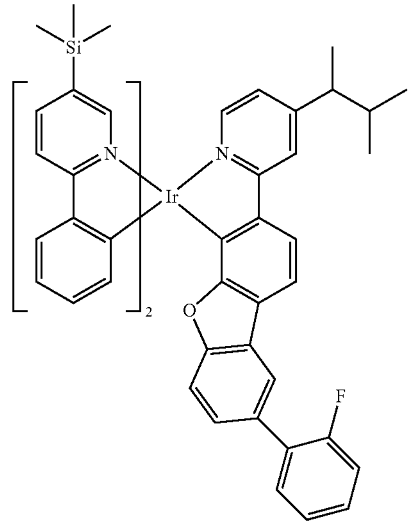

-continued
648
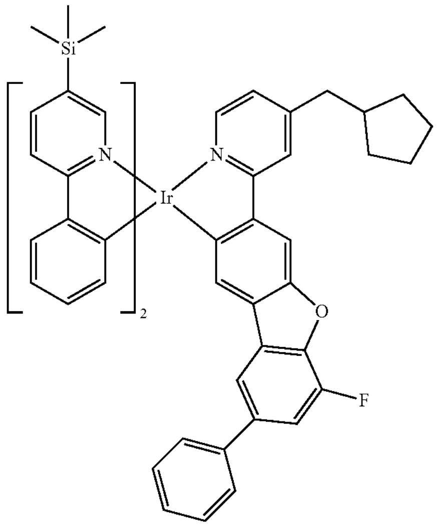
649
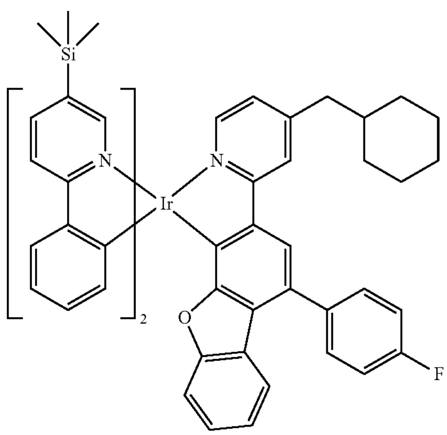
650
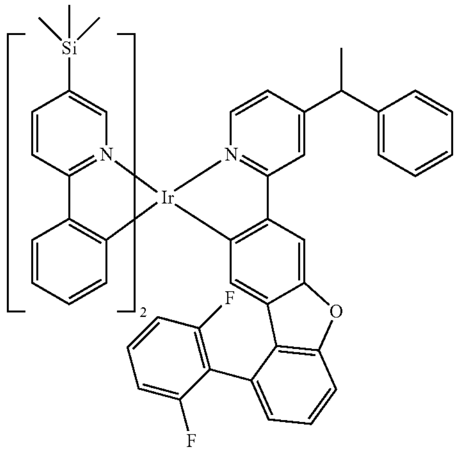
-continued
651
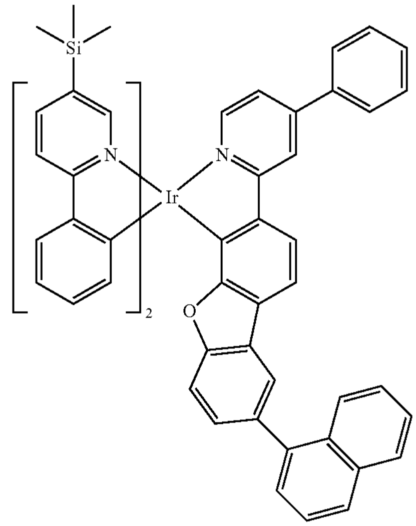
652
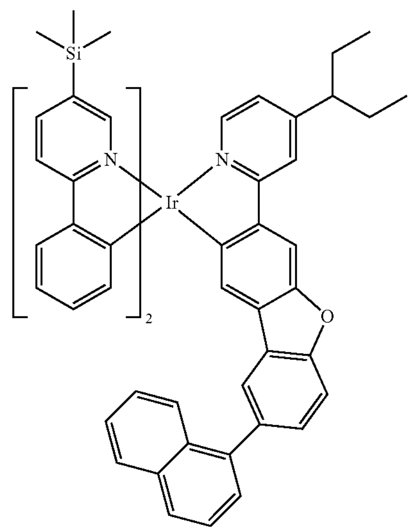
653
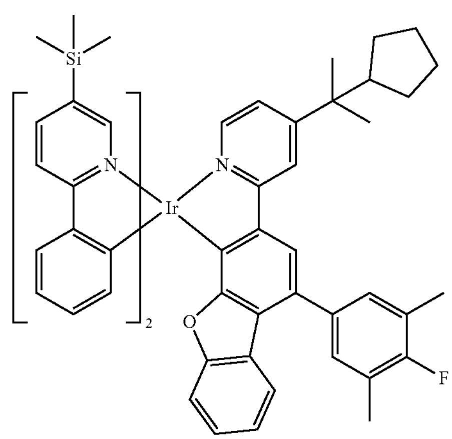

654
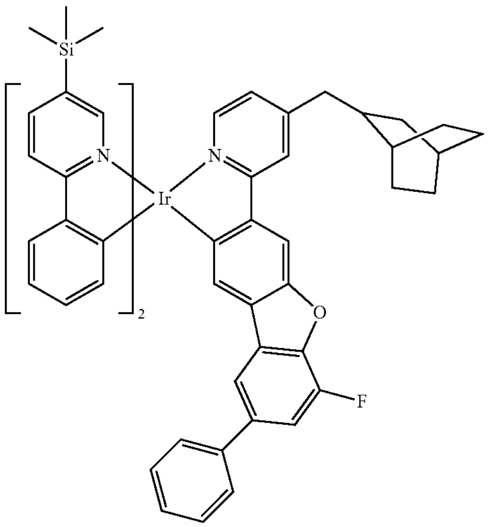
655
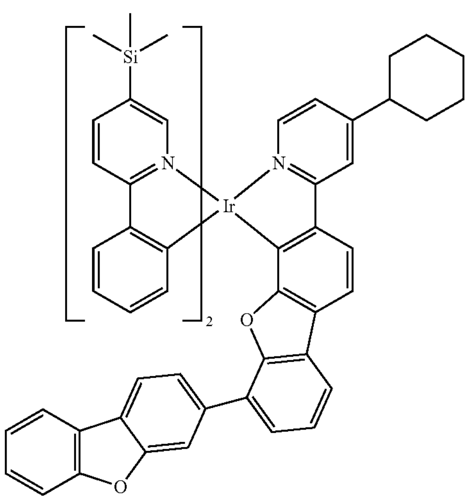
656
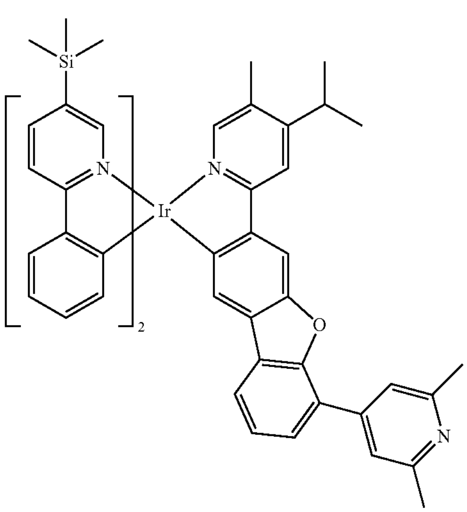
657
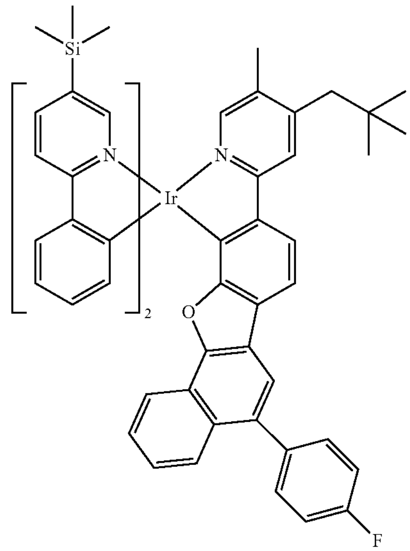
658
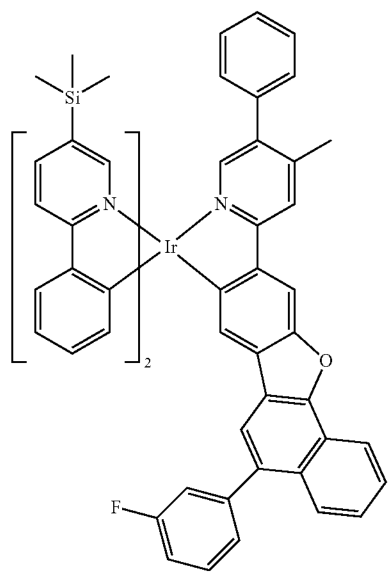
659
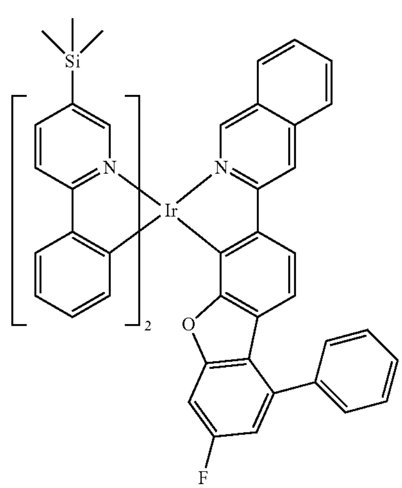

660
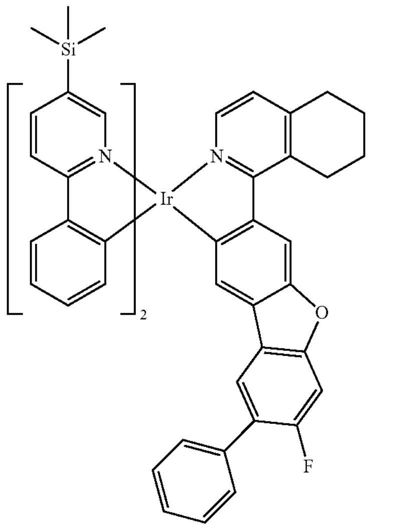
661
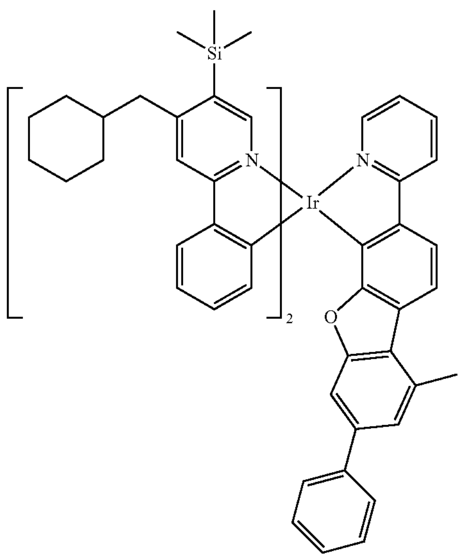
662
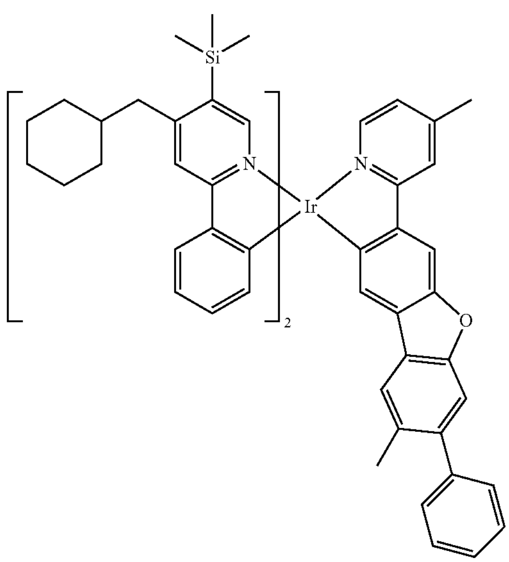
663
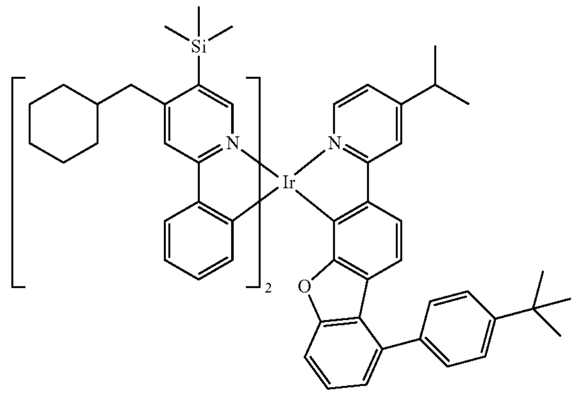
664
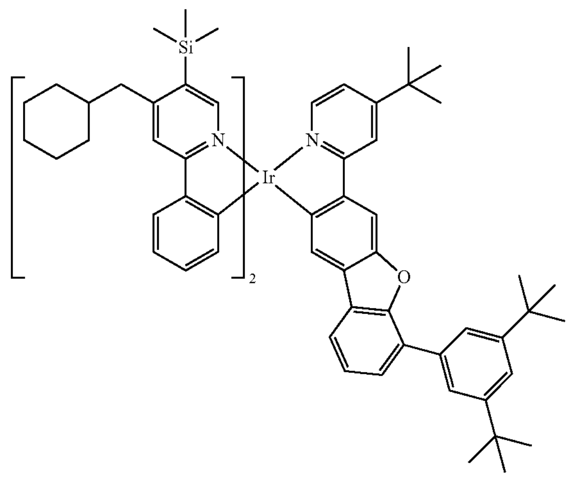
665
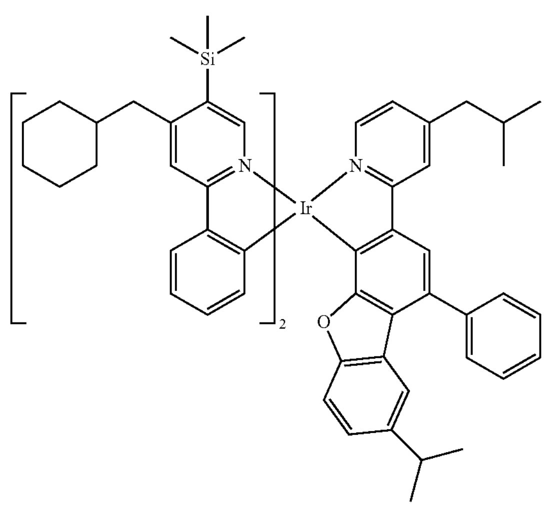

-continued
666
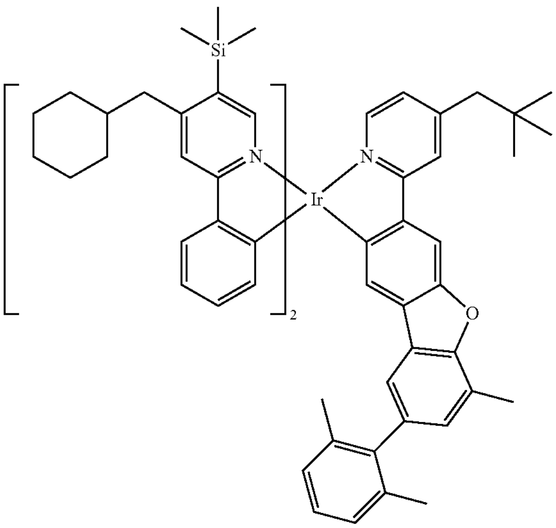
667
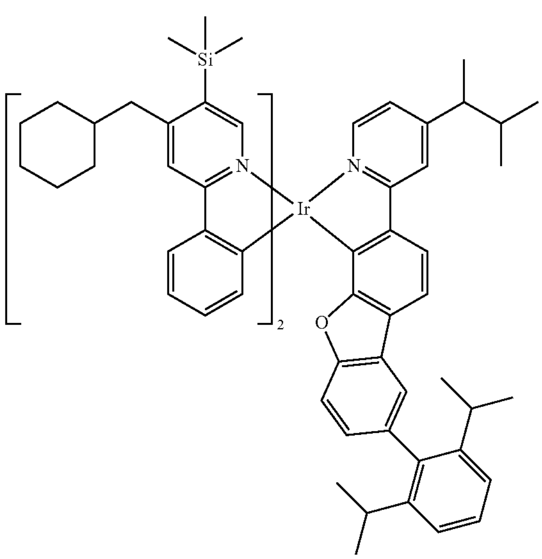
-continued
668
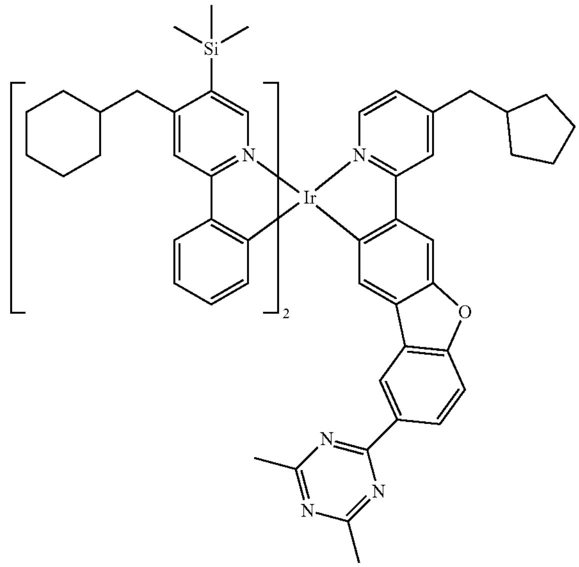
669
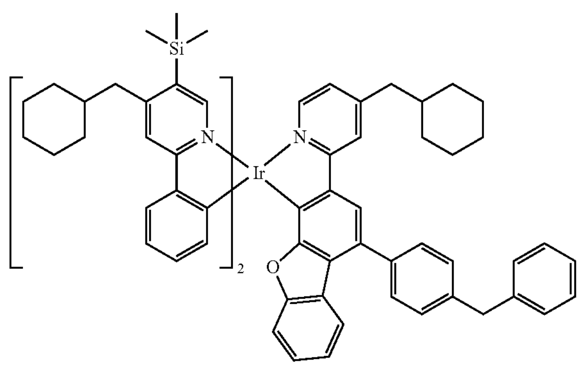
670
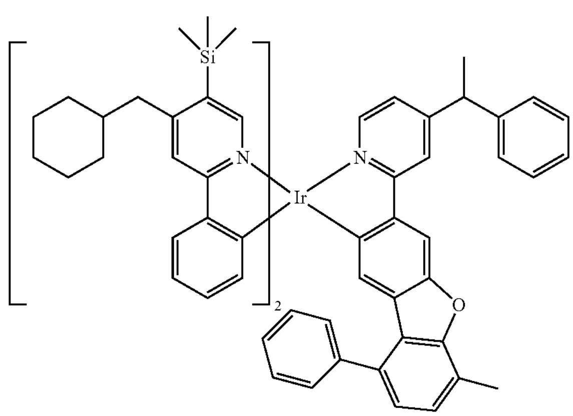

-continued
671
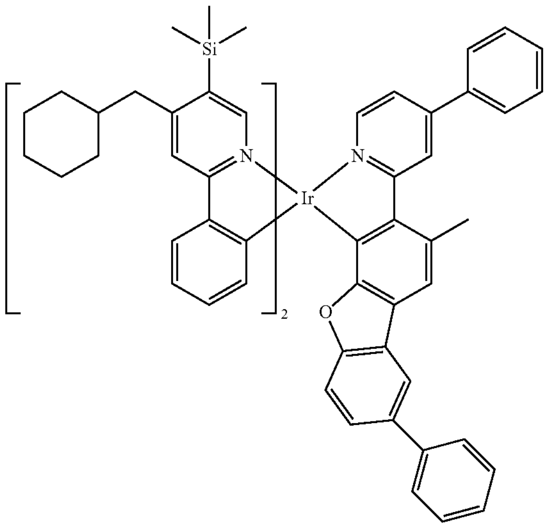
672
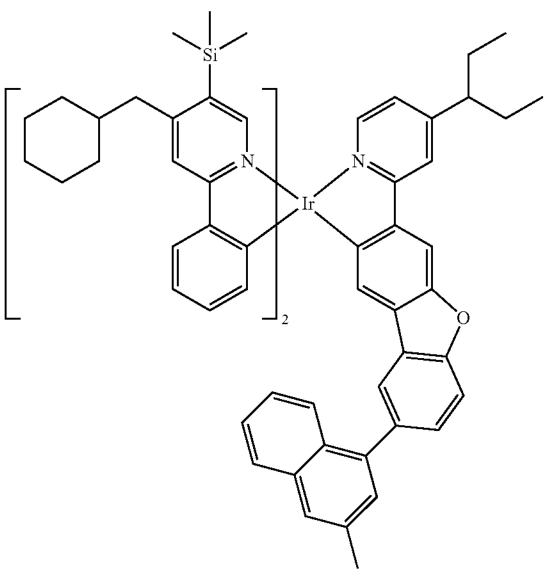
673
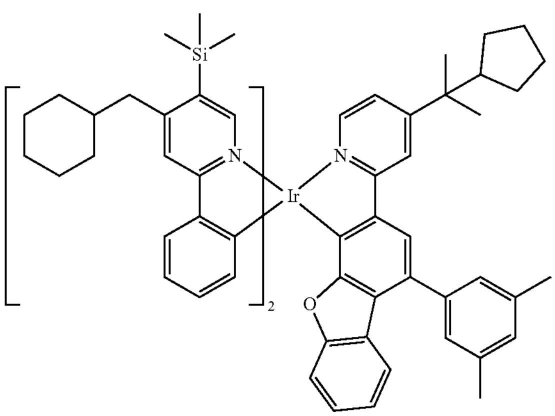
-continued
674
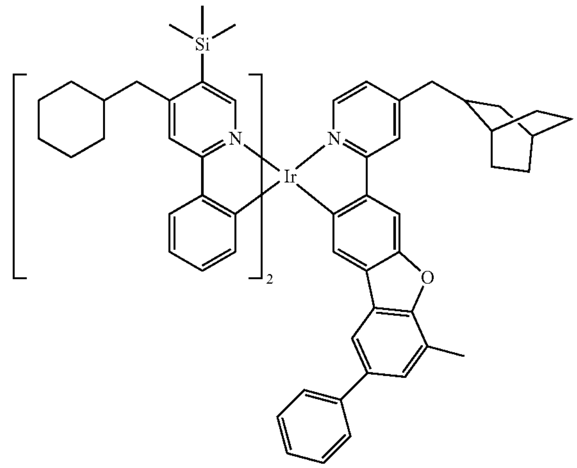
675
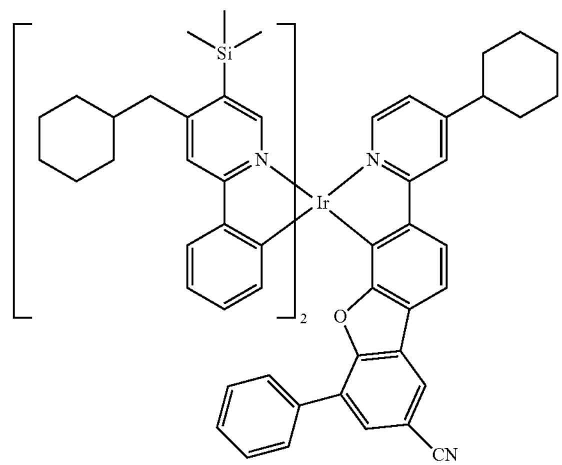
676
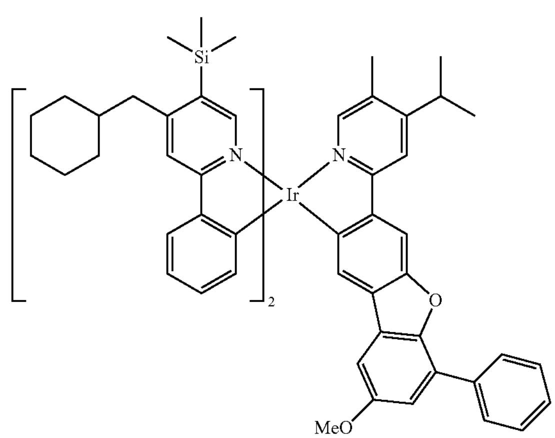

-continued
677
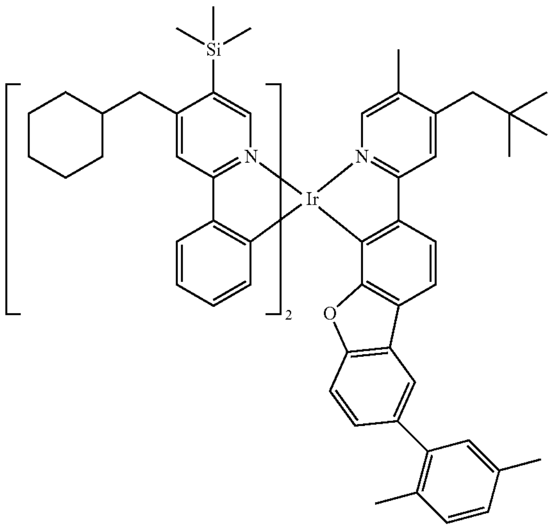
678
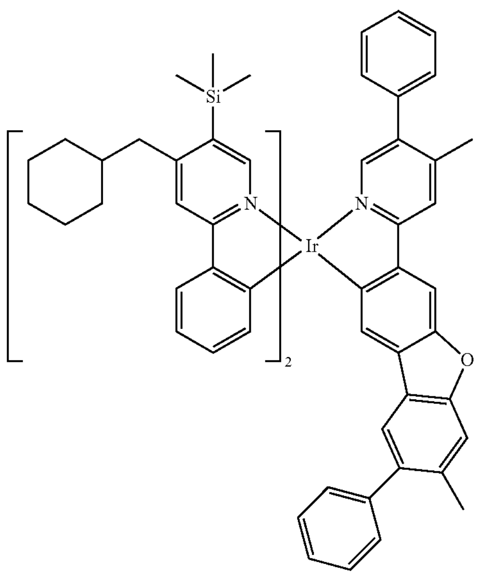
679
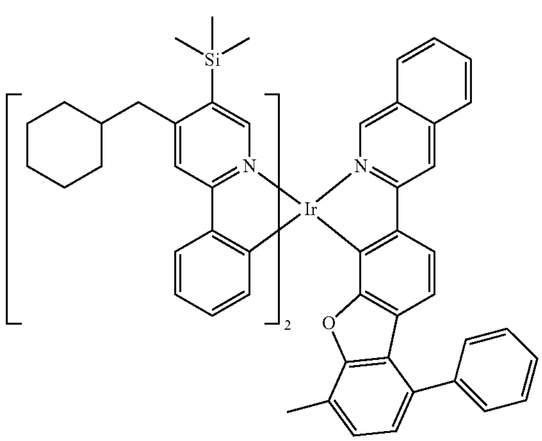
-continued
680
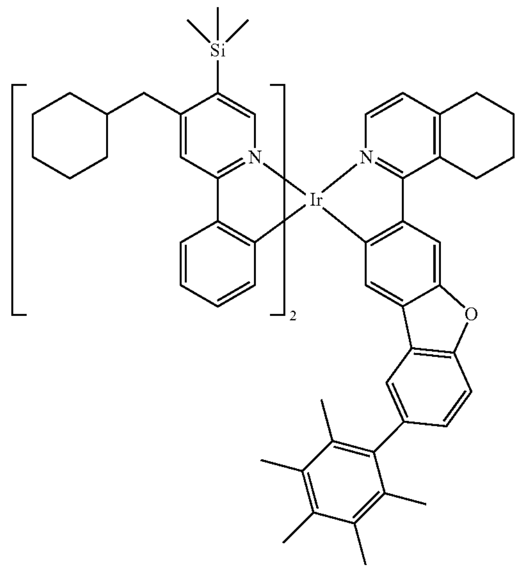
681
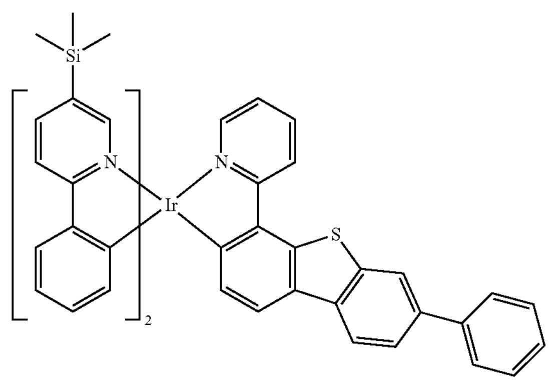
682
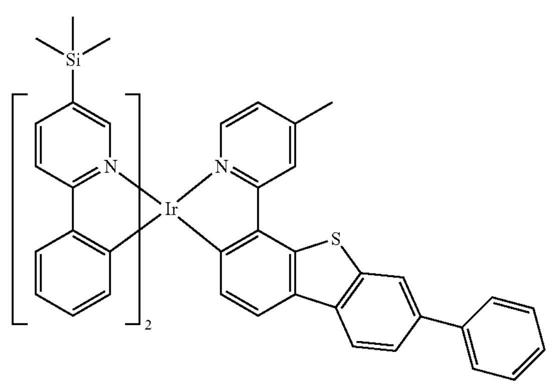

-continued
683
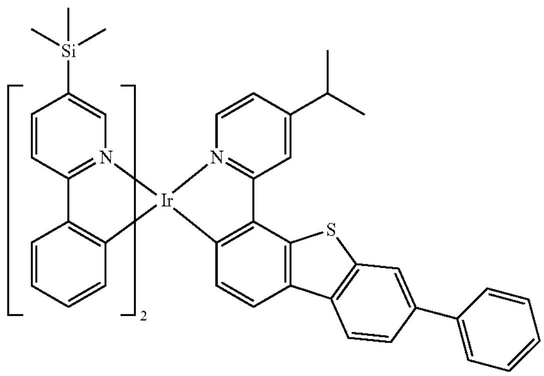
684
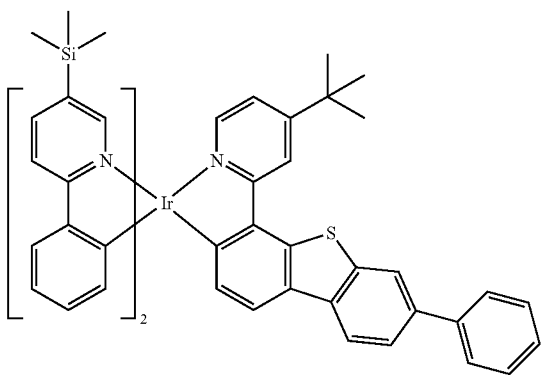
685
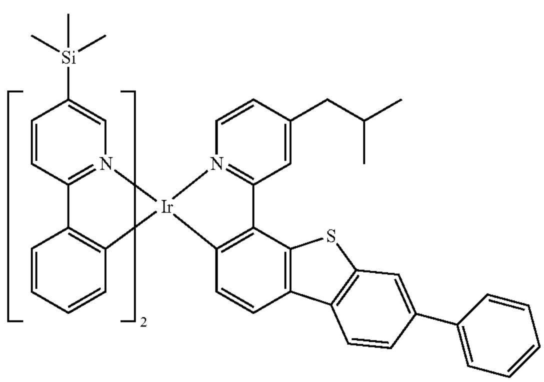
686
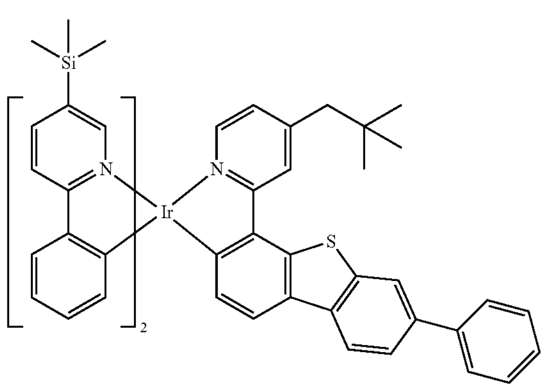
-continued
687
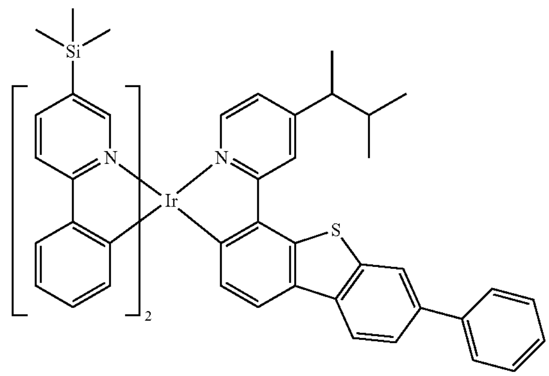
688
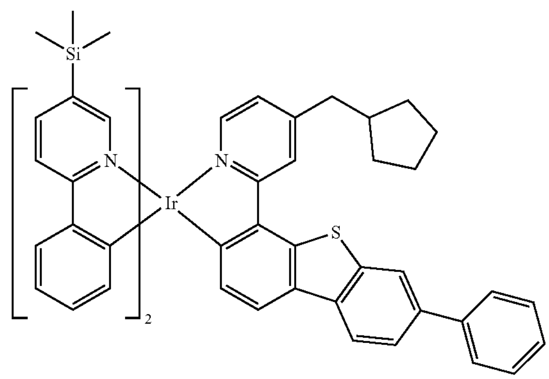
689
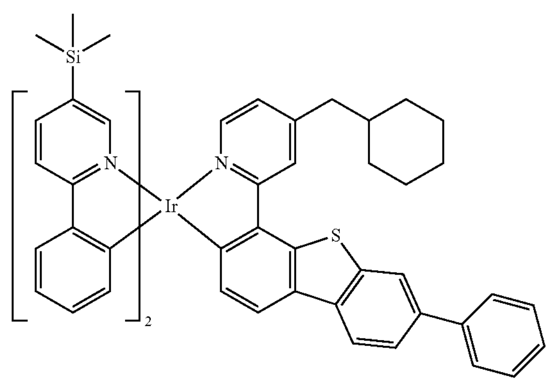
690
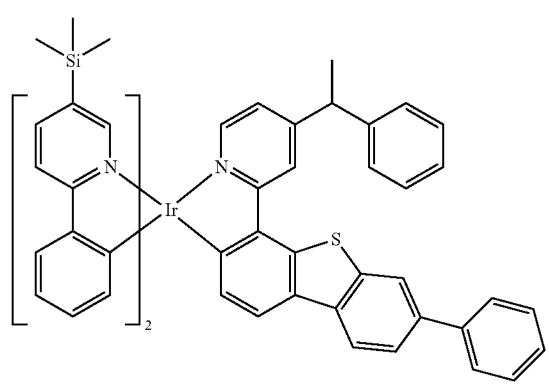

691
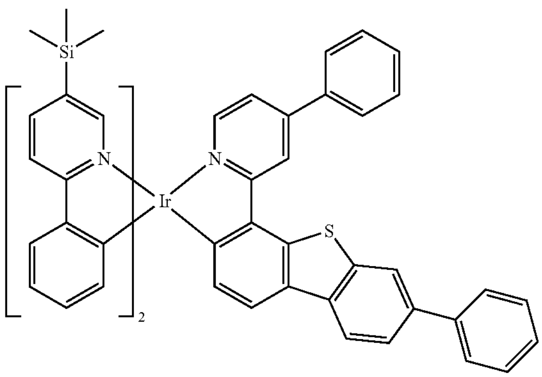
692
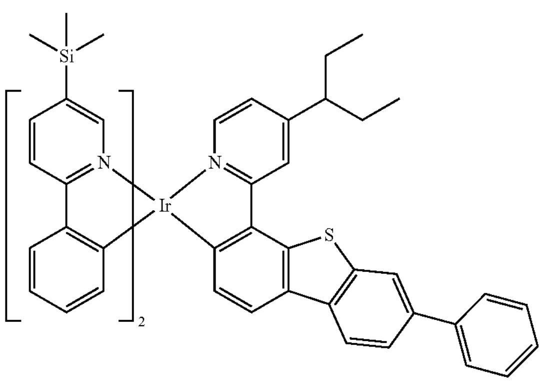
693
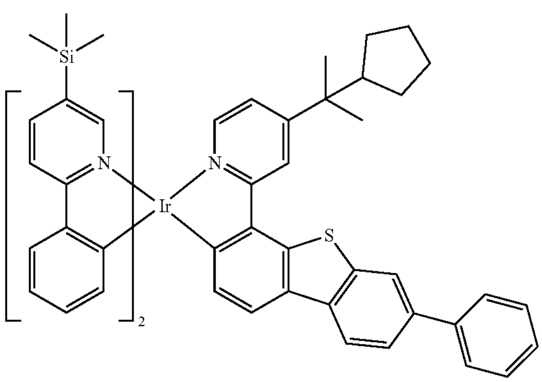
694
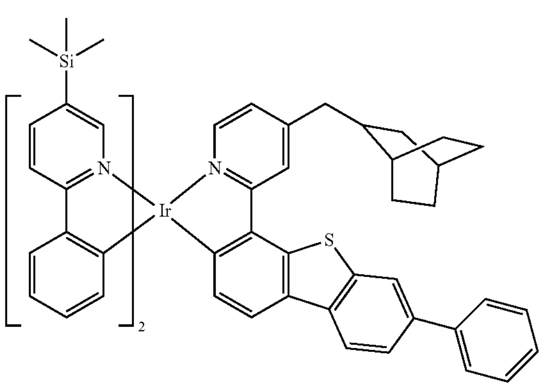
695
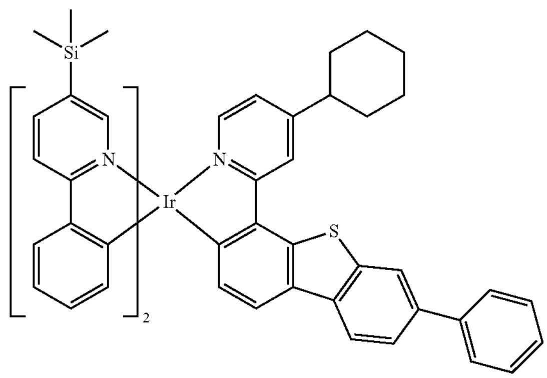
696
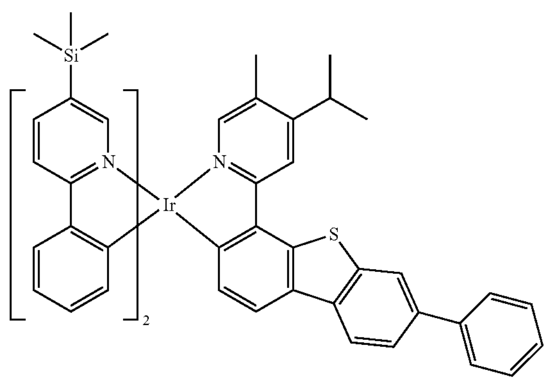
697
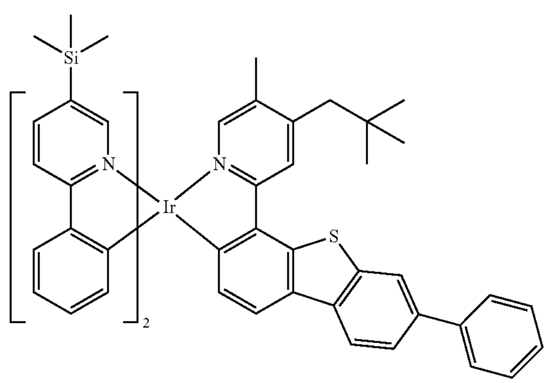
698
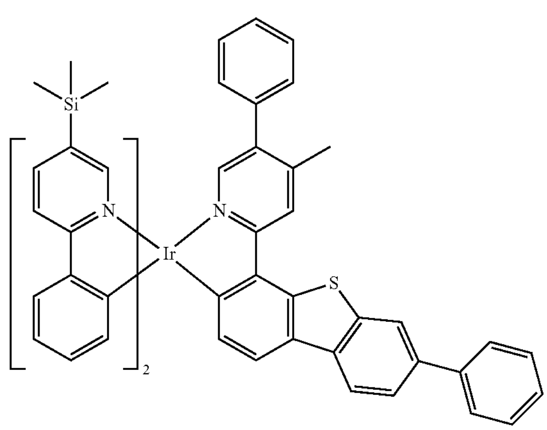

-continued
699
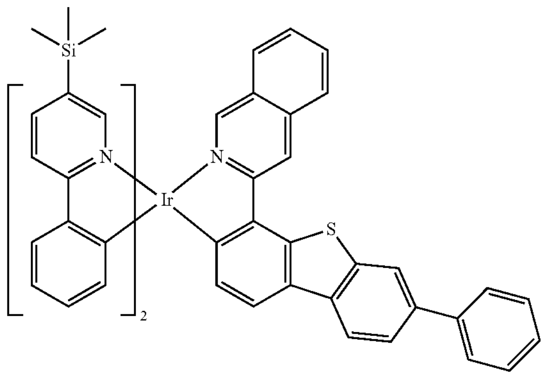
700
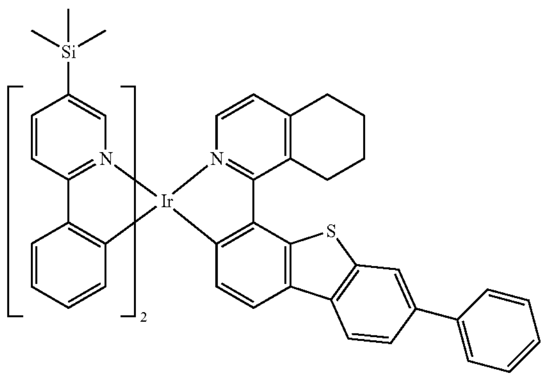
701
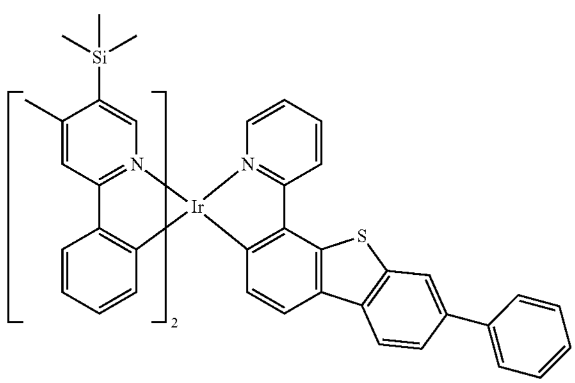
702
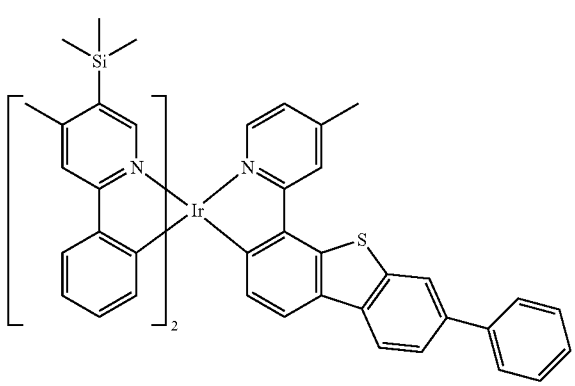
-continued
703
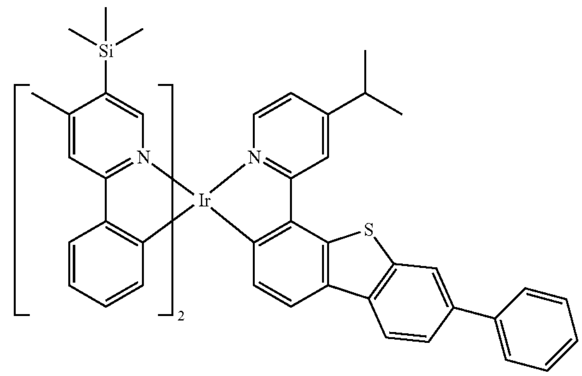
704
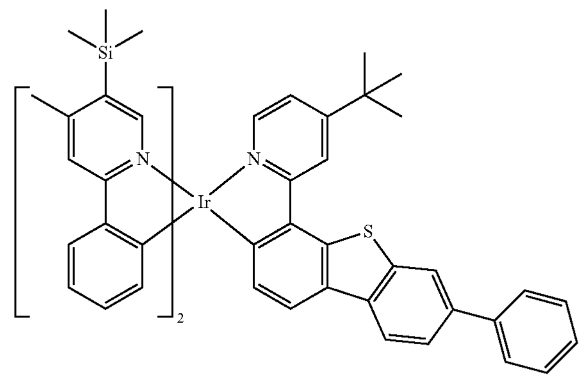
705
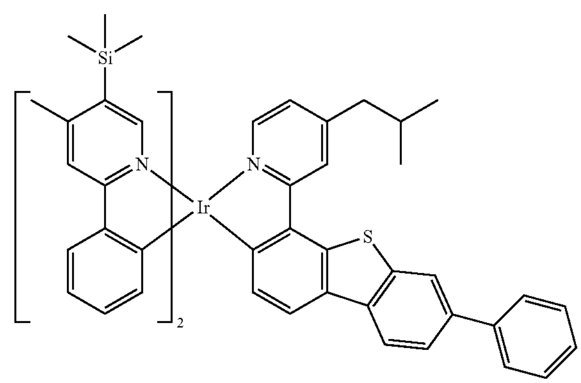
706
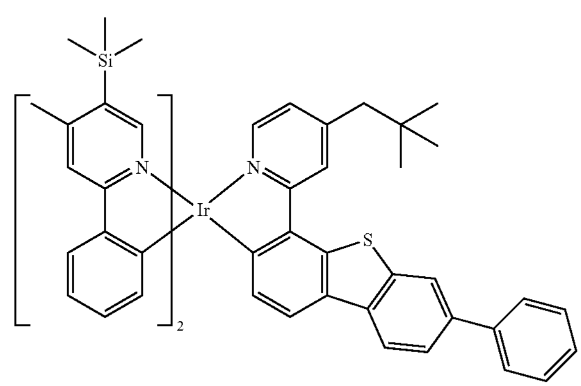

-continued
707
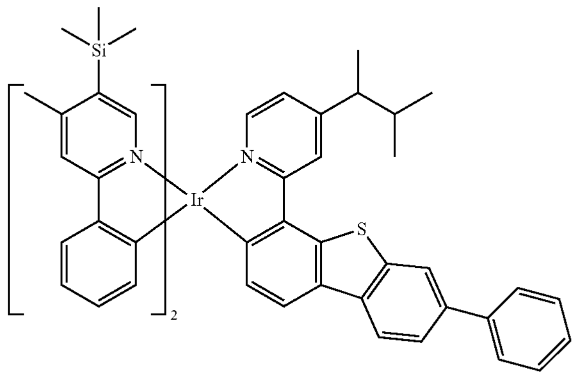
708
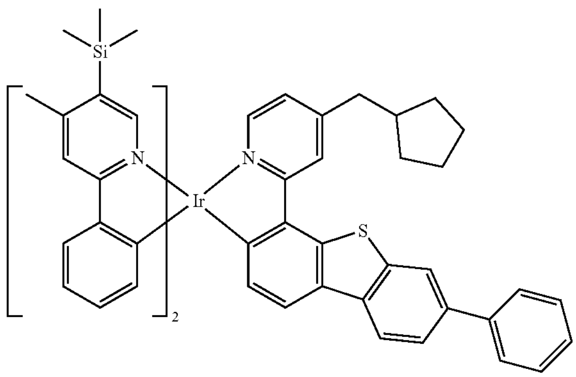
709
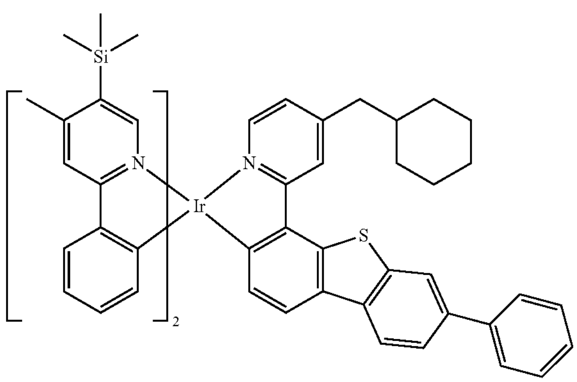
710
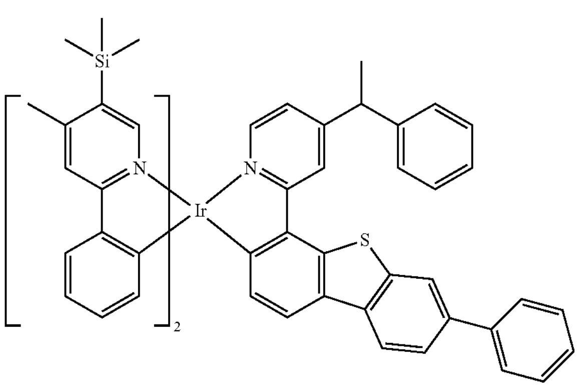
-continued
711
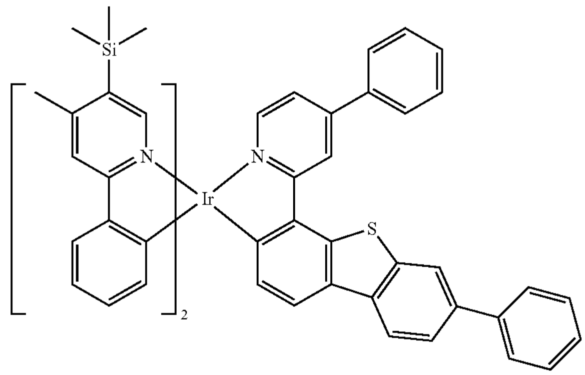
712
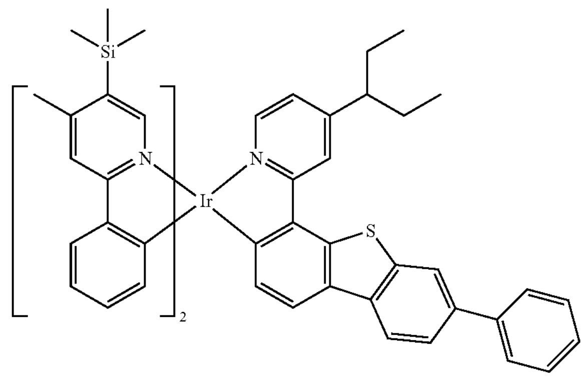
713
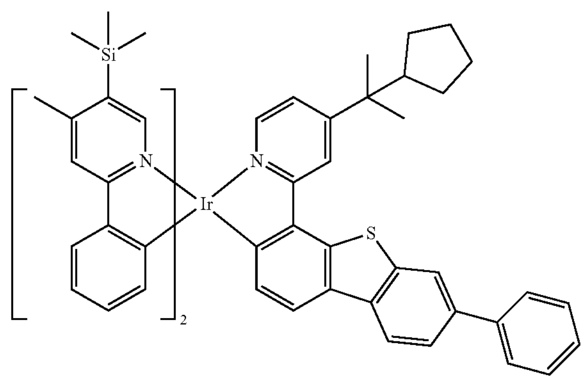
714
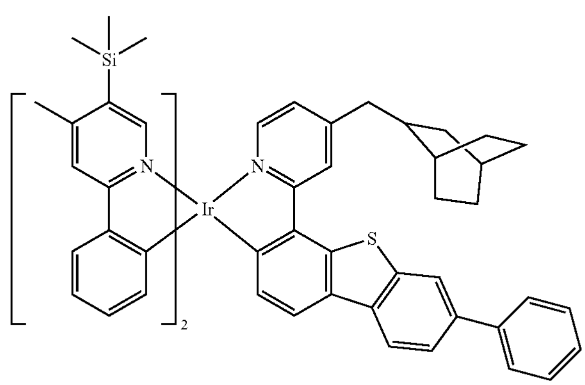

-continued
715
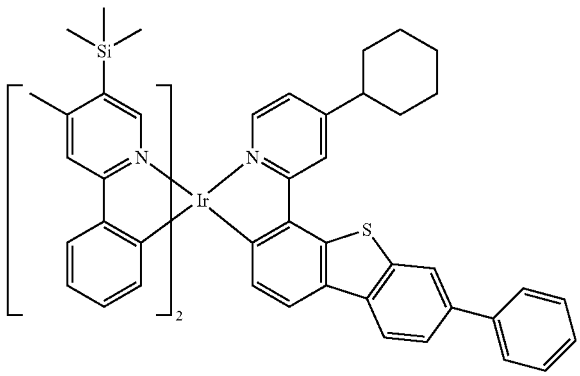
716
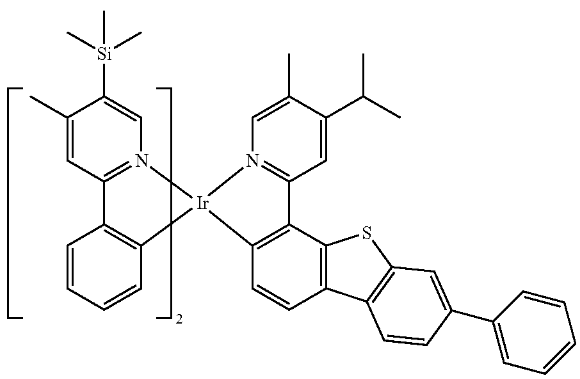
717
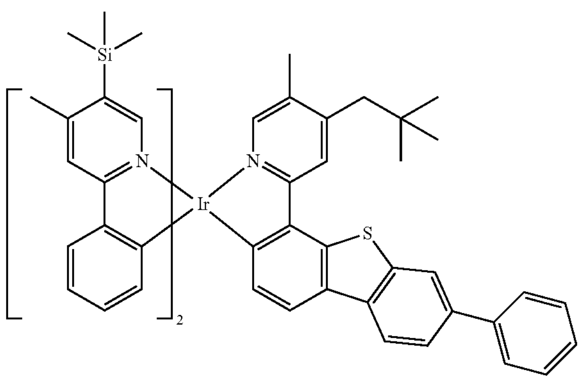
718
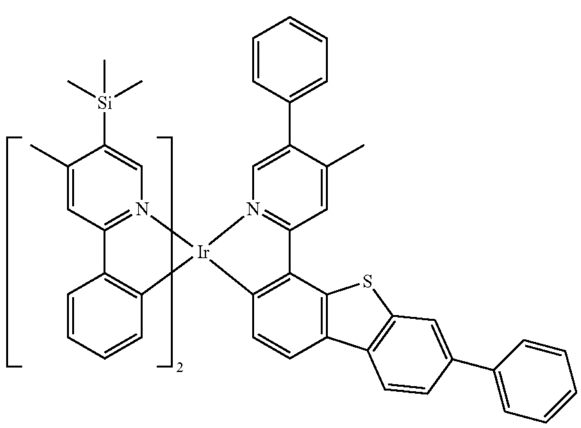
-continued
719
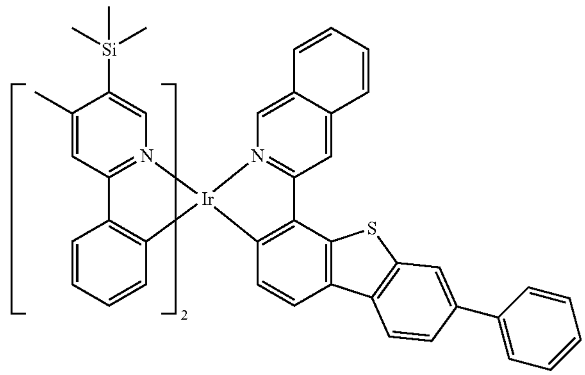
720
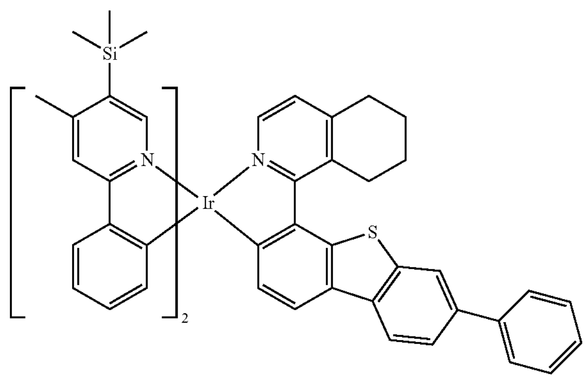
721
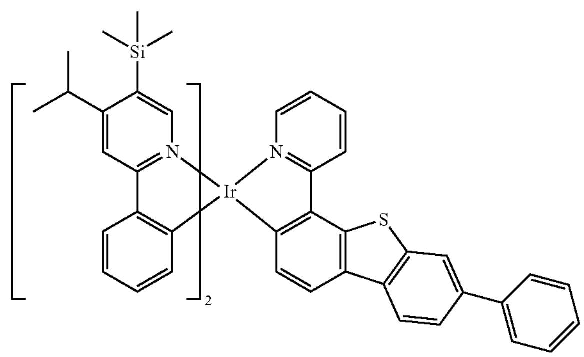
722
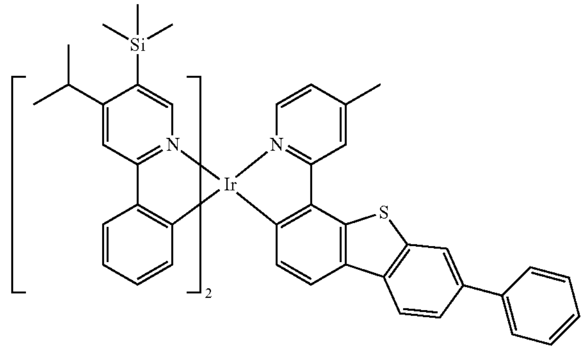

-continued
723
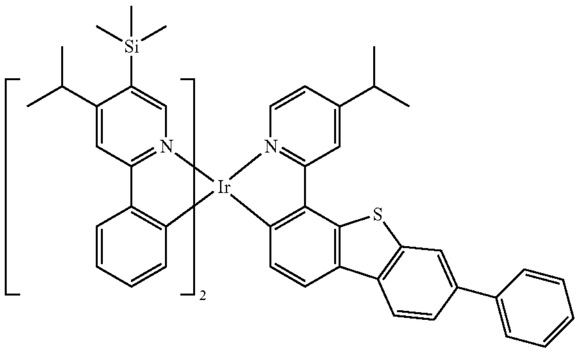
724
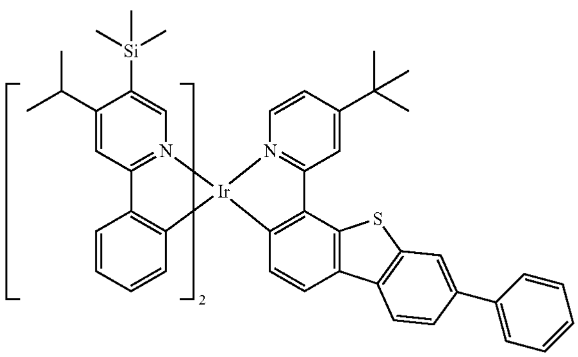
725
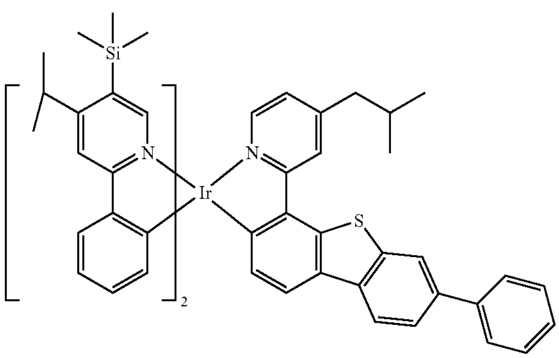
726
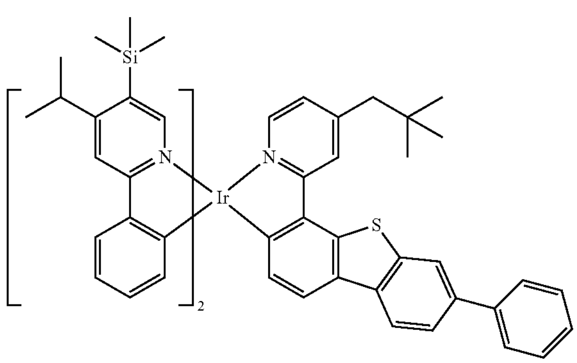
-continued
727
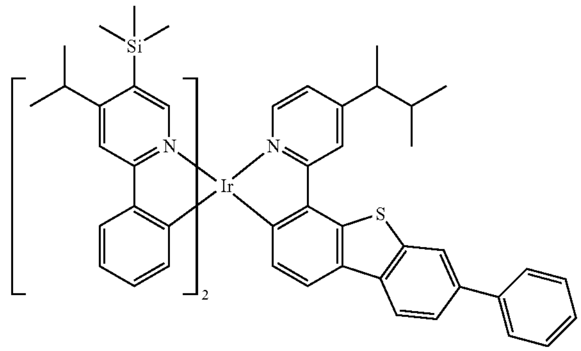
728
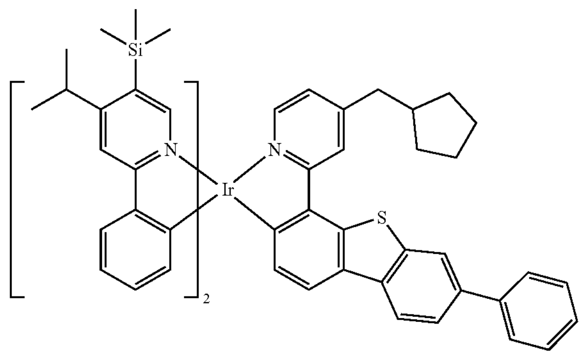
729
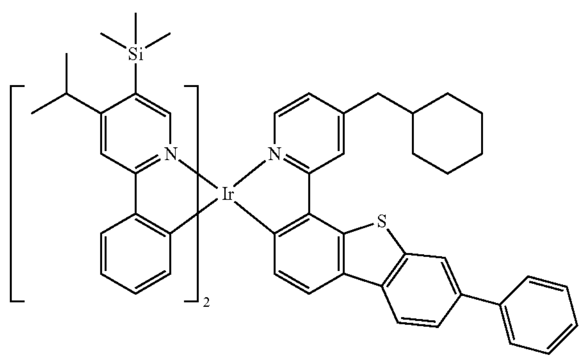
730
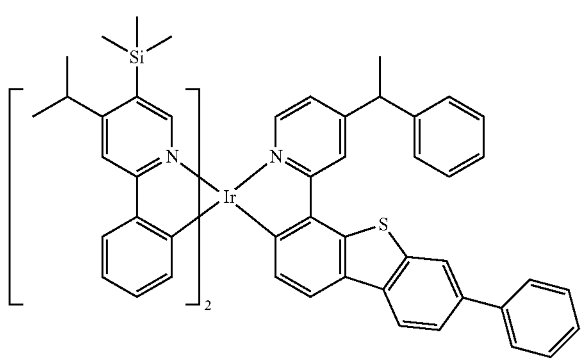

-continued
731
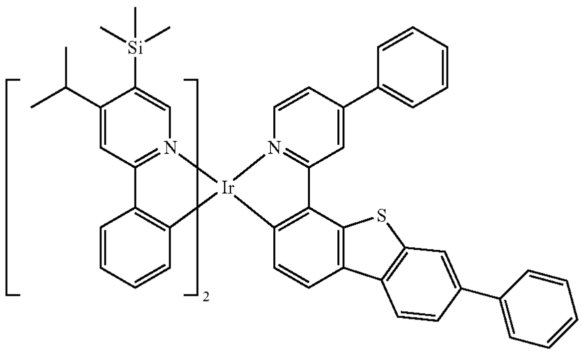
732
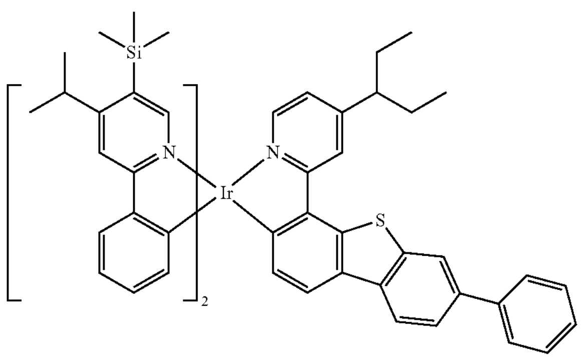
733
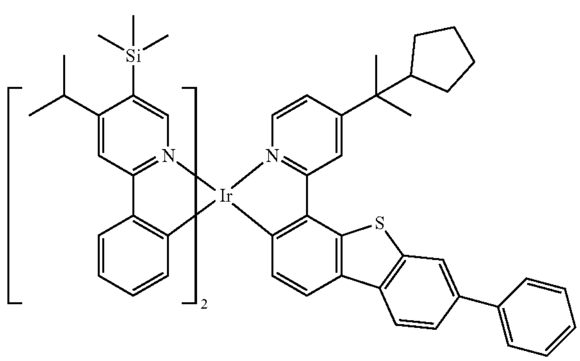
734
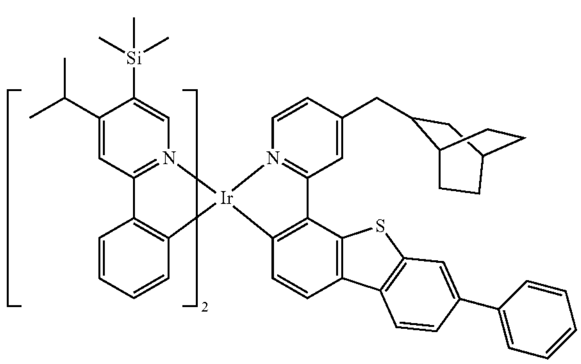
-continued
735
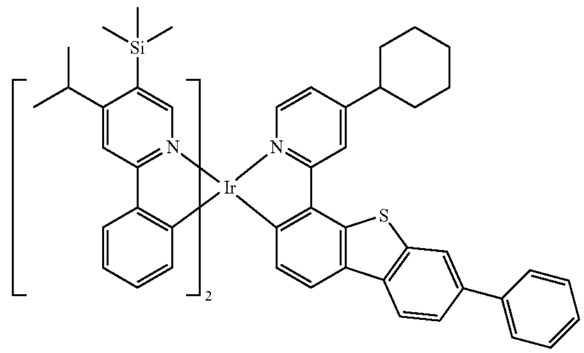
736
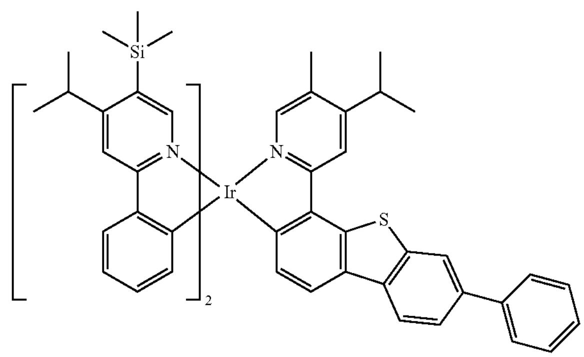
737
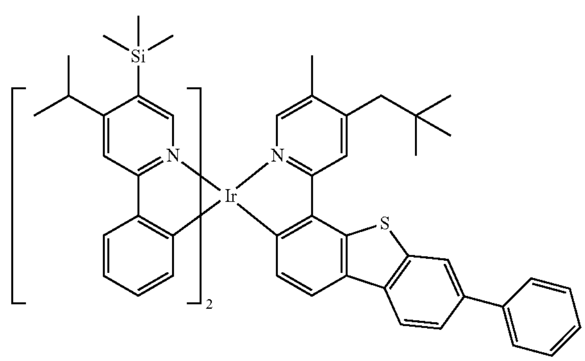
738
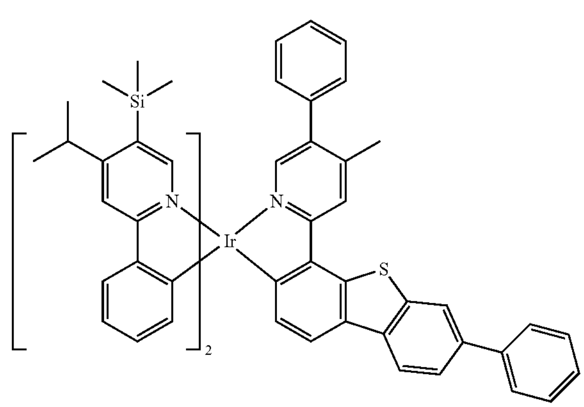

-continued
739
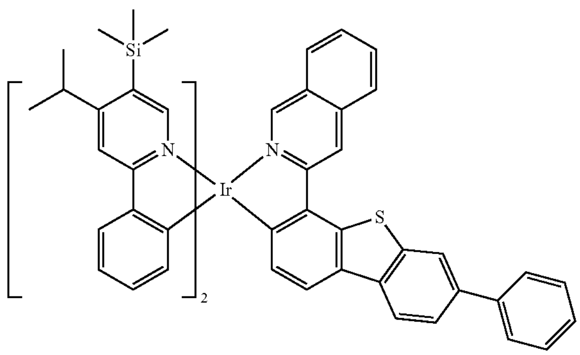
740
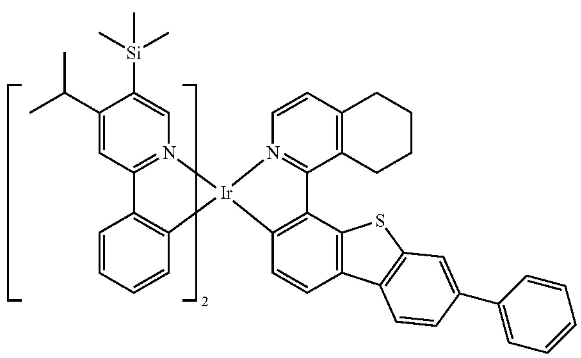
741
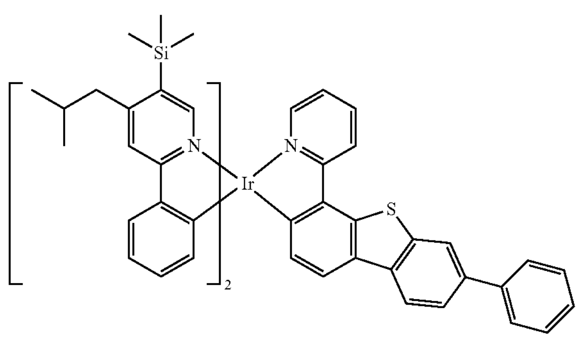
742
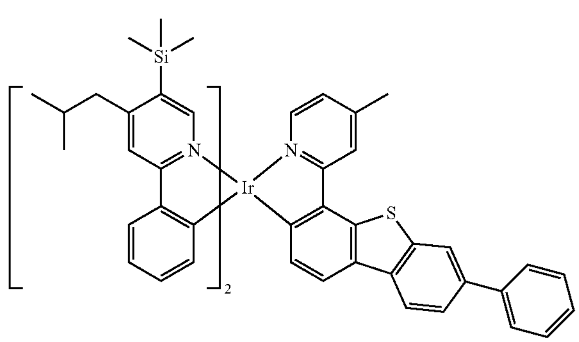
-continued
743
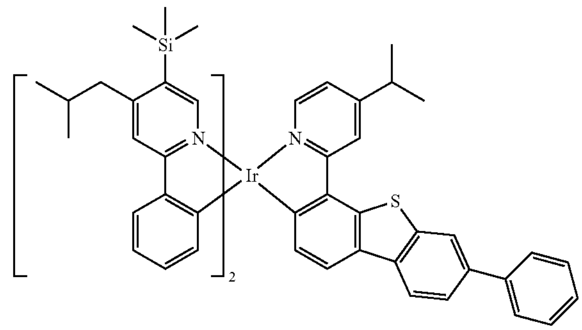
744
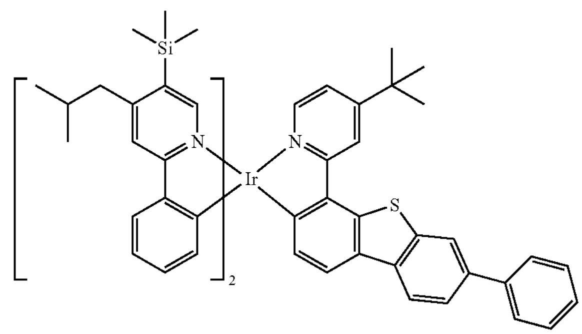
745
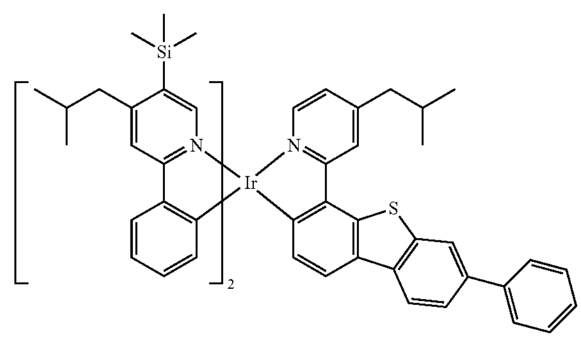
746
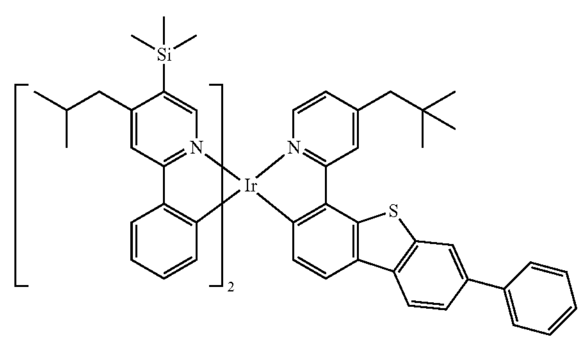

-continued
747
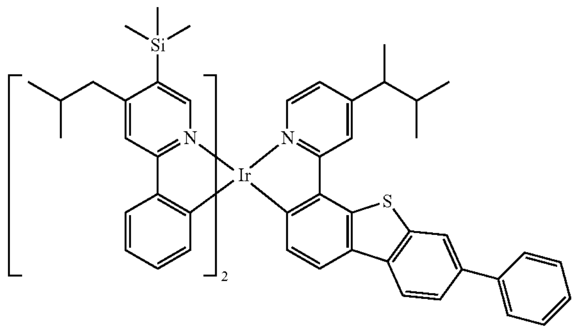
748
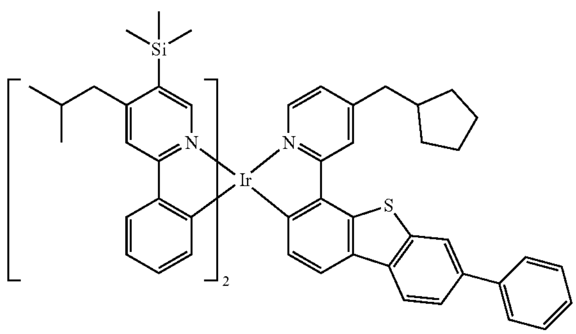
749
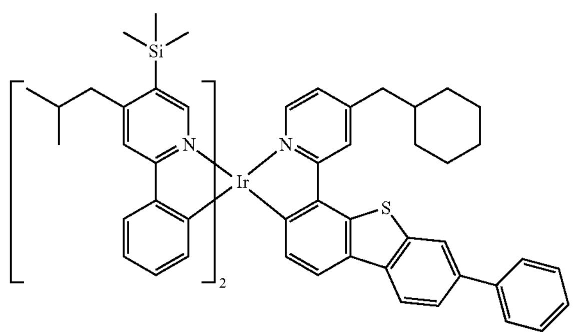
750
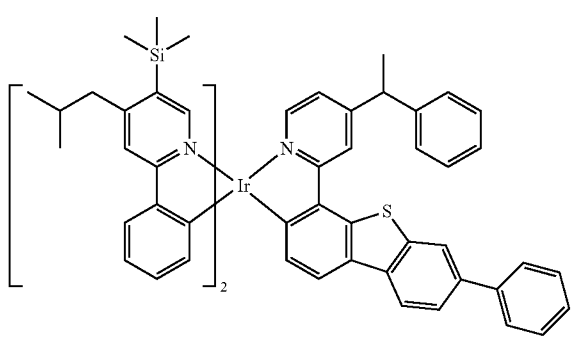
-continued
751
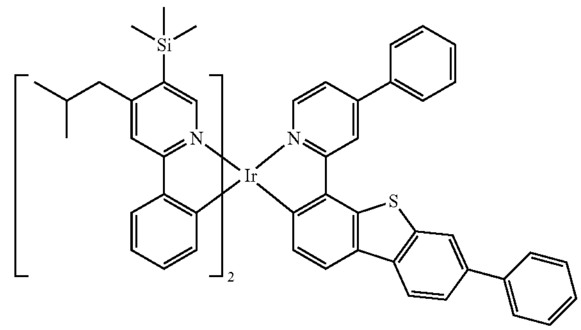
752
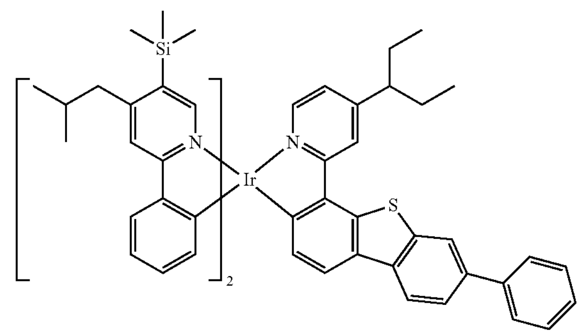
753
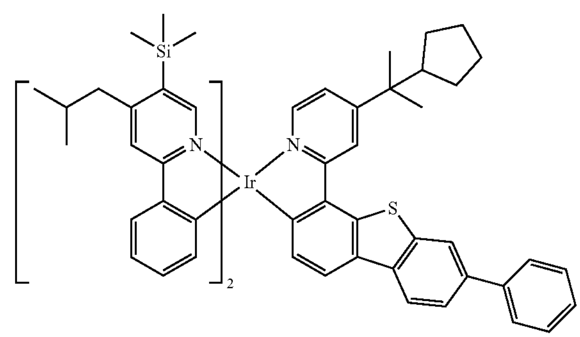
754
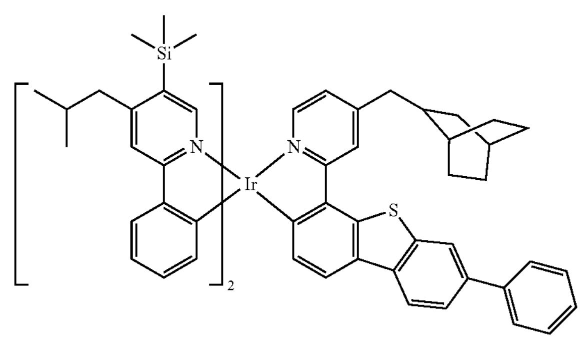

-continued
755
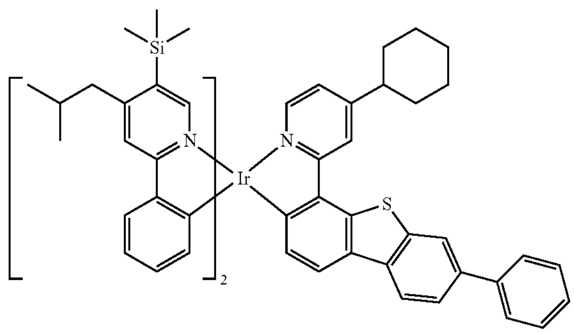
756
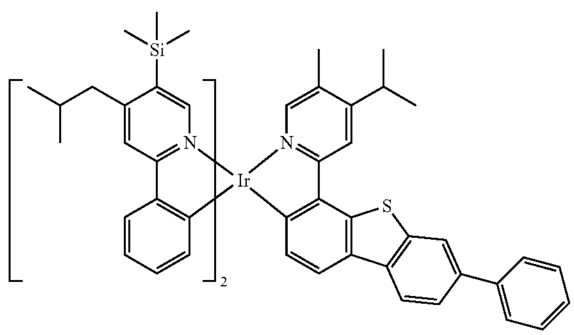
757
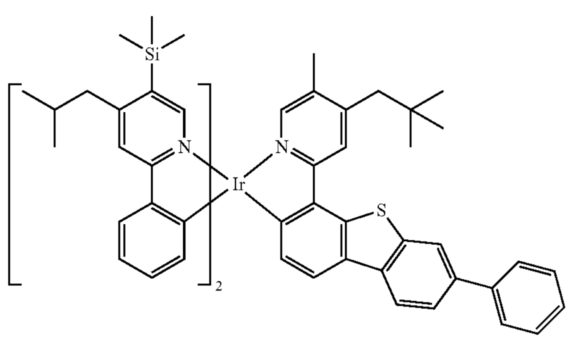
758
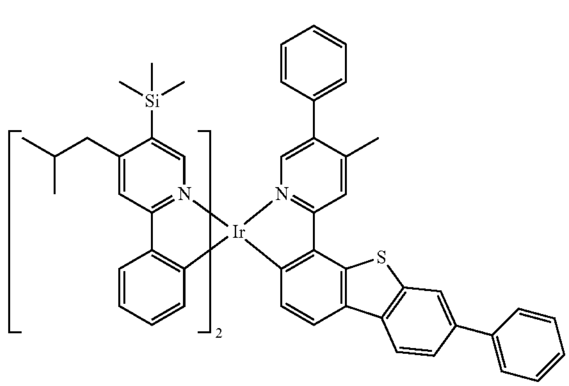
-continued
759
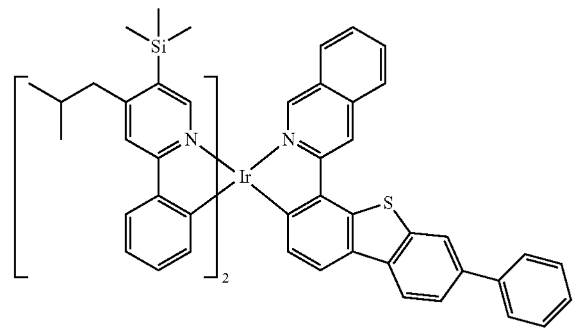
760
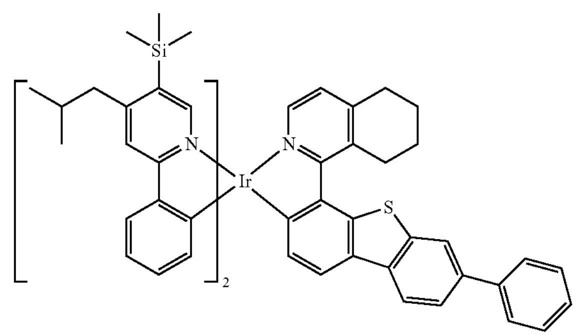
761
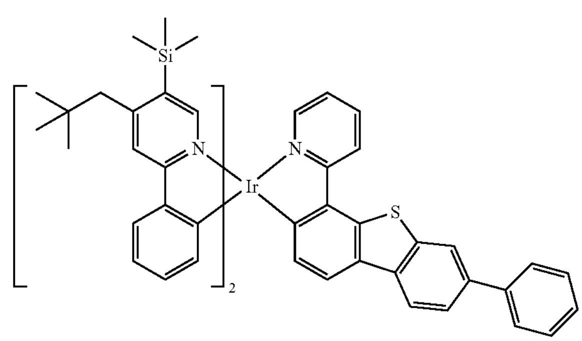
762
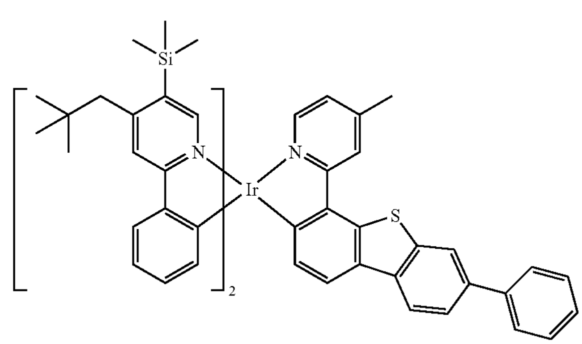

-continued
763
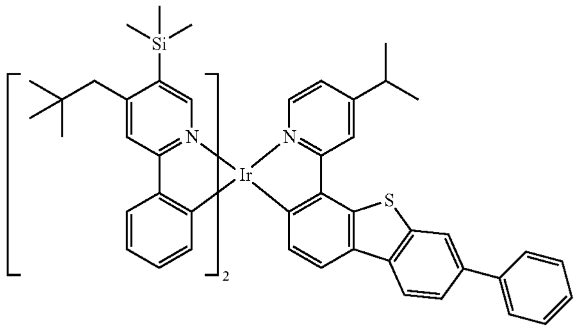
764
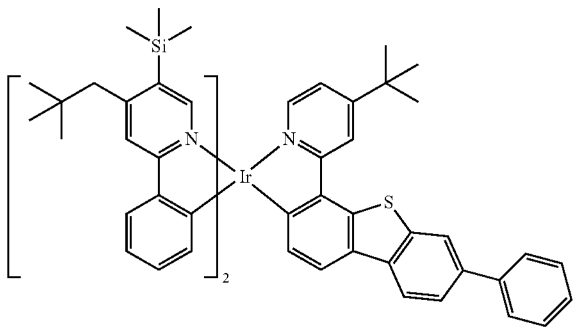
765
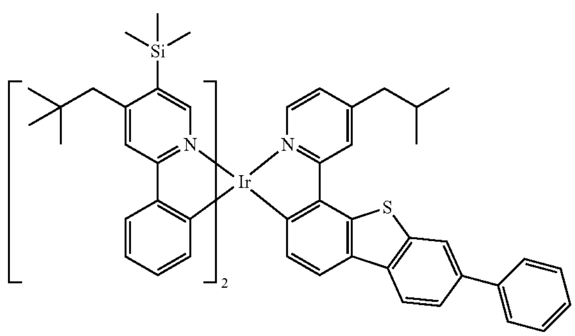
766
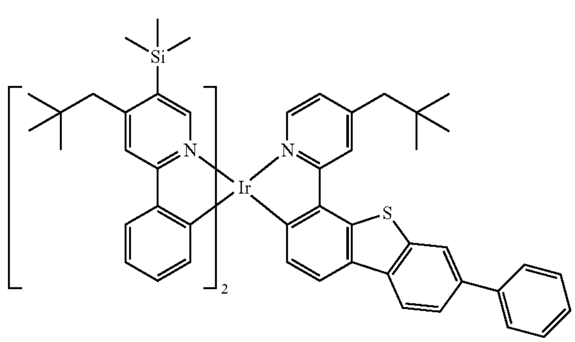
-continued
767
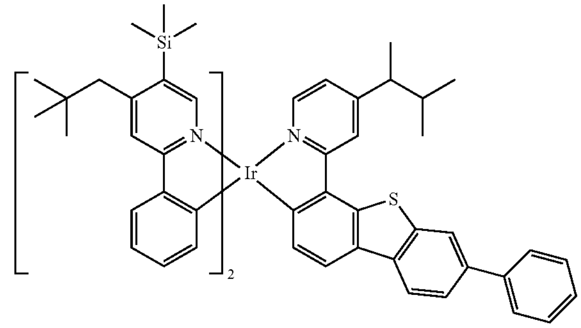
768
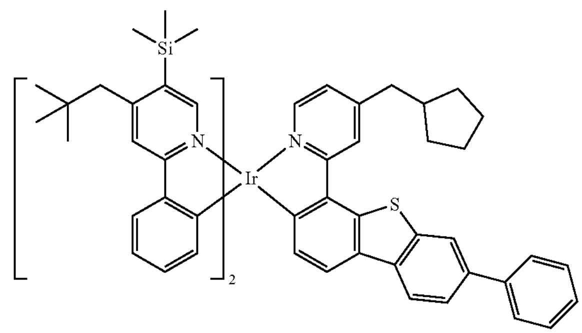
769
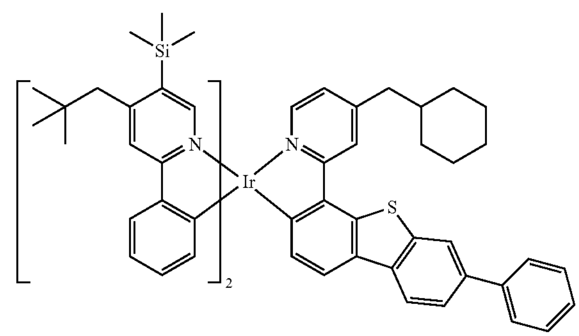
770
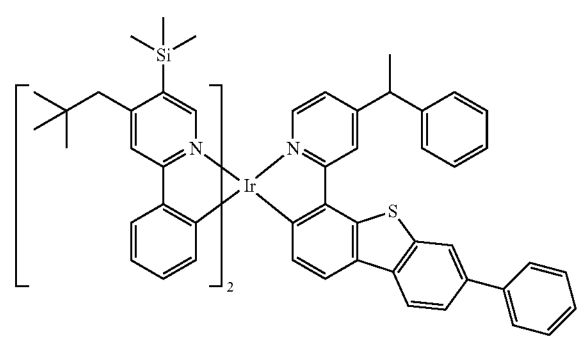

771
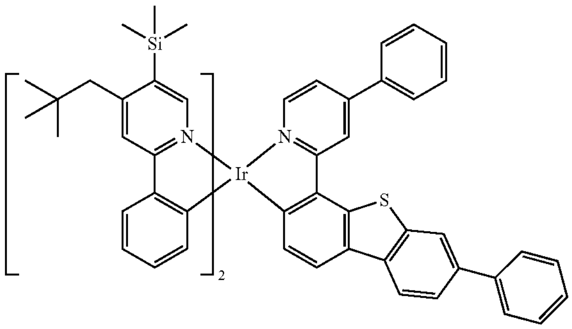
772
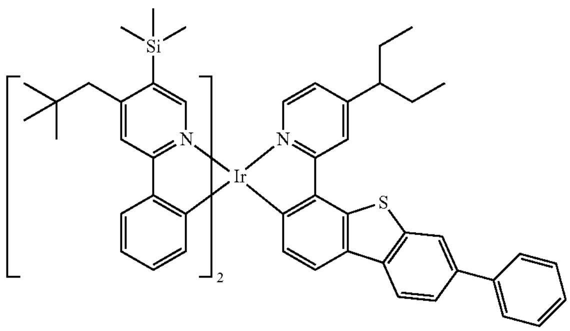
773
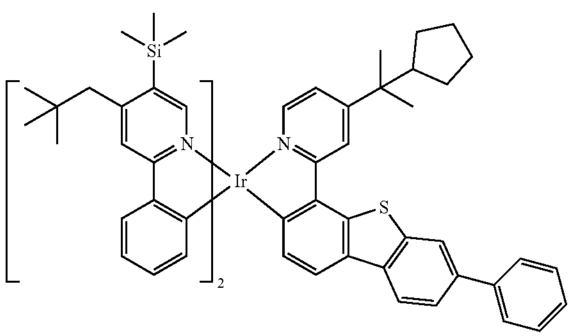
774
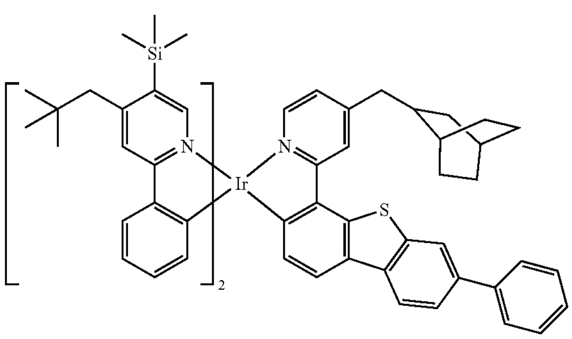
775
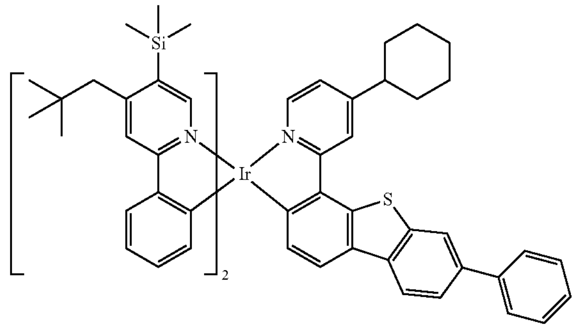
776
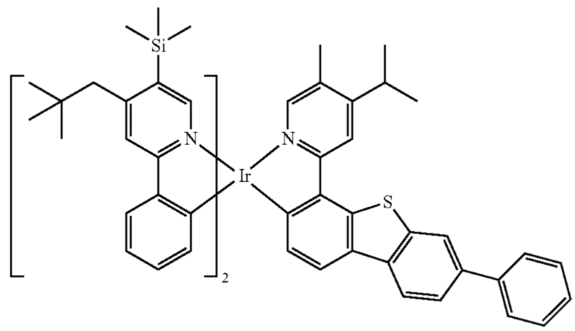
777
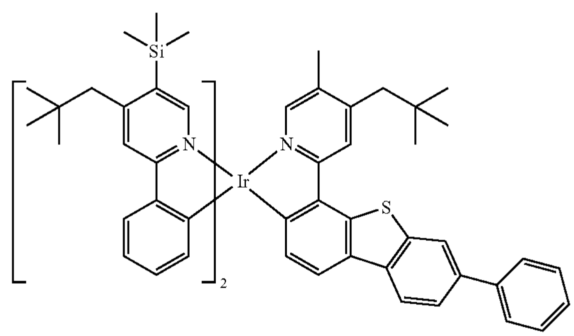
778
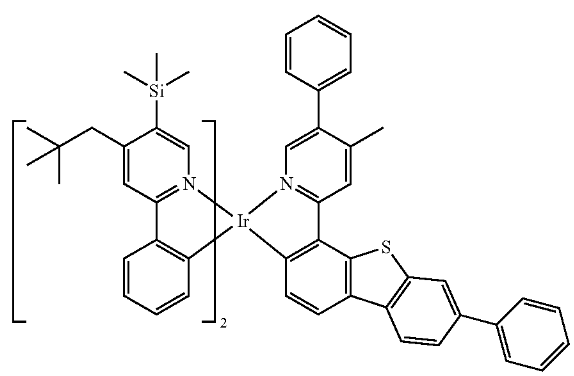

-continued
779
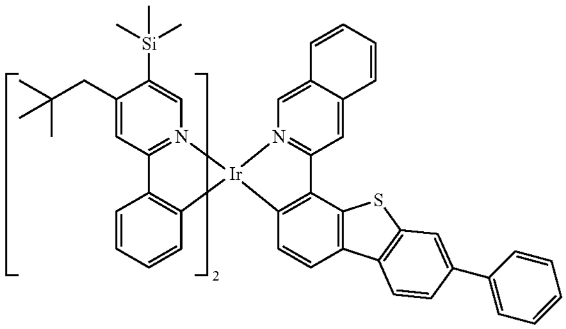
780
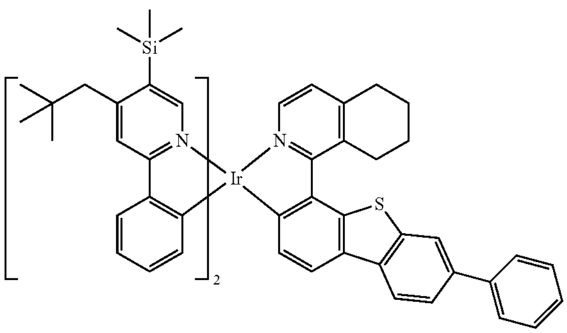
781
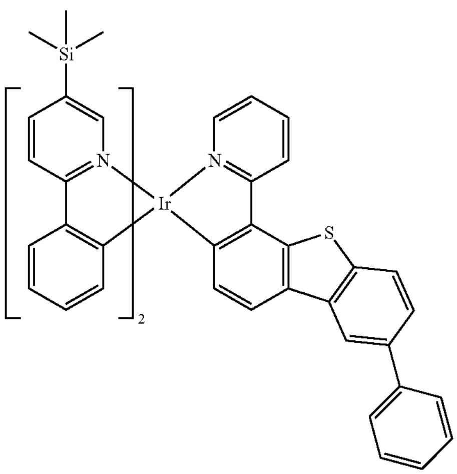
782
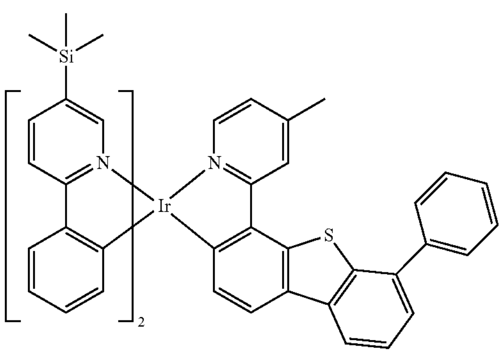
783
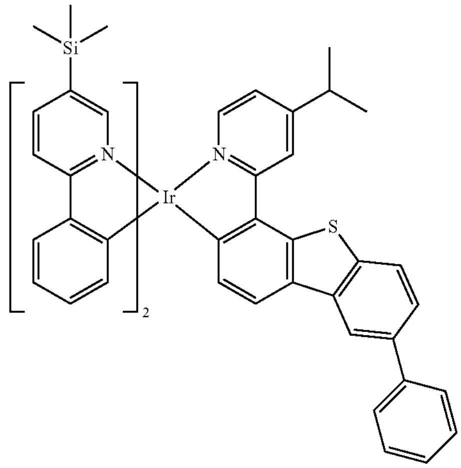
784
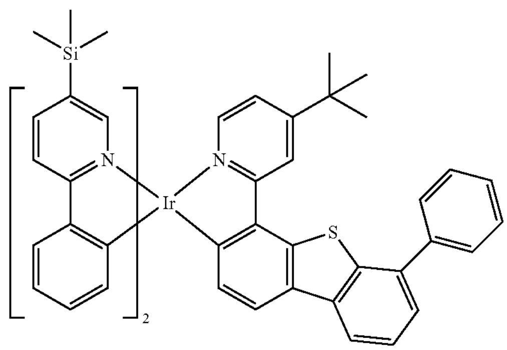
785
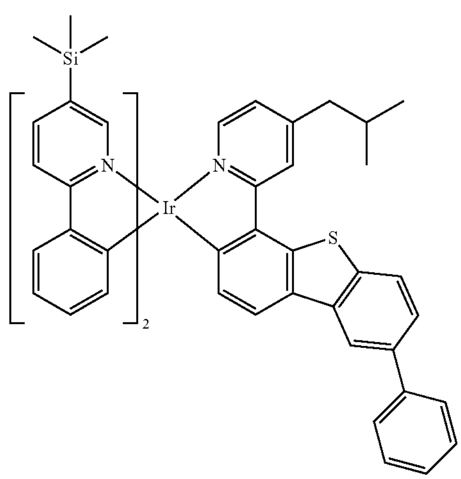

-continued
786
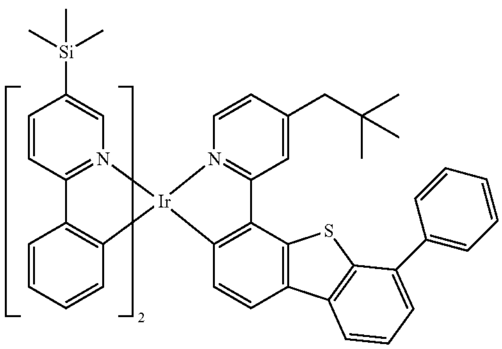
787
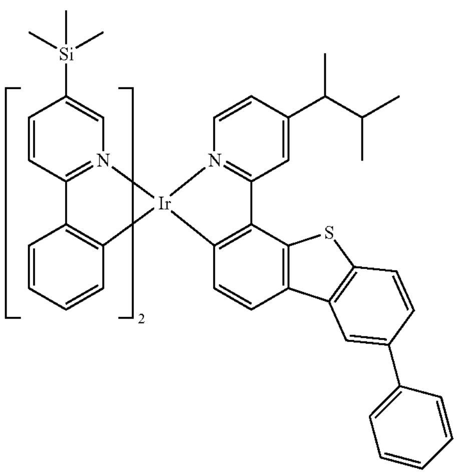
788
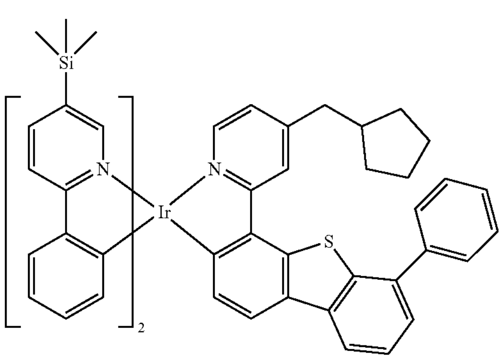
-continued
789
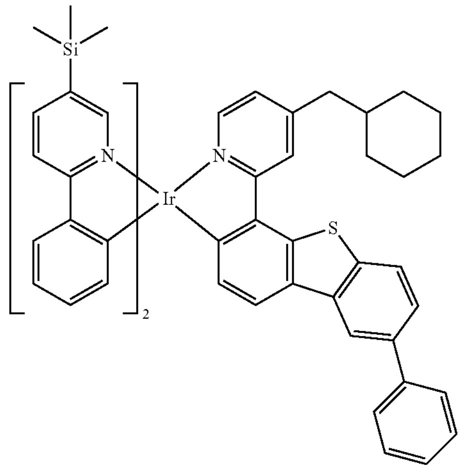
790
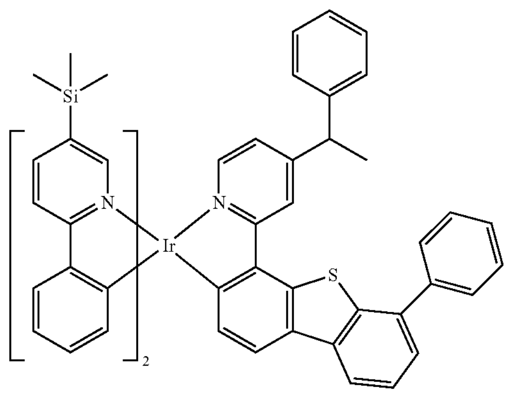
791
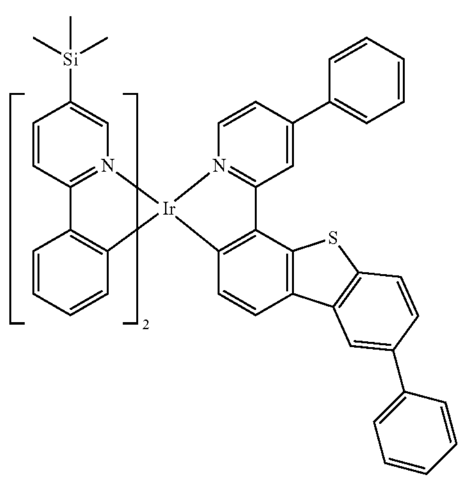

-continued
792
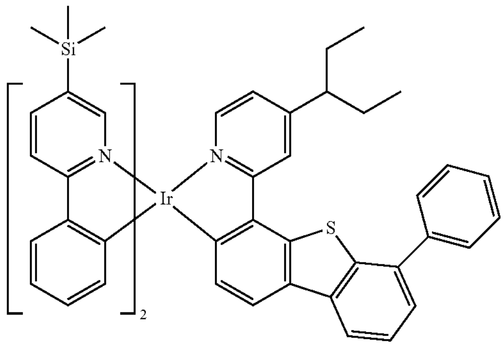
793
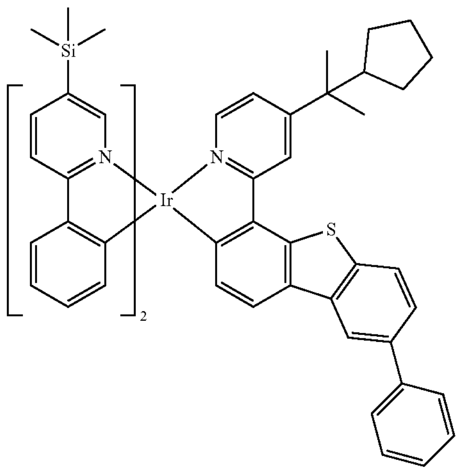
794
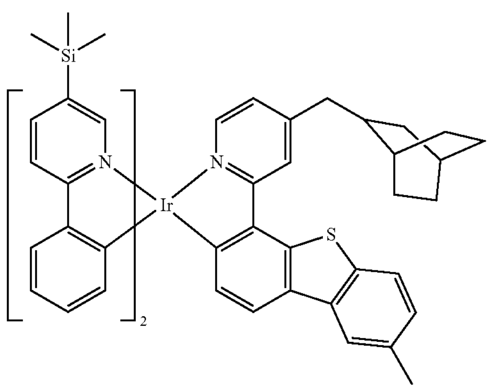
795
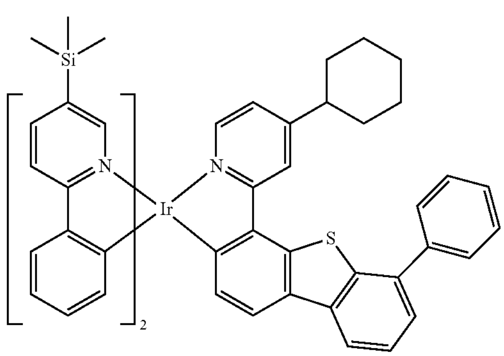
-continued
796
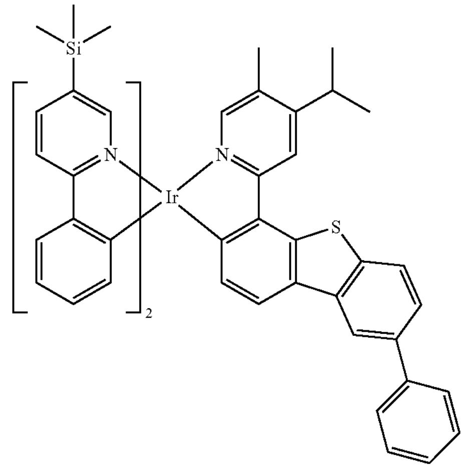
797
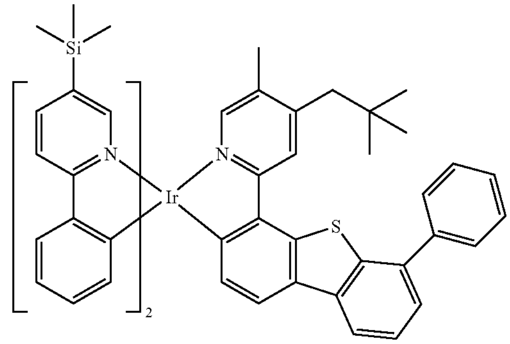
798
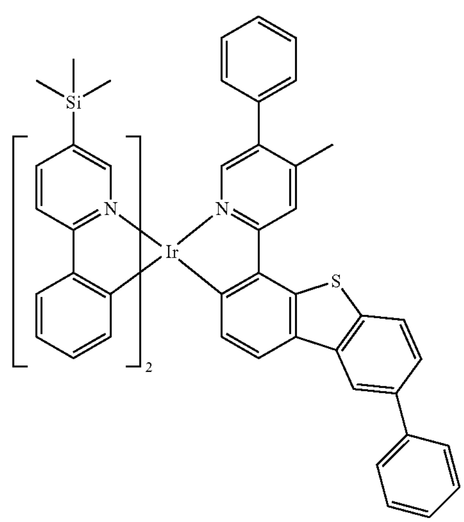

-continued
799
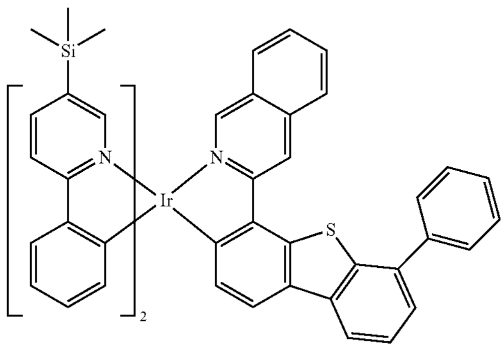
800
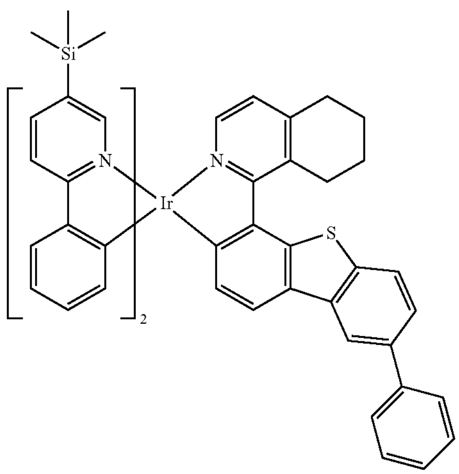
801
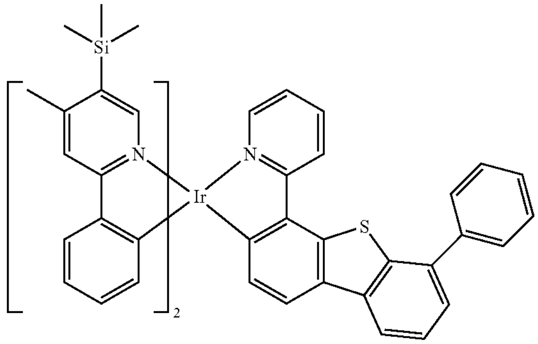
-continued
802
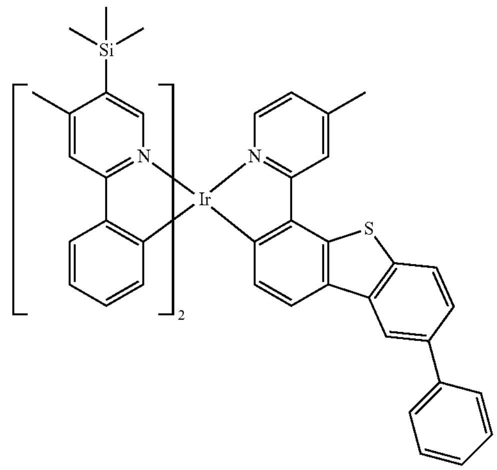
803
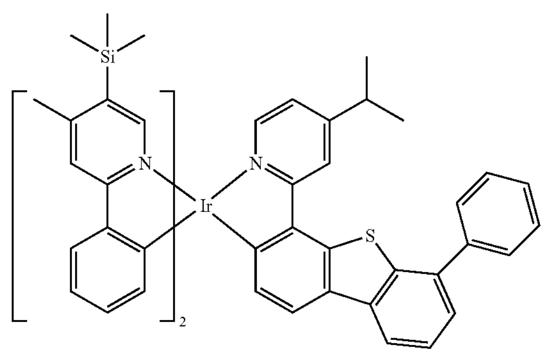
804
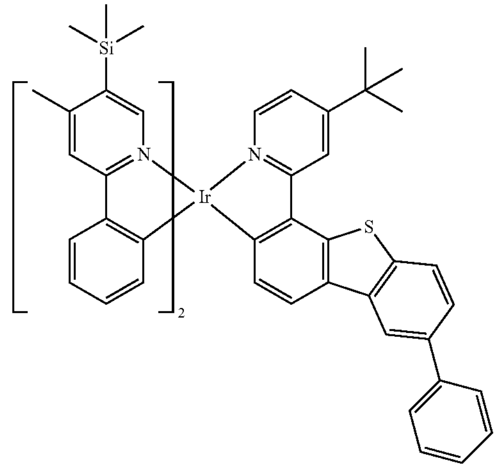

805
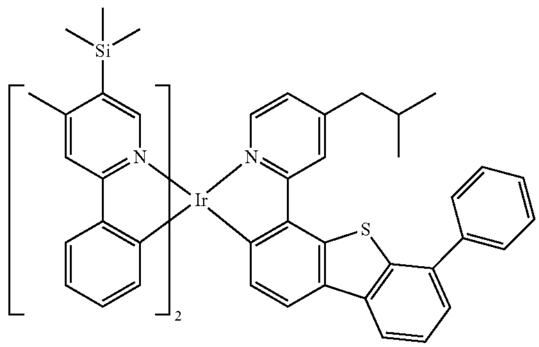
806
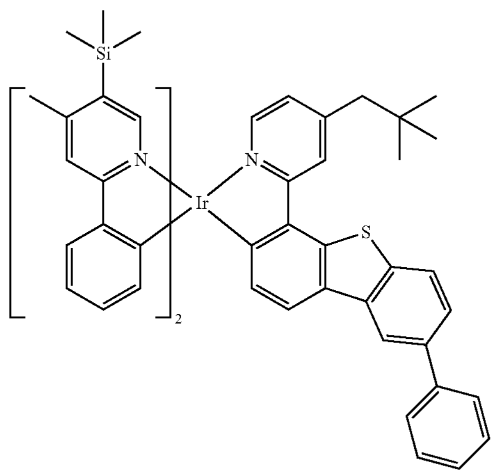
807
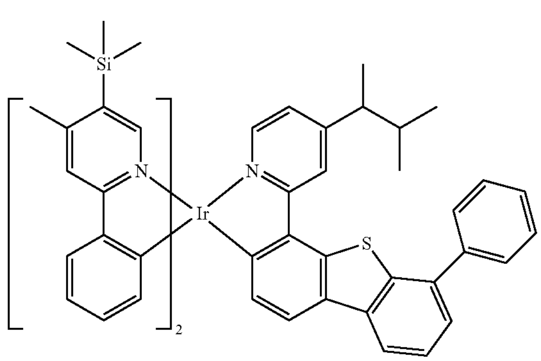
808
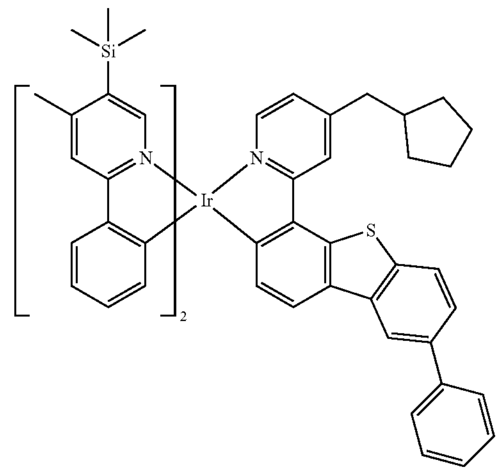
809
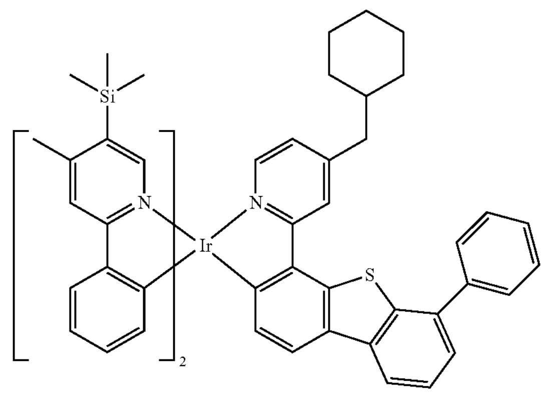
810
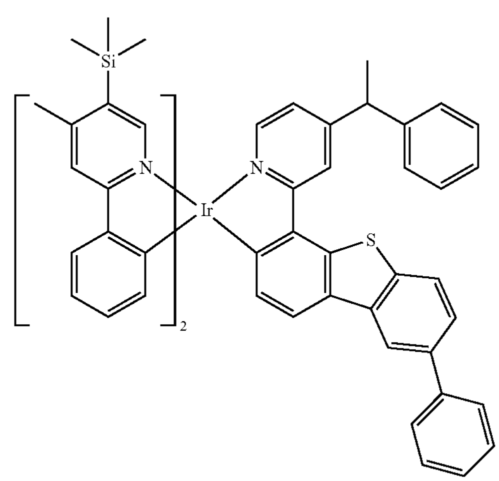

-continued
811
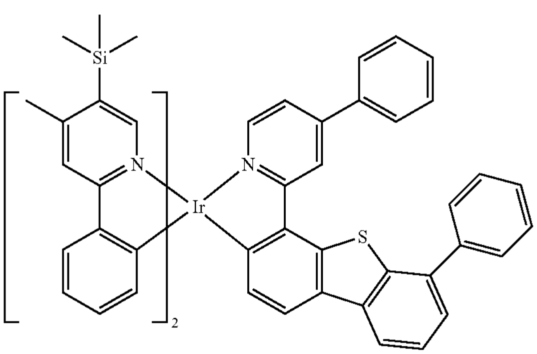
812
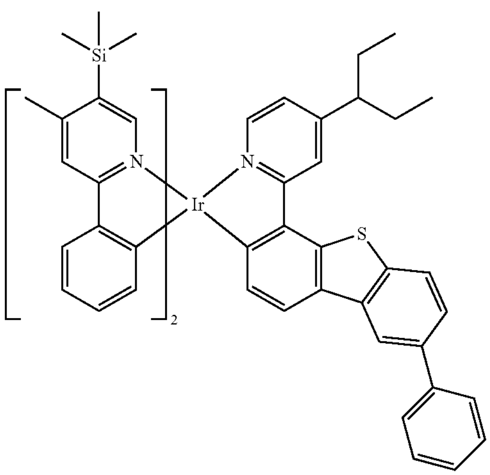
813
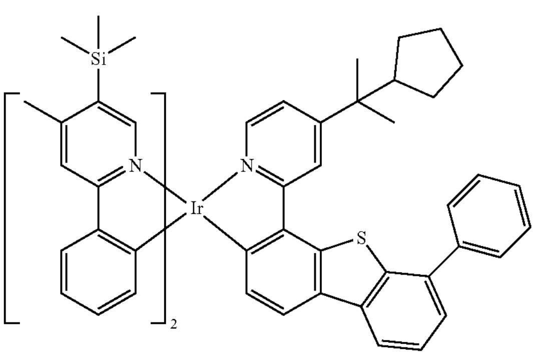
-continued
814
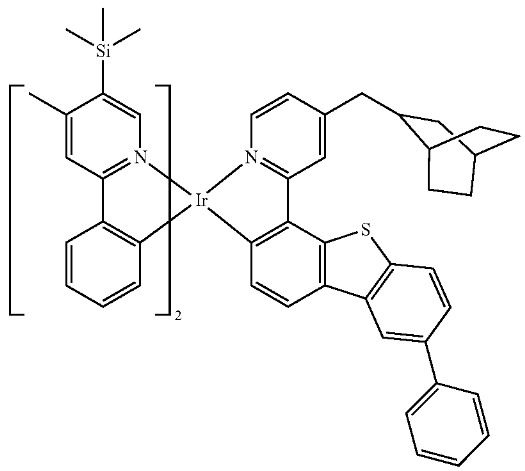
815
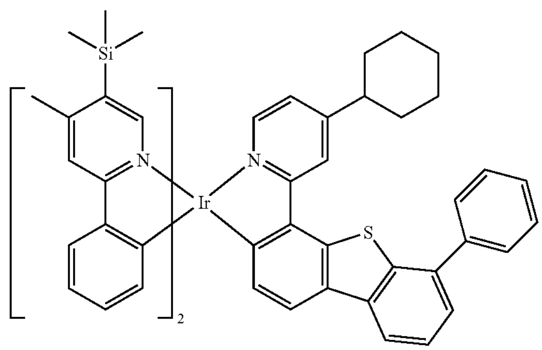
816
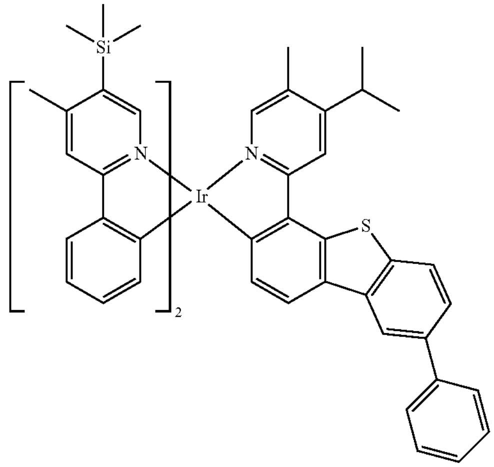

-continued
817
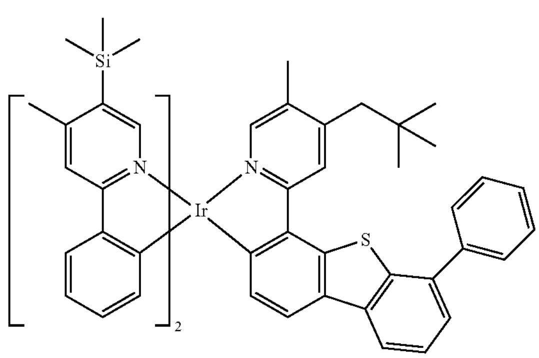
818
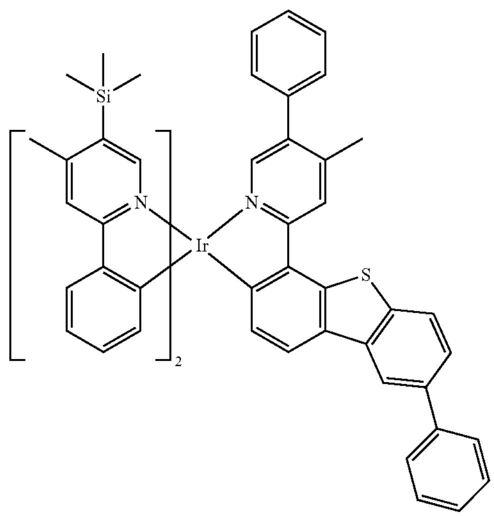
819
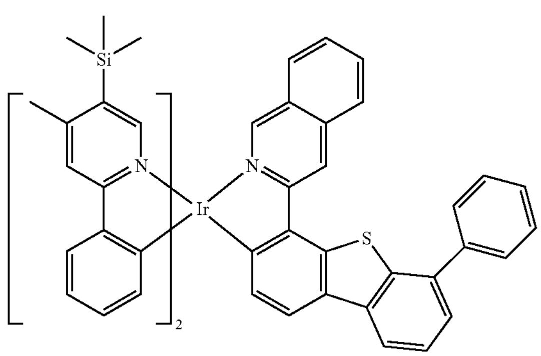
-continued
820
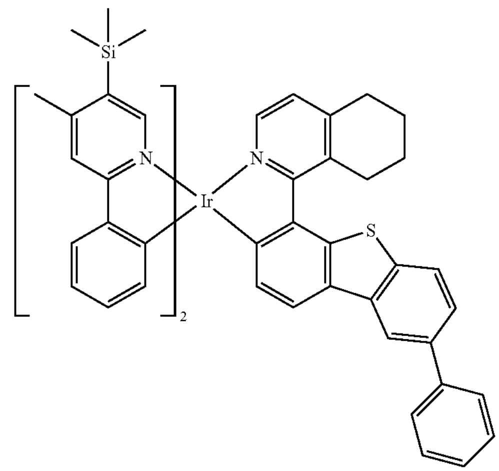
821
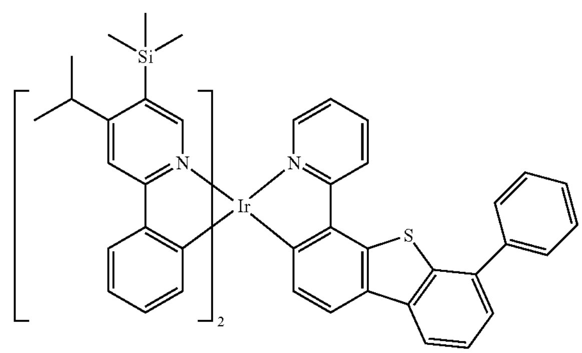
822
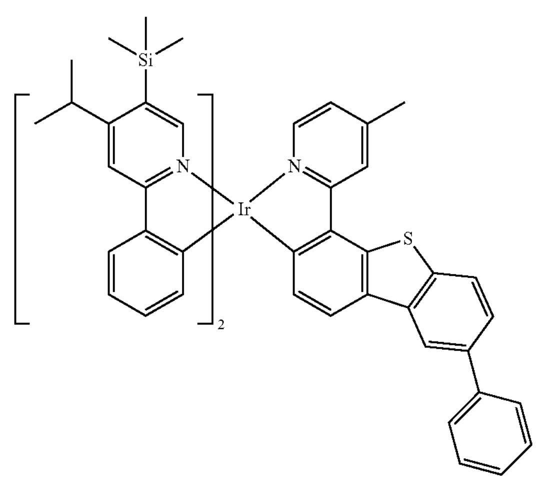

-continued
823
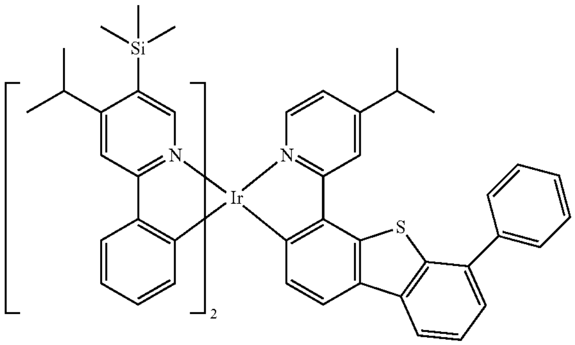
824
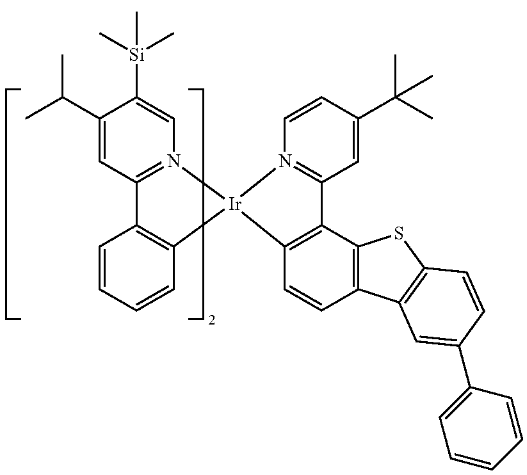
825
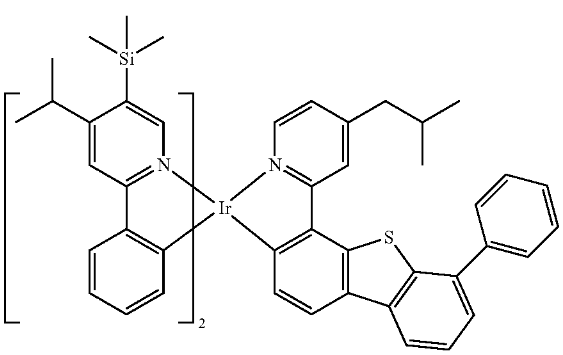
-continued
826
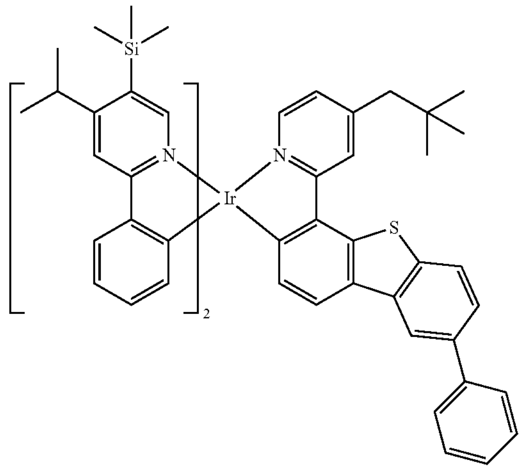
827
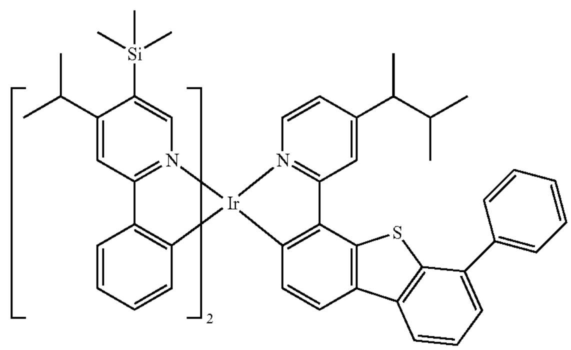
828
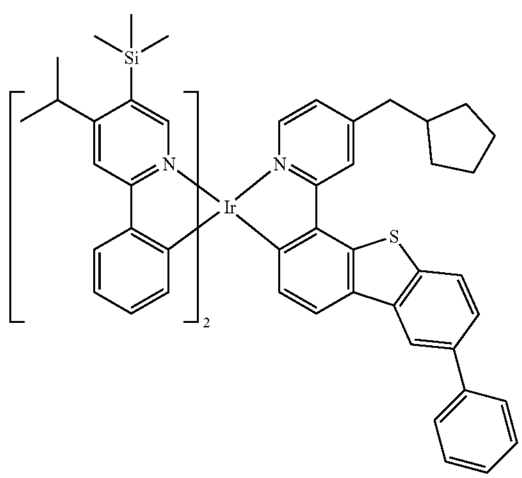

-continued
829
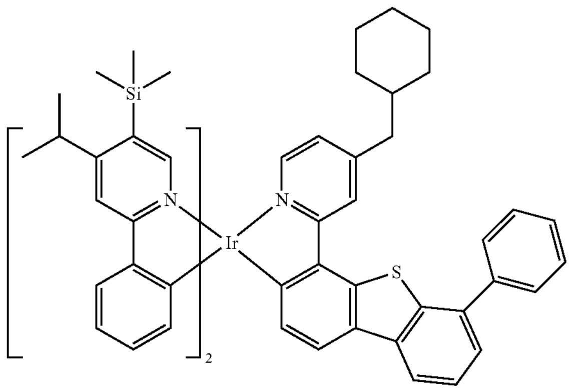
830
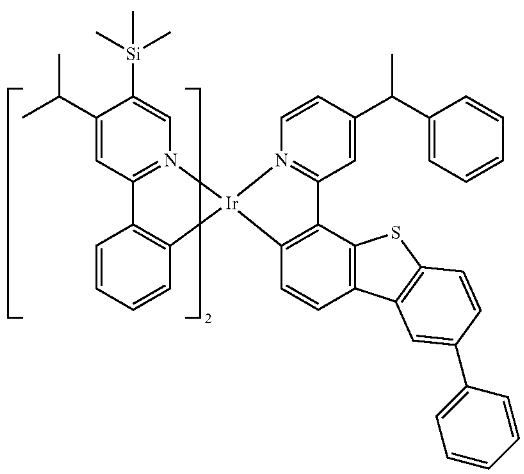
831
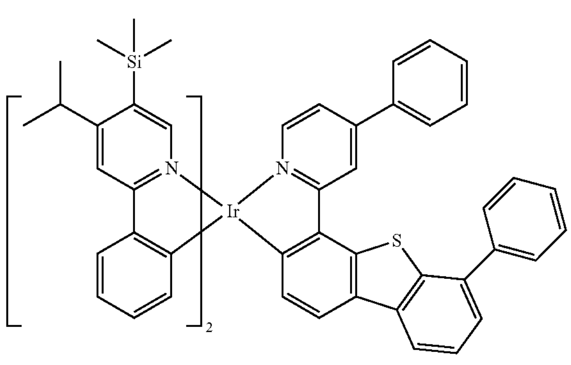
-continued
832
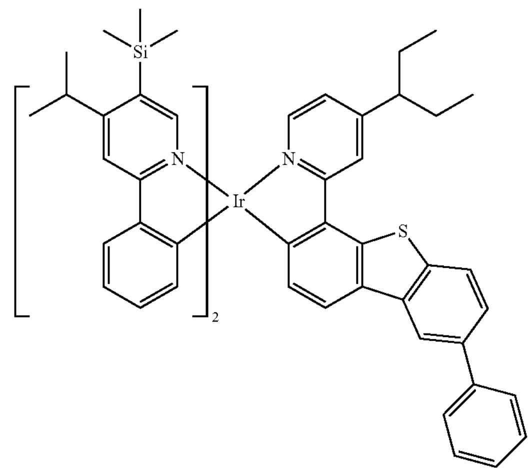
833
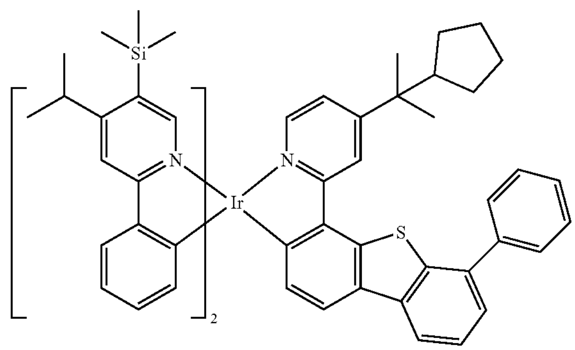
834
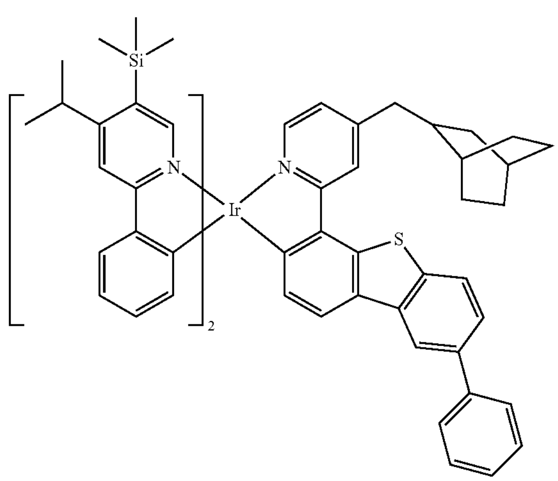

-continued
835
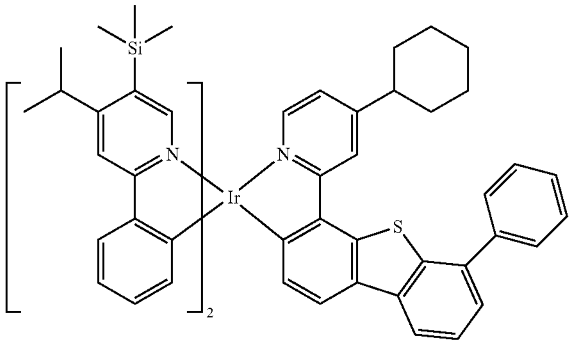
836
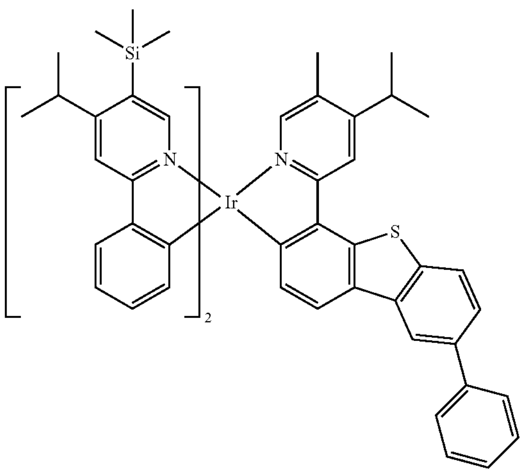
837
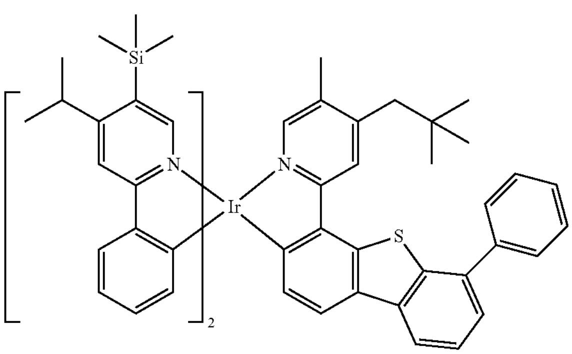
-continued
838
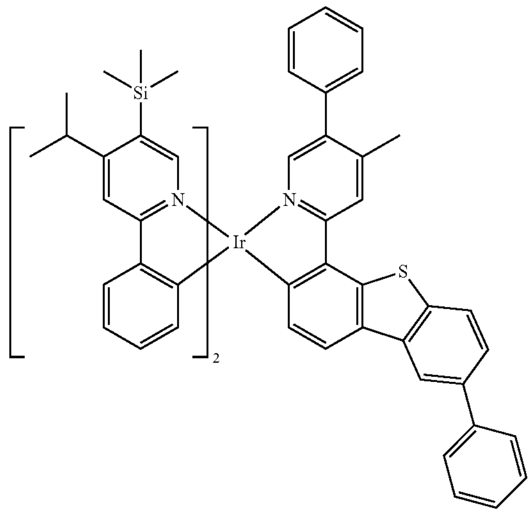
839
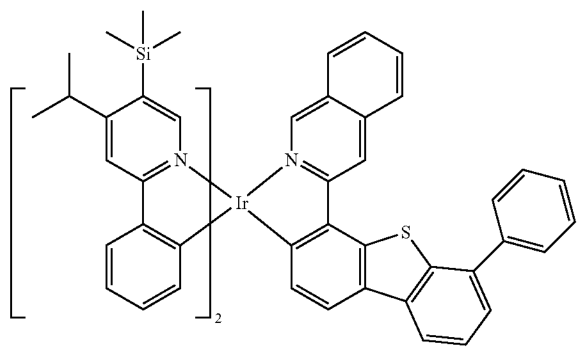
840
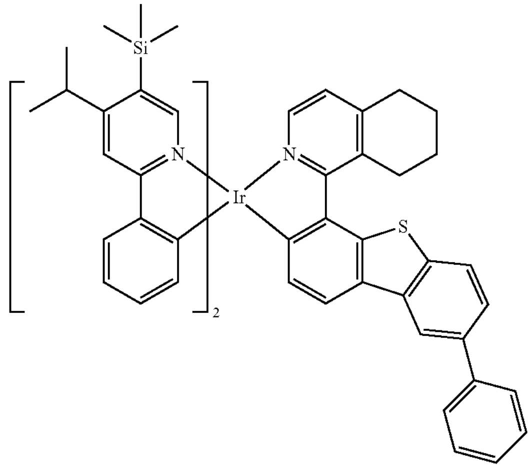

-continued
841
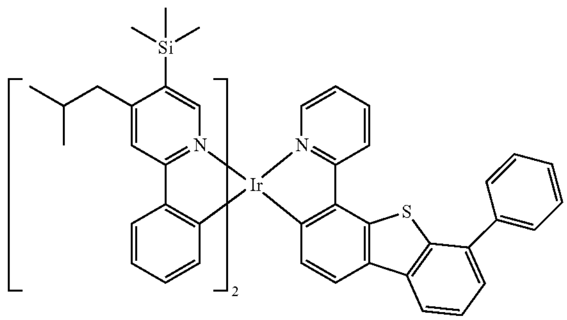
842
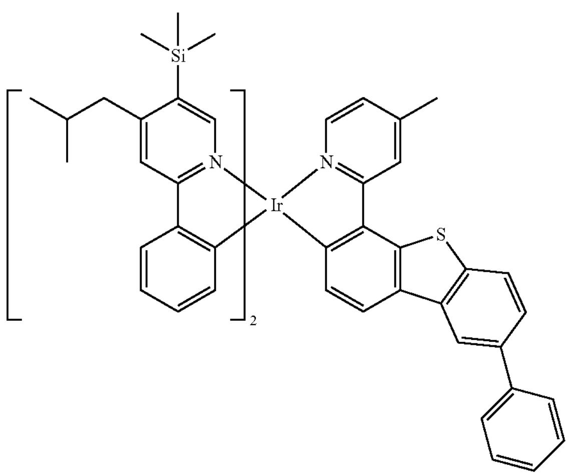
843
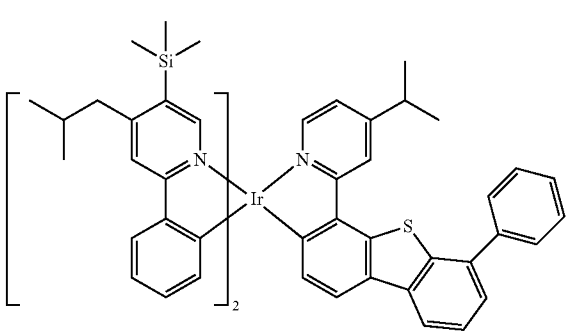
-continued
844
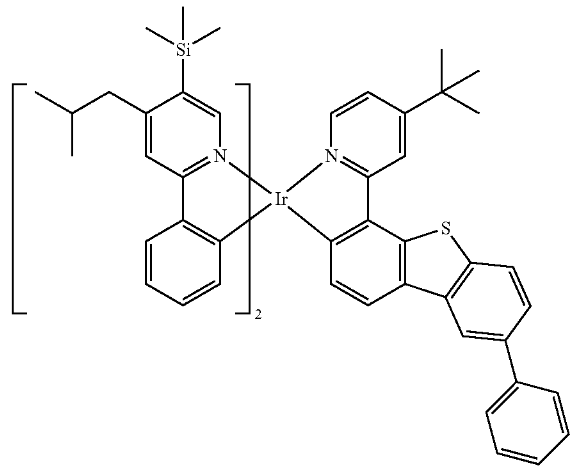
845
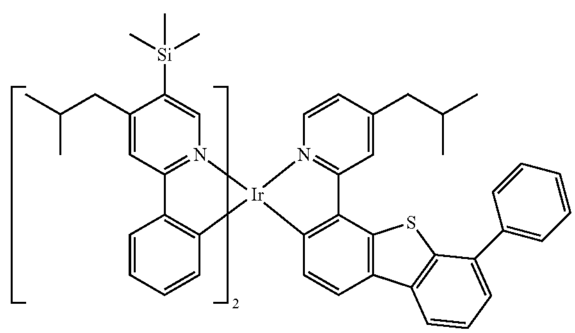
846
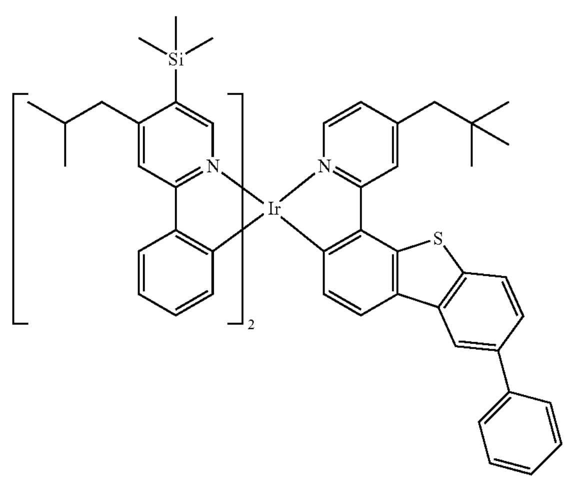

-continued
847
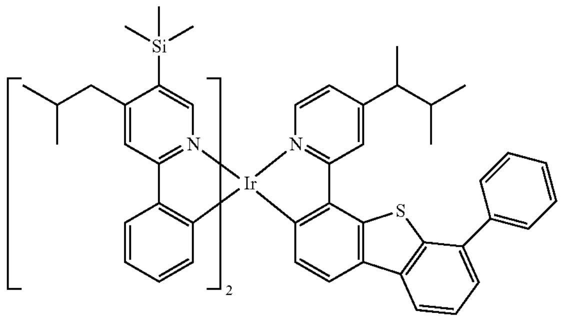
848
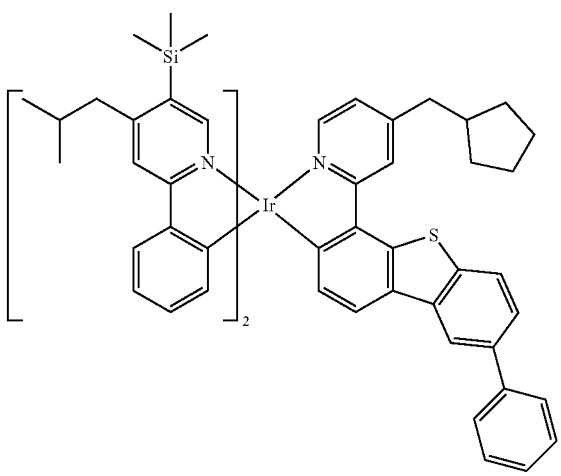
849
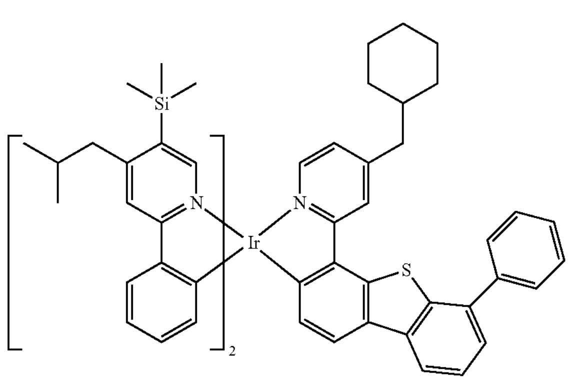
-continued
850
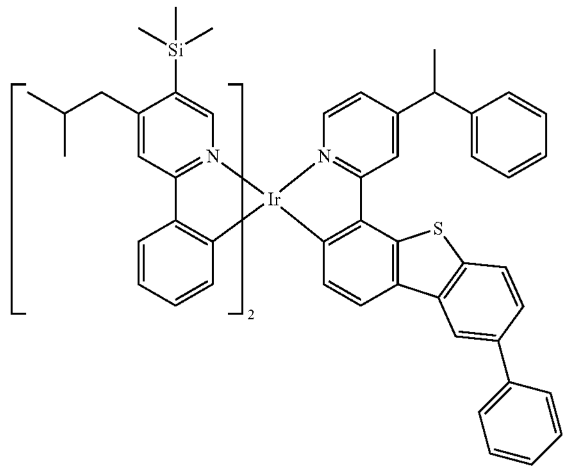
851
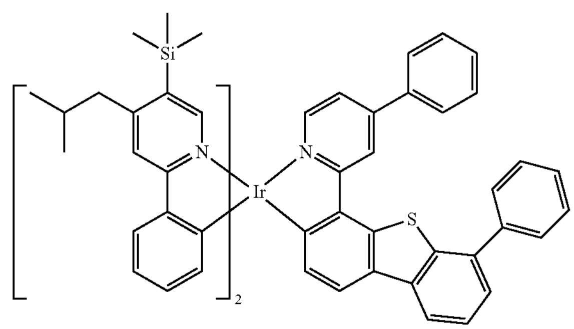
852
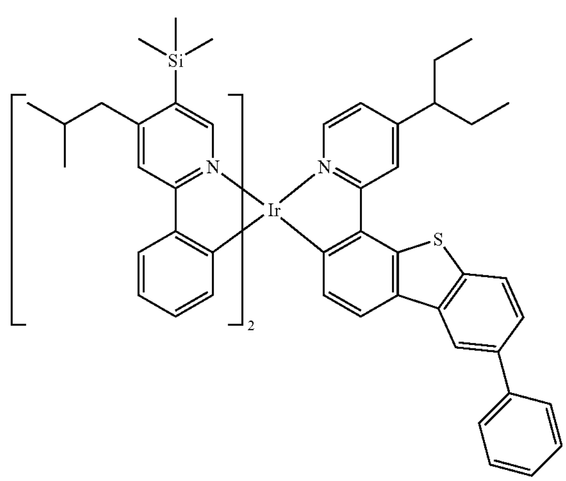

853
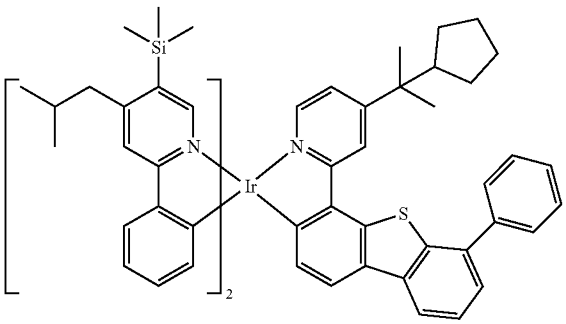
854
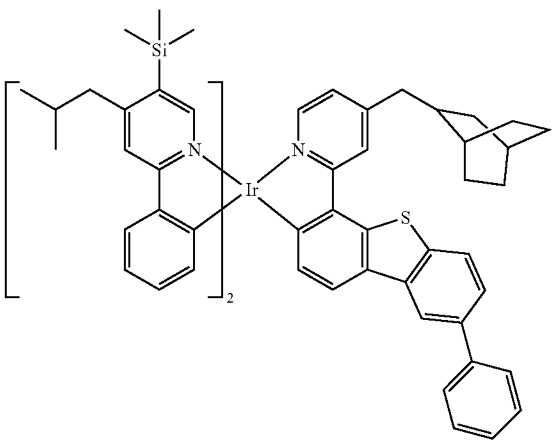
855
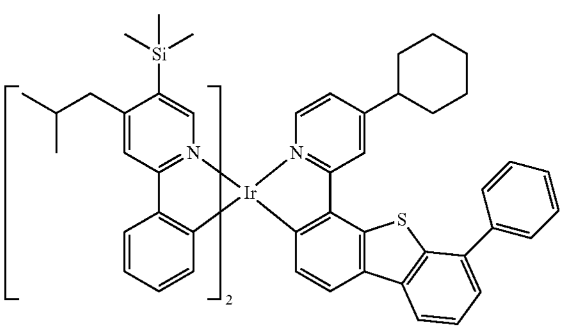
856
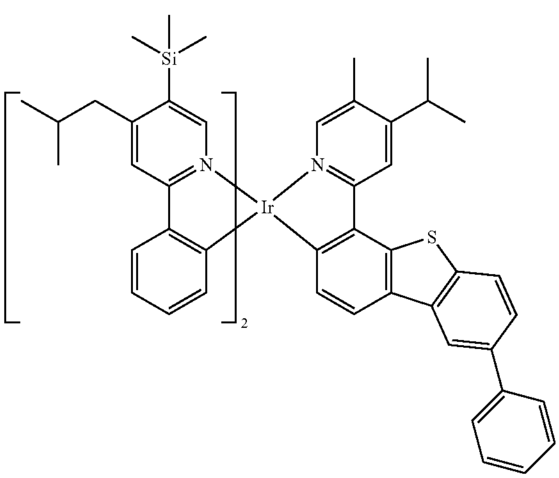
857
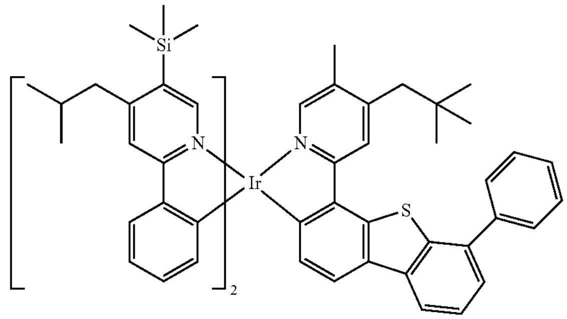
858
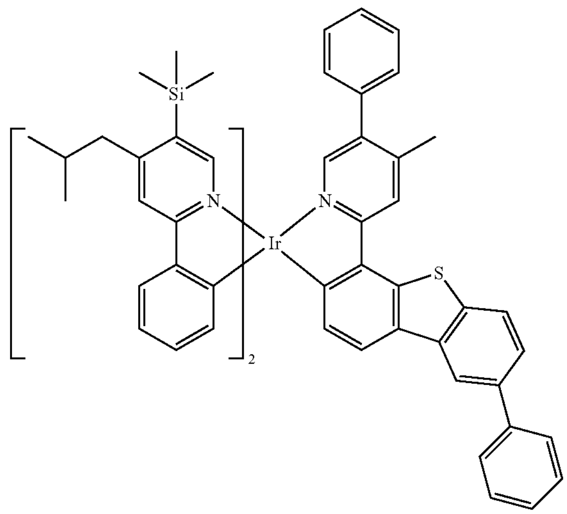
859
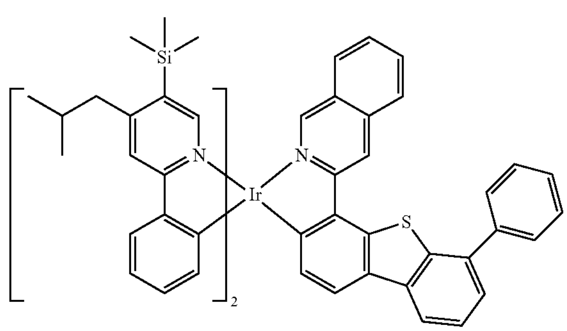

-continued
860
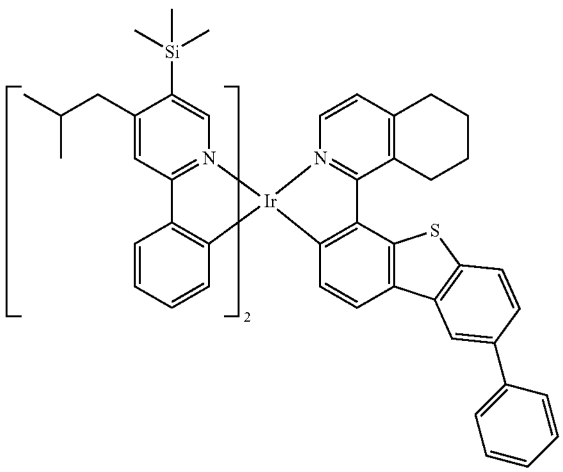
861
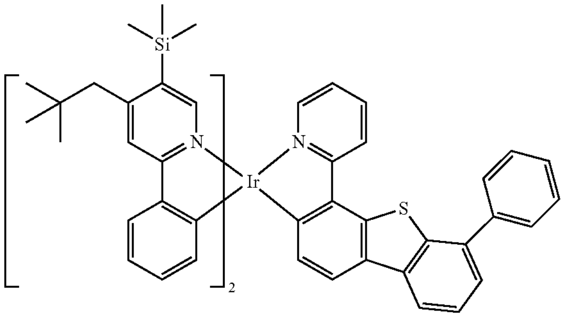
862
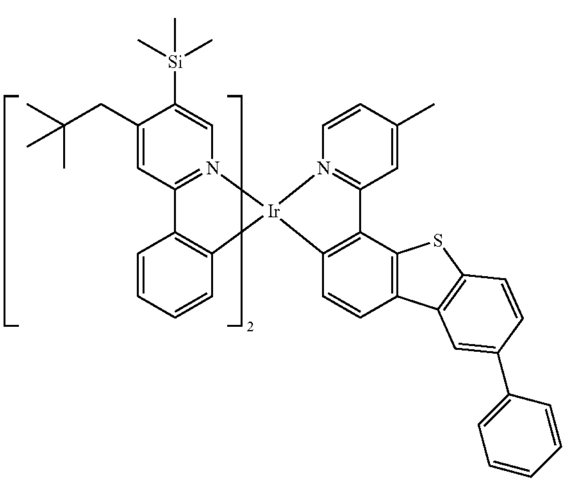
-continued
863
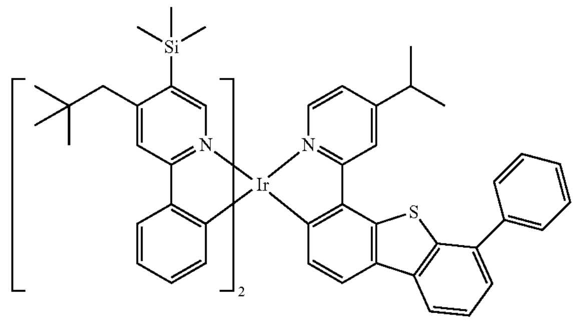
864
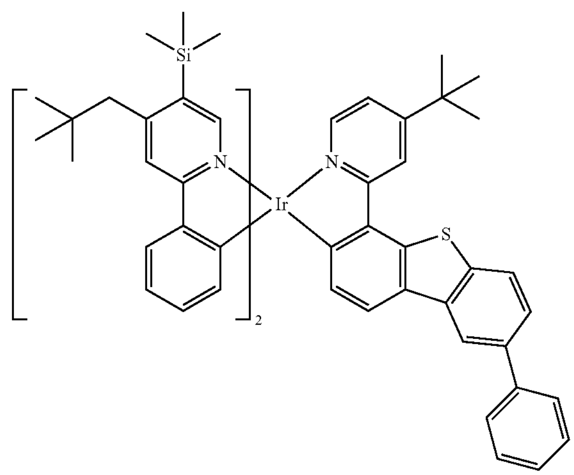
865
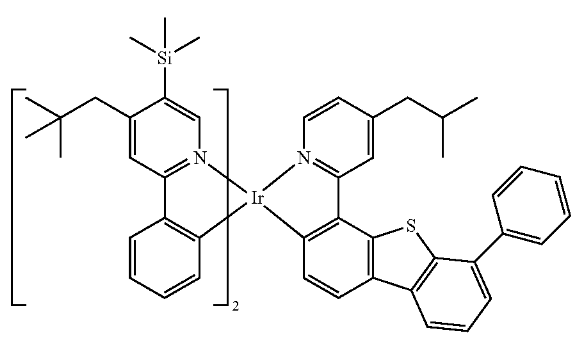

-continued
866
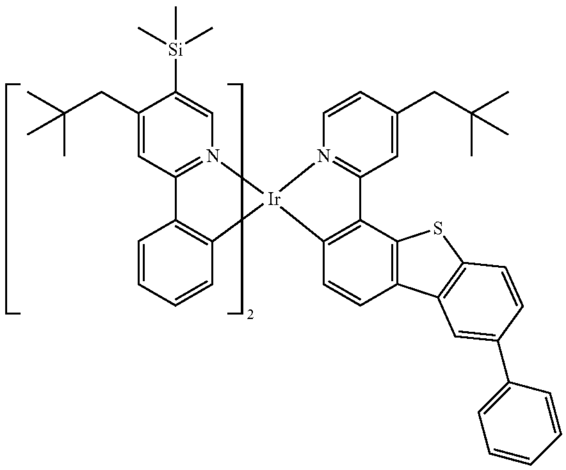
867
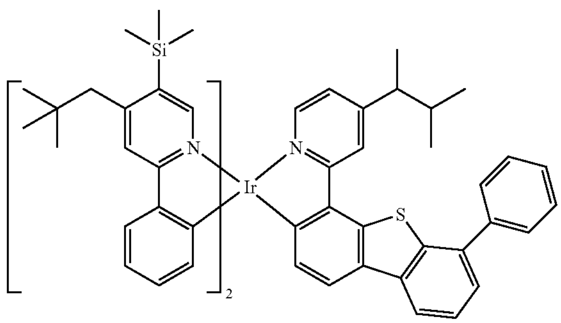
868
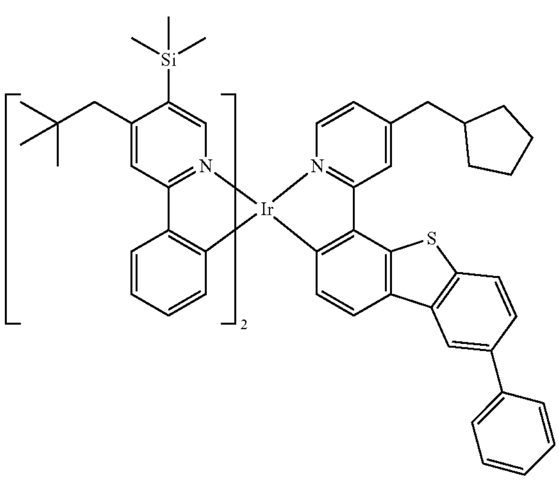
-continued
869
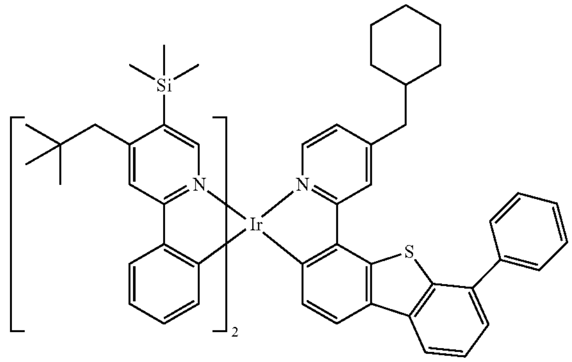
870
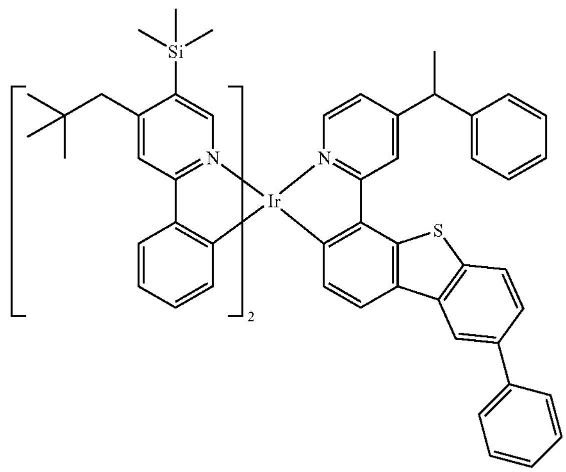
871
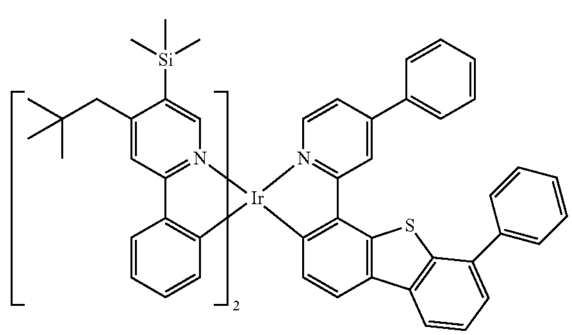

-continued
872
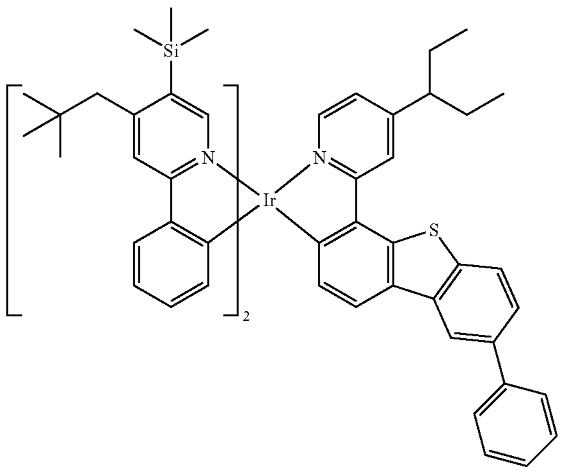
873
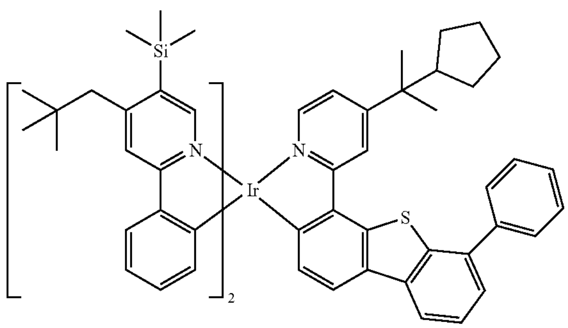
874
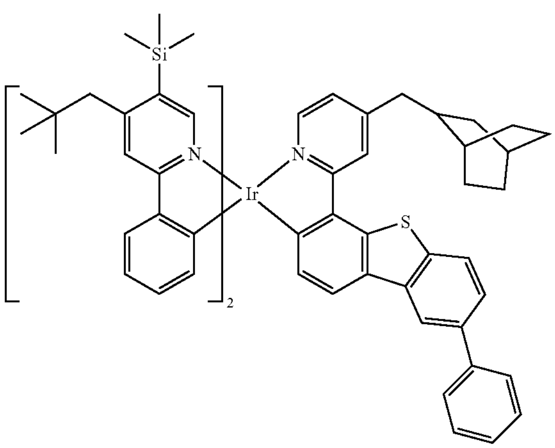
875
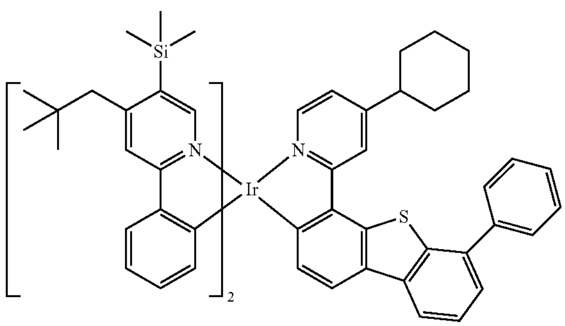
-continued
876
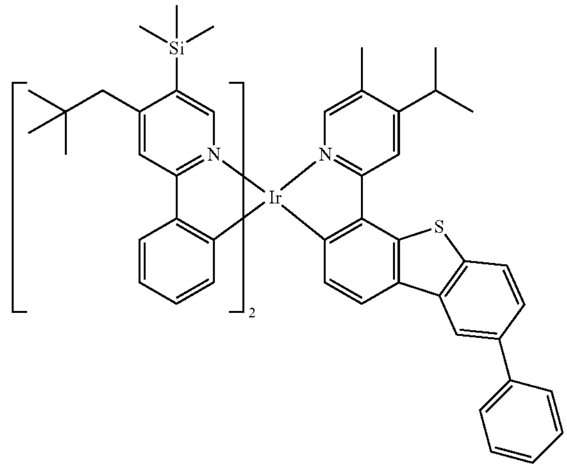
877
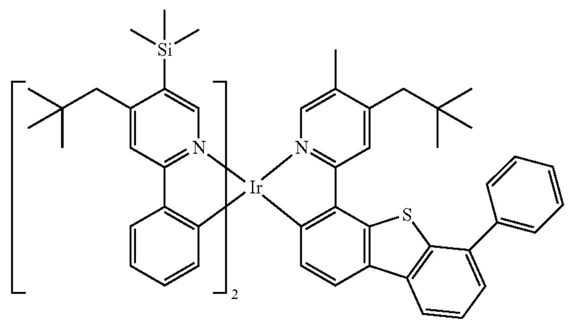
878
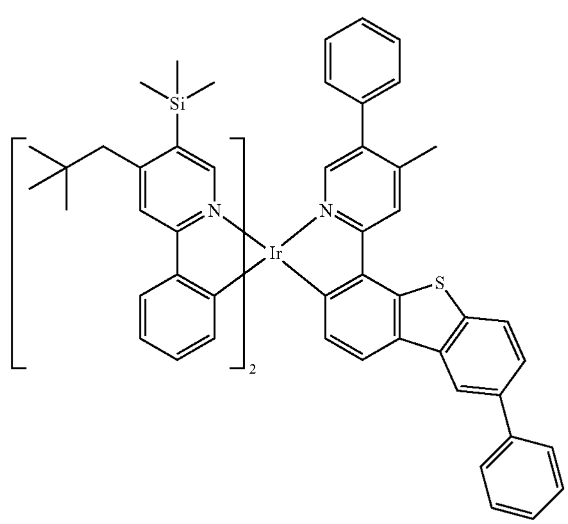

-continued
879
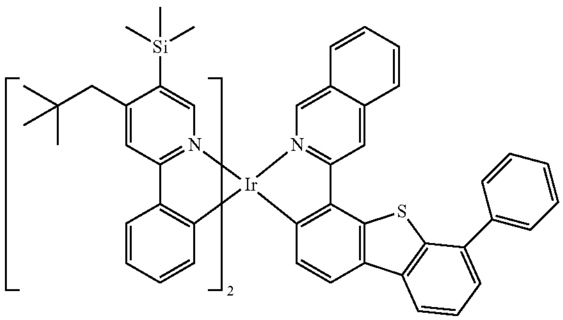
880
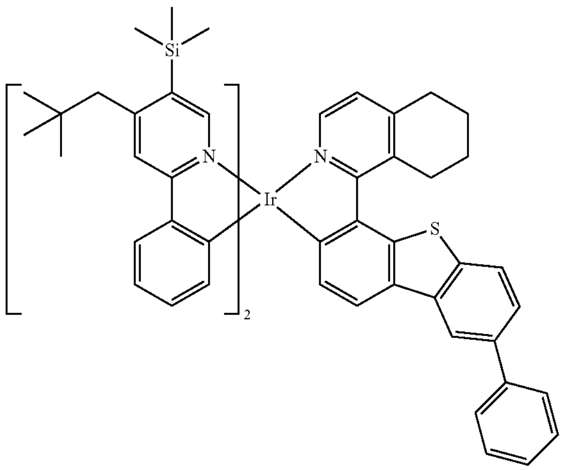
881
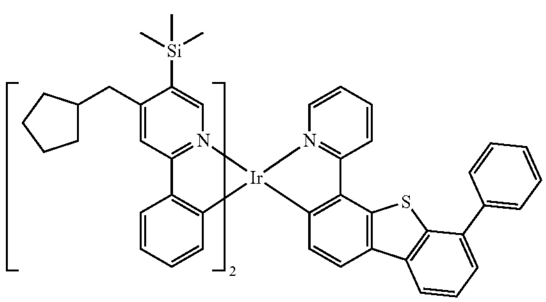
882
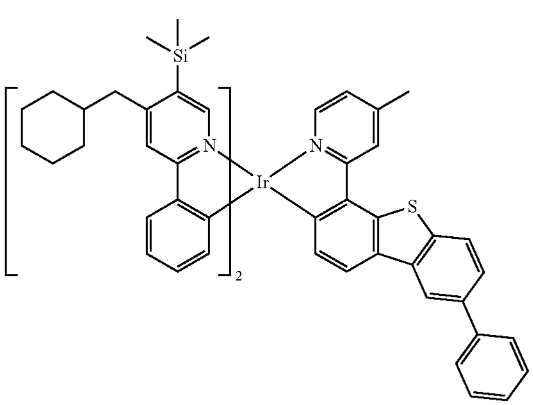
-continued
883
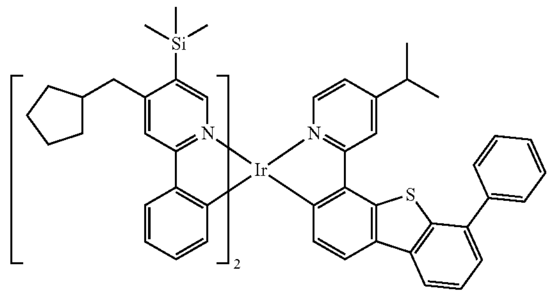
884
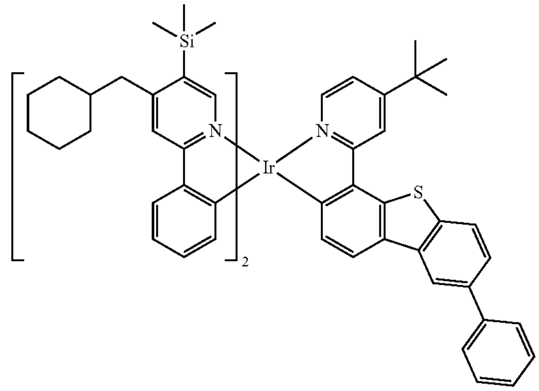
885
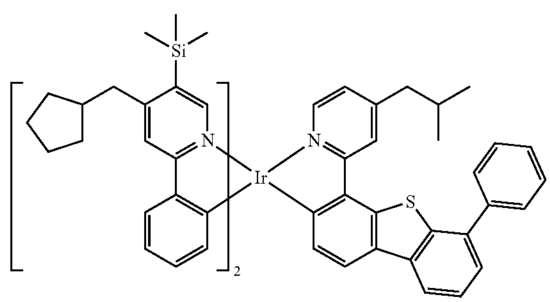
886
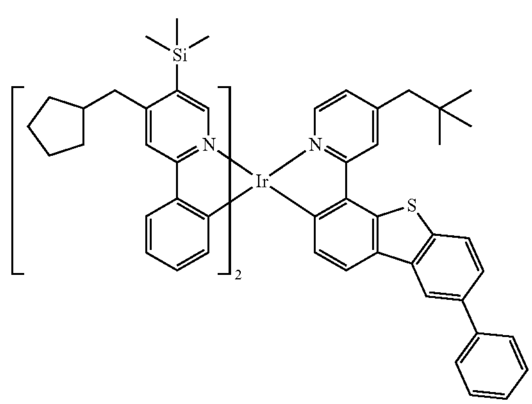

-continued
887
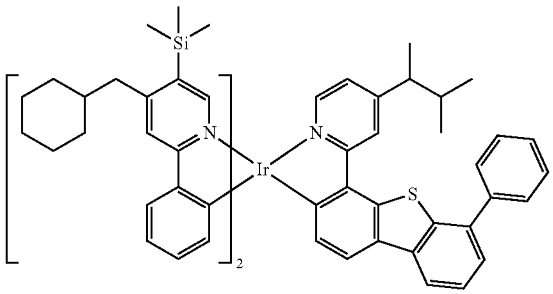
888
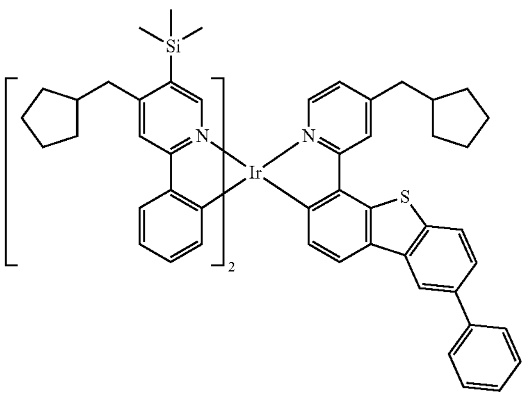
889
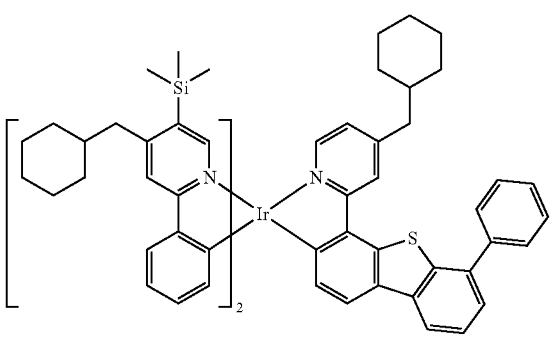
890
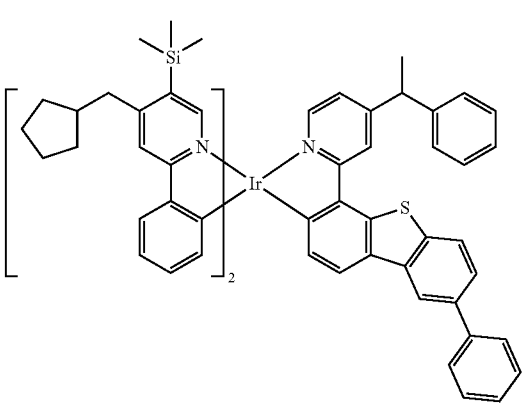
-continued
891
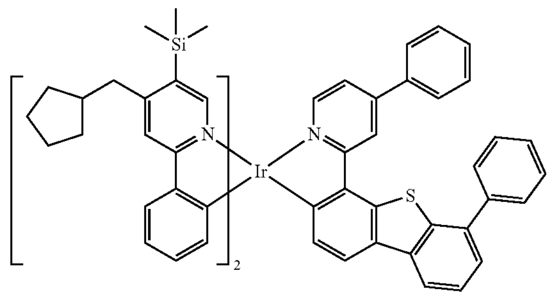
892
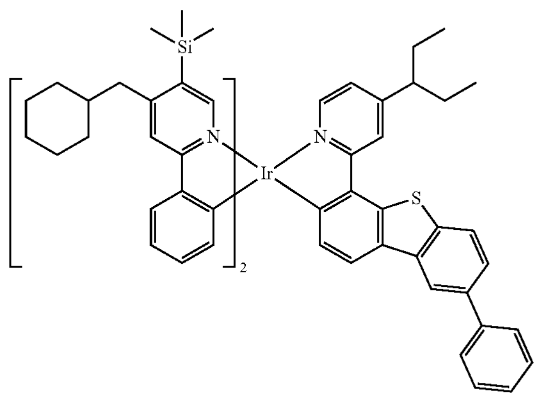
893
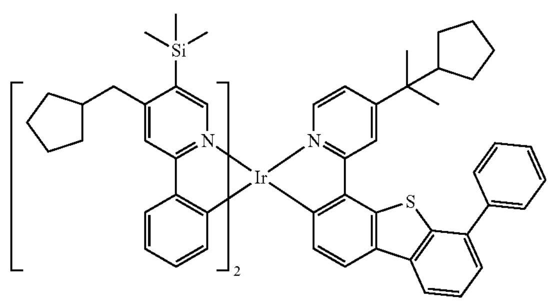
894
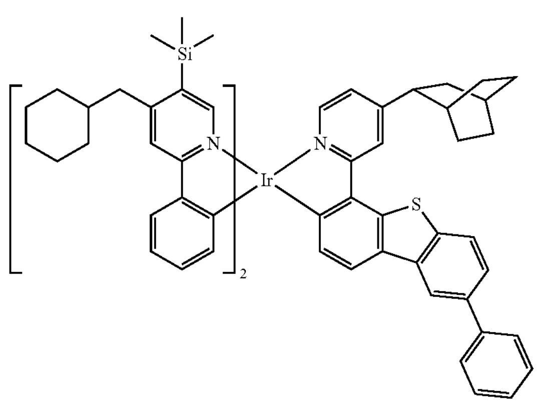

-continued
895
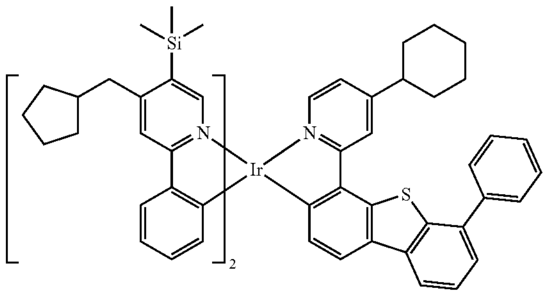
896
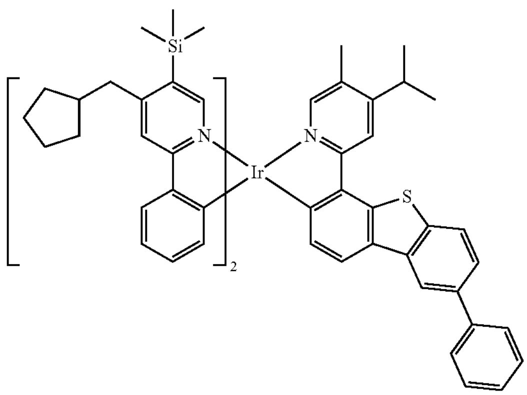
897
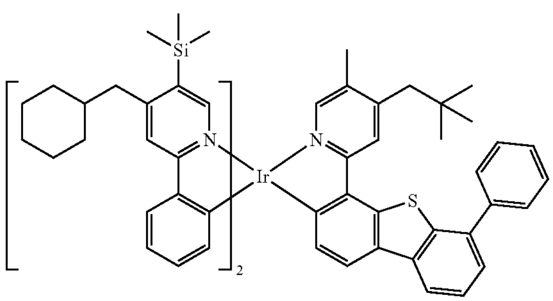
898
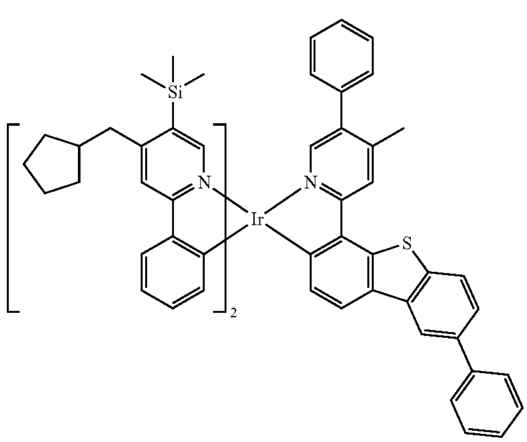
-continued
899
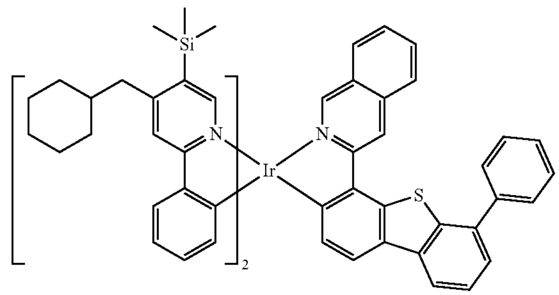
900
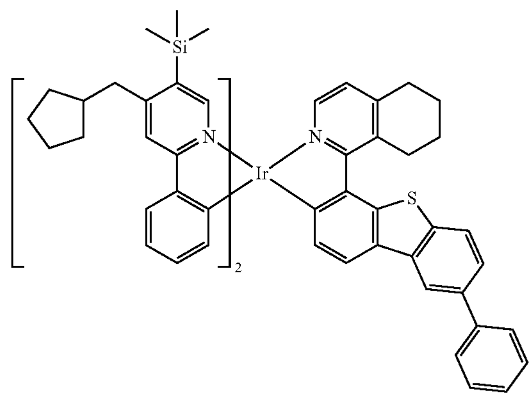
901
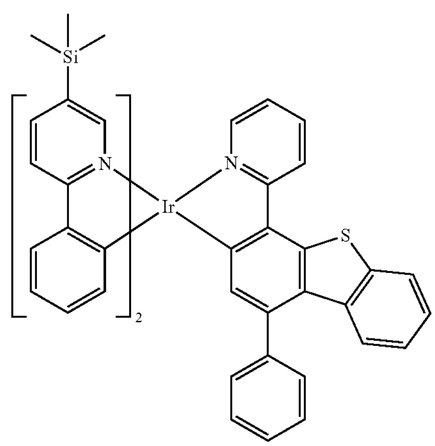
902
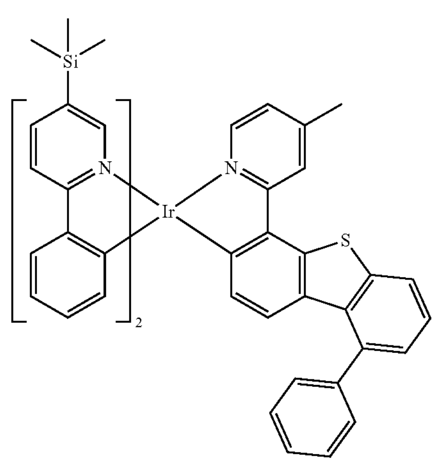

-continued
903
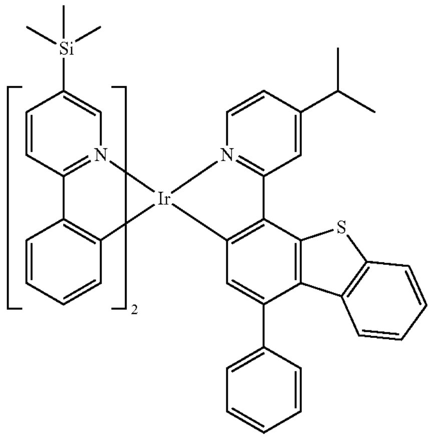
904
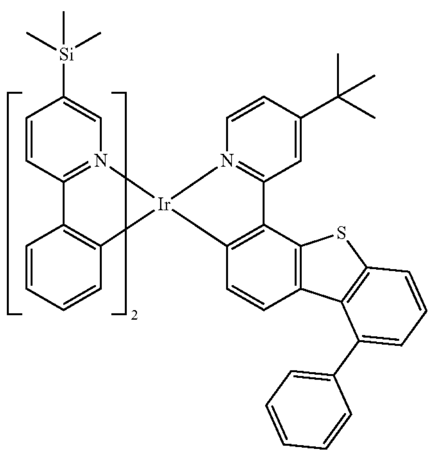
905
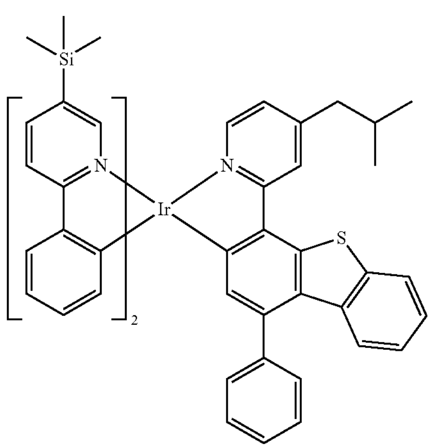
-continued
906
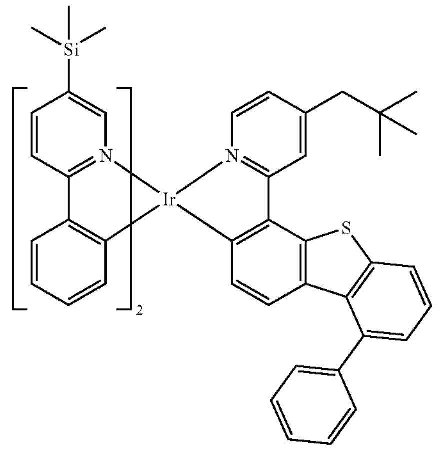
907
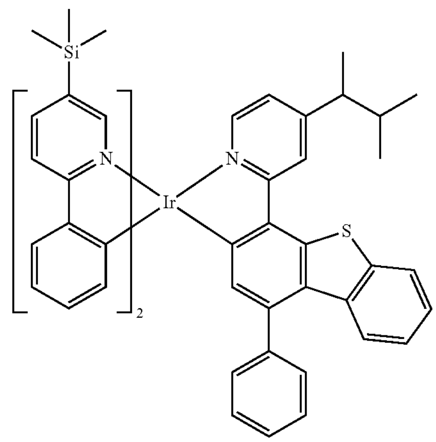
908
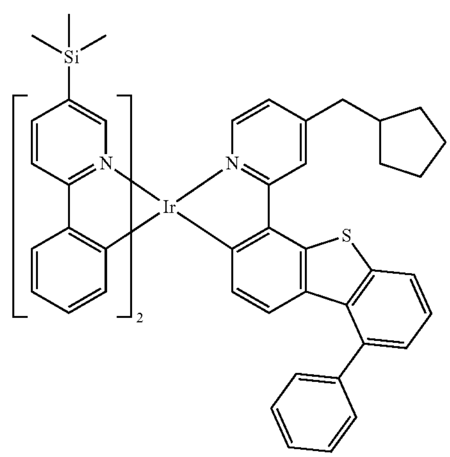

-continued
909
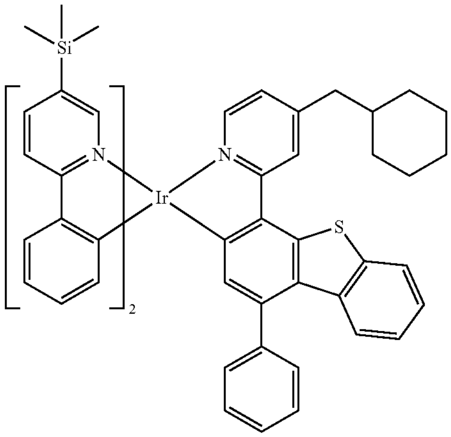
910
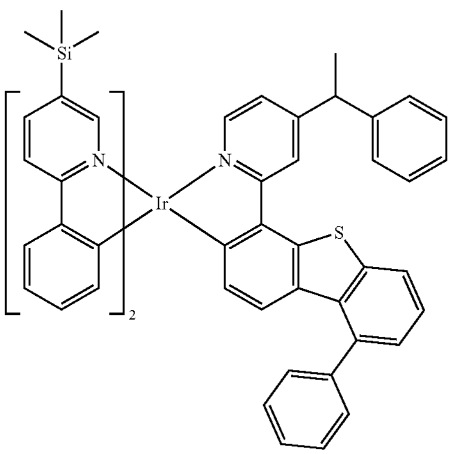
911
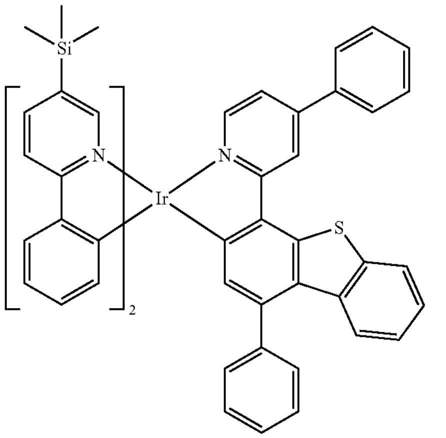
-continued
912
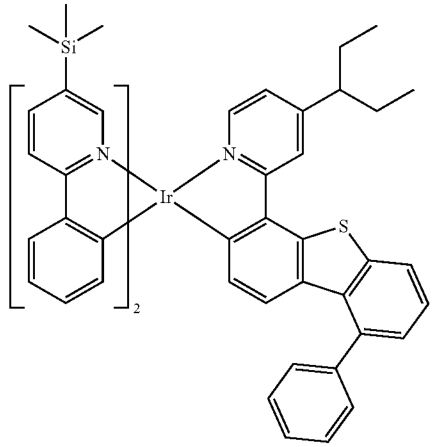
913
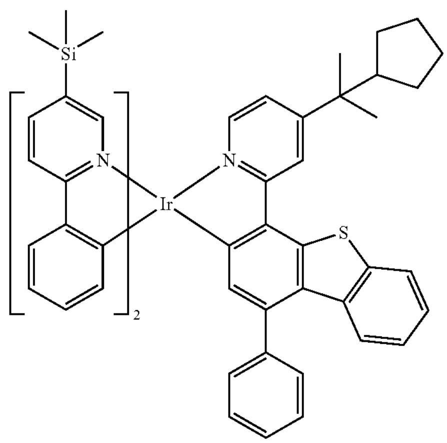
914
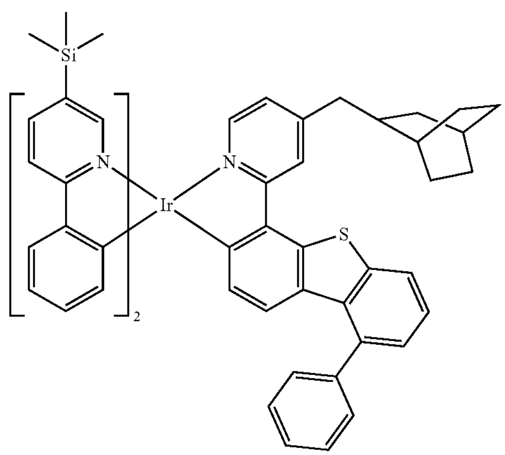

-continued
915
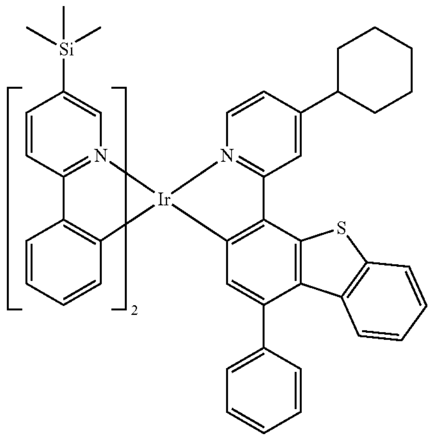
916
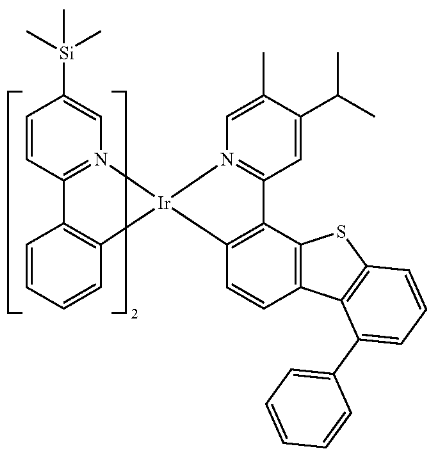
917
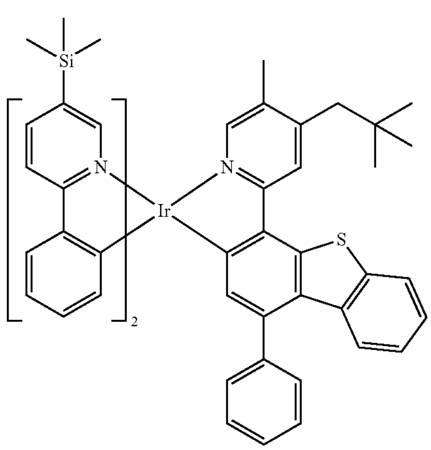
-continued
918
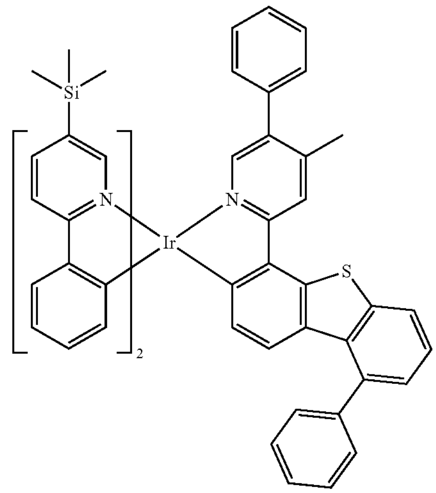
919
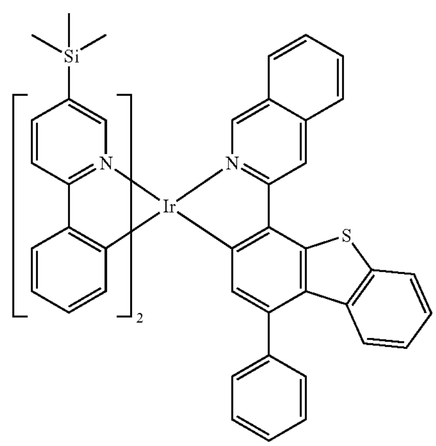
920
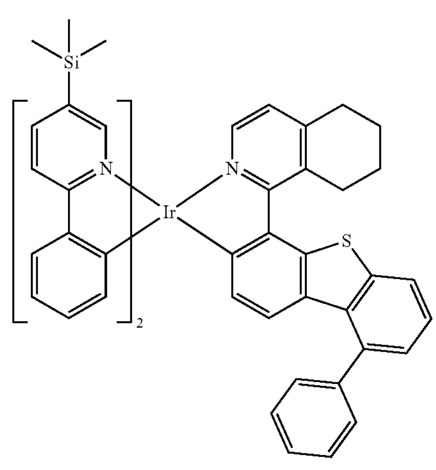

-continued
921
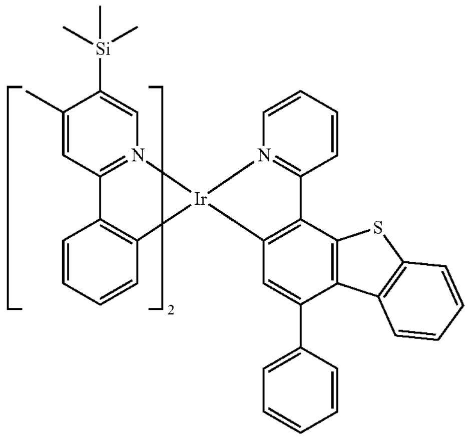
922
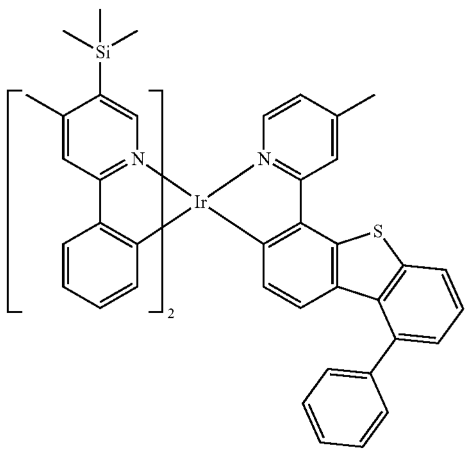
923
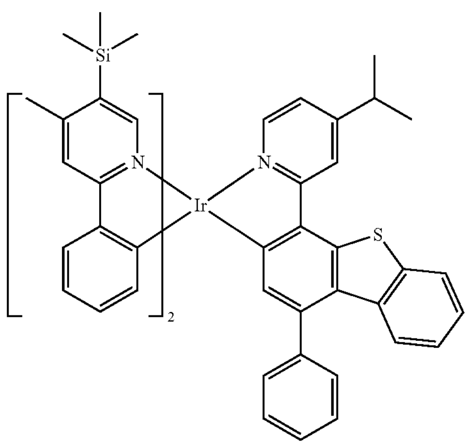
-continued
924
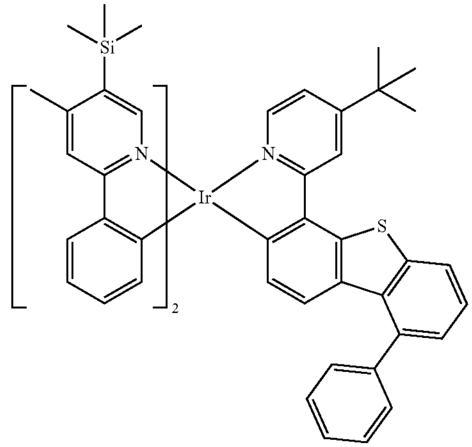
925
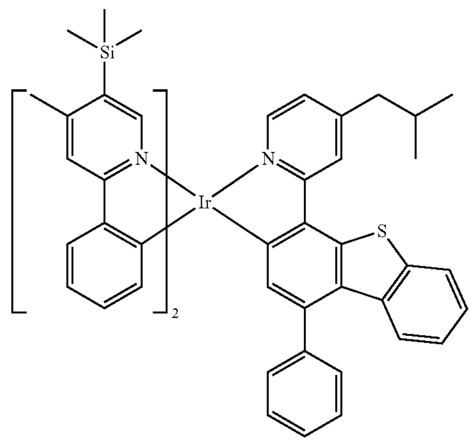
926
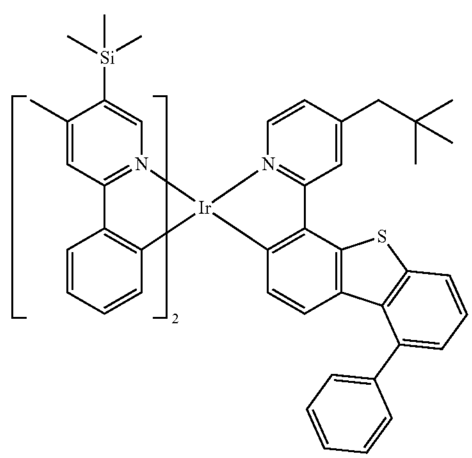

-continued
927
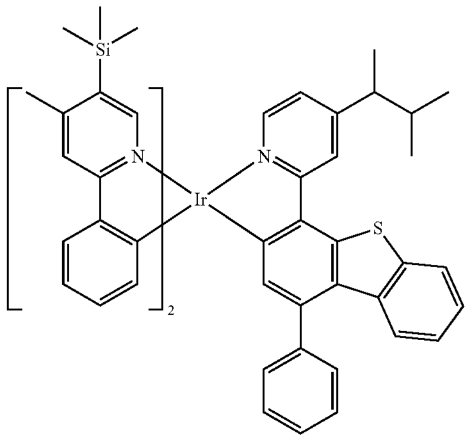
928
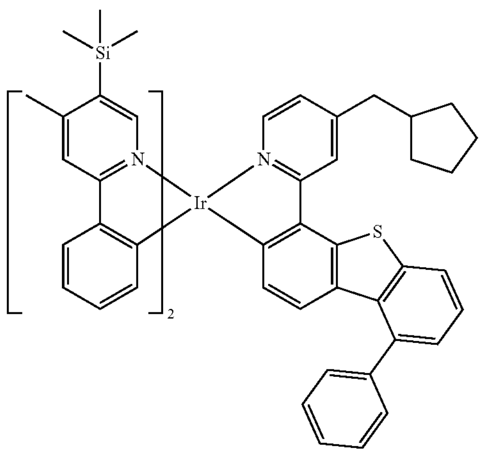
929
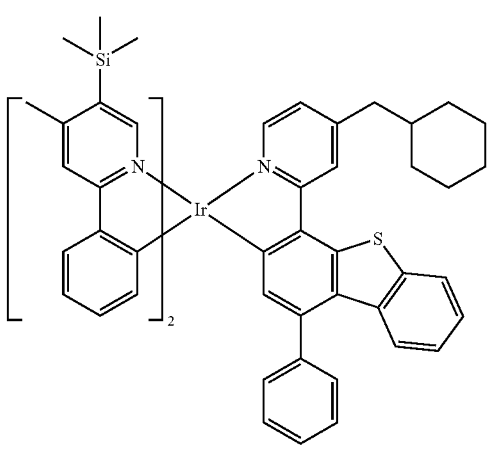
-continued
930
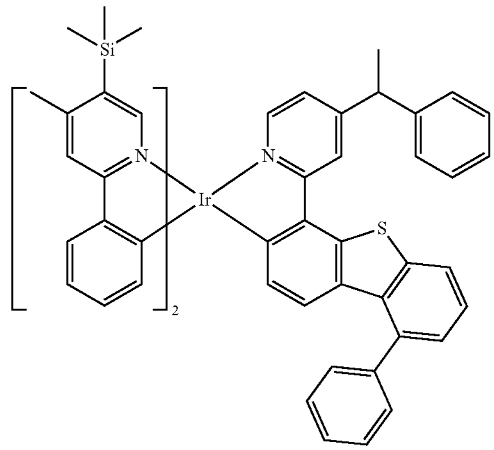
931
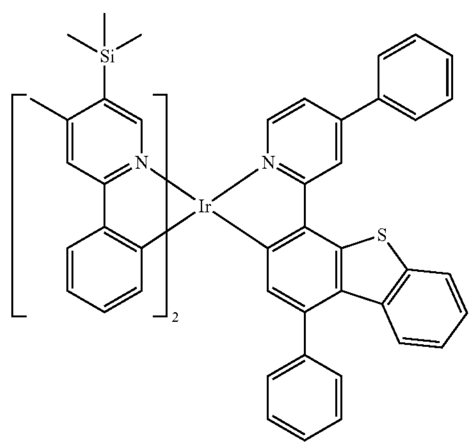
932
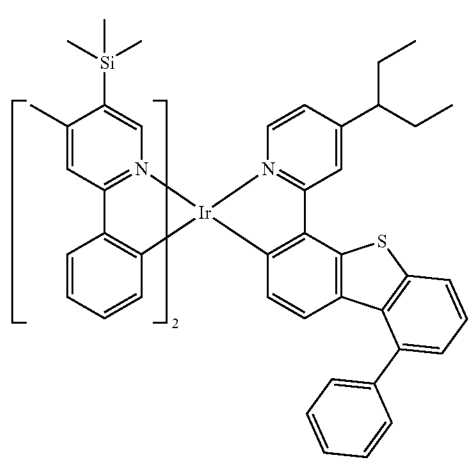

-continued
933
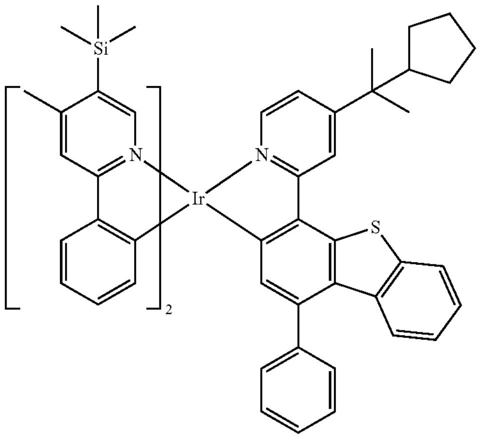
934
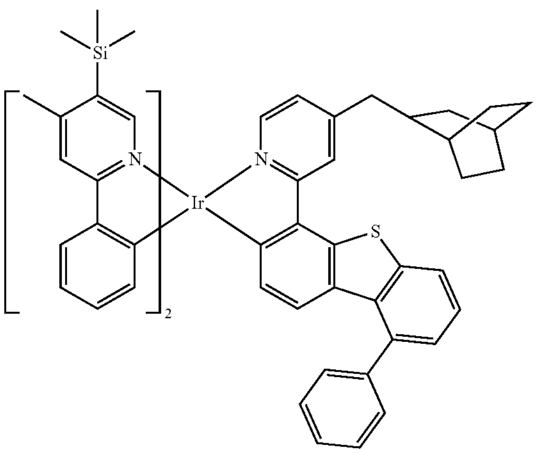
935
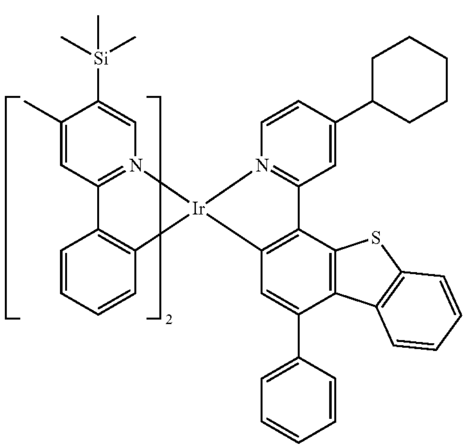
-continued
936
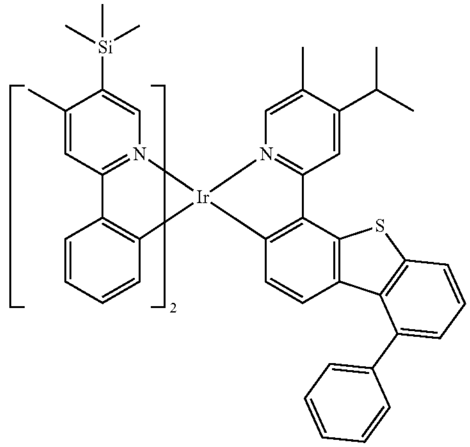
937
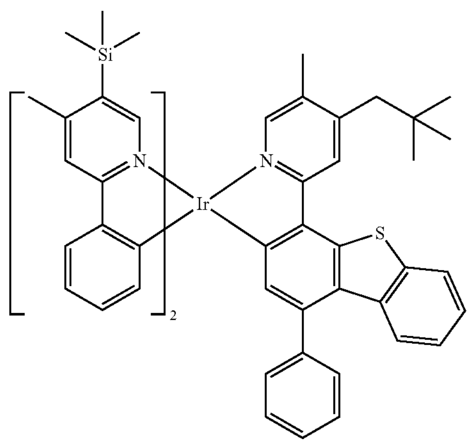
938
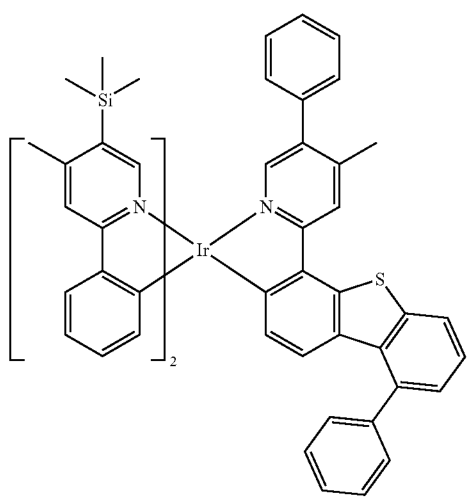

-continued
939
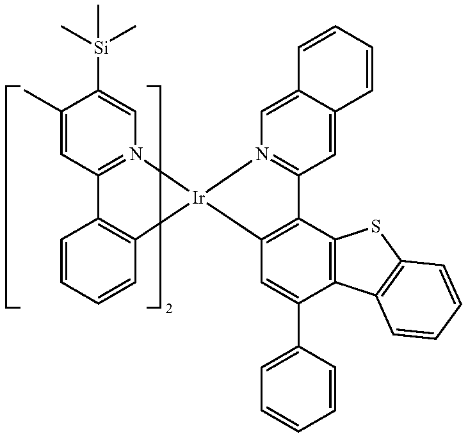
940
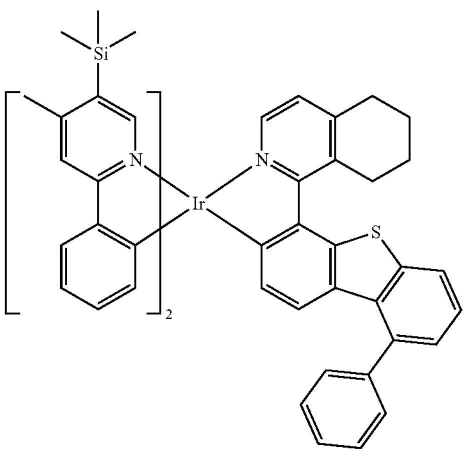
941
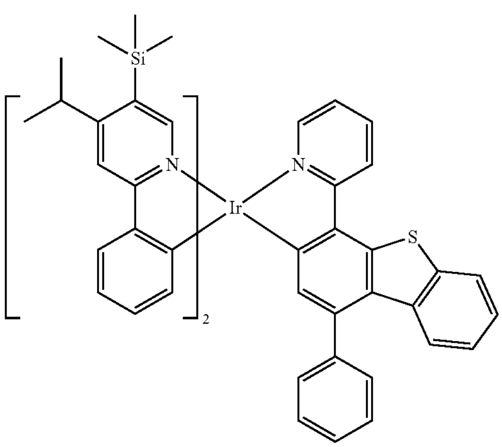
-continued
942
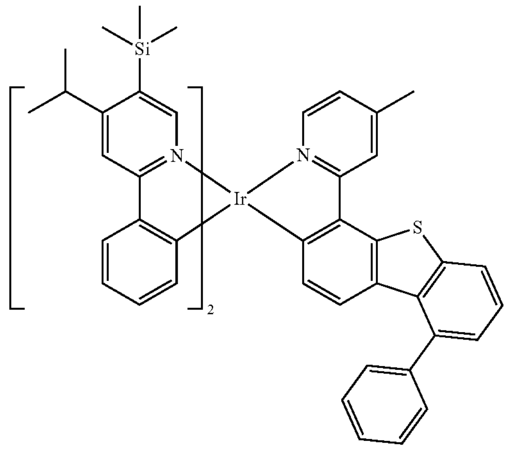
943
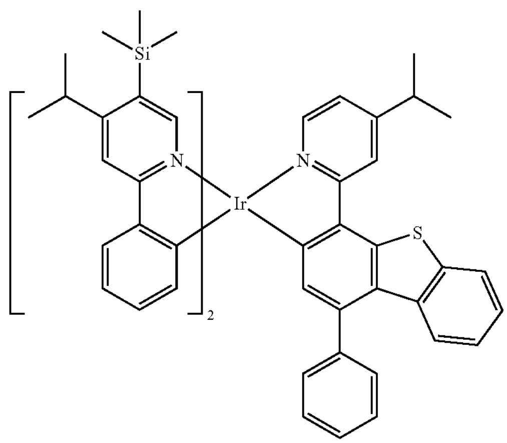
944
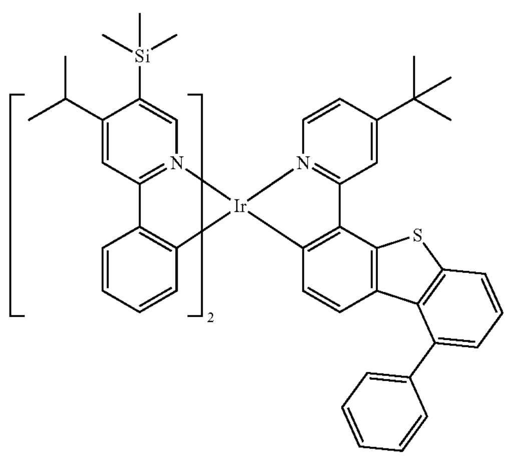

-continued
945
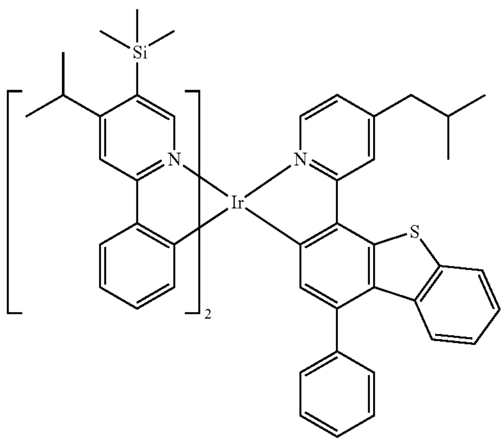
946
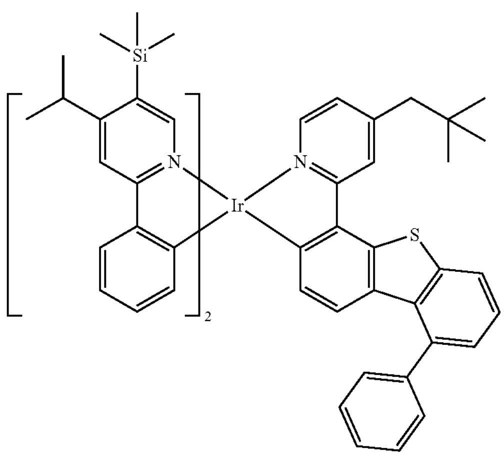
947
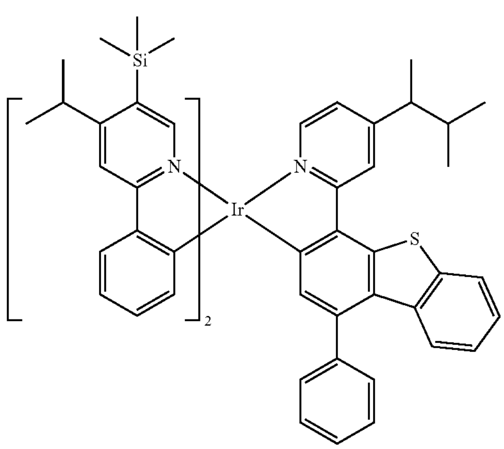
-continued
948
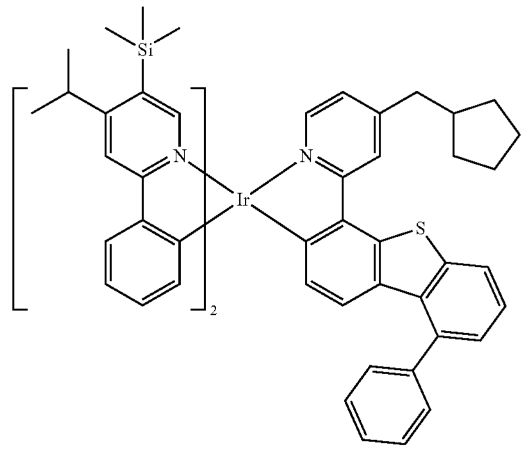
949
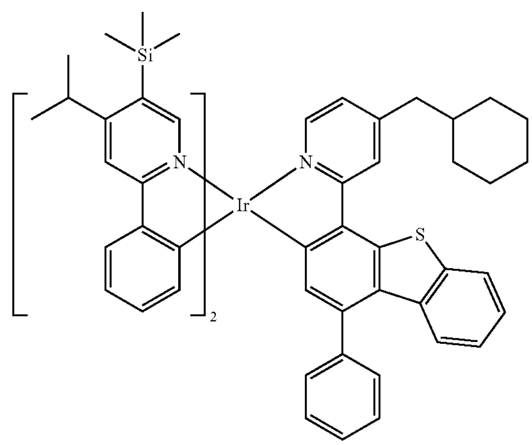
950
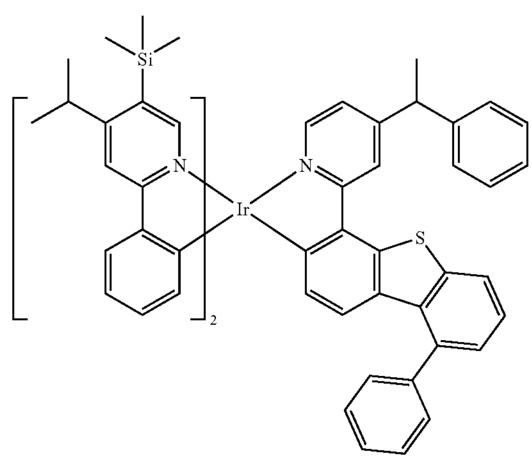

951
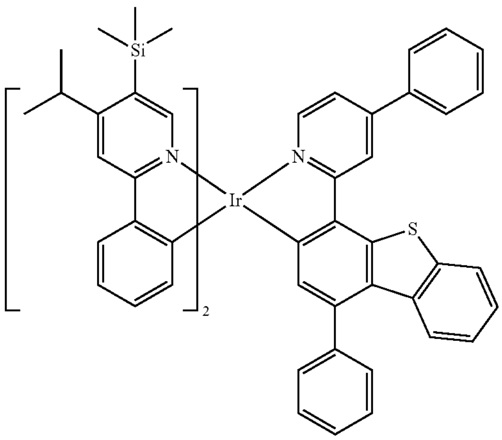
952
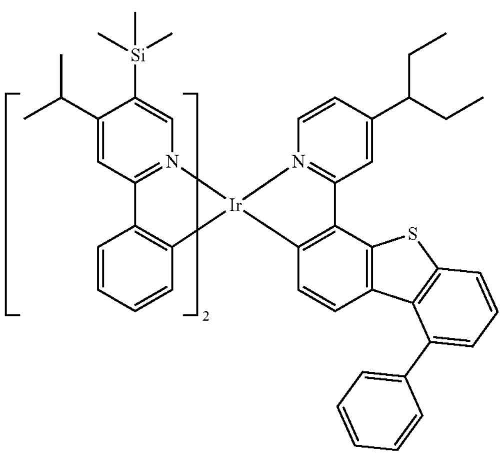
953
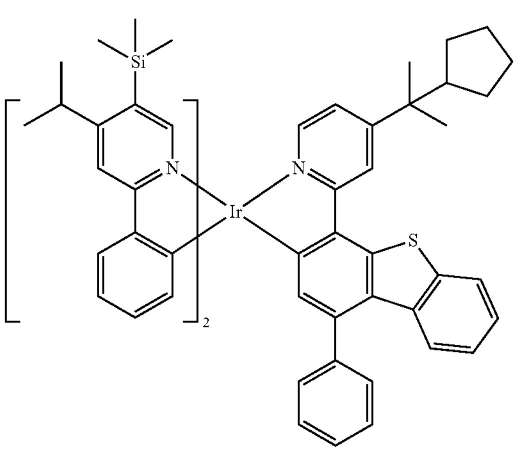
954
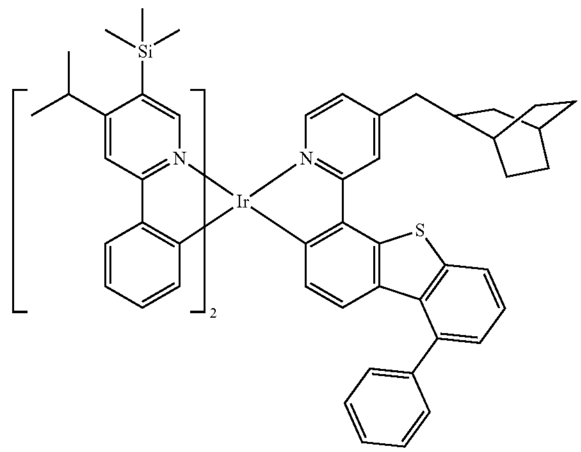
955
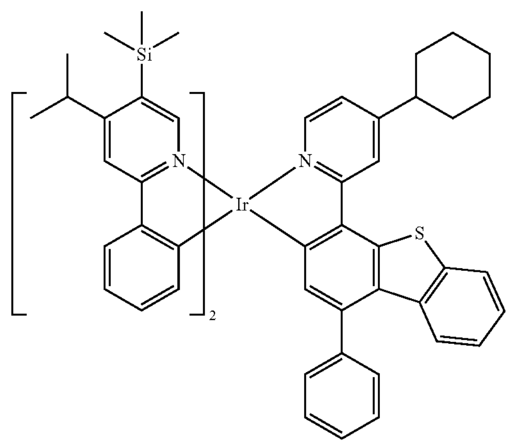
956
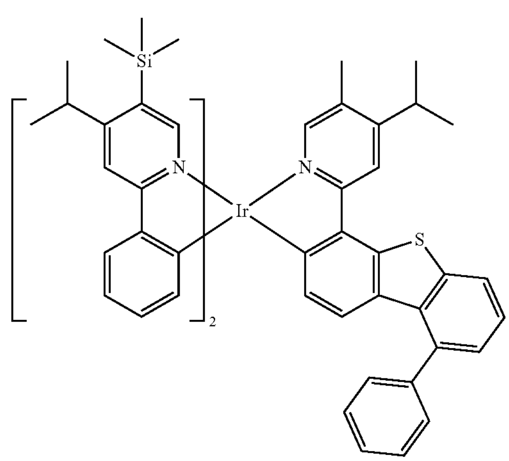

957
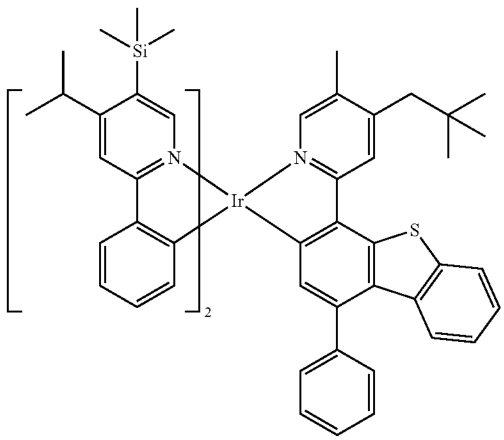
958
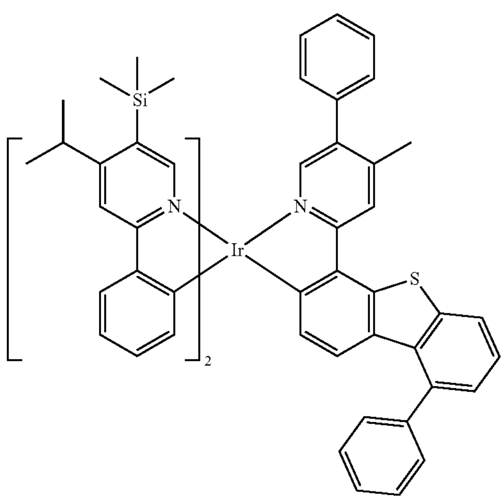
959
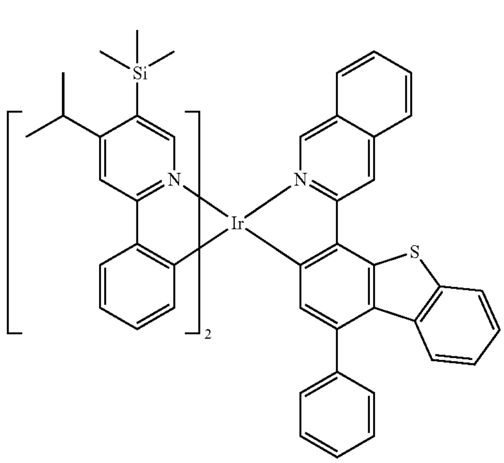
960
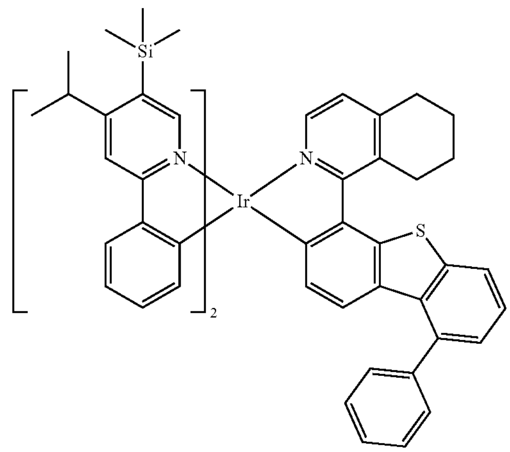
961
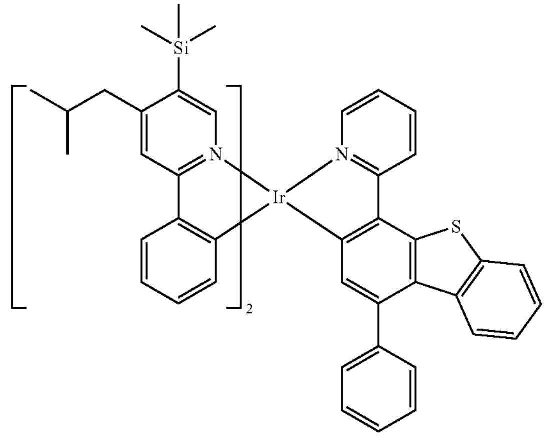
962
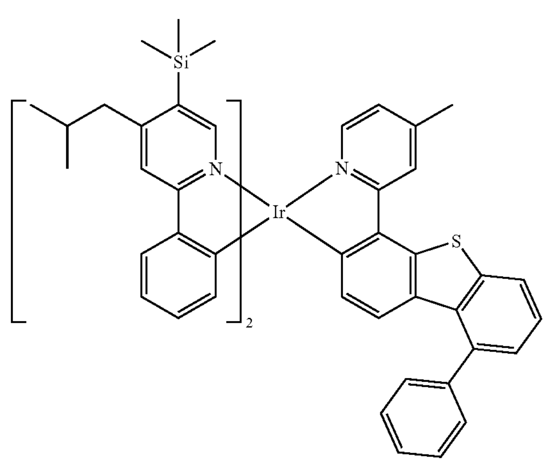

-continued
963
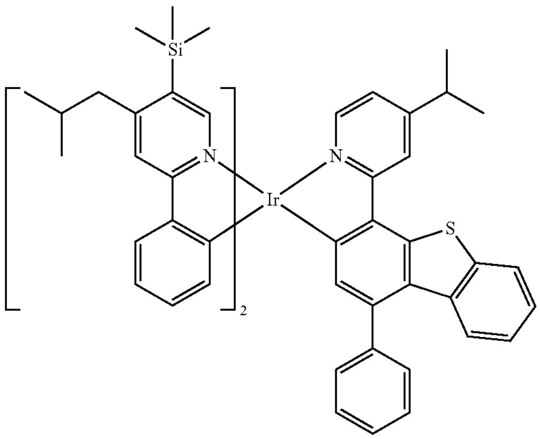
964
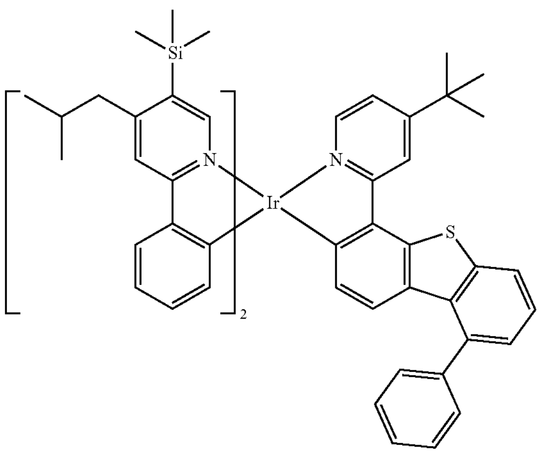
965
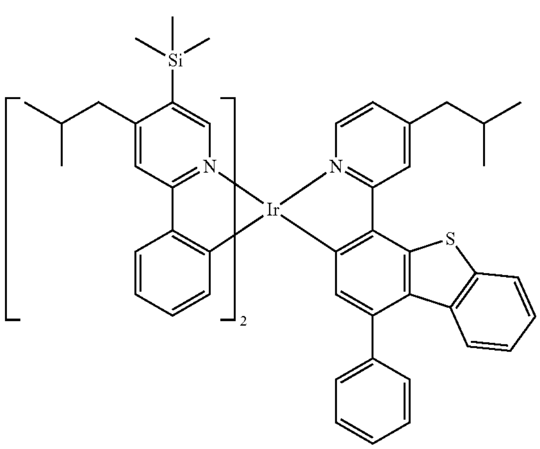
-continued
966
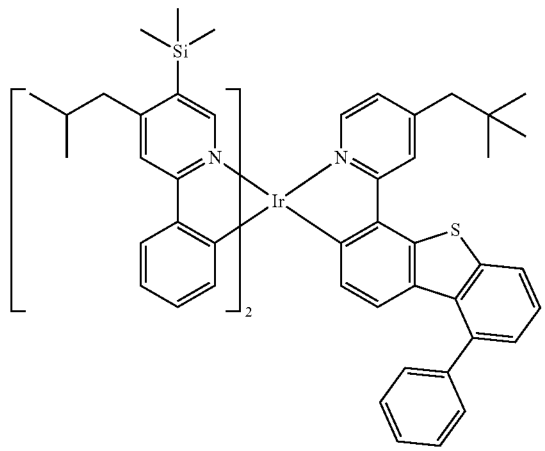
967
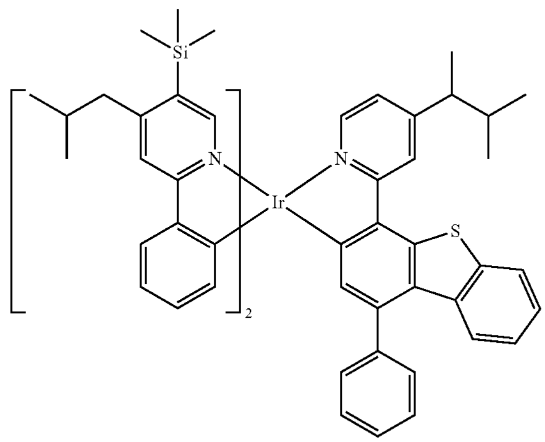
968
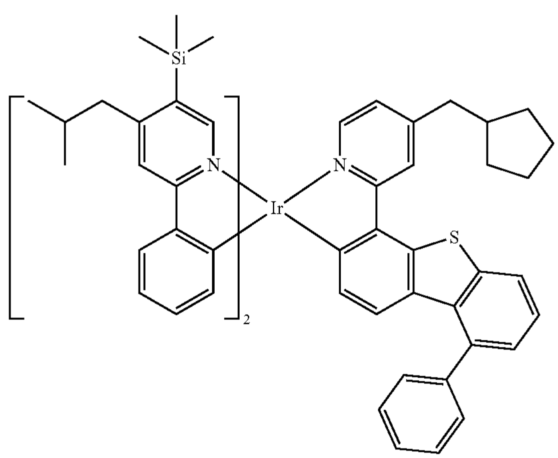

-continued
969
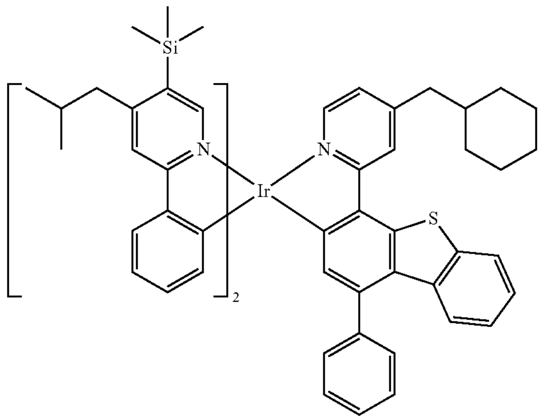
970
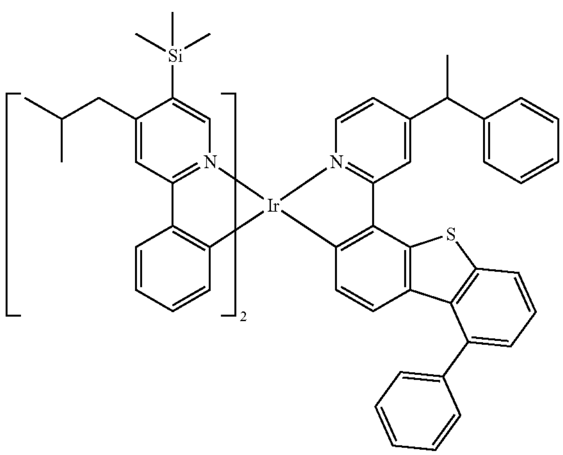
971
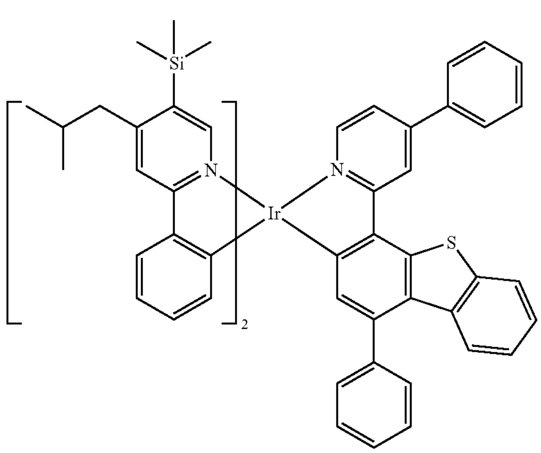
-continued
972
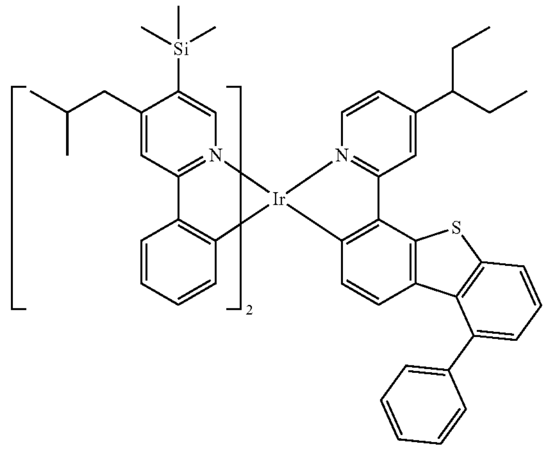
973
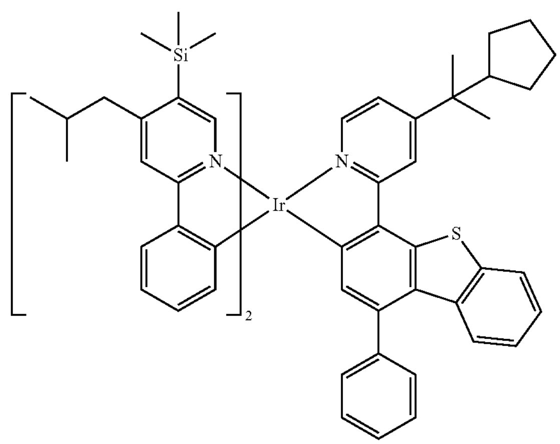
974
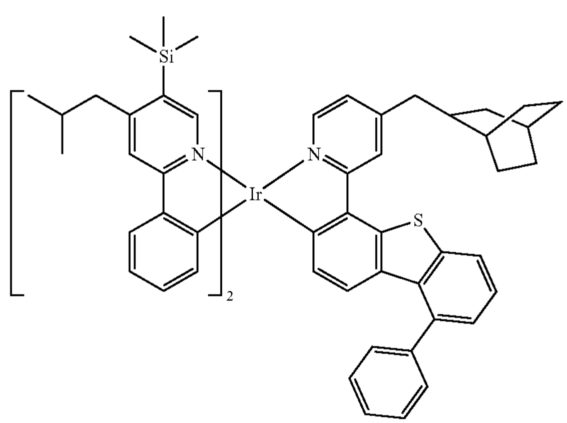

-continued
975
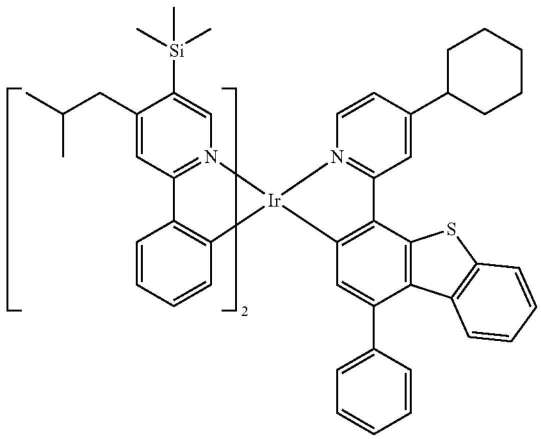
976
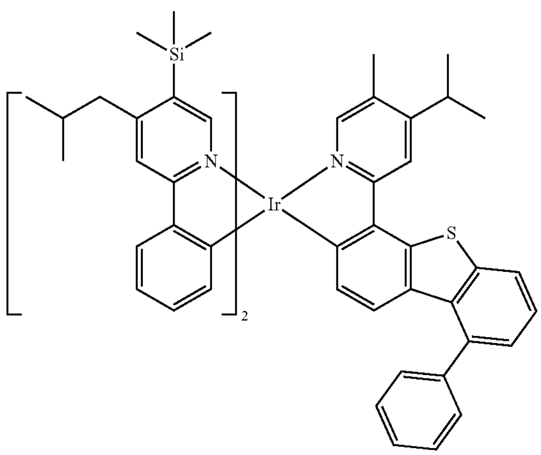
977
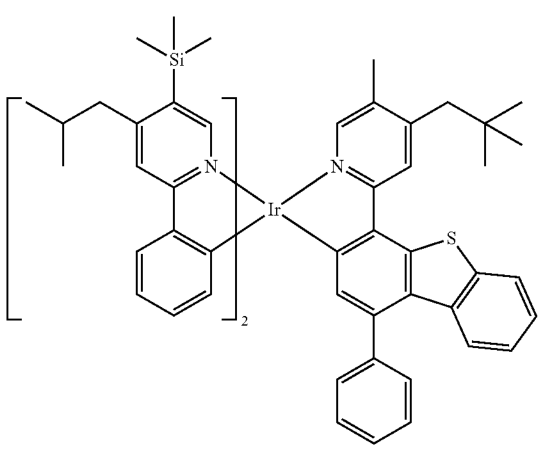
-continued
978
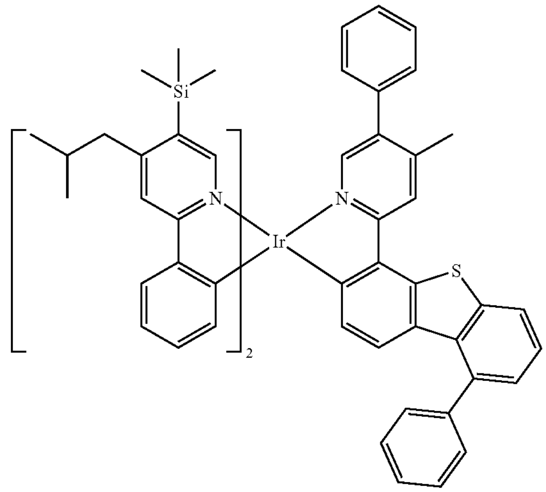
979
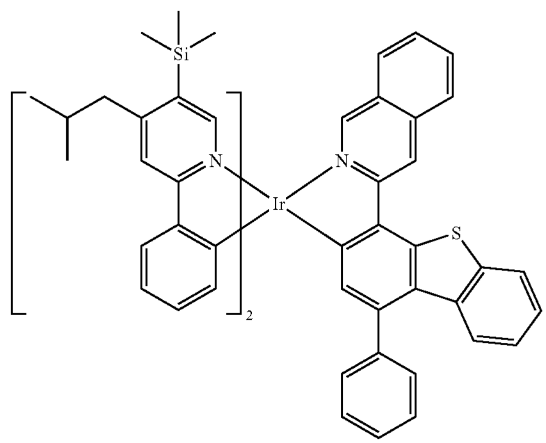
980
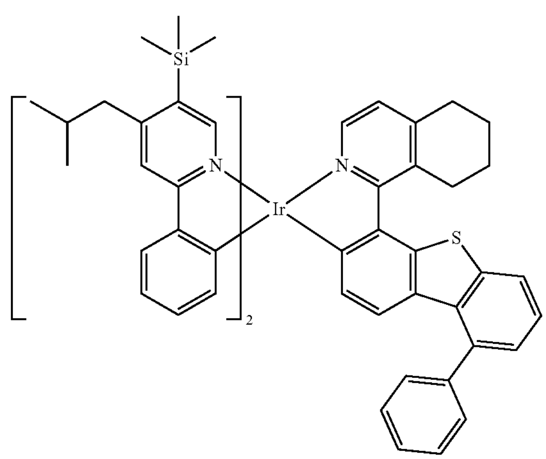

-continued
981
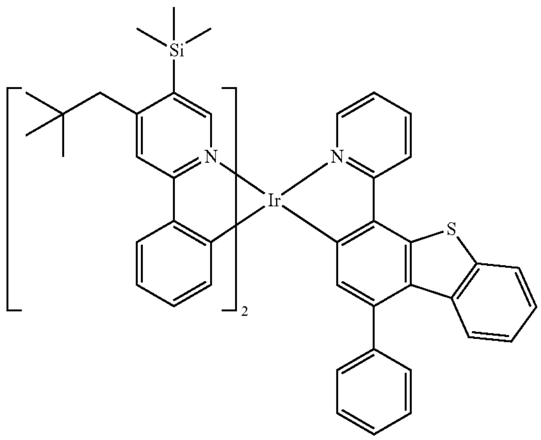
982
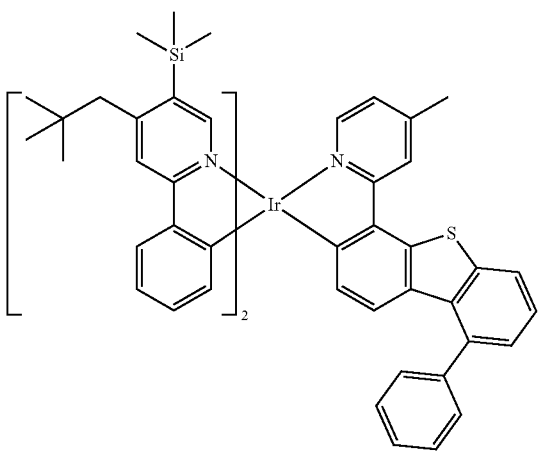
983
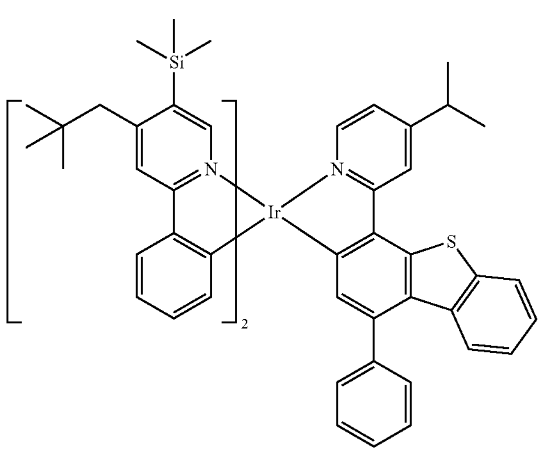
-continued
984
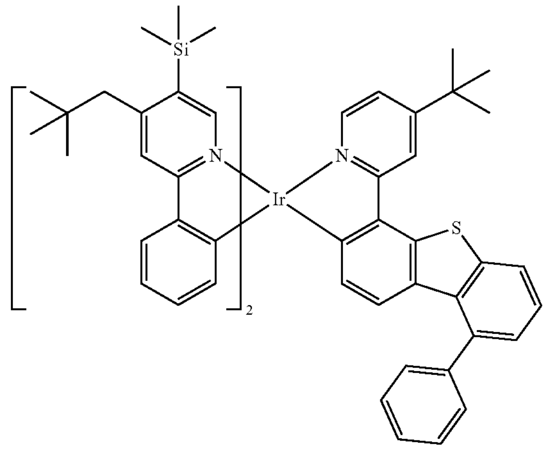
985
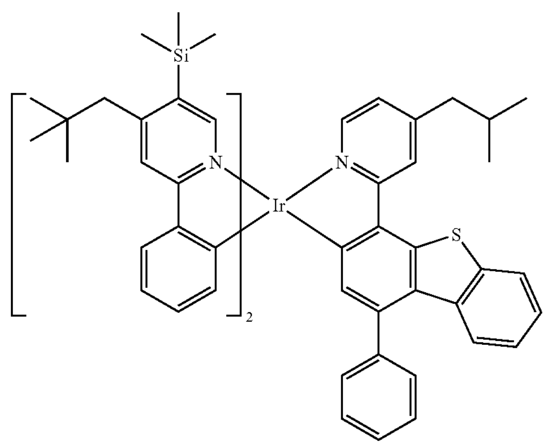
986
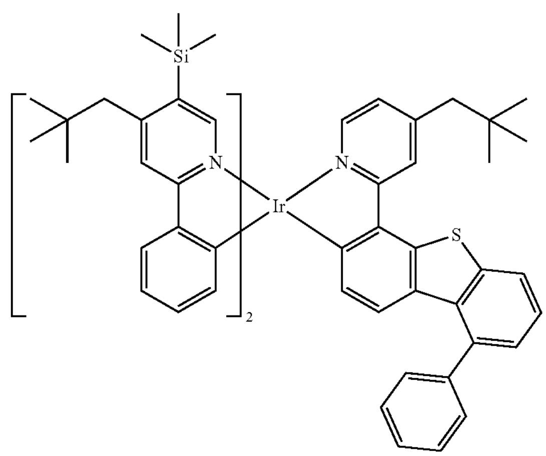

-continued
987
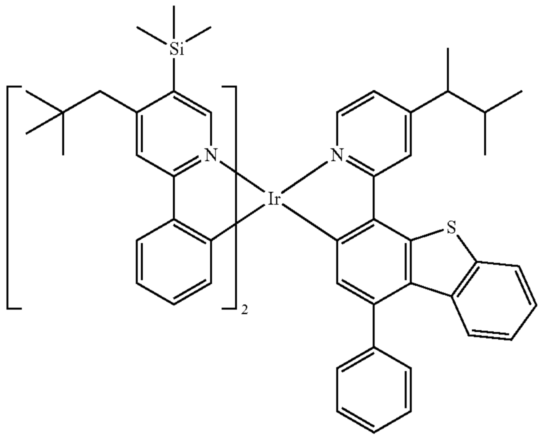
988
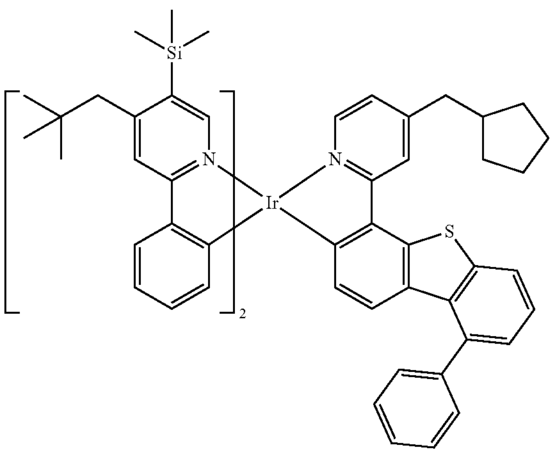
989
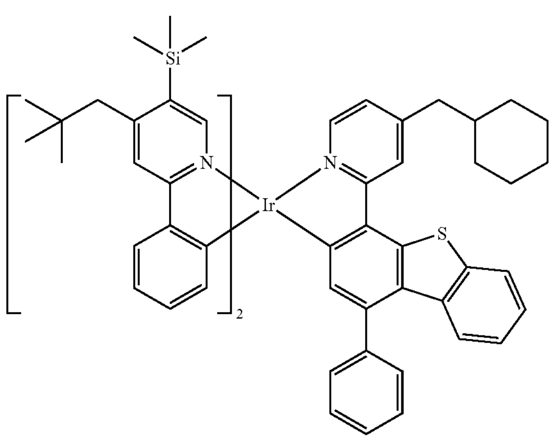
-continued
990
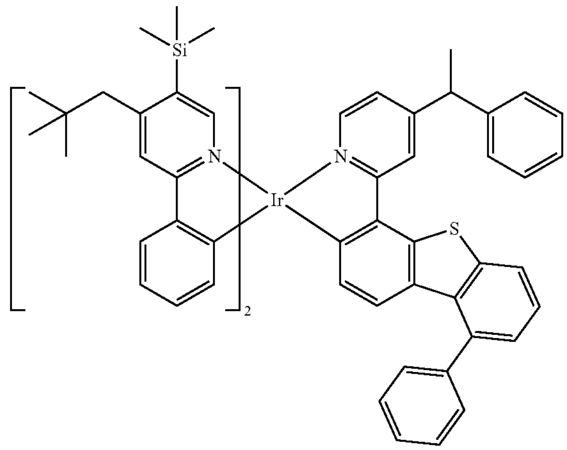
991
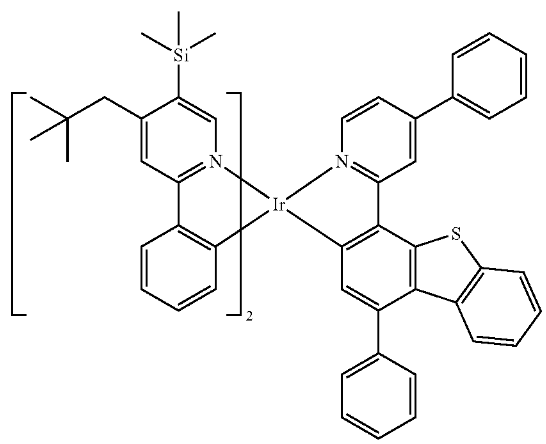
992
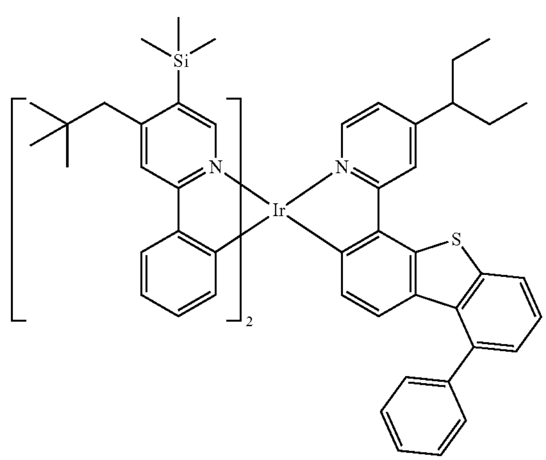

-continued
993
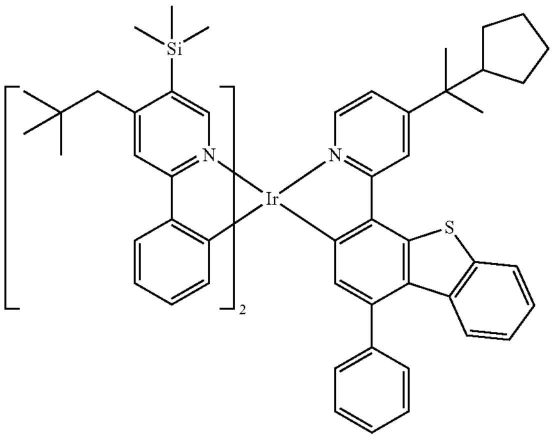
994
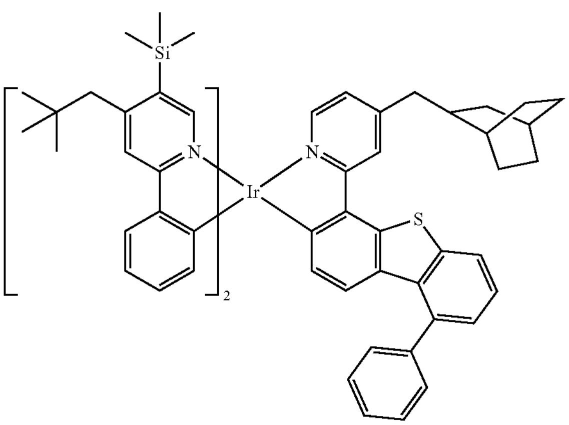
995
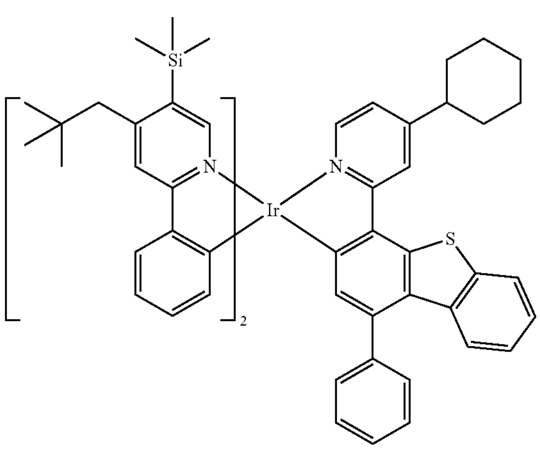
-continued
996
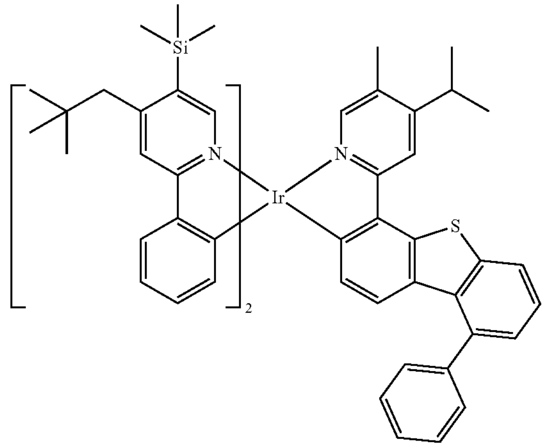
997
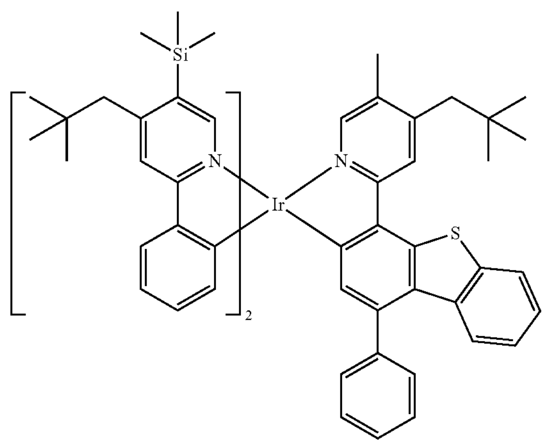
998
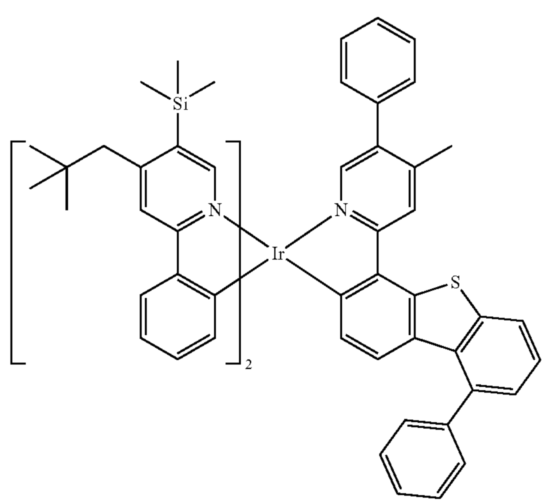

-continued
999
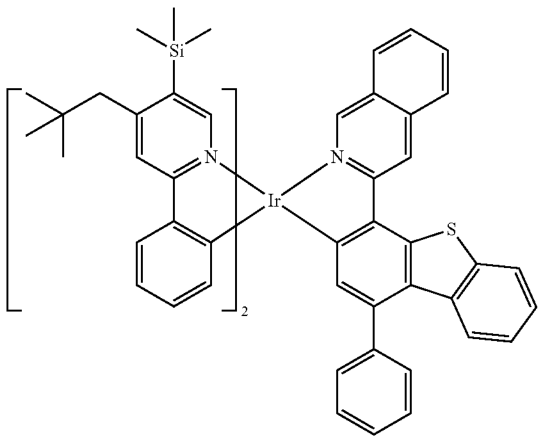
1000
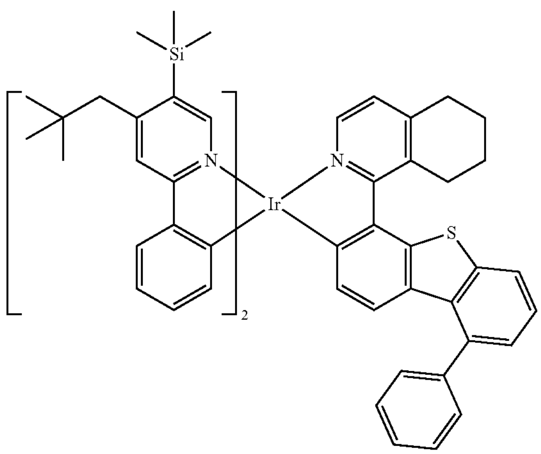
1001
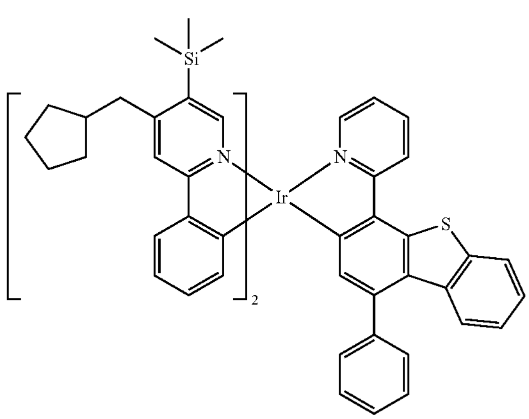
-continued
1002
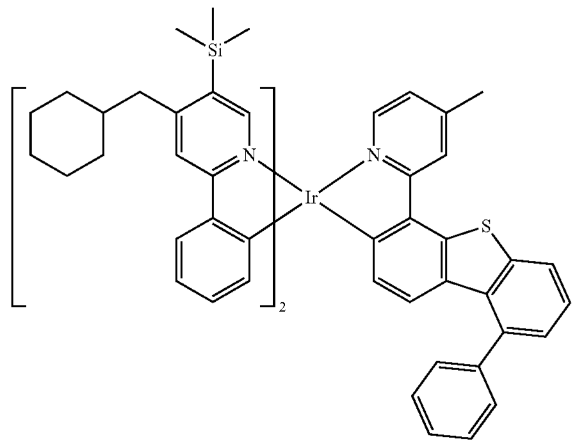
1003
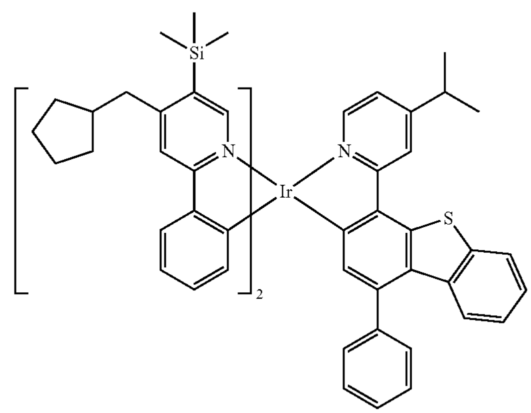
1004
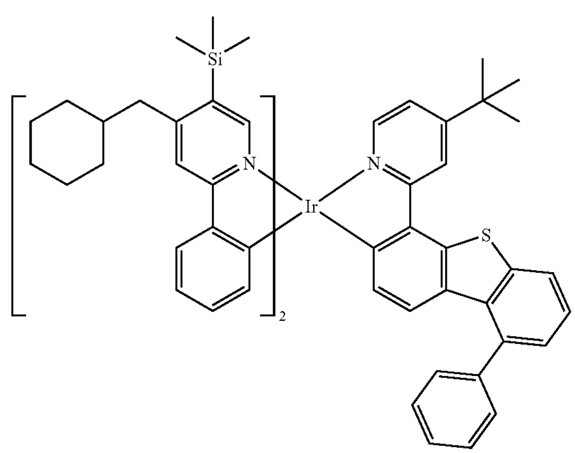

-continued
1005
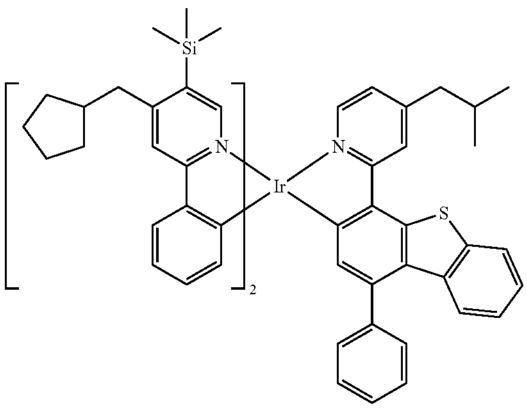
1006
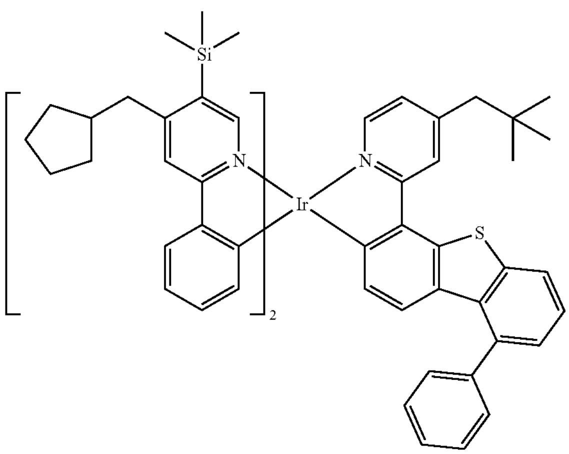
1007
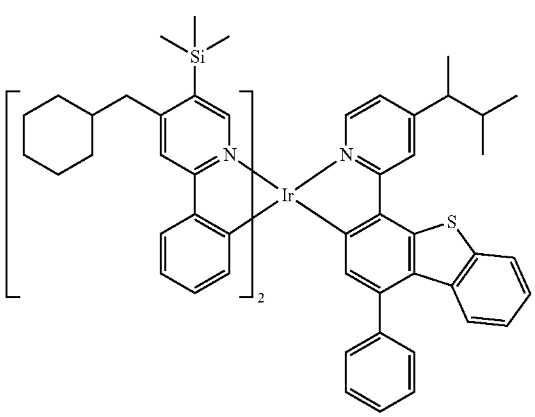
-continued
1008
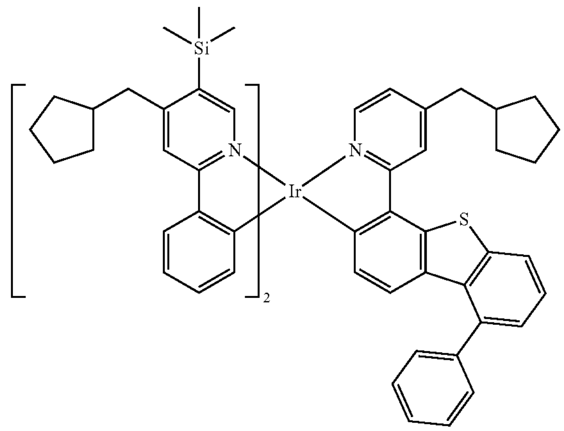
1009
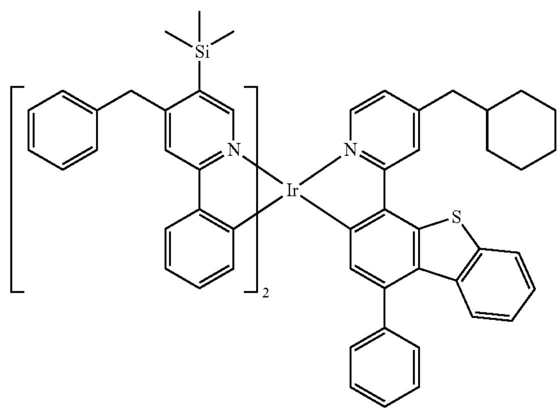
1010
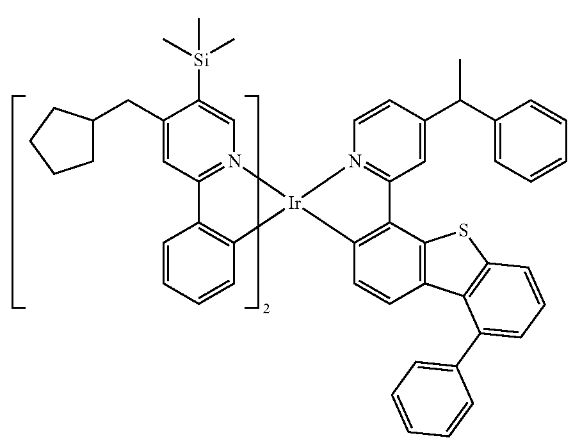

-continued
1011
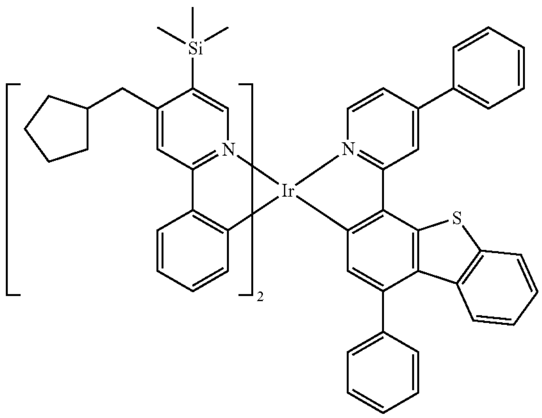
1012
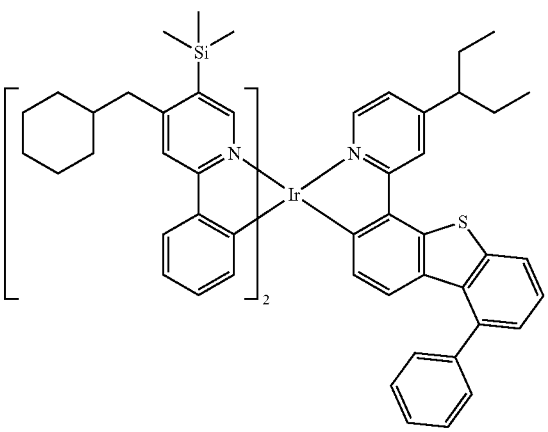
1013
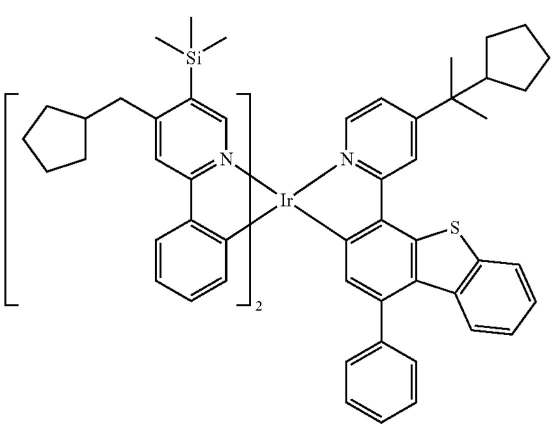
-continued
1014
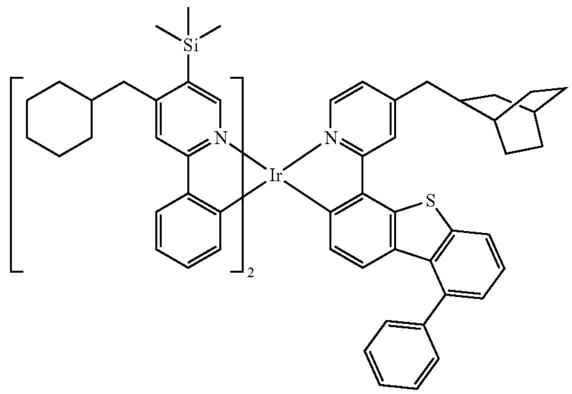
1015
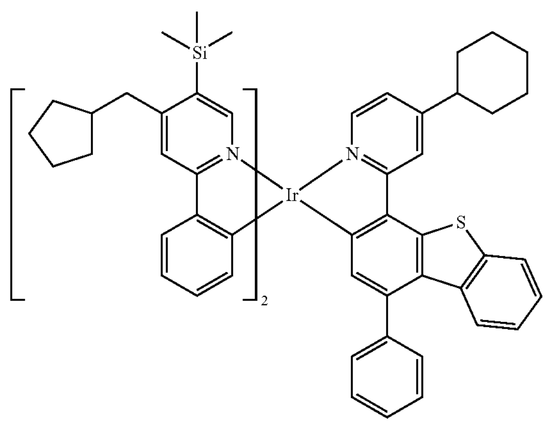
1016
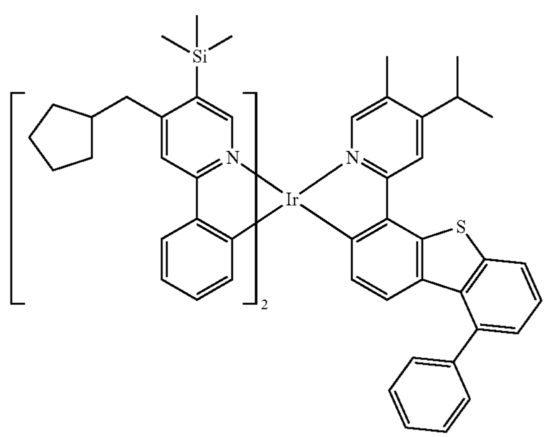

1017
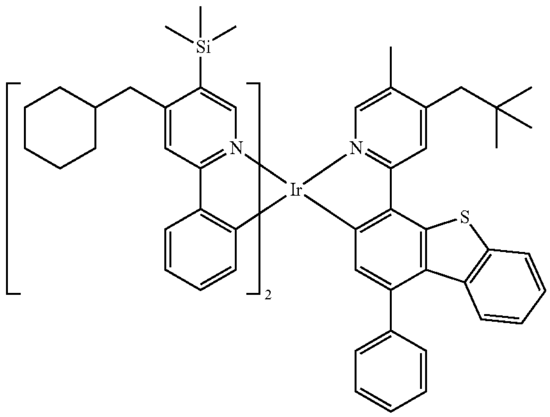
1018
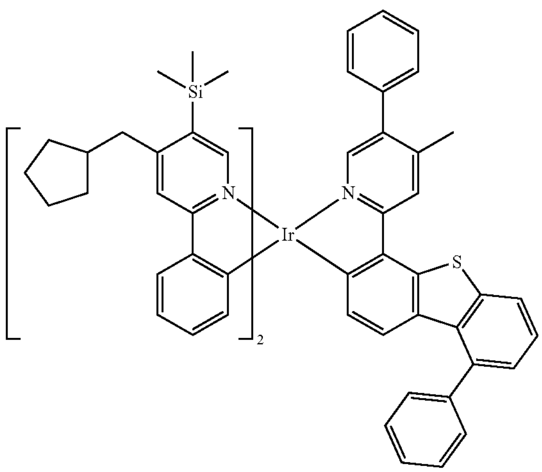
1019
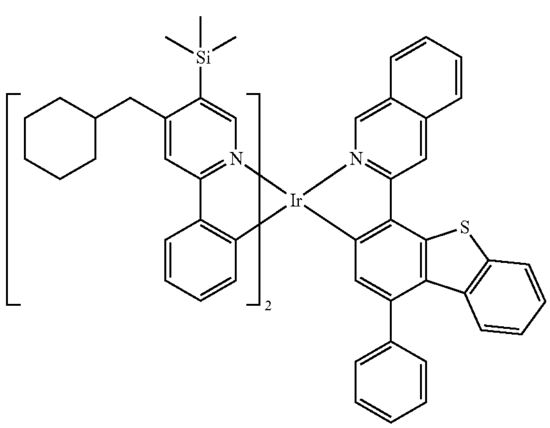
1020
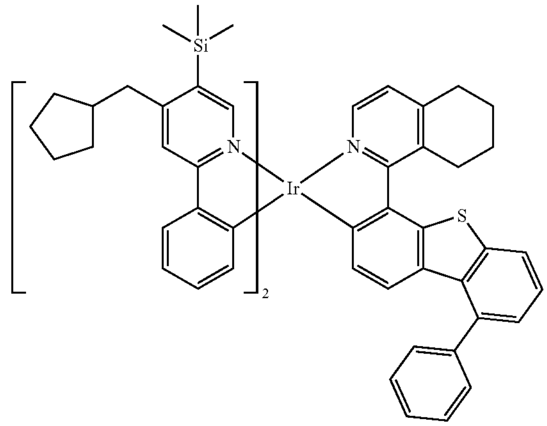
1021
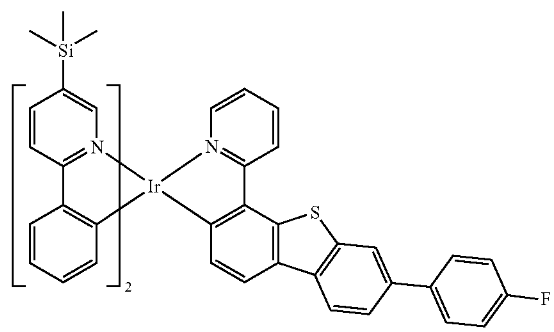
1022
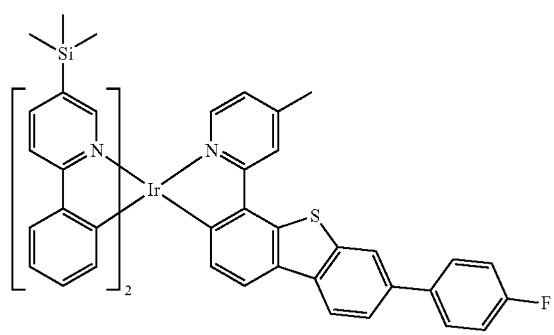
1023
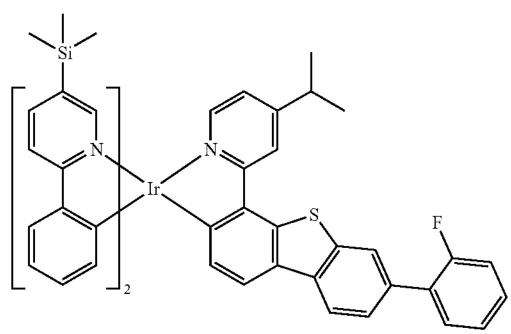

-continued
1024
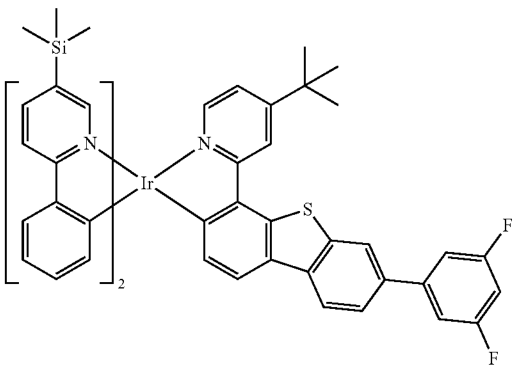
1025
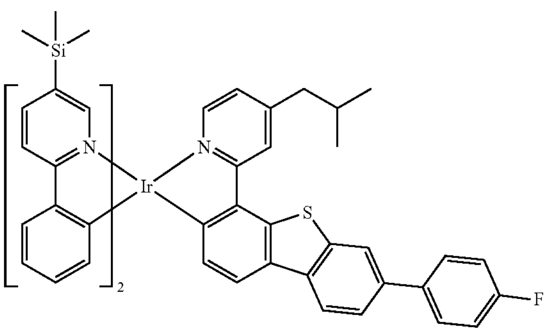
1026
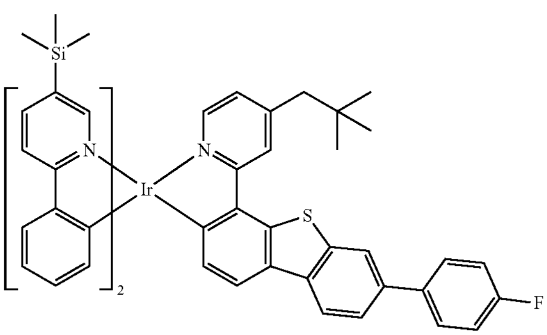
1027
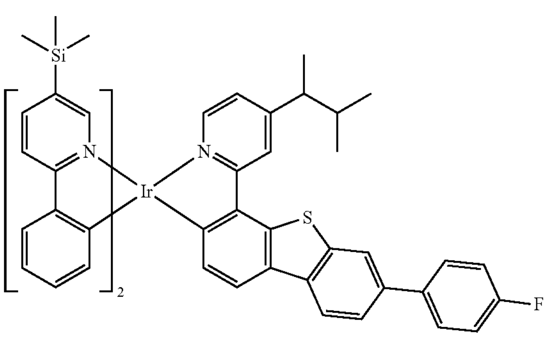
-continued
1028
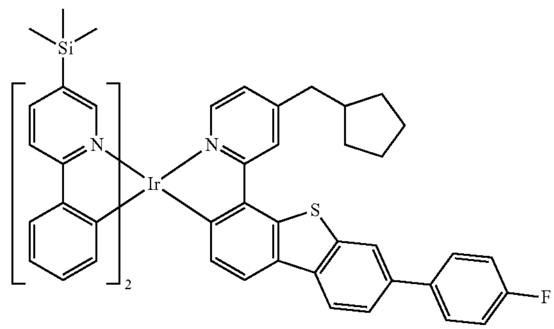
1029
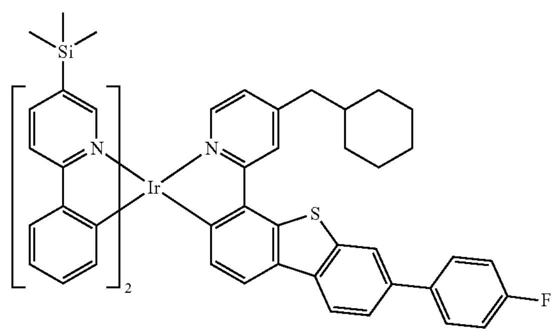
1030
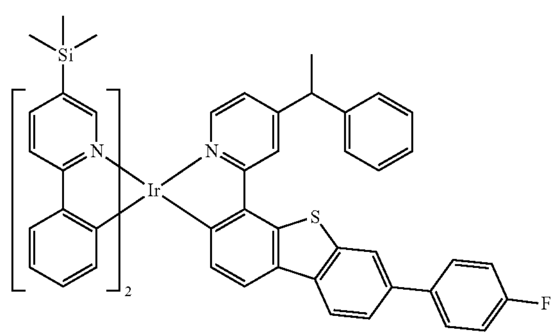
1031
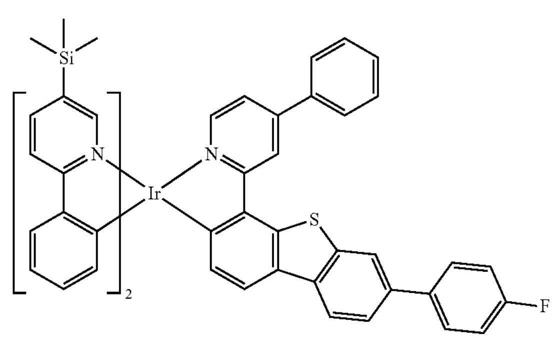

-continued
1032
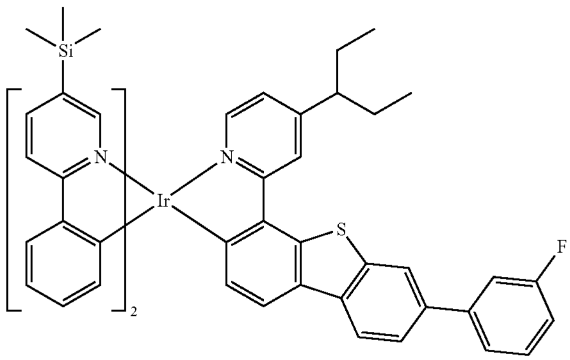
1033
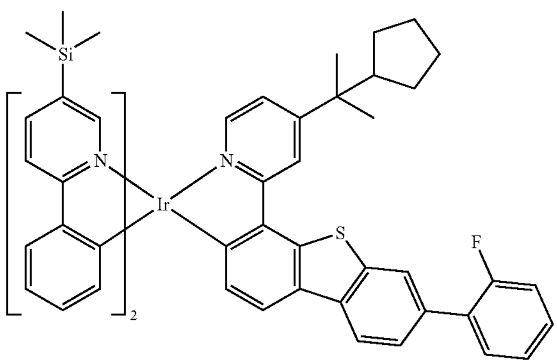
1034
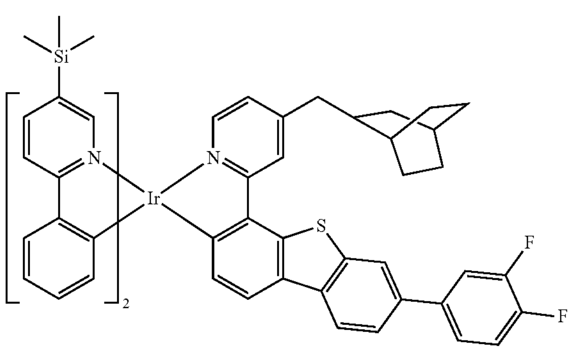
1035
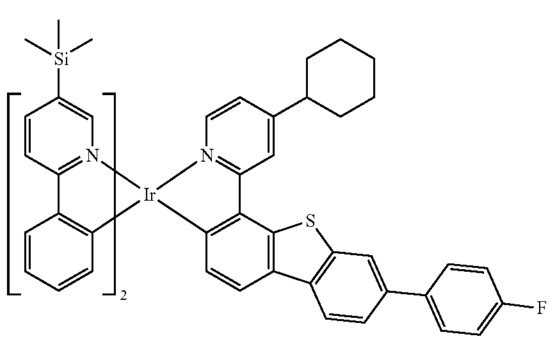
-continued
1036
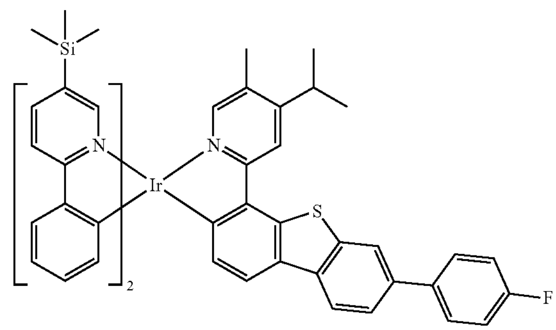
1037
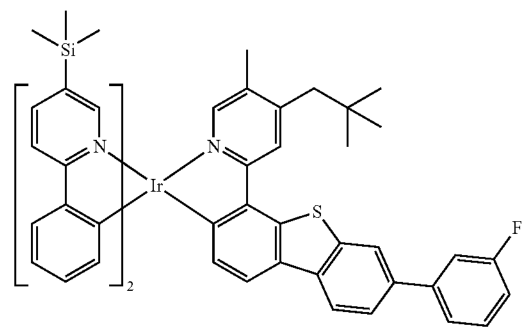
1038
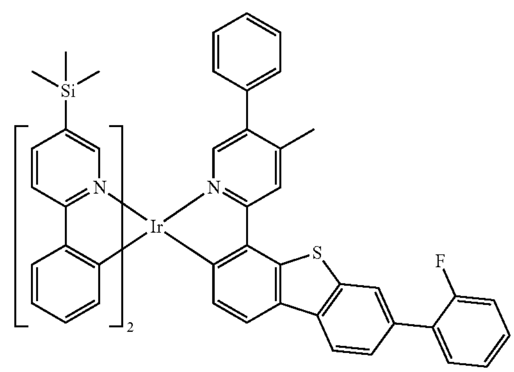
1039
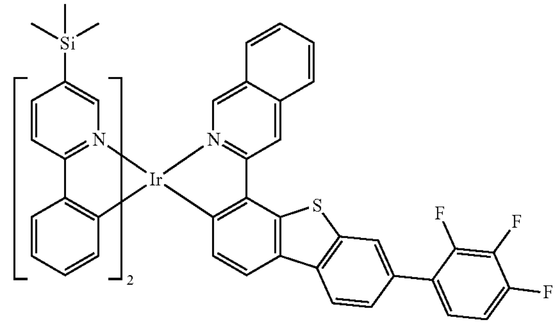

1040
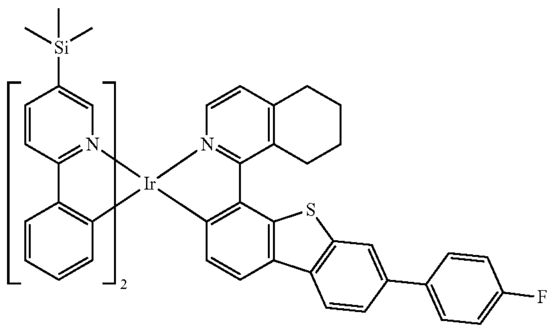
1041
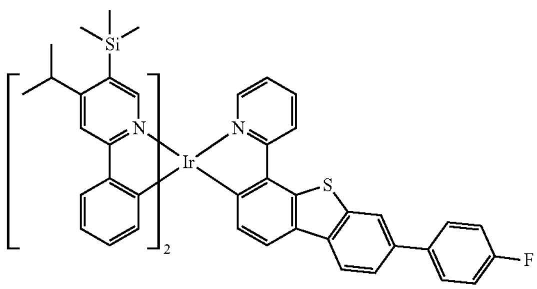
1042
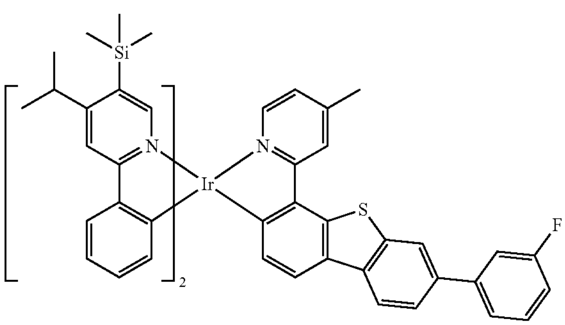
1043
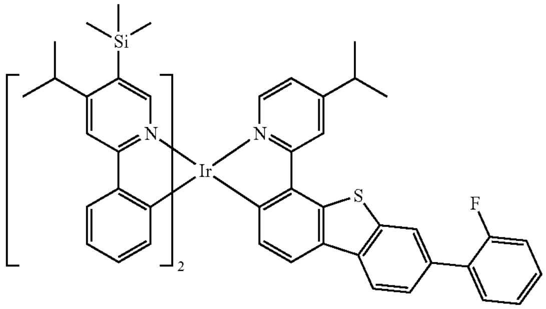
1044
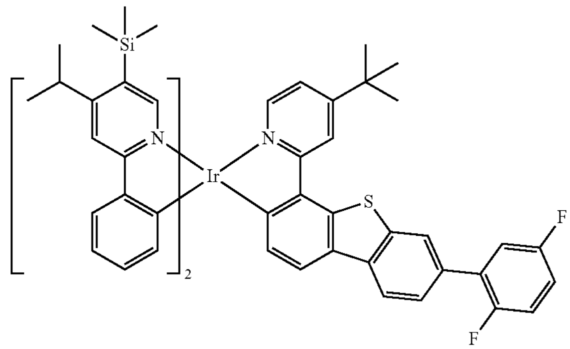
1045
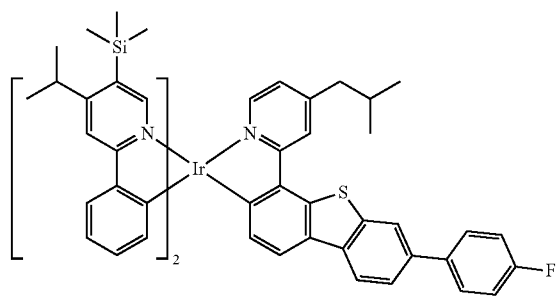
1046
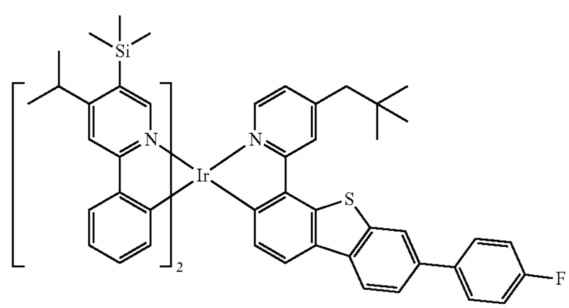
1047
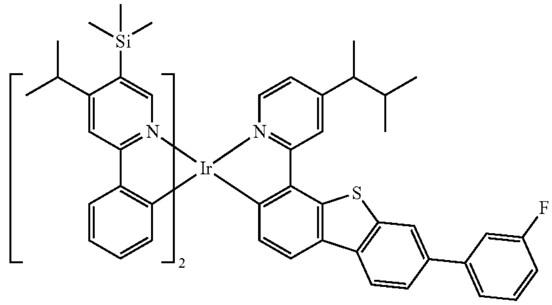

-continued
1048
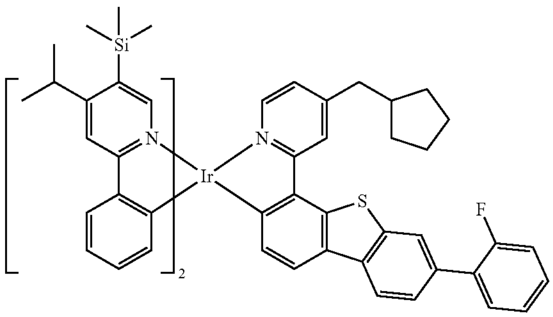
1049
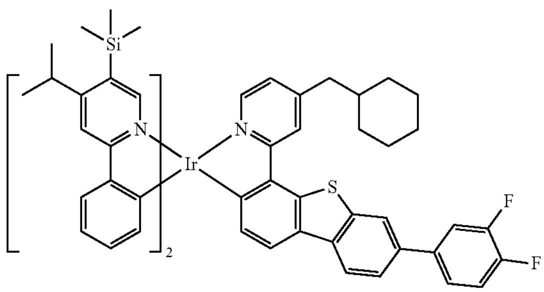
1050
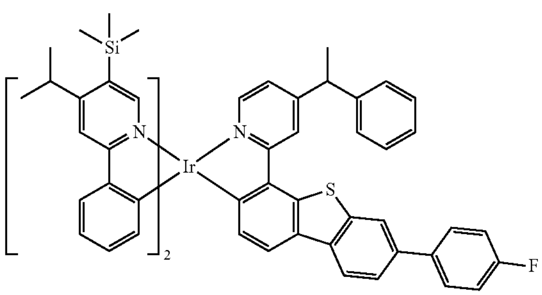
1051
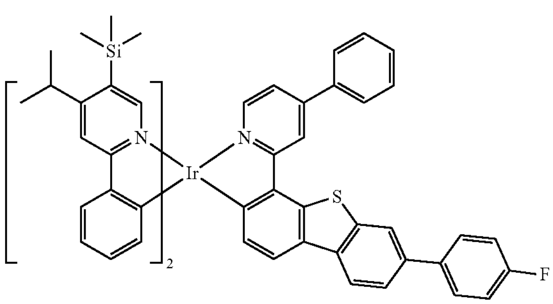
1052
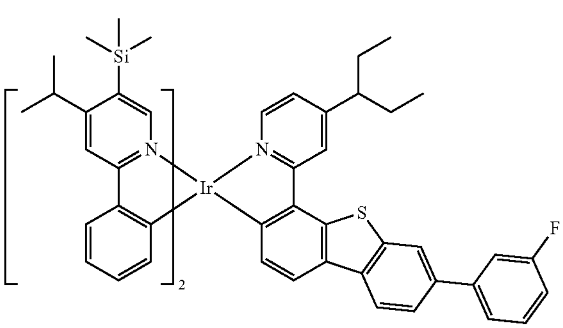
-continued
1053
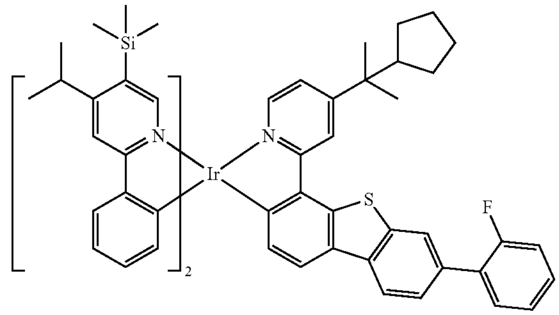
1054
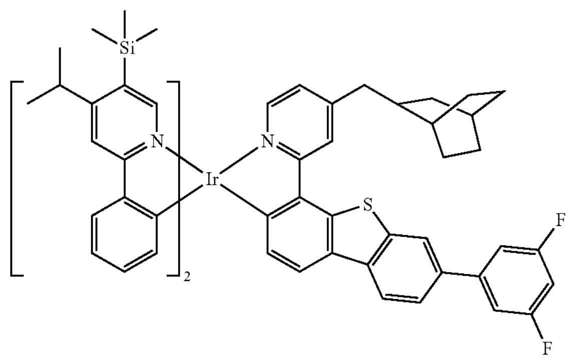
1055
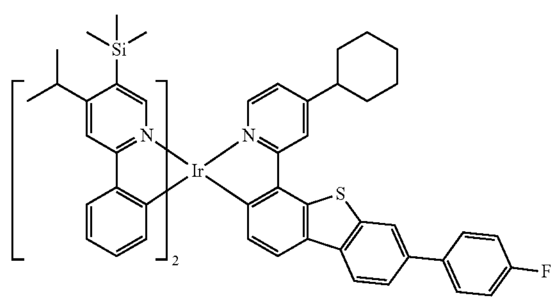
1056
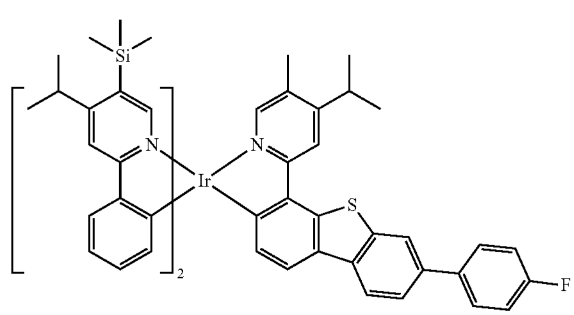

-continued
1057
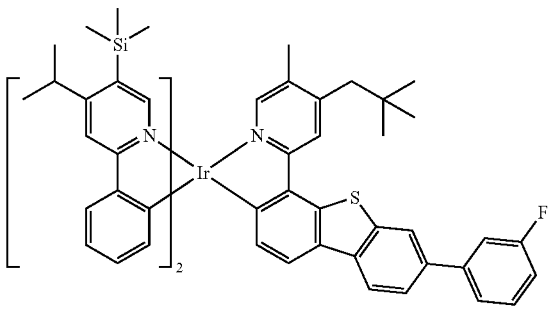
1058
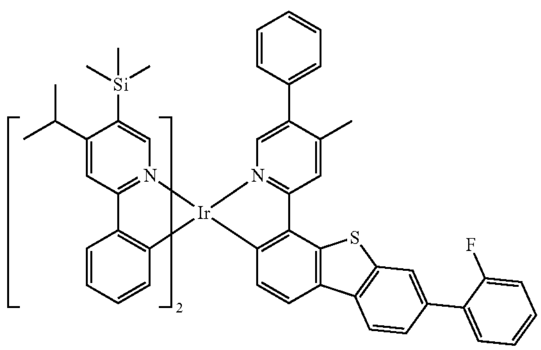
1059
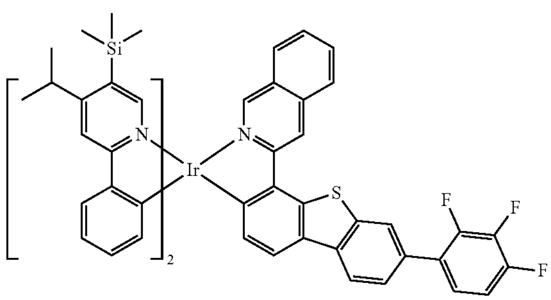
1060
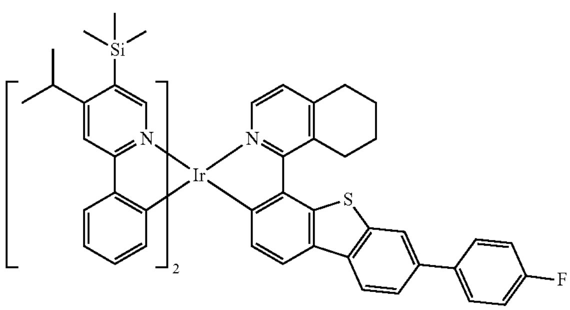
1061
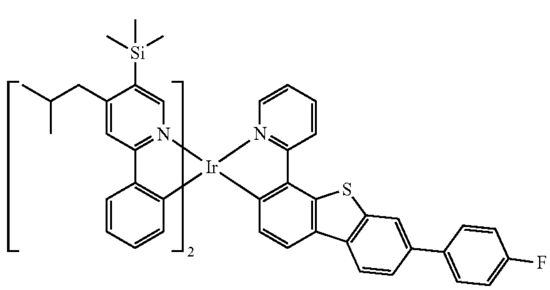
-continued
1062
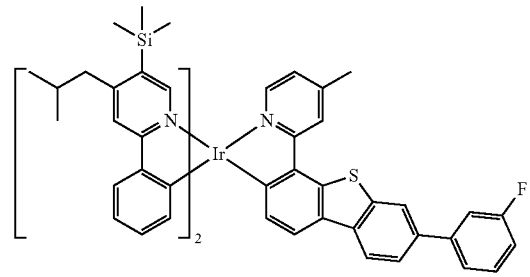
1063
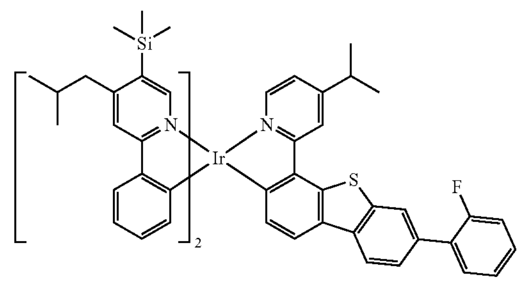
1064
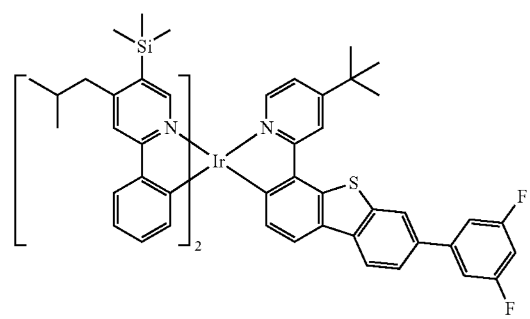
1065
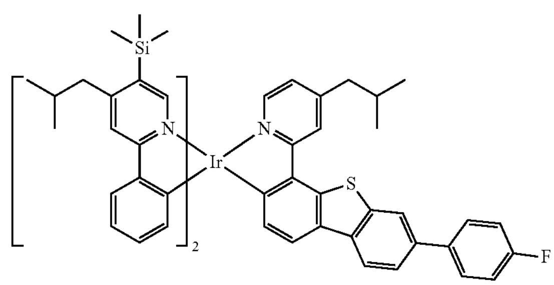
1066
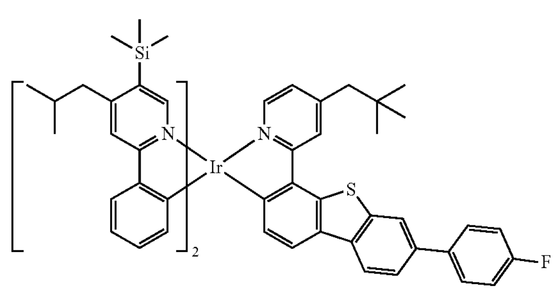

-continued
1067
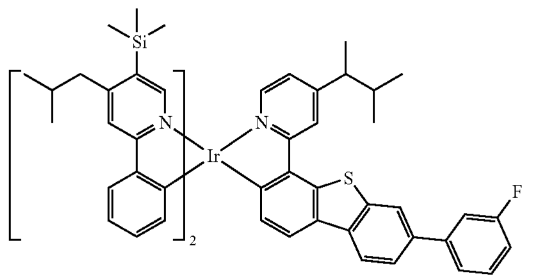
1068
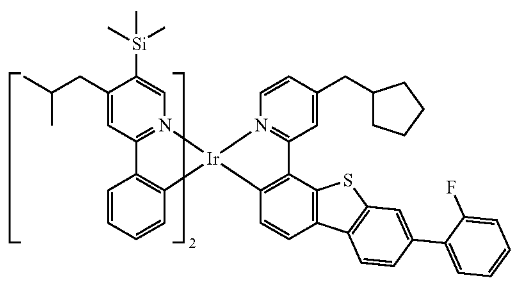
1069
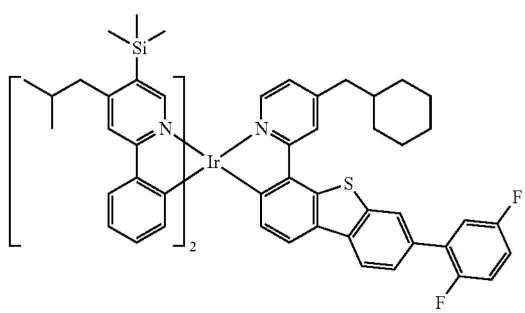
1070
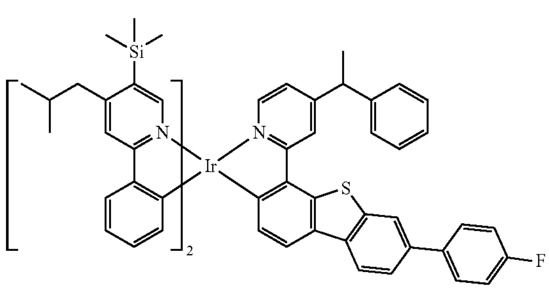
1071
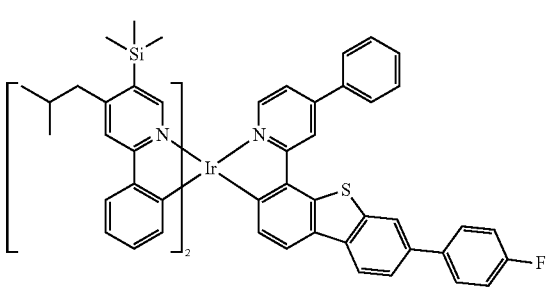
-continued
1072
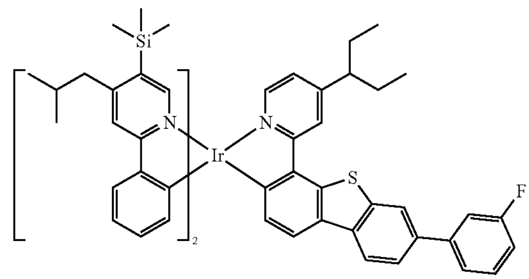
1073
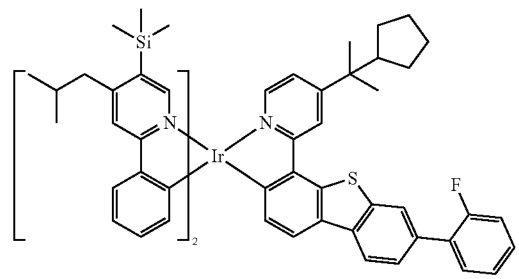
1074
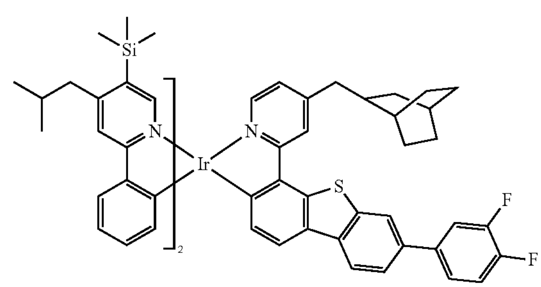
1075
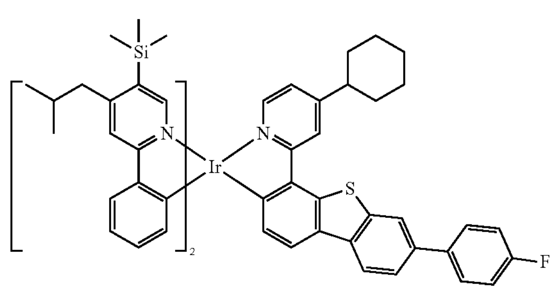
1076
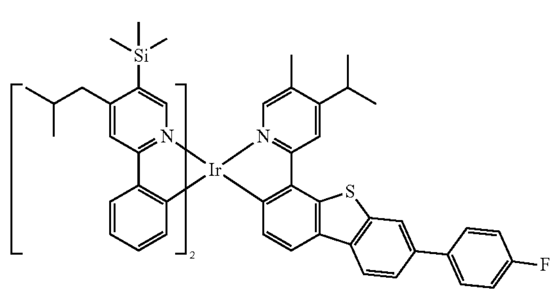

-continued
1077
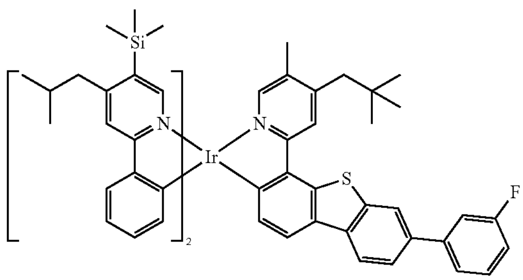
1078
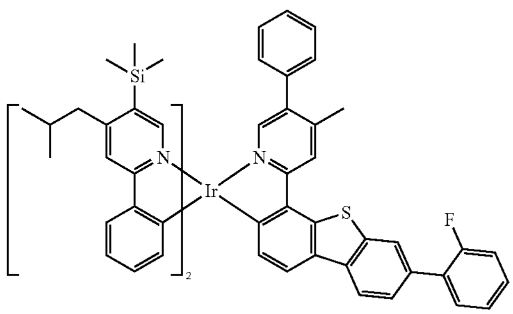
1079
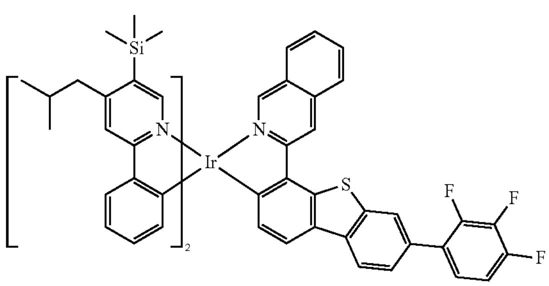
1080
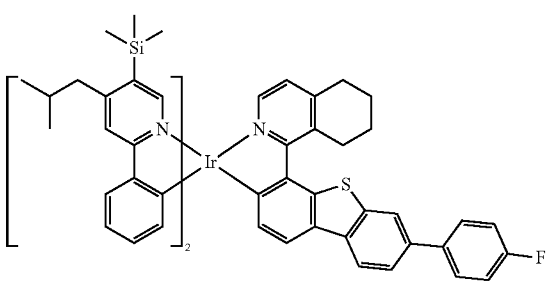
1081
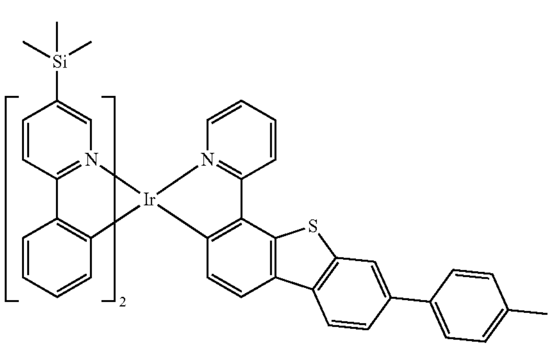
-continued
1082
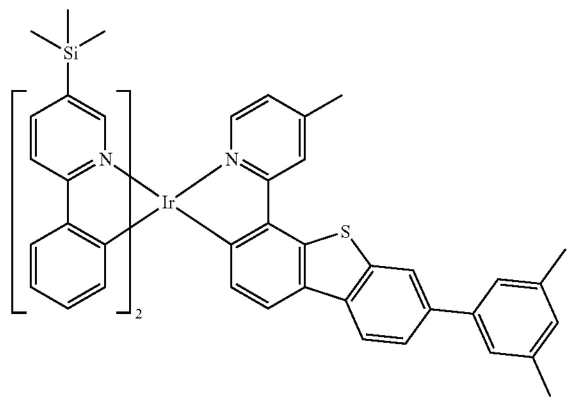
1083
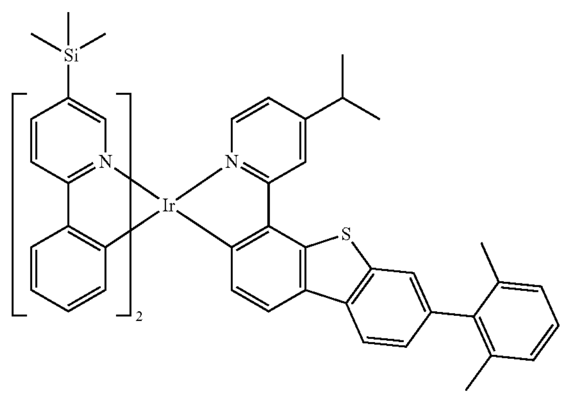
1084
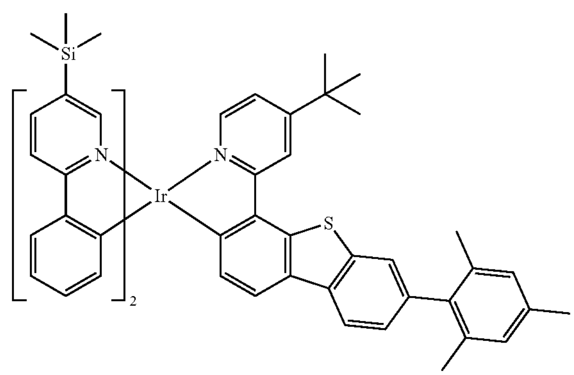
1085
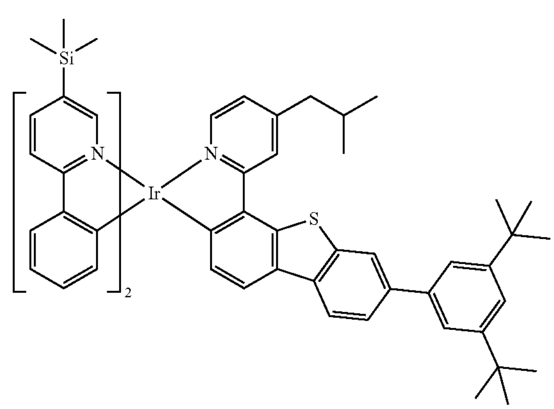

-continued
1086
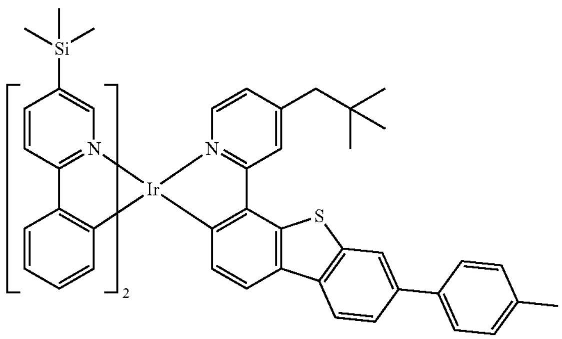
1087
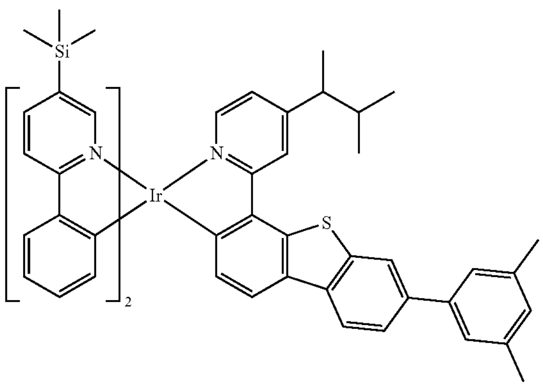
1088
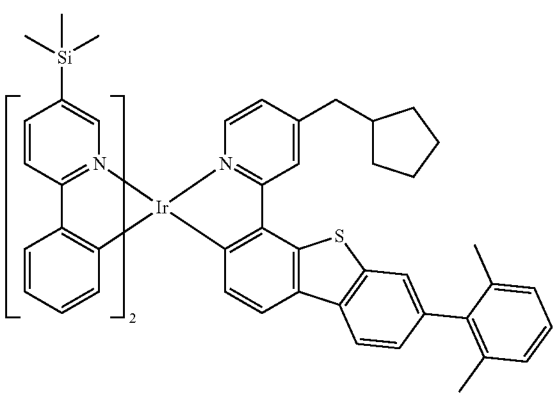
1089
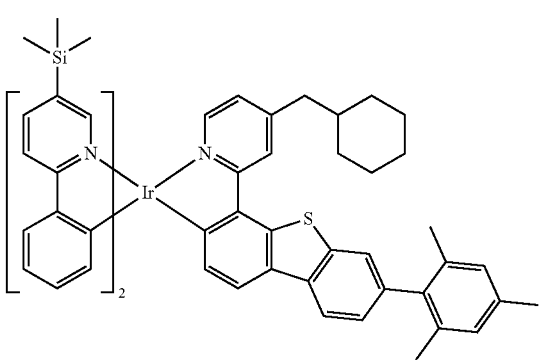
-continued
1090
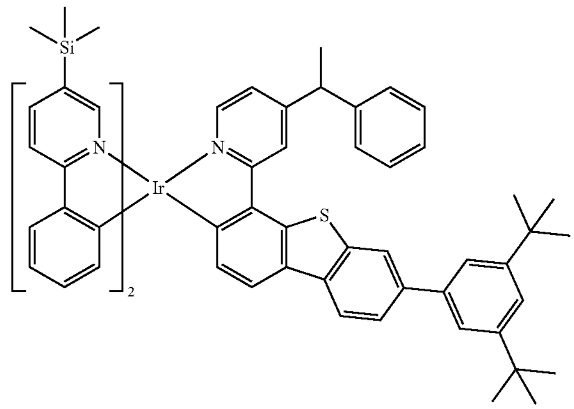
1091
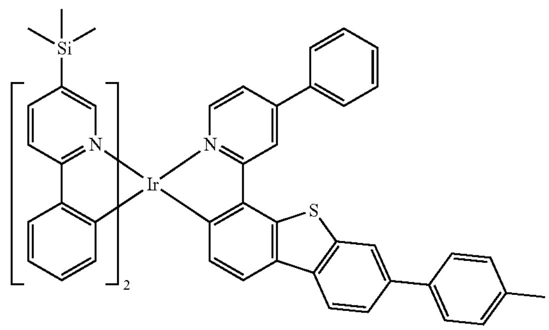
1092
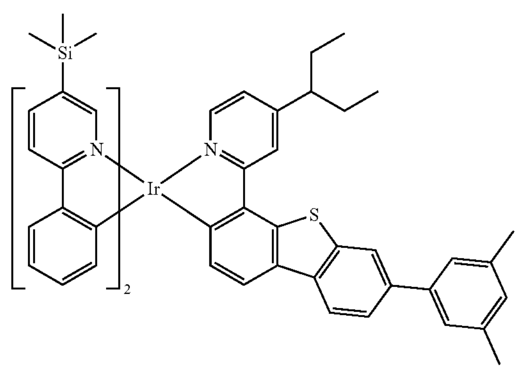
1093
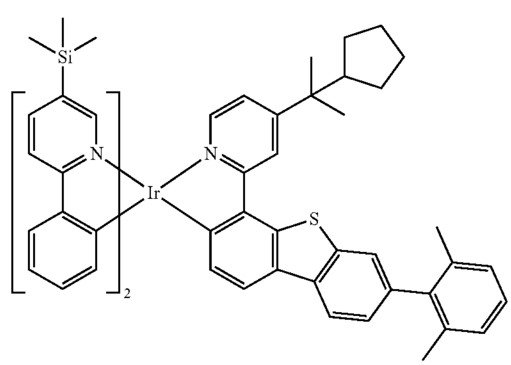

-continued
1094
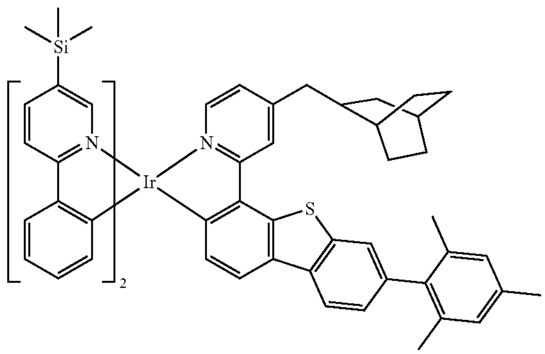
1095
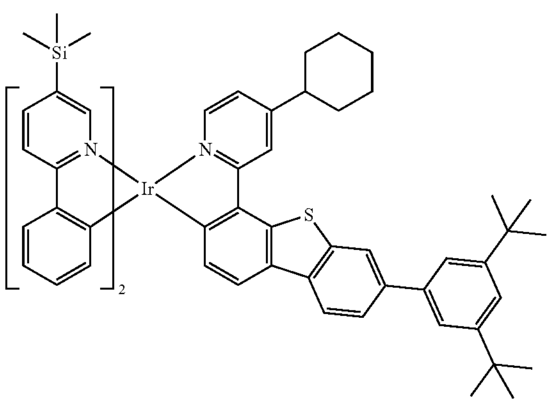
1096
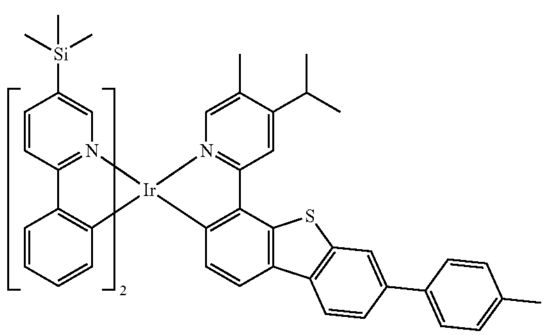
1097
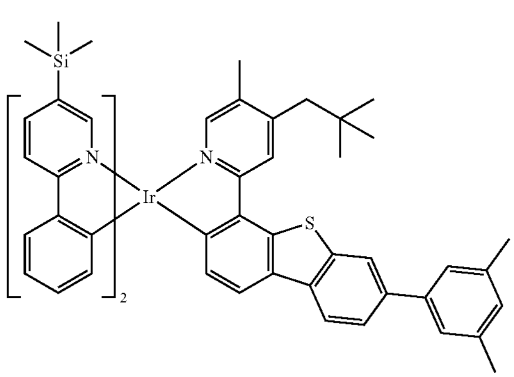
-continued
1098
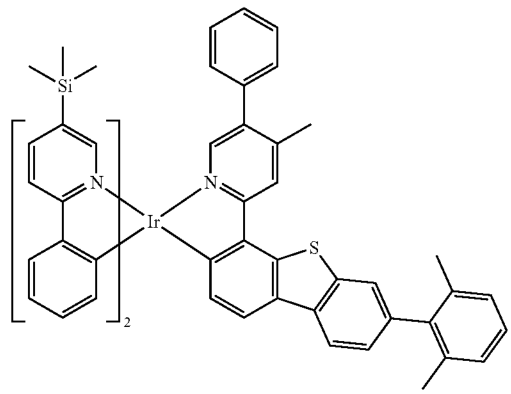
1099
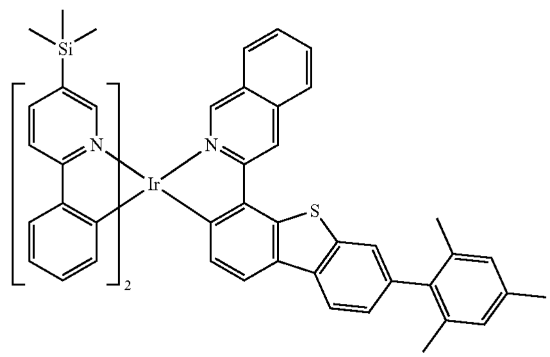
1100
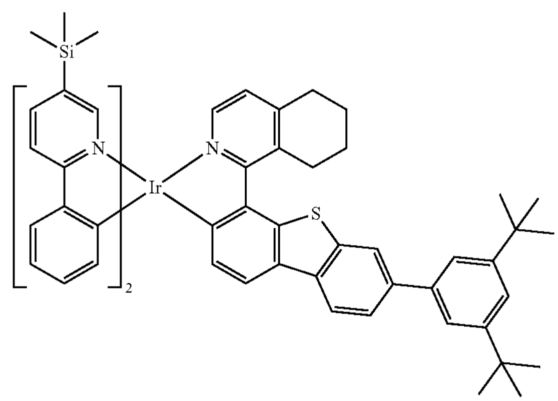
1101
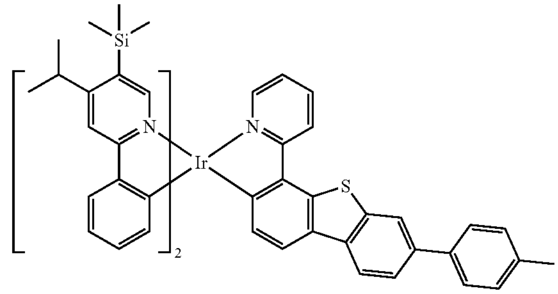

-continued
1102
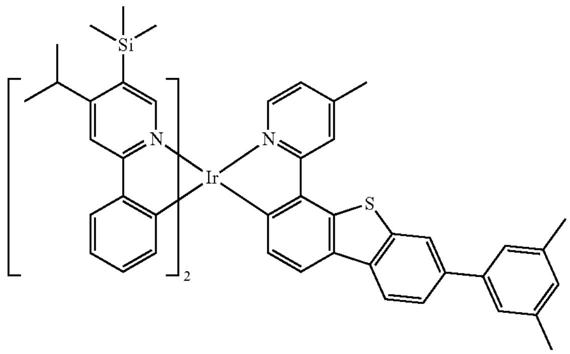
1103
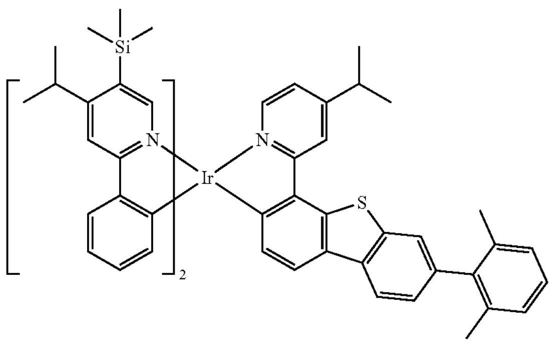
1104
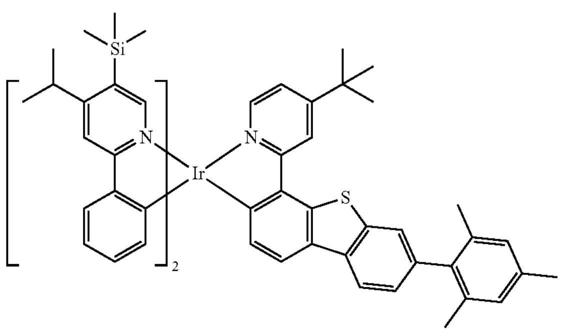
1105
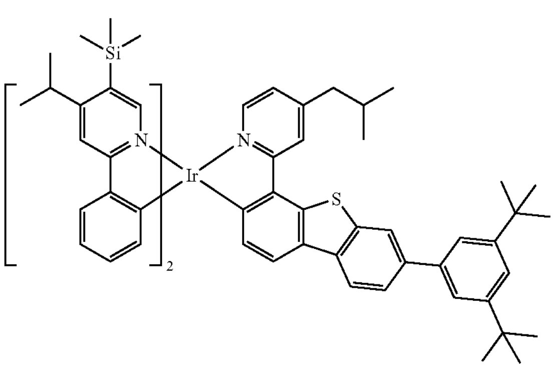
-continued
1106
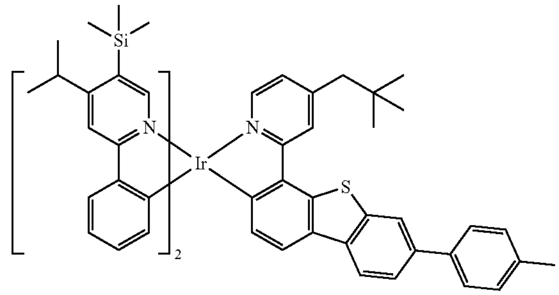
1107
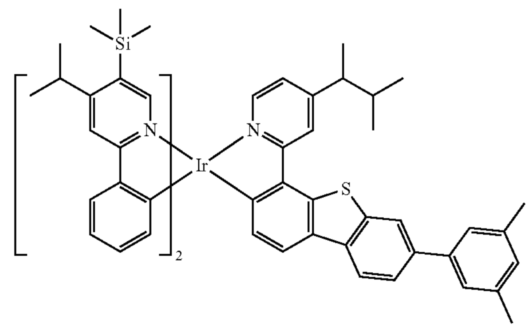
1108
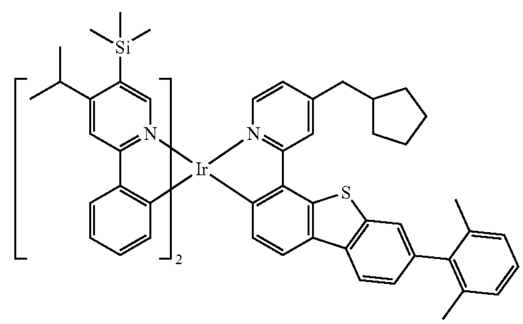
1109
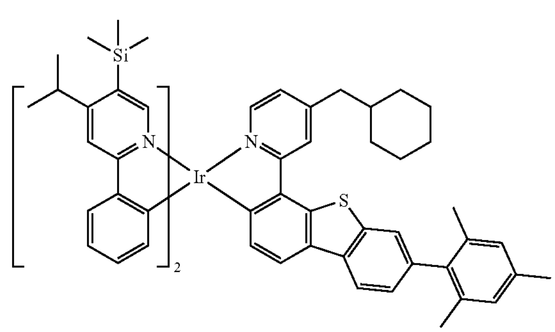

-continued
1110
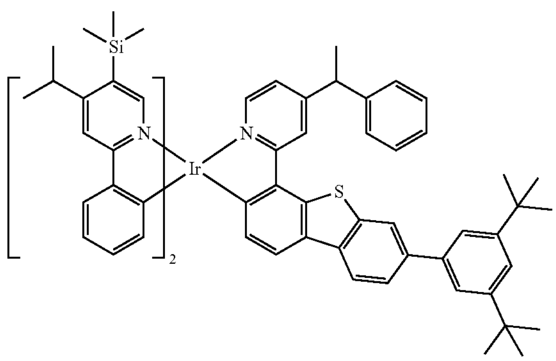
1111
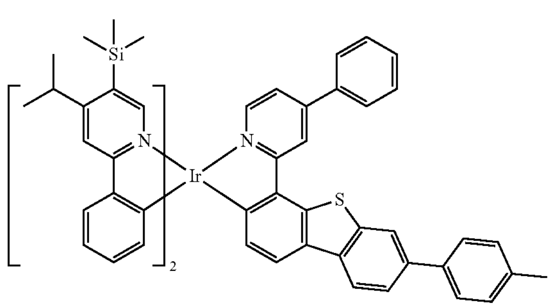
1112
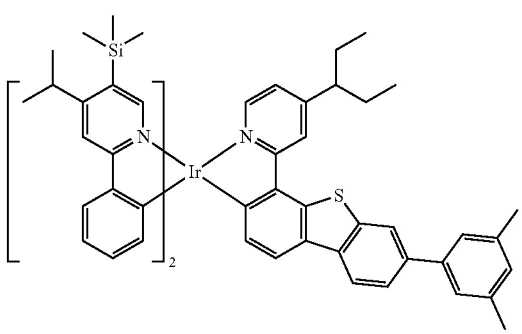
1113
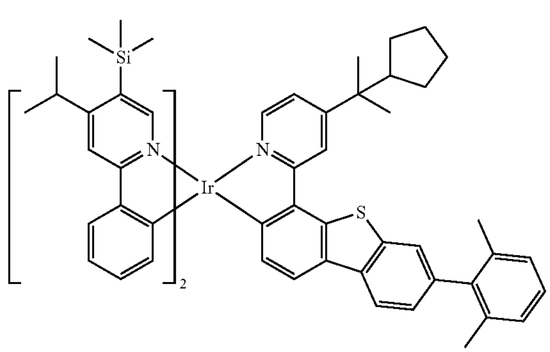
-continued
1114
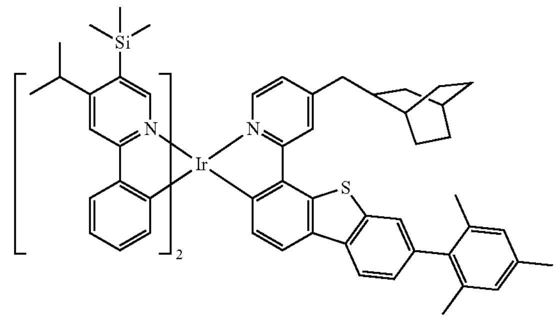
1115
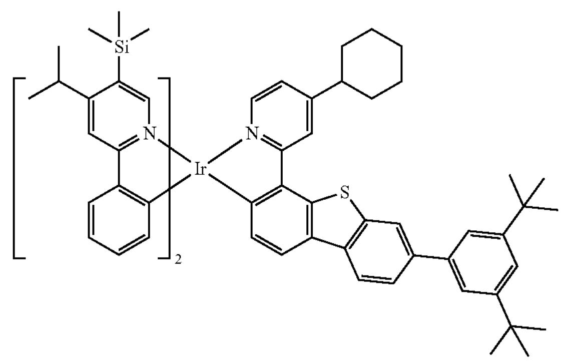
1116
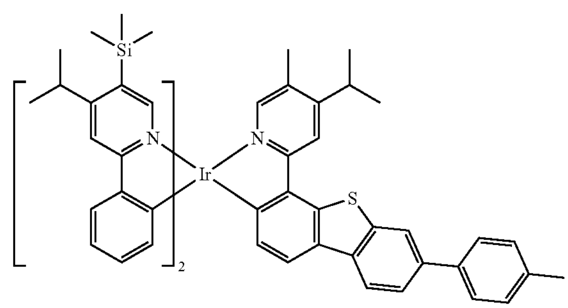
1117
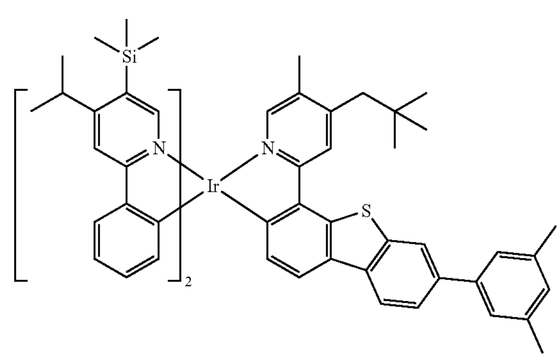

1118
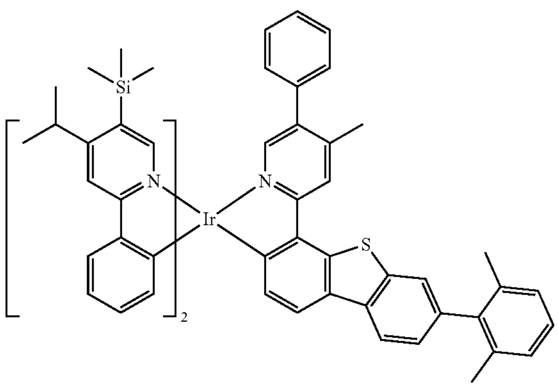
1119
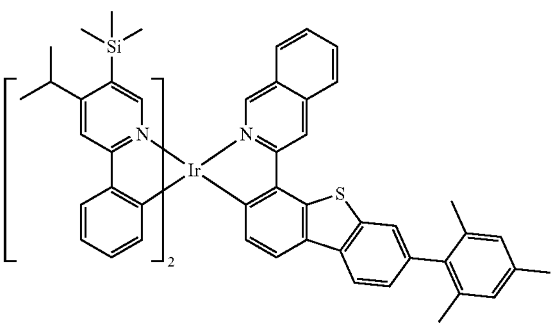
1120
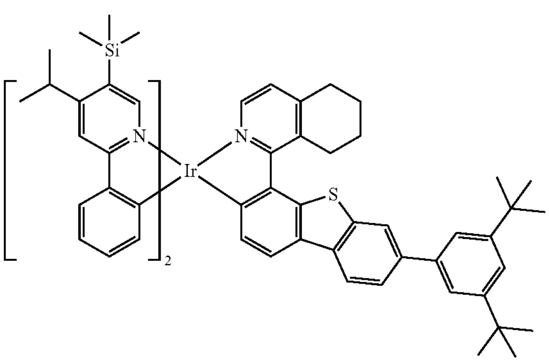
1121
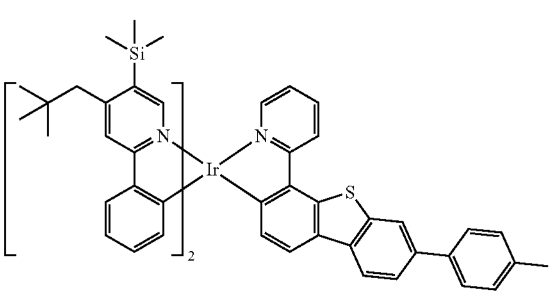
1122
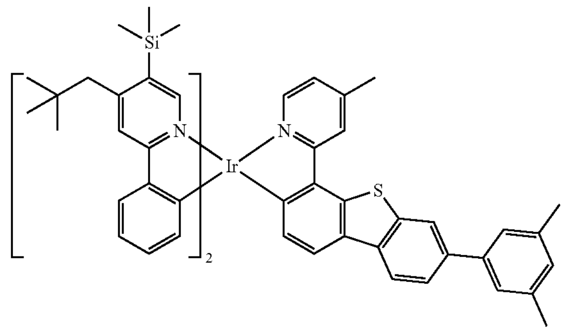
1123
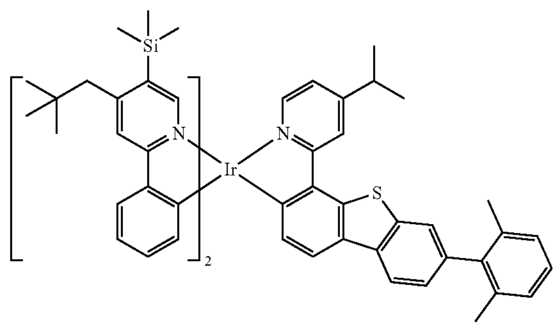
1124
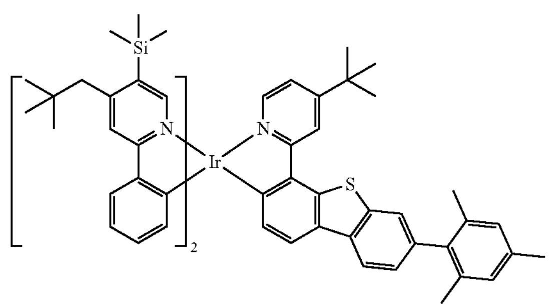
1125
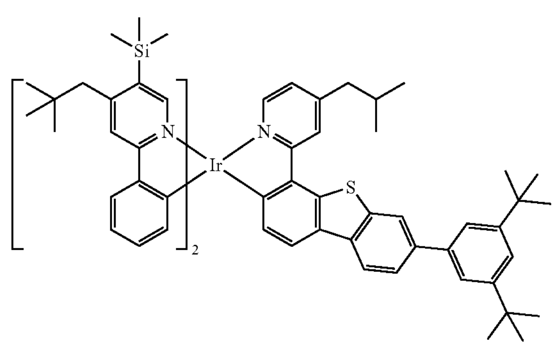

-continued
1126
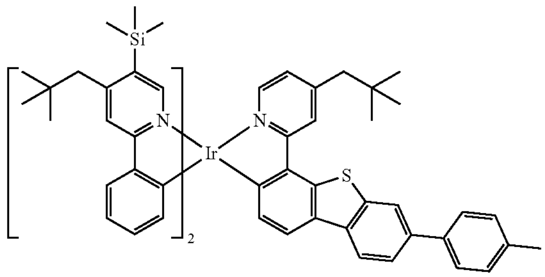
1127
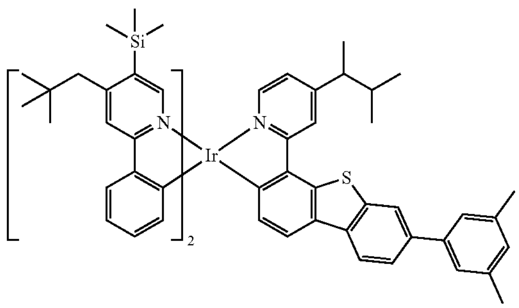
1128
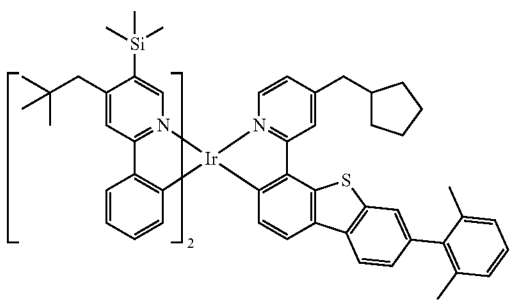
1129
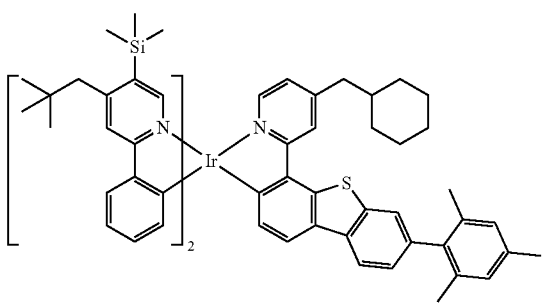
1130
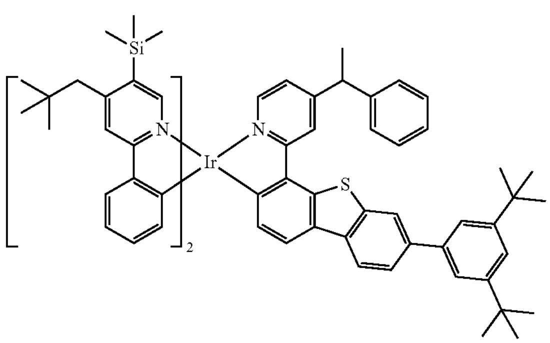
-continued
1131
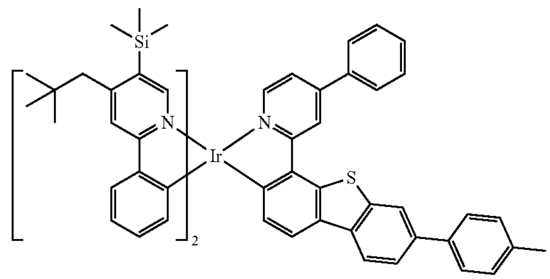
1132
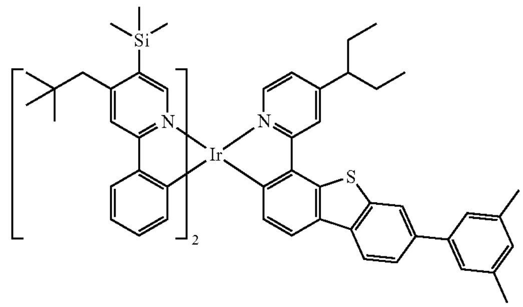
1133
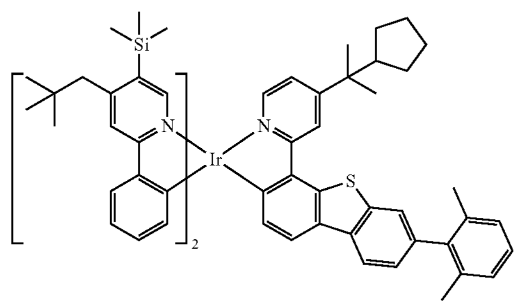
1134
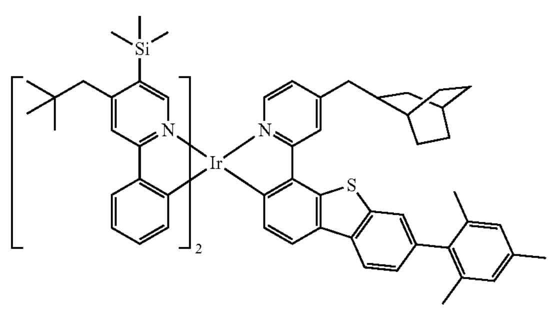
1135
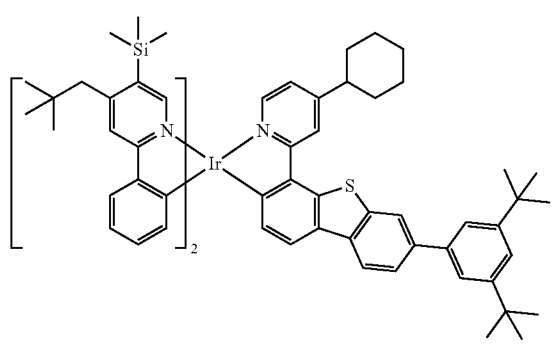

-continued
1136
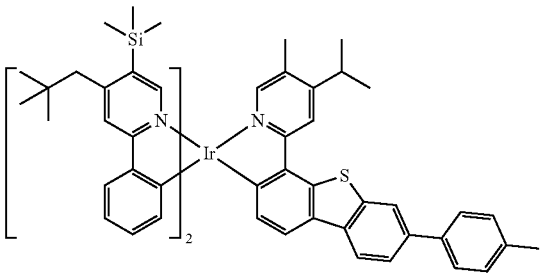
1137
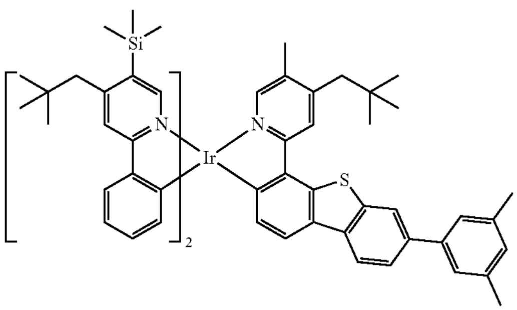
1138
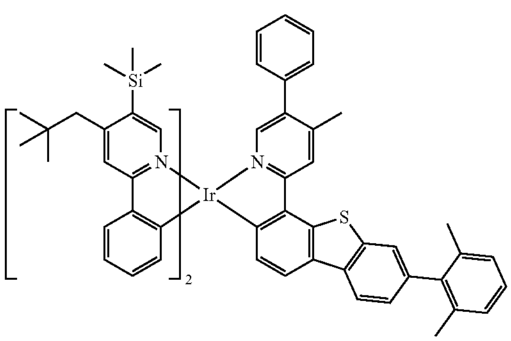
1139
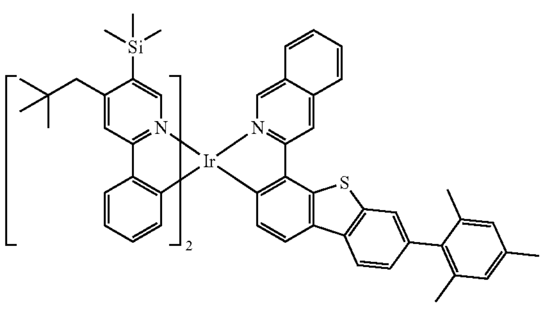
-continued
1140
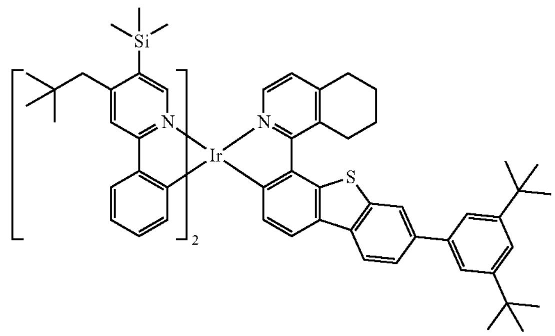
1141
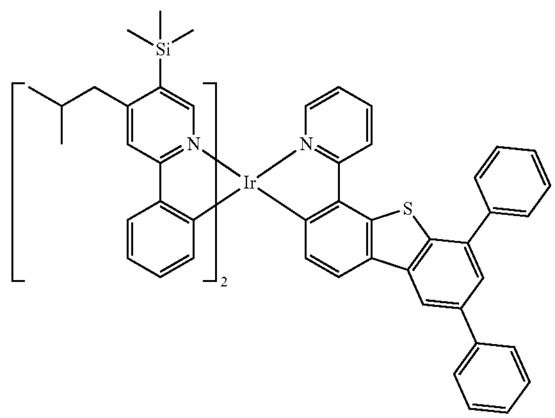
1142
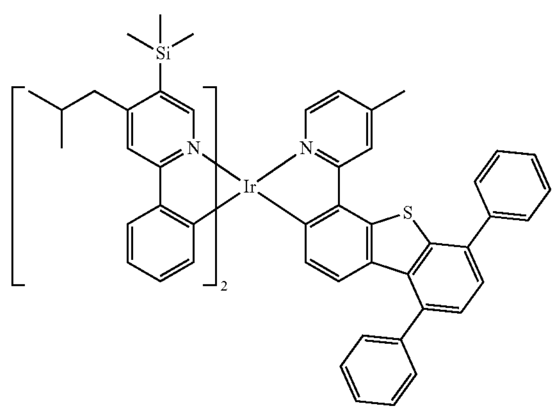
1143
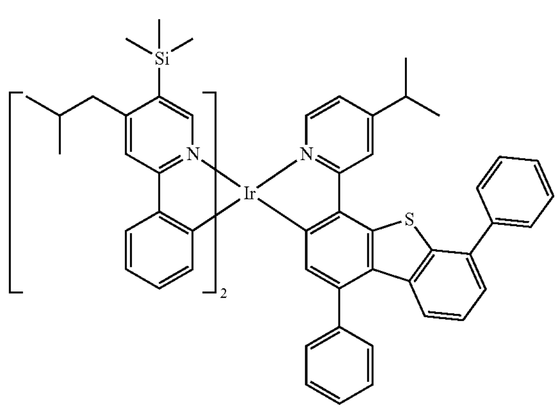

1144
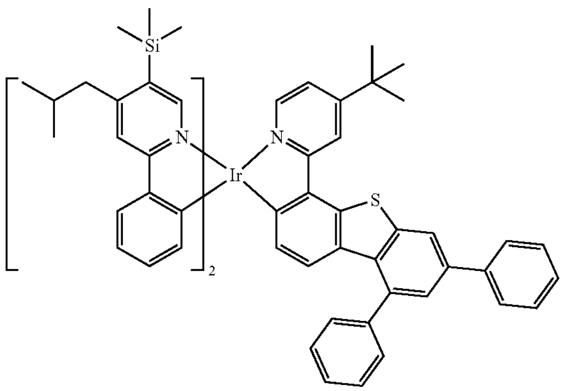
1145
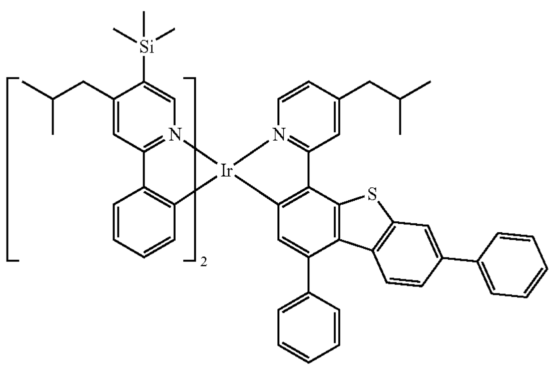
1146
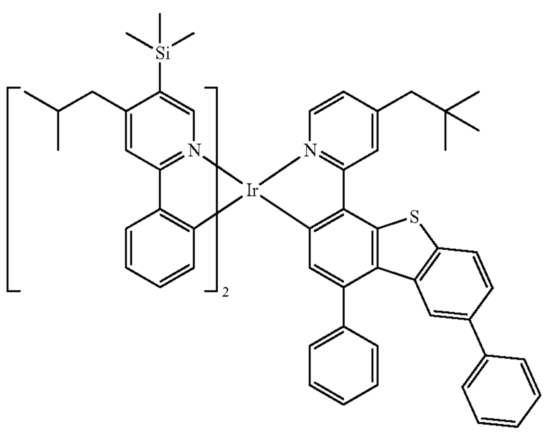
1147
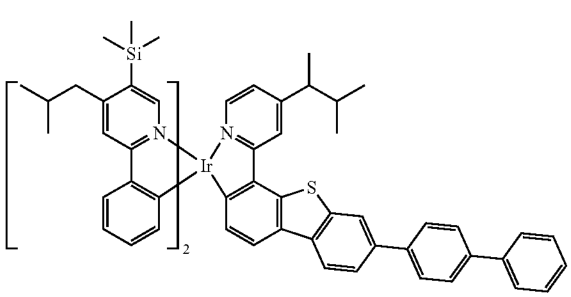
1148
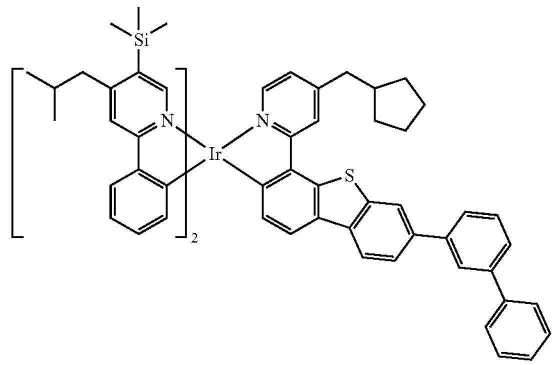
1149
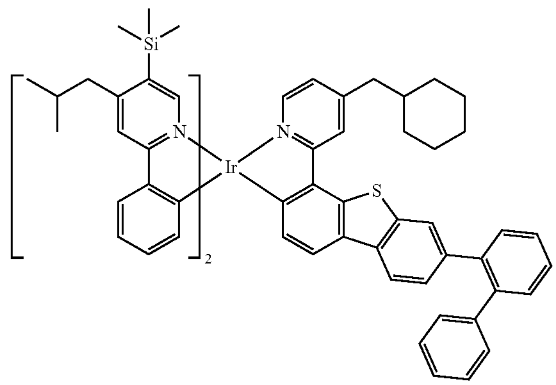
1150
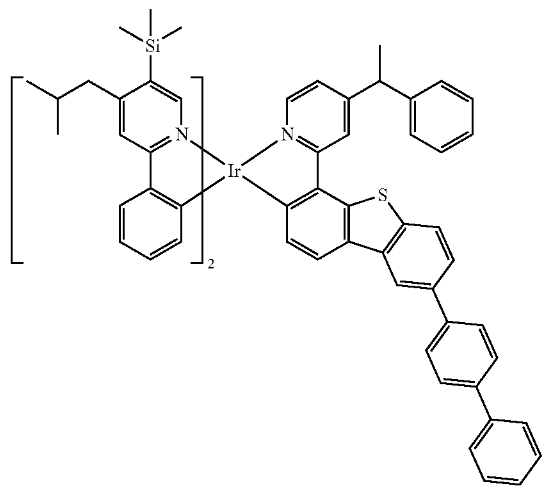
1151
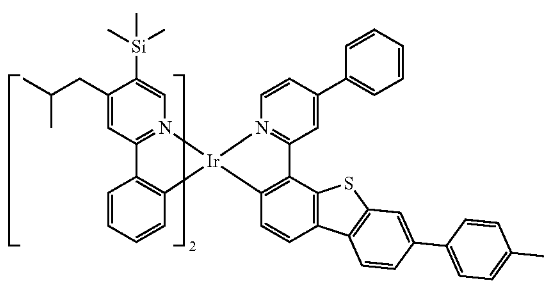

1152
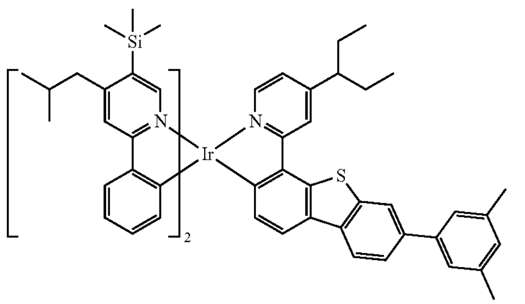
1153
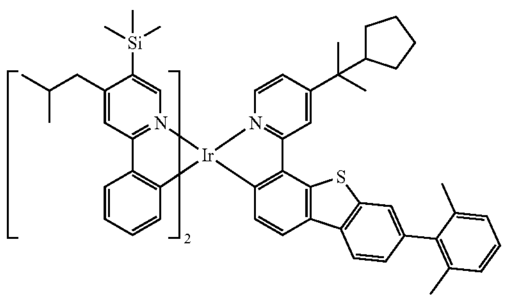
1154
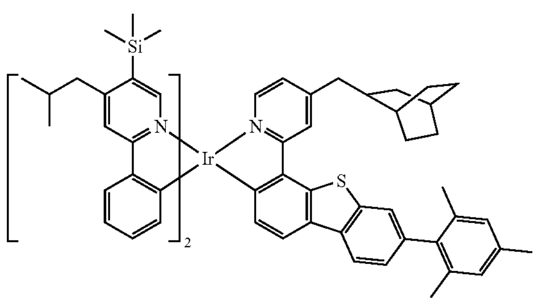
1155
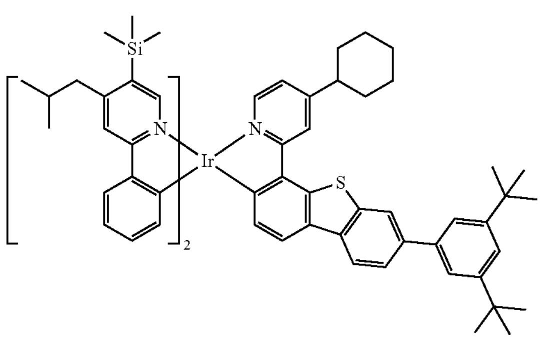
1156
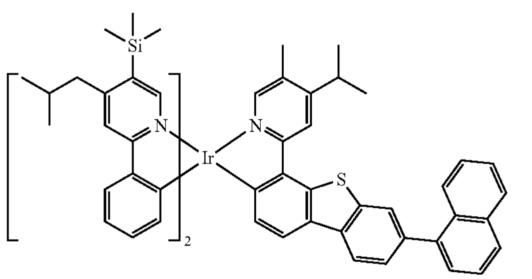
1157
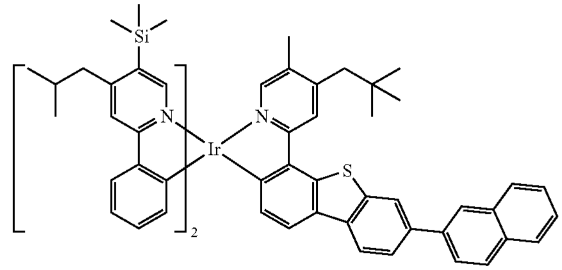
1158
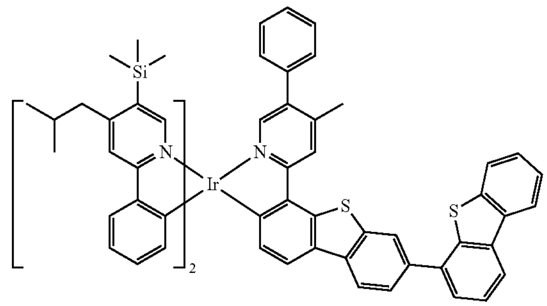
1159
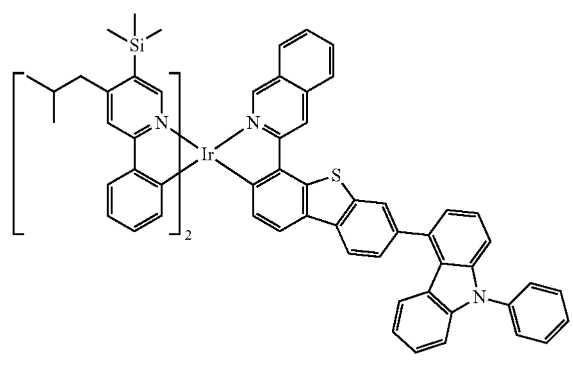
1160
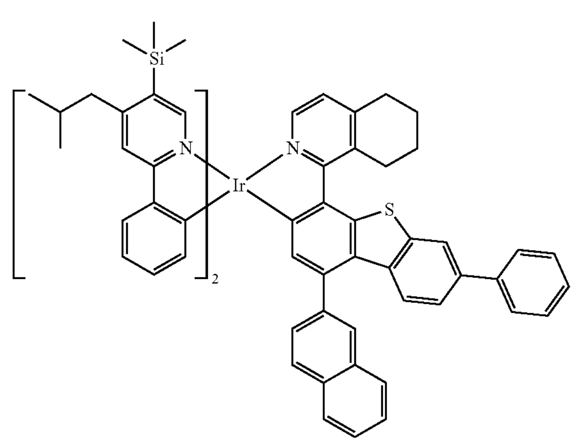

-continued
1161
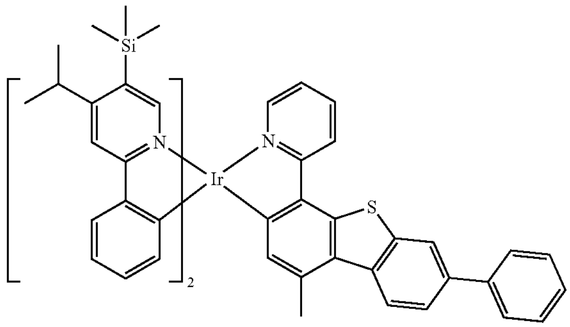
1162
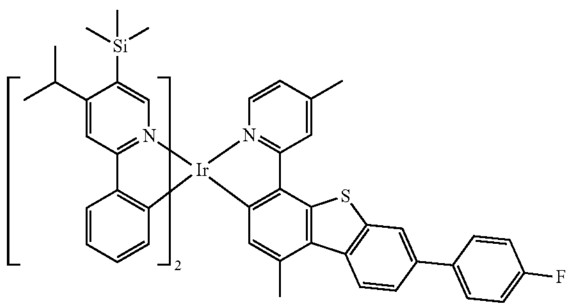
1163
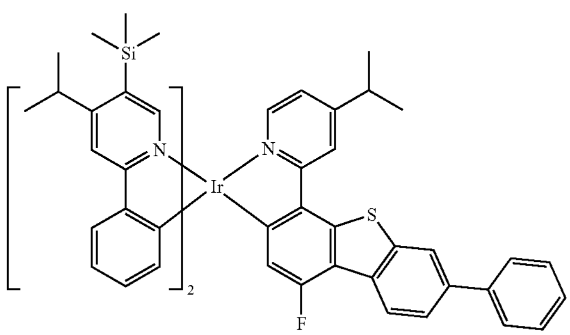
1164
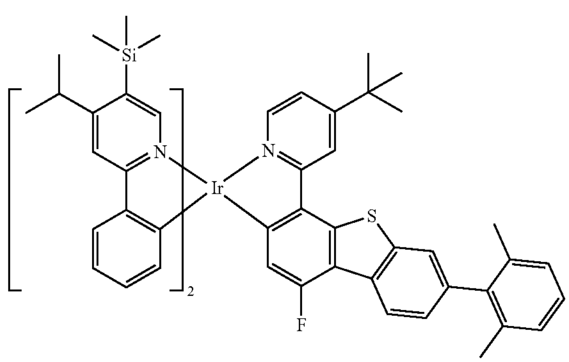
1165
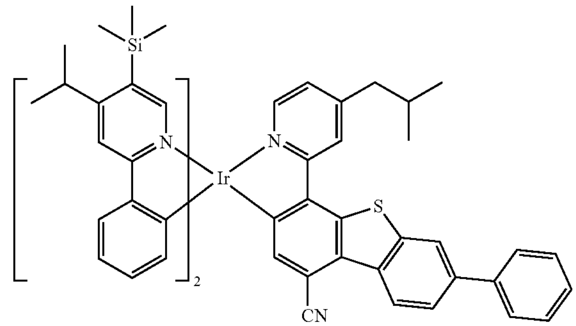
1166
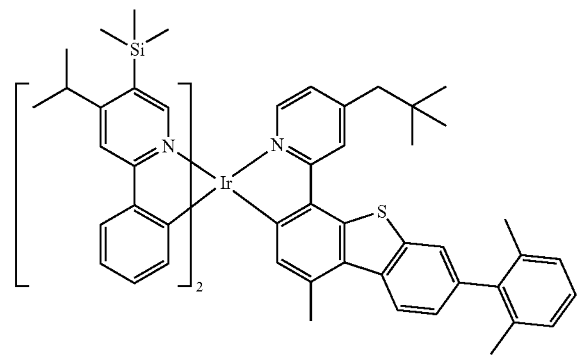
1167
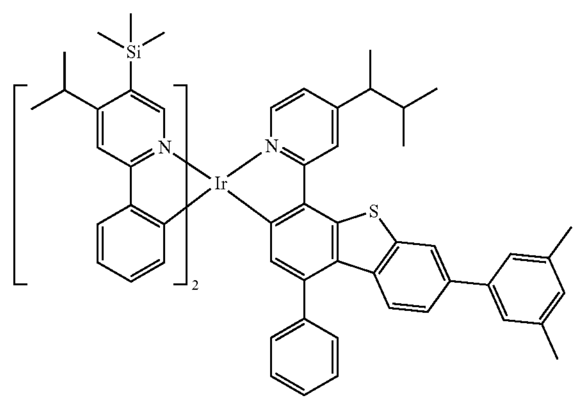
1168
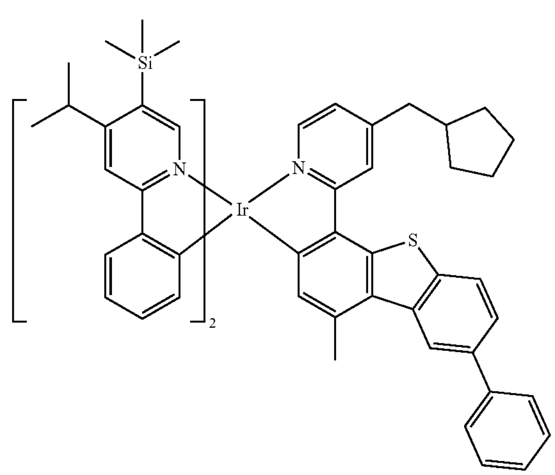

1169
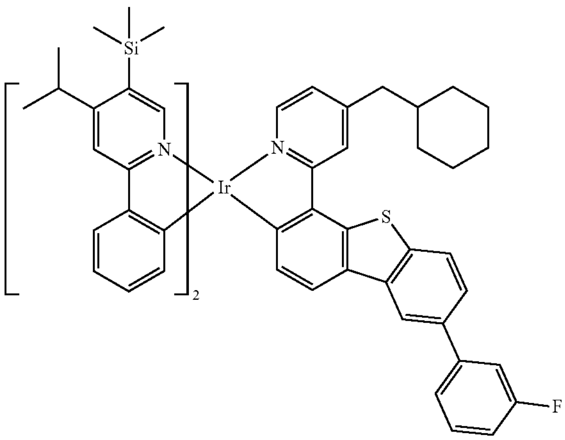
1170
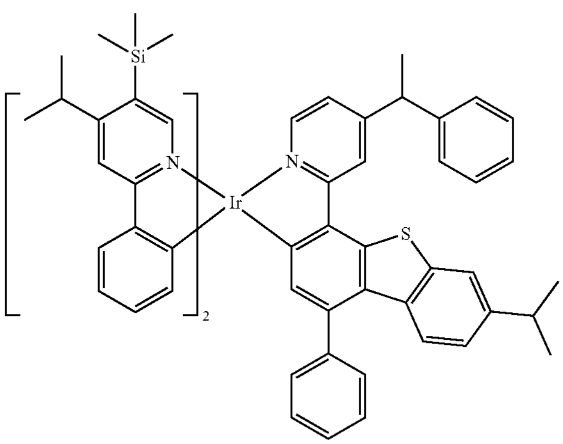
1171
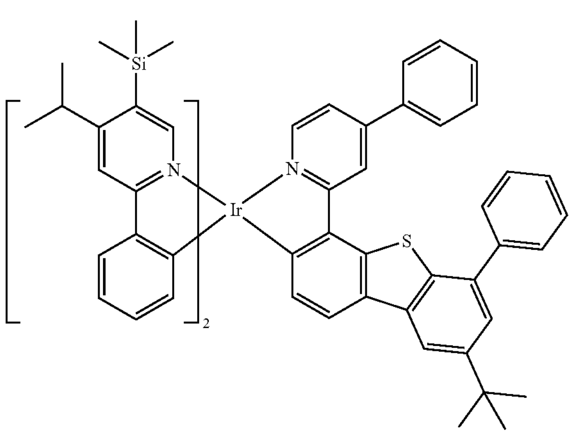
1172
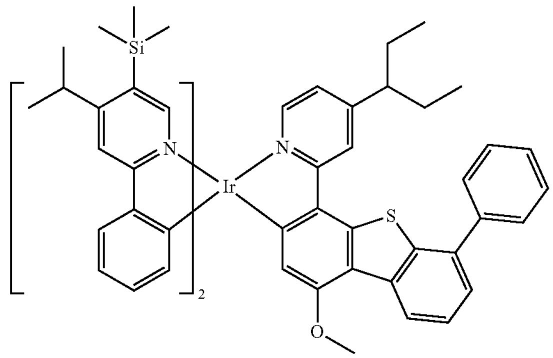
1173
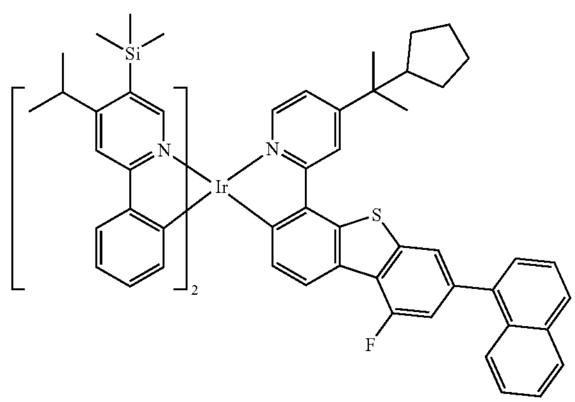
1174
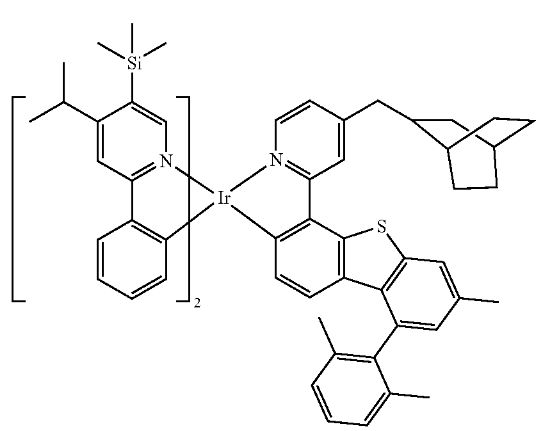

-continued
1175
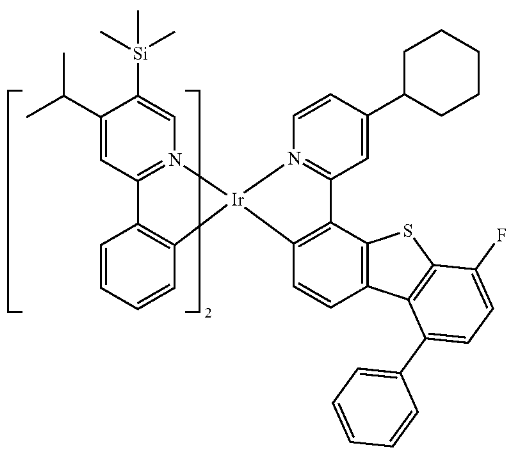
1176
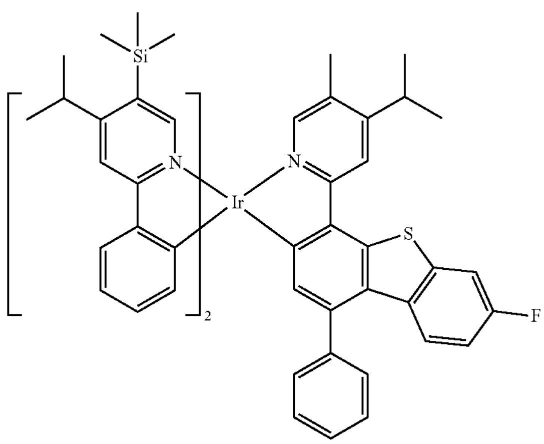
1177
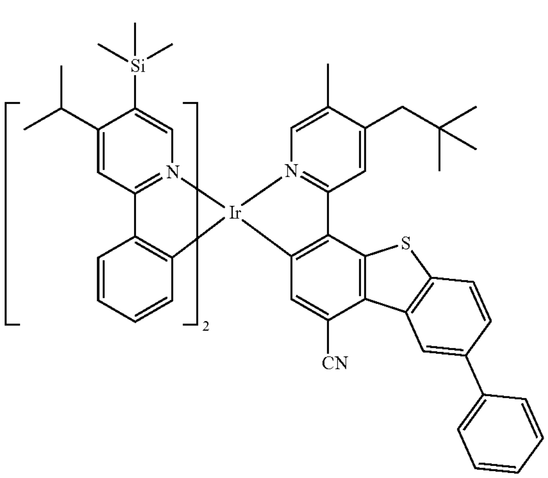
-continued
1178
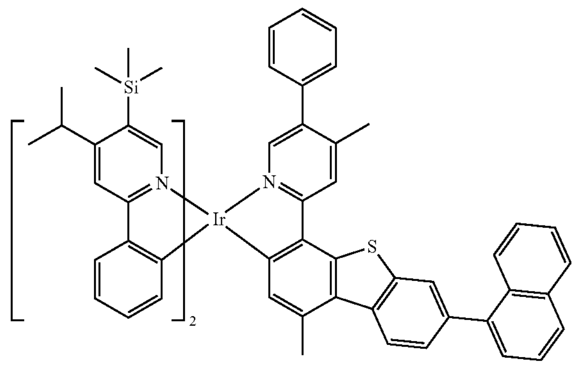
1179
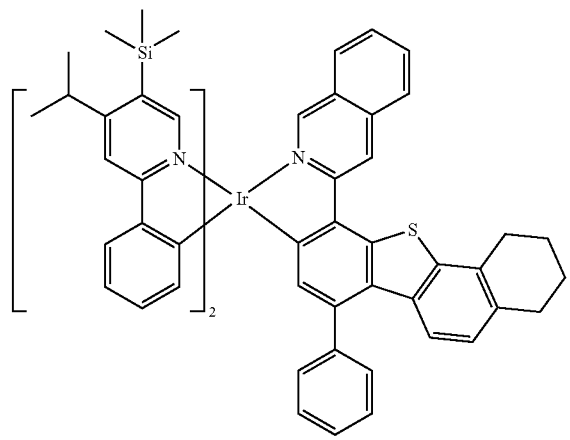
1180
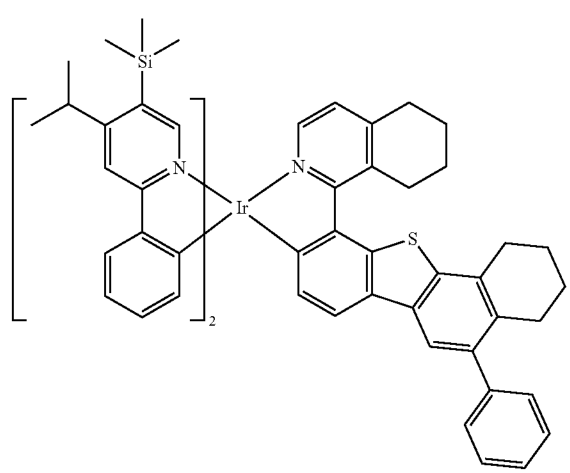

-continued
1181
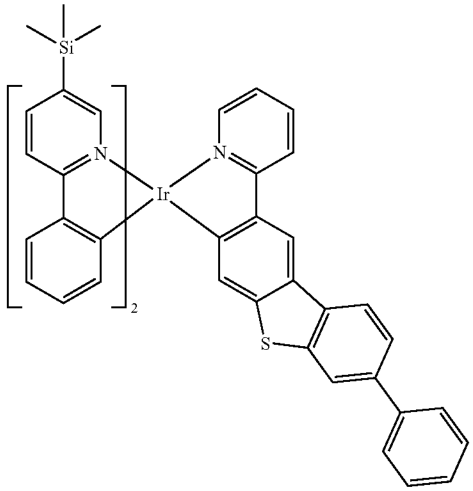
1182
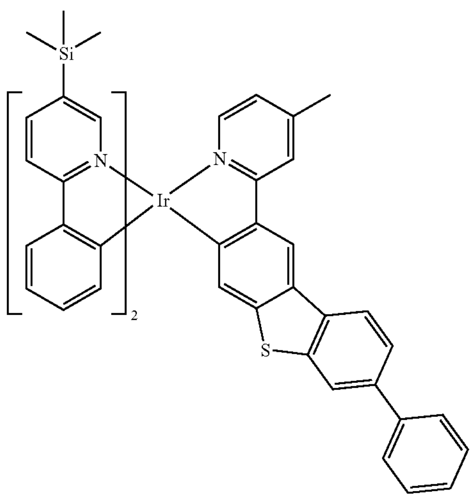
1183
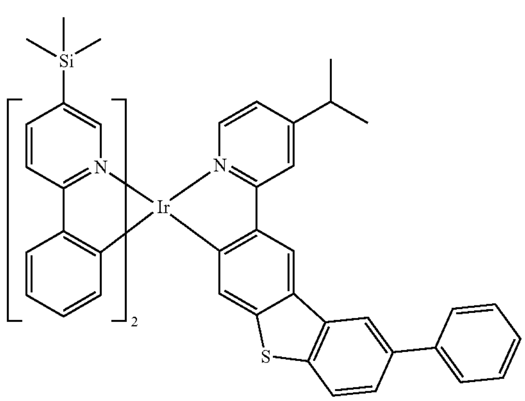
-continued
1184
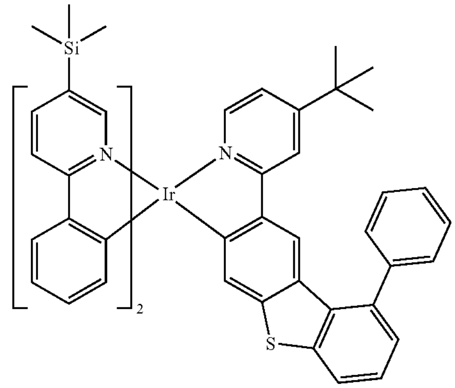
1185
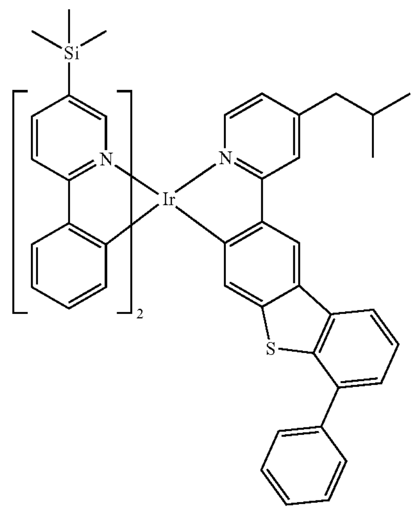
1186
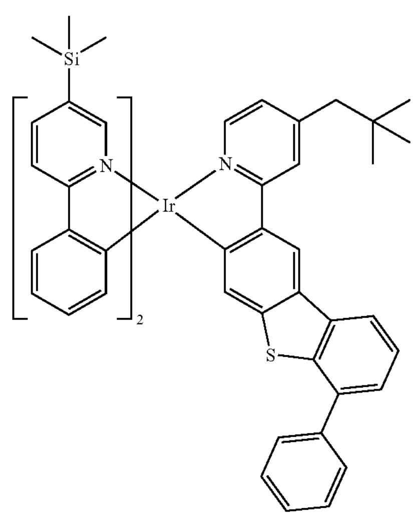

1187
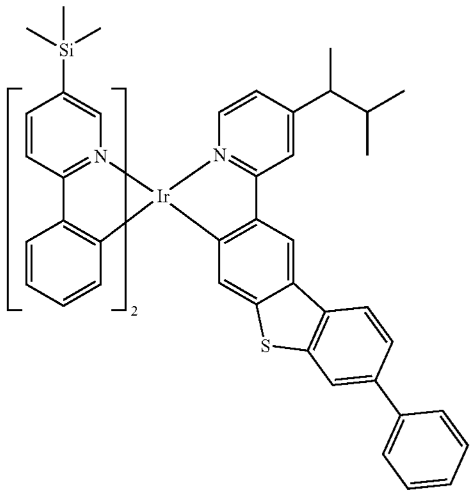
1188
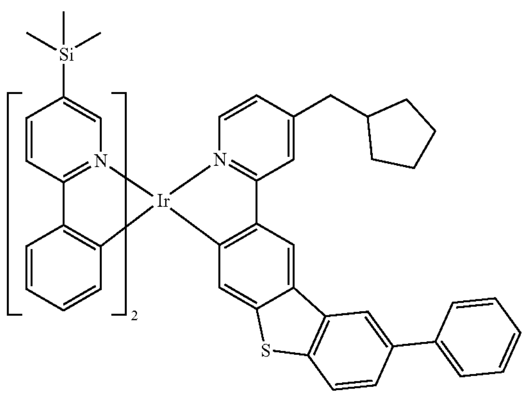
1189
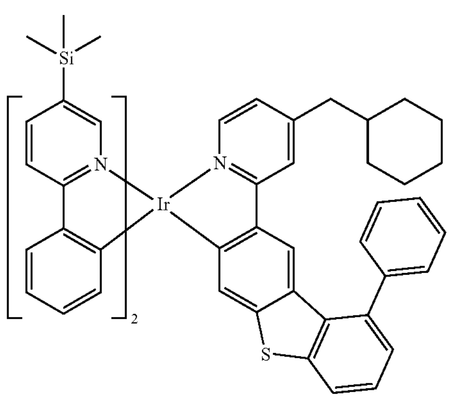
1190
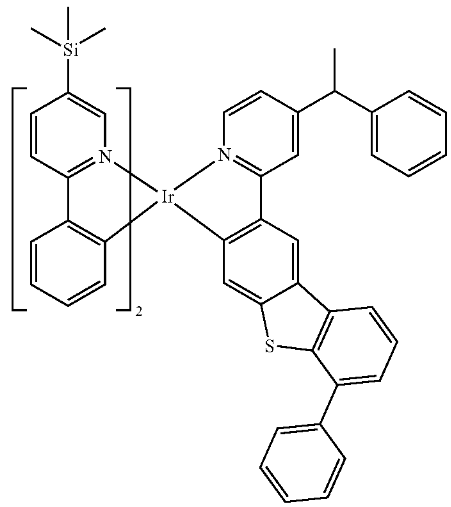
1191
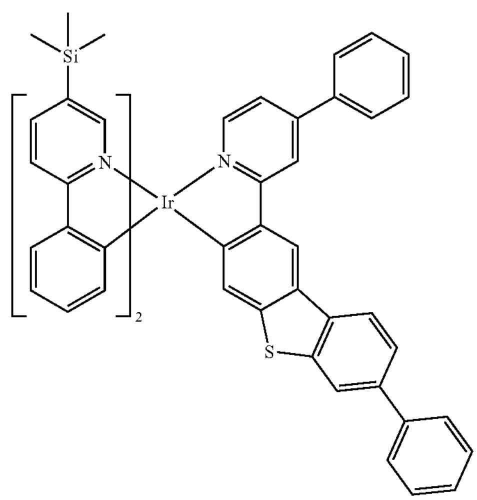
1192
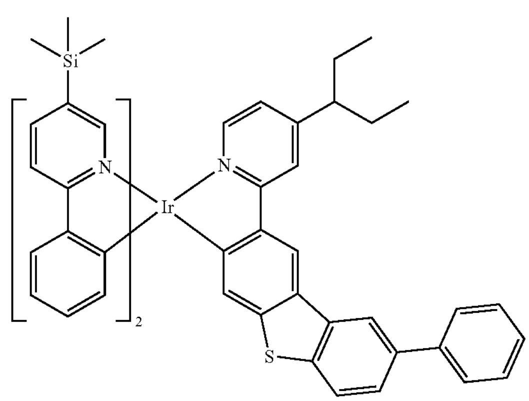

-continued
1193
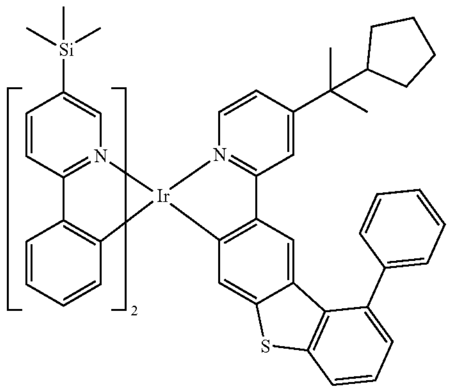
1194
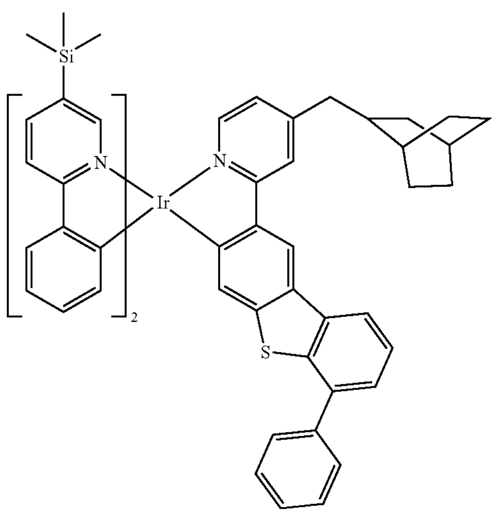
1195
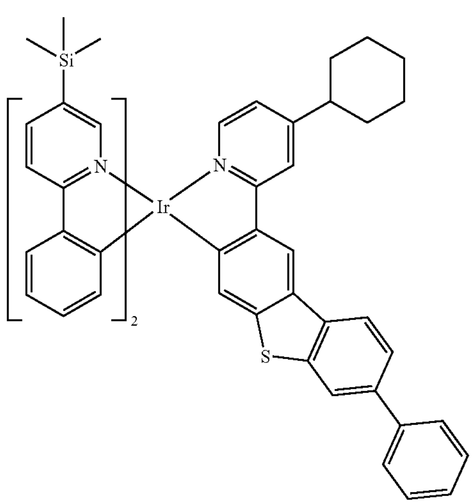
-continued
1196
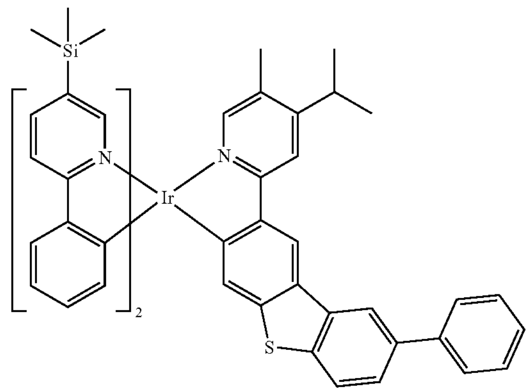
1197
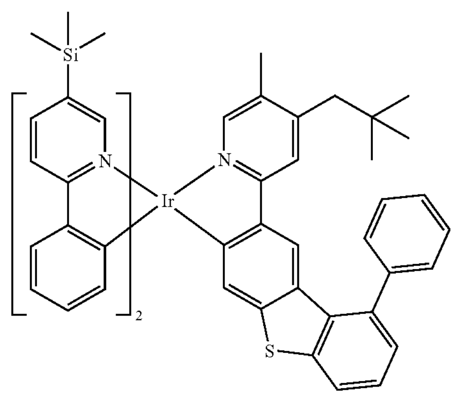
1198
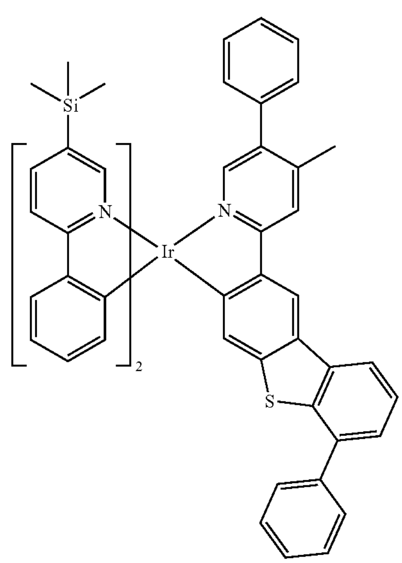

-continued
1199
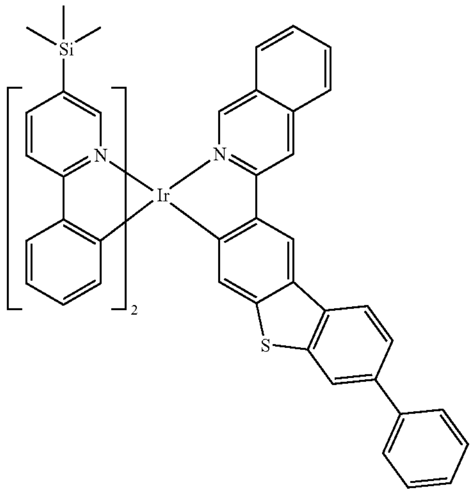
1200
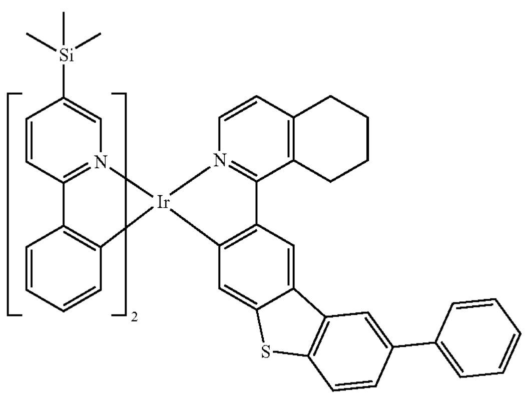
1201
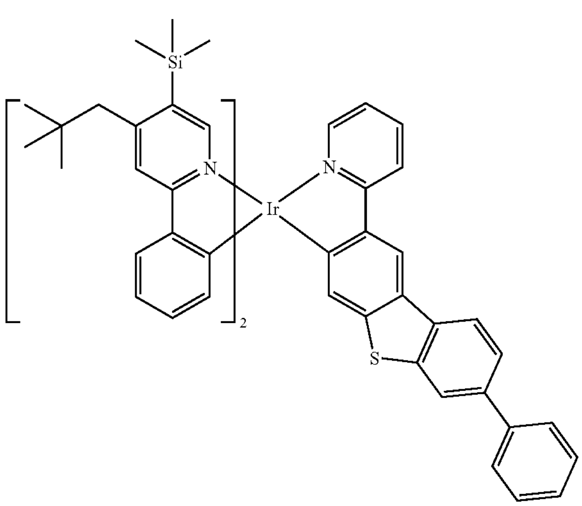
-continued
1202
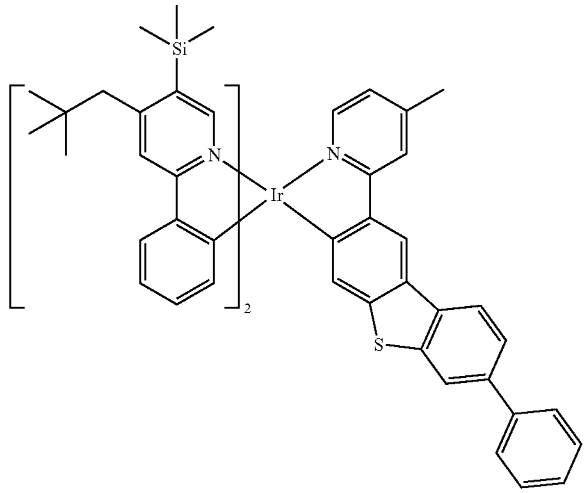
1203
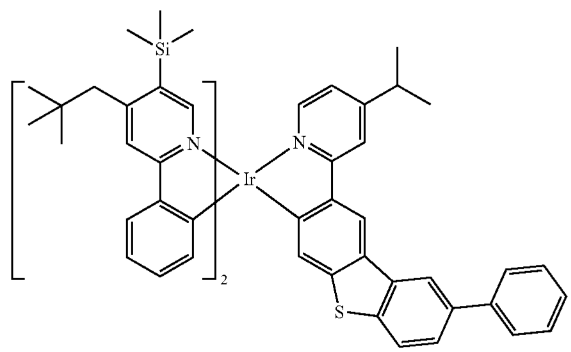
1204
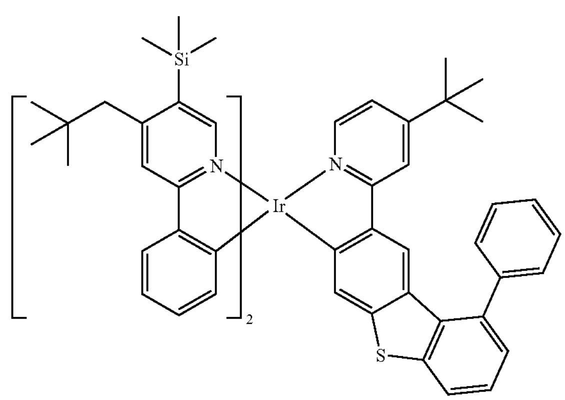

-continued
1205
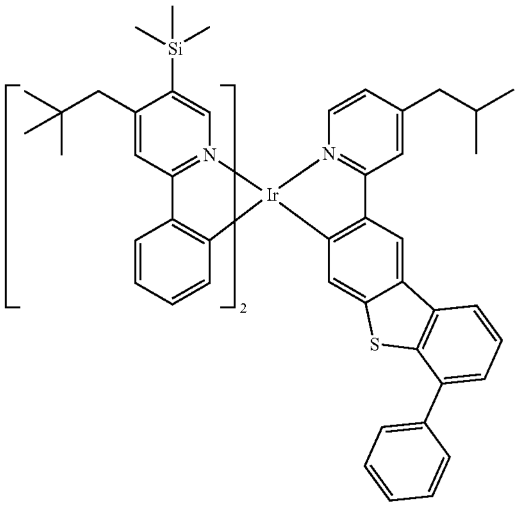
1206
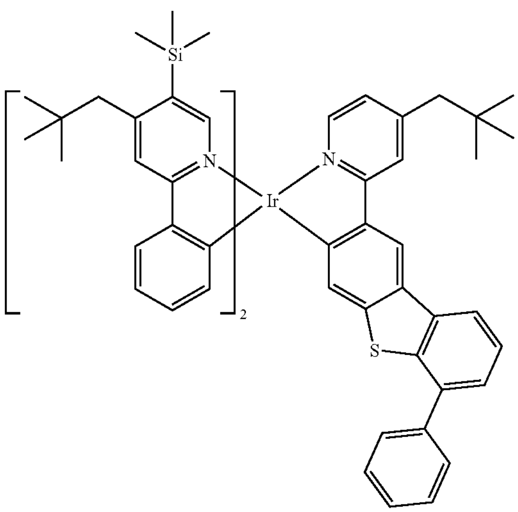
1207
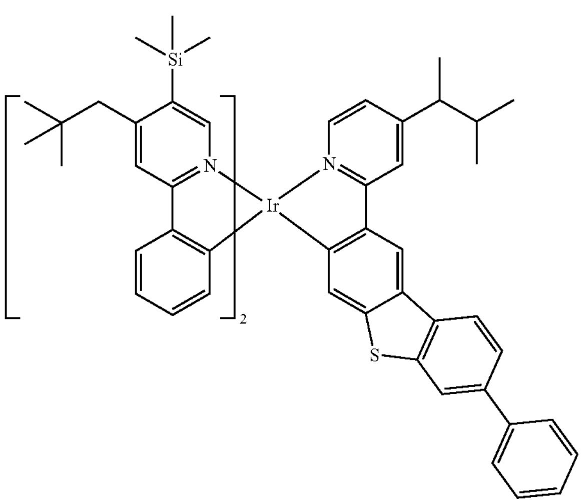
-continued
1208
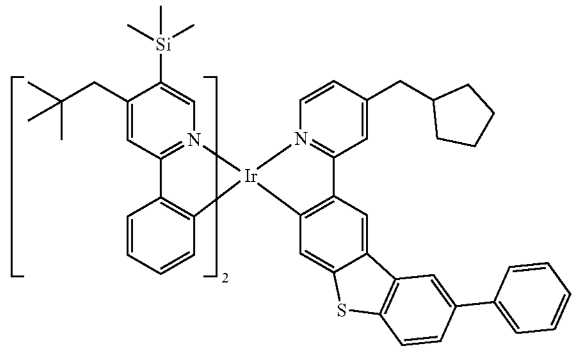
1209
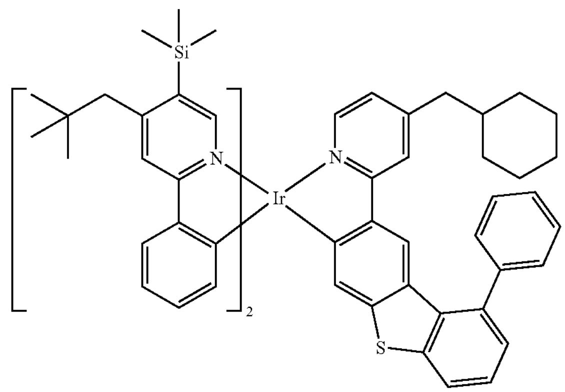
1210
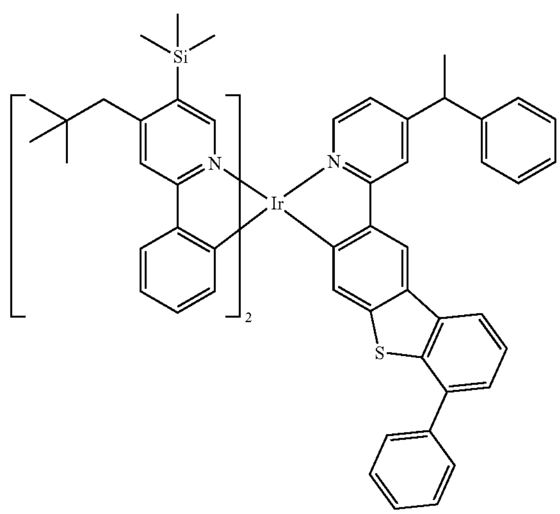

-continued
1211
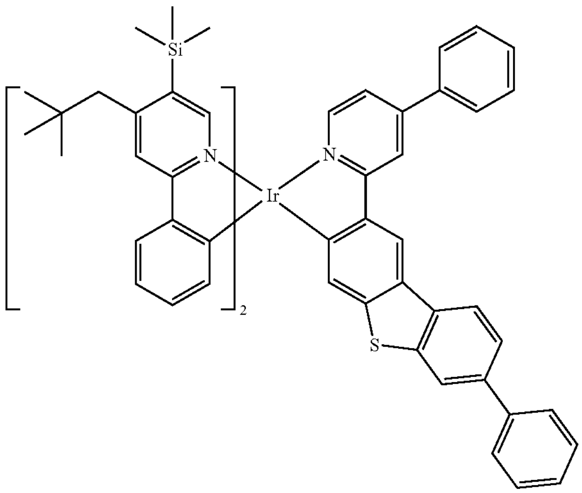
1212
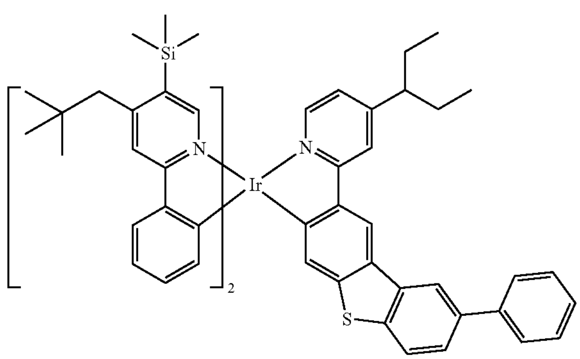
1213
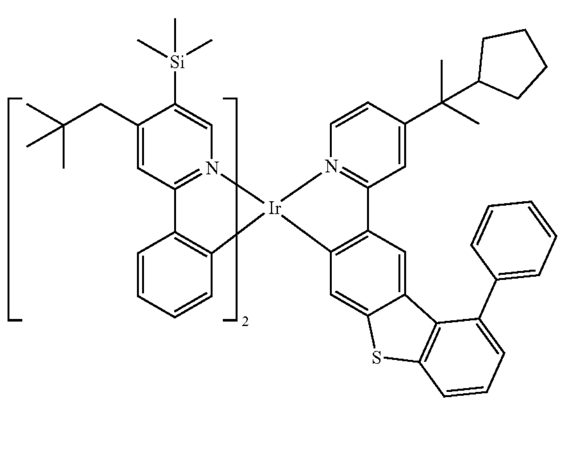
-continued
1214
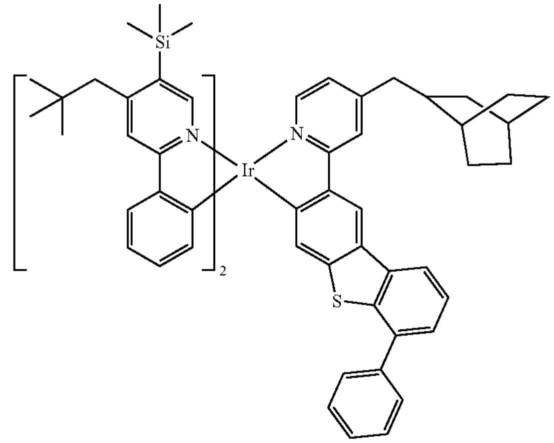
1215
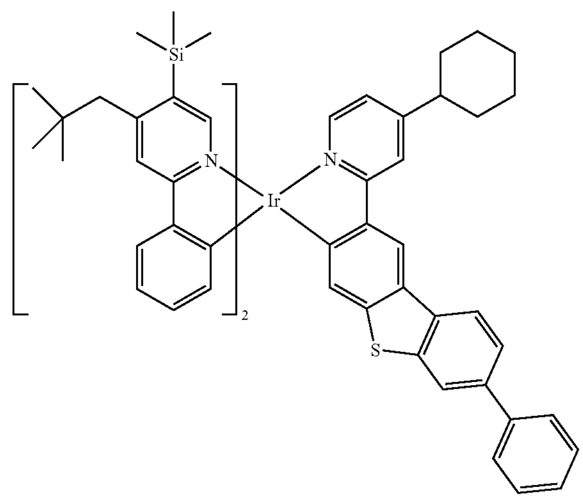
1216
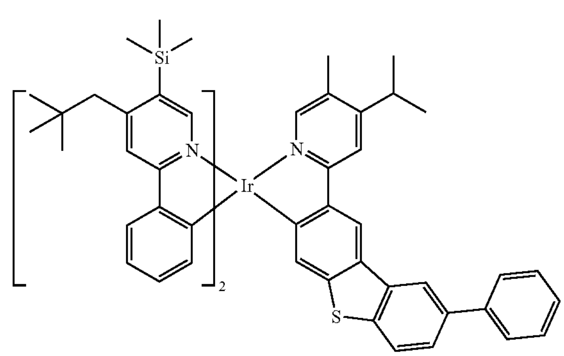

-continued
1217
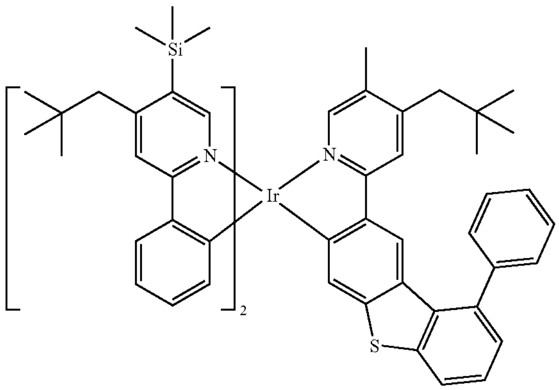
1218
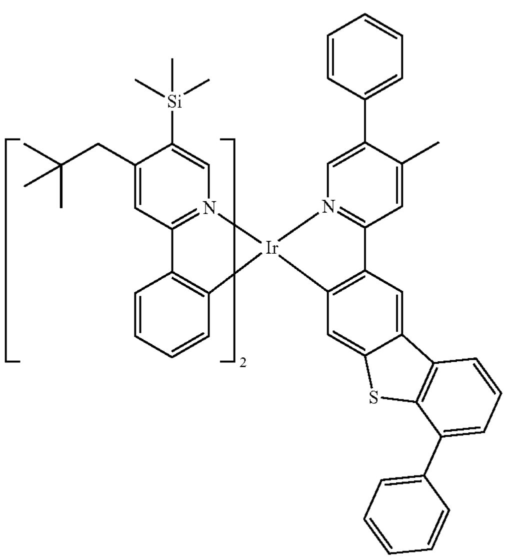
1219
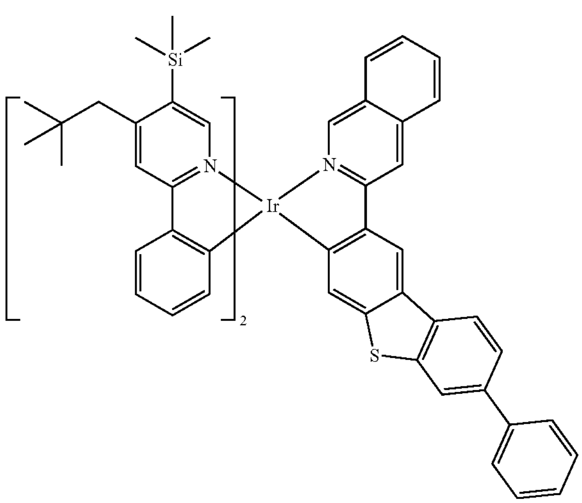
-continued
1220
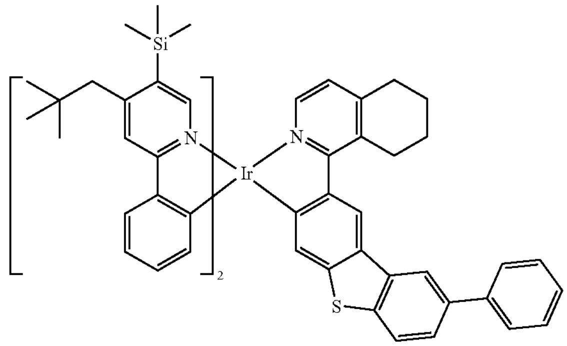
1221
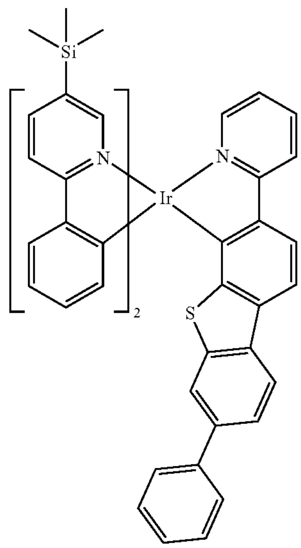
1222
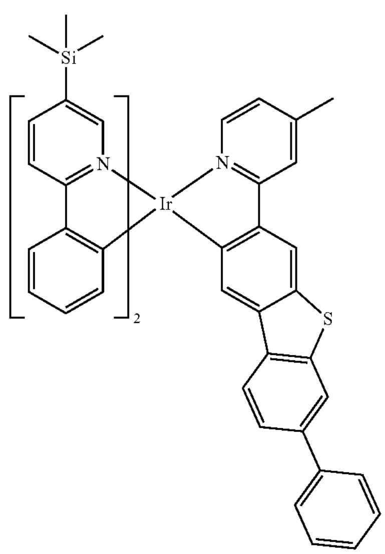

-continued
1223
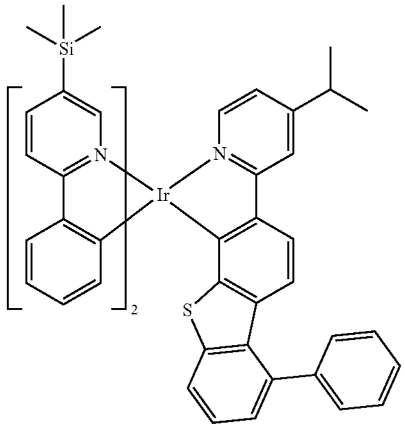
1224
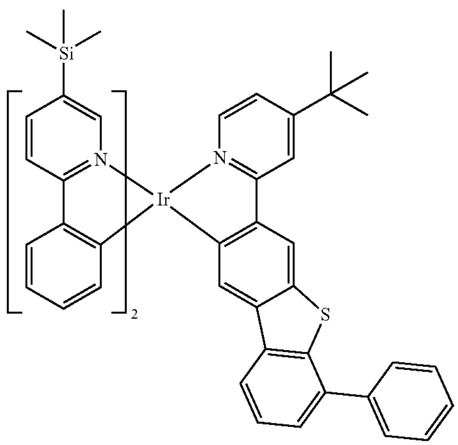
1225
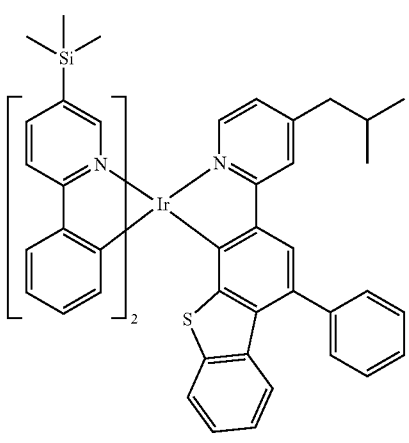
-continued
1226
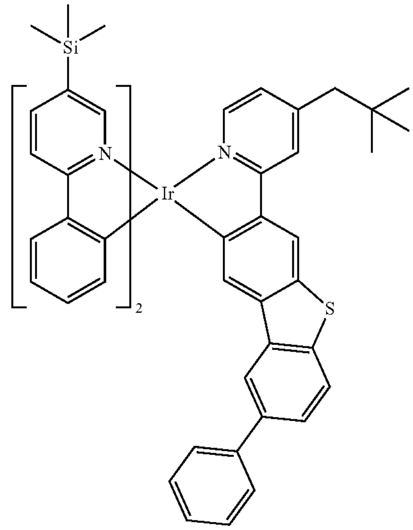
1227
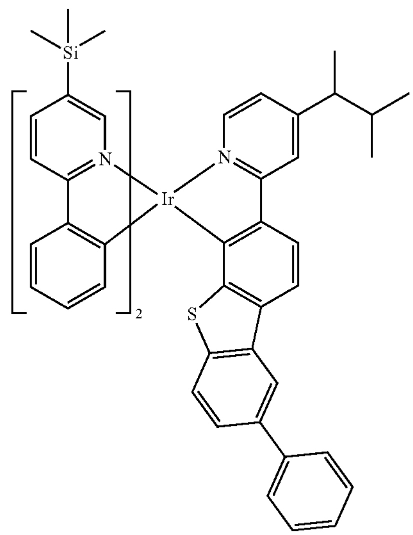
1228
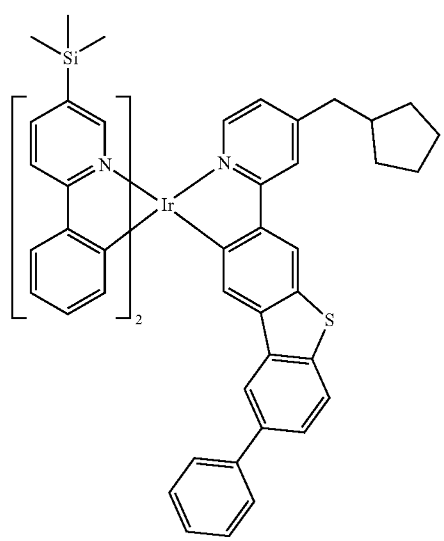

1229
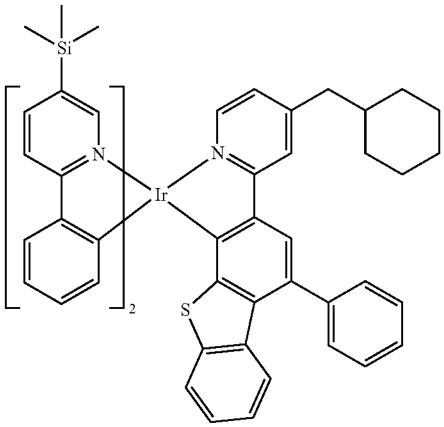
1230
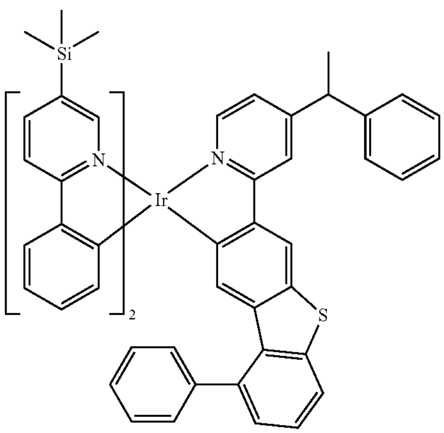
1231
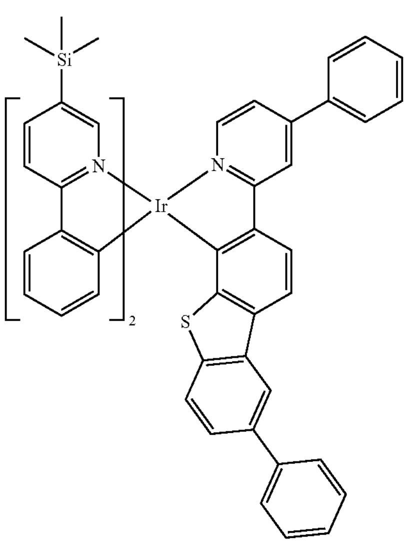
1232
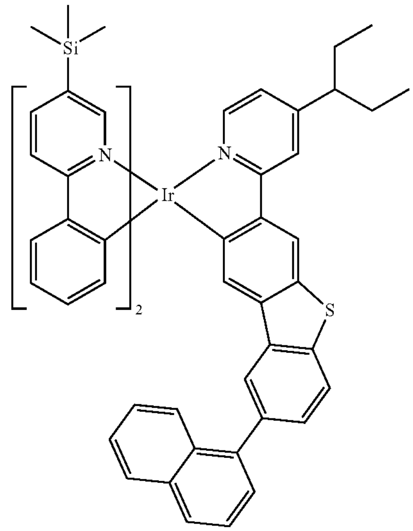
1233
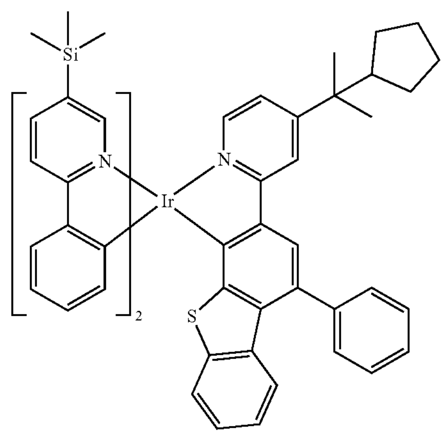
1234
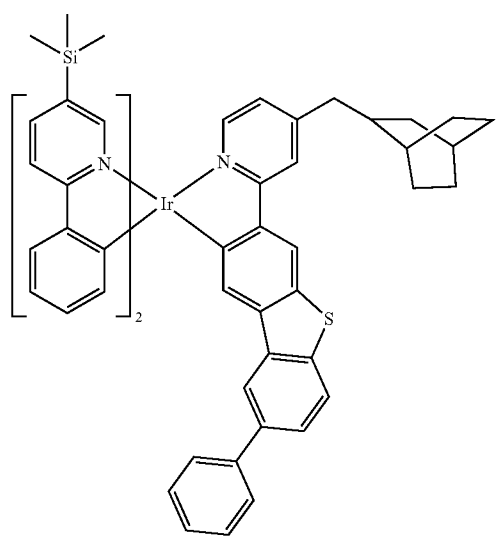

-continued
1235
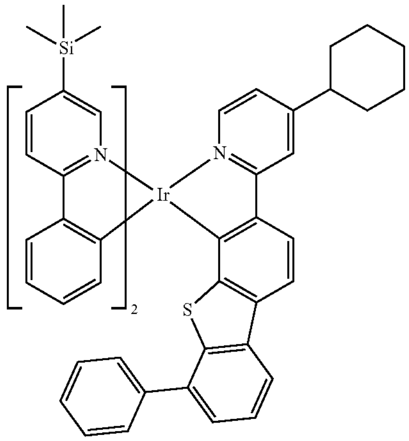
1236
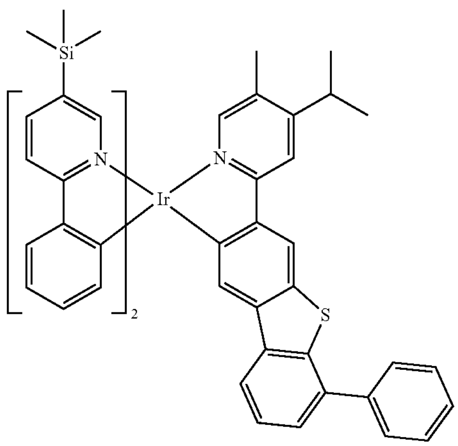
1237
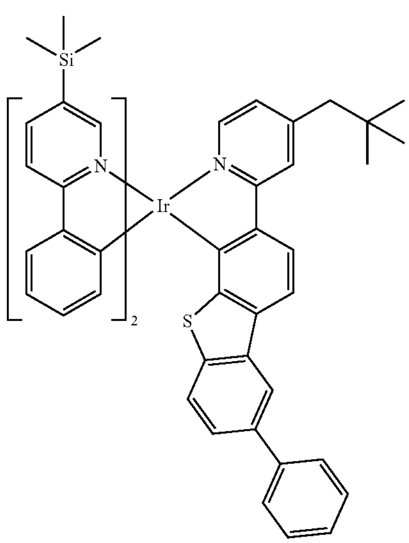
-continued
1238
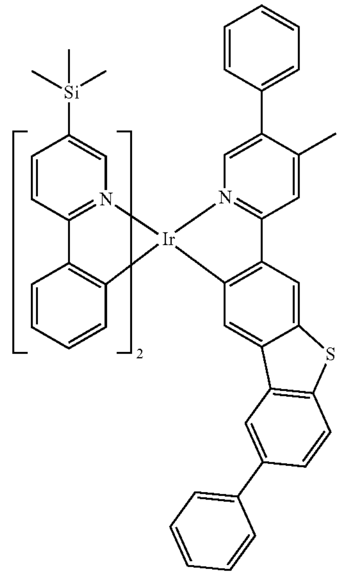
1239
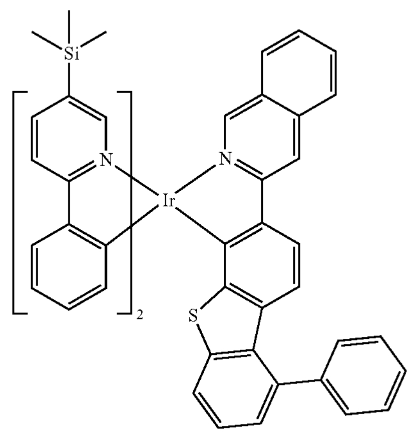
1240
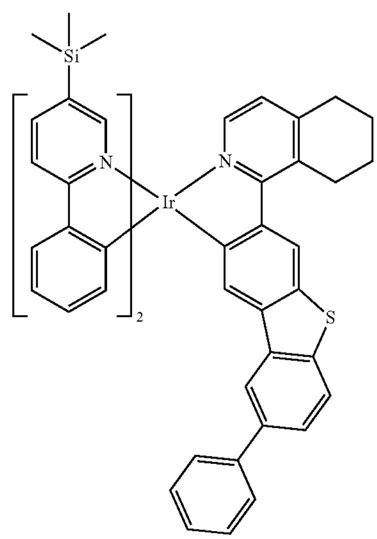

-continued
1241
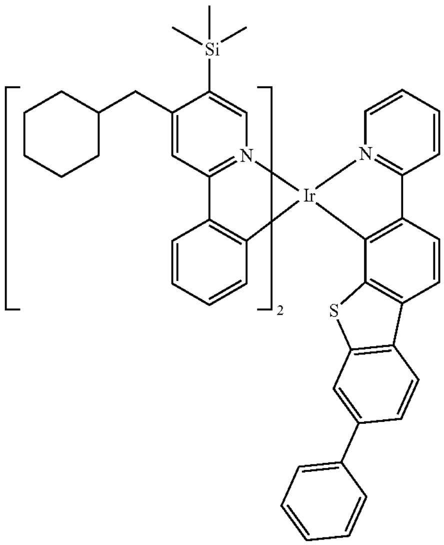
1242
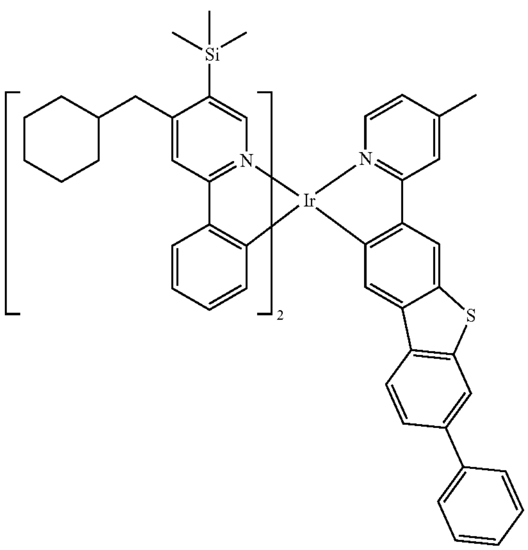
1243
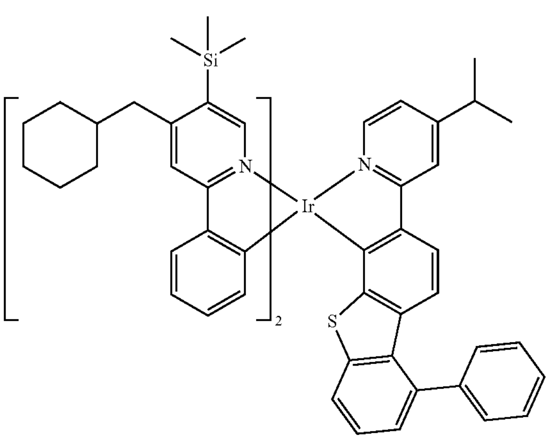
-continued
1244
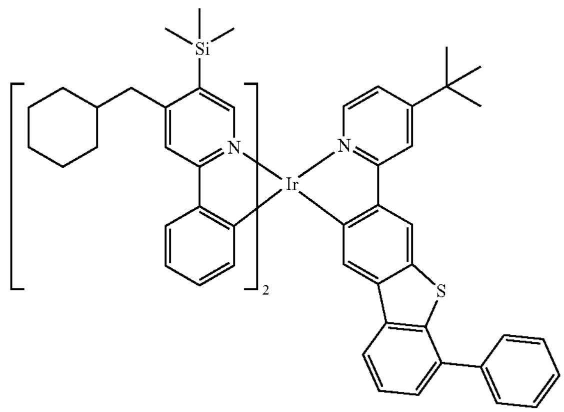
1245
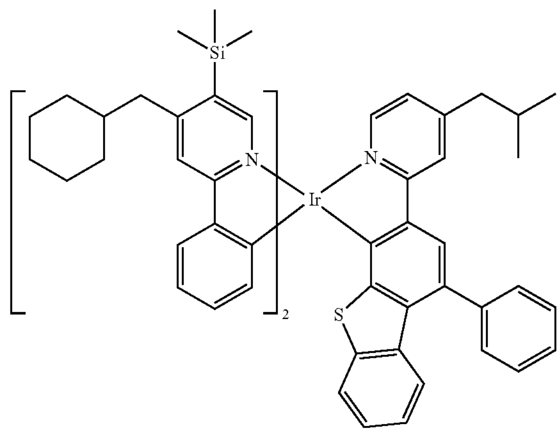
1246
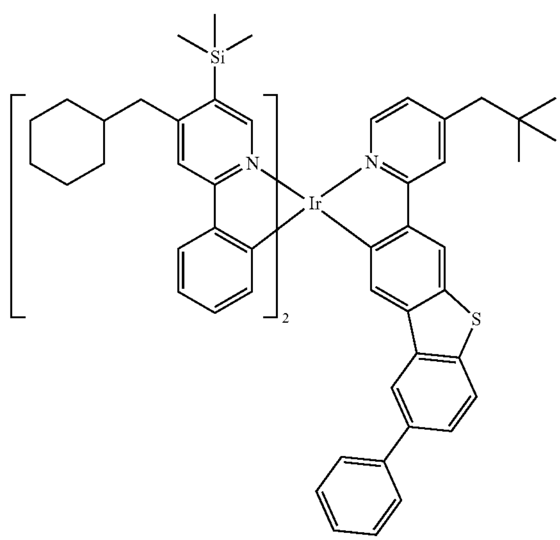

1247
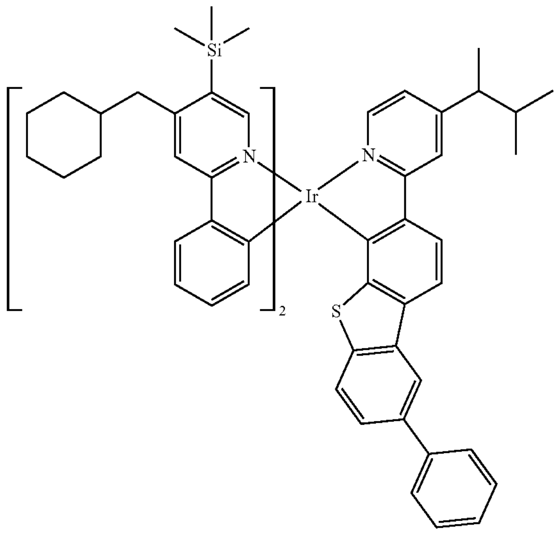
1248
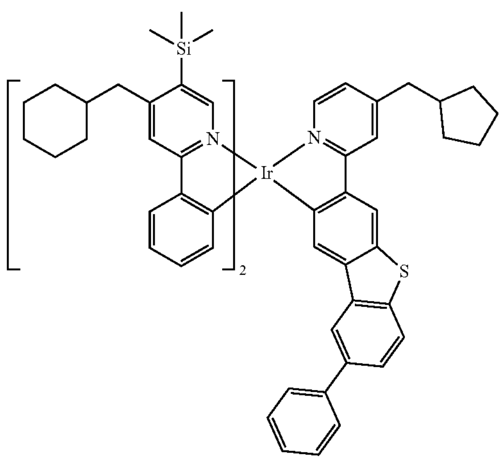
1249
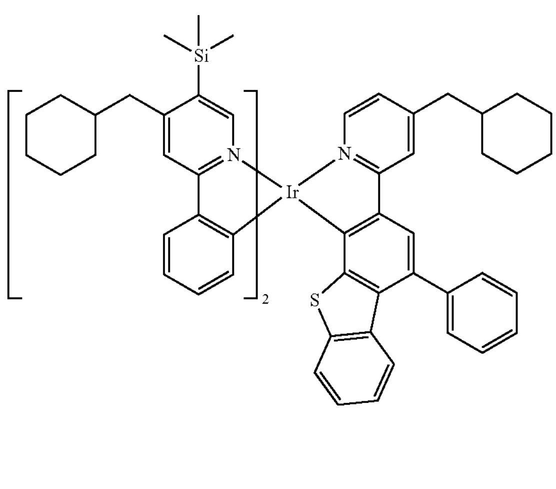
1250
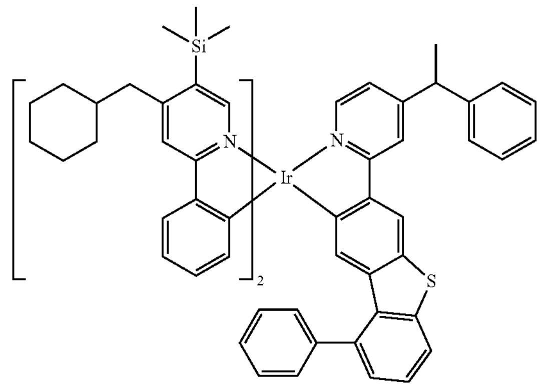
1251
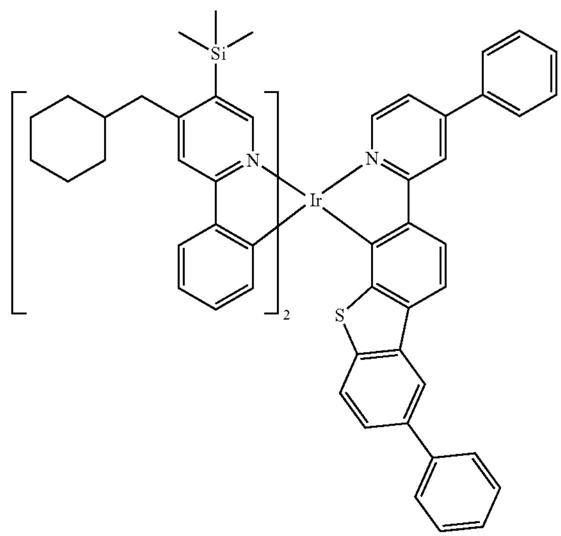
1252
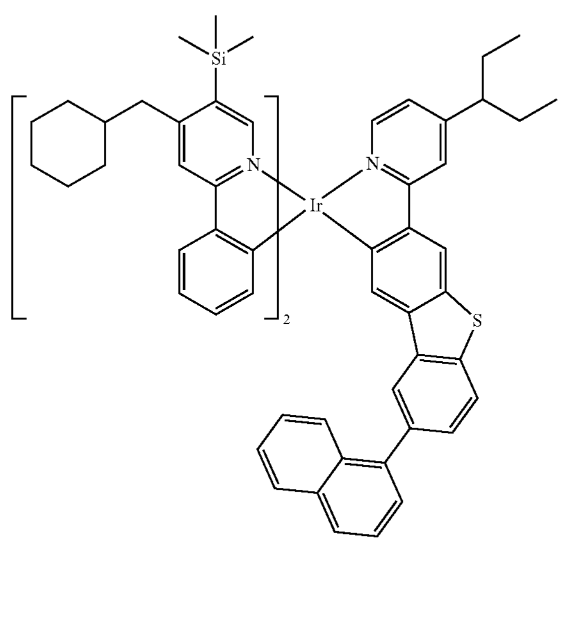

-continued
1253
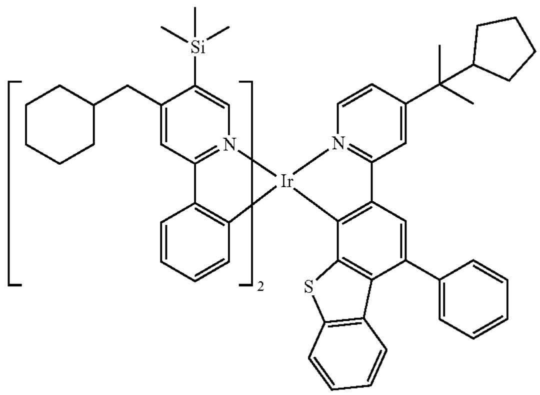
1254
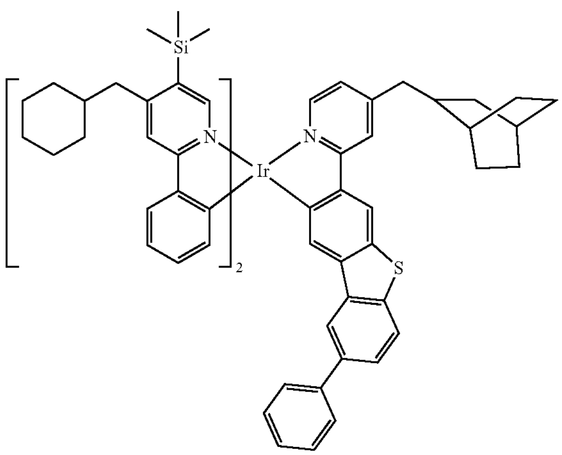
1255
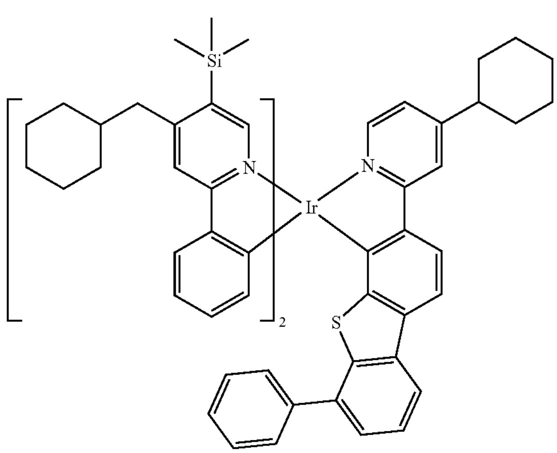
-continued
1256
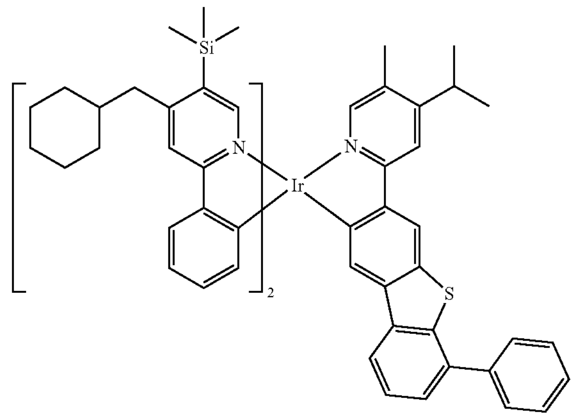
1257
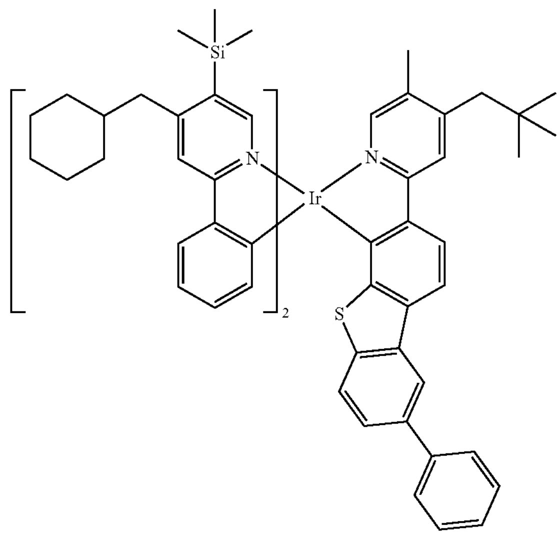
1258
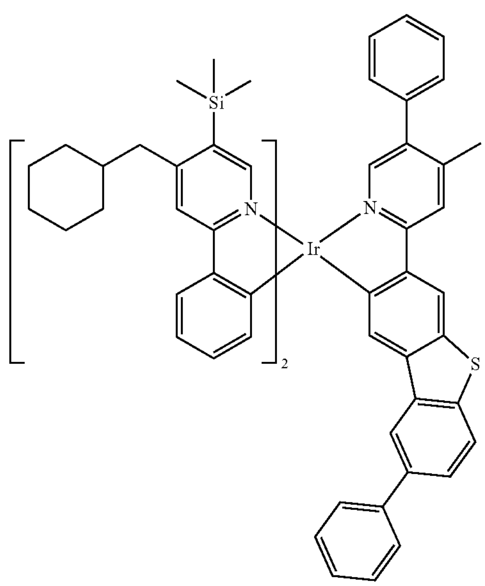

-continued
1259
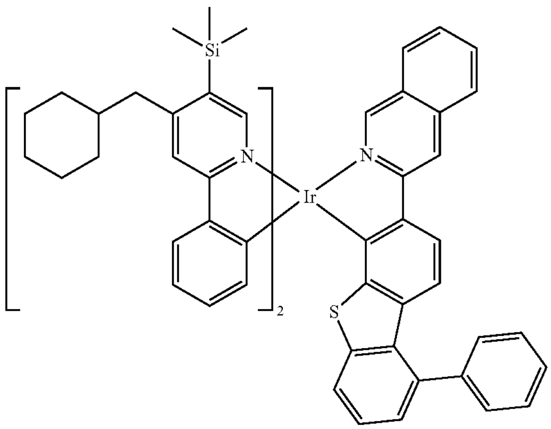
1260
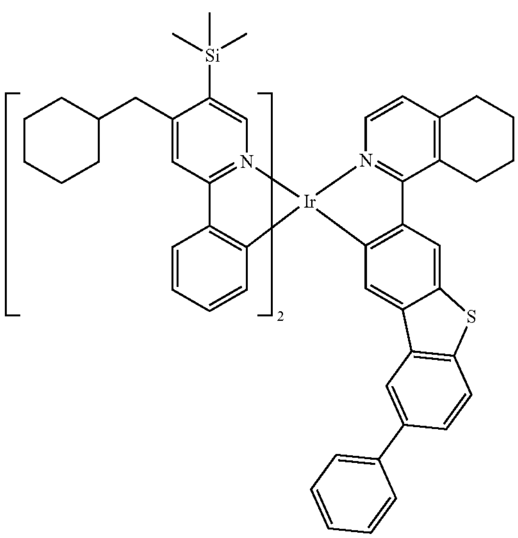
1261
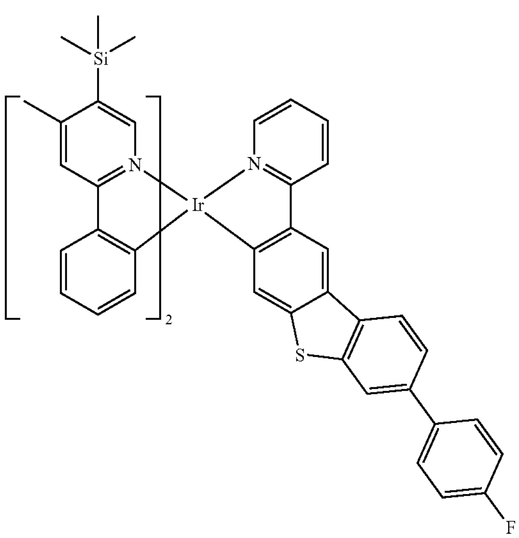
-continued
1262
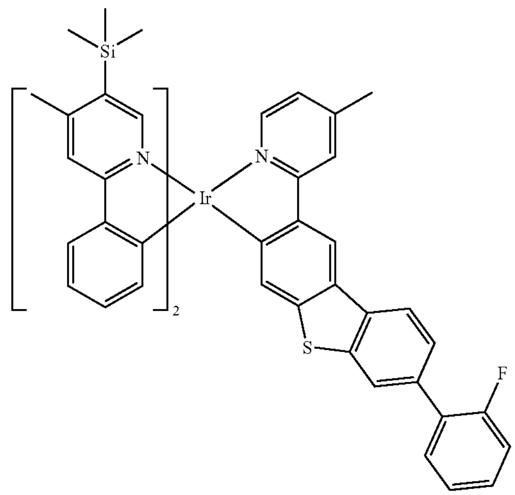
1263
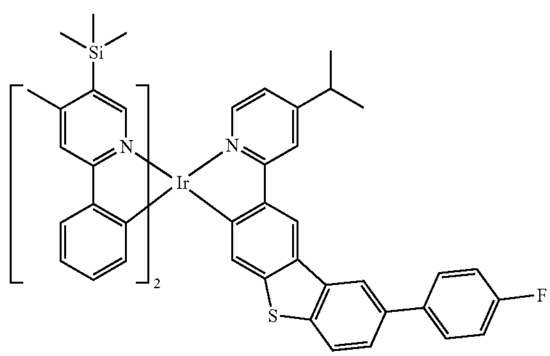
1264
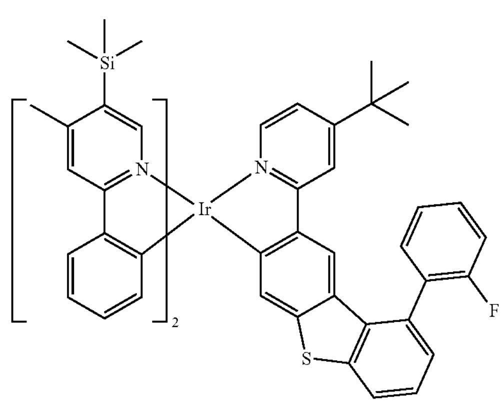

-continued
1265
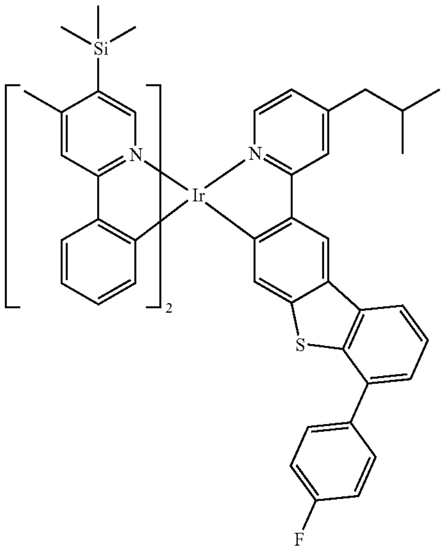
1266
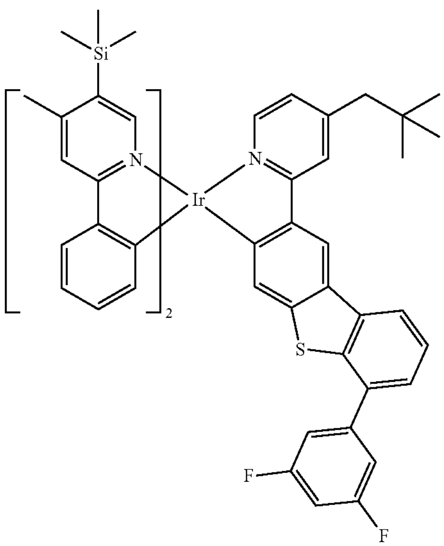
1267
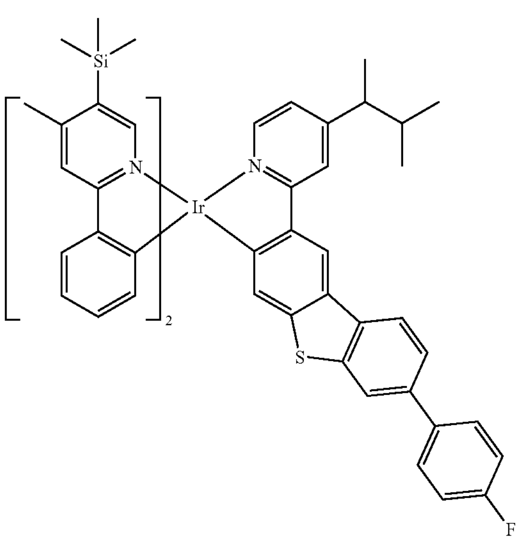
-continued
1268
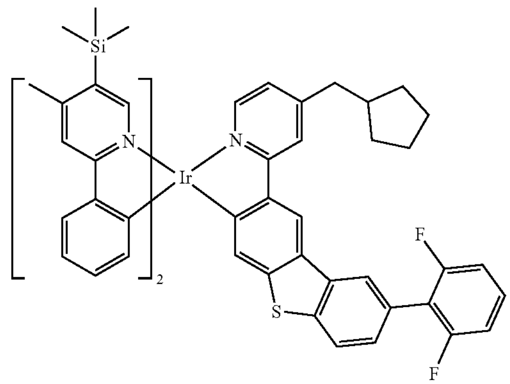
1269
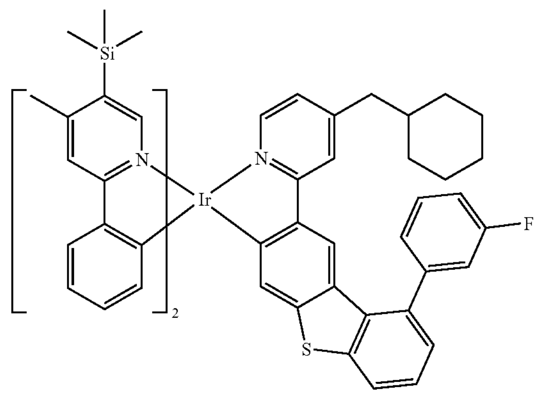
1270
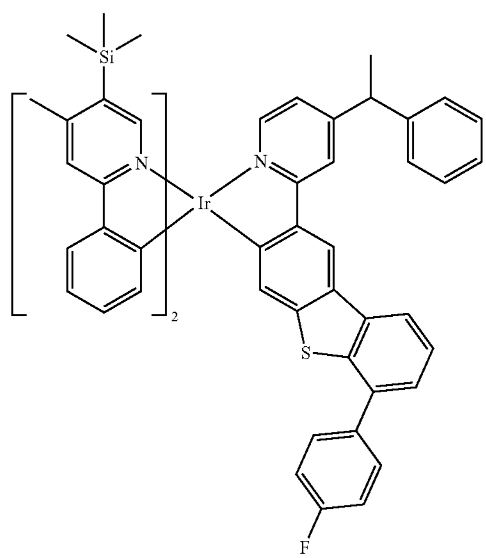

-continued
1271
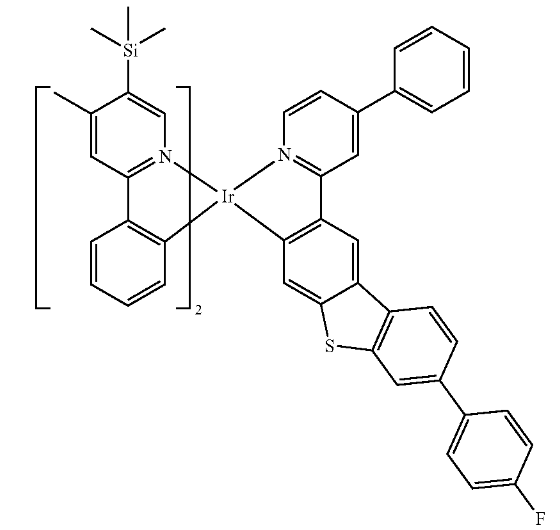
1272
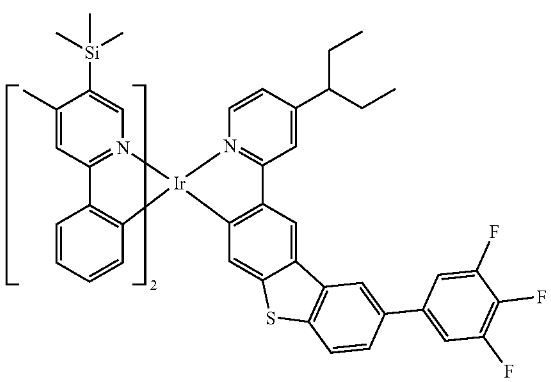
1273
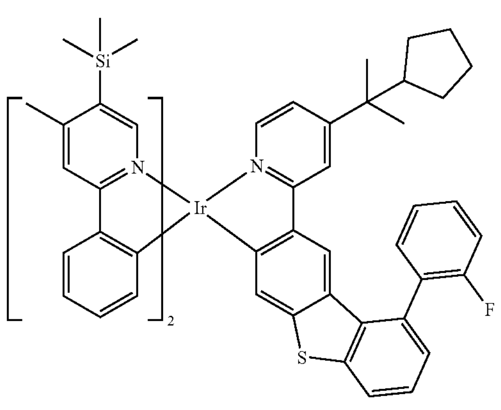
-continued
1274
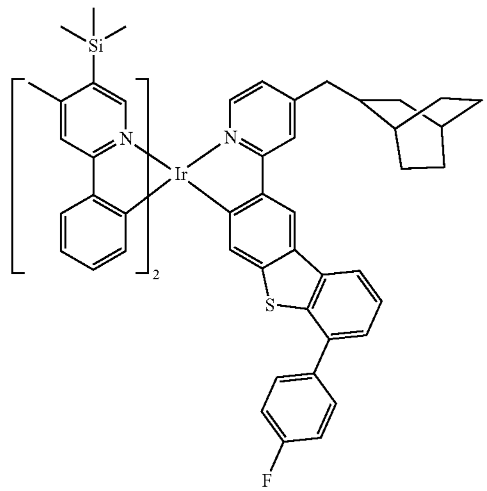
1275
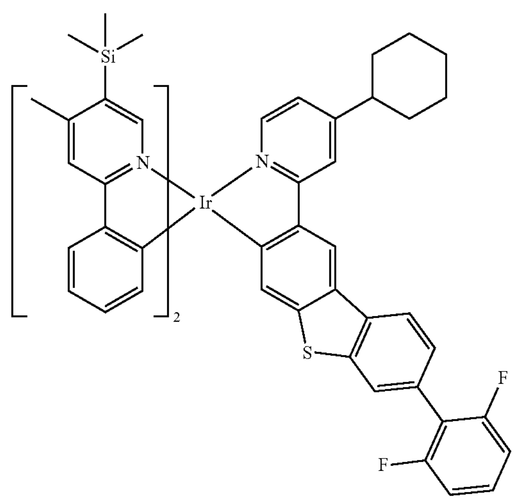
1276
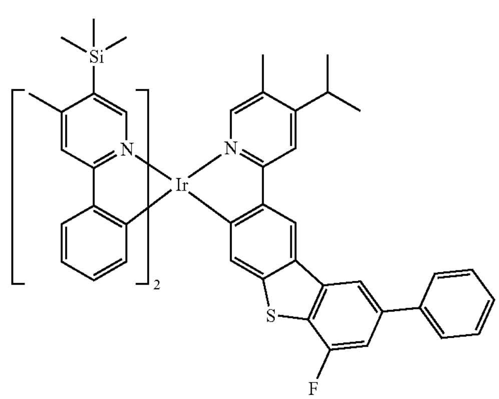

-continued
1277
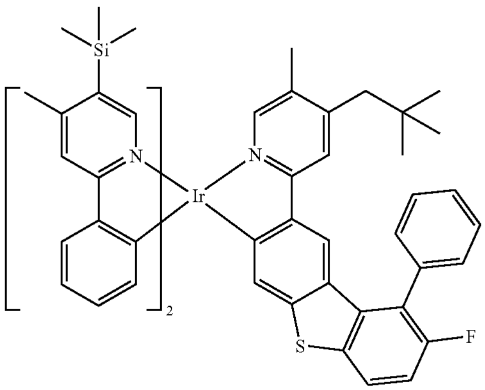
1278
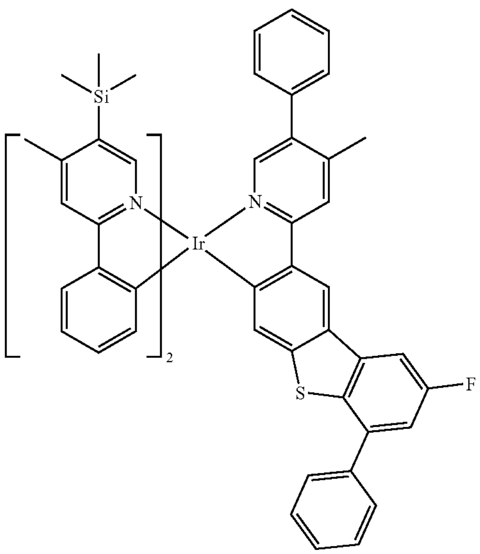
1279
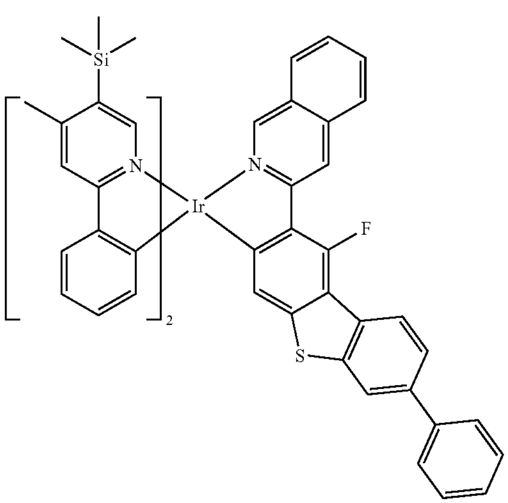
-continued
1280
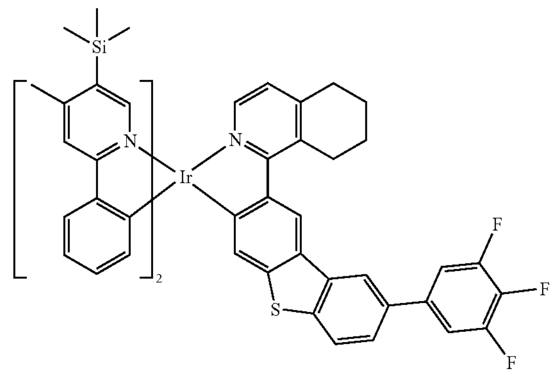
1281
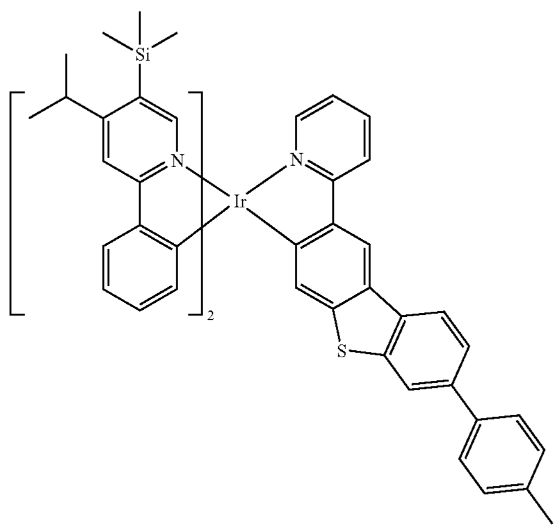
1282
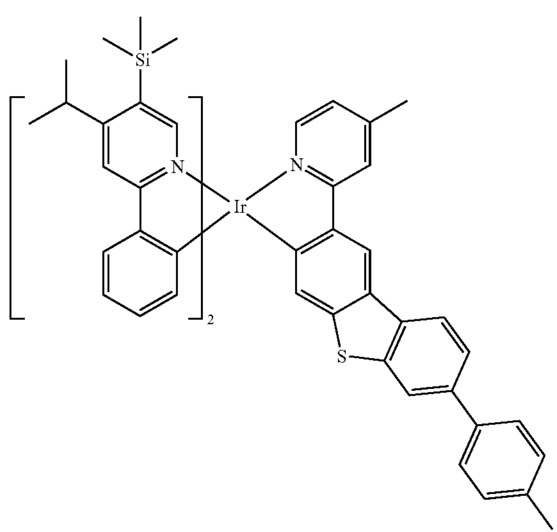

-continued
1283
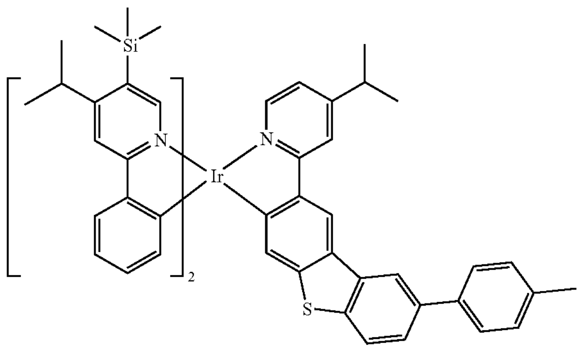
1284
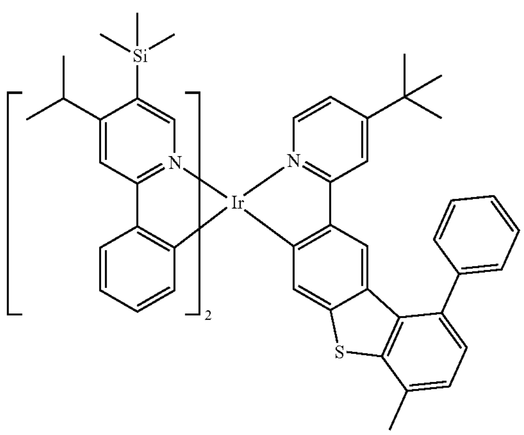
1285
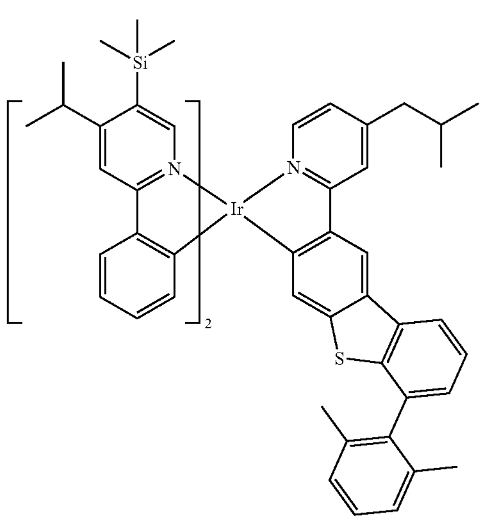
-continued
1286
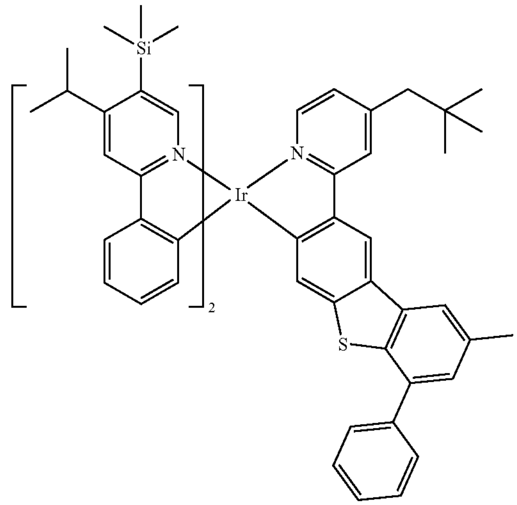
1287
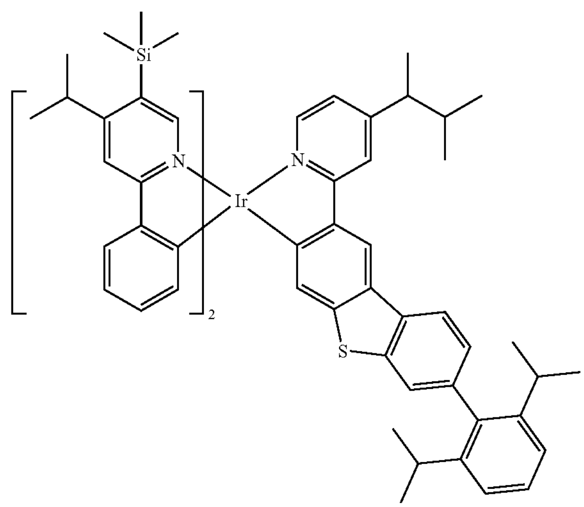
1288
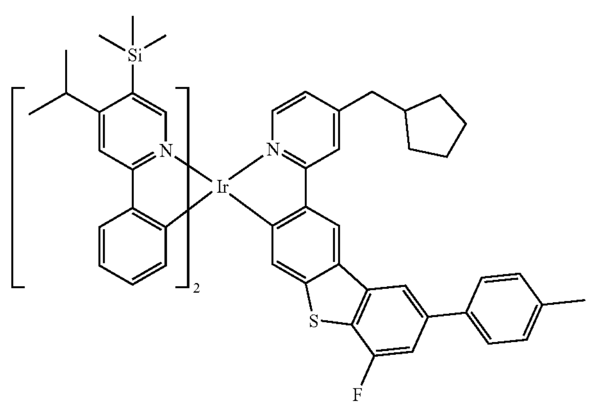

-continued
1289
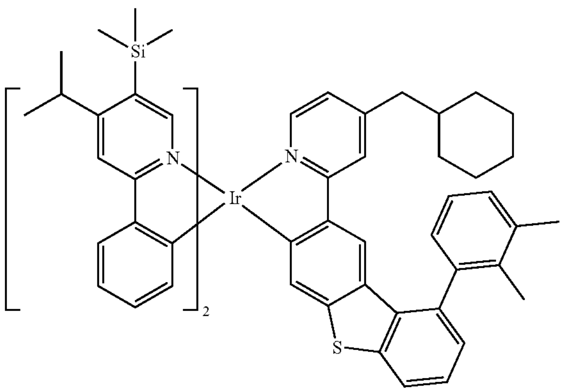
1290
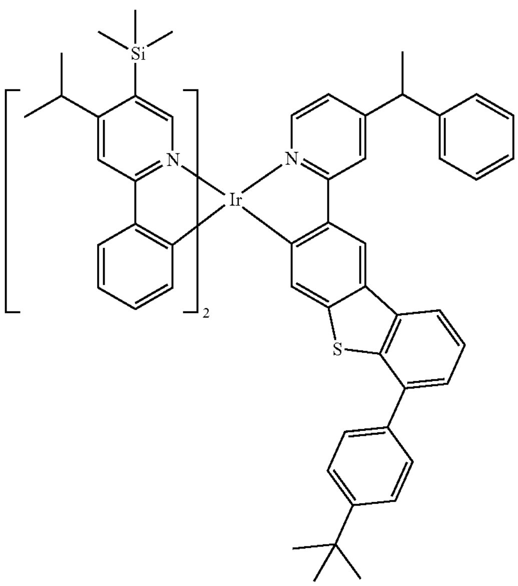
1291
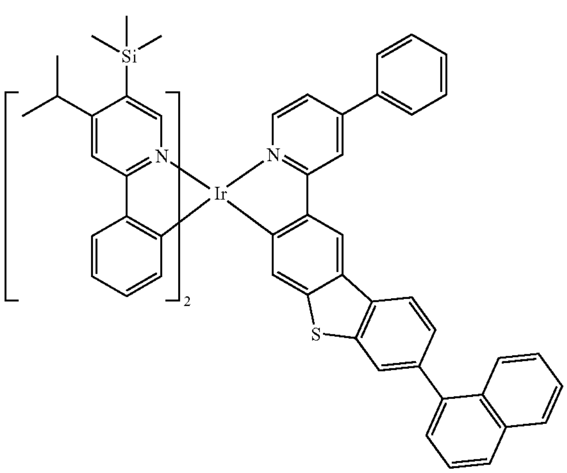
-continued
1292
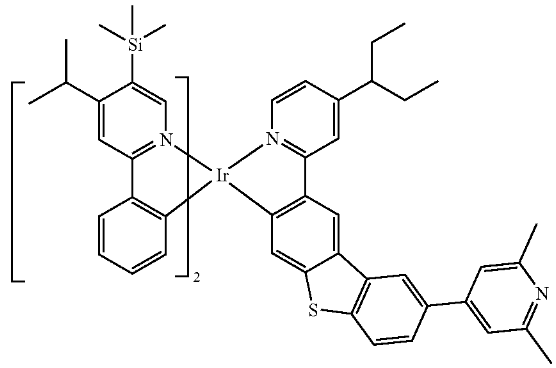
1293
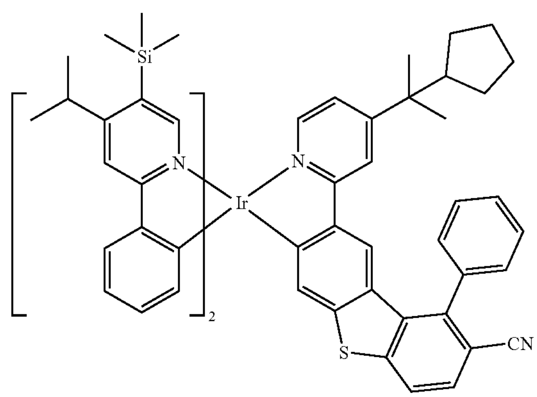
1294
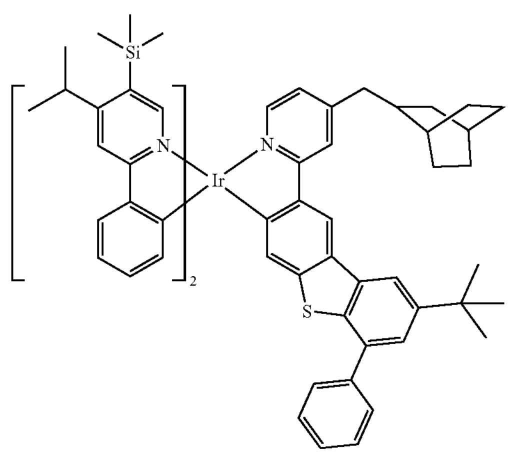

-continued
1295
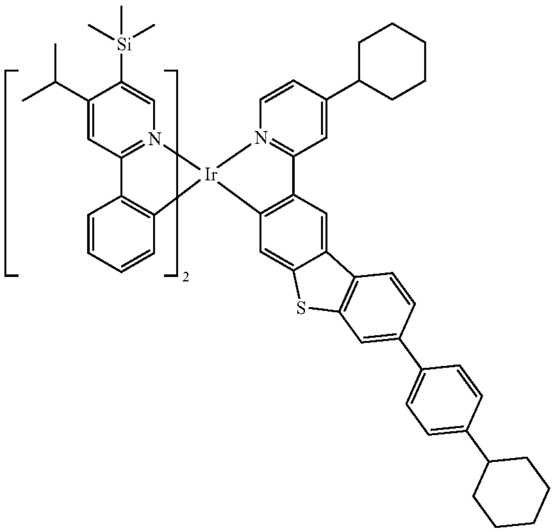
1296
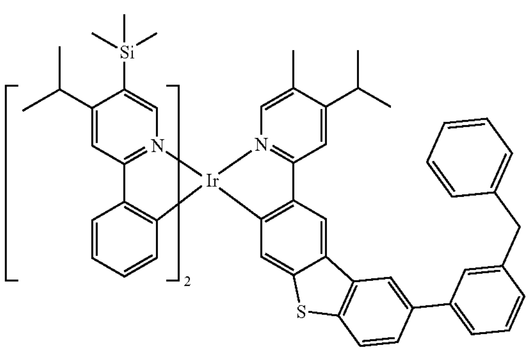
1297
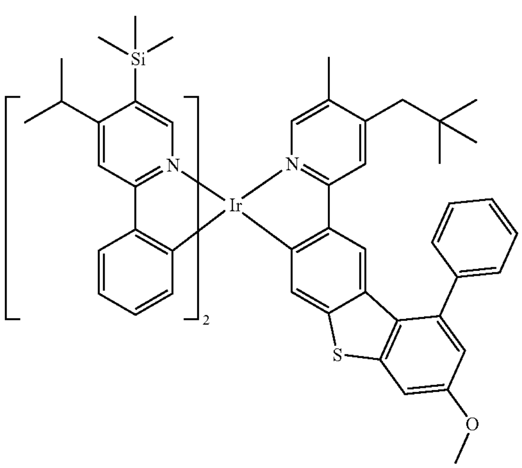
-continued
1298
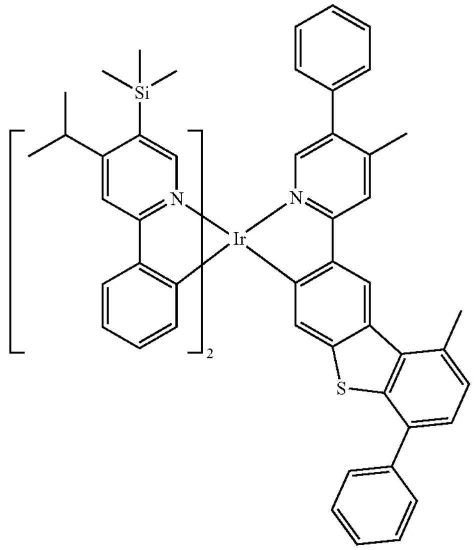
1299
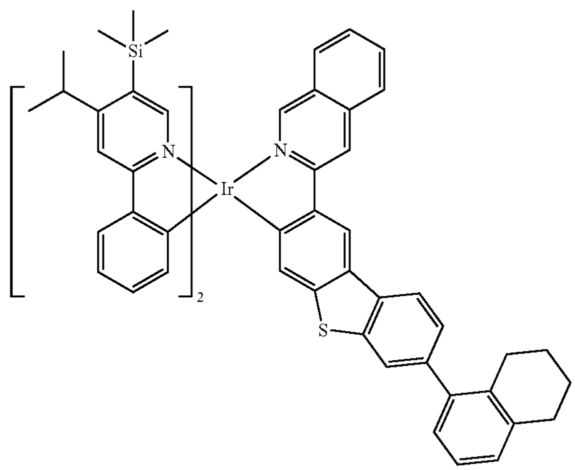
1300
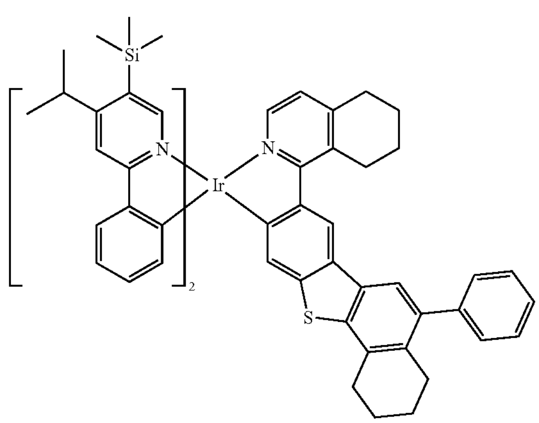

-continued
1301
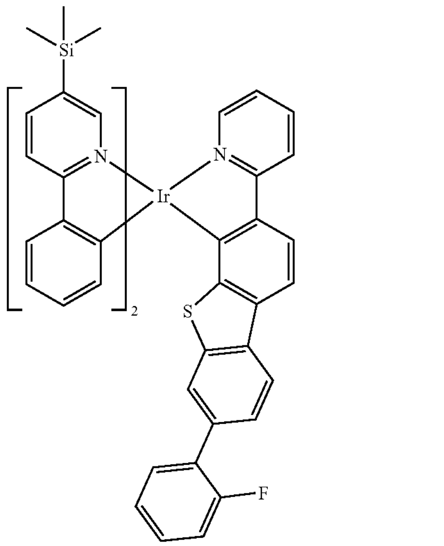
1302
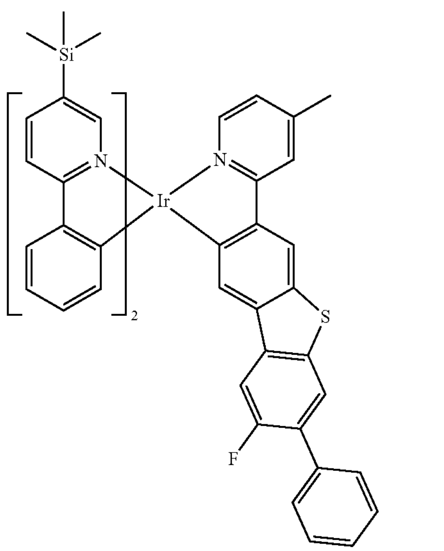
1303
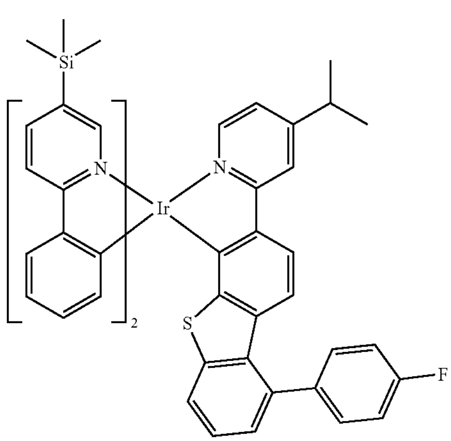
-continued
1304
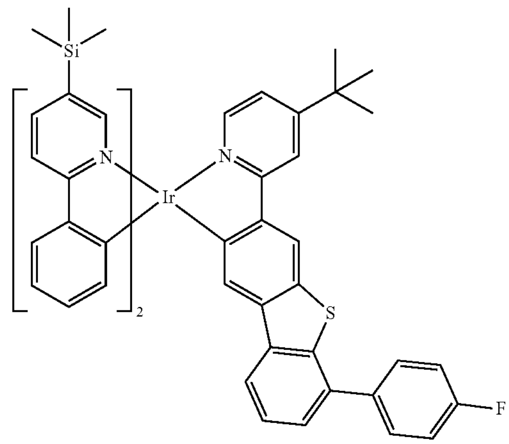
1305
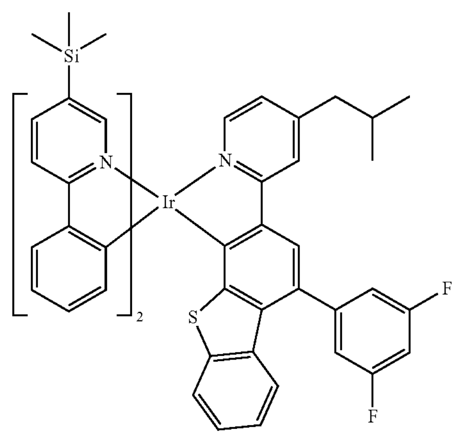
1306
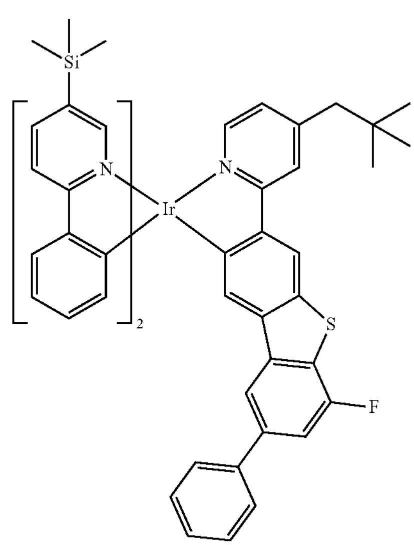

-continued
1307
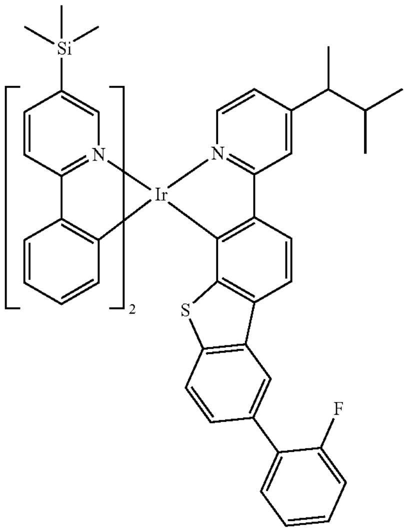
1308
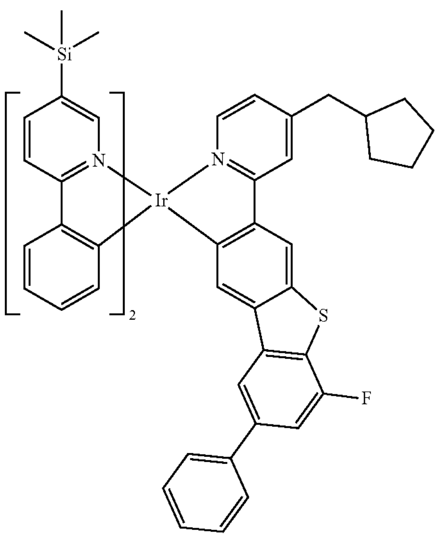
1309
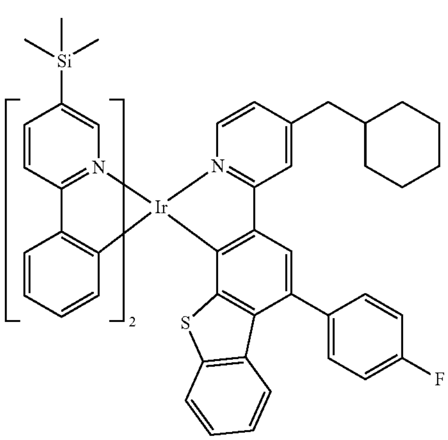
-continued
1310
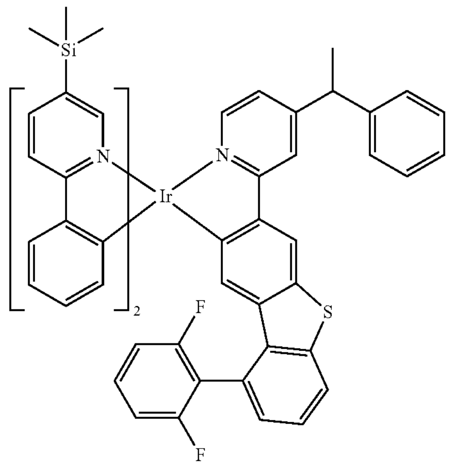
1311
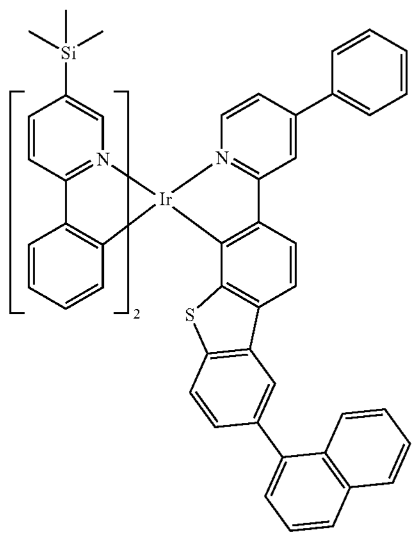
1312
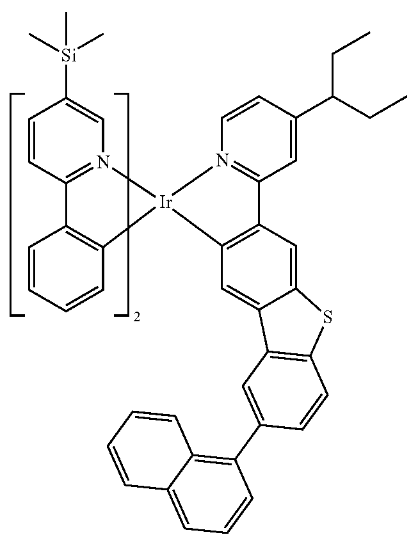

-continued
1313
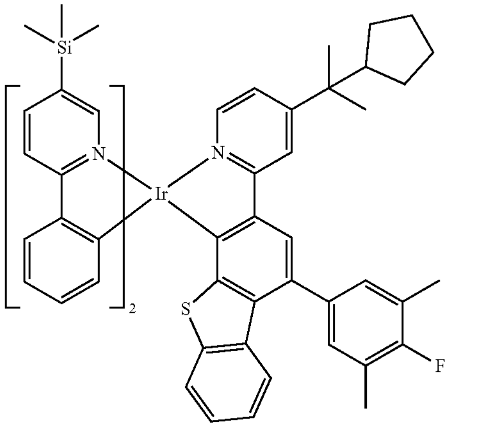
1314
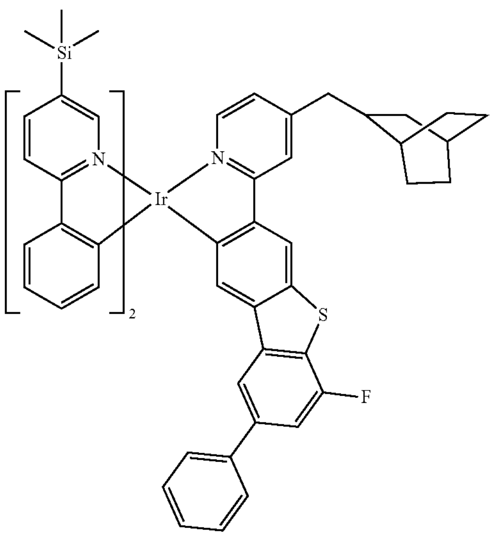
1315
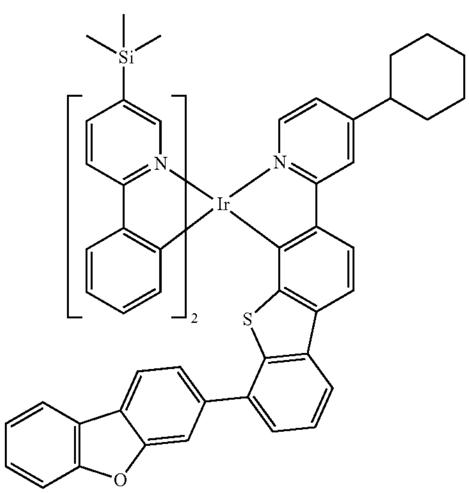
-continued
1316
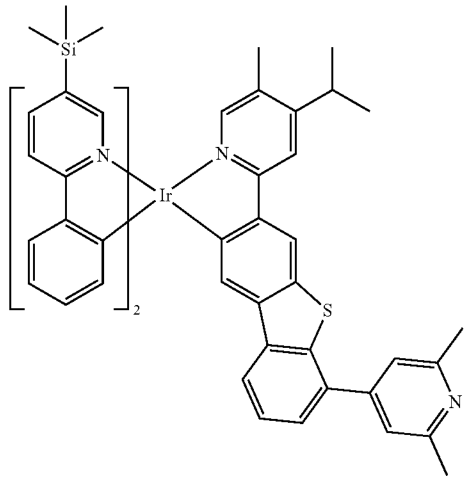
1317
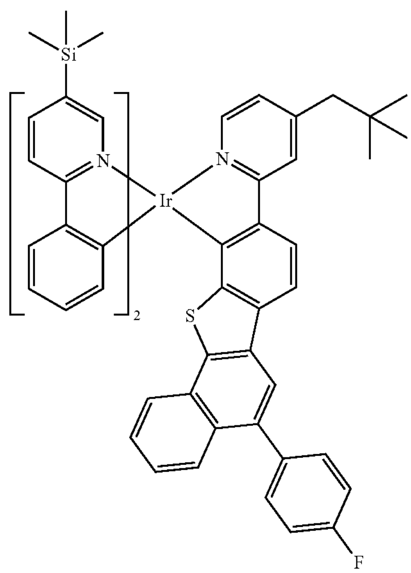
1318
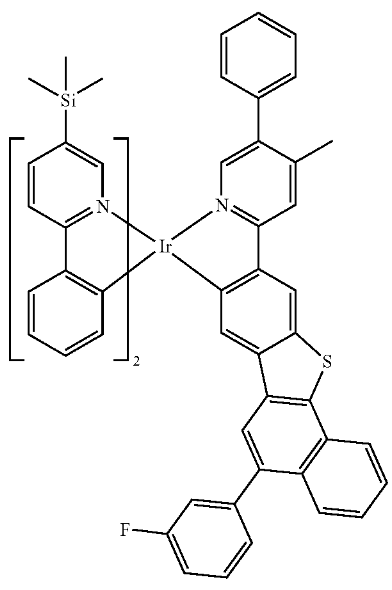

1319
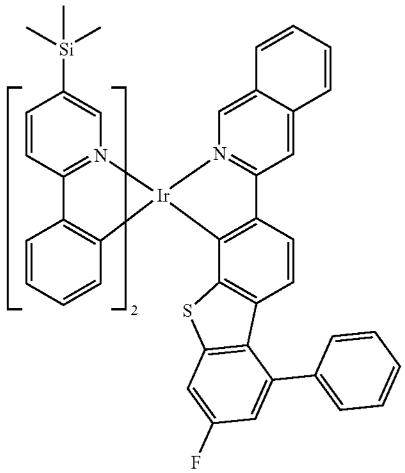
1320
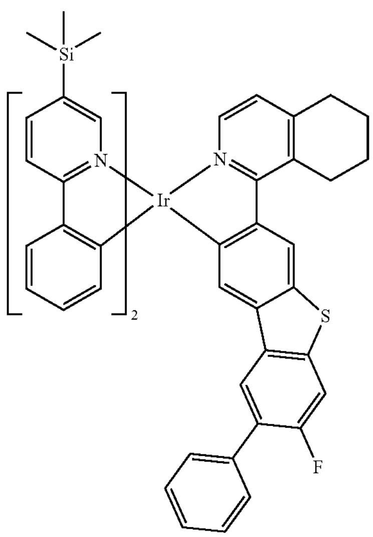
1321
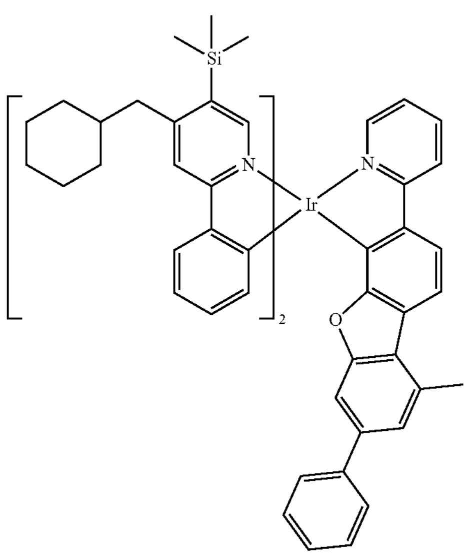
1322
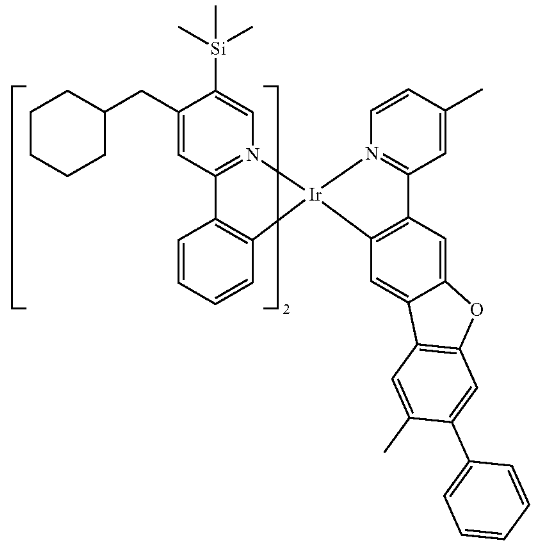
1323
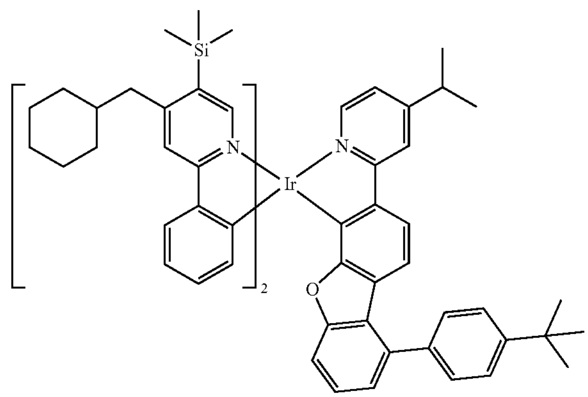
1324
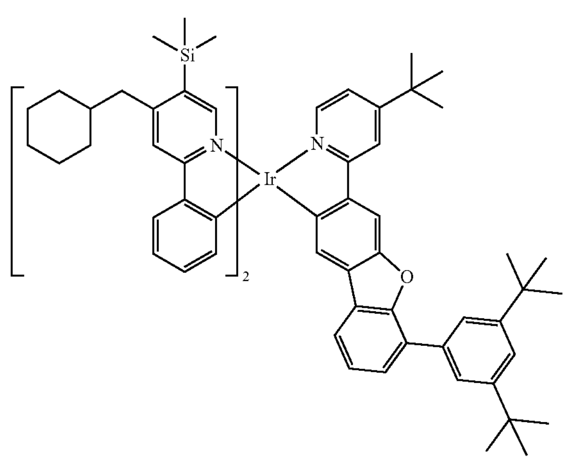

-continued
1325
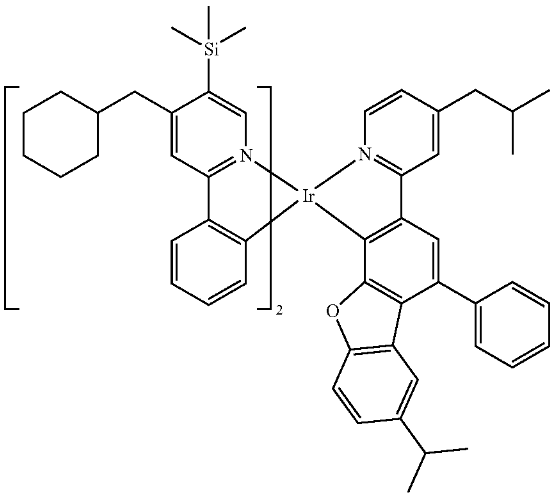
1326
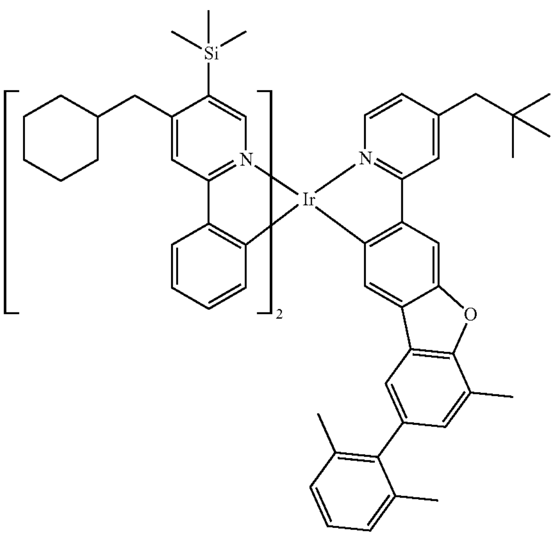
1327
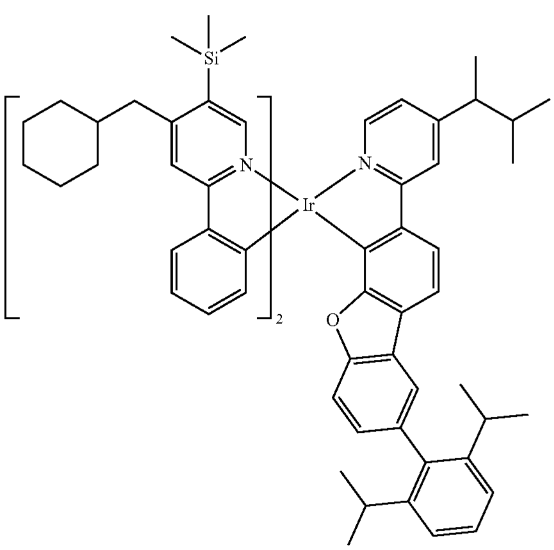
-continued
1328
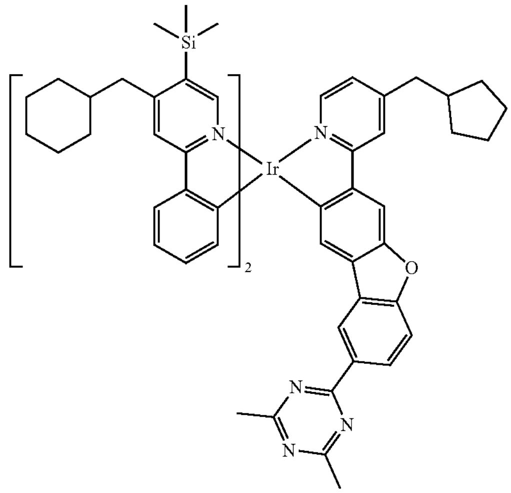
1329
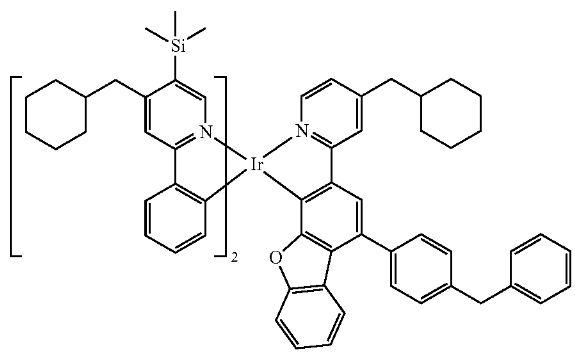
1330
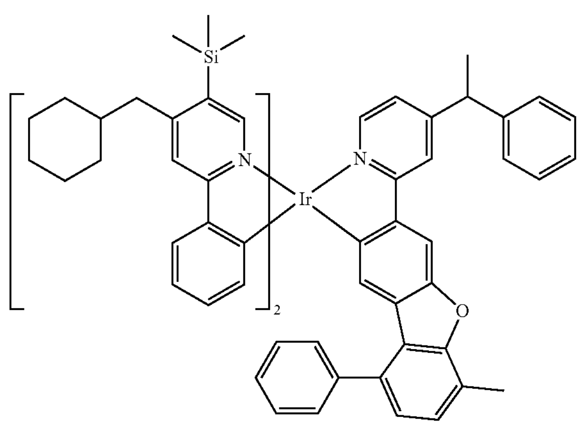

-continued
1331
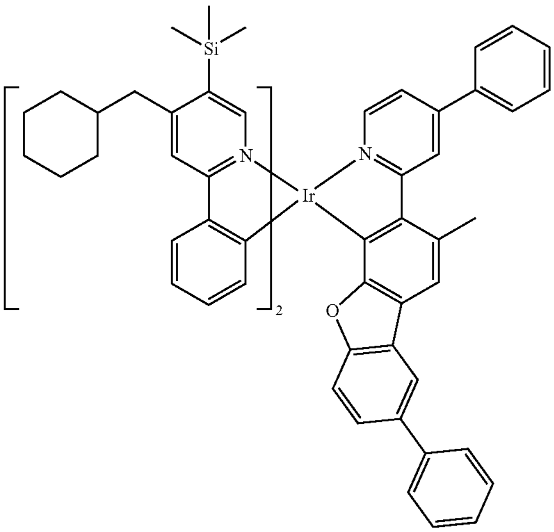
1332
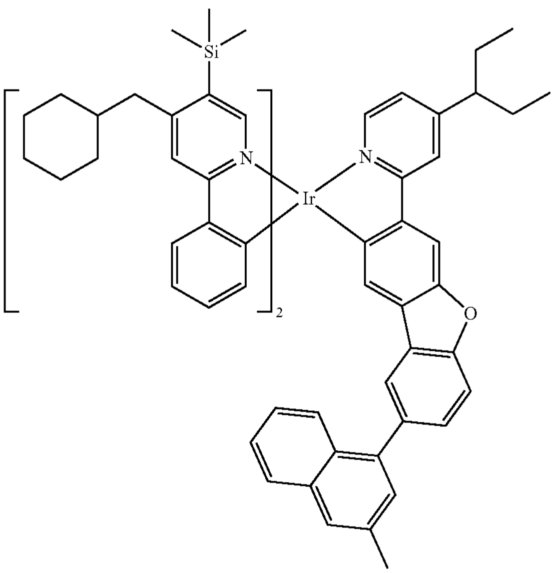
1333
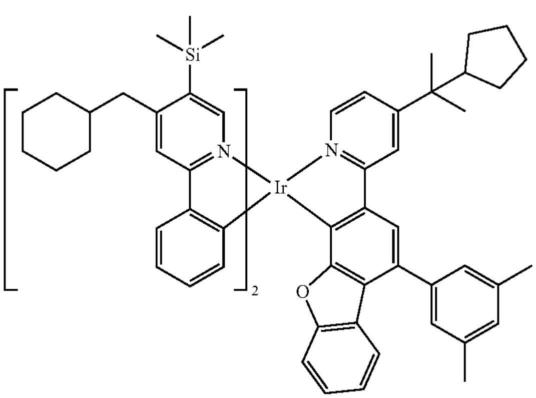
-continued
1334
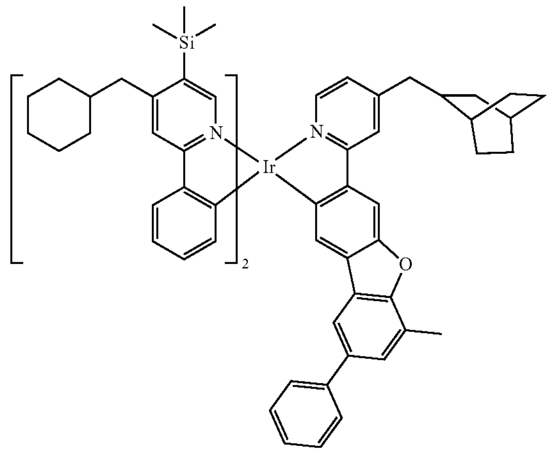
1335
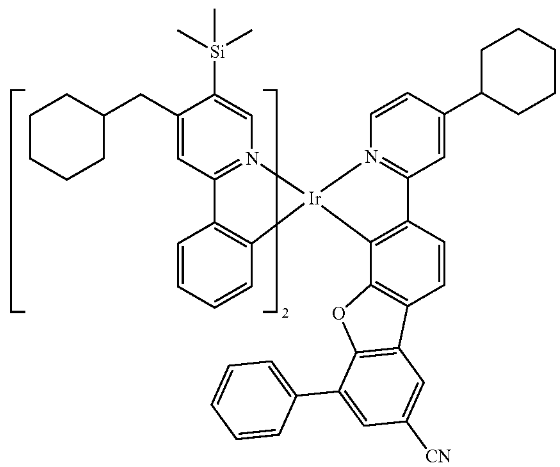
1336
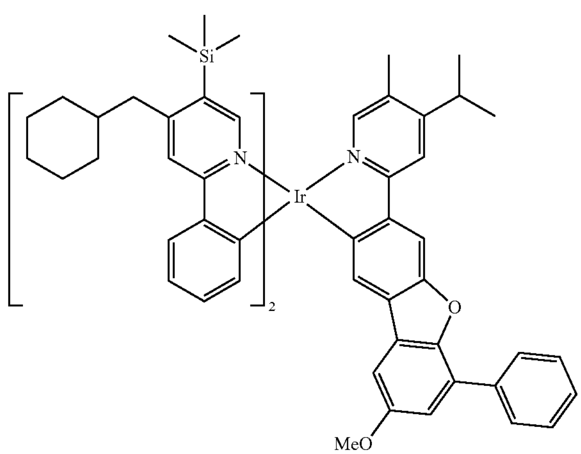

-continued
1337
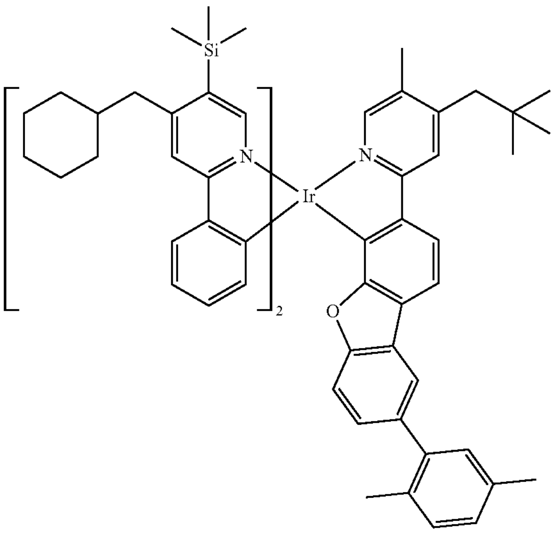
1338
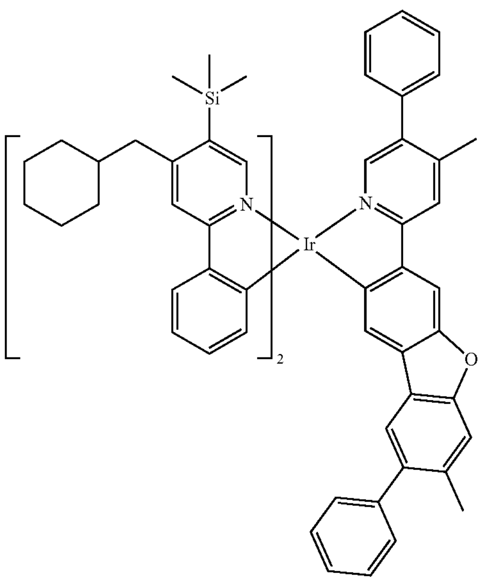
1339
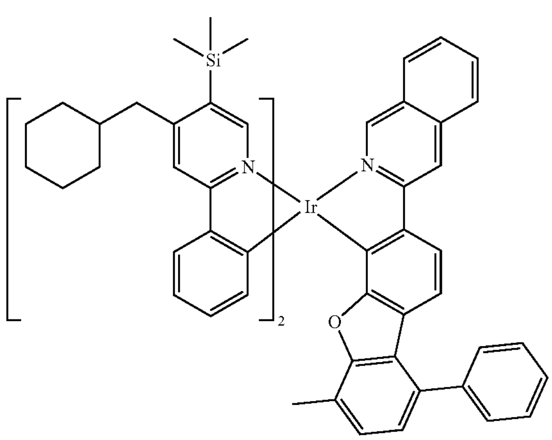
-continued
1340
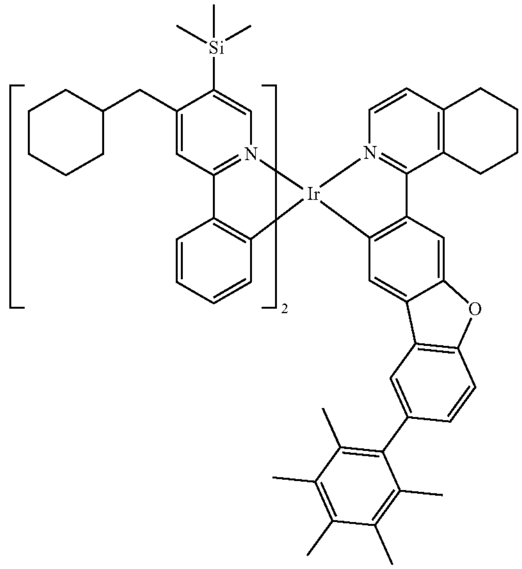
1341
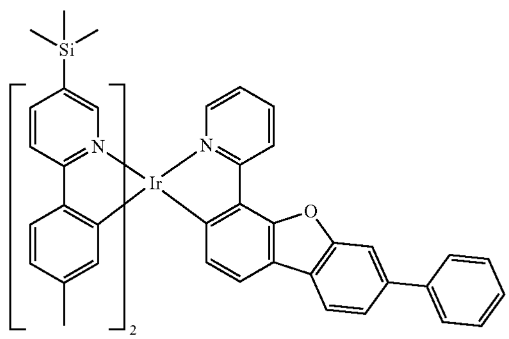
1342
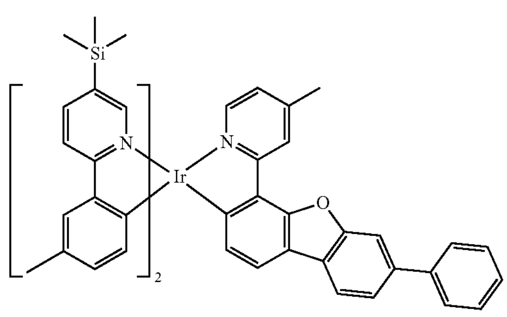
1343
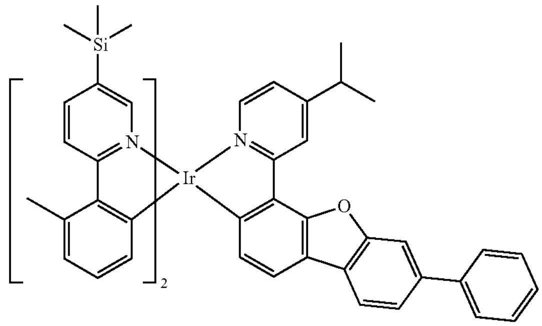

1344
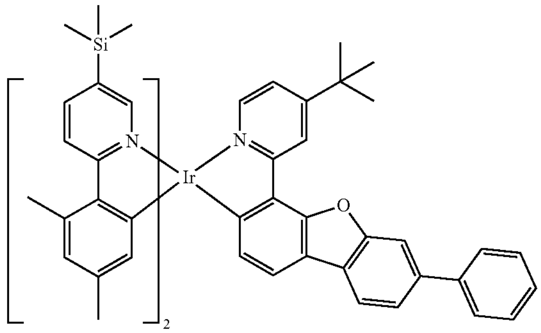
1345
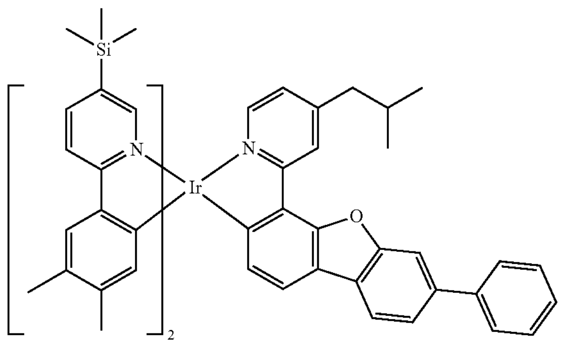
1346
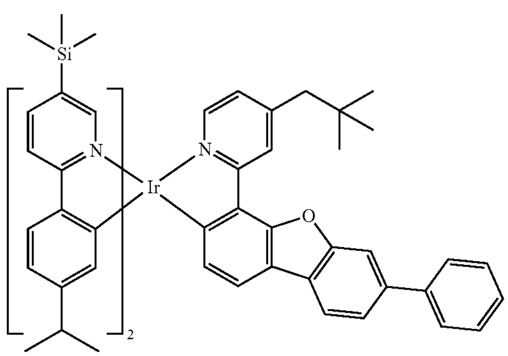
1347
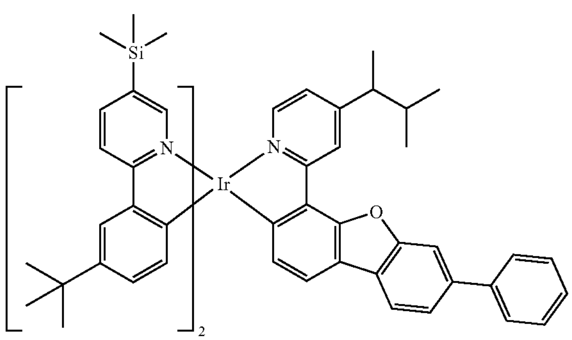
1348
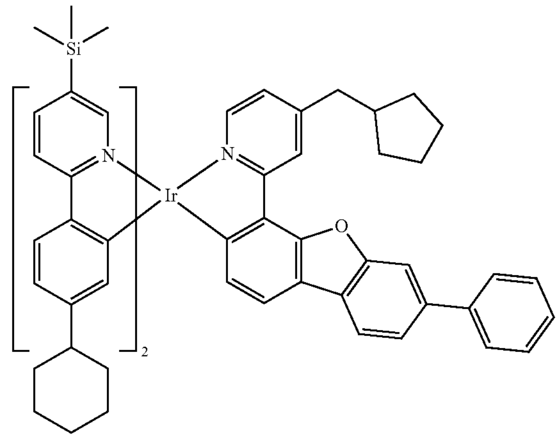
1349
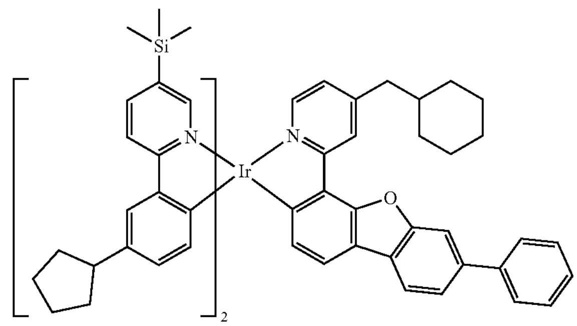
1350
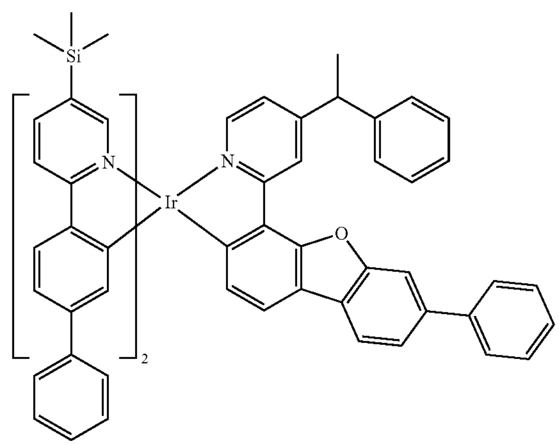
1351
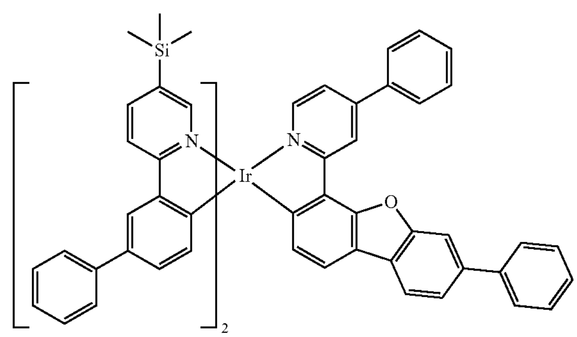

-continued
1352
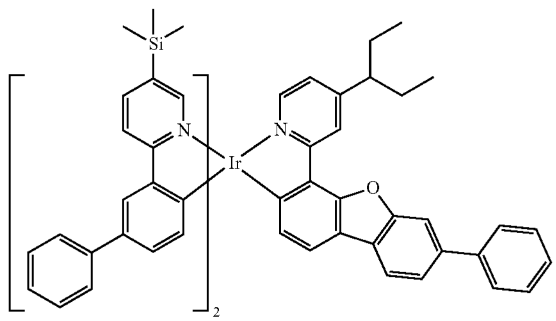
1353
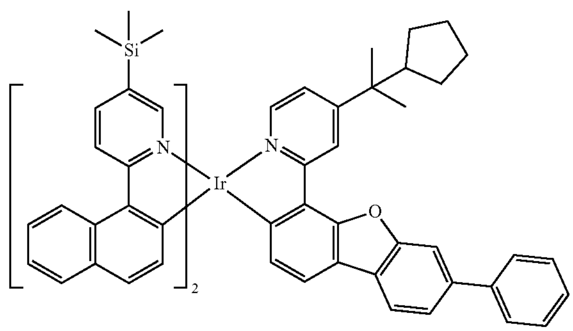
1354
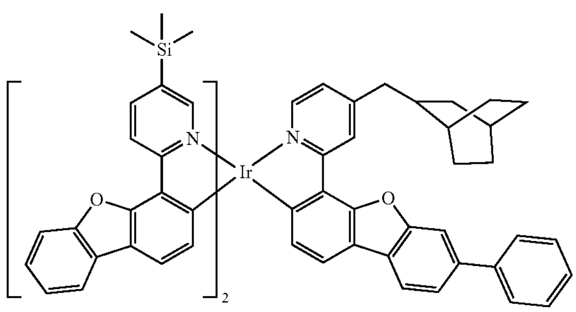
1355
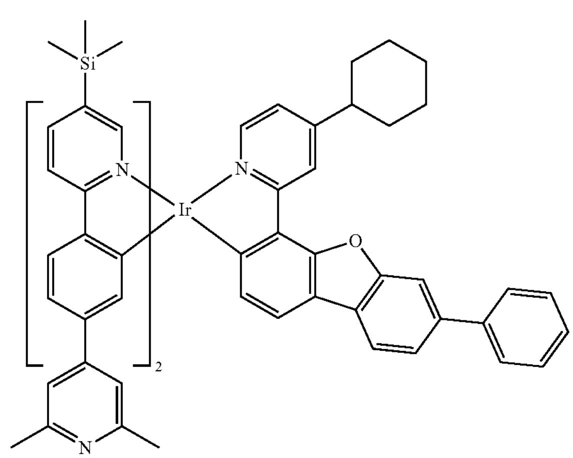
-continued
1356
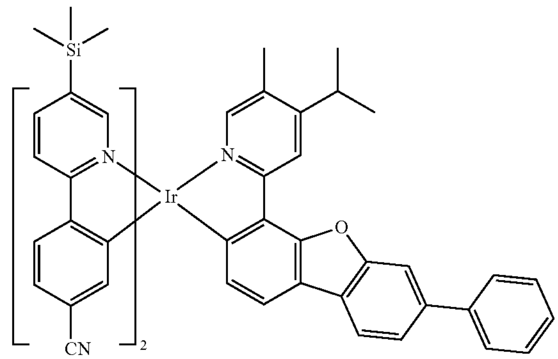
1357
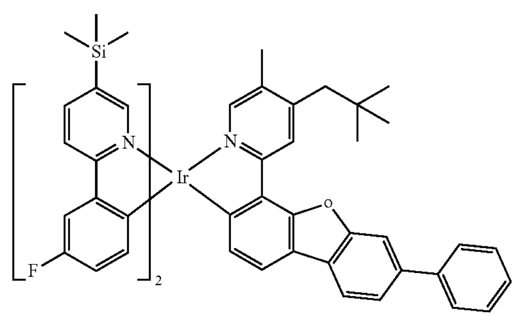
1358
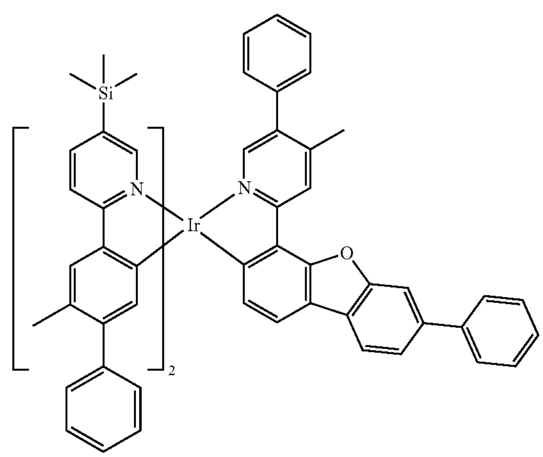
1359
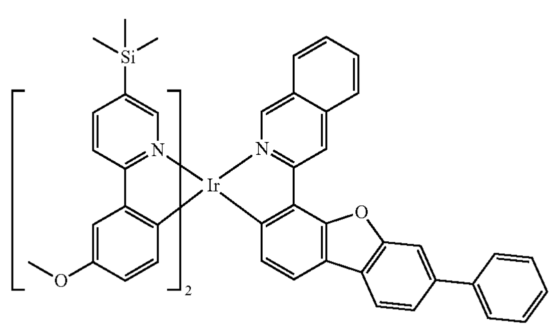

1360
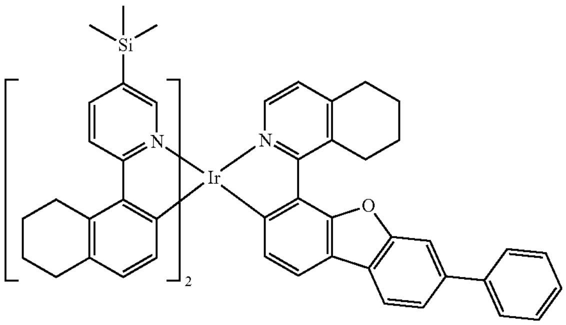
1361
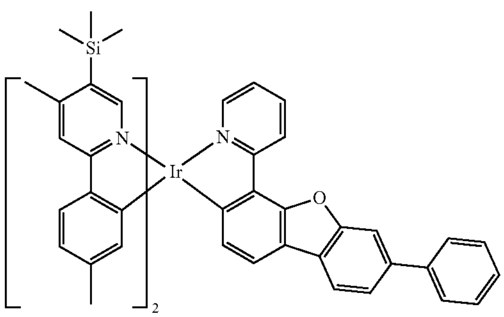
1362
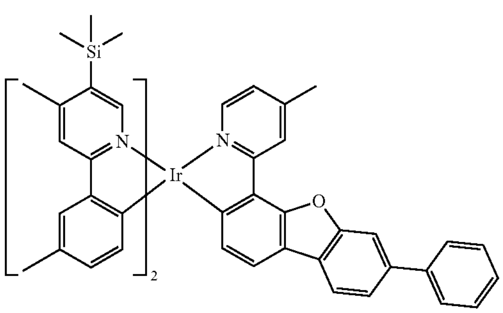
1363
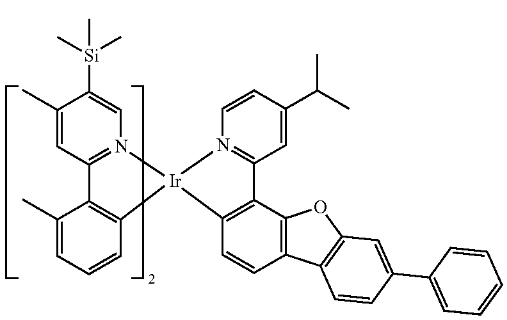
1364
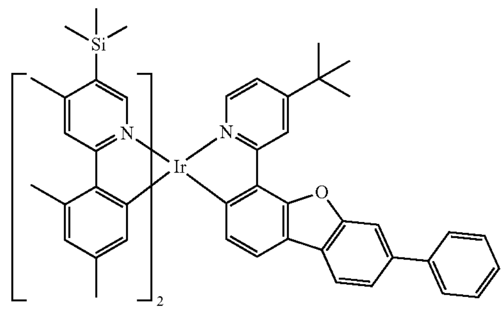
1365
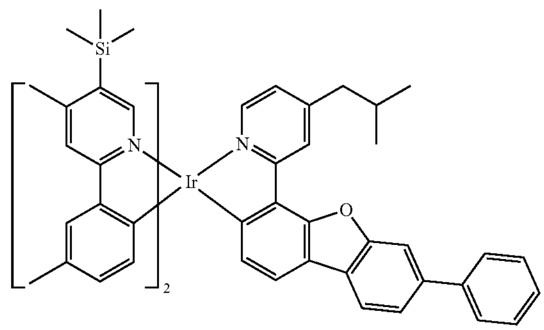
1366
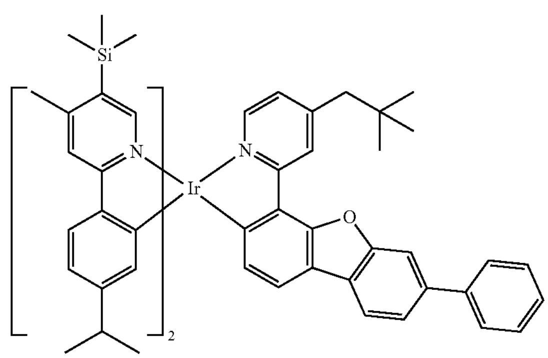
1367
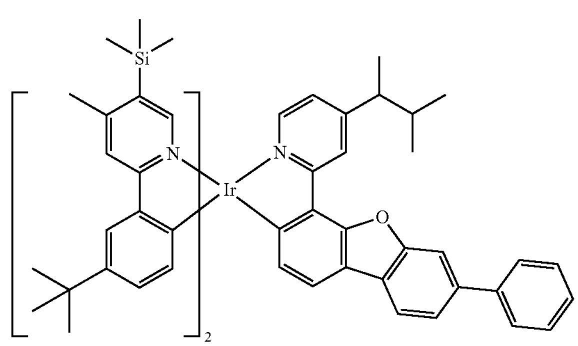

-continued
1368
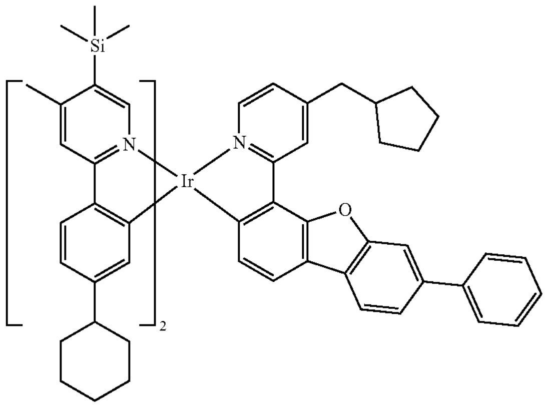
1369
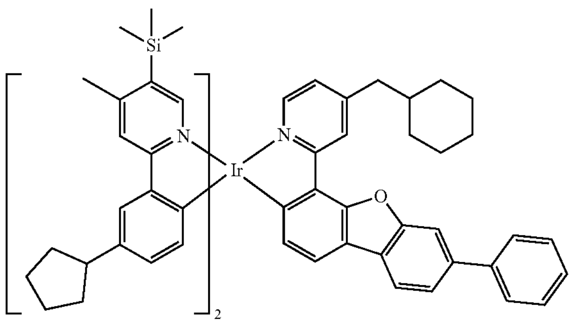
1370
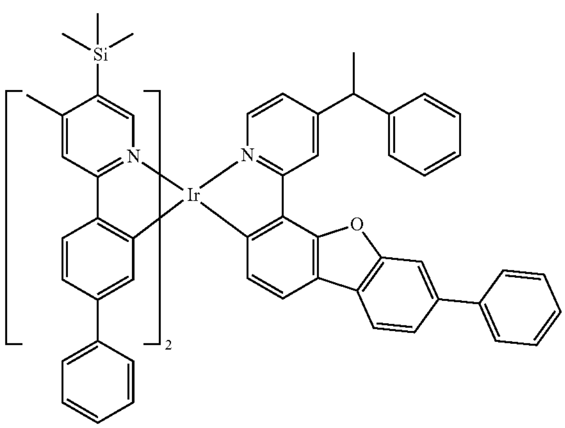
1371
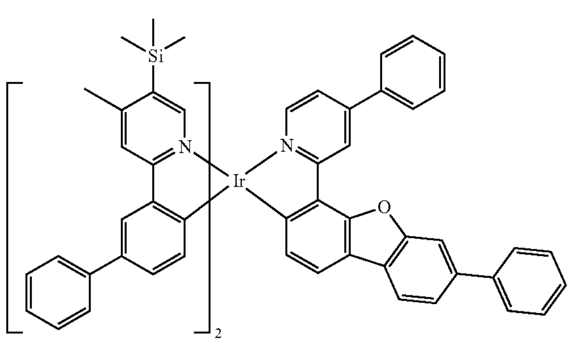
-continued
1372
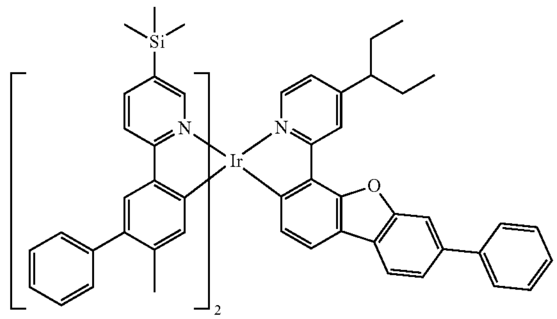
1373
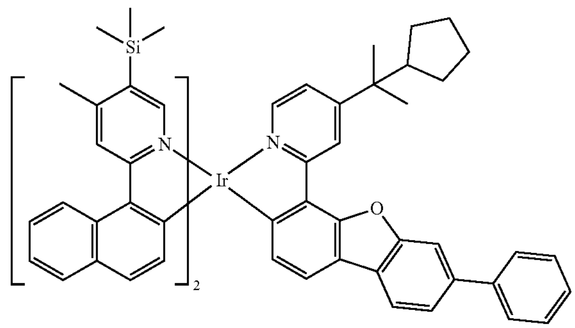
1374
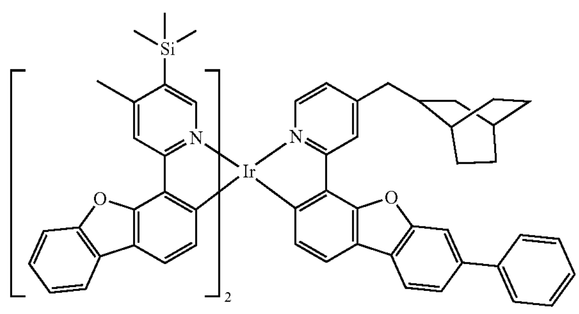
1375
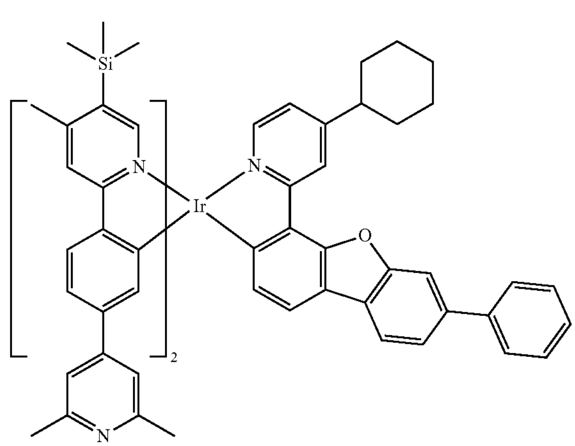

-continued
1376
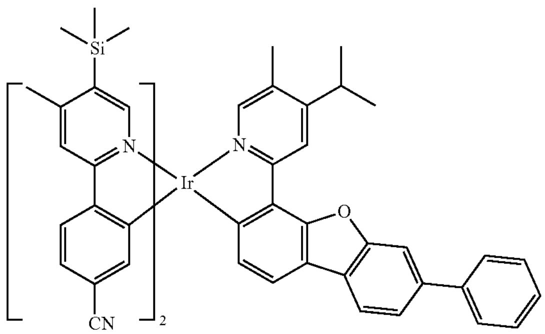
1377
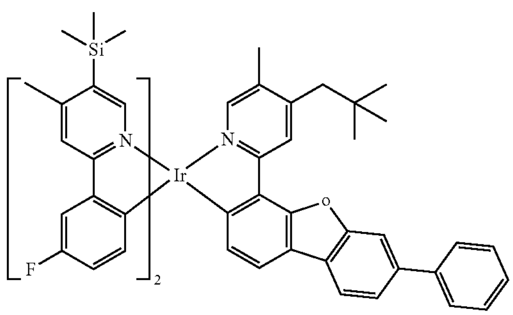
1378
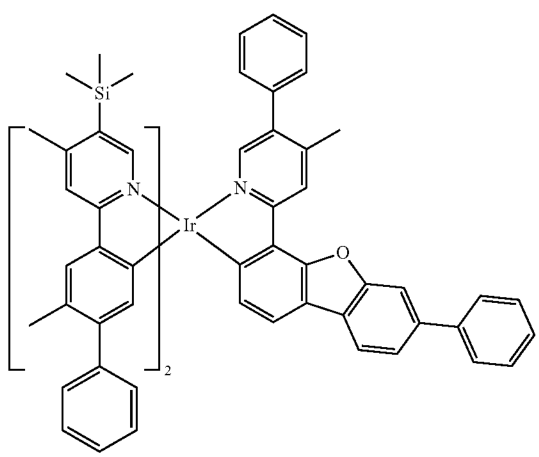
1379
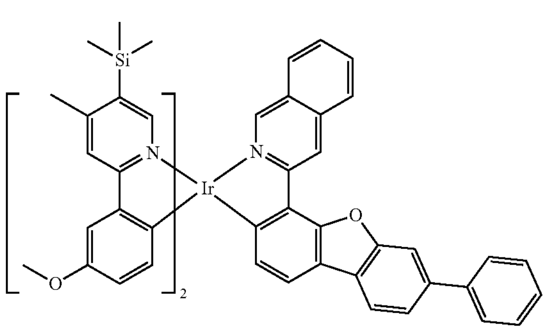
-continued
1380
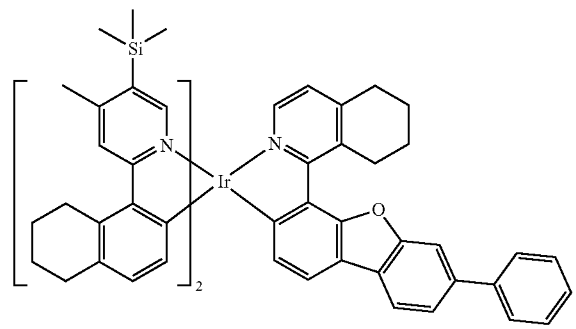
1381
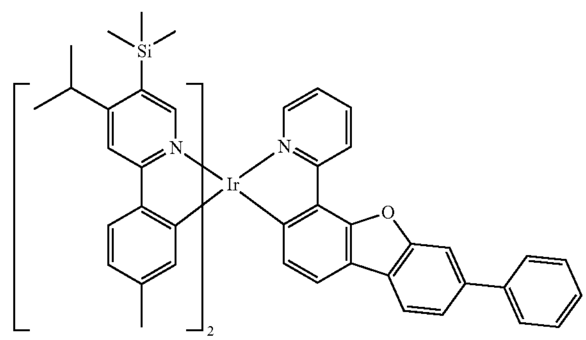
1382
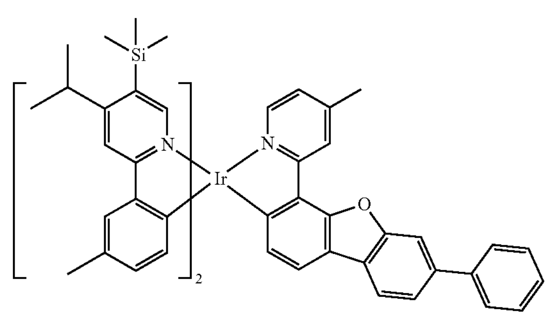
1383
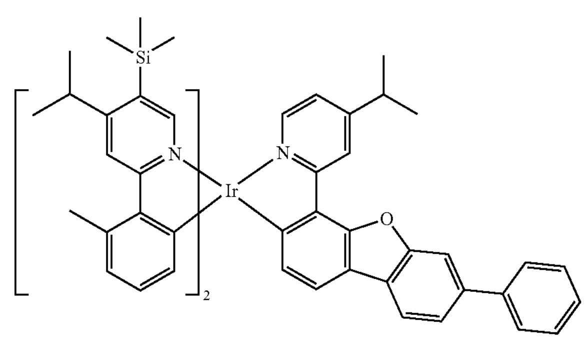

-continued
1384
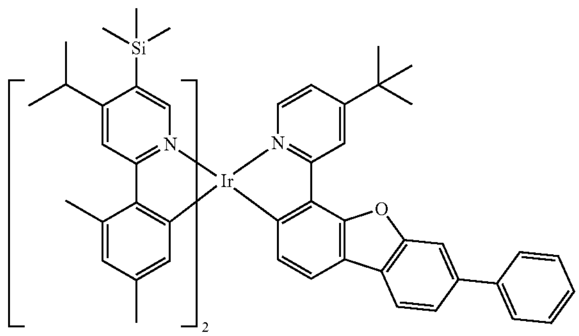
1385
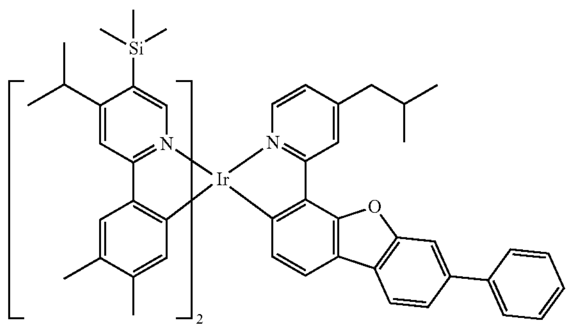
1386
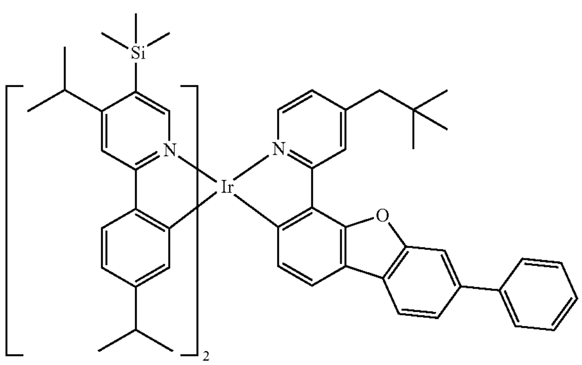
1387
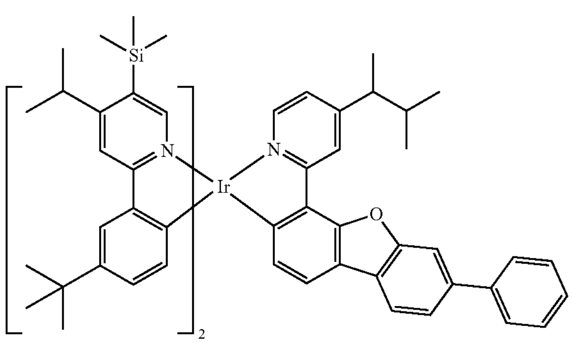
-continued
1388
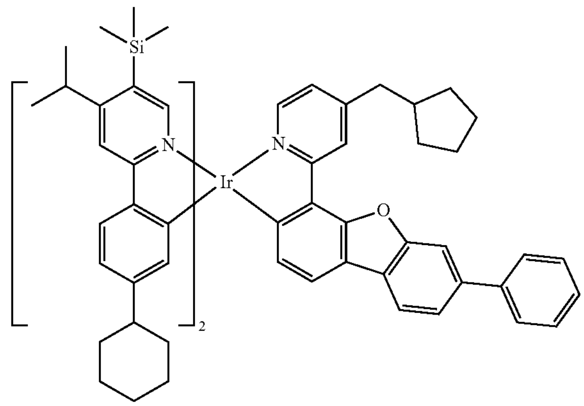
1389
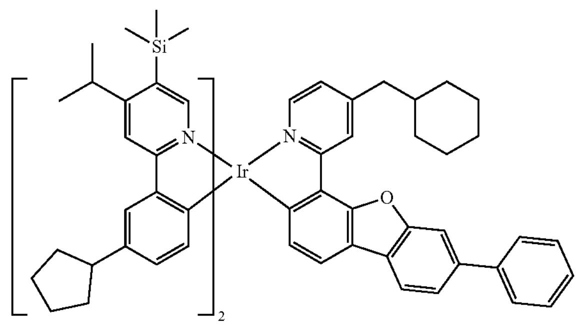
1390
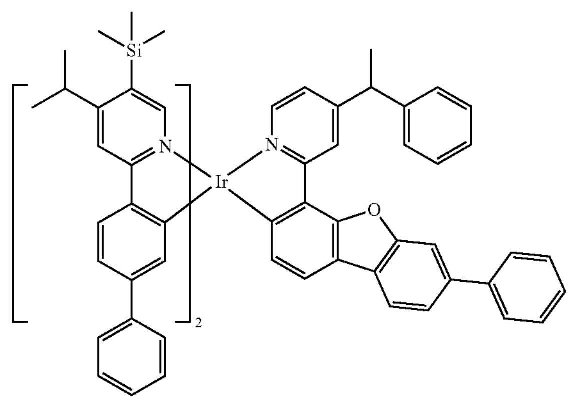
1391
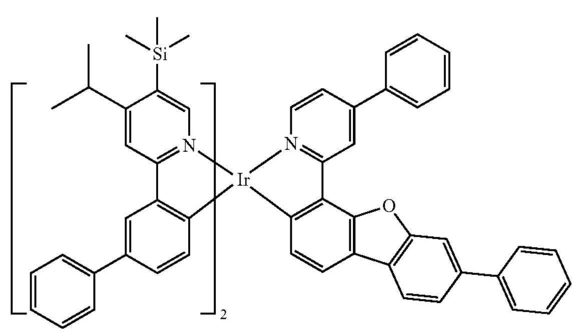

-continued
1392
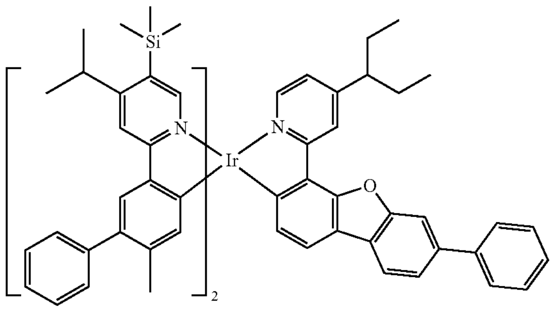
1393
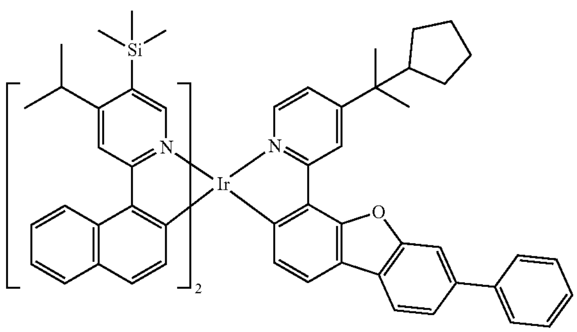
1394
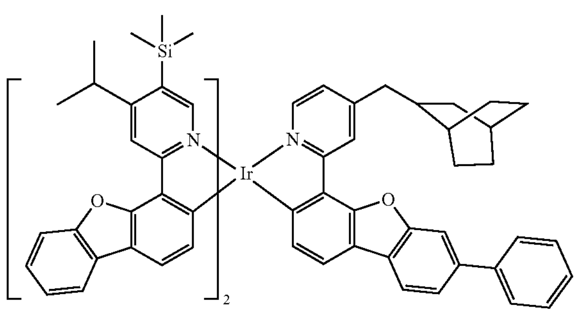
1395
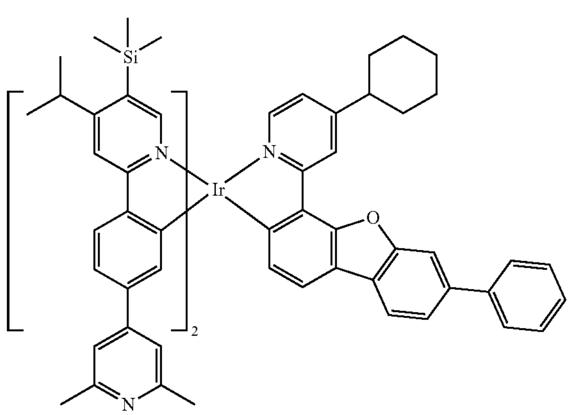
-continued
1396
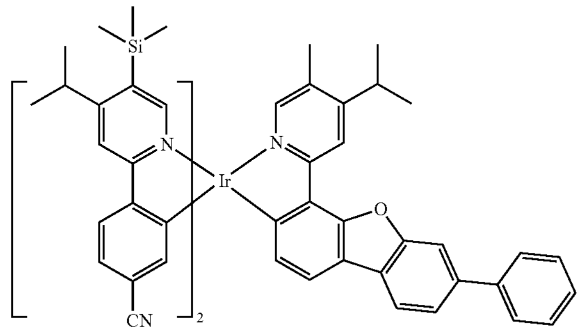
1397
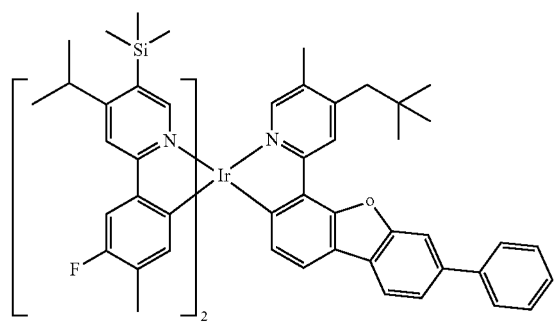
1398
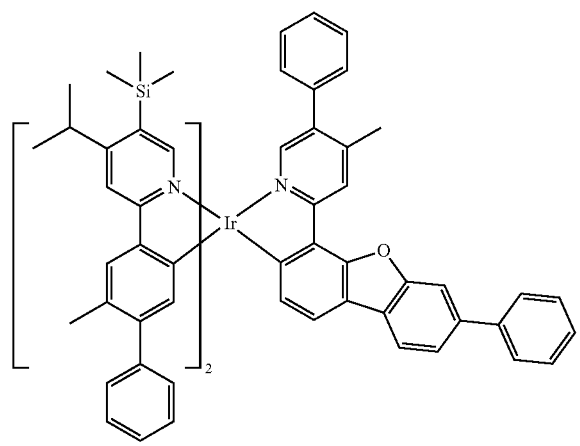
1399
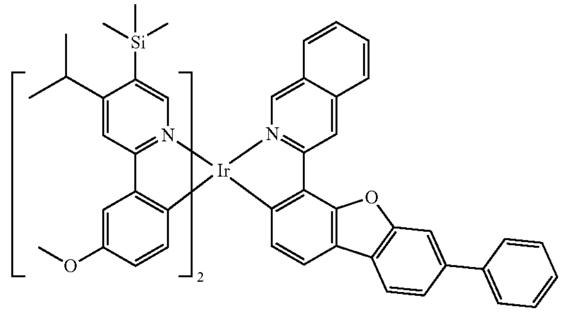

1400
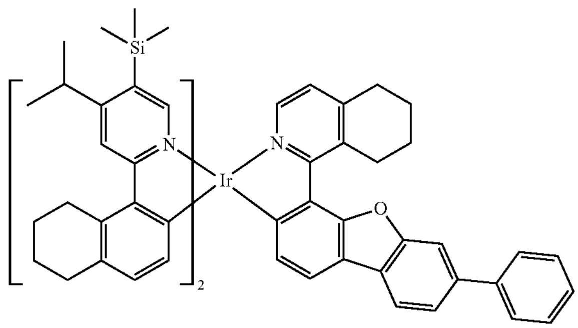
1401
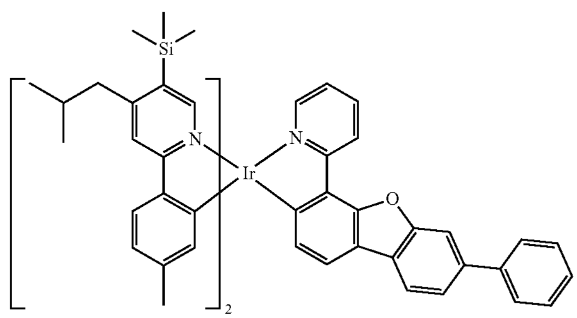
1402
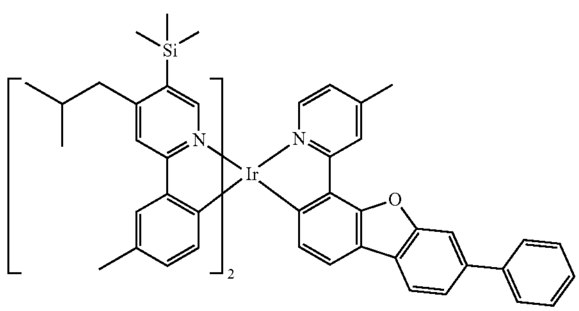
1403
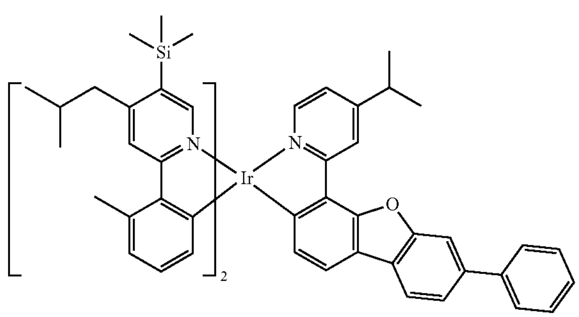
1404
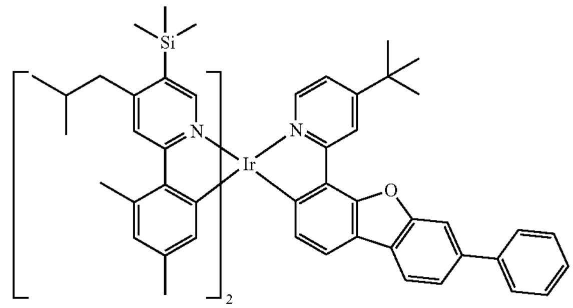
1405
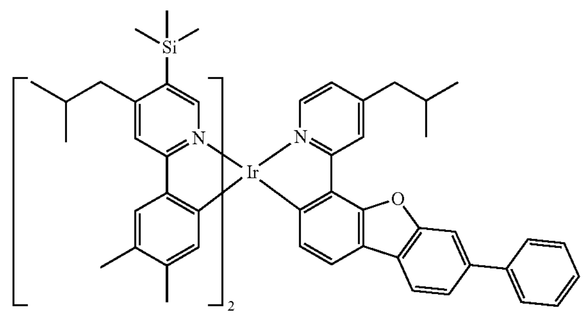
1406
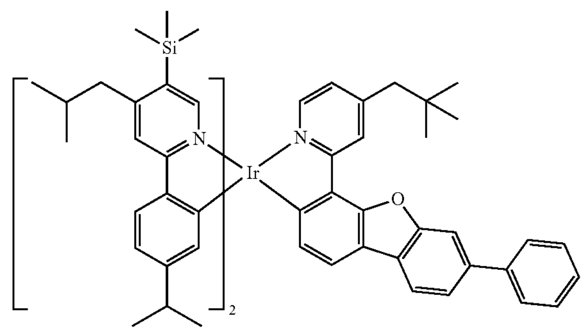
1407
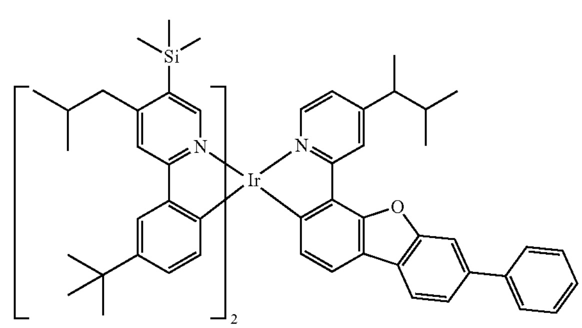

-continued
1408
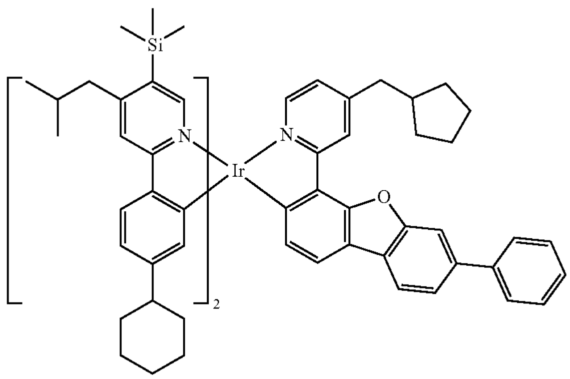
1409
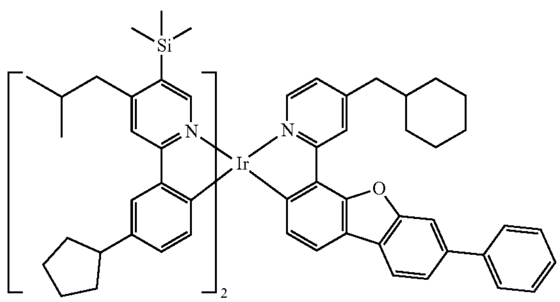
1410
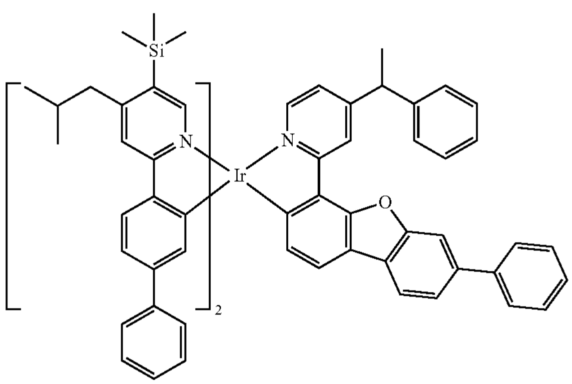
1411
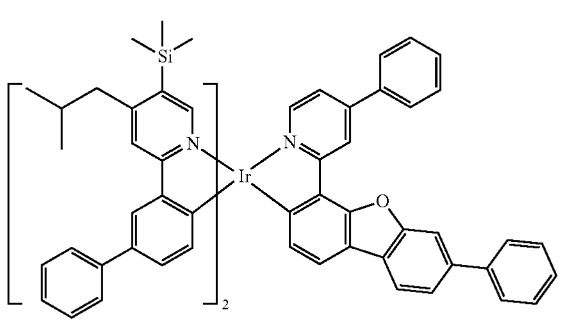
-continued
1412
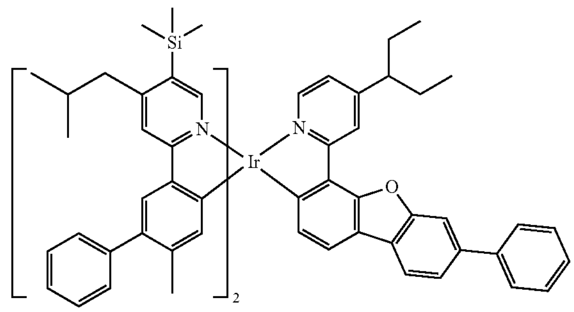
1413
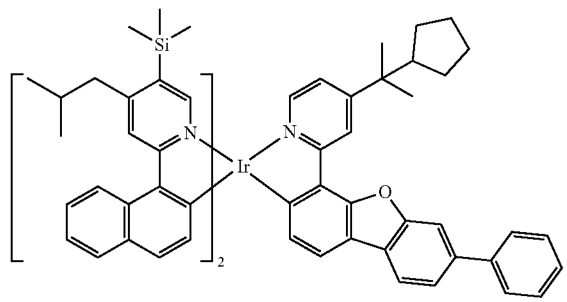
1414
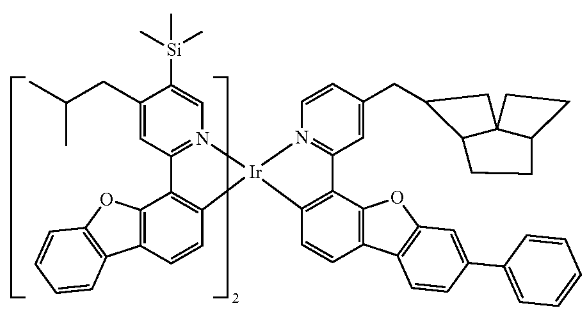
1415
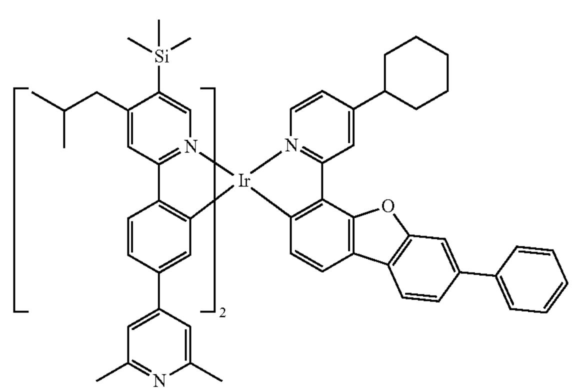

-continued
1416
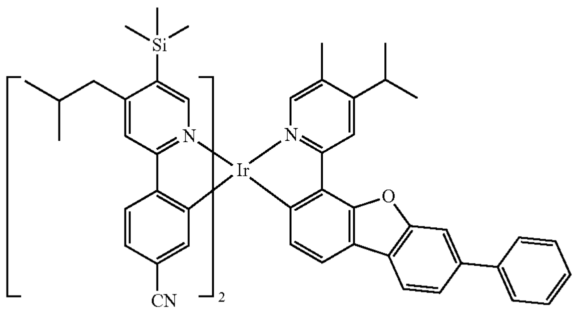
1417
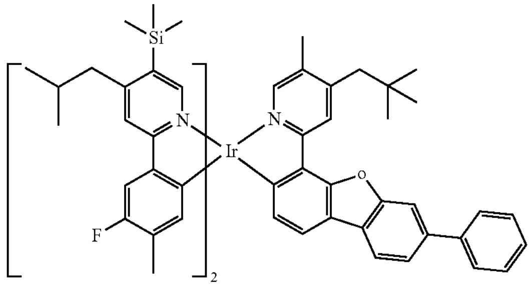
1418
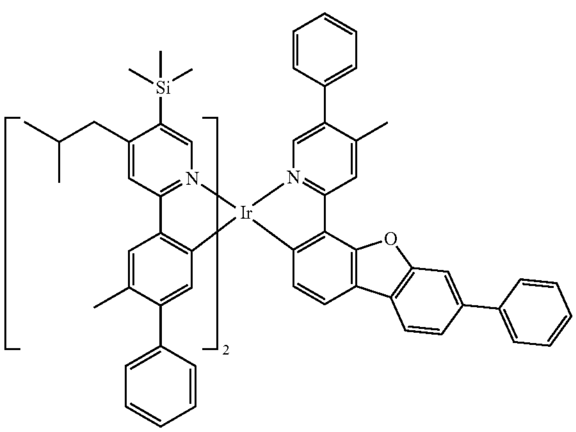
1419
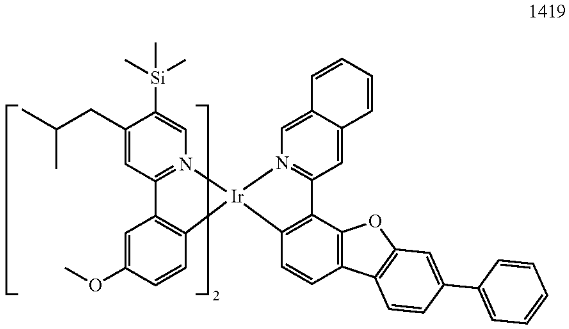
-continued
1420
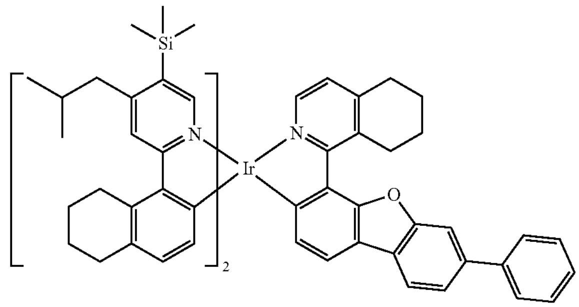
1421
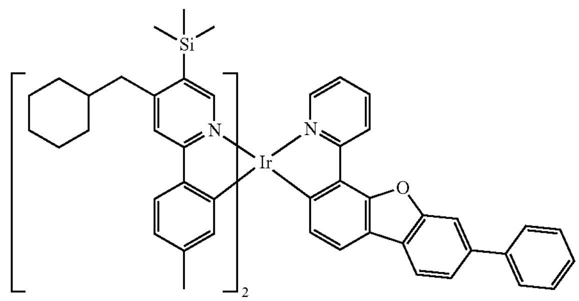
1422
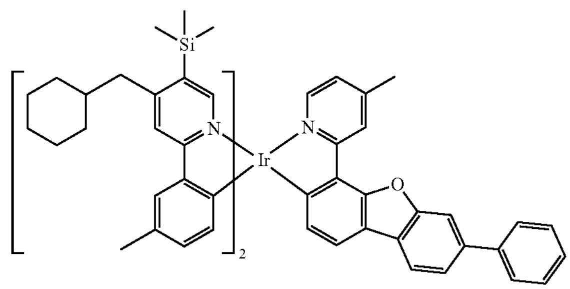
1423
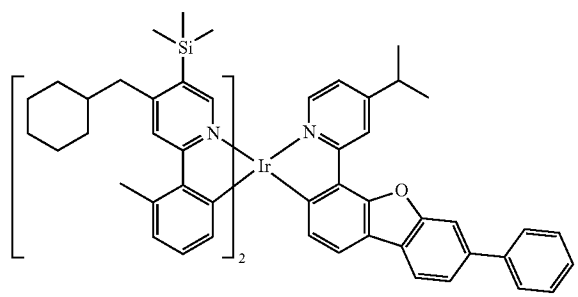
1424
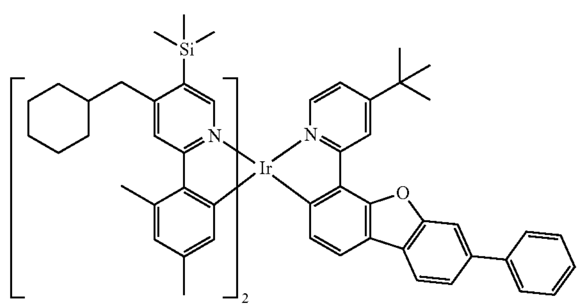

-continued
1425
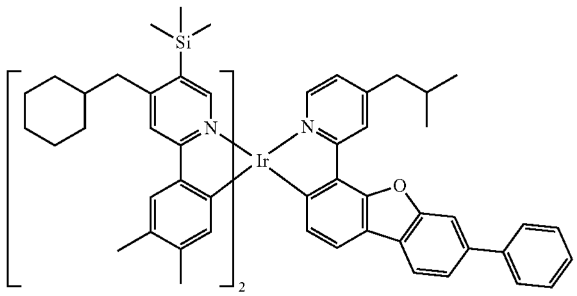
1426
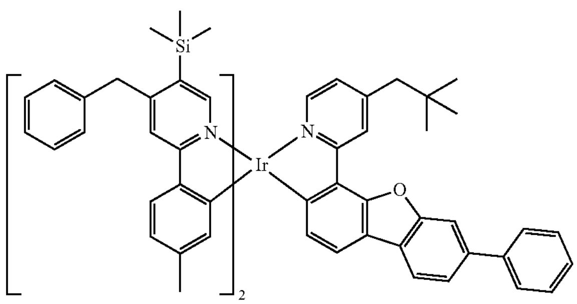
1427
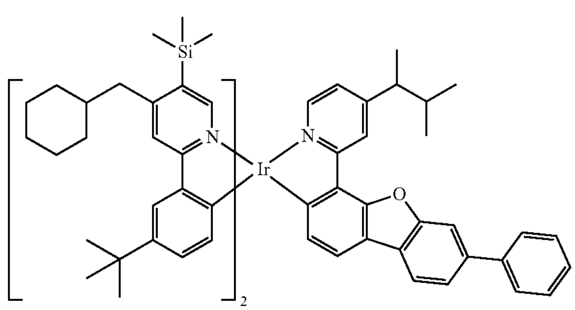
1428
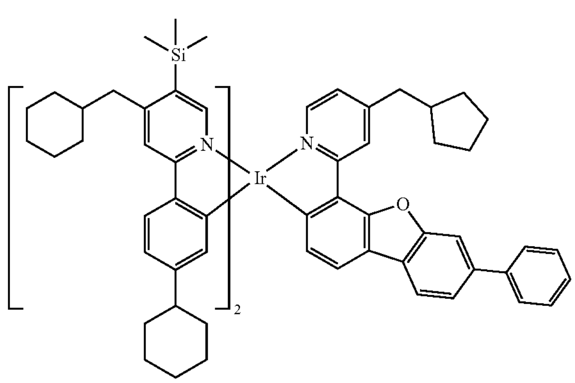
-continued
1429
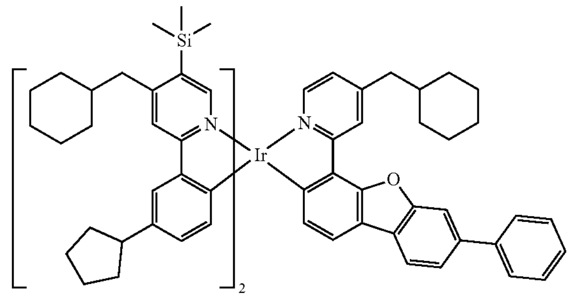
1430
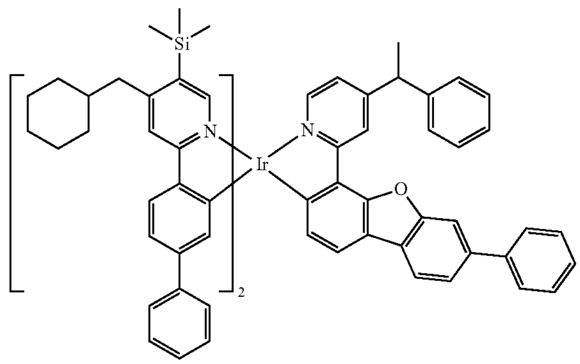
1431
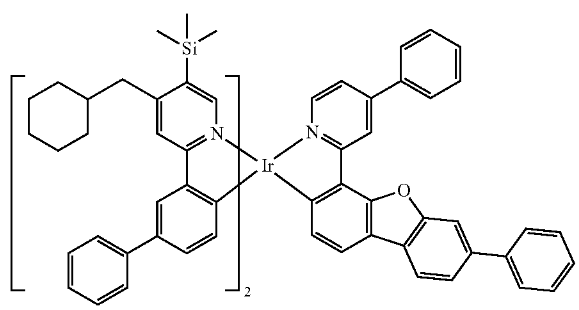
1432
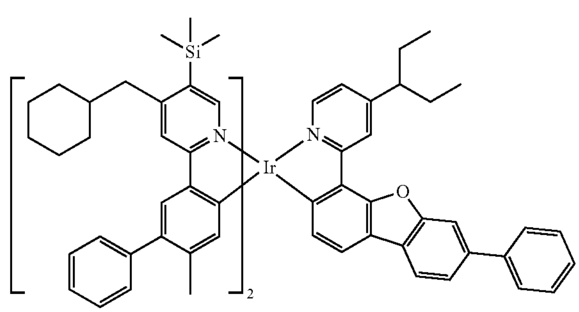

1433
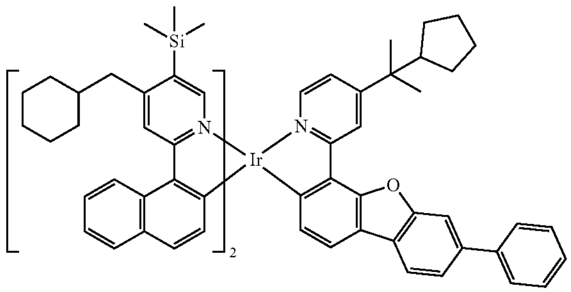
1434
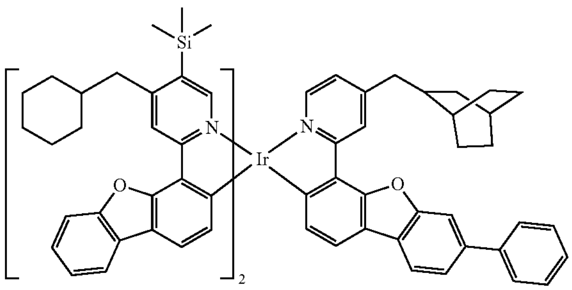
1435
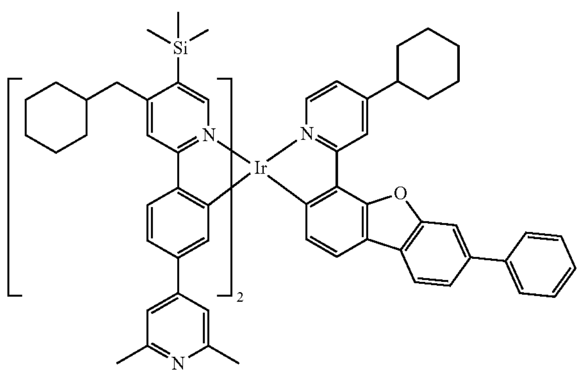
1436
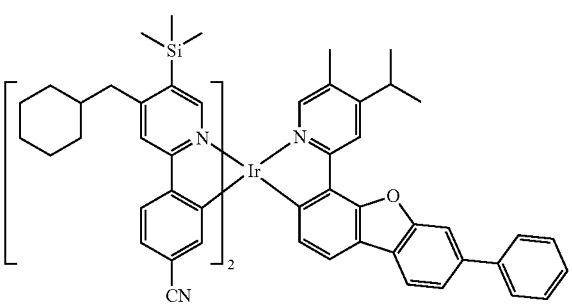
1437
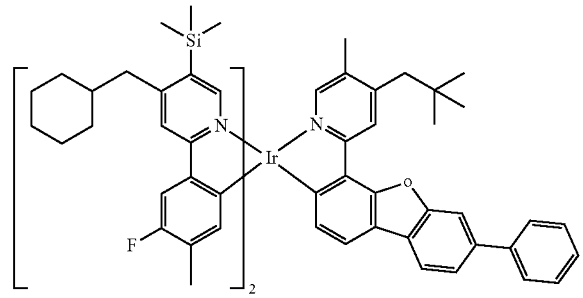
1438
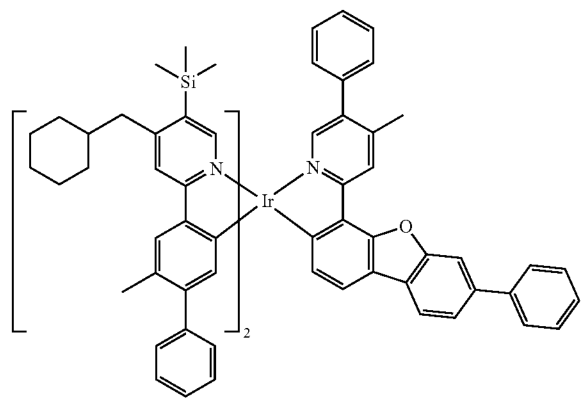
1439
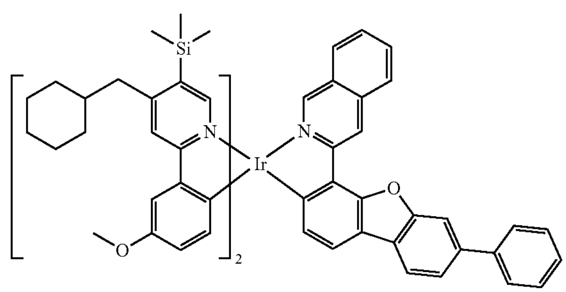
1440
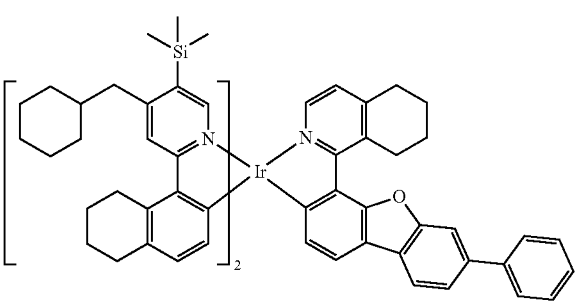

-continued
1441
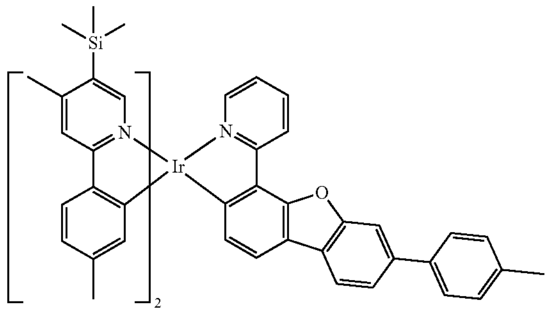
1442
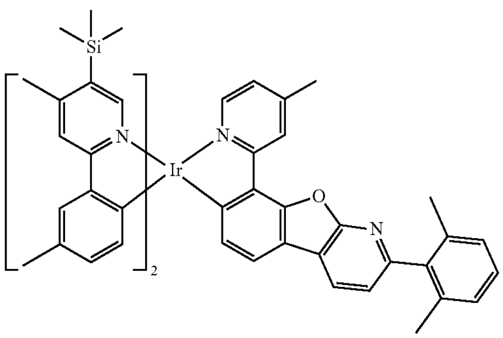
1443
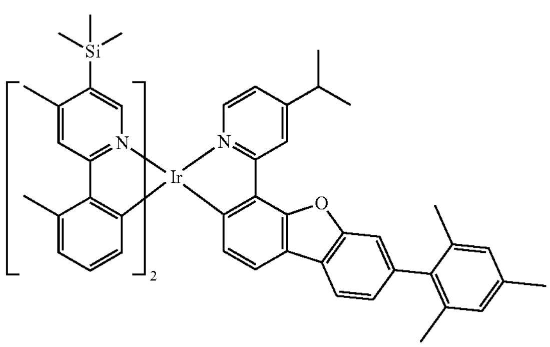
1444
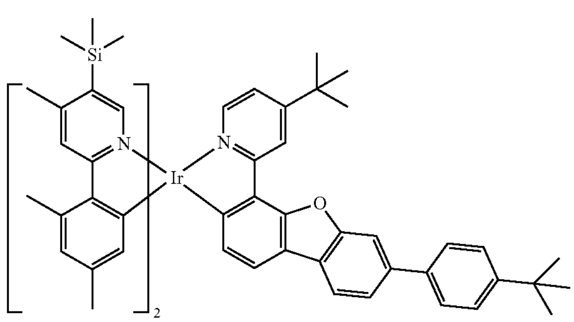
-continued
1445
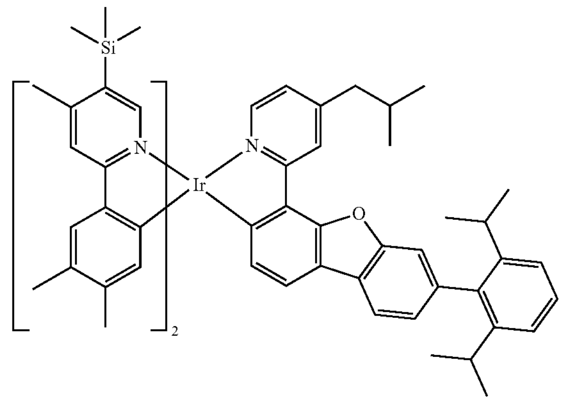
1446
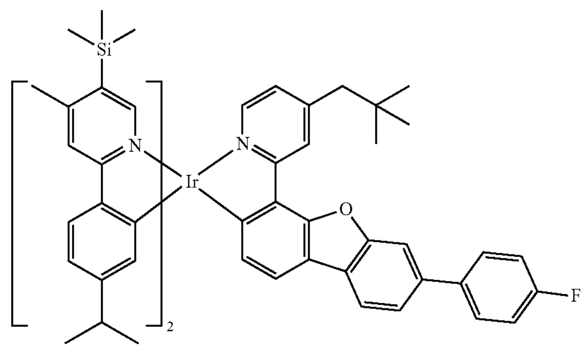
1447
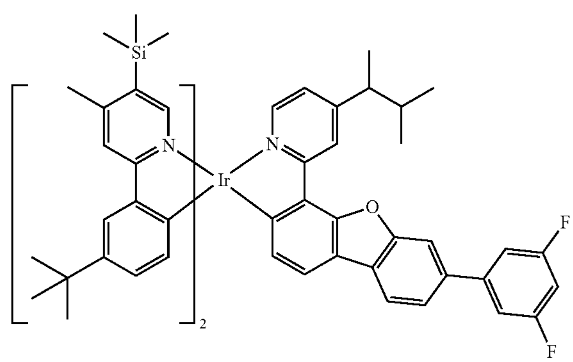
1448
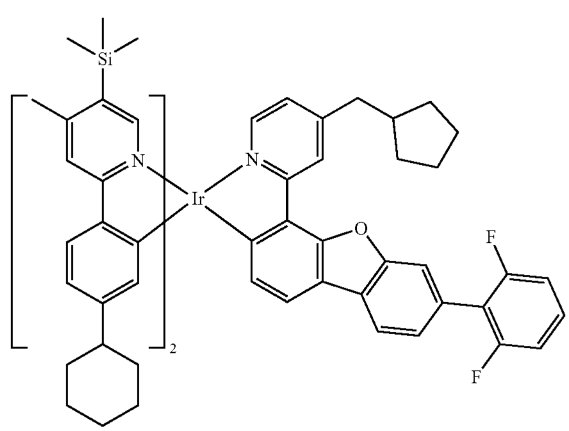

-continued
1449
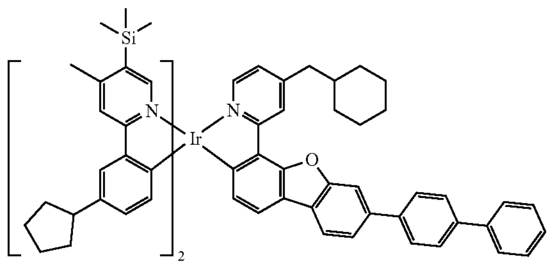
1450
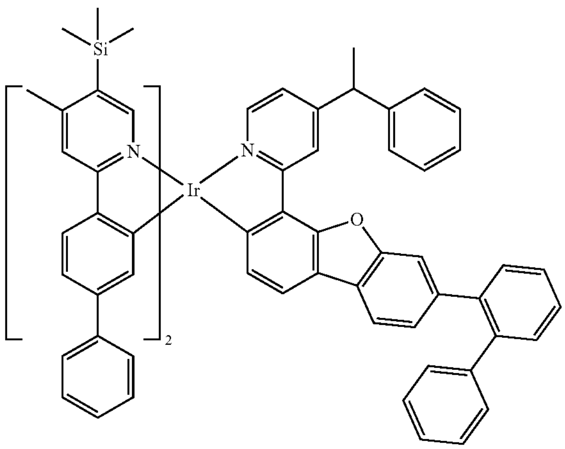
1451
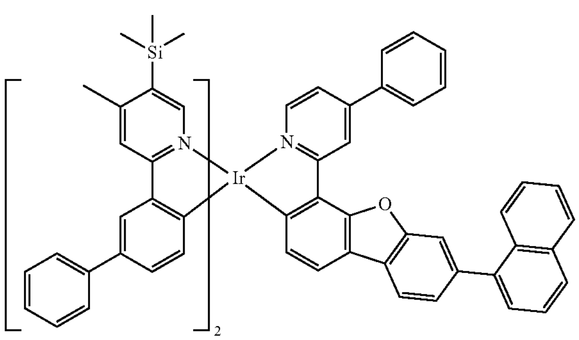
1452
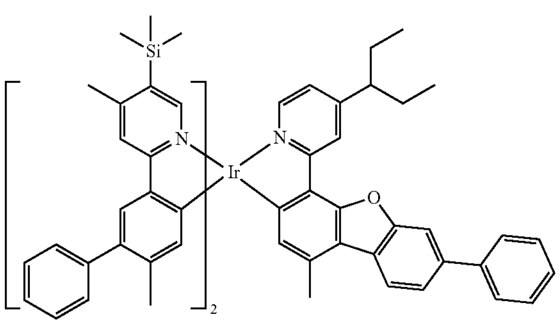
-continued
1453
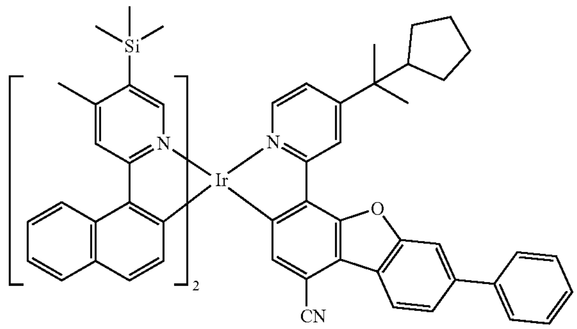
1454
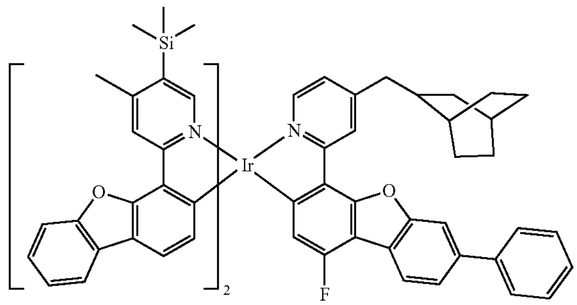
1455
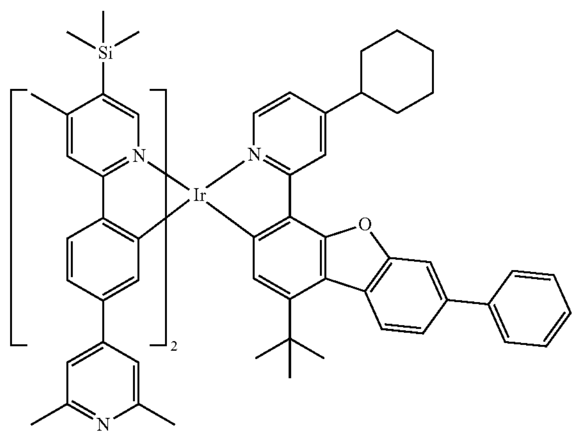
1456
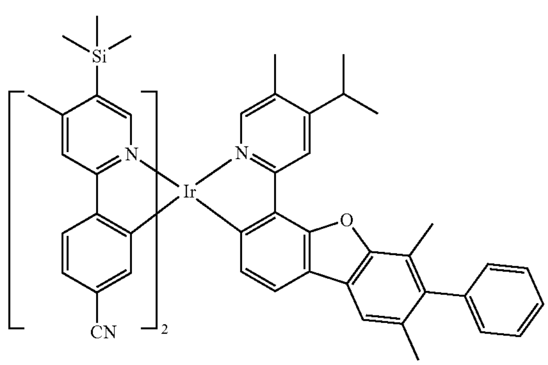

-continued
1457
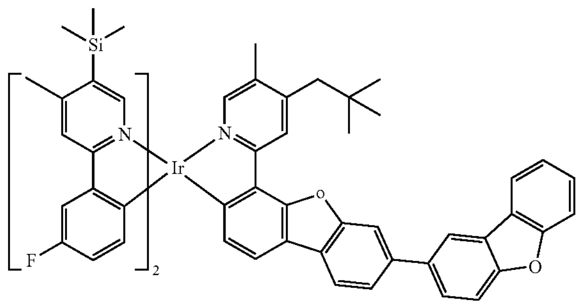
1458
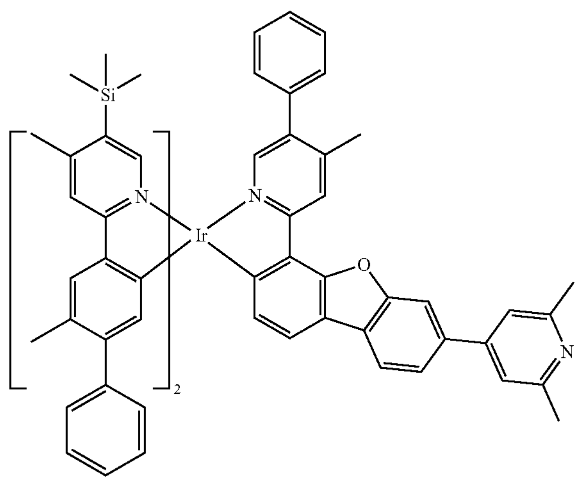
1459
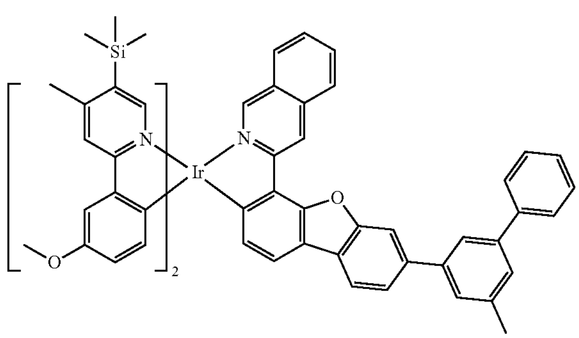
1460
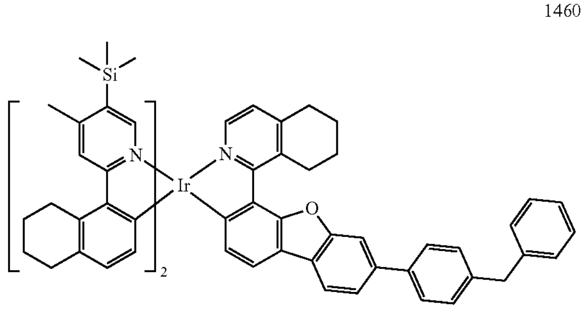
-continued
1461
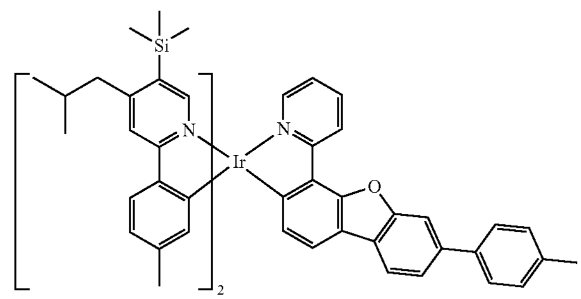
1462
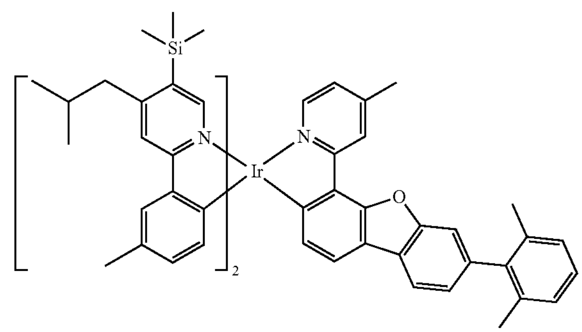
1463
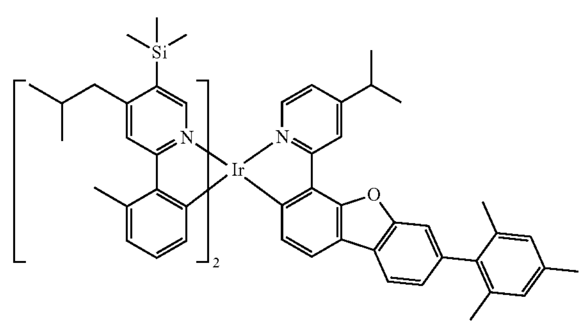
1464
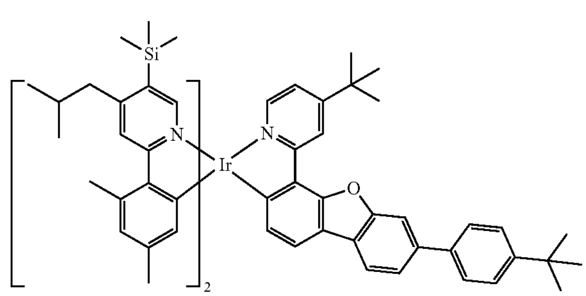

1465
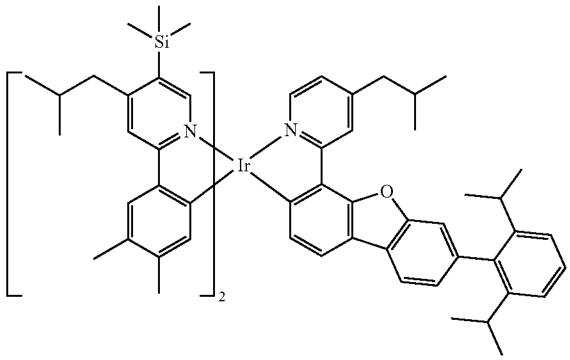
1466
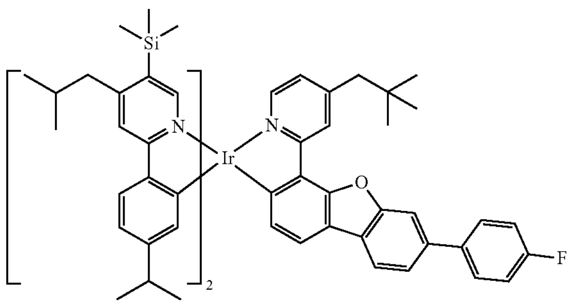
1467
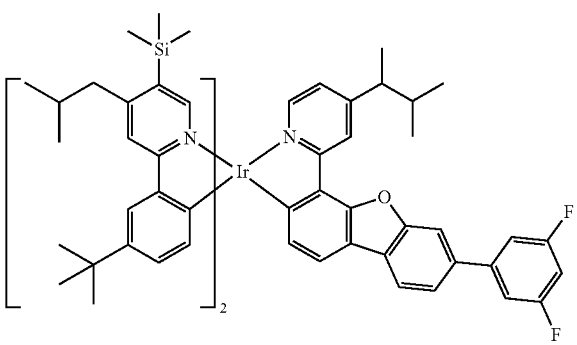
1468
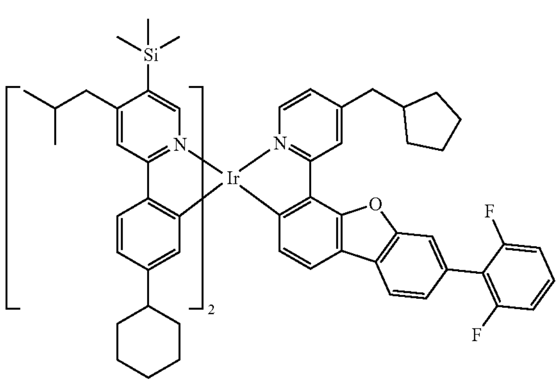
1469
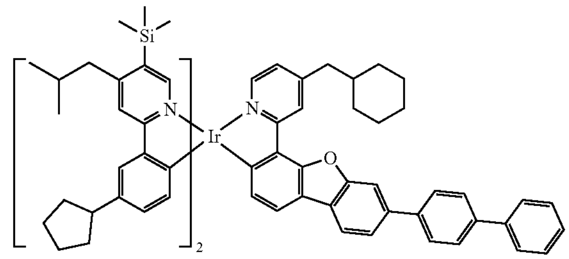
1470
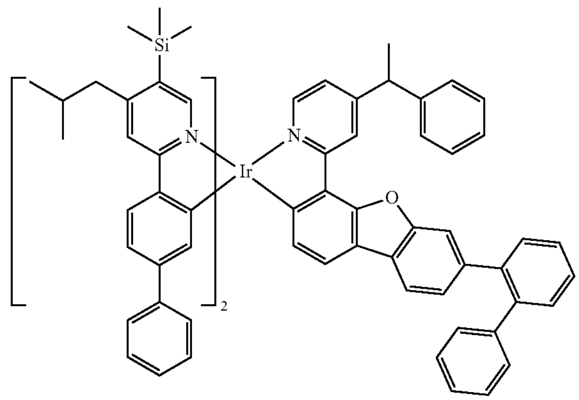
1471
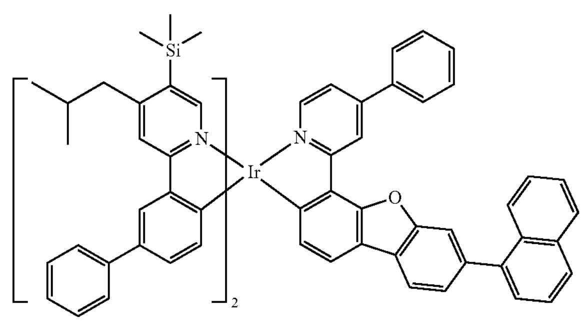
1472
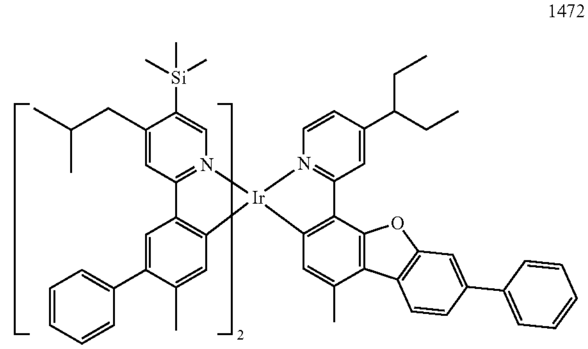

-continued
1473
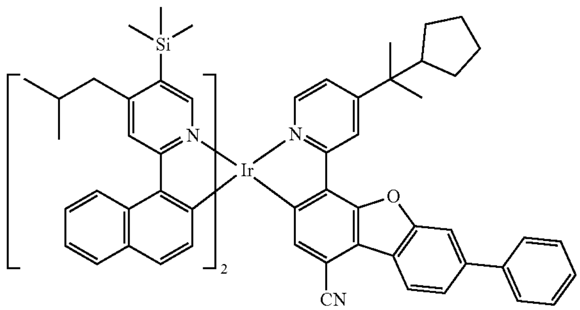
1474
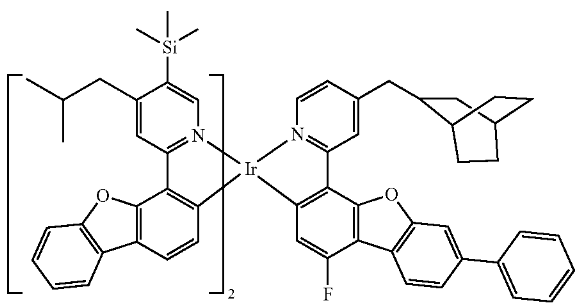
1475
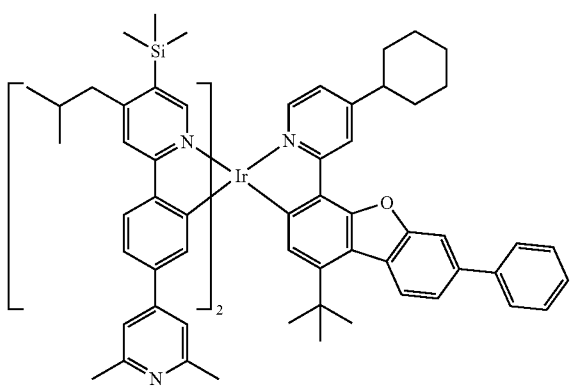
1476
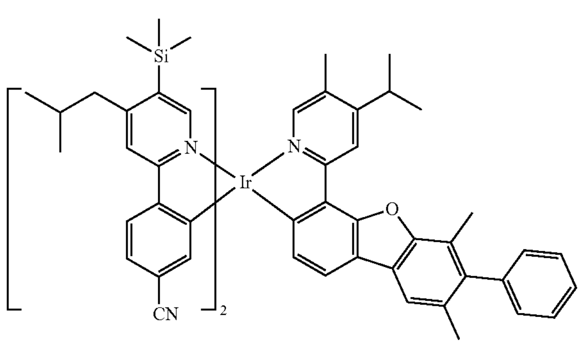
-continued
1477
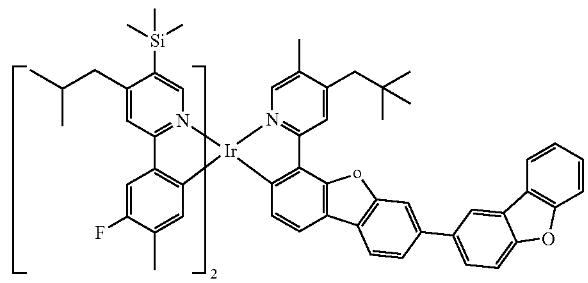
1478
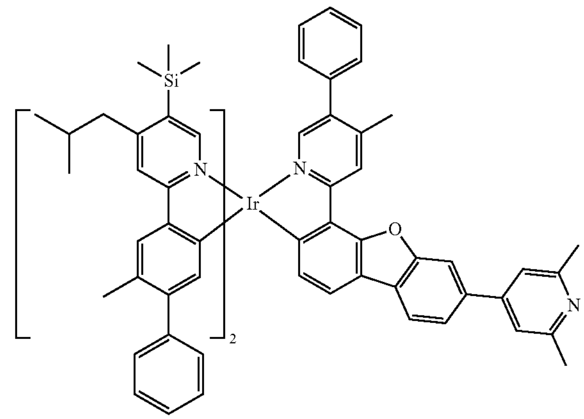
1479
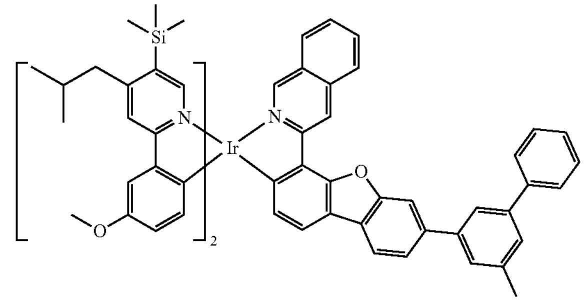
1480
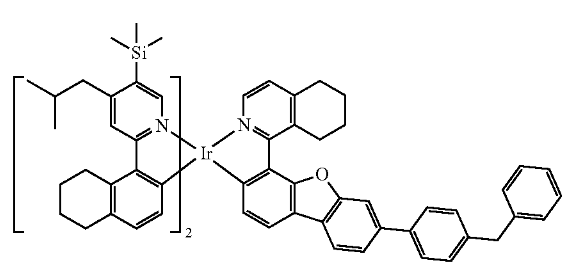

-continued
1481
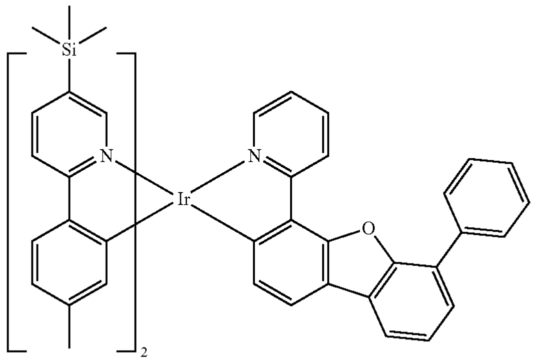
1482
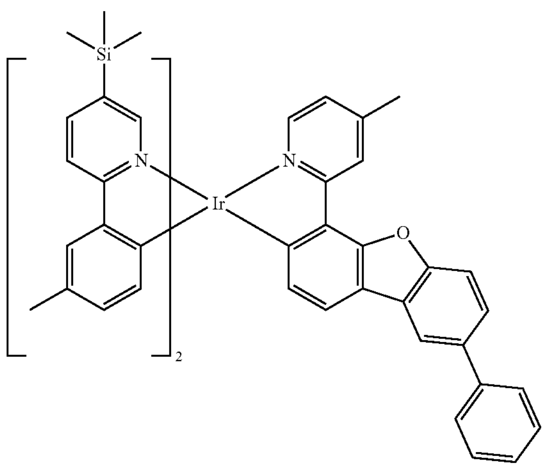
1483
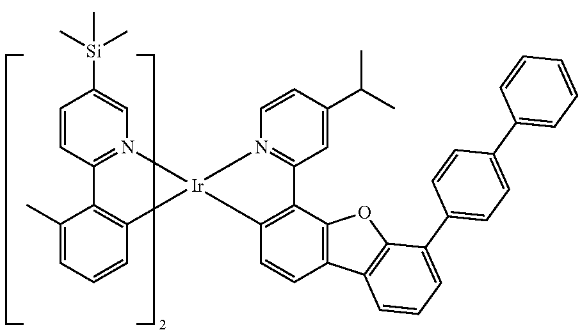
1484
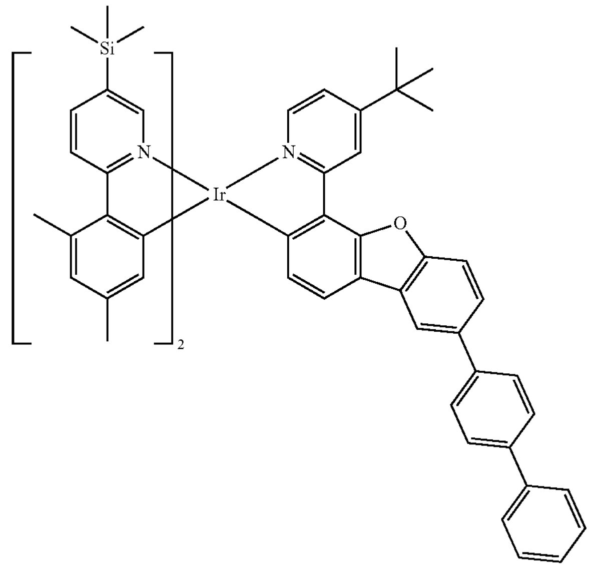
1485
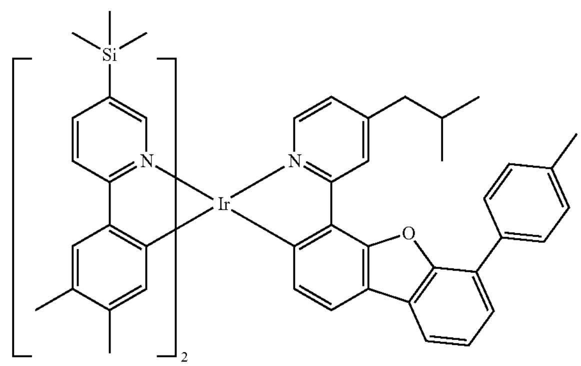
1486
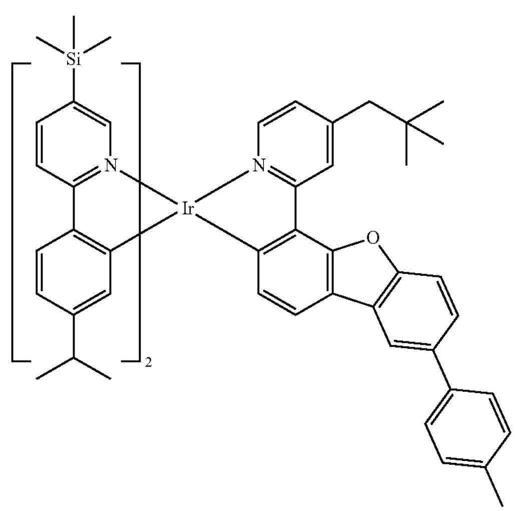

1487
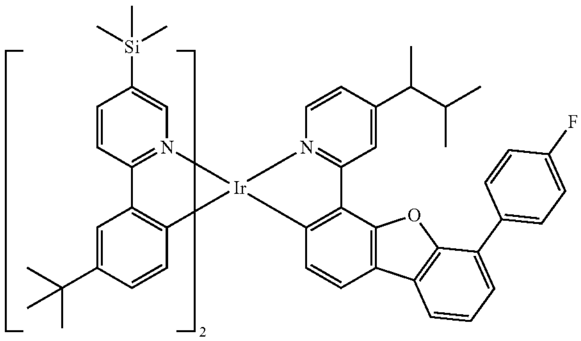
1488
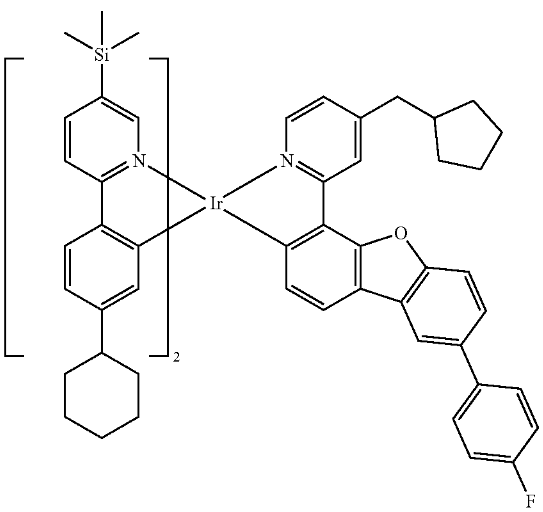
1489
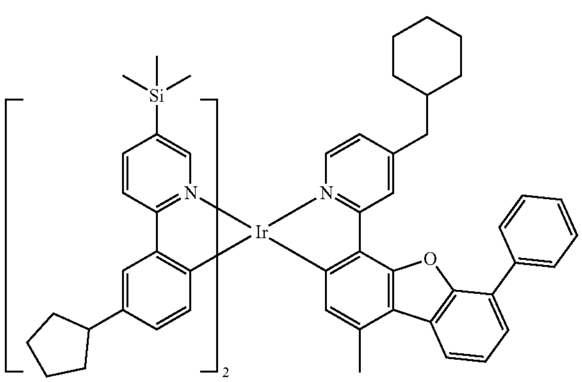
1490
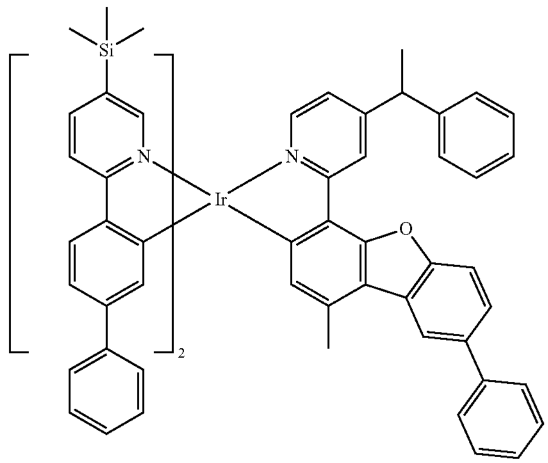
1491
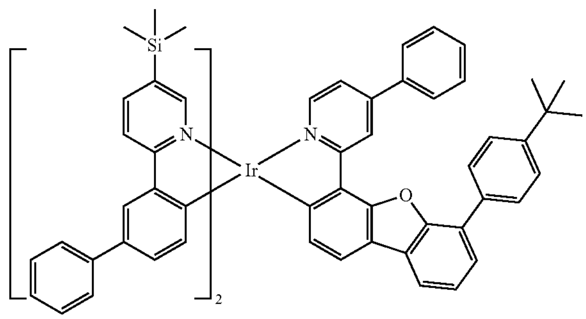
1492
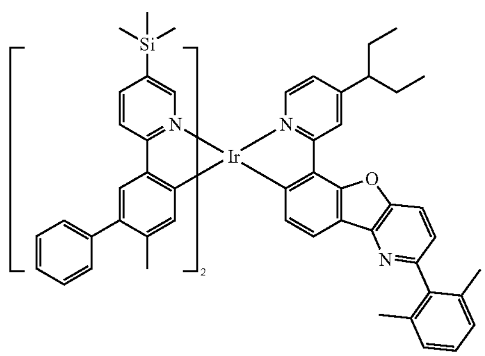
1493
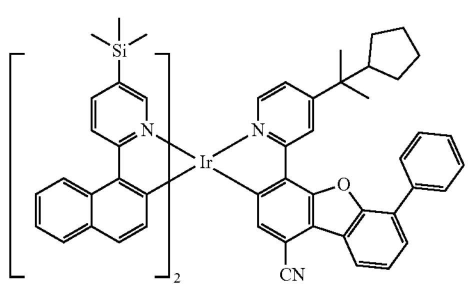

1494
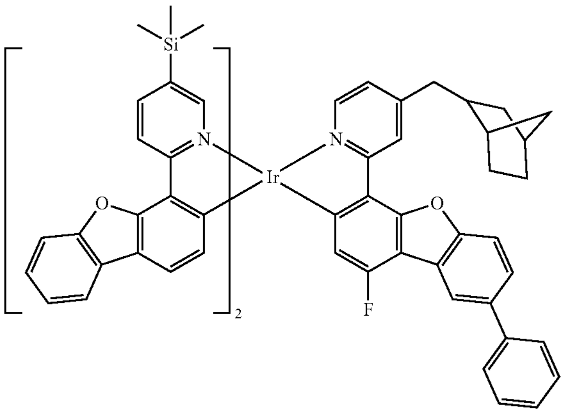
1495
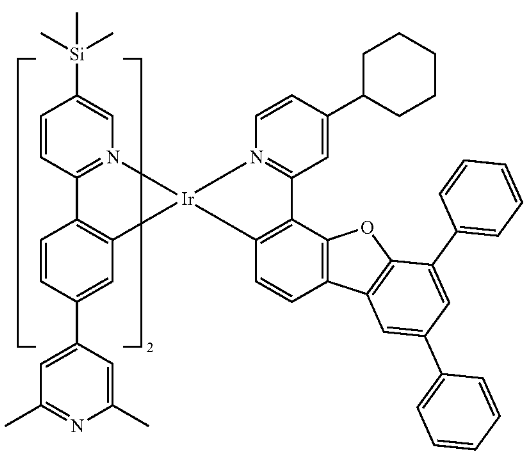
1496
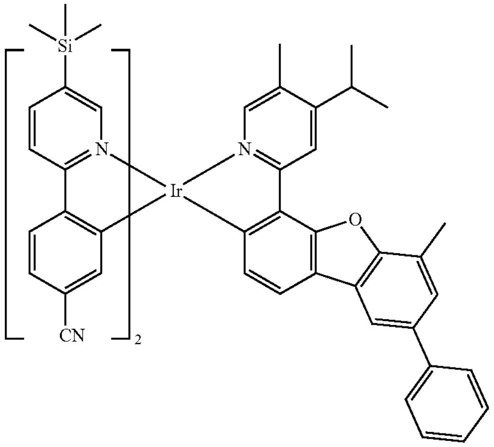
1497
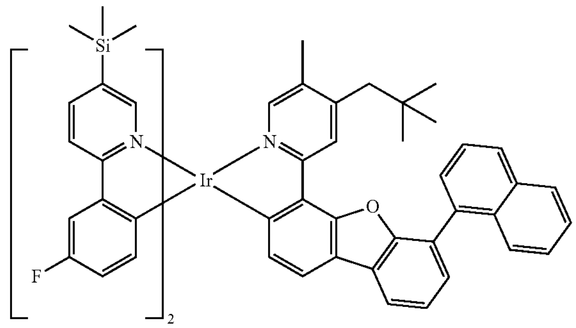
1498
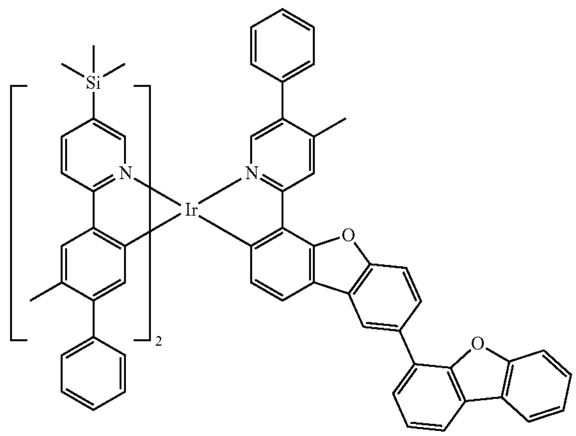
1499
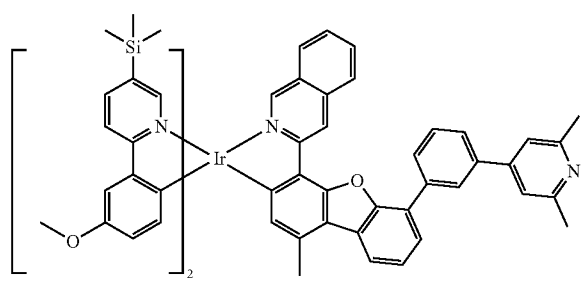
1500
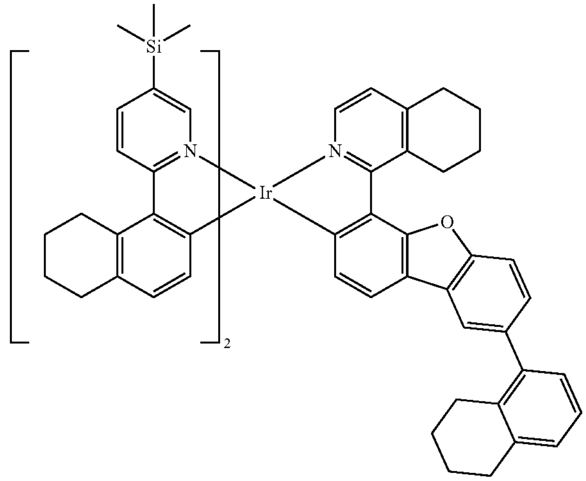

1501
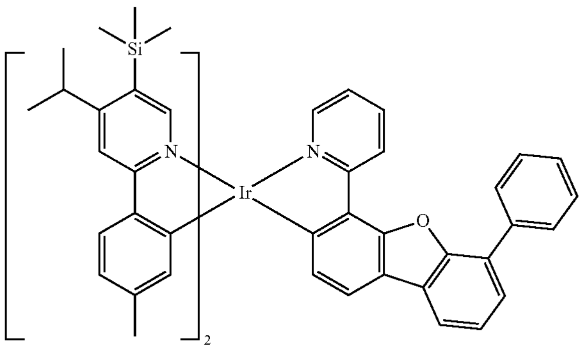
1502
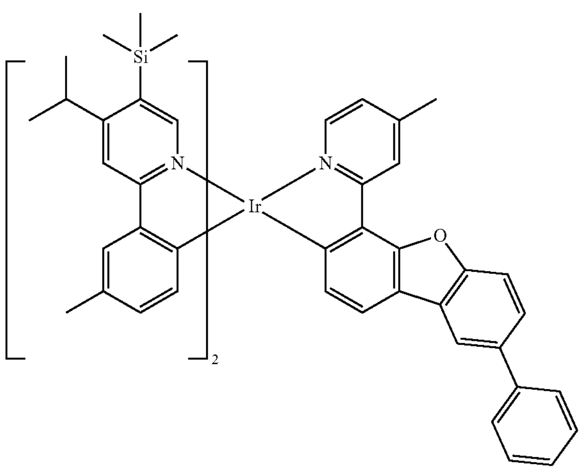
1503
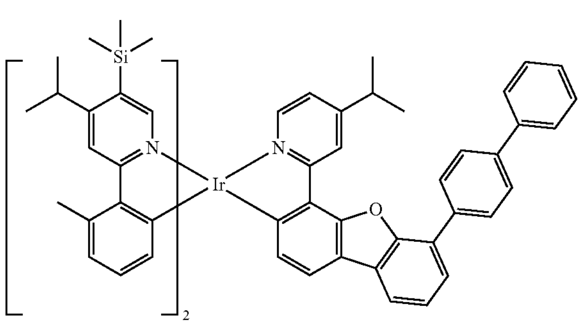
1504
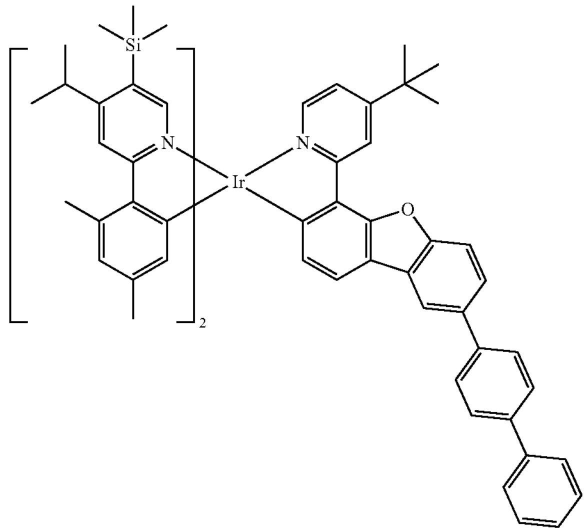
1505
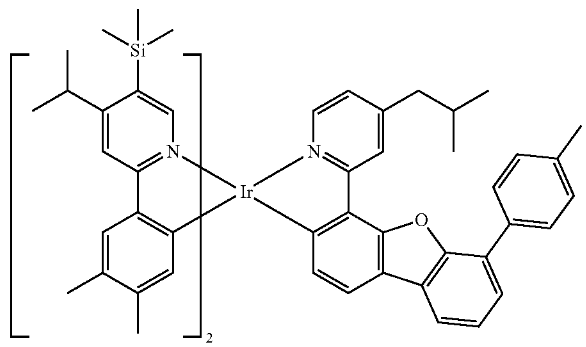
1506
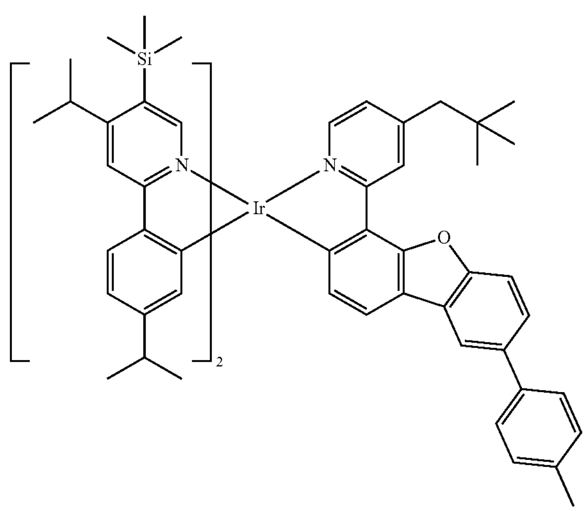

-continued
1507
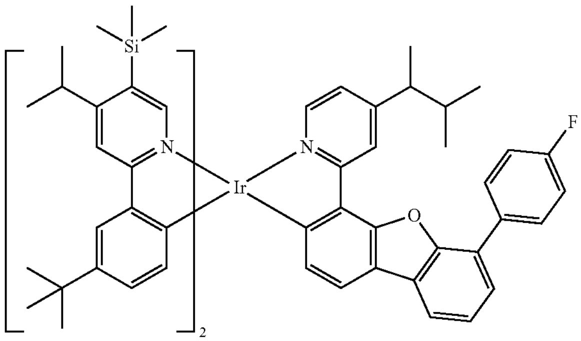
1508
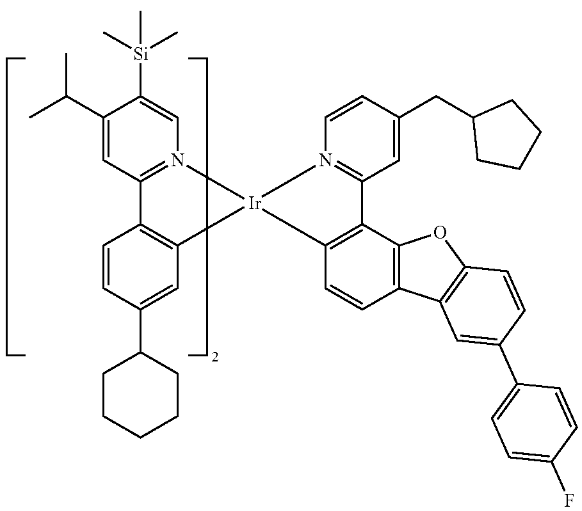
1509
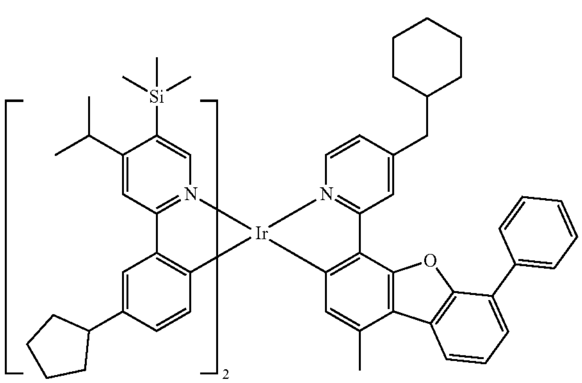
-continued
1510
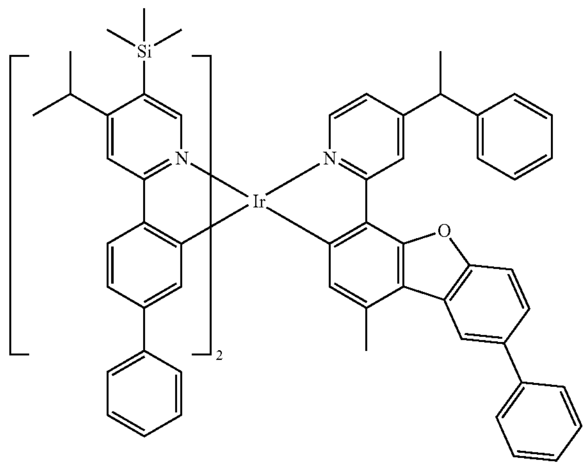
1511
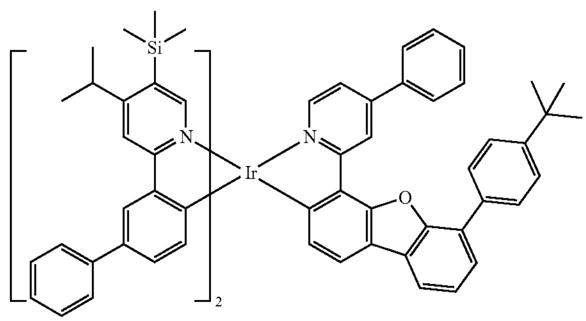
1512
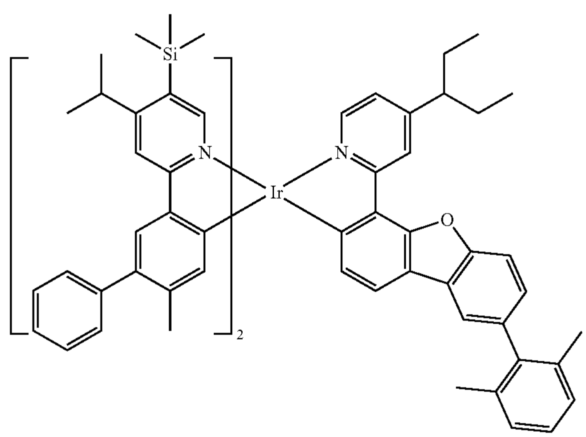
1513
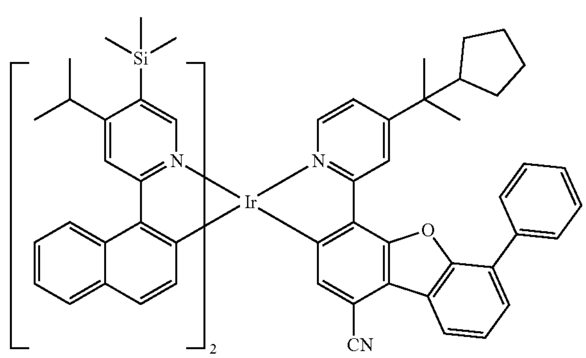

-continued
1514
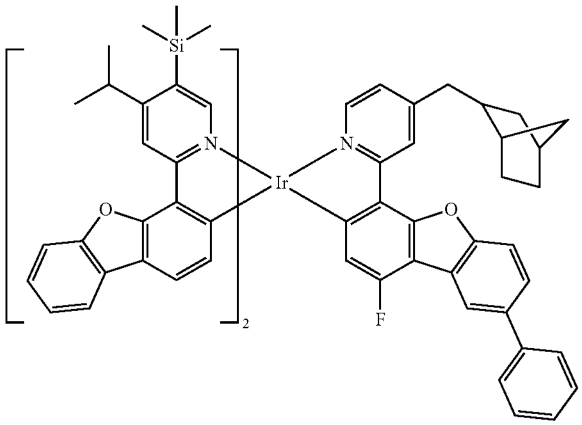
1515
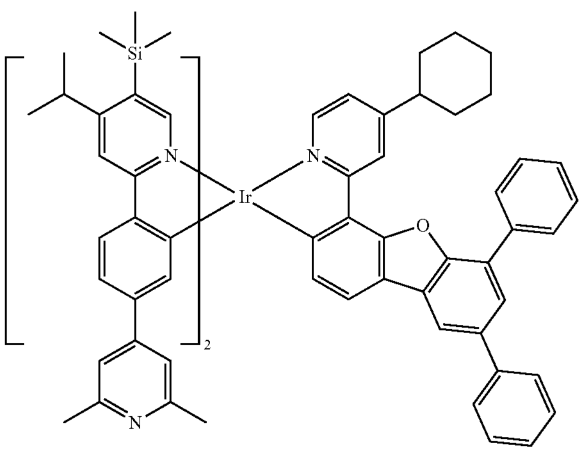
1516
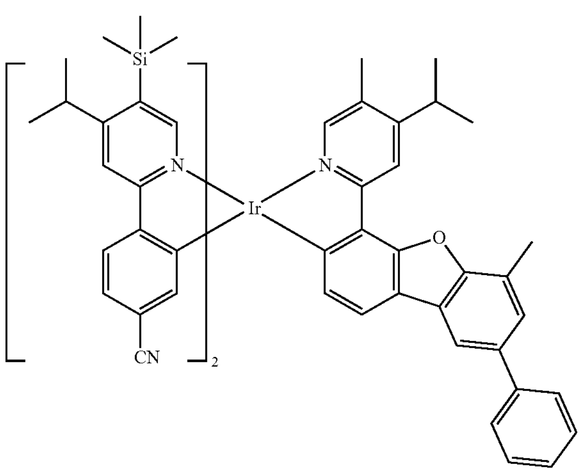
-continued
1517
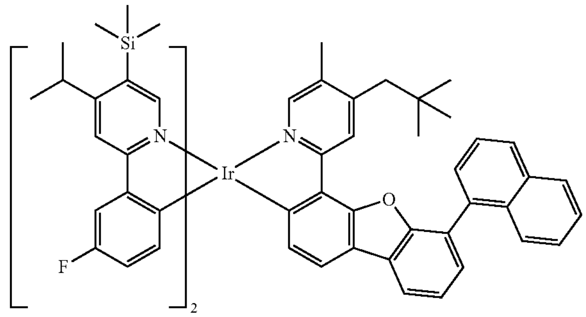
1518
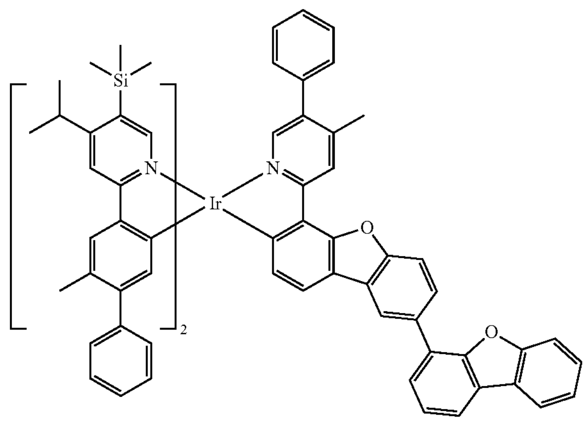
1519
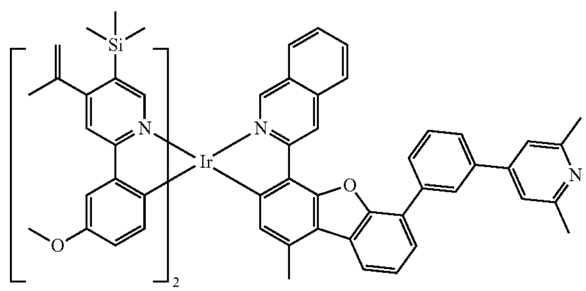
1520
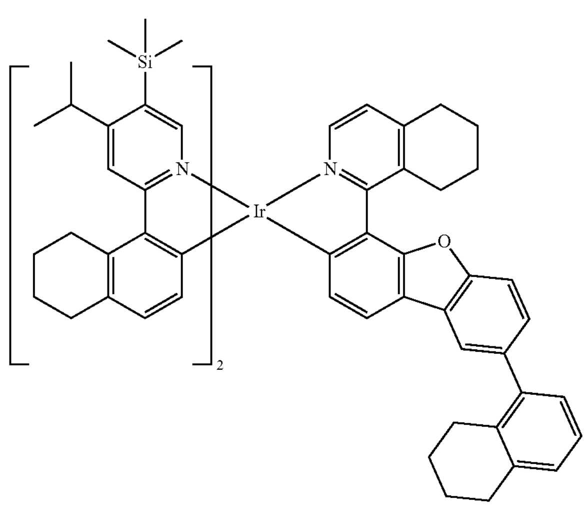

1521
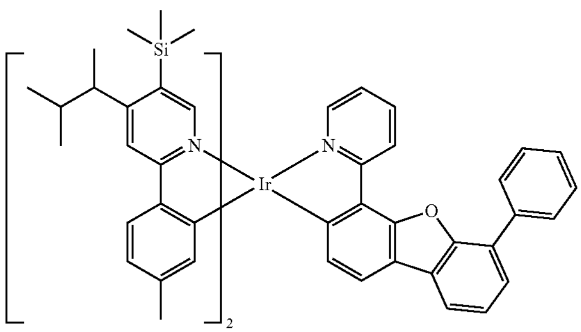
1522
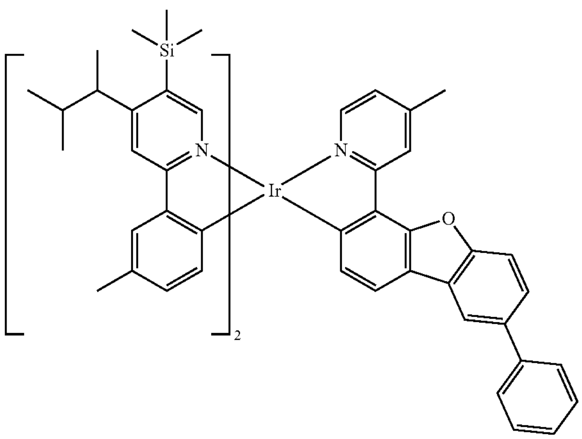
1523
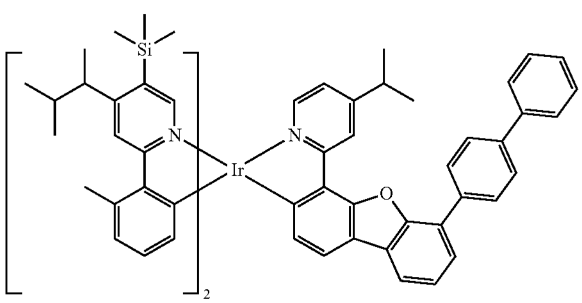
1524
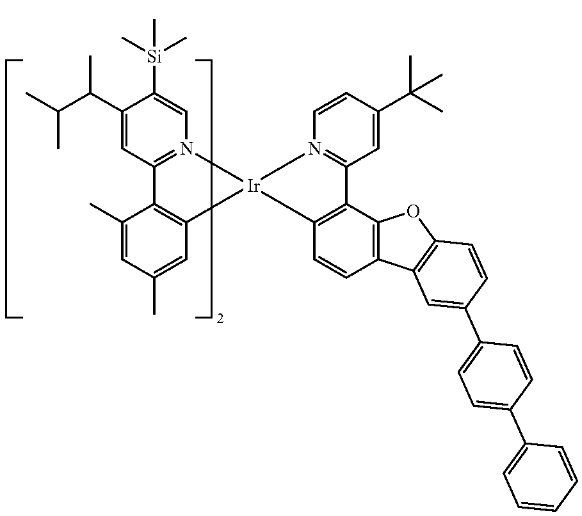
1525
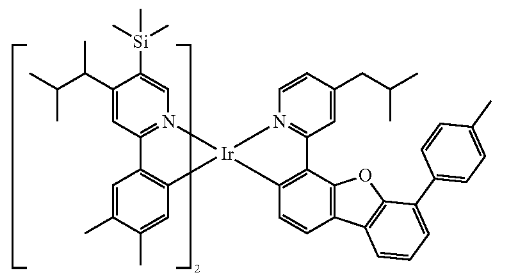
1526
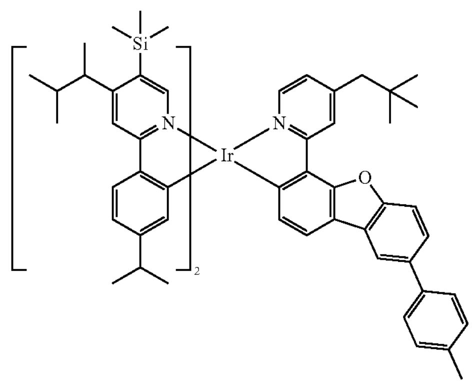
1527
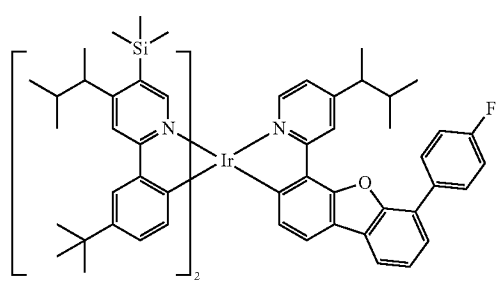
1528
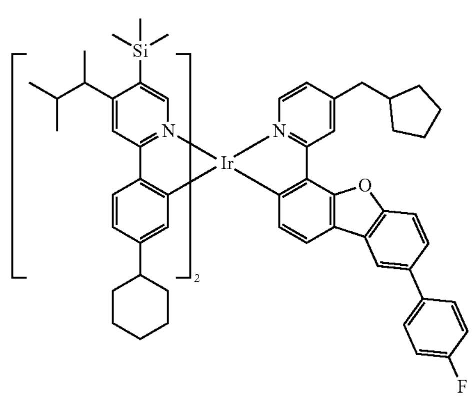

-continued
1529
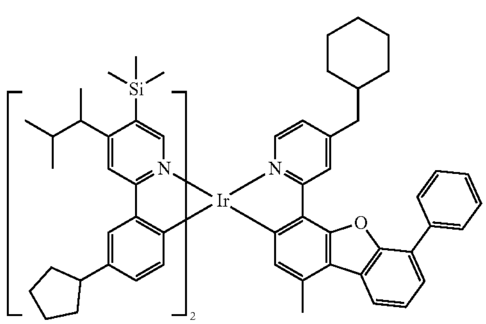
1530
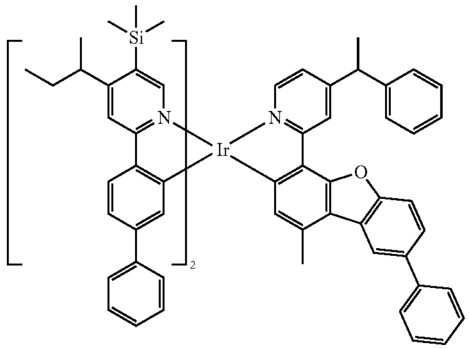
1531
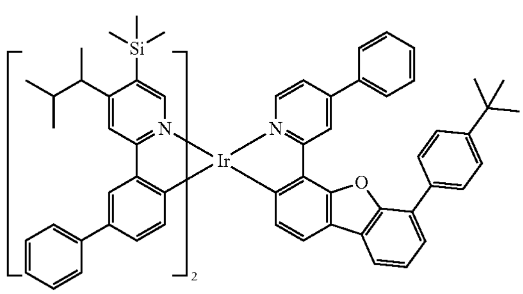
1532
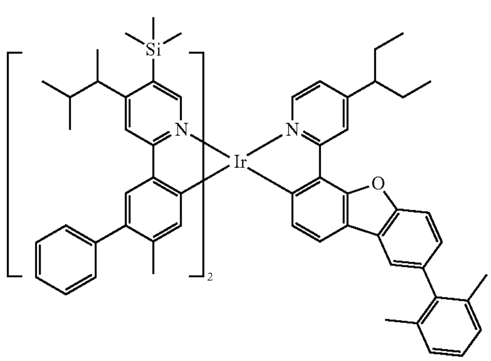
-continued
1533
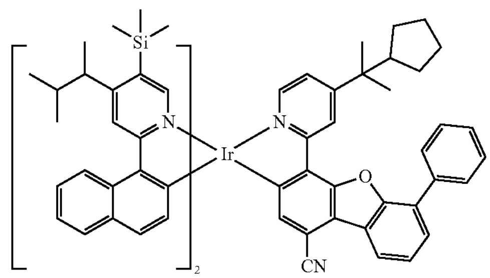
1534
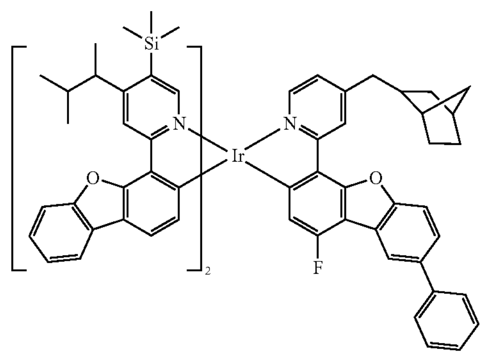
1535
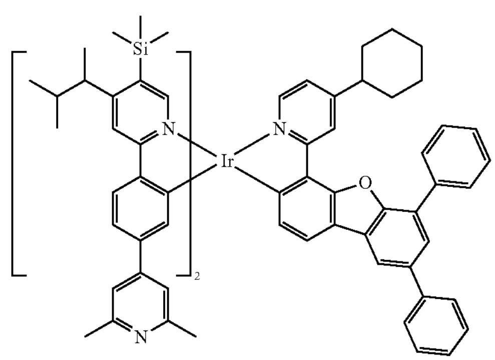
1536
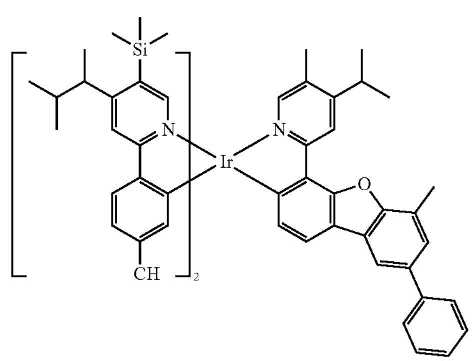

-continued
1537
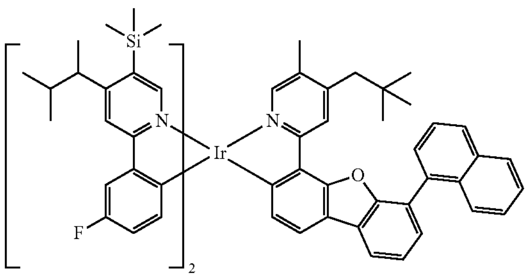
1538
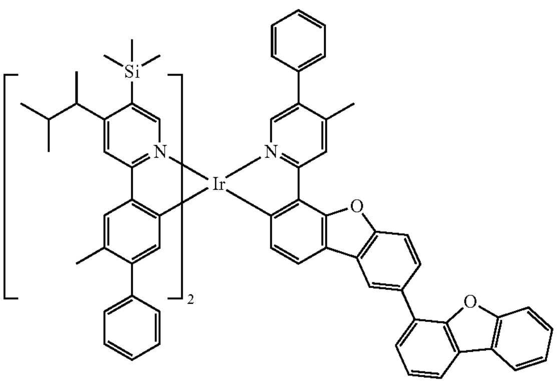
1539
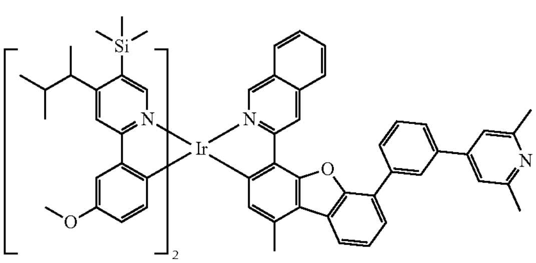
1540
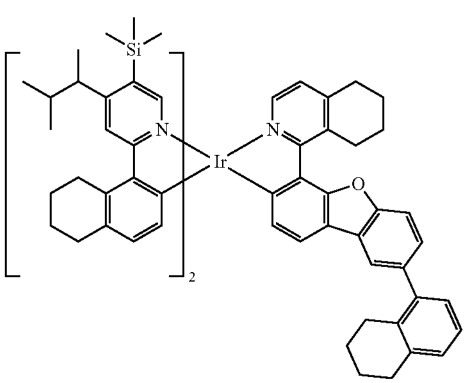
-continued
1541
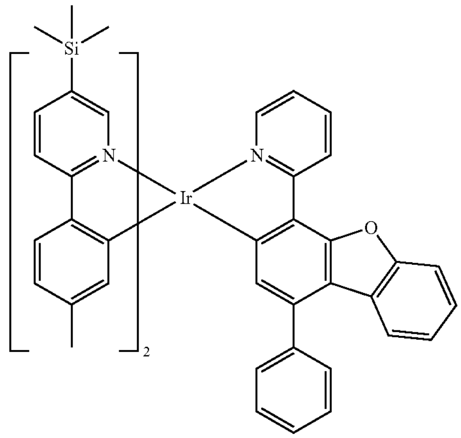
1542
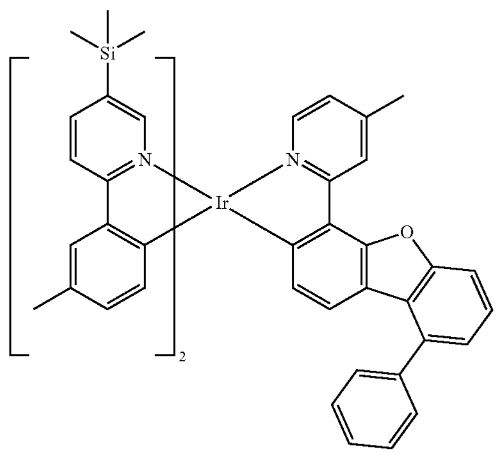
1543
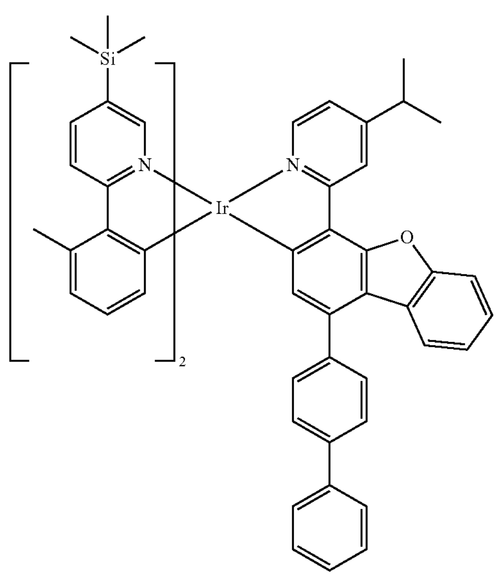

1544
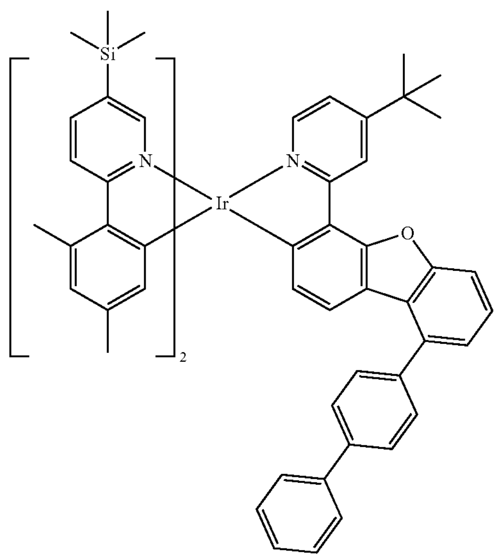
1545
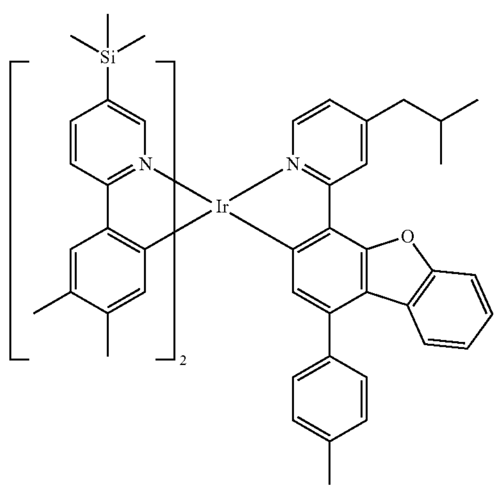
1546
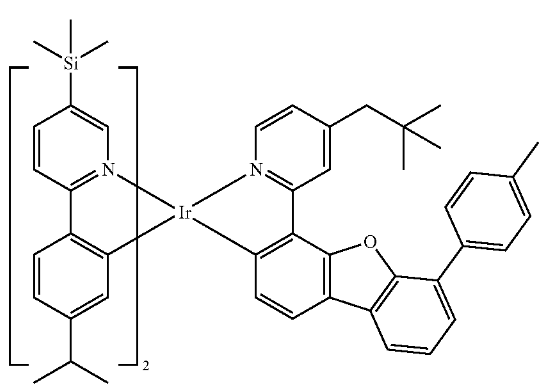
1547
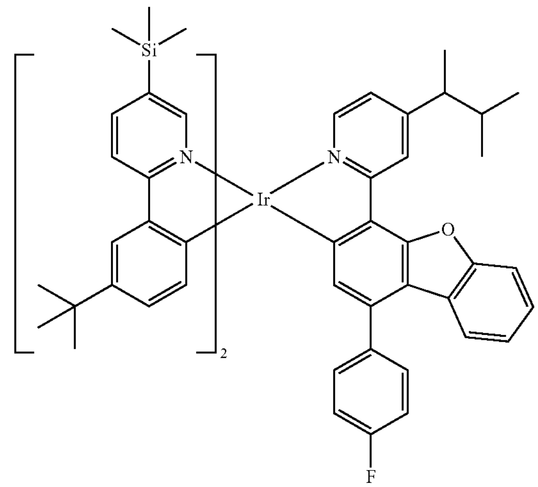
1548
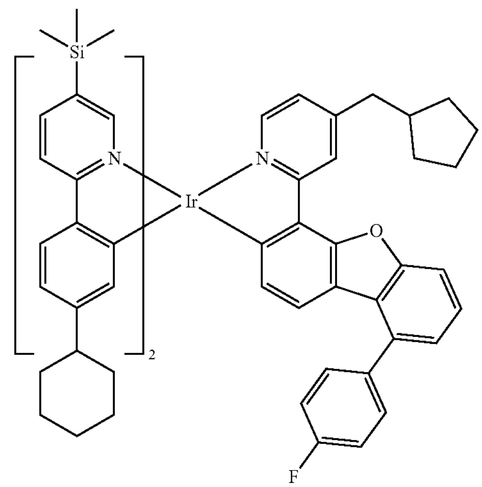
1549
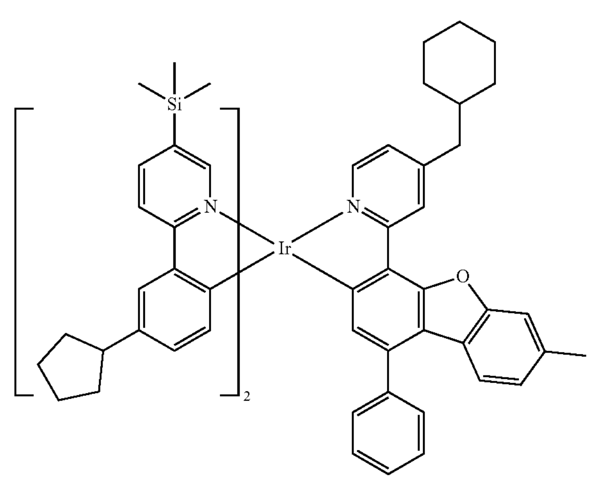

1550
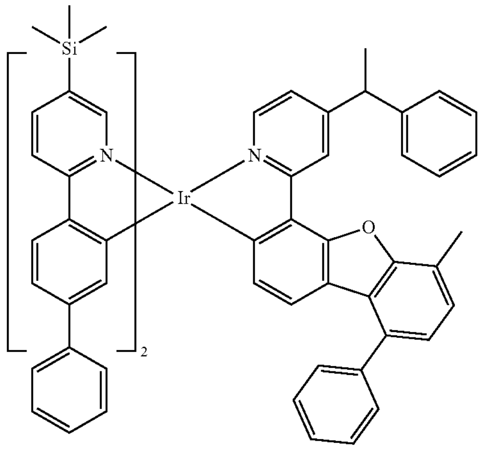
1551
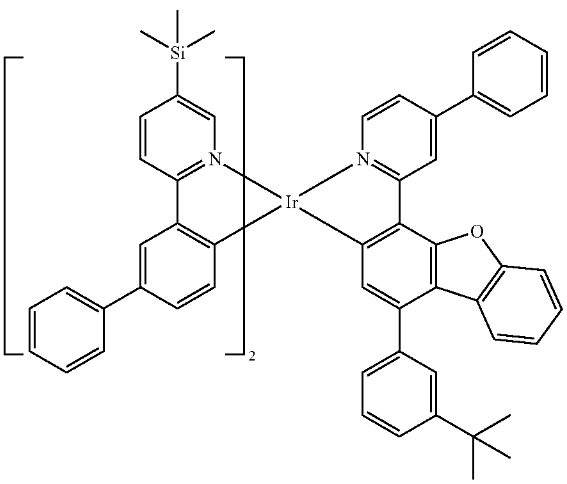
1552
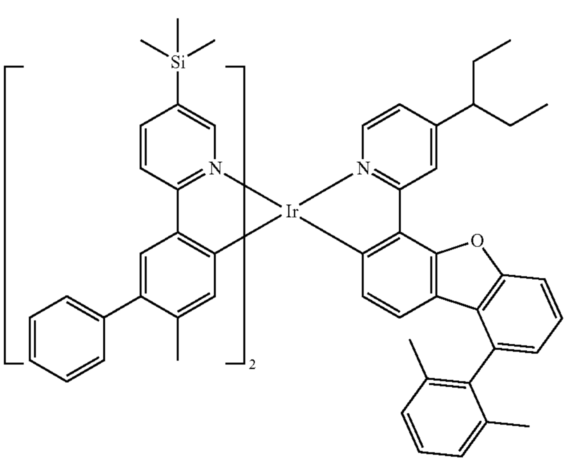
1553
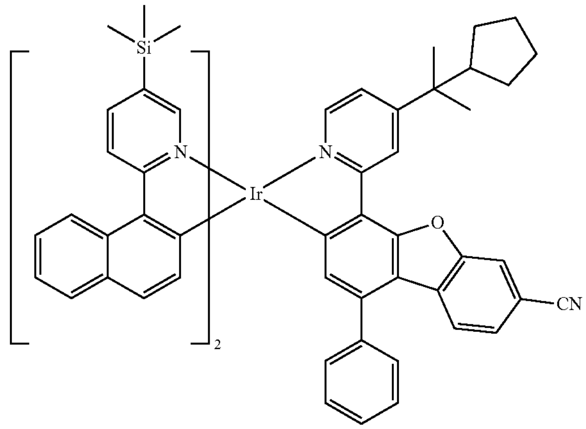
1554
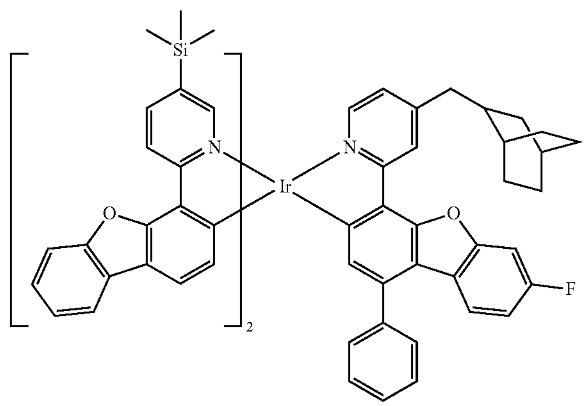
1555
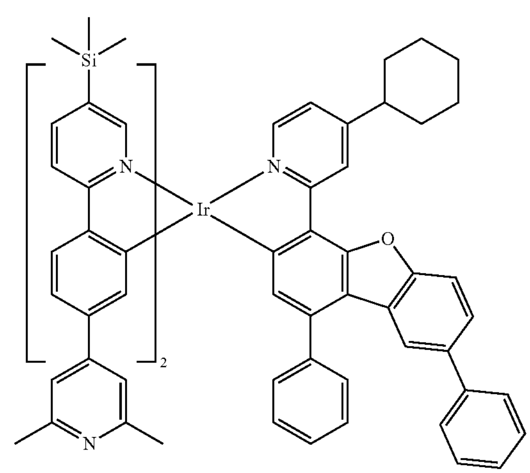

-continued
1556
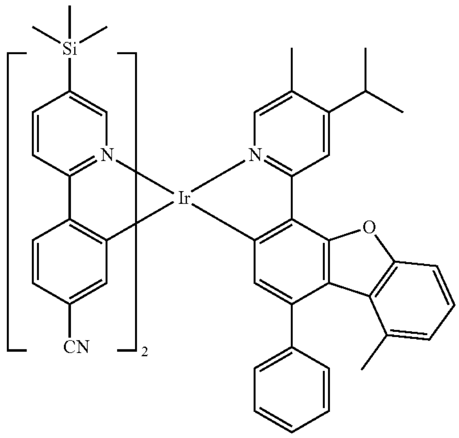
1557
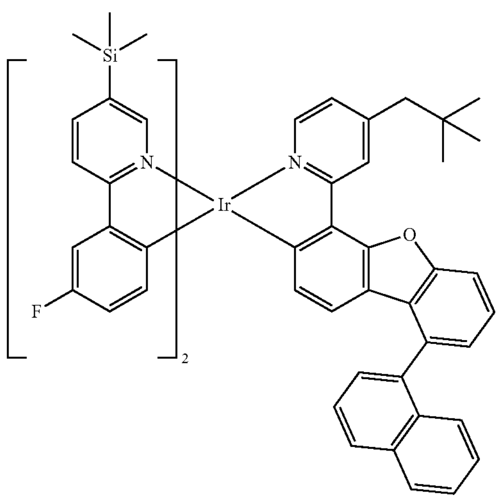
1558
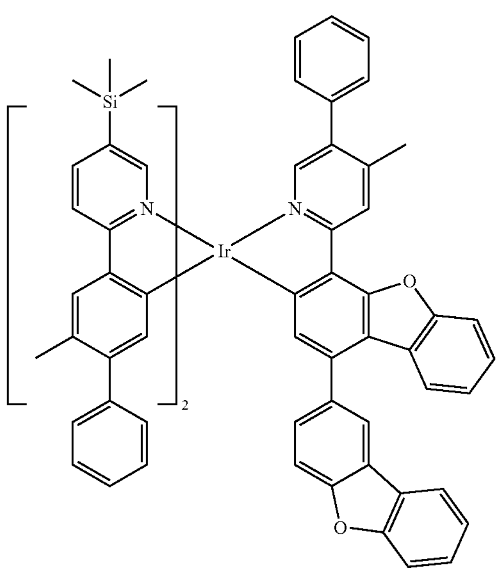
-continued
1559
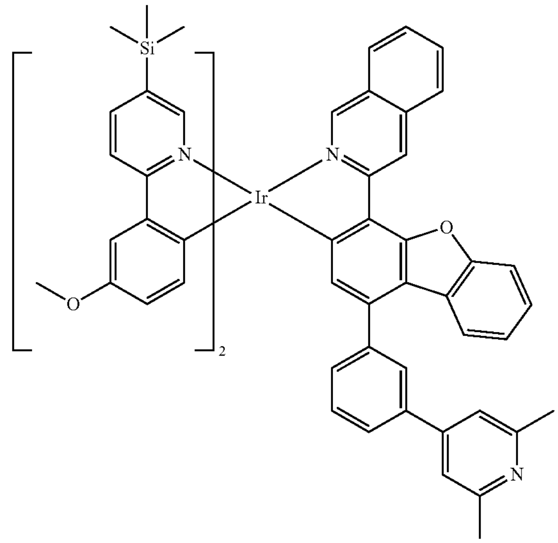
1560
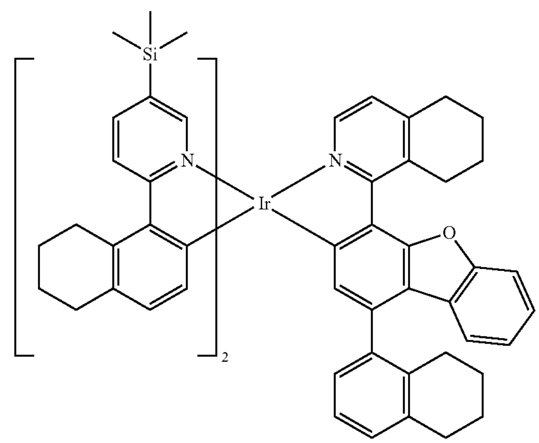
1561
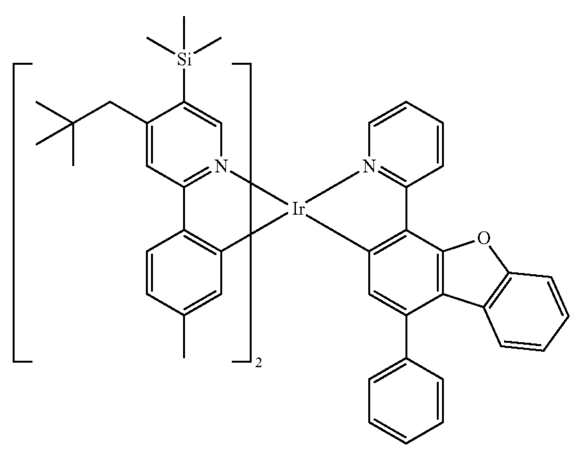

1562
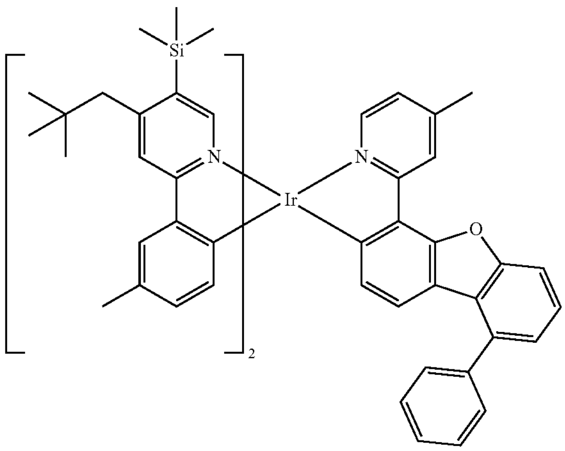
1563
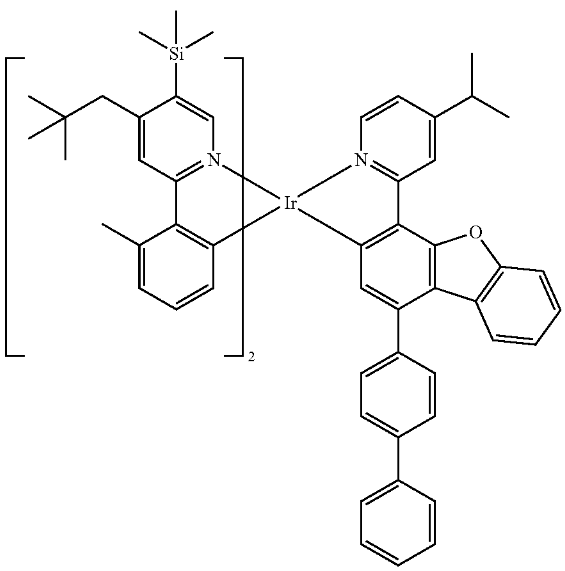
1564
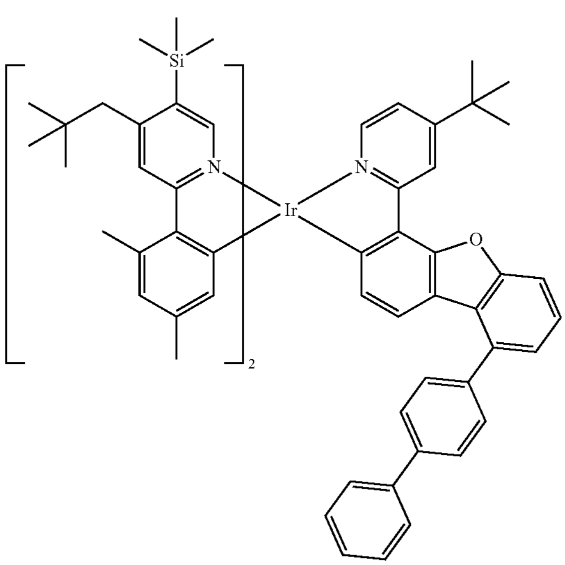
1565
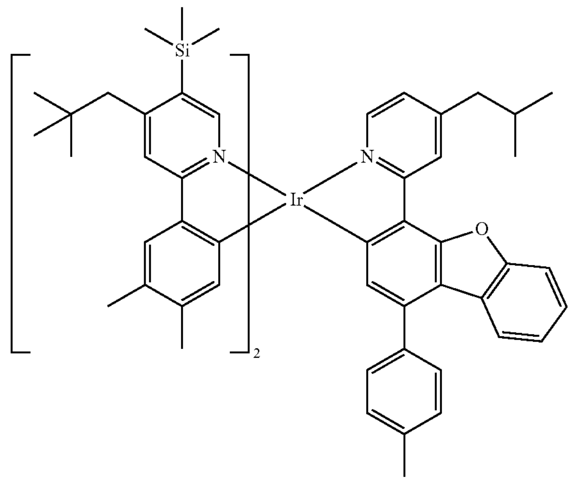
1566
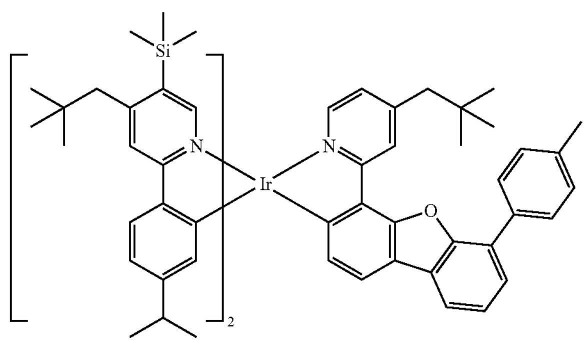
1567
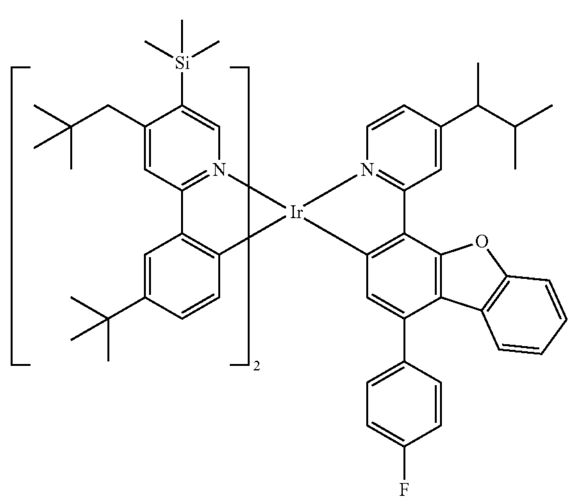

-continued
1568
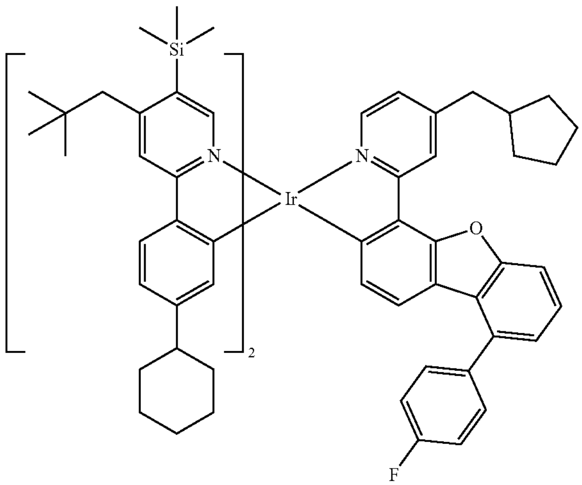
1569
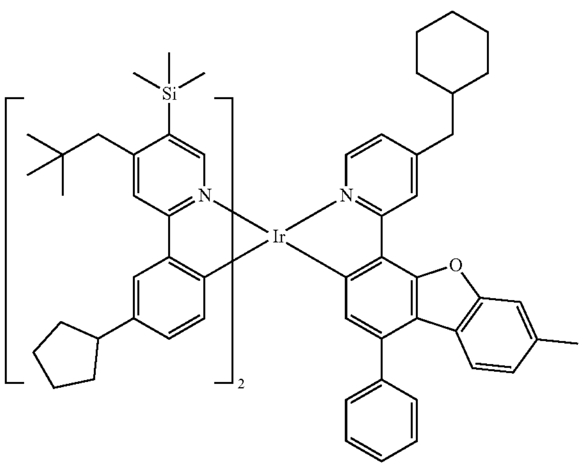
1570
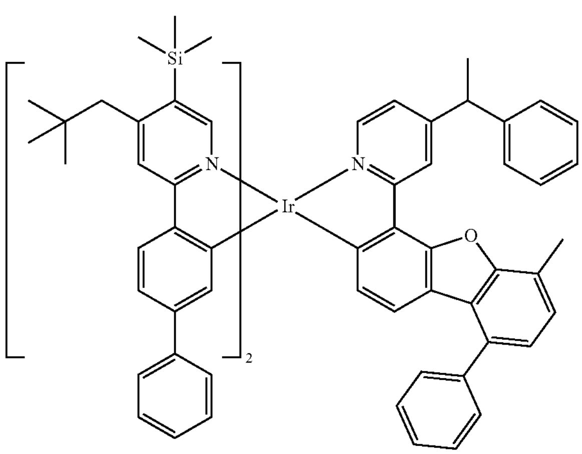
-continued
1571
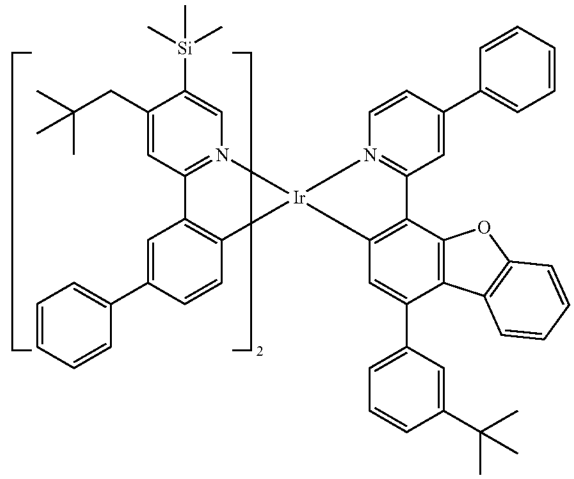
1572
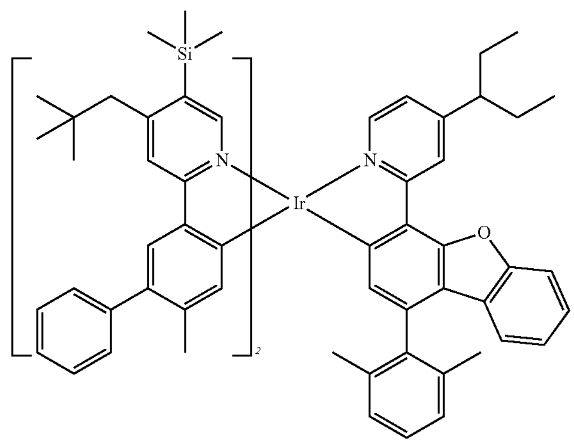
1572
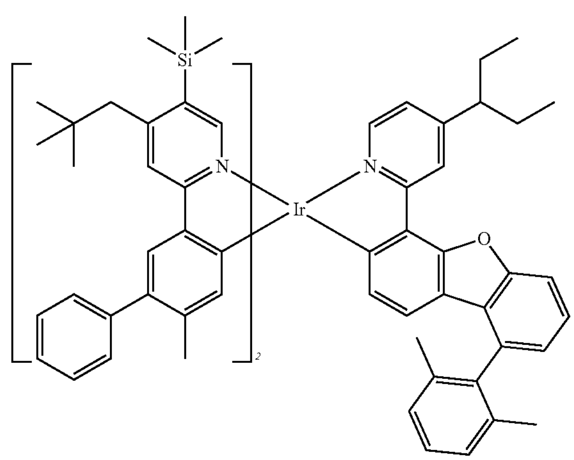

-continued
1573
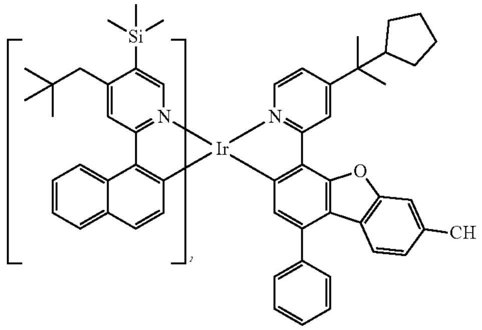
1574
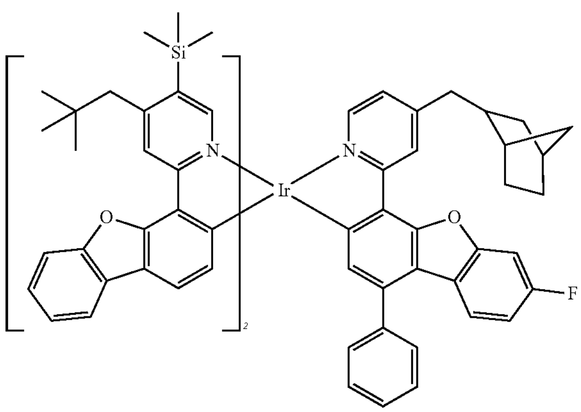
1575
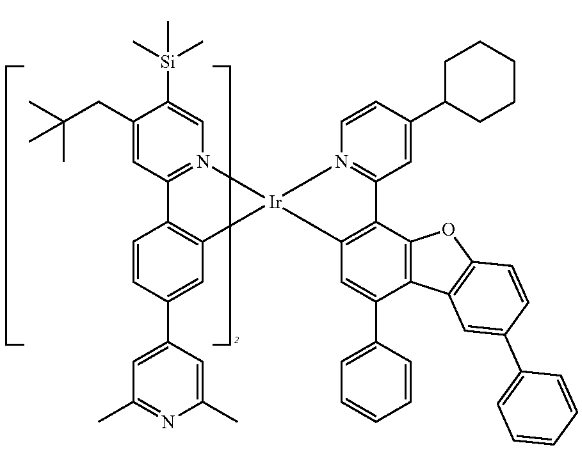
-continued
1576
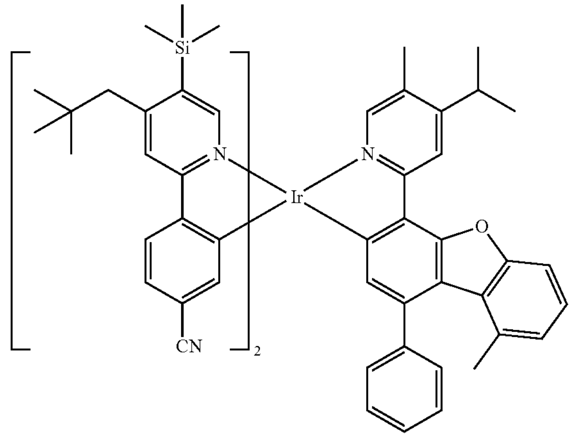
1577
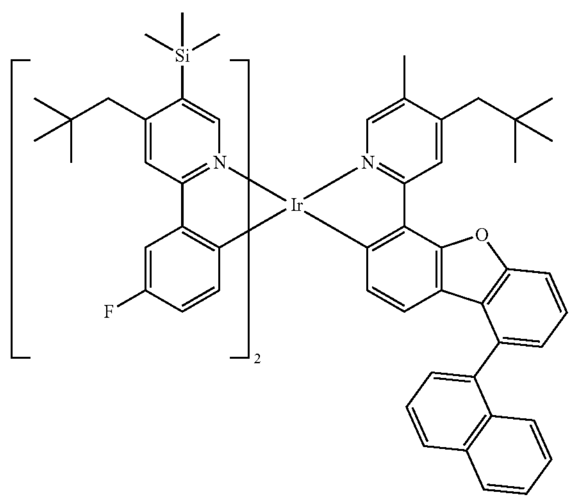
1578
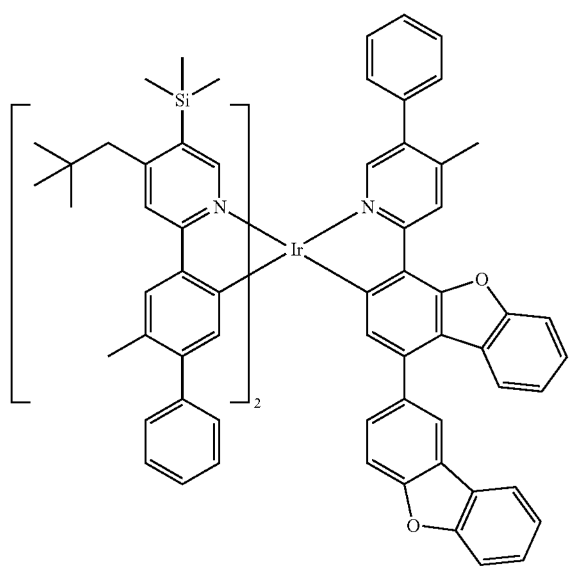

-continued
1579
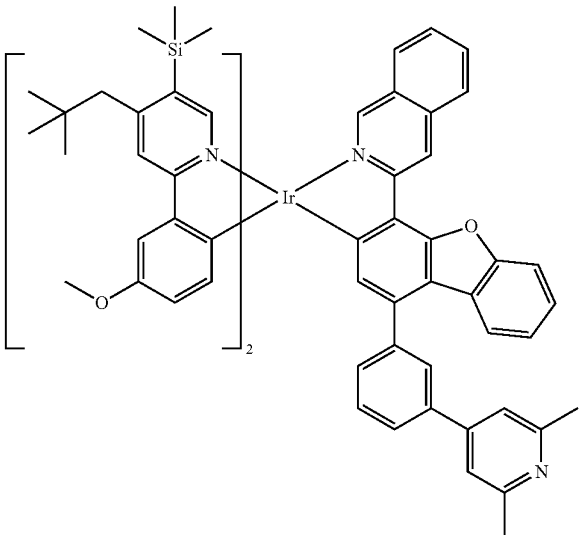
1580
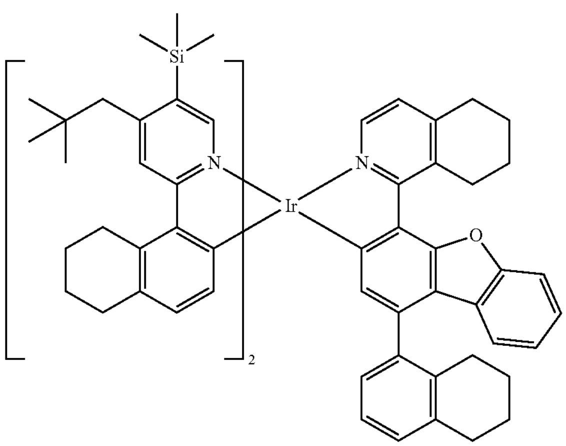
1581
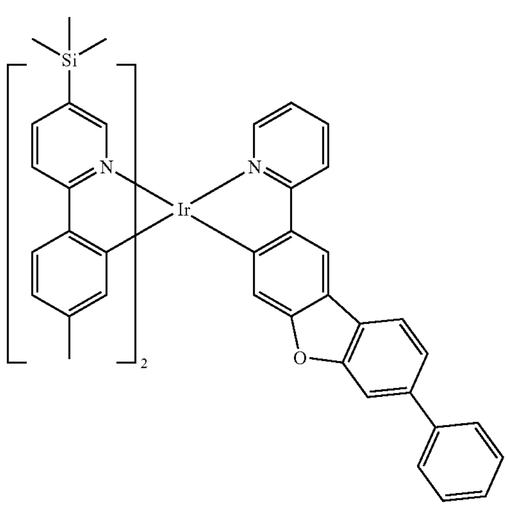
-continued
1582
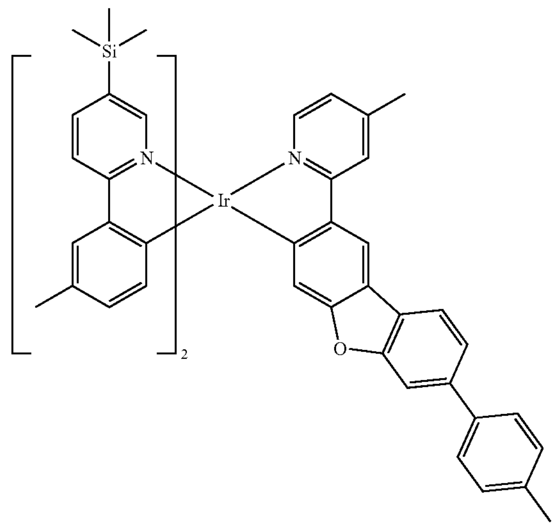
1583
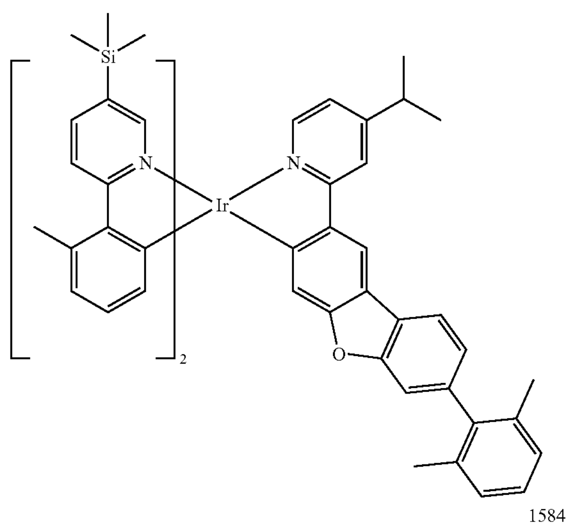
1584
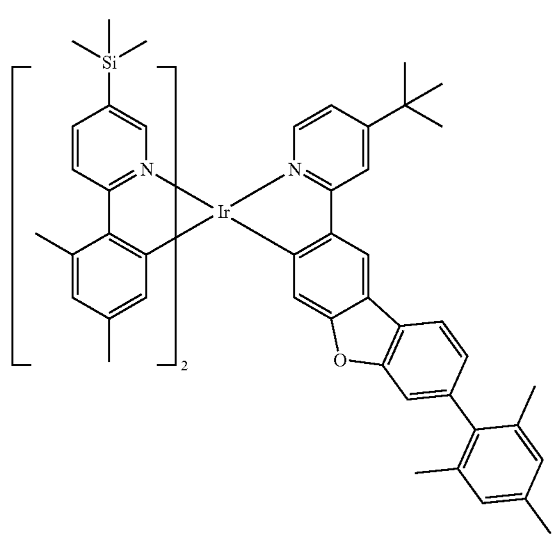

1585
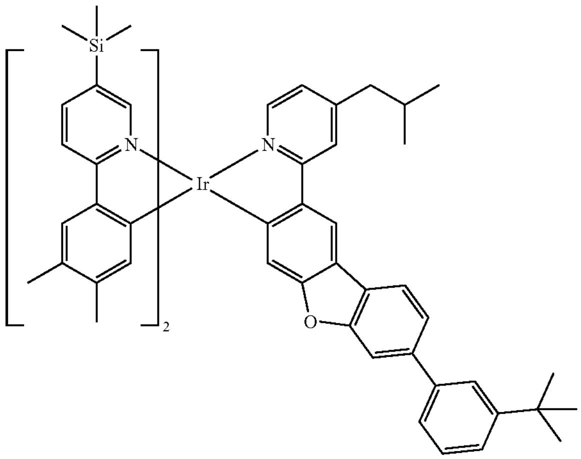
1586
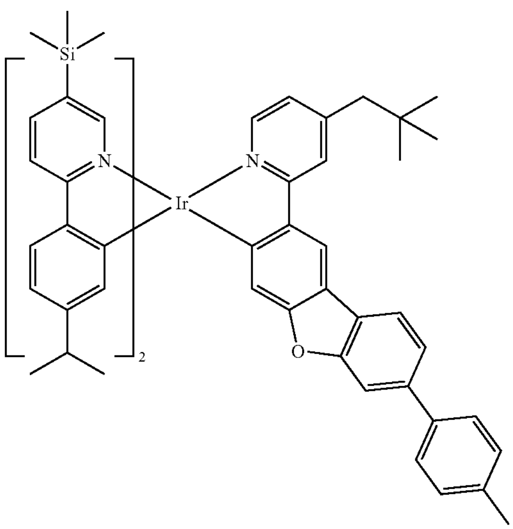
1587
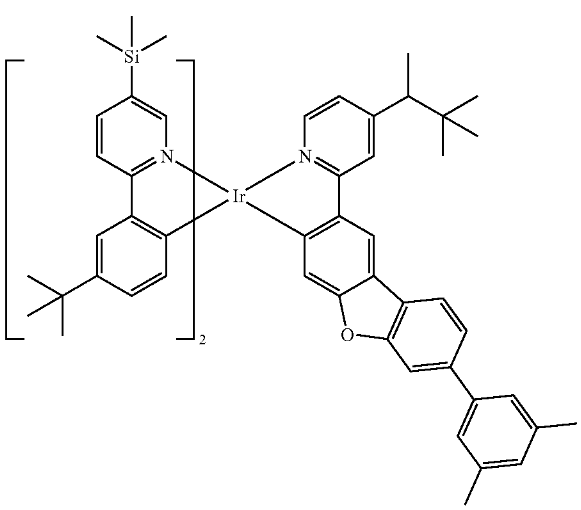
-continued
1588
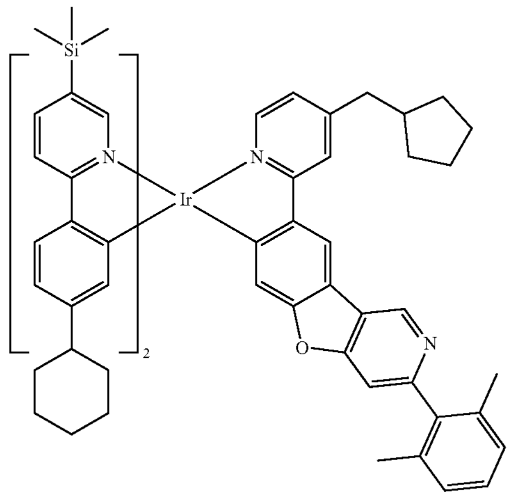
1589
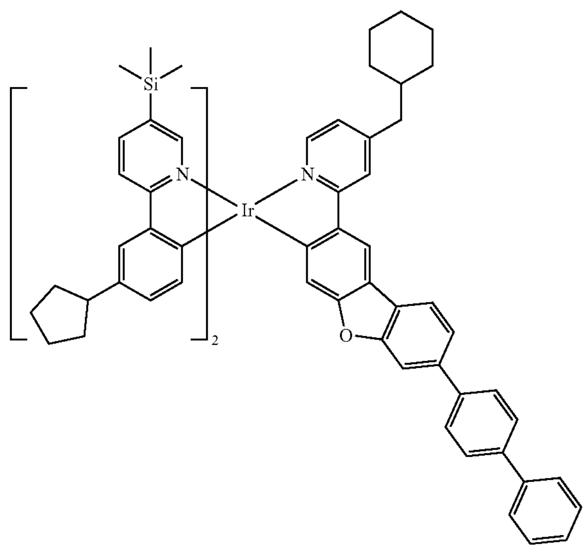
1590
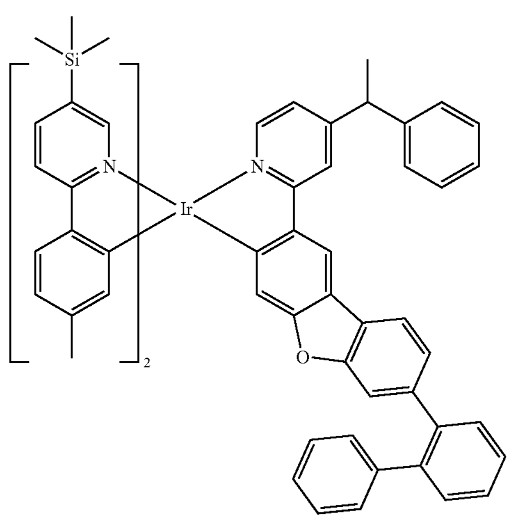

-continued
1591
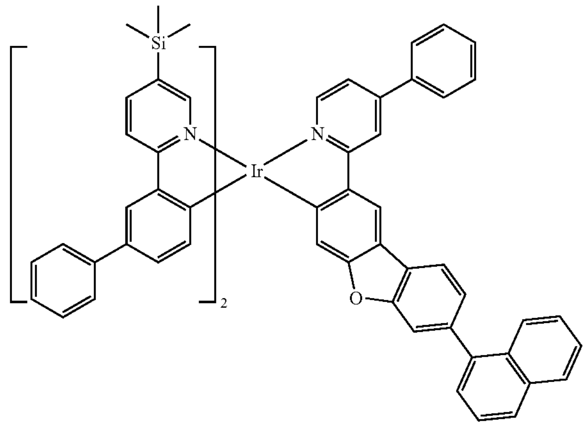
1592
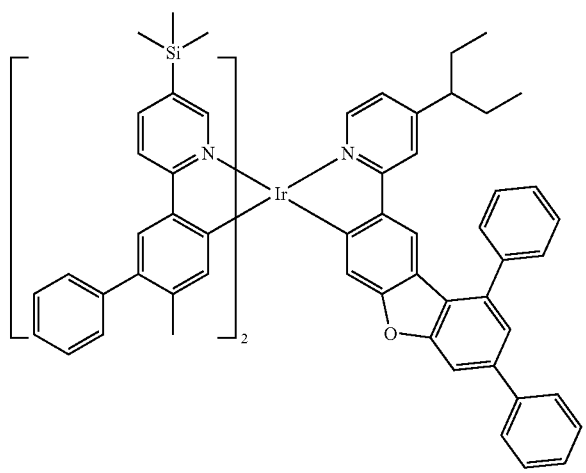
1593
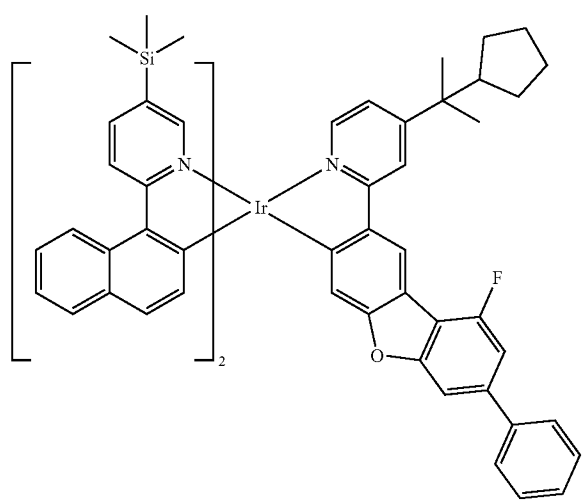
-continued
1594
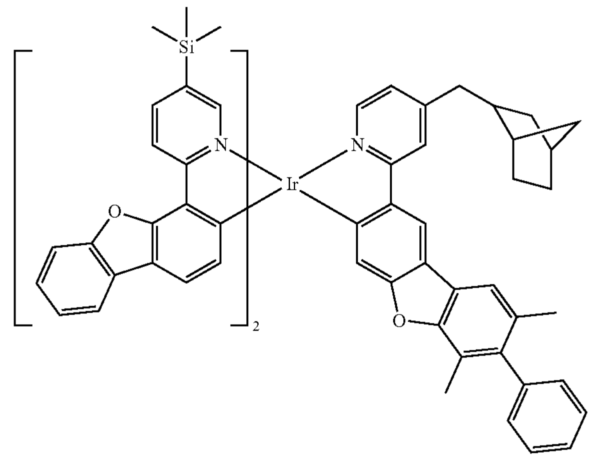
1595
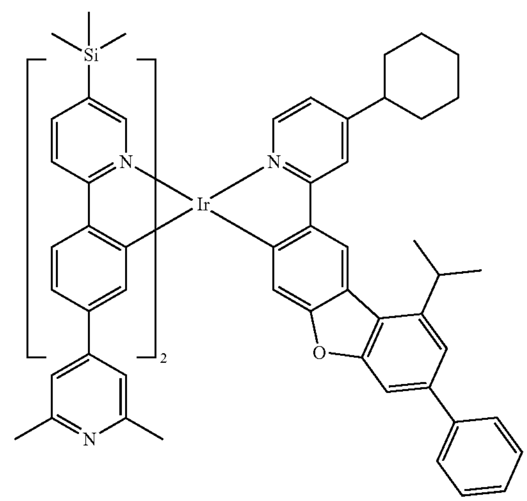
1596
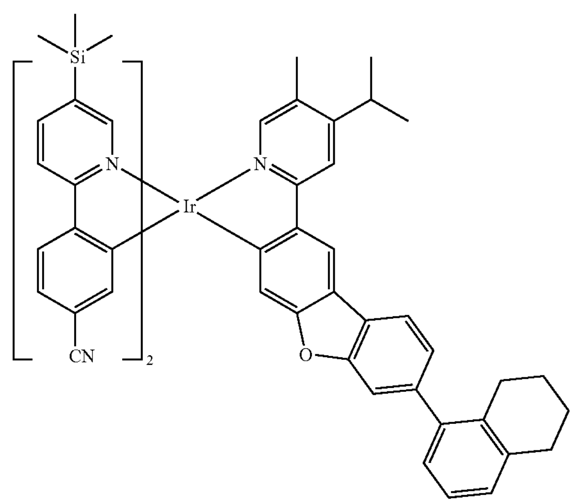

1597
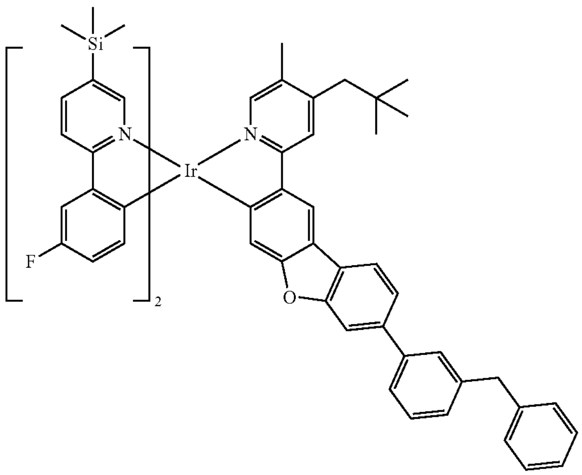
1598
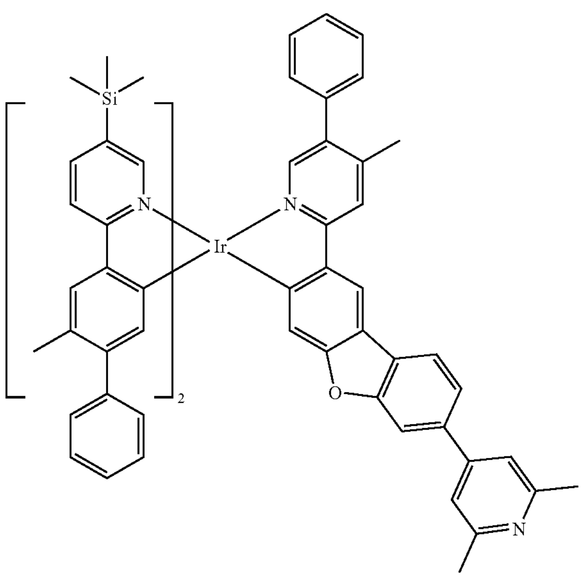
1599
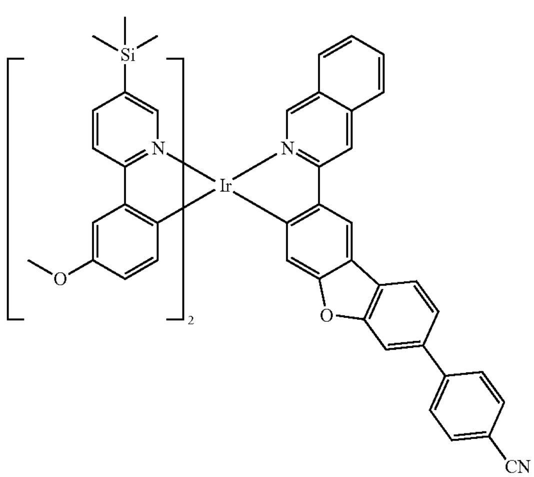
1600
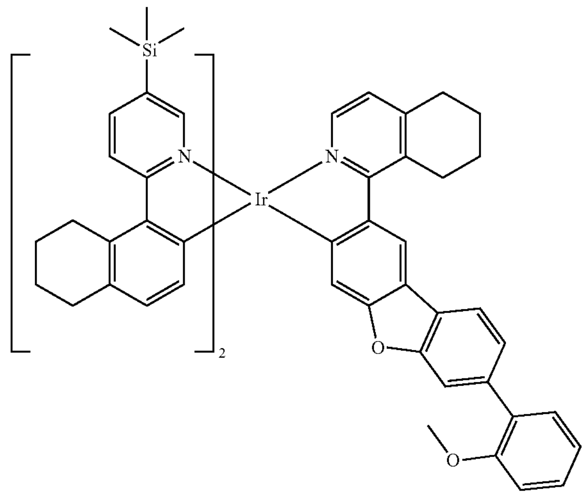
1601
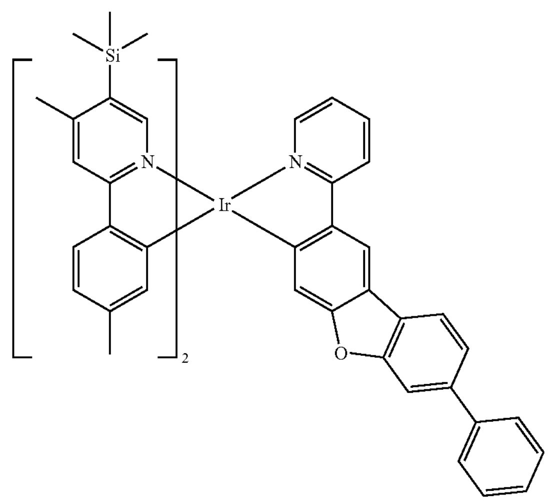
1602
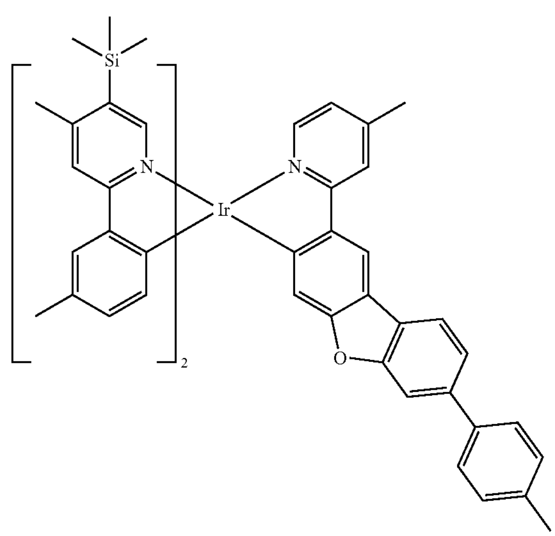

1603
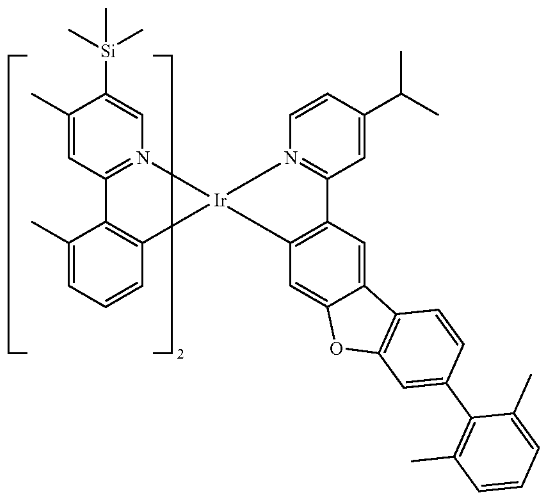
1604
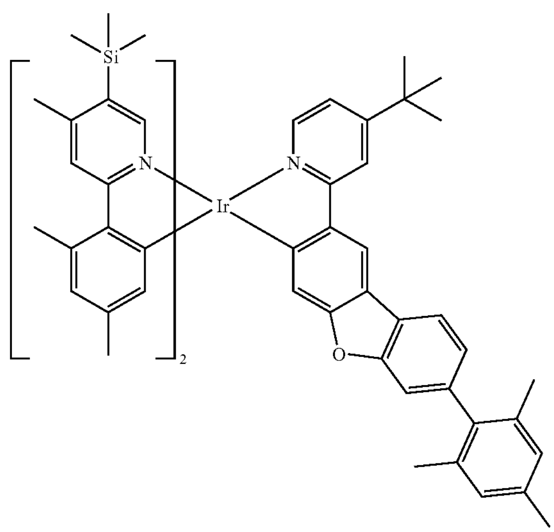
1605
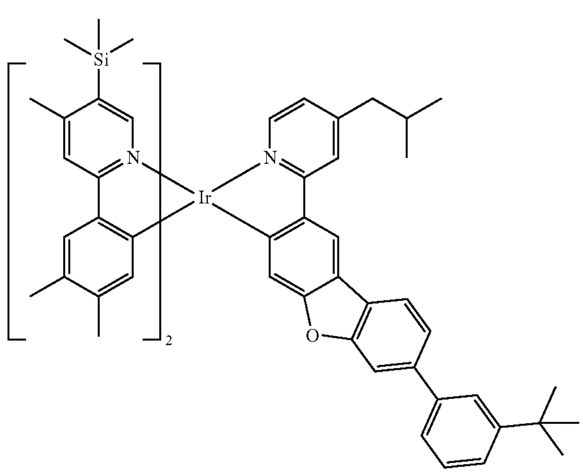
1606
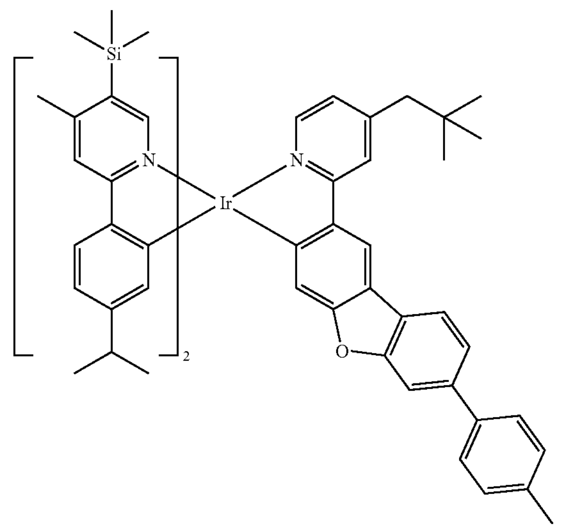
1607
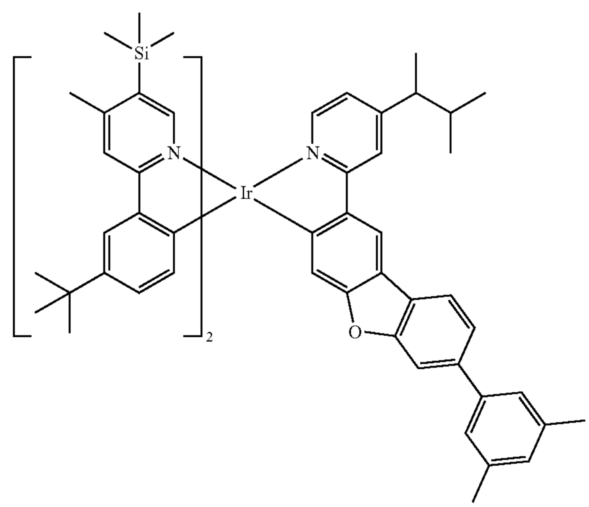
1608
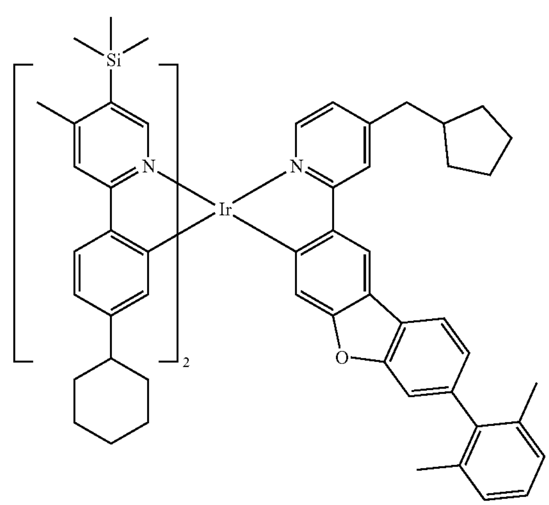

-continued
1609
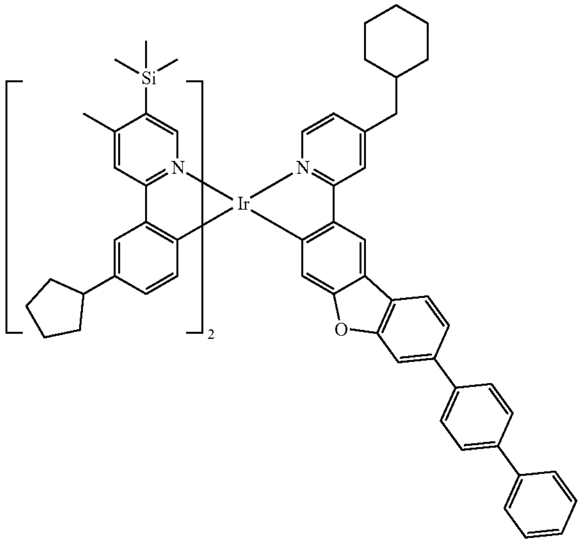
1610
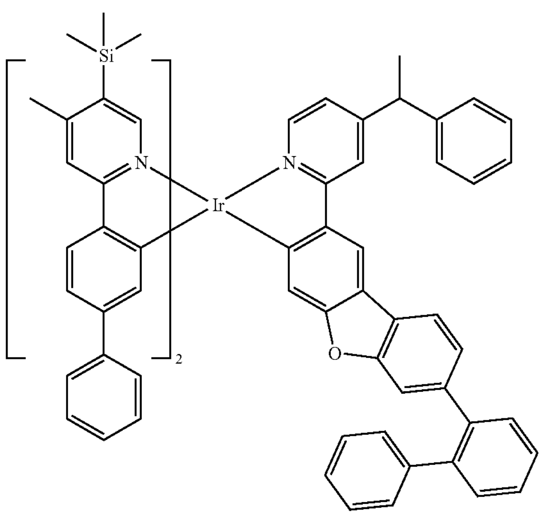
1611
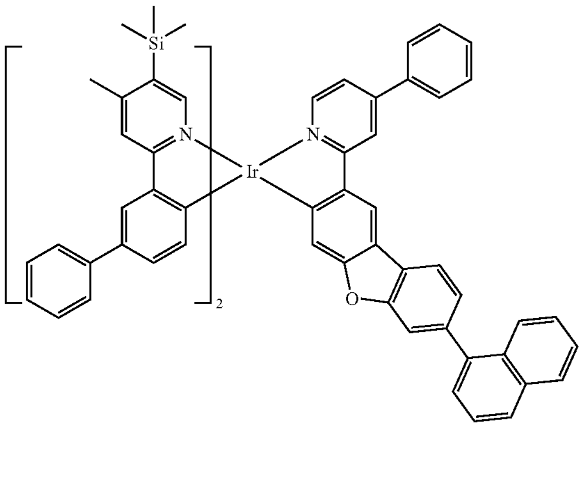
-continued
1612
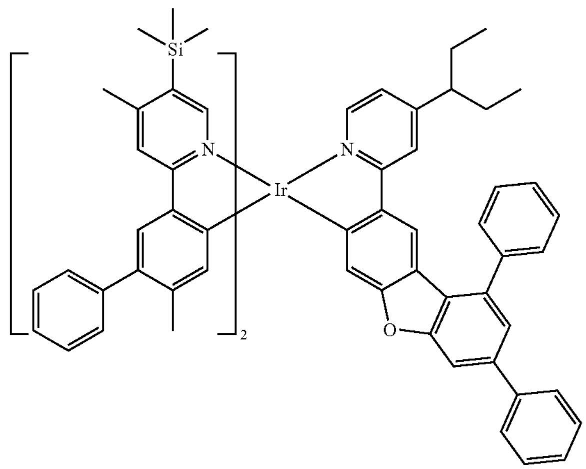
1613
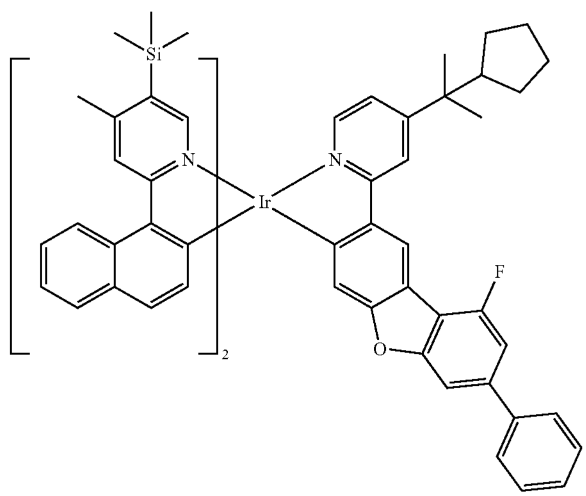
1614
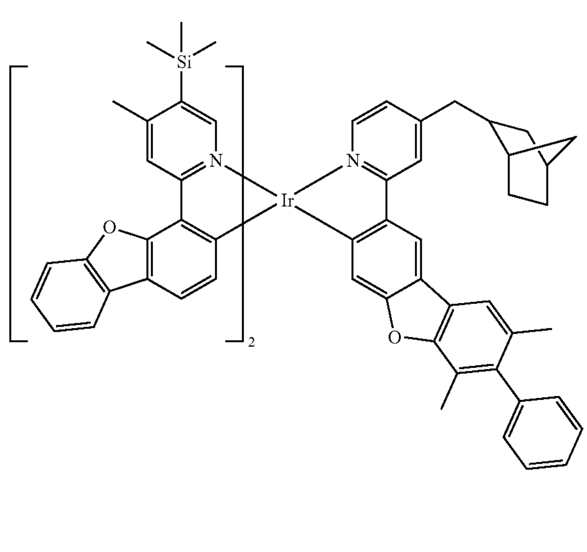

-continued
1615
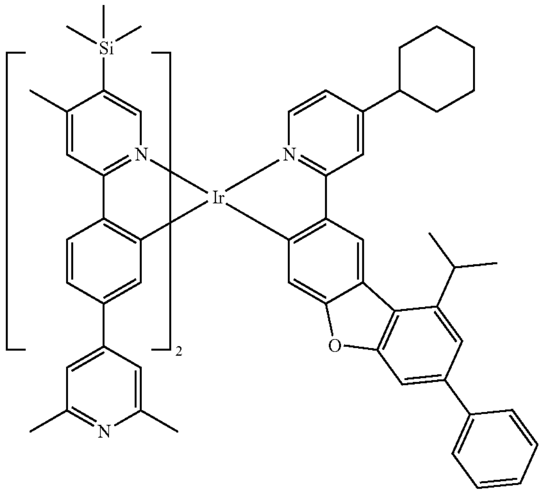
1616
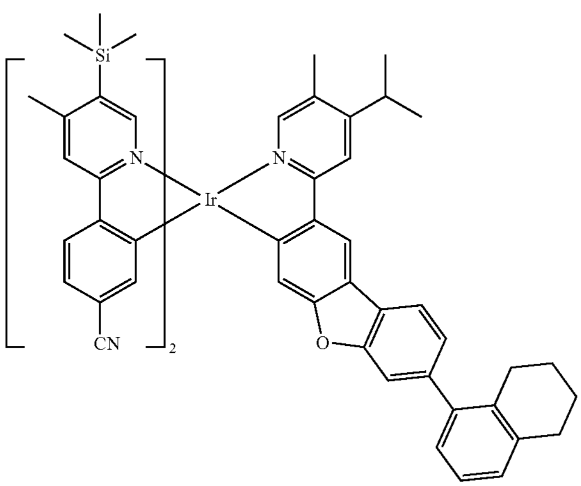
1617
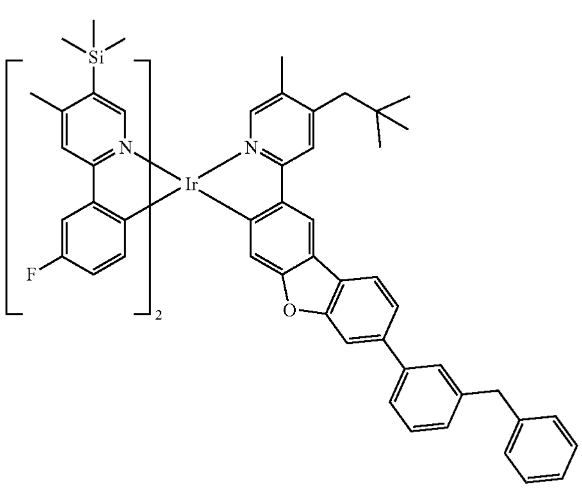
-continued
1618
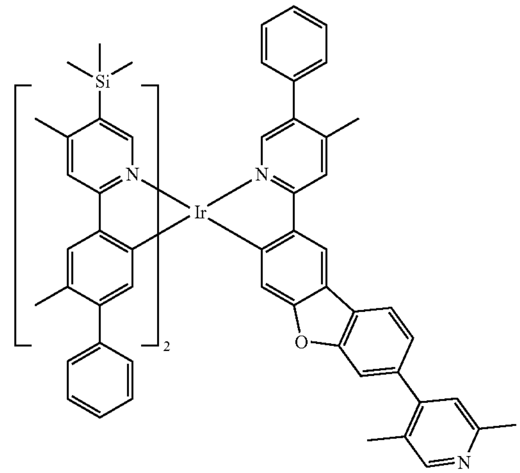
1619
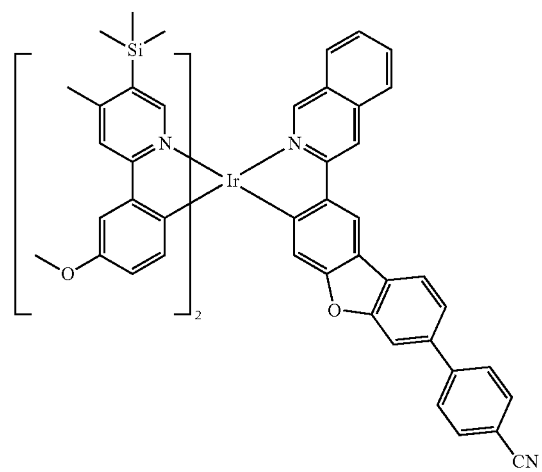
1620
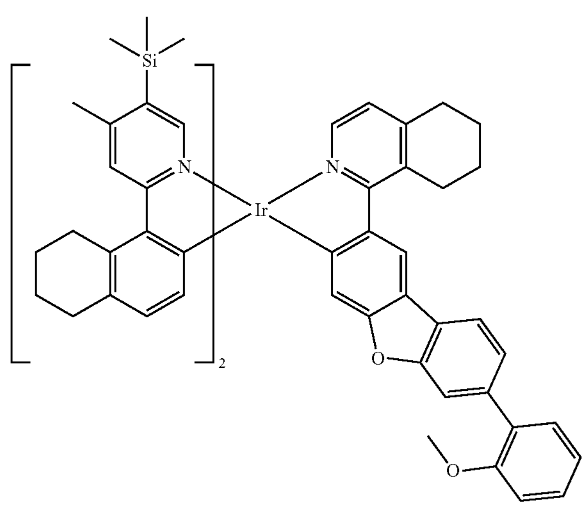

1621
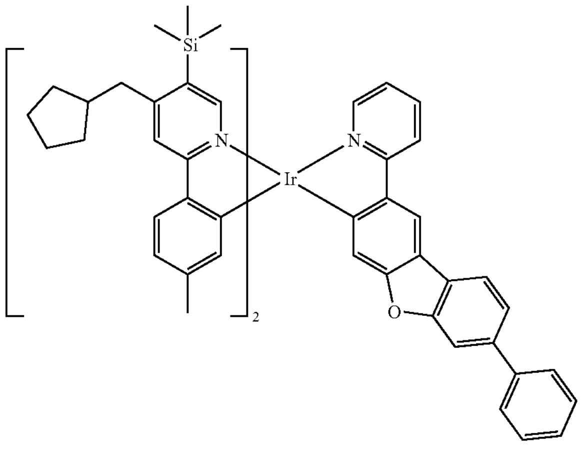
1622
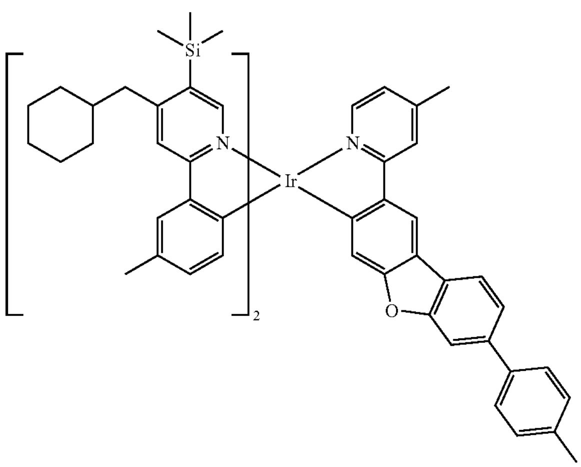
1623
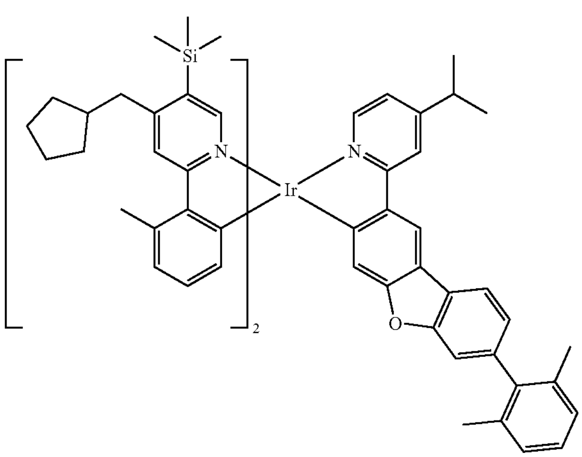
1624
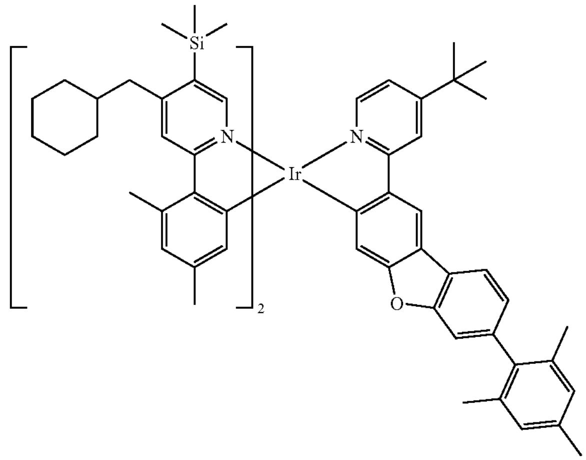
1625
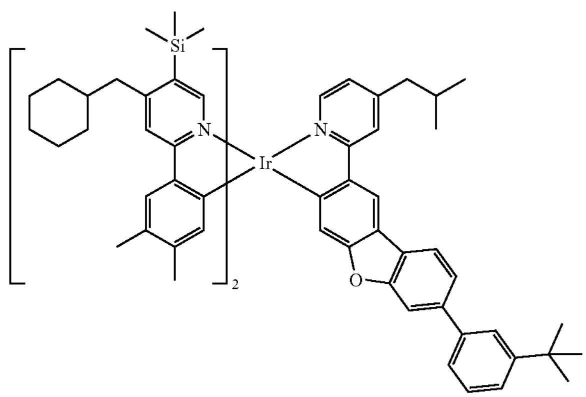
1626
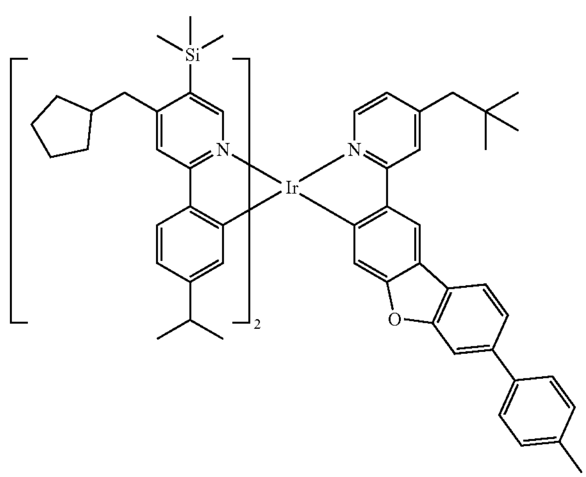

-continued
1627
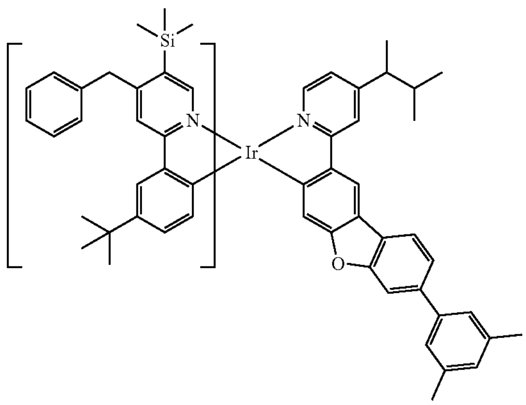
1628
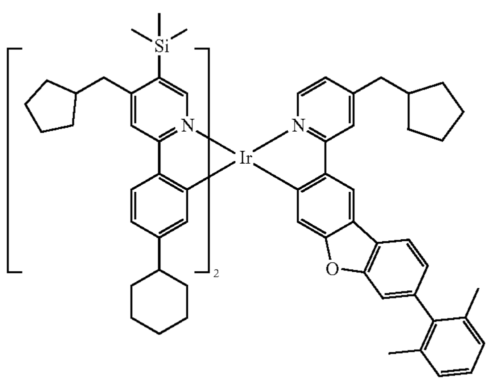
1629
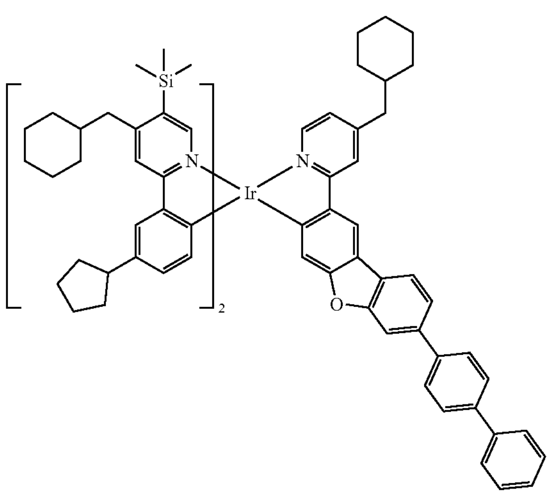
-continued
1630
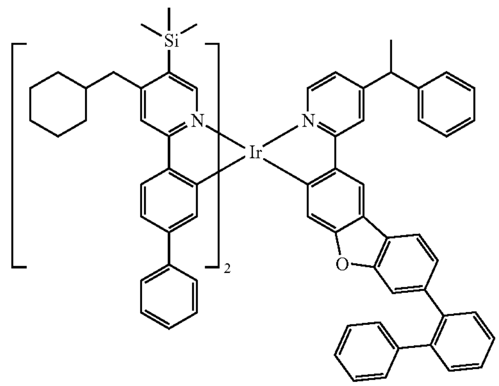
1631
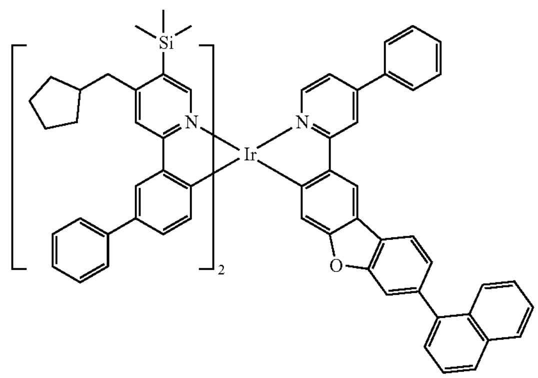
1632
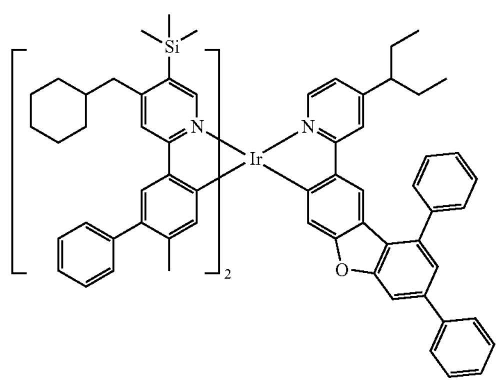
1633
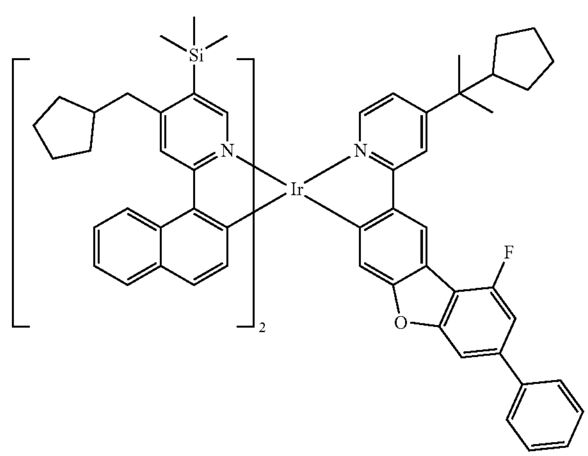

-continued
1634
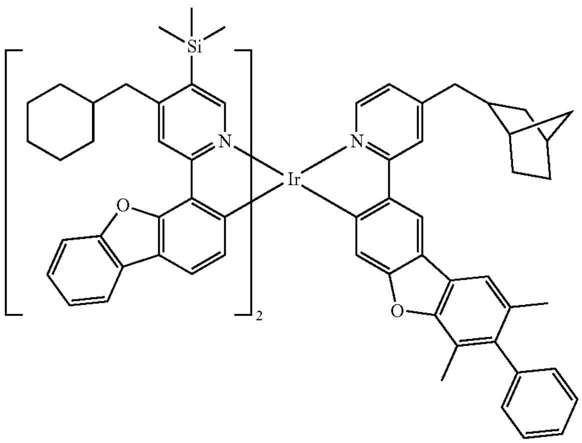
1635
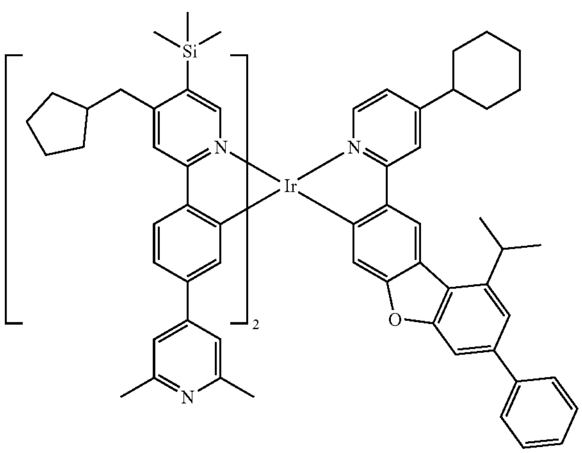
1636
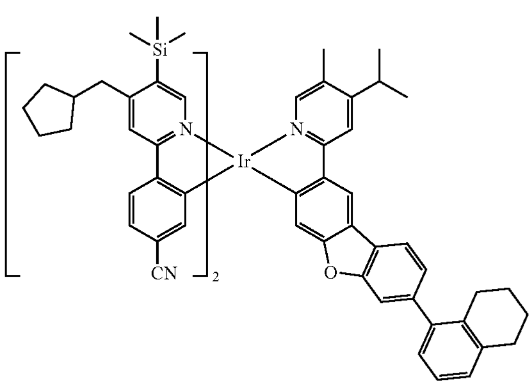
-continued
1637
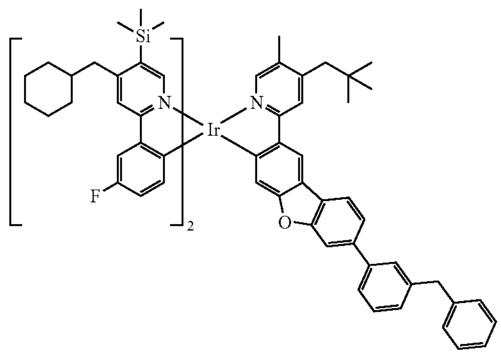
1638
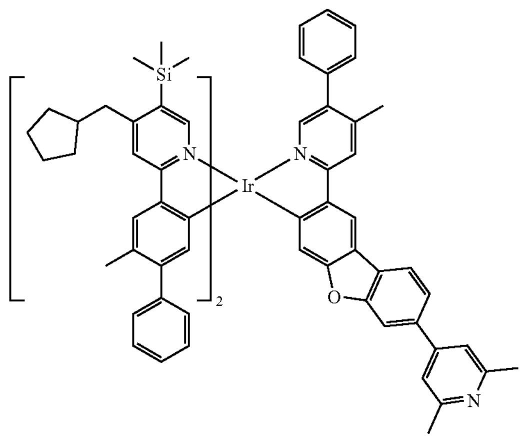
1639
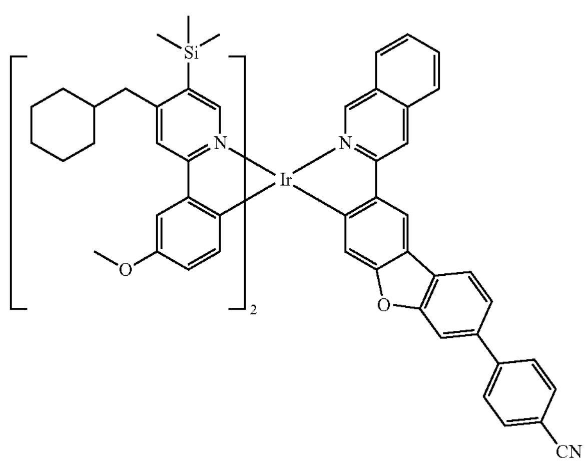

-continued
1640
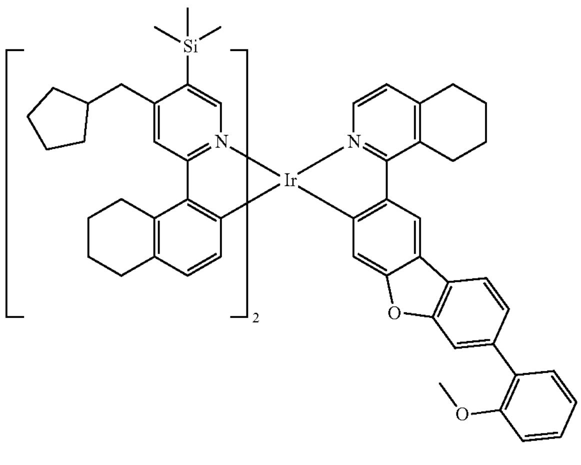
1641
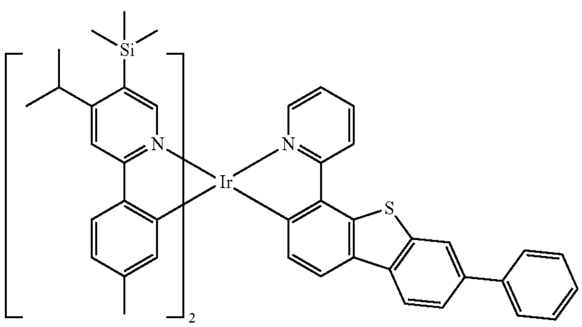
1642
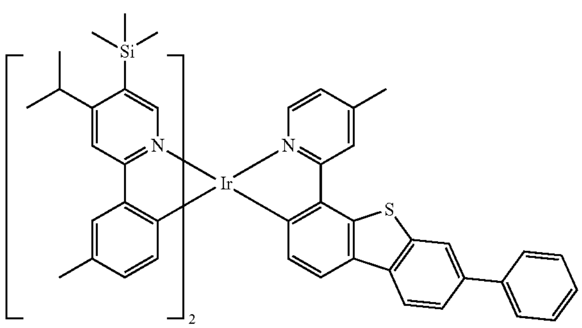
1643
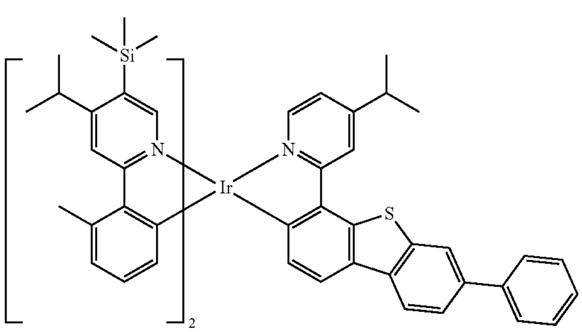
-continued
1644
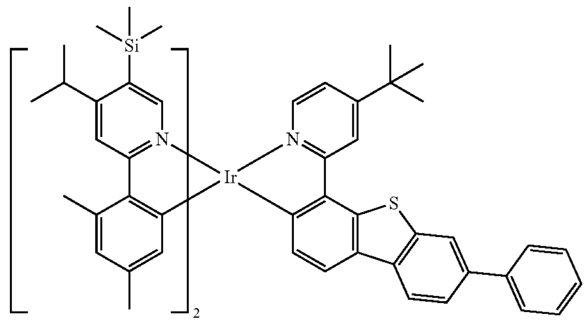
1645
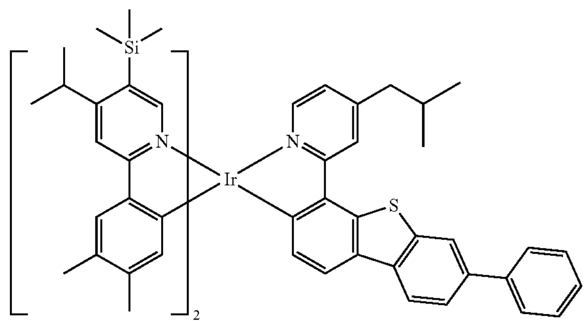
1646
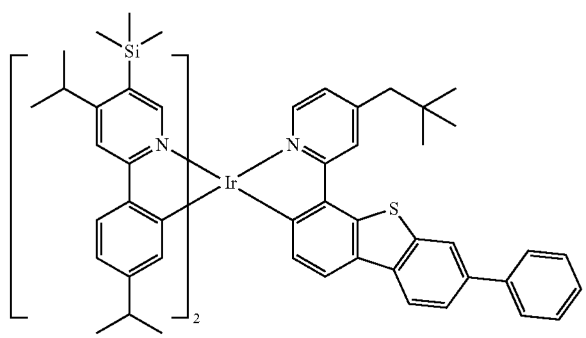
1647
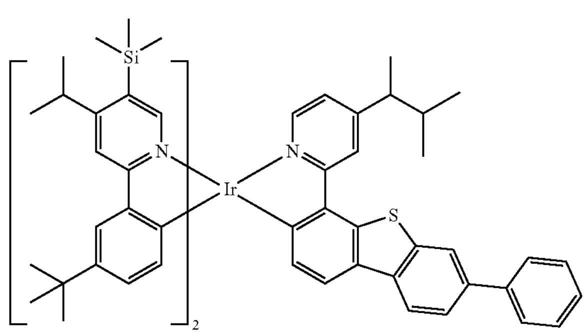

1648
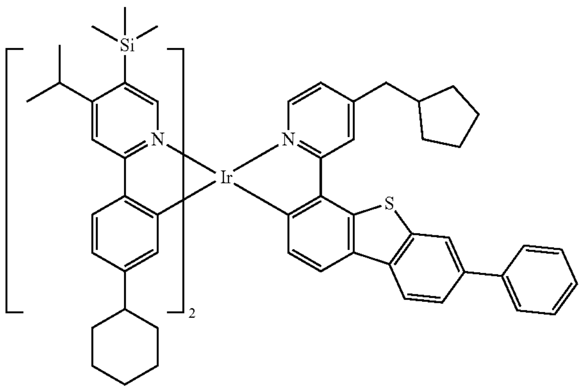
1649
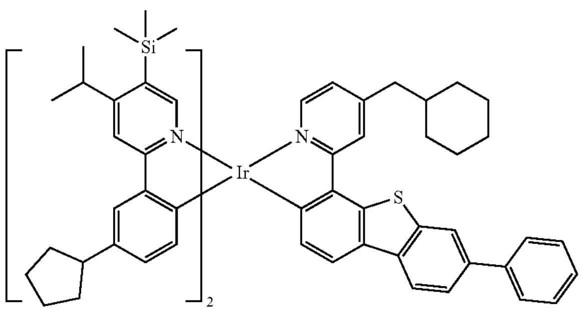
1650
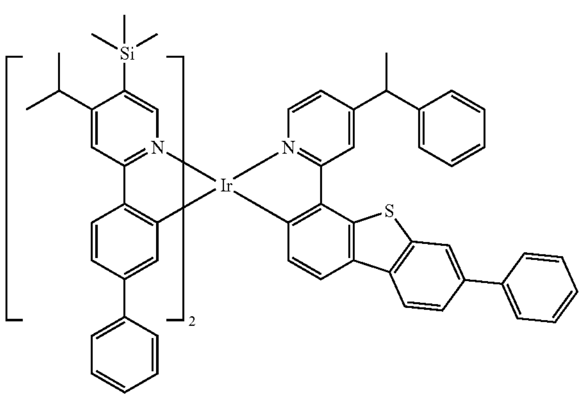
1651
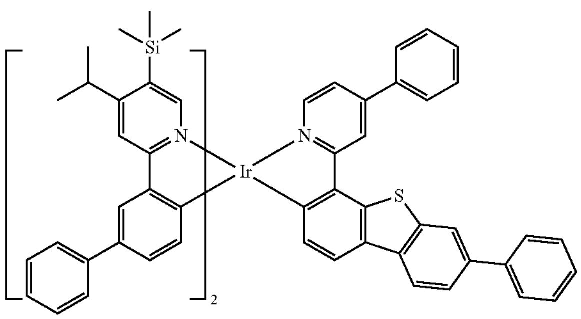
1652
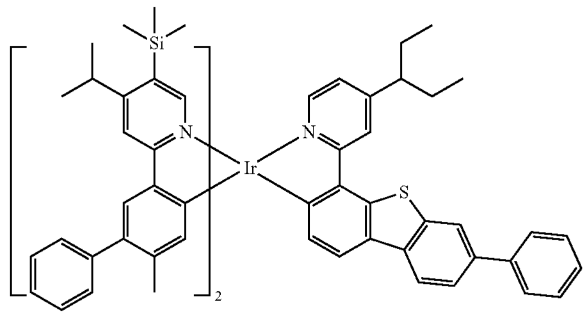
1653
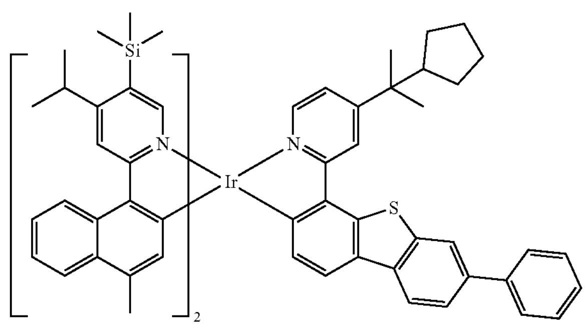
1654
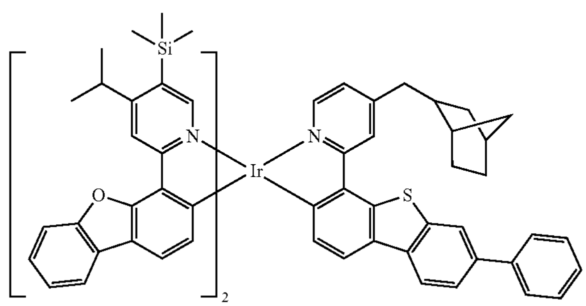
1655
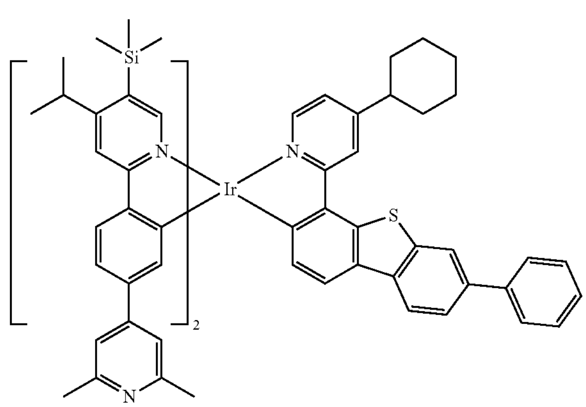

-continued
1656
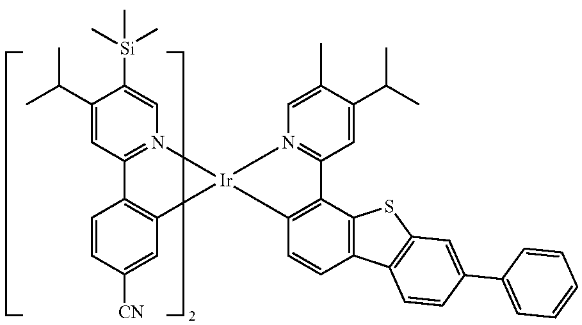
1657
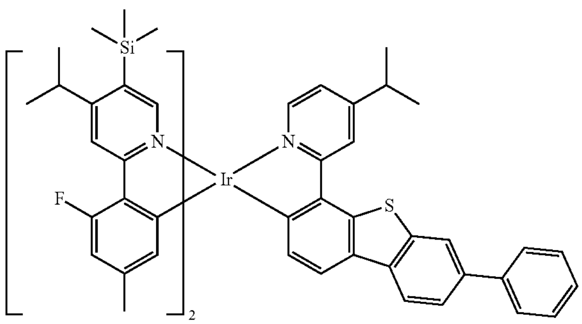
1658
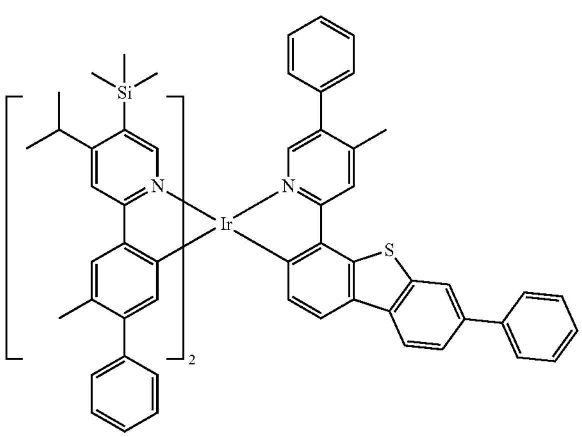
1659
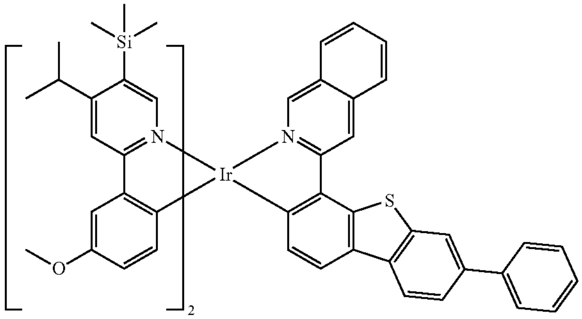
-continued
1660
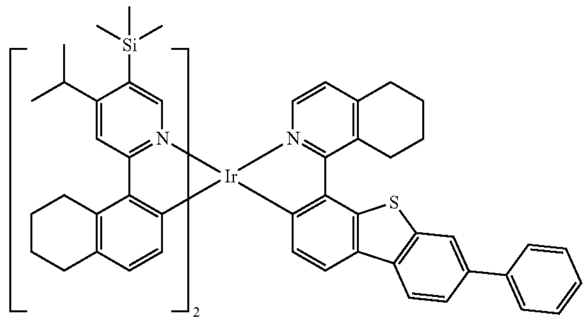
1661
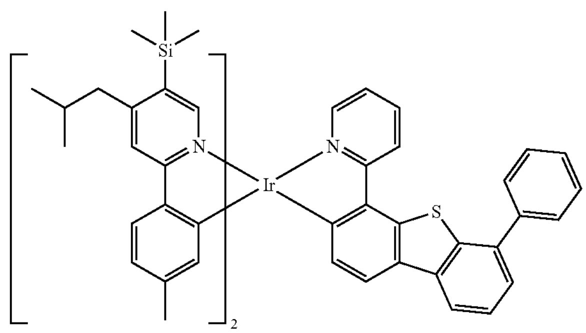
1662
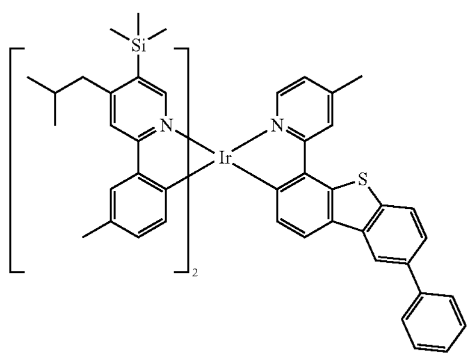
1663
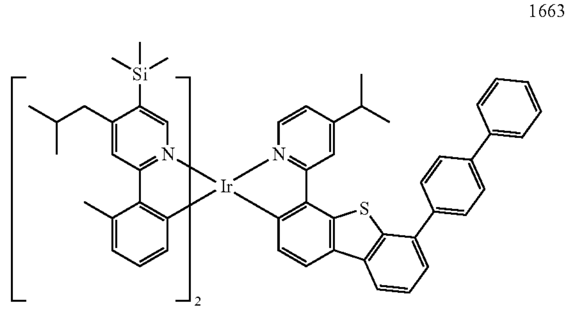

-continued
1664
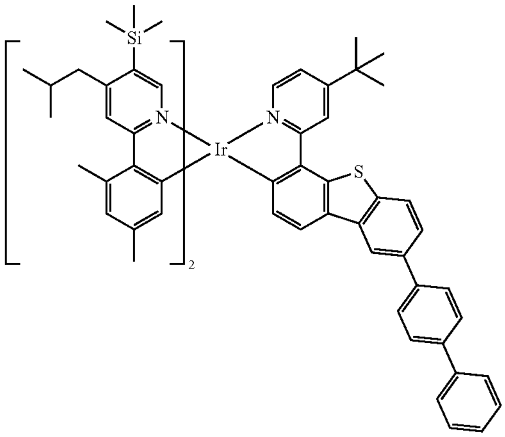
1665
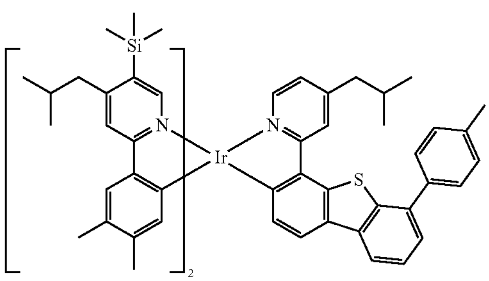
1666
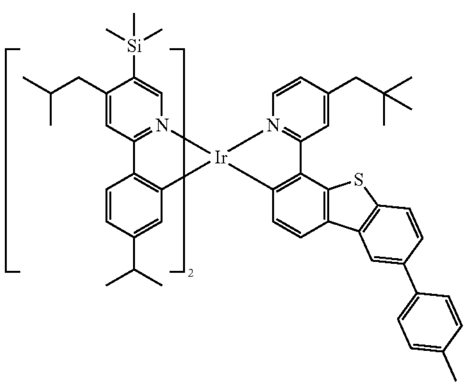
1667
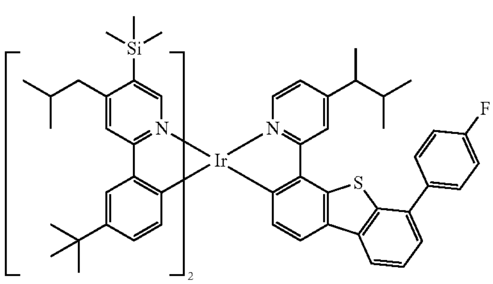
-continued
1668
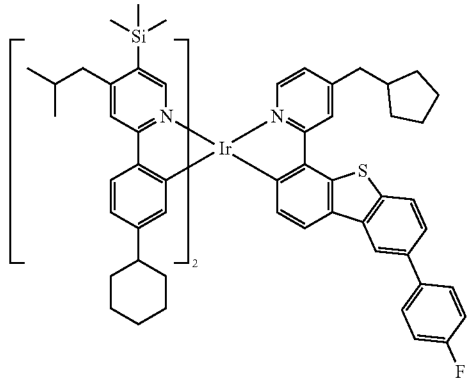
1669
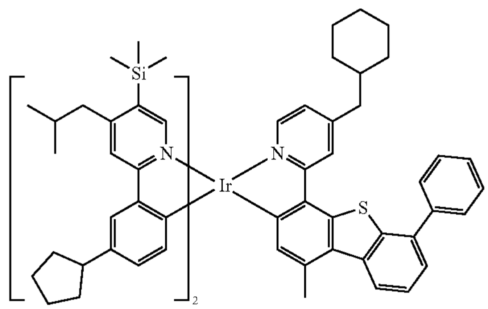
1670
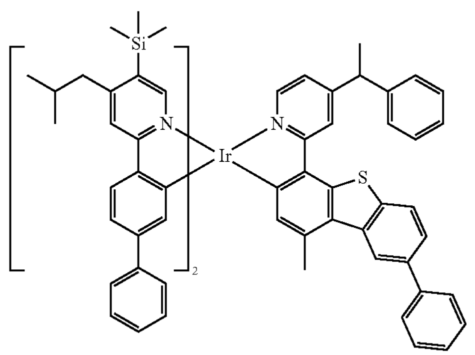
1671
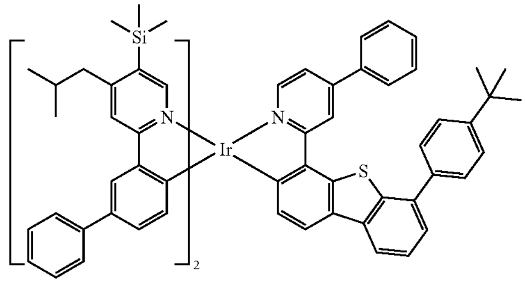

1672
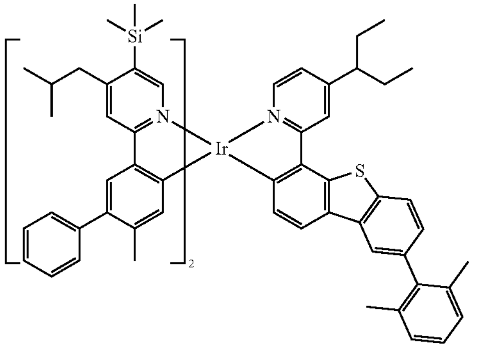
1673
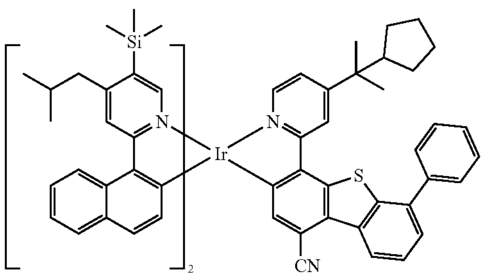
1674
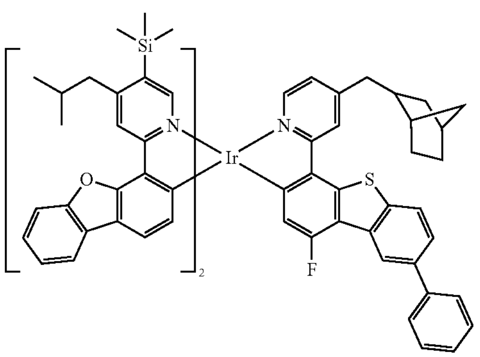
1675
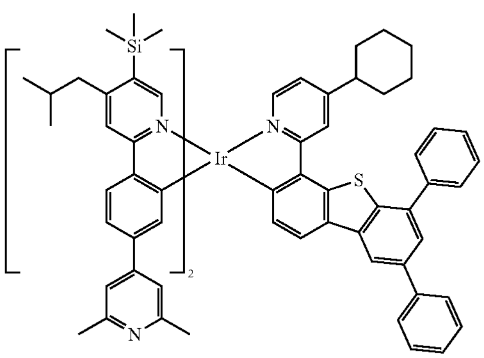
1676
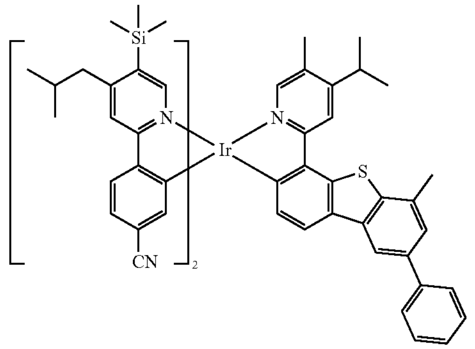
1677
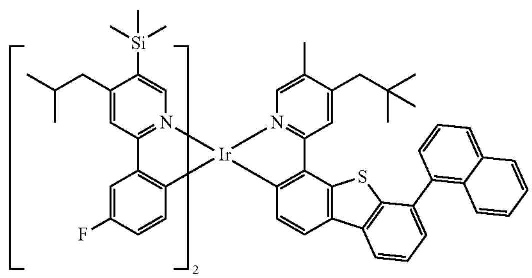
1678
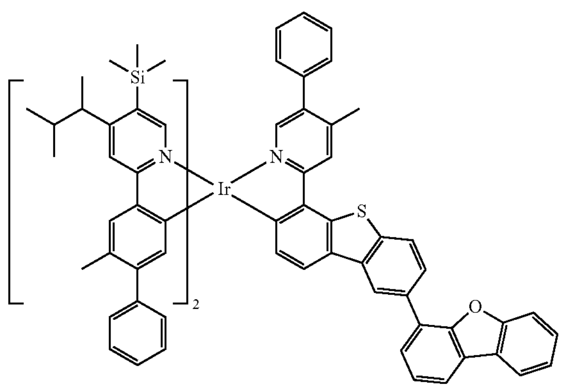
1679
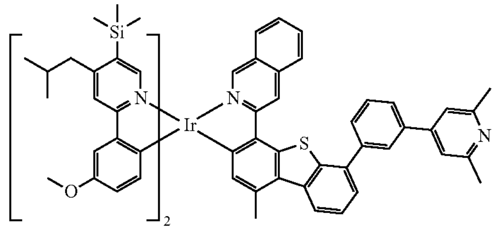

-continued
1680
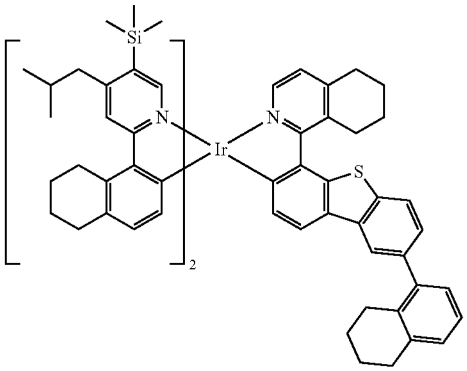
1681
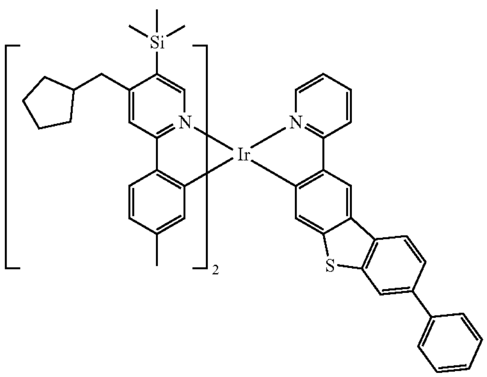
1682
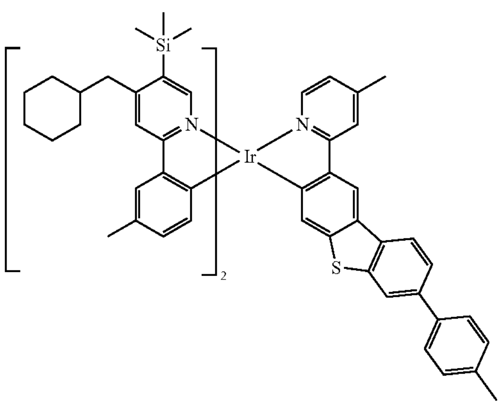
1683
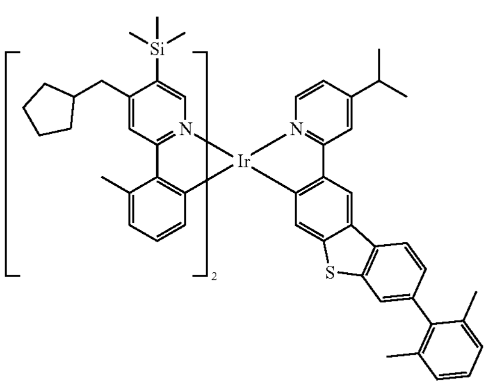
-continued
1684
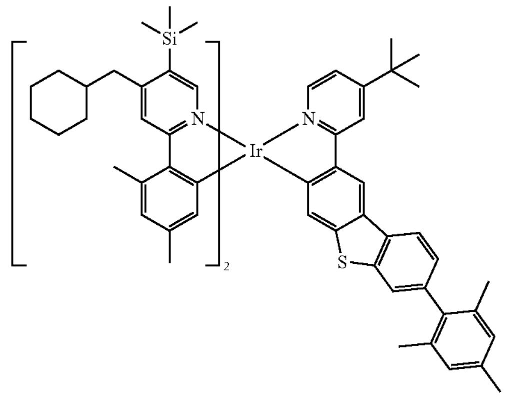
1685
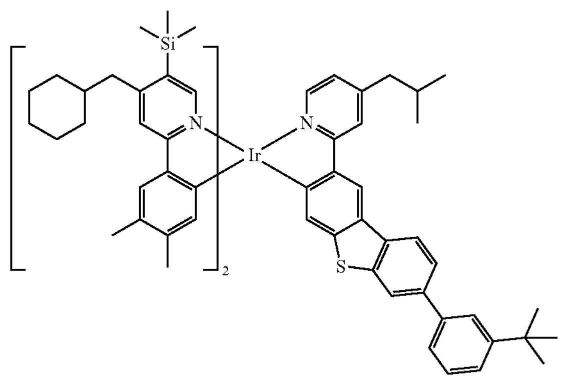
1686
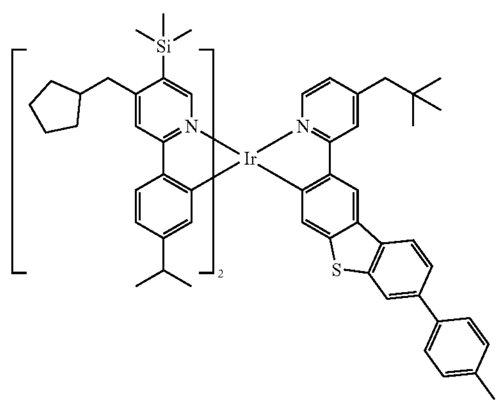
1687
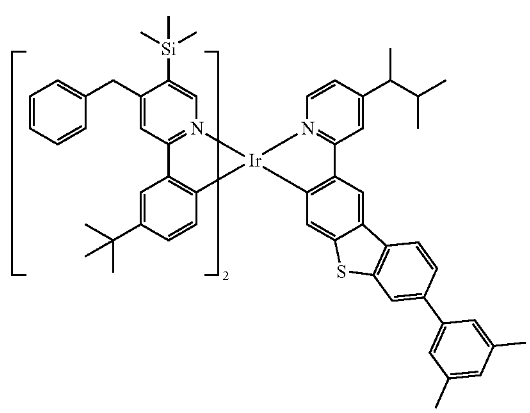

1688
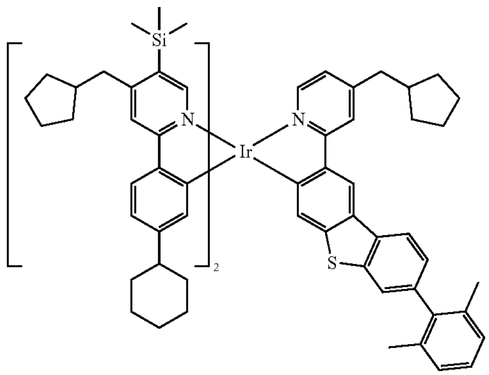
1689
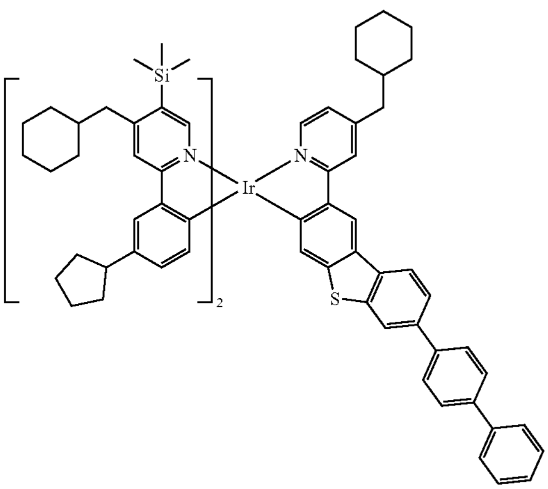
1690
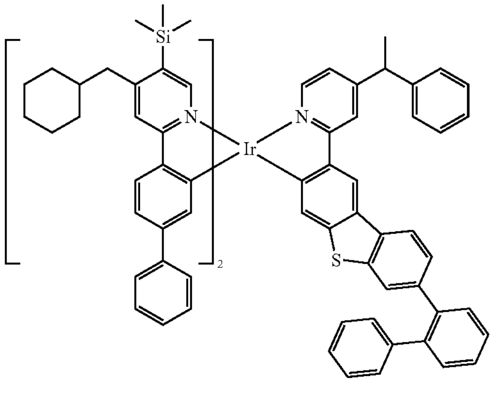
1691
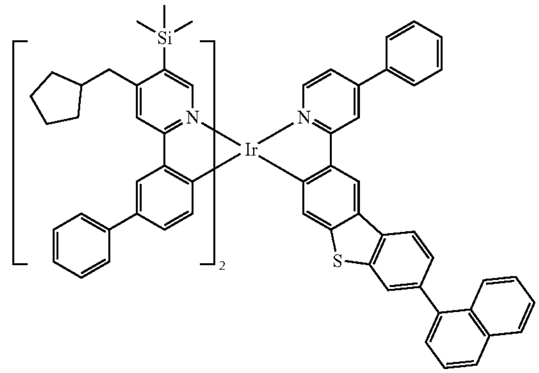
1692
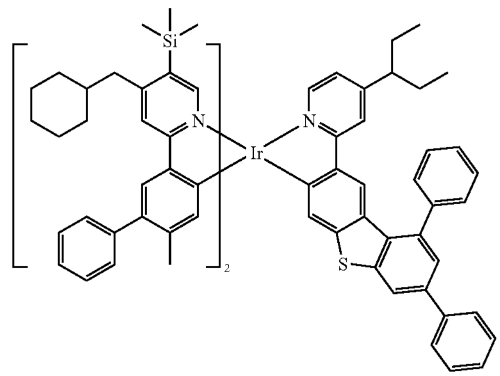
1693
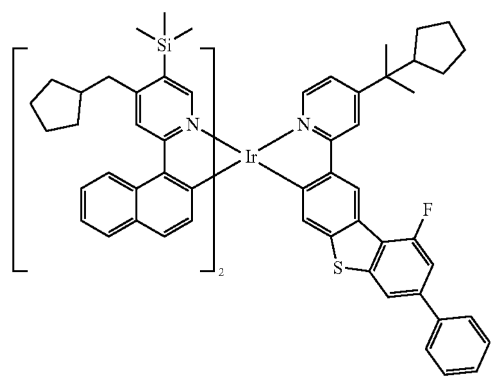
1694
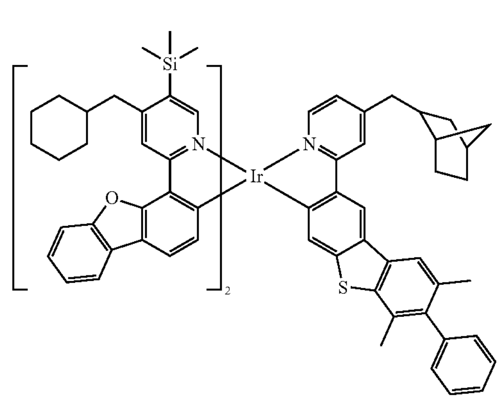

-continued
1695
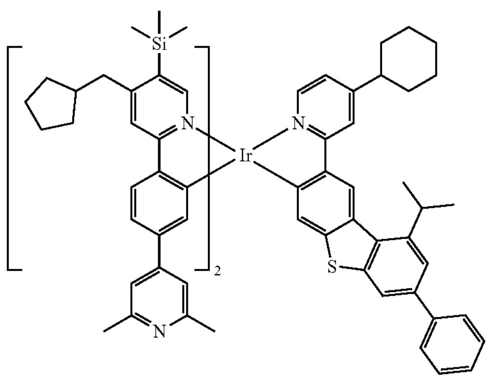
1696
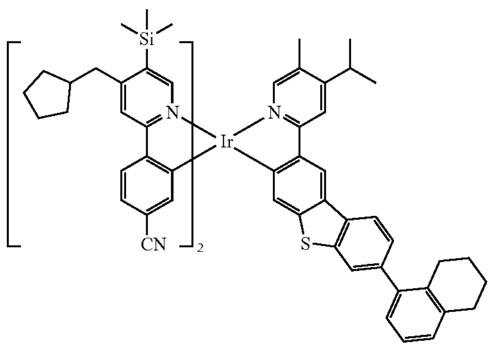
1697
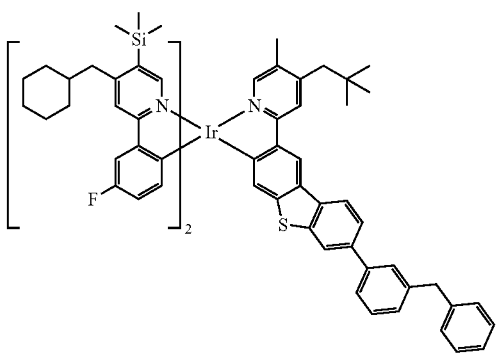
1698
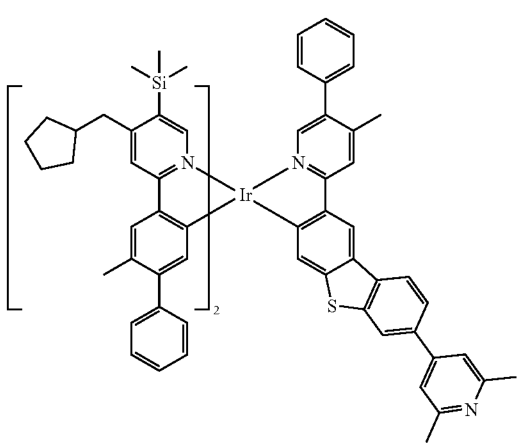
-continued
1699
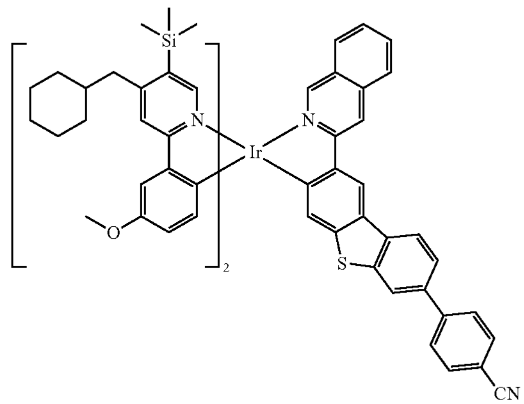
1700
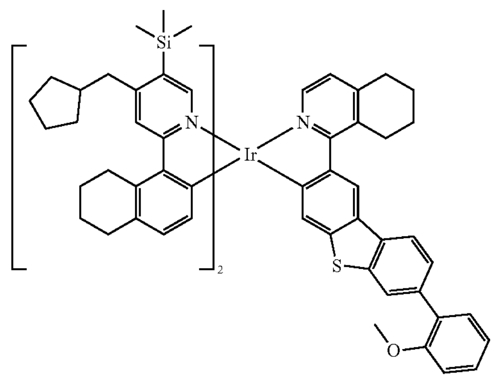
1701
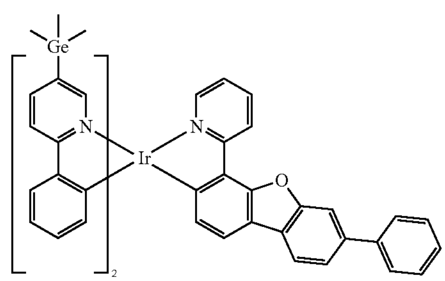
1702
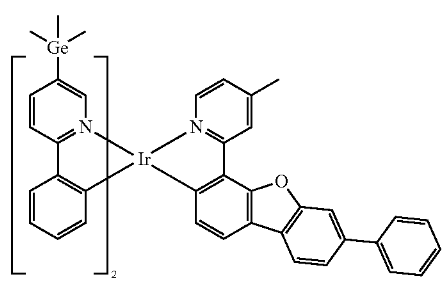
1703
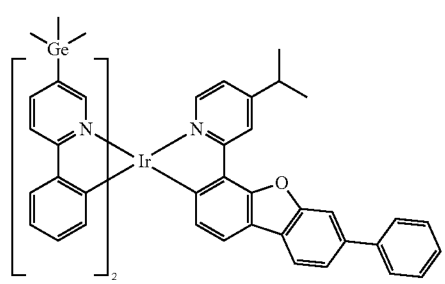

-continued
1704
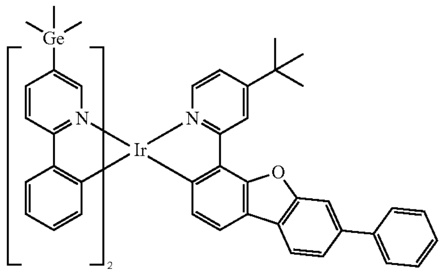
1705
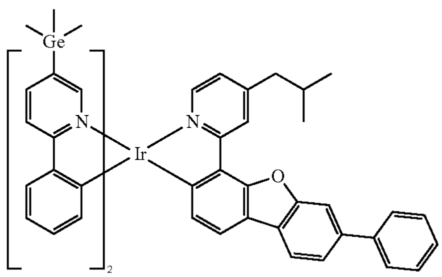
1706
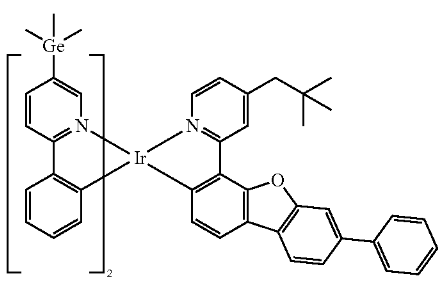
1707
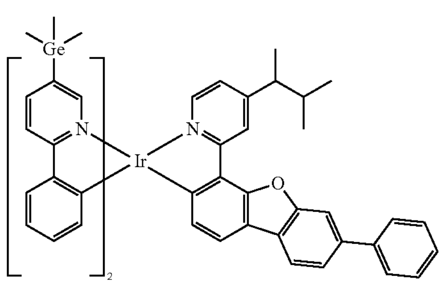
1708
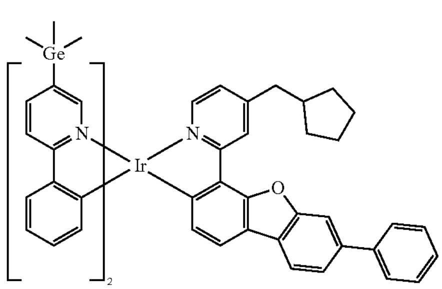
-continued
1709
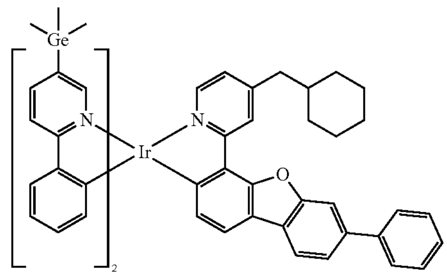
1710
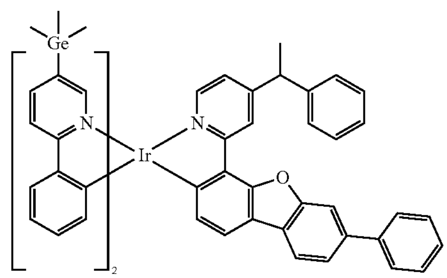
1711
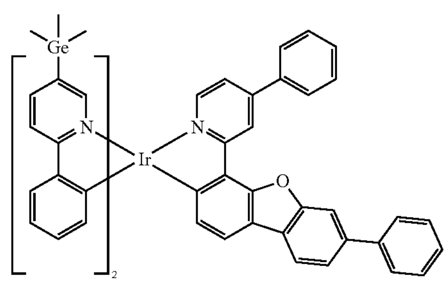
1712
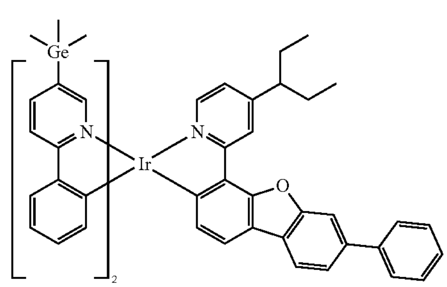
1713
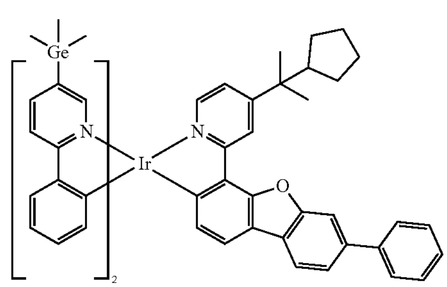

-continued
1714
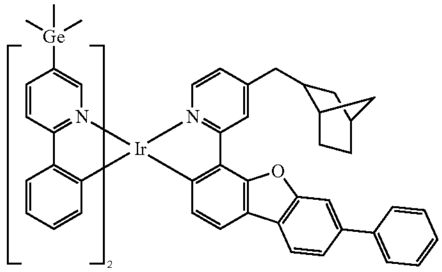
1715
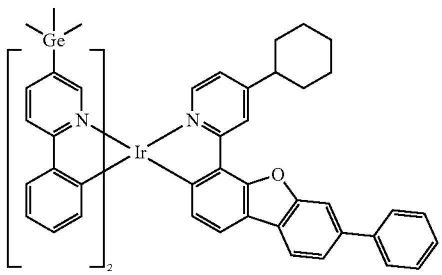
1716
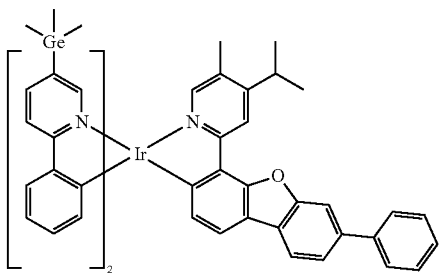
1717
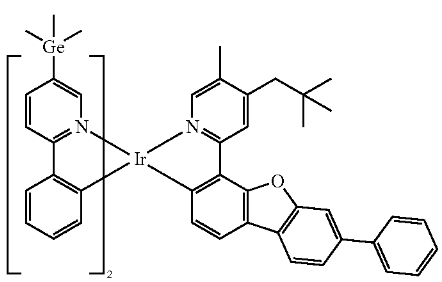
1718
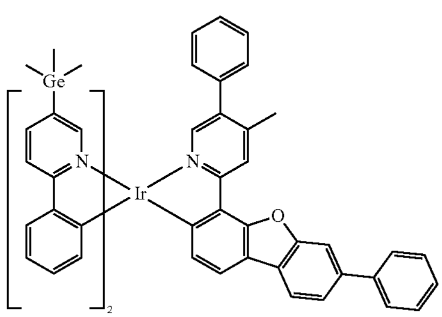
-continued
1719
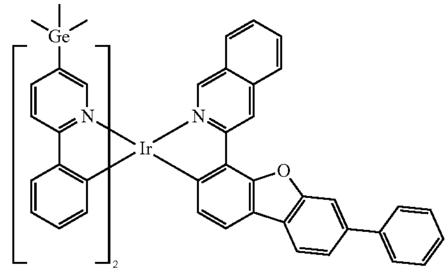
1720
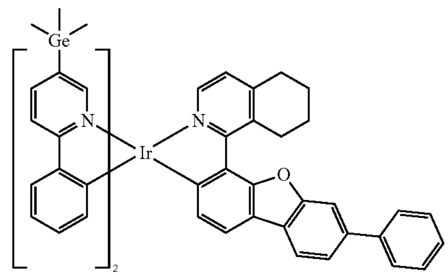
1721
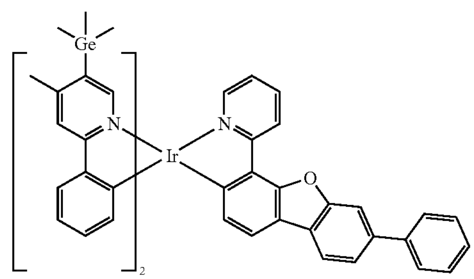
1722
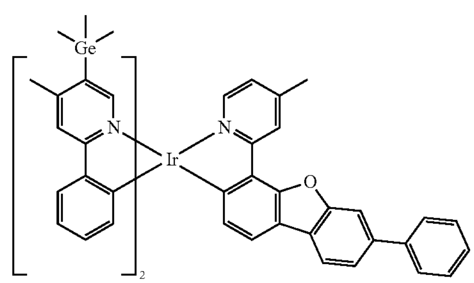
1723
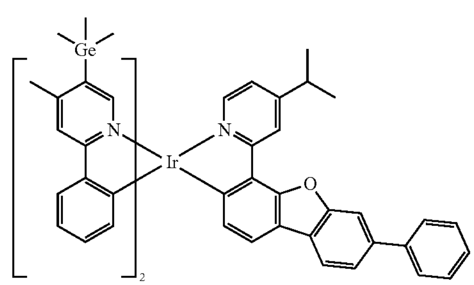

-continued
1724
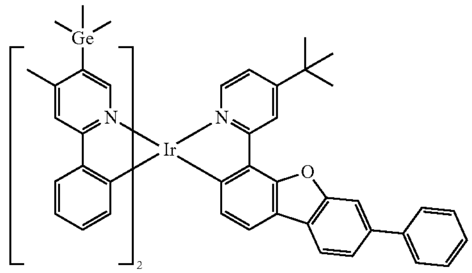
1725
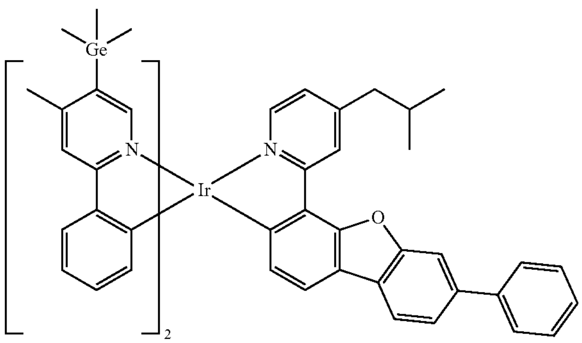
1726
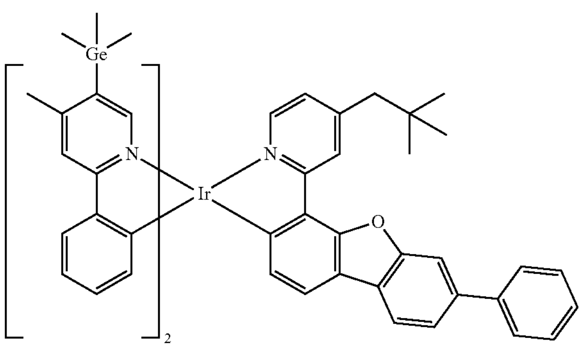
1727
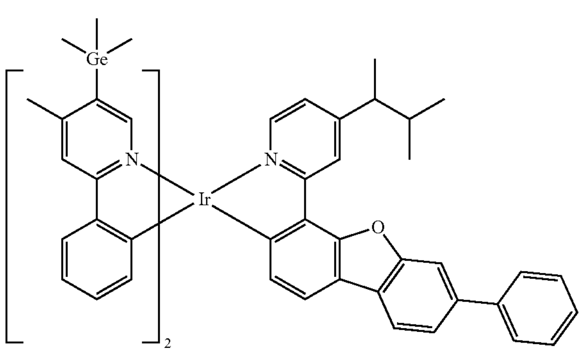
-continued
1728
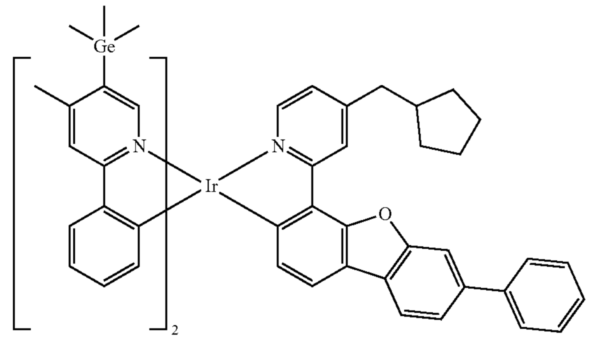
1729
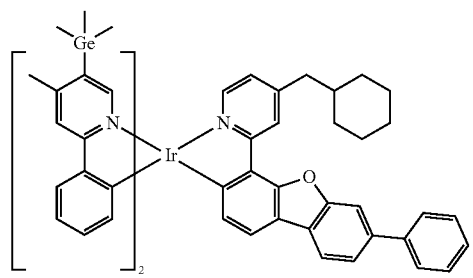
1730
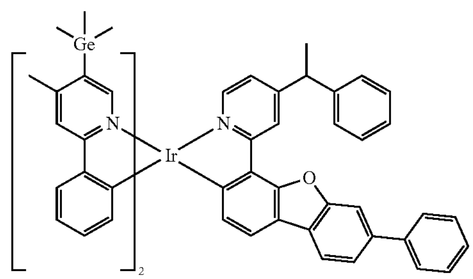
1731
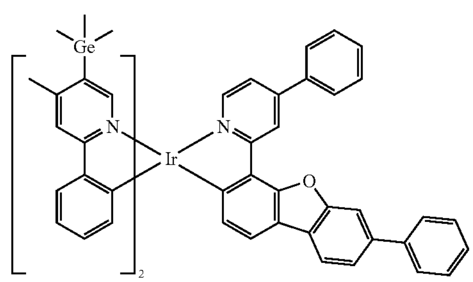
1732
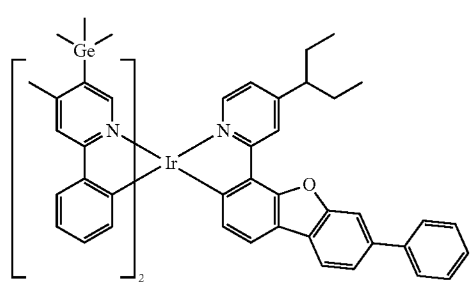

-continued
1733
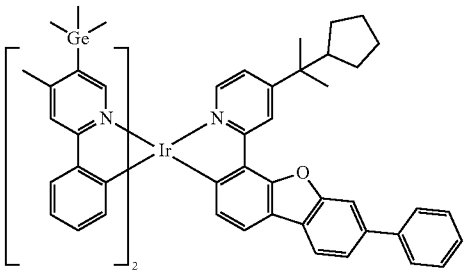
1734
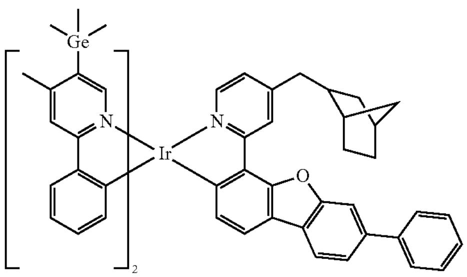
1735
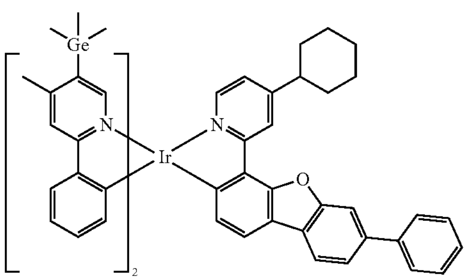
1736
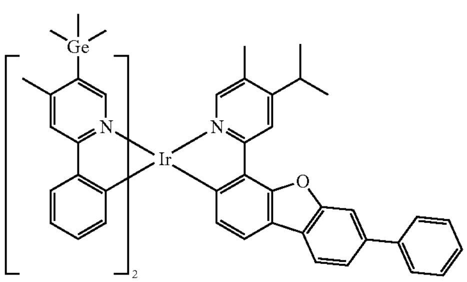
1737
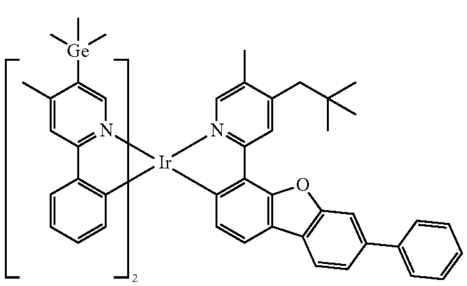
-continued
1738
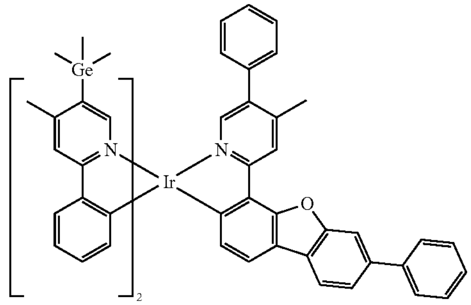
1739
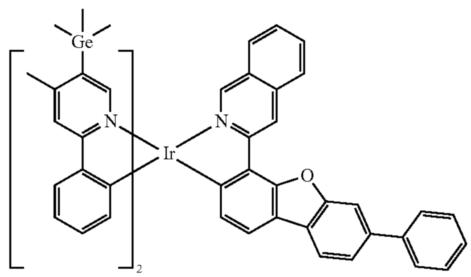
1740
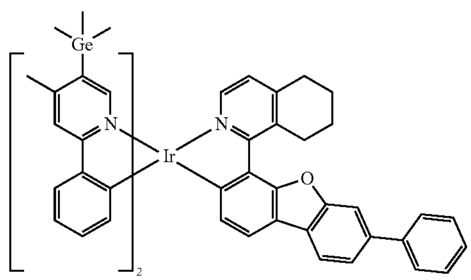
1741
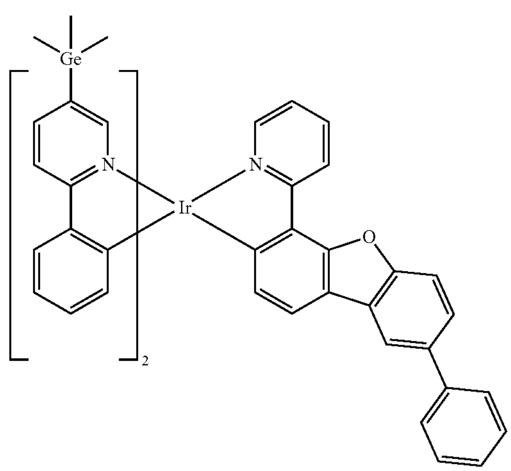

-continued
1742
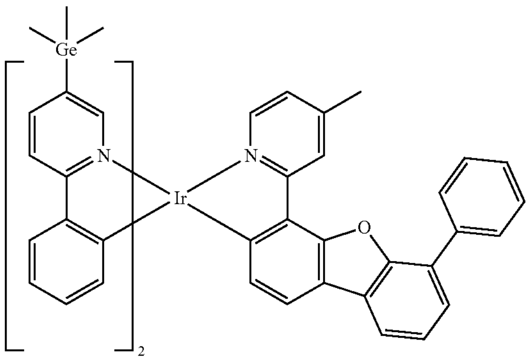
1743
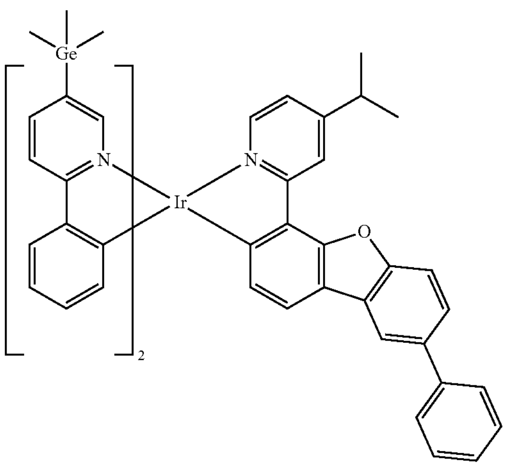
1744
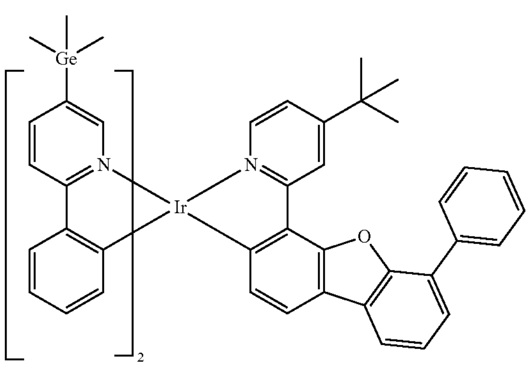
-continued
1745
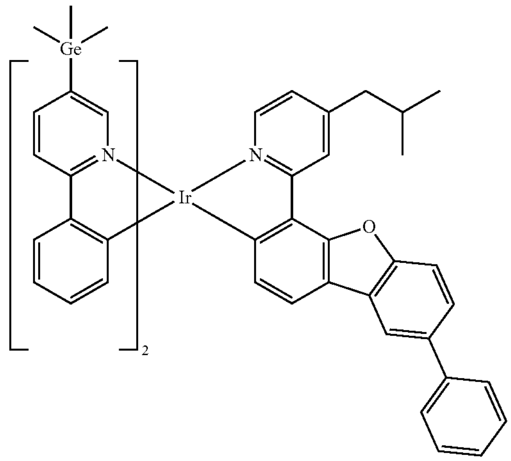
1746
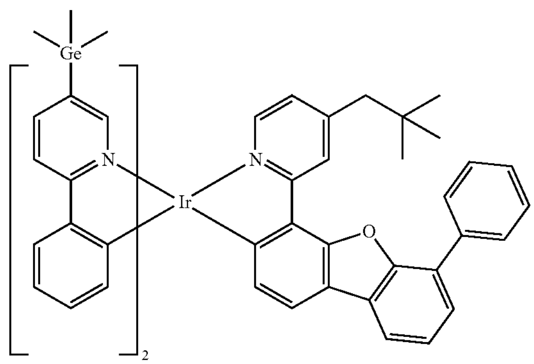
1747
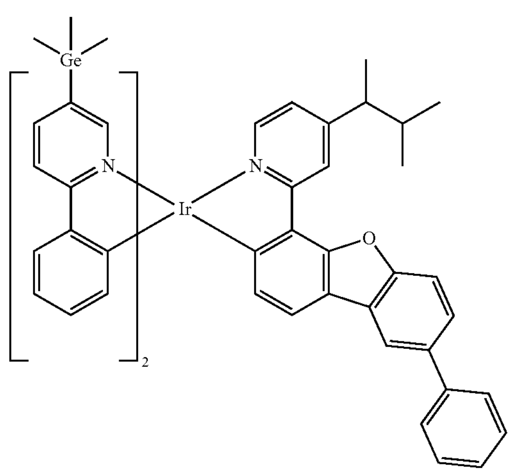

-continued
1748
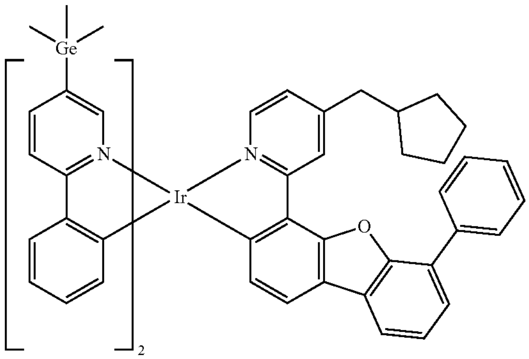
1749
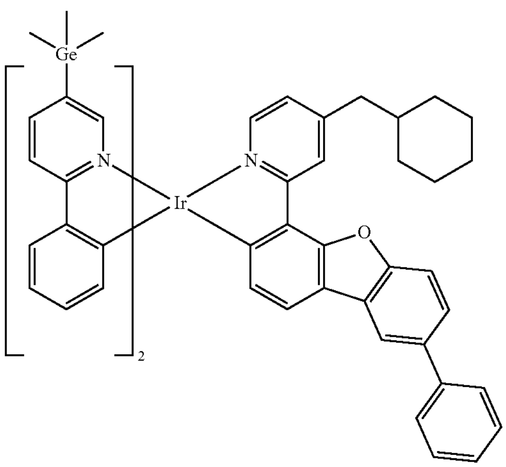
1750
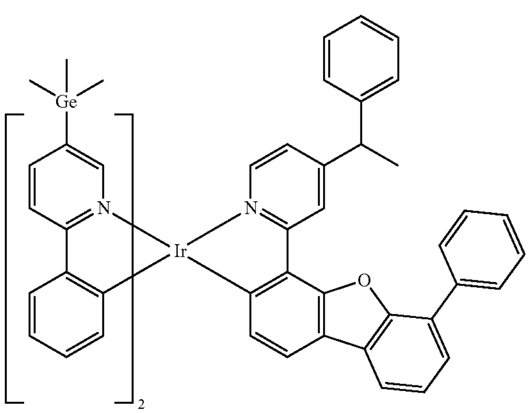
-continued
1751
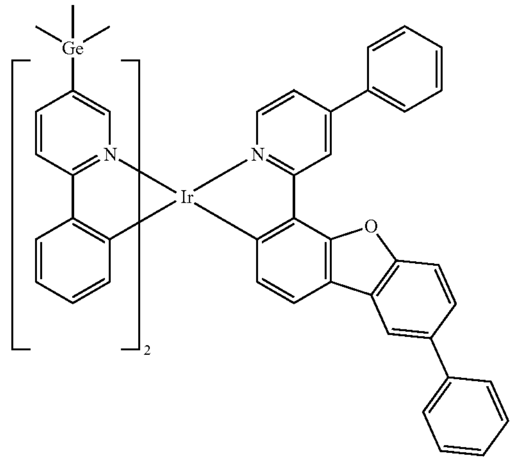
1752
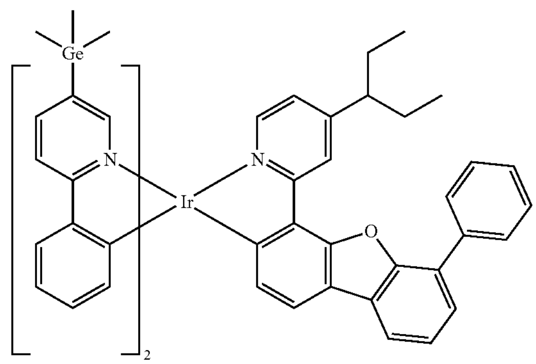
1753
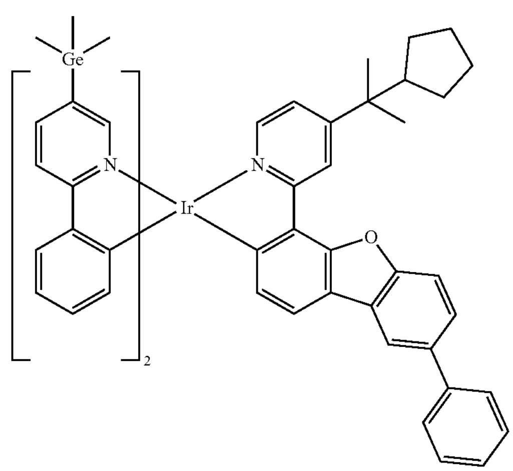

1754
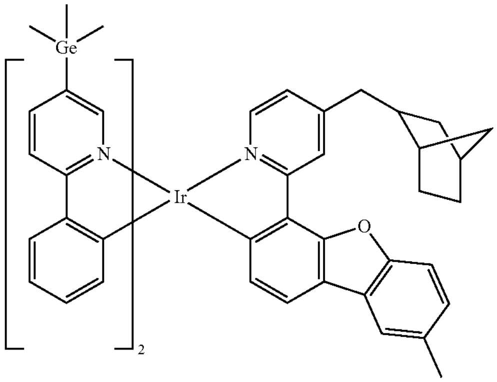
1755
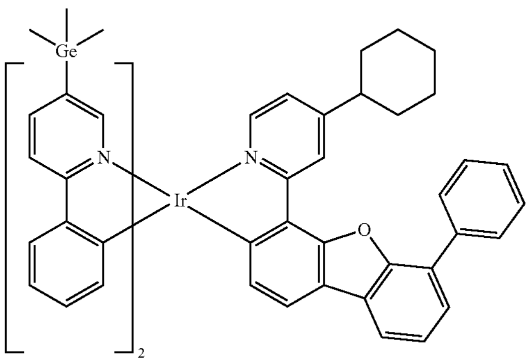
1756
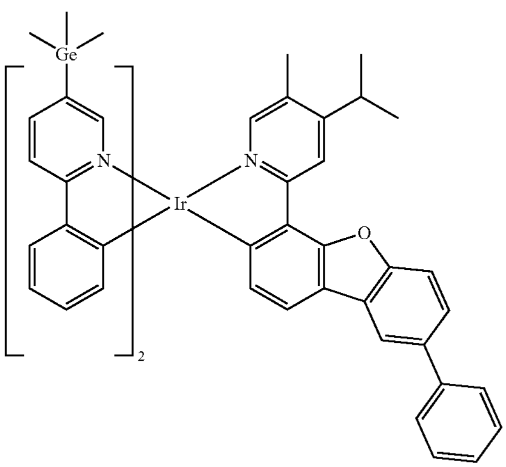
1757
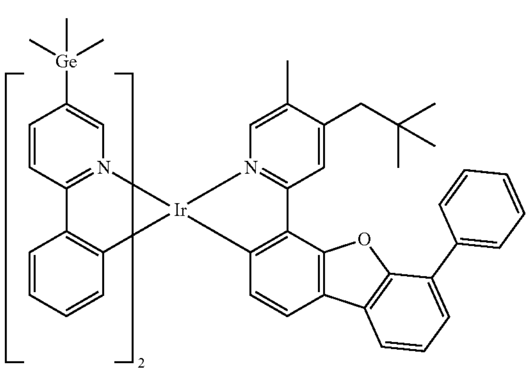
1758
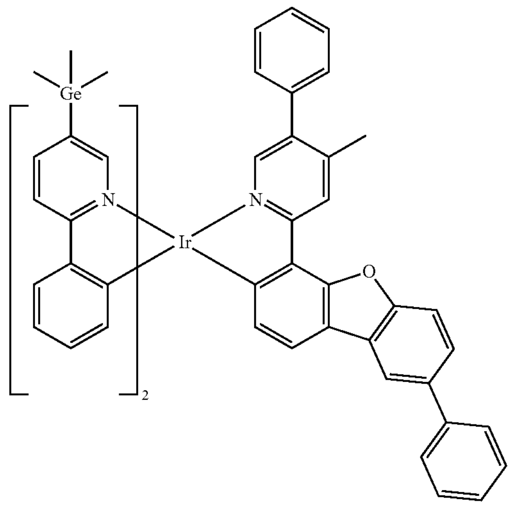
1759
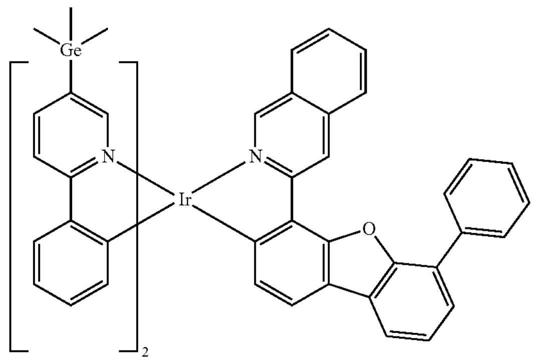
1560
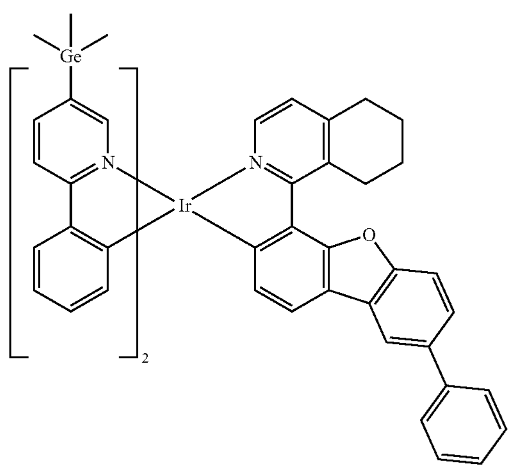

-continued
1761
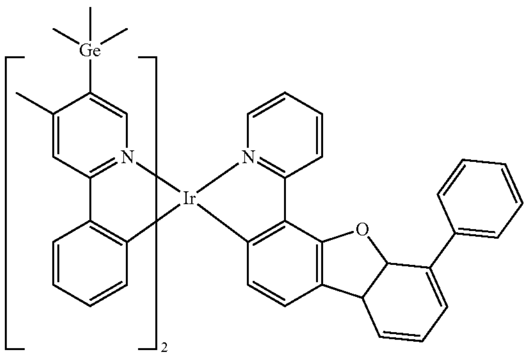
1762
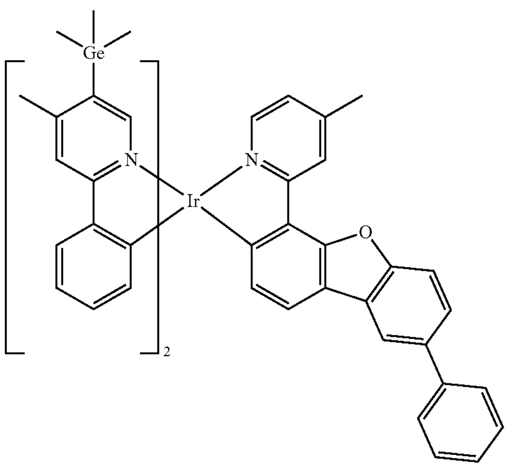
1763
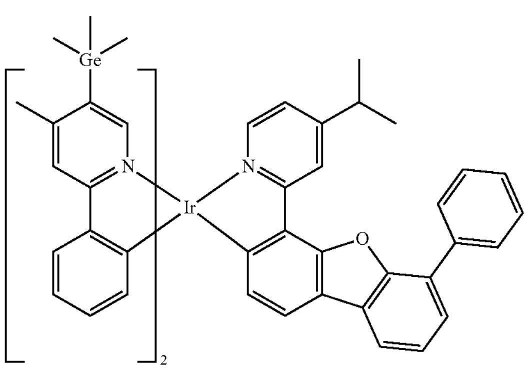
1764
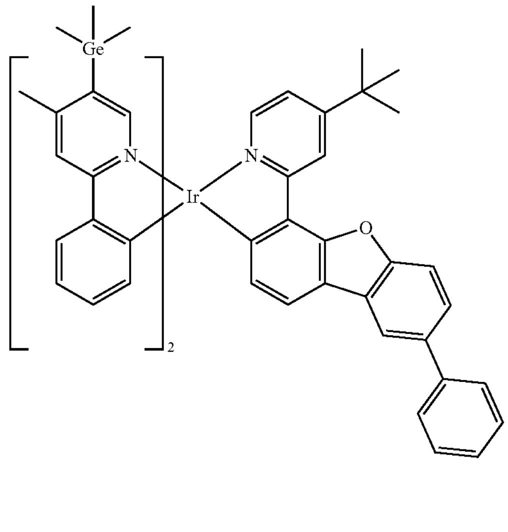
1765
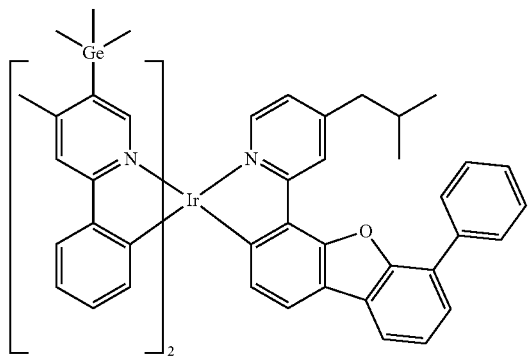
1766
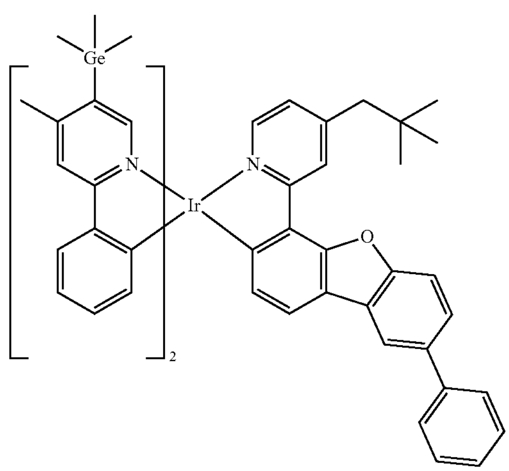

-continued
1767
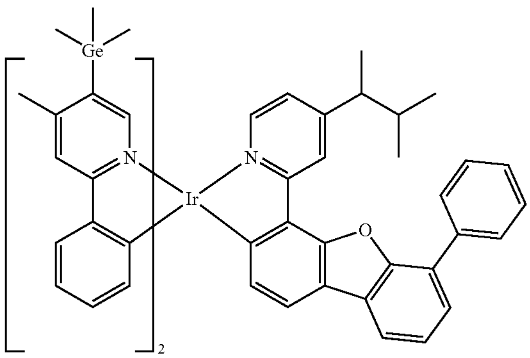
1768
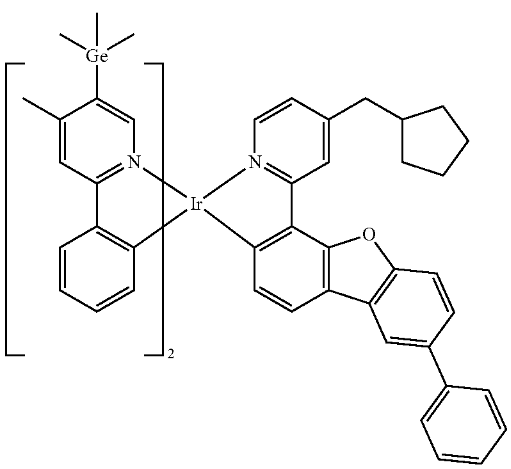
1769
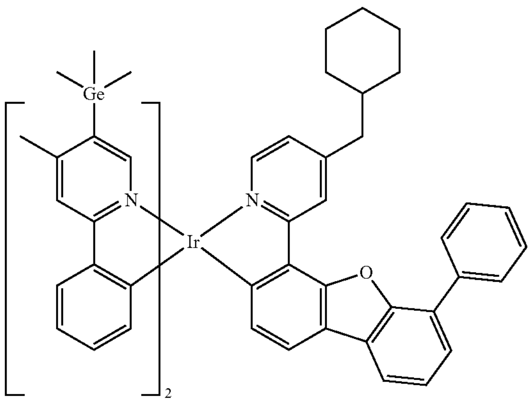
-continued
1770
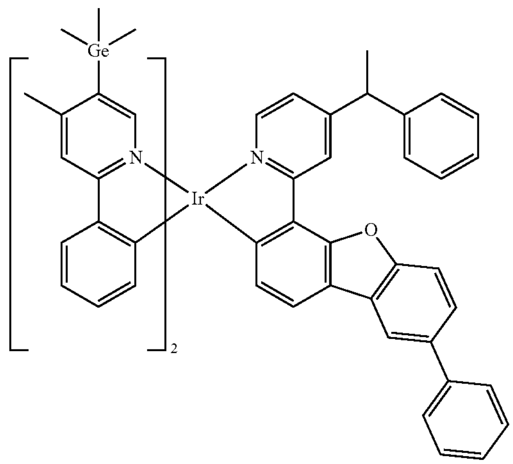
1771
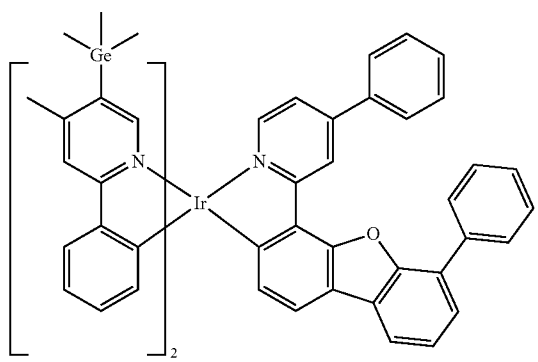
1772
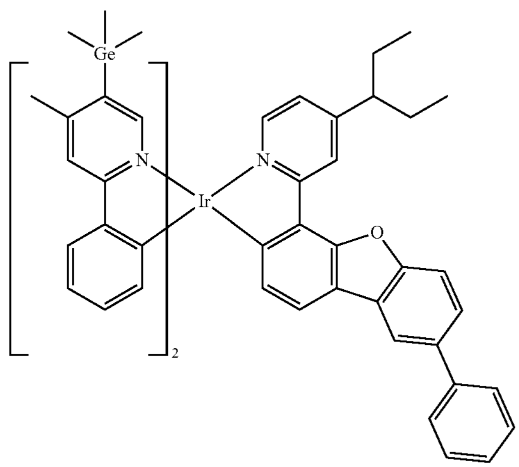

-continued
1773
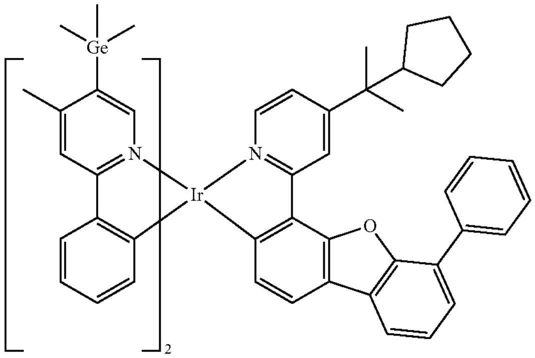
1774
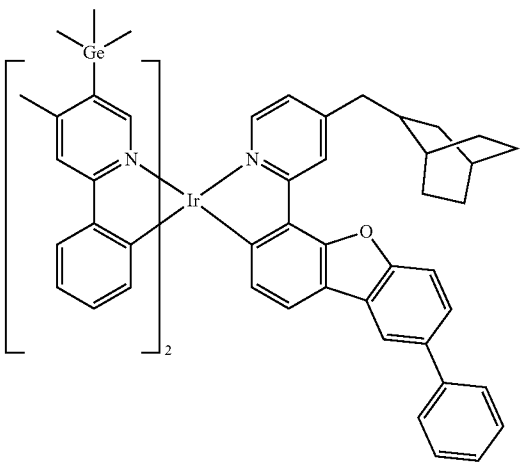
1775
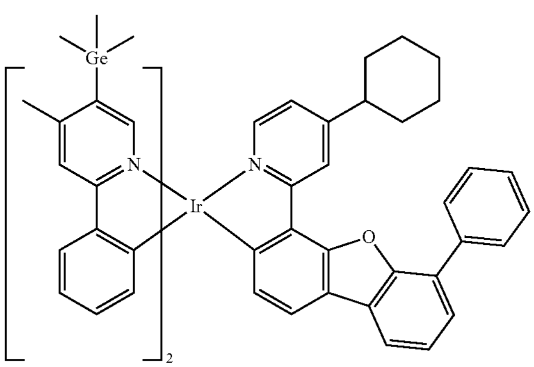
-continued
1776
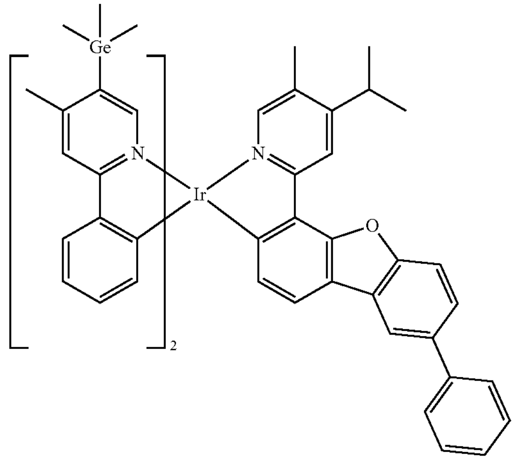
1777
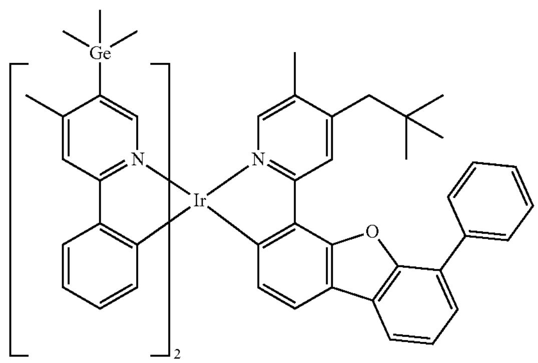
1778
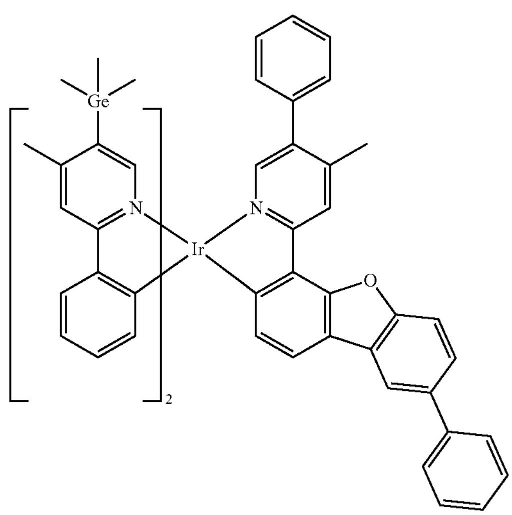

-continued
1779
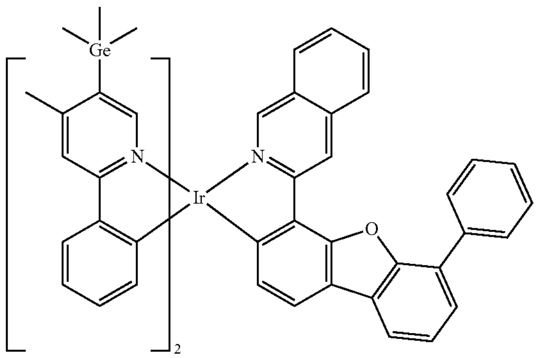
1780
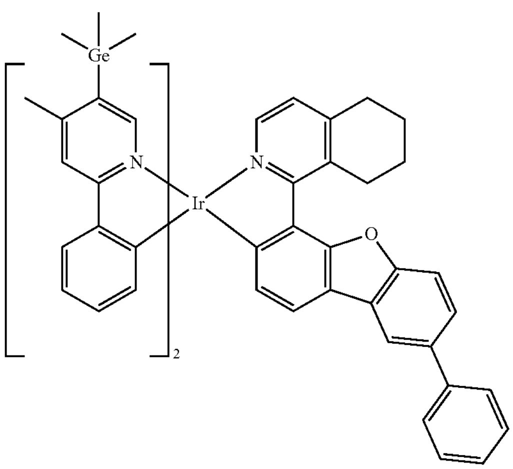
1781
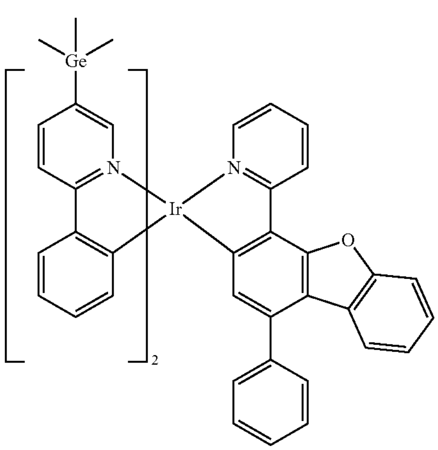
-continued
1782
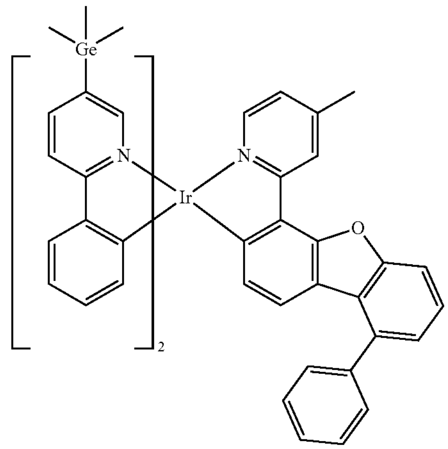
1783
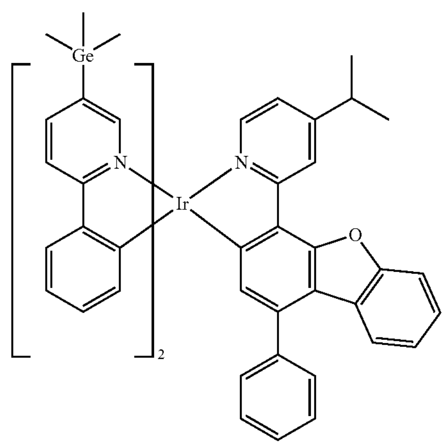
1784
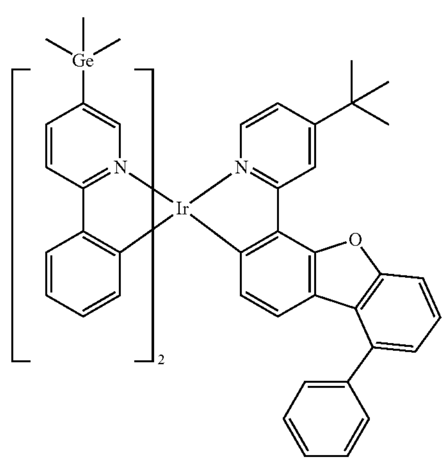

-continued
1785
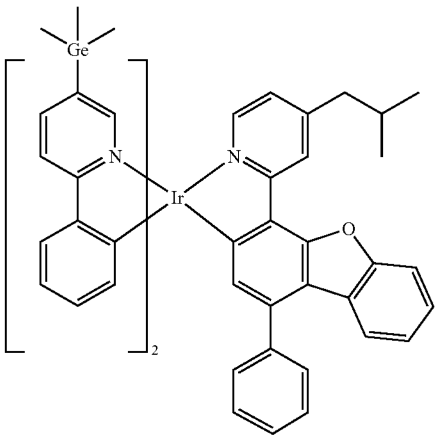
1786
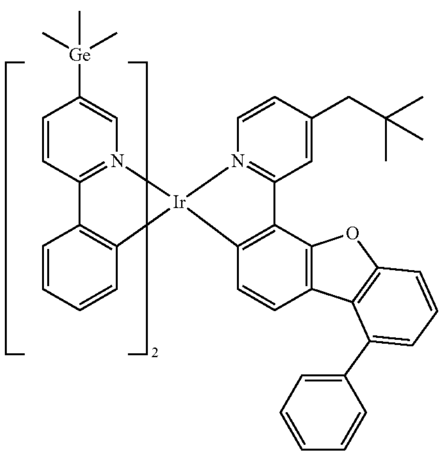
1787
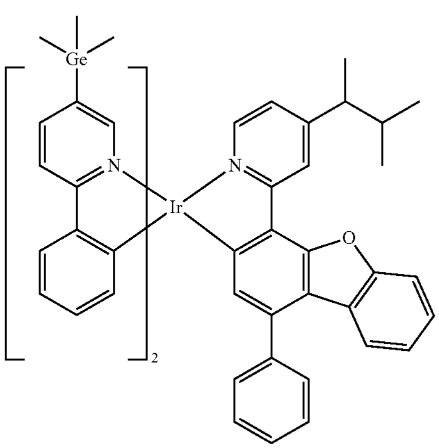
-continued
1788
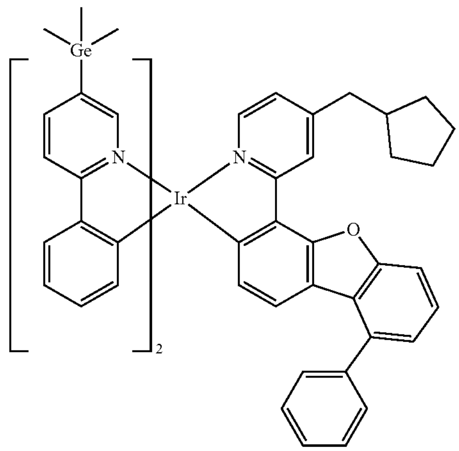
1789
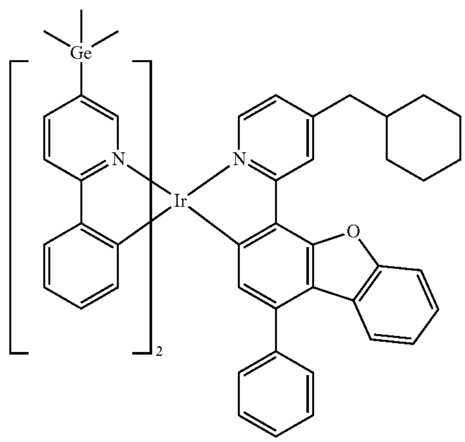
1790
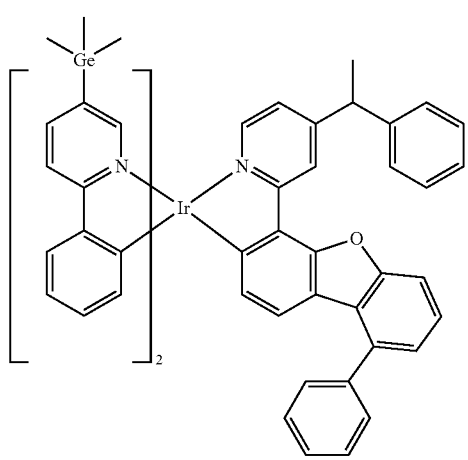

-continued
1791
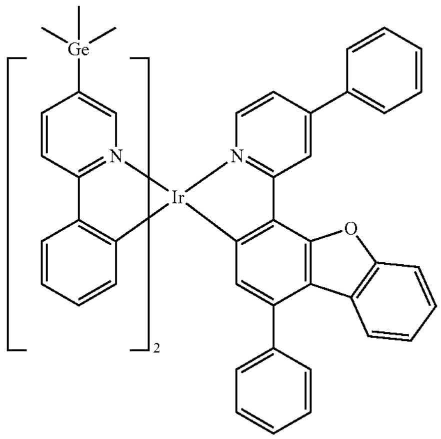
1792
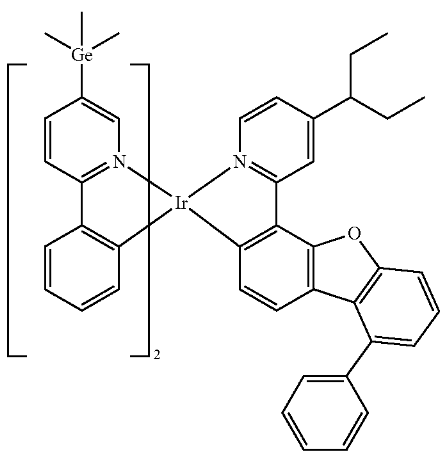
1793
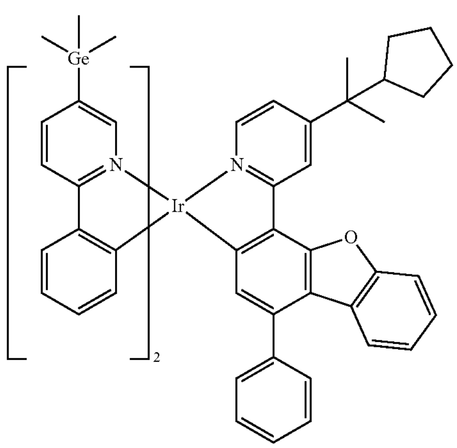
-continued
1794
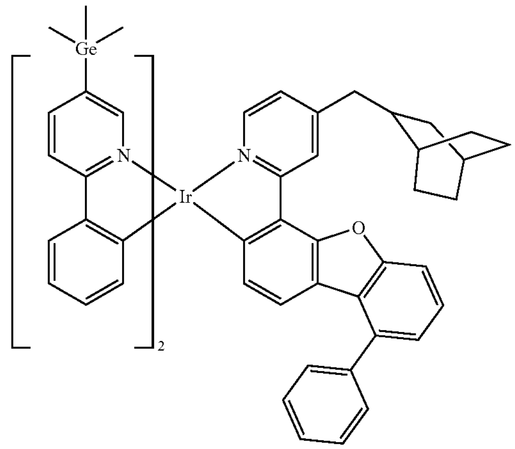
1795
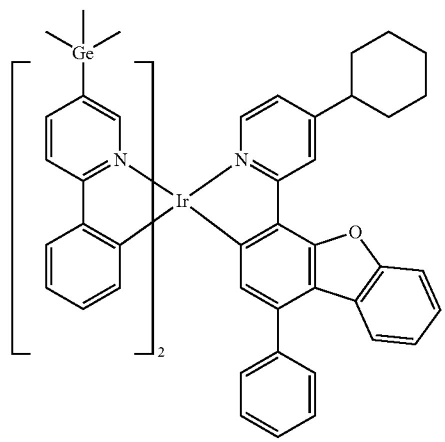
1796
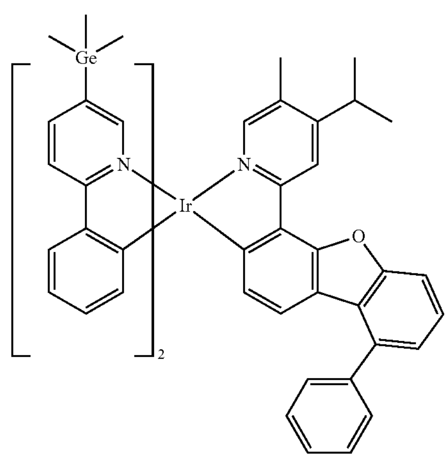

1797
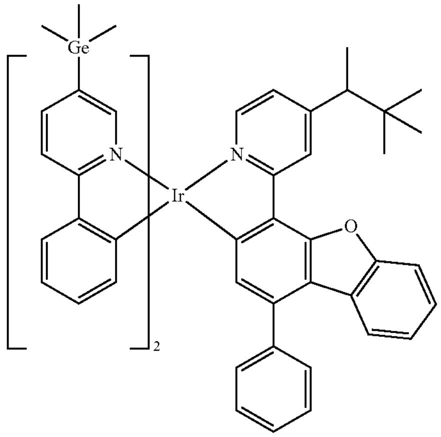
1798
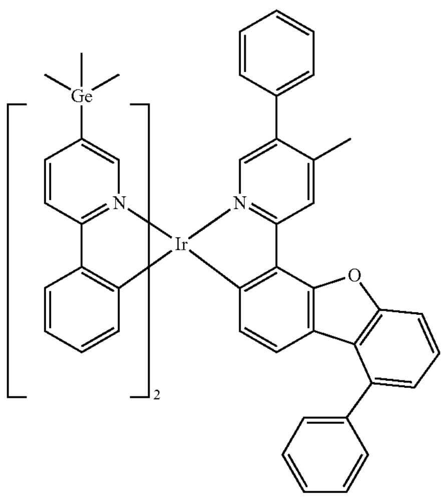
1799
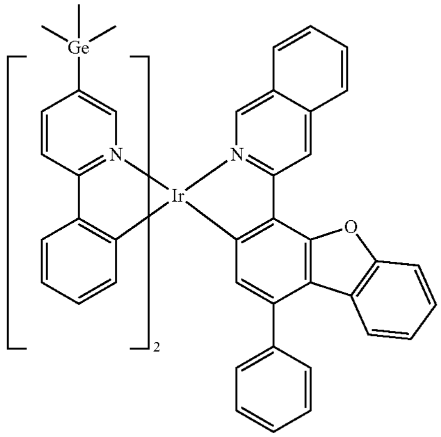
1800
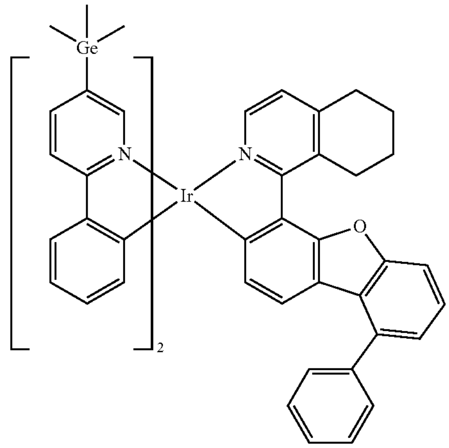
1801
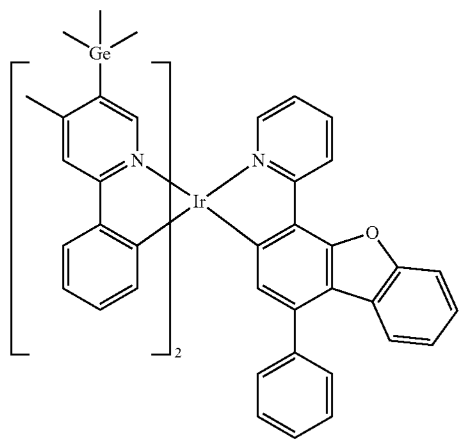
1802
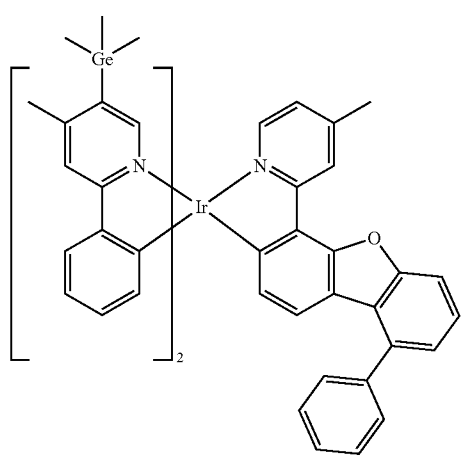

-continued
1803
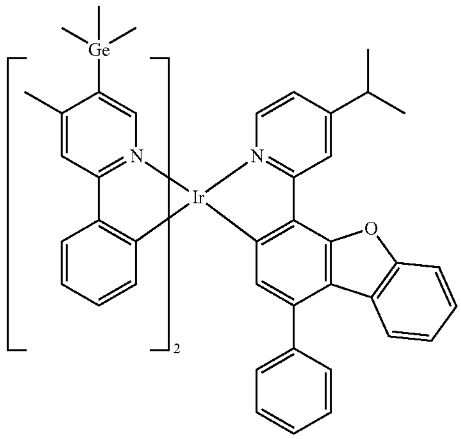
1804
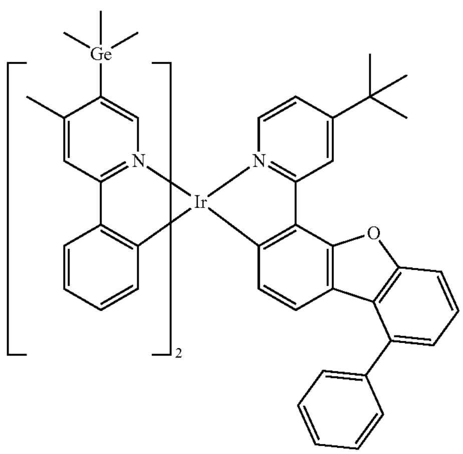
1805
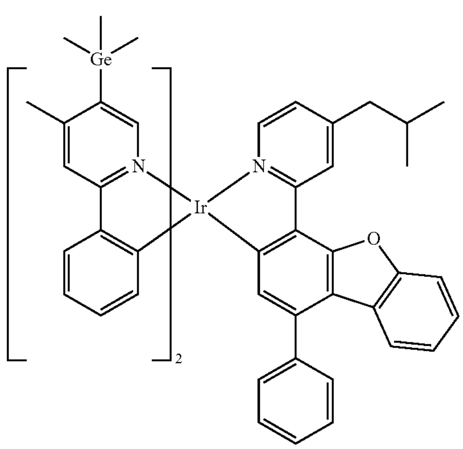
-continued
1806
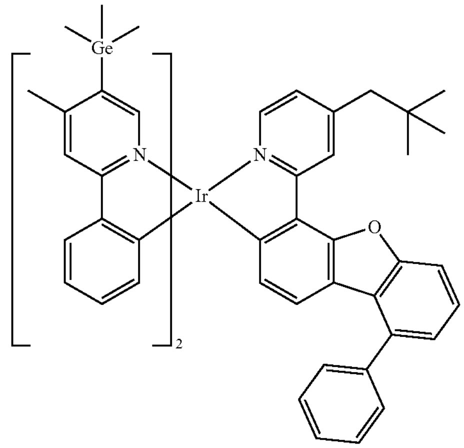
1807
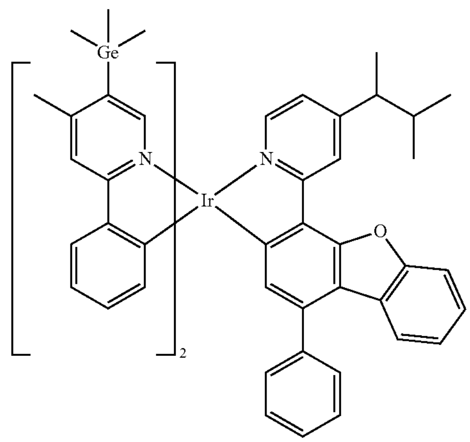
1808
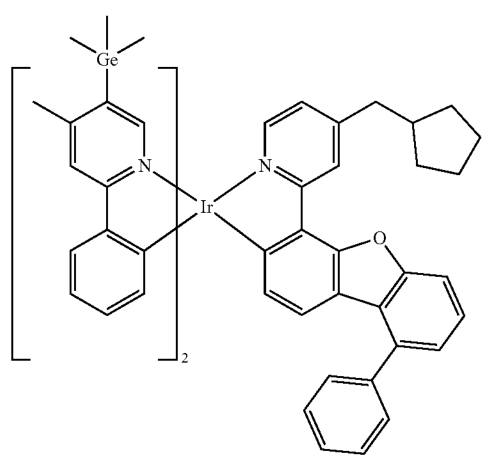

1809
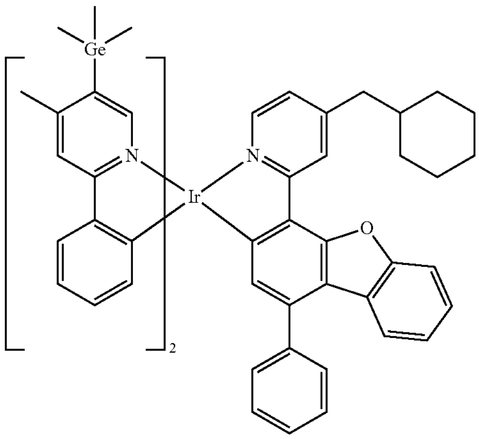
1810
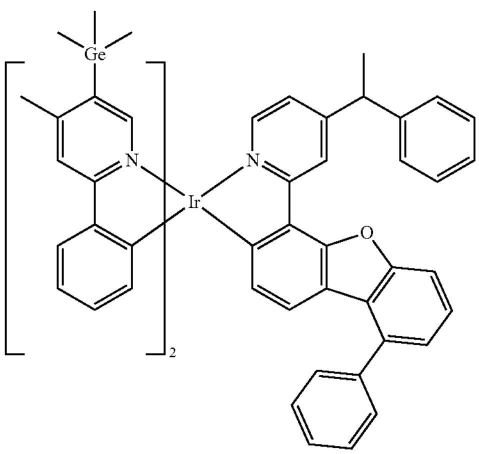
1811
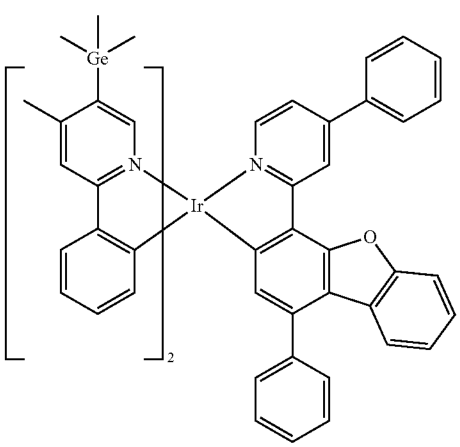
1812
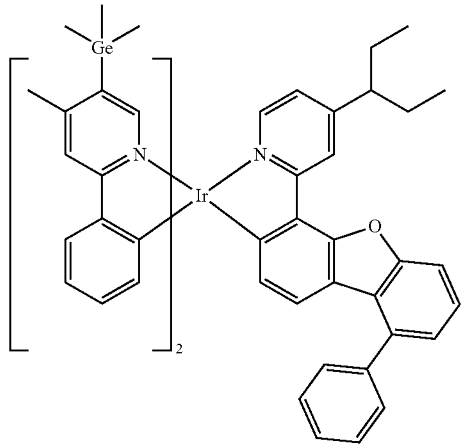
1813
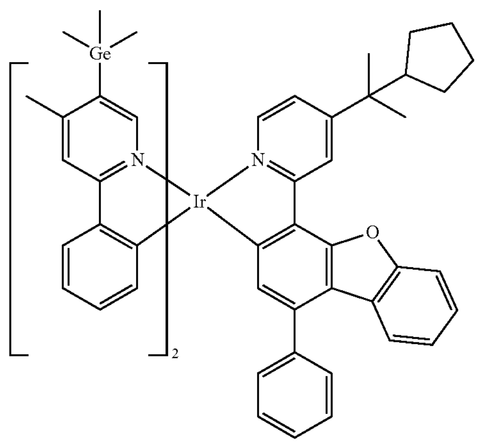
1814
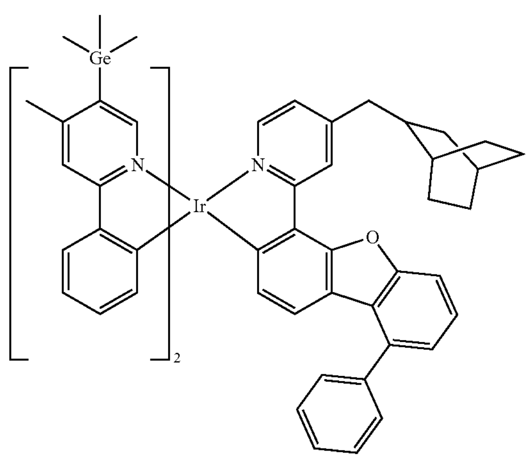

-continued
1815
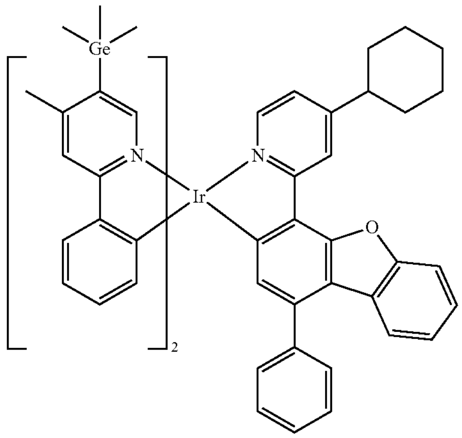
1816
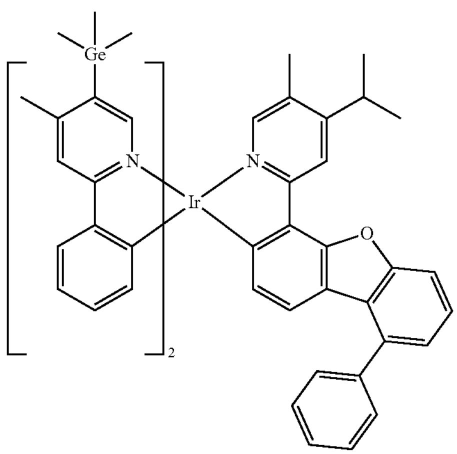
1817
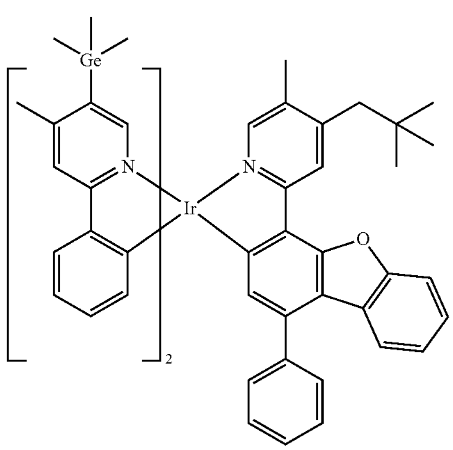
-continued
1818
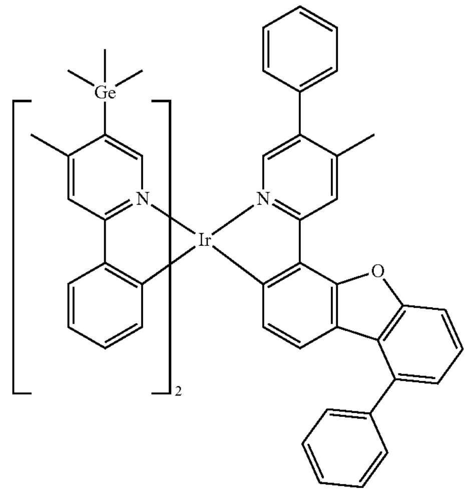
1819
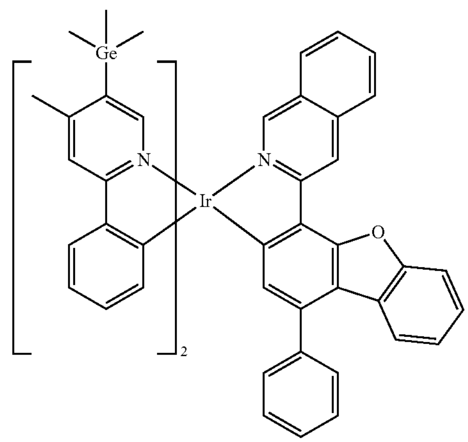
1820
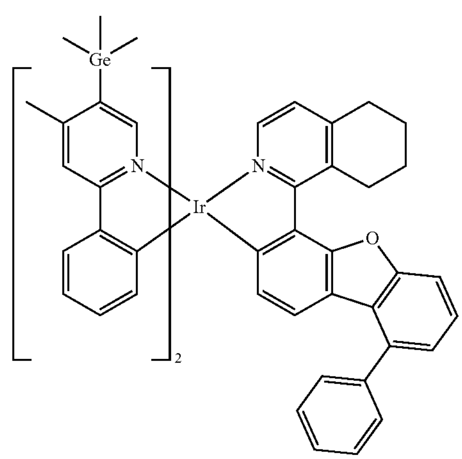

-continued
1821
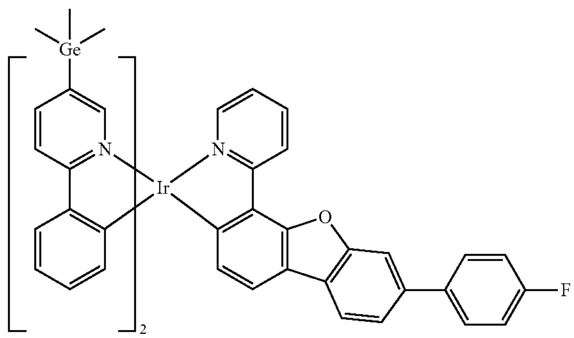
1822
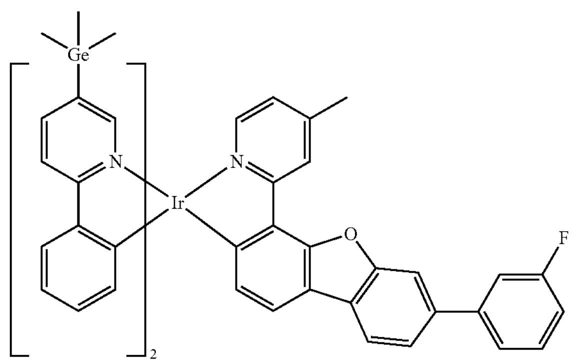
1823
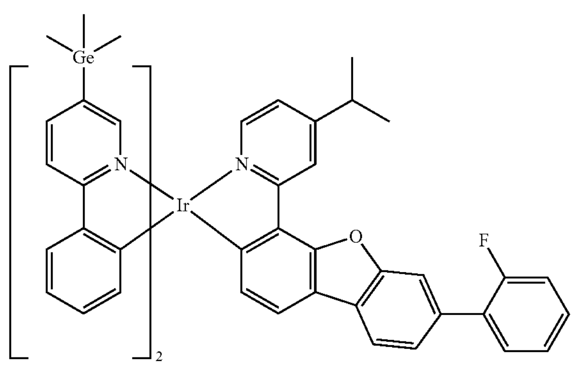
1824
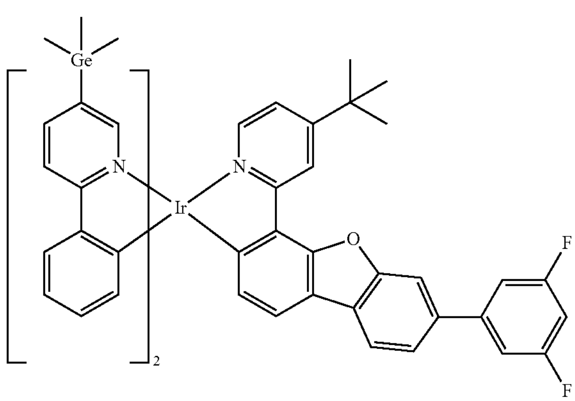
-continued
1825
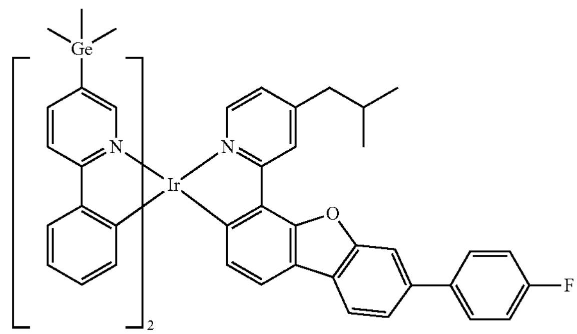
1826
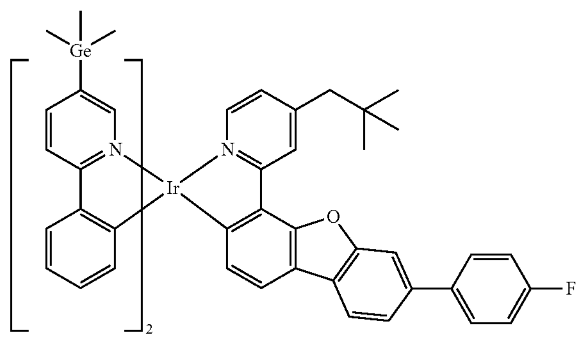
1827
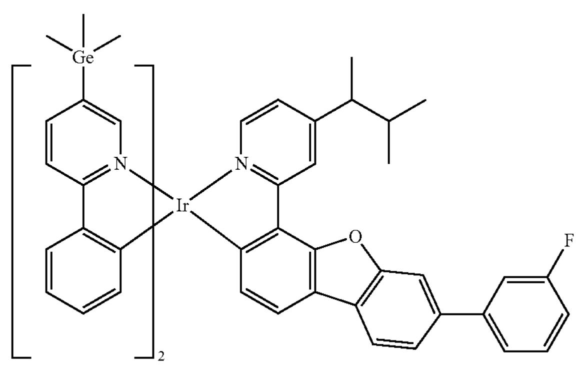
1828
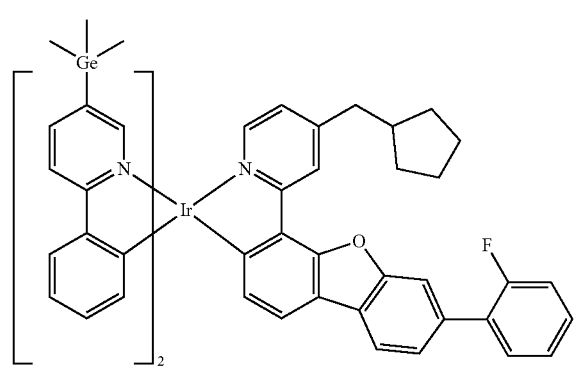

1829
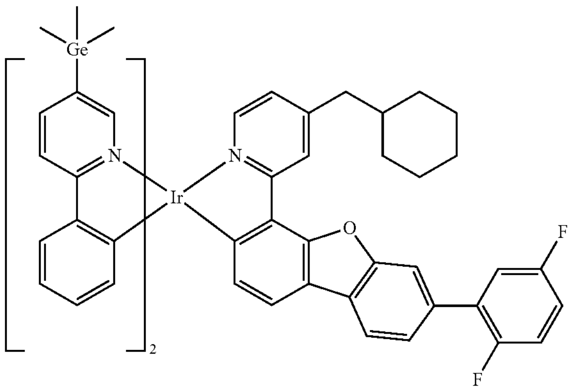
1830
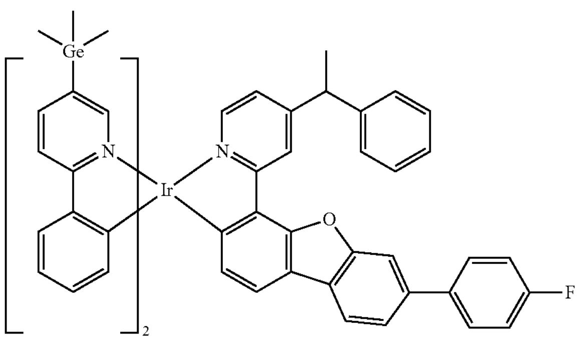
1831
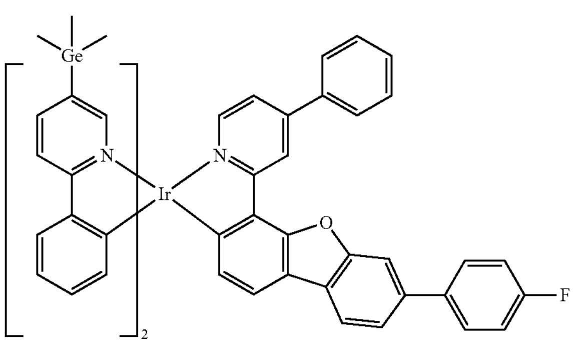
1832
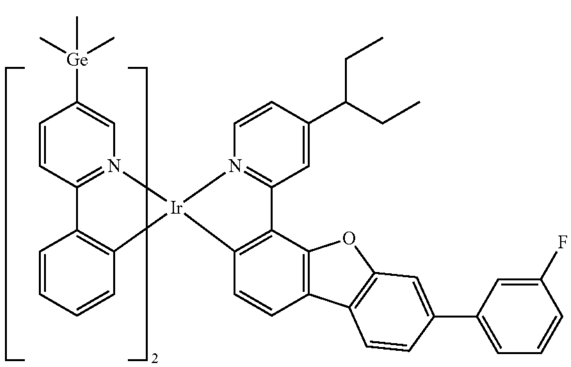
1833
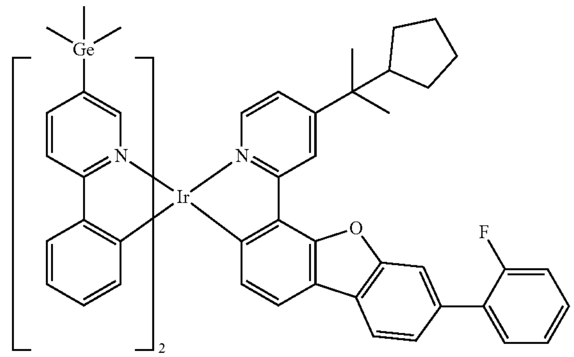
1834
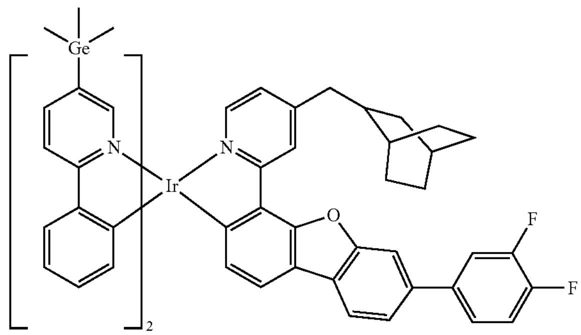
1835
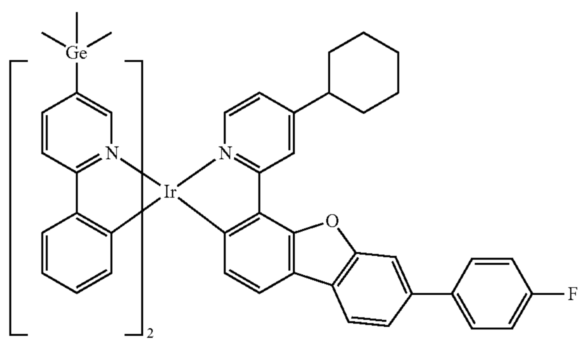
1836
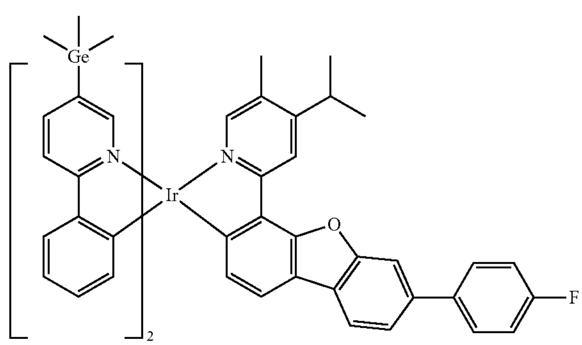

-continued
1837
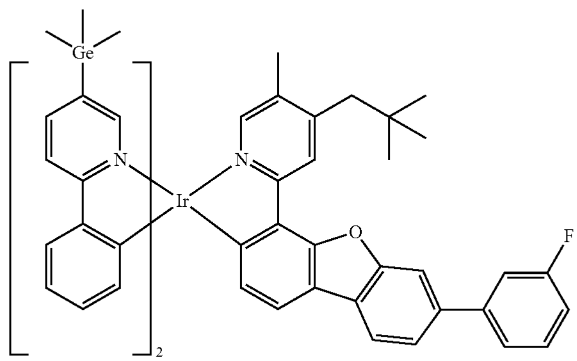
1838
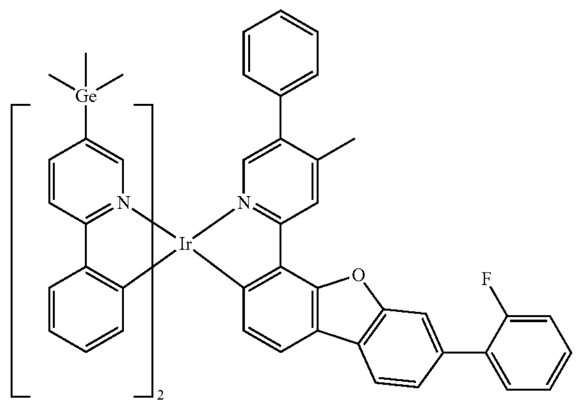
1839
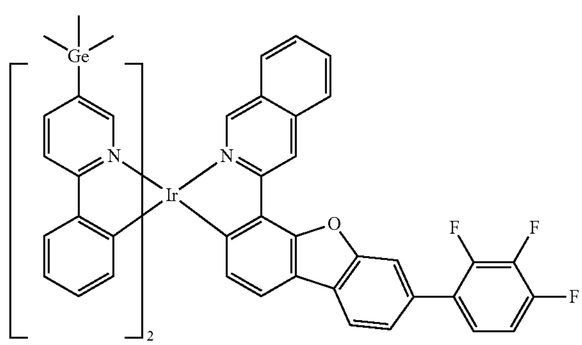
1840
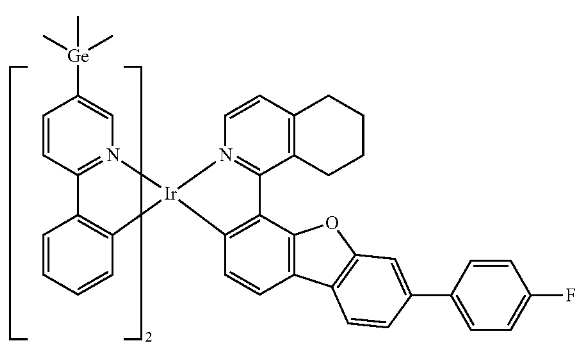
-continued
1841
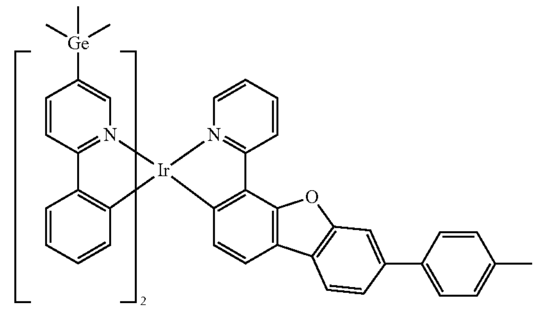
1842
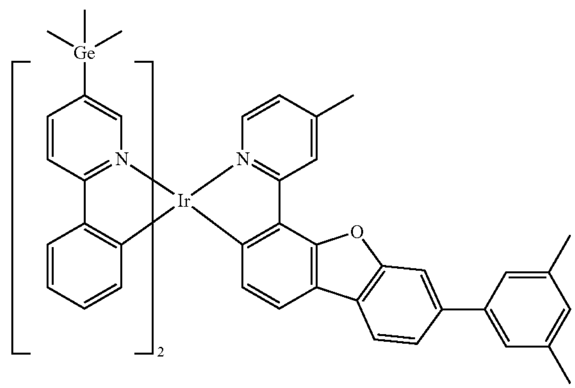
1843
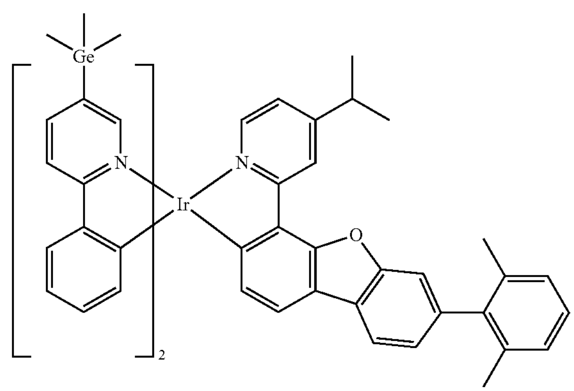
1844
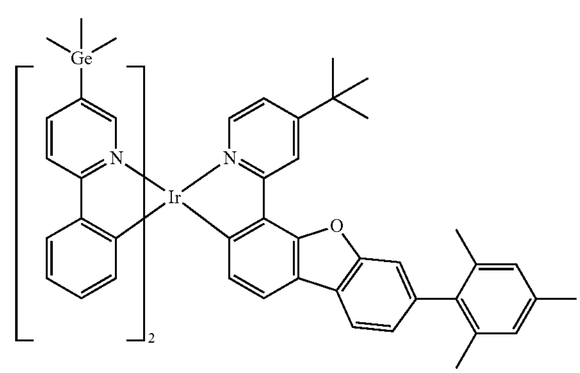

-continued
1845
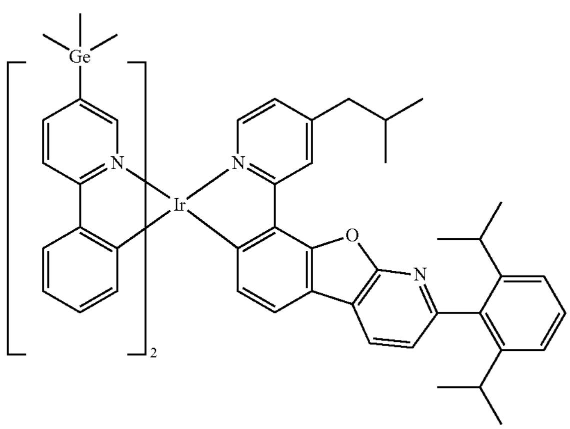
1846
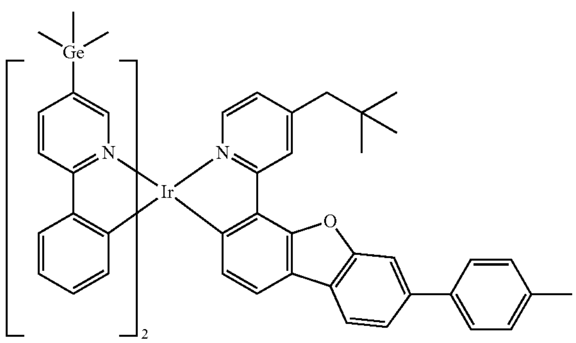
1847
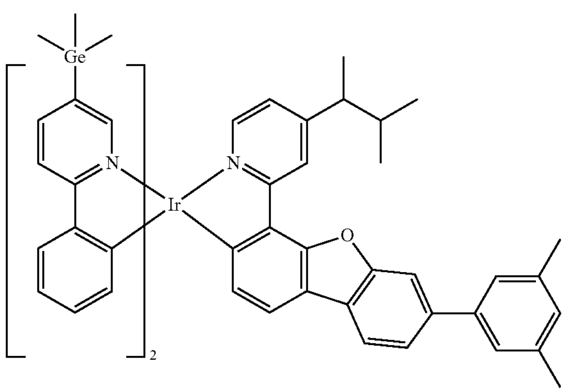
1848
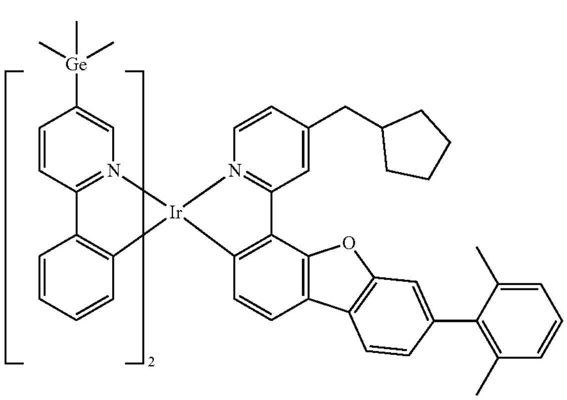
-continued
1849
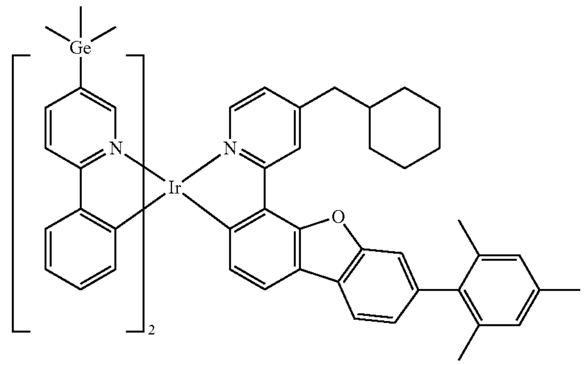
1850
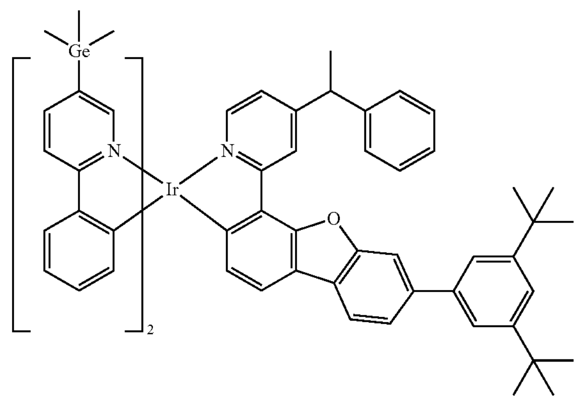
1851
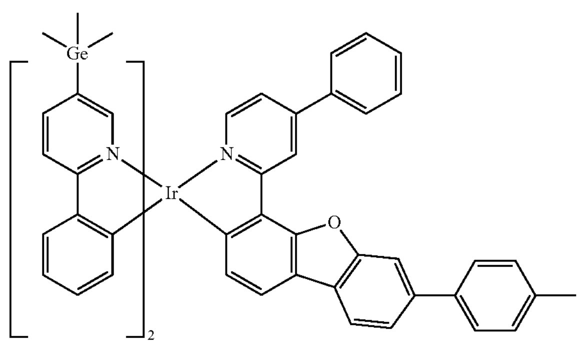
1852
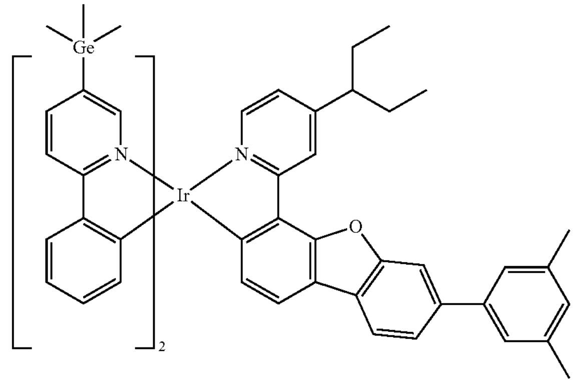

-continued
1853
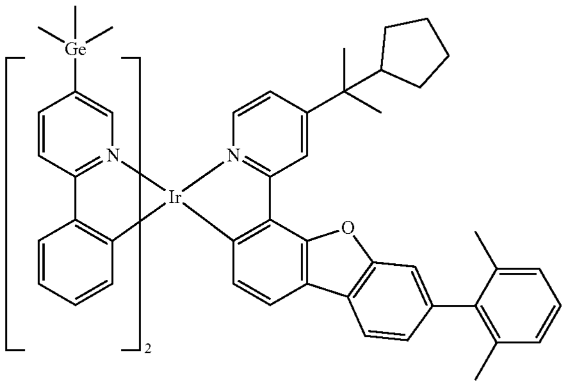
1854
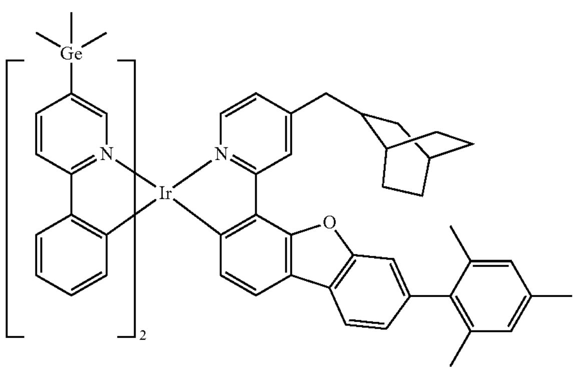
1855
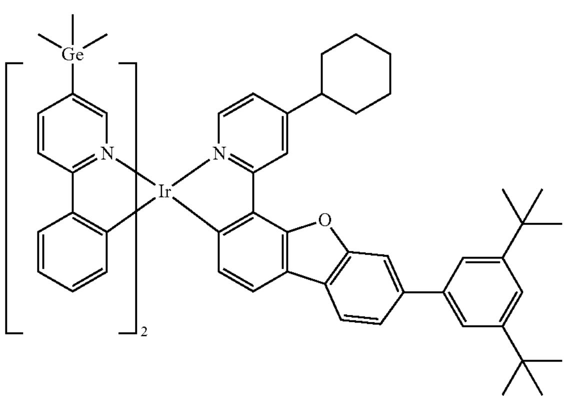
1856
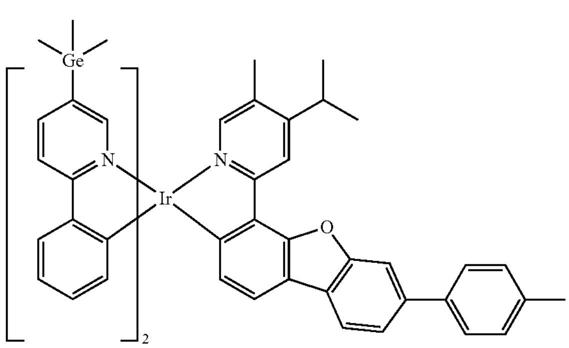
-continued
1857
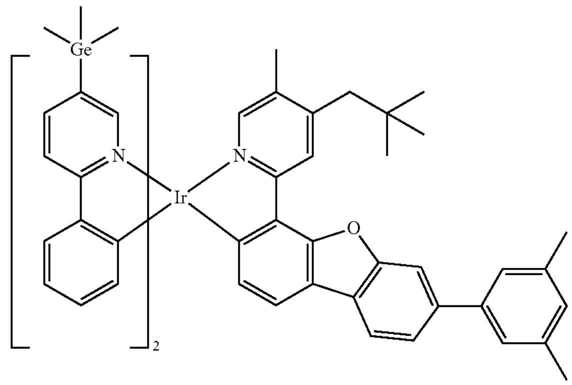
1858
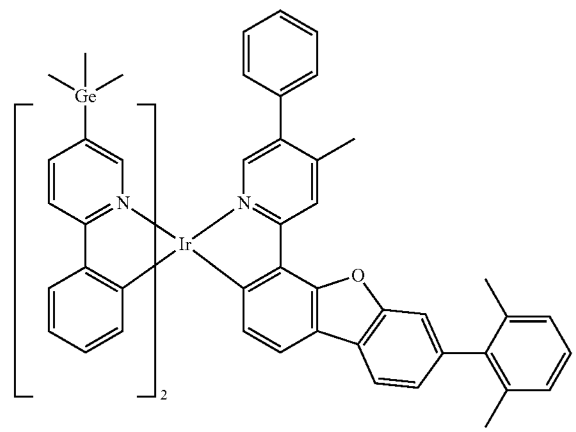
1859
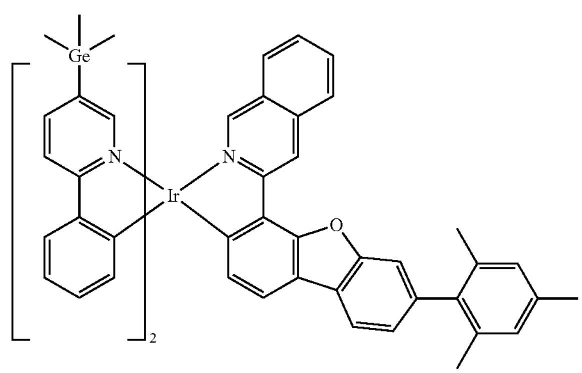
1860
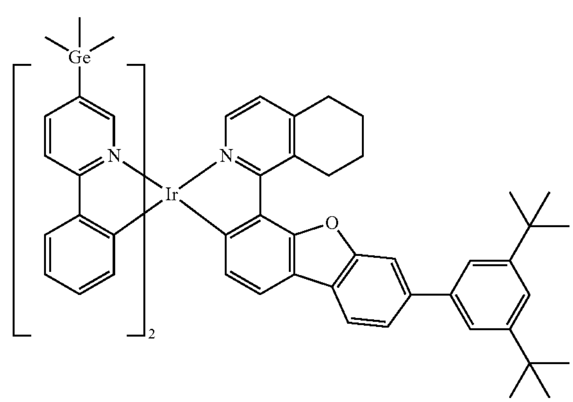

-continued
1861
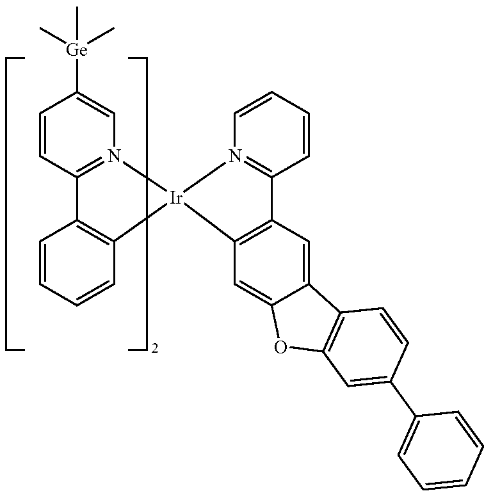
1862
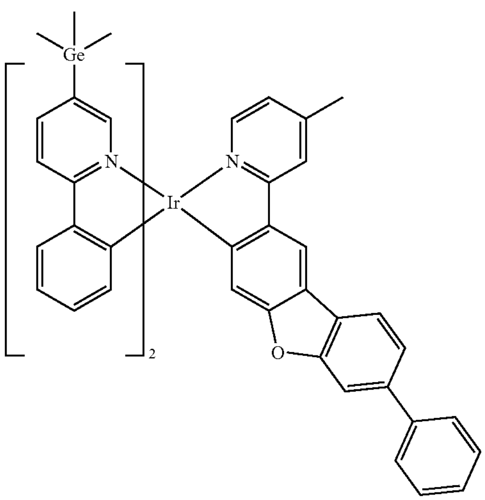
1863
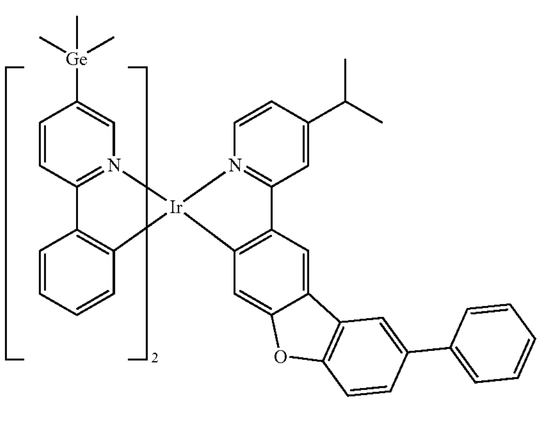
-continued
1864
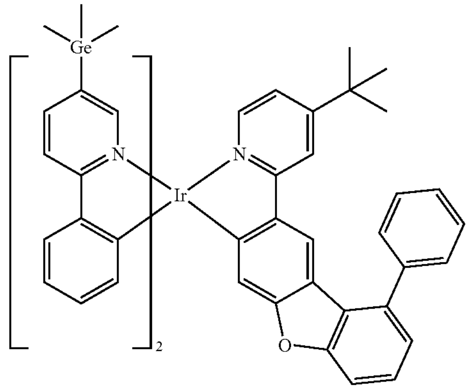
1865
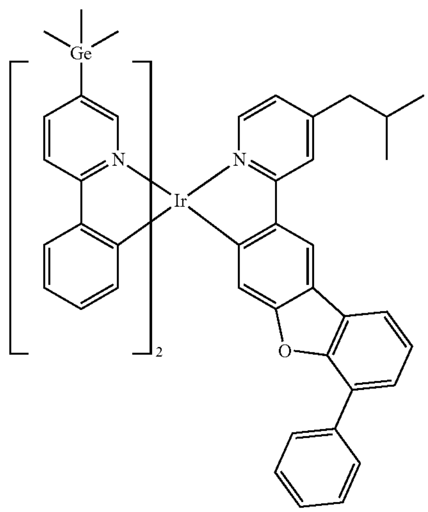
1866
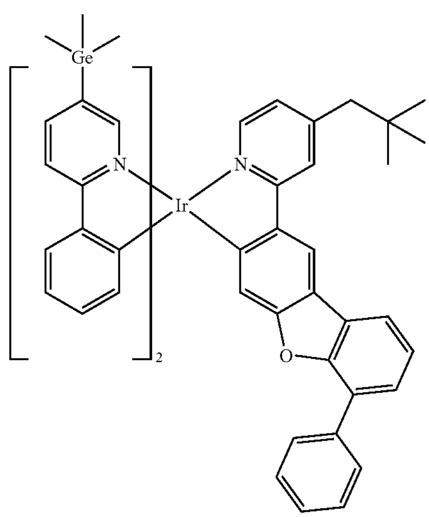

-continued
1867
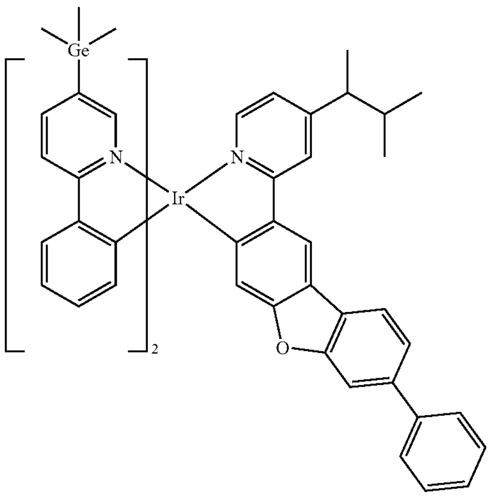
1868
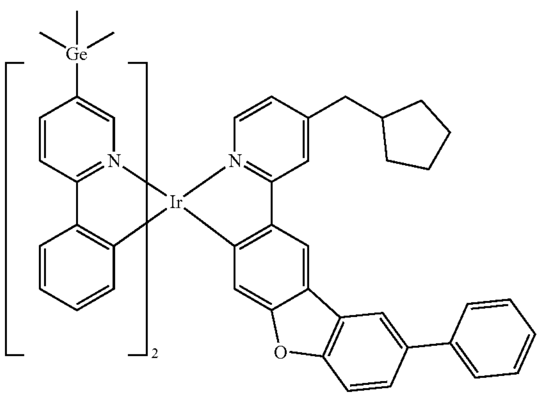
1869
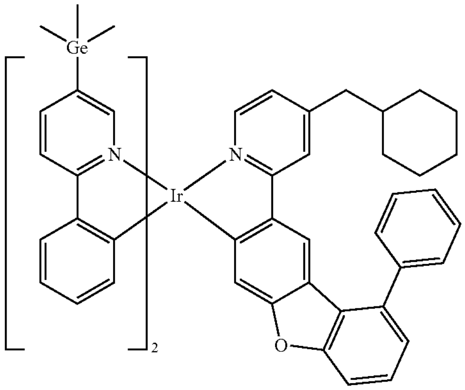
-continued
1870
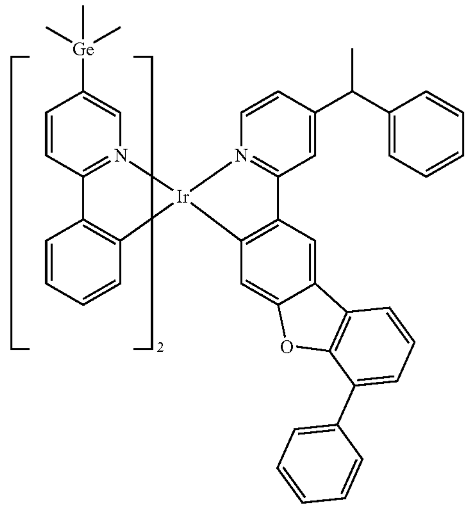
1871
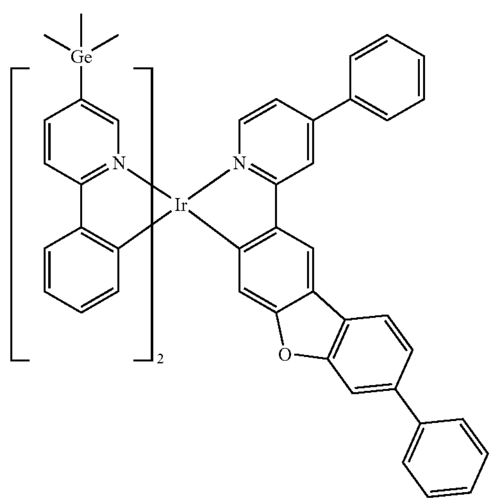
1872
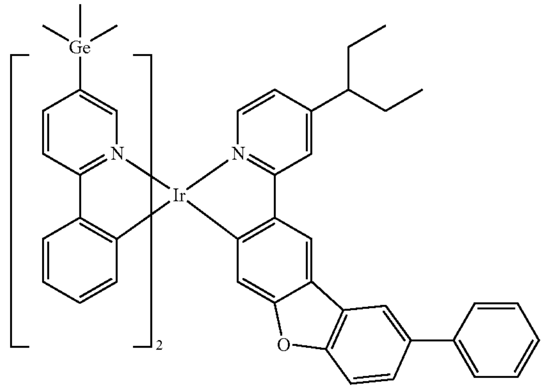

1873
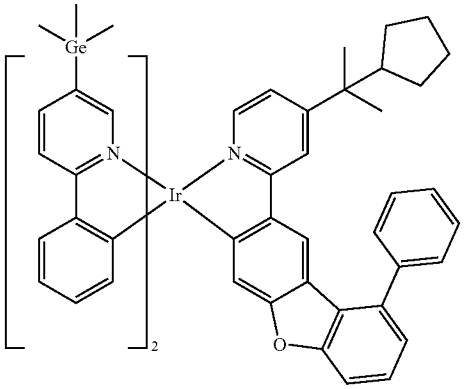
1874
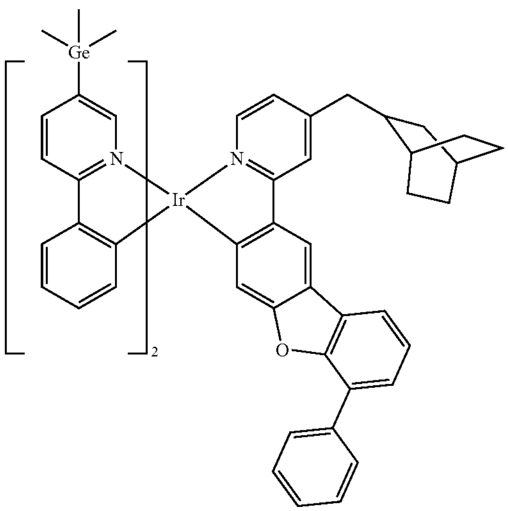
1875
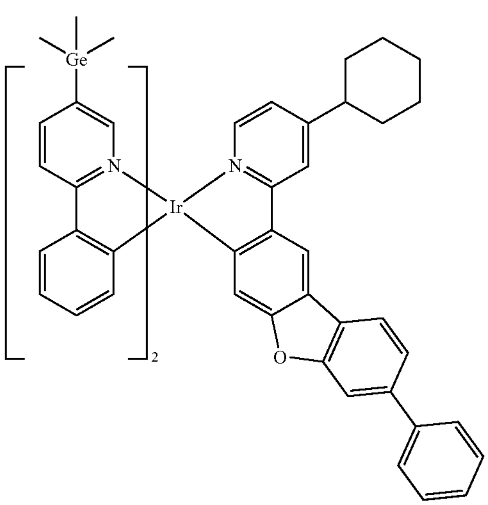
1876
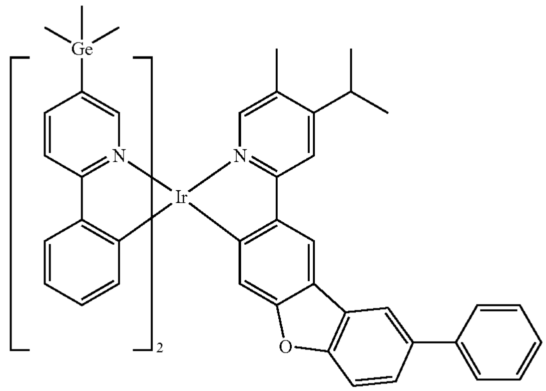
1877
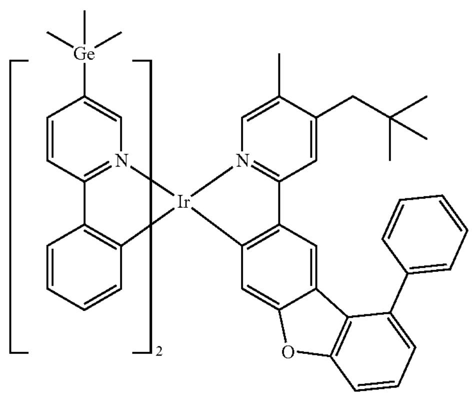
1878
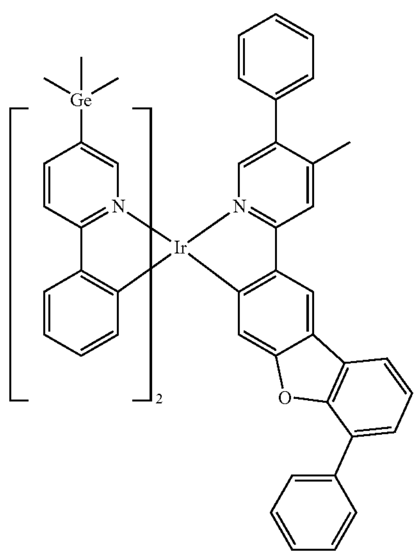

-continued
1879
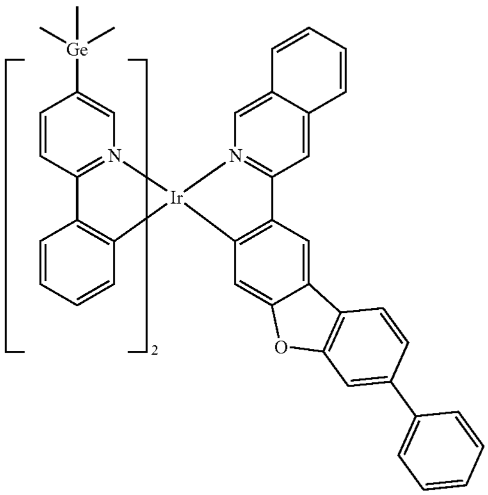
1880
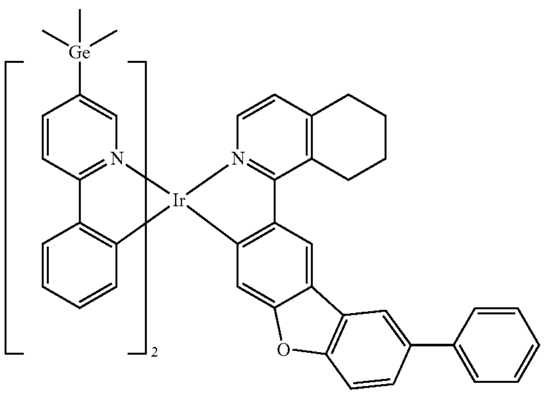
1881
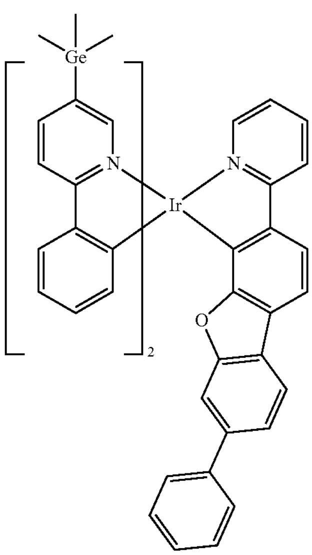
-continued
1882
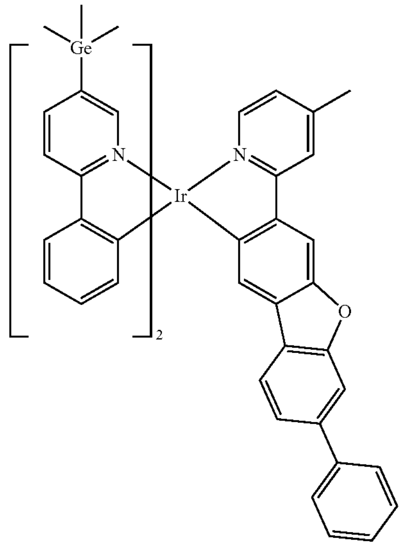
1883
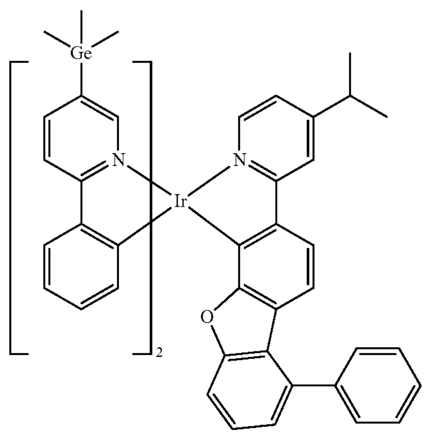
1884
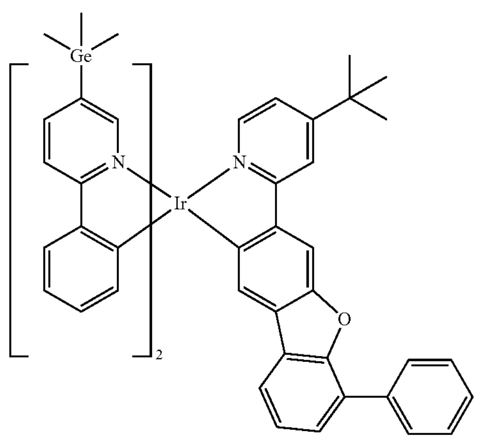

-continued
1885
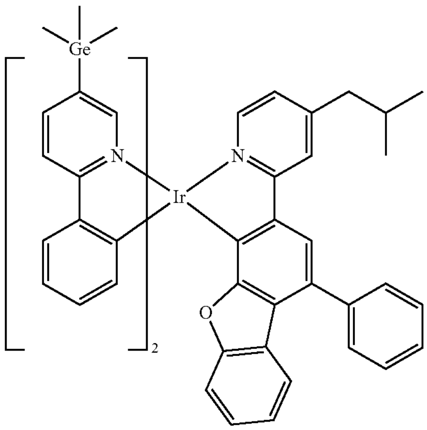
1886
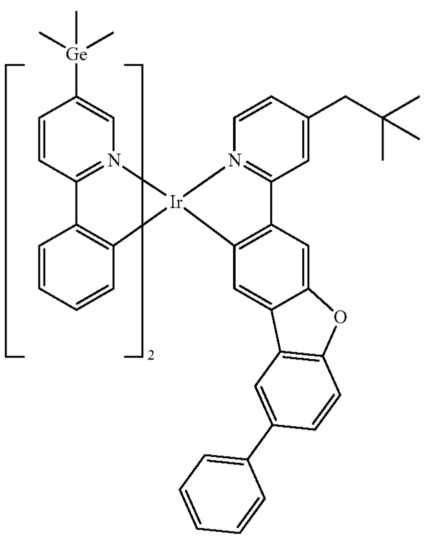
1887
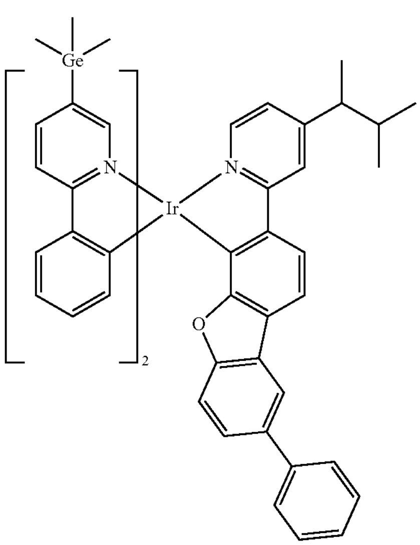
-continued
1888
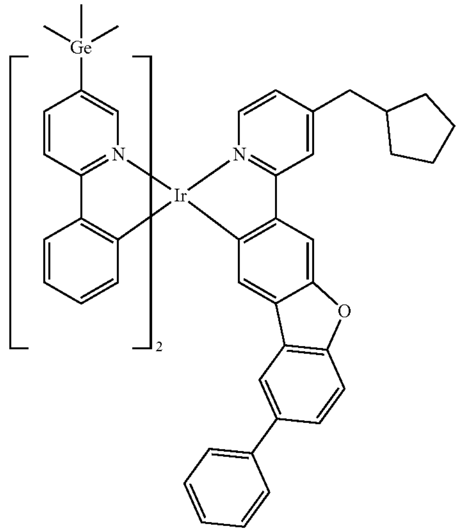
1889
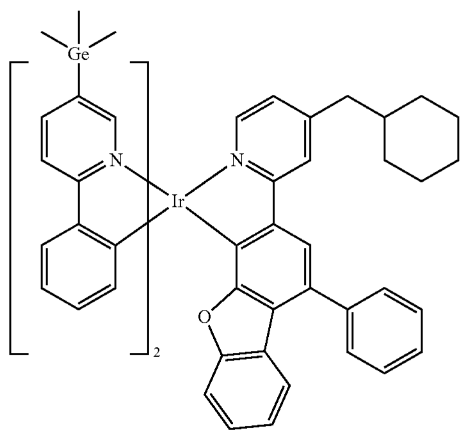
1890
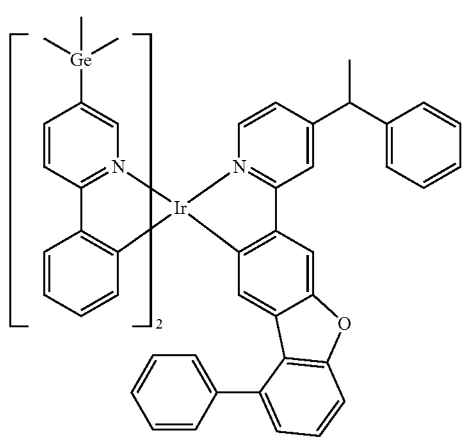

-continued
1891
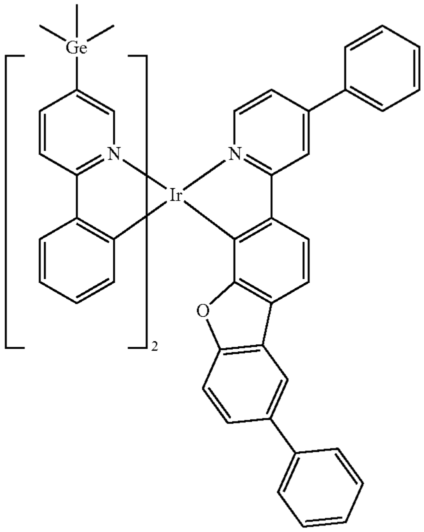
1892
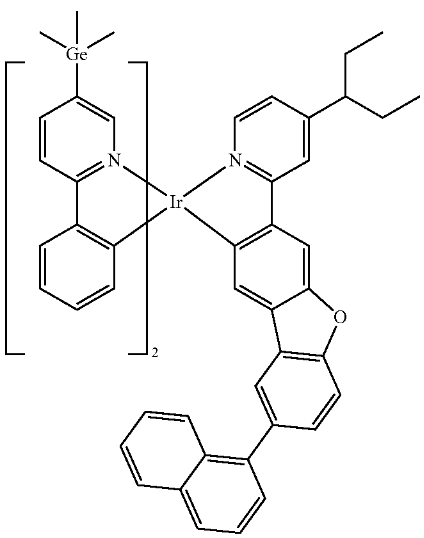
1893
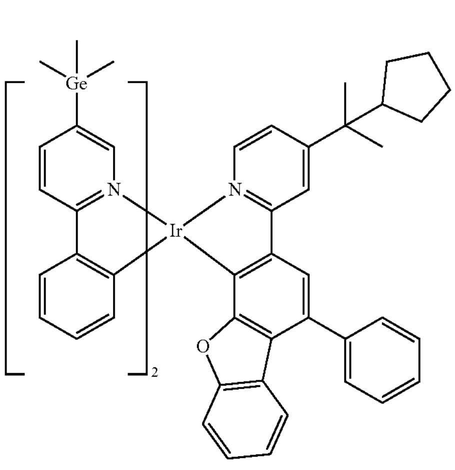
-continued
1894
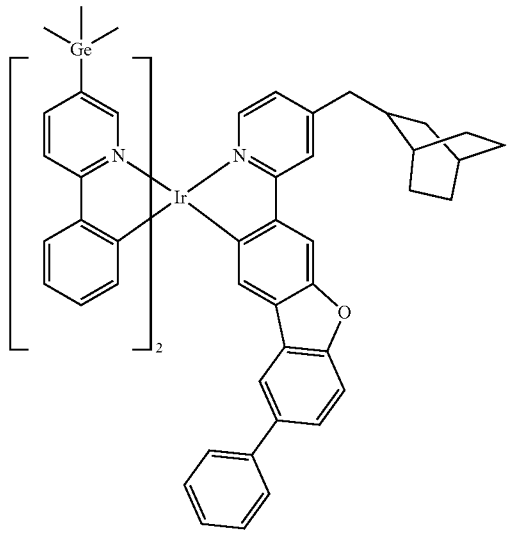
1895
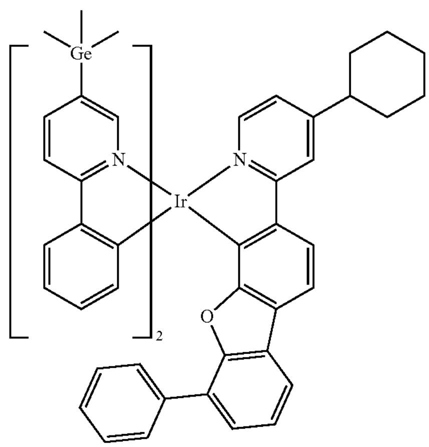
1896
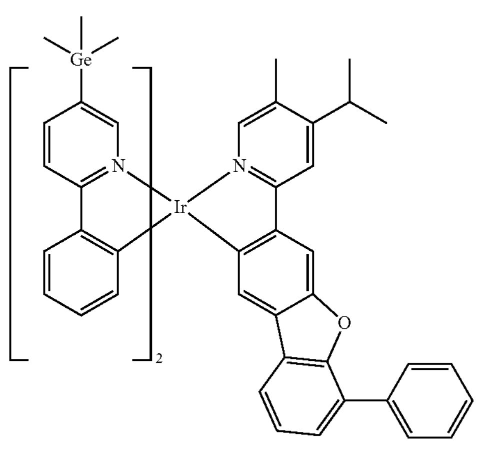

1897
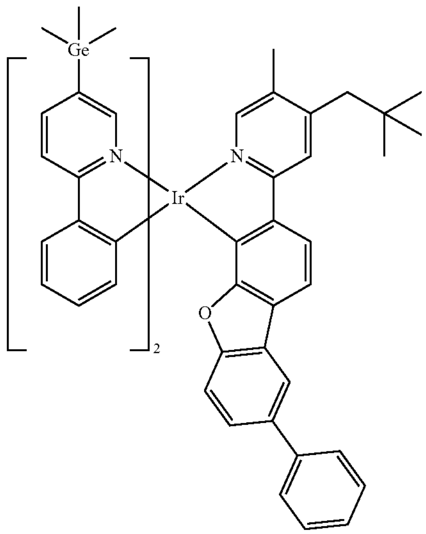
1898
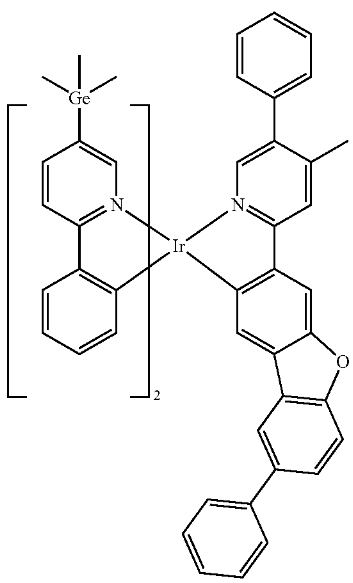
1899
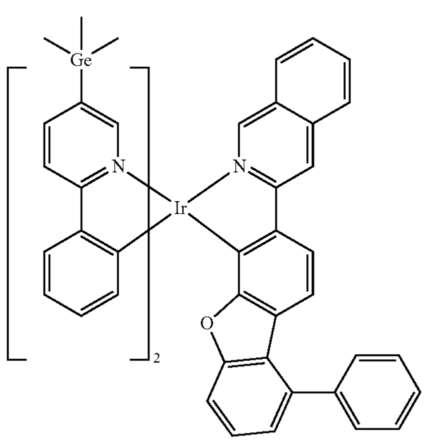
1900
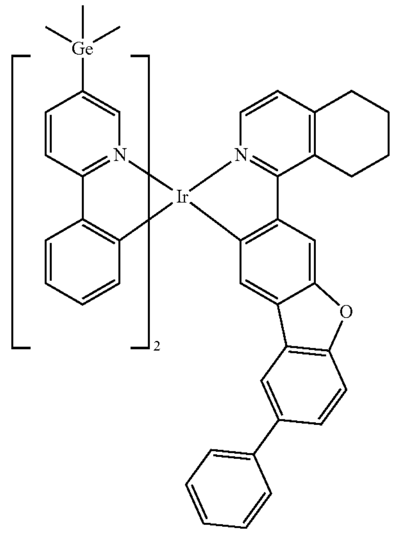
1901
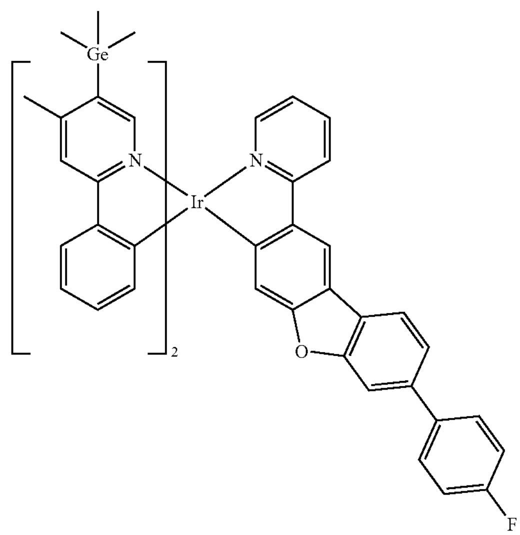
1902
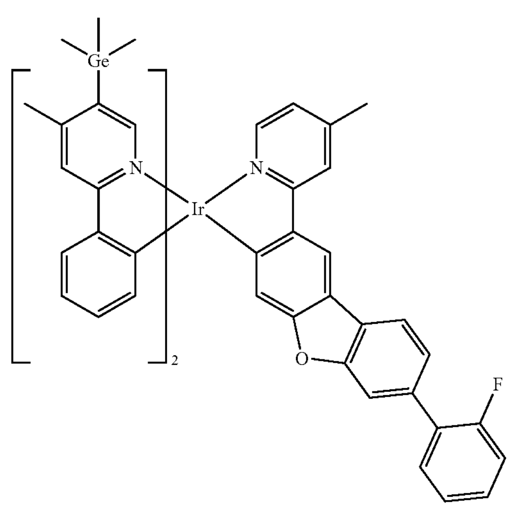

-continued
1903
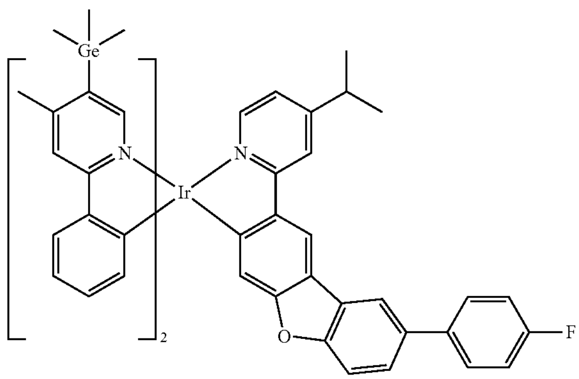
1904
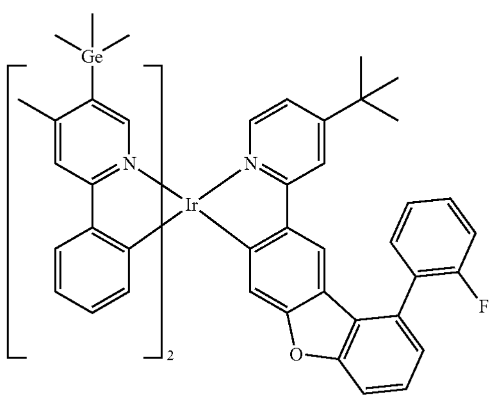
1905
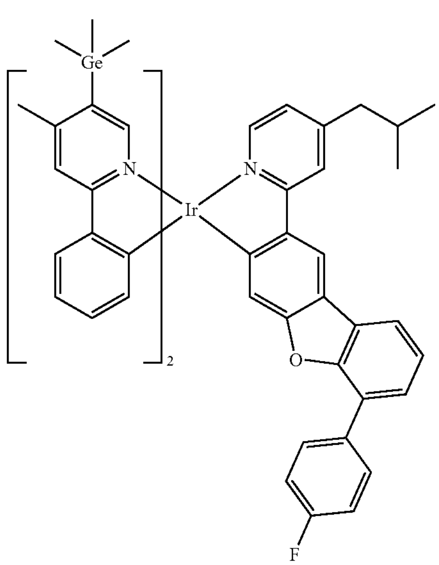
-continued
1906
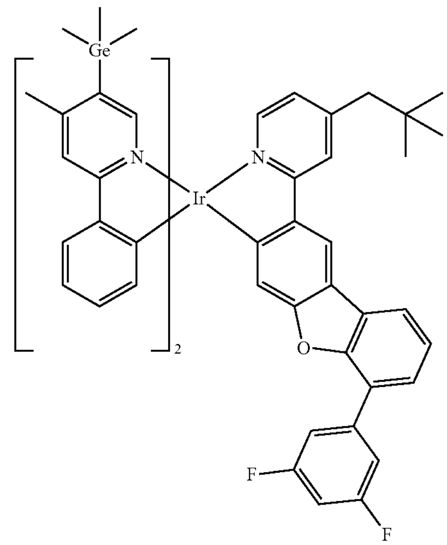
1907
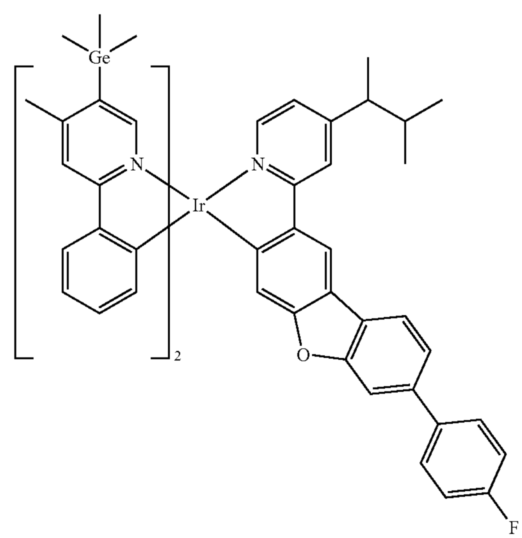
1908
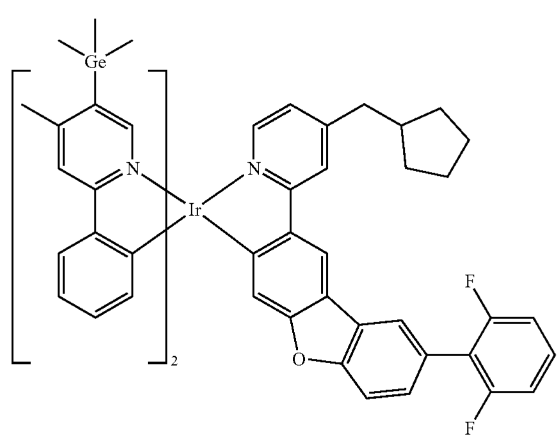

-continued
1909
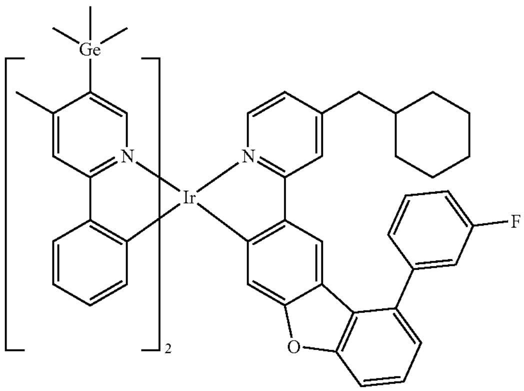
1910
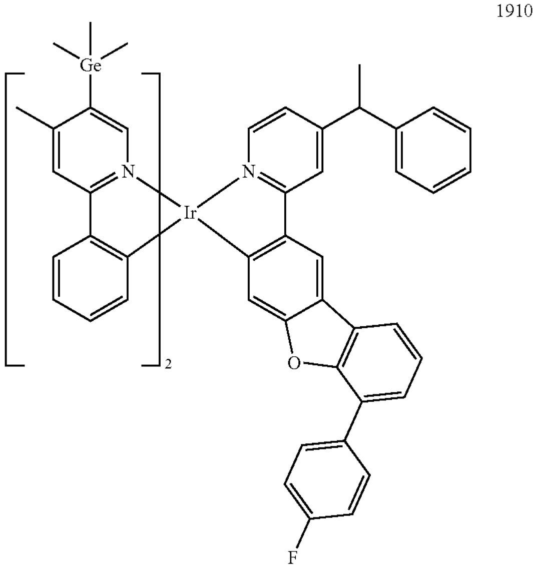
1911
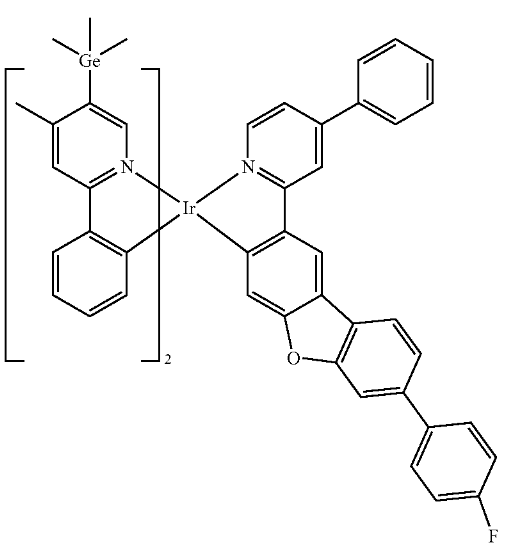
-continued
1912
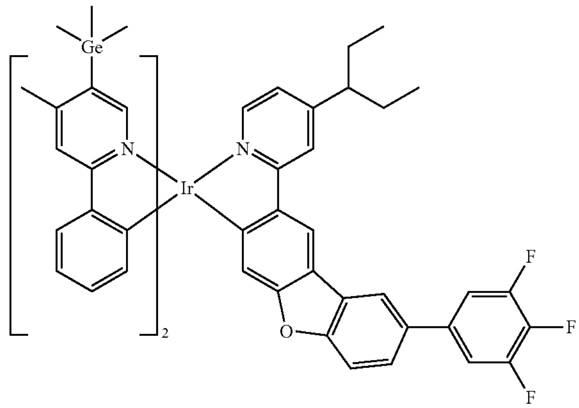
1913
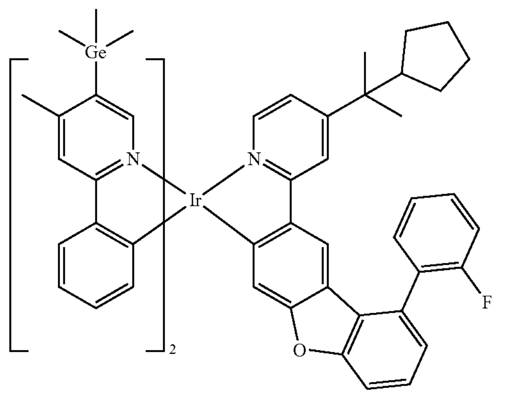
1914
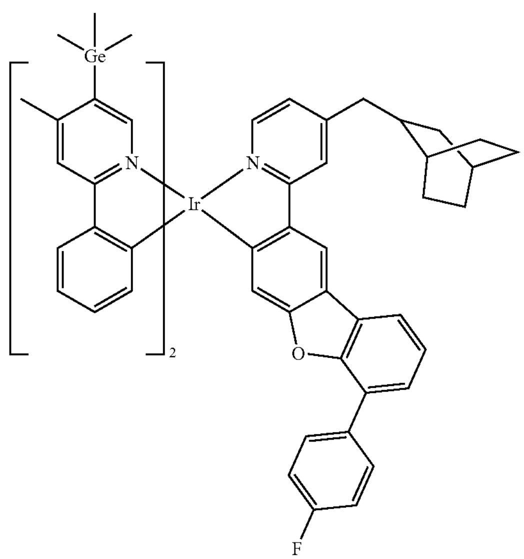

-continued
1915
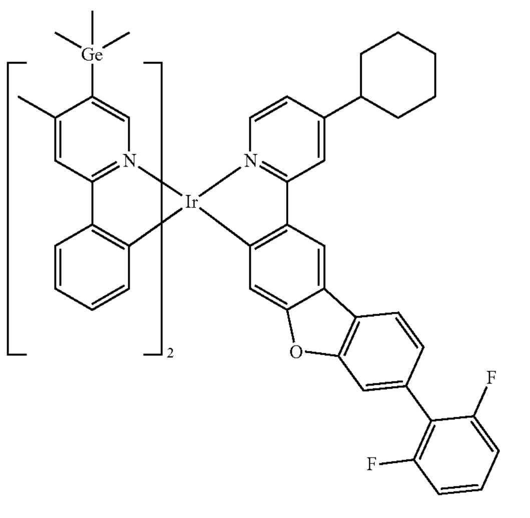
1916
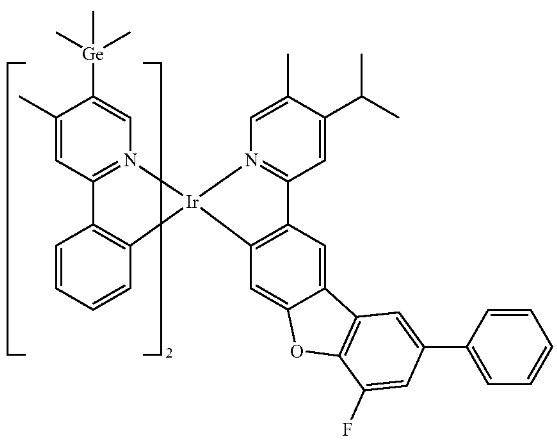
1917
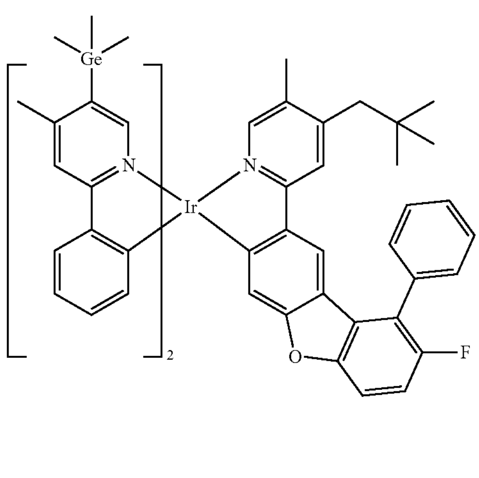
-continued
1918
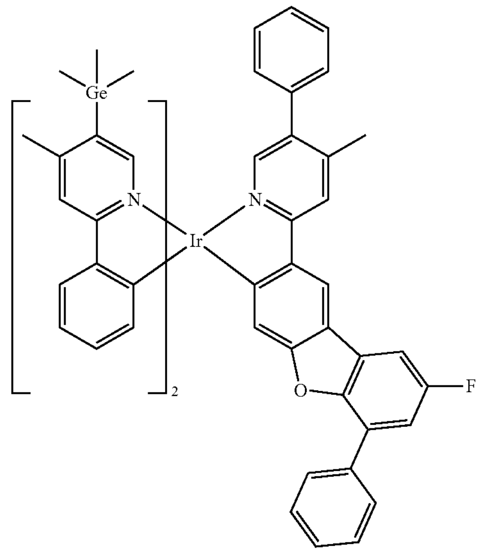
1919
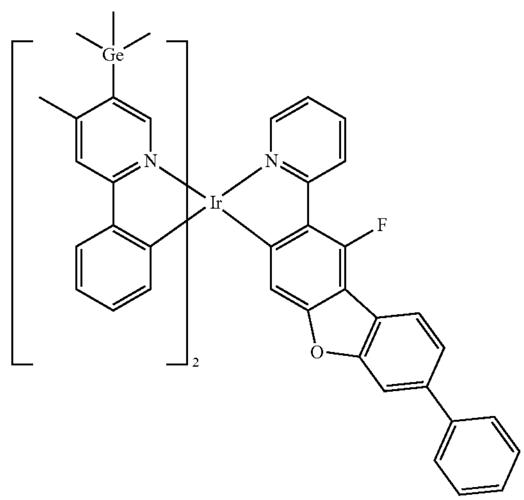
1920
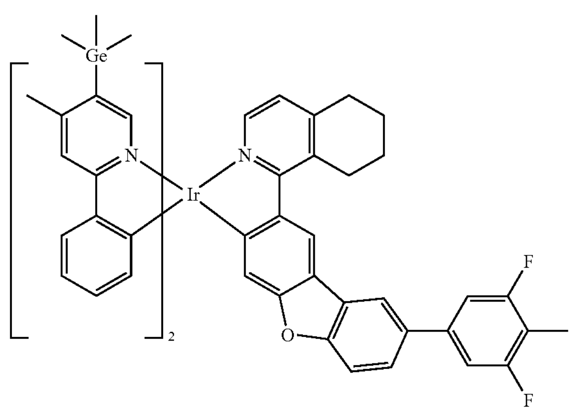

-continued
1921
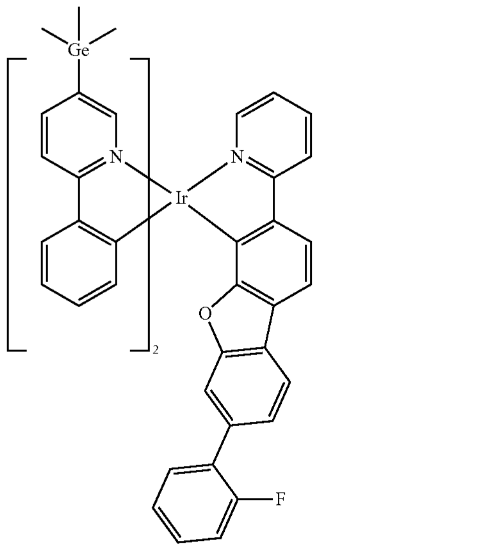
1922
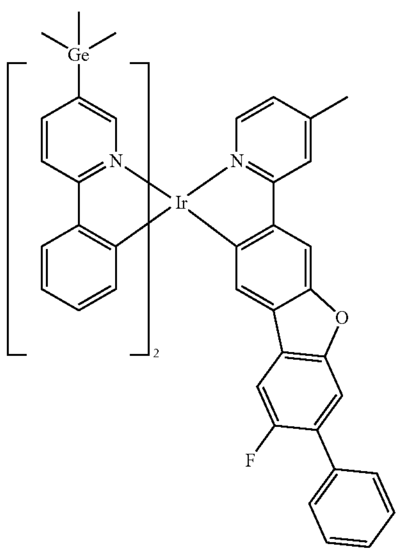
1923
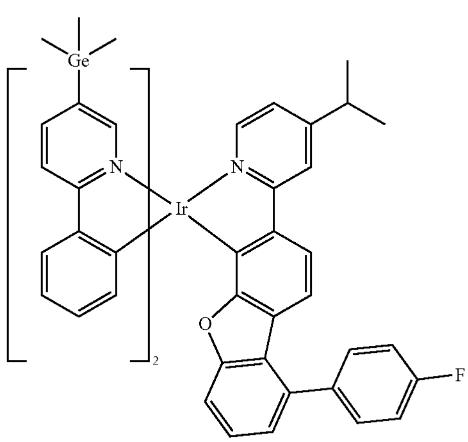
-continued
1924
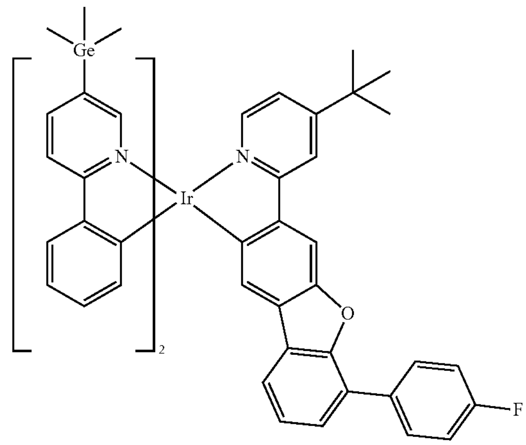
1925
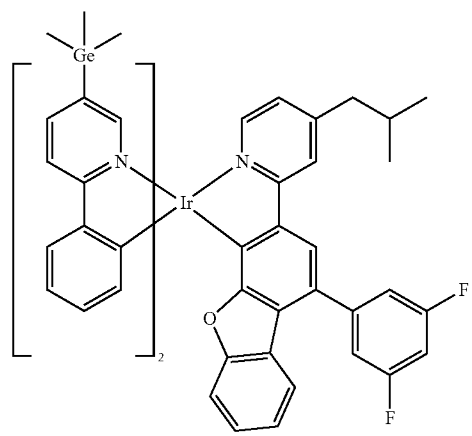
1926
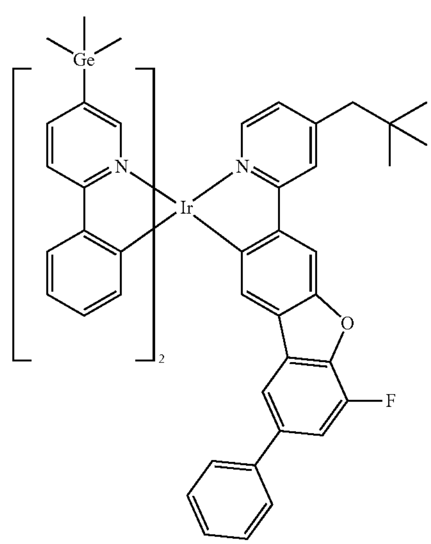

-continued
1927
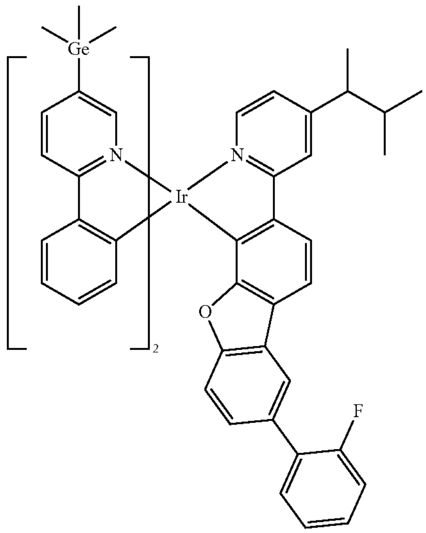
1928
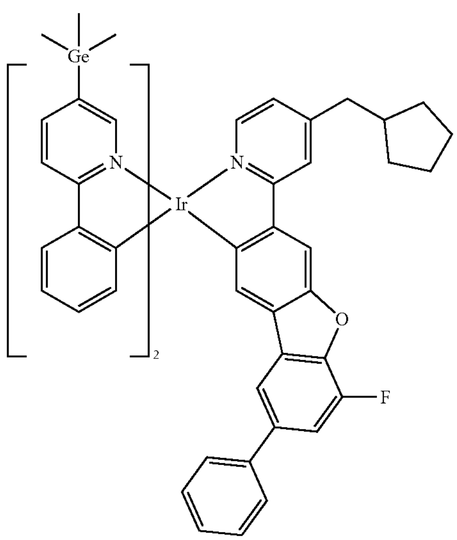
1929
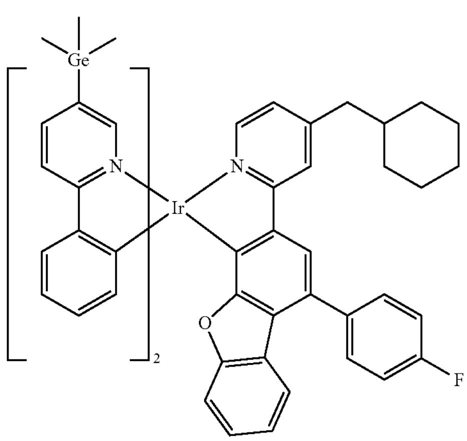
-continued
1930
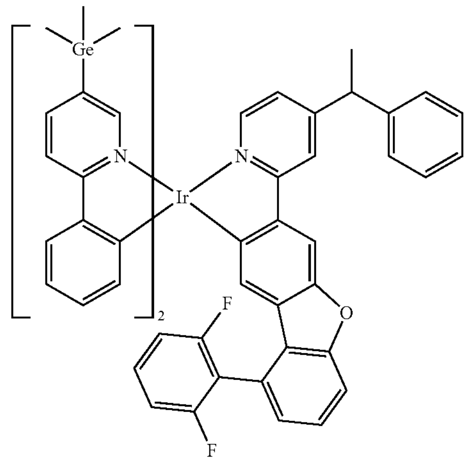
1931
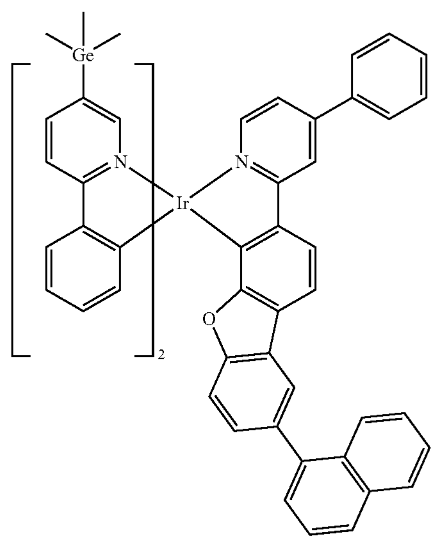
1932
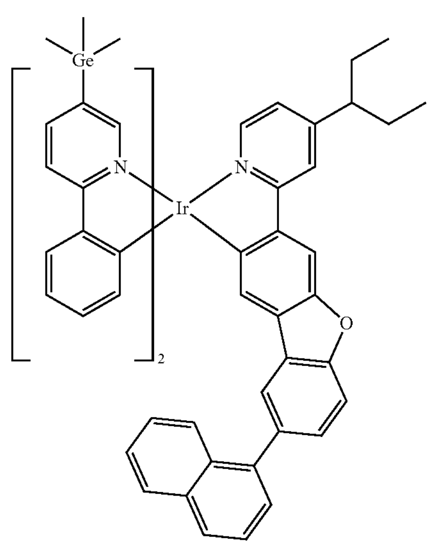

1933
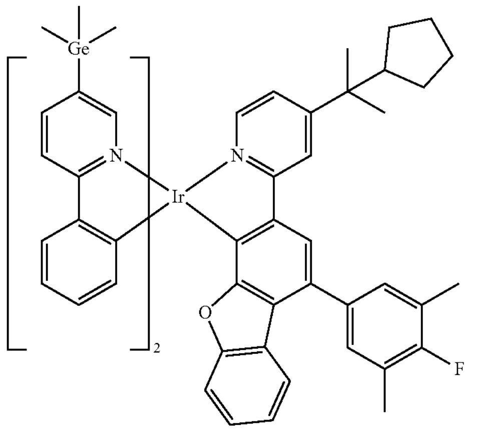
1934
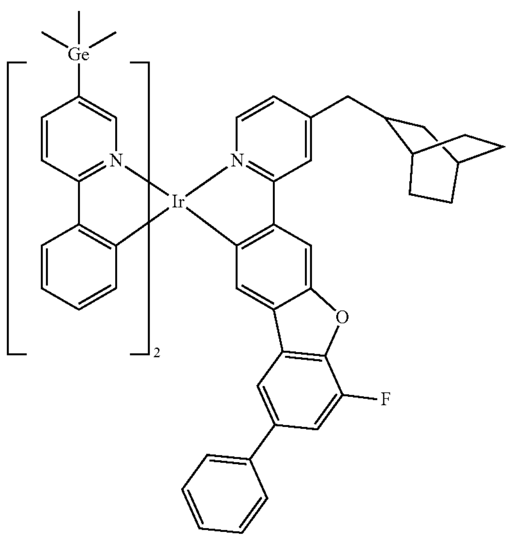
1935
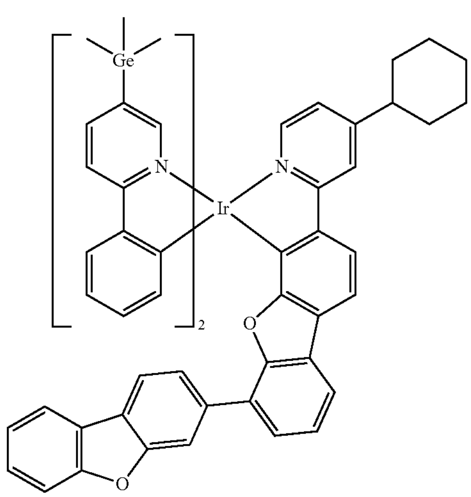
1936
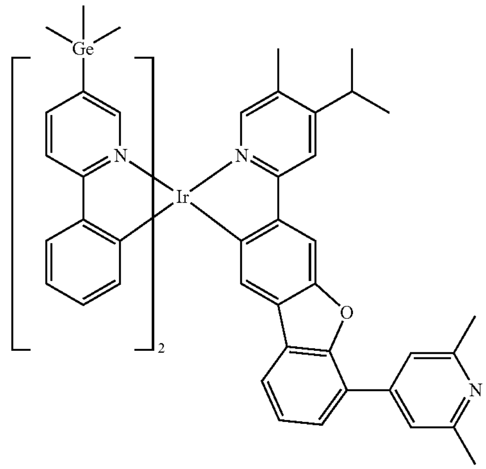
1937
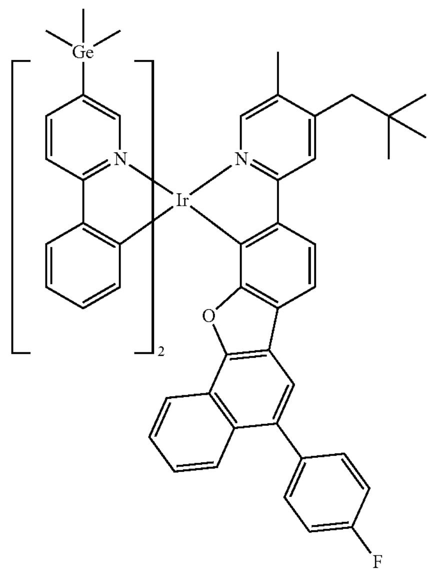
1938
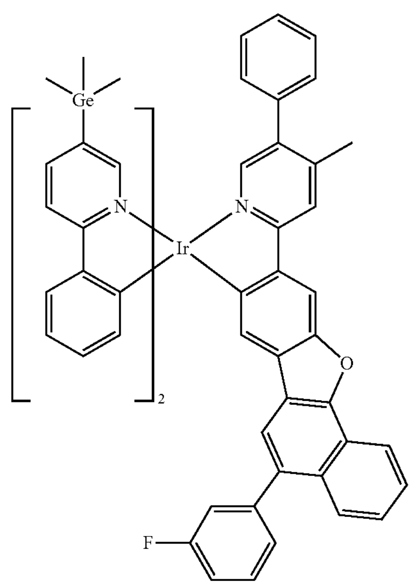

-continued
1939
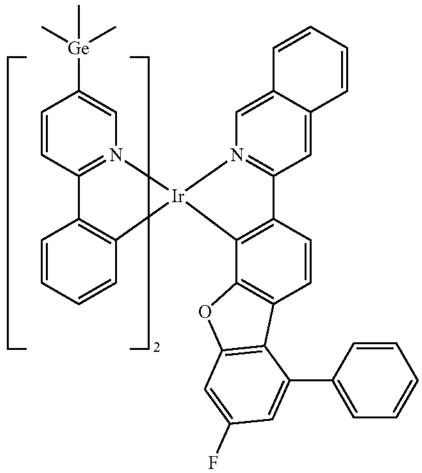
1940
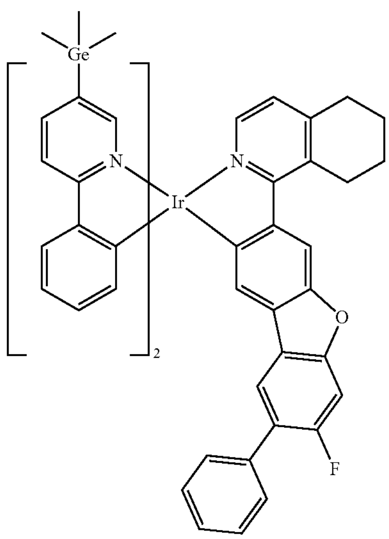
1941
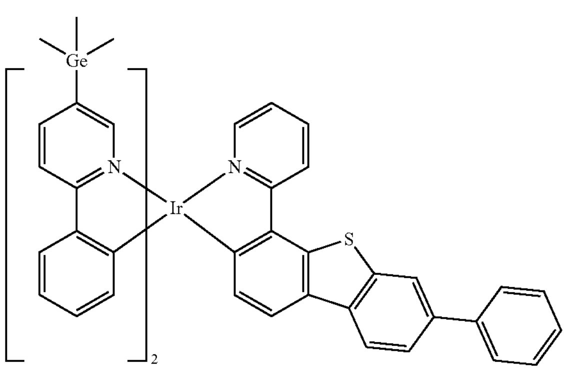
-continued
1942
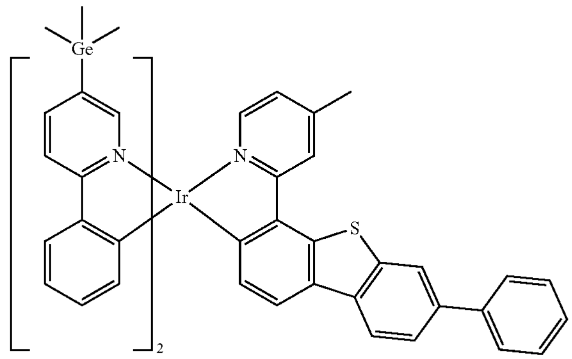
1943
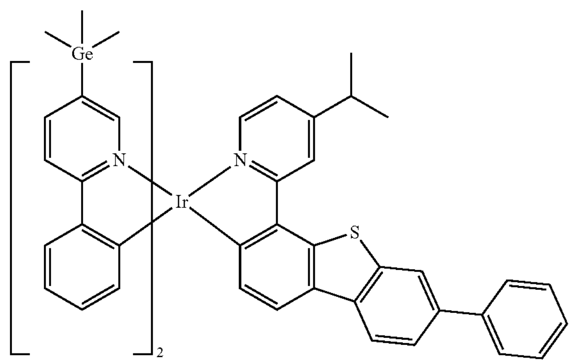
1944
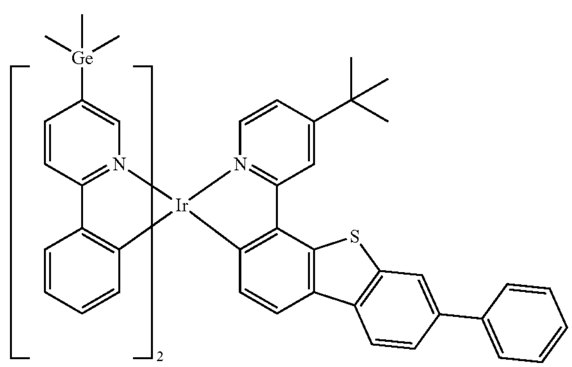
1945
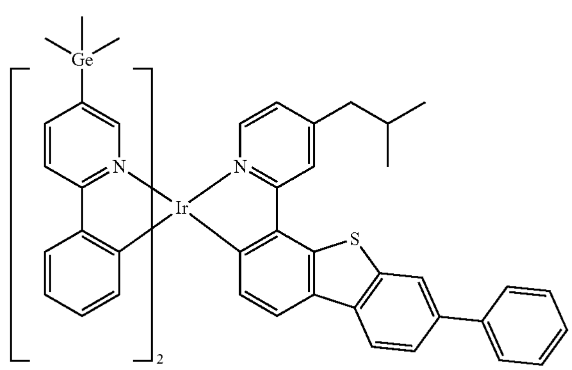

-continued
1946
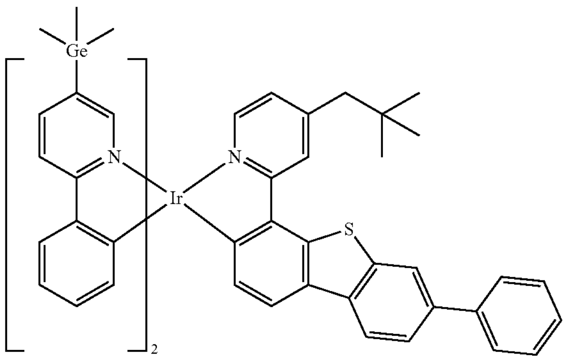
1947
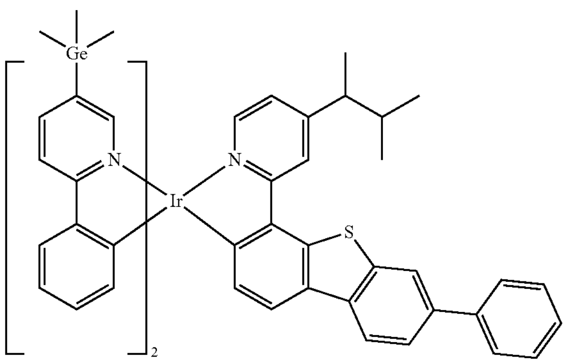
1948
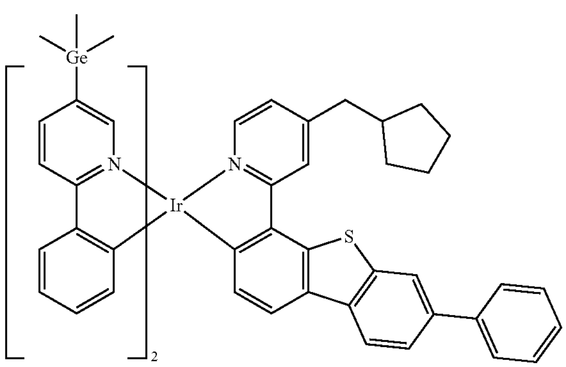
1949
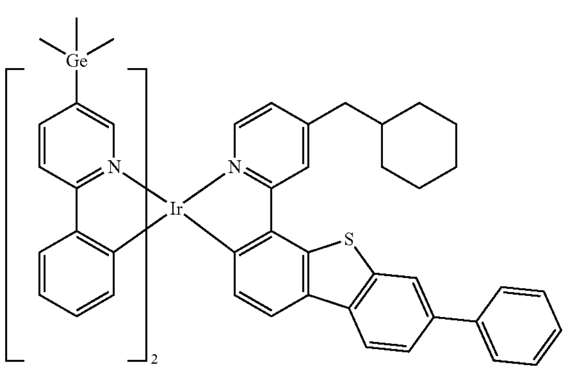
-continued
1950
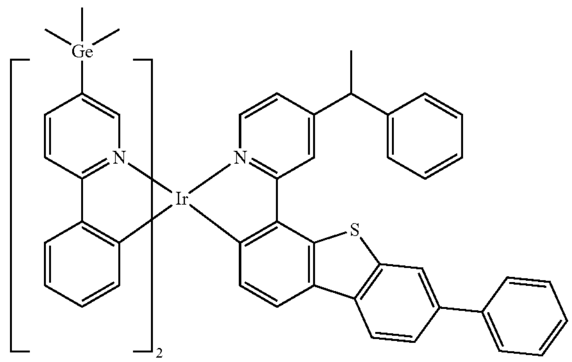
1951
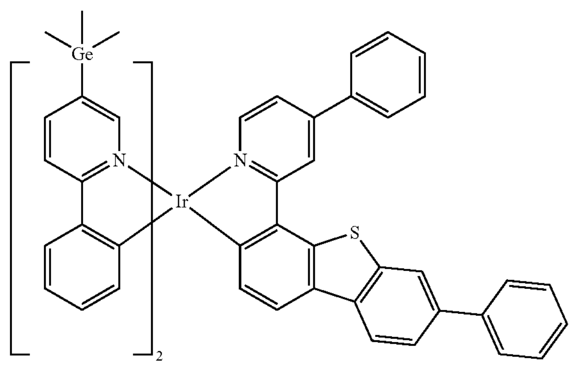
1952
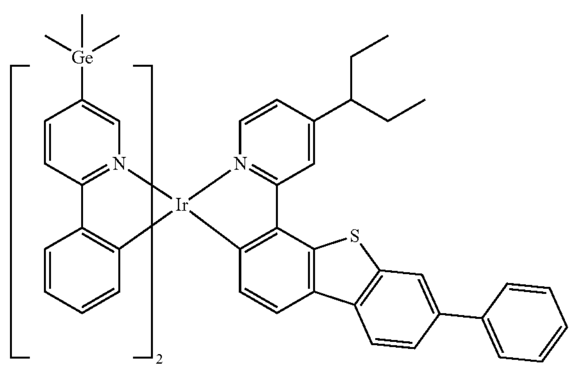
1953
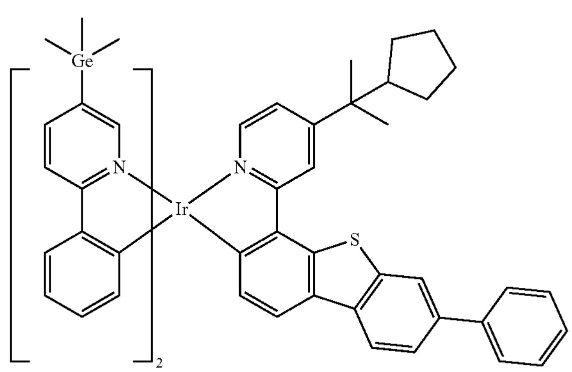

-continued
1954
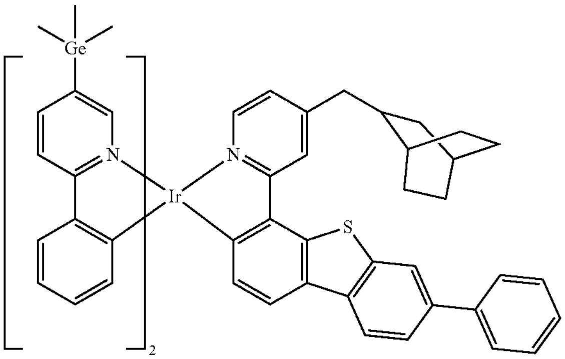
1955
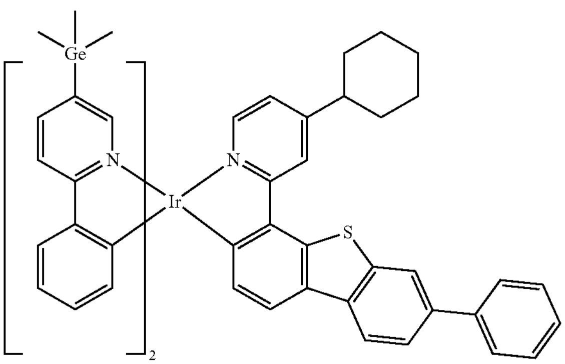
1956
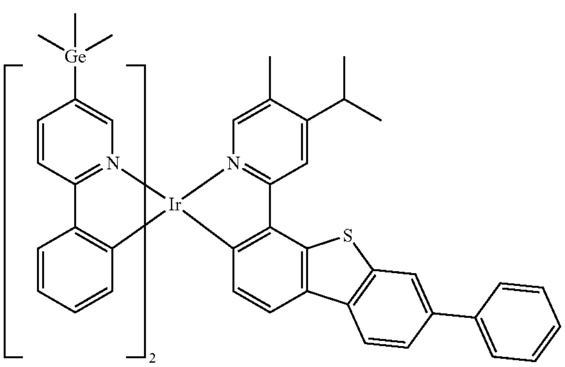
1957
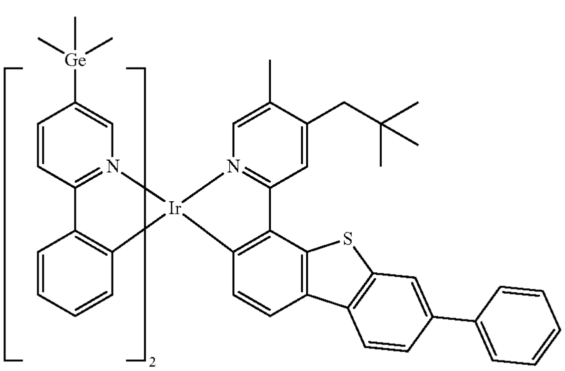
-continued
1958
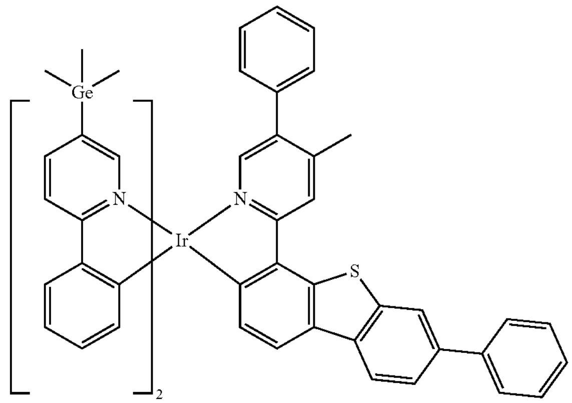
1959
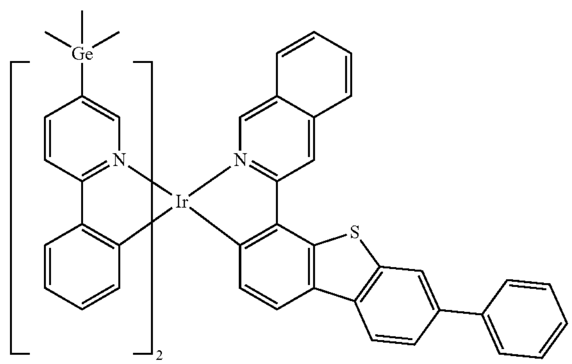
1960
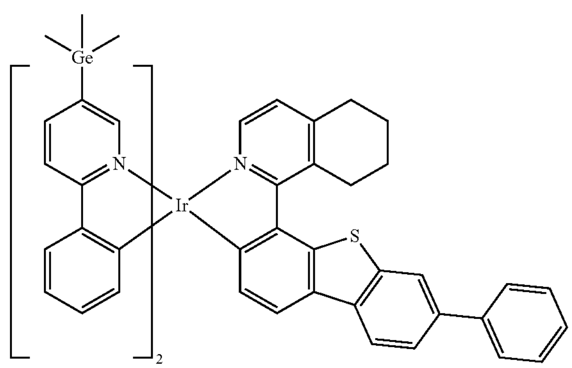
1961
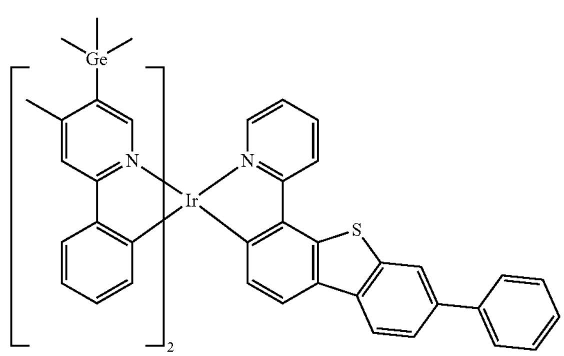

1962
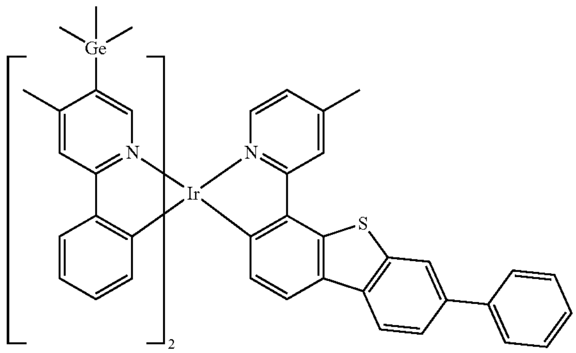
1963
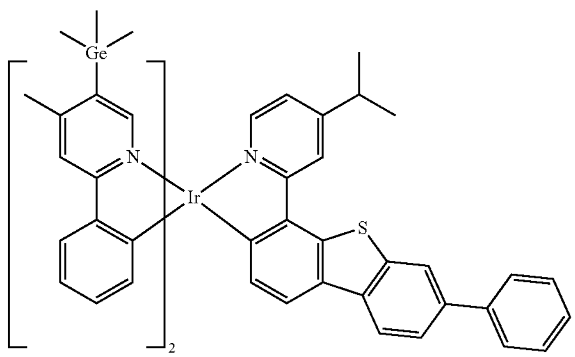
1964
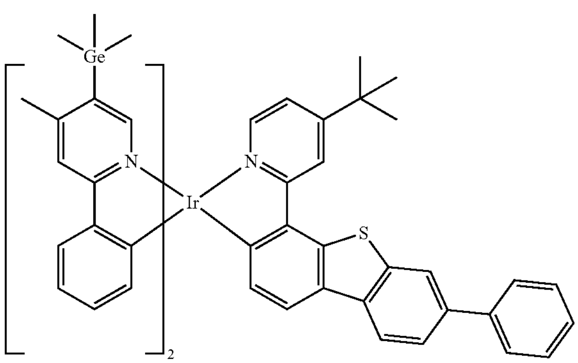
1965
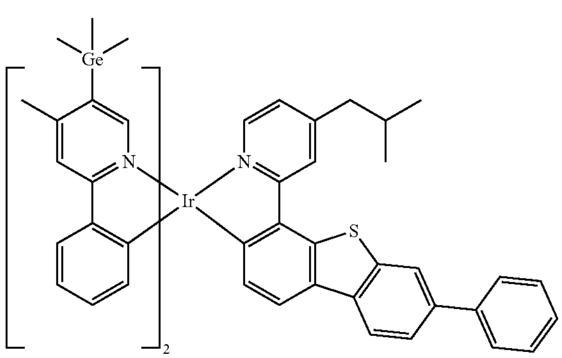
1966
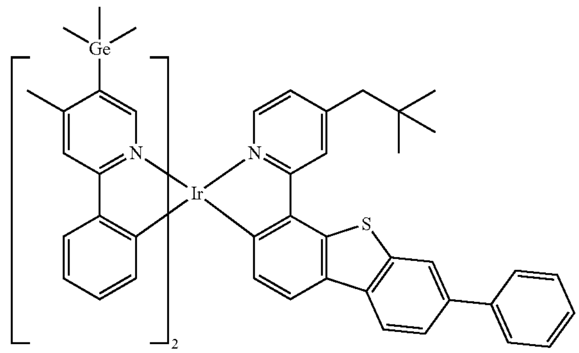
1967
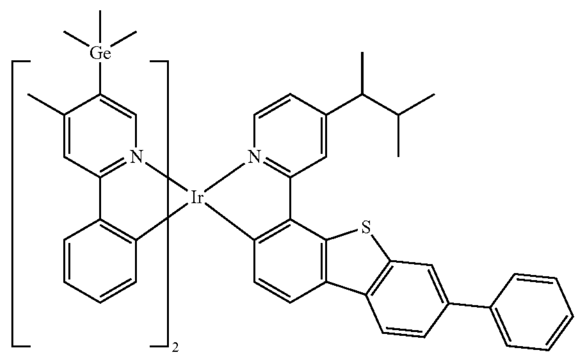
1968
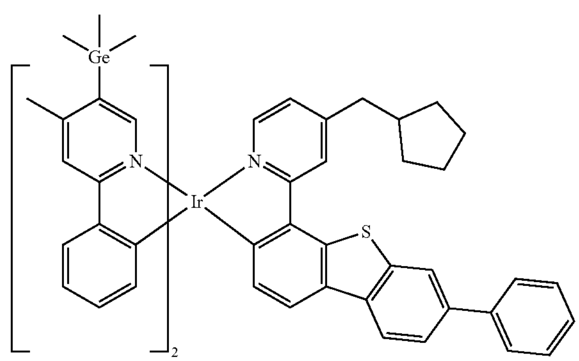
1969
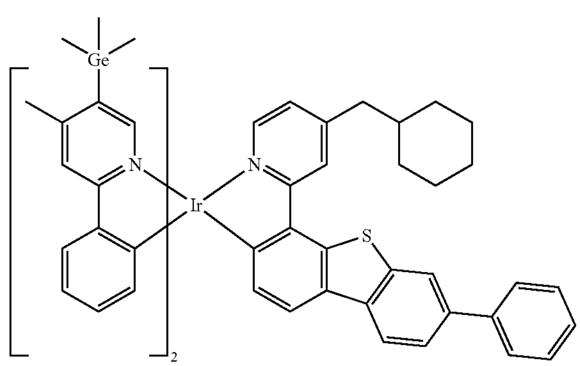

-continued
1970
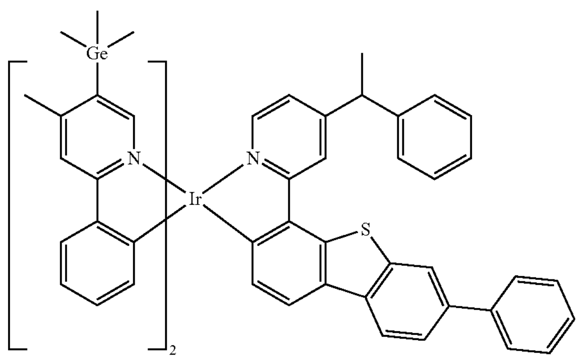
1971
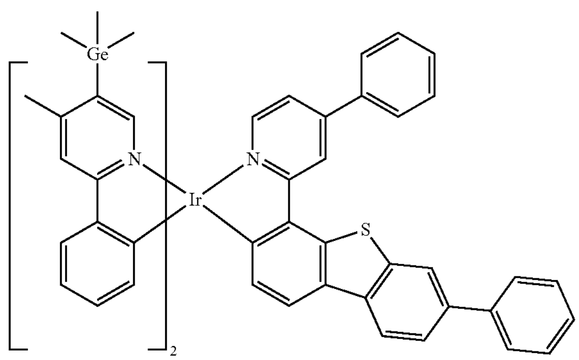
1972
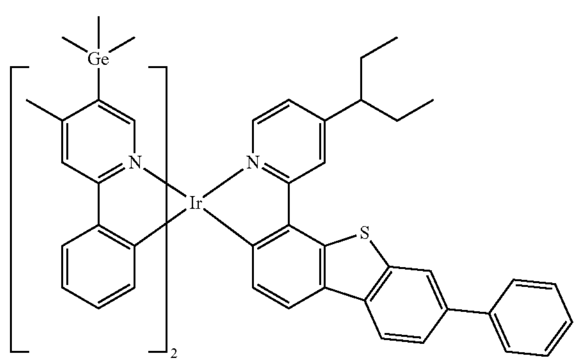
1973
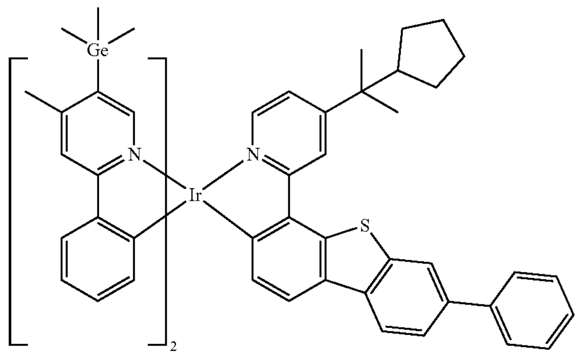
-continued
1974
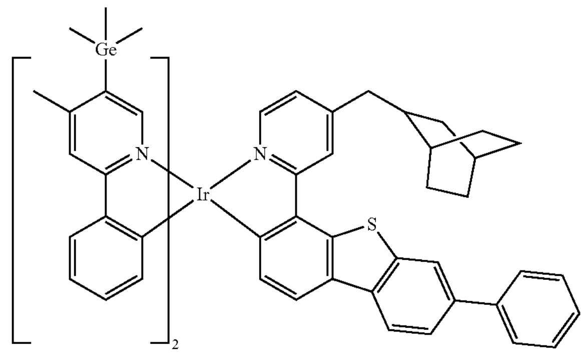
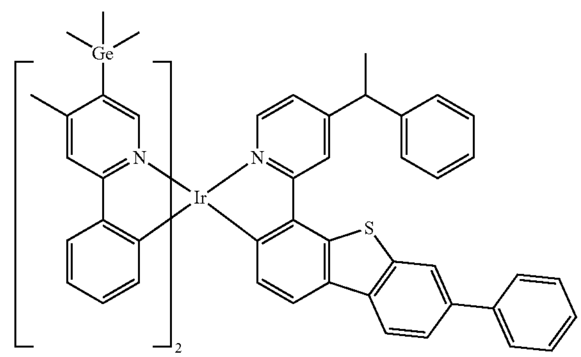
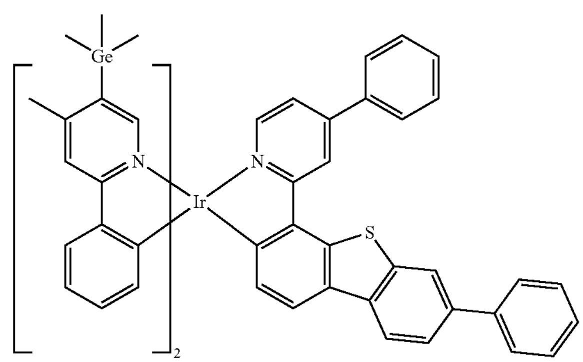
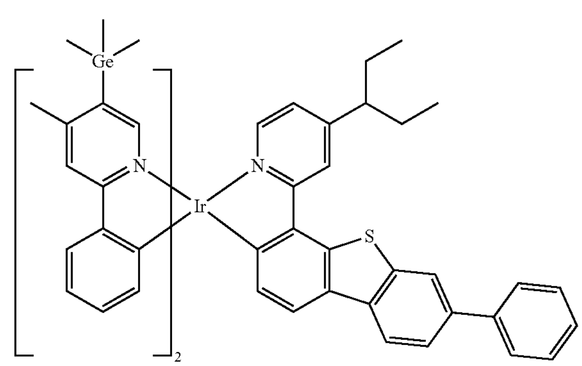

-continued
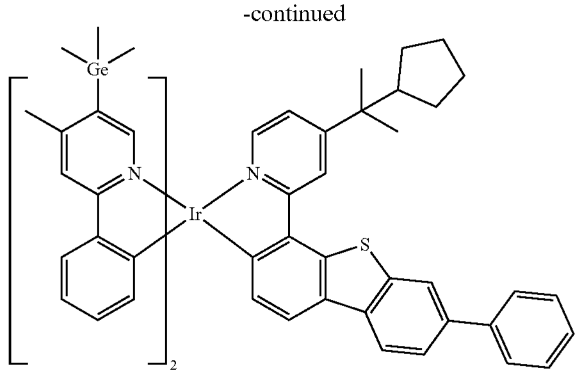
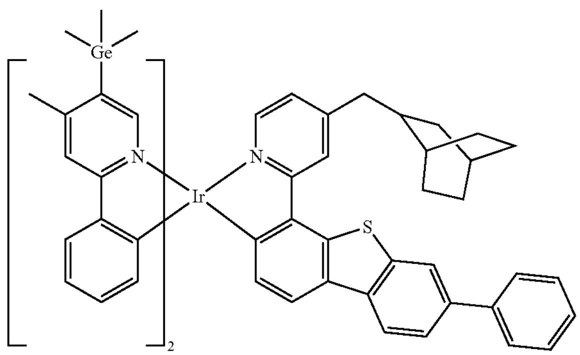
1975
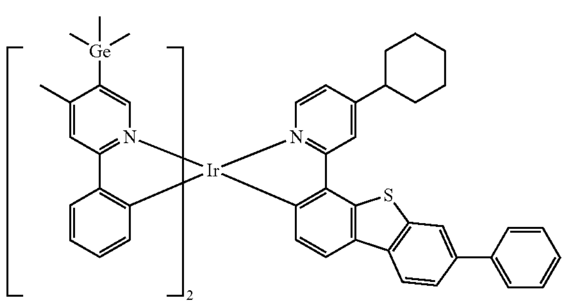
1976
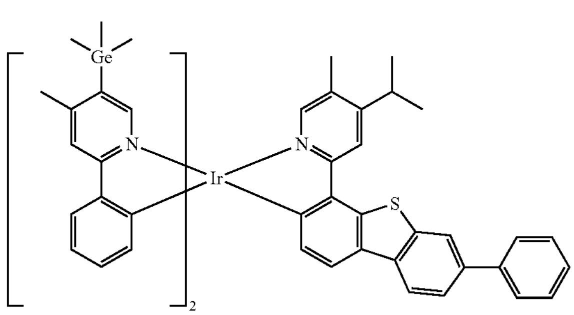
-continued
1977
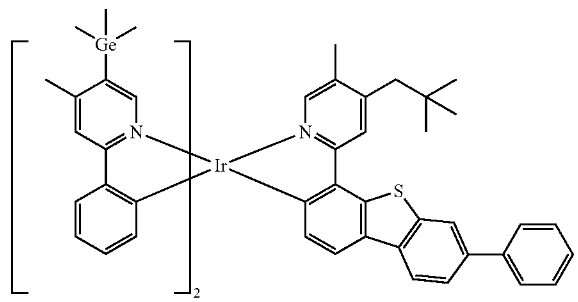
1978
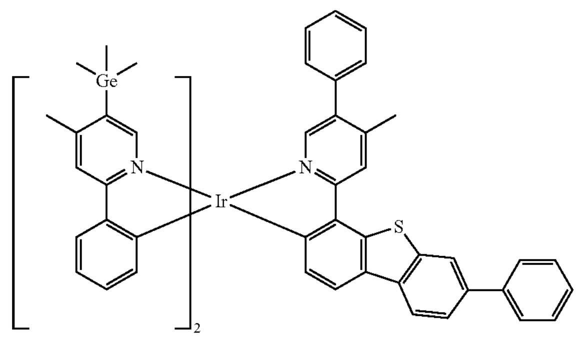
1979
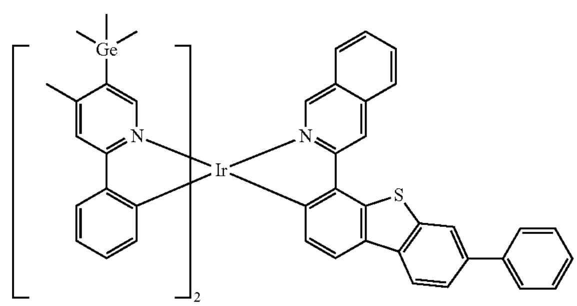
1980
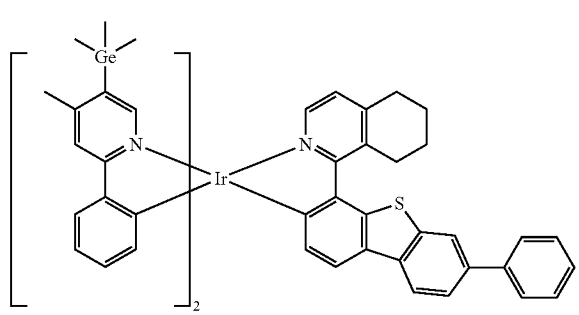

-continued
1981
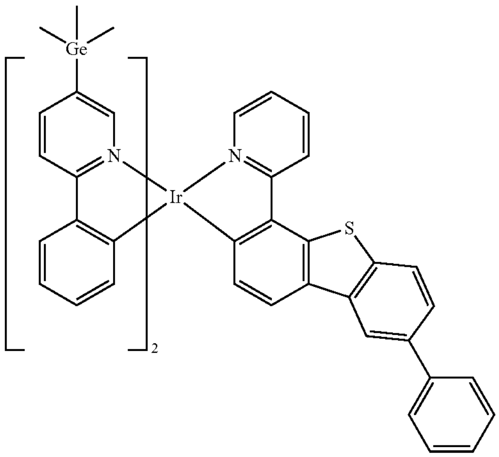
1982
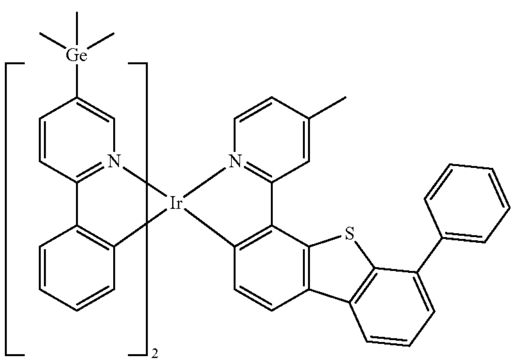
1983
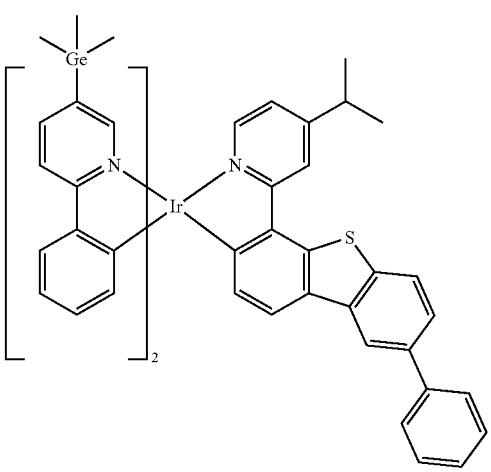
-continued
1984
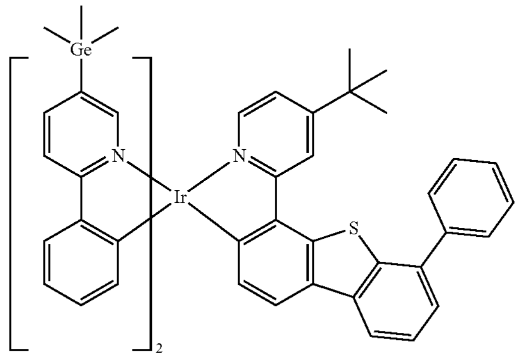
1985
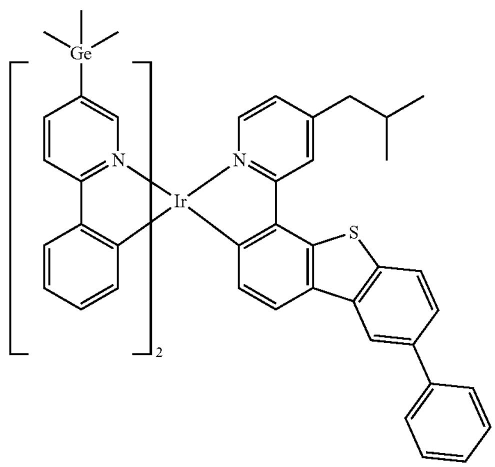
1986
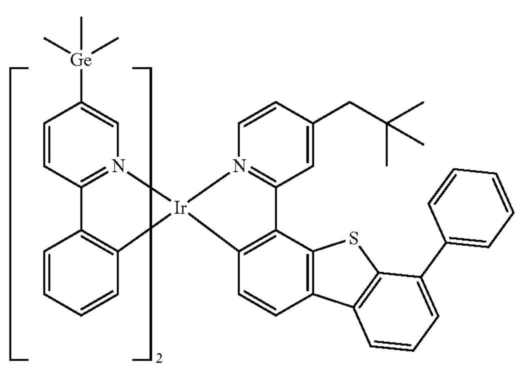

1987
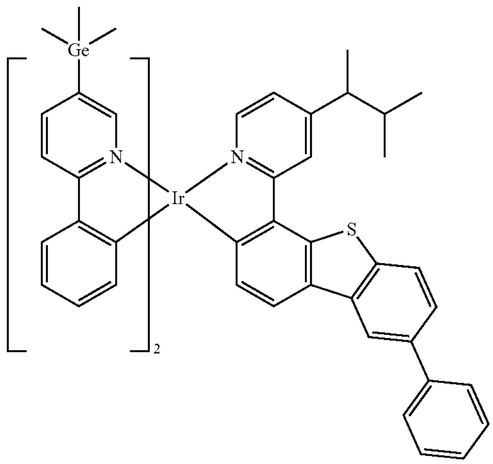
1988
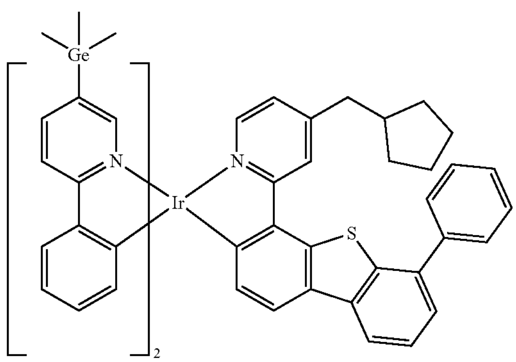
1989
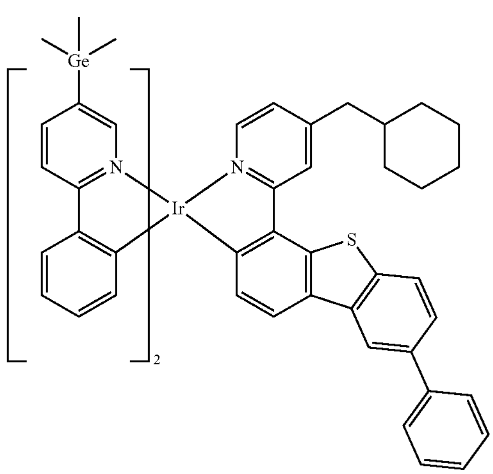
1990
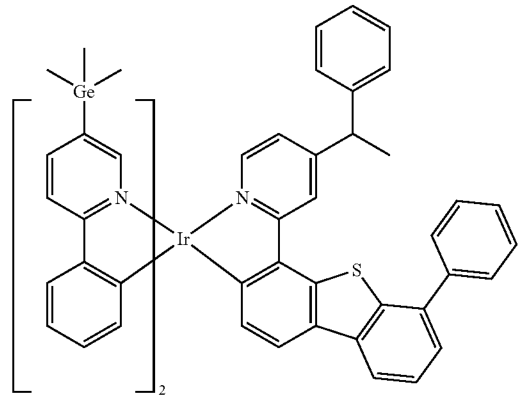
1991
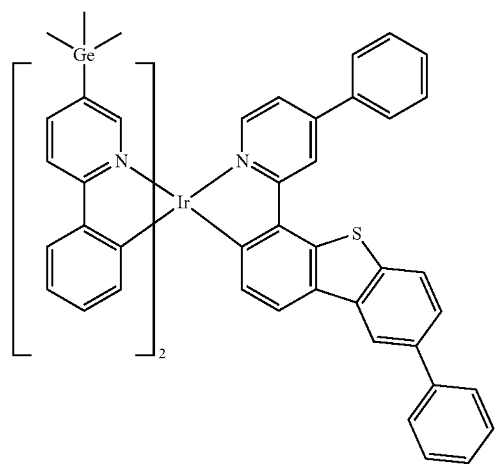
1992
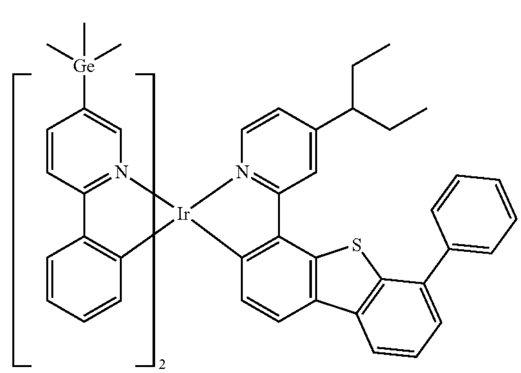

-continued
1993
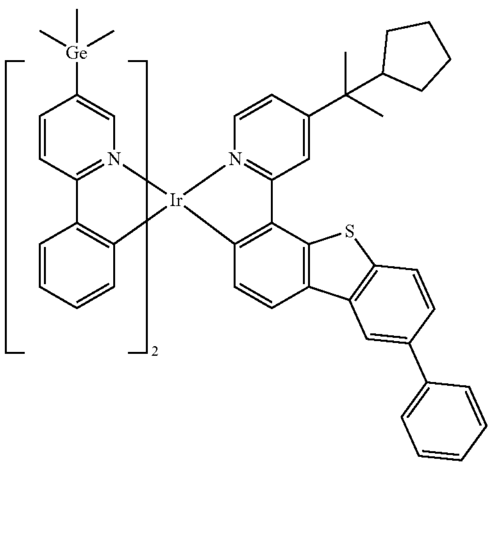
1994
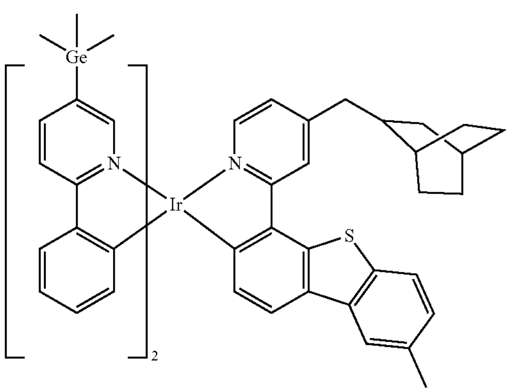
1995
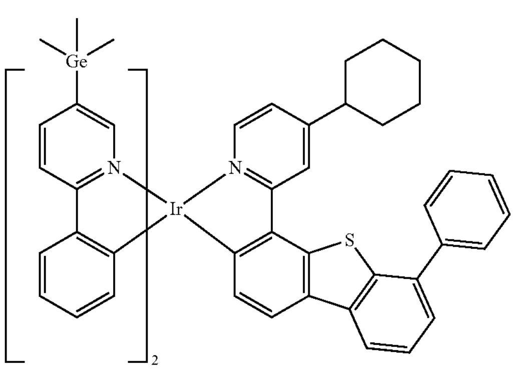
-continued
1996
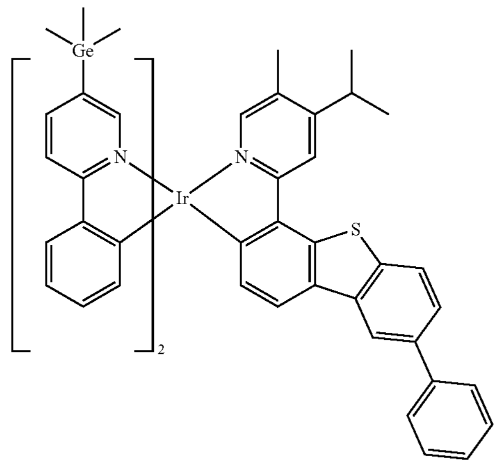
1997
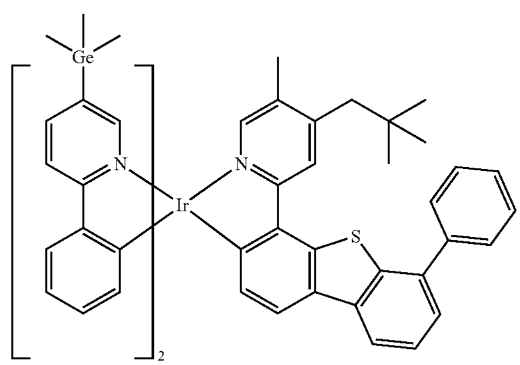
1998
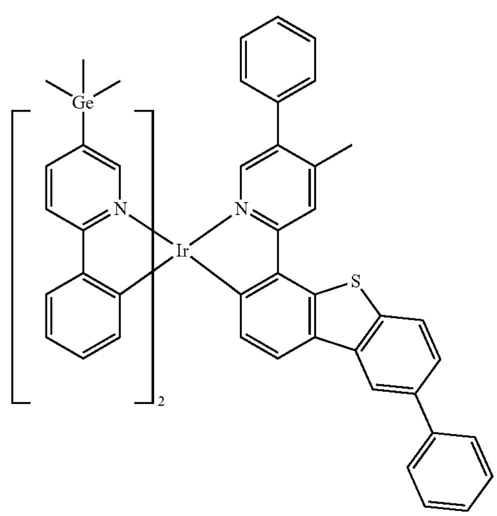

-continued
1999
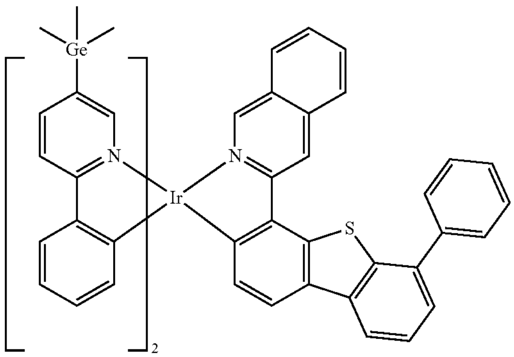
2000
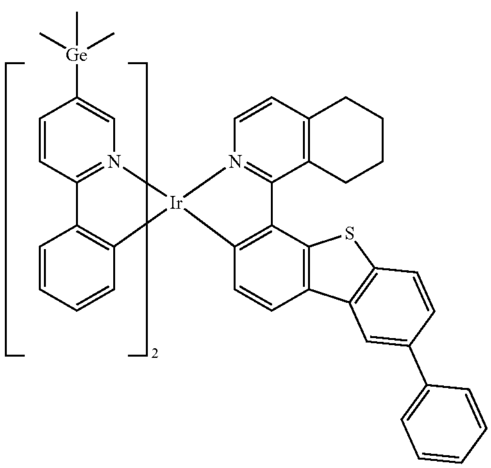
2001
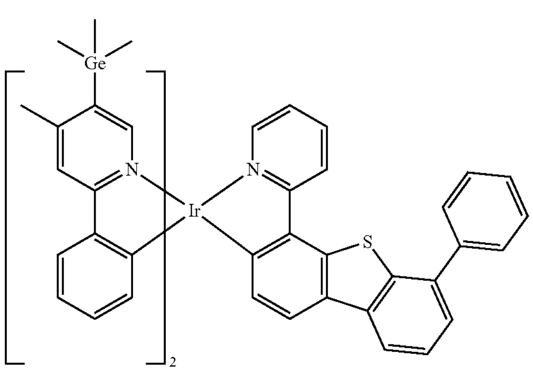
-continued
2002
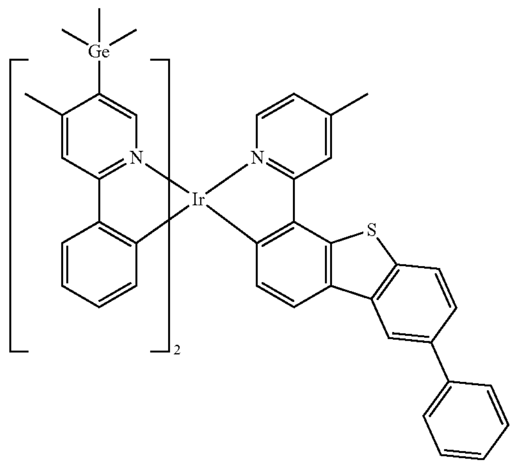
2003
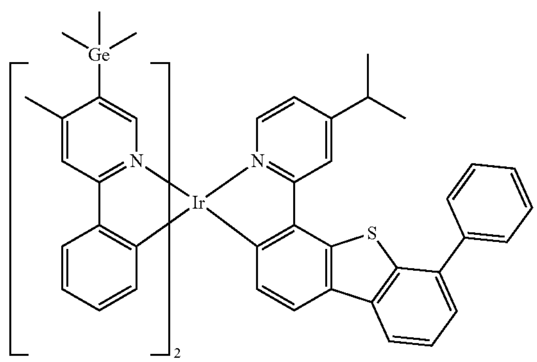
2004
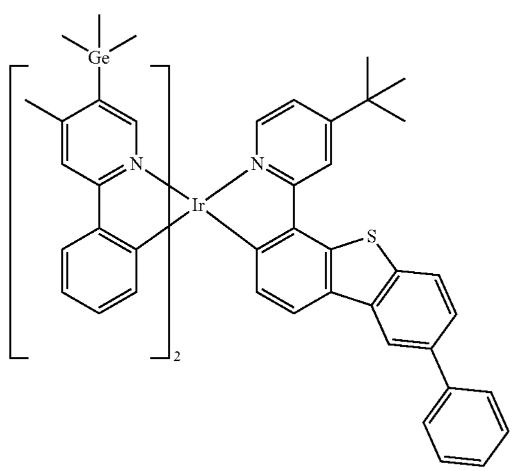

-continued
2005
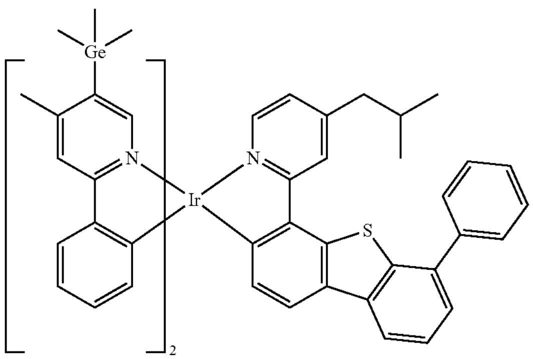
2006
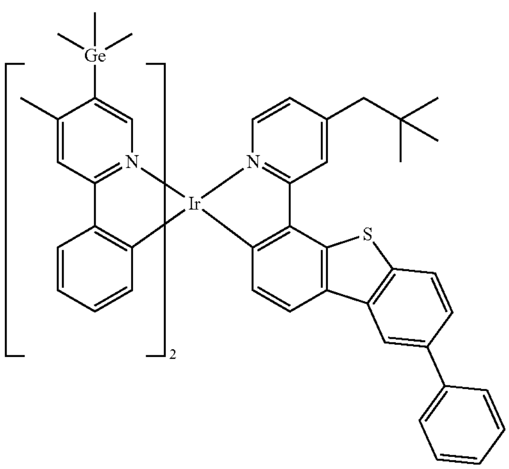
2007
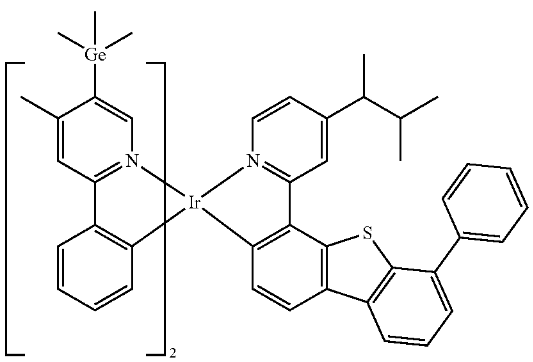
-continued
2008
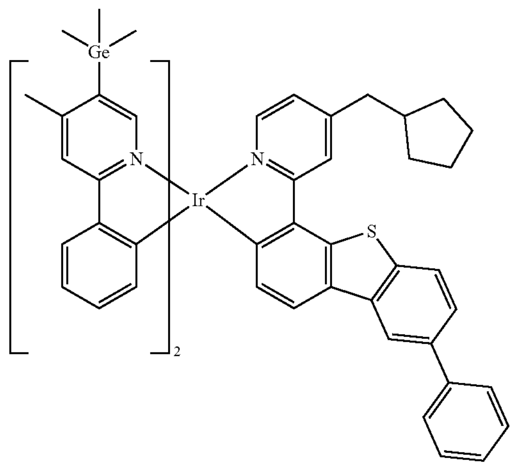
2009
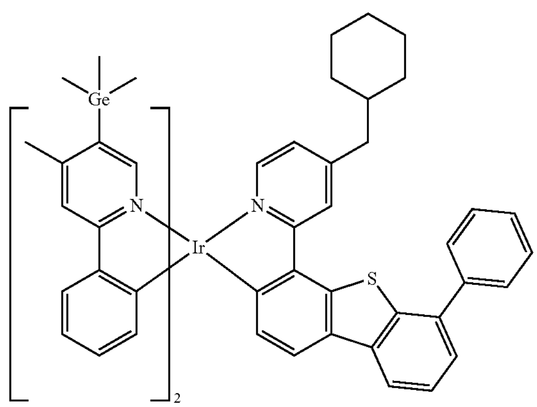
2010
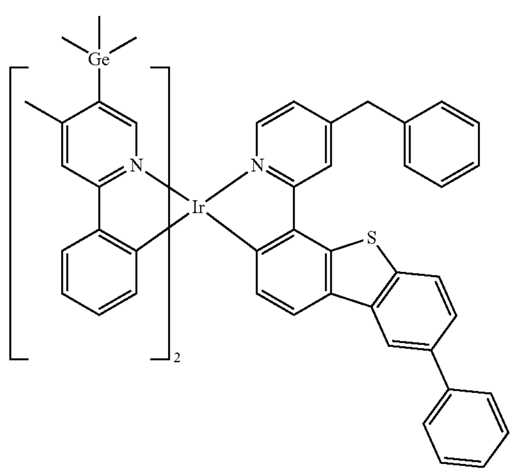

-continued
2011
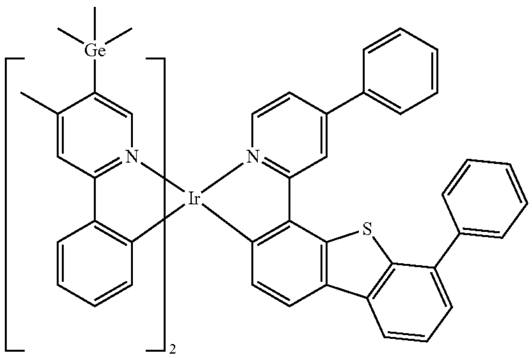
2012
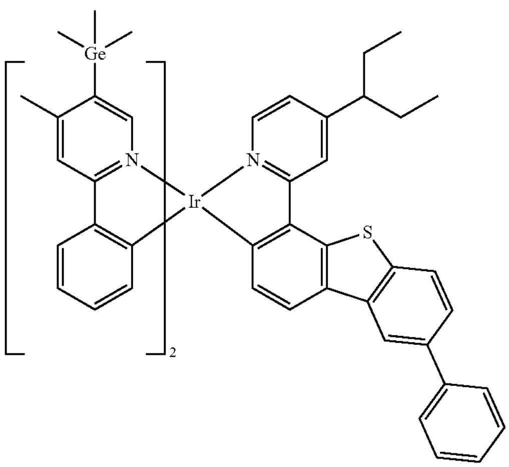
2013
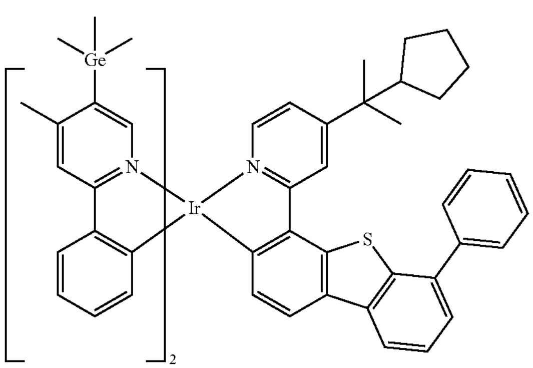
2014
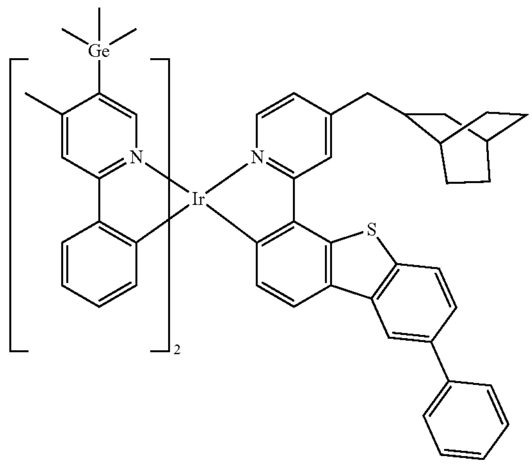
2015
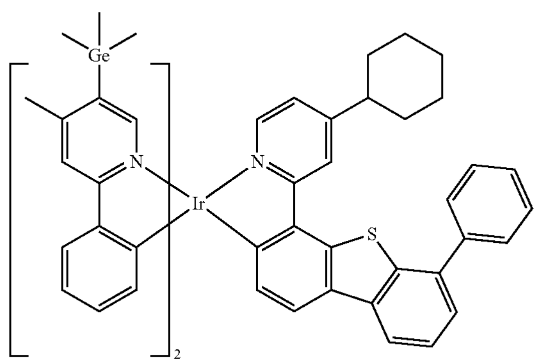
2016
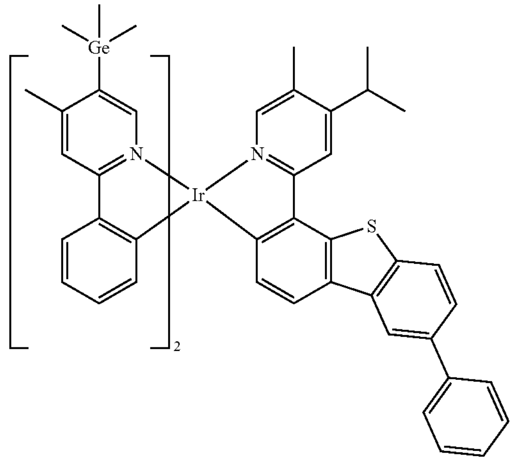

2017
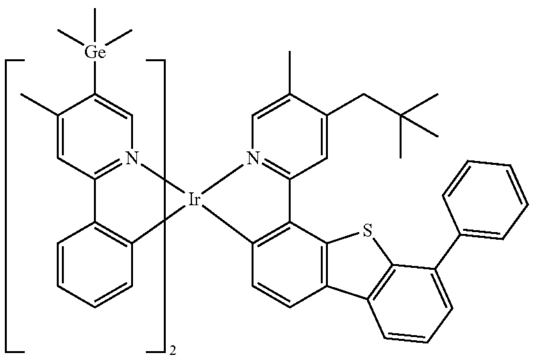
2018
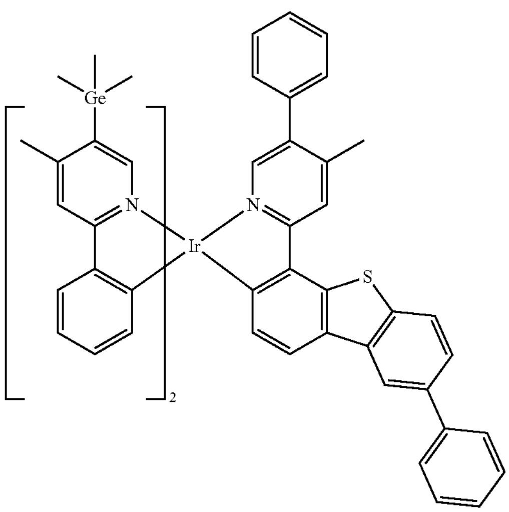
2019
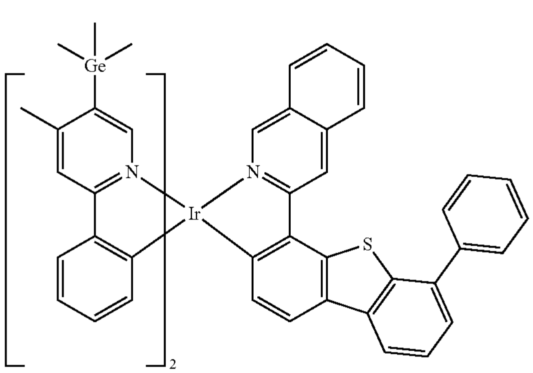
2020
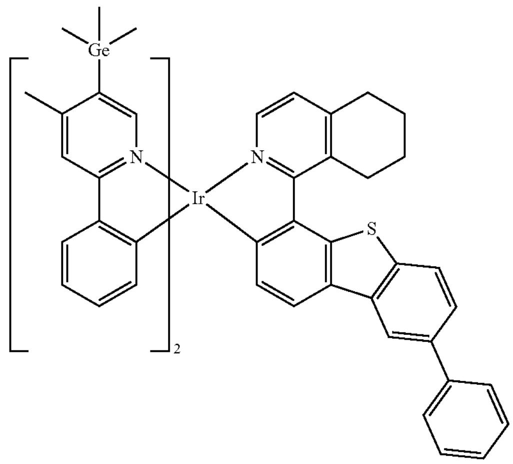
2021
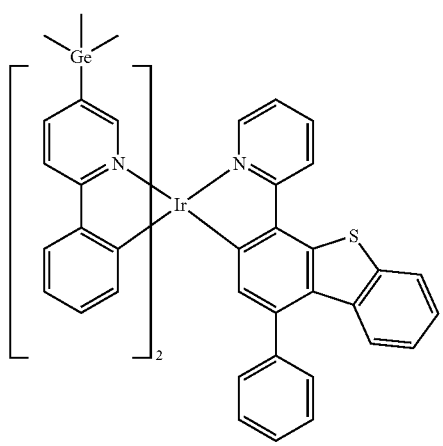
2022
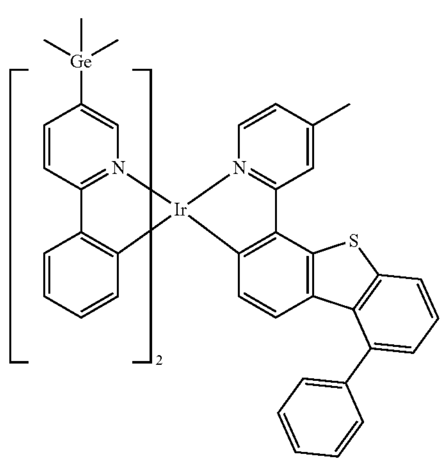

2023
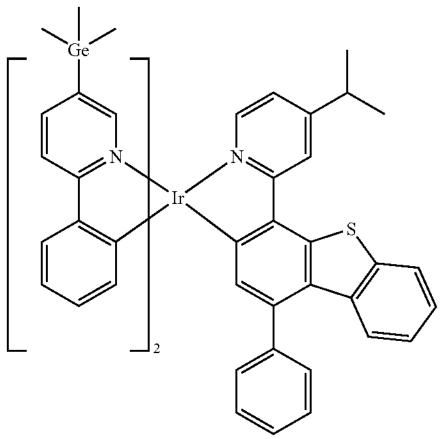
2024
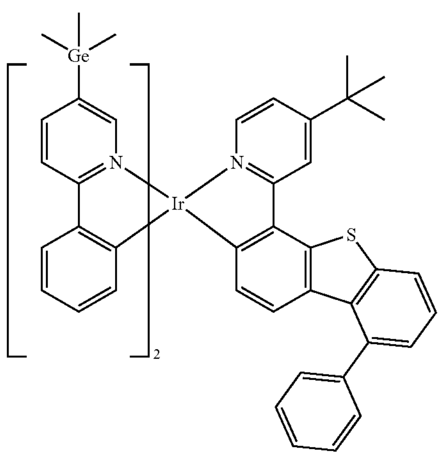
2025
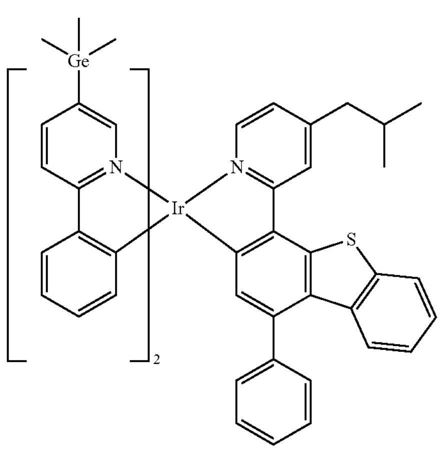
2026
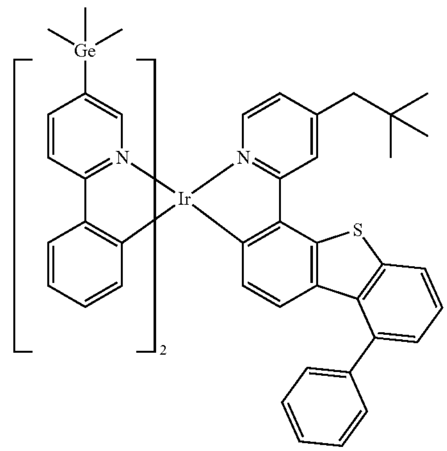
2027
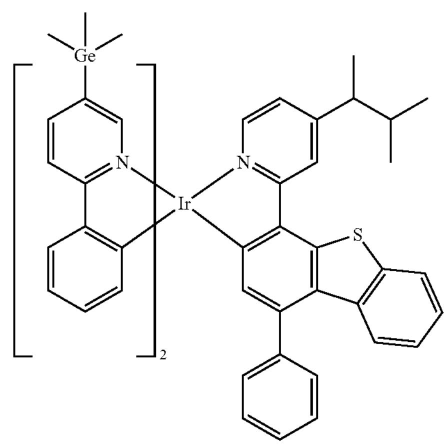
2028
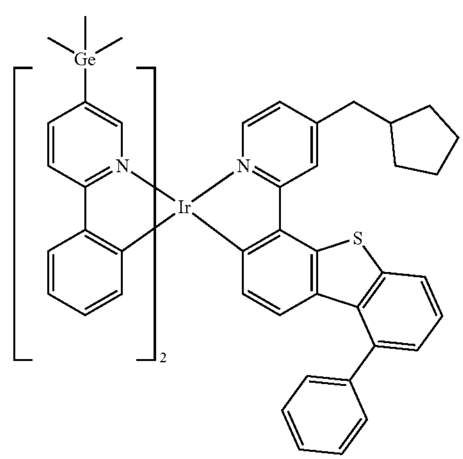

-continued
2029
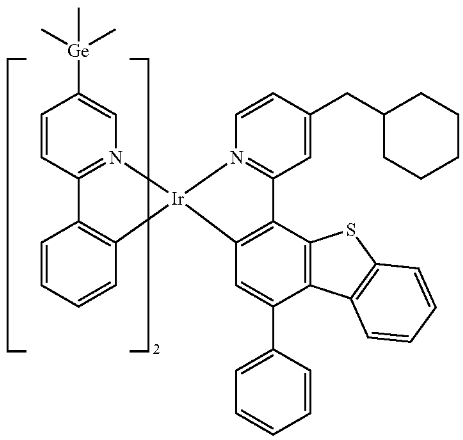
2030
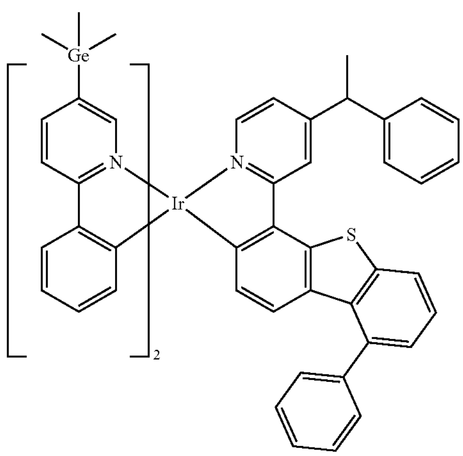
2031
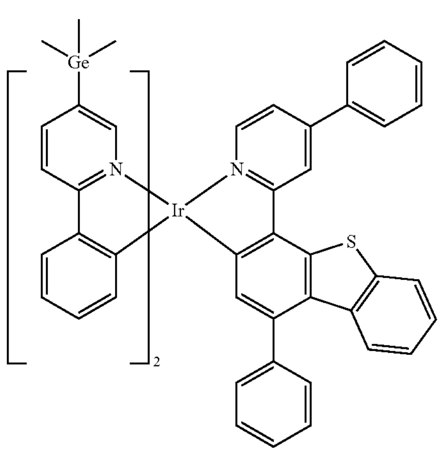
-continued
2032
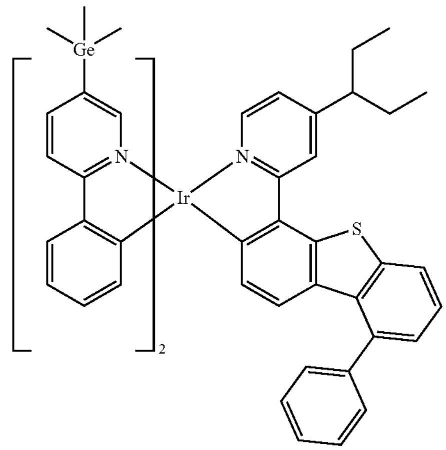
2033
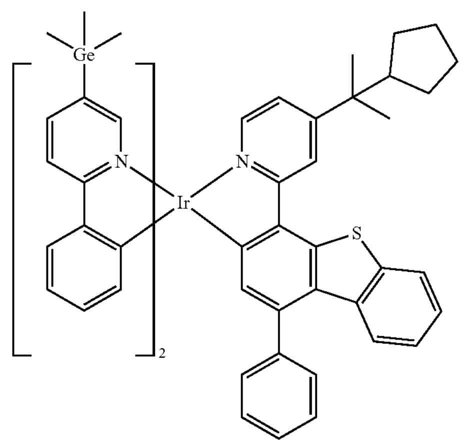
2034
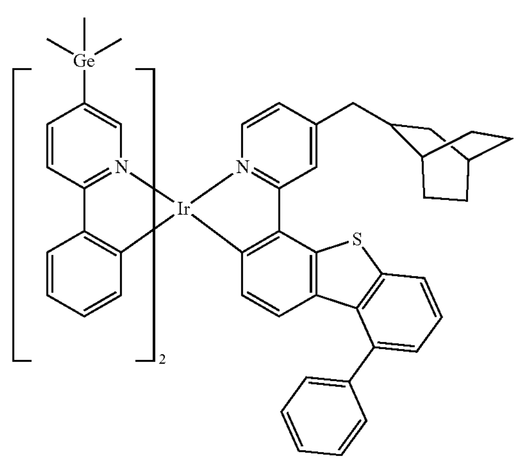

-continued
2035
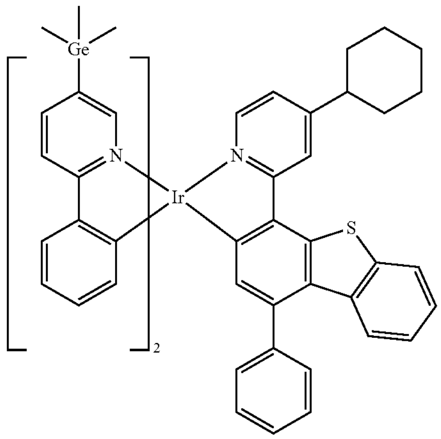
2036
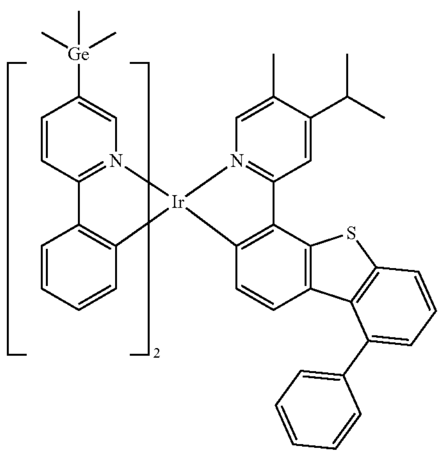
2037
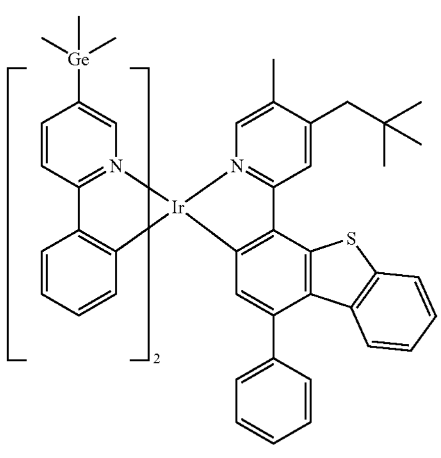
-continued
2038
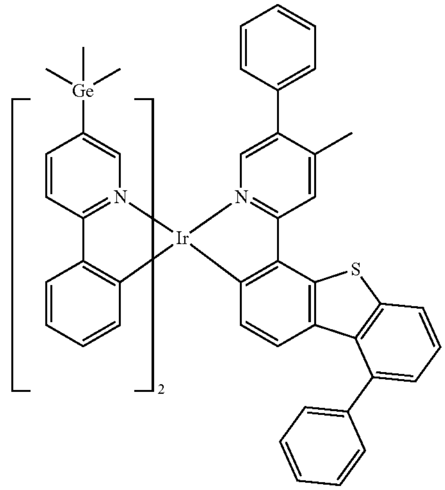
2039
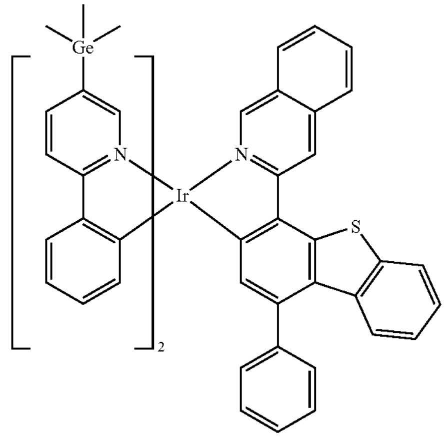
2040
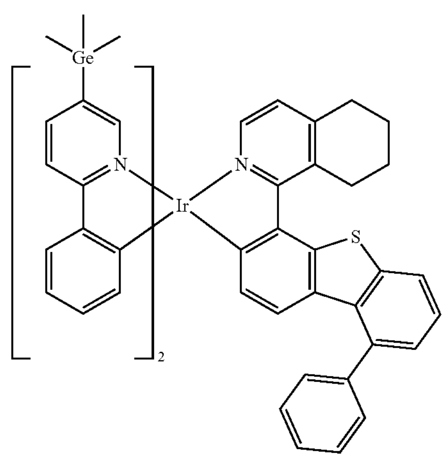

-continued
2041
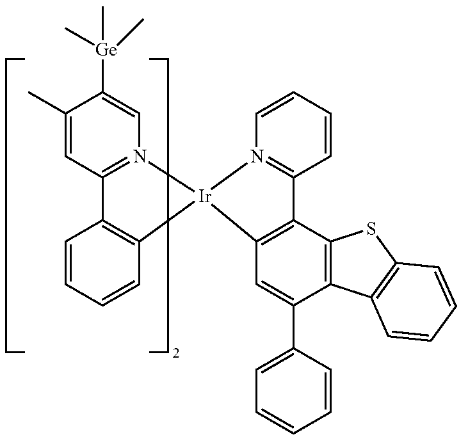
2044
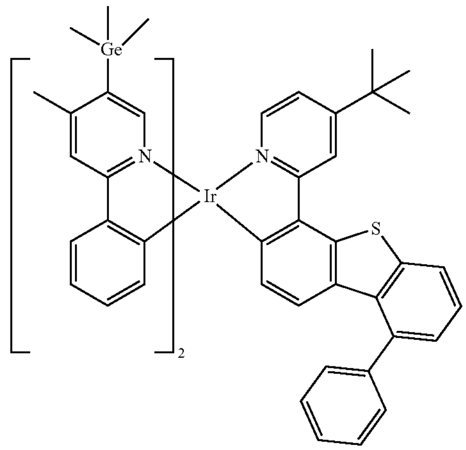
2042
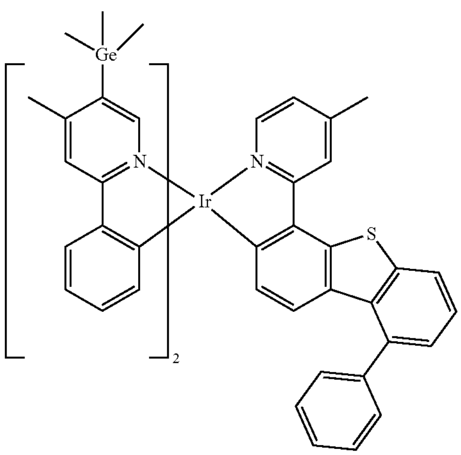
2045
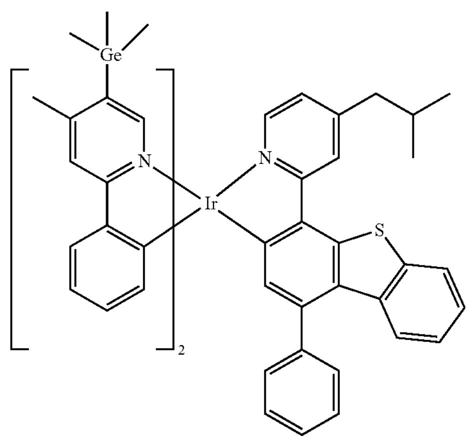
2043
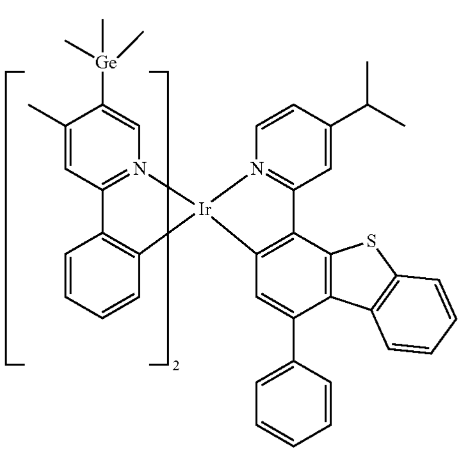
2046
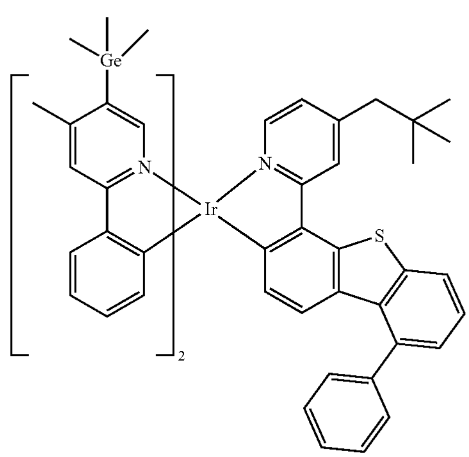

2047
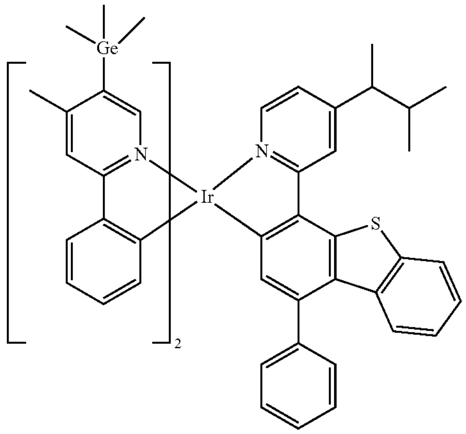
2048
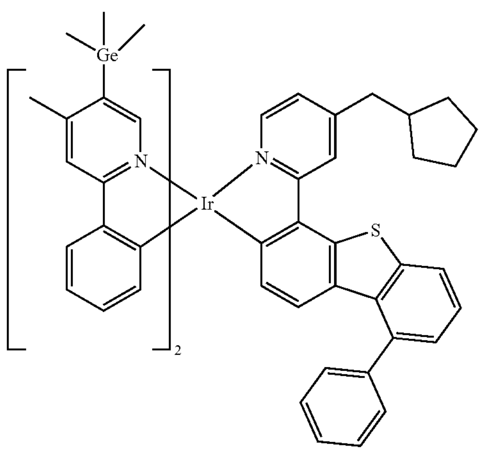
2049
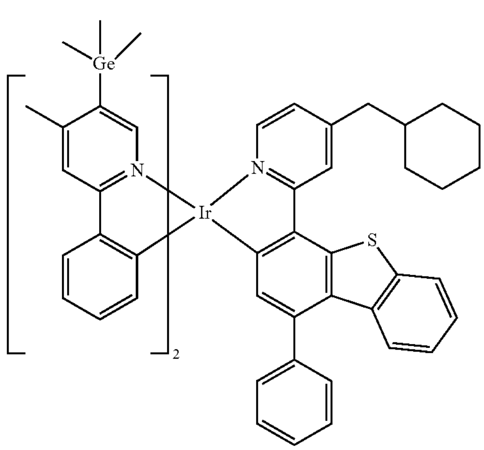
2050
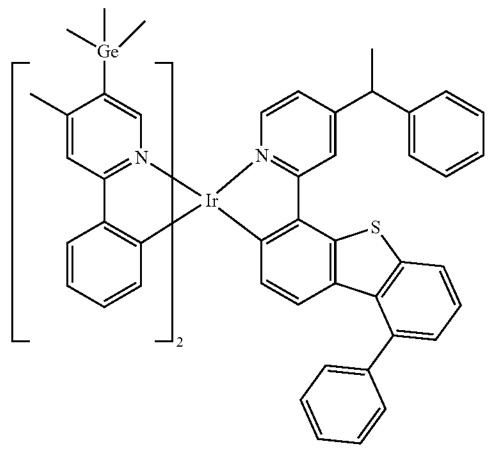
2051
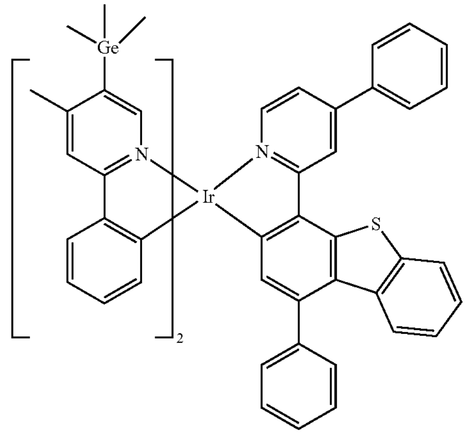
2052
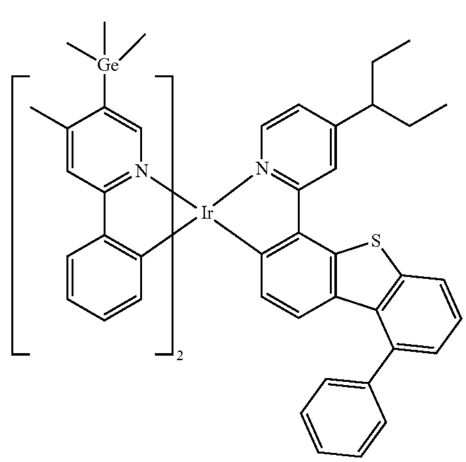

2053
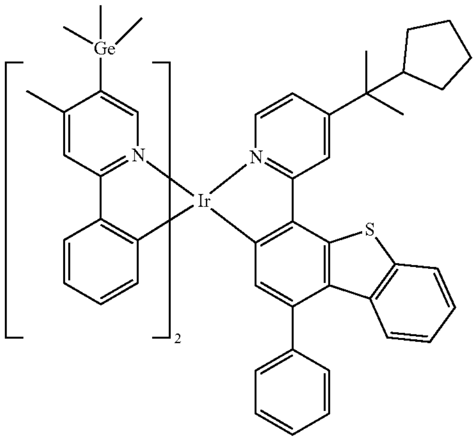
2054
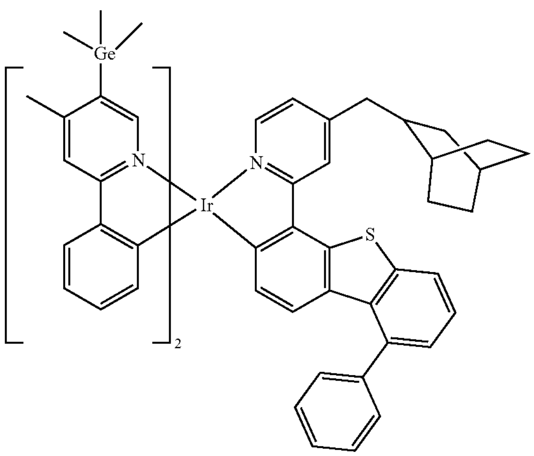
2055
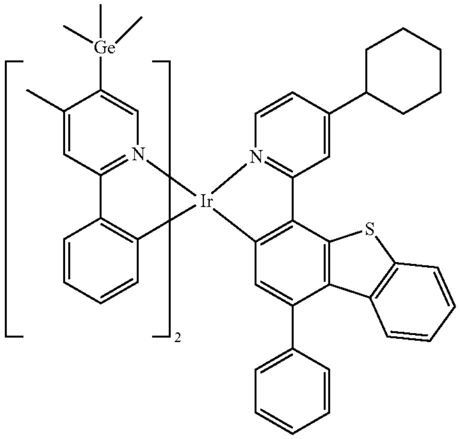
2056
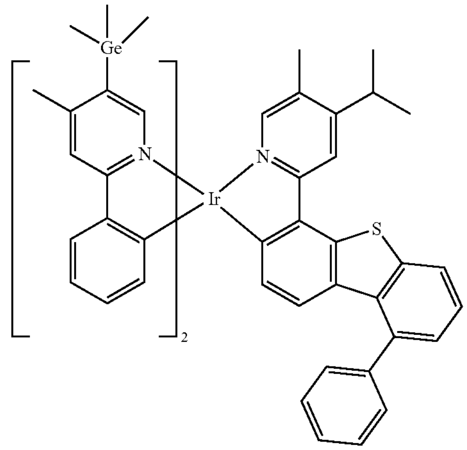
2057
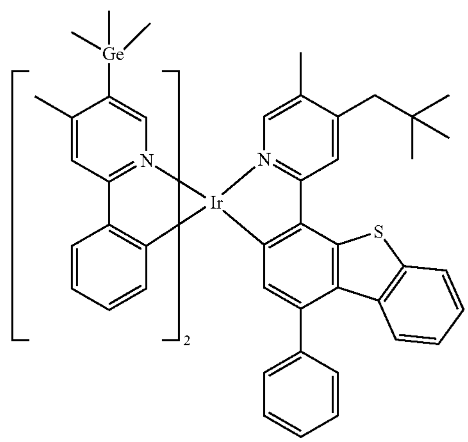
2058
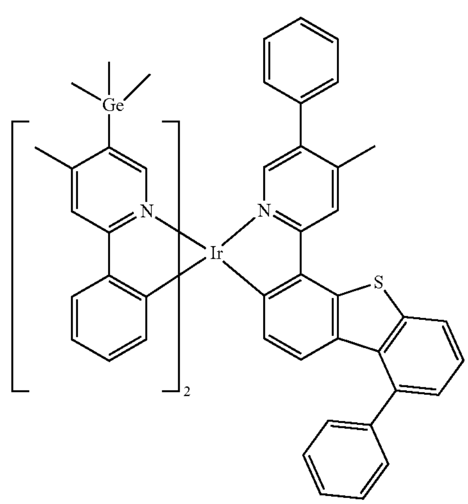

-continued
2059
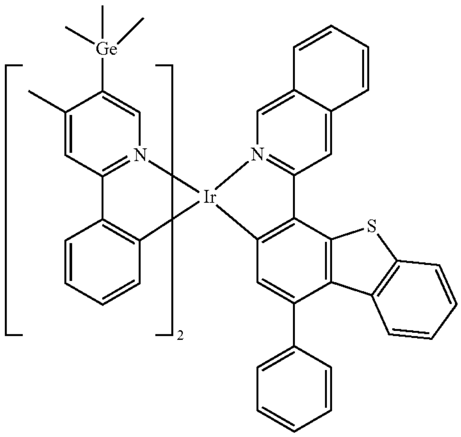
2060
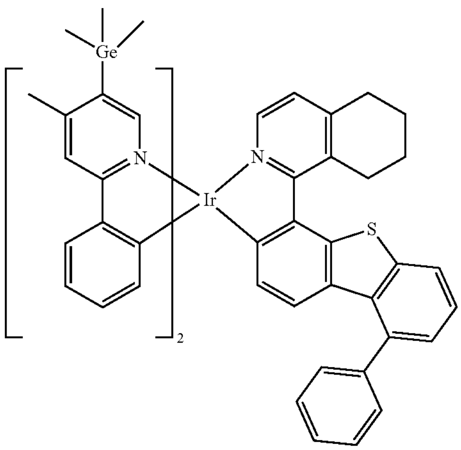
2061
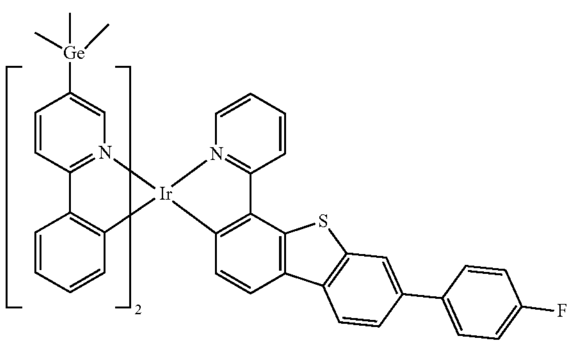
2062
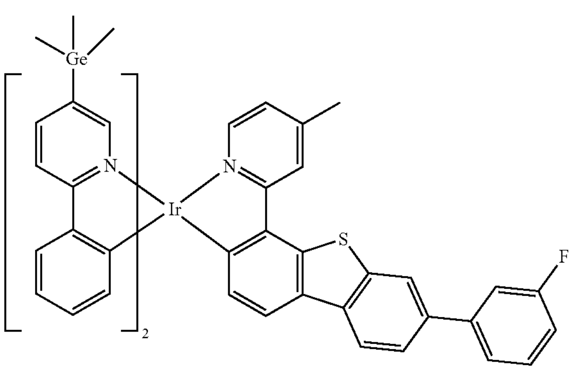
-continued
2063
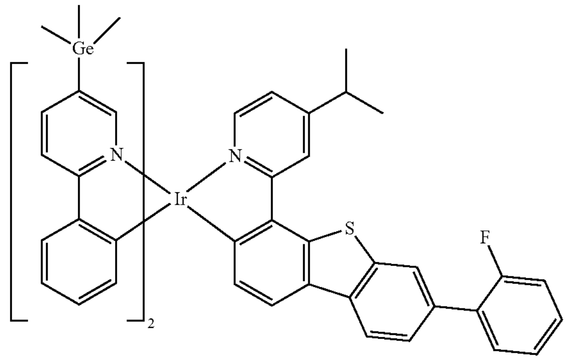
2064
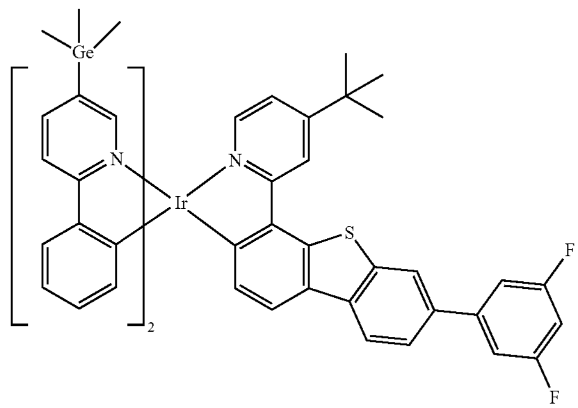
2065
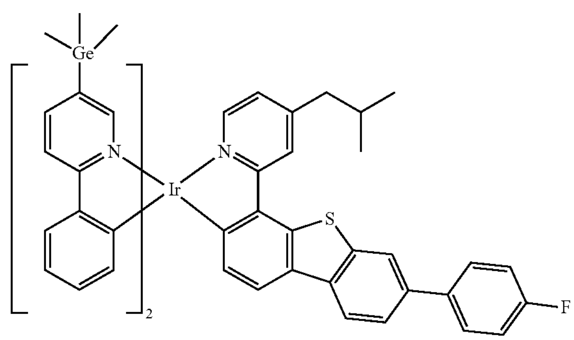
2066
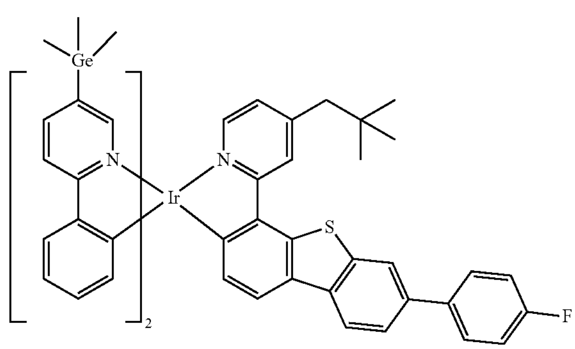

2067
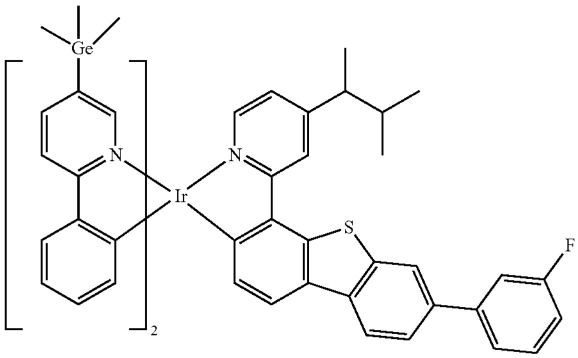
2068
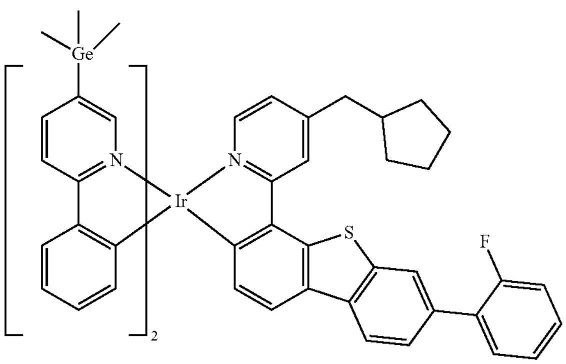
2069
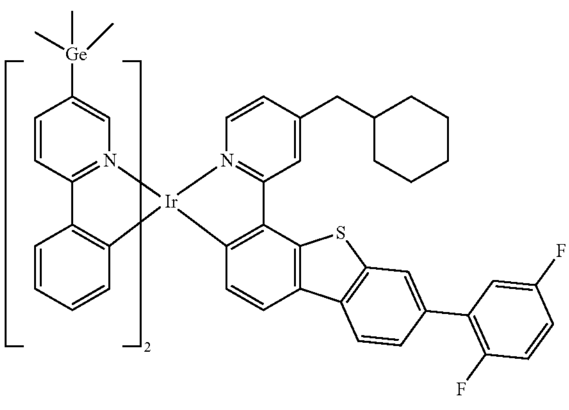
2070
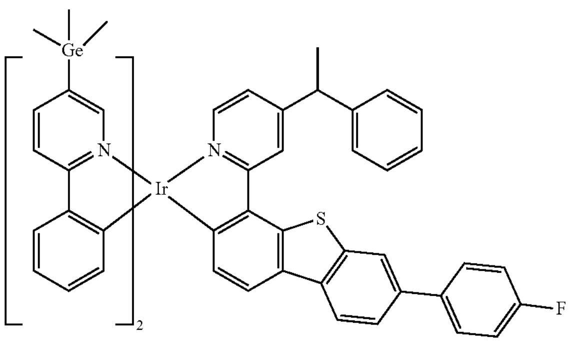
2071
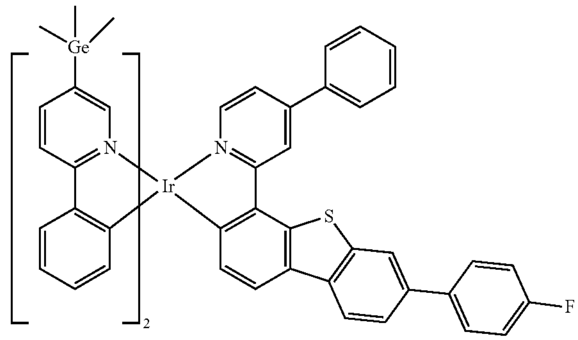
2072
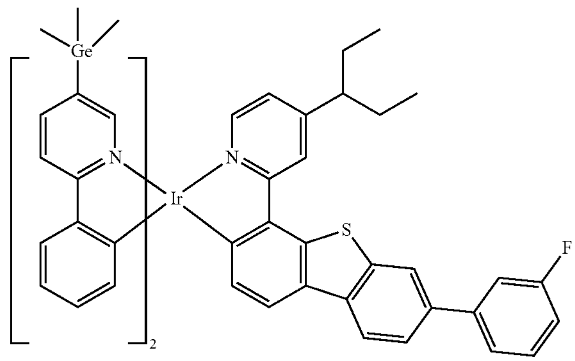
2073
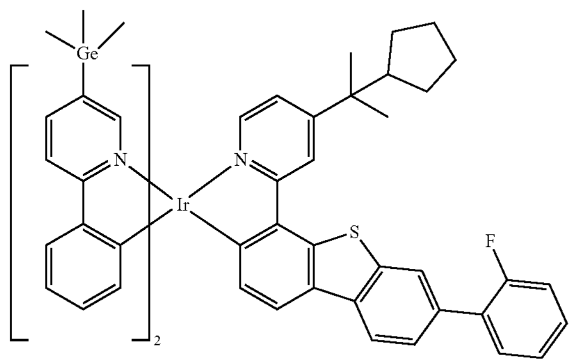
2074
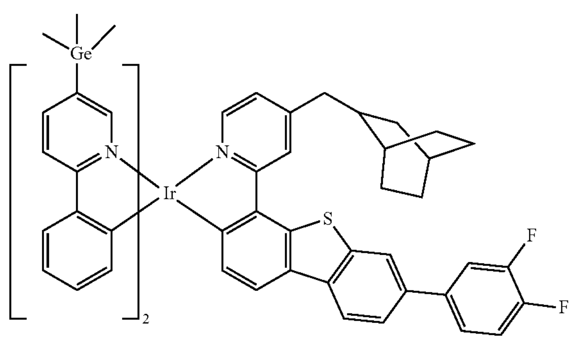

-continued
2075
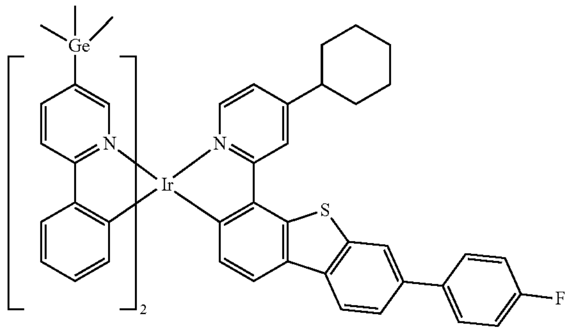
2076
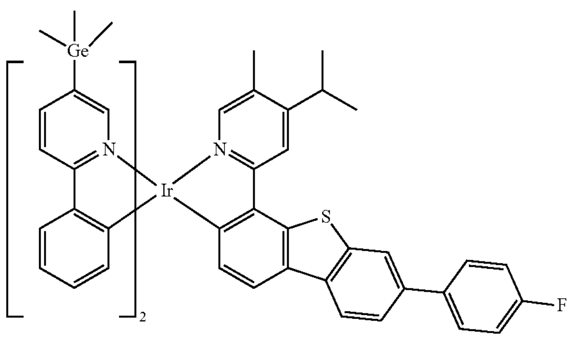
2077
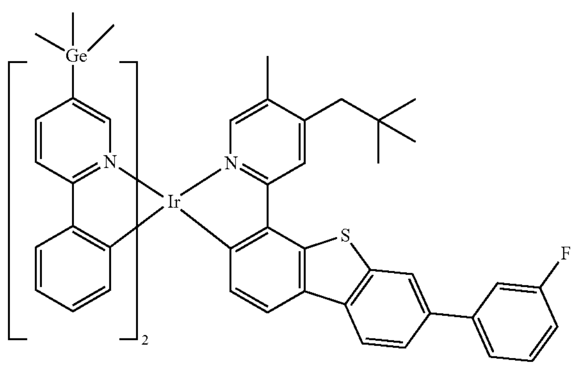
2078
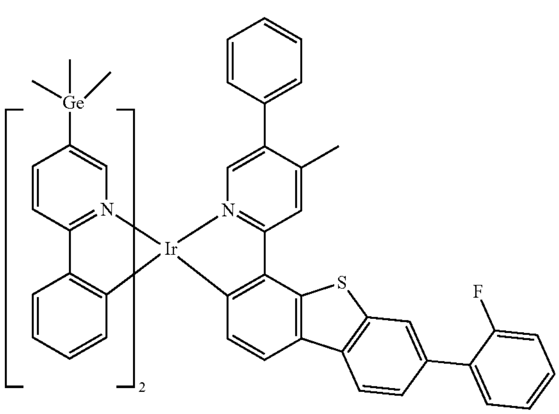
-continued
2079
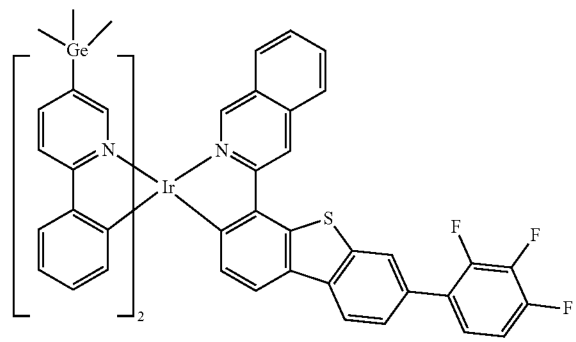
2080
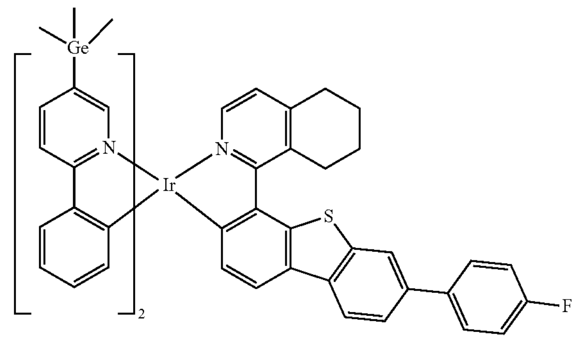
2081
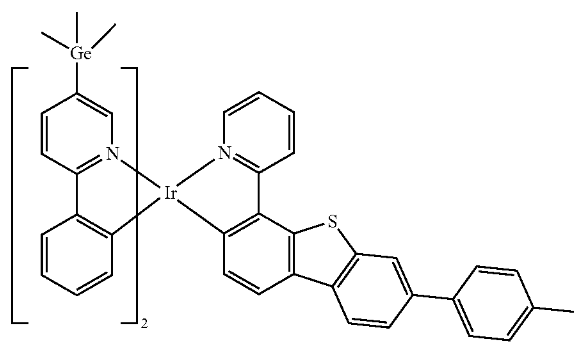
2082
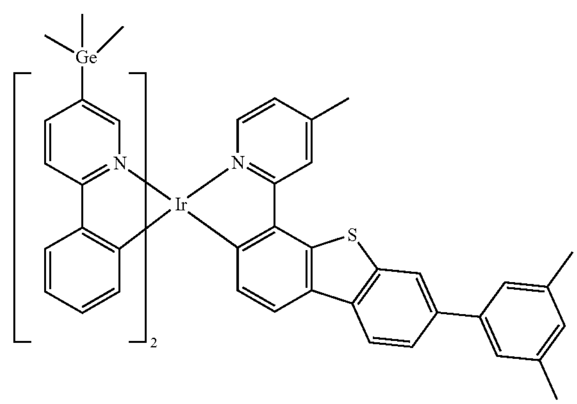

-continued
2083
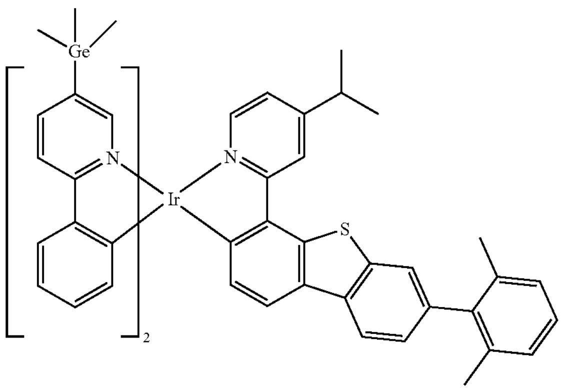
2084
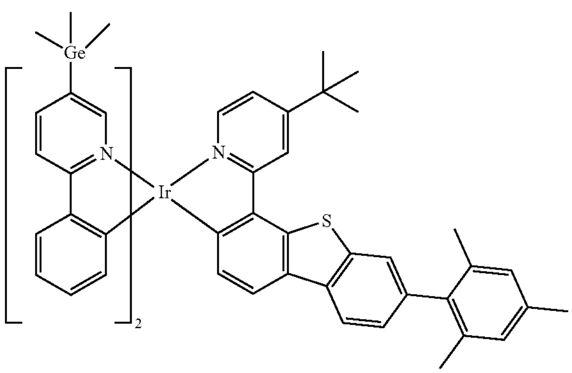
2085
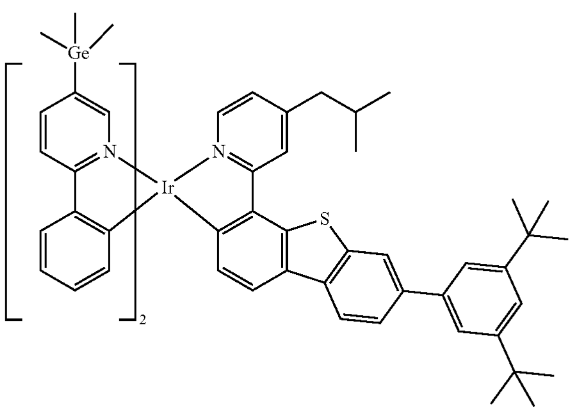
2086
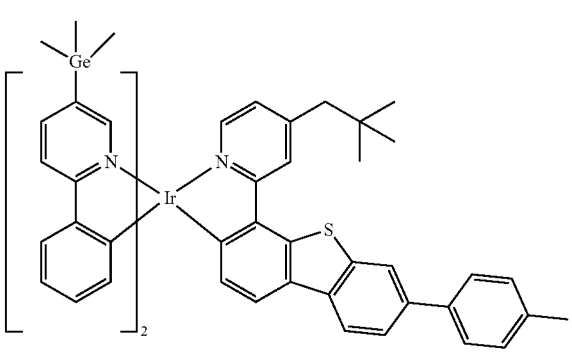
-continued
2087
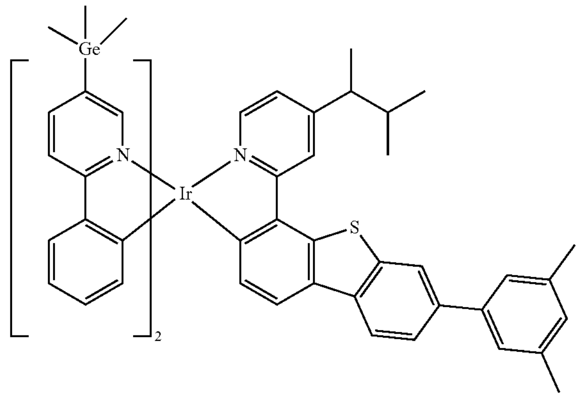
2088
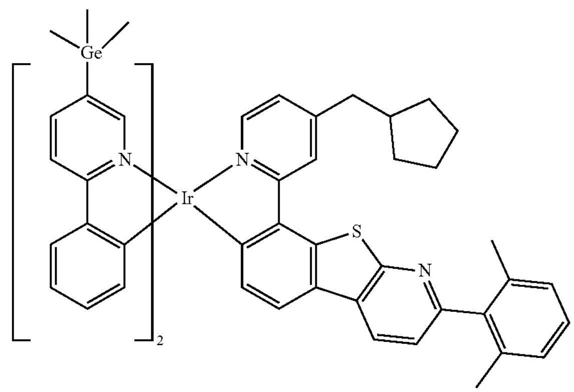
2089
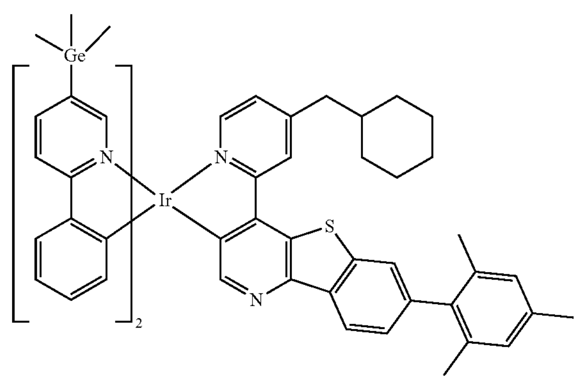
2090
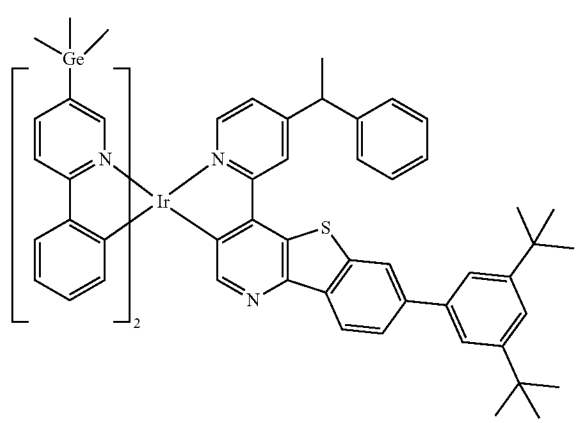

2091
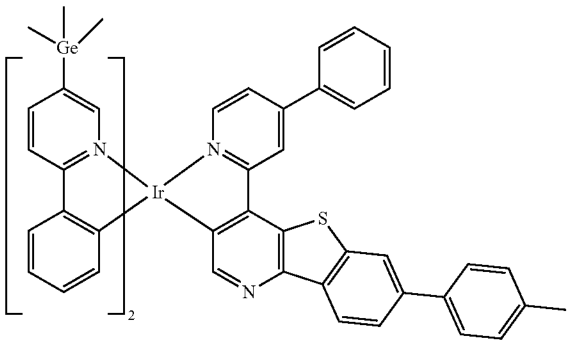
2092
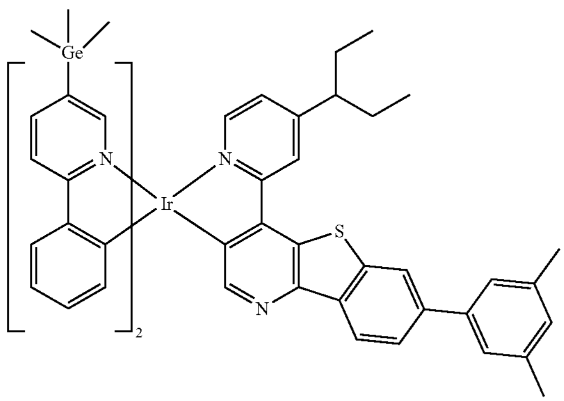
2093
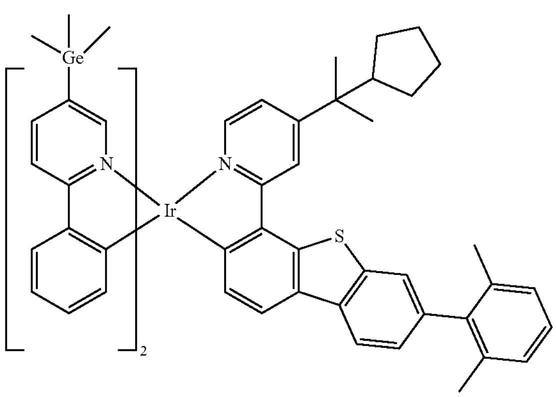
2094
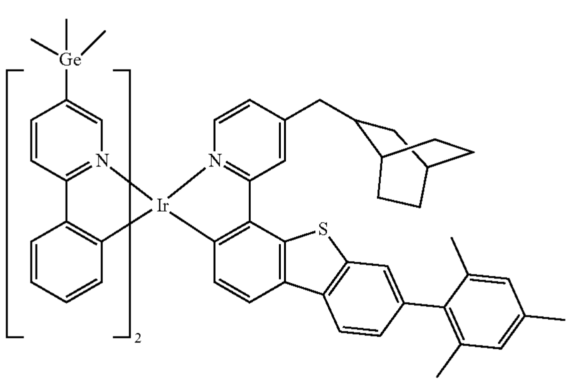
2095
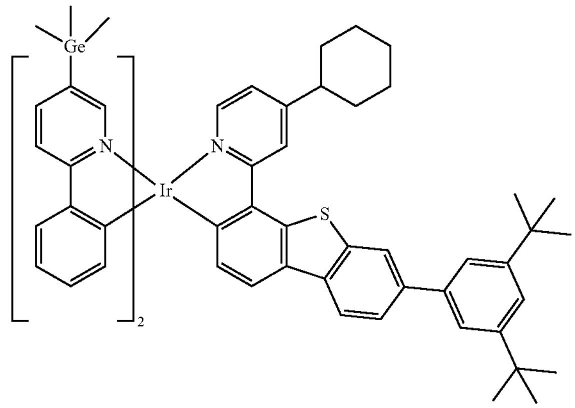
2096
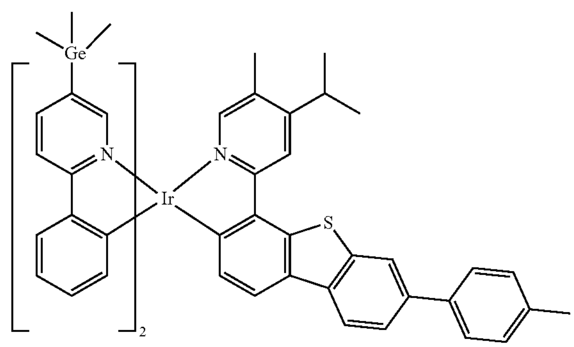
2097
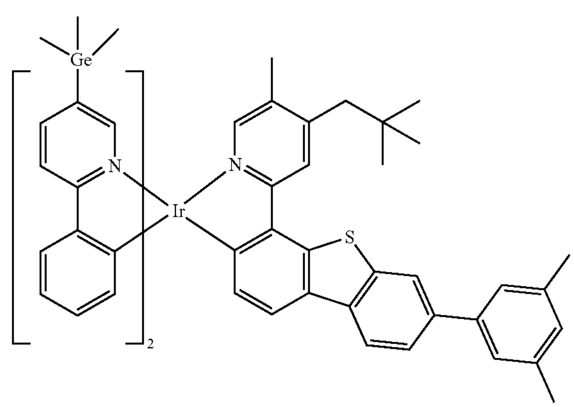

-continued
2098
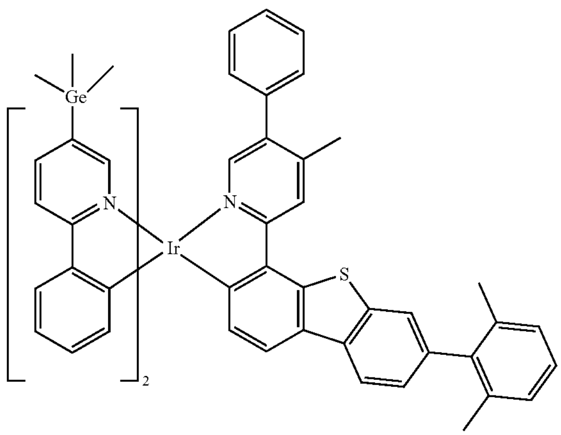
2099
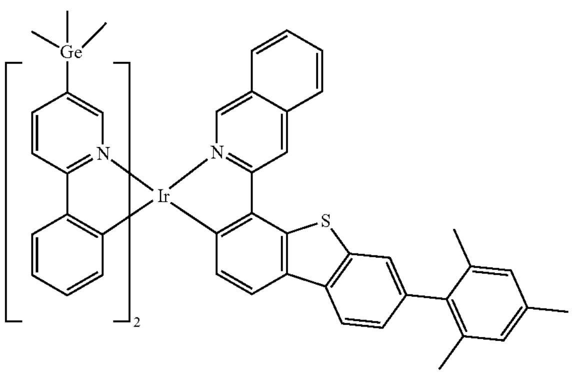
2100
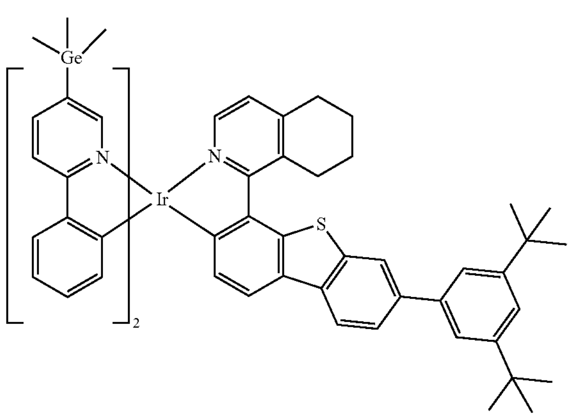
-continued
2101
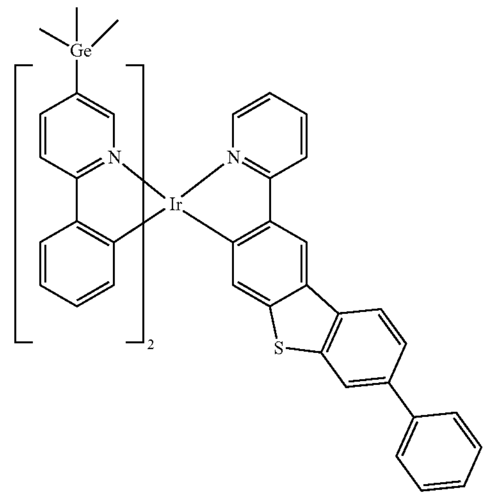
2102
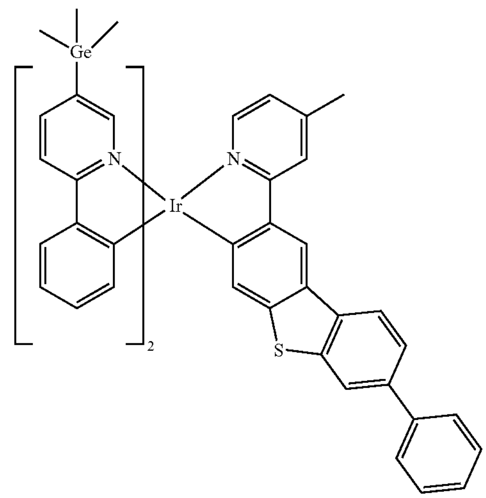
2103
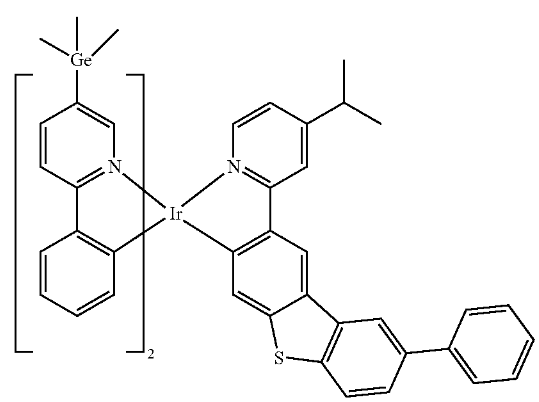

-continued
2104
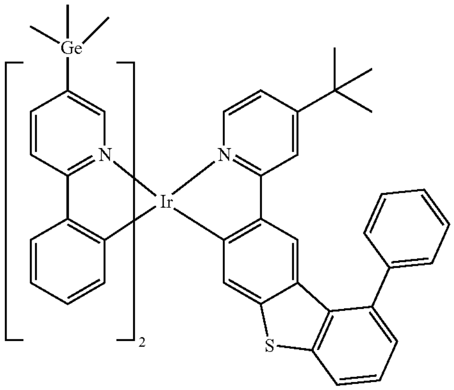
2105
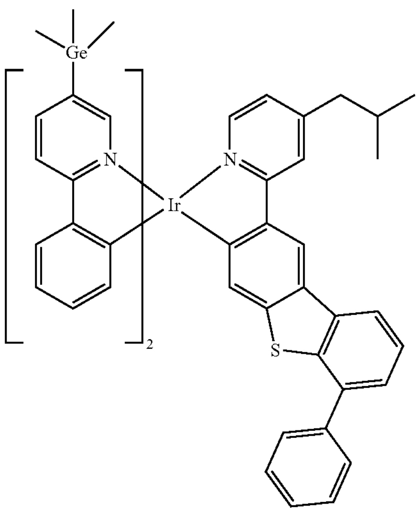
2106
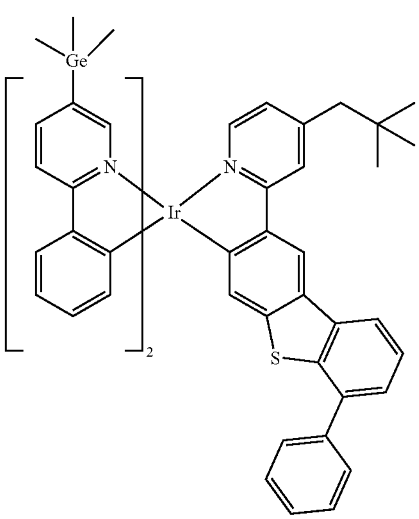
-continued
2107
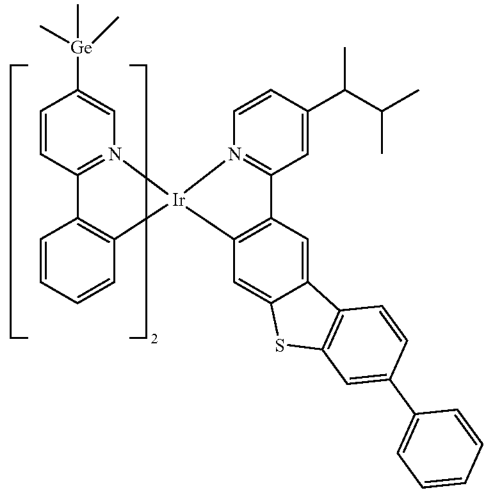
2108
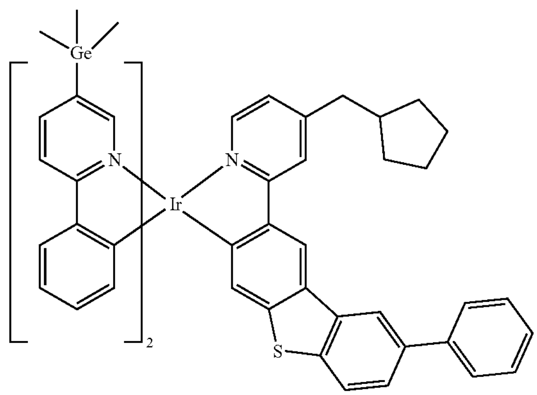
2109
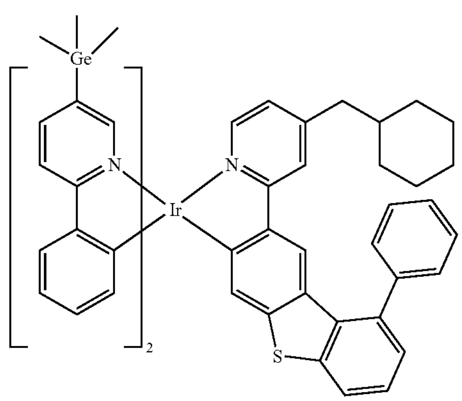

-continued
2110
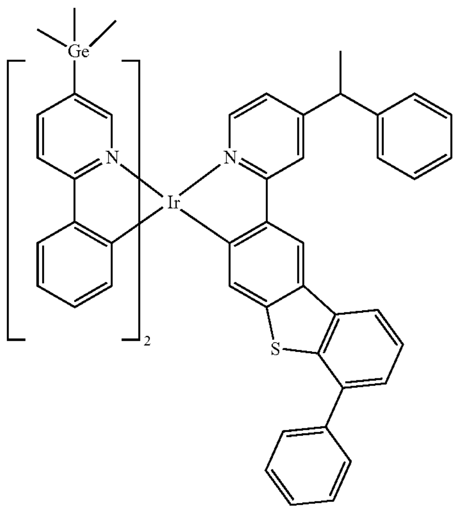
2111
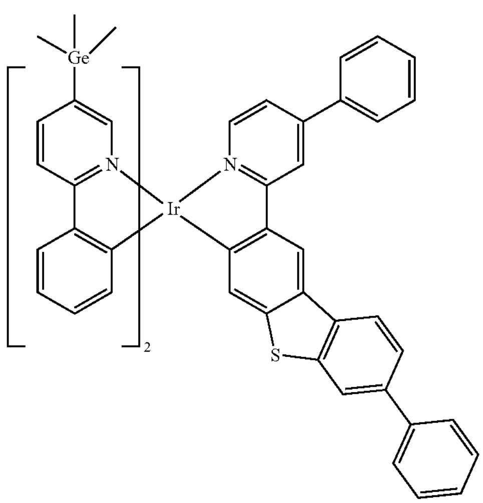
2112
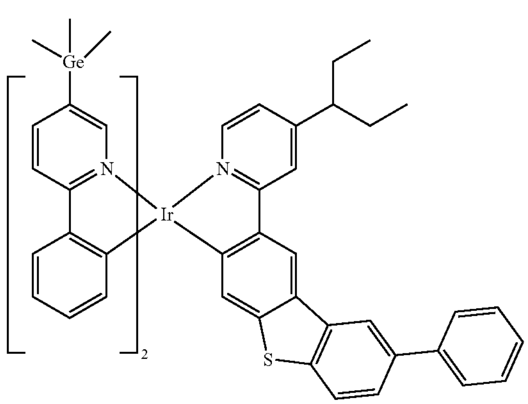
-continued
2113
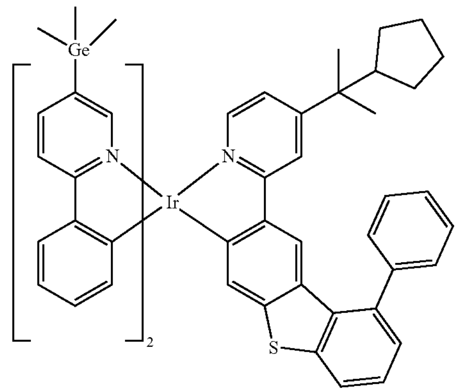
2114
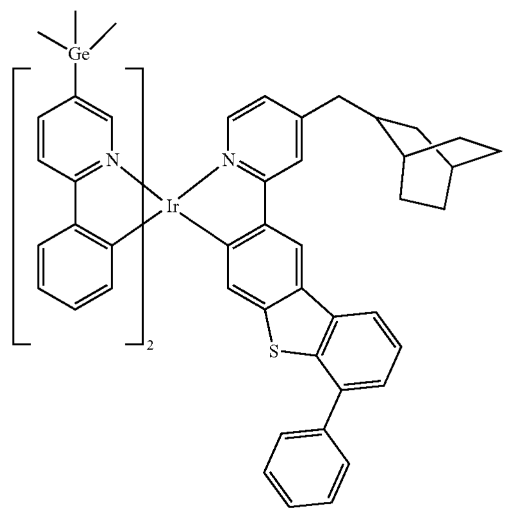
2115
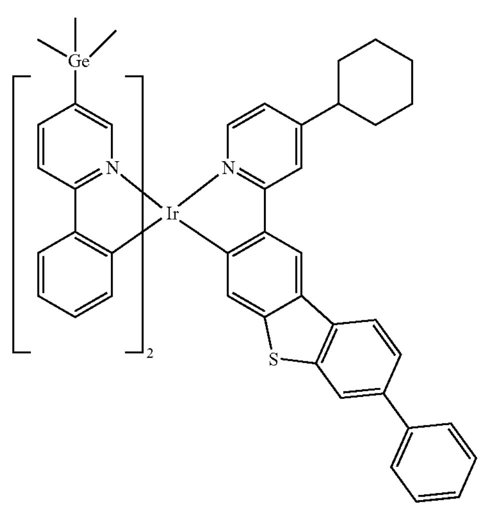

-continued
2116
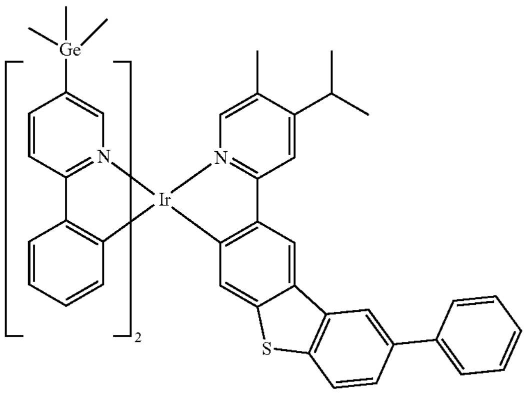
2117
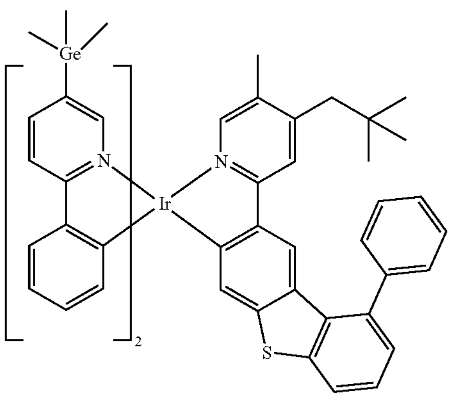
2118
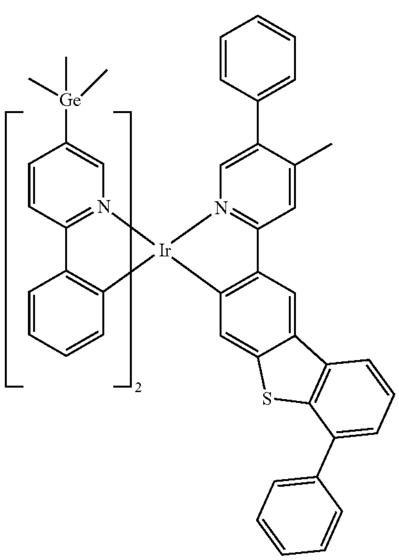
-continued
2119
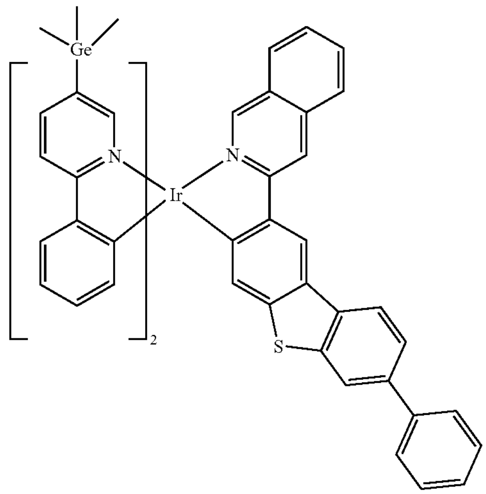
2120
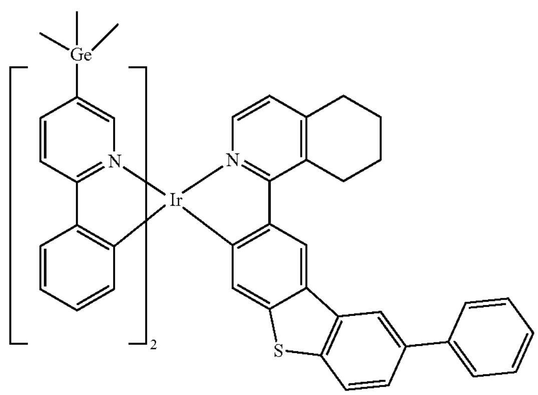
2121
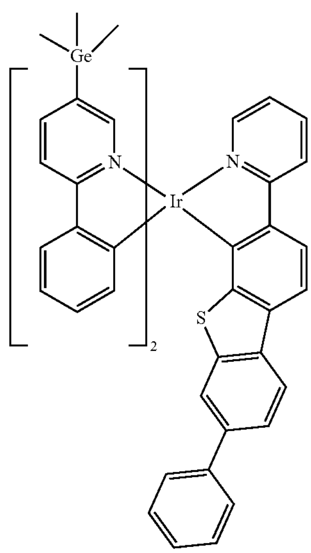

-continued
2122
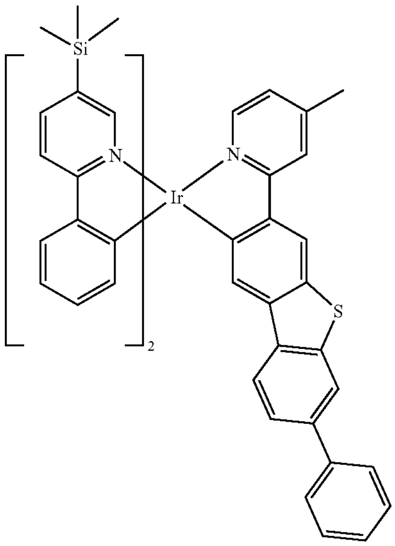
2123
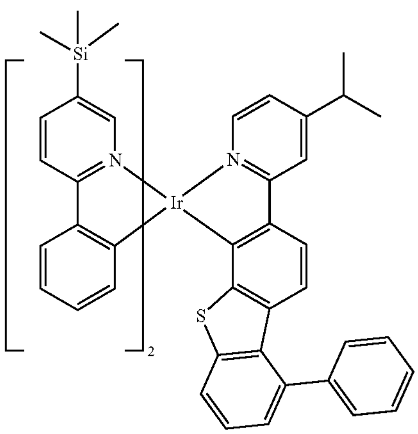
2124
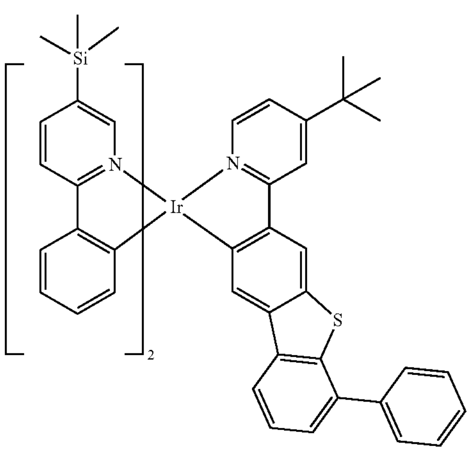
-continued
2125
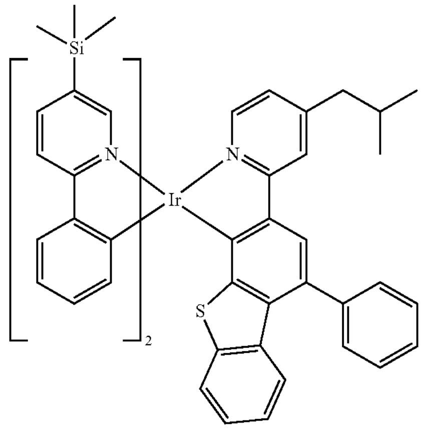
2126
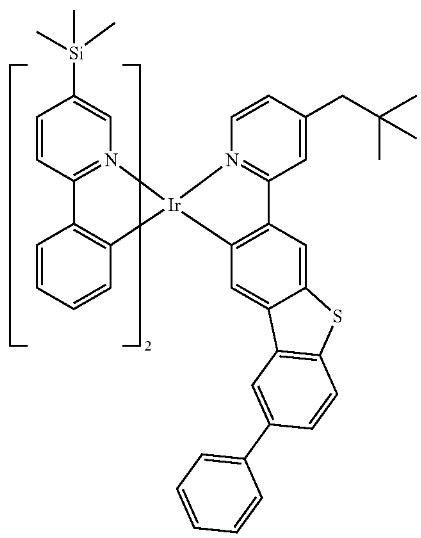
2127
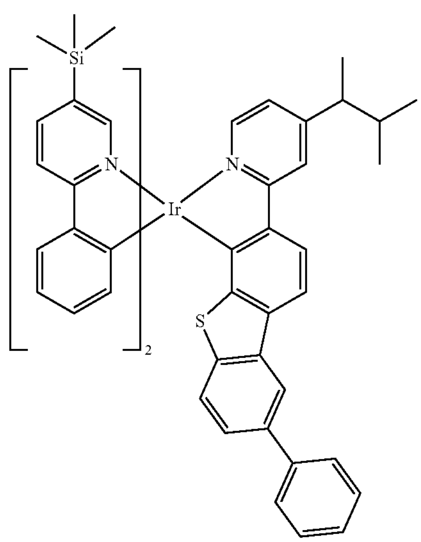

-continued
2128
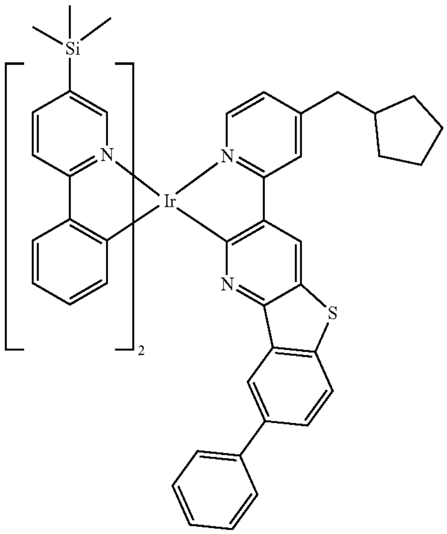
2129
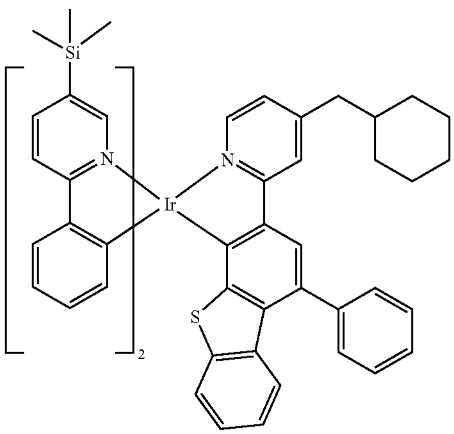
2130
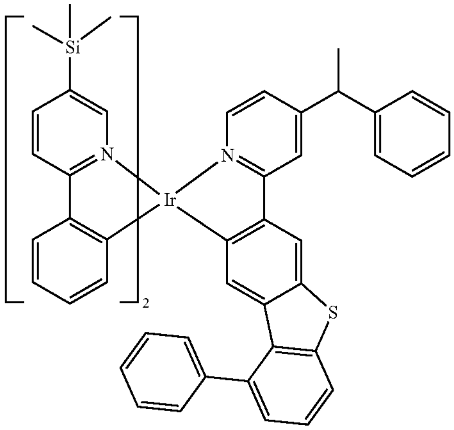
-continued
2131
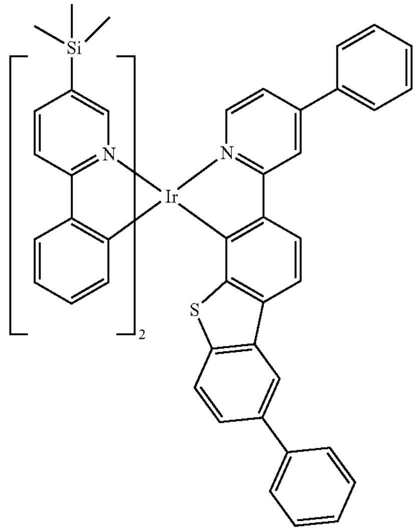
2132
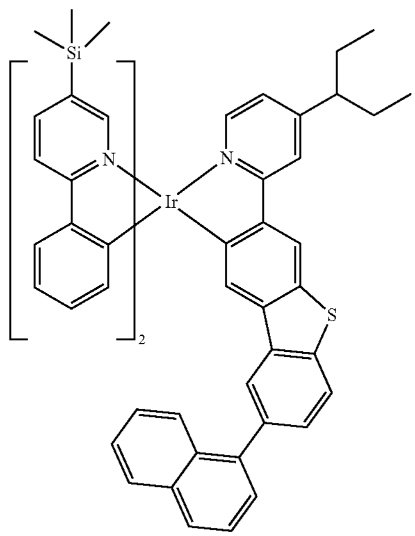
2133
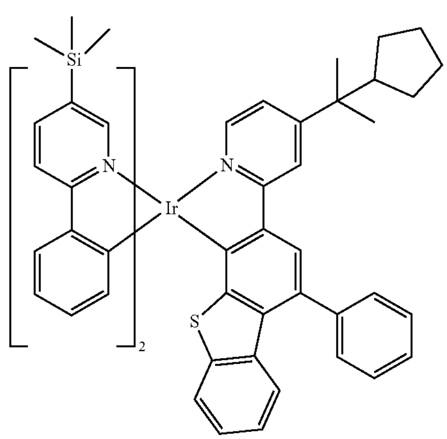

2134
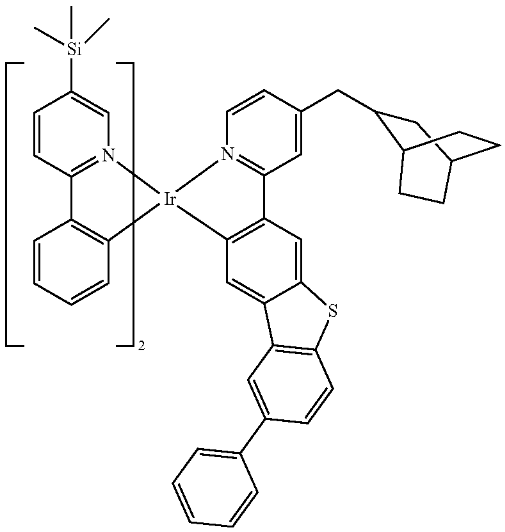
2135
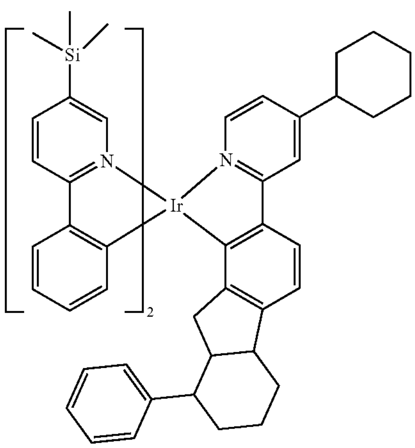
2136
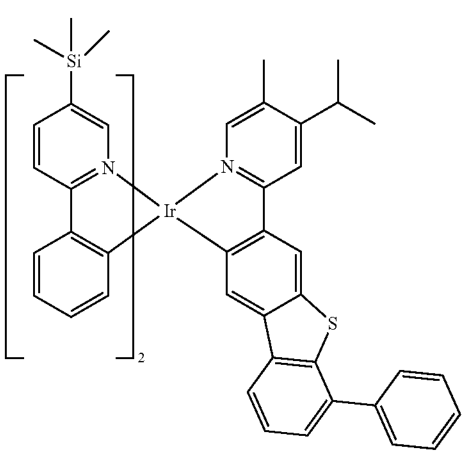
2137
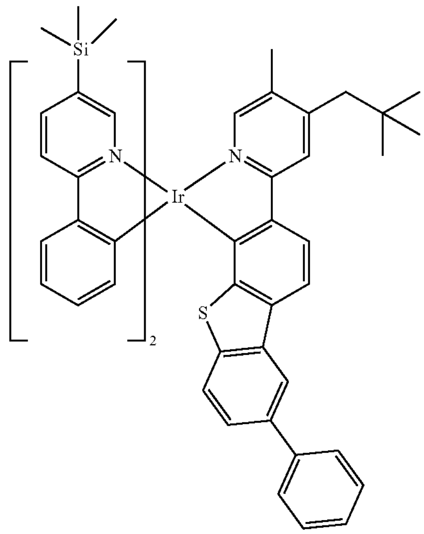
2138
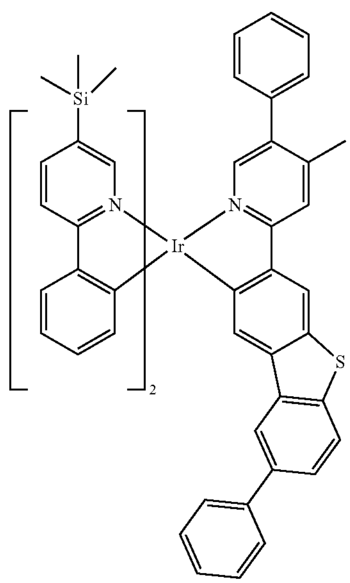
2139
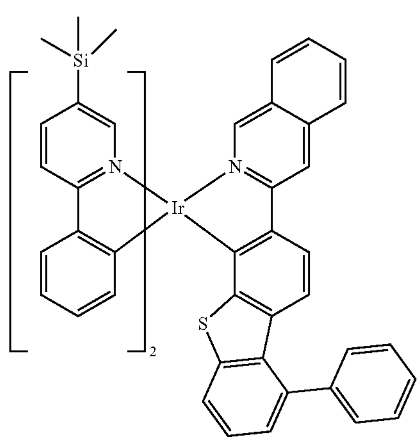

-continued
2140
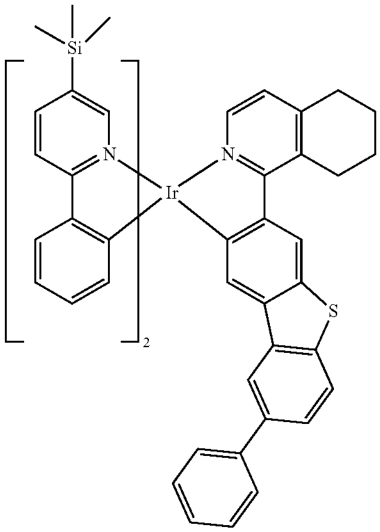
2141
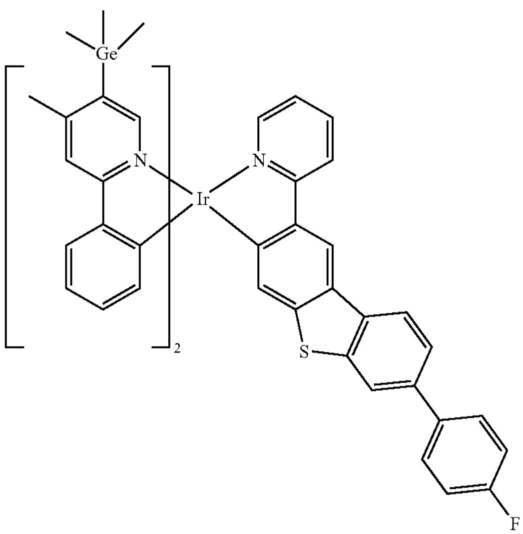
2142
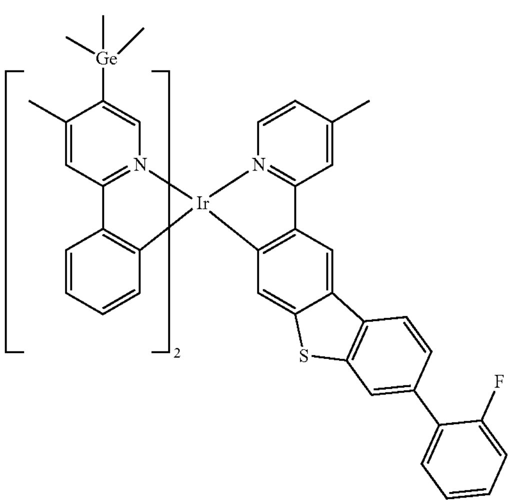
2143
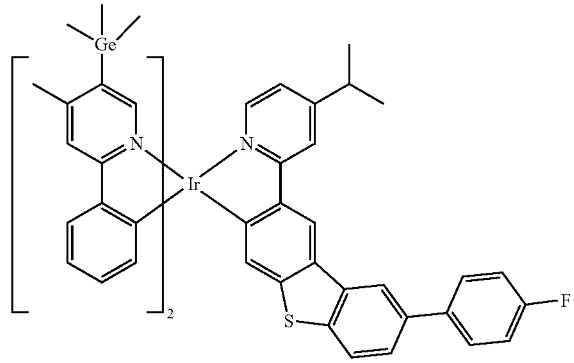
2144
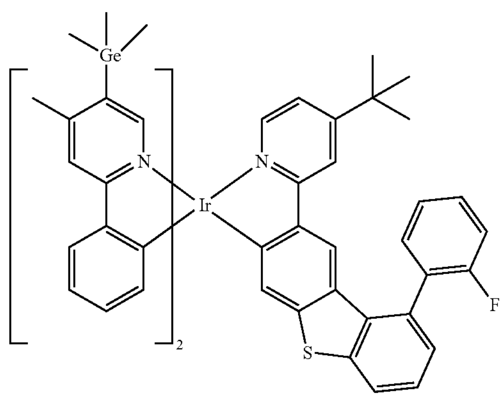
2145
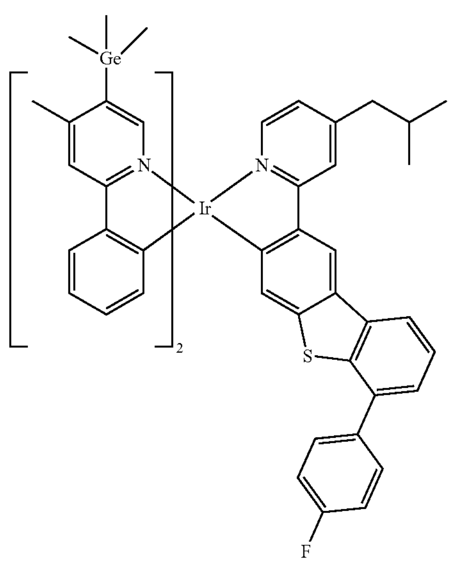

2146
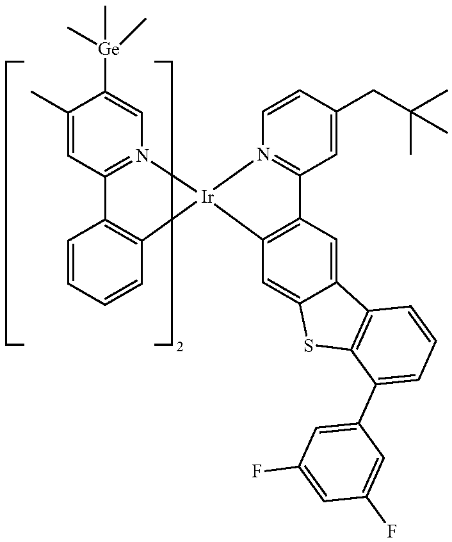
2147
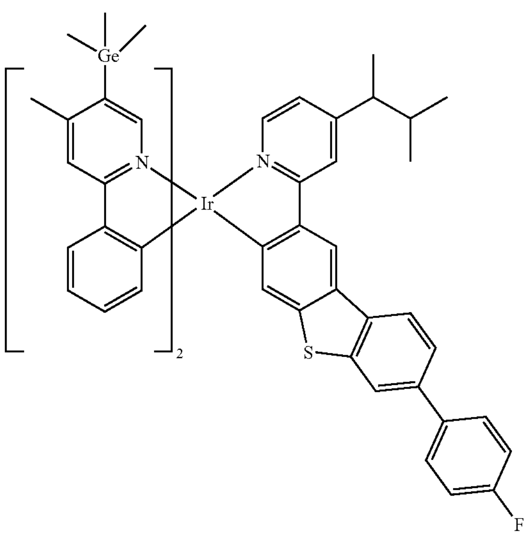
2148
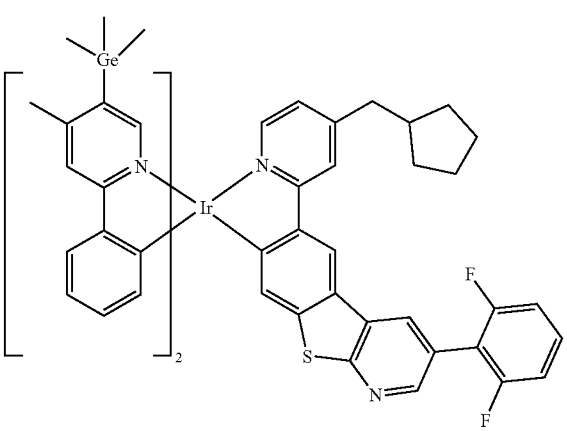
2149
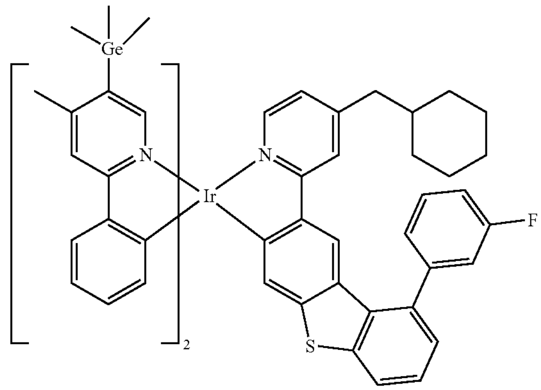
2150
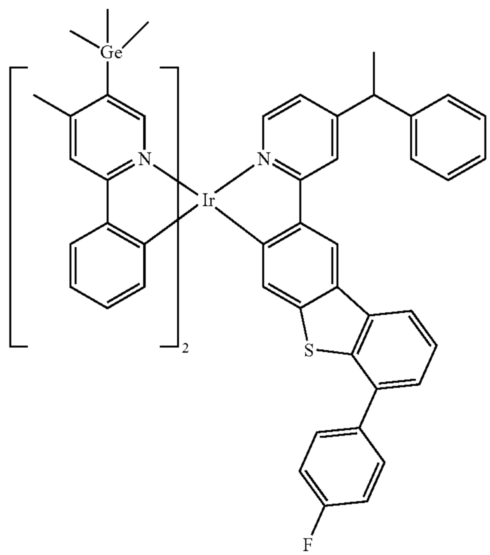
2151
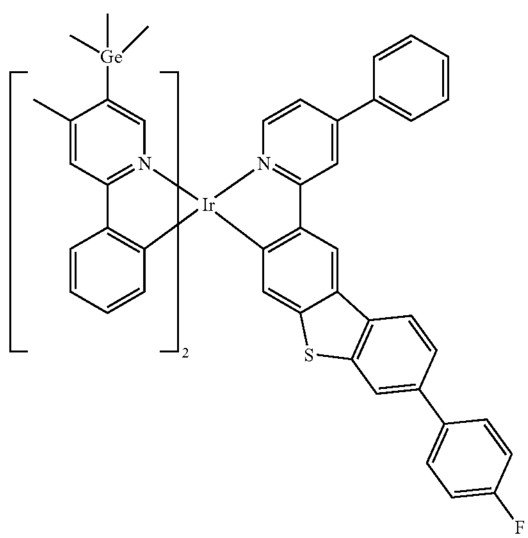

-continued
2152
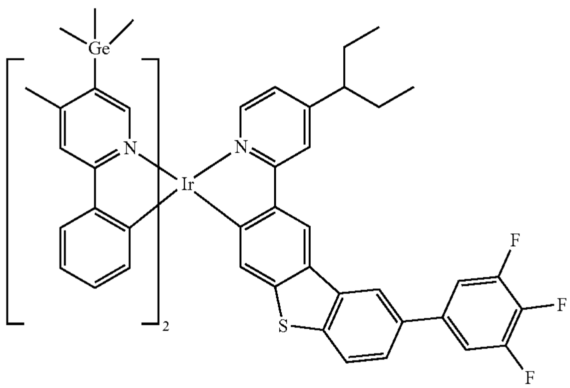
2153
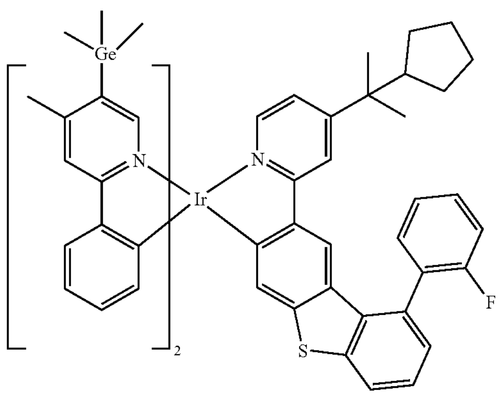
2154
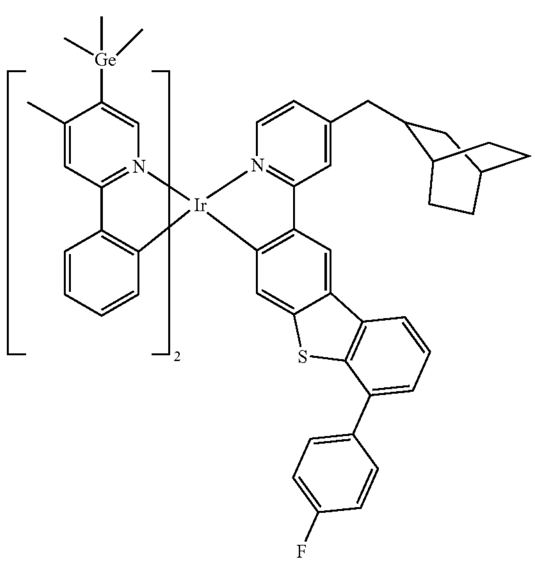
-continued
2155
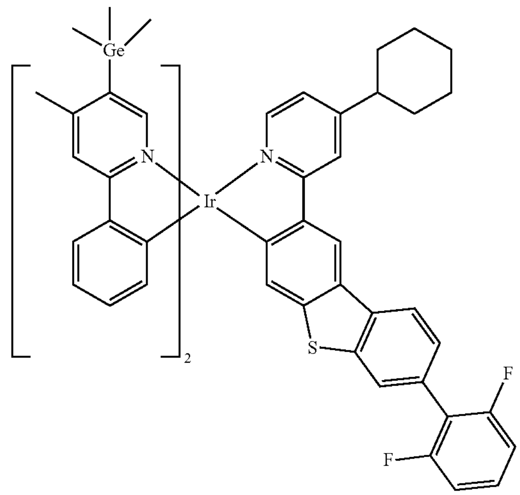
2156
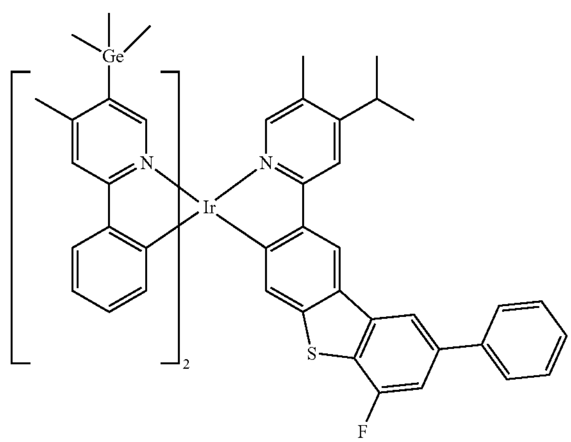
2157
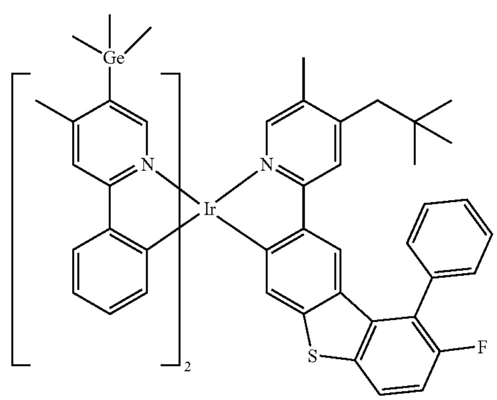

-continued
2158
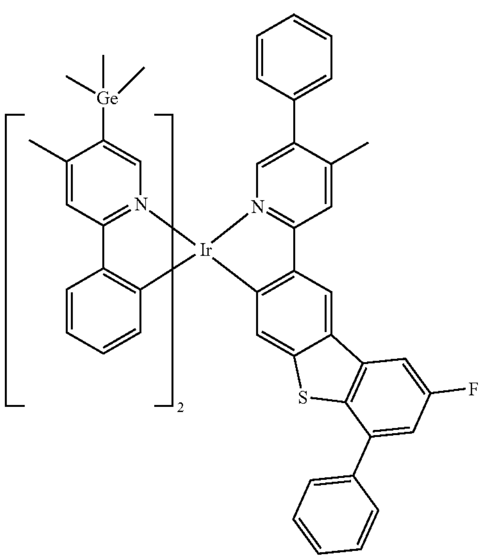
2159
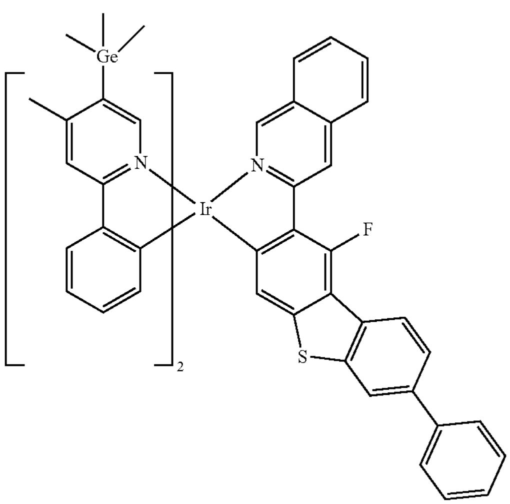
2160
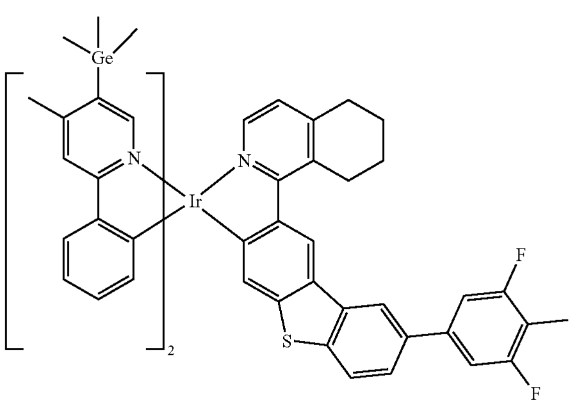
-continued
2161
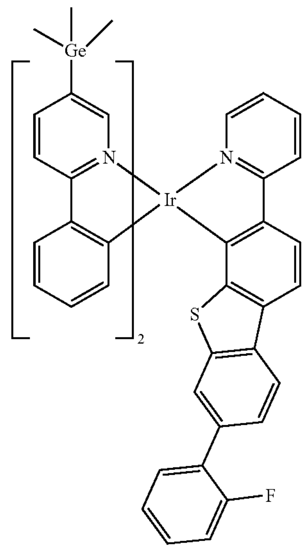
2162
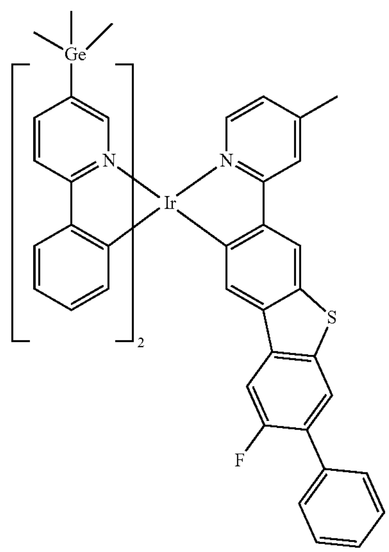
2163
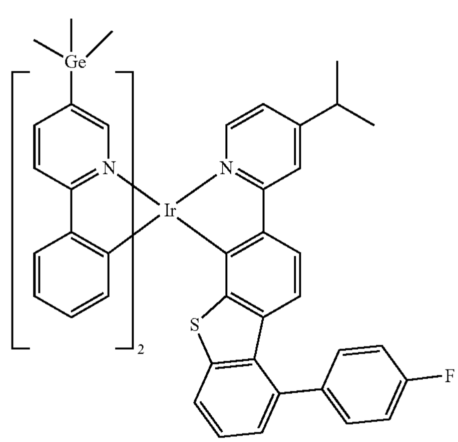

-continued
2164
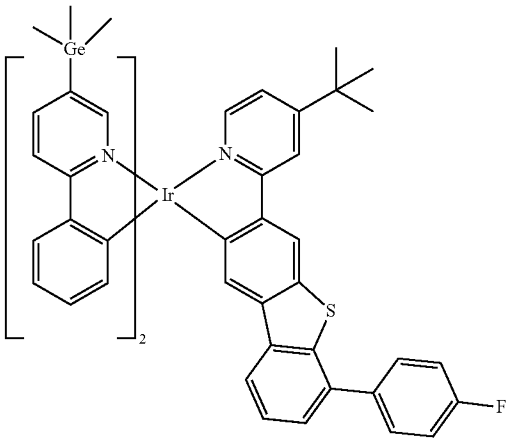
2165
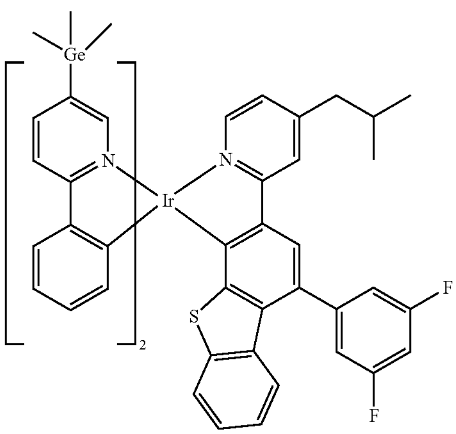
2166
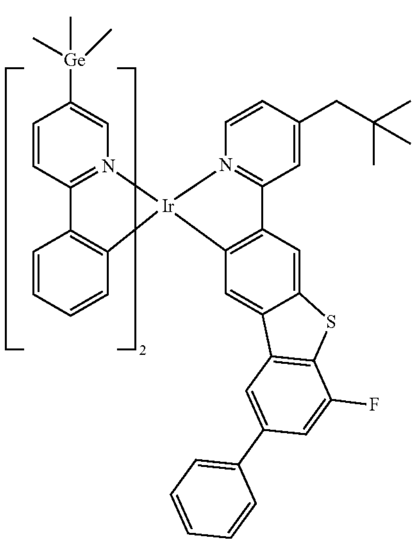
-continued
2167
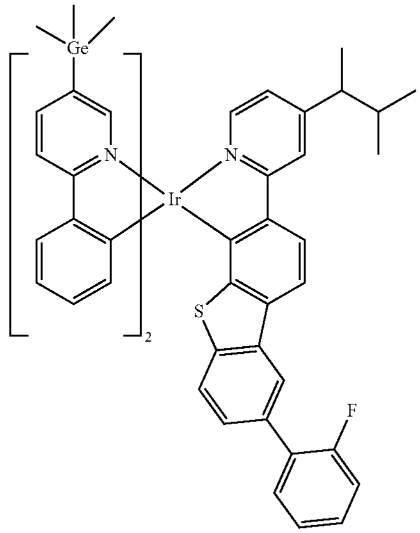
2168
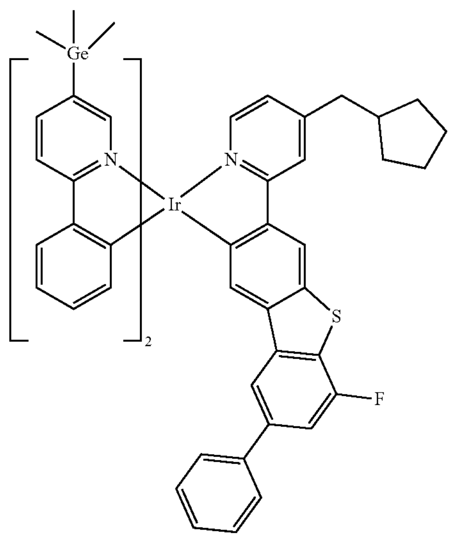
2169
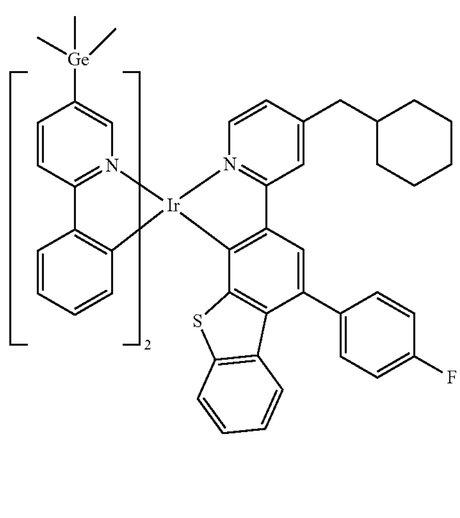

-continued
2170
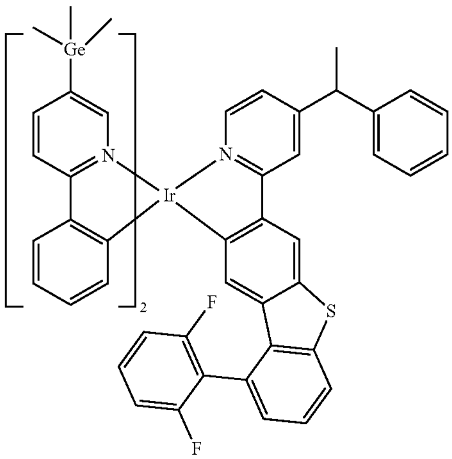
2171
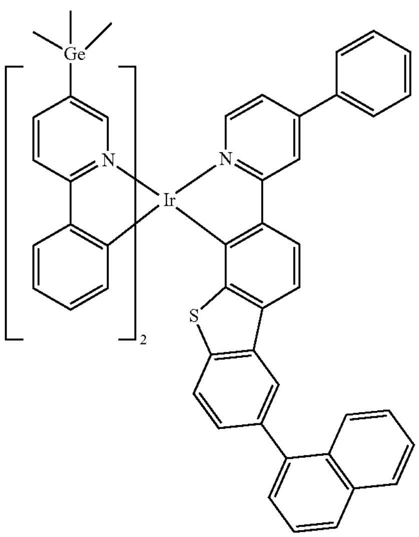
2172
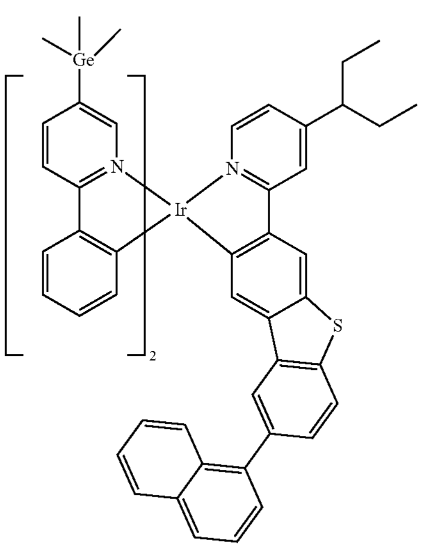
-continued
2173
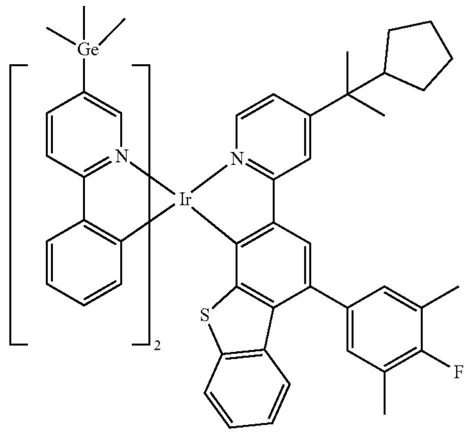
2174
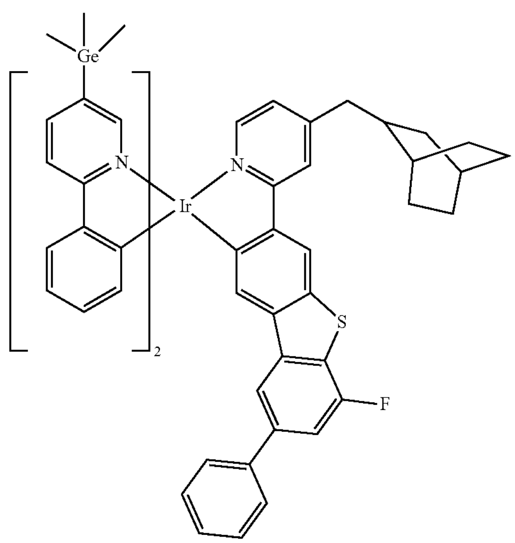
2175
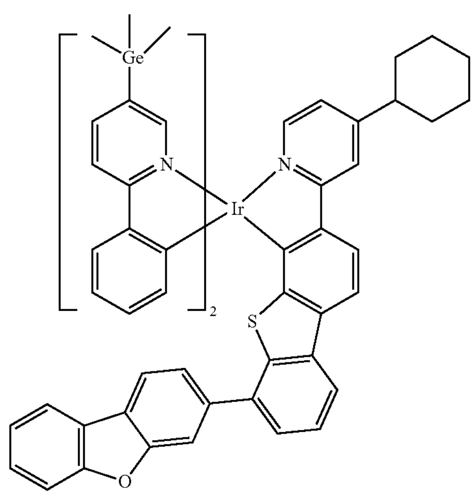

2176
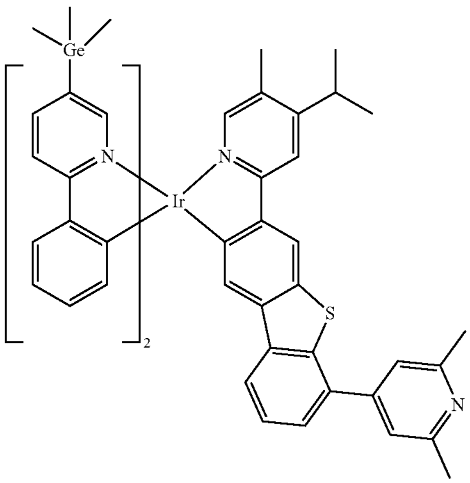
2177
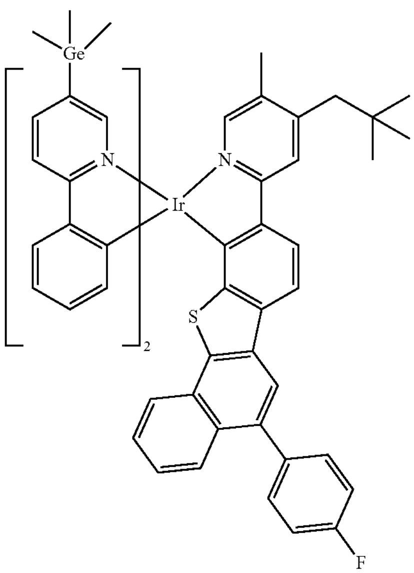
2178
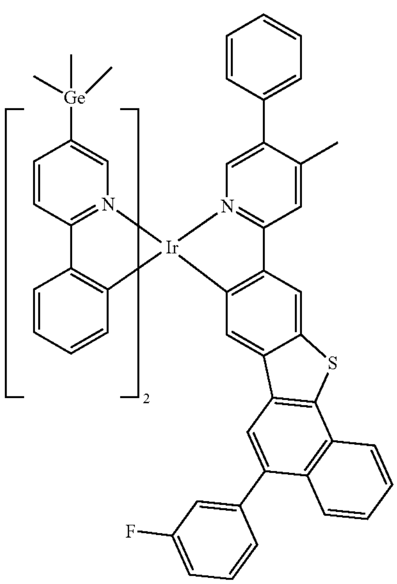
2179
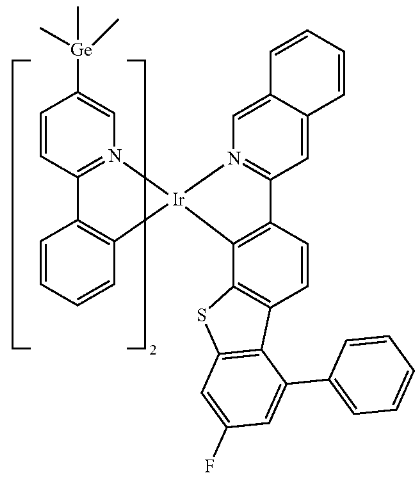
2180
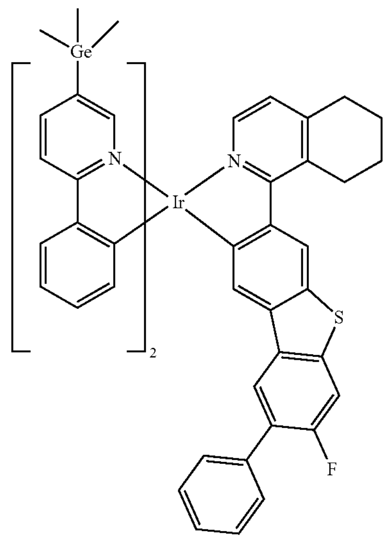
2181
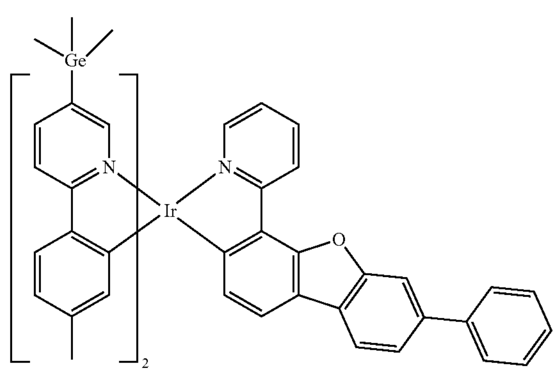

2182
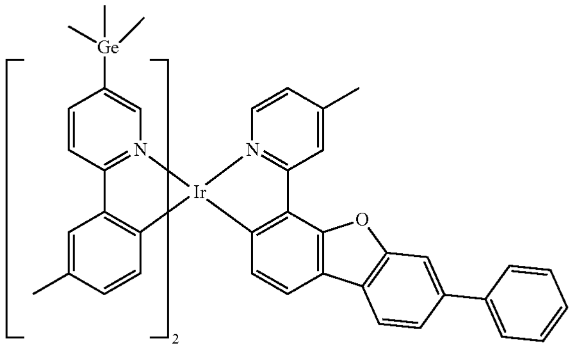
2183
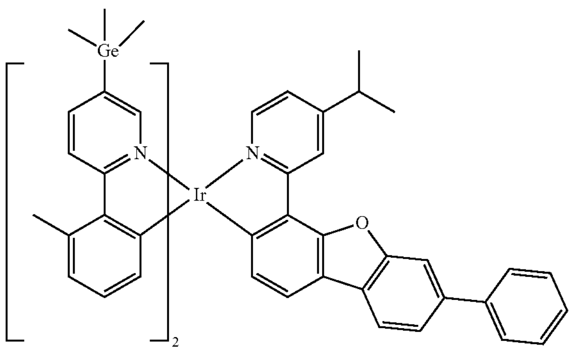
2184
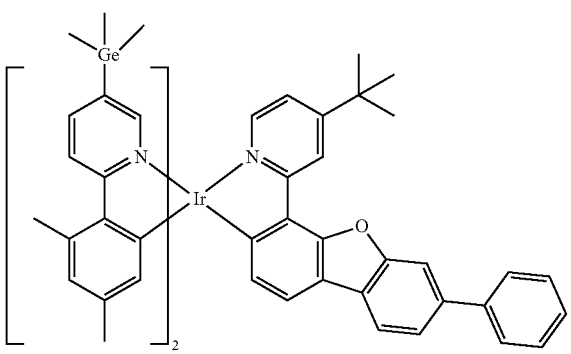
2185
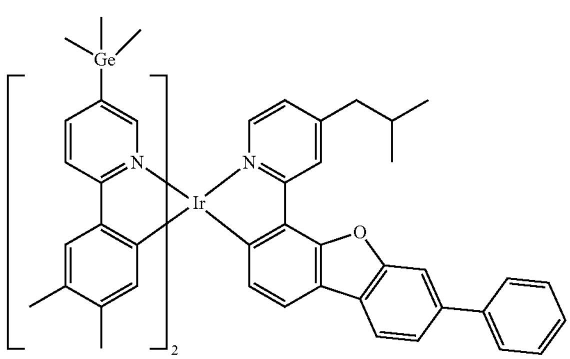
2186
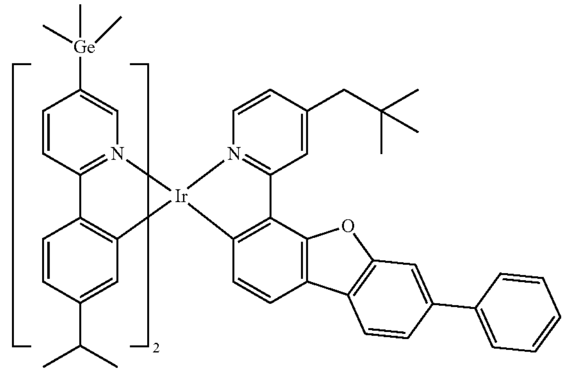
2187
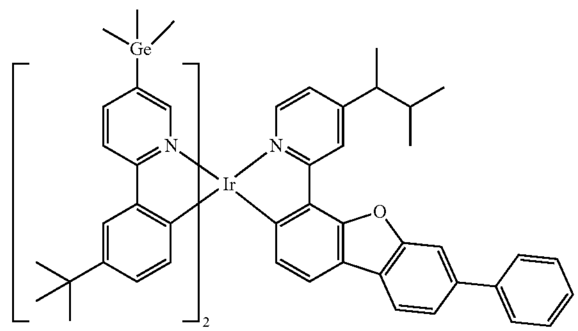
2188
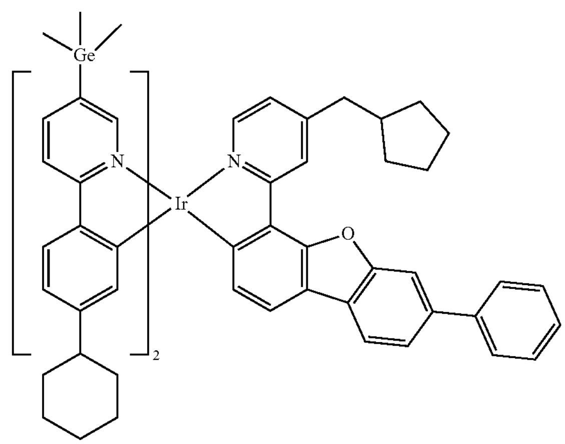
2189
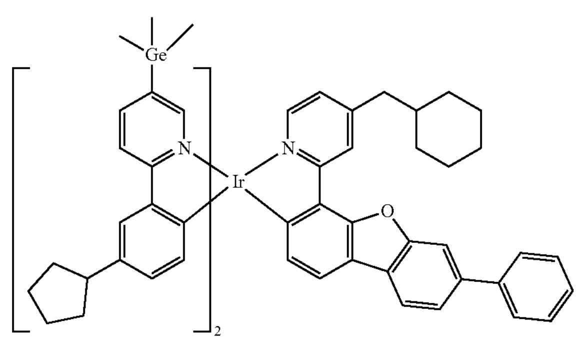

-continued
2190
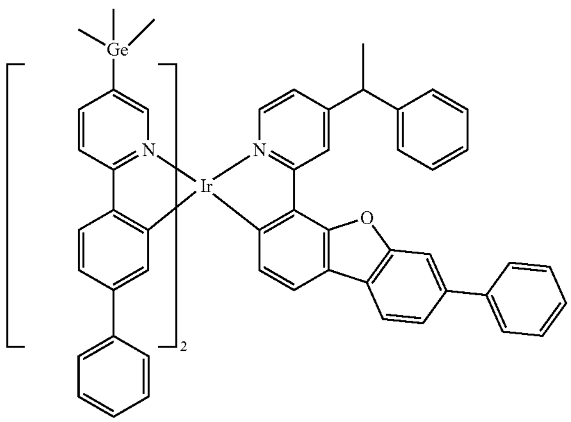
2191
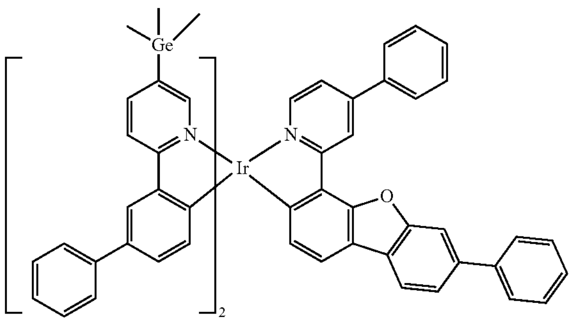
2192
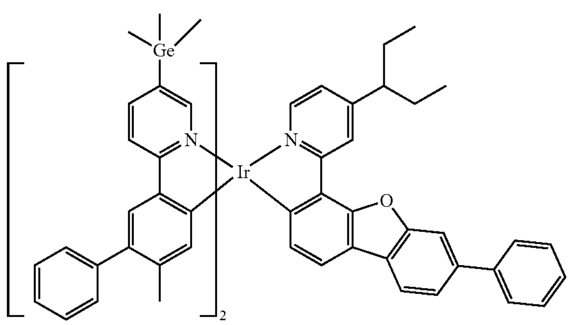
2193
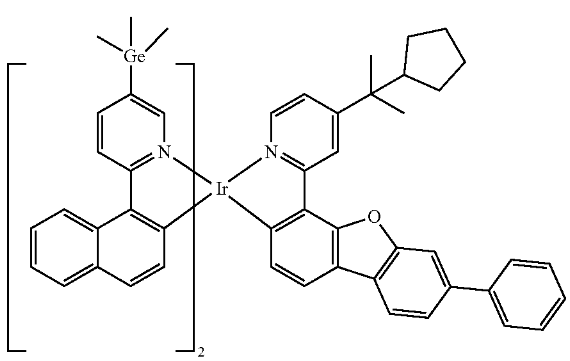
-continued
2194
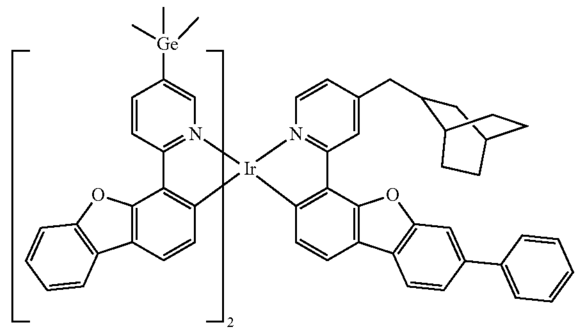
2195
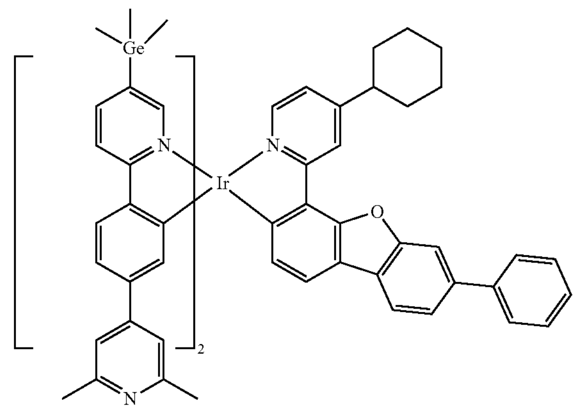
2196
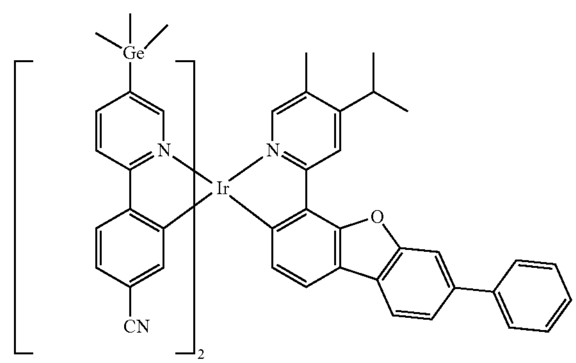
2197
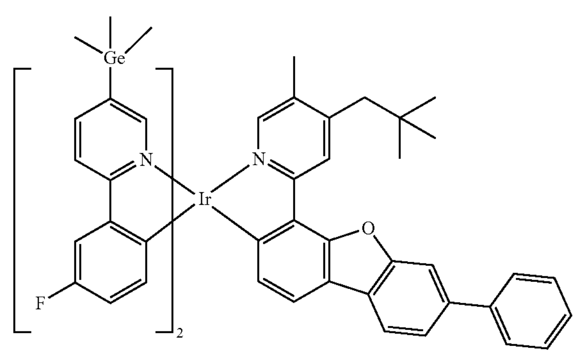

-continued
2198
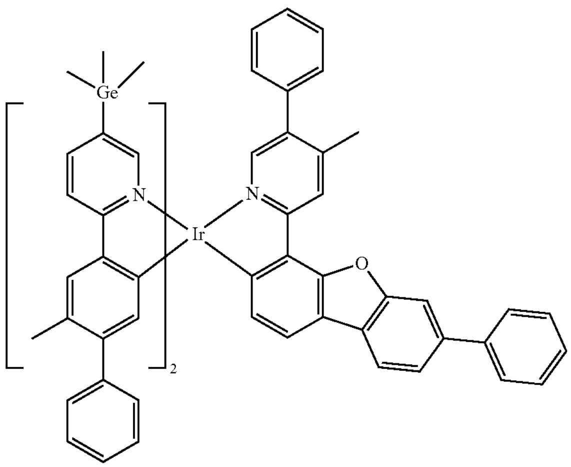
2199
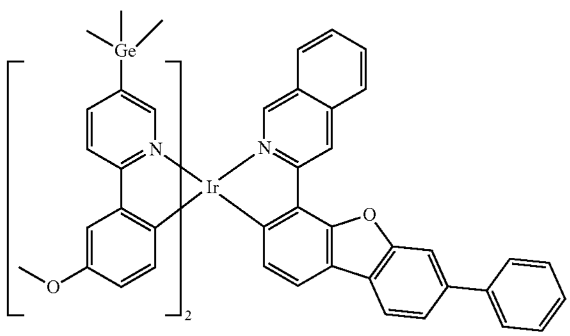
2200
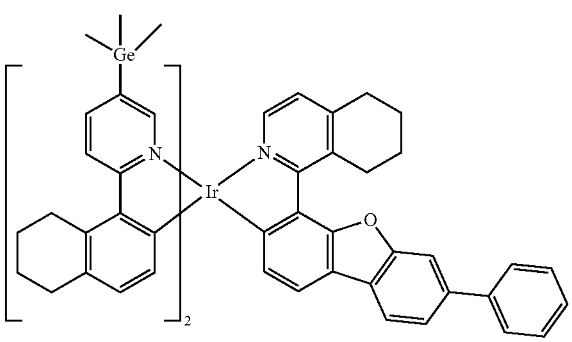
2201
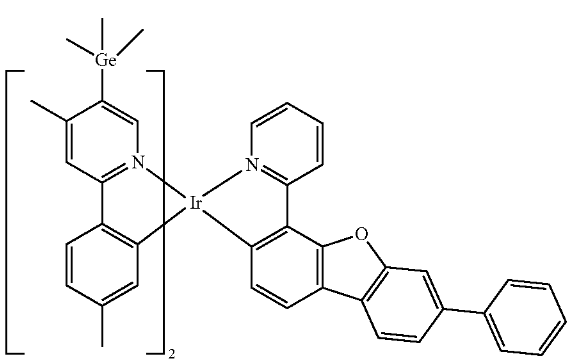
-continued
2202
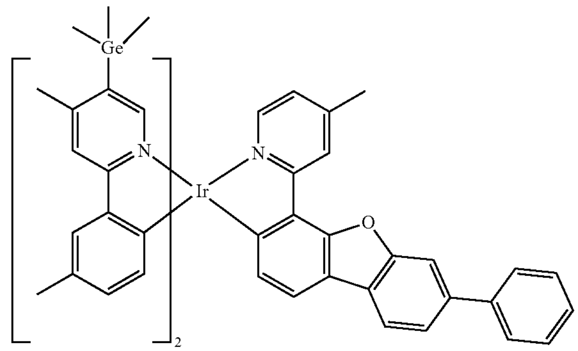
2203
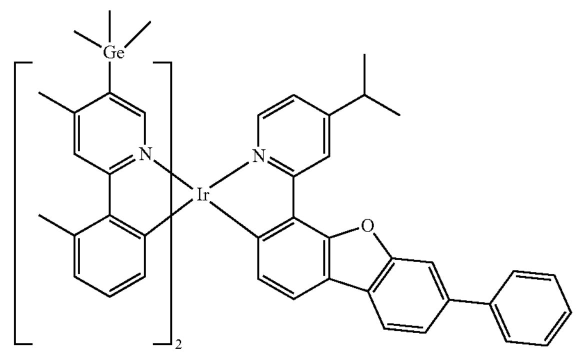
2204
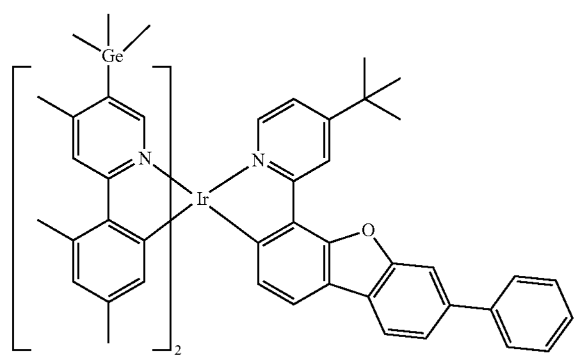
2205
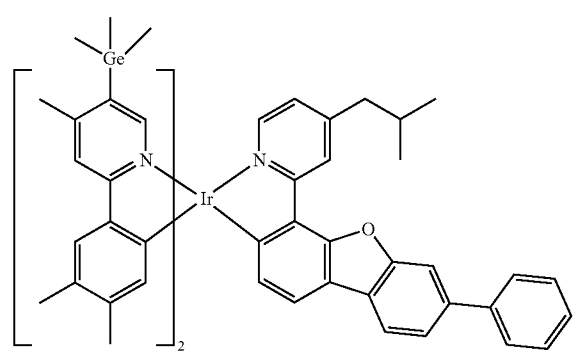

-continued
2206
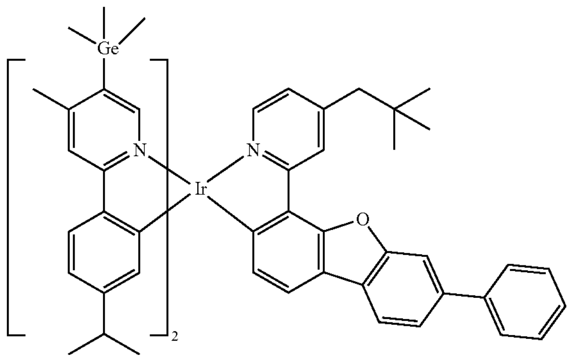
2207
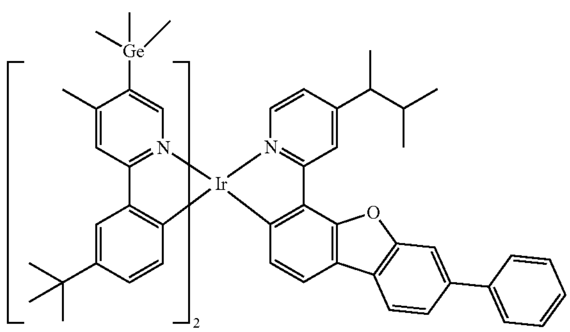
2208
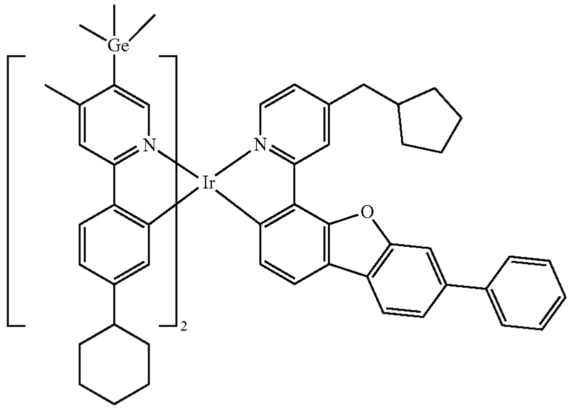
2209
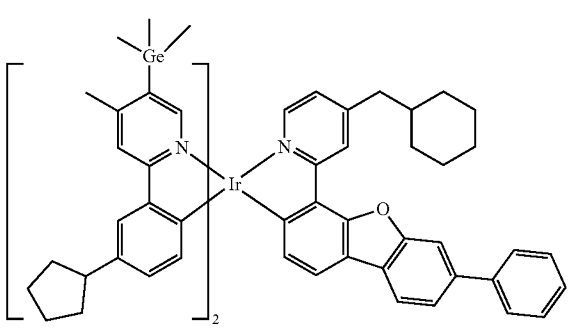
-continued
2210
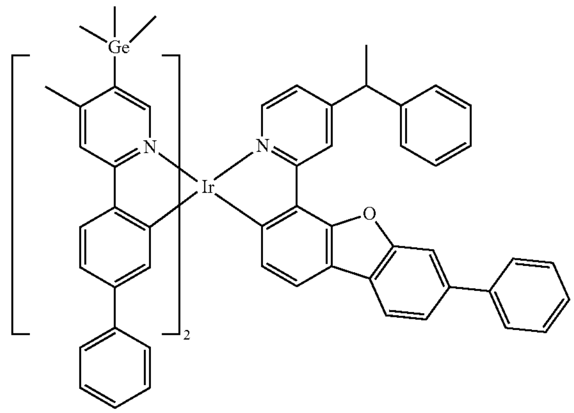
2211
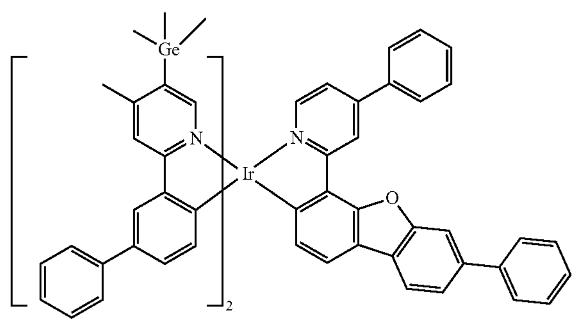
2212
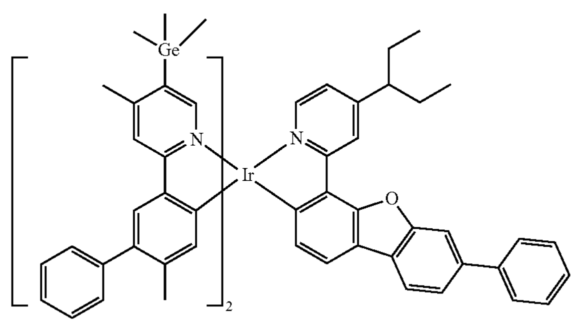
2213
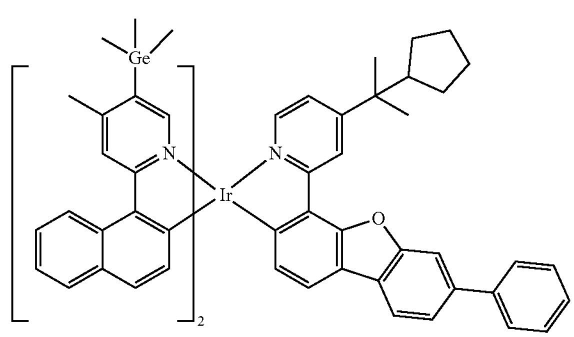

-continued
2214
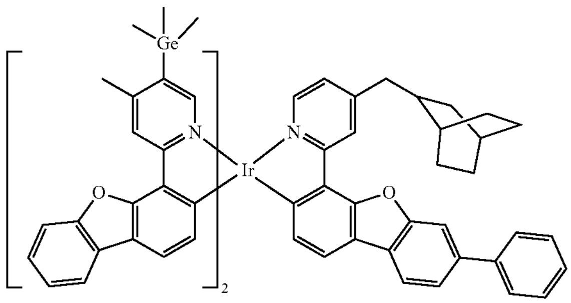
2215
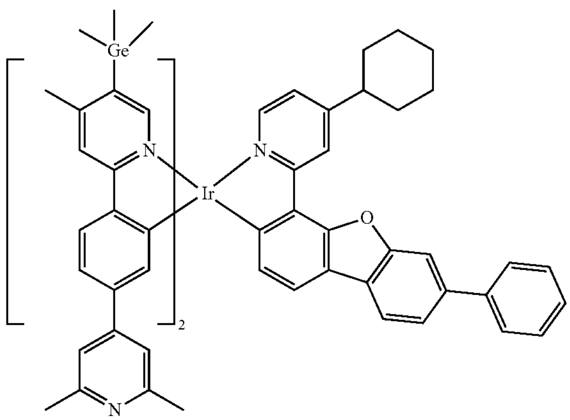
2216
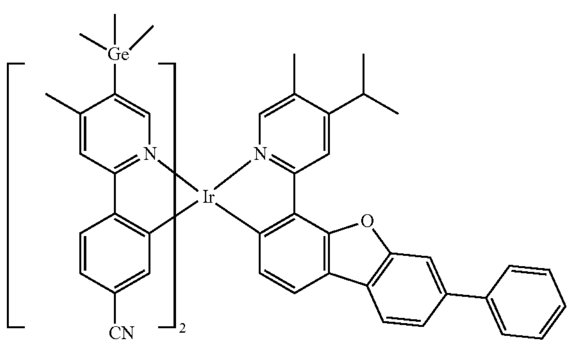
2217
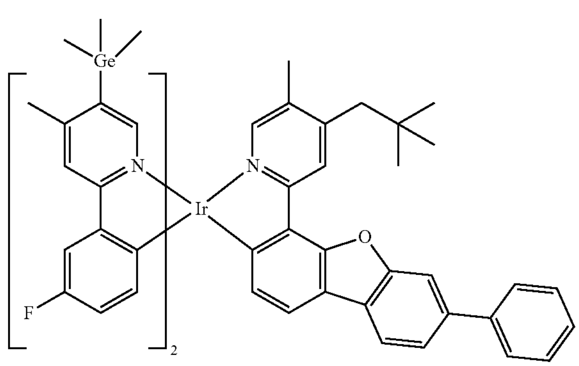
-continued
2218
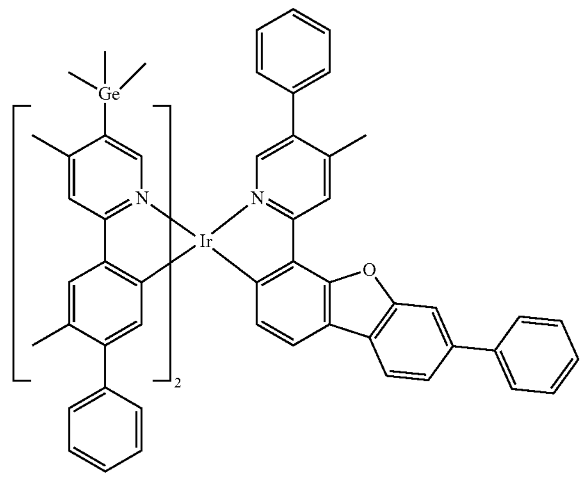
2219
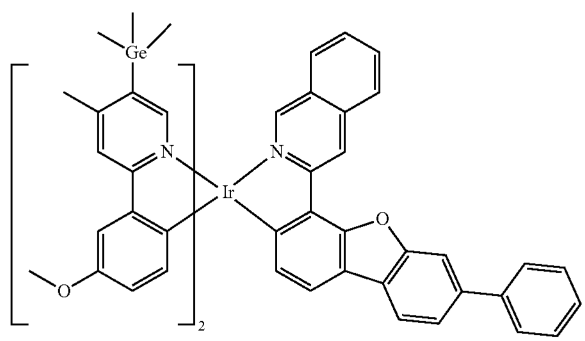
2220
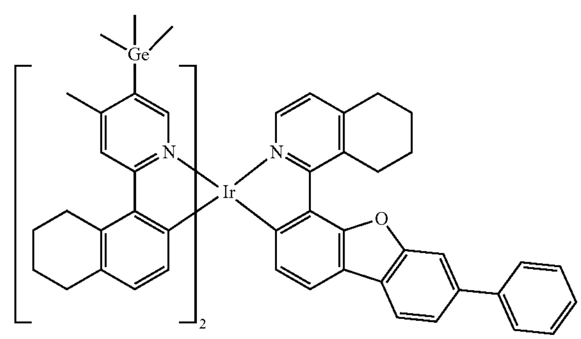
2221
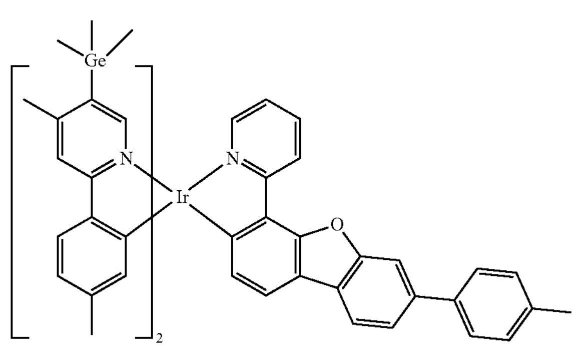

-continued
2222
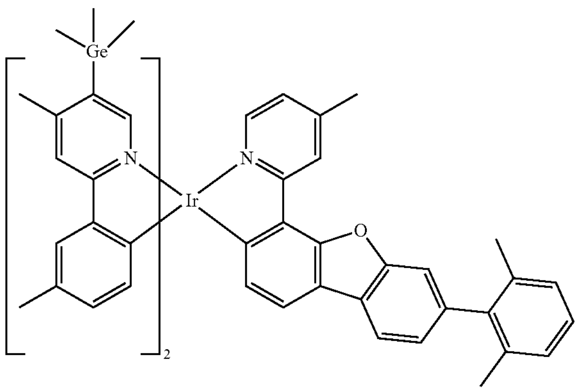
2223
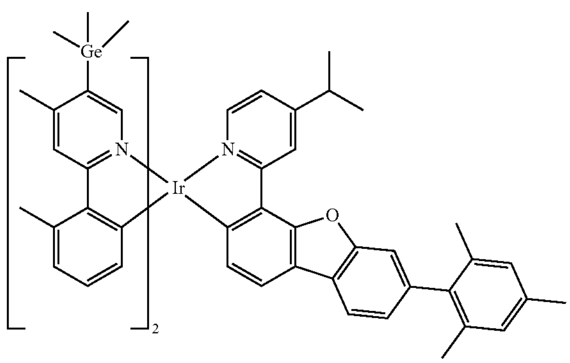
2224
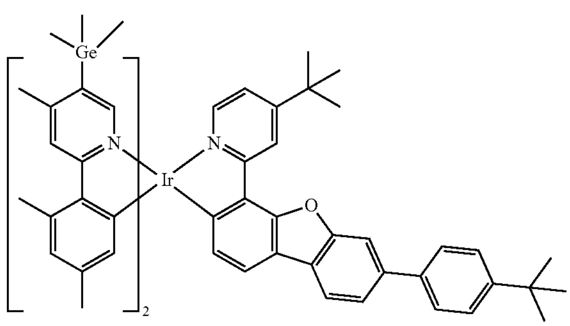
2225
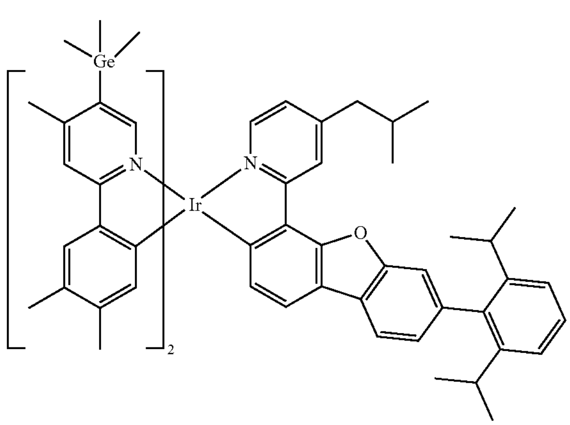
-continued
2226
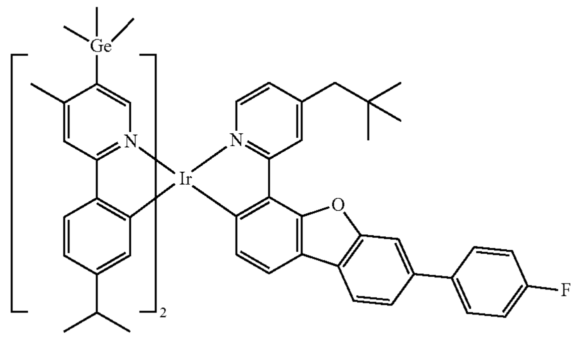
2227
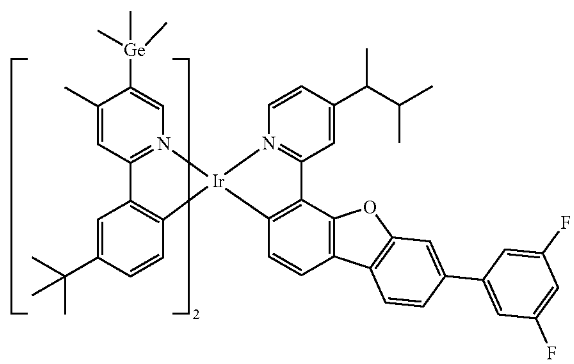
2228
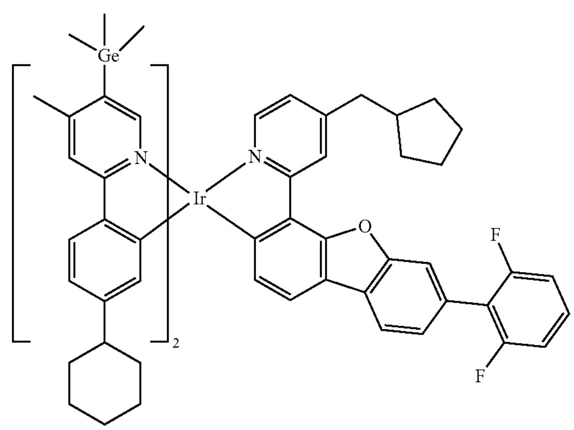
2229
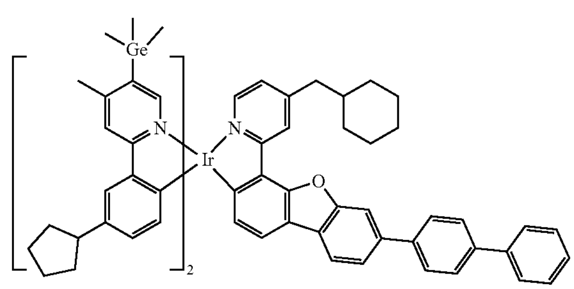

2230
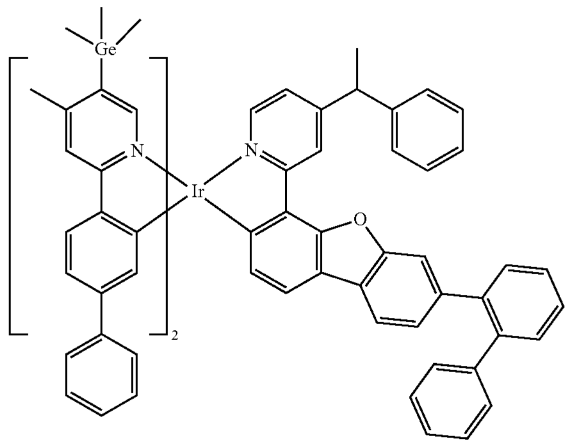
2231
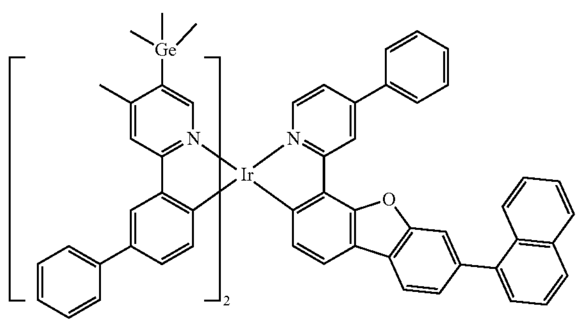
2232
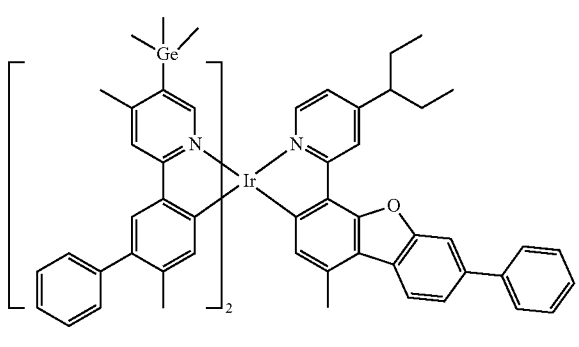
2233
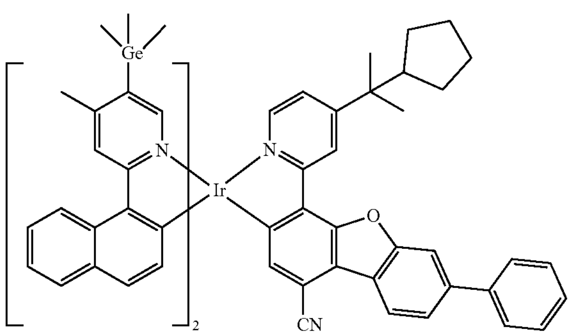
2234
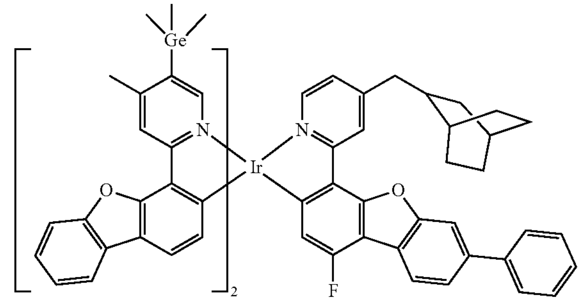
2235
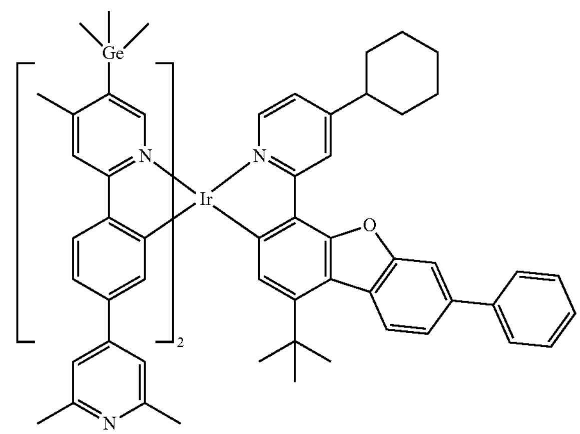
2236
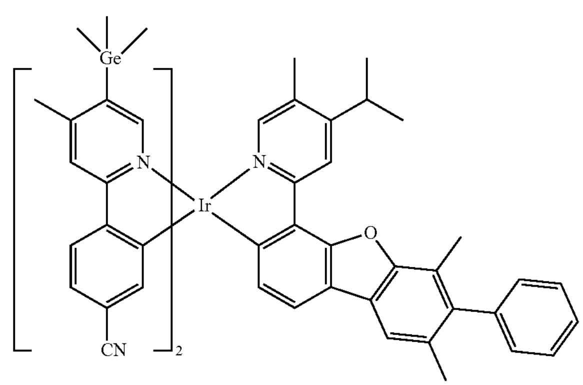
2237
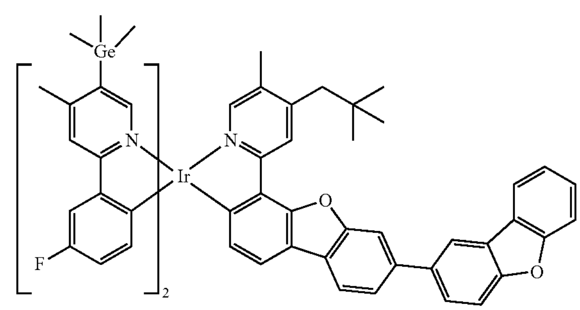

-continued
2238
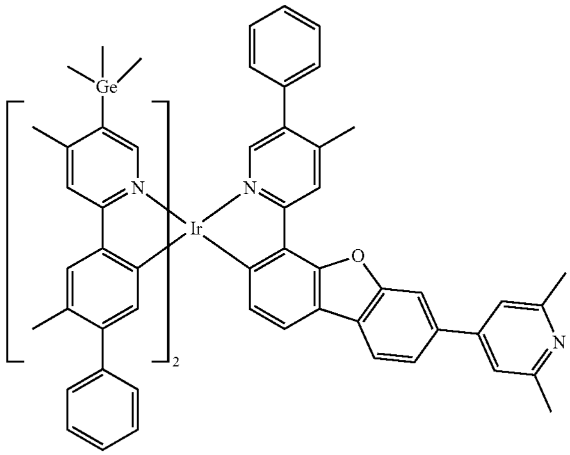
2239
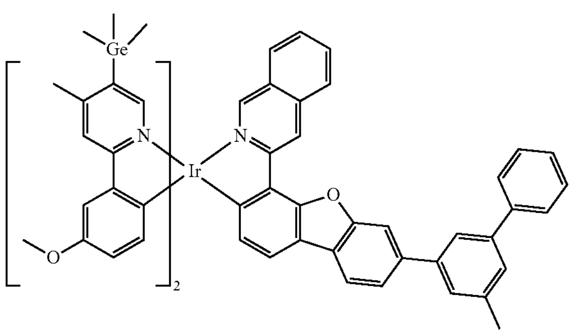
2240
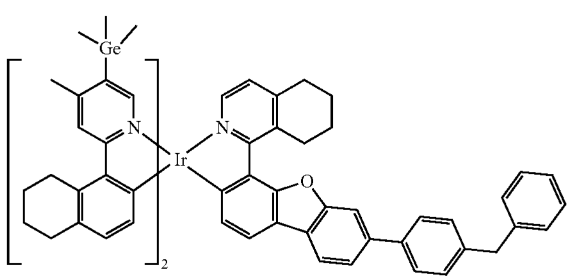
2241
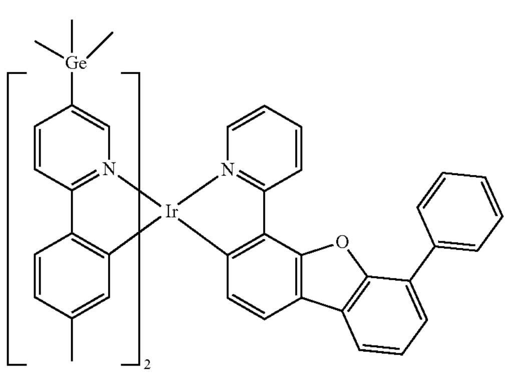
-continued
2242
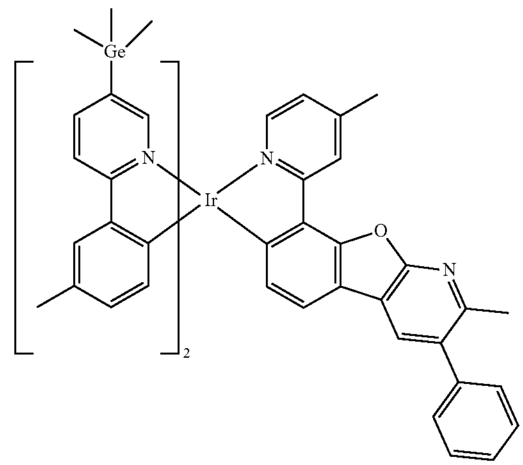
2243
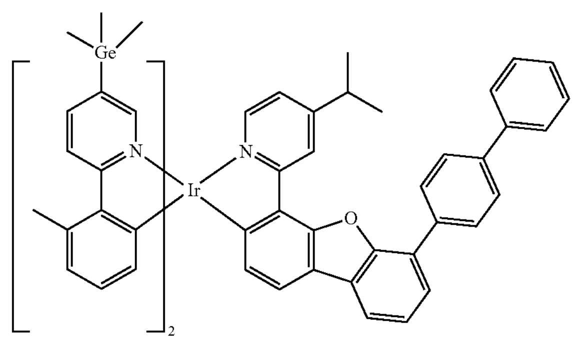
2244
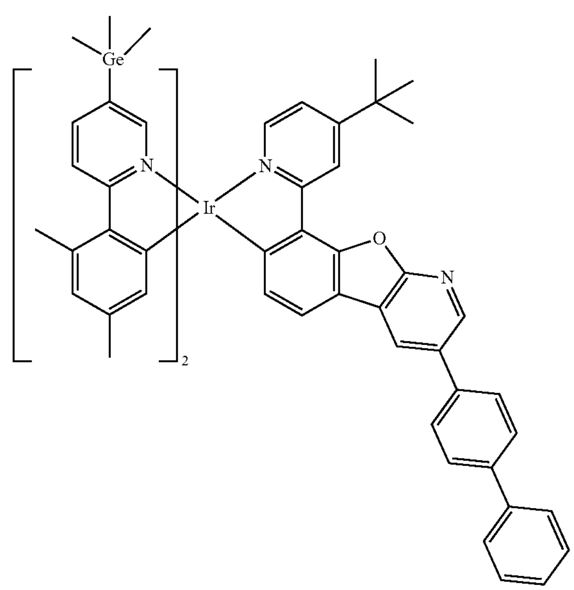

-continued
2245
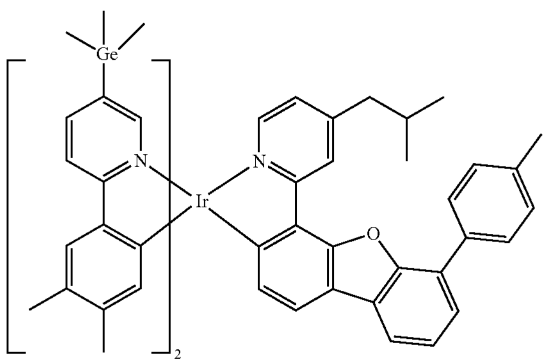
2246
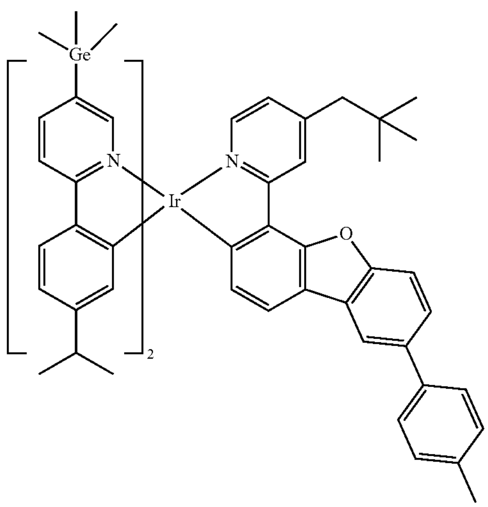
2247
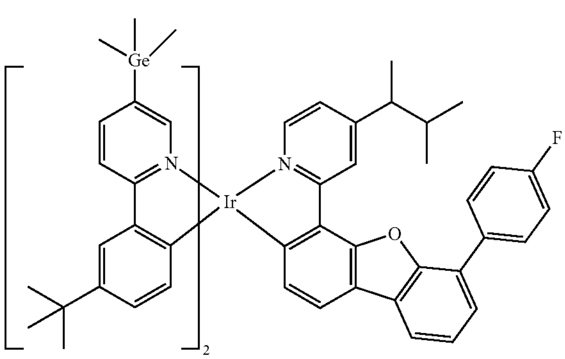
-continued
2248
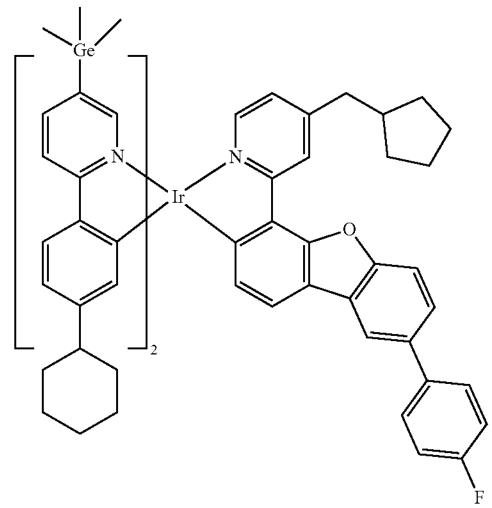
2249
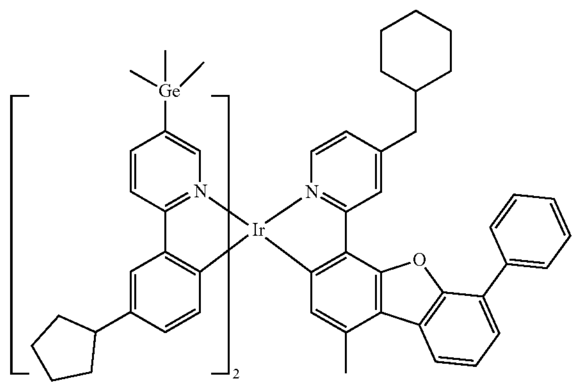
2250
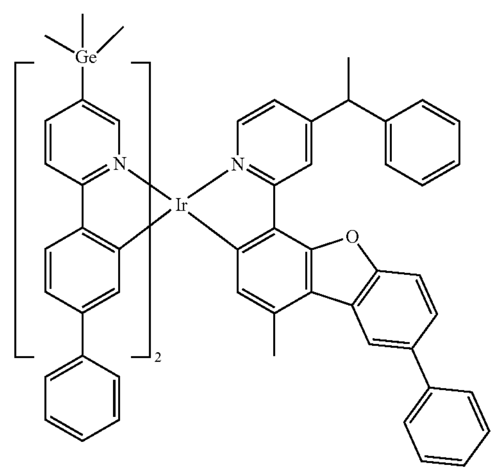

-continued
2251
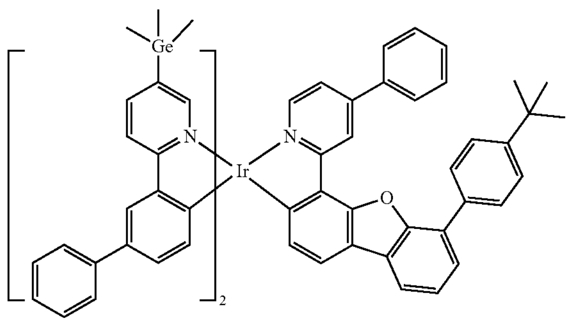
2252
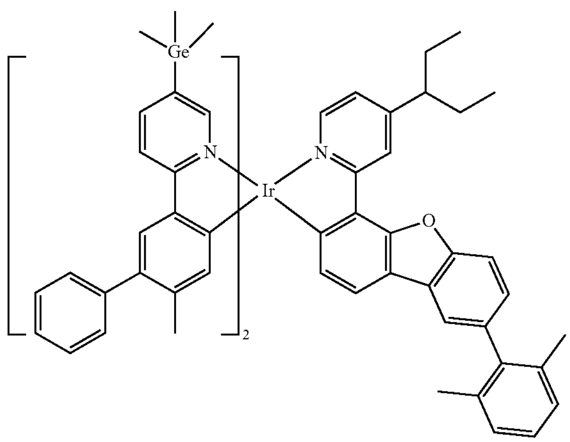
2253
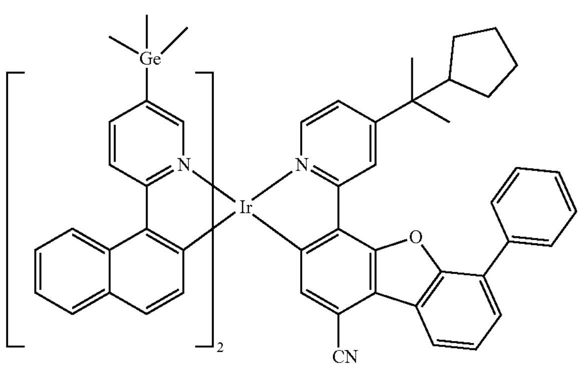
2254
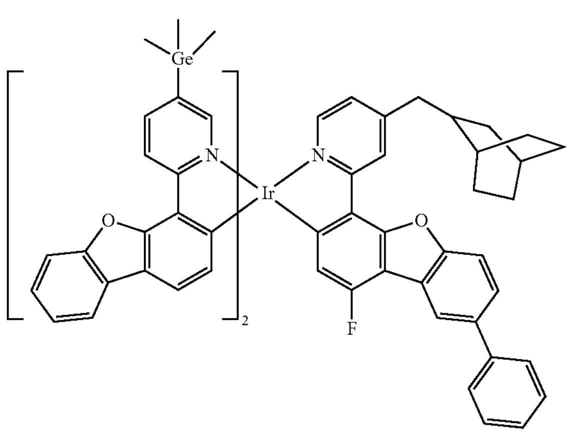
-continued
2255
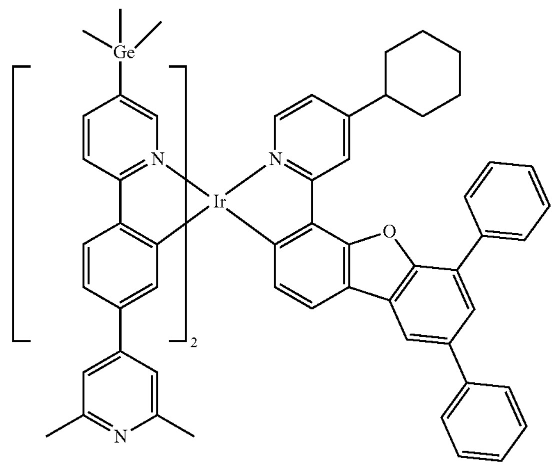
2256
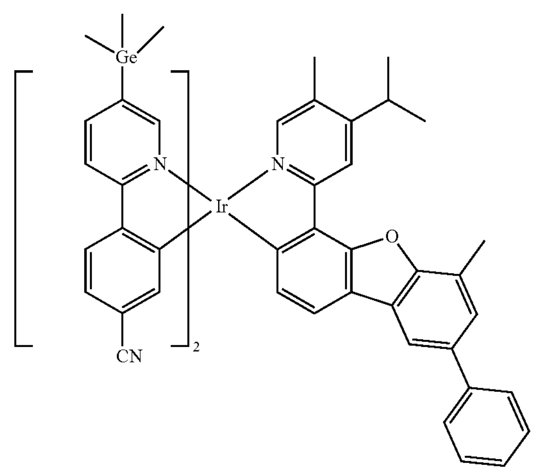
2257
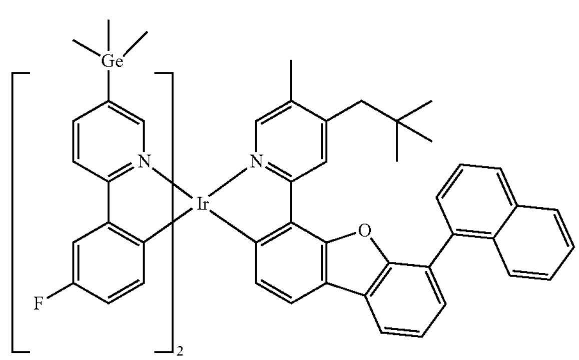

-continued
2258
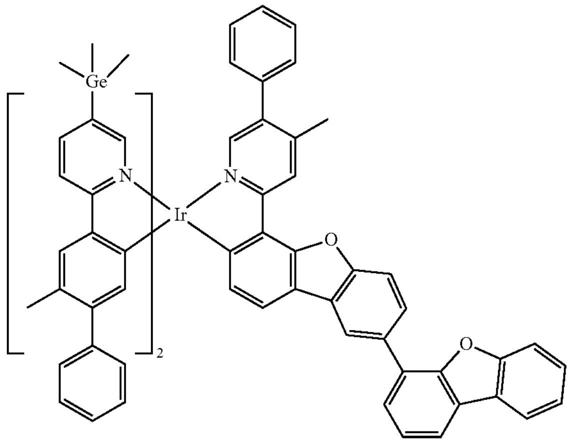
2259
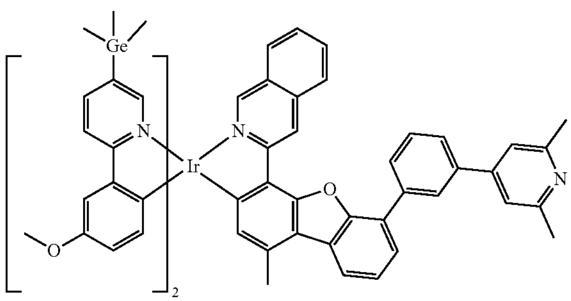
2260
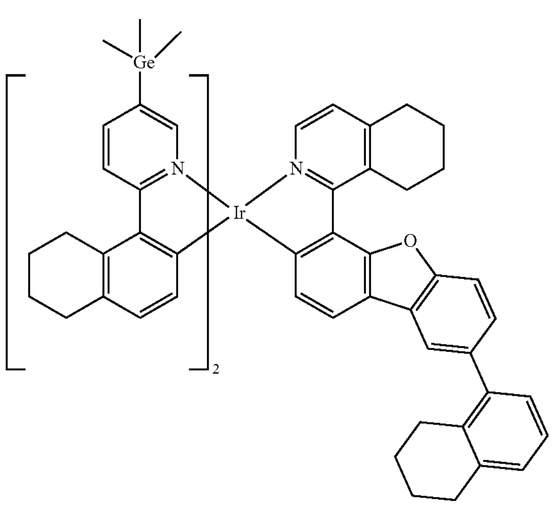
-continued
2261
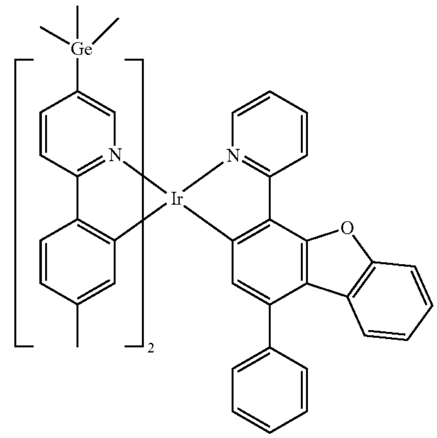
2262
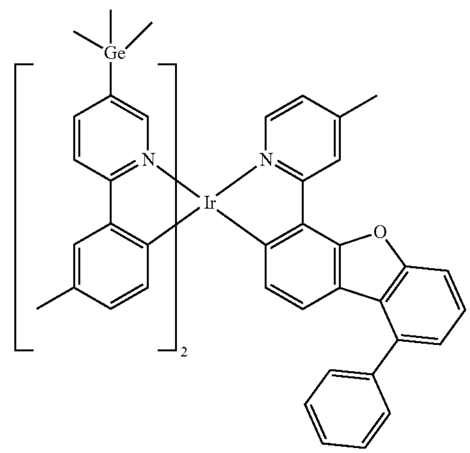
2263
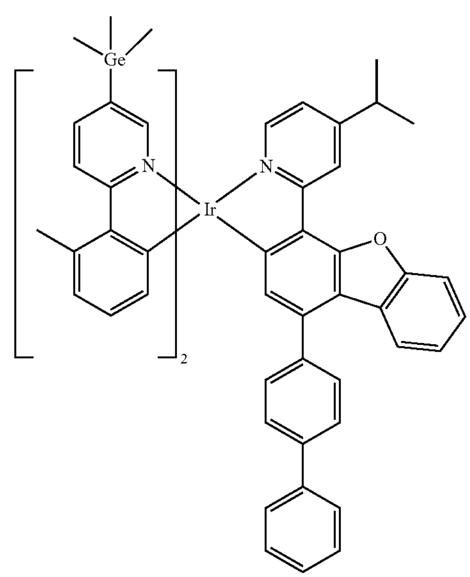

-continued
2264
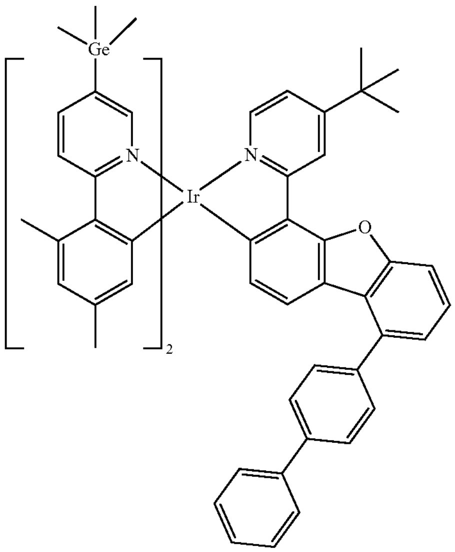
2265
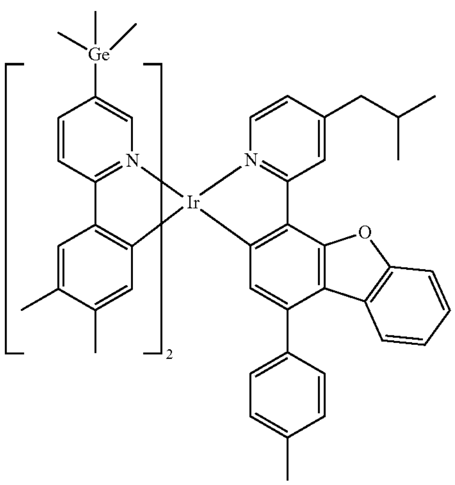
2266
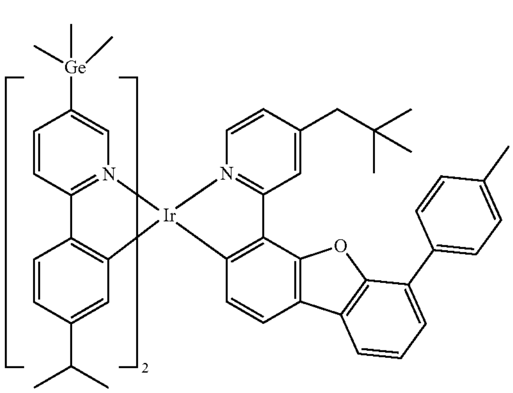
-continued
2267
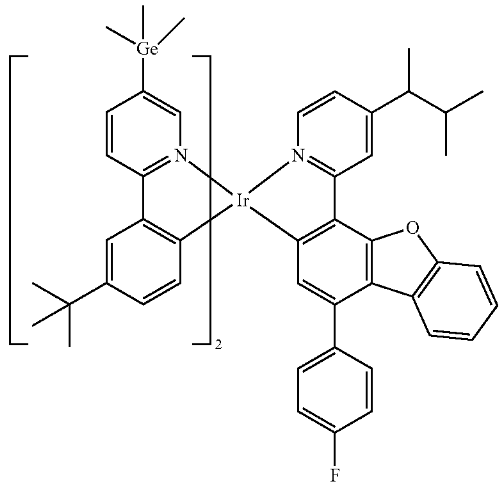
2268
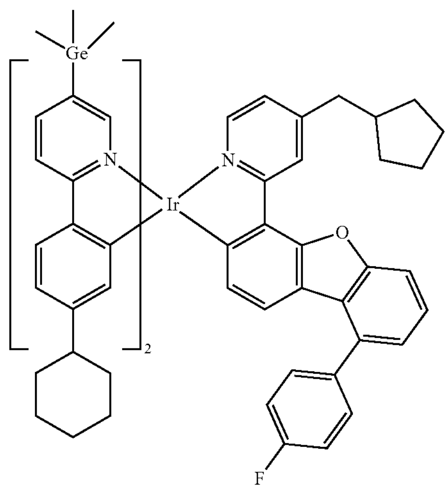
2269
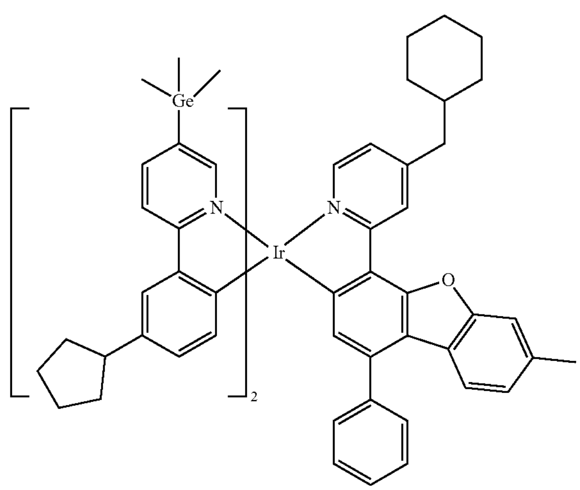

-continued
2270
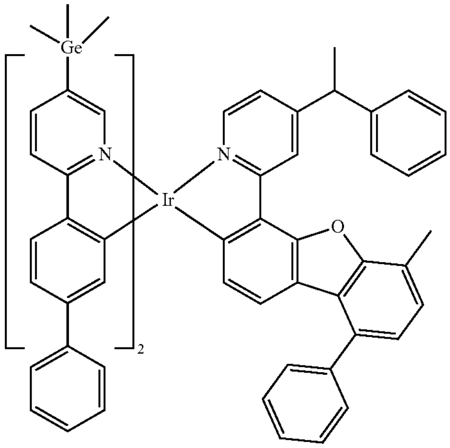
2271
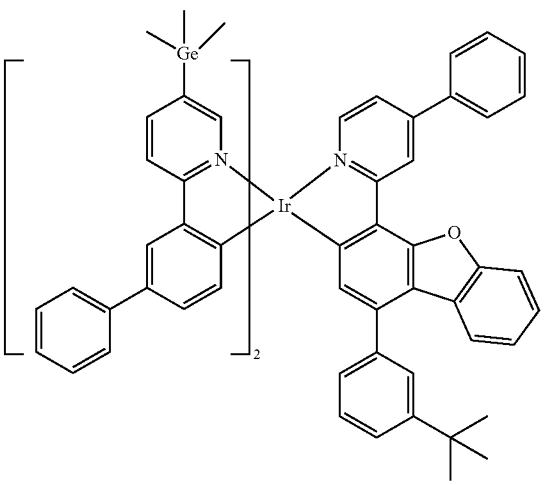
2272
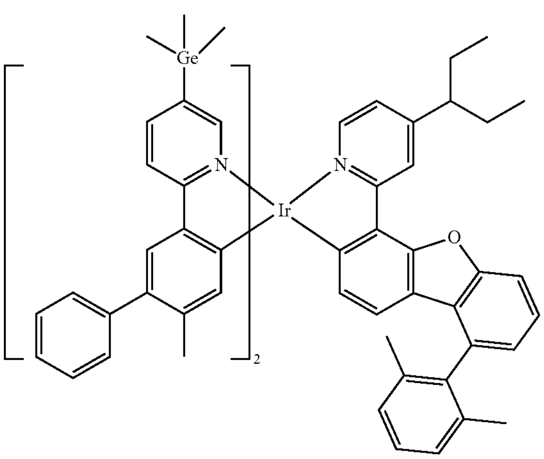
-continued
2273
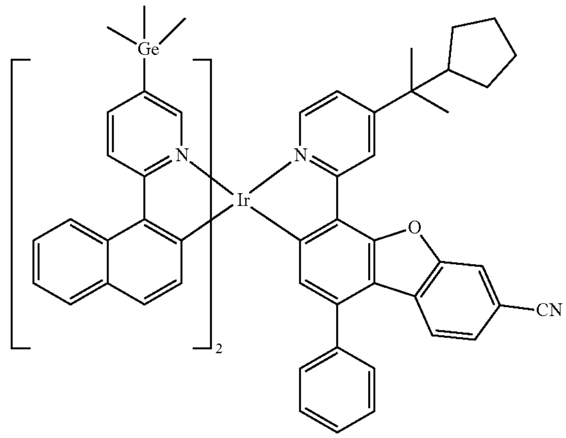
2274
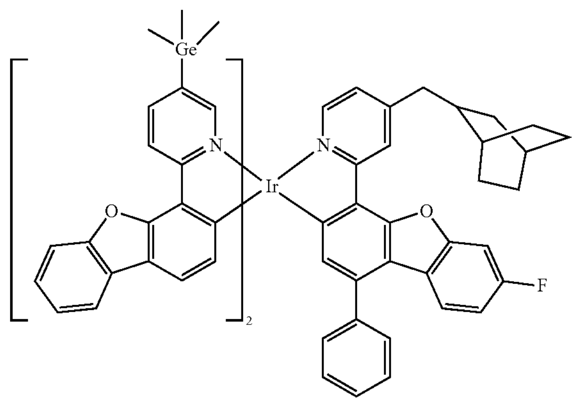
2275
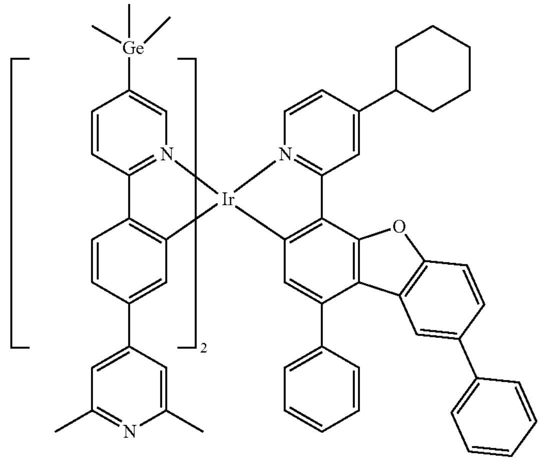

-continued
2276
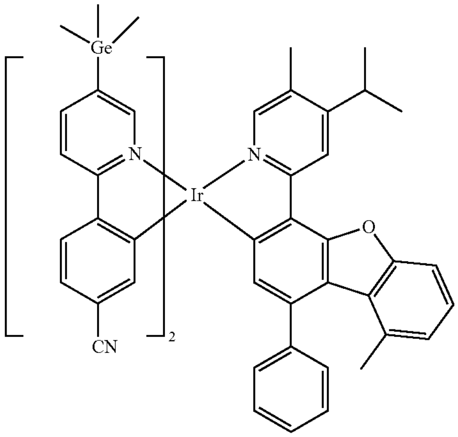
2277
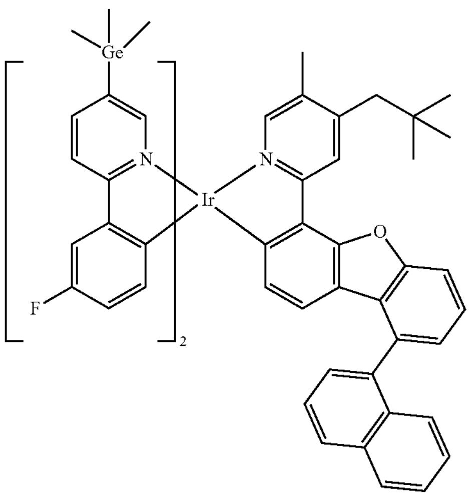
2278
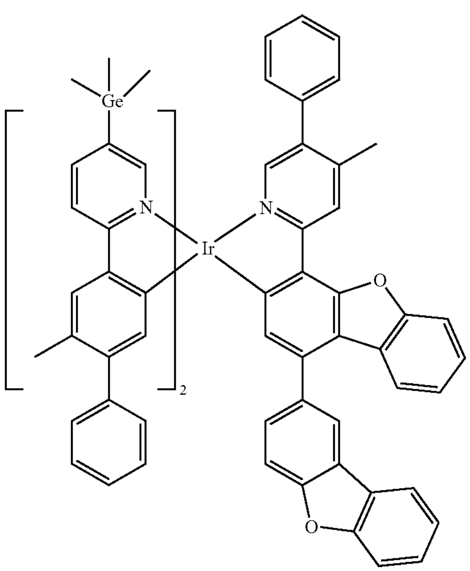
-continued
2279
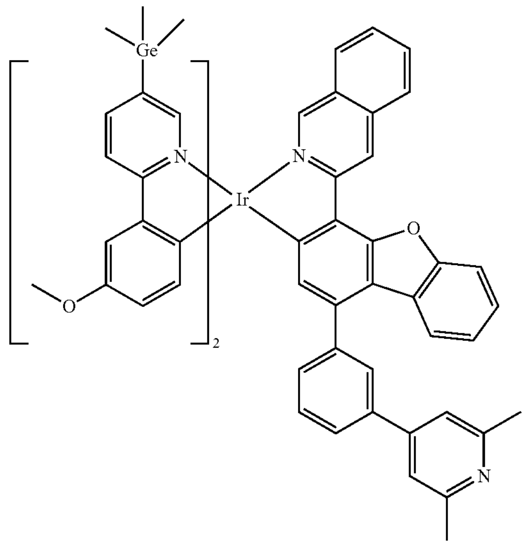
2280
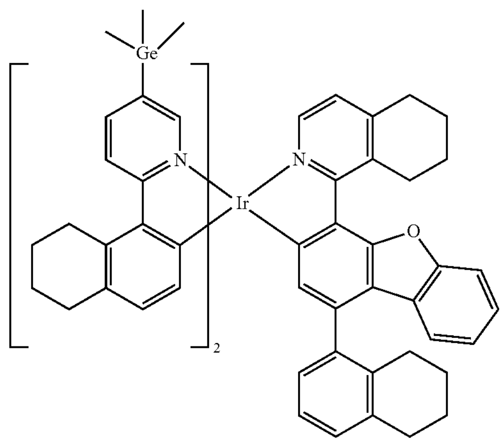
2281
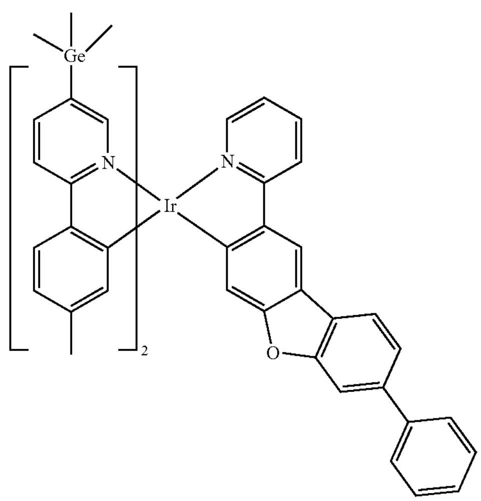

-continued
2282
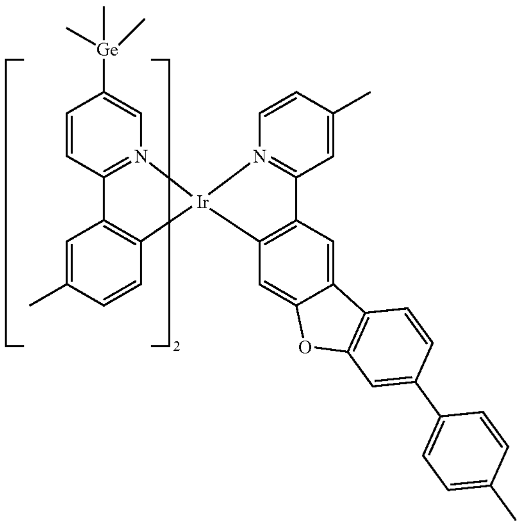
2283
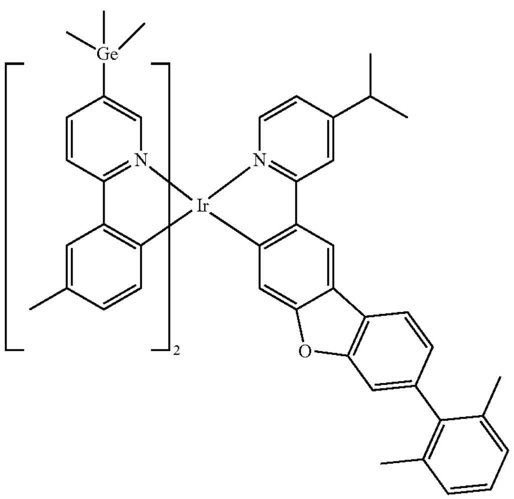
2284
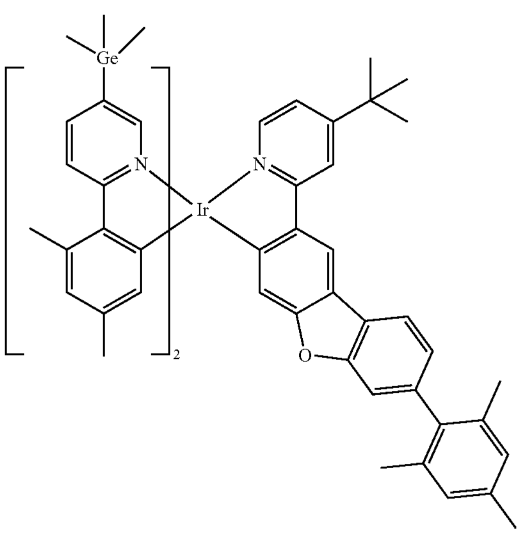
-continued
2285
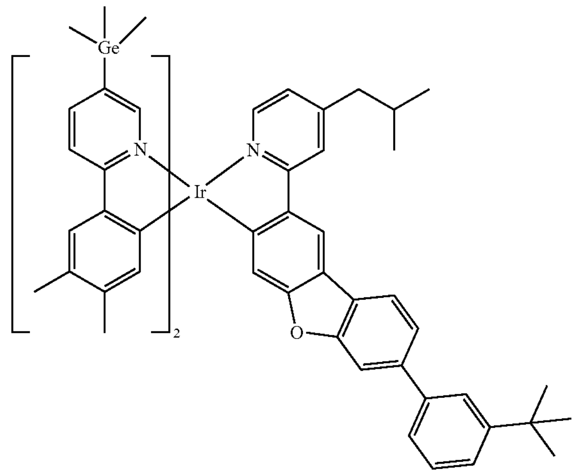
2286
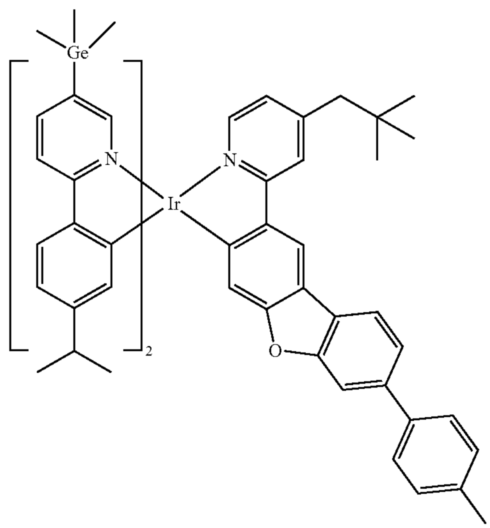
2287
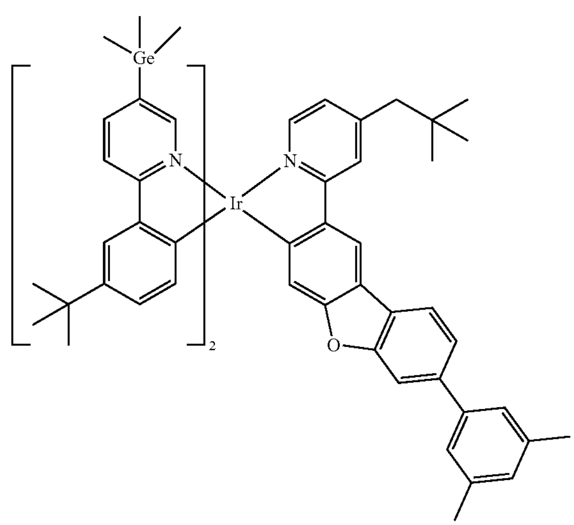

-continued
2288
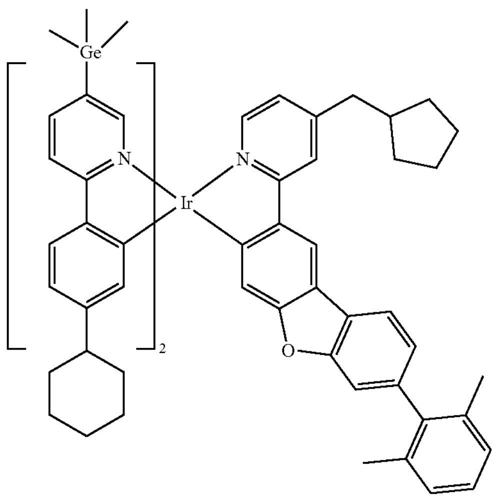
2289
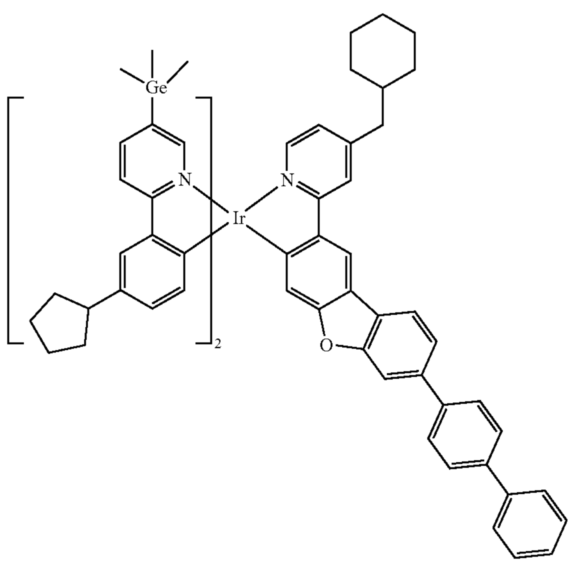
2290
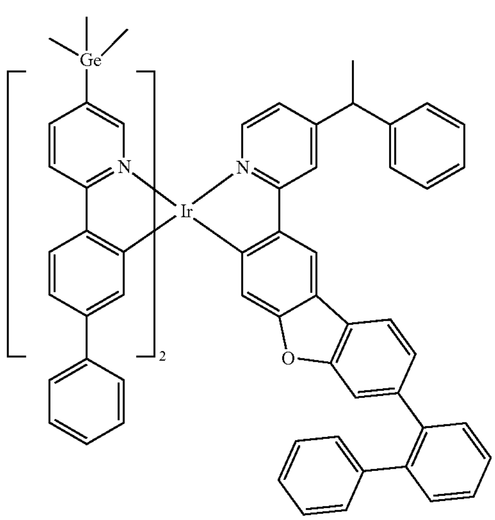
-continued
2291
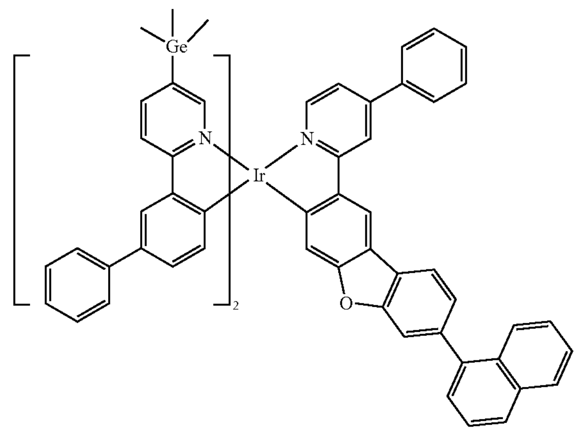
2292
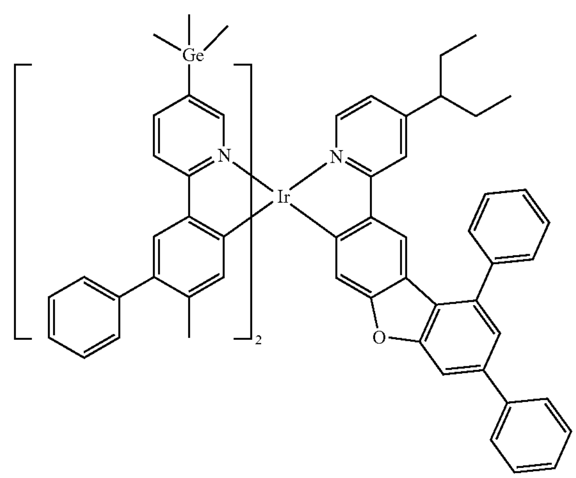
2293
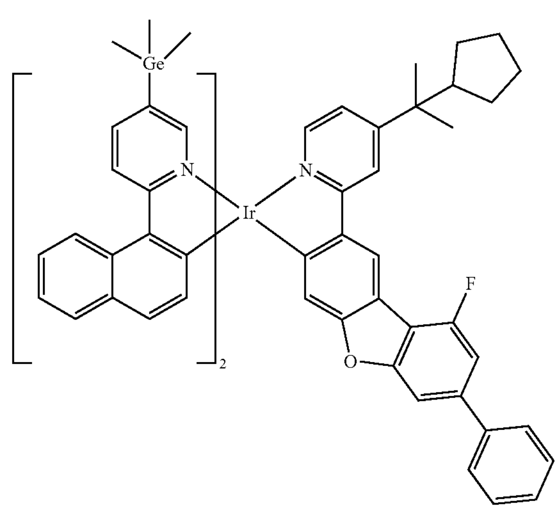

-continued
2294
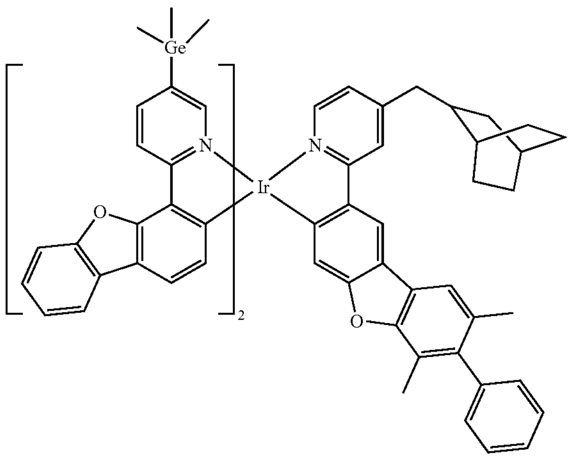
2295
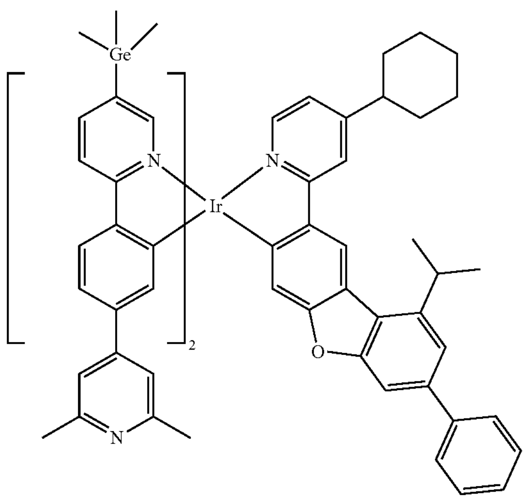
2296
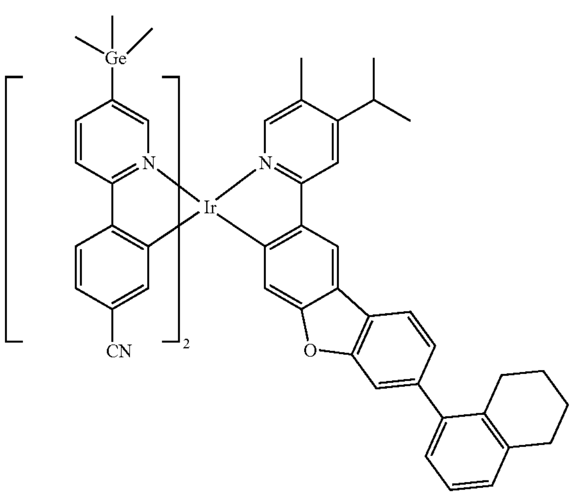
-continued
2297
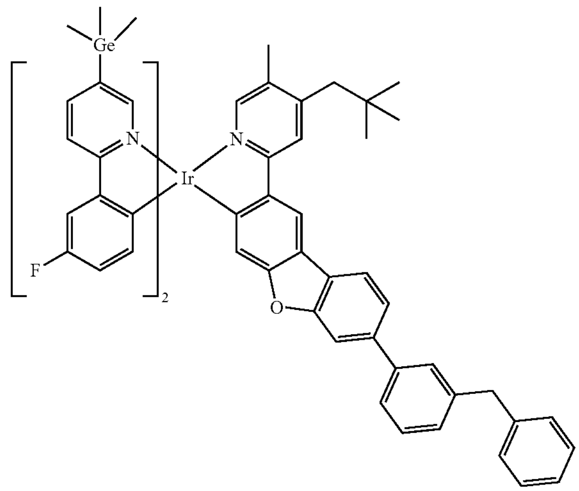
2298
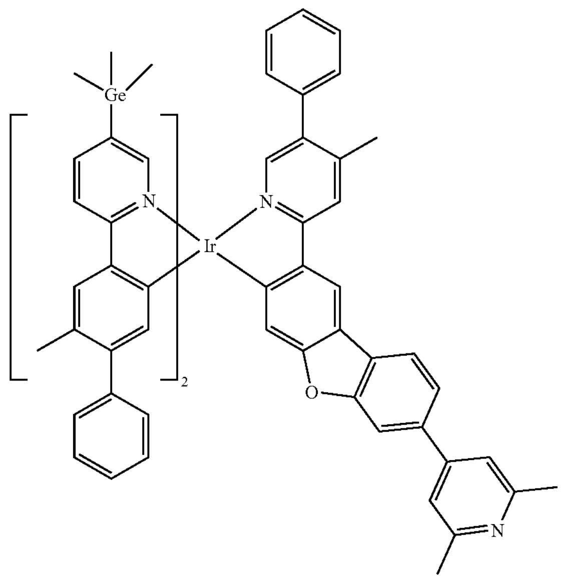
2299
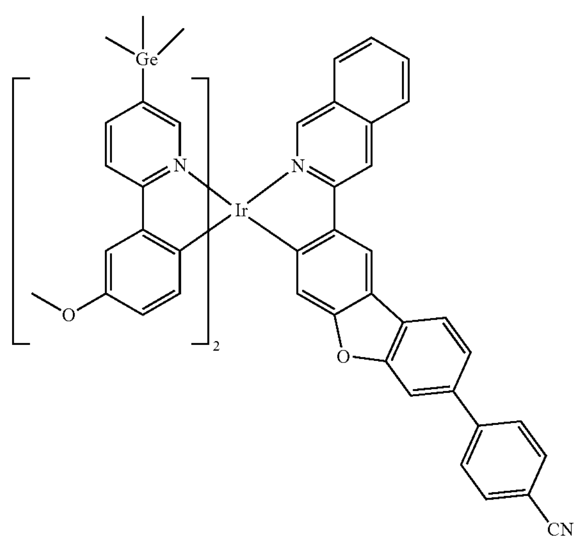

-continued
2300
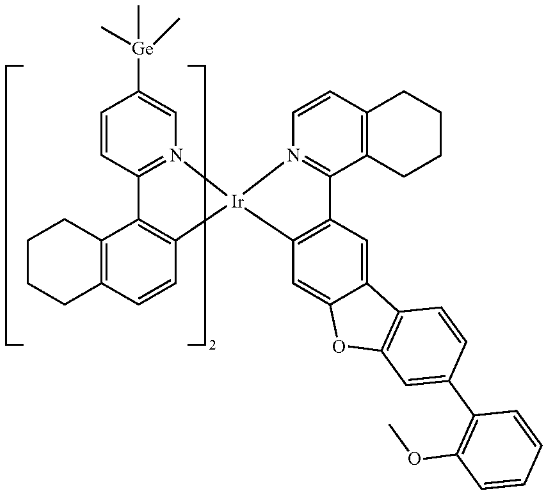
2301
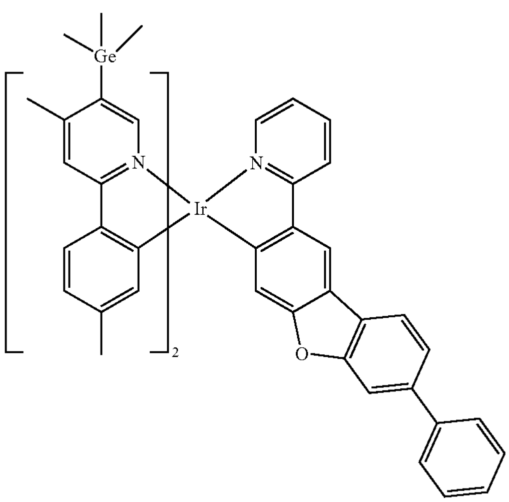
2302
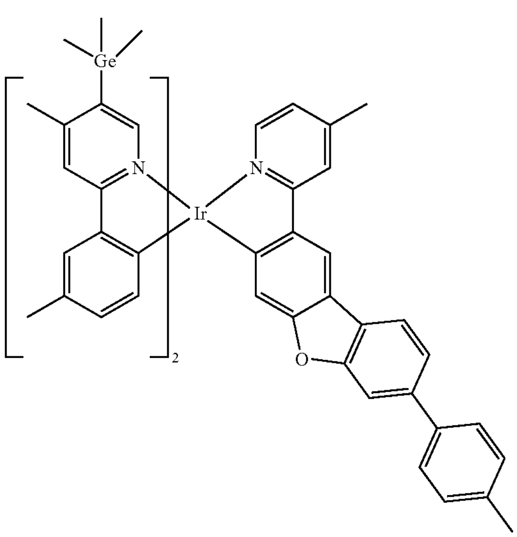
-continued
2303
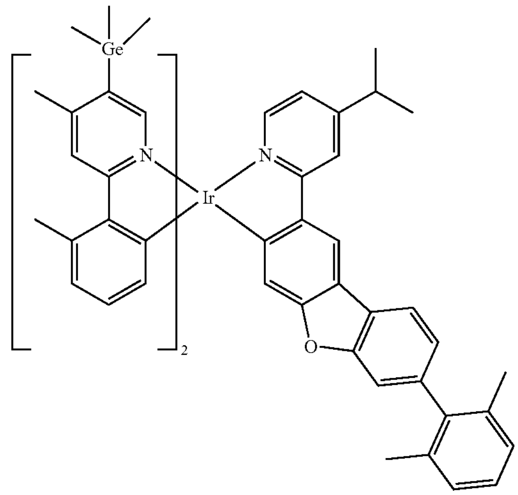
2304
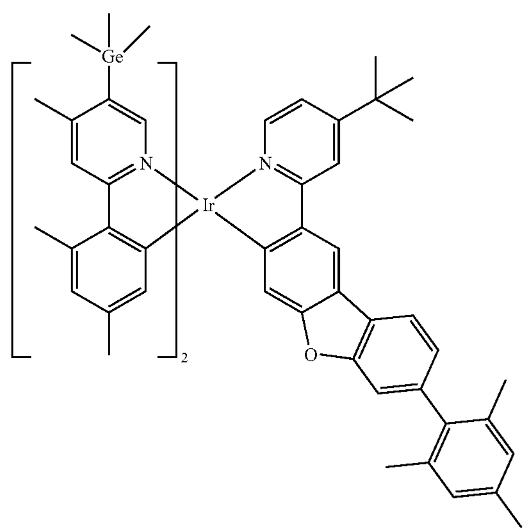
2305
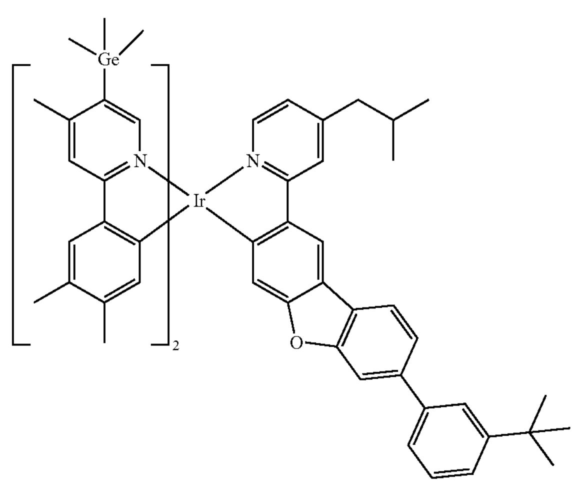

-continued
2306
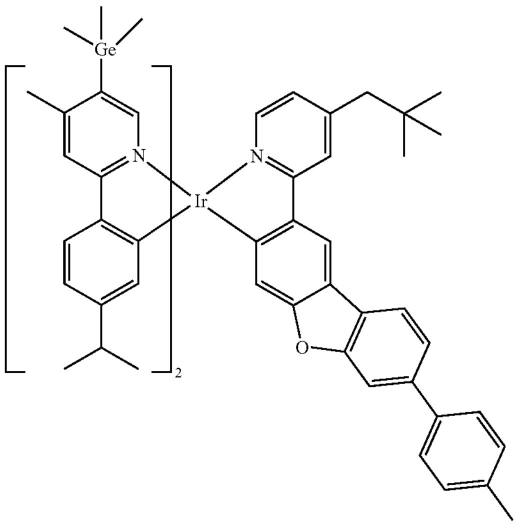
2307
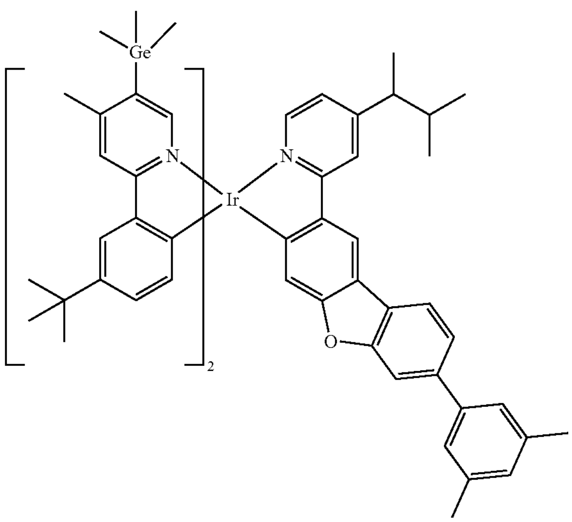
2308
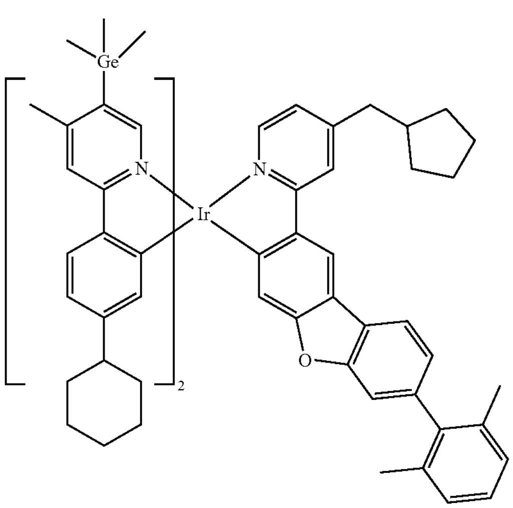
-continued
2309
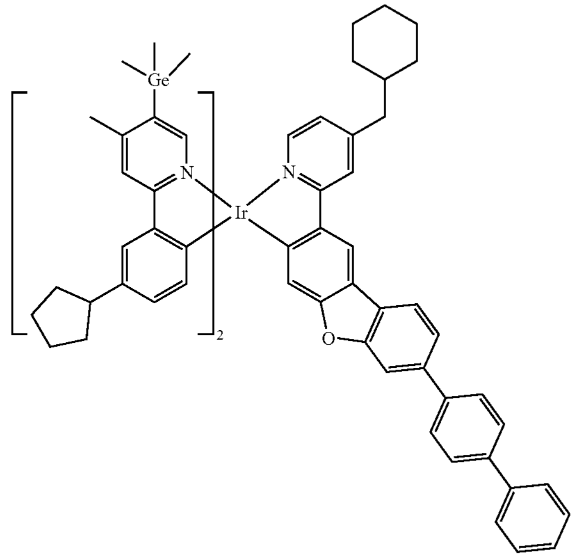
2310
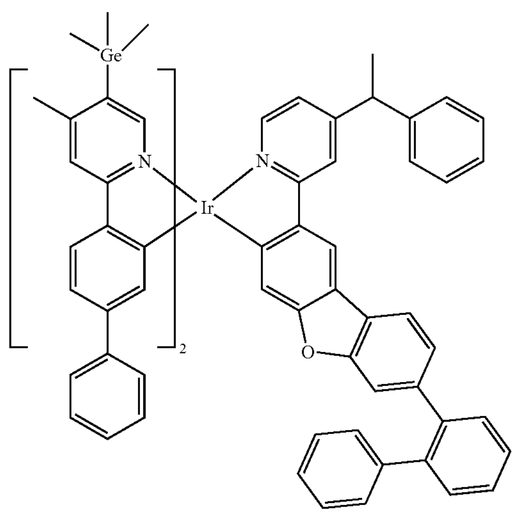
2311
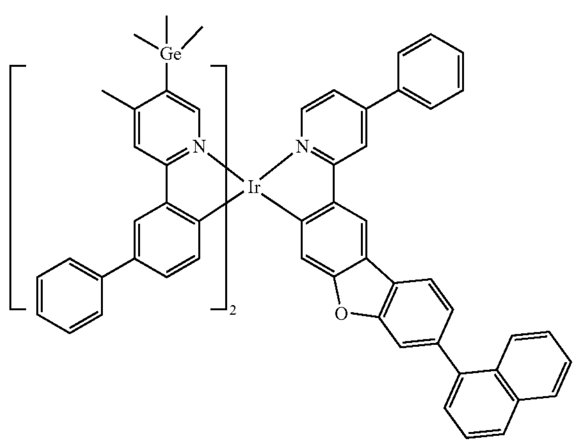

2312
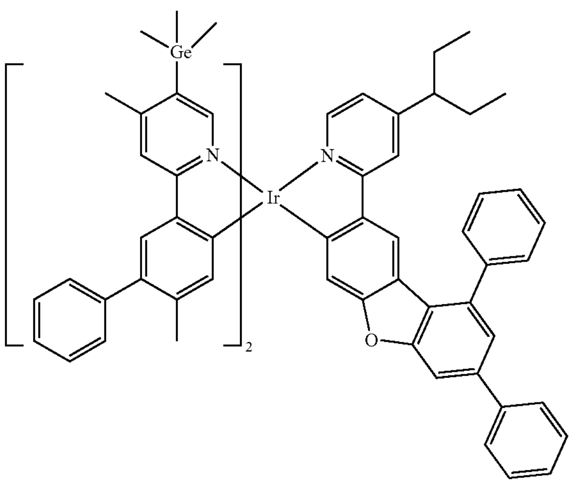
2313
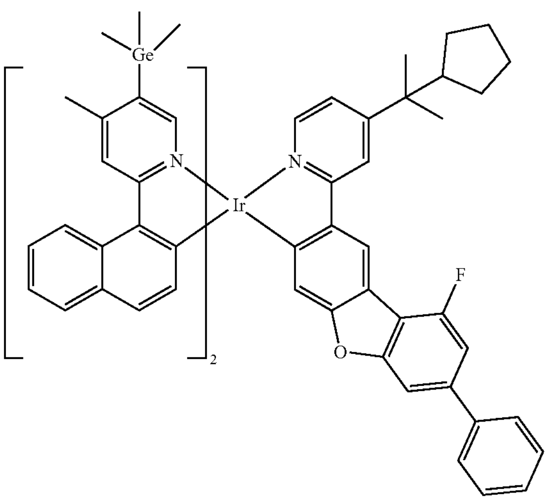
2314
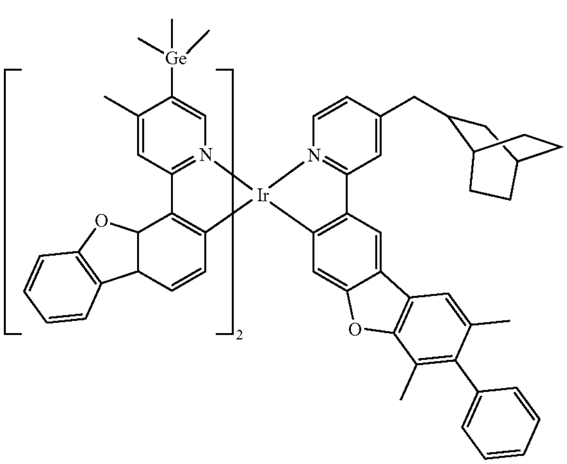
2315
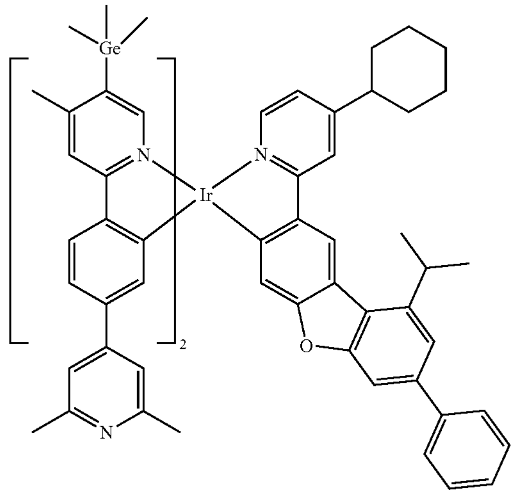
2316
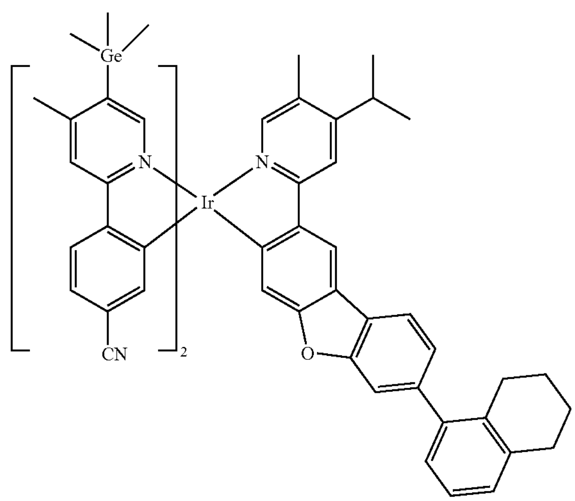
2317
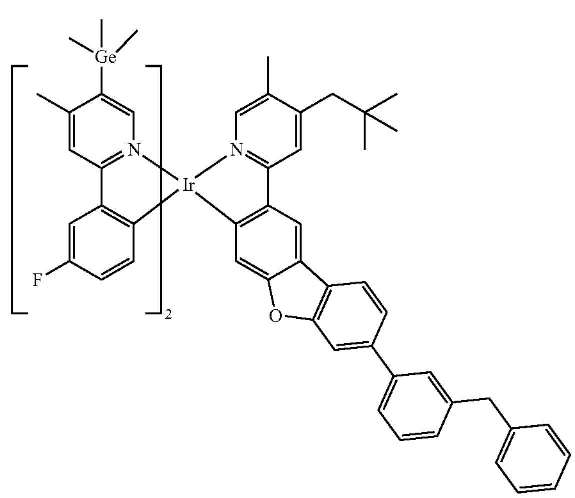

2318
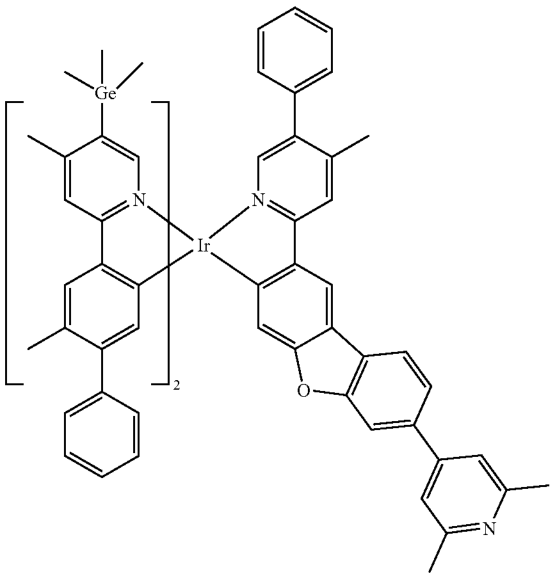
2319
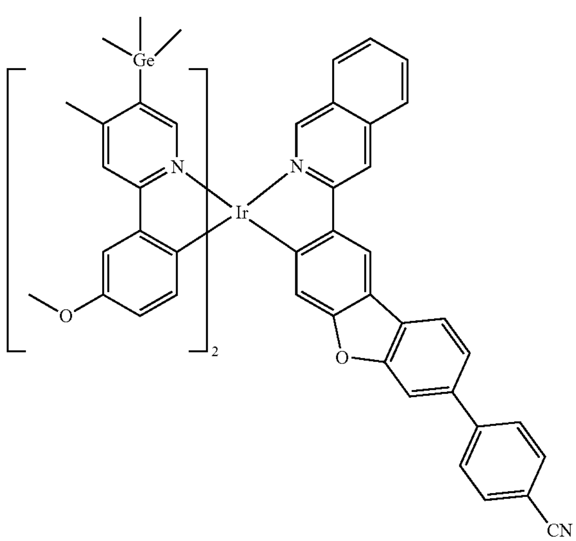
2320
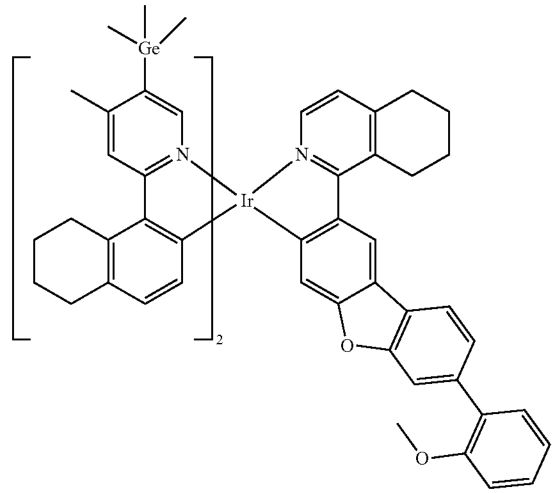
2321
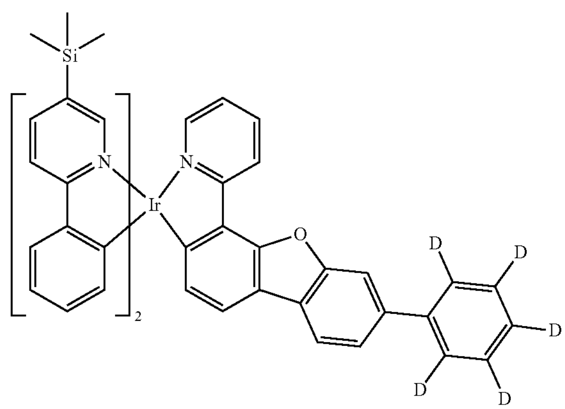
2322
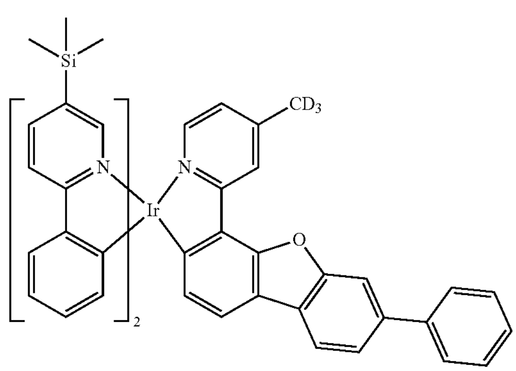

-continued
2323
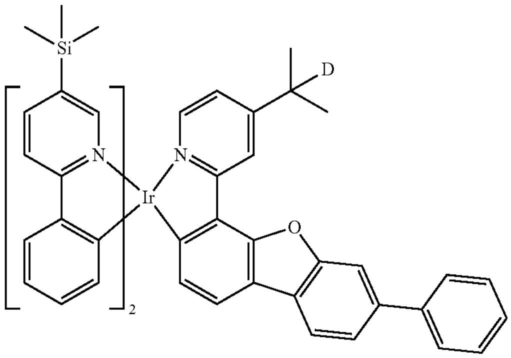
2324
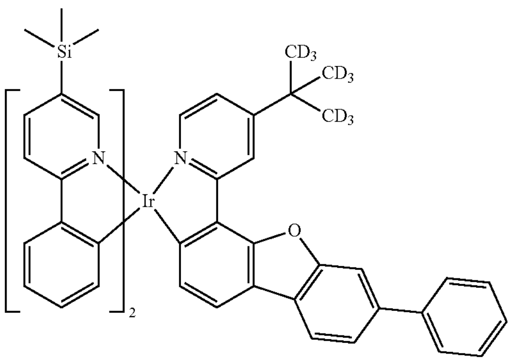
2325
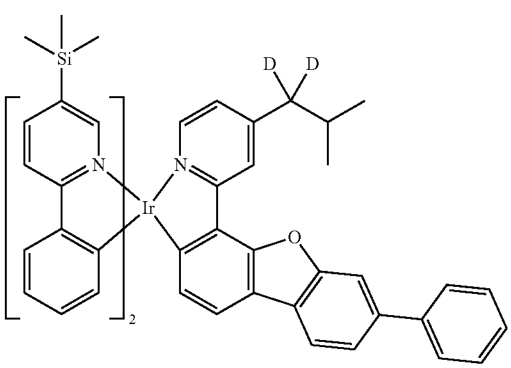
2326
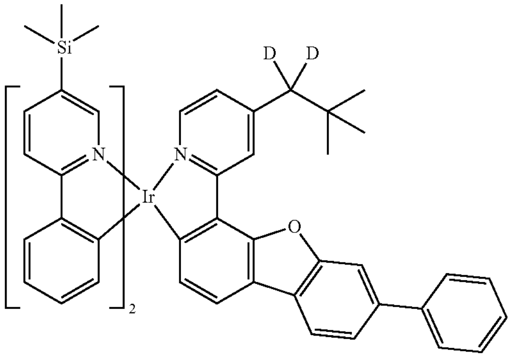
-continued
2327
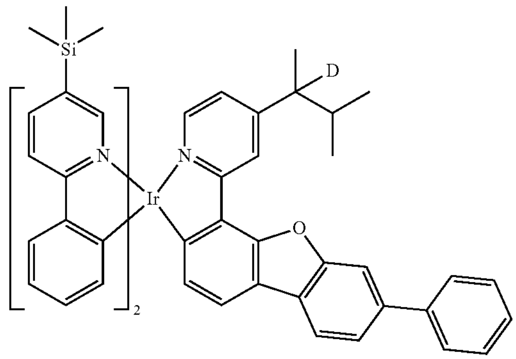
2328
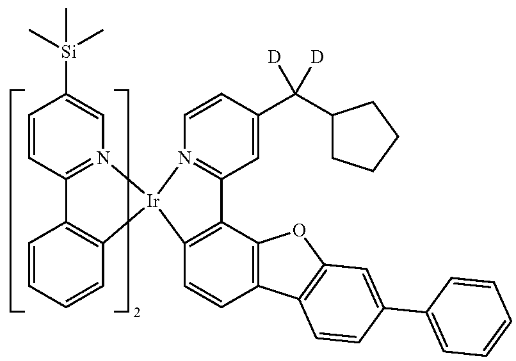
2329
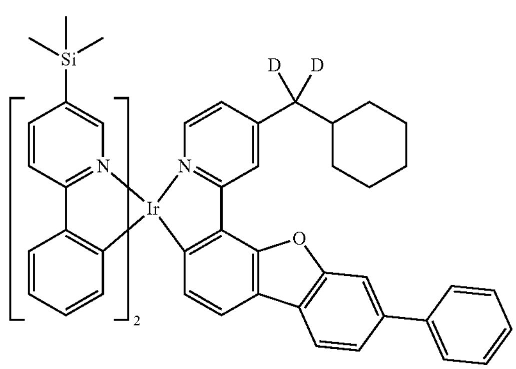
2330
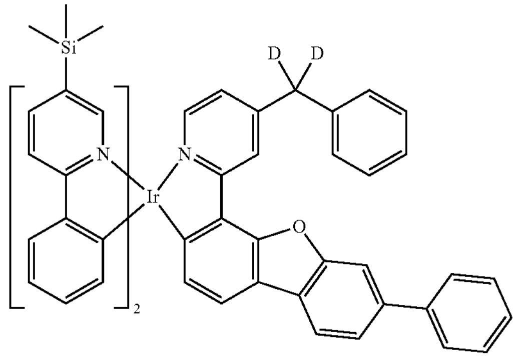

2331
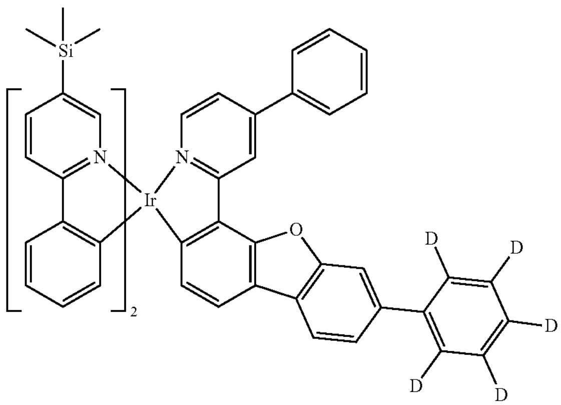
2332
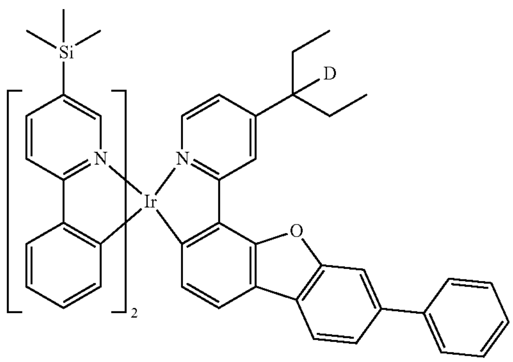
2333
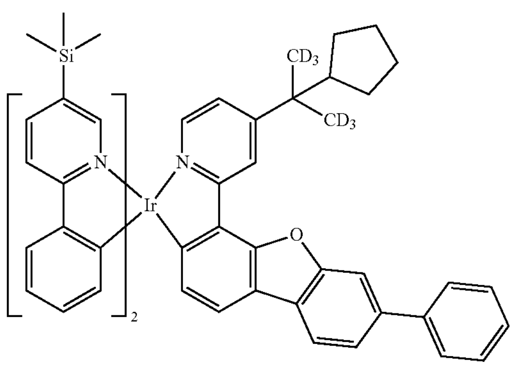
2334
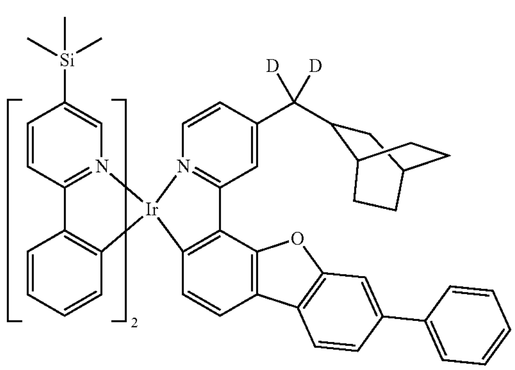
2335
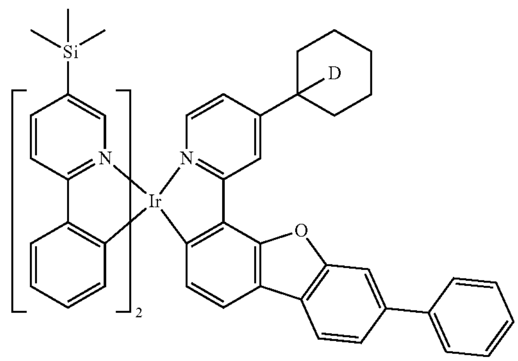
2336
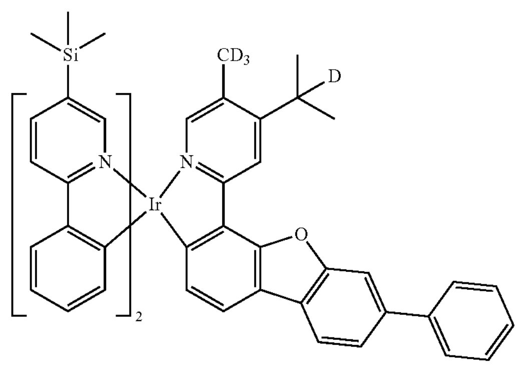
2337
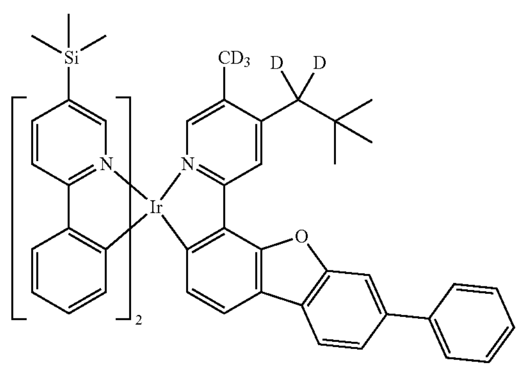
2338
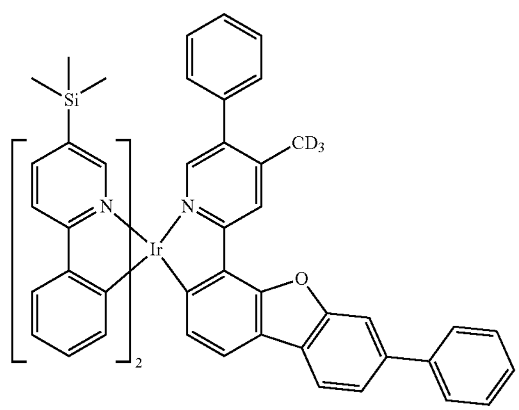

-continued
2339
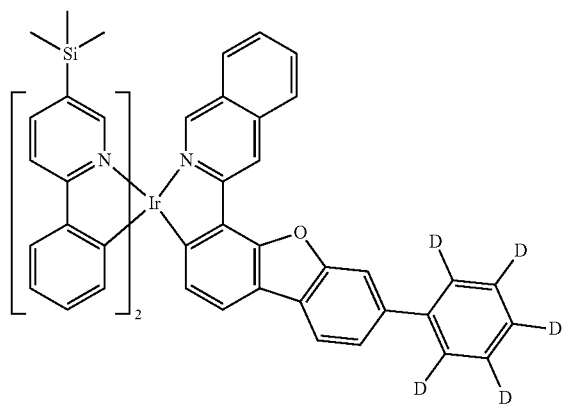
2340
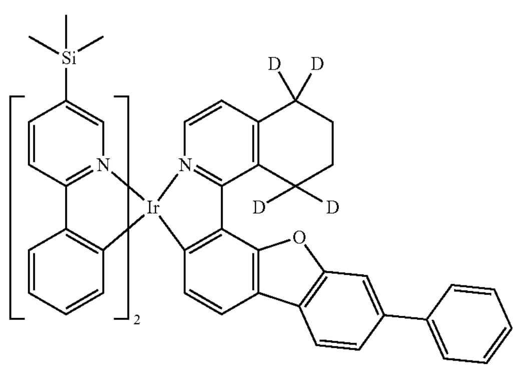
2341
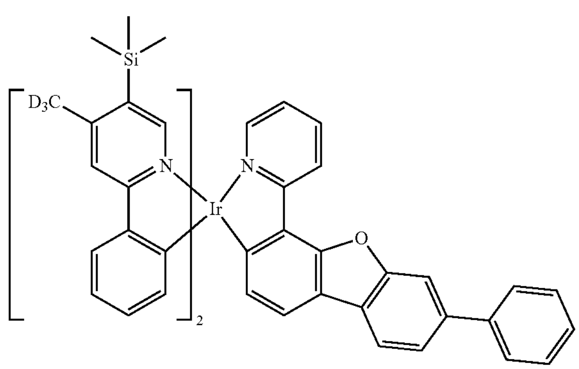
2342
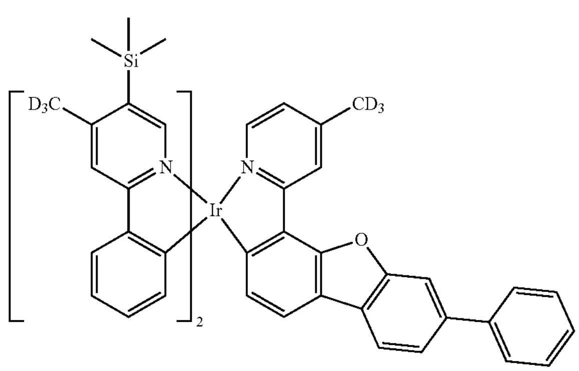
-continued
2343
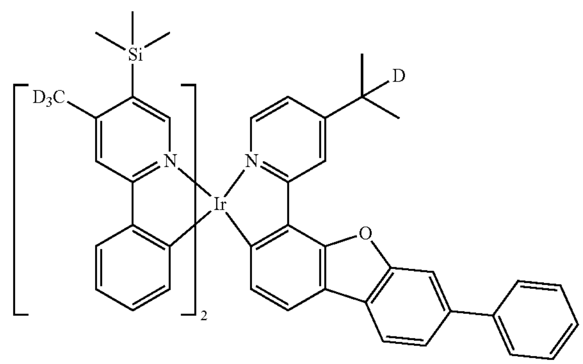
2344
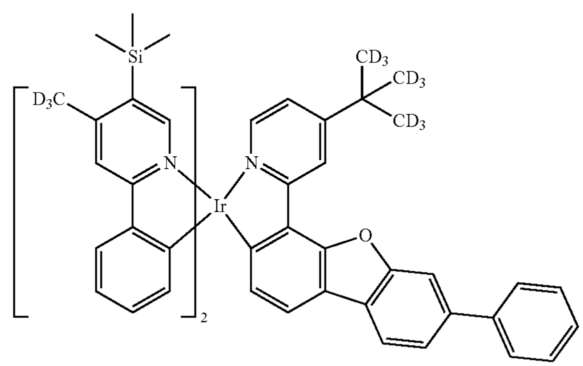
2345
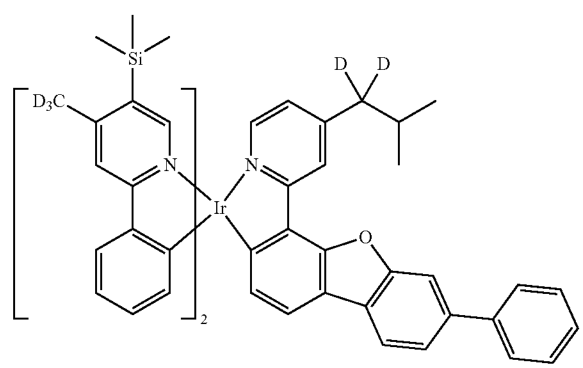
2346
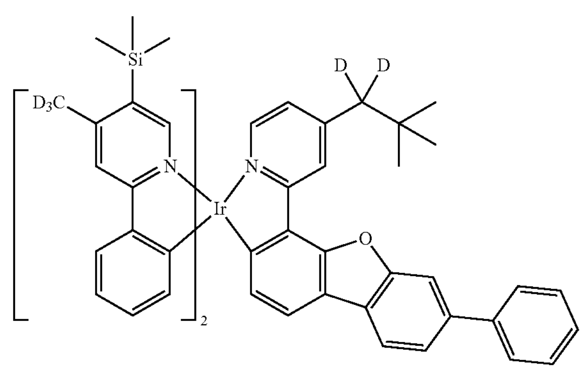

-continued
2347
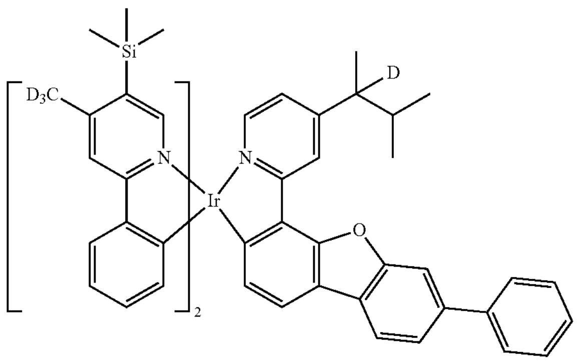
2348
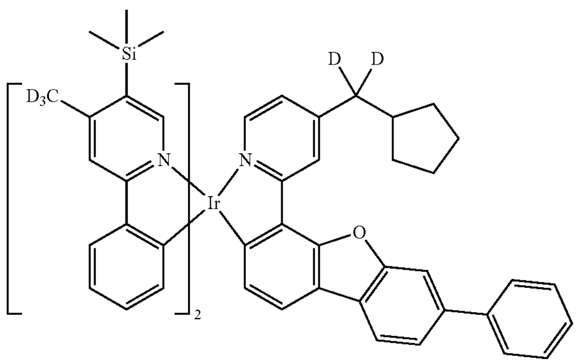
2349
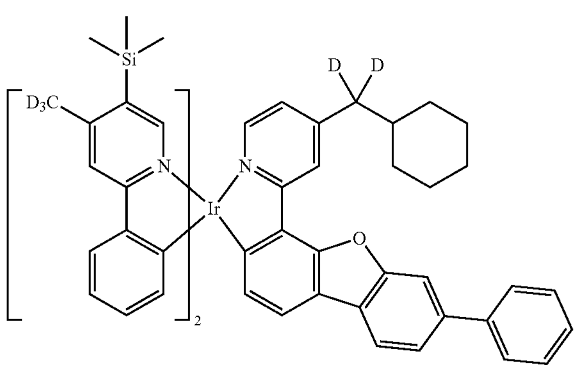
2350
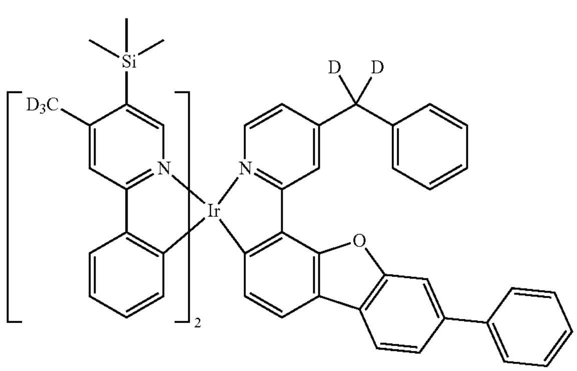
-continued
2351
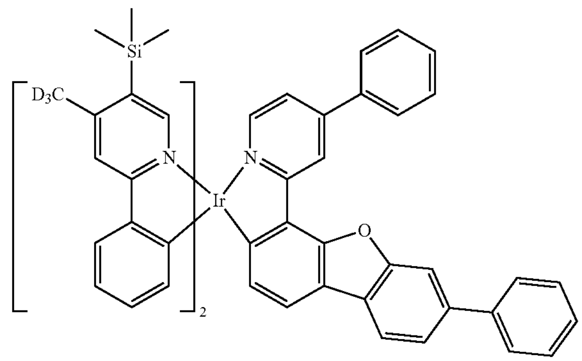
2352
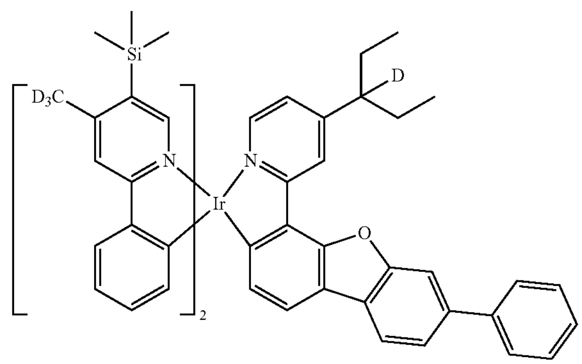
2353
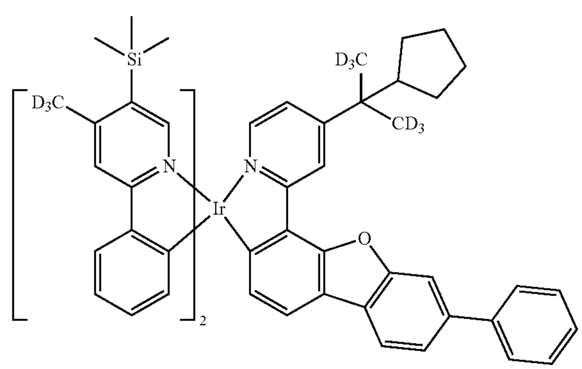
2354
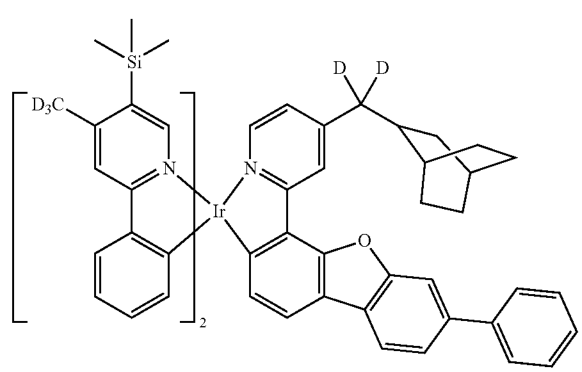

-continued
2355
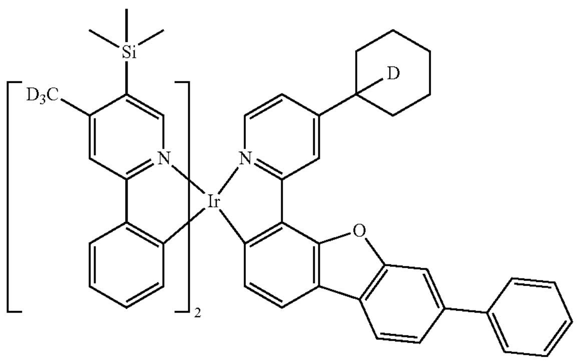
2356
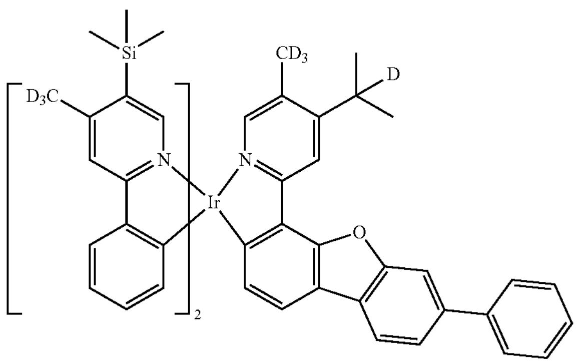
2357
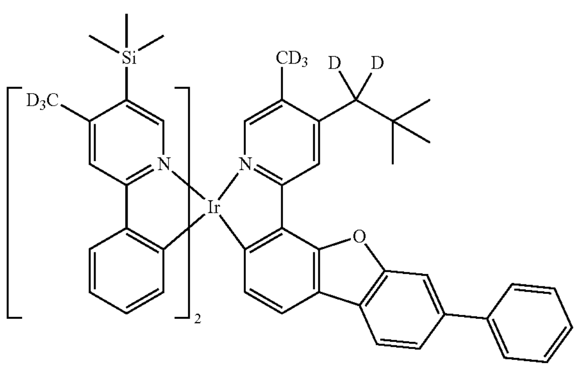
2358
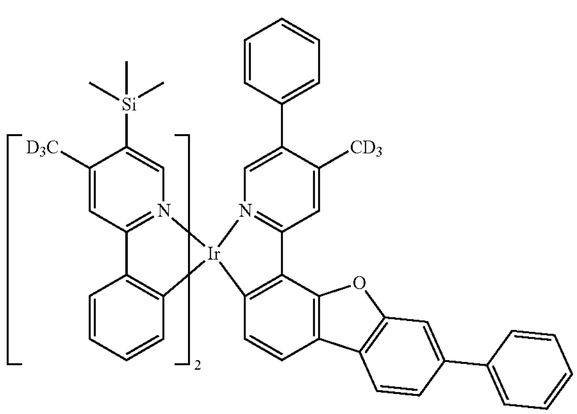
-continued
2359
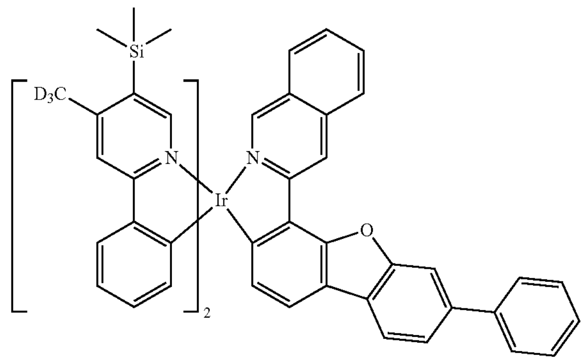
2360
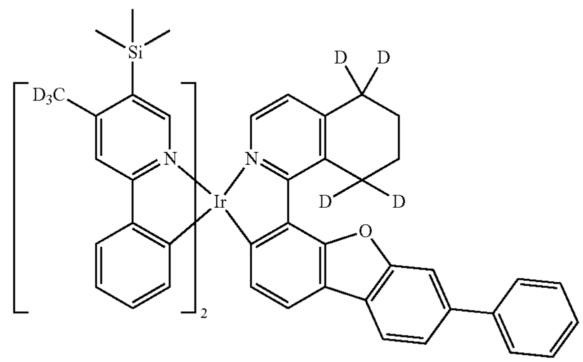
2361
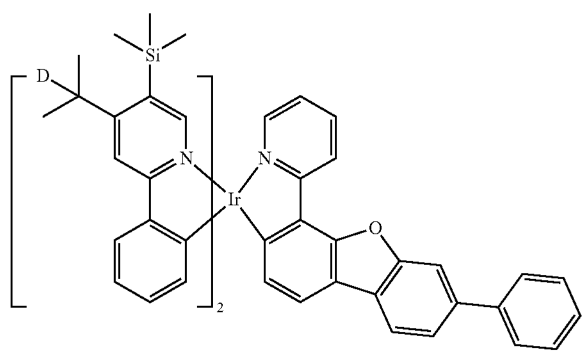
2362
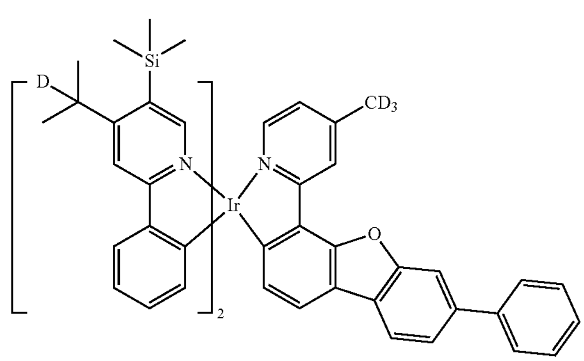

-continued
2363
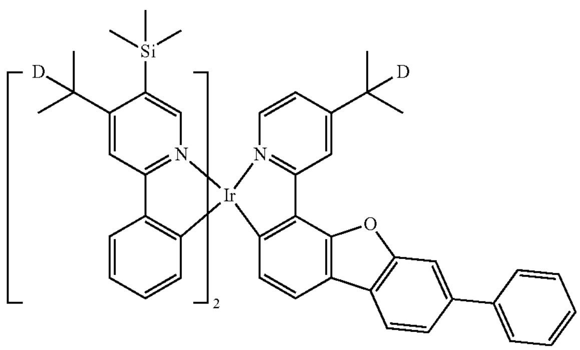
2364
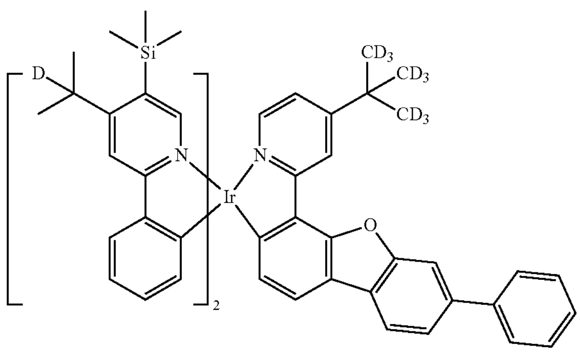
2365
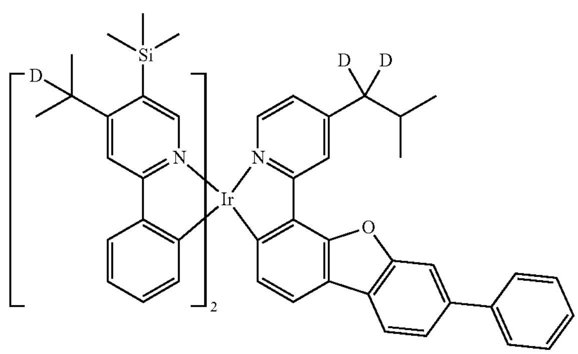
2366
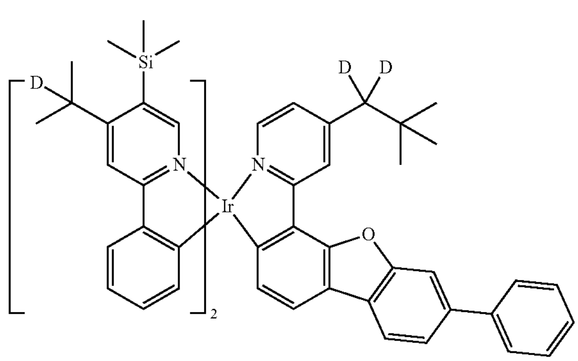
-continued
2367
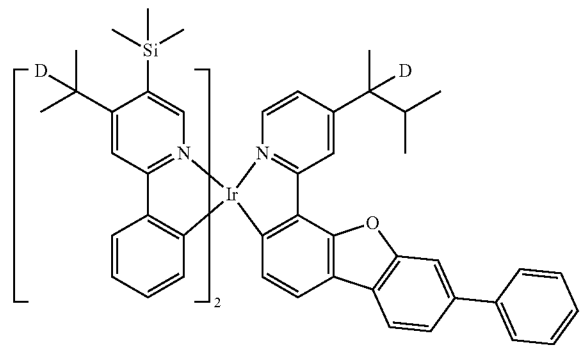
2368
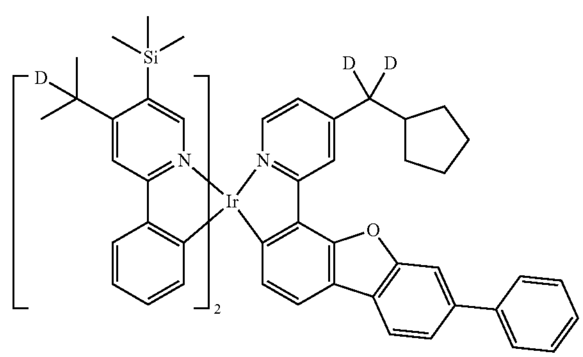
2369
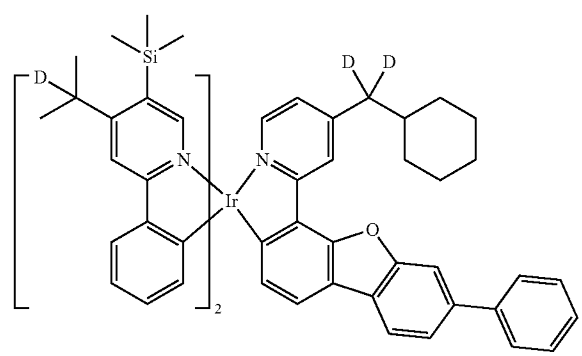
2370
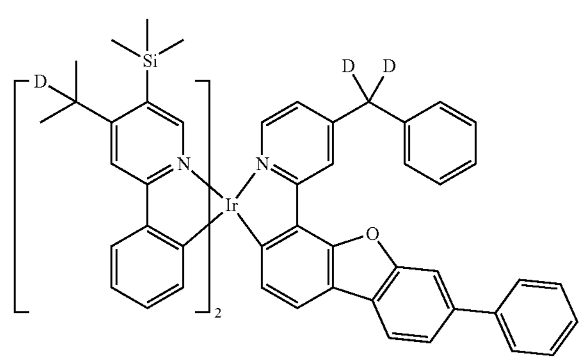

-continued
2371
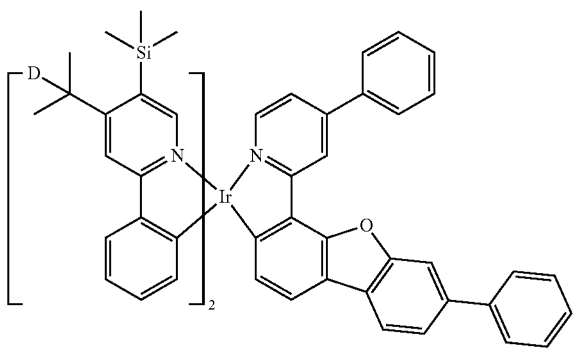
2372
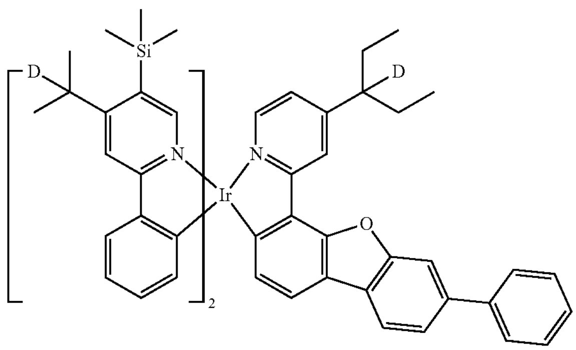
2373
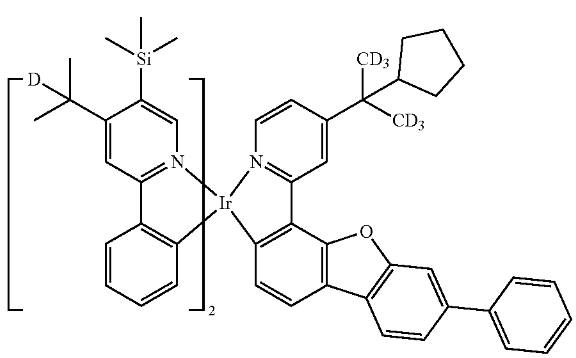
2374
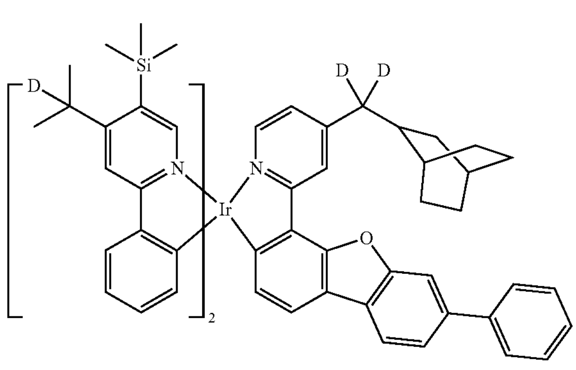
-continued
2375
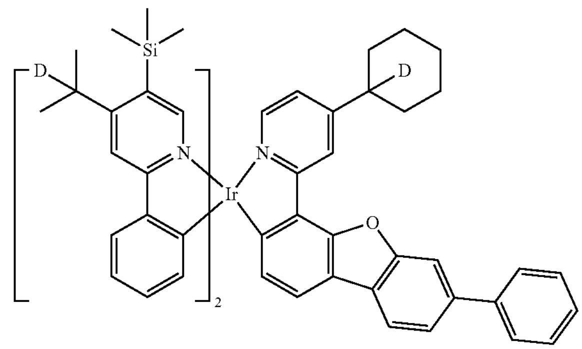
2376
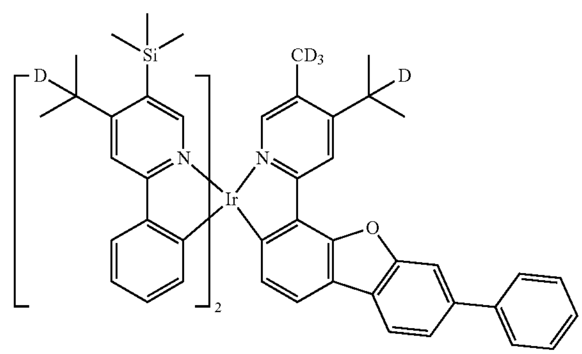
2377
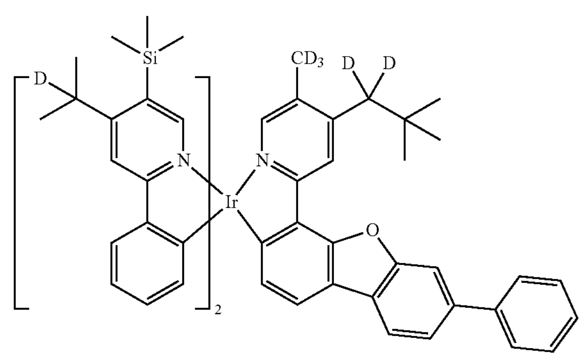
2378
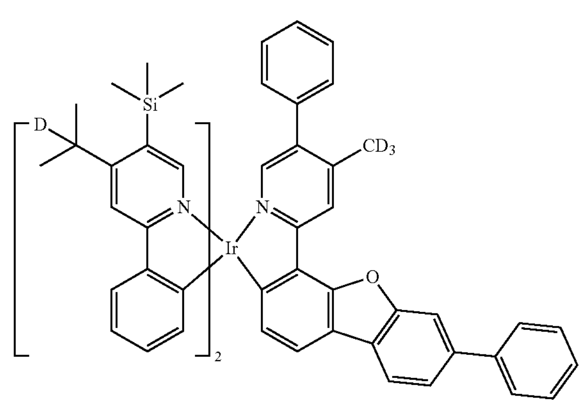

2379
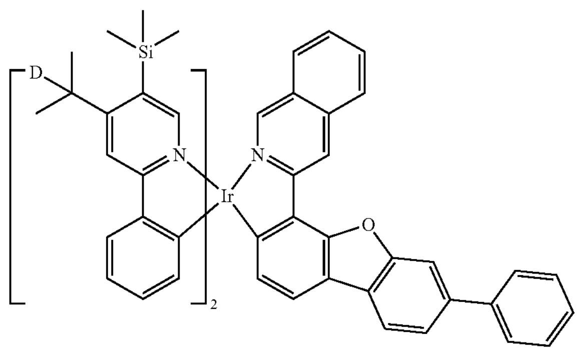
2380
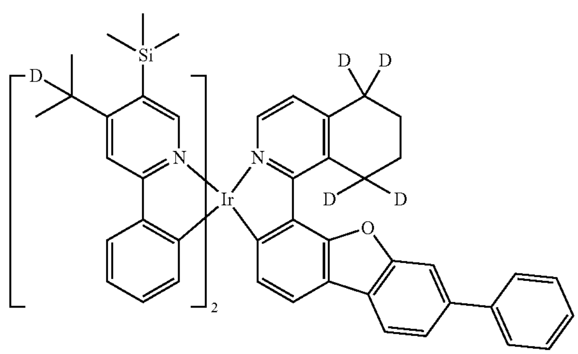
2381
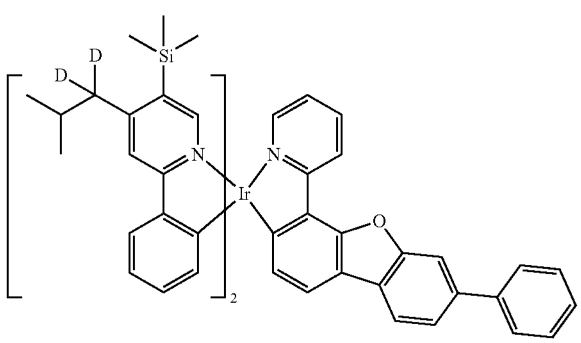
2382
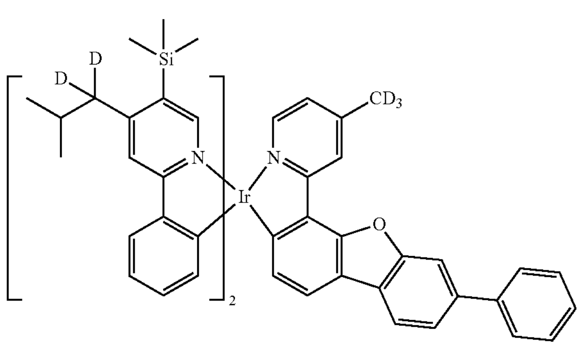
2383
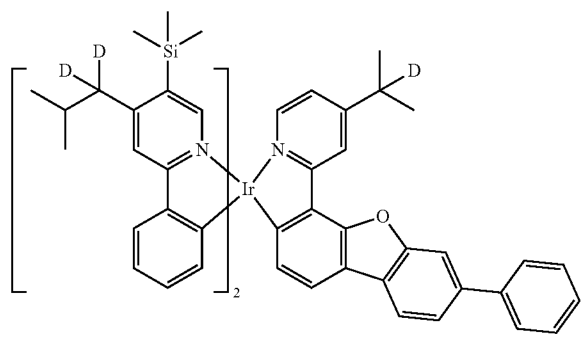
2384
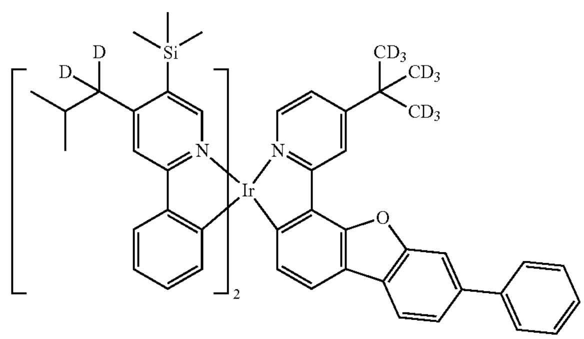
2385
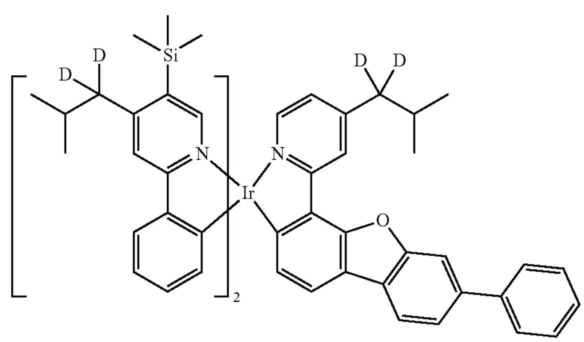
2386
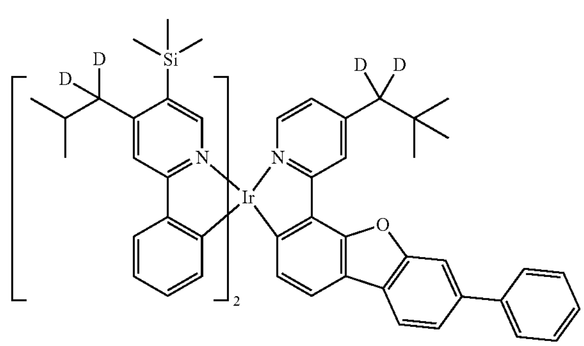

-continued
2387
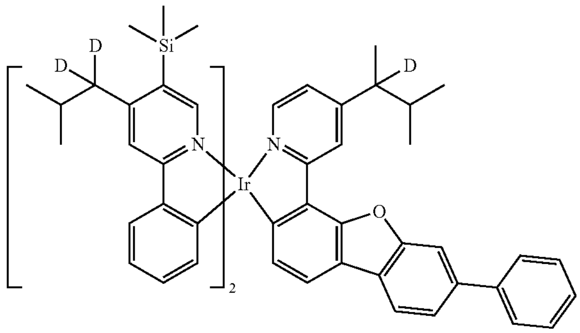
2388
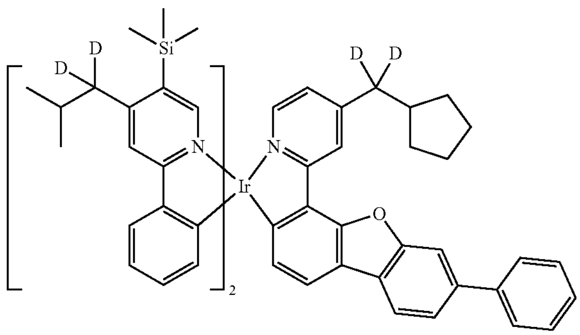
2389
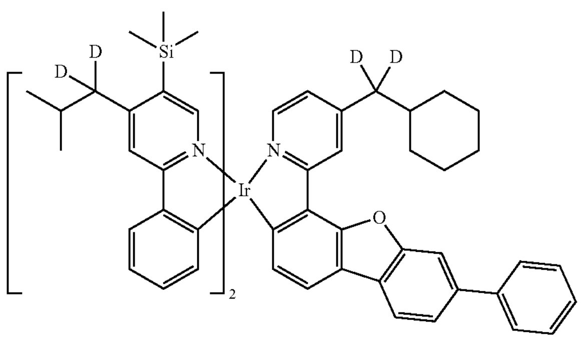
2390
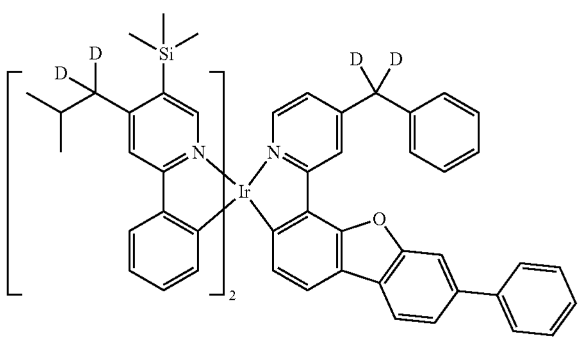
-continued
2391
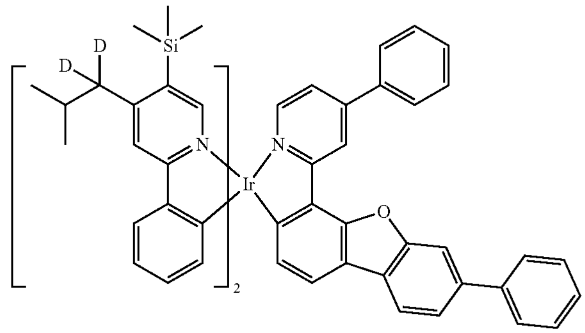
2392
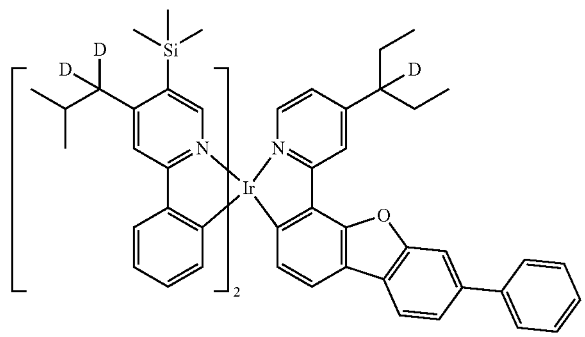
2393
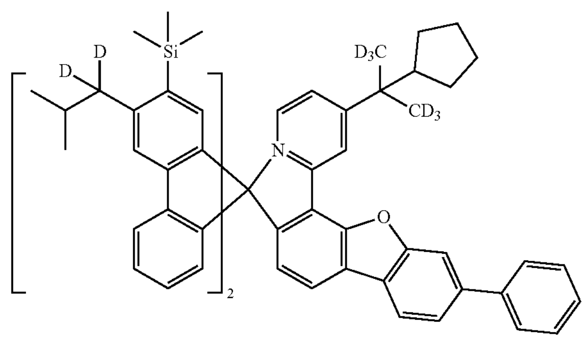
2394
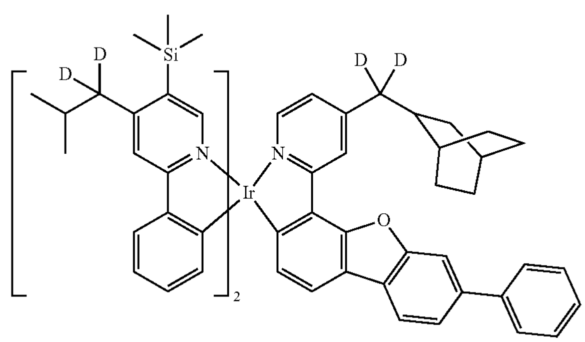

-continued
2395
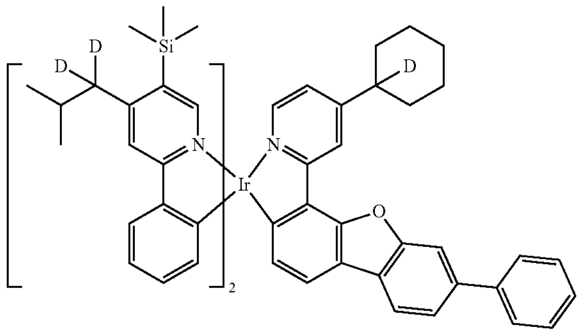
2396
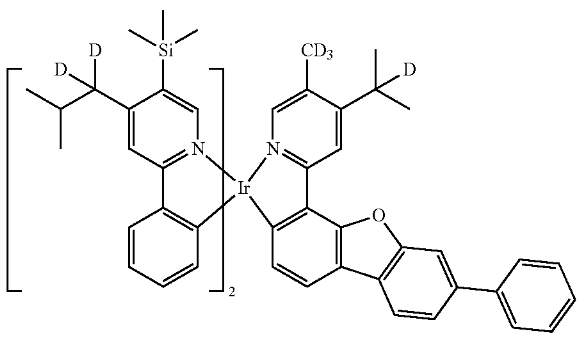
2397
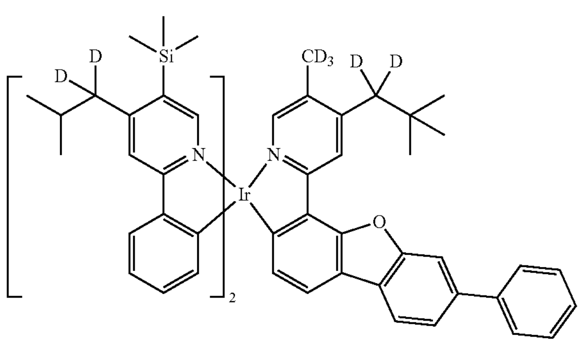
2398
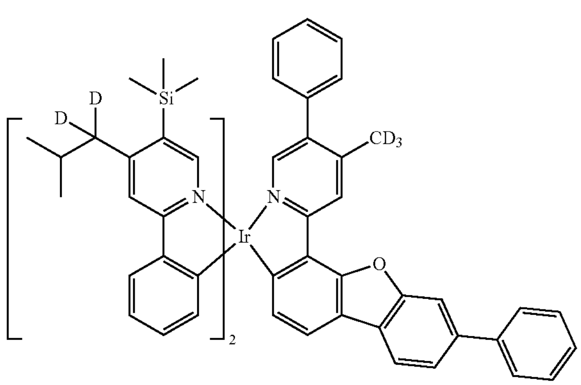
-continued
2399
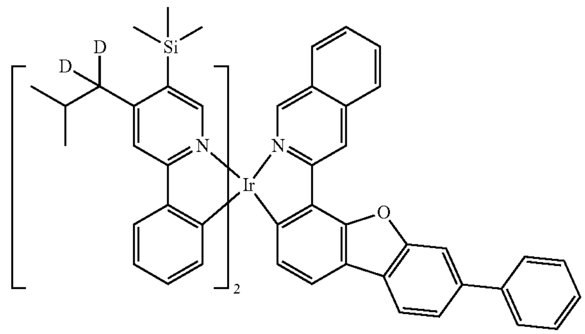
2400
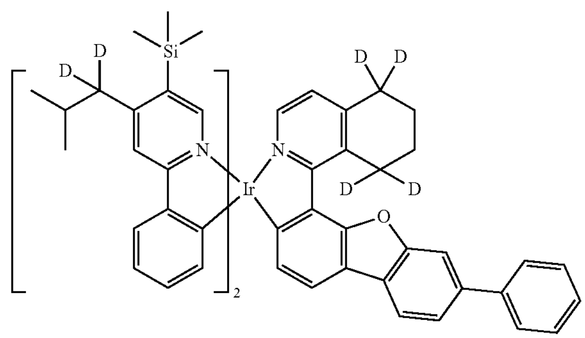
2401
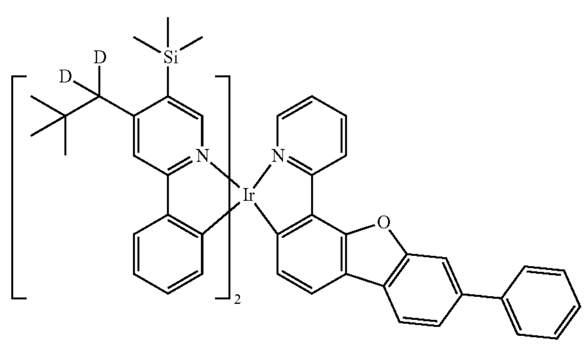
2402
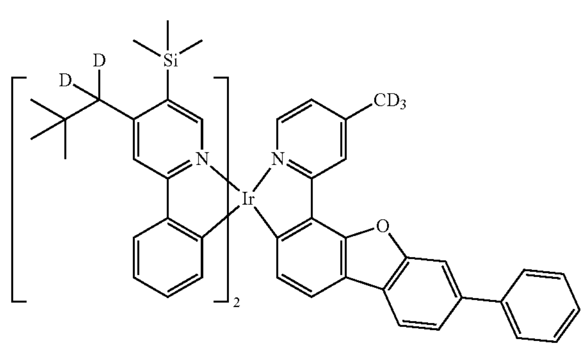

-continued
2403
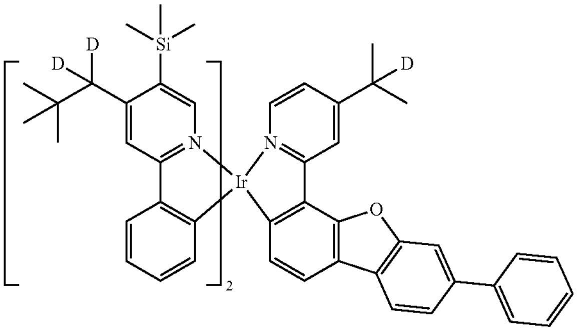
2404
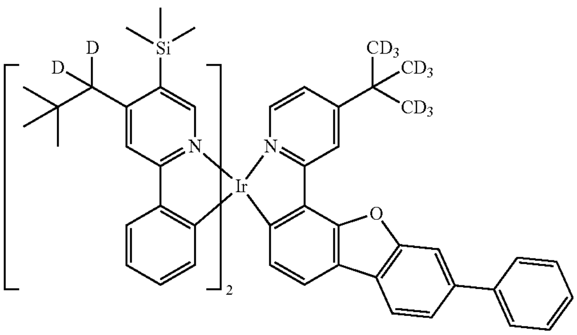
2405
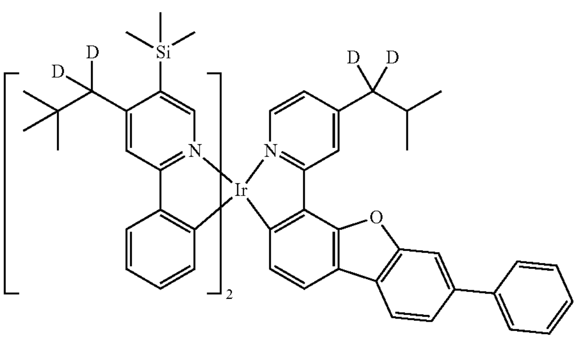
2406
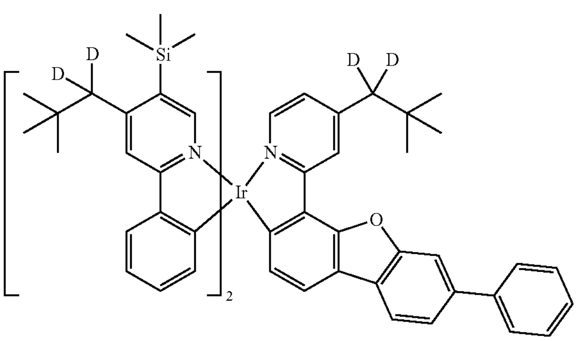
-continued
2407
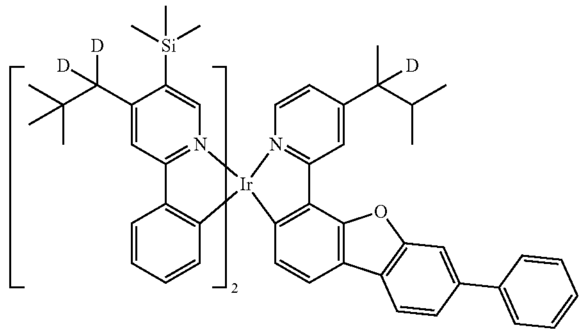
2408
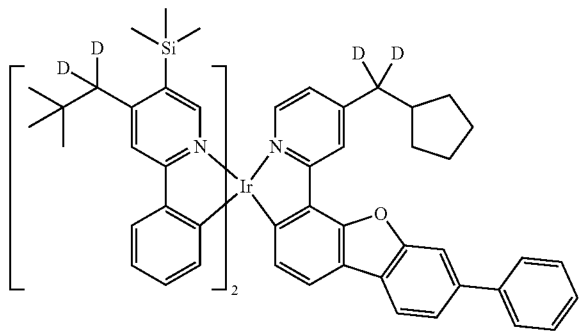
2409
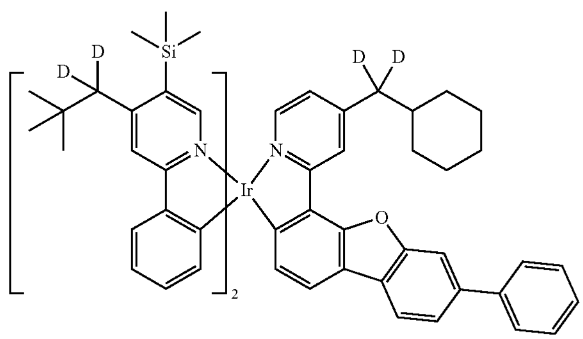
2410
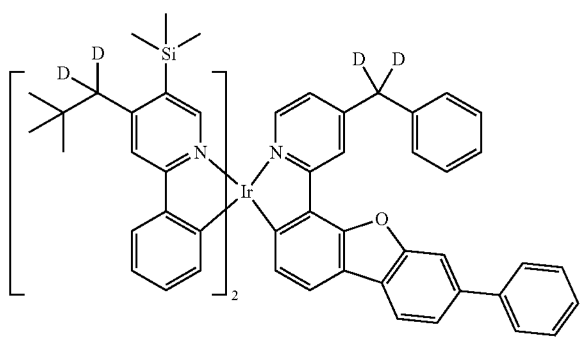

-continued
2411
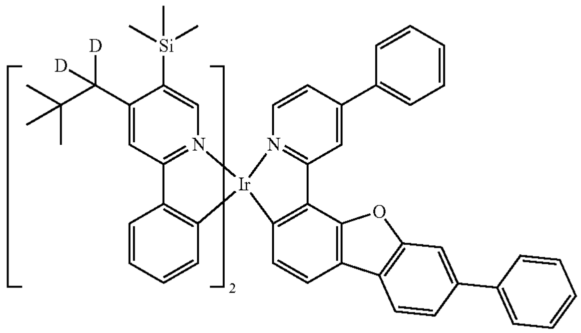
2412
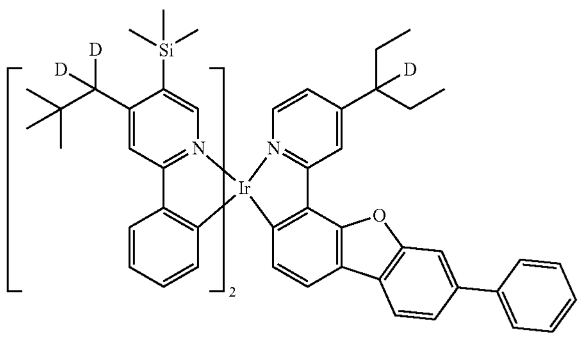
2413
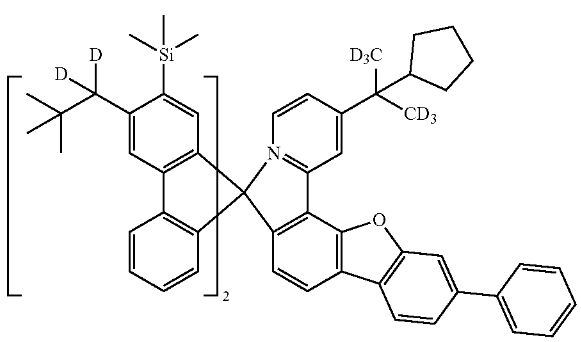
2414
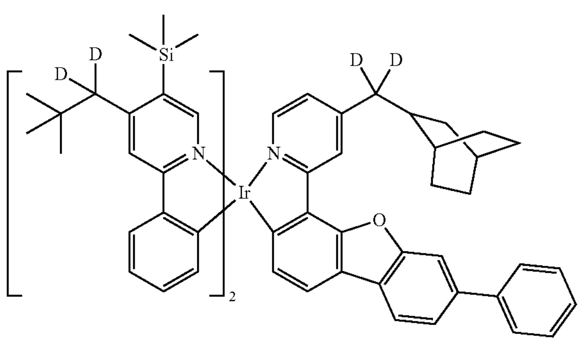
-continued
2415
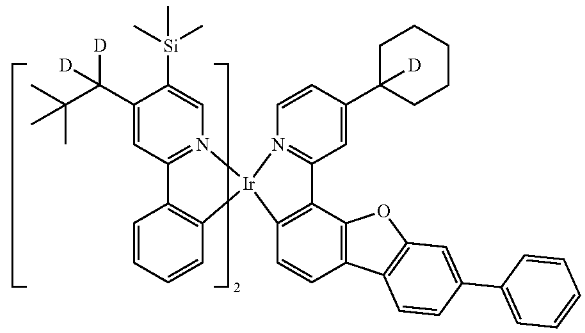
2416
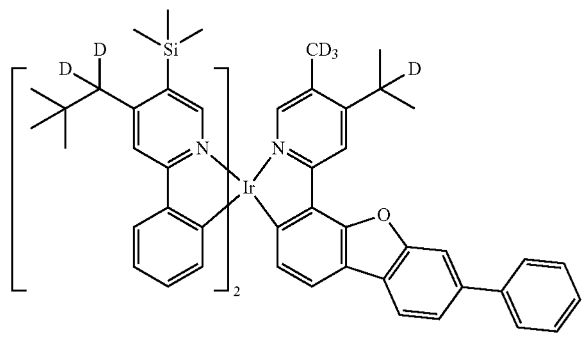
2417
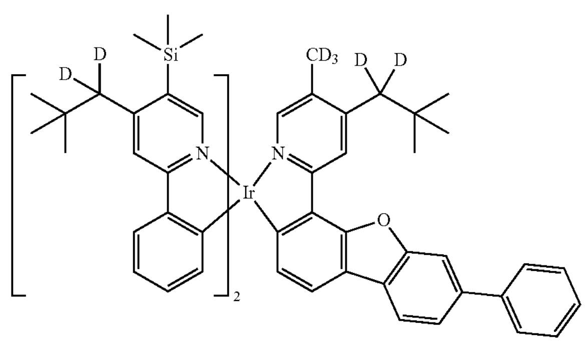
2418
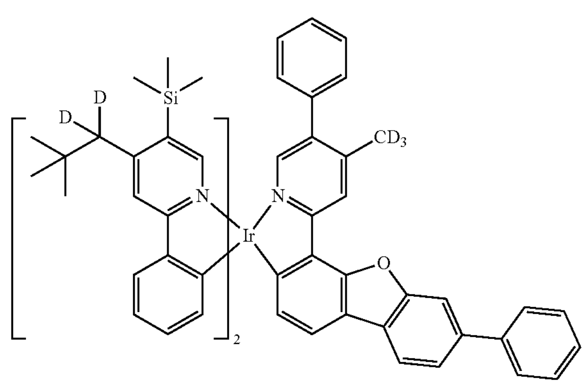

-continued
2419
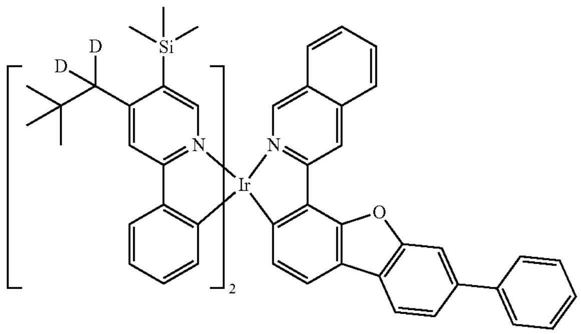
2420
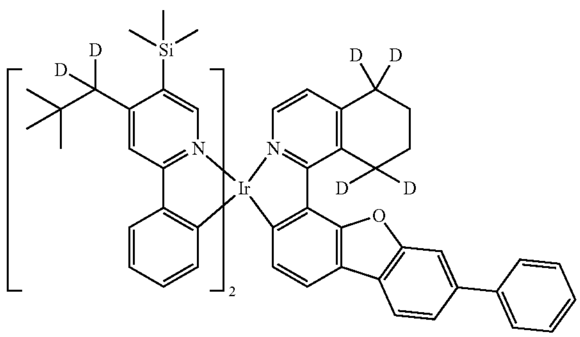
2421
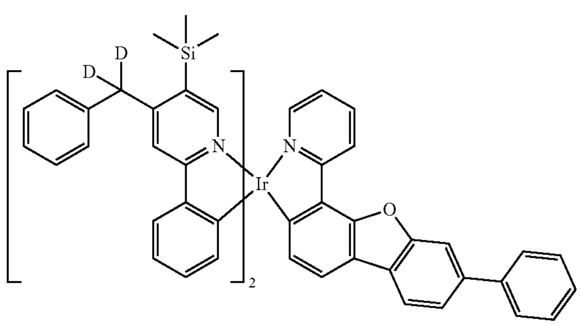
2422
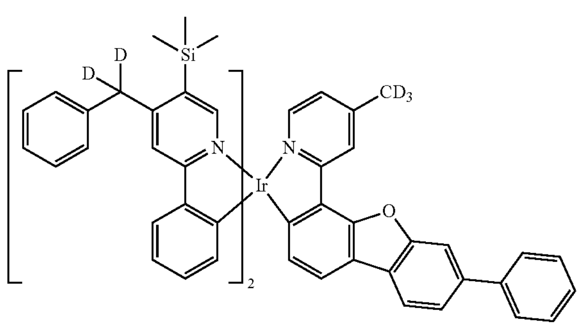
-continued
2423
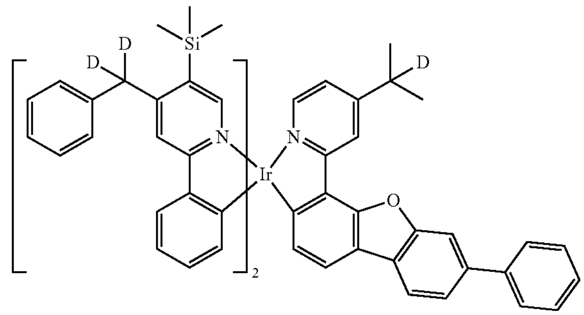
2424
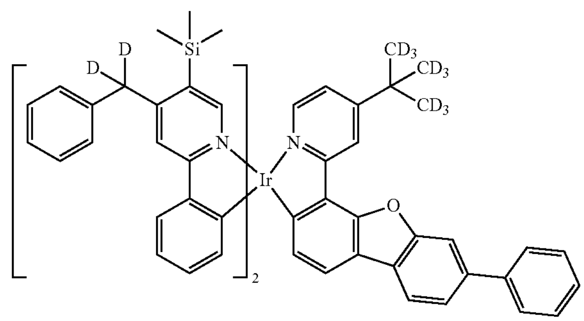
2425
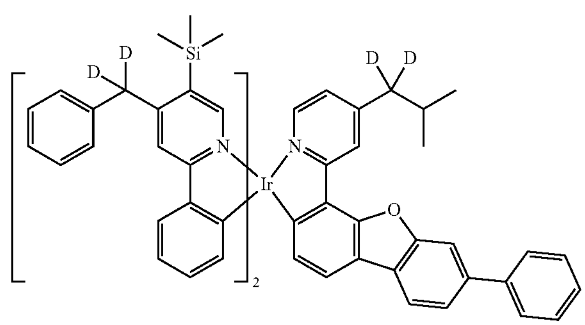
2426
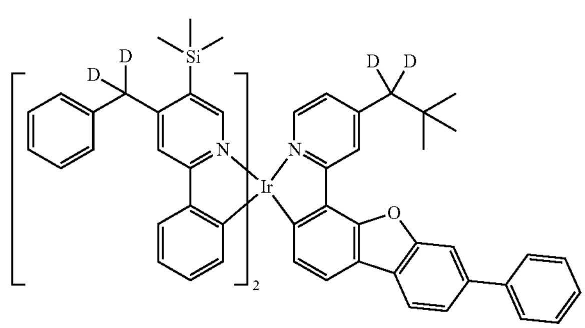

-continued
2427
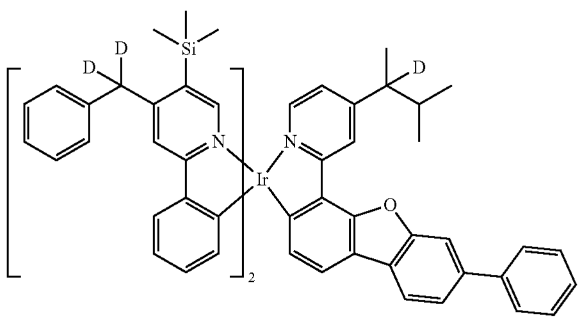
2428
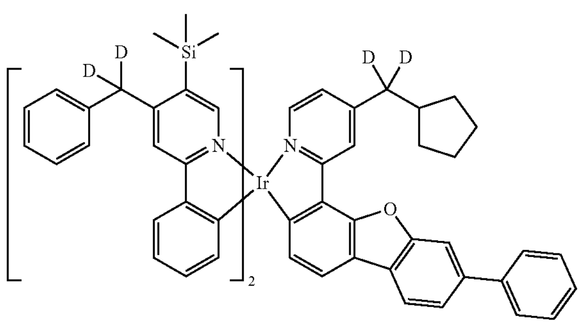
2429
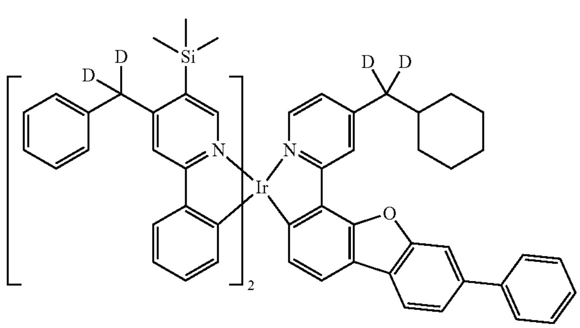
2430
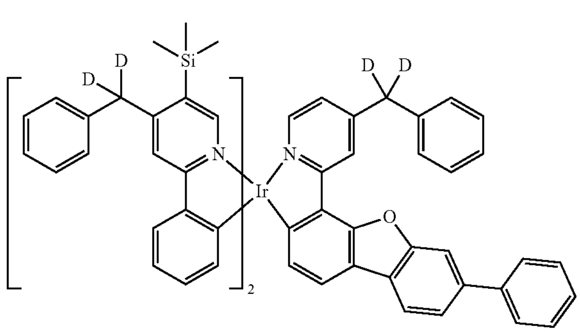
-continued
2431
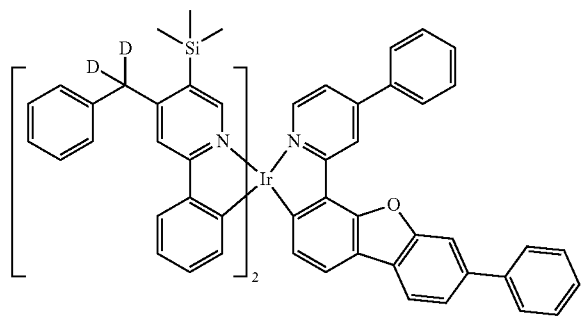
2432
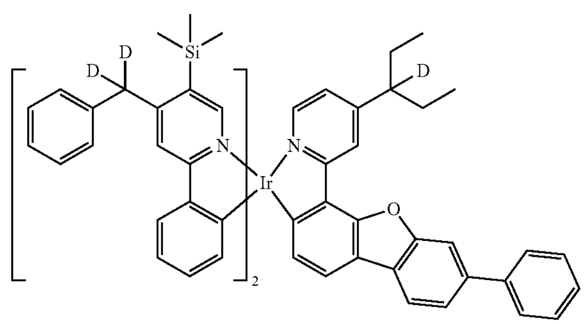
2433
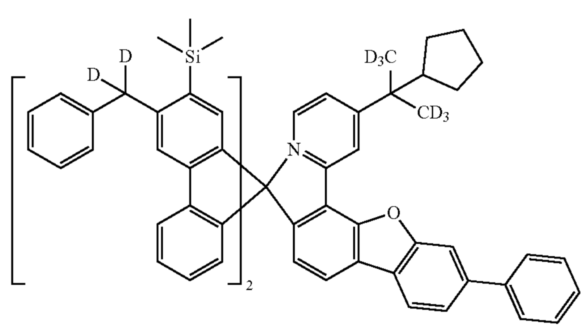
2434
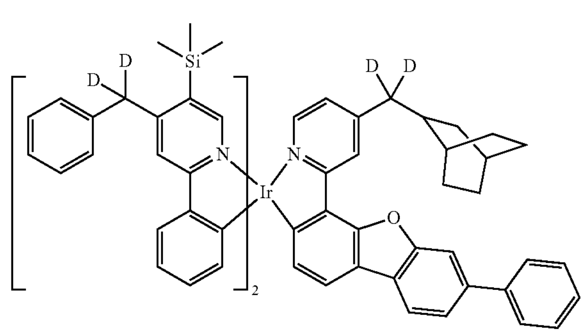

-continued
2435
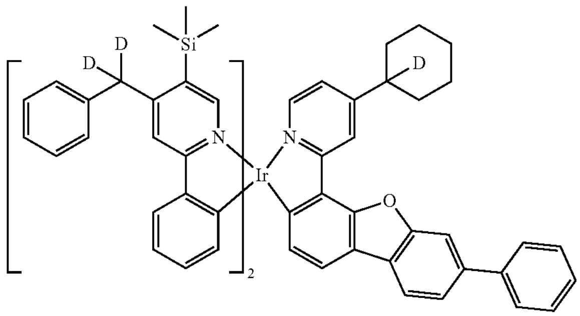
2436
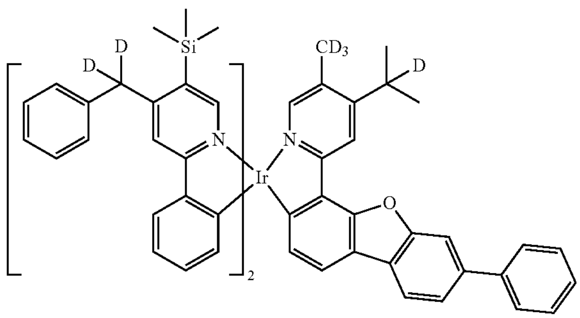
2437
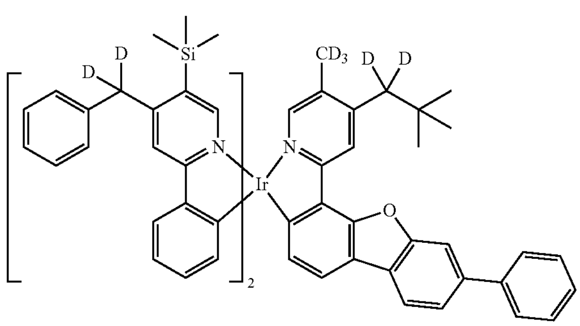
2438
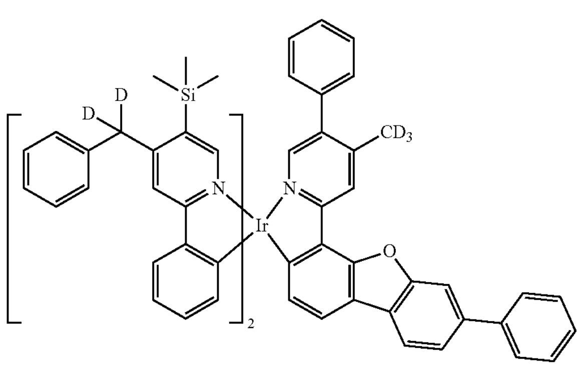
-continued
2439
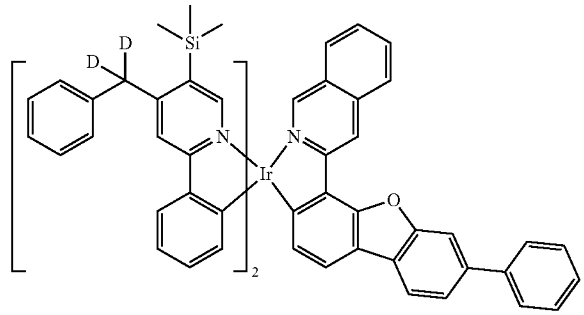
2440
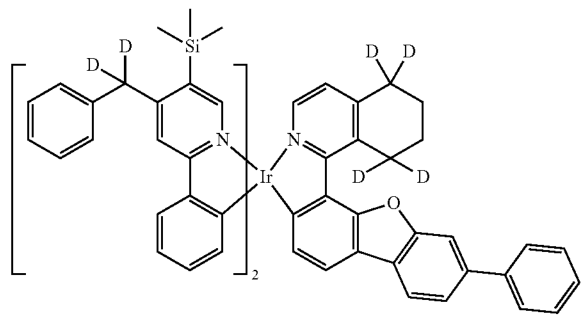
2241
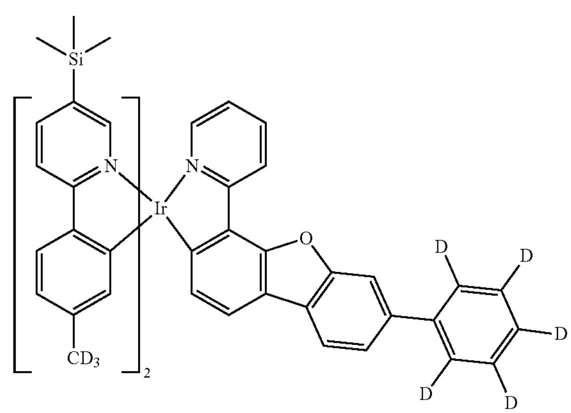
2242
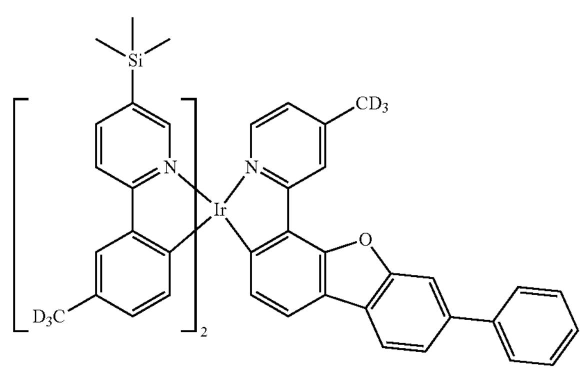

-continued
2243
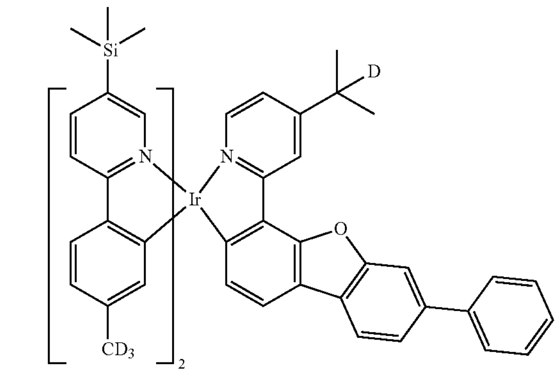
2244
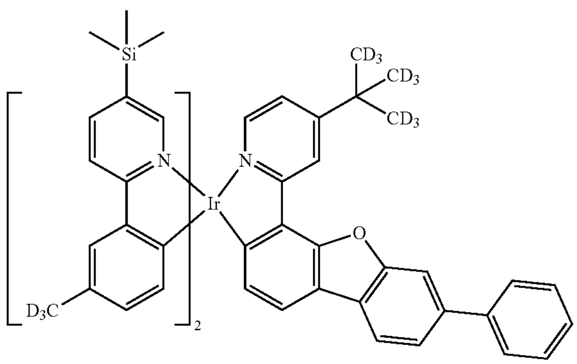
2245
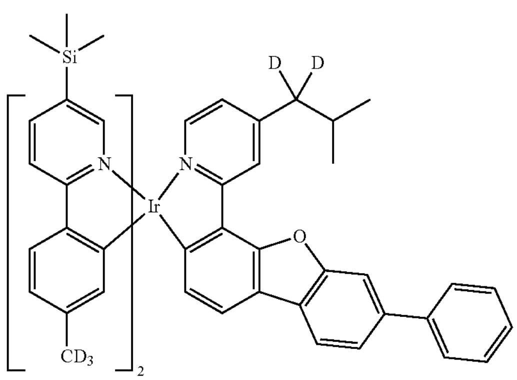
2246
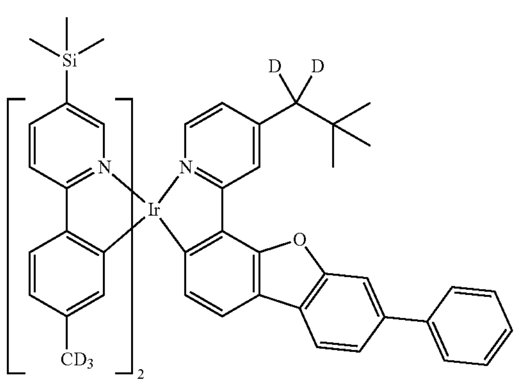
-continued
2247
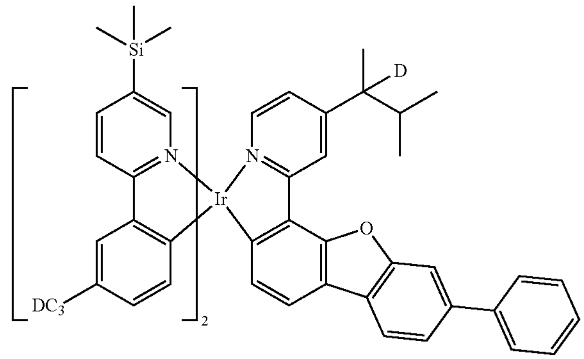
2248
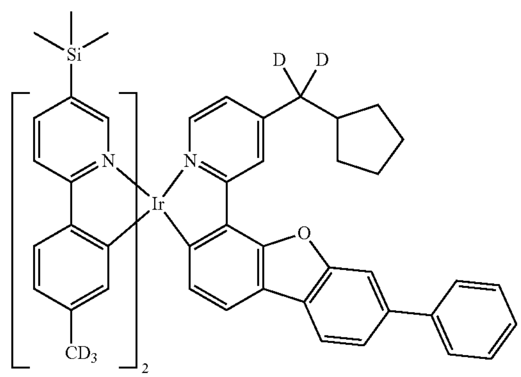
2449
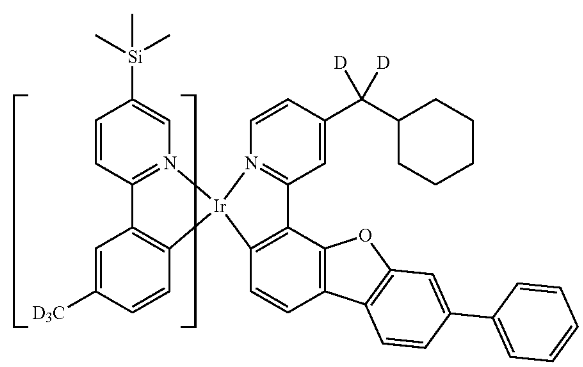
2450
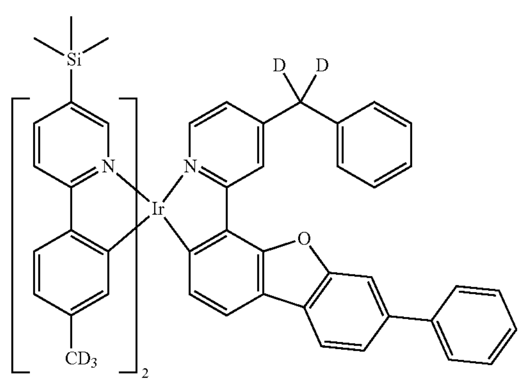

-continued
2451
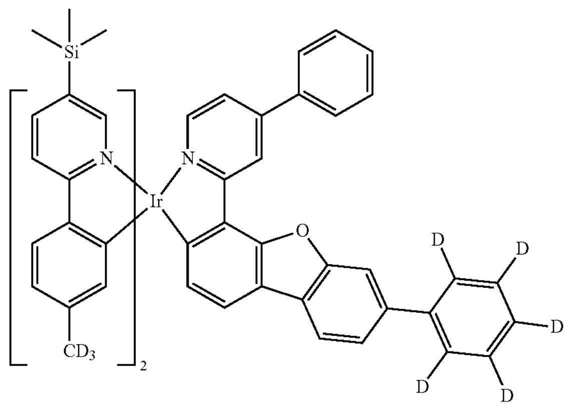
2452
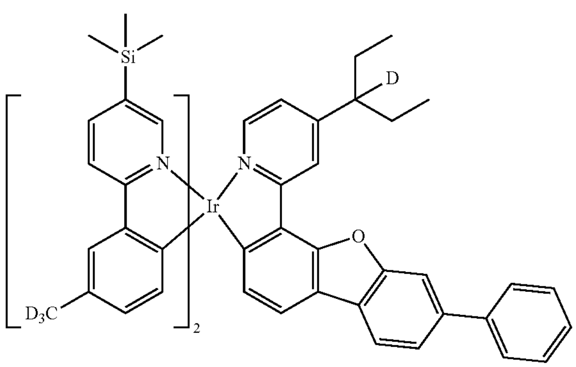
2453
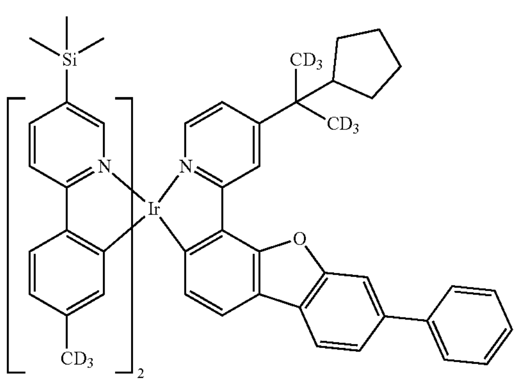
2454
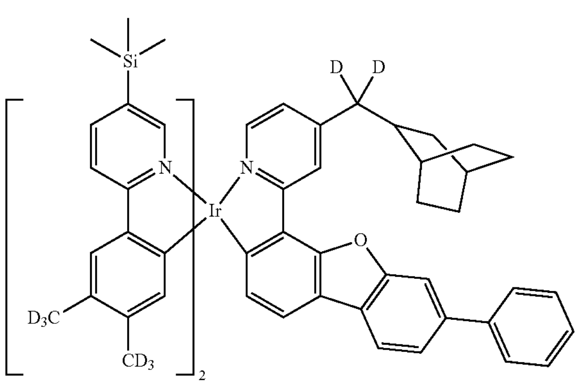
-continued
2455
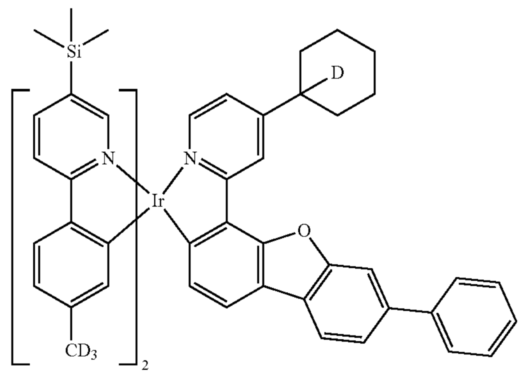
2456
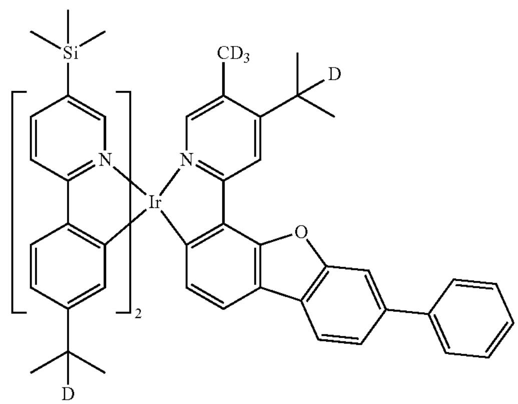
2457
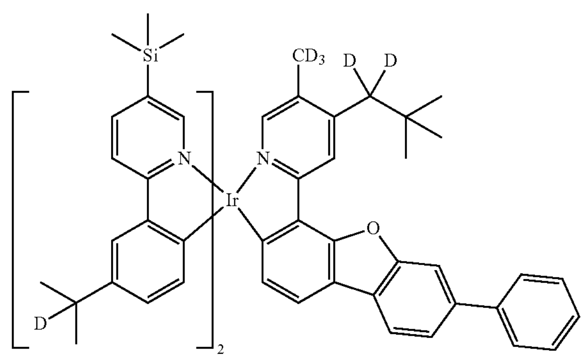
2458
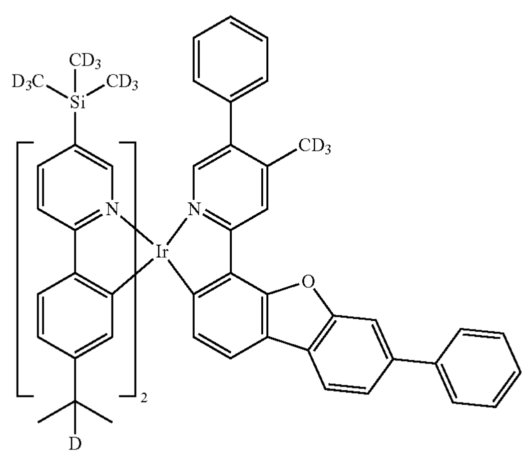

-continued
2459
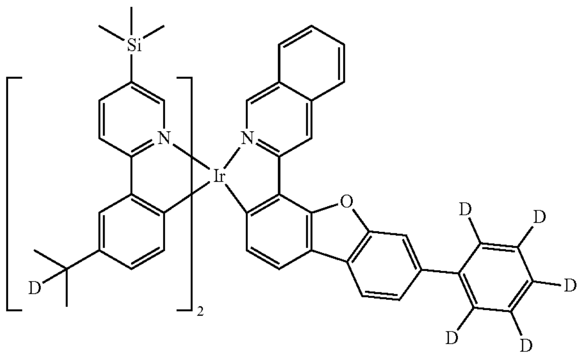
2460
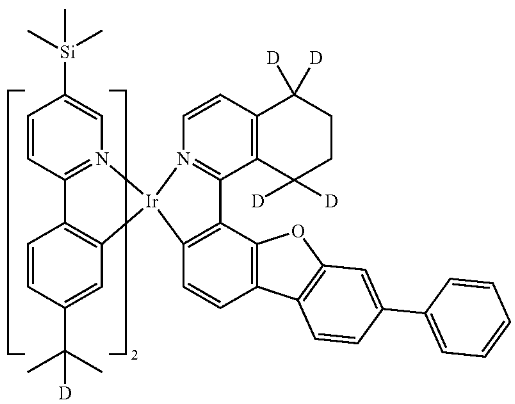
2461
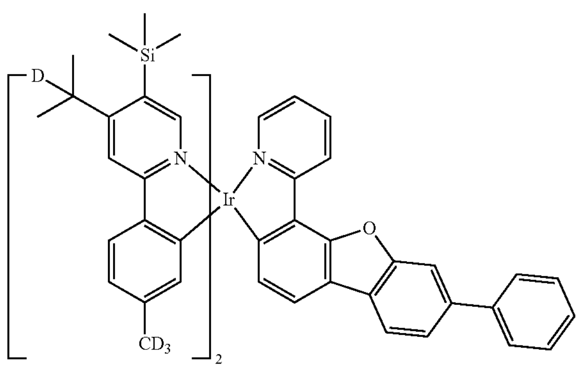
2462
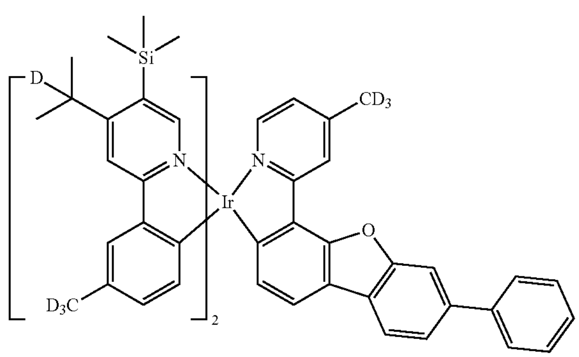
-continued
2463
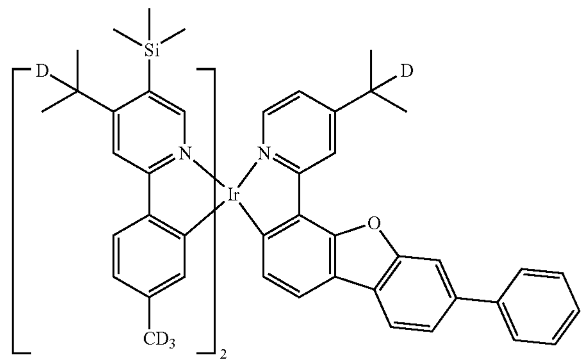
2464
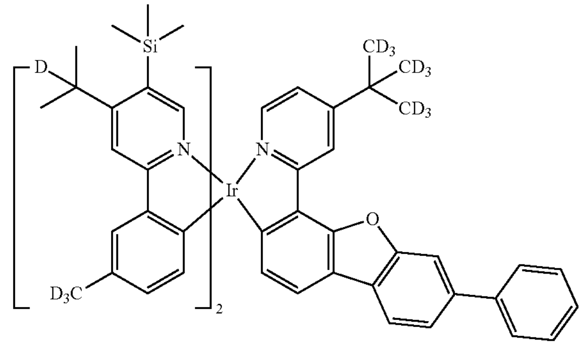
2465
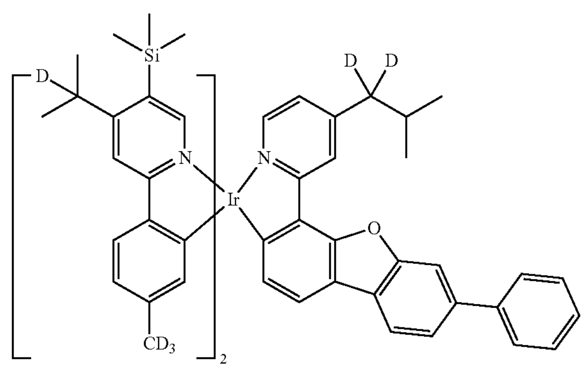
2466
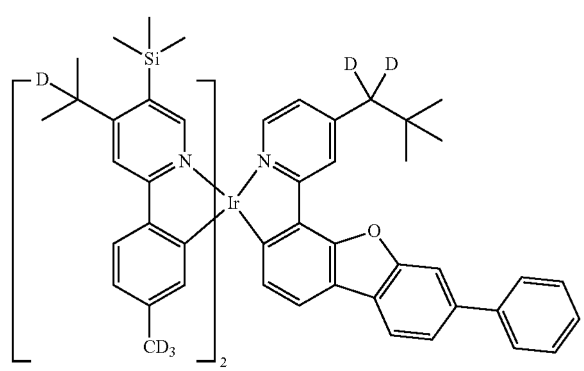

-continued
2467
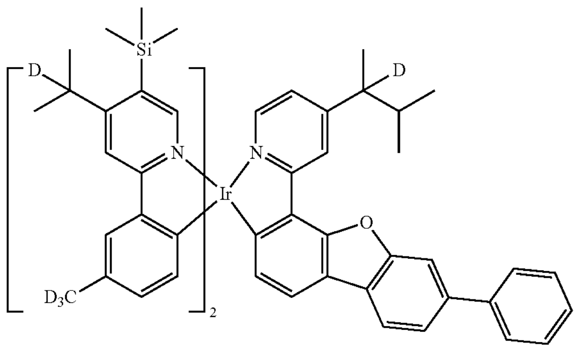
2468
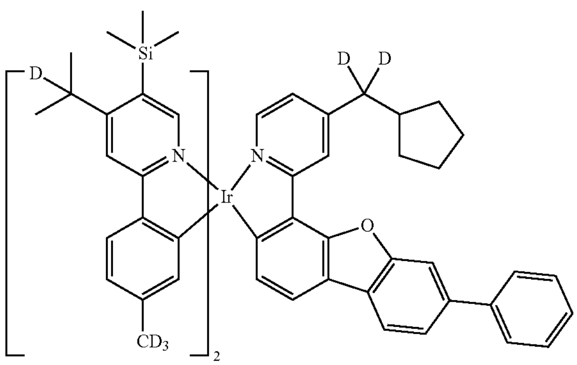
2469
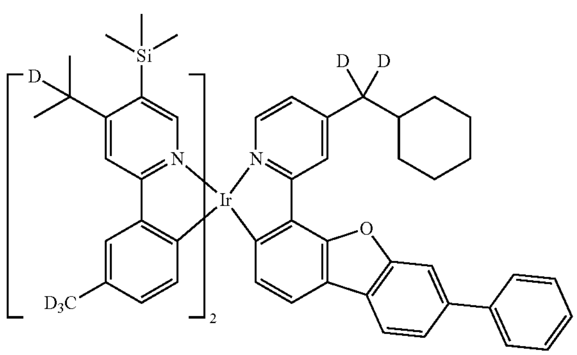
2470
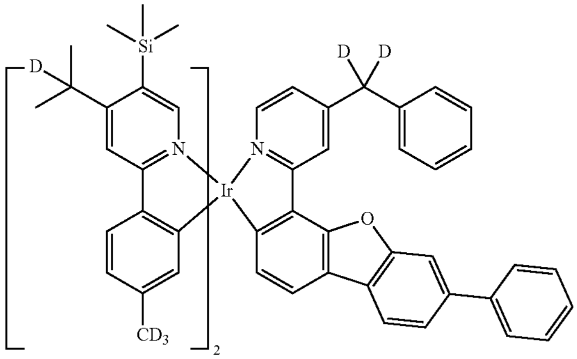
-continued
2471
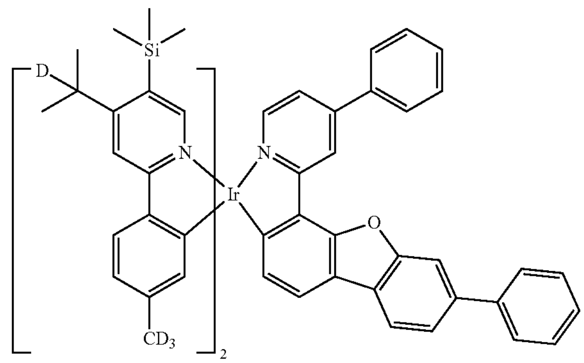
2472
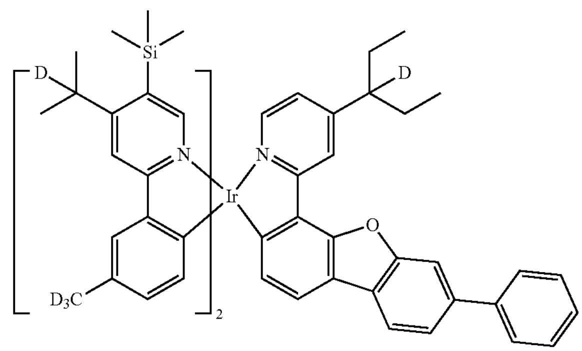
2473
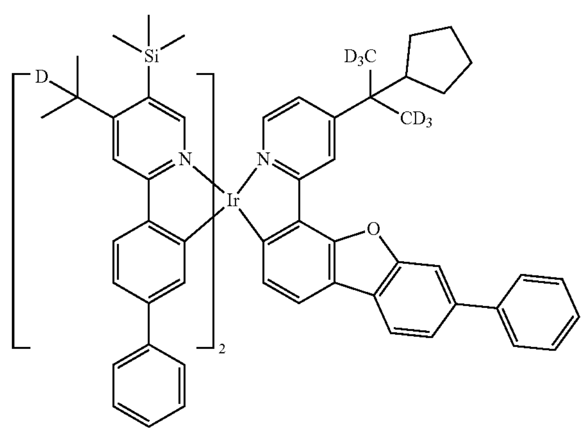
2474
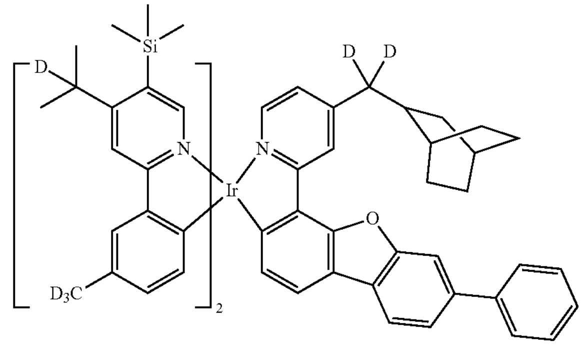

-continued
2475
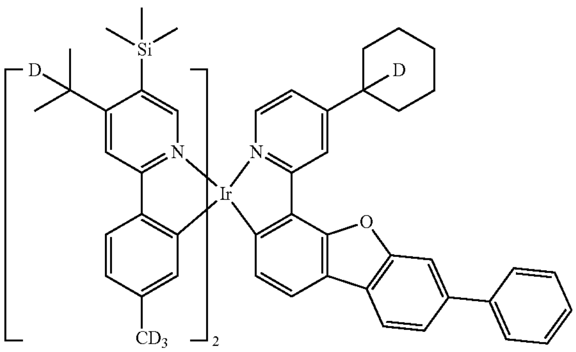
2476
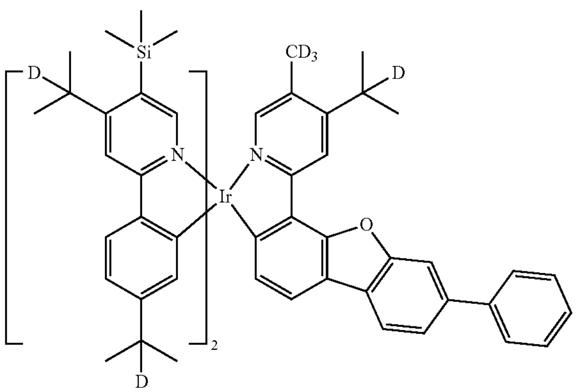
2477
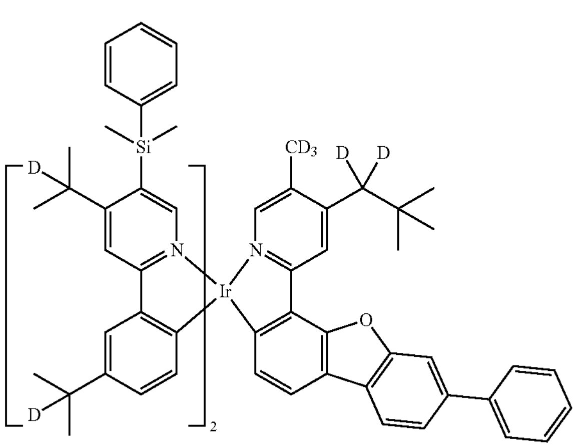
-continued
2478
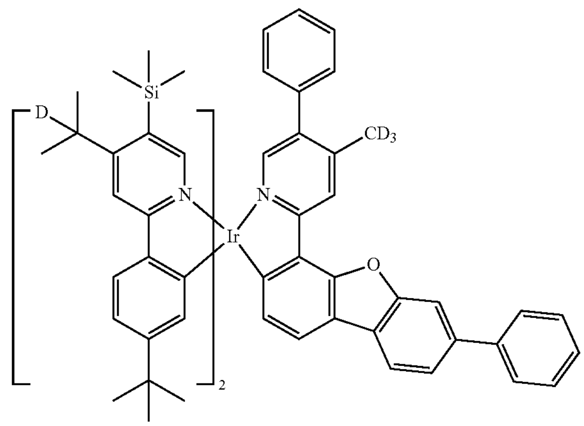
2479
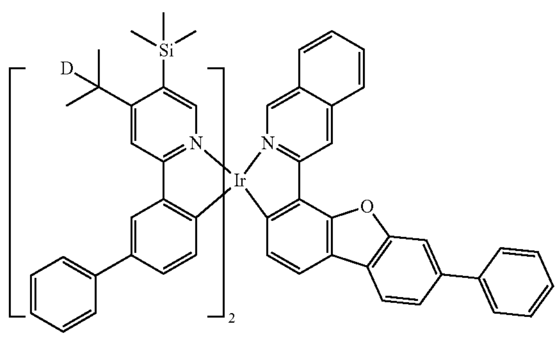
2480
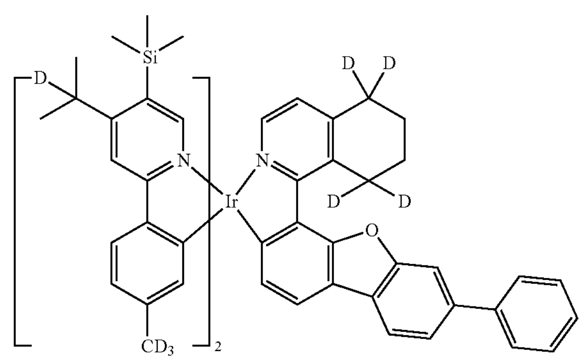
2481
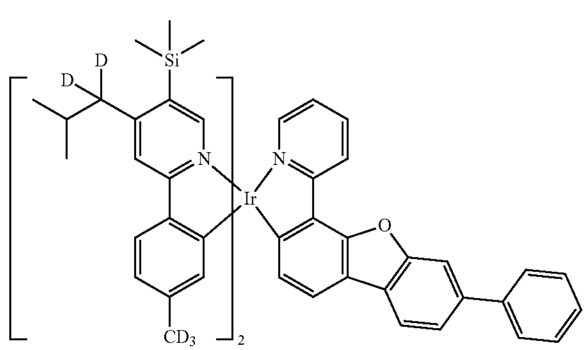

2482
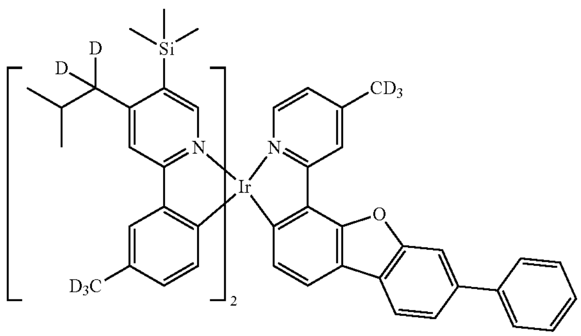
2483
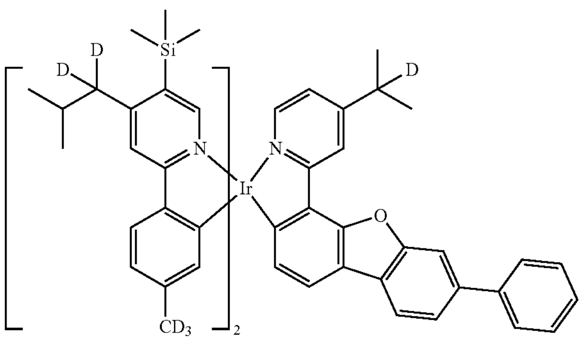
2484
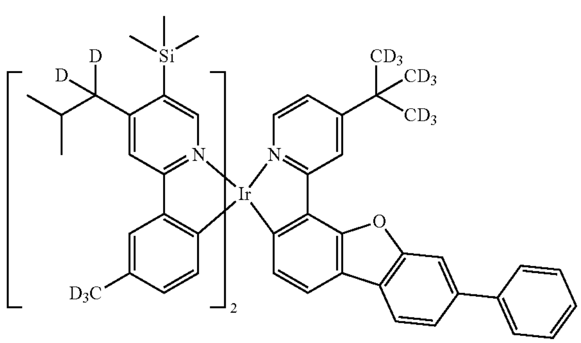
2485
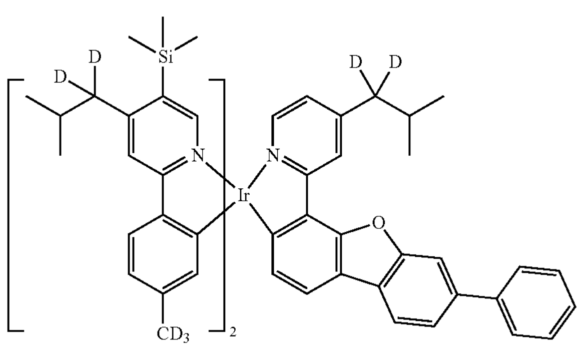
2486
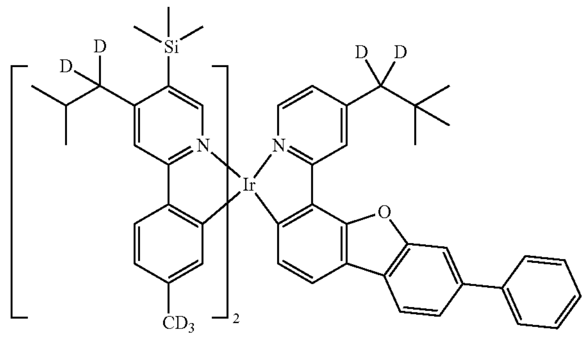
2487
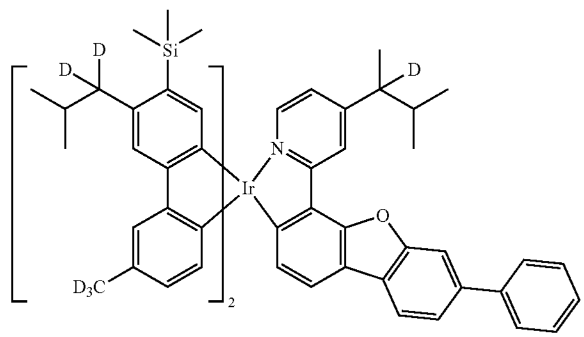
2488
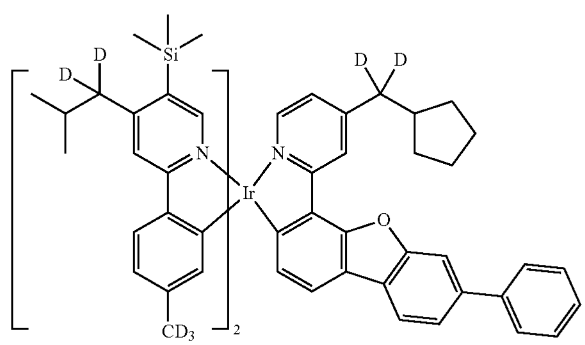
2489
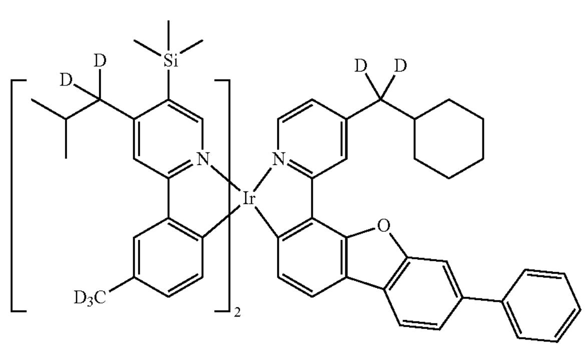

-continued
2490
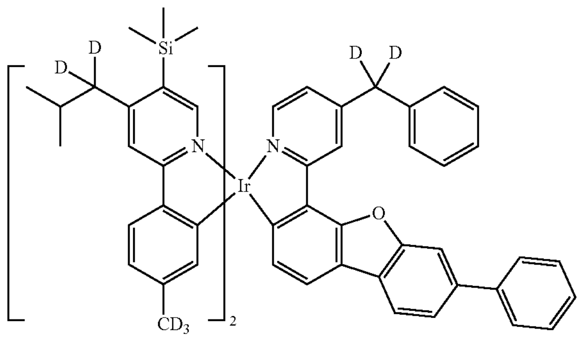
2491
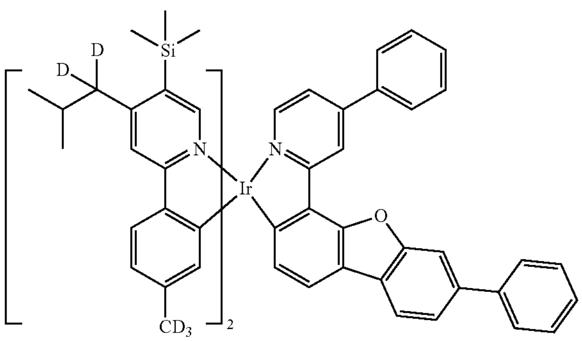
2492
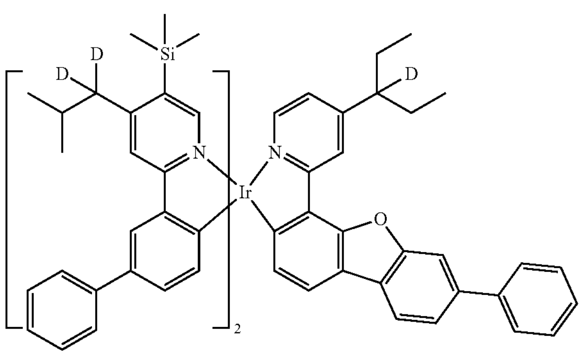
2493
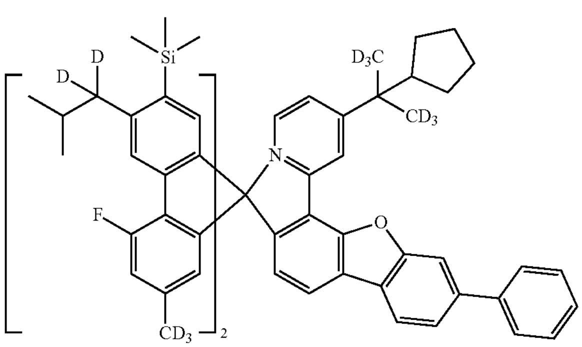
-continued
2494
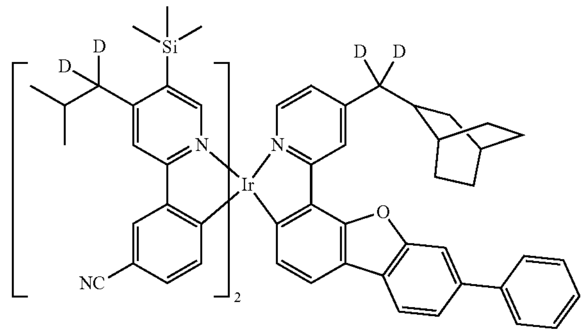
2495
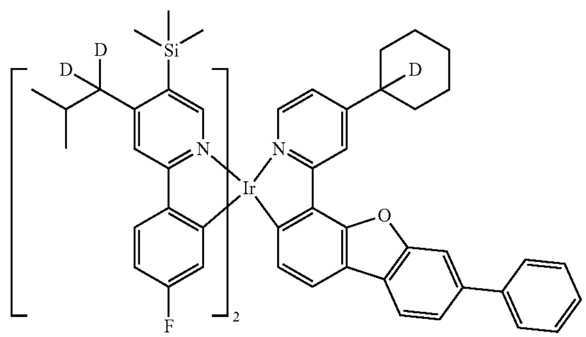
2496
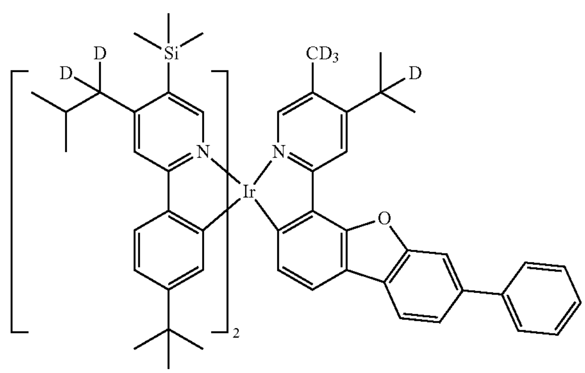
2497
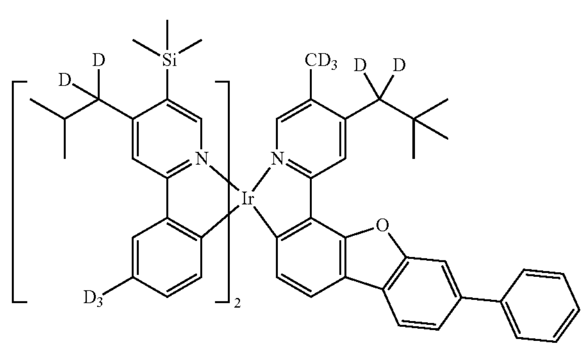

-continued
2498
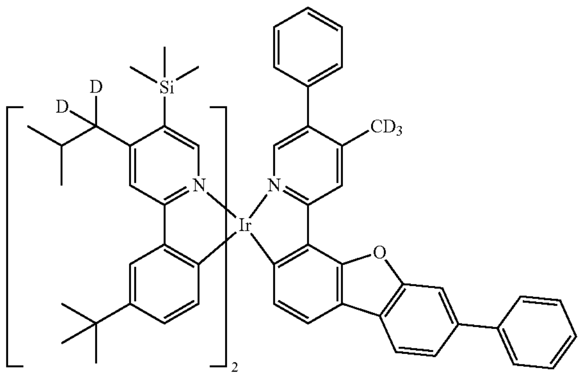
2499
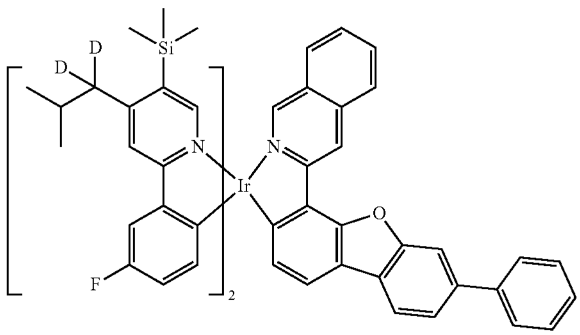
2500
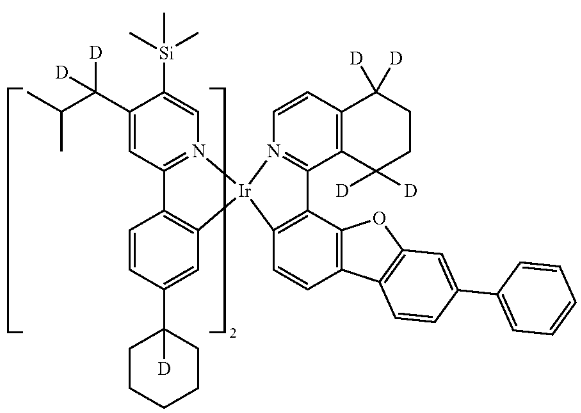
2501
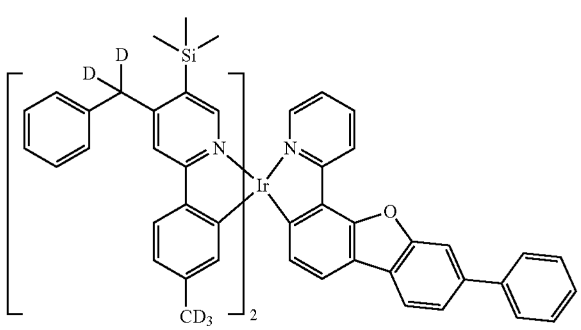
-continued
2502
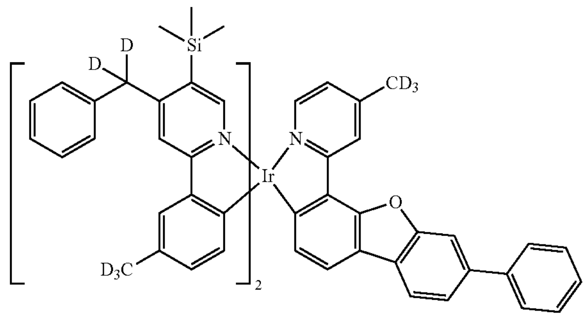
2503
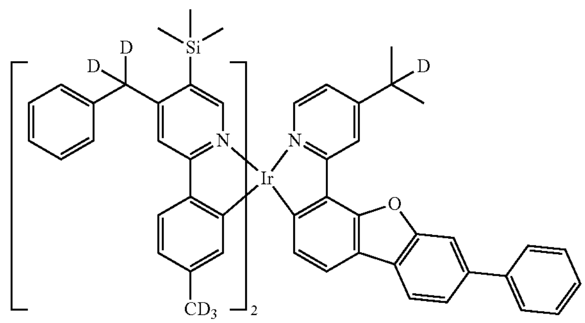
2504
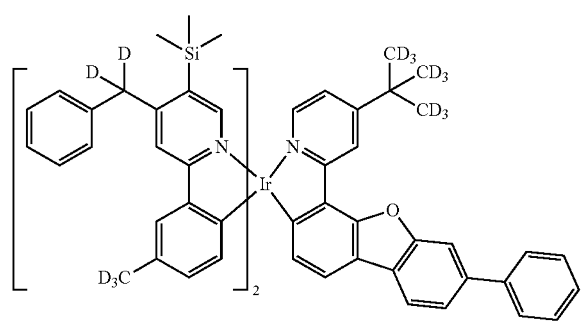
2505
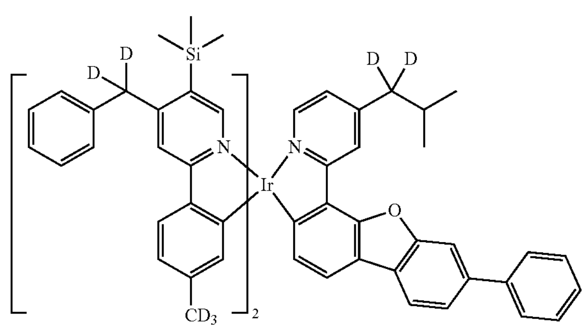

-continued
2506
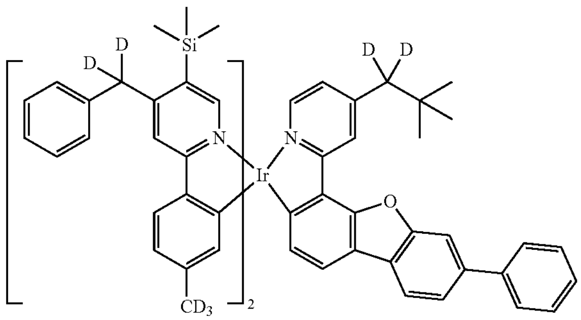
2507
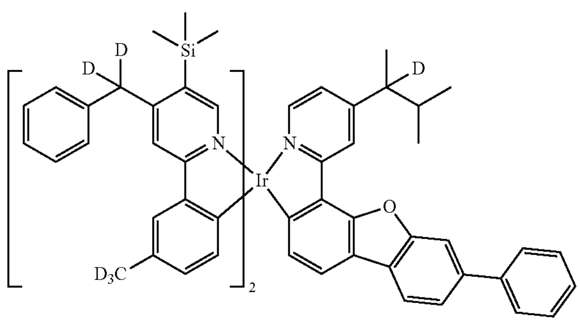
2508
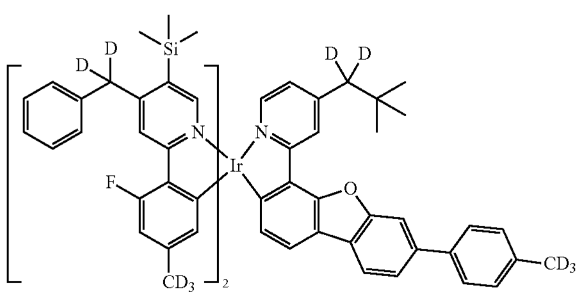
2509
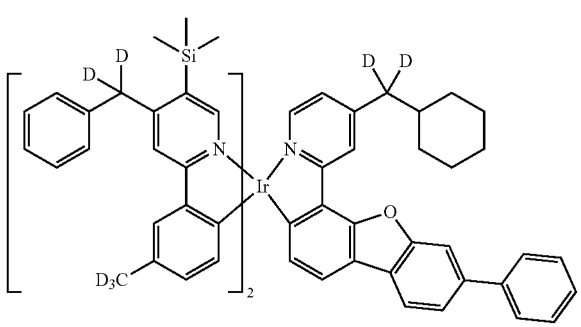
-continued
2510
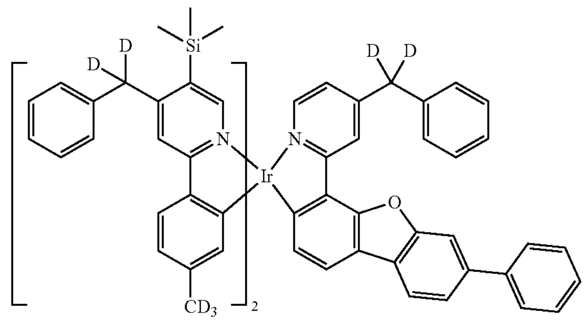
2511
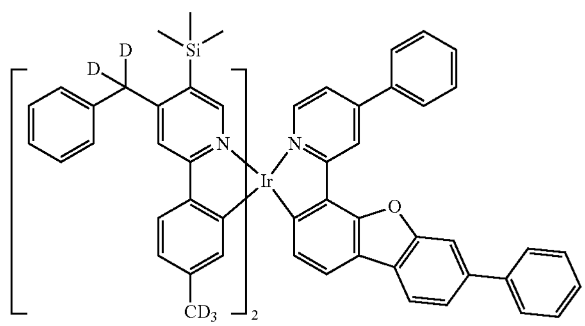
2512
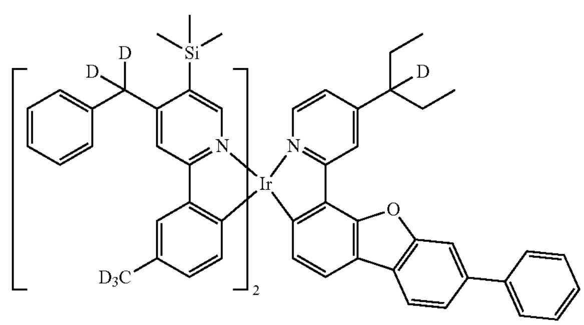
2513
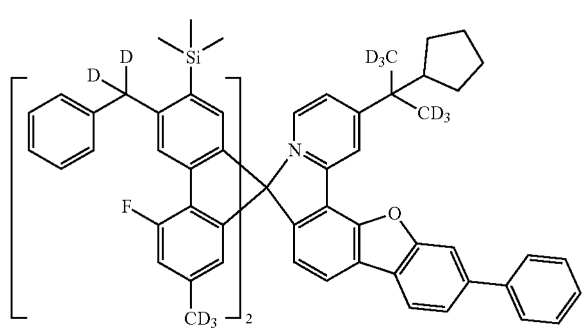

-continued
2514
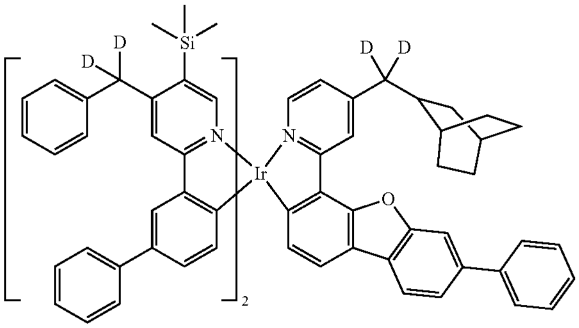
2515
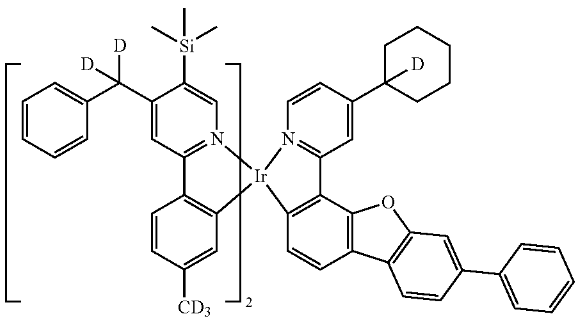
2516
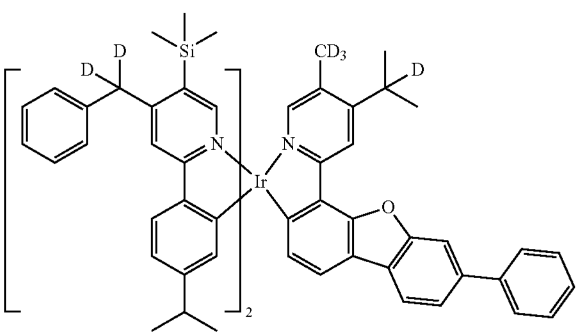
2517
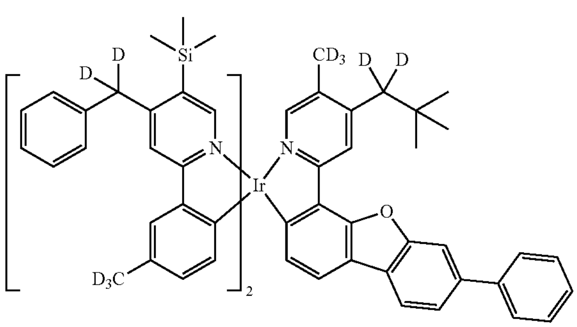
-continued
2518
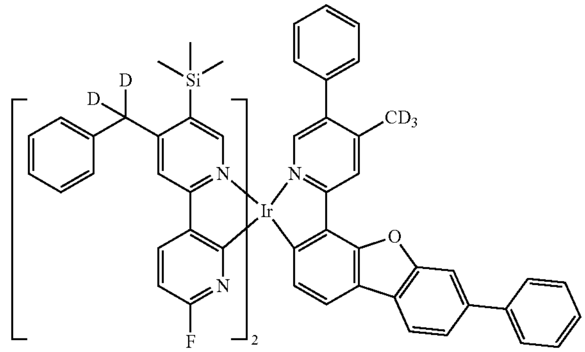
2519
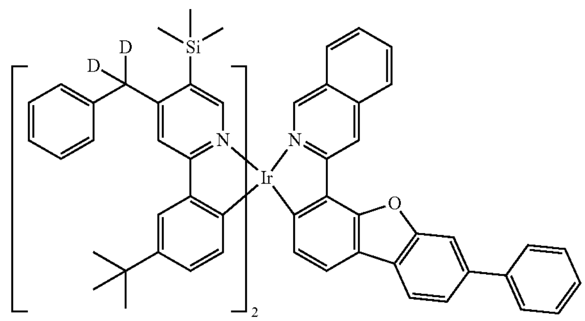
2520
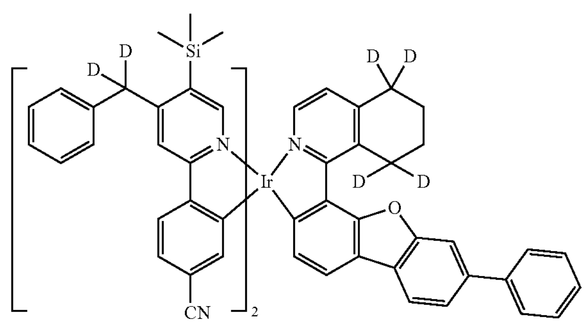
2521
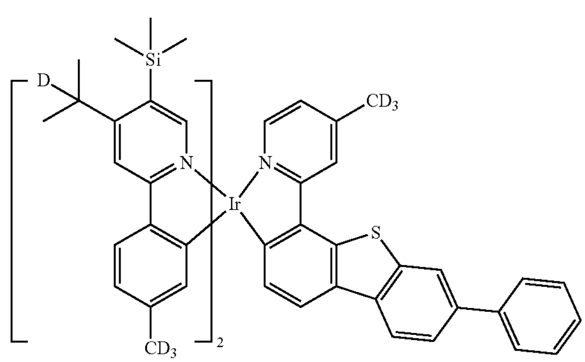

-continued
2522
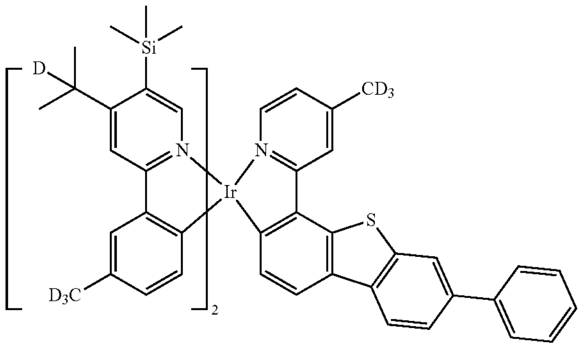
2523
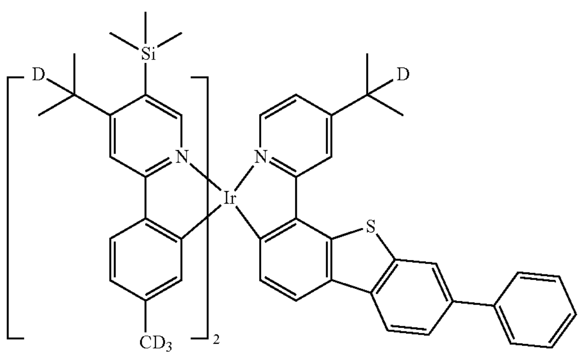
2524
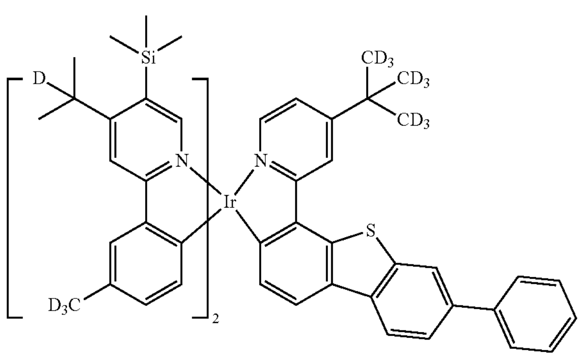
2525
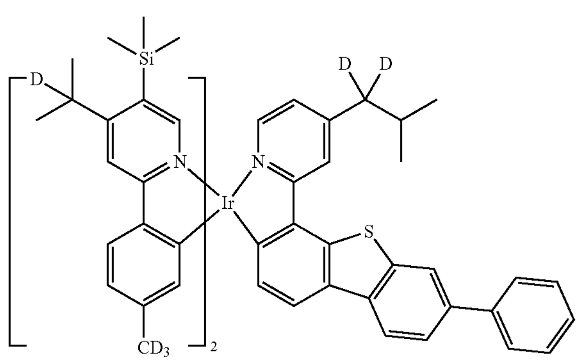
-continued
2526
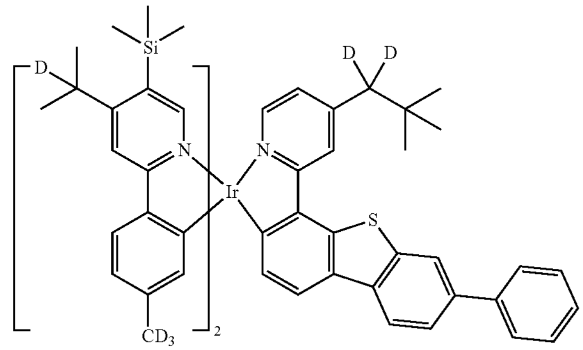
2527
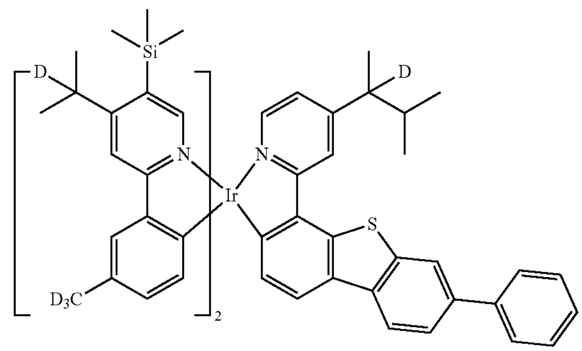
2528
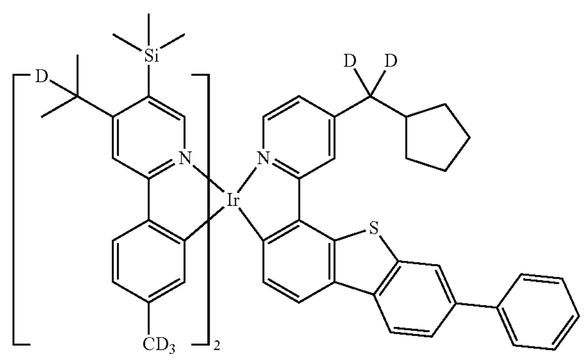
2529
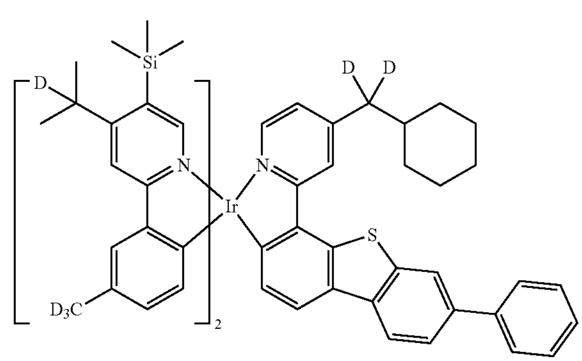

-continued
2530
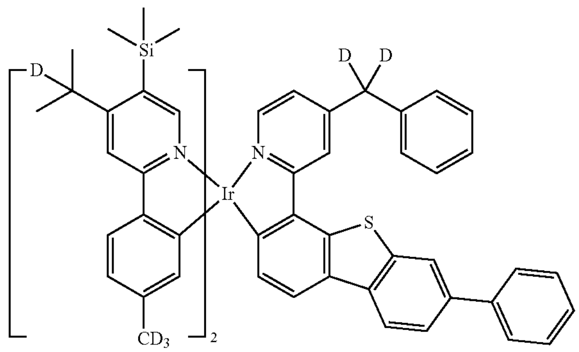
2531
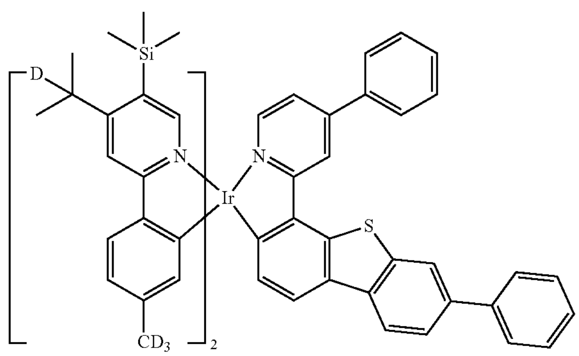
2532
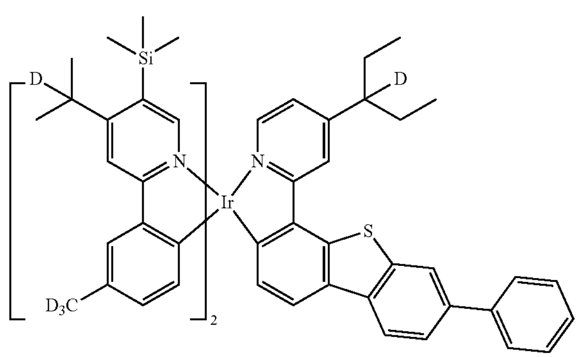
2533
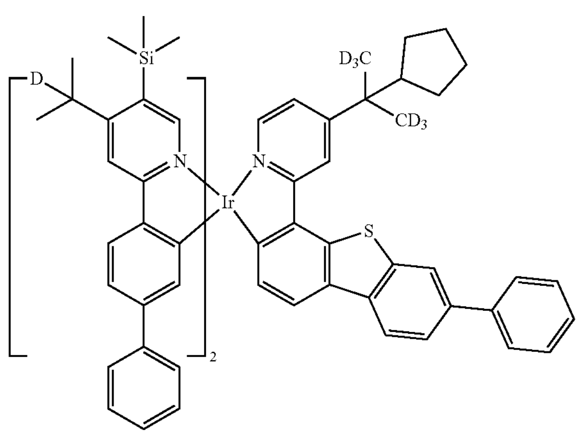
-continued
2534
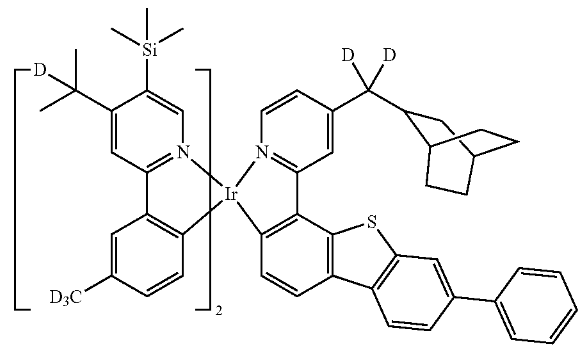
2535
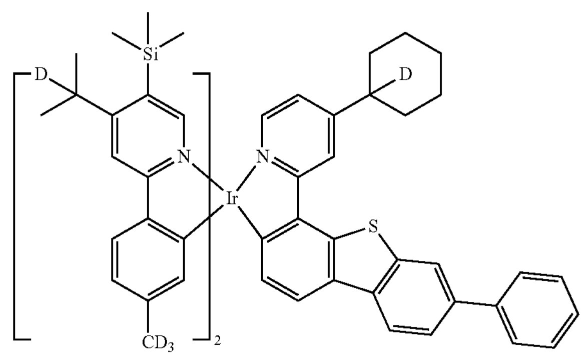
2536
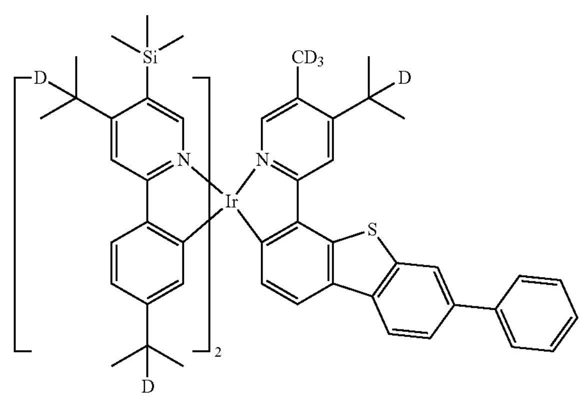
2537
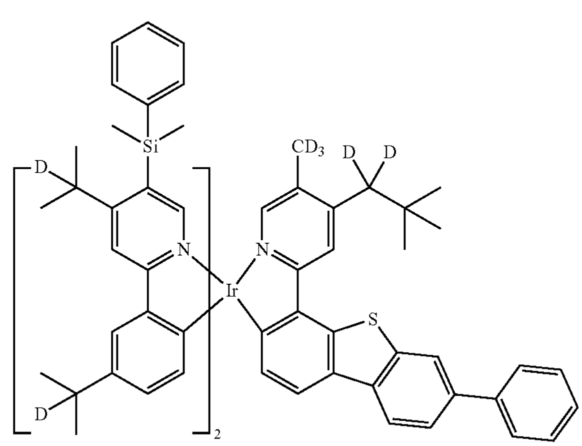

2538
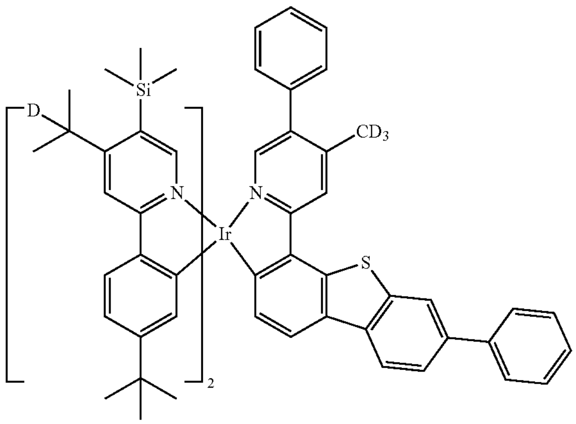
2539
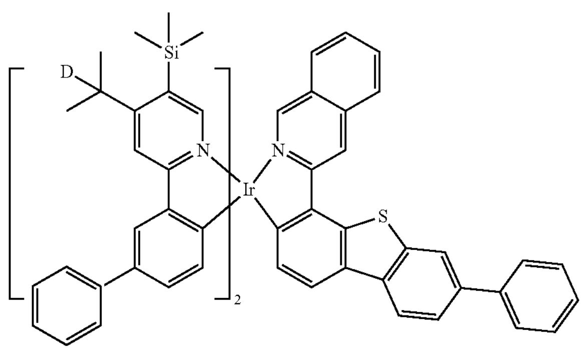
2540
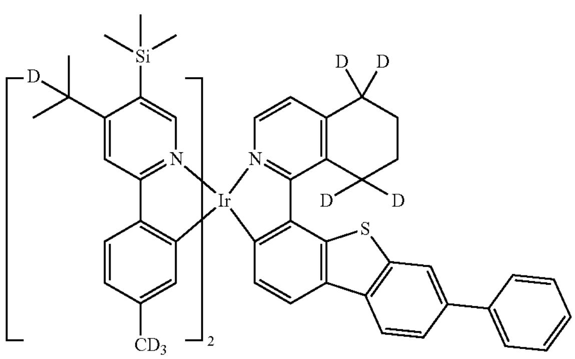
2541
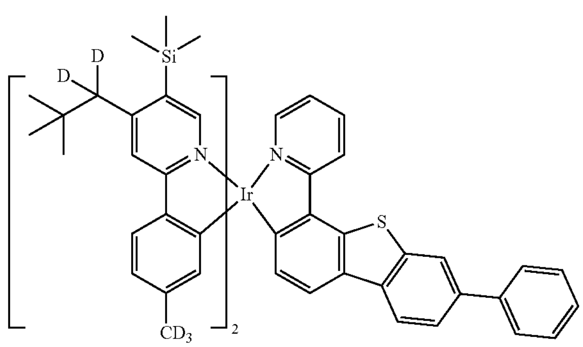
2542
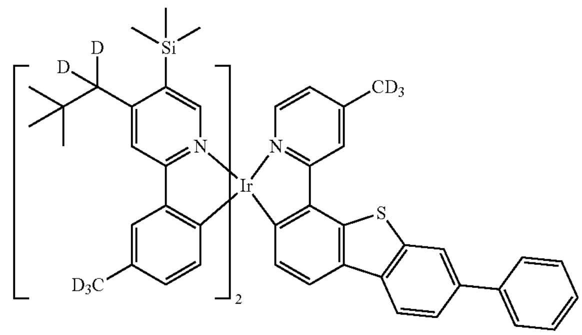
2543
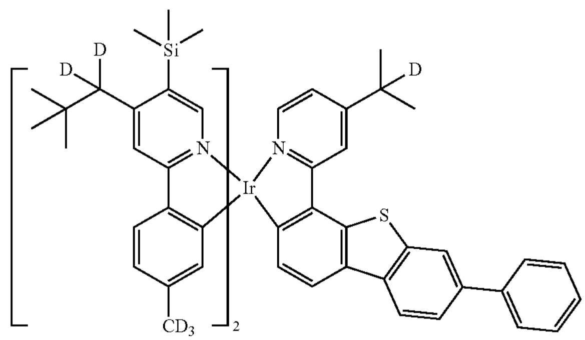
2544
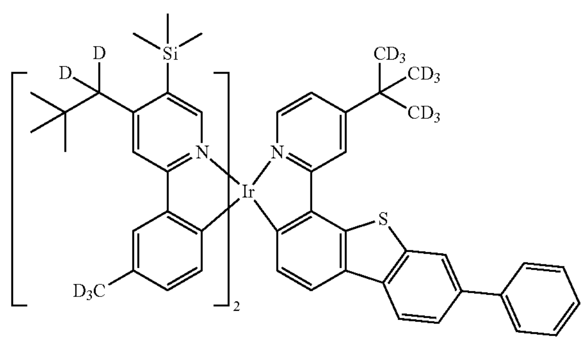
2545
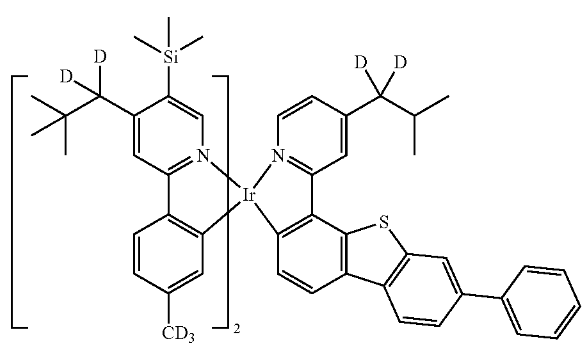

-continued
2546
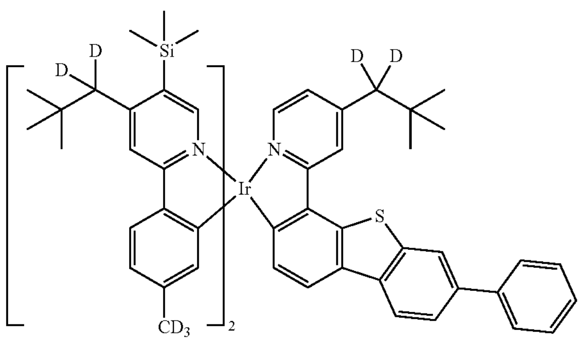
2547
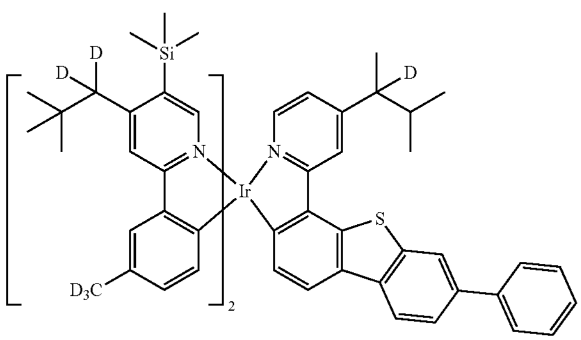
2548
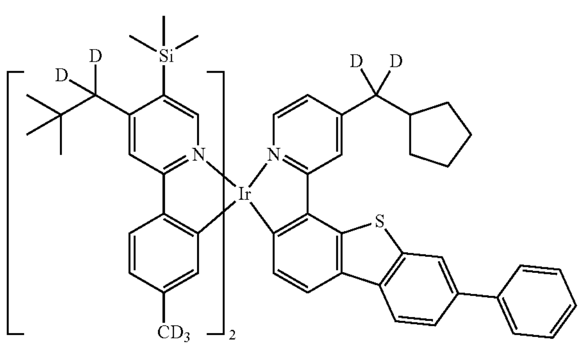
2549
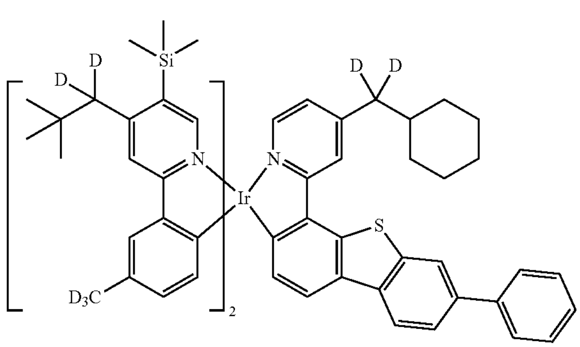
-continued
2550
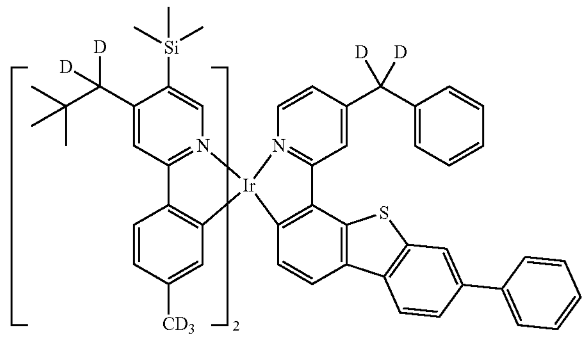
2551
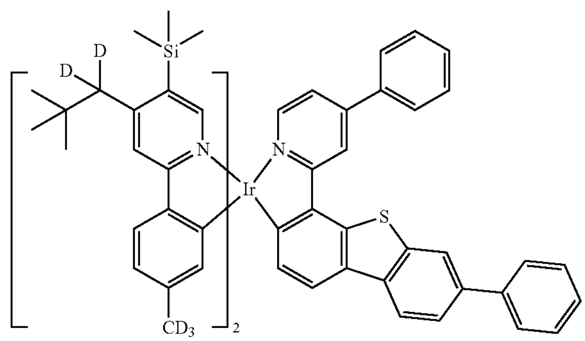
2552
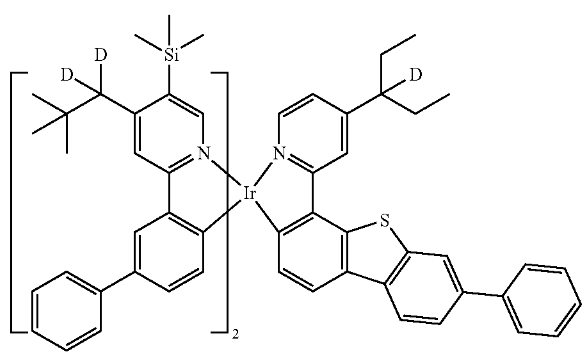
2553
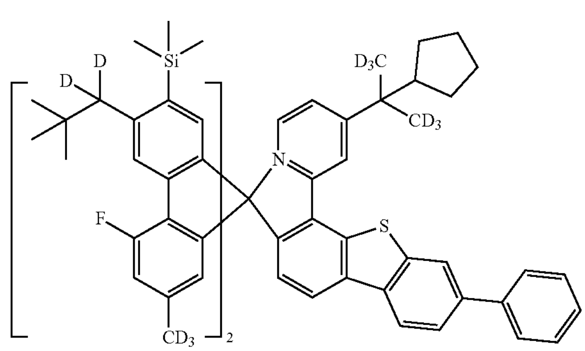

-continued
2554
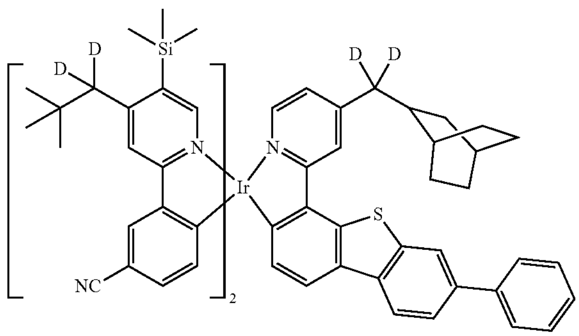
2555
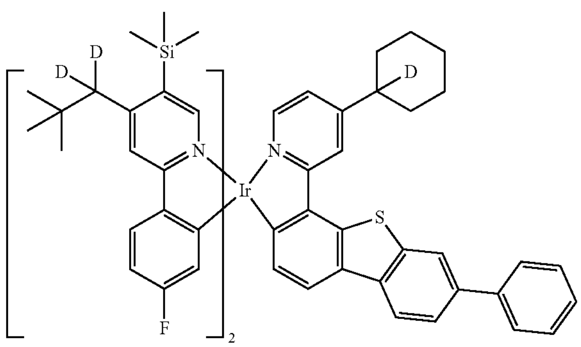
2556
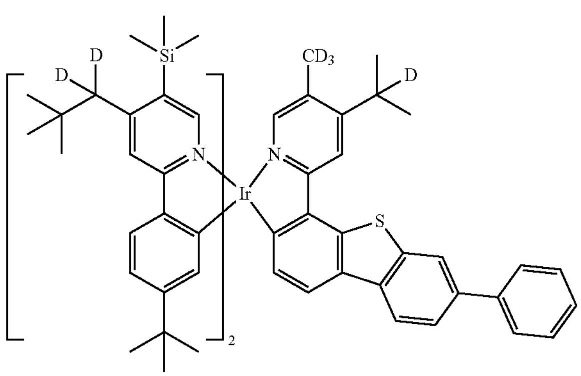
2557
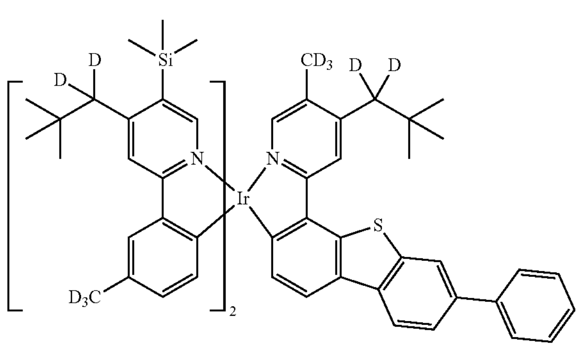
-continued
2558
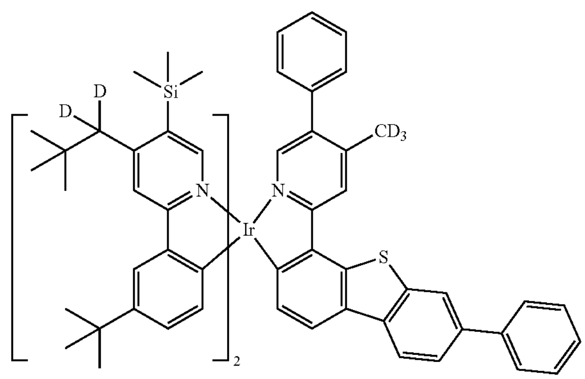
2559
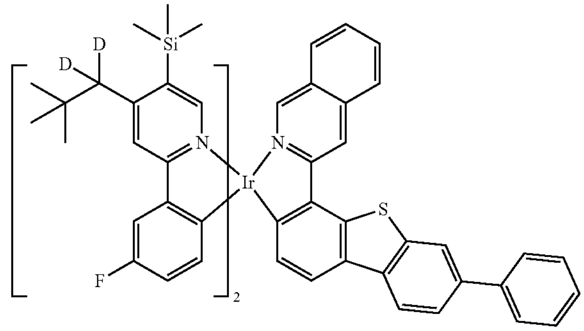
2560
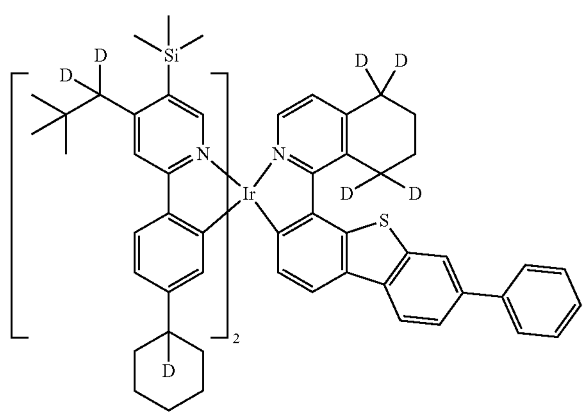
2561
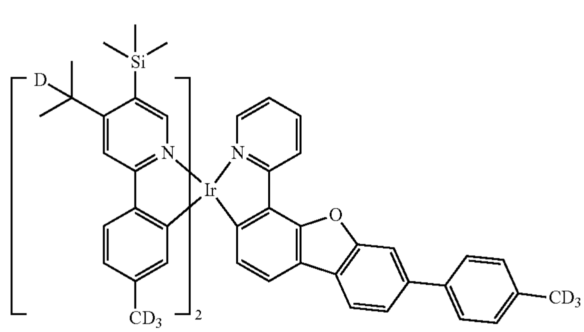

-continued
2562
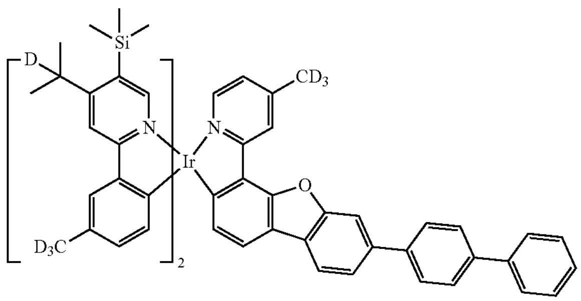
2563
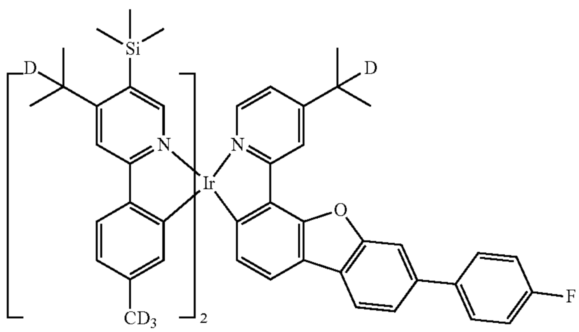
2564
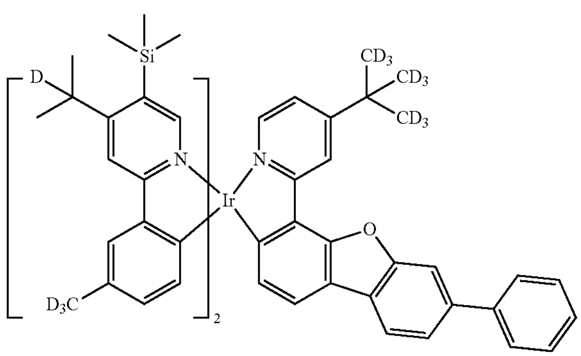
2565
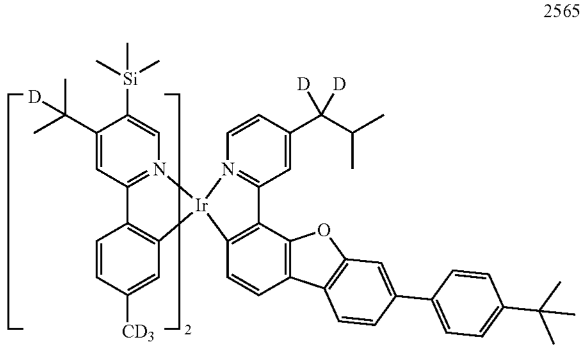
-continued
2566
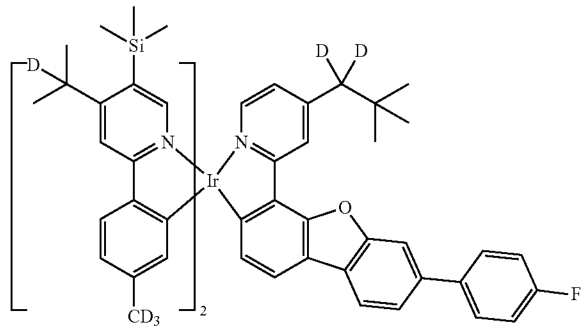
2567
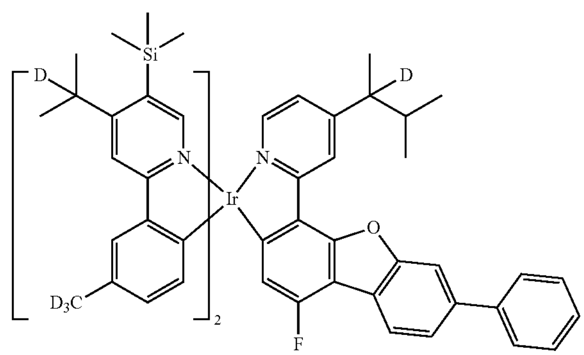
2568
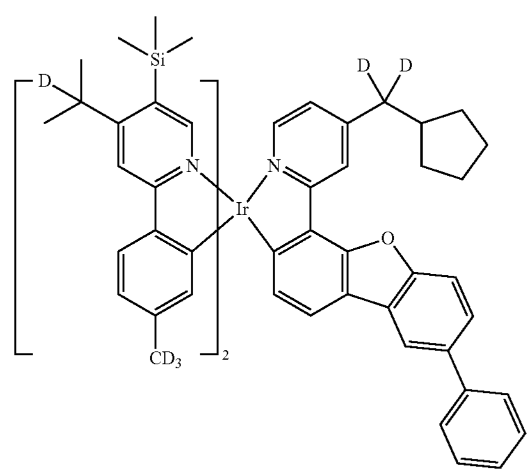
2569
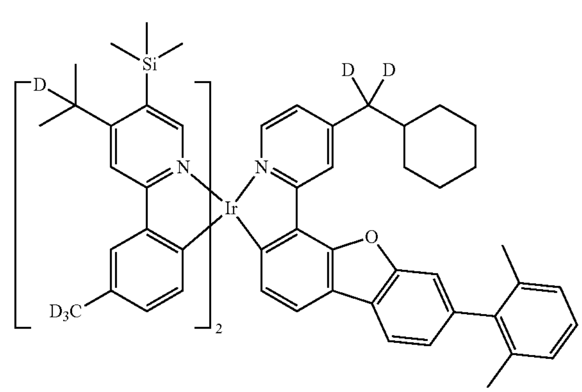

-continued
2570
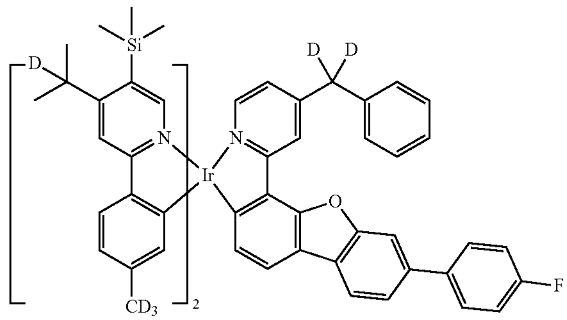
2571
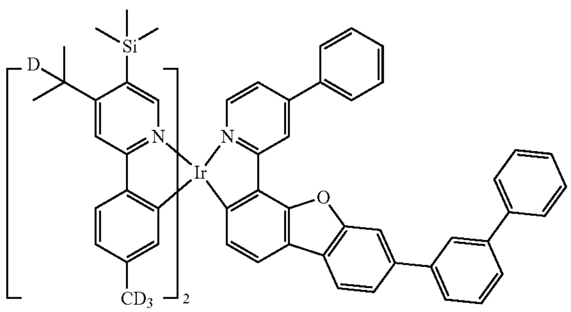
2572
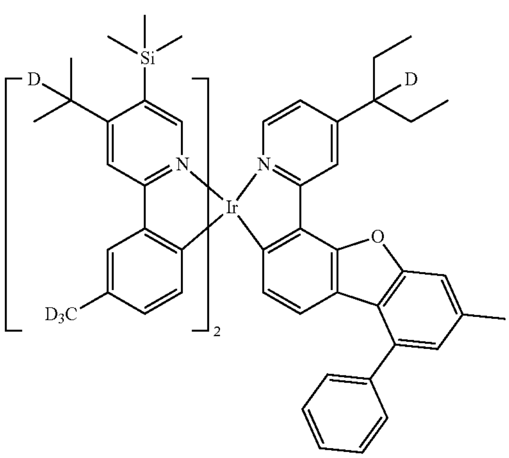
2573
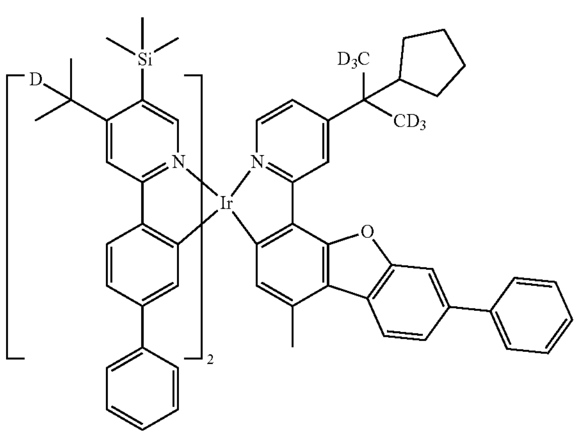
-continued
2574
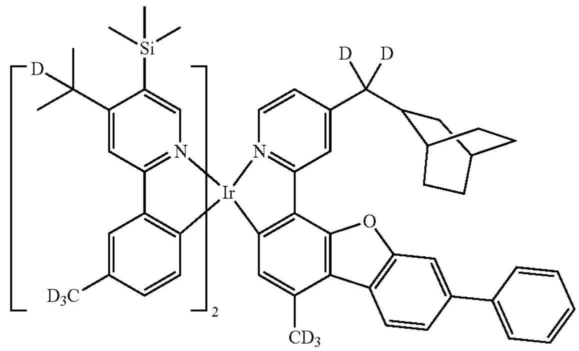
2575
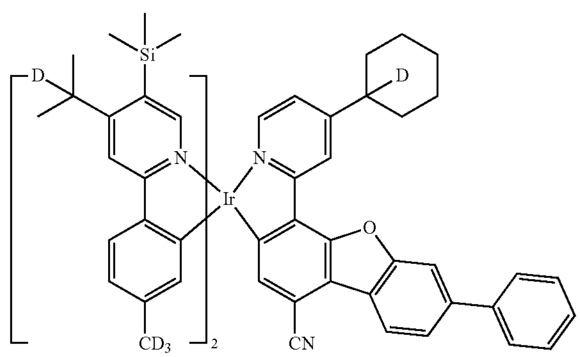
2576
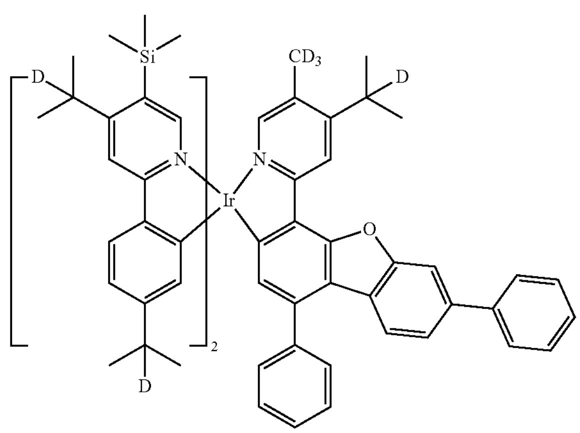

2577
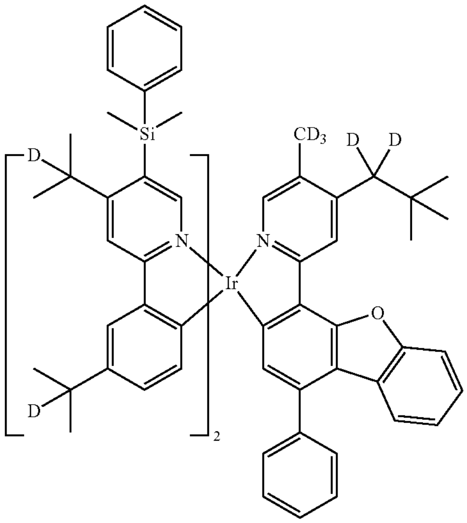
2578
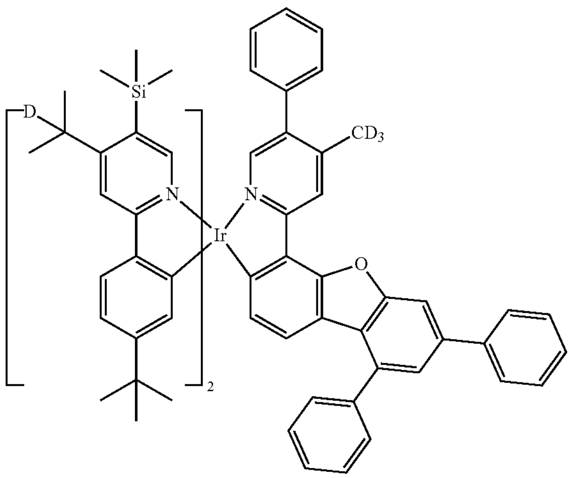
2579
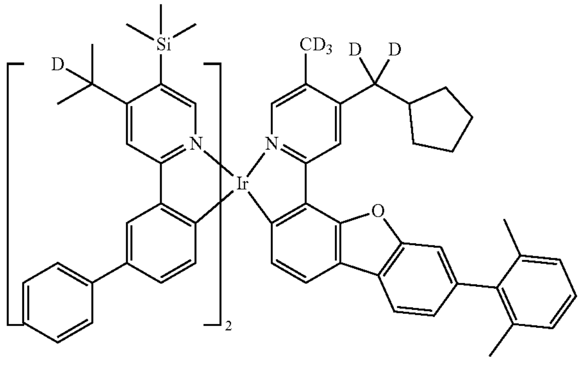
2580
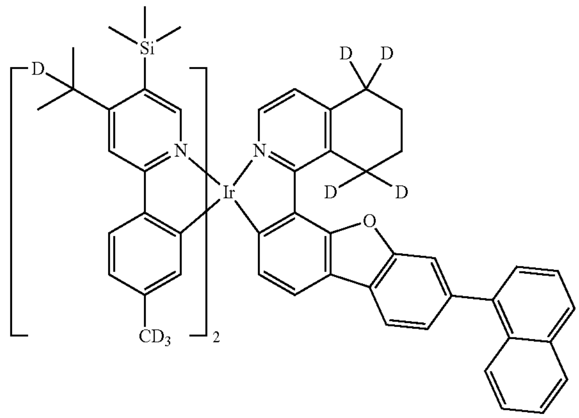
2581
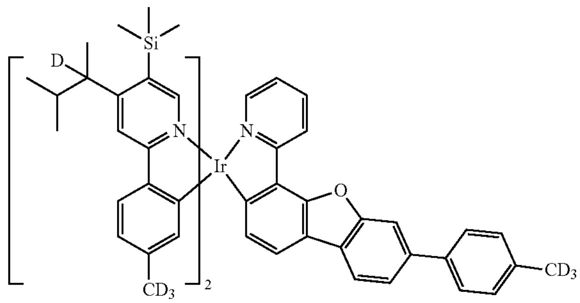
2582
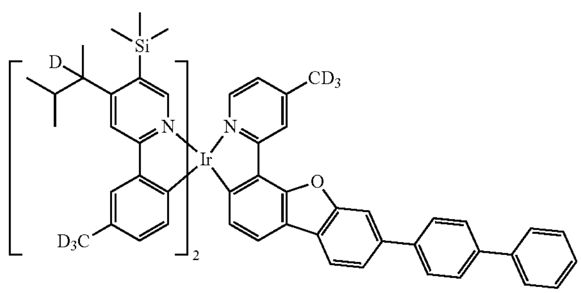
2583
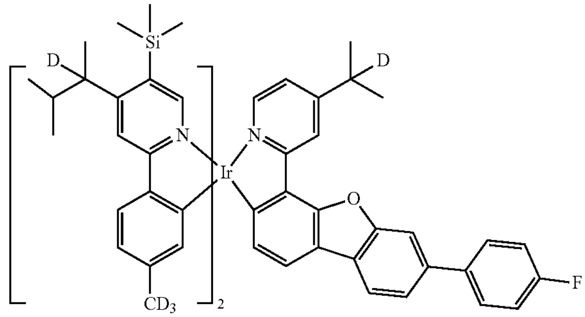

2584
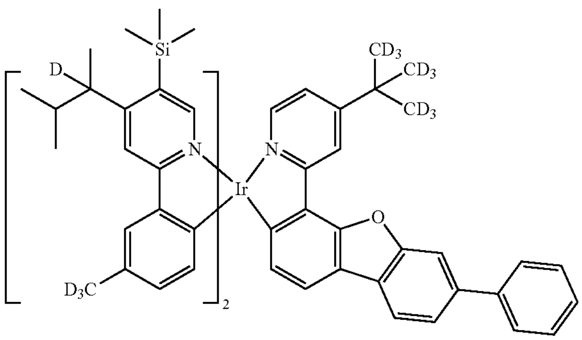
2585
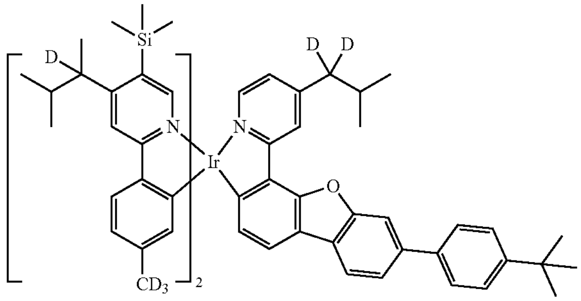
2586
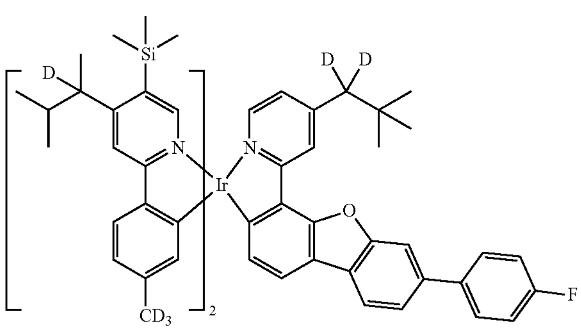
2587
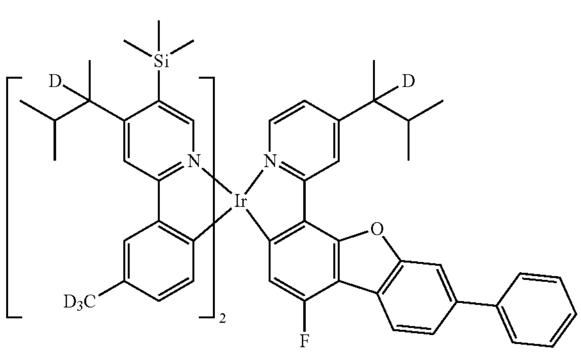
2588
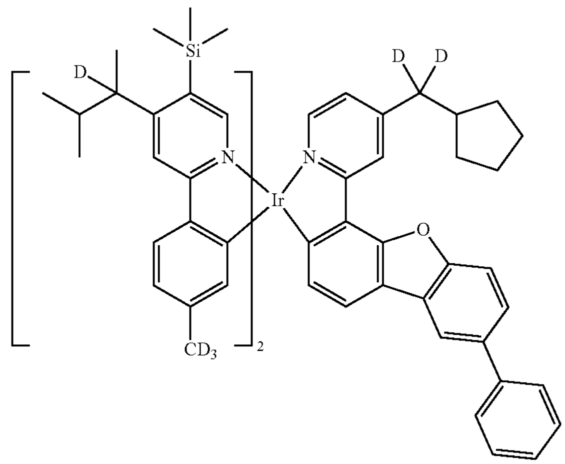
2589
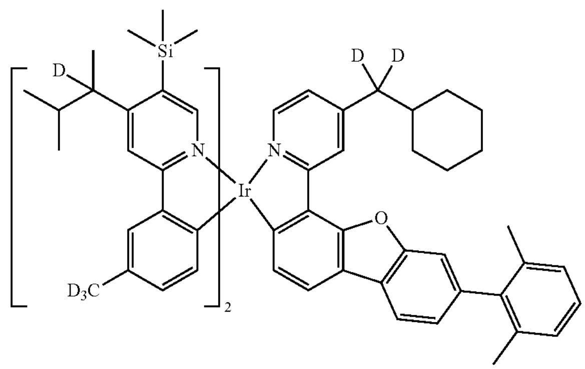
2590
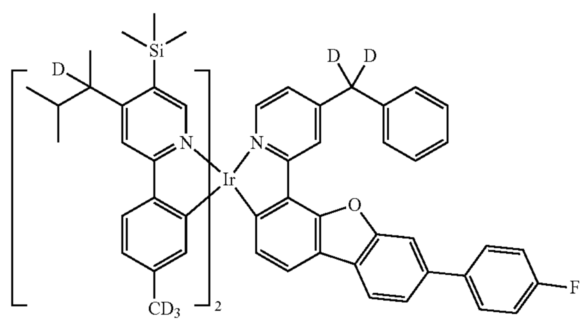
2591
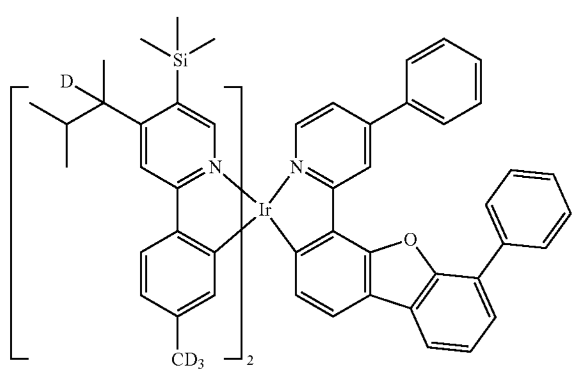

-continued
2592
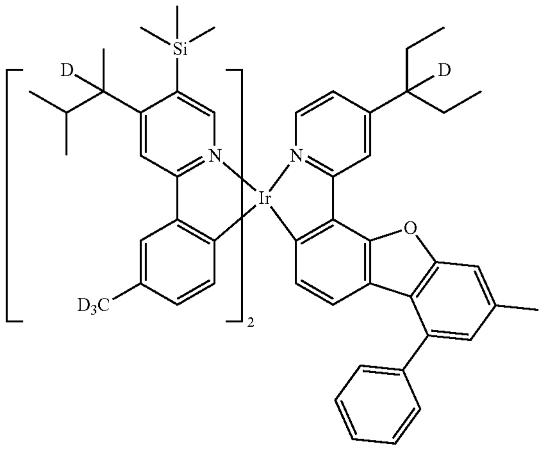
2593
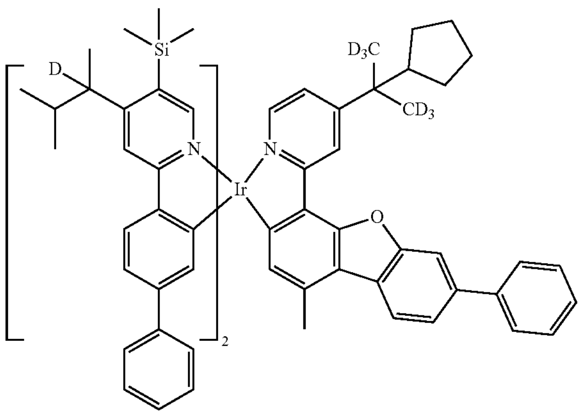
2594
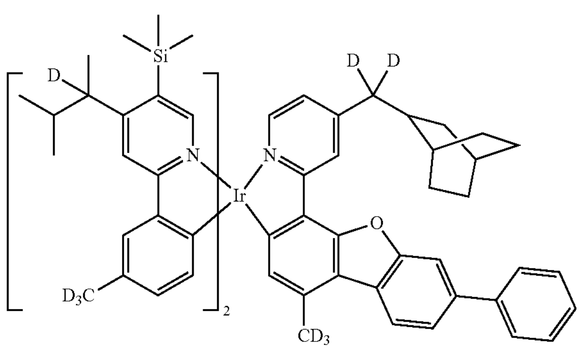
2595
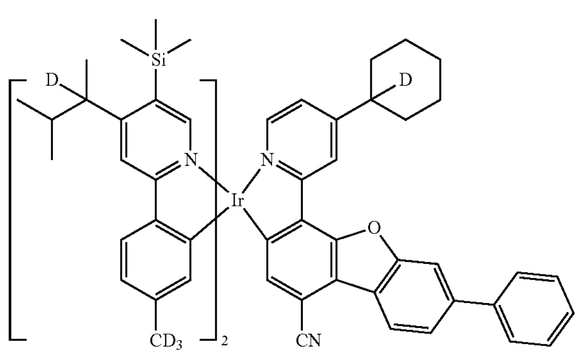
-continued
2596
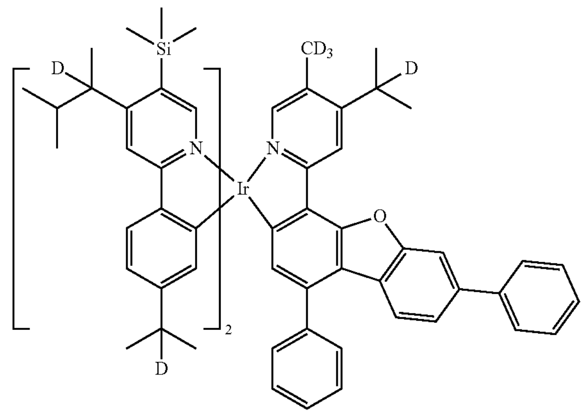
2597
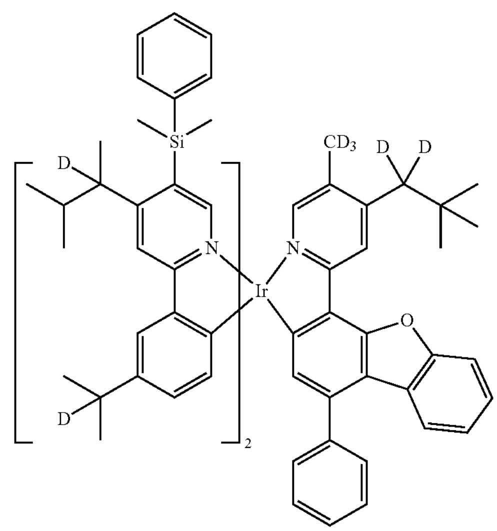
2598
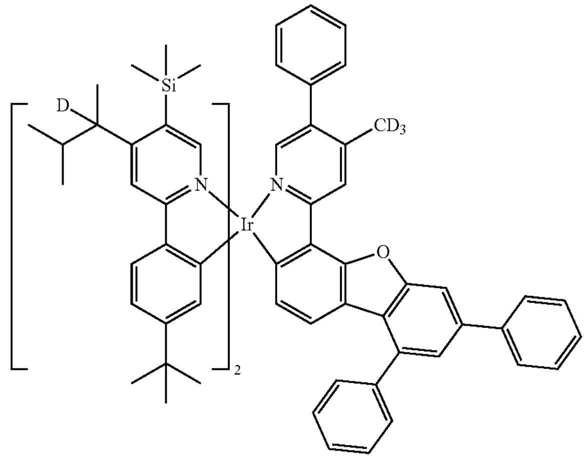

2599
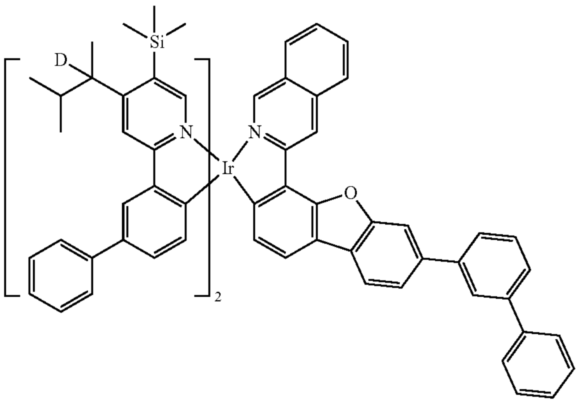
2600
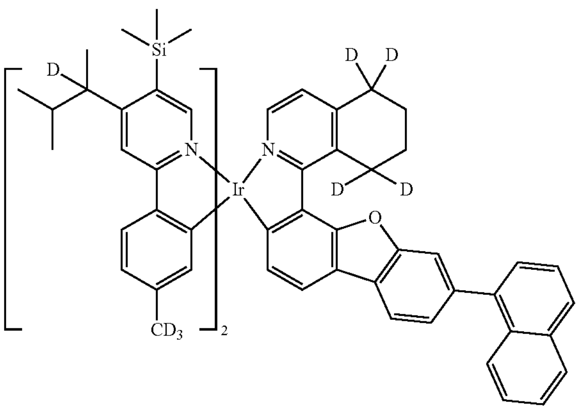
2601
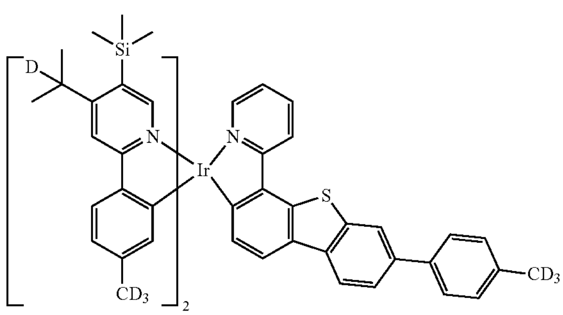
2602
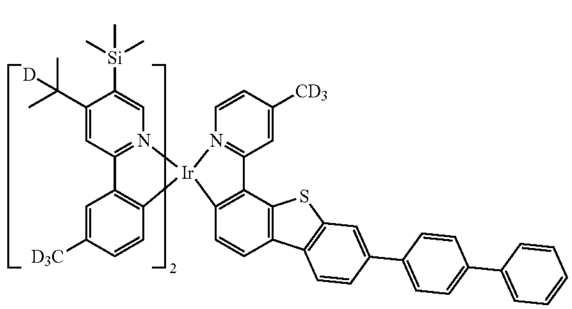
2603
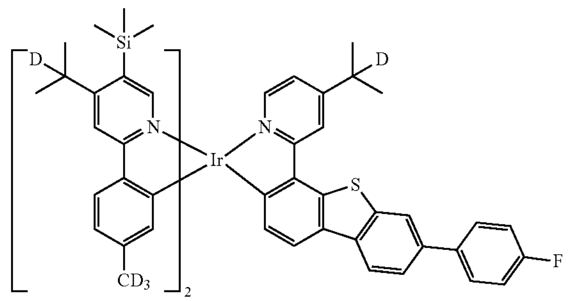
2604
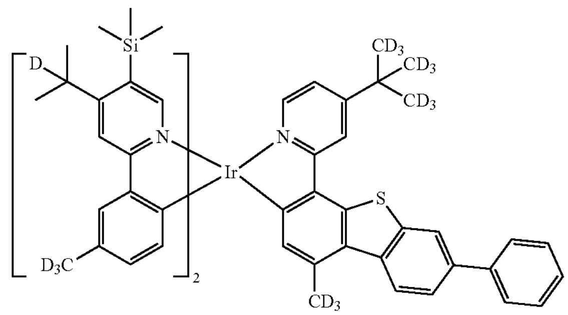
2605
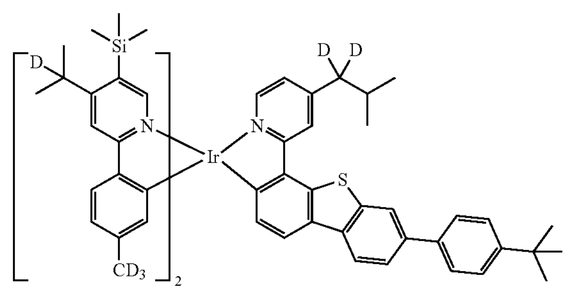
2606
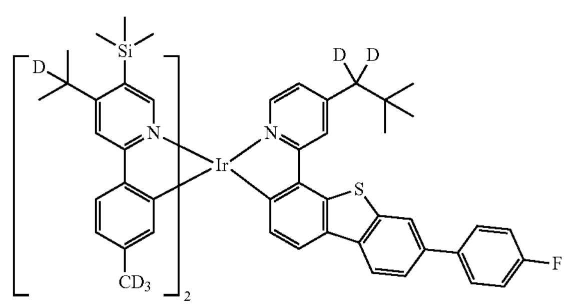
2607
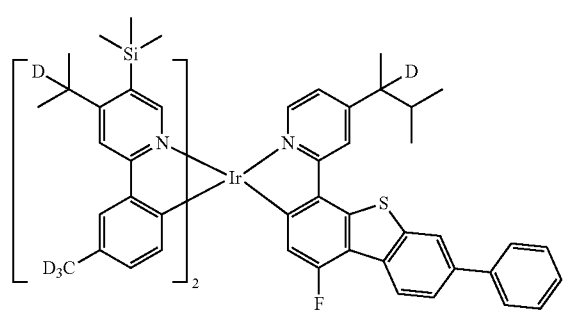

-continued
2608
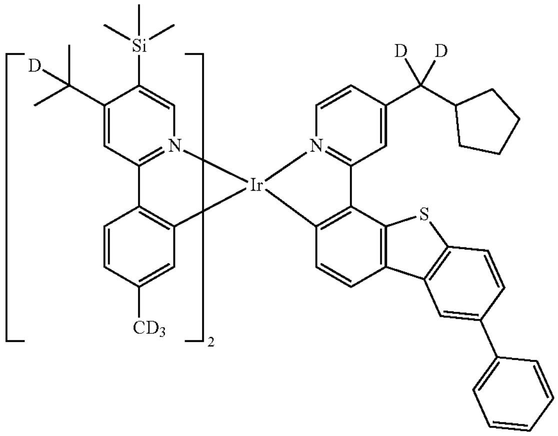
2609
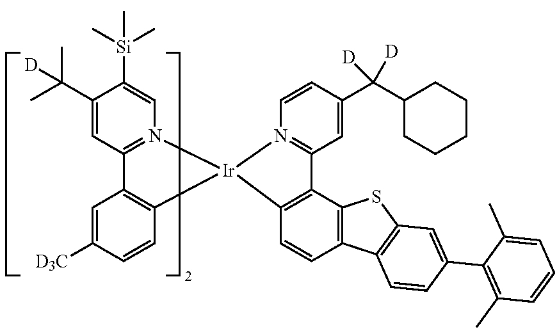
2610
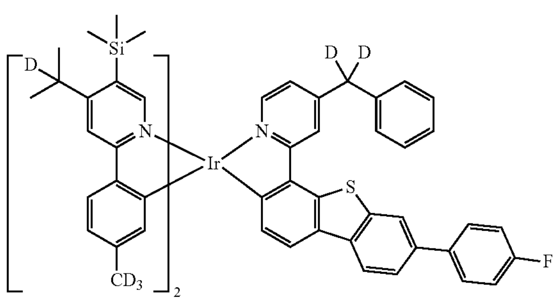
2611
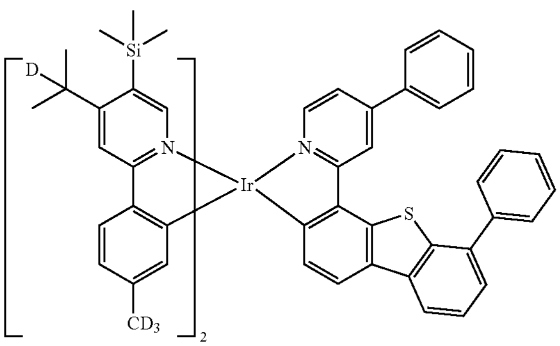
-continued
2612
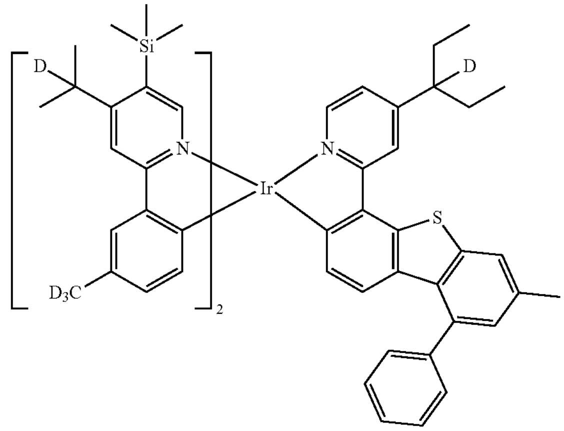
2613
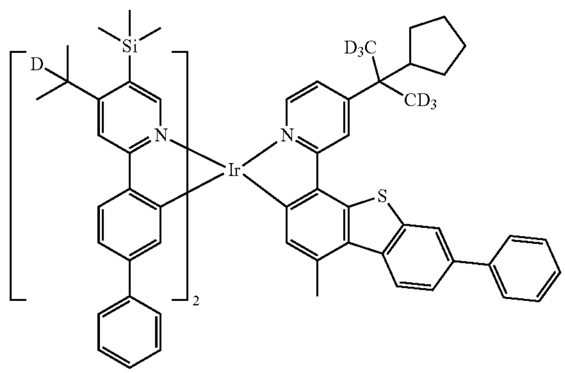
2614
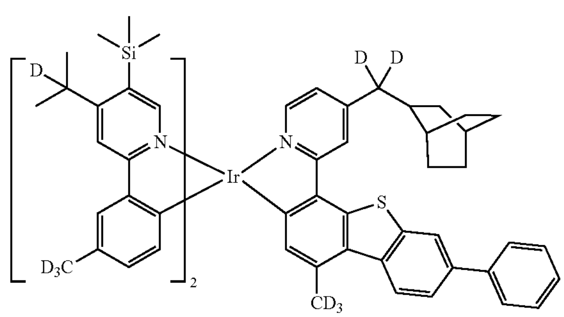
2615
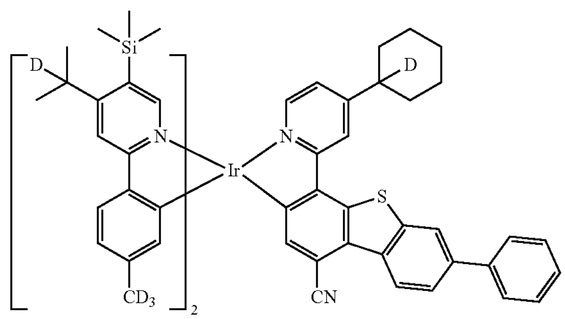

2616
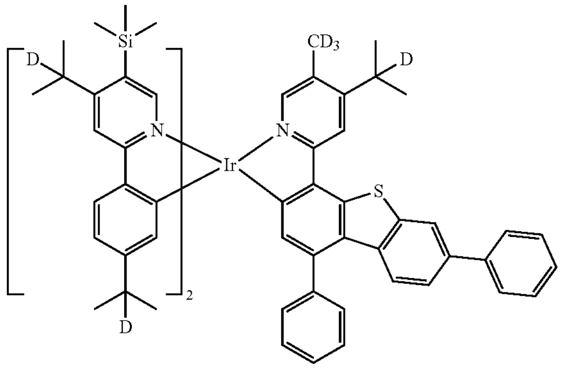
2617
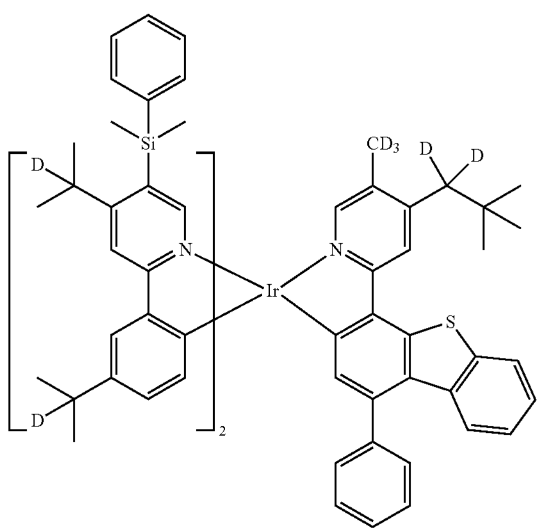
2618
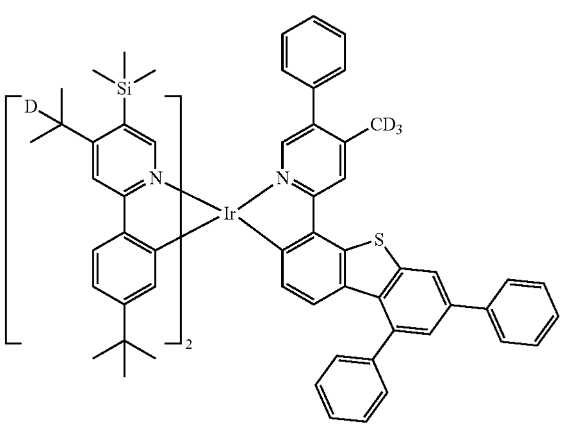
2619
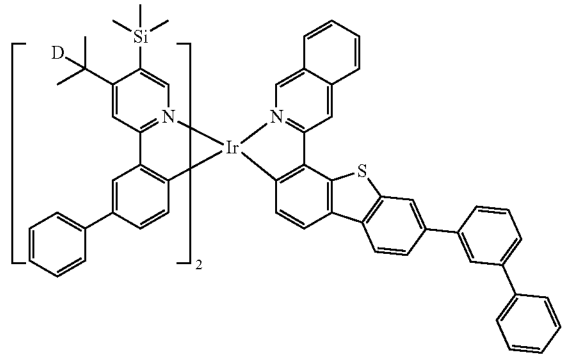
2620
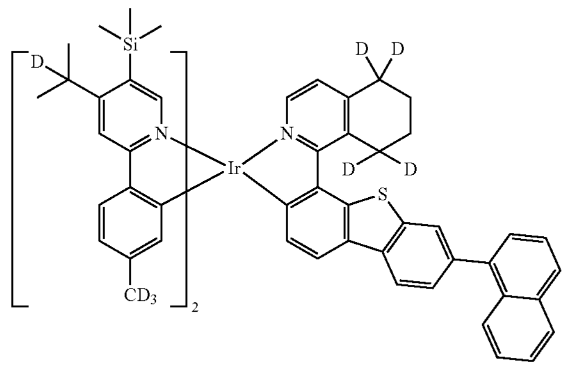
2621
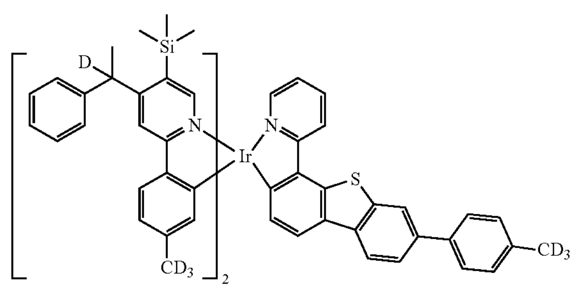
2622
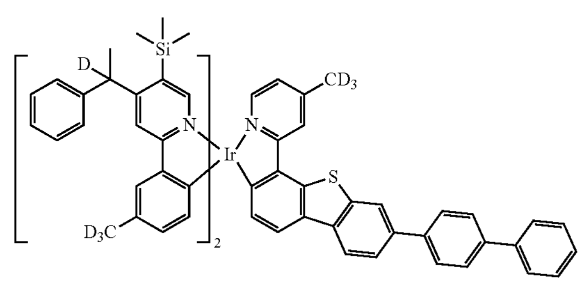

2623
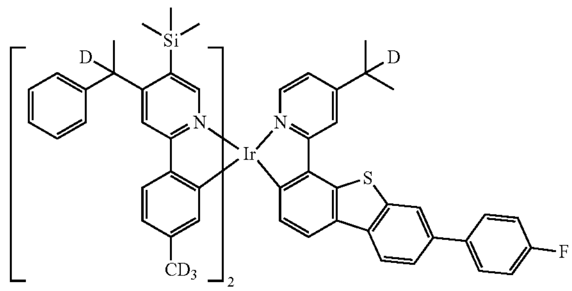
2624
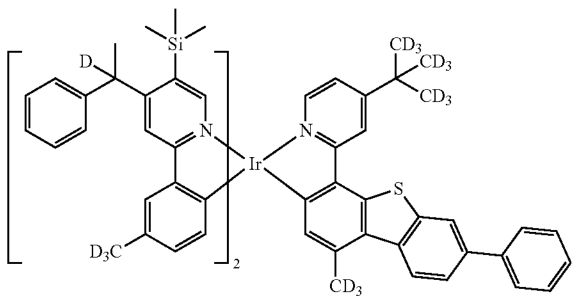
2625
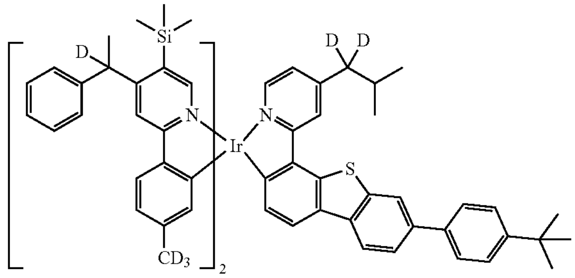
2626
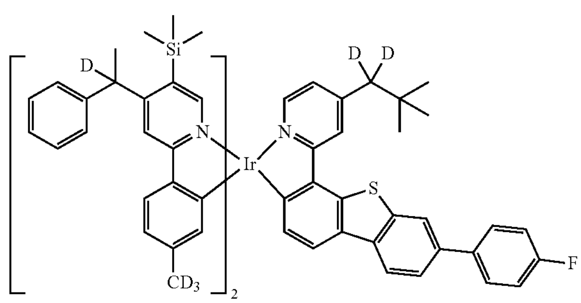
2627
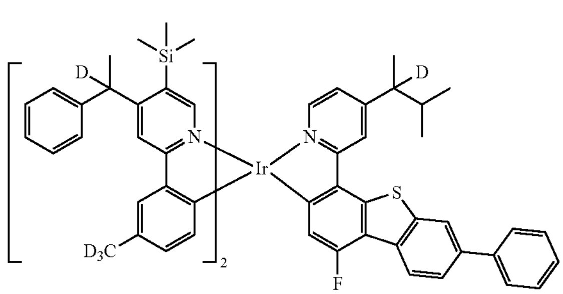
2628
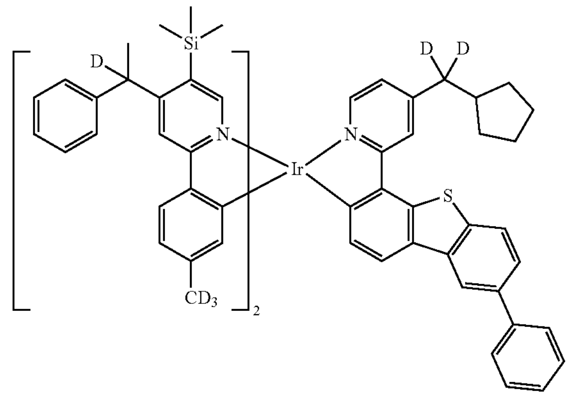
2629
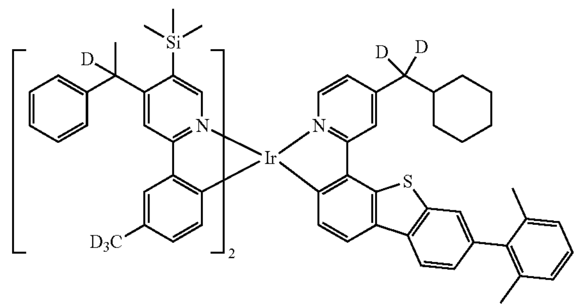
2630
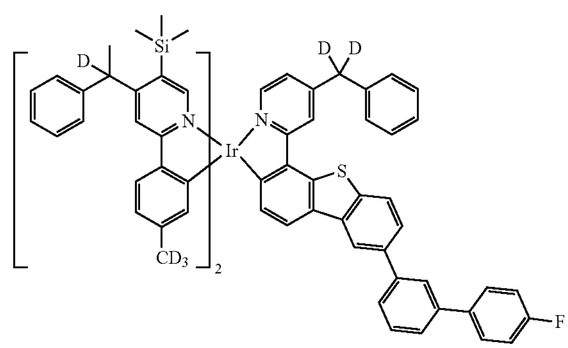
2631
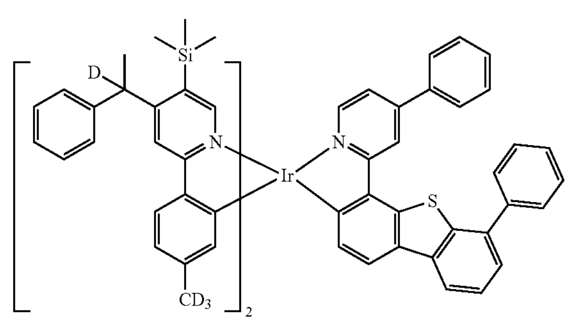

2632
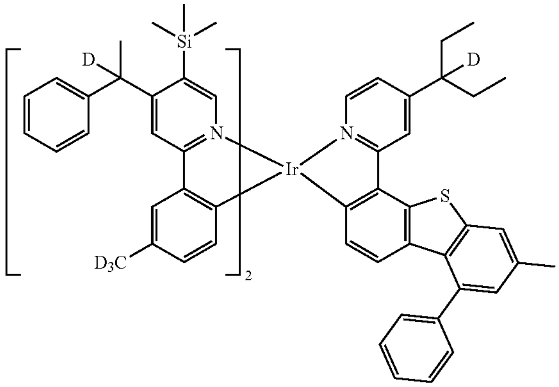
2633
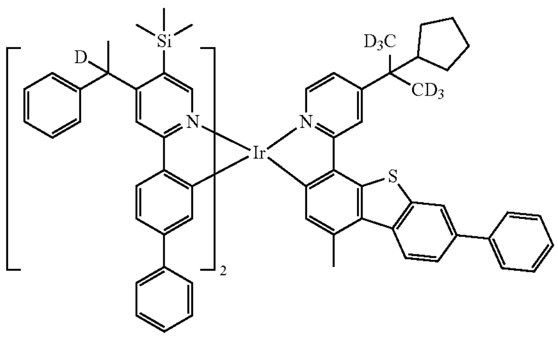
2634
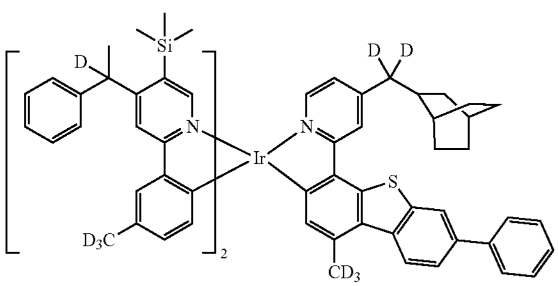
2635
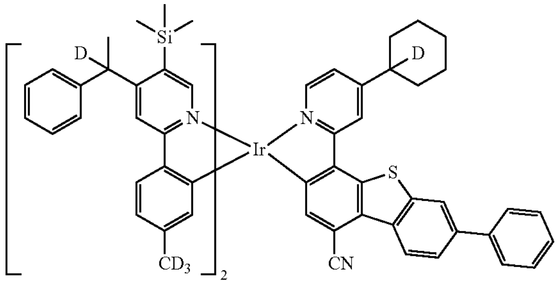
2636
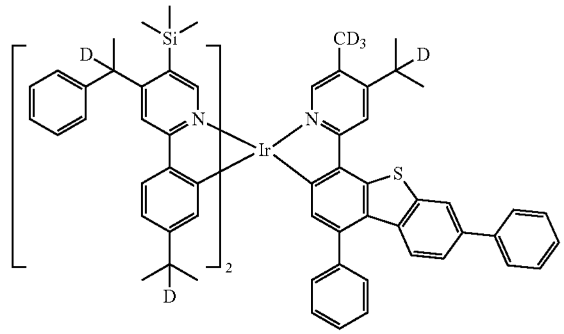
2637
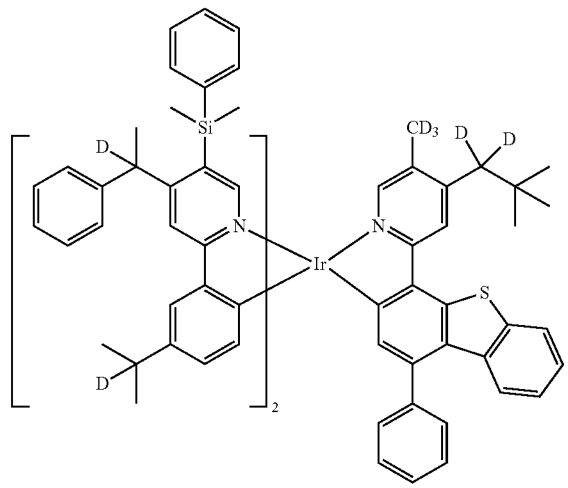
2638
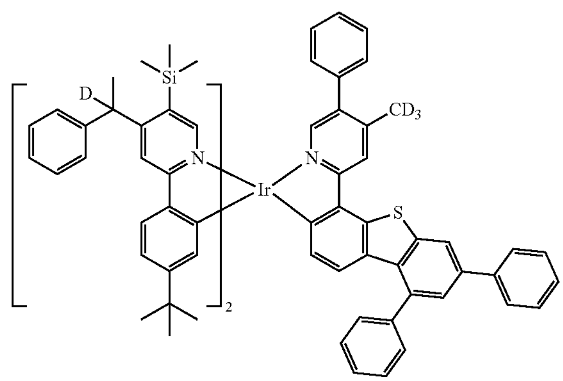
2639
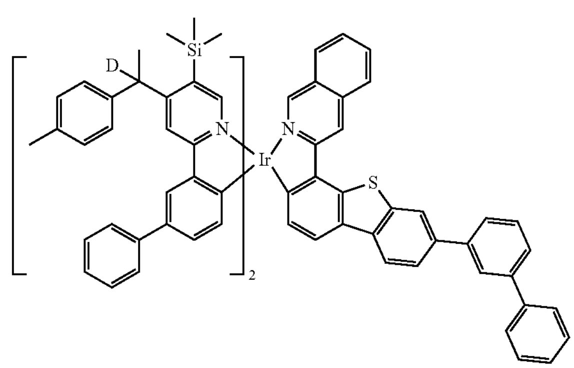

-continued
2640
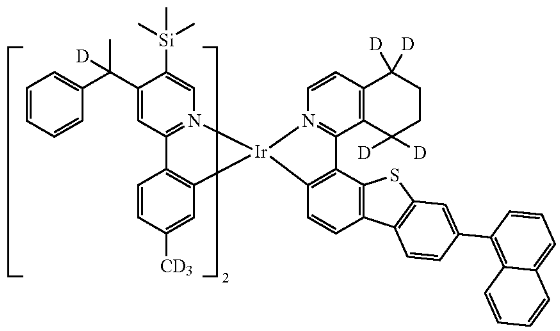
2641
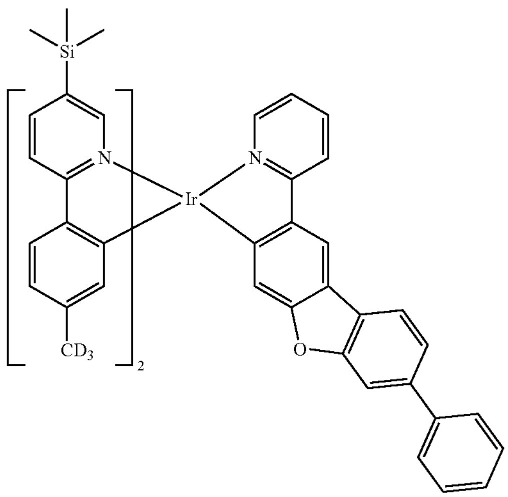
2642
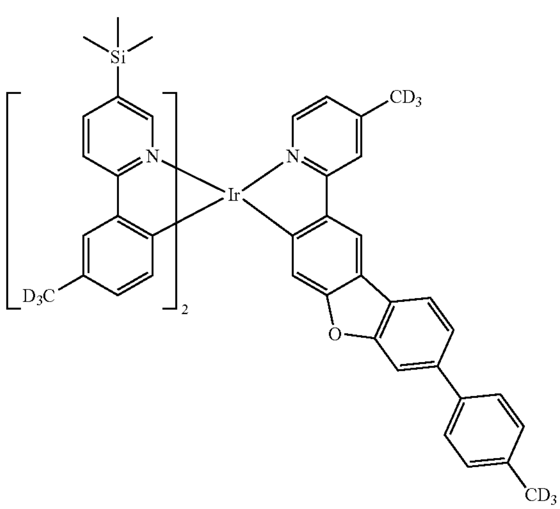
-continued
2643
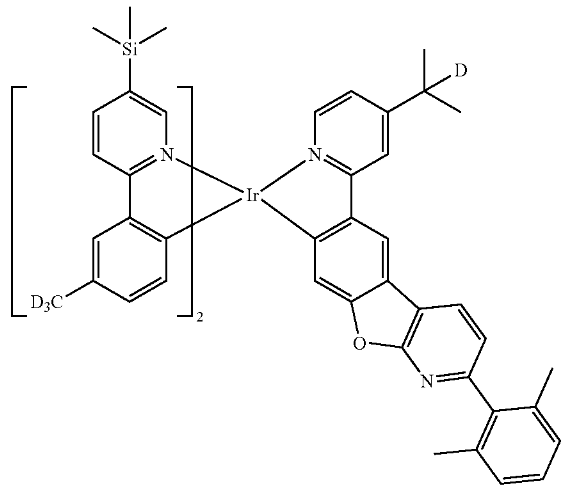
2644
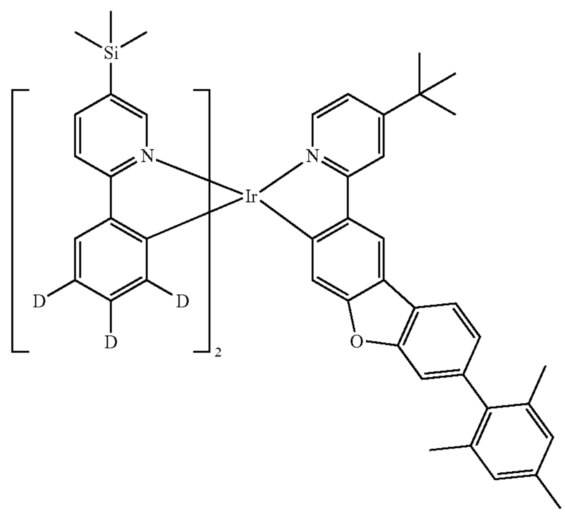
2645
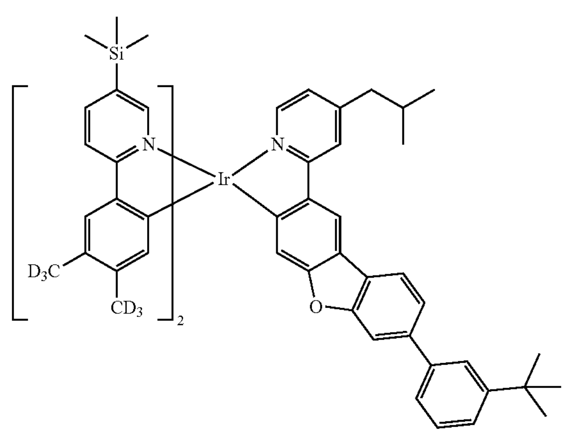

-continued
-continued
2646
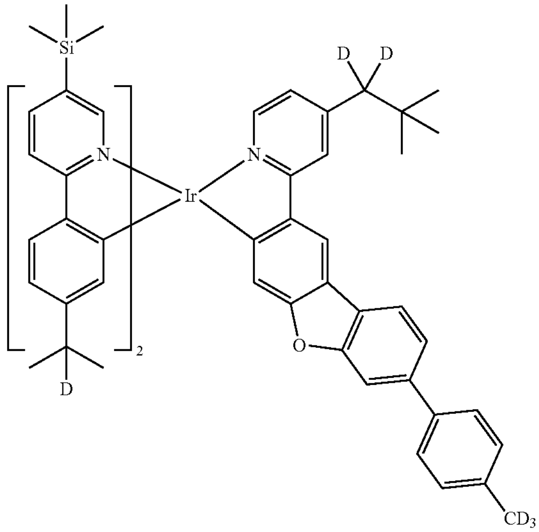
2647
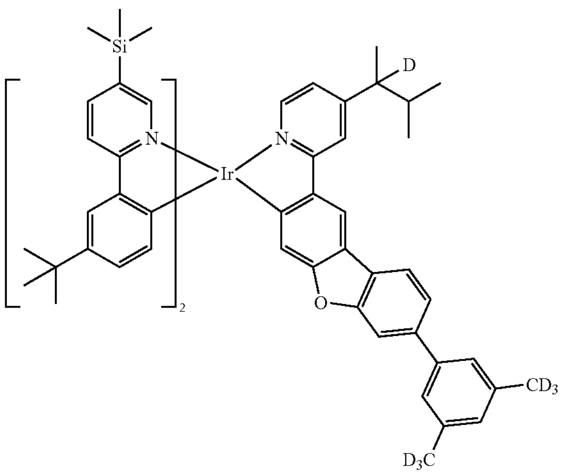
2648
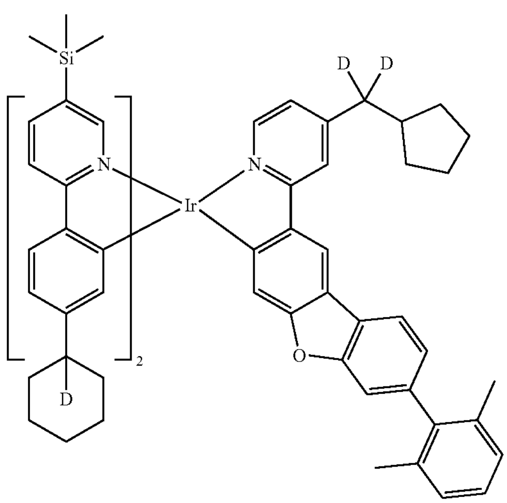
2649
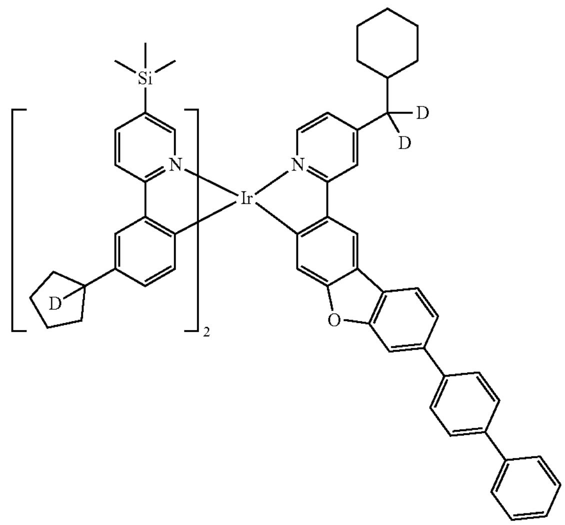
2650
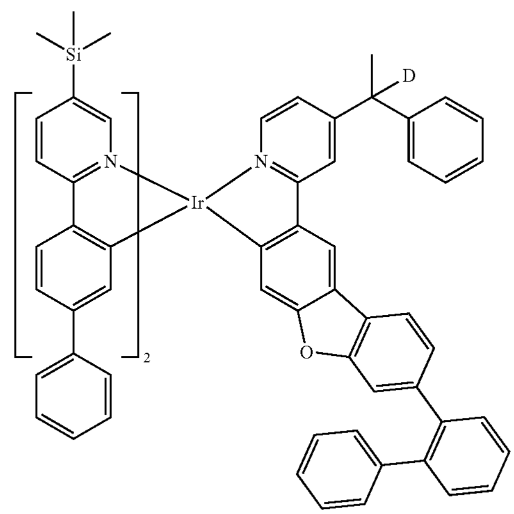
2651
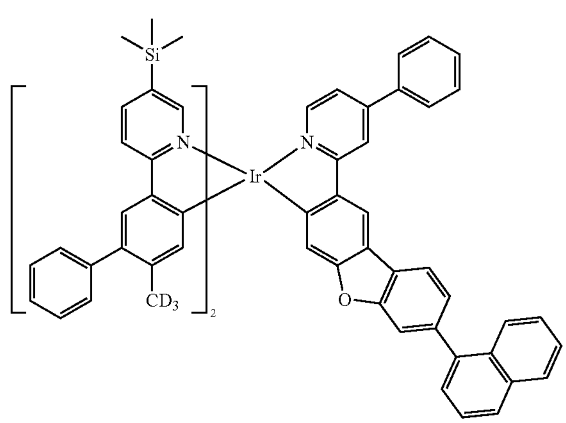

-continued
2652
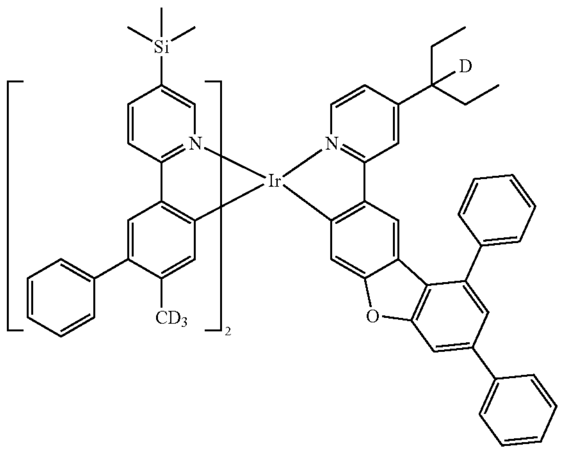
2653
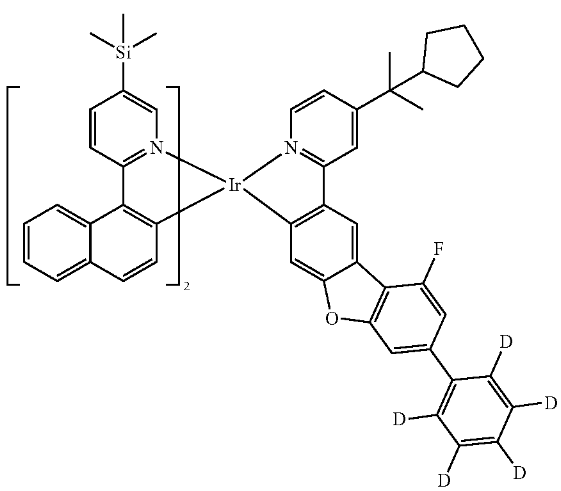
2654
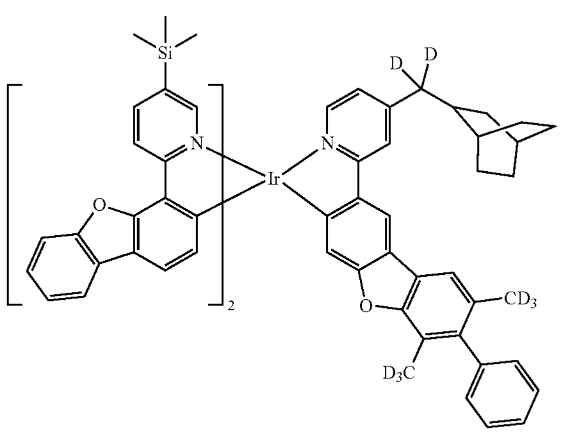
-continued
2655
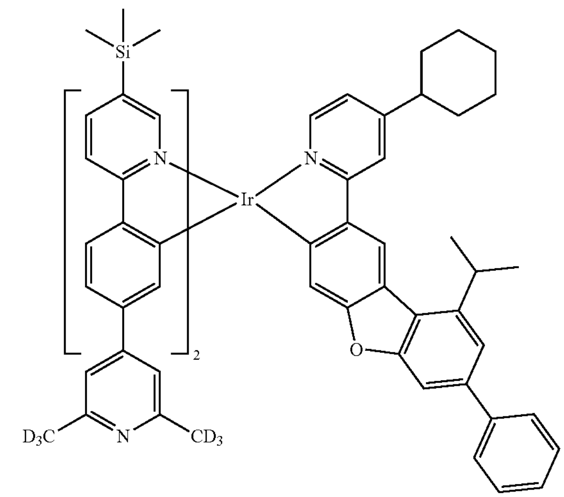
2656
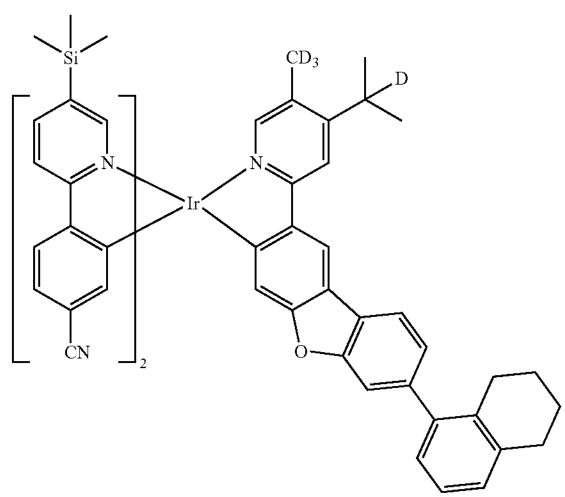
2657
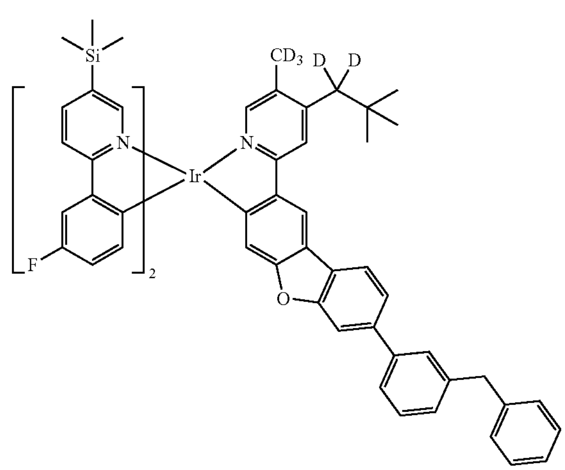

-continued
2658
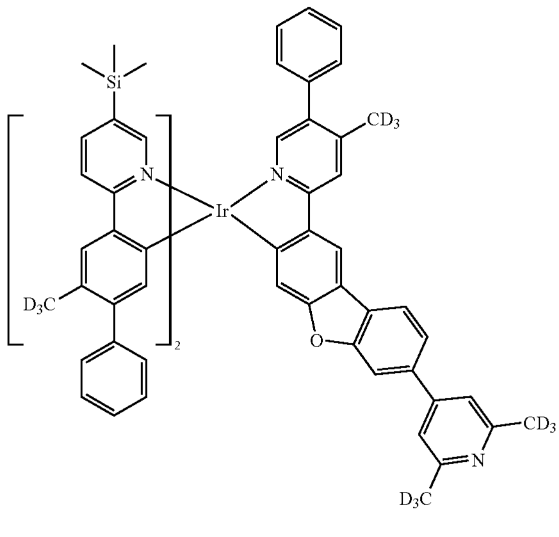
2659
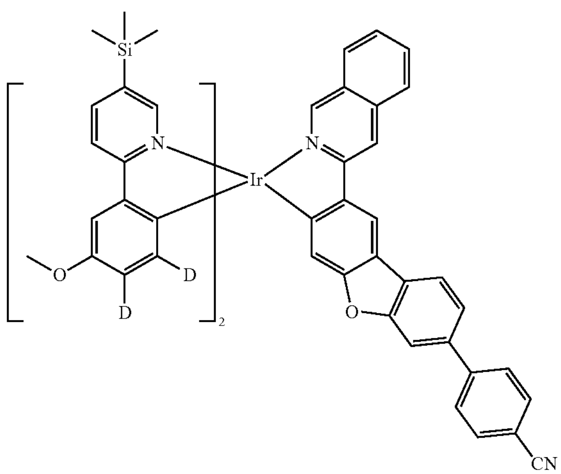
2660
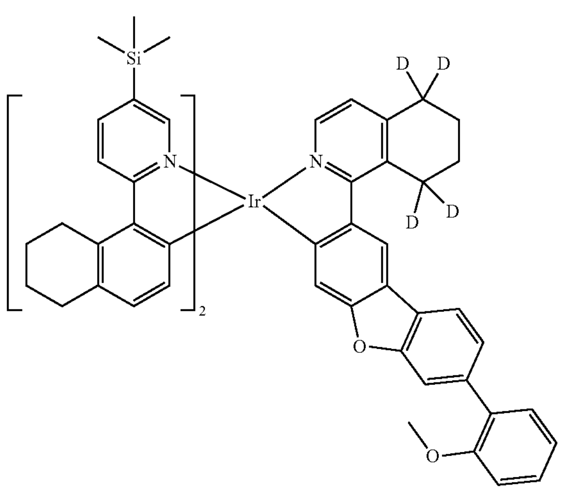
-continued
2661
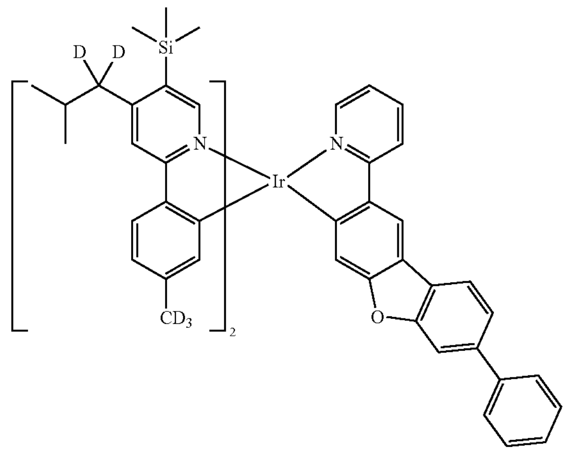
2662
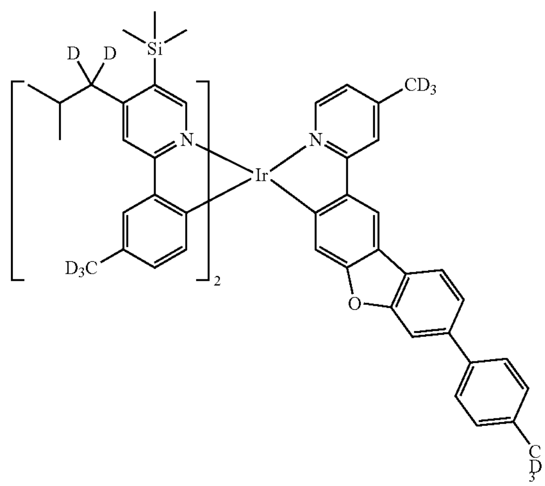
2663
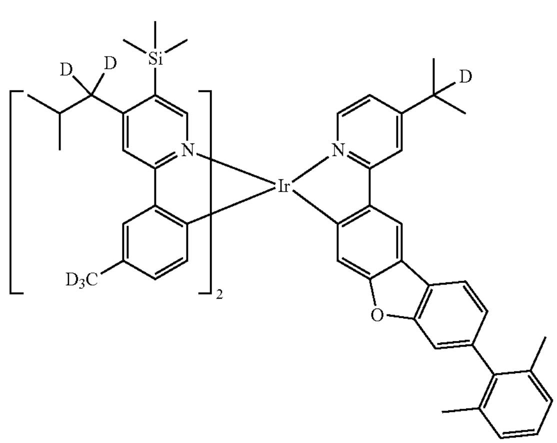

-continued
2664
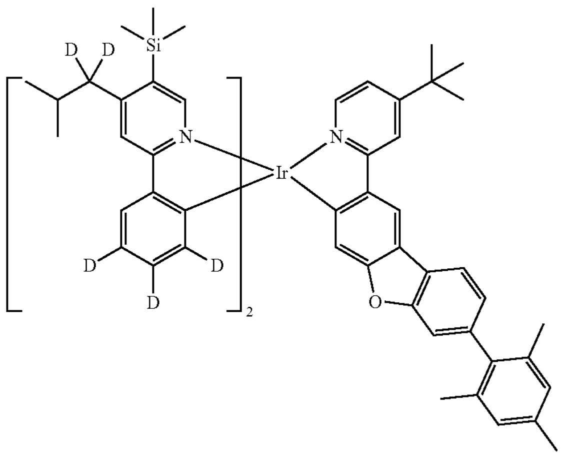
2665
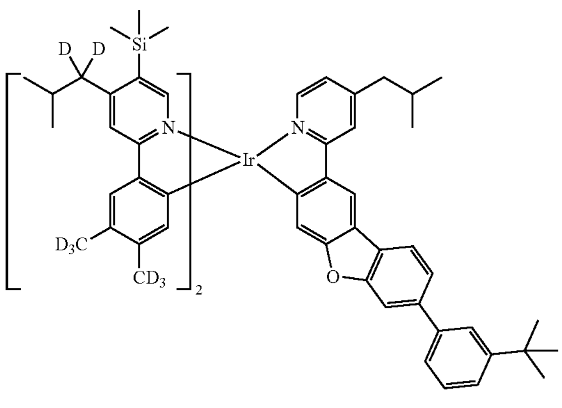
2666
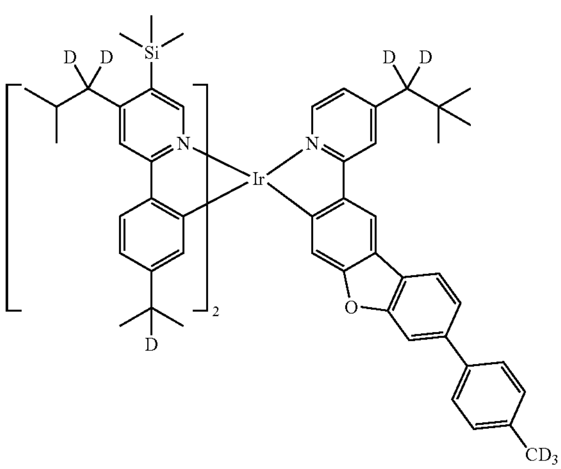
-continued
2667
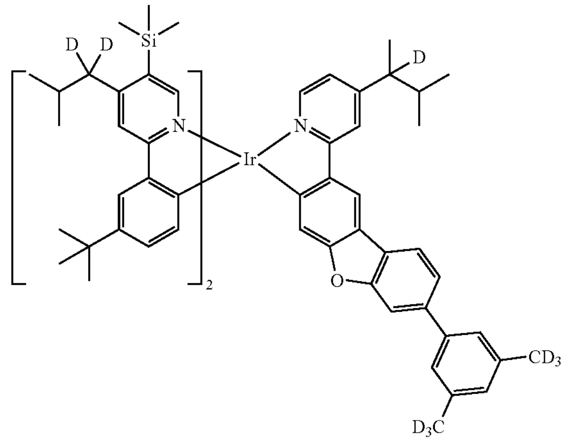
2668
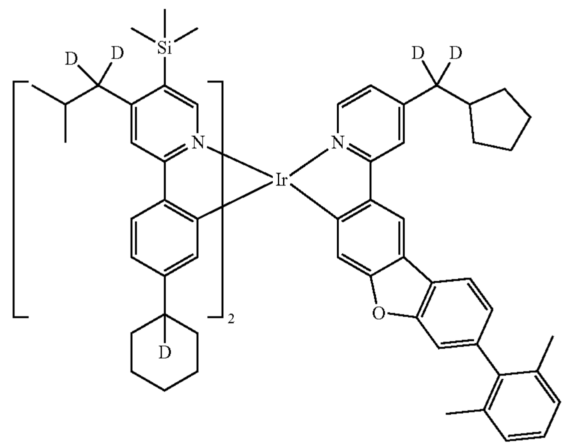
2669
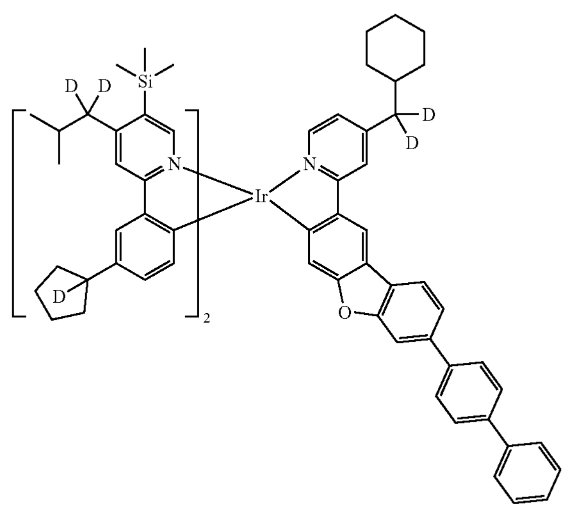

-continued
2670
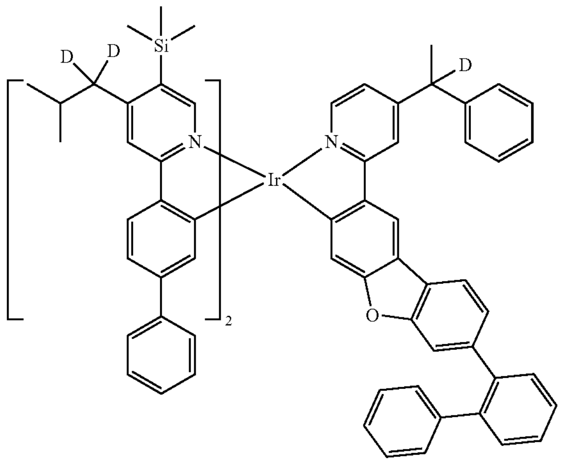
2671
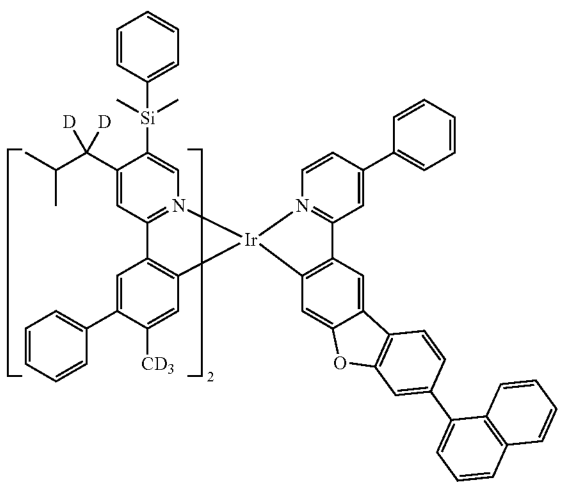
2672
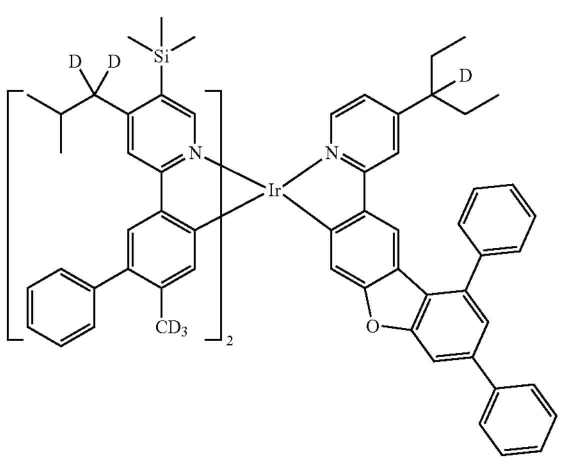
-continued
2673
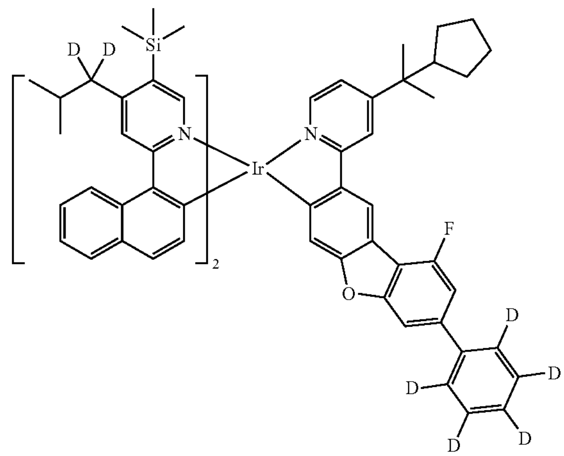
2674
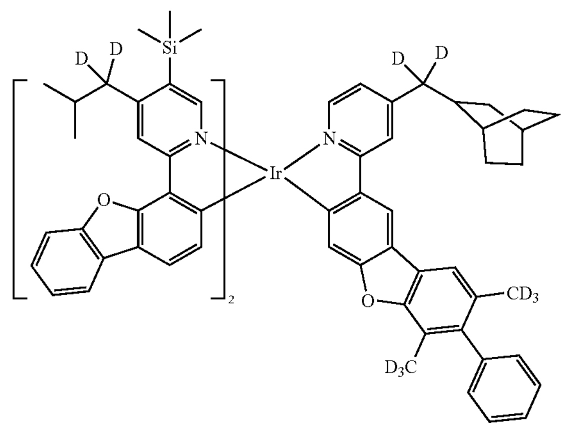
2675
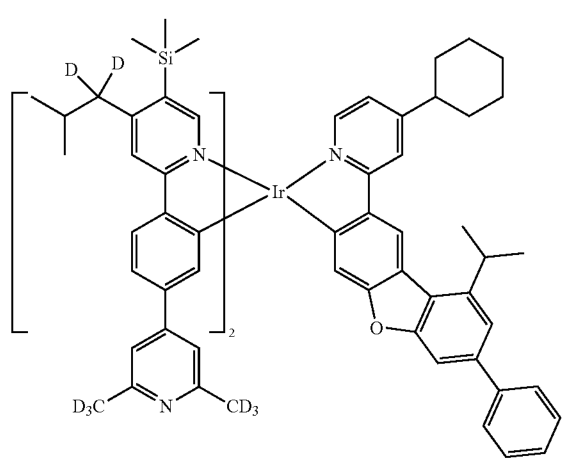

2676
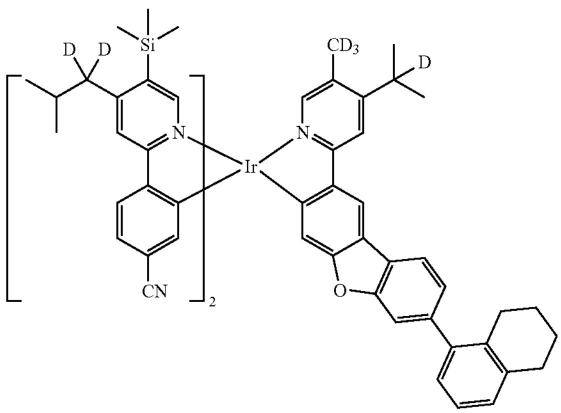
2677
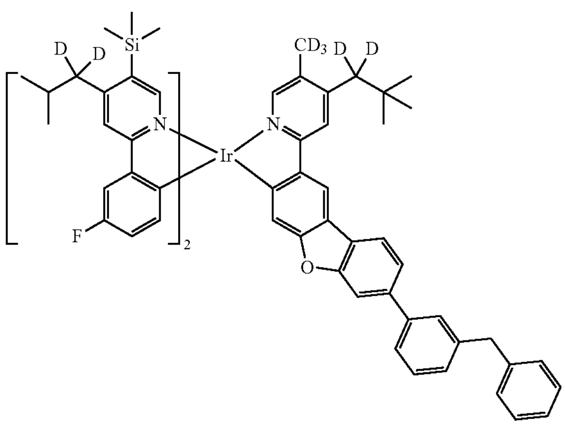
2678
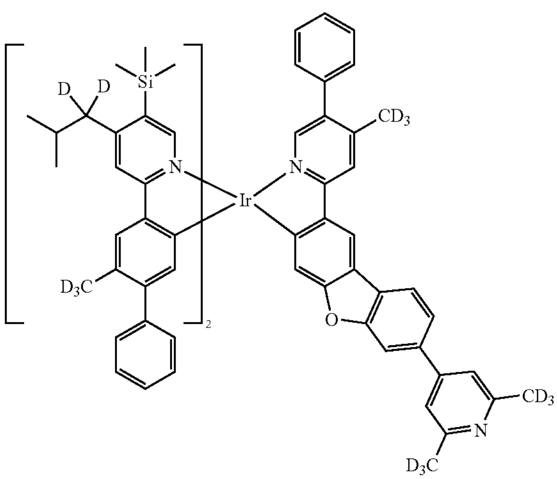
2679
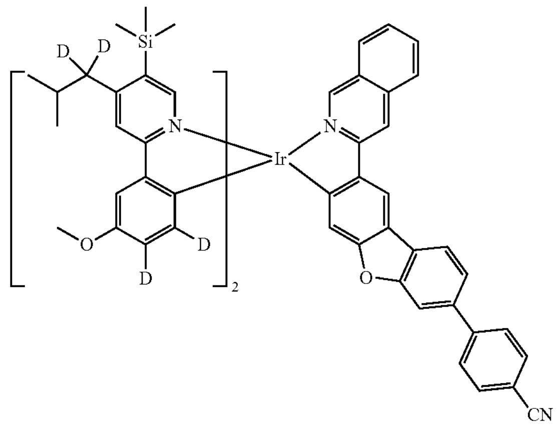
2680
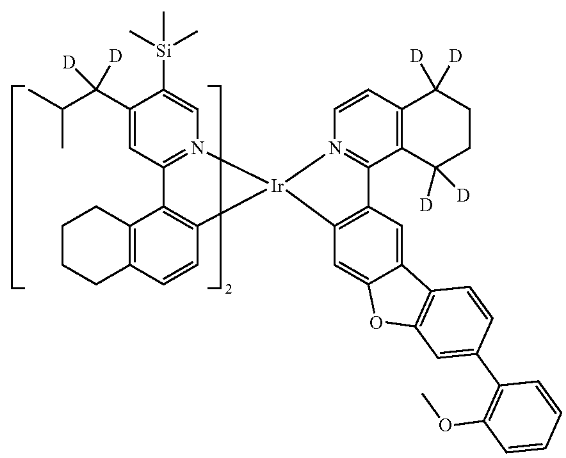
2681
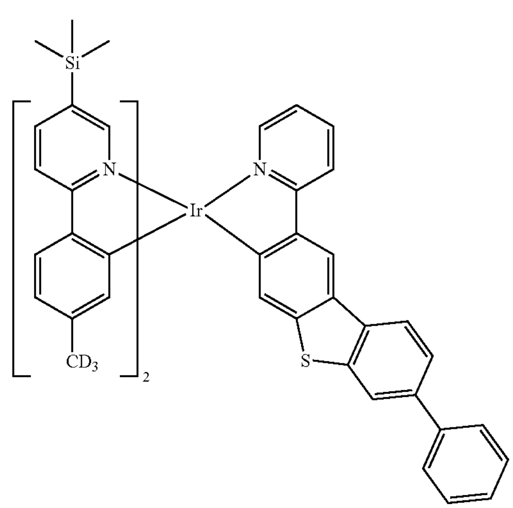

-continued
2682
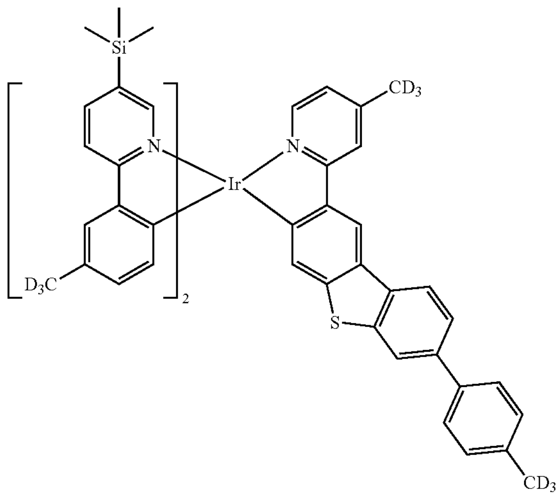
2683
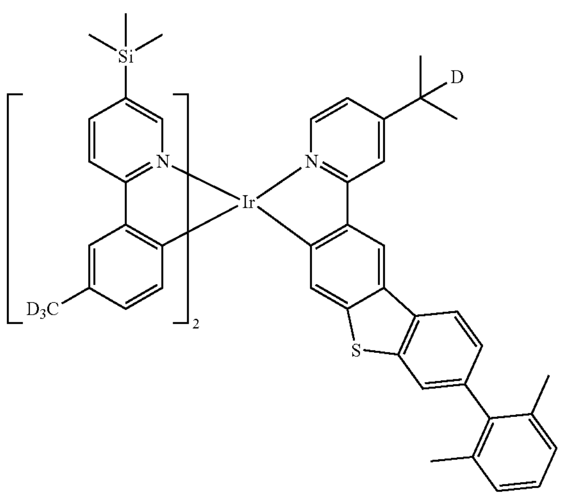
2684
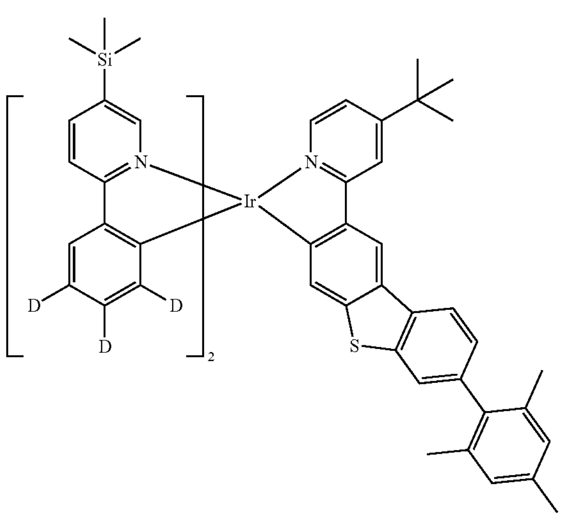
-continued
2685
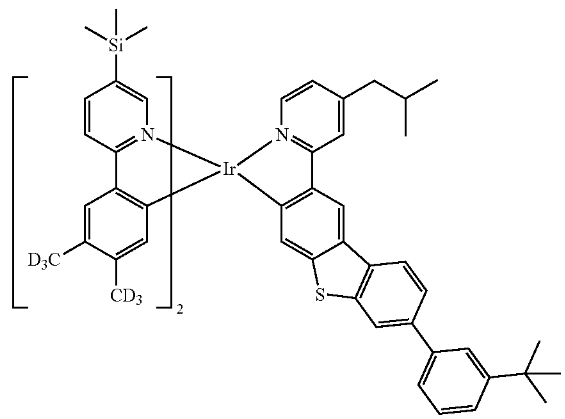
2686
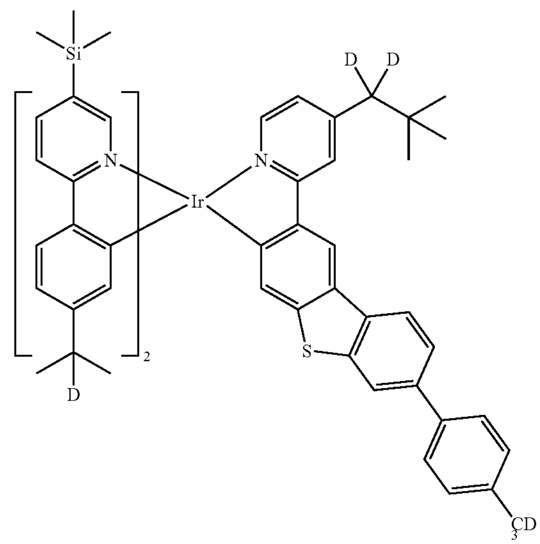
2687
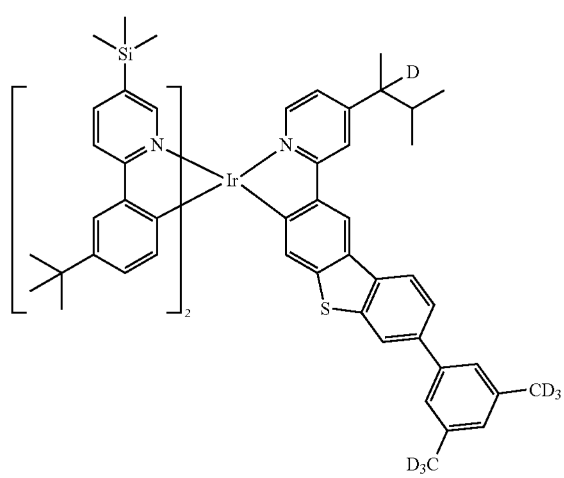

-continued
2688
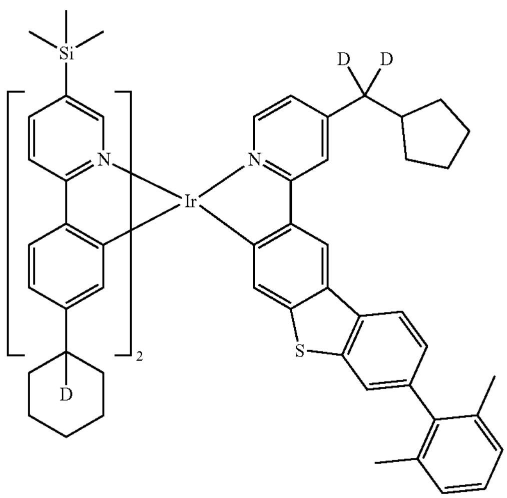
2689
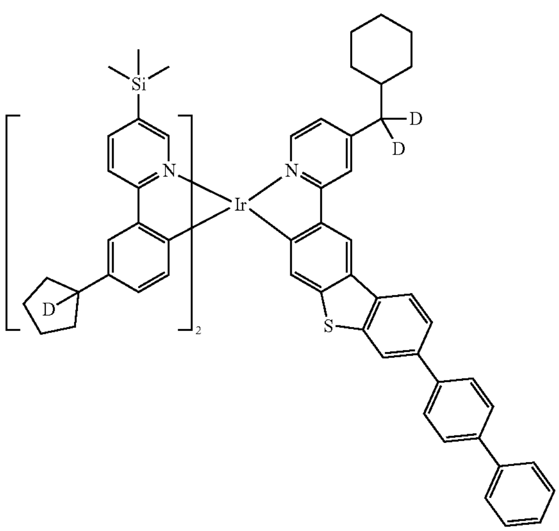
2690
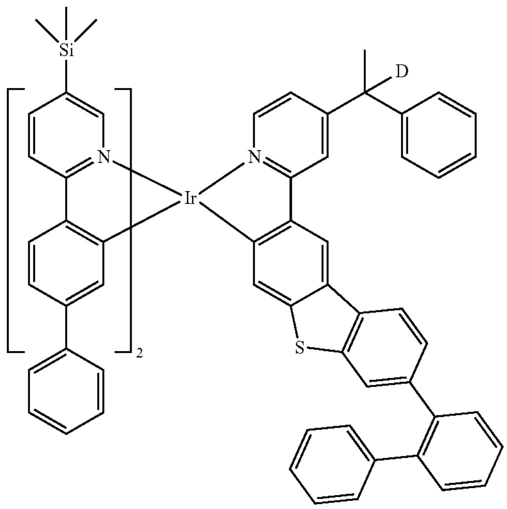
-continued
2691
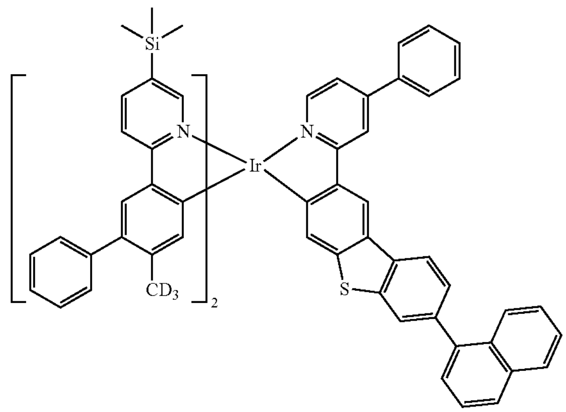
2692
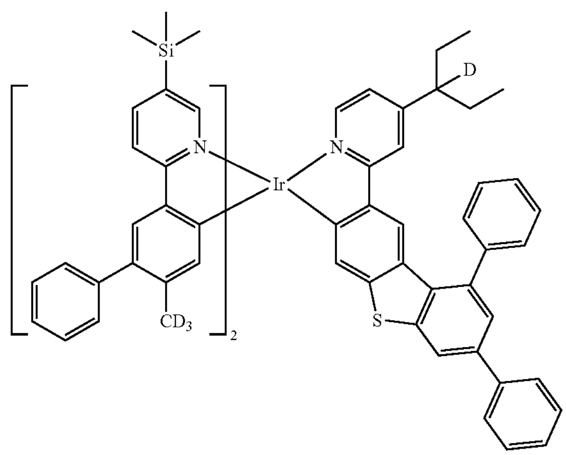
2693
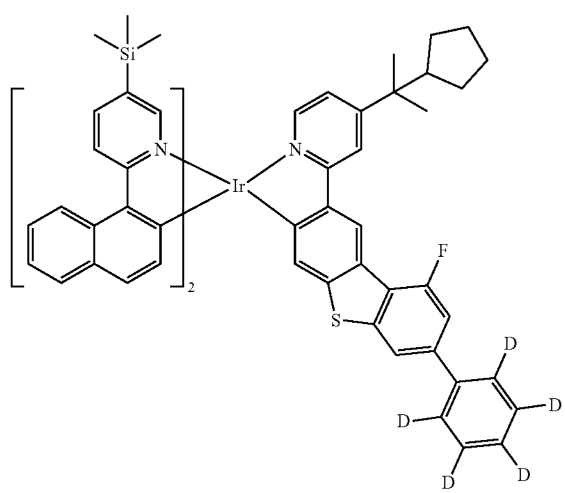

-continued
2694
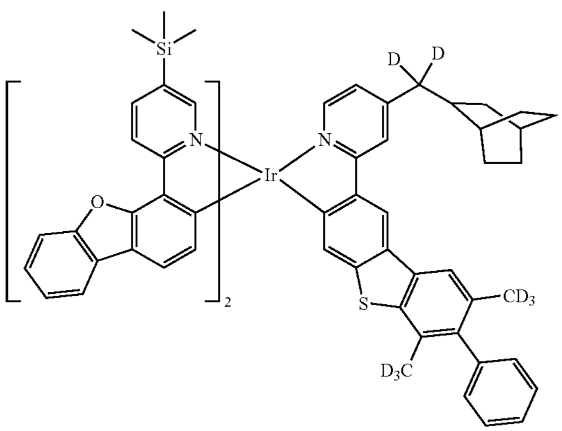
2695
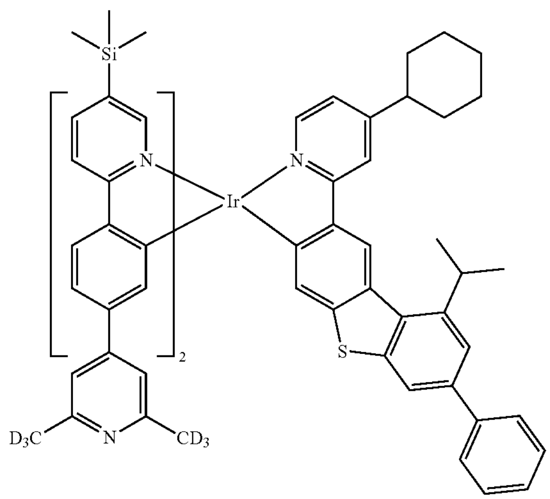
2696
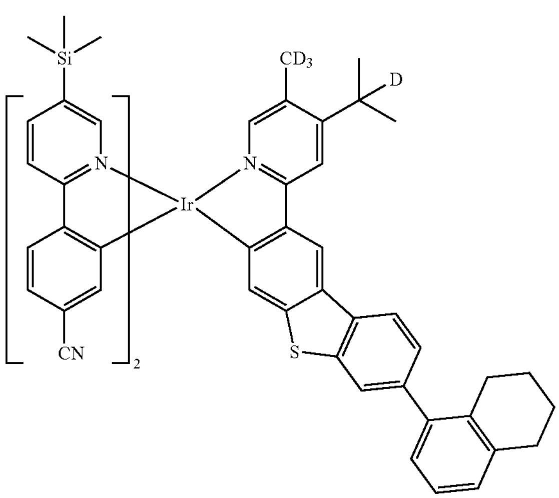
-continued
2697
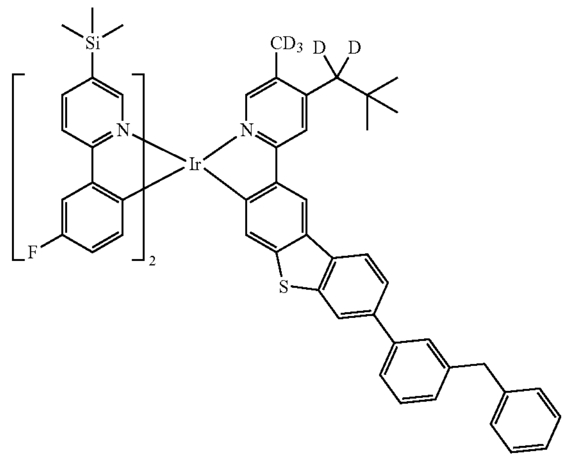
2698
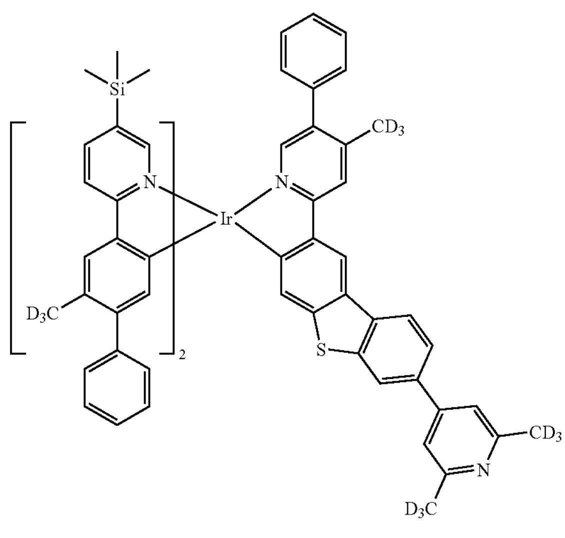
2699
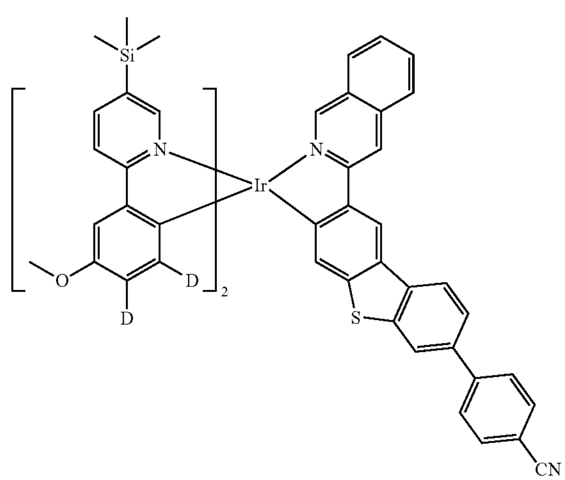

-continued
2700
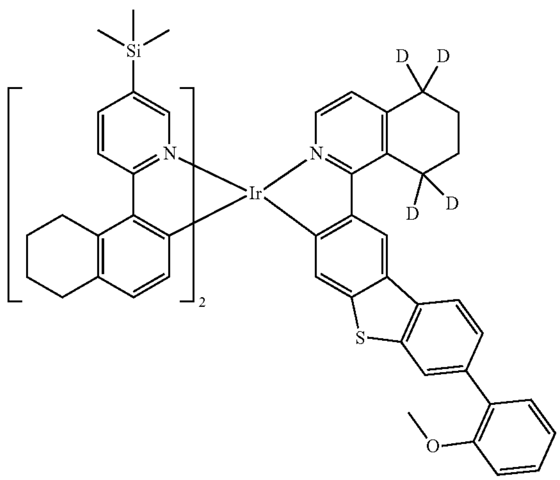
2701
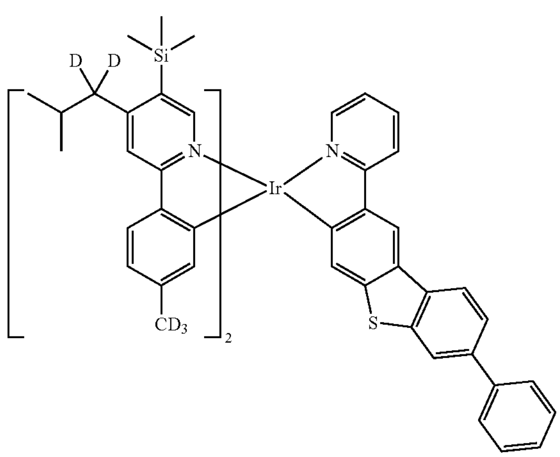
2702
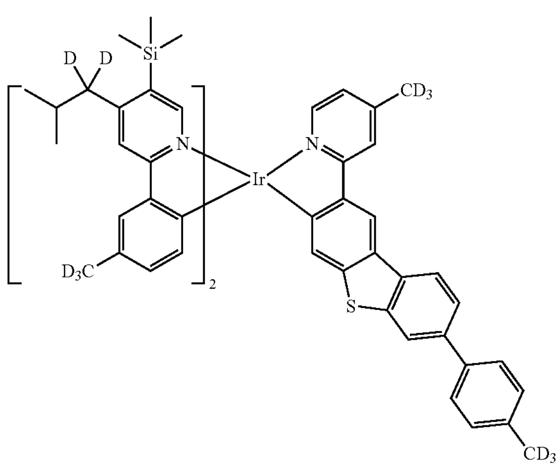
-continued
2703
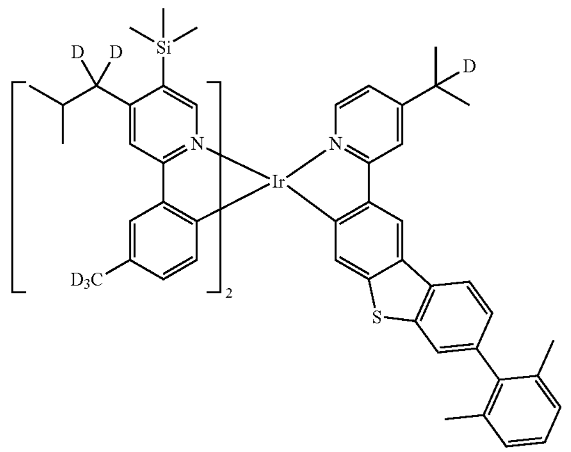
2704
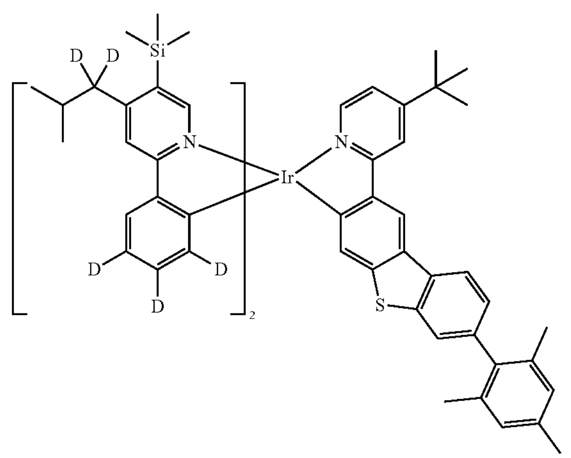
2705
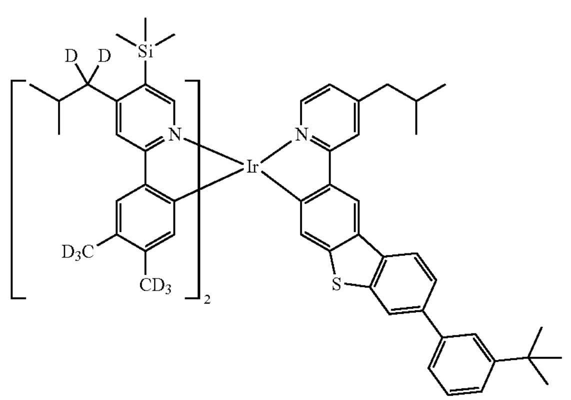

-continued
2706
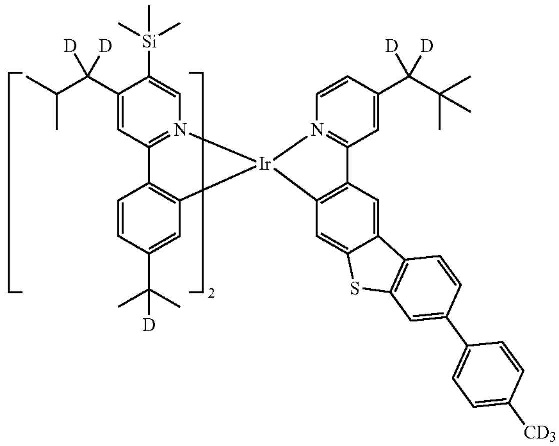
2707
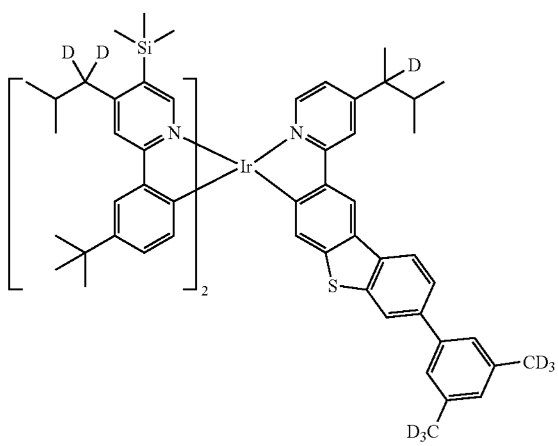
2708
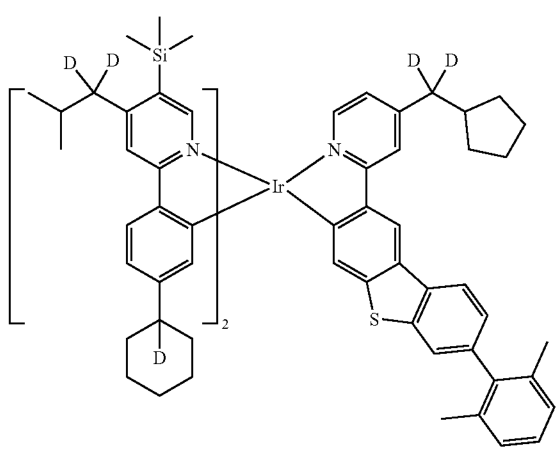
-continued
2709
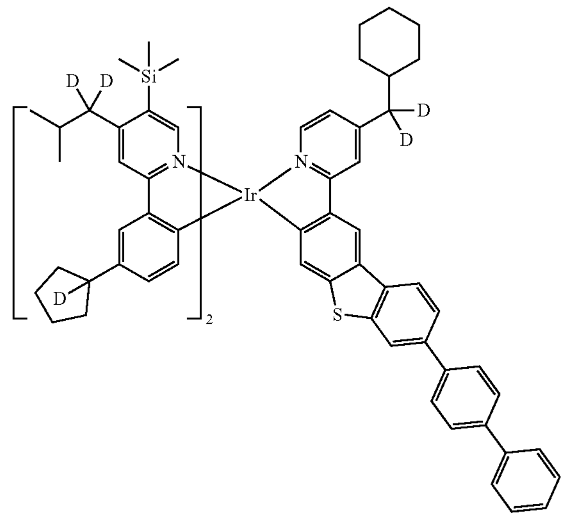
2710
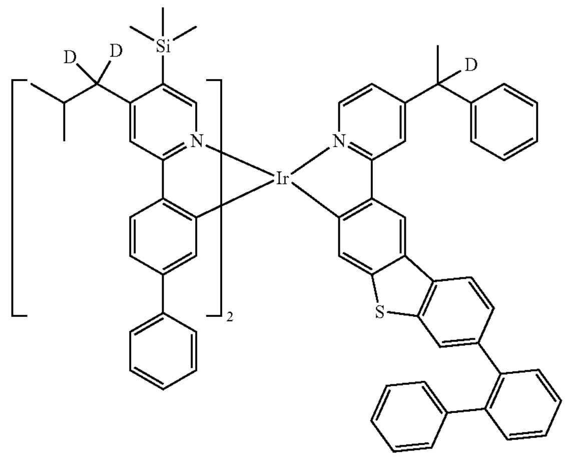
2711
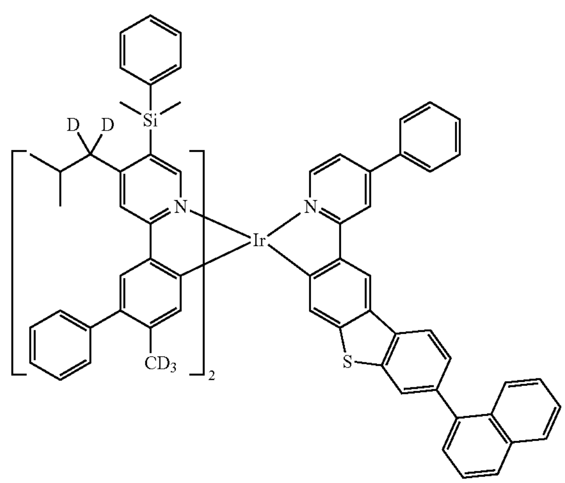

-continued
2712
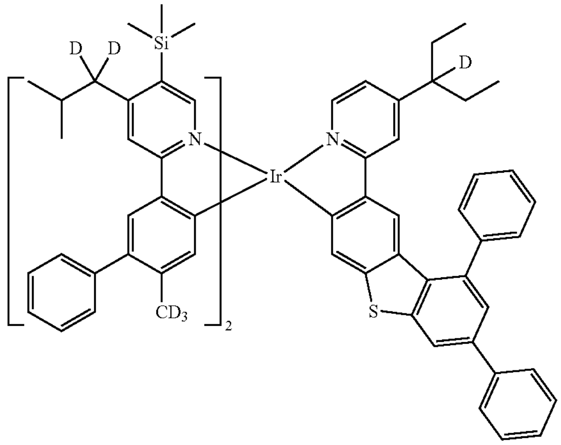
2713
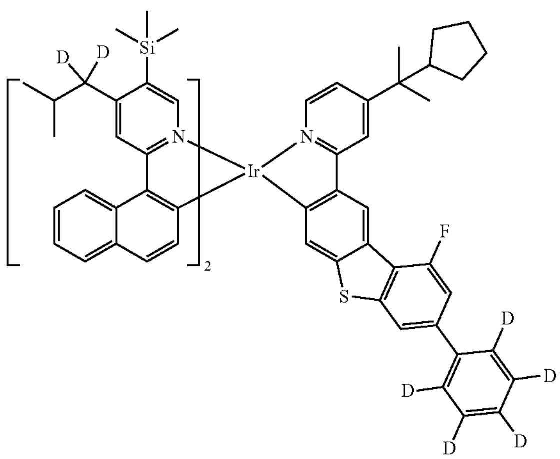
2714
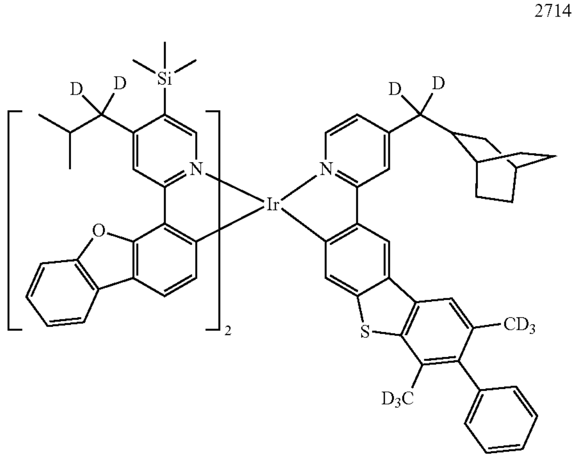
-continued
2715
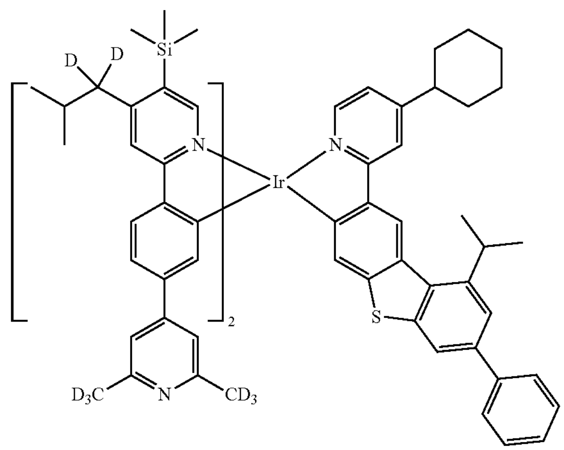
2716
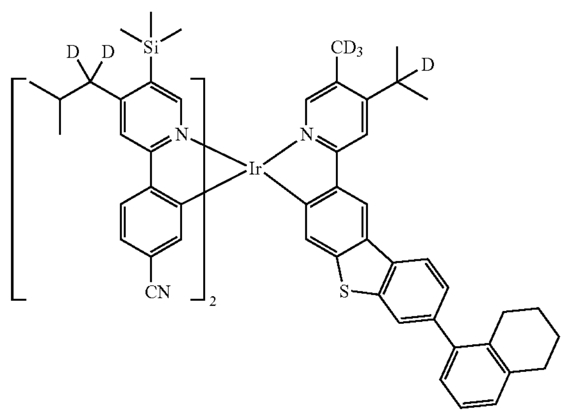
2717
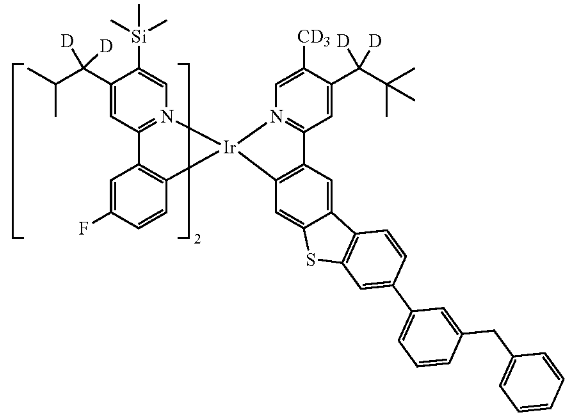

2718
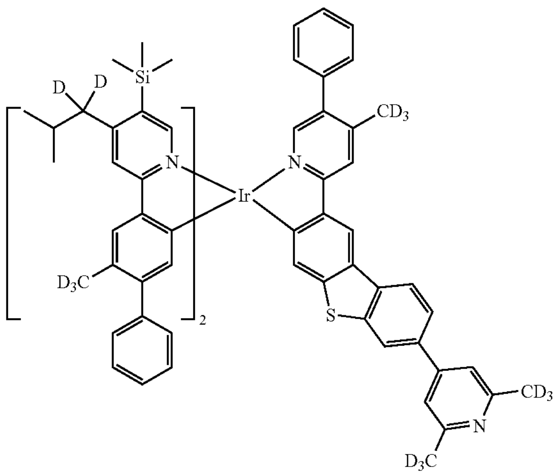
2719
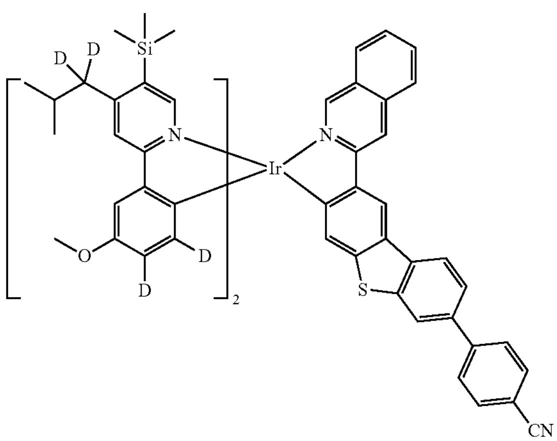
2720
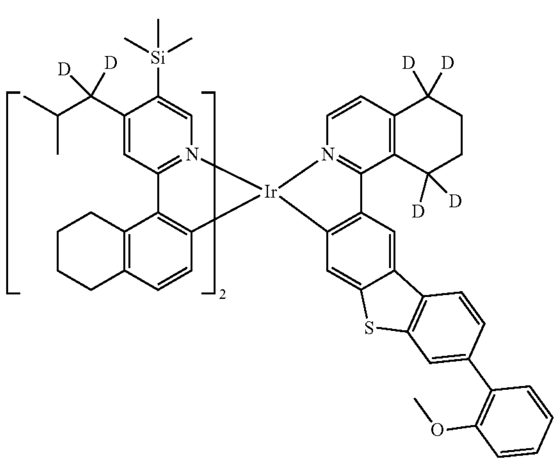
2721
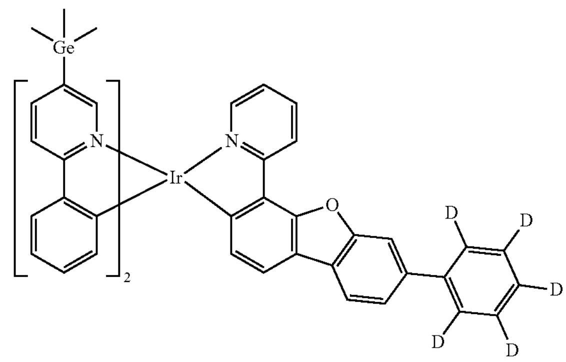
2722
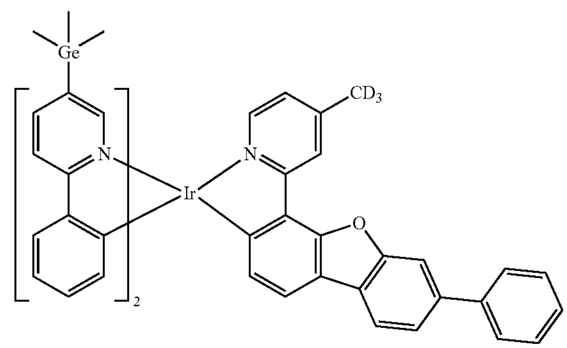
2723
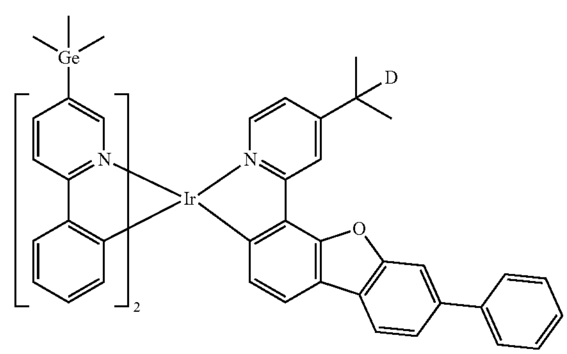
2724
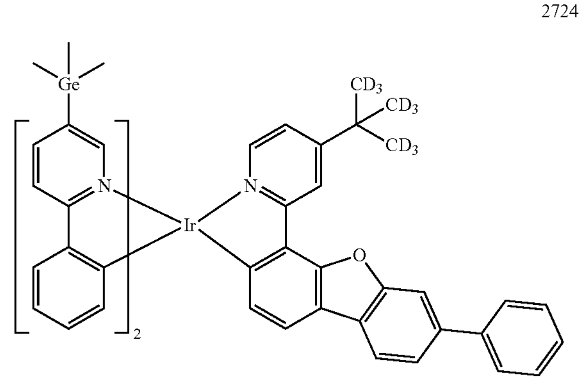

-continued
2725
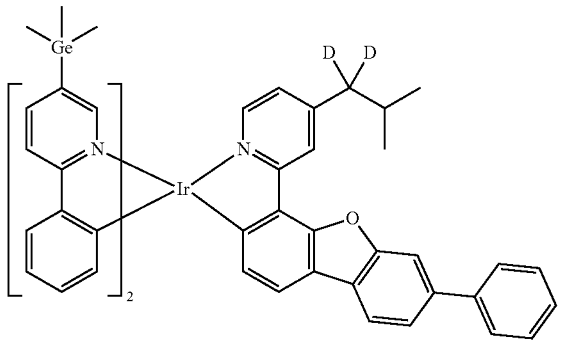
2726
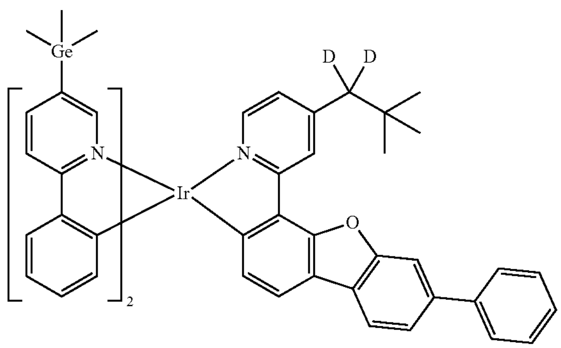
2727
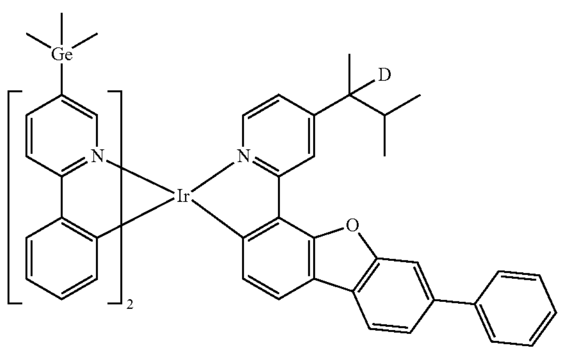
2728
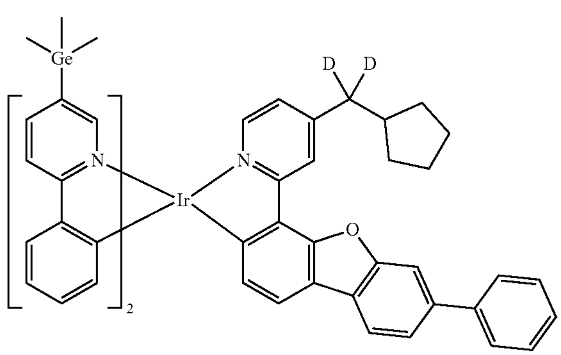
-continued
2729
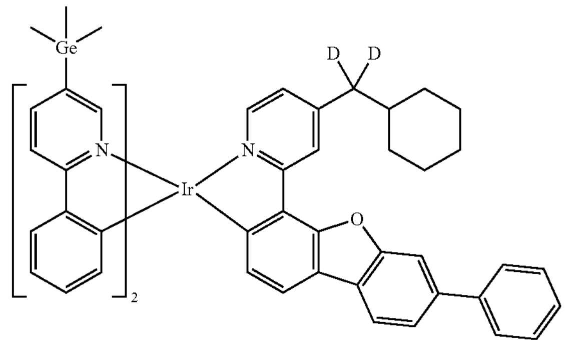
2730
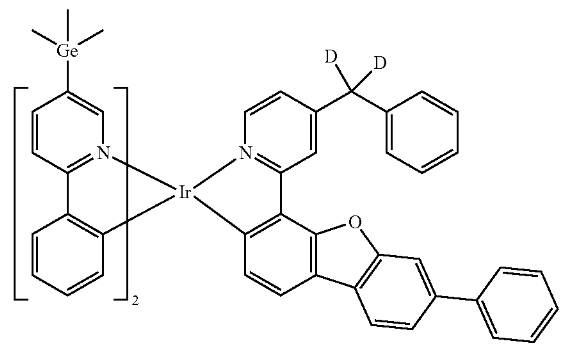
2731
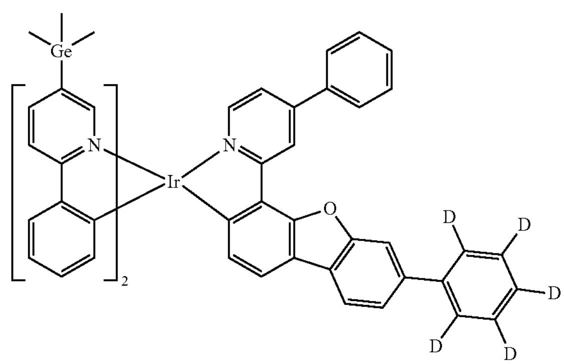
2732
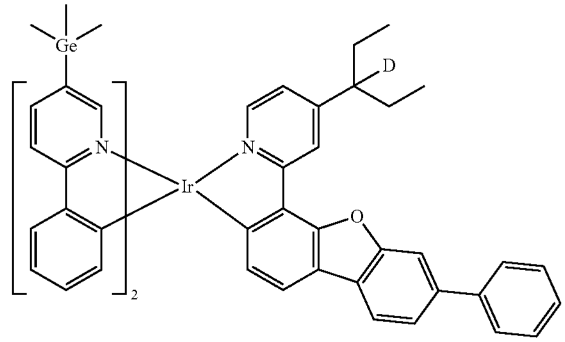

-continued
2733
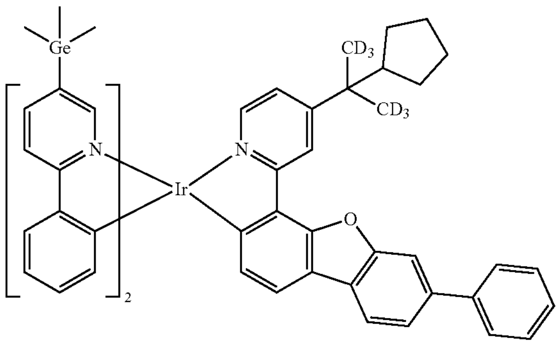
2734
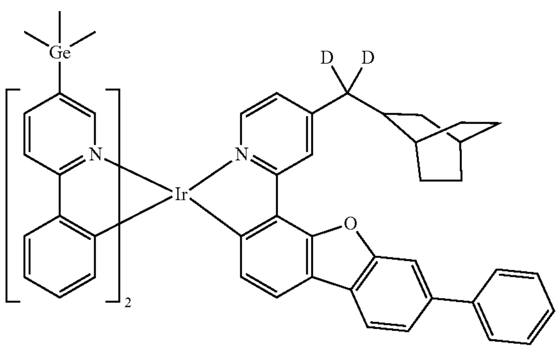
2735
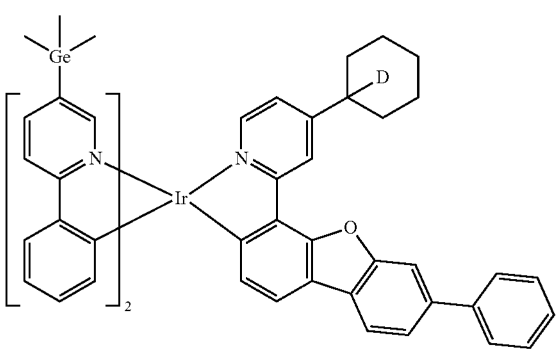
2736
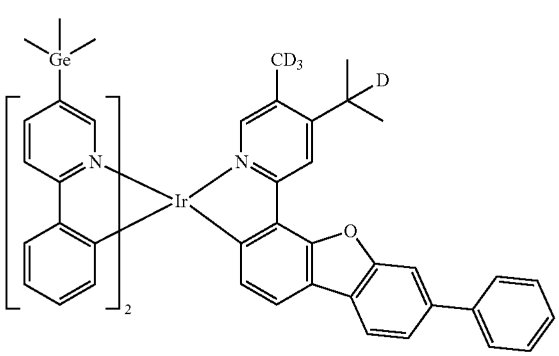
-continued
2737
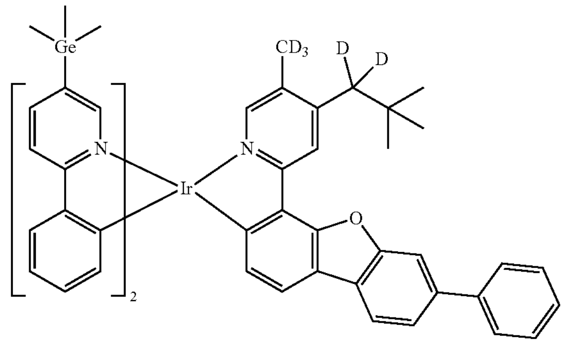
2738
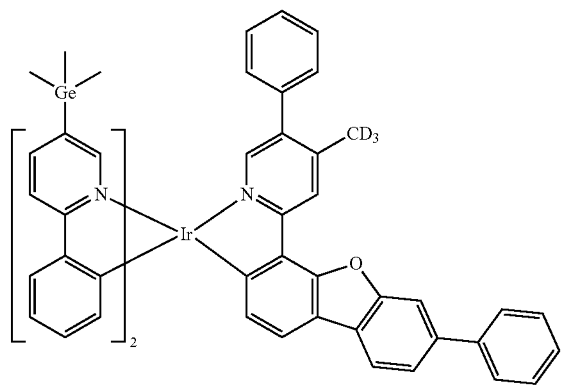
2739
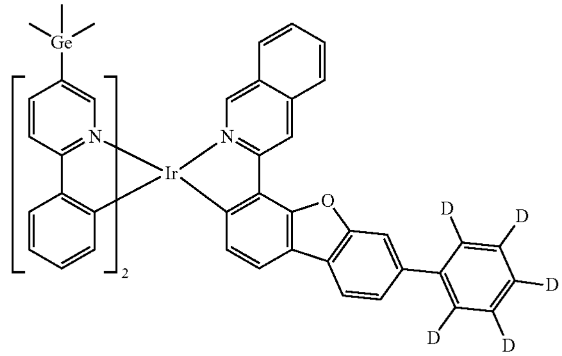
2740
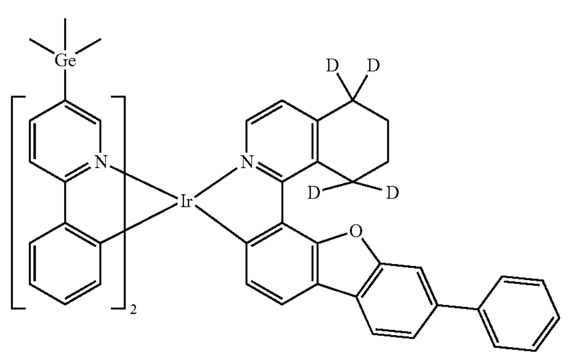

2741
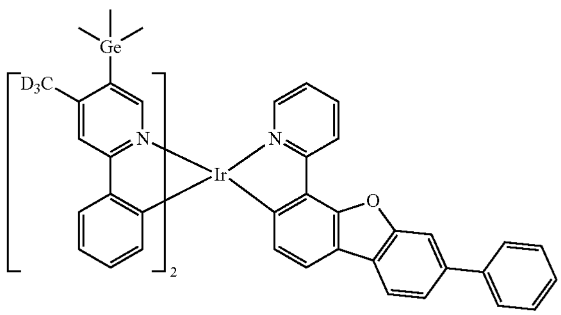
2742
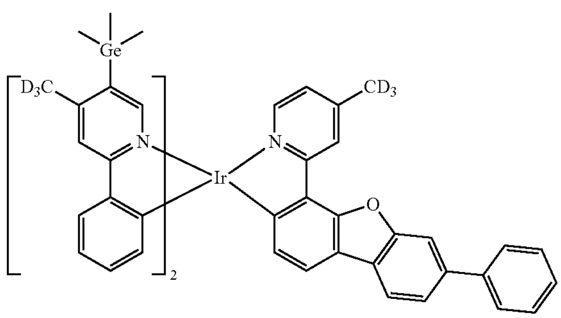
2743
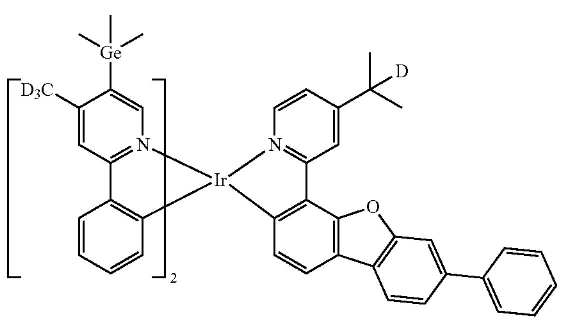
2744
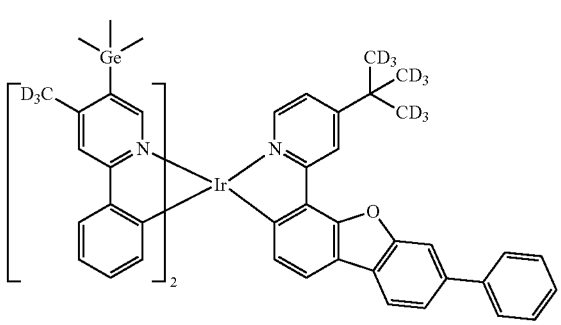
2745
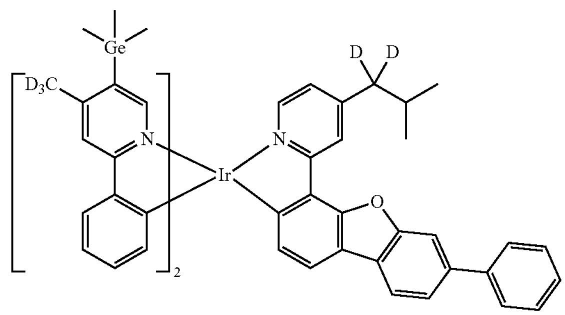
2746
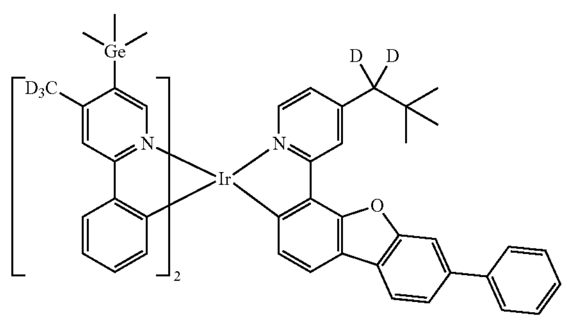
2747
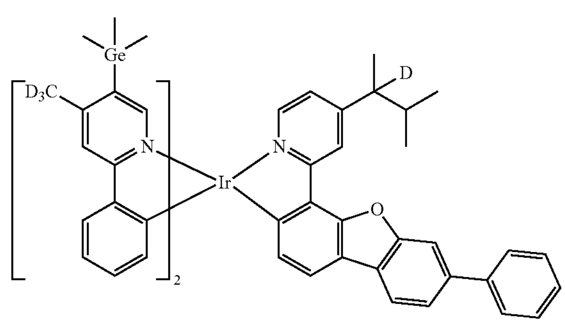
2748
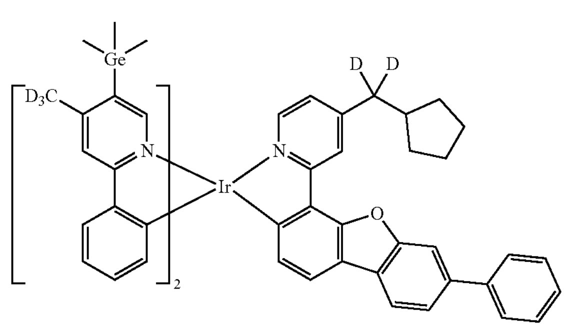

2749
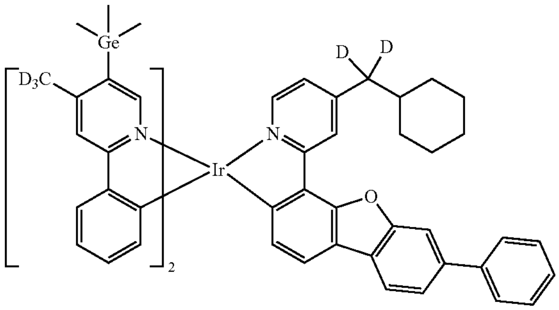
2750
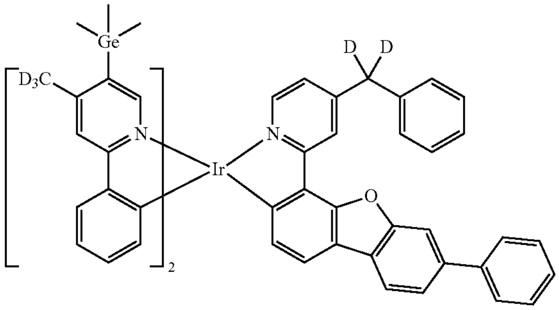
2751
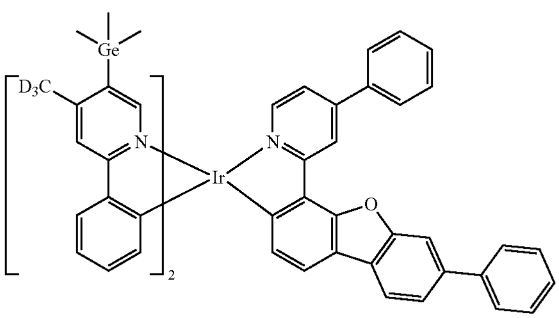
2752
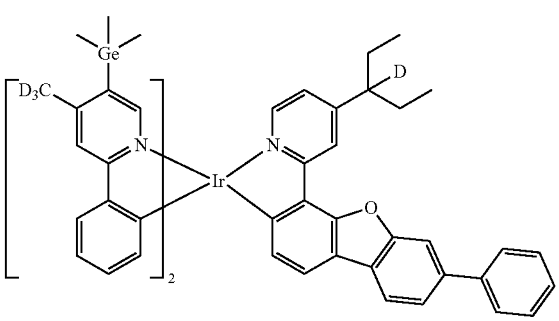
2753
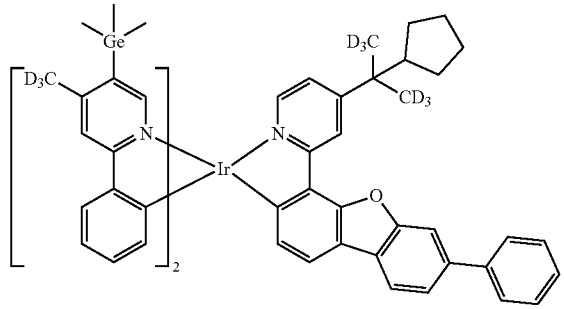
2754
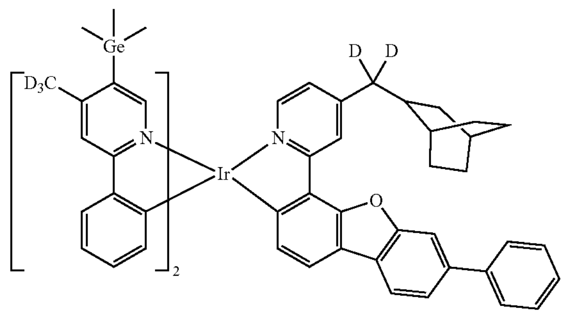
2755
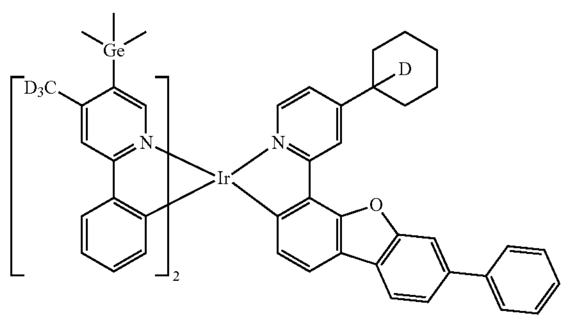
2756
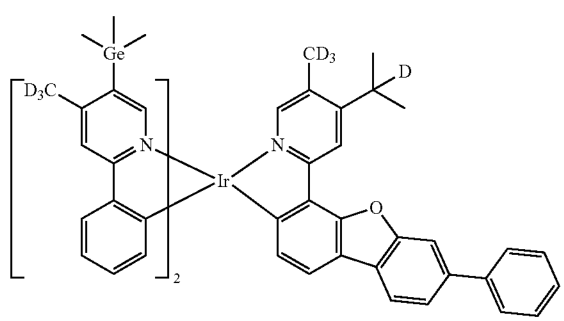

-continued
2757
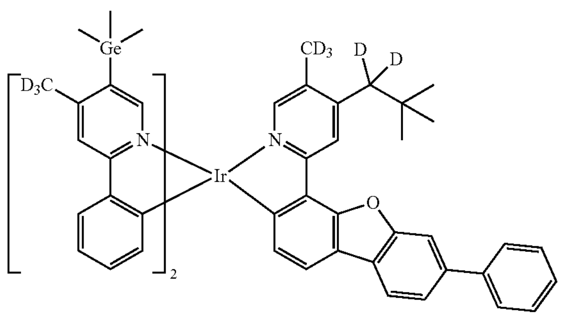
2758
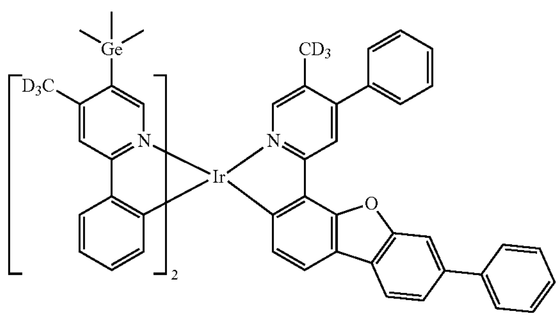
2759
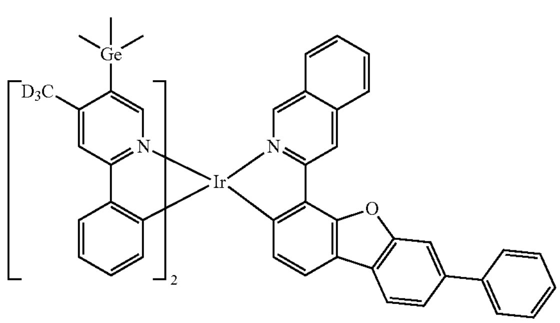
2760
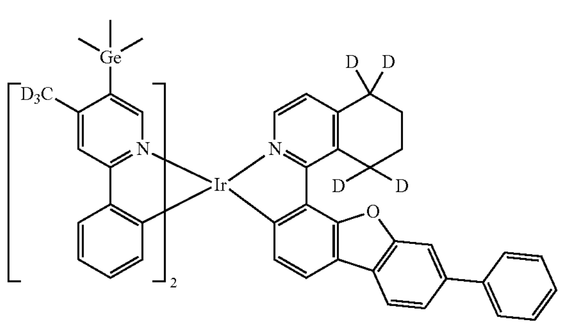
-continued
2761
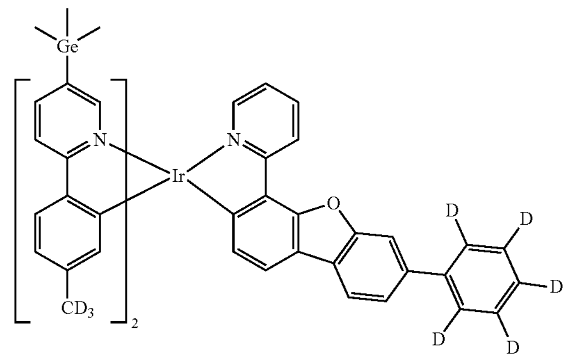
2762
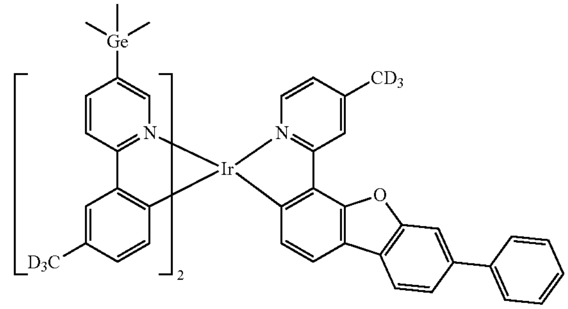
2763
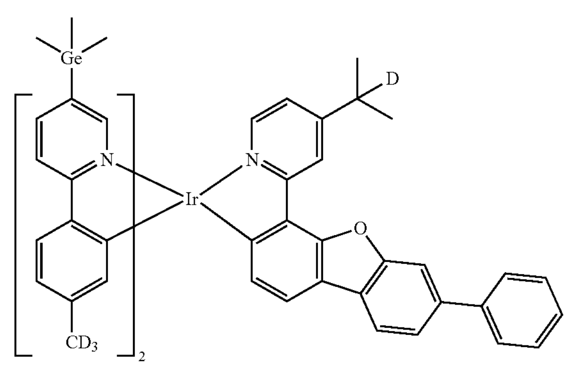
2764
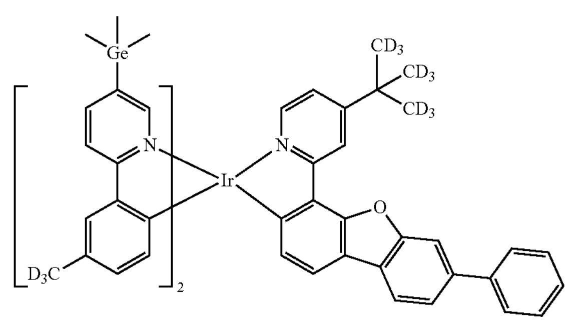

-continued
2765
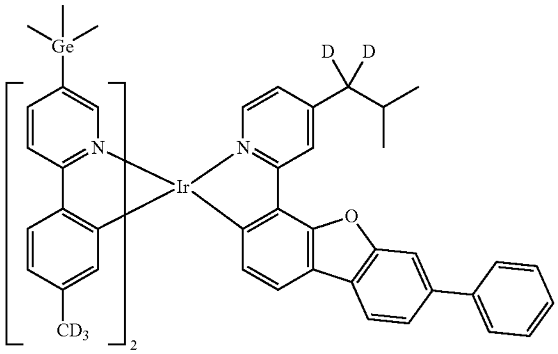
2766
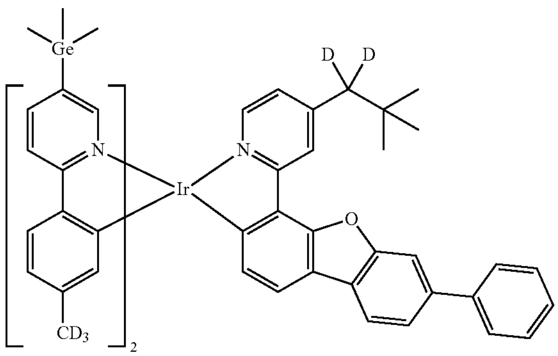
2767
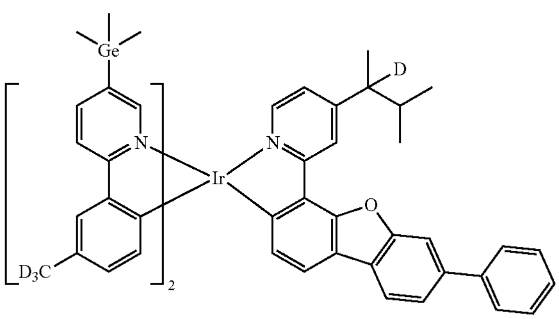
2768
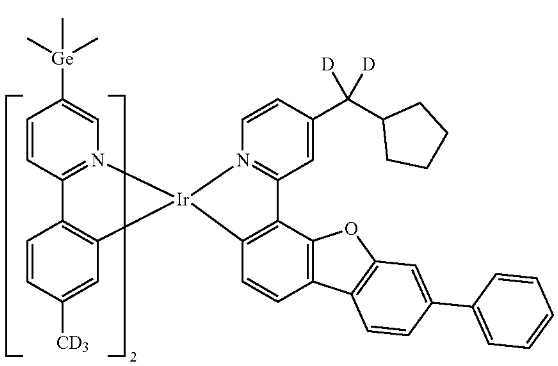
-continued
2769
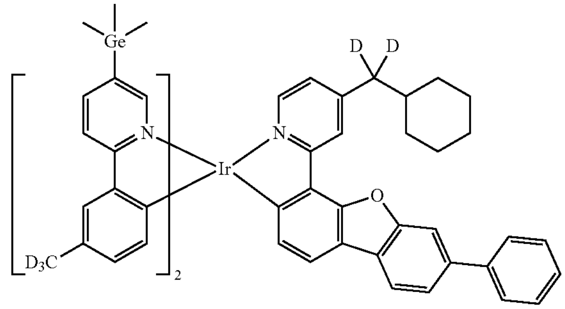
2770
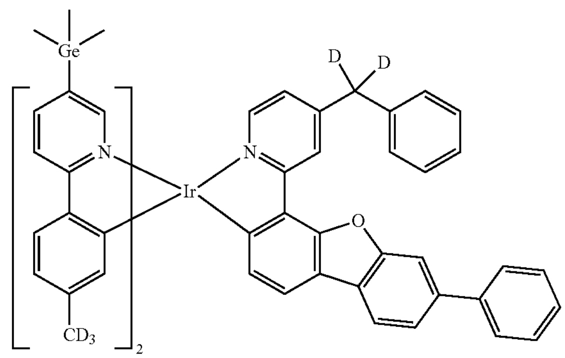
2771
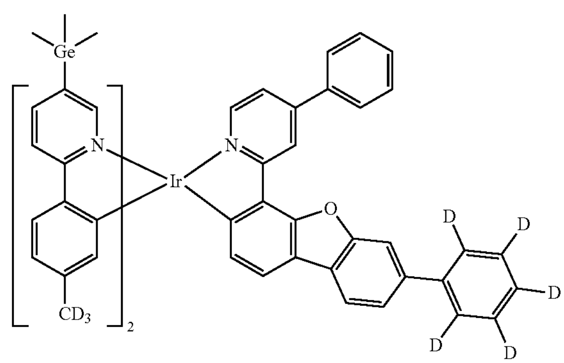
2772
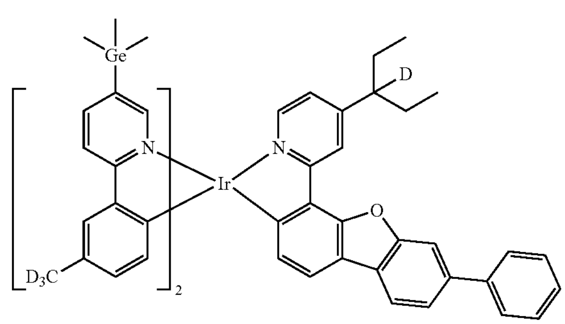

-continued
2773
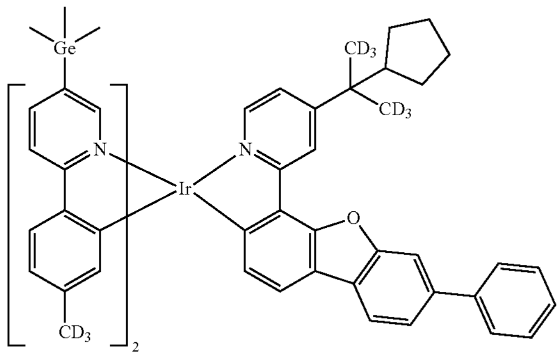
2774
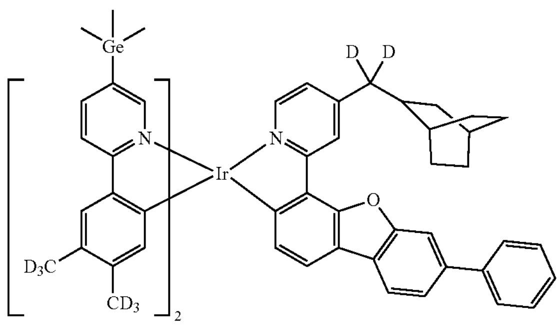
2775
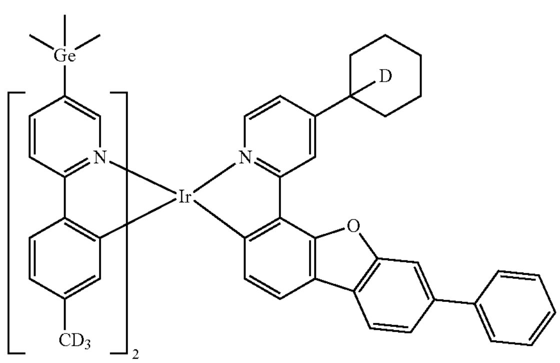
2776
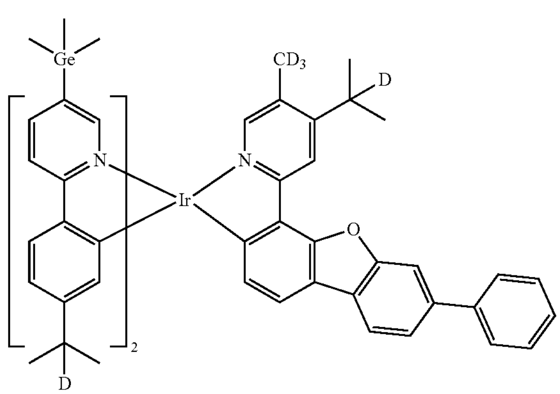
-continued
2777
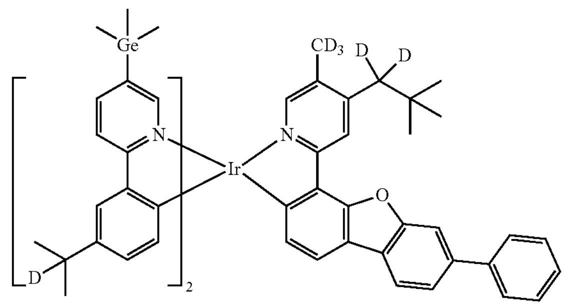
2778
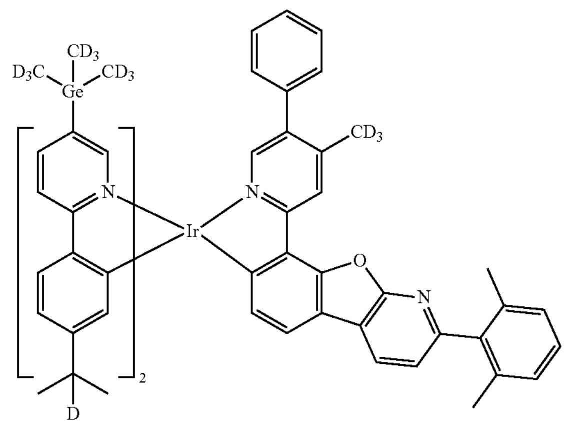
2779
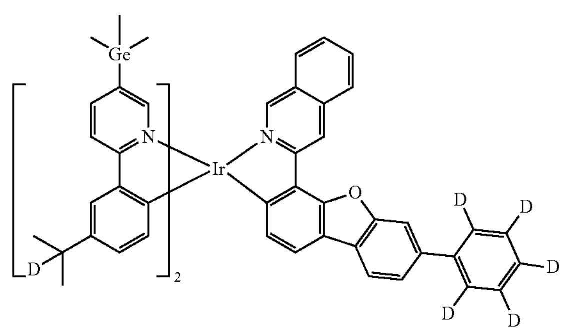
2780
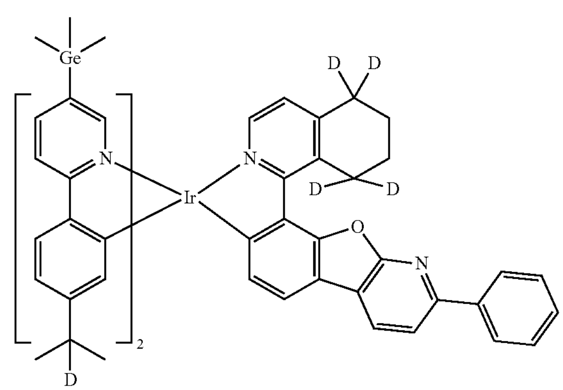

-continued
2781
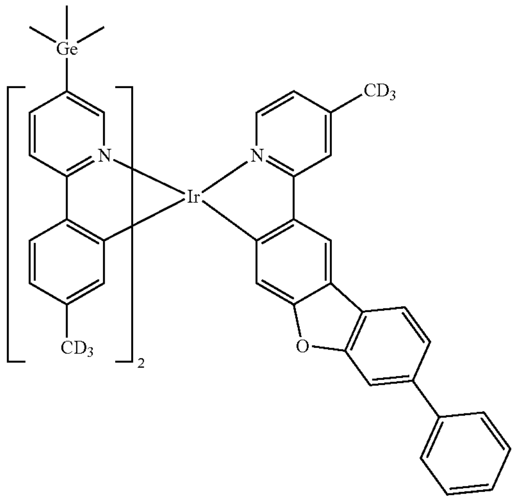
2782
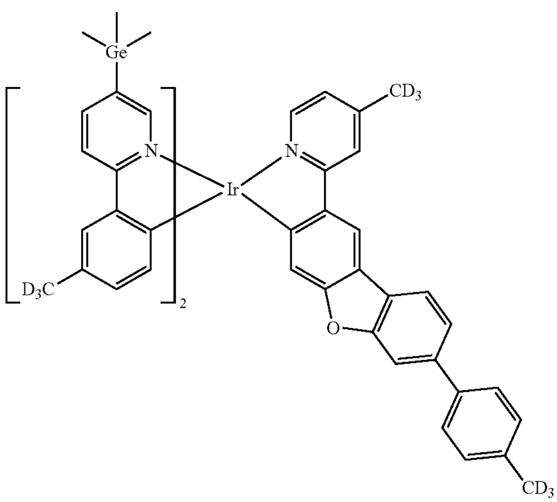
2783
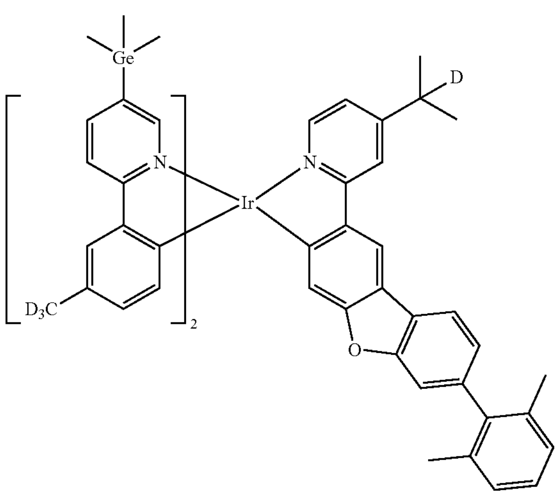
-continued
2784
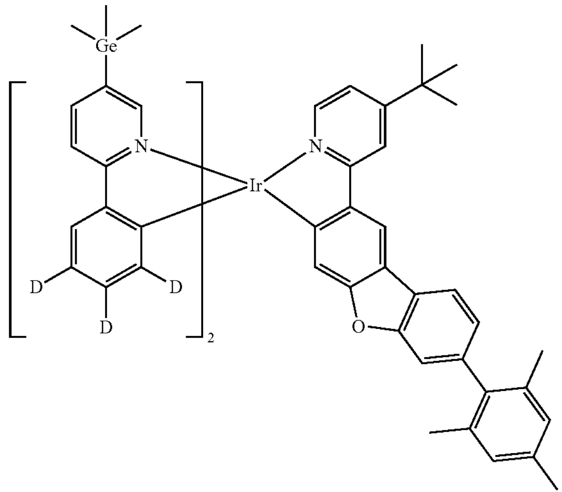
2785
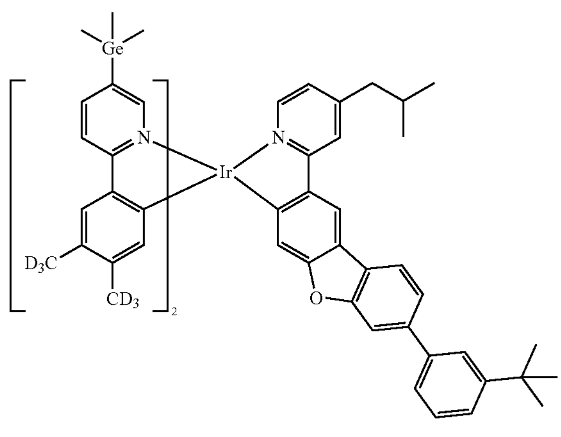
2786
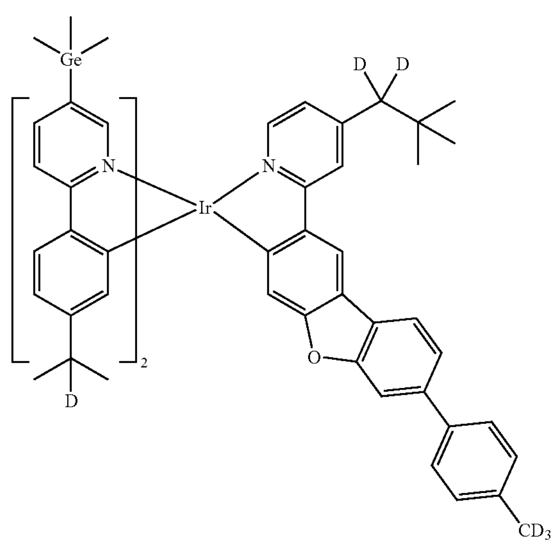

-continued
2787
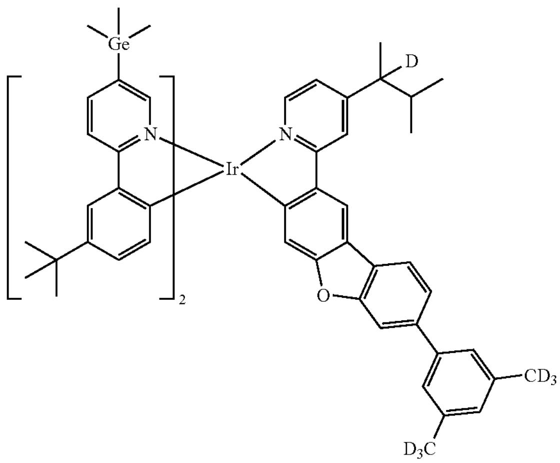
2788
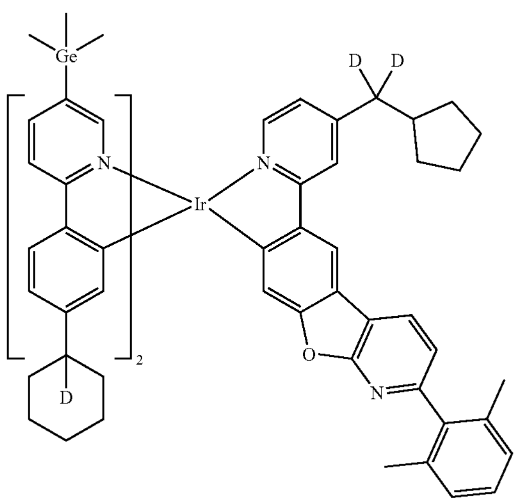
2789
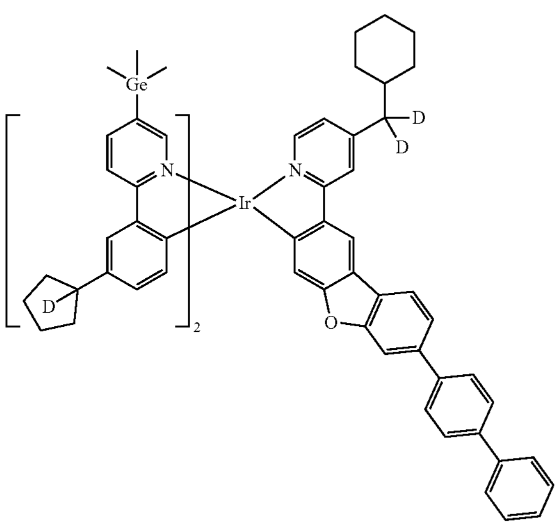
-continued
2790
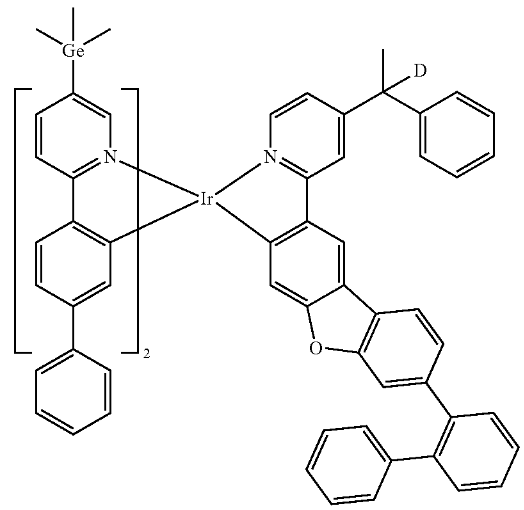
2791
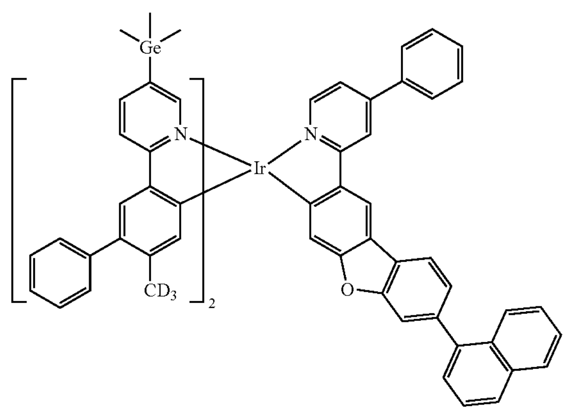
2792
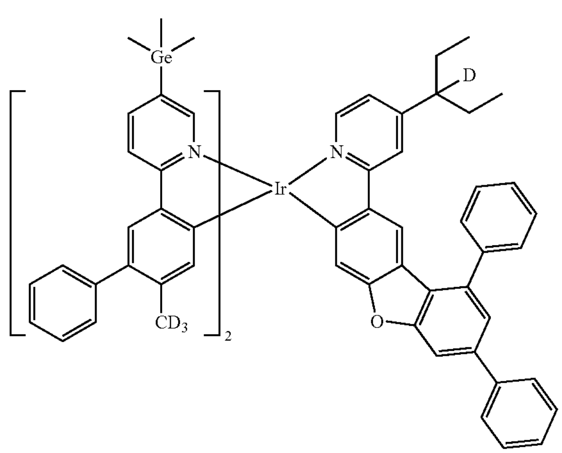

-continued
2793
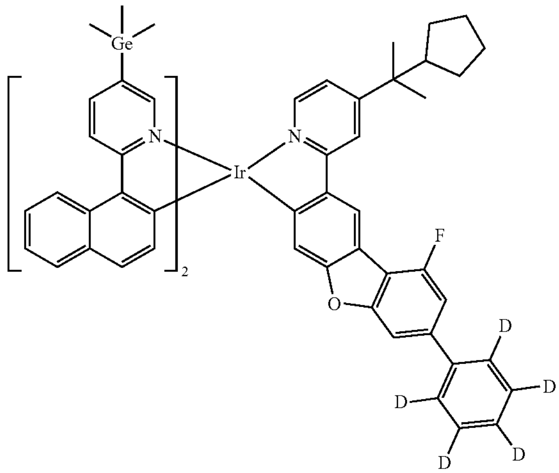
2794
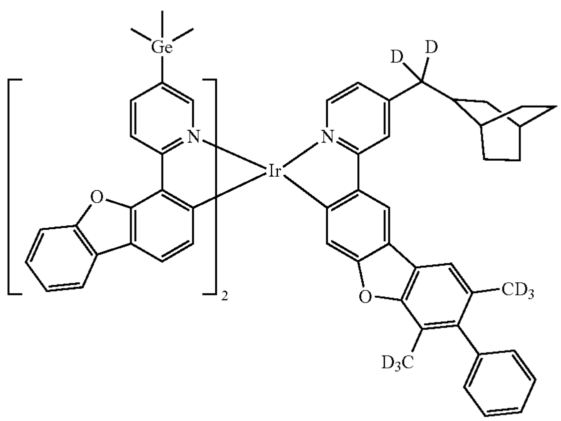
2795
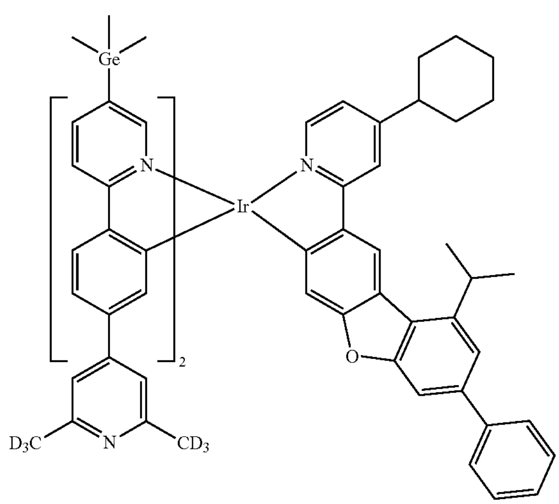
-continued
2796
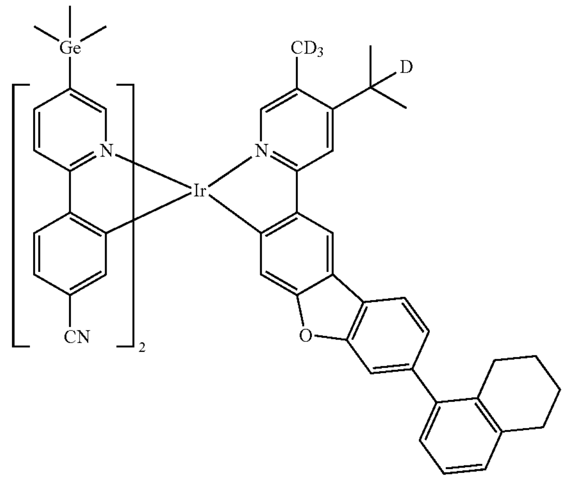
2797
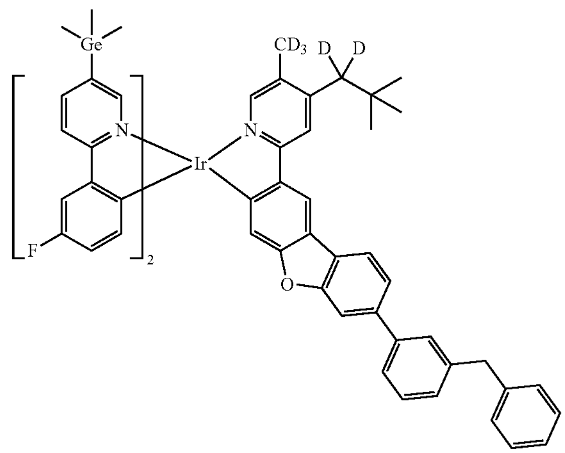
2798
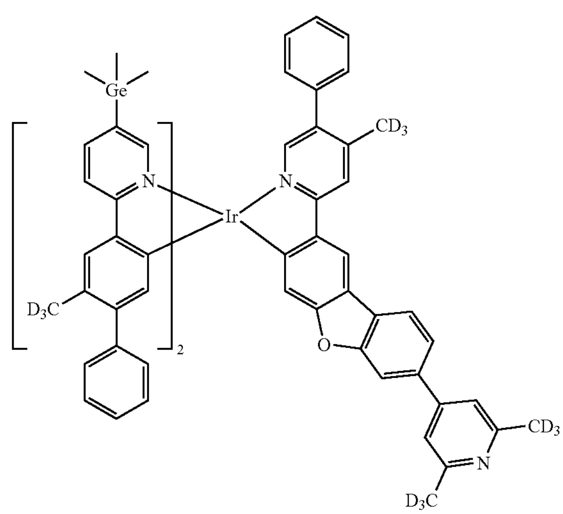

-continued
2799
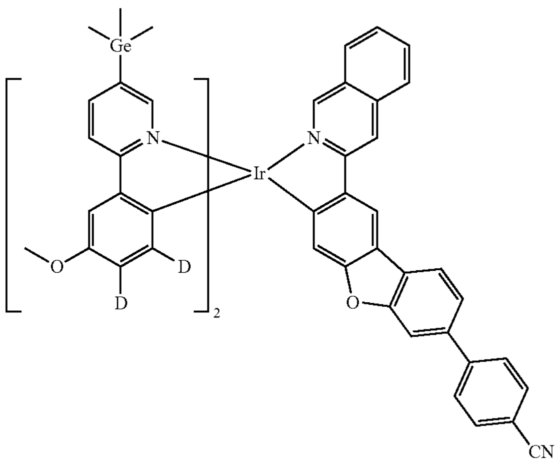
2800
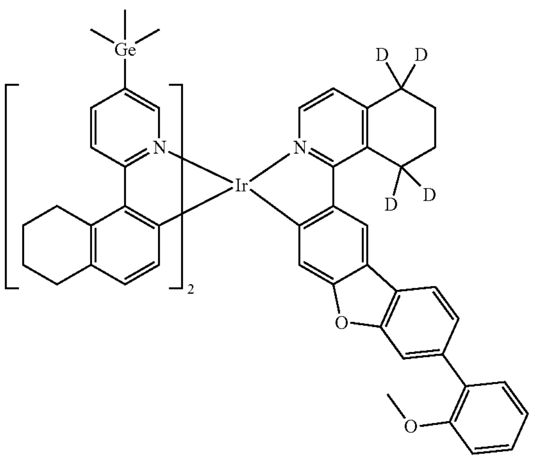
2801
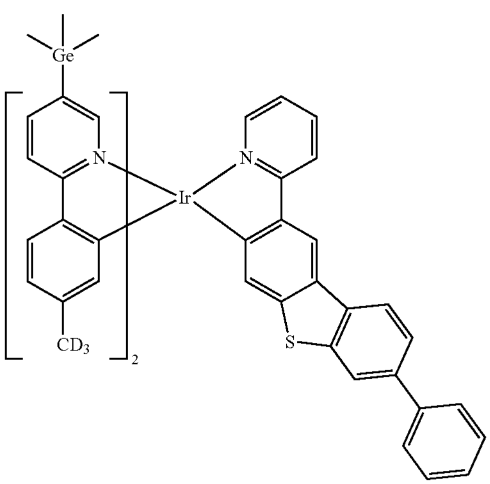
-continued
2802
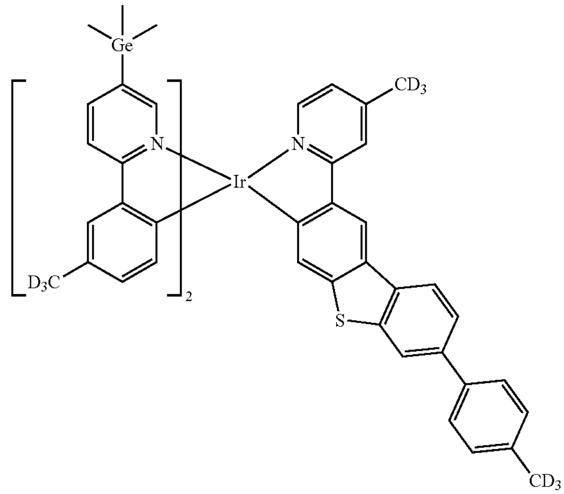
2803
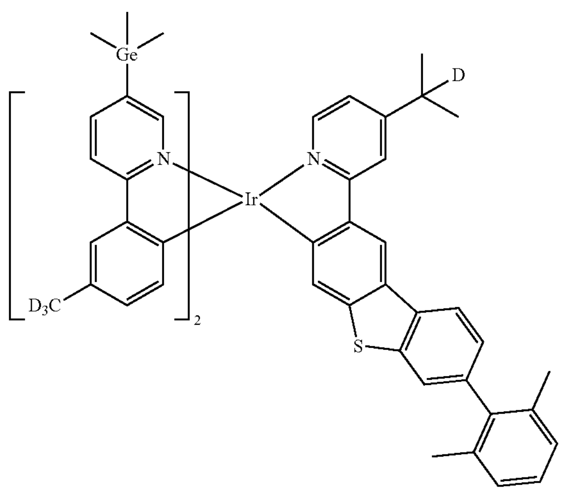
2804
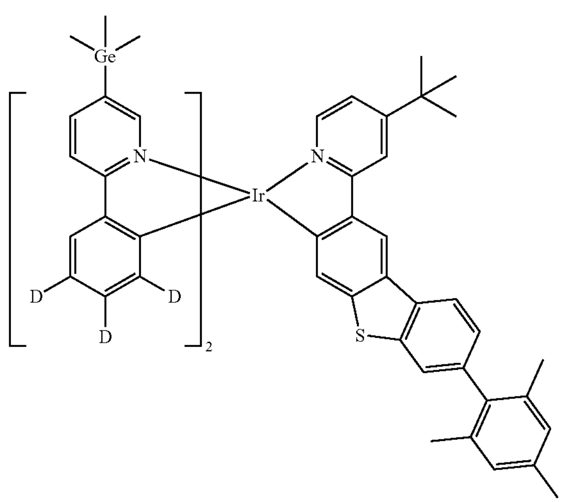

-continued
2805
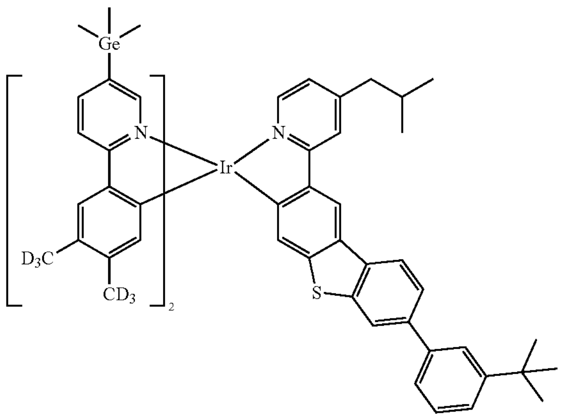
2806
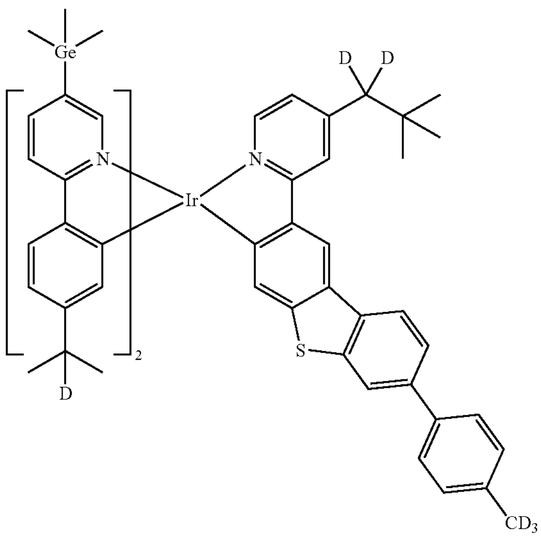
2807
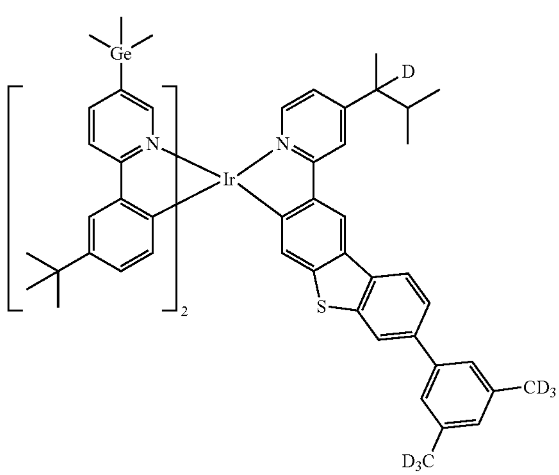
-continued
2808
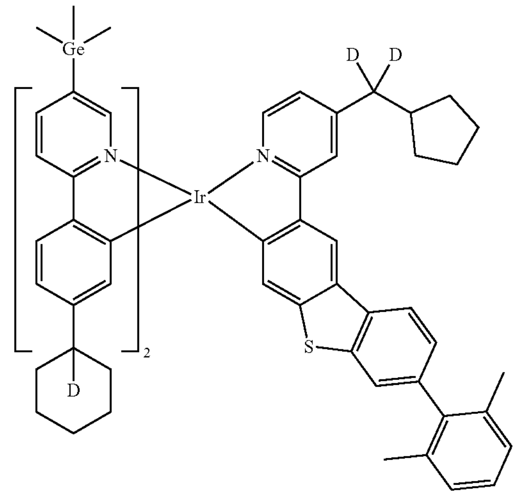
2809
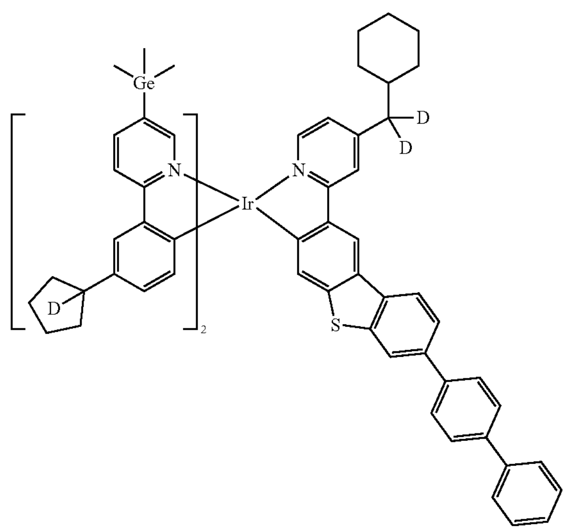
2810
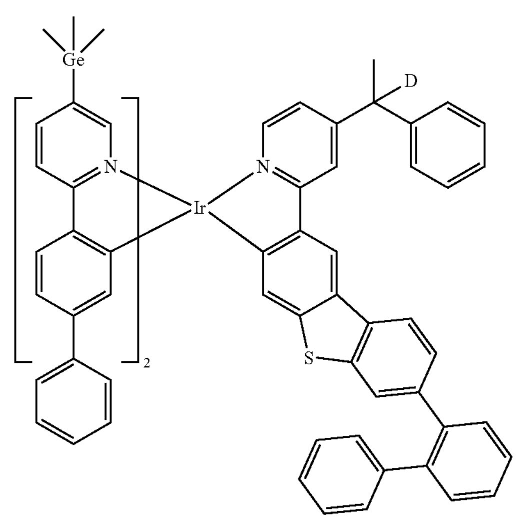

-continued
2811
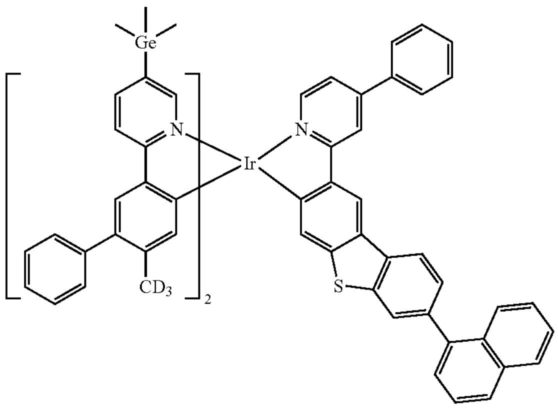
2812
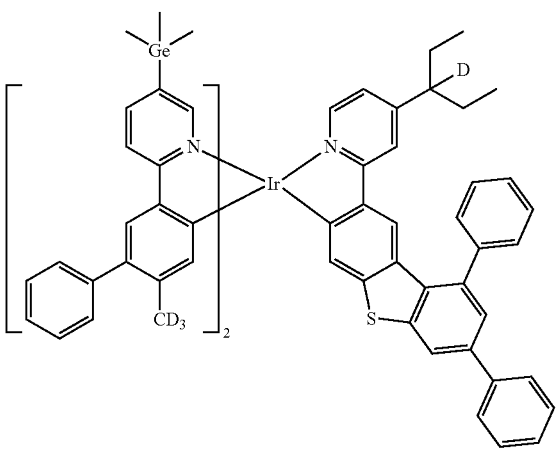
2813
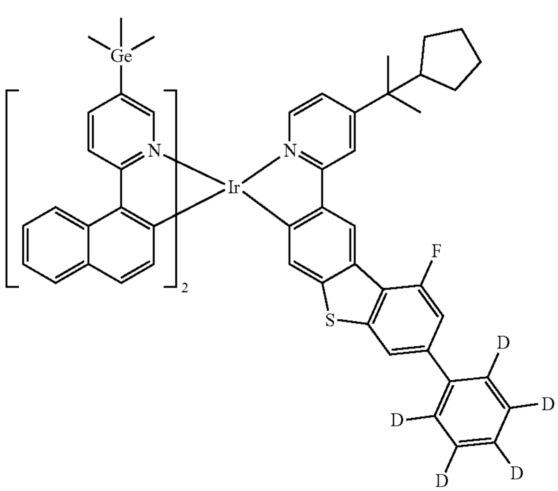
-continued
2814
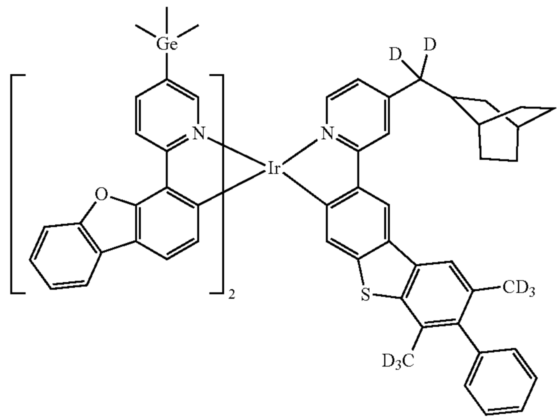
2815
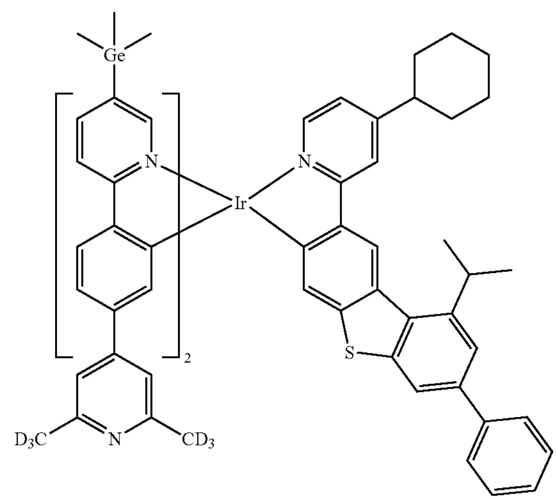
2816
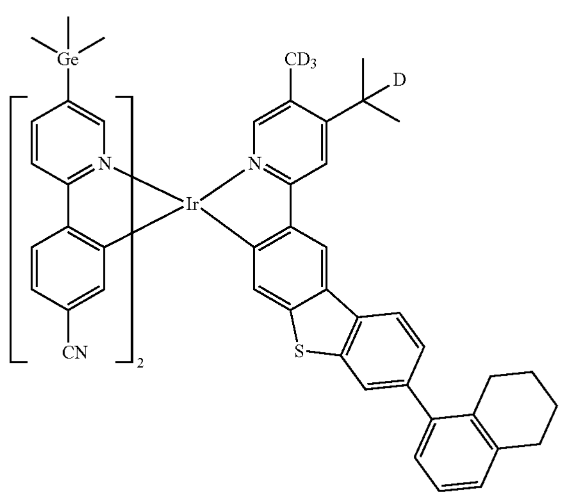

-continued
2817
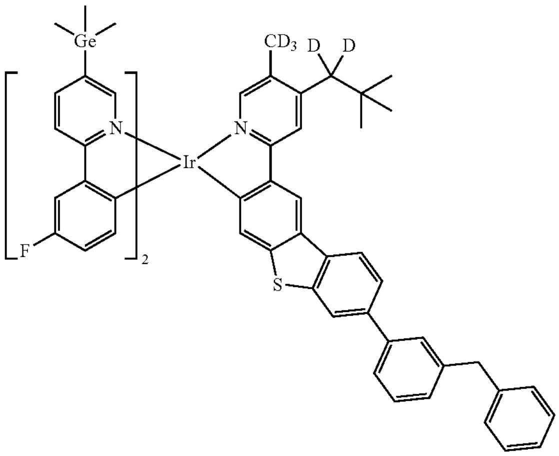
2818
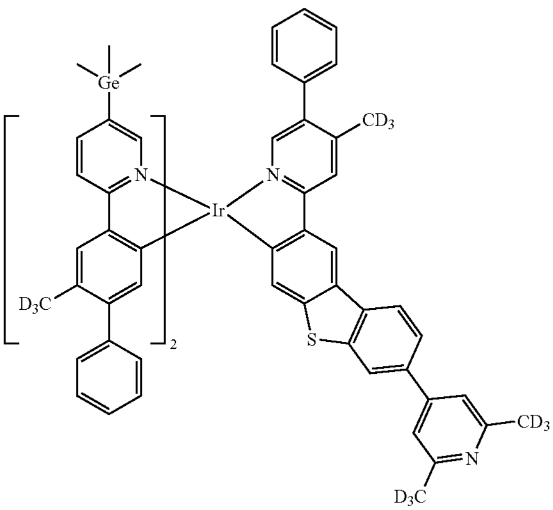
2819
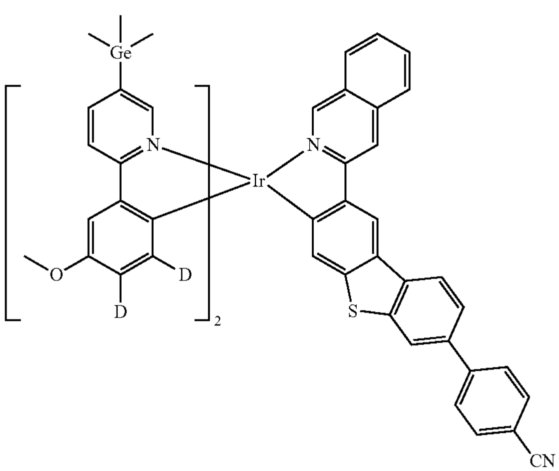
-continued
2820
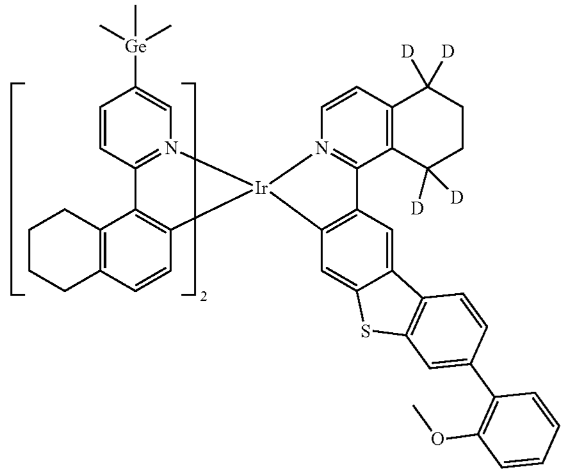
2821
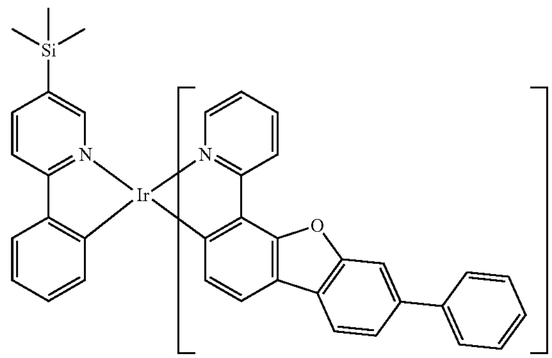
2822
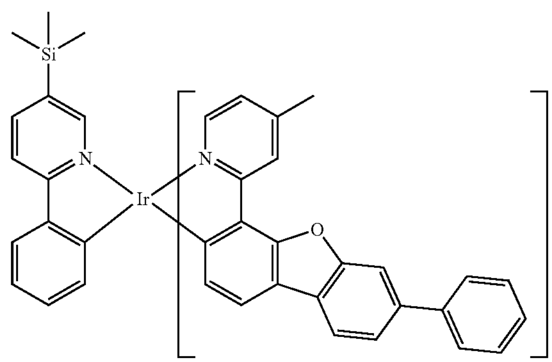
2823
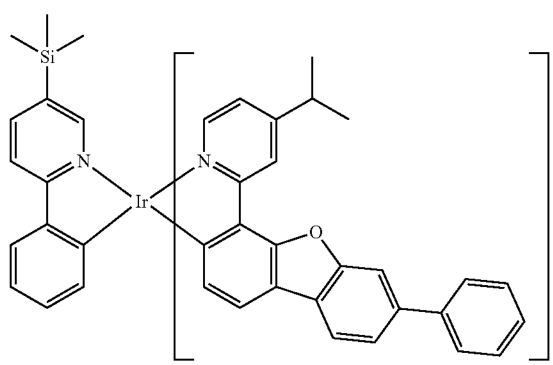

-continued
2824
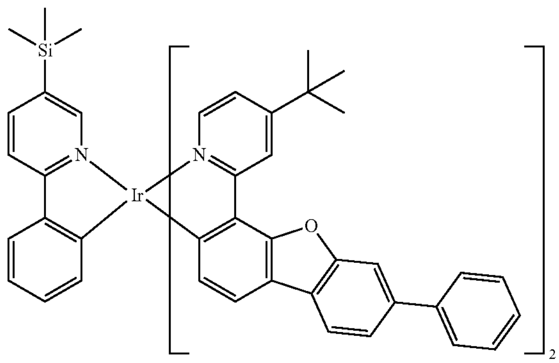
2825
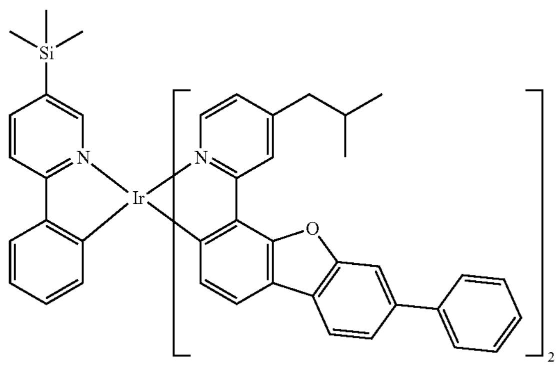
2826
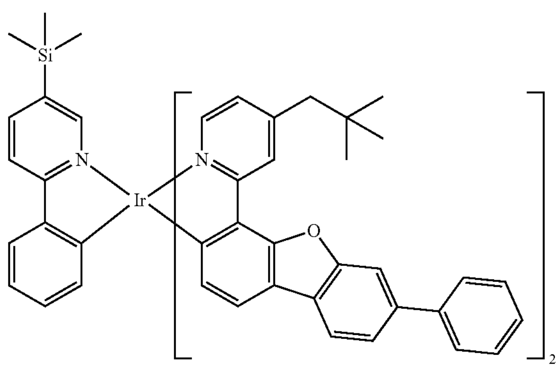
2827
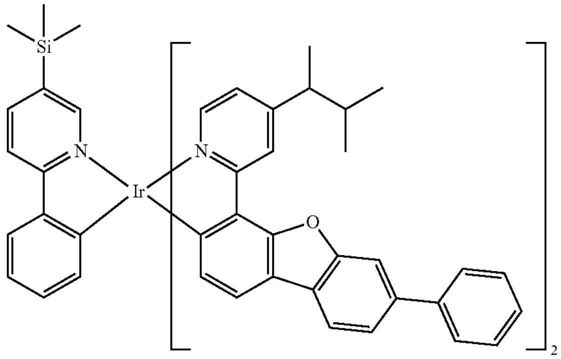
-continued
2828
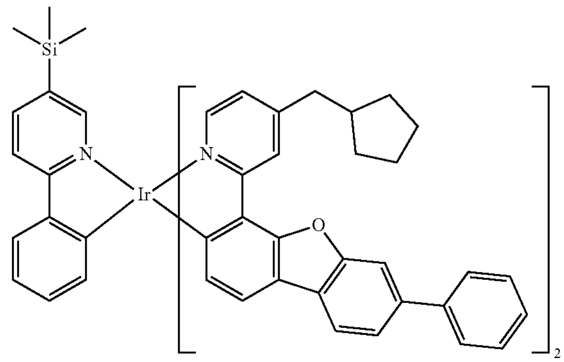
2829
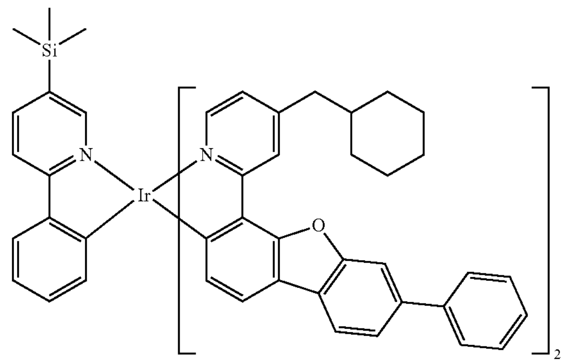
2830
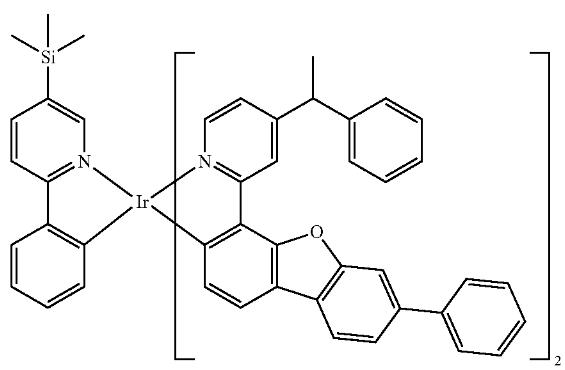
2831
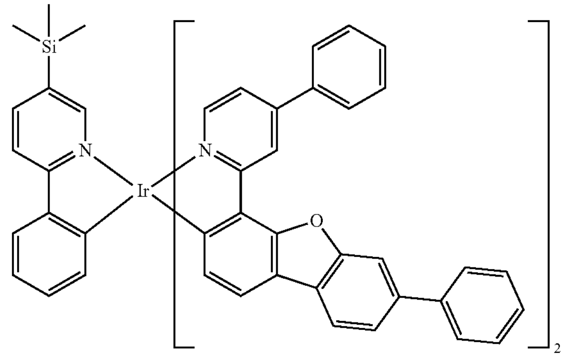

-continued
2832
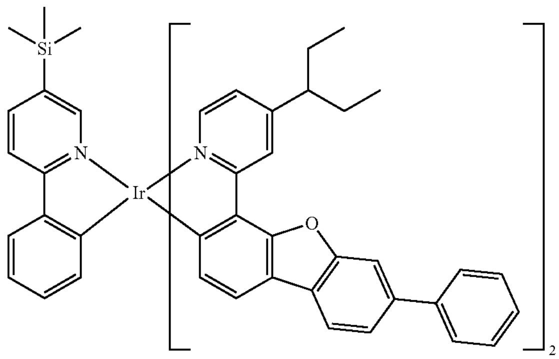
2833
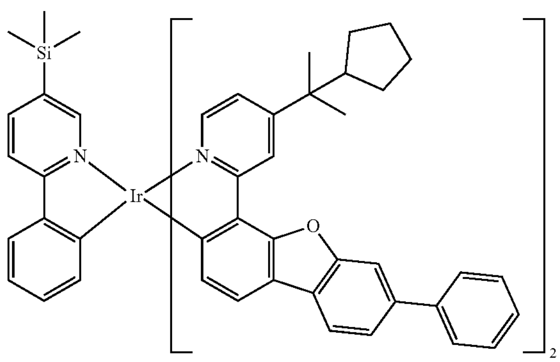
2834
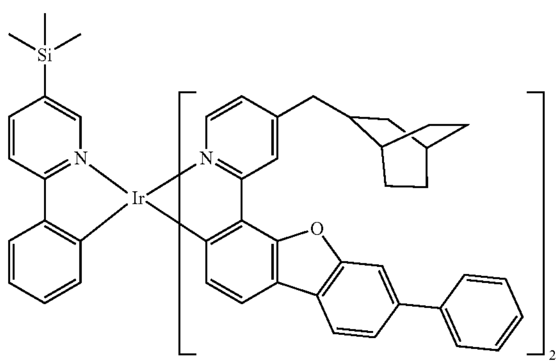
2835
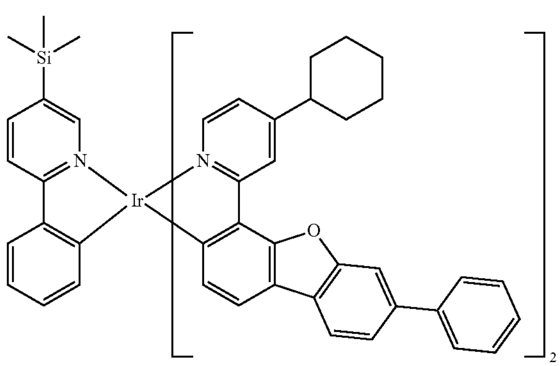
-continued
2836
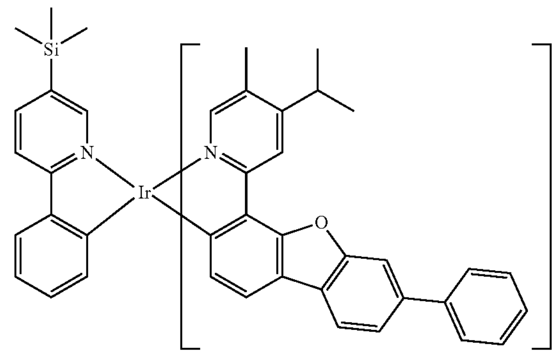
2837
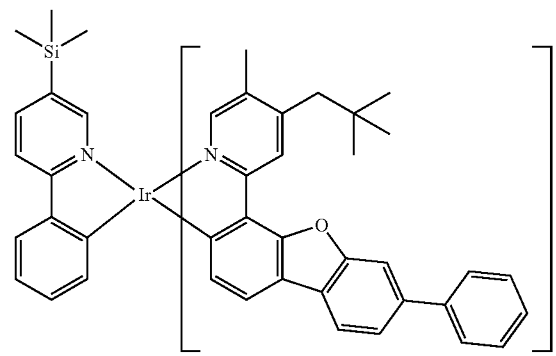
2838
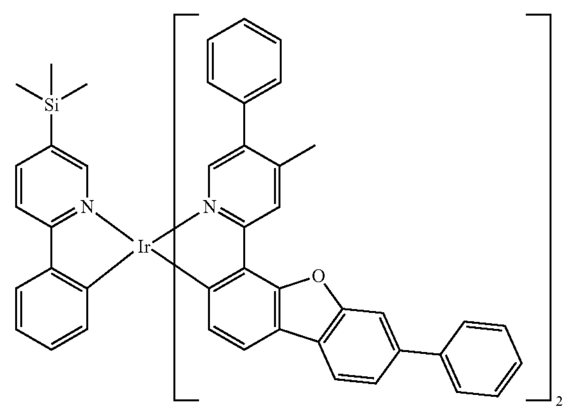
2839
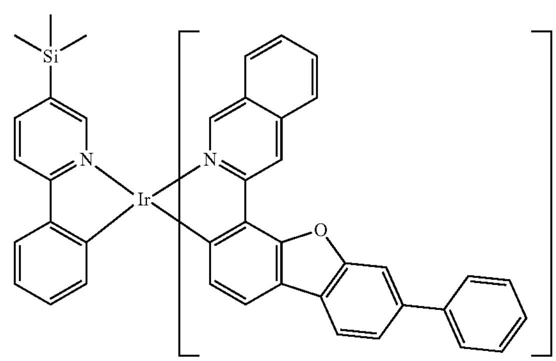

-continued
2840
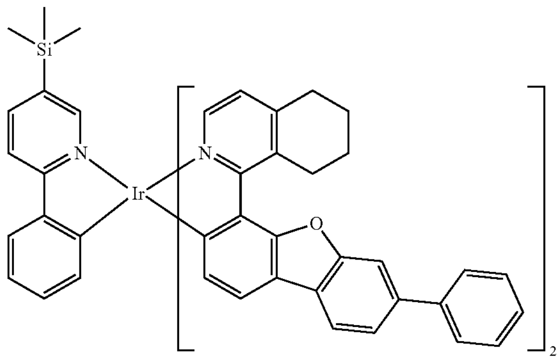
2841
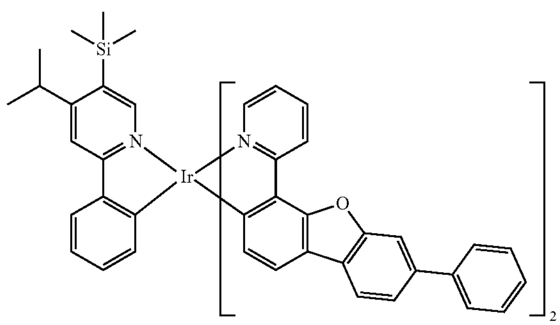
2842
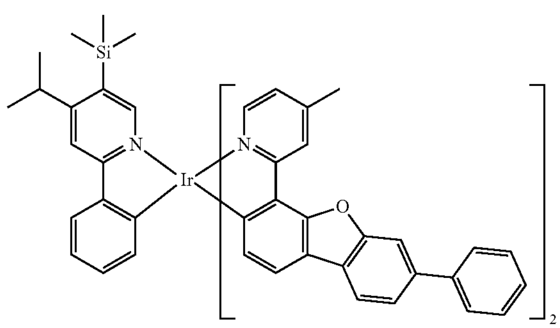
2843
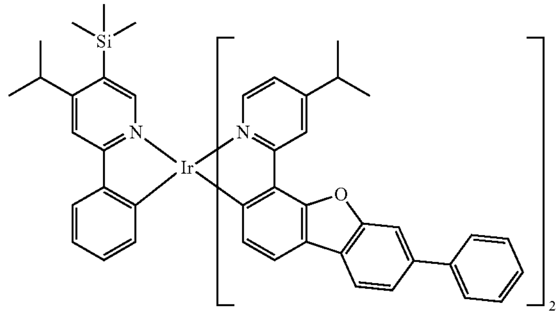
-continued
2844
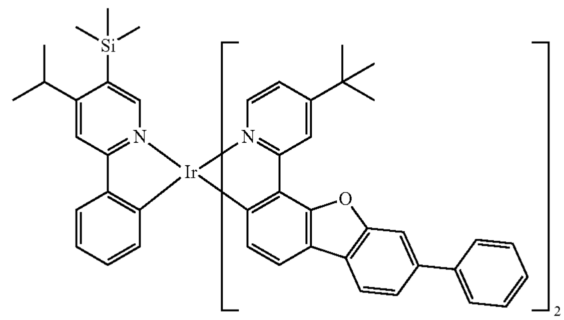
2845
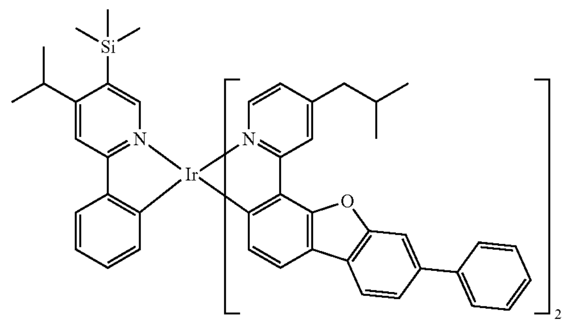
2846
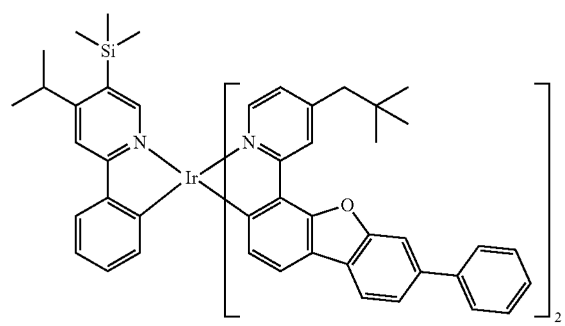
2847
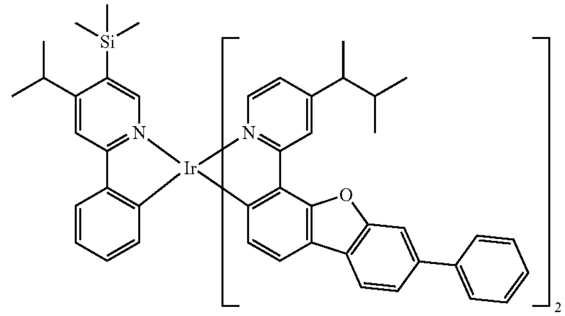

-continued
2848
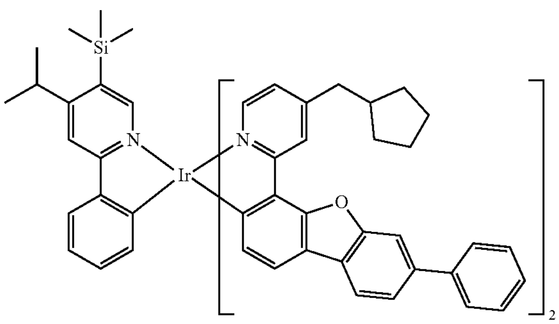
2849
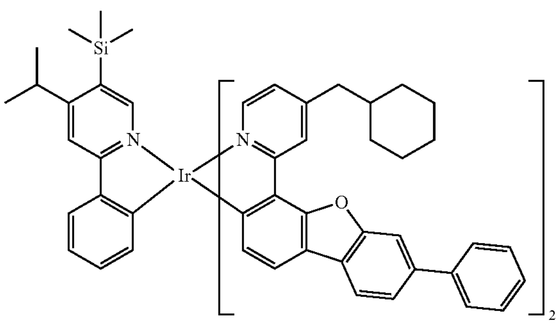
2850
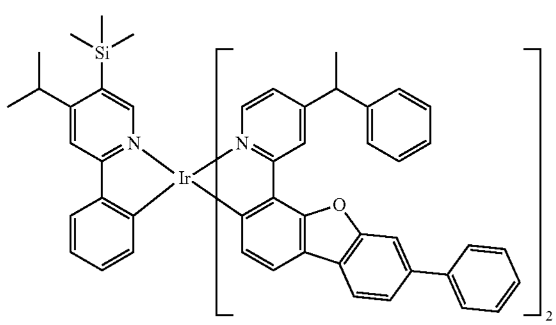
2851
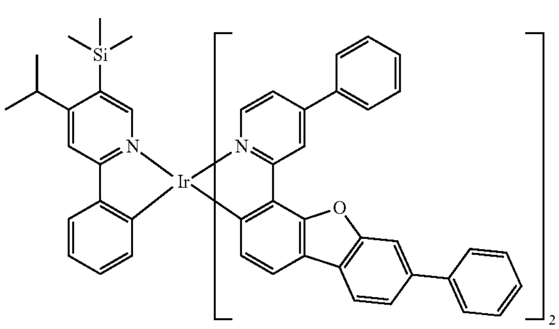
-continued
2852
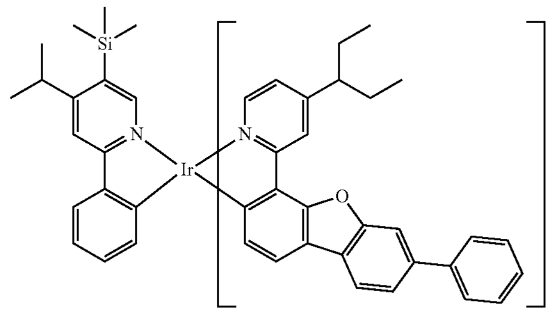
2853
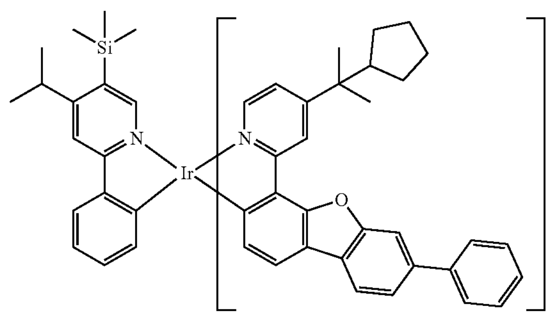
2854
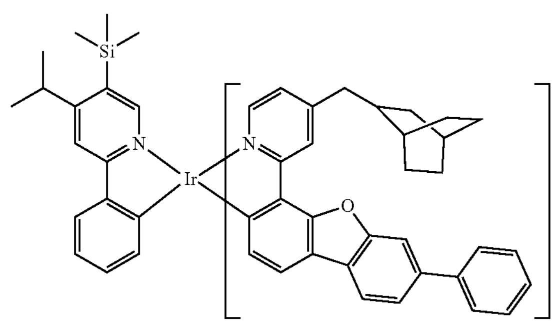
2855
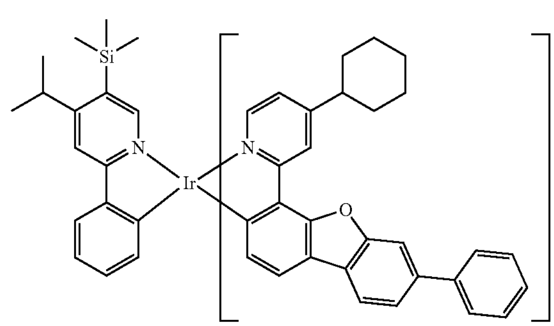

-continued
2856
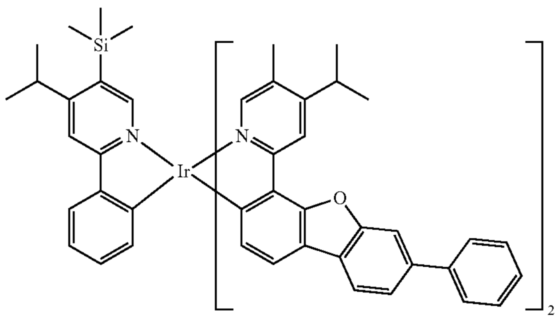
2857
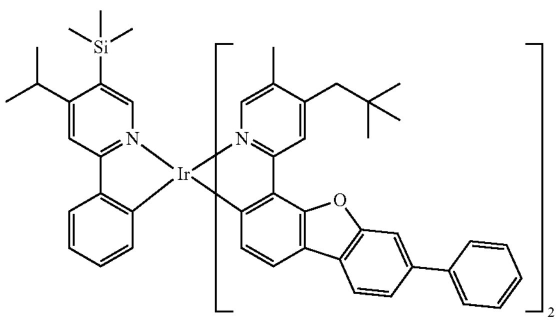
2858
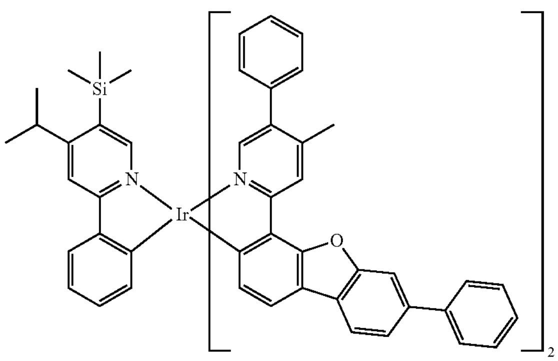
2859
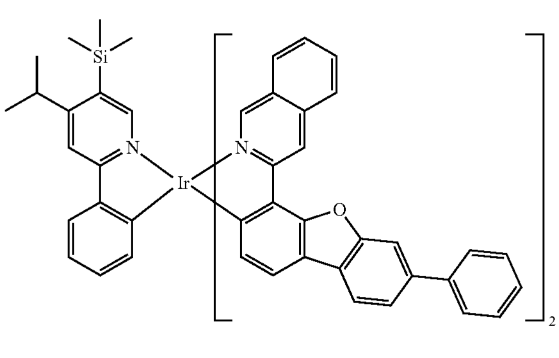
-continued
2860
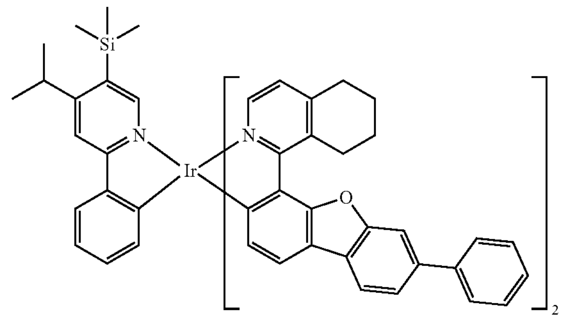
2861
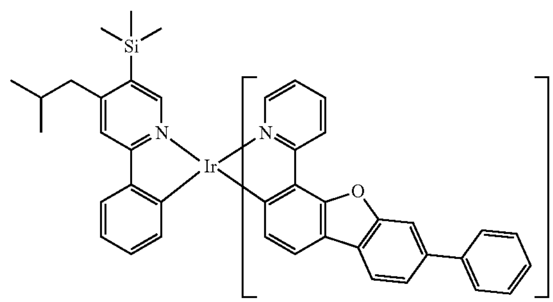
2862
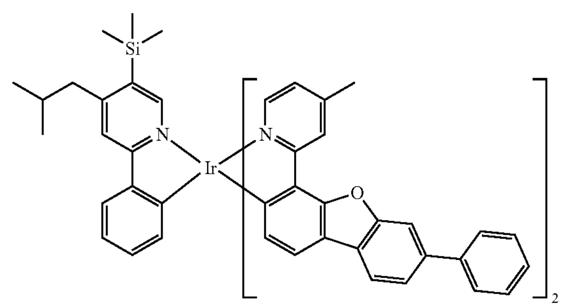
2863
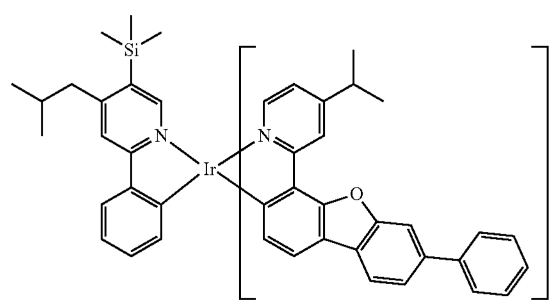
2864
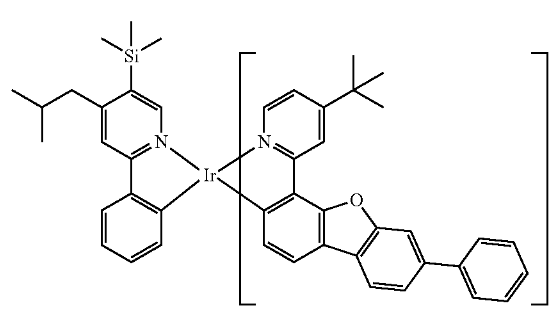

-continued
2865
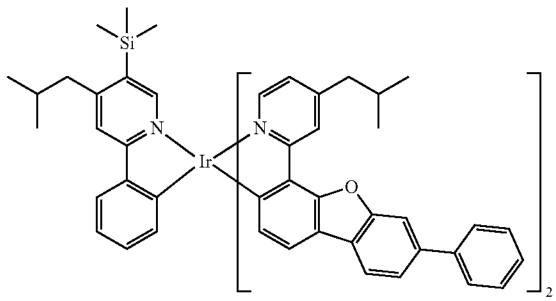
2866
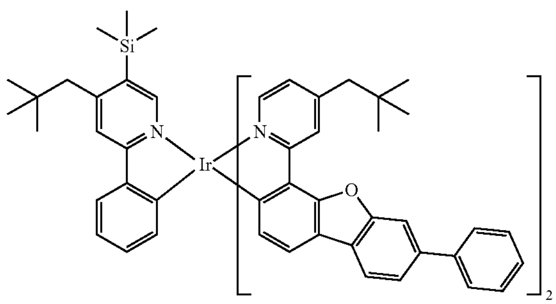
2867
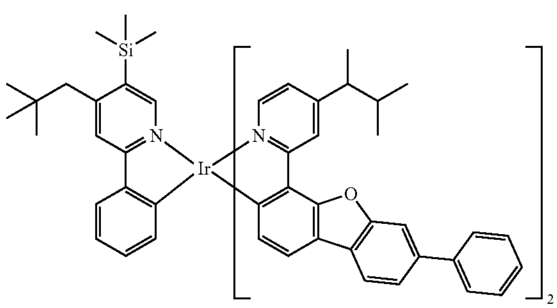
2868
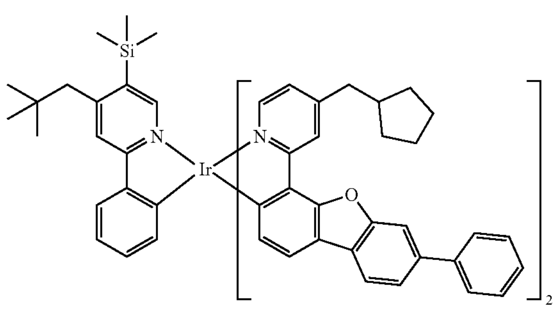
2869
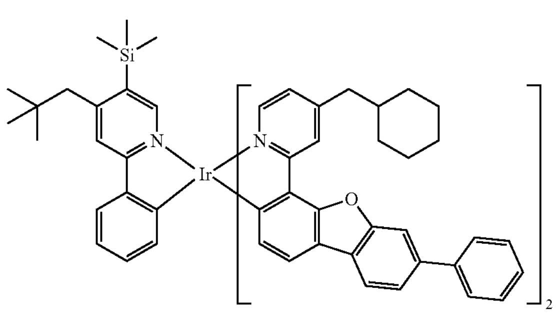
-continued
2870
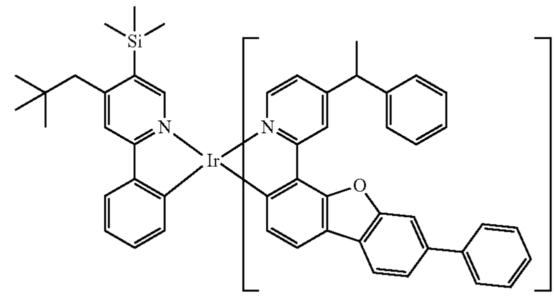
2871
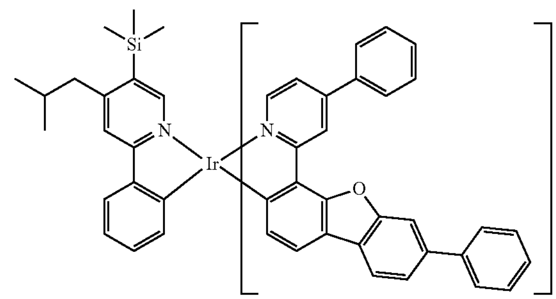
2872
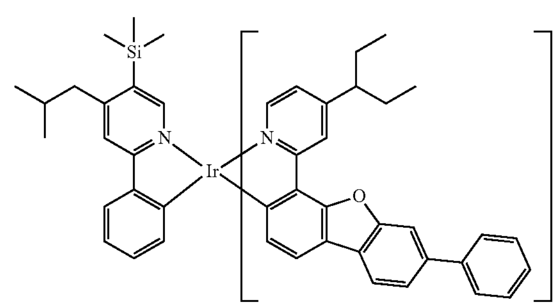
2873
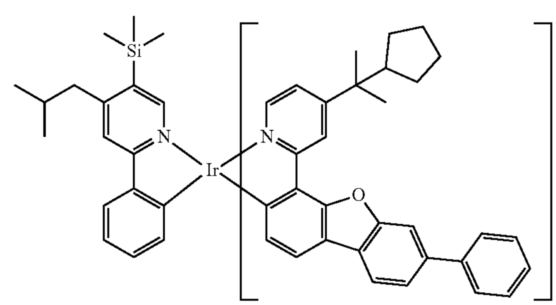
2874
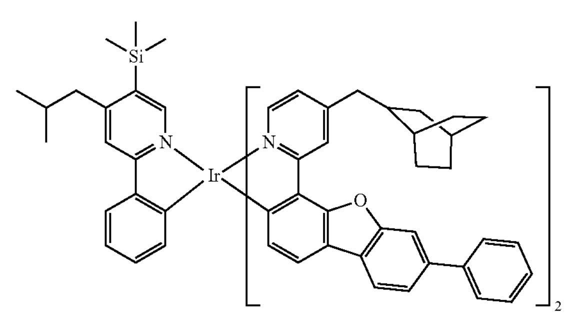

-continued
2875
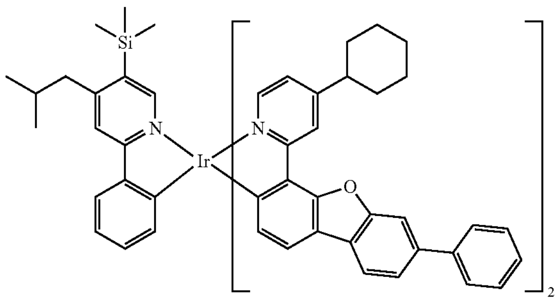
2876
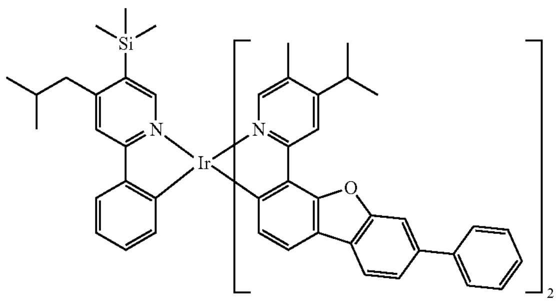
2877
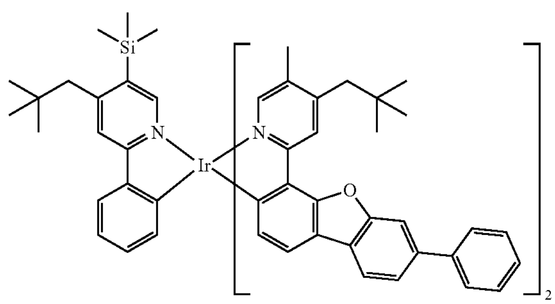
2878
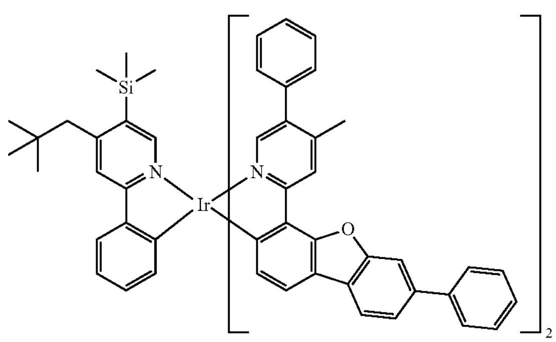
2879
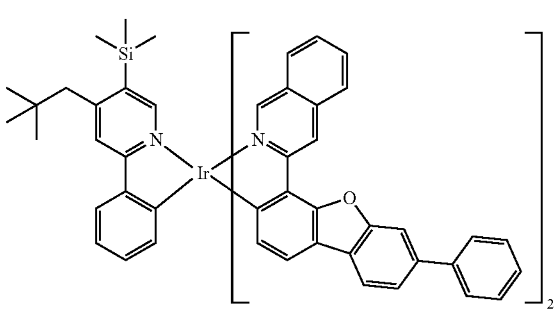
-continued
2880
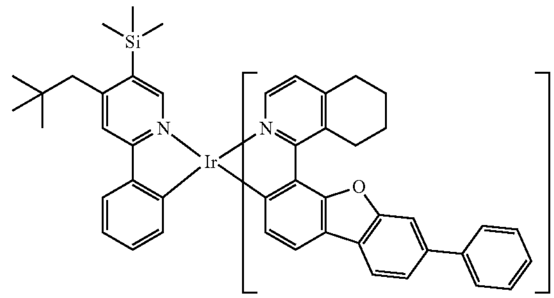
2581
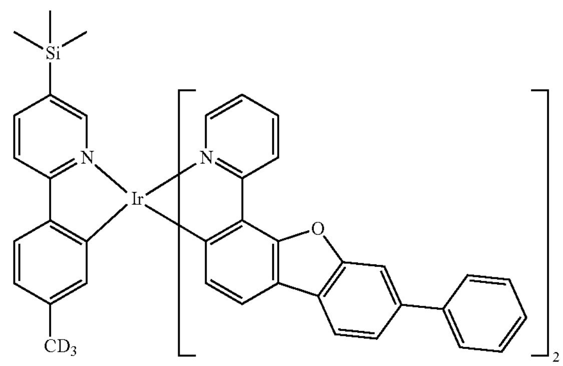
2582
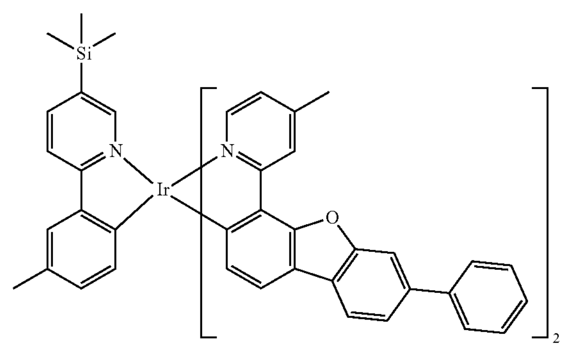
2583
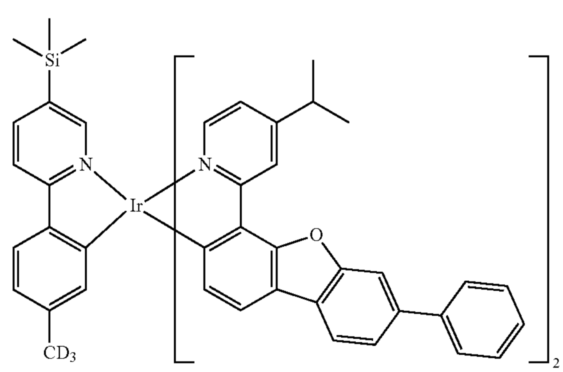

-continued
2584.
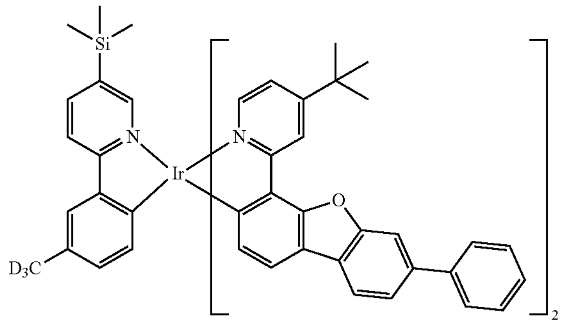
2885
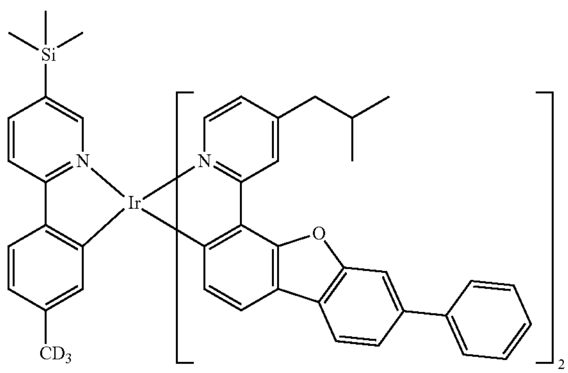
2886
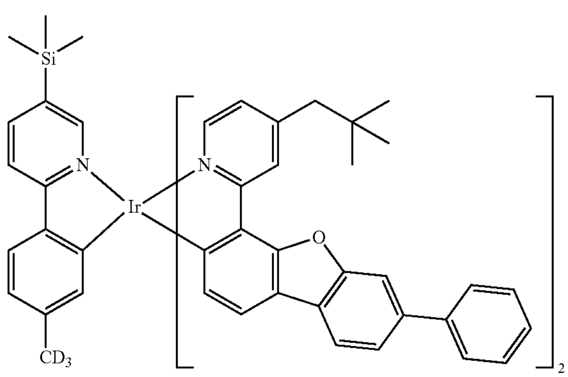
2887
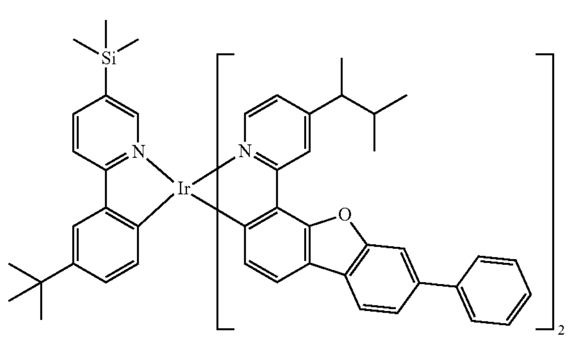
-continued
2888
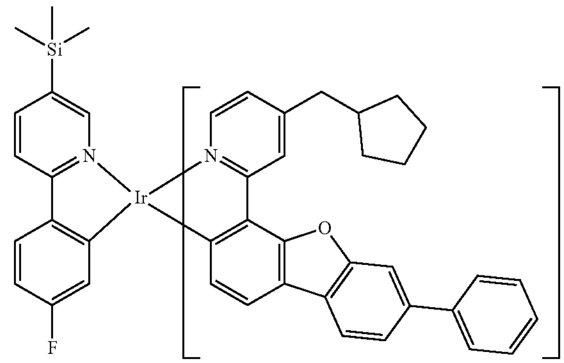
2889
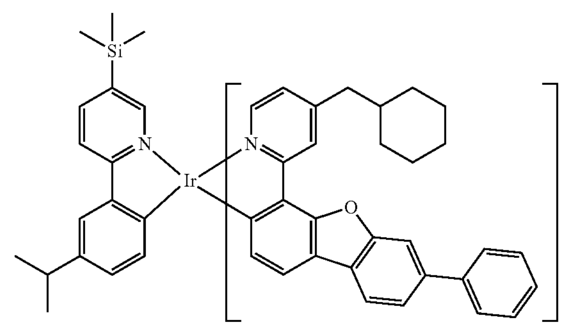
2890
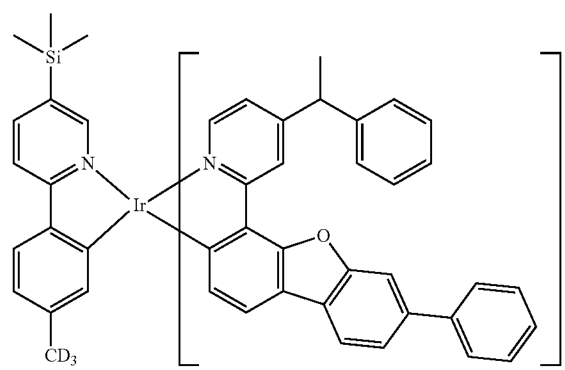
2891
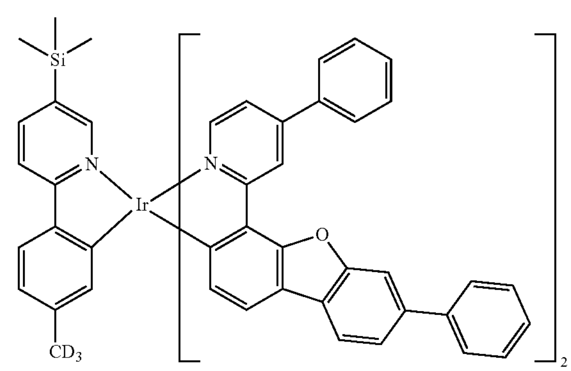

-continued
2892
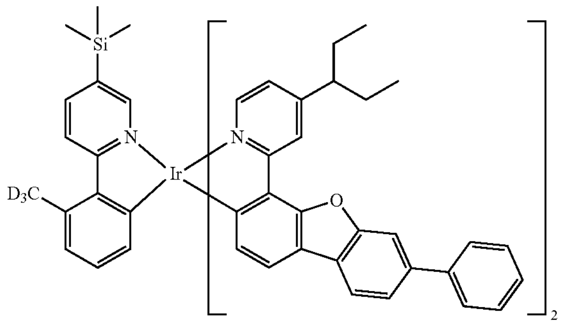
2893
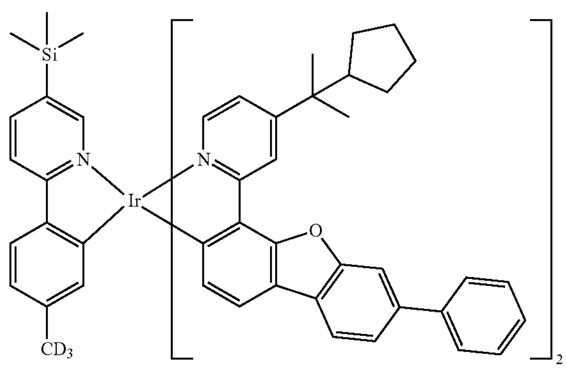
2894
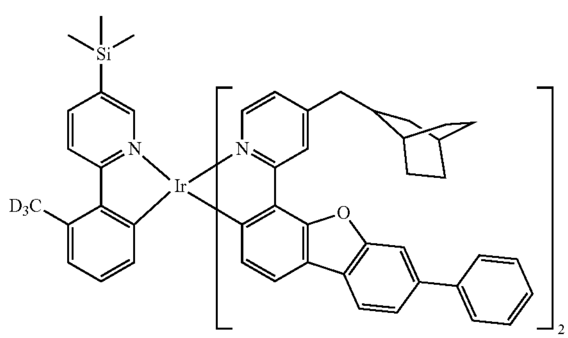
2895
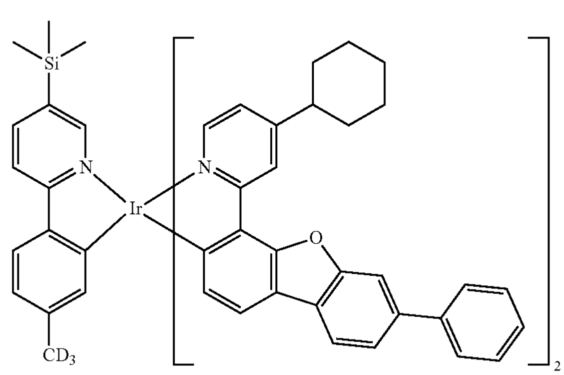
-continued
2896
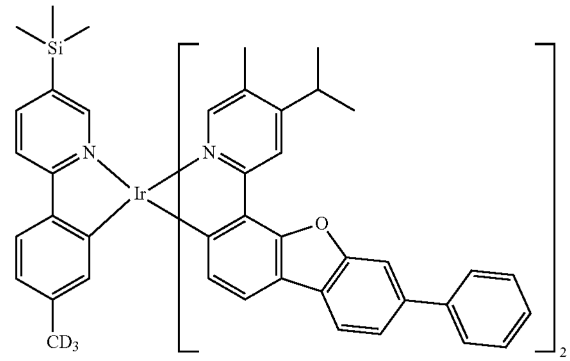
2897
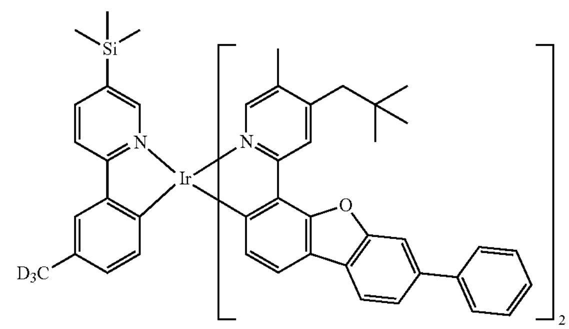
2898
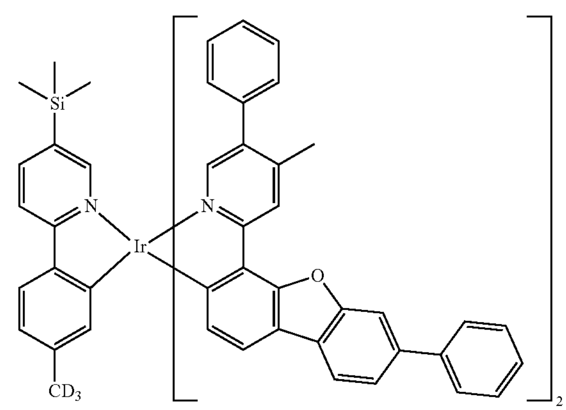
2899
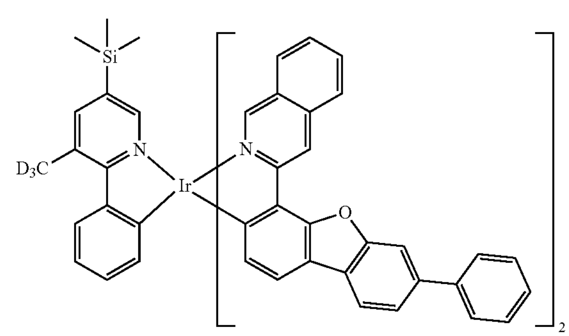

2900
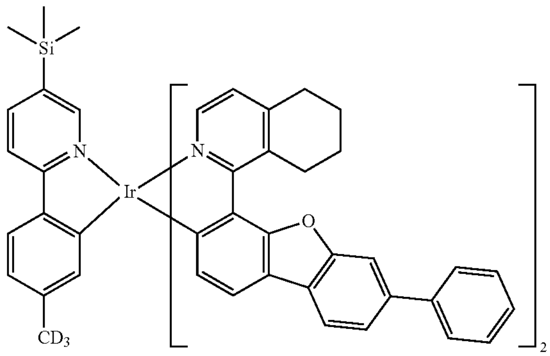
2901
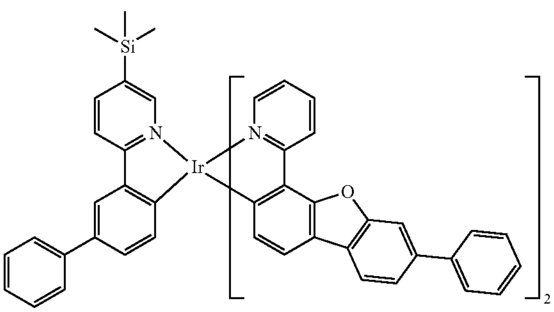
2902
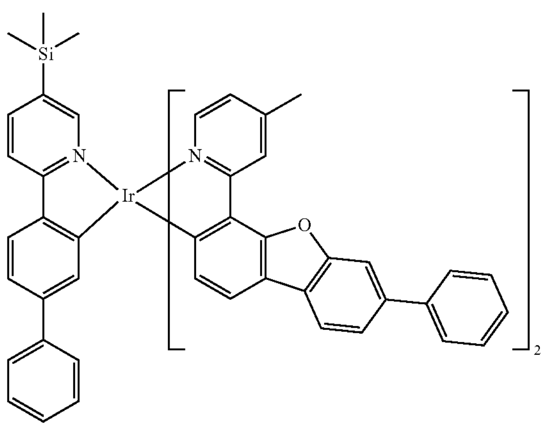
2903
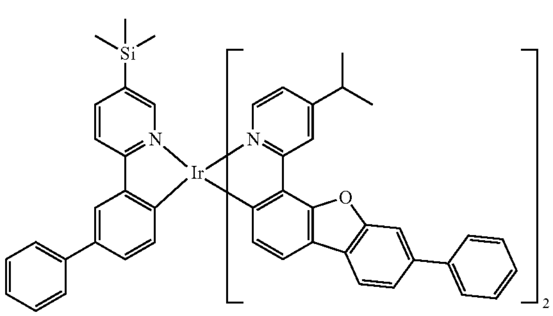
2904
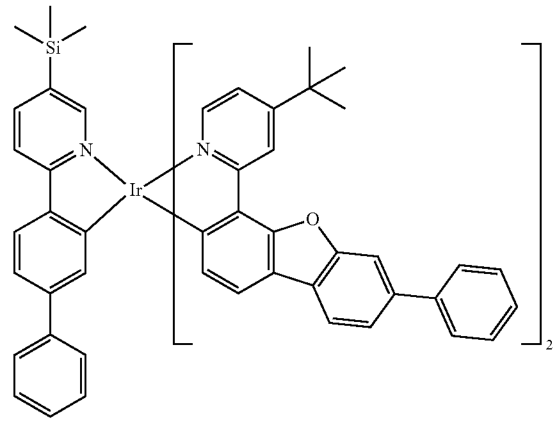
2905
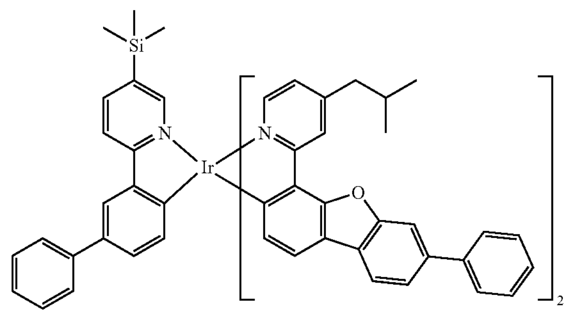
2906
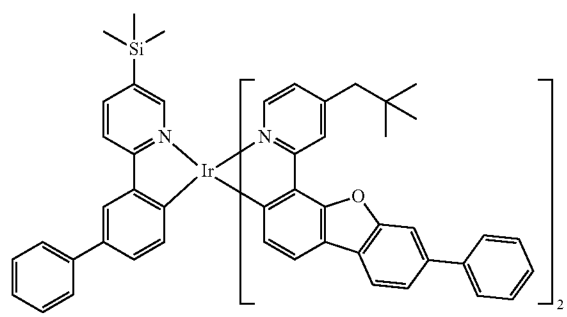
2907
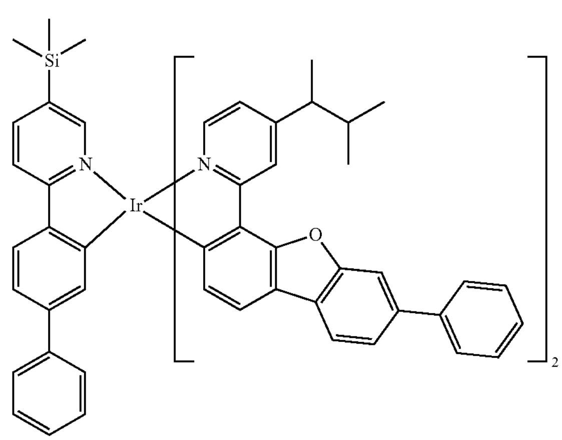

-continued
2908
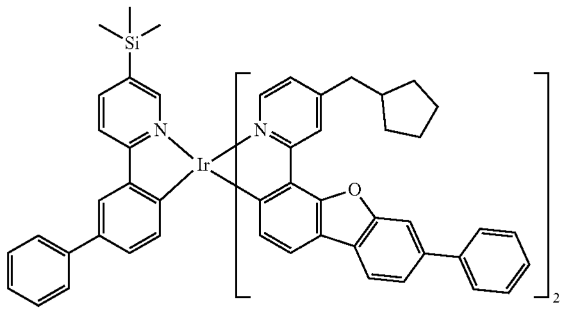
2909
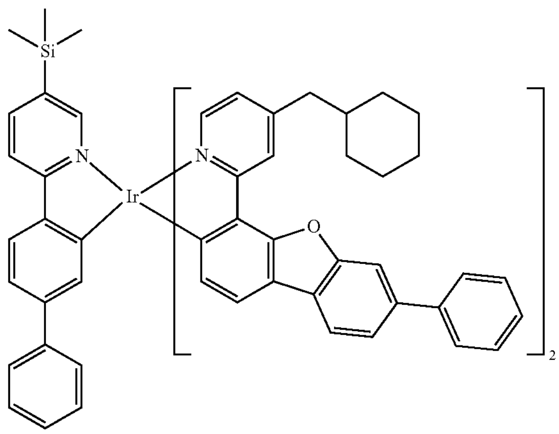
2910
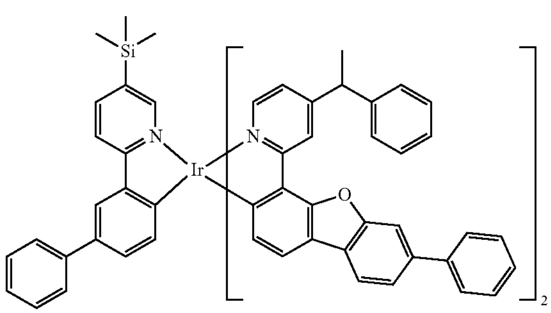
2911
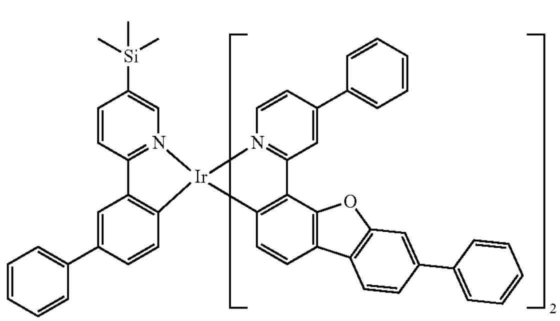
-continued
2912
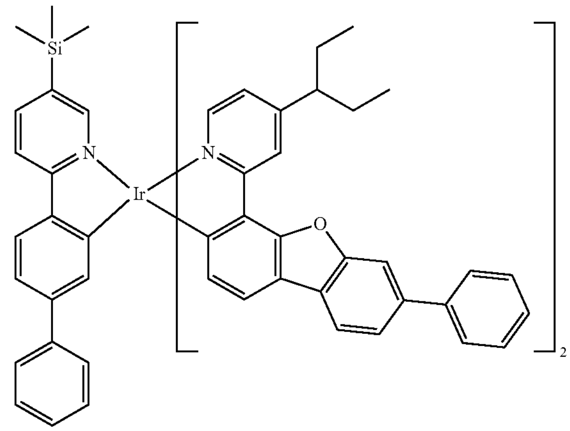
2913
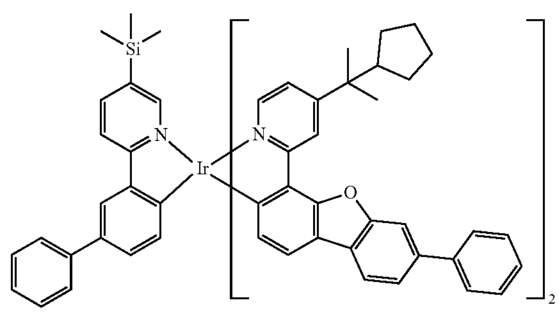
2914
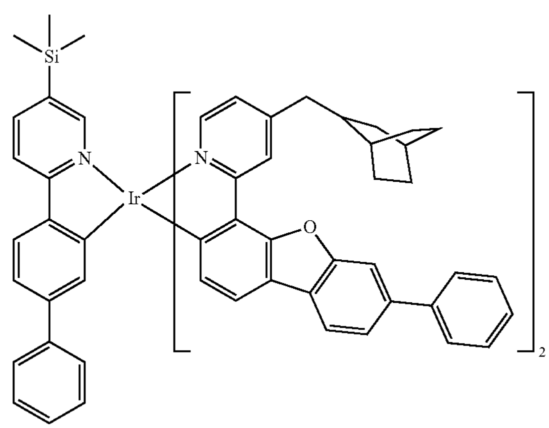
2915
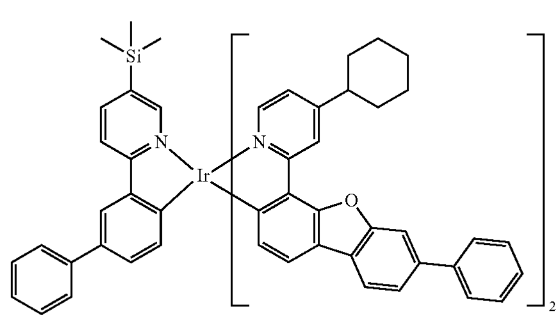

-continued
2916
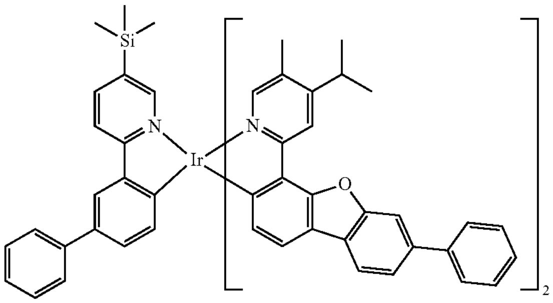
2917
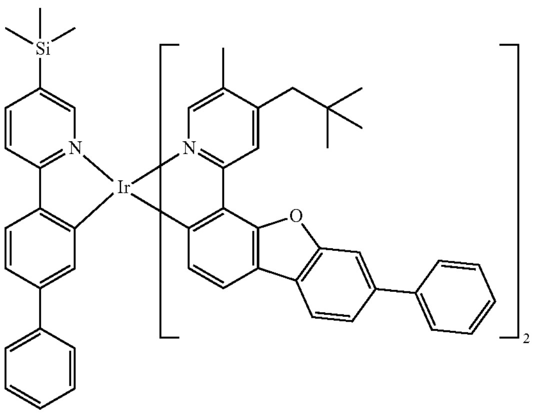
2918
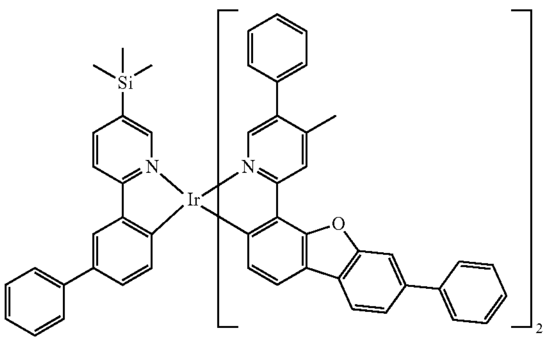
2919
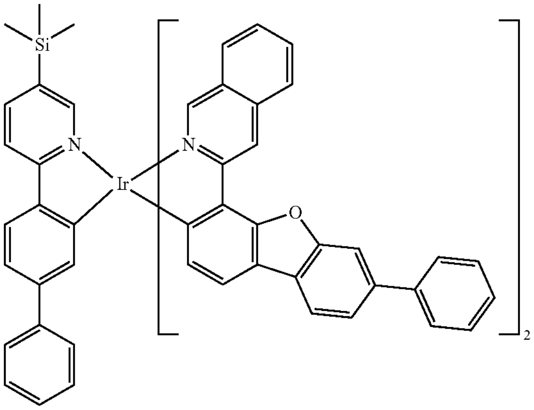
-continued
2920
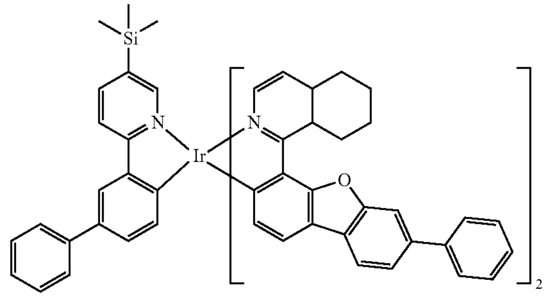
2921
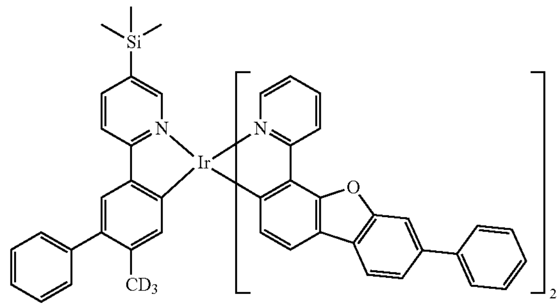
2922
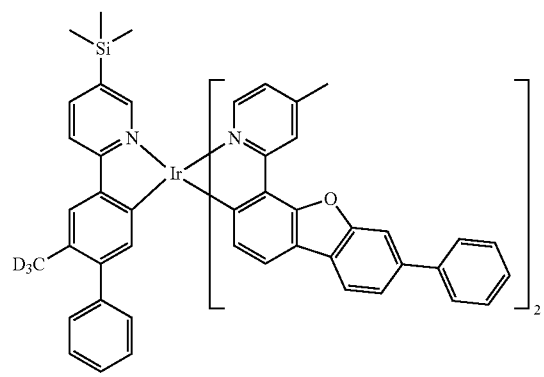
2923
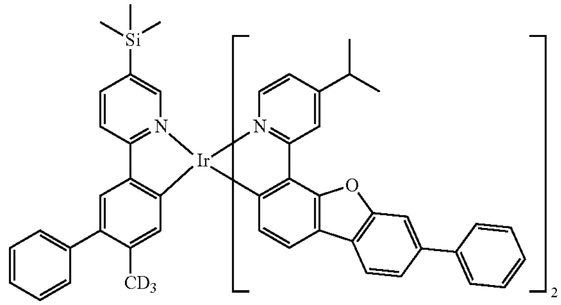

-continued
2924
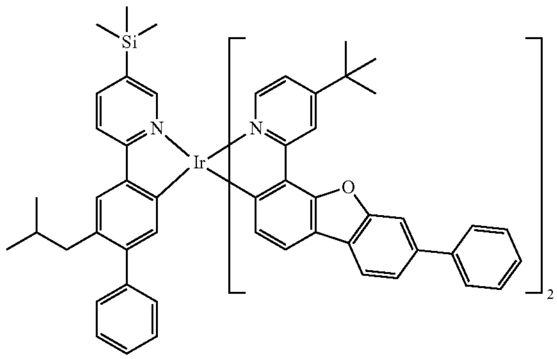
2925
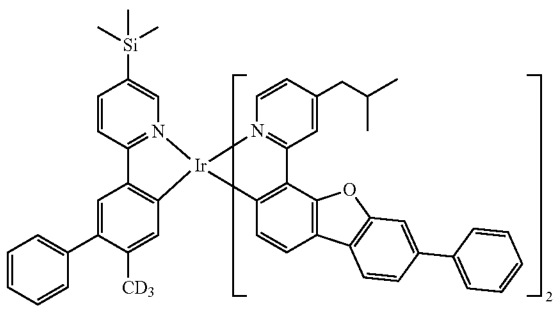
2926
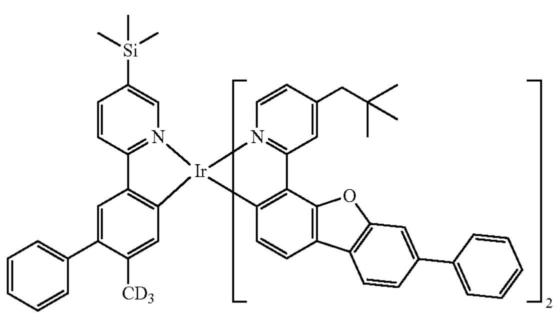
2927
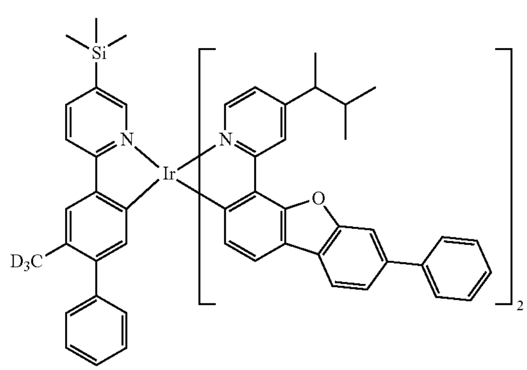
-continued
2928
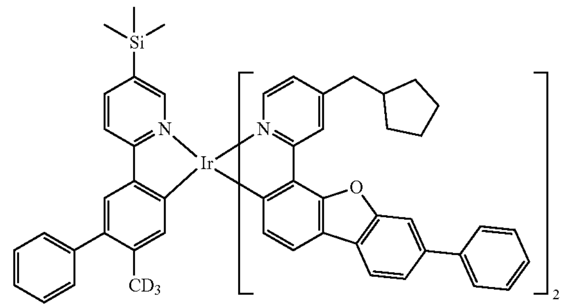
2929
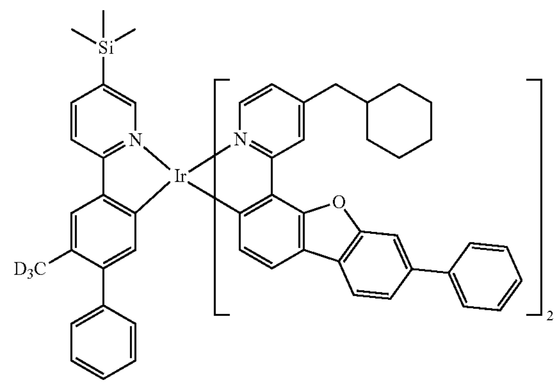
2930
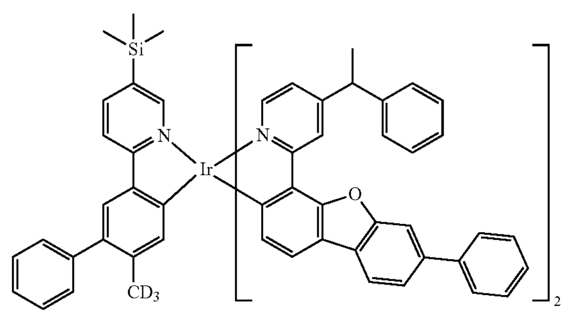
2931
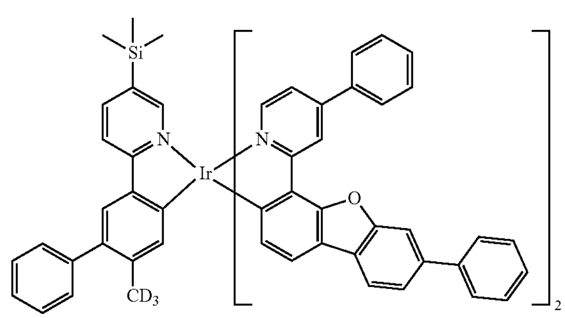

-continued
2932
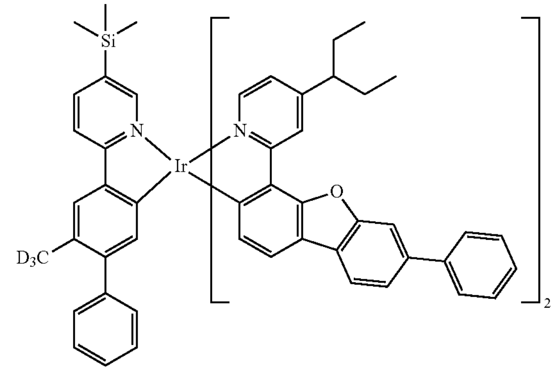
2933
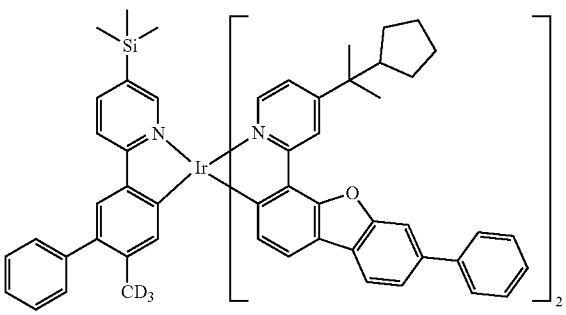
2934
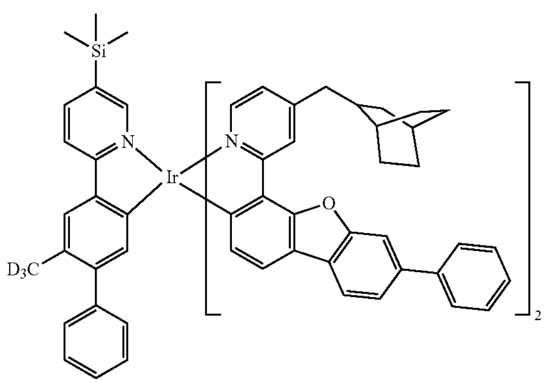
2935
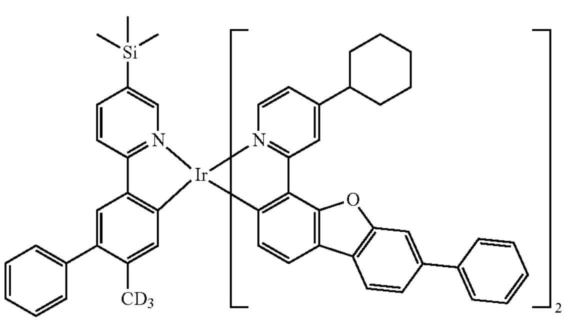
-continued
2936
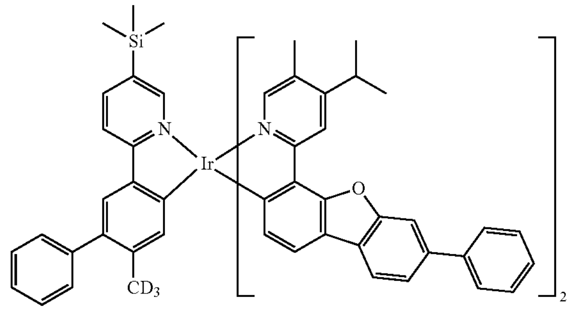
2937
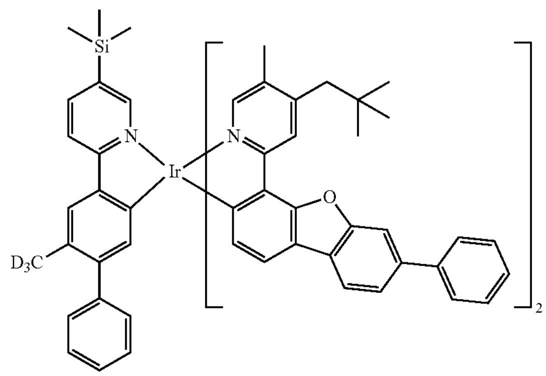
2938
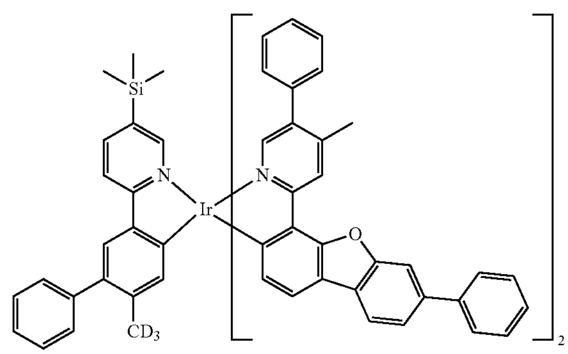
2939
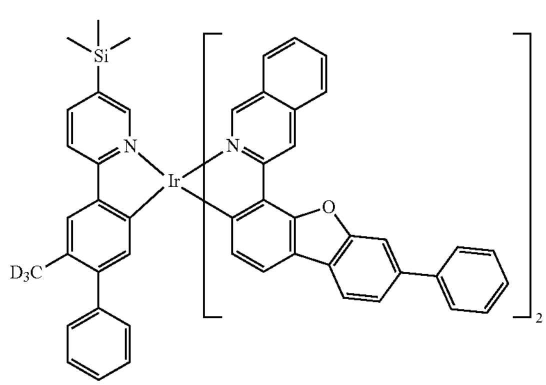

-continued
2940
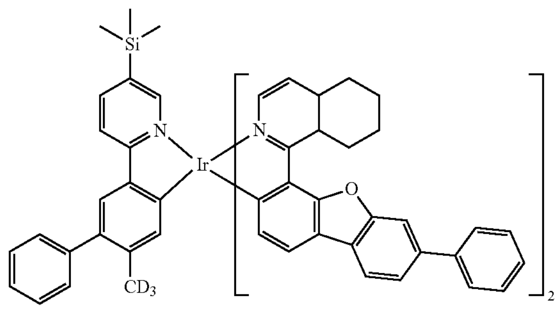
2941
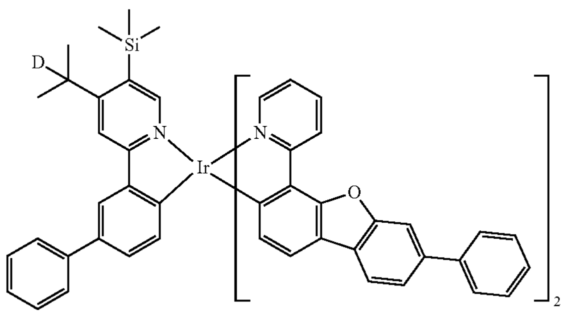
2942
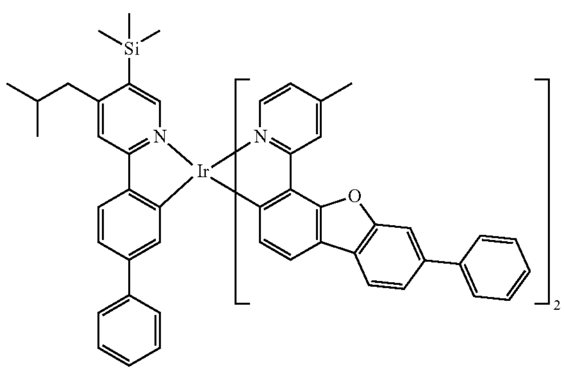
2943
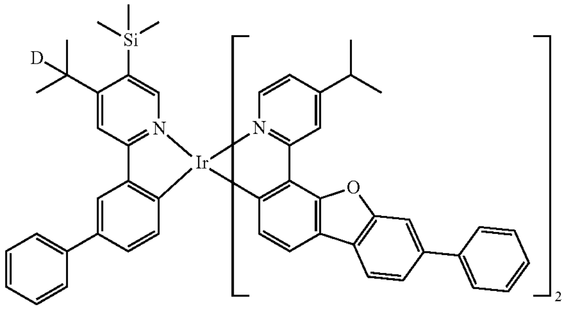
-continued
2944
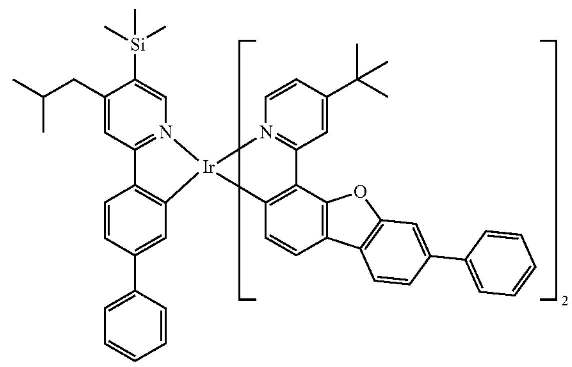
2944
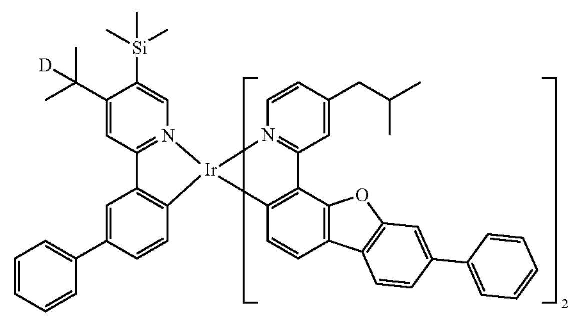
2945
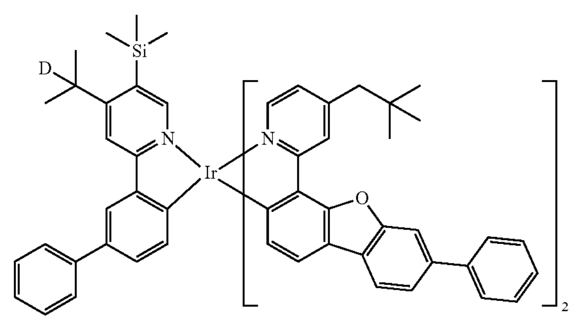
2946
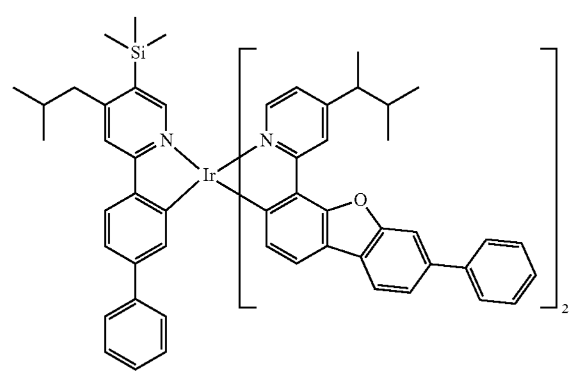

-continued
2947
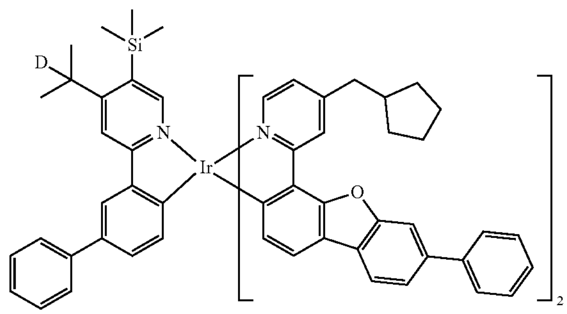
2948
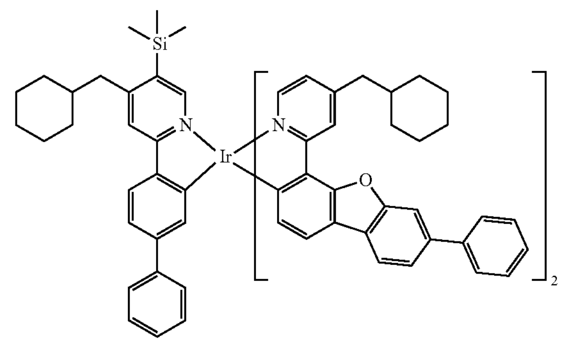
2949
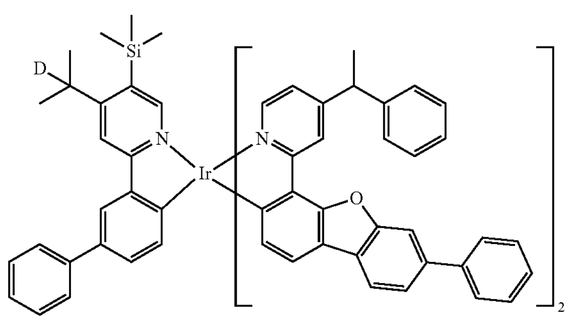
2950
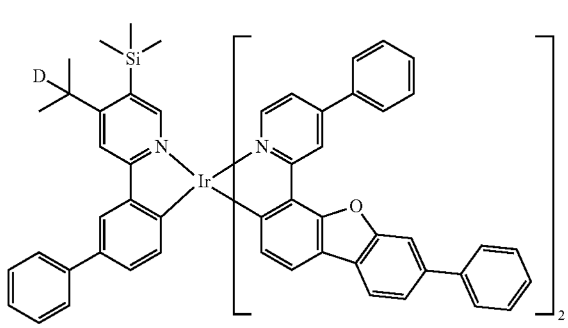
-continued
2951
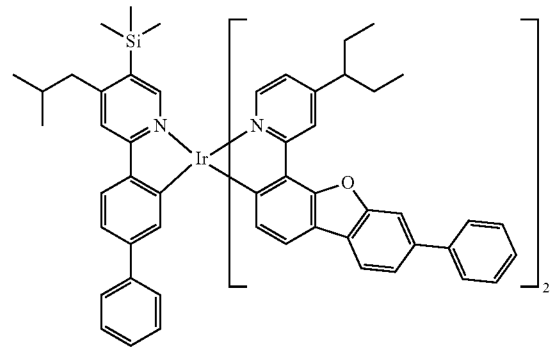
2952
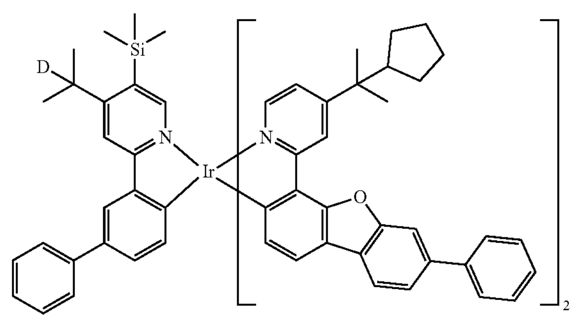
2953
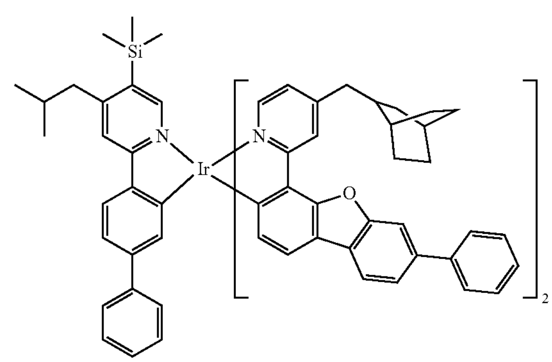
2954
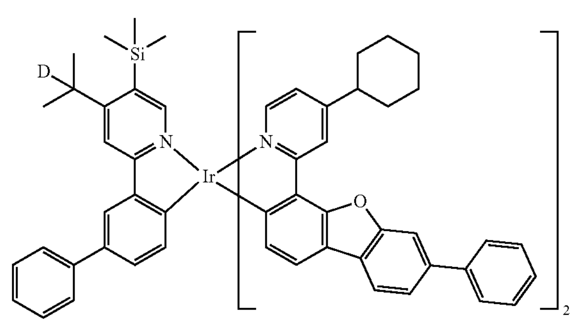

-continued
2955
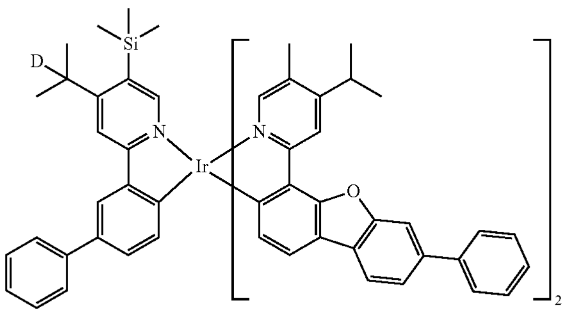
2957
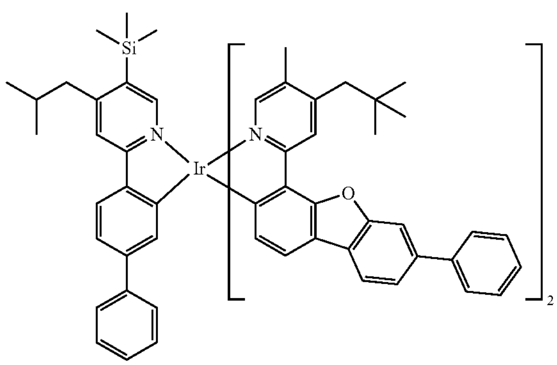
2958
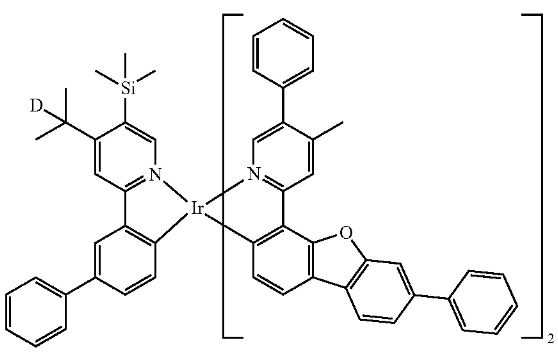
2959
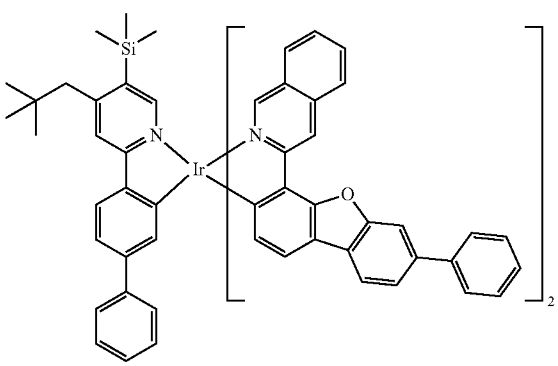
-continued
2960
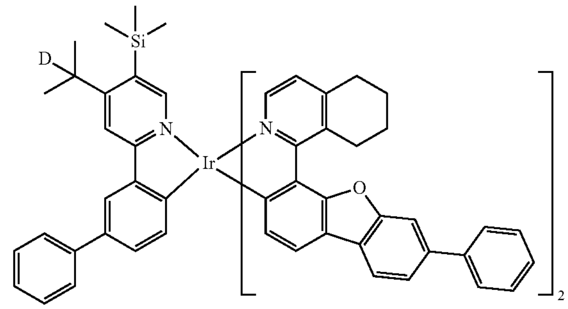
2961
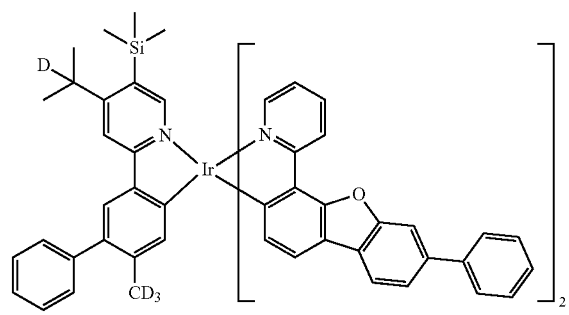
2962
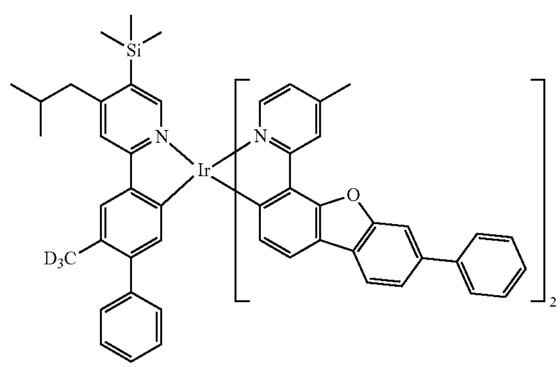
2963
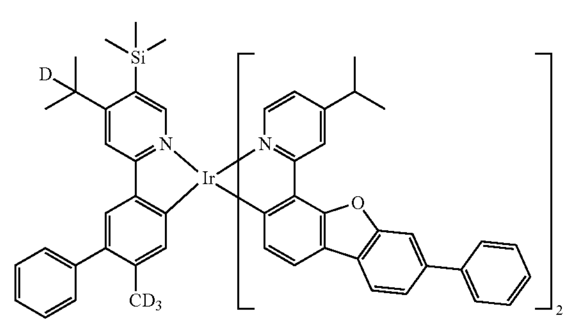

2964
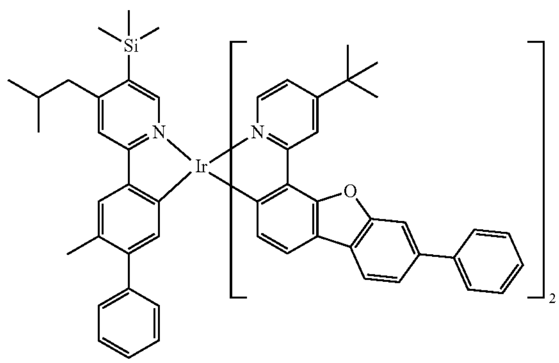
2965
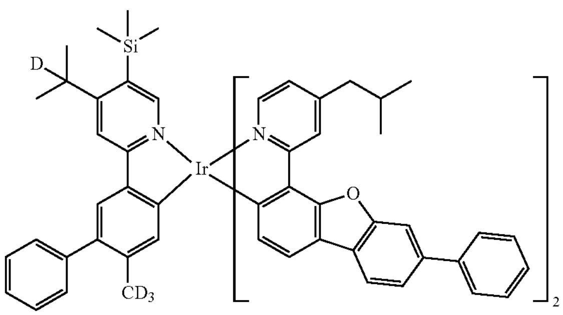
2966
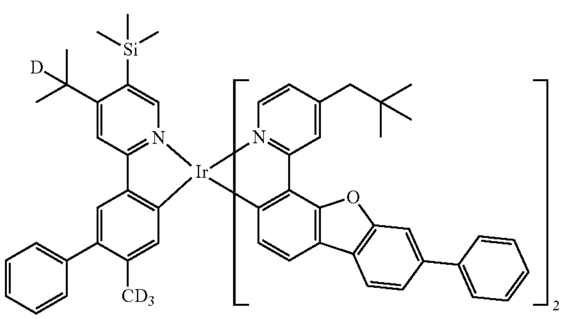
2967
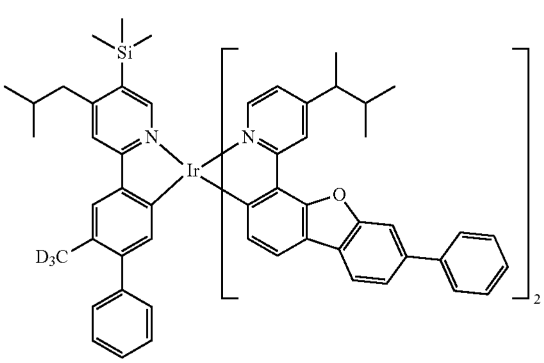
2968
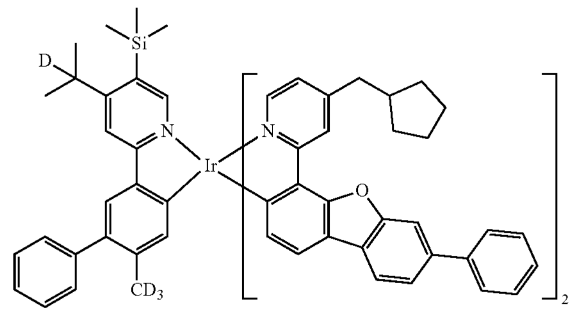
2969
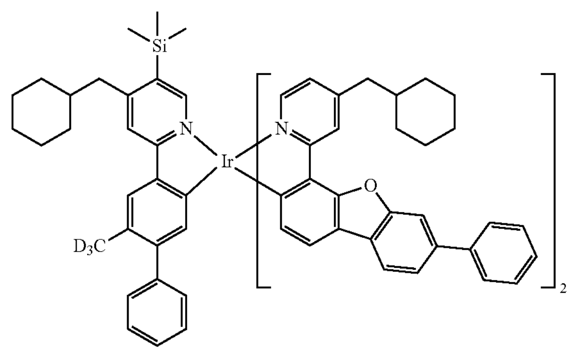
2970
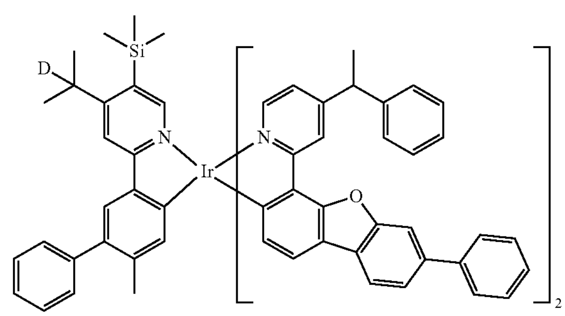
2971
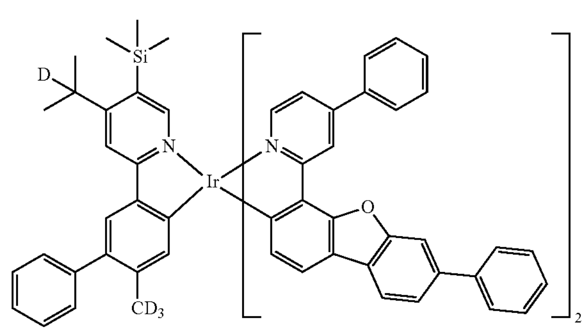

-continued
2972
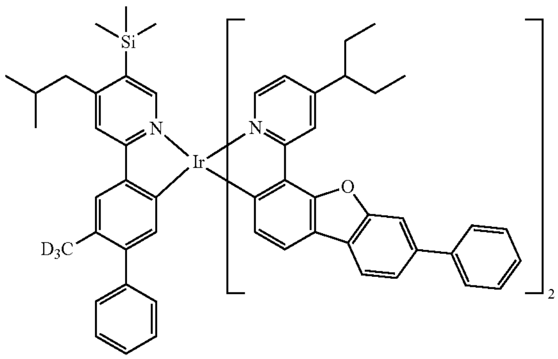
2973
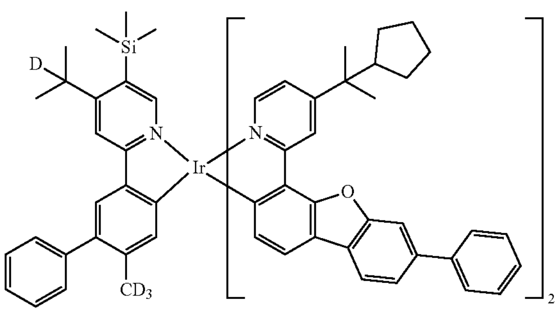
2974
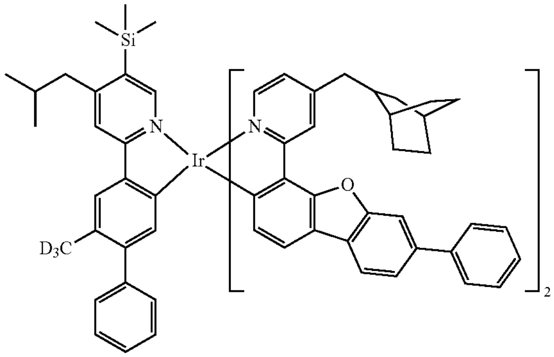
2975
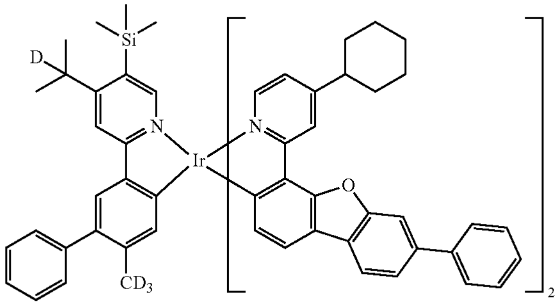
-continued
2976
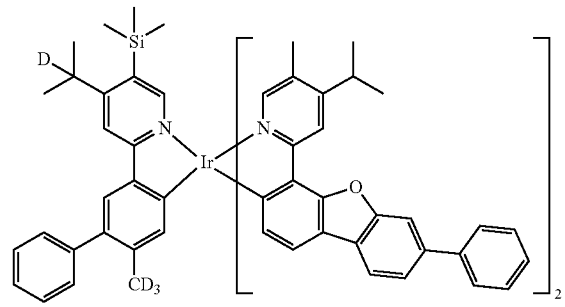
2977
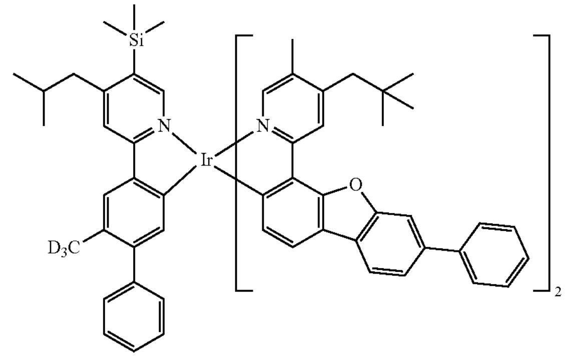
2978
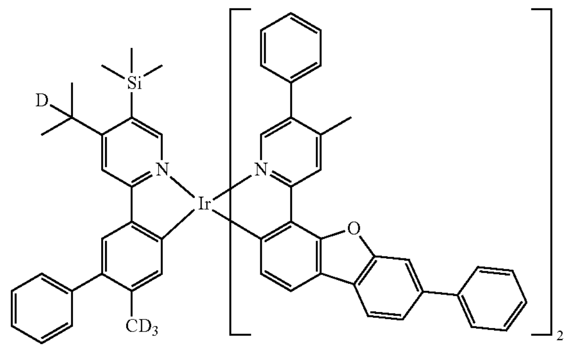
2979
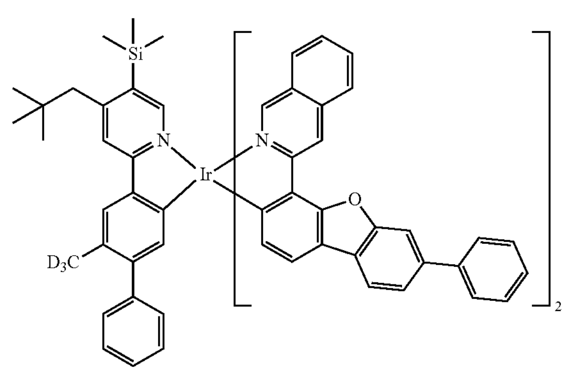

2980
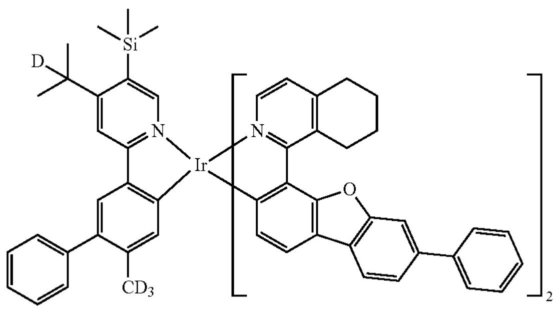
2981
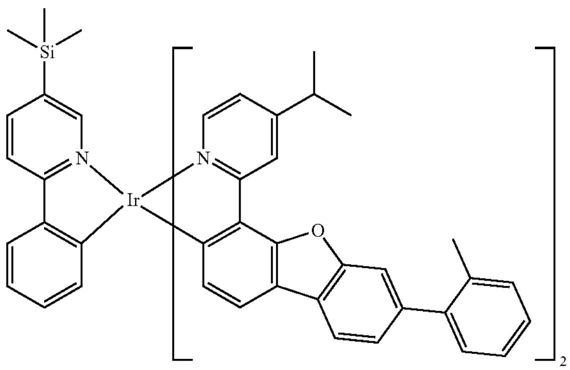
2982
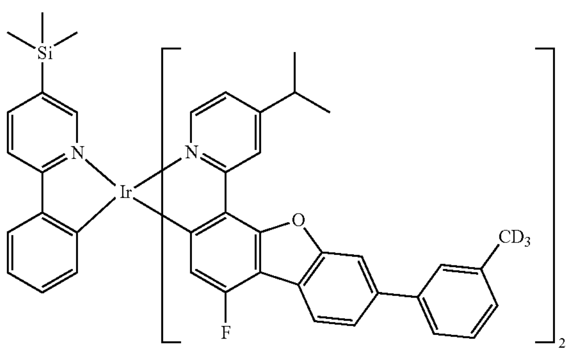
2983
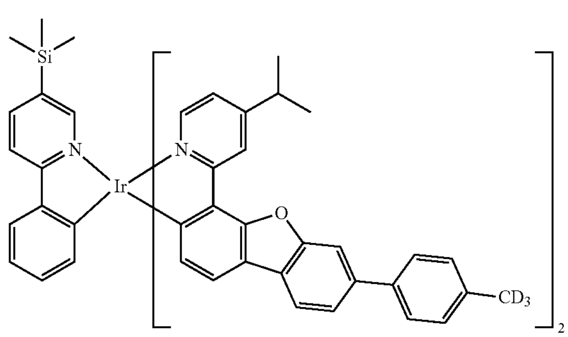
2984
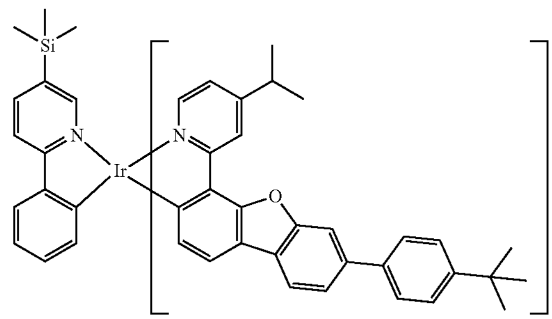
2985
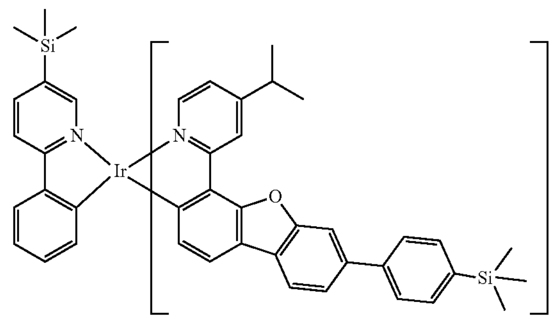
2986
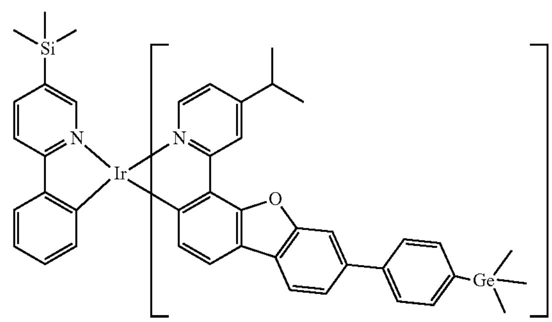
2987
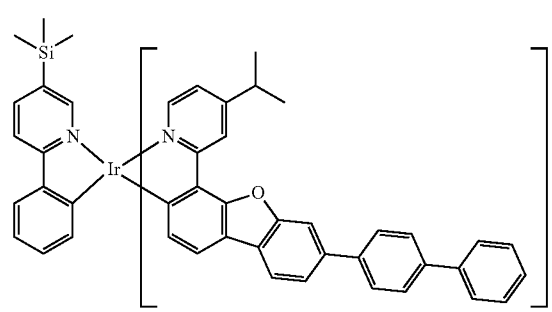

-continued
2988
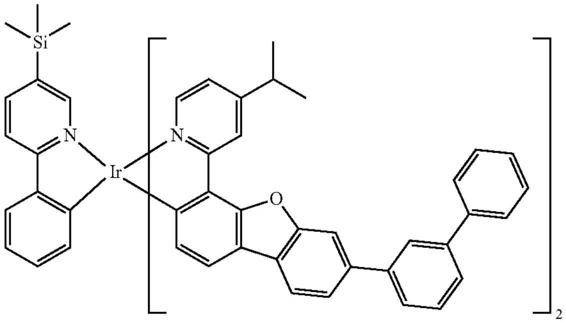
2989
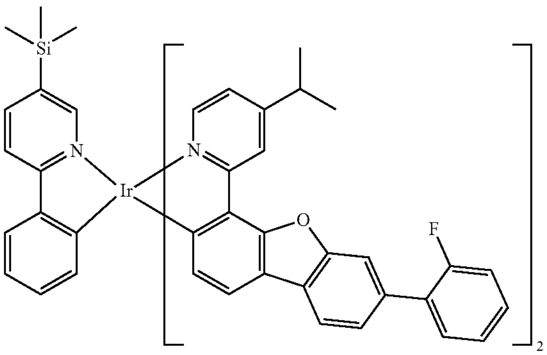
2890
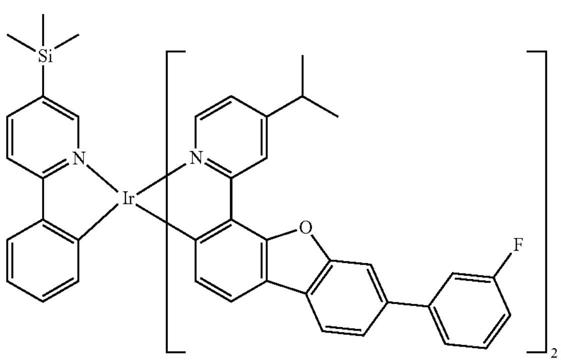
2891
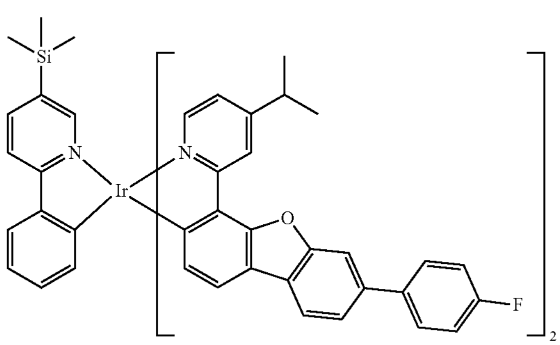
-continued
2892
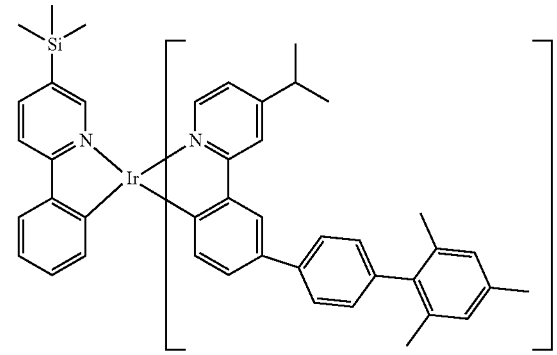
2993
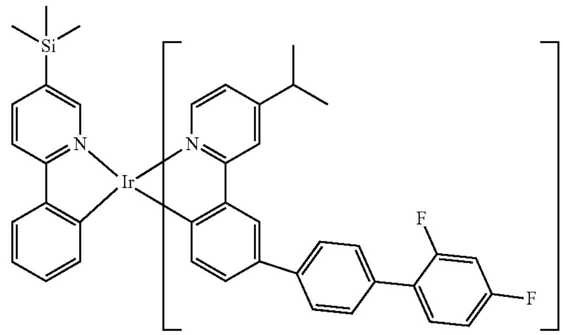
2994
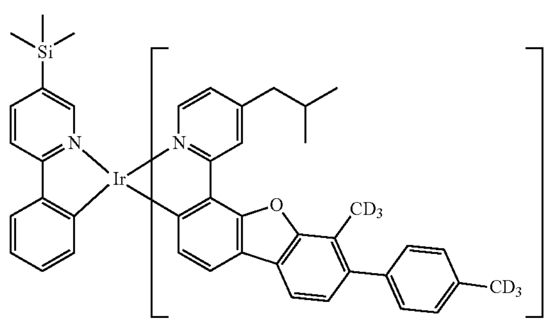
2995
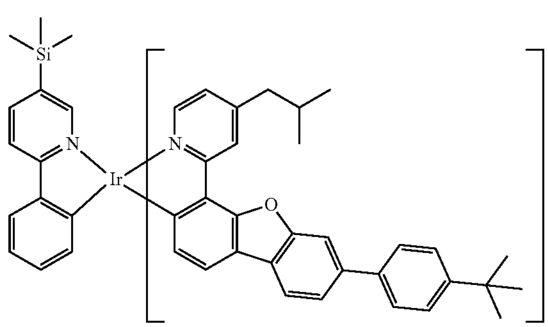

-continued
2996
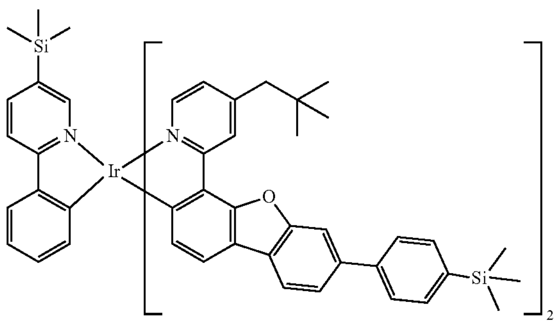
2997
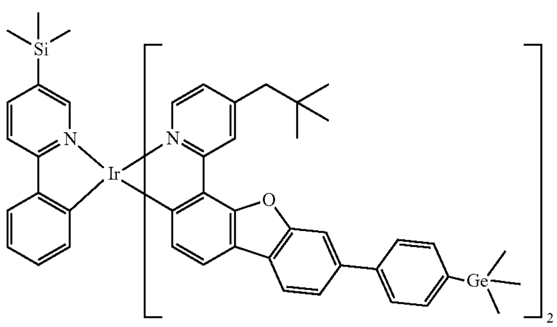
2998
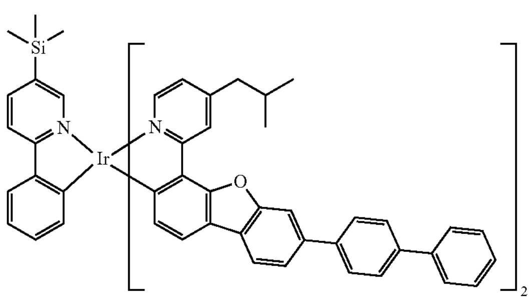
2999
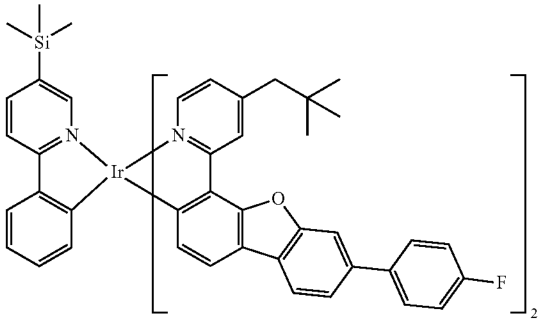
-continued
3000
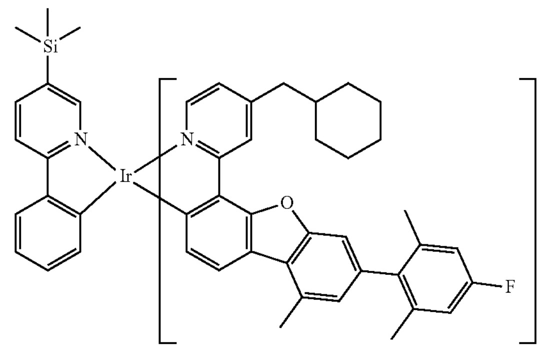
3001
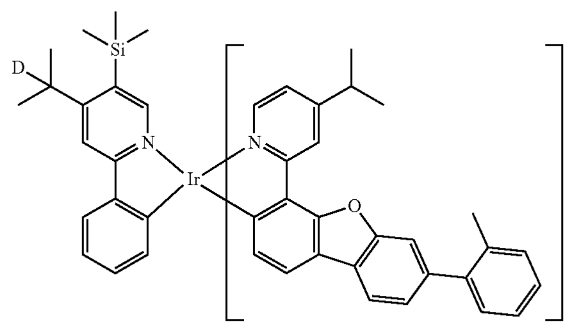
3002
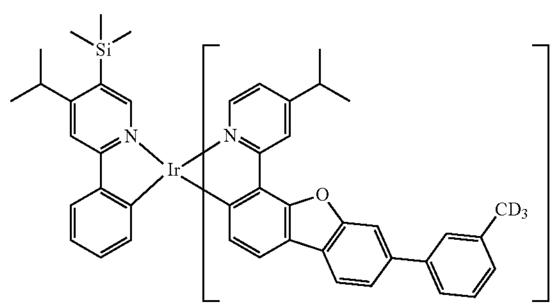
3003
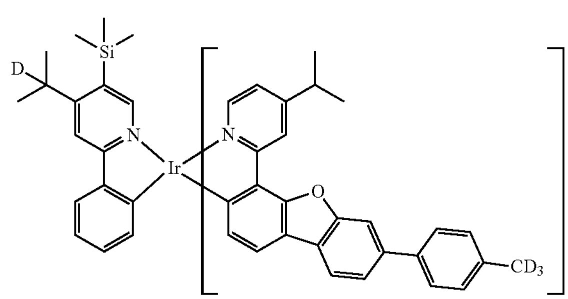

-continued
3004
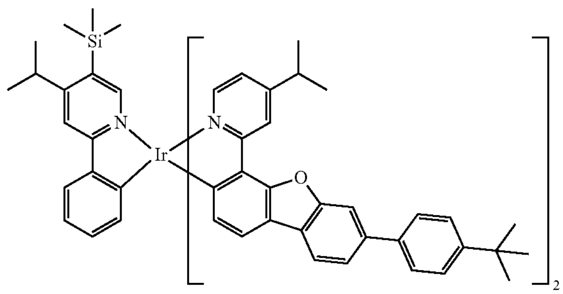
3005
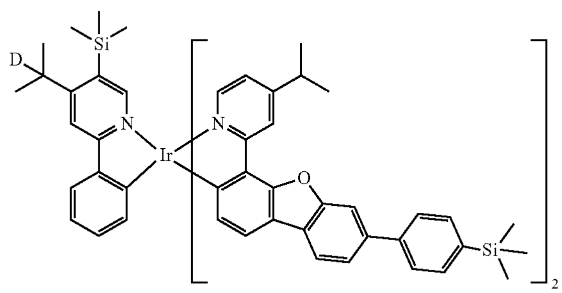
3006
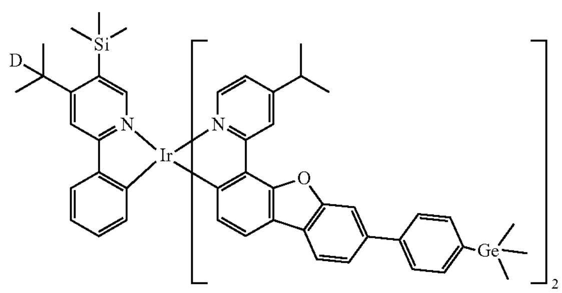
3007
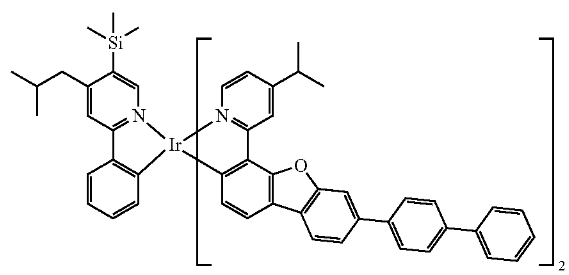
3008
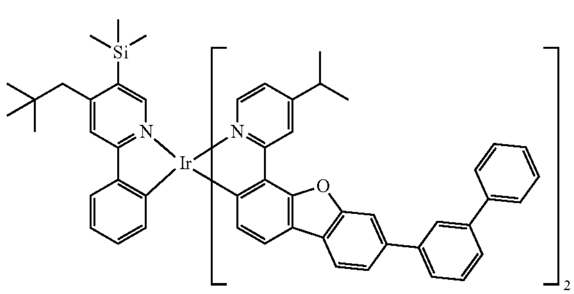
-continued
3009
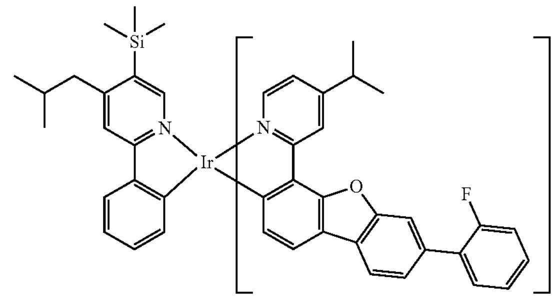
3010
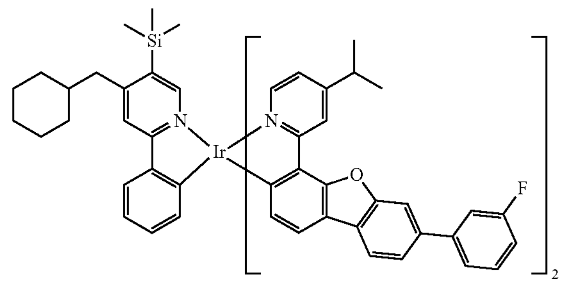
3011
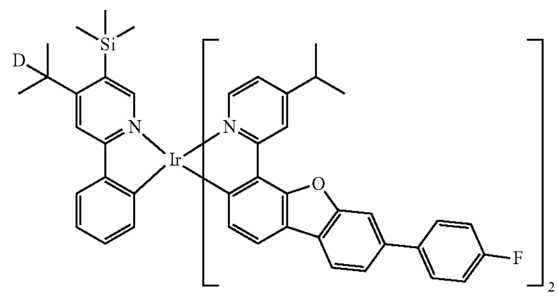
3012
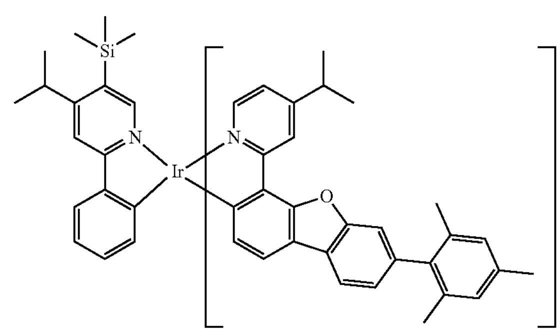
3013
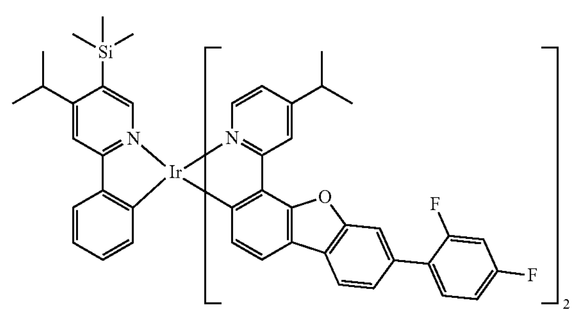

-continued
3014
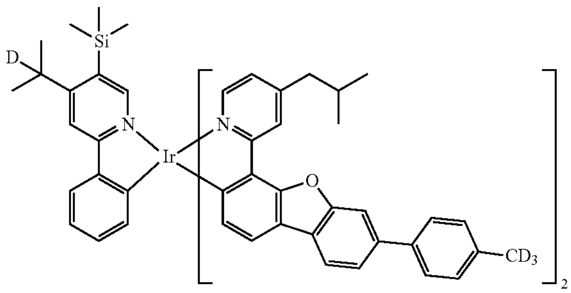
3015
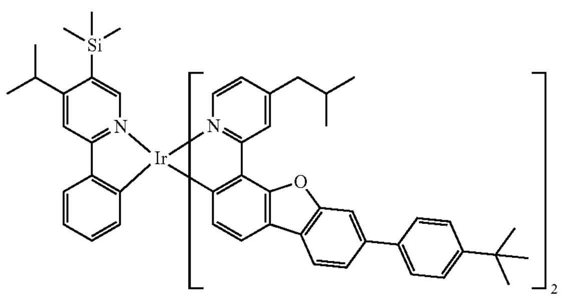
3016
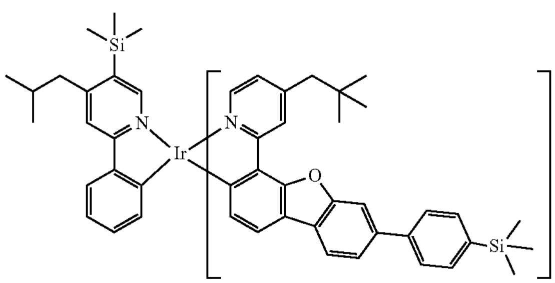
3017
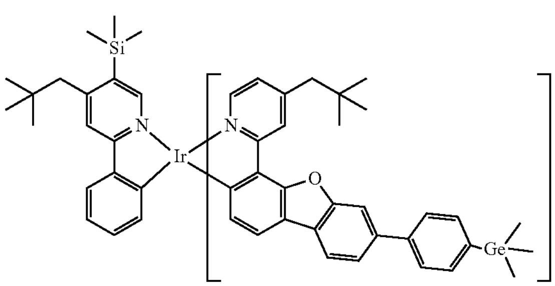
3018
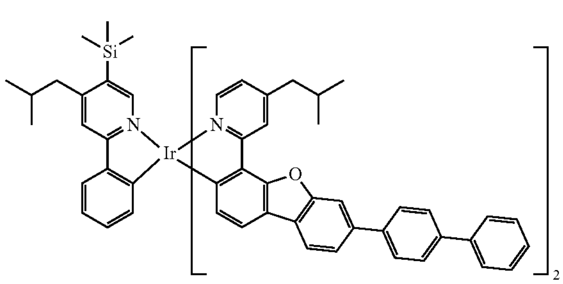
-continued
3019
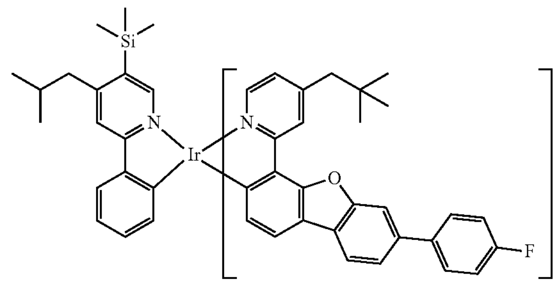
3020
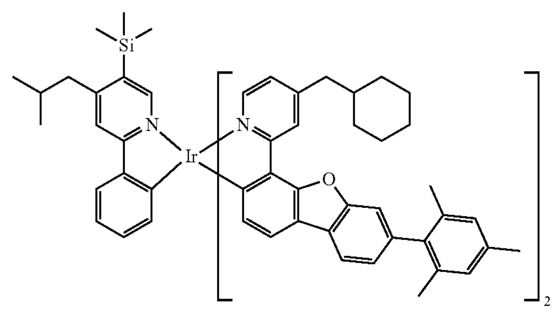
3021
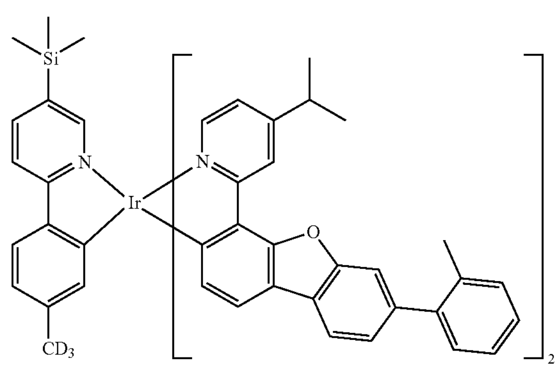
3022
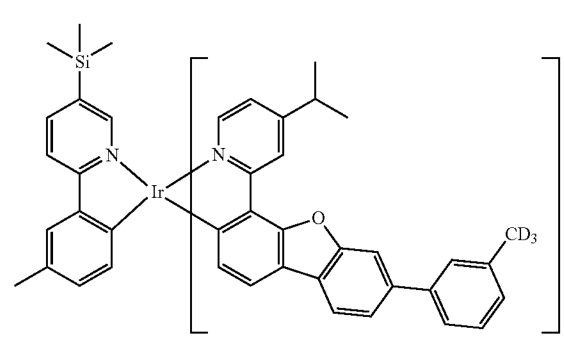

-continued
3023
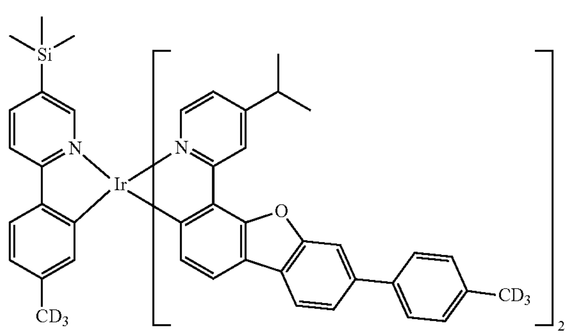
3024
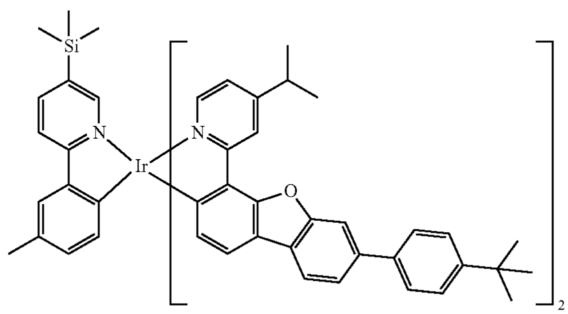
3025
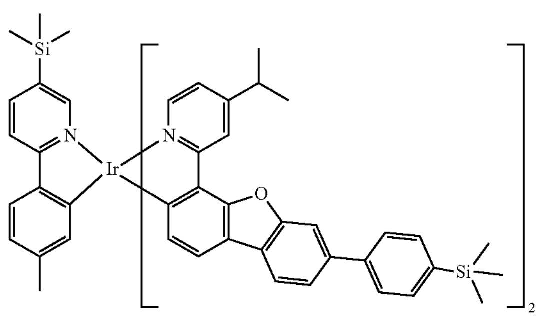
3026
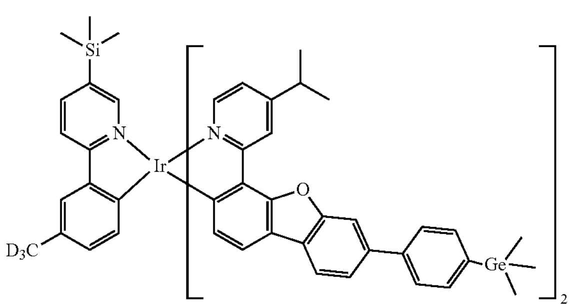
-continued
3027
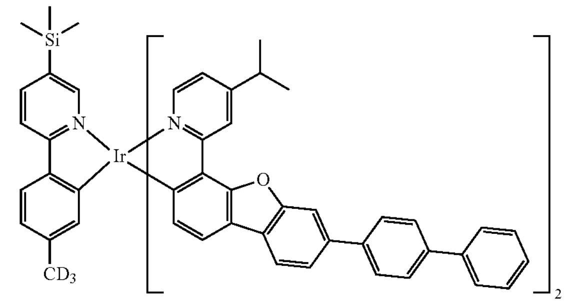
3028
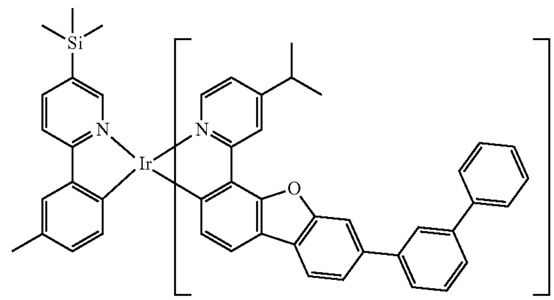
3029
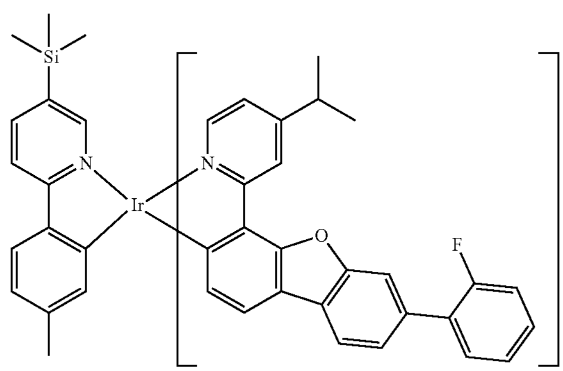
3030
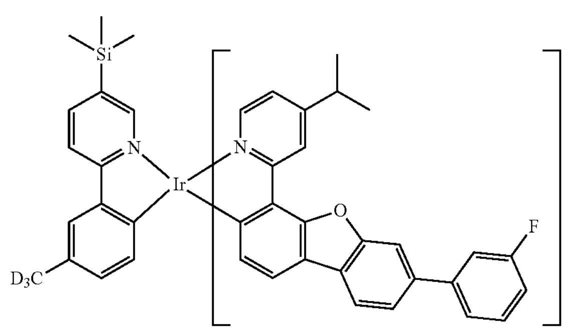

-continued
3031
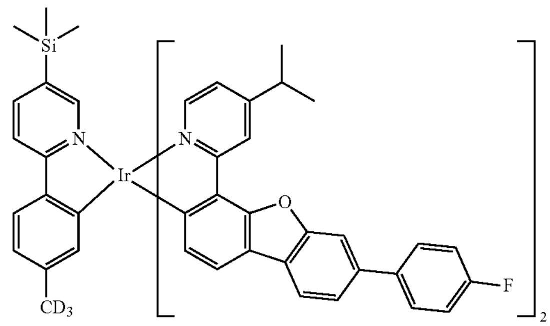
3032
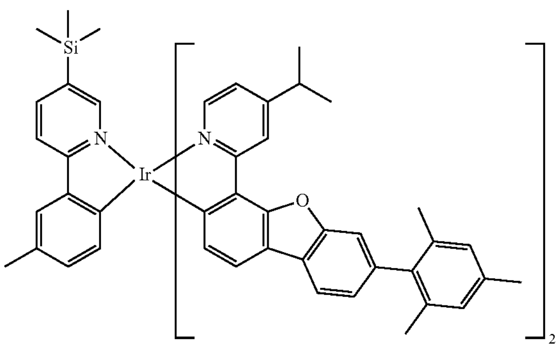
3033
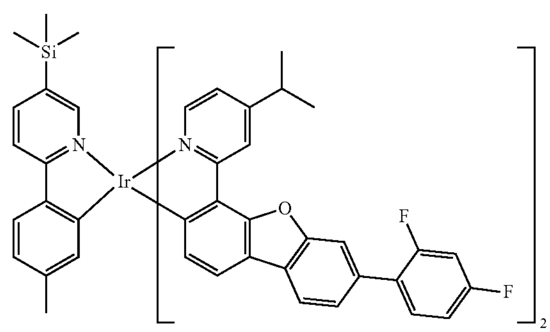
3034
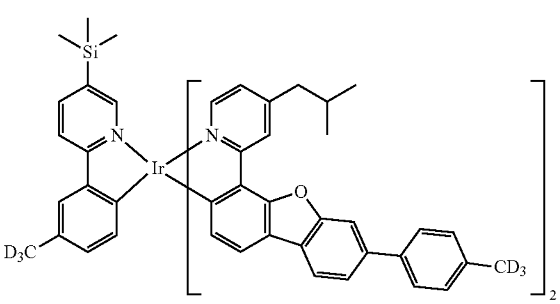
-continued
3035
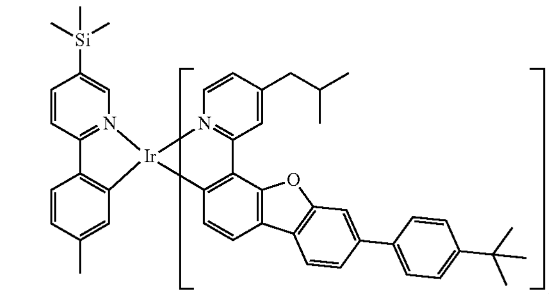
3036
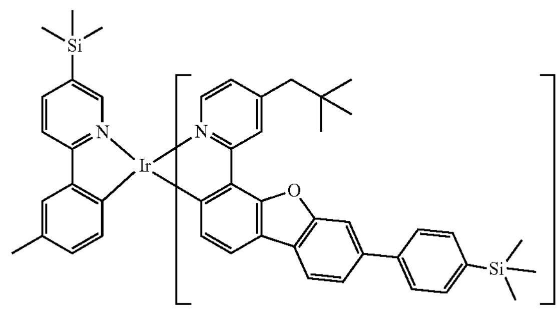
3037
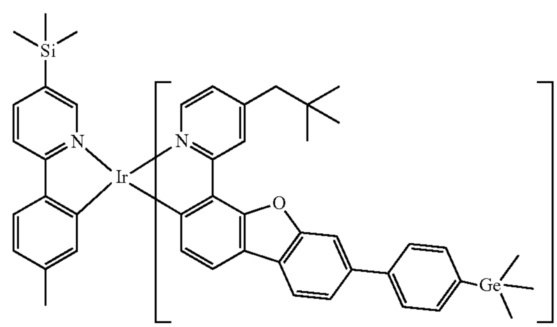
3038
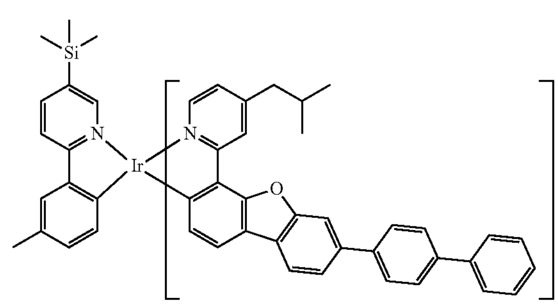

-continued
3039
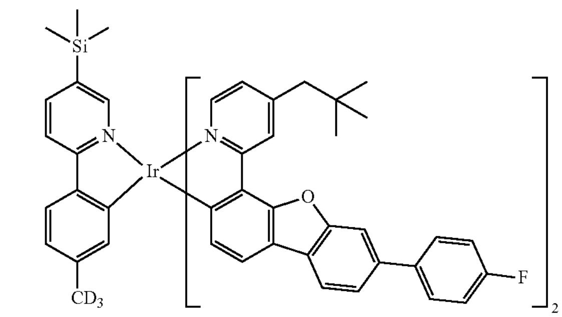
3040
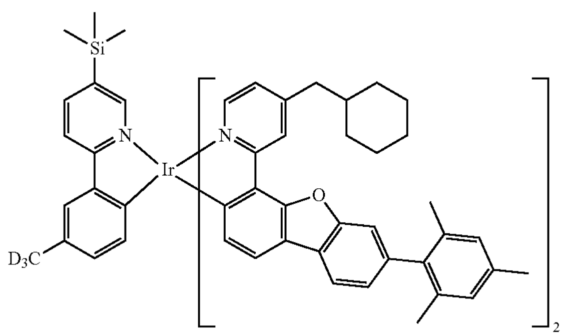
3041
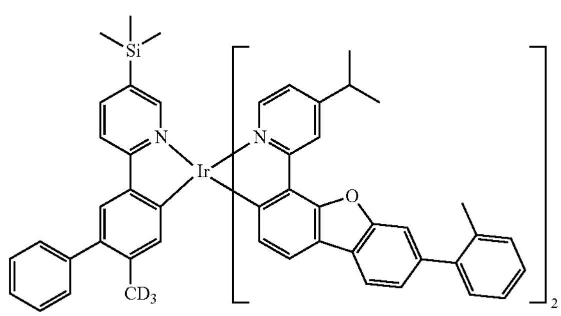
3042
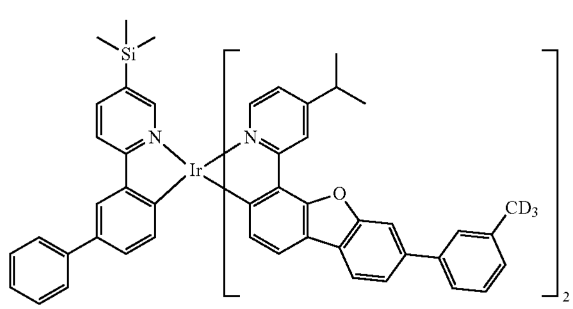
3043
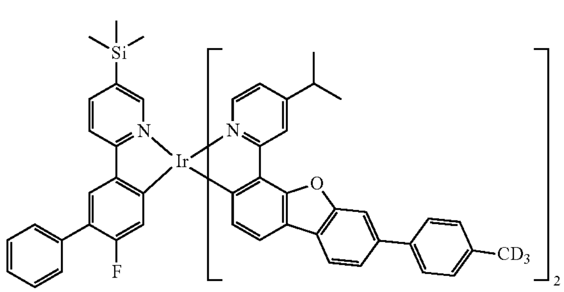
-continued
3044
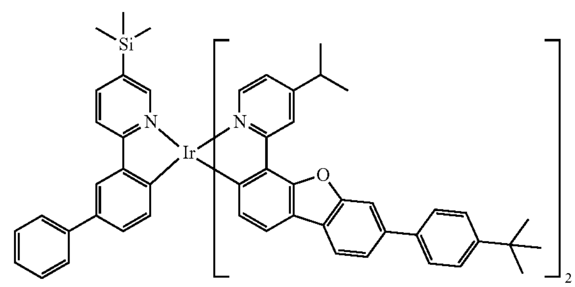
3045
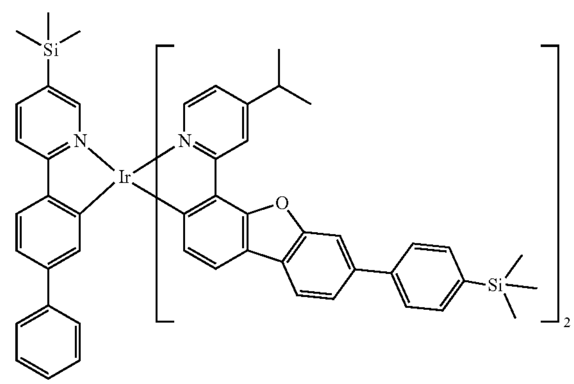
3046
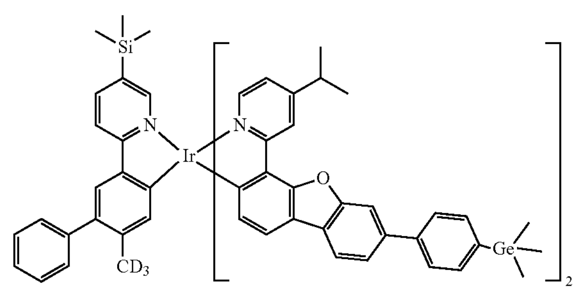
3047
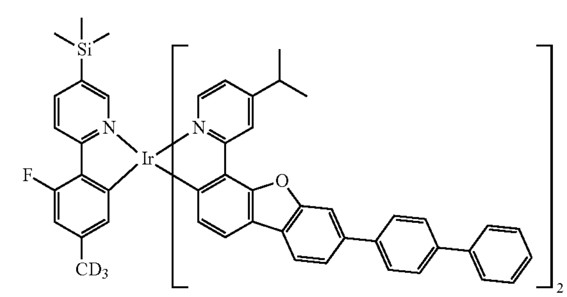
3048
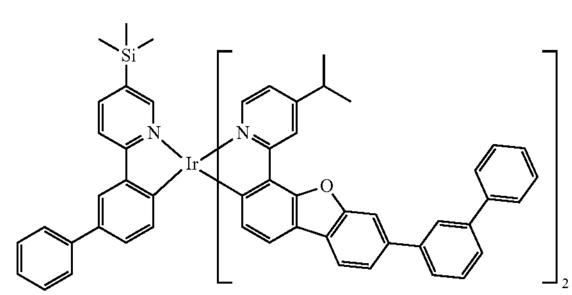

-continued
3049
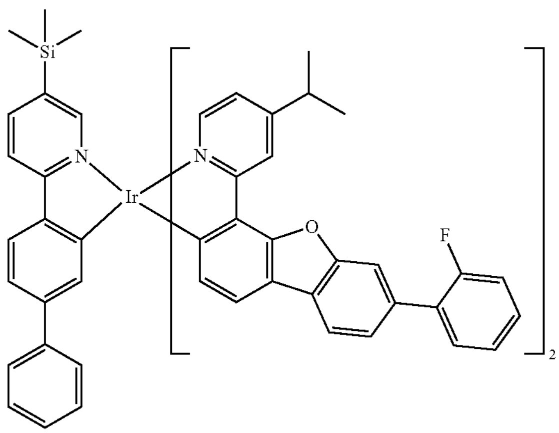
3050
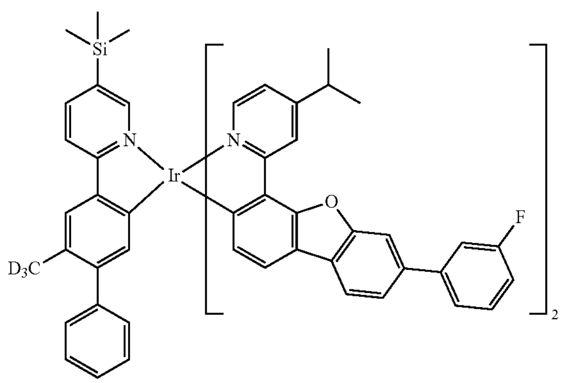
3051
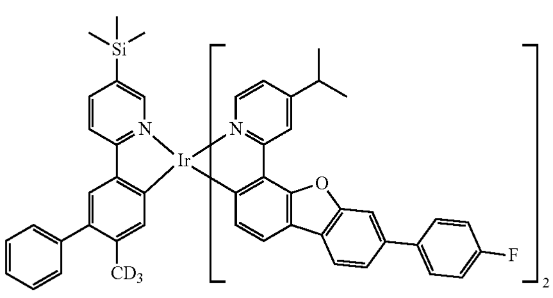
3052
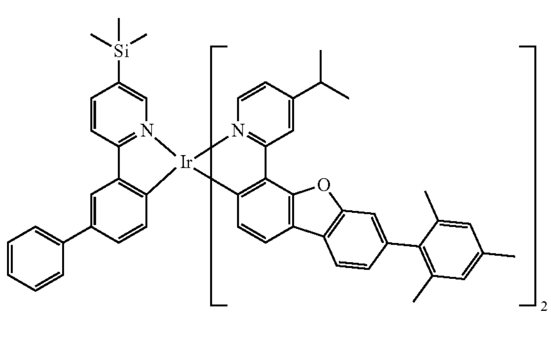
-continued
3053
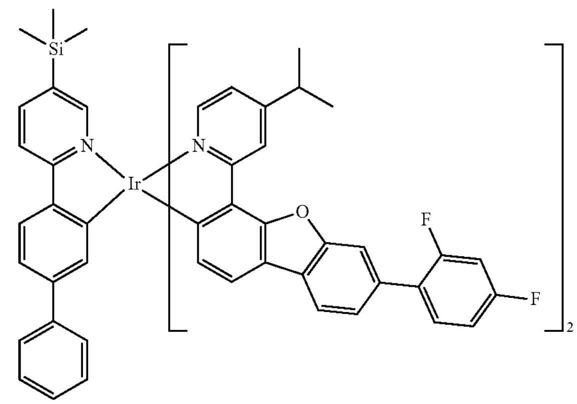
3054
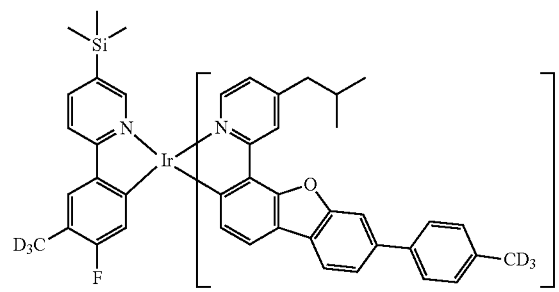
3055
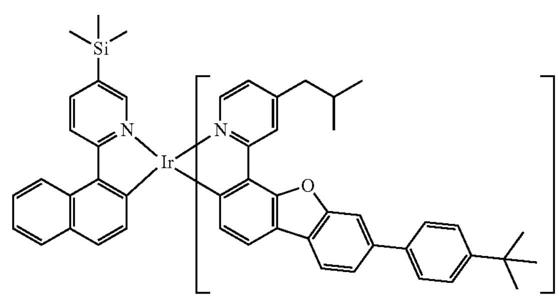
3056
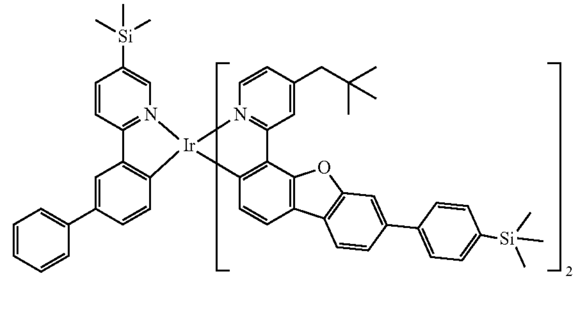

-continued
3057
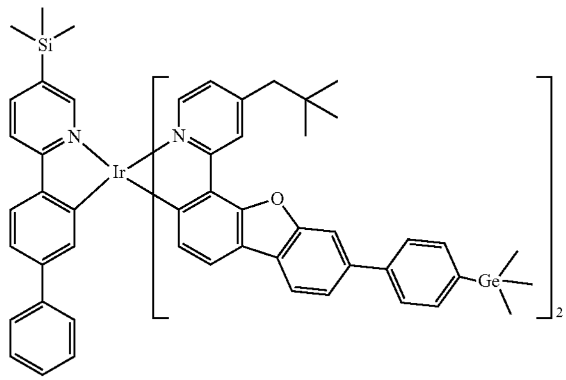
3058
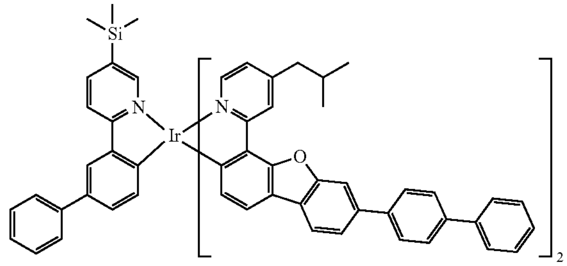
3059
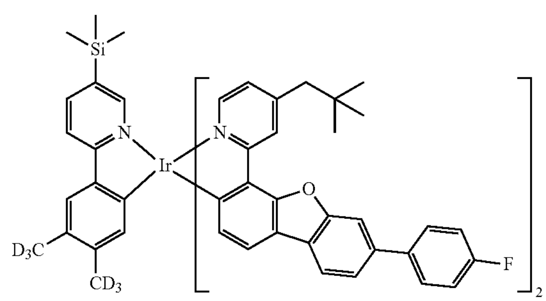
3060
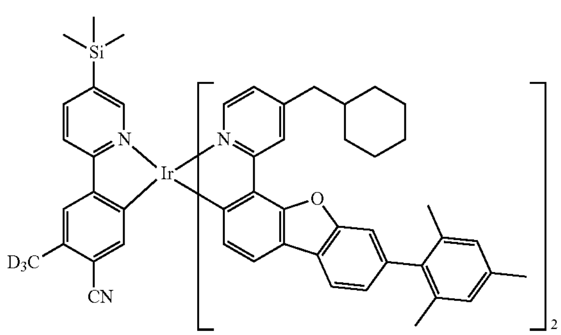
-continued
3061
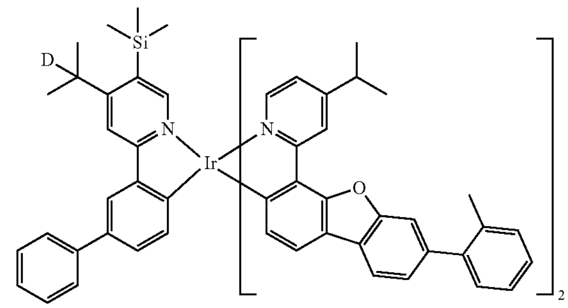
3062
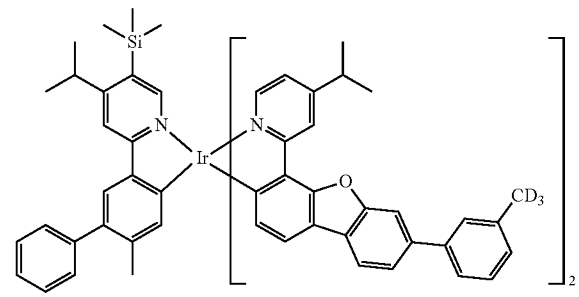
3063
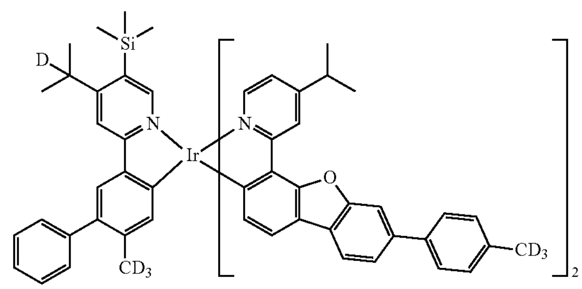
3064
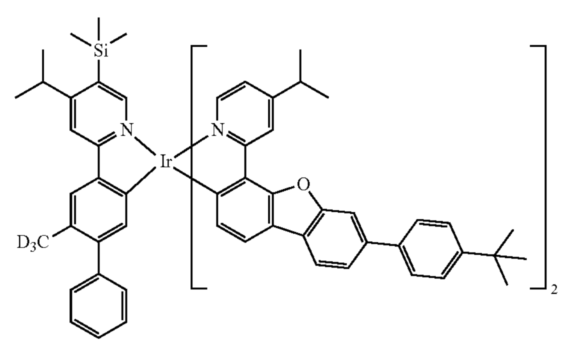
3065
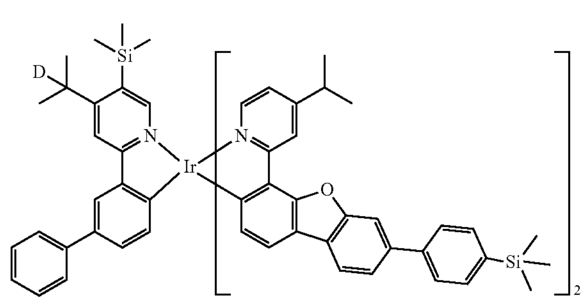

-continued
3066
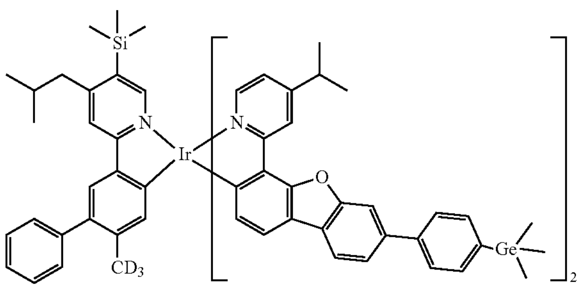
3067
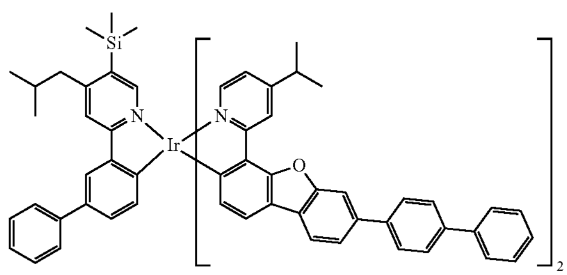
3068
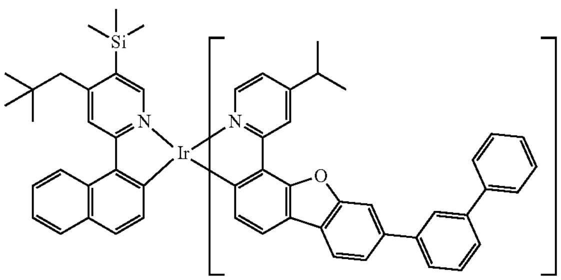
3069
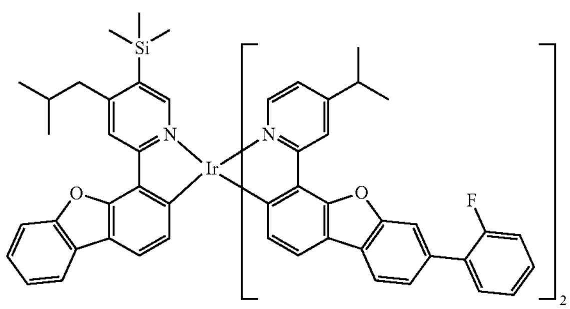
3070
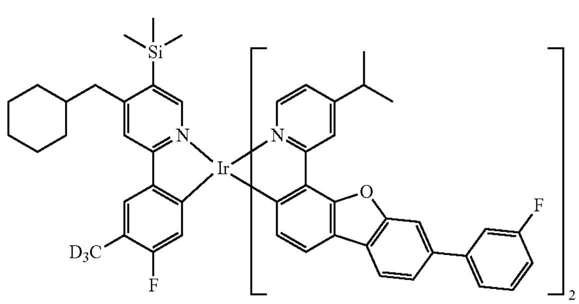
-continued
3071
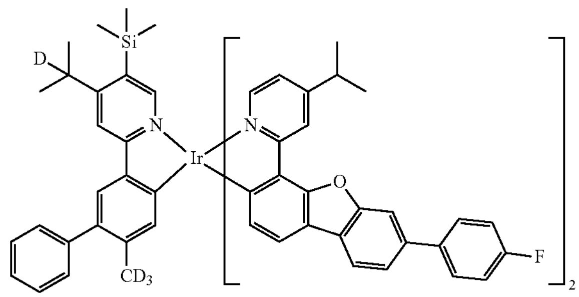
3072
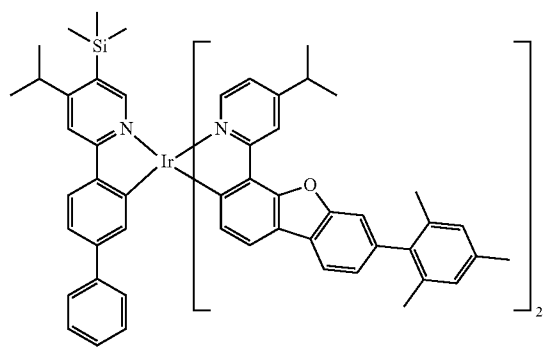
3073
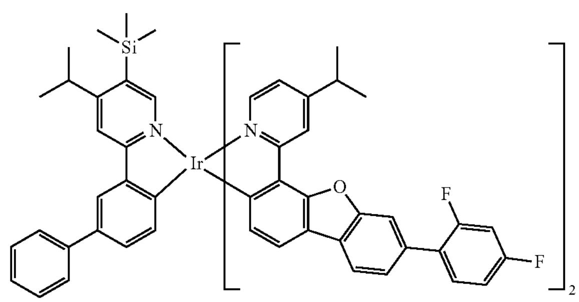
3074
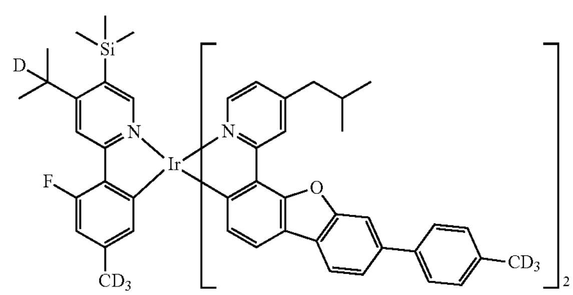
3075
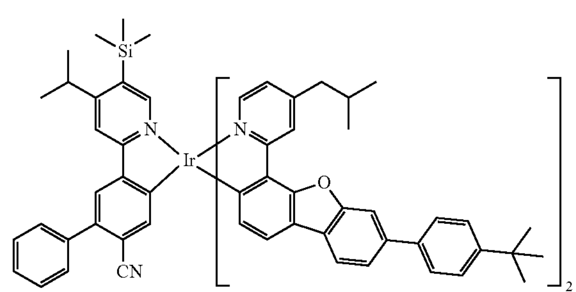

-continued
3076
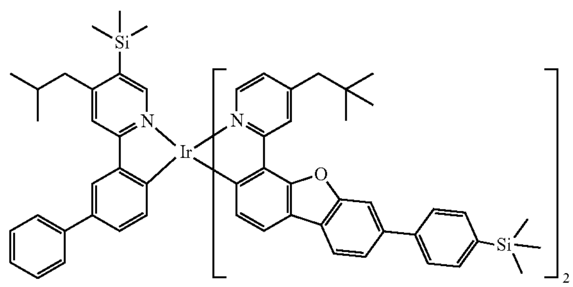
3077
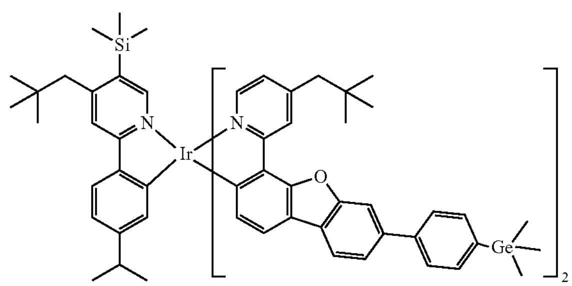
3078
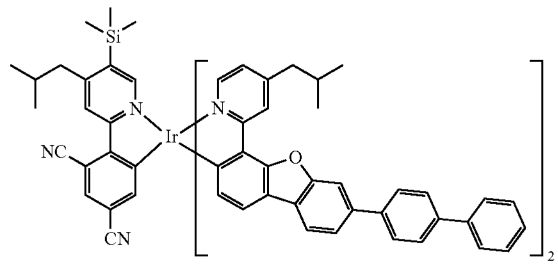
3079
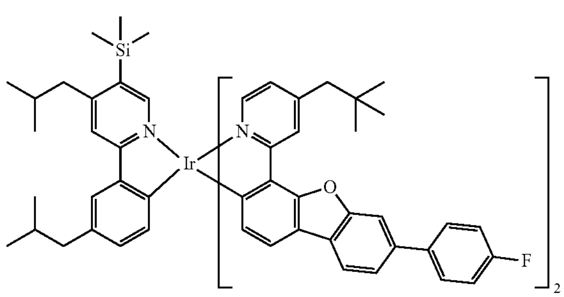
3080
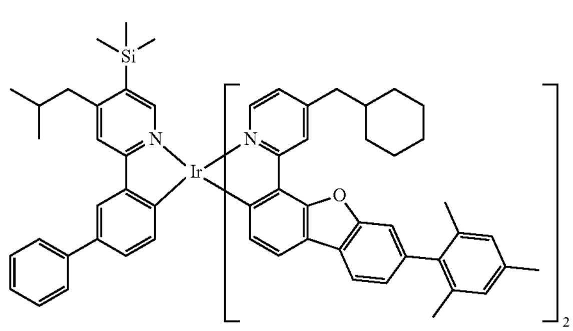
-continued
3081
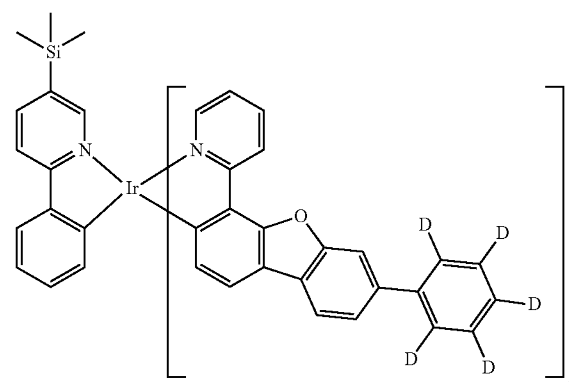
3082
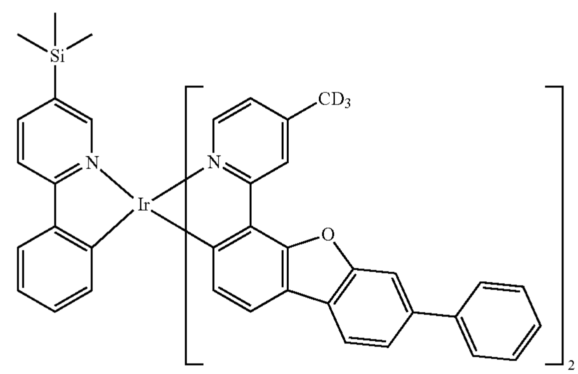
3083
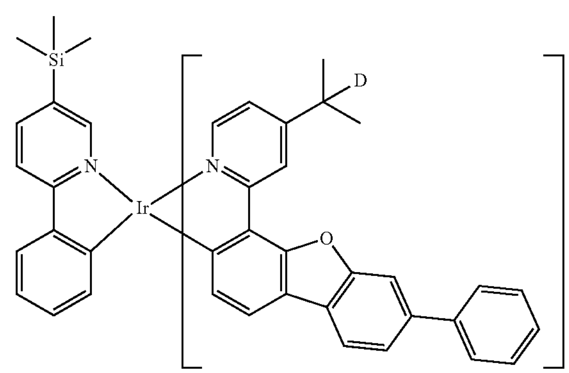
3084
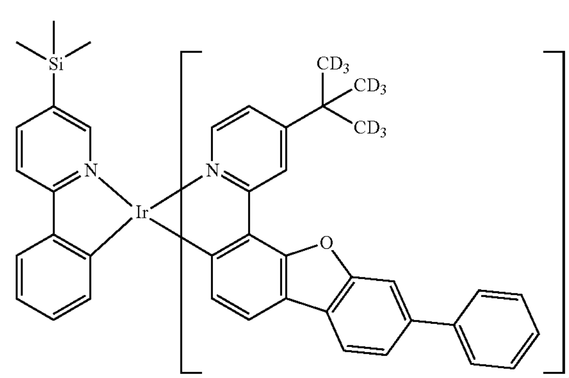

3085
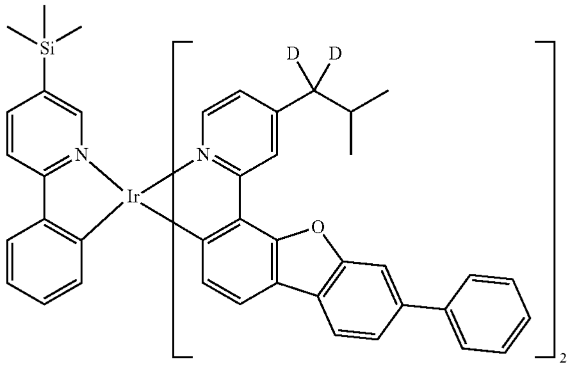
3086
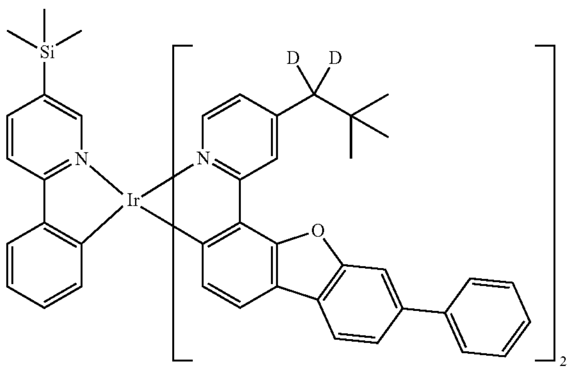
3087
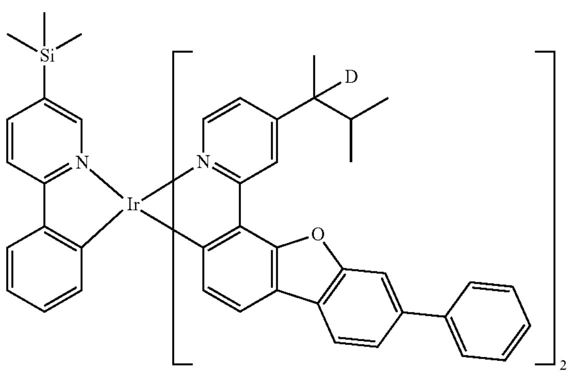
3088
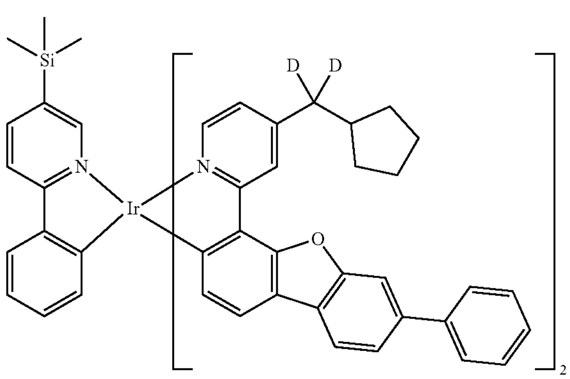
3089
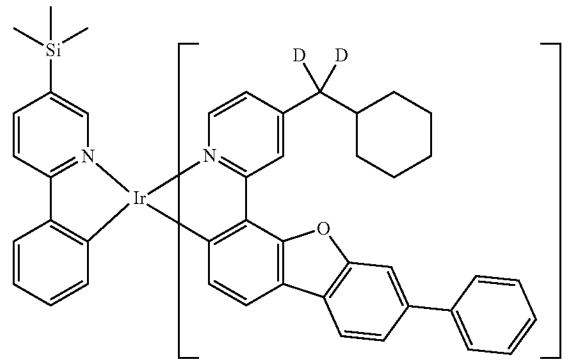
3090
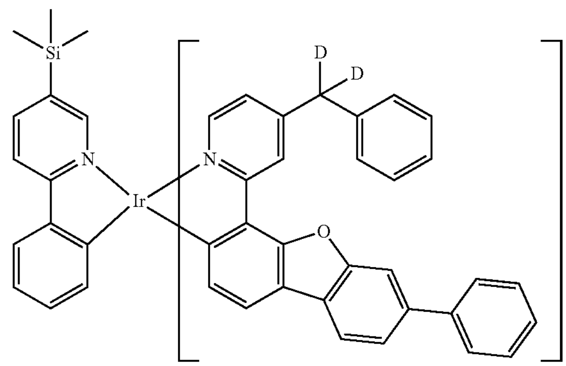
3091
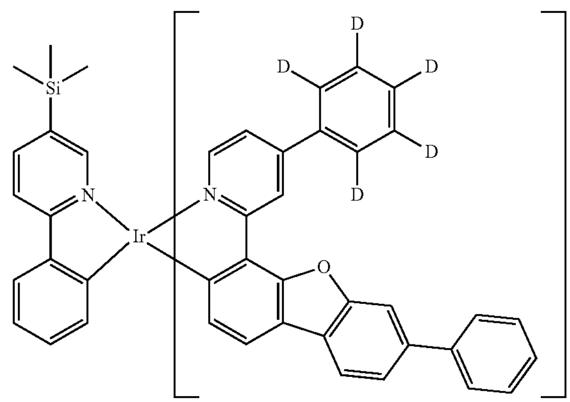
3092
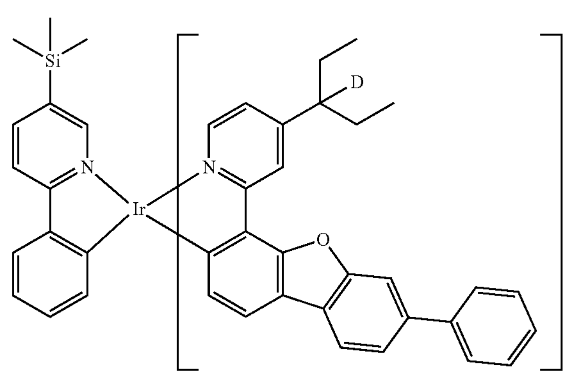

-continued
3093
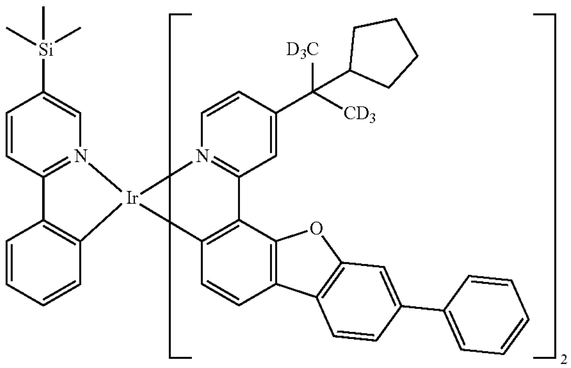
3094
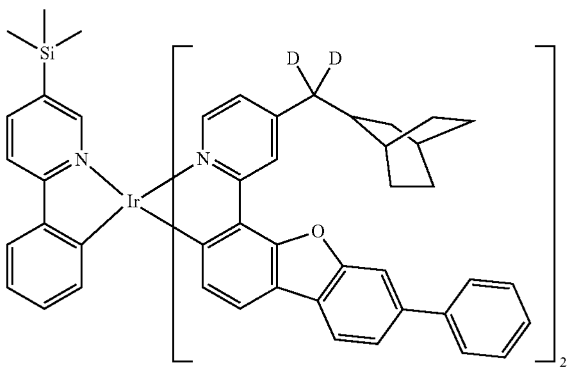
3095
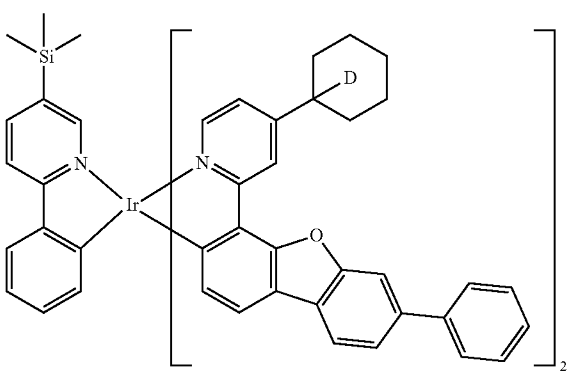
3096
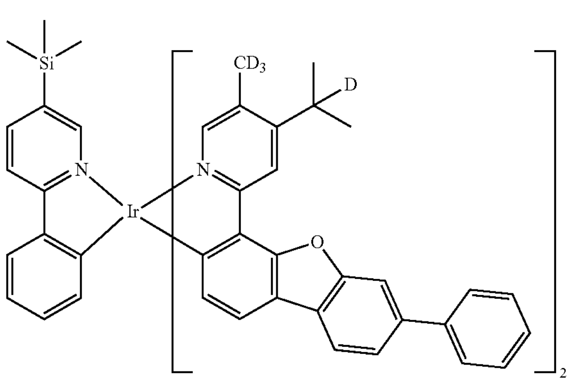
-continued
3097
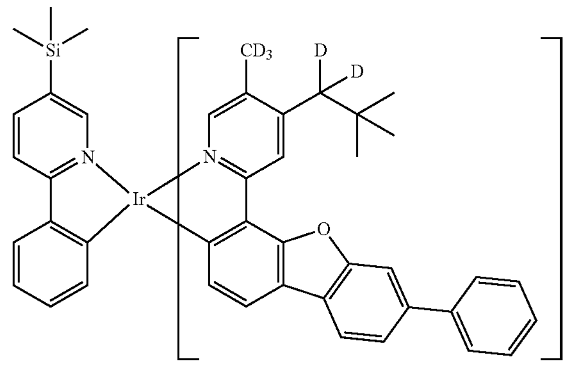
3098
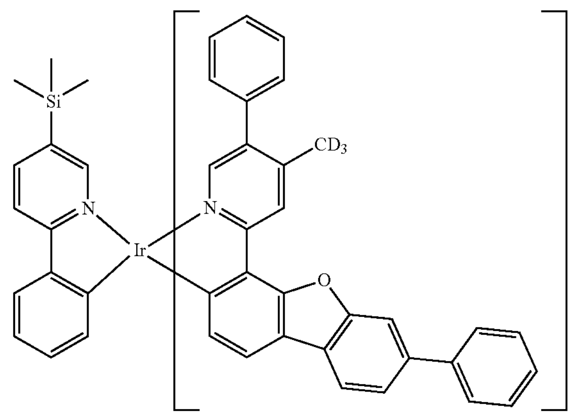
3099
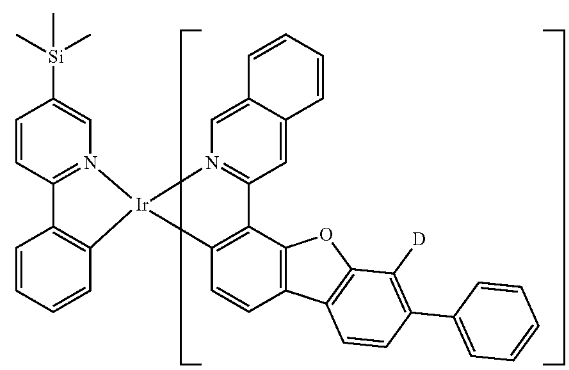
3100
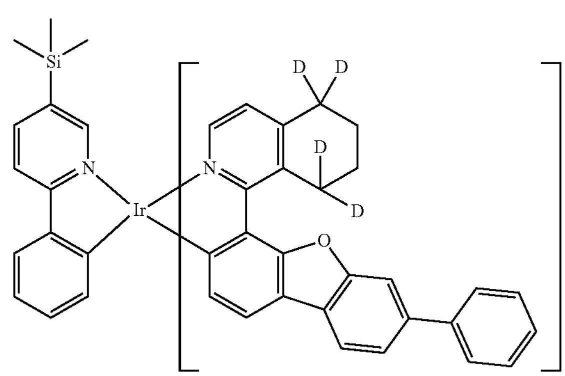

-continued
3101
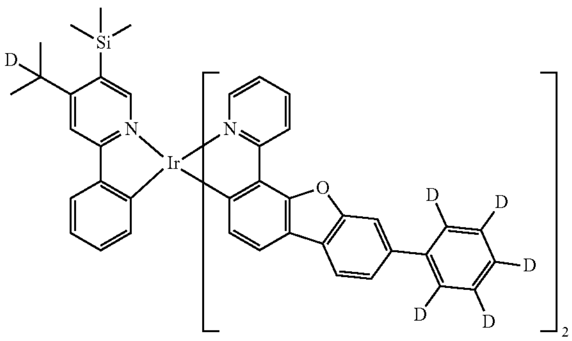
3102
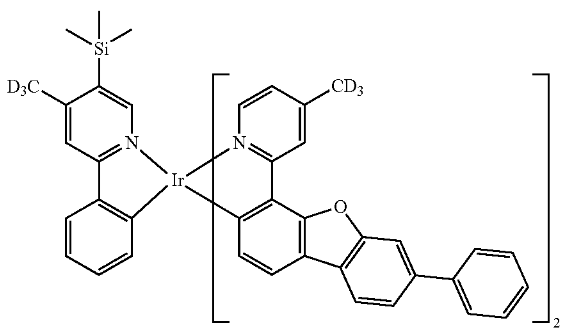
3103
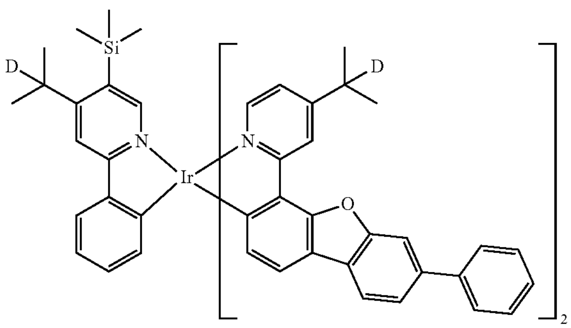
3104
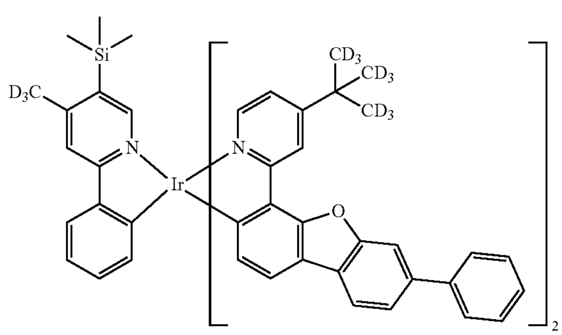
-continued
3105
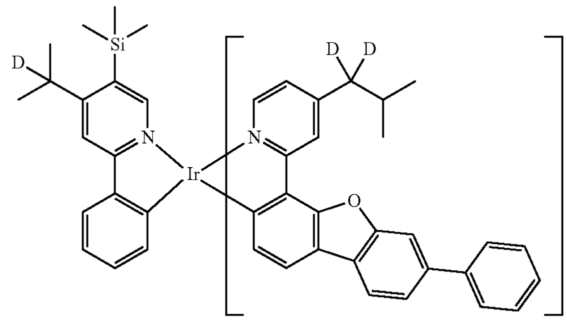
3106
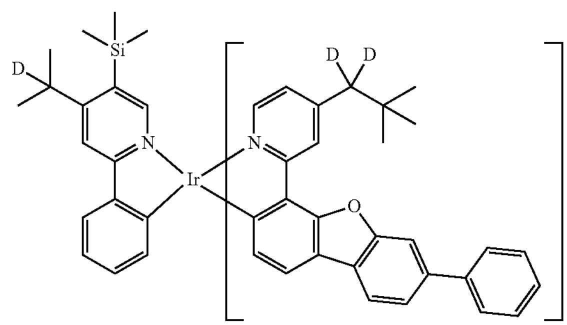
3107
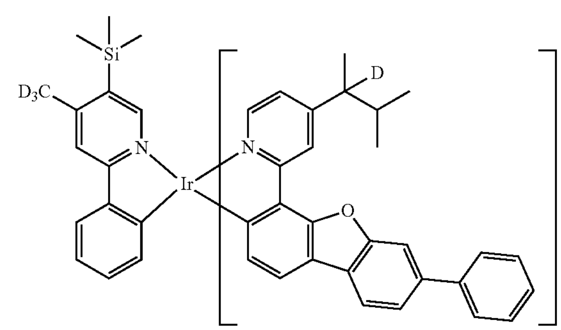
3108
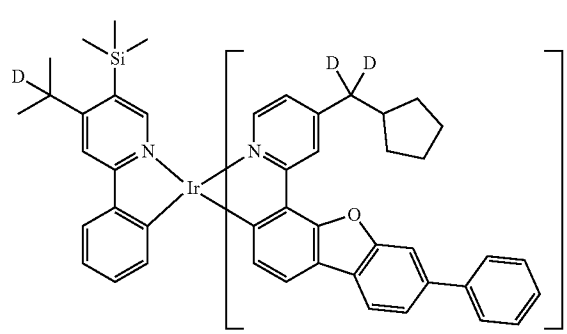

-continued
3109
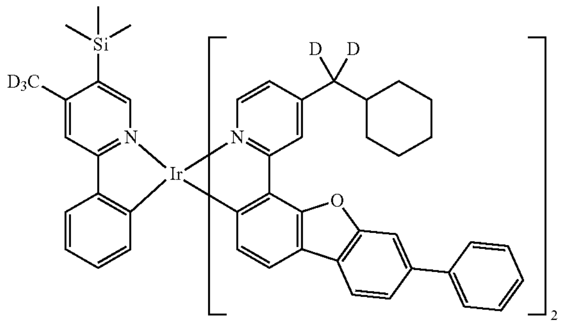
3110
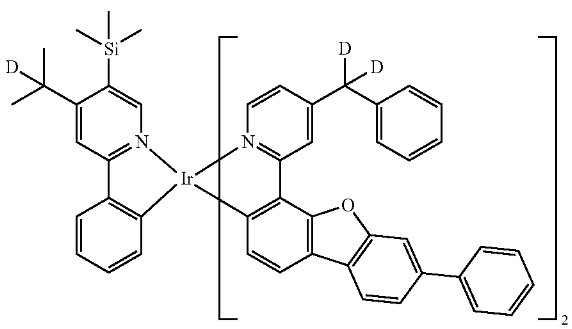
3111
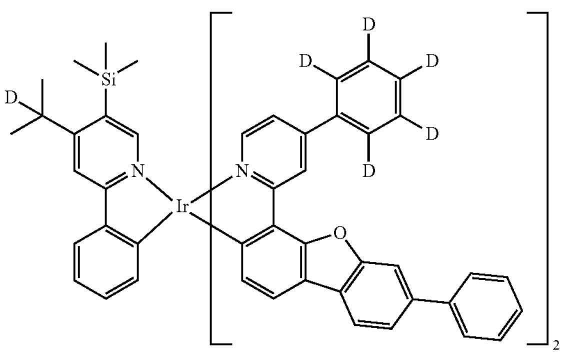
3112
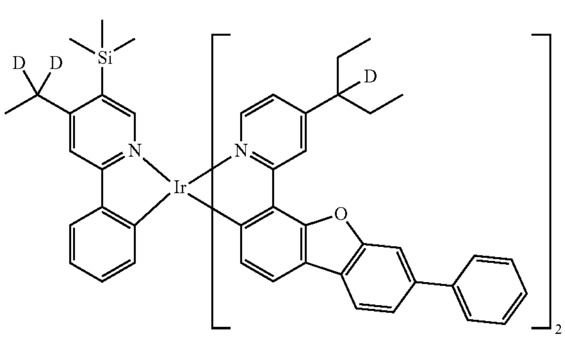
-continued
3113
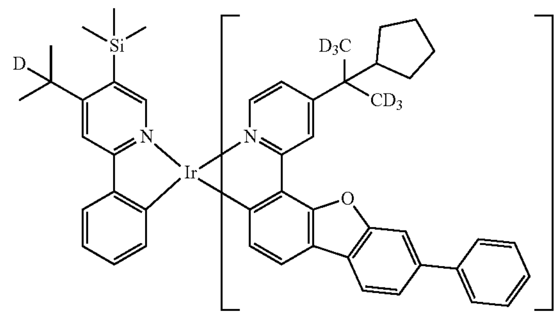
3114
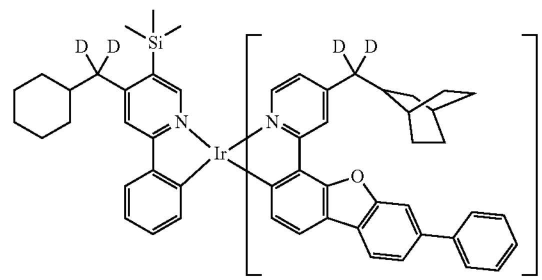
3115
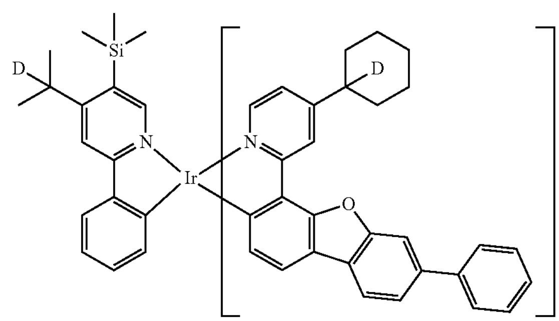
3116
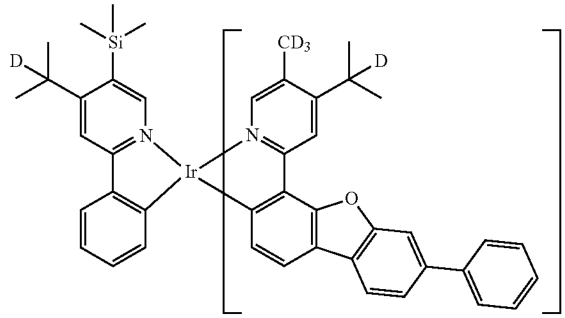

-continued
3117
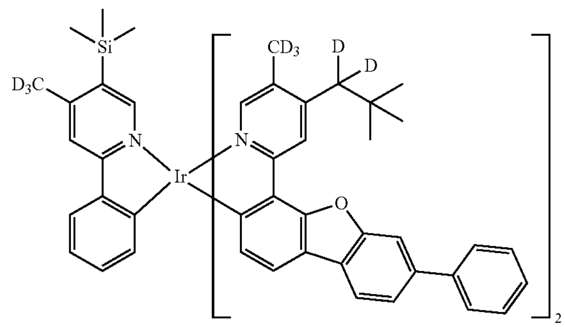
3118
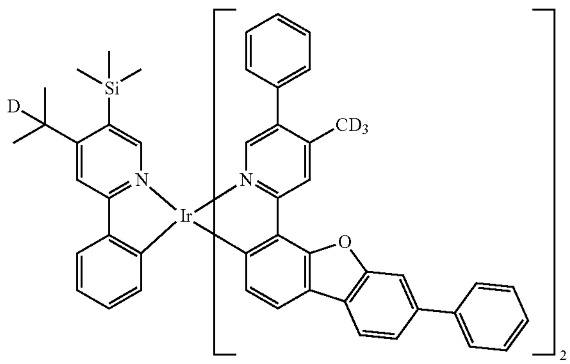
3119
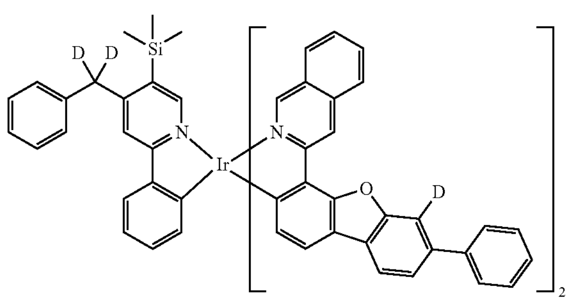
3120
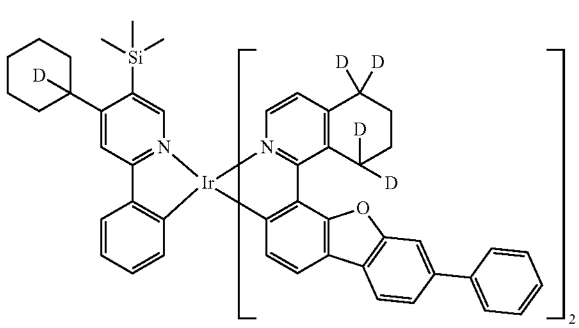
-continued
3121
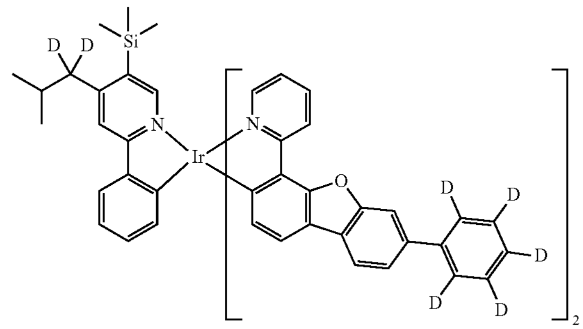
3122
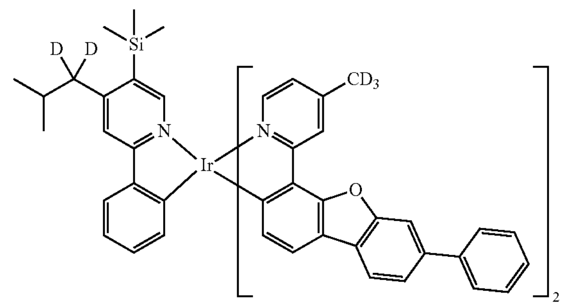
3123
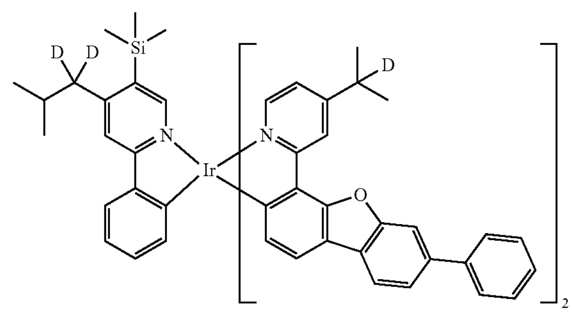
3124
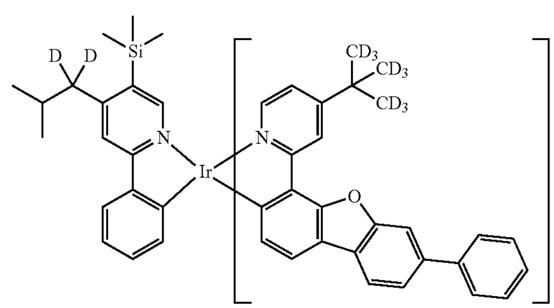

-continued
3125
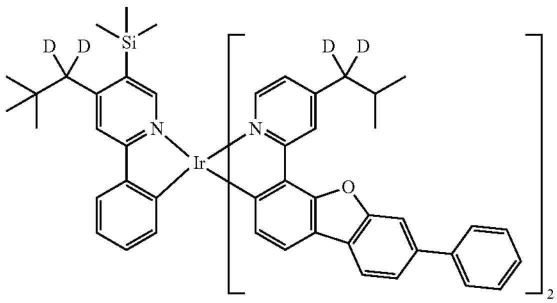
3126
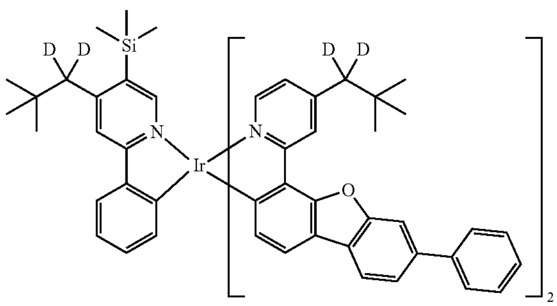
3127
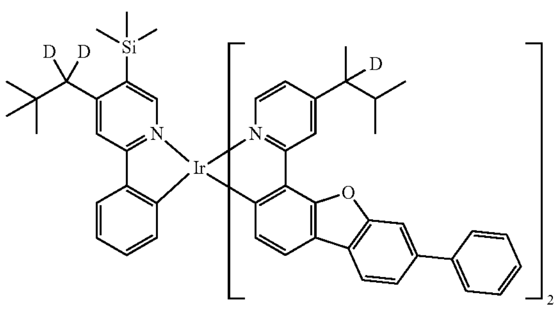
3128
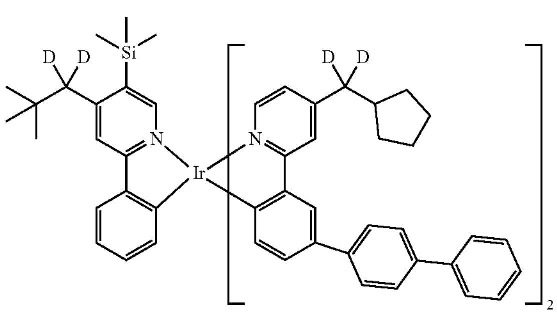
3129
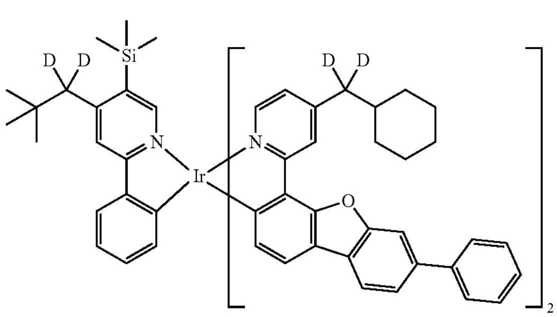
-continued
3130
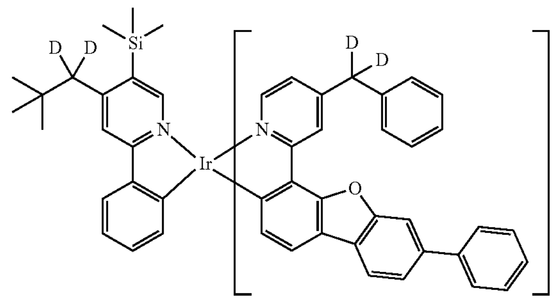
3131
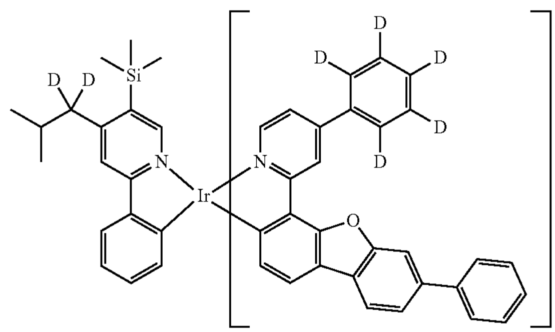
3132
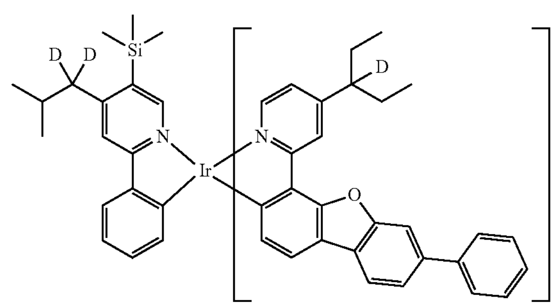
3133
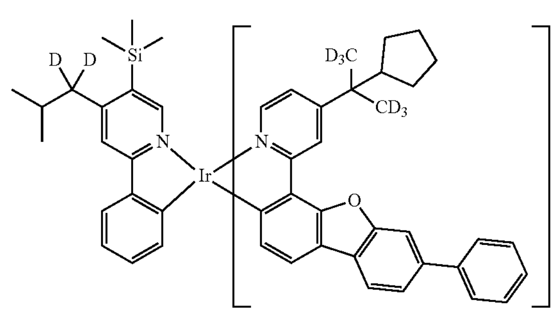

3134
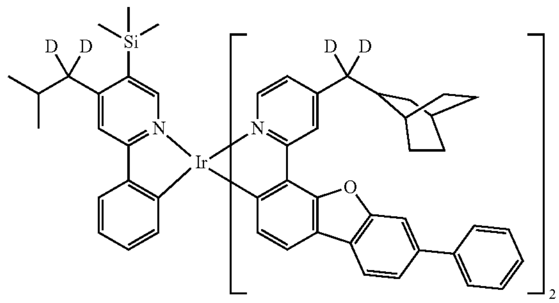
3135
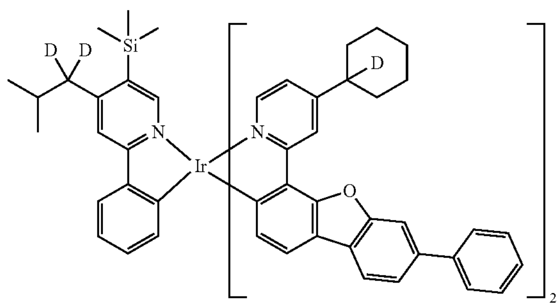
3136
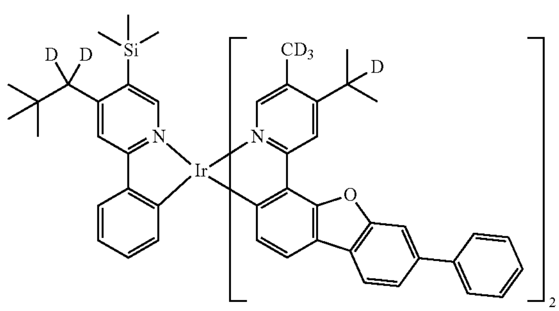
3137
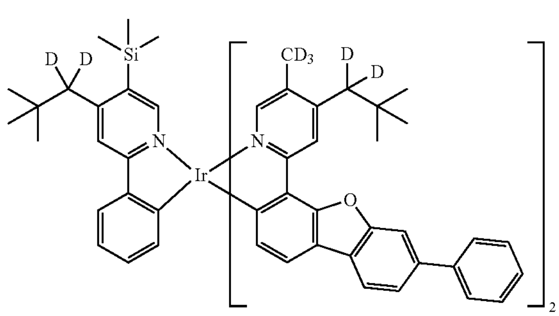
3138
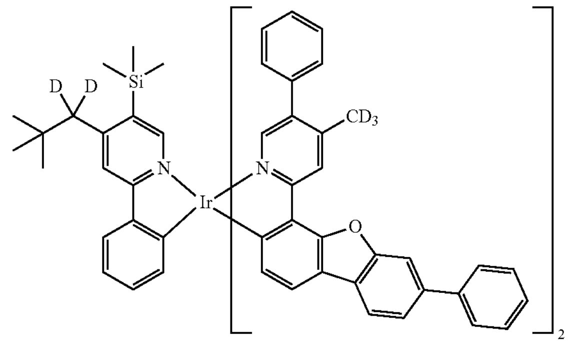
3139
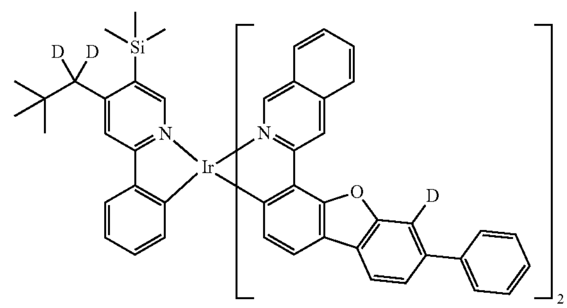
3140
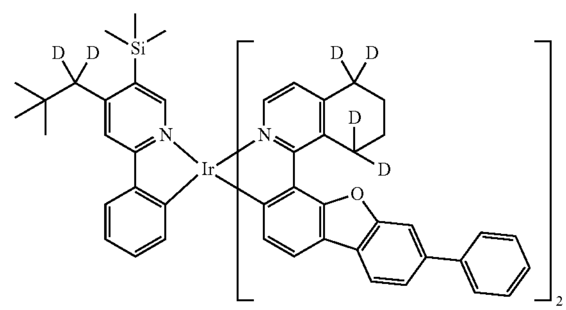
3141
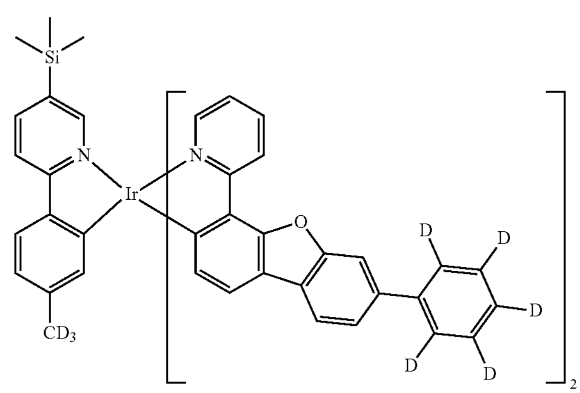

-continued
3142
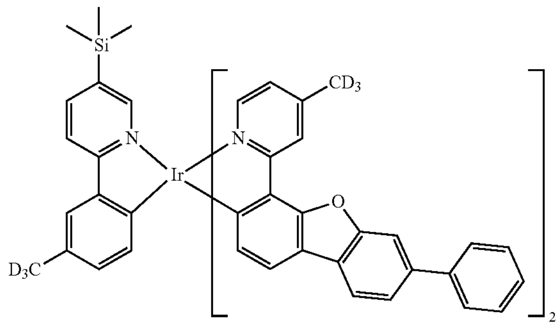
3143
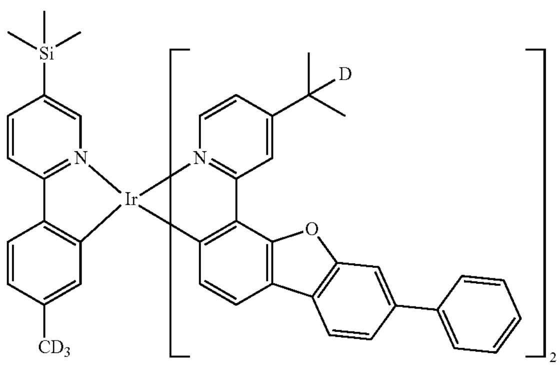
3144
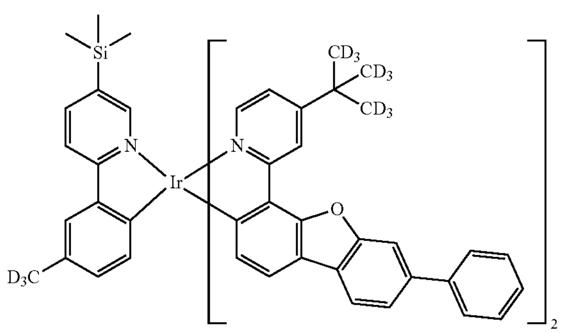
3145
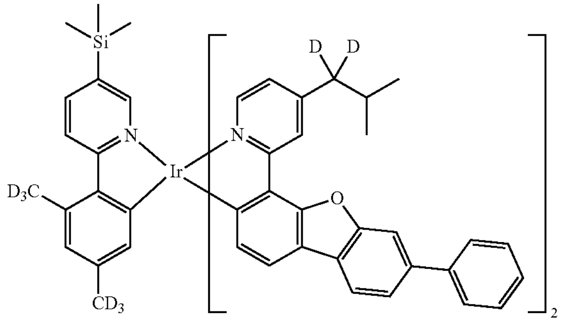
-continued
3146
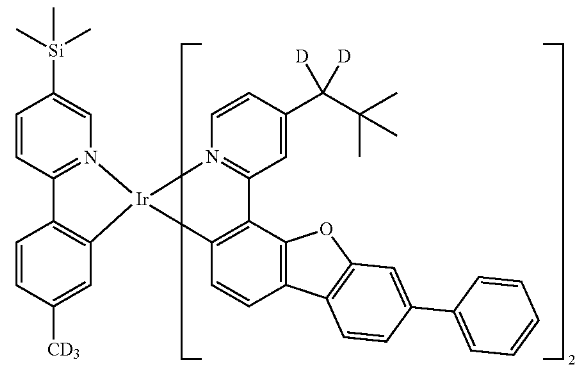
3147
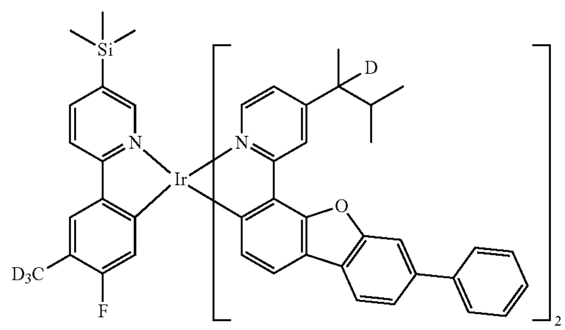
3148
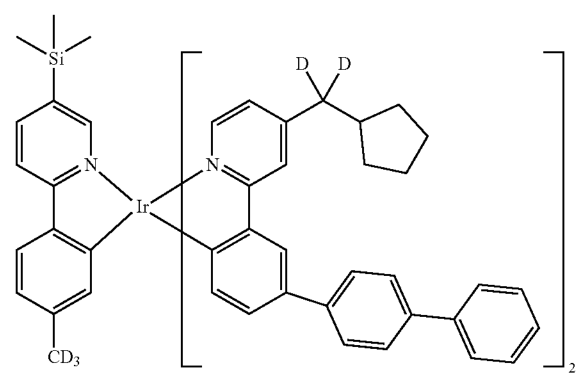
3149
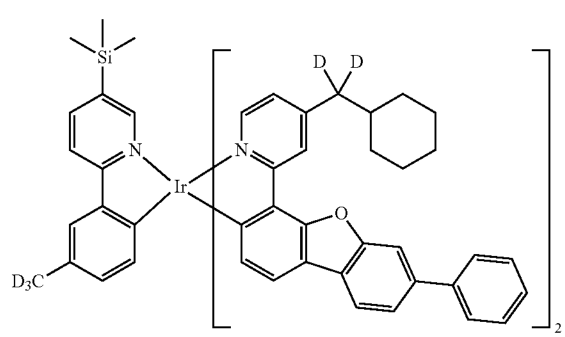

-continued
3150
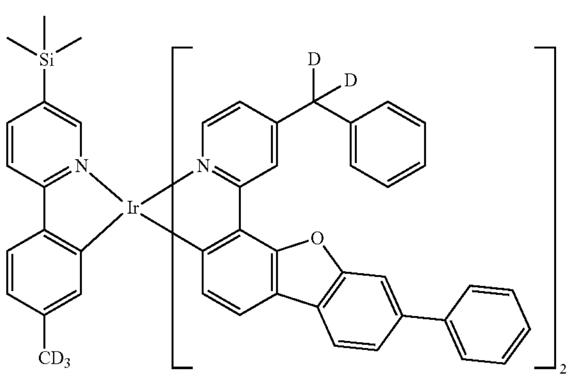
3151
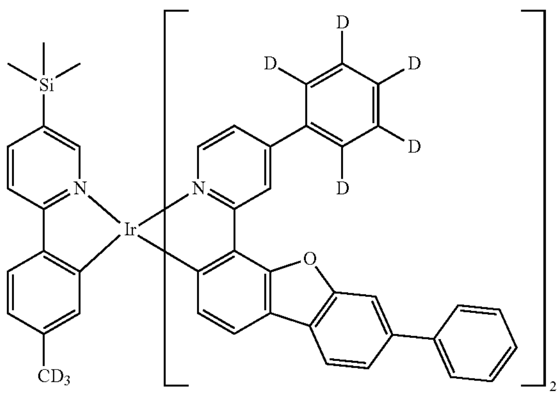
3152
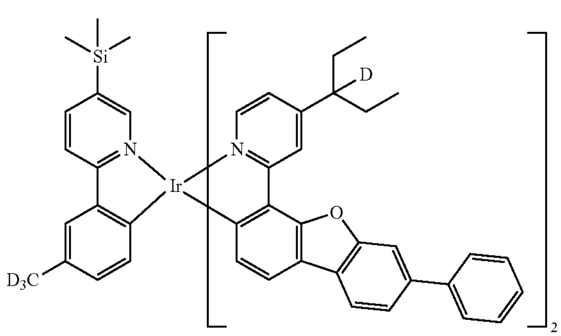
3153
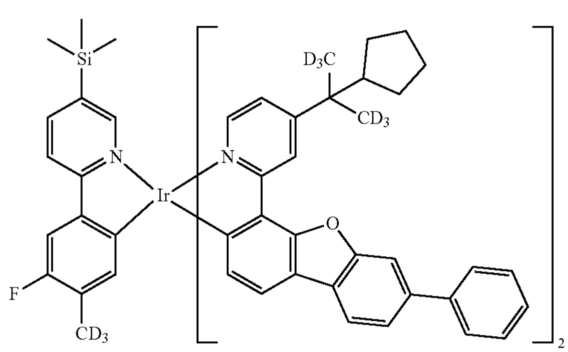
-continued
3154
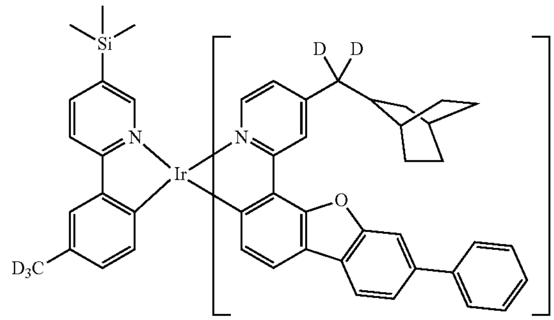
3155
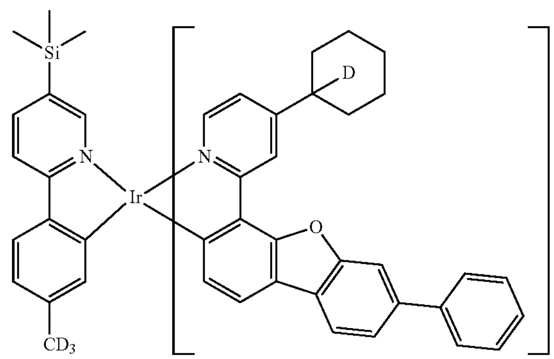
3156
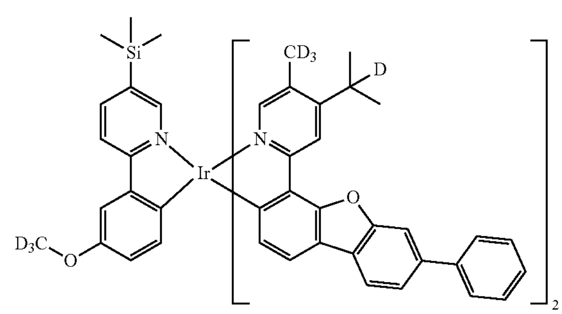
3157
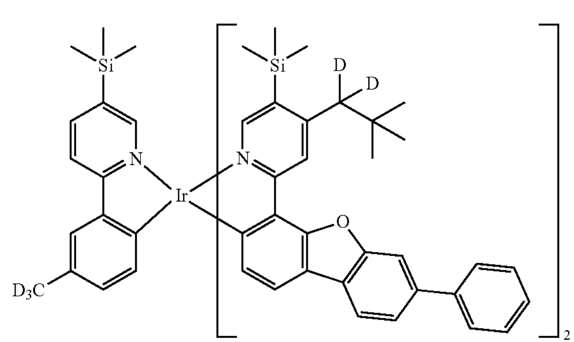

-continued
3158
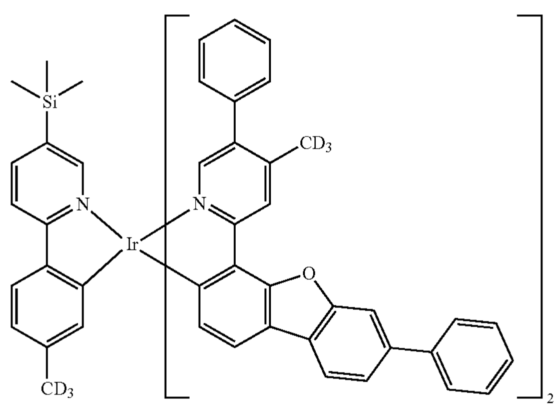
3159
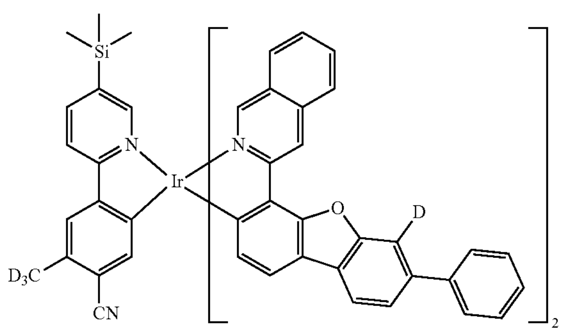
3460
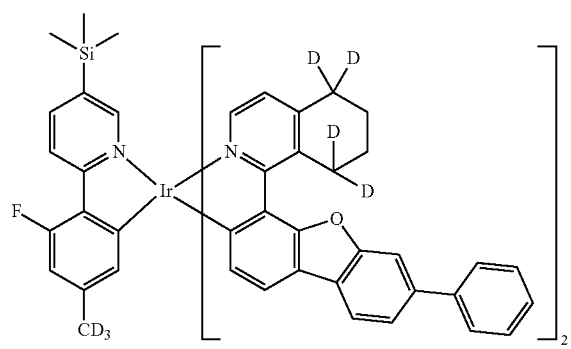
3161
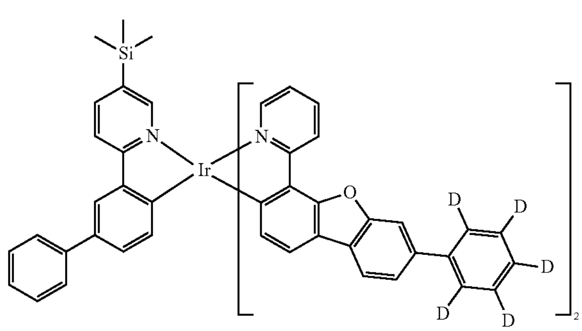
-continued
3162
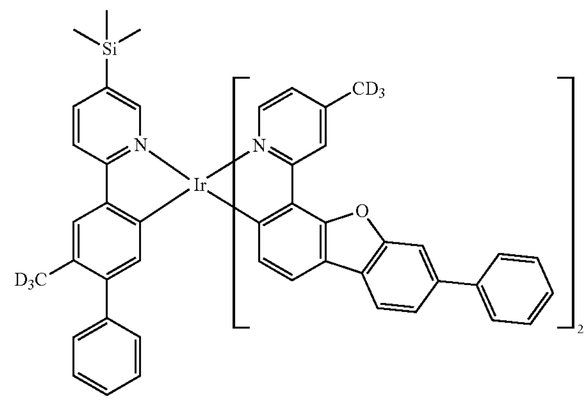
3163
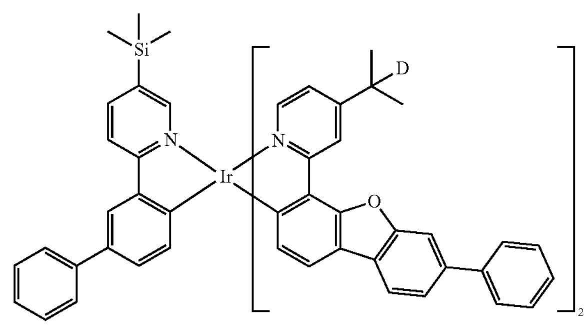
3164
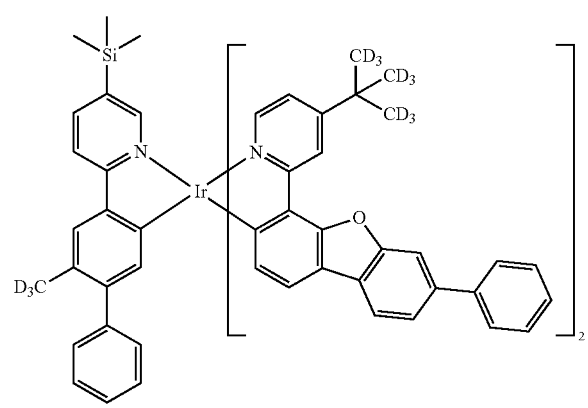
3165
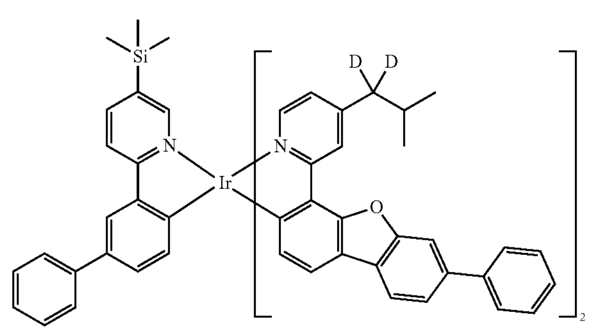

-continued
3166
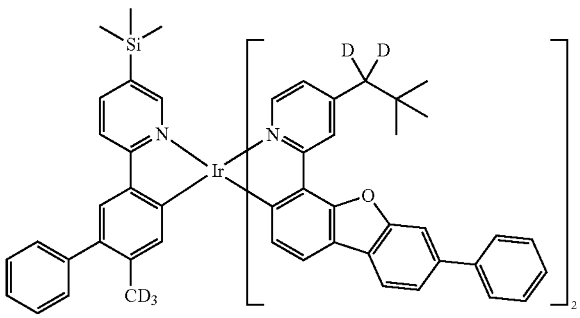
3167
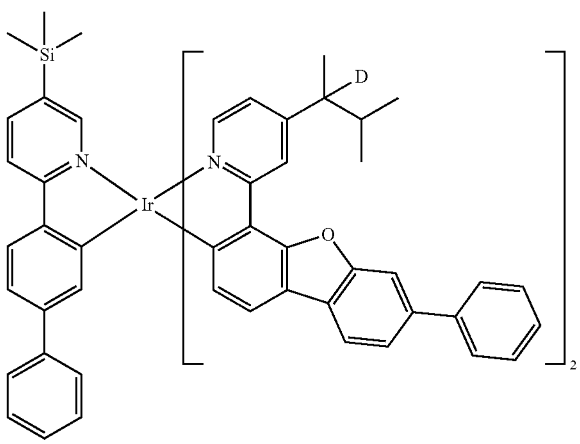
3168
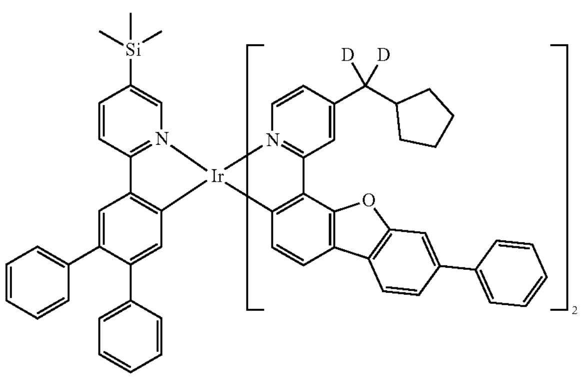
3169
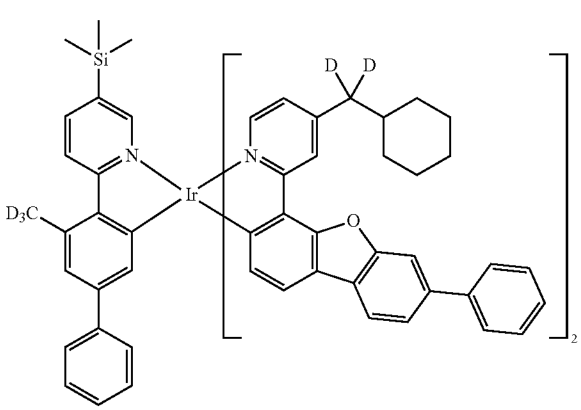
-continued
3170
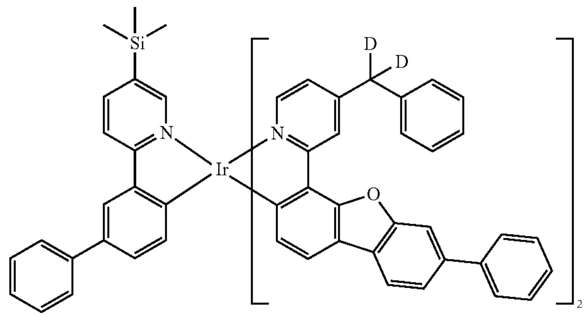
3171
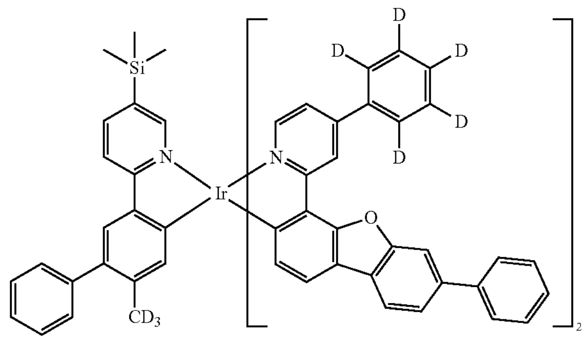
3172
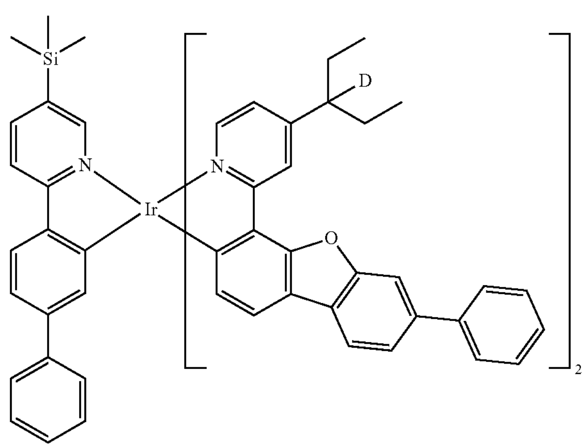
3173
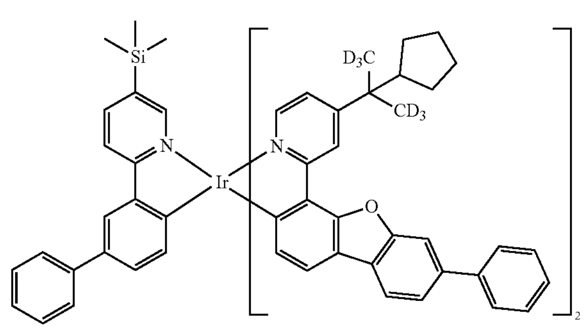

3174
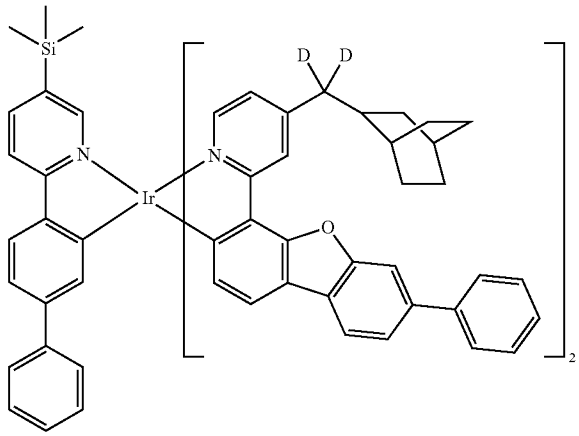
3175
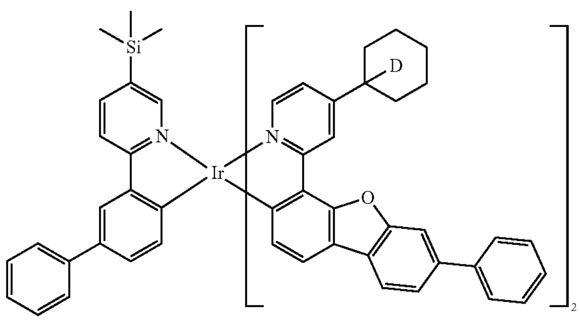
3176
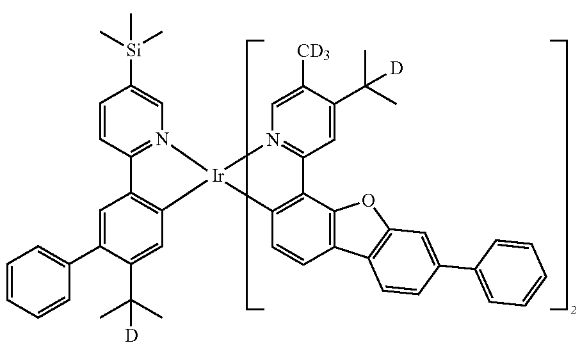
3177
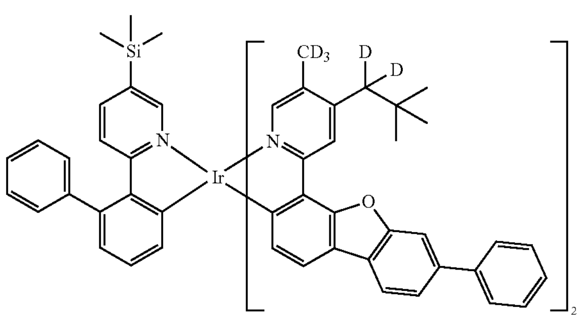
3178
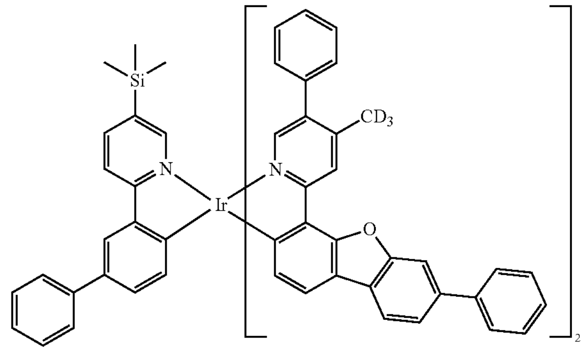
3179
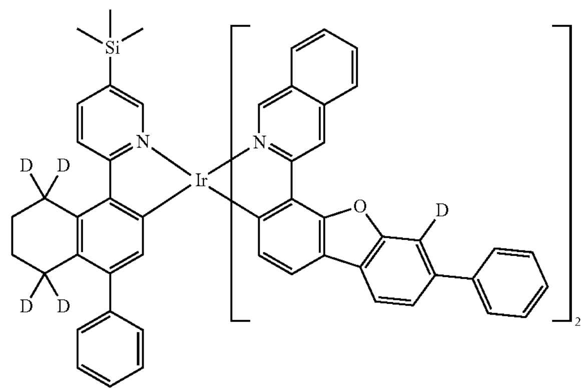
3180
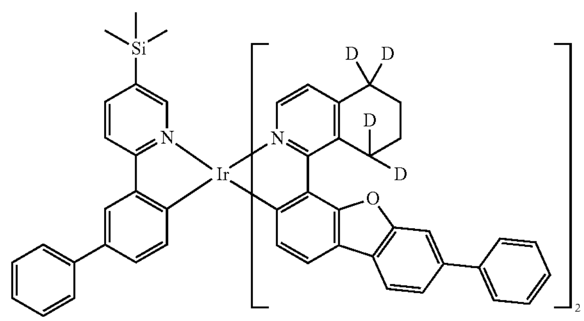
3181
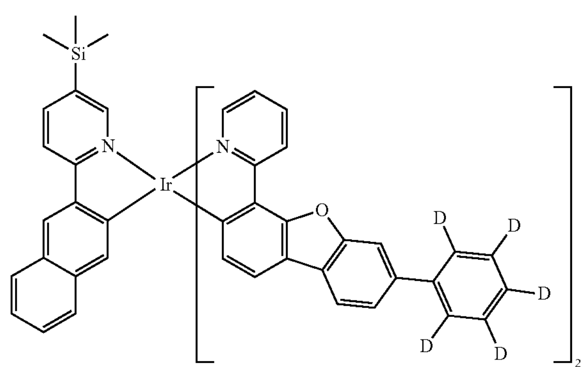

-continued
3182
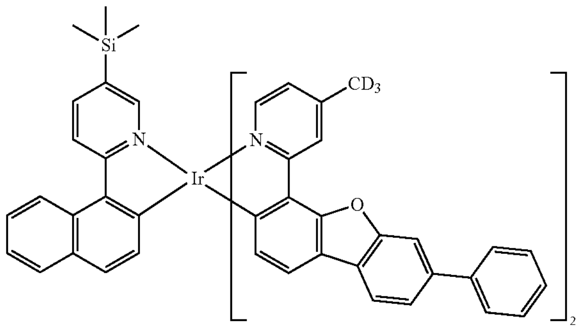
3183
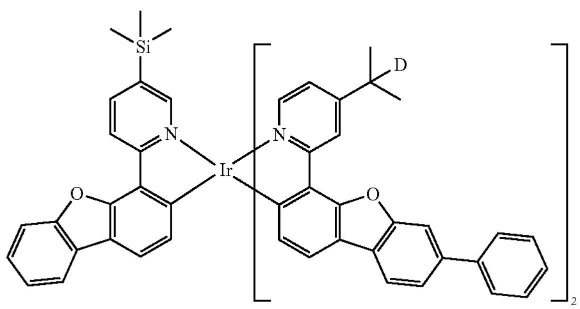
3184
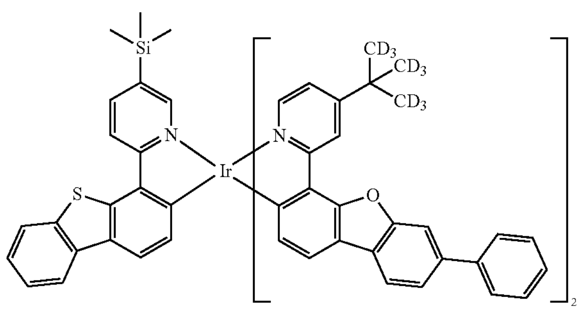
3185
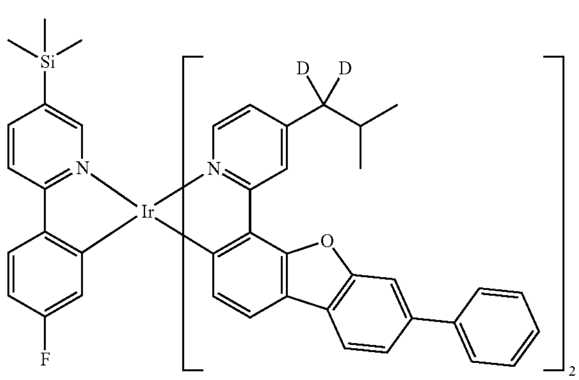
-continued
3186
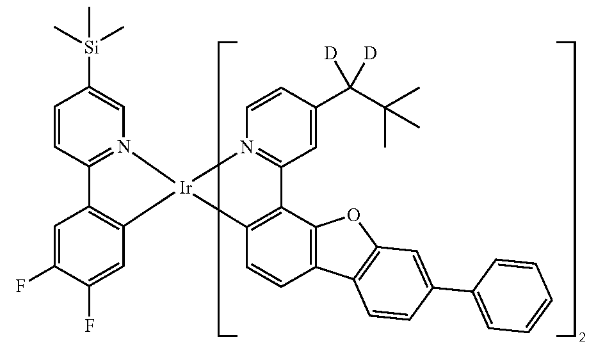
3187
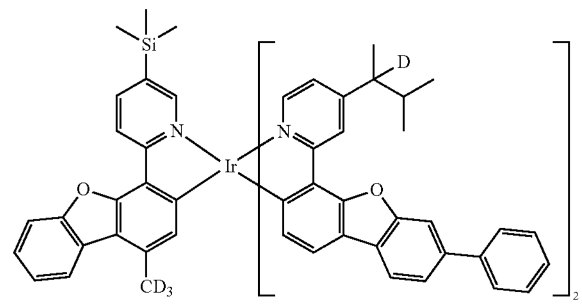
3188
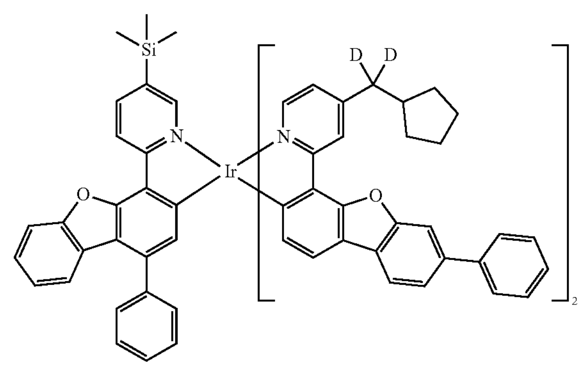
3189
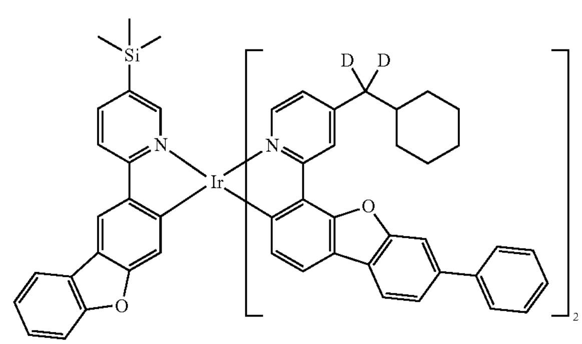

-continued
3190
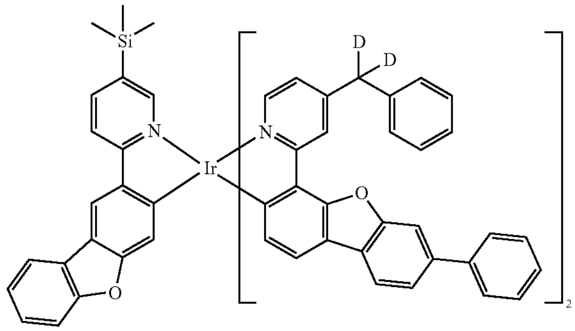
3191
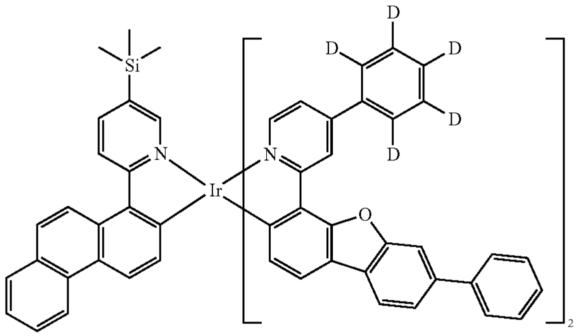
3192
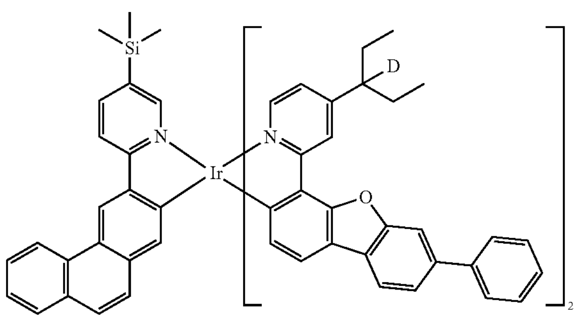
3193
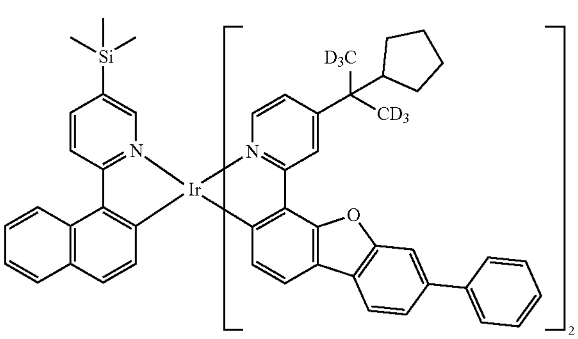
-continued
3194
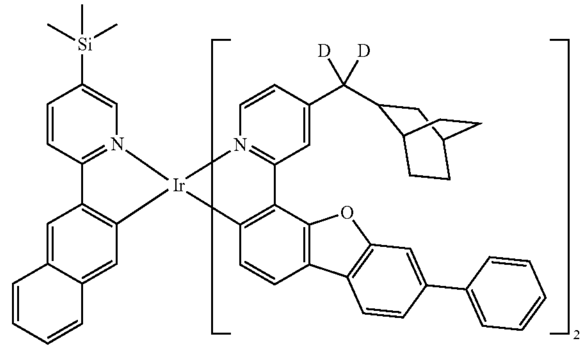
3195
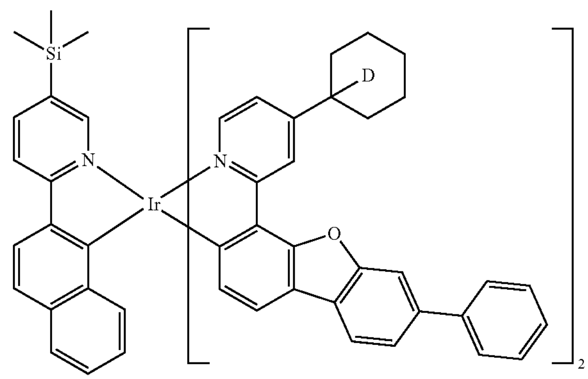
3196
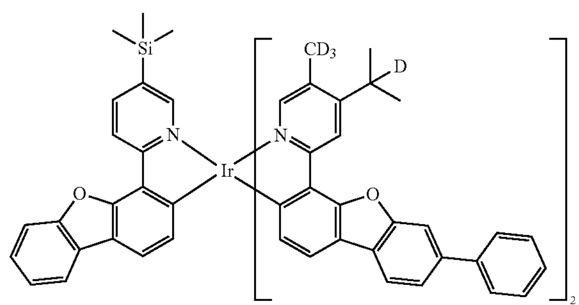
3197
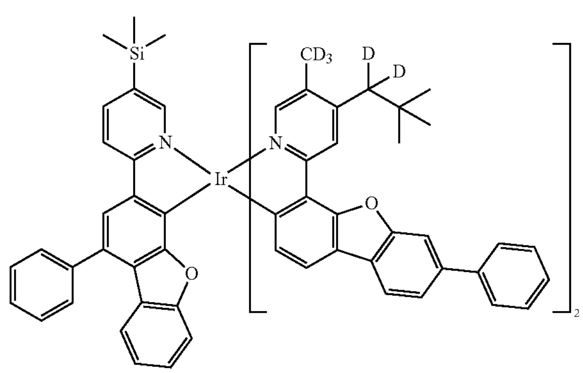

3198
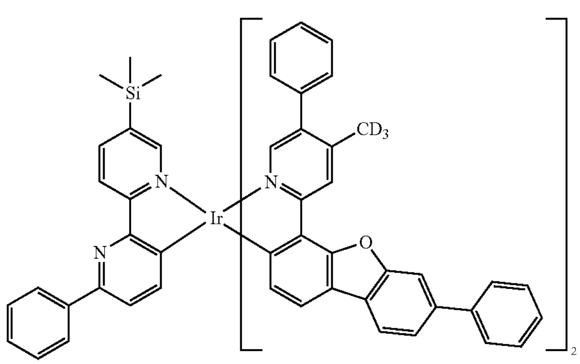
3199
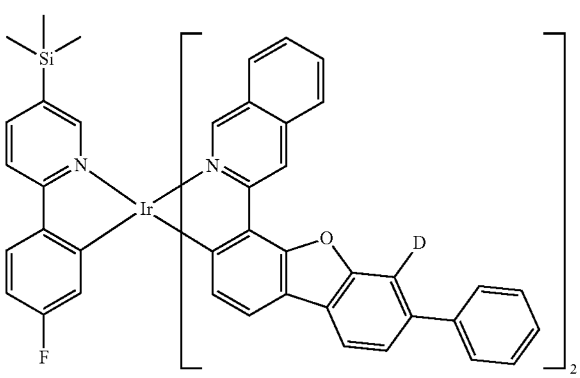
3200
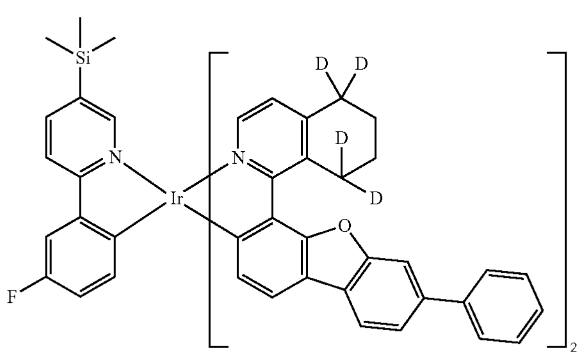
3201
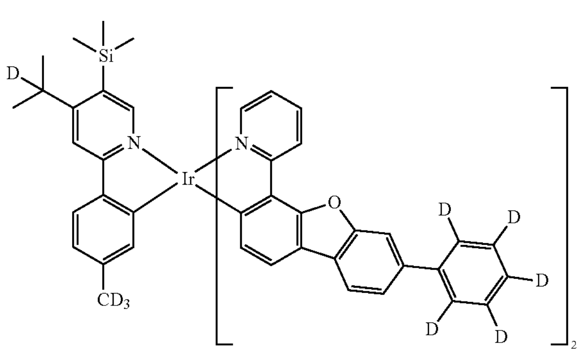
3202
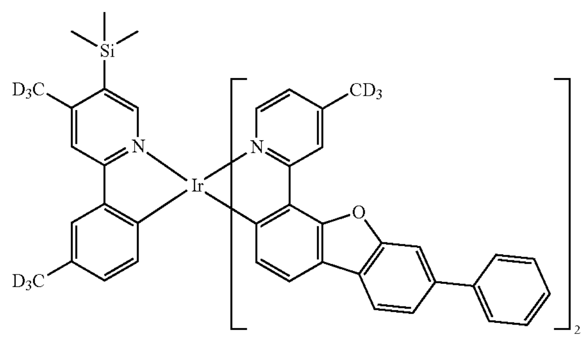
3203
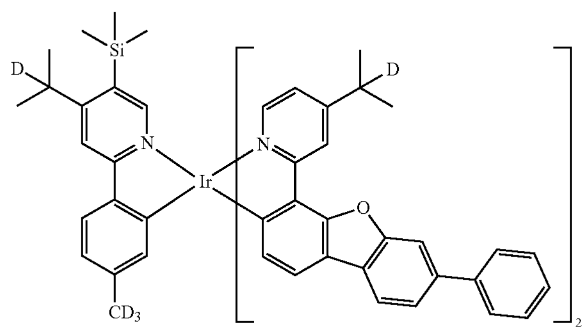
3204
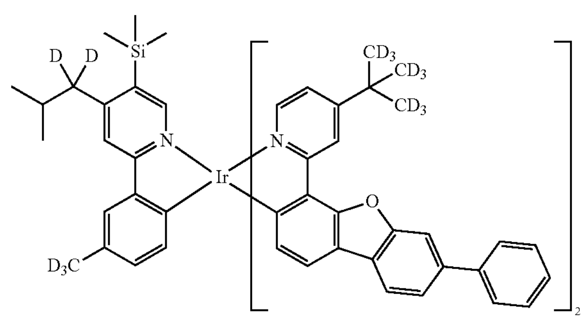
3205
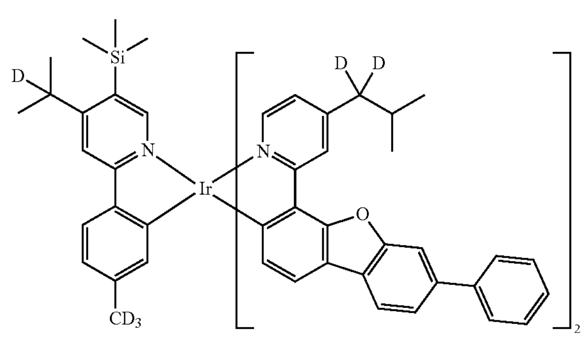

-continued
3206
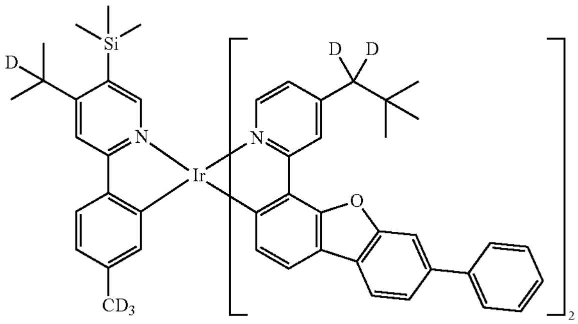
3207
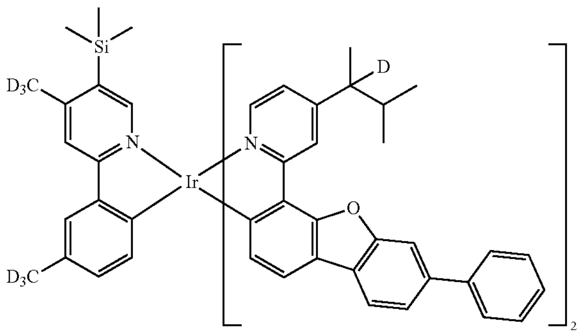
3208
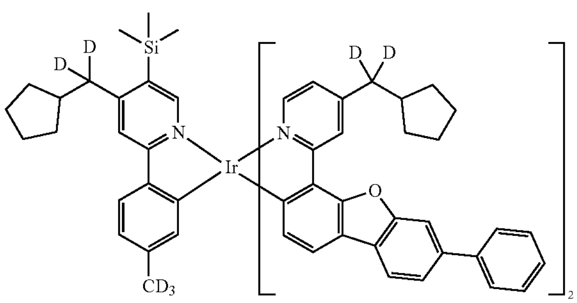
3209
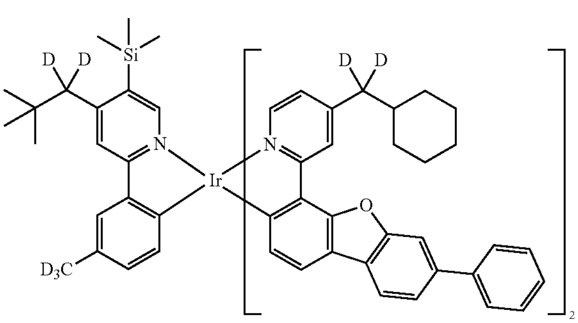
3210
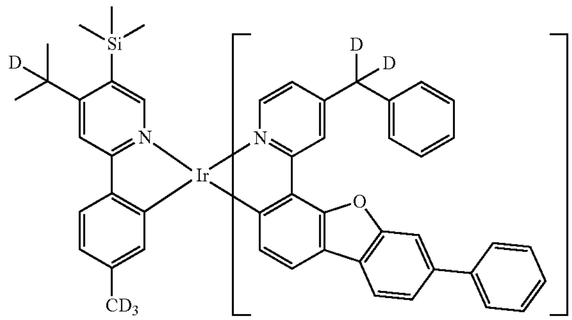
3211
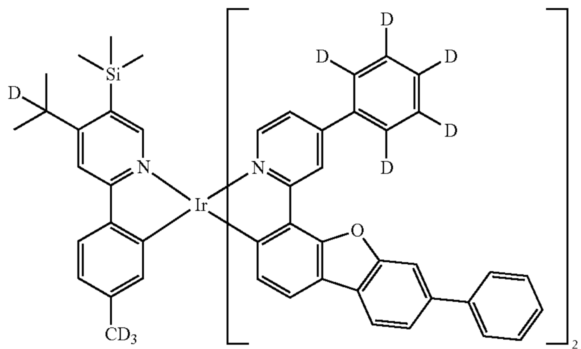
3212
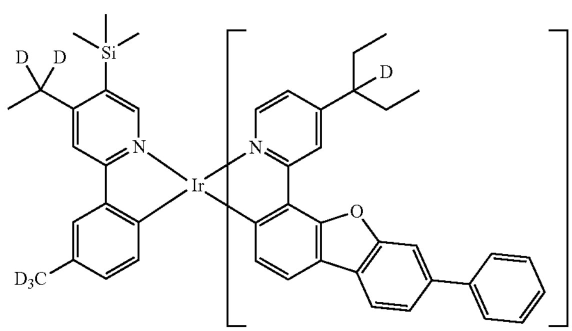
3213
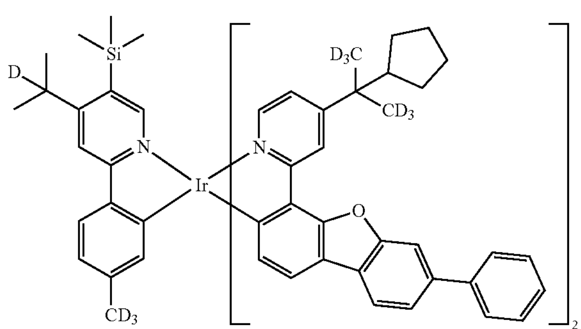

3214
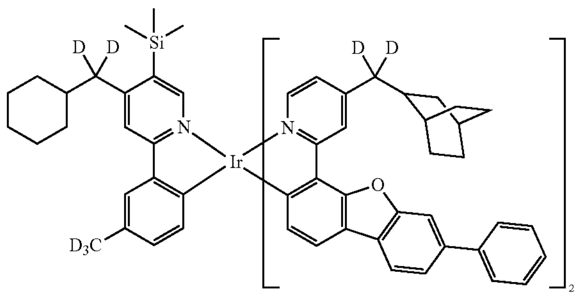
3215
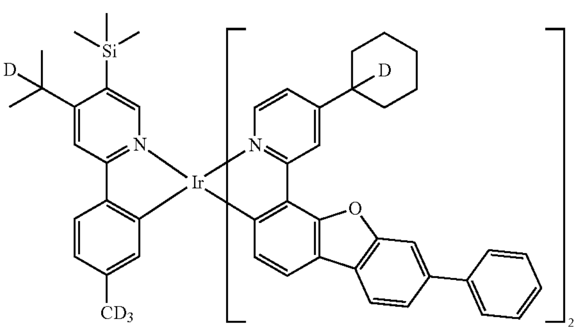
3216
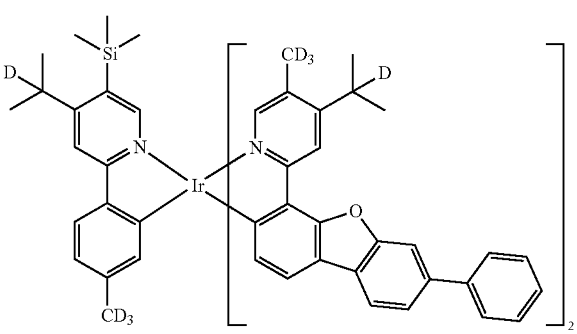
3217
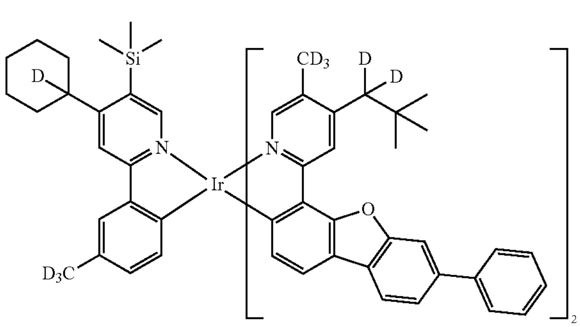
3218
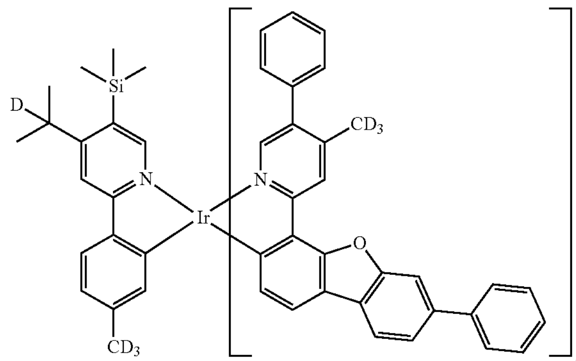
3219
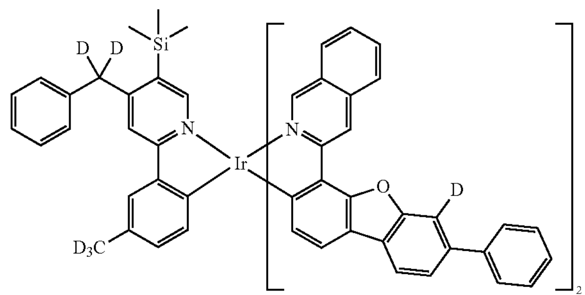
3220
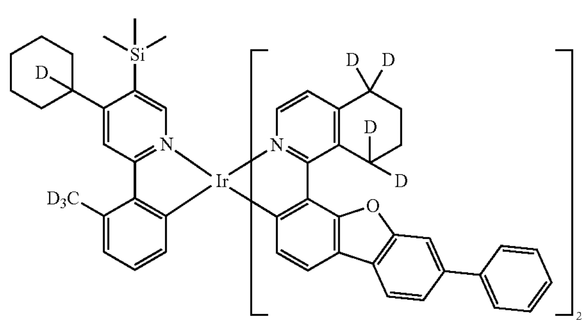
3221
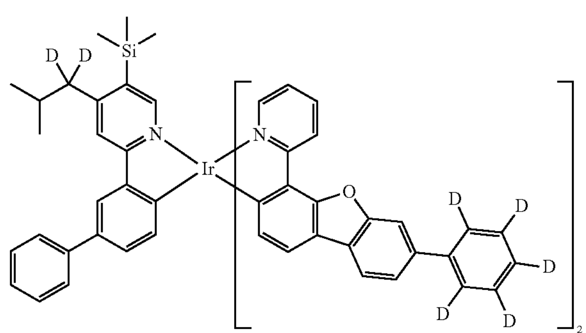

-continued
3222
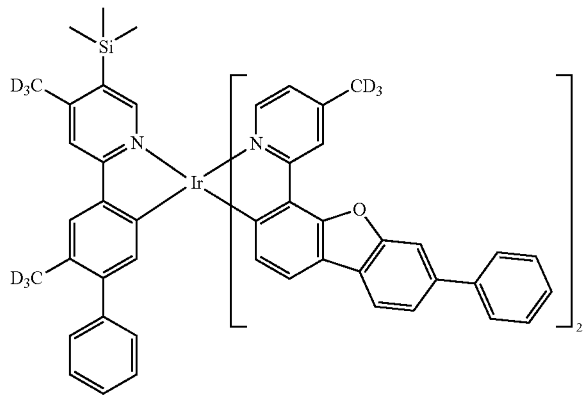
3223
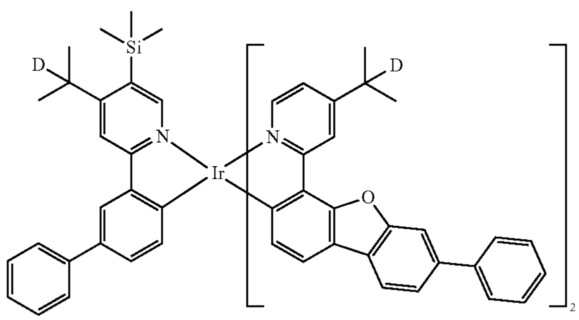
3224
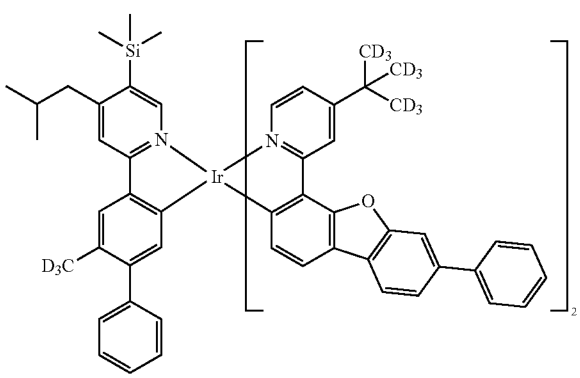
3225
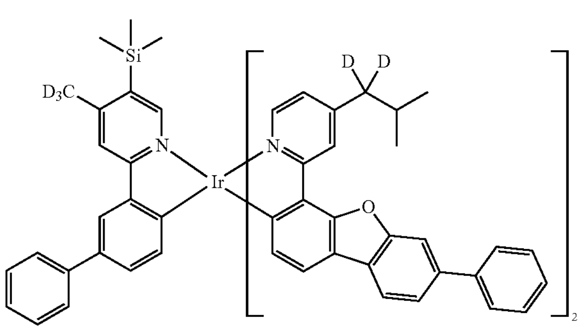
-continued
3226
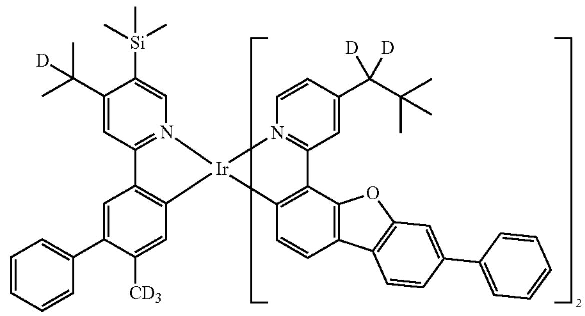
3227
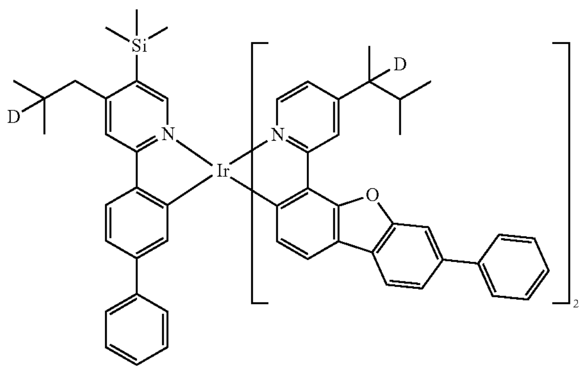
3228
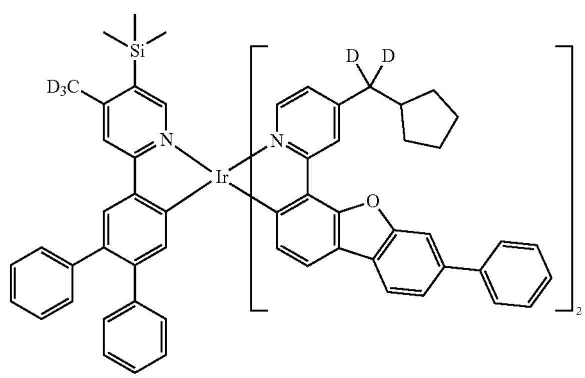
3229
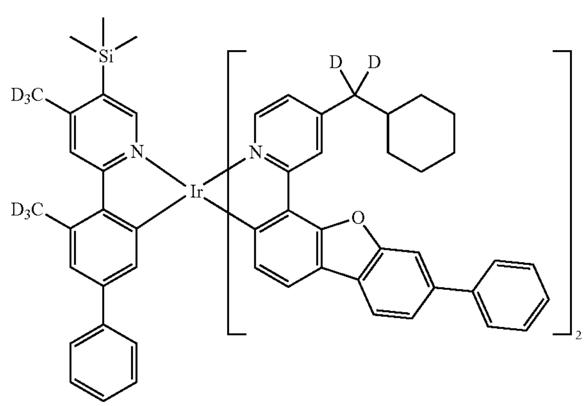

-continued
3230
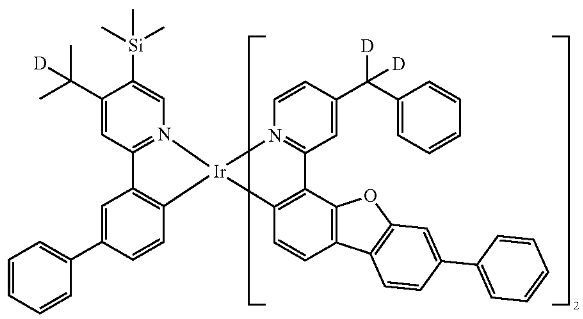
3231
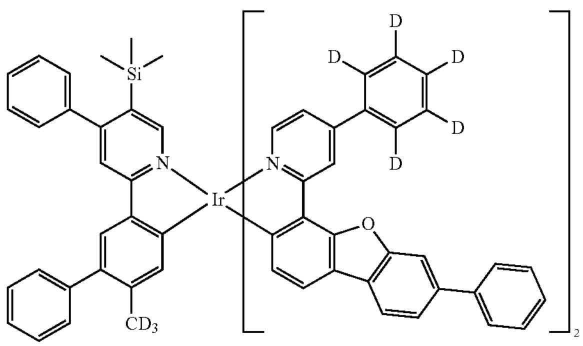
3232
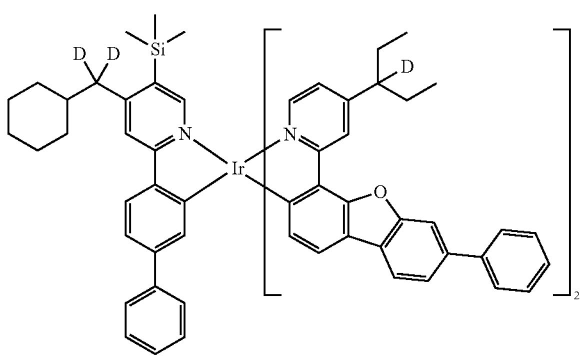
3233
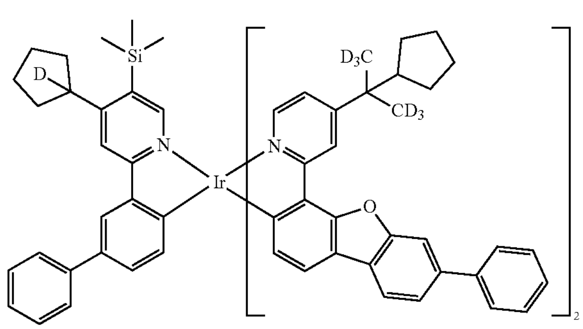
-continued
3234
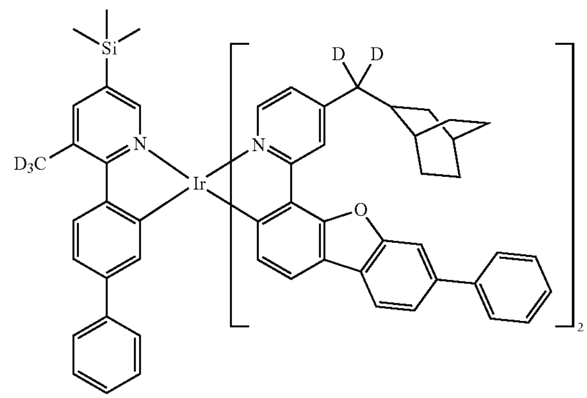
3235
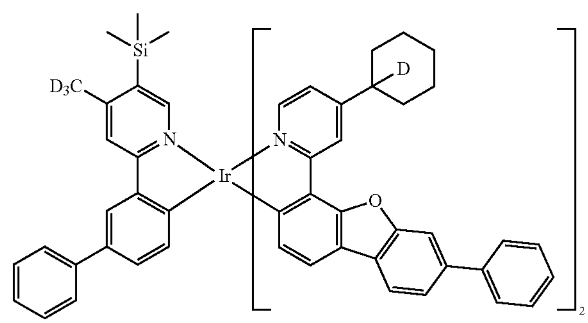
3236
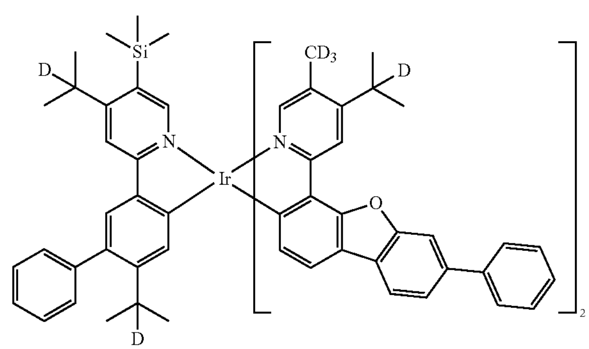
3237
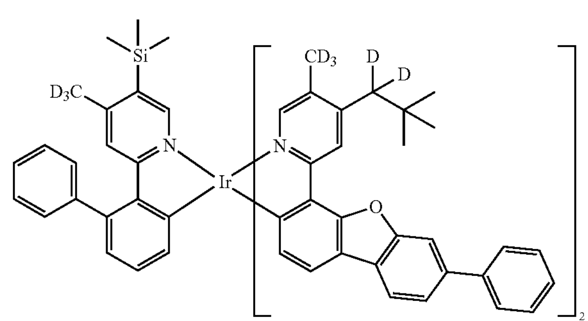

-continued
3238
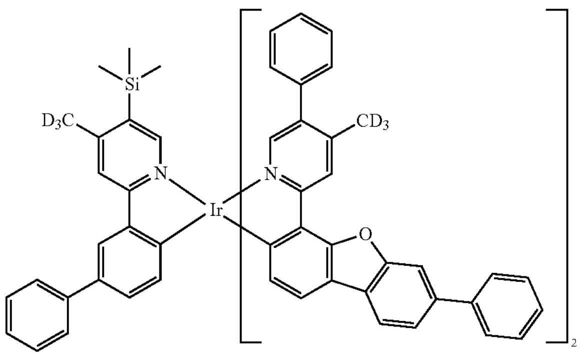
3239
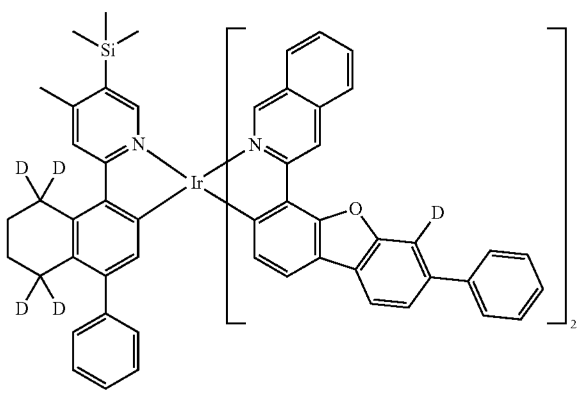
3240
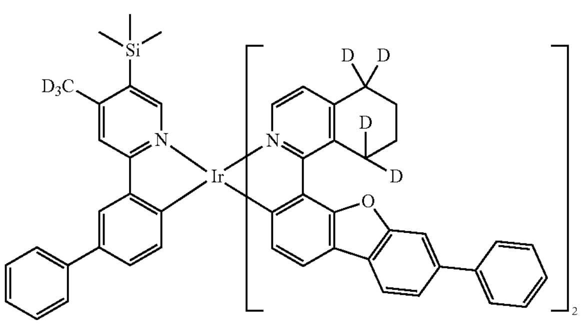
3241
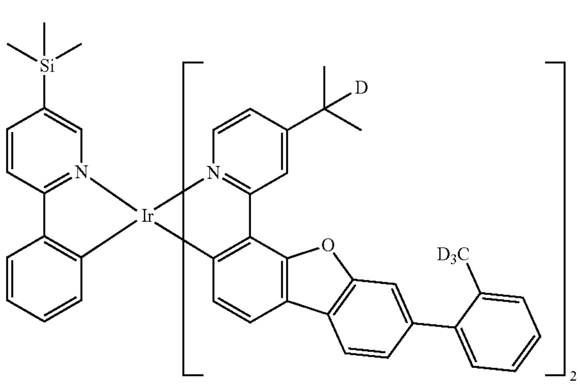
-continued
3242
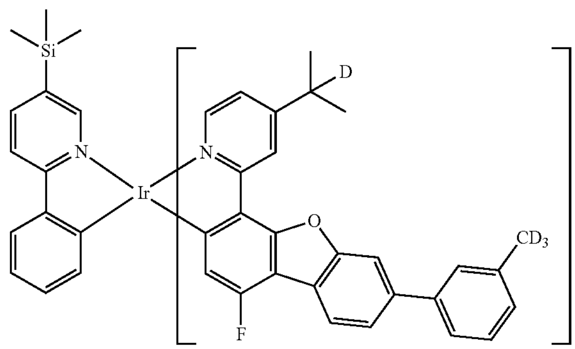
3243
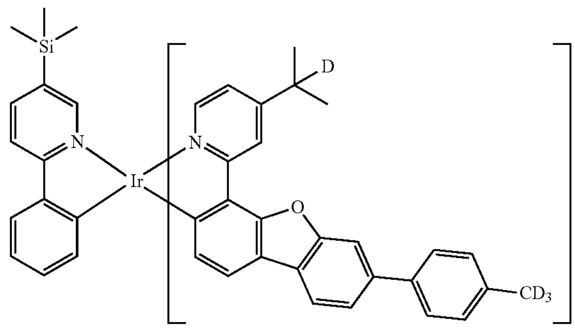
3244
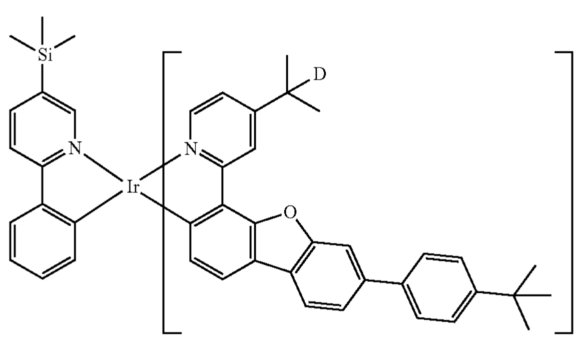
2345
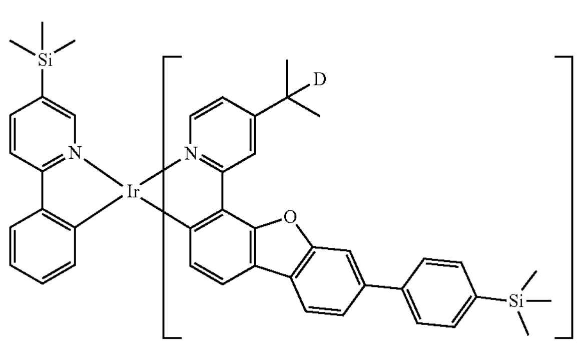

-continued
3246
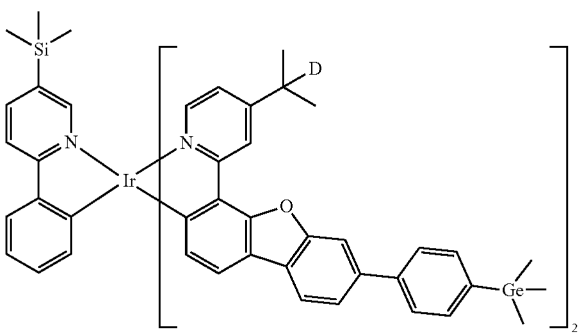
3247
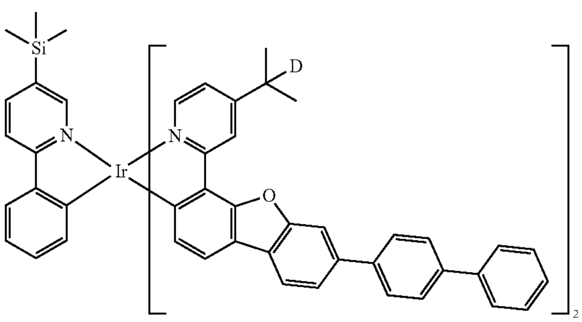
3248
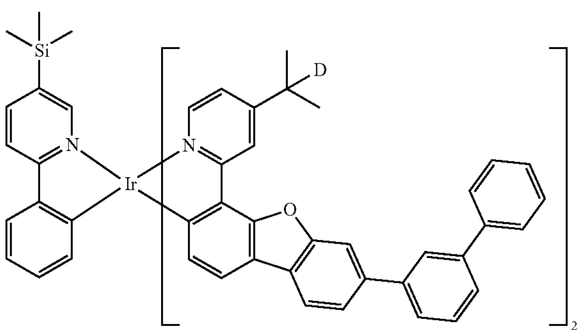
3249
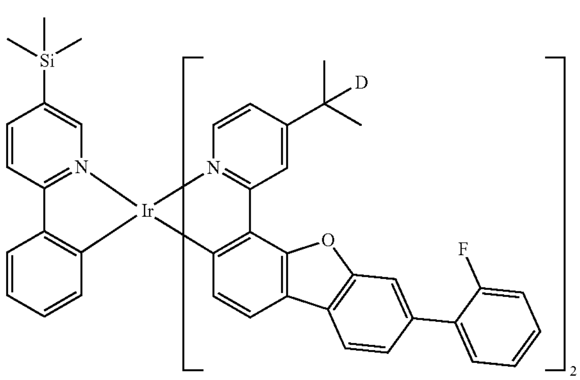
-continued
3250
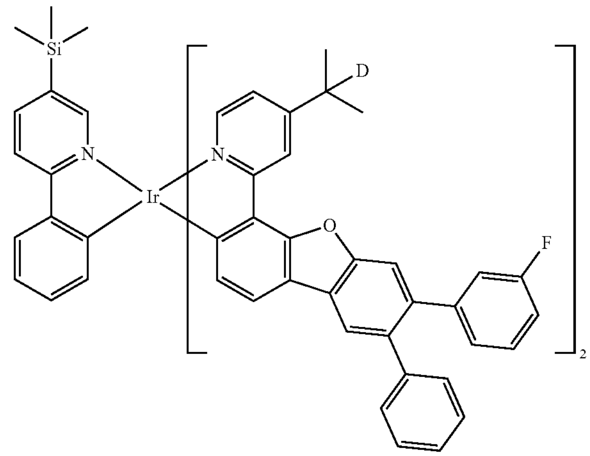
3251
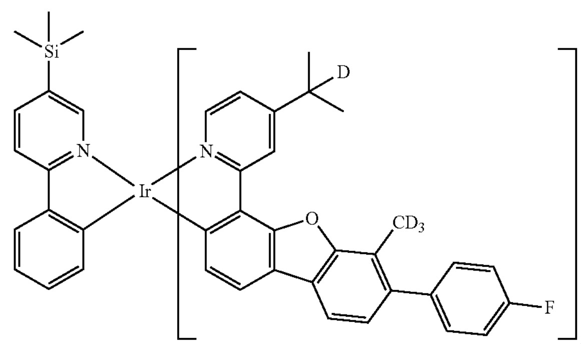
3252
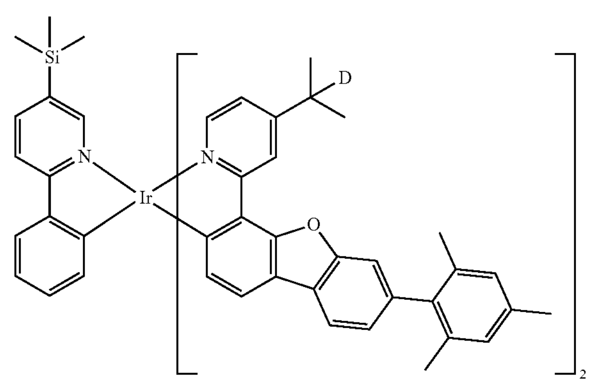
3253
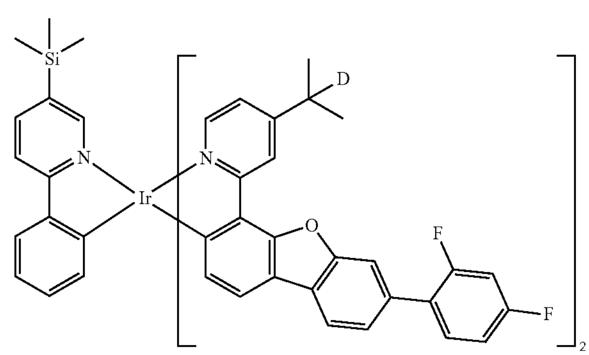

-continued
3254
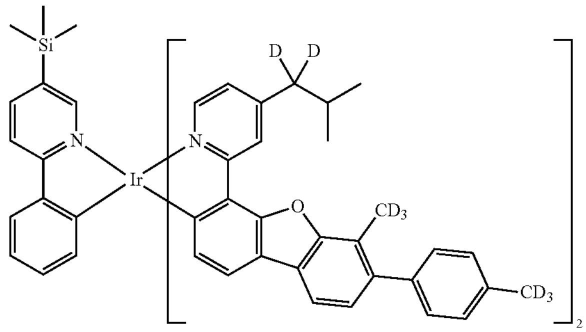
3255
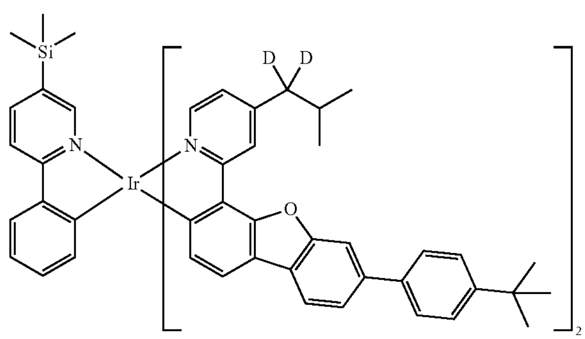
3256
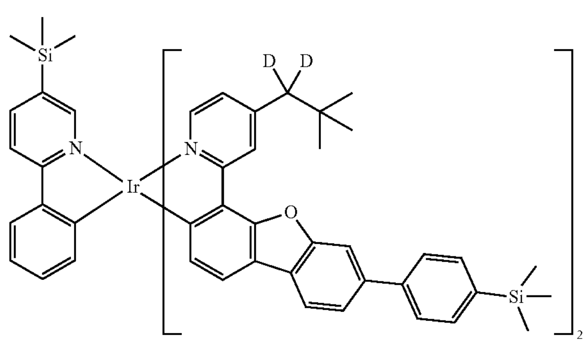
3257
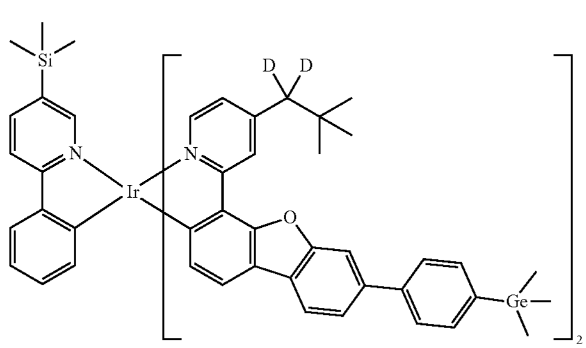
-continued
3258
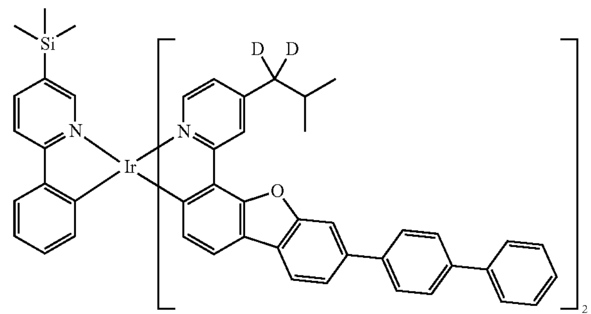
3259
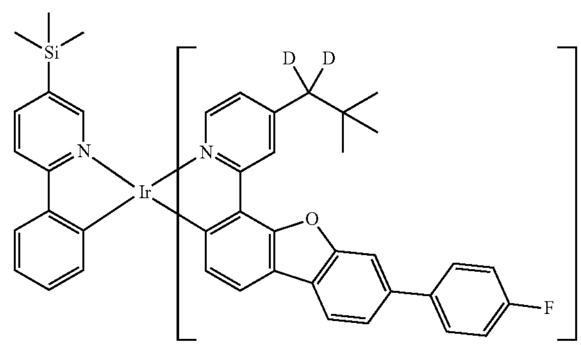
3260
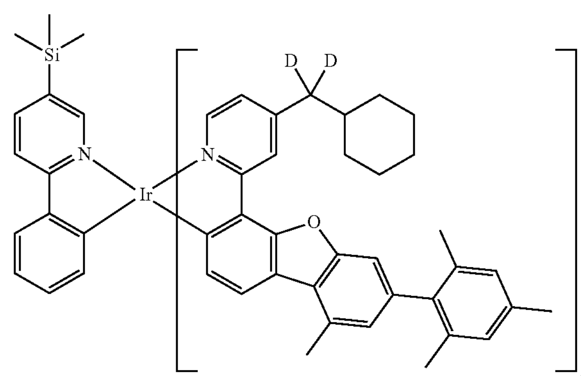
3261
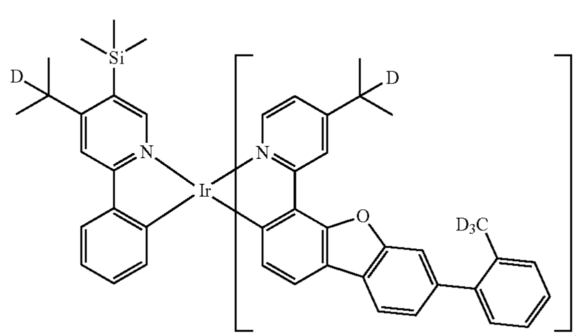

-continued
3262
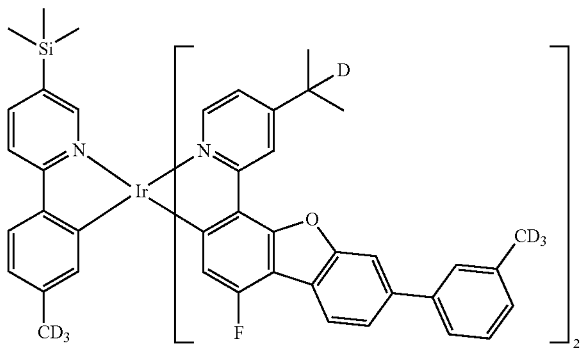
3263
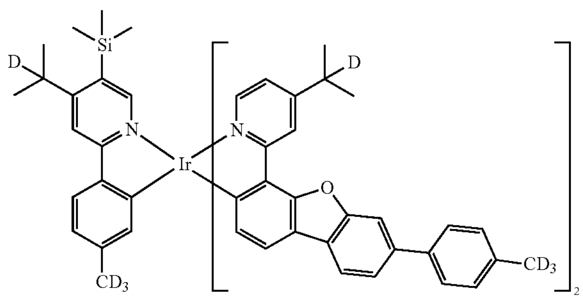
3264
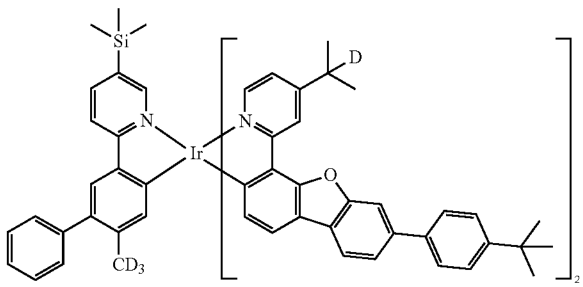
3265
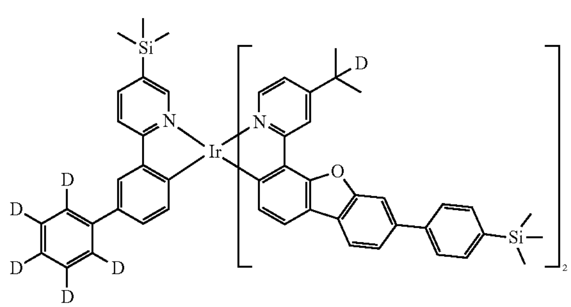
3266
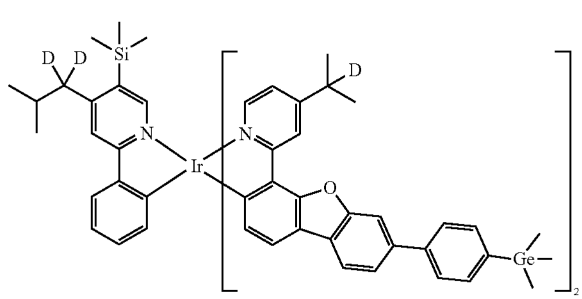
-continued
3267
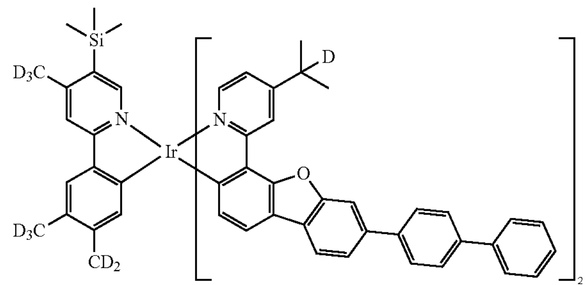
3268
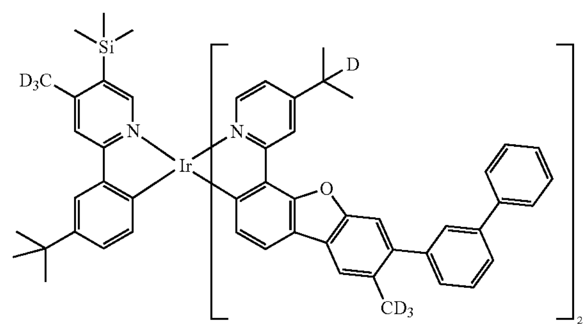
3269
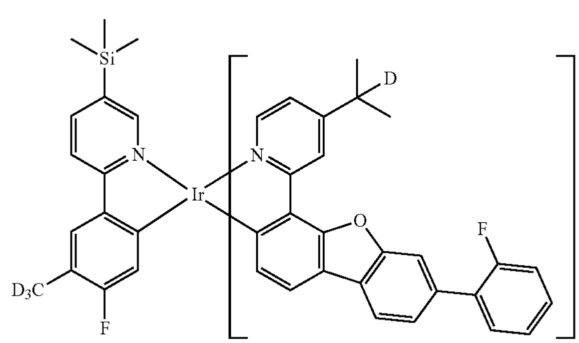
3270
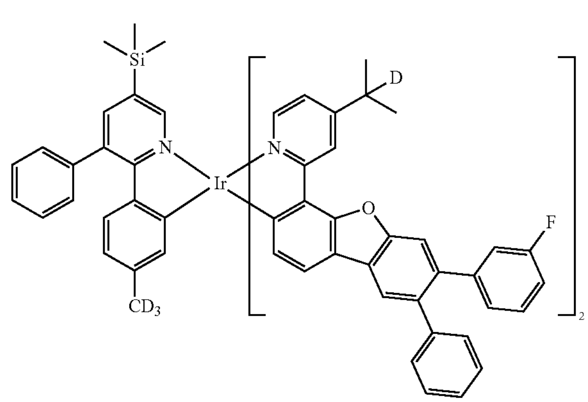

-continued
3271
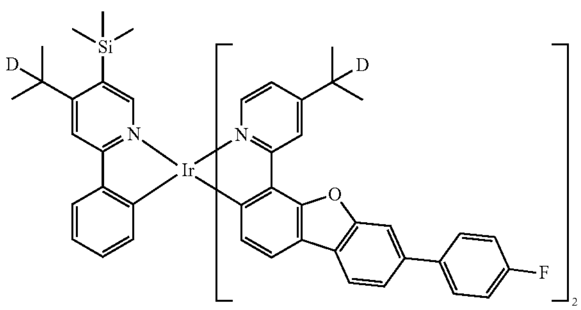
3272
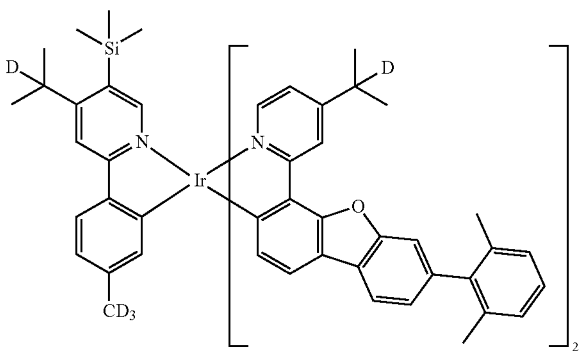
3273
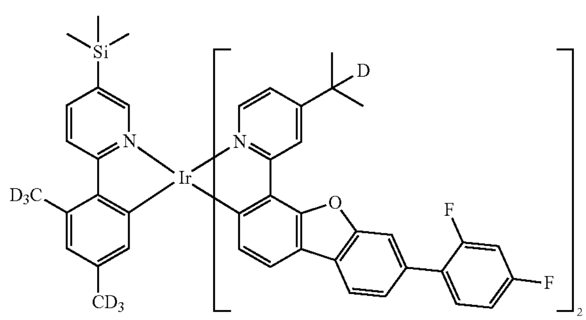
3274
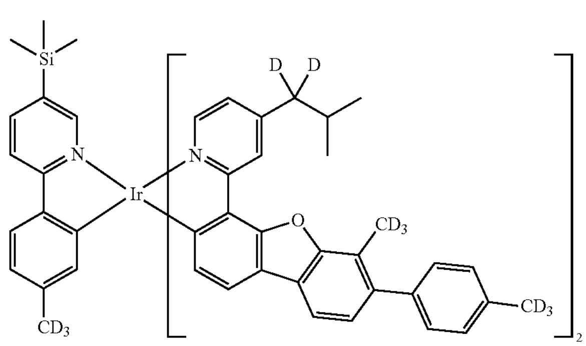
-continued
3275
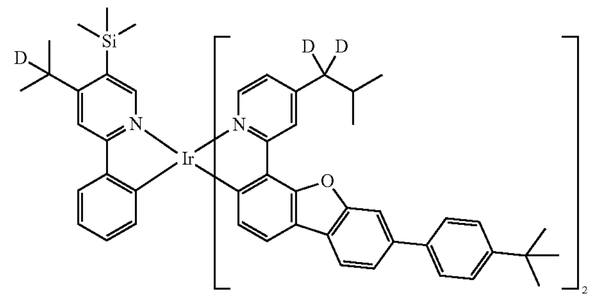
3276
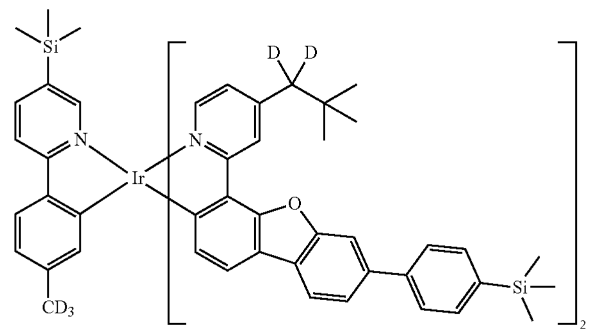
3277
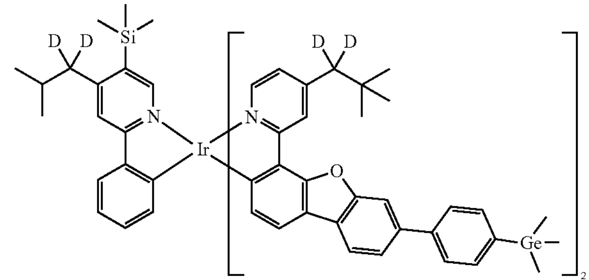
3278
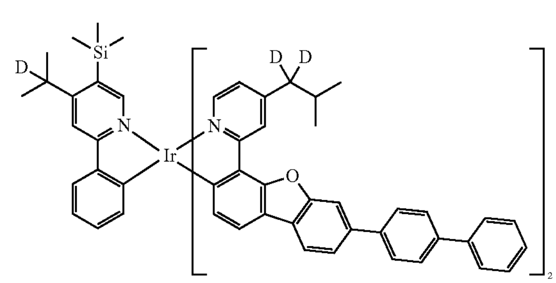
3279
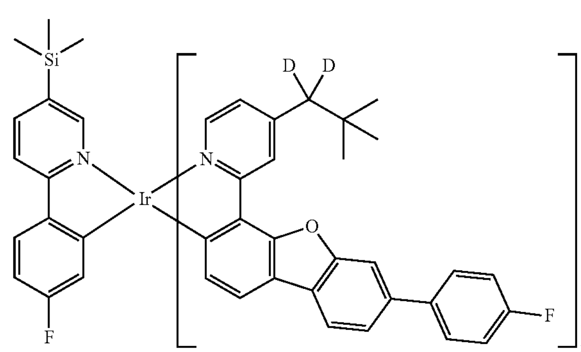

-continued
3280
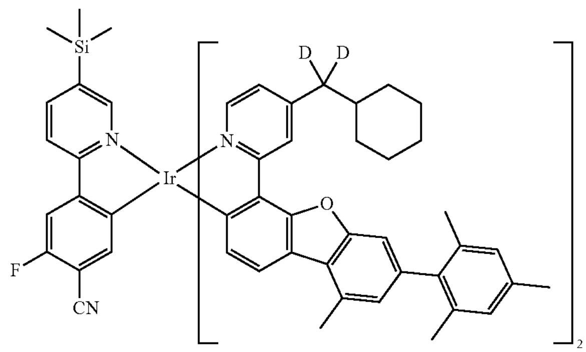
3281
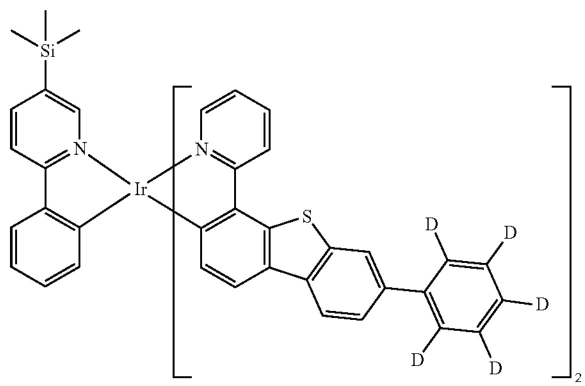
3282
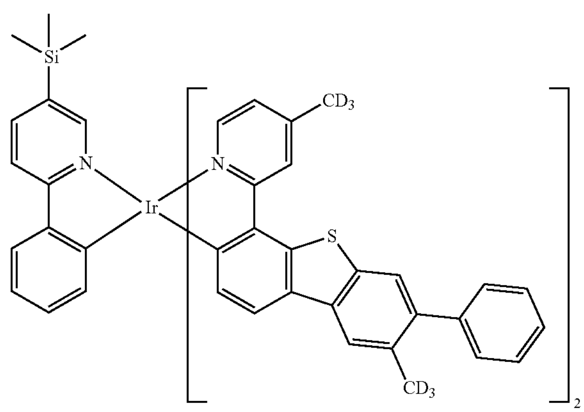
3283
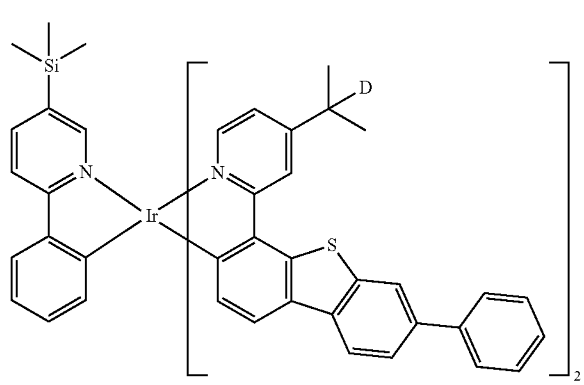
-continued
3284
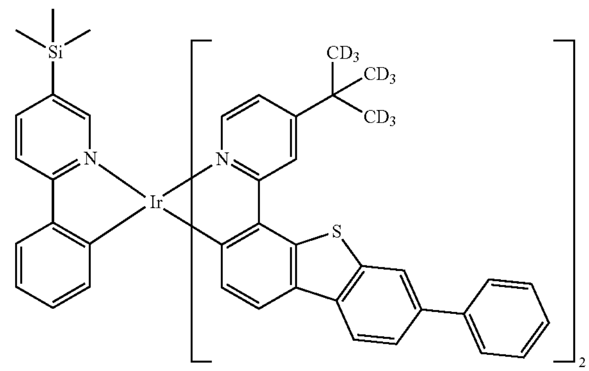
3285
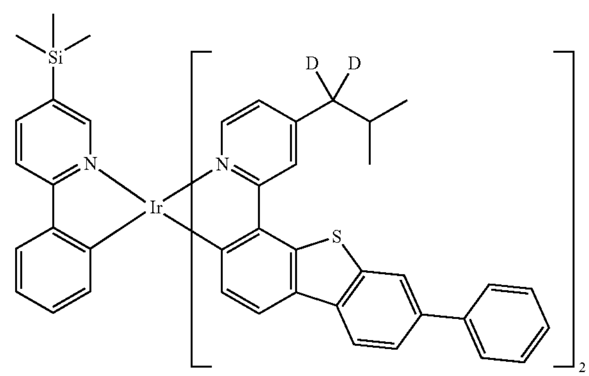
3286
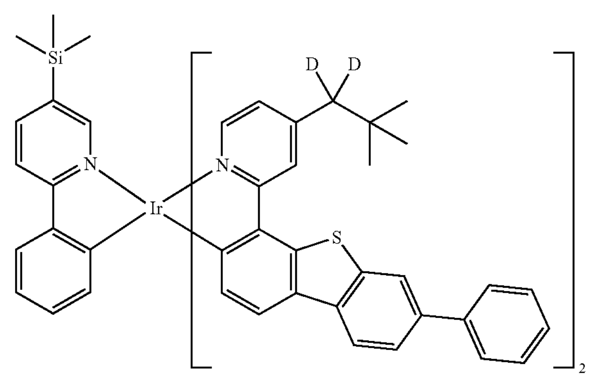
3287
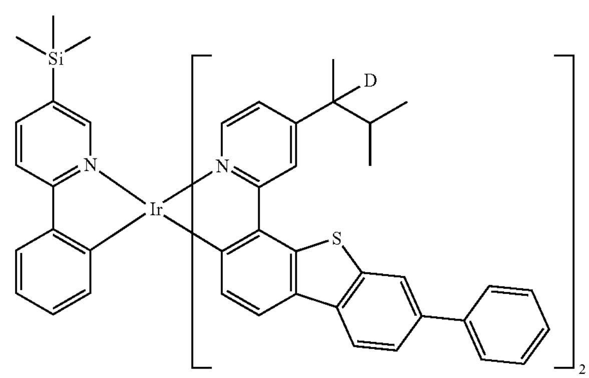

-continued
3288
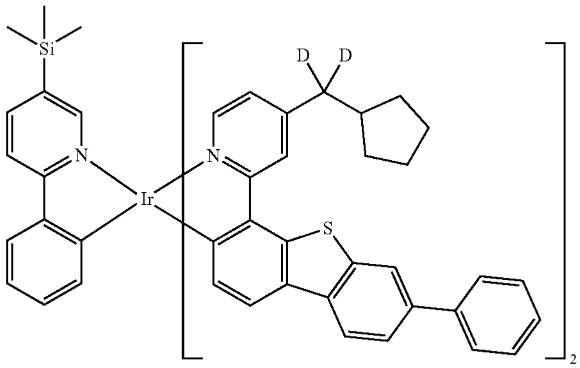
3289
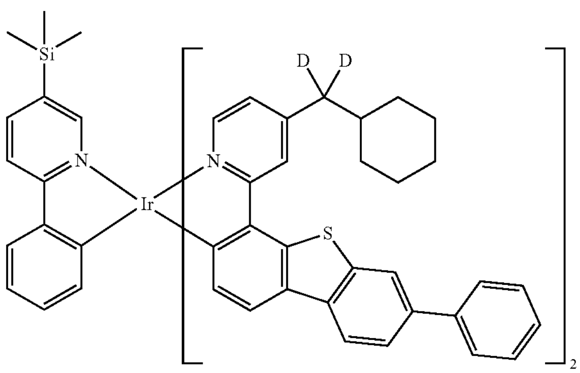
3290
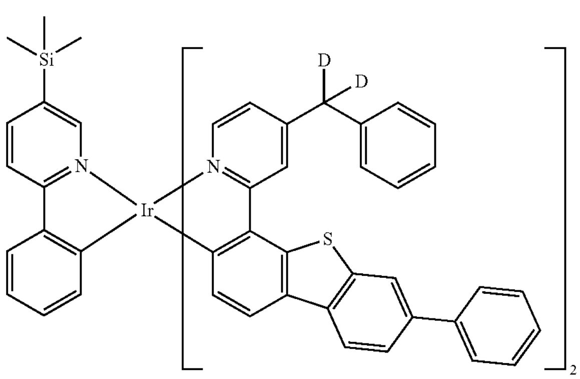
3291
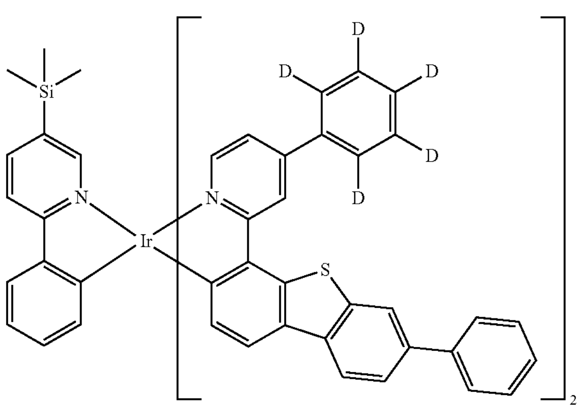
-continued
3292
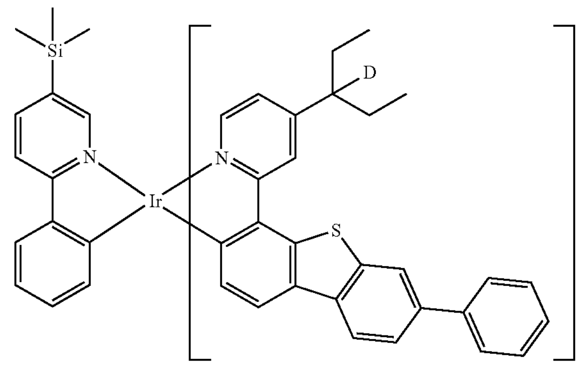
3293
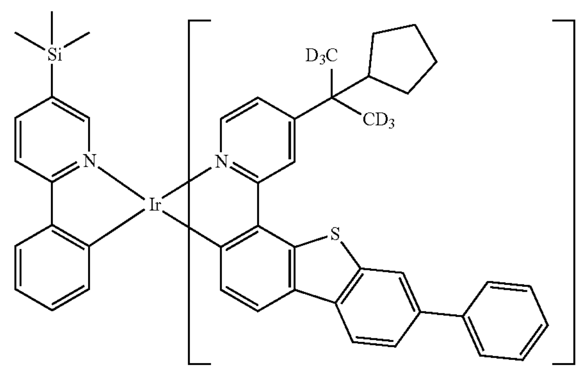
3294
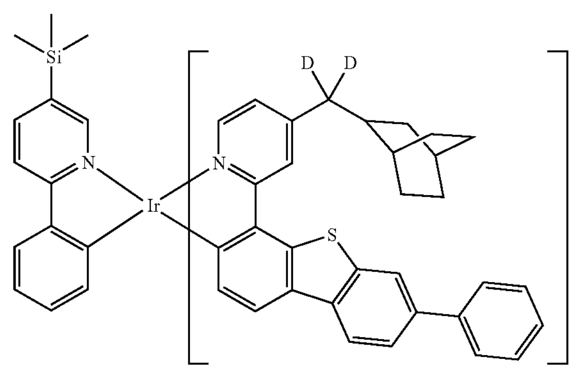
3295
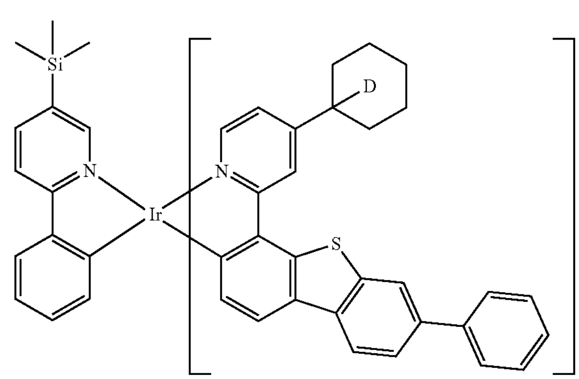

3296
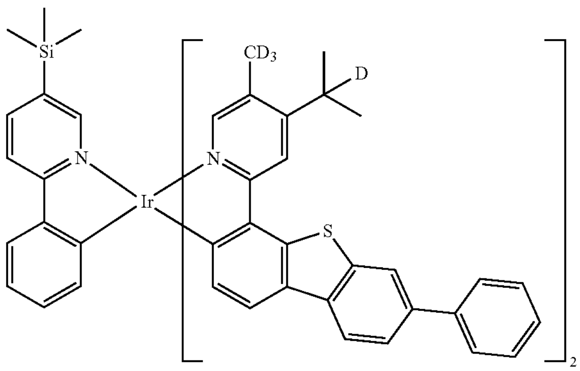
3297
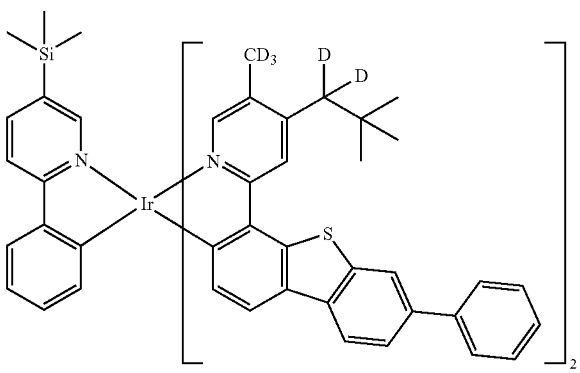
3298
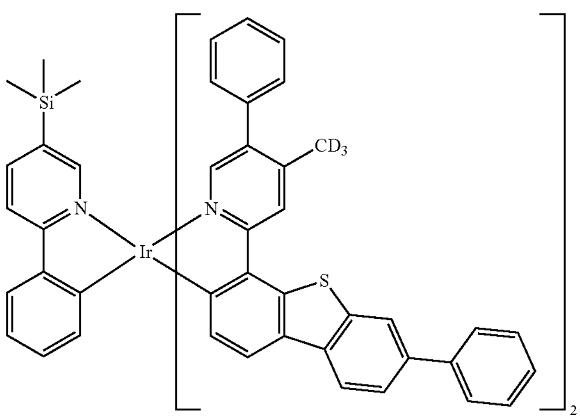
3299
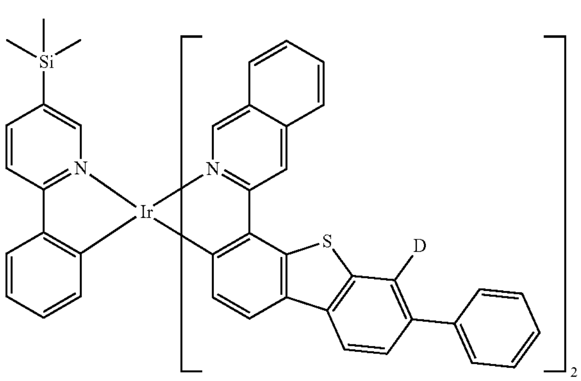
3300
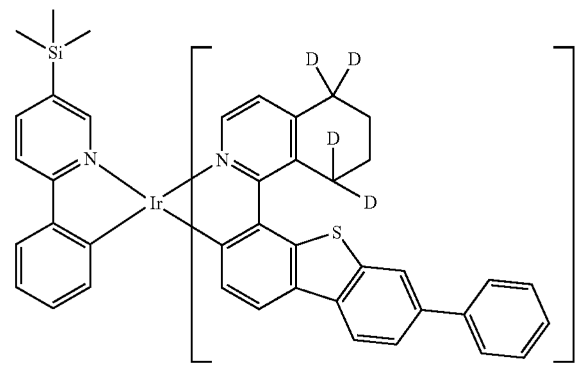
3301
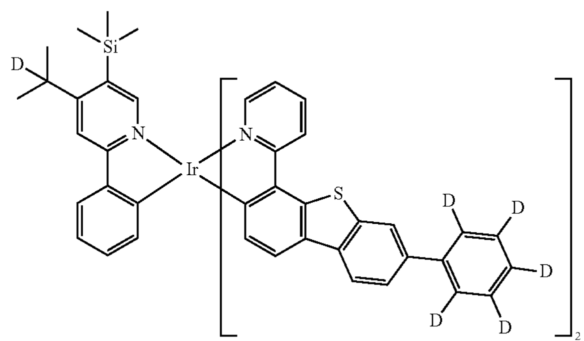
3302
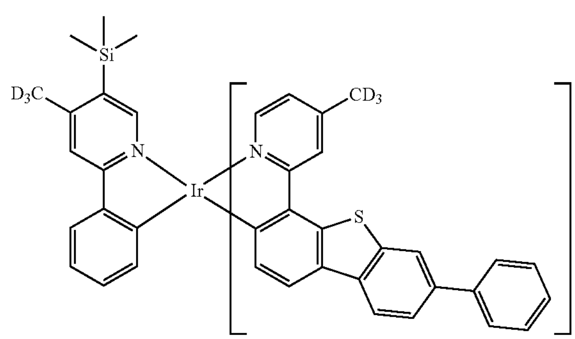
3303
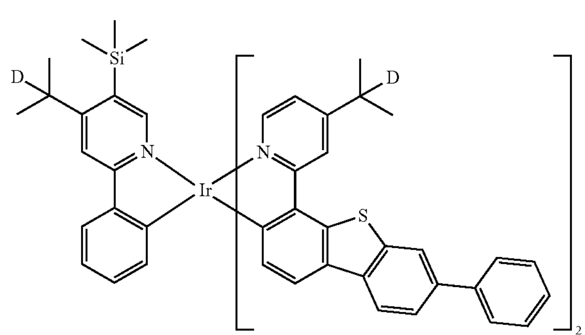

-continued
3304
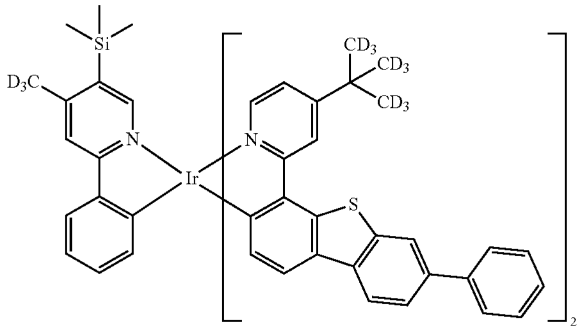
3305
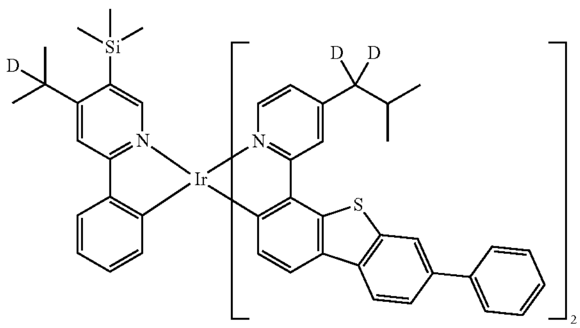
3306
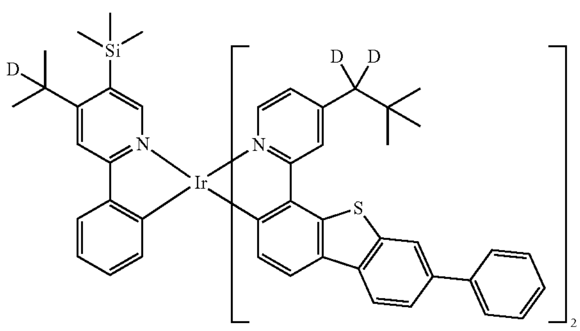
3307
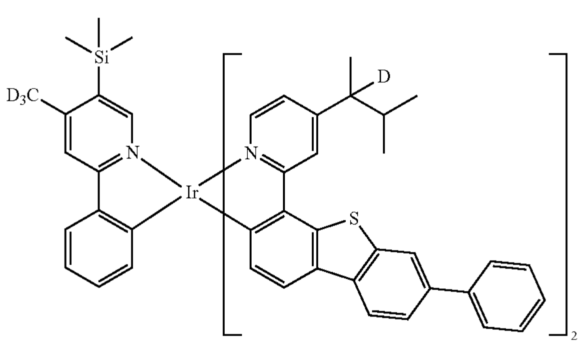
-continued
3308
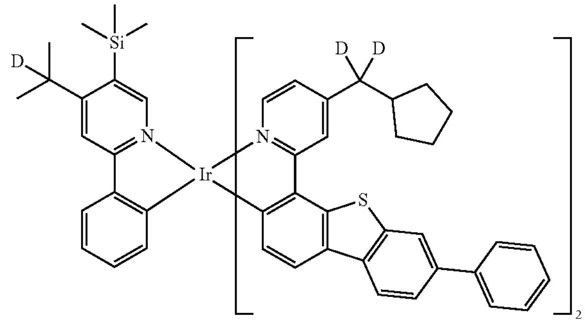
3309
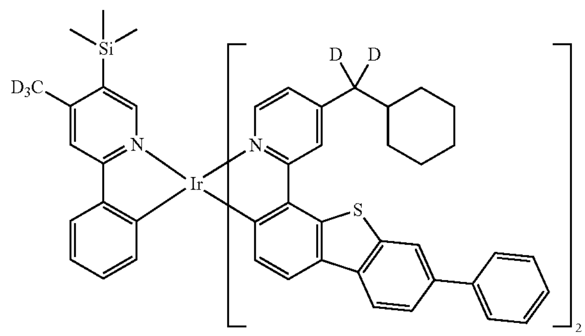
3310
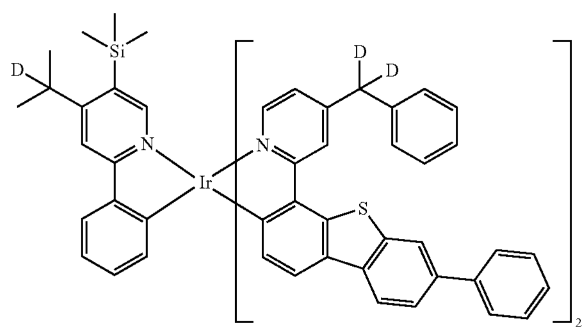
3311
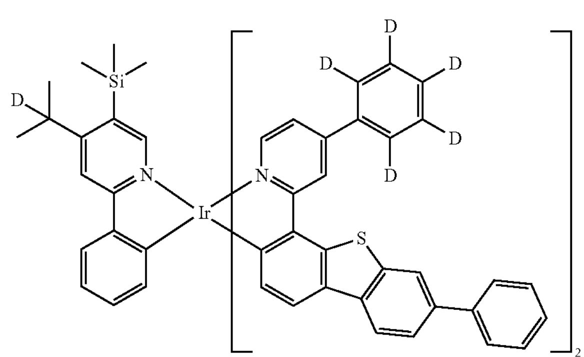

3312
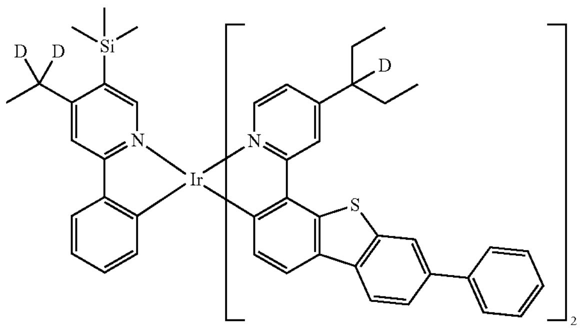
3313
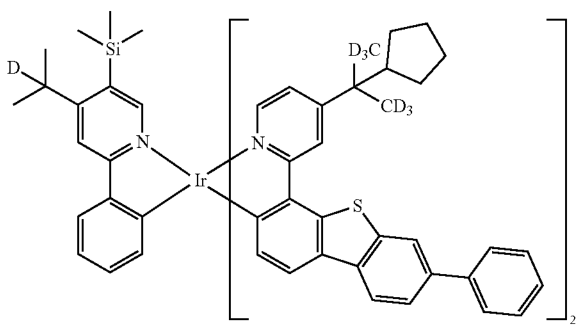
3314
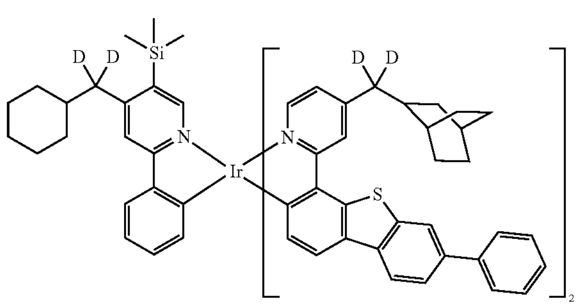
3315
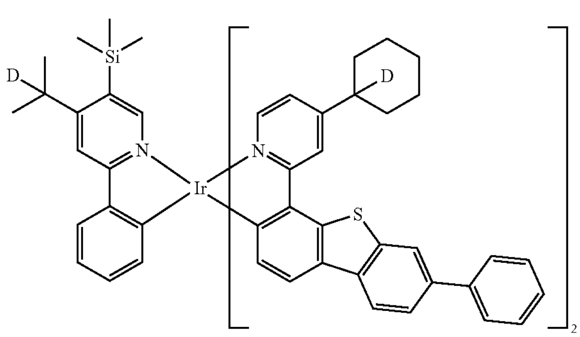
3316
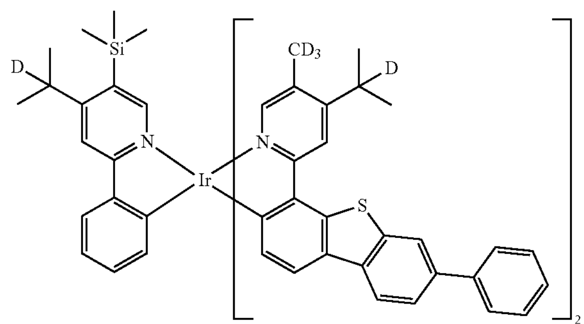
3317
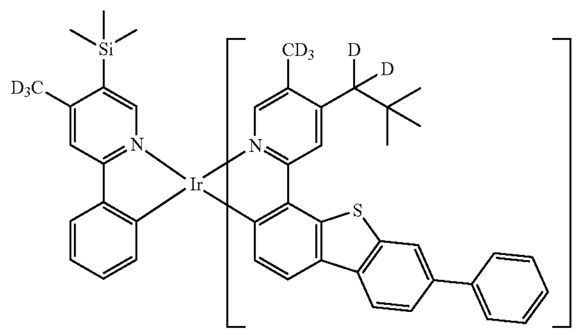
3318
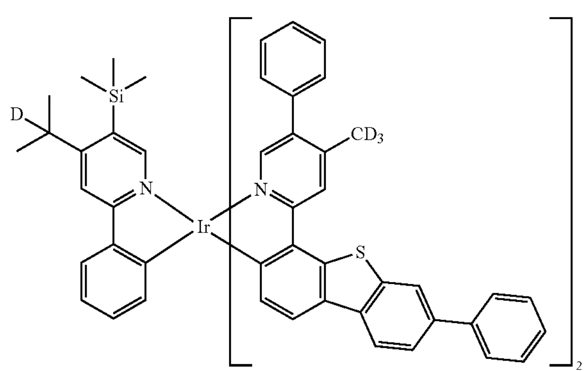
3319
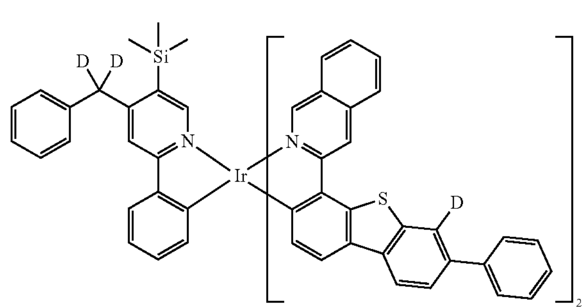

-continued
3320
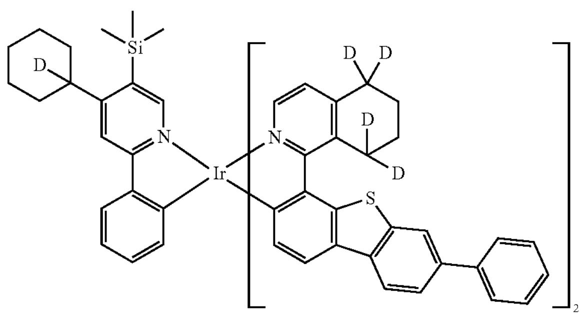
3321
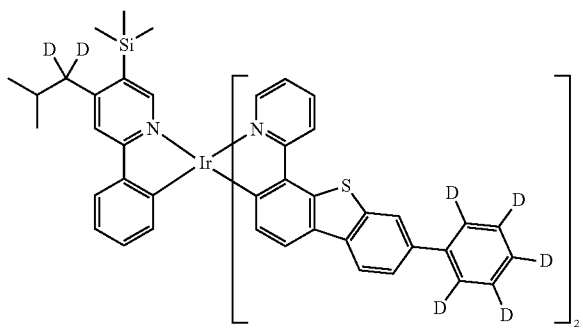
3322
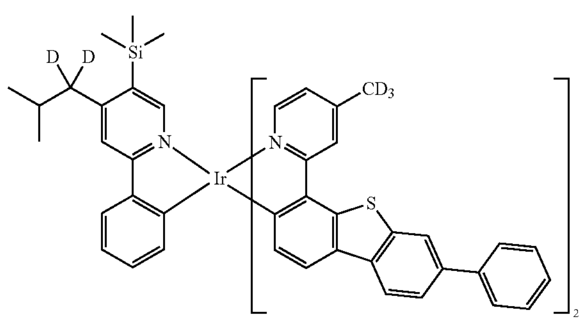
3323
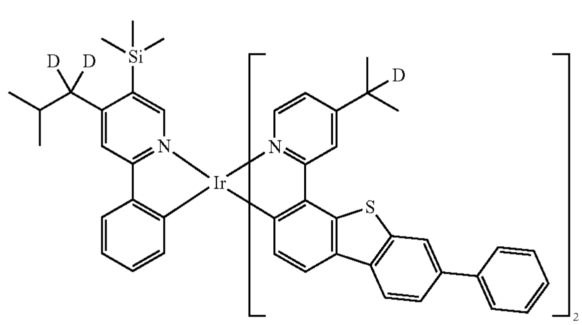
-continued
3324
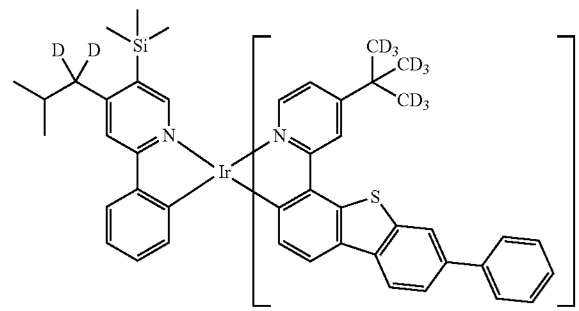
3325
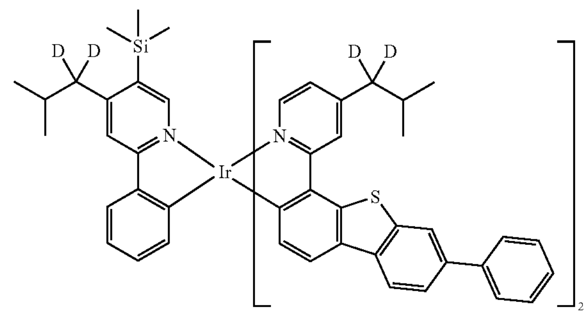
3326
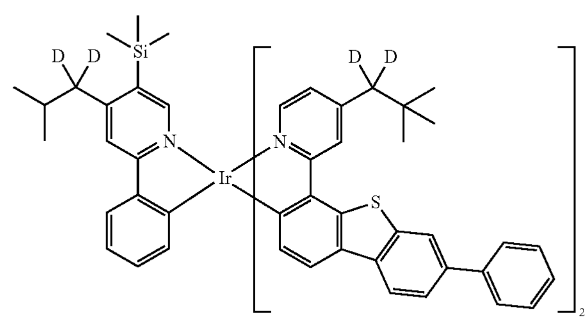
3327
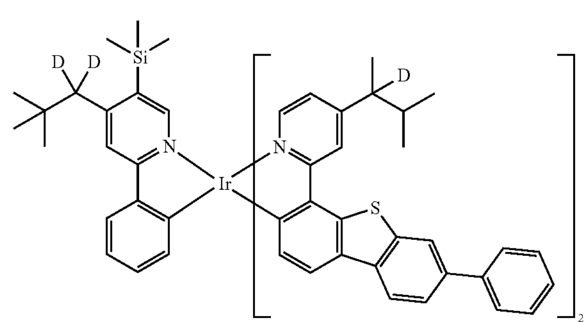

-continued
3328
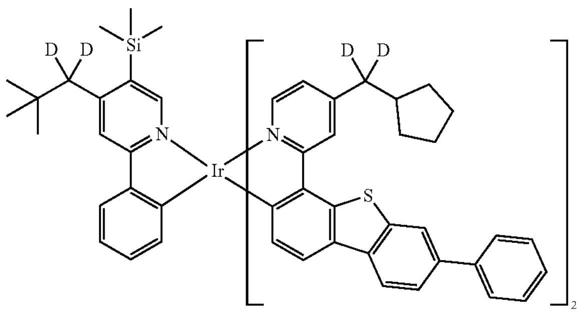
3329
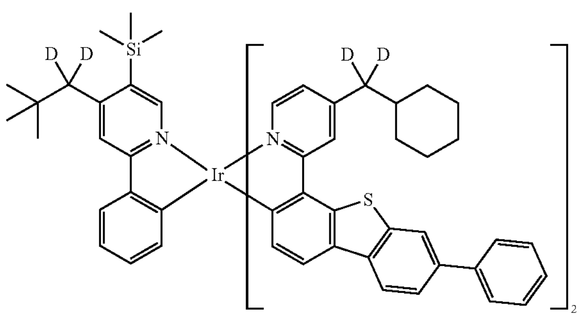
3330
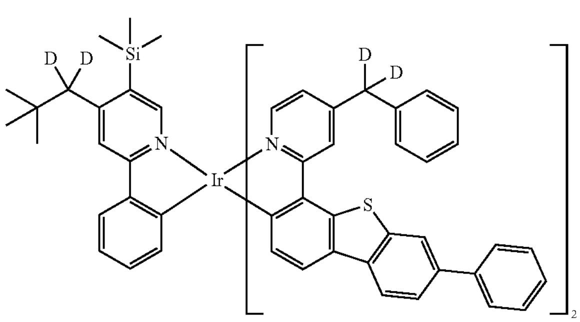
3331
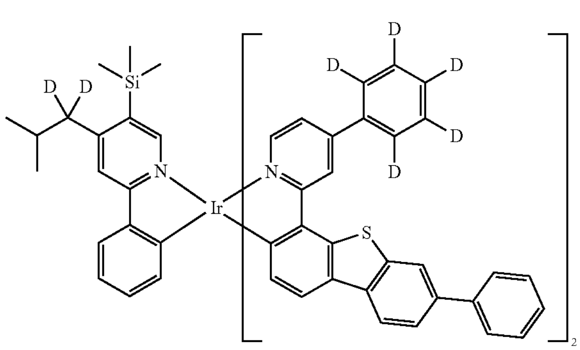
-continued
3332
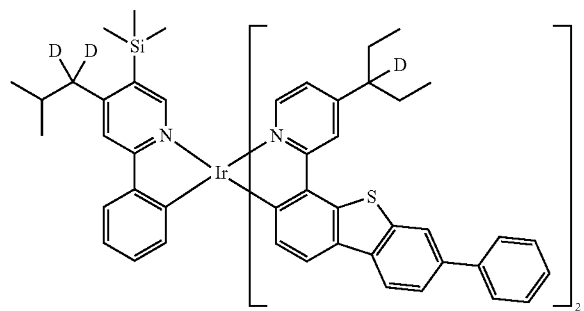
3333
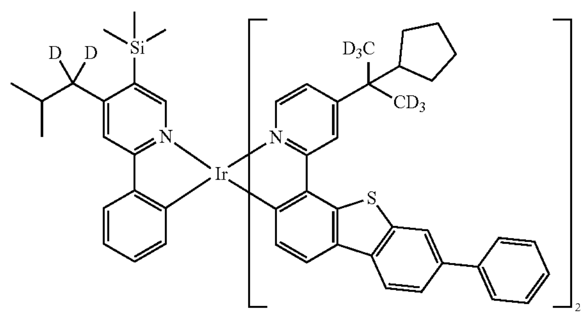
3334
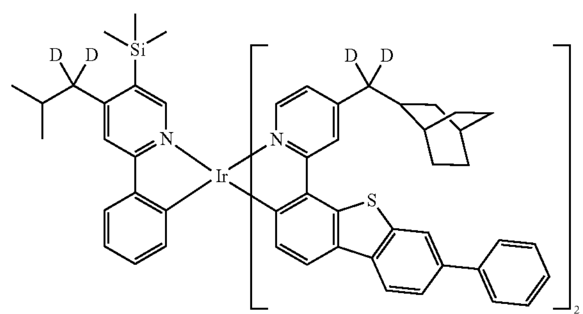
3335
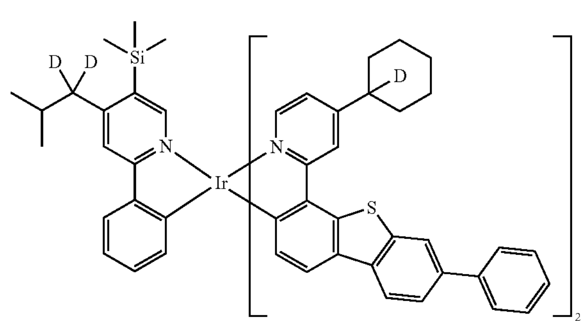

-continued
3336
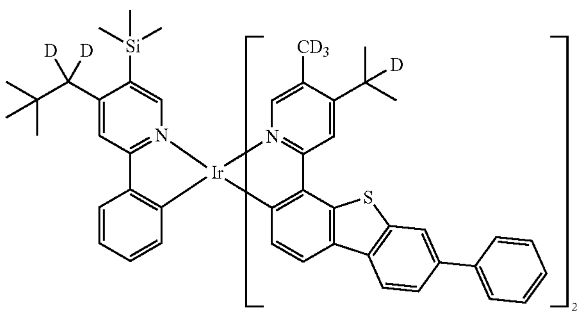
3337
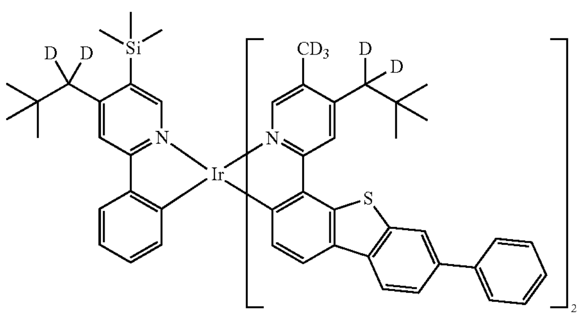
3338
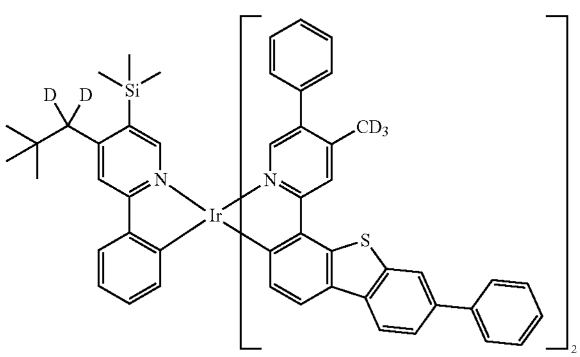
3339
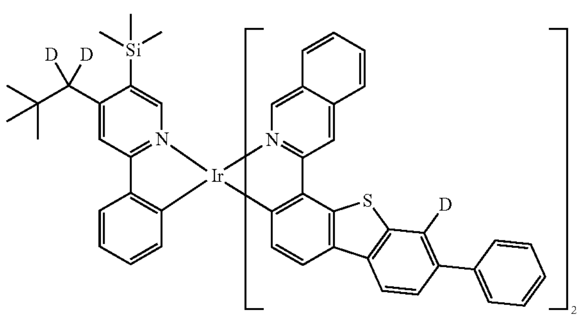
-continued
3340
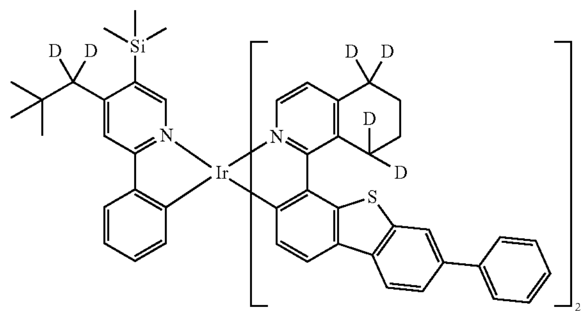
3341
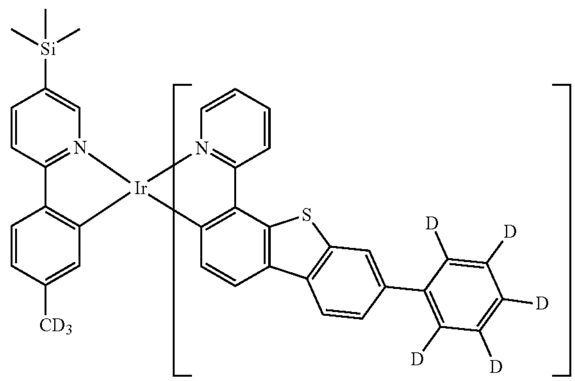
3342
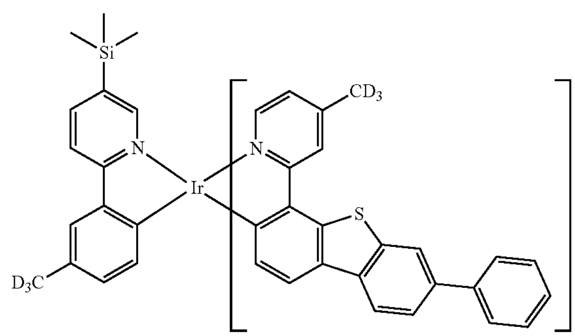
3343
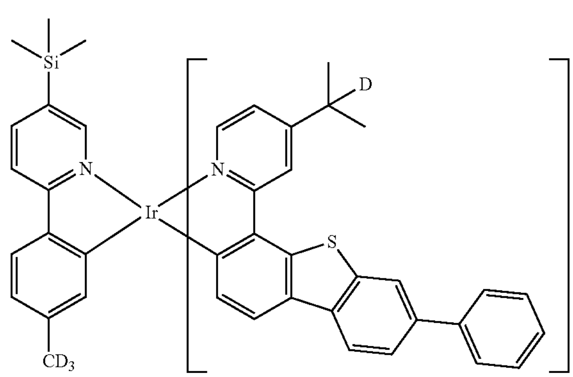

-continued
3344
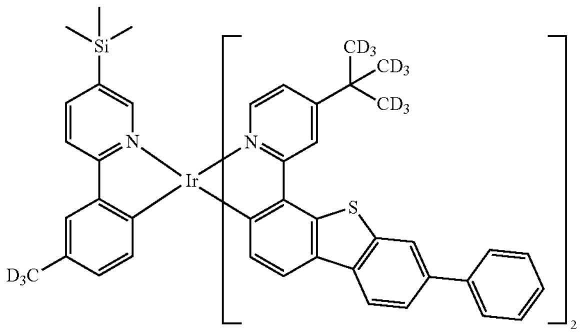
3345
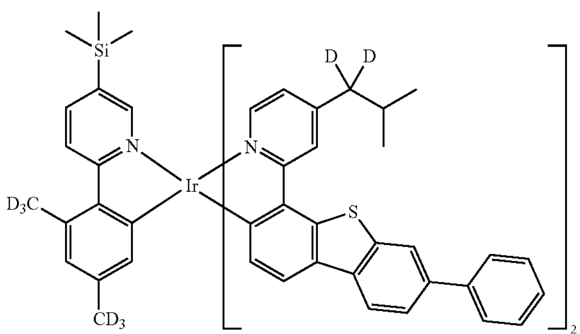
3346
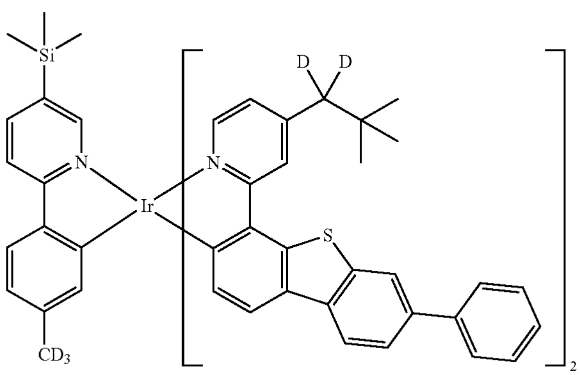
3347
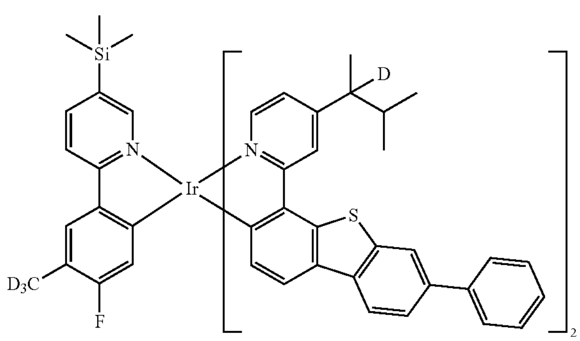
-continued
3348
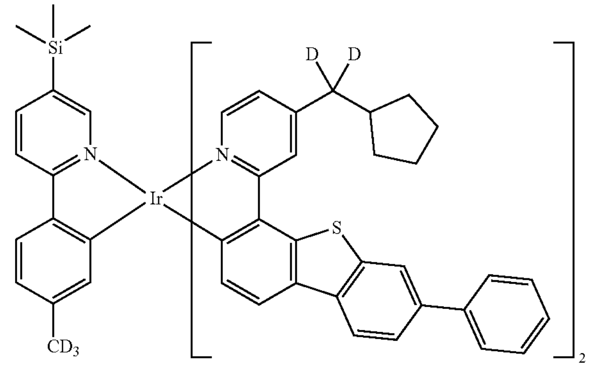
3349
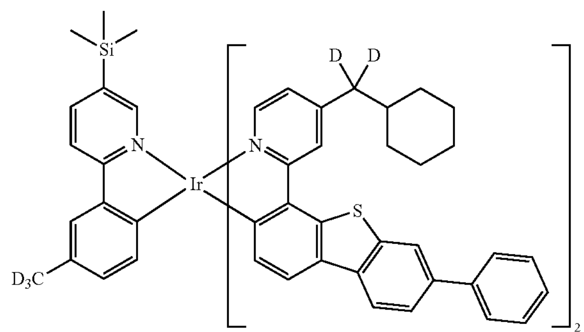
3350
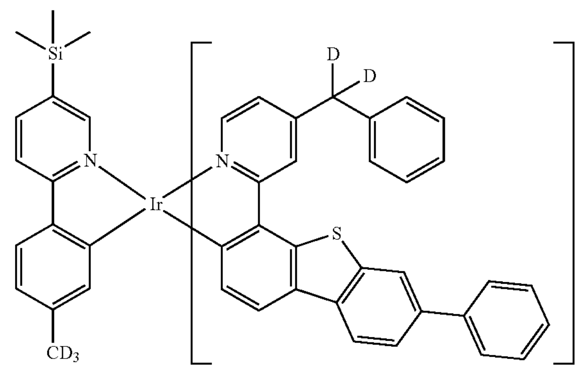
3351
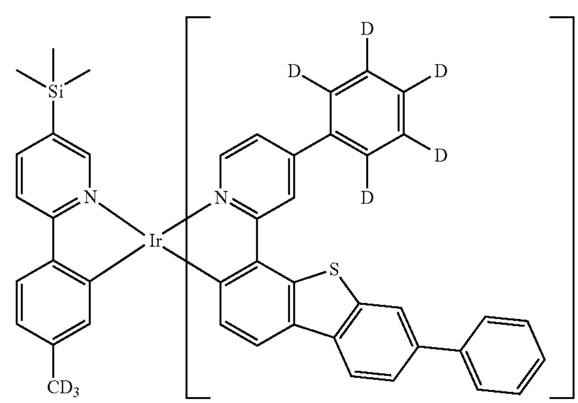

-continued
3352
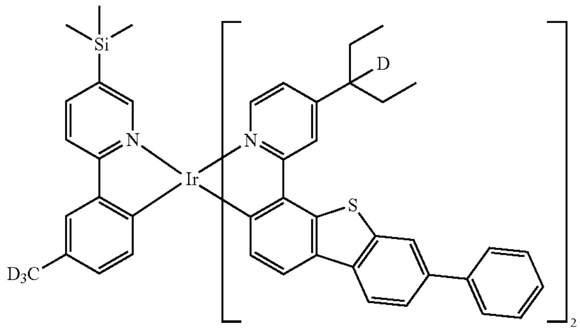
3353
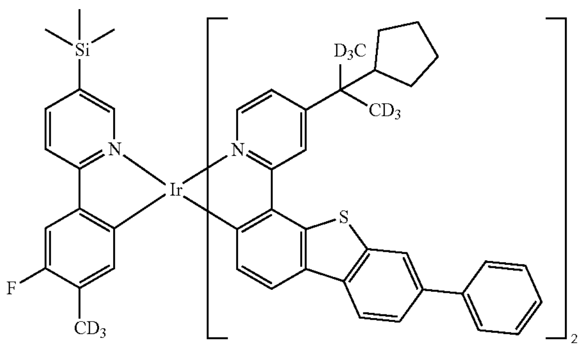
3354
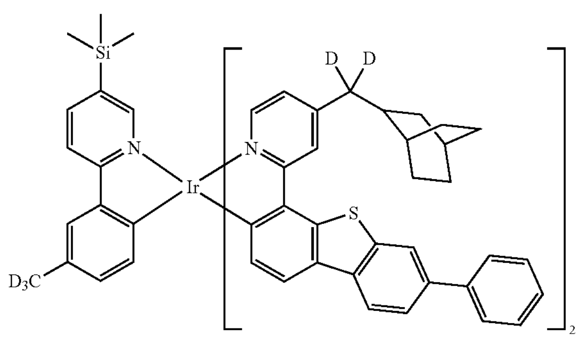
3355
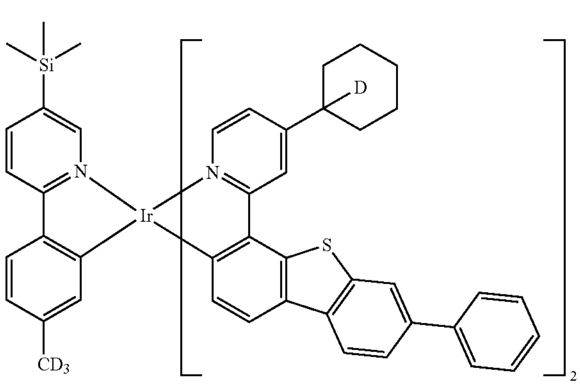
-continued
3356
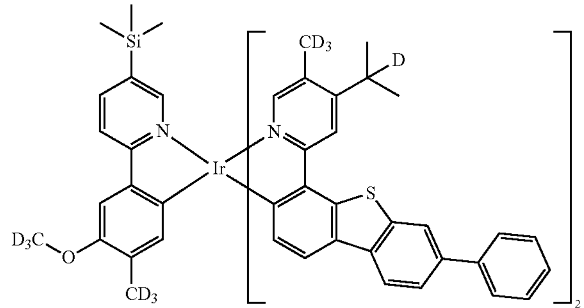
3357
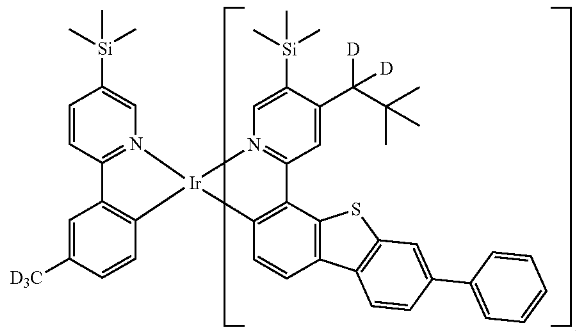
3358
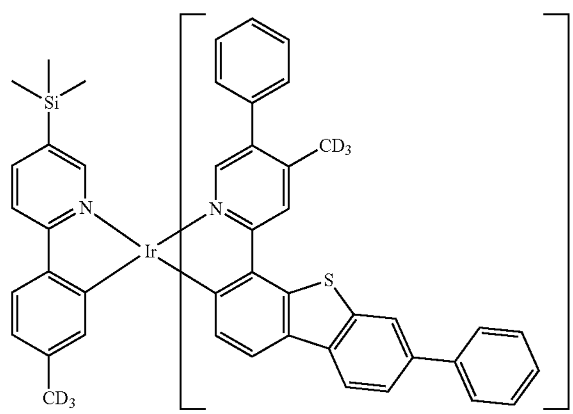
3359
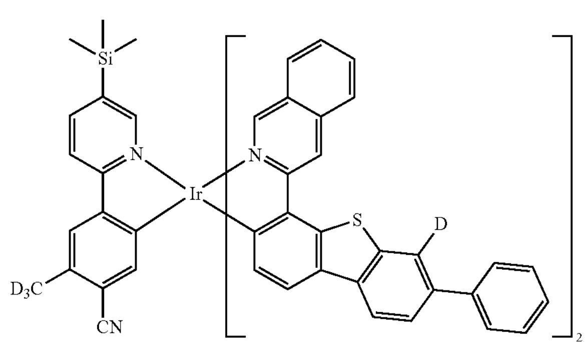

-continued
3360
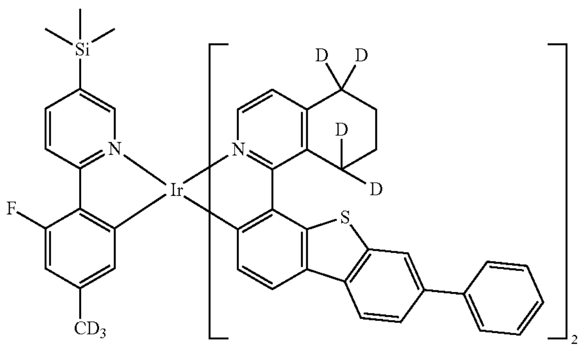
3361
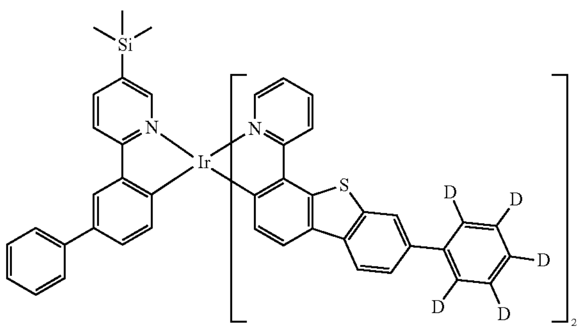
3362
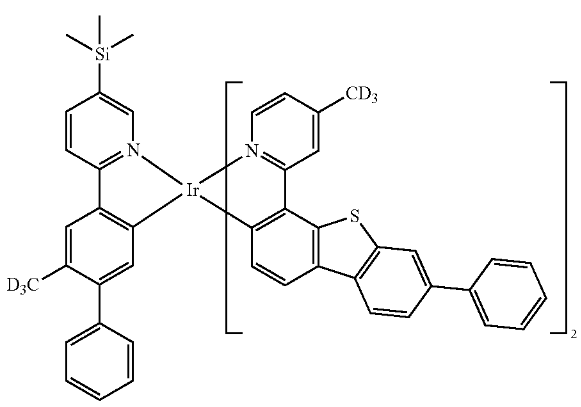
3363
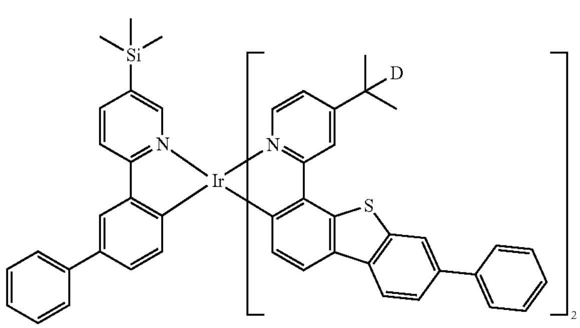
-continued
3364
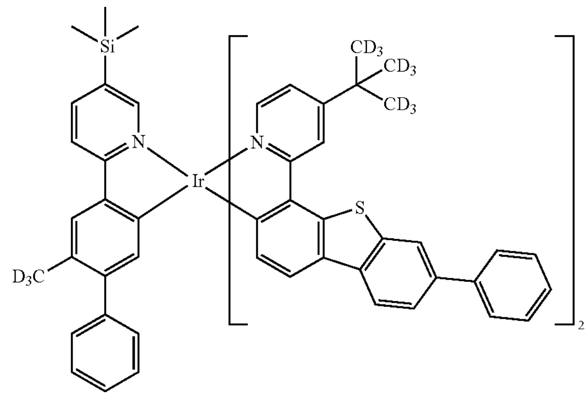
3365
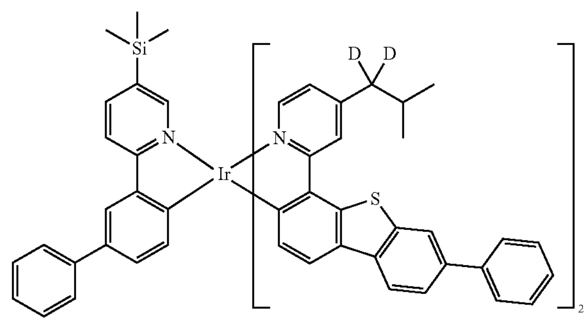
3366
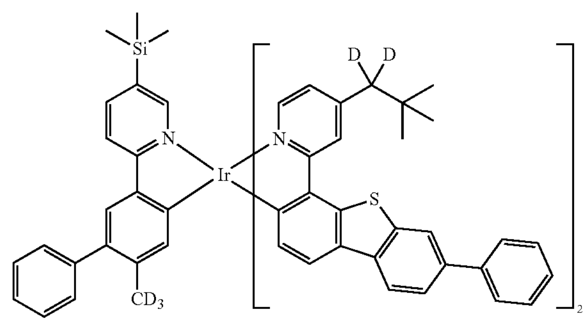
3367
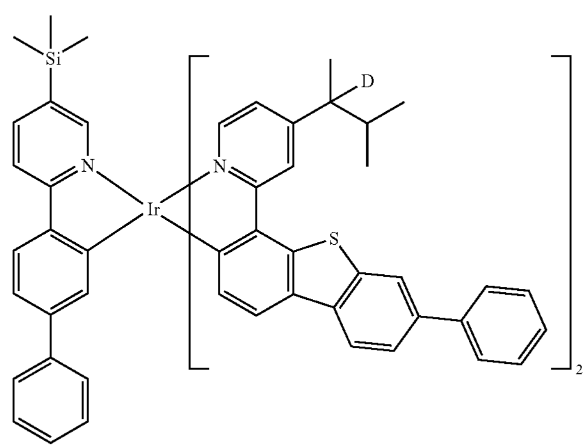

-continued
3368
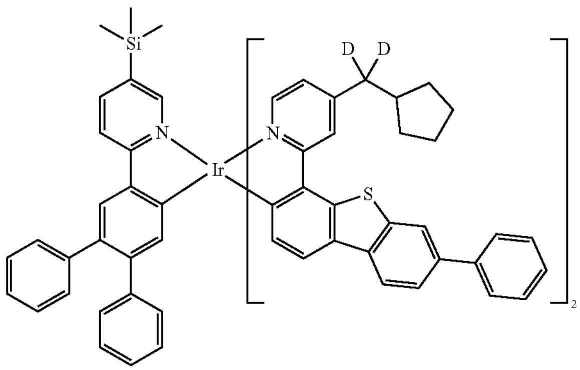
3369
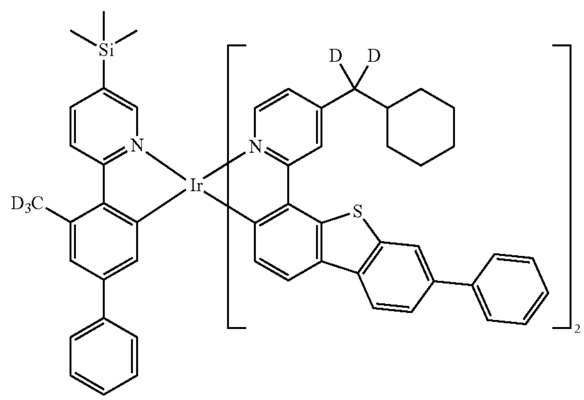
3370
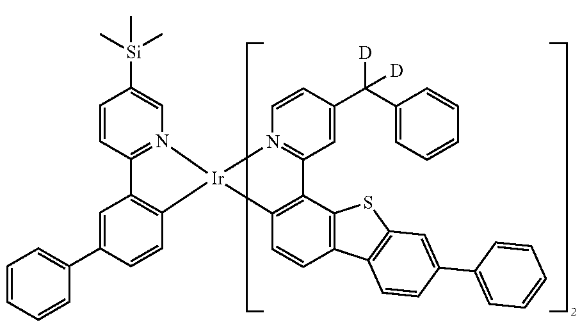
3371
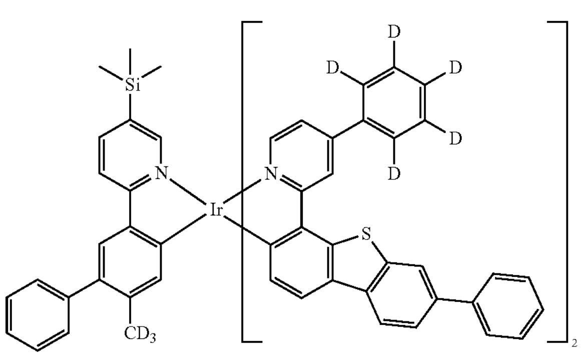
-continued
3372
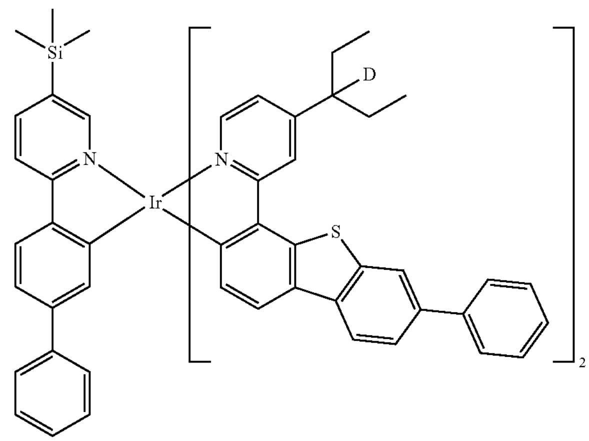
3373
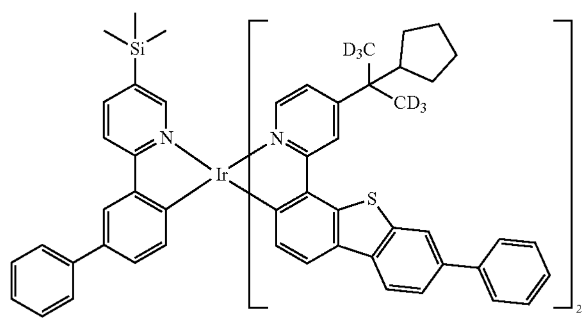
3374
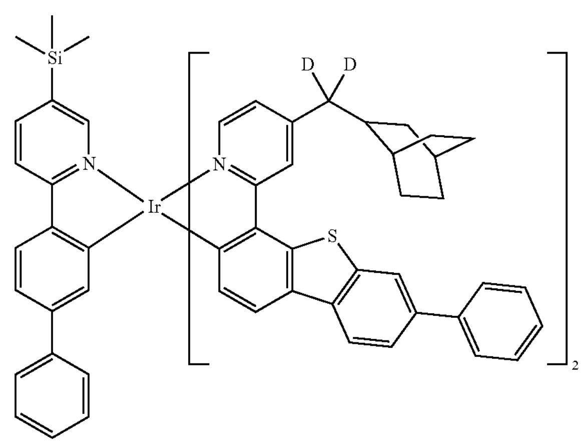
3375
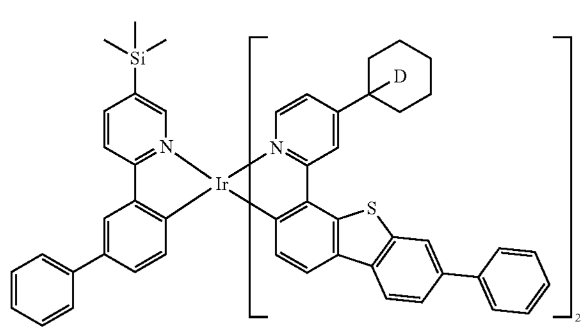

-continued
3376
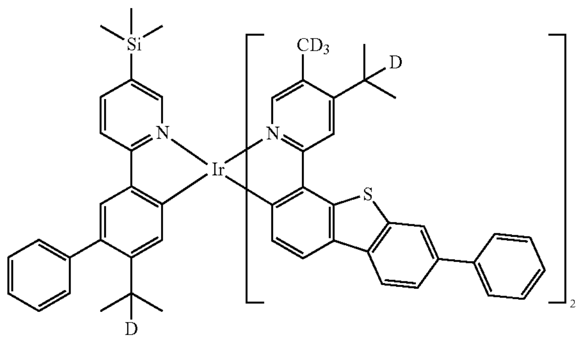
3377
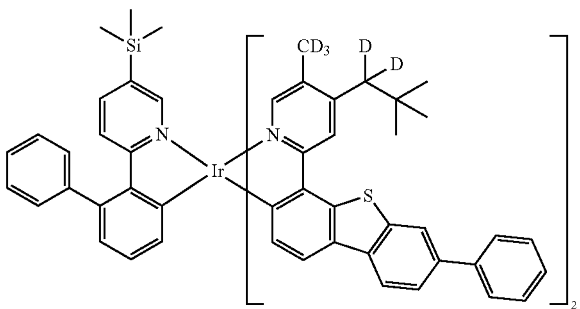
3378
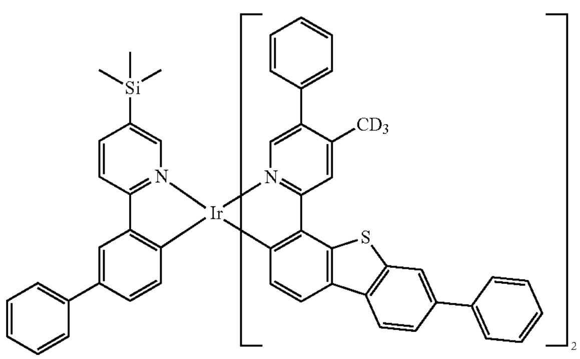
3379
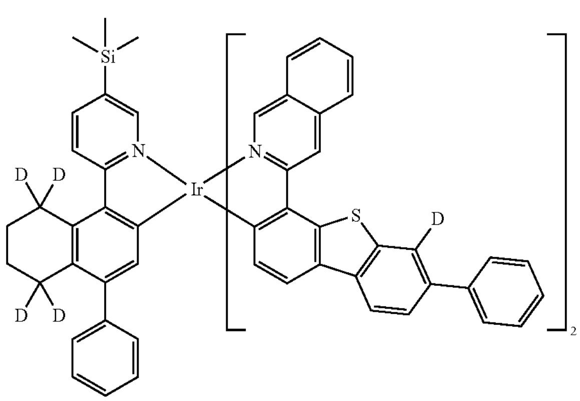
-continued
3380
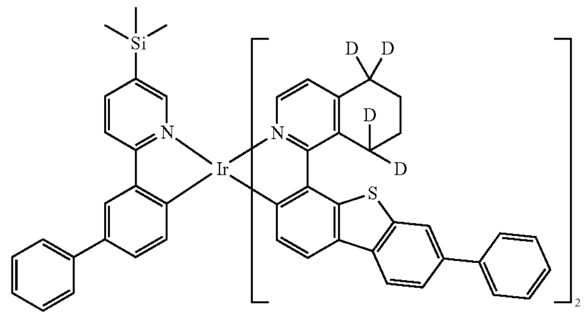
3381
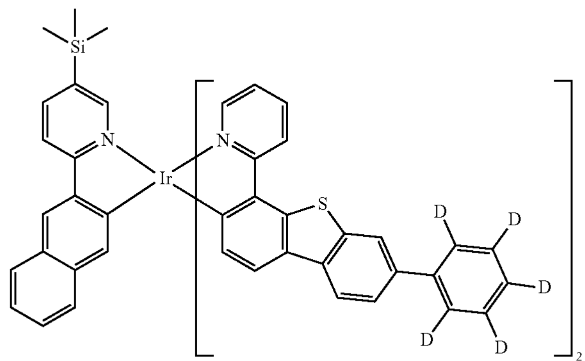
3382
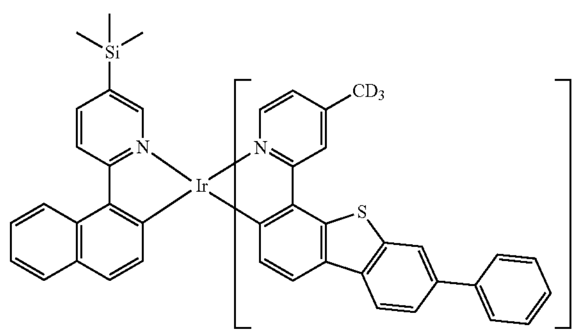
3383
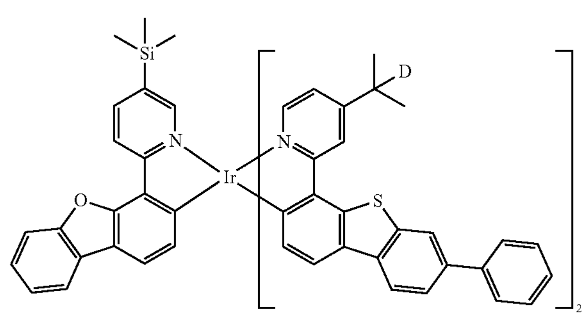

-continued
3384
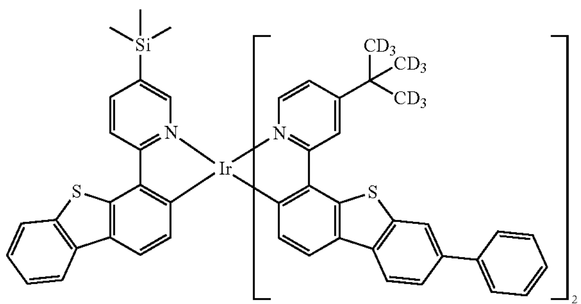
3385
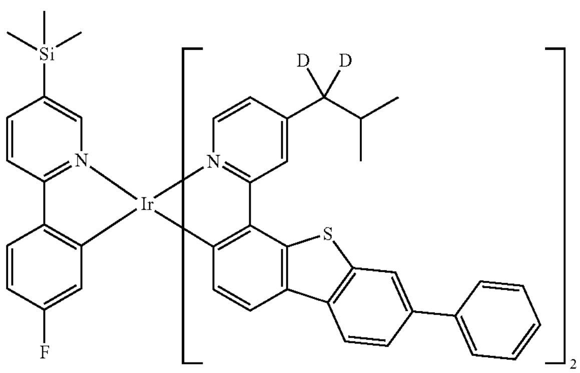
3386
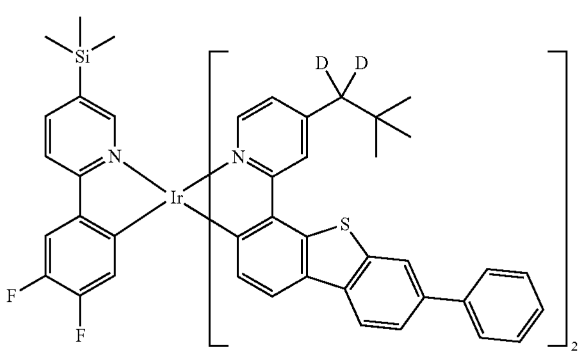
3387
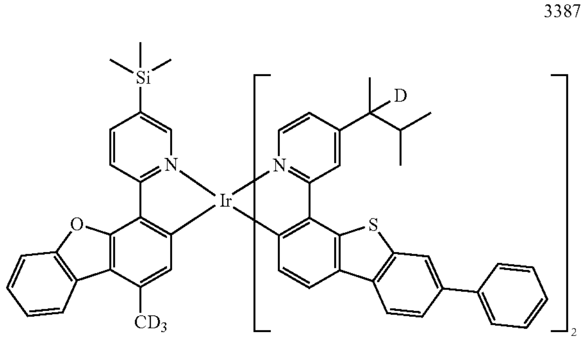
-continued
3388
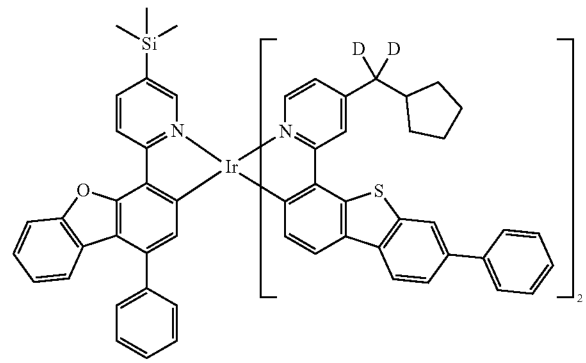
3389
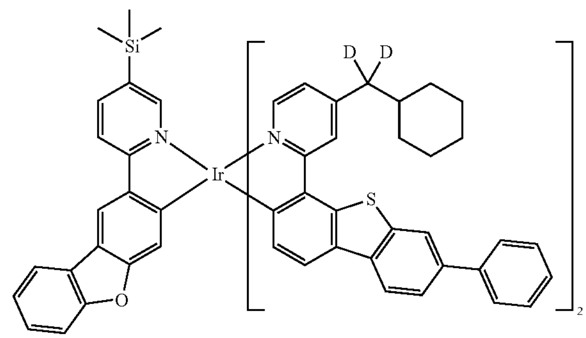
3390
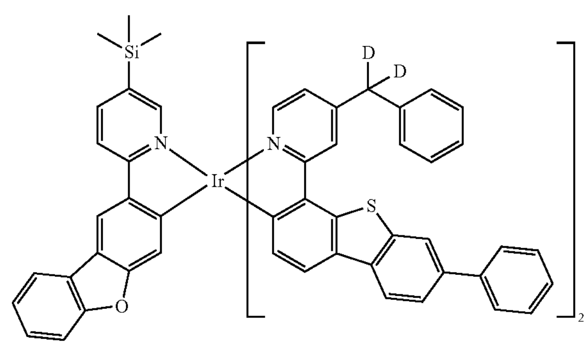
3391
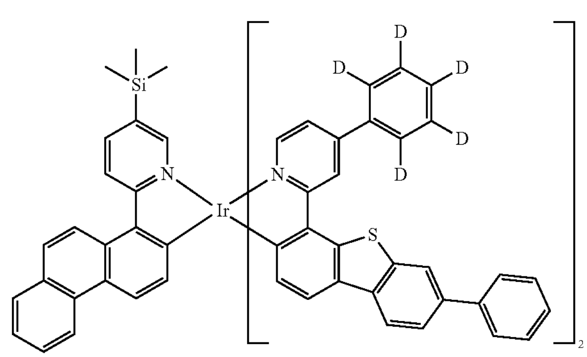

-continued
3392
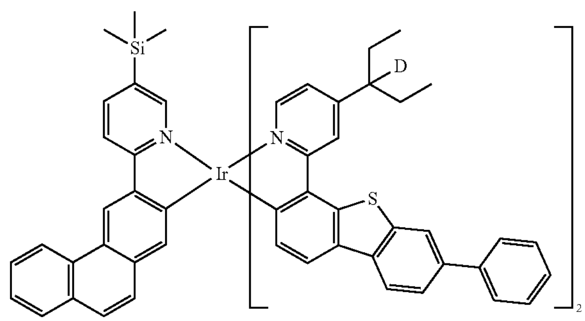
3393
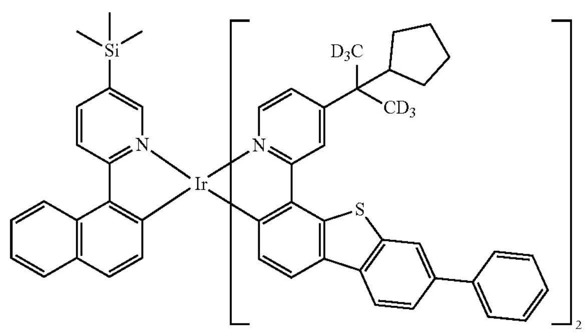
3394
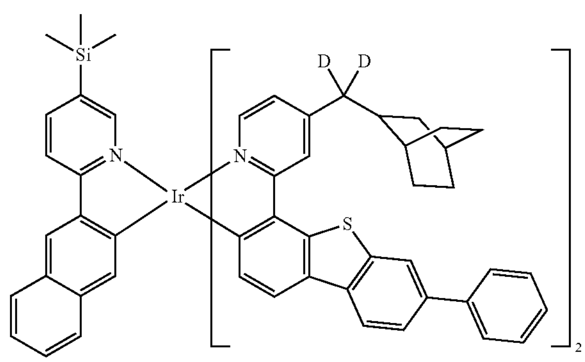
3395
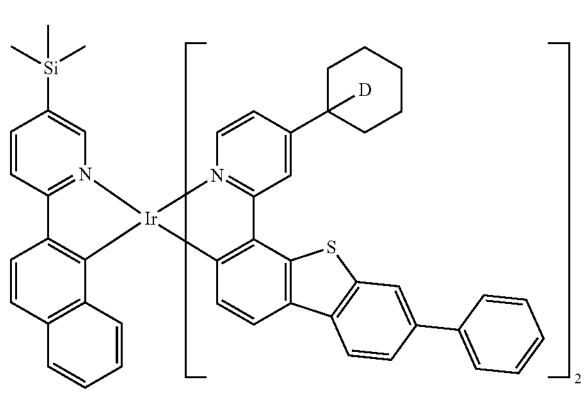
-continued
3396
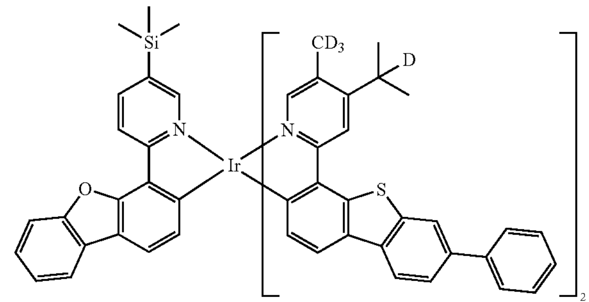
3397
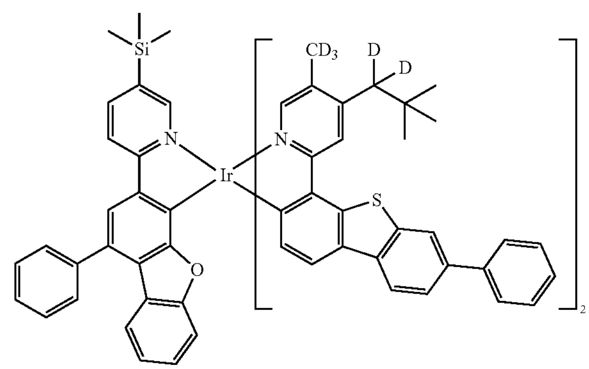
3398
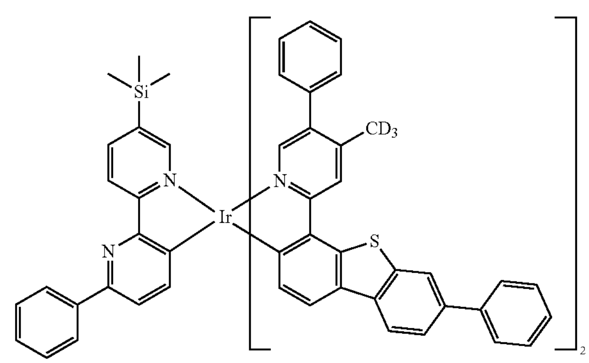
3399
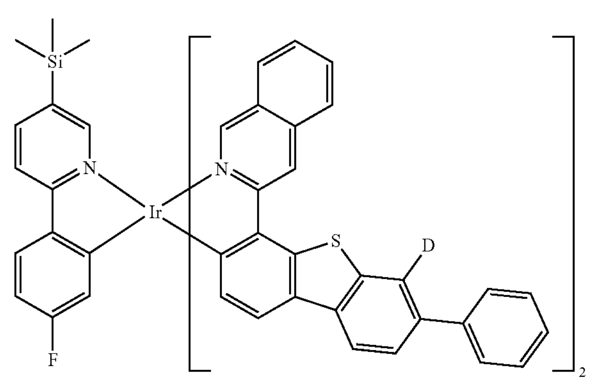

3400
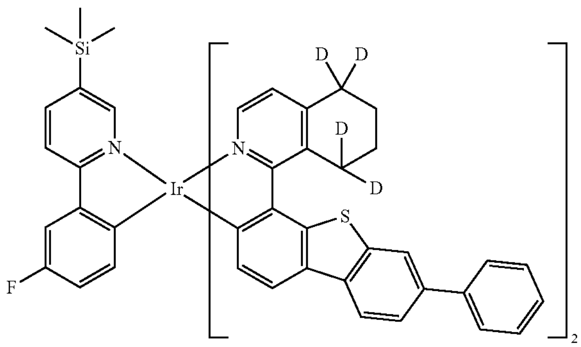
3401
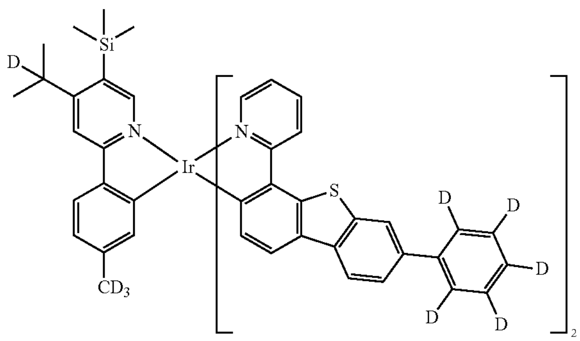
3402
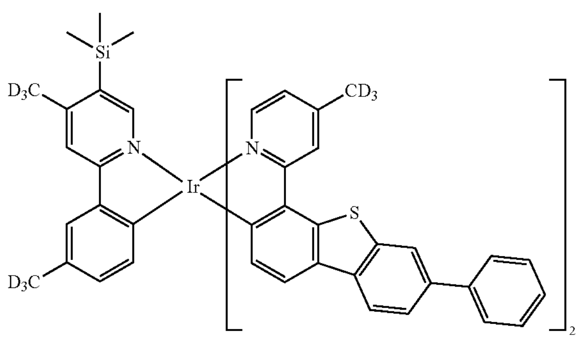
3403
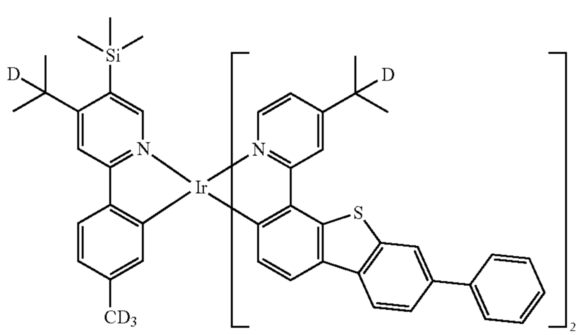
3404
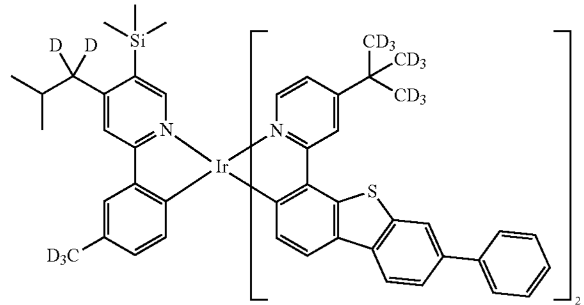
3405
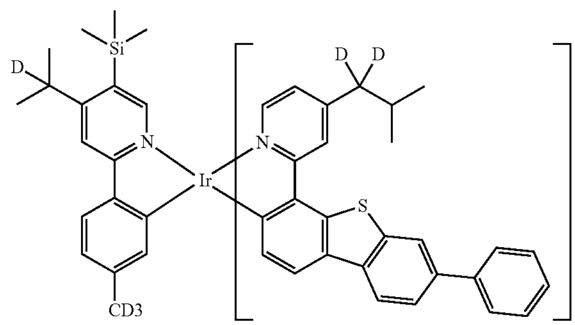
3406
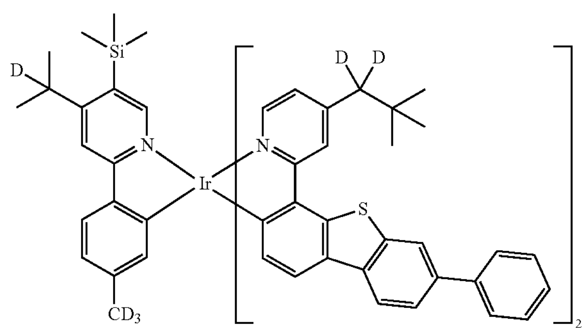
3407
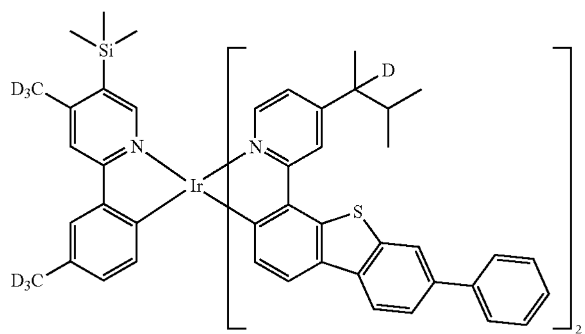

-continued
3408
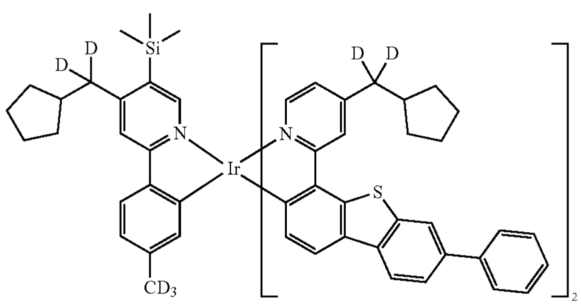
3409
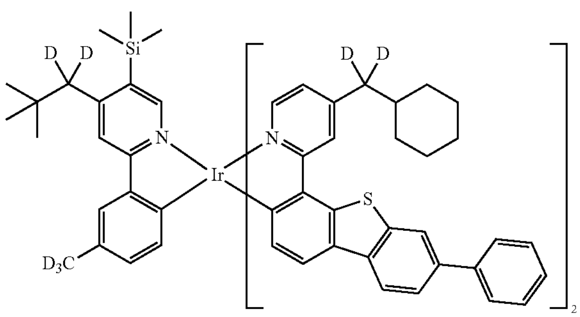
3410
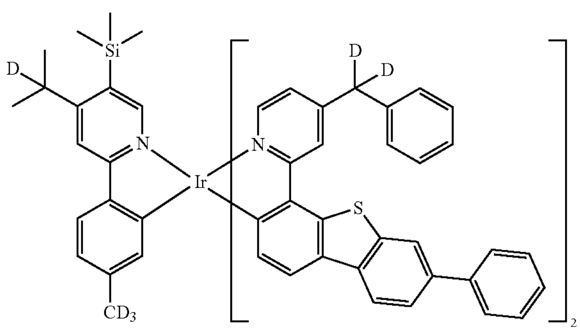
3411
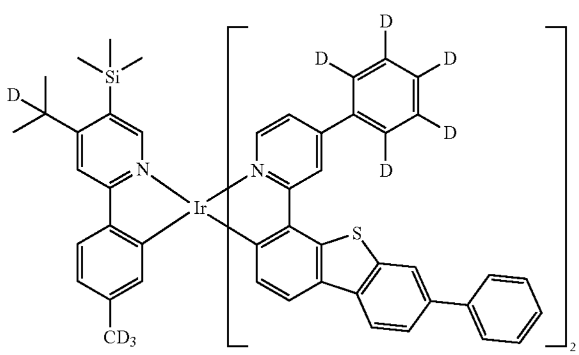
-continued
3412
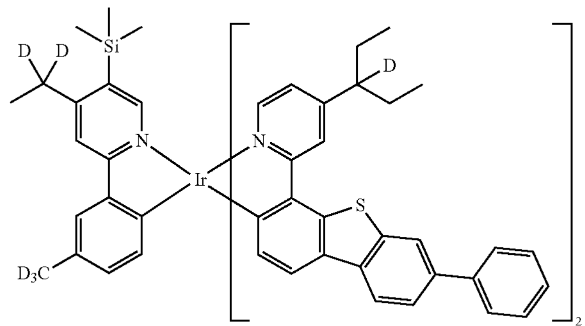
3413
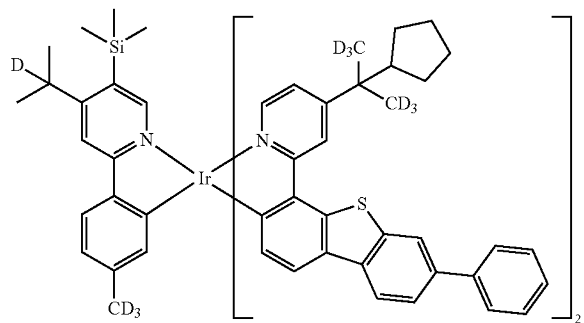
3414
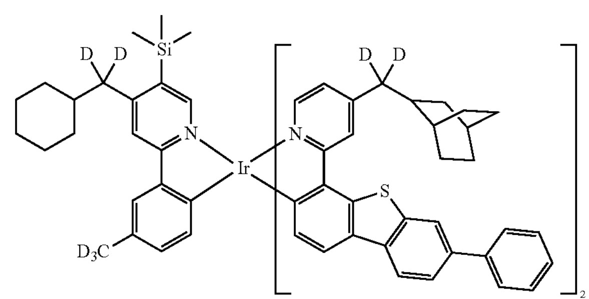
3415
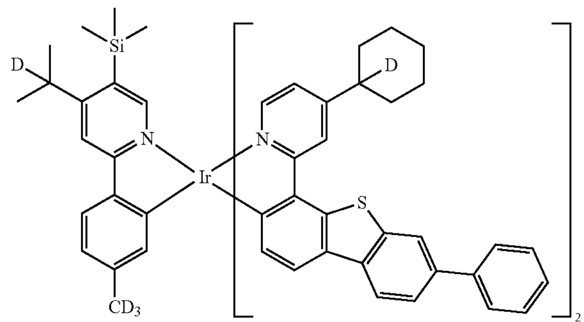

3416
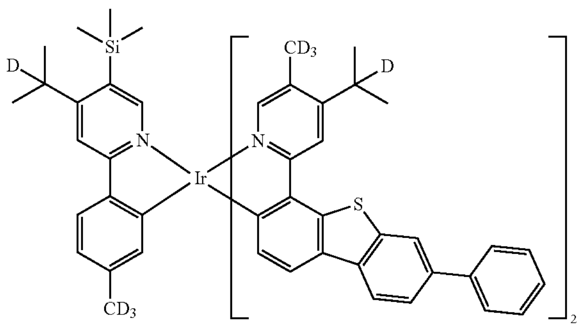
3417
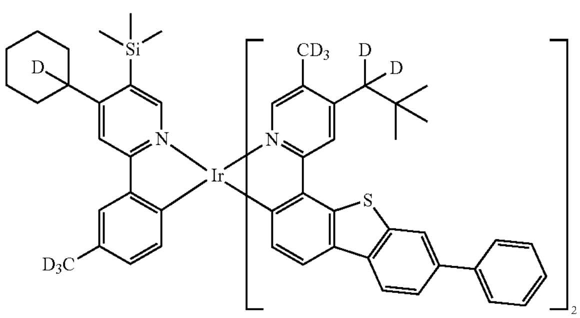
3418
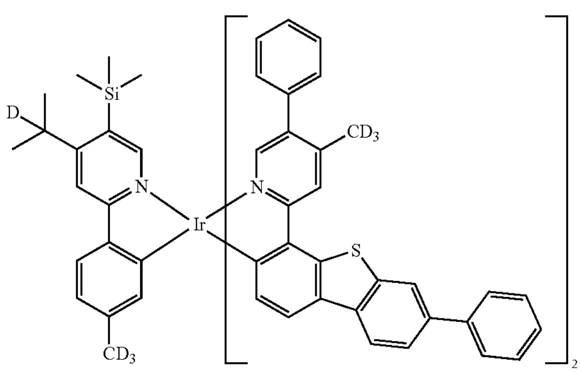
3419
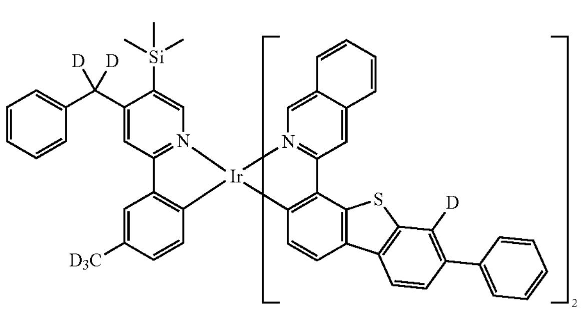
3420
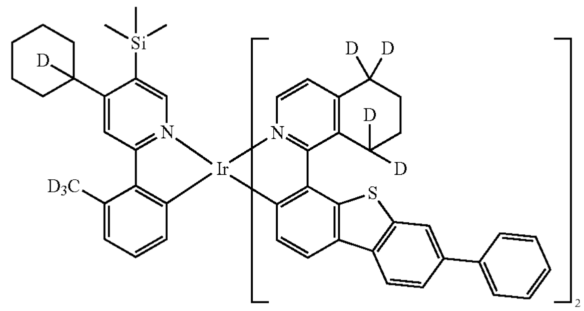
3421
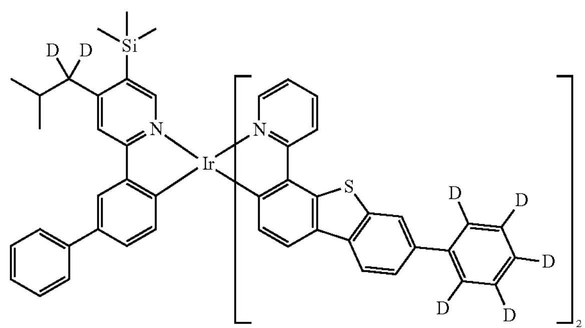
3422
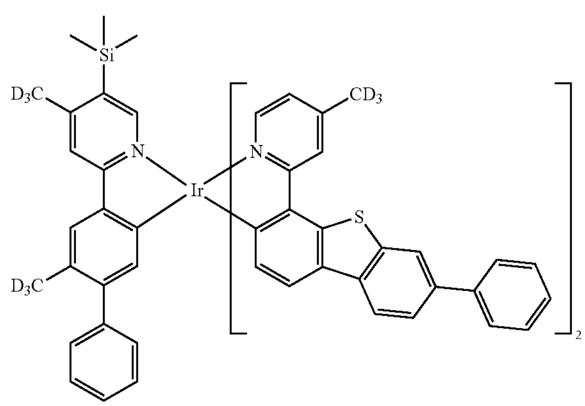
3423
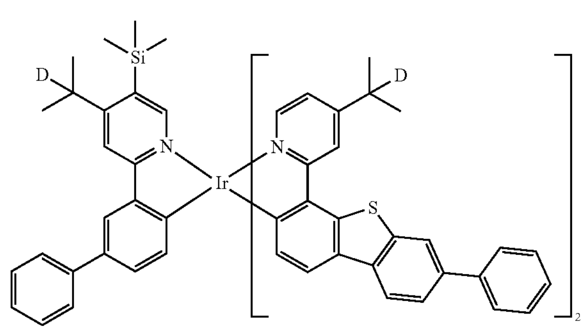

3424
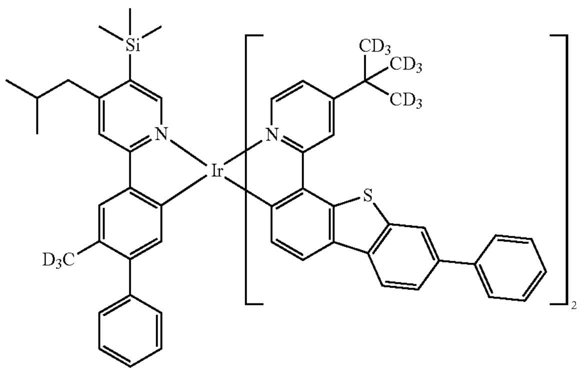
3425
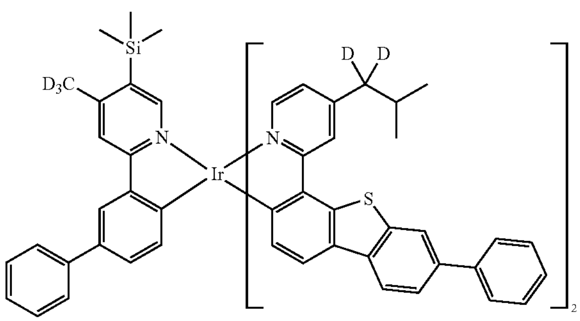
3426
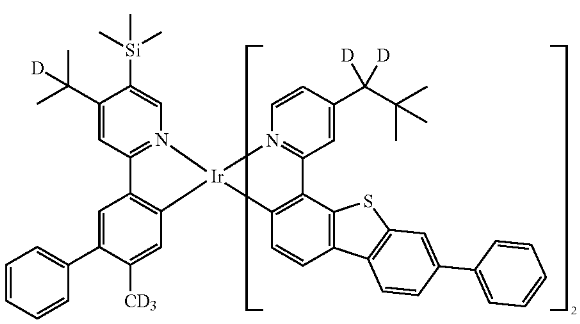
3427
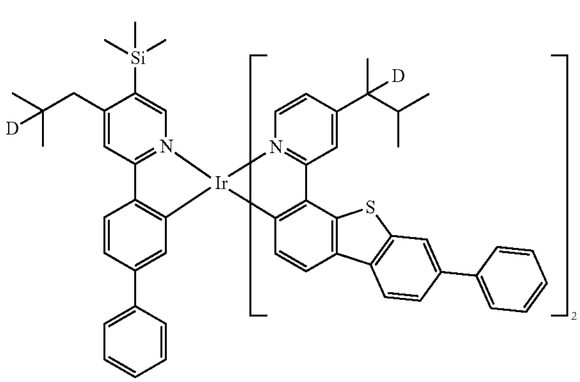
3428
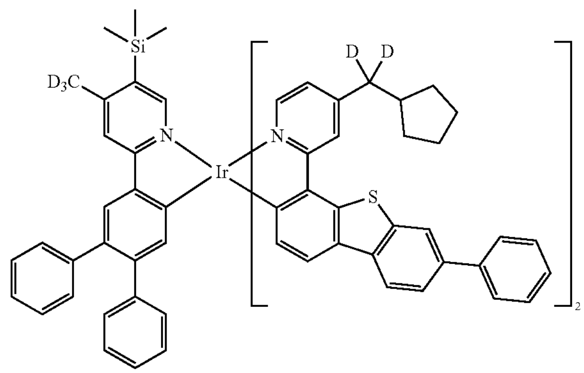
3429
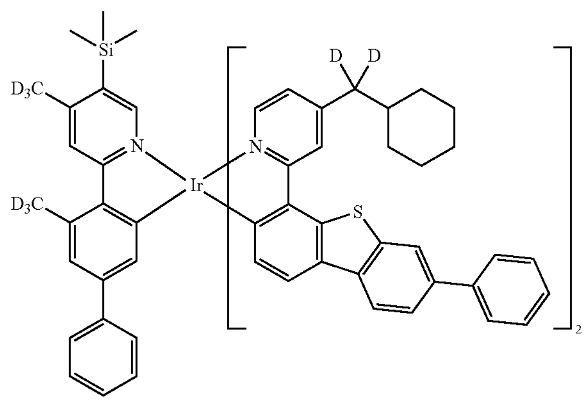
3430
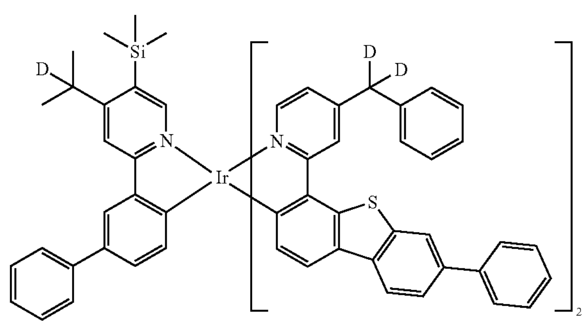
3431
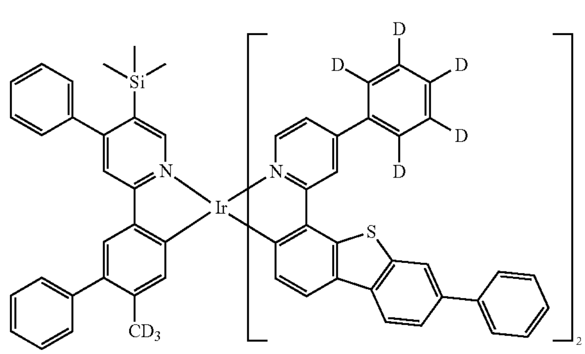

-continued
3432
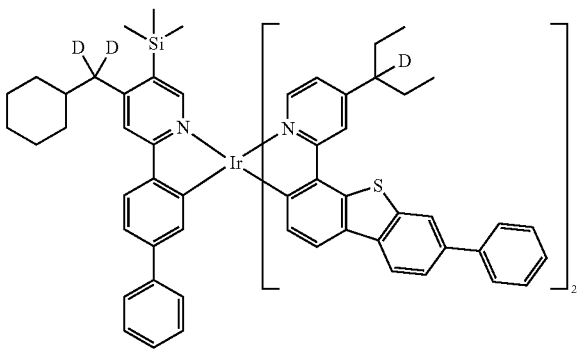
3433
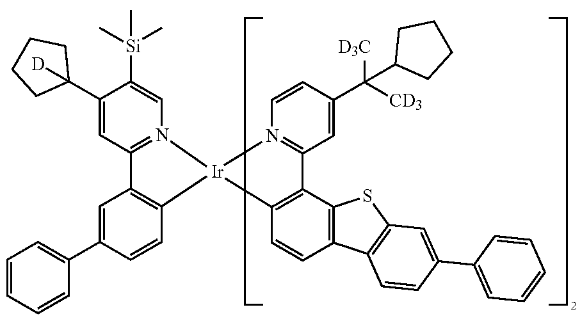
3434
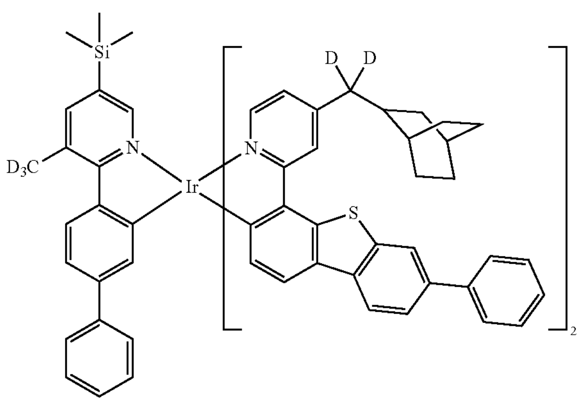
3435
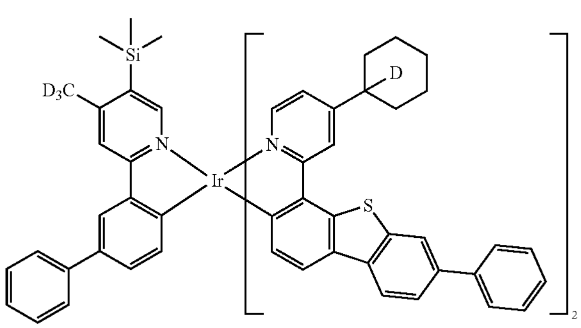
-continued
3436
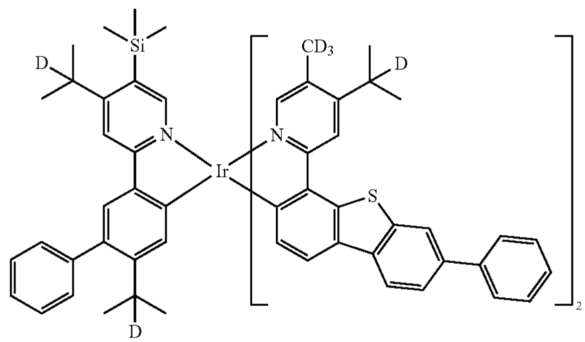
3437
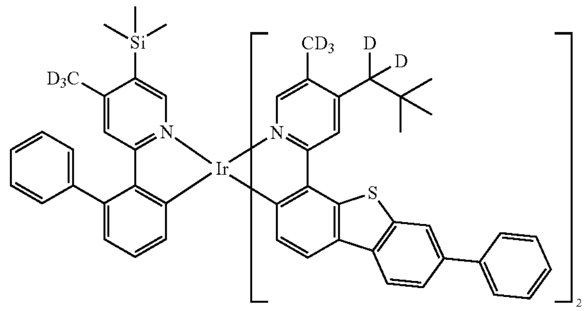
3438
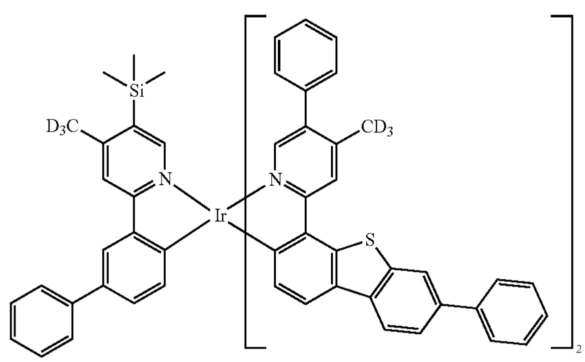
3439
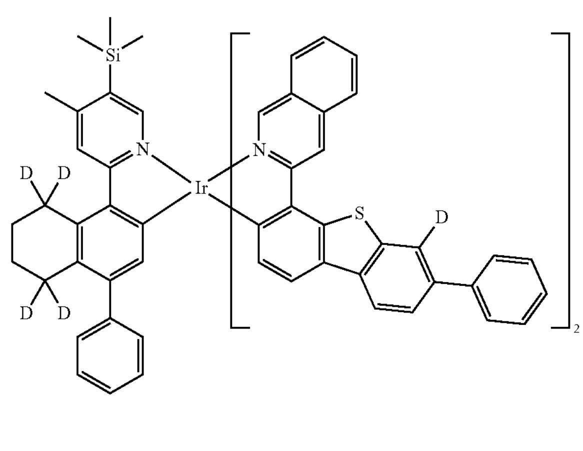

-continued
3440
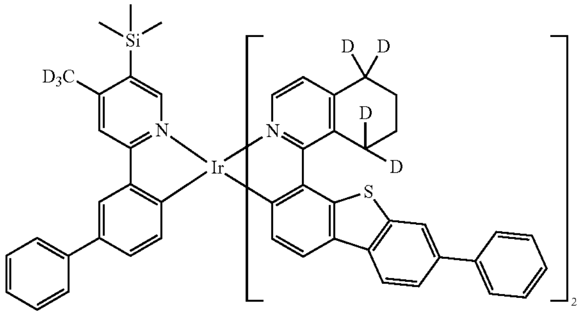
3441
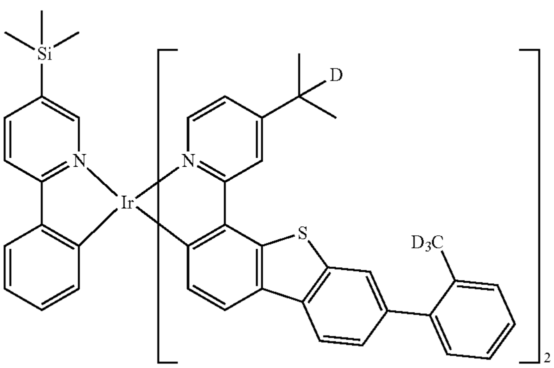
3442
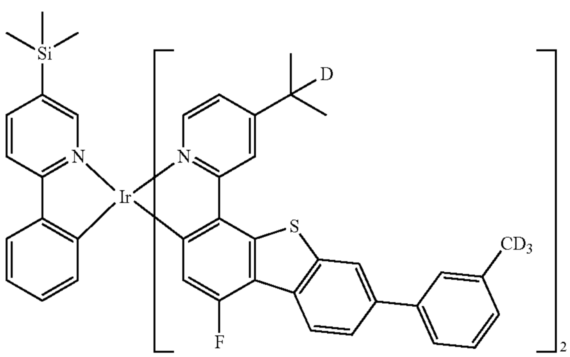
3443
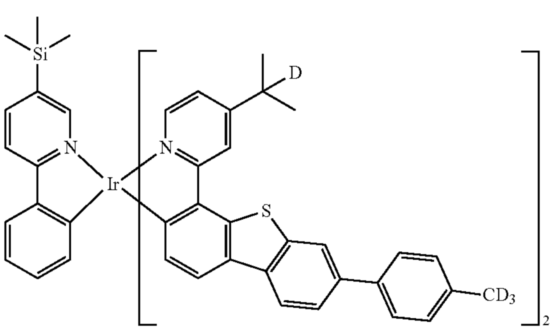
-continued
3444
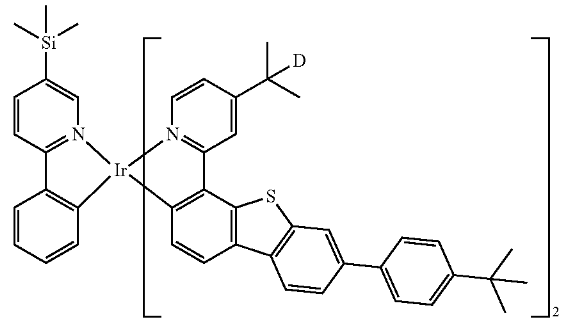
3445
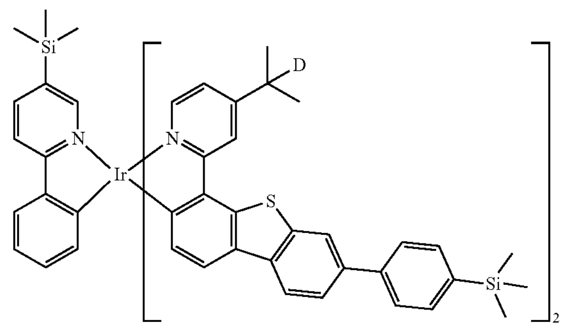
3446
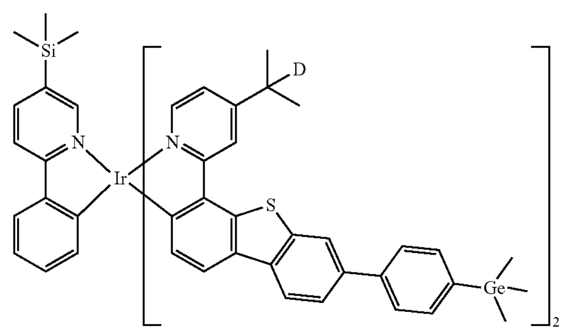
3447
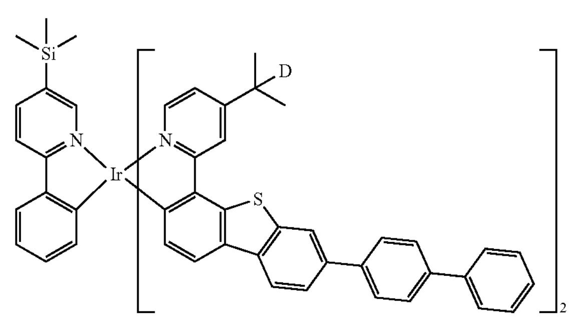

-continued
3448
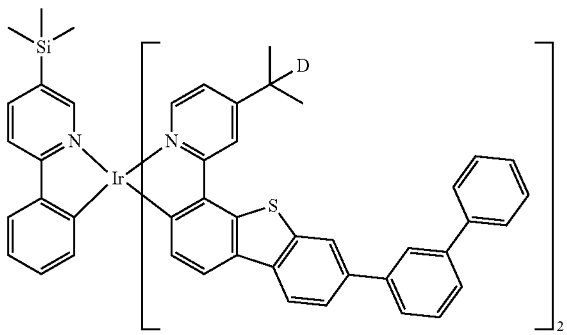
3449
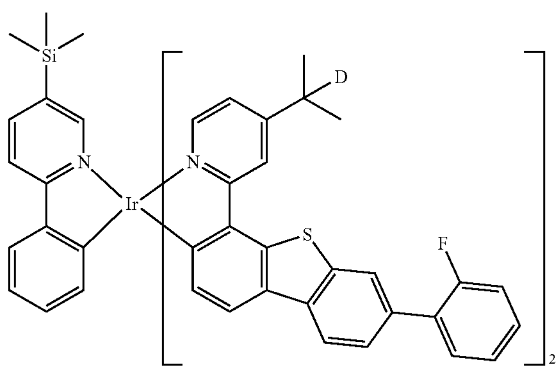
3450
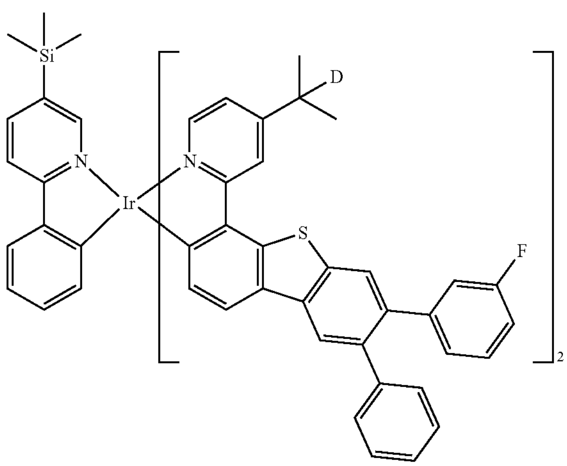
3451
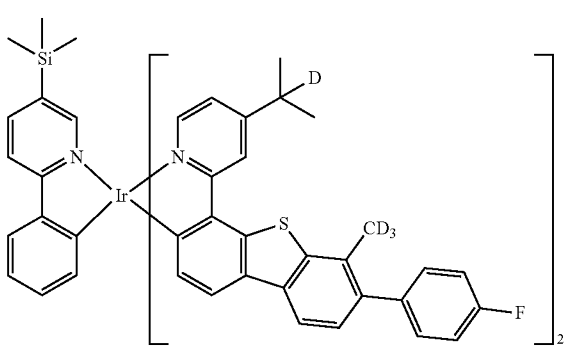
-continued
3452
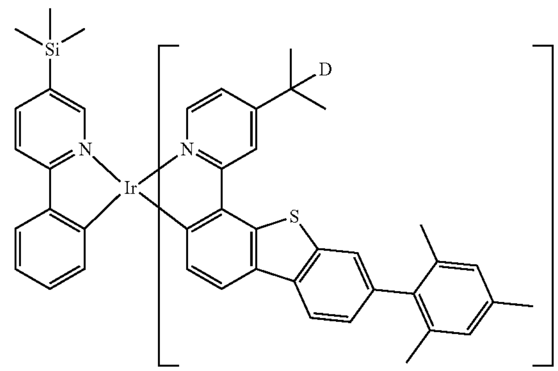
3453
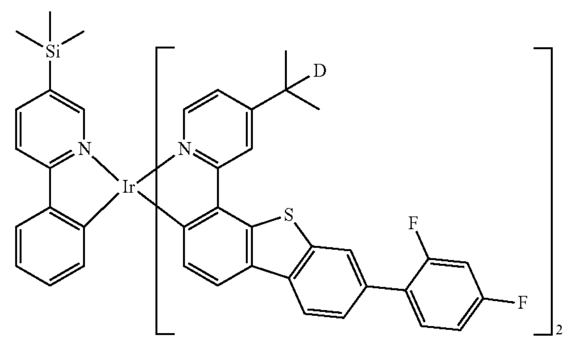
3454
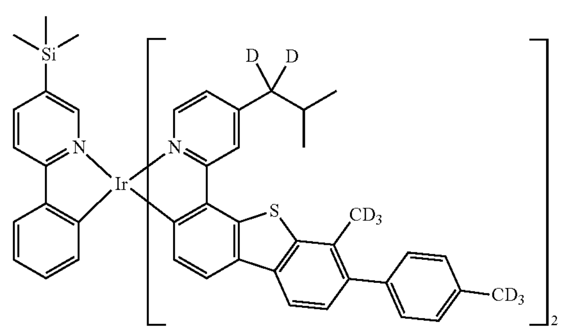
3455
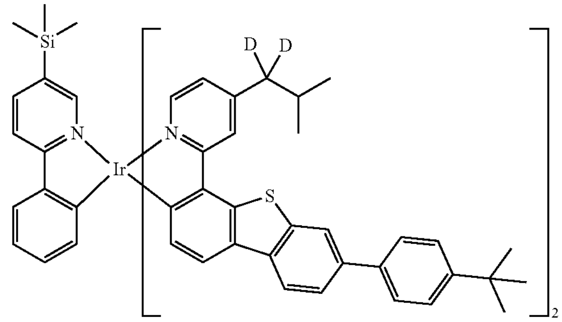

-continued
3456
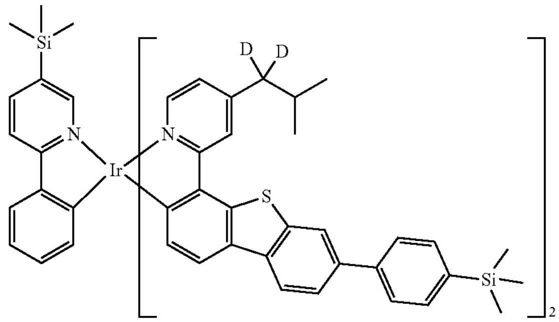
3457
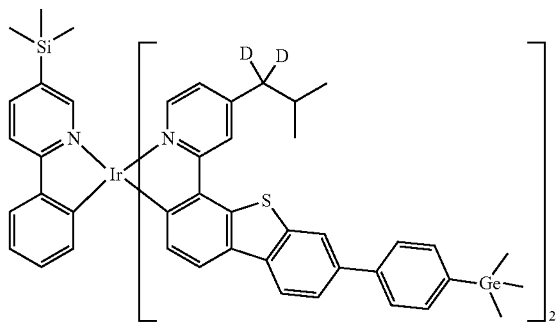
3458
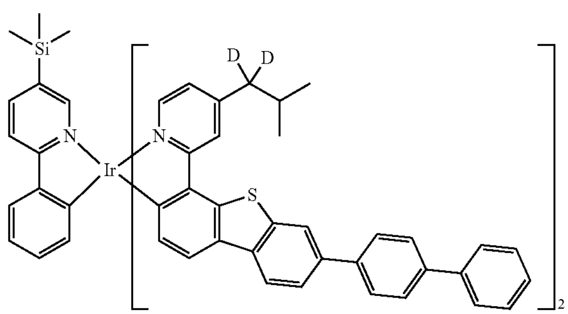
3459
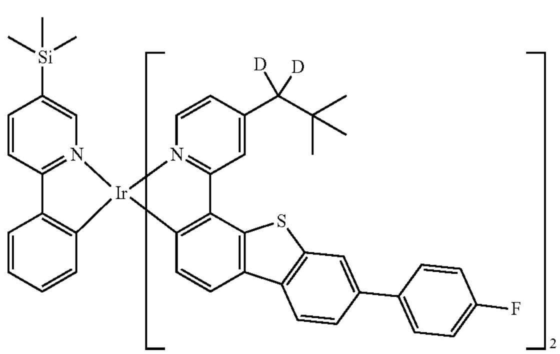
-continued
3460
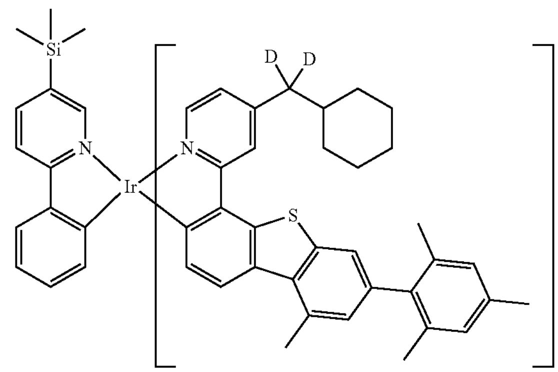
3461
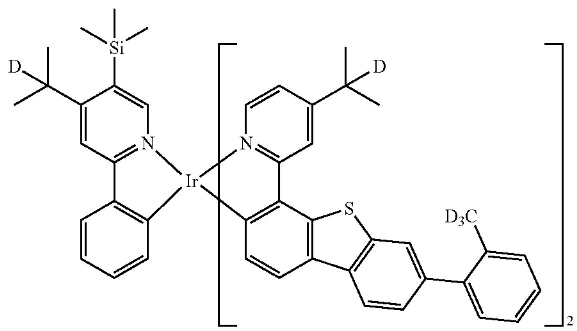
3462
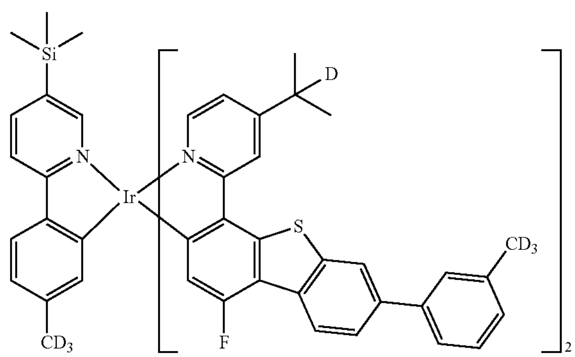
3463
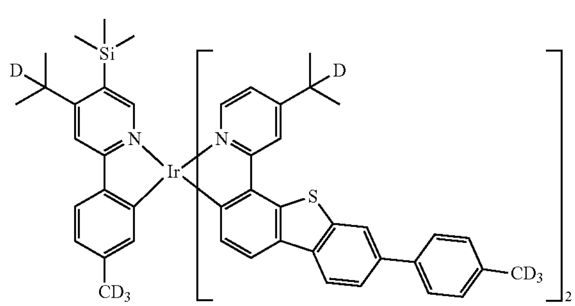

-continued
3464
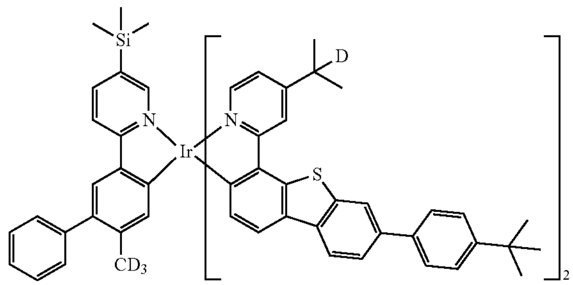
3465
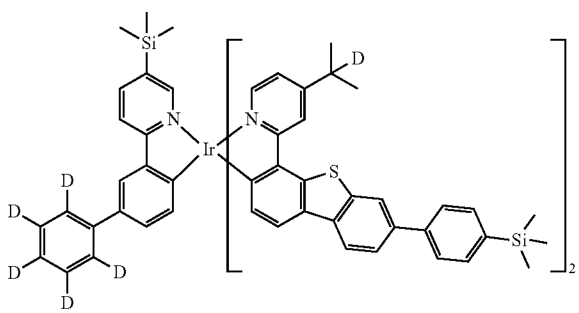
3466
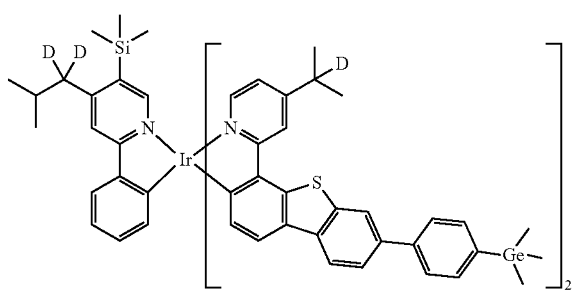
3467
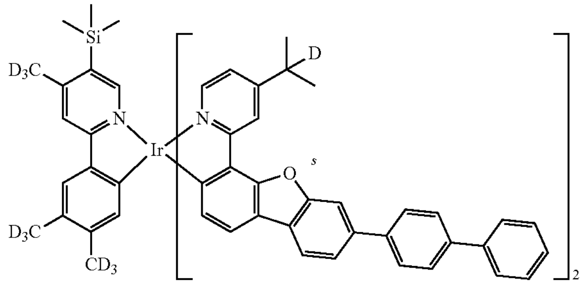
3468
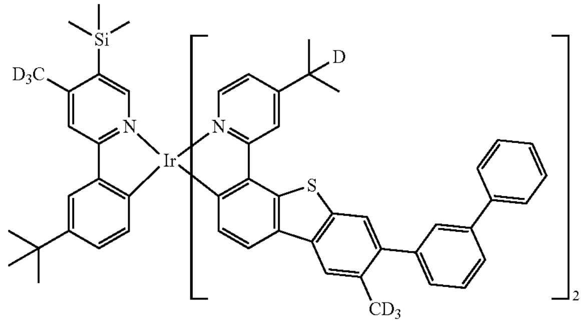
-continued
3469
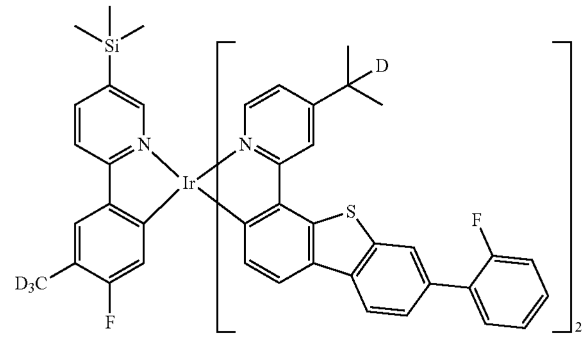
3470
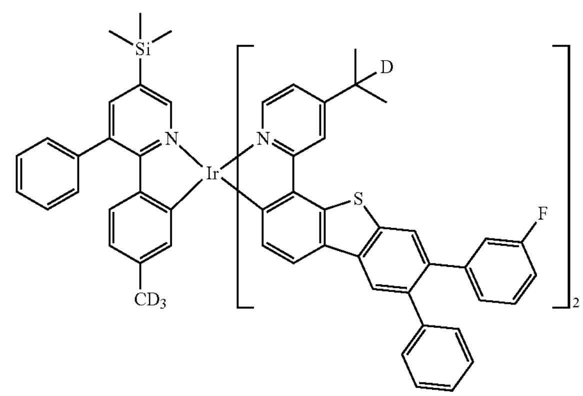
3471
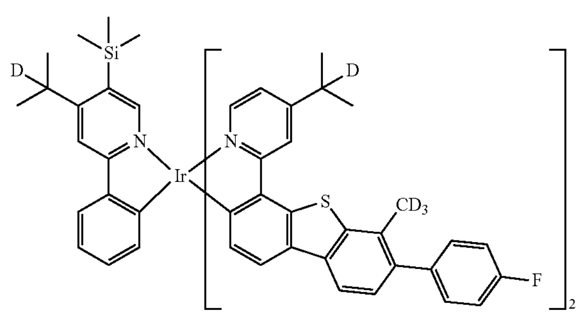
3472
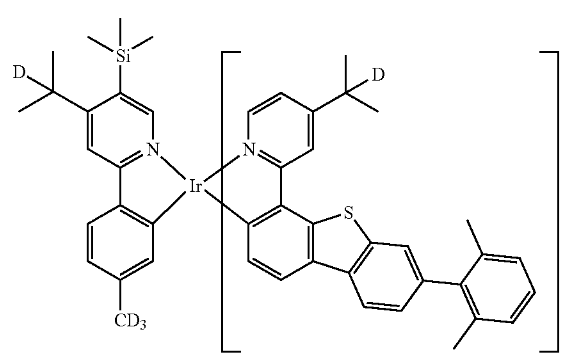

-continued
3473
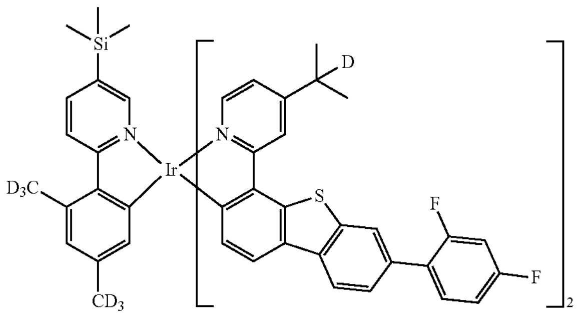
3474
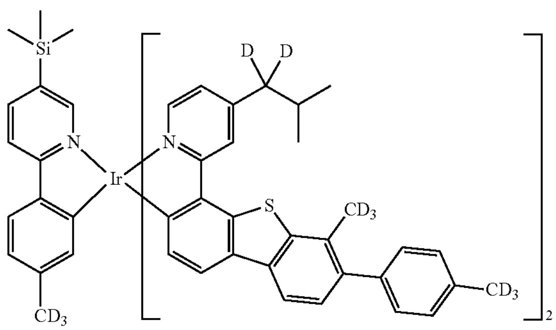
3475
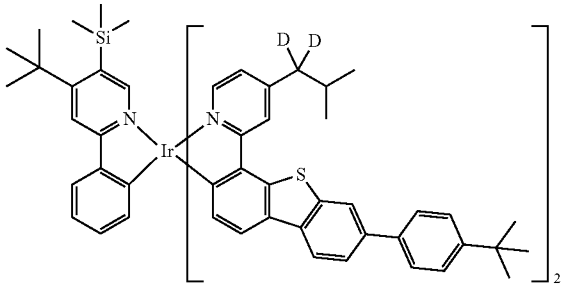
3476
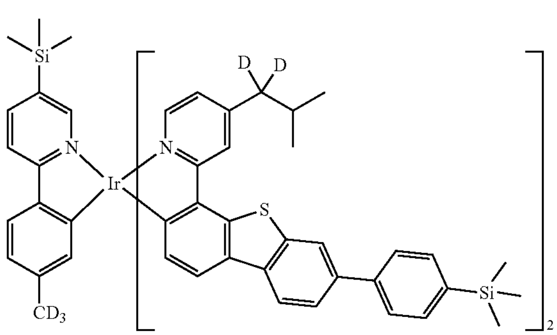
-continued
3477
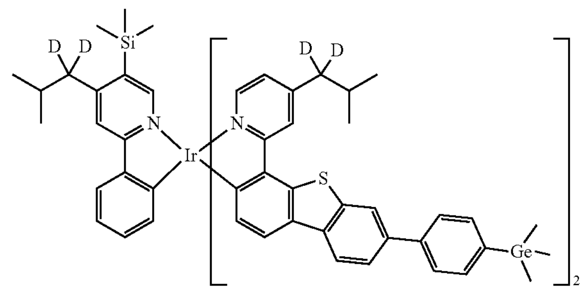
3478
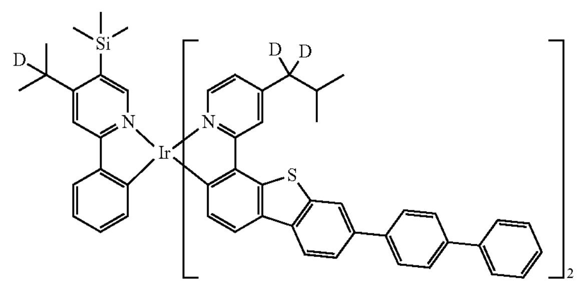
3479
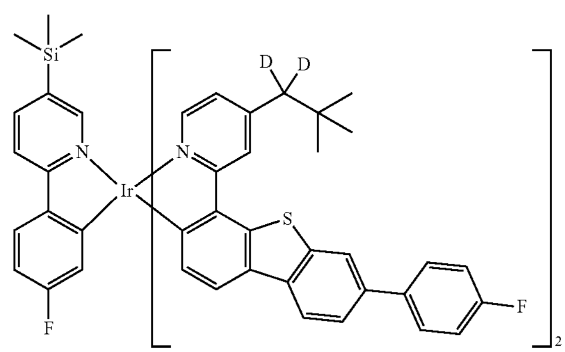
3480
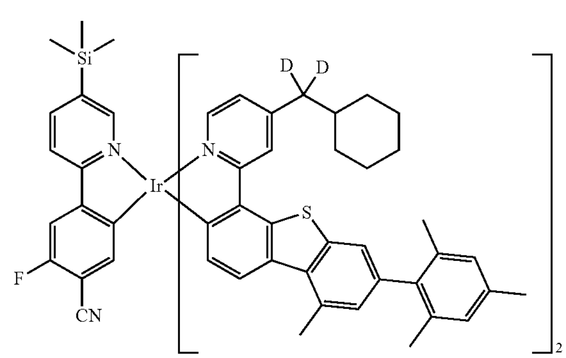

3481
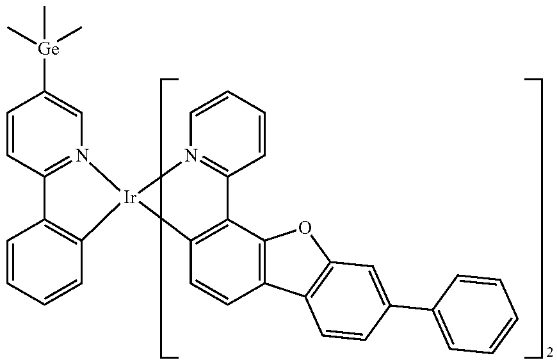
3482
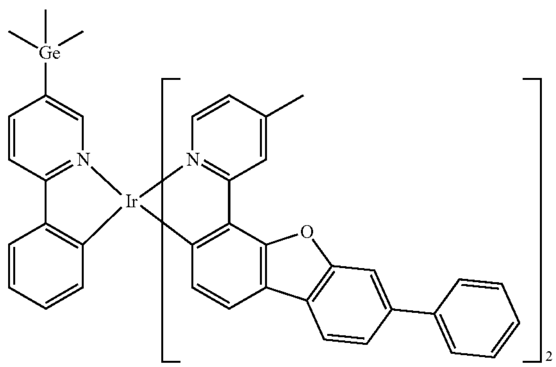
3483
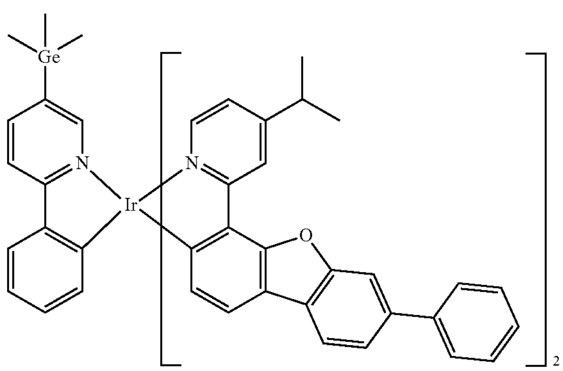
3484
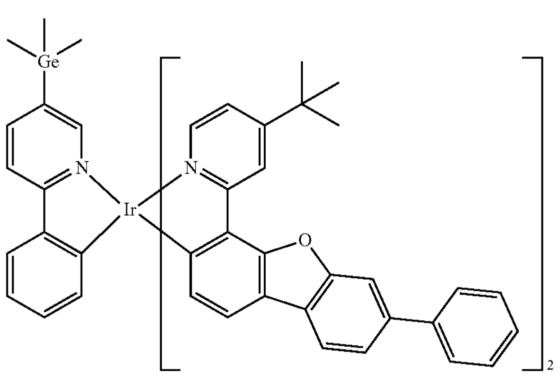
3485
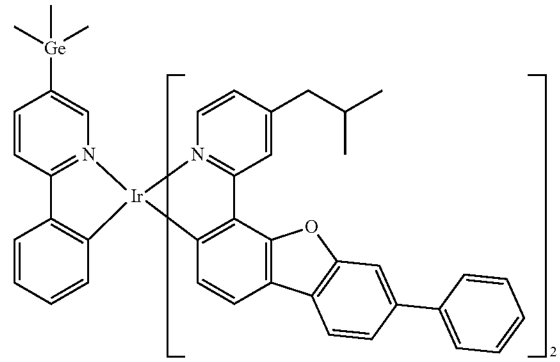
3486
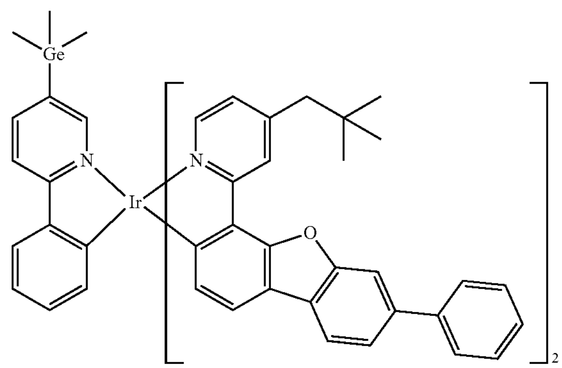
3487
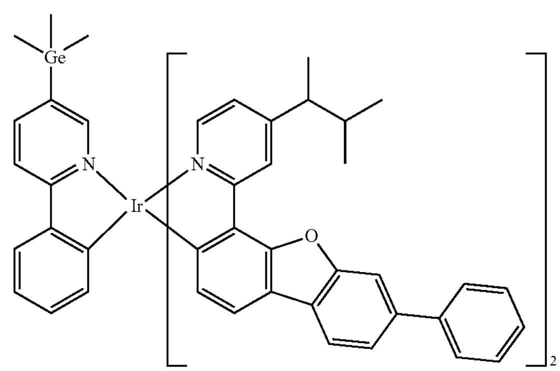
3488
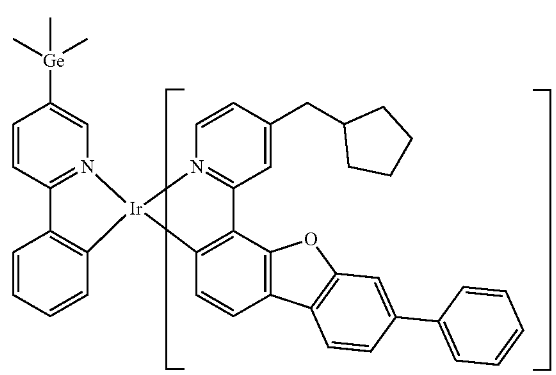

-continued
3489
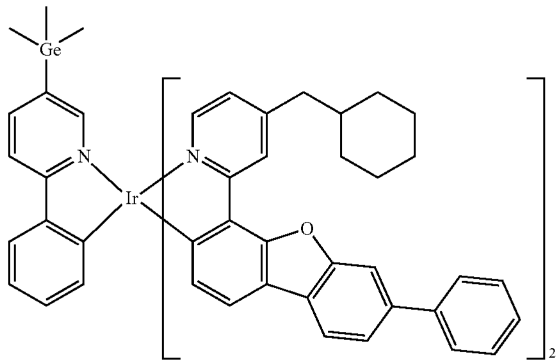
3490
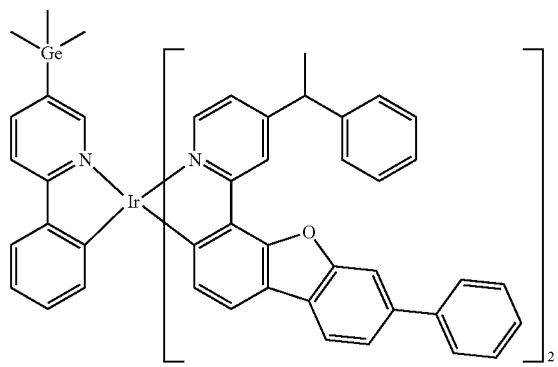
3491
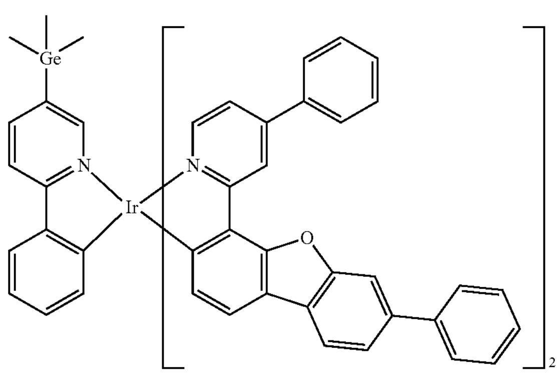
3492
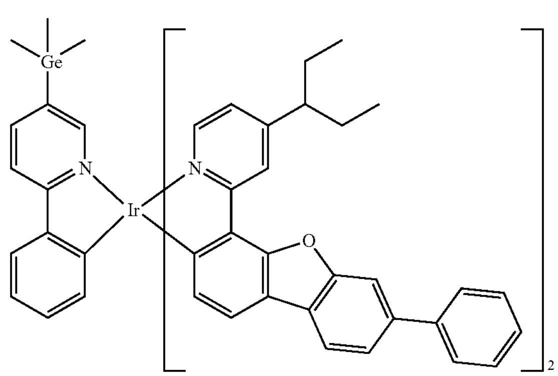
3493
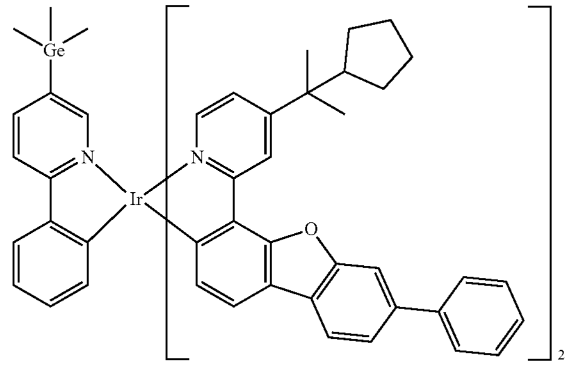
3494
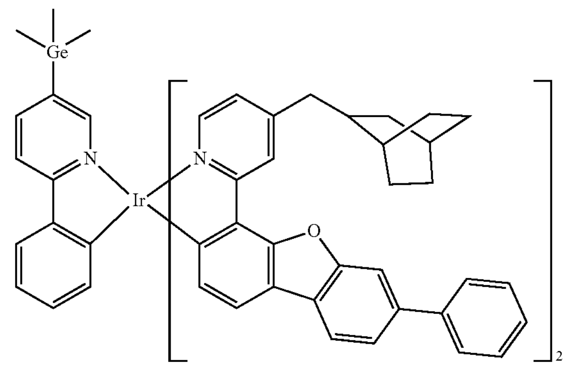
3495
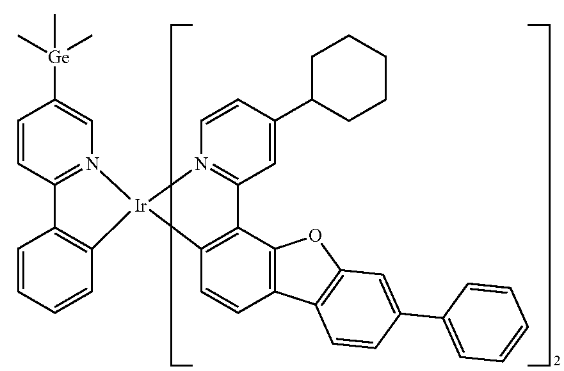
3496
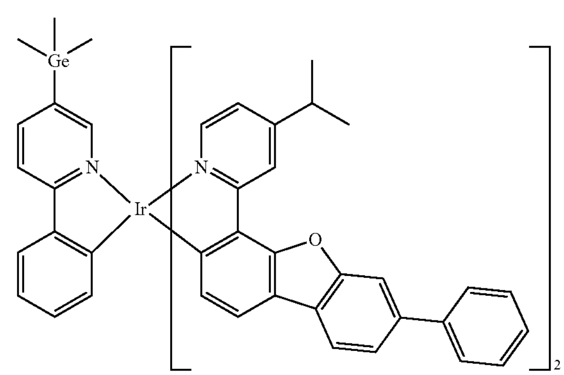

-continued
3497
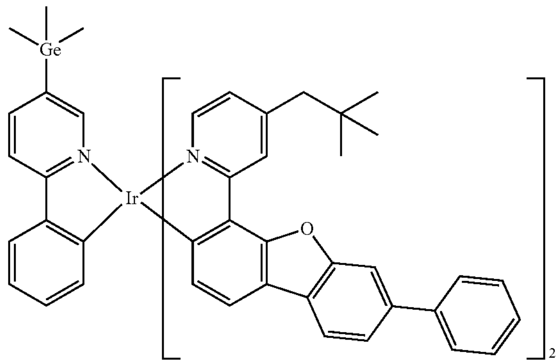
3498
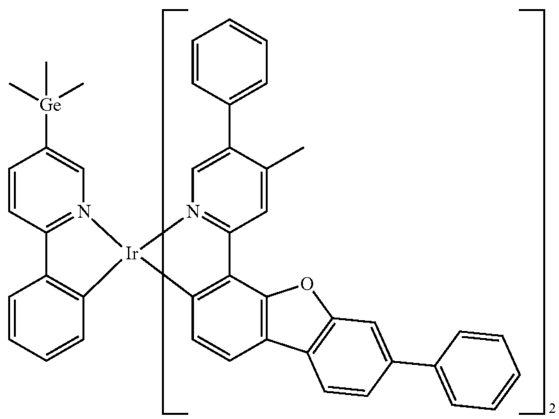
3499
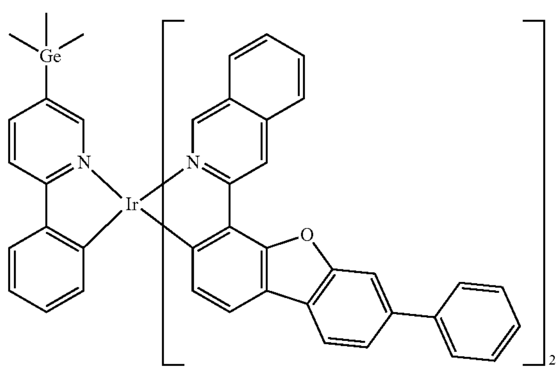
3500
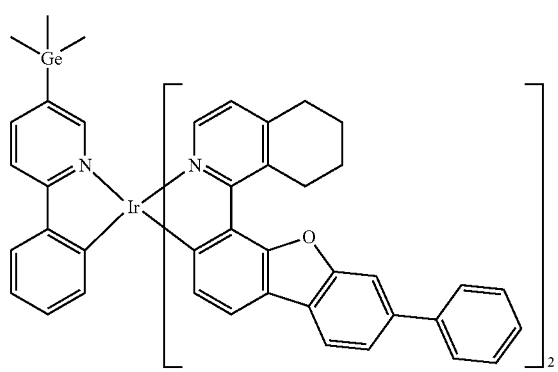
-continued
3501
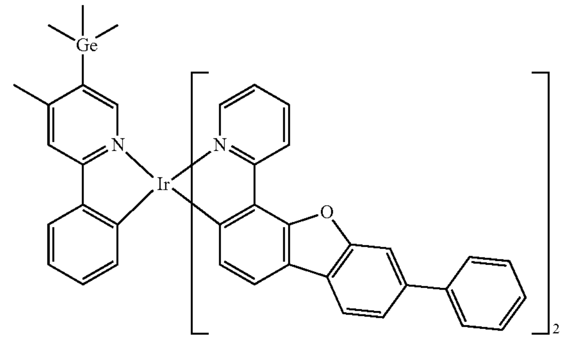
3502
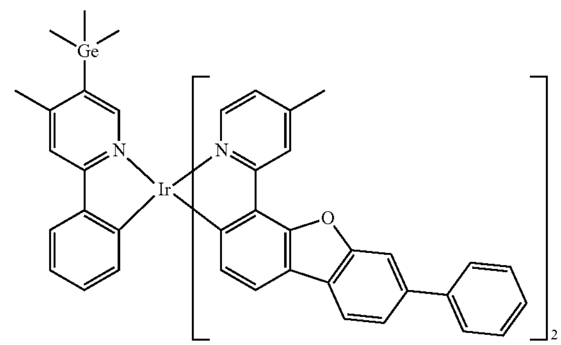
3503
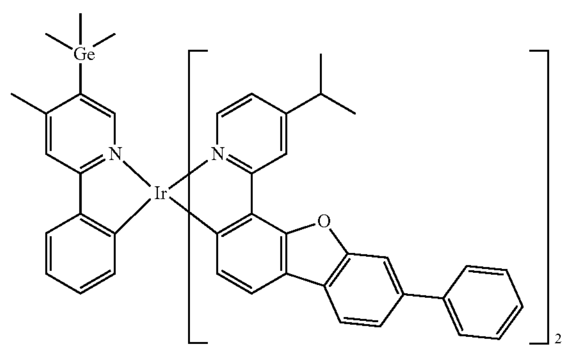
3504
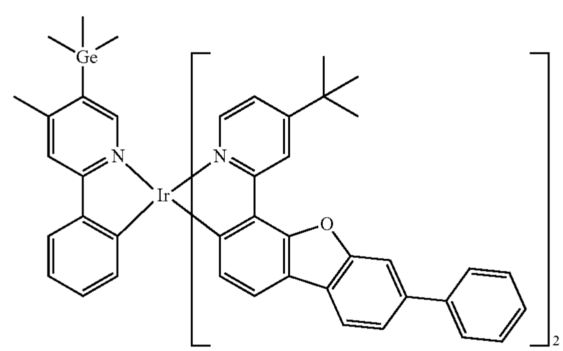

-continued
3505
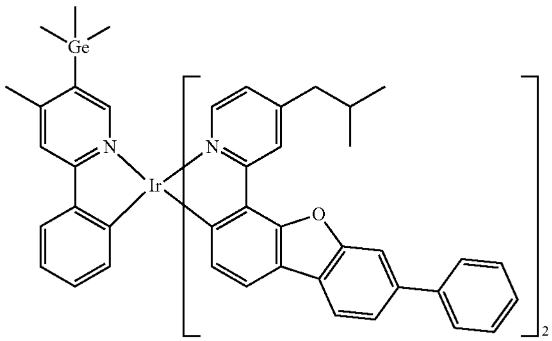
3506
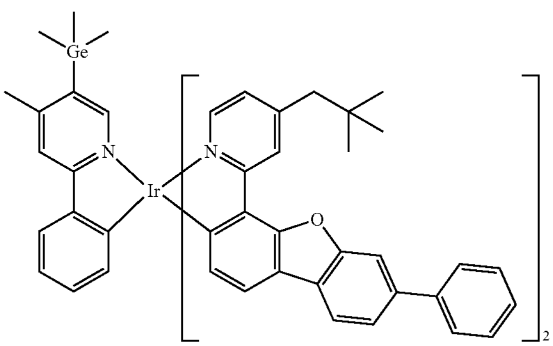
3507
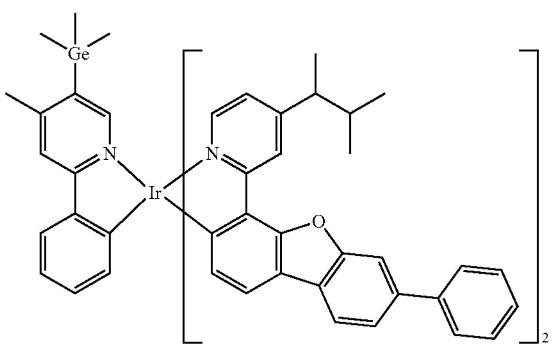
3508
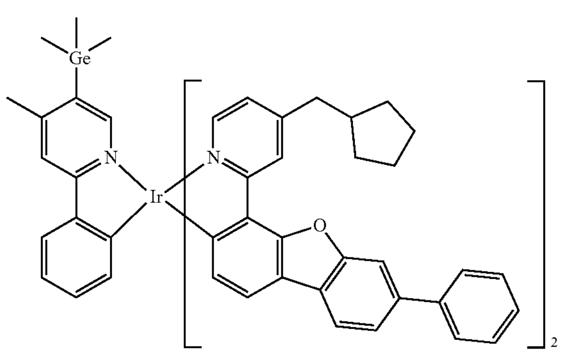
-continued
3509
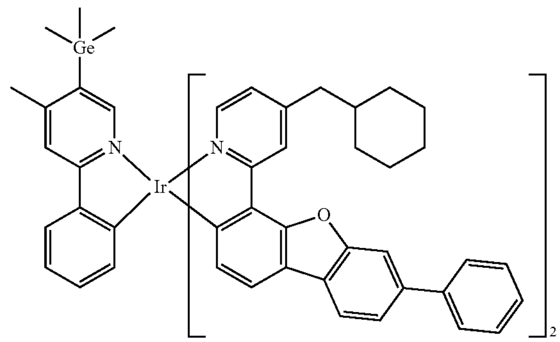
3510
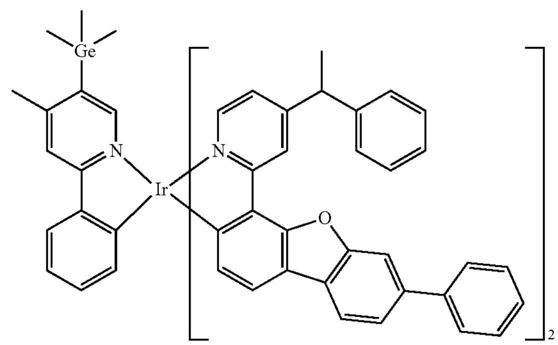
3511
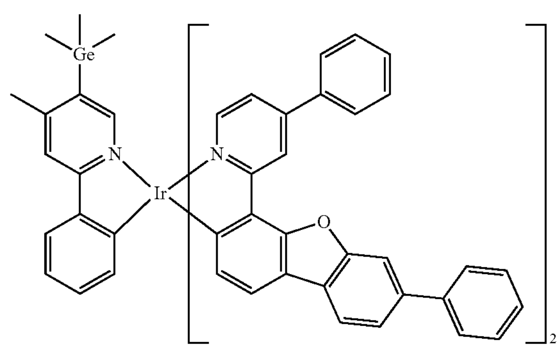
3512
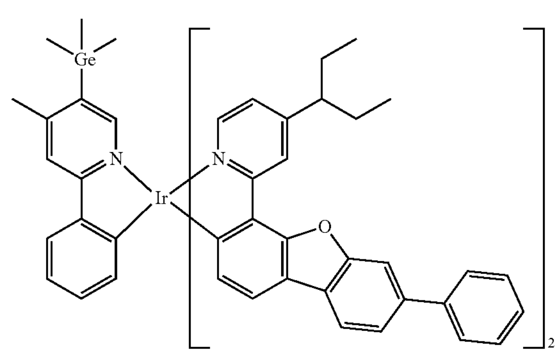

-continued
3513
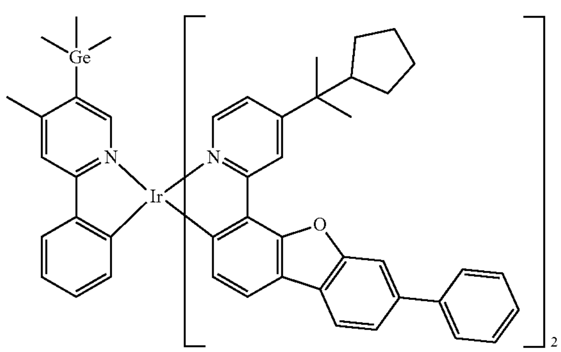
3514
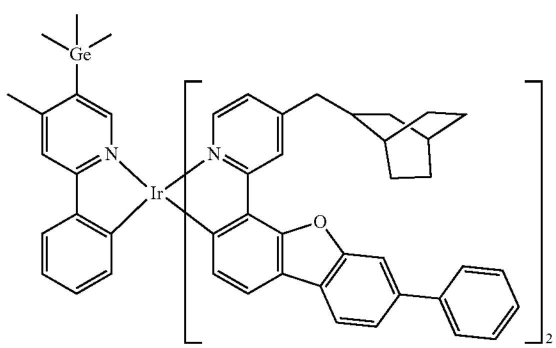
3515
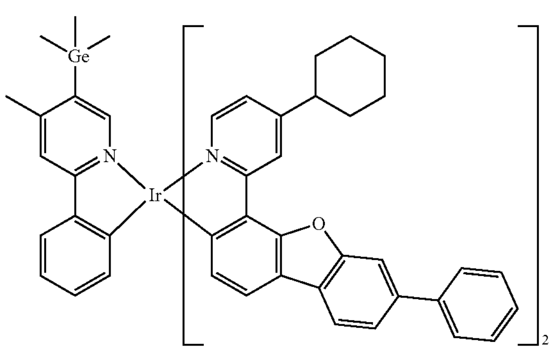
3516
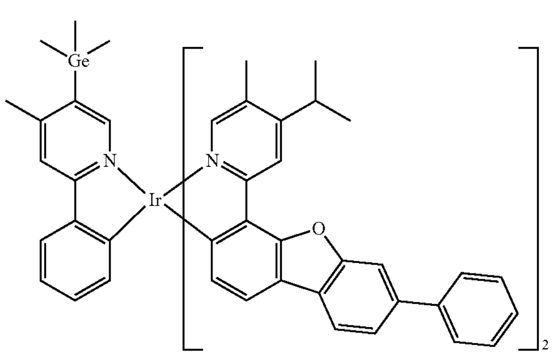
-continued
3517
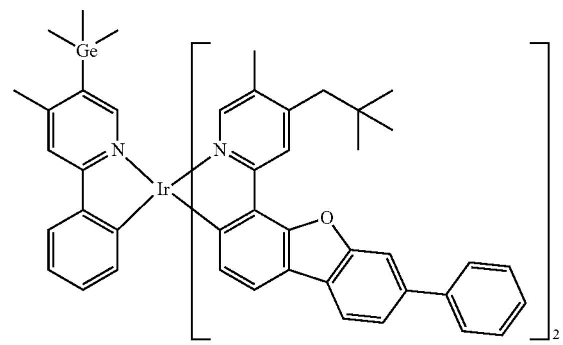
3518
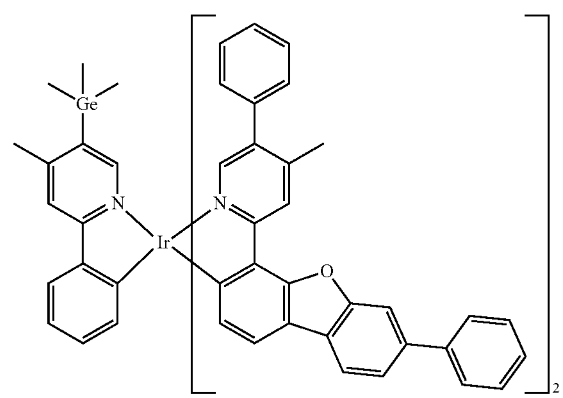
3519
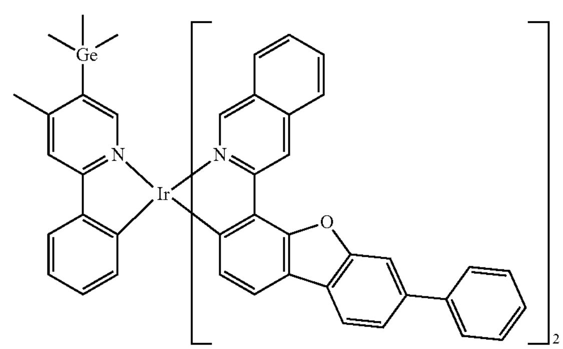
3520
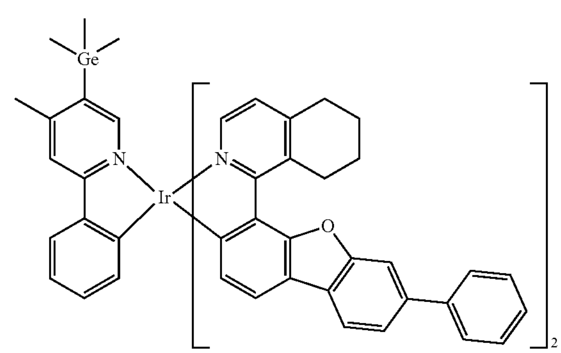

-continued
3521
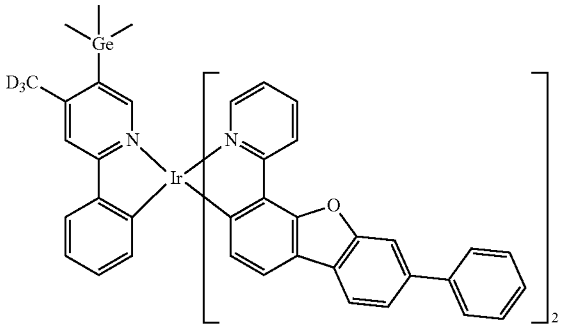
3522
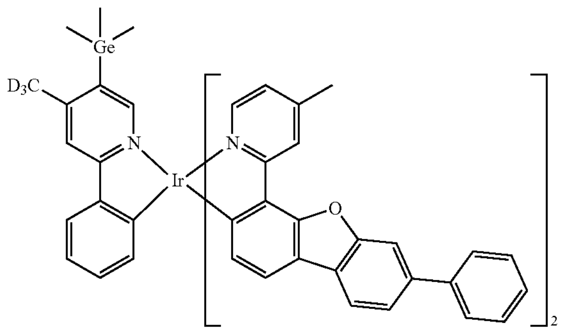
3523
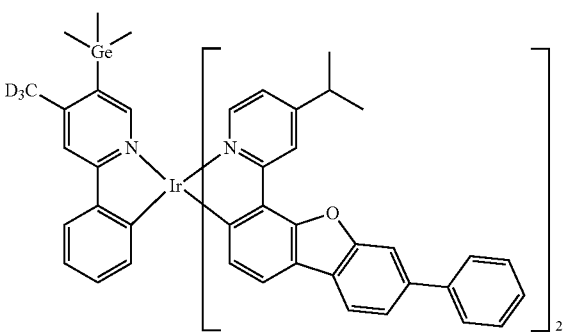
3524
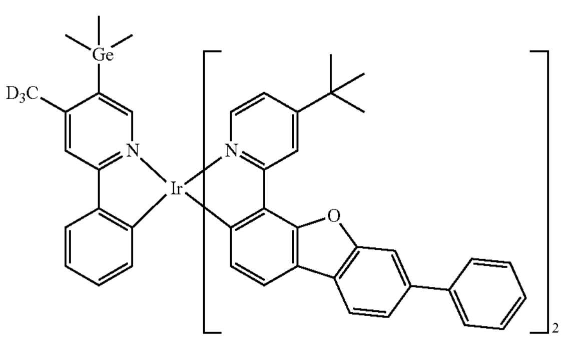
-continued
3525
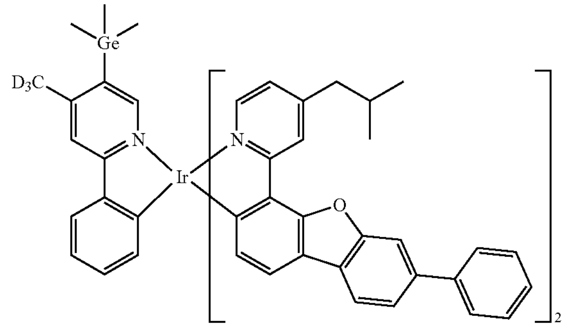
3526
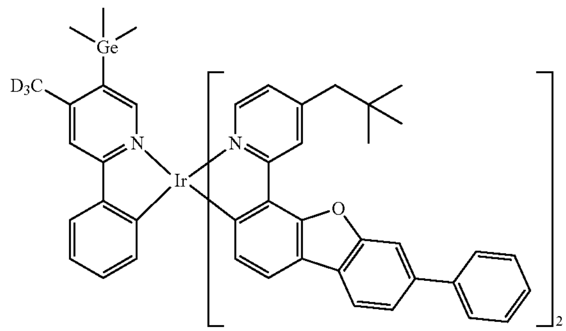
3527
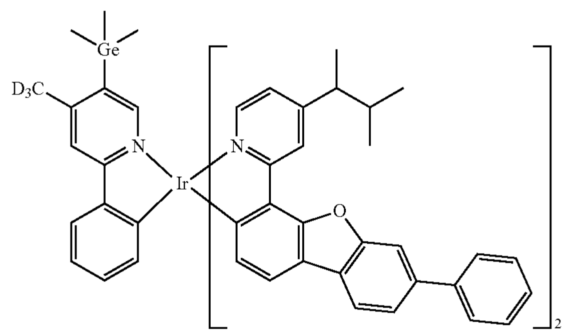
3528
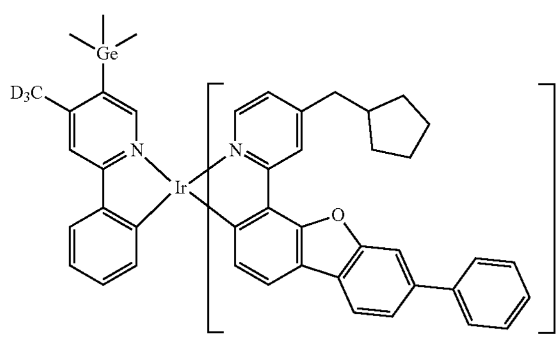

3529
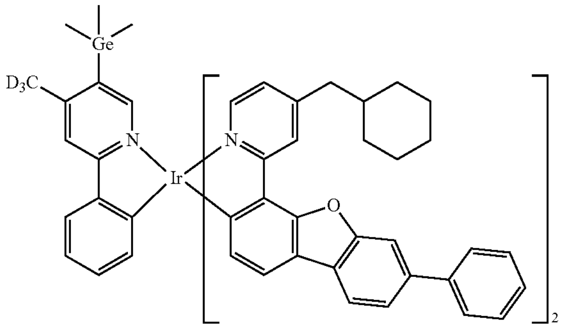
3530
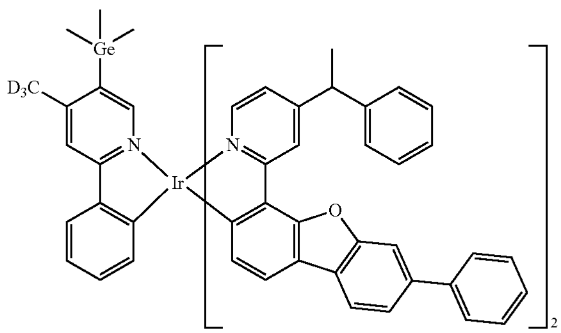
3531
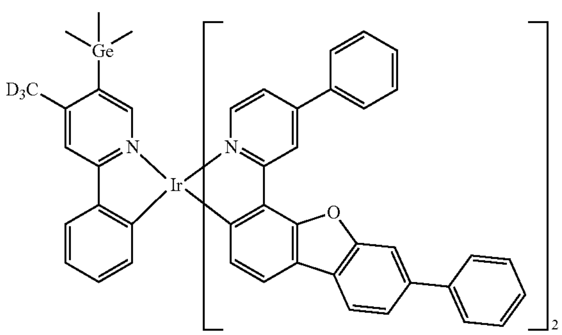
3532
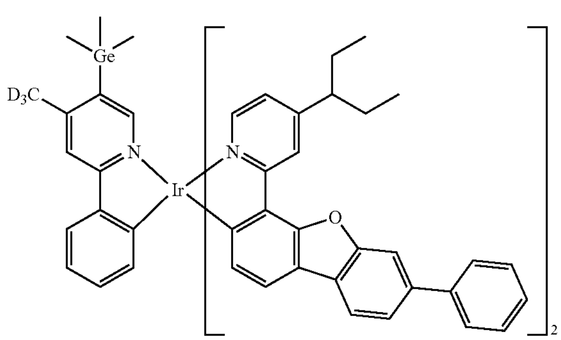
3533
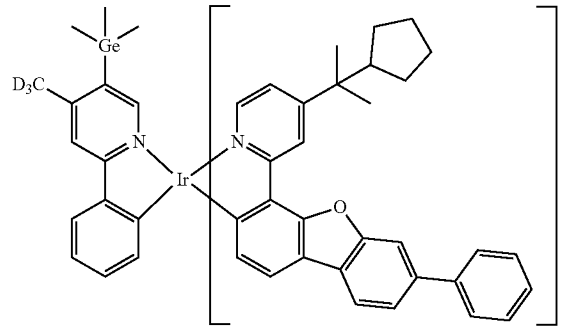
3534
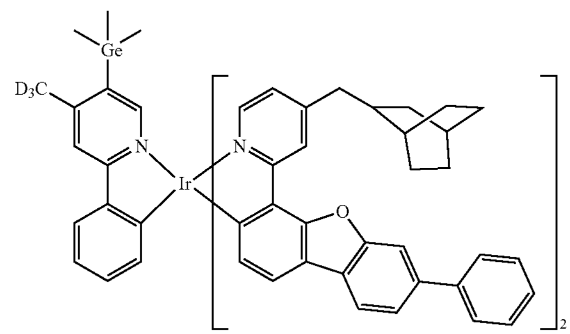
3535
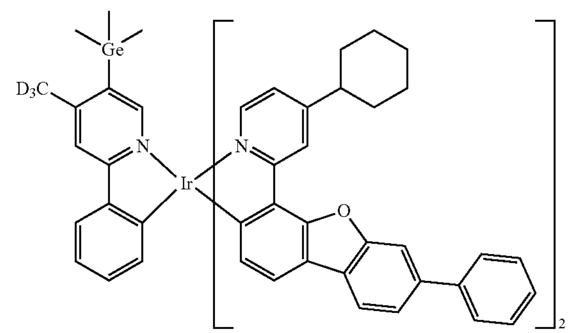
3536
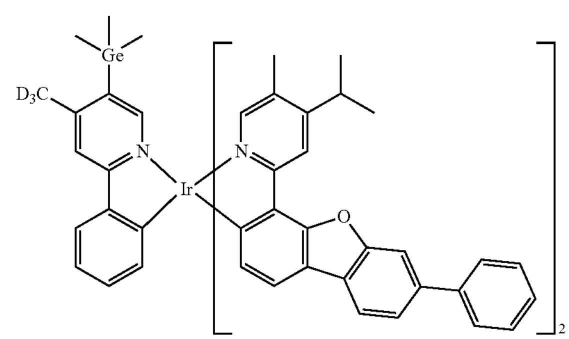

3537
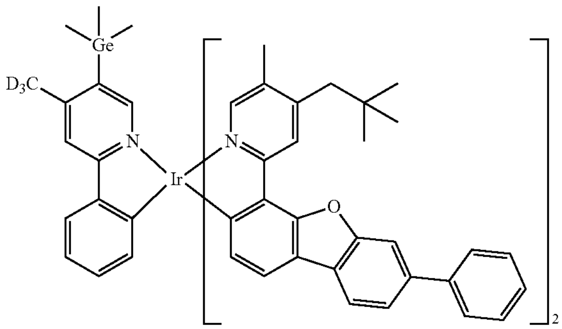
3538
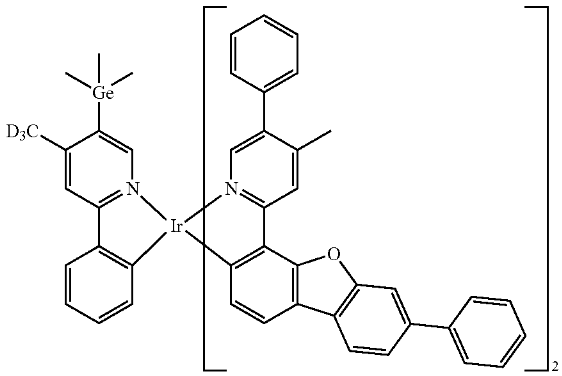
3539
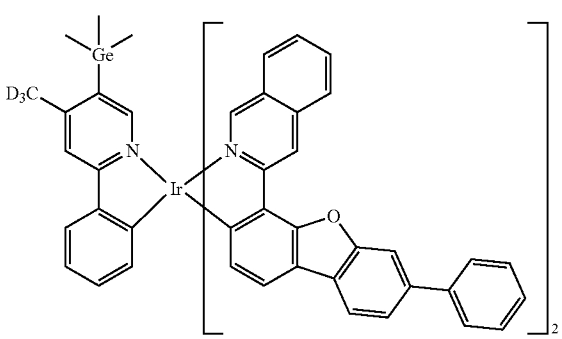
3540
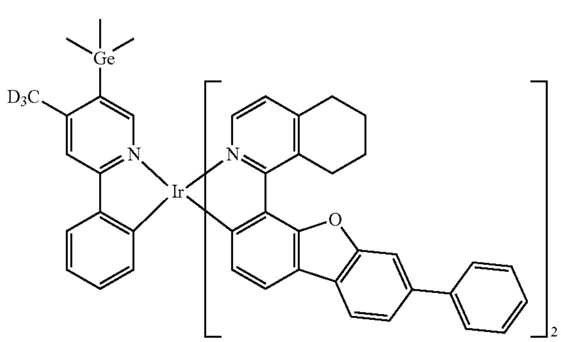
3541
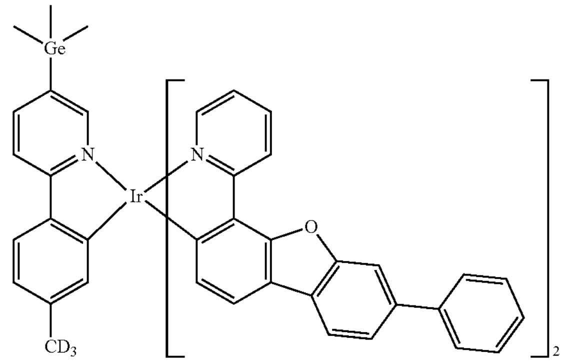
3542
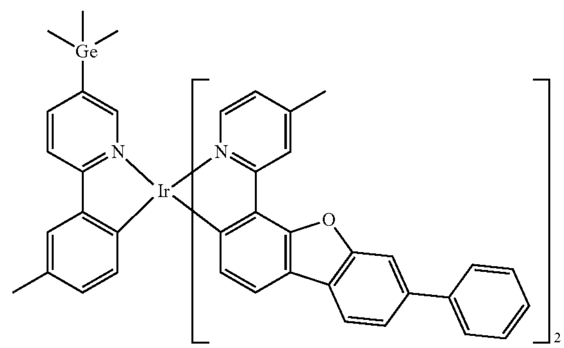
3543
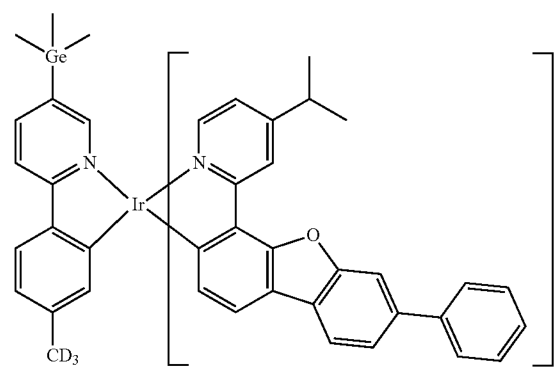
3544
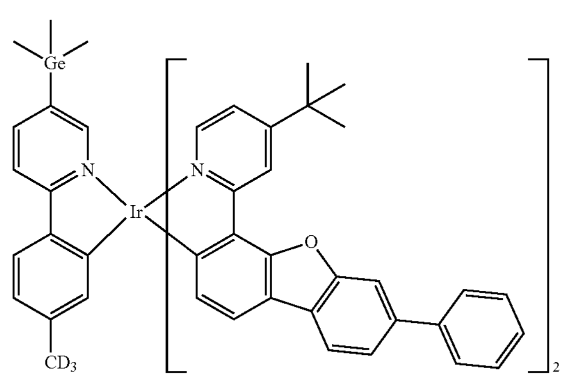

-continued
3545
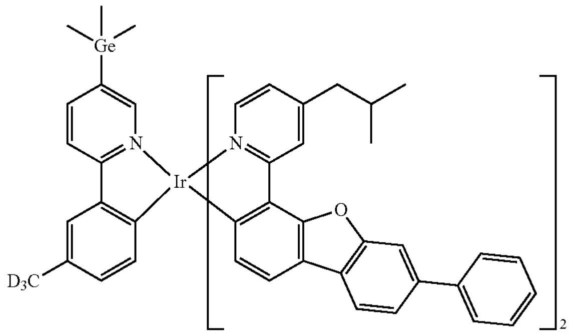
3546
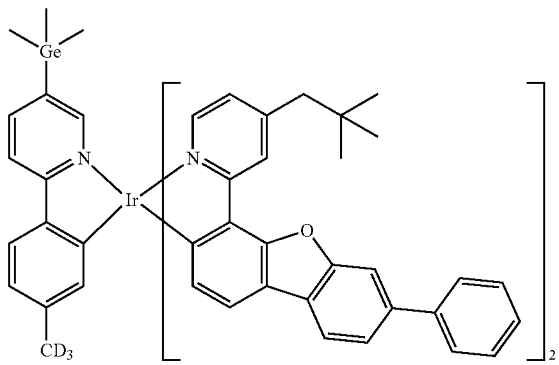
3547
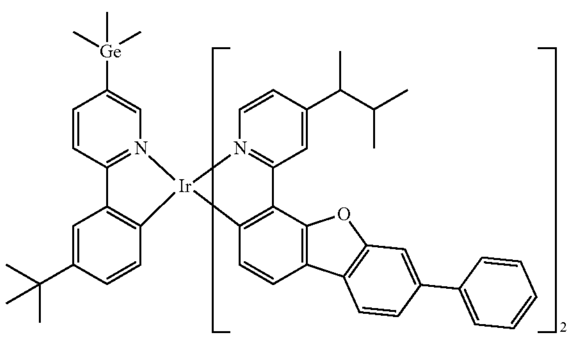
3548
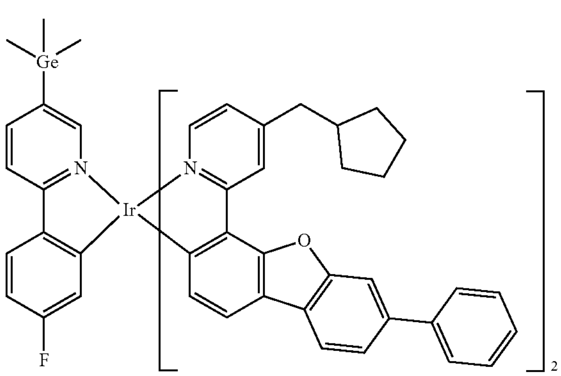
-continued
3549
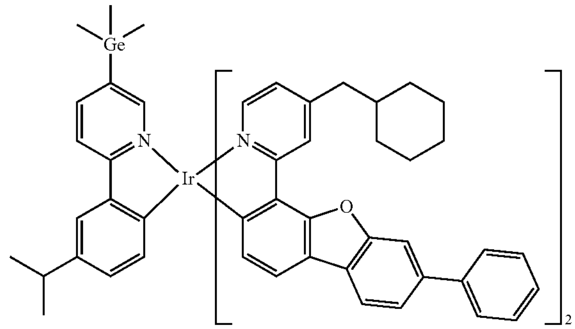
3550
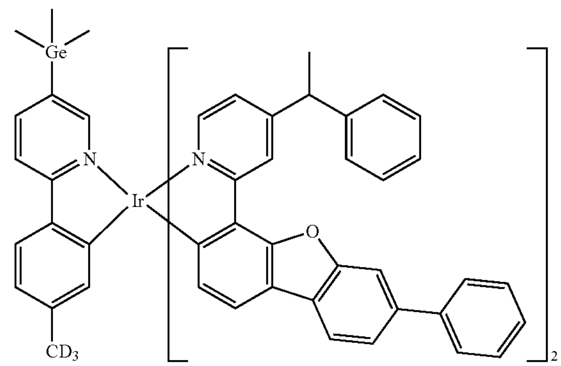
3551
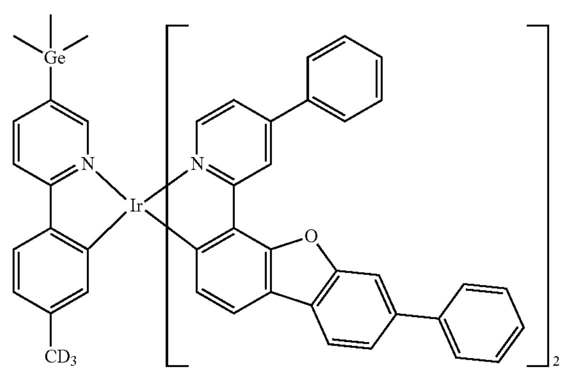
3552
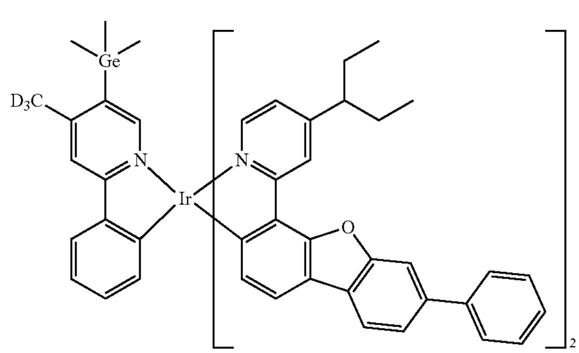

-continued
3553
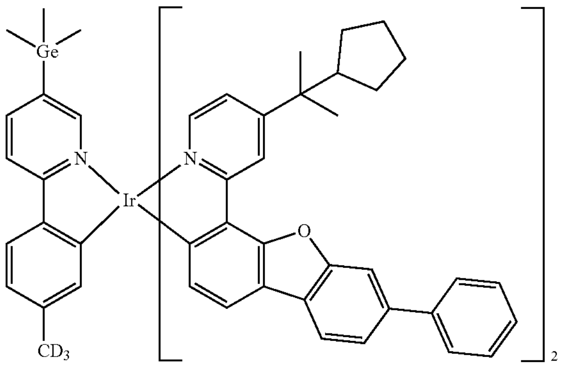
3554
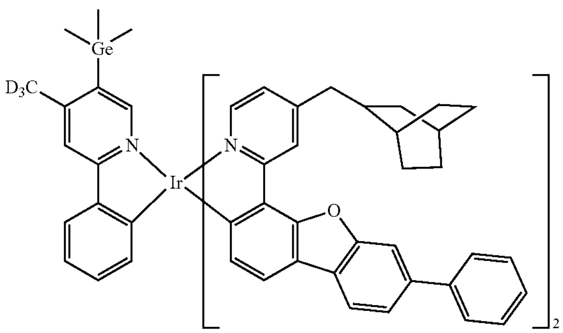
3555
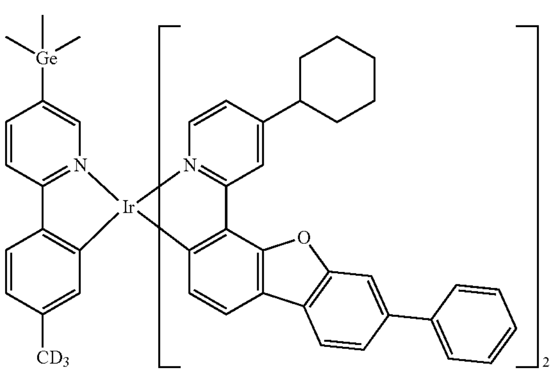
3556
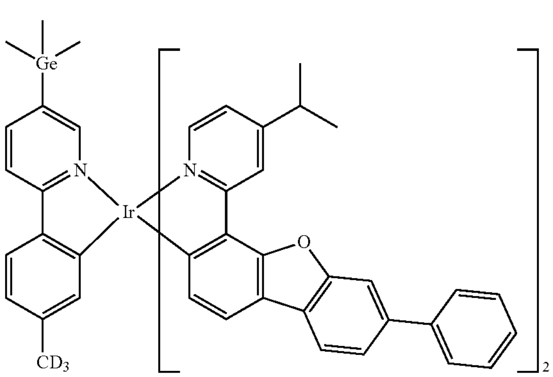
-continued
3557
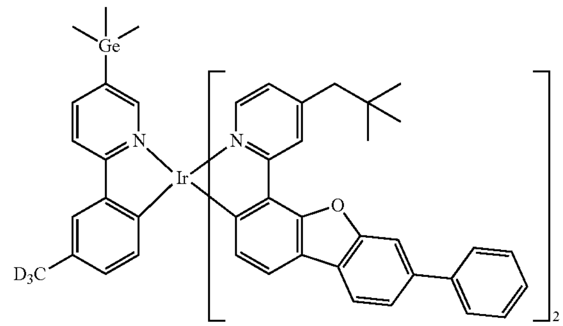
3558
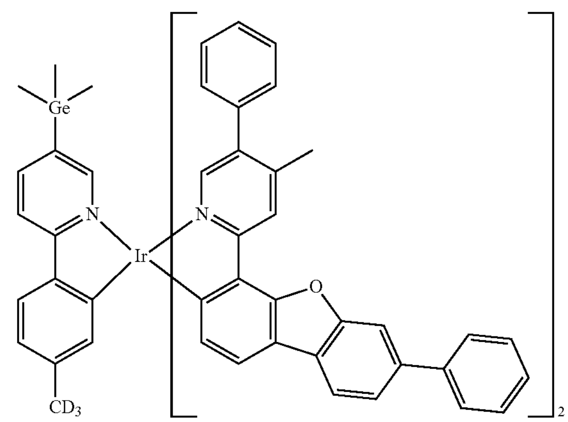
3559
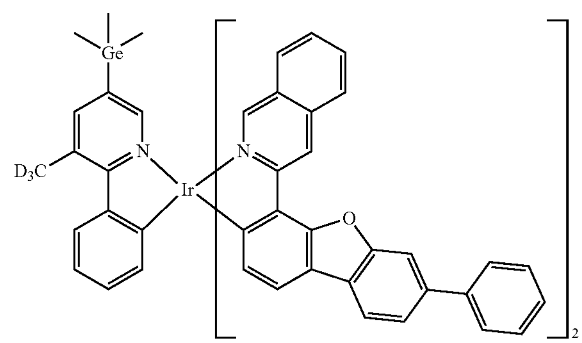
3560
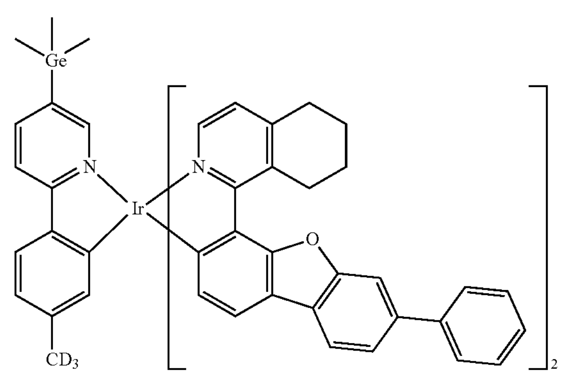

-continued
3561
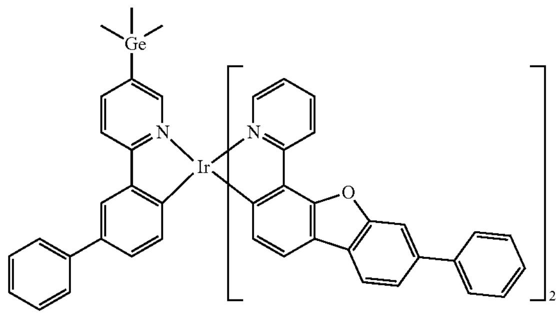
3562
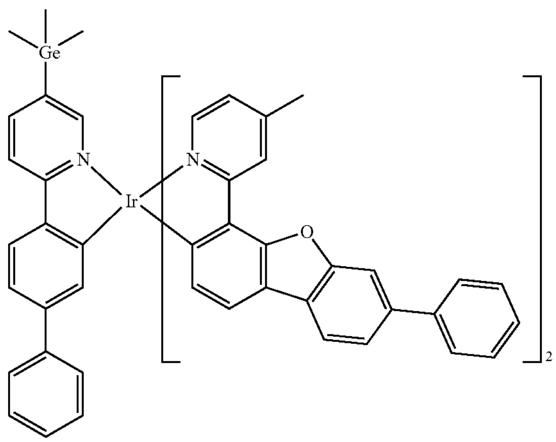
3563
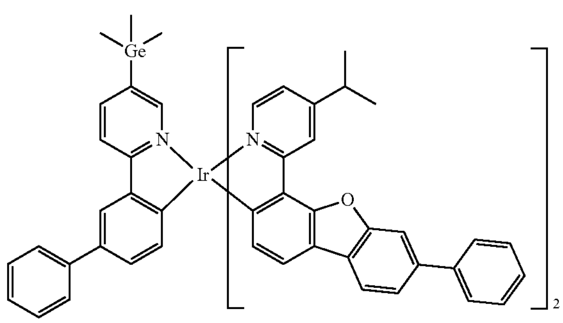
3564
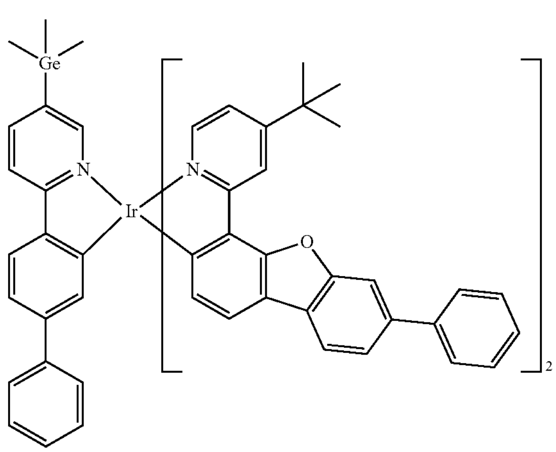
-continued
3565
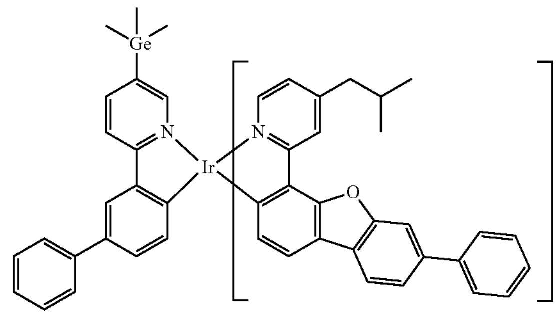
3566
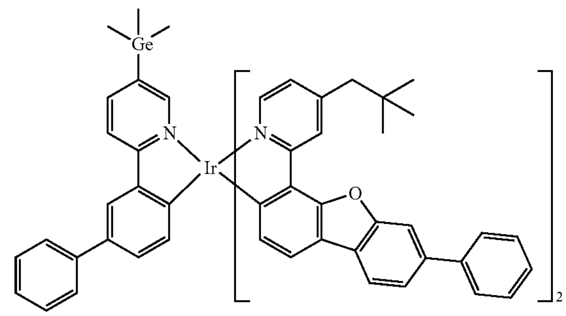
3567
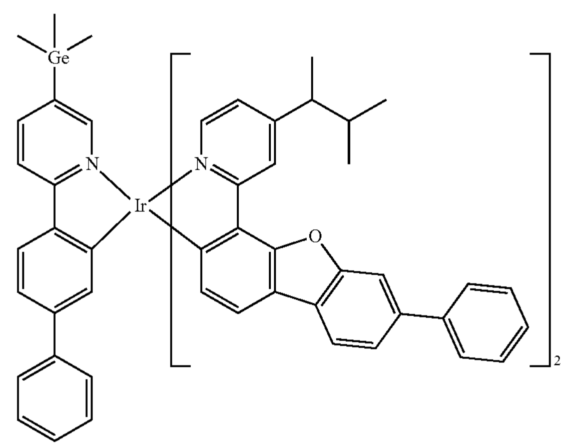
3568
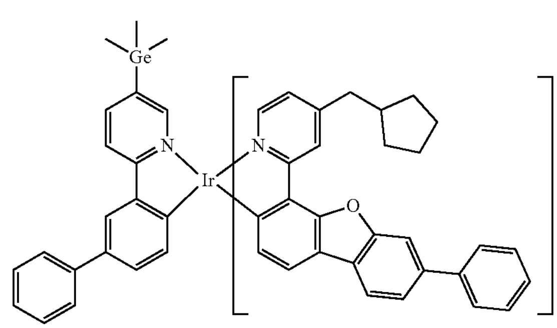

-continued
3569
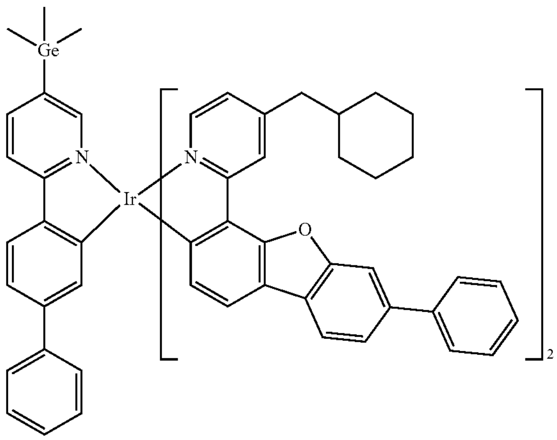
3570
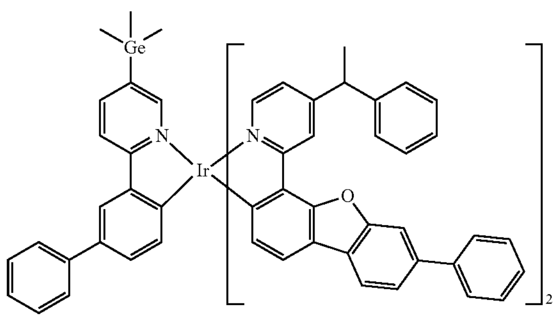
3571
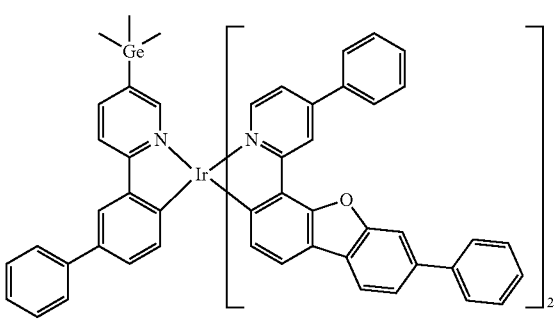
3572
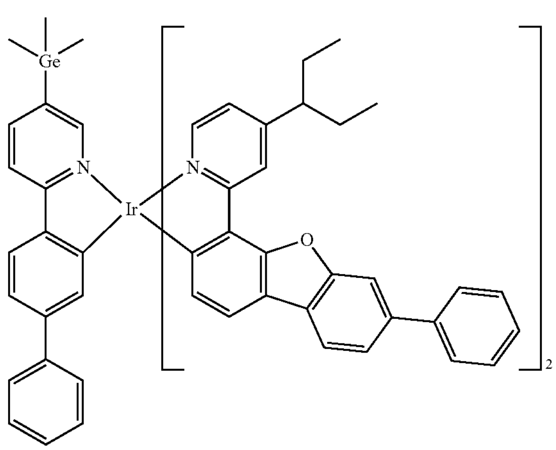
-continued
3573
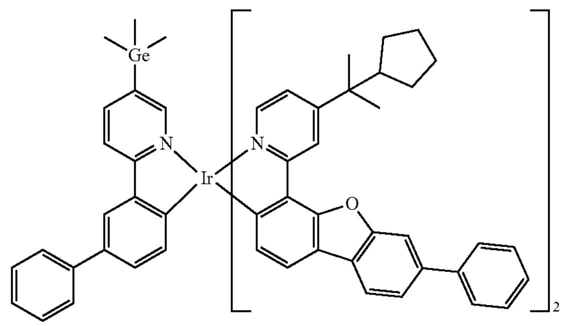
3574
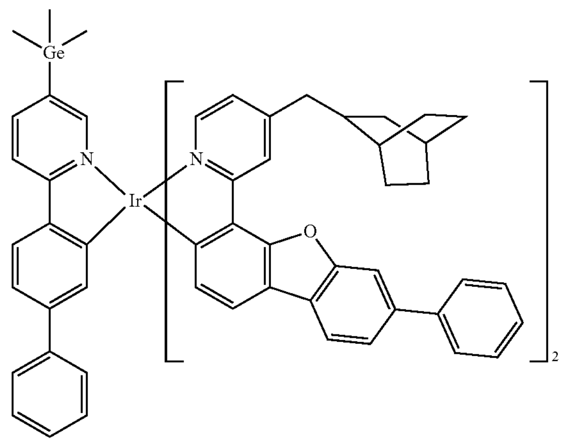
3575
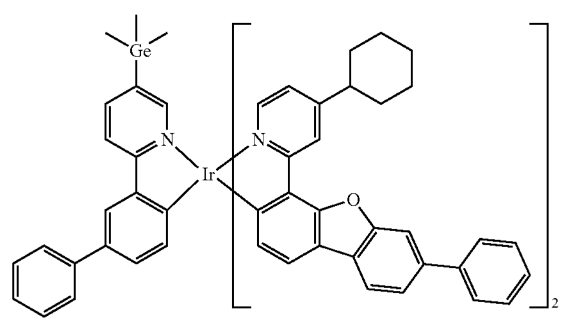
3576
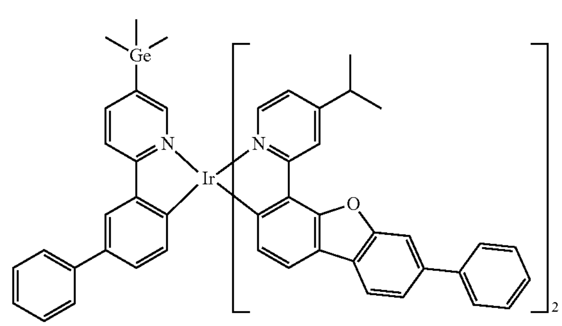

-continued
3577
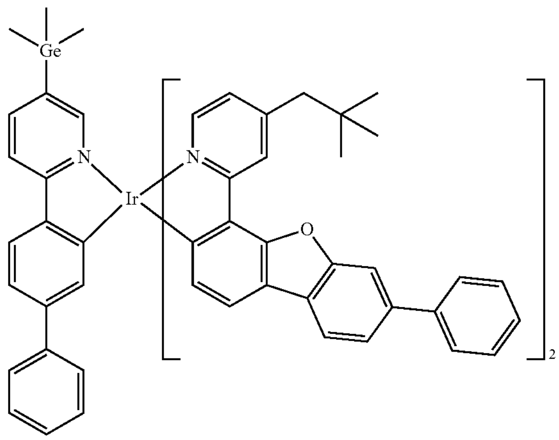
3578
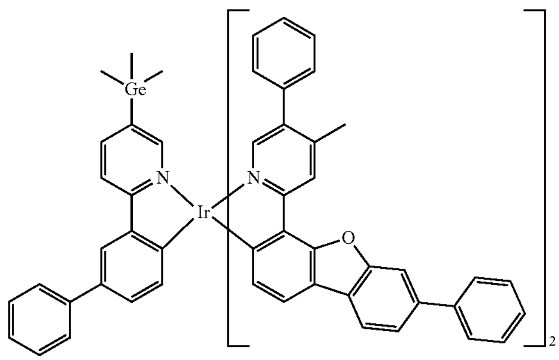
3579
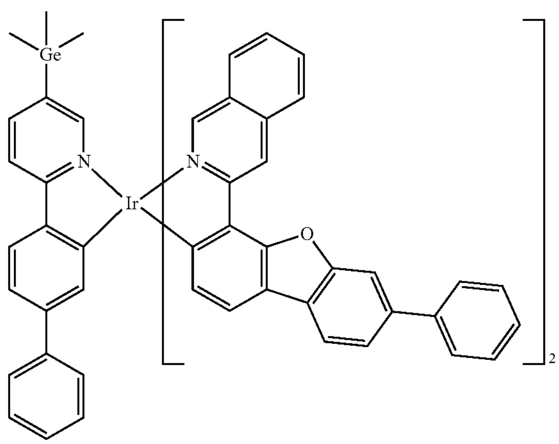
3580
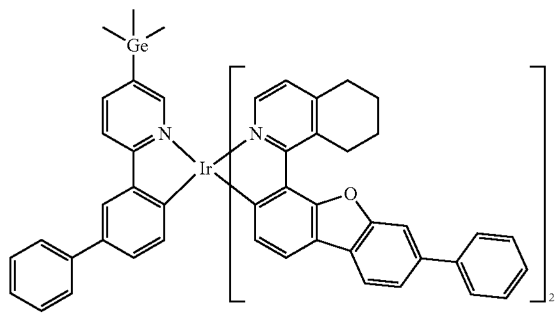
-continued
3581
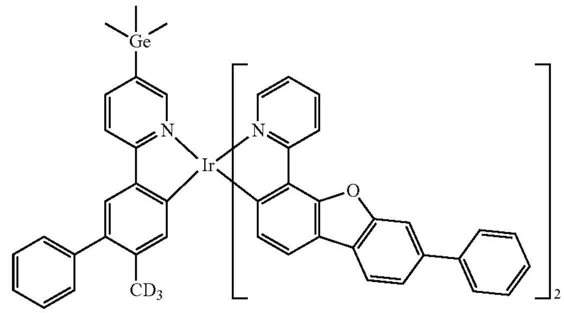
3582
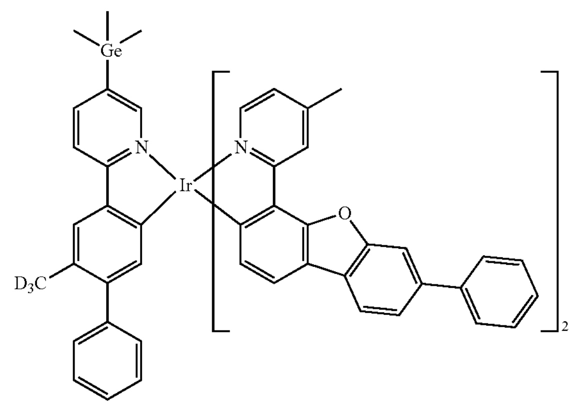
3583
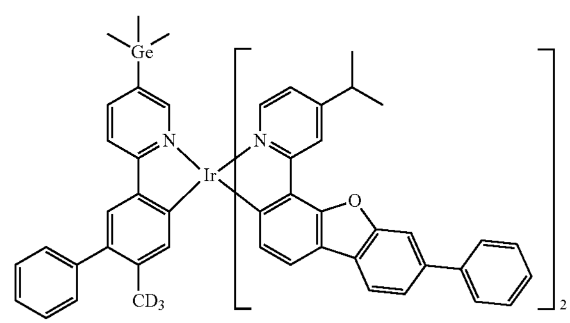
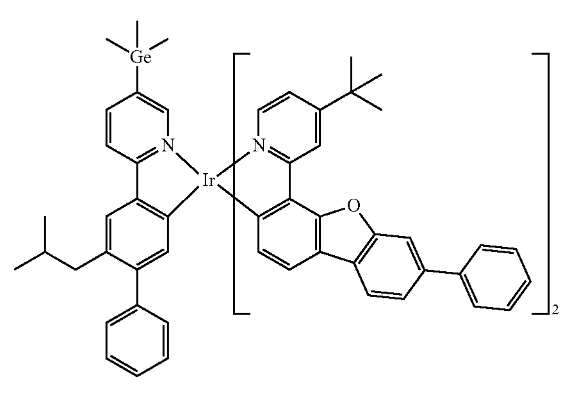

3585
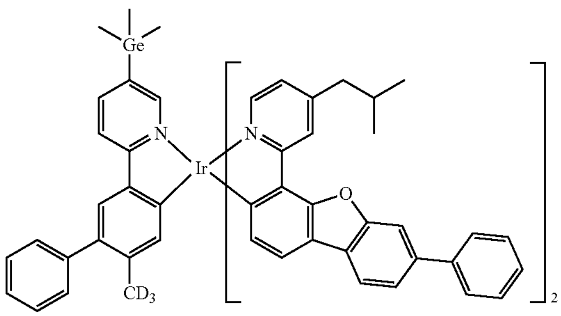
3586
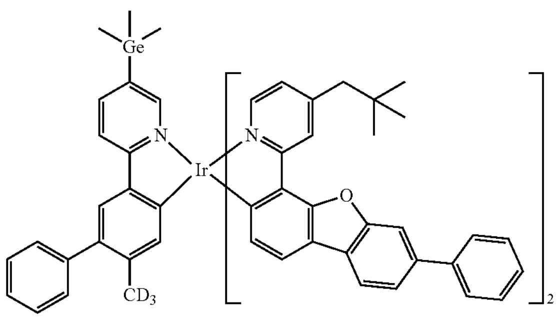
3587
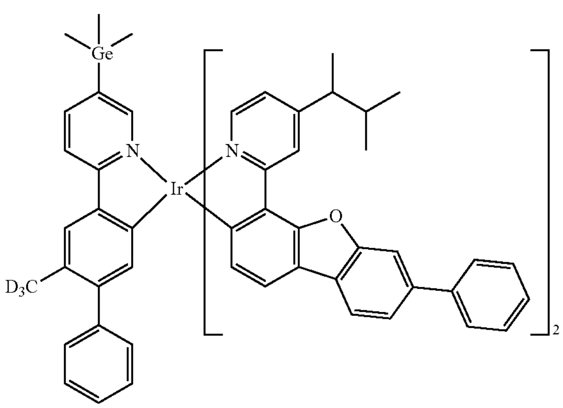
3588
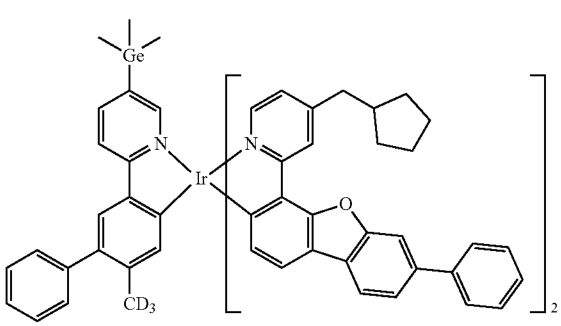
3589
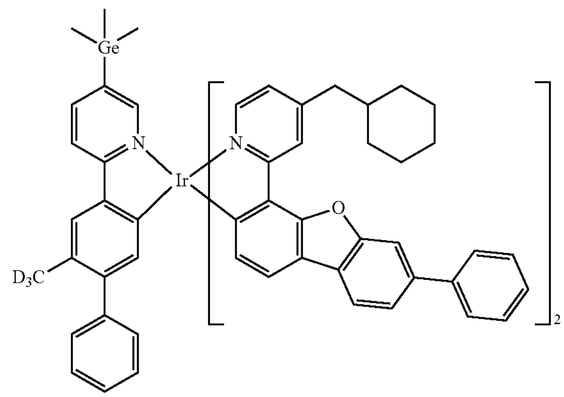
3590
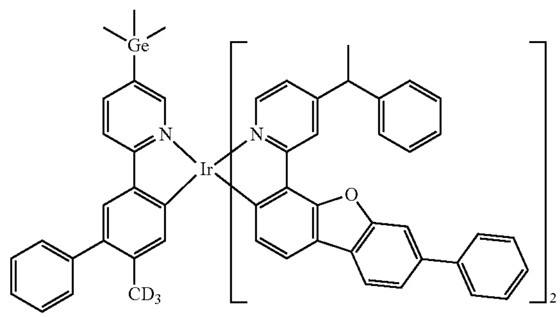
3591
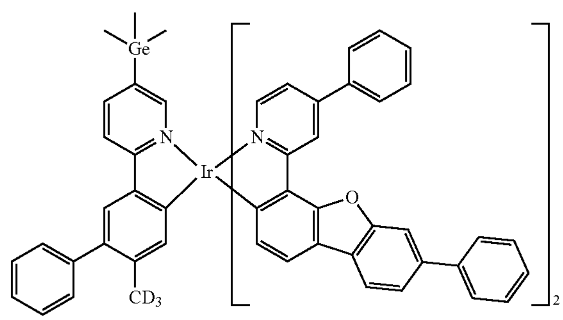
3592
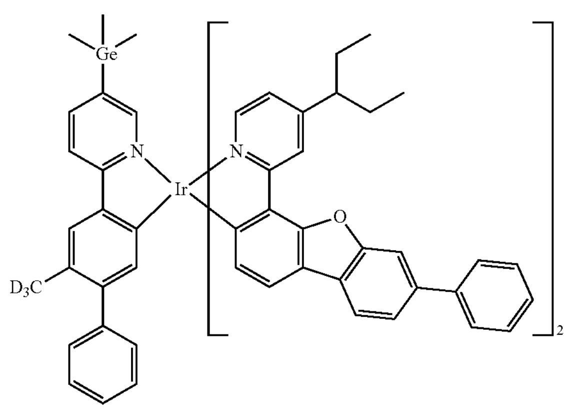

-continued
3593
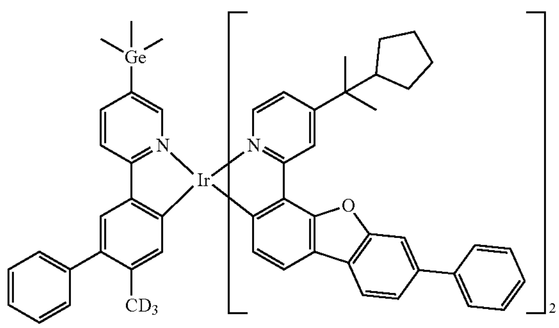
3594
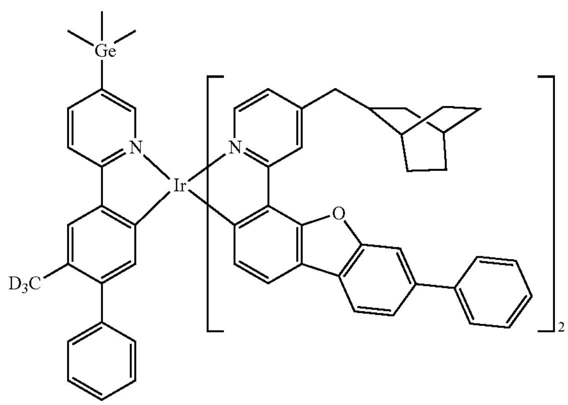
3595
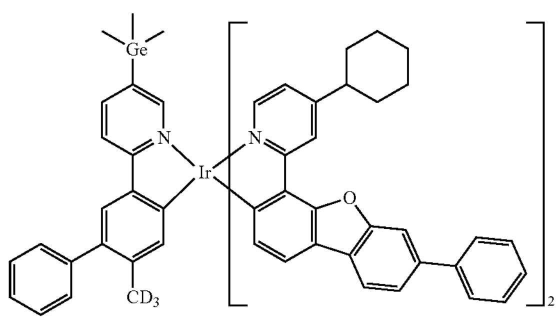
3596
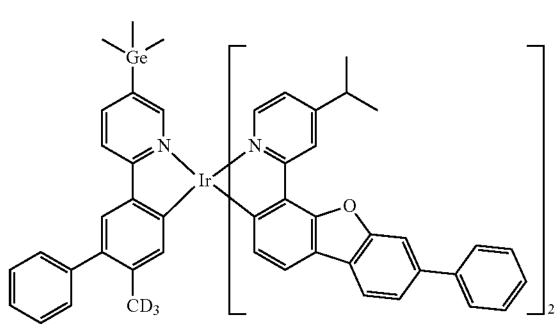
-continued
3597
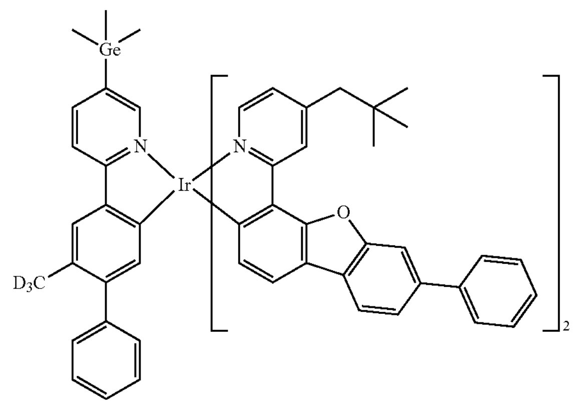
3598
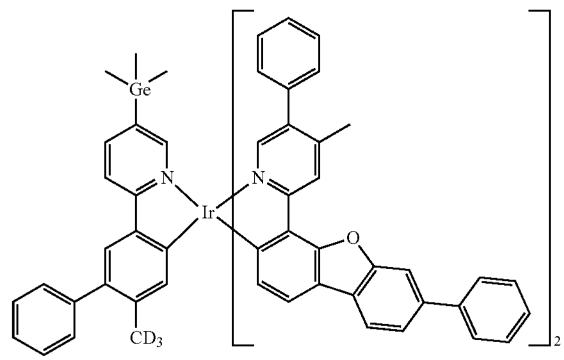
3599
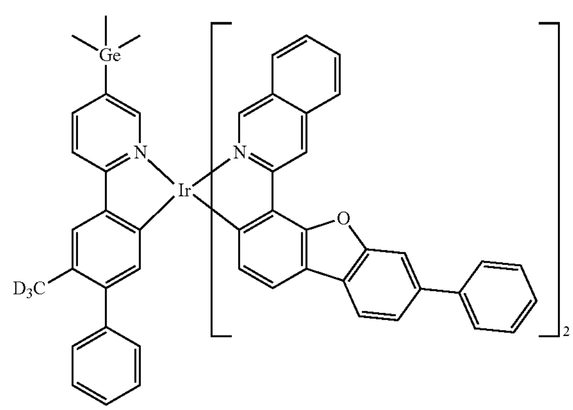
3600
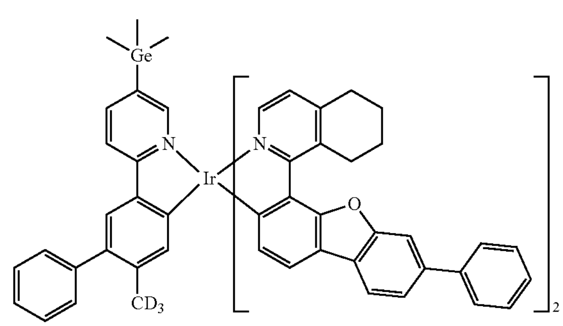

3601
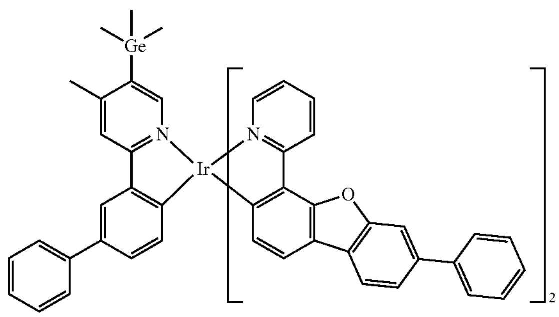
3602
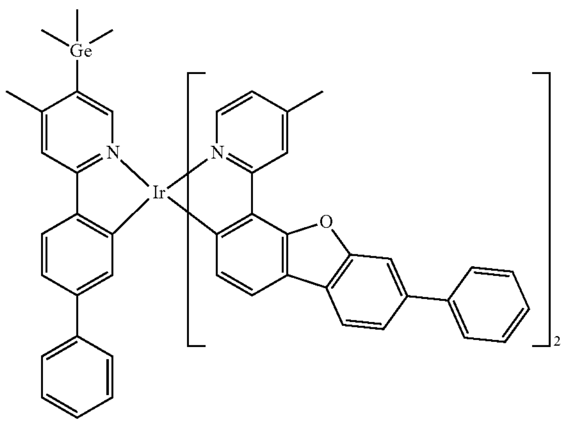
3603
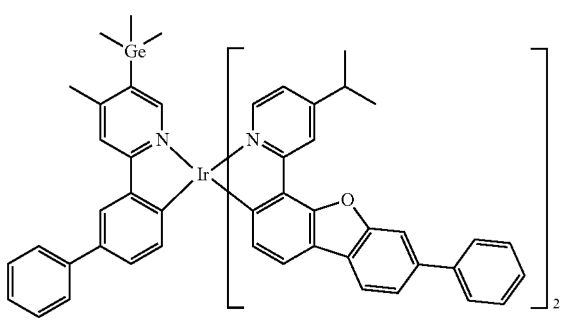
3604
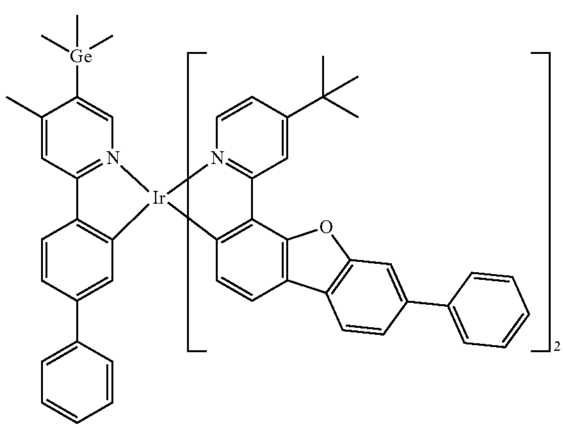
3605
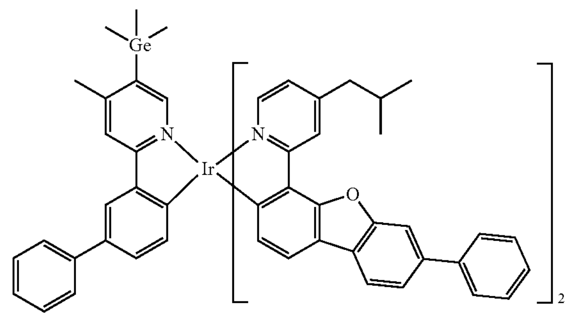
3606
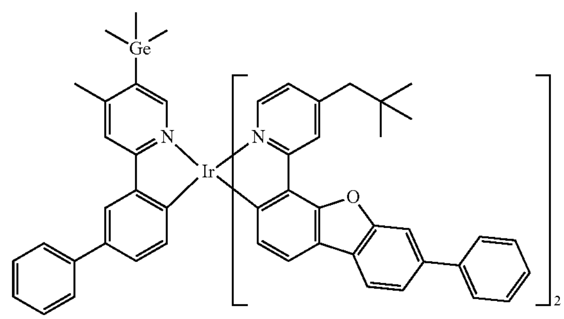
3607
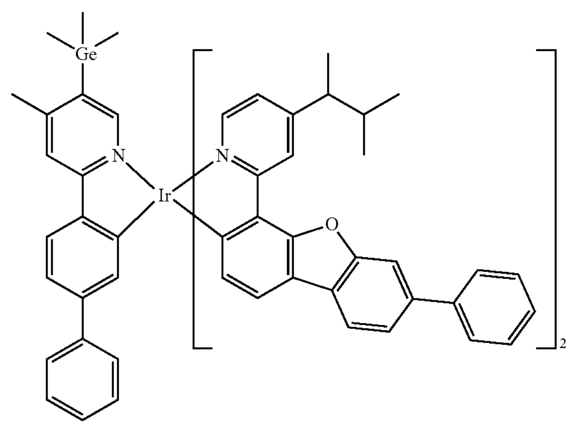
3608
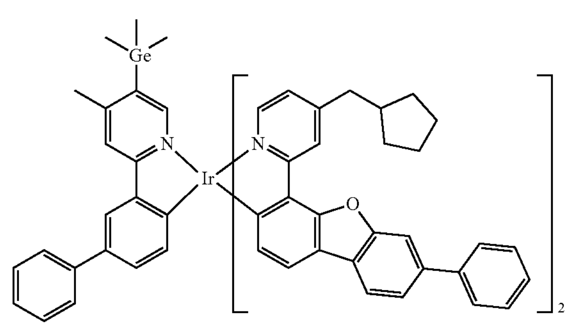

-continued
3609
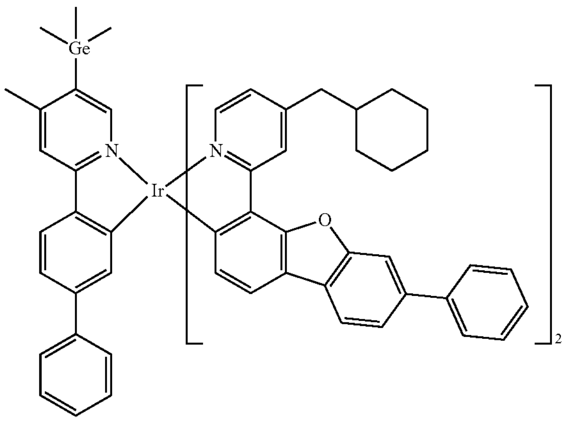
3610
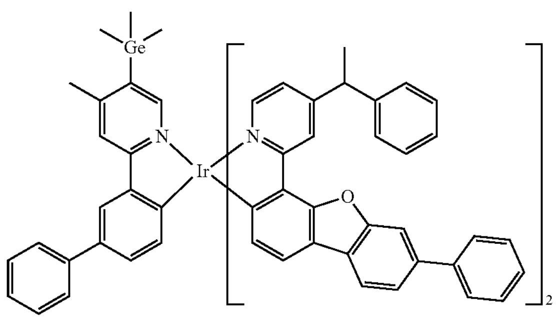
3611
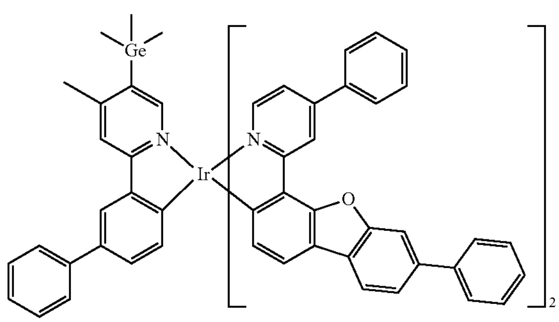
3612
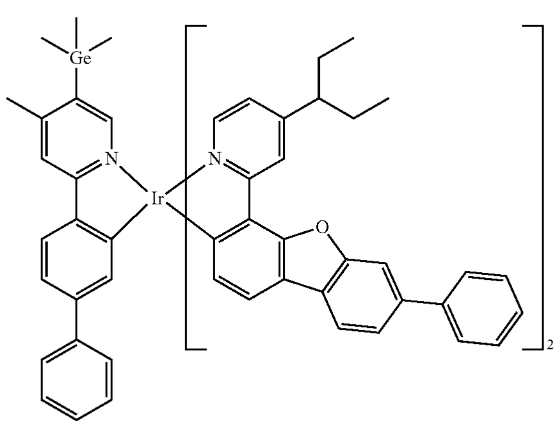
-continued
3613
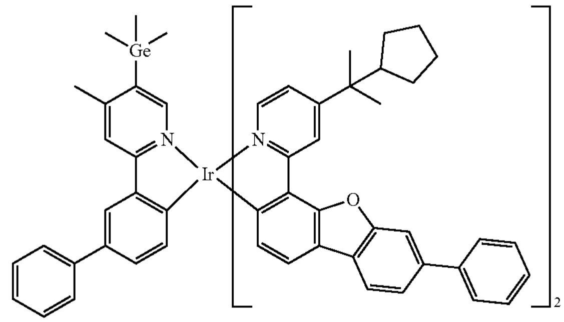
3614
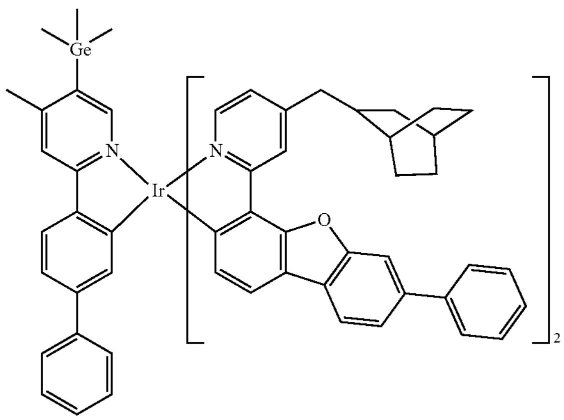
3615
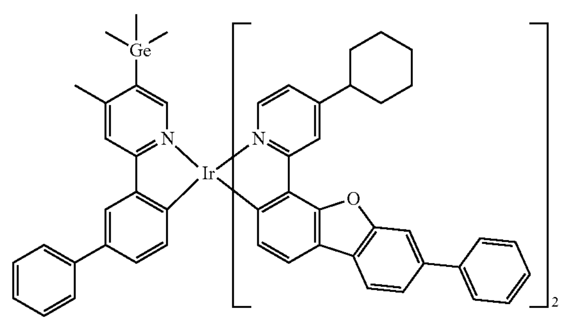
3616
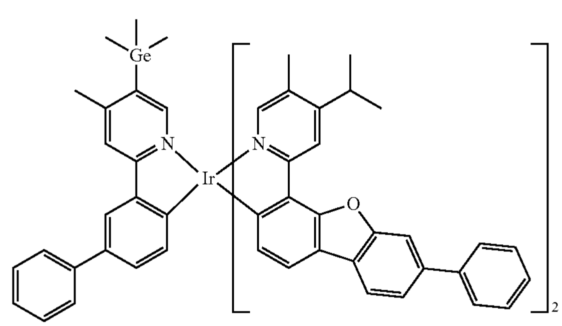

-continued
3617
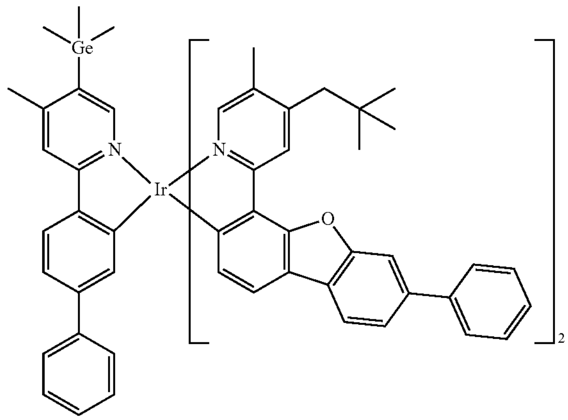
3618
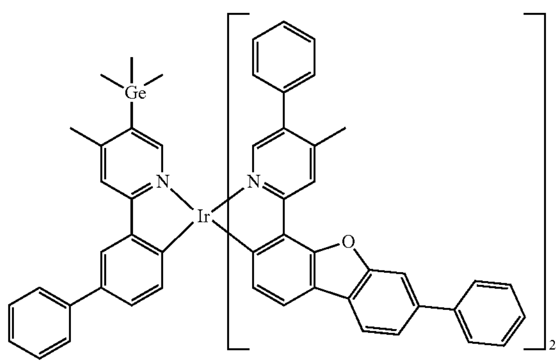
3619
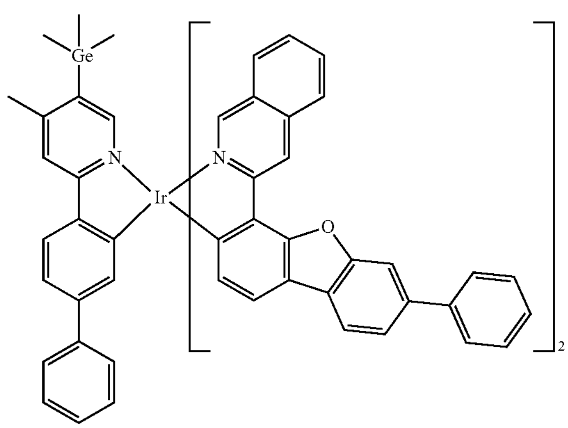
3620
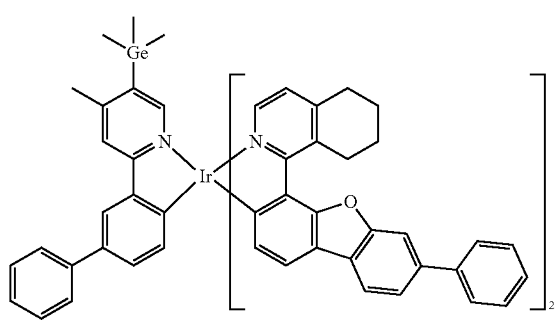
-continued
3621
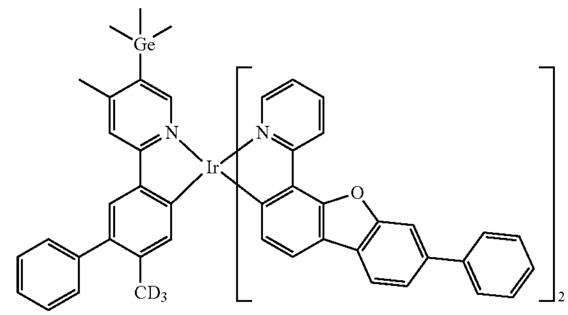
3622
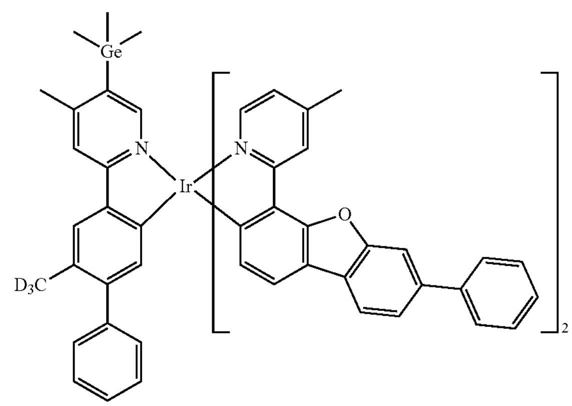
3623
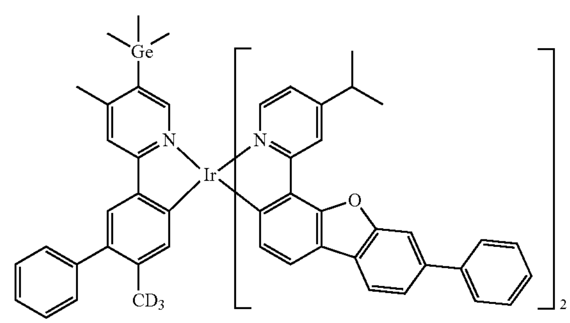
3624
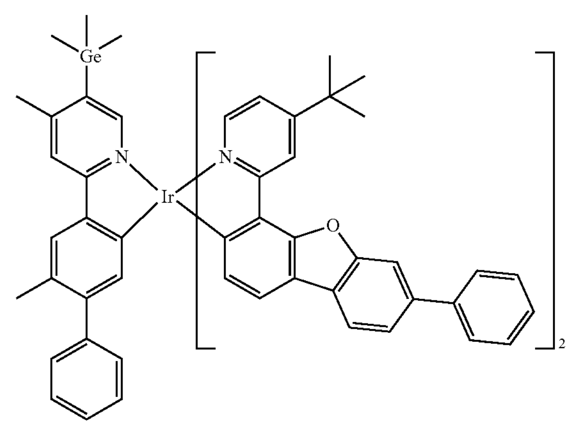

-continued
3625
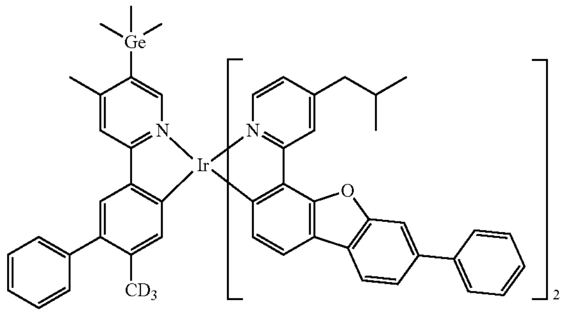
3626
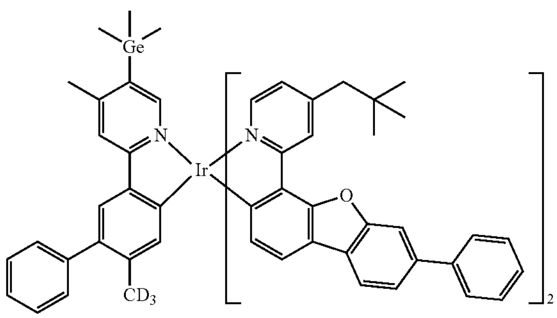
3627
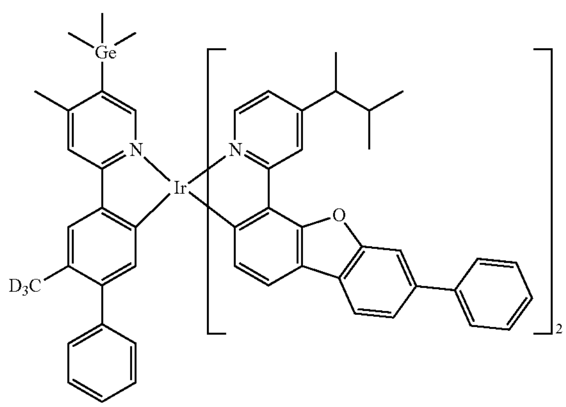
3628
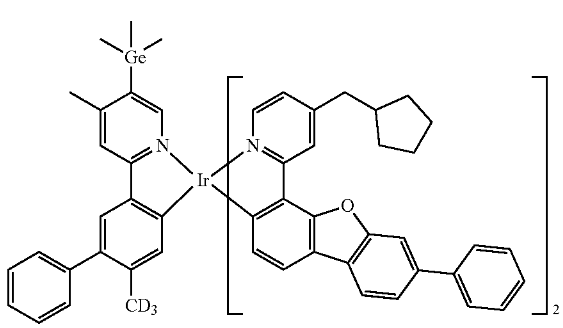
-continued
3629
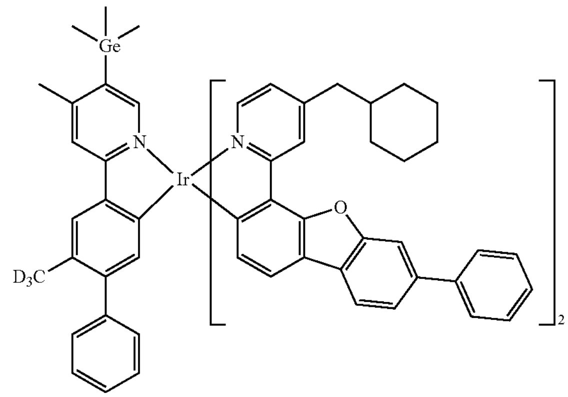
3630
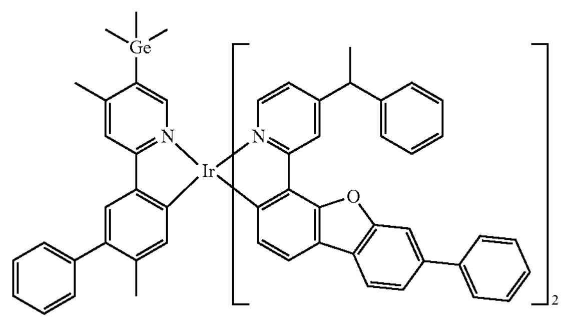
3631
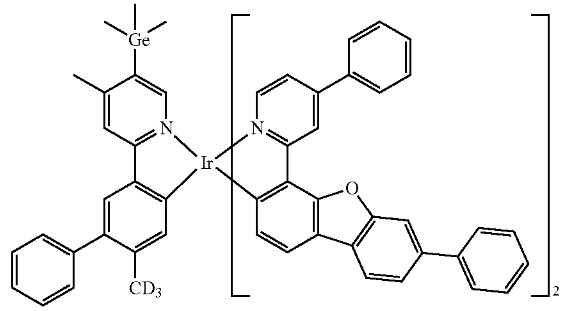
3632
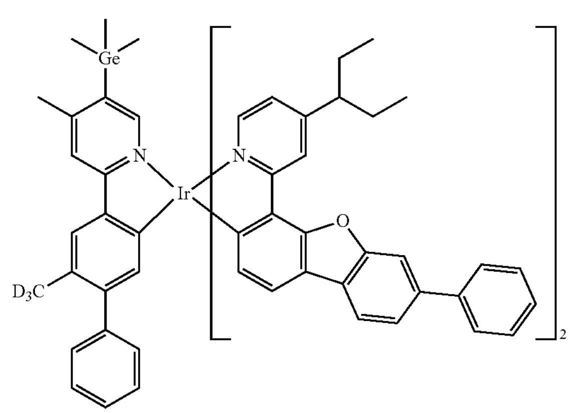

-continued
3633
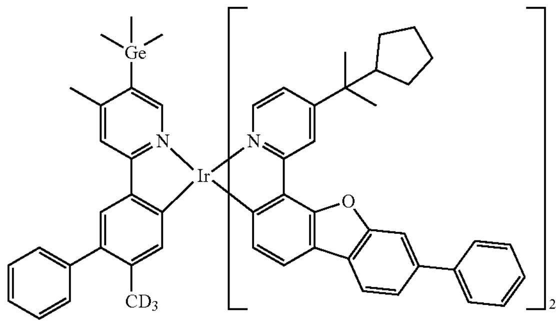
3634
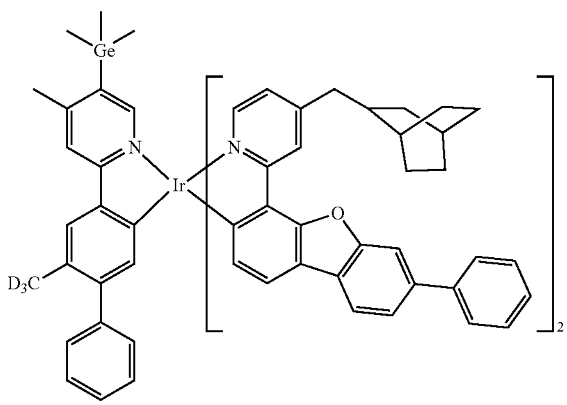
3635
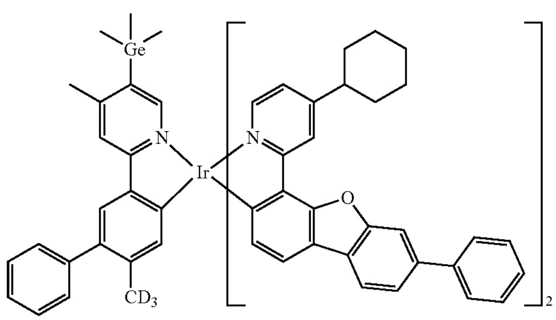
3636
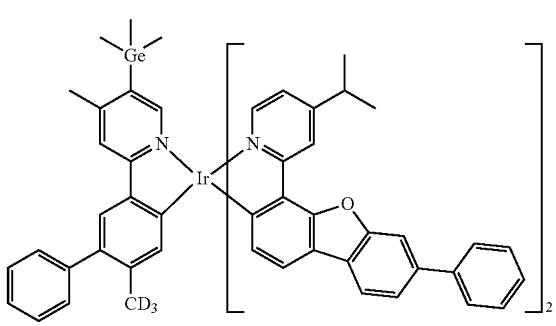
-continued
3637
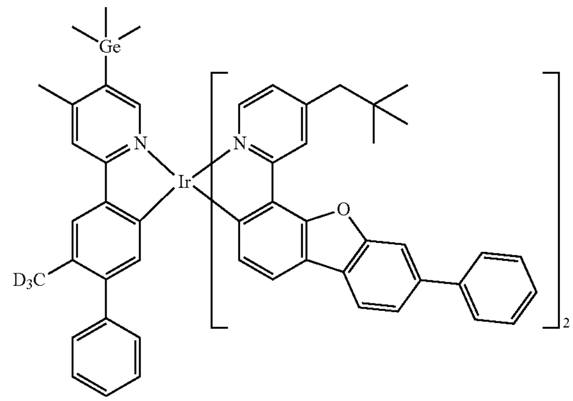
3638
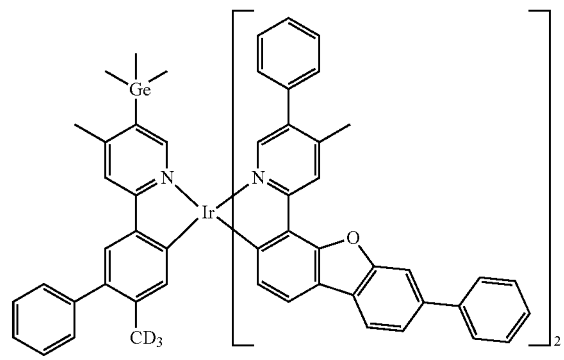
3639
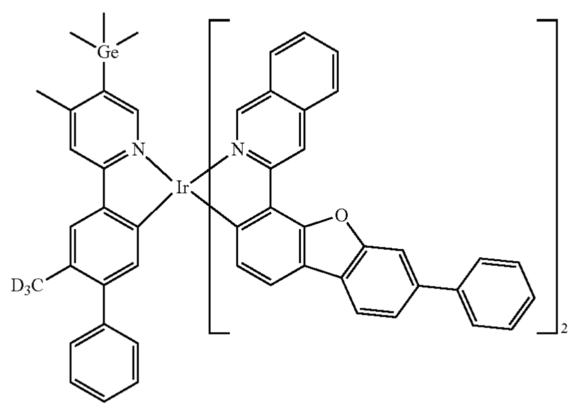
3640
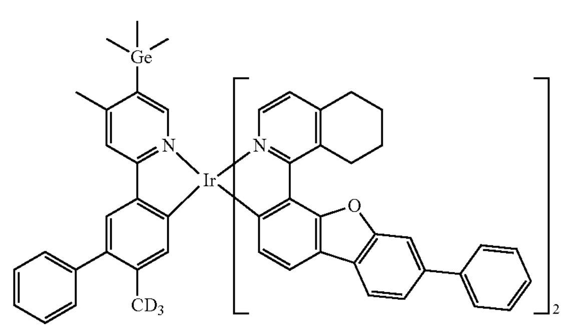

-continued
3641
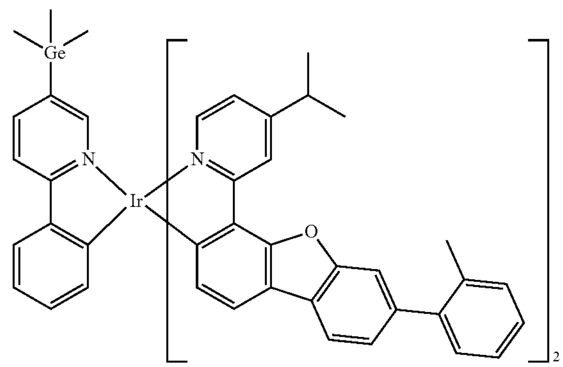
3642
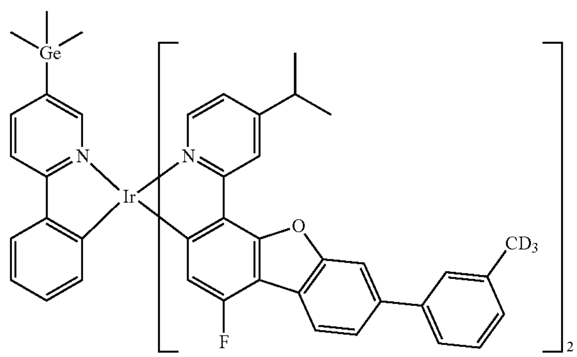
3643
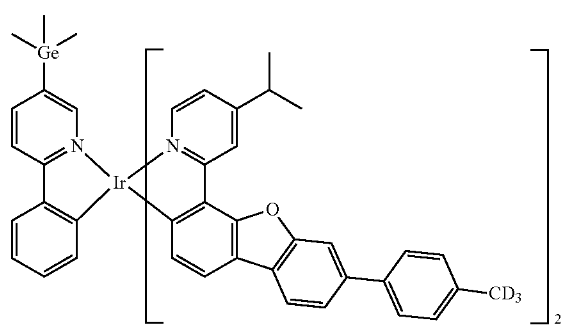
3644
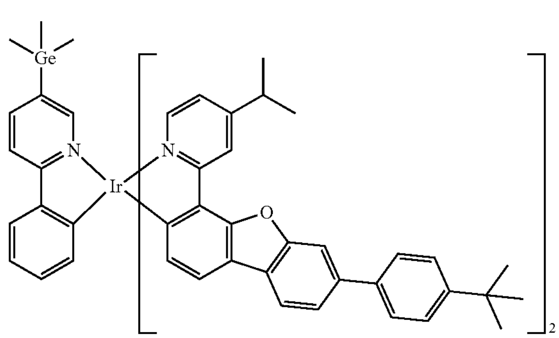
-continued
3645
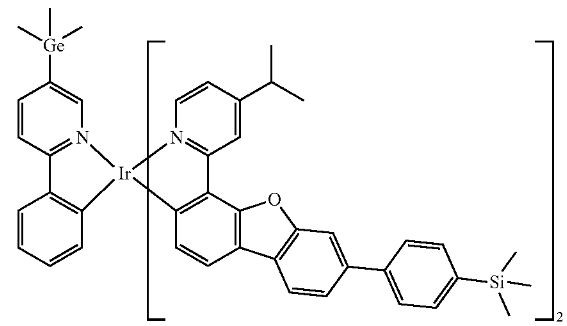
3646
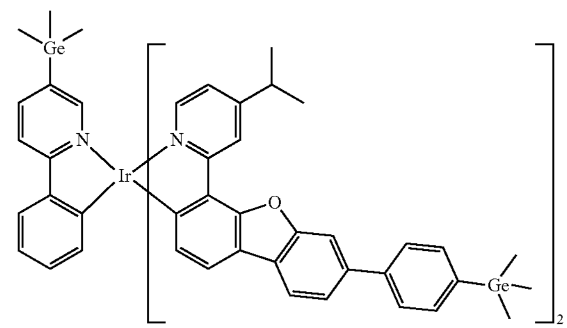
3647
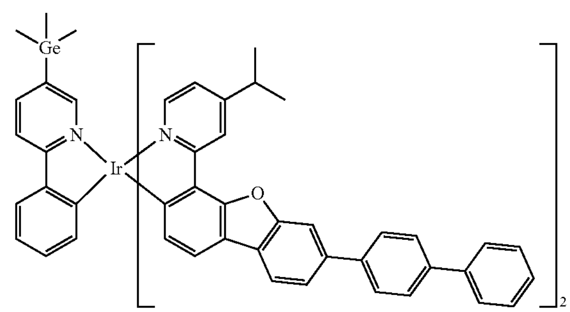
3648
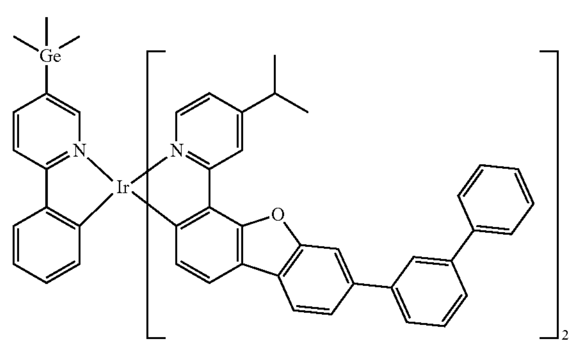

-continued
3649
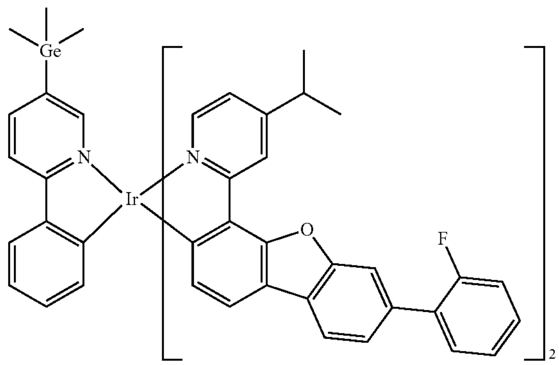
3650
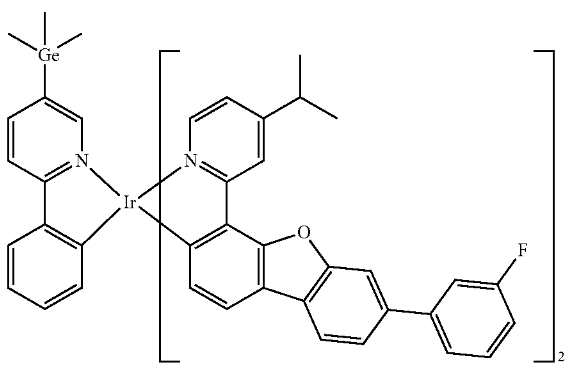
3651
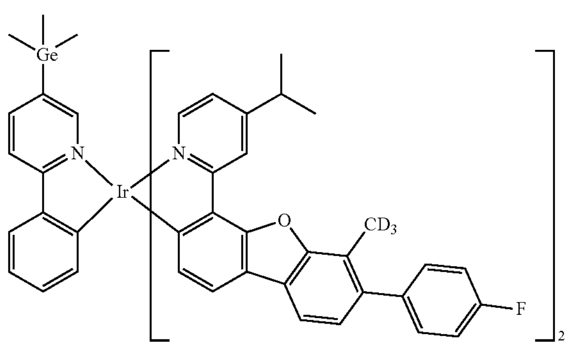
3652
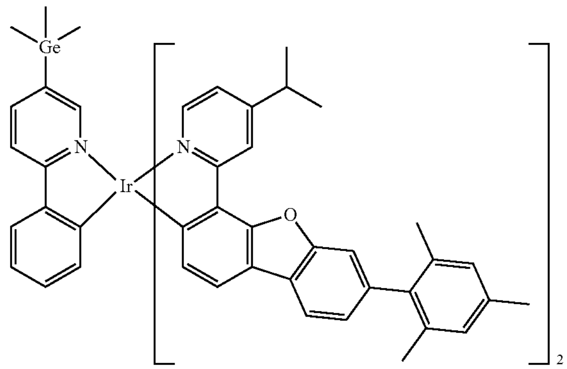
-continued
3653
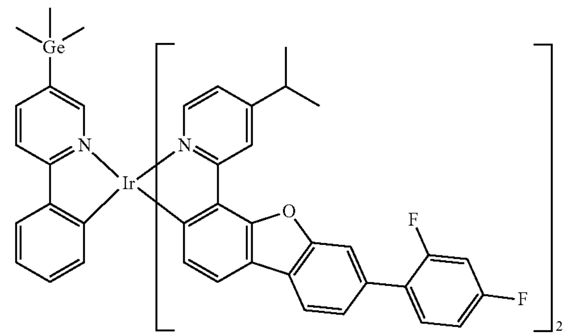
3654
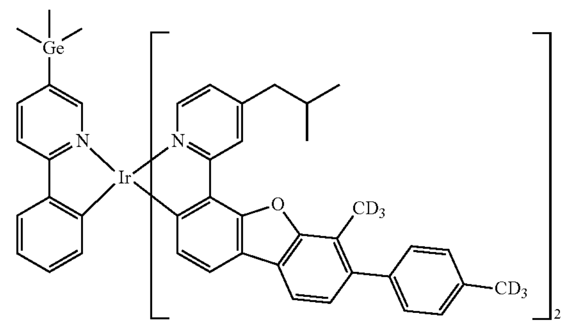
3655
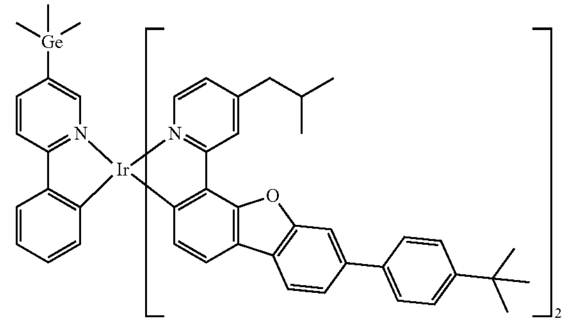
3656
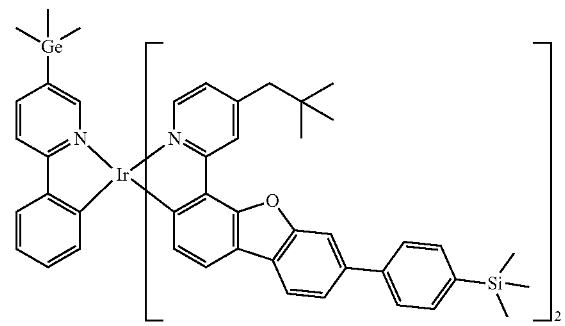

-continued
3657
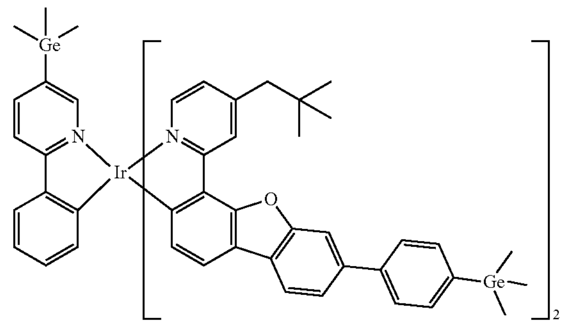
3658
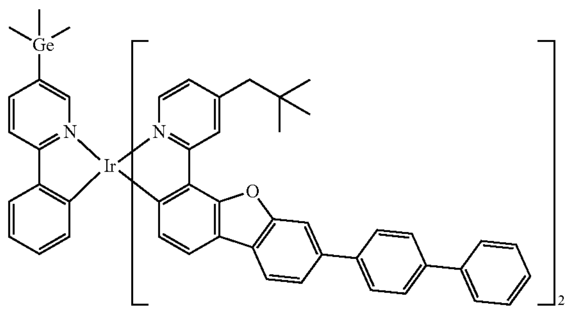
3659
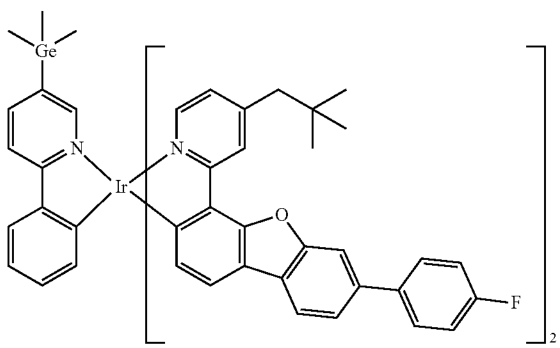
3660
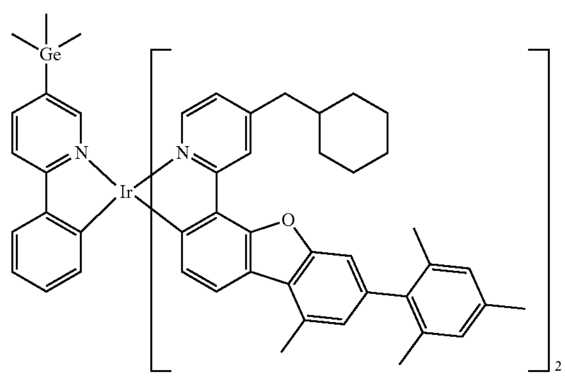
-continued
3661
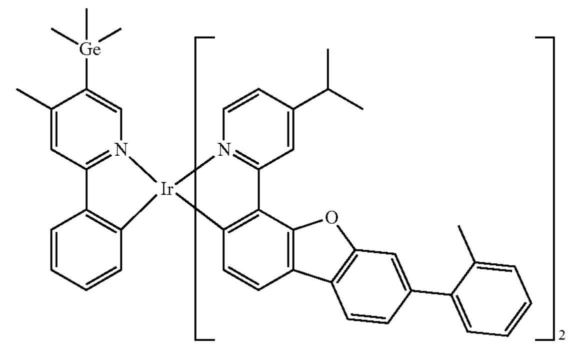
3662
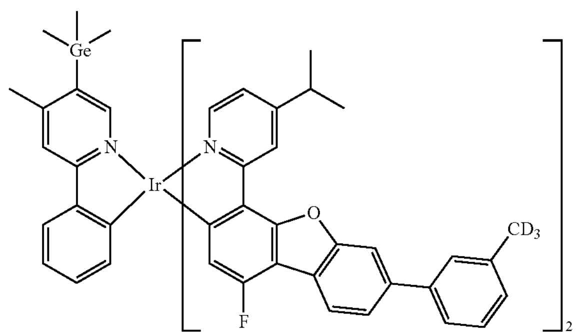
3663
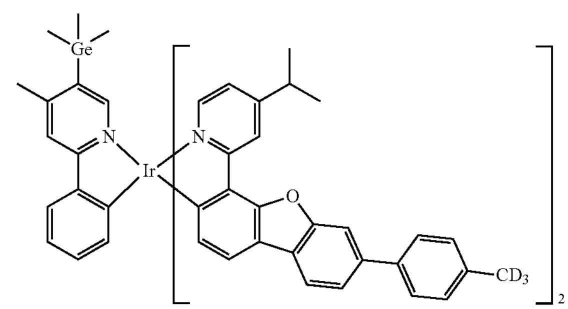
3664
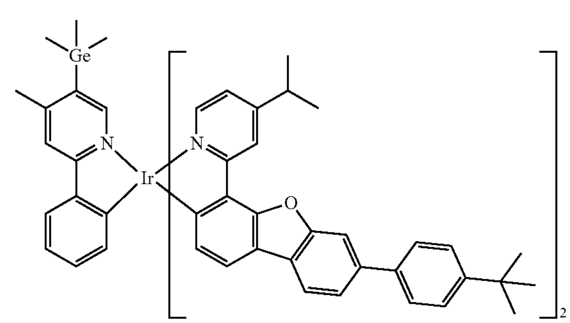

-continued
3665
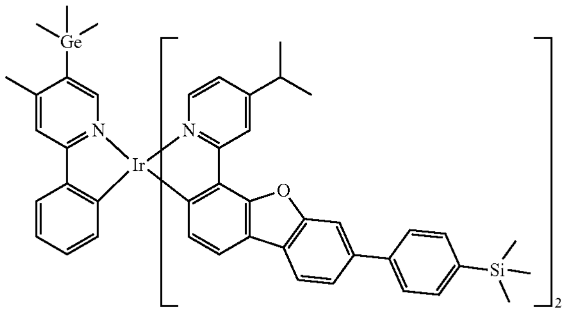
3666
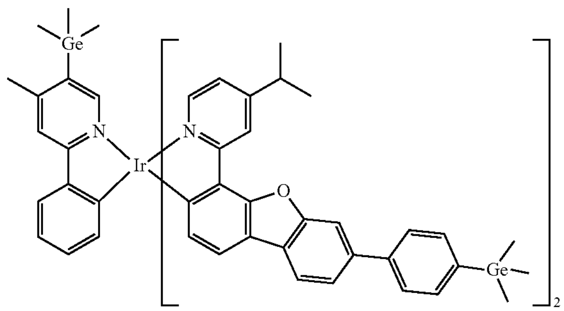
3667
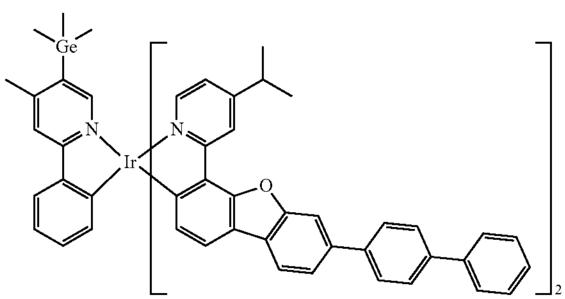
3668
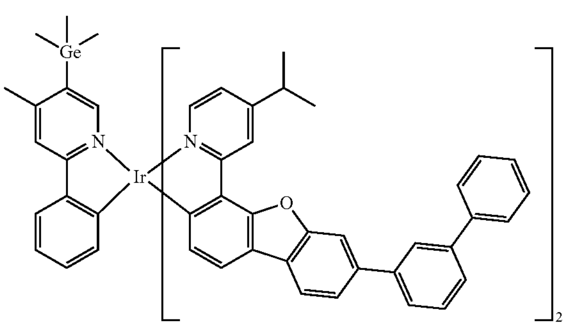
-continued
3669
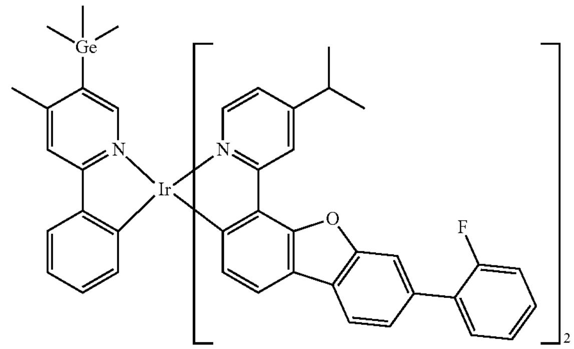
3670
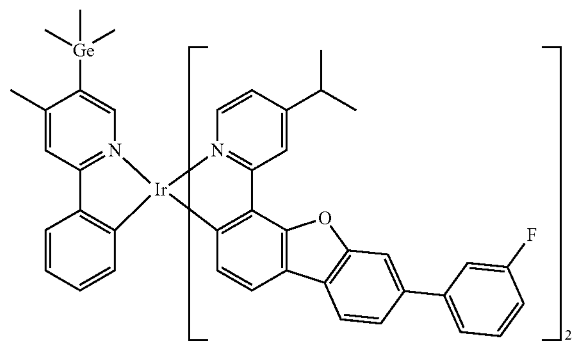
3671
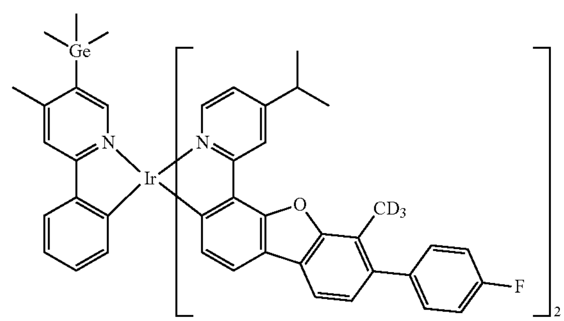
3672
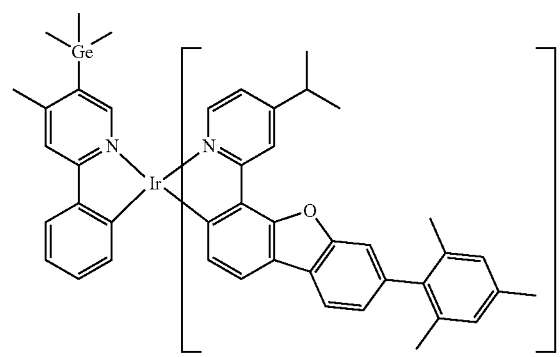

-continued
3673
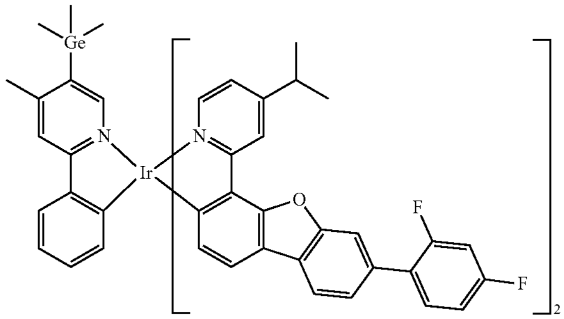
3674
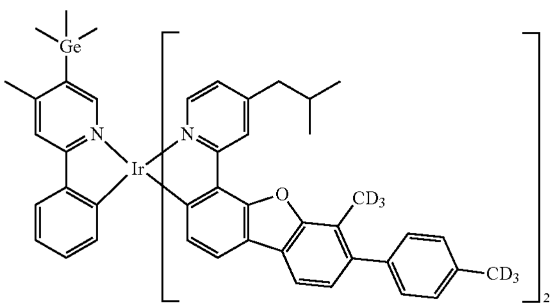
3675
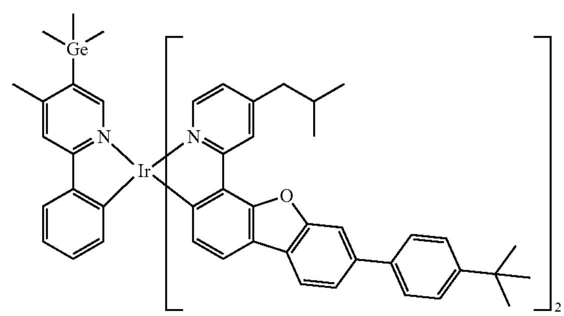
3676
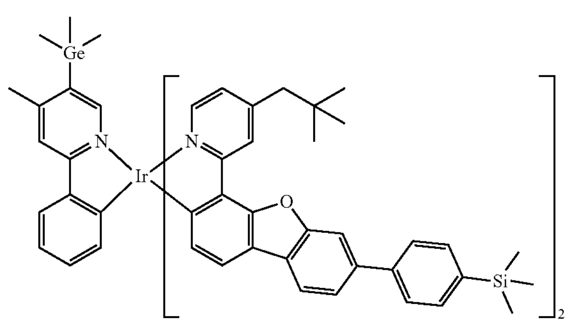
-continued
3677
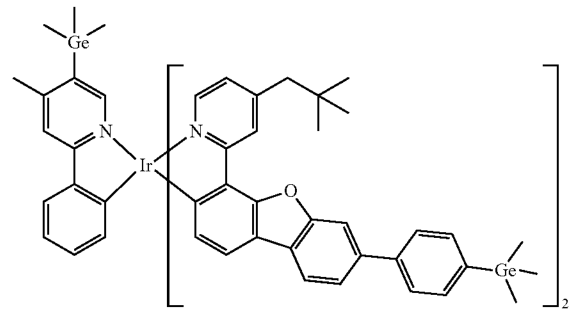
3678
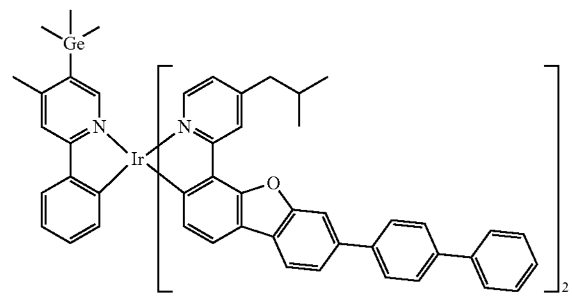
3679
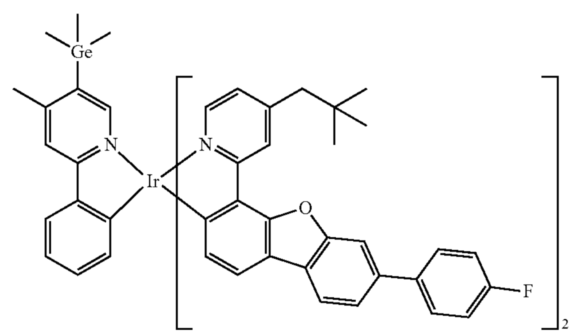
3680
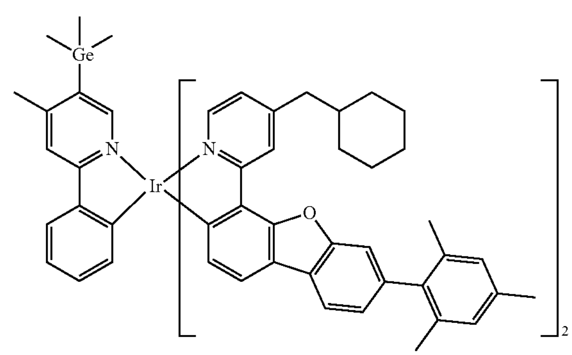

3681
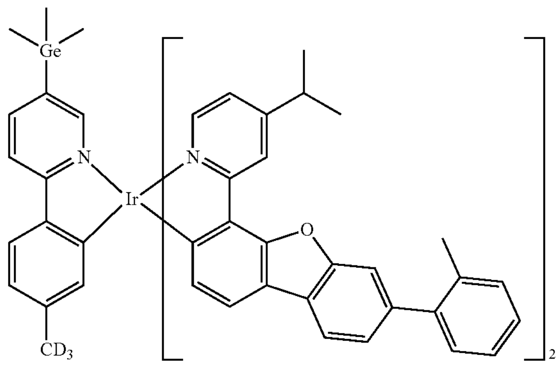
3682
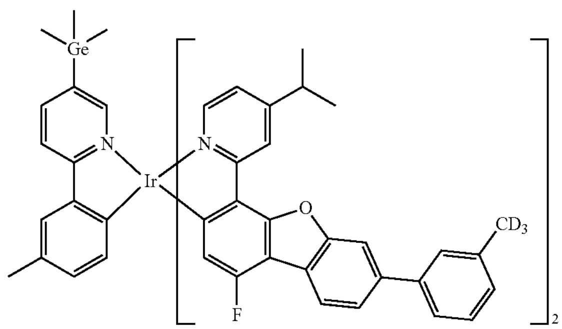
3683
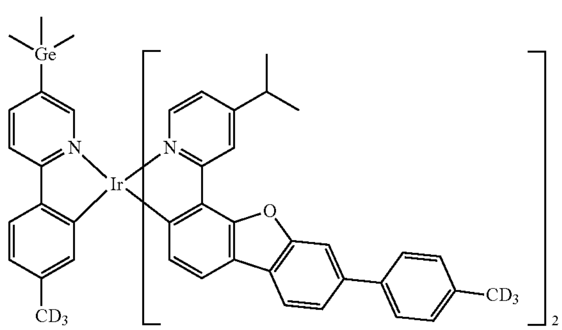
3684
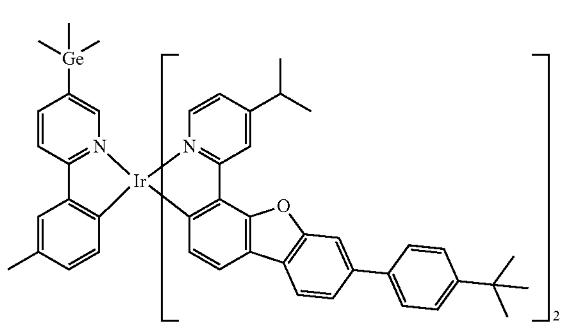
3685
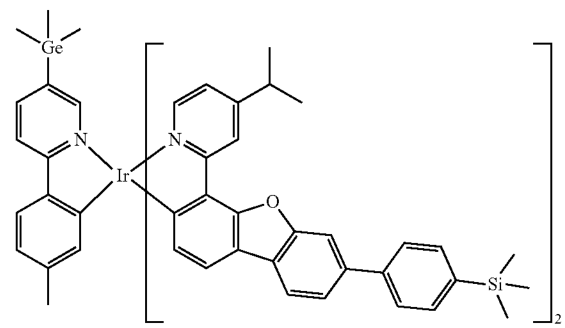
3686
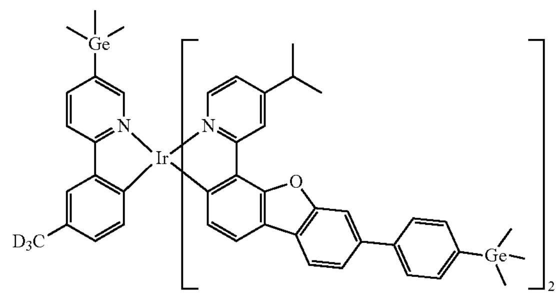
3687
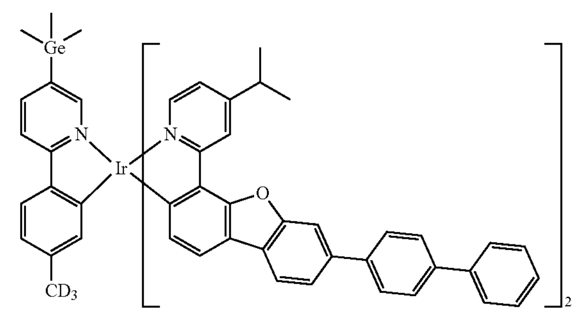
3688
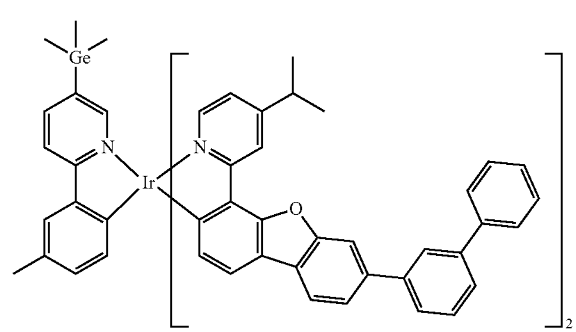

-continued
3689
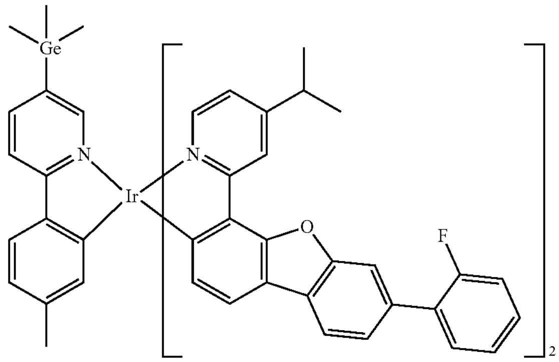
3690
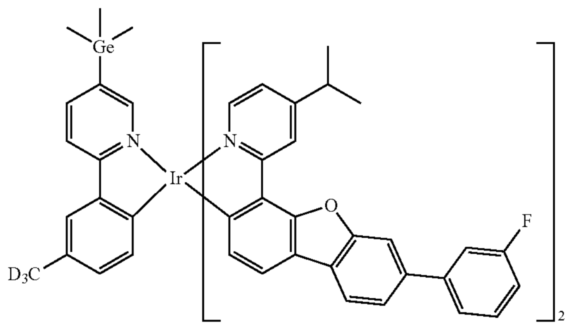
3691
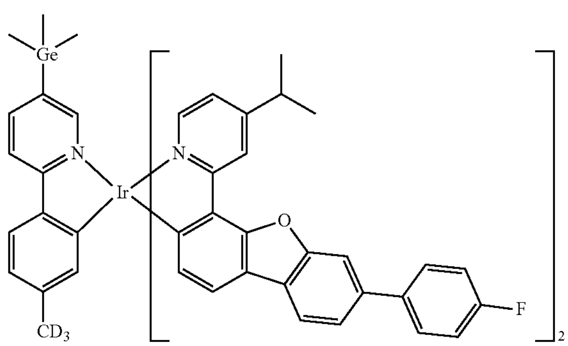
3692
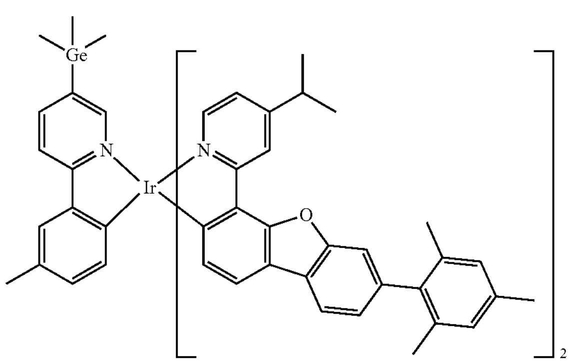
-continued
3693
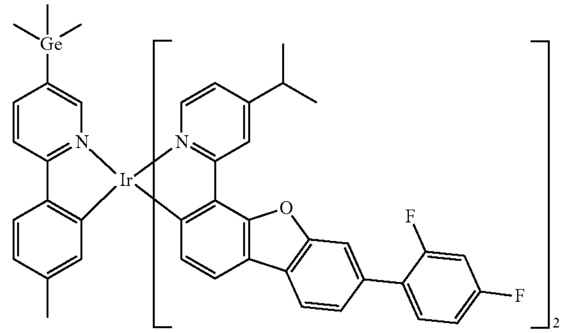
3694
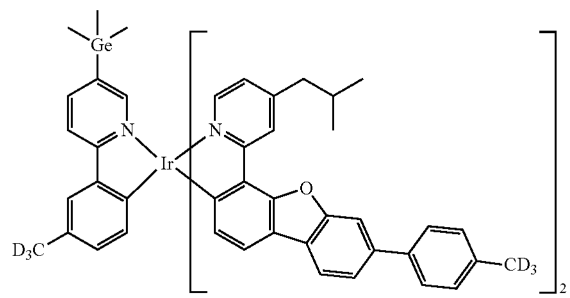
3695
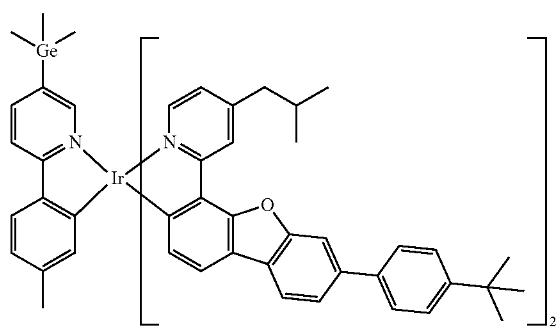
3696
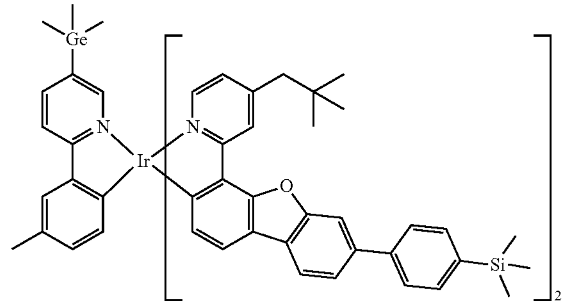

3697
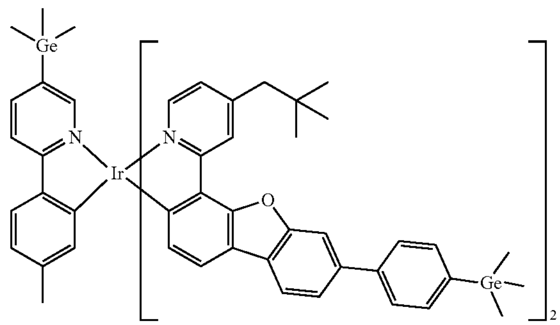
3698
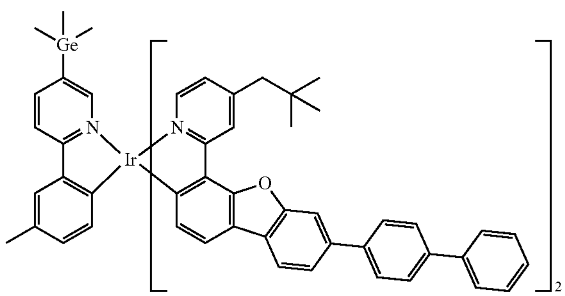
3699
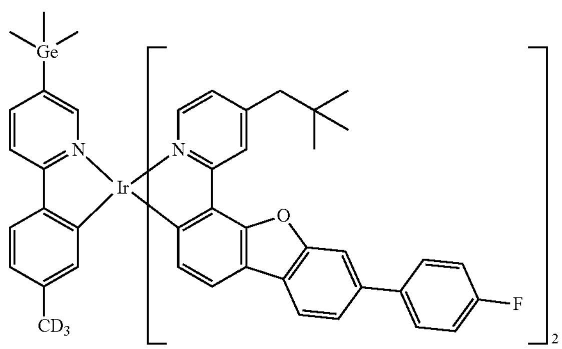
3700
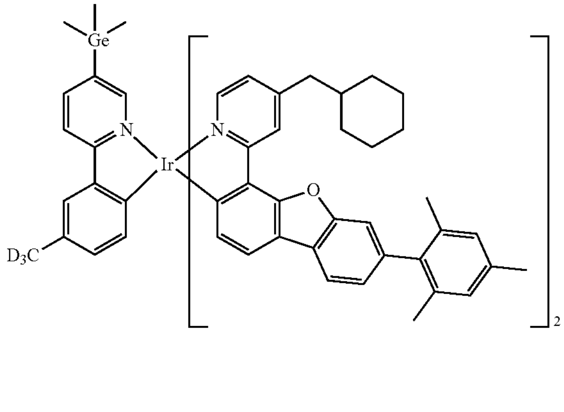
3701
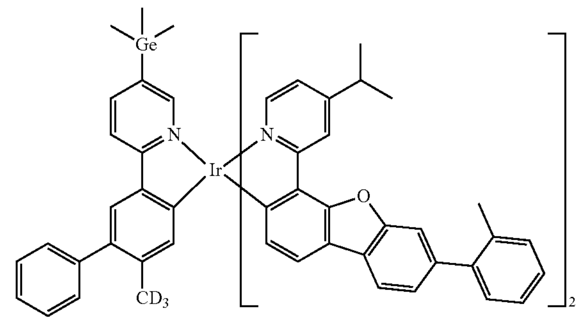
3702
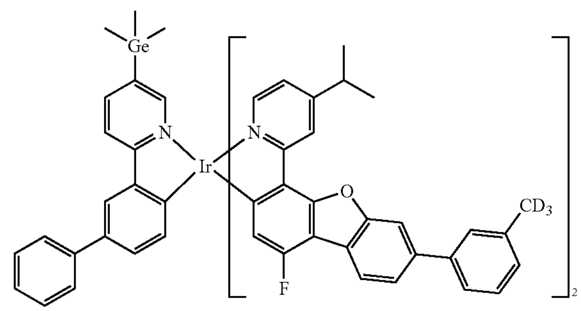
3703
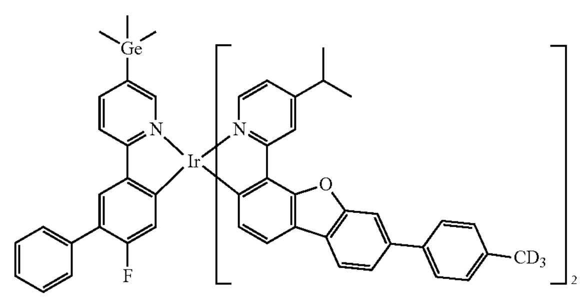
3704
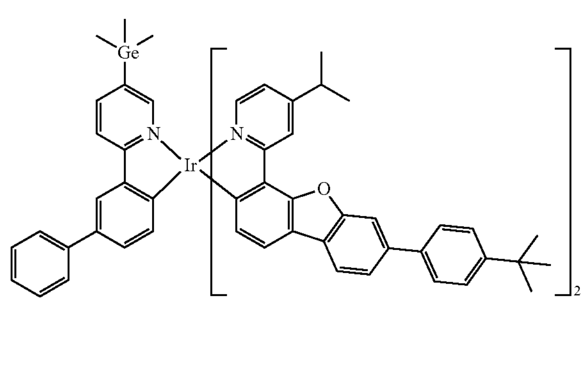

-continued
3705
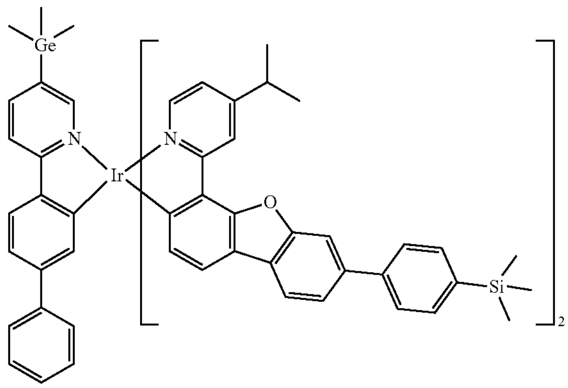
3706
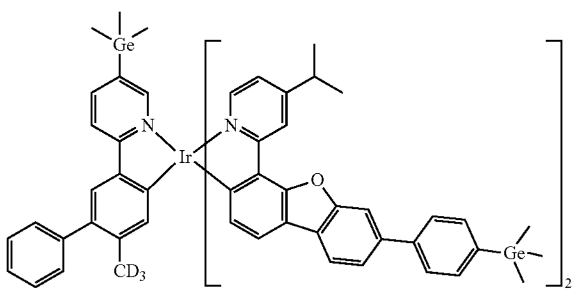
3707
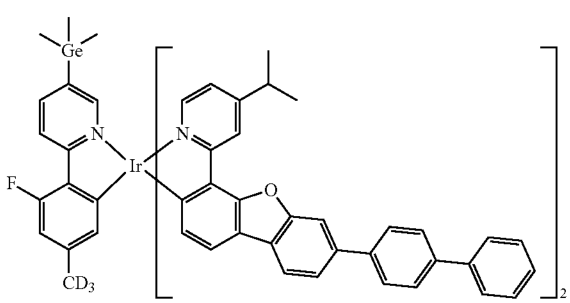
3708
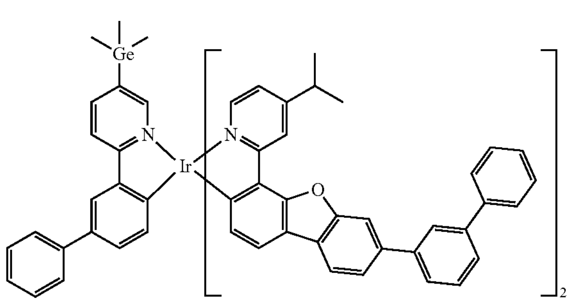
-continued
3709
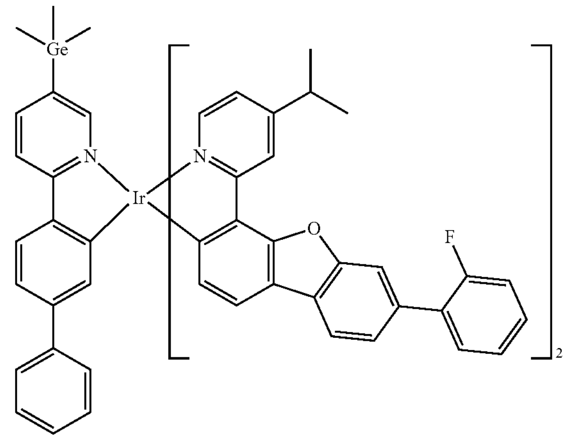
3710
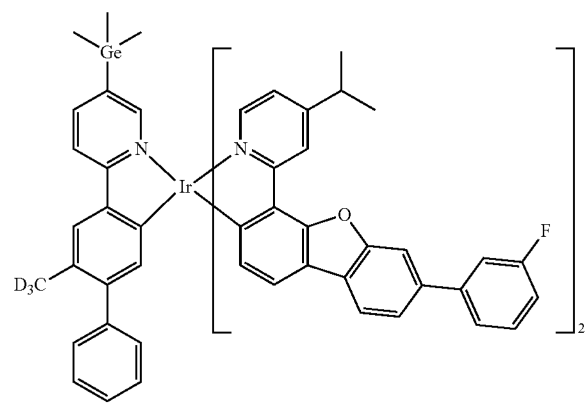
3711
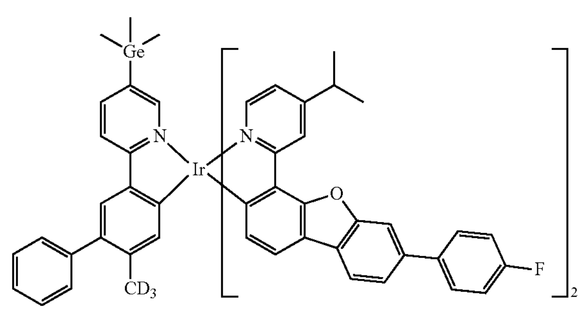
3712
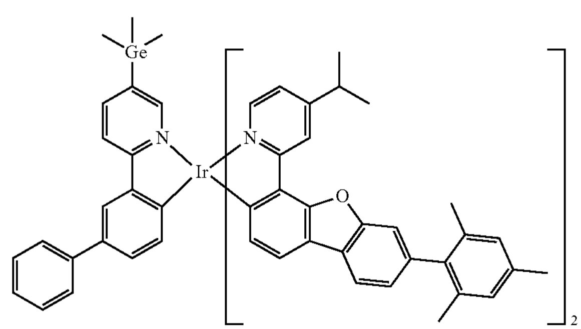

-continued
3713
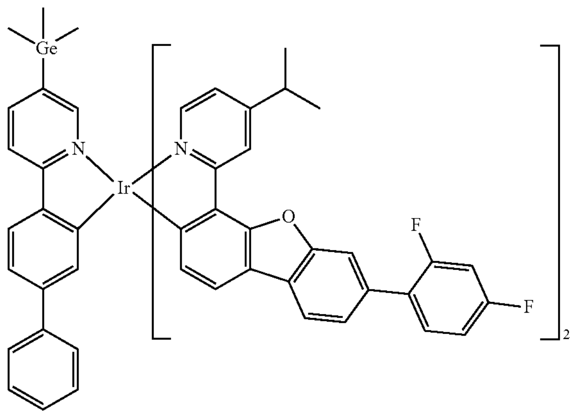
3714
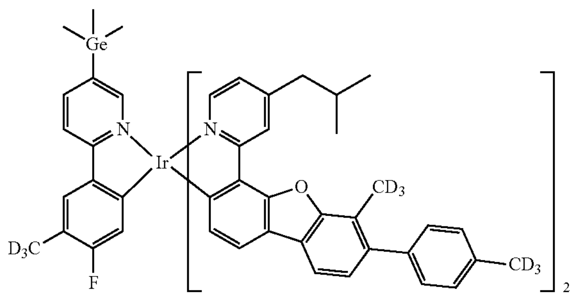
3715
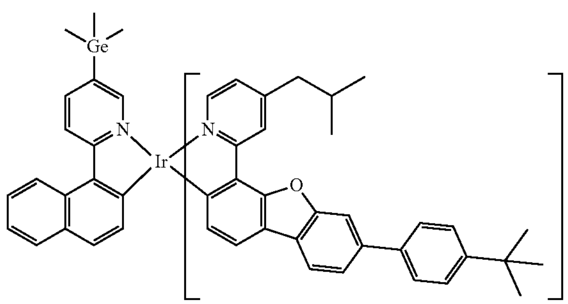
3716
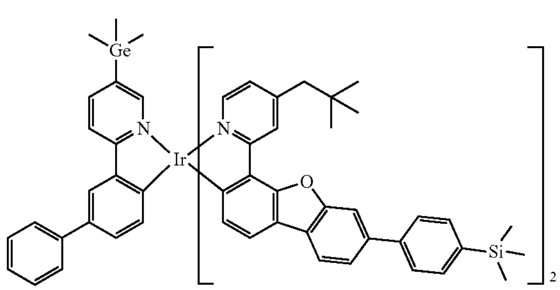
-continued
3717
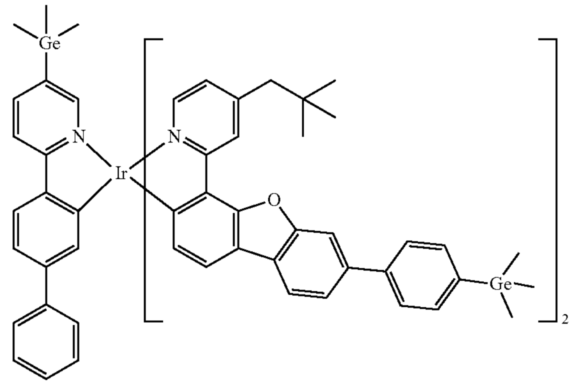
3718
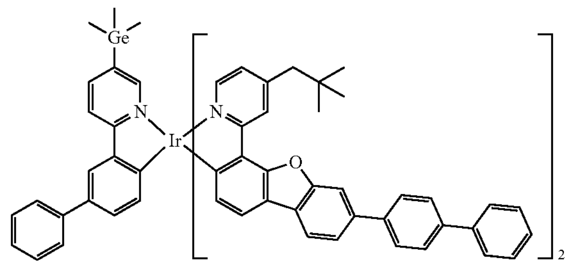
3719
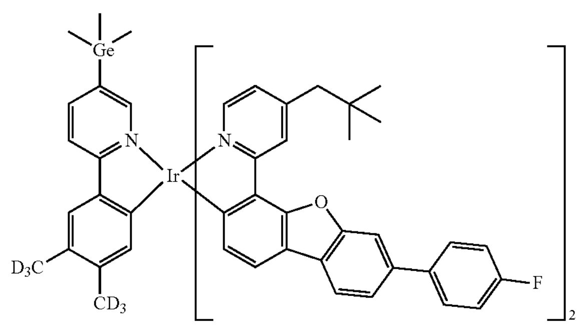
3720
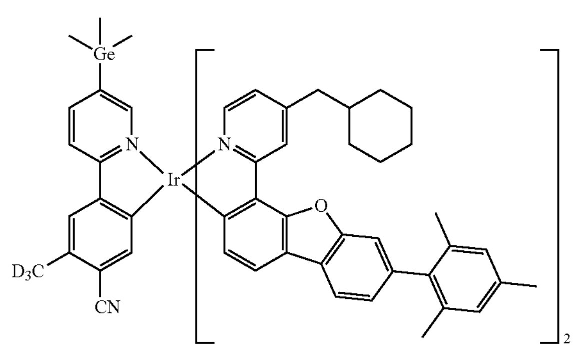

-continued
3721
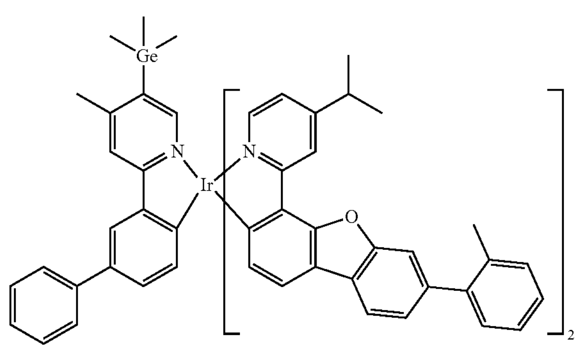
3722
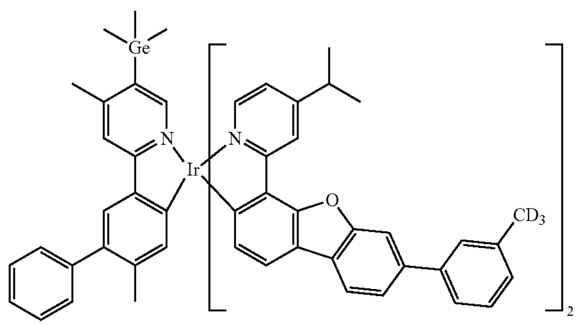
3723
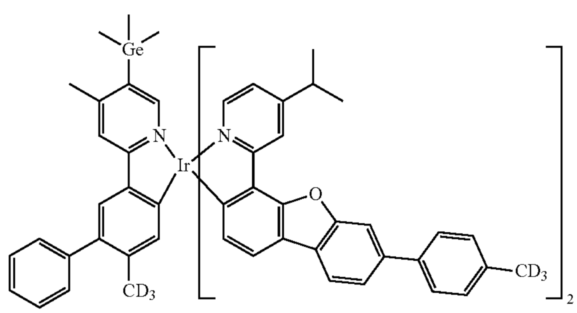
3724
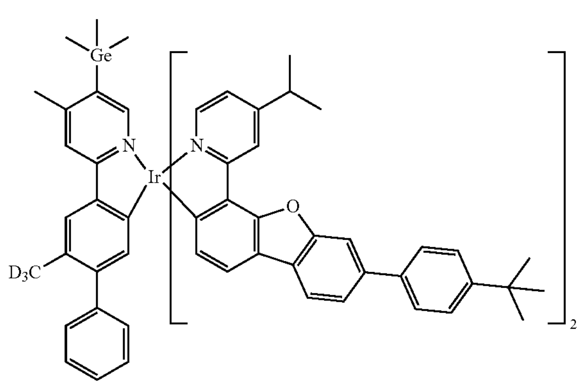
3725
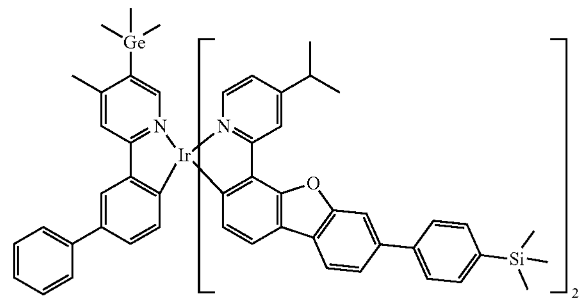
3726
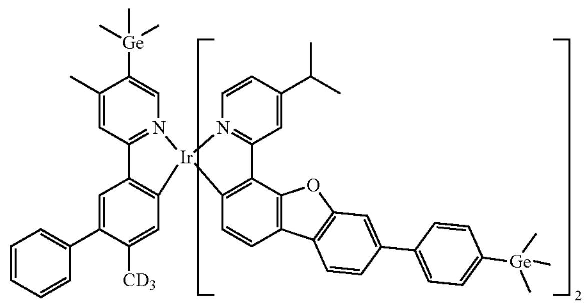
3727
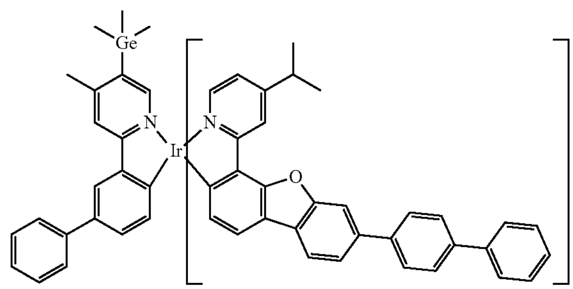
3728
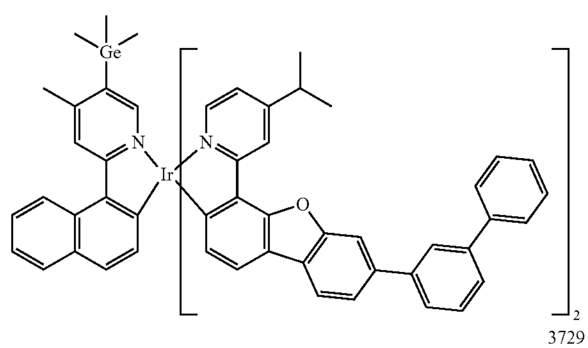
3729
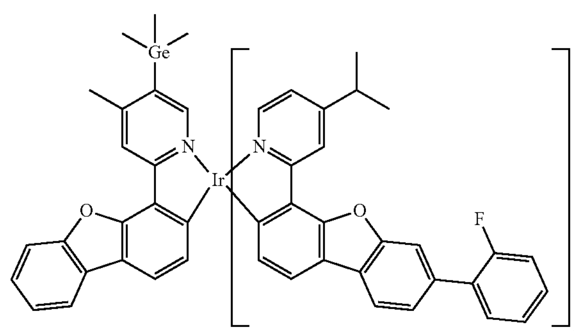

-continued
3730
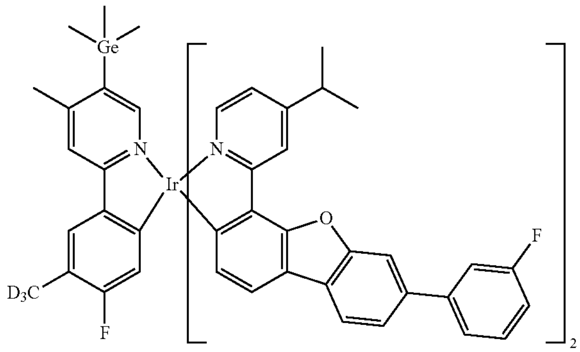
3731
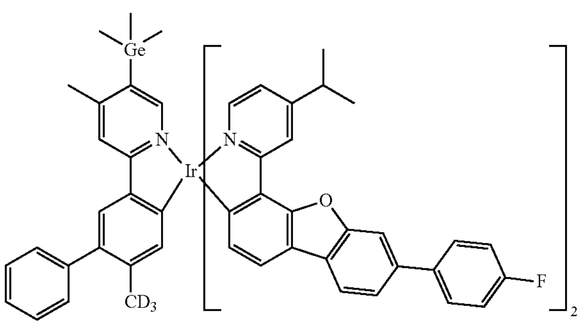
3732
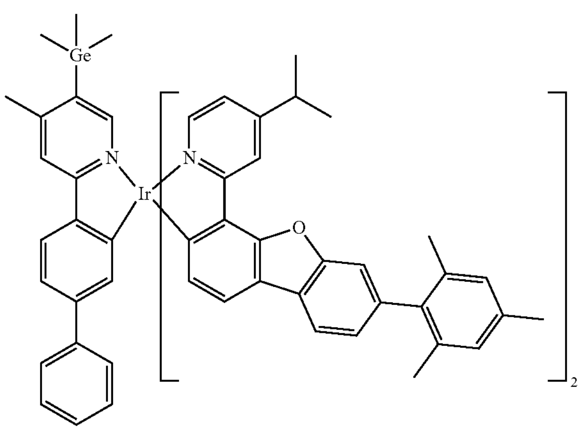
3733
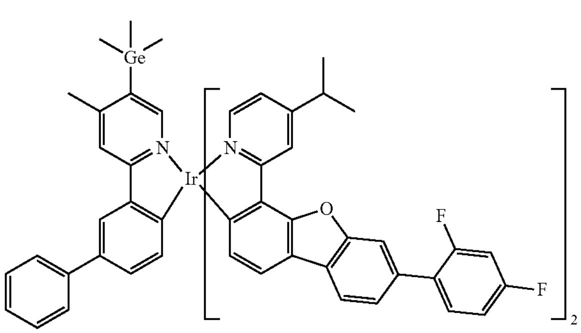
-continued
3734
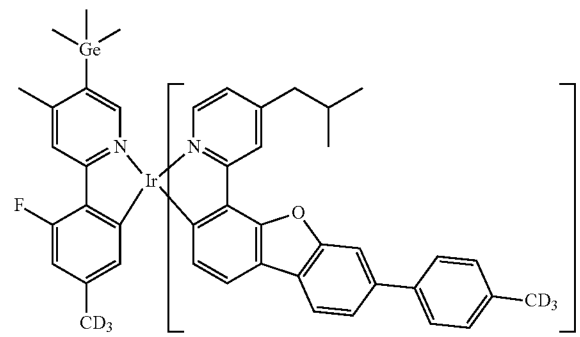
3735
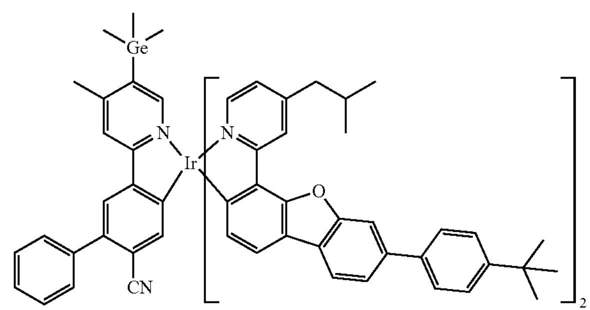
3736
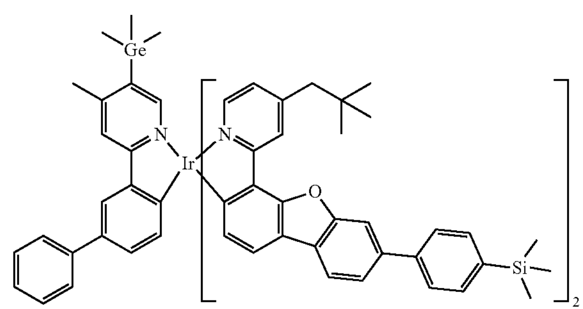
3737
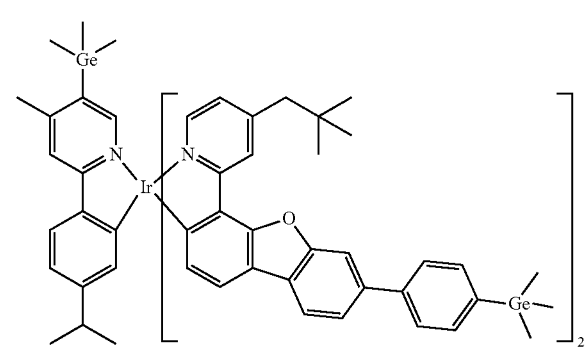

3738
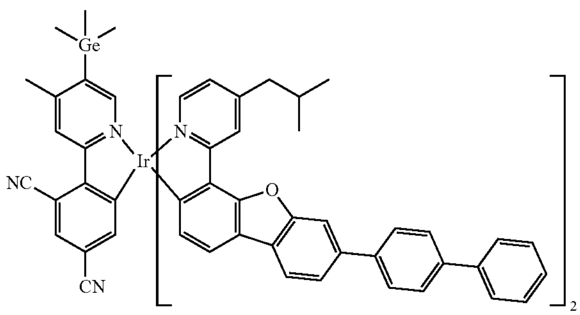
3739
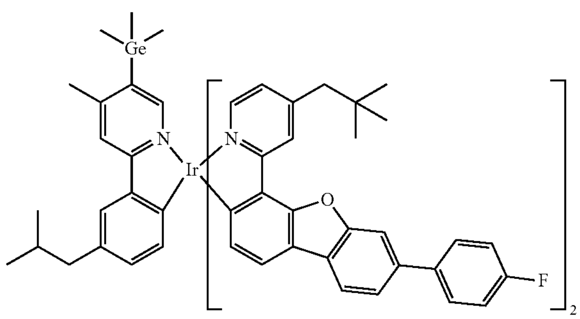
3740
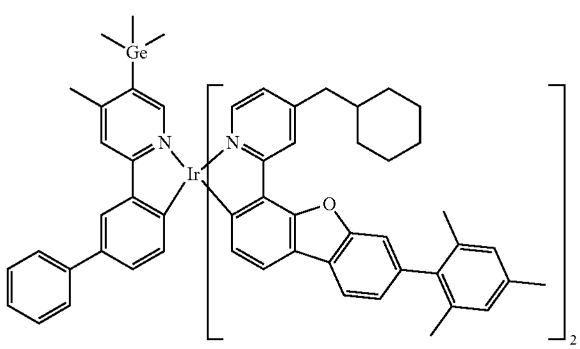
3741
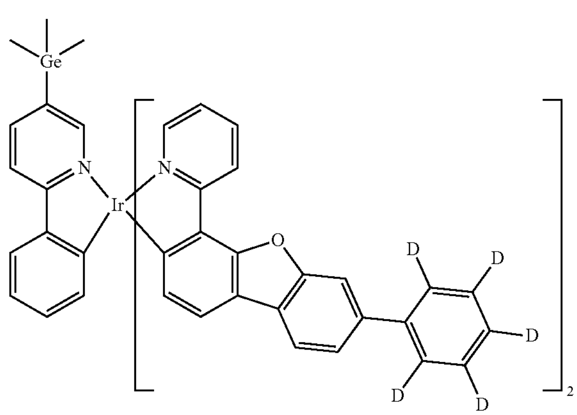
3742
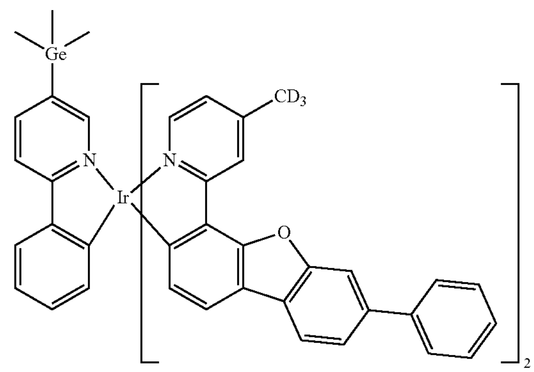
3743
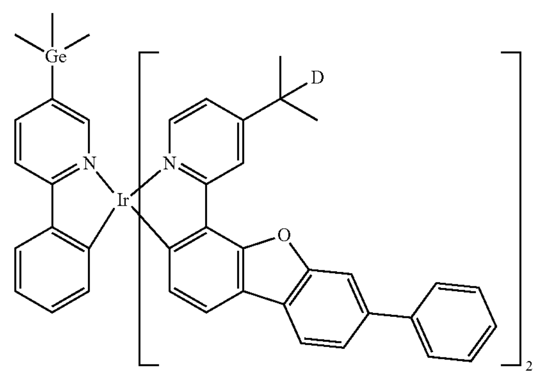
3744
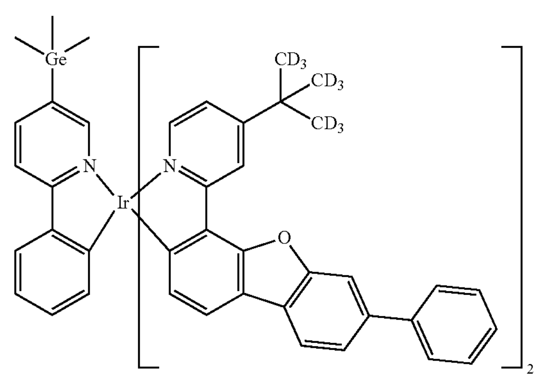
3745
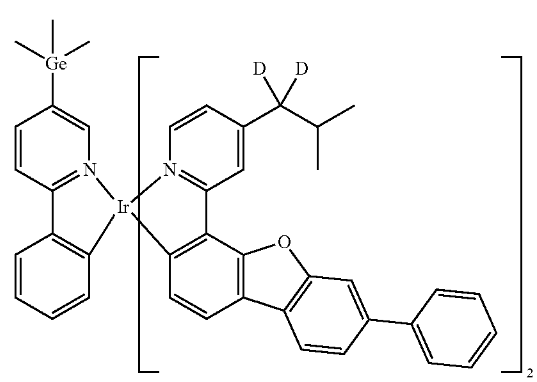

3746
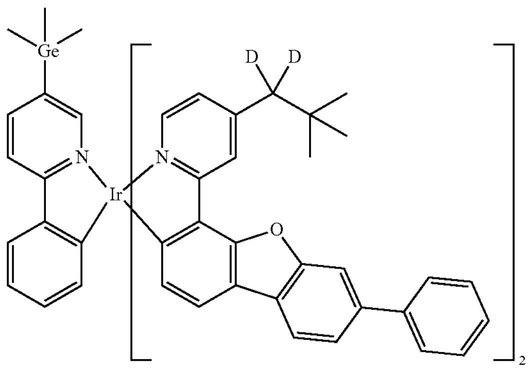
3747
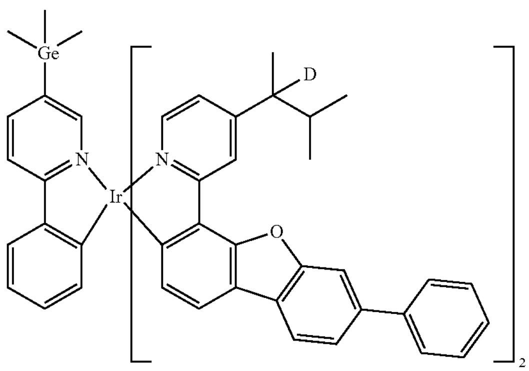
3748
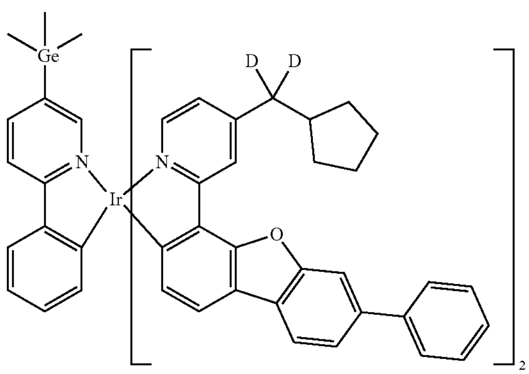
3749
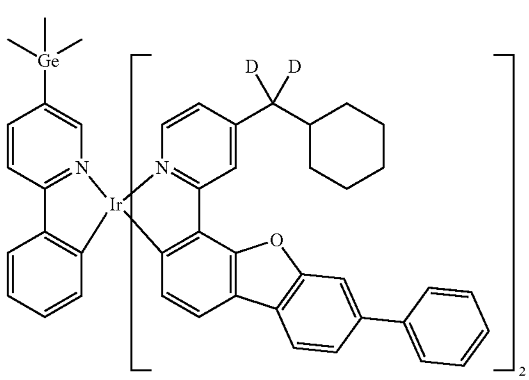
3750
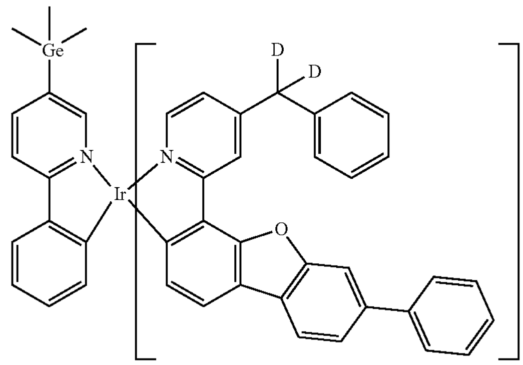
3751
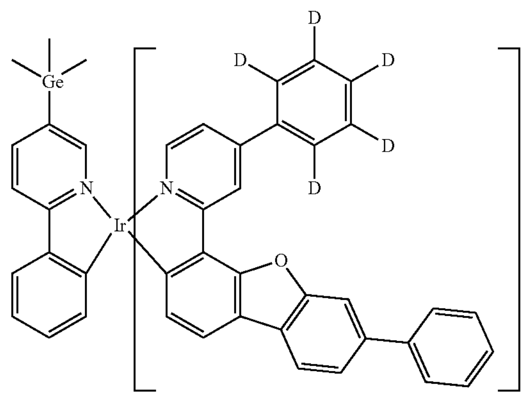
3752
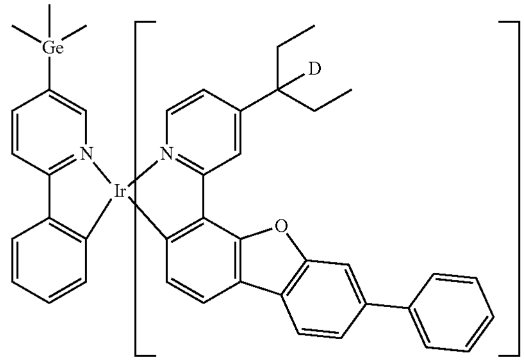
3753
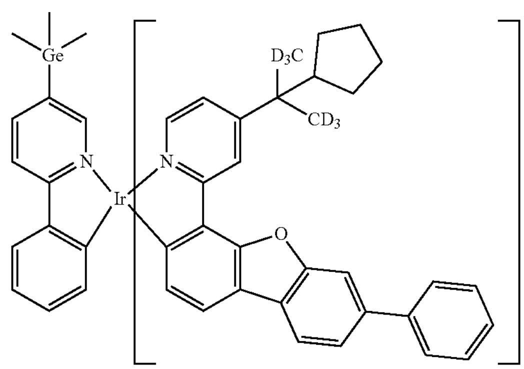

-continued
3754
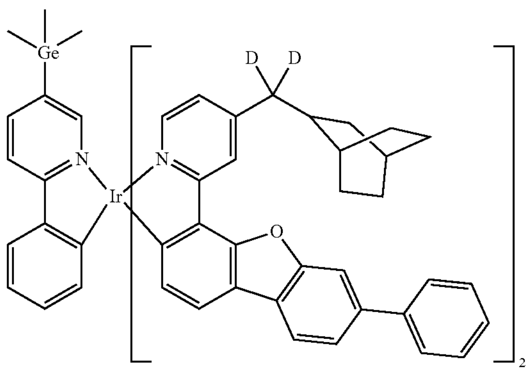
3755
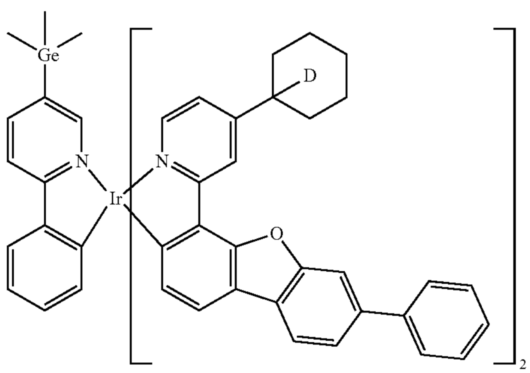
3756
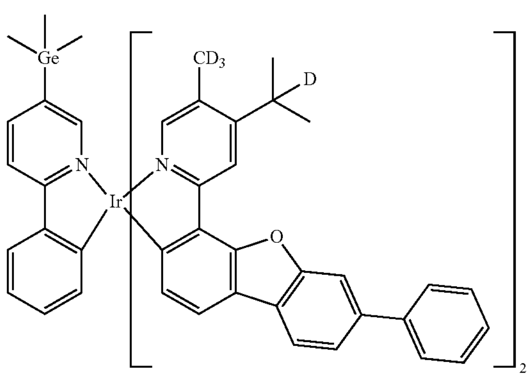
3757
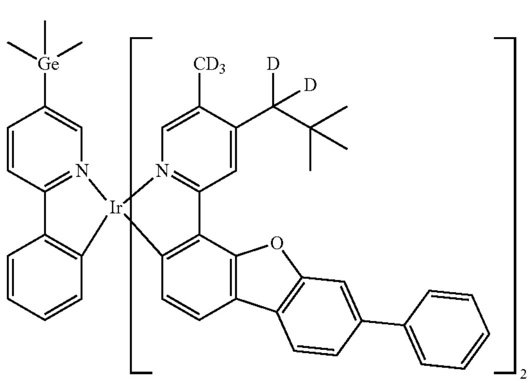
-continued
3758
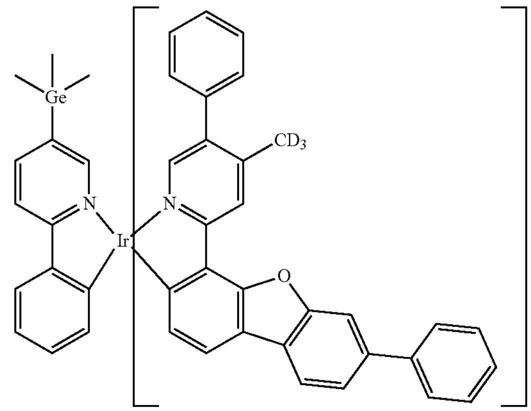
3759
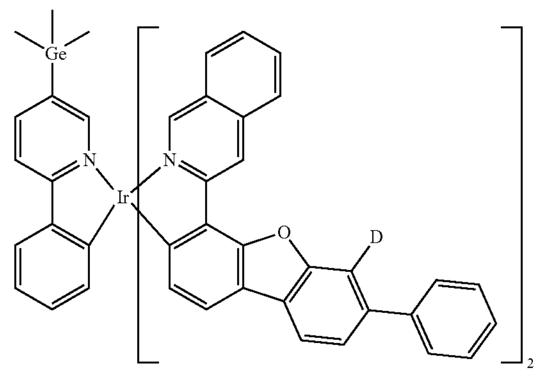
3760
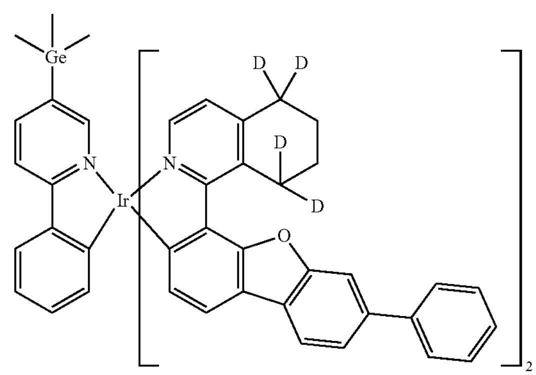
3761
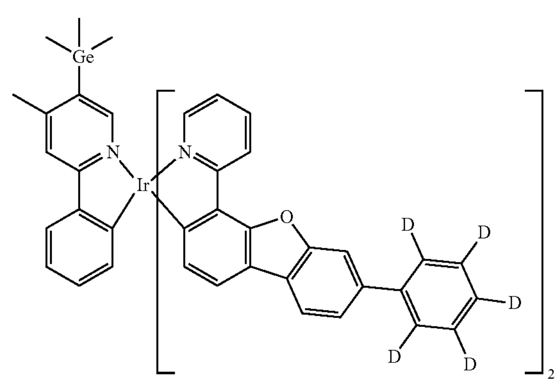

3762
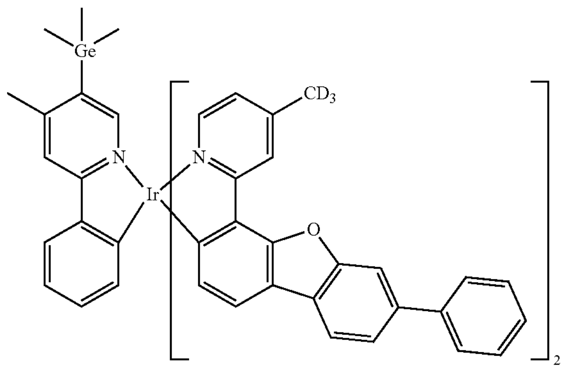
3763
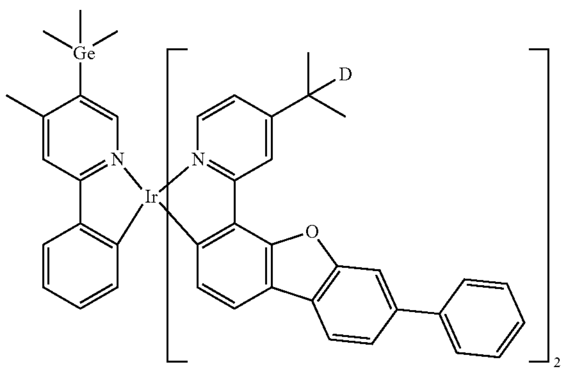
3764
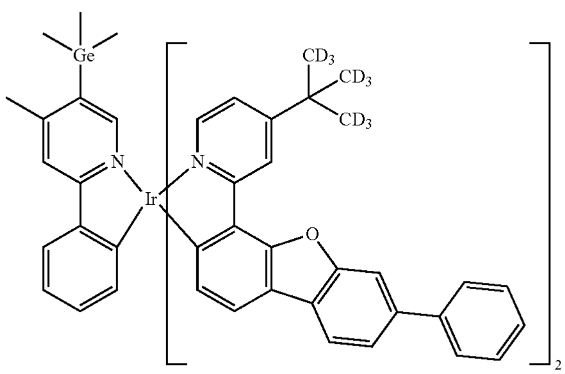
3765
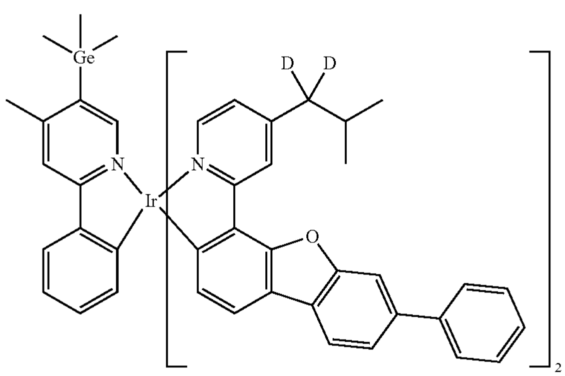
3766
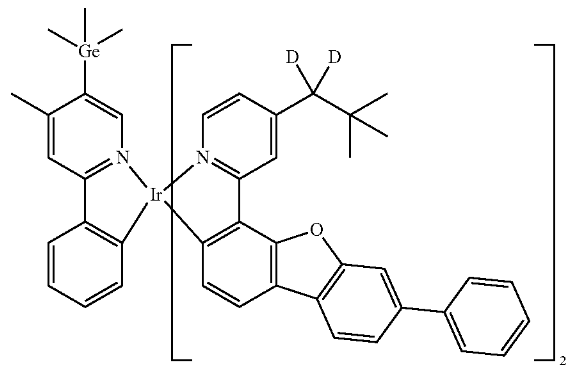
3767
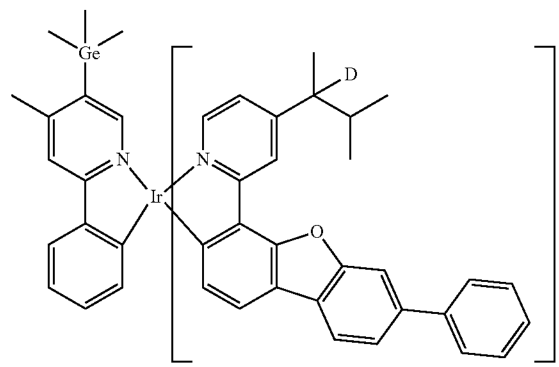
3768
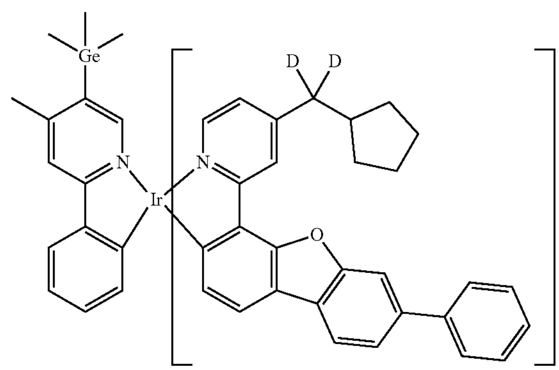
3769
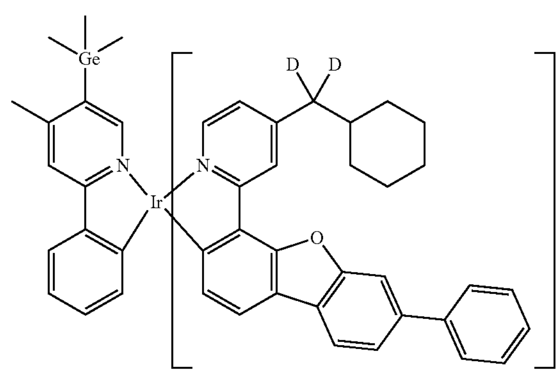

-continued
3770
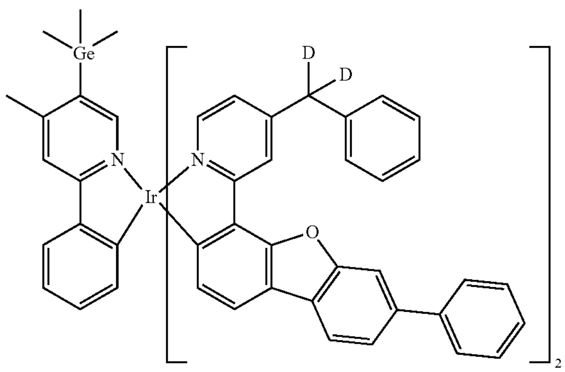
3771
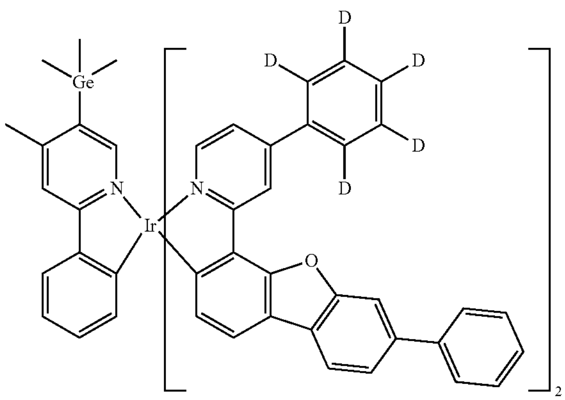
3772
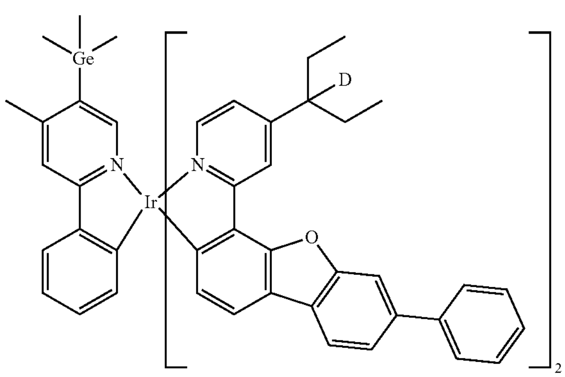
3773
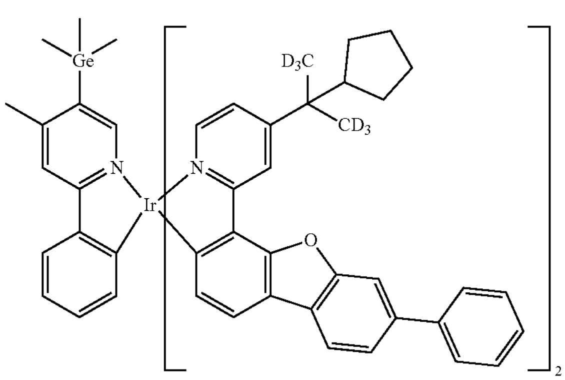
-continued
3774
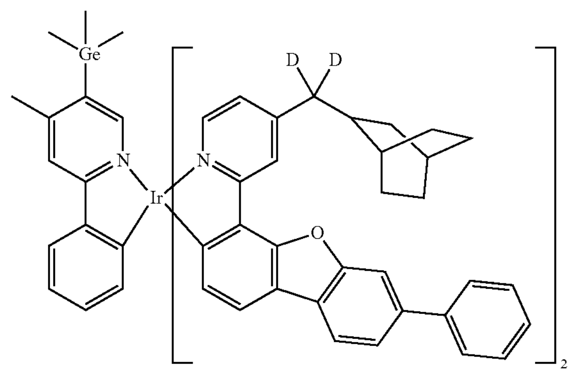
3775
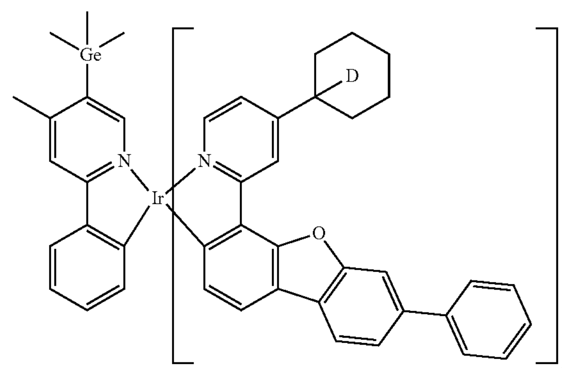
3776
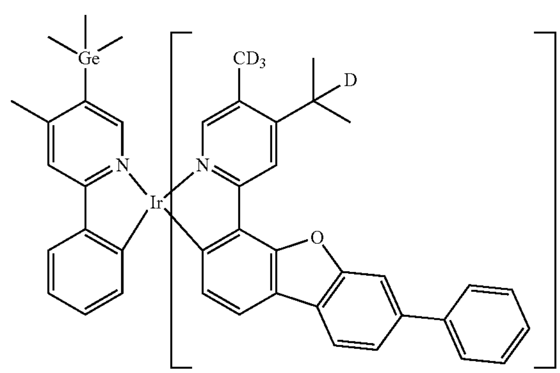
3777
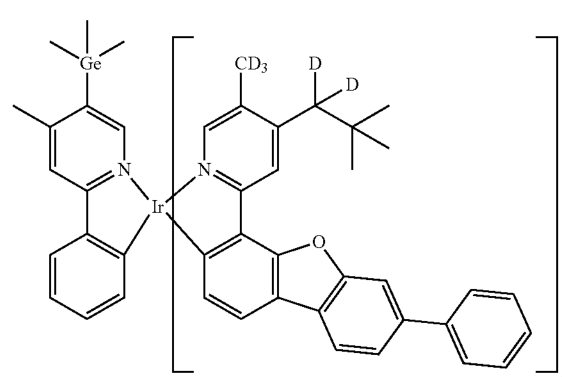

-continued
3778
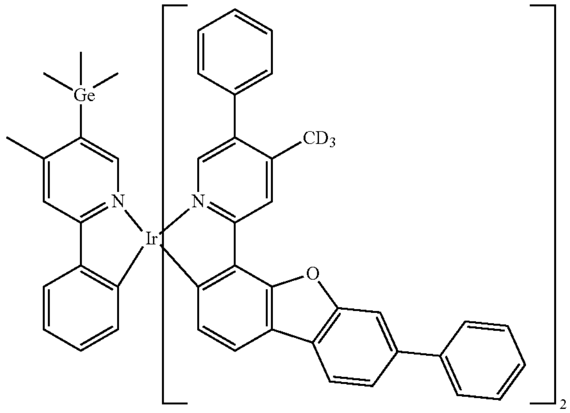
3779
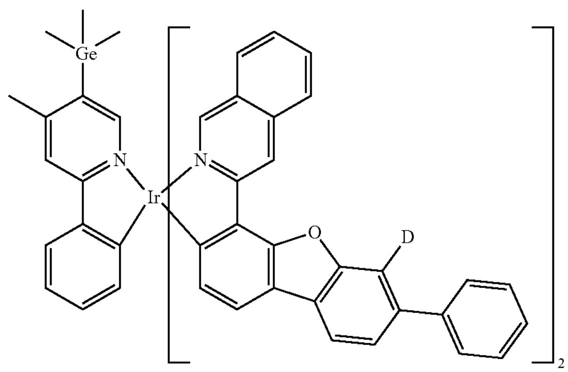
3780
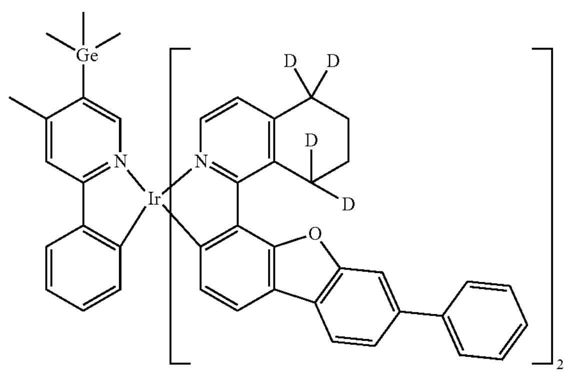
3781
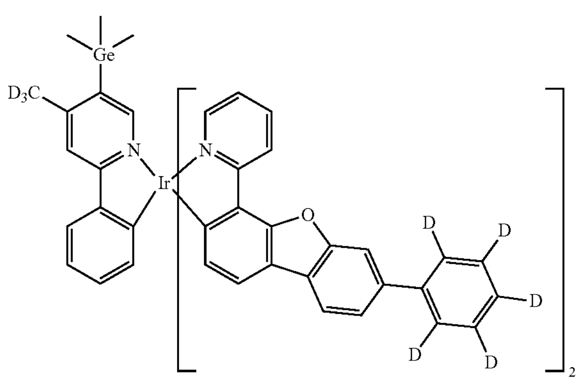
-continued
3782
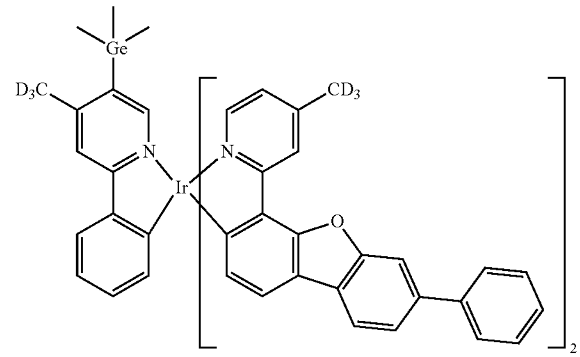
3783
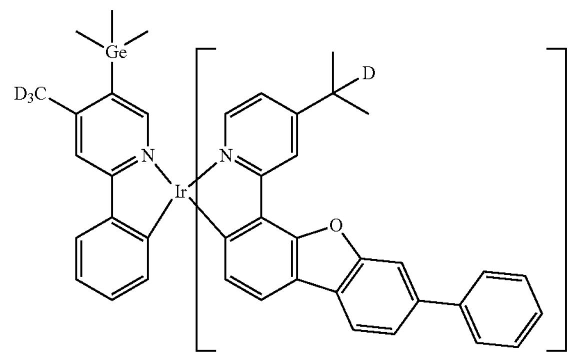
3784
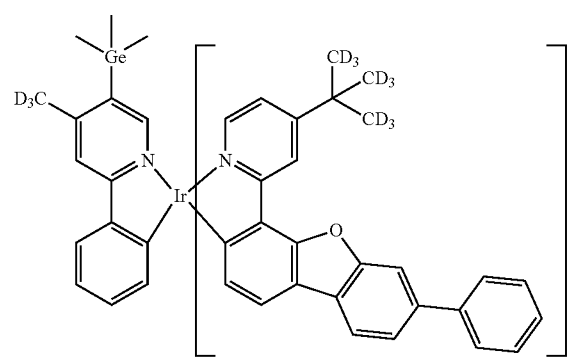
3785
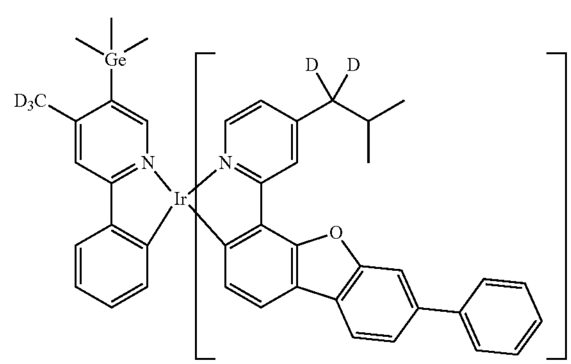

-continued
3786
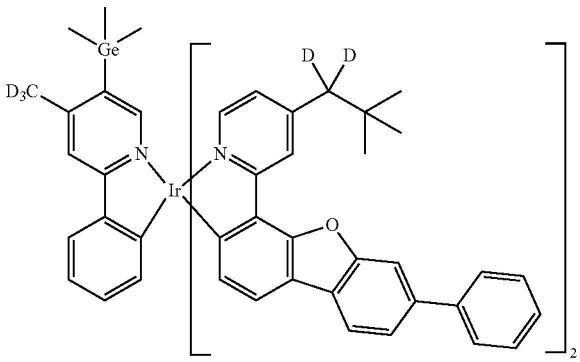
3787
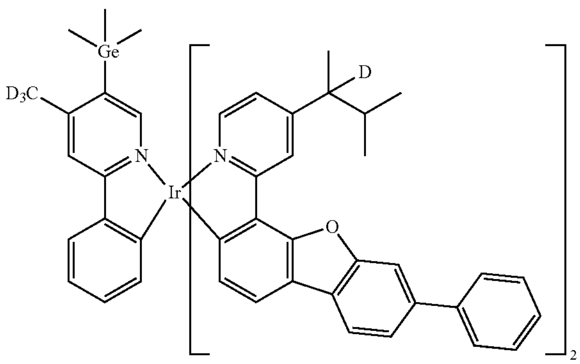
3788
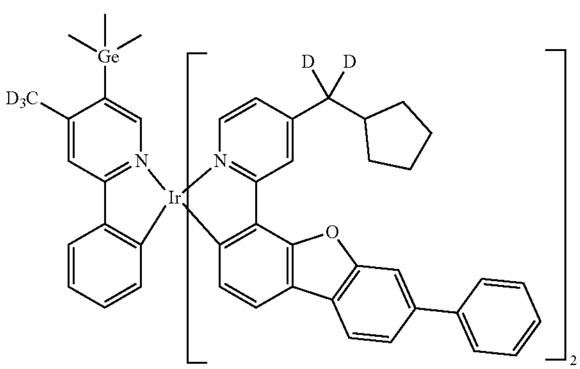
3789
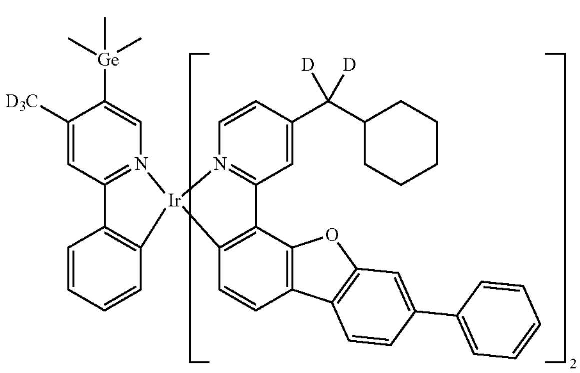
-continued
3790
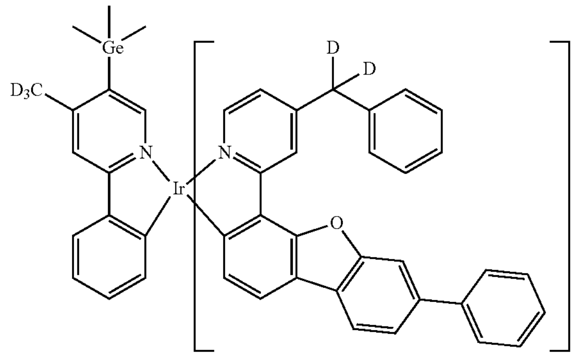
3791
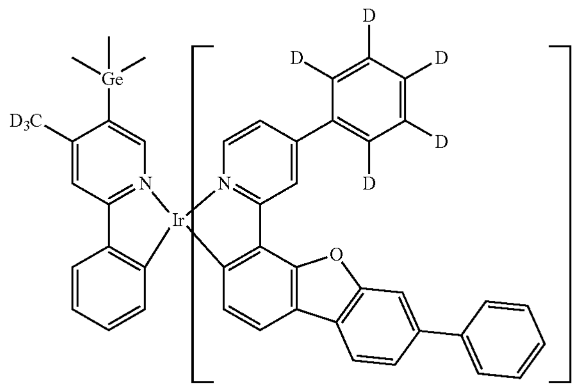
3792
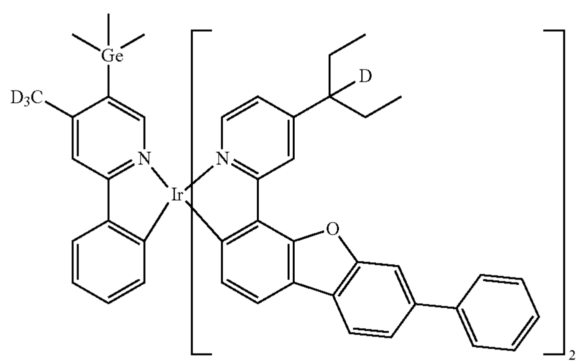
3793
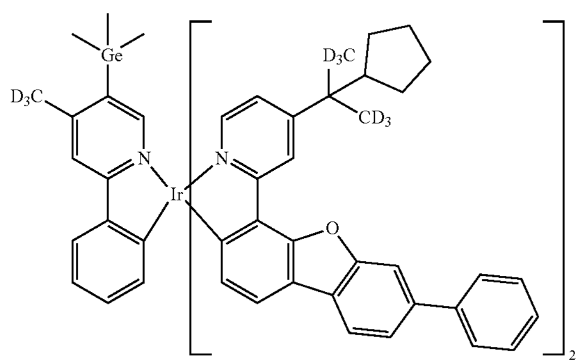

-continued
3794
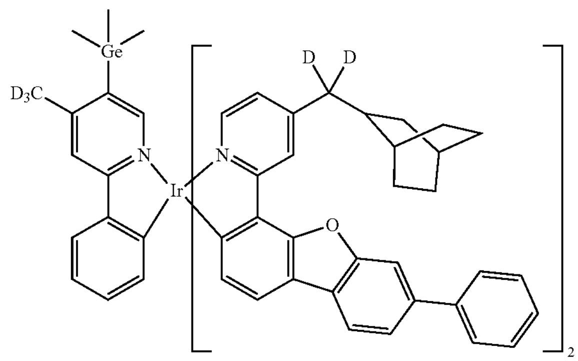
3795
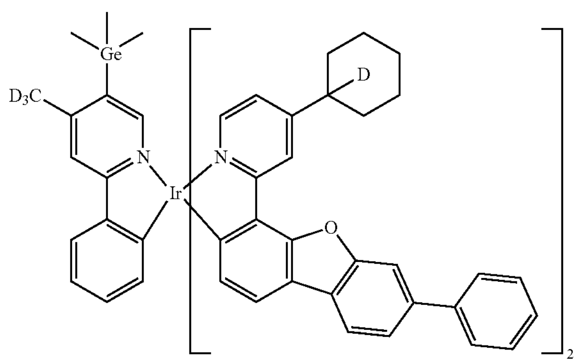
3796
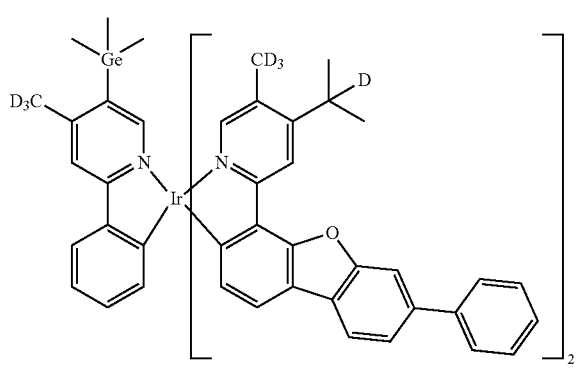
3797
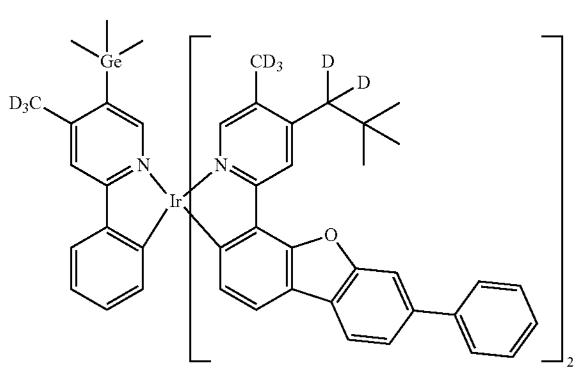
-continued
3798
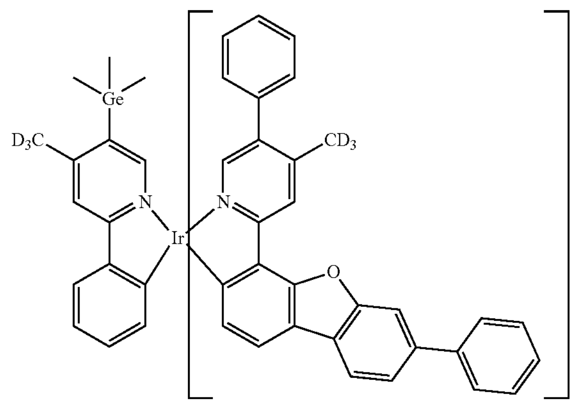
3799
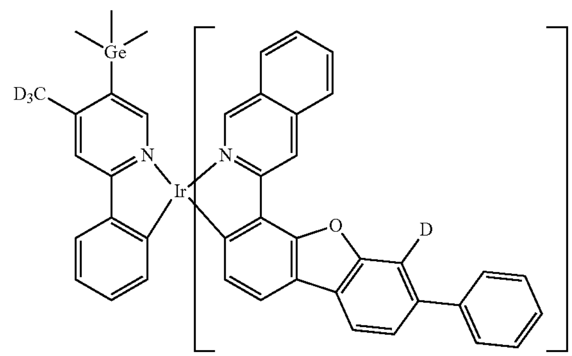
3800
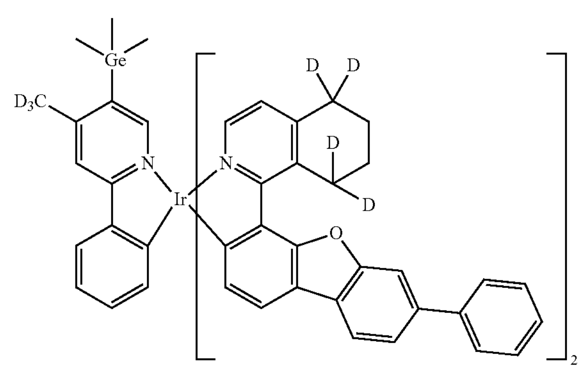
3801
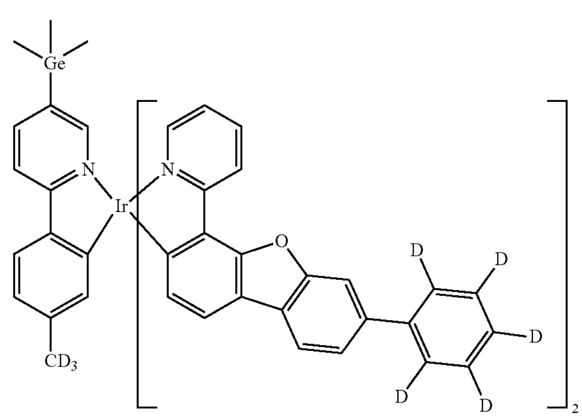

-continued
3802
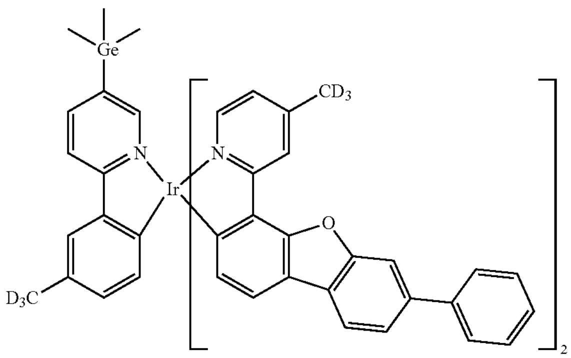
3803
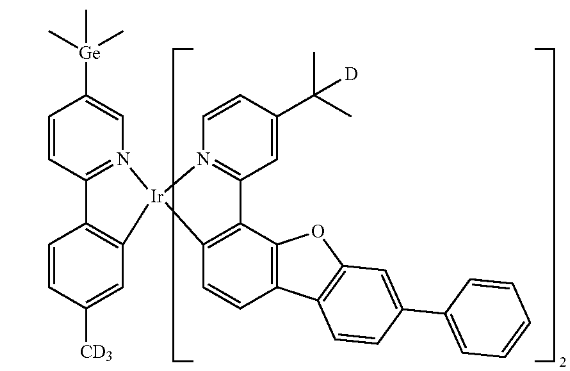
3804
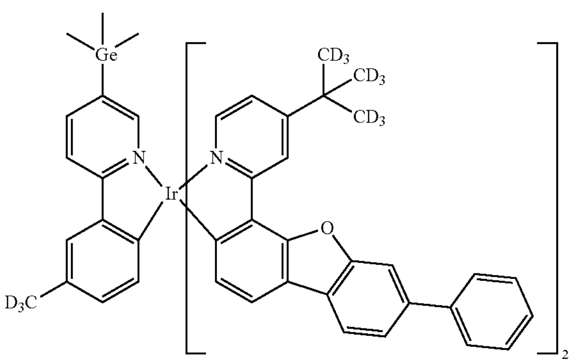
3805
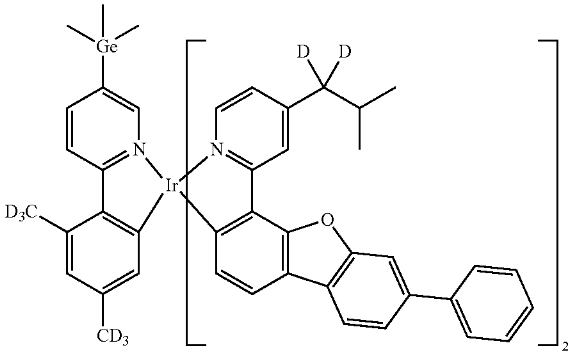
-continued
3806
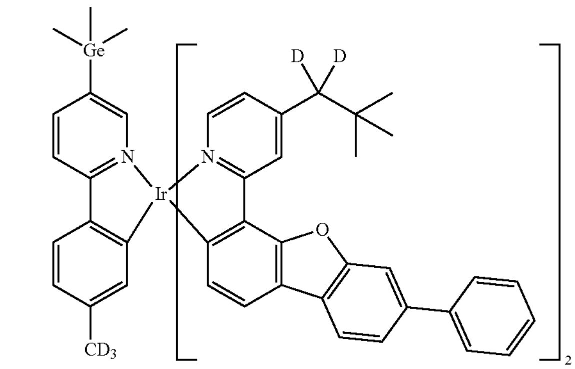
3807
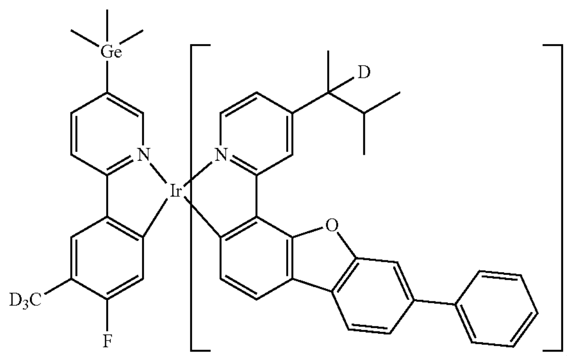
3808
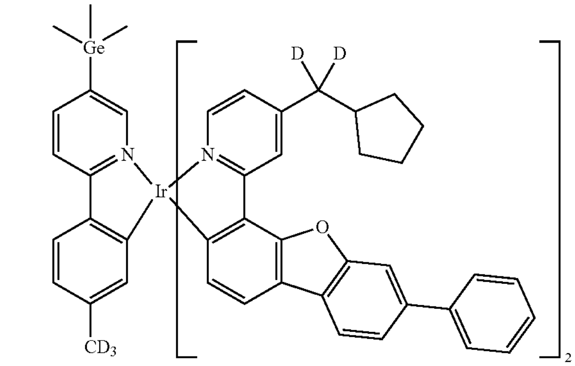
3809
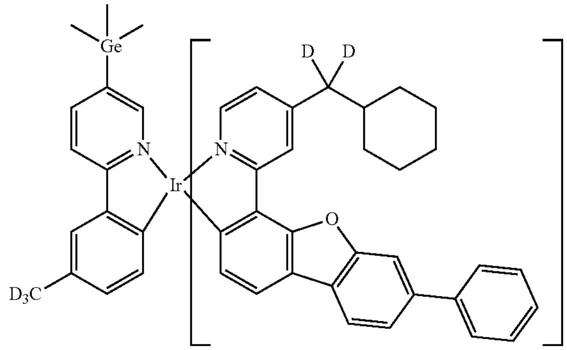

-continued
3810
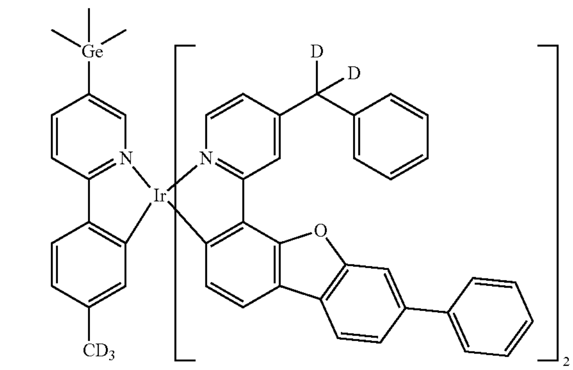
3811
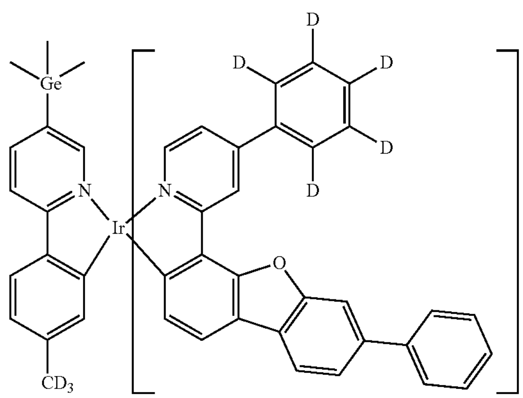
3812
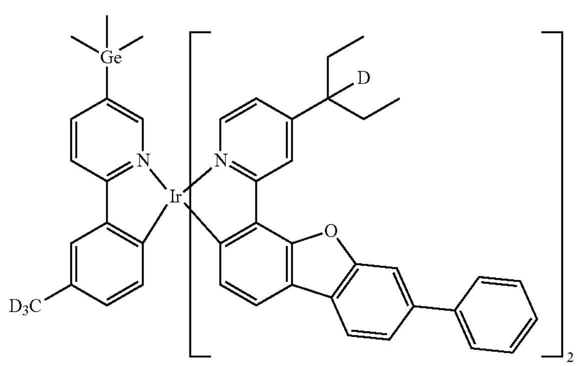
3813
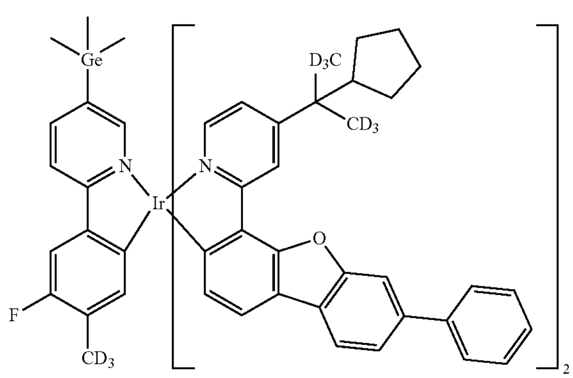
-continued
3814
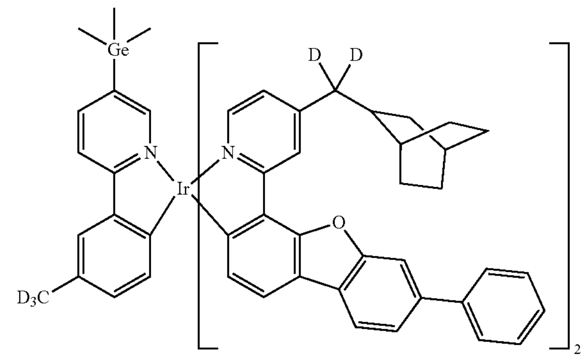
3815
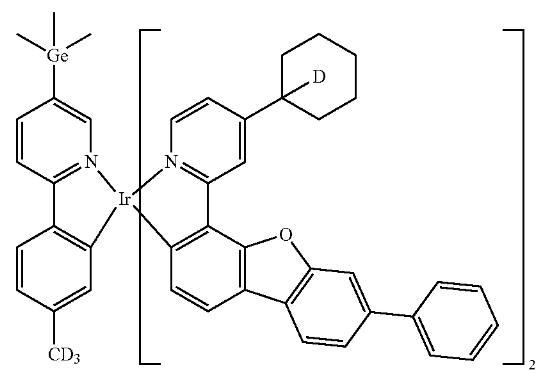
3816
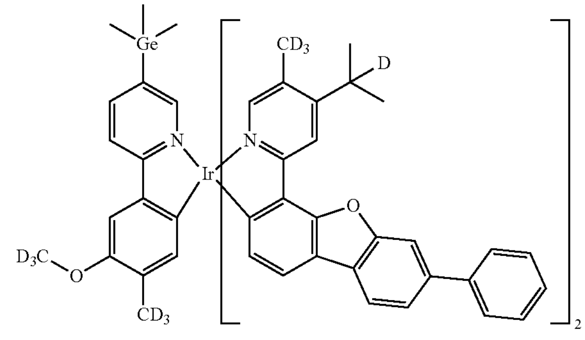
3817
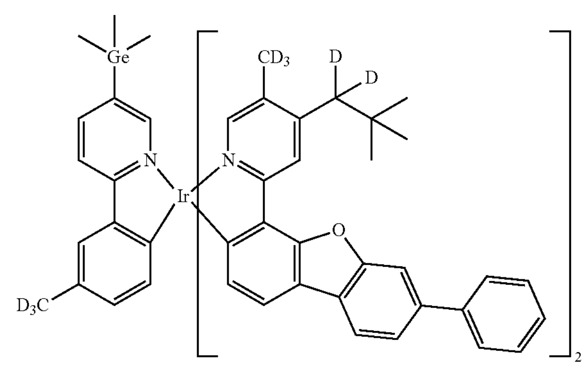

-continued
3818
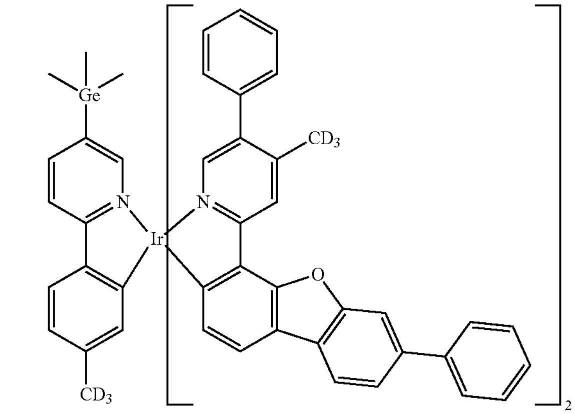
3819
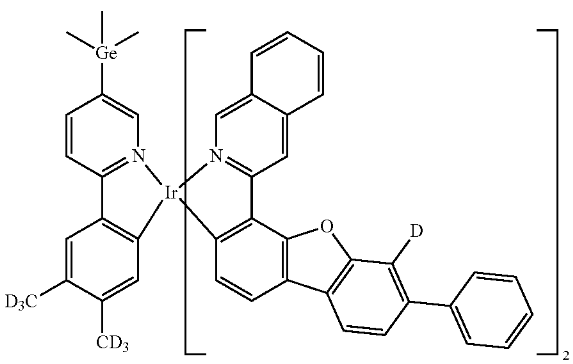
3820
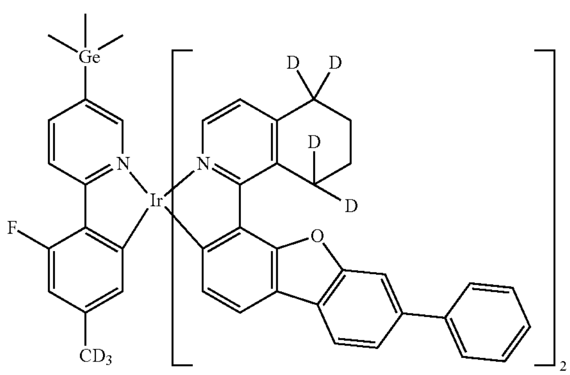
3821
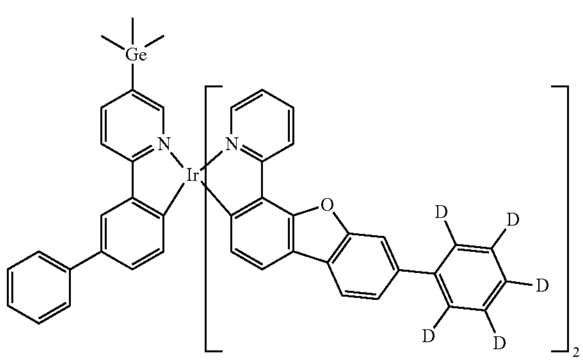
-continued
3822
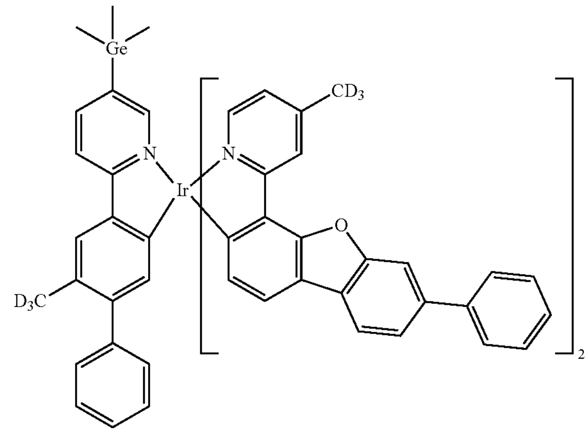
3823
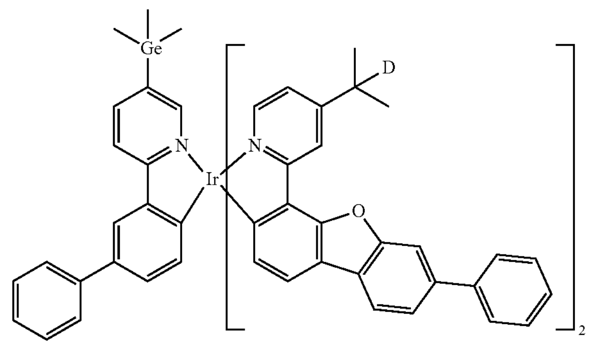
3824
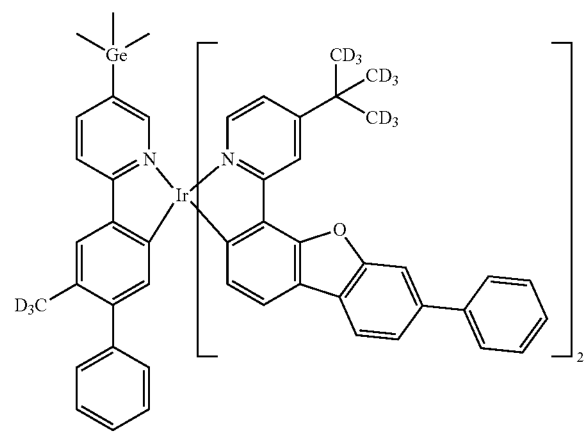
3825
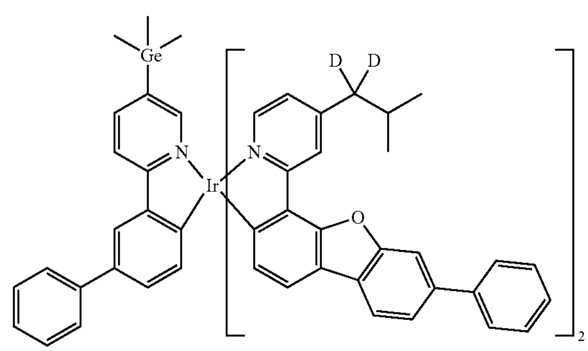

-continued
3826
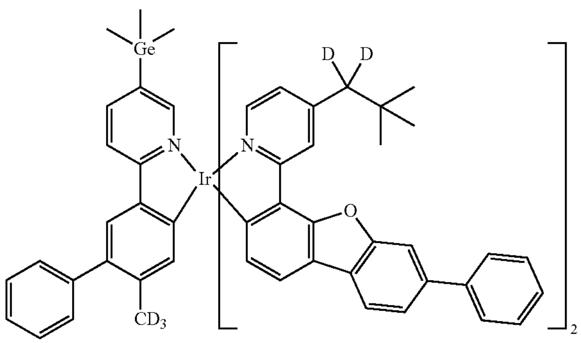
3827
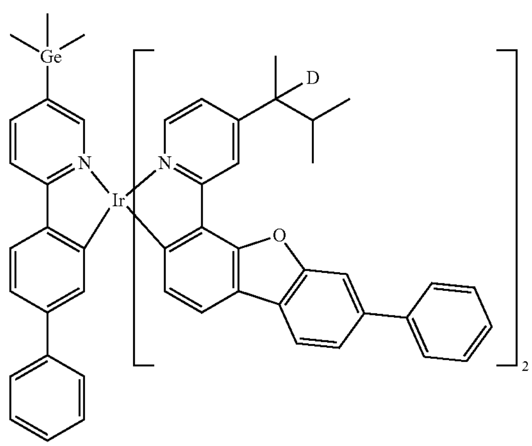
3828
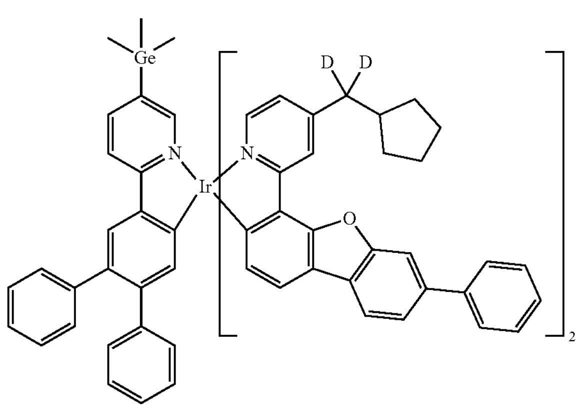
-continued
3829
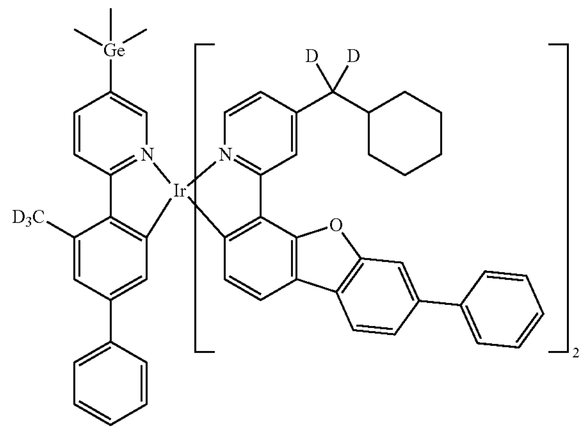
3830
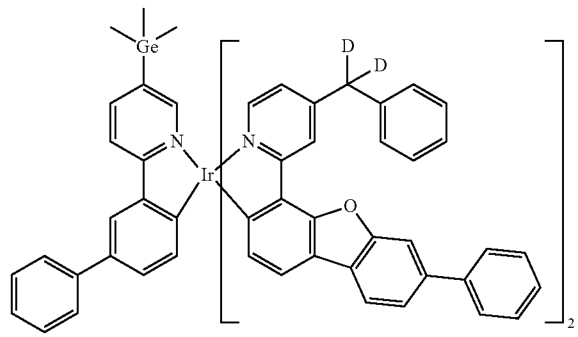
3831
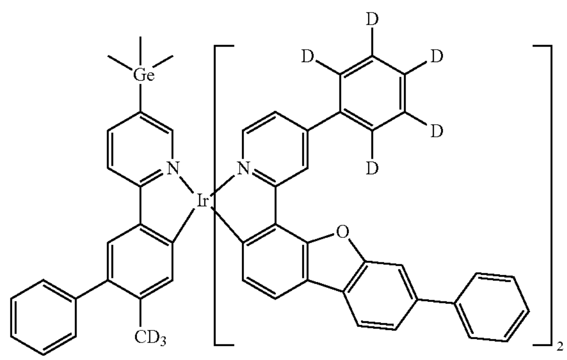
3832
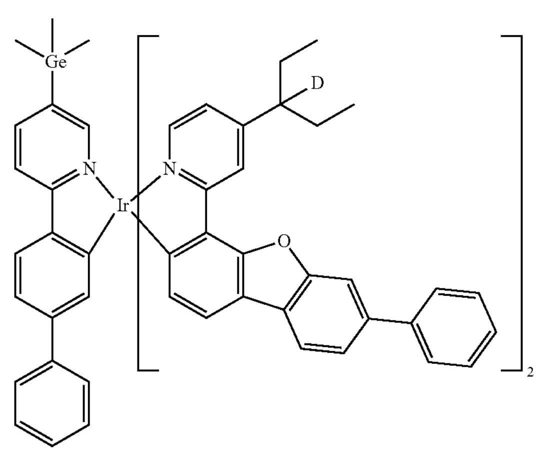

-continued
3833
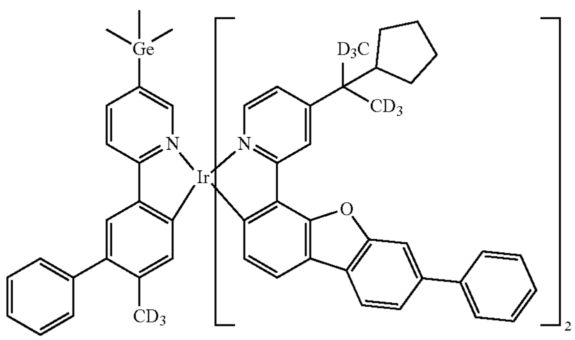
3834
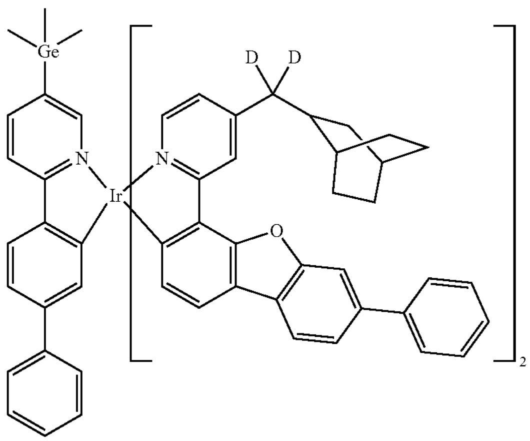
3835
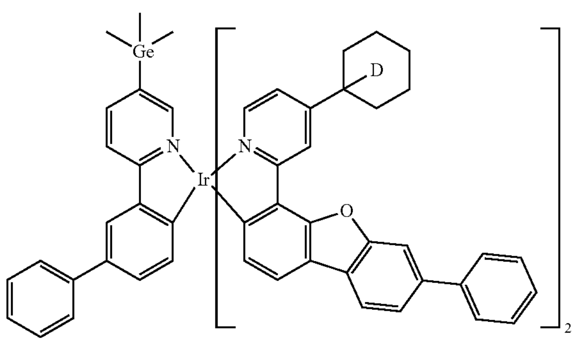
3836
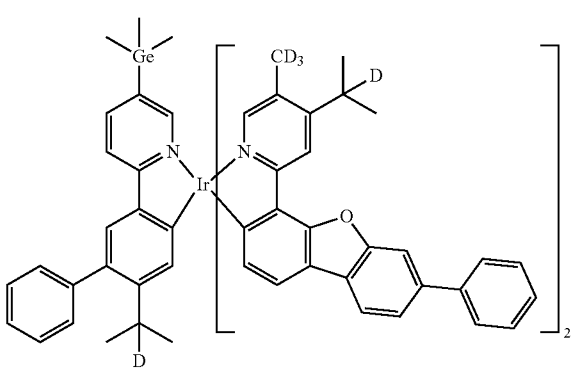
-continued
3837
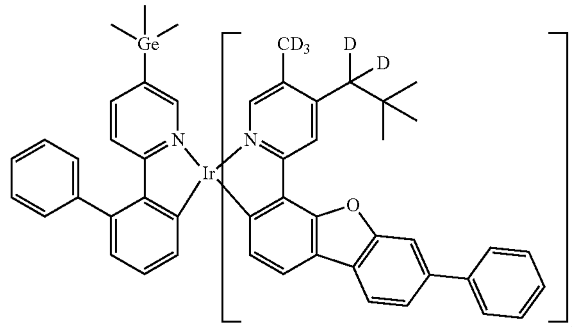
3838
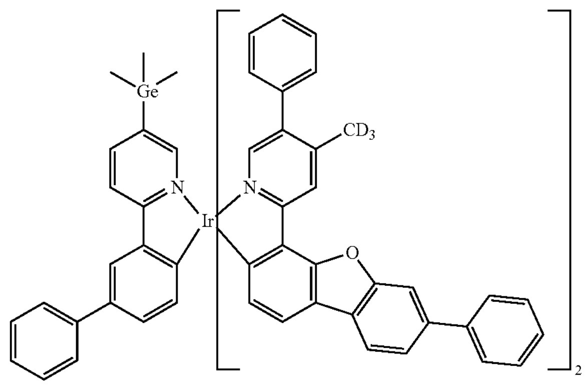
3839
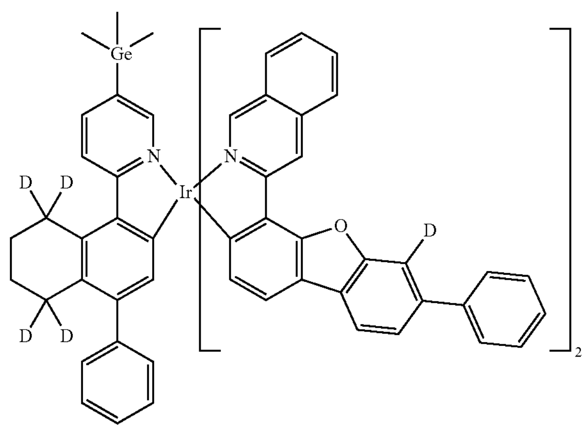
3840
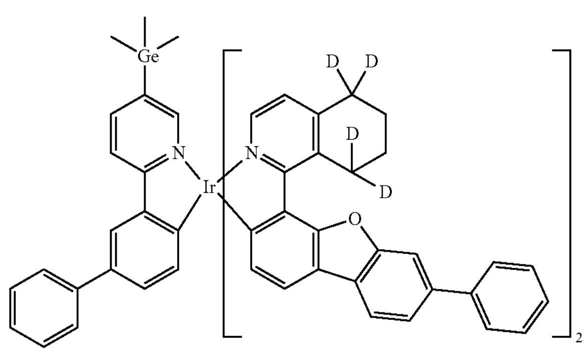

-continued
3841
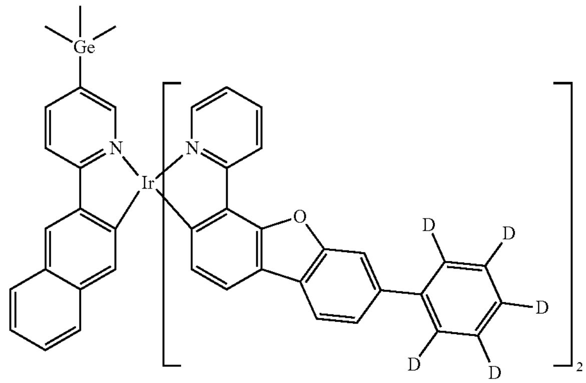
3842
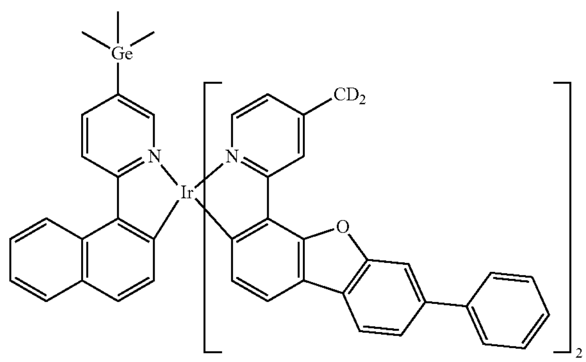
3843
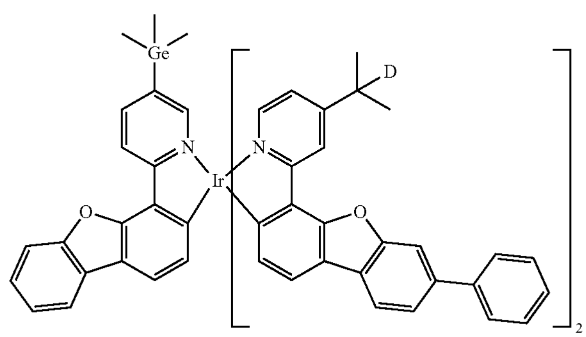
3844
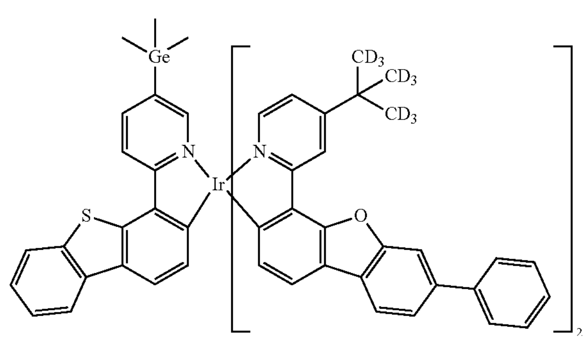
-continued
3845
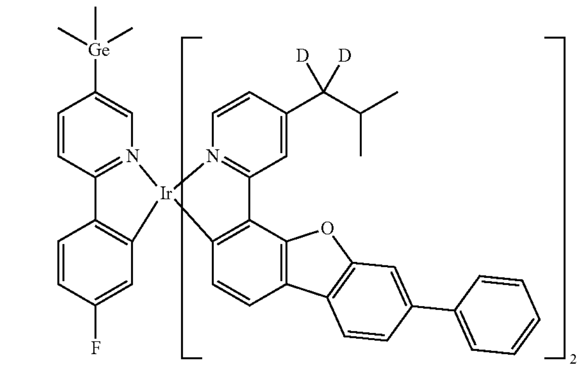
3846
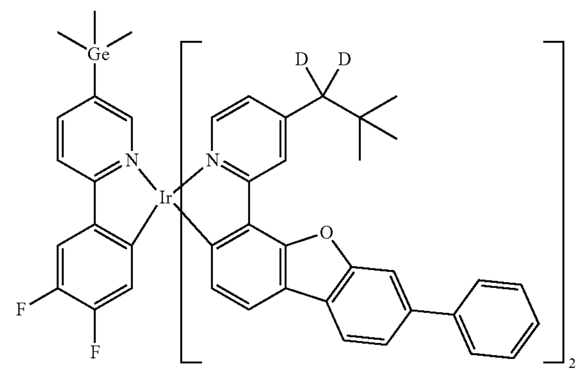
3847
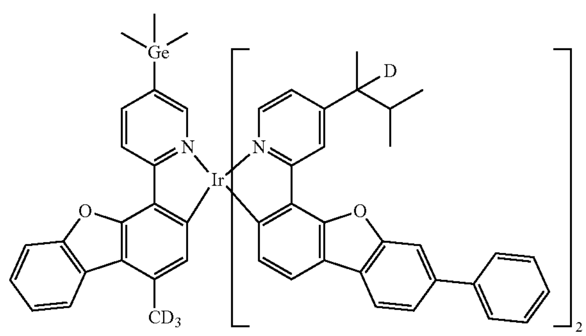
3848
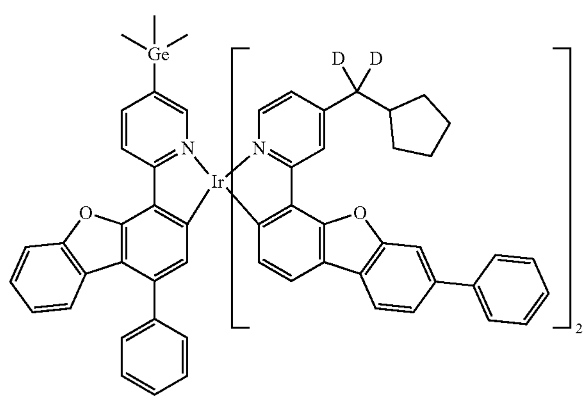

-continued
3849
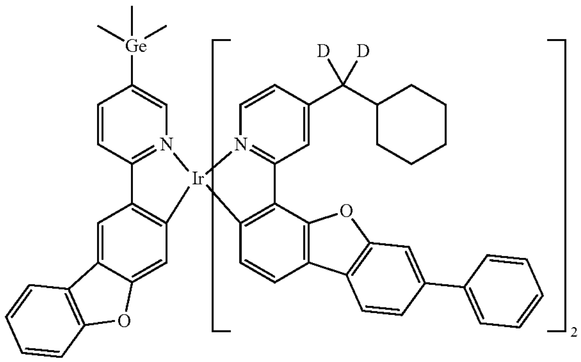
3850
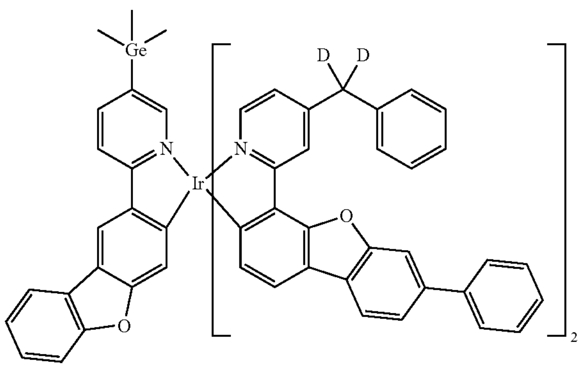
3851
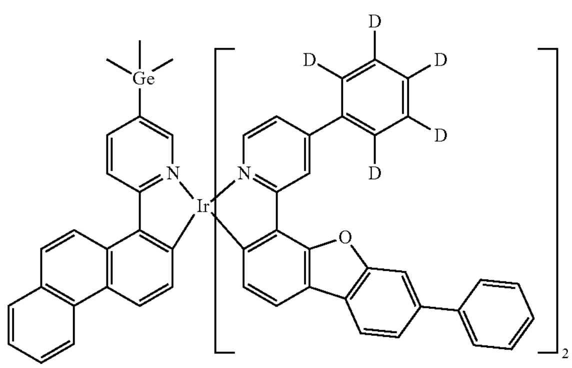
3852
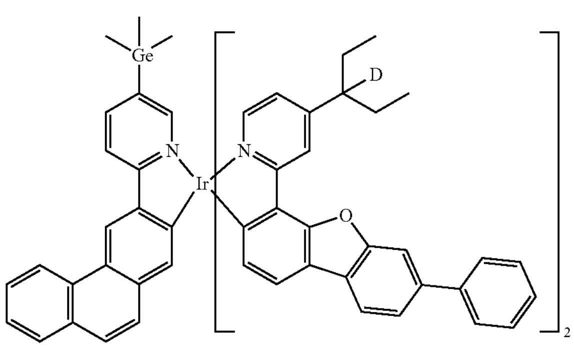
-continued
3853
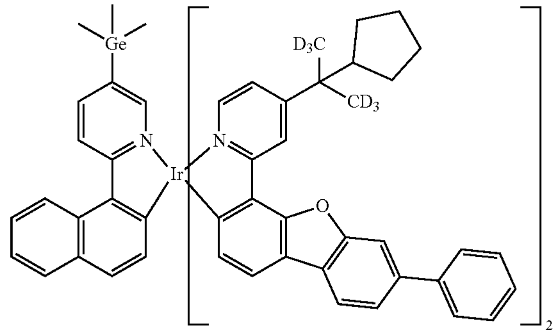
3854
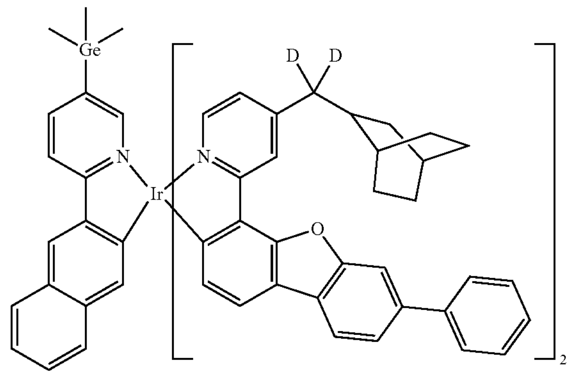
3855
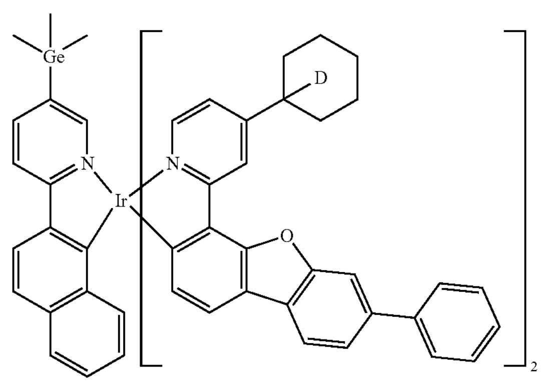
3856
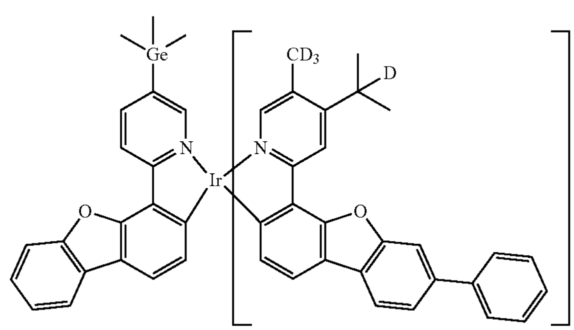

3857
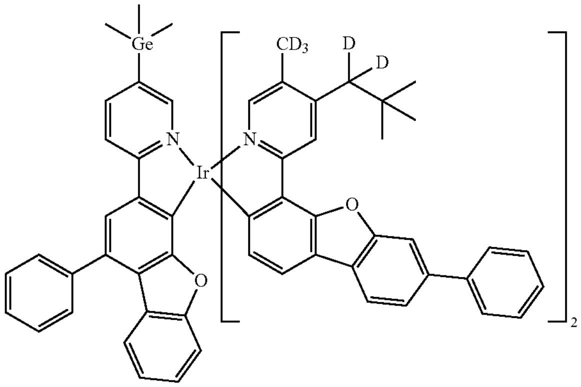
3858
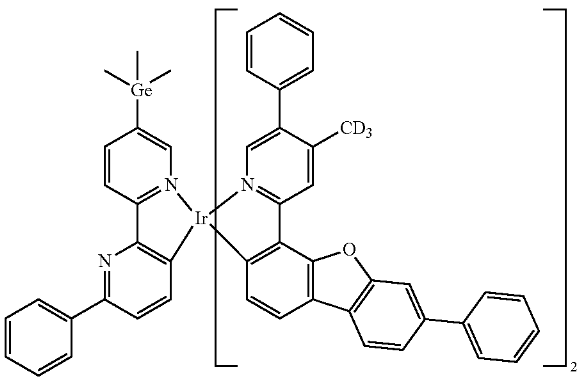
3859
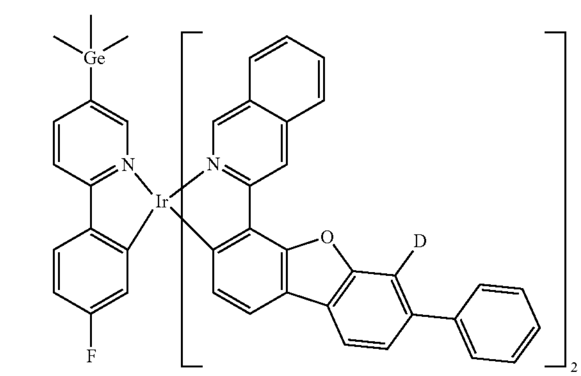
3860
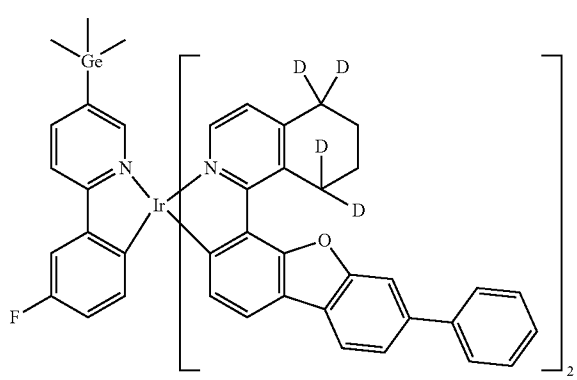
3861
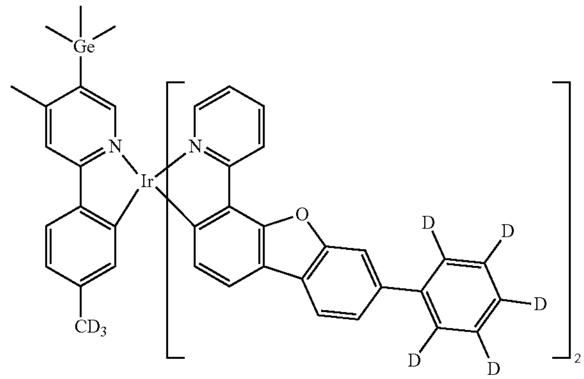
3862
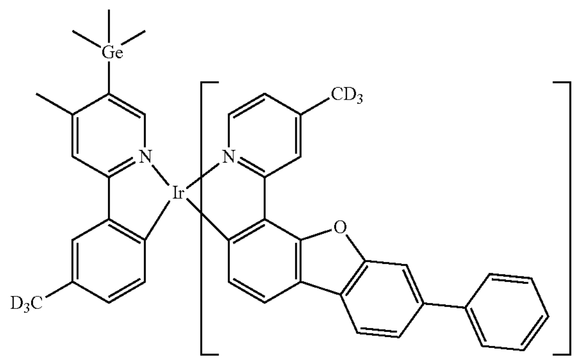
3863
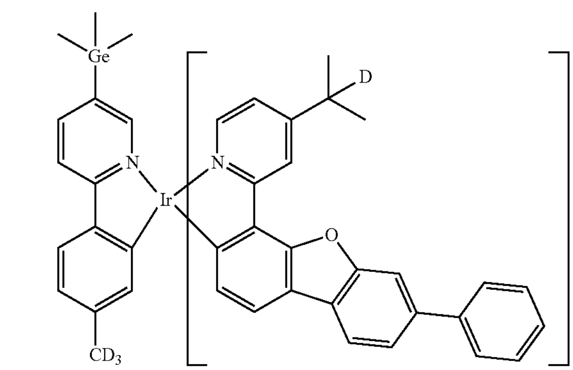
3864
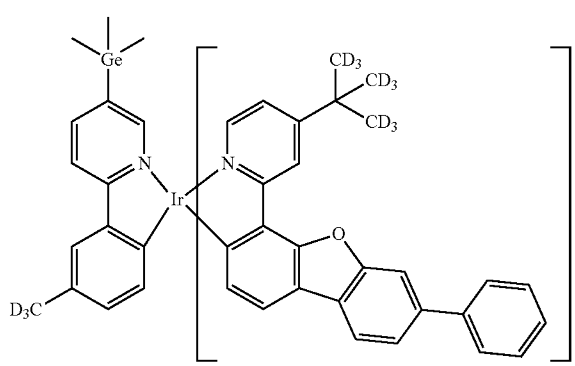

-continued
3865
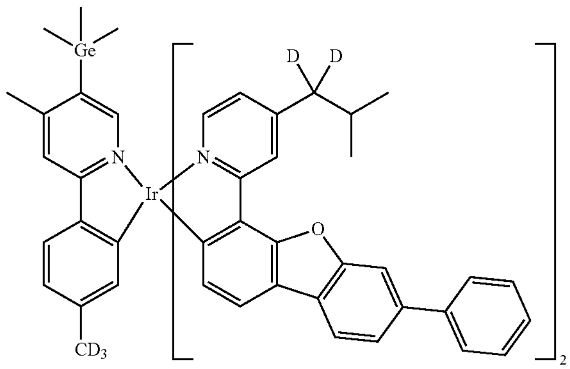
3866
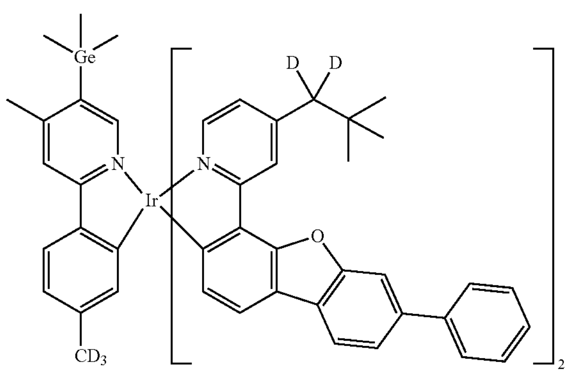
3867
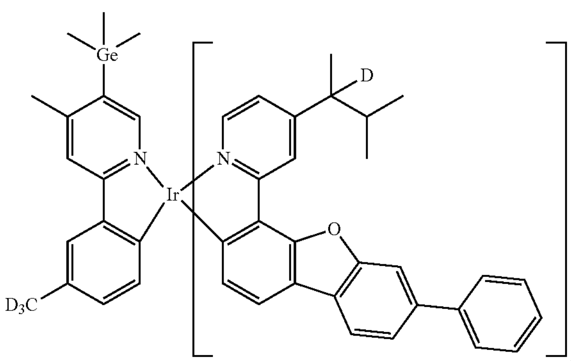
3868
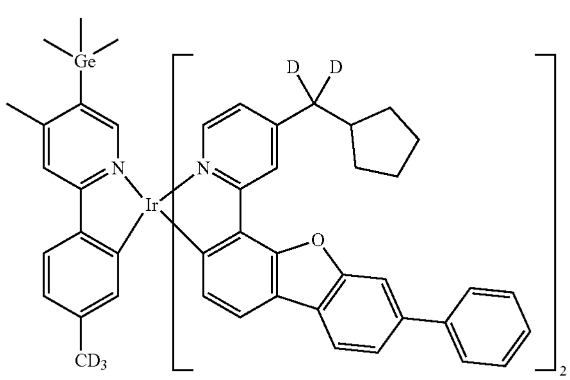
-continued
3869
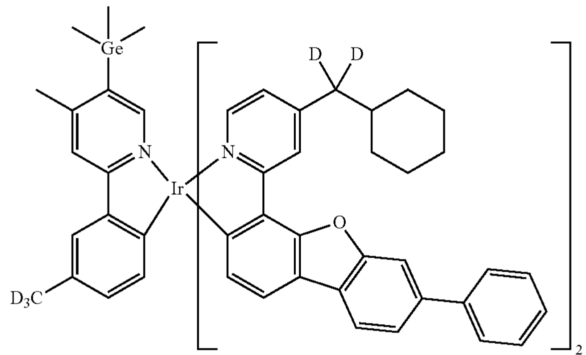
3870
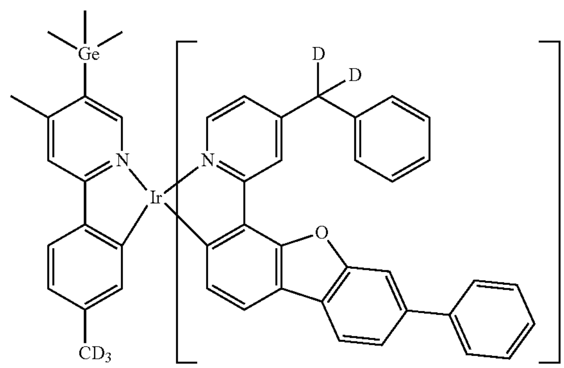
3871
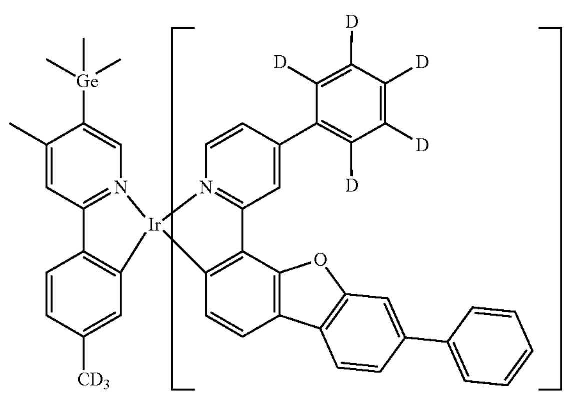
3872
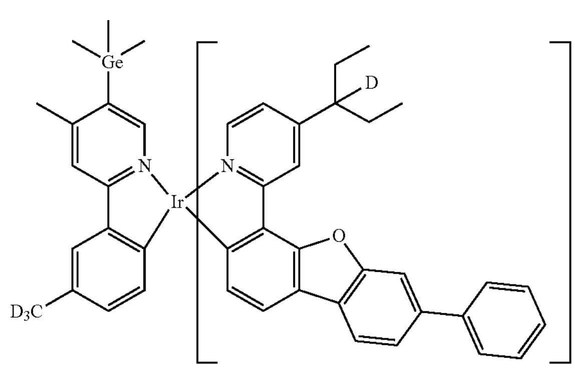

-continued
3873
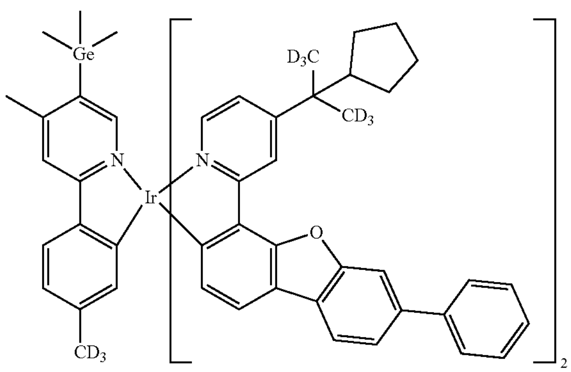
3874
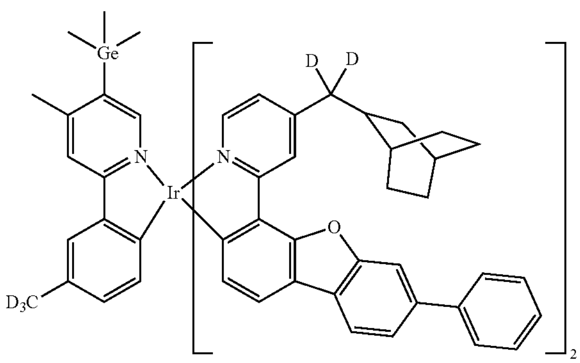
3875
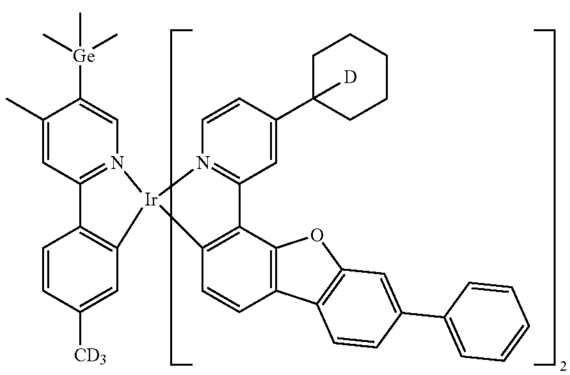
3876
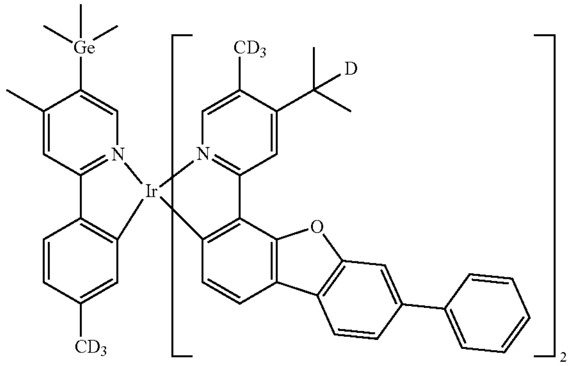
-continued
3877
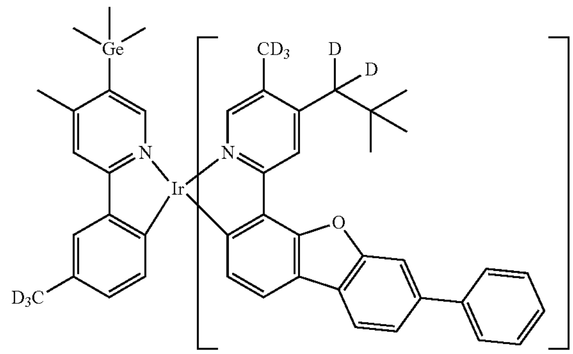
3878
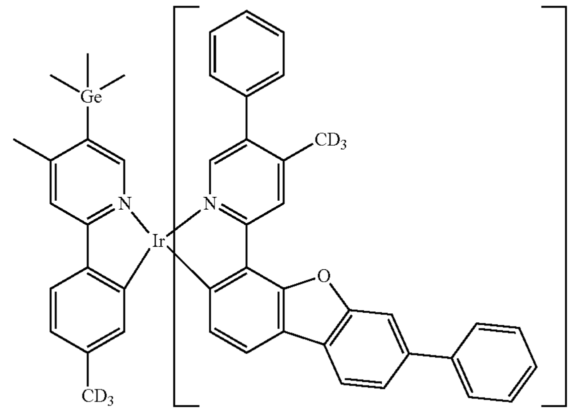
3879
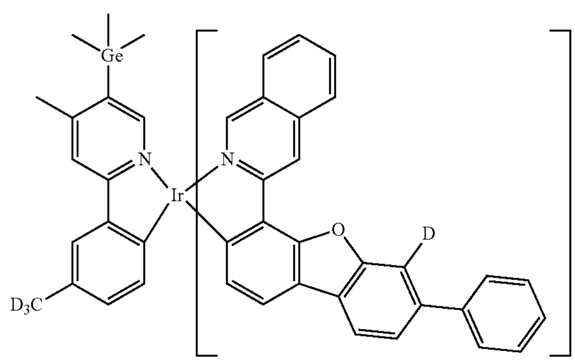
3880
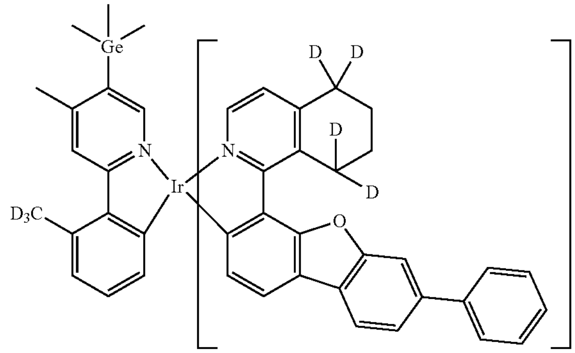

-continued
3881
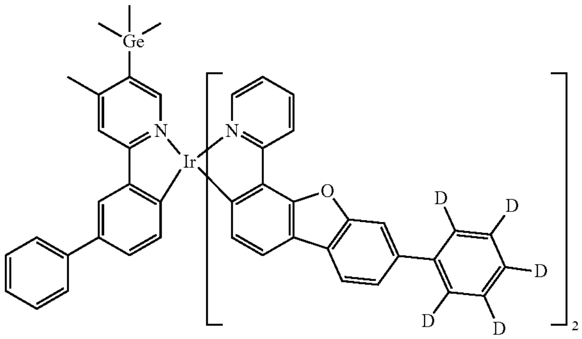
3882
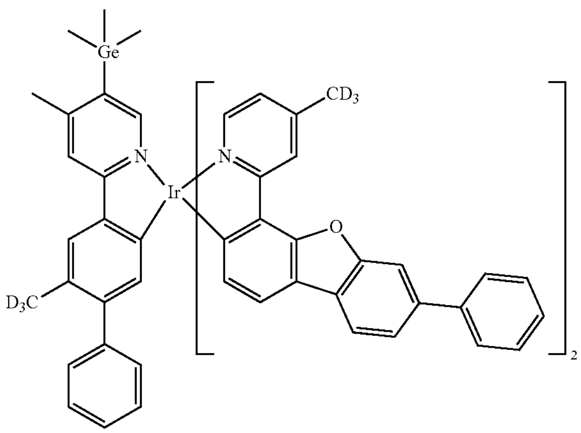
3883
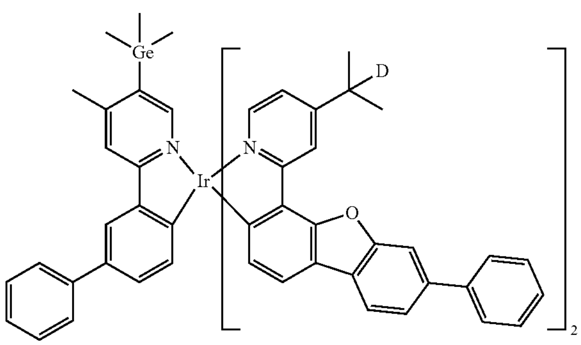
3884
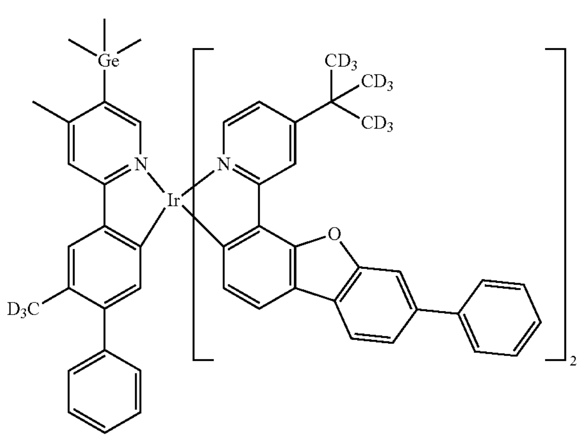
-continued
3885
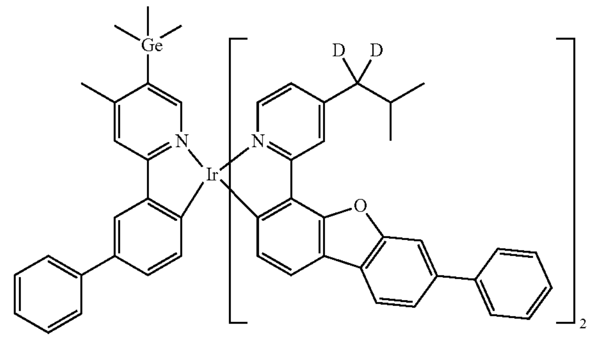
3886
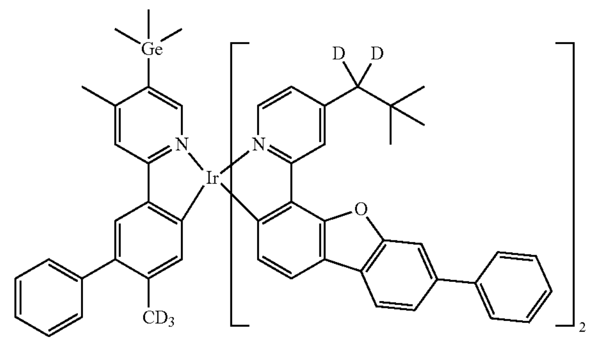
3887
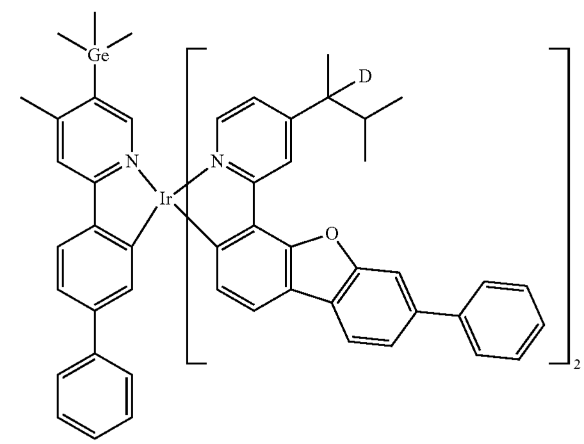
3888
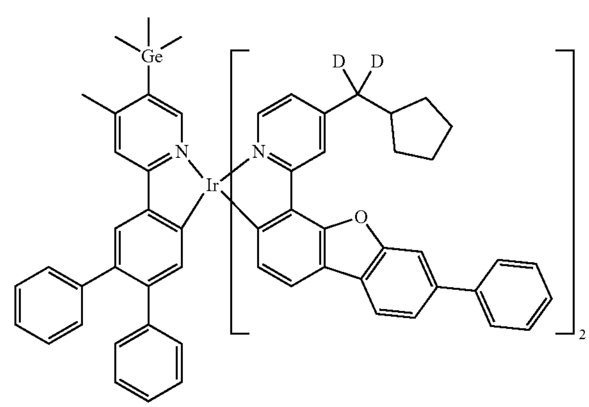

-continued
3889
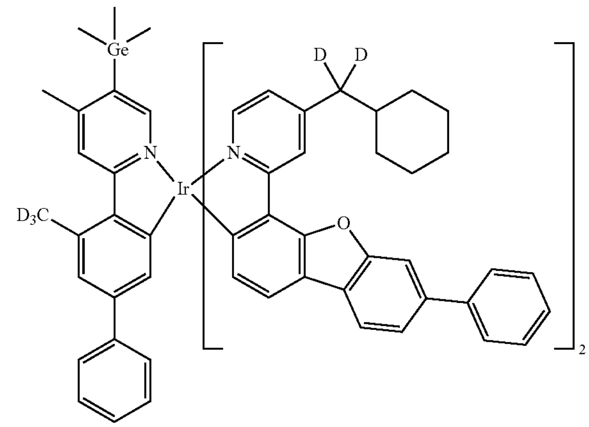
3890
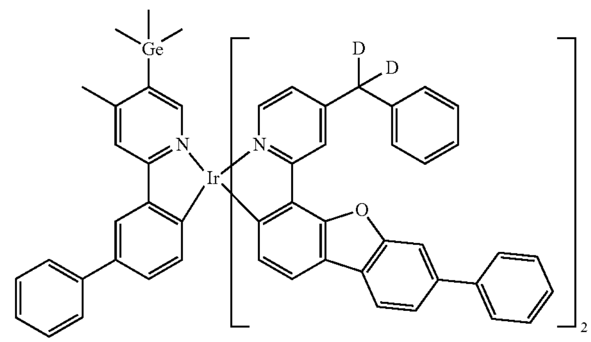
3891
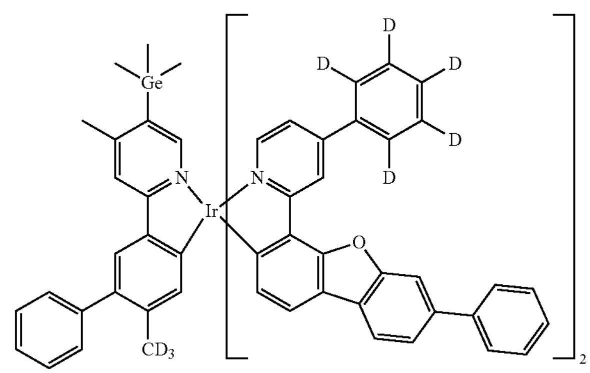
3892
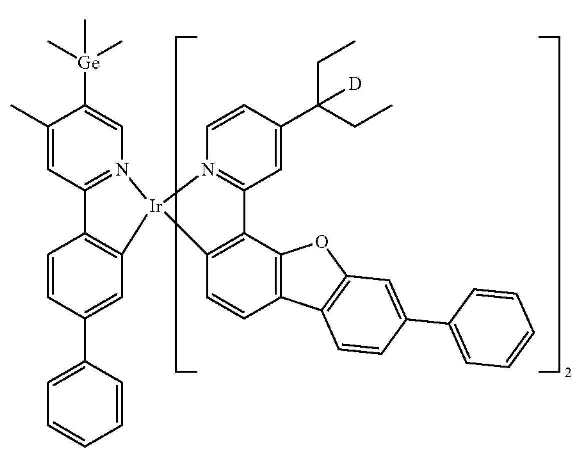
-continued
3893
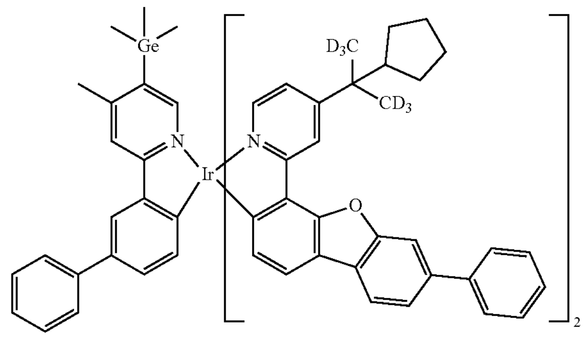
3894
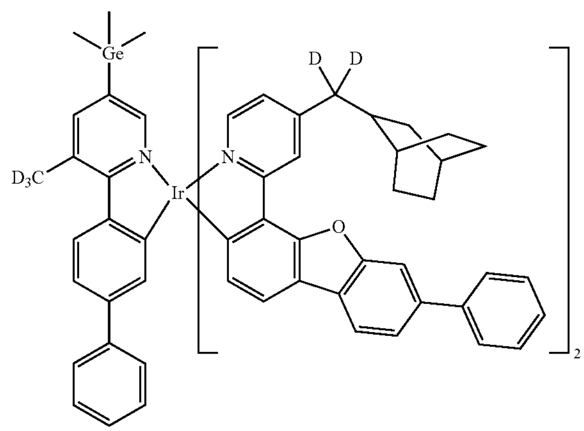
3895
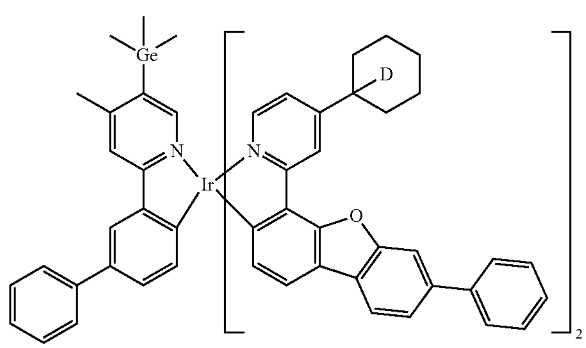
3896
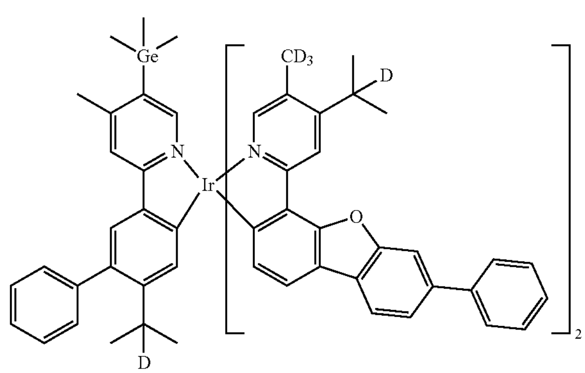

-continued
3897
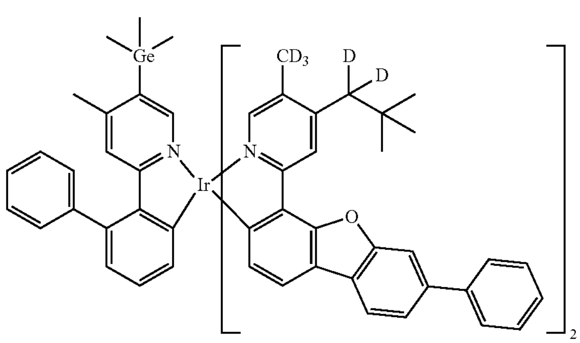
3898
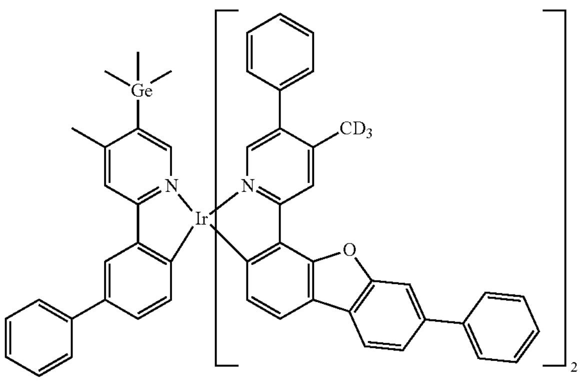
3899
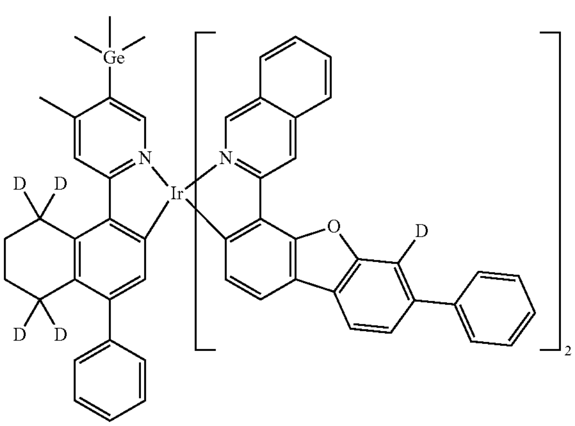
3900
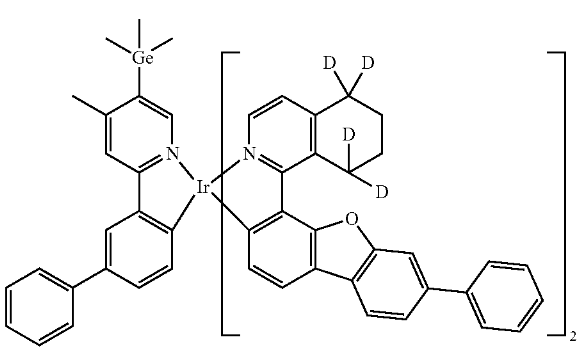
-continued
3901
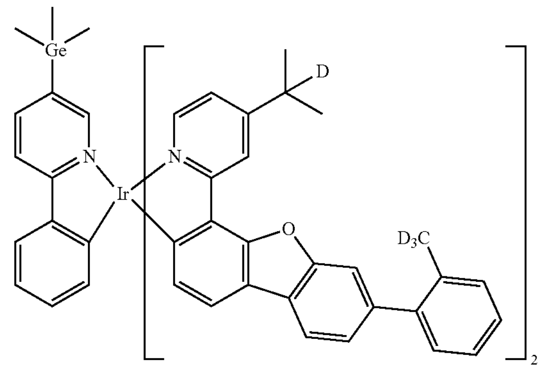
3902
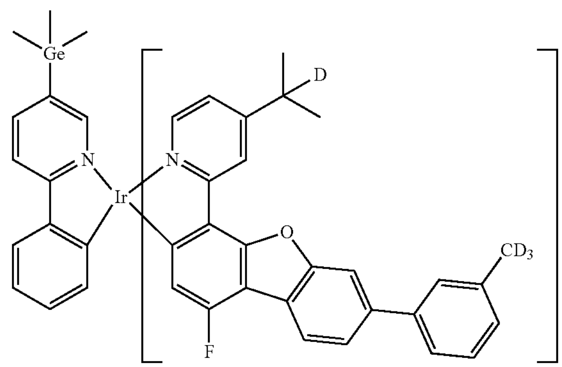
3903
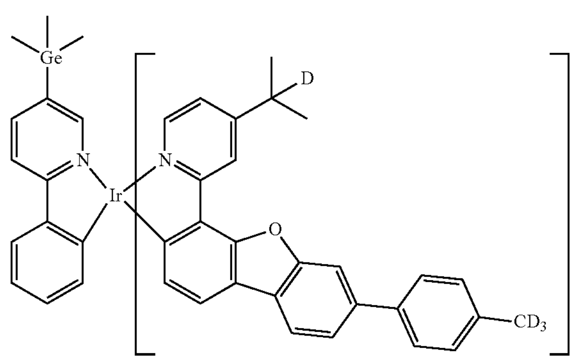
3904
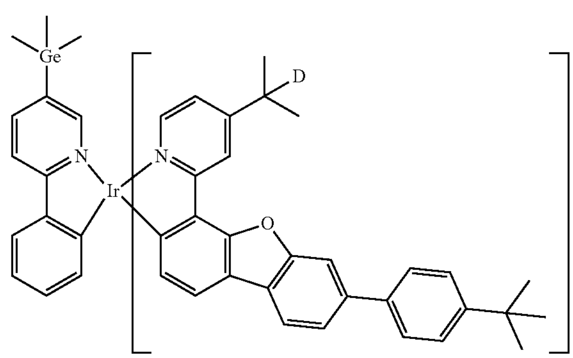

-continued
3905
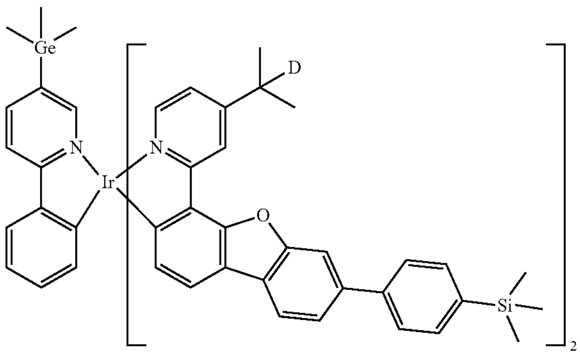
3906
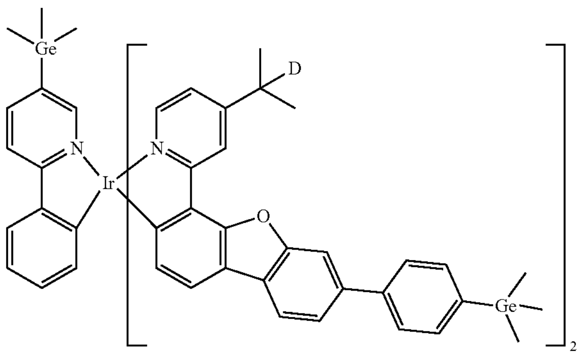
3907
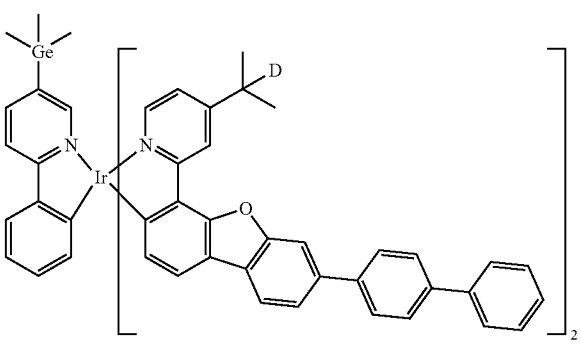
3908
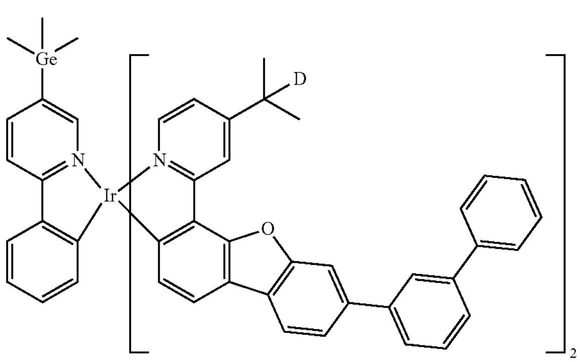
-continued
3909
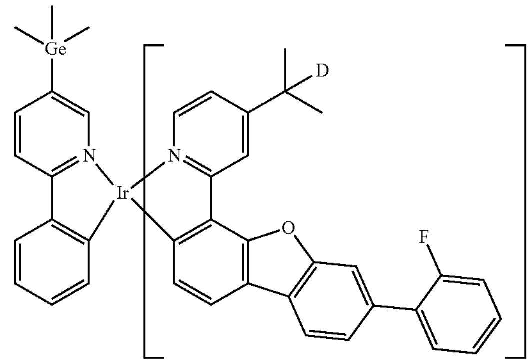
3910
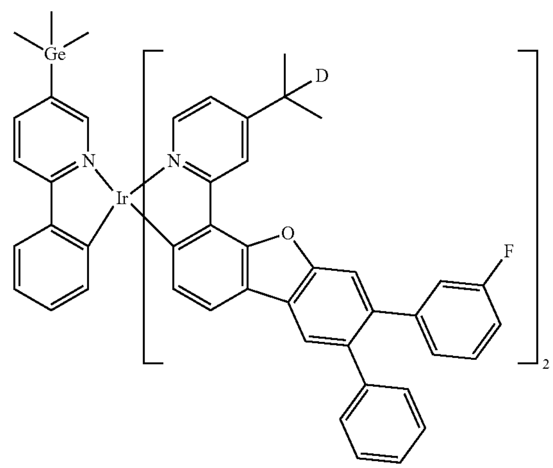
3911
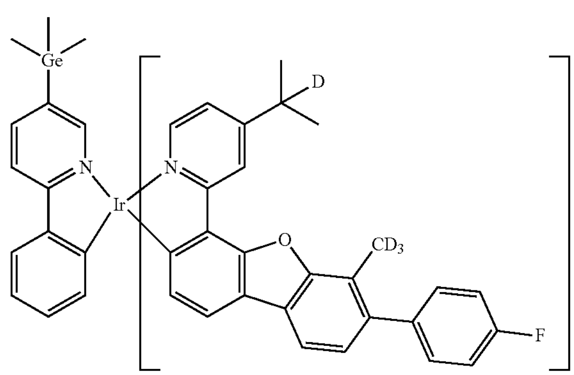

3912
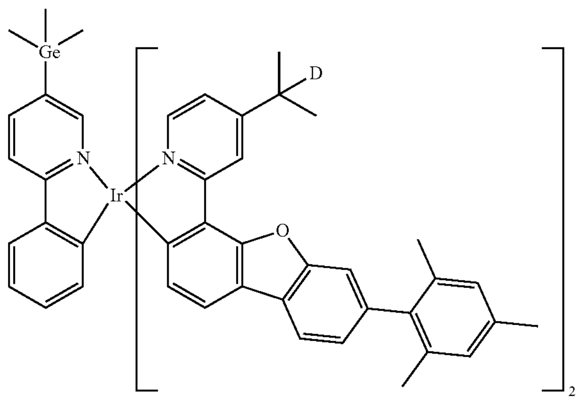
3913
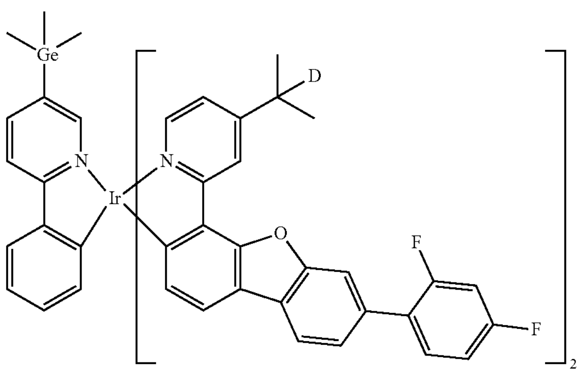
3914
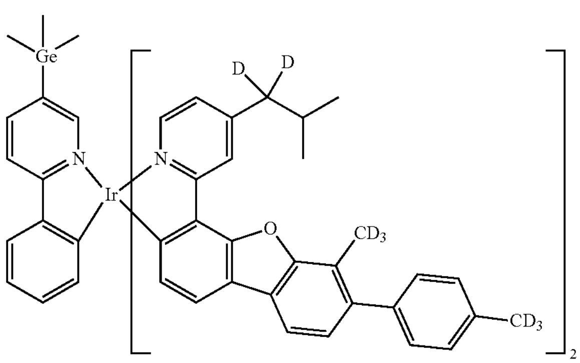
3915
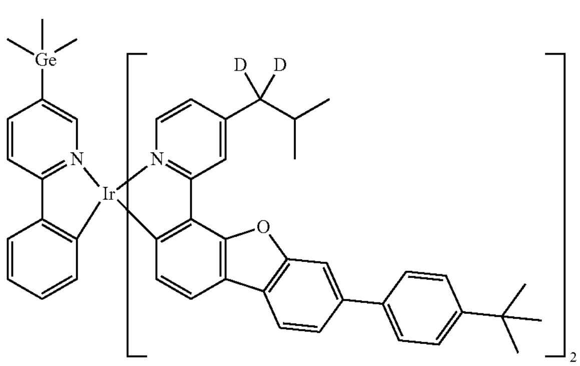
3916
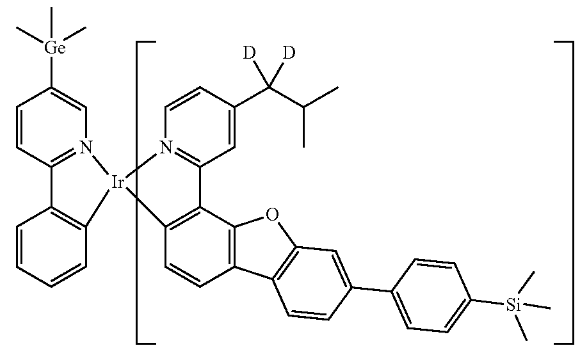
3917
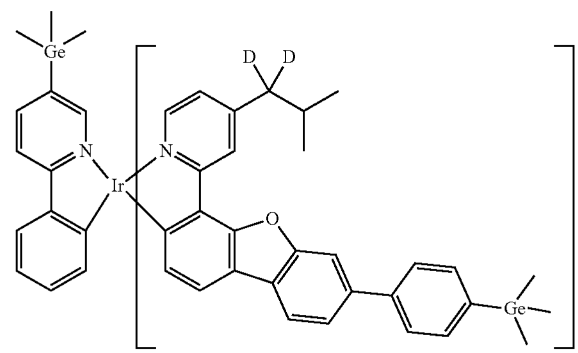
3918
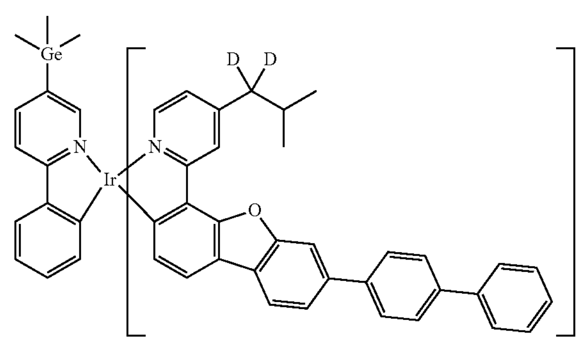
3919
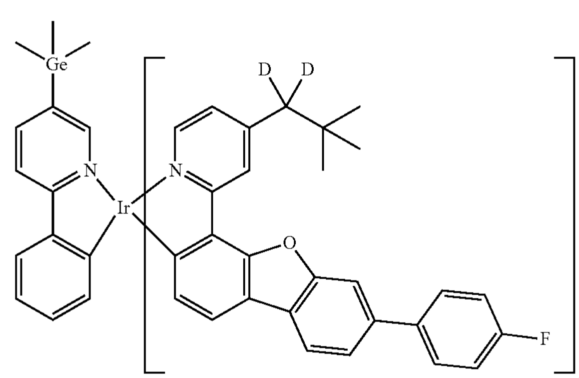

-continued
3920
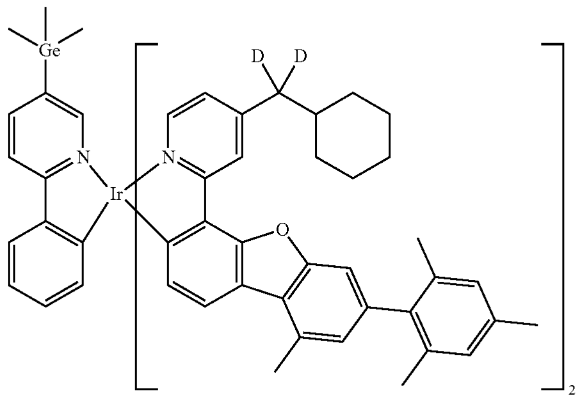
3921
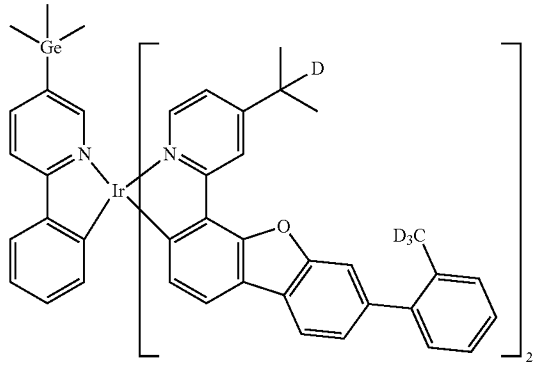
3922
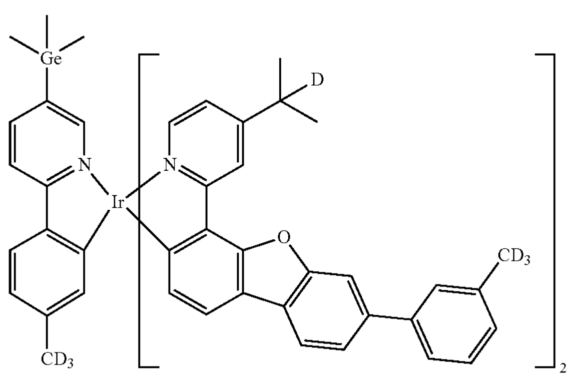
3923
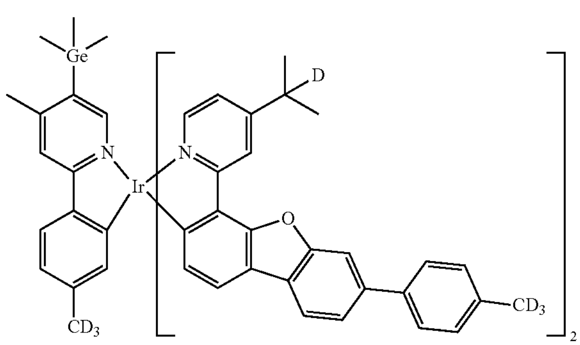
-continued
3924
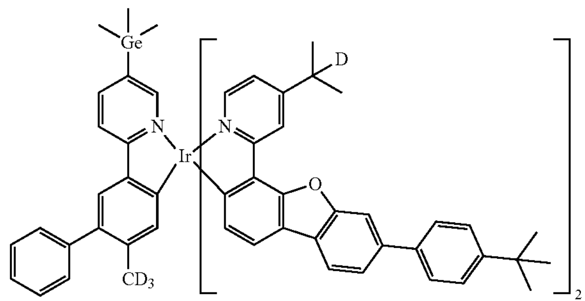
3925
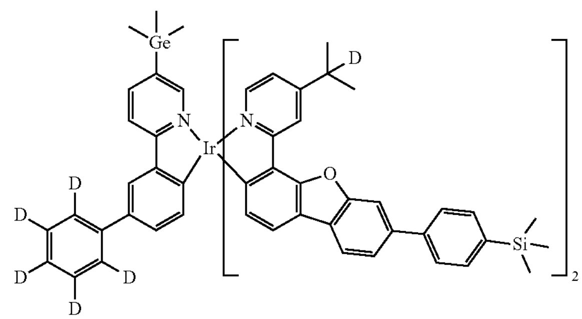
3926
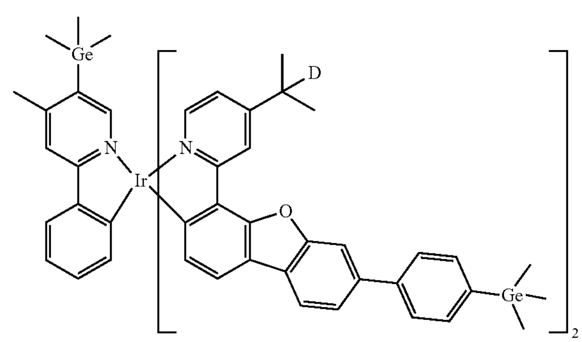
3927
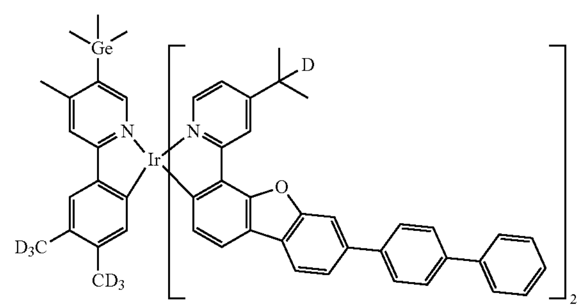

3928
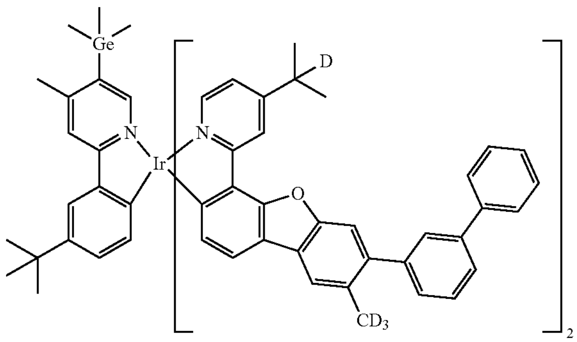
3929
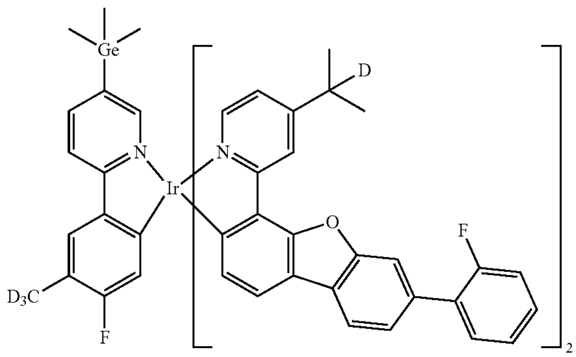
3930
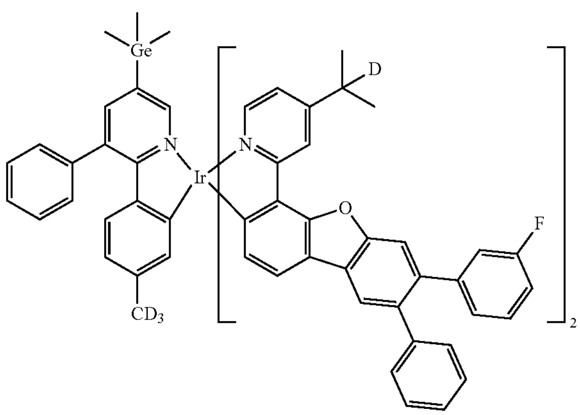
3931
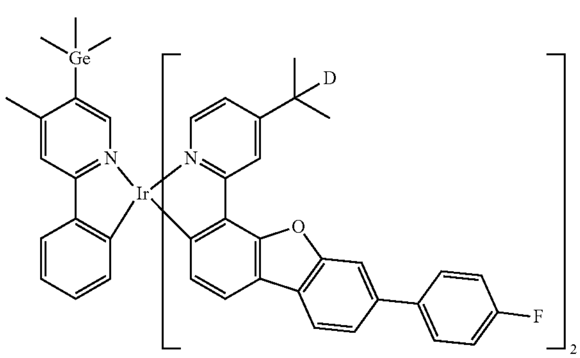
3932
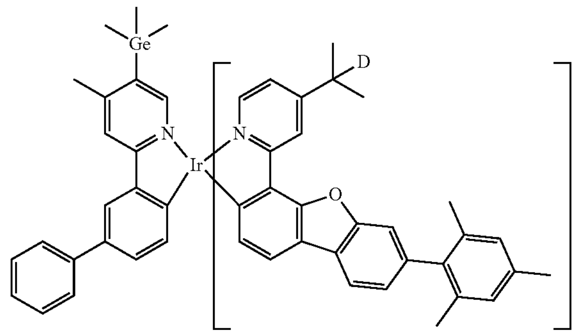
3933
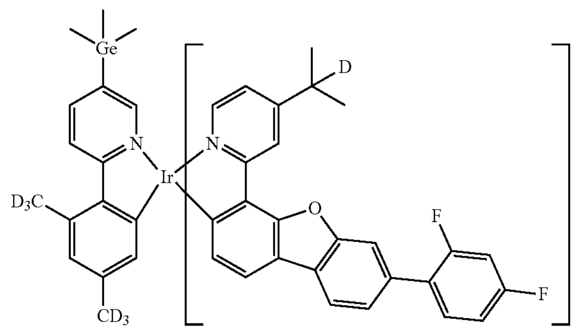
3934
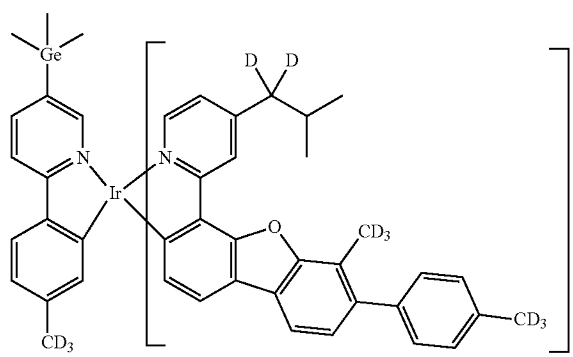
3935
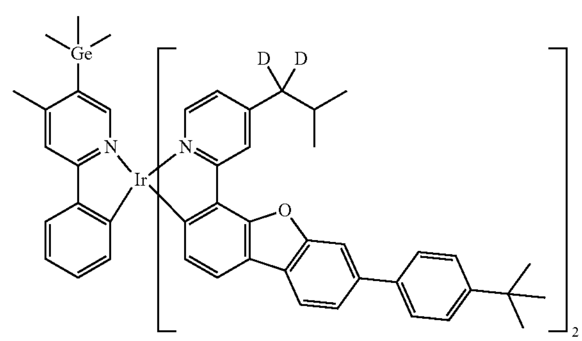

3936
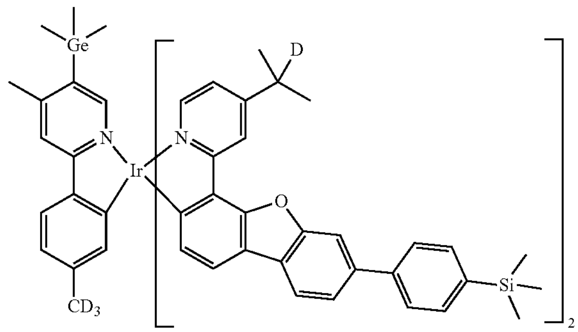
3937
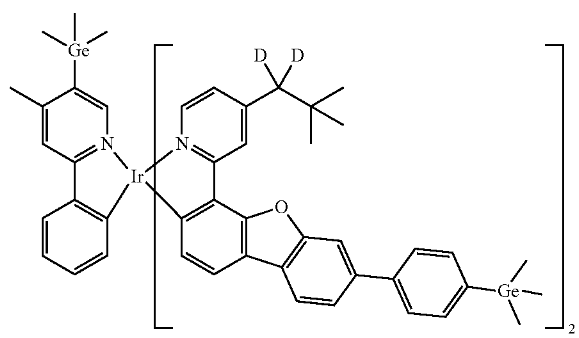
3938
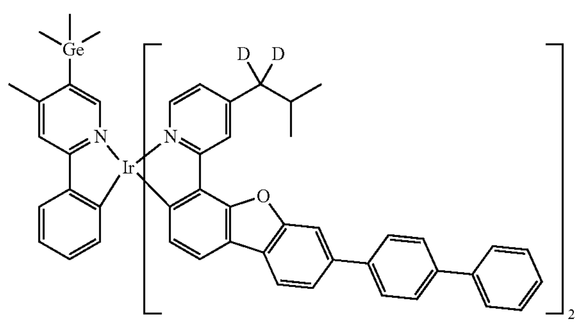
3939
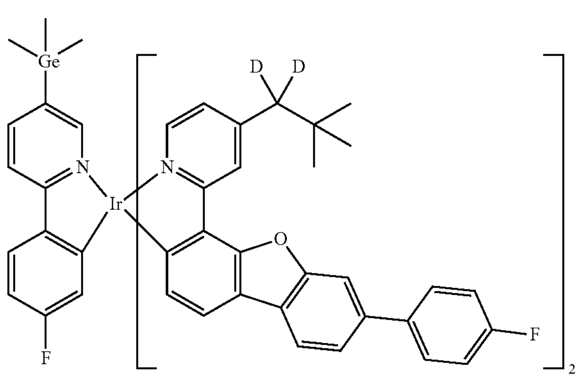
3940
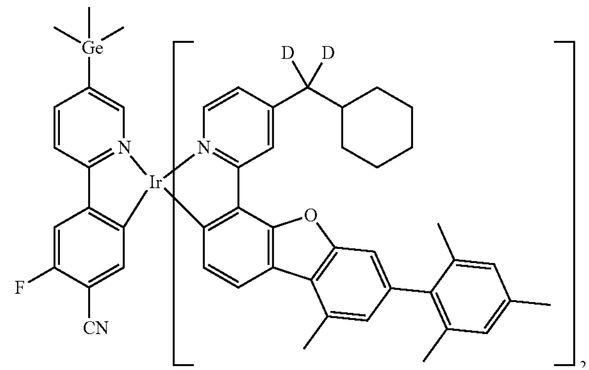
3941
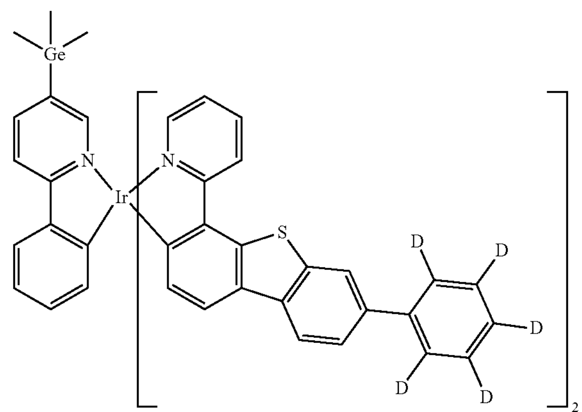
3942
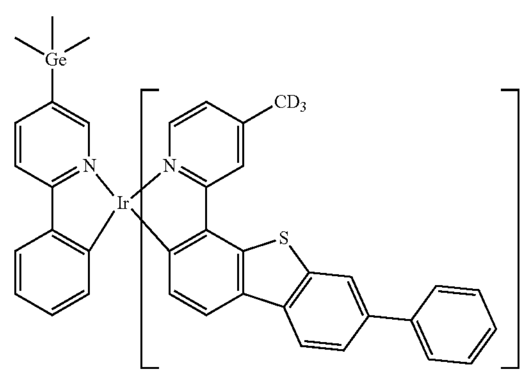
3943
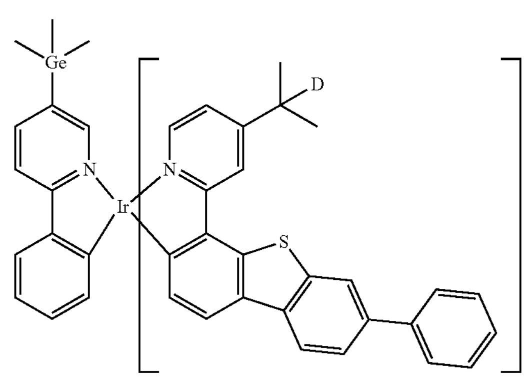

3944
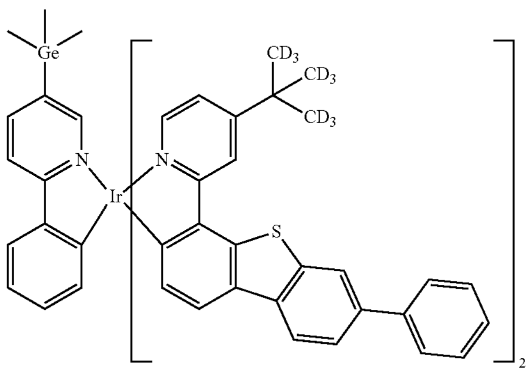
3945
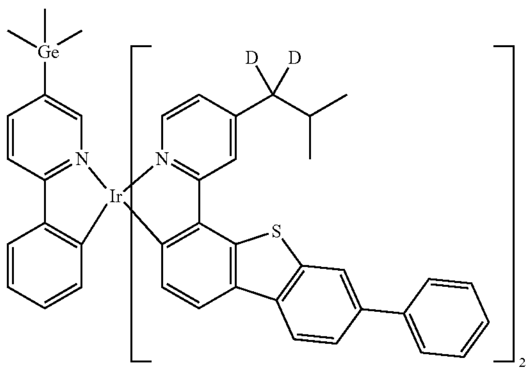
3946
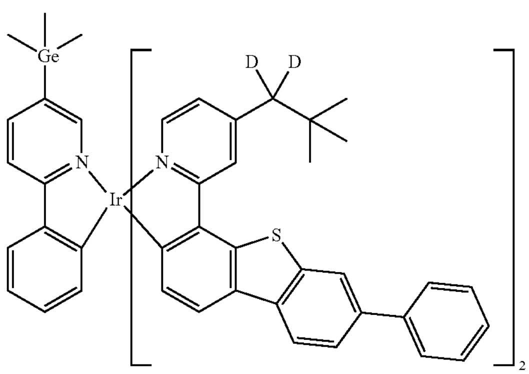
3947
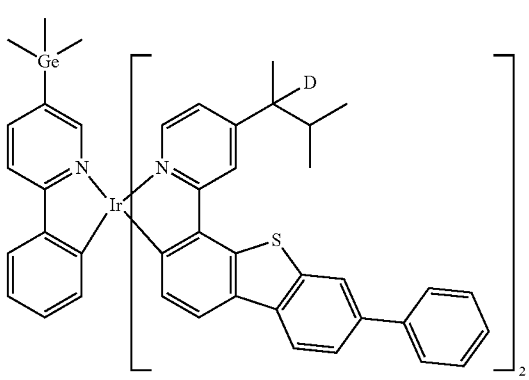
3948
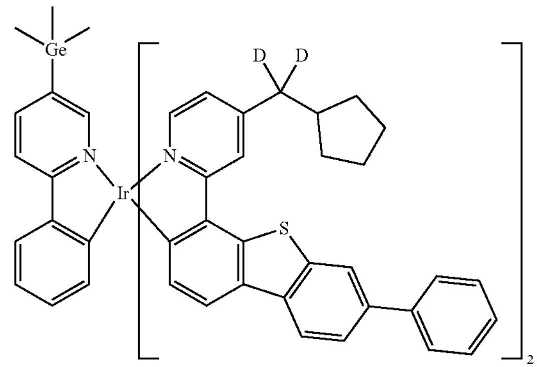
3949
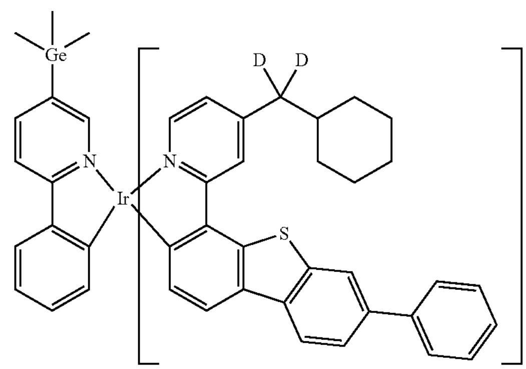
3950
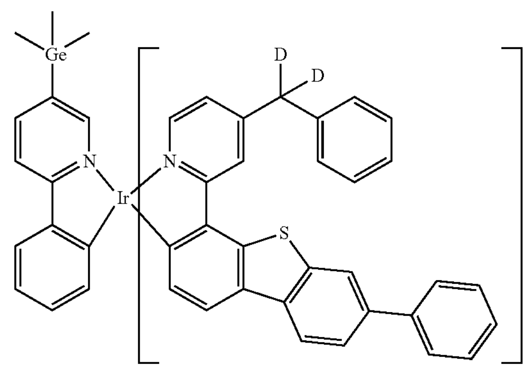
3951
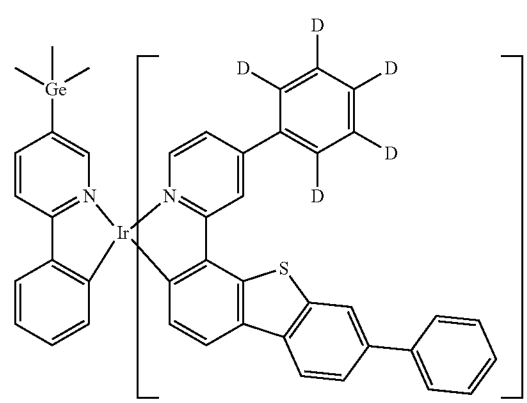

-continued
3952
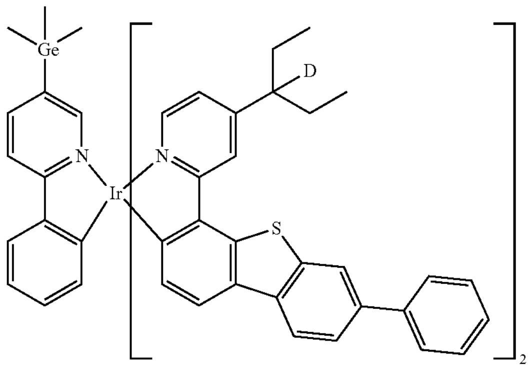
3953
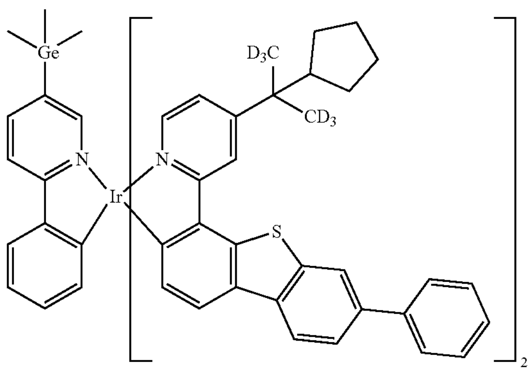
3954
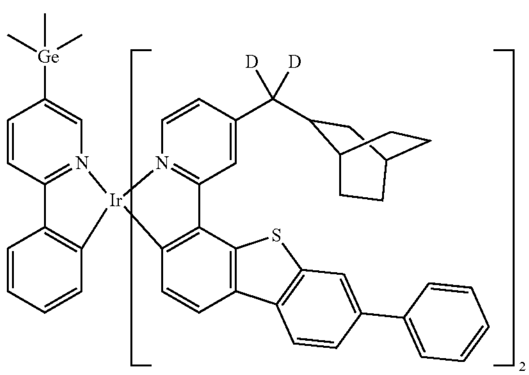
3955
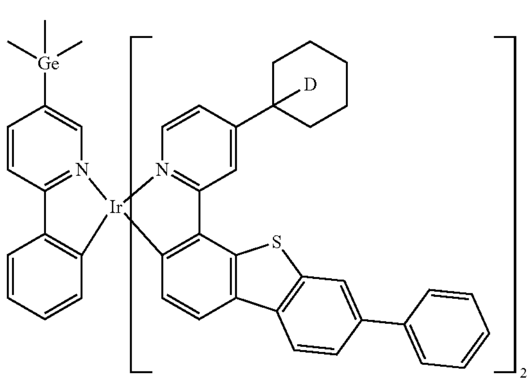
-continued
3956
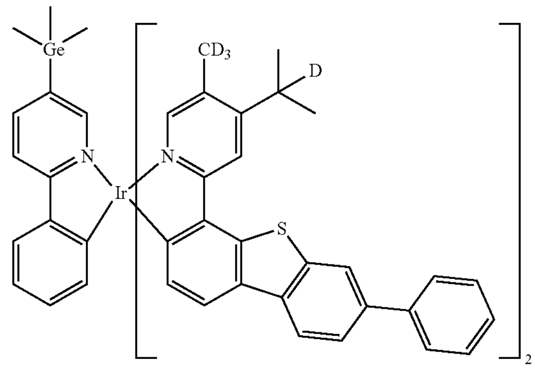
3957
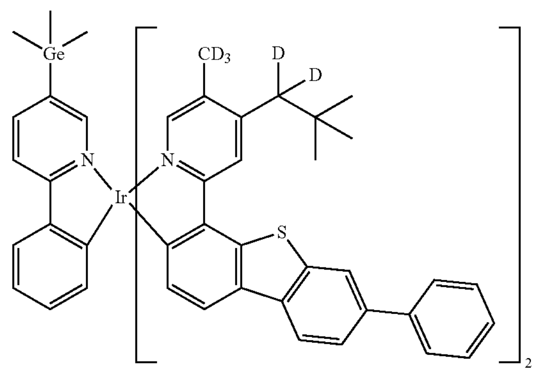
3958
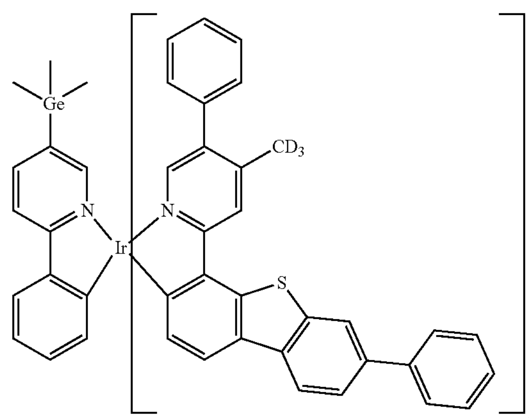
3959
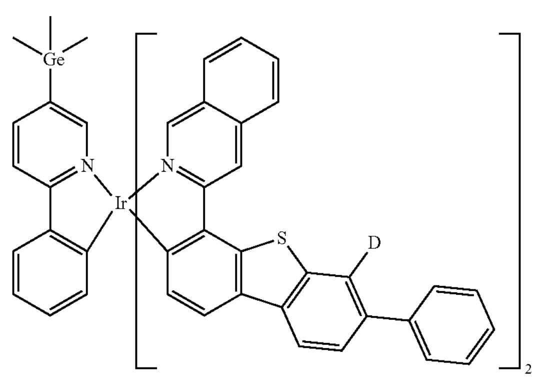

-continued
3960
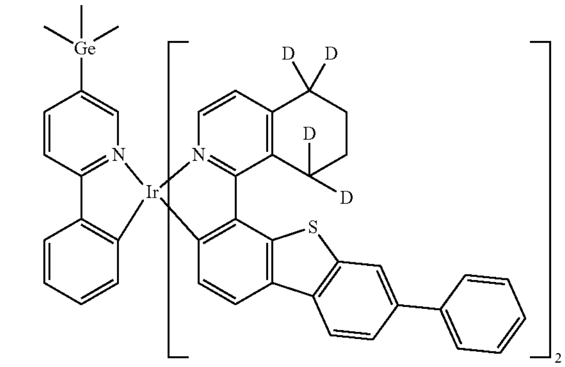
3961
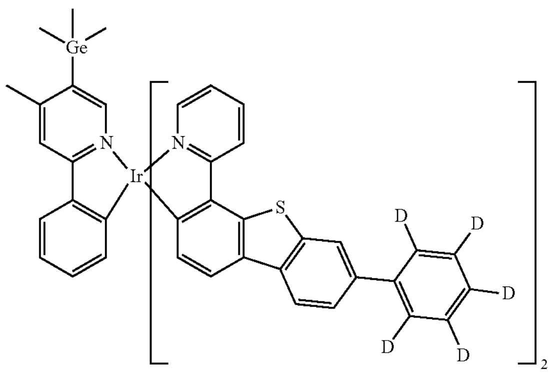
3962
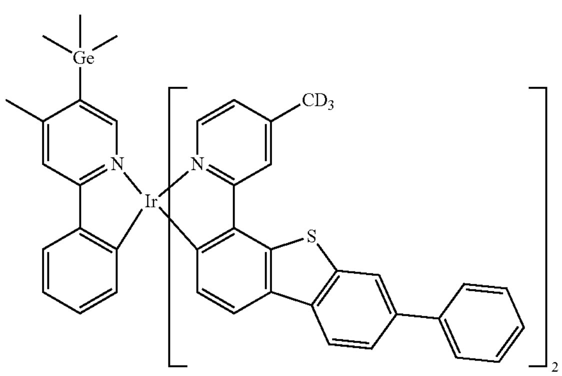
3963
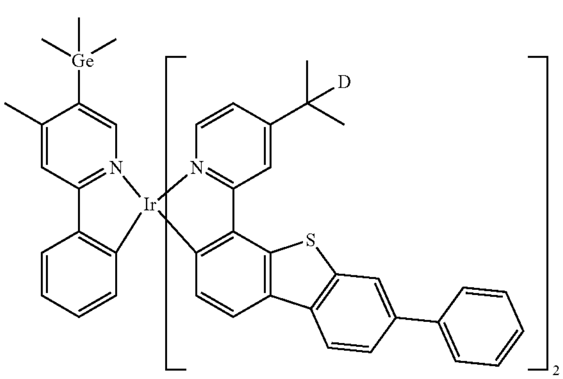
-continued
3964
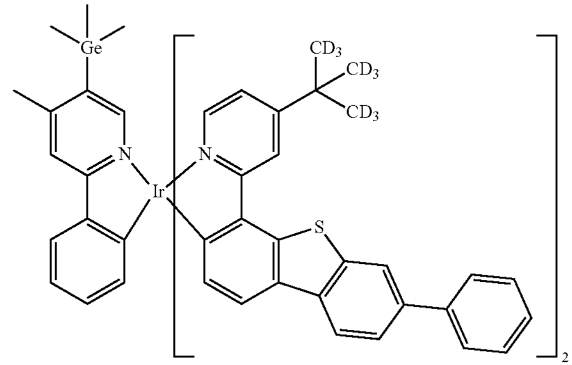
3965
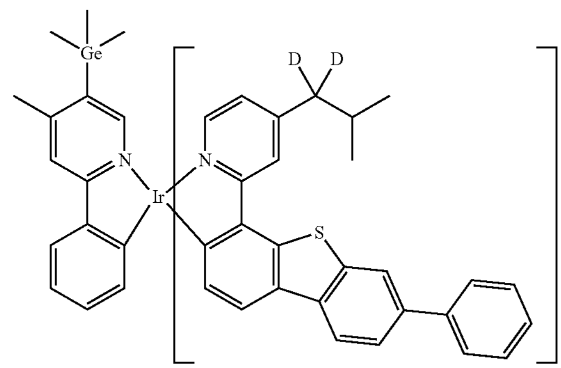
3966
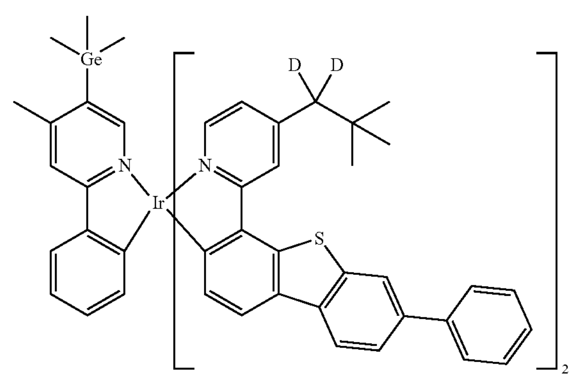
3967
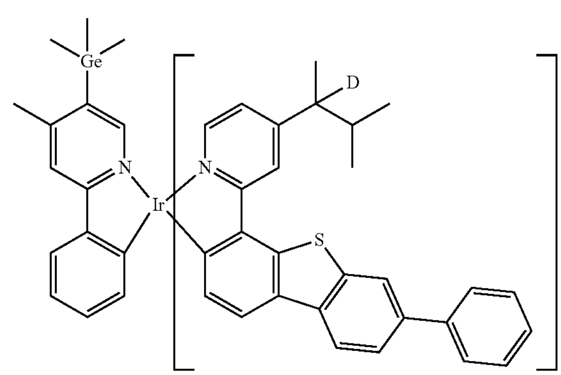

-continued
3968
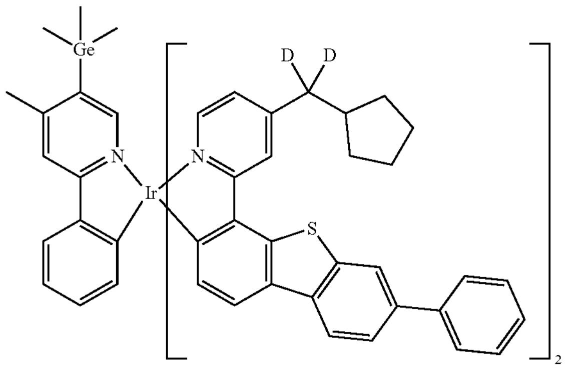
3969
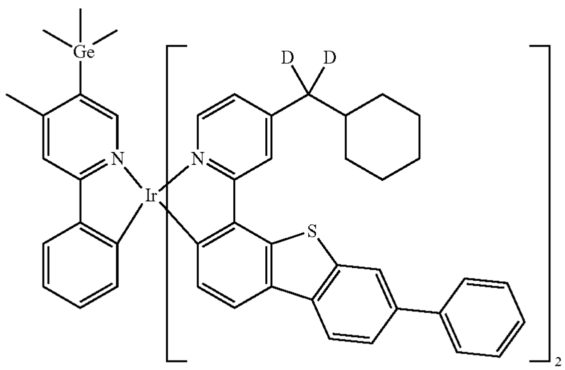
3970
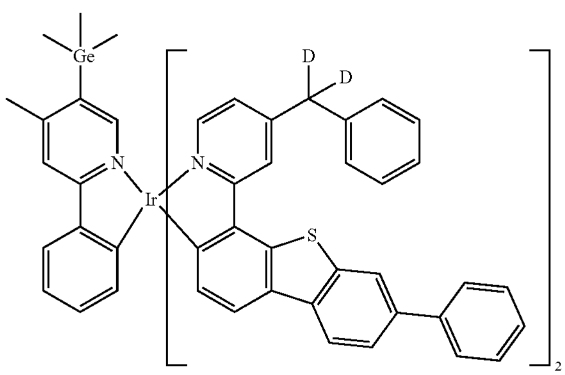
3971
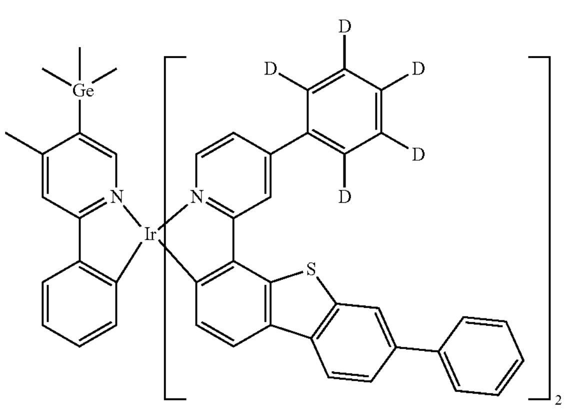
-continued
3972
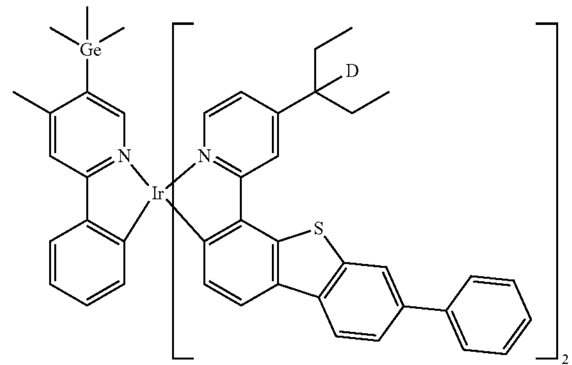
3973
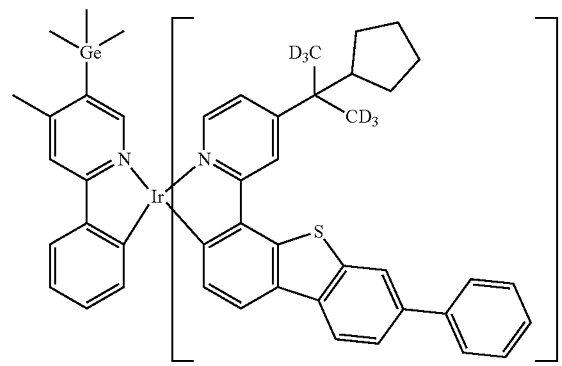
3974
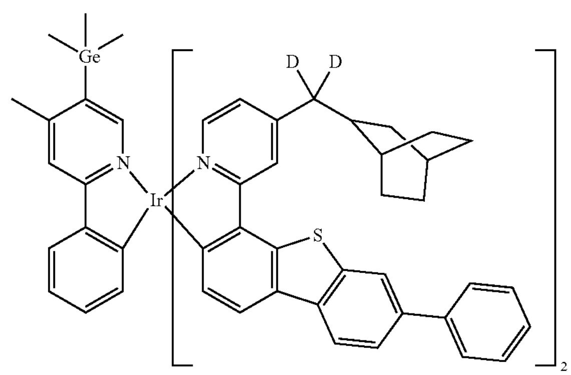
3975
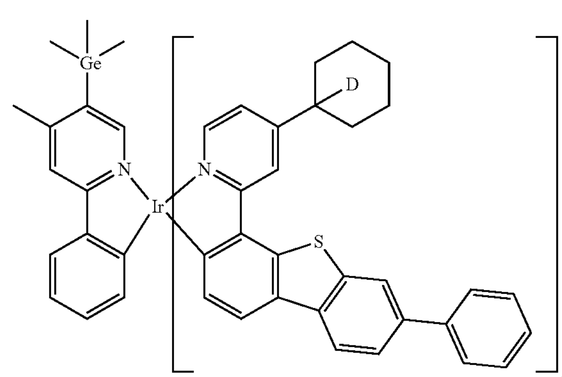

-continued
3976
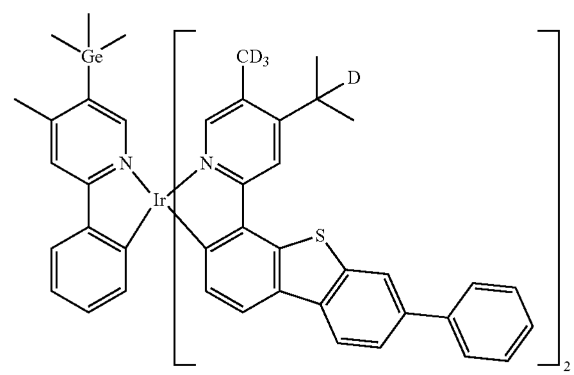
3977
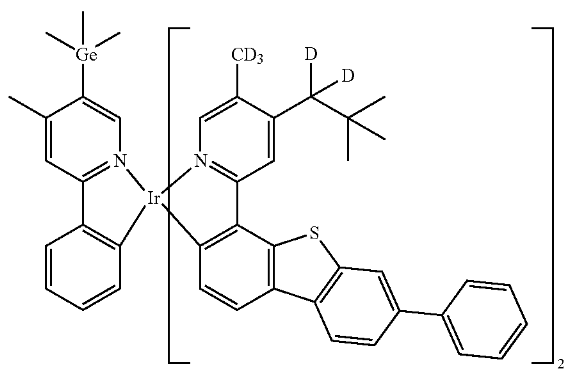
3978
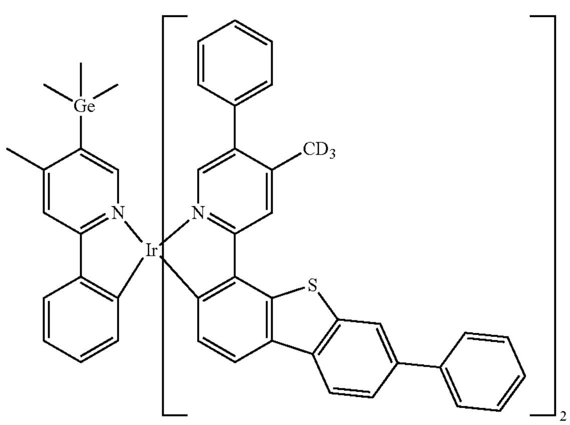
3979
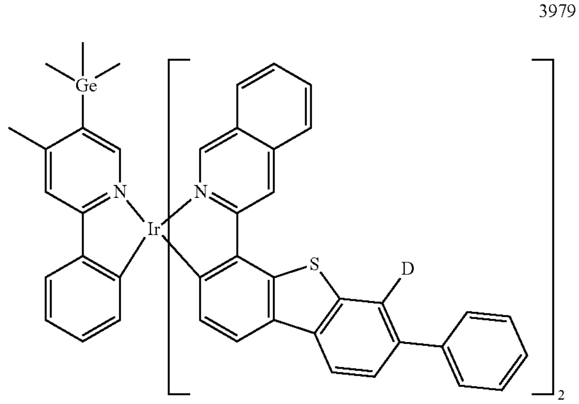
-continued
3980
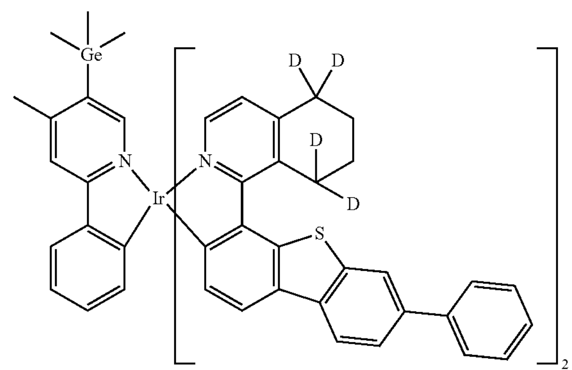
3981
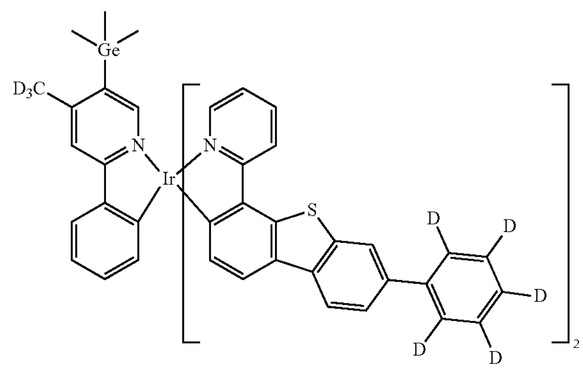
3982
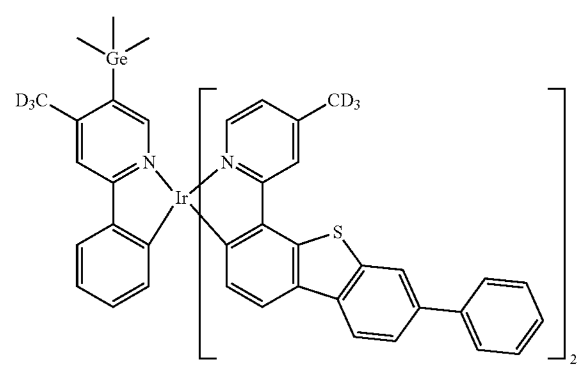
3983
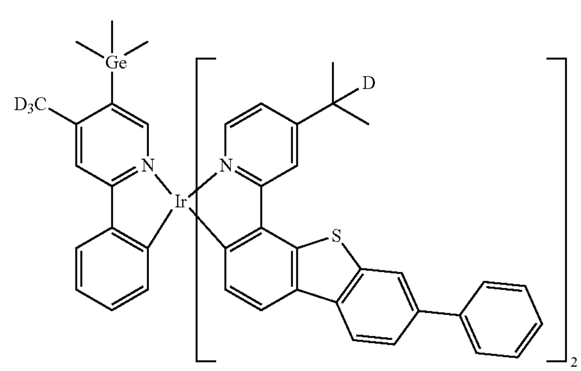

-continued
3984
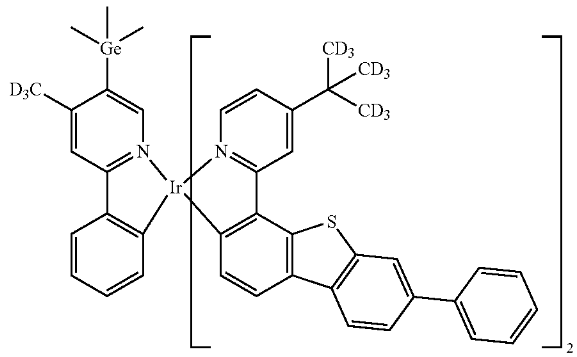
3985
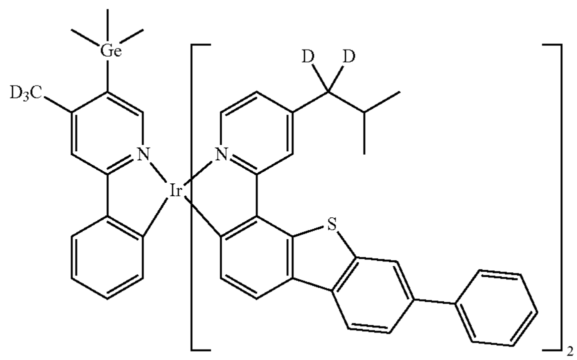
3986
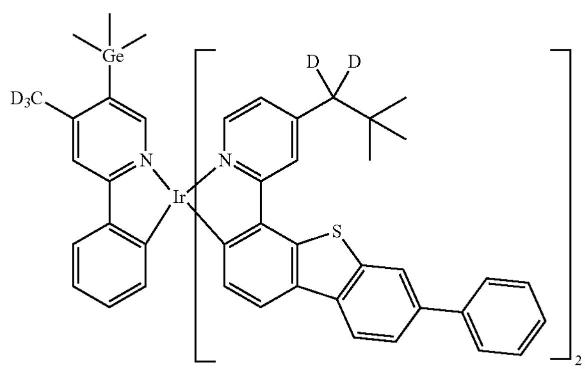
3987
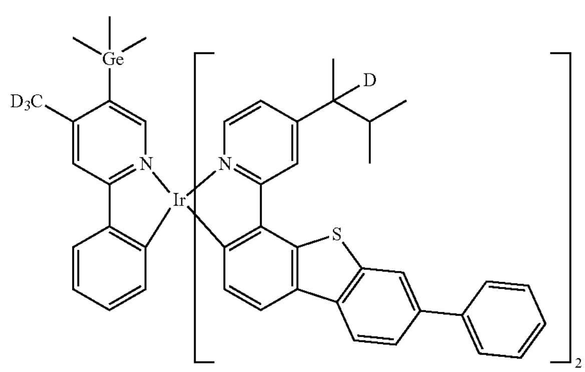
-continued
3988
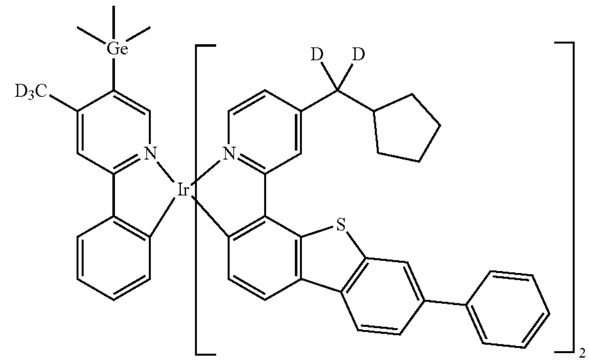
3989
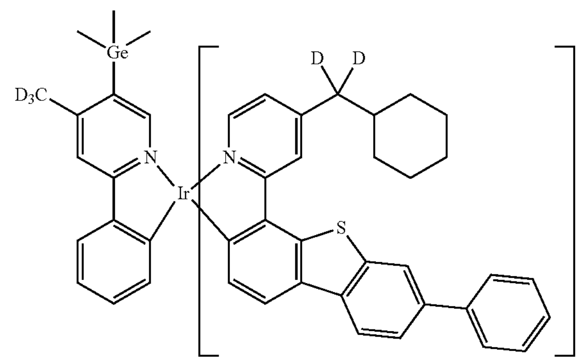
3990
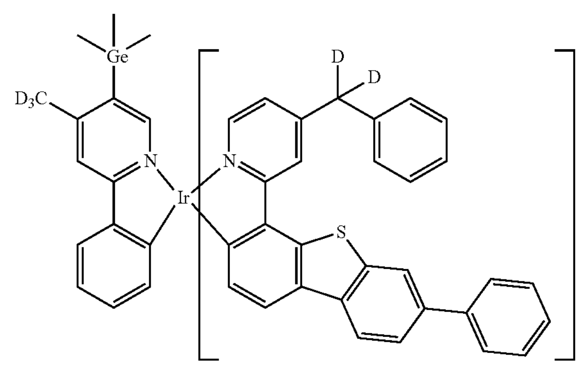
3991
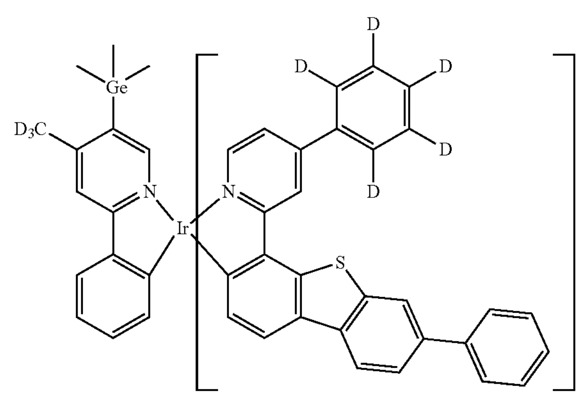

-continued
3992
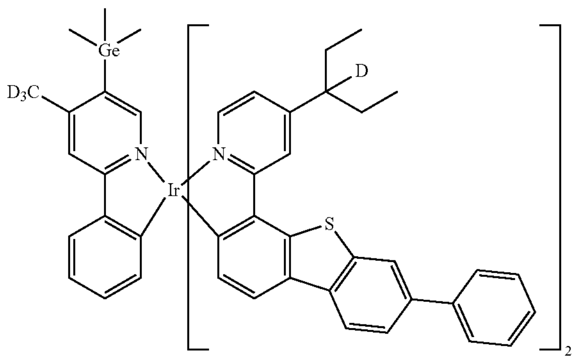
3993
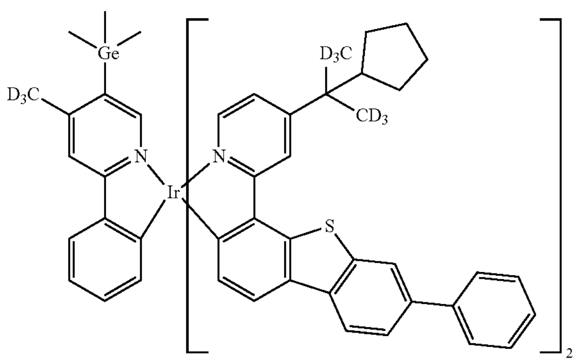
3994
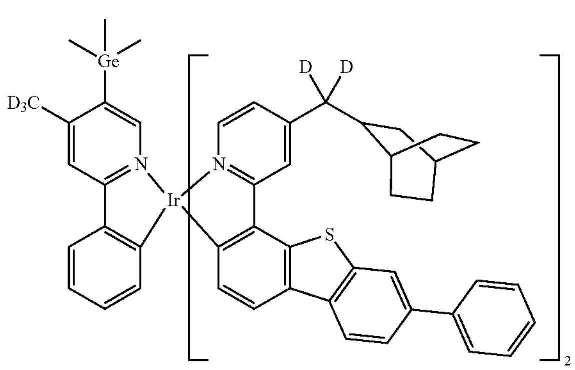
3995
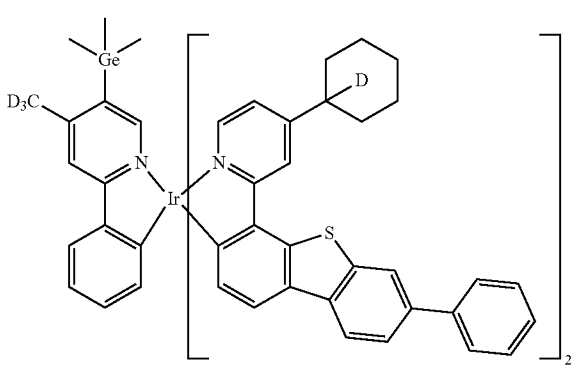
-continued
3996
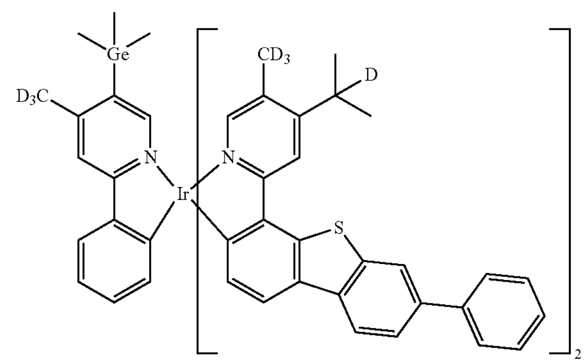
3997
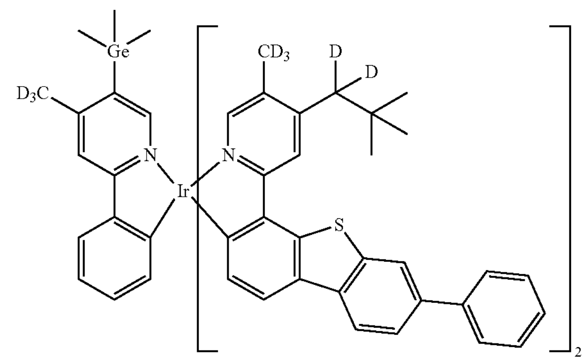
3998
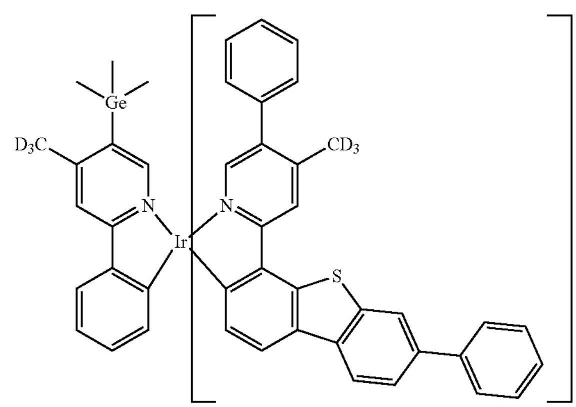
3999
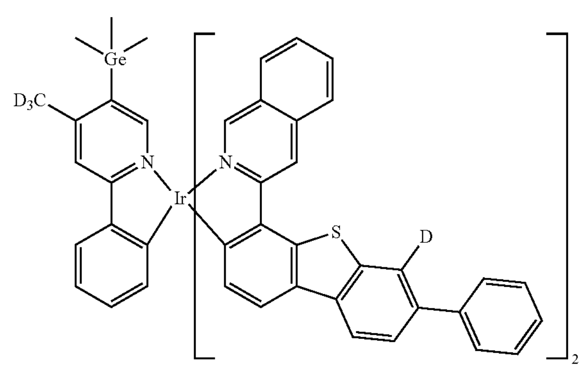

4000
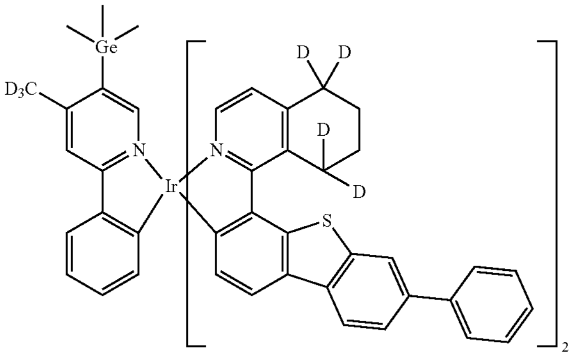
4001
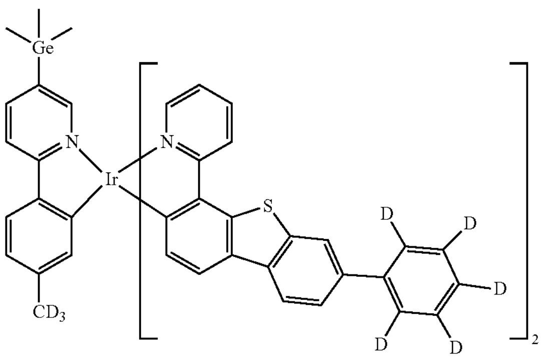
4002
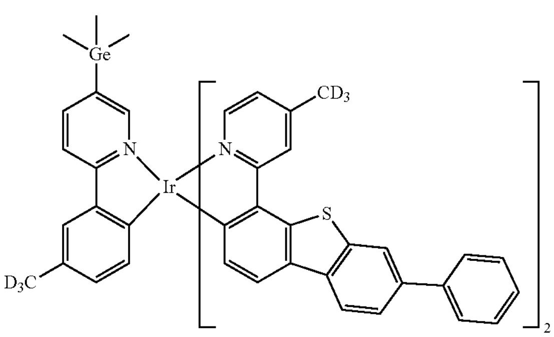
4003
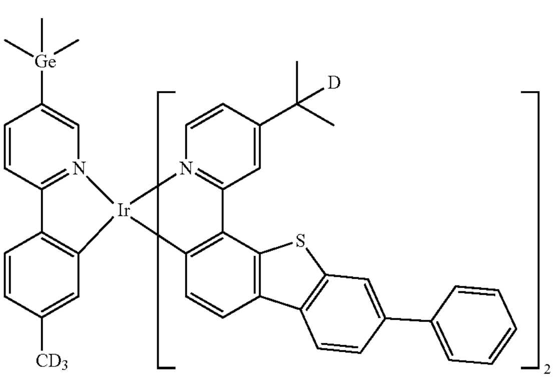
4004
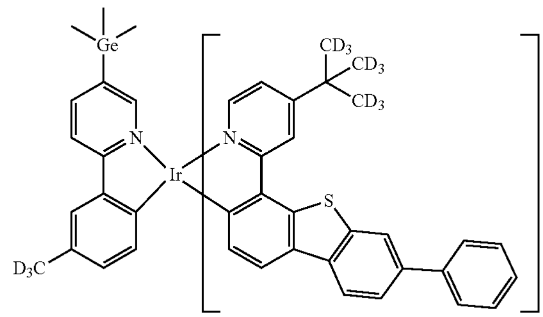
4005
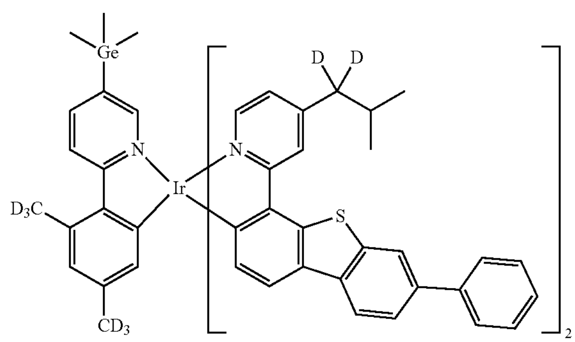
4006
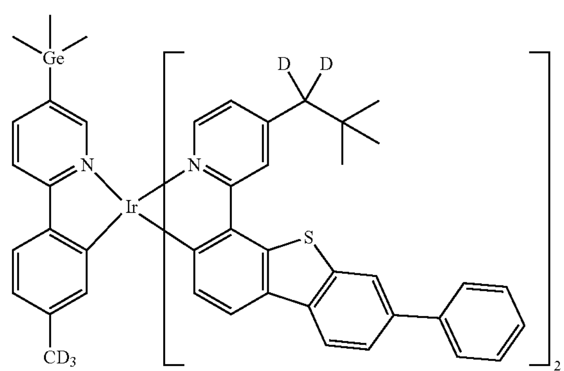
4007
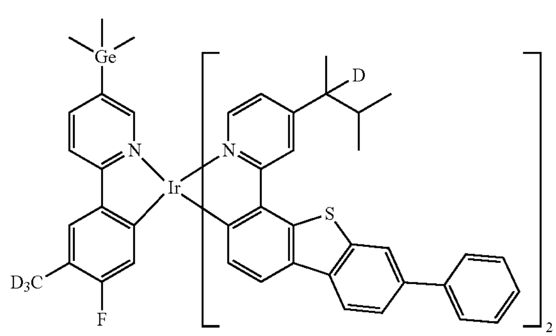

-continued
4008
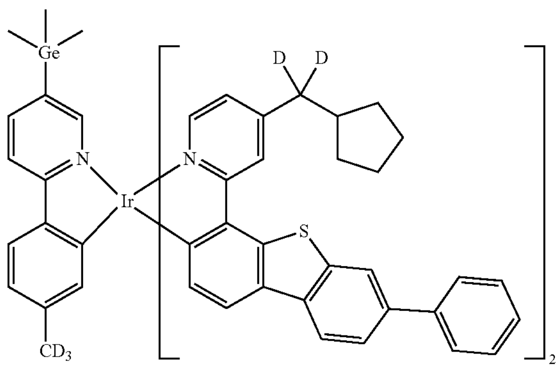
4009
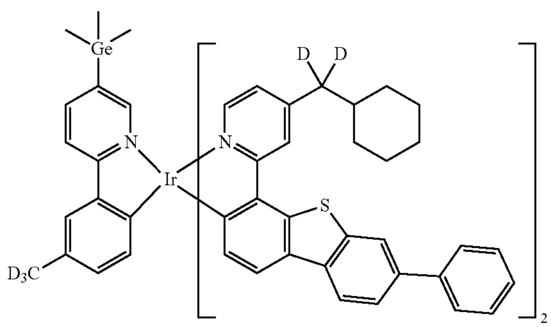
4010
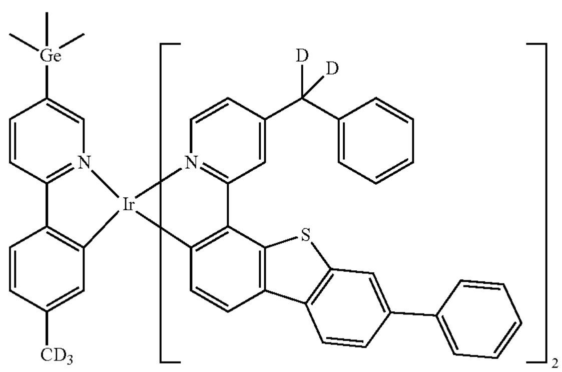
4011
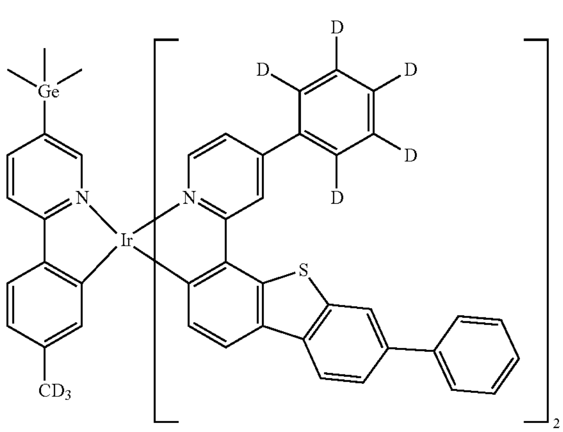
-continued
4012
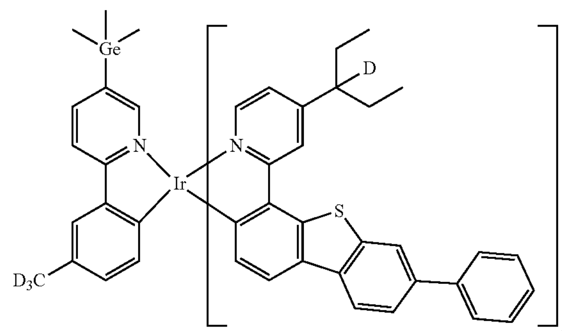
4013
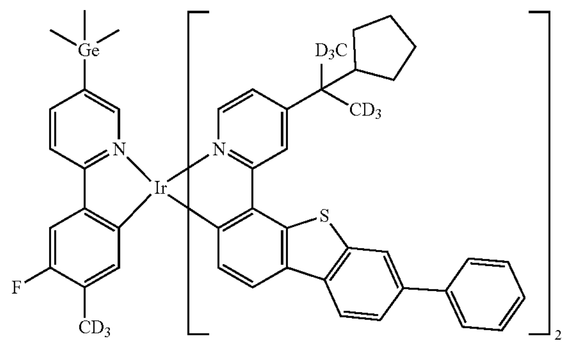
4014
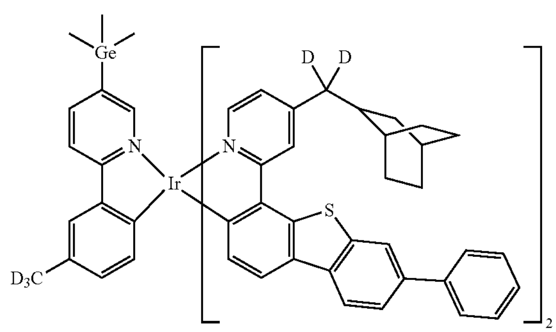
4015
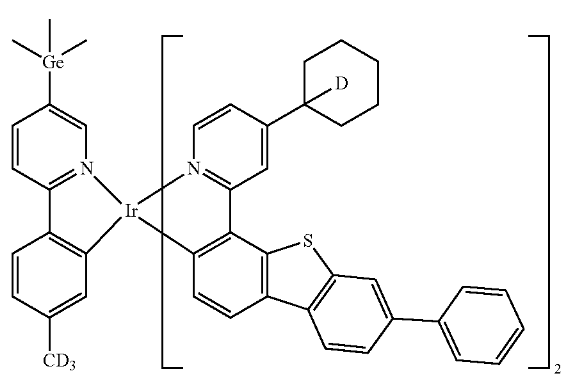

4016
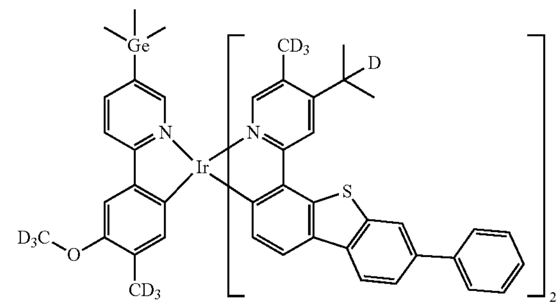
4017
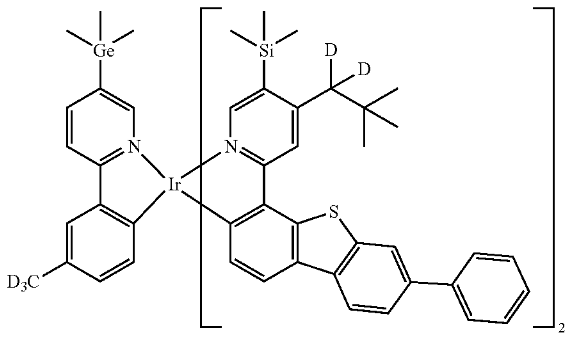
4018
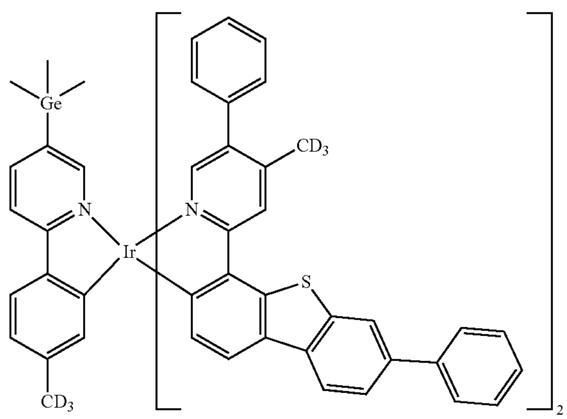
4019
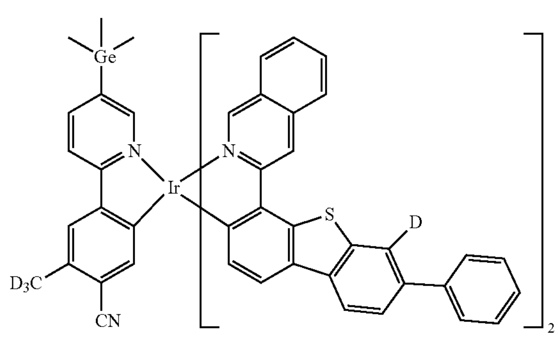
4020
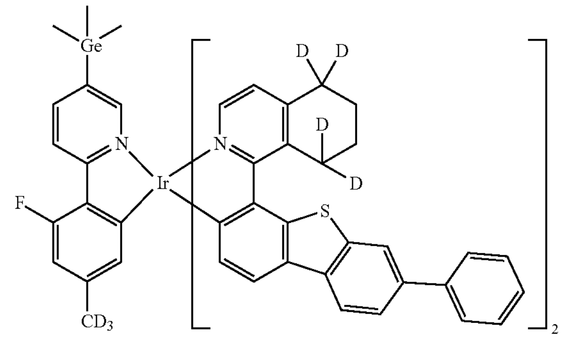
4021
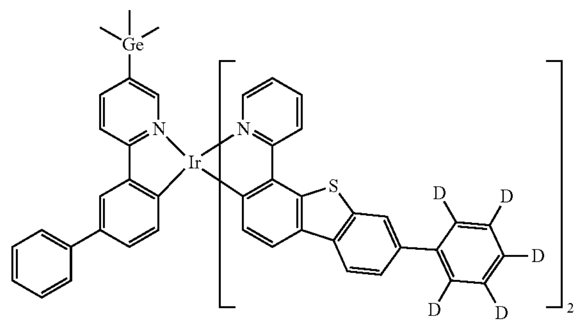
4022
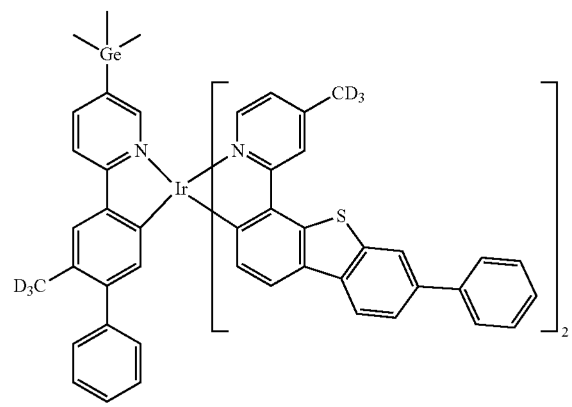
4023
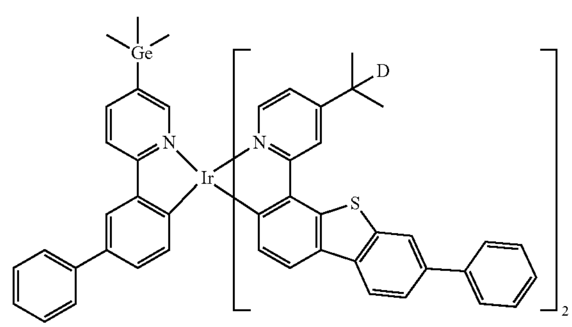

-continued
4024
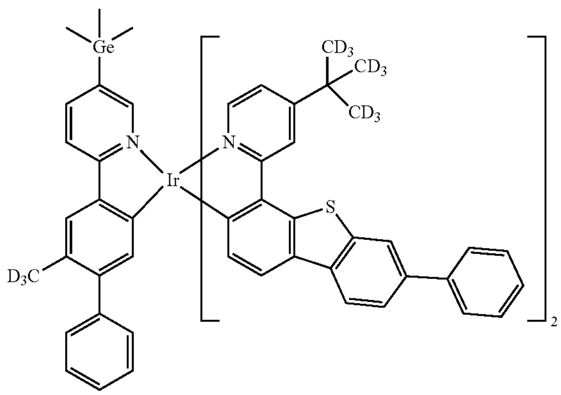
4025
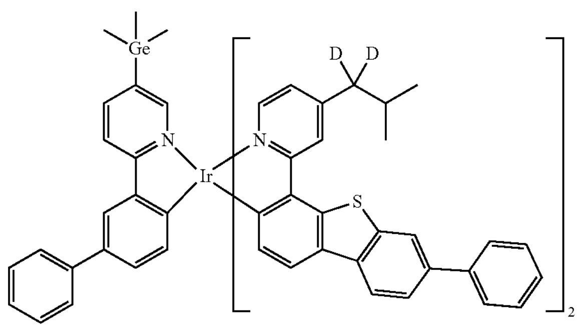
4026
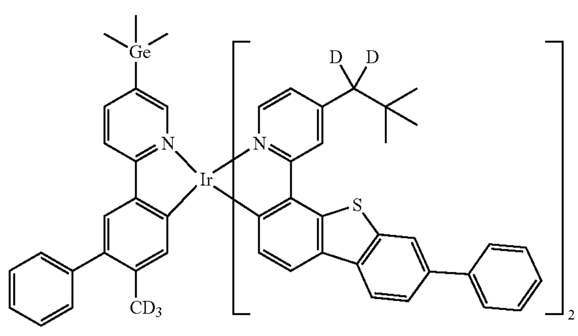
4027
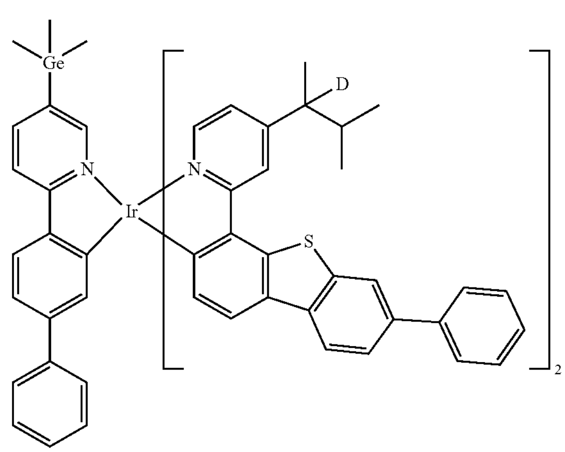
-continued
4028
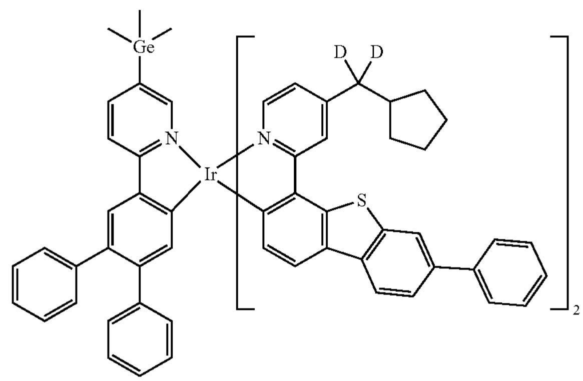
4029
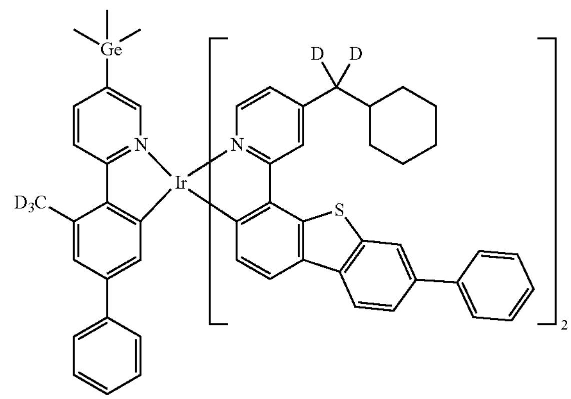
4030
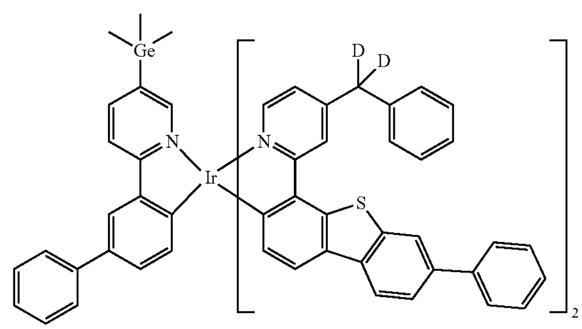
4031
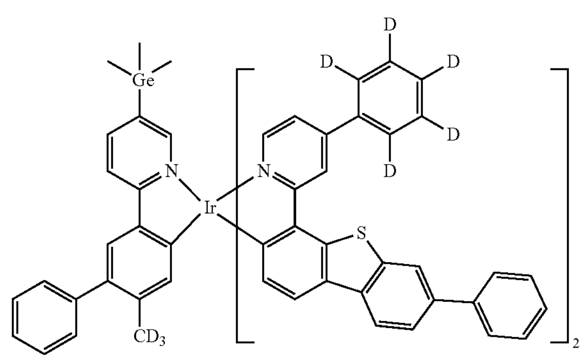

-continued
4032
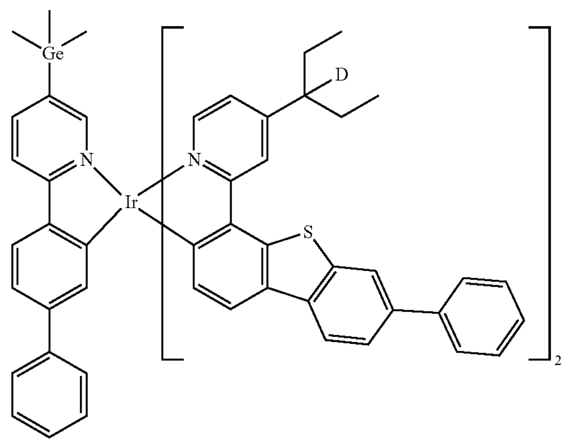
4033
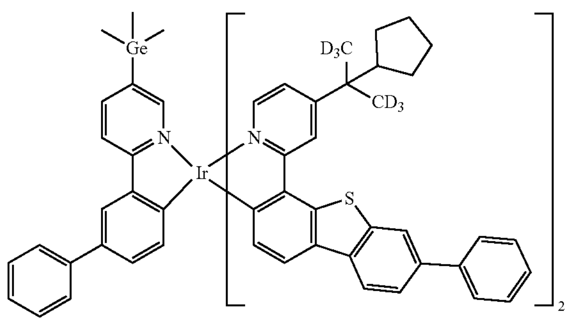
4034
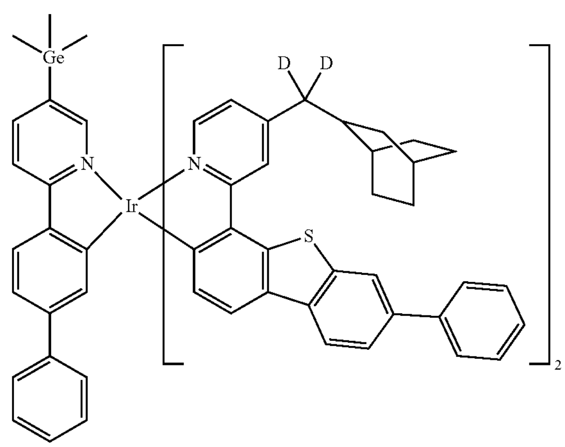
4035
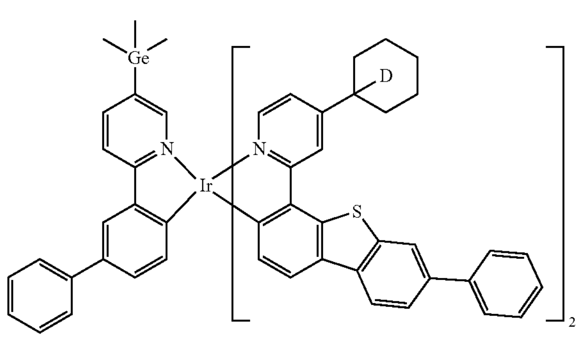
-continued
4036
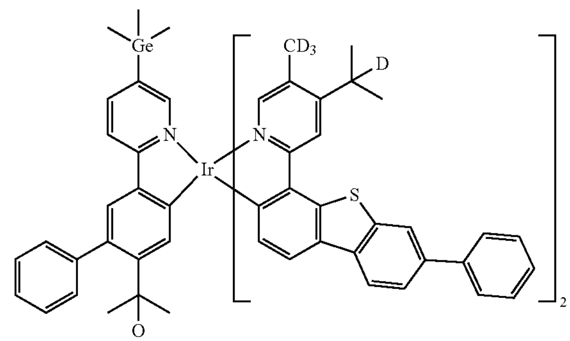
4037
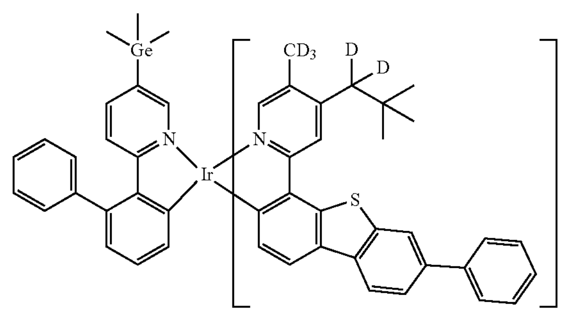
4038
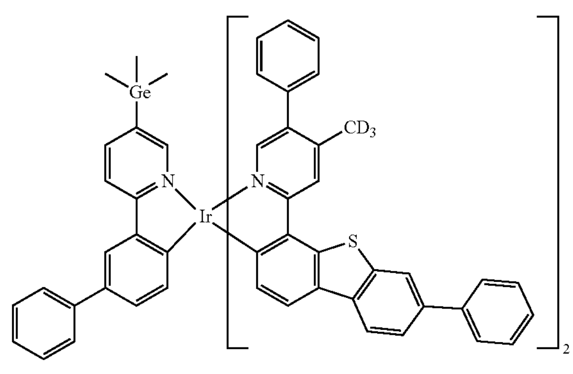
4039
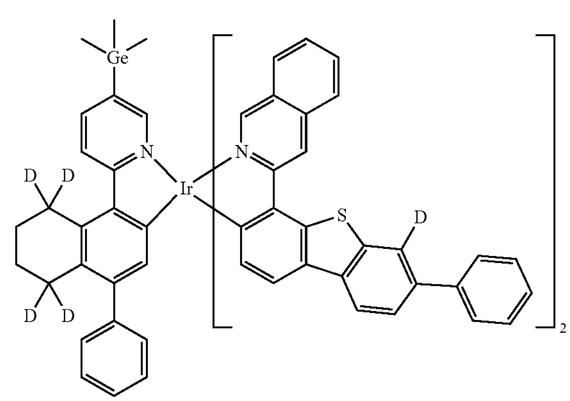

-continued
4040
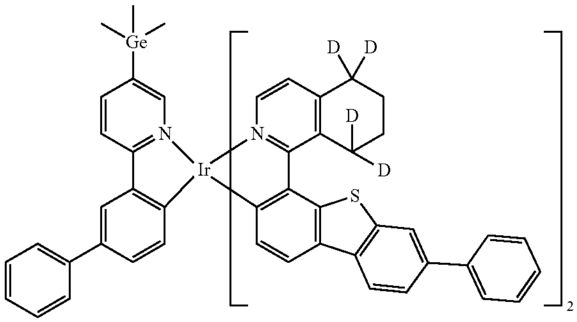
4041
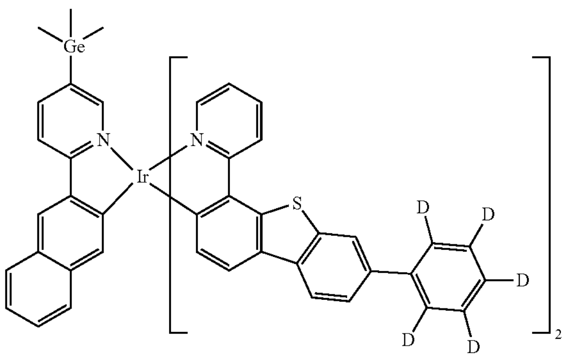
4042
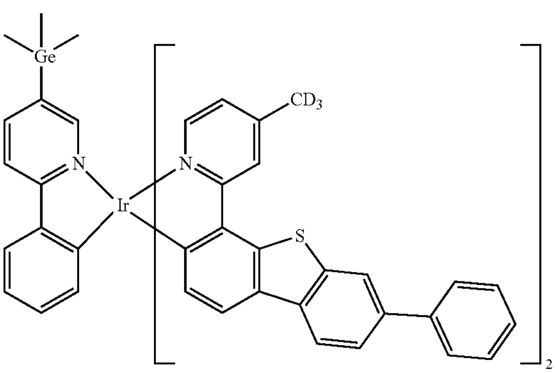
4043
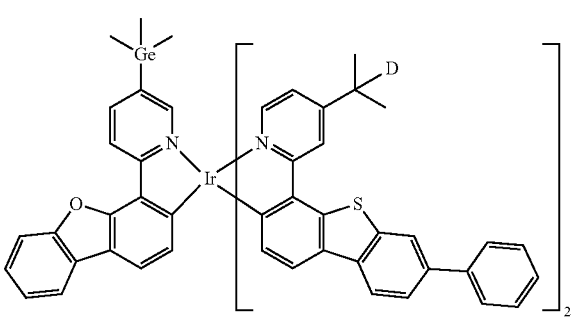
-continued
4044
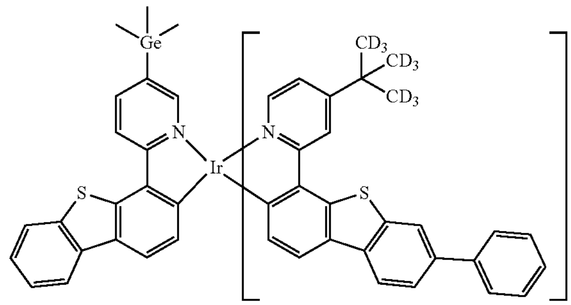
4045
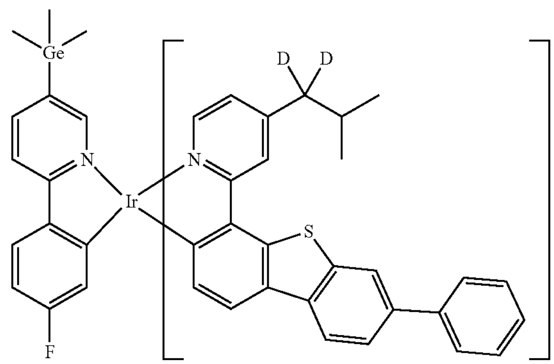
4046
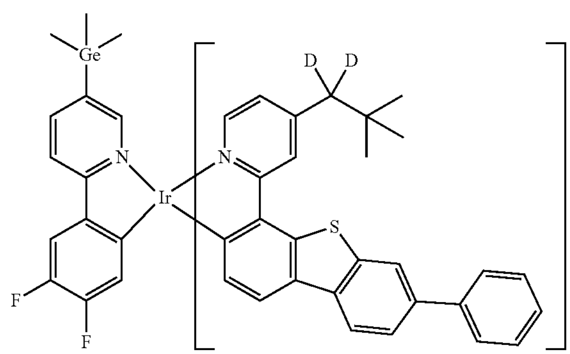
4047
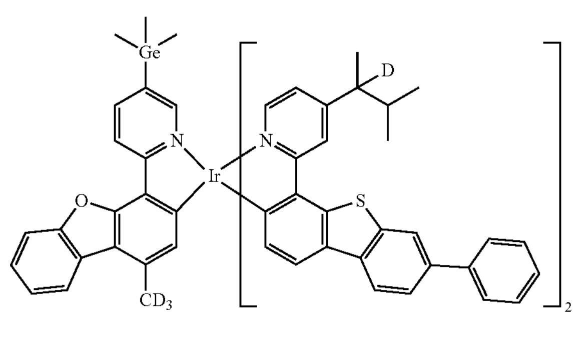

-continued
4048
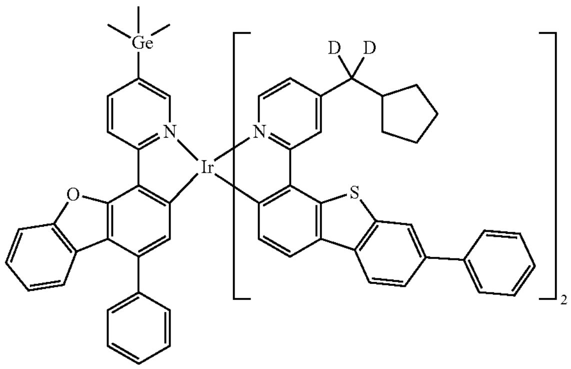
4049
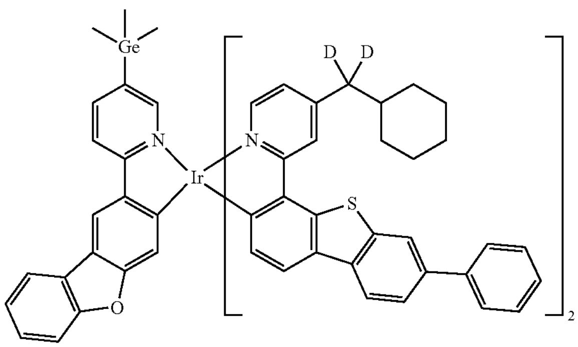
4050
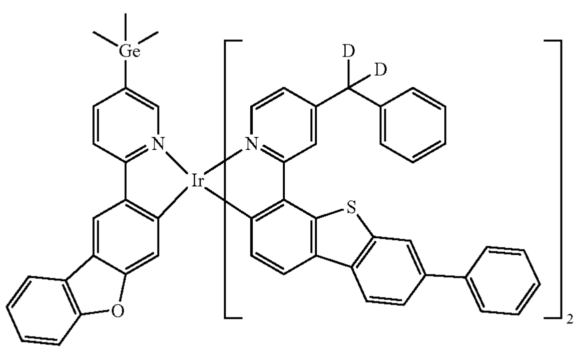
4051
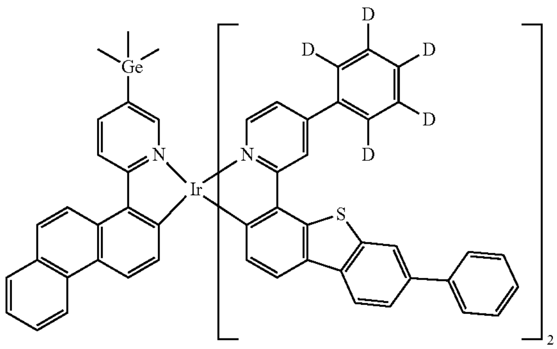
-continued
4052
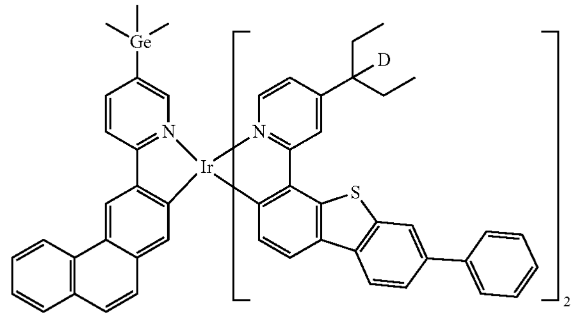
4053
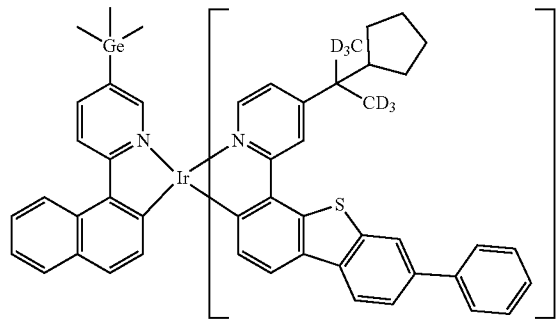
4054
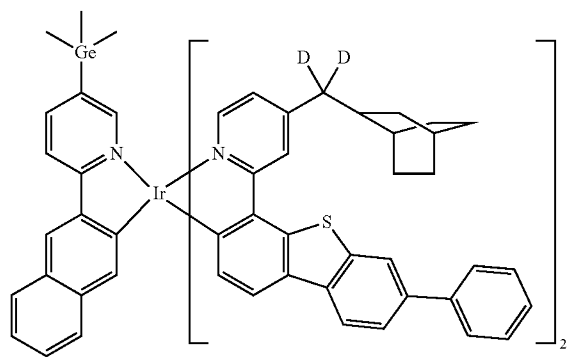
4055
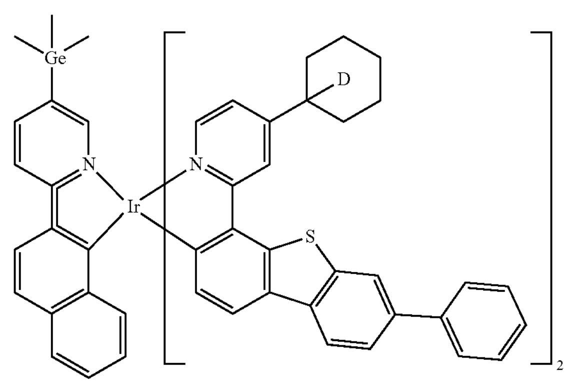

4056
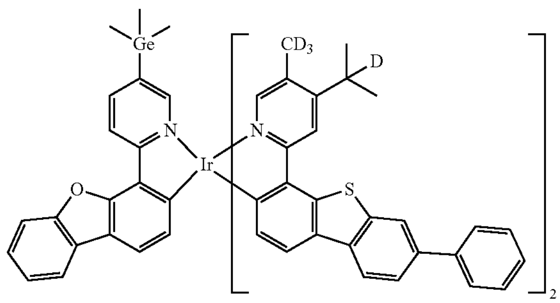
4057
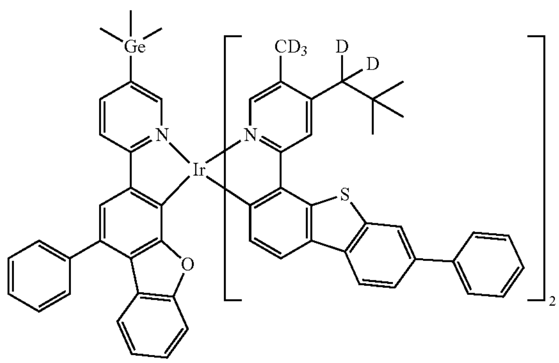
4058
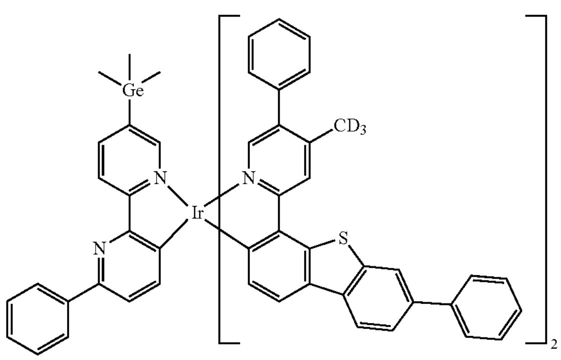
4059
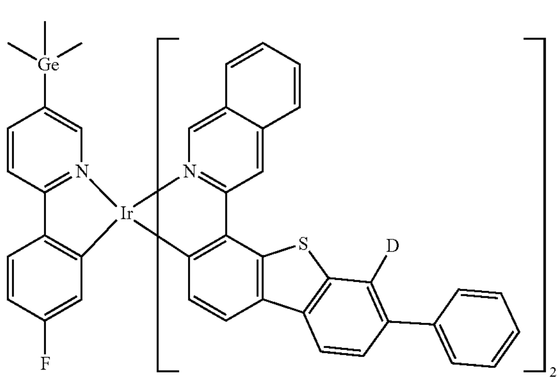
4060
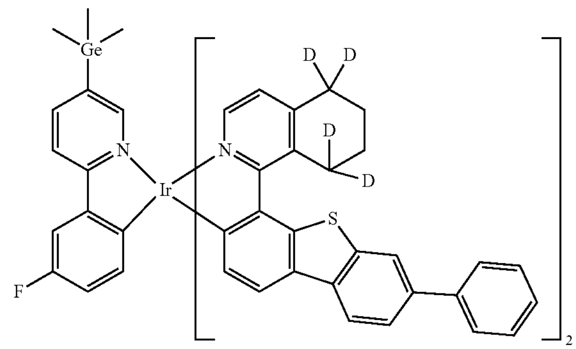
4061
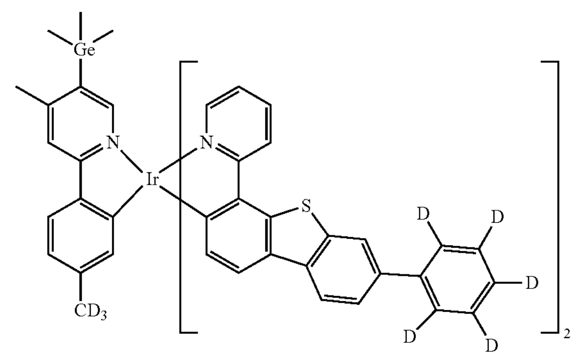
4062
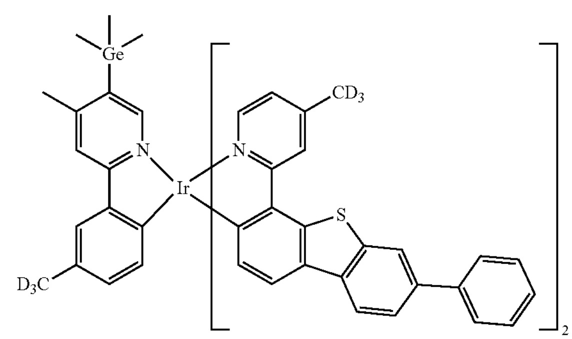
4063
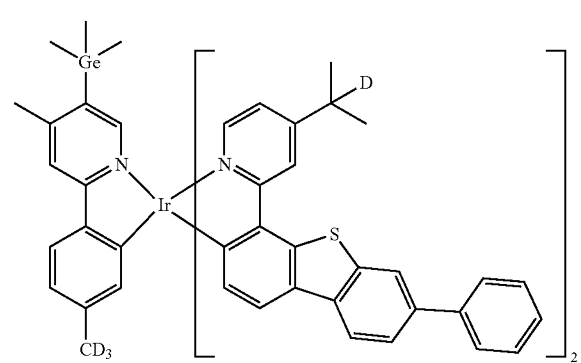

-continued
4064
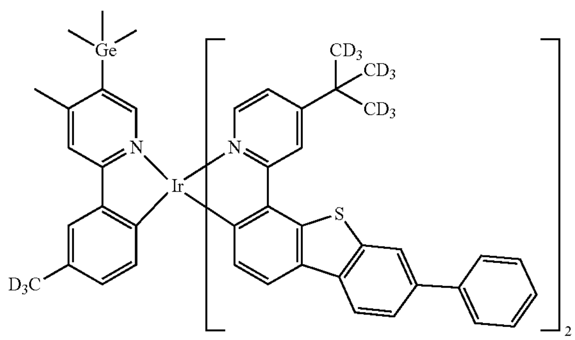
4065
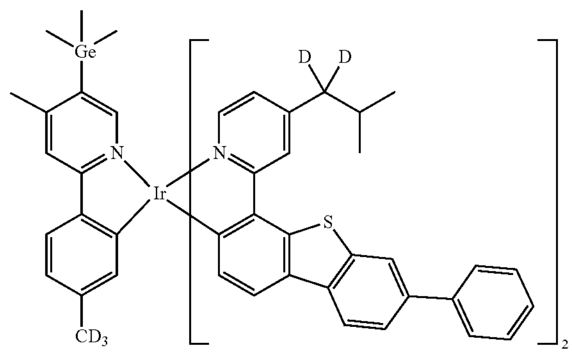
4066
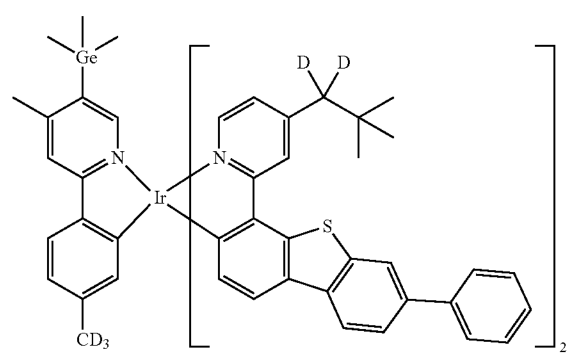
4067
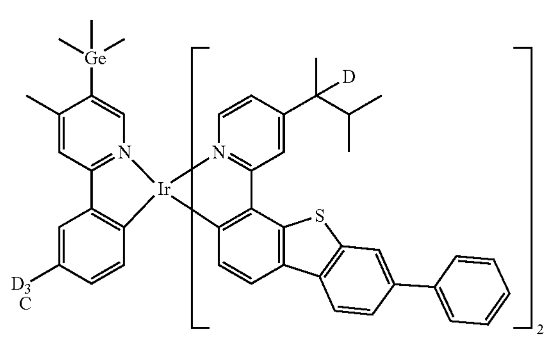
-continued
4068
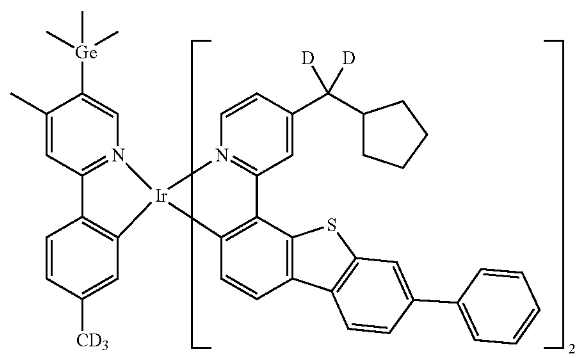
0469
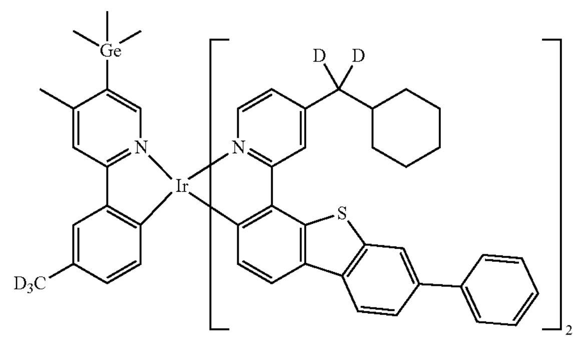
4070
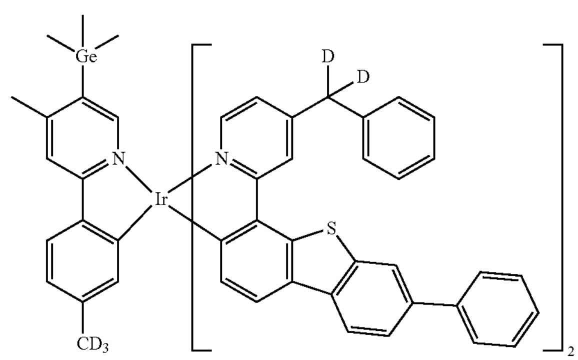
4071
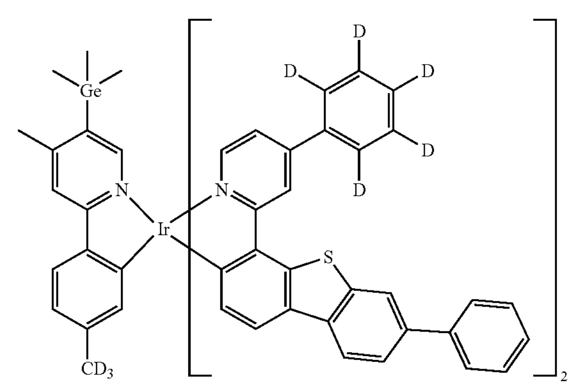

-continued
4072
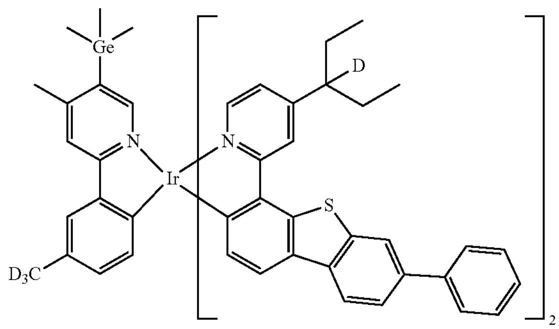
4073
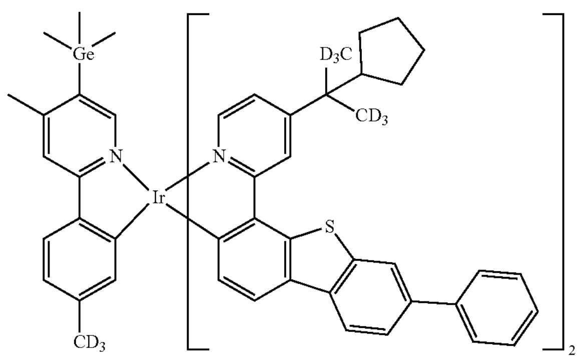
4074
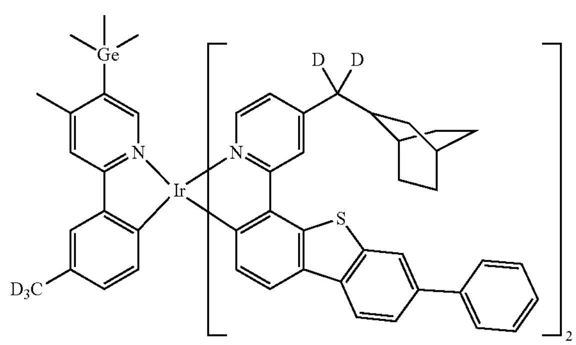
4075
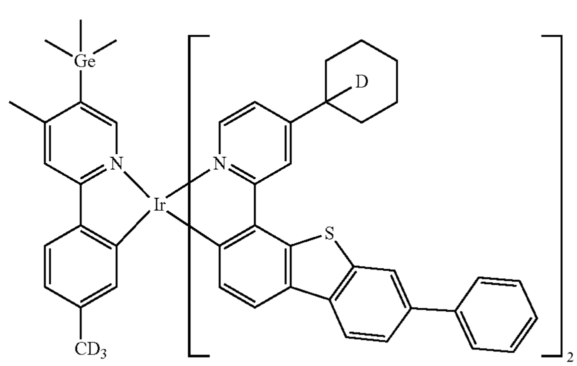
-continued
4076
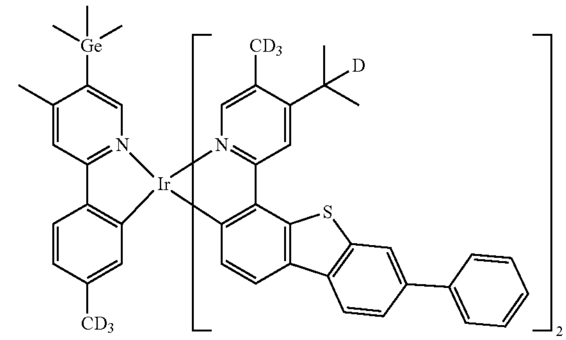
4077
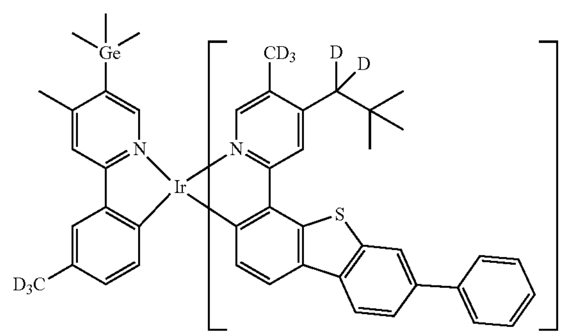
4078
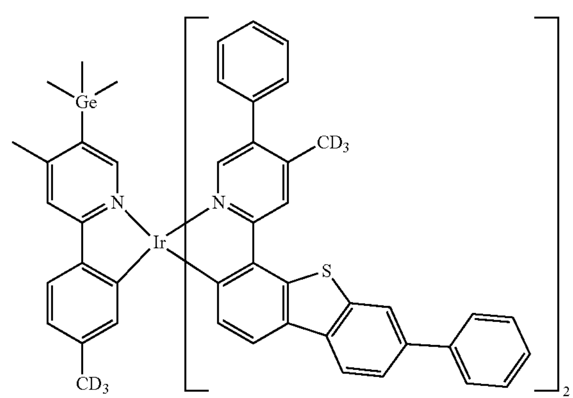
4079
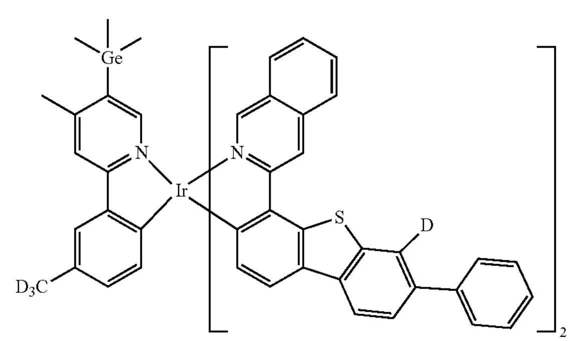

4080
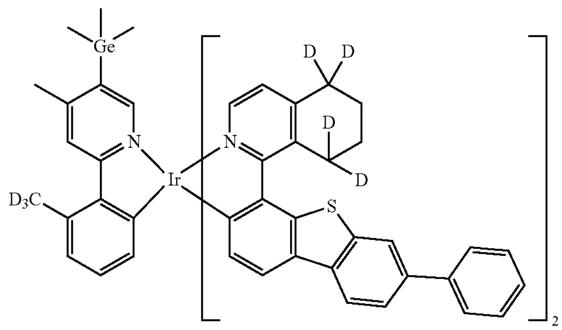
4081
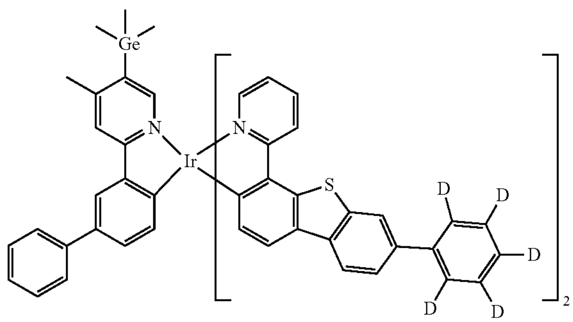
4082
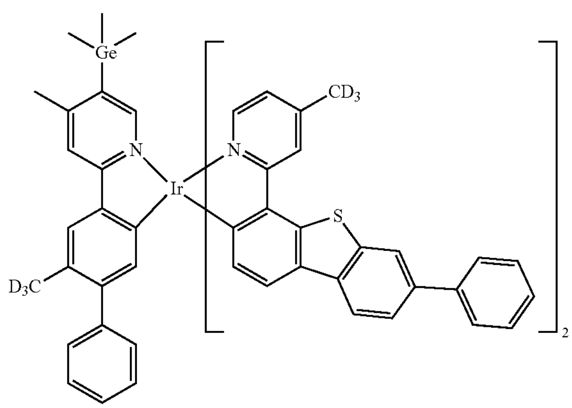
4083
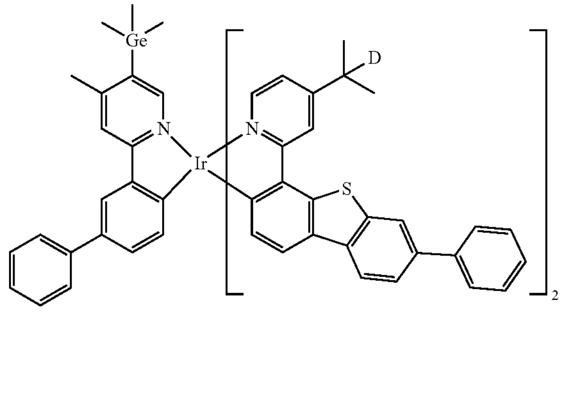
4084
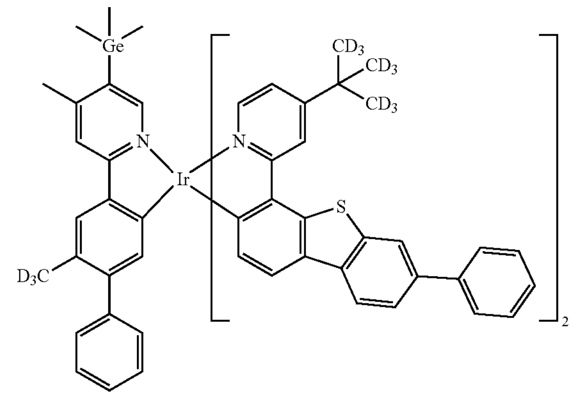
4085
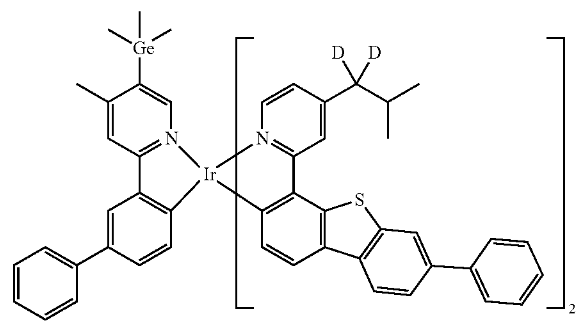
4086
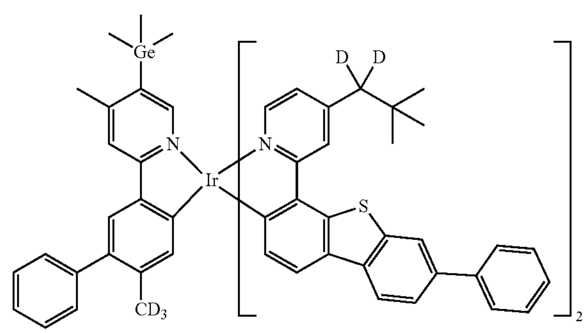
4087
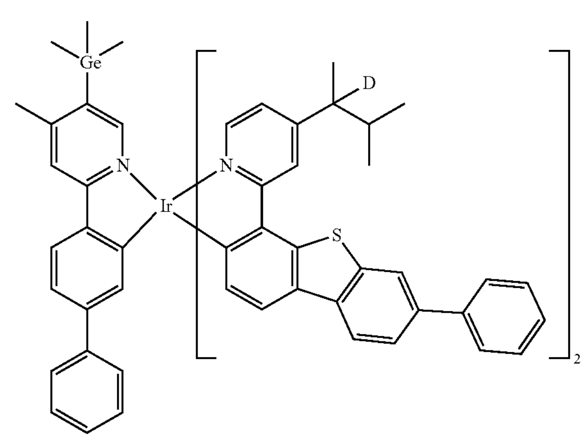

-continued
4088
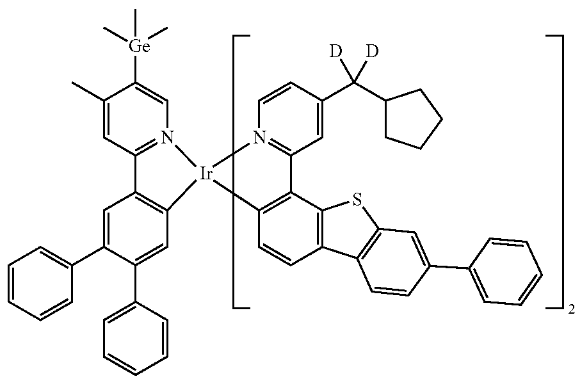
4089
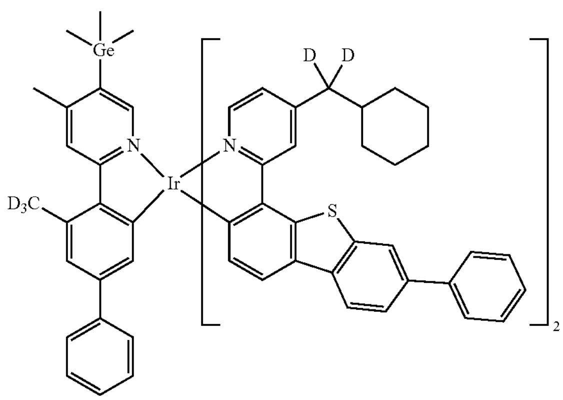
4090
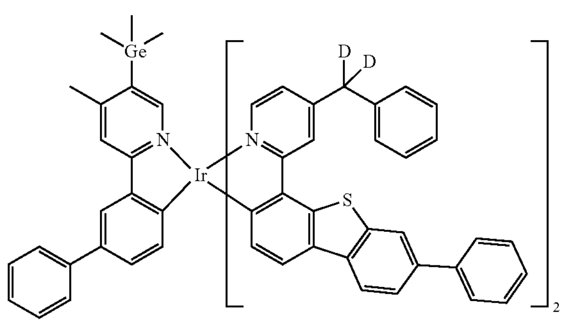
4091
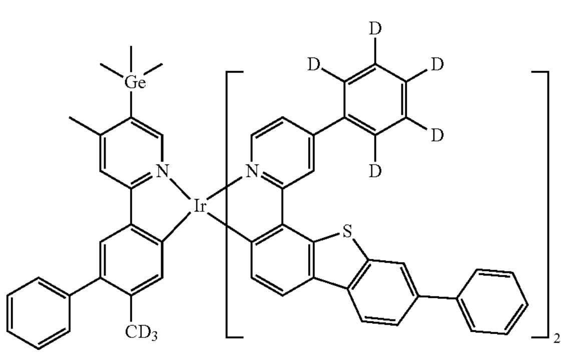
-continued
4092
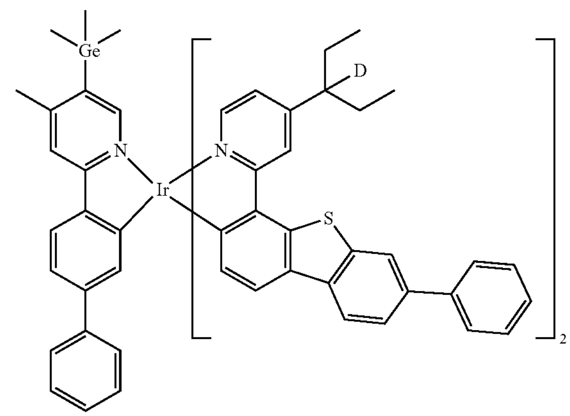
4093
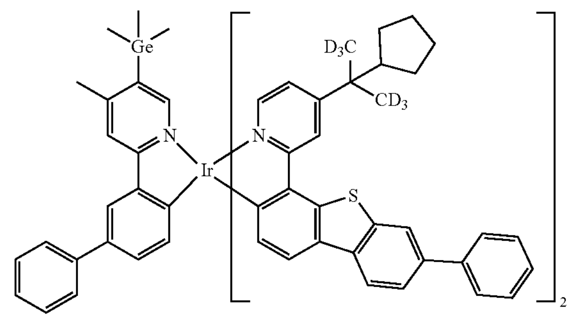
4094
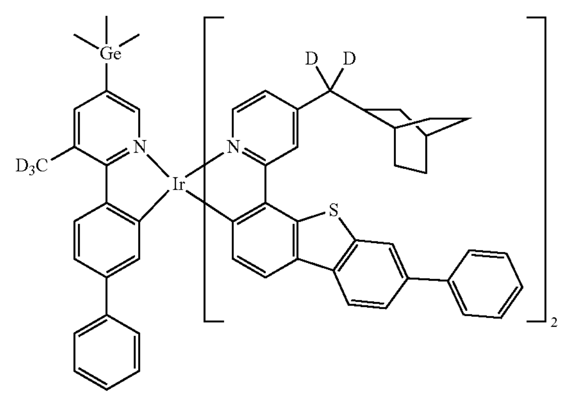
4095
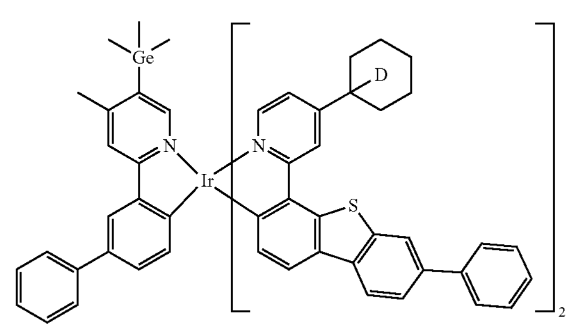

4096
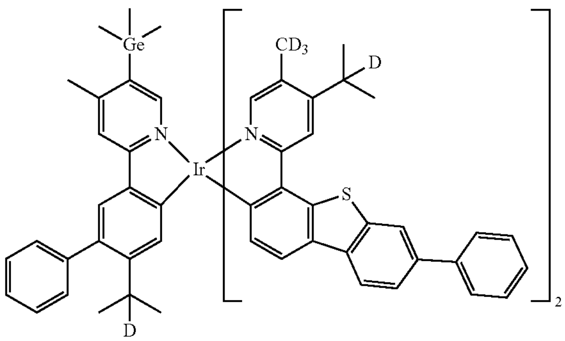
4097
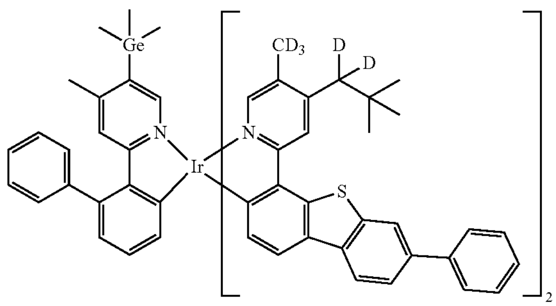
4098
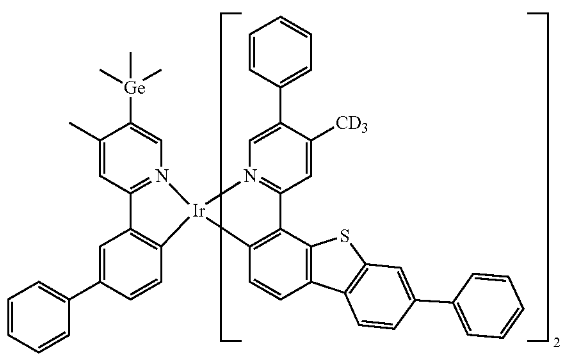
4099
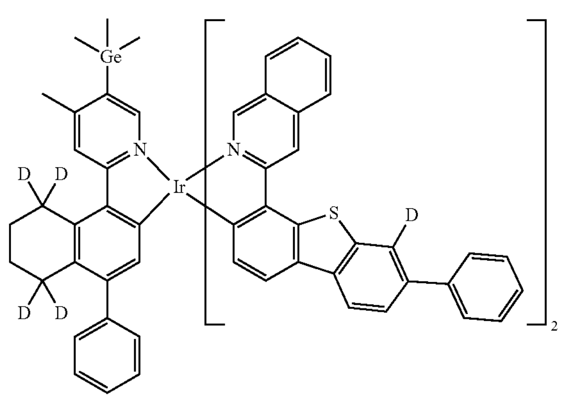
4100
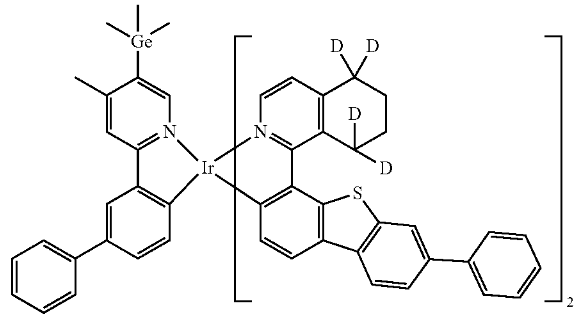
4101
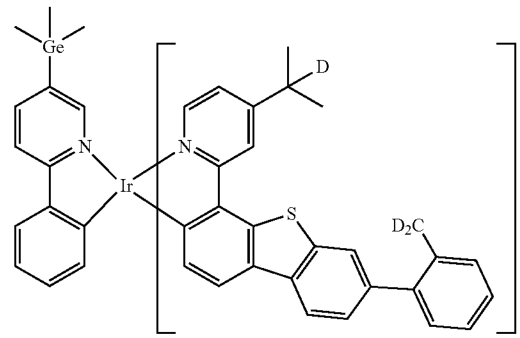
4102
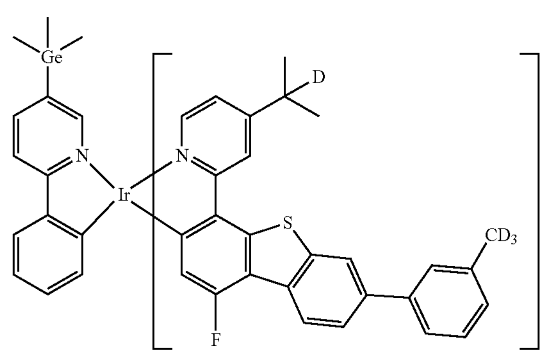
4103
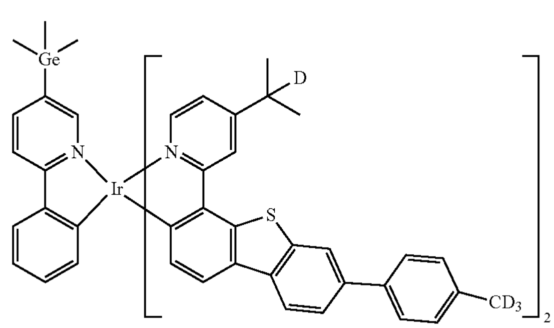

-continued
4104
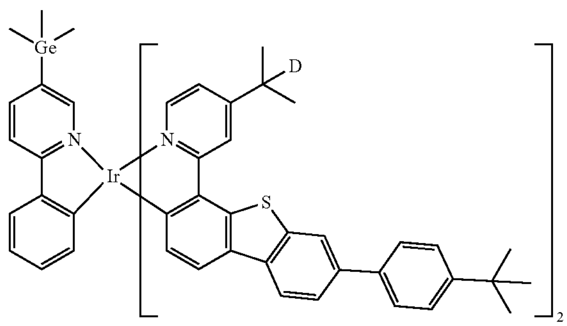
4105
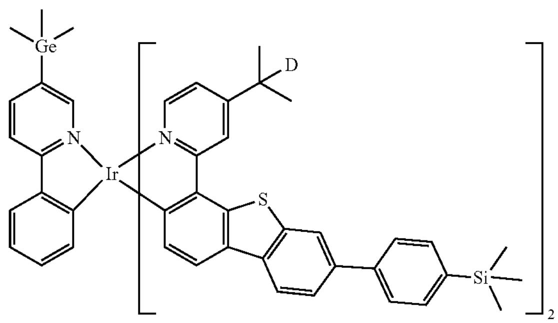
4106
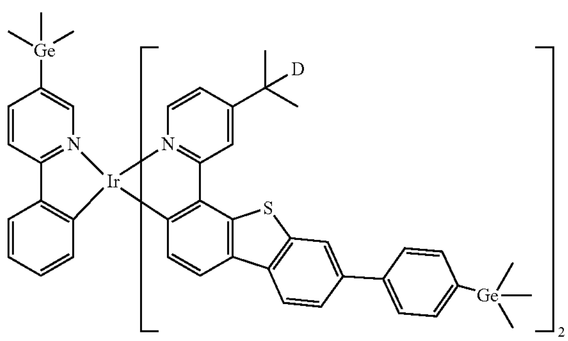
4107
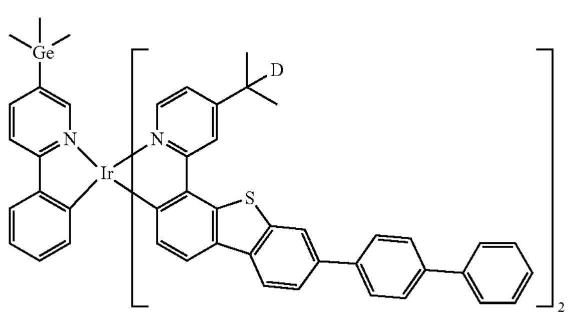
-continued
4108
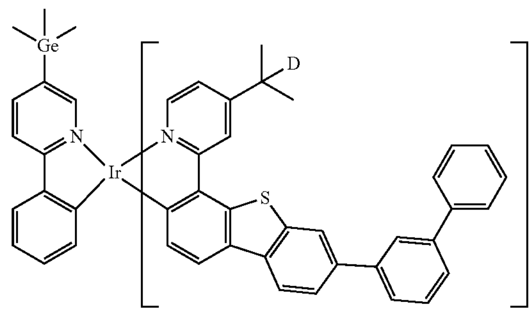
4109
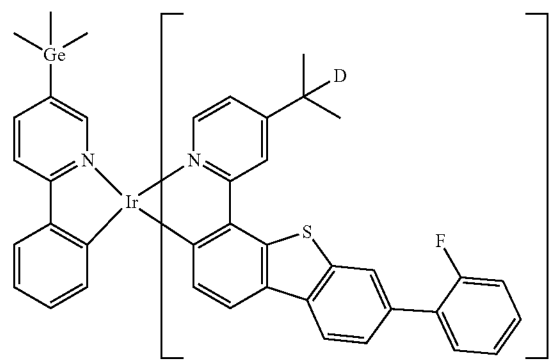
4110
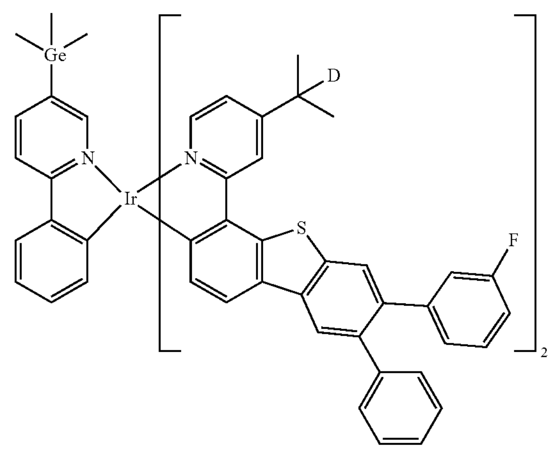
4111
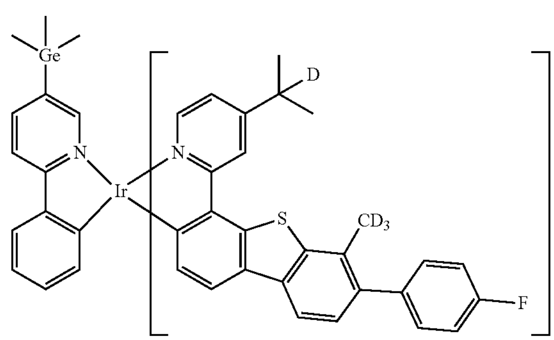

-continued
4112
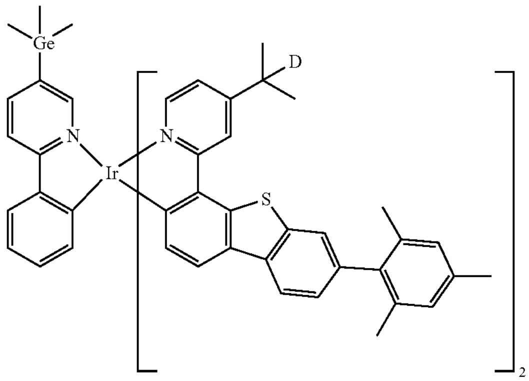
4113
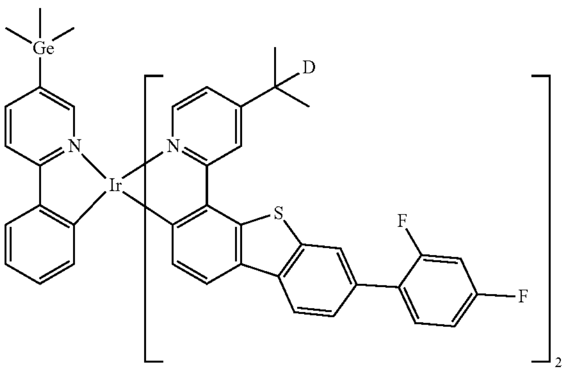
4114
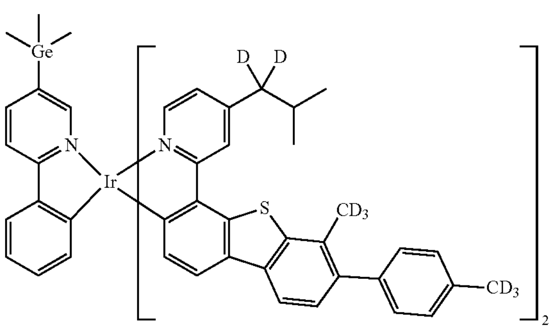
4115
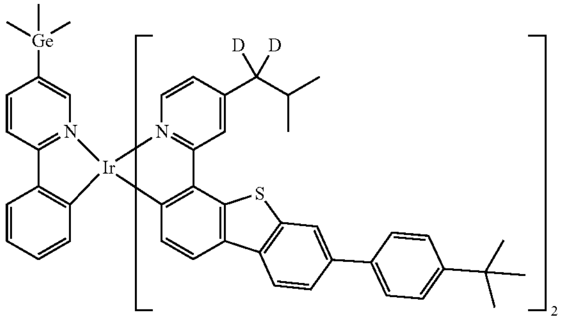
-continued
4116
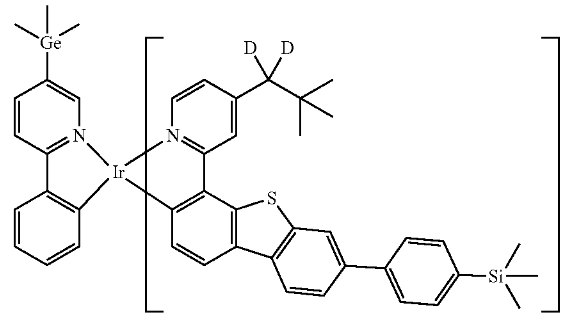
4117
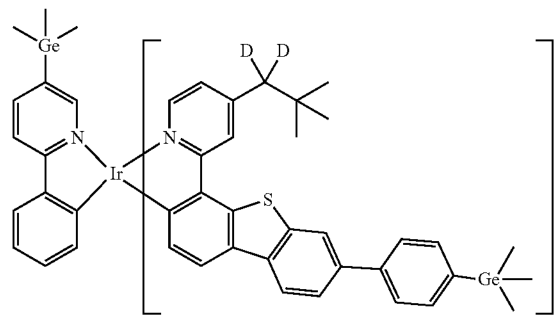
4118
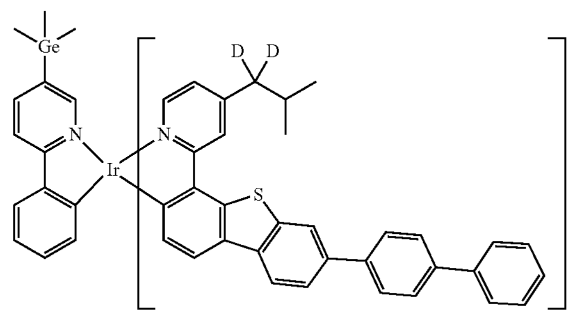
4119
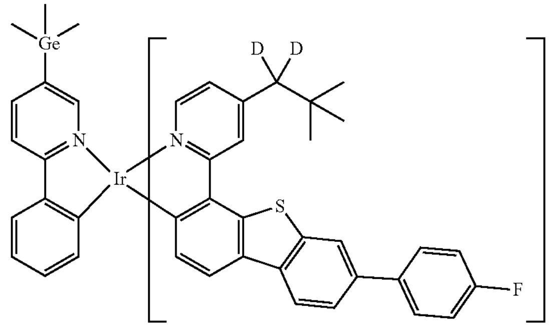

-continued
4120
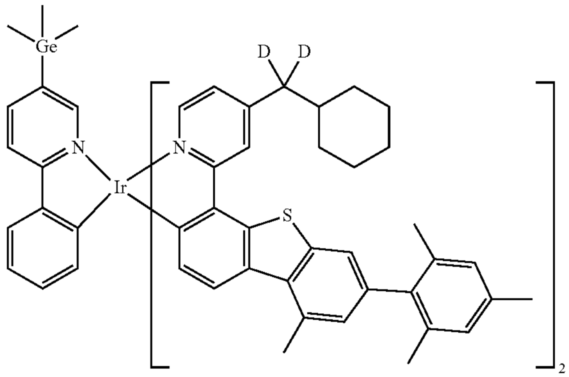
4121
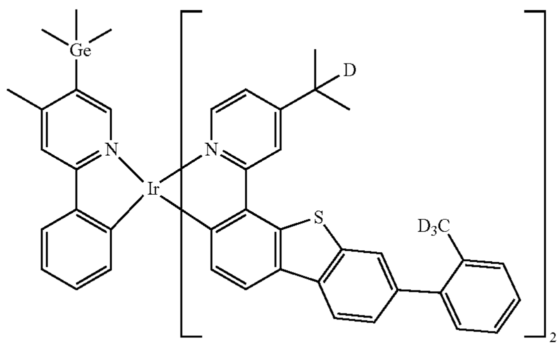
4122
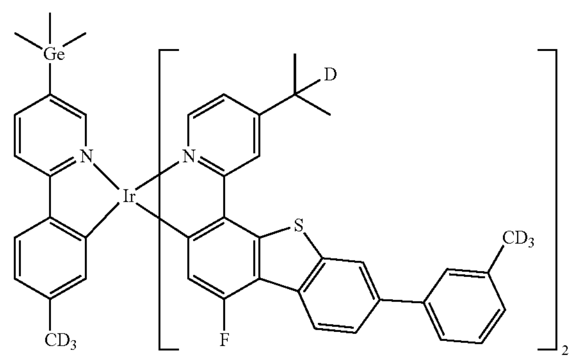
4123
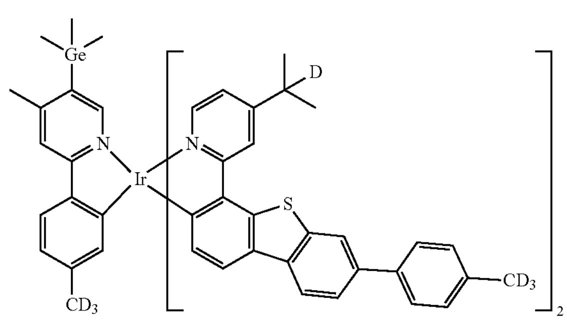
-continued
4124
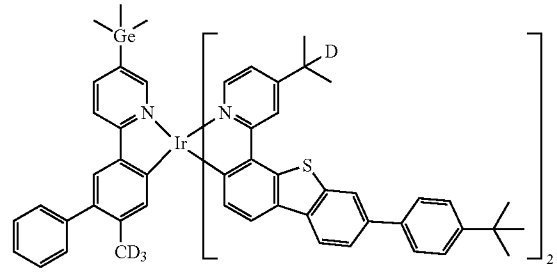
4125
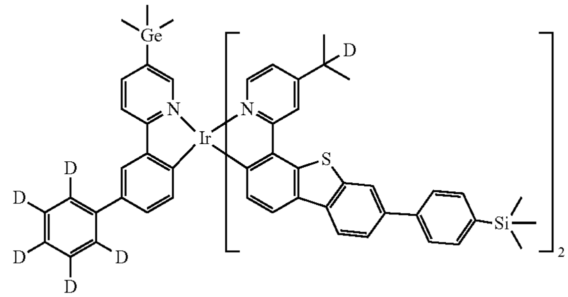
4126
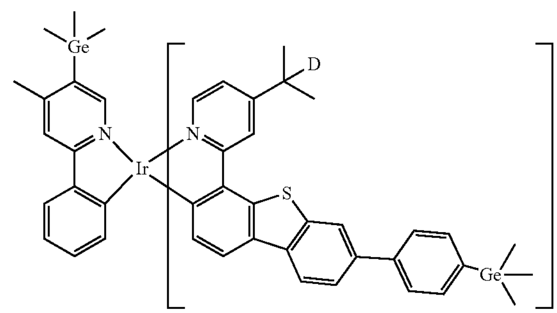
4127
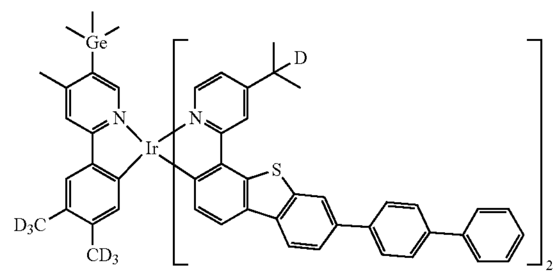
4128
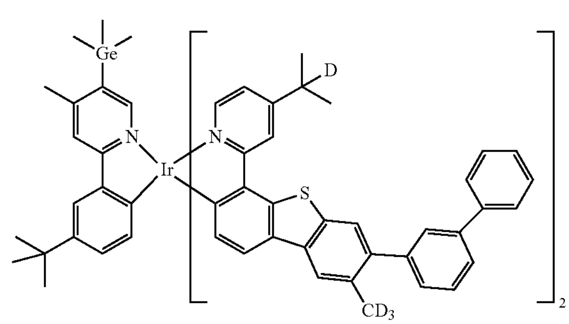

-continued
4129
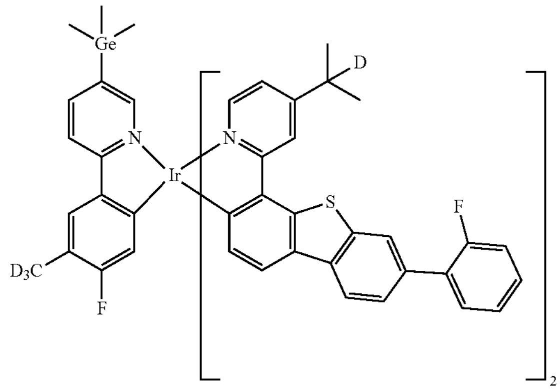
4130
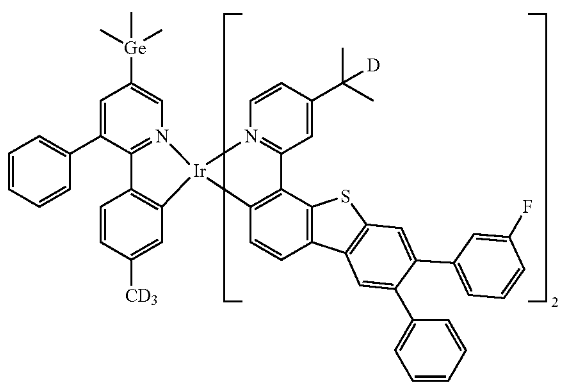
4131
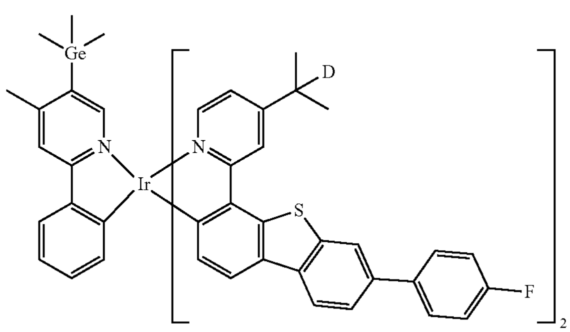
4132
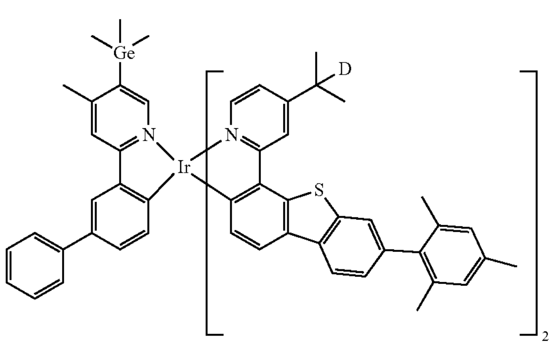
-continued
4133
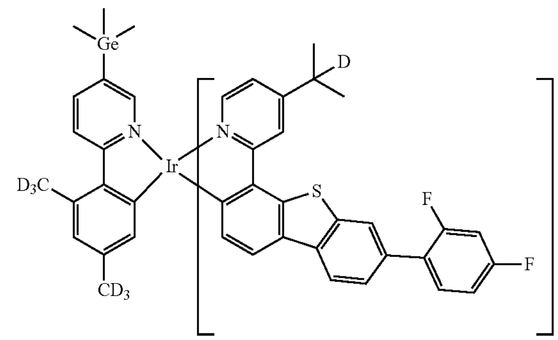
4134
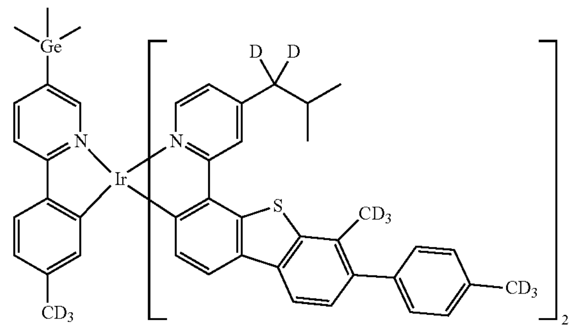
4135
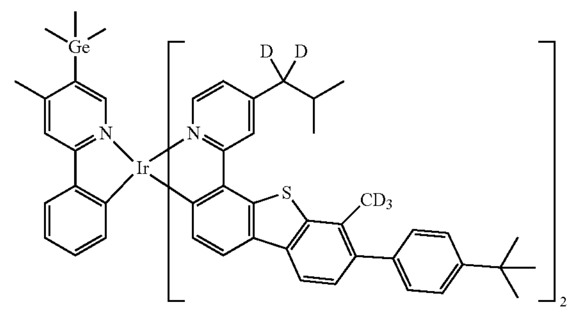
4136
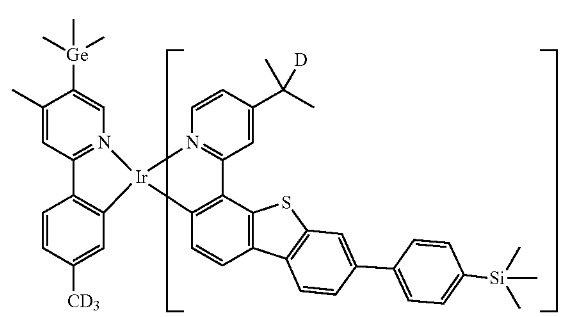

-continued
4137
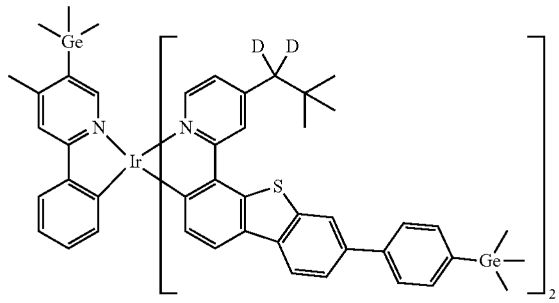
4138
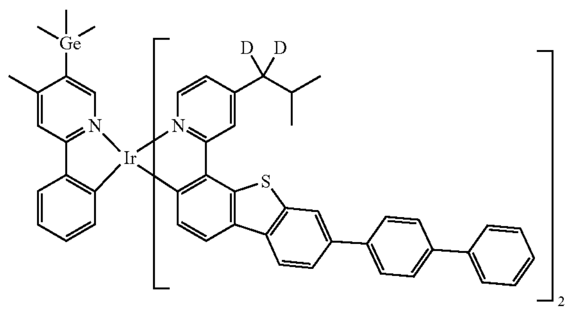
4139
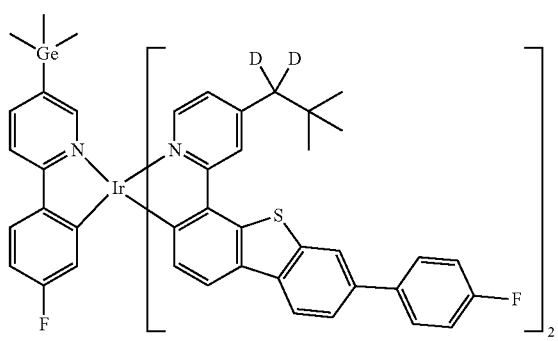
4140
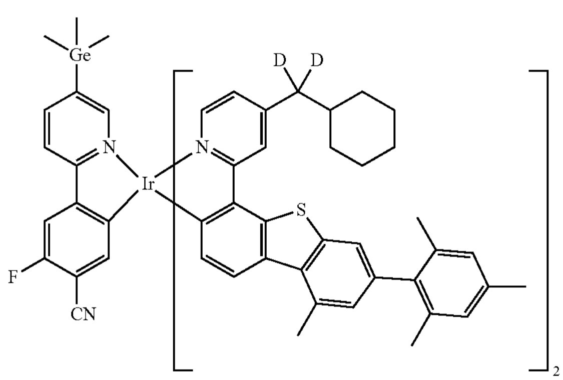
-continued
4141
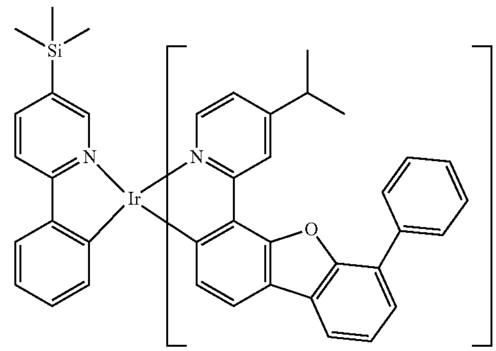
4142
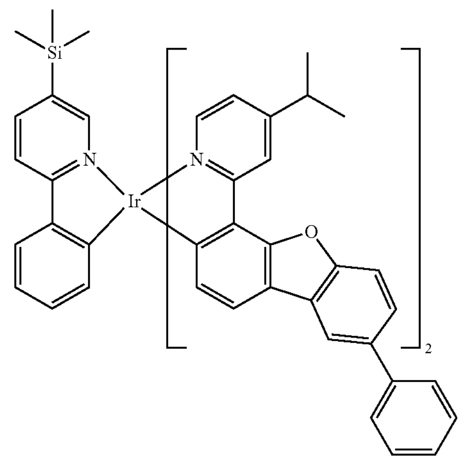
4143
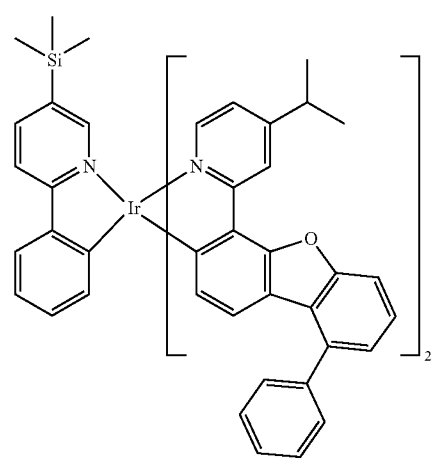

4144
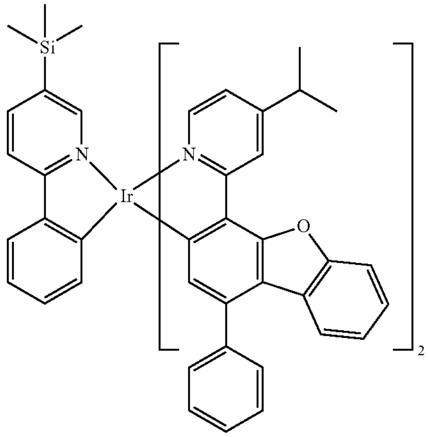
4145
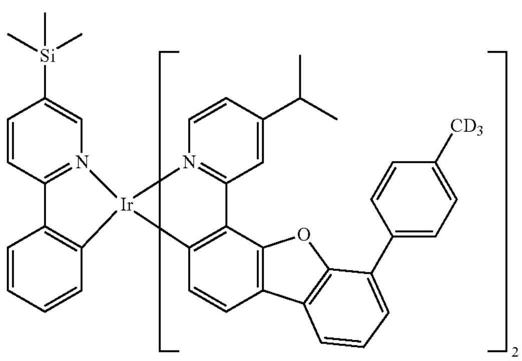
4146
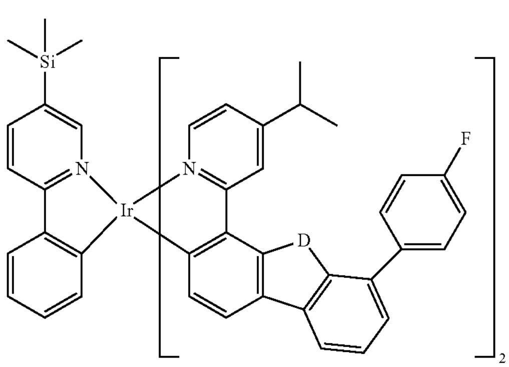
4147
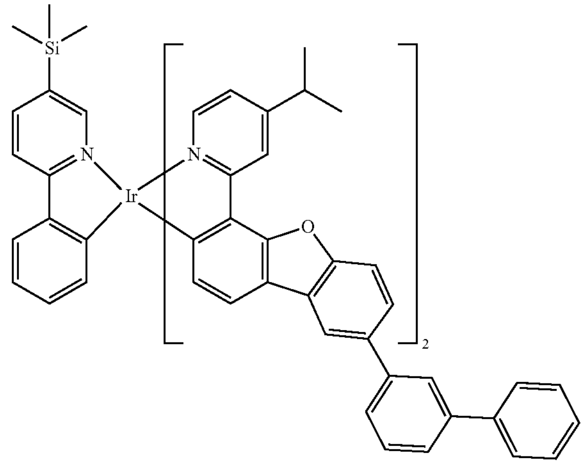
4148
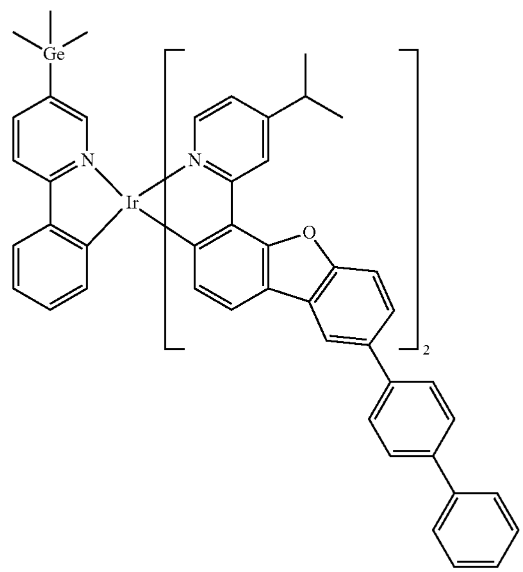
4149
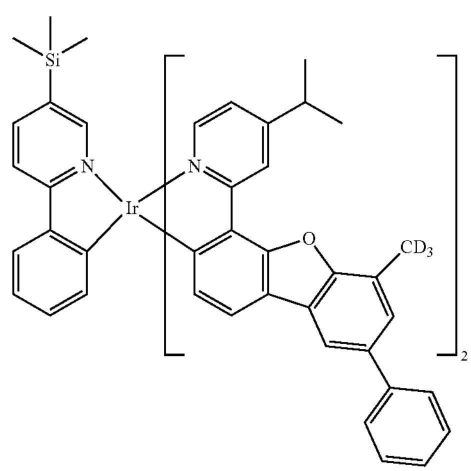

-continued
4150
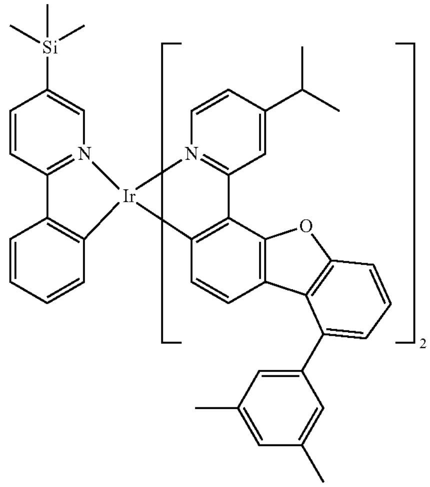
4151
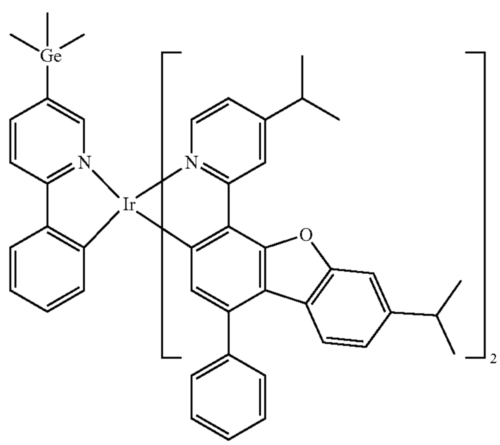
4152
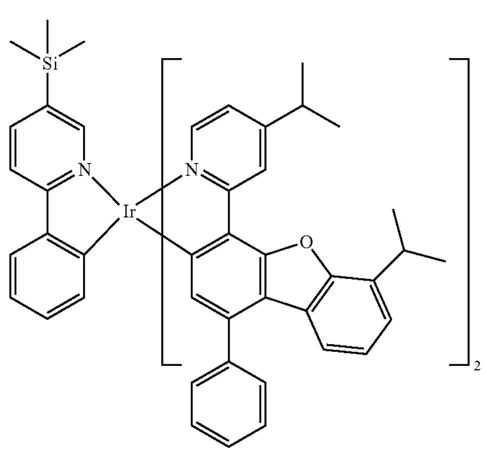
-continued
4153
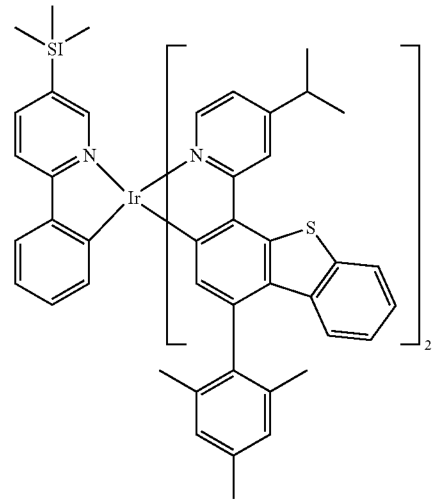
4154
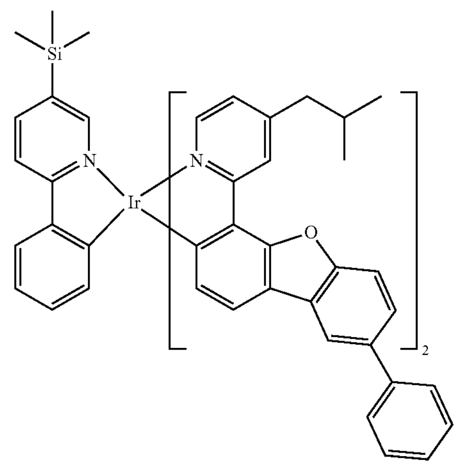
4155
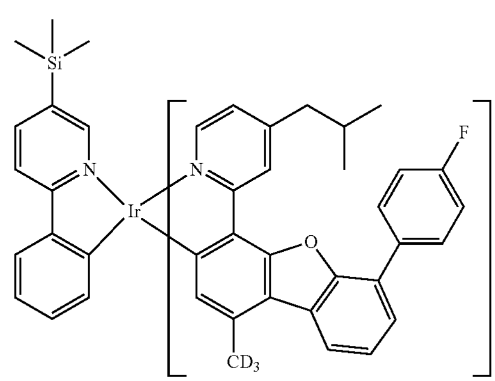

-continued
4156
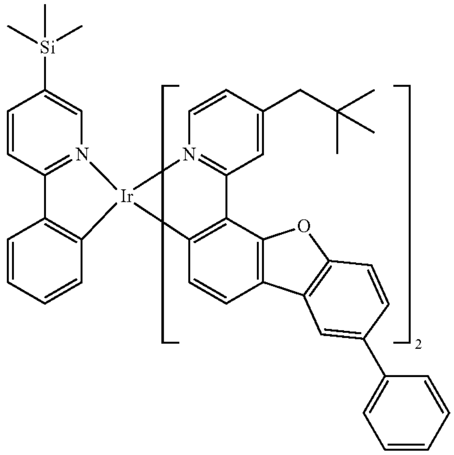
4157
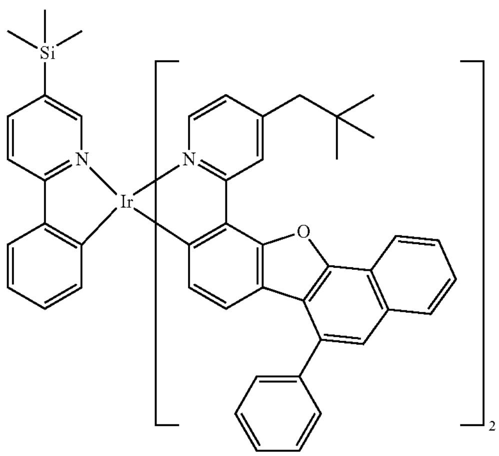
4158
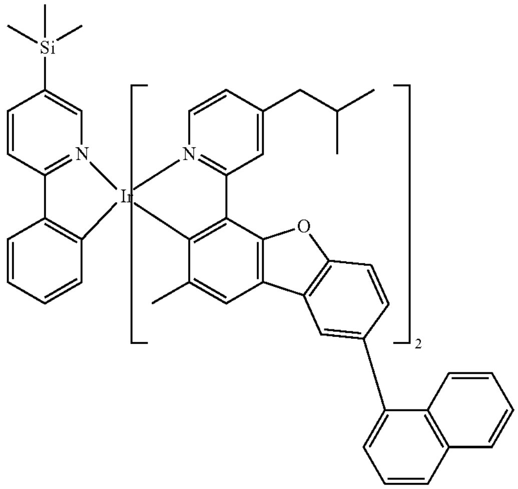
-continued
4159
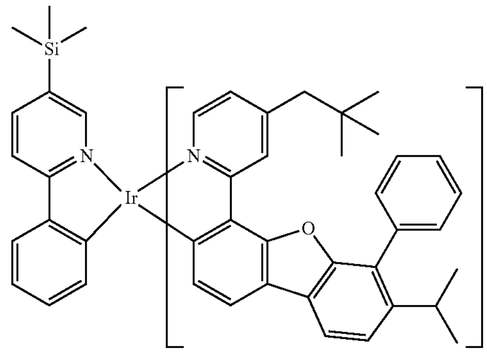
4160
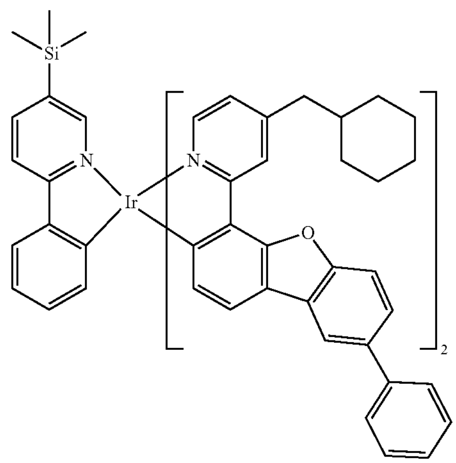
4161
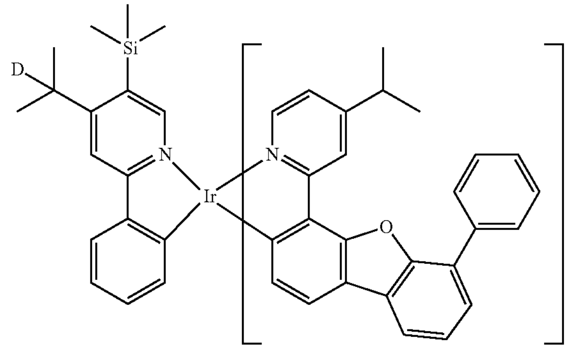

-continued
4162
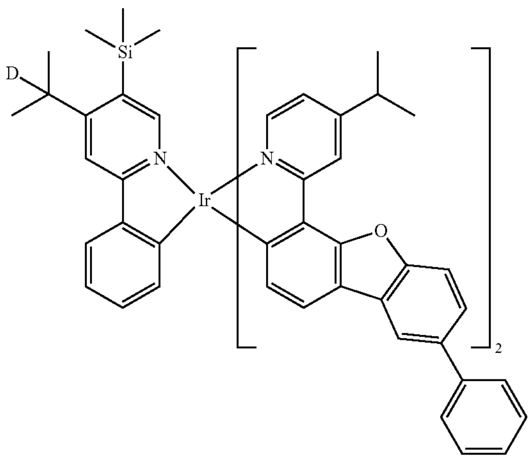
4163
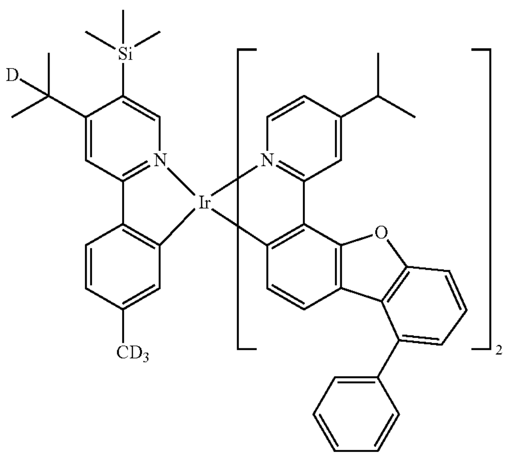
4164
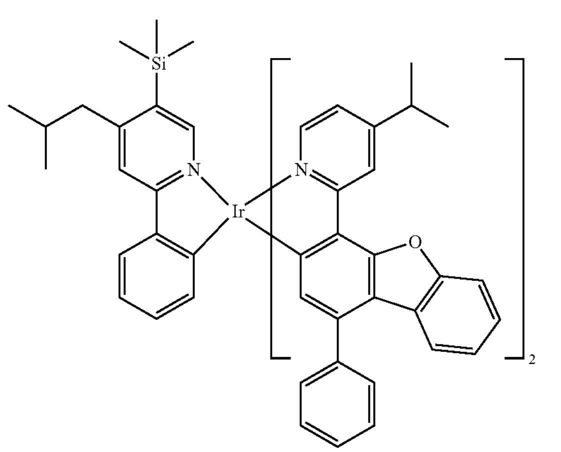
-continued
4165
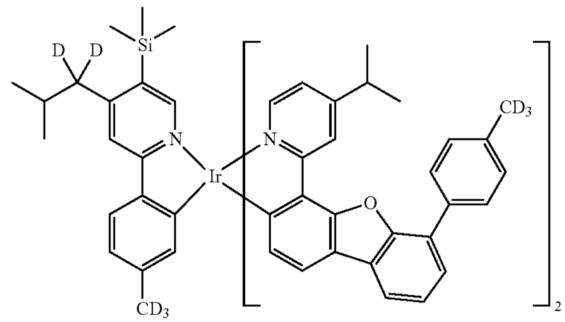
4166
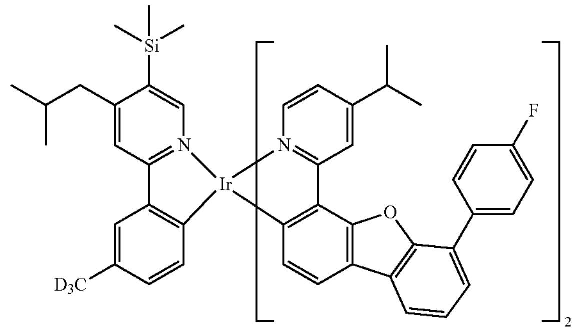
4167
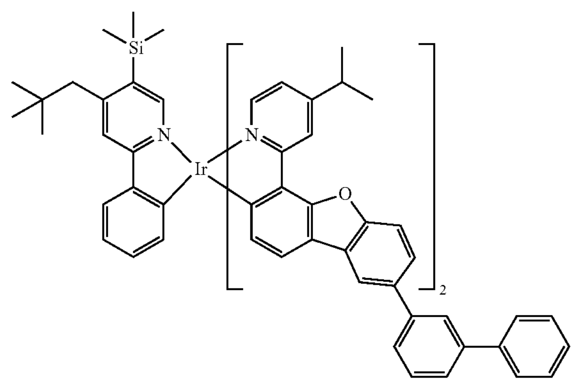
4168
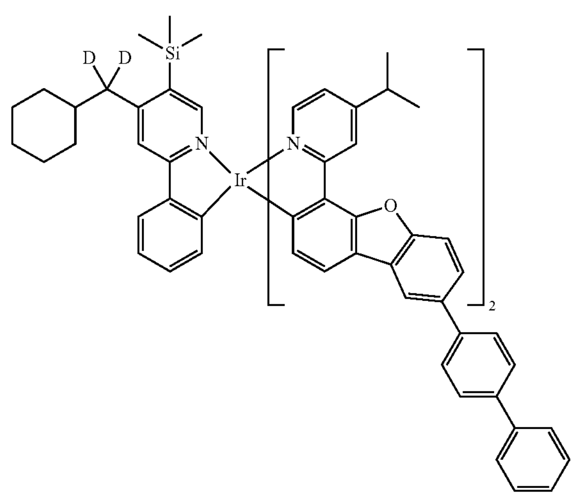

-continued
4169
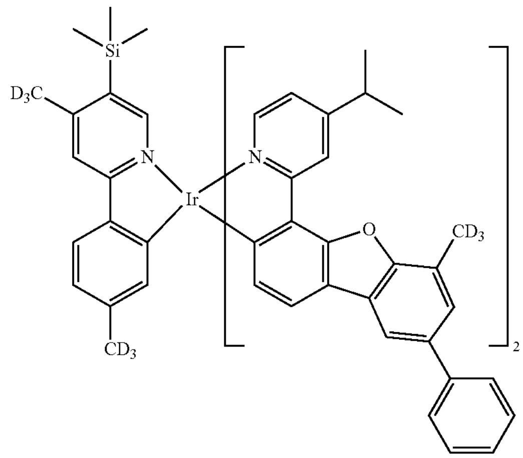
4170
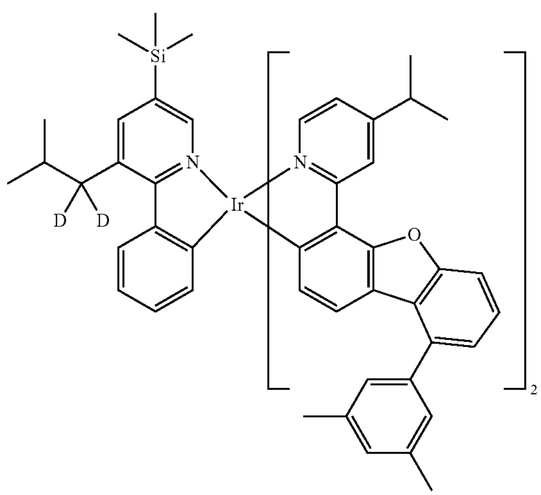
4171
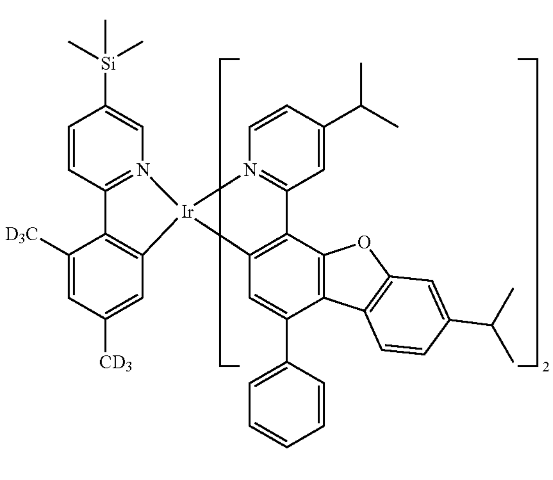
-continued
4172
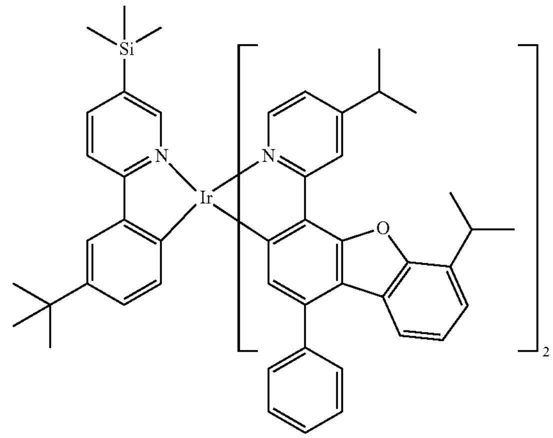
4173
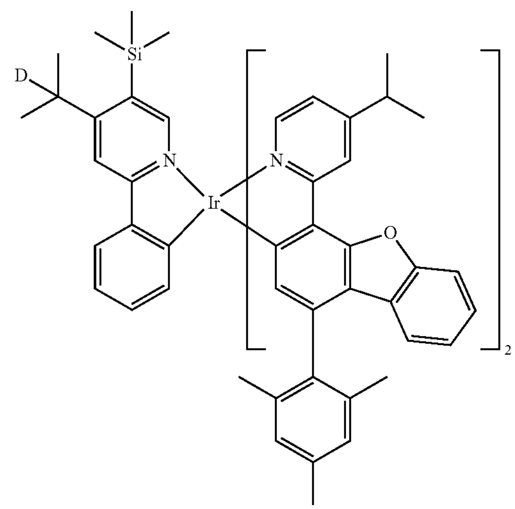
4174
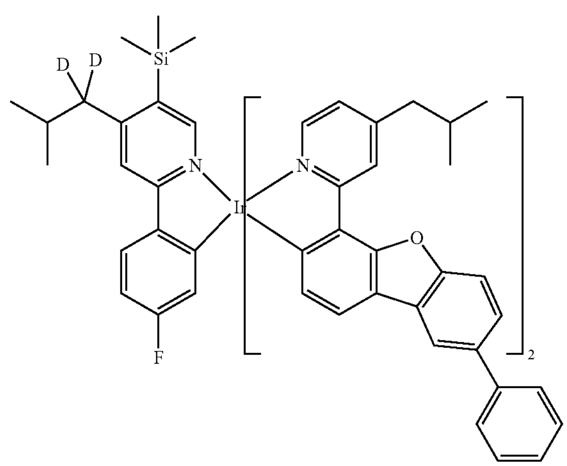

-continued
4175
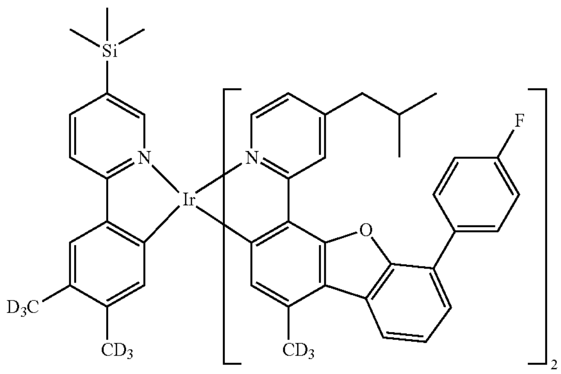
4176
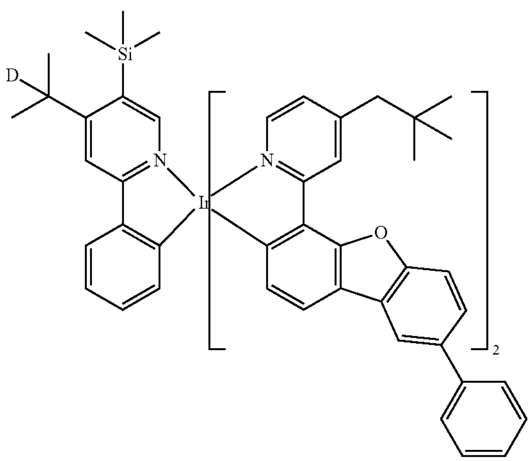
4177
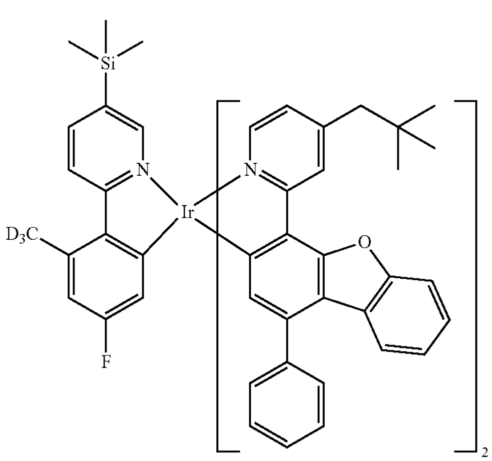
-continued
4178
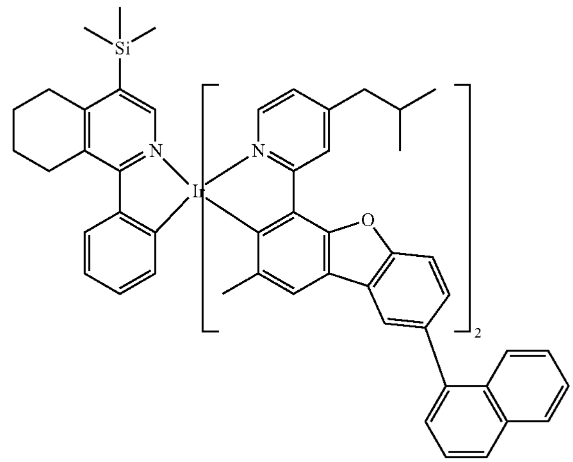
4179
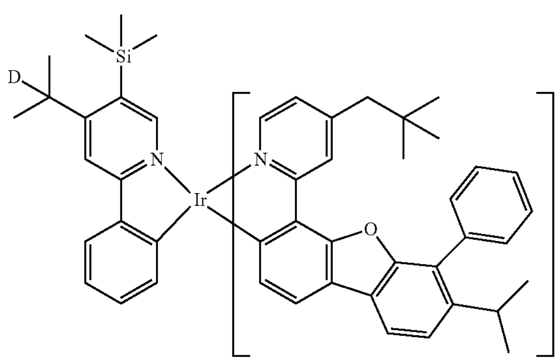
4180
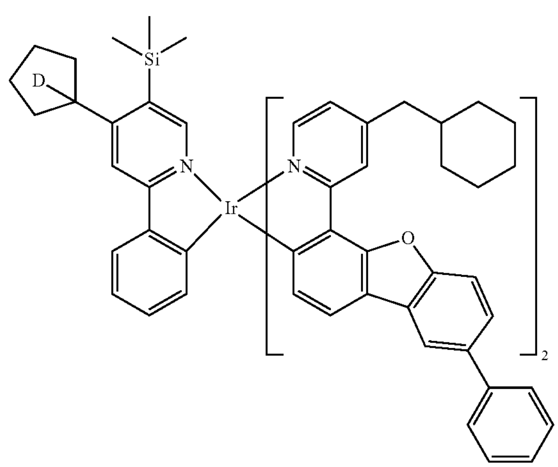

-continued
4181
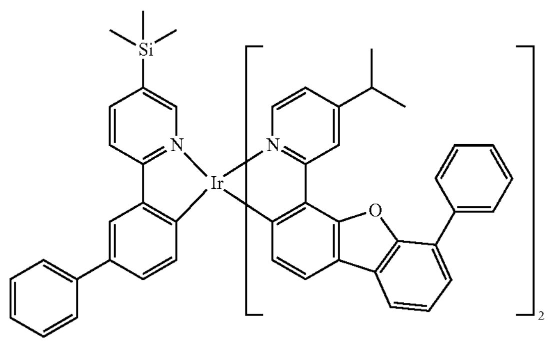
4182
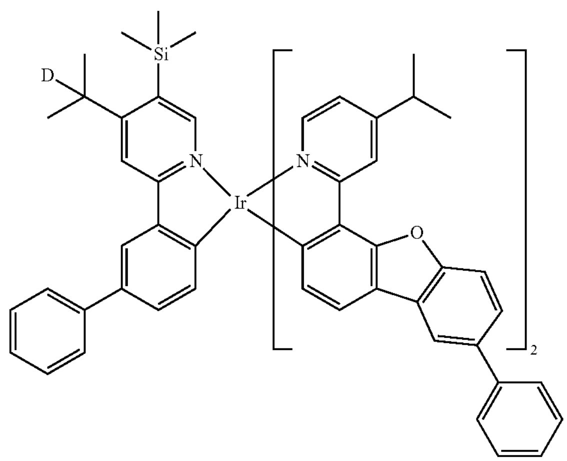
4183
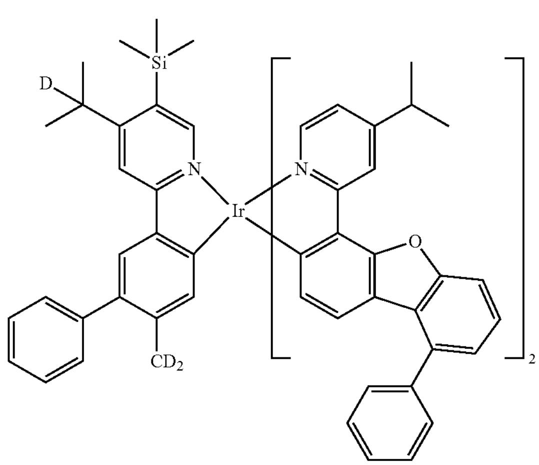
-continued
4184
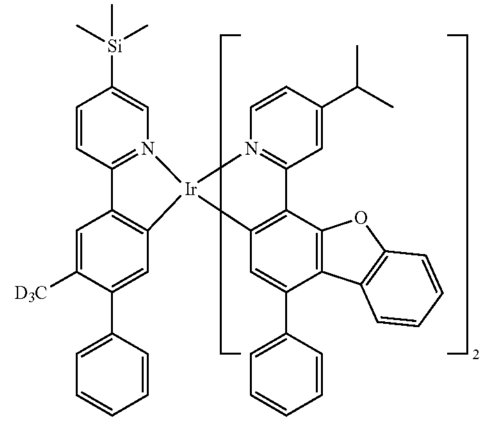
4185
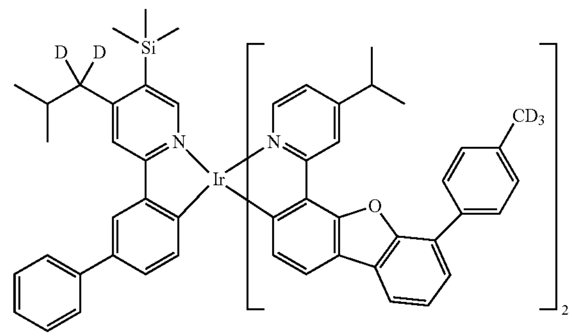
4186
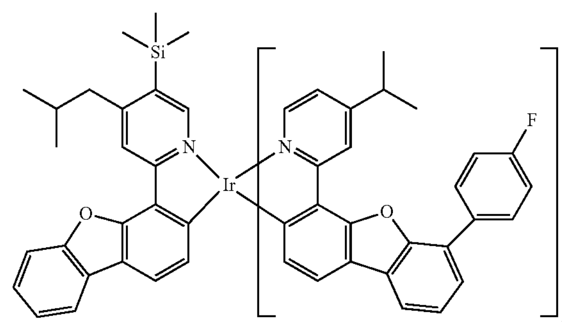
4187
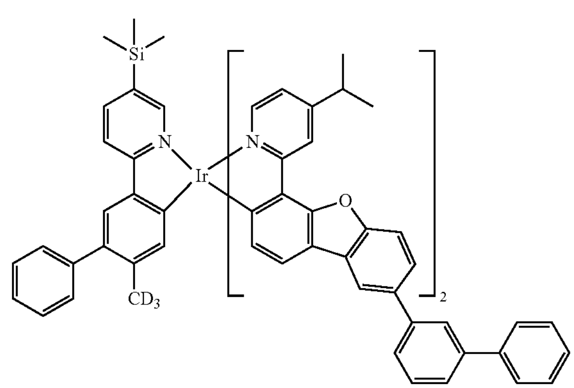

-continued
4188
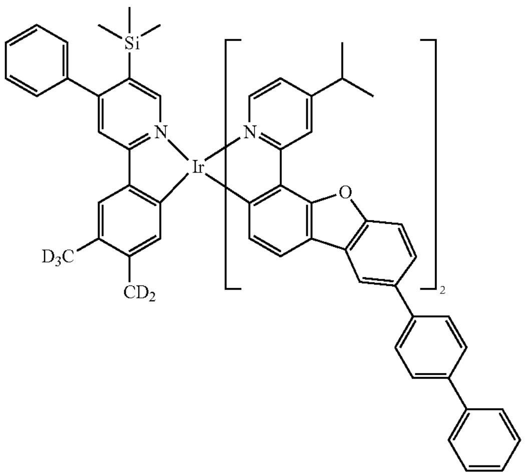
4189
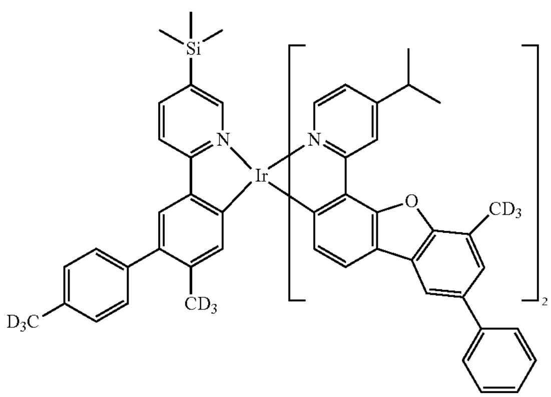
4190
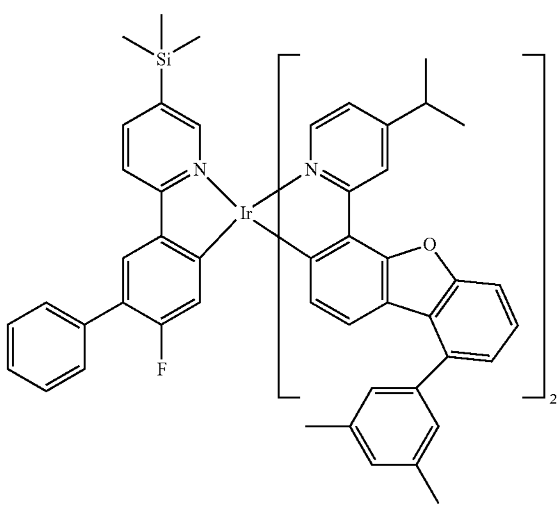
-continued
4191
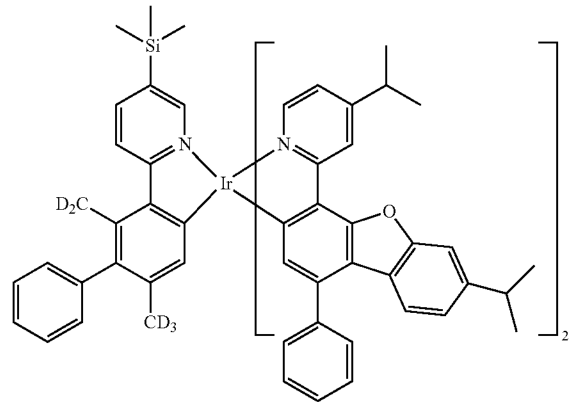
4192
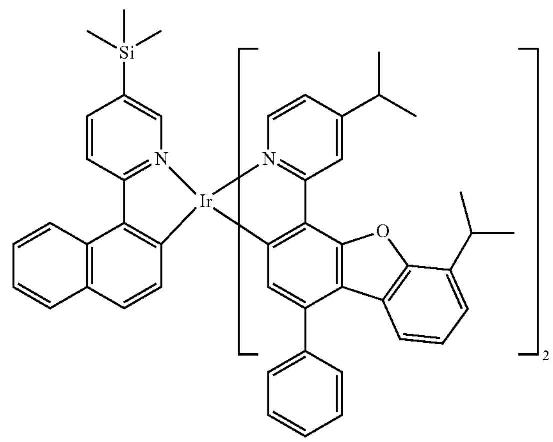
4193
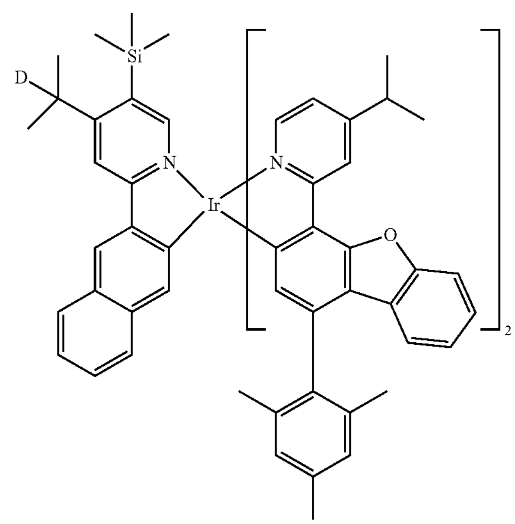

4194
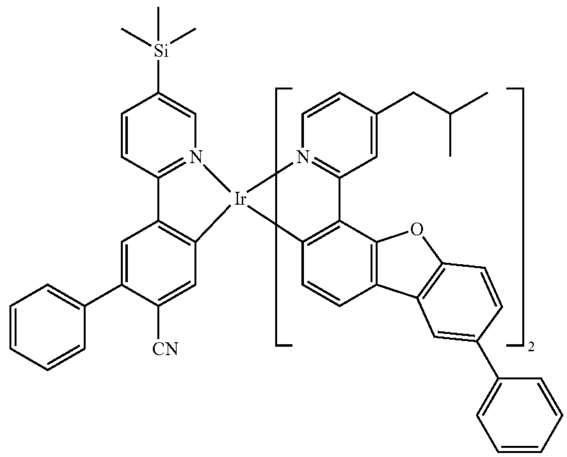
4195
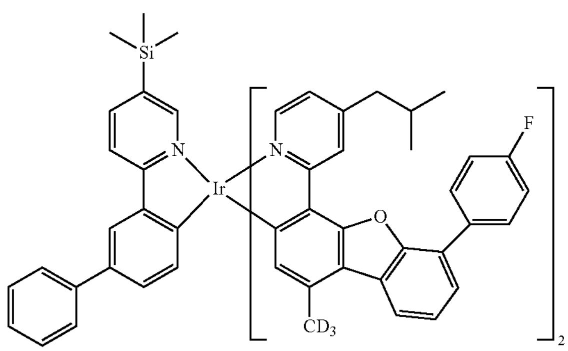
4196
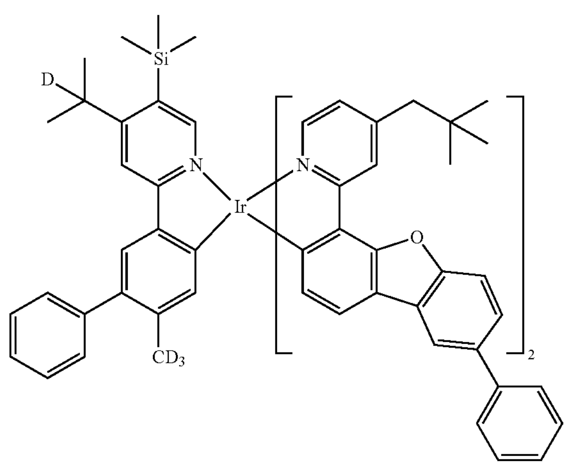
-continued
4197
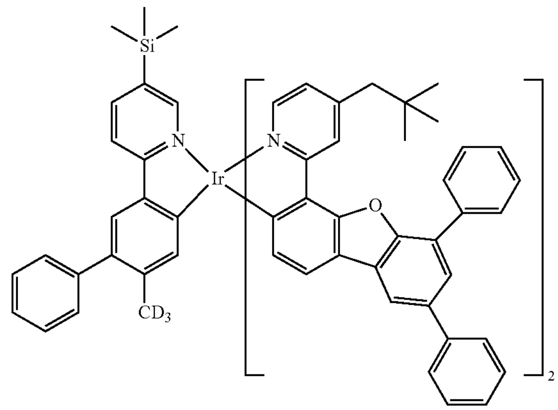
4198
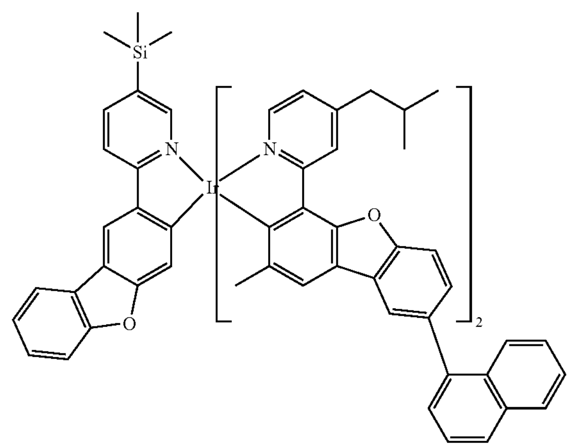
4199
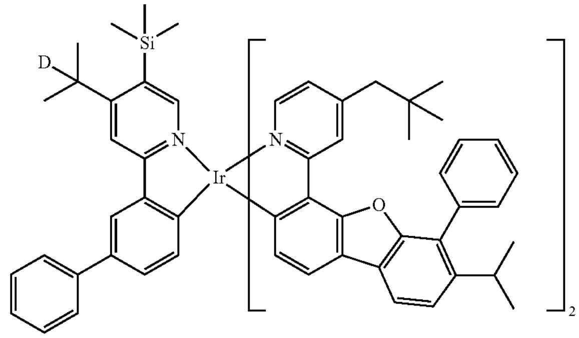

-continued
4200
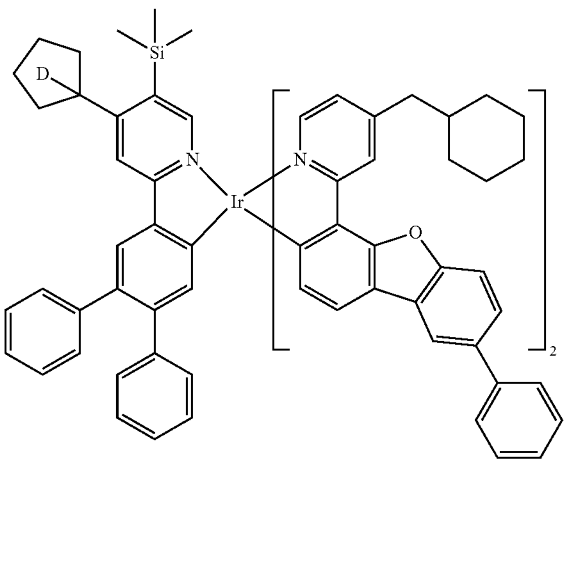
4201
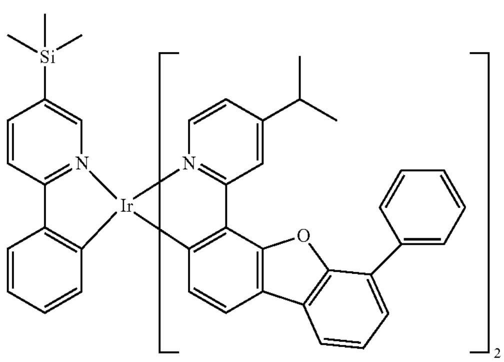
4202
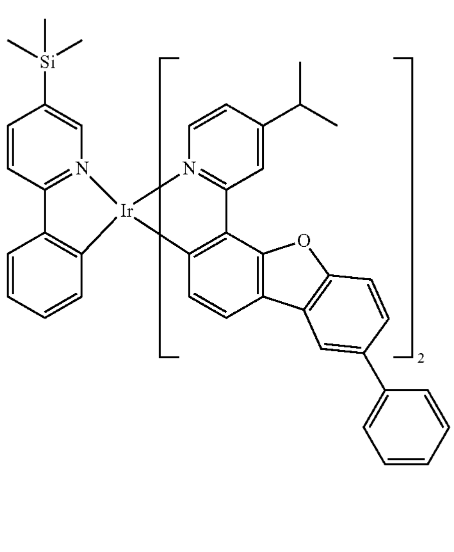
-continued
4203
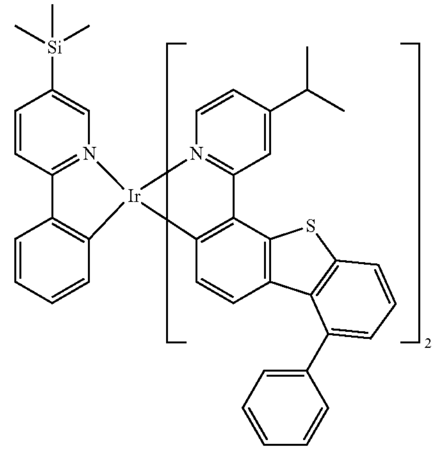
4204
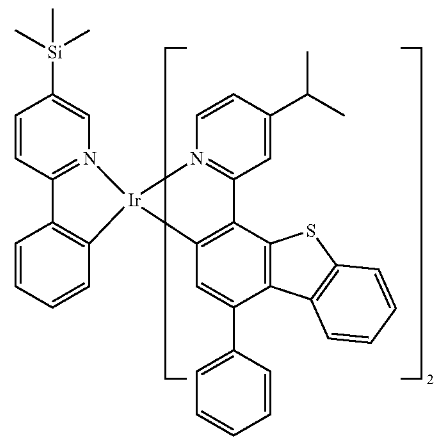
4205
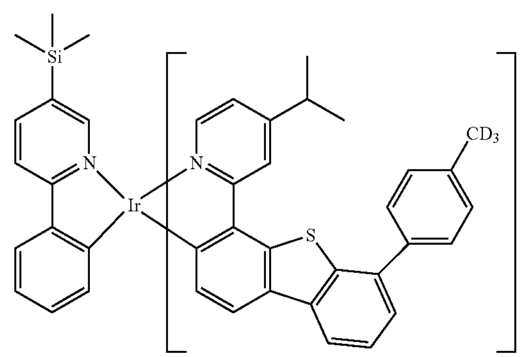
4206
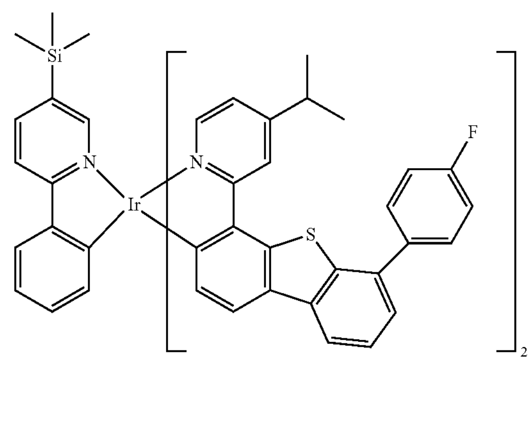

-continued
4207
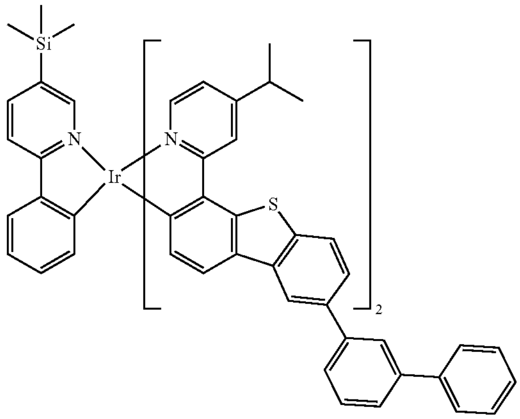
4208
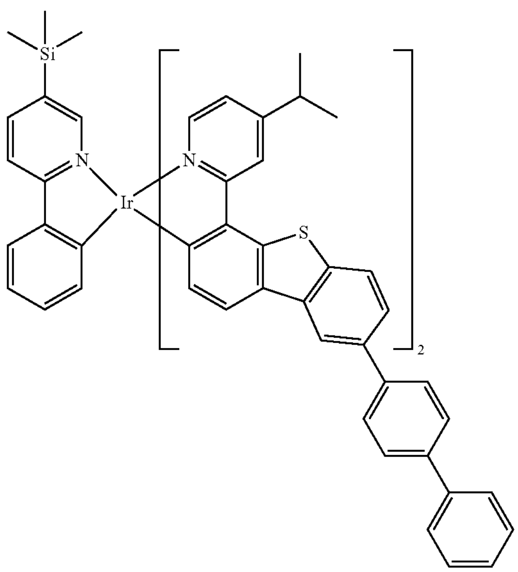
4209
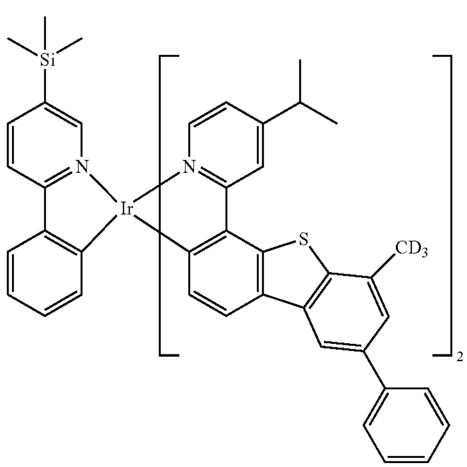
-continued
4210
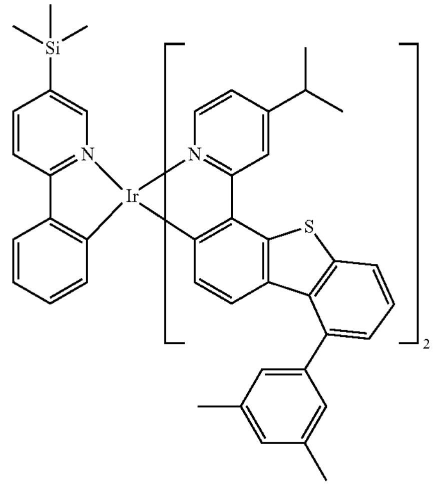
4211
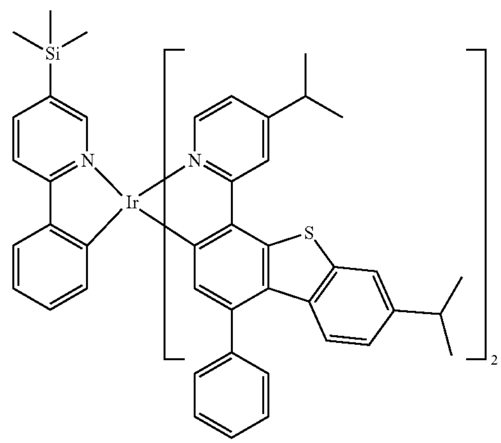
4212
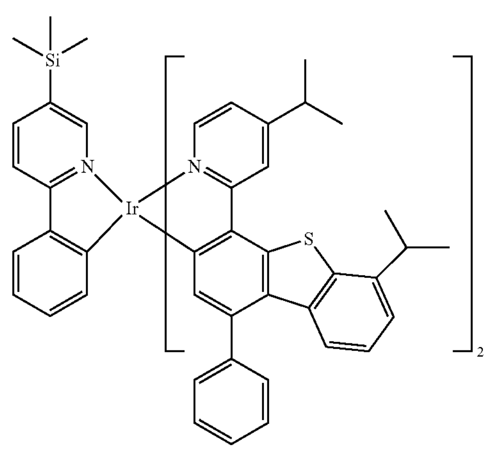

-continued
4213
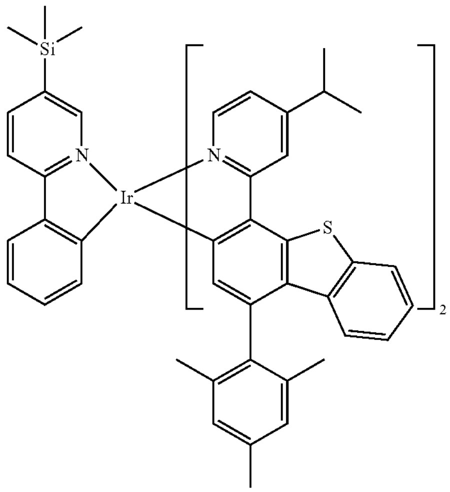
4214
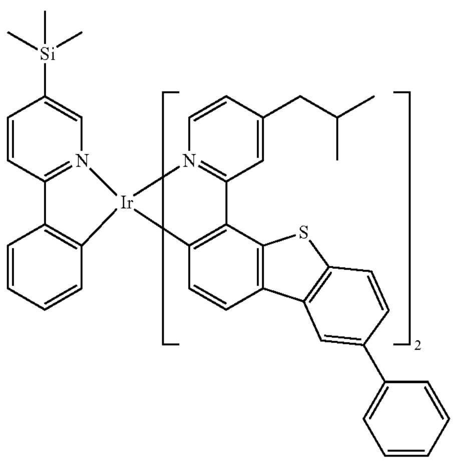
4215
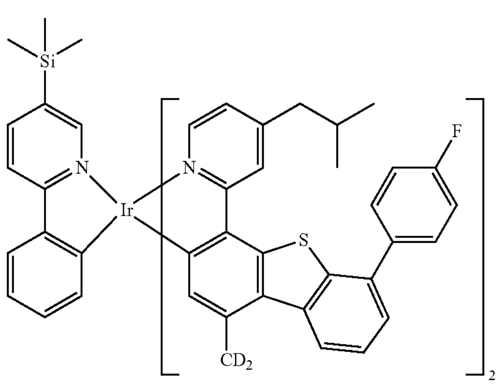
-continued
4216
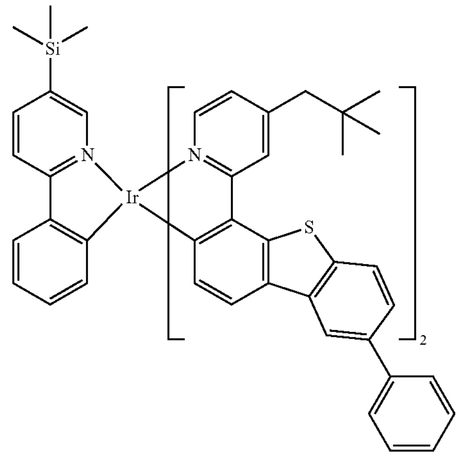
4217
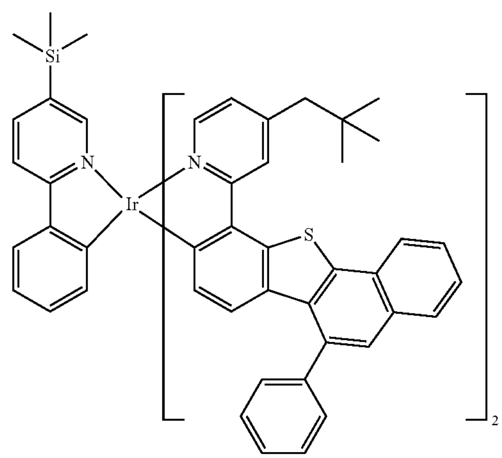
4218
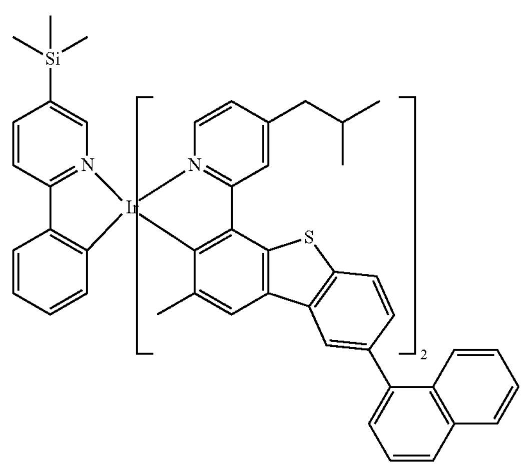

-continued
4219
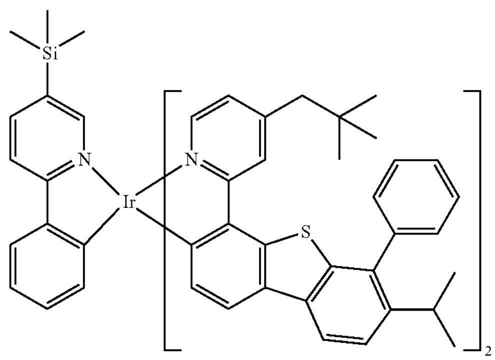
4220
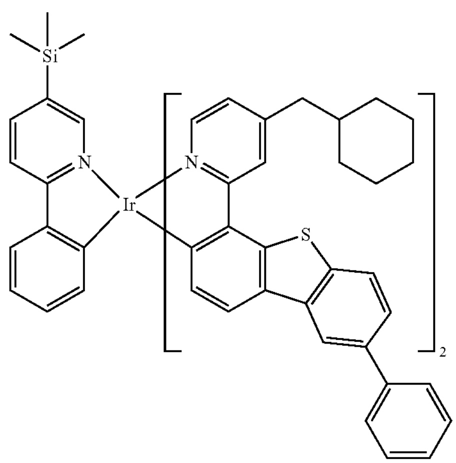
4221
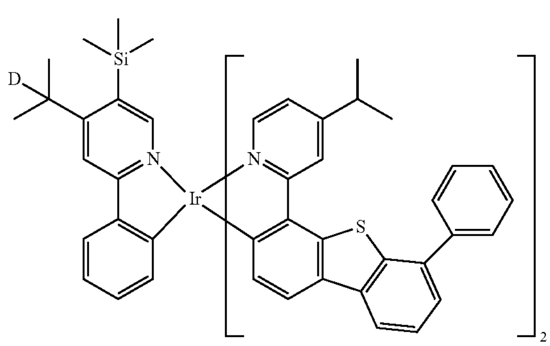
-continued
4222
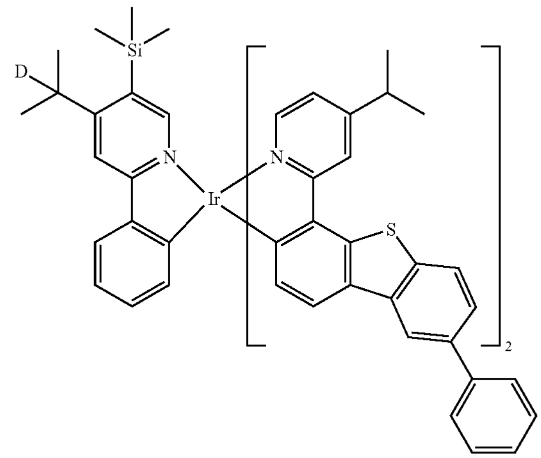
4223
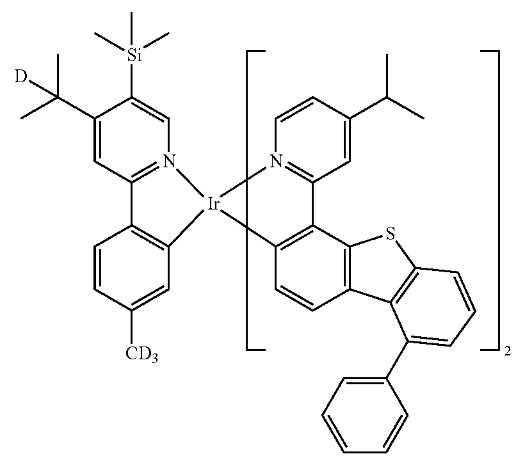
4224
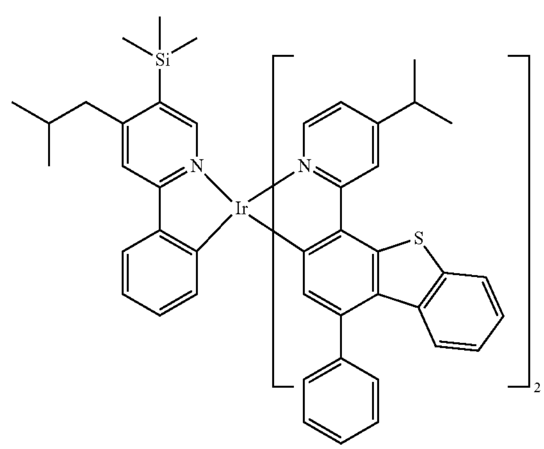

4225
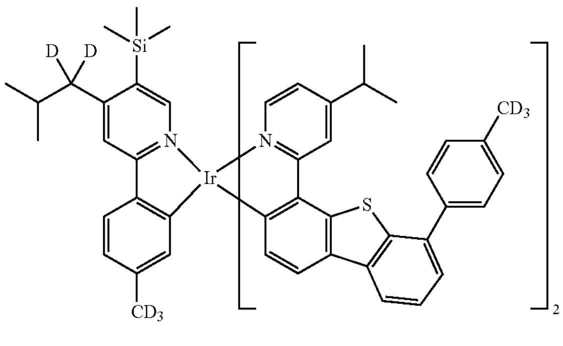
4226
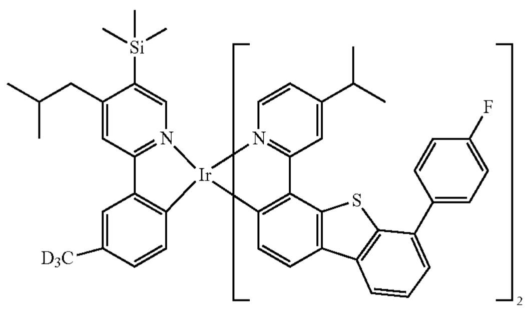
4227
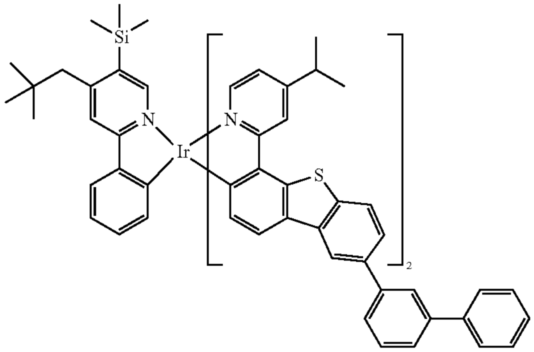
4228
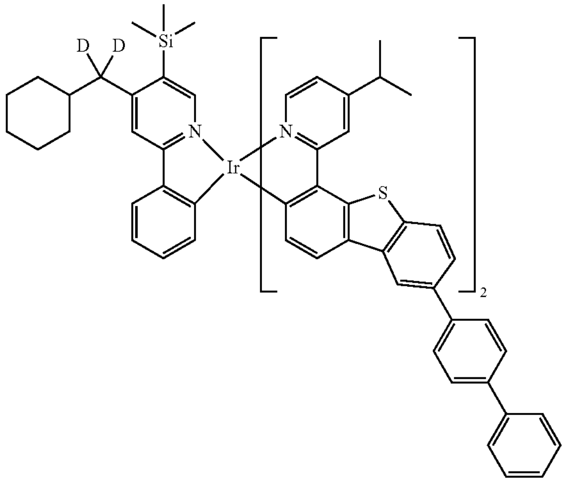
4229
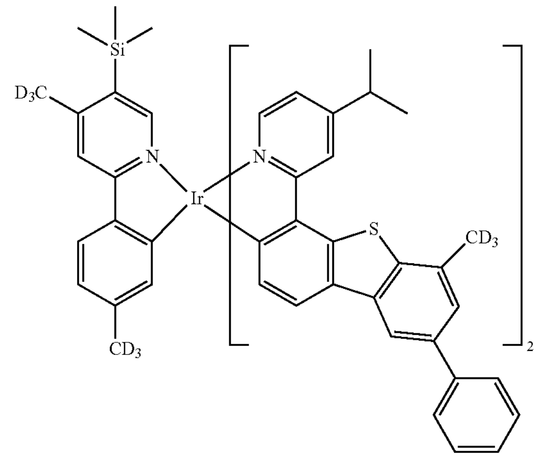
4230
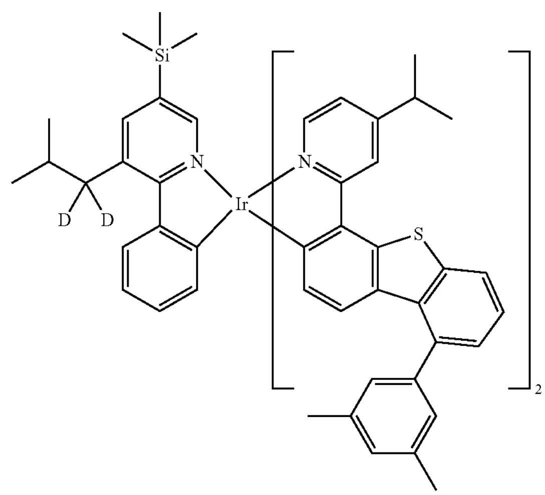
4231
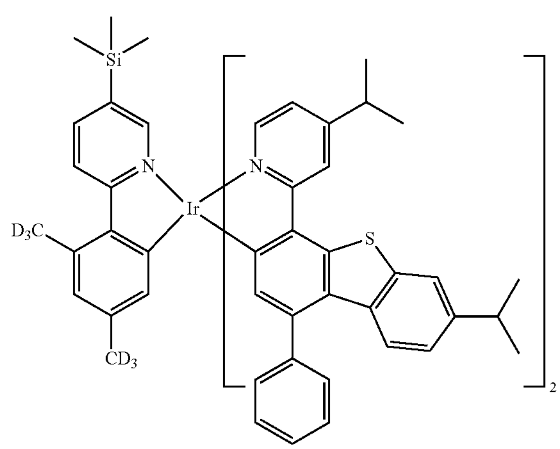

-continued
4232
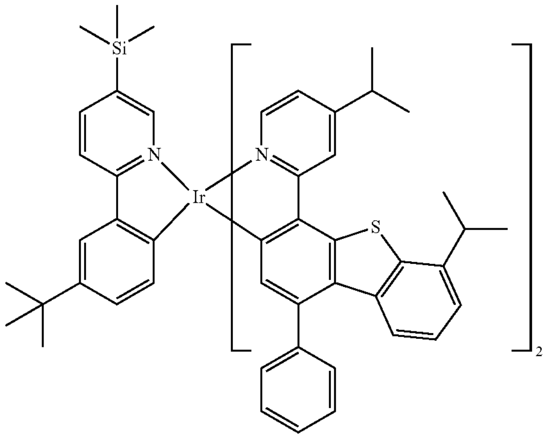
4233
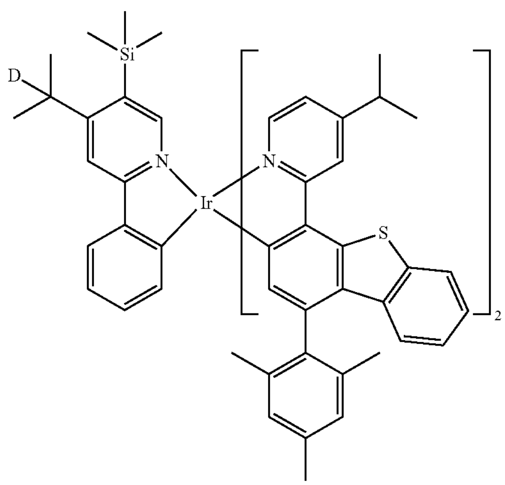
4234
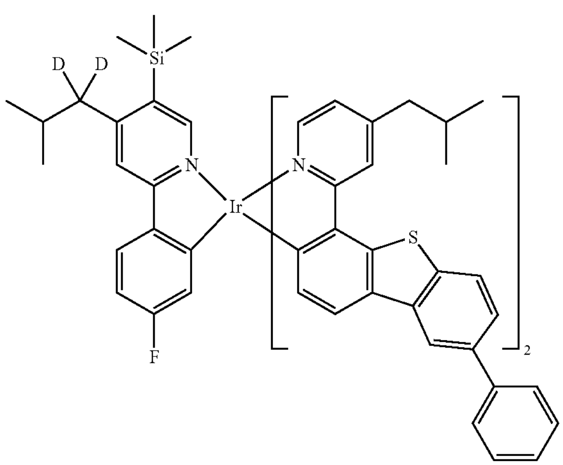
-continued
4235
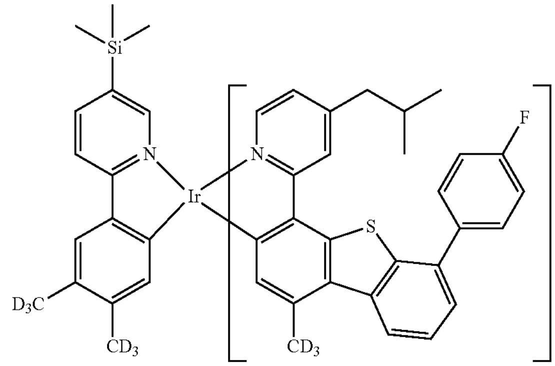
4236
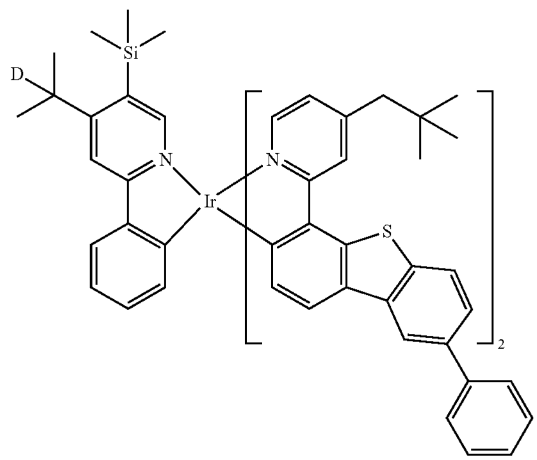
4237
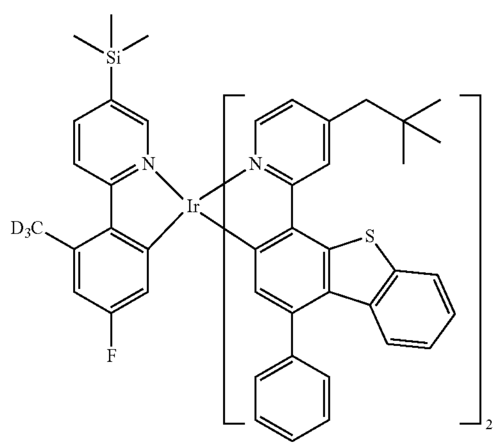

-continued
4238
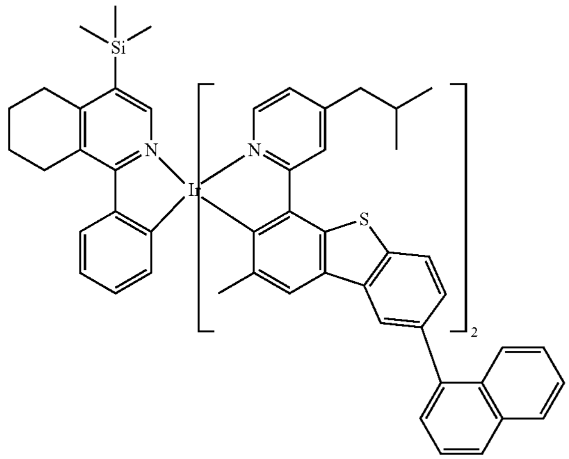
4239
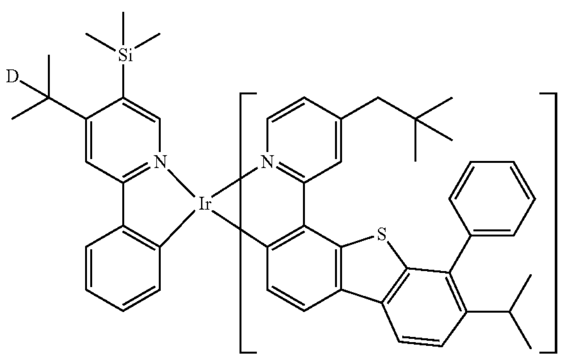
4240
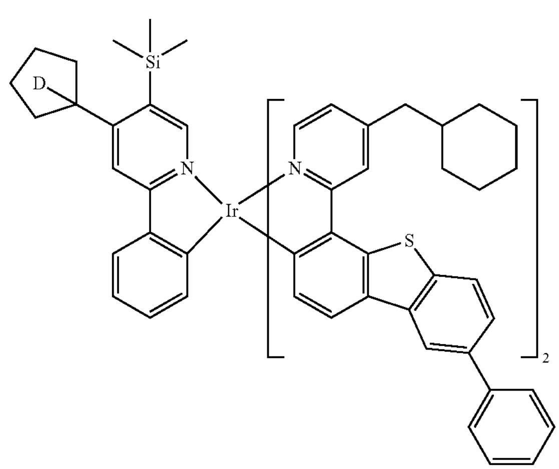
-continued
4241
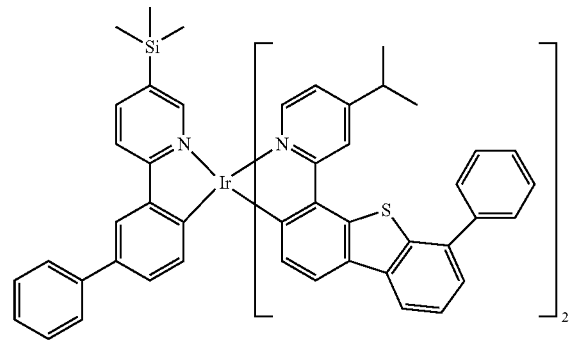
4242
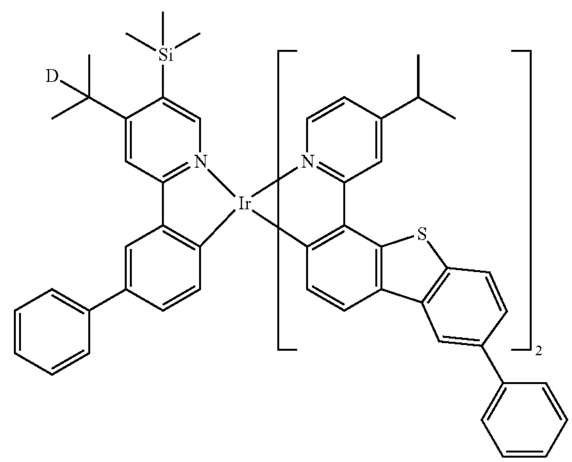
4243
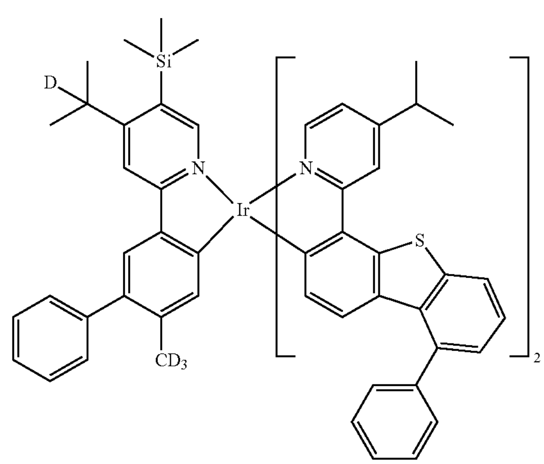

-continued
4244
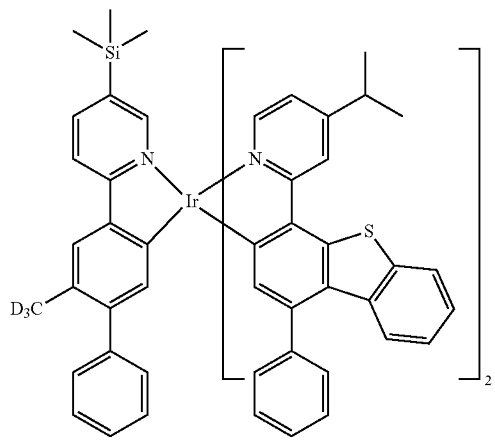
4245
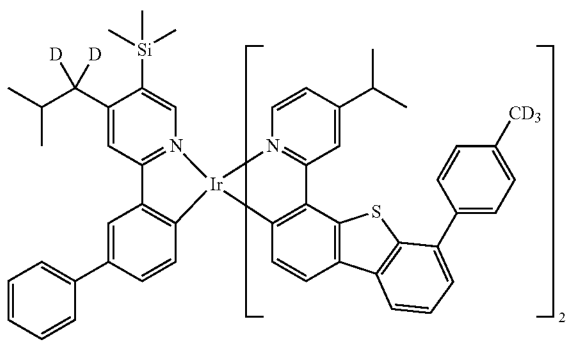
4246
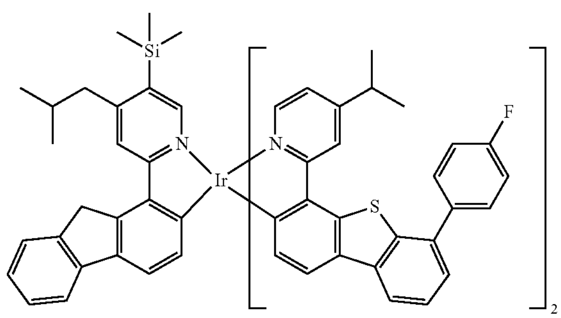
4247
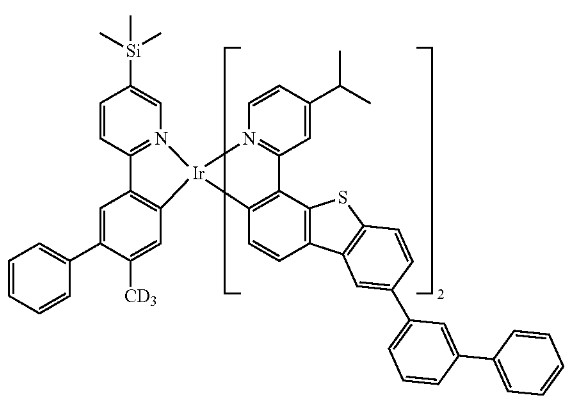
-continued
4248
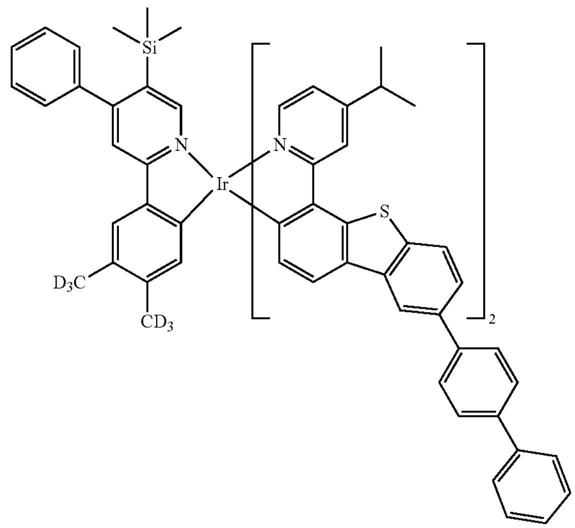
4249
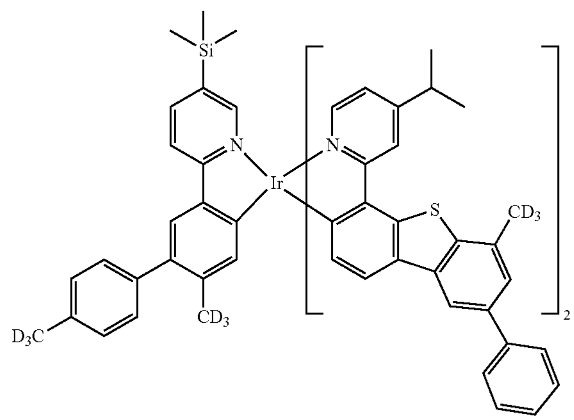
4250
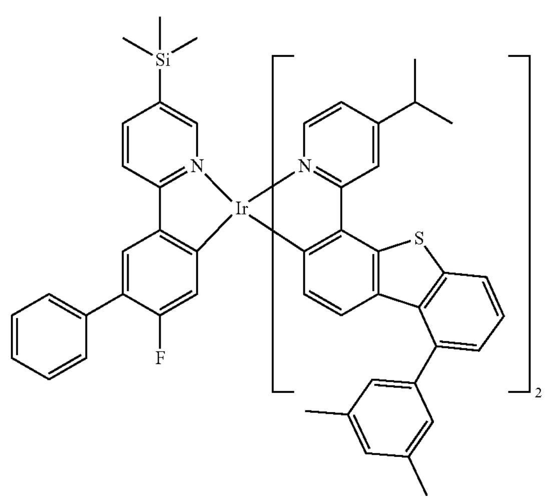

-continued
4251
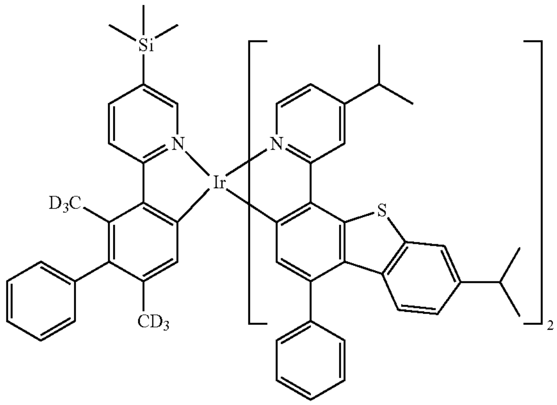
4252
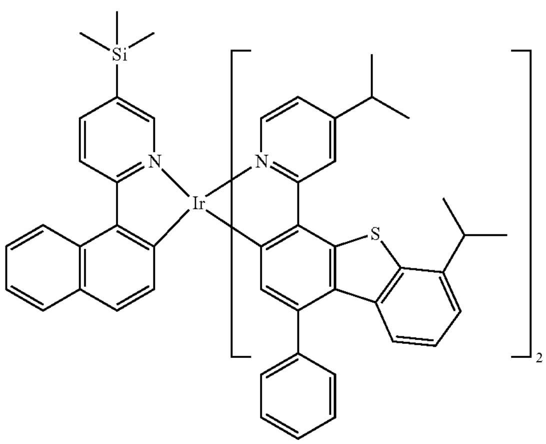
4253
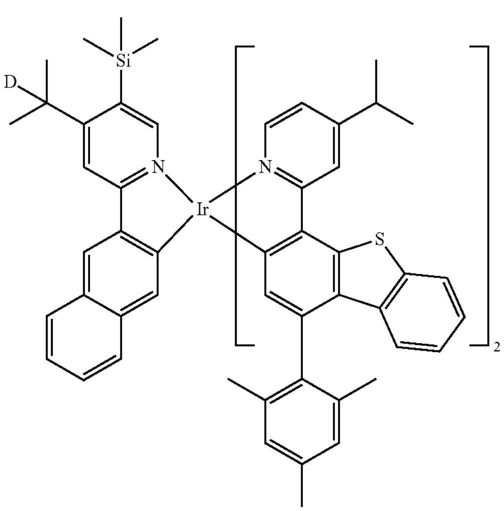
-continued
4254
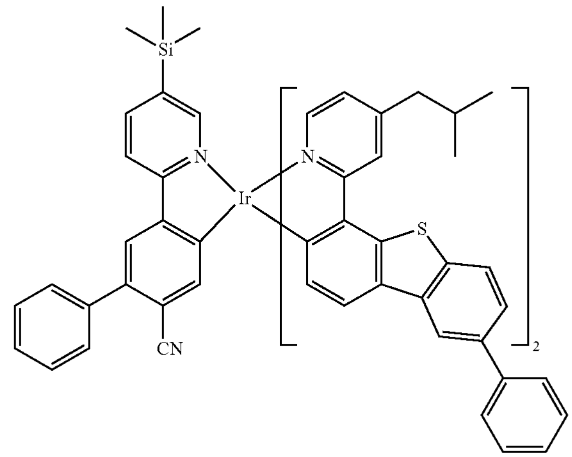
4255
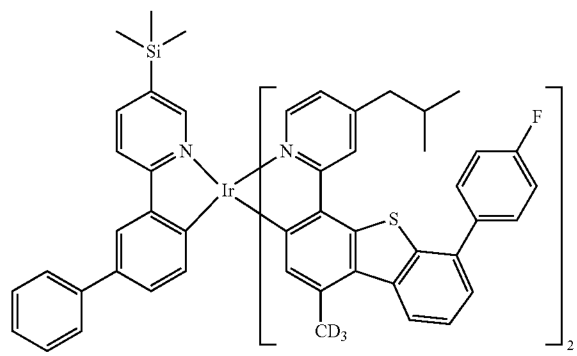
4256
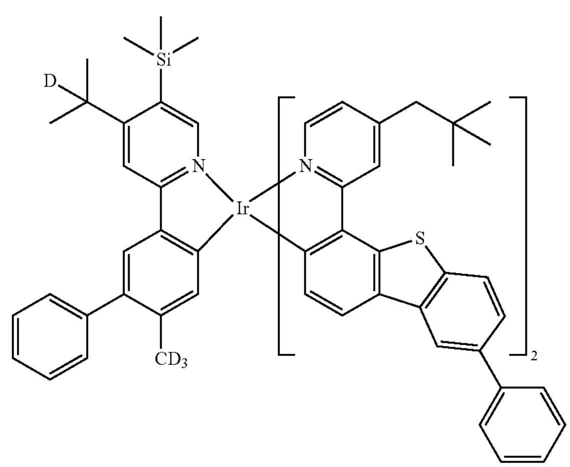

-continued
4257
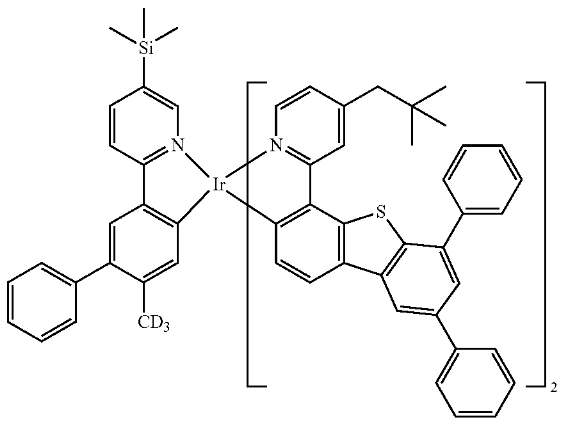
4258
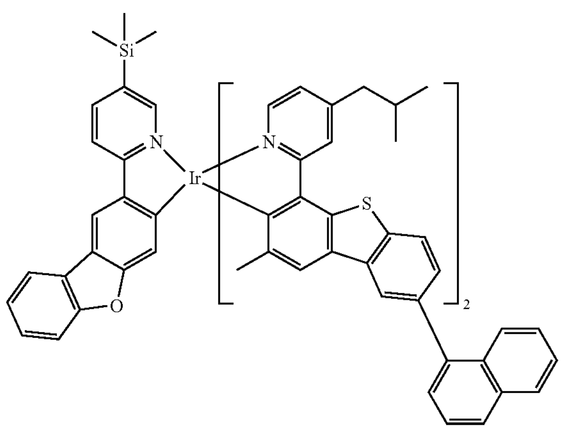
4259
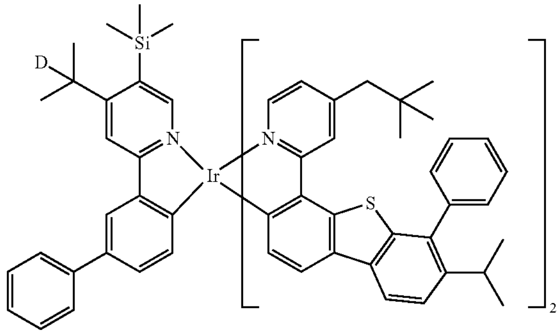
-continued
4260
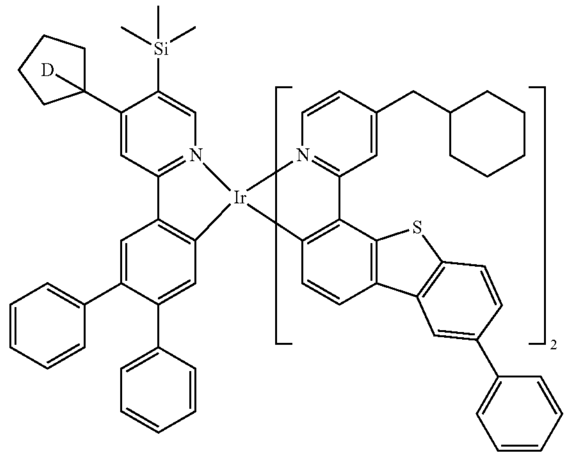
4261
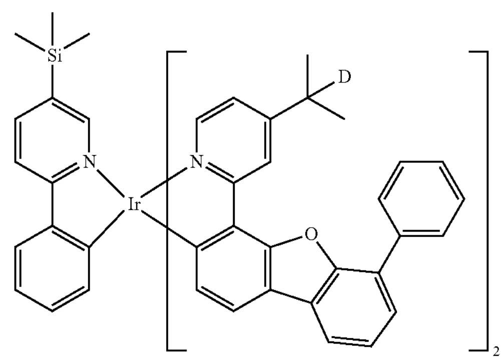
4262
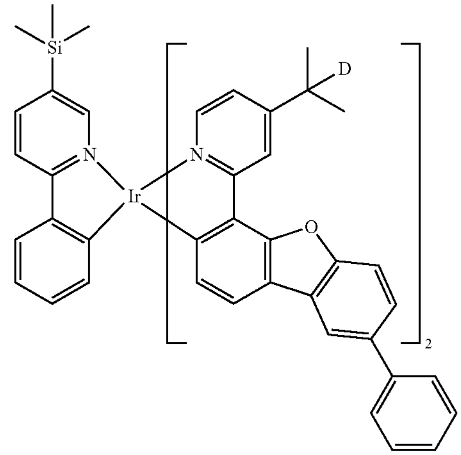

-continued
4263
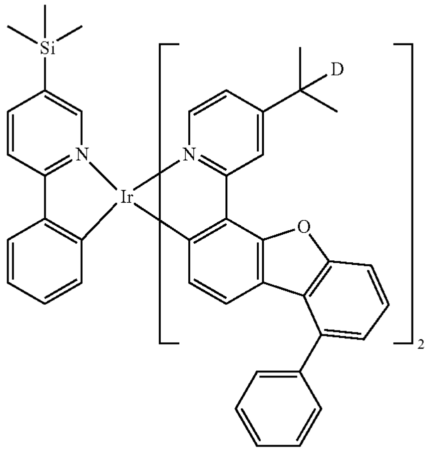
4264
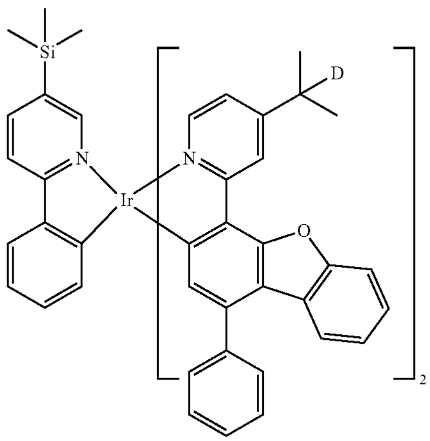
4265
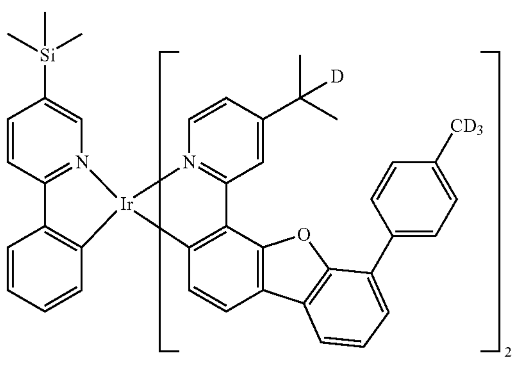
4266
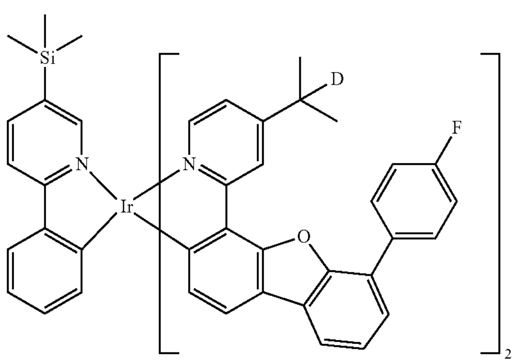
-continued
4267
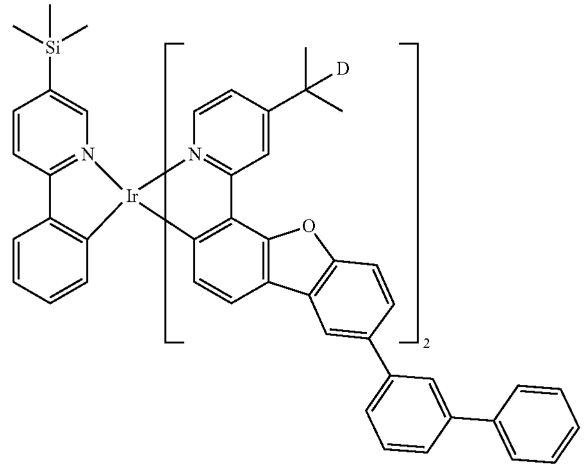
4268
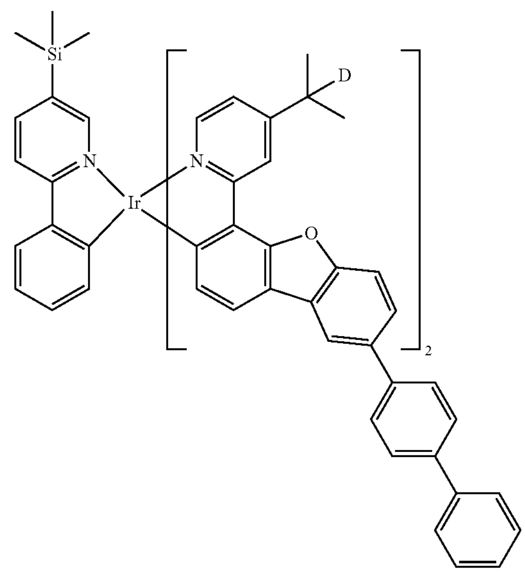
4269
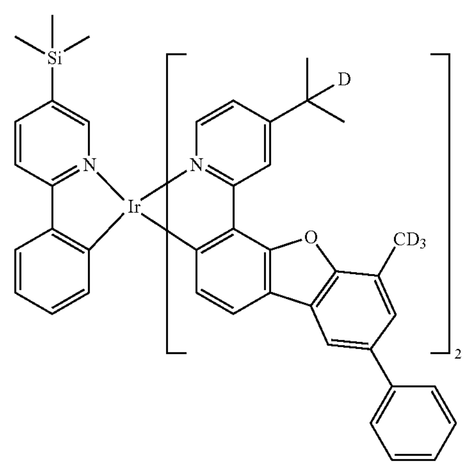

-continued
4270
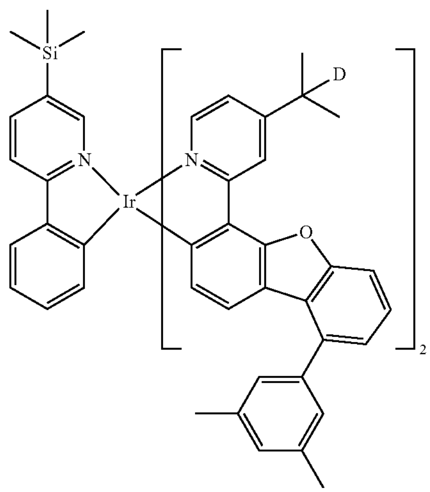
4271
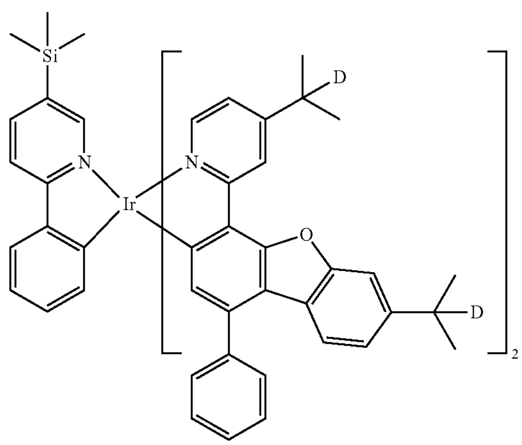
4272
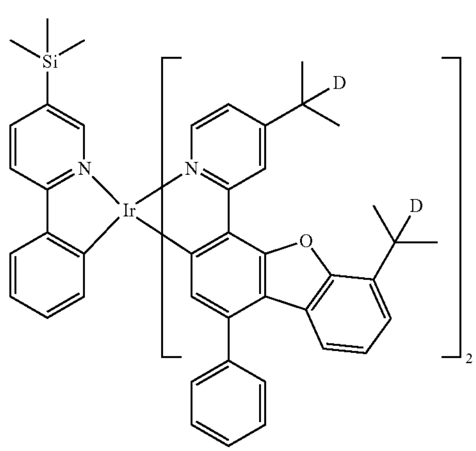
-continued
4273
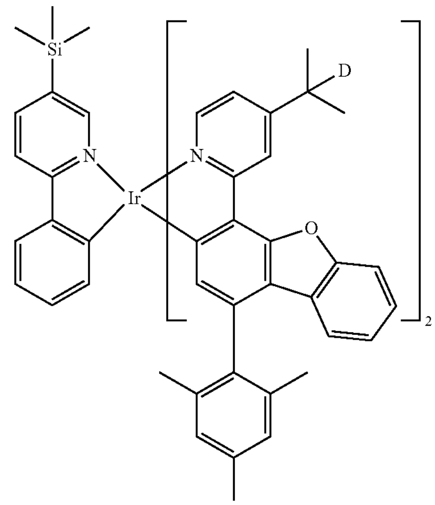
4274
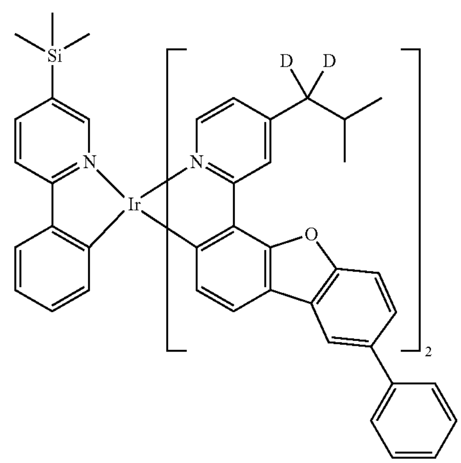
4275
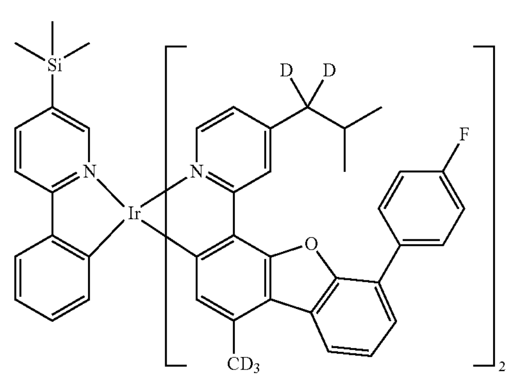

-continued
4276
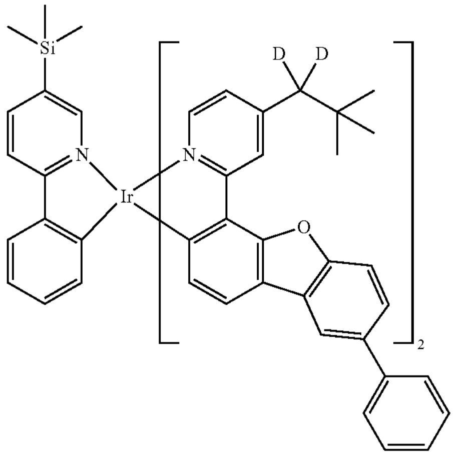
4277
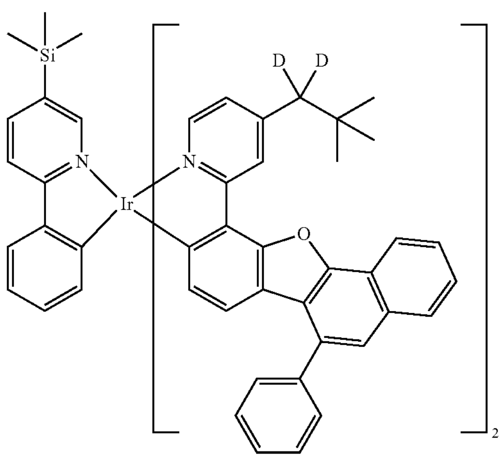
4278
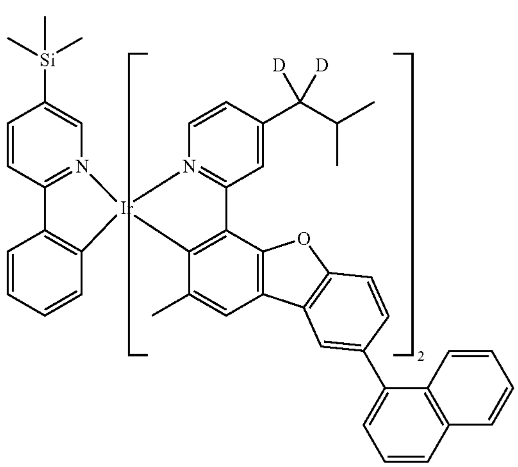
-continued
4279
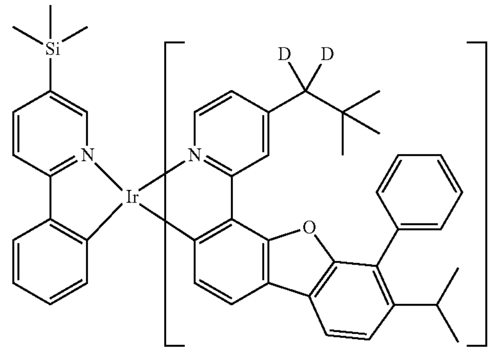
4280
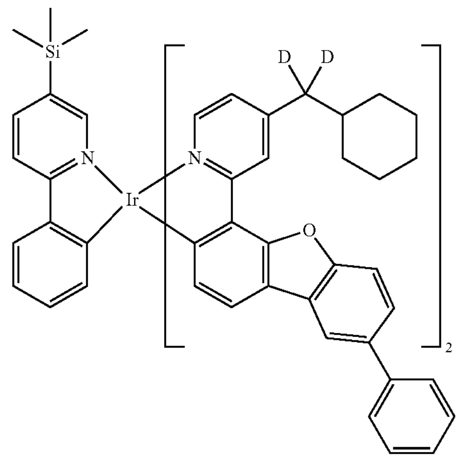
4281
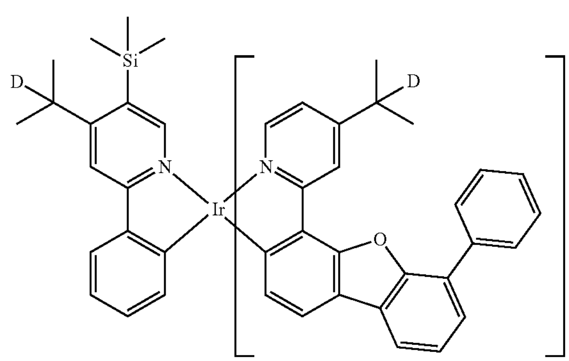

4282
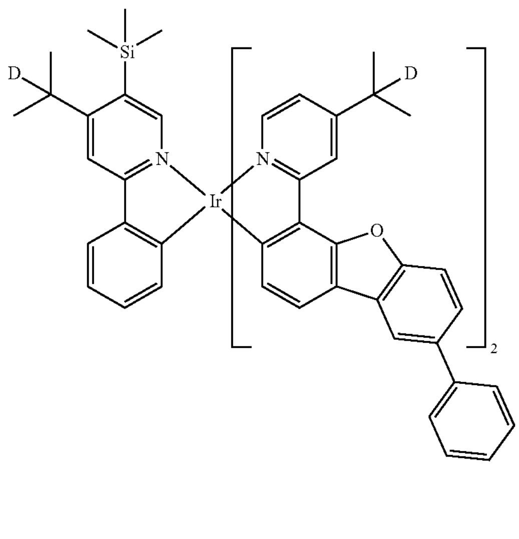
4283
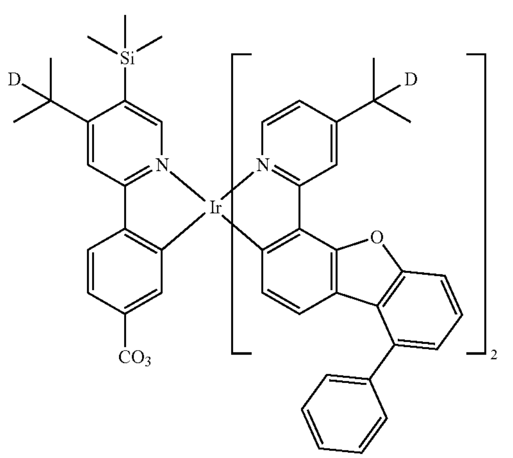
4284
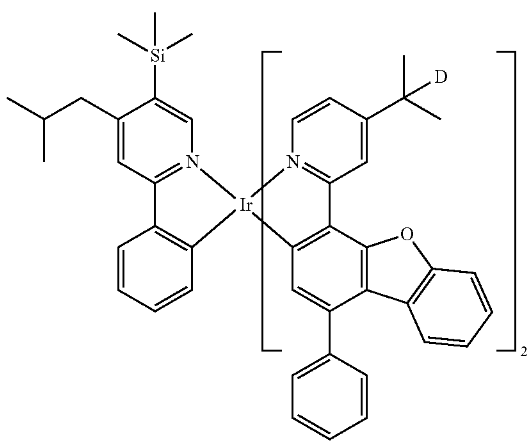
4285
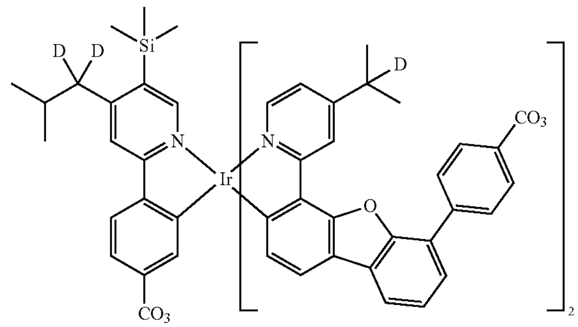
4286
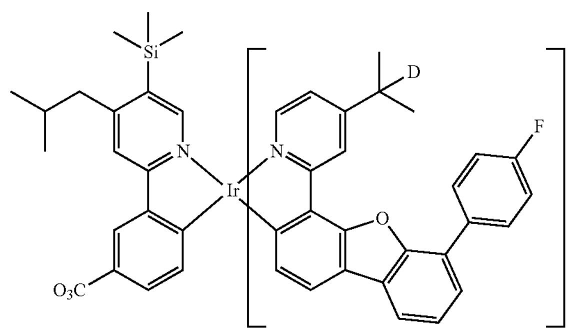
4287
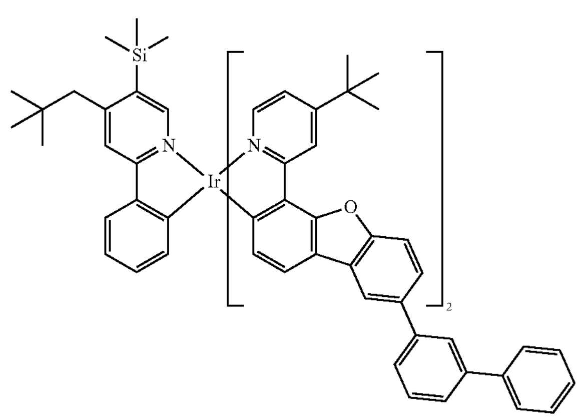

-continued
4288
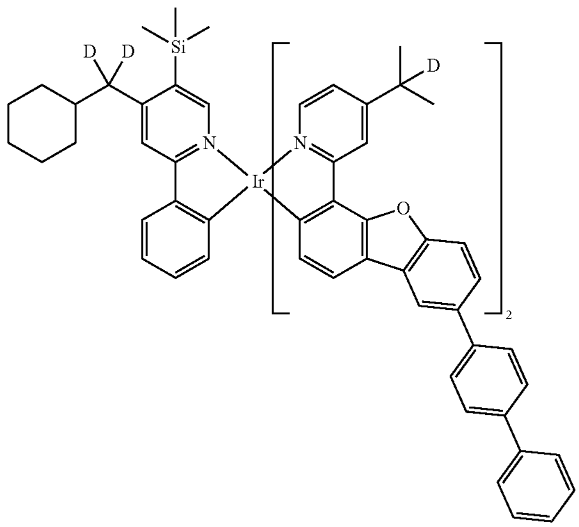
4289
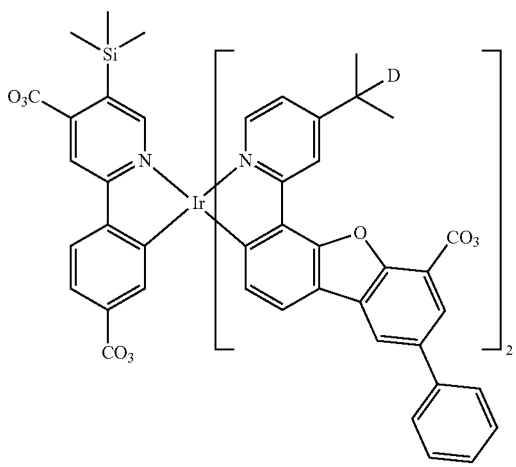
4290
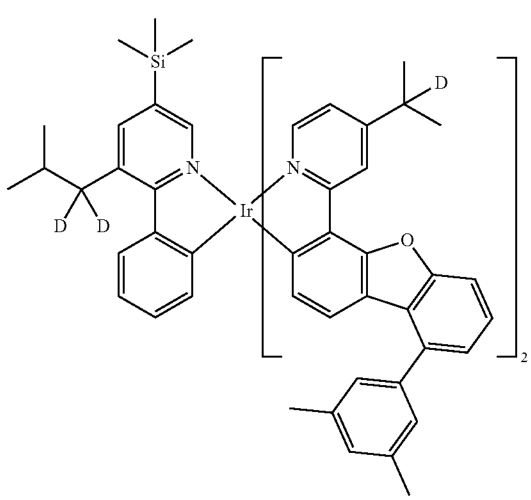
-continued
4291
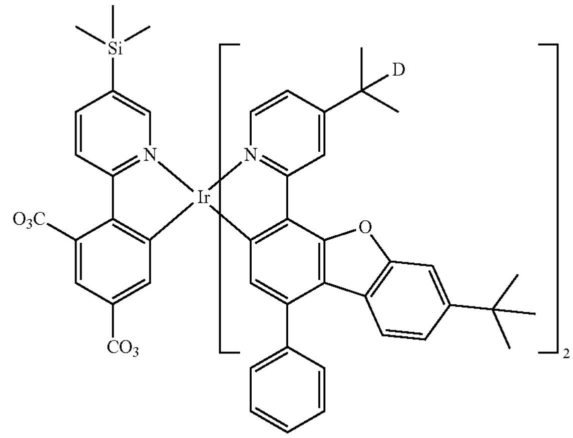
4292
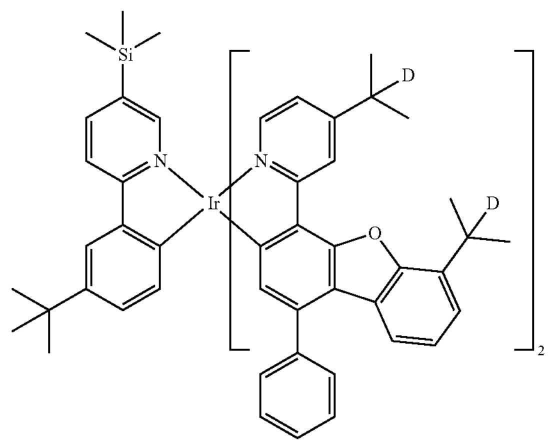
4293
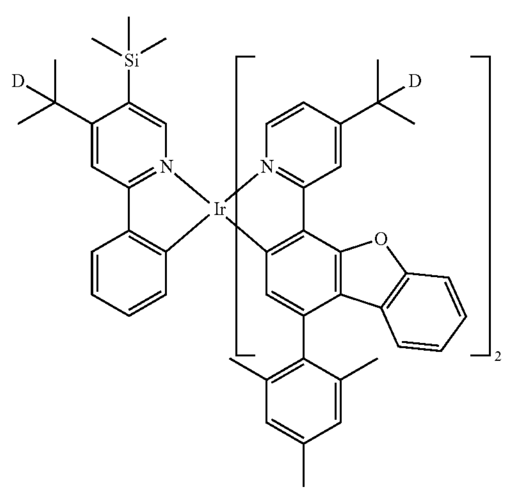

-continued
4294
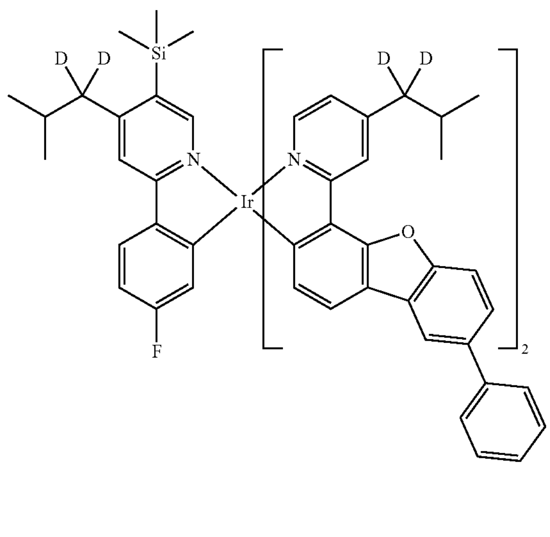
4295
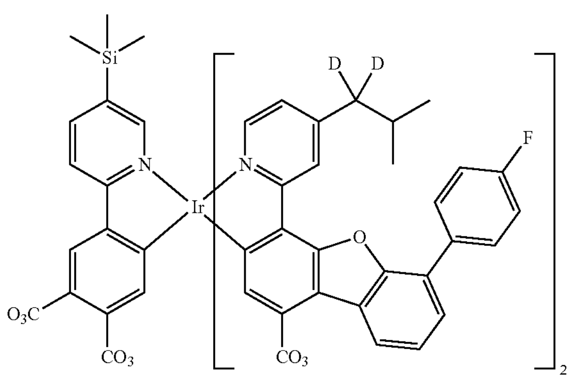
4296
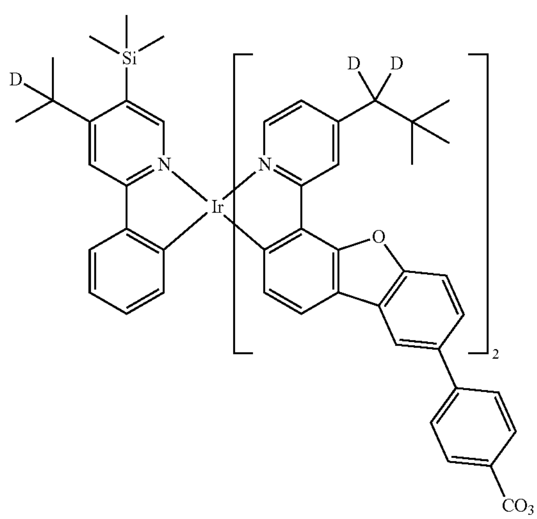
-continued
4297
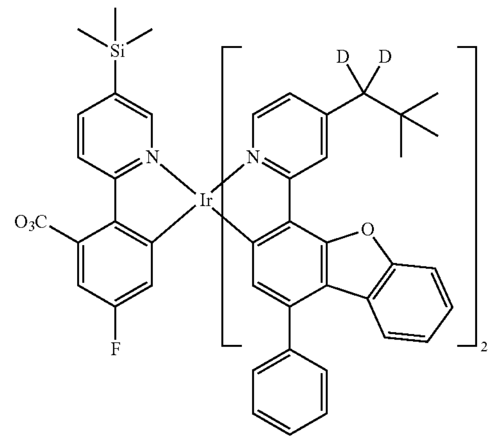
4298
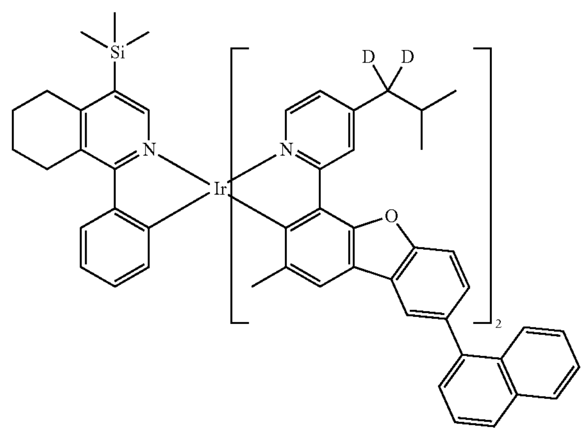
4299
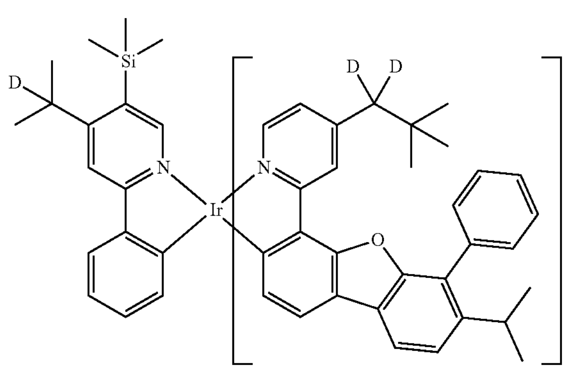

4300
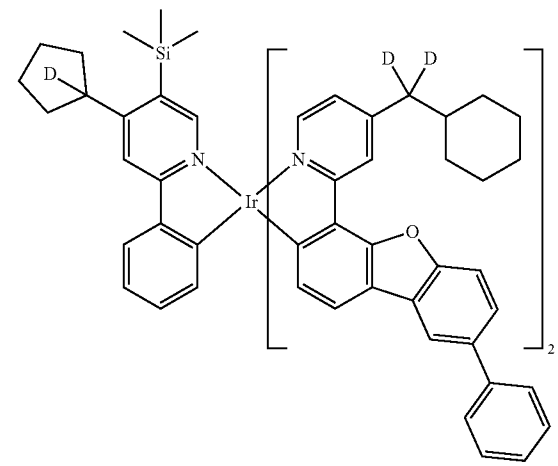
4301
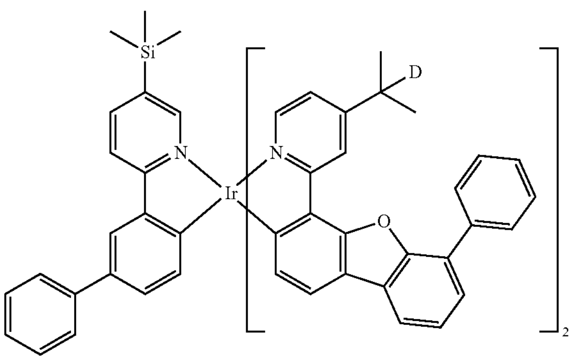
4302
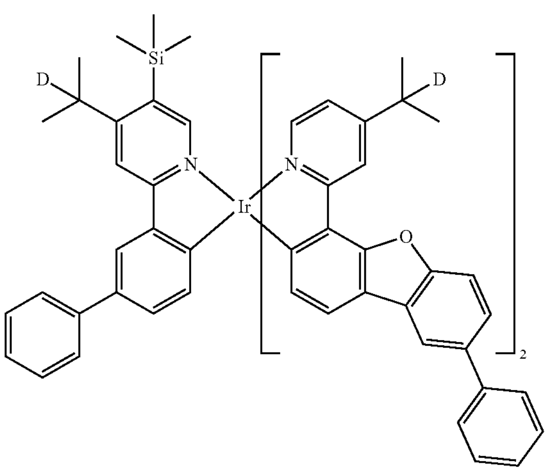
4303
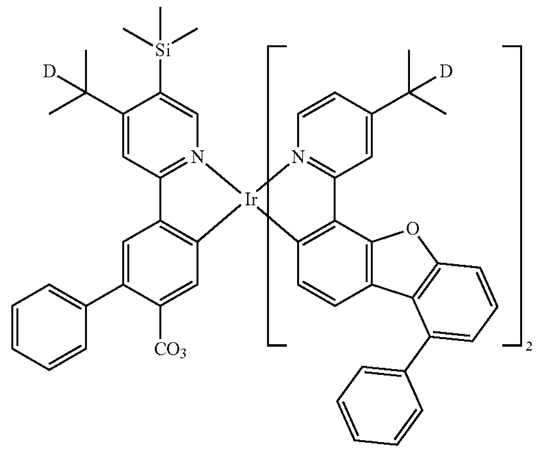
4304
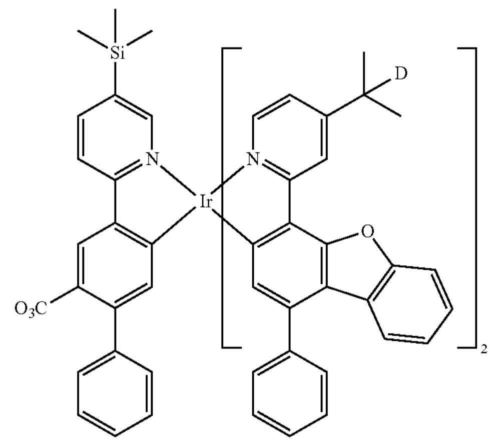
4305
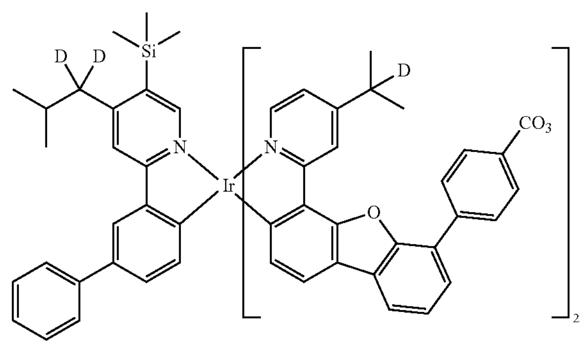
4306
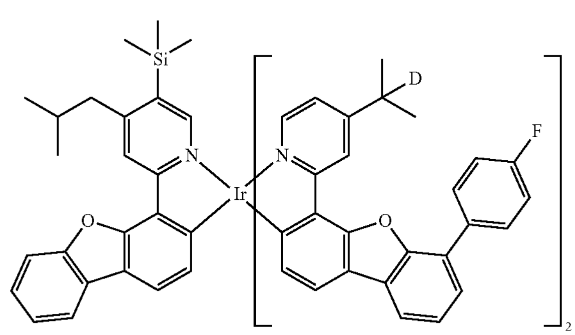

-continued
4307
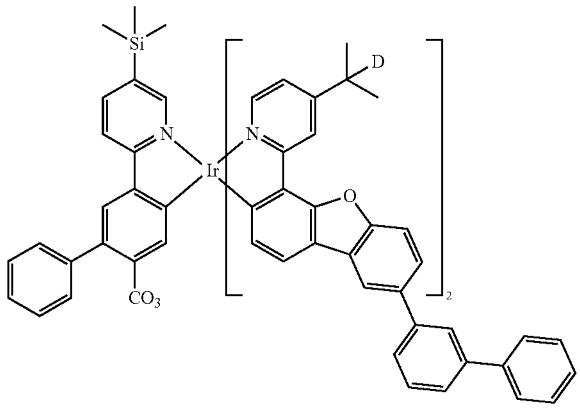
4308
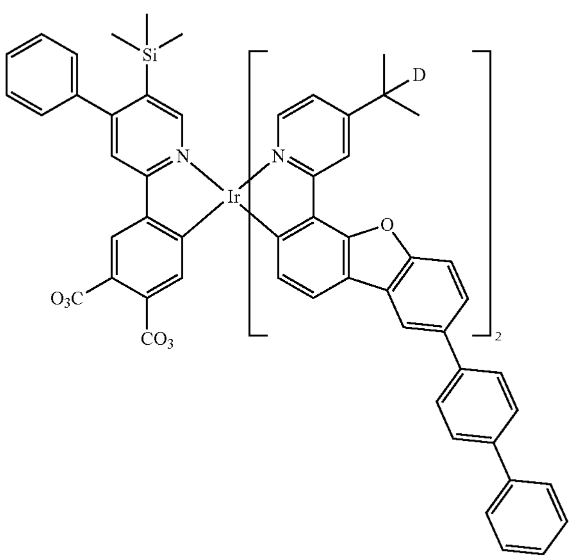
4309
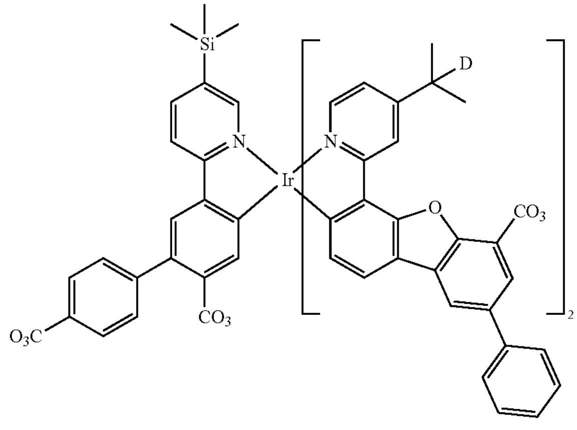
-continued
4310
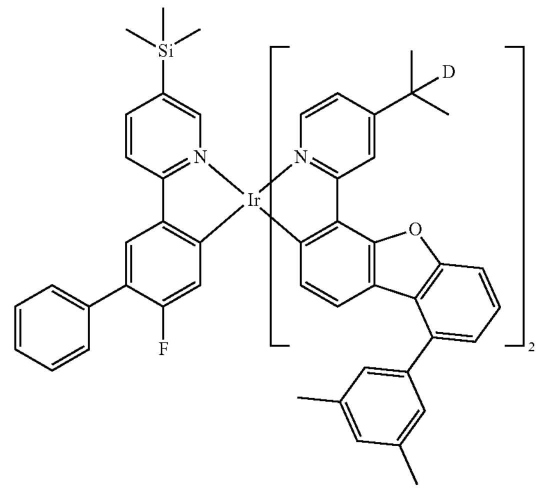
4311
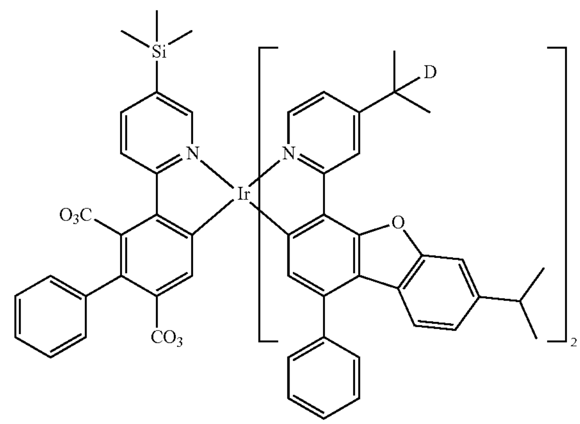
4312
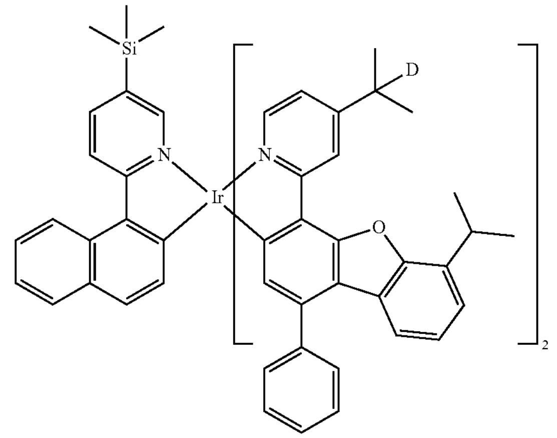

4313
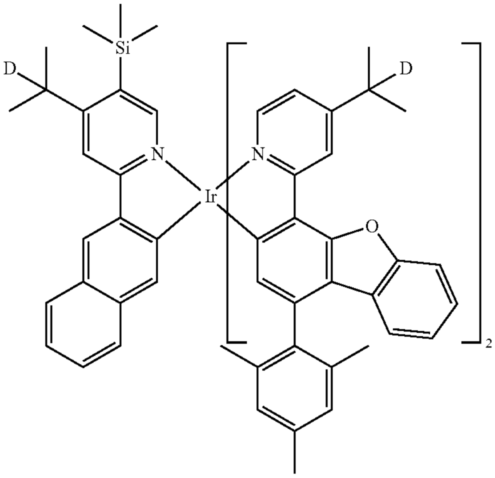
4314
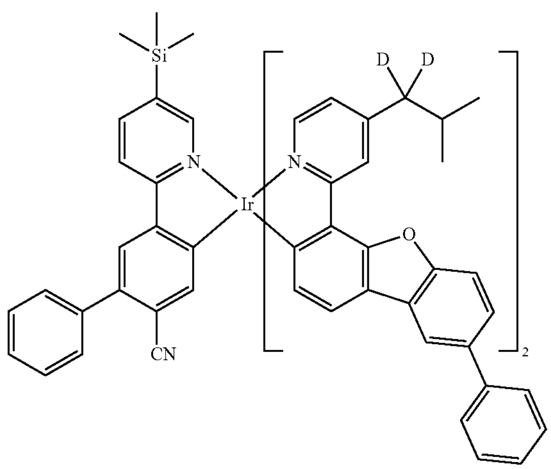
4315
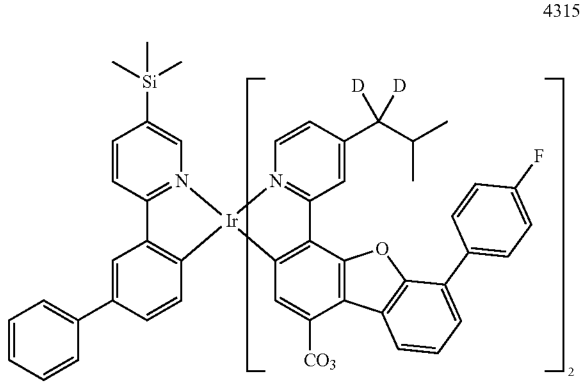
4316
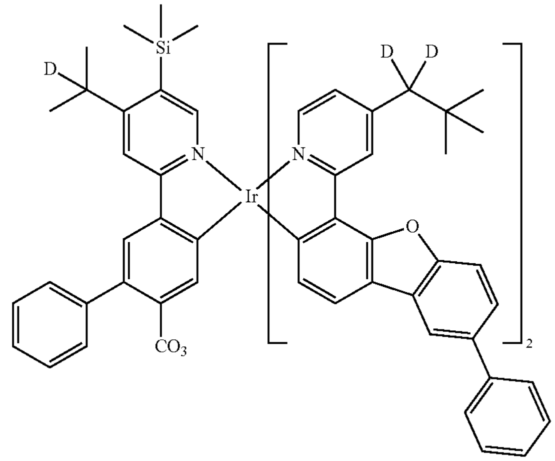
4317
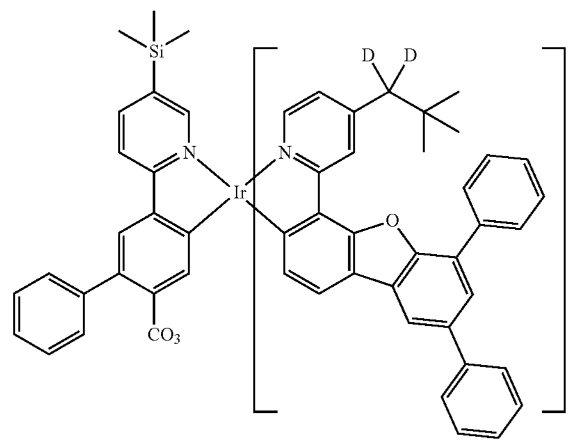
4318
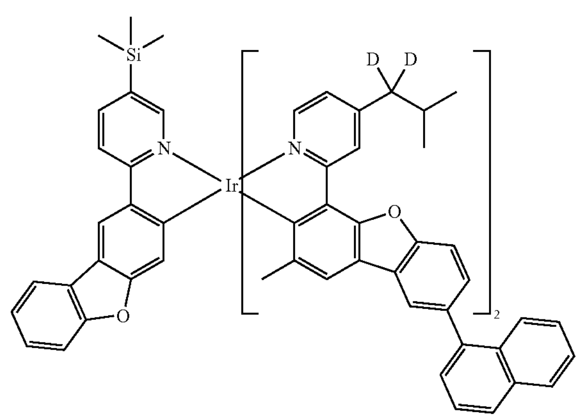

-continued
4319
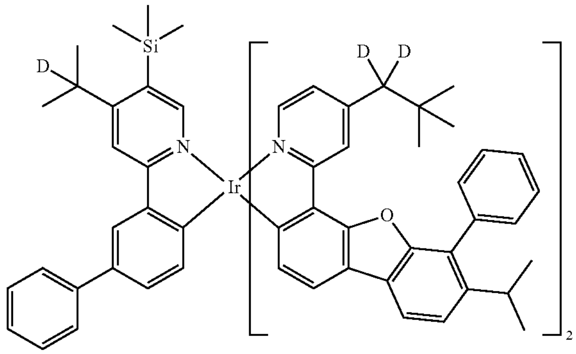
4320
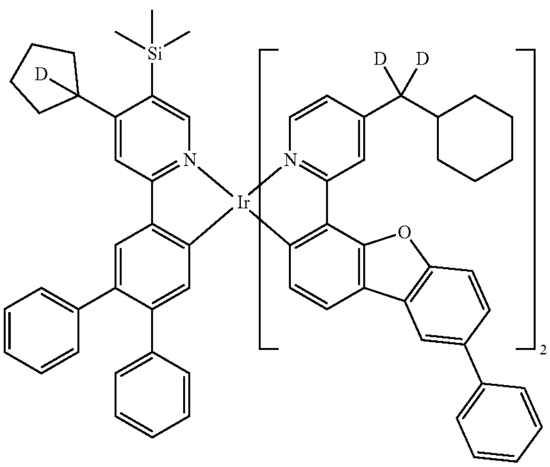
4321
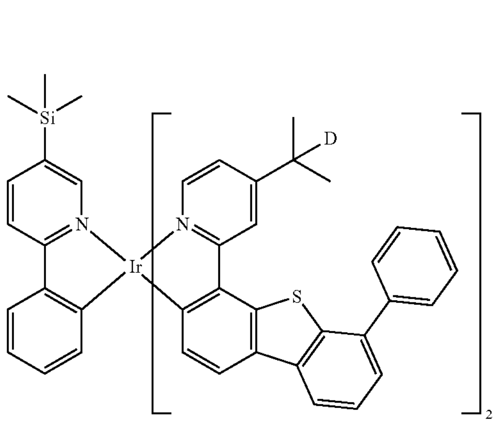
-continued
4322
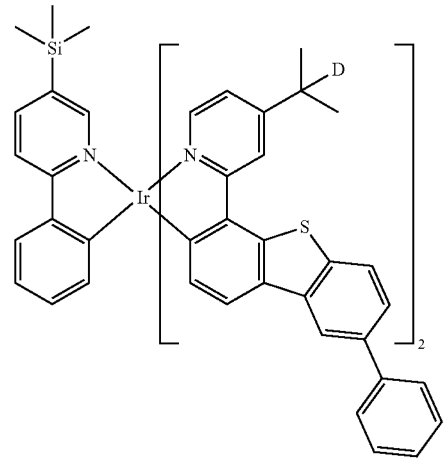
4323
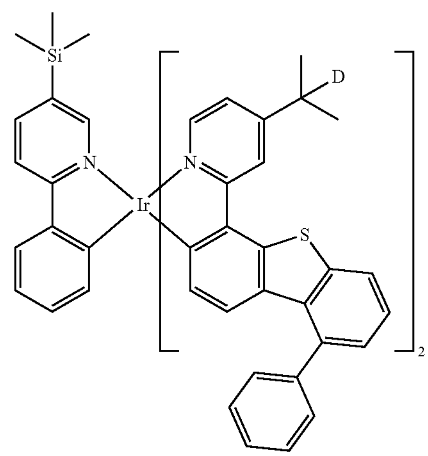
4324
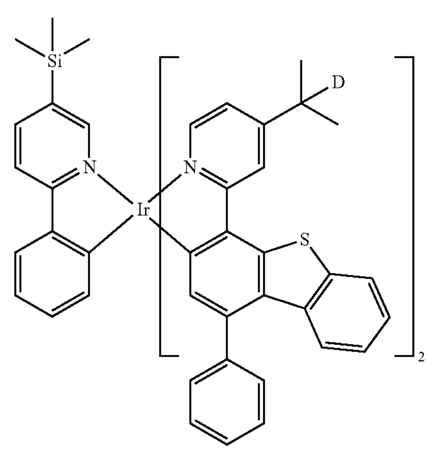

4325
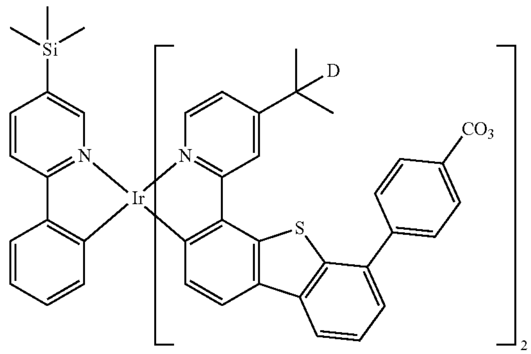
4326
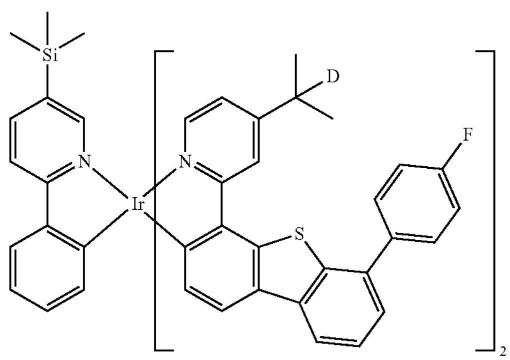
4327
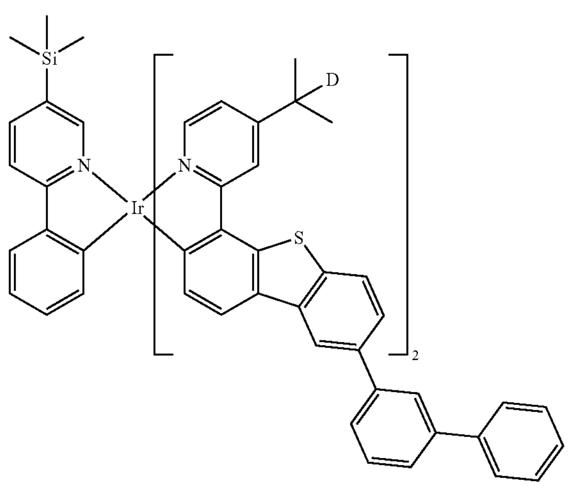
4328
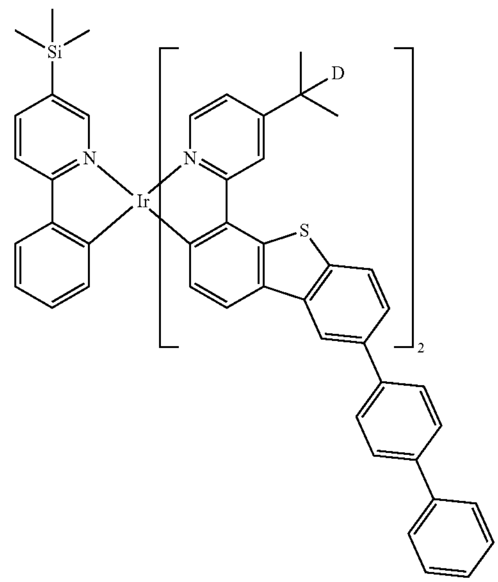
4329
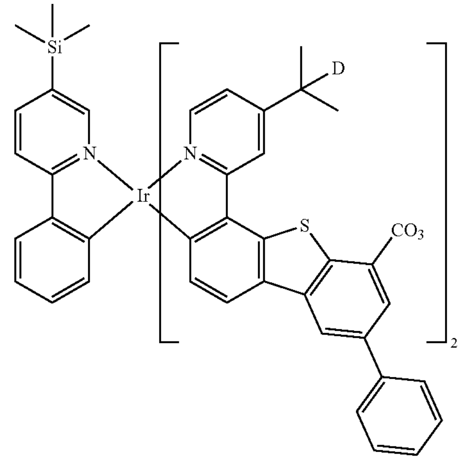
4330
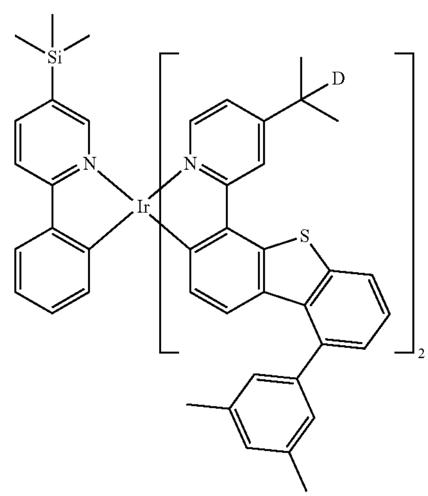

4331
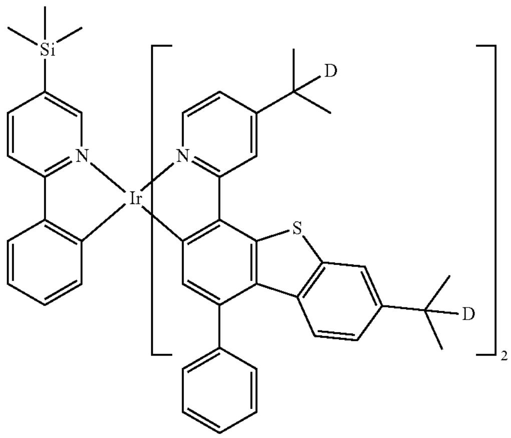
4332
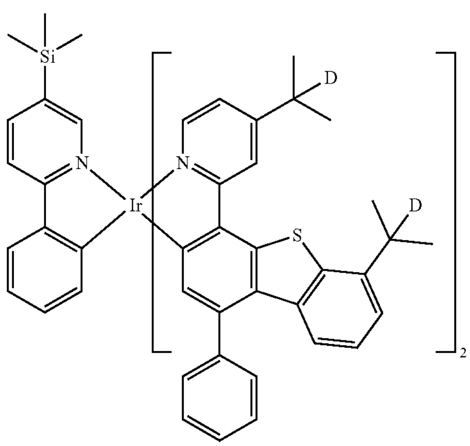
4333
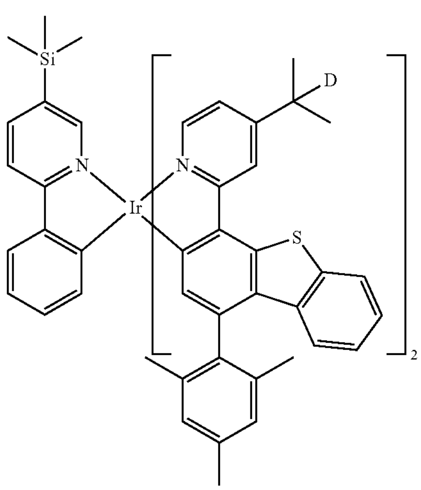
4334
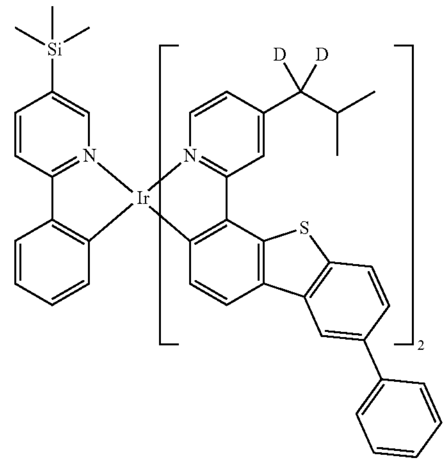
4335
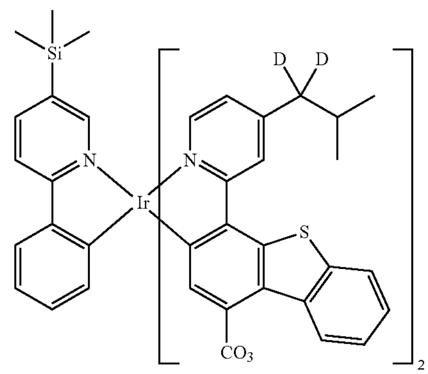
4336
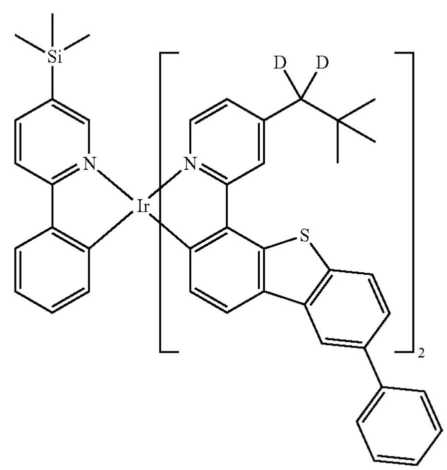

4337
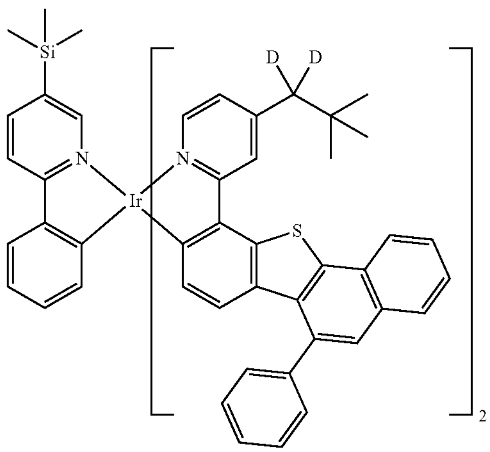
4338
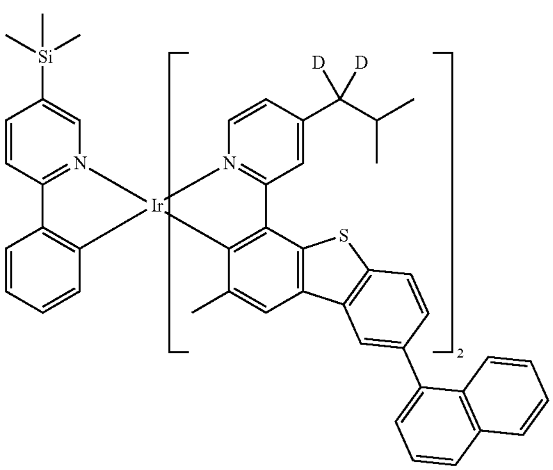
4339
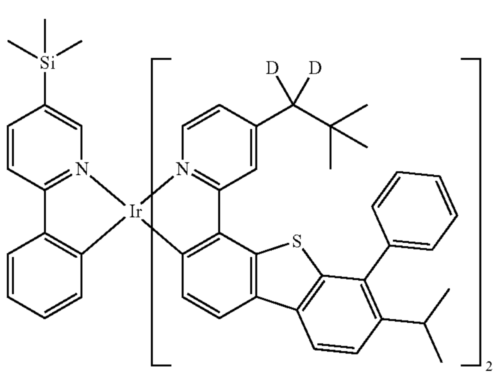
4340
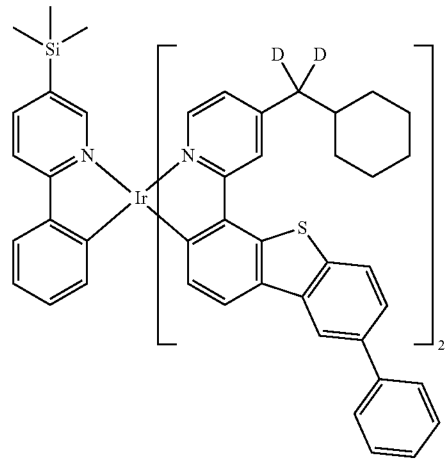
4341
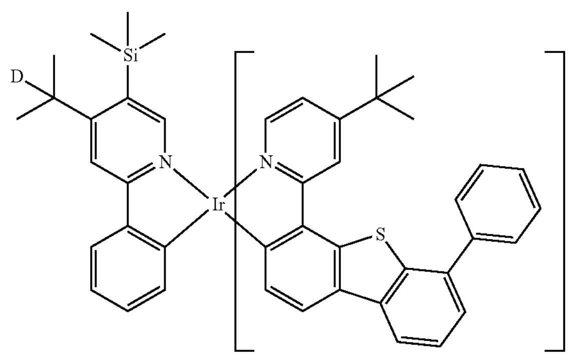
4342
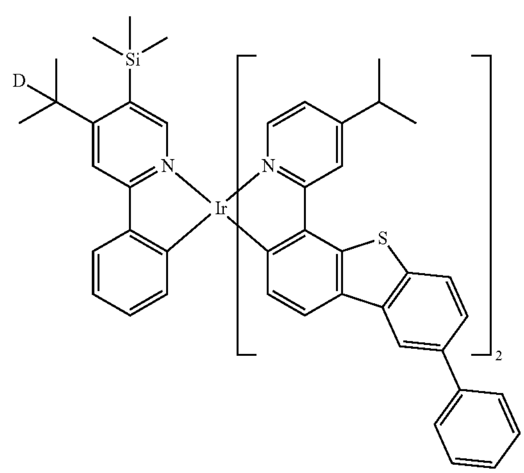

4343
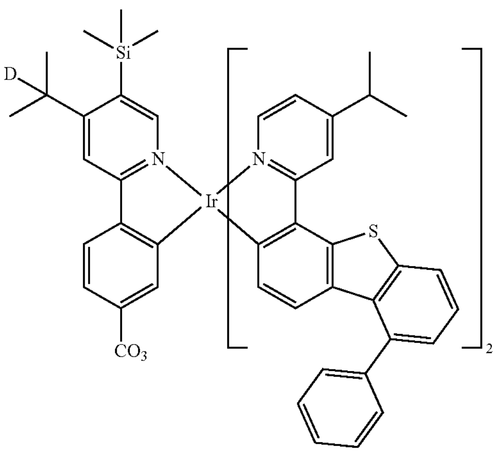
4344
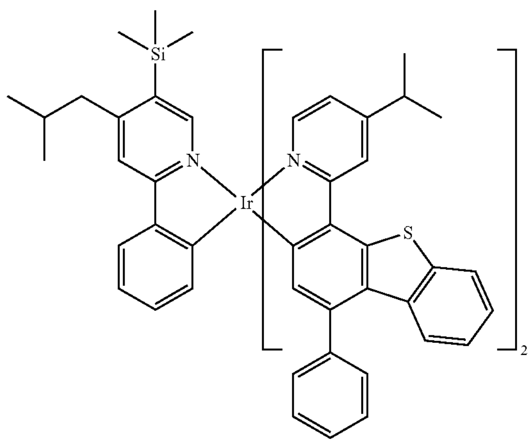
4345
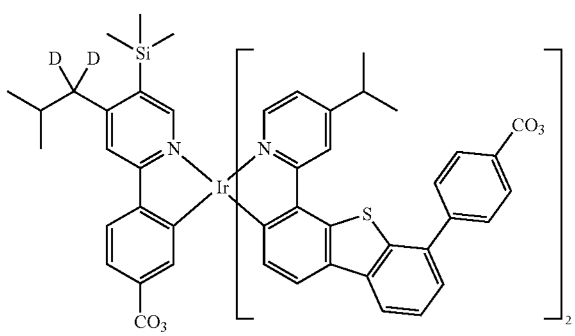
4346
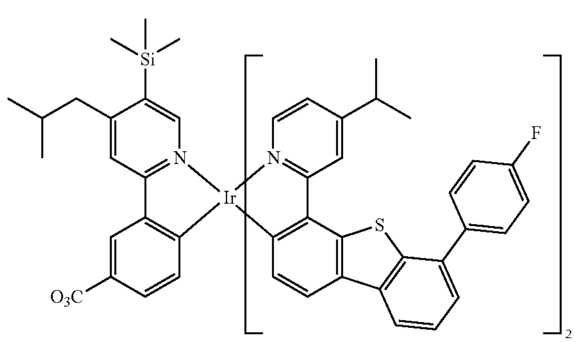
4347
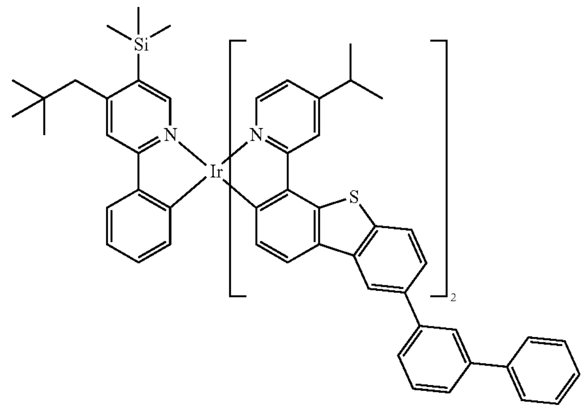
4348
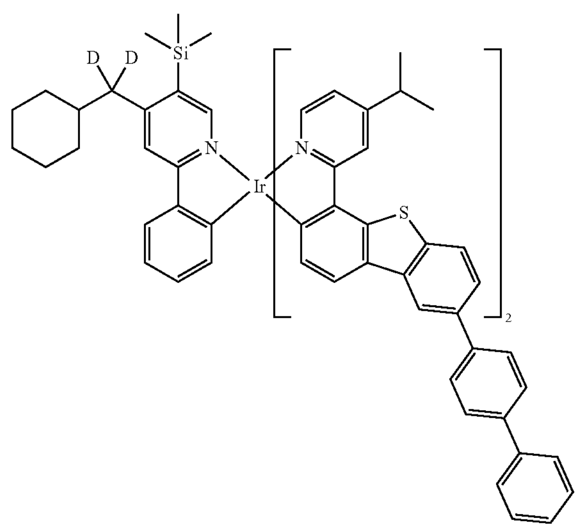
4349
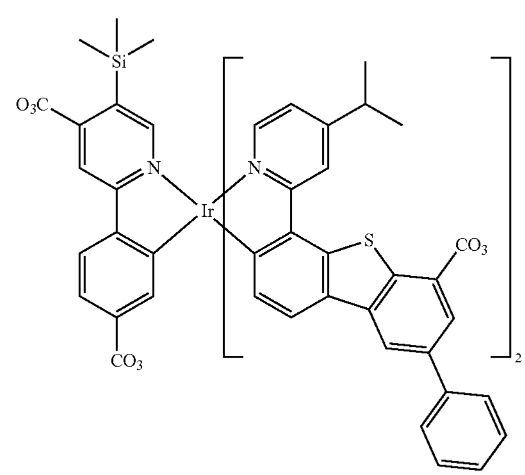

4350
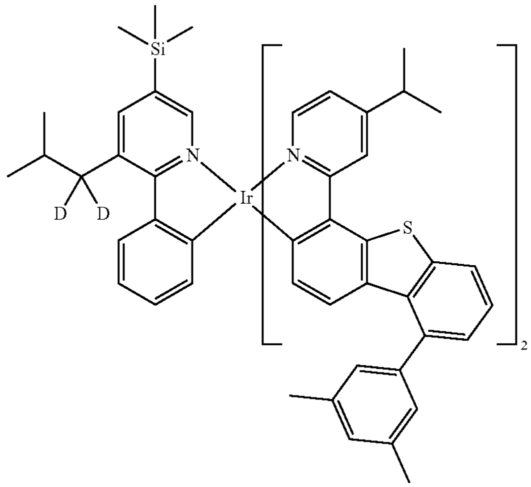
4351
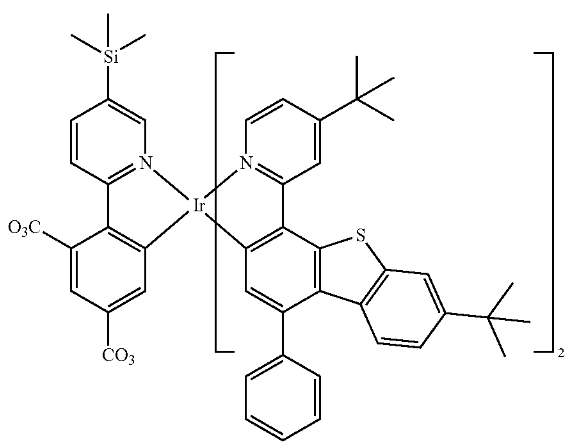
4352
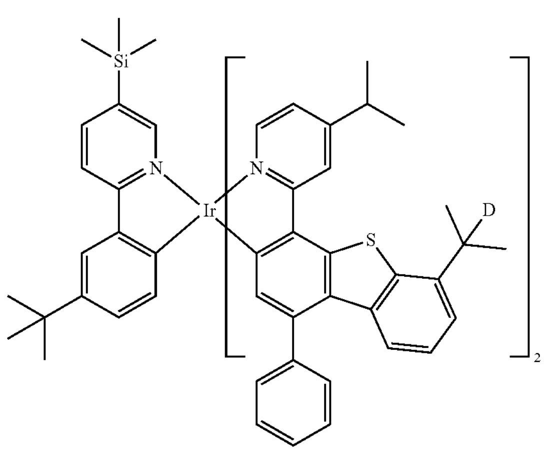
4353
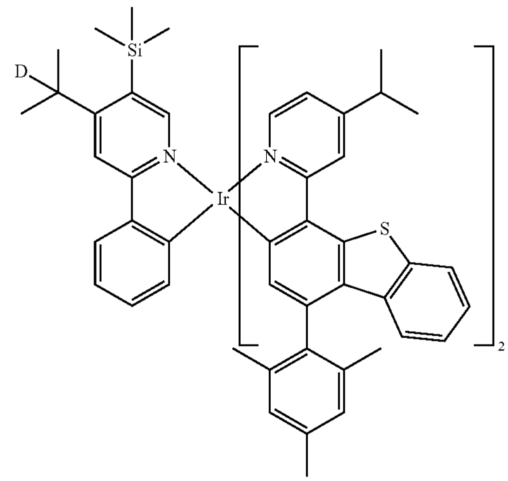
4354
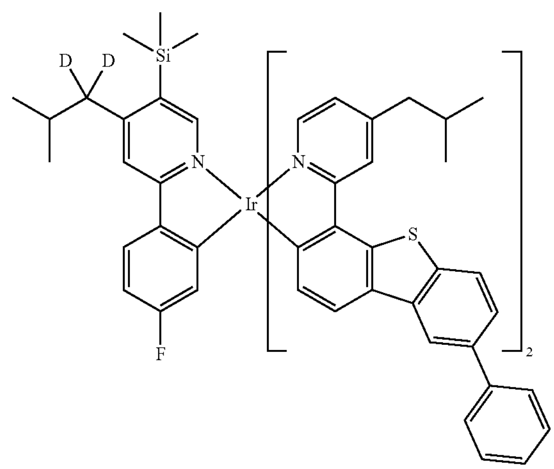
4355
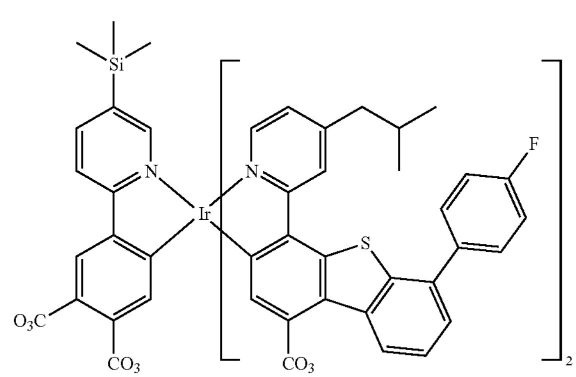

-continued
4356
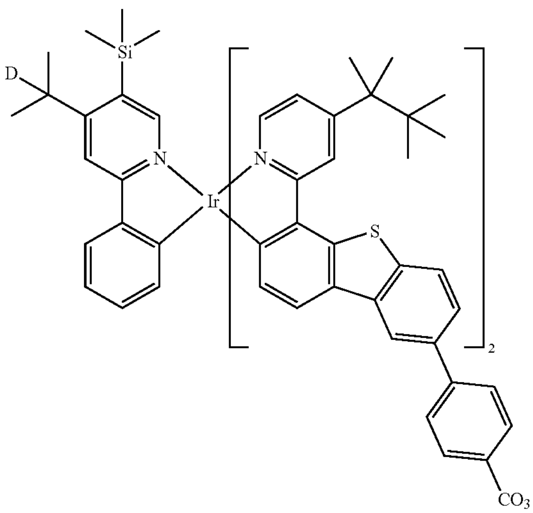
4357
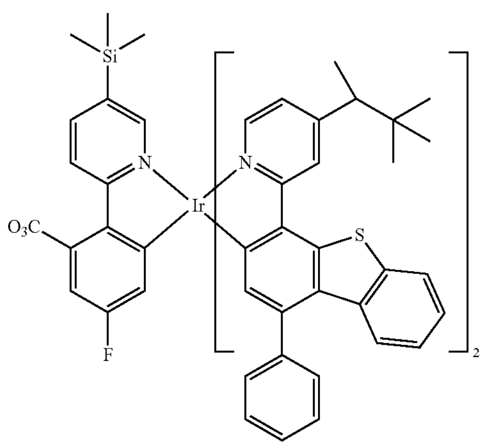
4358
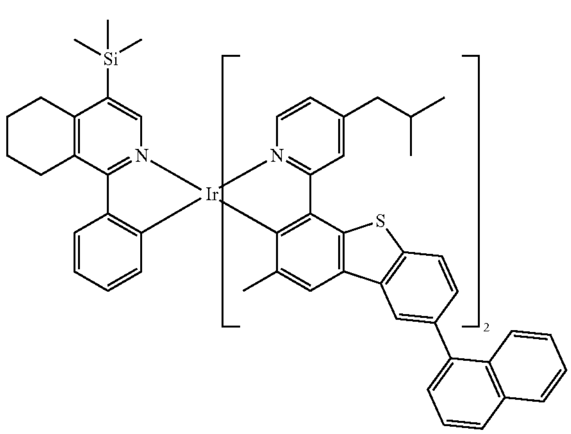
-continued
4359
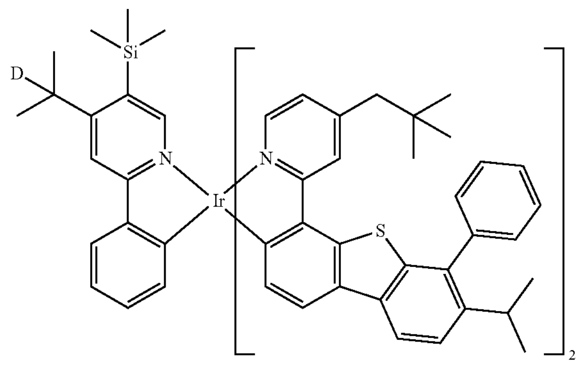
4360
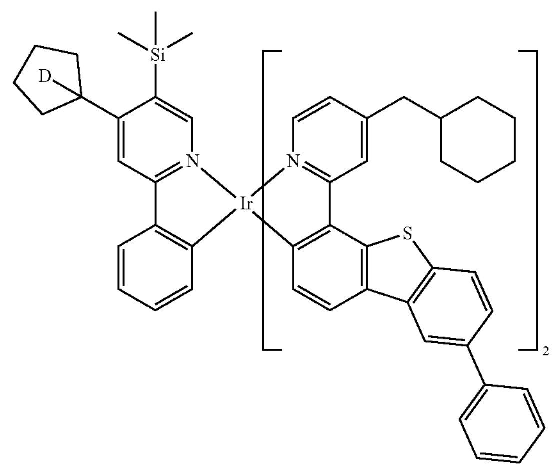
4361
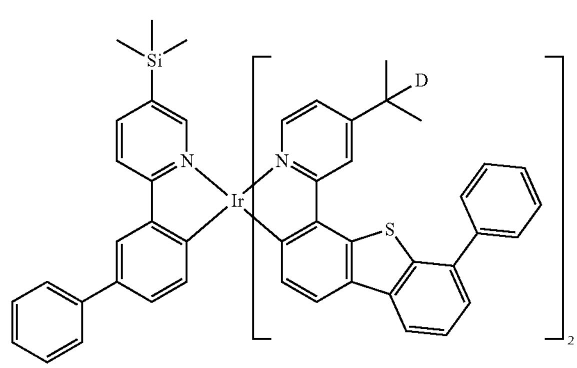

4362
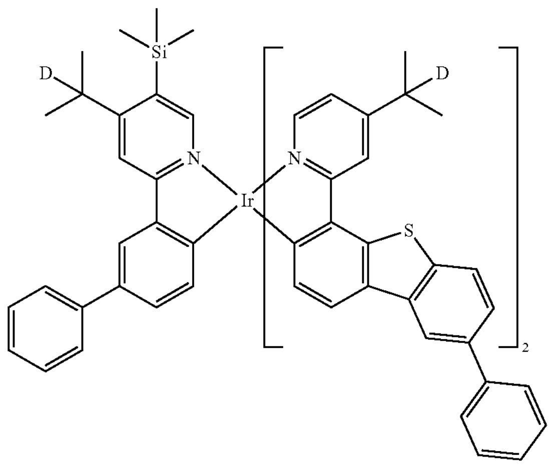
4363
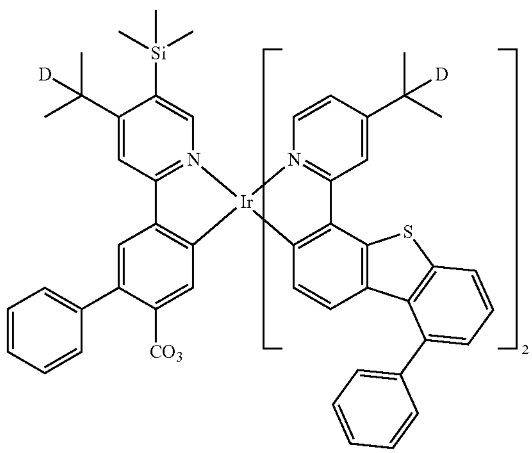
4364
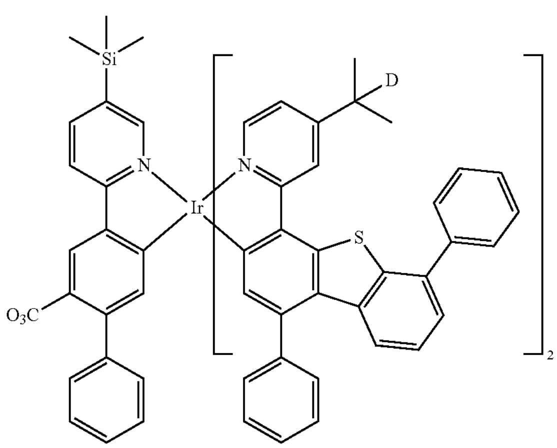
4365
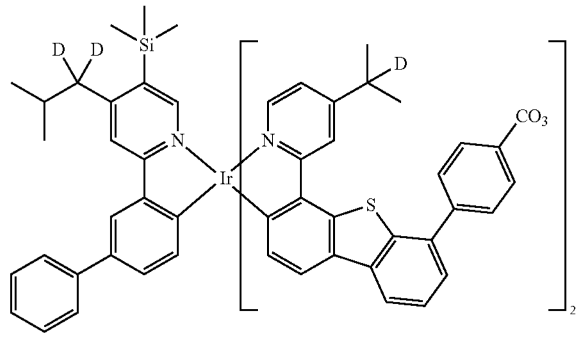
4366
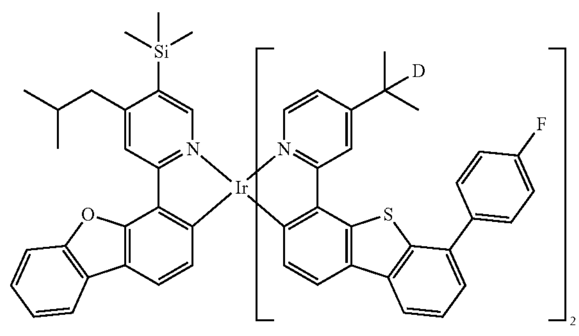
4367
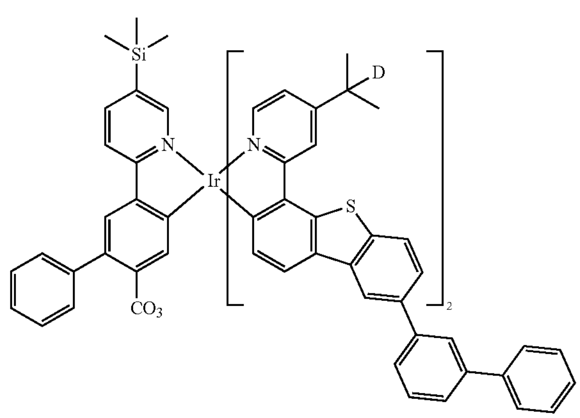

-continued
4368
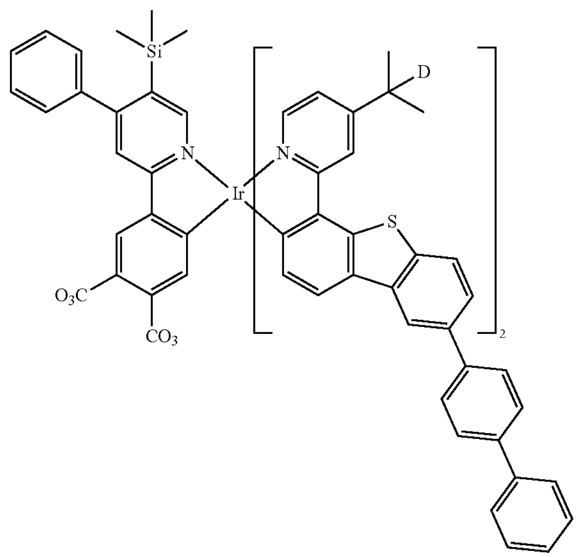
4369
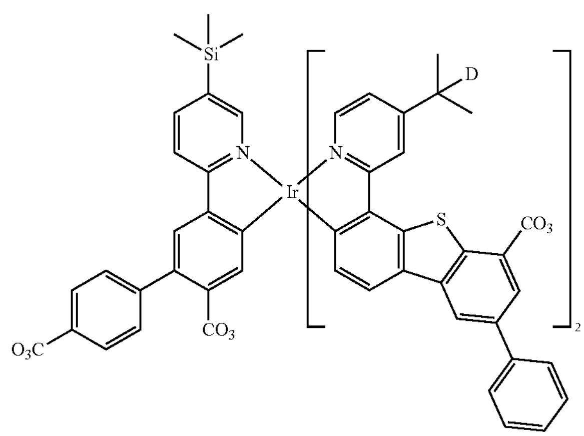
4370
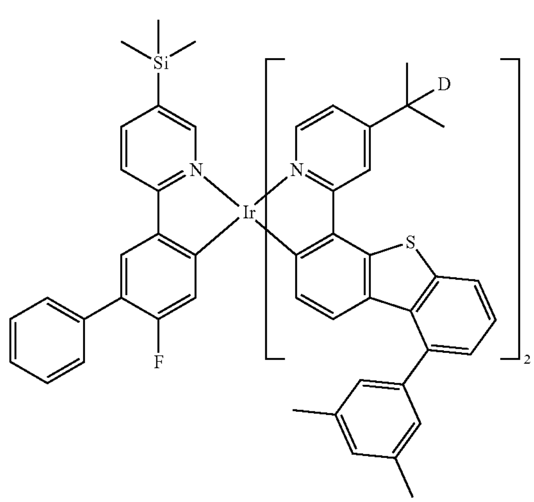
-continued
4371
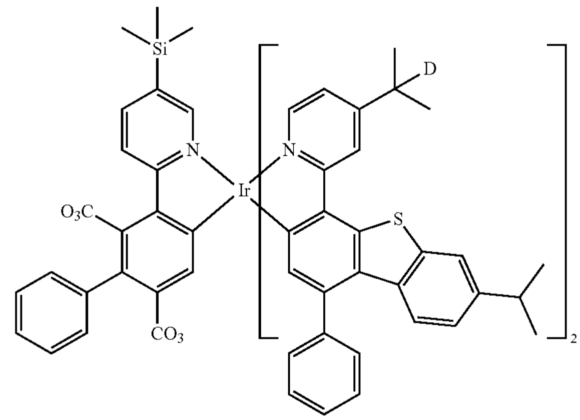
4372
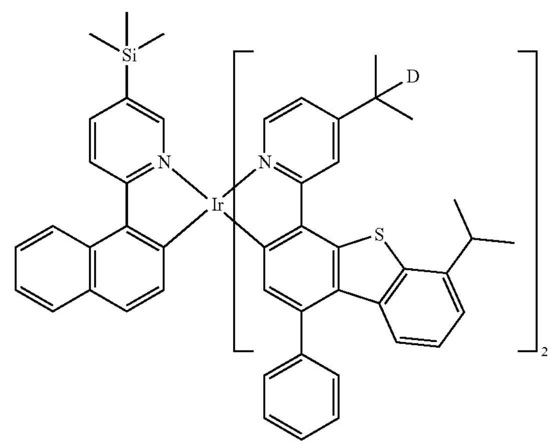
4373
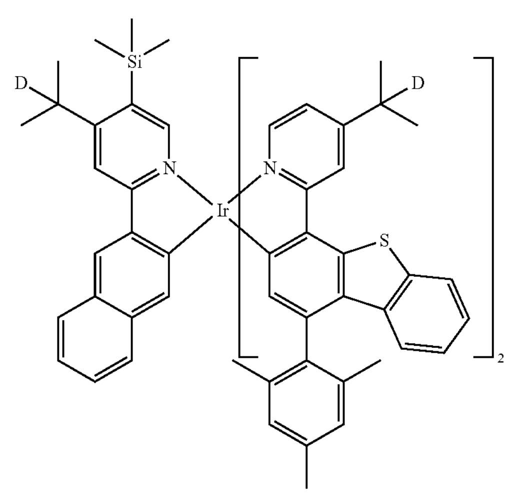

4374
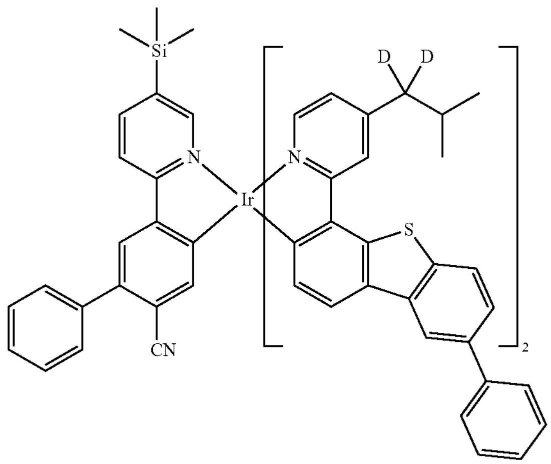
4375
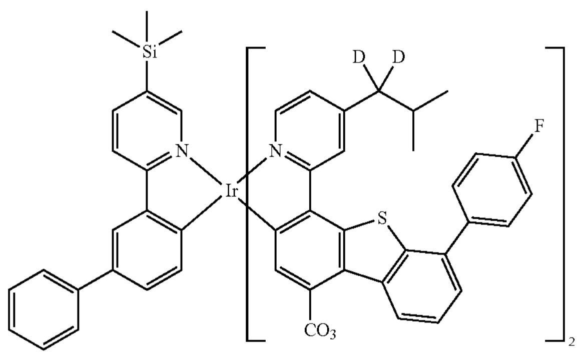
4376
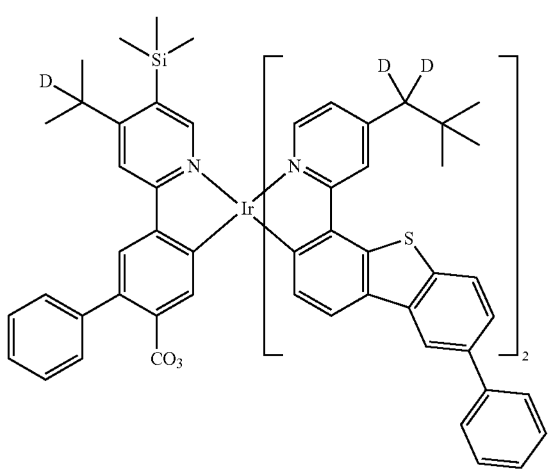
4377
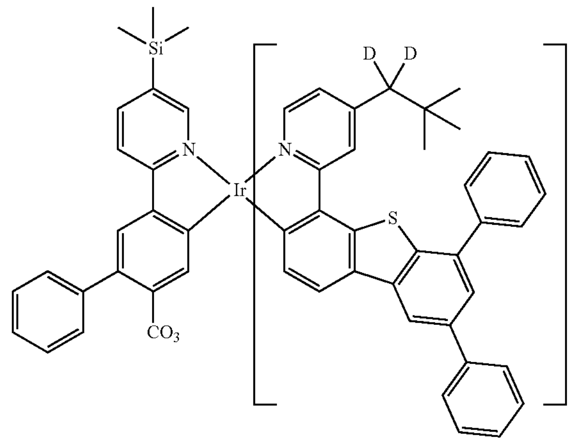
4378
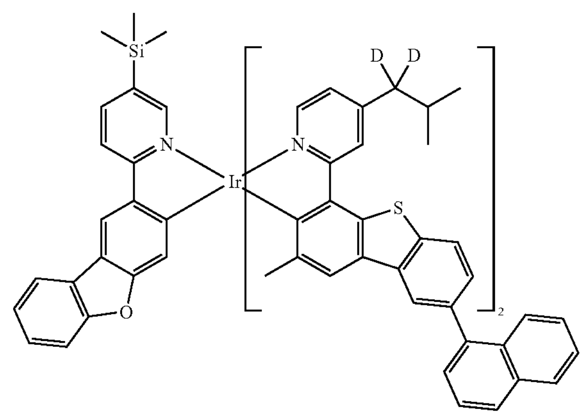
4379
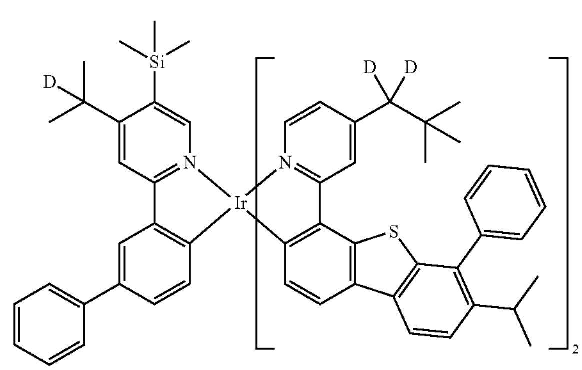

-continued
4380
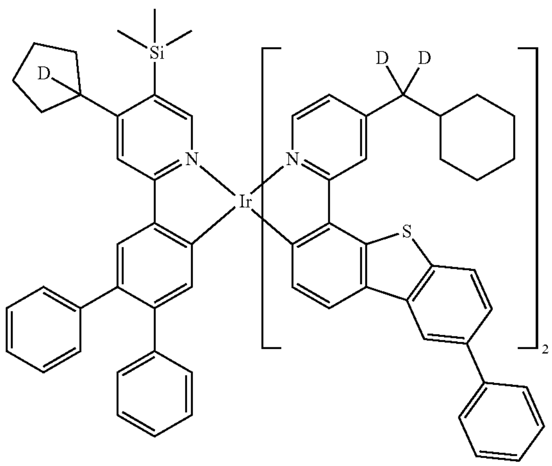
4381
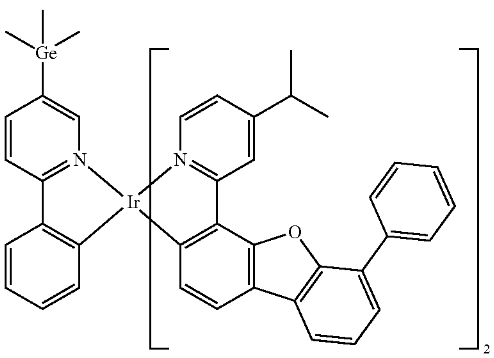
4382
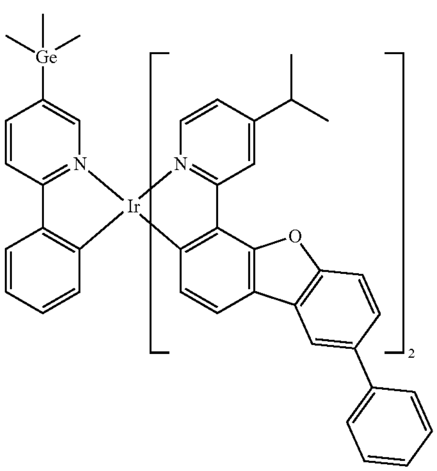
-continued
4383
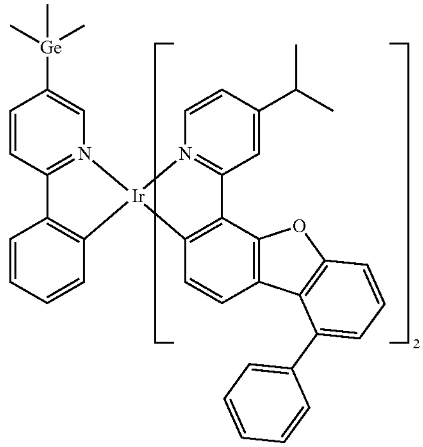
4384
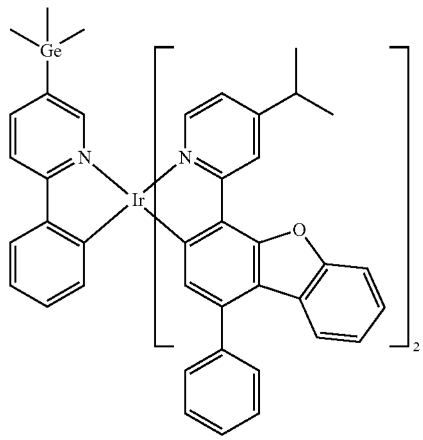
4385
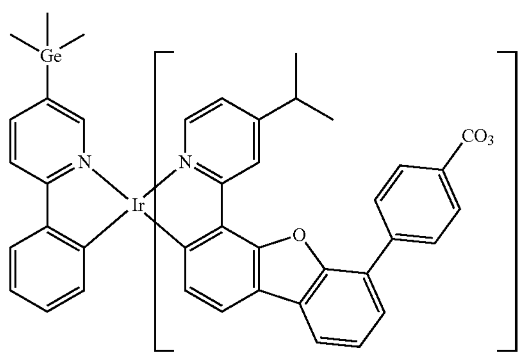
4386
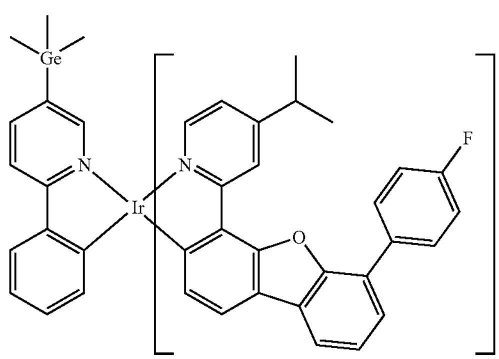

4387
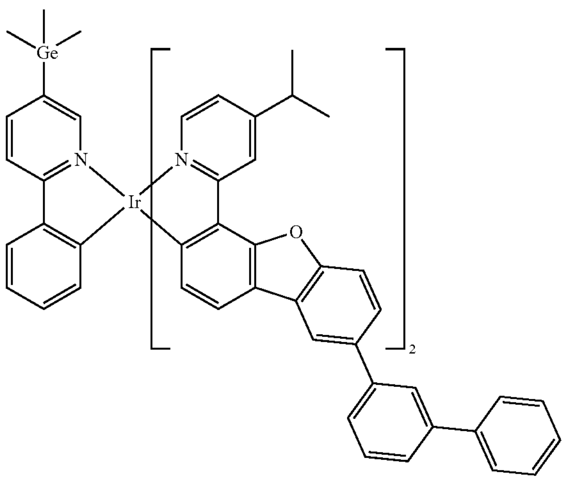
4388
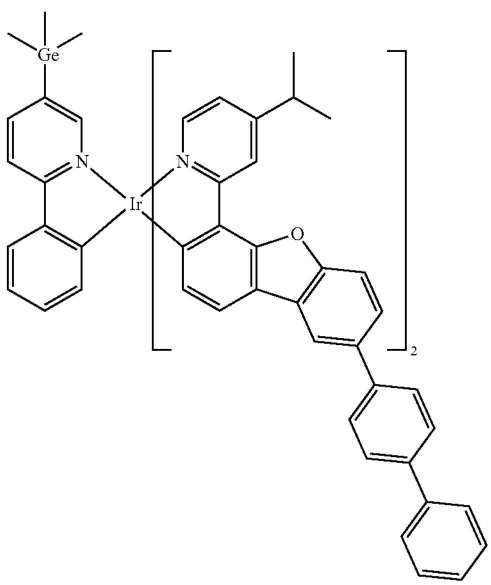
4389
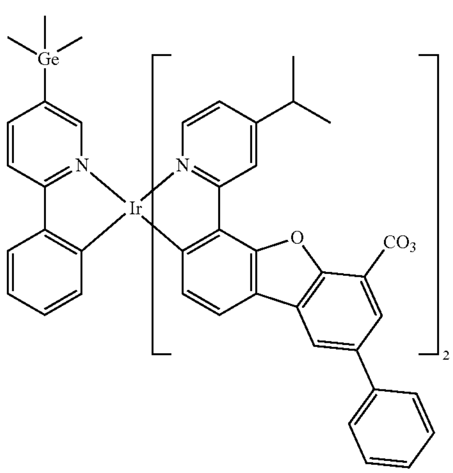
4390
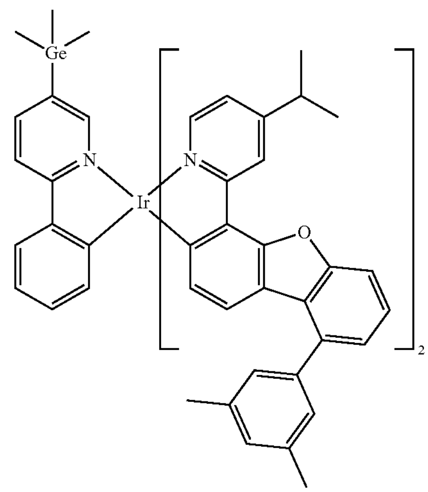
4391
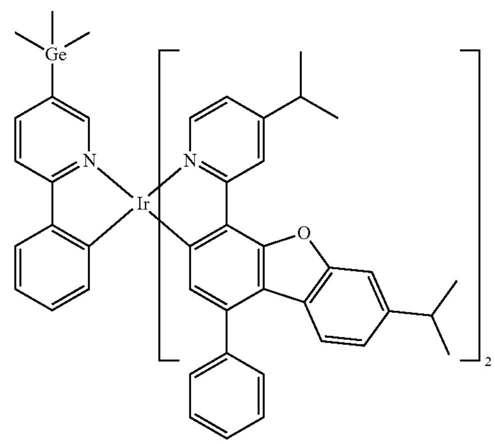
4392
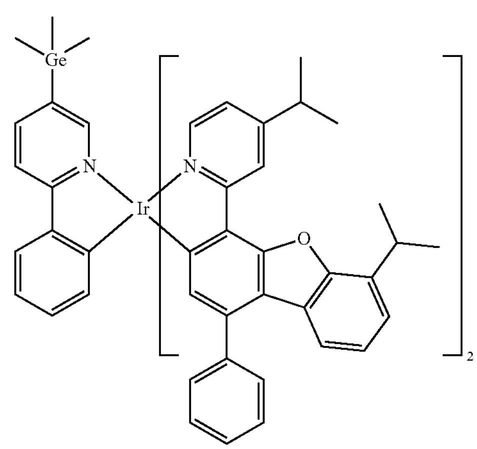

-continued
4393
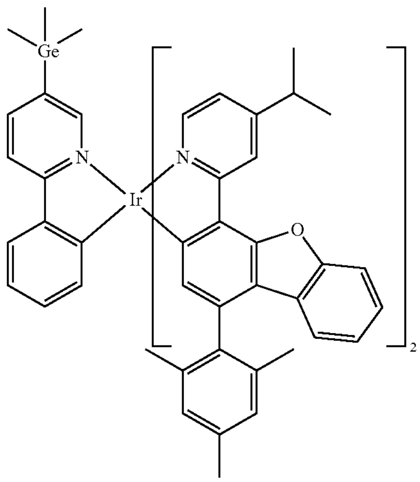
4394
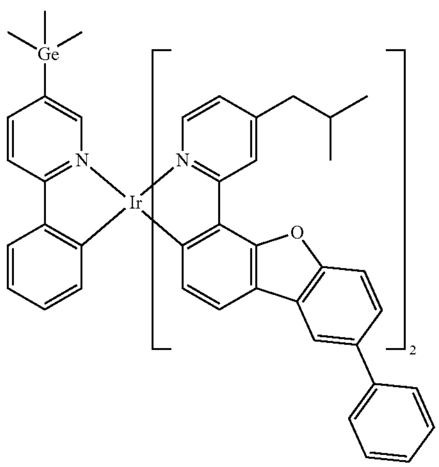
4395
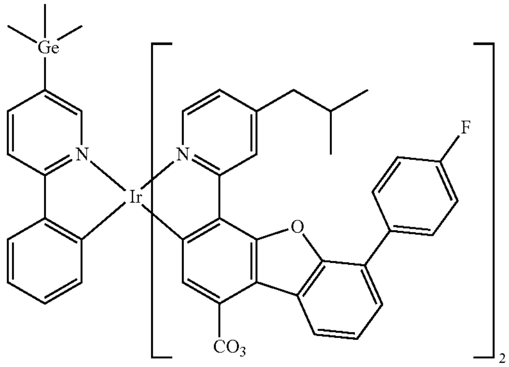
-continued
4396
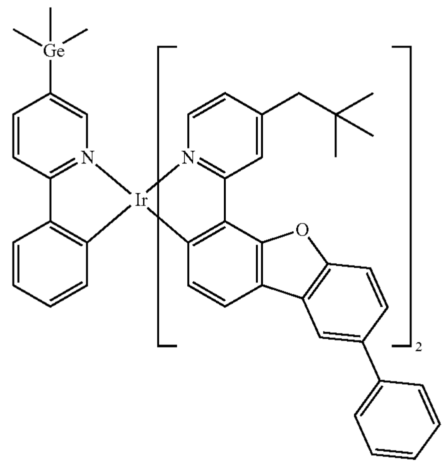
4397
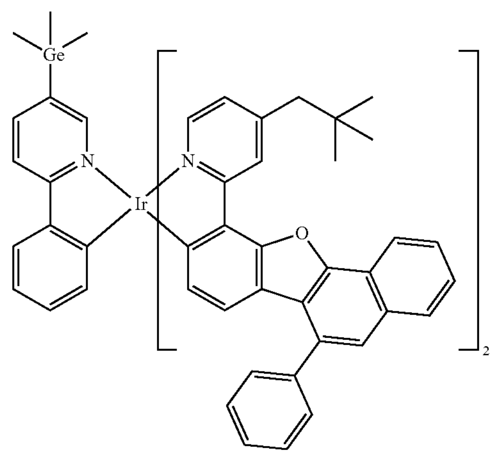
4398
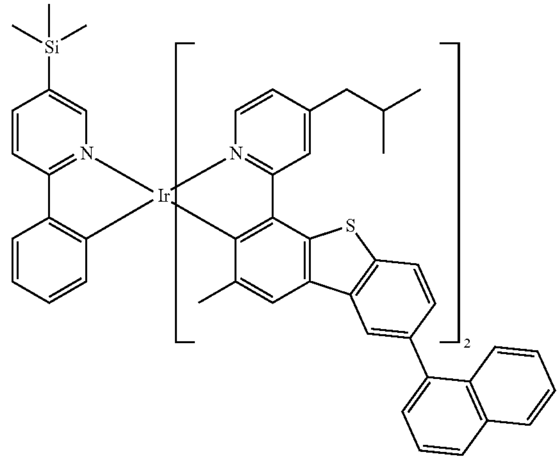

-continued
4399
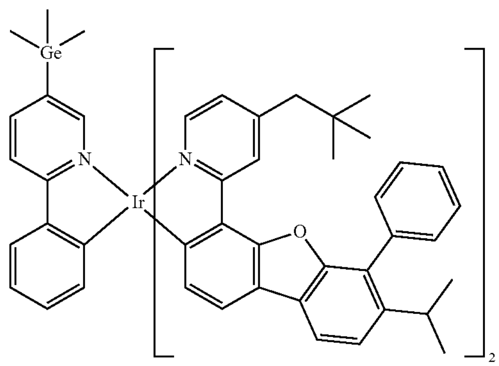
4400
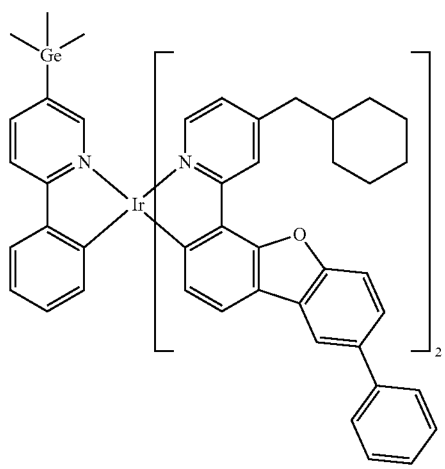
4401
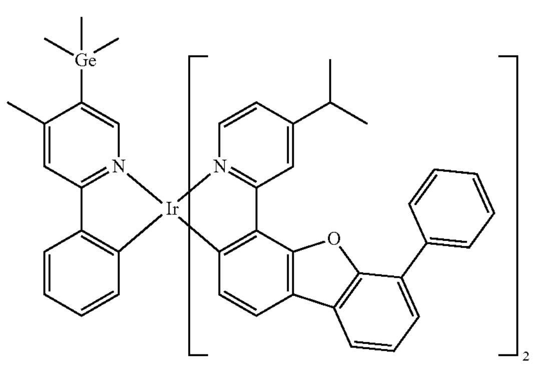
-continued
4402
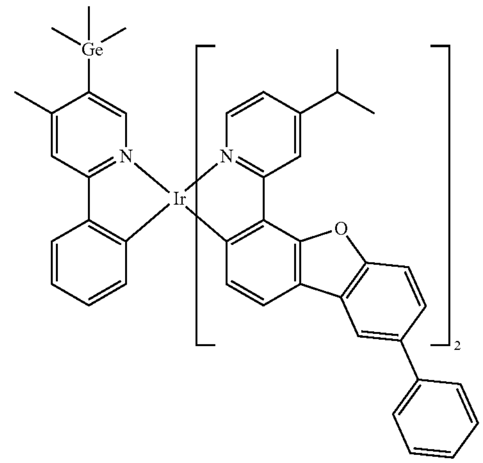
4403
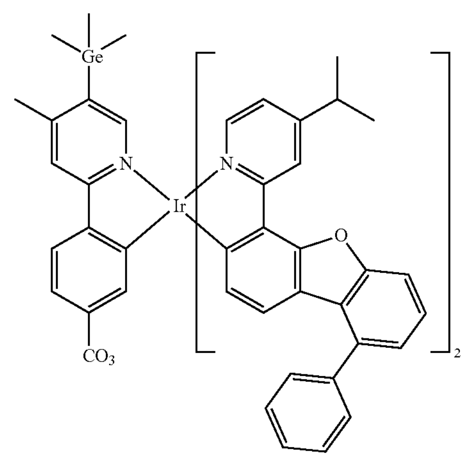
4404
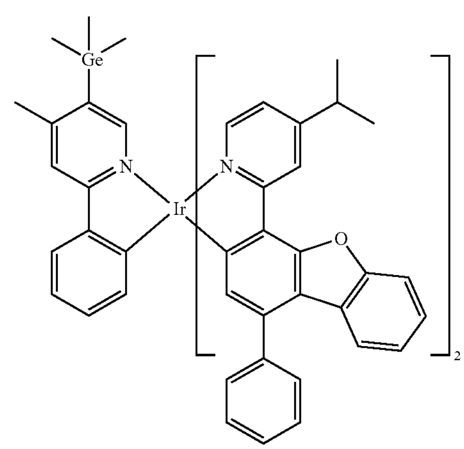

-continued
4405
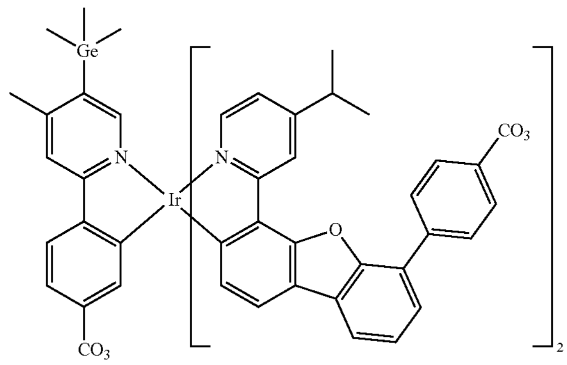
4406
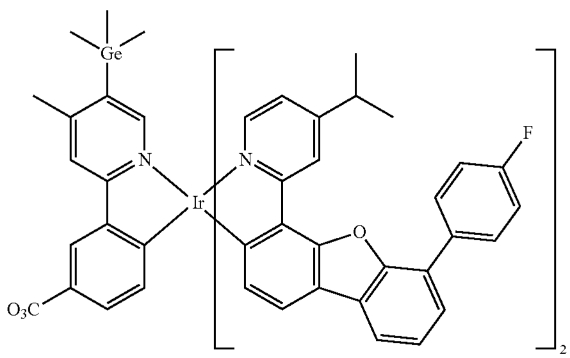
4407
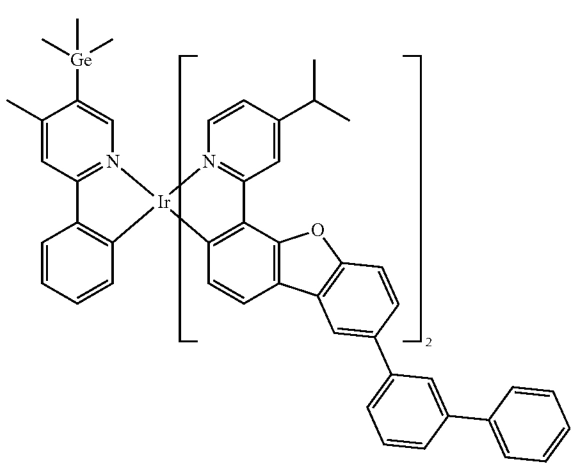
-continued
4408
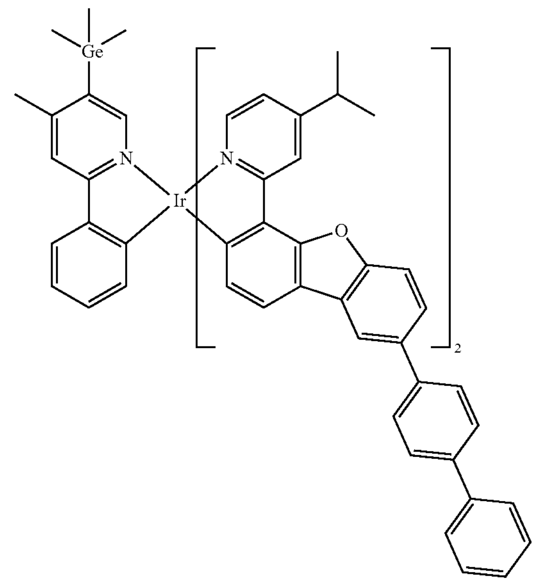
4409
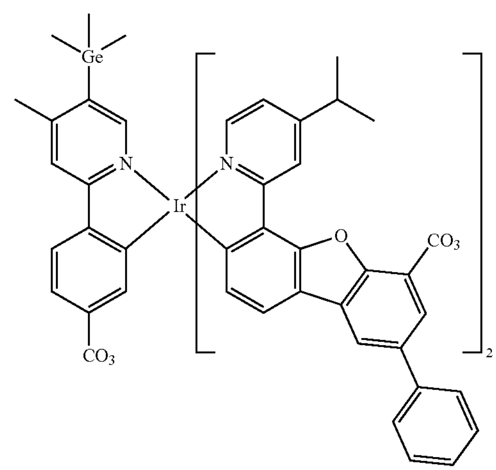
4410
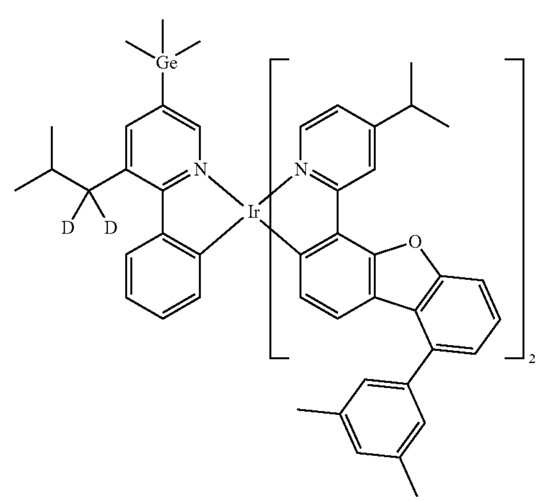

-continued
4411
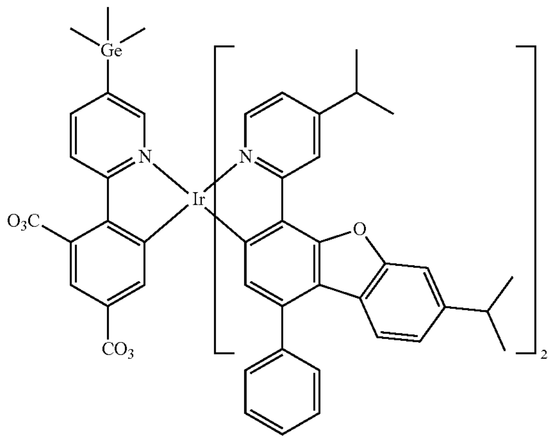
4412
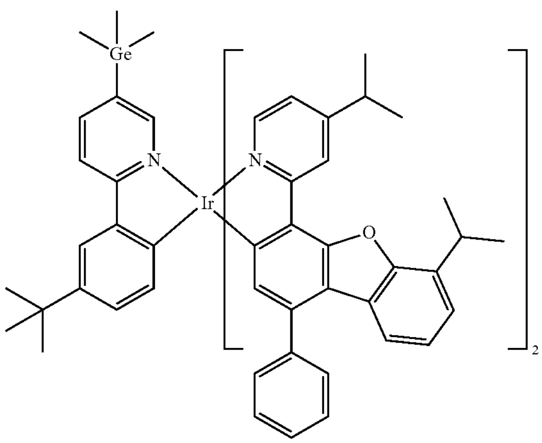
4413
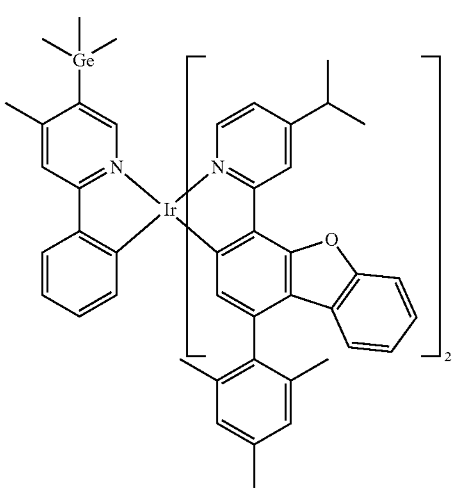
-continued
4414
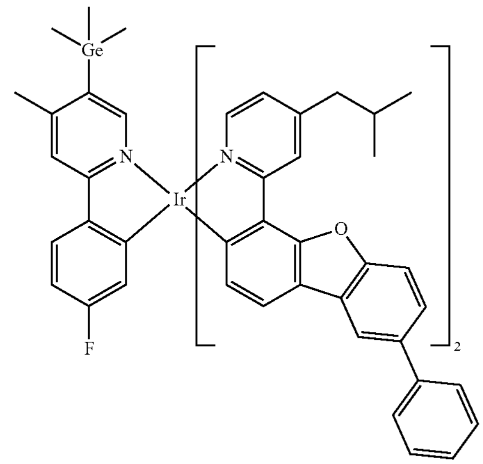
4415
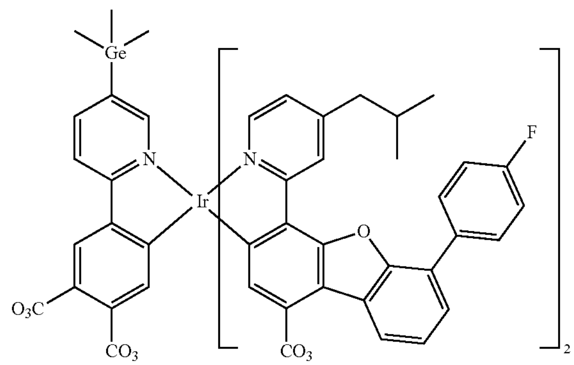
4416
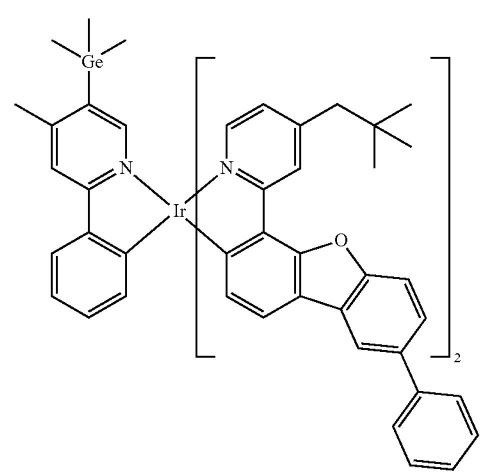

-continued
4417
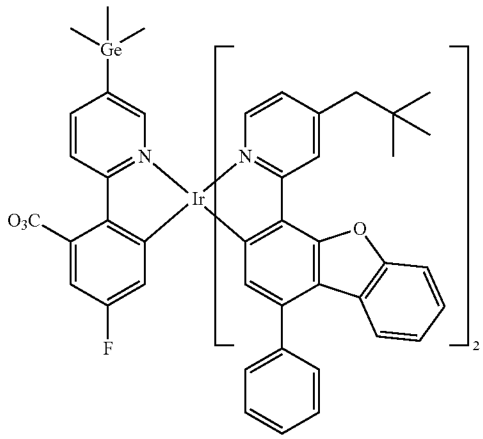
4418
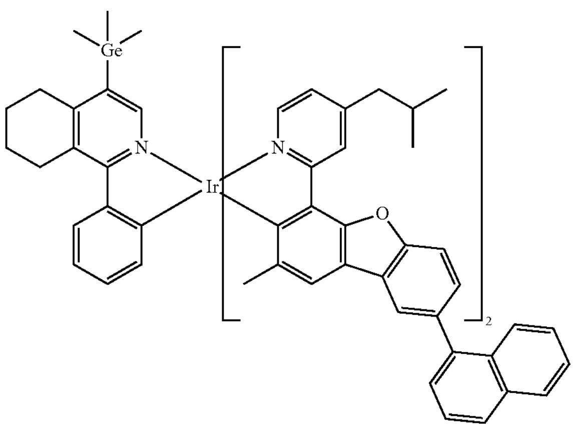
4419
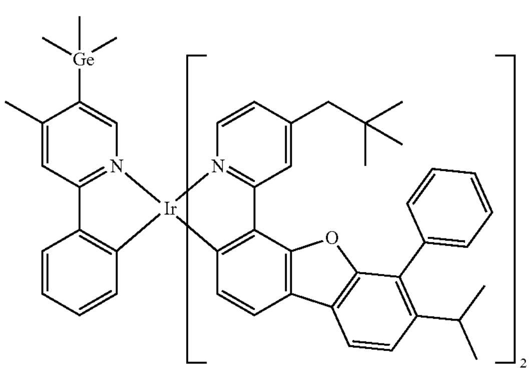
-continued
4420
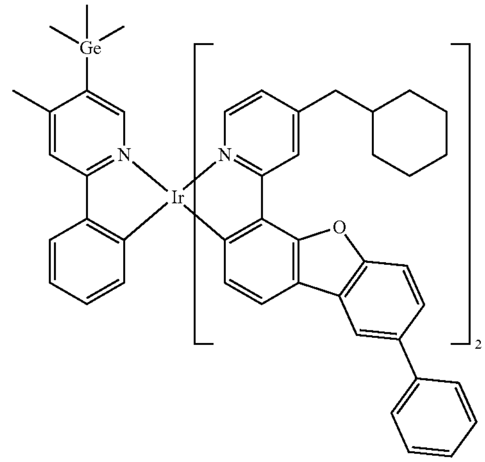
4421
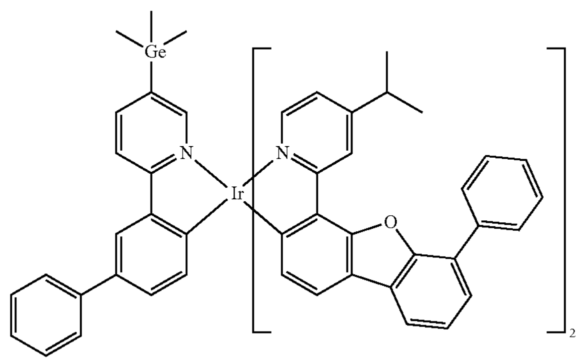
4422
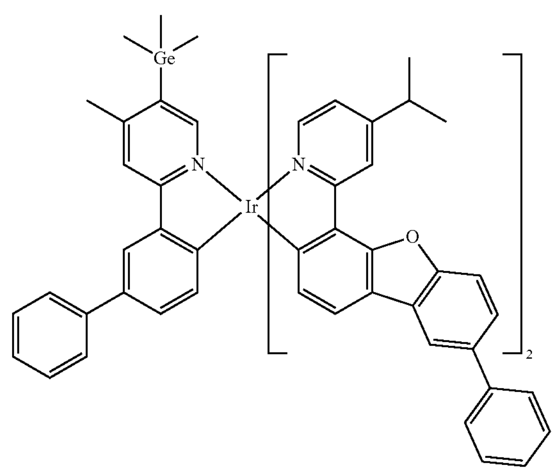

-continued
4423
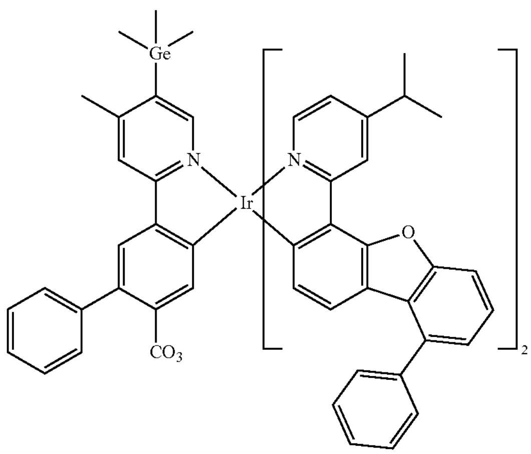
4424
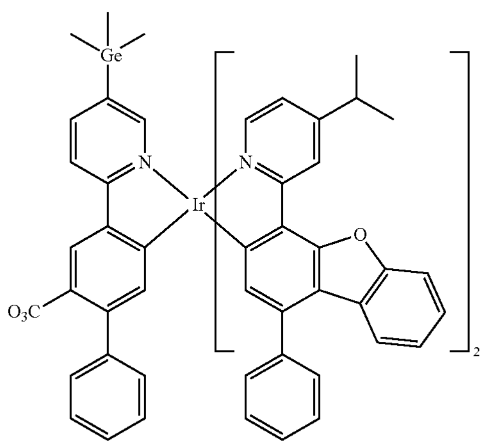
4425
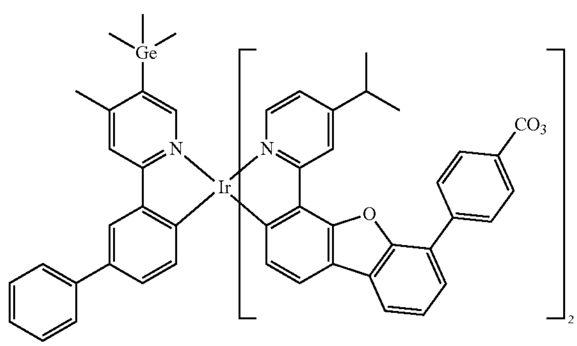
4426
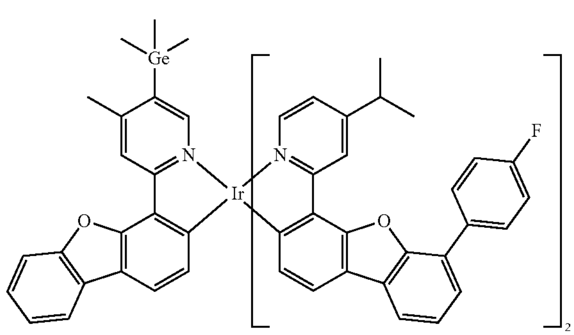
-continued
4427
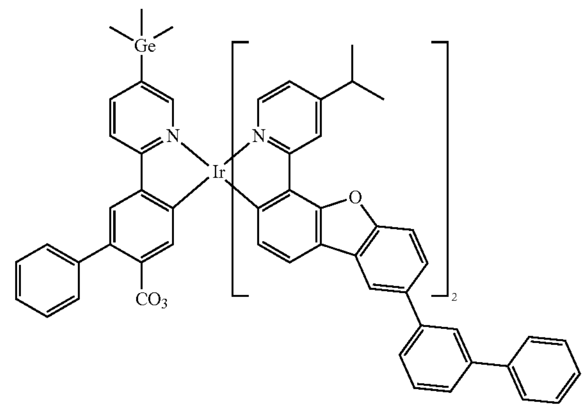
4428
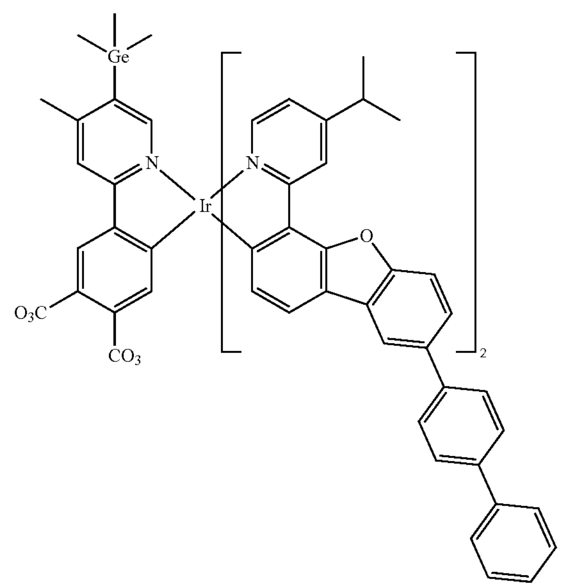
4429
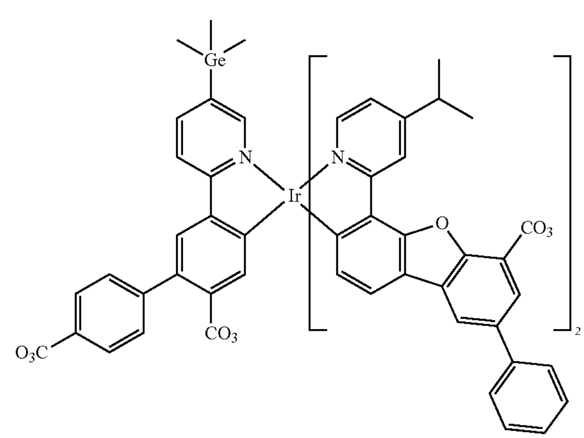

-continued
4430
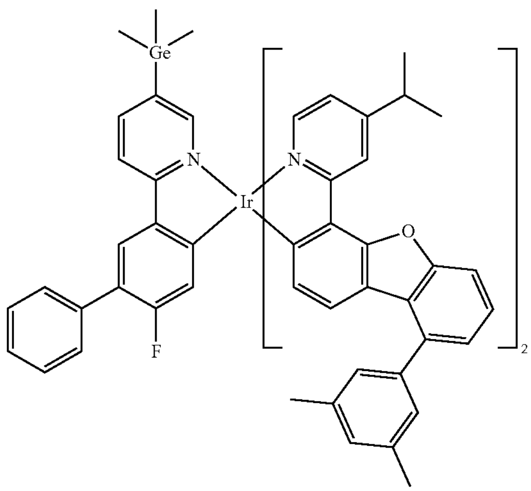
4431
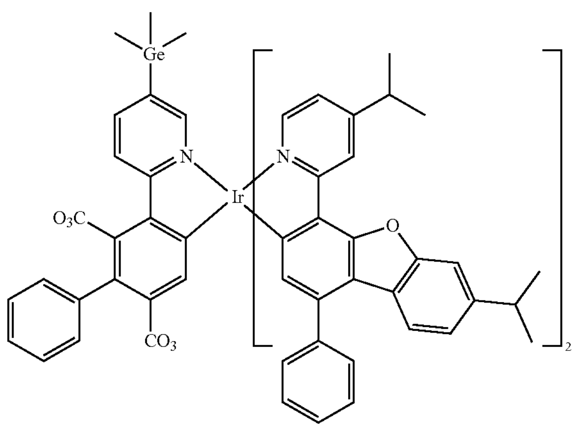
4432
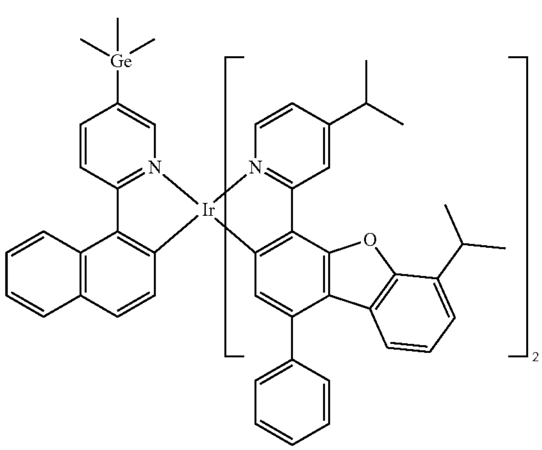
-continued
4433
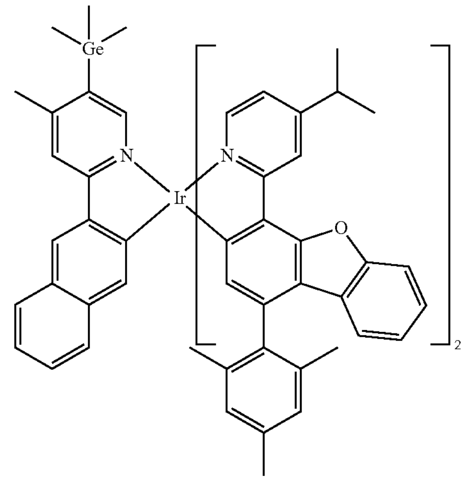
4434
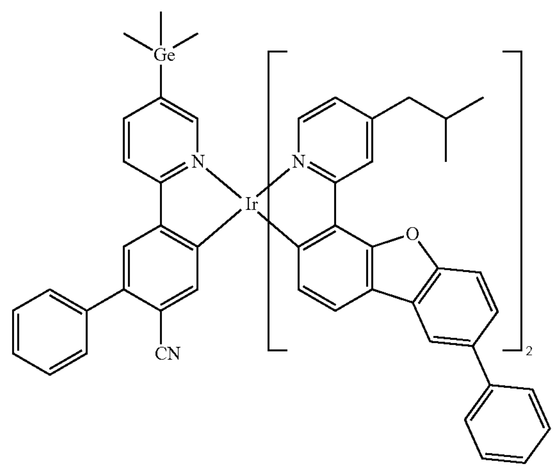
4435
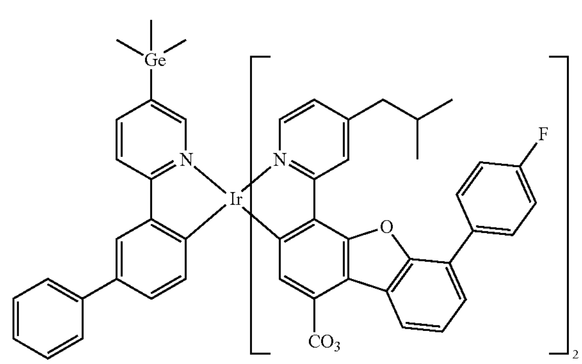

-continued
4436
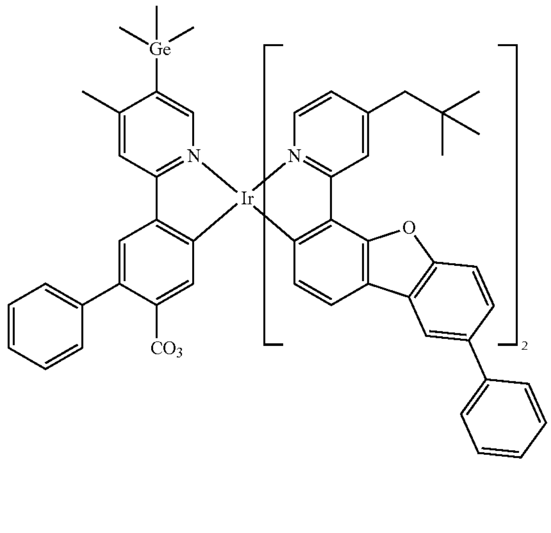
4437
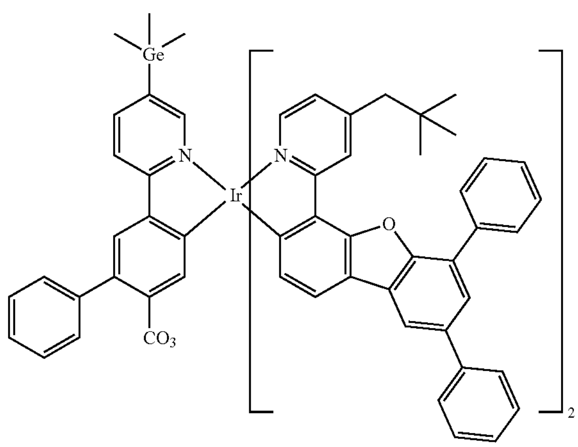
4438
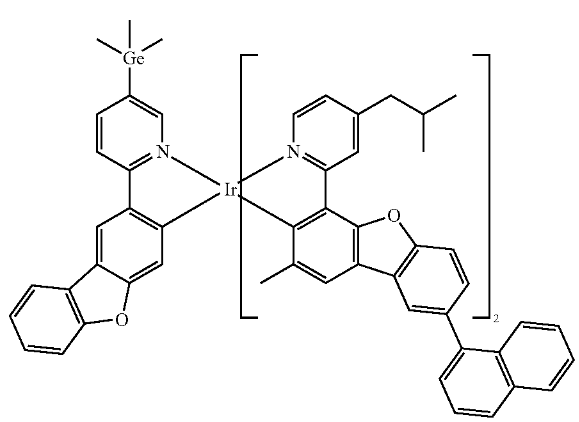
-continued
4439
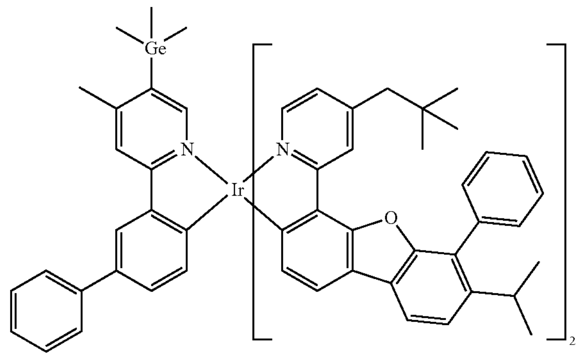
4440
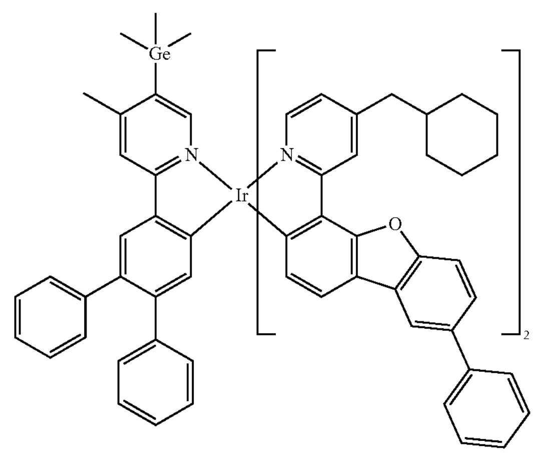
4441
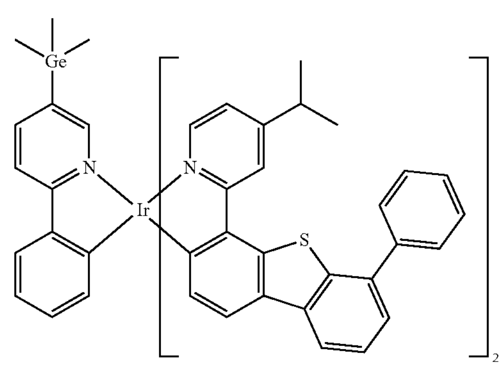

-continued
4442
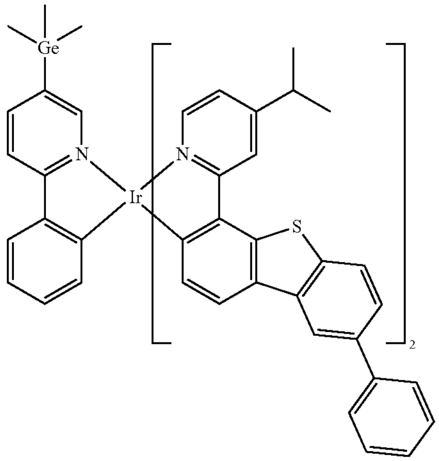
4443
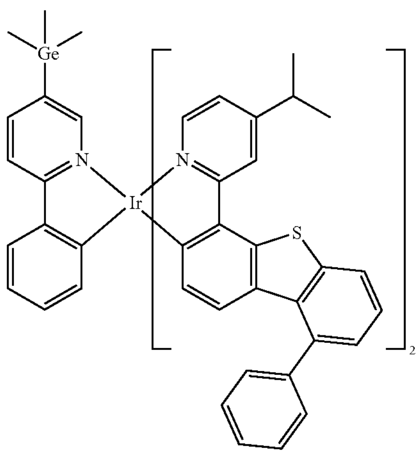
4444
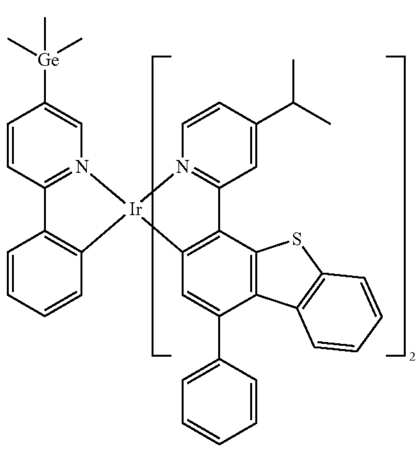
-continued
4445
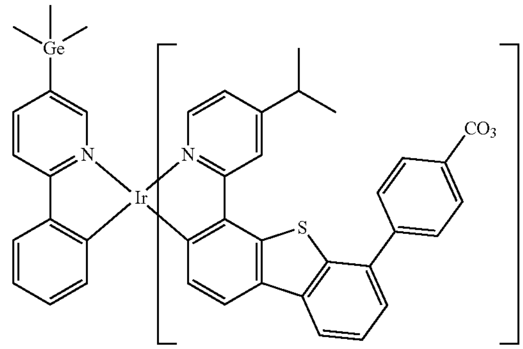
4446
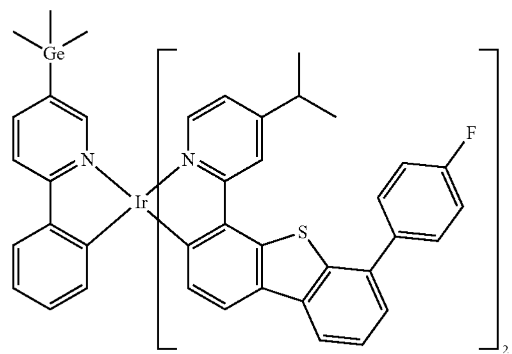
4447
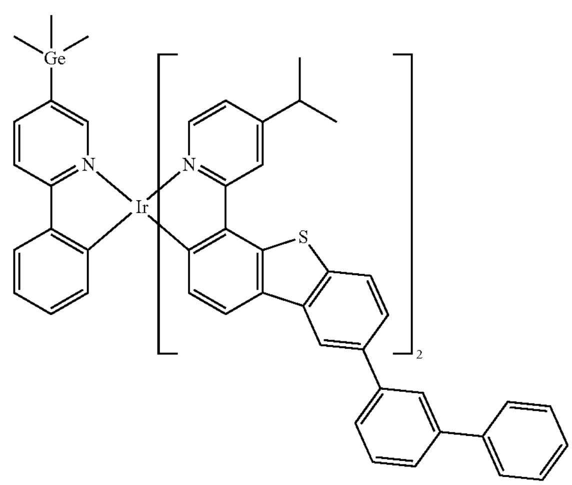

-continued
4448
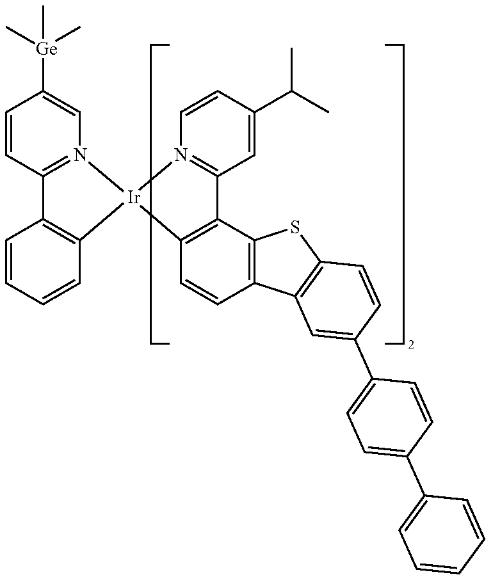
4449
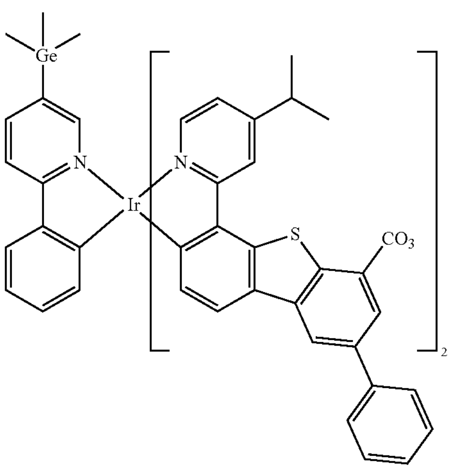
4450
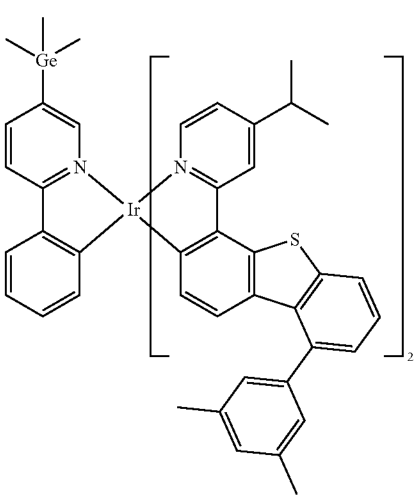
-continued
4451
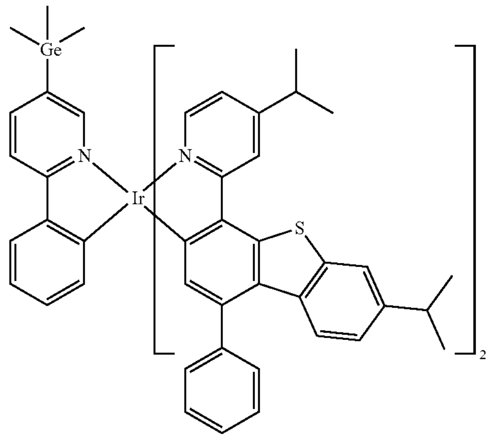
4452
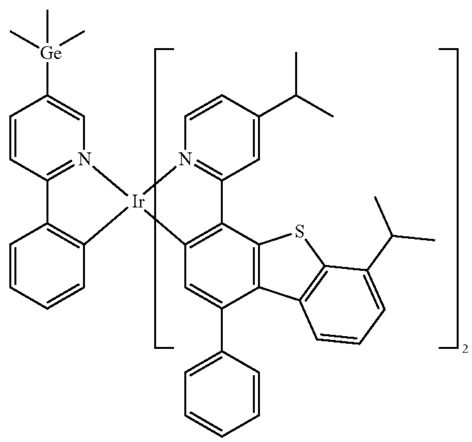
4453
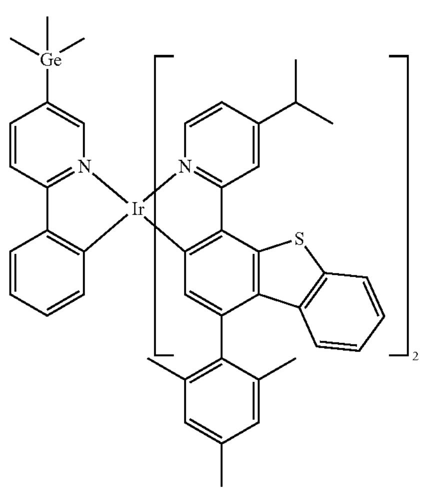

-continued
4454
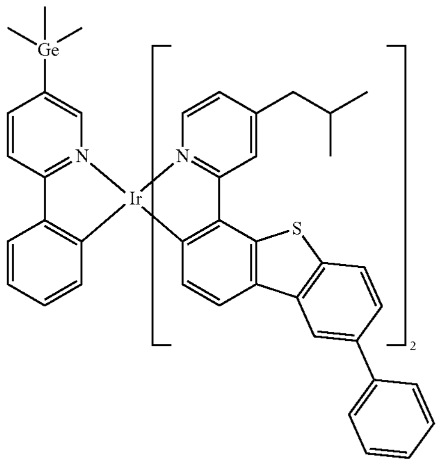
4455
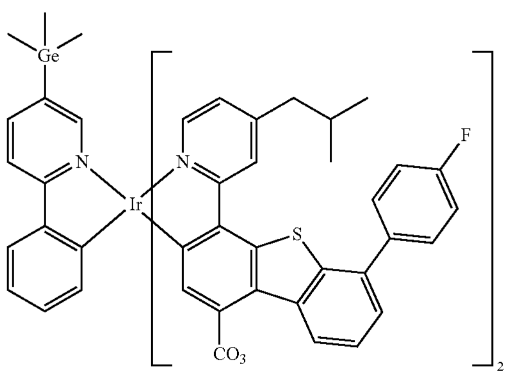
4456
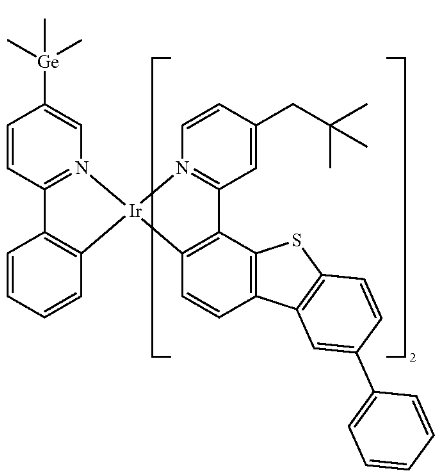
-continued
4457
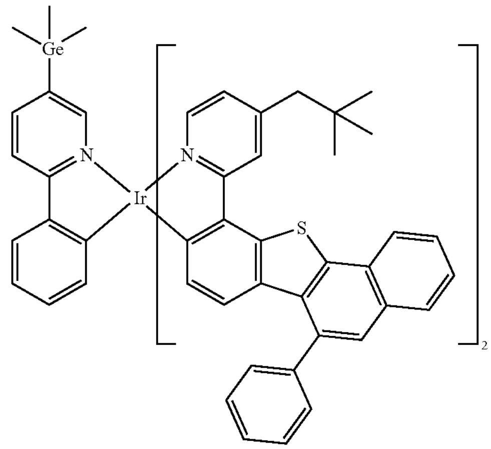
4458
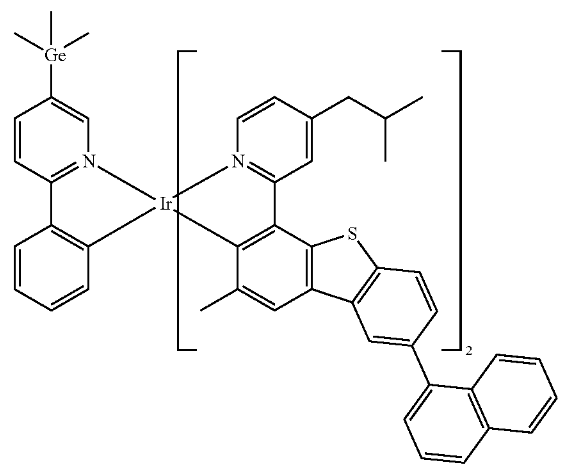
4459
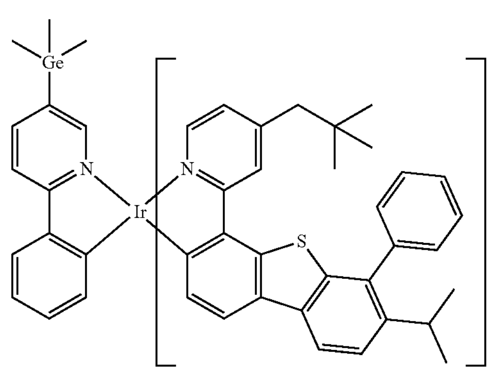

-continued
4460
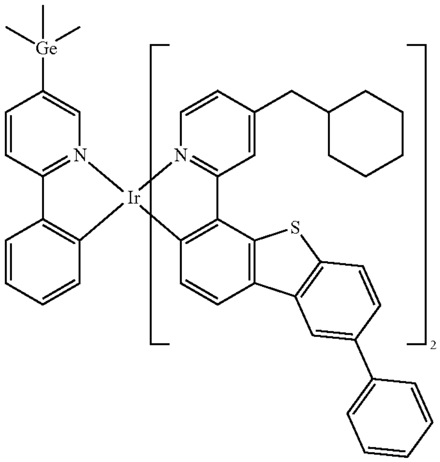
4461
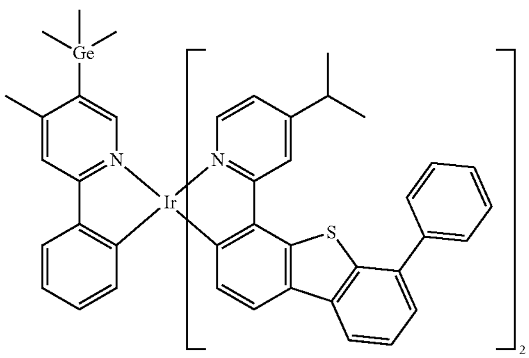
4462
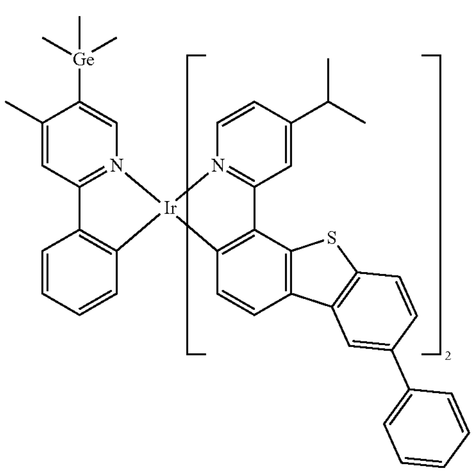
-continued
4463
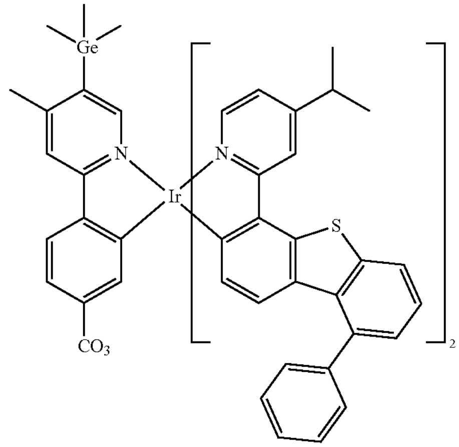
4464
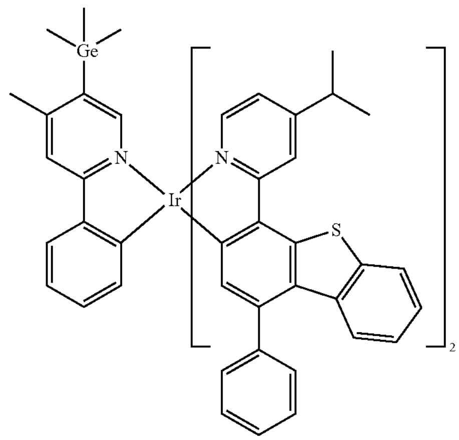
4465
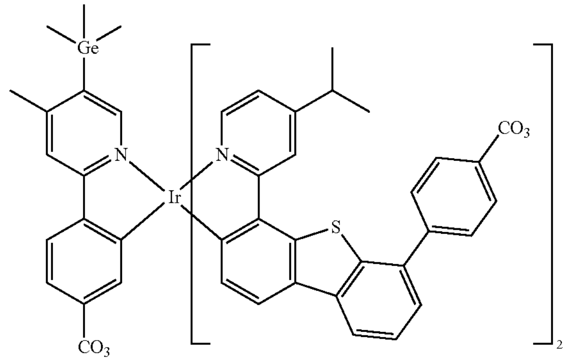
4466
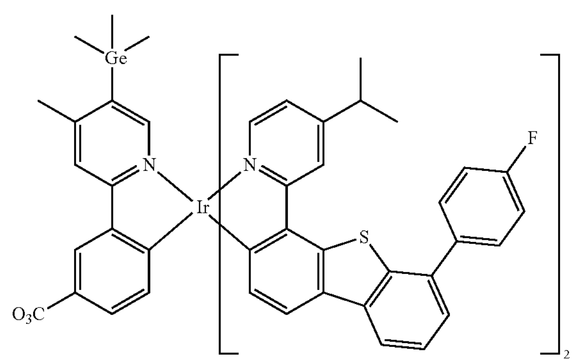

-continued
4467
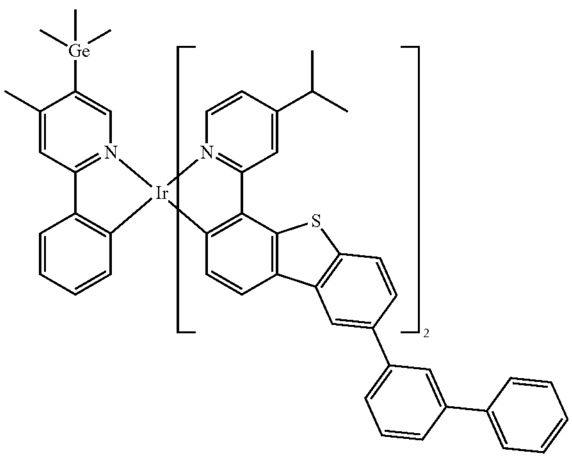
4468
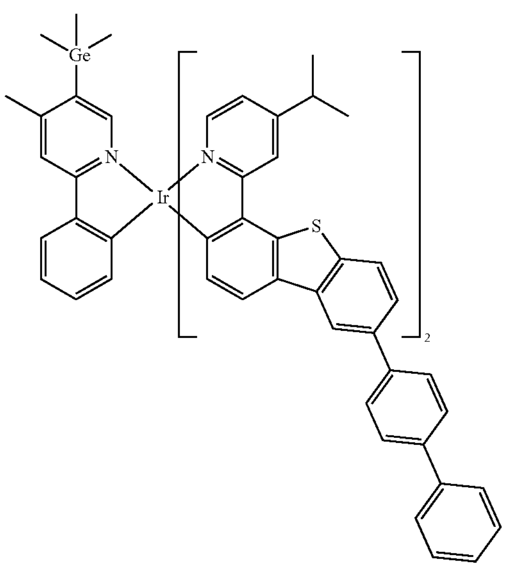
4469
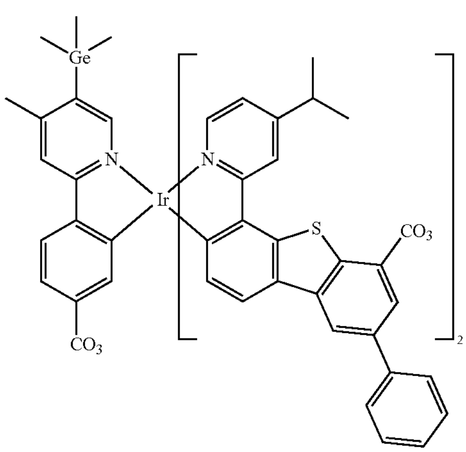
-continued
4470
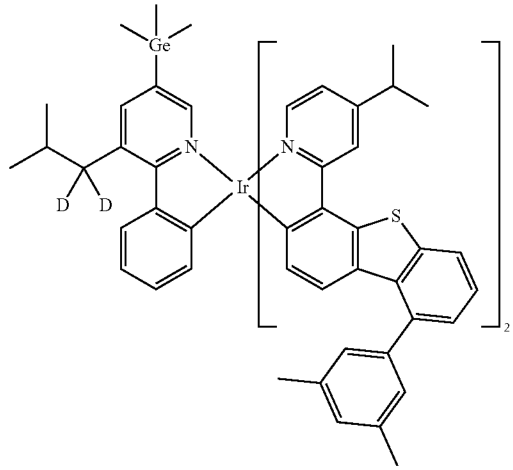
4471
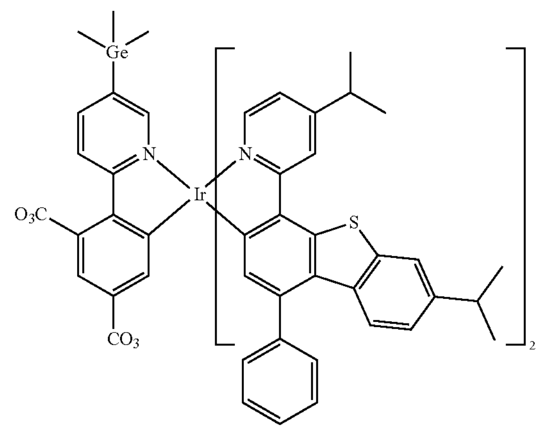
4472
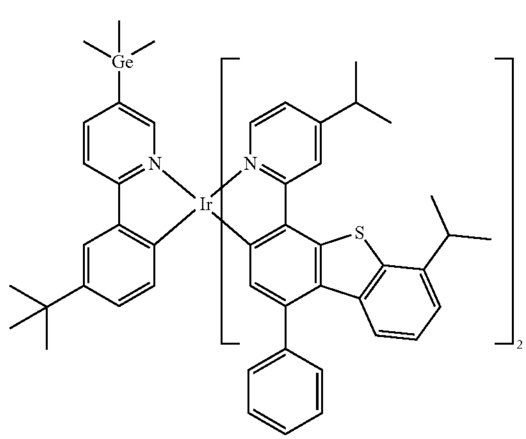

-continued
4473
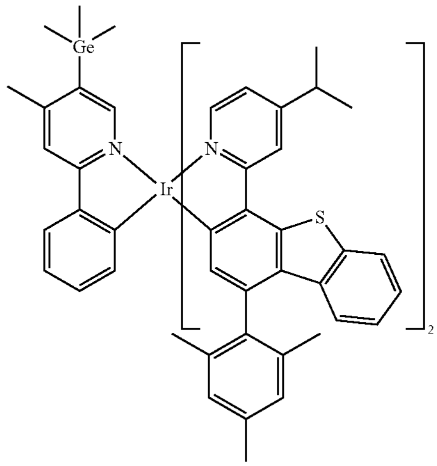
4474
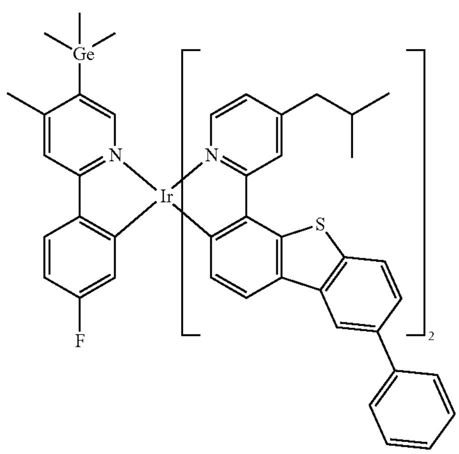
4475
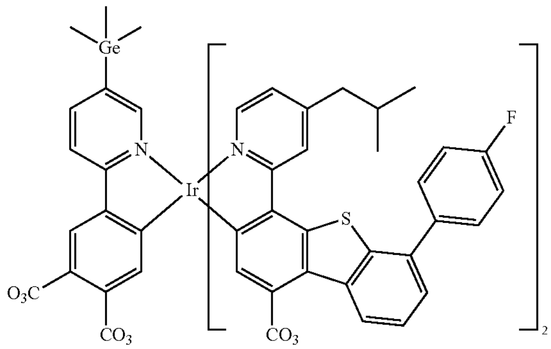
-continued
4476
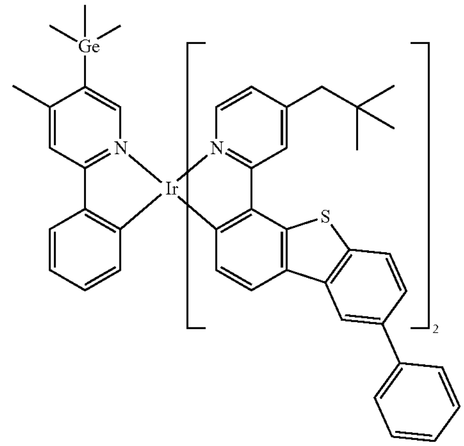
4477
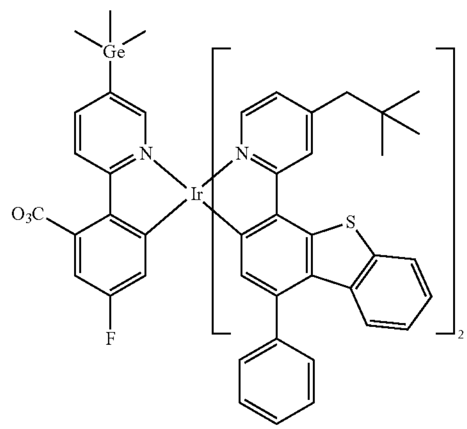
4478
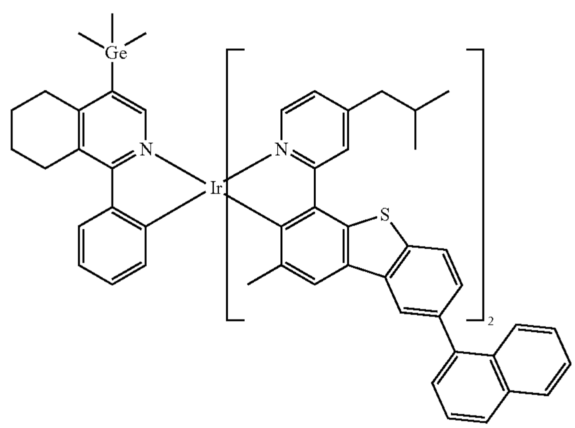

-continued
4479
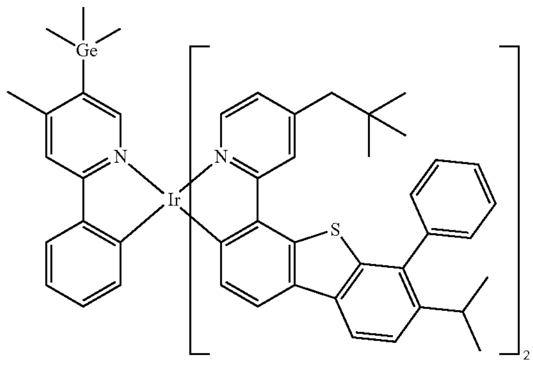
4480
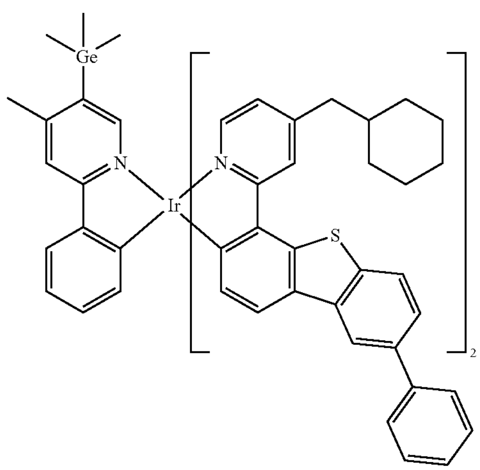
4481
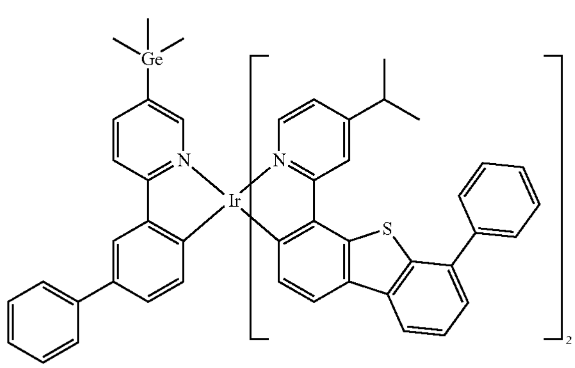
-continued
4482
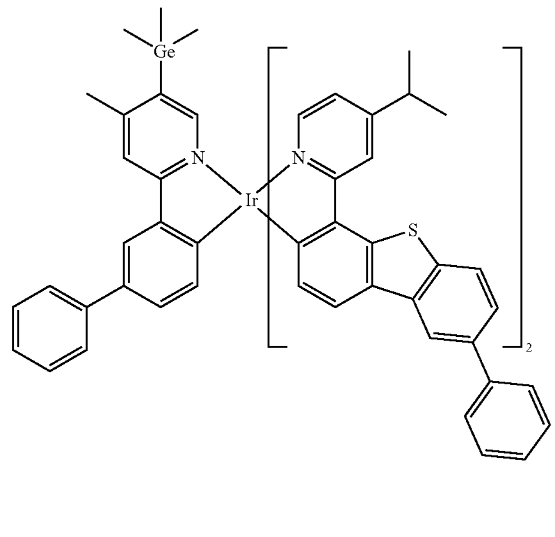
4483
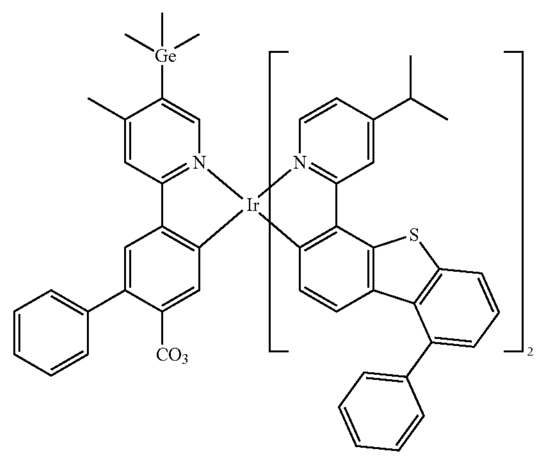
4484
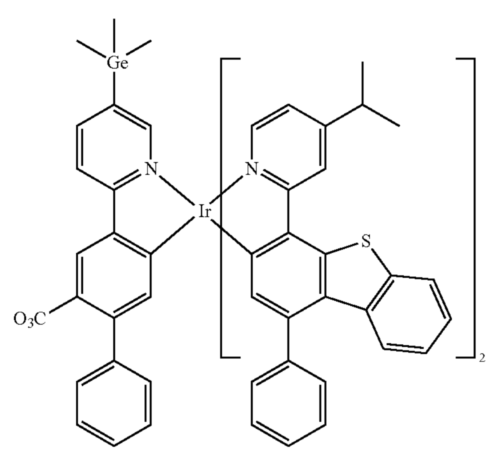

4485
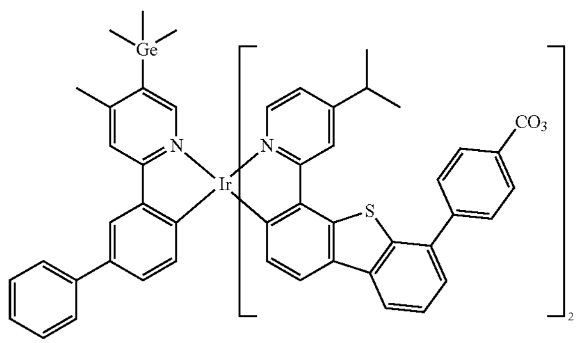
4486
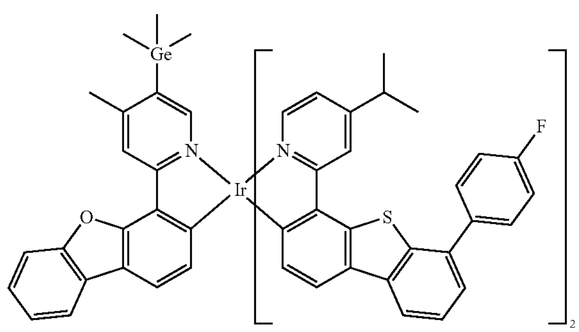
4487
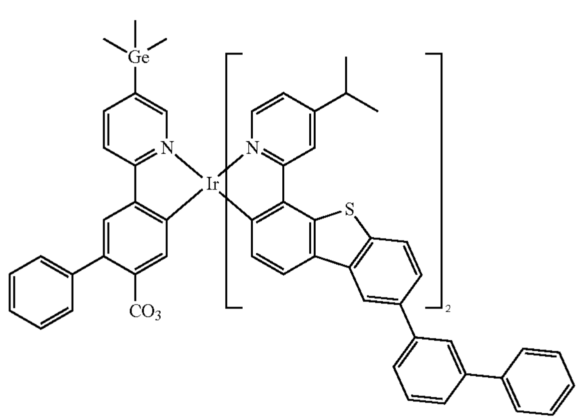
4488
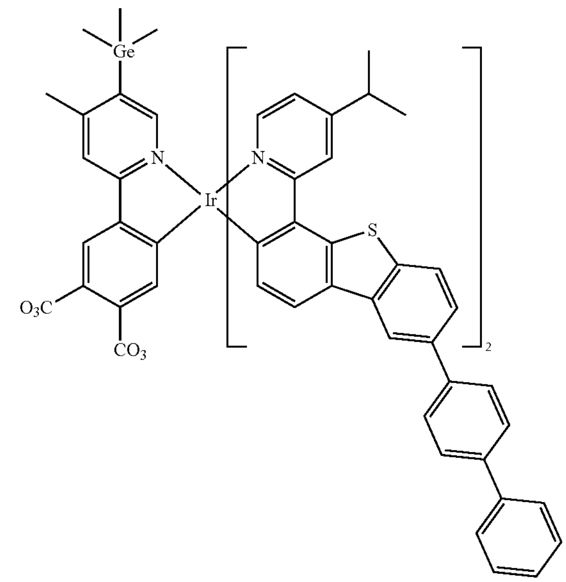
4489
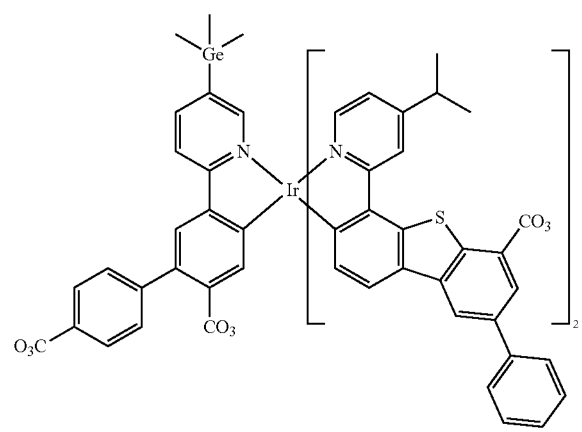
4490
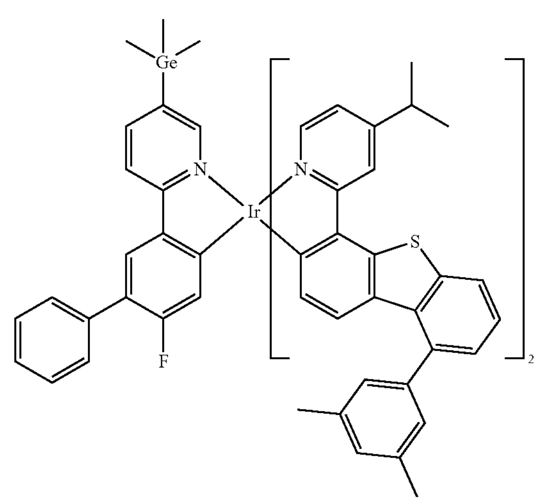

-continued
4491
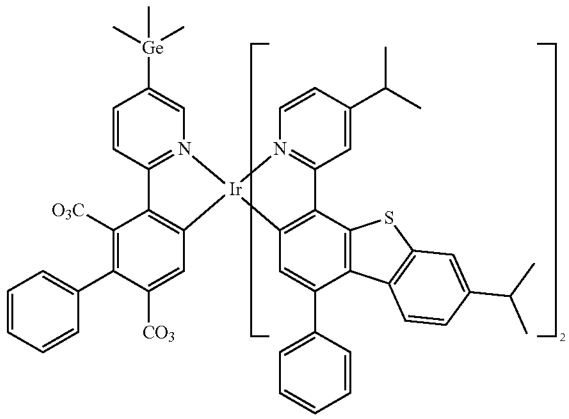
4492
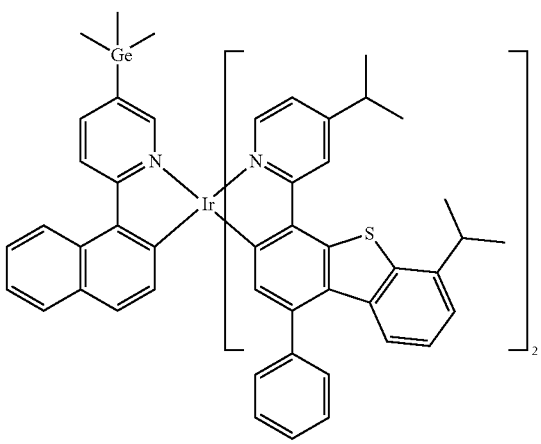
4493
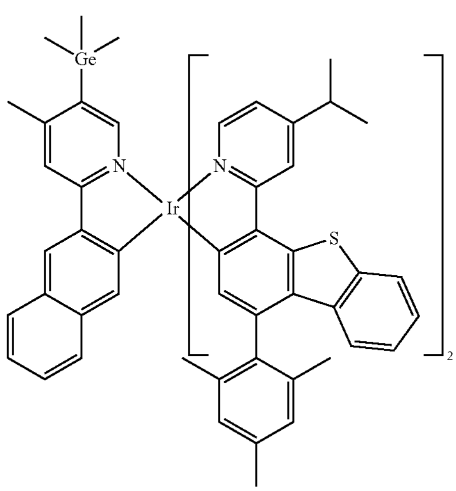
-continued
4494
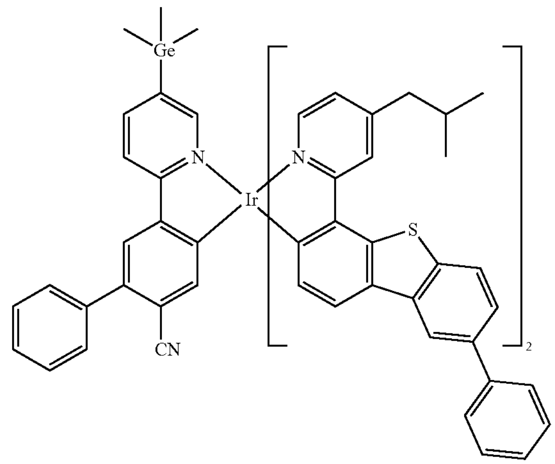
4495
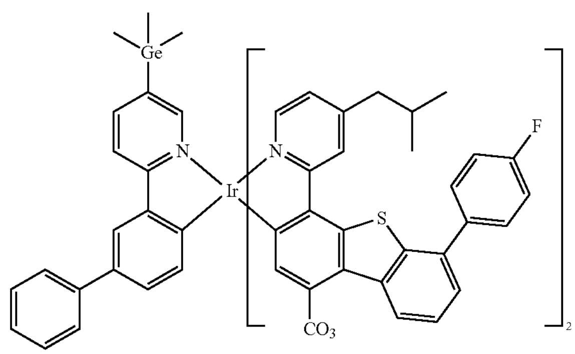
4496
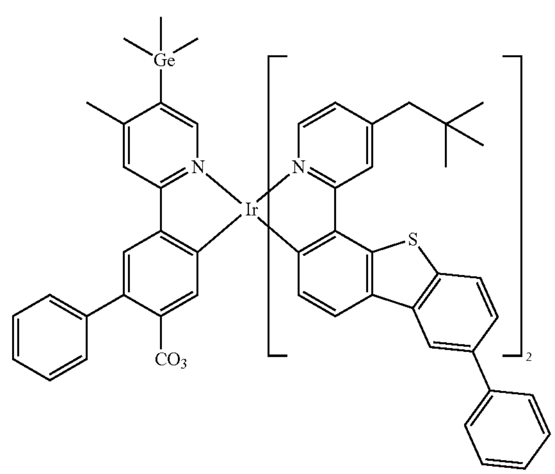

-continued
4497
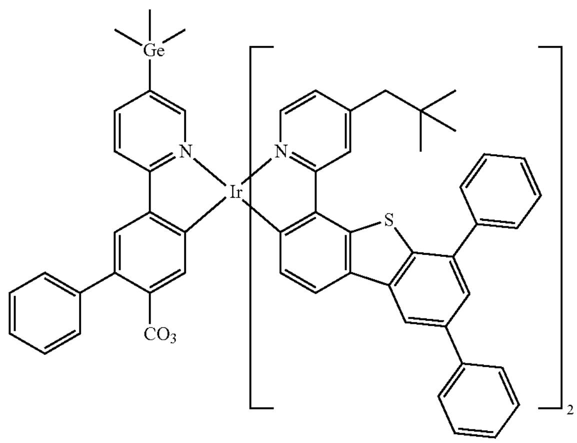
4498
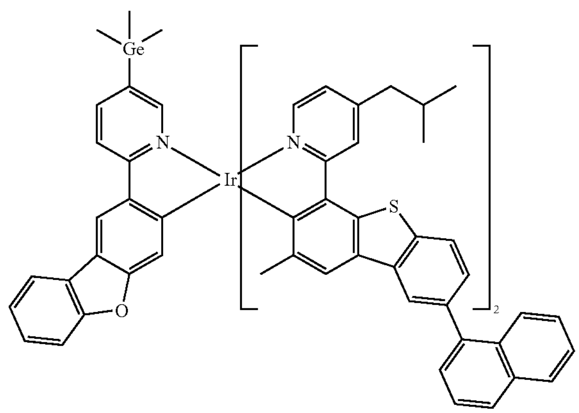
4499
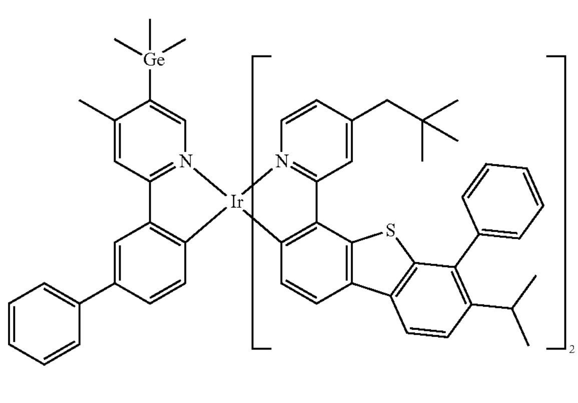
-continued
4500
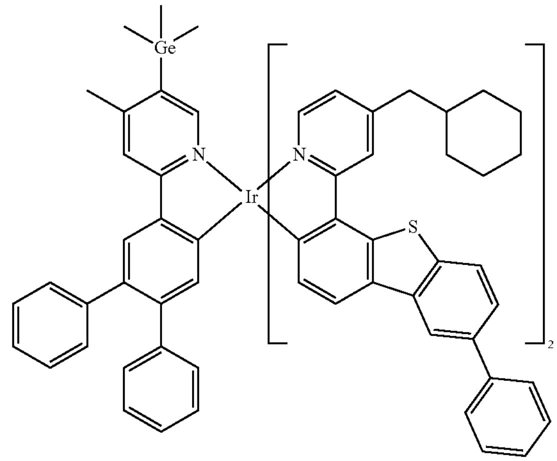
4501
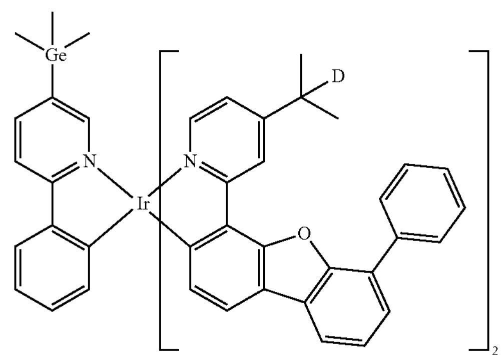
4502
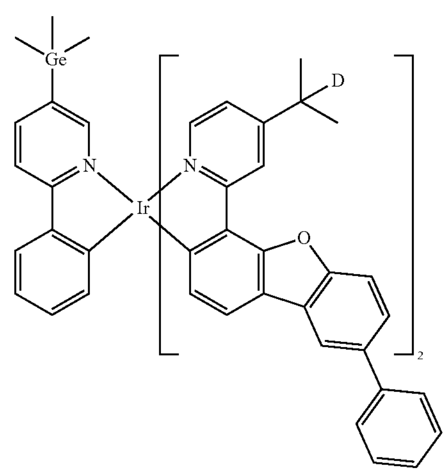

-continued
4503
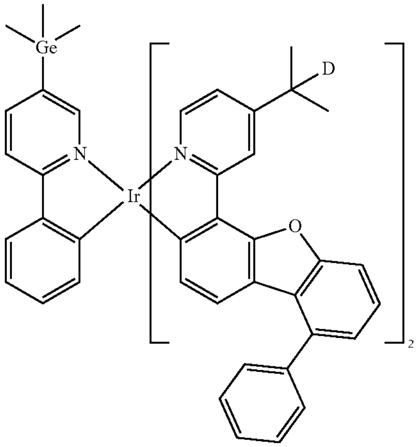
4504
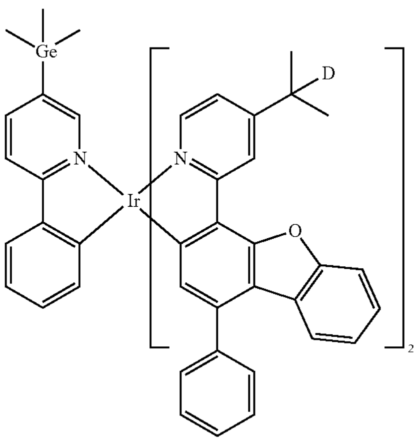
4505
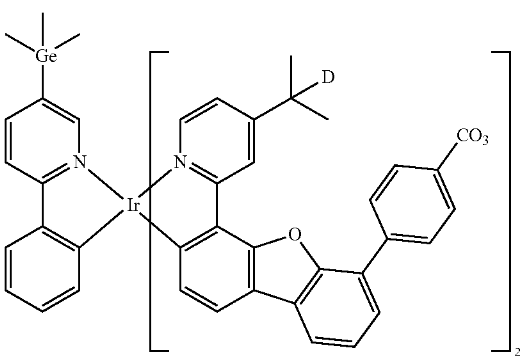
4506
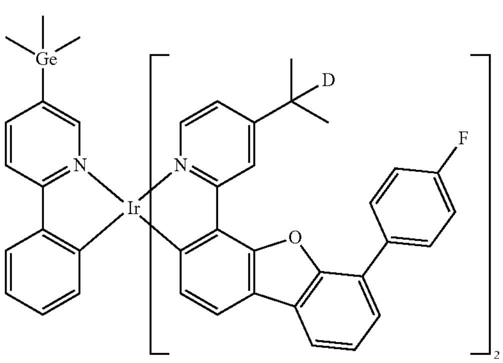
-continued
4507
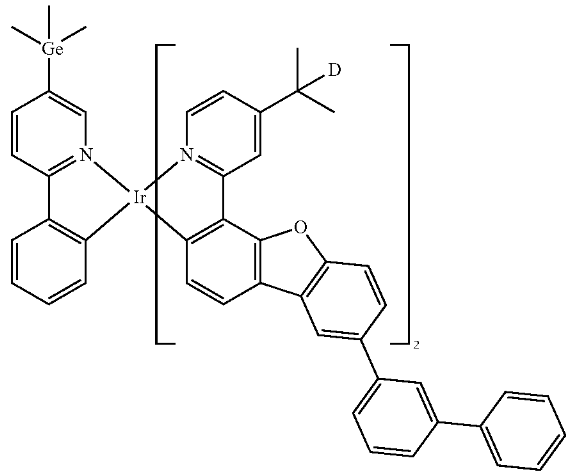
4508
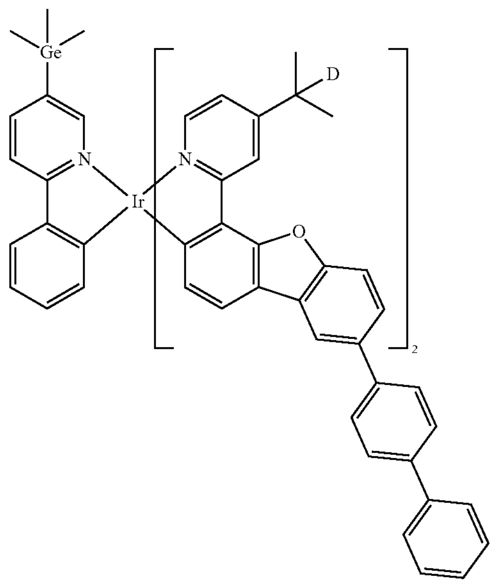
4509
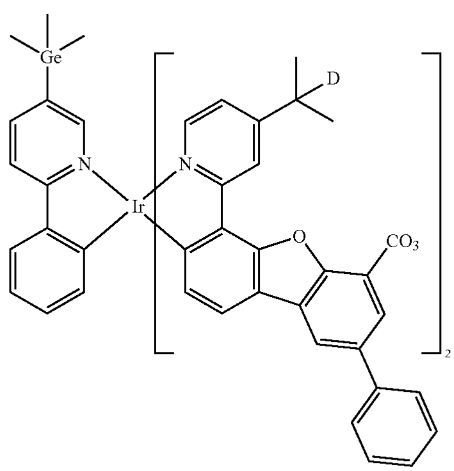

4510
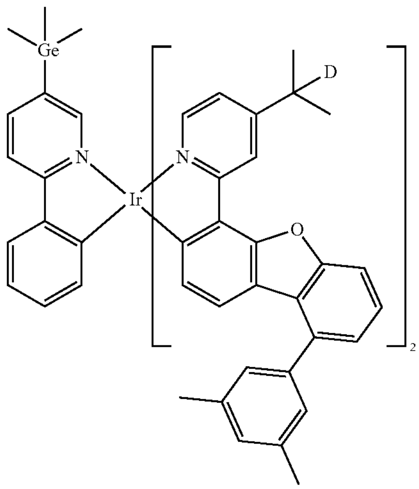
4511
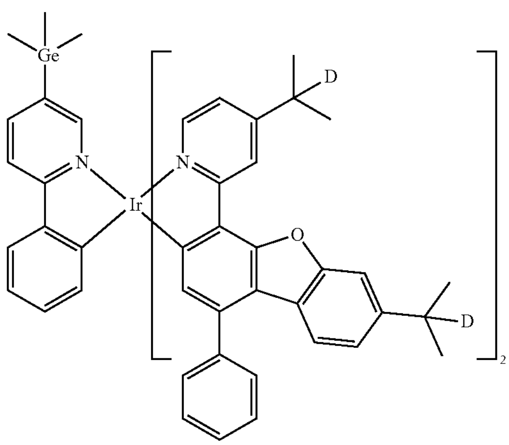
4512
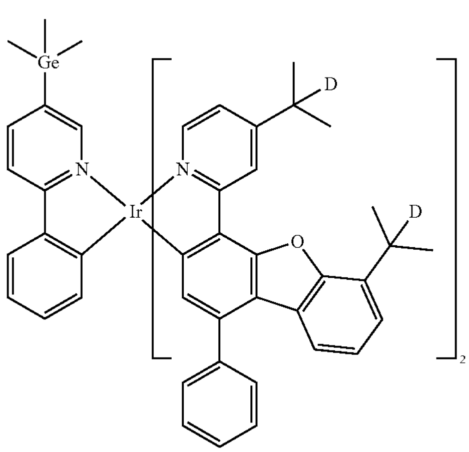
4513
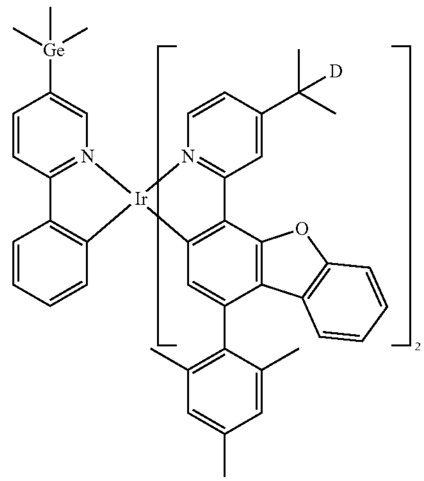
4514
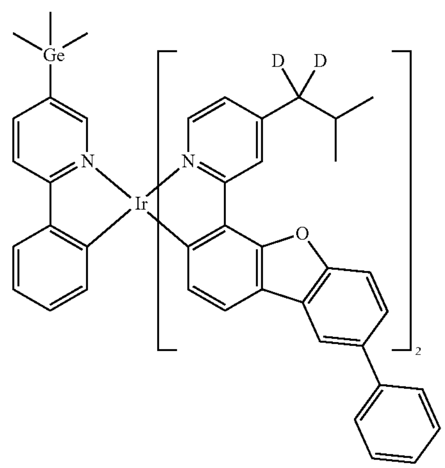
4515
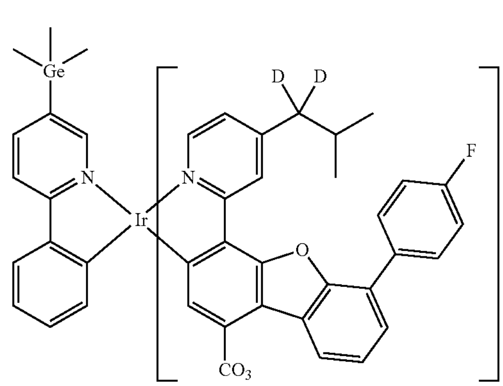

4516
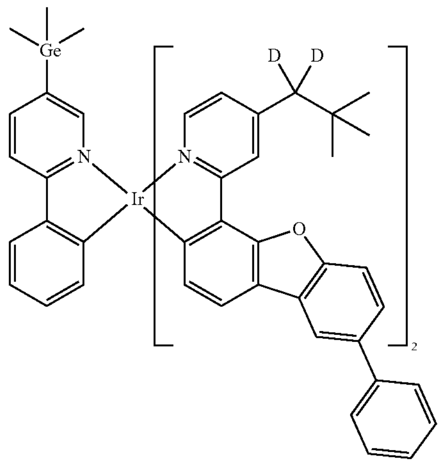
4517
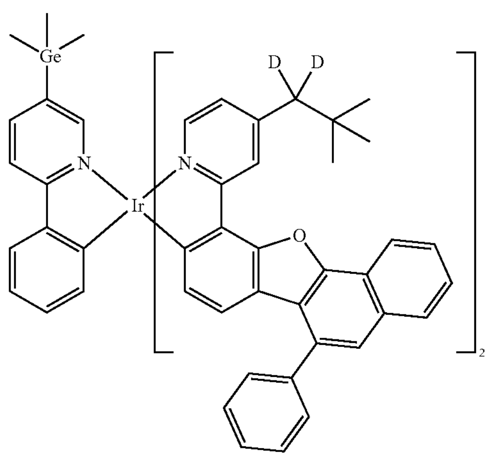
4518
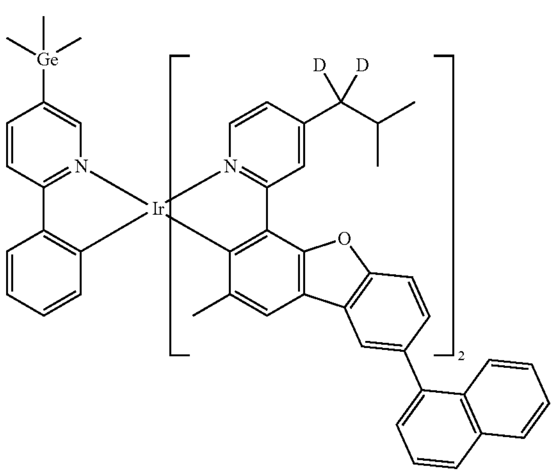
4519
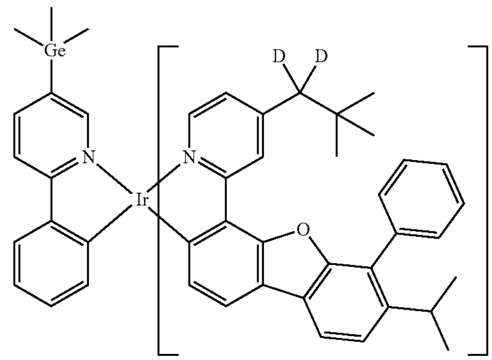
4520
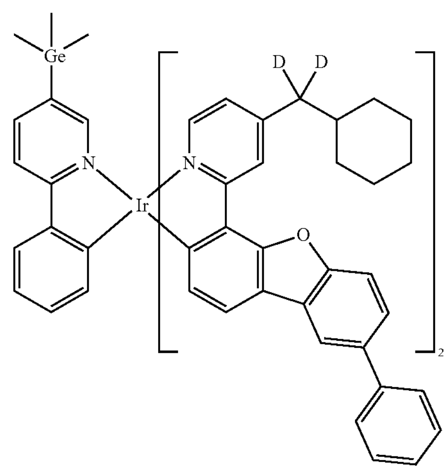
4521
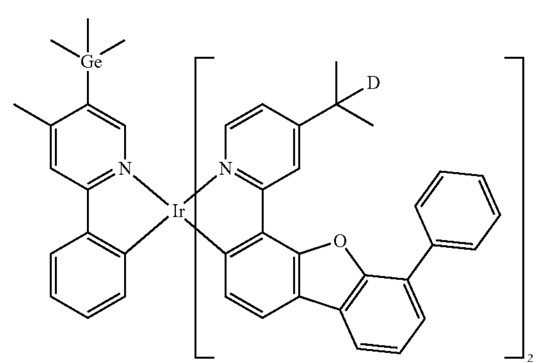

-continued
4522
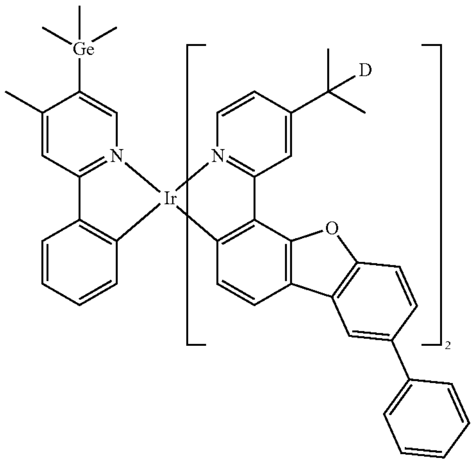
4523
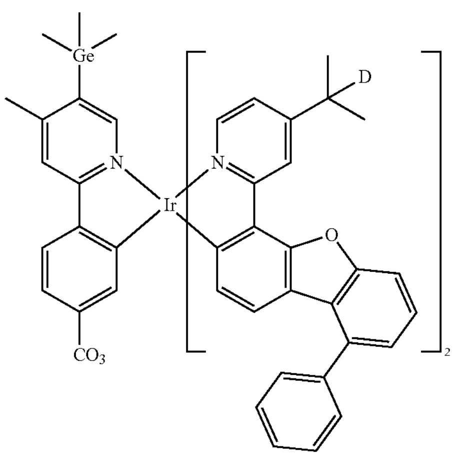
4524
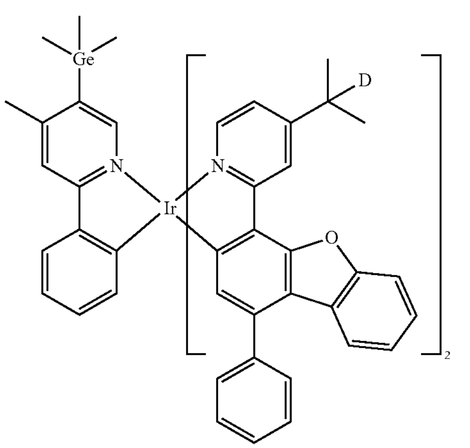
-continued
4525
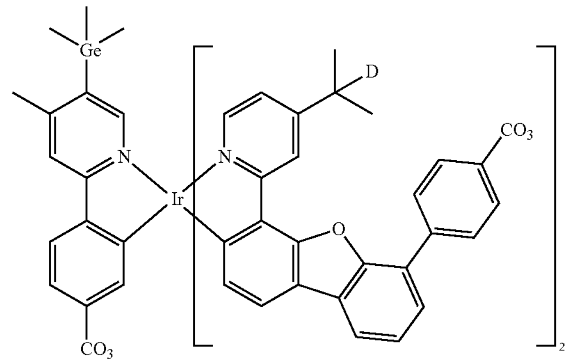
4526
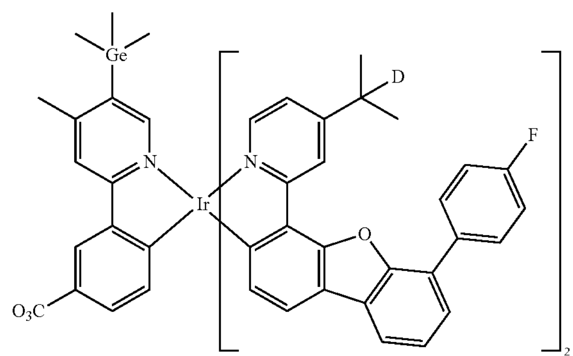
4527
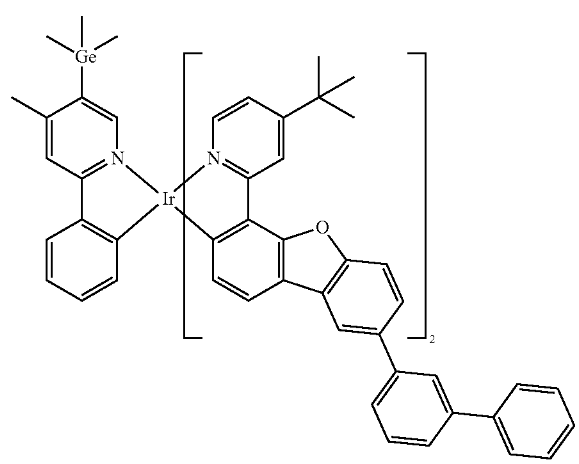

-continued
4528
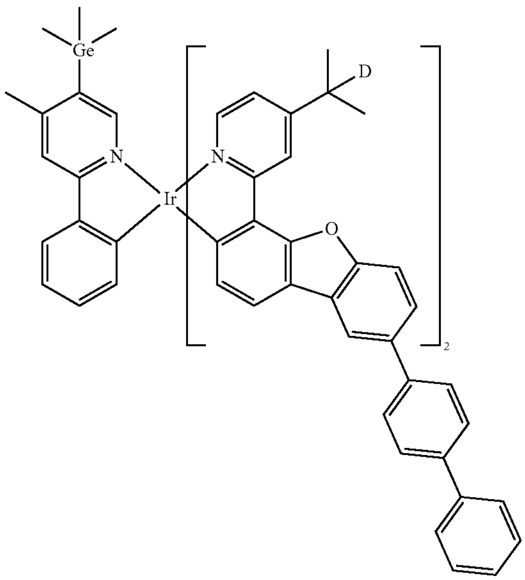
4529
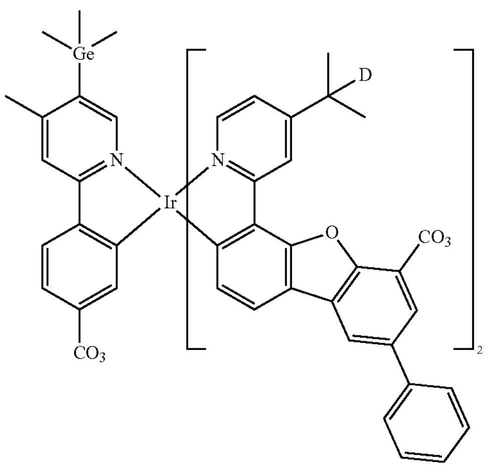
4530
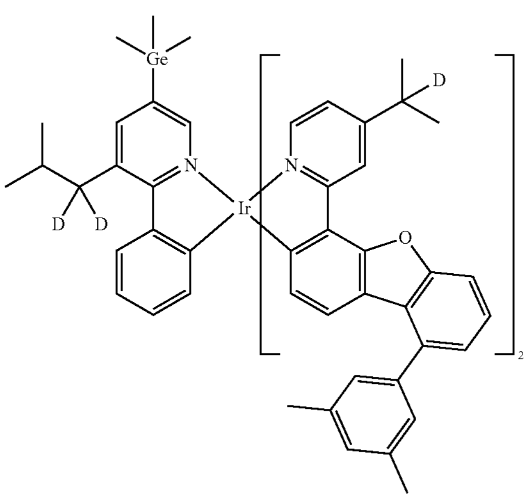
-continued
4531
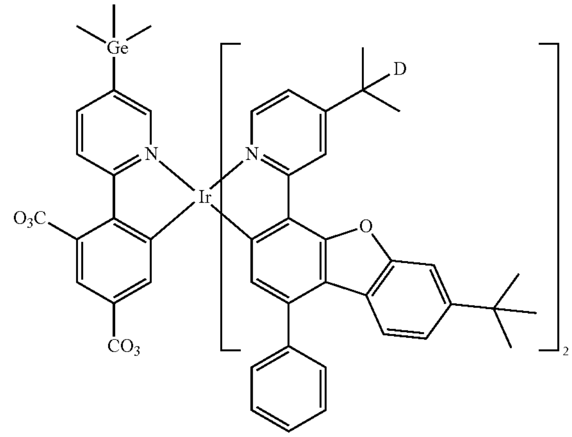
4532
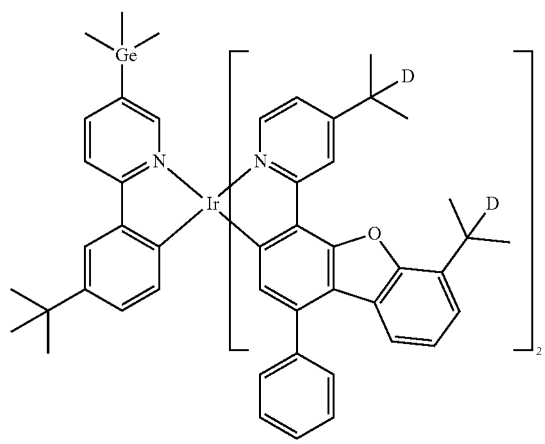
4533
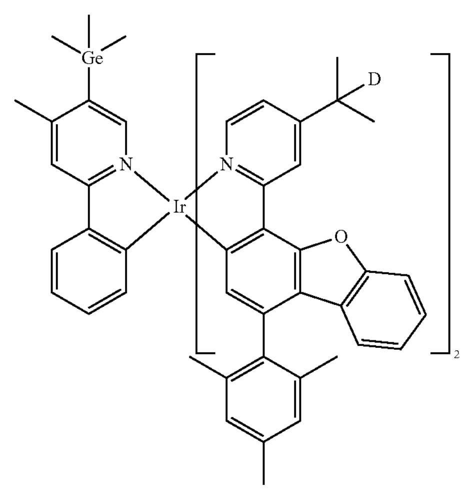

-continued
4534
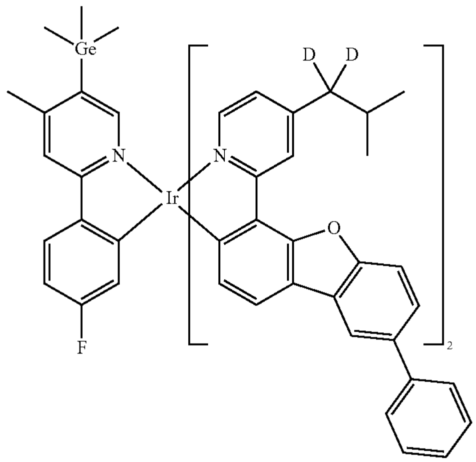
4535
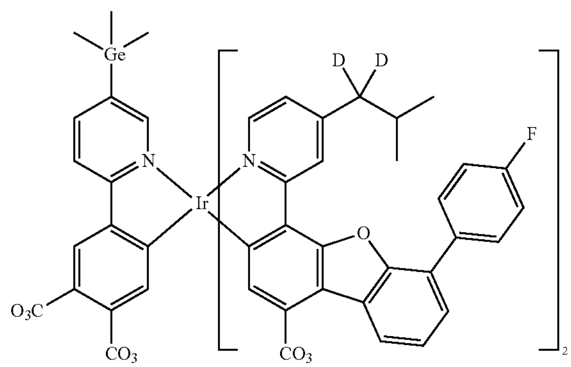
4536
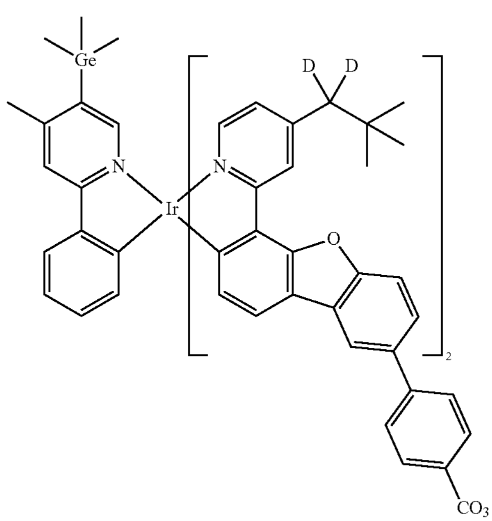
-continued
4537
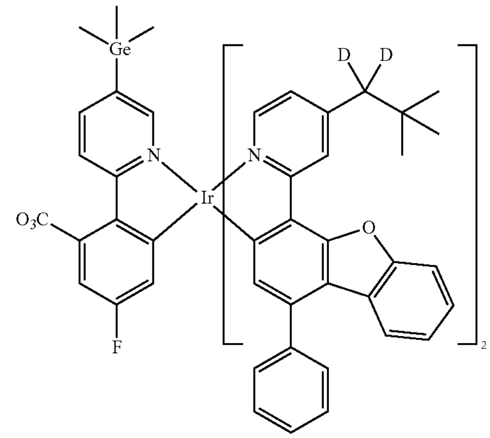
4538
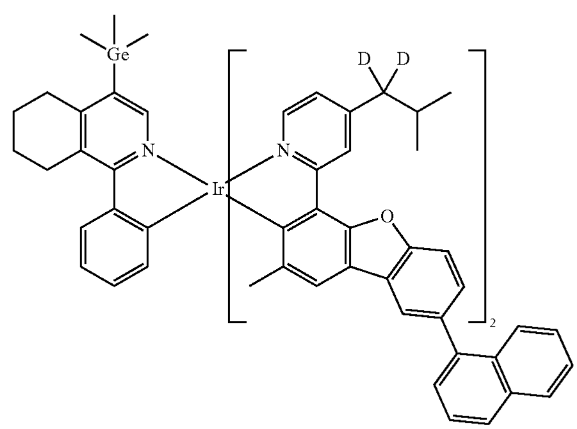
4539
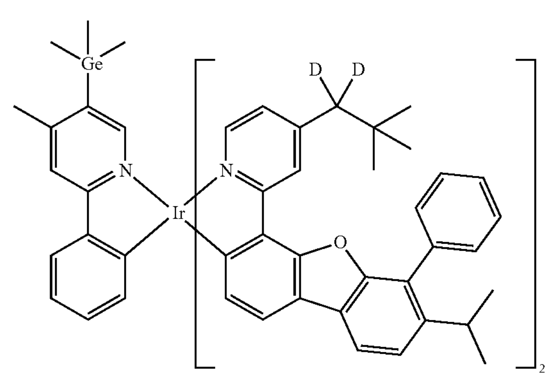

-continued
4540
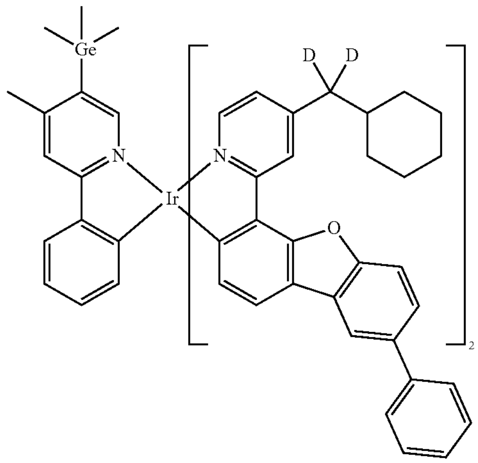
4541
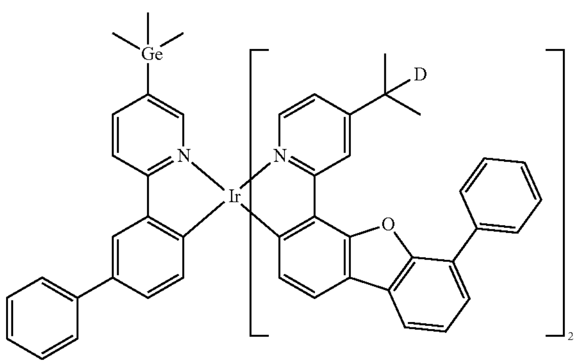
4542
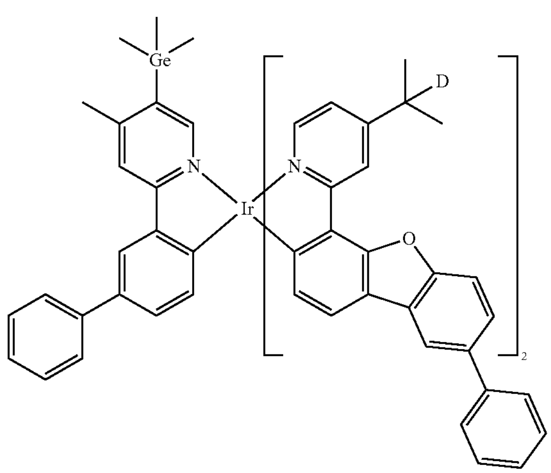
-continued
4543
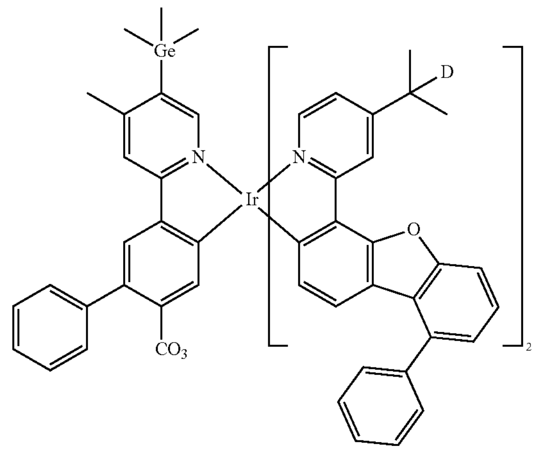
4544
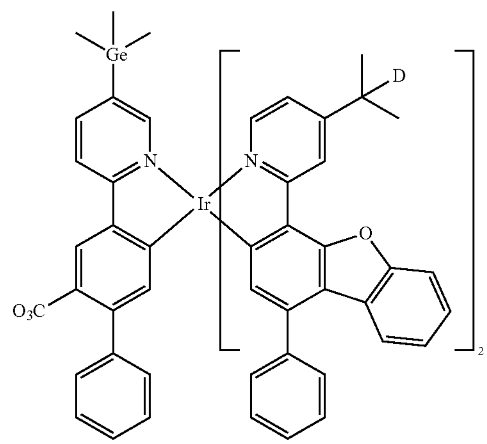
4545
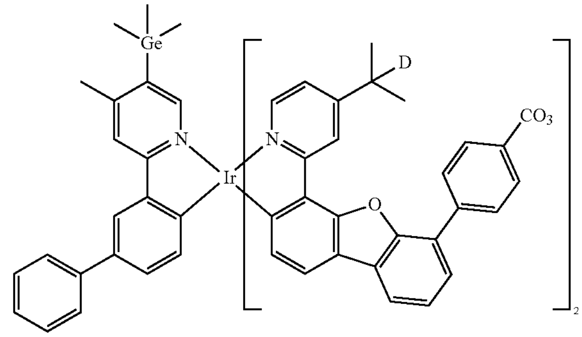
4546
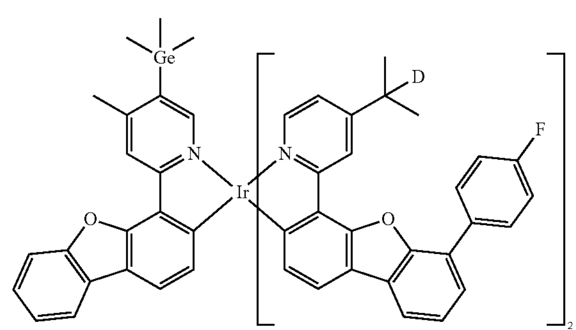

-continued
4547
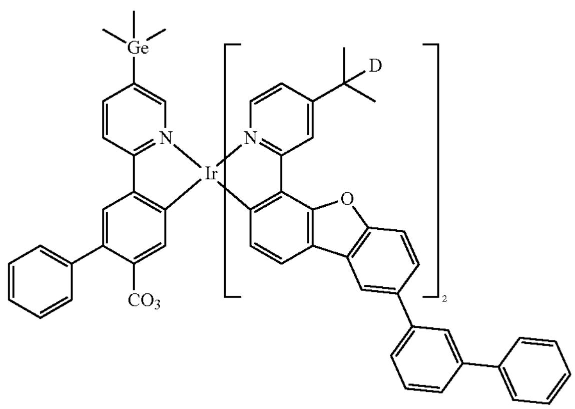
4548
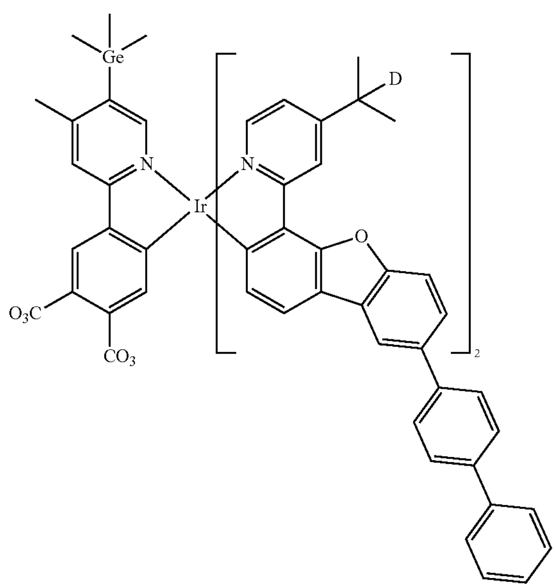
4549
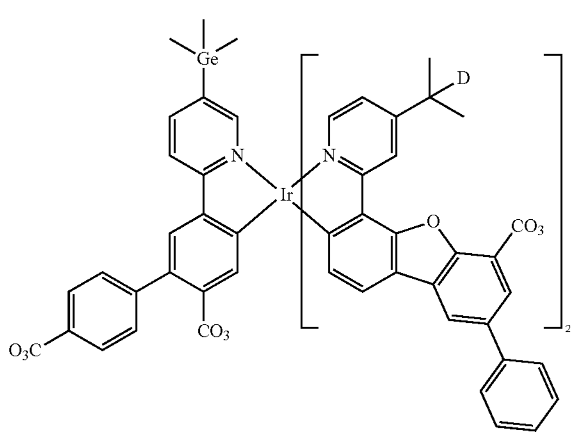
-continued
4550
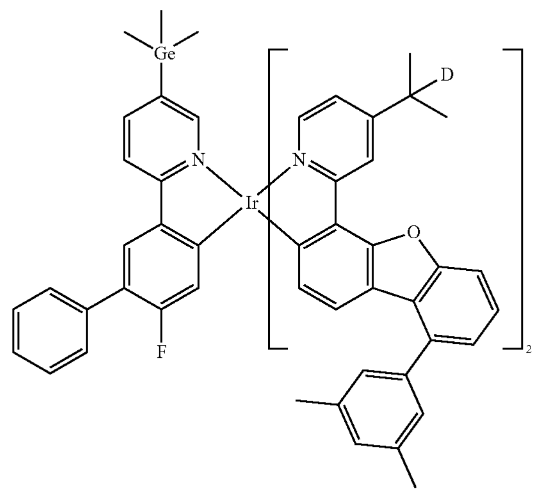
4551
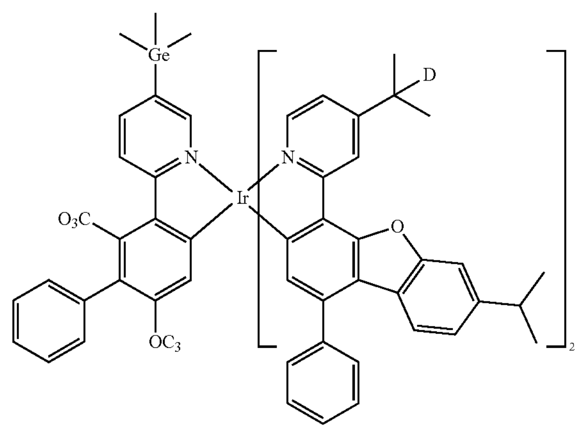
4552
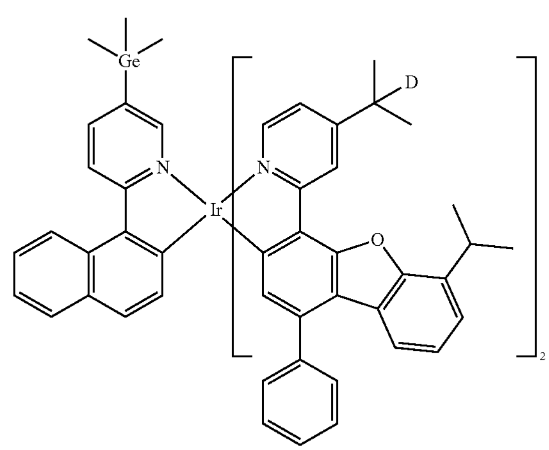

4553
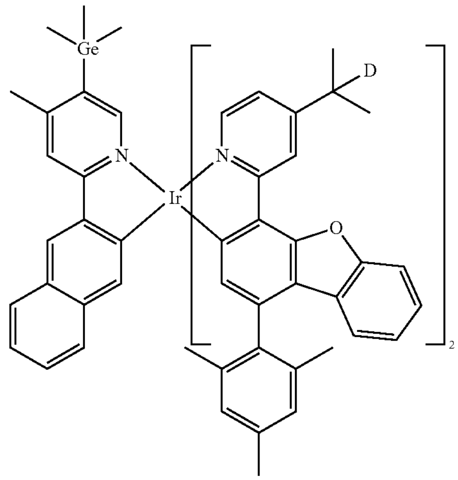
4554
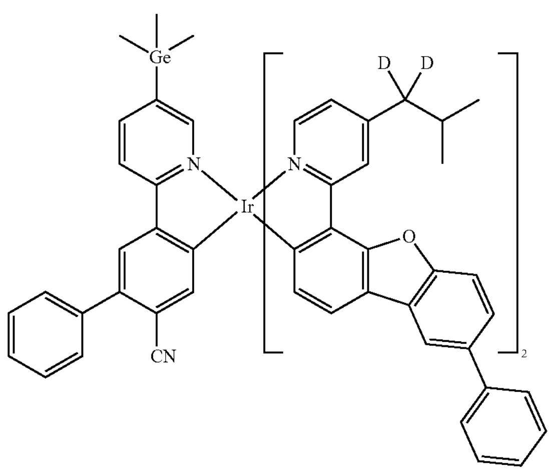
4555
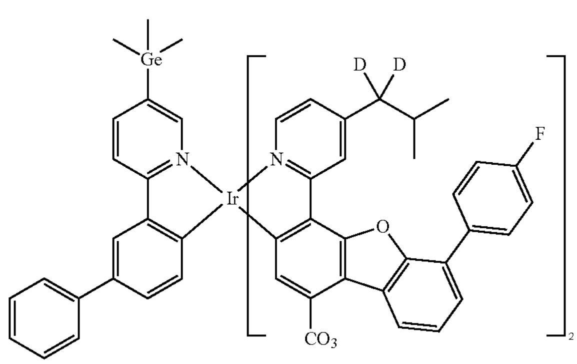
4556
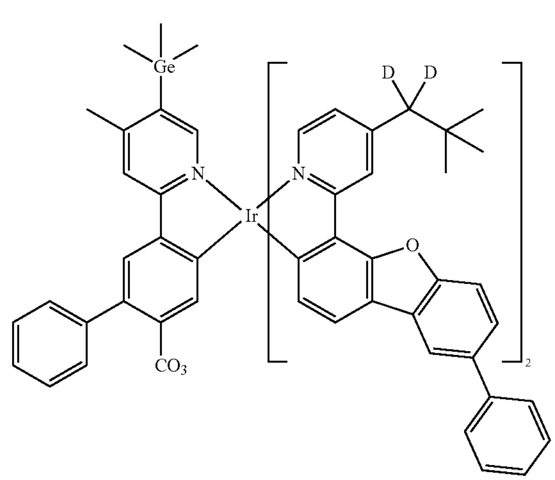
4557
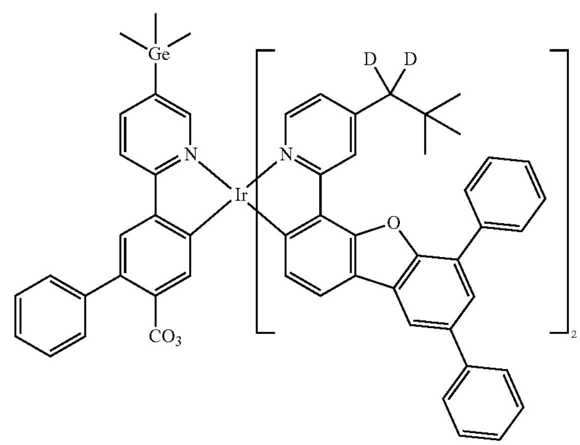
4558
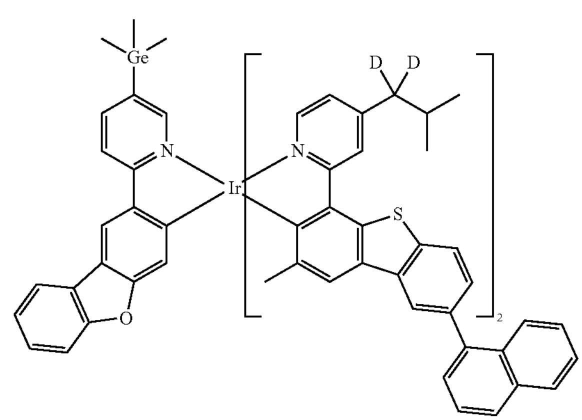

-continued
4559
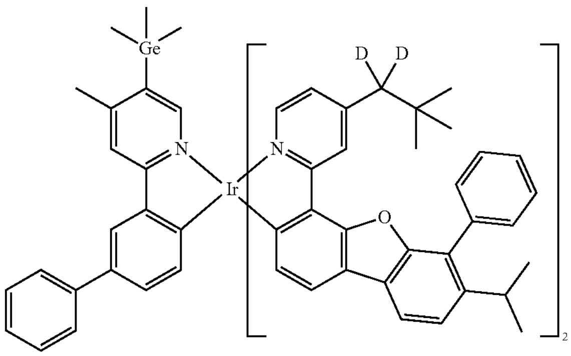
4560
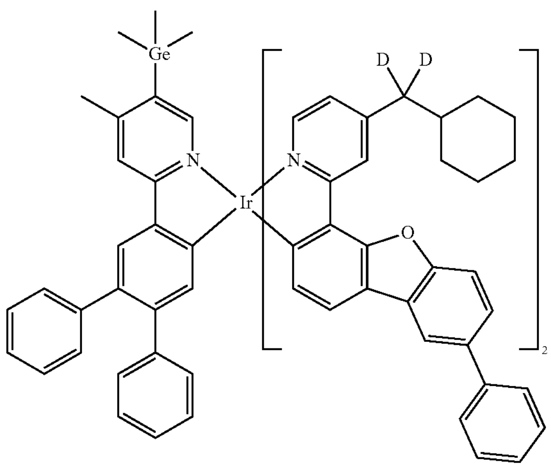
4561
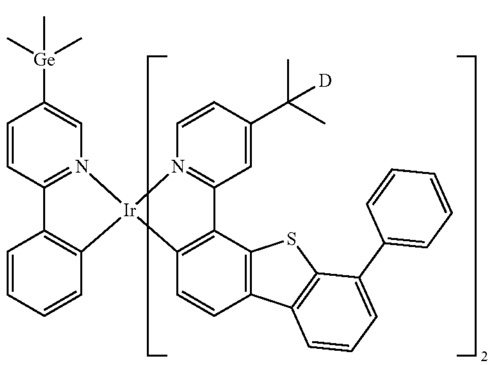
-continued
4562
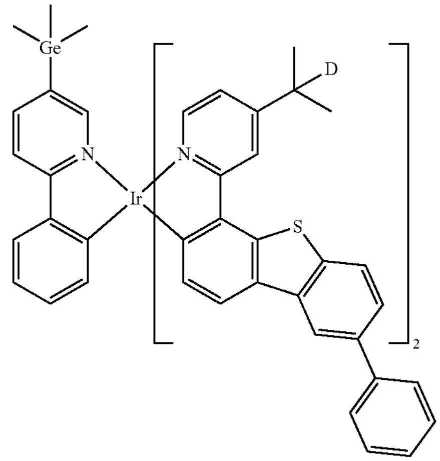
4563
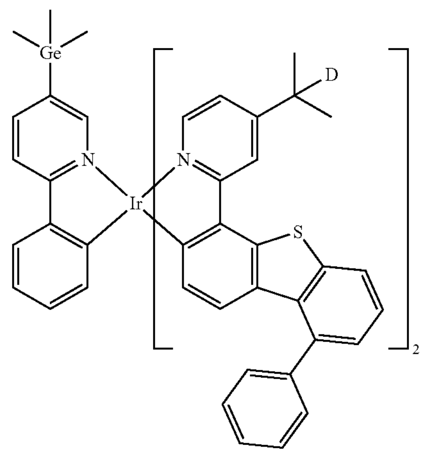
4564
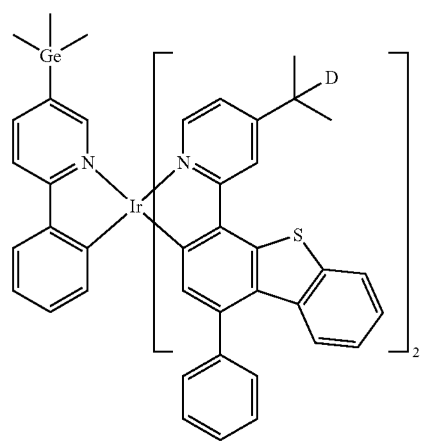

-continued
4565
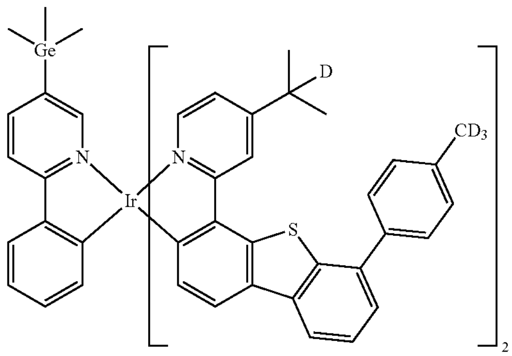
4566
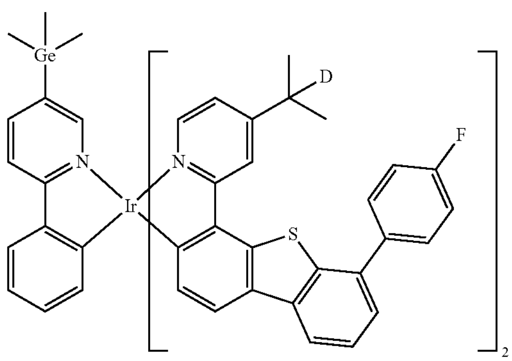
4567
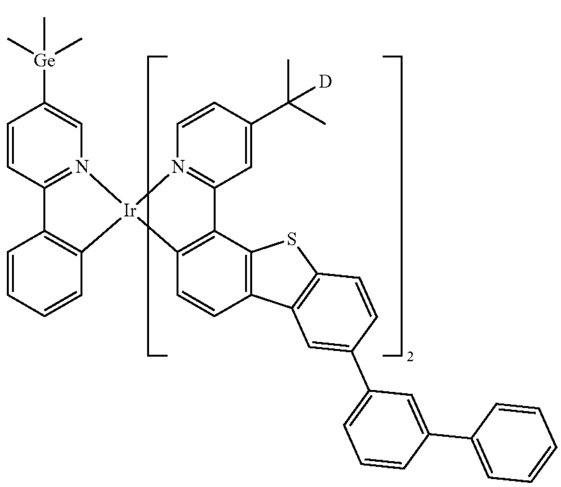
-continued
4568
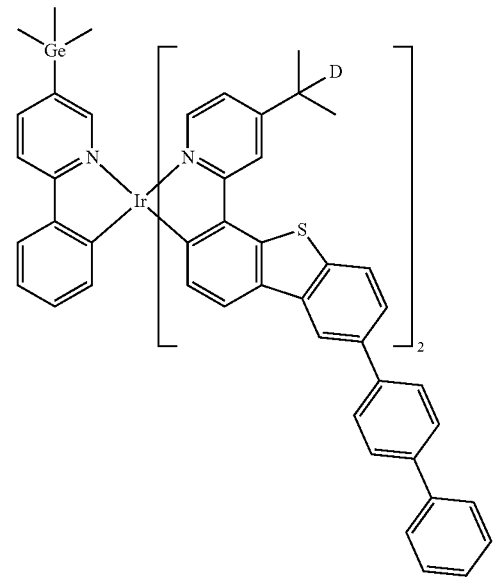
4569
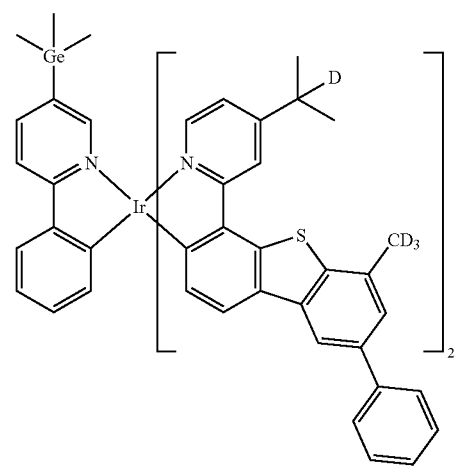
4570
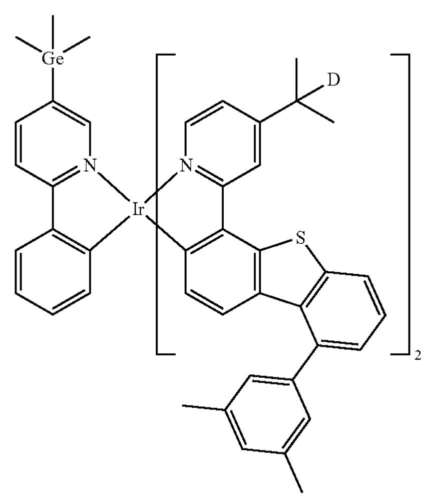

-continued
4571
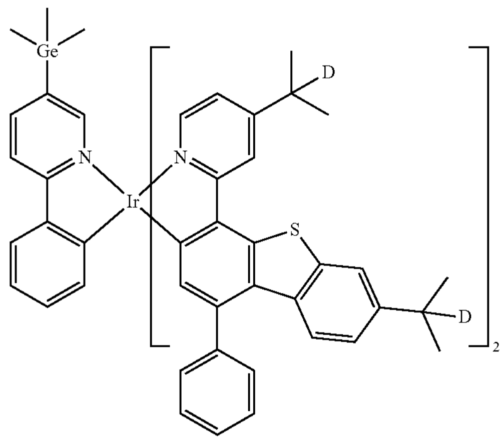
4572
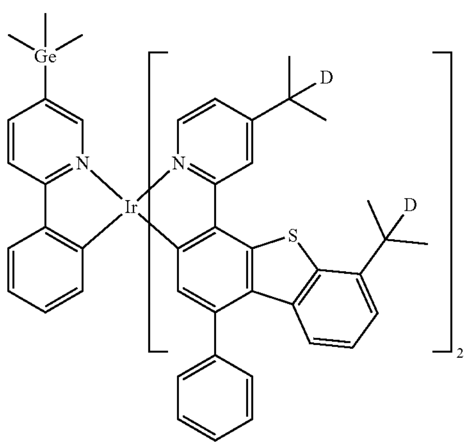
4573
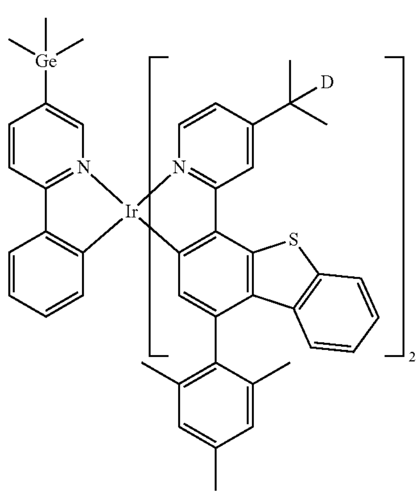
-continued
4574
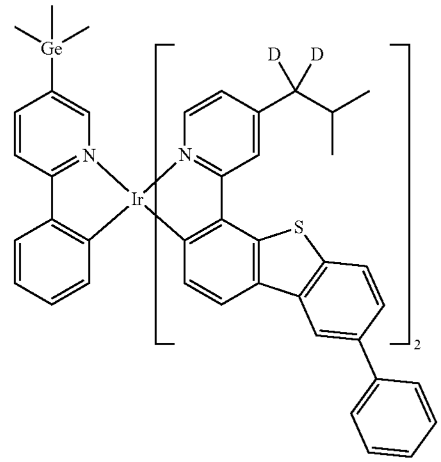
4575
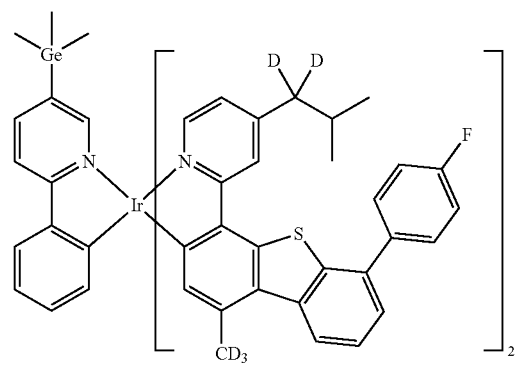
4576
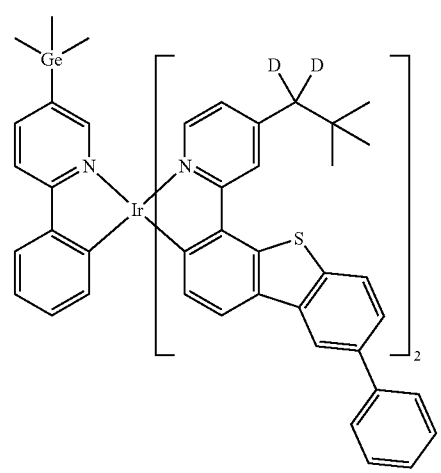

4577
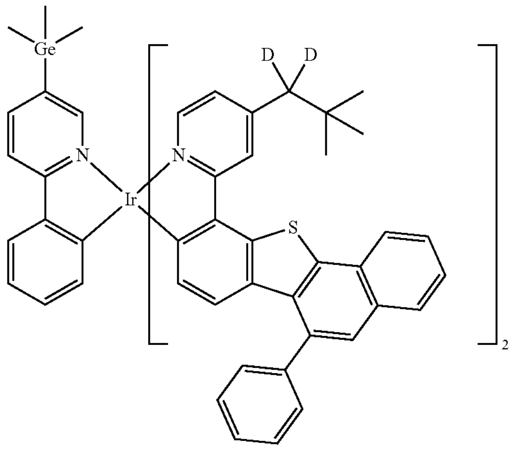
4578
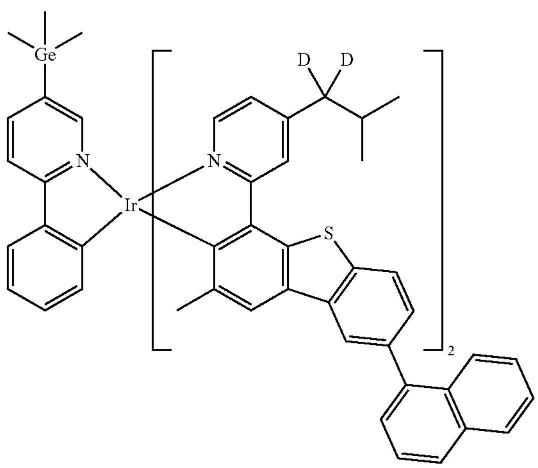
4579
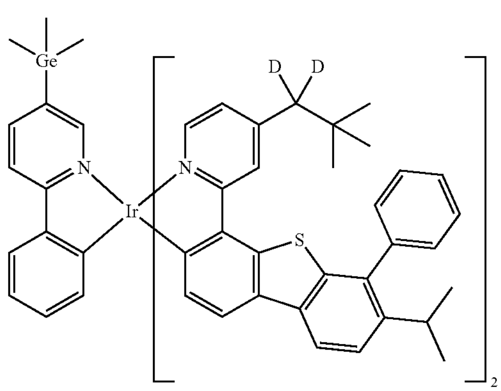
4580
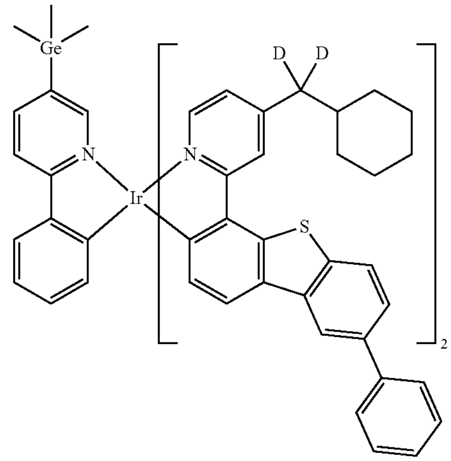
4581
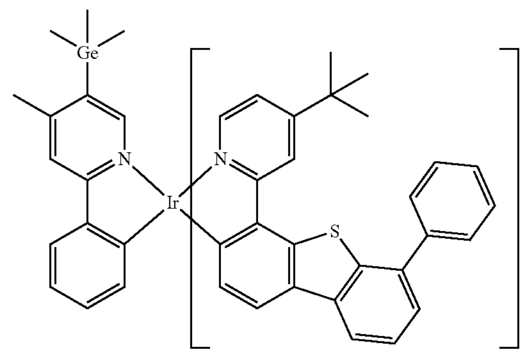
4582
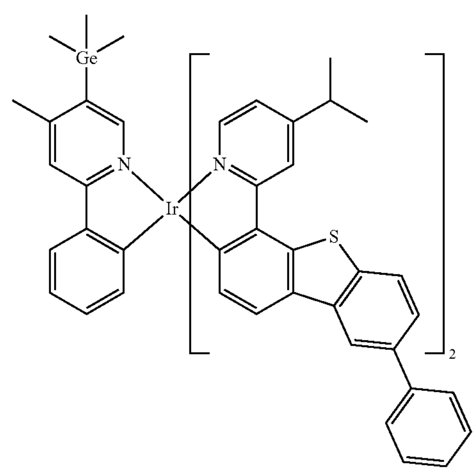

-continued
4583
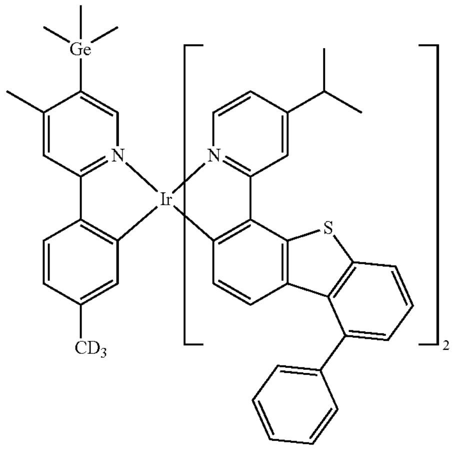
4584
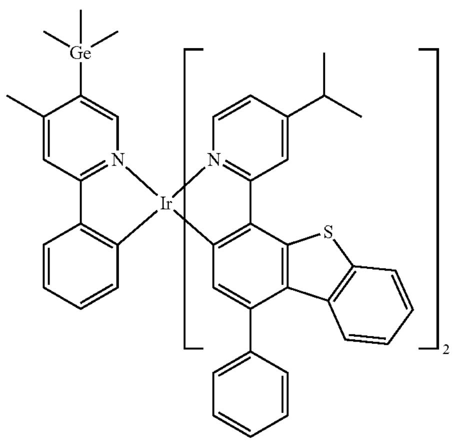
4585
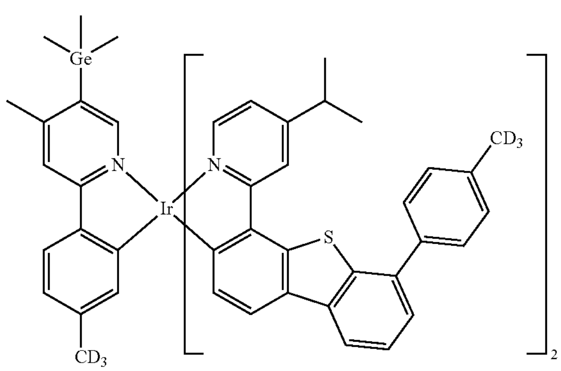
4586
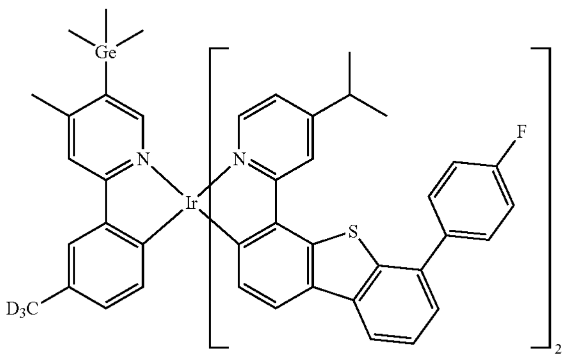
-continued
4587
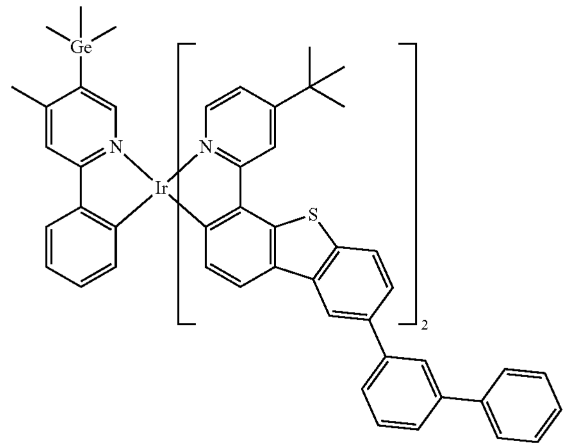
4588
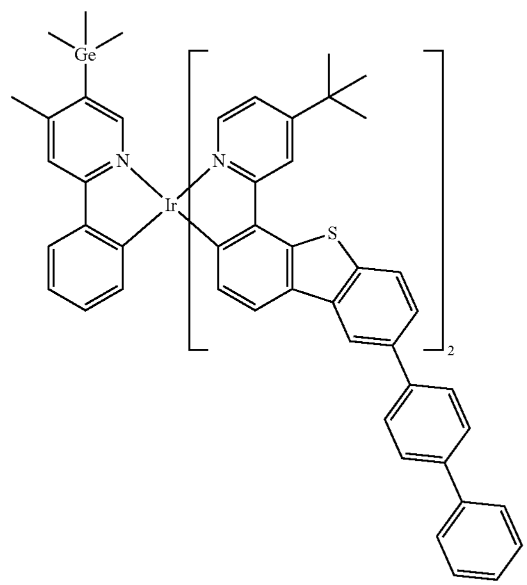
4589
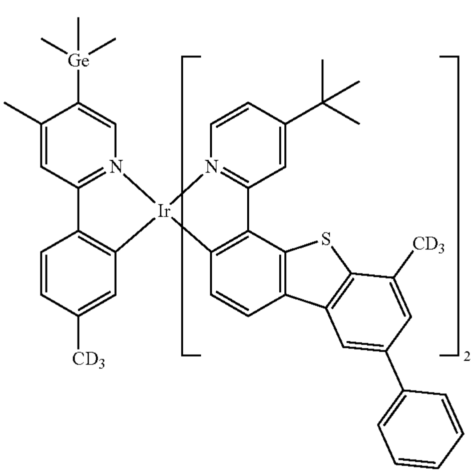

-continued
4590
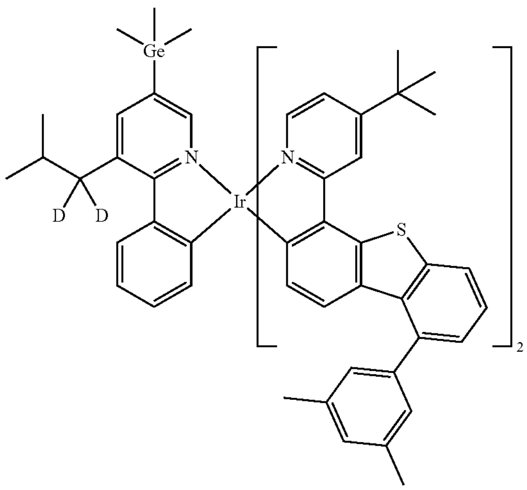
4591
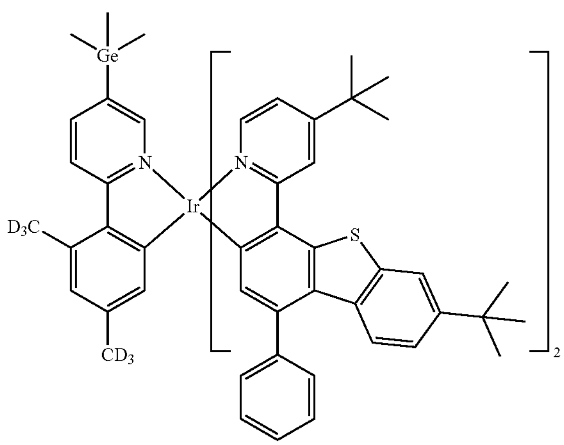
4592
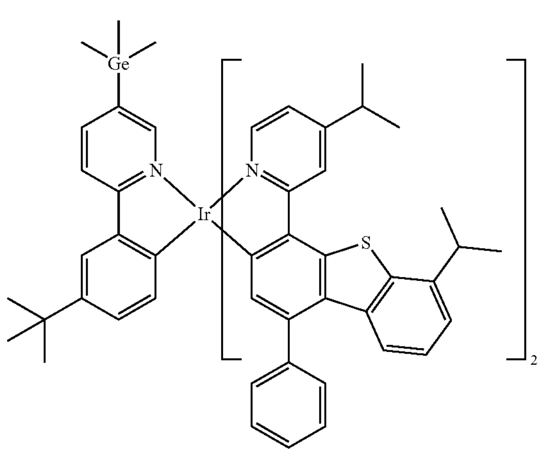
-continued
4593
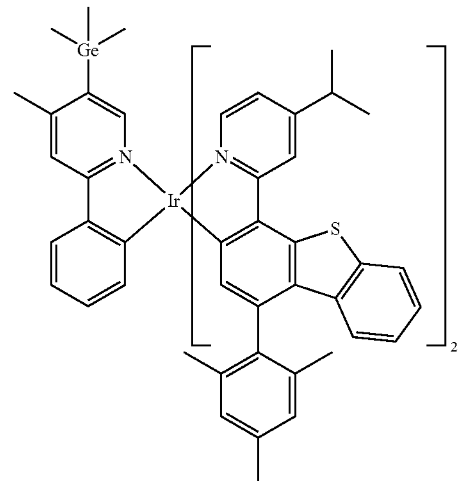
4594
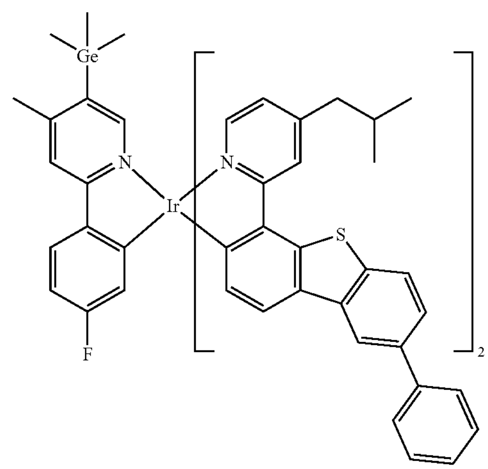
4595
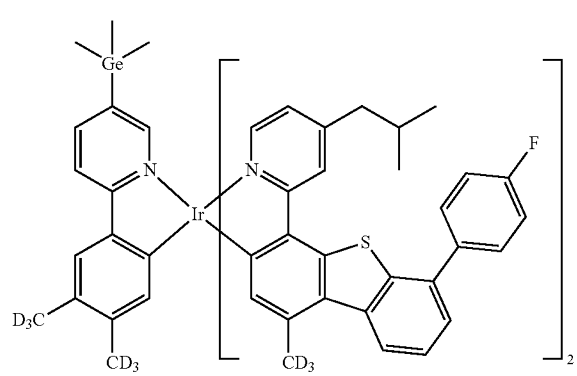

-continued
4596
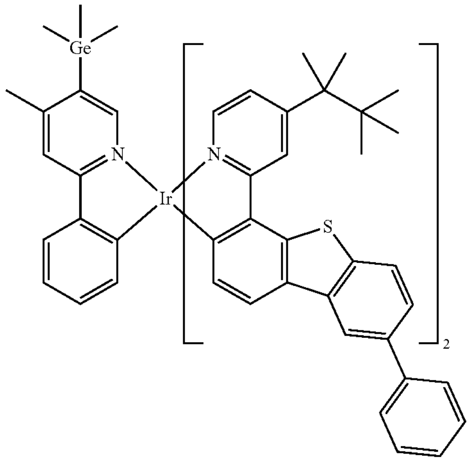
4597
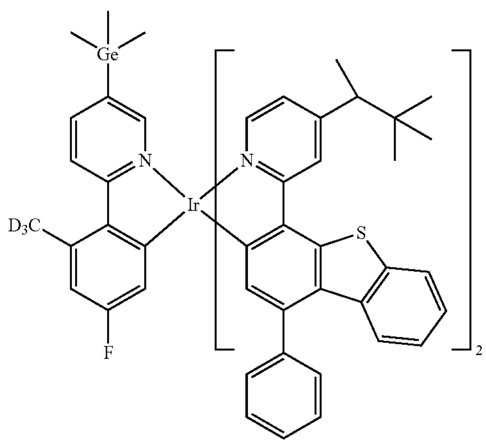
4598
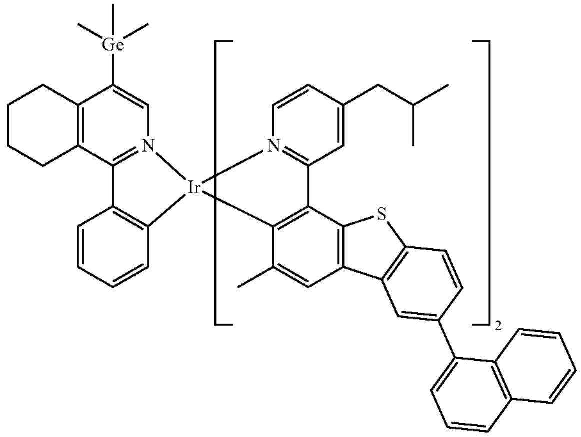
-continued
4599
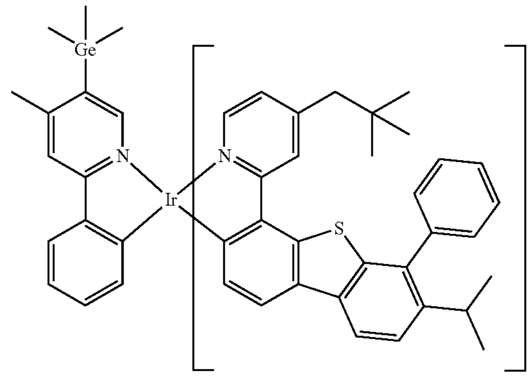
4600
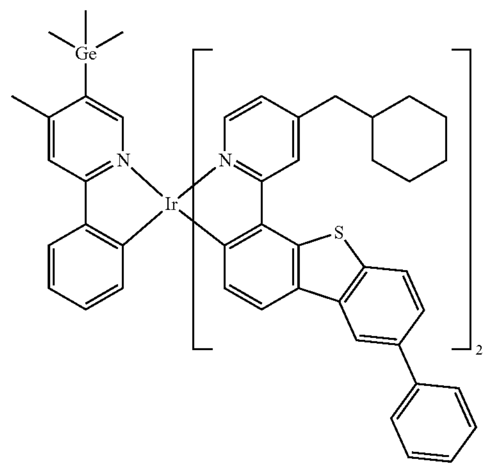
4601
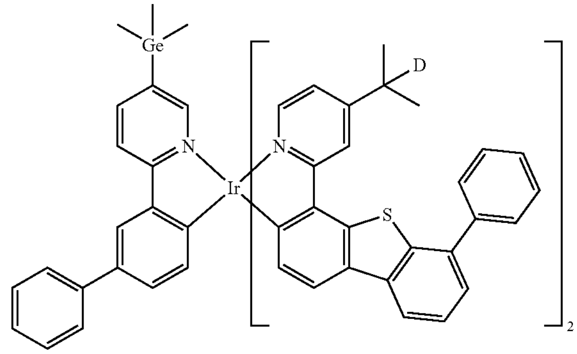

-continued
4602
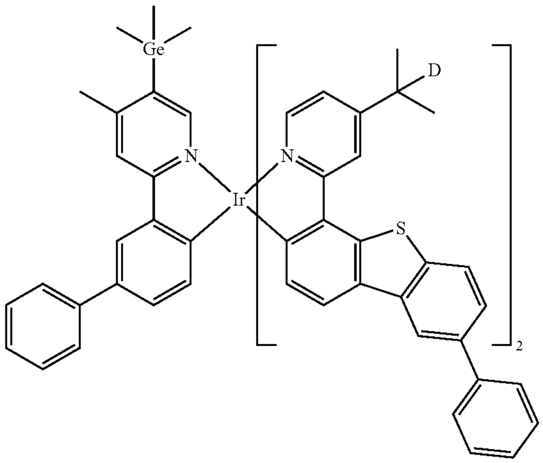
4603
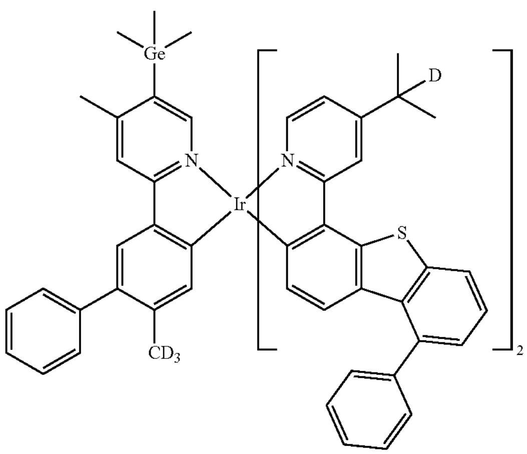
4604
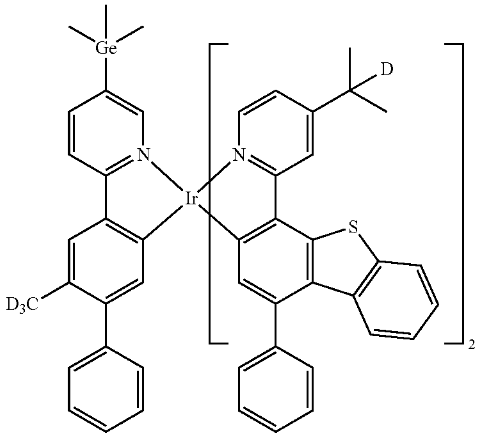
-continued
4605
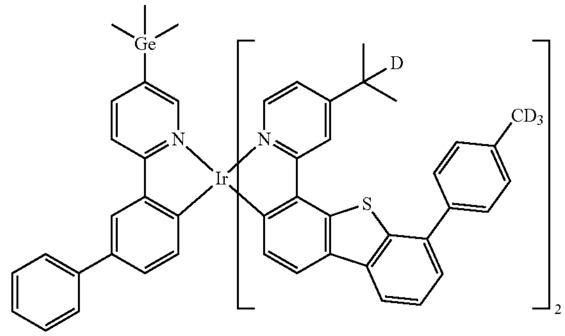
4606
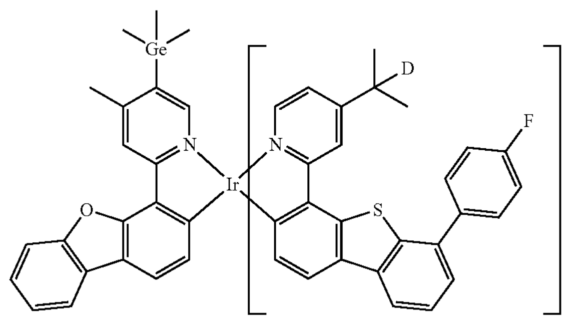
4607
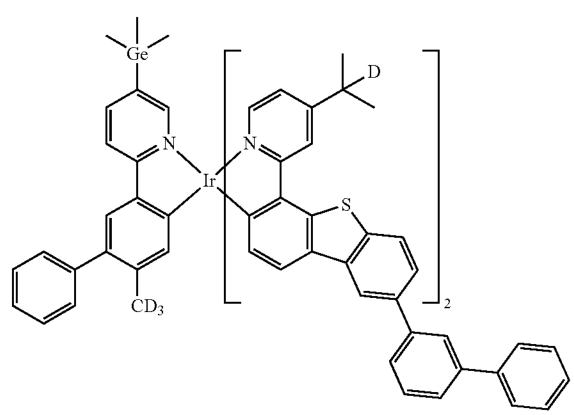

-continued
4608
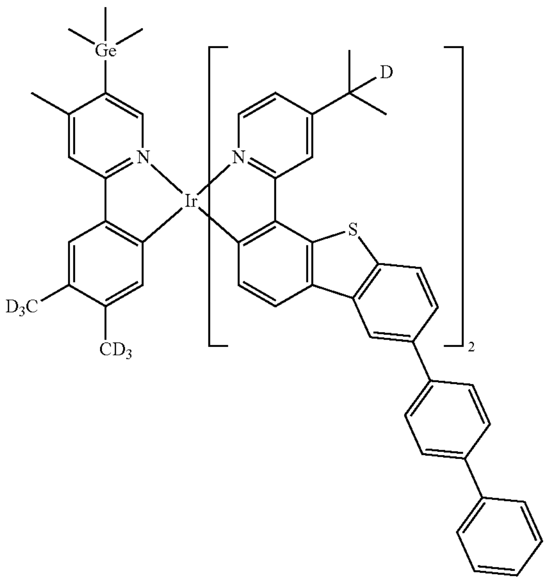
4609
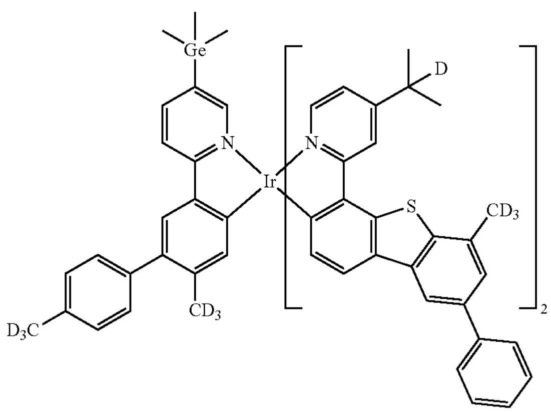
4610
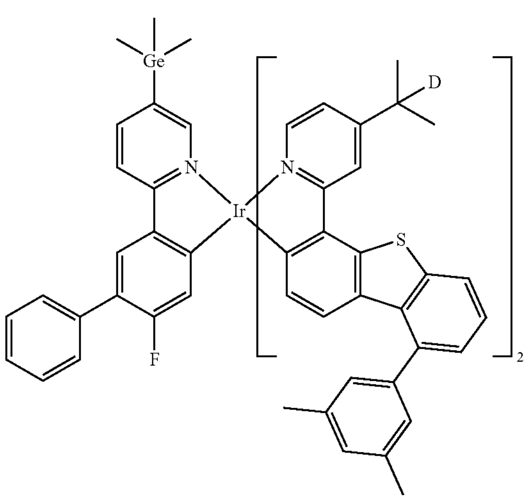
-continued
4611
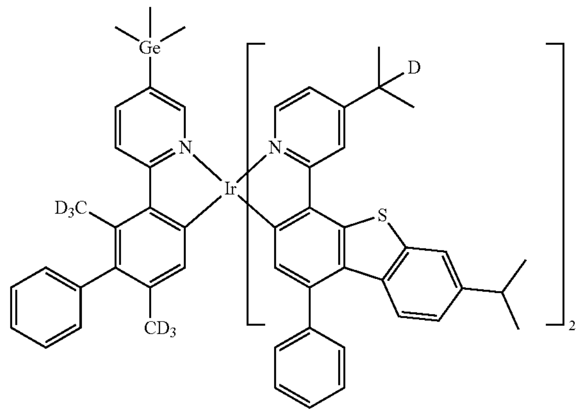
4612
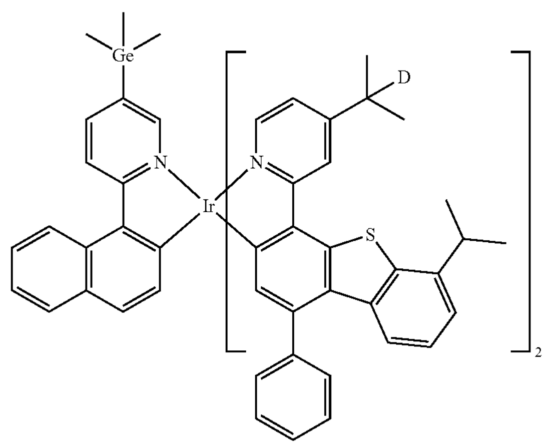
4613
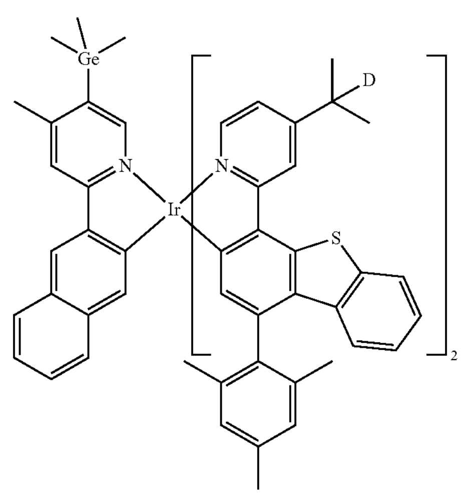

-continued
4614
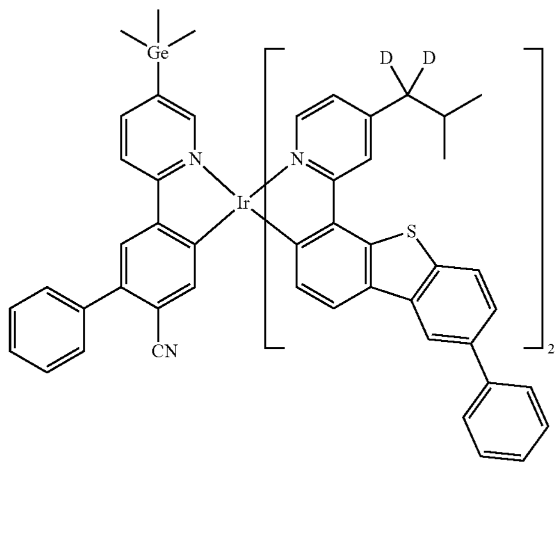
4615
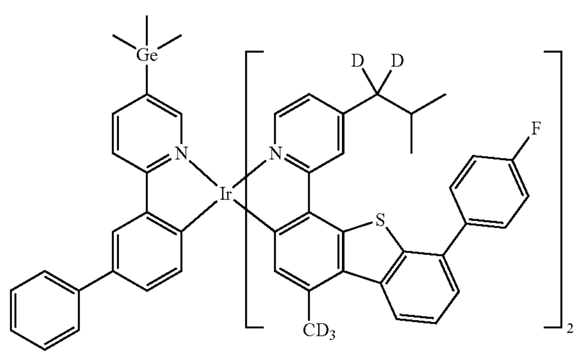
4616
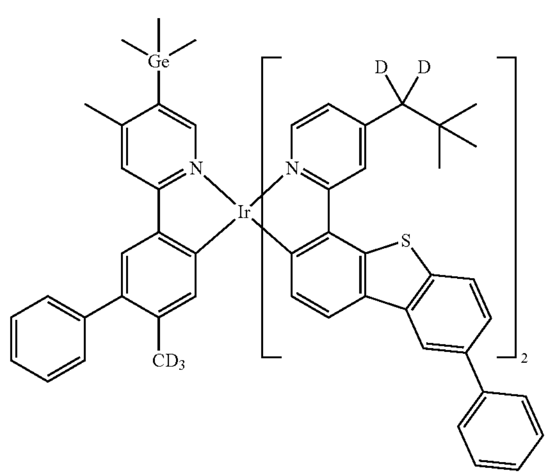
-continued
4617
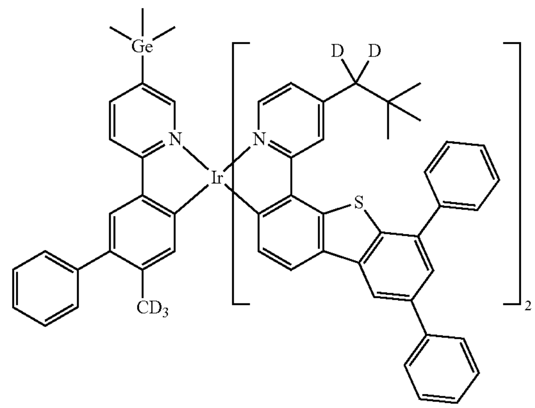
4618
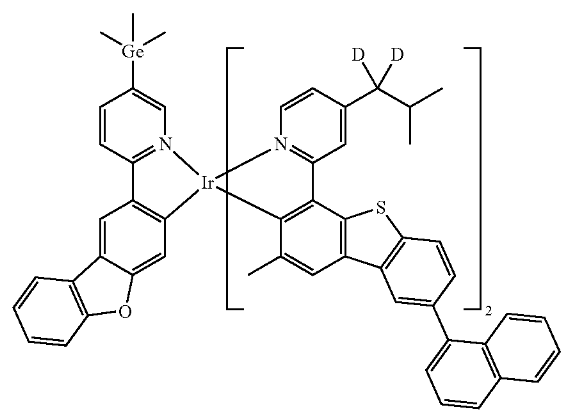
4619
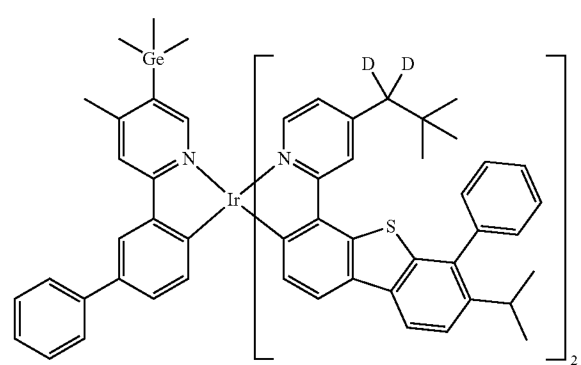

-continued
4620
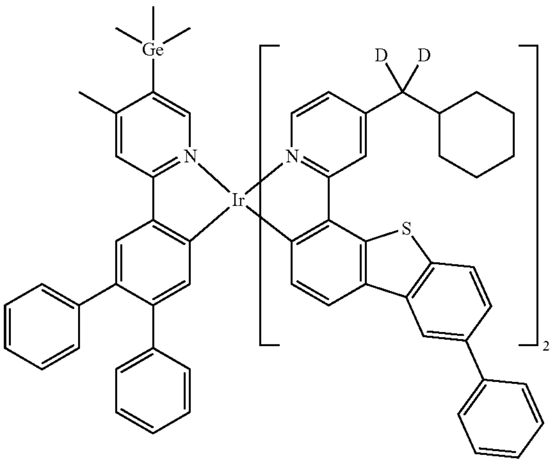
4621
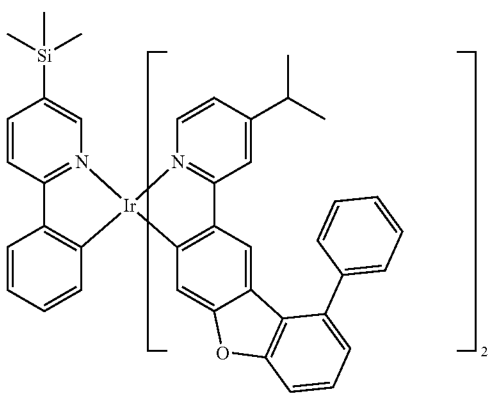
4622
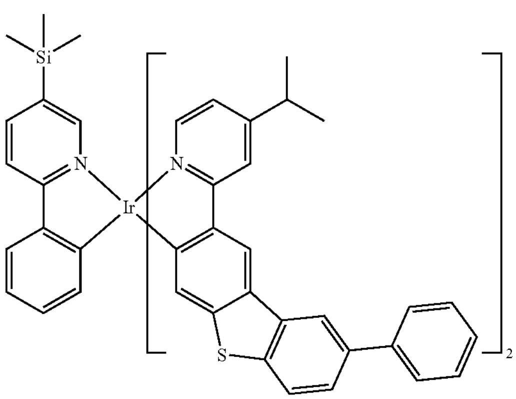
-continued
4623
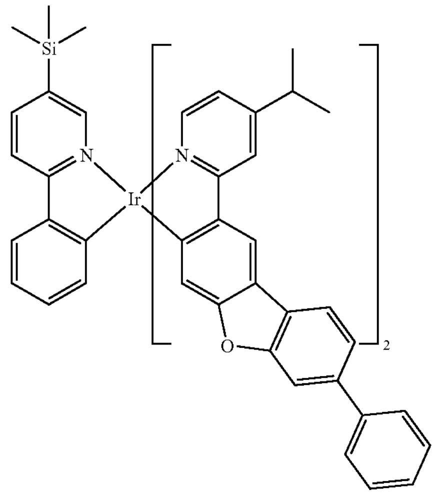
4624
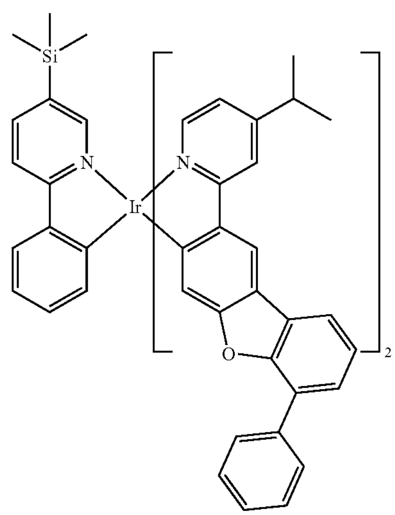
4625
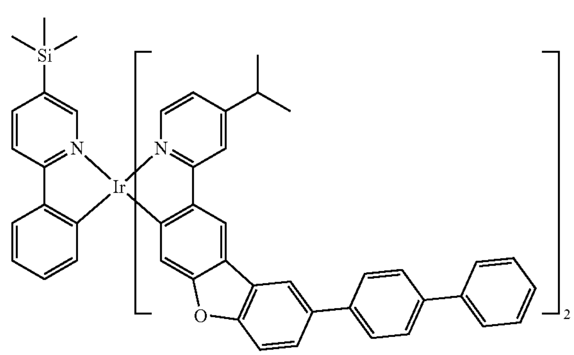

-continued
4626
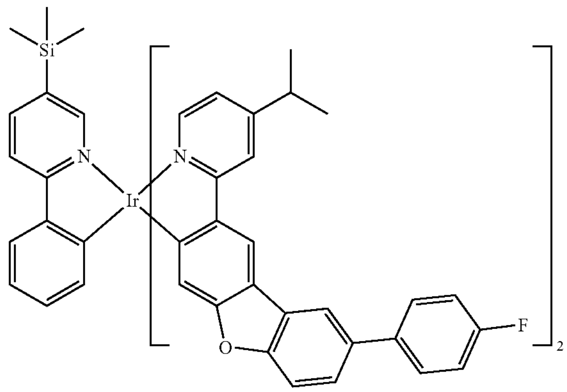
4627
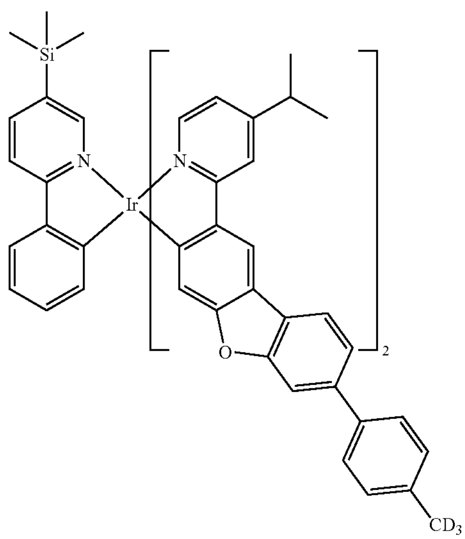
4628
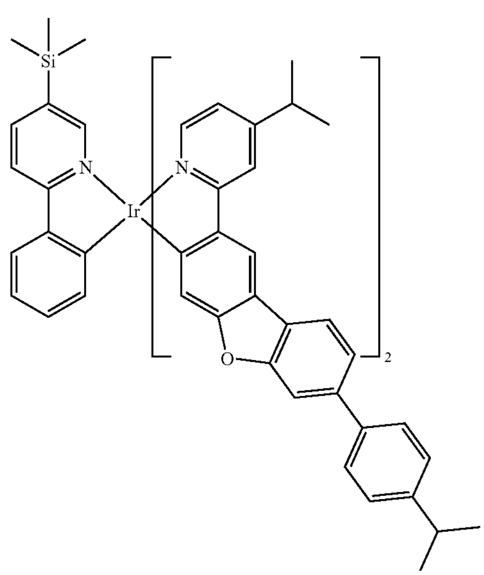
-continued
4629
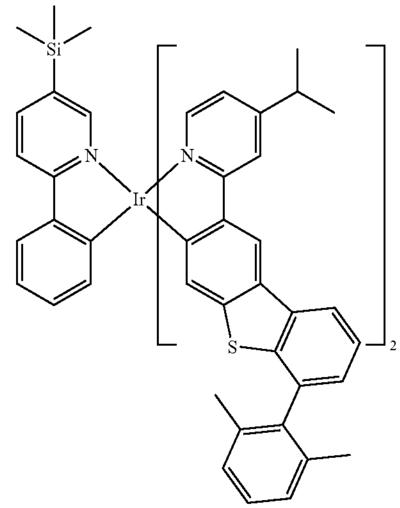
4630
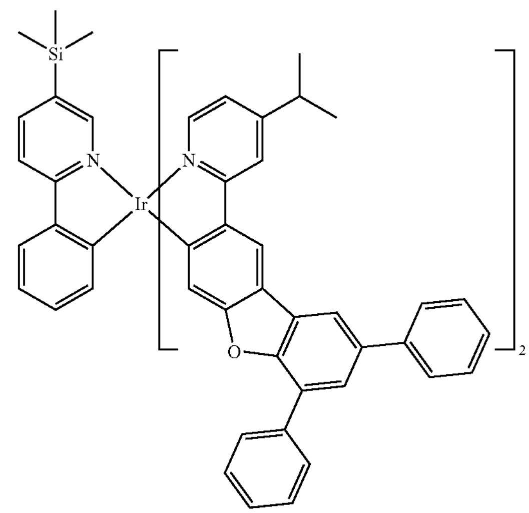
4631
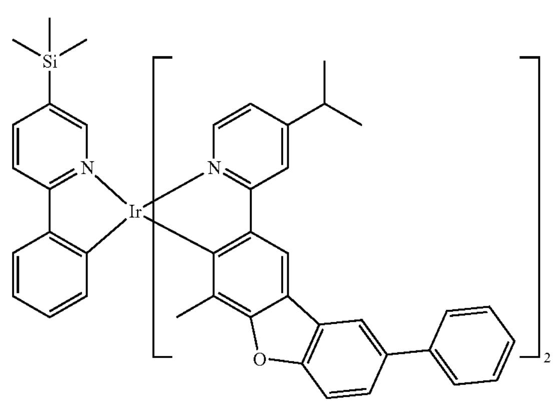

-continued
4632
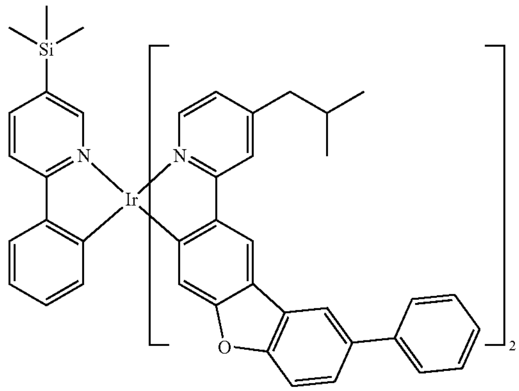
4633
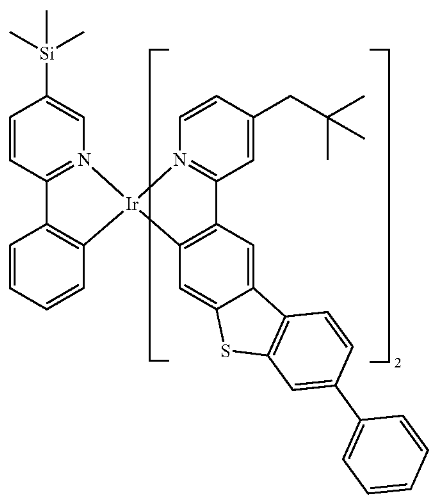
4634
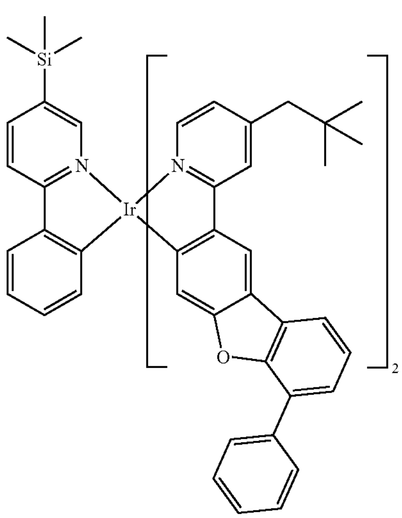
-continued
4635
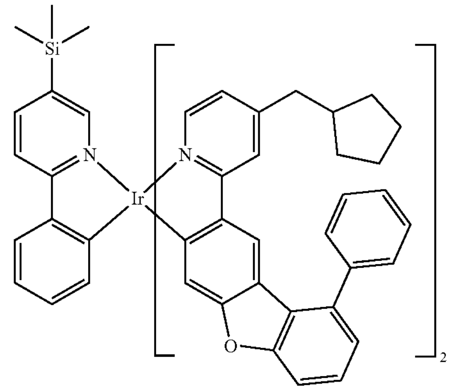
4636
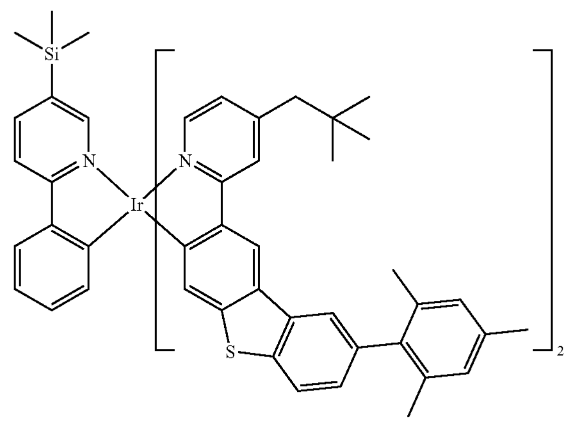
4637
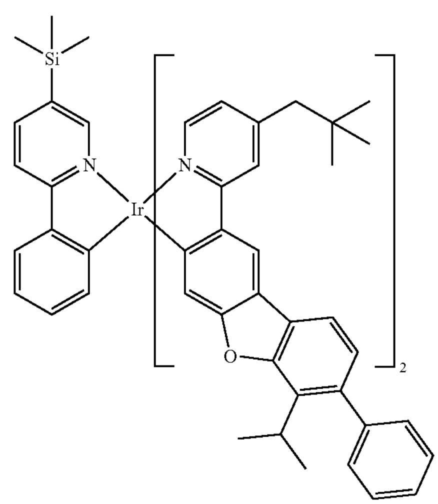

4638
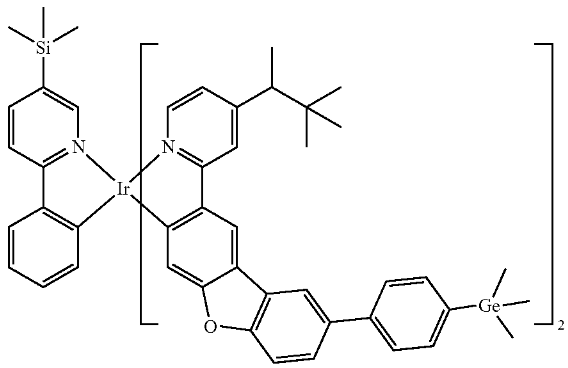
4639
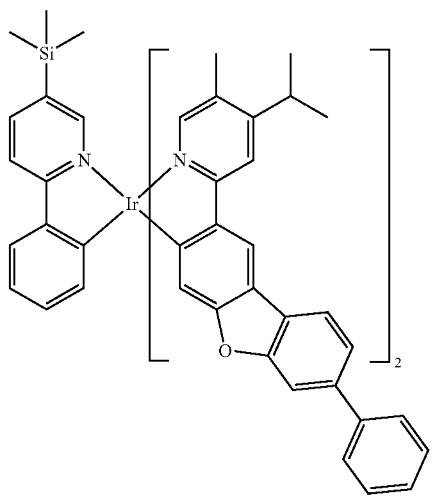
4640
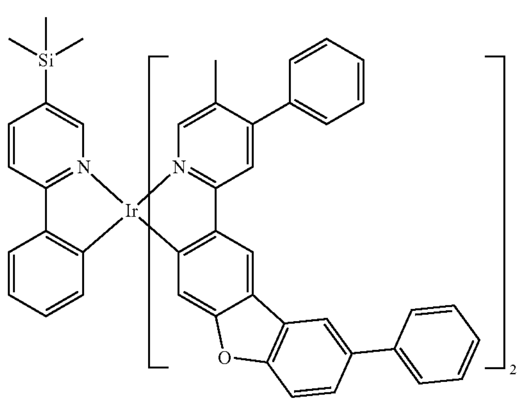
4641
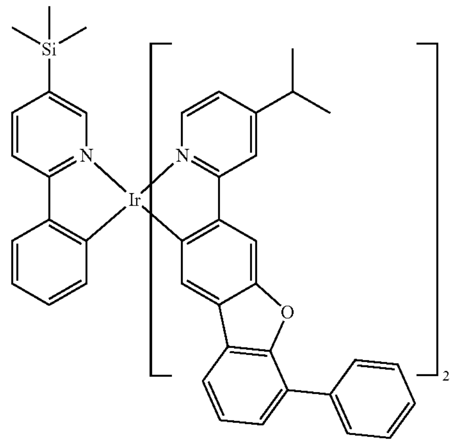
4642
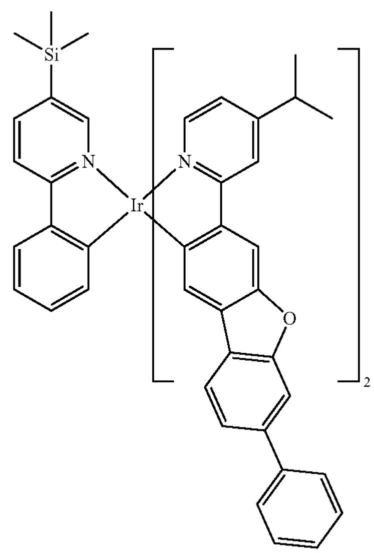
4643
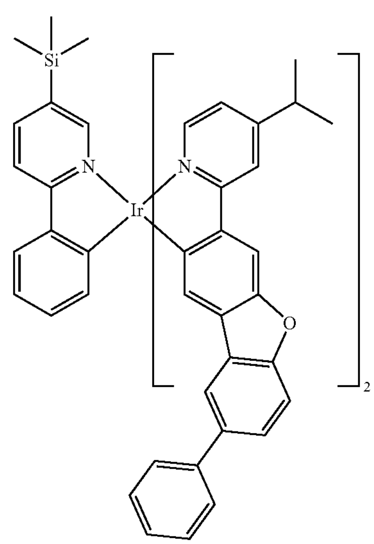

4644
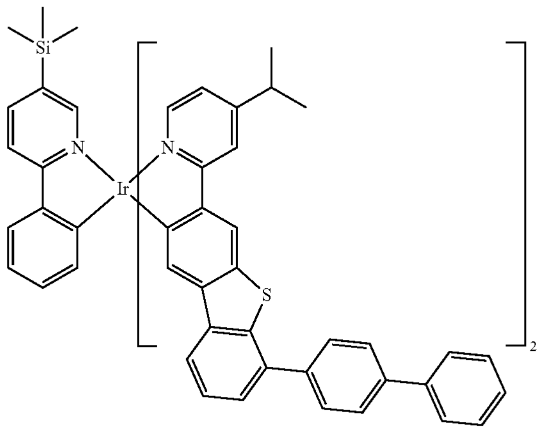
4645
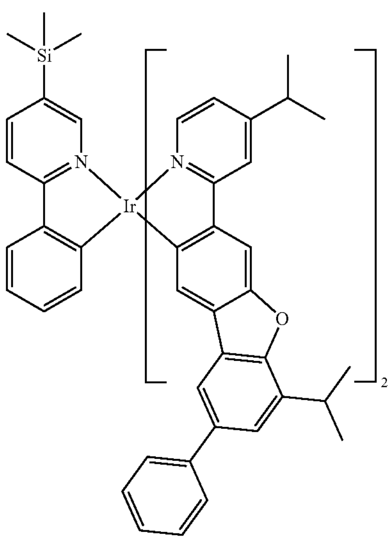
4646
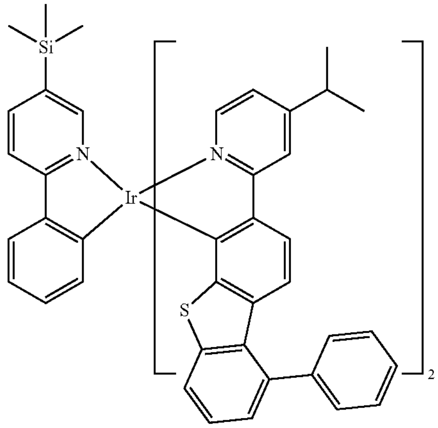
4647
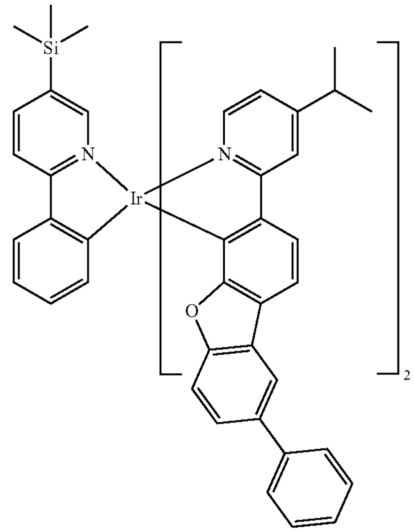
4648
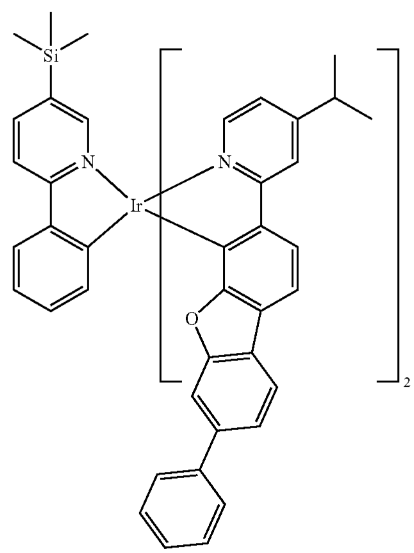
4649
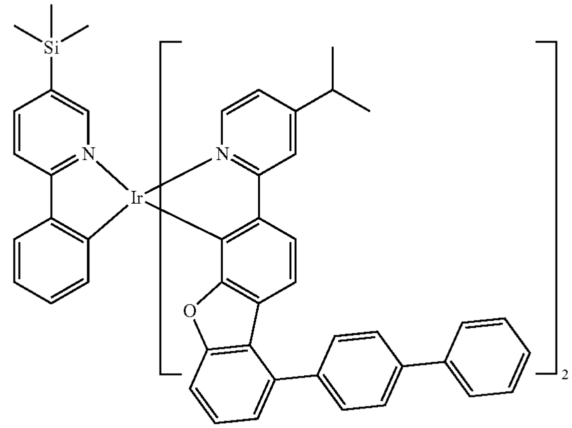

-continued
4650
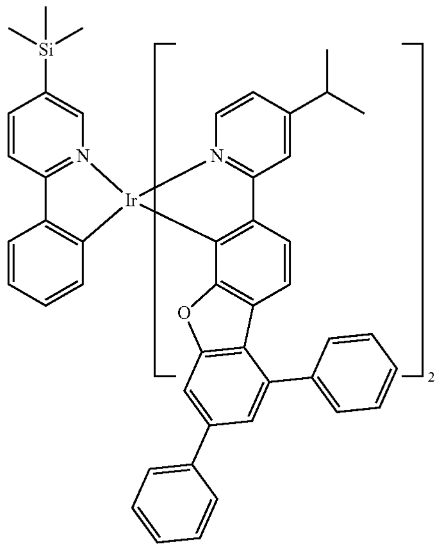
4651
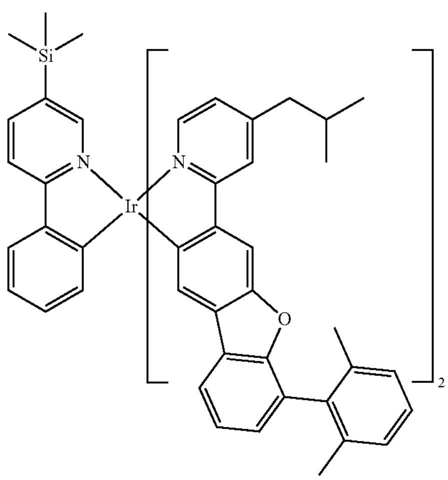
4652
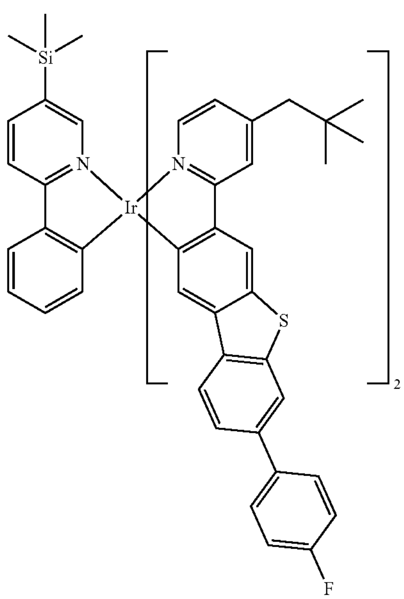
4653
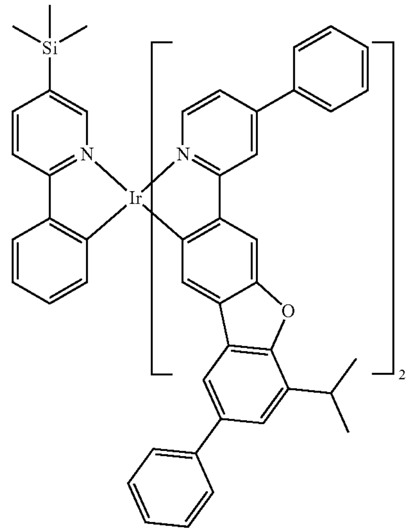
4654
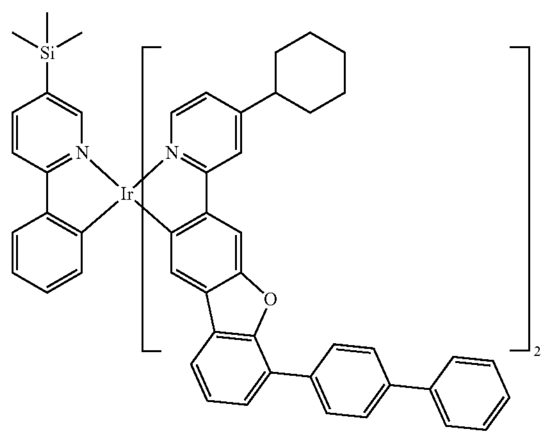
4655
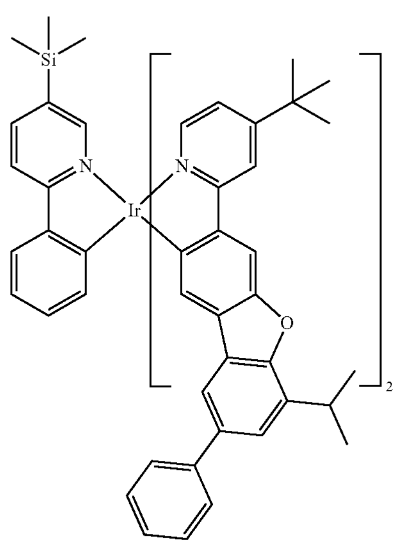

4656
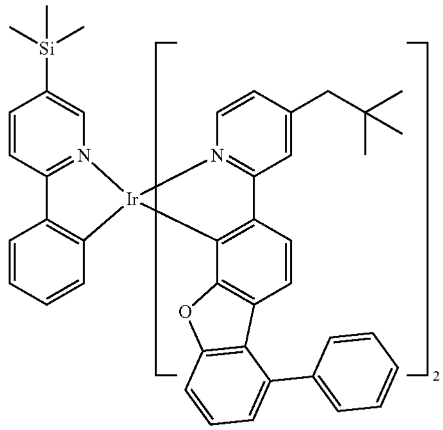
4657
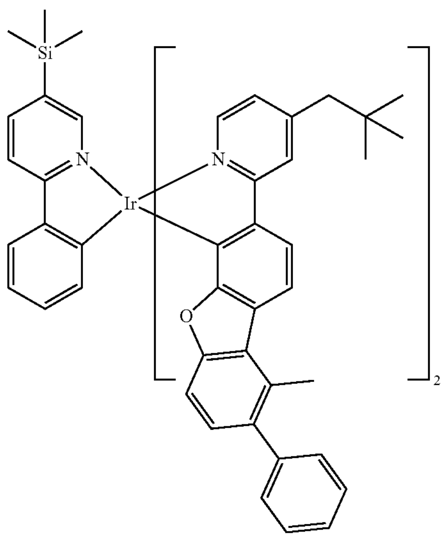
4658
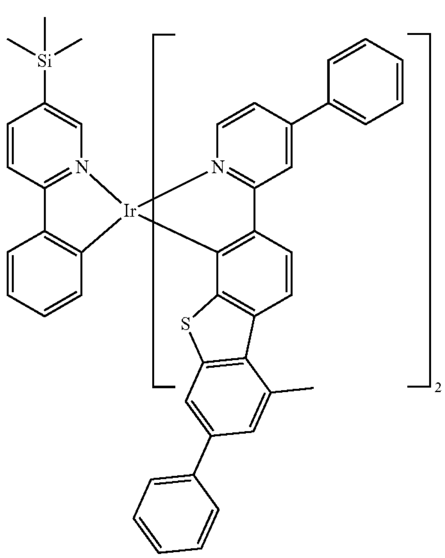
4659
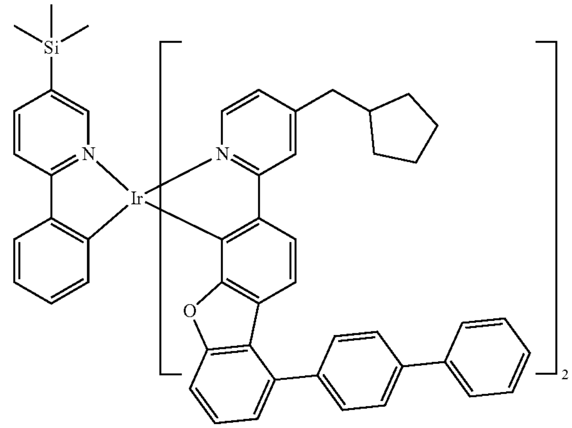
4660
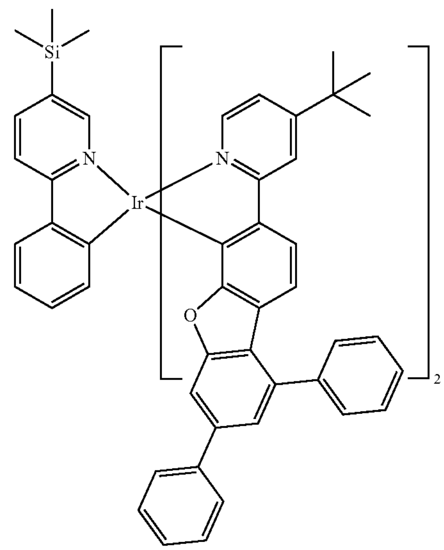
4661
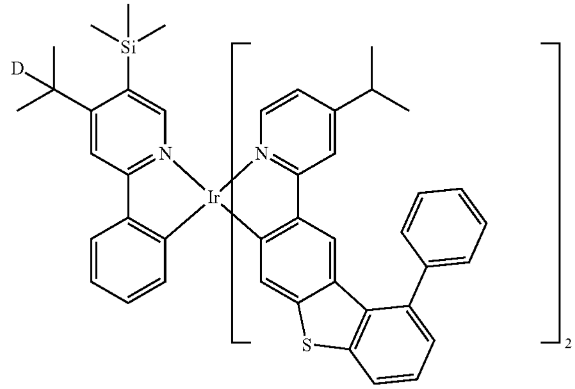

-continued
4662
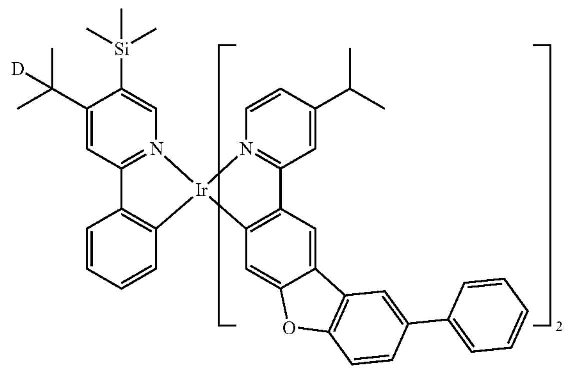
4663
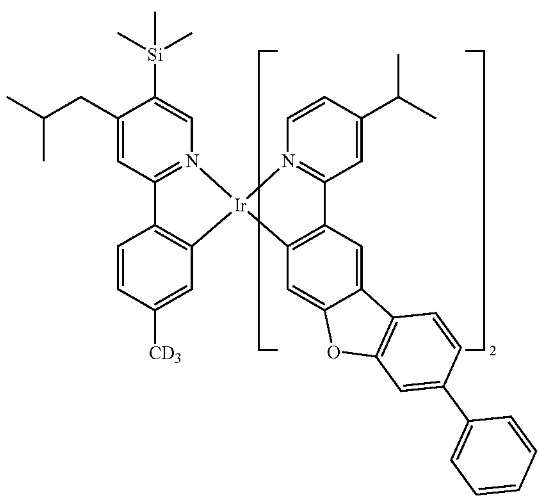
4664
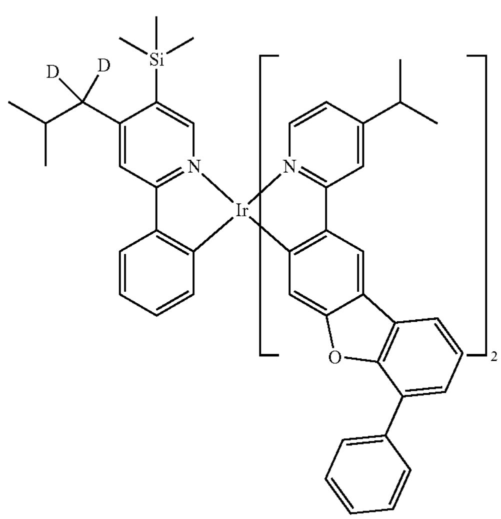
-continued
4665
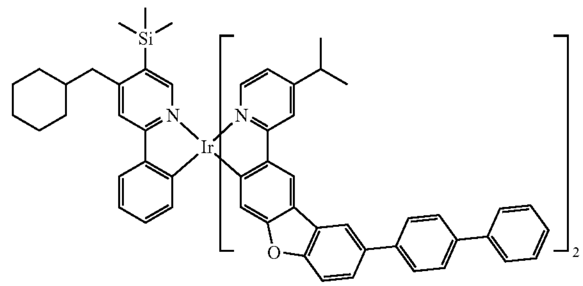
4666
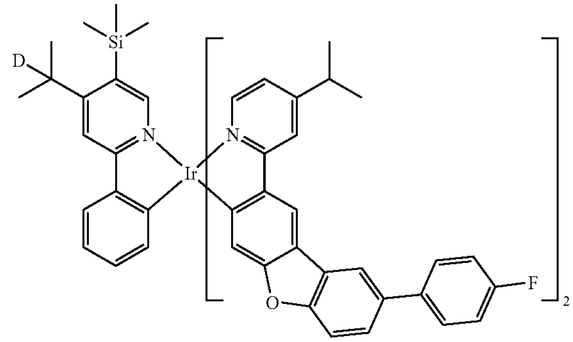
4667
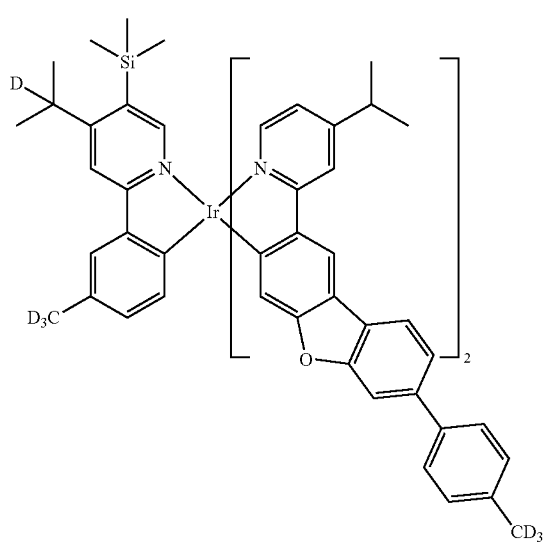

-continued
4668
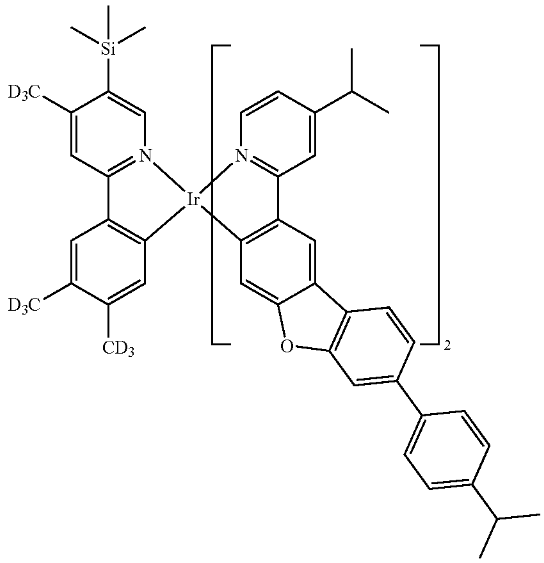
4669
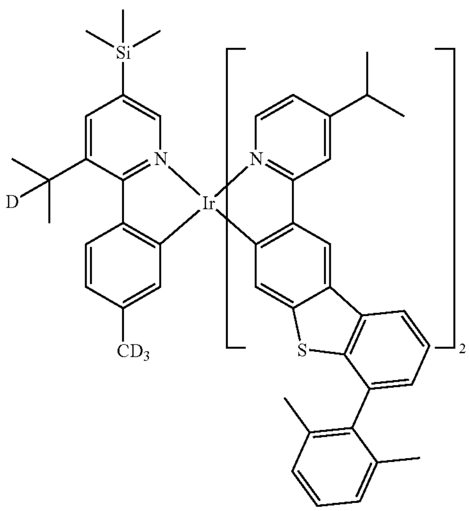
4670
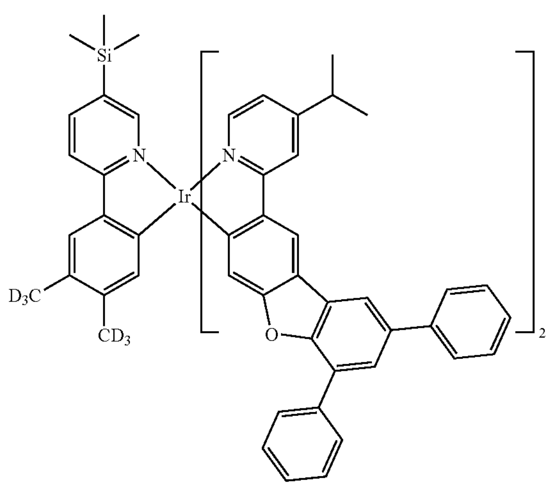
-continued
4671
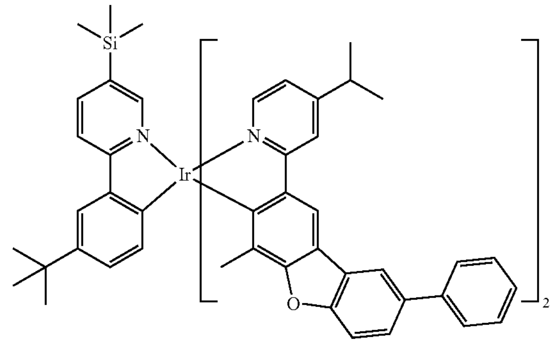
4672
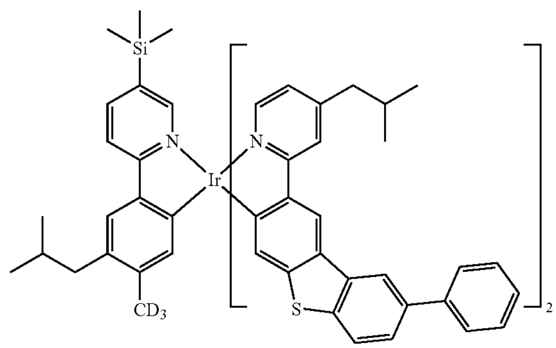
4673
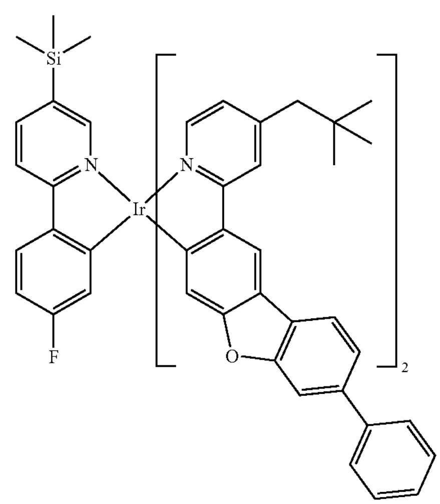

-continued
4674
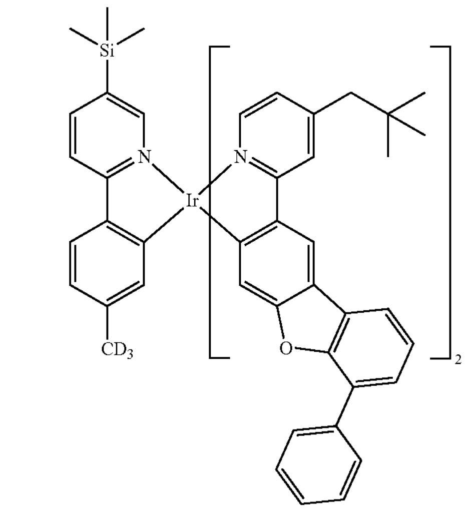
4675
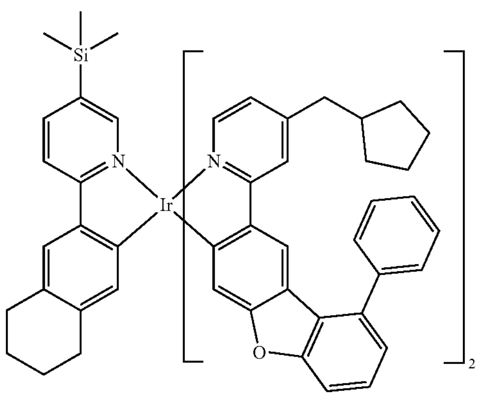
4676
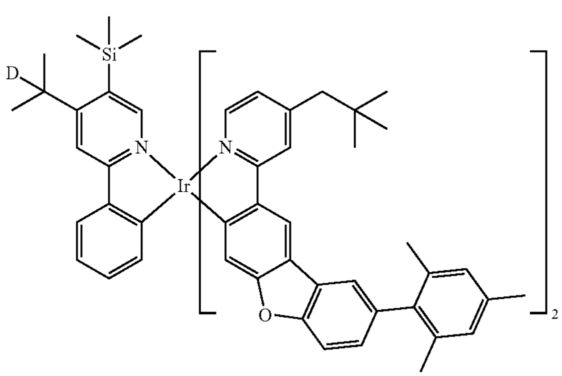
-continued
4677
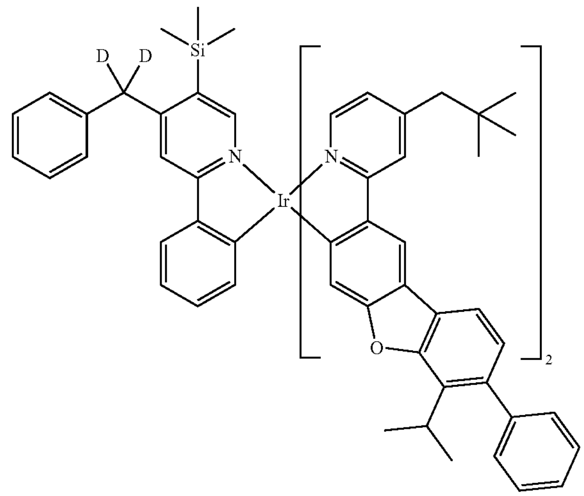
4678
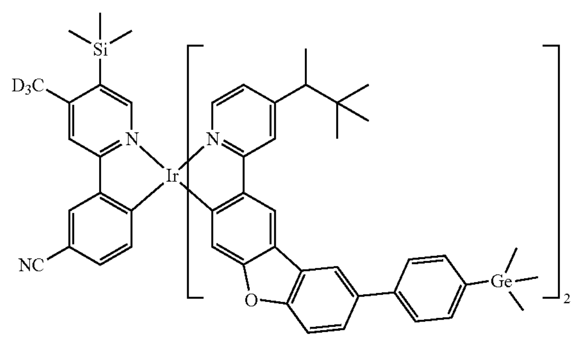
4679
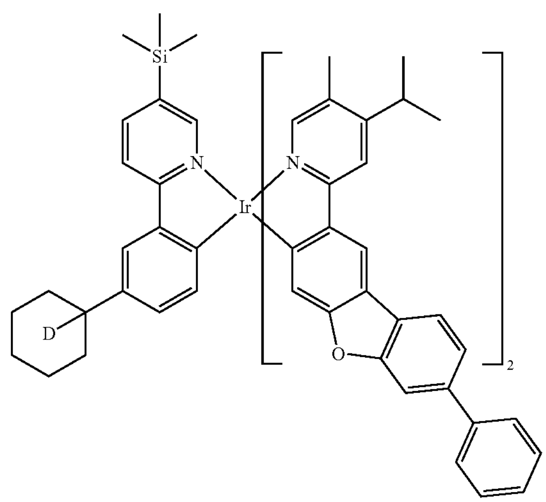

-continued
4680
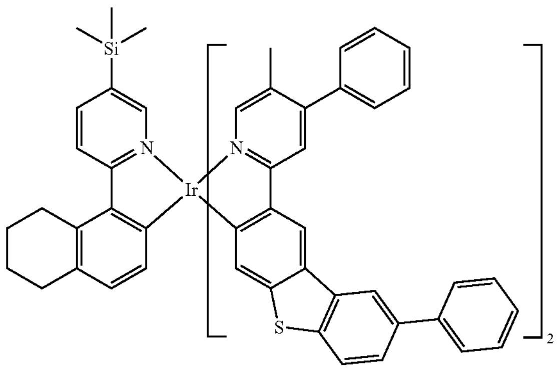
4681
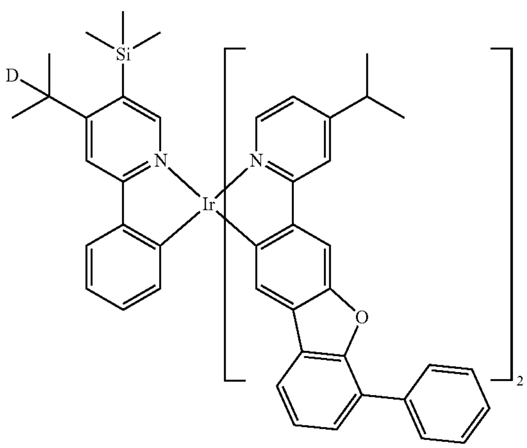
4682
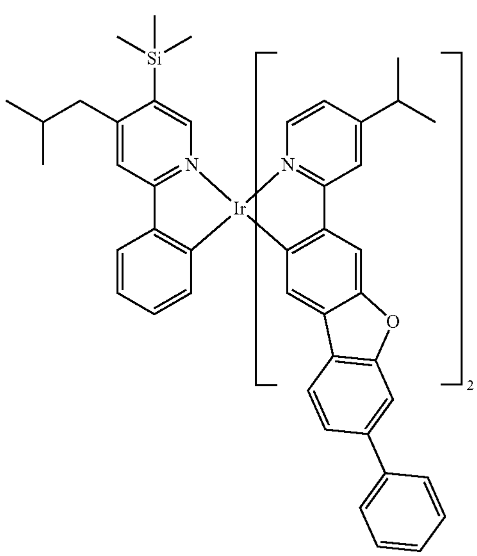
-continued
4683
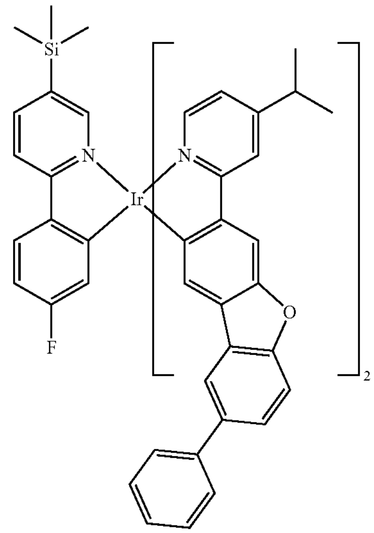
4684
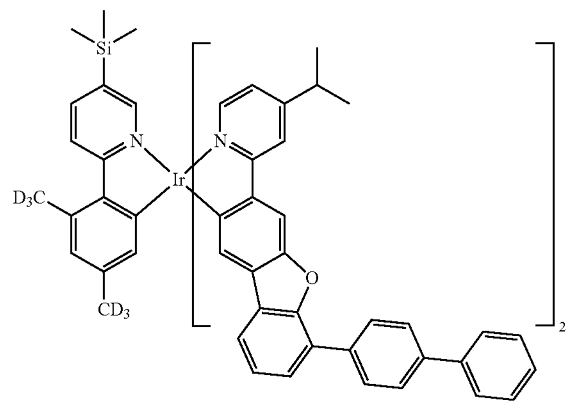
4685
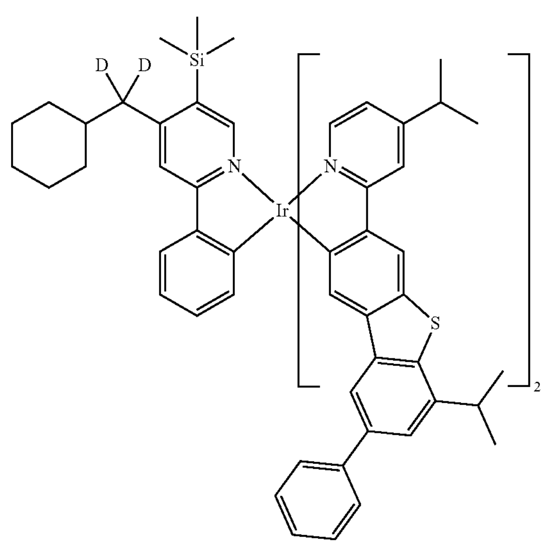

4686
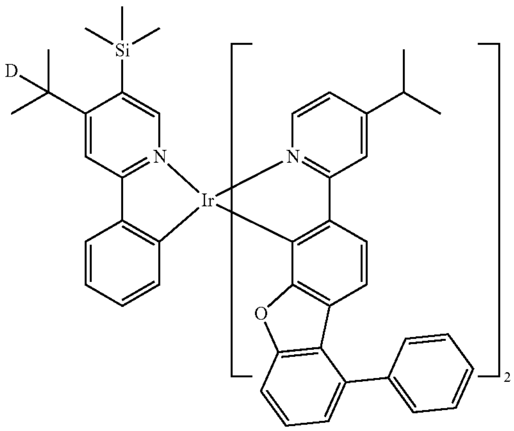
4687
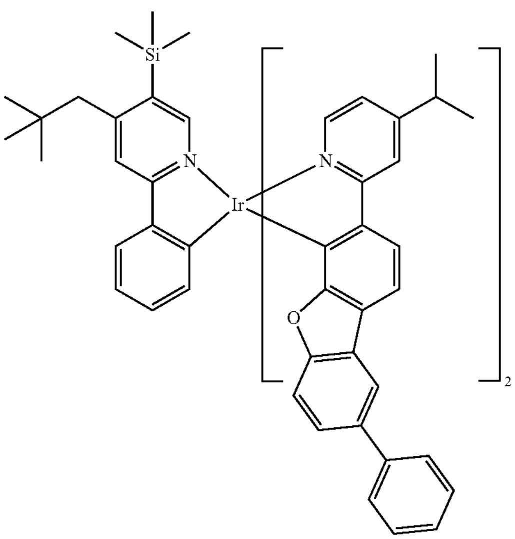
4688
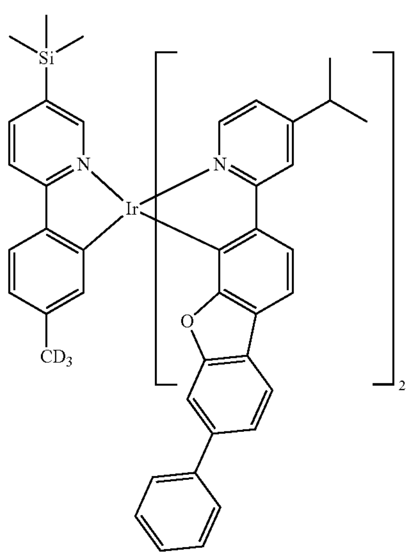
4689
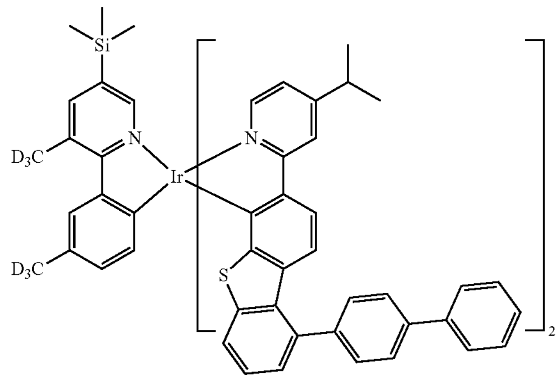
4690
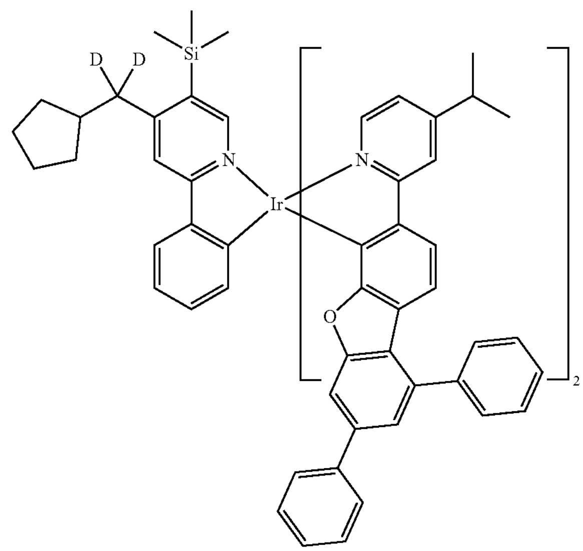
4691
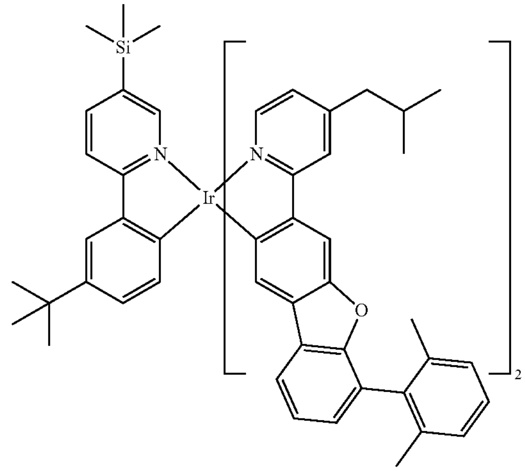

-continued
4692
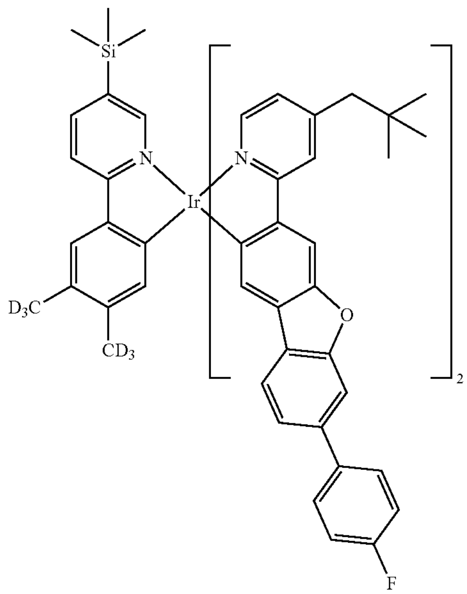
4693
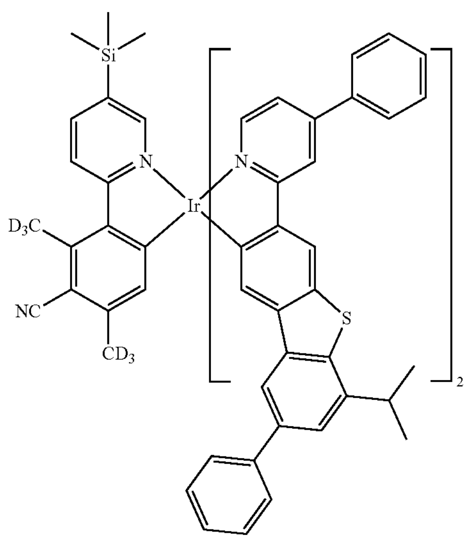
4694
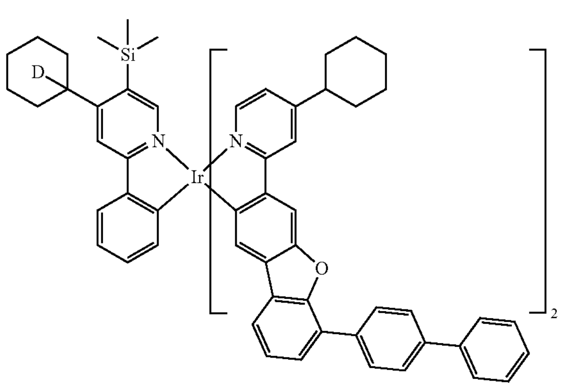
-continued
4695
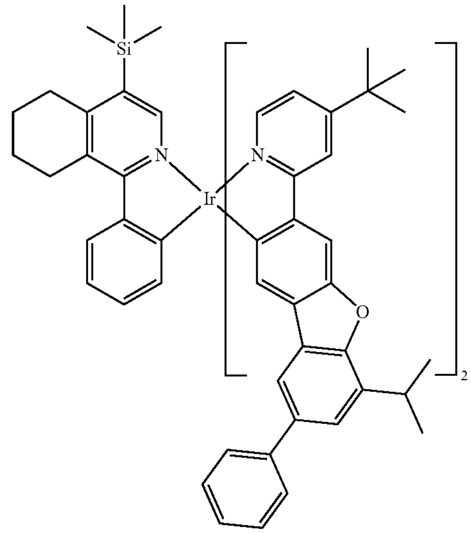
4696
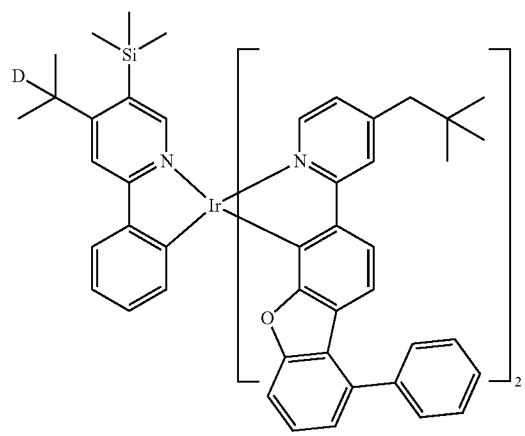
4697
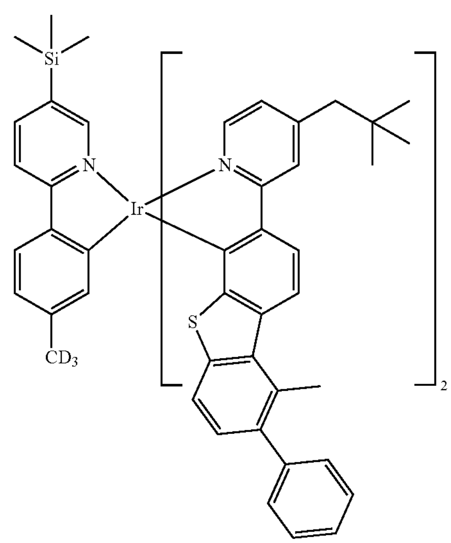

-continued
4698
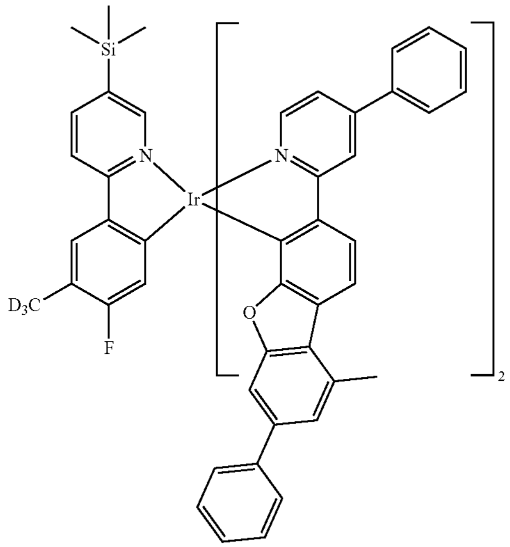
4699
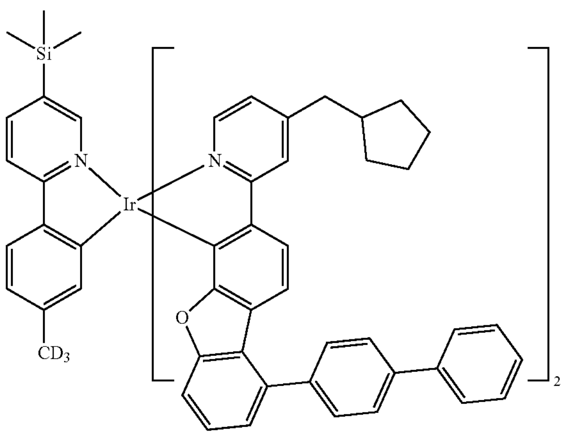
4700
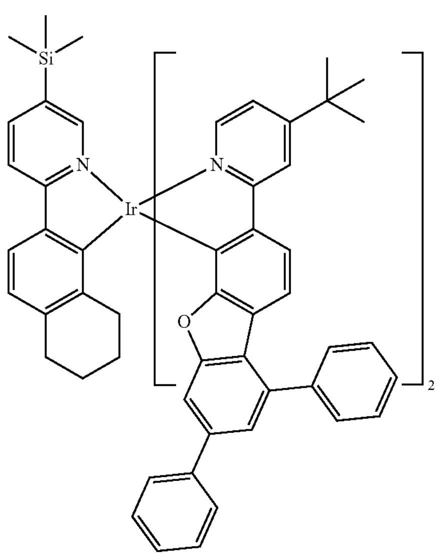
-continued
4701
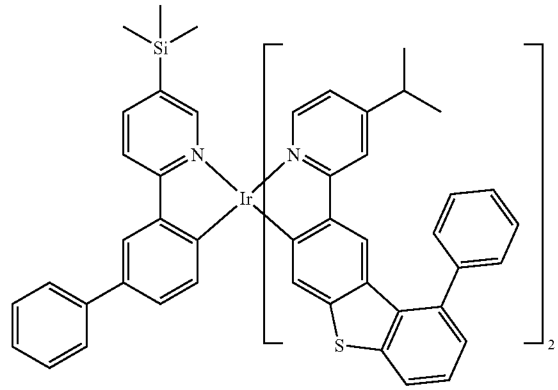
4702
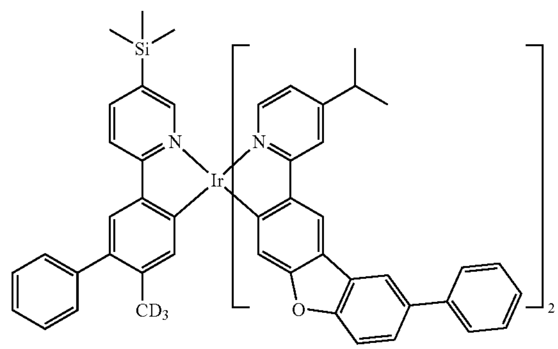
4703
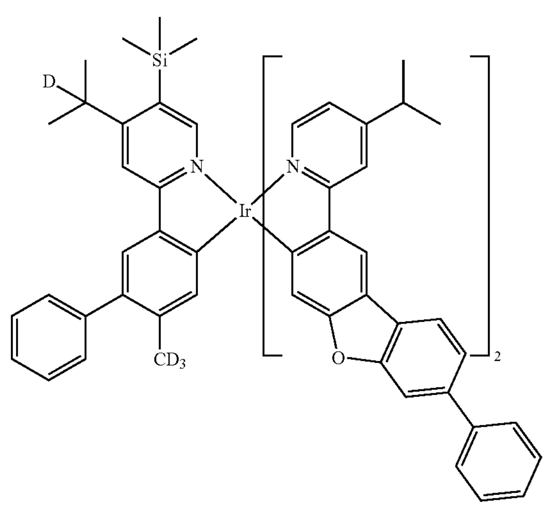

-continued
4704
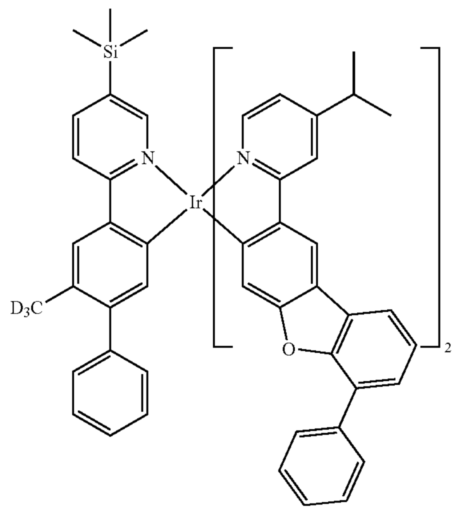
4705
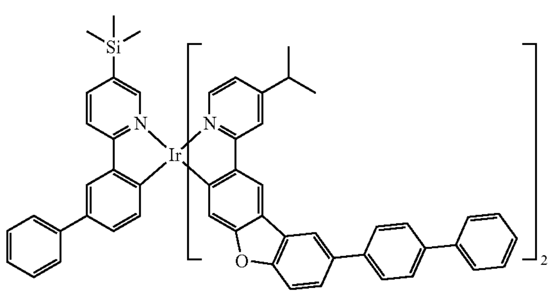
4706
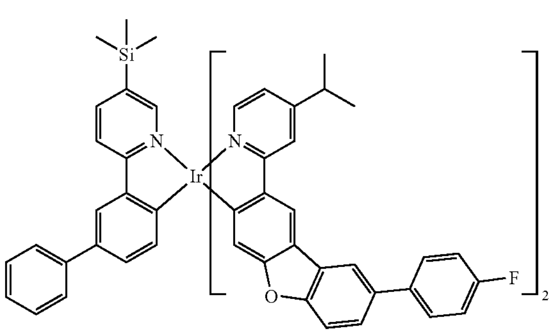
-continued
4707
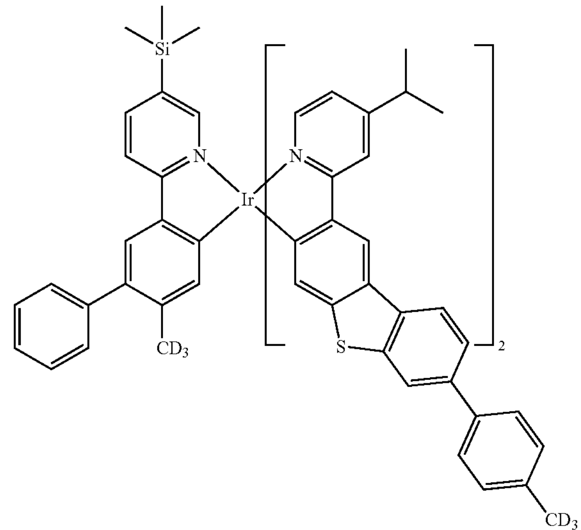
4708
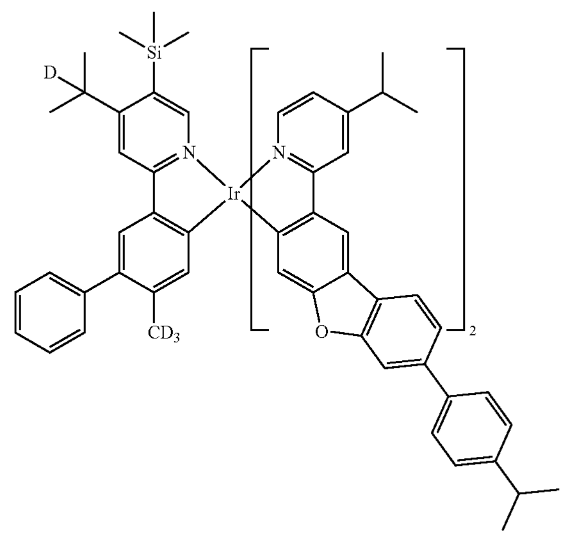
4709
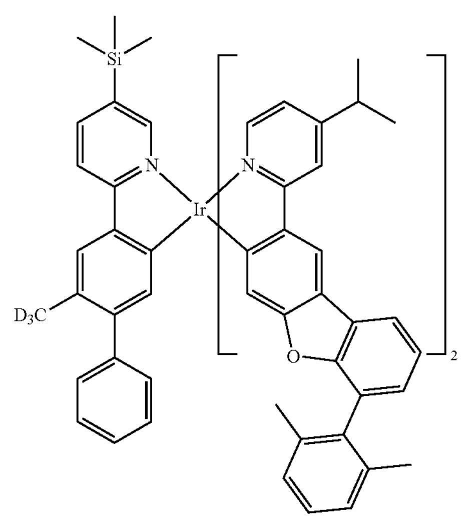

-continued
4710
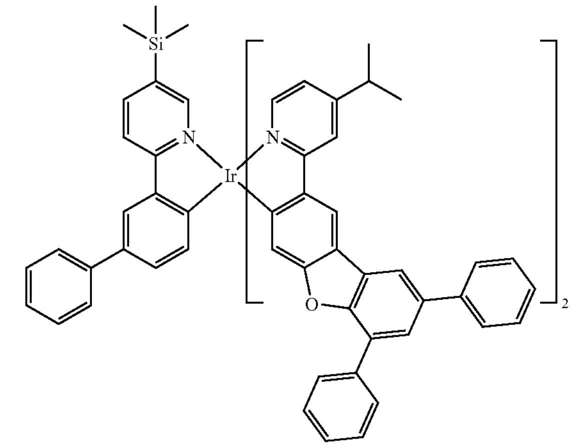
4711
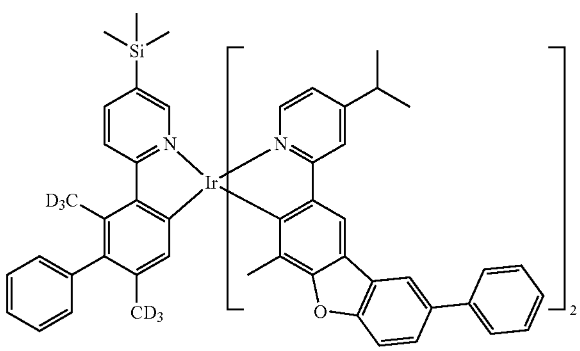
4712
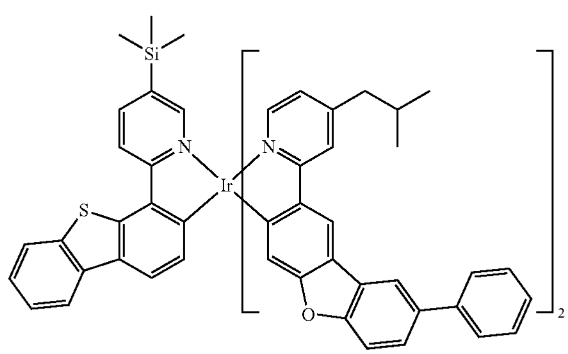
-continued
4713
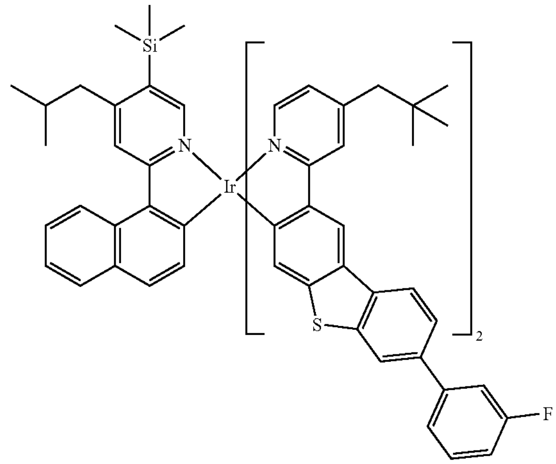
4714
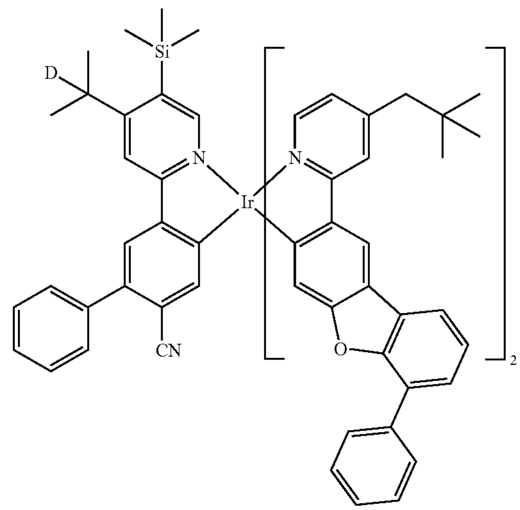
4715
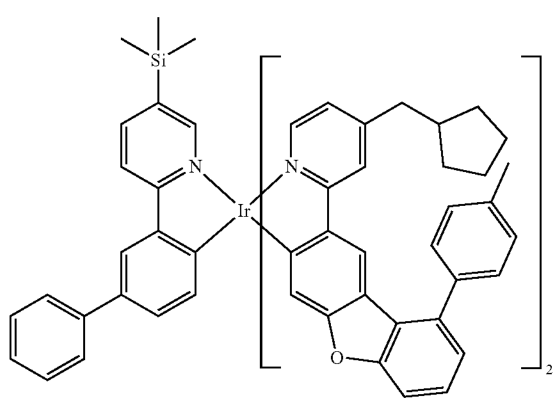

-continued
4716
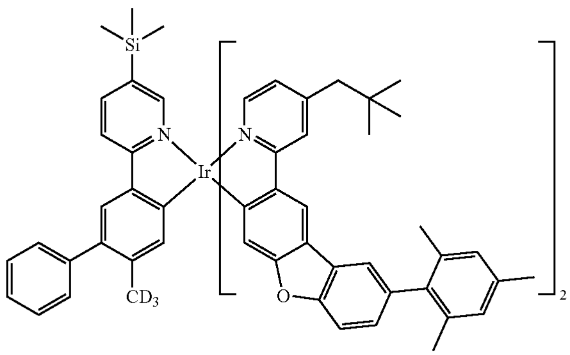
4717
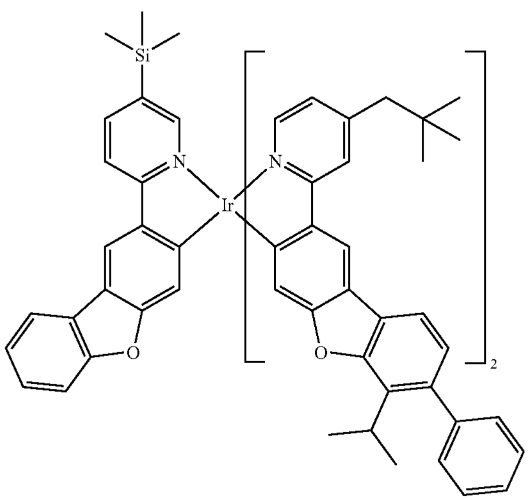
4718
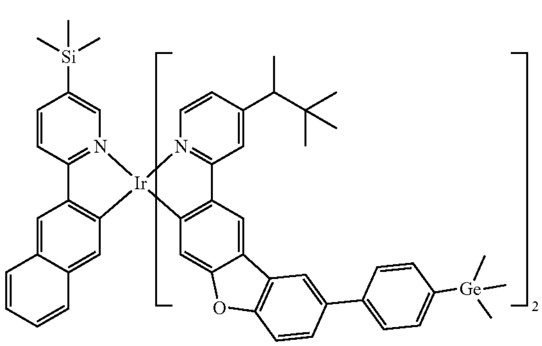
-continued
4719
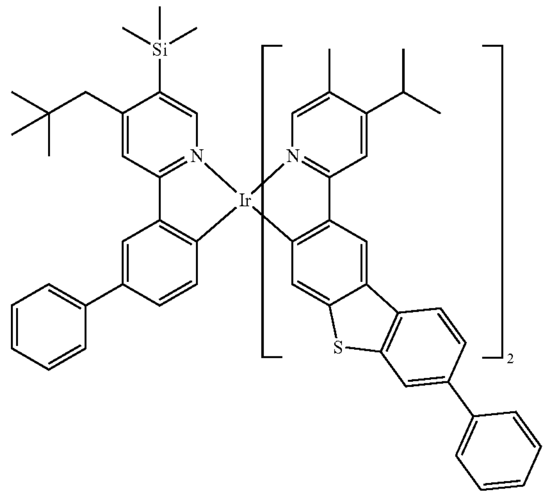
4720
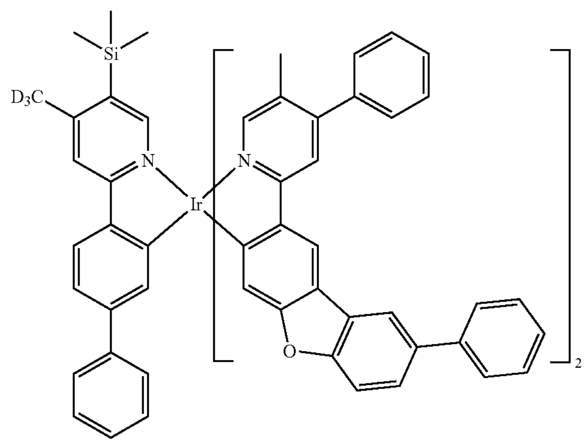
4721
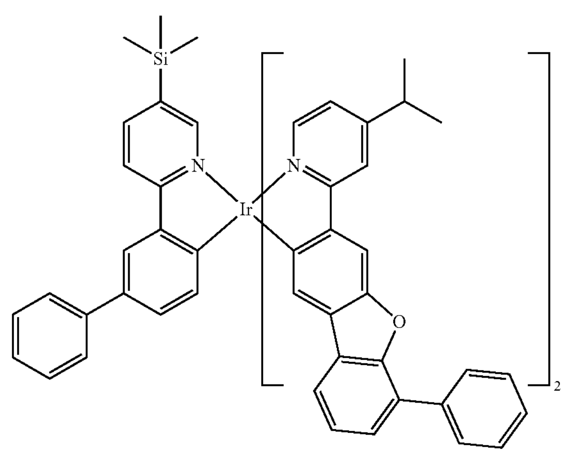

-continued
4722
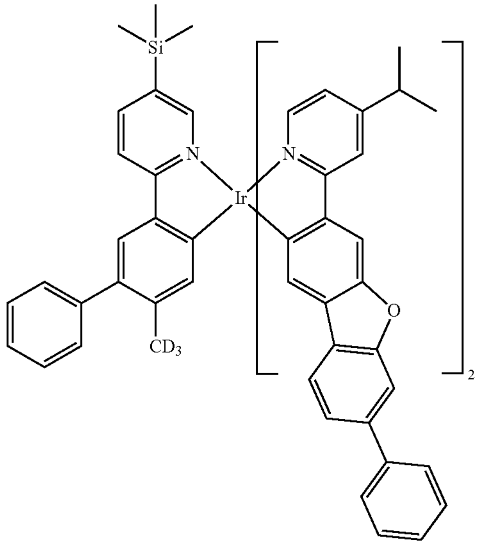
4723
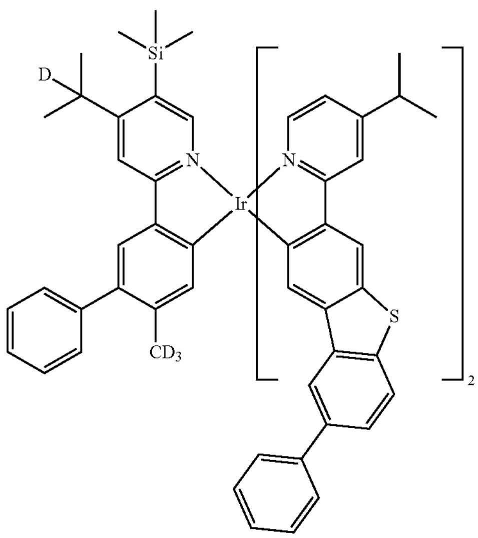
4724
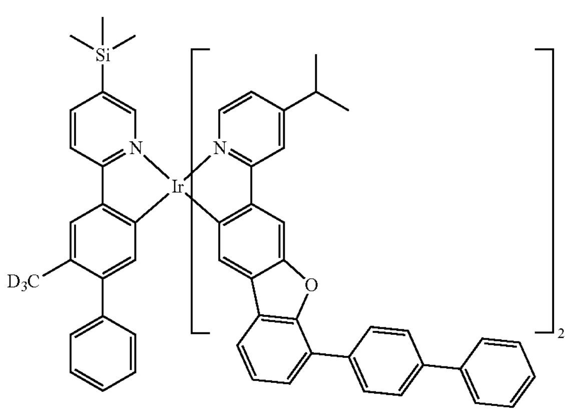
-continued
4725
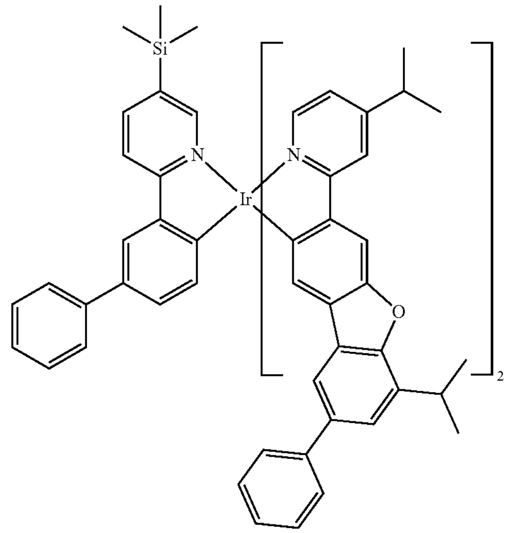
4726
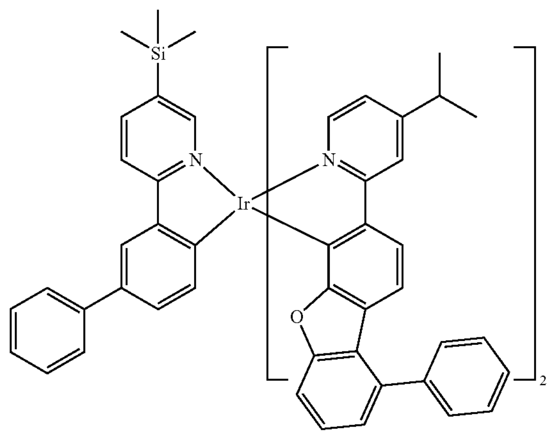
4727
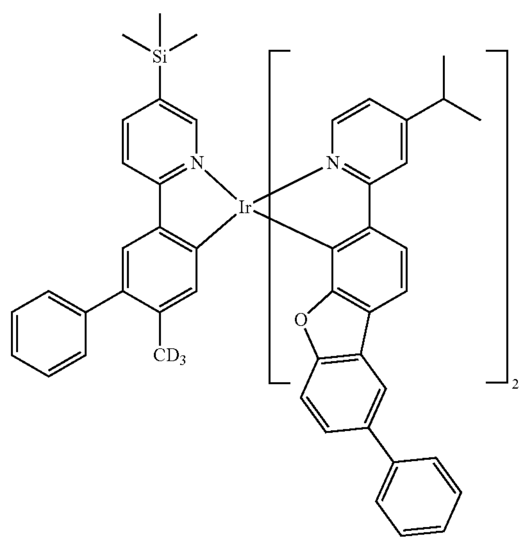

-continued
4728
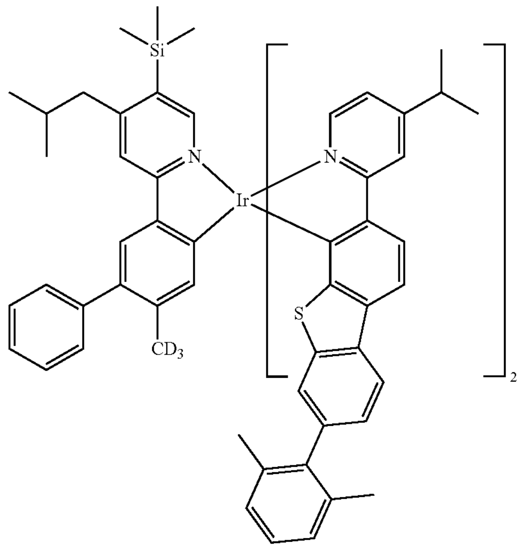
4729
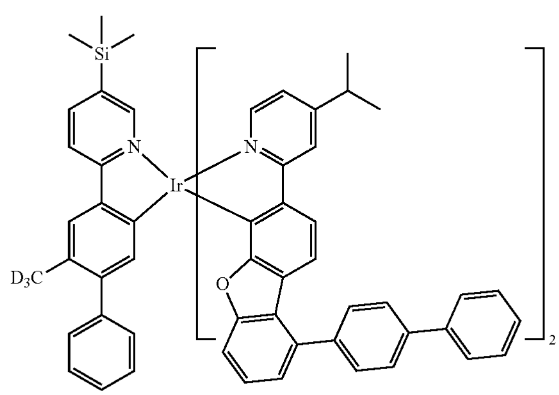
4730
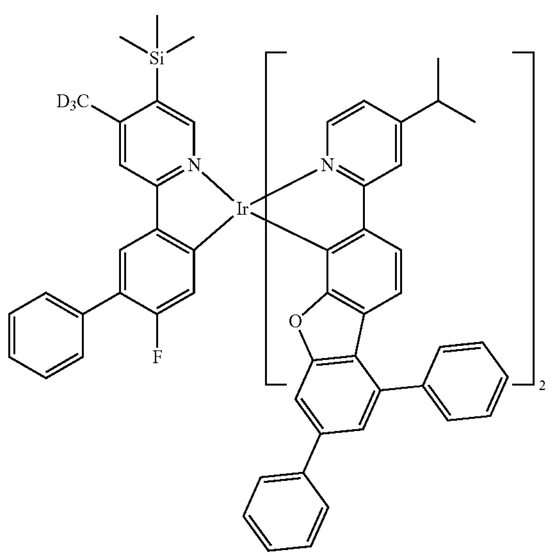
-continued
4731
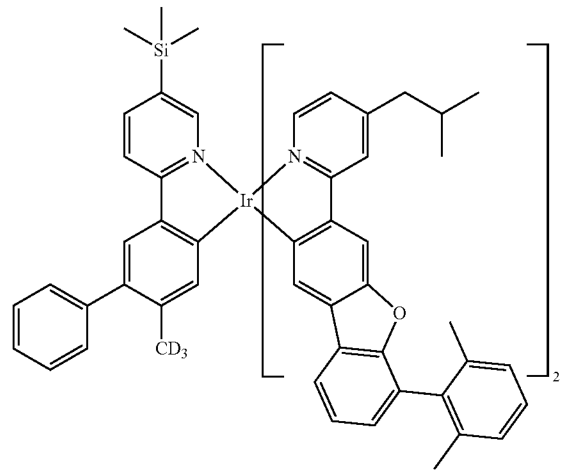
4732
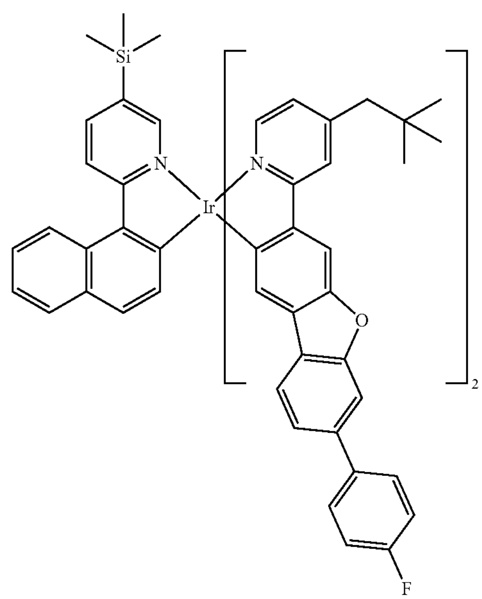
4733
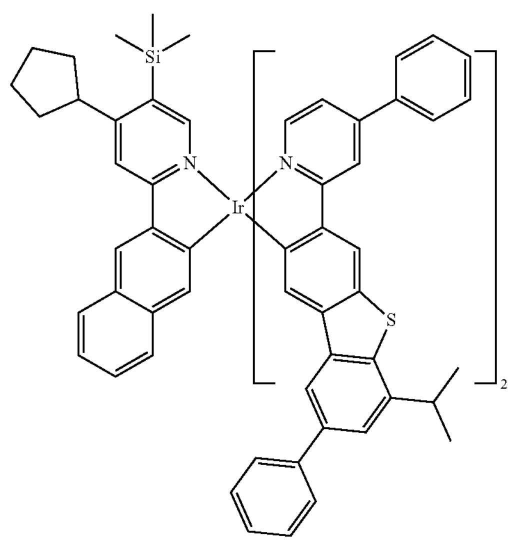

-continued
4734
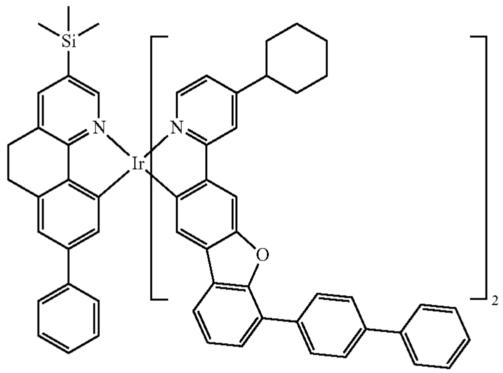
4735
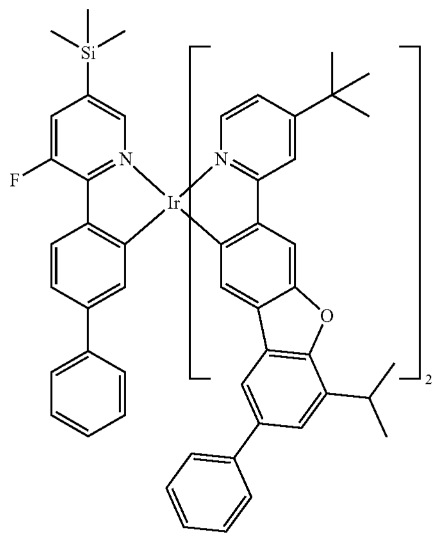
4736
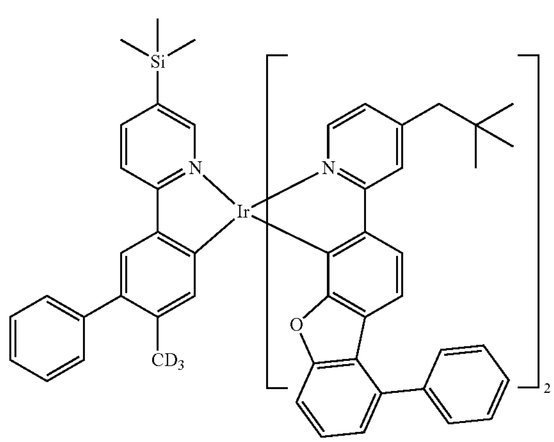
-continued
4737
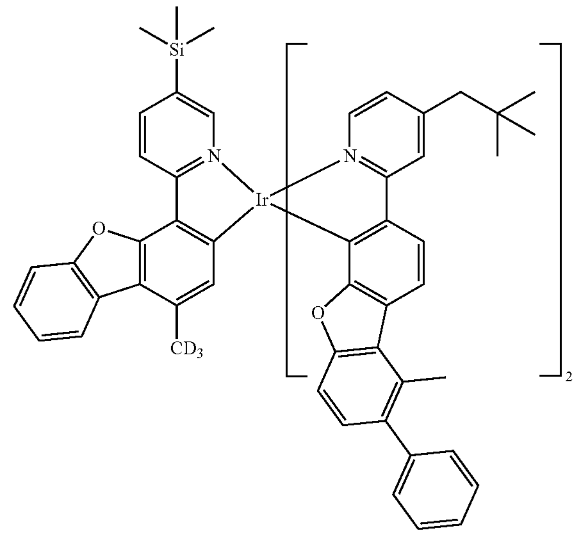
4738
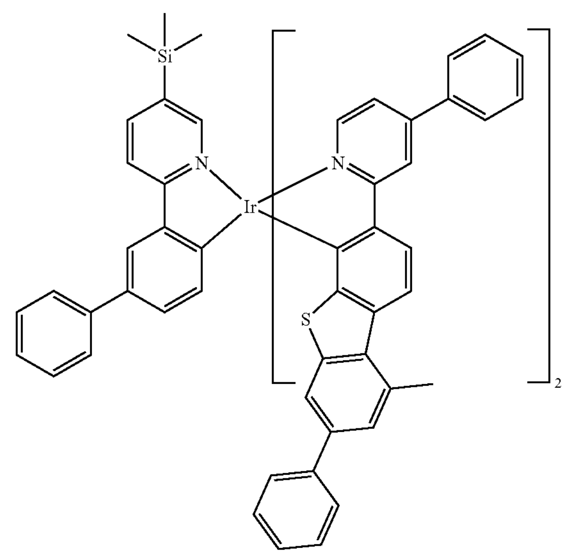
4739
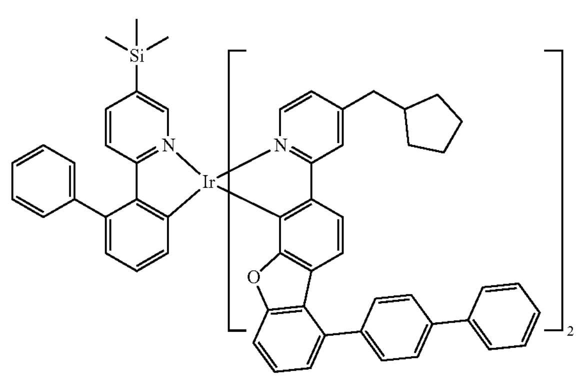

-continued
4740
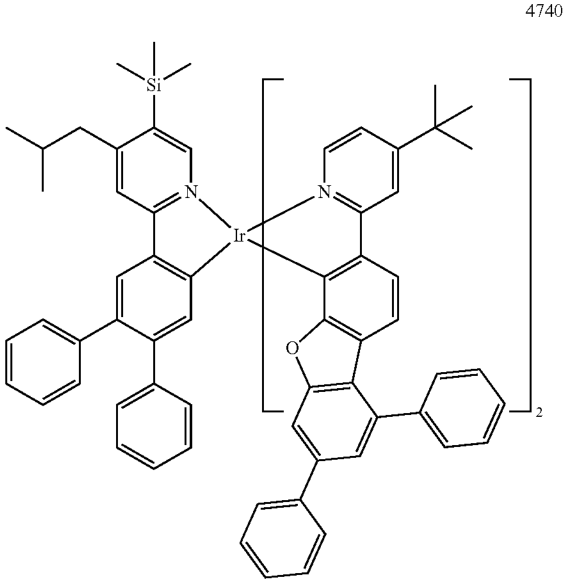
4741
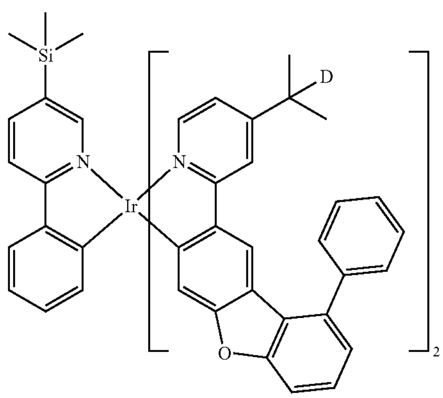
4742
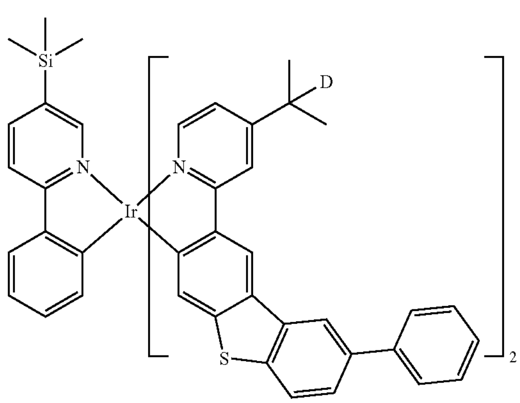
-continued
4743
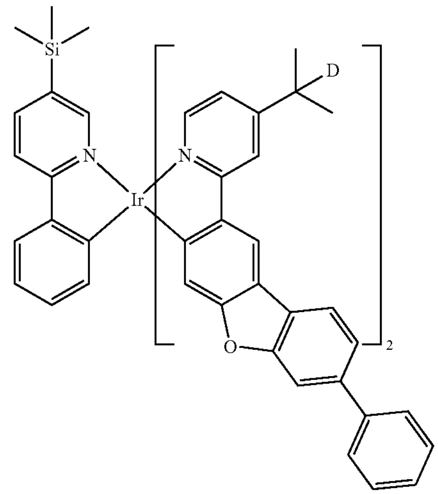
4744
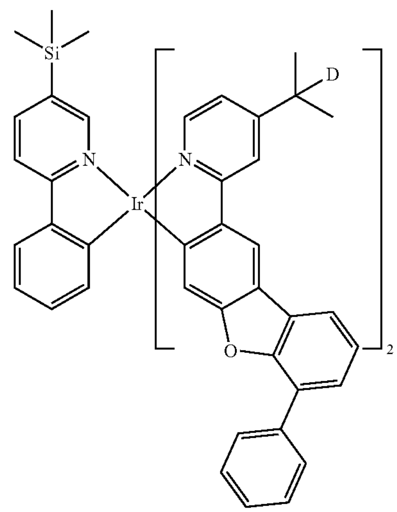
4745
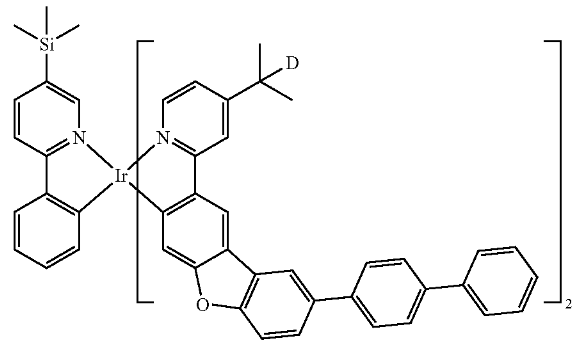

4746
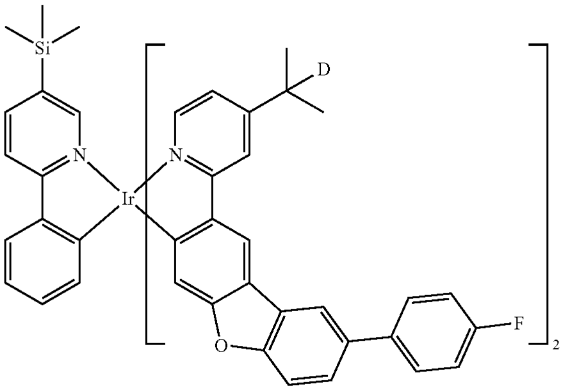
4747
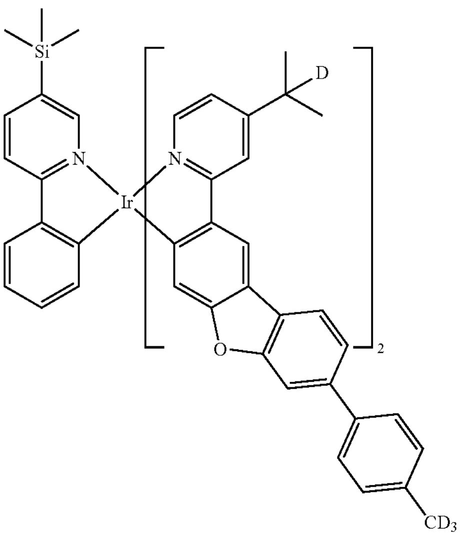
4748
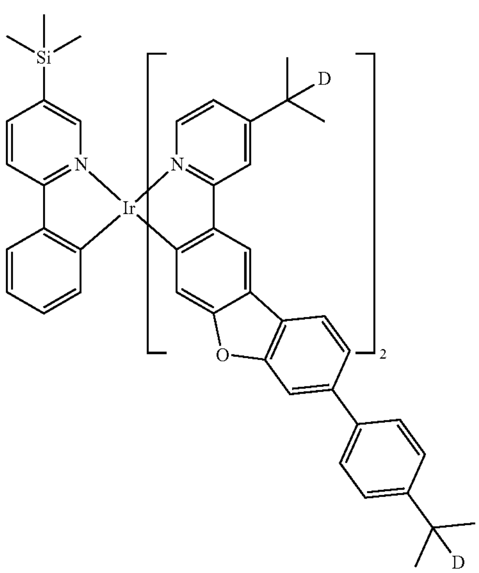
4749
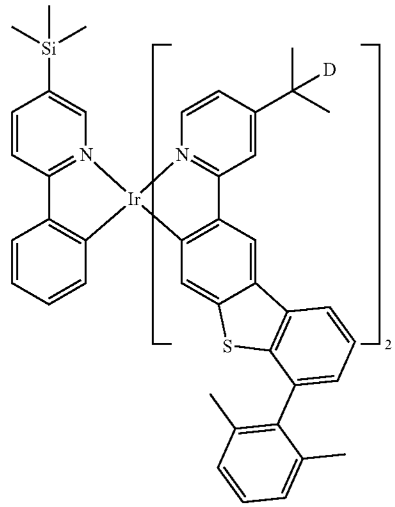
4750
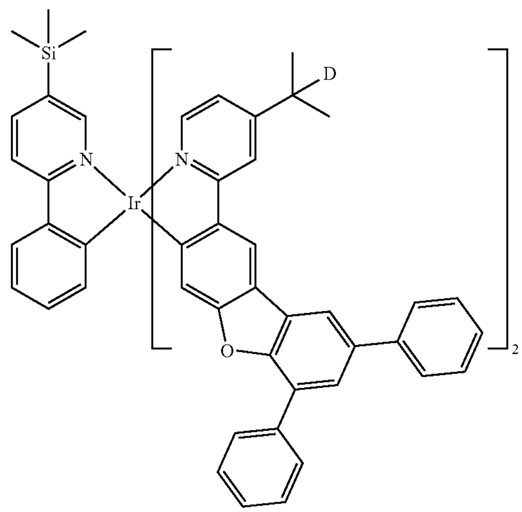
4751
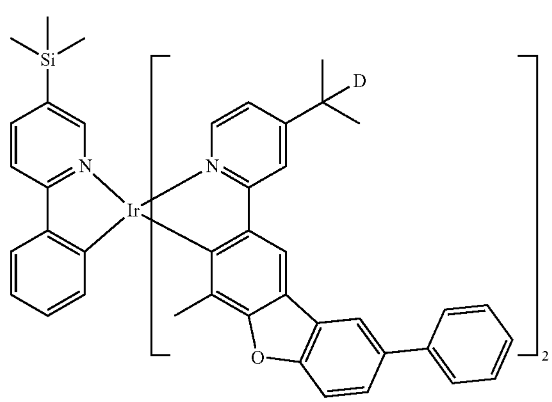

-continued
4752
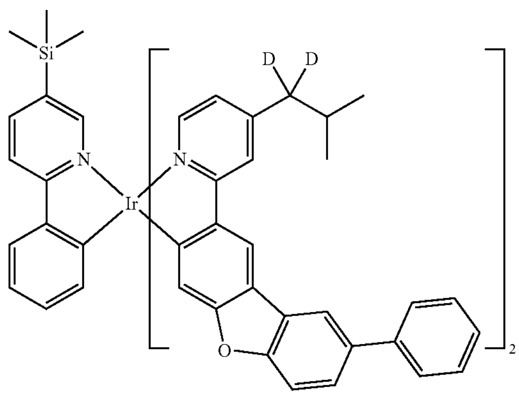
4753
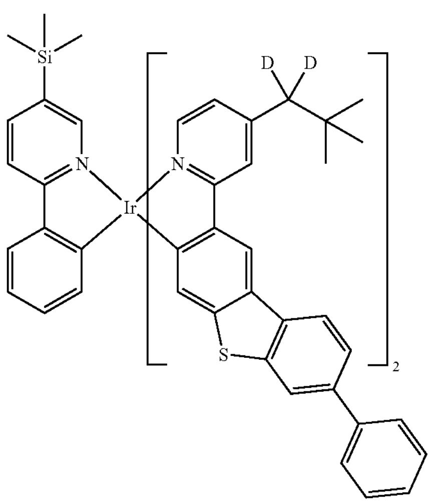
4754
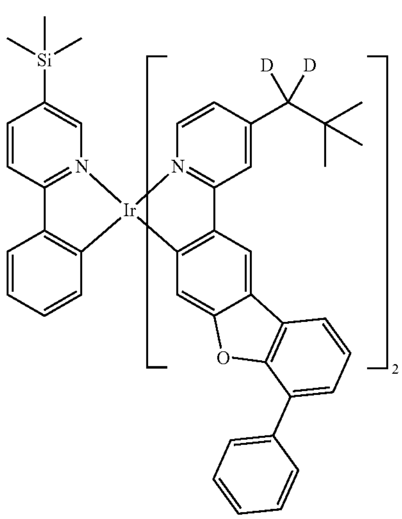
-continued
4755
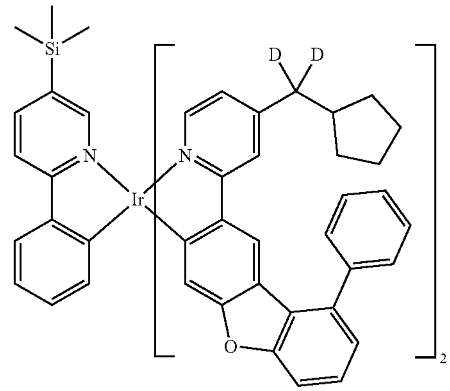
4756
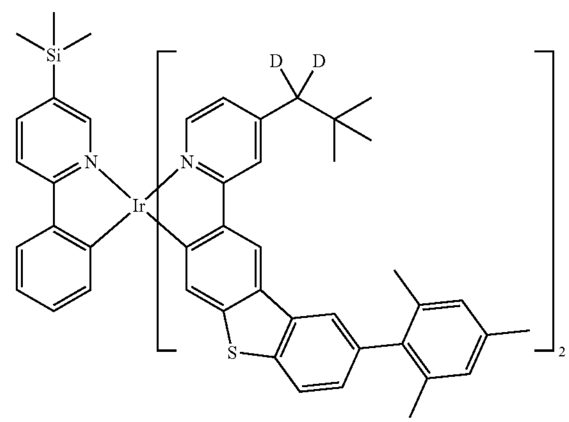
4757
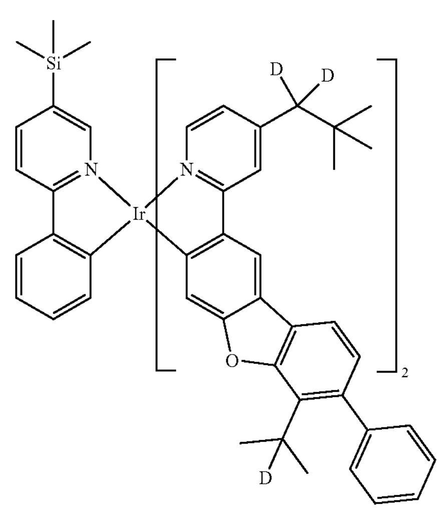

-continued
4758
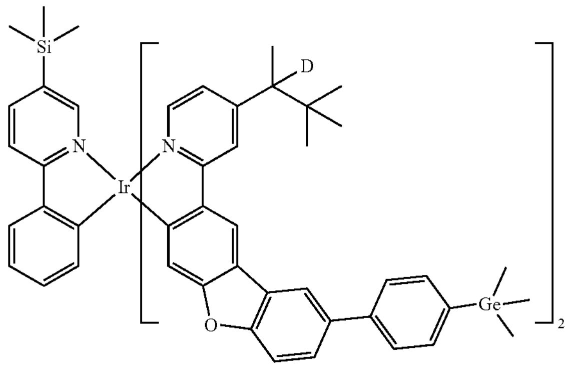
4759
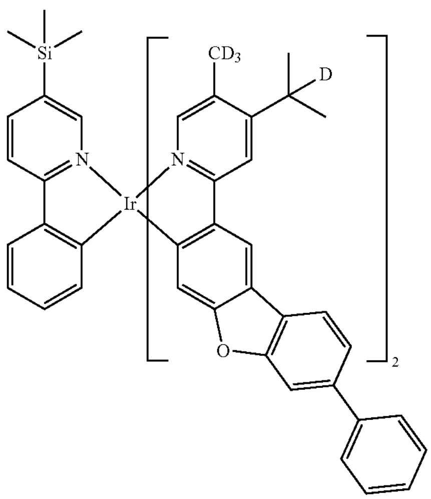
4760
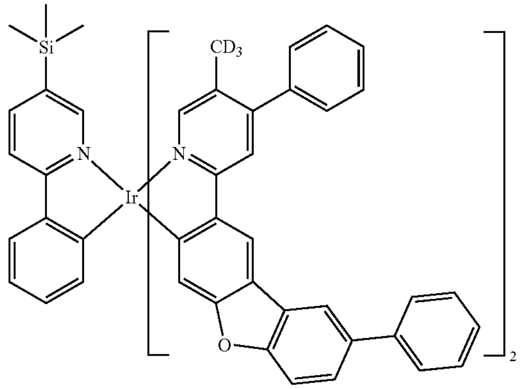
-continued
4761
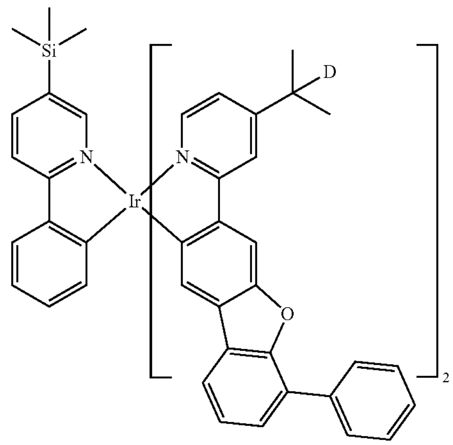
4762
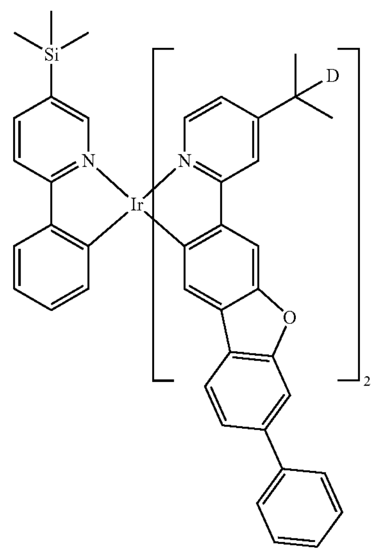
4763
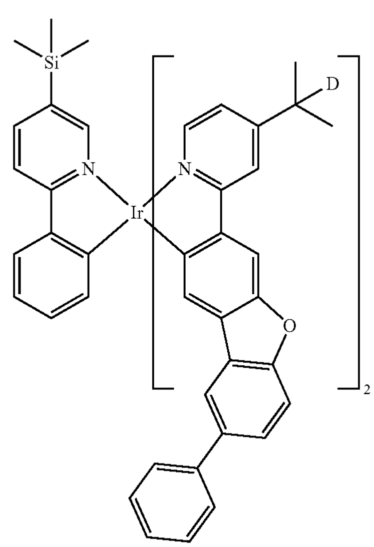

-continued
4764
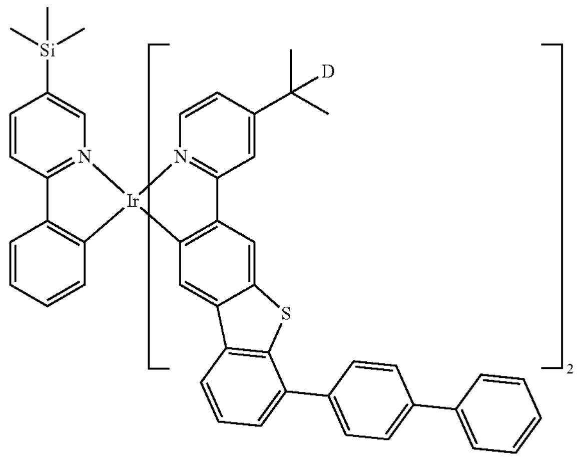
4765
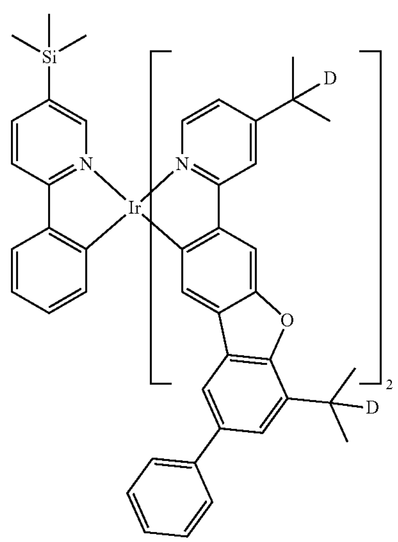
4766
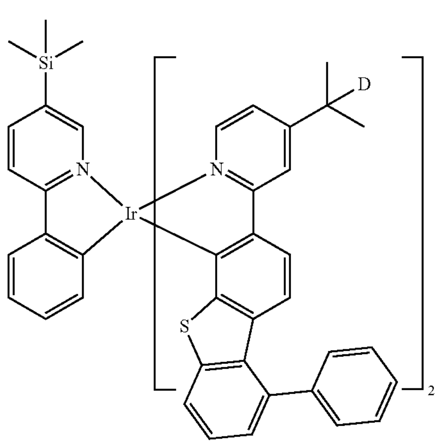
-continued
4767
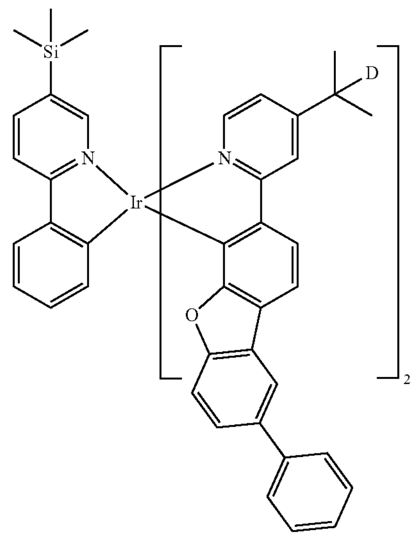
4768
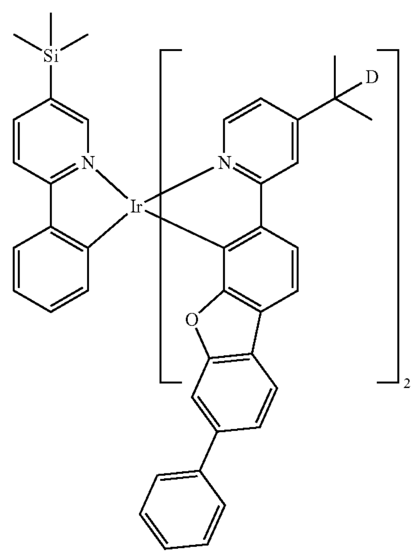
4769
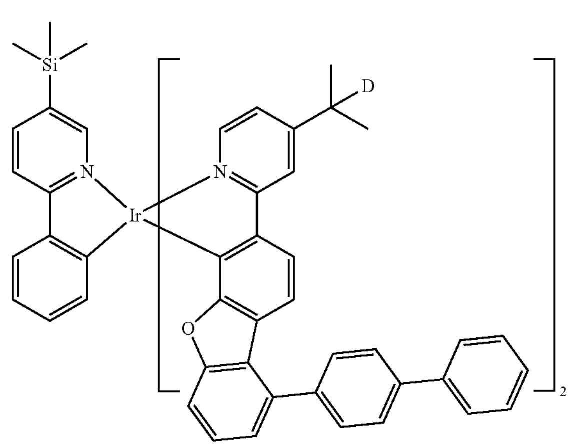

-continued
4770
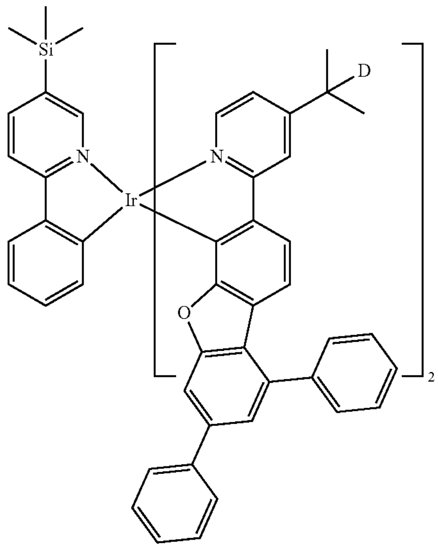
4771
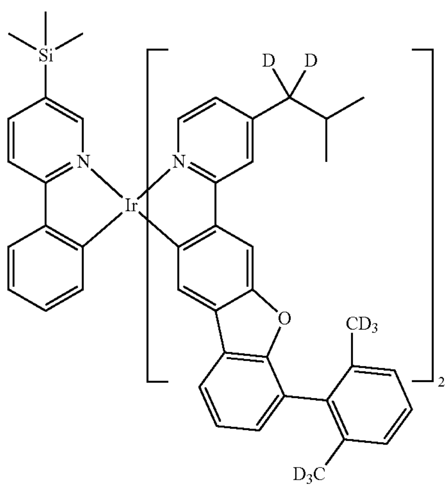
4772
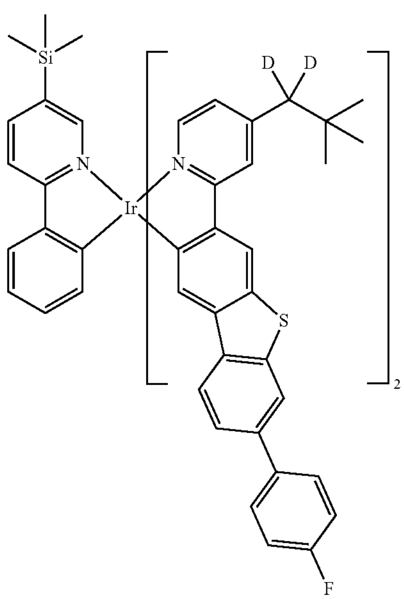
-continued
4773
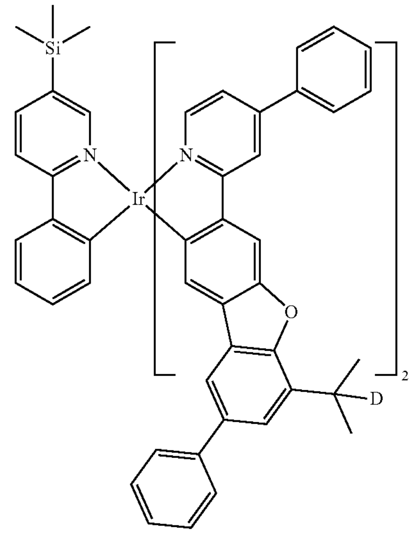
4774
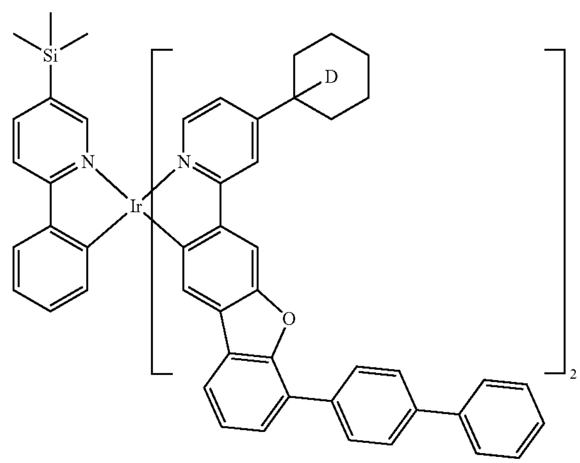
4775
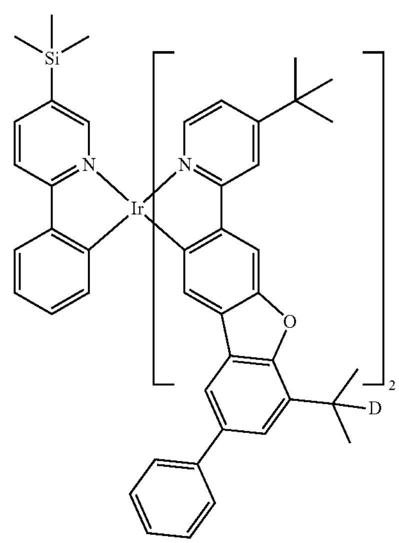

-continued
4776
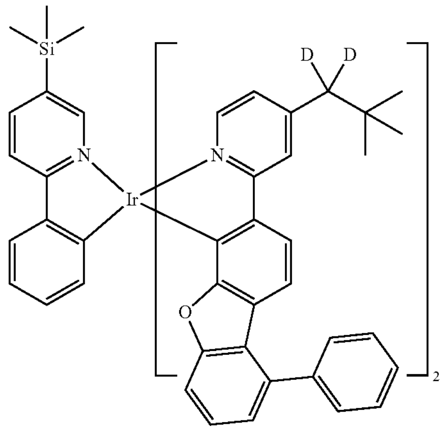
4777
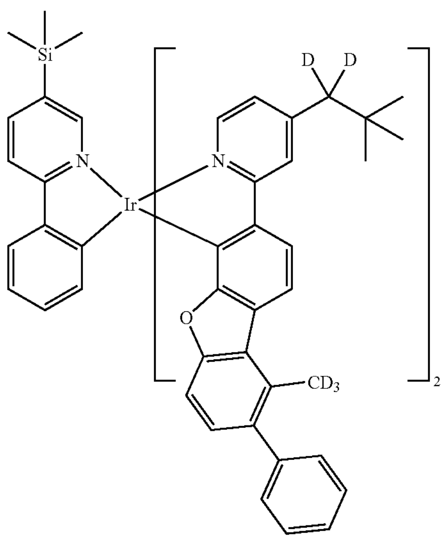
4778
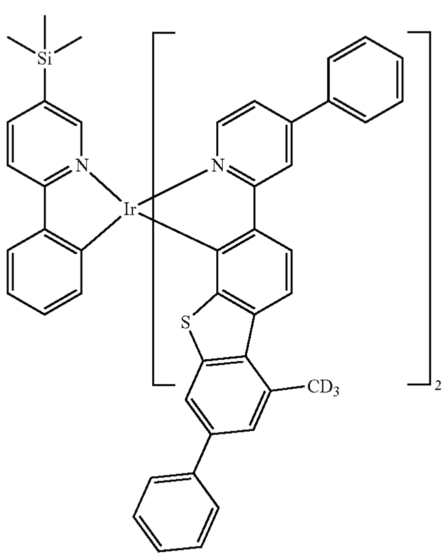
-continued
4779
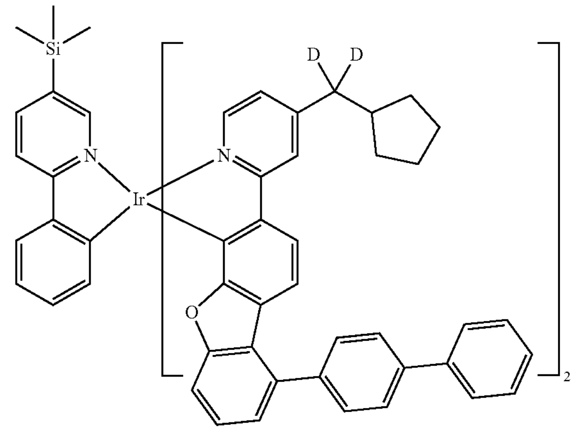
4780
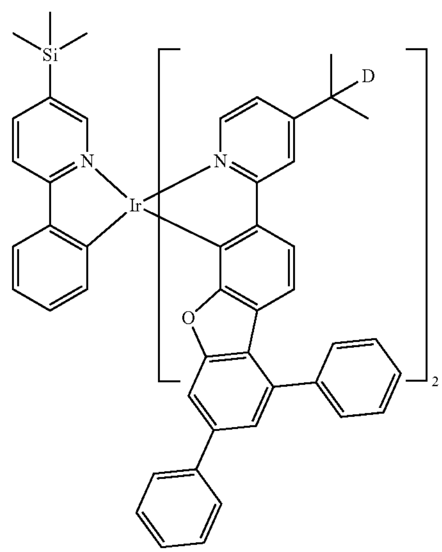
4781
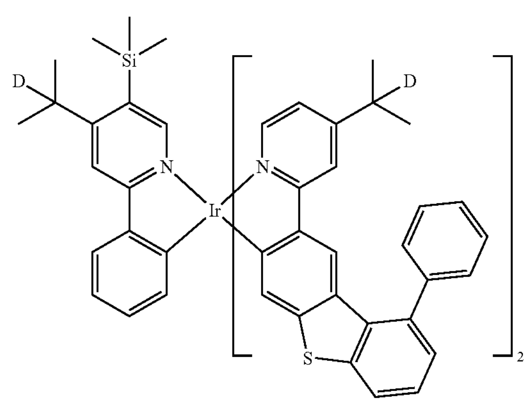

4782
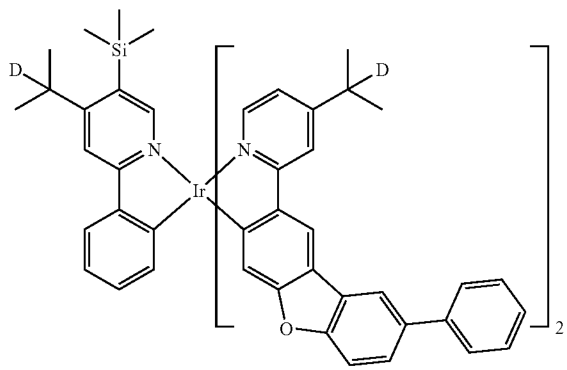
4783
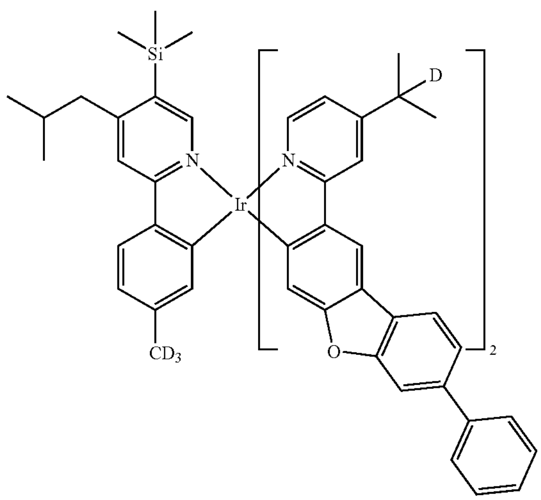
4784
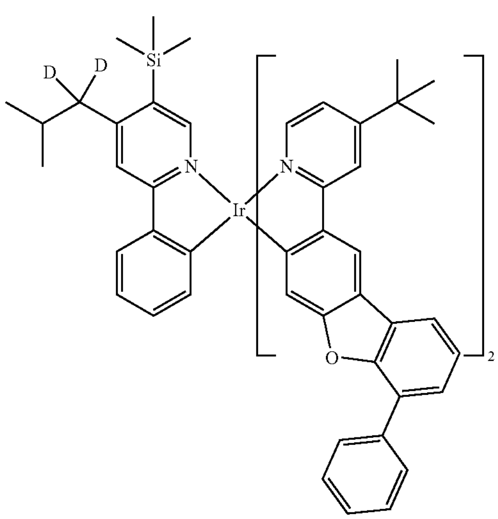
4785
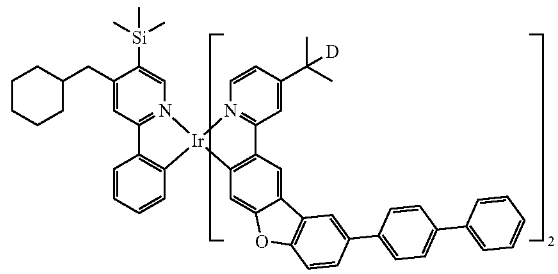
4786
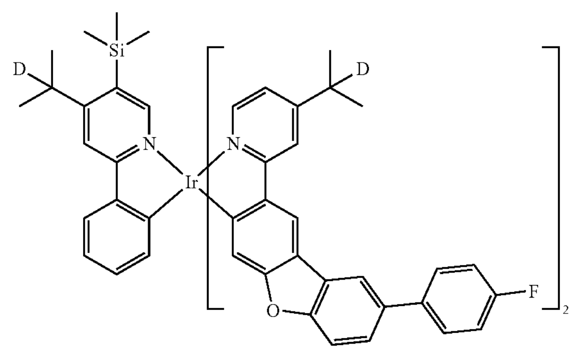
4787
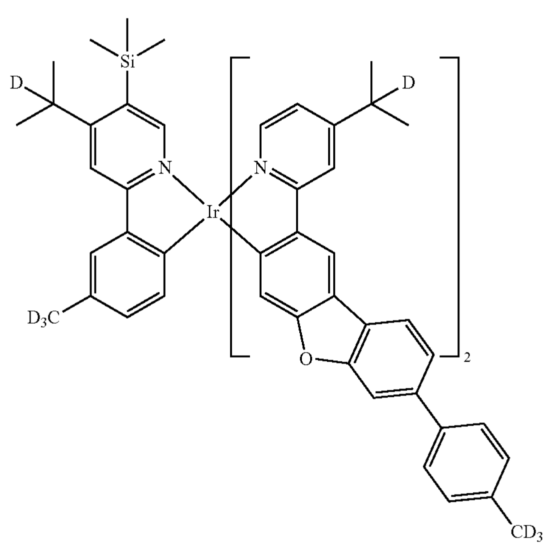

-continued
4788
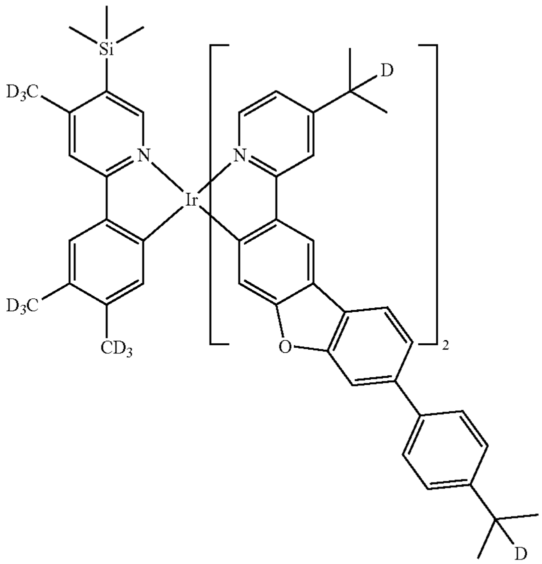
4789
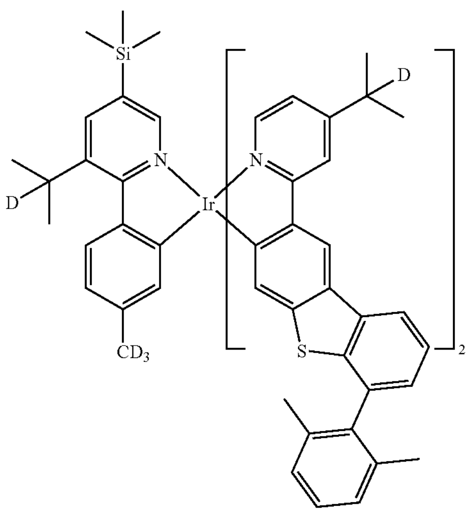
4790
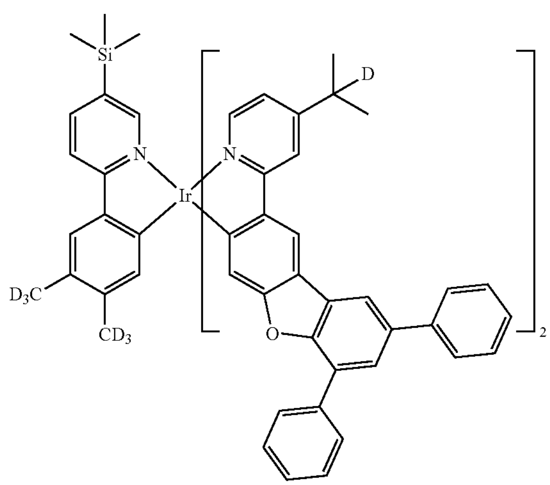
-continued
4791
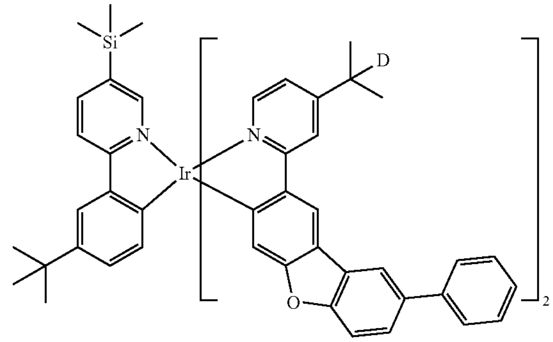
4792
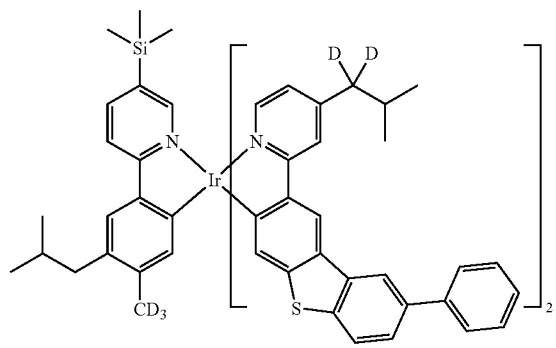
4793
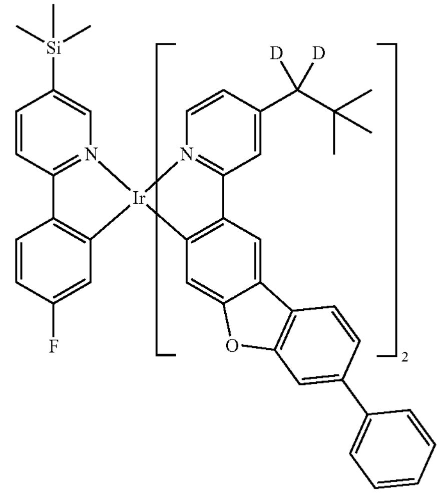

-continued
4794
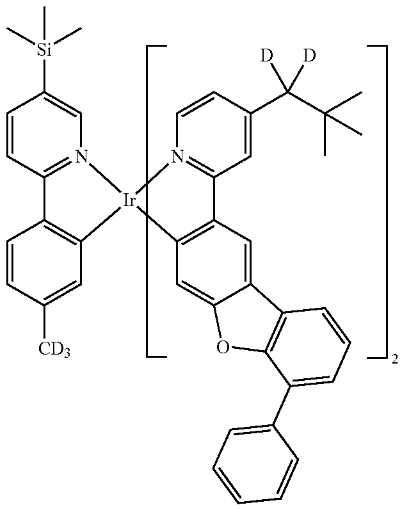
4795
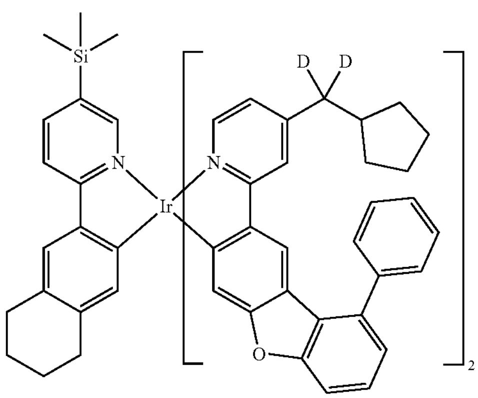
4796
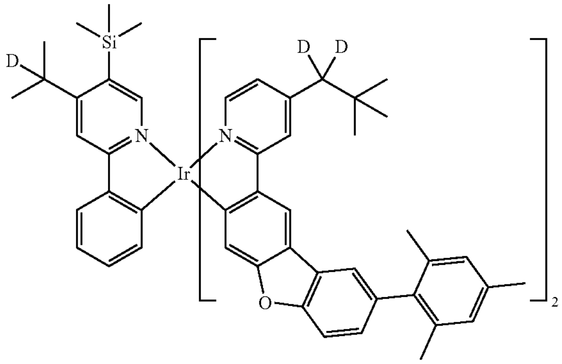
-continued
4797
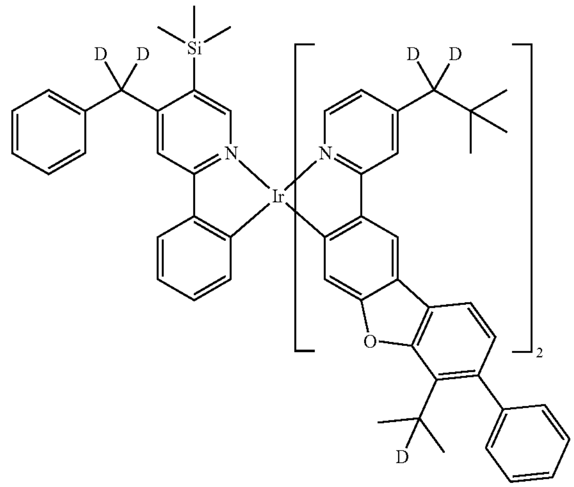
4798
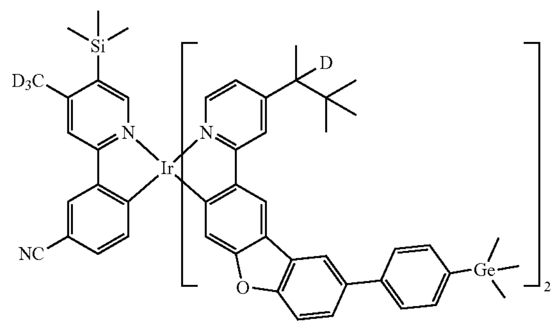
4799
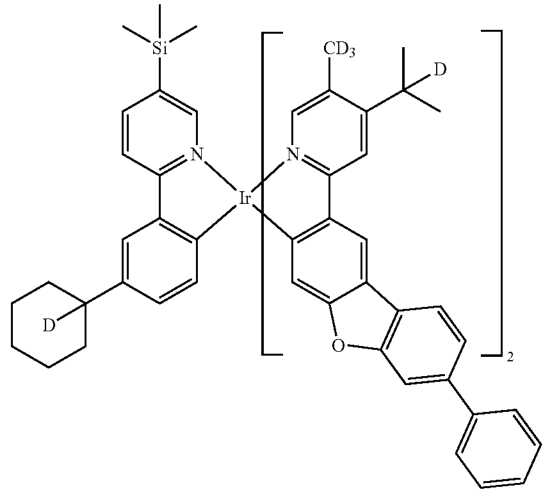

-continued
4800
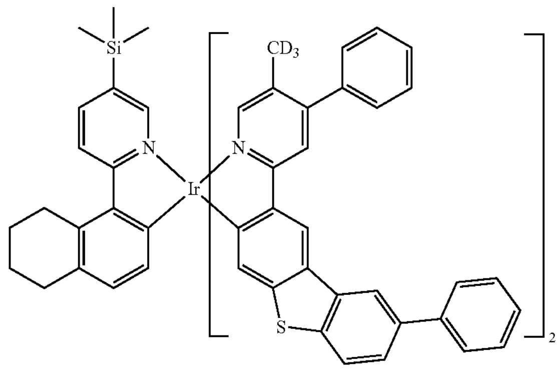
4801
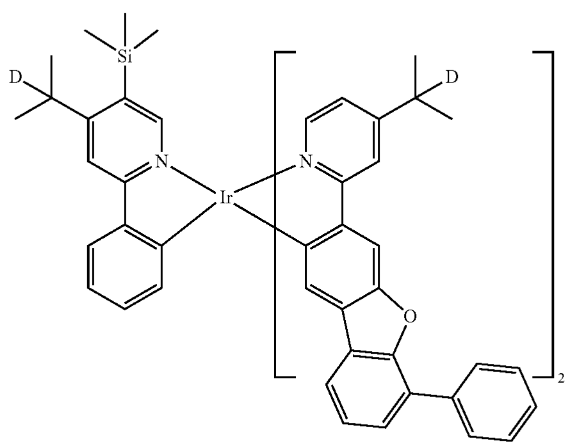
4802
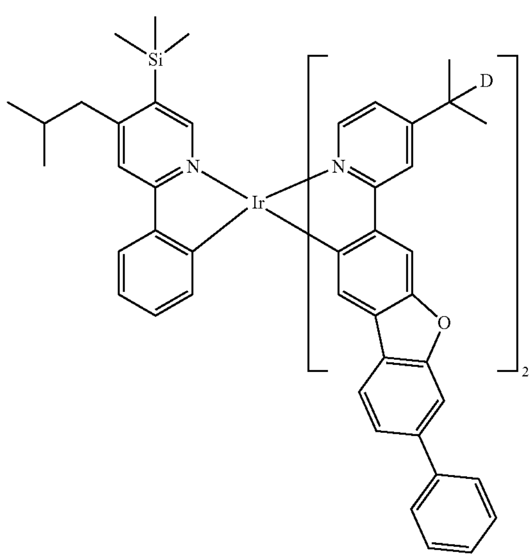
-continued
4803
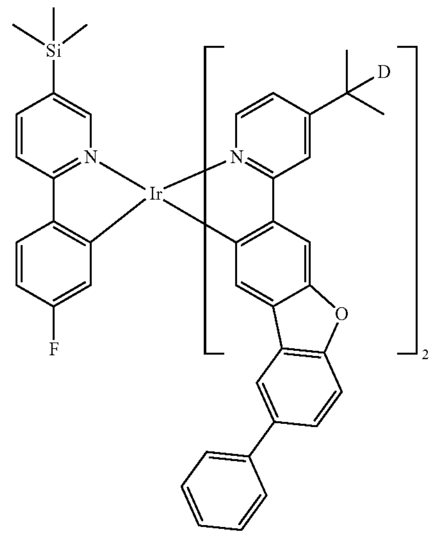
4804
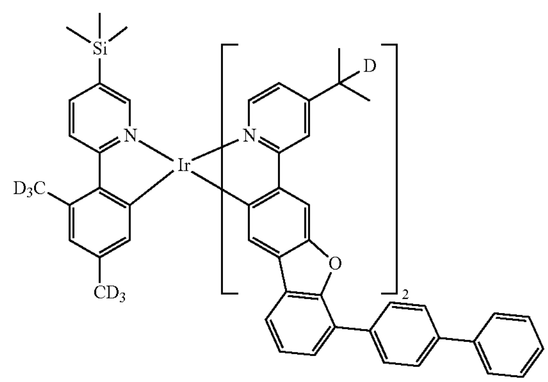
4805
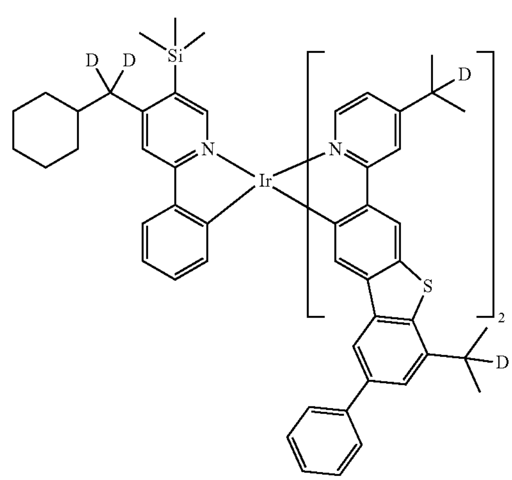

-continued
4806
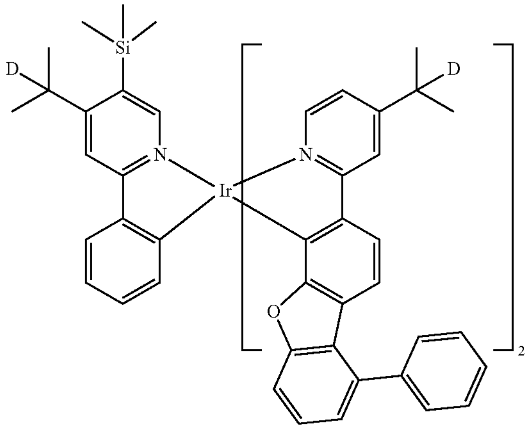
4807
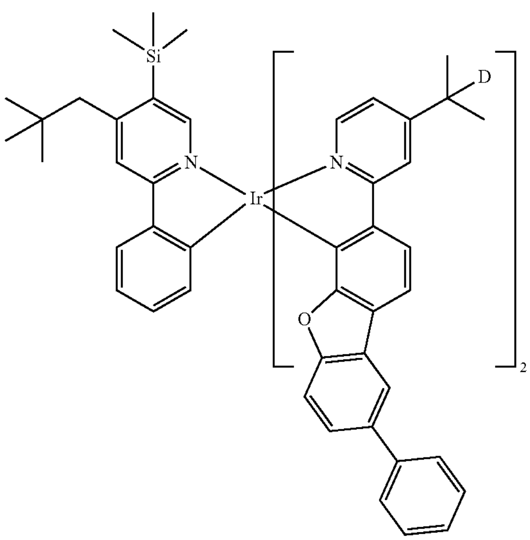
4808
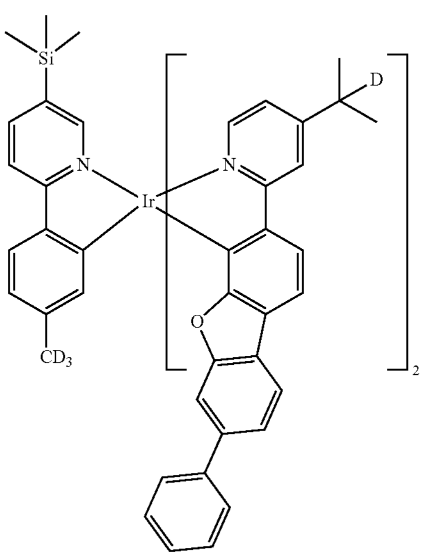
-continued
4809
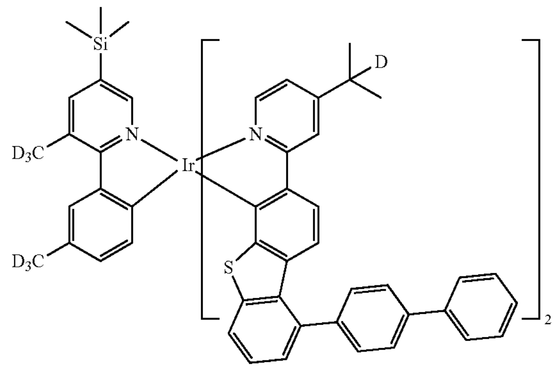
4810
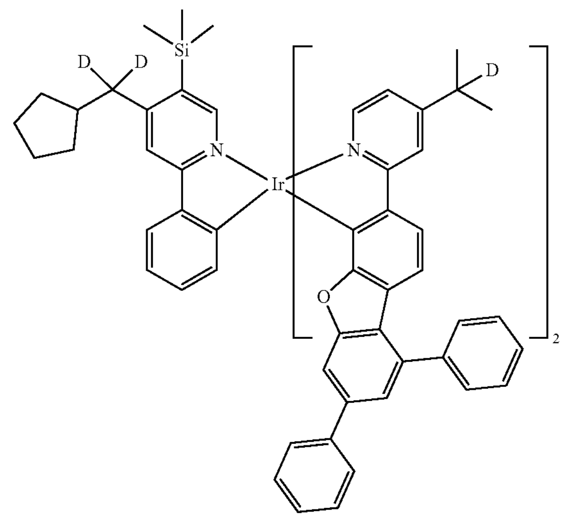
4811
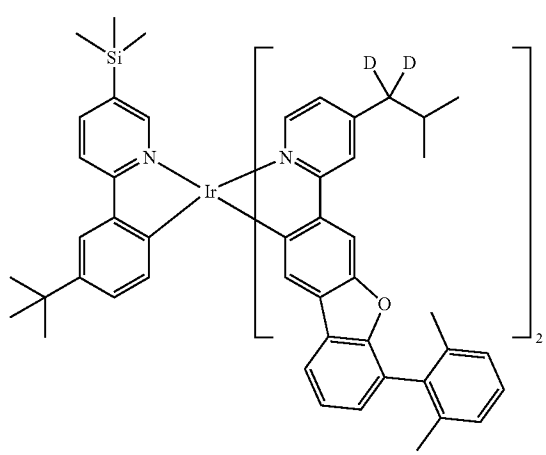

4812
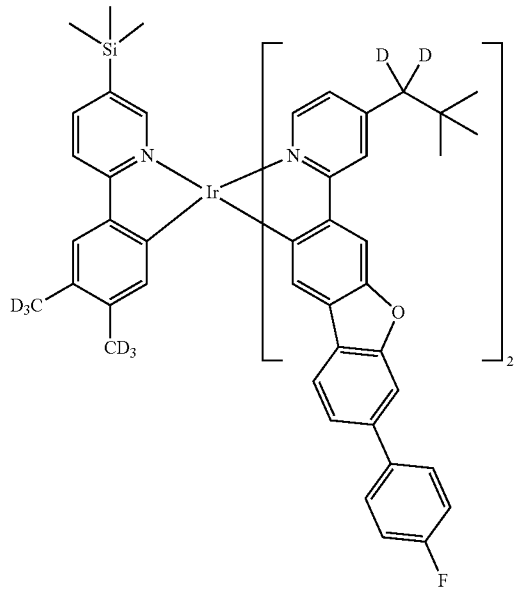
4813
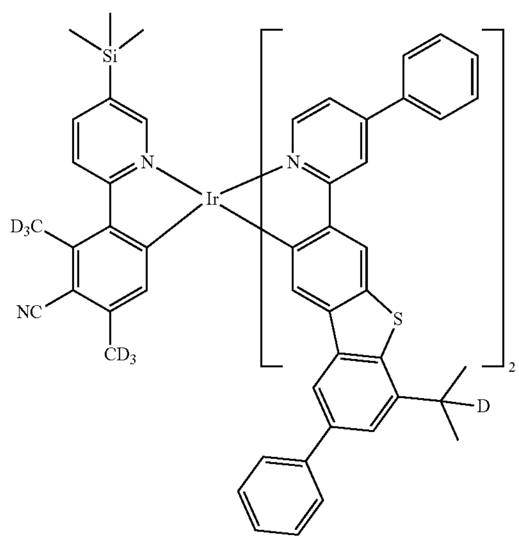
4814
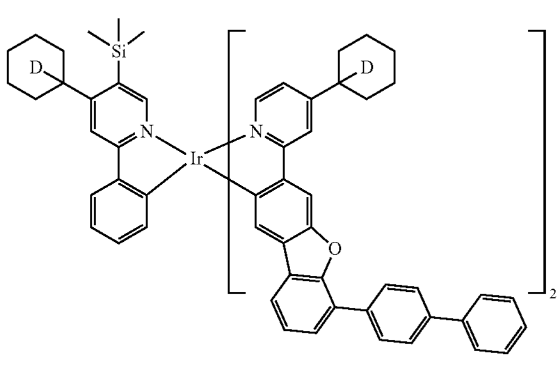
4815
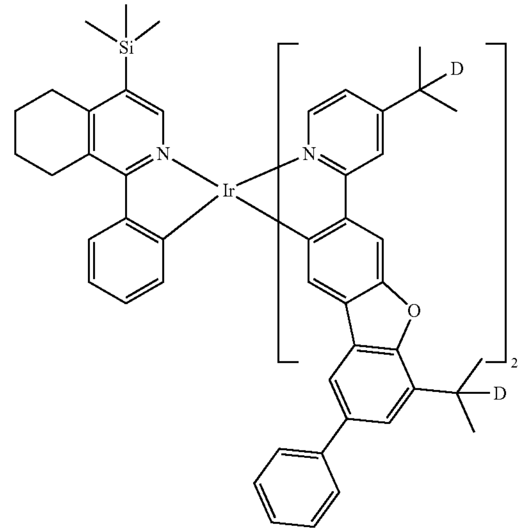
4816
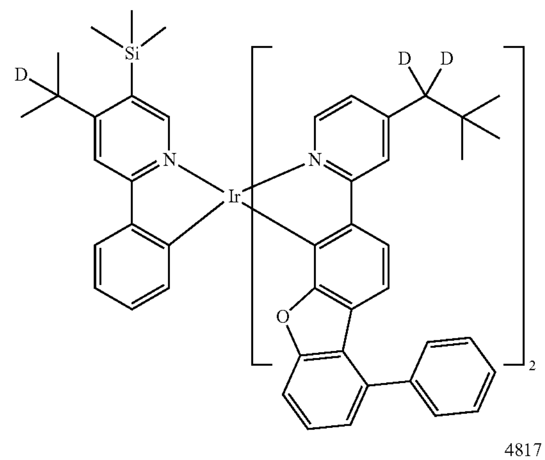
4817
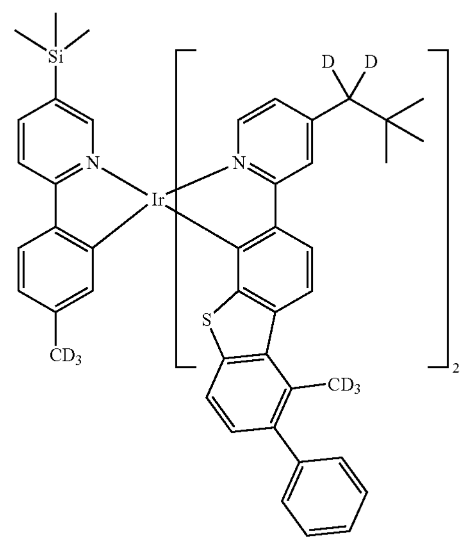

-continued
4818
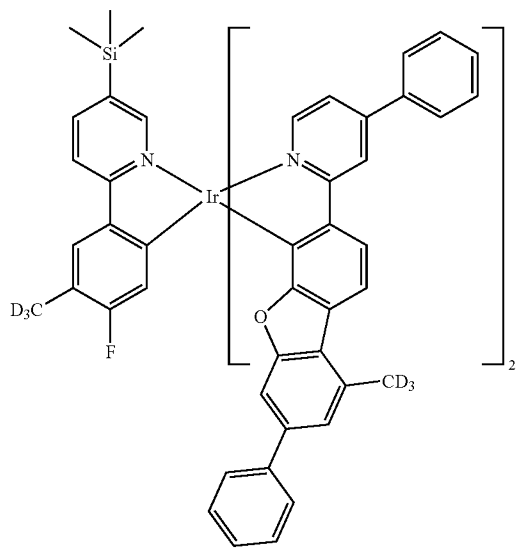
4819
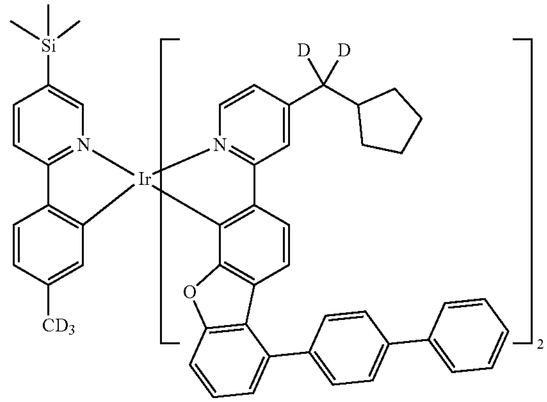
4820
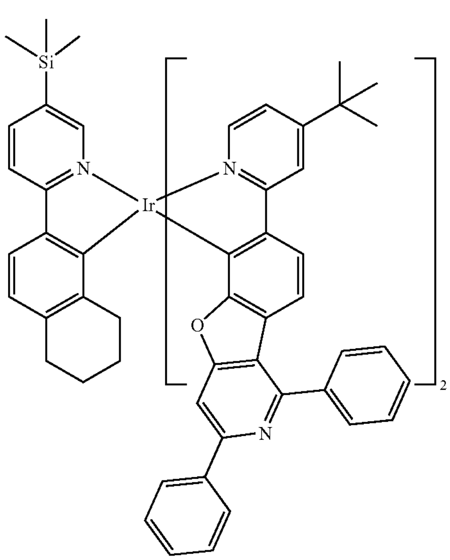
-continued
4821
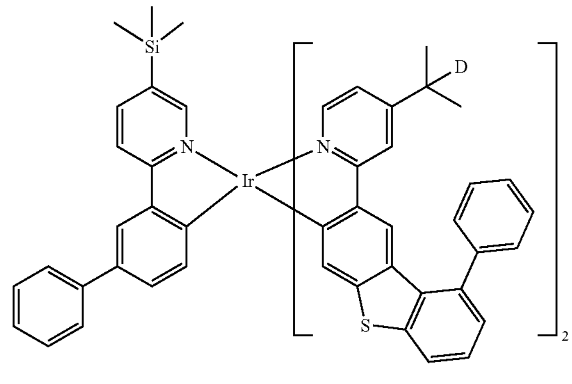
4822
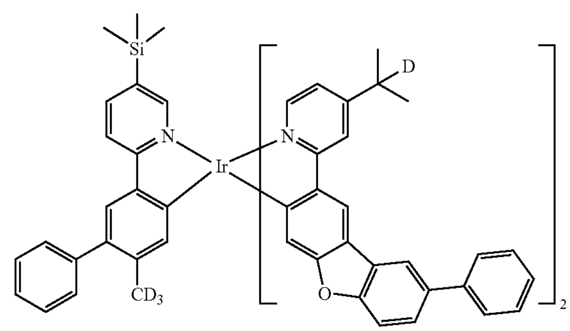
4823
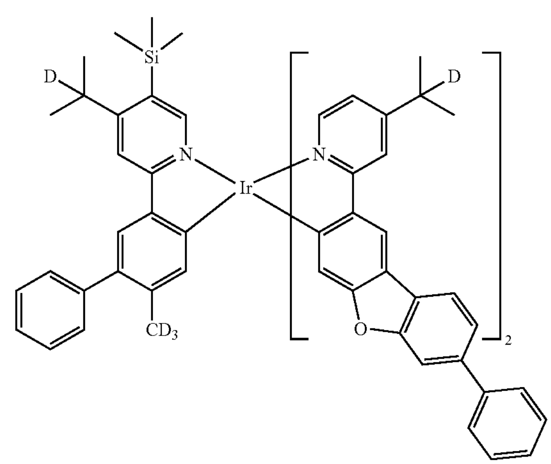

4824
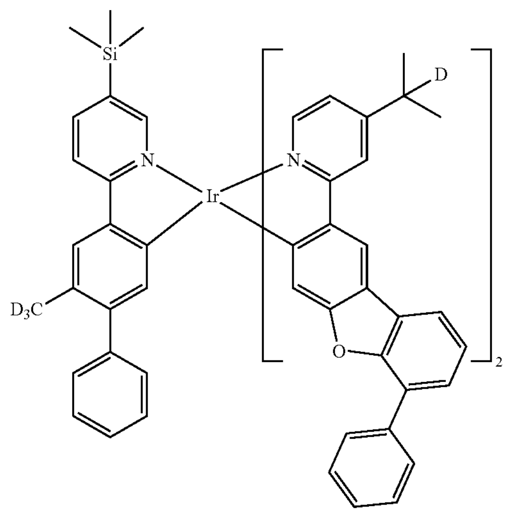
4825
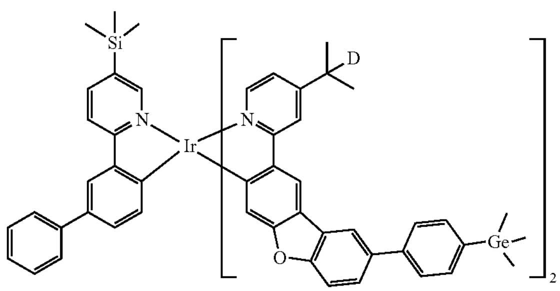
4826
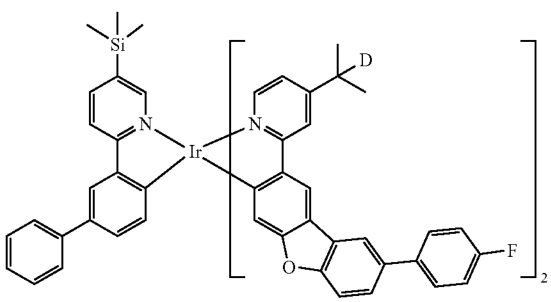
4827
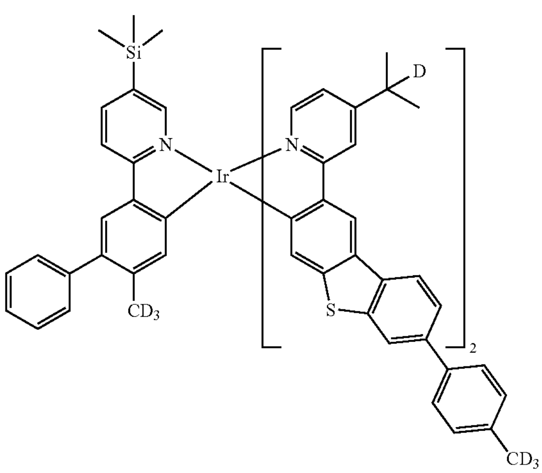
4828
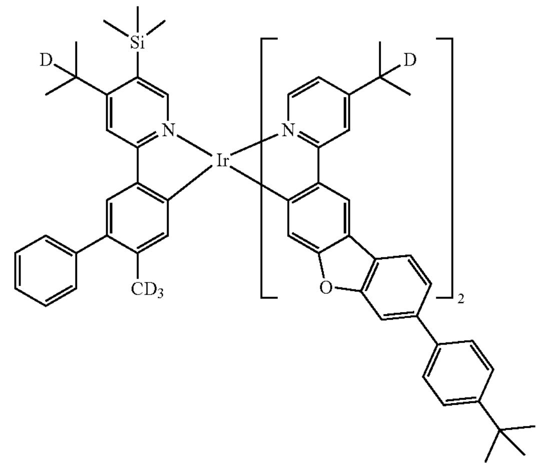
4829
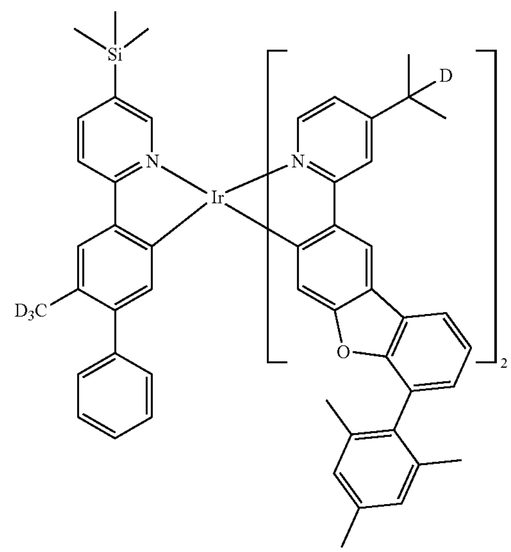
4830
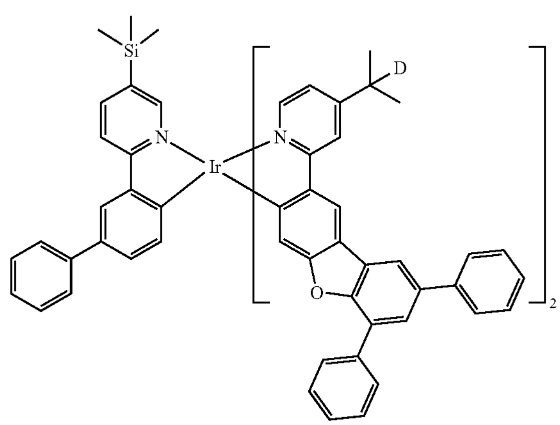

-continued
4831
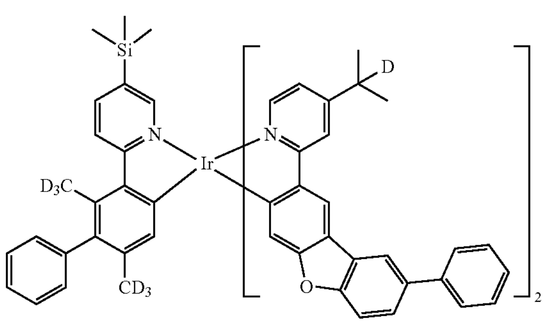
4832
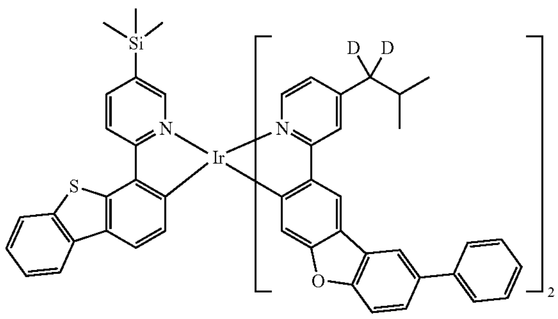
4833
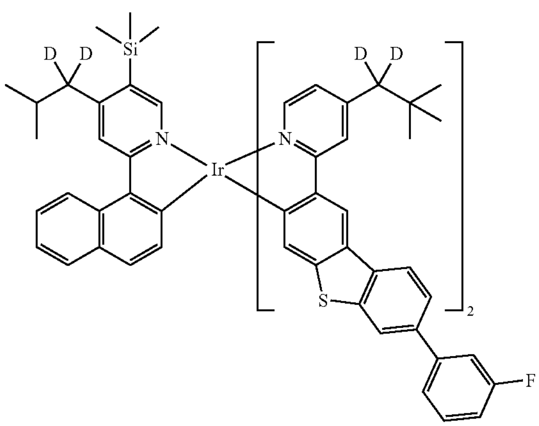
4834
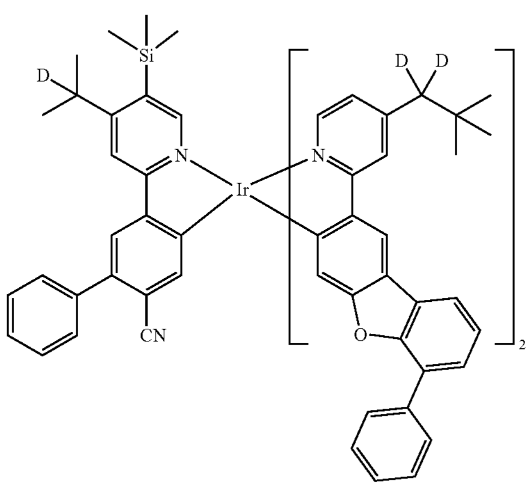
-continued
4835
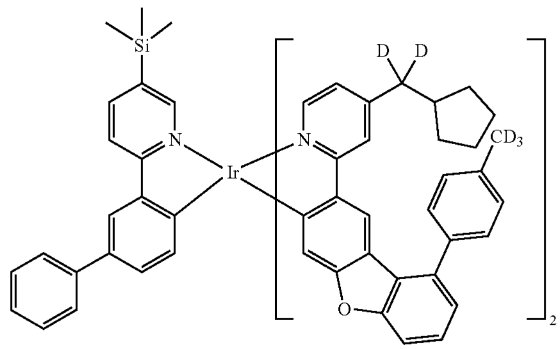
4836
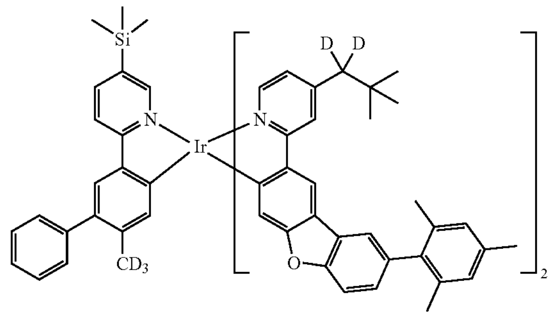
4837
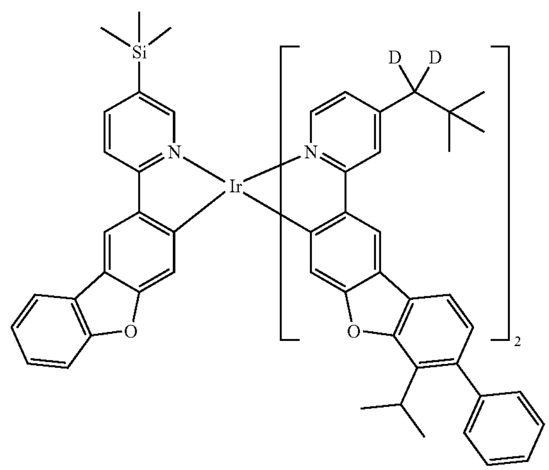
4838
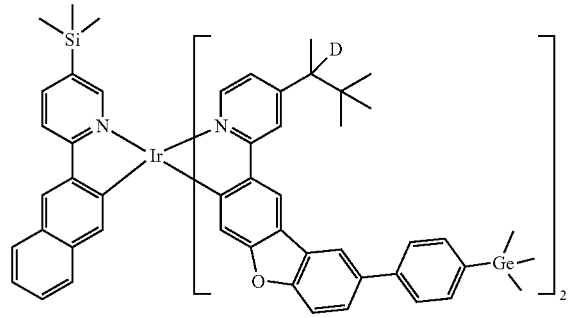

4839
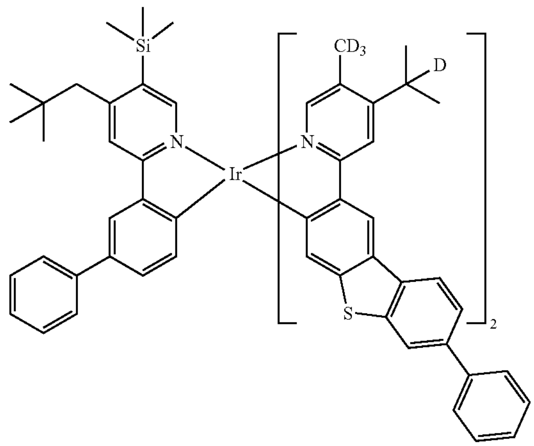
4840
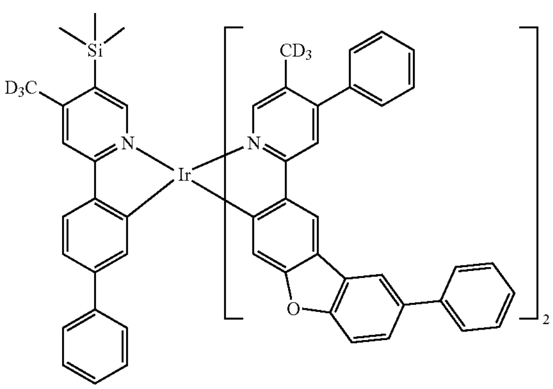
4841
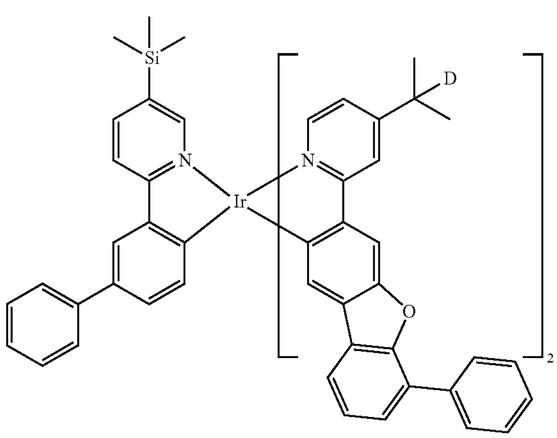
4842
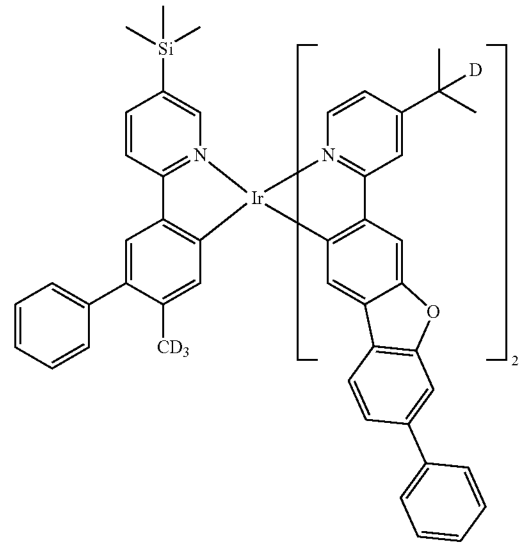
4843
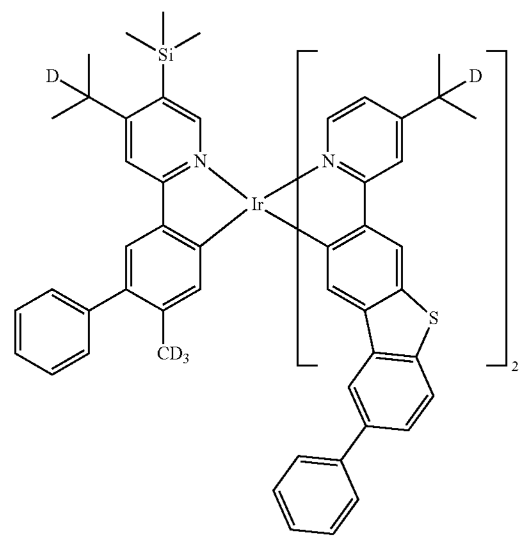
4844
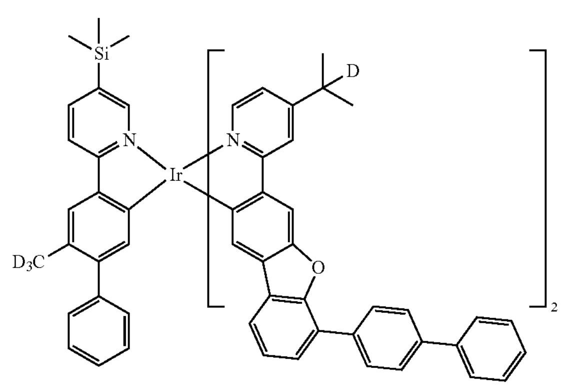

-continued
4845
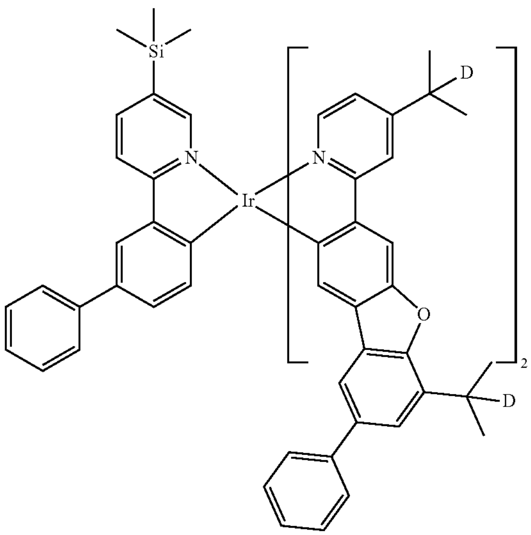
4846
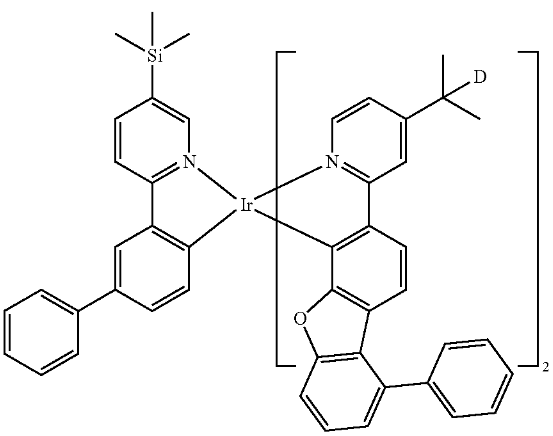
4847
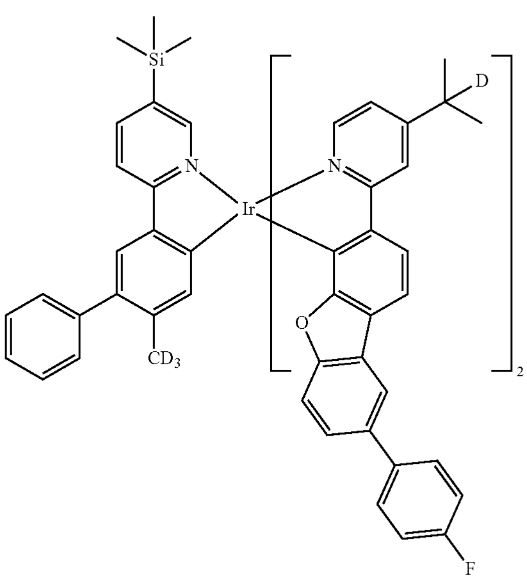
-continued
4848
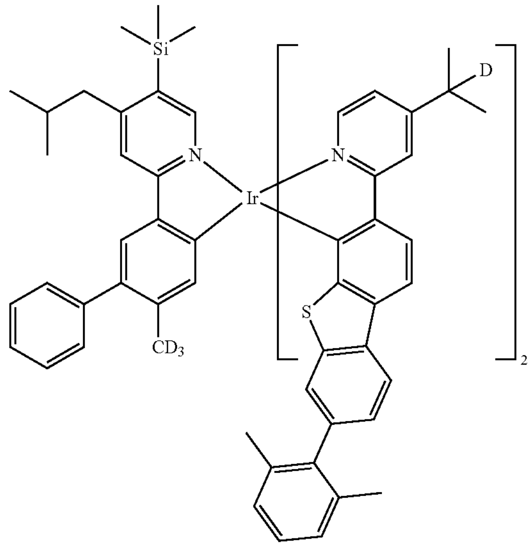
4849
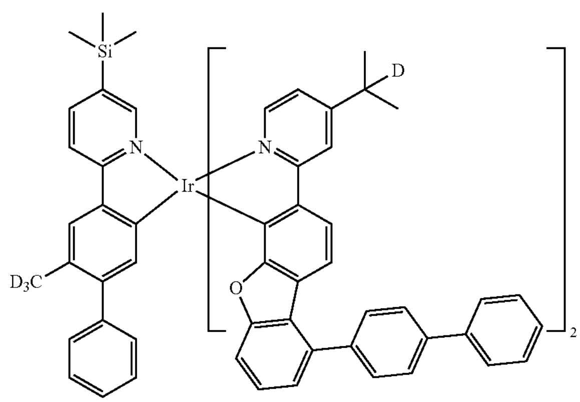
4850
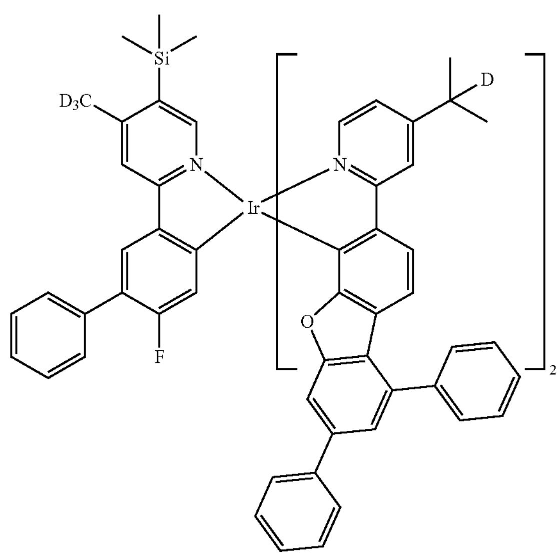

-continued
4851
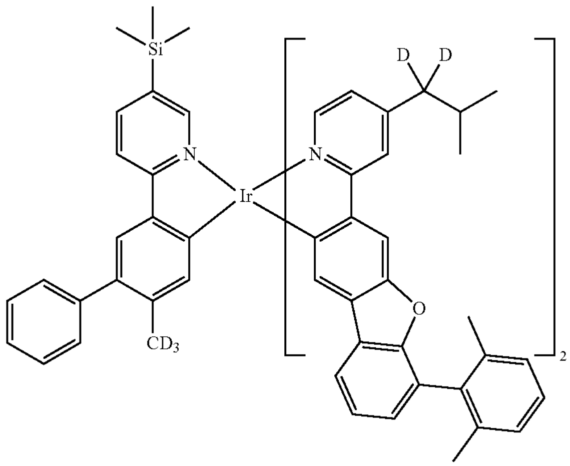
4852
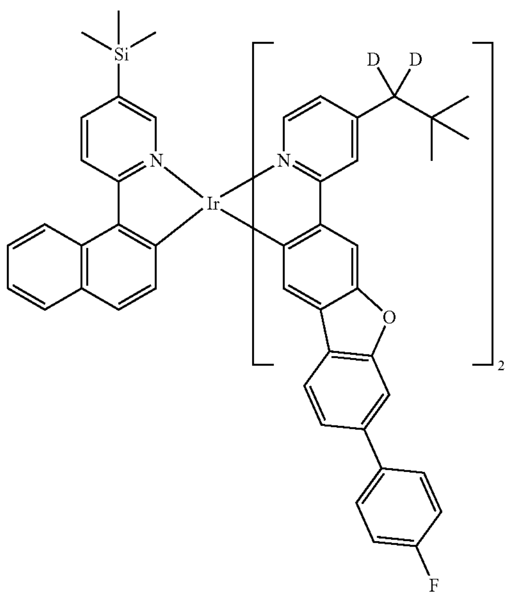
4853
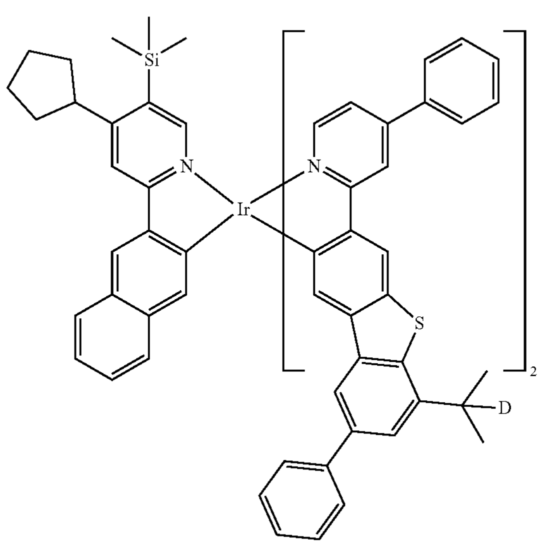
-continued
4854
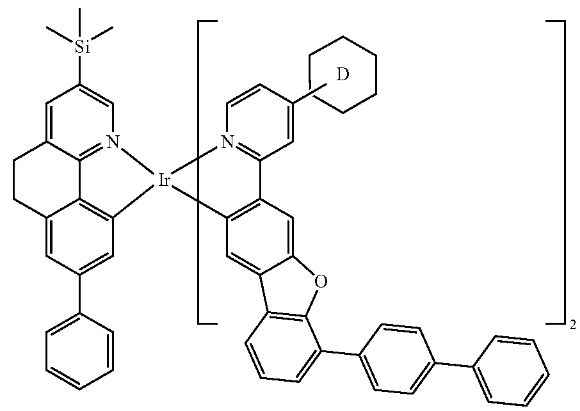
4855
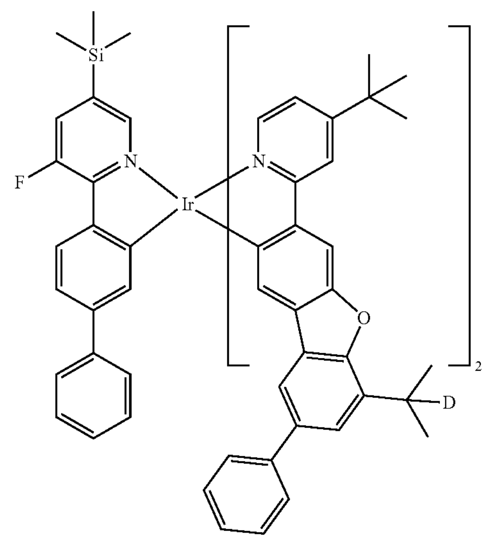
4856
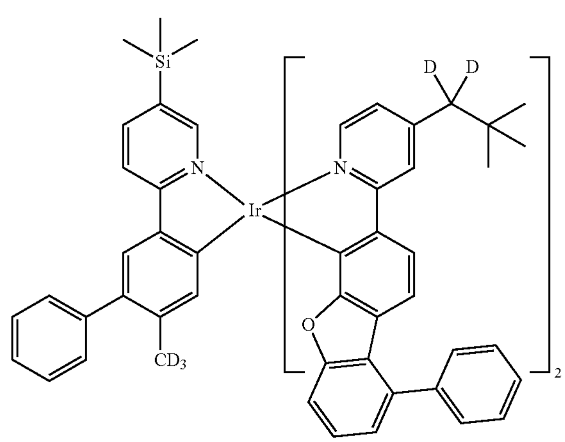

-continued
4857
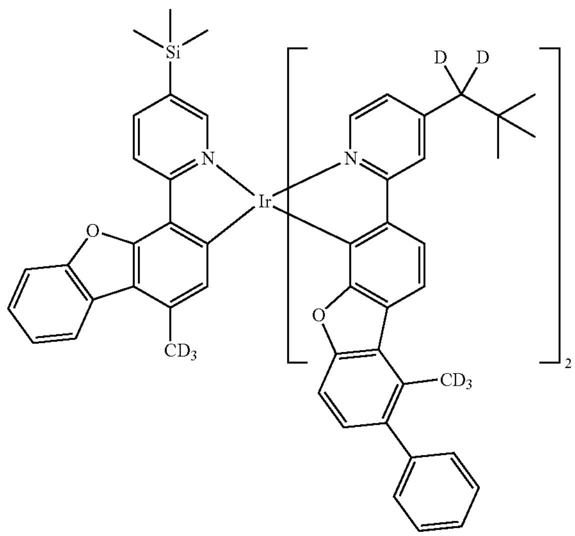
4858
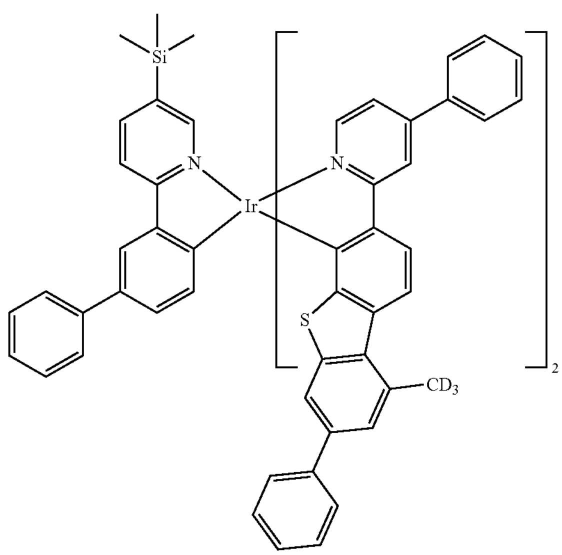
4859
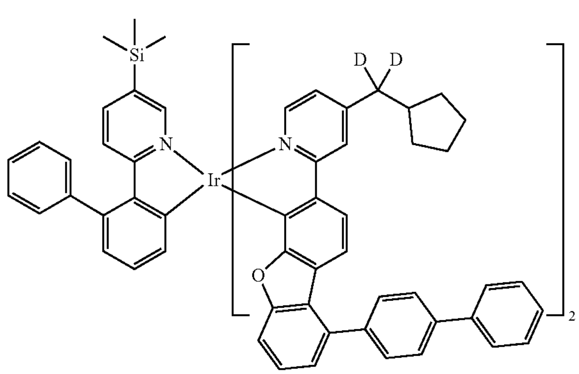
-continued
4860
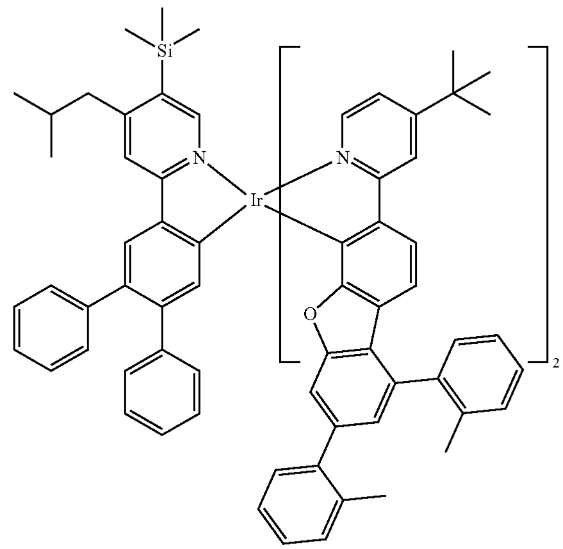
4861
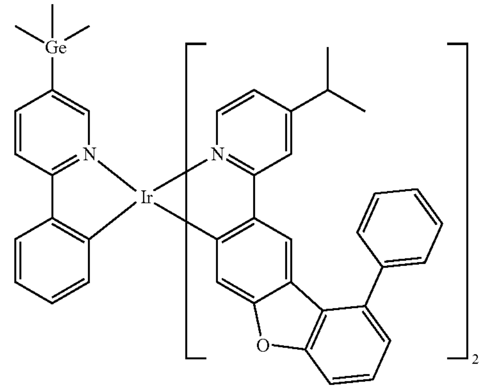
4862
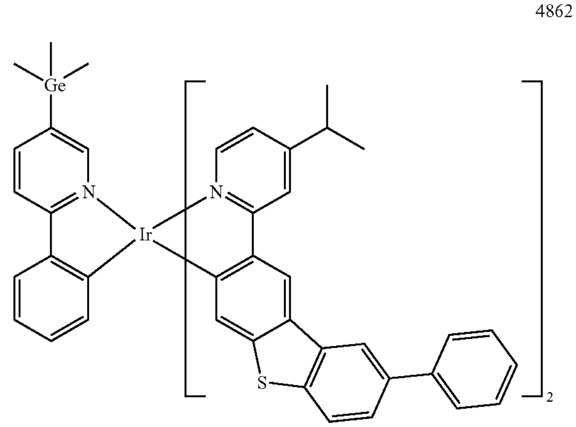

-continued
4863
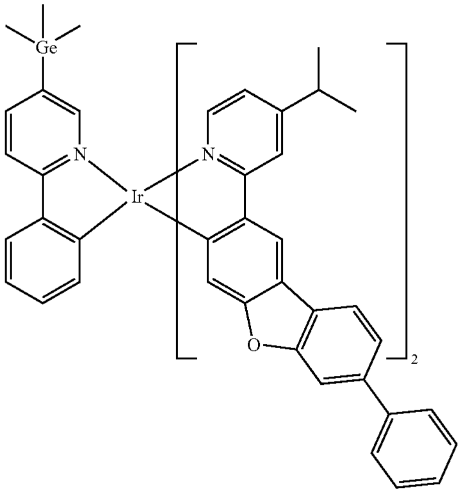
4864
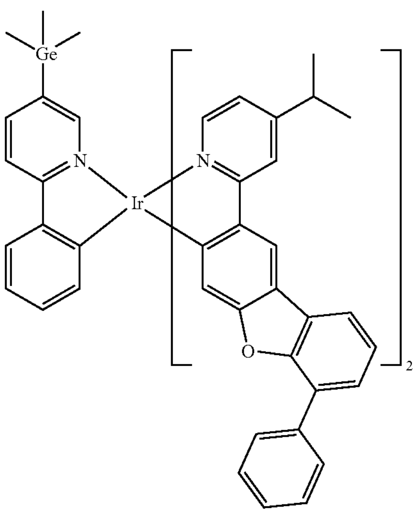
4865
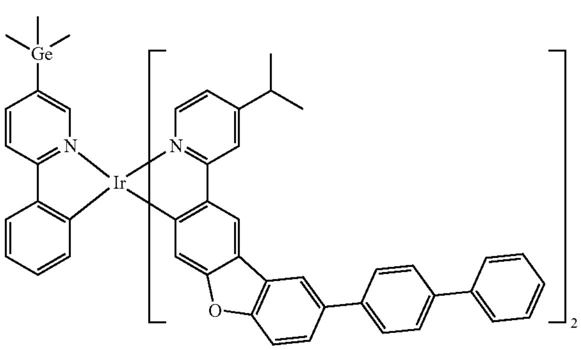
-continued
4866
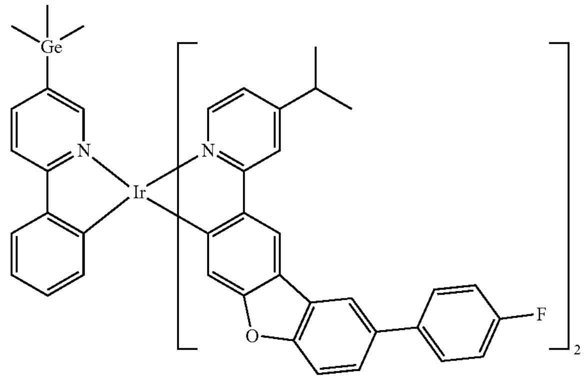
4867
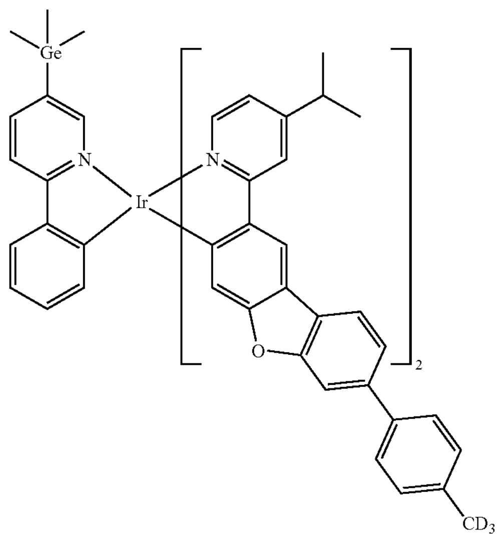
4868
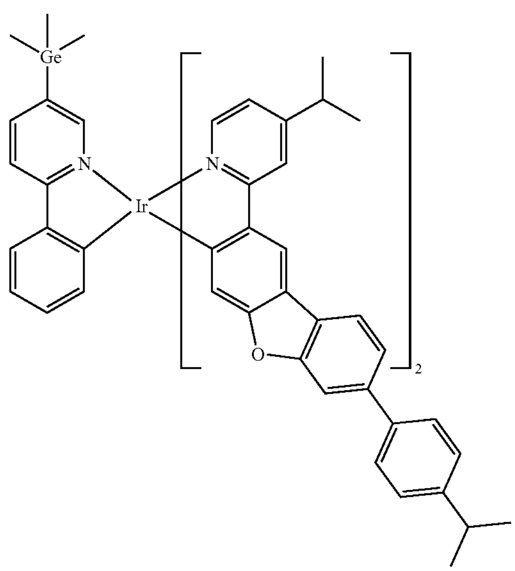

4869
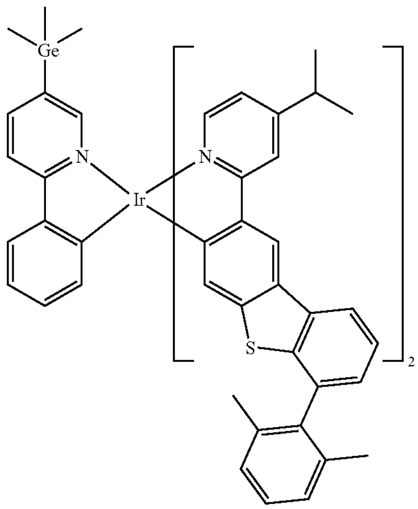
4870
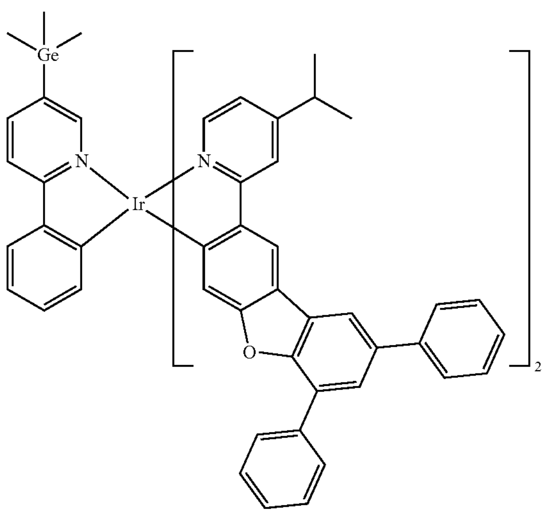
4871
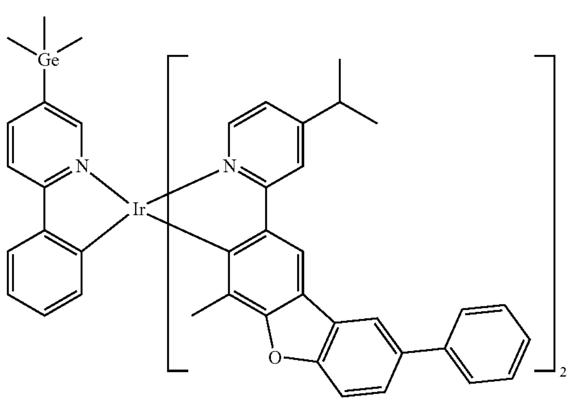
4872
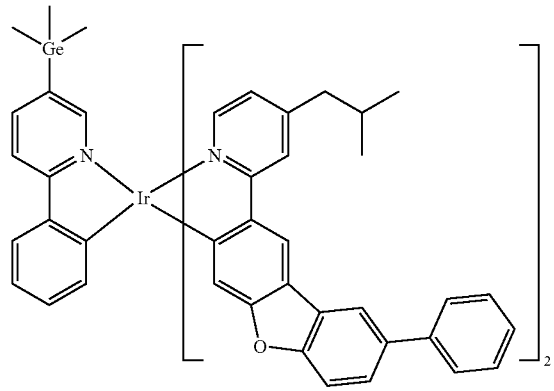
4873
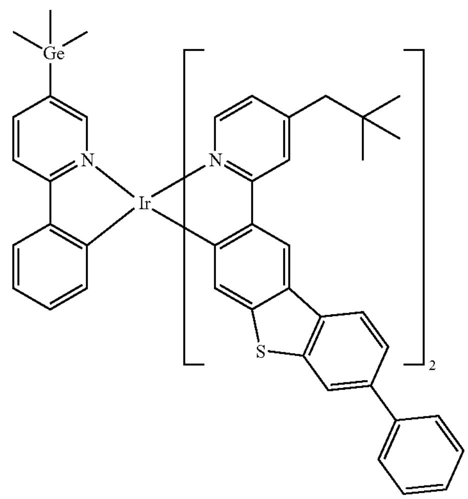
4874
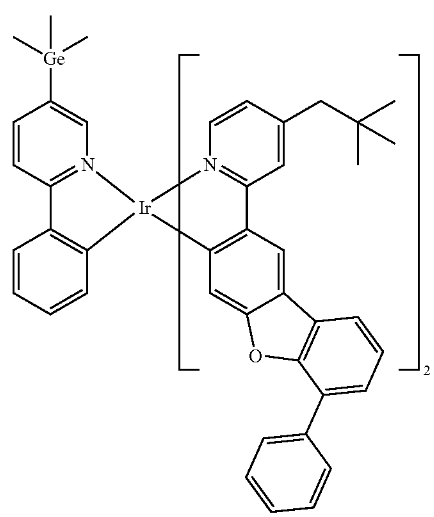

4875
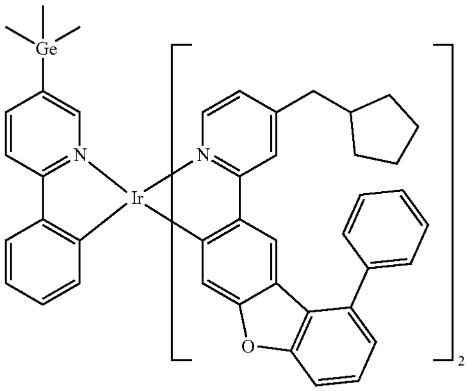
4876
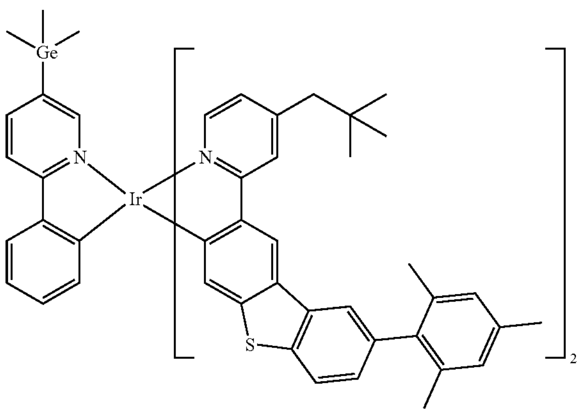
4877
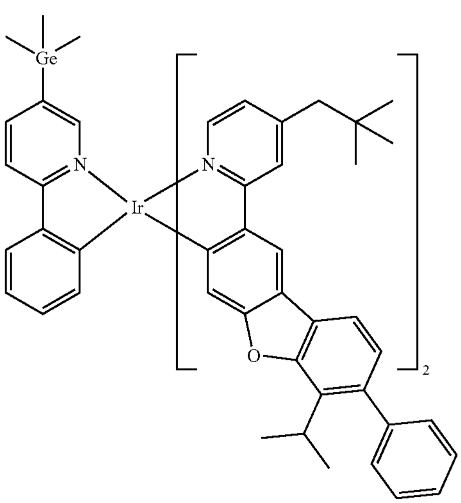
4878
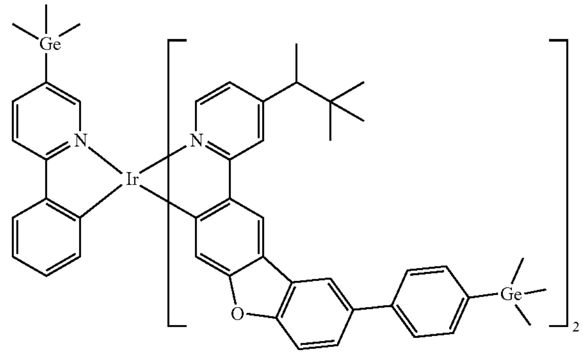
4879
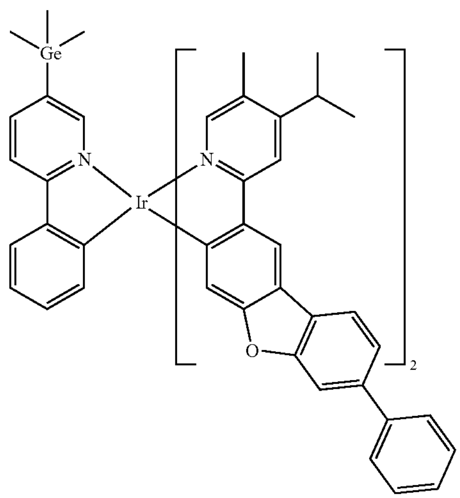
4880
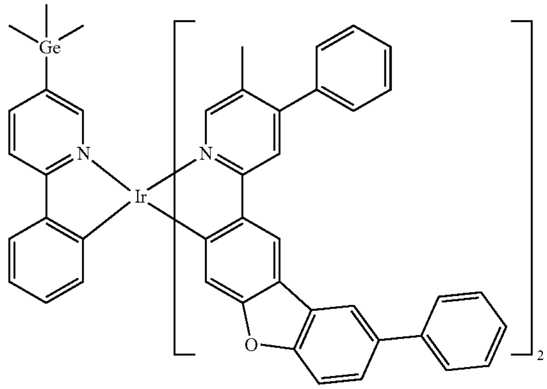

-continued
4881
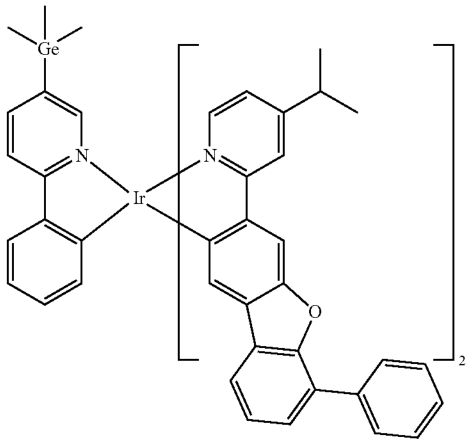
4882
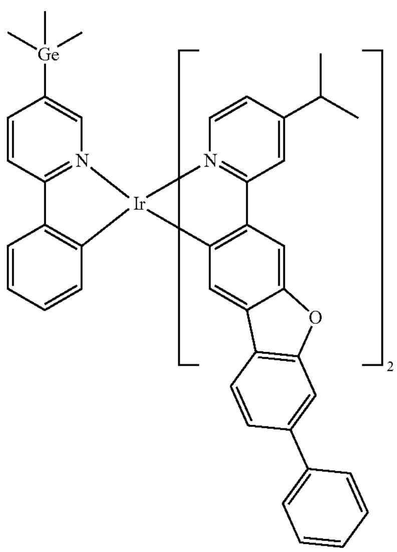
4883
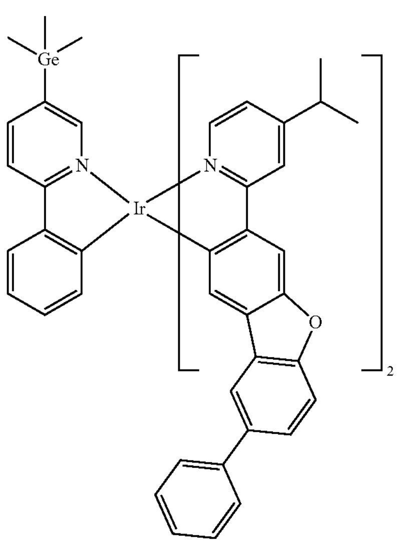
-continued
4884
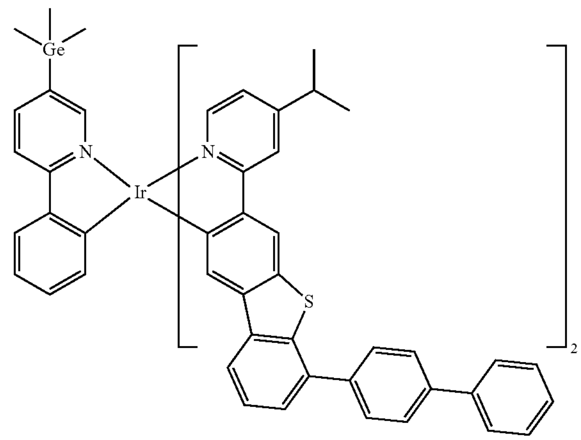
4885
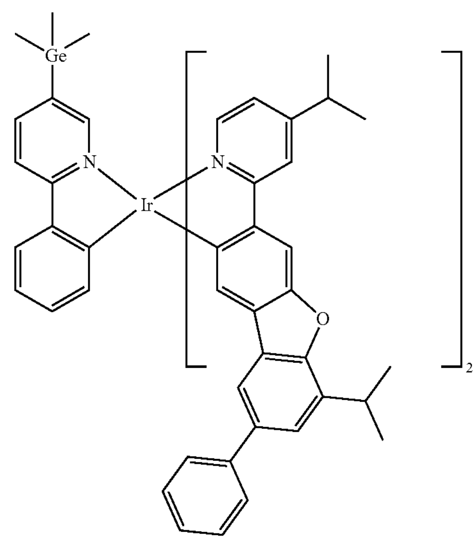
4886
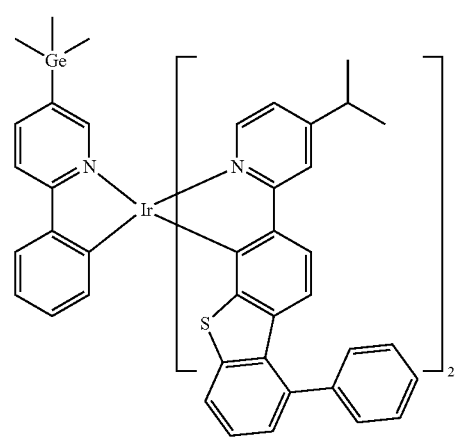

-continued
4887
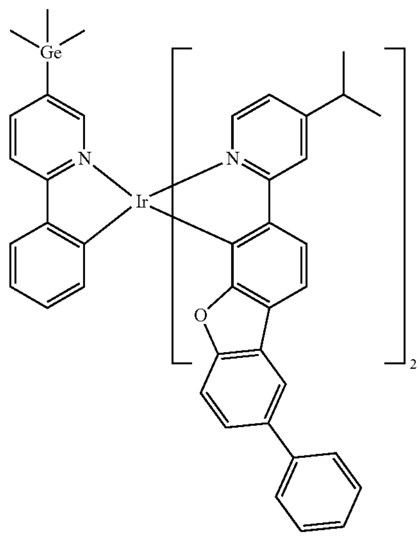
4888
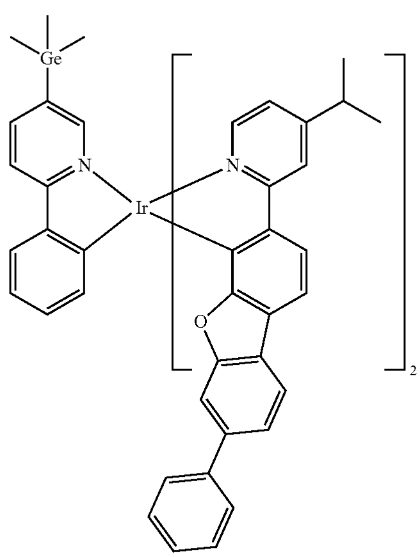
4889
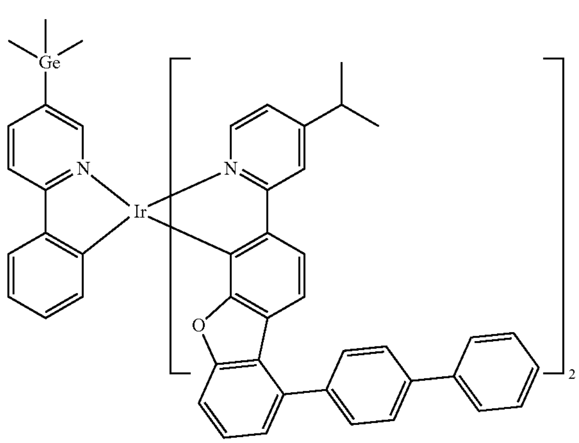
-continued
4890
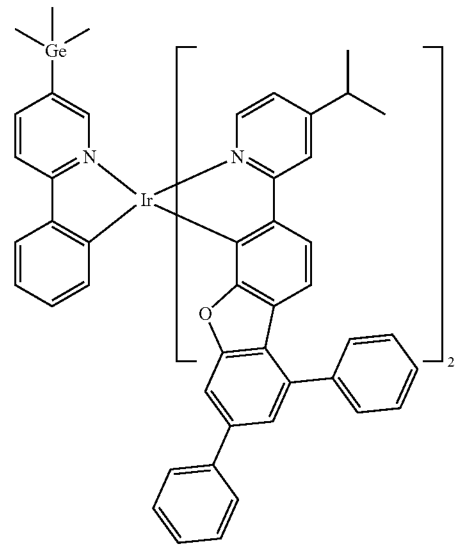
4891
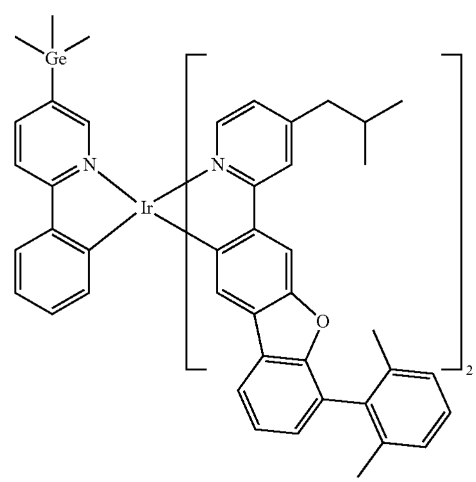
4892
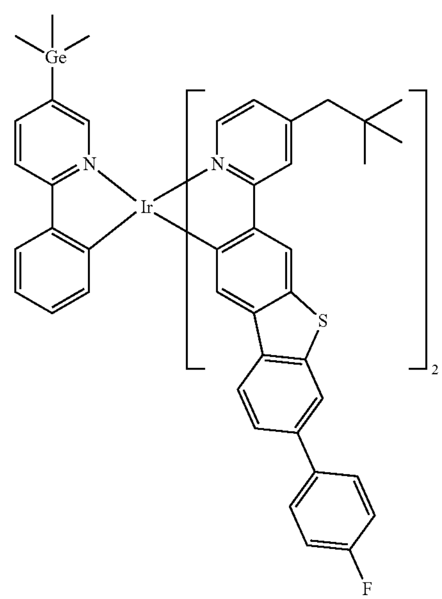

-continued
4893
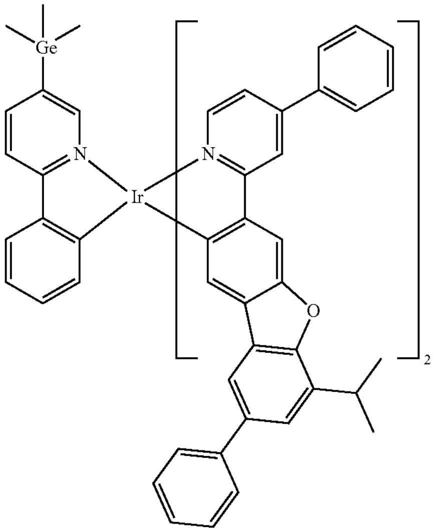
4894
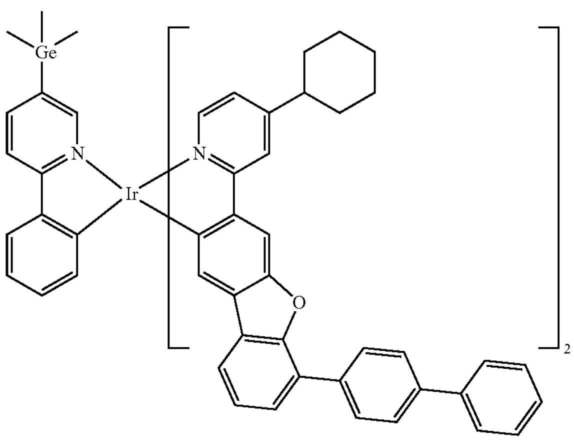
4895
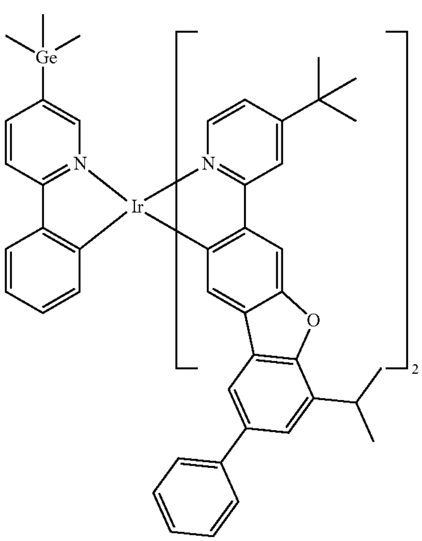
-continued
4896
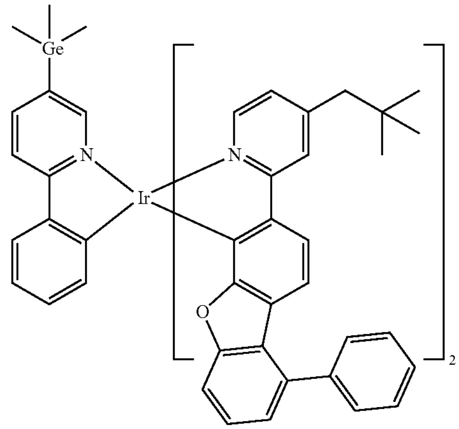
4897
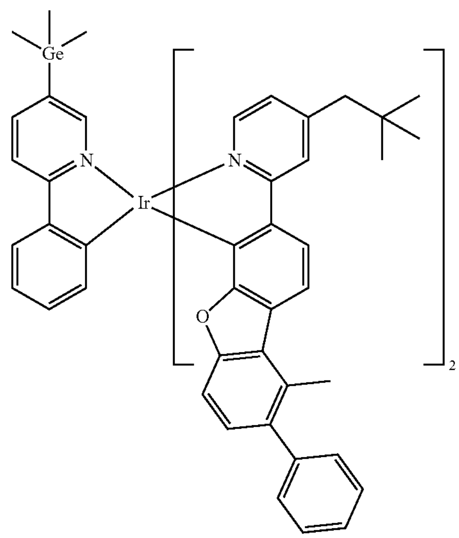
4898
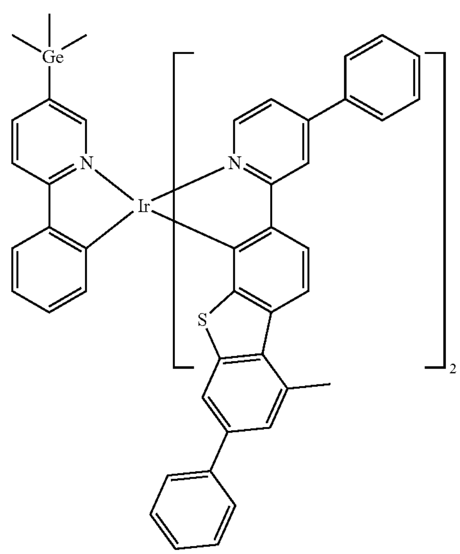

-continued
4899
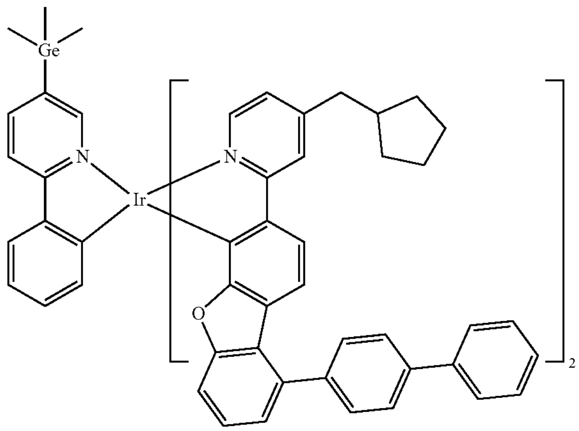
4900
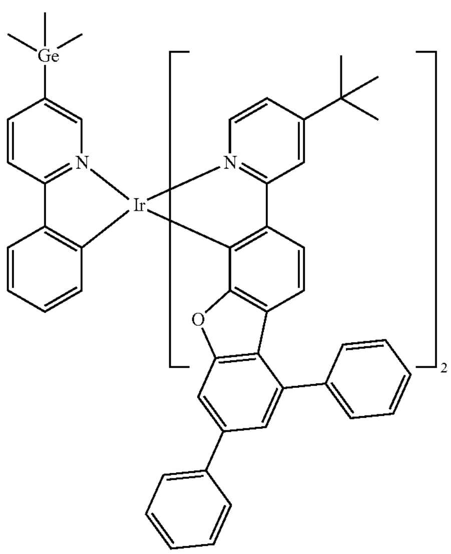
4901
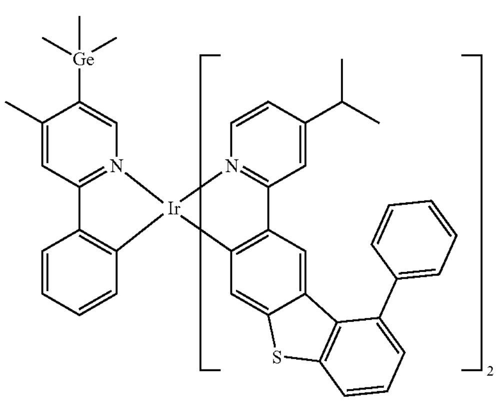
-continued
4902
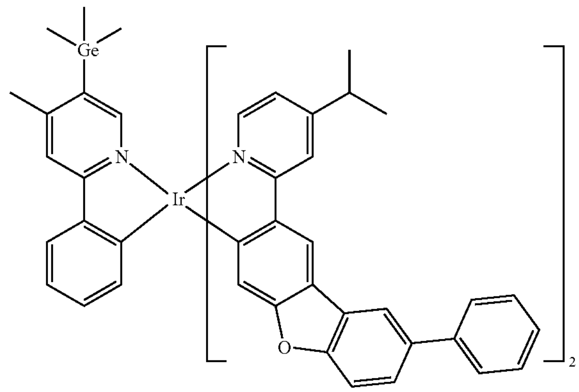
4903
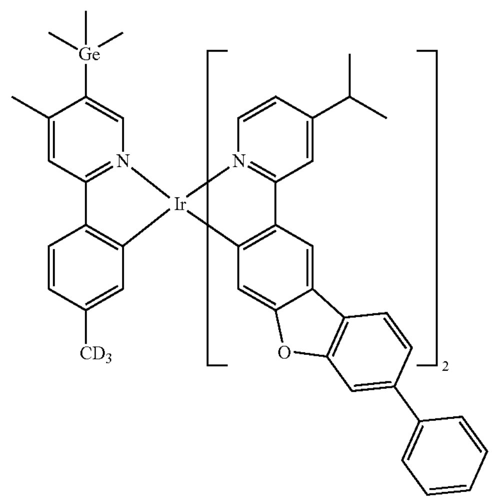
4904
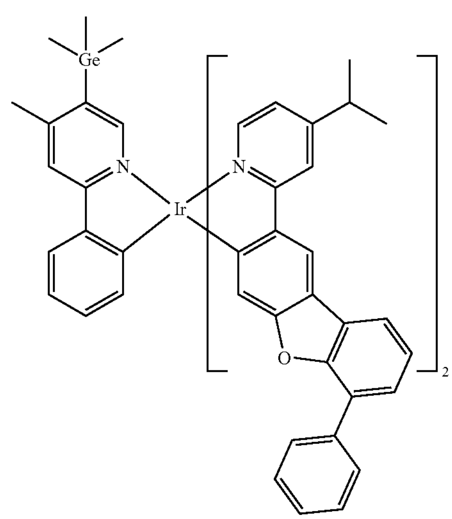

-continued
4905
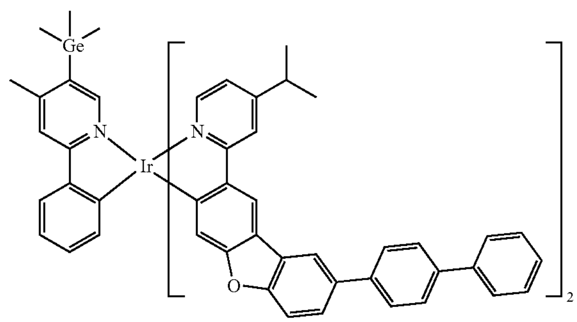
4906
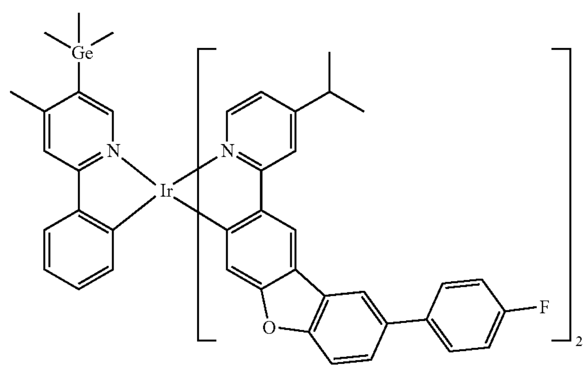
4907
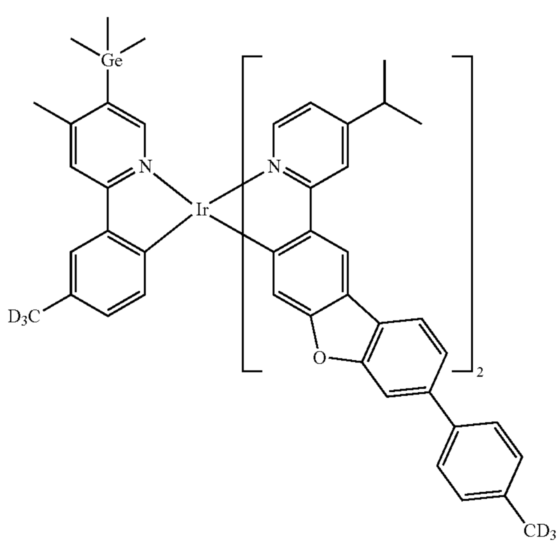
-continued
4908
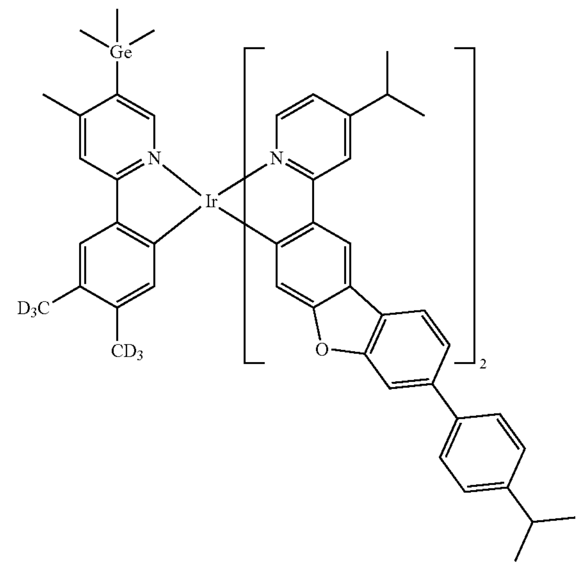
4909
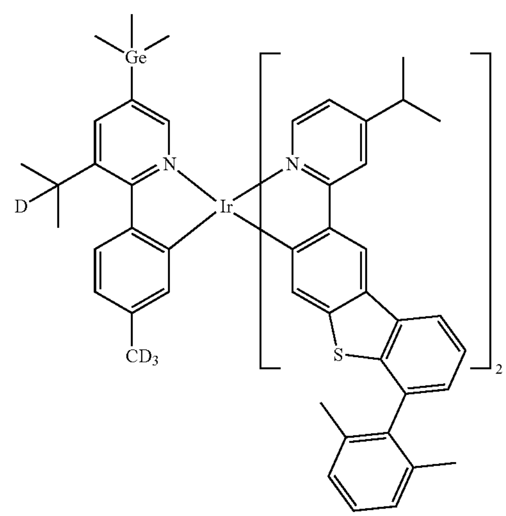
4910
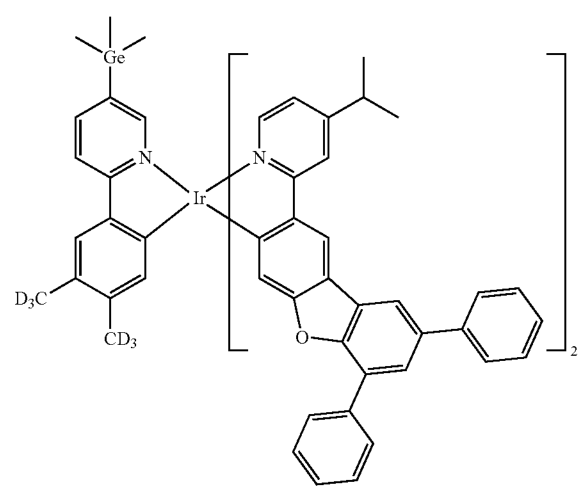

-continued
4911
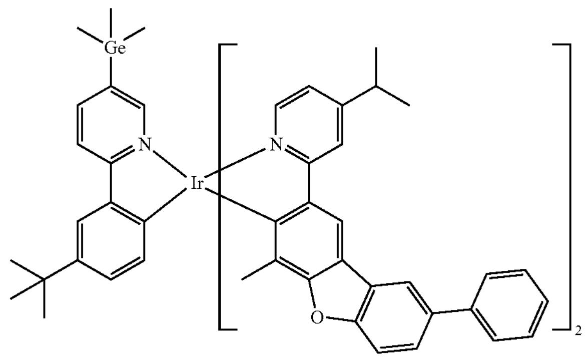
4912
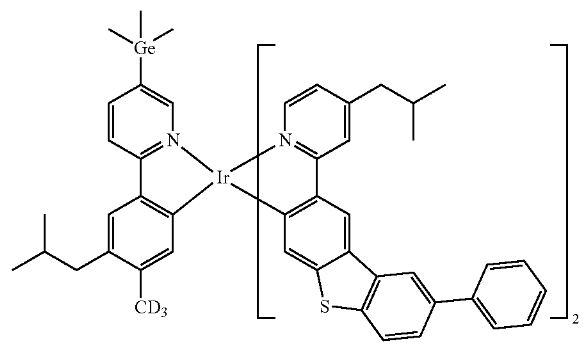
4913
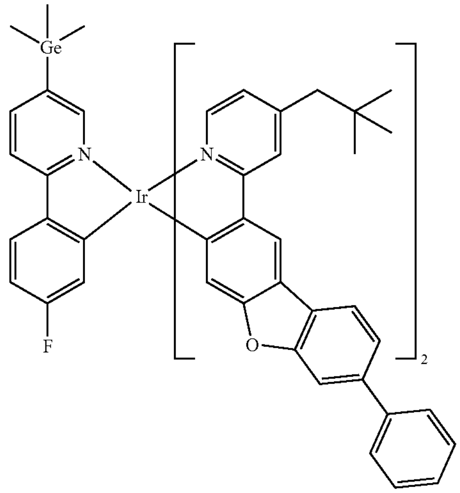
-continued
4914
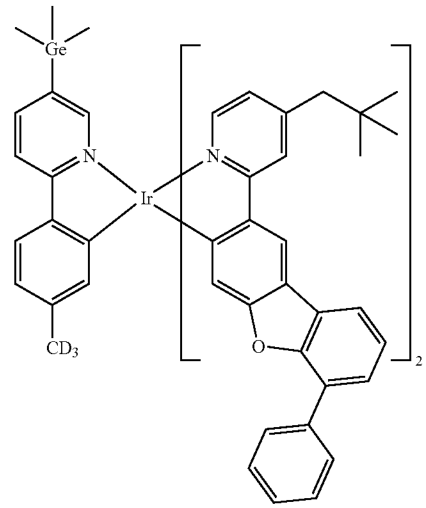
4915
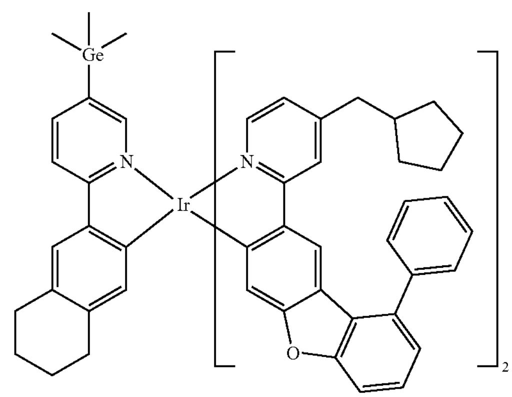
4916
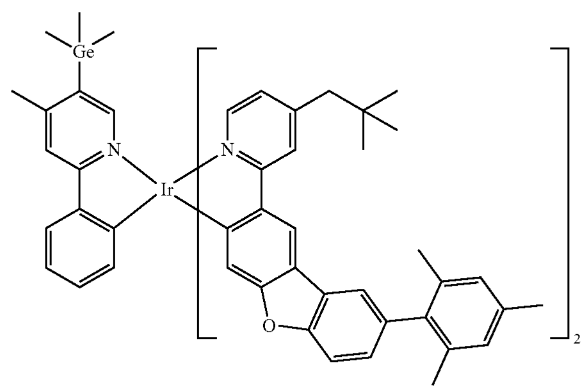

-continued
4917
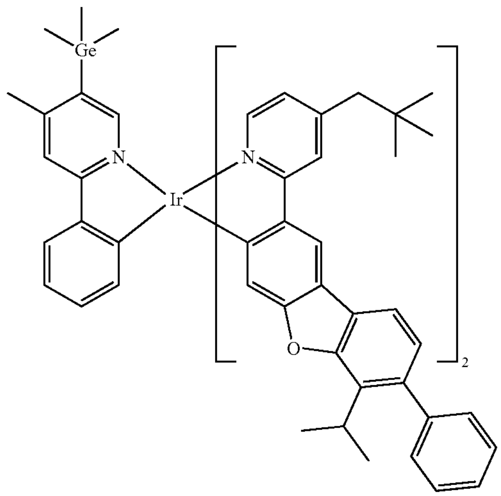
4918
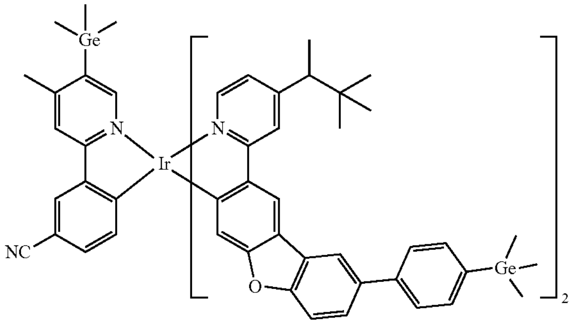
4919
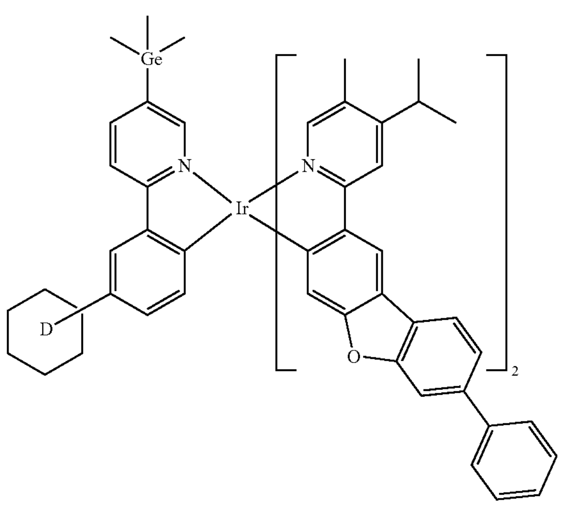
-continued
4920
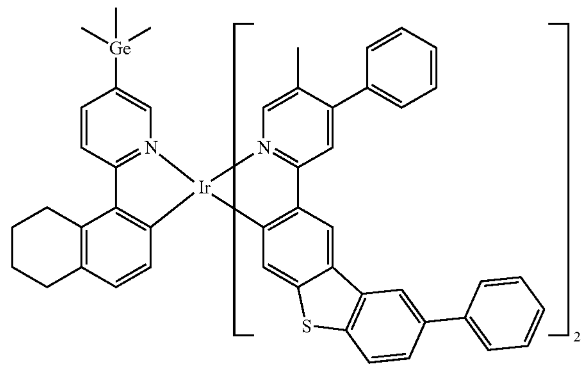
4921
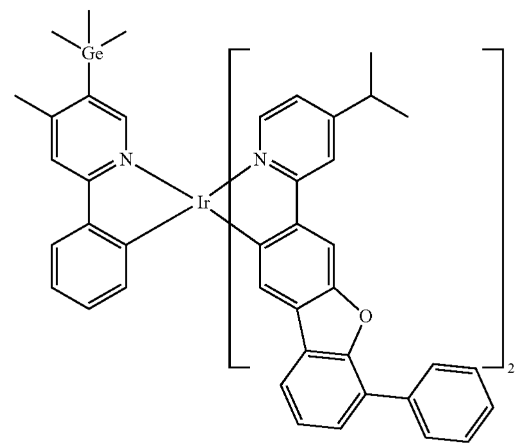
4922
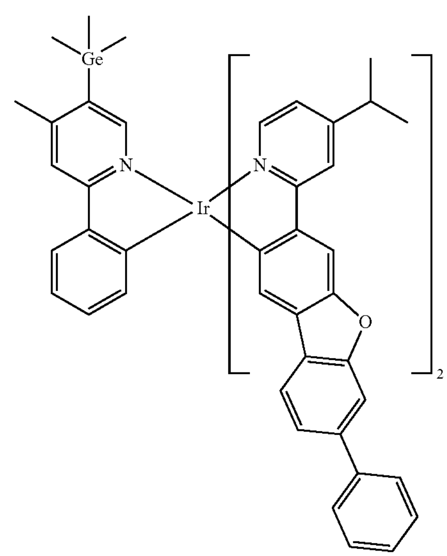

-continued
4923
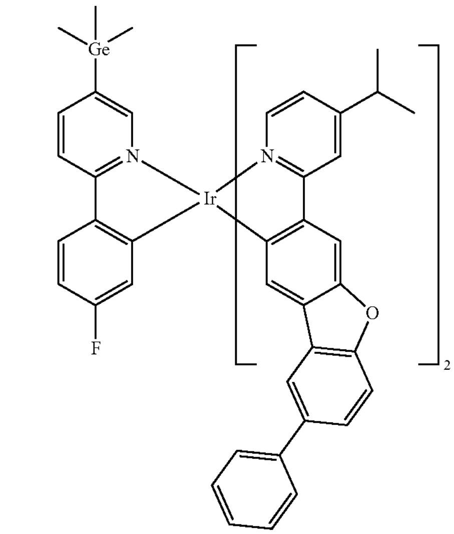
4924
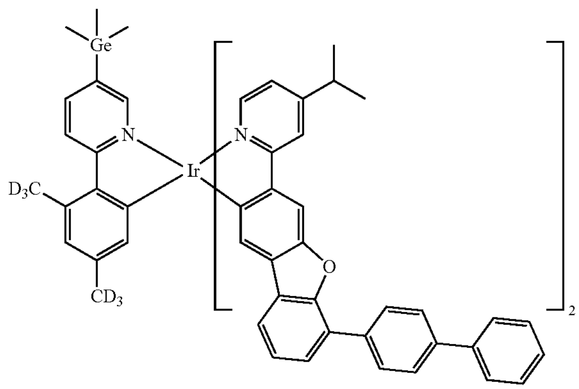
4925
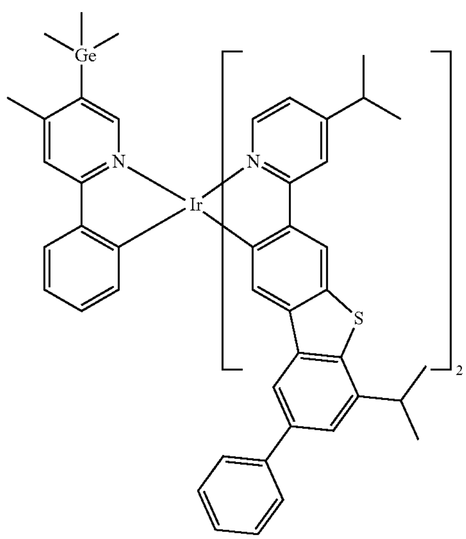
-continued
4926
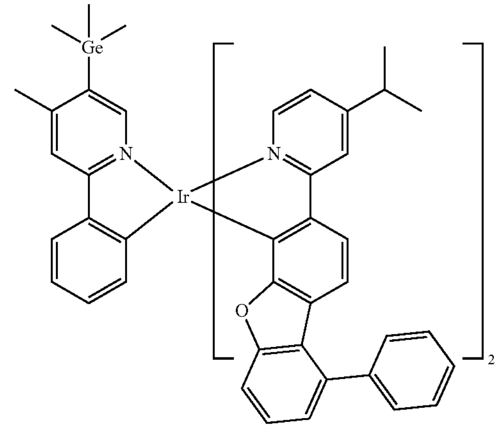
4927
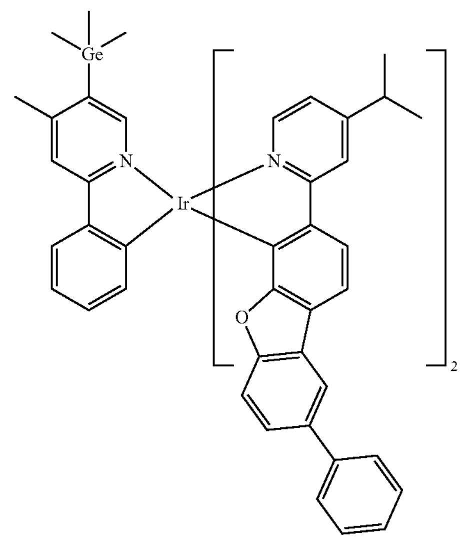
4928
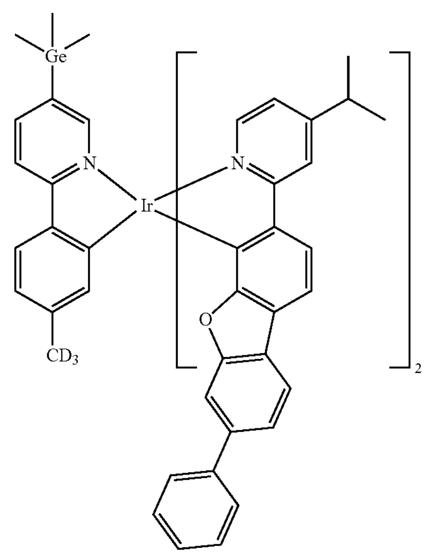

-continued
4929
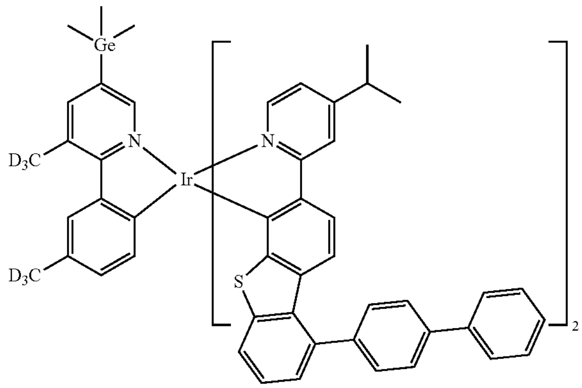
4930
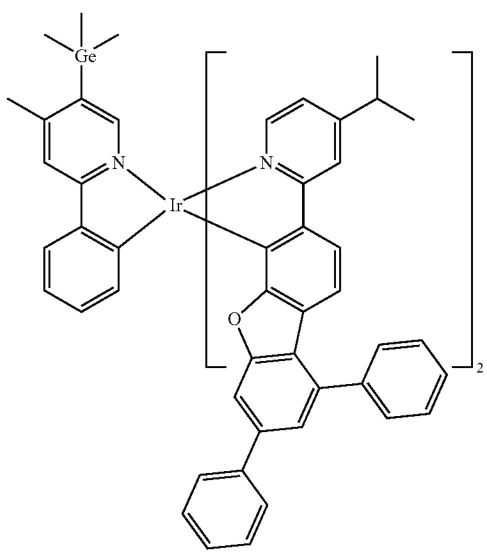
4931
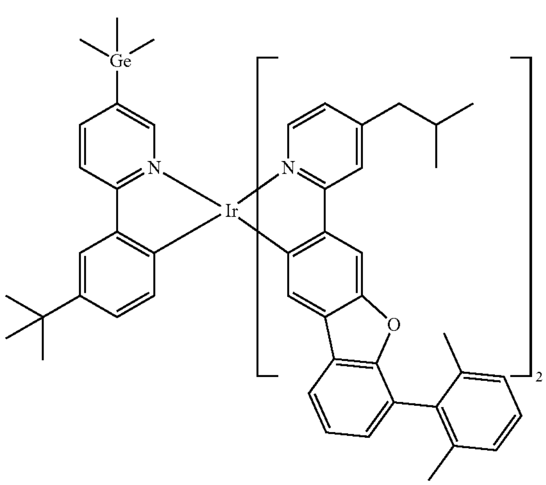
4932
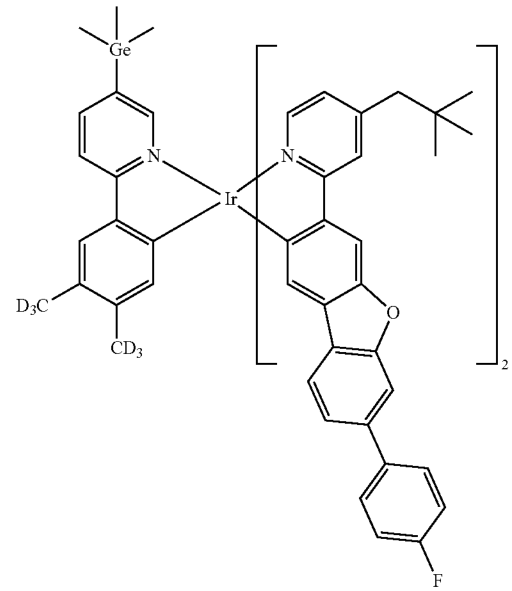
4933
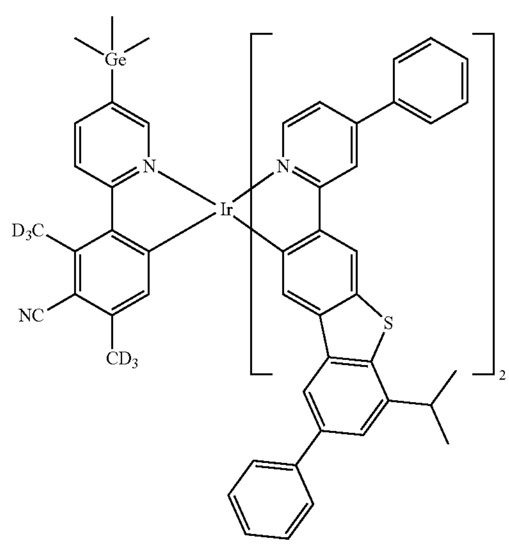
4934
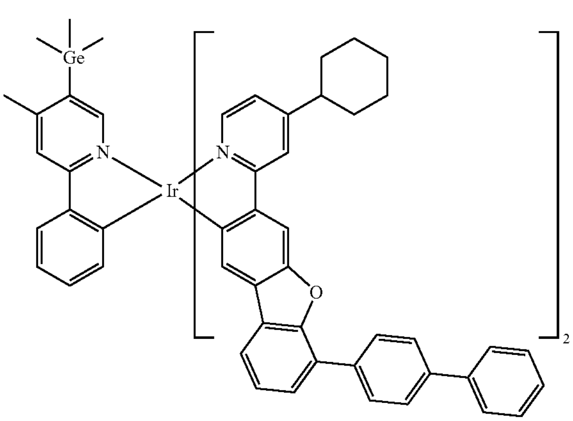

4935
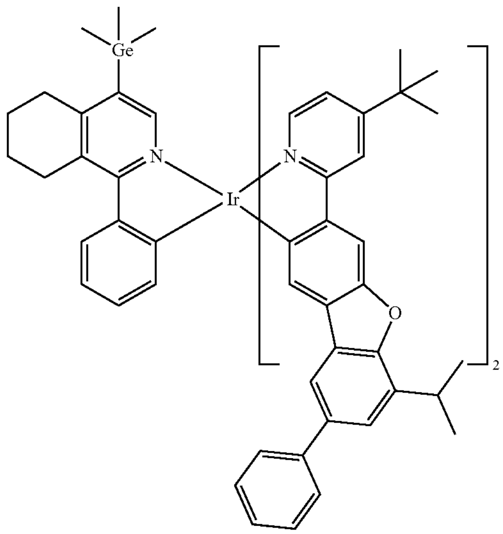
4936
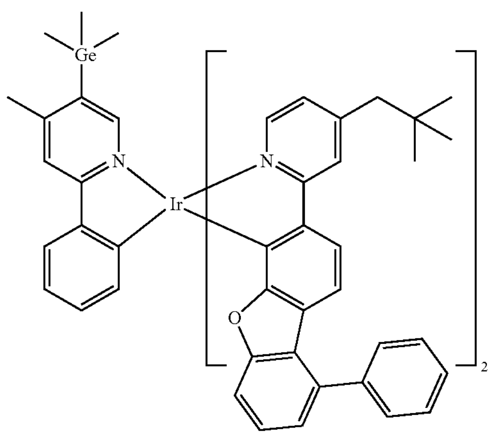
4937
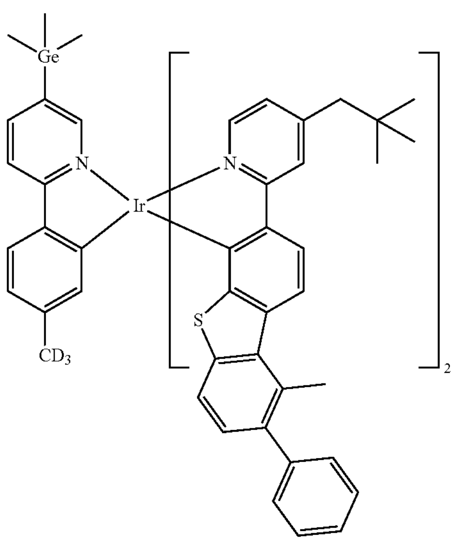
4938
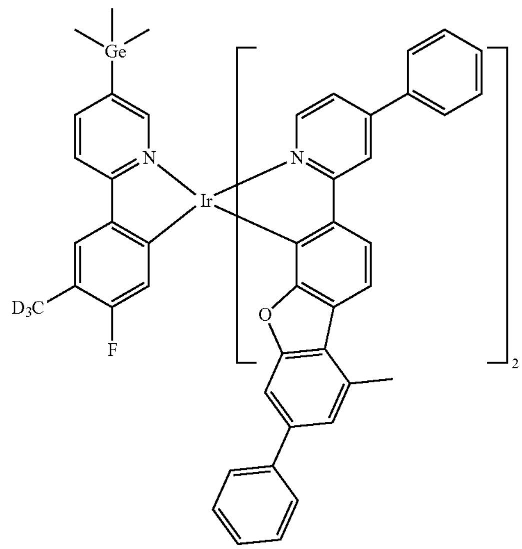
4939
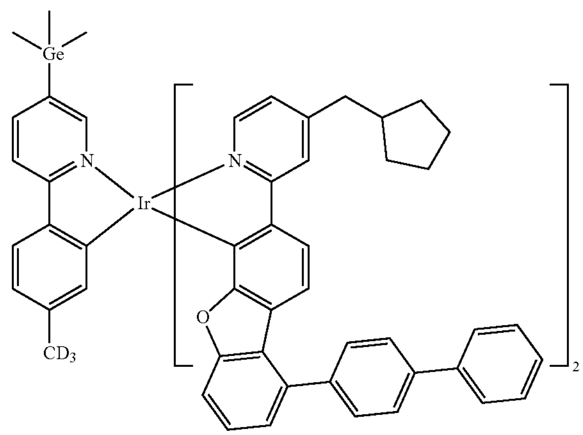
4940
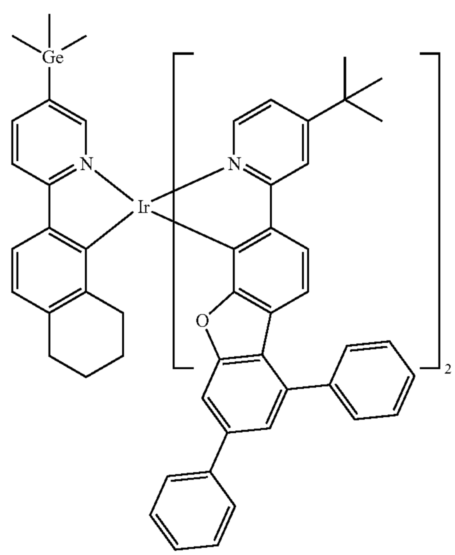

-continued
4941
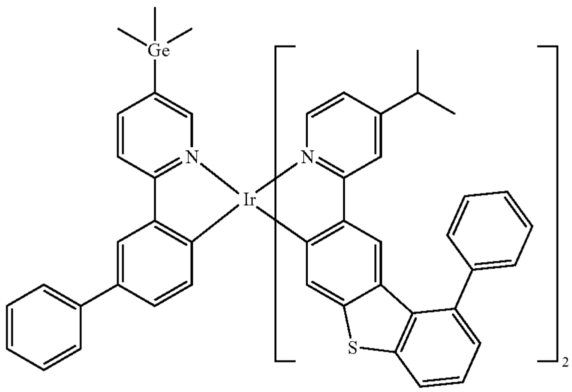
4942
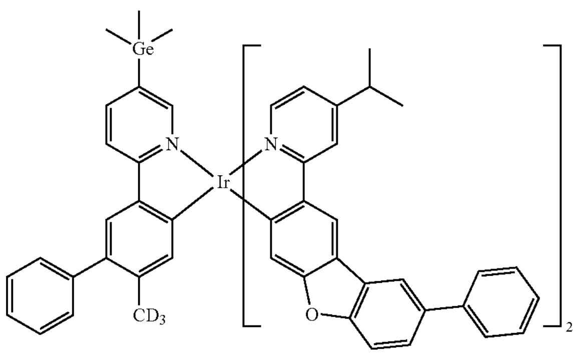
4943
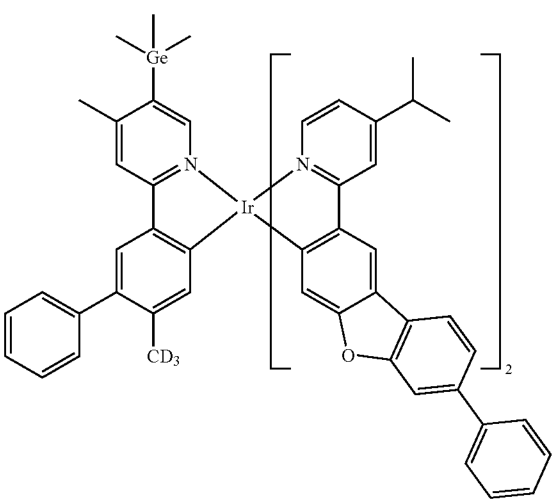
-continued
4944
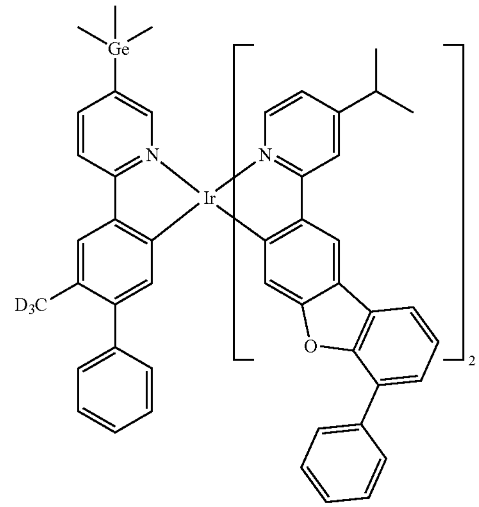
4945
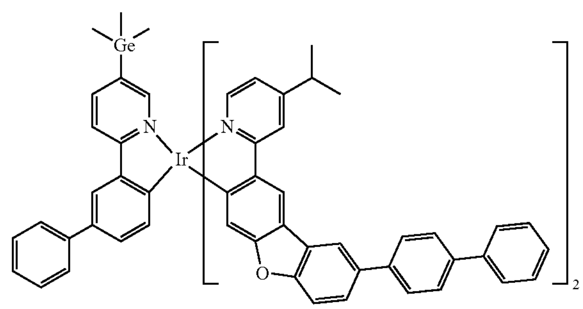
4946
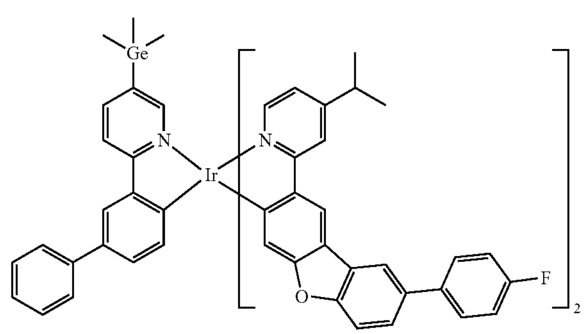

-continued
4947
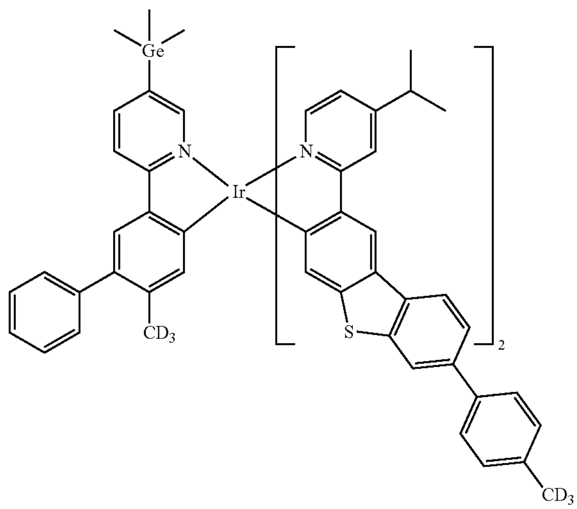
4948
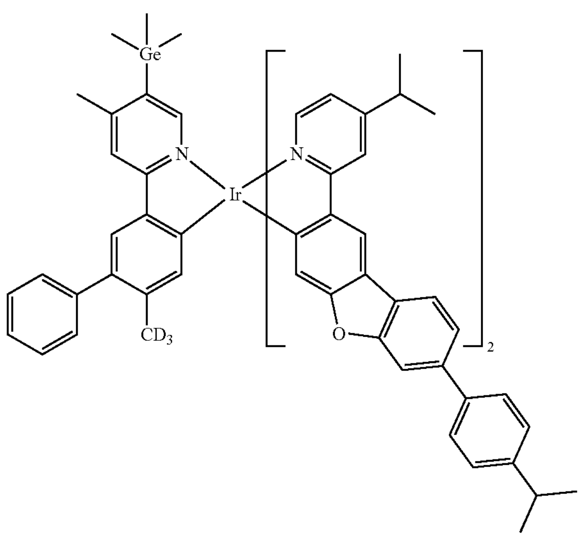
4949
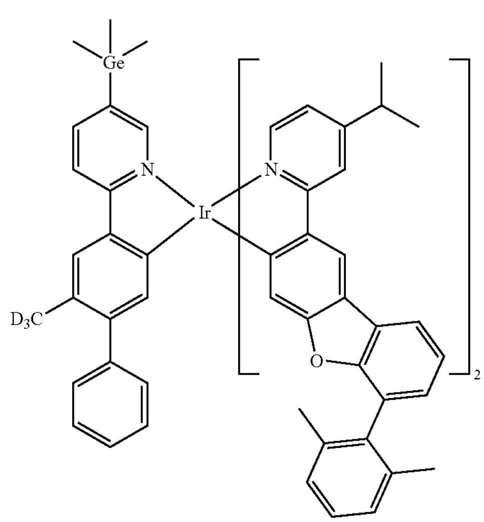
-continued
4950
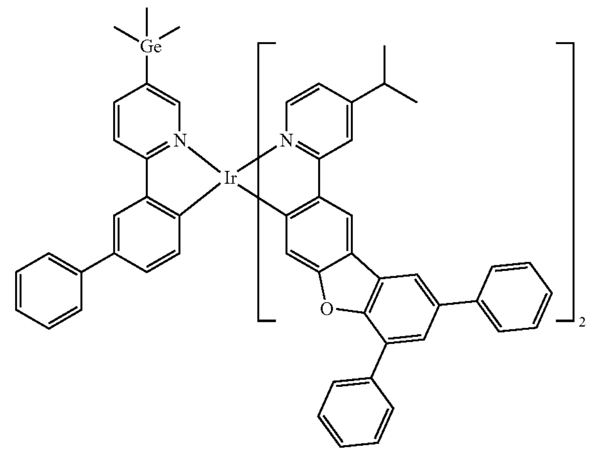
4951
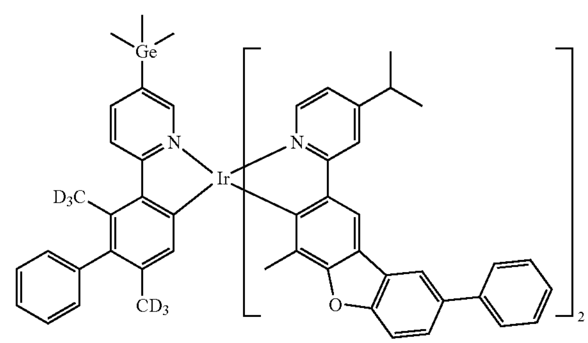
4952
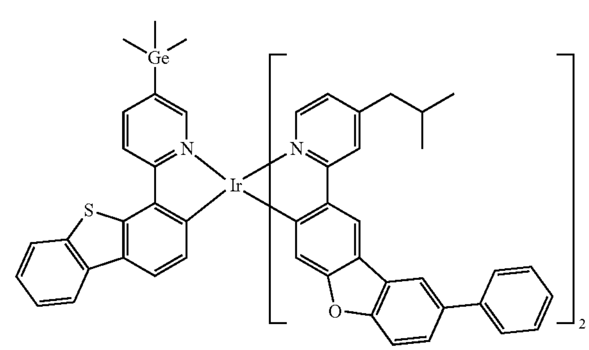

-continued
4953
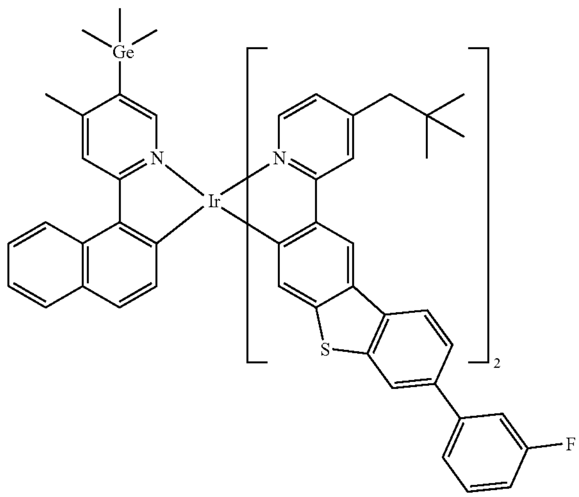
4954
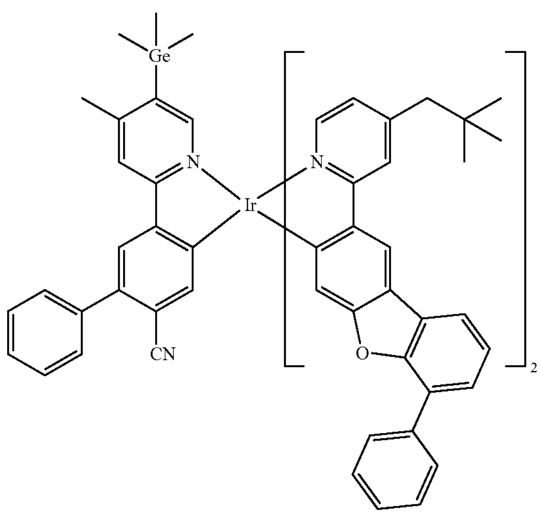
4955
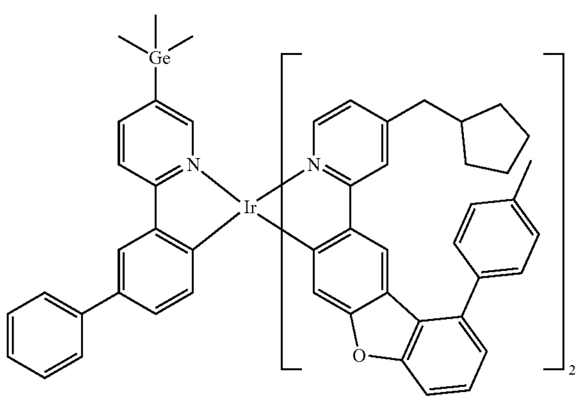
-continued
4956
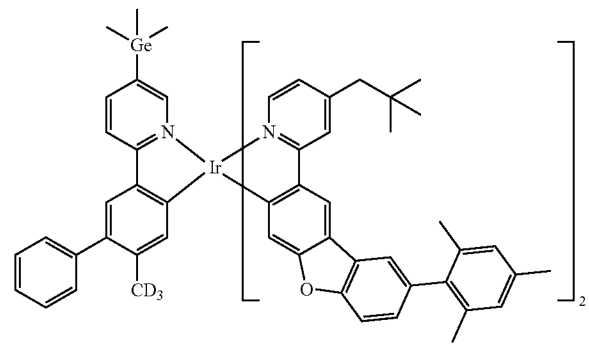
4957
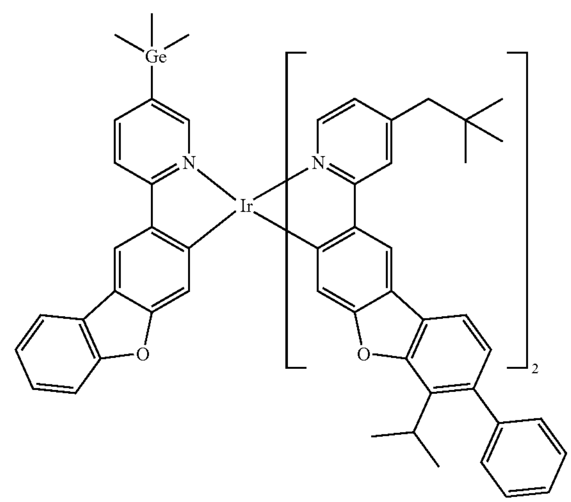
4958
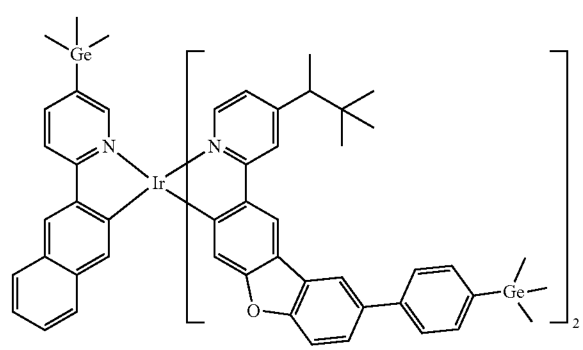

-continued
4959
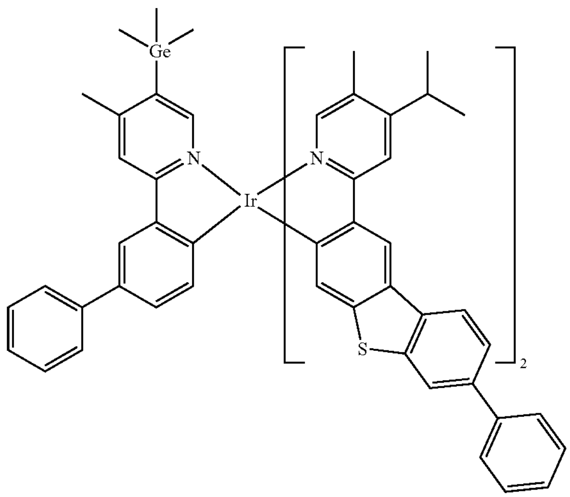
4960
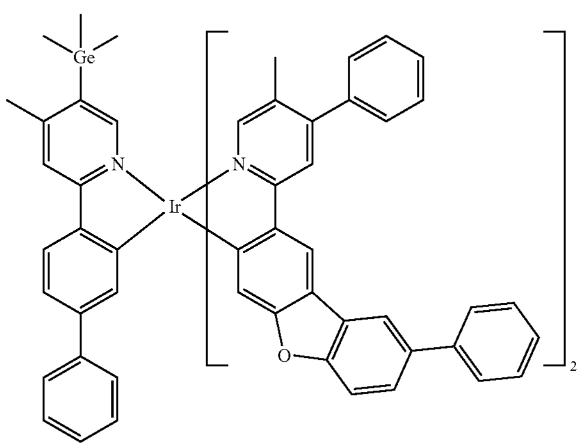
4961
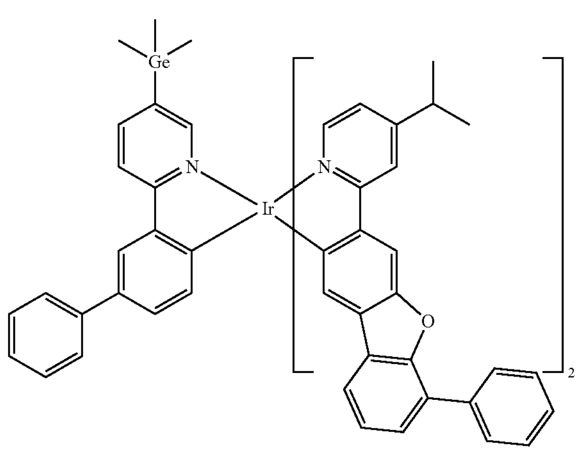
-continued
4962
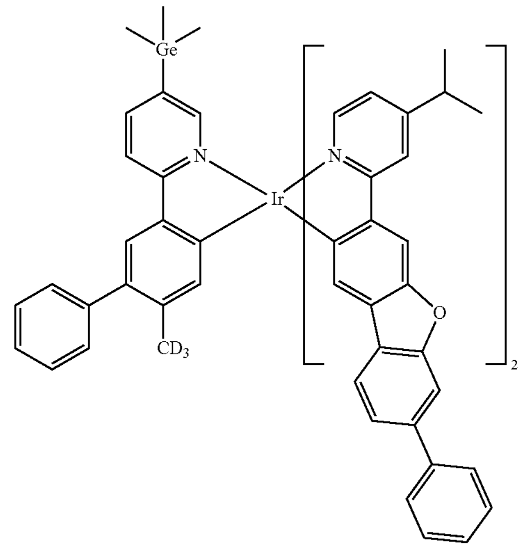
4963
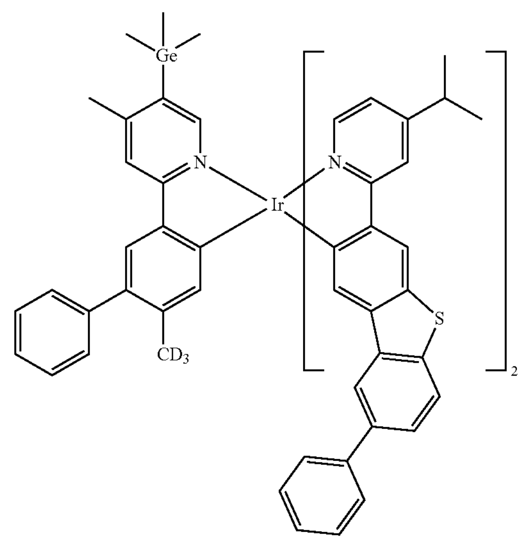
4964
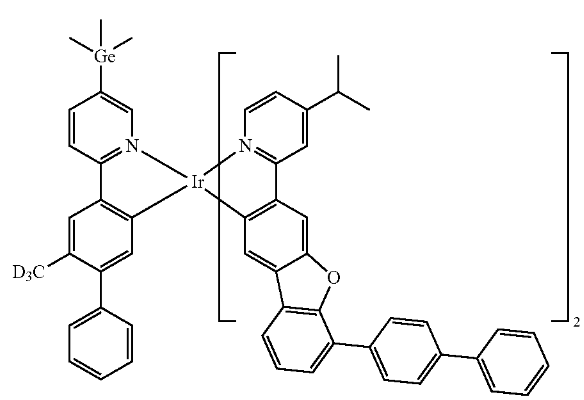

-continued
4965
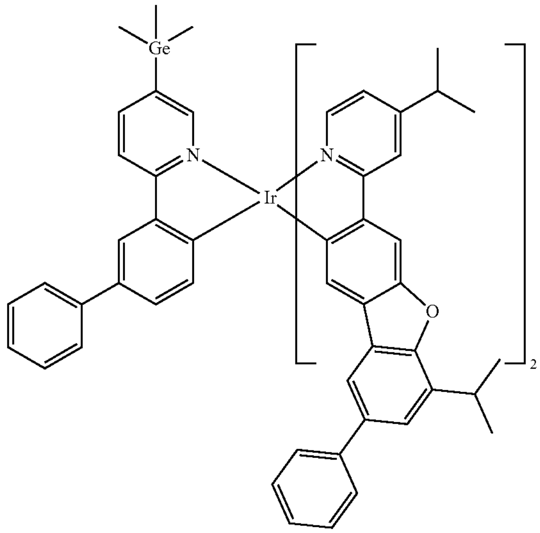
4966
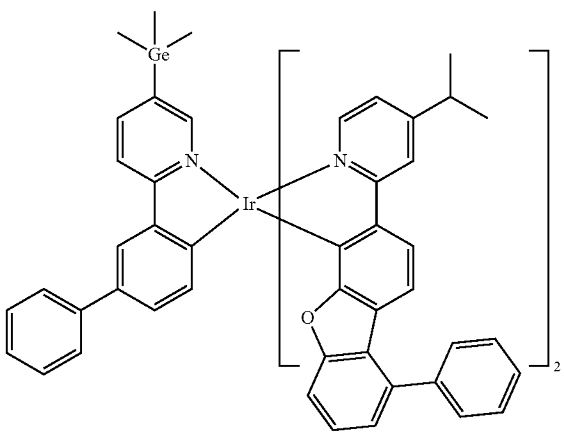
4967
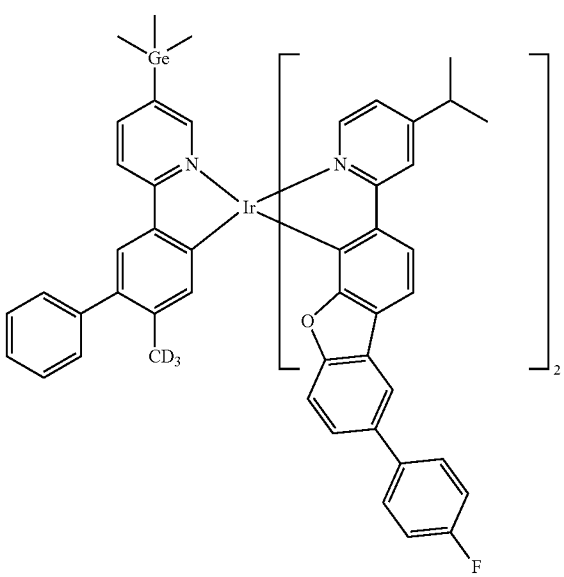
-continued
4968
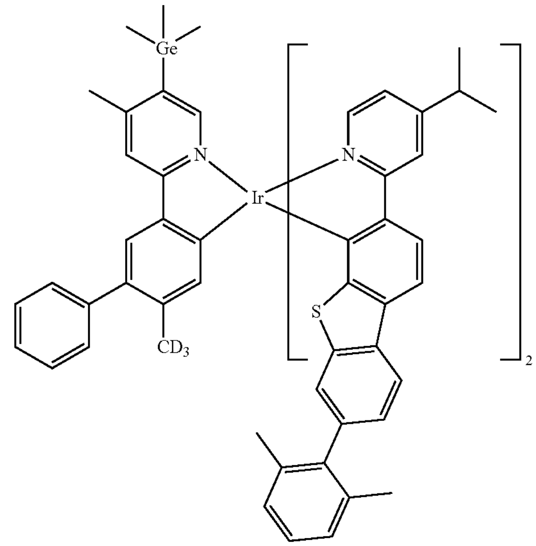
4969
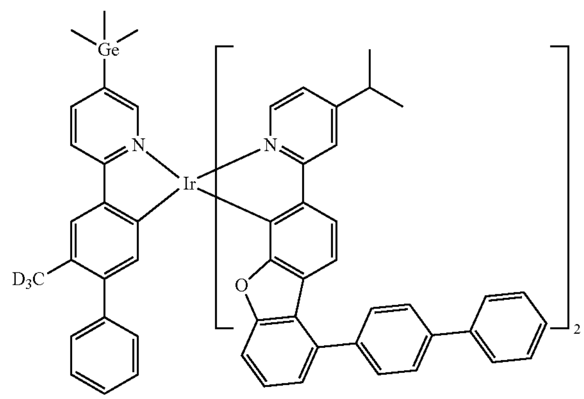
4970
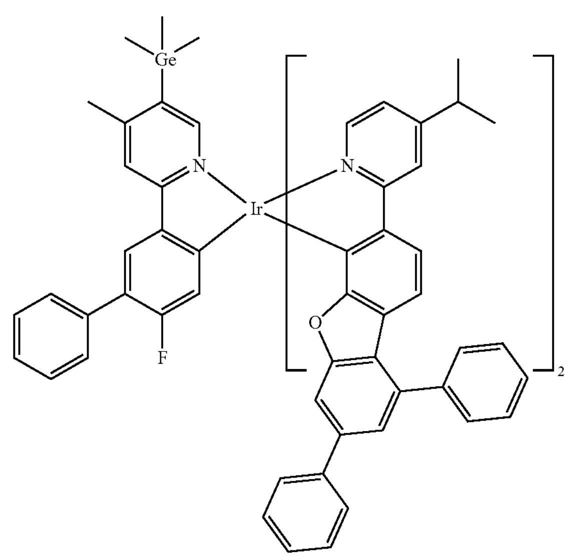

4971
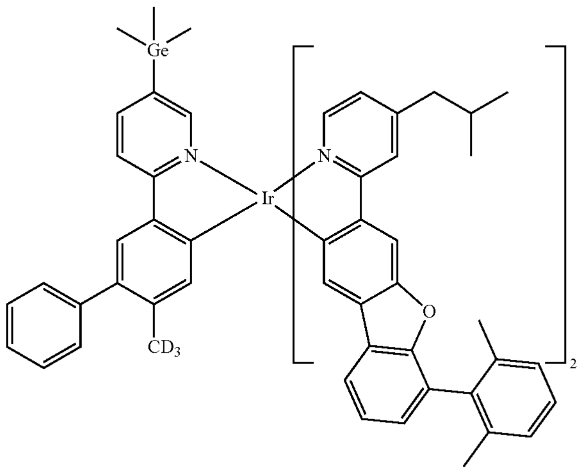
4972
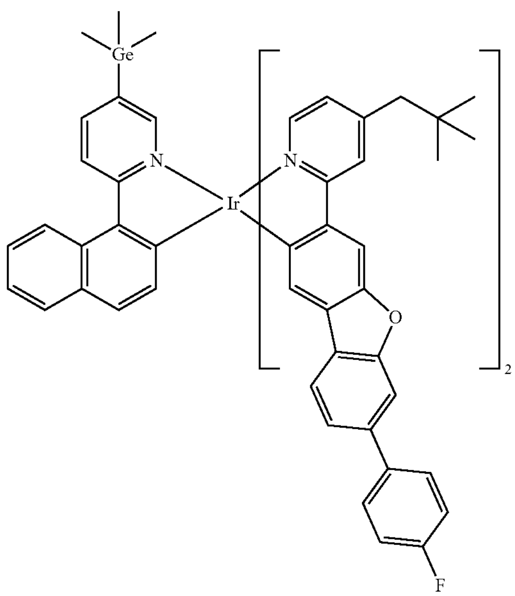
4973
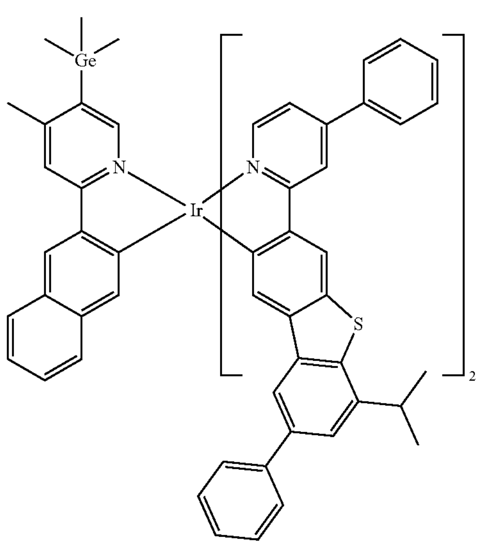
4974
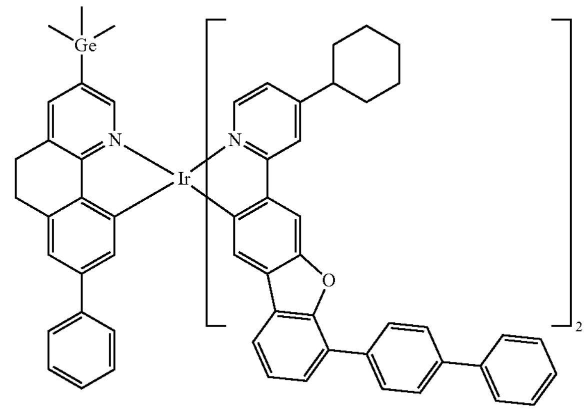
7975
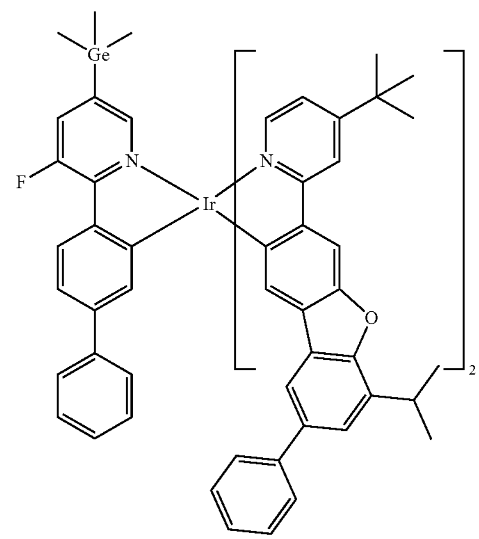
4976
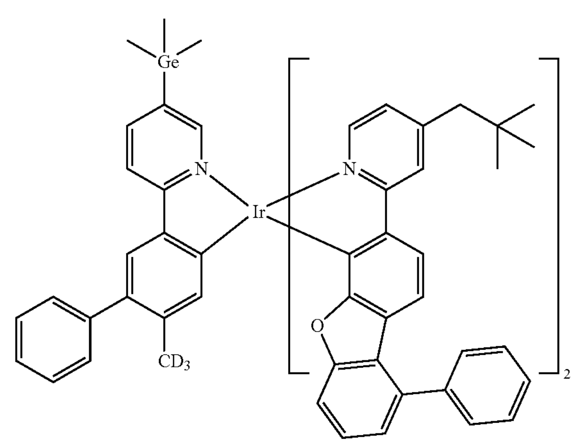

-continued
4977
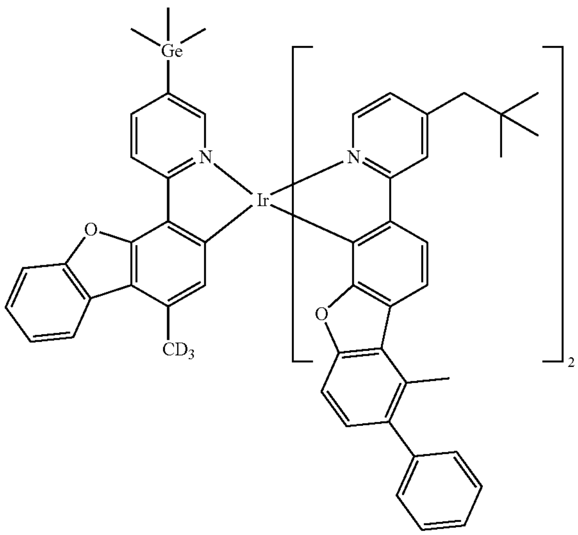
4978
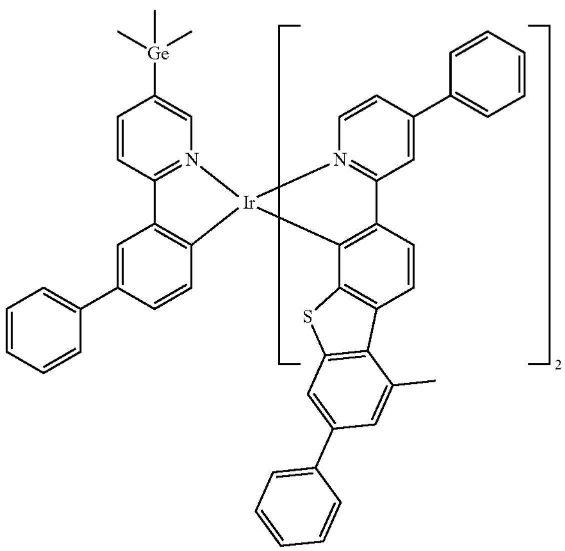
4979
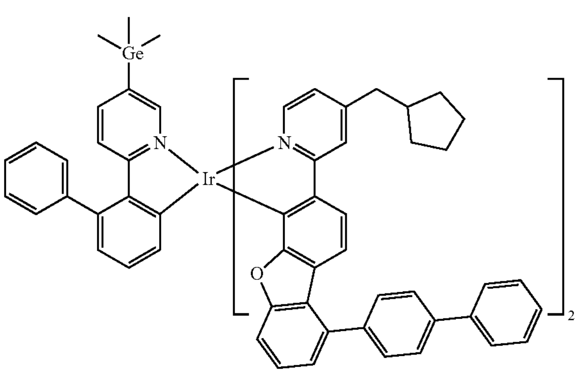
-continued
4980
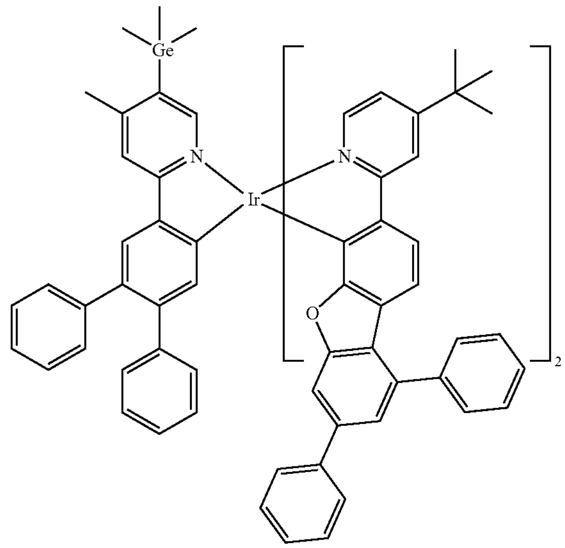
4981
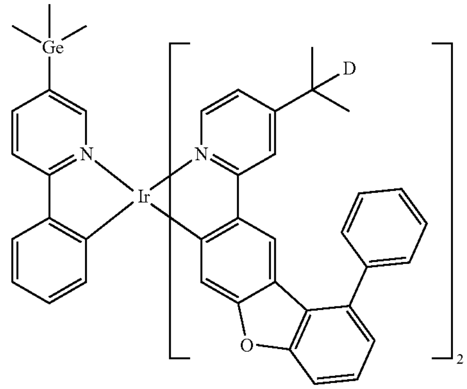
4982
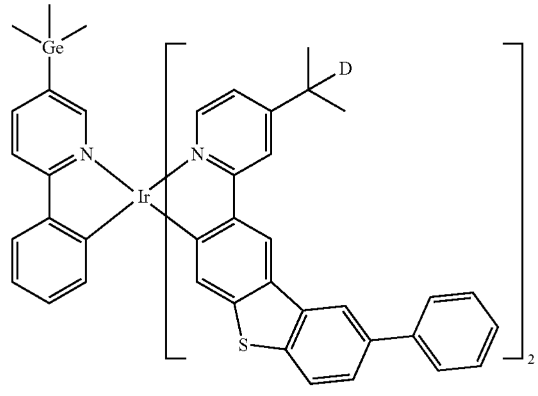

-continued
4983
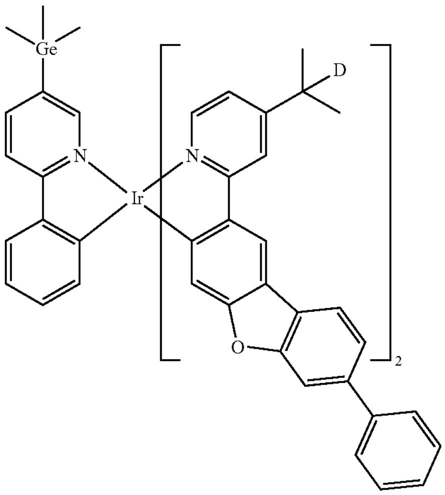
4984
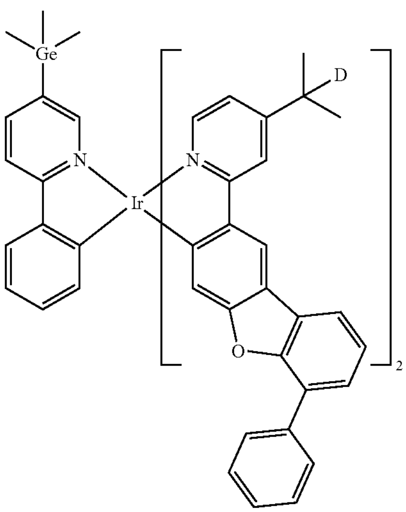
4985
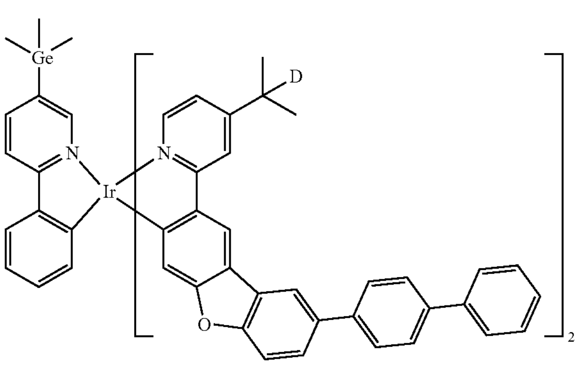
-continued
4986
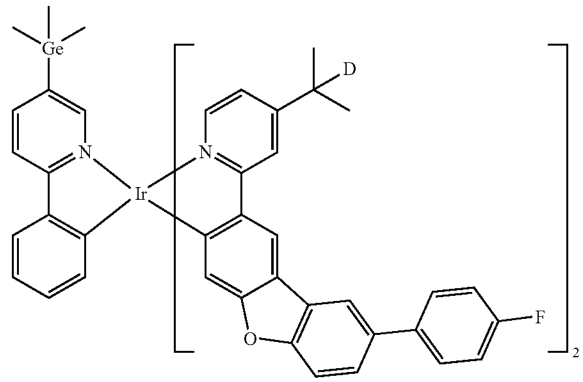
4987
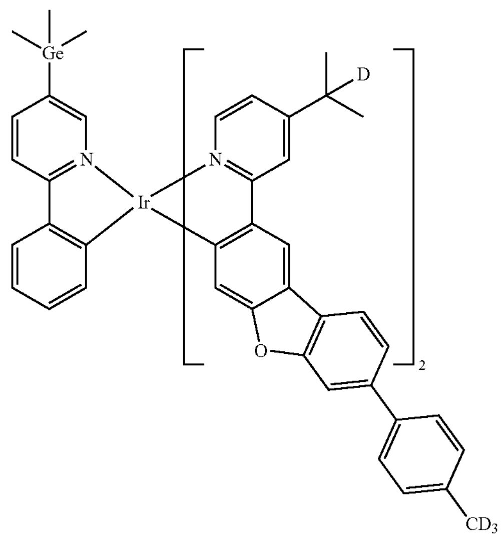
4988
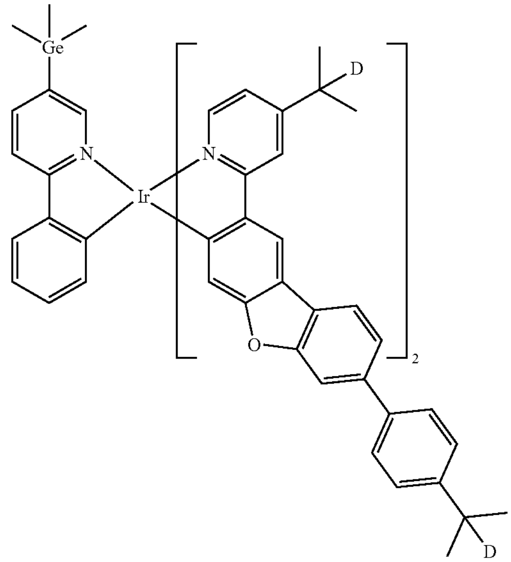

-continued
4989
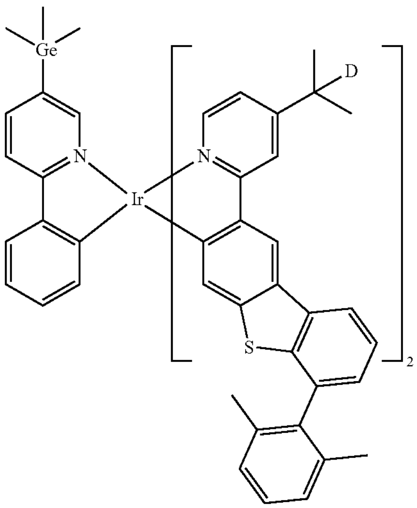
4990
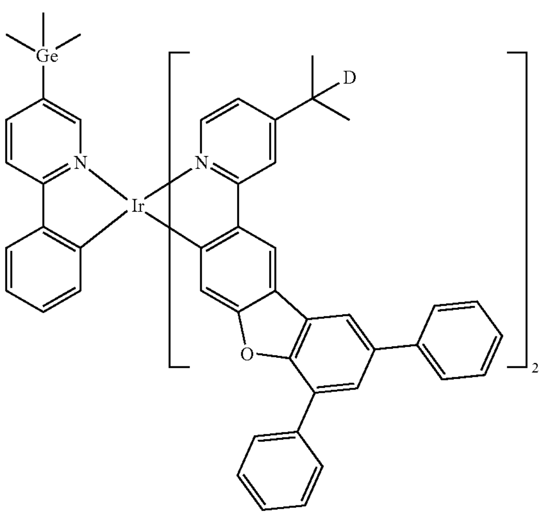
4991
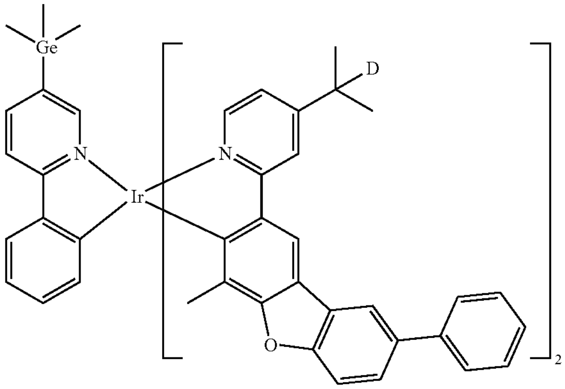
-continued
4992
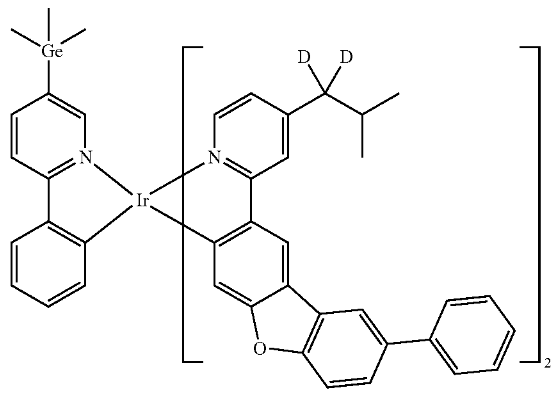
4993
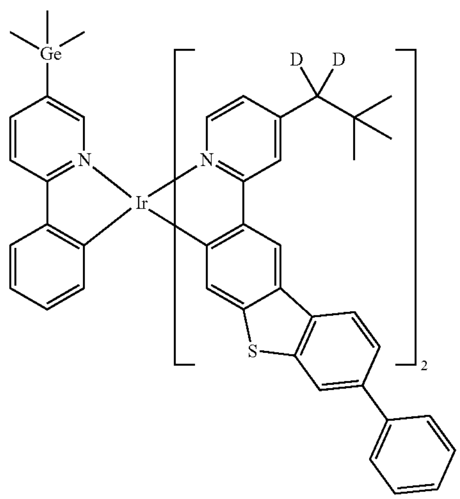
4994
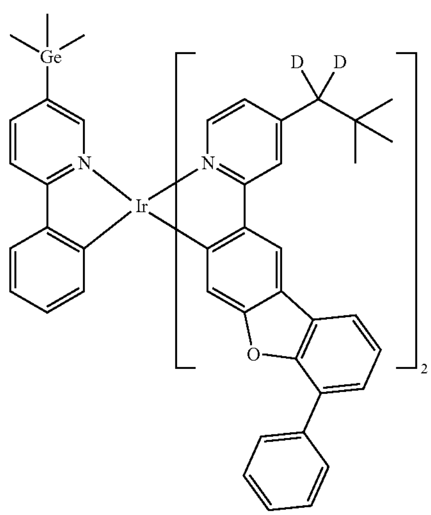

-continued
4995
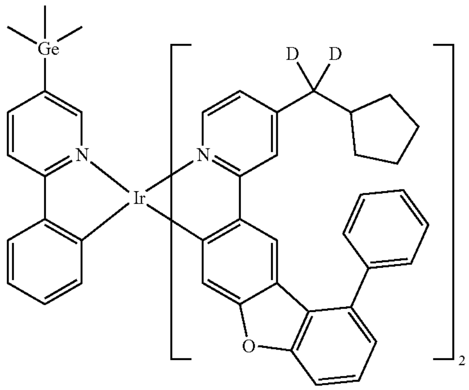
4996
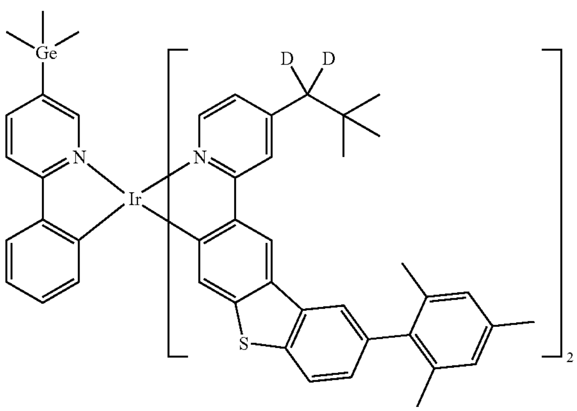
4997
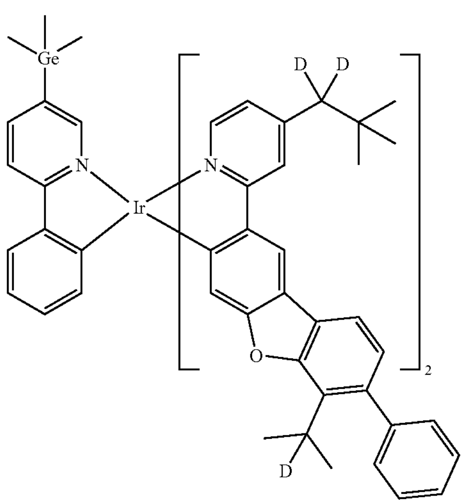
-continued
4998
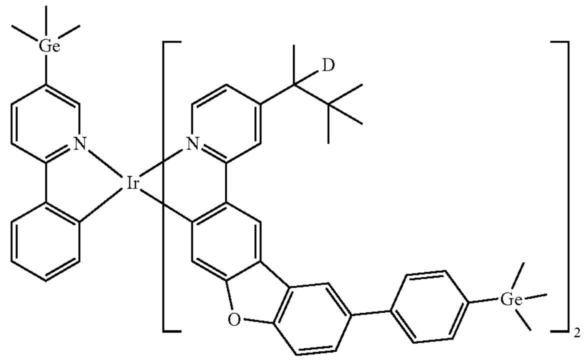
4999
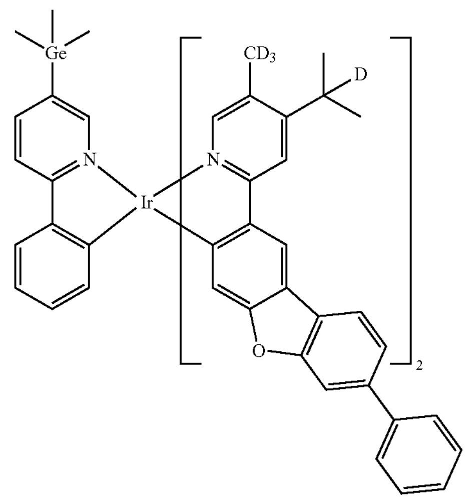
5000
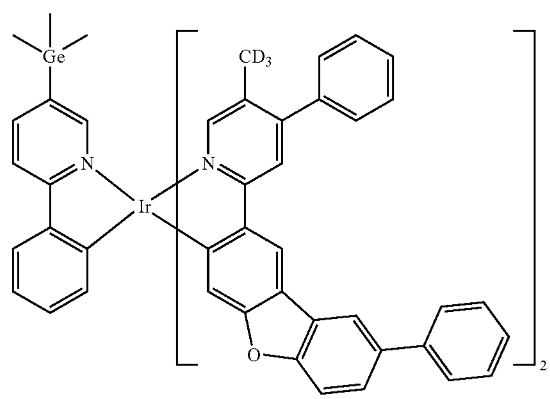

-continued
5001
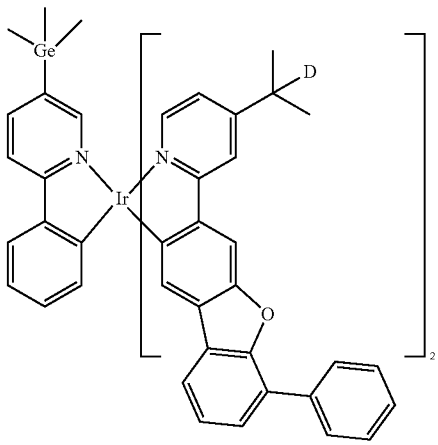
5002
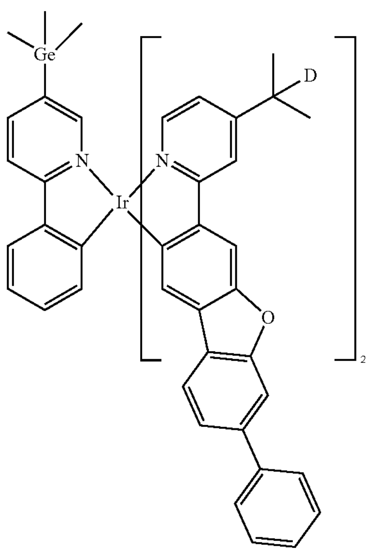
5003
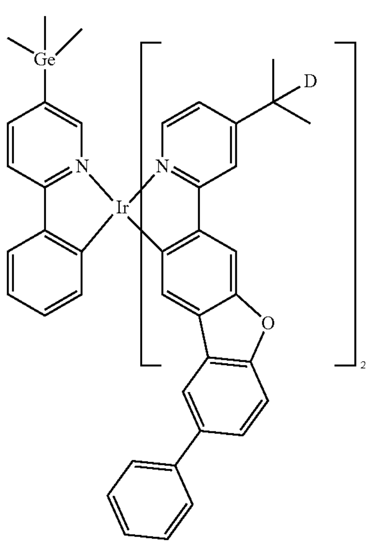
5004
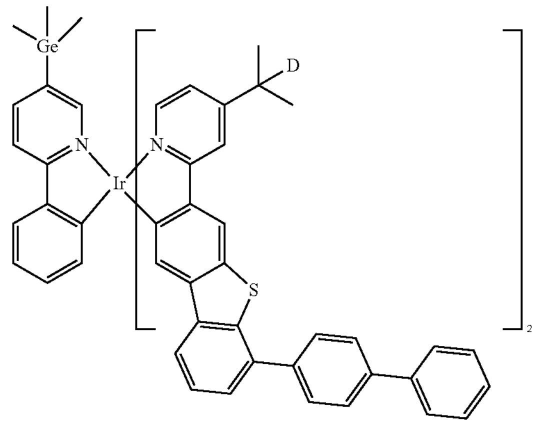
5005
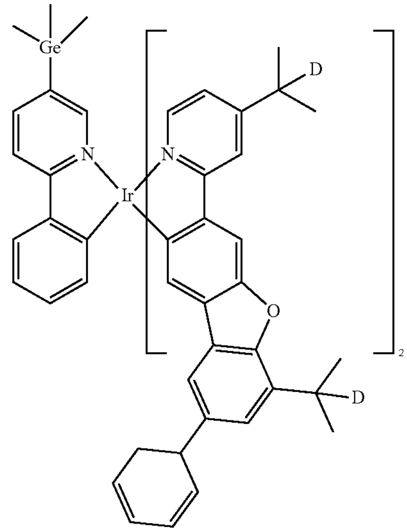
5006
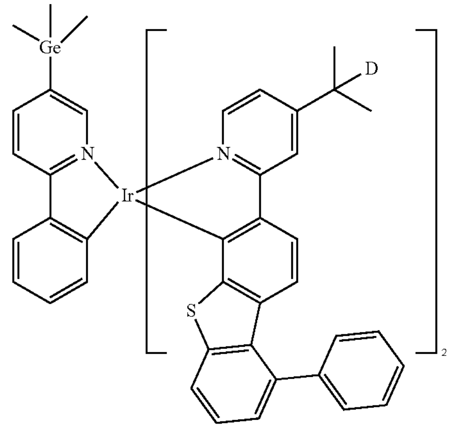

-continued
5007
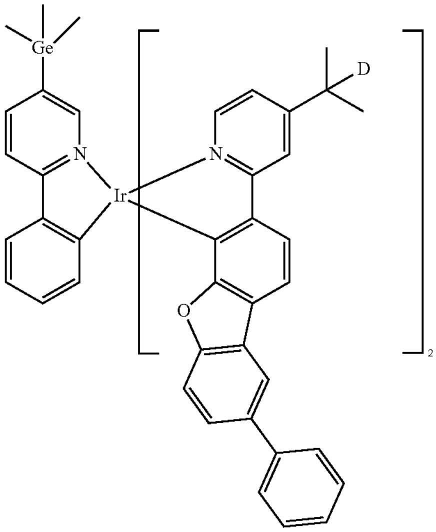
5008
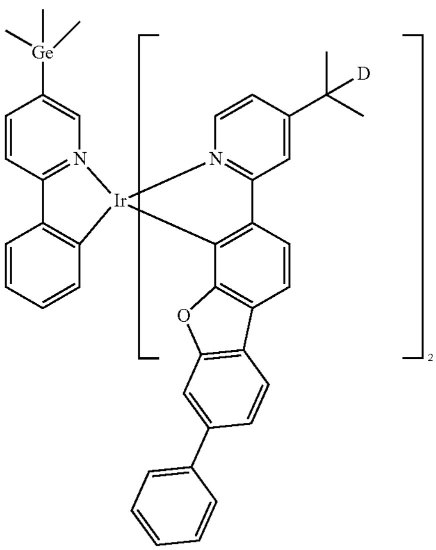
5009
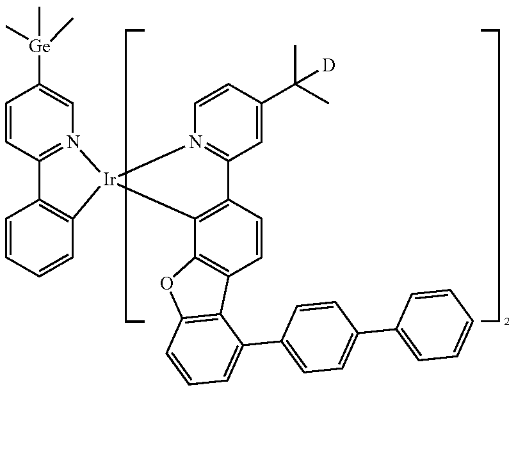
-continued
5010
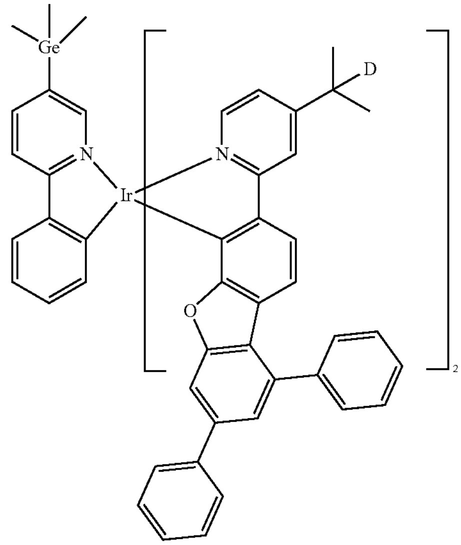
5011
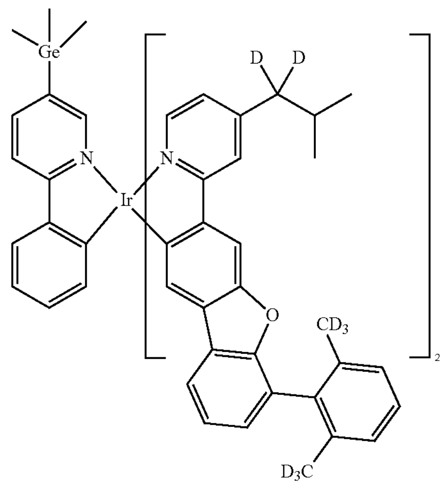
5012
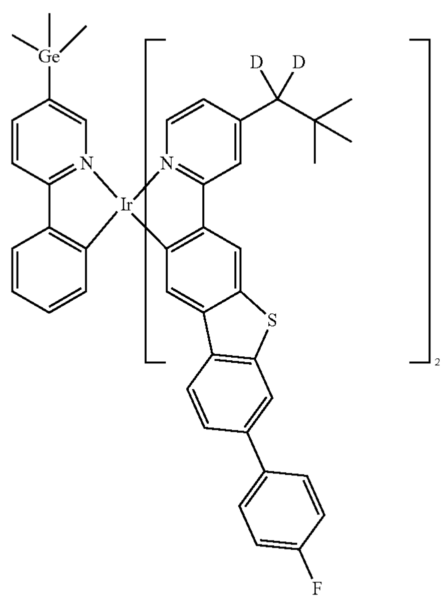

-continued
5013
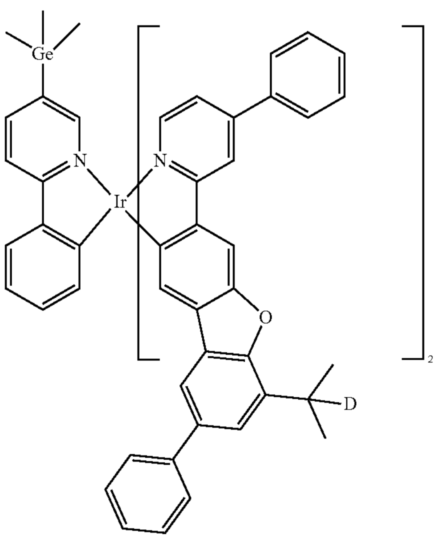
5014
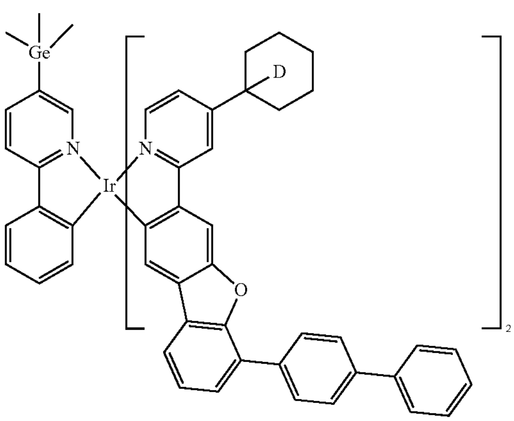
5015
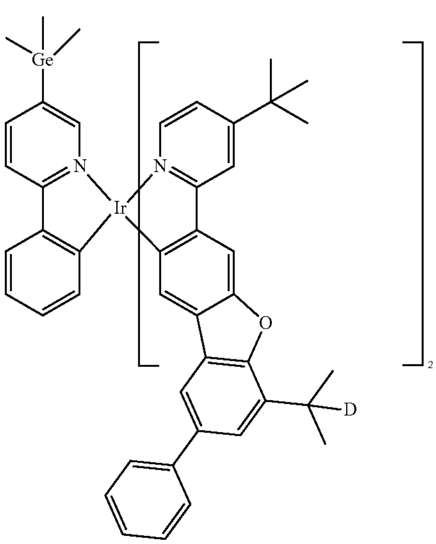
-continued
5016
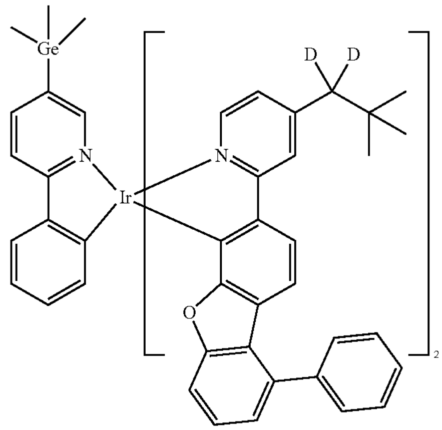
5017
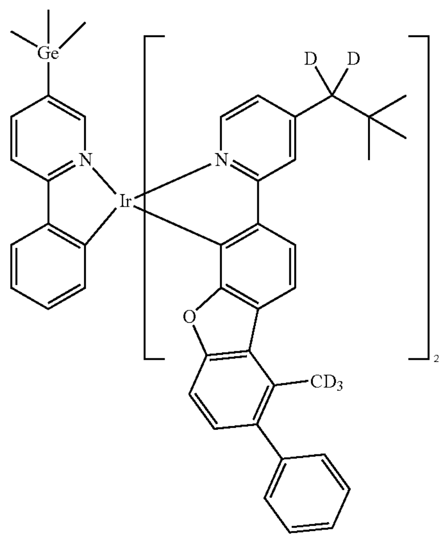
5018
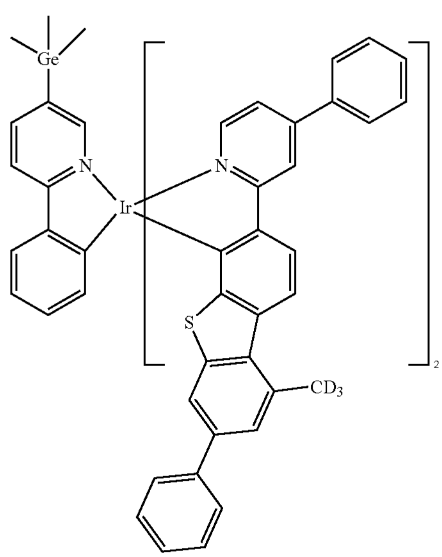

5019
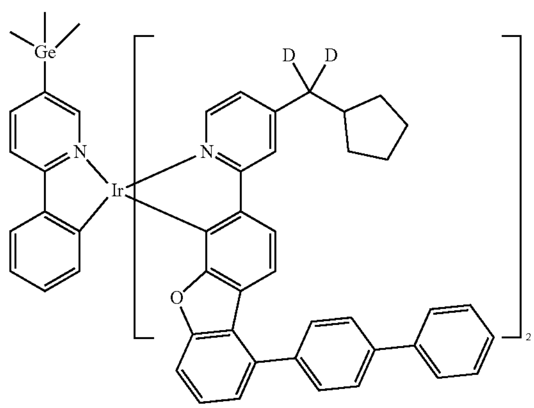
5020
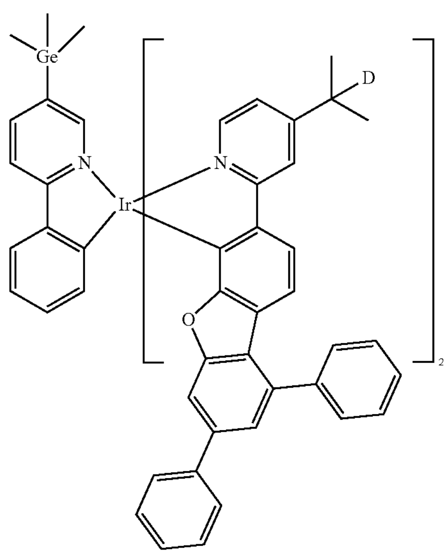
5021
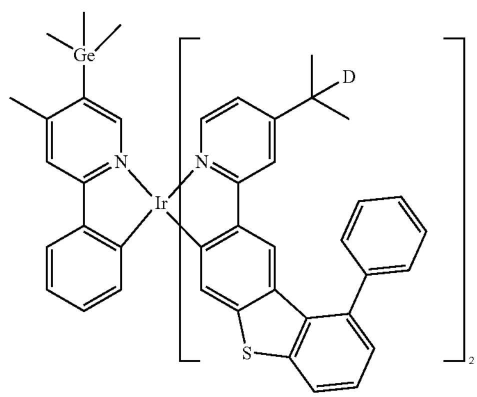
5022
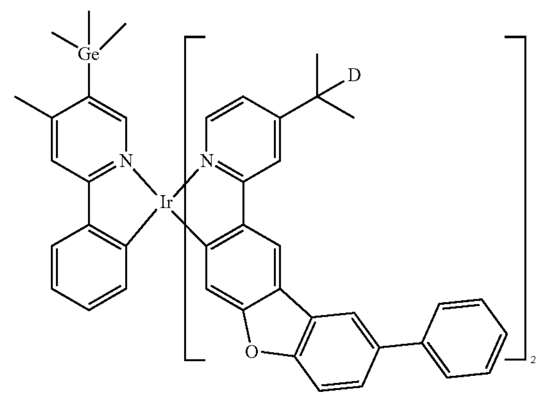
5023
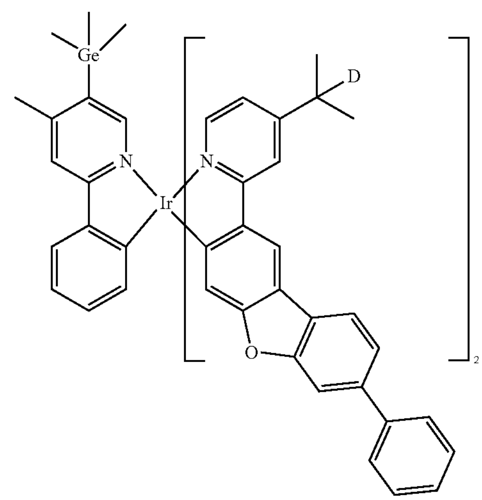
5024
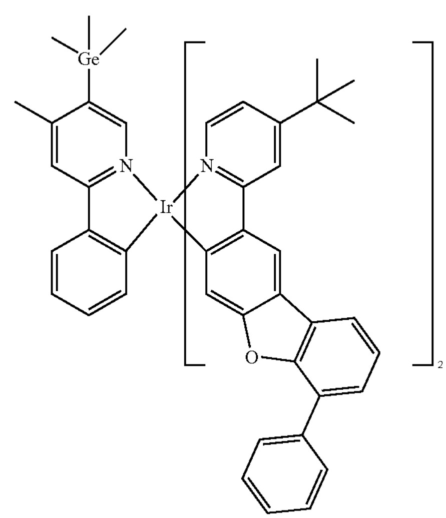

-continued
5025
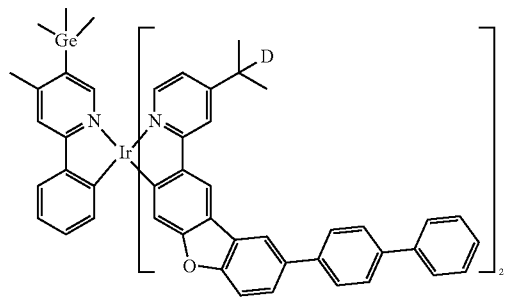
5026
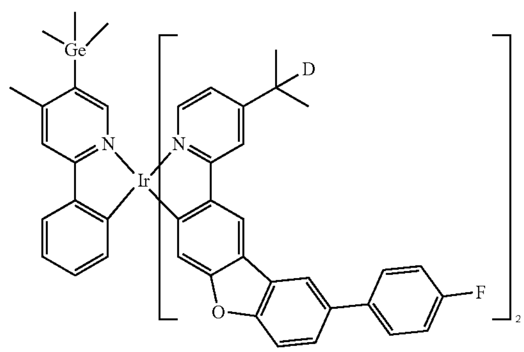
5027
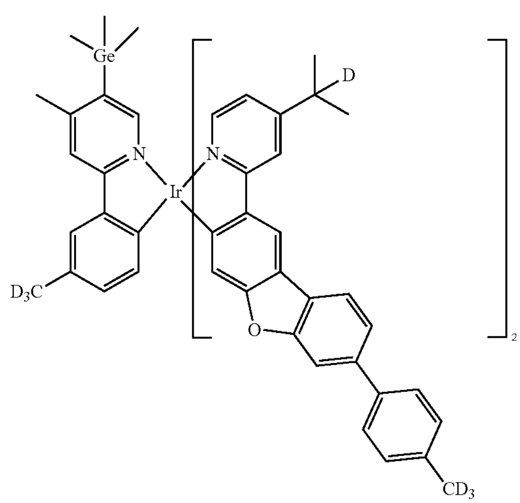
-continued
5028
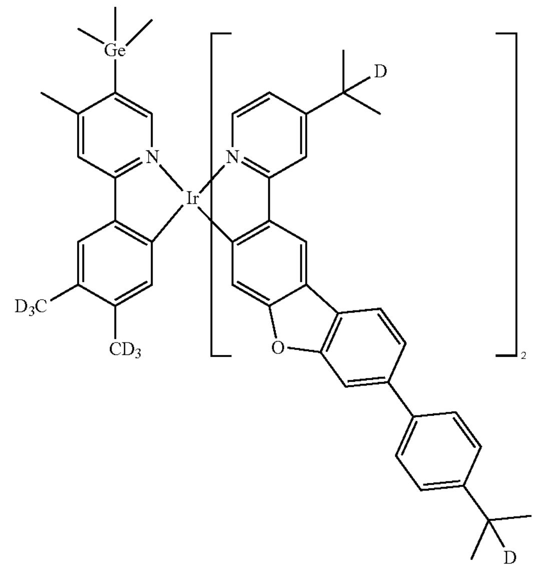
5029
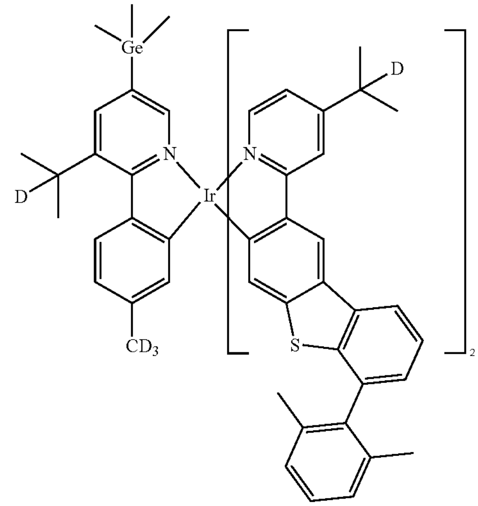
5030
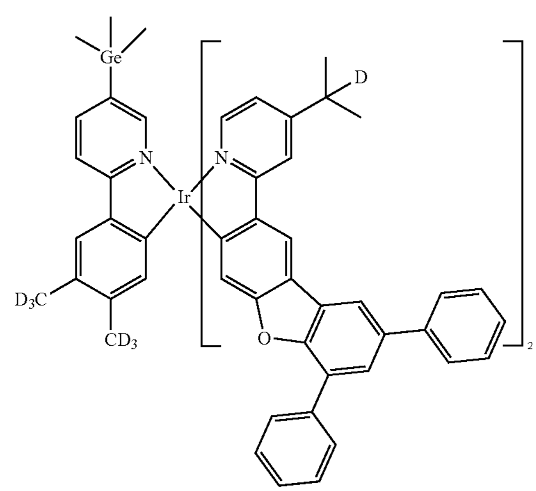

-continued
5031
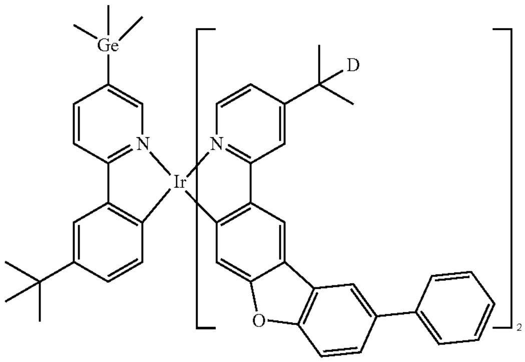
5032
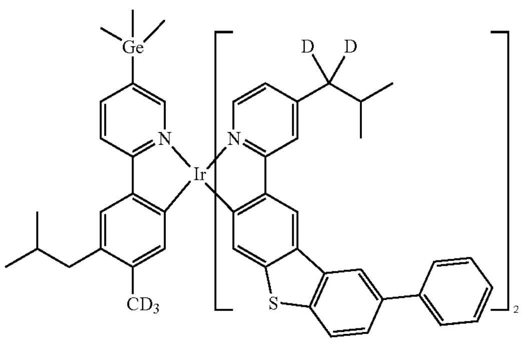
5033
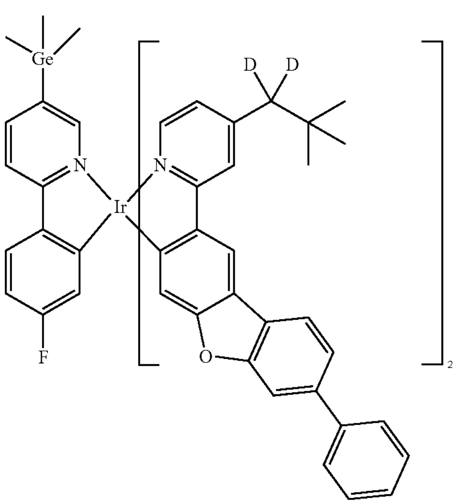
-continued
5034
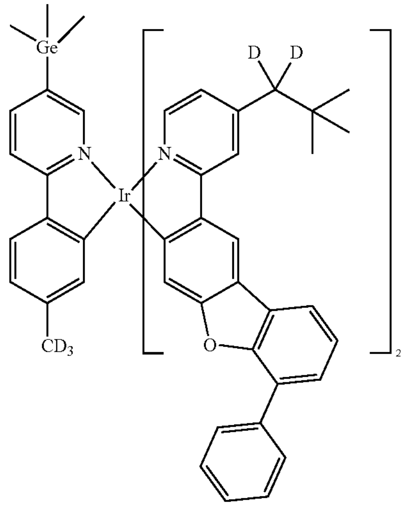
5035
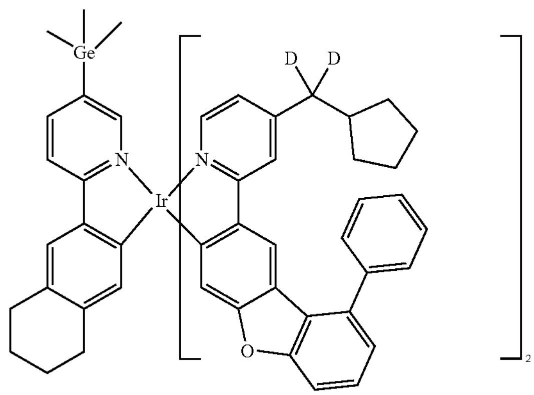
5036
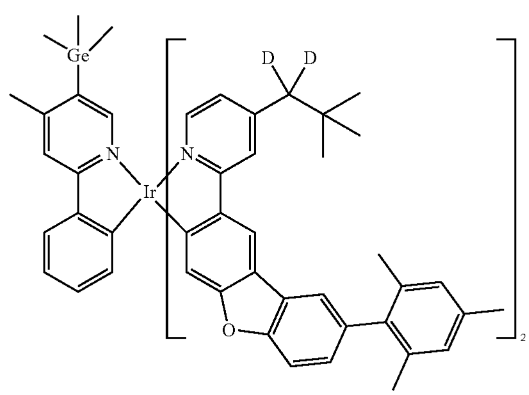

-continued
5037
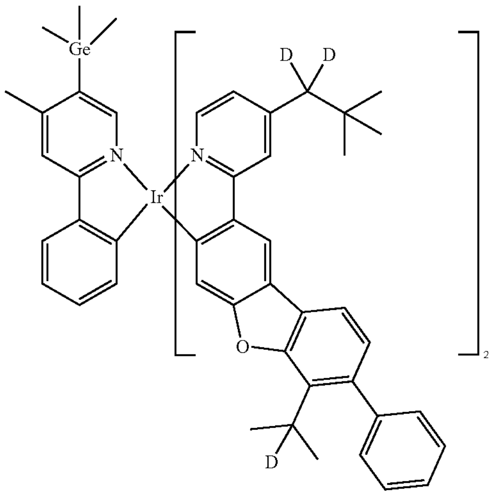
5038
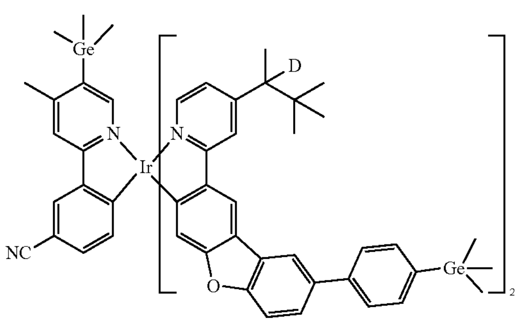
5039
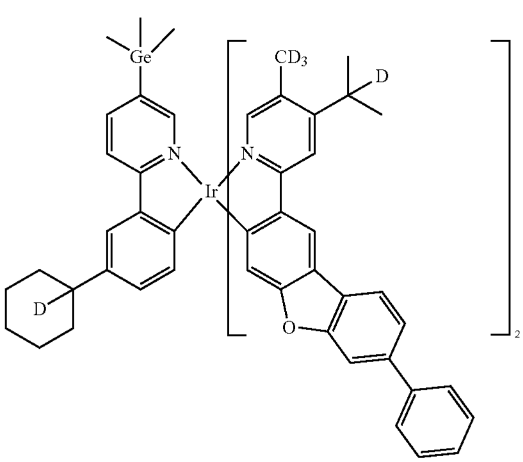
-continued
5040
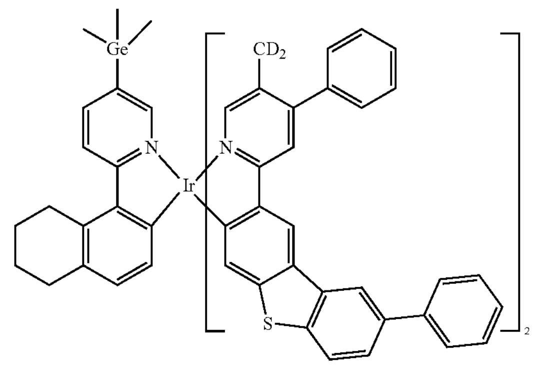
5041
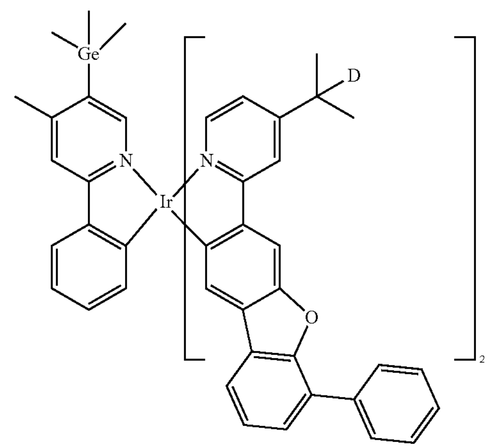
5042
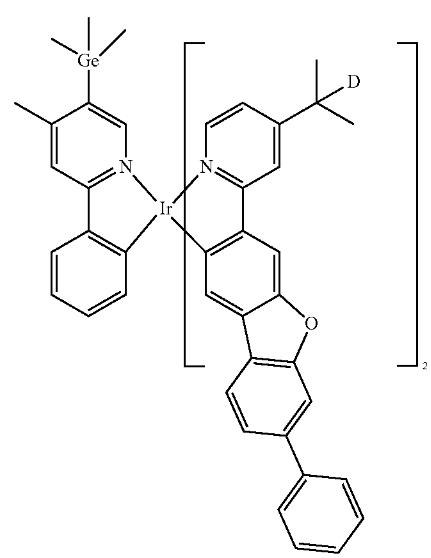

-continued
5043
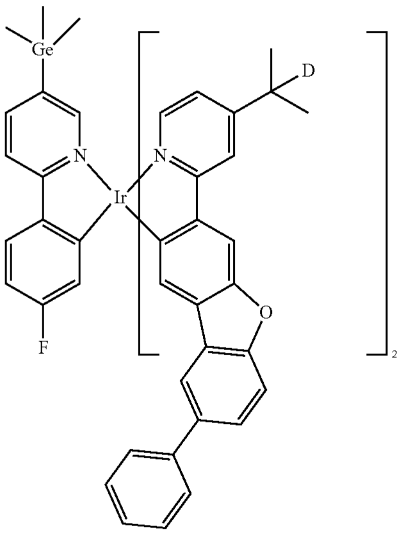
5044
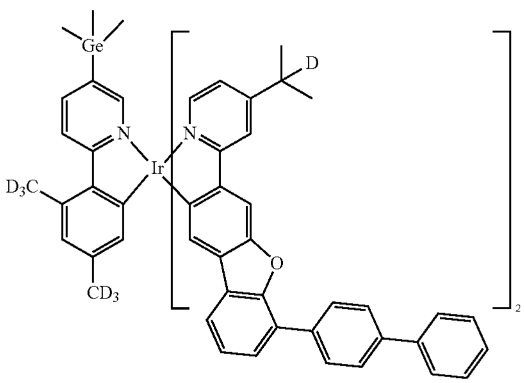
5045
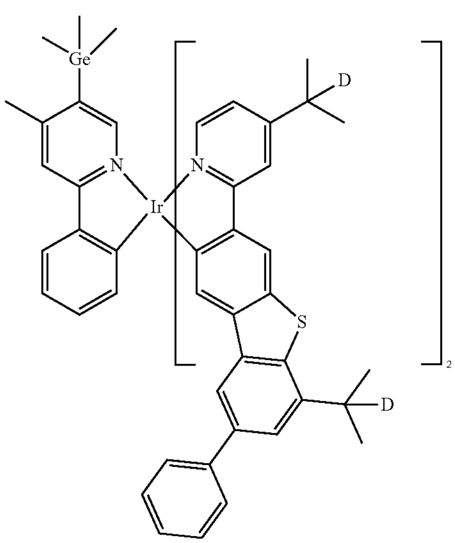
-continued
5046
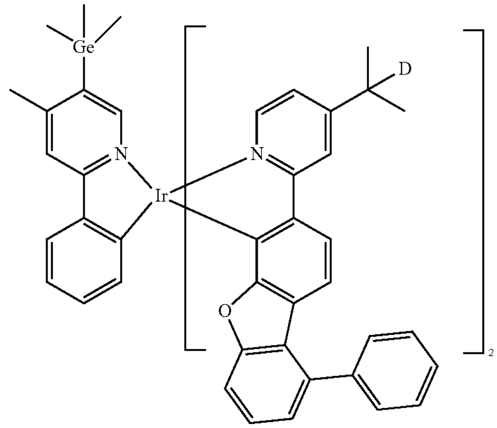
5047
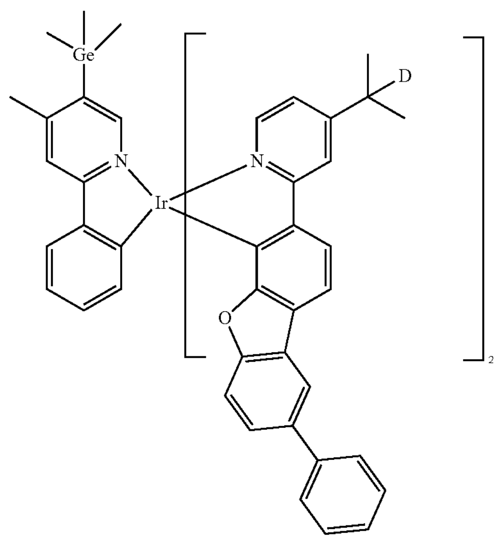
5048
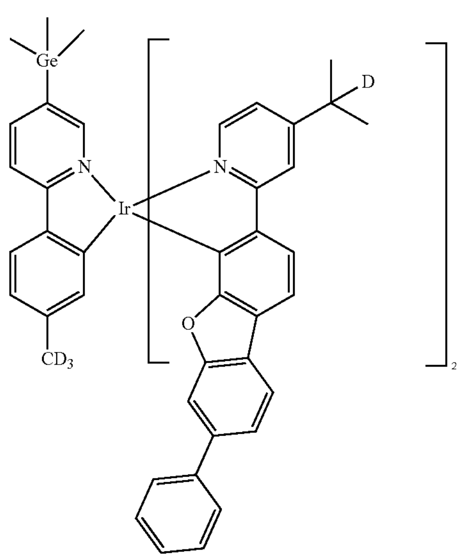

-continued
5049
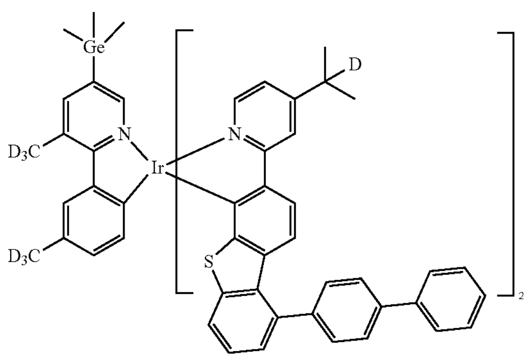
5050
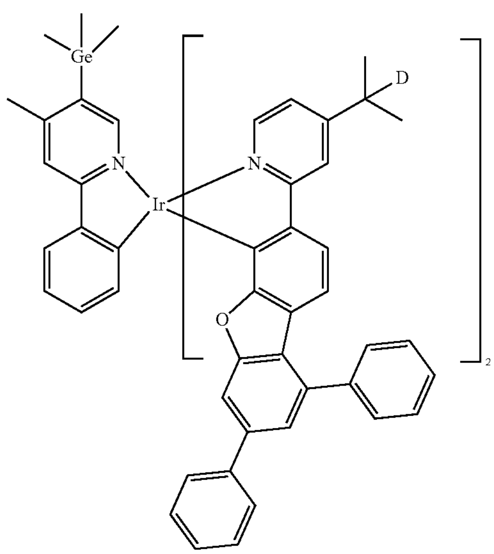
5051
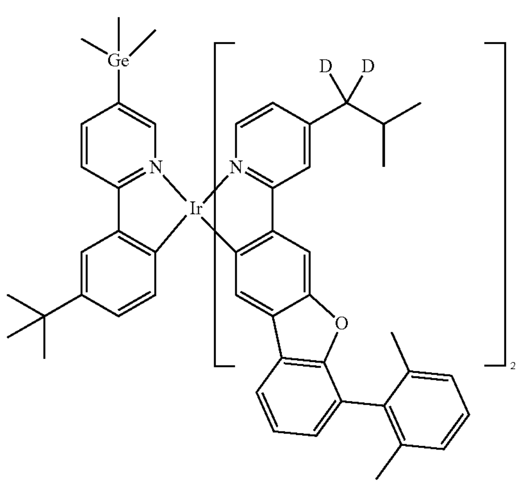
-continued
5052
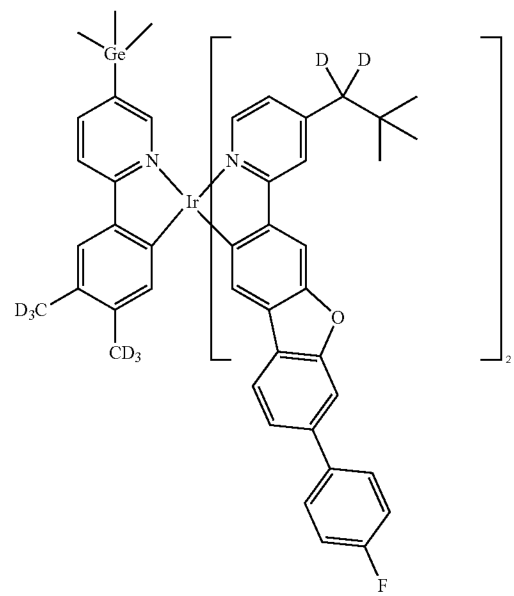
5053
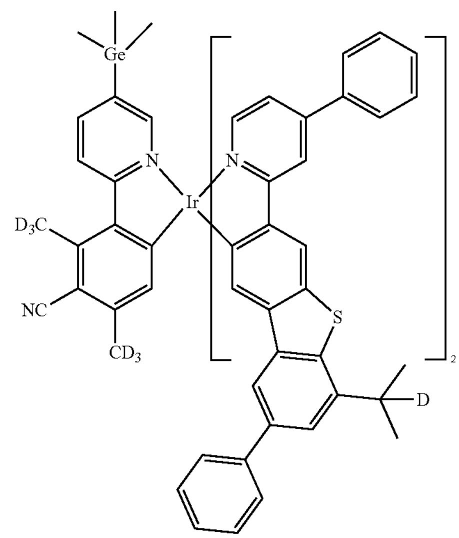
5054
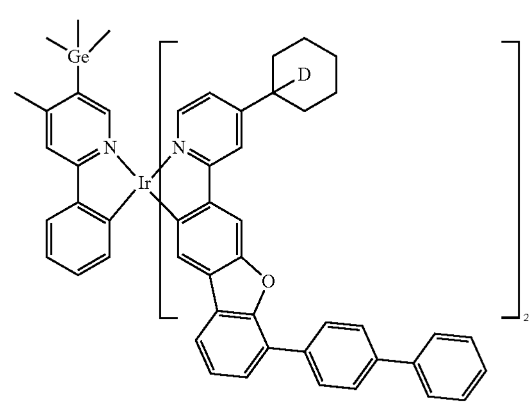

-continued
5055
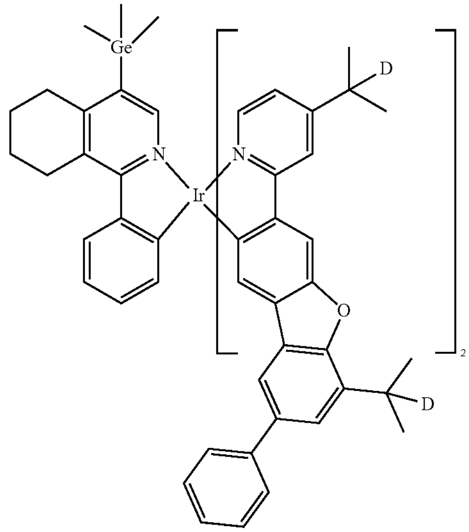
5056
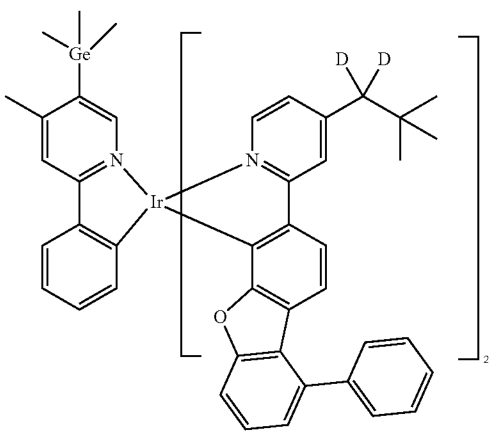
5057
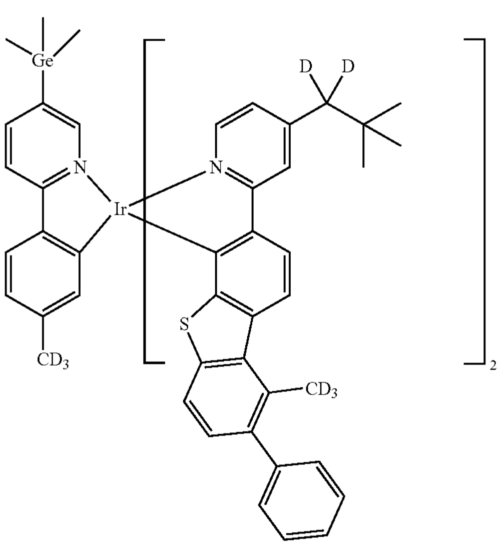
-continued
5058
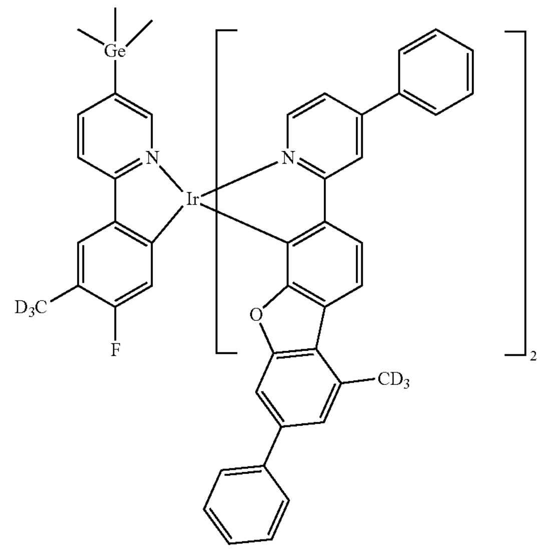
5059
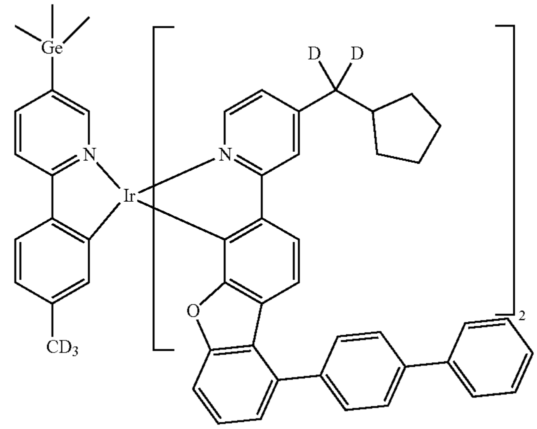
5060
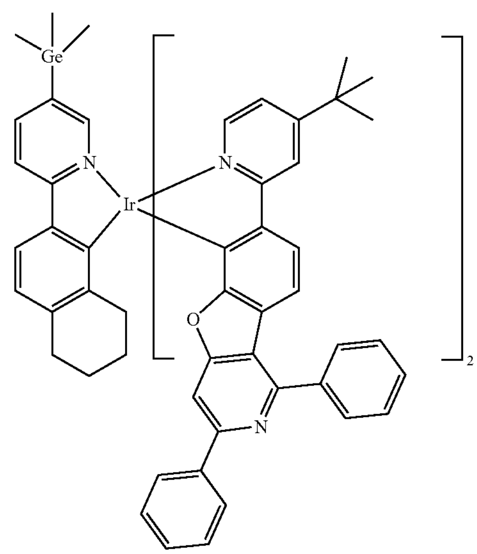

5061
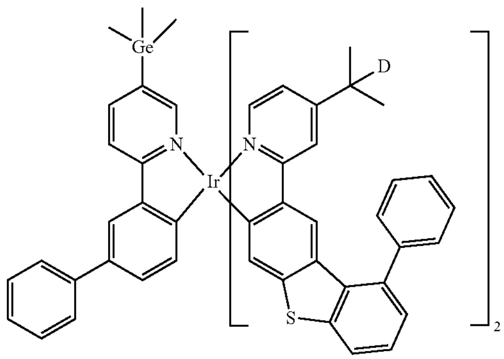
5062
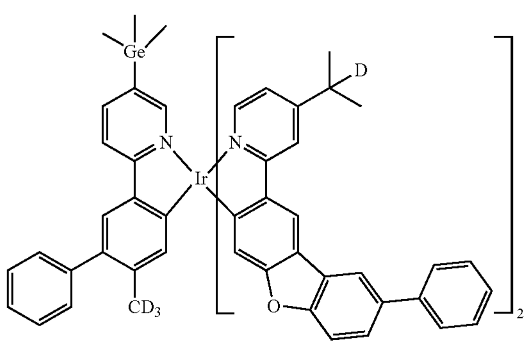
5063
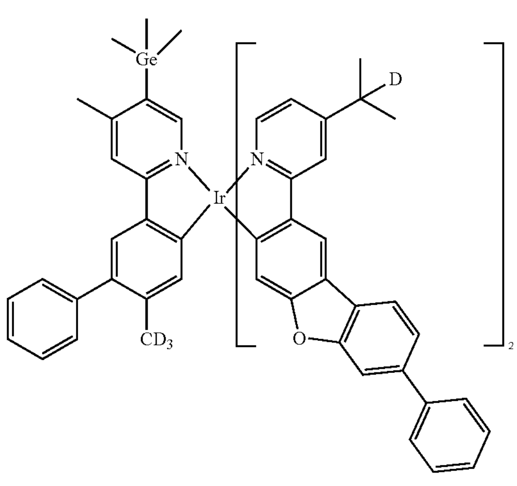
5064
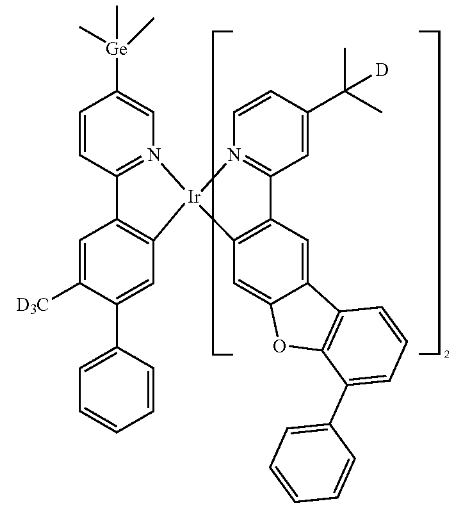
5065
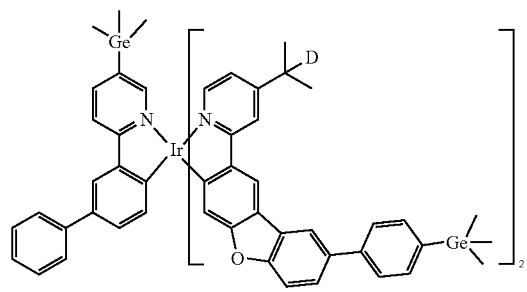
5066
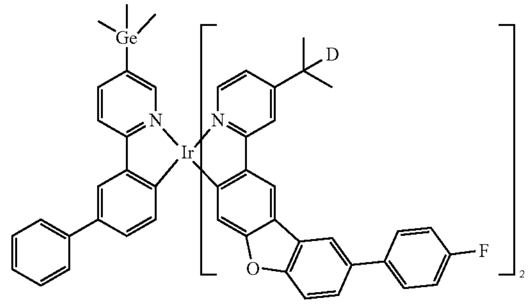
5067
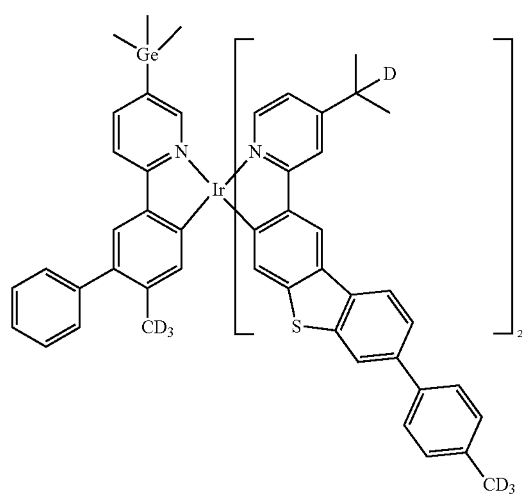

5068
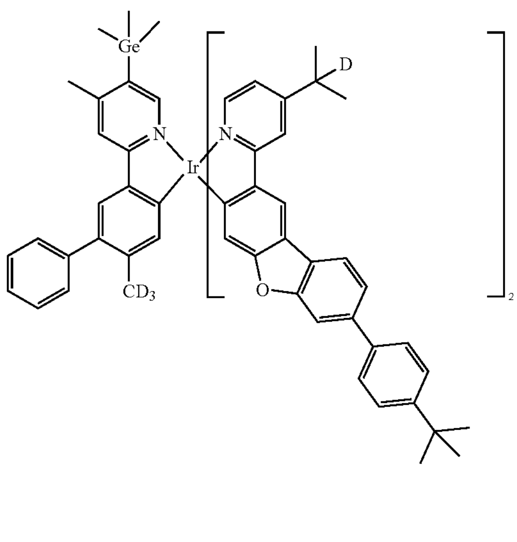
5069
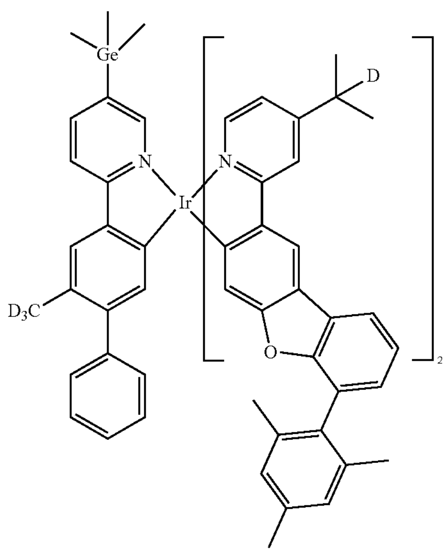
5070
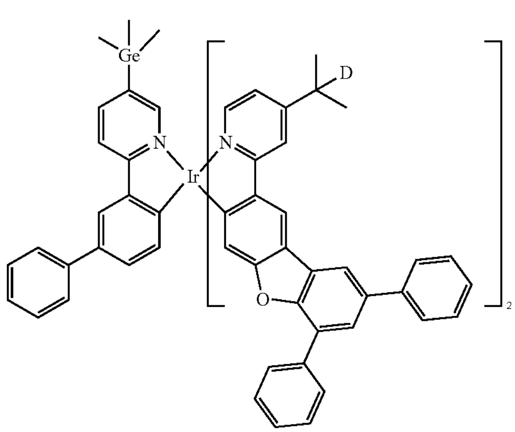
5071
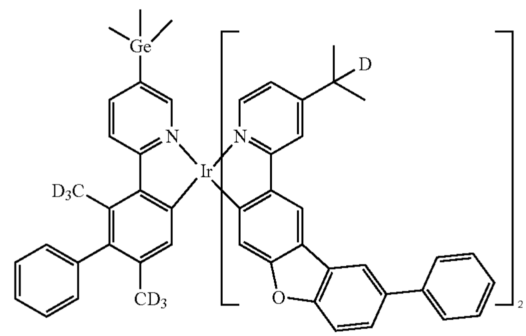
5072
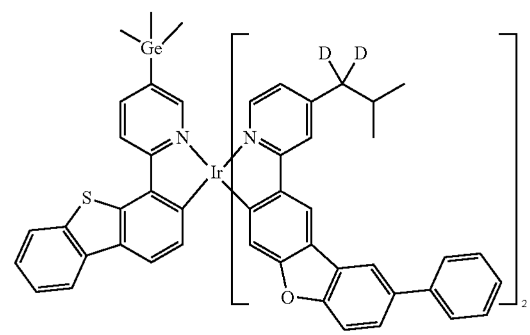
5073
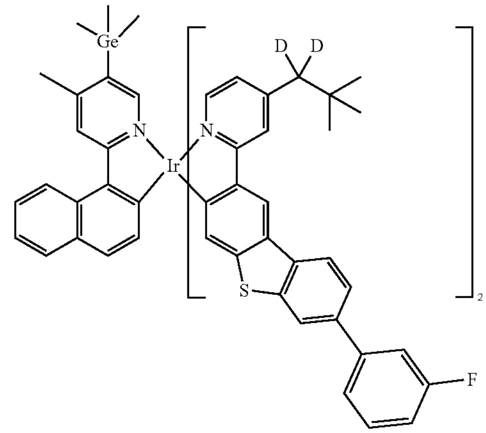

-continued
5074
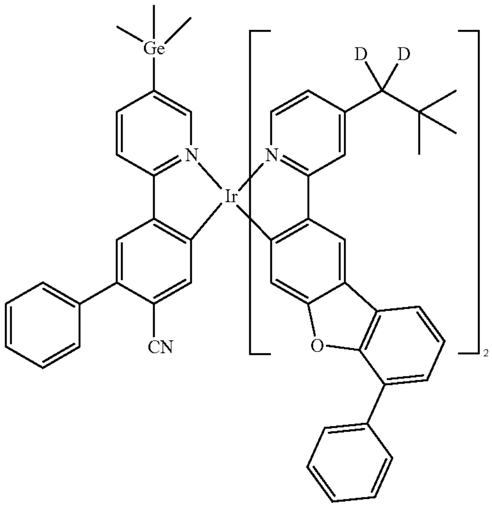
5075
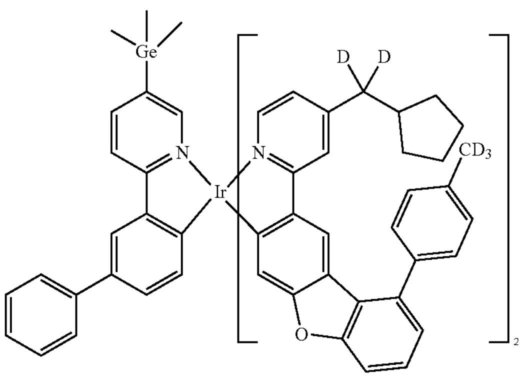
5076
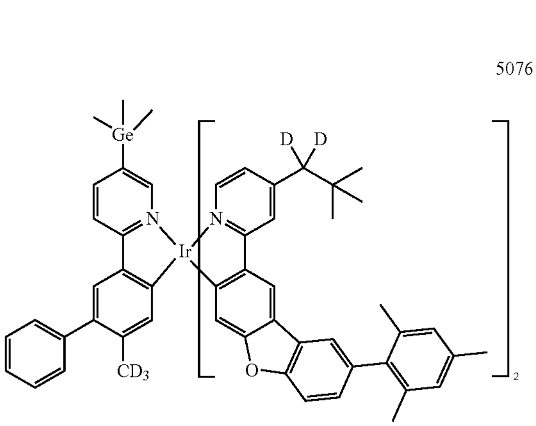
-continued
5077
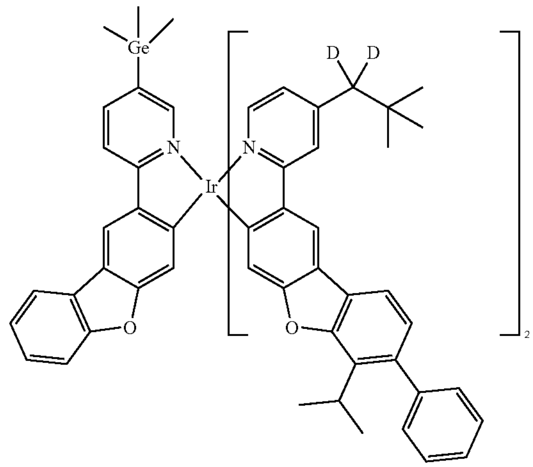
5078
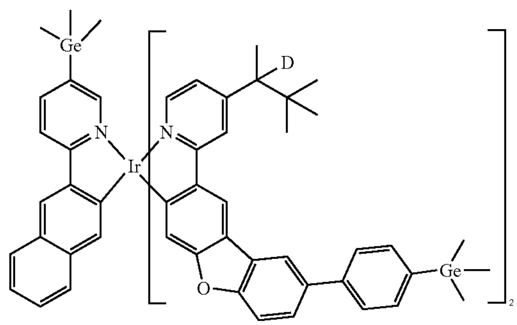
5079
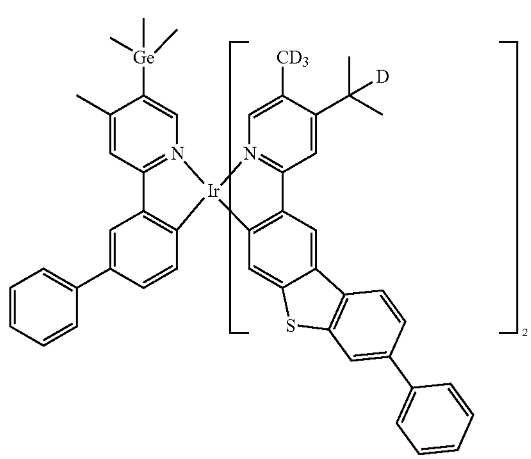

-continued
5080
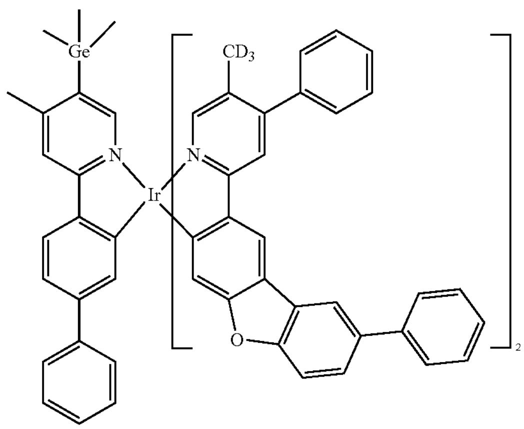
5081
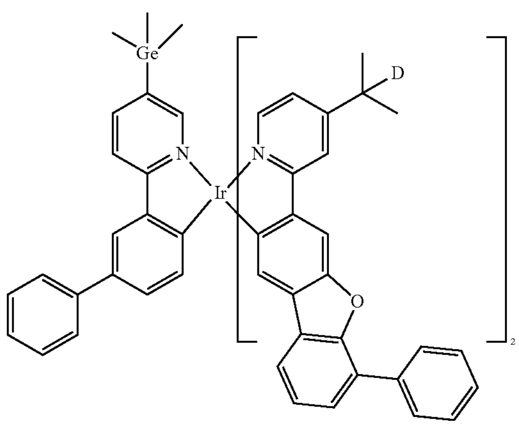
5082
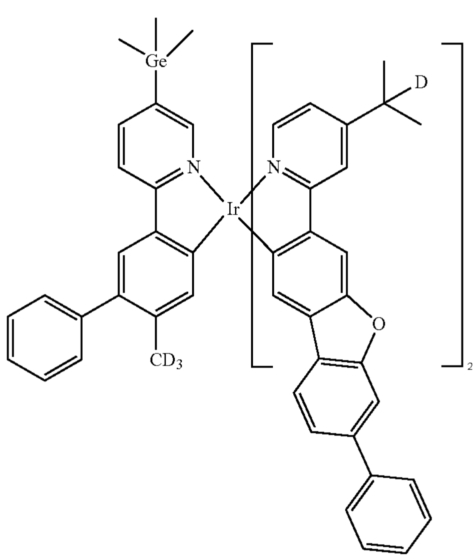
-continued
5083
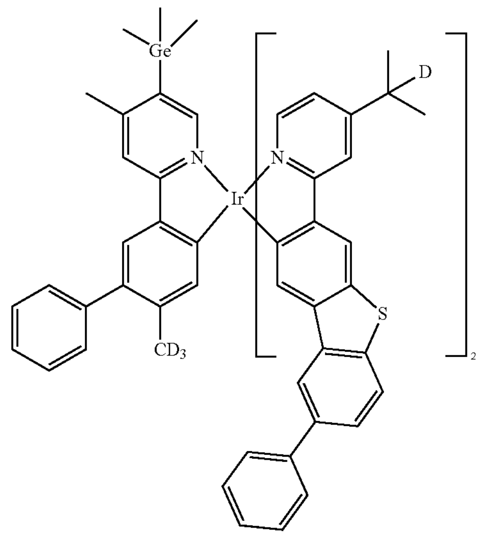
5084
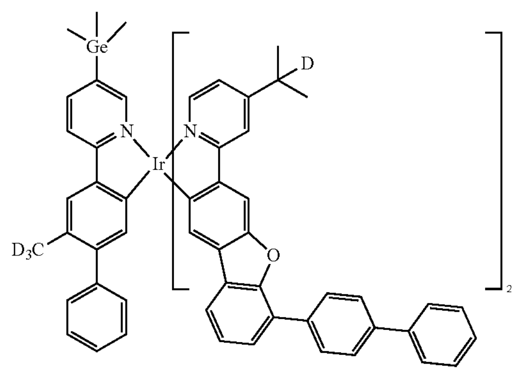
5085
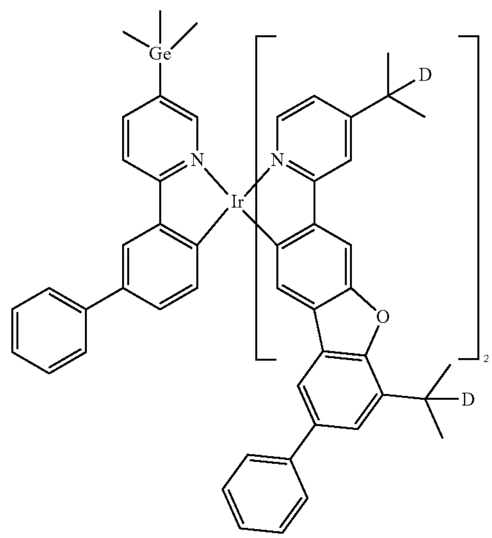

-continued
5086
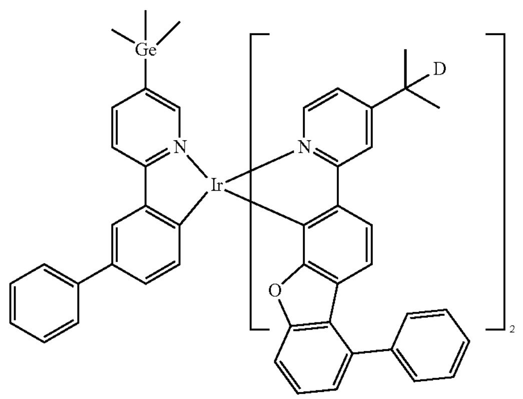
5087
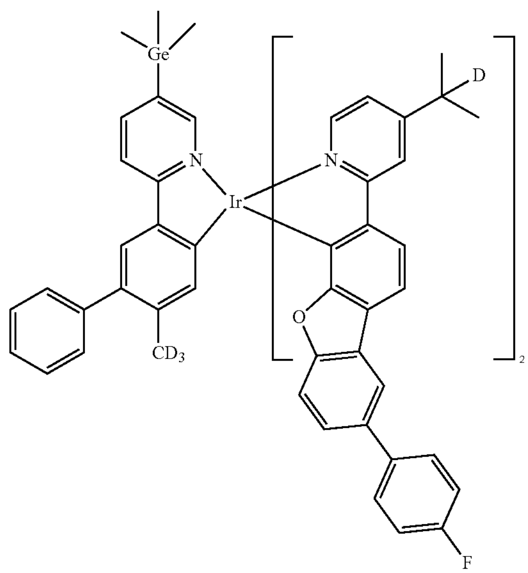
5088
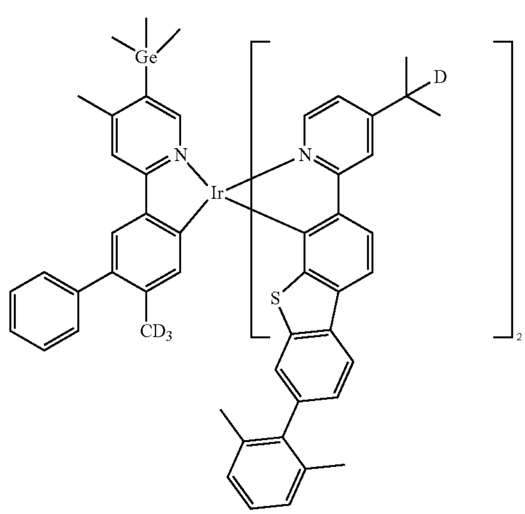
-continued
5089
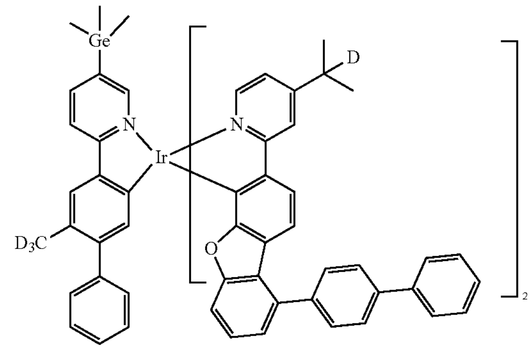
5090
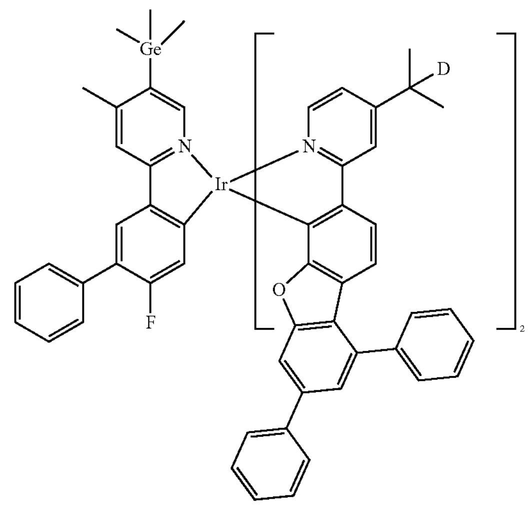
5091
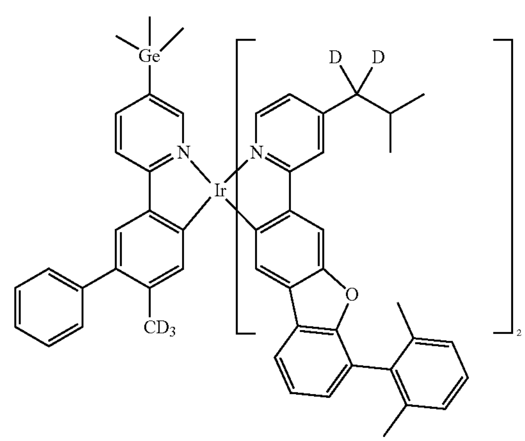

-continued
5092
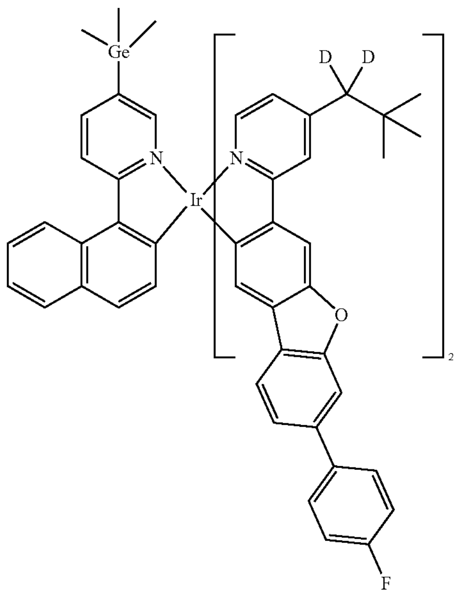
5093
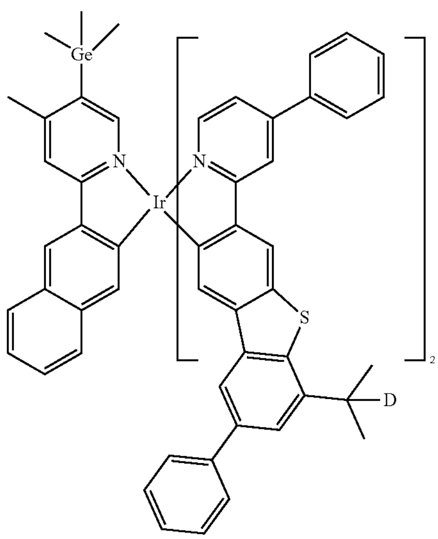
5094
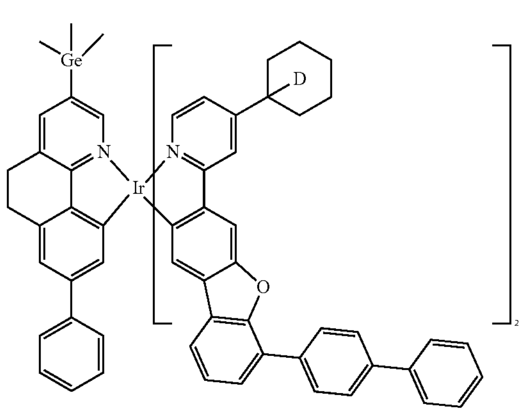
-continued
5095
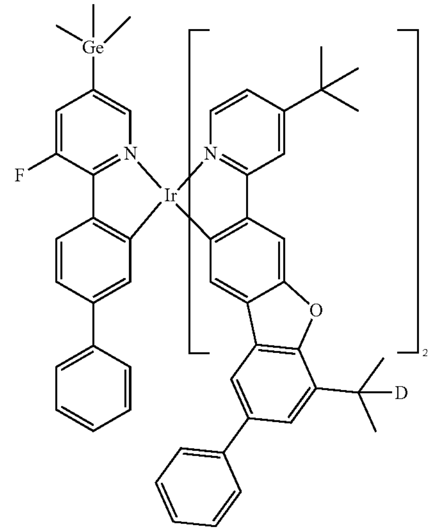
5096
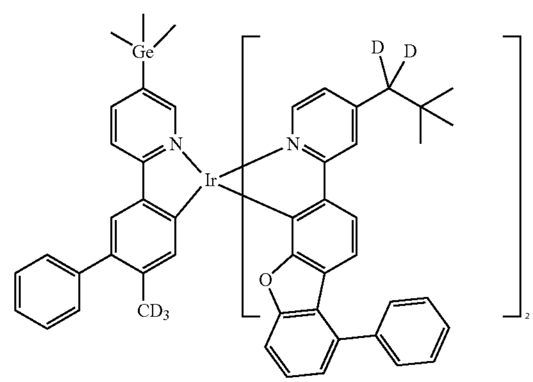
5097
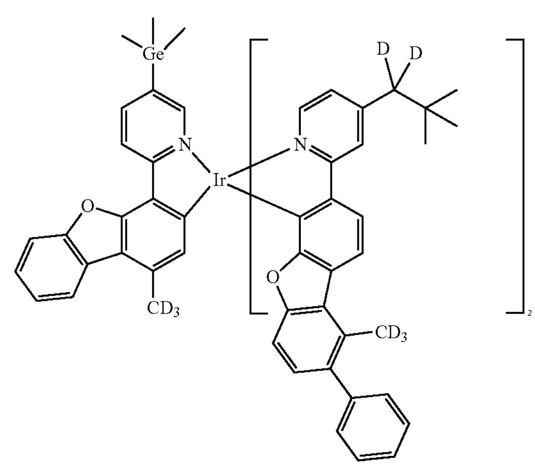

-continued
5098
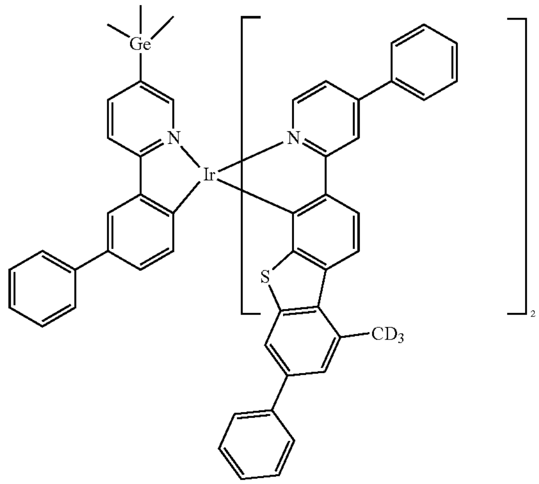
5099
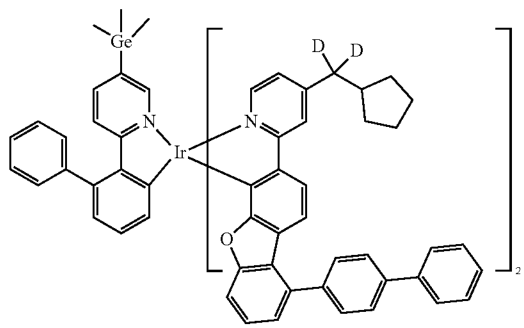
5100
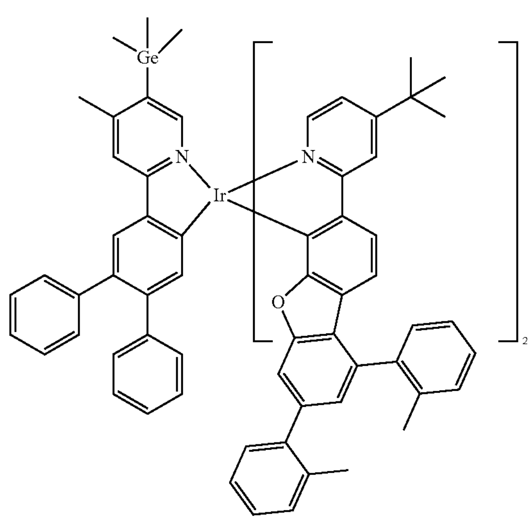
-continued
5101
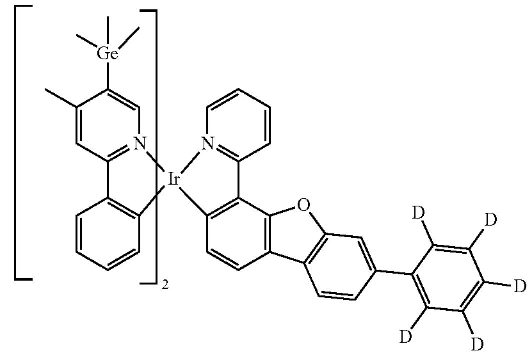
5102
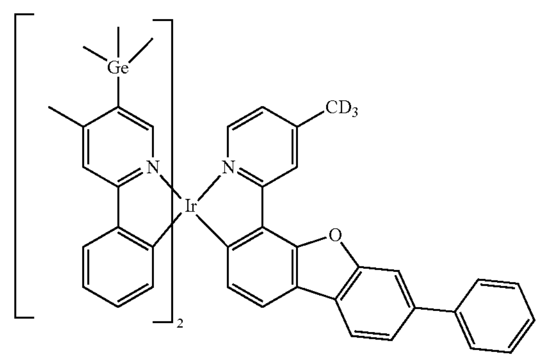
5103
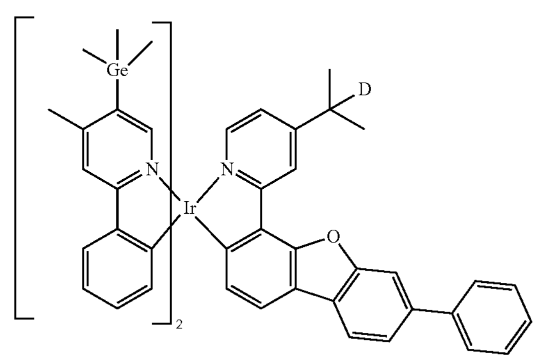
5104
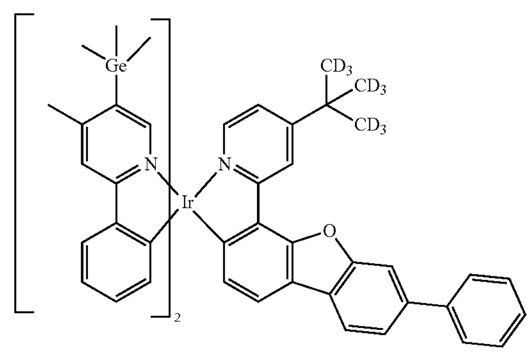

-continued
5105
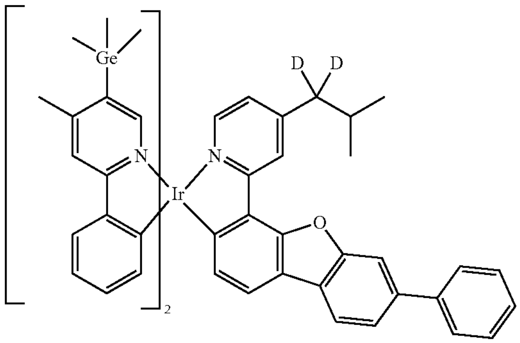
5106
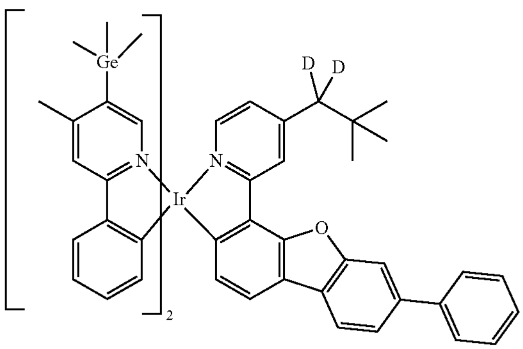
5107
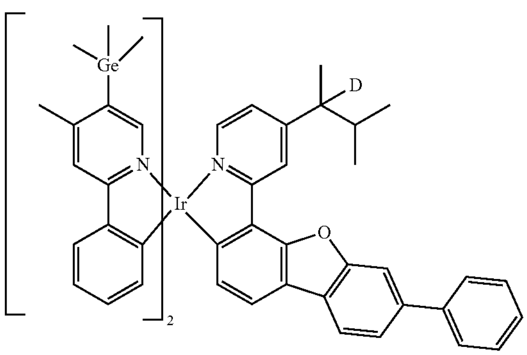
5108
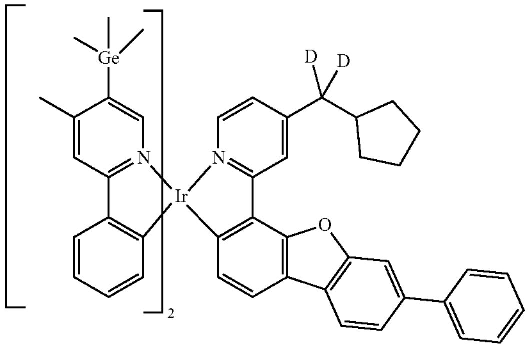
-continued
5109
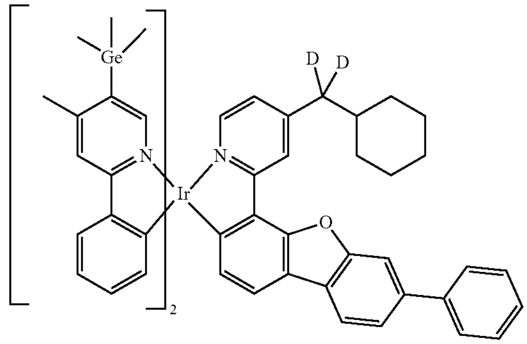
5110
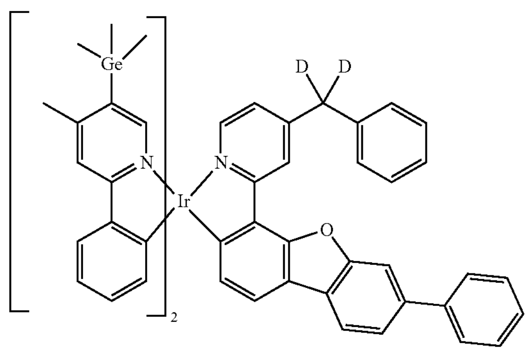
5111
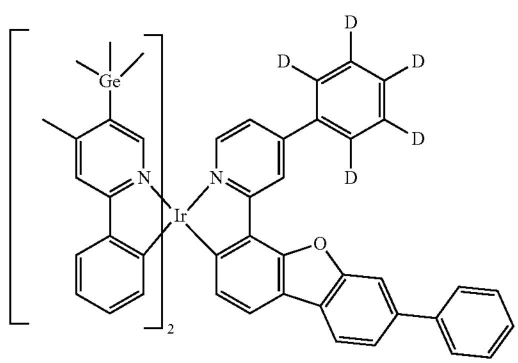
5112
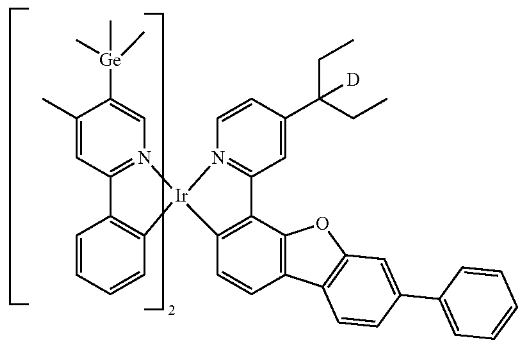

-continued
5113
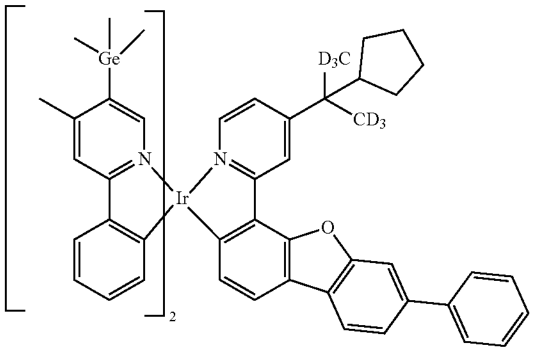
5114
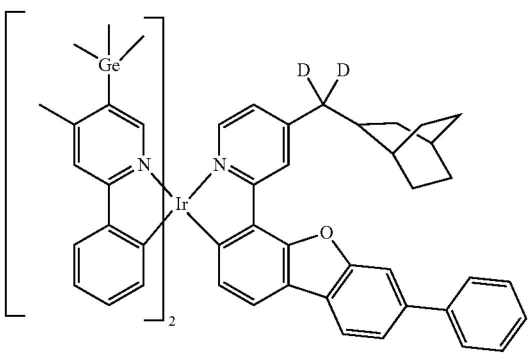
5115
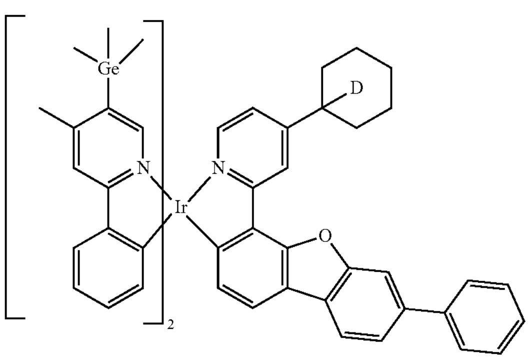
5116
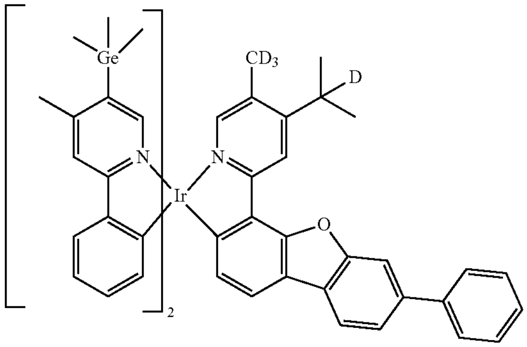
5117
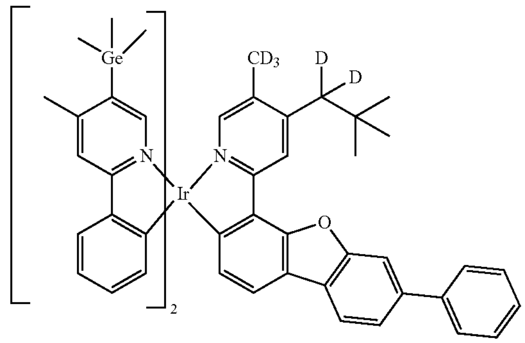
5118
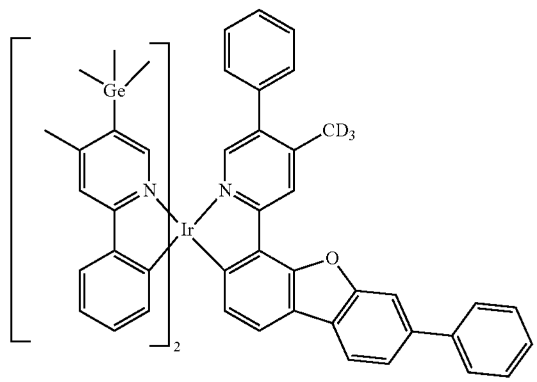
5119
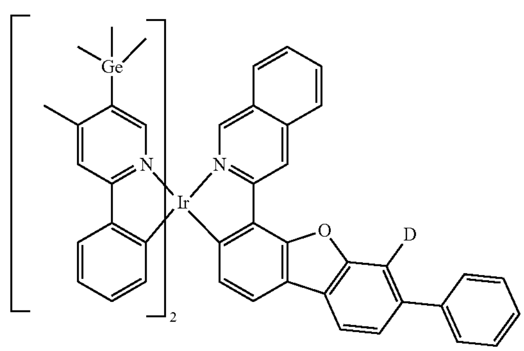
5120
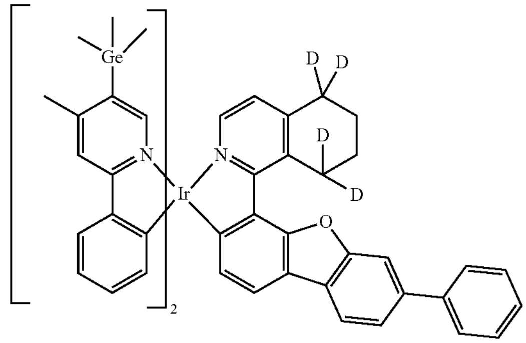

-continued
5121
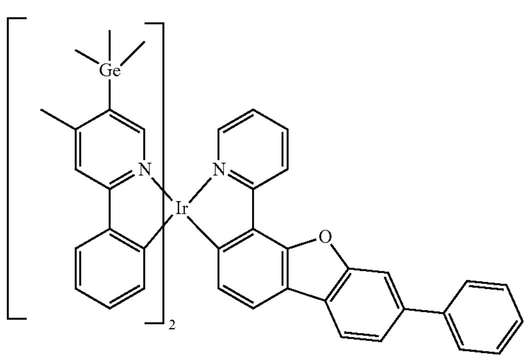
5122
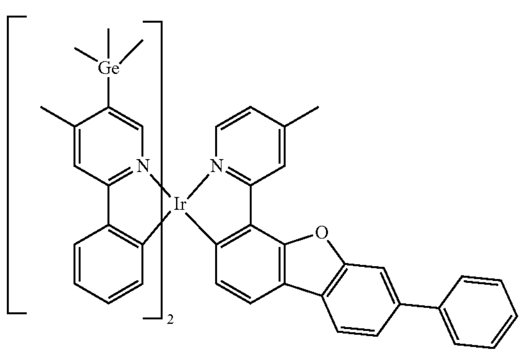
5123
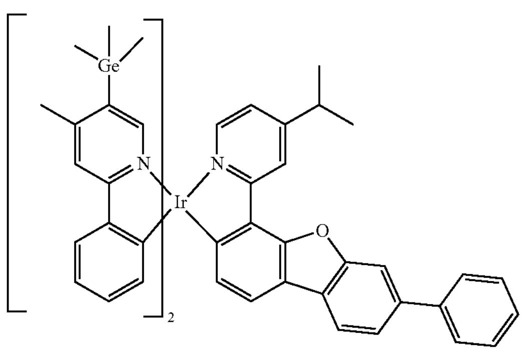
5124
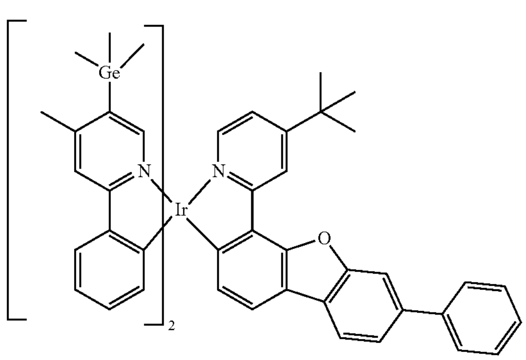
-continued
5125
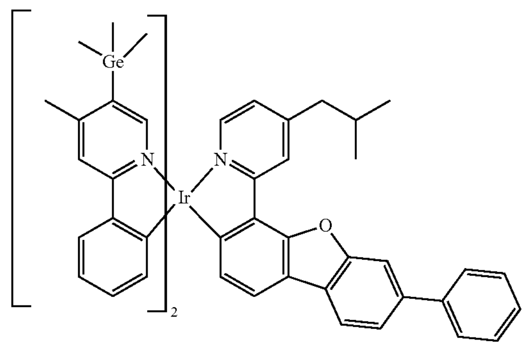
5126
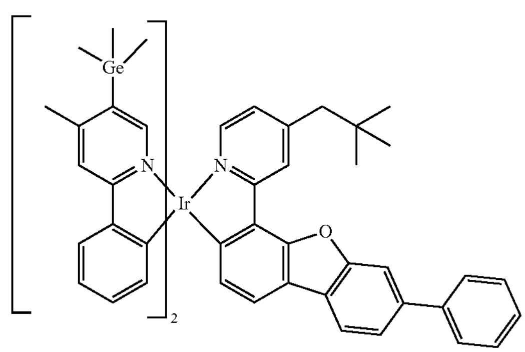
5127
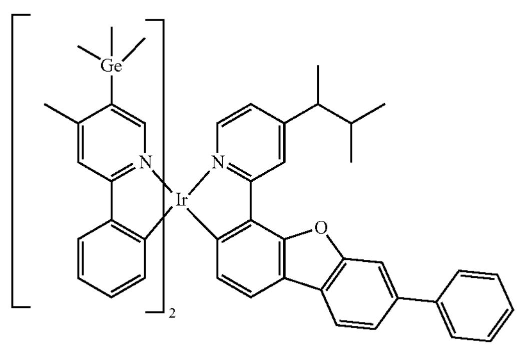
5128
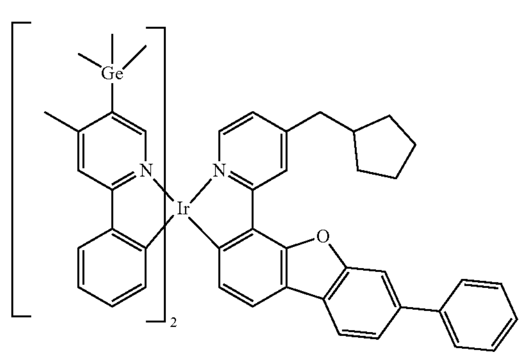

-continued
5129
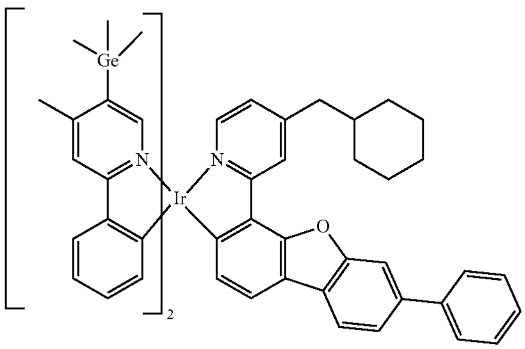
5130
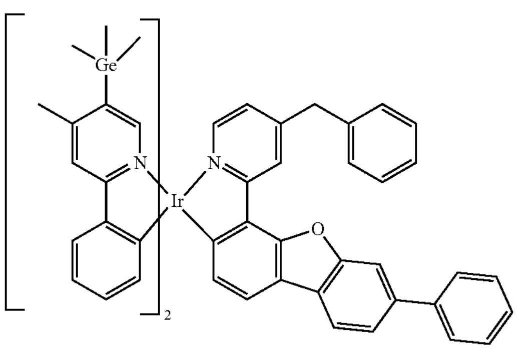
5131
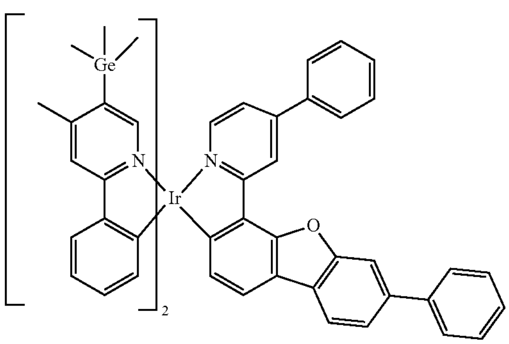
5132
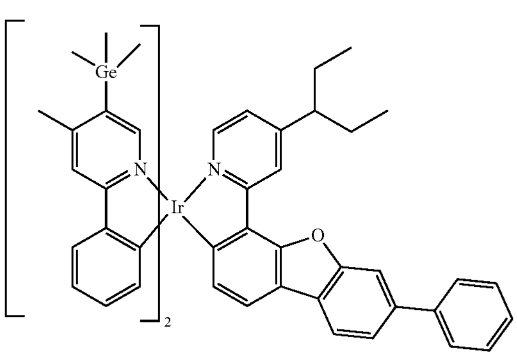
-continued
5133
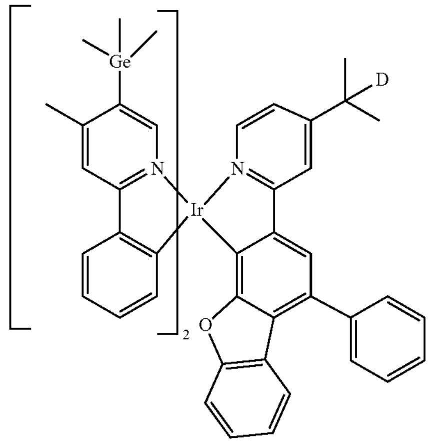
5134
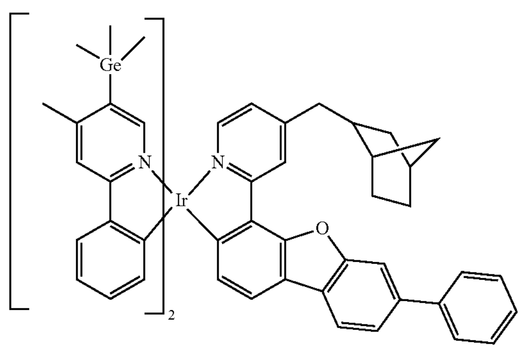
5135
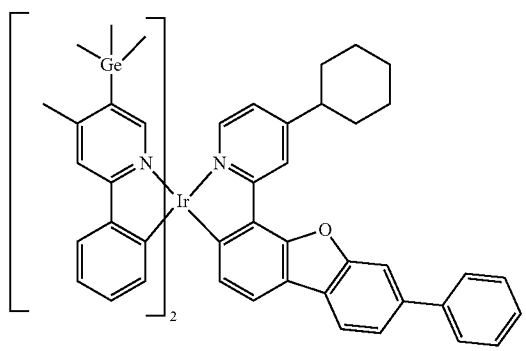
5136
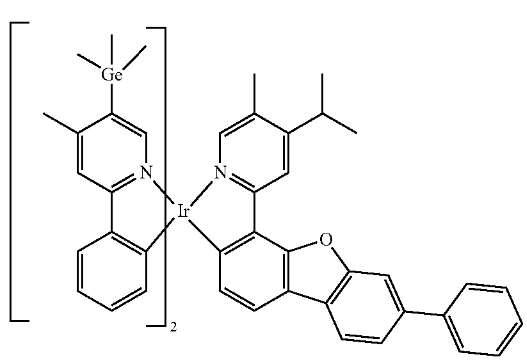

-continued

5137

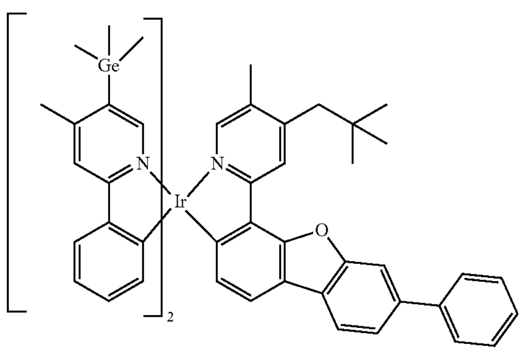

5138

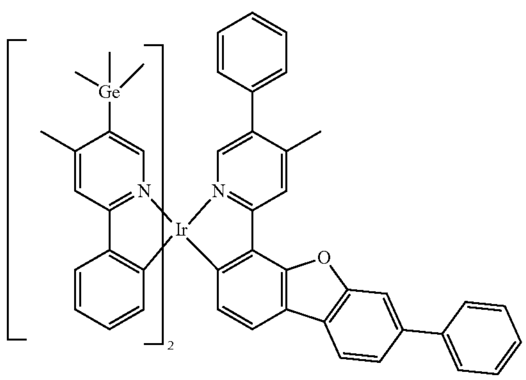

5139

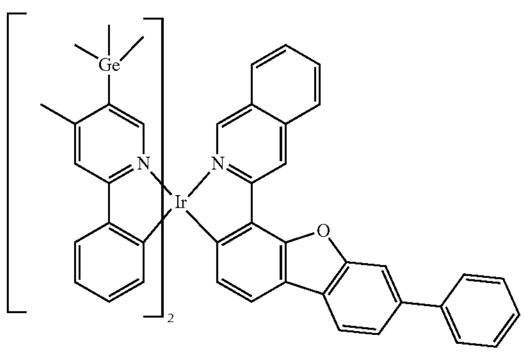

5140

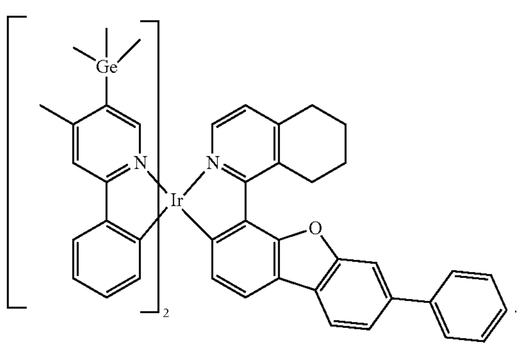

In the organometallic compound represented by Formula 1, $L_1$ may be a ligand represented by Formula 2A, n1, i.e., the number of $L_1$(s), may be 1 or 2, $L_2$ may be a ligand represented by Formula 2B, n2, i.e., the number of $L_2$(s) may be 1 or 2, and $L_1$ and $L_2$ may be different from each other. That is, the organometallic compound may be heteroleptic complex that may essentially include, as ligands bound to metal M, at least one ligand represented by Formula 2A and at least one ligand represented by Formula 2B.

In Formula 1, a group represented by $*—X_1(R_{21})(R_{22})(R_{23})$ may be bound to the 5'-position of a pyridine ring in the ligand represented by Formula 2B (see Formula 2B). Accordingly, the organometallic compound including the ligand represented by Formula 2B may have excellent heat resistance and decomposition resistance. Therefore, an electronic device, e.g., an organic light-emitting device, including the organometallic compound may have excellent stability and long lifespan upon manufacture, storage, and/or driving.

$Ar_2$ in Formula 2A of Formula 1 may be ring $CY_2$ unsubstituted or substituted with at least one $Z_0$, and ring $CY_2$ may be an unsaturated $C_5$-$C_{30}$ carbocyclic group or an unsaturated $C_1$-$C_{30}$ heterocyclic group, and d2, i.e., the number of $Ar_2$, may be an integer from 1 to 6. Thus, the organometallic compound represented by Formula 1 may have improved optical orientation characteristics, and the organometallic compound represented by Formula 1 may have a relatively narrow full width at half maximum (FWHM) of an emission spectrum or electroluminescence spectrum, and accordingly, an electronic device, e.g., an organic light-emitting device, including the organometallic compound may have improved emission efficiency.

In addition, the number of N(s) among $T_1$ to $T_8$ in Formula 2A of Formula 1 may be 0 or 1. Thus, the organometallic compound represented by Formula 1 may have stable highest occupied molecular orbital (HOMO) and lowest unoccupied molecular orbital (LUMO) energy levels, which lead to improved lifespan of an electronic device, e.g., an organic light-emitting device, including the organometallic compound.

The highest occupied molecular orbital (HOMO) energy level, lowest unoccupied molecular orbital (LUMO) energy level, lowest excited singlet ($S_1$) energy level, and lowest excited triplet ($T_1$) energy level in electron volts (eV) of selected organometallic compounds represented by Formula 1 were calculated using a density functional theory (DFT) method of the Gaussian 09 program with the molecular structure optimization at the B3LYP level. The results thereof are shown in Table 1.

TABLE 1

| Compound No. | HOMO (eV) | LUMO (eV) | $S_1$ (eV) | $T_1$ (eV) |
|---|---|---|---|---|
| 21 | −4.757 | −1.273 | 2.821 | 2.461 |
| 46 | −4.718 | −1.241 | 2.826 | 2.487 |
| 403 | −4.751 | −1.235 | 2.852 | 2.482 |
| 487 | −4.722 | −1.217 | 2.856 | 2.488 |
| 1657 | −4.799 | −1.222 | 2.928 | 2.516 |
| 2376 | −4.690 | −1.178 | 2.854 | 2.507 |
| 3272 | −4.793 | −1.217 | 2.890 | 2.525 |
| 3803 | −4.784 | −1.257 | 2.861 | 2.489 |

Referring to the results of Table 1, the organometallic compound represented by Formula 1 was found to have suitable electrical characteristics for use as a dopant in an electronic device, e.g., an organic light-emitting device.

A method of synthesizing the organometallic compound represented by Formula 1 may be apparent to one of ordinary skill in the art by referring to Synthesis Examples provided herein.

The organometallic compound represented by Formula 1 may be suitable for use in an organic layer of an organic light-emitting device, e.g., as a dopant in the organic layer. Thus, according to another aspect, there is provided an organic light-emitting device that may include a first electrode; a second electrode; and an organic layer located between the first electrode and the second electrode and including an emission layer, wherein the organic layer may include at least one organometallic compound represented by Formula 1.

Since the organic light-emitting device has an organic layer including the organometallic compound represented by Formula 1, the organic light-emitting device may have a high external quantum efficiency and high lifespan characteristics.

The organometallic compound represented by Formula 1 may be used in a pair of electrodes of an organic light-emitting device. For example, the organometallic compound represented by Formula 1 may be included in the emission layer. In this embodiment, the organometallic compound may serve as a dopant and the emission layer may further include a host (that is, an amount of the organometallic compound represented by Formula 1 may be smaller than that of the host). The emission layer, for example, may emit green light or blue light.

As used herein, the expression the "(organic layer) includes at least one organometallic compound" may be construed as meaning the "(organic layer) may include one organometallic compound of Formula 1 or two different organometallic compounds of Formula 1".

For example, Compound 1 may only be included in the organic layer as an organometallic compound. In this embodiment, Compound 1 may be included in the emission layer of the organic light-emitting device. In one or more embodiments, Compounds 1 and 2 may be included in the organic layer as organometallic compounds. In this embodiment, Compounds 1 and 2 may both be included in the same layer (for example, both Compounds 1 and 2 may be included in the emission layer).

The first electrode may be an anode, which is a hole injection electrode, and the second electrode may be a cathode, which is an electron injection electrode. In one or more embodiments, the first electrode may be a cathode, which is an electron injection electrode, and the second electrode may be an anode, which is a hole injection electrode.

For example, in the organic light-emitting device, the first electrode may be an anode, the second electrode may be a cathode, and the organic layer may further include a hole transport region between the first electrode and the emission layer and an electron transport region between the emission layer and the second electrode, wherein the hole transport region may include a hole injection layer, a hole transport layer, an electron blocking layer, a buffer layer, or a combination thereof, and the electron transport region may include a hole blocking layer, an electron transport layer, an electron injection layer, or a combination thereof.

The term "organic layer" as used herein refers to a single and/or a plurality of layers between the first electrode and the second electrode in an organic light-emitting device. The "organic layer" may include not only organic compounds but also organometallic complexes including metals.

FIG. 1 illustrates a schematic cross-sectional view of an organic light-emitting device 10 according to one or more embodiments. Hereinafter, a structure of an organic light-emitting device according to one or more embodiments and a method of manufacturing the organic light-emitting device will be described with reference to FIG. 1. The organic light-emitting device 10 may include a first electrode 11, an organic layer 15, and a second electrode 19, which may be sequentially layered in this stated order.

A substrate may be additionally disposed under the first electrode 11 or on the second electrode 19. The substrate may be a conventional substrate used in organic light-emitting devices, e.g., a glass substrate or a transparent plastic substrate, each having excellent mechanical strength, thermal stability, transparency, surface smoothness, ease of handling, and water repellency.

The first electrode 11 may be formed by depositing or sputtering, onto the substrate, a material for forming the first electrode 11. The first electrode 11 may be an anode. The material for forming the first electrode 11 may include a material with a high work function for easy hole injection. The first electrode 11 may be a reflective electrode, a semi-transmissive electrode, or a transmissive electrode. The material for forming the first electrode 11 may be indium tin oxide (ITO), indium zinc oxide (IZO), tin oxide ($SnO_2$), or zinc oxide (ZnO). In one or more embodiments, the material for forming the first electrode 110 may be a metal, such as magnesium (Mg), aluminum (Al), aluminum-lithium (Al—Li), calcium (Ca), magnesium-indium (Mg—In), magnesium-silver (Mg—Ag), or the like.

The first electrode 11 may have a single-layered structure or a multi-layered structure including a plurality of layers. In one or more embodiments, the first electrode 11 may have a triple-layered structure of ITO/Ag/ITO.

The organic layer 15 may be on the first electrode 11.

The organic layer 15 may include a hole transport region, an emission layer, and an electron transport region.

The hole transport region may be between the first electrode 11 and the emission layer.

The hole transport region may include a hole injection layer, a hole transport layer, an electron blocking layer, a buffer layer, or a combination thereof.

The hole transport region may include a hole injection layer only or a hole transport layer only. In one or more embodiments, the hole transport region may include a hole injection layer and a hole transport layer which are sequentially stacked on the first electrode 11. In one or more embodiments, the hole transport region may include a hole injection layer, a hole transport layer, and an electron blocking layer, which are sequentially stacked on the first electrode 11.

When the hole transport region includes a hole injection layer, the hole injection layer may be formed on the first electrode 11 by using one or more suitable methods, such as vacuum deposition, spin coating, casting, and Langmuir-Blodgett (LB) deposition.

When a hole injection layer is formed by vacuum deposition, for example, the vacuum deposition may be performed at a deposition temperature in a range of about 100° C. to about 500° C., at a vacuum degree in a range of about $10^{-8}$ torr to about $10^{-3}$ torr, and at a deposition rate in a range of about 0.01 Angstroms per second (A/sec) to about 100 Å/sec, though the conditions may vary depending on a compound that is used as a hole injection material and a structure and thermal properties of a desired hole injection layer.

When a hole injection layer is formed by spin coating, the spin coating may be performed at a coating rate in a range of about 2,000 revolutions per minute (rpm) to about 5,000 rpm, and at a temperature in a range of about 80° C. to 200° C., to facilitate removal of a solvent after the spin coating, though the conditions may vary depending on a compound that is used as a hole injection material and a structure and thermal properties of a desired hole injection layer.

The conditions for forming a hole transport layer and an electron blocking layer may be inferred from the conditions for forming the hole injection layer.

The hole transport region may include m-MTDATA, TDATA, 2-TNATA, NPB, β-NPB, TPD, spiro-TPD, spiro-NPB, methylated-NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor-sulfonic acid (PANI/CSA), polyaniline/poly(4-styrene sulfonate) (PANI/PSS), a compound represented by Formula 201, a compound represented by Formula 202, or a combination thereof:

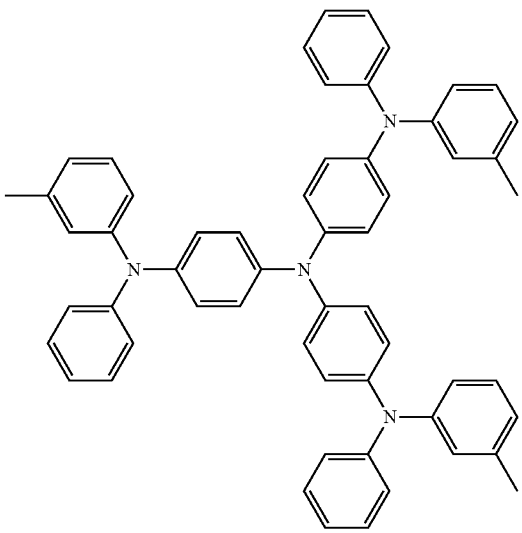

m-MTDATA

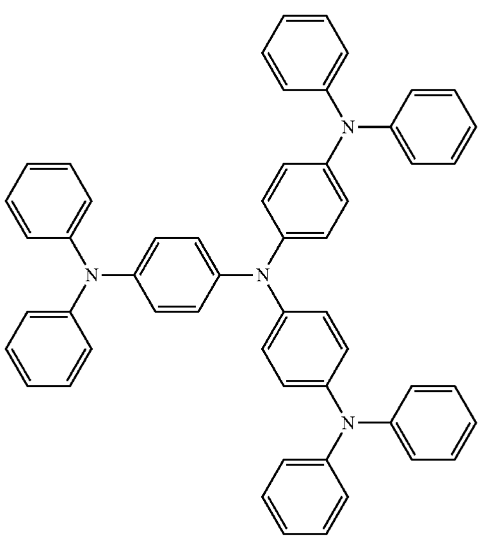

TDATA

-continued

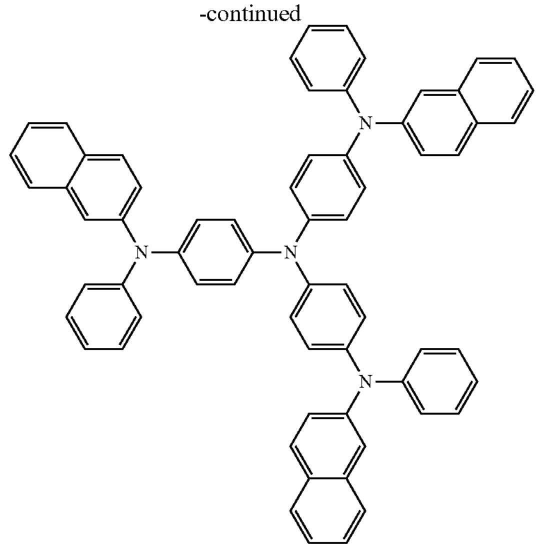

2-TNATA

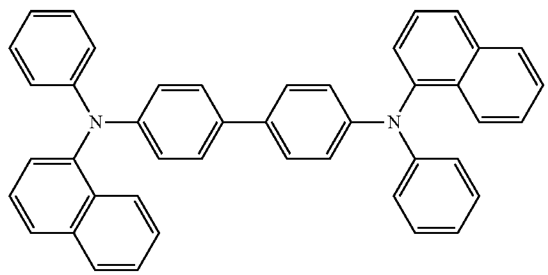

NPB

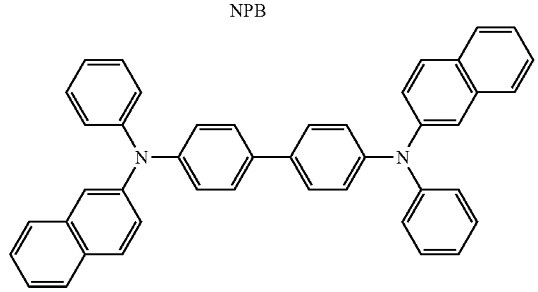

β-NPB

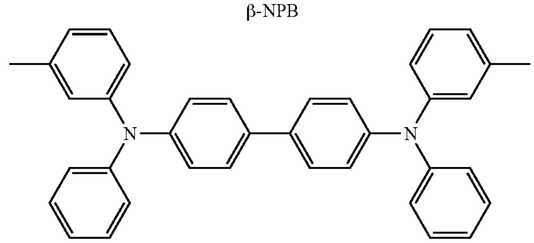

TPD

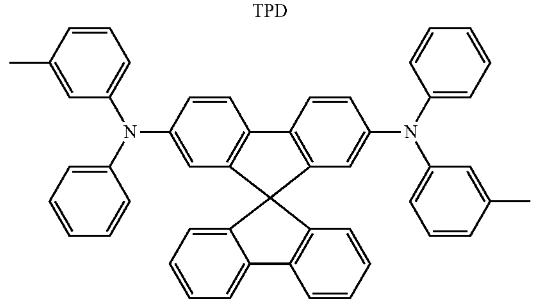

Spiro-TPD

-continued

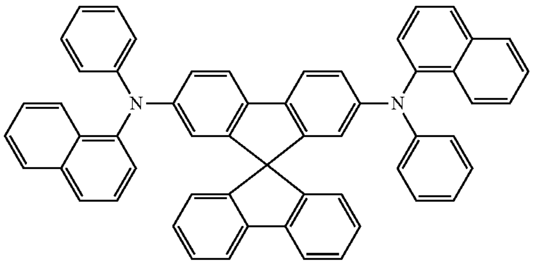

Spiro-NPB

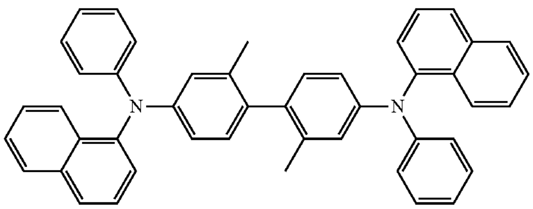

methylated NPB

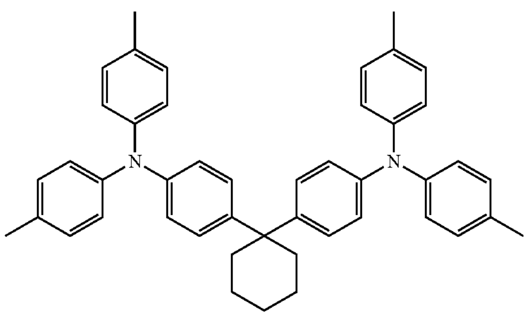

TAPC

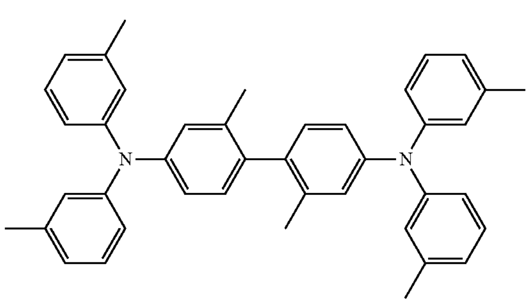

HMTPD

-continued

Formula 201

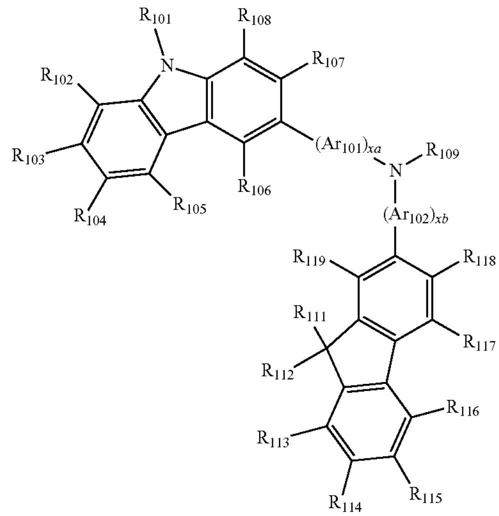

Formula 202

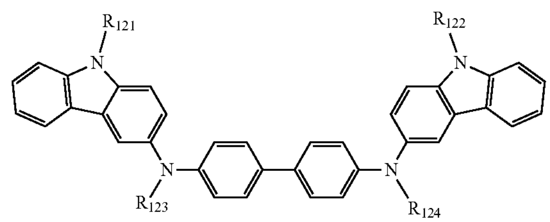

wherein, in Formula 201, $Ar_{101}$ and $Ar_{102}$ may each independently be a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{10}$ cycloalkyl group, a $C_3$-$C_{10}$ cycloalkenyl group, a $C_1$-$C_{10}$ heterocycloalkyl group, a $C_2$-$C_{10}$ heterocycloalkenyl group, a $C_6$-$C_{60}$ aryl group, a $C_7$-$C_{60}$ alky aryl group, a $C_7$-$C_{60}$ aryl alkyl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_2$-$C_{60}$ heteroaryl alkyl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, or a combination thereof.

In Formula 201, xa and xb may each independently be an integer from 0 to 5. In one or more embodiments, xa and xb may each independently be an integer from 0 to 2. In one or more embodiments, xa may be 1, and xb may be 0.

In Formulae 201 and 202, $R_{101}$ to $R_{108}$, $R_{111}$ to $R_{119}$, and $R_{121}$ to $R_{124}$ may each independently be:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (e.g., a methyl group, an ethyl group, a propyl group, a butyl group, pentyl group, or a hexyl group), or a $C_1$-$C_{10}$ alkoxy group (e.g., a methoxy group, an ethoxy group, a propoxy group, a butoxy group, or a pentoxy group);

a $C_1$-$C_{10}$ alkyl group or a $C_1$-$C_{10}$ alkoxy group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, or a combination thereof; or a phenyl group, a naphthyl group, an anthracenyl group, a fluorenyl group, or a pyrenyl group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, or a combination thereof.

In Formula 201, $R_{109}$ may be a phenyl group, a naphthyl group, an anthracenyl group, or a pyridinyl group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, a pyridinyl group, or a combination thereof.

In one or more embodiments, the compound represented by Formula 201 may be represented by Formula 201A:

Formula 201A

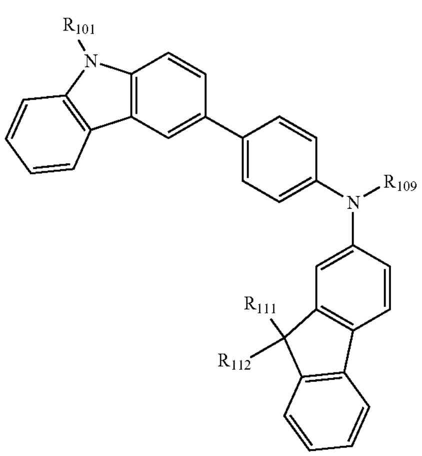

wherein, in Formula 201A, $R_{101}$, $R_{111}$, $R_{112}$, and $R_{109}$ may respectively be understood by referring to the descriptions of $R_{101}$, $R_{111}$, $R_{112}$, and $R_{109}$ provided herein.

In one or more embodiments, the hole transport region may include one or more of Compounds HT1 to HT20:

HT1

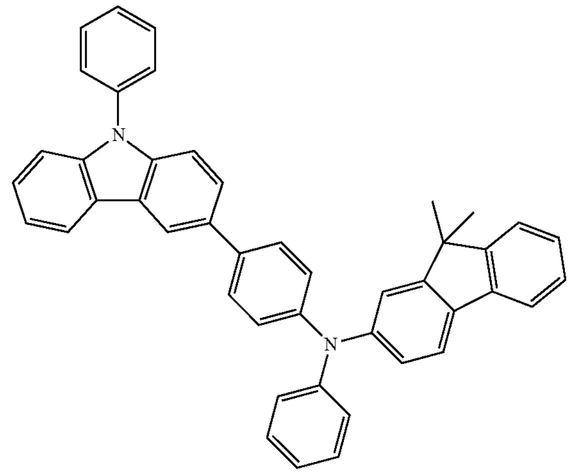

HT2

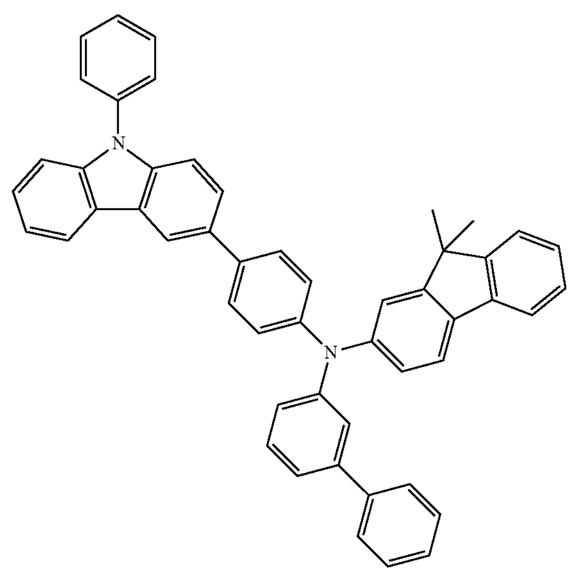

HT3
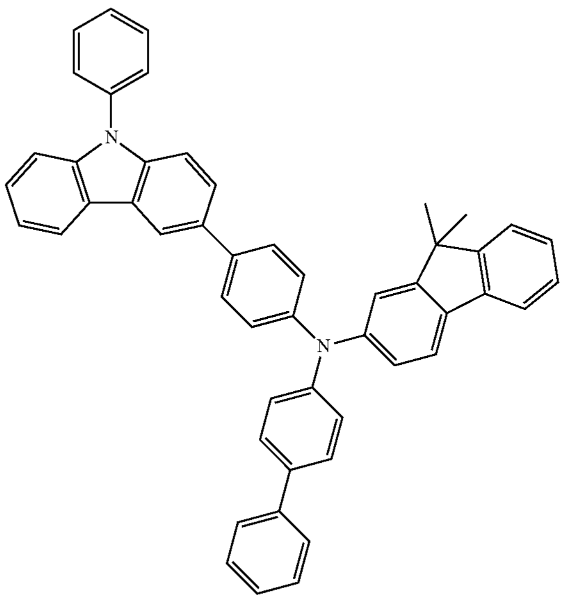
HT4
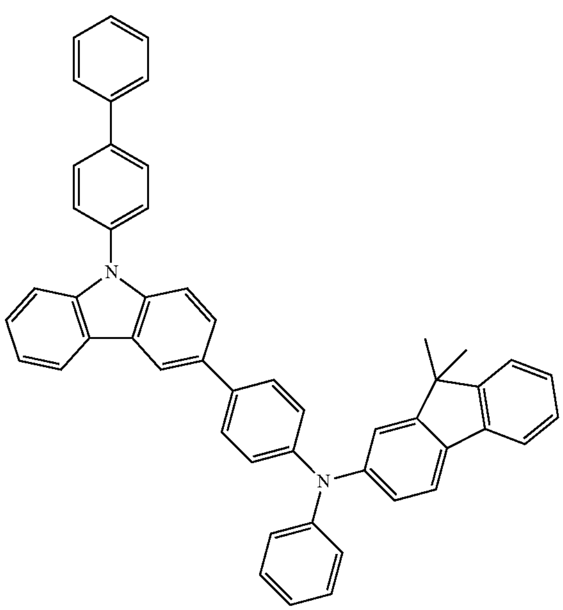
HT5
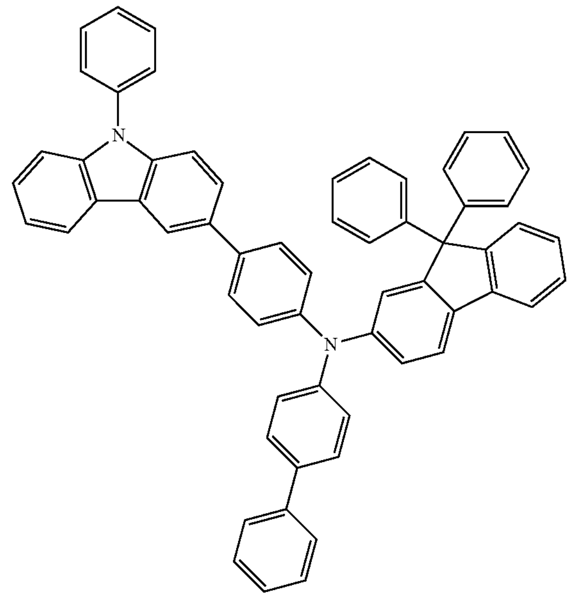
HT6
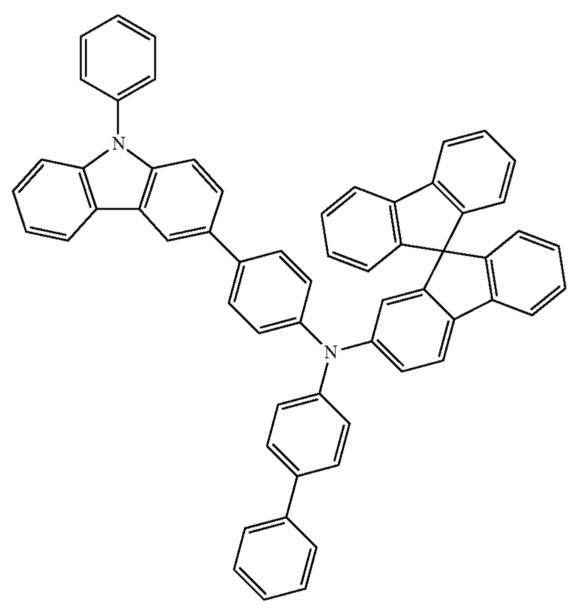

-continued
HT7
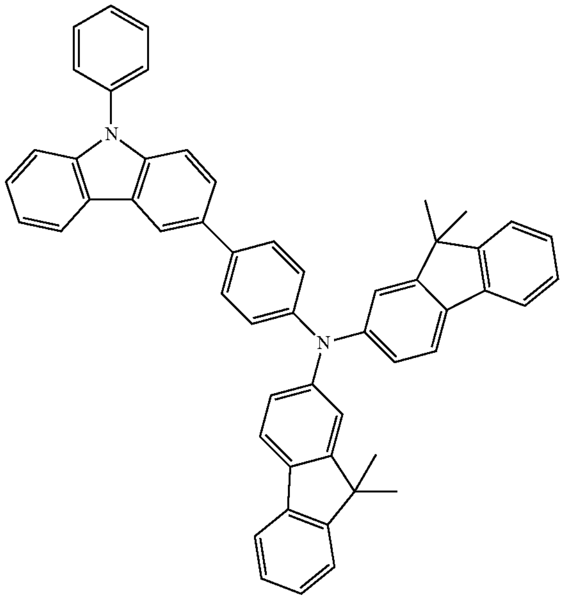
HT8
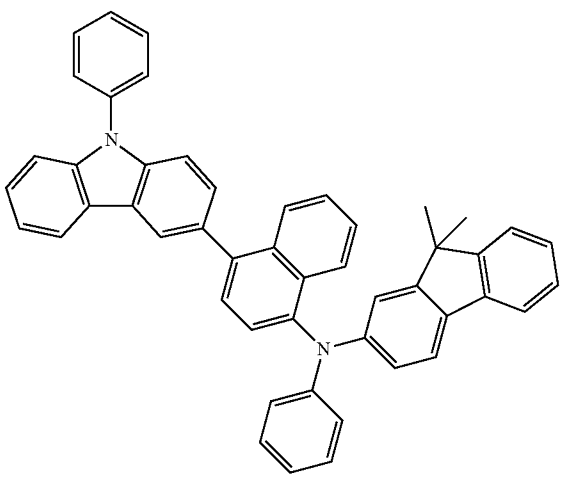
HT9
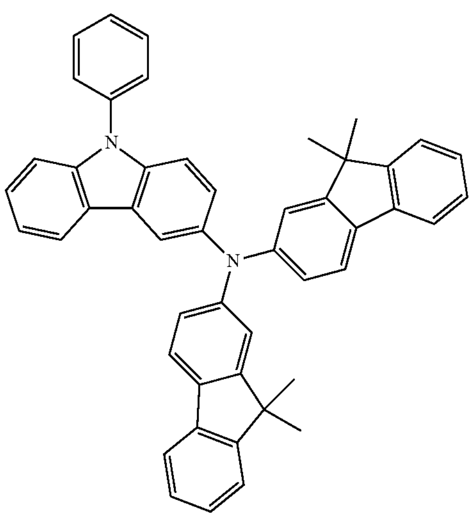
-continued
HT10
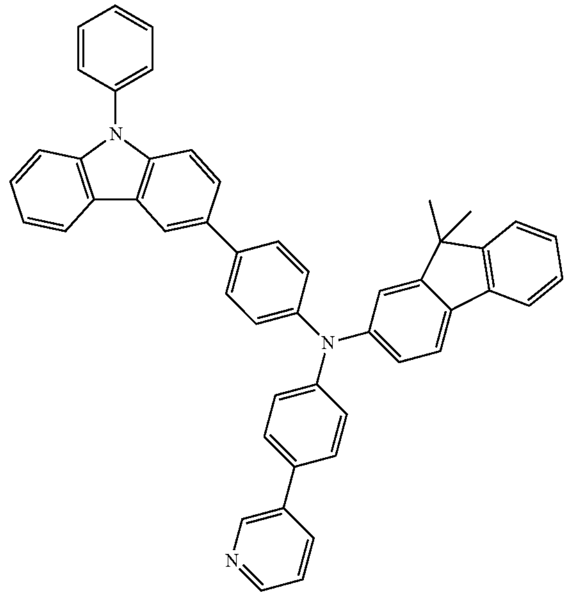
HT11
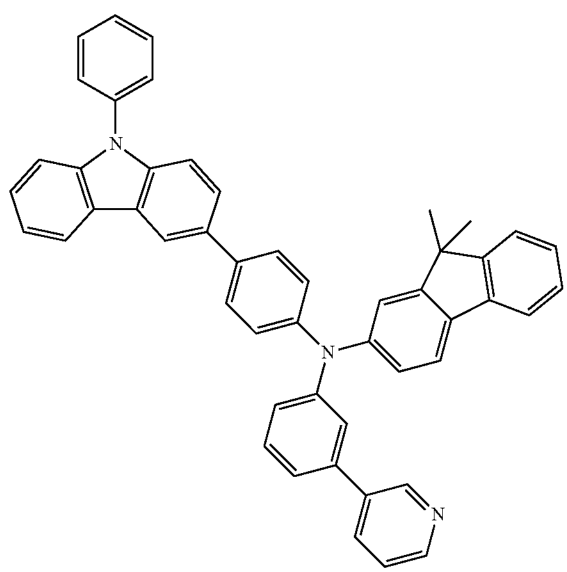

-continued
HT12
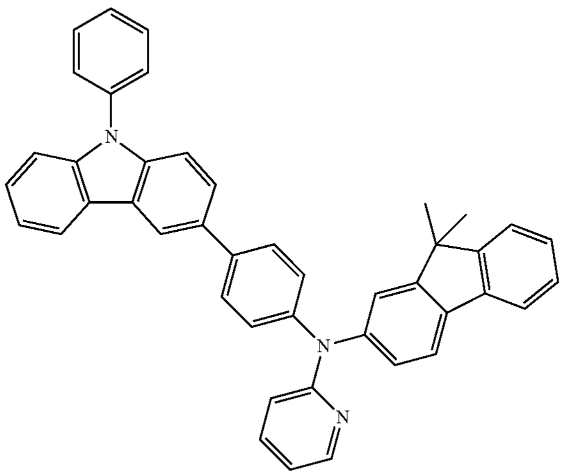
HT13
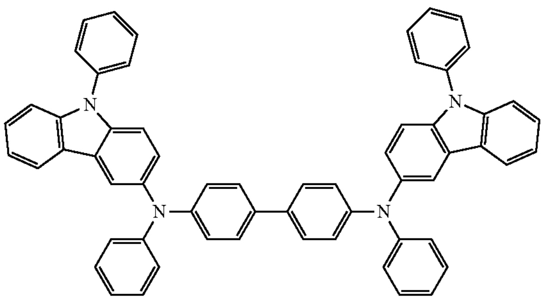
HT14
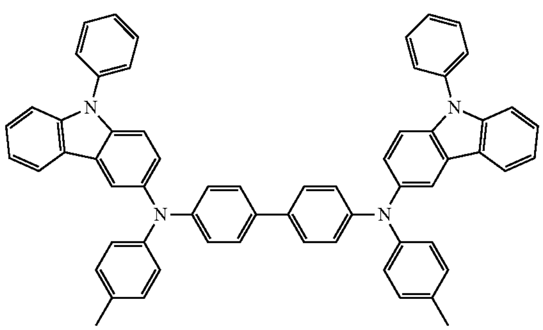
HT15
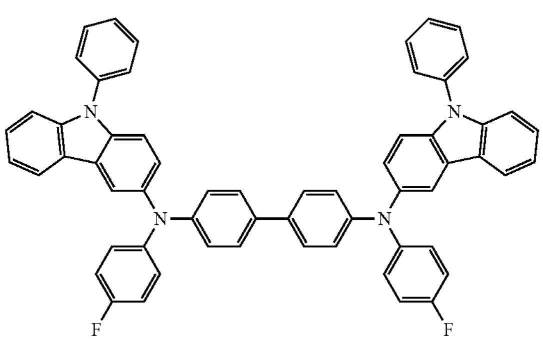
-continued
HT16
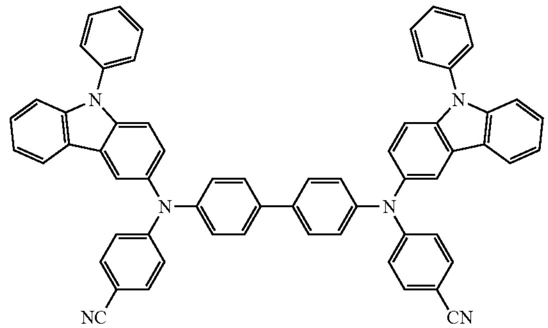
HT17
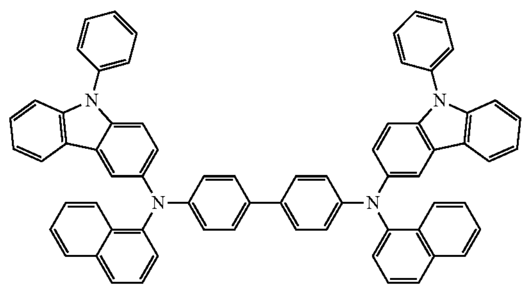
HT18
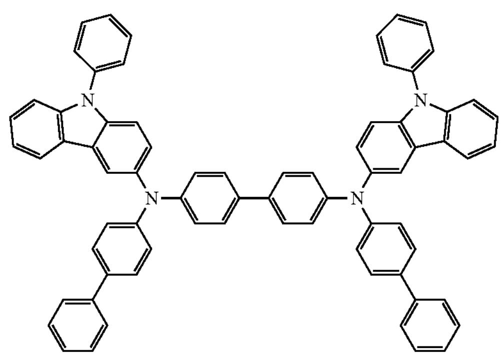
HT19
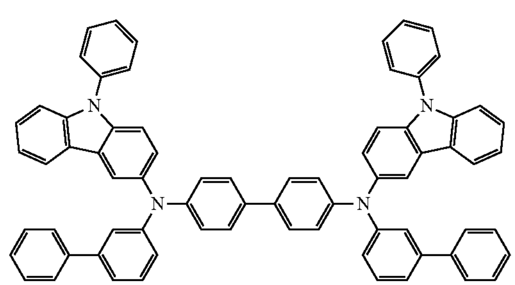

-continued

HT20

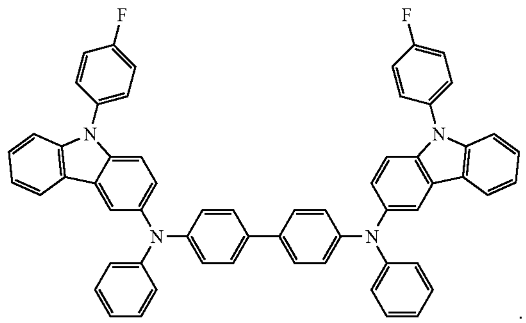

The thickness of the hole transport region may be in a range of about 100 (Angstroms) Å to about 10,000 Å, and in one or more embodiments, about 100 Å to about 1,000 Å. When the hole transport region includes a hole injection layer, a hole transport layer an electron blocking layer, or combination thereof, the thickness of the hole injection layer may be in a range of about 100 Å to about 10,000 Å, and in one or more embodiments, about 100 Å to about 1,000 Å, and the thickness of the hole transport layer may be in a range of about 50 Å to about 2,000 Å, and in one or more embodiments, about 100 Å to about 1,500 Å. When the thicknesses of the hole transport region, the hole injection layer, and the hole transport layer are within any of these ranges, excellent hole transport characteristics may be obtained without a substantial increase in driving voltage.

The hole transport region may include a charge generating material as well as the aforementioned materials, to improve conductive properties of the hole transport region. The charge generating material may be substantially homogeneously or non-homogeneously dispersed in the hole transport region.

The charge generating material may include, for example, a p-dopant. The p-dopant may be a quinone derivative, a metal oxide, a compound containing a cyano group, or a combination thereof. In one or more embodiments, the p-dopant may be a quinone derivative, such as tetracyanoquinodimethane (TCNQ), a 2,3,5,6-tetrafluoro-tetracyano-1,4-benzoquinodimethane (F4-TCNQ), or F6-TCNNQ; a metal oxide, such as a tungsten oxide or a molybdenum oxide; a compound containing a cyano group, such as Compound HT-D1; or a combination thereof:

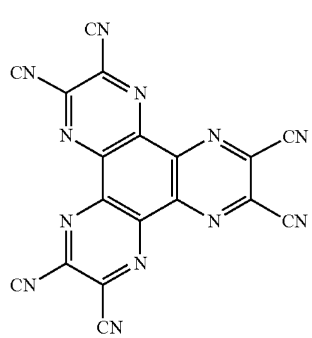

HT-D1

-continued

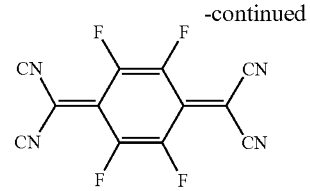

F6-TCNNQ

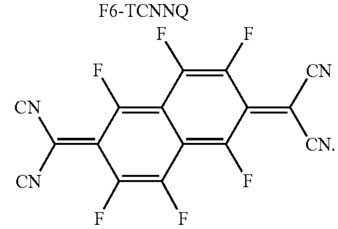

F4-TCNQ

The hole transport region may further include a buffer layer.

The buffer layer may compensate for an optical resonance distance depending on a wavelength of light emitted from the emission layer to improve the efficiency of an organic light-emitting device.

When the hole transport region includes an electron blocking layer, a material for forming the electron blocking layer may include the material for forming a hole transport region, the host material described herein, or a combination thereof. In one or more embodiments, when the hole transport region includes an electron blocking layer, mCP, Compound H-H1, etc. as described herein, or the like, may be used for forming the electron blocking layer.

An emission layer may be formed on the hole transport region by using one or more suitable methods, such as vacuum deposition, spin coating, casting, or LB deposition. When the emission layer is formed by vacuum deposition or spin coating, vacuum deposition and coating conditions for forming the emission layer may be generally similar to those conditions for forming a hole injection layer, though the conditions may vary depending on a compound that is used.

The emission layer may include a host and a dopant, and the dopant may include the organometallic compound represented by Formula 1 described herein.

The host may include TPBi, TBADN, ADN (also known as "DNA"), CBP, CDBP, TCP, mCP, Compound H50, Compound H51, Compound H52, Compound H-H1, Compound H-E43, or a combination thereof.

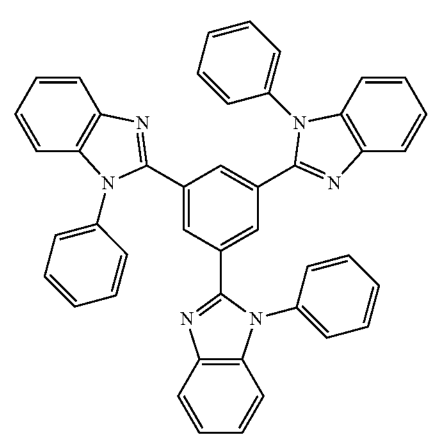

TPBi

-continued
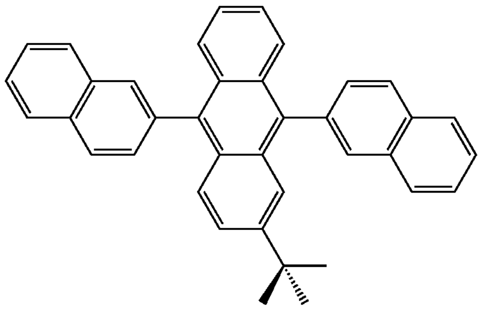
TBADN
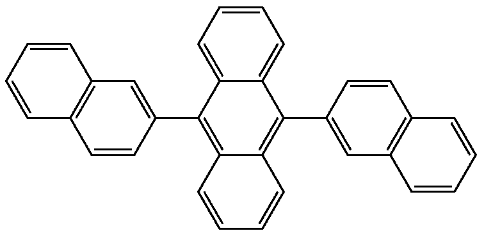
ADN
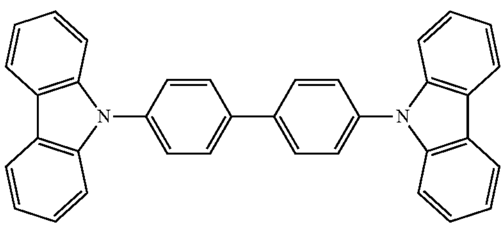
CBP
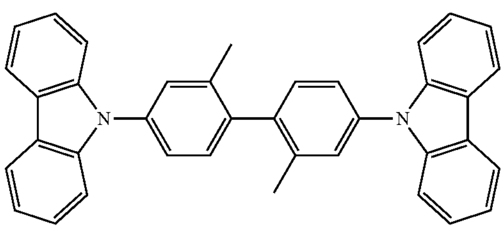
CDBP
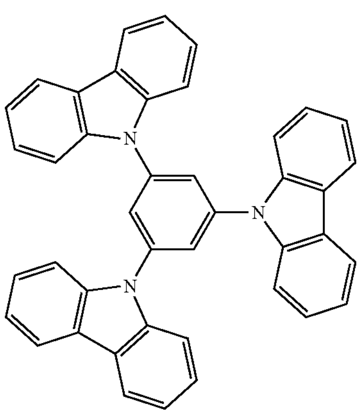
TCP
-continued
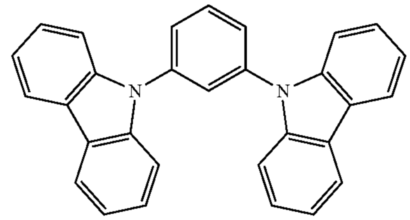
mCP
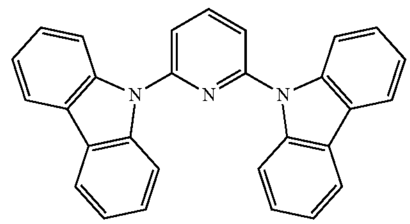
H50
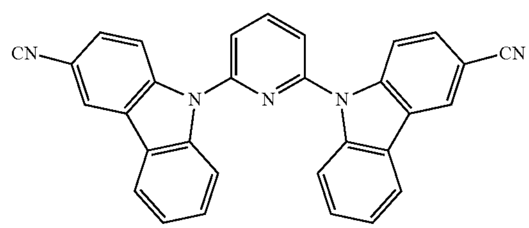
H51
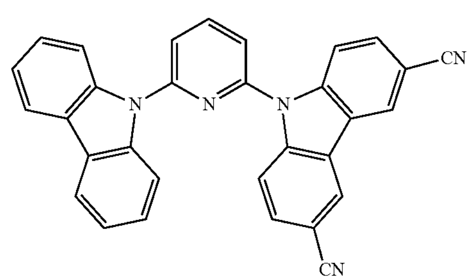
H52

-continued

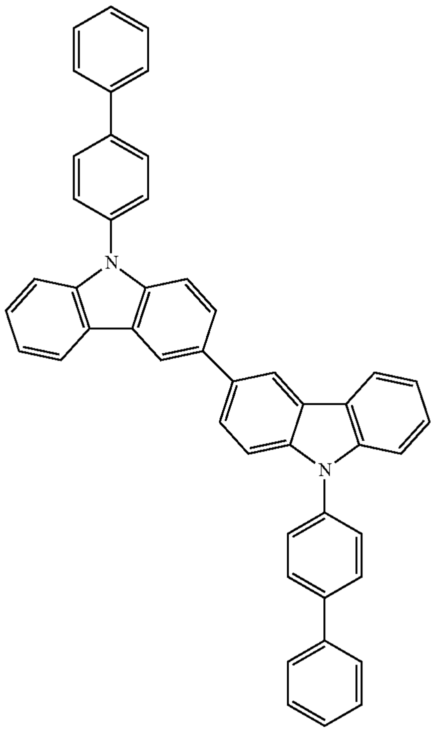

H-H1

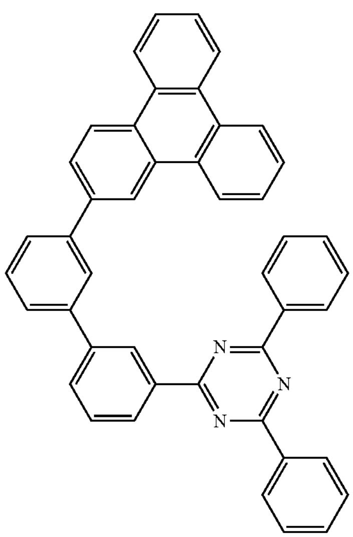

H-E43

When the organic light-emitting device 10 is a full-color organic light-emitting device, the emission layer may be patterned into a red emission layer, a green emission layer, and/or a blue emission layer. In one or more embodiments, the emission layer may have a structure in which the red emission layer, the green emission layer, and/or the blue emission layer are layered to emit white light. In one or more embodiments, the structure of the emission layer may vary.

When the emission layer includes the host and the dopant, an amount of the dopant may be selected from a range of about 0.01 parts to about 15 parts by weight based on about 100 parts by weight of the host.

The thickness of the emission layer may be in a range of about 100 Å to about 1,000 Å, and in one or more embodiments, about 200 Å to about 600 Å. When the thickness of the emission layer is within any of these ranges, improved luminescence characteristics may be obtained without a substantial increase in driving voltage.

Next, an electron transport region may be formed on the emission layer.

The electron transport region may include a hole blocking layer, an electron transport layer, an electron injection layer, or a combination thereof.

In one or more embodiments, the electron transport region may have a hole blocking layer/an electron transport layer/an electron injection layer structure or an electron transport layer/an electron injection layer structure. The electron transport layer may have a single-layered structure or a multi-layered structure including two or more different materials.

The conditions for forming a hole blocking layer, an electron transport layer, and an electron injection layer may be inferred based on the conditions for forming the hole injection layer.

When the electron transport region includes a hole blocking layer, the hole blocking layer may include, for example, BCP, Bphen, BAlq, or any combination thereof:

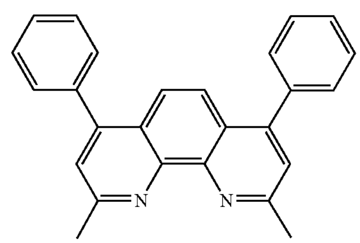

BCP

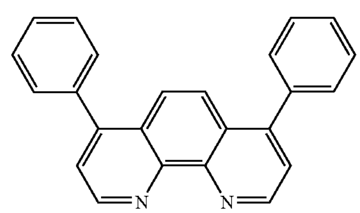

Bphen

The thickness of the hole blocking layer may be in a range of about 20 Å to about 1,000 Å, and in one or more embodiments, about 30 Å to about 600 Å. When the thickness of the hole blocking layer is within any of these ranges, excellent hole blocking characteristics may be obtained without a substantial increase in driving voltage.

The electron transport layer may include BCP, Bphen, TPBi, $Alq_3$, BAlq, TAZ, NTAZ, or a combination thereof:
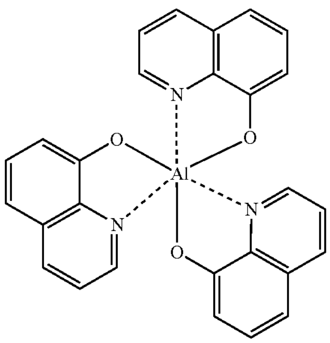
$Alq_3$
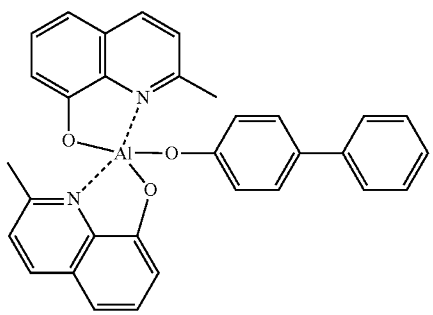
BAlq
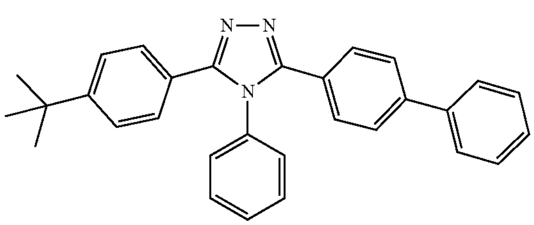
TAZ
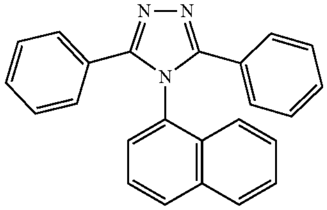
NTAZ
In one or more embodiments, the electron transport layer may include one or more of Compounds ET1 to ET25:
ET1
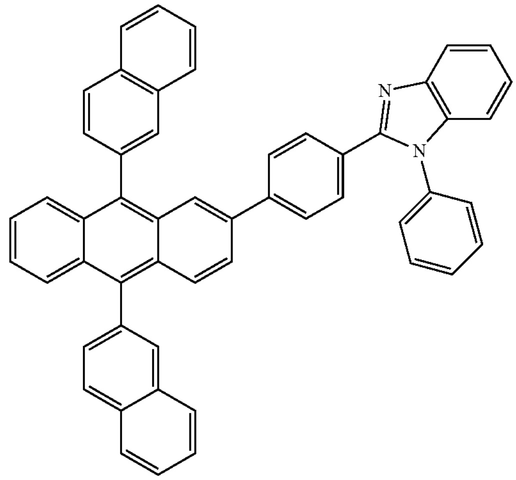
ET2
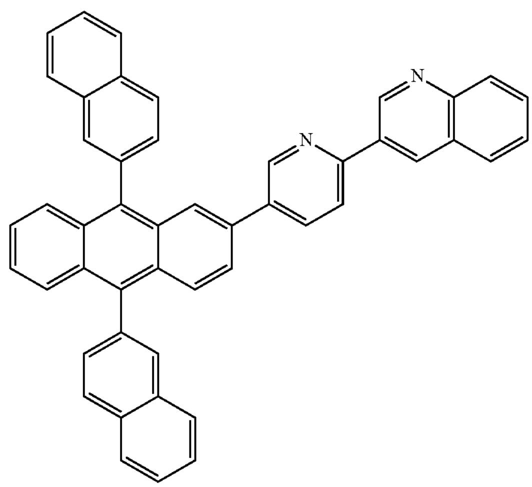
ET3
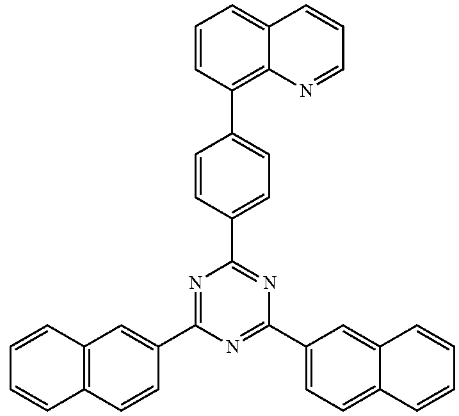

-continued
ET4
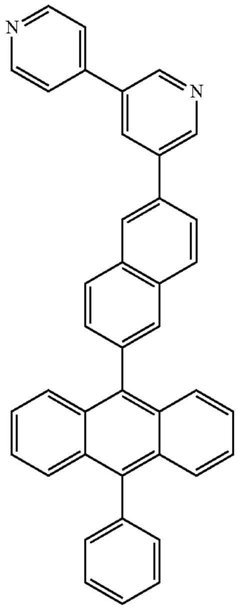
ET5
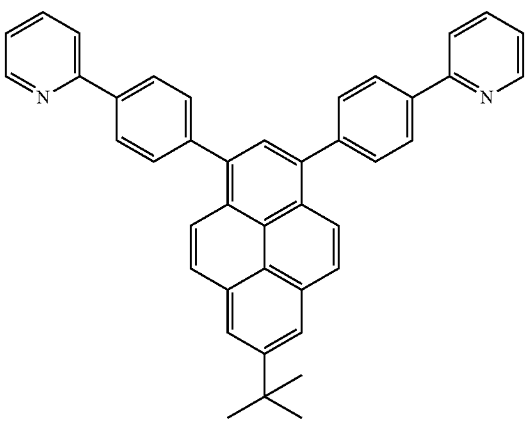
ET6
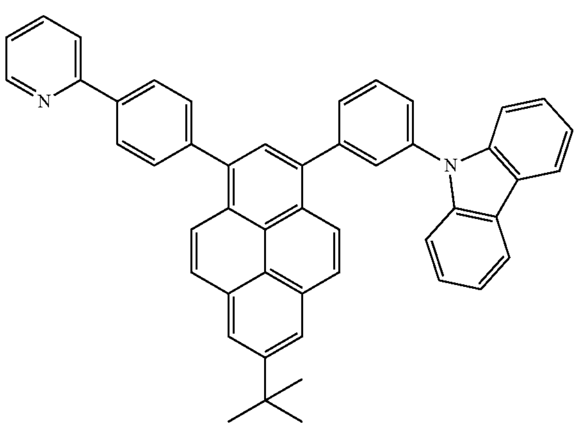
-continued
ET7
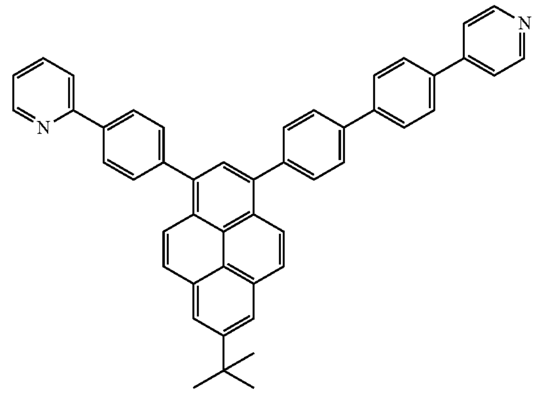
ET8
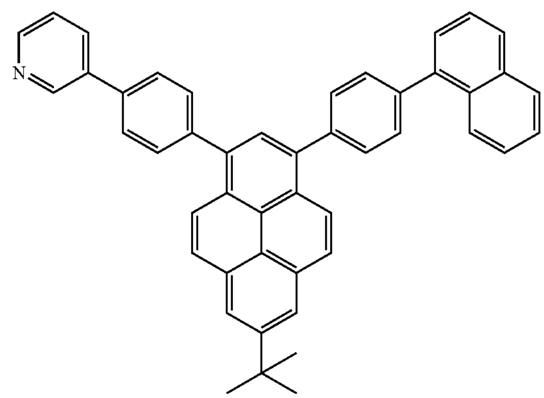
ET9
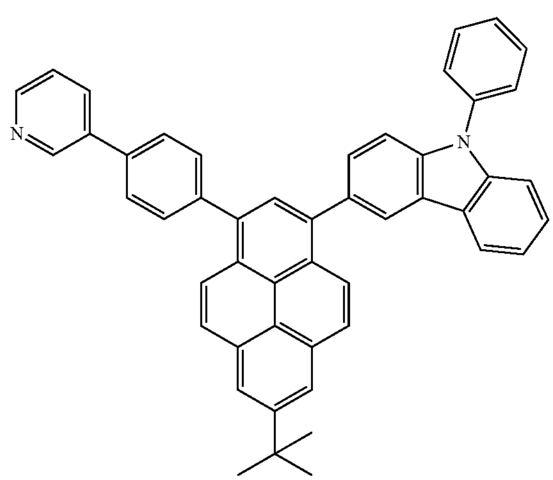

-continued
ET10
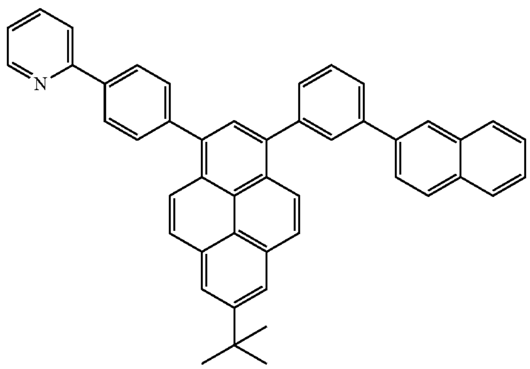
ET11
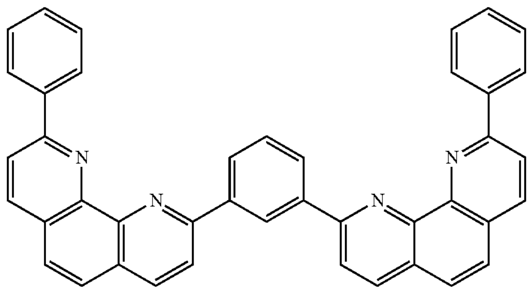
ET12
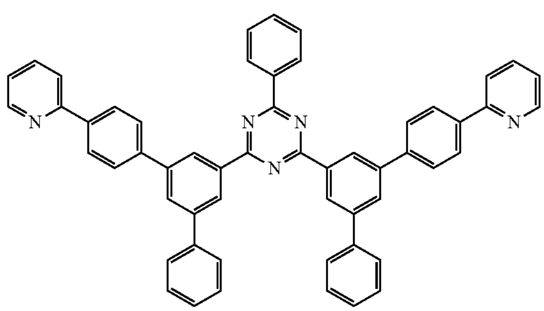
ET13
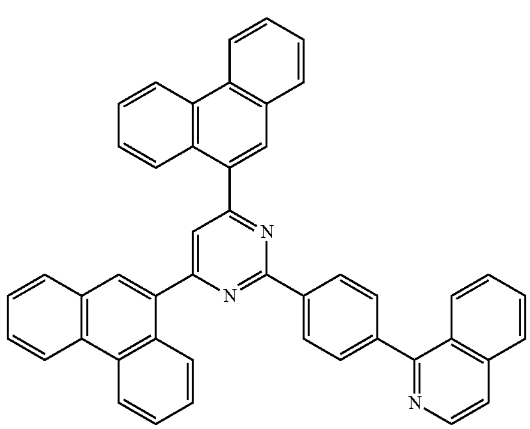
-continued
ET14
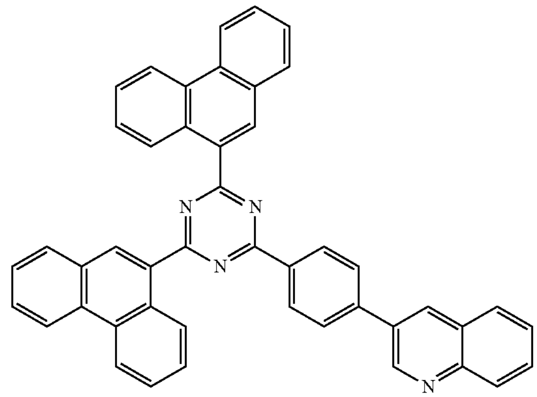
ET15
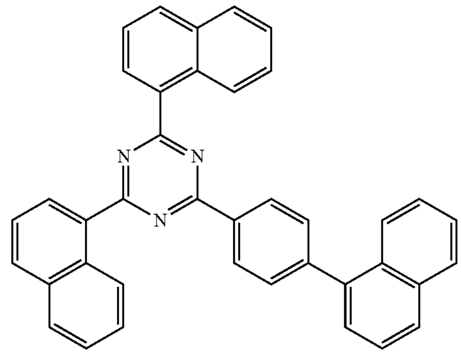
ET16
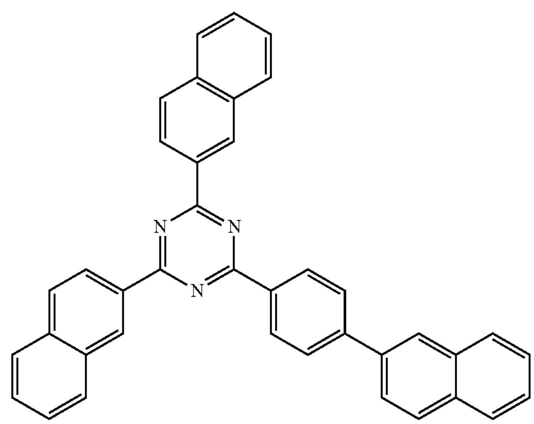
ET17
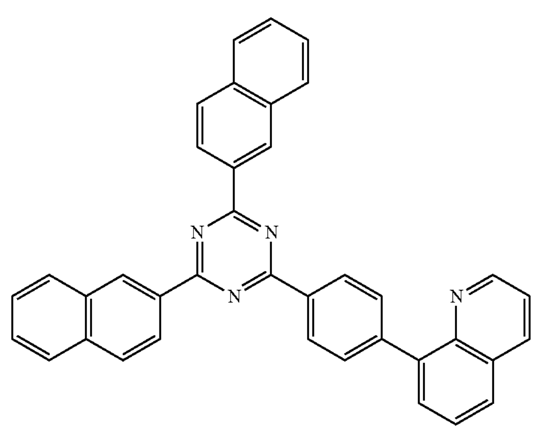

-continued
ET18
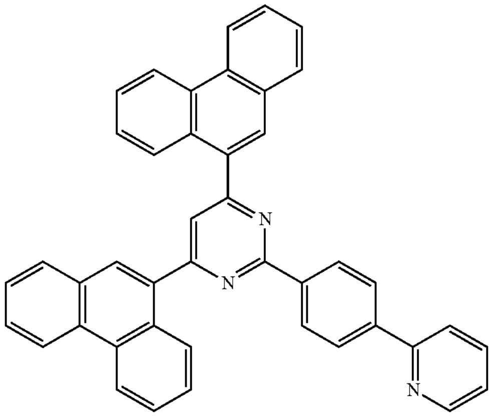
ET19
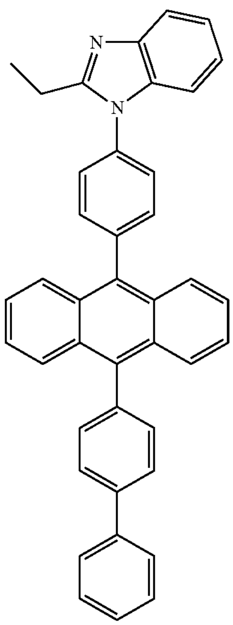
ET20
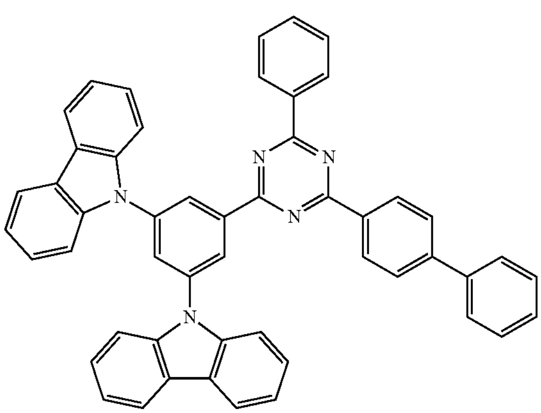
-continued
ET21
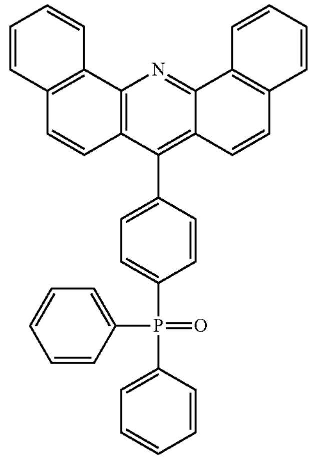
ET22
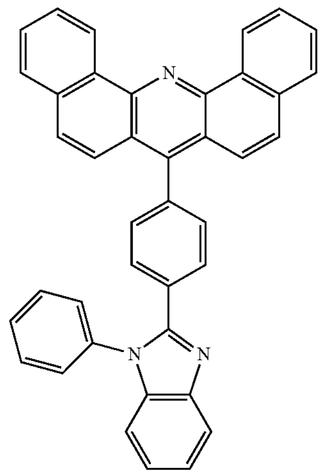
ET23
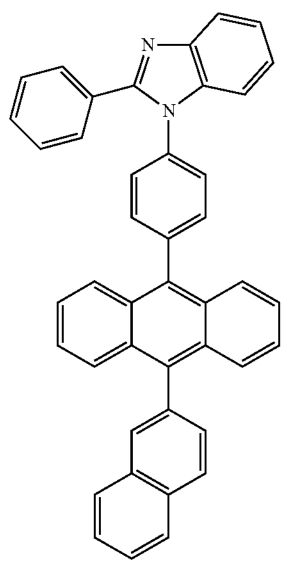

-continued

ET24

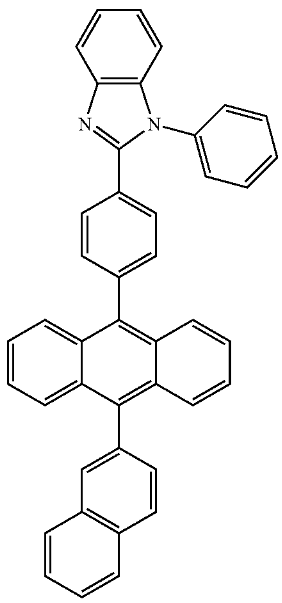

ET25

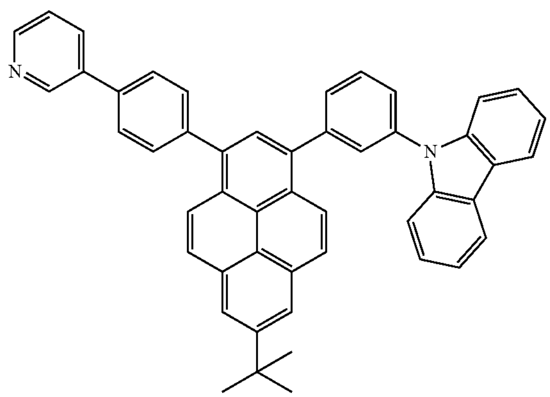

The thickness of the electron transport layer may be in a range of about 100 Å to about 1,000 Å, and in one or more embodiments, about 150 Å to about 500 Å.

When the thickness of the electron transport layer is within any of these ranges, excellent electron transport characteristics may be obtained without a substantial increase in driving voltage.

The electron transport layer may further include a material containing metal, in addition to the materials described above.

The material containing metal may include a Li complex. The Li complex may include, e.g., Compound ET-D1 or Compound ET-D2:

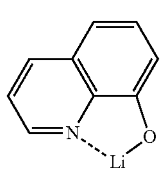

ET-D1

-continued

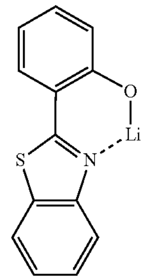

ET-D2

The electron transport region may include an electron injection layer that facilitates electron injection from the second electrode 19.

The electron injection layer may include LiF, NaCl, CsF, $Li_2O$, BaO, or a combination thereof.

The thickness of the electron injection layer may be in a range of about 1 Å to about 100 Å, for example, about 3 Å to about 90 Å. When the thickness of the electron injection layer is within any of these ranges, excellent electron injection characteristics may be obtained without a substantial increase in driving voltage.

The second electrode 19 may be on the organic layer 15. The second electrode 19 may be a cathode. A material for forming the second electrode 19 may be a material with a relatively low work function, such as a metal, an alloy, an electrically conductive compound, or any combination thereof. Examples of the material for forming the second electrode 19 may include lithium (Li), magnesium (Mg), aluminum (Al), silver (Ag), aluminum-lithium (Al—Li), calcium (Ca), magnesium-indium (Mg—In), and magnesium-silver (Mg—Ag). In one or more embodiments, ITO or IZO may be used to form a transmissive second electrode 19 to manufacture a top emission light-emitting device. In one or more embodiments, the material for forming the second electrode 19 may vary.

Hereinbefore the organic light-emitting device 10 has been described with reference to FIG. 1, but embodiments are not limited thereto.

According to an aspect of another embodiment, an electronic apparatus may include the organic light-emitting device. Thus, an electronic apparatus including the organic light-emitting device may be provided. The electronic apparatus may include, for example, a display, lighting, a sensor, or the like.

According to an aspect of still another embodiment, a diagnostic composition may include at least one organometallic compound represented by Formula 1.

Since the organometallic compound represented by Formula 1 provides high luminescence efficiency, the diagnostic efficiency of the diagnostic composition that includes the organometallic compound represented by Formula 1 may be excellent.

The diagnostic composition may be applied in various ways, such as in a diagnostic kit, a diagnostic reagent, a biosensor, or a biomarker.

The term "$C_1$-$C_{60}$ alkyl group" as used herein refers to a linear or branched saturated aliphatic hydrocarbon monovalent group having 1 to 60 carbon atoms, and the term "$C_1$-$C_{60}$ alkylene group" as used herein refers to a divalent group having the same structure as the $C_1$-$C_{60}$ alkyl group.

Examples of the $C_1$-$C_{60}$ alkyl group, the $C_1$-$C_{20}$ alkyl group, and/or the $C_1$-$C_{10}$ alkyl group as used herein may include a methyl group, an ethyl group, an n-propyl group, an iso-propyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group or a tert-decyl group, each unsubstituted or substituted with a methyl group, an ethyl group, an n-propyl group, an iso-propyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, a tert-decyl group, or any combination thereof. In one or more embodiments, Formula 9-33 may be a branched $C_6$ alkyl group. Formula 9-33 may be a tert-butyl group substituted with two methyl groups.

The term "$C_1$-$C_{60}$ alkoxy group" as used herein refers to a monovalent group represented by -$OA_{101}$ (wherein $A_{101}$ is a $C_1$-$C_1$ alkyl group). Examples thereof include a methoxy group, an ethoxy group, a propoxy group, a butoxy group, and a pentoxy group.

The term "$C_2$-$C_{60}$ alkenyl group" as used herein refers to a group formed by placing at least one carbon-carbon double bond in the middle or at the terminus of the $C_2$-$C_{60}$ alkyl group. Examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a group formed by placing at least one carbon-carbon triple bond in the middle or at the terminus of the $C_2$-$C_{60}$ alkyl group. Examples thereof include an ethynyl group and a propynyl group. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent saturated hydrocarbon cyclic group having 3 to 10 carbon atoms. The term "$C_3$-$C_{10}$ cycloalkylene group" as used herein refers to a divalent group having the same structure as the $C_3$-$C_{10}$ cycloalkyl group.

Examples of the $C_3$-$C_{10}$ cycloalkyl group as used herein include a cyclopropyl group, a cyclobutyl group, a cyclopentyl group, a cyclohexyl group, a cycloheptyl group, a cyclooctyl group, an adamantanyl group, a norbornanyl (bicyclo[2.2.1]heptyl) group, a bicyclo[1.1.1]pentyl group, a bicyclo[2.1.1]hexyl group, and a bicyclo[2.2.2]octyl group.

The term "$C_1$-$C_{10}$ heterocycloalkyl group" as used herein refers to a monovalent cyclic group having 1 to 10 carbon atoms and at least one heteroatom of N, O, P, Si, S, Se, Ge, and B as a ring-forming atom. The term "$C_1$-$C_{10}$ heterocycloalkylene group" as used herein refers to a divalent group having the same structure as the $C_1$-$C_{10}$ heterocycloalkyl group.

Examples of the $C_1$-$C_{10}$ heterocycloalkyl group as used herein may include a silolanyl group, a silinanyl group, a tetrahydrofuranyl group, a tetrahydro-2H-pyranyl group, or a tetrahydrothiophenyl group.

The term "$C_3$-$C_{10}$ cycloalkenyl group" as used herein refers to a monovalent cyclic group that has 3 to 10 carbon atoms and at least one carbon-carbon double bond in its ring, wherein the molecular structure as a whole is non-aromatic. Examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_2$-$C_{10}$ heterocycloalkenyl group" as used herein refers to a monovalent cyclic group including at least one heteroatom of N, O, P, Si, S, Se, Ge, and B as a ring-forming atom, 2 to 10 carbon atoms, and at least one carbon-carbon double bond in its ring. Examples of the $C_2$-$C_{10}$ heterocycloalkenyl group include a 2,3-dihydrofuranyl group and a 2,3-dihydrothiophenyl group. The term "$C_2$-$C_{10}$ heterocycloalkylene group" as used herein refers to a divalent group having the same structure as the $C_2$-$C_{10}$ heterocycloalkyl group.

The term "$C_6$-$C_{60}$ aryl group" as used herein refers to a monovalent group having a carbocyclic aromatic system having 6 to 60 carbon atoms. The term "$C_6$-$C_{60}$ arylene group" as used herein refers to a divalent group having a carbocyclic aromatic system having 6 to 60 carbon atoms. Examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include a plurality of rings, the plurality of rings may be fused to each other.

The term "$C_7$-$C_{60}$ alkyl aryl group" as used herein refers to a $C_6$-$C_{60}$ aryl group substituted with at least one $C_1$-$C_{60}$ alkyl group. The term "$C_7$-$C_{60}$ aryl alkyl group" as used herein refers to a $C_1$-$C_{60}$ alkyl group substituted with at least one $C_6$-$C_{60}$ aryl group.

The term "$C_1$-$C_{60}$ heteroaryl group" as used herein refers to a monovalent group having a heterocyclic aromatic system having at least one heteroatom of N, O, P, Si, S, Se, Ge, and B as a ring-forming atom and 1 to 60 carbon atoms. The term "$C_1$-$C_{60}$ heteroarylene group" as used herein refers to a divalent group having a heterocyclic aromatic system having at least one heteroatom of N, O, P, Si, S, Se, Ge and B as a ring-forming atom and 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include a plurality of rings, the plurality of rings may be fused to each other.

The term "$C_2$-$C_{60}$ alkyl heteroaryl group" as used herein refers to a $C_1$-$C_{60}$ heteroaryl group substituted with at least one $C_1$-$C_{60}$ alkyl group. The term "$C_7$-$C_{60}$ heteroaryl alkyl group" as used herein refers to a $C_1$-$C_{60}$ alkyl group substituted with at least one $C_1$-$C_{60}$ heteroaryl group.

The term "$C_6$-$C_{60}$ aryloxy group" as used herein is represented by -$OA_{102}$ (wherein $A_{102}$ is the $C_6$-$C_{60}$ aryl group). The term "$C_6$-$C_{60}$ arylthio group" as used herein is represented by —$SA_{103}$ (wherein $A_{103}$ is the $C_6$-$C_{60}$ aryl group). The term "$C_1$-$C_{60}$ alkylthio group" as used herein is represented by -$SA_{104}$ (wherein $A_{104}$ is the $C_1$-$C_{60}$ alkyl group).

The term "monovalent non-aromatic condensed polycyclic group" as used herein refers to a monovalent group that has two or more condensed rings and only carbon atoms (e.g., the number of carbon atoms may be in a range of 8 to 60) as ring-forming atoms, wherein the molecular structure as a whole is non-aromatic. Examples of the monovalent non-aromatic condensed polycyclic group include a fluorenyl group. The term "divalent non-aromatic condensed polycyclic group" as used herein refers to a divalent group having substantially the same structure as the monovalent non-aromatic condensed polycyclic group.

The term "monovalent non-aromatic condensed heteropolycyclic group" as used herein refers to a monovalent group that has two or more condensed rings and a heteroatom selected from N, O, P, Si, S, Se, Ge, and B and carbon atoms (e.g., the number of carbon atoms may be in a range of 1 to 60) as ring-forming atoms, wherein the molecular structure as a whole is non-aromatic. Examples of the monovalent non-aromatic condensed heteropolycyclic group include a carbazolyl group. The term "divalent non-aromatic condensed heteropolycyclic group" as used herein refers to a divalent group having substantially the same structure as the monovalent non-aromatic condensed heteropolycyclic group.

The term "$C_5$-$C_{30}$ carbocyclic group" as used herein refers to a saturated or unsaturated cyclic group including 5 to 30 carbon atoms only as ring-forming atoms. The $C_5$-$C_{30}$ carbocyclic group may be a monocyclic group or a polycyclic group. The term "$C_5$-$C_{30}$ carbocyclic group (unsubstituted or substituted with at least one $R_{10a}$ (or at least one $Z_0$)" may include an adamantane group, a norbornene group, a bicyclo[1.1.1]pentane group, a bicyclo[2.1.1]hexane group, a bicyclo[2.2.1]heptane group (a norbornane group), a bicyclo[2.2.2]octane group, a cyclopentane group, a cyclohexane group, a cyclohexene group, a phenyl group, a naphthalene group, an anthracene group, a phenanthrene group, a triphenylene group, a pyrene group, a chrysene group, a 1,2,3,4-tetrahydronaphthalene group, a cyclopentadiene group, or a fluorene group, each (unsubstituted or substituted with at least one $R_{10a}$ (or at least one $Z_0$)).

The term "$C_1$-$C_{30}$ heterocyclic group" as used herein refers to saturated or unsaturated cyclic group including 1 to 30 carbon atoms and at least one heteroatom selected from N, O, P, Si, S, Se, Ge, and B as ring-forming atoms. The $C_1$-$C_{30}$ heterocyclic group may be a monocyclic group or a polycyclic group. Examples of the "$C_1$-$C_{30}$ heterocyclic group (unsubstituted or substituted with at least one $R_{10a}$ (or at least one $Z_0$))" may include a thiophene group, a furan group, a pyrrole group, a silole group, a borole group, a phosphole group, a selenophene group, a germole group, a benzothiophene group, a benzofuran group, an indole group, a benzosilole group, a benzoborole group, a benzophosphole group, a benzoselenophene group, a benzogermole group, a dibenzothiophene group, a dibenzofuran group, a carbazole group, a dibenzosilole group, a dibenzoborole group, a dibenzophosphole group, a dibenzoselenophenegroup, a dibenzogermole group, a dibenzothiophene 5-oxide group, a 9H-fluorene-9-one group, a dibenzothiophene 5,5-dioxide group, an azabenzothiophene group, an azabenzofuran group, an azaindole group, an azaindene group, an azabenzosilole group, an azabenzoborole group, an azabenzophosphole group, an azabenzoselenophene group, an azabenzogermole group, an azadibenzothiophene group, an azadibenzofuran group, an azacarbazole group, an azafluorene group, an azadibenzosilole group, an azadibenzoborole group, an azadibenzophosphole group, an azadibenzoselenophene group, an azadibenzogermole group, an azadibenzothiophene 5-oxide group, an aza-9H-fluoren-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, or a 5,6,7,8-tetrahydroquinoline group, each unsubstituted or substituted with at least one $R_{10a}$ (or at least one $Z_0$)).

Examples of the "$C_5$-$C_{30}$ carbocyclic group" and the "$C_1$-$C_{30}$ heterocyclic group" as used herein include i) a first ring, ii) a second ring, iii) a condensed ring in which at least two first rings are condensed, iv) a condensed ring in which at least two second rings are condensed, or v) a condensed ring in which at least one first ring and at least one second ring are condensed, wherein the first ring may be a cyclopentane group, a cyclopentene group, a furan group, a thiophene group, a pyrrole group, a silole group, a borole group, a phosphole group, a germole group, a selenophene group, an oxazole group, an isoxazole group, an oxadiazole group, an oxatriazole group, a thiazole group, an isothiazole group, a thiadiazole group, a thiatriazole group, a pyrazole group, an imidazole group, a triazole group, a tetrazole group, an azasilole group, a diazasilole group, or a triazasilole group, and wherein the second ring may be an adamantane group, a norbornane group, a norbornene group, a cyclohexane group, a cyclohexene group, a phenyl group, a pyridine group, a pyrimidine group, a pyrazine group, a pyridazine group, or a triazine group.

The terms "fluorinated $C_1$-$C_{60}$ alkyl group (or fluorinated $C_1$-$C_{20}$ alkyl group or the like)", "fluorinated $C_3$-$C_{10}$ cycloalkyl group", "fluorinated $C_1$-$C_{10}$ heterocycloalkyl group", and "fluorinated phenyl group" as used herein respectively refer to a $C_1$-$C_{60}$ alkyl group (or $C_1$-$C_{20}$ alkyl group or the like), $C_3$-$C_{10}$ cycloalkyl group, a $C_1$-$C_{10}$ heterocycloalkyl group, and a phenyl group, each substituted with at least one fluoro group (—F). Examples of the "fluorinated $C_1$ alkyl group (i.e., a fluorinated methyl group)" may include —$CF_3$, —$CF_2H$, and —$CFH_2$. The "fluorinated $C_1$-$C_{60}$ alkyl group (or fluorinated $C_1$-$C_{20}$ alkyl group or the like)", "fluorinated $C_3$-$C_{10}$ cycloalkyl group", "fluorinated $C_1$-$C_{10}$ heterocycloalkyl group", or "fluorinated phenyl group" may respectively be: i) a fully fluorinated $C_1$-$C_{60}$ alkyl group (or fully fluorinated $C_1$-$C_{20}$ alkyl group or the like), fully fluorinated $C_3$-$C_{10}$ cycloalkyl group, fully fluorinated $C_1$-$C_{10}$ heterocycloalkyl group, or fully fluorinated phenyl group, in which all hydrogen atoms are substituted with fluoro groups; or ii) a partially fluorinated $C_1$-$C_{60}$ alkyl group (or partially fluorinated $C_1$-$C_{20}$ alkyl group or the like), partially fluorinated $C_3$-$C_{10}$ cycloalkyl group, partially fluorinated $C_1$-$C_{10}$ heterocycloalkyl group, or partially fluorinated phenyl group, in which some of hydrogen atoms are substituted with fluoro groups.

The "deuterated $C_1$-$C_{60}$ alkyl group (or deuterated $C_1$-$C_{20}$ alkyl group or the like)", "deuterated $C_3$-$C_{10}$ cycloalkyl group", "deuterated heterocycloalkyl group", and "deuterated phenyl group" as used herein may respectively be a $C_1$-$C_{60}$ alkyl group (or $C_1$-$C_{20}$ alkyl group or the like), $C_3$-$C_{10}$ cycloalkyl group, a $C_1$-$C_{10}$ heterocycloalkyl group, and a phenyl group, each substituted with at least one deuterium. Examples of the "deuterated $C_1$ alkyl group (i.e., a deuterated methyl group)" may include —$CD_3$, —$CD_2H$, and —$CDH_2$. Examples of the "deuterated $C_3$-$C_{10}$ cycloalkyl group" may include Formula 10-501. The "deuterated $C_1$-$C_{60}$ alkyl group (or deuterated $C_1$-$C_{20}$ alkyl group or the like)", "deuterated $C_3$-$C_{10}$ cycloalkyl group", "deuterated heterocycloalkyl group", or deuterated phenyl group may respectively be: i) a fully deuterated $C_1$-$C_{60}$ alkyl group (or fully deuterated $C_1$-$C_{20}$ alkyl group or the like), fully deuterated $C_3$-$C_{10}$ cycloalkyl group, fully deuterated heterocycloalkyl group, or fully deuterated phenyl group, in which all hydrogen atoms are substituted with deuterium atoms; or ii) a partially deuterated $C_1$-$C_{60}$ alkyl group (or partially deuterated $C_1$-$C_{20}$ alkyl group or the like), partially deuterated $C_3$-$C_{10}$ cycloalkyl group, partially deuterated heterocycloalkyl group, or partially deuterated phenyl group, in which some of hydrogen atoms are substituted with deuterium atoms.

The term "($C_1$-$C_{20}$ alkyl) 'X' group" as used herein refers to a 'X' group substituted with at least one $C_1$-$C_{20}$ alkyl group. For example, the term "($C_1$-$C_{20}$ alkyl)$C_3$-$C_{10}$ cycloalkyl group" as used herein refers to a $C_3$-$C_{10}$ cycloalkyl group substituted with at least one $C_1$-$C_{20}$ alkyl group, and the "($C_1$-$C_{20}$ alkyl)phenyl group" as used herein refers to a phenyl group substituted with at least one $C_1$-$C_{20}$ alkyl group. Examples of the ($C_1$ alkyl)phenyl group may include a toluyl group.

In the present specification, "an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluoren-9-one group, and an azadibenzothiophene 5,5-dioxide group" each refer to a hetero ring in which at least one ring-forming carbon atom is substituted with nitrogen atom and respectively having an identical backbone as "an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, and a dibenzothiophene 5,5-dioxide group".

At least one substituent of the substituted $C_5$-$C_{30}$ carbocyclic group, the substituted $C_2$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_2$-$C_{10}$ heterocycloalkenyl group, the substituted $C_6$-$C_{60}$ aryl group, the substituted $C_7$-$C_{60}$ alkyl aryl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkyl heteroaryl group, the substituted $C_2$-$C_{60}$ heteroaryl alkyl group, the substituted $C_1$-$C_{60}$ heteroaryloxy group, the substituted $C_1$-$C_{60}$ heteroarylthio group, the substituted monovalent non-aromatic condensed polycyclic group, and the substituted monovalent non-aromatic condensed heteropolycyclic group may each independently be:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group;

a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), —B($Q_{16}$)($Q_{17}$), —P(=O)($Q_{18}$)($Q_{19}$), —P($Q_{18}$)($Q_{19}$), or a combination thereof;

a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a monovalent non-aromatic condensed polycyclic group, or a monovalent non-aromatic condensed heteropolycyclic group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_7$-$C_{60}$ alkyl aryl group, a $C_7$-$C_{60}$ aryl alkyl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_2$-$C_{60}$ heteroaryl alkyl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), —B($Q_{26}$)($Q_{27}$), —P(=O)($Q_{28}$)($Q_{29}$), —P($Q_{28}$)($Q_{29}$), or a combination thereof;

—N($Q_{31}$)($Q_{32}$), —Si($Q_{33}$)($Q_{34}$)($Q_{35}$), —B($Q_{36}$)($Q_{37}$), —P(=O)($Q_{38}$)($Q_{39}$), or —P($Q_{38}$)($Q_{39}$), or a combination thereof.

In the present specification, $Q_1$ to $Q_9$, $Q_{11}$ to $Q_{19}$, $Q_{21}$ to $Q_{29}$, and $Q_{31}$ to $Q_{39}$ may each independently be: hydrogen; deuterium; —F; —Cl; —Br; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group unsubstituted or substituted with deuterium, a $C_1$-$C_{60}$ alkyl group, a $C_6$-$C_{60}$ aryl group, or a combination thereof; a $C_2$-$C_{60}$ alkenyl group; a $C_2$-$C_{60}$ alkynyl group; a $C_1$-$C_{60}$ alkoxy group; a $C_1$-$C_{60}$ alkylthio group; a $C_3$-$C_{10}$ cycloalkyl group; a $C_1$-$C_{10}$ heterocycloalkyl group; a $C_3$-$C_{10}$ cycloalkenyl group; a $C_2$-$C_{10}$ heterocycloalkenyl group; a $C_6$-$C_{60}$ aryl group unsubstituted or substituted with deuterium, a $C_1$-$C_{60}$ alkyl group, or a $C_6$-$C_{60}$ aryl group; a $C_6$-$C_{60}$ aryloxy group; a $C_6$-$C_{60}$ arylthio group; a $C_1$-$C_{60}$ heteroaryl group; a $C_1$-$C_{60}$ heteroaryloxy group; a $C_1$-$C_{60}$ heteroarylthio group; a monovalent non-aromatic condensed polycyclic group; a monovalent non-aromatic condensed heteropolycyclic group, or a combination thereof.

For example, $Q_1$ to $Q_9$, $Q_{11}$ to $Q_{19}$, $Q_{21}$ to $Q_{29}$, and $Q_{31}$ to $Q_{39}$ may each independently be:

—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, or —$CD_2CDH_2$, an n-propyl group, an iso-propyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with deuterium, a $C_1$-$C_{10}$ alkyl group, a phenyl group, or any combination thereof.

Hereinafter, a compound and an organic light-emitting device according to one or more exemplary embodiments will be described in further detail with reference to Synthesis Examples and Examples, however, the present disclosure is not limited thereto. The wording "B was used instead of A" used in describing Synthesis Examples means that an amount of B used was identical to an amount of A used based on molar equivalence.

EXAMPLES

Synthesis Example 1 (Compound 65)

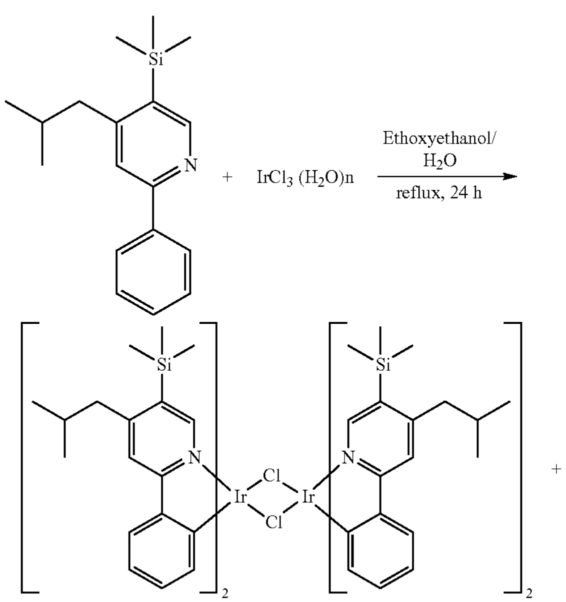

65A

-continued

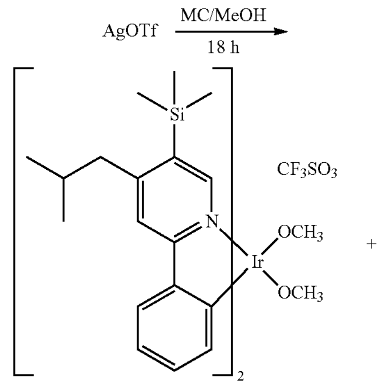

65B

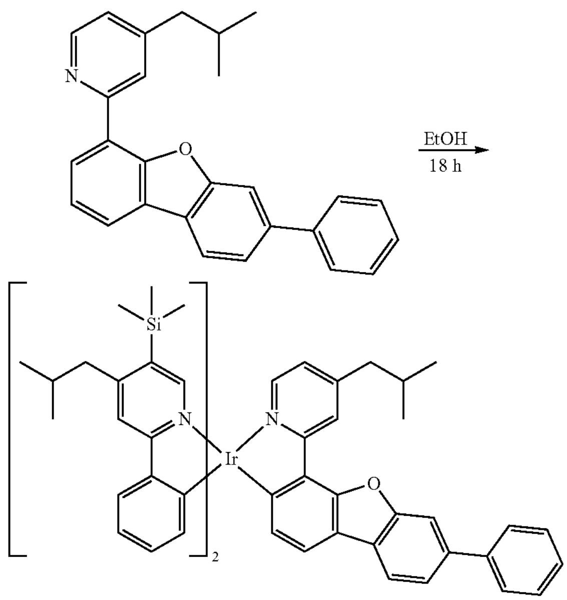

65

Synthesis of Compound 65A 7.9 grams (g) (27.8 millimoles (mmol)) of 4-isobutyl-2-phenyl-5-(trimethylsilyl)pyridine and 4.4 g (12.6 mmol) of iridium chloride hydrate were mixed with 120 milliliters (mL) of ethoxyethanol and 40 mL of deionized (DI) water. Then, the mixture was stirred under reflux for 24 hours, and then the temperature was allowed to cool to room temperature. A solid was formed therefrom, and then separated by filtration. The solid was sufficiently washed with water, methanol, and hexane in the stated order, and dried in a vacuum oven to thereby obtain 7.6 g of Compound 65A (yield: 76%).

Synthesis of Compound 65B 3.3 g (2.1 mmol) of Compound 65A was mixed with 90 mL of methylene chloride, and a solution, in which 1.1 g (4.1 mmol) of silver trifluoromethanesulfonate (silver triflate, AgOTf) was dissolved in 30 mL of methanol, was added thereto. Then, the mixture was stirred for 18 hours at room temperature while blocking light by using an aluminum foil. The resultant was celite-filtered to remove a solid formed therefrom and filtered under reduced pressure to thereby obtain a solid (Compound 65B). The solid was used in the following reaction without any further purification.

Synthesis of Compound 65

4.0 g (4.1 mmol) of Compound 65B and 1.7 g (4.5 mmol) of 4-isobutyl-2-(7-phenyldibenzo[b,d]furan-4-yl)pyridine were mixed with 40 mL of ethanol and stirred under reflux for 18 hours, followed by reducing the temperature. The solvent was removed from the obtained mixture under reduced pressure to obtain a solid that was subjected to column chromatography (eluent: methylene chloride (MC) and hexane) to thereby obtain 1.8 g of Compound 65 (yield: 39%). The resulting compound was identified by using mass spectrometry (high resolution mass spectrometry using matrix assisted laser desorption ionization, HRMS (MALDI)) and high-performance liquid chromatography (HPLC) analysis.

HRMS (MALDI) calcd for $C_{63}H_{70}IrN_3OSi_2$: m/z 1133.4687 Found: 1133.4681.

Synthesis Example 2 (Compound 206)

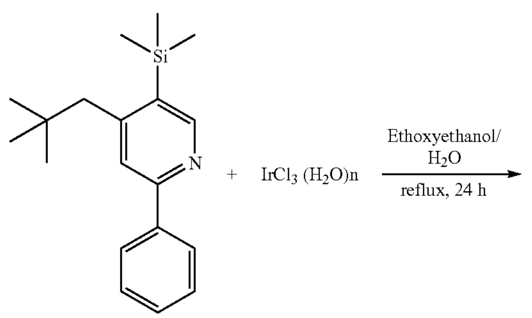

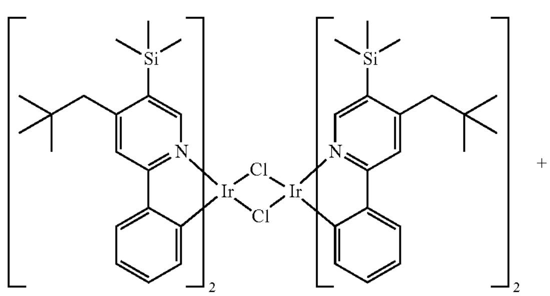

206A

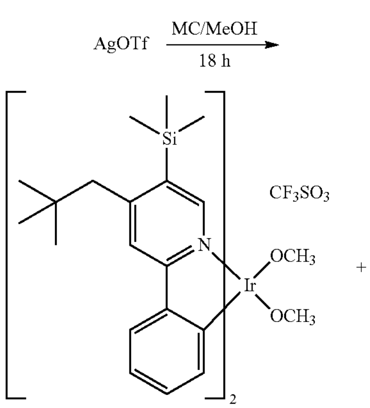

206B

-continued

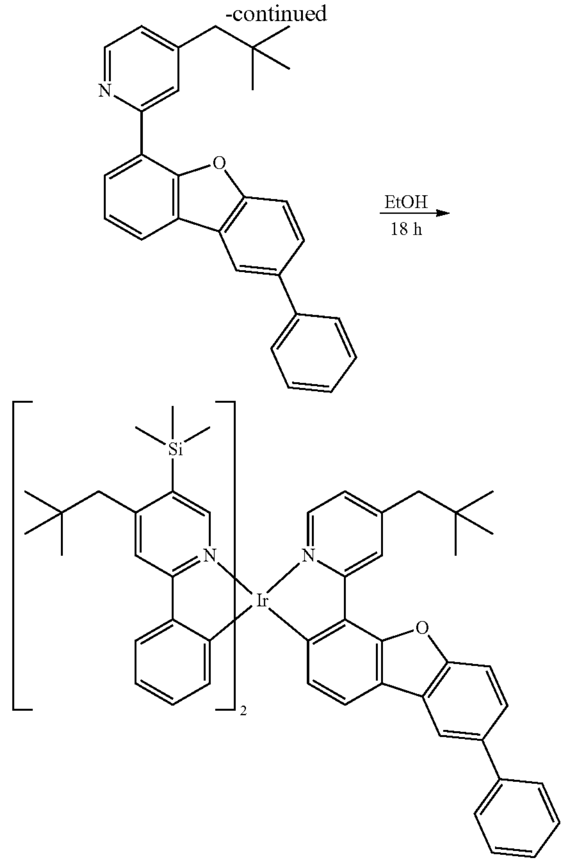

206

Synthesis of Compound 206A 7.2 g of Compound 206A (yield: 72%) was obtained in substantially the same manner as in Synthesis of Compound 65A in Synthesis Example 1, except that 4-neopentyl-2-phenyl-5-(trimethylsilyl)pyridine was used instead of 4-isobutyl-2-phenyl-5-(trimethylsilyl)pyridine.

Synthesis of Compound 206B

Compound 206B was obtained in substantially the same manner as in Synthesis of Compound 65B in Synthesis Example 1, except that Compound 206A was used instead of Compound 65A. The resulting Compound 206B was used in the following reaction without any further purification.

Synthesis of Compound 206

1.4 g of Compound 206 (yield: 33%) was obtained in substantially the same manner as in Synthesis of Compound 65 in Synthesis Example 1, except that Compound 206B was used instead of Compound 65B, and 4-neopentyl-2-(8-phenyldibenzo[b,d]furan-4-yl)pyridine was used instead of 4-isobutyl-2-(7-phenyldibenzo[b,d]furan-4-yl)pyridine. The resulting compound was identified by using mass spectrometry and HPLC analysis.

HRMS(MALDI) calcd for $C_{66}H_{76}IrN_3OSi_2$: m/z 1175.5156 Found: 1175.5162.

Synthesis Example 3 (Compound 363)

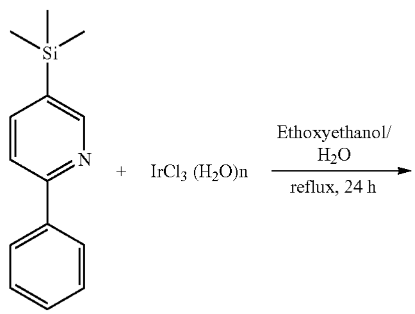

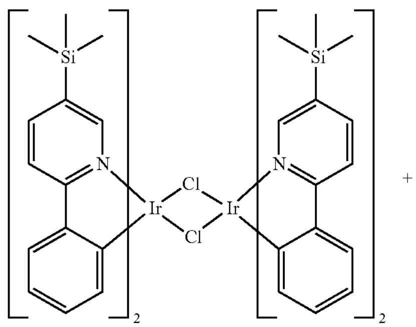

363A

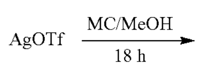

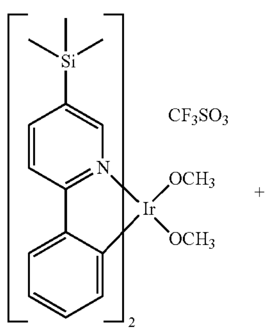

363B

-continued

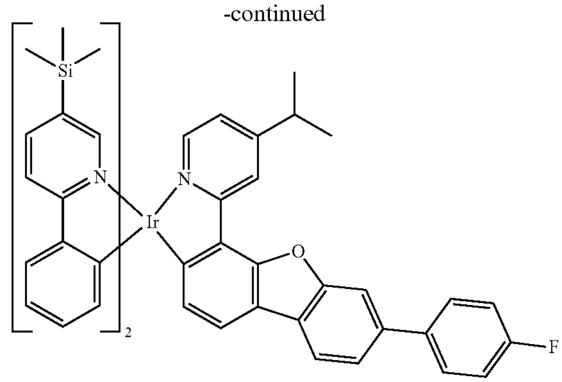

363

Synthesis of Compound 363A 8.1 g of Compound 363A (yield: 81%) was obtained in substantially the same manner as in Synthesis of Compound 65A in Synthesis Example 1, except that 2-phenyl-5-(trimethylsilyl)pyridine was used instead of 4-isobutyl-2-phenyl-5-(trimethylsilyl)pyridine.

Synthesis of Compound 363B

Compound 363B was obtained in substantially the same manner as in Synthesis of Compound 65B in Synthesis Example 1, except that Compound 363A was used instead of Compound 65A. The resulting Compound 363B was used in the following reaction without any further purification.

Synthesis of Compound 363

1.2 g of Compound 363 (yield: 29%) was obtained in substantially the same manner as in Synthesis of Compound 65 in Synthesis Example 1, except that Compound 363B was used instead of Compound 65B, and 2-(7-(4-fluorophenyl)dibenzo[b,d]furan-4-yl)-4-isopropylpyridine was used instead of 4-isobutyl-2-(7-phenyldibenzo[b,d]furan-4-yl)pyridine. The resulting compound was identified by using mass spectroscopy and HPLC analysis.

HRMS (MALDI) calcd for $C_{54}H_{51}FIrN_3OSi_2$: m/z 1025.3184 Found: 1025.3189.

Synthesis Example 4 (Compound 556)

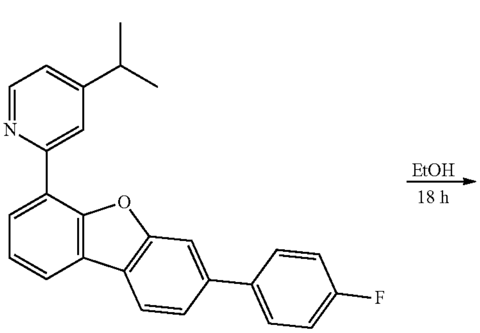

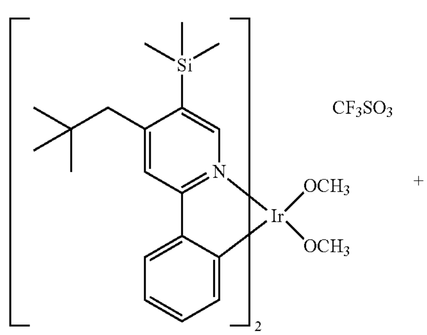

206B

-continued

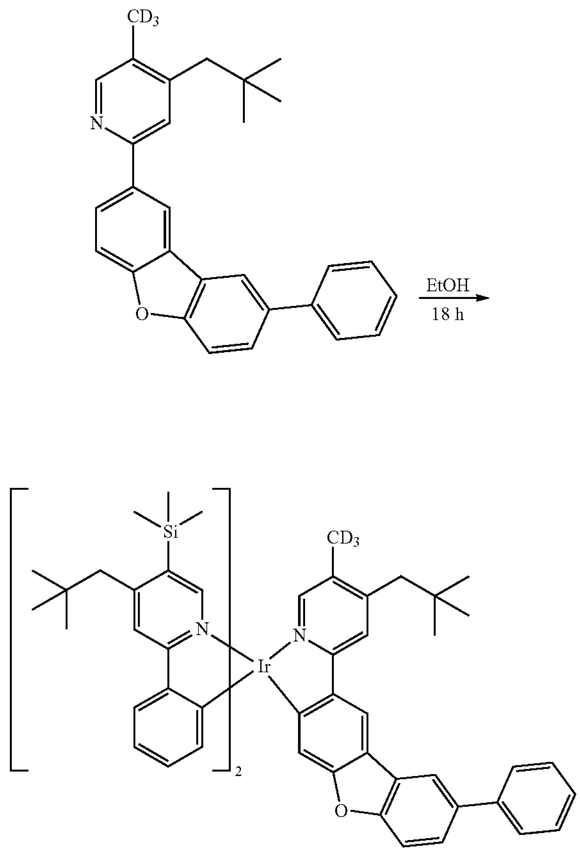

556

1.7 g of Compound 556 (yield: 36%) was obtained in substantially the same manner as in Synthesis of Compound 65 in Synthesis Example 1, except that Compound 206B was used instead of Compound 65B, and 5-(methyl-d3)-4-neopentyl-2-(8-phenyldibenzo[b,d]furan-2-yl)pyridine was used instead of 4-isobutyl-2-(7-phenyldibenzo[b,d]furan-4-yl)pyridine. The resulting compound was identified by using mass spectrometry and HPLC analysis.

HRMS (MALDI) calcd for $C_{67}H_{75}D_3IrN_3OSi_2$: m/z 1192.5501 Found: 1192.5496.

Synthesis Example 5 (Compound 749)

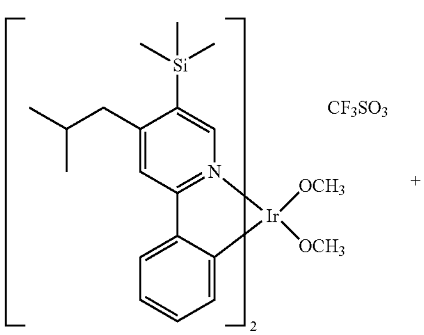

65B

-continued

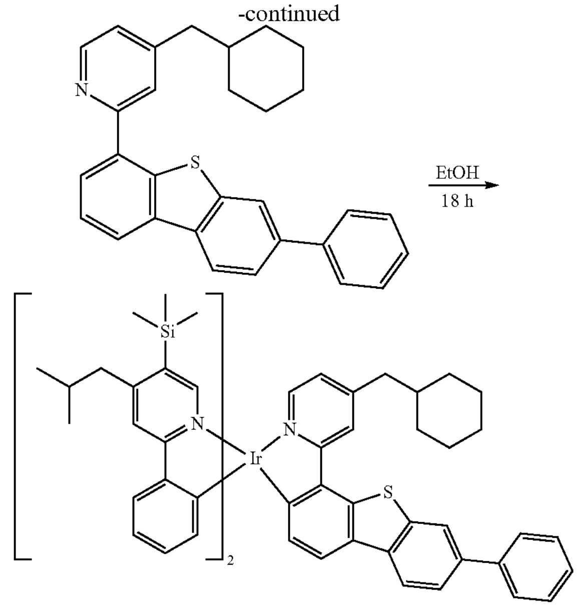

749

1.1 g of Compound 749 (yield: 27%) was obtained in substantially the same manner as in Synthesis of Compound 65 in Synthesis Example 1, except that 4-(cyclohexylmethyl)-2-(7-phenyldibenzo[b,d]thiophen-4-yl)pyridine was used instead of 4-isobutyl-2-(7-phenyldibenzo[b,d]furan-4-yl)pyridine. The resulting compound was identified by using mass spectrometry and HPLC analysis.

HRMS (MALDI) calcd for $C_{66}H_{74}IrN_3SSi_2$: m/z 1189.4771 Found: 1189.4763.

Synthesis Example 6 (Compound 2350)

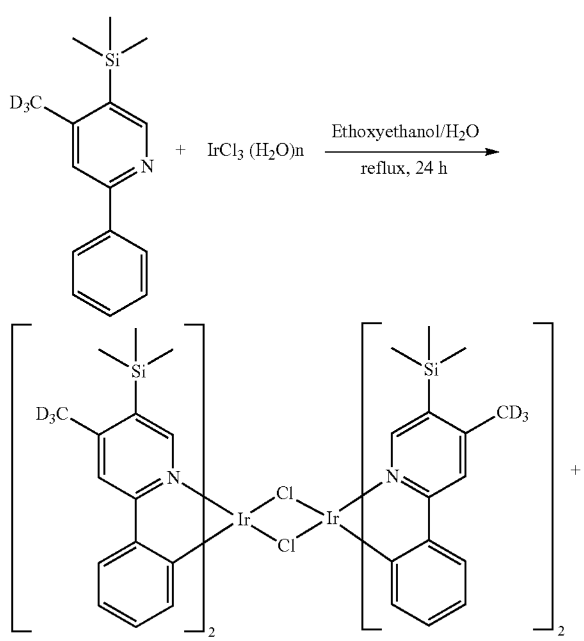

2350A

-continued

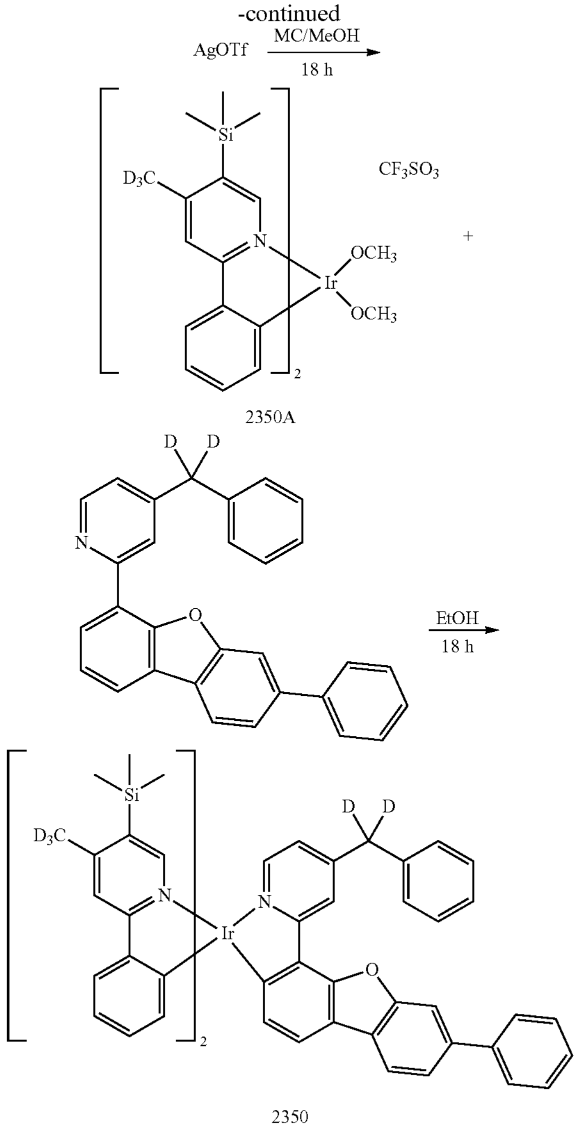

Synthesis of Compound 2350A 8.8 g of Compound 2350A (yield: 88%) was obtained in substantially the same manner as in Synthesis of Compound 65A in Synthesis Example 1, except that 4-(methyl-d3)-2-phenyl-5-(trimethylsilyl)pyridine was used instead of 4-isobutyl-2-phenyl-5-(trimethylsilyl)pyridine (yield: 88%).

Synthesis of Compound 2350B

Compound 2350B was obtained in substantially the same manner as in Synthesis of Compound 65B in Synthesis Example 1, except that Compound 2350A was used instead of Compound 65A. The resulting Compound 2350B was used in the following reaction without any further purification.

Synthesis of Compound 2350

2.1 g of Compound 2350 (yield: 45%) was obtained in substantially the same manner as in Synthesis of Compound 65 in Synthesis Example 1, except that Compound 2350B was used instead of Compound 65B, and 2-(7-phenyldibenzo[b,d]furan-4-yl)-4-(phenylmethyl-d2)pyridine was used instead of 2-isobutyl-2-(7-phenyldibenzo[b,d]furan-4-yl)pyridine. The resulting compound was identified by using mass spectrometry and HPLC analysis.

HRMS (MALDI) calcd for $C_{60}H_{48}D_8IrN_3OSi_2$: m/z 1091.4093 Found: 1091.4090.

Synthesis Example 7 (Compound 2508)

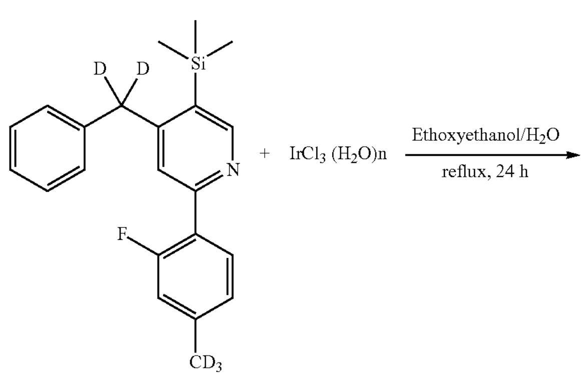

-continued

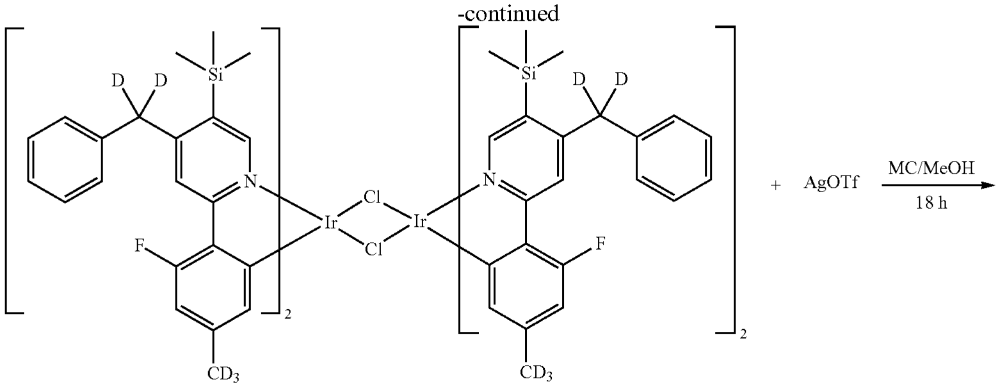

2508A

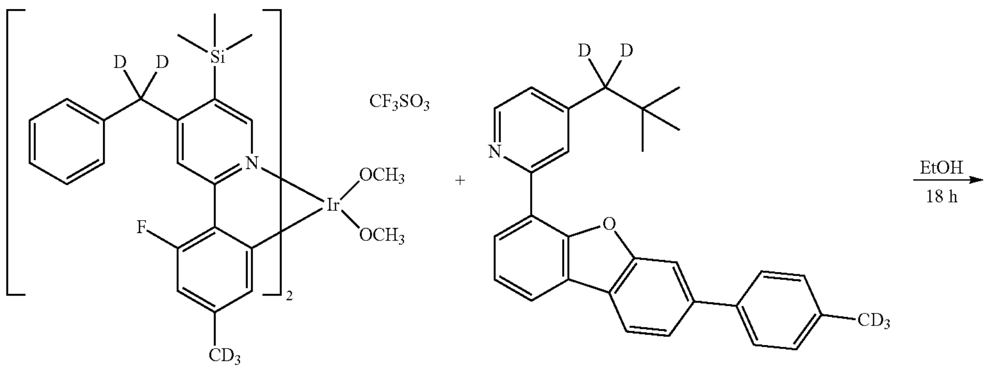

2508B

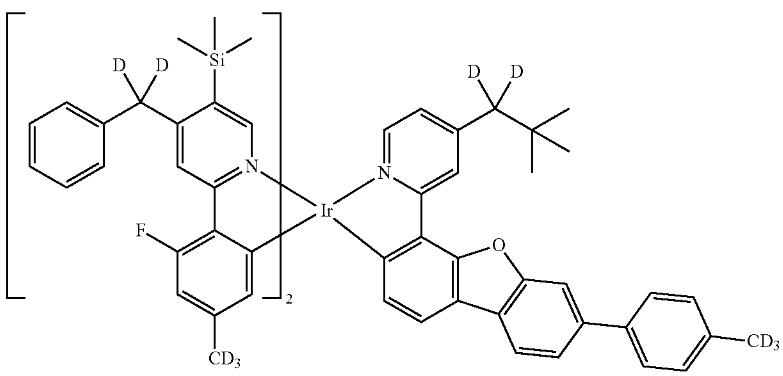

2508

Synthesis of Compound 2508A 6.7 g of Compound 2508A (yield: 67%) was obtained in substantially the same manner as in Synthesis of Compound 65A in Synthesis Example 1, except that 2-(2-fluoro-4-(methyl-d3)phenyl)-4-(phenylmethyl-d2)-5-(trimethylsilyl)pyridine was used instead of 4-isobutyl-2-phenyl-5-(trimethylsilyl)pyridine.

Synthesis of Compound 2508B

Compound 2508B was obtained in substantially the same manner as in Synthesis of Compound 65B in Synthesis Example 1, except that Compound 2508A was used instead of Compound 65A. The resulting Compound 2508B was used in the following reaction without further purification.

Synthesis of Compound 2508

1.3 g of Compound 2508 (yield: 26%) was obtained in substantially the same manner as in Synthesis of Compound 65 in Synthesis Example 1, except that Compound 2508B was used instead of Compound 65B, and 4-(2,2-dimethyl-propyl-1,1-d2)-2-(7-(4-(methyl-d3)phenyl)dibenzo[b,d]furan-4-yl)pyridine was used instead of 4-isobutyl-2-(7-phenyldibenzo[b,d]furan-4-yl)pyridine. The resulting compound was identified by using mass spectrometry and HPLC analysis.

HRMS (MALDI) calcd for $C_{73}H_{57}D_{15}F_2IrN_3OSi_2$: m/z 1308.5753 Found: 1308.5760.

Synthesis Example 8 (Compound 2566)

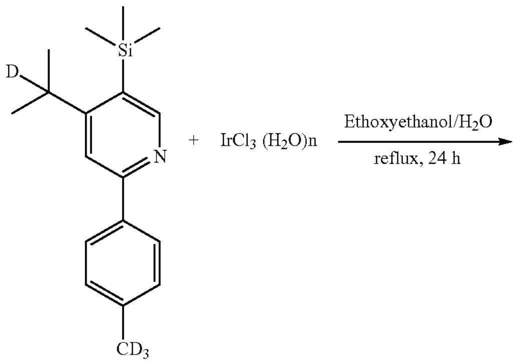

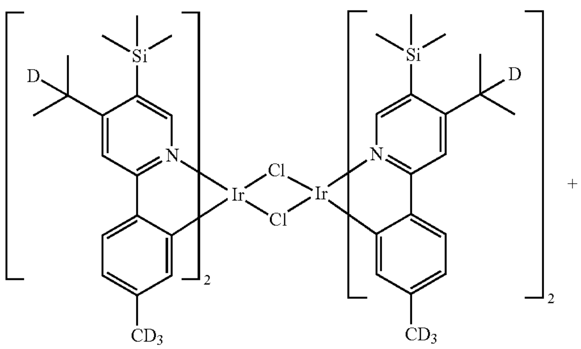

2566A

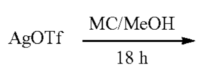

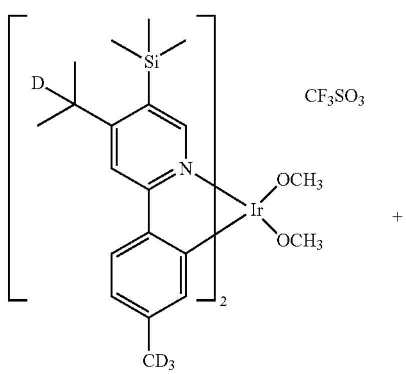

2566B

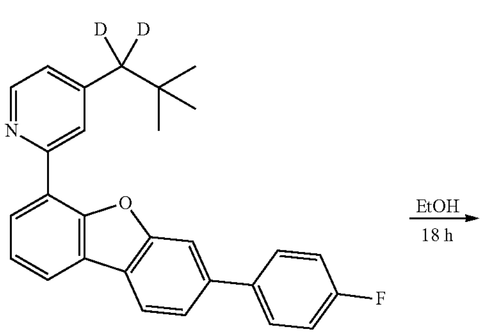

-continued

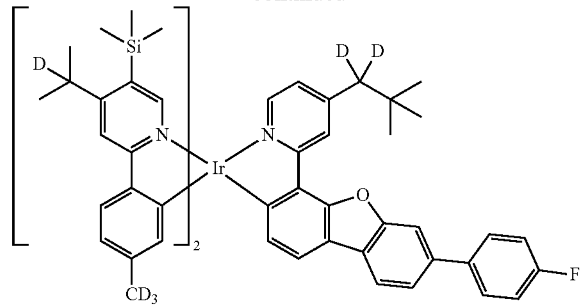

2566

Synthesis of Compound 2566A 8.3 g of Compound 2566A (yield: 83%) was obtained in substantially the same manner as in Synthesis of Compound 65A in Synthesis Example 1, except that 2-(4-(methyl-d3)phenyl)-4-(propan-2-yl-2-d)-5-(trimethylsilyl)pyridine was used instead of 4-isobutyl-2-phenyl-5-(trimethylsilyl)pyridine.

Synthesis of Compound 2566B

Compound 2566B was obtained in substantially the same manner as in Synthesis of Compound 65B in Synthesis Example 1, except that Compound 2566A was used instead of Compound 65A. The resulting Compound 2566B was used in the following reaction without any further purification.

Synthesis of Compound 2566

1.5 g of Compound 2566 (yield: 34%) was obtained in substantially the same manner as in Synthesis of Compound 65 in Synthesis Example 1, except that Compound 2566B was used instead of Compound 65B, and 4-(2,2-dimethyl-propyl-1,1-d2)-2-(7-(4-fluorophenyl)dibenzo[b,d]furan-4-yl)pyridine was used instead of 4-isobutyl-2-(7-phenyldibenzo[b,d]furan-4-yl)pyridine. The resulting compound was identified by using mass spectrometry and HPLC analysis.

HRMS (MALDI) calcd for $C_{64}H_{61}D_{10}FIrN_3OSi_2$: m/z 1175.5377 Found: 1175.5383.

Synthesis Example 9 (Compound 2579)

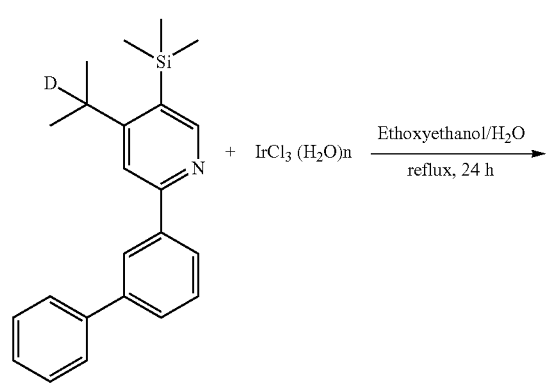

-continued

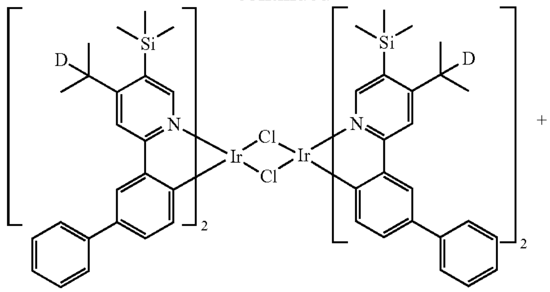

2579A

AgOTf MC/MeOH 18 h

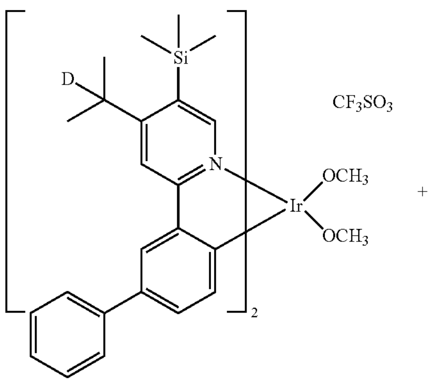

2579B

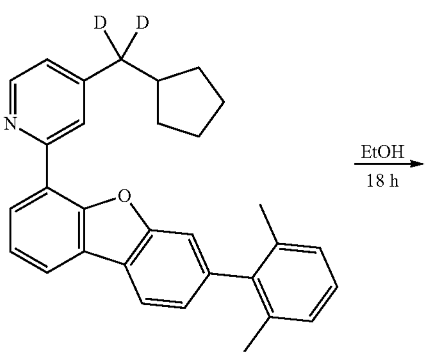

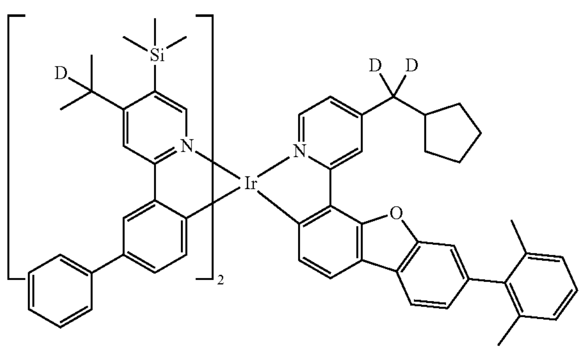

2579

Synthesis of Compound 2579A 8.4 g of Compound 2579A (yield: 84%) was obtained in substantially the same manner as in Synthesis of Compound 65A in Synthesis Example 1, except that 2-([1,1'-biphenyl]-3-yl)-4-(propan-2-yl-2-d)-5-(trimethylsilyl)pyridine was used instead of 4-isobutyl-2-phenyl-5-(trimethylsilyl)pyridine.

Synthesis of Compound 2579B

Compound 2579B was obtained in substantially the same manner as in Synthesis of Compound 65B in Synthesis Example 1, except that Compound 2579A was used instead of Compound 65A. The resulting Compound 2579B was used in the following reaction without any further purification.

Synthesis of Compound 2579

1.1 g of Compound 2579 (yield: 25%) was obtained in substantially the same manner as in Synthesis of Compound 65 in Synthesis Example 1, except that Compound 2579B was used instead of Compound 65B, and 4-(cyclopentylmethyl-d2)-2-(7-(2,6-dimethylphenyl)dibenzo[b,d]furan-4-yl)pyridine was used instead of 4-isobutyl-2-(7-phenyldibenzo[b,d]furan-4-yl)pyridine. The resulting compound was identified by using mass spectrometry and HPLC analysis.

HRMS (MALDI) calcd for $C_{77}H_{76}IrN_3OSi_2$: m/z 1315.5720 Found: 1315.5711.

Synthesis Example 10 (Compound 2758)

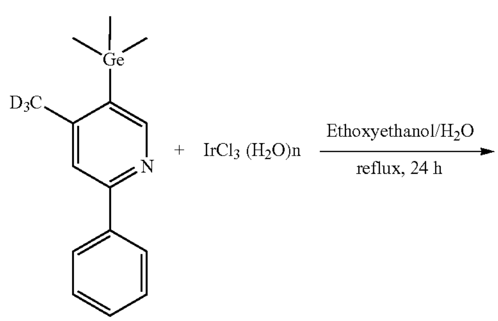

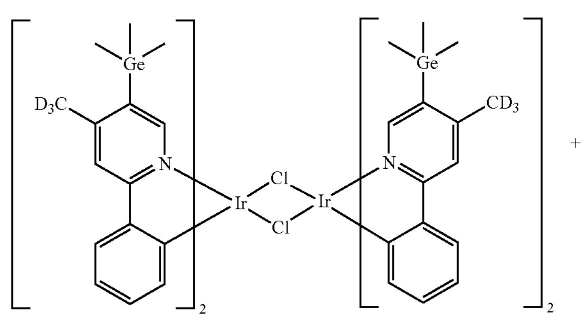

2758A

-continued

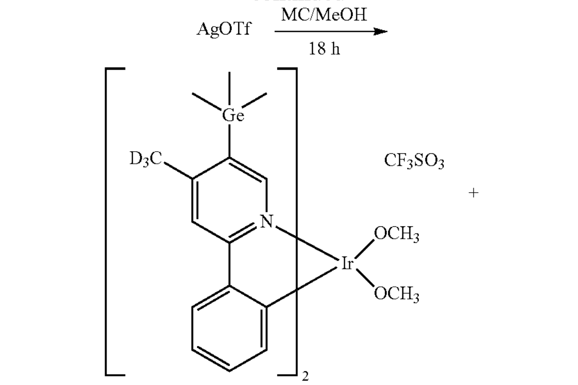

2758B

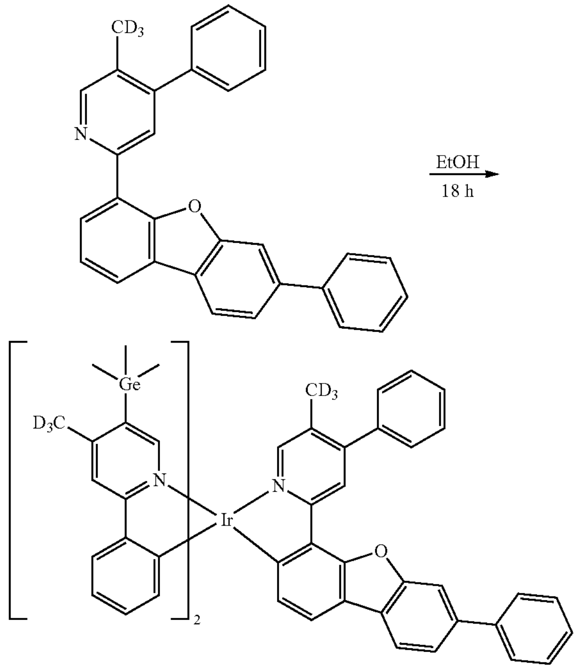

2758

Synthesis of Compound 2758A 7.2 g of Compound 2758A (yield: 72%) was obtained in substantially the same manner as in Synthesis of Compound 65A in Synthesis Example 1, except that 4-(methyl-d3)-2-phenyl-5-(trimethylgermyl)pyridine was used instead of 4-isobutyl-2-phenyl-5-(trimethylsilyl)pyridine.

Synthesis of Compound 2758B

Compound 2758B was obtained in substantially the same manner as in Synthesis of Compound 65B in Synthesis Example 1, except that Compound 2758A was used instead of Compound 65A. The resulting Compound 2758B was used in the following reaction without any further purification.

Synthesis of Compound 2758

1.6 g of Compound 2758 (yield: 37%) was obtained in substantially the same manner as in Synthesis of Compound 65 in Synthesis Example 1, except that Compound 2758B was used instead of Compound 65B, and 5-(methyl-d3)-4-phenyl-2-(7-phenyldibenzo[b,d]furan-4-yl)pyridine was used instead of 4-isobutyl-2-(7-phenyldibenzo[b,d]furan-4-yl)pyridine. The resulting compound was identified by using mass spectrometry and HPLC analysis.

HRMS (MALDI) calcd for $C_{60}H_{47}D_9Ge_2IrN_3O$: m/z 1184.3041 Found: 1184.3033.

Synthesis Example 11 (Compound 485)

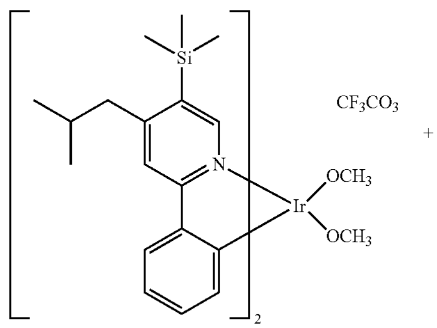

65B

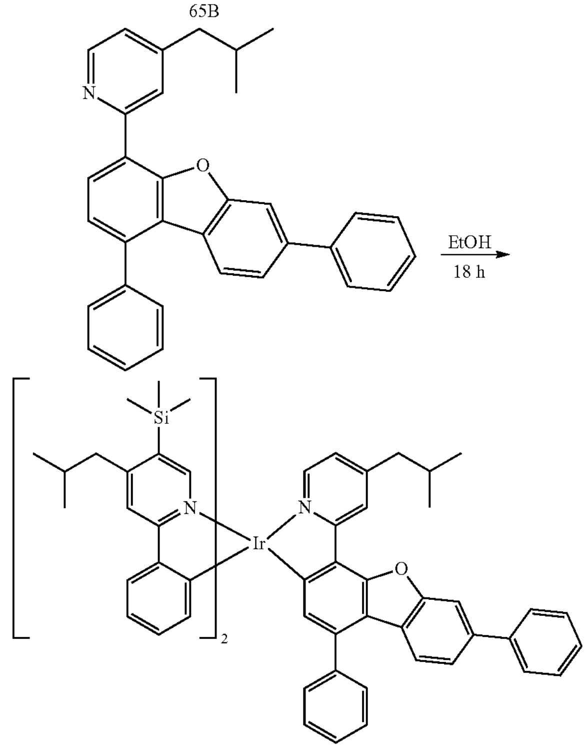

485

0.9 g of Compound 485 (yield: 27%) was obtained in substantially the same manner as in Synthesis of Compound 65 in Synthesis Example 1, except that 2-(1,7-diphenyldibenzo[b,d]furan-4-yl)-4-isobutylpyridine was used instead of 4-isobutyl-2-(7-phenyldibenzo[b,d]furan-4-yl) pyridine. The resulting compound was identified by using mass spectrometry and HPLC analysis.

HRMS (MALDI) calcd for $C_{69}H_{74}IrN_3OSi_2$: m/z 1209.5000 Found: 1209.4992.

Synthesis Example 12 (Compound 487)

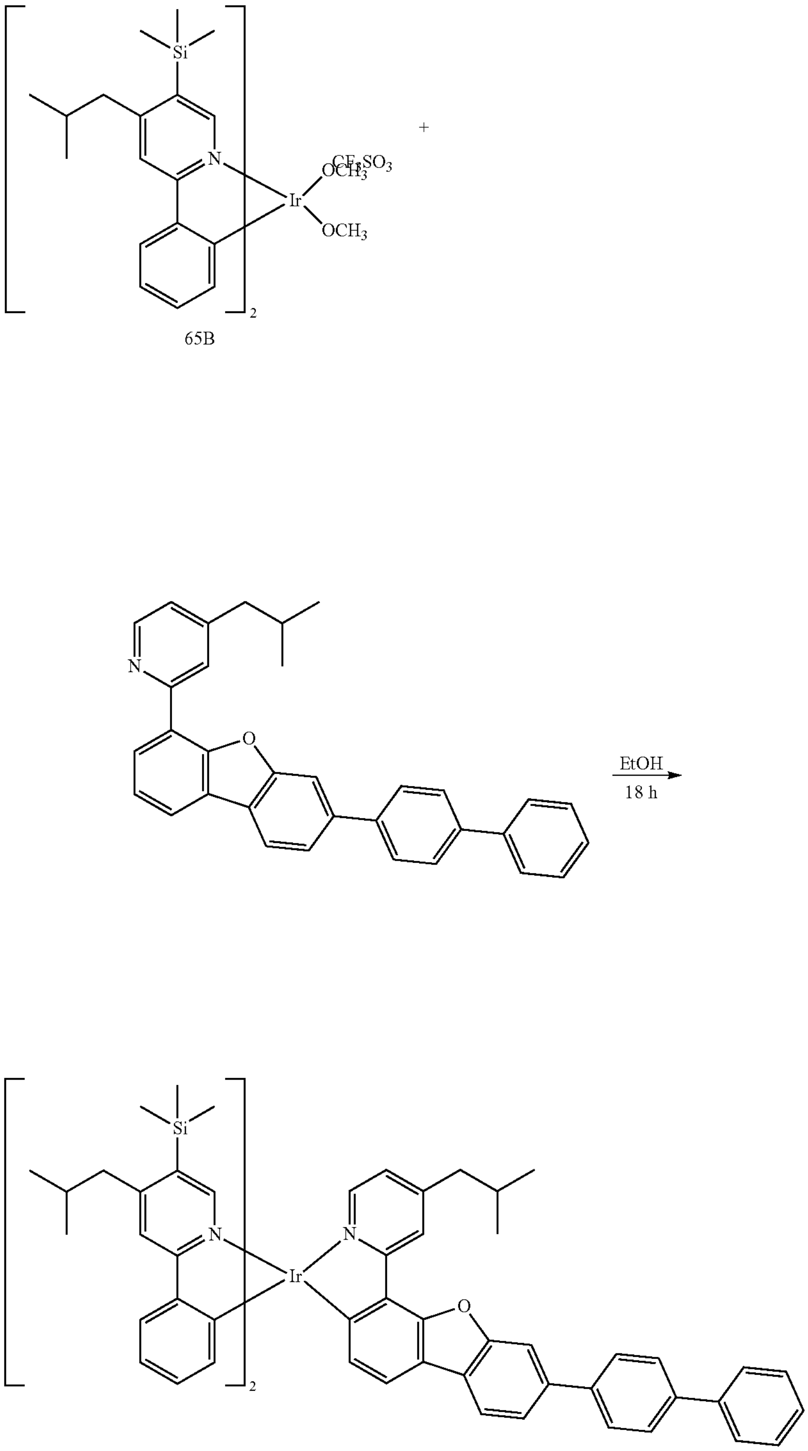

65B

487

1.0 g of Compound 487 (yield: 32%) was obtained in substantially the same manner as in Synthesis of Compound 65 in Synthesis Example 1, except that 2-(7-([1,1'-biphenyl]-4-yl)dibenzo[b,d]furan-4-yl)-4-isopropylpyridine was used instead of 4-isobutyl-2-(7-phenyldibenzo[b,d]furan-4-yl)pyridine. The resulting compound was identified by using mass spectrometry and HPLC analysis.

HRMS (MALDI) calcd for $C_{68}H_{72}IrN_3OSi_2$: m/z 1195.4843 Found: 1195.4840.

Synthesis Example 13 (Compound 1703)

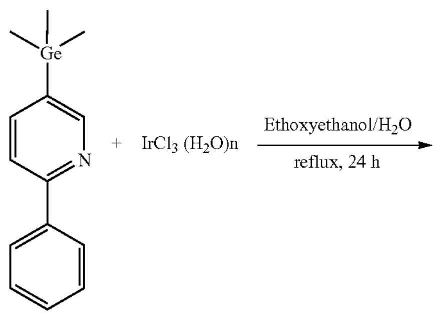

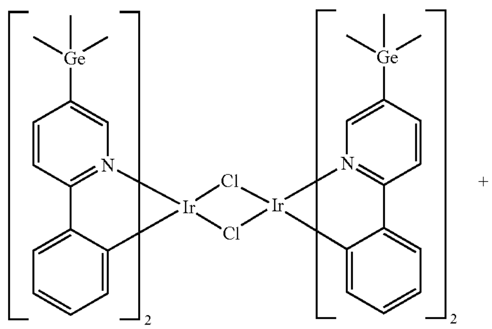

1703A

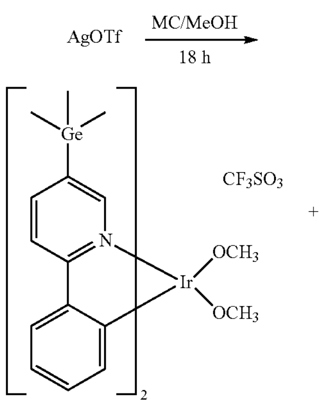

1703B

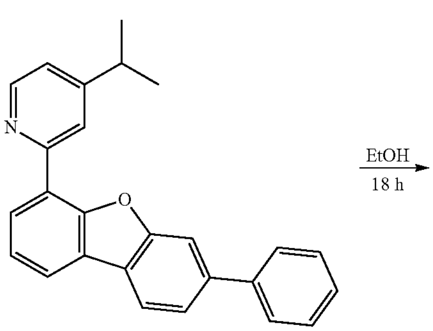

-continued

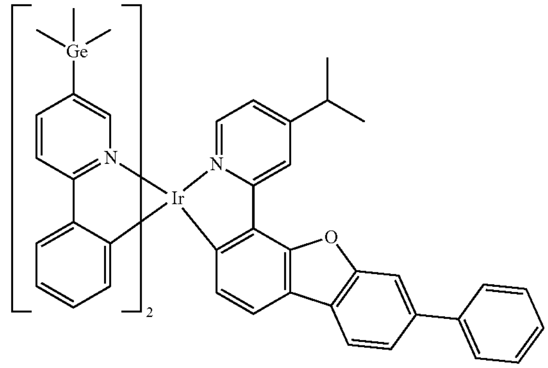

1703

Synthesis of Compound 1703A 6.5 g of Compound 1703A (yield: 65%) was obtained in substantially the same manner as in Synthesis of Compound 65A in Synthesis Example 1, except that 2-phenyl-5-(trimethylgermyl)pyridine was used instead of 4-isobutyl-2-phenyl-5-(trimethylsilyl)pyridine.

Synthesis of Compound 1703B

Compound 1703B was obtained in substantially the same manner as in Synthesis of Compound 65B in Synthesis Example 1, except that Compound 1703A was used instead of Compound 65A. The resulting Compound 1703B was used in the following reaction without any further purification.

Synthesis of Compound 1703

2.1 g of Compound 1703 (yield: 45%) was obtained in substantially the same manner as in Synthesis of Compound 65 in Synthesis Example 1, except that Compound 1703B was used instead of Compound 65B, and 4-isopropyl-2-(7-phenyldibenzo[b,d]furan-4-yl)pyridine was used instead of 4-isobutyl-2-(7-phenyldibenzo[b,d]furan-4-yl)pyridine. The resulting compound was identified by using mass spectrometry and HPLC analysis.

HRMS (MALDI) calcd for $C_{54}H_{52}Ge_2IrN_3O$: m/z 1099.2163 Found: 1099.2156.

Synthesis Example 14 (Compound 2866)
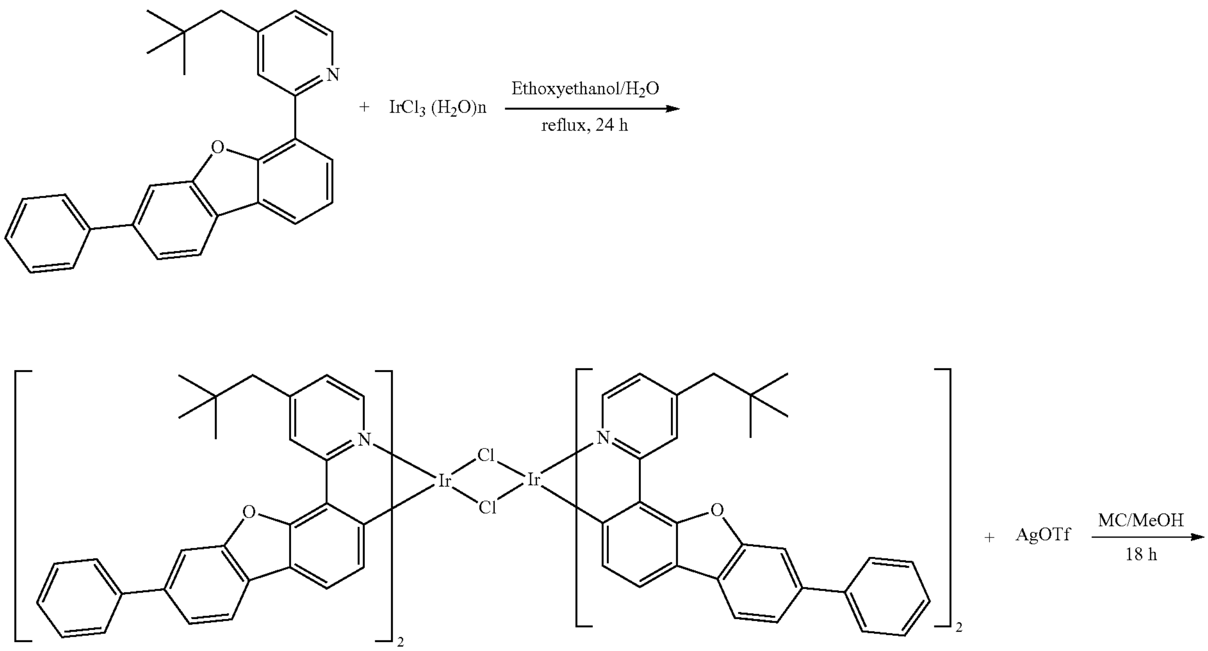
2866A
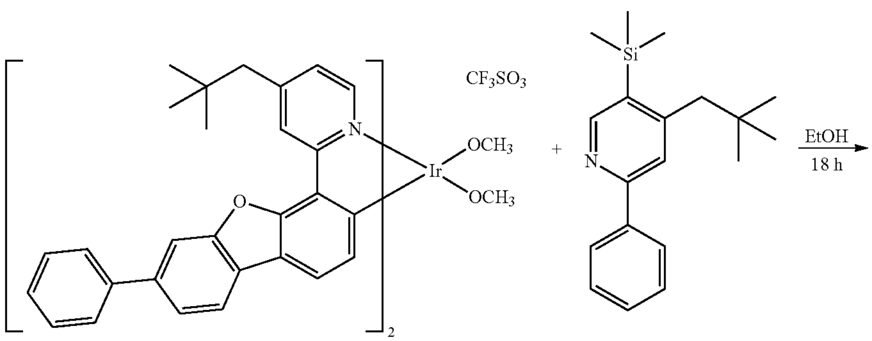
2866B
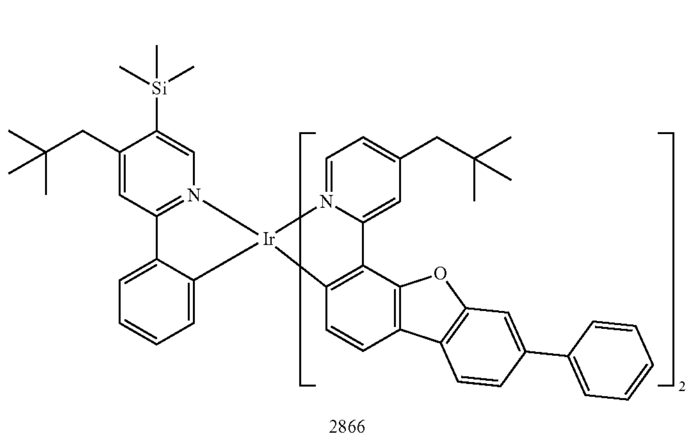
2866

Synthesis of Compound 2866A 3.6 g of Compound 2866A (yield: 72%) was obtained in substantially the same manner as in Synthesis of Compound 65A in Synthesis Example 1, except that 4-neopentyl-2-(7-phenyldibenzo[b,d]furan-4-yl)pyridine was used instead of 4-isobutyl-2-phenyl-5-(trimethylsilyl)pyridine.

Synthesis of Compound 2866B

Compound 2866B was obtained in substantially the same manner as in Synthesis of Compound 65B in Synthesis Example 1, except that Compound 2866A was used instead of Compound 65A. The resulting Compound 2866B was used in the following reaction without further purification.

Synthesis of Compound 2866

0.5 g of Compound 2866 (yield: 24%) was obtained in substantially the same manner as in Synthesis of Compound 65 in Synthesis Example 1, except that Compound 2866B was used instead of Compound 65B, and 4-neopentyl-2-phenyl-5-(trimethylsilyl)pyridine was used instead of 4-isobutyl-2-(7-phenyldibenzo[b,d]furan-4-yl)pyridine. The resulting compound was identified by using mass spectrometry and HPLC analysis.

HRMS (MALDI) calcd for $C_{75}H_{74}IrN_3O_2Si$: m/z 1269.5180 Found: 1269.5188.

Comparative Example 1 (Compound A1)

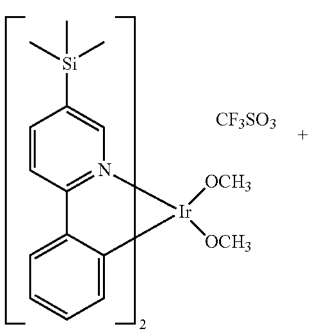

363B

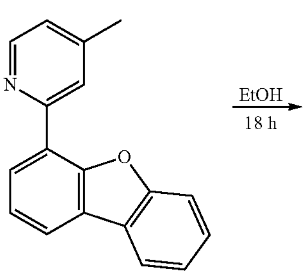

-continued

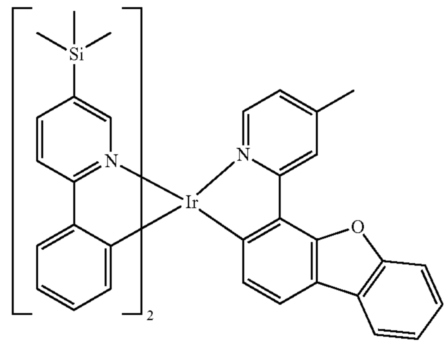

A1

0.5 g of Compound A1 (yield: 42%) was obtained in substantially the same manner as in Synthesis of Compound 65 in Synthesis Example 1, except that Compound 363B was used instead of Compound 65B, and 2-(dibenzo[b,d]furan-4-yl)-4-methylpyridine was used instead of 4-isobutyl-2-(7-phenyldibenzo[b,d]furan-4-yl)pyridine. The resulting compound was identified by using mass spectrometry and HPLC analysis.

HRMS (MALDI) calcd for $C_{46}H_{44}IrN_3OSi_2$: m/z 903.2652 Found: 903.2645.

Comparative Example 2 (Compound A2)

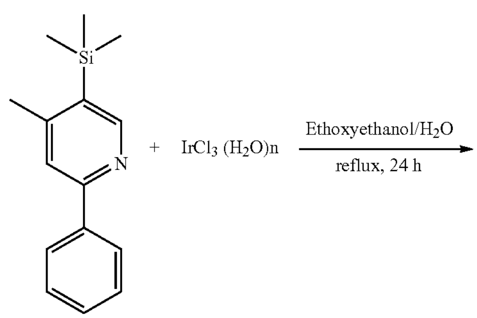

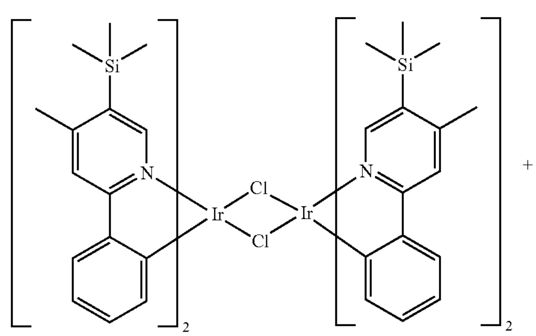

A2A

-continued

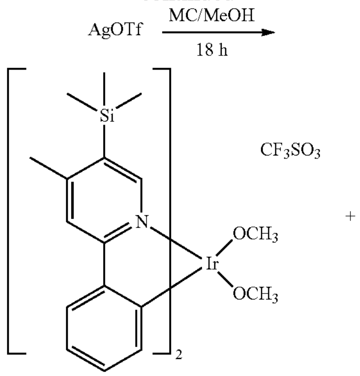

A2B

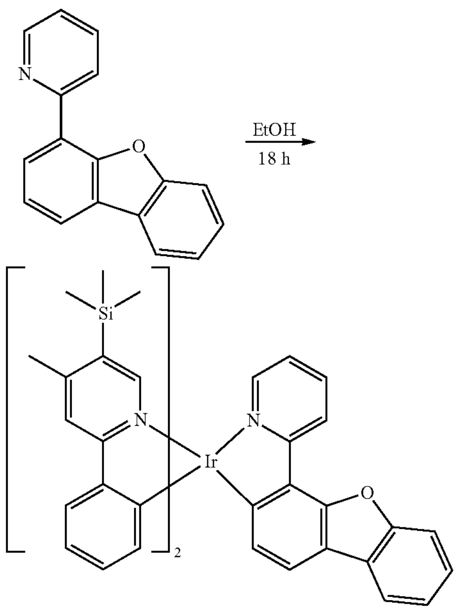

A2

Synthesis of Compound A2A 3.4 g of Compound A2A (yield: 86%) was obtained in substantially the same manner as in Synthesis of Compound 65A in Synthesis Example 1, except that 4-methyl-2-phenyl-5-(trimethylsilyl)pyridine was used instead of 4-isobutyl-2-phenyl-5-(trimethylsilyl)pyridine.

Synthesis of Compound A2B

Compound A2B was obtained in substantially the same manner as in Synthesis of Compound 65B in Synthesis Example 1, except that Compound A2A was used instead of Compound 65A. The resulting Compound A2B was used in the following reaction without further purification.

Synthesis of Compound A2

0.3 g of Compound A2 (yield: 41%) was obtained in substantially the same manner as in Synthesis of Compound 65 in Synthesis Example 1, except that Compound A2B was used instead of Compound 65B, and 2-(dibenzo[b,d]furan-4-yl)pyridine was used instead of 4-isobutyl-2-(7-phenyldibenzo[b,d]furan-4-yl)pyridine. The resulting compound was identified by using mass spectrometry and HPLC analysis.

HRMS (MALDI) calcd for $C_{47}H_{46}IrN_3OSi_2$: m/z 917.2809 Found: 917.2801.

Example 1

A glass substrate, on which an ITO as an anode was patterned, was cut to a size of 50 millimeters (mm)×50 mm×0.5 mm, sonicated in isopropyl alcohol and deionized water for 5 minutes each, and cleaned by exposure to ultraviolet rays and ozone for 30 minutes. Subsequently, the resultant glass substrate was mounted on a vacuum-deposition device.

Compounds HT3 and F6-TCNNQ were co-deposited by vacuum on the anode at a weight ratio of 98:2 to form a hole injection layer having a thickness of 100 Å, Compound HT3 was vacuum-deposited on the hole injection layer to form a hole transport layer having a thickness of 1,350 Å, and Compound H-H1 was vacuum-deposited on the hole transport layer to form an electron blocking layer having a thickness of 300 Å.

Subsequently, Compound H-H1, Compound H-E43 and Compound 65 (dopant) were co-deposited on the electron blocking layer at a weight ratio of 57:38:5 to form an emission layer having a thickness of 400 Å.

Then, Compound ET3 and ET-D1 were codeposited on the emission layer at a volume ratio of 50:50 to form an electron transport layer having a thickness of 350 Å. ET-D1 was vacuum-deposited on the electron transport layer to form an electron injection layer having a thickness of 10 Å. Al was deposited on the electron injection layer to form a cathode having a thickness of 1000 Å, thereby completing the manufacture of an organic light-emitting device.

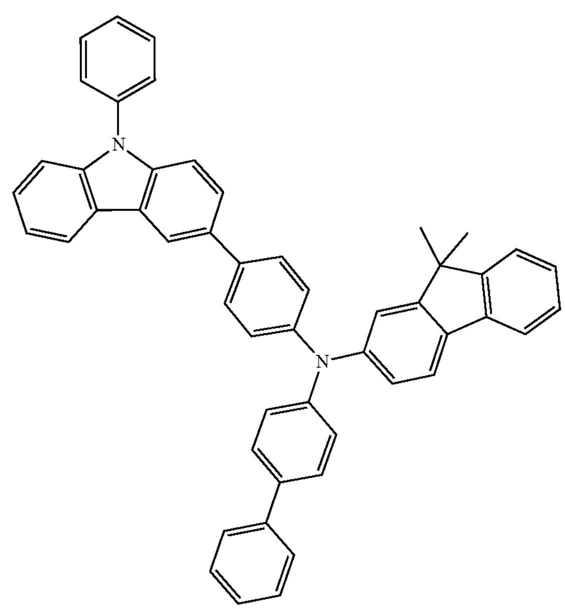

HT3

-continued

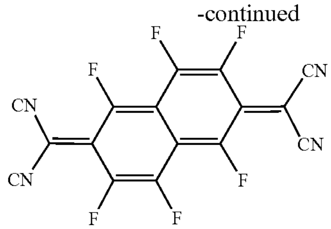

F6-TCNNQ

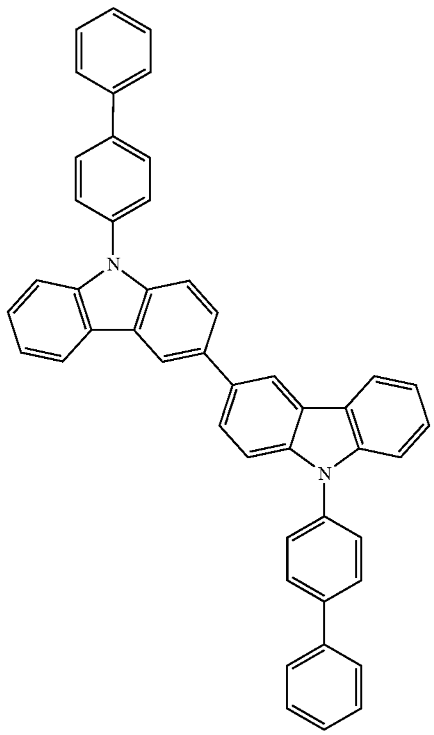

H-H1

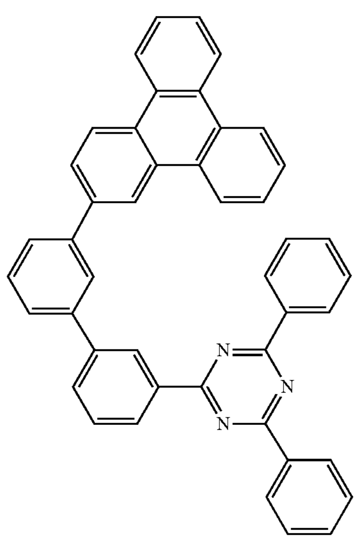

H-E43

-continued

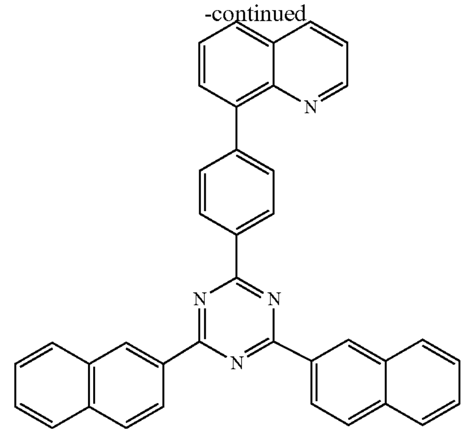

ET3

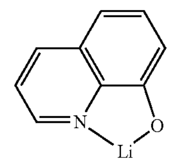

ET-D1

Examples 2 to 14 and Comparative Examples A1 and A2

Organic light-emitting devices were manufactured in substantially the same manner as in Example 1, except that the compounds shown in Table 2 were used instead of Compound 65 as a dopant in the formation of an emission layer.

Evaluation Example 1: Evaluation of Characteristics of Organic Light-Emitting Device The maximum value of external quantum efficiency (Max EQE, %), and lifespan ($LT_{97}$, hours (hr)) of each organic light-emitting device manufactured in Examples 1 to 14 and Comparative Examples A1 and A2 were evaluated. The results thereof are shown in Table 2. A Keithley 2400 current voltmeter and a luminance meter (Minolta Cs-1000A) were used in the evaluation. The lifespan ($T_{97}$) refers to the time (hr) required for the initial luminance of 16,000 candela per square meter (cd/m$^2$, or nits) of the organic light-emitting device to reduce by 97% and is indicated as a relative value (%).

TABLE 2

| | Compound No. of dopant in emission layer | Max EQE (relative value, %) | $LT_{97}$ (relative value, %) |
|---|---|---|---|
| Example 1 | 65 | 96% | 84% |
| Example 2 | 206 | 92% | 79% |
| Example 3 | 363 | 91% | 87% |
| Example 4 | 556 | 90% | 74% |
| Example 5 | 749 | 98% | 92% |
| Example 6 | 2350 | 94% | 77% |
| Example 7 | 2508 | 100% | 100% |
| Example 8 | 2566 | 98% | 95% |
| Example 9 | 2579 | 92% | 68% |
| Example 10 | 2758 | 99% | 77% |
| Example 11 | 485 | 92% | 74% |
| Example 12 | 487 | 98% | 77% |
| Example 13 | 1703 | 92% | 75% |

TABLE 2-continued
| | Compound No. of dopant in emission layer | Max EQE (relative value, %) | $LT_{97}$ (relative value, %) |
|---|---|---|---|
| Example 14 | 2866 | 98% | 108% |
| Comparative Example A1 | A1 | 87% | 47% |
| Comparative Example A2 | A2 | 88% | 40% |
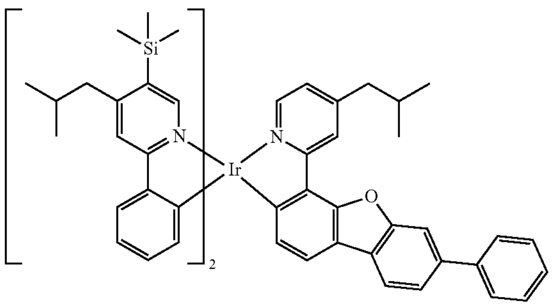
65
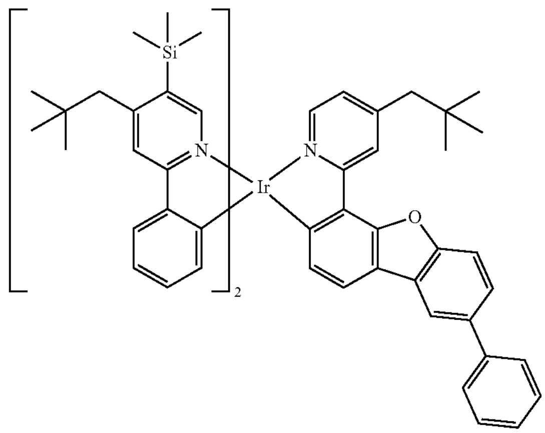
206
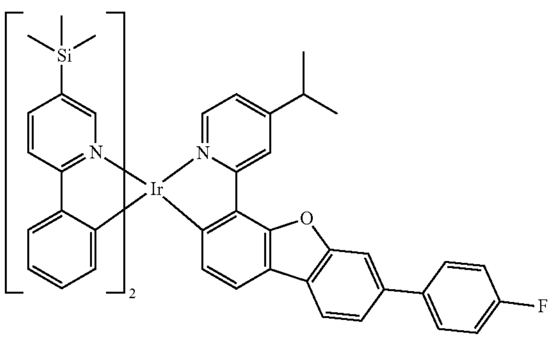
363
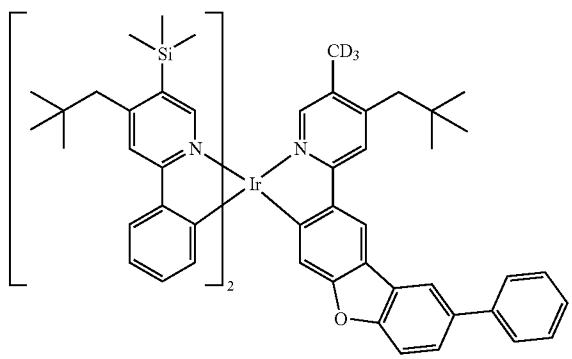
556
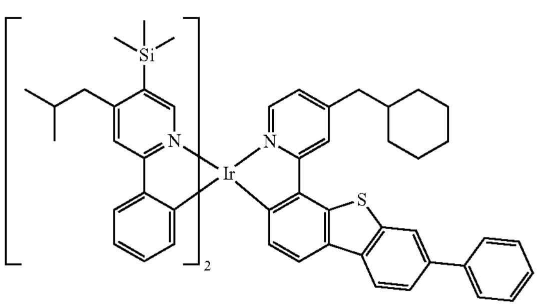
749
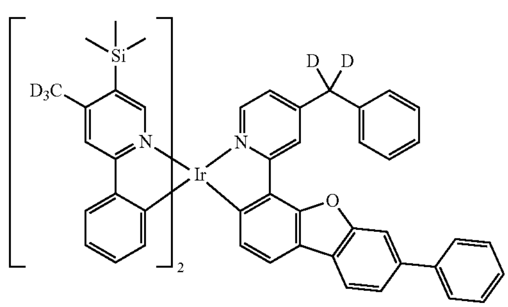
2350

-continued
2508
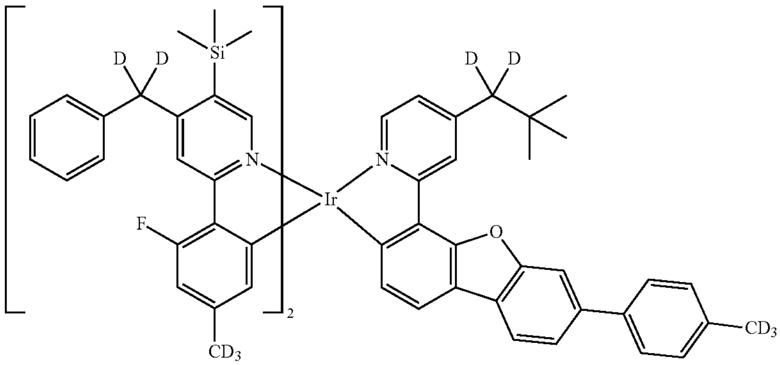
2566
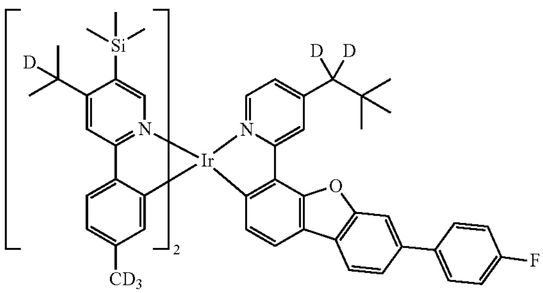
2579
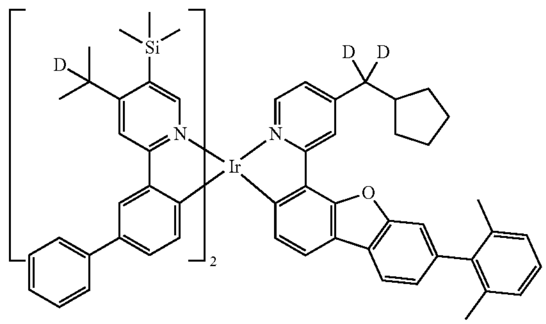
2758
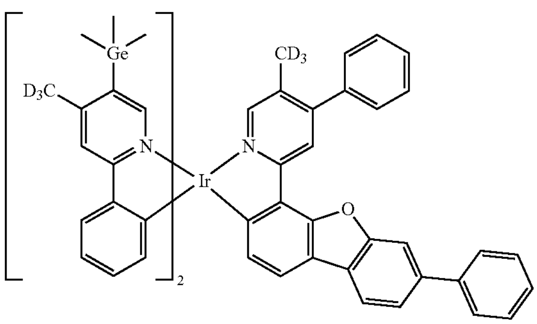
485
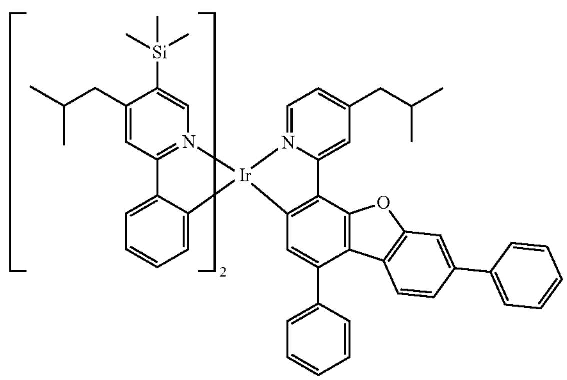
487
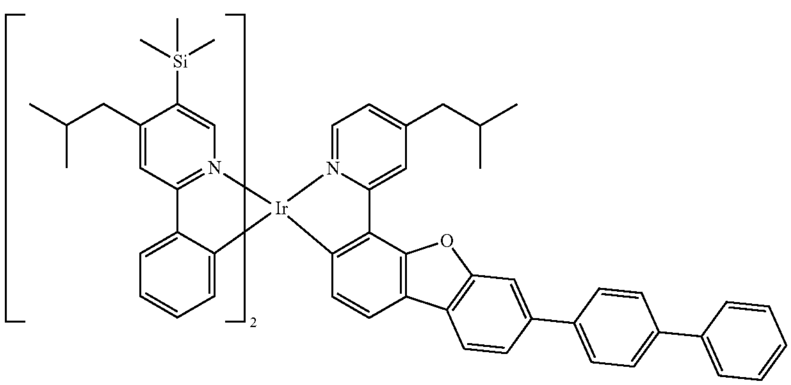

-continued

1703

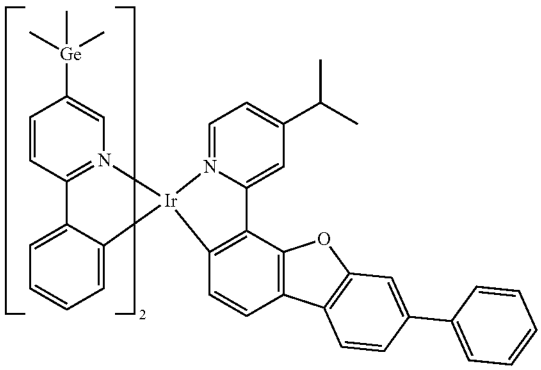

2866

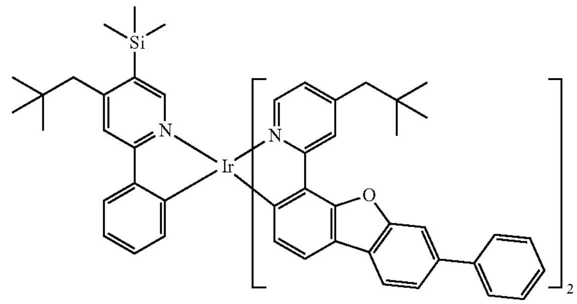

A1

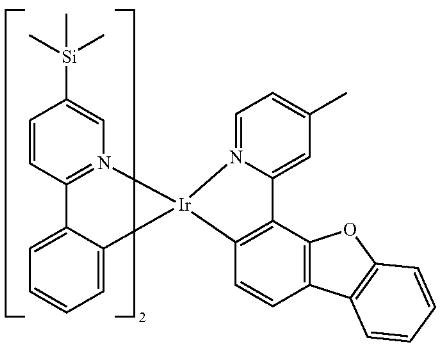

A2

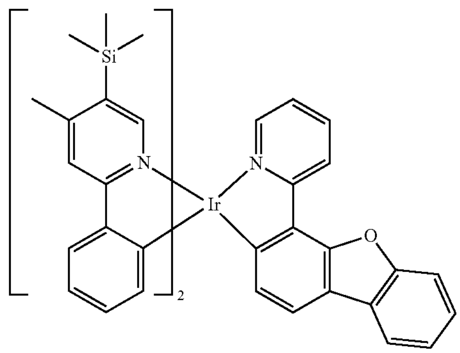

Referring to the results of Table 2, the organic light-emitting device of Examples 1 to 14 were found to have improved external quantum efficiency and lifespan, as compared with the organic light-emitting devices of Comparative Examples A1 and A2.

As provided in the foregoing detailed description and examples, the organometallic compound may have excellent electrical characteristics and heat resistance, and thus, an electronic device, e.g., an organic light-emitting device, including at least one organometallic corn pound may have improved external quantum efficiency (EQE) and excellent lifespan characteristics. Accordingly, by using the at least one organometallic compound, an organic light-emitting device with excellent quality and an electronic apparatus including the organic light-emitting device may be realized.

It should be understood that the one or more exemplary embodiments described herein should be considered in a descriptive sense only and not for purposes of limitation. Descriptions of features or aspects within each exemplary embodiment should typically be considered as available for other similar features or aspects in other exemplary embodiments. While one or more exemplary embodiments have been described in further detail with reference to the figure, it will be understood by those of ordinary skill in the art that various changes in form and details may be made therein without departing from the spirit and scope as defined by the following claims.

What is claimed is:

1. An organometallic compound represented by Formula 1:

$$M(L_1)_{n1}(L_2)_{n2} \quad \text{Formula 1}$$

wherein, in Formula 1,

M is Ir, $L_1$ is a ligand represented by Formula 2A, $L_2$ is a ligand represented by Formula 2B, n1 and n2 are each independently 1 or 2, and n1+n2=3, and when n1 is 2, two $L_1$(s) are identical to or different from each other, and when n2 is 2, two $L_2$(s) are identical to or different from each other, and $L_1$ is different from $L_2$, Formula 2A

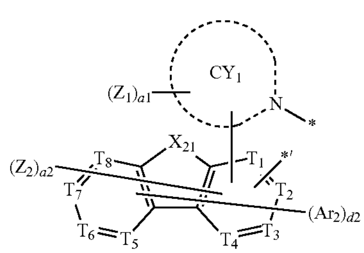

-continued

Formula 2B

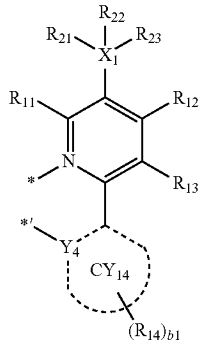

wherein, in Formulae 2A and 2B, $Y_4$ is C or N, $X_1$ is Si or Ge, $X_{21}$ is O, S, S(=O), $N(Z_{29})$, $C(Z_{29})(Z_{30})$, or $Si(Z_{29})(Z_{30})$, $T_1$ to $T_4$ are each independently C, N, a carbon atom bound to ring CY1, or a carbon atom bound to Ir in Formula 1, provided that one of $T_1$ to $T_4$ is a carbon atom bound to Ir in Formula 1, and another one of $T_1$ to $T_4$, which is not bound to bound to Ir, is a carbon atom bound to ring $CY_1$, $T_5$ to $T_8$ are each independently C or N, and a total number of N atoms among $T_1$ to $T_8$ is 0 or 1, ring $CY_1$ is a pyridine group, a pyrimidine group, a pyrazine group, a pyridazine group, a triazine group, a quinoline group, an isoquinoline group, a quinoxaline group, a quinazoline group, a phenanthroline group, a 5,6,7,8-tetrahydroisoquinoline group, or a 5,6,7,8-tetrahydroquinoline group, ring $CY_{14}$ is a benzene group, a naphthalene group, a 1,2,3,4-tetrahydronaphthalene group, a phenanthrene group, a pyridine group, a pyrimidine group, a pyrazine group, a pyridazine group, a triazine group, a quinoline group, an isoquinoline group, a quinoxaline group, a quinazoline group, a phenanthroline group, a 5,6,7,8-tetrahydroisoquinoline group, or a 5,6,7,8-tetrahydroquinoline group, $Ar_2$ is ring $CY_2$ unsubstituted or substituted with at least one $Z_0$, wherein ring $CY_2$ is an unsaturated $C_5$-$C_{30}$ carbocyclic group or an unsaturated $C_1$-$C_{30}$ heterocyclic group, wherein d2 is an integer from 1 to 6, and when d2 is 2 or greater, at least two $Ar_2$(s) are identical to or different from each other, $R_{21}$ to $R_{23}$ are each independently a $C_1$-$C_{60}$ alkyl group or a $C_6$-$C_{60}$ aryl group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_3$-$C_{10}$ cycloalkyl group, a phenyl group, or a combination thereof, $Z_0$, $Z_2$, $Z_{29}$, $Z_{30}$, and $R_{11}$ to $R_{14}$ are each independently hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_7$-$C_{60}$ aryl alkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_2$-$C_{60}$ heteroaryl alkyl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$Ge(Q_3)(Q_4)(Q_5)$, —$B(Q_6)(Q_7)$, —$P(=O)(Q_8)(Q_9)$, or —$P(Q_8)(Q_9)$, $Z_1$ is a substituted or unsubstituted $C_1$-$C_{60}$ alkyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_6$-$C_{60}$ aryl group, a substituted or unsubstituted $C_7$-$C_{60}$ alkyl aryl group, a substituted or unsubstituted $C_6$-$C_{60}$ aryloxy group, a substituted or unsubstituted $C_1$-$C_{60}$ heteroaryl group, or a substituted or unsubstituted $C_2$-$C_{60}$ alkyl heteroaryl group, a1 is an integer from 1 to 10, and when a1 is 2 or greater, at least two $Z_1$(s) are identical to or different from each other, and b1 is an integer from 0 to 20, and when b1 is 2 or greater, at least two $R_{14}$(s) are identical to or different from each other, a2 is an integer from 0 to 5, and when a2 is 2 or greater, at least two $Z_2$(s) are identical to or different from each other, Condition 1 or Condition 2 is satisfied:

Condition 1 wherein $X_1$ in Formula 2B is Si, $R_{12}$ in Formula 2B is neither hydrogen nor a methyl group, and each of $T_1$ to $T_8$ in Formula 2A is not N;

Condition 2 wherein, in Formula 2B, $R_{12}$ is hydrogen, or a group comprising 1 carbon atom, at least two of $R_{21}$ to $R_{23}$ are optionally bound to each other to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, at least two of a plurality of $Z_1$(s) are optionally bound to each other to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, at least two of a plurality of $Z_2$(s) are optionally bound to each other to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, $R_{12}$ and $R_{13}$ are optionally bound to each other to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, at least two of a plurality of $R_{14}$(s) are optionally bound to each other to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, at least two of $Z_0$, $Z_1$, $Z_2$, $Z_{29}$, $Z_{30}$, and $R_{11}$ to $R_{14}$ are optionally bound to each other to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, $R_{10a}$ is deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_7$-$C_{60}$ aryl alkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_2$-$C_{60}$ heteroaryl alkyl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —Ge($Q_3$)($Q_4$)($Q_5$), —B($Q_6$)($Q_7$), —P(═O)($Q_8$)($Q_9$), or —P($Q_8$)($Q_9$),

*and *' in Formulae 2A and 2B each indicate a binding site to Ir in Formula 1, and at least one substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_2$-$C_{10}$ heterocycloalkenyl group, the substituted $C_6$-$C_{60}$ aryl group, the substituted $C_7$-$C_{60}$ alkyl aryl group, the substituted $C_7$-$C_{60}$ aryl alkyl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkyl heteroaryl group, the substituted $C_2$-$C_{60}$ heteroaryl alkyl group, the substituted $C_1$-$C_{60}$ heteroaryloxy group, the substituted $C_1$-$C_{60}$ heteroarylthio group, the substituted monovalent non-aromatic condensed polycyclic group, and the substituted monovalent non-aromatic condensed heteropolycyclic group is:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group;

a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{10}$ arylthio group, a $C_1$-$C_{60}$ heteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), —Ge($Q_{13}$)($Q_{14}$)($Q_{15}$), —B($Q_{16}$)($Q_{17}$), —P(═O)($Q_{18}$)($Q_{19}$), or —P($Q_{18}$)($Q_{19}$);

a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, or a monovalent non-aromatic condensed heteropolycyclic group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_7$-$C_{60}$ alkyl aryl group, a $C_7$-$C_{60}$ aryl alkyl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_2$-$C_{60}$ heteroaryl alkyl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —N($Q_{21}$)($Q_{22}$), —SI($Q_{23}$)($Q_{24}$)($Q_{25}$), —GE($Q_{23}$)($Q_{24}$)($Q_{25}$), —B($Q_{26}$)($Q_{27}$), —P(═O)($Q_{28}$)($Q_{29}$), —P($Q_{28}$)($Q_{29}$), or a combination thereof;

—N($Q_{31}$)($Q_{32}$), —Si($Q_{33}$)($Q_{34}$)($Q_{35}$), —Ge($Q_{33}$)($Q_{34}$)($Q_{35}$), —B($Q_{36}$)($Q_{37}$), —P(═O)($Q_{38}$)($Q_{39}$), or —P($Q_{38}$)($Q_{39}$); or a combination thereof, wherein $Q_1$ to $Q_9$, $Q_{11}$ to $Q_{19}$, $Q_{21}$ to $Q_{29}$, and $Q_{31}$ to $Q_{39}$ are each independently:

hydrogen; deuterium; —F; —Cl; —Br; —I; a hydroxyl group; a cyano group; a nitro group; an amino group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group unsubstituted or substituted with deuterium, a $C_1$-$C_{60}$ alkyl group, a $C_6$-$C_{60}$ aryl group, or a combination thereof; a $C_2$-$C_{60}$ alkenyl group; a $C_2$-$C_{60}$ alkynyl group; a $C_1$-$C_{60}$ alkoxy group; a $C_1$-$C_{60}$ alkylthio group; a $C_3$-$C_{10}$ cycloalkyl group; a $C_1$-$C_{10}$ heterocycloalkyl group; a $C_3$-$C_{10}$ cycloalkenyl group; a $C_2$-$C_{10}$ heterocycloalkenyl group; a $C_6$-$C_{60}$ aryl group unsubstituted or substituted with deuterium, a $C_1$-$C_{60}$ alkyl group, a $C_6$-$C_{60}$ aryl group, or a combination thereof; a $C_6$-$C_{60}$ aryloxy group; a $C_6$-$C_{60}$ arylthio group; a $C_1$-$C_{60}$ heteroaryl group; a $C_1$-$C_{60}$ heteroaryloxy group, a $C_1$-$C_{60}$ heteroarylthio group, a monovalent non-aromatic condensed polycyclic group; or a monovalent non-aromatic condensed heteropolycyclic group.

2. The organometallic compound of claim 1, wherein
n1 is 1, and n2 is 2, or
n1 is 2, and n2 is 1.

3. The organometallic compound of claim 1, wherein $X_{21}$ in Formula 2A is O or S.

4. The organometallic compound of claim 1, wherein ring $CY_2$ is a benzene group, a naphthalene group, an anthracene group, a phenanthrene group, a triphenylene group, a pyrene group, a chrysene group, a cyclopentadiene group, a 1,2,3,4-tetrahydronaphthalene group, a thiophene group, a furan group, a borole group, a phosphole group, a silole group, a germole group, a selenophene group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophenegroup, a dibenzofuran group, a dibenzothiophene 5-oxide group, a 9H-fluorene-9-one group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluoren-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, or a 5,6,7,8-tetrahydroquinoline group.

5. The organometallic compound of claim 1, wherein d2 in Formula 2A is 1 or 2.

6. The organometallic compound of claim 1, wherein $Z_1$ in Formula 2A is a $C_1$-$C_{20}$ alkyl group unsubstituted or substituted with deuterium, a phenyl group, a ($C_1$-$C_{20}$ alkyl) phenyl group, a biphenyl group, or a ($C_1$-$C_{20}$ alkyl) biphenyl group, or a $C_3$-$C_{10}$ cycloalkyl group, a $C_1$-$C_{10}$ heterocycloalkyl group, a phenyl group, or a biphenyl group, each unsubstituted or substituted with deuterium, —F, a cyano group, a $C_1$-$C_{20}$ alkyl group, a deuterated $C_1$-$C_{20}$ alkyl group, a $C_1$-$C_{20}$ alkoxy group, a deuterated $C_1$-$C_{20}$ alkoxy group, a $C_3$-$C_{10}$ cycloalkyl group, a deuterated $C_3$-$C_{10}$ cycloalkyl group, a ($C_1$-$C_{20}$ alkyl) $C_3$-$C_{10}$ cycloalkyl group, a $C_1$-$C_{10}$ heterocycloalkyl group, a deuterated $C_1$-$C_{10}$ heterocycloalkyl group, a ($C_1$-$C_{20}$ alkyl) $C_1$-$C_{10}$ heterocycloalkyl group, a phenyl group, a deuterated phenyl group, a ($C_1$-$C_{20}$ alkyl) phenyl group, a biphenyl group, a deuterated biphenyl group, a ($C_1$-$C_{20}$ alkyl) biphenyl group, or a combination thereof; and $R_{11}$ to $R_{13}$ in Formula 2B are each independently:

hydrogen or deuterium;

a $C_1$-$C_{20}$ alkyl group unsubstituted or substituted with deuterium, a $C_3$-$C_{10}$ cycloalkyl group, a deuterated $C_3$-$C_{10}$ cycloalkyl group, a ($C_1$-$C_{20}$ alkyl) $C_3$-$C_{10}$ cycloalkyl group, a $C_1$-$C_{10}$ heterocycloalkyl group, a deuterated $C_1$-$C_{10}$ heterocycloalkyl group, a ($C_1$-$C_{20}$ alkyl) $C_1$-$C_{10}$ heterocycloalkyl group, a phenyl group, a deuterated phenyl group, a ($C_1$-$C_{20}$ alkyl)phenyl group, a biphenyl group, a deuterated biphenyl group, a ($C_1$-$C_{20}$ alkyl) biphenyl group, or a combination thereof; or a $C_3$-$C_{10}$ cycloalkyl group, a $C_1$-$C_{10}$ heterocycloalkyl group, a phenyl group, or a biphenyl group, each unsubstituted or substituted with deuterium, —F, a cyano group, a $C_1$-$C_{20}$ alkyl group, a deuterated $C_1$-$C_{20}$ alkyl group, a $C_1$-$C_{20}$ alkoxy group, a deuterated $C_1$-$C_{20}$ alkoxy group, a $C_3$-$C_{10}$ cycloalkyl group, a deuterated $C_3$-$C_{10}$ cycloalkyl group, a ($C_1$-$C_{20}$ alkyl) $C_3$-$C_{10}$ cycloalkyl group, a $C_1$-$C_{10}$ heterocycloalkyl group, a deuterated $C_1$-$C_{10}$ heterocycloalkyl group, a ($C_1$-$C_{20}$ alkyl) $C_1$-$C_{10}$ heterocycloalkyl group, a phenyl group, a deuterated phenyl group, a ($C_1$-$C_{20}$ alkyl) phenyl group, a biphenyl group, a deuterated biphenyl group, a ($C_1$-$C_{20}$ alkyl) biphenyl group, or a combination thereof.

7. The organometallic compound of claim 1, wherein $Z_0$ and $Z_2$ in Formula 2A and $R_{14}$ in Formula 2B are each independently:

hydrogen, deuterium, —F, or a cyano group;

a $C_1$-$C_{20}$ alkyl group unsubstituted or substituted with deuterium, —F, a cyano group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl) $C_3$-$C_{10}$ cycloalkyl group, a $C_1$-$C_{10}$ heterocycloalkyl group, a deuterated $C_1$-$C_{10}$ heterocycloalkyl group, a fluorinated $C_1$-$C_{10}$ heterocycloalkyl group, a ($C_1$-$C_{20}$ alkyl) $C_1$-$C_{10}$ heterocycloalkyl group, a phenyl group, a deuterated phenyl group, a fluorinated phenyl group, a ($C_1$-$C_{20}$ alkyl)phenyl group, a biphenyl group, a deuterated biphenyl group, a fluorinated biphenyl group, a ($C_1$-$C_{20}$ alkyl) biphenyl group, or a combination thereof;

a $C_3$-$C_{10}$ cycloalkyl group, a $C_1$-$C_{10}$ heterocycloalkyl group, a phenyl group, or a biphenyl group, each unsubstituted or substituted with deuterium, —F, a cyano group, a $C_1$-$C_{20}$ alkyl group, a deuterated $C_1$-$C_{20}$ alkyl group, a fluorinated $C_1$-$C_{20}$ alkyl group, a $C_1$-$C_{20}$ alkoxy group, a deuterated $C_1$-$C_{20}$ alkoxy group, a fluorinated $C_1$-$C_{20}$ alkoxy group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl) $C_3$-$C_{10}$ cycloalkyl group, a $C_1$-$C_{10}$ heterocycloalkyl group, a deuterated $C_1$-$C_{10}$ heterocycloalkyl group, a fluorinated $C_1$-$C_{10}$ heterocycloalkyl group, a ($C_1$-$C_{20}$ alkyl) $C_1$-$C_{10}$ heterocycloalkyl group, a phenyl group, a deuterated phenyl group, a fluorinated phenyl group, a ($C_1$-$C_{20}$ alkyl)phenyl group, a biphenyl group, a deuterated biphenyl group, a fluorinated a biphenyl group, a ($C_1$-$C_{20}$ alkyl) biphenyl group, or a combination thereof, or —Si($Q_3$)($Q_4$)($Q_5$), or —Ge($Q_3$)($Q_4$)($Q_5$).

8. The organometallic compound of claim 1, wherein the organometallic compound satisfies at least one of Conditions and B or C:

Condition B $Z_2$ in Formula 2A is not hydrogen, and a2 is not 0, or

Condition C $R_{14}$ in Formula 2B is not hydrogen, and b1 is not 0.

9. The organometallic compound of claim 1, wherein the organometallic compound represented by Formula 1 satisfies Condition 1, and the number of carbon atoms included in $R_{12}$ in Formula 2B is 2 or greater.

10. The organometallic compound of claim 1, wherein the organometallic compound represented by Formula 1 satisfies Condition 2.

11. The organometallic compound of claim 1, wherein the organometallic compound comprises at least one deuterium, at least one fluoro group (—F), at least one cyano group (—CN), or a combination thereof.

12. The organometallic compound of claim 1, wherein at least one of Conditions (1A), (2A), or at least one of Conditions (3) to (6) is satisfied, or Condition (7) is satisfied:

Condition (1A)

wherein in Formula 2A a1 is not 0 and at least one of $Z_1$(s) in the number of al comprises deuterium Condition (2A)

wherein, in Formula 2A, a2 is not 0, at least one of $Z_2$(s) in the number of a2 comprises deuterium, a fluoro group (—F), a cyano group, or a combination thereof Condition (3)

wherein, in Formula 2A, at least one of $Ar_2$(s) in the number of d2 comprises deuterium, a fluoro group (—F), a cyano group, or a combination thereof Condition (4)

wherein, in Formula 2B, at least one of $R_{21}$ to $R_{23}$ comprises deuterium Condition (5)

wherein, in Formula 2B, $R_{12}$ comprises at least one deuterium

Condition (6)

wherein, in Formula 2B, b1 is not 0, and at least one of $R_{14}$(s) in the number of b1 comprises deuterium, a fluoro group (—F), a cyano group, or a combination thereof Condition (7)

wherein, $Z_1$, $Z_2$, and $Ar_2$ in Formula 2A and $R_{11}$ to $R_{14}$ and $R_{21}$ to $R_{23}$ in Formula 2B each consist of carbon and hydrogen.

13. The organometallic compound of claim 1, wherein a group represented by

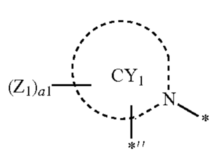

in Formula 2A is a group represented by one of Formulae CY1-1 to CY1-28:

CY1-1

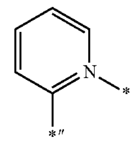

CY1-2

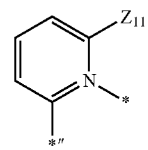

CY1-3

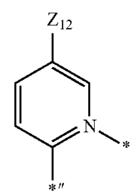

CY1-4

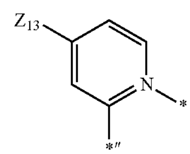

CY1-5

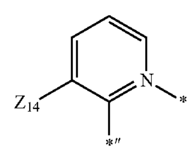

CY1-6

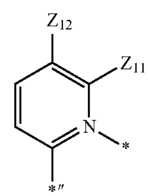

CY1-7

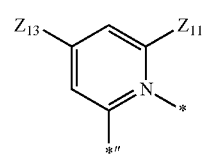

CY1-8

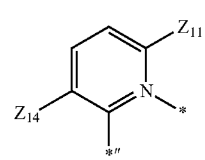

CY1-9

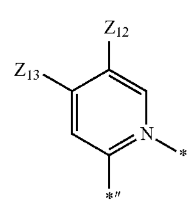

-continued
CY1-10
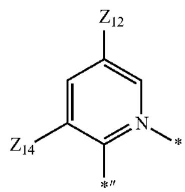
CY1-11
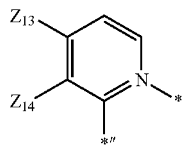
CY1-12
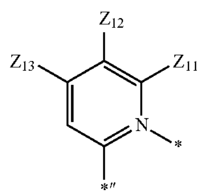
CY1-13
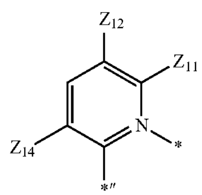
CY1-14
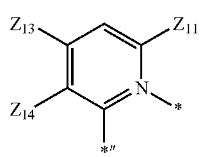
CY1-15
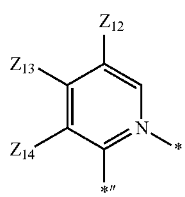
CY1-16
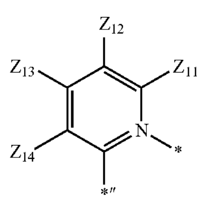
CY1-17
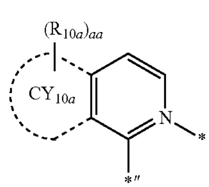
-continued
CY1-18
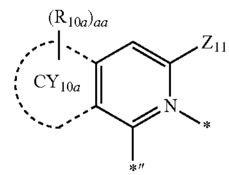
CY1-19
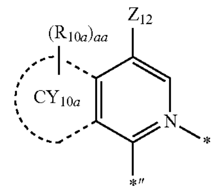
CY1-20
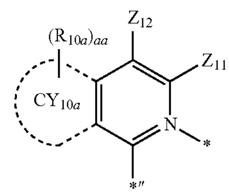
CY1-21
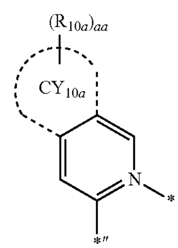
CY1-22
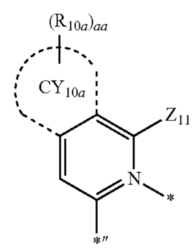
CY1-23
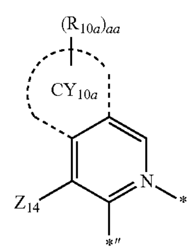
CY1-24
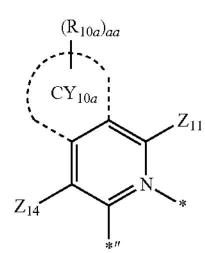

-continued

CY1-25

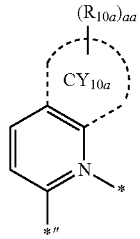

CY1-26

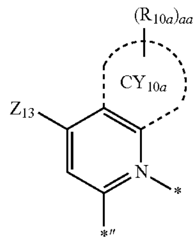

CY1-27

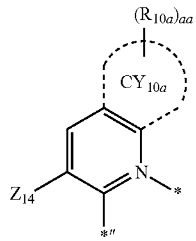

CY1-28

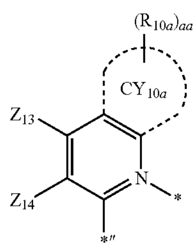

wherein, in Formulae CY1-1 to CY1-28, $Z_{11}$ to $Z_{14}$ are each represented by a group $Z_1$, ring $CY_{10a}$ is a benzene group, a quinoline group, an isoquinoline group, or a cyclohexane group, aa is an integer from 0 to 10,

* indicates a binding site to Ir in Formula 1, and

*" indicates a binding site to one of $T_1$ to $T_4$ in Formula 2A.

14. The organometallic compound of claim 1, wherein a group represented by

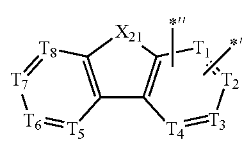

in Formula 2A is a group represented by one of Formulae CY2-1 to CY2-6:

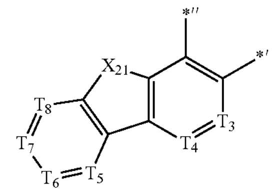

CY2-1

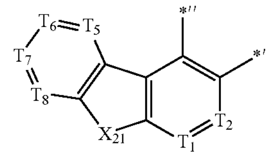

CY2-2

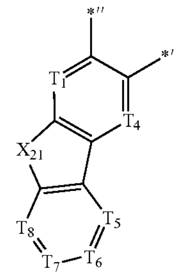

CY2-3

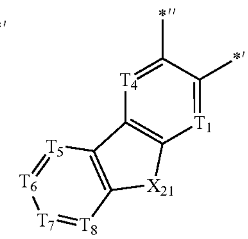

CY2-4

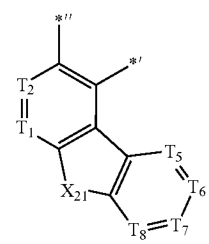

CY2-5

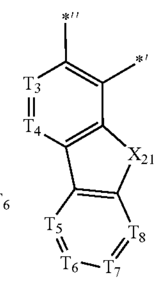

CY2-6 wherein, in Formulae CY2-1 to CY2-6, $T_1$ to $T_8$ are each independently C or N, a total number of N atoms among $T_3$ to $T_8$ in Formulae CY2-1 and CY2-6 is 0 or 1, a total number of N atoms among $T_1$, $T_2$, $T_5$, $T_6$, $T_7$, and $T_8$ in Formulae CY2-2 and CY2-5 is 0 or 1, a total number of N atoms among $T_1$, $T_4$, $T_5$, $T_6$, $T_7$, and $T_8$ in Formulae CY2-3 and CY2-4 is 0 or 1,

*" indicates a binding site to ring $CY_1$ in Formula 2A, and

*' indicates a binding site to Ir in Formula 1.

15. An organic light-emitting device, comprising:

a first electrode;

a second electrode; and an organic layer located between the first electrode and the second electrode, wherein the organic layer comprises an emission layer, and wherein the organic layer further comprises at least one of the organometallic compound of claim 1.

16. The organic light-emitting device of claim 15, wherein the first electrode is an anode, the second electrode is a cathode, the organic layer further comprises a hole transport region located between the first electrode and the emission layer, and an electron transport region located between the emission layer and the second electrode, the hole transport region comprises a hole injection layer, a hole transport layer, an electron blocking layer, a buffer layer, or a combination thereof, and the electron transport region comprises a hole blocking layer, an electron transport layer, an electron injection layer, or a combination thereof.

17. The organic light-emitting device of claim 15, wherein the emission layer comprises the organometallic compound.

18. The organic light-emitting device of claim 17, wherein
the emission layer further comprises a host, and
an amount of the host in the emission layer is greater than an amount of the organometallic compound in the emission layer.

19. An electronic apparatus, comprising the organic light-emitting device of claim 15.

* * * * *